US011165534B2

(12) United States Patent
Xu et al.

(10) Patent No.: US 11,165,534 B2
(45) **Date of Patent: *Nov. 2, 2021**

(54) POLAR CODE ENCODING METHOD AND APPARATUS

(71) Applicant: HUAWEI TECHNOLOGIES CO., LTD., Guangdong (CN)

(72) Inventors: Chen Xu, Hangzhou (CN); Gongzheng Zhang, Hangzhou (CN); Jun Wang, Hangzhou (CN); Guijie Wang, Hangzhou (CN); Yunfei Qiao, Hangzhou (CN); Yinggang Du, Shenzhen (CN)

(73) Assignee: Huawei Technologies Co., Ltd., Guangdong (CN)

(*) Notice: Subject to any disclaimer, the term of this patent is extended or adjusted under 35 U.S.C. 154(b) by 85 days.

This patent is subject to a terminal disclaimer.

(21) Appl. No.: 16/683,470

(22) Filed: Nov. 14, 2019

(65) Prior Publication Data

US 2020/0119842 A1 Apr. 16, 2020

Related U.S. Application Data

(63) Continuation of application No. PCT/CN2018/097774, filed on Jul. 31, 2018.

(30) Foreign Application Priority Data

Aug. 4, 2017 (CN) ........................ 201710662548.6

(51) Int. Cl.
*H04L 1/00* (2006.01)

(52) U.S. Cl.
CPC .......... *H04L 1/0057* (2013.01); *H04L 1/0042* (2013.01); *H04L 1/0076* (2013.01)

(58) Field of Classification Search
CPC ... H04L 1/0057; H04L 1/0042; H04L 1/0076; G01S 13/34
See application file for complete search history.

(56) References Cited

U.S. PATENT DOCUMENTS 10,148,289 B2 * 12/2018 Shen ..................... H04L 1/0057
2016/0013887 A1 * 1/2016 Shen ..................... H04L 1/0045 375/295

(Continued)

FOREIGN PATENT DOCUMENTS

CN 102694625 A 9/2012
CN 103281166 A 9/2013

(Continued)

OTHER PUBLICATIONS

Extended European Search Report issued in European Application No. 18842142.4 dated May 18, 2020, 12 pages.

(Continued)

*Primary Examiner* — Chandrahas B Patel
(74) *Attorney, Agent, or Firm* — Fish & Richardson P.C.

(57) ABSTRACT

The present disclosure relates to polar code encoding methods and apparatus. One example method includes obtaining a first sequence used to encode K to-be-encoded bits, where the first sequence includes sequence numbers of N polarized channels, the sequence numbers of the N polarized channels are arranged in the first sequence based on reliability of the N polarized channels, K is a positive integer, N is a mother code length of a polar code, N is a positive integer power of 2, and K≤N, selecting sequence numbers of K polarized channels from the first sequence in descending order of reliability, placing the K to-be-encoded bits based on the selected sequence numbers of the K polarized channels, and performing polar code encoding on the K to-be-encoded bits.

19 Claims, 3 Drawing Sheets

(56) References Cited

U.S. PATENT DOCUMENTS

| | | | |
|---|---|---|---|
| 2016/0164629 A1 | 6/2016 | Joonkuiahn et al. | |
| 2017/0141943 A1 | 5/2017 | Nazarathy et al. | |
| 2019/0089380 A1 | 3/2019 | Shen et al. | |
| 2019/0372713 A1* | 12/2019 | Xu | H04L 1/0061 |
| 2020/0195276 A1* | 6/2020 | Wu | H04W 72/0446 |

FOREIGN PATENT DOCUMENTS

| | | |
|---|---|---|
| CN | 106877973 A | 6/2017 |
| CN | 107592181 A | 1/2018 |
| CN | 105075163 B | 2/2019 |
| EP | 3457606 A1 | 3/2019 |
| EP | 3579468 A1 | 12/2019 |
| WO | 2016001930 A1 | 1/2016 |

OTHER PUBLICATIONS

NTT Docomo, "Sequence design of Polar codes," 3GPP TSG RAN WG1 Meeting #89, R1-1708489, Hangzhou, China, May 15-19, 2017, 6 pages.

Office Action issued in Chinese Application No. 201710662548.6 dated Mar. 23, 2020, 18 pages (with English translation).

Qualcomm Incorporated, "Sequence construction of Polar codes for control channel," 3GPP TSG-RAN WG1 NR Ad-Hoc#2 , R1-1711218, Qingdao, P. R. China, Jun. 27-30, 2017, 18 pages.

Samsung, "Design of a Nested Sequence for Polar Codes," 3GPP TSG RAN WG1 #88bis, R1-1705425, Spokane, WA, Apr. 3-7, 2017, 8 pages.

* cited by examiner

POLAR CODE ENCODING METHOD AND APPARATUS

CROSS-REFERENCE TO RELATED APPLICATIONS

This application is a continuation of International Application No. PCT/CN2018/097774, filed on Jul. 31, 2018, which claims priority to Chinese Patent Application No. 201710662548.6, filed on Aug. 4, 2017. The disclosures of the aforementioned applications are hereby incorporated by reference in their entireties.

TECHNICAL FIELD

Embodiments of this application relate to the field of communications technologies, and in particular, to a polar code encoding method and apparatus.

BACKGROUND

As a most fundamental radio access technology, channel coding plays a critical role in ensuring reliable data transmission. In an existing wireless communications system, a turbo code, a low-density parity-check (LDPC) code, and a polar code are usually used to perform channel coding. The turbo code cannot support information transmission at an excessively low or high code rate. Due to encoding/decoding characteristics of the turbo code and the LDPC code, for medium and short packet transmission, it is difficult for the turbo code and the LDPC code to achieve ideal performance in a case of a limited code length. In terms of implementation, the turbo code and the LDPC code have relatively high calculation complexity in an encoding/decoding implementation process. Theoretically, it is proved that the polar code is a good code that can achieve a Shannon capacity and that has relatively low encoding/decoding complexity. Therefore, polar codes are increasingly widely applied.

However, with rapid evolution of the wireless communications system, some new characteristics are emerging in a future communications system such as a 5th generation (5G) communications system. For example, three most typical communication scenarios include enhanced mobile broadband (eMBB), massive machine type communication (mMTC), and ultra-reliable low latency communication (URLLC). These communication scenarios impose a higher requirement on encoding/decoding performance of the polar code.

Polarized channel reliability sorting plays an important role in the encoding/decoding performance of the polar code. However, in a current phase, polarized channel reliability sorting accuracy is not ideal. Consequently, further improvement of the encoding/decoding performance of the polar code in an application process is affected.

SUMMARY

Embodiments of this application provide a polar code encoding method and apparatus, to improve polarized channel reliability sorting accuracy.

Specific technical solutions provided in the embodiments of this application are as follows:

According to a first aspect, a polar code encoding method is provided. An encoding apparatus obtains a to-be-encoded bit, where a length of the to-be-encoded bit is K, and K is a positive integer. The encoding apparatus obtains a sequence used to encode K to-be-encoded bits, where the sequence is denoted as a first sequence, the first sequence is used to represent reliability rankings of N polarized channels, the first sequence includes sequence numbers of the N polarized channels, the sequence numbers of the N polarized channels are arranged in the first sequence based on reliability of the N polarized channels, N is a mother code length of a polar code, N is a positive integer power of 2, and K≤N. The encoding apparatus selects the first K sequence numbers with relatively high reliability rankings from the first sequence in descending order of reliability. The encoding apparatus maps the to-be-encoded information bits to polarized channels of the first K sequence numbers, and performs polar code encoding on the to-be-encoded bits. Therefore, locations of an information bit and a constant bit are determined through calculation of polar code polarized channel reliability, without consideration of a channel parameter and a code rate, so that polar code encoding calculation complexity can be reduced.

In a possible design, the first sequence is all or a subset of a second sequence, the second sequence includes sequence numbers of $N_{max}$ polarized channels, the sequence numbers of the $N_{max}$ polarized channels are arranged in the second sequence based on reliability of the $N_{max}$ polarized channels, $N_{max}$ is a positive integer, $N_{max} \geq N$, and sorting of the sequence numbers of the polarized channels in the first sequence is consistent with sorting of sequence numbers of polarized channels that are less than N in the second sequence.

In a possible design, the second sequence may be a part or all of any sequence shown in a sequence Q1 to a sequence Q30 in the specification, sequence numbers of N polarized channels in the second sequence are arranged in ascending order of reliability of the N polarized channels, and a minimum value of the sequence numbers of the polarized channels is 0.

In a possible design, the second sequence is a part or all of any sequence shown in a table Q1 to a table Q30 in the specification, sequence numbers of N polarized channels in the second sequence are arranged in ascending order of reliability of the N polarized channels, and a minimum value of the sequence numbers of the polarized channels is 0.

In a possible design, the second sequence may be a part or all of any sequence shown in a sequence Z1 to a sequence Z30 in the specification, each of sequence numbers of N polarized channels in the second sequence corresponds to a reliability ranking of the sequence number in the entire sequence, and a minimum value of the sequence number of the polarized channels is 0.

In a possible design, the second sequence is a part or all of any sequence shown in a table Z1 to a table Z30 in the specification, each of sequence numbers of N polarized channels in the second sequence corresponds to a reliability ranking of the sequence number in the entire sequence, and a minimum value of the sequence numbers of the polarized channels is 0.

According to a second aspect, a polar code encoding apparatus is provided. The apparatus has functions of implementing the method according to the first aspect and any one of the possible designs of the first aspect. The functions may be implemented by using hardware, or may be implemented by using hardware executing corresponding software. The hardware or software includes one or more modules corresponding to the foregoing functions.

In a possible design, when some or all of the functions are implemented by using hardware, the polar code encoding apparatus includes: an input interface circuit, configured to obtain a to-be-encoded bit; a logic circuit, configured to perform behavior described in the first aspect or any one of the possible designs of the first aspect; and an output interface circuit, configured to output an encoded bit sequence.

Optionally, the polar code encoding apparatus may be a chip or an integrated circuit.

In a possible design, when some or all of the functions are implemented by using software, the polar code encoding apparatus includes: a memory, configured to store a program; and a processor, configured to execute the program stored in the memory. When the program is executed, the polar code encoding apparatus may implement the method according to the first aspect and any one of the possible designs of the first aspect.

Optionally, the memory may be a physically independent unit, or may be integrated with the processor.

In a possible design, when some or all of the functions are implemented by using software, the polar code encoding apparatus includes a processor. A memory configured to store a program is located outside the encoding apparatus, and the processor is connected to the memory by using a circuit/wire, and is configured to read and execute a program stored in the memory.

According to a third aspect, a communications system is provided. The communications system includes a network device and a terminal, and the network device or the terminal may perform the method according to the first aspect and the possible designs of the first aspect.

According to a fourth aspect, a computer storage medium is provided. The computer storage medium stores a computer program, and the computer program includes an instruction used to perform the method according to any one of the first aspect and the possible designs of the first aspect.

According to a fifth aspect, an embodiment of this application provides a computer program product including an instruction. When the instruction runs on a computer, the computer performs the method in the foregoing aspect.

According to a sixth aspect, a wireless device is provided, including an encoding apparatus for implementing the first aspect and any possible design of the first aspect, a modulator, and a transceiver, where

- the modulator is configured to modulate an encoded bit sequence to obtain a modulated sequence; and
- the transceiver is configured to process the modulated sequence.

In a possible design, the wireless device is a terminal or a network device.

DESCRIPTION OF EMBODIMENTS

Figure 1:
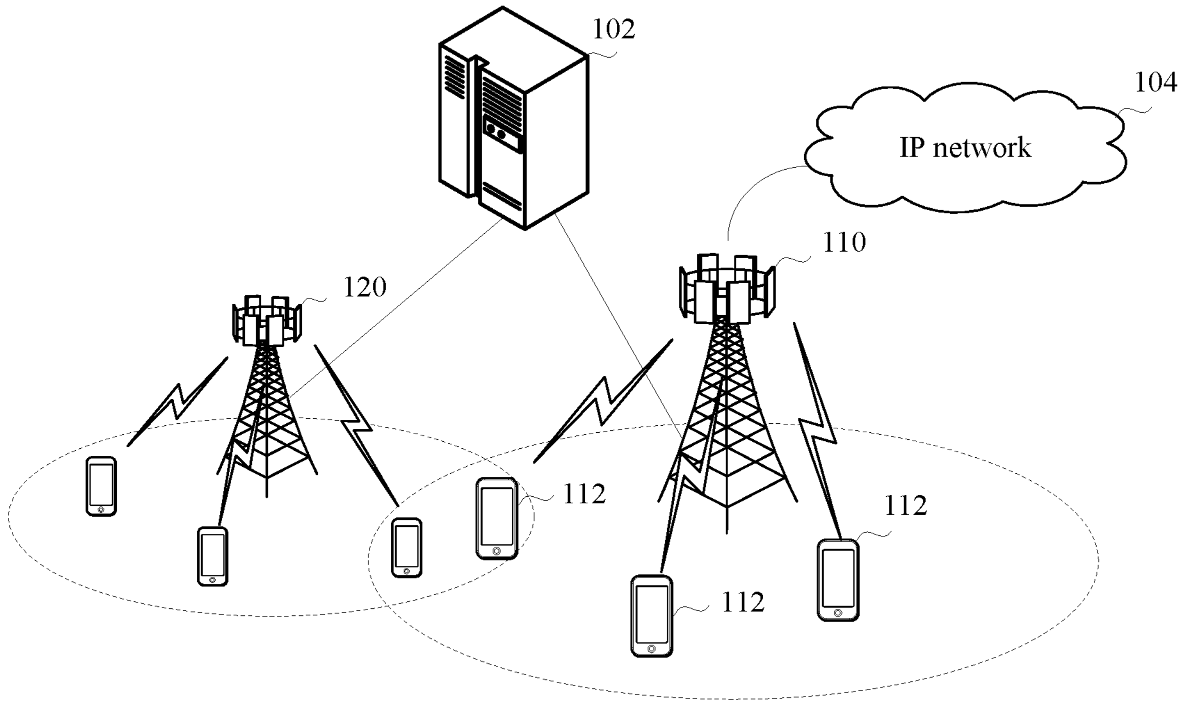
FIG. 1 is a schematic architectural diagram of a communications system applied to an embodiment of this application.

The following describes in detail the embodiments of this application with reference to accompanying drawings.

Embodiments of this application provide a polar code encoding method and apparatus, to obtain a reliability ranking based on reliability of a polarized channel, select, based on the reliability ranking, a sequence number of a polarized channel used to send an information bit, and perform polar code encoding based on a selected sequence number of the information bit. In the embodiments of this application, reliability of each polar code subchannel can be calculated more accurately. With reference to the accompanying drawings, the following describes in detail the encoding method and apparatus provided in the embodiments of the present invention.

For ease of understanding the embodiments of this application, the following briefly describes a polar code.

In an encoding policy of the polar code, a noiseless channel is used to transmit useful information of a user, and a pure noisy channel is used to transmit agreed information or transmit no information. The polar code is a linear block code. An encoding matrix of the polar code is $G_N$, and an encoding process is $x_1^N=u_1^NG_N$, where $u_1^N=(u_1, u_2, \ldots, u_N)$ is a binary row vector whose length is N (a code length), $G_N$ is an N×N matrix, $G_N=F_2^{\otimes(\log_2(N))}$, $F_2^{\otimes(\log_2(N))}$ is defined as a Kronecker product of $\log_2 N$ matrices $F_2$, and the foregoing matrix is $$F_2=\begin{bmatrix}1 & 0\\ 1 & 1\end{bmatrix}.$$

In the polar code encoding process, some of bits in $u_1^N$ are used to carry information, and are referred to as an information bit set, where an index set of the bits is denoted as A; and the other bits are set to fixed values pre-agreed between a receive end and a transmit end, and are referred to as a set of constant bits or a set of frozen bits, where an index set of the bits is indicated by a complementary set $A^c$ of A. The polar code encoding process is equivalent to $x_1^N=u_AG_N(A)\oplus u_{C^c}G_N(A^c)$, where $G_N(A)$ is a submatrix, in $G_N$, obtained from rows corresponding to indexes in the set A, and $G_N(A^C)$ is a submatrix, in $G_N$, obtained from rows corresponding to indexes in the set $A^c$. $u_A$ is a set of information bits in $u_1^N$, and there are K information bits. Usually, the information bit set includes but is not limited to various check bits such as a cyclic redundancy check (CRC) bit and a parity check (PC) bit. $u_{A^c}$ is a set of constant bits in $u_1^N$, there are (N−K) constant bits, and the constant bits are known bits. The constant bits are usually set to 0. However, the constant bits may be set randomly provided that the receive end and the transmit end reach a pre-agreement. Therefore, an output obtained after polar code encoding may be simplified as $x_1^N=u_AG_N(A)$, where $u_A$ is a set of information bits in $u_1^N$, and $u_A$ is a row vector of a length K, in other words, |A|=K, where |•| indicates a quantity of elements in a set, K is a size of an information block, $G_N(A)$ is a submatrix, in the matrix $G_N$, obtained from the rows corresponding to the indexes in the set A, and $G_N(A)$ is a K×N matrix.

A polar code construction process, namely, a process of selecting the set A, determines performance of the polar code. The polar code construction process is usually determining, based on a mother code length N, that there are N polarized channels in total, where the N polarized channels respectively correspond to N rows of the encoding matrix; calculating reliability of the polarized channels; and using indexes of first K polarized channels with relatively high reliability as elements of the set A, and using indexes corresponding to remaining (N−K) polarized channels as elements of the index set $A^c$ of the constant bits. The set A determines locations of the information bits, and the set $A^c$ determines locations of the constant bits. The sequence numbers of the polarized channels are location indexes of the information bits or the constant bits, namely, location indexes in $u_1^N$.

The solutions provided in the embodiments of this application relate to how to determine polarized channel reliability. A basic invention idea of the embodiments of this application is as follows: Polarized channel reliability may be represented by reliability, and from the angle of signal spectrum analysis, an approximation of the polarized channel reliability by using existing reliability may be understood as a domain transformation of a signal. Similar to Fourier transform using a kernel $e^{jw}$ to implement a transformation of a signal between time domain and frequency domain, this method uses a kernel β to implement a transformation of a signal from a channel sequence number domain to a reliability weight domain. In a signal time-frequency analysis field, Fourier transform and wavelet transform are the most common. Because the Fourier transform is limited by a form of trigonometric function kernel $e^{jw}$, in a signal time-frequency analysis process of the Fourier transform, there is an awkward situation in which not both a time domain identification capability and a frequency domain identification capability can be achieved. For the wavelet transform, a wavelet transform kernel and a variety of functions are used, and therefore, when a domain transformation is performed, an instantaneous change of a signal in time domain can be captured, so that both the time domain identification capability and the frequency domain identification capability can be achieved. In the embodiments of this application, a changeable transformation kernel is used to estimate the polarized channel reliability, thereby improving accuracy of sequence reliability estimation.

FIG. 1 is a schematic structural diagram of a wireless communications network according to an embodiment of the present invention. FIG. 1 is merely an example, and another wireless network that can use the encoding method and apparatus in the embodiments of the present invention also falls within the protection scope of the present invention.

As shown in FIG. 1, the wireless communications network 100 includes a network device 110 and a terminal 112. When the wireless communications network 100 includes a core network 102, the network device 110 may be further connected to the core network 102. The network device 110 may further communicate with an IP network 104, for example, the Internet, a private IP network, or another data network. The network device serves a terminal within coverage. For example, as shown in FIG. 1, the network device 110 provides wireless access for one or more terminals 112 within coverage of the network device 110. In addition, coverage of network devices such as the network devices 110 and 120 may have an overlapping area. Network devices may further communicate with each other. For example, the network device 110 may communicate with the network device 120.

The network device may be a device configured to communicate with a terminal device. For example, the network device may be a base transceiver station (BTS) in a GSM system or a CDMA system, or may be a NodeB (NB) in a WCDMA system, or may be an evolved NodeB (eNB or eNodeB) in an LTE system, or a network-side device in a future 5G network. Alternatively, the network device may be a relay station, an access point, an in-vehicle device, or the like. In a terminal-to-terminal (Device to Device, D2D) communications system, the network device may be a terminal that has a function of a base station.

The terminal may be user equipment (UE), an access terminal, a subscriber unit, a mobile station, a remote station, a remote terminal, a mobile device, a user terminal, a wireless communications device, a user agent, or a user apparatus. The access terminal may be a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, an in-vehicle device, a wearable device, a terminal device in a future 5G network, or the like. Based on the communications system architecture shown in FIG. 1, in the embodiments of this application, the polar code encoding method may be performed by the foregoing network device or terminal. When the network device or the terminal is used as a transmit end to send data or information, the polar code encoding method may be used. Correspondingly, when the network device or the terminal is used as a receive end to receive data or information, a subchannel sequence needs to be first confirmed in the method described in the present invention. The polar code encoding method provided in the embodiments of this application is described below in detail.

Figure 2:
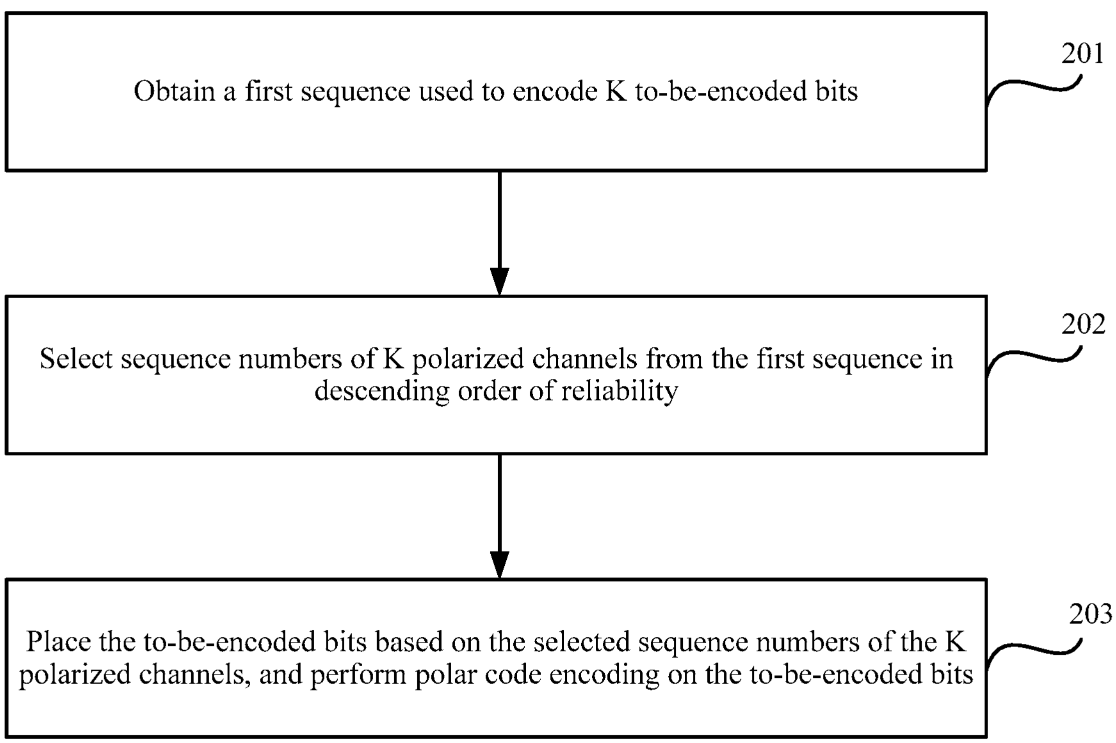
FIG. 2 is a schematic flowchart of a polar code encoding method according to an embodiment of this application.

Based on the communications system architecture shown in FIG. 1, as shown in FIG. 2, a specific procedure of a polar code encoding method provided in an embodiment of this application is as follows:

Step 201: Obtain a first sequence used to encode K to-be-encoded bits.

The first sequence includes sequence numbers of N polarized channels, the sequence numbers of the N polarized channels are arranged in the first sequence based on reliability of the N polarized channels, K is a positive integer, N is a mother code length of a polar code, and N is a positive integer power of 2.

Step 202: Select sequence numbers of K polarized channels from the first sequence in descending order of reliability.

Step 203: Place the to-be-encoded bits based on the selected sequence numbers of the K polarized channels, and perform polar code encoding on the to-be-encoded bits.

The K to-be-encoded bits are mapped to the K polarized channels in the N polarized channels, where reliability of the K polarized channels is higher than reliability of remaining (N−K) polarized channels.

Optionally, the first sequence is all or a subset of a second sequence, the second sequence includes sequence numbers of $N_{max}$ polarized channels, and the sequence numbers of the $N_{max}$ polarized channels are arranged in the second sequence based on reliability of the $N_{max}$ polarized channels. In other words, sorting of the sequence numbers of the polarized channels in the first sequence is consistent with sorting of sequence numbers of polarized channels that are less than N in the second sequence. $N_{max}$ is a positive integer that may be a positive integer power of 2 or may not be a positive integer power of 2, and $N_{max} \geq N$. A method for calculating the reliability of the $N_{max}$ polarized channels is similar to a method for calculating the reliability of the N polarized channels. The arrangement based on reliability described herein may be arrangement performed in ascending order of reliability, or may be arrangement performed in descending order of reliability. Alternatively, polarized channels may be grouped into two or more groups, and for each group, arrangement may be performed in ascending or descending order of reliability. Specifically, grouping may be performed based on values of sequence numbers of the polarized channels or based on sequence numbers with a same remainder (for example, the sequence numbers are grouped into three groups, and sequence numbers that have a same remainder after being divided by 3 are grouped into one group). No specific limitation is imposed herein.

Optionally, rate matching is performed, based on a target code length, on a sequence obtained after polar code encoding.

According to the encoding method provided in this embodiment, after an input information bit is received, a quantity K of to-be-encoded bits is determined based on a target code length N of a polar code. Regardless of whether a second sequence is known through calculation and storage that are performed in advance or through online calculation, a first sequence may be obtained from the second sequence. When $N_{max}=N$, the second sequence is the first sequence. The second sequence includes reliability sorting of polarized channels whose quantity is the maximum code length $N_{max}$ supported by a communications system. Optionally, the first sequence may be obtained from a prestored second sequence, then an information bit is determined based on the first sequence, and finally polar coding is performed on the K to-be-encoded bits to obtain a bit sequence after polar coding. In this way, in a semi-online calculation and semi-offline storage manner, reliability of a polar code polarized channel is obtained to determine locations of an information bit and a constant bit.

The following specifically describes a sequence of polarized channel sequence numbers arranged based on reliability of an $i^{th}$ polarized channel in N (or $N_{max}$) polarized channels. Sequence numbers of the N polarized channel may be 0 to (N−1), or may be 1 to N. In the embodiments of this application, when the reliability of the $i^{th}$ polarized channel in the N polarized channels is determined, a value of i may be 1, 2, . . . , or N, or may be 0, 1, . . . , or N−1.

It may be understood that the formula in the embodiments of this application is merely an example, and a solution obtained by persons skilled in the art by making a simple transformation to the formula without affecting performance of the formula falls within the protection scope of the embodiments of this application.

For a specific sequence example, refer to the following six groups of sequences found based on different criteria. A second sequence may be a part or all of any sequence shown in a sequence Q1 to a sequence Q30. These sequences may also be expressed by corresponding tables Q1 to Q30, where "reliability or reliability sequence number" is a natural sequence of reliability in ascending order, and the polarized channel sequence number is a polarized channel sequence number in a corresponding sequence. There are three different meanings of "a part" herein:

(1) $N_{max}$ is not a positive integer power of 2, and code lengths in the given examples are all positive integer power of 2. Therefore, the part can only be a part of any sequence shown in the sequence Q1 to the sequence Q30.

(2) If $N_{max\_encoding\ device}$ supported by an encoding device is less than $N_{max\_protocol}$ specified in a protocol, only $N_{max\_encoding\ device}$ sequence numbers in any sequence shown in the sequence Q1 to the sequence Q30 need to be obtained.

(3) A part of an actually used sequence of a length $N_{max}$ is fully consistent with a part of any sequence shown in the sequence Q1 to the sequence Q30.

It is easy to learn that a value in a Q sequence refers to a sequence number of a polarized channel, and indexes of the sequences are reliability sequence numbers in ascending order starting from 0.

Reliability rankings may also be expressed by using a Z sequence, to be specific, reliability rankings of all polarized channels corresponding to naturally sorted polarized channel sequence numbers are used as a Z sequence. In other words, a second sequence may be a part or all of any sequence shown in a sequence Z1 to a sequence Z30. Likewise, the Z sequence may also be expressed by corresponding tables Z1 to Z30, where polarized channel sequence numbers are arranged in ascending order, and "reliability or reliability sequence number" is a reliability sequence number of a polarized channel corresponding to the polarized channel sequence number. In other words, a value in the Z sequence refers to a reliability sequence number, and indexes of the sequences are polarized channel sequence numbers in ascending order starting from 0.

For example, an $x^{th}$ Q sequence is a sequence Qx and a table Qx, where the sequence Qx is equivalent to the table Qx, a corresponding Z sequence is a sequence Zx and a table Zx, and the sequence Zx is equivalent to the table Zx, where x=1, 2, . . . , or 30. Herein, "corresponding" means that reliability or a reliability sequence number and a polarized channel sequence number in a table Q fully correspond to a polarized channel sequence number and reliability or a reliability sequence number in a table Z. For example, in a total of N polarized channels, if reliability of an $i^{th}$ polarized channel has a $j^{th}$ ranking, a location of the $i^{th}$ polarized channel in the table Qx is (j, i), and a location of the $i^{th}$ polarized channel in the table Zx is (i, j).

First group of sequences (a sequence of a length 1024 is generated by comprehensively considering performance obtained when list sizes are 1, 2, 4, 8, and 16 and preferentially considering polar code performance of a mother code length 256, and the sequence is expanded to a sequence of a length 8192 based on a channel capacity):

Sequence Q1, with a sequence length of 8192:

[0, 1, 2, 4, 8, 16, 32, 3, 5, 64, 1024, 2048, 4096, 9, 6, 17, 10, 18, 128, 12, 33, 65, 20, 256, 34, 24, 36, 7, 129, 66, 512, 11, 40, 68, 130, 19, 13, 48, 14, 72, 257, 1025, 21, 132, 35, 258, 26, 2049, 513, 80, 37, 25, 22, 4097, 136, 260, 264, 38, 514, 96, 67, 41, 144, 28, 69, 42, 516, 49, 1026, 74, 272, 160, 520, 288, 528, 192, 544, 70, 44, 131, 81, 2050, 50, 73, 15, 320, 133, 52, 1028, 23, 134, 384, 7 6, 4098, 137, 82, 56, 27, 97, 39, 259, 84, 138, 145, 261, 1032, 29, 43, 2052, 98, 515, 88, 140, 30, 14 6, 71, 262, 265, 161, 576, 45, 1040, 100, 640, 51, 148, 46, 75, 4100, 266, 273, 517, 2056, 104, 162, 53, 193, 1056, 152, 77, 164, 768, 268, 274, 518, 54, 83, 57, 521, 1027, 112, 135, 2064, 78, 289, 1 94, 85, 276, 4104, 522, 58, 168, 1029, 139, 99, 86, 60, 280, 89, 290, 529, 2080, 524, 196, 1088, 14 1, 101, 147, 176, 142, 530, 321, 31, 200, 1033, 4112, 90, 545, 292, 2051, 322, 532, 263, 149, 102, 105, 1030, 304, 296, 163, 92, 47, 267, 385, 546, 2053, 324, 1041, 208, 386, 4128, 150, 153, 165, 106, 55, 1034, 328, 536, 577, 548, 2112, 113, 154, 79, 269, 1042, 108, 578, 224, 166, 519, 552, 1 95, 4099, 1152, 270, 3072, 641, 523, 275, 580, 291, 59, 1036, 169, 560, 114, 277, 156, 2057, 87, 197, 1057, 116, 170, 4101, 61, 531, 525, 642, 281, 1089, 278, 526, 2054, 177, 293, 388, 91, 1044, 584, 769, 198, 172, 120, 4160, 201, 2065, 336, 1280, 62, 282, 143, 103, 178, 294, 1058, 93, 644, 2058, 202, 592, 323, 1048, 392, 5120, 297, 770, 107, 180, 151, 1060, 2066, 209, 284, 648, 94, 20 4, 298, 1031, 400, 608, 352, 2176, 6144, 325, 533, 1153, 155, 210, 305, 547, 300, 1090, 109, 206 0,184, 534, 537, 115, 167, 1536, 4105, 225, 326, 306, 772, 2081, 157, 1035, 656, 329, 110, 117, 212, 1064, 171, 2113, 776, 4102, 330, 226, 549, 1092, 538, 387, 308, 216, 2068, 1154, 416, 271, 279, 158, 337, 1043, 4113, 550, 672, 2304, 118, 332, 579, 1037, 540, 389, 173, 121, 1072, 2082, 553, 199, 784, 4106, 179, 1038, 228, 338, 312, 2072, 704, 390, 1096, 174, 554, 581, 393, 1281, 4 114, 283, 2084, 122, 448, 353, 1045, 561, 203, 63, 340, 2055, 1156, 394, 527, 582, 4224, 556, 18 1, 1059, 2177, 295, 285, 232, 124, 1282, 205, 182, 643, 2114, 4108, 562, 1050, 286, 585, 299, 15 37, 354, 211, 2560, 401, 185, 1104, 396, 344, 4129, 586, 645, 2059, 1061, 593, 535, 240, 206, 10 49, 95, 2088, 327, 564, 4161, 1046, 800, 402, 356, 307, 2116, 1160, 301, 417, 213, 568, 1284, 83 2, 4116, 2178, 588, 186, 1288, 646, 404, 227, 896, 2067, 1062, 594, 418, 4352, 302, 1538, 649, 7 71, 2061, 360, 539, 1120, 111, 331, 214, 1091, 2096, 4130, 309, 188, 449, 1065, 217, 408, 2062, 609, 596, 1168, 551, 650, 4120, 229, 1052, 2120, 159, 420, 310, 1093, 541, 773, 2305, 610, 413 2, 1066, 657, 333, 119, 1540, 3073, 600, 339, 218, 1073, 368, 652, 4103, 230, 2069, 1098, 391, 3 13, 450, 1296, 542, 2180, 334, 233, 4225, 1184, 555, 774, 175, 2083, 1544, 123, 658, 612, 1312, 2306, 4162, 341, 777, 220, 1552, 314, 424, 2074, 395, 1216, 673, 583, 4608, 355, 1568, 2561, 2 87, 183, 234, 1094, 125, 557, 2128, 4107, 660, 1068, 616, 342, 316, 2085, 1155, 241, 778, 1105, 563, 4136, 345, 2073, 452, 1074, 397, 403, 207, 2070, 1097, 674, 4164, 558, 1039, 785, 432, 21 84, 357, 1344, 187, 236, 664, 4226, 2308, 1157, 624, 587, 1076, 780, 2312, 705, 126, 1047, 411 5, 242, 565, 1158, 2086, 398, 346, 456, 1408, 358, 2562, 4109, 405, 1100, 303, 569, 244, 2144, 1 161, 595, 189, 4144, 1106, 566, 2115, 676, 361, 1080, 706, 589, 2089, 1051, 4110, 215, 786, 64 7, 1121, 2192, 348, 419, 1063, 406, 4168, 464, 2076, 680, 1283, 801, 362, 1108, 2117, 590, 435 3, 409, 1162, 570, 2090, 788, 597, 1169, 572, 219, 5121, 2564, 1285, 311, 708, 1053, 598, 2097, 601, 1067, 4117, 651, 421, 3074, 792, 1122, 802, 611, 1539, 2122, 4228, 602, 410, 1112, 231, 68 8, 2320, 1164, 653, 248, 4131, 1054, 2208, 369, 190, 364, 1170, 654, 2568, 4354, 659, 1095, 33 5, 480, 2336, 1286, 315, 221, 1289, 4122, 2576, 370, 613, 1185, 422, 425, 2240, 1600, 6145, 45 1, 614, 1069, 2592, 543, 235, 1124, 412, 4609, 2118, 343, 372, 1664, 775, 317, 2092, 1075, 222, 4176, 426, 1172, 2179, 453, 237, 1070, 559, 2129, 4133, 833, 1099, 804, 712, 2098, 1290, 834, 661, 4121, 1297, 2121, 808, 779, 1541, 617, 1128, 2063, 4118, 604, 433, 1186, 720, 2368, 816, 1077, 4232, 836, 347, 2181, 1217, 897, 243, 1176, 2100, 4356, 662, 454, 1101, 318, 3076, 675, 1188, 618, 4360, 898, 2071, 1792, 781, 376, 2182, 1292, 4134, 428, 1298, 665, 2432, 736, 1542, 567, 840, 4610, 2124, 1078, 625, 238, 1107, 2185, 359, 4192, 457, 1081, 399, 2130, 787, 1545, 591, 1136, 4163, 2104, 678, 434, 1159, 2075, 677, 349, 4137, 1102, 245, 2145, 458, 1313, 666, 1218, 4240, 2087, 620, 363, 1109, 2307, 127, 191, 4124, 1300, 782, 2132, 1546, 407, 436, 1082, 4165, 2186, 626, 571, 1192, 2193, 465, 1163, 681, 4138, 246, 2309, 1123, 707, 350, 3080, 461 2, 1110, 599, 1084, 668, 2077, 790, 1304, 4145, 460, 2091, 249, 1113, 682, 1314, 2146, 5122, 57 3, 411, 1553, 2563, 803, 789, 1548, 4170, 709, 2136, 1220, 365, 440, 2188, 1165, 4368, 628, 11 25, 689, 2078, 374, 1171, 4256, 423, 2194, 466, 1200, 793, 2119, 1166, 4616, 250, 371, 1554, 2 310, 481, 1345, 574, 4384, 2313, 413, 1055, 603, 2209, 1224, 4624, 366, 468, 1114, 2624, 655, 1569, 900, 4288, 2093, 805, 1316, 615, 3088, 1346, 4640, 684, 710, 2148, 1556, 429, 1287, 416 6, 2688, 794, 252, 1173, 373, 2099, 1126, 4140, 605, 848, 2196, 1129, 690, 1328, 4227, 2094, 7 13, 1320, 632, 2123, 482, 4177, 1187, 806, 2314, 1116, 427, 904, 6146, 2321, 1071, 414, 1291, 2565, 223, 663, 4146, 1409, 2152, 692, 1570, 835, 2210, 4169, 1348, 619, 472, 2101, 1232, 455, 4111, 1410, 2241, 796, 809, 1174, 3104, 4416, 714, 1177, 721, 2200, 1189, 837, 4229, 716, 212 5, 1130, 864, 1079, 2212, 4148, 810, 1352, 606, 2816, 912, 5124, 1560, 722, 2316, 1601, 696, 1 572, 4119, 2322, 377, 435, 1137, 2566, 817, 4230, 1178, 319, 2102, 1103, 621, 1293, 4480, 213 1, 812, 484, 1132, 2105, 430, 4172, 1602, 838, 2569, 1248, 667, 4233, 3075, 488, 1190, 239, 21 60, 1543, 4178, 378, 1576, 2183, 459, 1219, 622, 4152, 2126, 627, 1294, 437, 2337, 4123, 1665, 380, 2242, 1547, 818, 1299, 4193, 2133, 461, 496, 1604, 2324, 4135, 669, 1315, 2570, 679, 10 83, 724, 4355, 2106, 1193, 841, 629, 2216, 4180, 1584, 351, 1138, 3077, 467, 1301, 4234, 2187, 438, 1180, 737, 2147, 4241, 1111, 251, 1221, 2134, 462, 4357, 442, 2108, 1140, 441, 1194, 232 8, 5128, 469, 1085, 2137, 247, 1555, 4125, 683, 2338, 1549, 842, 1666, 4139, 2577, 738, 899, 2 572, 1305, 6148, 670, 1302, 2244, 783, 1550, 3136, 4194, 849, 1201, 820, 2189, 1317, 4611, 72 8, 2149, 1412, 928, 1115, 4184, 2195, 791, 367, 2224, 1608, 4236, 901, 1793, 2190, 630, 1222, 4126, 2578, 685, 1196, 844, 2369, 4242, 1144, 633, 2079, 1225, 711, 4167, 1360, 2248, 253, 10 86, 3081, 4358, 691, 1306, 824, 2138, 1167, 4361, 902, 2593, 1127, 686, 740, 4257, 2340, 1202, 850, 2370, 1318, 4672, 375, 2580, 1117, 444, 1668, 4141, 2311, 470, 1226, 2197, 483, 5136, 1 616, 415, 2150, 1347, 485, 4196, 2153, 1416, 905, 3078, 1321, 4736, 795, 1794, 2352, 473, 414 7, 1131, 2344, 634, 1204, 2211, 4244, 744, 1175, 852, 2140, 1233, 4142, 960, 2095, 1308, 865, 2315, 4171, 1672, 693, 2433, 1118, 4362, 797, 1228, 2594, 906, 1322, 4369, 2372, 715, 1424, 3 089, 807, 4613, 1632, 474, 2256, 1376, 6152, 636, 2434, 1349, 694, 2198, 4200, 1557, 254, 220 1, 1179, 717, 4258, 2213, 1234, 575, 1329, 4149, 2154, 913, 1571, 2103, 798, 4289, 1324, 3082, 811, 1133, 5152, 2376, 379, 1208, 2584, 697, 4248, 1558, 431, 2625, 607, 4173, 489, 2596, 15 61, 866, 2161, 4260, 1139, 723, 2202, 1191, 4864, 486, 2127, 1249, 908, 2317, 4364, 1350, 718, 1330, 3090, 4370, 813, 1796, 2156, 476, 4614, 1181, 2626, 856, 1680, 2272, 4150, 839, 1353, 2214, 725, 4179, 1134, 2567, 698, 1141, 2600, 4153, 914, 1236, 2243, 752, 4617, 1195, 3200, 8 68, 1800, 5123, 2318, 819, 1354, 2689, 4208, 814, 1250, 439, 2571, 1573, 4231, 929, 2323, 156 2, 490, 6160, 2628, 1411, 623, 2339, 4174, 1332, 671, 2107, 1240, 4385, 739, 3084, 1440, 916, 2217, 4290, 1295, 463, 2608, 1303, 4181, 843, 2162, 1182, 381, 4372, 2325, 1361, 497, 2204, 4 618, 1574, 930, 2135, 1696, 4154, 821, 2245, 1142, 726, 4264, 3105, 1356, 1603, 2164, 5125, 9 61, 2218, 1564, 872, 2109, 4235, 1413, 492, 2579, 1197, 4195, 631, 2573, 1145, 729, 4182, 269 0, 1577, 700, 2329, 4156, 1223, 443, 3137, 1808, 4376, 741, 2326, 1203, 845, 4185, 2574, 1252, 920, 2225, 4386, 1362, 382, 2341, 1336, 4625, 822, 2436, 1728, 2139, 6176, 1414, 851, 3092, 1198, 4620, 730, 2632, 1578, 498, 4292, 2817, 1605, 880, 5184, 2246, 1417, 742, 2220, 4237, 1 307, 445, 2168, 1146, 4197, 2249, 471, 1472, 2384, 4243, 1377, 635, 3328, 1585, 4272, 932, 21 10, 1227, 687, 4238, 2330, 1087, 903, 2191, 4626, 1364, 2151, 825, 4417, 1418, 2226, 500, 155 1, 4127, 2342, 1606, 846, 3106, 4296, 1580, 745, 2141, 1205, 5129, 2692, 826, 1319, 2250, 418 6, 732, 1309, 2640, 4641, 446, 1256, 2371, 1148, 4388, 3096, 962, 1229, 2440, 6147, 936, 1206, 2345, 4418, 475, 1667, 2818, 853, 4628, 2155, 1586, 867, 2228, 4359, 1310, 1609, 2199, 637, 4245, 1323, 3108, 907, 4198, 2257, 1378, 487, 2332, 4201, 1235, 695, 2696, 5126, 1425, 2142, 1209, 746, 4400, 2252, 1420, 828, 2346, 4392, 1368, 3079, 753, 4259, 1610, 2448, 854, 1669, 4 188, 2656, 1617, 2400, 857, 4143, 1559, 2373, 504, 4363, 1264, 2581, 799, 3201, 4481, 1230, 1 119, 2203, 4642, 255, 1351, 2258, 964, 6149, 2353, 1588, 909, 4420, 2595, 1824, 719, 2348, 51 37, 1426, 3138, 1380, 4304, 477, 2157, 1331, 915, 4482, 2232, 1325, 2582, 4246, 638, 1441, 25 85, 1237, 4249, 2163, 748, 1592, 4261, 2215, 944, 1856, 3584, 4202, 869, 2273, 1612, 4151, 12 10, 2374, 491, 5130, 2354, 1670, 699, 2820, 4424, 1428, 1251, 2205, 4632, 754, 3083, 1920, 85 8, 4673, 2704, 1618, 2377, 4644, 478, 1442, 2158, 6208, 1326, 968, 2165, 1673, 4209, 2260, 38 3, 1795, 4250, 3112, 910, 2219, 4175, 1384, 1563, 2824, 815, 4365, 2378, 1135, 976, 5138, 227 4, 1355, 2597, 4204, 1238, 870, 3140, 1333, 4674, 2586, 917, 1212, 4320, 2435, 1473, 2356, 42 62, 727, 1241, 2264, 493, 4615, 3202, 1432, 873, 4648, 2464, 1633, 2319, 4291, 1620, 701, 232 7, 5248, 1575, 2206, 931, 4366, 1674, 2385, 1253, 3091, 7168, 756, 1183, 2598, 4737, 860, 272 0, 1444, 4619, 1334, 2166, 499, 4371, 2380, 1565, 731, 2627, 4676, 1797, 3085, 1634, 4387, 82 3, 2588, 1681, 4155, 2437, 922, 1357, 5132, 2221, 1143, 2169, 4265, 874, 1624, 3120, 4656, 91 8, 2601, 1363, 4210, 2247, 1242, 502, 2832, 4373, 1392, 2227, 933, 4252, 1676, 3086, 1254, 61 53, 2276, 743, 1415, 4183, 2386, 1337, 2360, 4293, 760, 2752, 1474, 5153, 881, 2438, 1566, 42 12, 3144, 1358, 494, 4266, 2222, 1257, 2602, 4157, 702, 2629, 1579, 4627, 1798, 2441, 921, 46 21, 3329, 1199, 501, 4738, 2331, 1147, 2170, 4377, 1682, 2496, 876, 5185, 1636, 2401, 1365, 4 374, 3093, 847, 1801, 2609, 4622, 992, 2251, 6150, 1244, 2111, 1338, 4273, 447, 2388, 1448, 4 389, 3204, 1419, 2442, 4484, 733, 1697, 2575, 4187, 827, 2630, 1607, 5140, 2604, 1379, 934, 4 680, 2229, 1311, 3107, 4865, 1207, 2343, 882, 4294, 1258, 2333, 937, 4268, 2280, 1149, 2172, 4216, 1581, 963, 3330, 4297, 1684, 2253, 1640, 6161, 2230, 747, 1366, 4432, 2691, 505, 2610, 5376, 1340, 3098, 1265, 4158, 855, 2334, 4378, 1802, 2633, 1587, 4239, 2347, 924, 3585, 419 9, 1369, 734, 2402, 4274, 1476, 2259, 1421, 4390, 2449, 829, 1427, 5154, 2233, 1231, 3152, 41 89, 965, 2444, 4740, 1698, 2392, 1582, 6154, 938, 2634, 1809, 4298, 2693, 1456, 3109, 4688, 8 84, 1381, 2641, 4419, 506, 2583, 5144, 1211, 2288, 1260, 4488, 2254, 749, 1688, 4393, 3097, 1 648, 2143, 4866, 945, 2375, 1611, 4203, 2612, 1804, 4276, 966, 3094, 1729, 4247, 2848, 1150, 2450, 5156, 755, 2404, 1266, 6162, 859, 2355, 4305, 1589, 3208, 1422, 4380, 2349, 940, 2465, 4744, 1370, 2261, 4190, 1480, 830, 2616, 4300, 1382, 3332, 1429, 4394, 2880, 911, 2636, 512 7, 1327, 1593, 4496, 2234, 871, 3336, 4704, 1268, 2694, 1619, 4448, 2452, 639, 6272, 2275, 12 13, 1590, 4421, 2944, 888, 3110, 4629, 1700, 2642, 5249, 1385, 2466, 479, 4251, 2350, 1730, 3 586, 4306, 1613, 946, 4401, 2697, 1239, 2819, 4643, 750, 2408, 4396, 1810, 2587, 1671, 5186, 3168, 969, 2159, 4205, 1372, 1443, 6156, 2379, 508, 2262, 4280, 1430, 3139, 4630, 1488, 235 7, 861, 4633, 2236, 1704, 2497, 4211, 1825, 757, 4263, 3113, 1386, 2265, 5632, 1614, 2456, 43 21, 970, 2657, 1433, 4422, 2644, 1594, 3216, 4402, 919, 2599, 4868, 1812, 1621, 2698, 6177, 1 596, 2277, 4253, 875, 3100, 1243, 5131, 2207, 1335, 4752, 2468, 862, 2358, 4425, 1732, 3141, 4206, 1622, 2589, 758, 4213, 1625, 2821, 4308, 1675, 2658, 948, 5160, 3114, 1445, 4267, 270 5, 1816, 2381, 6209, 977, 2167, 4872, 1826, 3588, 1635, 4426, 2648, 923, 4322, 2387, 1626, 22 66, 4645, 1434, 972, 5188, 3121, 1255, 2416, 4634, 1712, 2700, 4483, 761, 2278, 1677, 4404, 3 146, 1272, 4312, 2439, 877, 6164, 2361, 1393, 2498, 5250, 1214, 3344, 4512, 1388, 2590, 952, 4367, 2382, 1678, 4375, 2281, 1683, 495, 4254, 3232, 1359, 4433, 2603, 1504, 5139, 2822, 70 3, 2223, 4646, 1339, 3592, 4768, 1245, 2171, 935, 6400, 2706, 1394, 4214, 2660, 1637, 4428, 3 360, 978, 2389, 4675, 1446, 2825, 5133, 1449, 2268, 1475, 4636, 3600, 883, 4485, 2362, 1638, 4269, 2472, 1567, 2443, 4217, 762, 3264, 5168, 1259, 2721, 6178, 1436, 2631, 503, 4649, 240 3, 1367, 4295, 3616, 1396, 4880, 2335, 925, 2231, 4275, 1799, 2282, 5134, 1341, 3142, 4324, 1 246, 2173, 878, 4434, 2605, 1450, 4408, 2708, 1477, 6168, 3116, 735, 2664, 4800, 1261, 2390, 4486, 1583, 2364, 5192, 1857, 3203, 4270, 993, 2289, 1828, 4650, 2826, 1736, 4677, 3153, 88 5, 4489, 2611, 1858, 2393, 5377, 1685, 2500, 4379, 939, 3122, 6180, 1832, 2445, 4218, 1803, 2 451, 1641, 4544, 2255, 994, 4449, 3145, 1628, 5141, 2722, 1457, 4657, 2606, 980, 3087, 4299, 1744, 2833, 4159, 1840, 2480, 4436, 1860, 2405, 6151, 926, 3392, 5252, 1371, 2235, 1921, 44 90, 2284, 764, 4623, 2712, 1267, 4678, 3205, 1686, 4652, 2672, 1478, 2635, 4277, 941, 3124, 5 155, 1342, 2828, 6273, 1699, 2753, 4391, 967, 2174, 4381, 1642, 3095, 4328, 1922, 2290, 180 5, 4220, 2613, 886, 5378, 1400, 1452, 4301, 3206, 831, 4278, 2446, 1689, 4739, 2394, 1760, 62 10, 2504, 1591, 3456, 4658, 947, 2406, 5146, 1864, 2453, 4382, 1649, 3148, 4681, 507, 2351, 4 395, 1262, 2617, 5633, 1383, 2292, 4450, 1481, 3209, 889, 4307, 2643, 1423, 6656, 2237, 181 1, 4497, 3154, 1615, 4281, 2614, 984, 5200, 2724, 1702, 4492, 2409, 1458, 4440, 3128, 751, 46 82, 2754, 1701, 4741, 2637, 1373, 3099, 6155, 1269, 2263, 5157, 942, 2834, 4689, 1482, 2695, 4631, 1690, 3169, 4336, 1644, 2396, 4302, 996, 2467, 5145, 1387, 3111, 4191, 1151, 2454, 61 84, 1215, 2512, 4423, 971, 2728, 4660, 1806, 3331, 5142, 1431, 2849, 4896, 890, 2410, 1460, 4 498, 3156, 1650, 4452, 2638, 1595, 4403, 2457, 509, 6212, 3210, 1489, 5256, 2618, 1705, 439 7, 2836, 1270, 4513, 2645, 949, 4309, 3217, 1731, 4664, 2620, 1374, 5380, 2267, 1623, 4928, 3 333, 973, 6274, 2359, 1692, 4684, 2756, 1814, 4282, 3101, 1484, 5384, 2646, 1000, 4742, 264 9, 1273, 4500, 3115, 1706, 4323, 2699, 1597, 4992, 2469, 892, 6163, 2840, 1435, 5158, 3170, 1 827, 4690, 2850, 1813, 4514, 2659, 950, 4398, 3587, 1733, 5634, 2650, 1389, 4745, 2458, 146 4, 4867, 3160, 863, 6157, 2279, 2736, 4456, 1652, 4635, 3212, 1713, 5216, 2701, 1398, 4207, 2 296, 759, 4427, 3102, 1447, 4310, 2417, 1490, 5187, 2238, 1817, 6192, 2412, 1008, 4405, 321 8, 1274, 4284, 2702, 1395, 4545, 2707, 1505, 5161, 3143, 510, 4313, 2383, 1598, 4504, 2528, 3 334, 6158, 1437, 2363, 4705, 1627, 4692, 2269, 979, 5264, 3337, 1390, 4647, 2418, 1492, 474 6, 2661, 1679, 4325, 3233, 953, 5148, 2470, 1924, 6216, 2473, 1829, 4255, 3648, 1639, 4516, 2 499, 4406, 2662, 763, 5189, 3117, 1708, 4637, 2591, 1734, 4869, 2283, 1453, 6401, 3172, 974, 4706, 2460, 1818, 5162, 2391, 1276, 4753, 2420, 4429, 1397, 3712, 4215, 2823, 1629, 5636, 2 365, 954, 7169, 3123, 1872, 4696, 2270, 1714, 4435, 2474, 4314, 1737, 3220, 5169, 879, 2501, 4464, 1656, 2285, 4748, 3118, 1506, 4326, 2607, 1830, 6165, 2881, 5194, 981, 3147, 4487, 14 51, 2852, 4409, 1928, 2760, 4546, 1438, 3338, 5392, 2882, 982, 4638, 2709, 6276, 1247, 3345, 4430, 1687, 2856, 4329, 1716, 2827, 5280, 1859, 3589, 4651, 927, 4870, 2665, 3176, 4271, 16 43, 2652, 6179, 1496, 2481, 5640, 1479, 3234, 4219, 995, 4754, 2768, 1820, 4708, 2864, 1833, 5408, 3125, 2884, 6402, 1738, 4437, 2395, 1745, 4873, 3265, 765, 4316, 2945, 1861, 5648, 22 91, 4410, 3224, 1740, 4520, 2710, 1888, 6170, 2502, 956, 4491, 3149, 5312, 1834, 2366, 4769, 1630, 2723, 4679, 3236, 1936, 4451, 2666, 5664, 1746, 2946, 6657, 887, 3840, 4383, 1720, 28 29, 4279, 1401, 4330, 2424, 3340, 5190, 1459, 2476, 4221, 1841, 3346, 4653, 985, 6224, 2713, 1343, 4756, 2784, 3590, 5164, 1645, 4712, 2615, 1836, 4438, 2888, 997, 4412, 3126, 1508, 61 81, 2673, 5251, 2286, 1454, 4337, 3155, 1862, 4874, 2407, 5201, 1691, 2505, 4659, 986, 3129, 4441, 2447, 6169, 1512, 2835, 4548, 1263, 3593, 5170, 1402, 4493, 2639, 3184, 4499, 1483, 2 726, 4303, 943, 6166, 2482, 1646, 5193, 3207, 1651, 4770, 2725, 2397, 4654, 1461, 5135, 315 0, 1404, 4881, 2293, 4528, 891, 2506, 6280, 3361, 1842, 4453, 2714, 5440, 1485, 3266, 4283, 1 520, 2668, 4332, 1693, 4760, 2411, 3157, 6404, 998, 2175, 5253, 1703, 4720, 2239, 1748, 468 3, 3348, 2830, 5172, 1865, 4876, 3594, 766, 6408, 2455, 1653, 4801, 2484, 4222, 3130, 1375, 5 143, 2674, 4338, 1491, 2619, 4661, 1462, 3240, 5254, 2513, 6182, 511, 3211, 4494, 1761, 444 2, 2729, 1275, 4552, 2294, 3171, 5504, 1486, 4454, 2755, 1466, 6658, 2398, 4501, 1465, 3158, 5196, 2647, 988, 4399, 3132, 4665, 1493, 2716, 4340, 1271, 6240, 2838, 3352, 5257, 1707, 25 08, 4691, 1866, 4285, 2297, 3161, 5202, 1001, 4662, 2730, 1762, 6211, 3362, 1923, 4772, 262 1, 4457, 2459, 1694, 5176, 3601, 4802, 1807, 2851, 4685, 951, 6185, 2837, 3596, 5147, 1873, 2 757, 4311, 1844, 4882, 3268, 2413, 4743, 1752, 5217, 2488, 1952, 6288, 3213, 4444, 1002, 26 76, 4515, 3173, 5159, 1815, 2737, 4502, 1391, 4560, 2422, 3219, 6172, 1925, 2471, 4776, 165 4, 5379, 2514, 1709, 4897, 3248, 4458, 2841, 893, 5204, 3214, 6213, 1868, 2298, 4686, 2419, 4 505, 1657, 3602, 5258, 1735, 4666, 2529, 3393, 6186, 1277, 4884, 2622, 975, 4693, 2461, 526 5, 1715, 3103, 4668, 2651, 4315, 1848, 3272, 6660, 1926, 5381, 2414, 2516, 4407, 1710, 4804, 3162, 894, 5149, 2703, 4694, 3617, 1764, 6193, 2948, 4697, 1874, 2853, 5163, 3364, 4747, 13 99, 2663, 4517, 1468, 7170, 3394, 2732, 4888, 1494, 5218, 2758, 1009, 4898, 3604, 4707, 247 7, 1507, 5635, 3335, 6218, 1439, 2842, 4698, 2300, 4506, 1509, 3221, 5208, 1929, 4327, 2421, 3174, 4784, 1819, 6416, 2653, 955, 5260, 2896, 4749, 3177, 4344, 1497, 2738, 5150, 1658, 63 04, 3376, 2761, 4465, 1768, 4286, 3368, 1876, 4460, 2680, 5266, 2530, 1984, 4750, 3235, 666 4, 1004, 4755, 2854, 3164, 5191, 1889, 4431, 2475, 1717, 4576, 2952, 6432, 3119, 1821, 5382, 2462, 4411, 1930, 3339, 4317, 2271, 5385, 1010, 6672, 2711, 1739, 4466, 3457, 4709, 2740, 1 831, 5281, 3618, 4518, 2883, 4521, 1498, 3396, 6336, 1660, 5696, 2667, 2520, 4547, 1718, 47 10, 3280, 957, 5165, 2503, 6688, 3458, 4639, 1278, 2844, 4331, 1741, 5220, 2857, 3222, 4508, 1599, 6214, 2762, 4439, 3225, 1937, 4468, 2769, 5760, 1822, 3237, 4871, 2885, 4413, 983, 61 88, 2764, 1835, 5171, 3178, 4318, 2912, 4522, 1403, 3127, 5268, 2858, 6275, 1721, 3400, 454 9, 1455, 4333, 2654, 5166, 2960, 1631, 4655, 3608, 6225, 1513, 2770, 4929, 3649, 5195, 958, 4 900, 2744, 3620, 4808, 1890, 6194, 2425, 5386, 1747, 2483, 4930, 3185, 4757, 1510, 5393, 28 65, 3226, 6217, 1932, 4904, 2367, 4875, 1742, 3151, 5637, 2669, 4713, 987, 3341, 5224, 2860, 6159, 1837, 4700, 2532, 1500, 4529, 3180, 5282, 2478, 4816, 1880, 3650, 6464, 2886, 4912, 1 863, 5173, 3296, 1749, 4932, 2715, 4443, 2536, 6277, 1012, 3238, 5313, 2287, 4993, 1722, 43 39, 3591, 1938, 5272, 2426, 6196, 3624, 4758, 1776, 2507, 4550, 3267, 5197, 1892, 4414, 267 0, 7172, 1843, 2675, 4771, 3342, 5284, 1838, 4714, 2485, 3713, 4994, 999, 6167, 2428, 5888, 1 463, 3595, 4877, 2866, 4472, 1953, 6278, 3347, 2509, 5388, 1514, 4524, 2544, 5394, 3652, 47 61, 1647, 2717, 6528, 1695, 4832, 3363, 5638, 2727, 1763, 4663, 3131, 4936, 2772, 6220, 101 6, 3241, 5174, 2889, 4721, 1940, 4334, 2677, 5203, 1487, 3632, 6281, 2399, 4455, 1867, 4553, 3186, 5177, 2515, 1405, 4495, 3349, 6226, 2486, 4883, 1521, 3228, 5641, 2785, 4687, 767, 52 32, 3159, 6200, 1954, 2299, 4774, 3269, 4530, 1845, 5255, 2510, 6171, 2490, 1750, 4773, 318 8, 4445, 2489, 5198, 1985, 4341, 3242, 1896, 6241, 2517, 4554, 3133, 5409, 1516, 4762, 2295, 3603, 5314, 1655, 6183, 2731, 4716, 3597, 4459, 989, 2890, 5205, 3714, 6403, 1753, 4223, 27 86, 4287, 2947, 1724, 5396, 3353, 4878, 1467, 6228, 2718, 5642, 3350, 1765, 4503, 2831, 453 2, 3598, 5178, 1869, 6282, 2897, 4722, 3249, 1944, 4667, 2868, 5288, 3365, 6289, 1003, 4561, 2776, 3460, 5259, 1406, 4777, 2976, 4342, 3163, 6405, 1846, 5219, 2839, 1875, 4803, 2415, 4 446, 3656, 7176, 1754, 5206, 2949, 3841, 4695, 1522, 5180, 2678, 4764, 3270, 6173, 1904, 48 86, 2733, 3244, 5400, 990, 4556, 2892, 6187, 3192, 4345, 1766, 5209, 2681, 3273, 4778, 1469, 5410, 2759, 6242, 3408, 4669, 1495, 4507, 2301, 5649, 3134, 1659, 6659, 2739, 4899, 3354, 4 885, 1956, 5644, 2872, 4805, 3215, 1711, 6232, 2950, 5316, 3175, 4461, 1927, 4536, 2734, 62 84, 1005, 5261, 2788, 3250, 4724, 1849, 5221, 2898, 4785, 3366, 6174, 1524, 4470, 2423, 526 7, 3165, 1870, 4519, 2492, 6290, 3716, 4562, 1769, 5296, 2518, 4889, 3274, 6215, 1850, 2531, 5262, 3664, 4346, 1756, 4467, 2463, 5650, 3395, 6406, 1470, 4577, 2533, 3464, 5441, 959, 46 70, 2953, 6409, 3369, 4509, 1986, 5151, 2843, 4699, 3842, 6305, 1960, 2521, 5320, 3179, 446 2, 1499, 4564, 2682, 5210, 3252, 6720, 1877, 4751, 2792, 5665, 3223, 1891, 4996, 2900, 6189, 3281, 4901, 3008, 5412, 1661, 4711, 3356, 7184, 2913, 5442, 1931, 4780, 3720, 2741, 4806, 1 011, 6244, 3166, 5652, 2845, 4525, 1511, 5383, 3276, 6784, 2954, 4890, 1719, 4348, 3370, 52 69, 2763, 1770, 4469, 3472, 6195, 2855, 5222, 1852, 4701, 3680, 4944, 2522, 6292, 1777, 522 5, 3424, 4786, 2684, 5424, 1878, 3397, 6190, 2742, 4809, 1881, 5416, 3605, 4728, 2302, 6219, 1013, 4578, 3227, 5283, 2765, 4902, 1528, 6410, 3282, 5212, 2623, 3377, 4523, 1823, 5000, 2 961, 6417, 3619, 5167, 1279, 4510, 2846, 5387, 3372, 6661, 1988, 4319, 2859, 4759, 3181, 55 05, 1933, 6248, 2427, 4788, 3256, 1743, 5666, 2745, 4931, 3606, 6306, 1501, 5444, 2479, 471 5, 2655, 4568, 2537, 6197, 1939, 5328, 3609, 4551, 2914, 5506, 895, 6337, 3187, 4892, 2771, 4 905, 1662, 3239, 5270, 2534, 7200, 1772, 4810, 3297, 5273, 2956, 4817, 1968, 6296, 3398, 52 85, 2766, 4933, 3378, 4812, 1893, 6221, 2861, 5226, 3844, 4960, 1515, 5175, 2524, 6308, 322 9, 4906, 1723, 5448, 2904, 4702, 3728, 6912, 1778, 5008, 2887, 3401, 5656, 1882, 4818, 2773, 6412, 3182, 5697, 2746, 4792, 1006, 5668, 3189, 6418, 2962, 4473, 1502, 4531, 3284, 5233, 2 800, 6662, 1992, 4913, 3243, 5274, 2916, 4415, 3848, 6198, 1407, 5199, 2867, 4717, 3402, 53 89, 1934, 6227, 2862, 4908, 3298, 4580, 1839, 5228, 2487, 6201, 3621, 4526, 2000, 5698, 297 7, 4934, 3610, 6665, 2538, 5344, 1894, 4763, 3459, 7171, 2671, 4584, 1941, 5286, 3380, 4335, 2719, 6256, 1014, 5639, 3288, 4474, 2787, 5672, 3488, 6279, 1751, 4555, 2964, 5315, 3343, 4 718, 1517, 6222, 2511, 4723, 3351, 5390, 2891, 1897, 4533, 6433, 3230, 5761, 2429, 4476, 17 25, 6338, 3409, 5643, 2545, 4914, 1955, 5395, 3622, 6229, 2978, 4557, 3744, 4592, 1780, 570 0, 2869, 6420, 3190, 4765, 1884, 5411, 2774, 6666, 3404, 4775, 1523, 5179, 3651, 4820, 3009, 6202, 3612, 5289, 1755, 4937, 2920, 4725, 3461, 6312, 1017, 5680, 2540, 4447, 3245, 5234, 2 679, 7173, 1847, 4563, 3193, 5397, 2777, 6283, 1946, 4534, 3625, 5276, 2748, 4833, 3271, 62 43, 1898, 5207, 2491, 4347, 3856, 5317, 1942, 6230, 2789, 4558, 3251, 4538, 2893, 6204, 152 6, 5236, 3300, 4537, 2968, 5290, 1957, 6424, 4565, 3410, 5181, 2430, 6233, 3384, 4343, 1767, 5651, 2870, 4779, 3776, 6434, 1784, 5645, 3462, 4938, 2899, 5762, 3246, 6673, 1905, 4834, 2 778, 4995, 3626, 6668, 1018, 5401, 2546, 4766, 3653, 5398, 2928, 6340, 1518, 4879, 3465, 27 90, 1726, 5646, 3355, 7232, 2493, 4945, 3194, 5297, 1945, 4916, 2519, 6285, 3520, 5413, 152 5, 4824, 3425, 6245, 2683, 5508, 3633, 5024, 1900, 5211, 2980, 6291, 3275, 4887, 2735, 4463, 1871, 6320, 3135, 5704, 2951, 4997, 2016, 3412, 5889, 2873, 6286, 3466, 4726, 1471, 5318, 2 548, 6674, 3599, 4781, 1757, 5292, 3654, 4940, 2894, 6465, 3628, 5240, 1851, 4729, 2793, 61 75, 3253, 5321, 2874, 4807, 991, 5456, 3367, 6344, 2780, 4349, 1958, 5182, 3357, 7177, 2494, 4787, 3304, 5402, 1906, 4920, 3196, 6234, 3010, 5263, 3277, 4998, 1961, 6689, 2984, 5223, 3 254, 4782, 2523, 4836, 1987, 6436, 3715, 5298, 2901, 4946, 1771, 6466, 3634, 5414, 2915, 44 71, 3358, 6676, 1529, 5213, 3657, 4540, 2685, 5764, 3371, 6407, 1879, 4566, 2955, 5322, 342 6, 6293, 2535, 4579, 1948, 5712, 3283, 4511, 2743, 6246, 1758, 5443, 3473, 4581, 3257, 6249, 2794, 5512, 1853, 5001, 3468, 7174, 2876, 5417, 3416, 4891, 1020, 5890, 2801, 6448, 3658, 4 569, 2902, 5227, 1989, 6440, 3717, 4730, 3665, 5300, 1962, 6307, 2905, 4840, 3607, 5271, 25 52, 4948, 1908, 6236, 3312, 5329, 2847, 5056, 3278, 6191, 1530, 5404, 3167, 4961, 2303, 641 1, 3399, 5768, 1773, 4789, 3012, 6529, 3636, 5214, 2957, 4893, 1969, 5324, 3872, 6690, 2767, 5002, 3474, 5418, 1990, 6468, 3428, 4811, 2525, 5520, 3379, 7185, 1779, 4903, 2963, 5728, 3 373, 4570, 2686, 6352, 5472, 1883, 4732, 3489, 6530, 3285, 5445, 2796, 4790, 1964, 6294, 36 40, 5653, 2992, 4350, 3904, 6297, 1854, 5275, 2917, 4813, 3660, 6309, 3258, 5330, 1935, 467 1, 2539, 5425, 3718, 6250, 2747, 5009, 1007, 5667, 3476, 6199, 4894, 3299, 5420, 2802, 7178, 1895, 4907, 3968, 5229, 2906, 6472, 3666, 4475, 1663, 5304, 2526, 6680, 3490, 4793, 3374, 5 654, 1912, 4527, 3016, 6721, 3721, 4703, 2431, 4585, 6692, 1503, 5657, 3843, 4962, 2958, 62 57, 3432, 5235, 1970, 4819, 3611, 6298, 2863, 5287, 3183, 4582, 1774, 6223, 3024, 5345, 340 3, 5004, 3286, 6413, 5446, 1993, 4814, 2918, 5426, 3381, 7186, 2965, 4909, 1532, 5892, 3260, 6252, 3521, 4572, 2775, 5277, 1885, 6722, 3289, 4952, 5776, 2541, 6368, 3480, 4935, 1781, 5 449, 2921, 6310, 3681, 4821, 3668, 5230, 1994, 6663, 2749, 4794, 3623, 5237, 6696, 2979, 50 10, 3722, 5332, 1943, 6339, 3301, 4848, 2804, 5291, 3231, 7296, 1015, 4964, 2908, 5896, 349 2, 6414, 4915, 3382, 5450, 1899, 6785, 2547, 4910, 3613, 5346, 2779, 4535, 1886, 6667, 3845, 5669, 5025, 3682, 6419, 2871, 5658, 3729, 4586, 1782, 6724, 2970, 5507, 3405, 4719, 3191, 6 435, 1972, 5428, 4767, 2922, 6203, 3672, 5336, 2966, 4835, 2001, 7180, 3411, 5536, 3290, 50 12, 2550, 6313, 5391, 1947, 4559, 3440, 6704, 2981, 5399, 3724, 4939, 3302, 6258, 1996, 527 8, 4477, 2791, 6421, 3463, 5457, 3385, 4593, 1785, 6300, 2808, 5670, 3522, 5026, 6231, 2929, 5792, 1901, 4917, 3614, 6341, 3406, 5238, 2542, 4822, 3305, 7201, 5452, 1976, 5699, 2750, 6 260, 3627, 5057, 3846, 6314, 1519, 5660, 2969, 4968, 6205, 3247, 5509, 2549, 4588, 3195, 66 75, 1727, 5293, 3730, 4727, 6669, 2924, 5241, 3684, 4825, 1959, 6786, 3413, 5673, 2895, 479 6, 3849, 6425, 5319, 3040, 4539, 2002, 7233, 3292, 5904, 3386, 4837, 2495, 6422, 5299, 1019, 4941, 3496, 6670, 3467, 5348, 2781, 5016, 6321, 3745, 5458, 1907, 4478, 2875, 6437, 3655, 5 432, 3427, 4918, 6532, 1786, 5824, 2982, 6235, 3359, 5510, 3255, 4947, 2930, 7188, 5294, 15 27, 4826, 3306, 6728, 2985, 5674, 3197, 4594, 6913, 1949, 5701, 3629, 4976, 3011, 6342, 373 2, 5513, 3688, 4838, 6316, 1902, 5403, 2795, 4541, 3414, 6264, 2553, 5242, 6345, 3388, 4567, 1759, 5568, 3313, 6480, 2903, 5473, 4731, 3850, 7424, 2017, 5681, 3635, 5028, 2972, 6206, 5 323, 3417, 4783, 2782, 6426, 1909, 5183, 3524, 4999, 6287, 3469, 5460, 2877, 6247, 3475, 49 21, 1963, 5514, 6322, 3279, 4596, 3013, 5647, 3746, 6438, 2018, 5702, 4942, 3630, 7202, 298 6, 5676, 3857, 4841, 3504, 6237, 5301, 2004, 6788, 2932, 4922, 3429, 5415, 6346, 2554, 4828, 3259, 5405, 1950, 6736, 3308, 4542, 5352, 2797, 6467, 3736, 5244, 3696, 7192, 5058, 1788, 5 325, 2993, 6536, 3659, 5032, 3852, 5302, 6441, 3014, 4571, 1965, 5763, 3777, 6914, 4949, 31 98, 6251, 2803, 5682, 3314, 4963, 1991, 6324, 5406, 2907, 5705, 3637, 6295, 3470, 4733, 541 9, 2988, 7204, 1021, 5003, 3418, 6353, 5474, 3528, 4583, 2878, 6428, 1910, 5331, 4791, 3430, 6792, 3477, 5521, 2959, 6238, 3375, 5305, 4842, 1855, 6348, 3641, 5516, 2919, 4924, 6442, 3 316, 5464, 3667, 7175, 1971, 4849, 5706, 2687, 6544, 3261, 4950, 3638, 5765, 6752, 2936, 57 13, 1531, 6496, 3748, 4953, 5655, 3433, 6469, 2527, 4600, 3778, 5360, 6677, 1913, 4895, 366 1, 7297, 2994, 5326, 5215, 3287, 6299, 2798, 4351, 5447, 3858, 6354, 2008, 5060, 3719, 6449, 5684, 3017, 5005, 3420, 6691, 3491, 5920, 4815, 1775, 6444, 2556, 5522, 3478, 7234, 5476, 3 536, 4573, 2909, 6253, 5427, 1966, 5011, 3752, 6328, 3873, 5421, 6678, 2805, 4734, 3434, 55 37, 2020, 6681, 5333, 3662, 6259, 3018, 4844, 5688, 3481, 6311, 3642, 5040, 1995, 5952, 768 0, 2967, 4965, 3860, 6369, 3669, 5708, 5306, 3644, 6470, 2923, 4587, 6450, 1914, 5766, 3291, 4795, 3383, 6916, 5524, 2910, 5347, 3780, 6301, 4850, 1533, 7179, 3670, 6016, 2806, 4954, 6 800, 3673, 5714, 3723, 6473, 4574, 1973, 5538, 2996, 6254, 5422, 3493, 5064, 3864, 6261, 30 25, 5769, 6356, 3874, 4479, 1997, 5891, 7208, 3683, 5006, 2971, 6315, 3674, 5480, 5659, 348 2, 6920, 2024, 4911, 6474, 3020, 5231, 3303, 5072, 6370, 3760, 5451, 2809, 6693, 5334, 1916, 4966, 3725, 7236, 3320, 5429, 6682, 2925, 5013, 3441, 5308, 6531, 3262, 5569, 1974, 6452, 4 823, 3436, 5337, 3000, 6360, 4589, 3726, 7298, 3731, 5528, 4969, 1887, 6560, 2543, 5729, 34 07, 6415, 5716, 3552, 4797, 2751, 6423, 5671, 3387, 6302, 1783, 5027, 5770, 3293, 6481, 298 3, 5349, 7187, 3442, 4852, 3685, 5279, 6694, 3026, 4956, 1022, 6816, 5540, 3494, 5430, 3497, 6262, 4595, 3523, 6476, 2931, 5661, 4827, 2032, 6723, 3686, 5893, 7181, 3615, 5730, 2810, 4 919, 6684, 3307, 5777, 3484, 6533, 5018, 1534, 5453, 2551, 6317, 5239, 3415, 6265, 3444, 49 70, 5720, 2973, 7216, 3847, 5014, 6697, 2003, 5459, 3389, 6343, 5338, 3294, 4598, 2926, 692 8, 5488, 3498, 6323, 3525, 5029, 5772, 1977, 7182, 2783, 5350, 6372, 3309, 4839, 3631, 5511, 6482, 3905, 5433, 1787, 6456, 4856, 3041, 6848, 5570, 3876, 4977, 3784, 6534, 5662, 2933, 7 240, 3906, 5454, 4590, 1998, 6318, 3733, 5353, 6698, 2987, 4798, 3880, 6725, 5675, 3851, 58 94, 6537, 3689, 5017, 1978, 7425, 5295, 3042, 4597, 3676, 6427, 5243, 3505, 6266, 3028, 577 8, 6592, 3792, 4972, 1903, 5732, 6497, 3888, 5461, 7189, 3908, 4943, 2974, 5897, 6705, 3419, 5088, 3969, 6347, 5340, 2005, 6207, 5434, 2812, 4543, 3315, 6484, 5544, 3734, 7300, 3526, 5 515, 6538, 2989, 4829, 5793, 2006, 6671, 3390, 4923, 6726, 3747, 5703, 3015, 6700, 5475, 36 90, 5030, 6325, 3970, 5407, 1951, 7203, 5303, 3853, 6439, 2934, 4978, 5354, 3448, 6429, 503 3, 3500, 6376, 2879, 5245, 6268, 3737, 5677, 2019, 5059, 7426, 3808, 5780, 6349, 3639, 5736, 2995, 6326, 4843, 3912, 5462, 6787, 3697, 4601, 1789, 6706, 5436, 2555, 7194, 5361, 3310, 4 951, 3431, 6430, 5898, 3529, 6729, 5683, 2937, 6443, 1980, 5020, 7681, 3471, 5465, 4830, 38 59, 6498, 3663, 5572, 6355, 3032, 5517, 6545, 3750, 4925, 3506, 5523, 6329, 1911, 5327, 724 8, 2799, 5061, 3749, 6540, 5794, 3421, 6488, 5678, 3317, 5034, 2990, 6730, 5905, 2009, 6789, 5552, 3530, 7205, 3738, 4980, 5477, 3692, 6737, 4602, 3044, 6679, 3435, 5307, 6384, 3199, 5 356, 6350, 2021, 4845, 3263, 5784, 7193, 3019, 5744, 6239, 3854, 5041, 6471, 3479, 5707, 29 38, 6708, 5900, 2010, 5062, 7190, 3508, 5825, 3698, 6944, 5246, 3643, 6546, 4851, 2557, 650 0, 5362, 3537, 4955, 3753, 6451, 5685, 1967, 7304, 5518, 3318, 6445, 5036, 2997, 6561, 3779, 5466, 6357, 3422, 5576, 4926, 3671, 6712, 5478, 3021, 7428, 1915, 5525, 6976, 3740, 5007, 6 732, 3862, 5423, 5689, 3532, 6330, 3048, 4967, 7432, 3321, 5364, 6790, 3754, 5715, 6548, 20 22, 4735, 3645, 6371, 5309, 2940, 5686, 7040, 3483, 4984, 7206, 3875, 5796, 6738, 3861, 548 1, 1790, 6562, 4575, 2998, 6446, 5826, 3781, 7682, 5709, 3437, 5042, 3512, 6793, 5335, 2911, 6915, 4846, 3700, 6504, 5906, 1535, 6683, 5767, 3761, 7264, 3446, 5065, 6255, 2807, 5468, 5 539, 3495, 6475, 4604, 3538, 6358, 5526, 3865, 7235, 5584, 3056, 6453, 1023, 4957, 6332, 33 22, 5800, 6593, 3443, 5921, 4853, 3553, 7209, 5482, 2558, 6361, 5710, 3646, 6552, 3485, 506 6, 6753, 2012, 5529, 6740, 3675, 5690, 7312, 3027, 5015, 6695, 3438, 5908, 5717, 3540, 6794, 3727, 5692, 6373, 3001, 4971, 7196, 2025, 5339, 6303, 3972, 5431, 6564, 3877, 4958, 6454, 3 687, 5828, 7237, 2811, 5718, 6685, 3756, 4854, 3782, 5721, 6917, 1975, 5771, 6754, 3501, 50 44, 7210, 3022, 5541, 6801, 3866, 5912, 6477, 3324, 5073, 6263, 3445, 5922, 7684, 3677, 573 1, 6744, 3002, 5019, 6483, 2026, 5722, 3920, 6362, 5530, 3762, 5068, 7217, 3785, 5351, 6512, 2927, 5808, 6796, 3704, 4857, 6374, 3554, 5773, 7242, 1917, 5368, 6535, 3878, 4973, 6457, 3 029, 5489, 6594, 3499, 5310, 7440, 3976, 5484, 6686, 3486, 5048, 6478, 3030, 5774, 6377, 32 95, 5779, 1999, 4591, 7328, 3735, 5455, 6699, 3764, 5600, 6918, 3907, 4799, 6319, 2975, 543 5, 7688, 3691, 5341, 6267, 3544, 5031, 6802, 3527, 5490, 6756, 1918, 5733, 7456, 3043, 5074, 6485, 3868, 5542, 6921, 3881, 5545, 6364, 3786, 5571, 7696, 3793, 4979, 6458, 2813, 5734, 6 568, 3909, 5663, 6539, 2033, 4858, 7360, 3788, 5355, 6817, 3936, 5532, 6727, 3004, 4599, 64 99, 3882, 5463, 7712, 3678, 5492, 6431, 3984, 5021, 6327, 3794, 5895, 6378, 1979, 5437, 723 8, 2935, 5342, 6269, 3768, 4974, 6701, 3449, 5546, 6804, 5573, 3507, 7212, 4831, 3889, 6760, 5357, 3033, 6486, 5679, 3391, 6460, 5953, 2028, 7299, 5089, 3693, 6385, 5924, 3884, 6922, 5 832, 3045, 7249, 4981, 3556, 6707, 5954, 3502, 6489, 5781, 3910, 6596, 5035, 3739, 7218, 59 28, 2034, 6541, 5899, 3034, 6547, 5737, 6351, 3560, 5090, 7241, 3311, 5724, 6818, 3450, 555 3, 6702, 3531, 5076, 7183, 2991, 5840, 6929, 3694, 5936, 6576, 1981, 5956, 6501, 3699, 5022, 7488, 3509, 5467, 6331, 6017, 3452, 6380, 4860, 2939, 6808, 5363, 3890, 7301, 5782, 3533, 6 768, 5574, 3568, 6731, 5037, 3741, 7220, 5438, 2007, 6924, 5795, 6849, 3046, 5063, 6270, 37 51, 5738, 7191, 3796, 6018, 6386, 3913, 5901, 6709, 2814, 4982, 5496, 3701, 5548, 7302, 492 7, 3423, 6542, 5785, 3539, 6490, 5856, 1982, 6600, 5687, 3510, 7552, 5043, 2559, 6502, 5960, 6549, 3809, 5745, 7244, 3323, 4603, 6447, 3534, 5358, 6713, 3514, 5479, 6388, 3513, 5577, 7 305, 4985, 2011, 6739, 5519, 3036, 6333, 5907, 3541, 7250, 5711, 3319, 6710, 5080, 3755, 68 20, 5798, 6505, 3914, 5554, 7224, 3049, 4847, 6850, 3810, 5797, 6733, 3971, 5469, 7195, 536 5, 3742, 6359, 5038, 2036, 6930, 5578, 3855, 6791, 5786, 2999, 7265, 5740, 6492, 3921, 5092, 6563, 3892, 5483, 7207, 3800, 5247, 6550, 5311, 4000, 6608, 5067, 3050, 6824, 5902, 3863, 7 427, 5527, 2023, 6945, 4986, 6506, 3439, 5556, 7252, 3973, 5746, 6734, 3702, 5691, 6553, 46 05, 3757, 7306, 5585, 2941, 6714, 5801, 3916, 6932, 5366, 6741, 3705, 5045, 7313, 3783, 582 7, 6716, 2040, 5470, 6363, 5719, 3325, 7429, 5069, 3023, 6455, 5788, 3763, 6852, 5910, 7197, 3896, 5580, 6742, 3974, 5096, 6745, 5369, 3758, 7211, 5802, 2942, 6795, 5693, 3812, 6565, 4 988, 6936, 3922, 5531, 7266, 1791, 5923, 6946, 3447, 5909, 6755, 5046, 3516, 7683, 5829, 35 42, 6746, 5485, 6554, 3057, 5560, 7256, 3555, 4959, 6375, 3487, 6832, 5748, 7308, 3557, 580 9, 6797, 3977, 5494, 6392, 4855, 3867, 7198, 5543, 2013, 6513, 5586, 6334, 3003, 5913, 6508, 3545, 5104, 7314, 3706, 5370, 6798, 5491, 3816, 6803, 5601, 3924, 7239, 4606, 6479, 4032, 5 694, 6624, 3052, 7430, 5533, 6459, 3937, 5723, 6365, 3765, 5075, 7433, 5486, 2027, 6514, 55 88, 3869, 6757, 5775, 7329, 3978, 5049, 6566, 3058, 6020, 6569, 5925, 3787, 7744, 5735, 387 9, 6595, 6758, 4859, 3546, 7213, 5804, 3708, 6687, 5830, 6379, 3766, 5549, 7268, 3005, 5070, 6556, 5914, 2014, 6487, 5372, 3326, 6516, 5493, 7808, 3789, 6919, 5725, 6461, 3647, 5050, 7 219, 3985, 5968, 6366, 5810, 3870, 6570, 5833, 3031, 7316, 4975, 6597, 3883, 5752, 6381, 34 51, 7214, 5602, 6703, 3769, 5926, 6977, 5077, 3503, 7243, 5547, 2029, 6948, 6024, 6856, 367 9, 5534, 7434, 3561, 6978, 5078, 6805, 3006, 5343, 7441, 5783, 3938, 6952, 5812, 3795, 6923, 5955, 7685, 3558, 5023, 6761, 3980, 7272, 5739, 6748, 3790, 5592, 6577, 5575, 3035, 7330, 5 091, 3885, 6864, 5916, 6960, 1983, 5929, 7221, 6980, 3548, 5834, 6491, 3928, 5841, 7361, 48 61, 3911, 7041, 5957, 6387, 3797, 7320, 5836, 3060, 6806, 5984, 6598, 3770, 5052, 7245, 593 0, 3986, 6462, 5726, 6819, 3824, 7332, 6032, 3940, 6762, 5842, 7042, 3891, 4983, 7936, 5816, 2035, 6925, 5497, 3886, 6520, 7436, 5555, 3047, 6572, 5937, 7442, 3511, 5081, 6809, 5439, 4 001, 6880, 7686, 5741, 3562, 6711, 5932, 3695, 6984, 5093, 7222, 3743, 5604, 6769, 6382, 38 11, 5550, 7251, 5958, 3064, 6503, 5787, 3988, 6601, 5082, 7225, 3535, 6543, 5608, 6931, 203 7, 5359, 7689, 5498, 3915, 6735, 7280, 5579, 3453, 6822, 5039, 3569, 6578, 5742, 7303, 2815, 5747, 6821, 6493, 4002, 5557, 7246, 5500, 3893, 6389, 4987, 6602, 3798, 7457, 5938, 6810, 4 033, 5581, 7362, 5616, 3944, 6764, 5789, 3564, 6507, 7253, 5094, 3703, 6271, 5799, 6335, 19 19, 5844, 7444, 6926, 3037, 5961, 7690, 4862, 3801, 6551, 5749, 6580, 3772, 7226, 5471, 677 0, 3515, 5587, 6715, 5558, 3813, 7336, 6609, 4607, 3917, 7307, 5857, 6825, 3992, 5371, 6390, 7267, 3051, 5582, 6851, 5562, 3454, 6494, 5561, 7254, 3894, 6743, 5084, 7228, 3923, 5589, 6 812, 5367, 3802, 6934, 7448, 5803, 2030, 6604, 5962, 6393, 3570, 7257, 5097, 6826, 3952, 58 58, 7458, 6019, 3038, 6717, 6555, 5790, 3814, 7697, 5903, 6947, 3517, 5047, 6933, 7692, 354 3, 5969, 6853, 5940, 3707, 7364, 6509, 5848, 4004, 6584, 6048, 7309, 3759, 5098, 6772, 7269, 3975, 5911, 6833, 5487, 3053, 6518, 7315, 6021, 3897, 6567, 5750, 6610, 2038, 5805, 7344, 6 937, 3572, 4989, 7310, 5964, 3918, 6394, 6515, 5753, 3817, 7698, 5831, 6625, 7489, 3898, 53 73, 6718, 5071, 3804, 6557, 5811, 7199, 3518, 6747, 5944, 7368, 3007, 6022, 6510, 6612, 403 4, 5806, 7258, 4990, 4008, 6799, 7713, 5860, 3547, 7044, 5970, 6949, 7460, 3925, 5495, 6759, 5564, 3939, 7490, 6828, 5590, 2041, 6854, 5105, 7700, 3709, 6573, 5603, 7431, 5535, 3979, 6 938, 6396, 5605, 3059, 7317, 6025, 6517, 3559, 7270, 5915, 6749, 3767, 5051, 6992, 7273, 55 93, 3818, 6834, 5754, 7472, 3900, 6857, 5864, 7464, 3825, 5972, 6776, 6626, 3926, 6080, 733 1, 5100, 6950, 3929, 7260, 5985, 6571, 3061, 5813, 7048, 7215, 3576, 5917, 6558, 6026, 7435, 3871, 6367, 5106, 6807, 3327, 5835, 7553, 6836, 2042, 5927, 7714, 6979, 5594, 4036, 7492, 5 756, 6763, 3981, 6616, 5814, 7376, 3791, 5053, 6599, 7554, 5374, 3549, 6940, 5837, 6953, 39 87, 7318, 5695, 6858, 7321, 2943, 6033, 6865, 5918, 3710, 7333, 6981, 5079, 3820, 6860, 593 1, 7274, 7008, 4016, 5499, 7223, 6954, 3941, 5817, 7496, 5551, 6750, 3563, 7056, 5727, 7704, 3771, 5609, 6866, 7745, 5054, 3826, 6840, 7716, 5986, 3930, 6521, 5843, 6579, 7281, 2015, 5 606, 6961, 7322, 3054, 6028, 6463, 5838, 7247, 3550, 6765, 5083, 7437, 4040, 6956, 5933, 66 28, 5596, 3455, 7276, 6574, 5976, 7746, 3982, 6982, 5959, 7392, 3887, 5845, 6811, 6632, 510 8, 4048, 7334, 6383, 5818, 3942, 7687, 6034, 6522, 7720, 3989, 5872, 6603, 7363, 5988, 3062, 6766, 5939, 6771, 3799, 7438, 5934, 6581, 7809, 3565, 5095, 6524, 5559, 3945, 7691, 6962, 6 049, 7443, 3773, 6605, 5610, 6640, 7748, 4003, 5743, 6813, 5791, 7459, 2044, 6823, 5859, 72 27, 3828, 6868, 5112, 7337, 6985, 3932, 6036, 6773, 5583, 7728, 3571, 6495, 5963, 7282, 380 3, 6611, 5501, 7445, 6582, 3065, 5617, 7324, 6881, 4863, 3895, 7255, 6050, 6395, 7365, 3994, 5941, 6606, 6586, 5846, 3946, 7284, 6585, 6081, 3990, 7338, 5992, 6613, 7229, 3574, 5612, 6 391, 7699, 5751, 4005, 6827, 7693, 5085, 6986, 3815, 7810, 5849, 6882, 7043, 3832, 5820, 74 49, 5563, 6814, 3953, 7446, 5861, 6927, 7694, 3066, 5965, 6993, 7345, 6040, 3566, 6964, 746 1, 5099, 2031, 6872, 7556, 5502, 7072, 3774, 7259, 5942, 6935, 5971, 3993, 6511, 7752, 5850, 7045, 3573, 7937, 5618, 6774, 7366, 3948, 6000, 6829, 7340, 5086, 3919, 6988, 7288, 5862, 6 777, 4064, 7369, 5565, 6855, 7504, 3519, 5591, 6397, 7230, 5755, 3805, 6835, 7450, 6052, 69 68, 3899, 7311, 5807, 7046, 7271, 6023, 3039, 6830, 5101, 6884, 7346, 4006, 5945, 6994, 746 2, 5620, 3954, 6519, 7261, 5966, 6588, 4009, 7812, 5865, 6614, 7370, 4035, 5946, 6627, 7760, 5852, 3819, 6559, 7491, 5566, 6629, 3577, 7560, 5055, 7049, 7465, 6082, 3927, 6939, 7938, 6 056, 6617, 2039, 7275, 5595, 6778, 7348, 3996, 5973, 6888, 7319, 5987, 3806, 6996, 7377, 71 04, 5757, 7452, 3901, 7009, 6027, 7816, 6837, 3068, 5107, 7262, 6941, 5607, 4037, 7372, 705 0, 5815, 7466, 6859, 4010, 5866, 7568, 6951, 5948, 3956, 7776, 6618, 5873, 7520, 3578, 6780, 5974, 7493, 6838, 5977, 3821, 7701, 6398, 5109, 7323, 4017, 6861, 5624, 7378, 6719, 4038, 7 473, 5919, 7057, 7715, 5375, 3827, 6942, 7468, 6084, 6955, 3931, 7277, 6029, 6523, 7352, 58 39, 4012, 6841, 7702, 5597, 6575, 3902, 6751, 6633, 6035, 7705, 7010, 3983, 4991, 7283, 686 7, 5758, 3055, 7335, 6630, 5868, 7393, 7052, 3943, 6064, 7494, 6862, 7474, 3711, 5989, 6957, 7940, 5611, 6620, 3960, 7325, 5819, 7000, 7824, 5874, 2043, 6983, 7497, 5978, 6869, 3551, 7 278, 6842, 5102, 7285, 7058, 4018, 5598, 7380, 6896, 6088, 7339, 3822, 7012, 7944, 5503, 69 63, 4041, 7498, 6030, 6958, 7394, 5935, 3580, 6583, 7717, 6096, 7073, 7706, 3933, 6634, 599 0, 7555, 6767, 6037, 3829, 7476, 6815, 5110, 7384, 6883, 4042, 7584, 5847, 7060, 7439, 3991, 5613, 6607, 7447, 6987, 5993, 3063, 7326, 6525, 5821, 7505, 6641, 3947, 6051, 7718, 7074, 7 840, 5876, 3934, 6965, 7286, 5980, 6870, 7500, 3830, 5619, 7747, 7105, 7708, 5851, 4020, 70 16, 7557, 5113, 6636, 7341, 4049, 6775, 5943, 7289, 6873, 6042, 3995, 7721, 6844, 7367, 599 4, 6587, 4044, 7952, 6038, 6885, 7347, 6989, 3833, 5622, 7396, 7064, 6053, 7506, 3949, 6526, 7480, 5863, 6966, 7872, 4024, 5880, 7558, 6995, 7342, 6001, 3567, 6874, 7722, 5114, 6642, 7 749, 2045, 7024, 5614, 7561, 6886, 5822, 7451, 3775, 6589, 7290, 6041, 6615, 7616, 4007, 56 21, 7521, 6779, 7729, 5996, 4050, 7076, 7371, 6831, 5967, 7231, 3067, 7047, 6112, 7508, 696 9, 7562, 5567, 3955, 6644, 7695, 5853, 7750, 6990, 3834, 7724, 5947, 6889, 7349, 6970, 5087, 3575, 7463, 6876, 6054, 7453, 6590, 3997, 7400, 6002, 7292, 7106, 7373, 3950, 6057, 7080, 7 350, 6619, 6083, 7811, 3807, 6997, 5867, 7730, 7011, 7454, 4065, 5625, 7753, 6781, 7467, 59 75, 7051, 3957, 7522, 6631, 6044, 7379, 6839, 4011, 5854, 7569, 7353, 6890, 5949, 7564, 406 6, 6972, 7512, 5116, 6897, 7754, 6998, 4052, 6085, 7813, 7761, 6058, 7001, 3998, 7703, 6648, 6004, 7408, 6943, 7374, 3836, 5626, 7263, 6399, 7495, 5869, 7108, 4013, 7732, 7053, 6065, 7 968, 6863, 7570, 4039, 6086, 7524, 6621, 7475, 5875, 7059, 3069, 7469, 6782, 5979, 7585, 73 81, 3958, 6892, 6060, 7736, 7088, 8000, 5950, 3903, 7013, 7756, 7354, 6031, 6635, 7814, 401 9, 6843, 5103, 7572, 7395, 6898, 5991, 3579, 8064, 7002, 7762, 5759, 6622, 7586, 3961, 7470, 6008, 7112, 7817, 6527, 5599, 7939, 2046, 7054, 7528, 6066, 7707, 6959, 7279, 4056, 5870, 7 120, 7499, 7382, 6089, 7014, 3823, 7477, 7061, 5628, 7356, 7617, 6871, 4014, 5981, 7385, 66 37, 7576, 5877, 7017, 4068, 7777, 7764, 6090, 6845, 7719, 7075, 7818, 4043, 6039, 7397, 690 0, 7327, 5111, 7004, 3962, 7588, 7478, 5995, 6643, 7709, 6875, 3581, 5982, 7941, 7778, 6967, 7825, 5878, 7066, 4021, 7501, 7287, 6068, 7018, 7768, 7062, 4045, 6097, 7507, 7386, 6646, 6 043, 7536, 7077, 4072, 7820, 7398, 6092, 6887, 7559, 7481, 5881, 3964, 6904, 7618, 7025, 59 97, 7710, 7502, 4022, 6638, 7401, 6072, 6846, 7723, 7942, 5615, 3935, 7065, 7343, 6645, 729 1, 5823, 7826, 7020, 3831, 7780, 6055, 7509, 6991, 7945, 7136, 6098, 3070, 7388, 7482, 6591, 5115, 7592, 7563, 6877, 4080, 7841, 6003, 6971, 7751, 7523, 5882, 7078, 3582, 7455, 7351, 7 026, 5623, 7402, 7081, 7293, 4051, 6045, 7725, 7107, 7828, 7784, 5998, 6891, 4025, 7510, 66 49, 7484, 5855, 7409, 6999, 7946, 3835, 6113, 7731, 7068, 7513, 6878, 6005, 7620, 4046, 756 5, 6973, 7571, 6059, 7375, 7109, 7842, 4026, 6114, 7726, 7082, 7953, 7600, 6100, 7028, 7525, 3951, 6650, 7355, 6046, 7404, 6893, 7832, 7792, 4053, 5884, 7089, 7755, 7948, 7110, 6061, 7 873, 7294, 4054, 6899, 7410, 6087, 7003, 7733, 7566, 7084, 3999, 5117, 7514, 7624, 6974, 60 06, 7526, 7573, 7055, 4067, 7471, 5951, 7737, 7015, 7412, 7763, 6067, 6783, 3837, 7357, 773 4, 7032, 5627, 7844, 7529, 6623, 4028, 7874, 6009, 7757, 7090, 7383, 6894, 7954, 6104, 3959, 7815, 7113, 7516, 7587, 5871, 6652, 7574, 7632, 4057, 7005, 6062, 7848, 7969, 6901, 7530, 6 116, 7758, 7114, 4069, 7577, 7738, 6091, 7063, 7956, 7765, 7740, 7019, 2047, 6010, 7387, 74 79, 7006, 7876, 5629, 7766, 6902, 4058, 7769, 7819, 6069, 7092, 7589, 7960, 7121, 7970, 401 5, 6093, 7779, 7067, 7770, 7578, 6120, 7116, 7399, 7856, 3963, 6905, 6012, 7821, 7416, 7021, 7537, 7358, 6070, 4070, 7532, 7096, 7822, 7827, 5983, 6639, 7503, 7648, 6847, 3838, 7483, 5 879, 7389, 7079, 7538, 7781, 7122, 5118, 7590, 3583, 7593, 7619, 7027, 6128, 7782, 7711, 69 06, 7403, 7580, 3071, 5630, 6647, 7511, 7540, 7069, 7943, 6099, 7485, 7390, 4060, 7022, 759 4, 7621, 6073, 6879, 7405, 7727, 8001, 5883, 4073, 7137, 7972, 7880, 7029, 8002, 6094, 7829, 7083, 7976, 4023, 7947, 7785, 6074, 7138, 7772, 7601, 7124, 7888, 5999, 7984, 4074, 8004, 7 070, 7515, 8065, 6101, 6908, 7411, 7830, 7622, 7085, 3965, 6102, 7486, 7843, 7111, 7786, 80 66, 6047, 7949, 7030, 4047, 7544, 7596, 6975, 7833, 6115, 7904, 7735, 7091, 8008, 7793, 396 6, 5885, 6651, 7406, 7527, 7625, 7033, 6076, 7567, 7955, 7759, 4081, 7128, 7846, 7602, 6007, 6895, 7845, 7517, 7413, 7086, 6105, 4027, 7626, 7834, 7788, 7140, 7531, 7295, 6117, 7359, 7 115, 7950, 7575, 4076, 7034, 6106, 7604, 7794, 7739, 6653, 7633, 7849, 6063, 7414, 4082, 70 93, 7875, 7518, 7767, 7117, 6011, 7836, 7958, 7628, 7144, 7417, 4029, 7850, 6118, 7741, 703 6, 7579, 7971, 7957, 5886, 7094, 7877, 7533, 4055, 7608, 7007, 7796, 5631, 7857, 7542, 6903, 7591, 7634, 7961, 7152, 4030, 5119, 7418, 7539, 7649, 6654, 7742, 7581, 6108, 7771, 7123, 7 534, 7636, 4059, 7823, 7097, 6121, 8068, 7973, 7783, 6907, 7852, 7878, 6071, 7597, 7118, 40 84, 7962, 7420, 7541, 7773, 7098, 6122, 8016, 7858, 7881, 7023, 7800, 4071, 7650, 6013, 797 4, 7125, 7595, 8072, 7582, 7126, 7391, 6095, 7831, 7860, 8003, 4088, 7071, 7787, 7640, 7623, 6014, 7139, 7964, 7977, 7882, 7889, 6909, 8005, 3839, 6129, 7884, 8032, 7100, 7978, 7774, 8 080, 7890, 6075, 7031, 7864, 7545, 7603, 4061, 7985, 7129, 7487, 6124, 7789, 7980, 7141, 76 52, 7598, 8006, 7835, 6130, 7130, 4075, 7656, 7407, 7546, 7627, 7087, 7790, 6077, 7795, 760 5, 7548, 7035, 7986, 7629, 7664, 4062, 7837, 6103, 7142, 7847, 7892, 8009, 6910, 7797, 7519, 7635, 6078, 7606, 6655, 4077, 7905, 7419, 7630, 7610, 7609, 6107, 7132, 7637, 7415, 7851, 8 010, 7145, 7906, 8067, 7838, 4031, 6132, 7951, 7095, 8017, 7988, 7896, 8096, 7146, 7959, 61 19, 7535, 8069, 7798, 7853, 7037, 4083, 8012, 7801, 7879, 6136, 7421, 7119, 7859, 7992, 807 0, 7854, 7038, 7908, 8018, 5887, 7543, 4085, 7612, 7638, 7153, 7651, 7583, 7653, 8073, 7963, 6109, 7099, 7641, 7802, 7912, 8020, 8128, 7148, 3967, 8033, 7861, 6123, 7965, 8074, 7154, 7 883, 7975, 7642, 7804, 7862, 7101, 6110, 7422, 7885, 7743, 4078, 8081, 7966, 7127, 7979, 75 47, 7865, 7599, 6125, 7775, 7657, 7102, 8034, 7891, 7654, 8076, 7886, 7131, 4086, 7981, 607 9, 7644, 8024, 8007, 7893, 7156, 7866, 8082, 7920, 8036, 7987, 6131, 7982, 7143, 7607, 8097, 7658, 4089, 7791, 7839, 7907, 7160, 8084, 7631, 6133, 8011, 7549, 7665, 6911, 8098, 7989, 7 894, 8129, 8040, 7660, 7799, 6015, 4090, 7133, 7897, 7868, 7611, 7909, 8013, 8088, 7147, 75 50, 7990, 8019, 7898, 6126, 7666, 8048, 7134, 7910, 7613, 7639, 7803, 4063, 8100, 7855, 807 1, 7149, 7993, 6134, 7668, 8014, 7913, 7994, 7900, 7614, 7103, 8130, 8104, 7643, 8021, 8035, 6137, 7805, 4092, 8075, 7155, 7655, 7863, 7914, 7996, 7921, 8022, 8025, 7157, 7672, 7967, 7 423, 6138, 8132, 8077, 7887, 7645, 8083, 7039, 7806, 7916, 8112, 4079, 8037, 7659, 7867, 79 22, 8026, 6111, 7150, 7646, 8136, 7551, 8078, 7983, 8144, 8038, 8085, 7158, 7895, 7661, 804 1, 7869, 8099, 6140, 7924, 8028, 4087, 7667, 7899, 7161, 7991, 8090, 8042, 8086, 7670, 8101, 7911, 7928, 8049, 7162, 7662, 6127, 7870, 8089, 7669, 8044, 8015, 8160, 7615, 7901, 7995, 7 135, 8102, 4091, 8050, 8105, 8131, 7915, 7673, 8023, 6135, 8092, 7902, 7997, 7164, 8133, 81 06, 8052, 7674, 7917, 8113, 8134, 7923, 8027, 8108, 7998, 8079, 7151, 8039, 7807, 8056, 613 9, 7647, 8114, 4093, 7918, 8137, 7676, 8029, 7925, 8138, 8087, 7159, 8043, 8030, 7926, 8116, 8145, 8091, 8140, 7929, 8045, 8120, 7663, 6141, 7871, 8103, 8146, 7163, 8051, 7930, 7671, 8 093, 8046, 7903, 8161, 8053, 8107, 4094, 8162, 8148, 8094, 7932, 8109, 8135, 7165, 8054, 79 99, 8115, 7675, 8057, 6142, 8152, 7919, 8110, 8164, 8139, 8058, 7677, 8117, 8141, 8168, 806 0, 8118, 8031, 7927, 7166, 8176, 7678, 8147, 8121, 7931, 8142, 8122, 8047, 8149, 8150, 8095, 4095, 8163, 7933, 8124, 8055, 8153, 8165, 6143, 8154, 8111, 8059, 8166, 7934, 7679, 7167, 8 156, 8169, 8119, 8170, 8061, 8143, 8062, 8177, 8123, 8172, 8178, 8125, 8151, 8126, 8155, 81 80, 8167, 8184, 7935, 8157, 8171, 8158, 8173, 8127, 8179, 8181, 8063, 8174, 8182, 8185, 818 6, 8159, 8188, 8175, 8183, 8187, 8189, 8190, 8191];

TABLE Q1 with a sequence length of 8192:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 1024 |
| 11 | 2048 |
| 12 | 4096 |
| 13 | 9 |
| 14 | 6 |
| 15 | 17 |
| 16 | 10 |
| 17 | 18 |
| 18 | 128 |
| 19 | 12 |
| 20 | 33 |
| 21 | 65 |
| 22 | 20 |
| 23 | 256 |
| 24 | 34 |
| 25 | 24 |
| 26 | 36 |
| 27 | 7 |
| 28 | 129 |

TABLE Q1-continued with a sequence length of 8192:

| Reliability or reliability sequence number | Polarized channel sequence number |
|---|---|
| 29 | 66 |
| 30 | 512 |
| 31 | 11 |
| 32 | 40 |
| 33 | 68 |
| 34 | 130 |
| 35 | 19 |
| 36 | 13 |
| 37 | 48 |
| 38 | 14 |
| 39 | 72 |
| 40 | 257 |
| 41 | 1025 |
| 42 | 21 |
| 43 | 132 |
| 44 | 35 |
| 45 | 258 |
| 46 | 26 |
| 47 | 2049 |
| 48 | 513 |
| 49 | 80 |
| 50 | 37 |
| 51 | 25 |
| 52 | 22 |
| 53 | 4097 |
| 54 | 136 |
| 55 | 260 |
| 56 | 264 |
| 57 | 38 |
| 58 | 514 |
| 59 | 96 |
| 60 | 67 |
| 61 | 41 |
| 62 | 144 |
| 63 | 28 |
| 64 | 69 |
| 65 | 42 |
| 66 | 516 |
| 67 | 49 |
| 68 | 1026 |
| 69 | 74 |
| 70 | 272 |
| 71 | 160 |
| 72 | 520 |
| 73 | 288 |
| 74 | 528 |
| 75 | 192 |
| 76 | 544 |
| 77 | 70 |
| 78 | 44 |
| 79 | 131 |
| 80 | 81 |
| 81 | 2050 |
| 82 | 50 |
| 83 | 73 |
| 84 | 15 |
| 85 | 320 |
| 86 | 133 |
| 87 | 52 |
| 88 | 1028 |
| 89 | 23 |
| 90 | 134 |
| 91 | 384 |
| 92 | 76 |
| 93 | 4098 |
| 94 | 137 |
| 95 | 82 |
| 96 | 56 |
| 97 | 27 |
| 98 | 97 |
| 99 | 39 |
| 100 | 259 |
| 101 | 84 |
| 102 | 138 |
| 103 | 145 |

TABLE Q1-continued with a sequence length of 8192:

| Reliability or reliability sequence number | Polarized channel sequence number |
|---|---|
| 104 | 261 |
| 105 | 1032 |
| 106 | 29 |
| 107 | 43 |
| 108 | 2052 |
| 109 | 98 |
| 110 | 515 |
| 111 | 88 |
| 112 | 140 |
| 113 | 30 |
| 114 | 146 |
| 115 | 71 |
| 116 | 262 |
| 117 | 265 |
| 118 | 161 |
| 119 | 576 |
| 120 | 45 |
| 121 | 1040 |
| 122 | 100 |
| 123 | 640 |
| 124 | 51 |
| 125 | 148 |
| 126 | 46 |
| 127 | 75 |
| 128 | 4100 |
| 129 | 266 |
| 130 | 273 |
| 131 | 517 |
| 132 | 2056 |
| 133 | 104 |
| 134 | 162 |
| 135 | 53 |
| 136 | 193 |
| 137 | 1056 |
| 138 | 152 |
| 139 | 77 |
| 140 | 164 |
| 141 | 768 |
| 142 | 268 |
| 143 | 274 |
| 144 | 518 |
| 145 | 54 |
| 146 | 83 |
| 147 | 57 |
| 148 | 521 |
| 149 | 1027 |
| 150 | 112 |
| 151 | 135 |
| 152 | 2064 |
| 153 | 78 |
| 154 | 289 |
| 155 | 194 |
| 156 | 85 |
| 157 | 276 |
| 158 | 4104 |
| 159 | 522 |
| 160 | 58 |
| 161 | 168 |
| 162 | 1029 |
| 163 | 139 |
| 164 | 99 |
| 165 | 86 |
| 166 | 60 |
| 167 | 280 |
| 168 | 89 |
| 169 | 290 |
| 170 | 529 |
| 171 | 2080 |
| 172 | 524 |
| 173 | 196 |
| 174 | 1088 |
| 175 | 141 |
| 176 | 101 |
| 177 | 147 |
| 178 | 176 |

TABLE Q1-continued

| with a sequence length of 8192: | |
|---|---|
| Reliability or reliability sequence number | Polarized channel sequence number |
| 179 | 142 |
| 180 | 530 |
| 181 | 321 |
| 182 | 31 |
| 183 | 200 |
| 184 | 1033 |
| 185 | 4112 |
| 186 | 90 |
| 187 | 545 |
| 188 | 292 |
| 189 | 2051 |
| 190 | 322 |
| 191 | 532 |
| 192 | 263 |
| 193 | 149 |
| 194 | 102 |
| 195 | 105 |
| 196 | 1030 |
| 197 | 304 |
| 198 | 296 |
| 199 | 163 |
| 200 | 92 |
| 201 | 47 |
| 202 | 267 |
| 203 | 385 |
| 204 | 546 |
| 205 | 2053 |
| 206 | 324 |
| 207 | 1041 |
| 208 | 208 |
| 209 | 386 |
| 210 | 4128 |
| 211 | 150 |
| 212 | 153 |
| 213 | 165 |
| 214 | 106 |
| 215 | 55 |
| 216 | 1034 |
| 217 | 328 |
| 218 | 536 |
| 219 | 577 |
| 220 | 548 |
| 221 | 2112 |
| 222 | 113 |
| 223 | 154 |
| 224 | 79 |
| 225 | 269 |
| 226 | 1042 |
| 227 | 108 |
| 228 | 578 |
| 229 | 224 |
| 230 | 166 |
| 231 | 519 |
| 232 | 552 |
| 233 | 195 |
| 234 | 4099 |
| 235 | 1152 |
| 236 | 270 |
| 237 | 3072 |
| 238 | 641 |
| 239 | 523 |
| 240 | 275 |
| 241 | 580 |
| 242 | 291 |
| 243 | 59 |
| 244 | 1036 |
| 245 | 169 |
| 246 | 560 |
| 247 | 114 |
| 248 | 277 |
| 249 | 156 |
| 250 | 2057 |
| 251 | 87 |
| 252 | 197 |
| 253 | 1057 |

TABLE Q1-continued

| with a sequence length of 8192: | |
|---|---|
| Reliability or reliability sequence number | Polarized channel sequence number |
| 254 | 116 |
| 255 | 170 |
| 256 | 4101 |
| 257 | 61 |
| 258 | 531 |
| 259 | 525 |
| 260 | 642 |
| 261 | 281 |
| 262 | 1089 |
| 263 | 278 |
| 264 | 526 |
| 265 | 2054 |
| 266 | 177 |
| 267 | 293 |
| 268 | 388 |
| 269 | 91 |
| 270 | 1044 |
| 271 | 584 |
| 272 | 769 |
| 273 | 198 |
| 274 | 172 |
| 275 | 120 |
| 276 | 4160 |
| 277 | 201 |
| 278 | 2065 |
| 279 | 336 |
| 280 | 1280 |
| 281 | 62 |
| 282 | 282 |
| 283 | 143 |
| 284 | 103 |
| 285 | 178 |
| 286 | 294 |
| 287 | 1058 |
| 288 | 93 |
| 289 | 644 |
| 290 | 2058 |
| 291 | 202 |
| 292 | 592 |
| 293 | 323 |
| 294 | 1048 |
| 295 | 392 |
| 296 | 5120 |
| 297 | 297 |
| 298 | 770 |
| 299 | 107 |
| 300 | 180 |
| 301 | 151 |
| 302 | 1060 |
| 303 | 2066 |
| 304 | 209 |
| 305 | 284 |
| 306 | 648 |
| 307 | 94 |
| 308 | 204 |
| 309 | 298 |
| 310 | 1031 |
| 311 | 400 |
| 312 | 608 |
| 313 | 352 |
| 314 | 2176 |
| 315 | 6144 |
| 316 | 325 |
| 317 | 533 |
| 318 | 1153 |
| 319 | 155 |
| 320 | 210 |
| 321 | 305 |
| 322 | 547 |
| 323 | 300 |
| 324 | 1090 |
| 325 | 109 |
| 326 | 2060 |
| 327 | 184 |
| 328 | 534 |

TABLE Q1-continued

| with a sequence length of 8192: | |
|---|---|
| Reliability or reliability sequence number | Polarized channel sequence number |
| 329 | 537 |
| 330 | 115 |
| 331 | 167 |
| 332 | 1536 |
| 333 | 4105 |
| 334 | 225 |
| 335 | 326 |
| 336 | 306 |
| 337 | 772 |
| 338 | 2081 |
| 339 | 157 |
| 340 | 1035 |
| 341 | 656 |
| 342 | 329 |
| 343 | 110 |
| 344 | 117 |
| 345 | 212 |
| 346 | 1064 |
| 347 | 171 |
| 348 | 2113 |
| 349 | 776 |
| 350 | 4102 |
| 351 | 330 |
| 352 | 226 |
| 353 | 549 |
| 354 | 1092 |
| 355 | 538 |
| 356 | 387 |
| 357 | 308 |
| 358 | 216 |
| 359 | 2068 |
| 360 | 1154 |
| 361 | 416 |
| 362 | 271 |
| 363 | 279 |
| 364 | 158 |
| 365 | 337 |
| 366 | 1043 |
| 367 | 4113 |
| 368 | 550 |
| 369 | 672 |
| 370 | 2304 |
| 371 | 118 |
| 372 | 332 |
| 373 | 579 |
| 374 | 1037 |
| 375 | 540 |
| 376 | 389 |
| 377 | 173 |
| 378 | 121 |
| 379 | 1072 |
| 380 | 2082 |
| 381 | 553 |
| 382 | 199 |
| 383 | 784 |
| 384 | 4106 |
| 385 | 179 |
| 386 | 1038 |
| 387 | 228 |
| 388 | 338 |
| 389 | 312 |
| 390 | 2072 |
| 391 | 704 |
| 392 | 390 |
| 393 | 1096 |
| 394 | 174 |
| 395 | 554 |
| 396 | 581 |
| 397 | 393 |
| 398 | 1281 |
| 399 | 4114 |
| 400 | 283 |
| 401 | 2084 |
| 402 | 122 |
| 403 | 448 |

TABLE Q1-continued

| with a sequence length of 8192: | |
|---|---|
| Reliability or reliability sequence number | Polarized channel sequence number |
| 404 | 353 |
| 405 | 1045 |
| 406 | 561 |
| 407 | 203 |
| 408 | 63 |
| 409 | 340 |
| 410 | 2055 |
| 411 | 1156 |
| 412 | 394 |
| 413 | 527 |
| 414 | 582 |
| 415 | 4224 |
| 416 | 556 |
| 417 | 181 |
| 418 | 1059 |
| 419 | 2177 |
| 420 | 295 |
| 421 | 285 |
| 422 | 232 |
| 423 | 124 |
| 424 | 1282 |
| 425 | 205 |
| 426 | 182 |
| 427 | 643 |
| 428 | 2114 |
| 429 | 4108 |
| 430 | 562 |
| 431 | 1050 |
| 432 | 286 |
| 433 | 585 |
| 434 | 299 |
| 435 | 1537 |
| 436 | 354 |
| 437 | 211 |
| 438 | 2560 |
| 439 | 401 |
| 440 | 185 |
| 441 | 1104 |
| 442 | 396 |
| 443 | 344 |
| 444 | 4129 |
| 445 | 586 |
| 446 | 645 |
| 447 | 2059 |
| 448 | 1061 |
| 449 | 593 |
| 450 | 535 |
| 451 | 240 |
| 452 | 206 |
| 453 | 1049 |
| 454 | 95 |
| 455 | 2088 |
| 456 | 327 |
| 457 | 564 |
| 458 | 4161 |
| 459 | 1046 |
| 460 | 800 |
| 461 | 402 |
| 462 | 356 |
| 463 | 307 |
| 464 | 2116 |
| 465 | 1160 |
| 466 | 301 |
| 467 | 417 |
| 468 | 213 |
| 469 | 568 |
| 470 | 1284 |
| 471 | 832 |
| 472 | 4116 |
| 473 | 2178 |
| 474 | 588 |
| 475 | 186 |
| 476 | 1288 |
| 477 | 646 |
| 478 | 404 |

TABLE Q1-continued

| with a sequence length of 8192: | |
|---|---|
| Reliability or reliability sequence number | Polarized channel sequence number |
| 479 | 227 |
| 480 | 896 |
| 481 | 2067 |
| 482 | 1062 |
| 483 | 594 |
| 484 | 418 |
| 485 | 4352 |
| 486 | 302 |
| 487 | 1538 |
| 488 | 649 |
| 489 | 771 |
| 490 | 2061 |
| 491 | 360 |
| 492 | 539 |
| 493 | 1120 |
| 494 | 111 |
| 495 | 331 |
| 496 | 214 |
| 497 | 1091 |
| 498 | 2096 |
| 499 | 4130 |
| 500 | 309 |
| 501 | 188 |
| 502 | 449 |
| 503 | 1065 |
| 504 | 217 |
| 505 | 408 |
| 506 | 2062 |
| 507 | 609 |
| 508 | 596 |
| 509 | 1168 |
| 510 | 551 |
| 511 | 650 |
| 512 | 4120 |
| 513 | 229 |
| 514 | 1052 |
| 515 | 2120 |
| 516 | 159 |
| 517 | 420 |
| 518 | 310 |
| 519 | 1093 |
| 520 | 541 |
| 521 | 773 |
| 522 | 2305 |
| 523 | 610 |
| 524 | 4132 |
| 525 | 1066 |
| 526 | 657 |
| 527 | 333 |
| 528 | 119 |
| 529 | 1540 |
| 530 | 3073 |
| 531 | 600 |
| 532 | 339 |
| 533 | 218 |
| 534 | 1073 |
| 535 | 368 |
| 536 | 652 |
| 537 | 4103 |
| 538 | 230 |
| 539 | 2069 |
| 540 | 1098 |
| 541 | 391 |
| 542 | 313 |
| 543 | 450 |
| 544 | 1296 |
| 545 | 542 |
| 546 | 2180 |
| 547 | 334 |
| 548 | 233 |
| 549 | 4225 |
| 550 | 1184 |
| 551 | 555 |
| 552 | 774 |
| 553 | 175 |

TABLE Q1-continued

| with a sequence length of 8192: | |
|---|---|
| Reliability or reliability sequence number | Polarized channel sequence number |
| 554 | 2083 |
| 555 | 1544 |
| 556 | 123 |
| 557 | 658 |
| 558 | 612 |
| 559 | 1312 |
| 560 | 2306 |
| 561 | 4162 |
| 562 | 341 |
| 563 | 777 |
| 564 | 220 |
| 565 | 1552 |
| 566 | 314 |
| 567 | 424 |
| 568 | 2074 |
| 569 | 395 |
| 570 | 1216 |
| 571 | 673 |
| 572 | 583 |
| 573 | 4608 |
| 574 | 355 |
| 575 | 1568 |
| 576 | 2561 |
| 577 | 287 |
| 578 | 183 |
| 579 | 234 |
| 580 | 1094 |
| 581 | 125 |
| 582 | 557 |
| 583 | 2128 |
| 584 | 4107 |
| 585 | 660 |
| 586 | 1068 |
| 587 | 616 |
| 588 | 342 |
| 589 | 316 |
| 590 | 2085 |
| 591 | 1155 |
| 592 | 241 |
| 593 | 778 |
| 594 | 1105 |
| 595 | 563 |
| 596 | 4136 |
| 597 | 345 |
| 598 | 2073 |
| 599 | 452 |
| 600 | 1074 |
| 601 | 397 |
| 602 | 403 |
| 603 | 207 |
| 604 | 2070 |
| 605 | 1097 |
| 606 | 674 |
| 607 | 4164 |
| 608 | 558 |
| 609 | 1039 |
| 610 | 785 |
| 611 | 432 |
| 612 | 2184 |
| 613 | 357 |
| 614 | 1344 |
| 615 | 187 |
| 616 | 236 |
| 617 | 664 |
| 618 | 4226 |
| 619 | 2308 |
| 620 | 1157 |
| 621 | 624 |
| 622 | 587 |
| 623 | 1076 |
| 624 | 780 |
| 625 | 2312 |
| 626 | 705 |
| 627 | 126 |
| 628 | 1047 |

TABLE Q1-continued

| with a sequence length of 8192: | |
|---|---|
| Reliability or reliability sequence number | Polarized channel sequence number |
| 629 | 4115 |
| 630 | 242 |
| 631 | 565 |
| 632 | 1158 |
| 633 | 2086 |
| 634 | 398 |
| 635 | 346 |
| 636 | 456 |
| 637 | 1408 |
| 638 | 358 |
| 639 | 2562 |
| 640 | 4109 |
| 641 | 405 |
| 642 | 1100 |
| 643 | 303 |
| 644 | 569 |
| 645 | 244 |
| 646 | 2144 |
| 647 | 1161 |
| 648 | 595 |
| 649 | 189 |
| 650 | 4144 |
| 651 | 1106 |
| 652 | 566 |
| 653 | 2115 |
| 654 | 676 |
| 655 | 361 |
| 656 | 1080 |
| 657 | 706 |
| 658 | 589 |
| 659 | 2089 |
| 660 | 1051 |
| 661 | 4110 |
| 662 | 215 |
| 663 | 786 |
| 664 | 647 |
| 665 | 1121 |
| 666 | 2192 |
| 667 | 348 |
| 668 | 419 |
| 669 | 1063 |
| 670 | 406 |
| 671 | 4168 |
| 672 | 464 |
| 673 | 2076 |
| 674 | 680 |
| 675 | 1283 |
| 676 | 801 |
| 677 | 362 |
| 678 | 1108 |
| 679 | 2117 |
| 680 | 590 |
| 681 | 4353 |
| 682 | 409 |
| 683 | 1162 |
| 684 | 570 |
| 685 | 2090 |
| 686 | 788 |
| 687 | 597 |
| 688 | 1169 |
| 689 | 572 |
| 690 | 219 |
| 691 | 5121 |
| 692 | 2564 |
| 693 | 1285 |
| 694 | 311 |
| 695 | 708 |
| 696 | 1053 |
| 697 | 598 |
| 698 | 2097 |
| 699 | 601 |
| 700 | 1067 |
| 701 | 4117 |
| 702 | 651 |
| 703 | 421 |

TABLE Q1-continued

| with a sequence length of 8192: | |
|---|---|
| Reliability or reliability sequence number | Polarized channel sequence number |
| 704 | 3074 |
| 705 | 792 |
| 706 | 1122 |
| 707 | 802 |
| 708 | 611 |
| 709 | 1539 |
| 710 | 2122 |
| 711 | 4228 |
| 712 | 602 |
| 713 | 410 |
| 714 | 1112 |
| 715 | 231 |
| 716 | 688 |
| 717 | 2320 |
| 718 | 1164 |
| 719 | 653 |
| 720 | 248 |
| 721 | 4131 |
| 722 | 1054 |
| 723 | 2208 |
| 724 | 369 |
| 725 | 190 |
| 726 | 364 |
| 727 | 1170 |
| 728 | 654 |
| 729 | 2568 |
| 730 | 4354 |
| 731 | 659 |
| 732 | 1095 |
| 733 | 335 |
| 734 | 480 |
| 735 | 2336 |
| 736 | 1286 |
| 737 | 315 |
| 738 | 221 |
| 739 | 1289 |
| 740 | 4122 |
| 741 | 2576 |
| 742 | 370 |
| 743 | 613 |
| 744 | 1185 |
| 745 | 422 |
| 746 | 425 |
| 747 | 2240 |
| 748 | 1600 |
| 749 | 6145 |
| 750 | 451 |
| 751 | 614 |
| 752 | 1069 |
| 753 | 2592 |
| 754 | 543 |
| 755 | 235 |
| 756 | 1124 |
| 757 | 412 |
| 758 | 4609 |
| 759 | 2118 |
| 760 | 343 |
| 761 | 372 |
| 762 | 1664 |
| 763 | 775 |
| 764 | 317 |
| 765 | 2092 |
| 766 | 1075 |
| 767 | 222 |
| 768 | 4176 |
| 769 | 426 |
| 770 | 1172 |
| 771 | 2179 |
| 772 | 453 |
| 773 | 237 |
| 774 | 1070 |
| 775 | 559 |
| 776 | 2129 |
| 777 | 4133 |
| 778 | 833 |

TABLE Q1-continued with a sequence length of 8192:

| Reliability or reliability sequence number | Polarized channel sequence number |
|---|---|
| 779 | 1099 |
| 780 | 804 |
| 781 | 712 |
| 782 | 2098 |
| 783 | 1290 |
| 784 | 834 |
| 785 | 661 |
| 786 | 4121 |
| 787 | 1297 |
| 788 | 2121 |
| 789 | 808 |
| 790 | 779 |
| 791 | 1541 |
| 792 | 617 |
| 793 | 1128 |
| 794 | 2063 |
| 795 | 4118 |
| 796 | 604 |
| 797 | 433 |
| 798 | 1186 |
| 799 | 720 |
| 800 | 2368 |
| 801 | 816 |
| 802 | 1077 |
| 803 | 4232 |
| 804 | 836 |
| 805 | 347 |
| 806 | 2181 |
| 807 | 1217 |
| 808 | 897 |
| 809 | 243 |
| 810 | 1176 |
| 811 | 2100 |
| 812 | 4356 |
| 813 | 662 |
| 814 | 454 |
| 815 | 1101 |
| 816 | 318 |
| 817 | 3076 |
| 818 | 675 |
| 819 | 1188 |
| 820 | 618 |
| 821 | 4360 |
| 822 | 898 |
| 823 | 2071 |
| 824 | 1792 |
| 825 | 781 |
| 826 | 376 |
| 827 | 2182 |
| 828 | 1292 |
| 829 | 4134 |
| 830 | 428 |
| 831 | 1298 |
| 832 | 665 |
| 833 | 2432 |
| 834 | 736 |
| 835 | 1542 |
| 836 | 567 |
| 837 | 840 |
| 838 | 4610 |
| 839 | 2124 |
| 840 | 1078 |
| 841 | 625 |
| 842 | 238 |
| 843 | 1107 |
| 844 | 2185 |
| 845 | 359 |
| 846 | 4192 |
| 847 | 457 |
| 848 | 1081 |
| 849 | 399 |
| 850 | 2130 |
| 851 | 787 |
| 852 | 1545 |
| 853 | 591 |
| 854 | 1136 |
| 855 | 4163 |
| 856 | 2104 |
| 857 | 678 |
| 858 | 434 |
| 859 | 1159 |
| 860 | 2075 |
| 861 | 677 |
| 862 | 349 |
| 863 | 4137 |
| 864 | 1102 |
| 865 | 245 |
| 866 | 2145 |
| 867 | 458 |
| 868 | 1313 |
| 869 | 666 |
| 870 | 1218 |
| 871 | 4240 |
| 872 | 2087 |
| 873 | 620 |
| 874 | 363 |
| 875 | 1109 |
| 876 | 2307 |
| 877 | 127 |
| 878 | 191 |
| 879 | 4124 |
| 880 | 1300 |
| 881 | 782 |
| 882 | 2132 |
| 883 | 1546 |
| 884 | 407 |
| 885 | 436 |
| 886 | 1082 |
| 887 | 4165 |
| 888 | 2186 |
| 889 | 626 |
| 890 | 571 |
| 891 | 1192 |
| 892 | 2193 |
| 893 | 465 |
| 894 | 1163 |
| 895 | 681 |
| 896 | 4138 |
| 897 | 246 |
| 898 | 2309 |
| 899 | 1123 |
| 900 | 707 |
| 901 | 350 |
| 902 | 3080 |
| 903 | 4612 |
| 904 | 1110 |
| 905 | 599 |
| 906 | 1084 |
| 907 | 668 |
| 908 | 2077 |
| 909 | 790 |
| 910 | 1304 |
| 911 | 4145 |
| 912 | 460 |
| 913 | 2091 |
| 914 | 249 |
| 915 | 1113 |
| 916 | 682 |
| 917 | 1314 |
| 918 | 2146 |
| 919 | 5122 |
| 920 | 573 |
| 921 | 411 |
| 922 | 1553 |
| 923 | 2563 |
| 924 | 803 |
| 925 | 789 |
| 926 | 1548 |
| 927 | 4170 |
| 928 | 709 |

TABLE Q1-continued with a sequence length of 8192:

| Reliability or reliability sequence number | Polarized channel sequence number |
|---|---|
| 929 | 2136 |
| 930 | 1220 |
| 931 | 365 |
| 932 | 440 |
| 933 | 2188 |
| 934 | 1165 |
| 935 | 4368 |
| 936 | 628 |
| 937 | 1125 |
| 938 | 689 |
| 939 | 2078 |
| 940 | 374 |
| 941 | 1171 |
| 942 | 4256 |
| 943 | 423 |
| 944 | 2194 |
| 945 | 466 |
| 946 | 1200 |
| 947 | 793 |
| 948 | 2119 |
| 949 | 1166 |
| 950 | 4616 |
| 951 | 250 |
| 952 | 371 |
| 953 | 1554 |
| 954 | 2310 |
| 955 | 481 |
| 956 | 1345 |
| 957 | 574 |
| 958 | 4384 |
| 959 | 2313 |
| 960 | 413 |
| 961 | 1055 |
| 962 | 603 |
| 963 | 2209 |
| 964 | 1224 |
| 965 | 4624 |
| 966 | 366 |
| 967 | 468 |
| 968 | 1114 |
| 969 | 2624 |
| 970 | 655 |
| 971 | 1569 |
| 972 | 900 |
| 973 | 4288 |
| 974 | 2093 |
| 975 | 805 |
| 976 | 1316 |
| 977 | 615 |
| 978 | 3088 |
| 979 | 1346 |
| 980 | 4640 |
| 981 | 684 |
| 982 | 710 |
| 983 | 2148 |
| 984 | 1556 |
| 985 | 429 |
| 986 | 1287 |
| 987 | 4166 |
| 988 | 2688 |
| 989 | 794 |
| 990 | 252 |
| 991 | 1173 |
| 992 | 373 |
| 993 | 2099 |
| 994 | 1126 |
| 995 | 4140 |
| 996 | 605 |
| 997 | 848 |
| 998 | 2196 |
| 999 | 1129 |
| 1000 | 690 |
| 1001 | 1328 |
| 1002 | 4227 |
| 1003 | 2094 |

TABLE Q1-continued with a sequence length of 8192:

| Reliability or reliability sequence number | Polarized channel sequence number |
|---|---|
| 1004 | 713 |
| 1005 | 1320 |
| 1006 | 632 |
| 1007 | 2123 |
| 1008 | 482 |
| 1009 | 4177 |
| 1010 | 1187 |
| 1011 | 806 |
| 1012 | 2314 |
| 1013 | 1116 |
| 1014 | 427 |
| 1015 | 904 |
| 1016 | 6146 |
| 1017 | 2321 |
| 1018 | 1071 |
| 1019 | 414 |
| 1020 | 1291 |
| 1021 | 2565 |
| 1022 | 223 |
| 1023 | 663 |
| 1024 | 4146 |
| 1025 | 1409 |
| 1026 | 2152 |
| 1027 | 692 |
| 1028 | 1570 |
| 1029 | 835 |
| 1030 | 2210 |
| 1031 | 4169 |
| 1032 | 1348 |
| 1033 | 619 |
| 1034 | 472 |
| 1035 | 2101 |
| 1036 | 1232 |
| 1037 | 455 |
| 1038 | 4111 |
| 1039 | 1410 |
| 1040 | 2241 |
| 1041 | 796 |
| 1042 | 809 |
| 1043 | 1174 |
| 1044 | 3104 |
| 1045 | 4416 |
| 1046 | 714 |
| 1047 | 1177 |
| 1048 | 721 |
| 1049 | 2200 |
| 1050 | 1189 |
| 1051 | 837 |
| 1052 | 4229 |
| 1053 | 716 |
| 1054 | 2125 |
| 1055 | 1130 |
| 1056 | 864 |
| 1057 | 1079 |
| 1058 | 2212 |
| 1059 | 4148 |
| 1060 | 810 |
| 1061 | 1352 |
| 1062 | 606 |
| 1063 | 2816 |
| 1064 | 912 |
| 1065 | 5124 |
| 1066 | 1560 |
| 1067 | 722 |
| 1068 | 2316 |
| 1069 | 1601 |
| 1070 | 696 |
| 1071 | 1572 |
| 1072 | 4119 |
| 1073 | 2322 |
| 1074 | 377 |
| 1075 | 435 |
| 1076 | 1137 |
| 1077 | 2566 |
| 1078 | 817 |

TABLE Q1-continued

| with a sequence length of 8192: | |
|---|---|
| Reliability or reliability sequence number | Polarized channel sequence number |
| 1079 | 4230 |
| 1080 | 1178 |
| 1081 | 319 |
| 1082 | 2102 |
| 1083 | 1103 |
| 1084 | 621 |
| 1085 | 1293 |
| 1086 | 4480 |
| 1087 | 2131 |
| 1088 | 812 |
| 1089 | 484 |
| 1090 | 1132 |
| 1091 | 2105 |
| 1092 | 430 |
| 1093 | 4172 |
| 1094 | 1602 |
| 1095 | 838 |
| 1096 | 2569 |
| 1097 | 1248 |
| 1098 | 667 |
| 1099 | 4233 |
| 1100 | 3075 |
| 1101 | 488 |
| 1102 | 1190 |
| 1103 | 239 |
| 1104 | 2160 |
| 1105 | 1543 |
| 1106 | 4178 |
| 1107 | 378 |
| 1108 | 1576 |
| 1109 | 2183 |
| 1110 | 459 |
| 1111 | 1219 |
| 1112 | 622 |
| 1113 | 4152 |
| 1114 | 2126 |
| 1115 | 627 |
| 1116 | 1294 |
| 1117 | 437 |
| 1118 | 2337 |
| 1119 | 4123 |
| 1120 | 1665 |
| 1121 | 380 |
| 1122 | 2242 |
| 1123 | 1547 |
| 1124 | 818 |
| 1125 | 1299 |
| 1126 | 4193 |
| 1127 | 2133 |
| 1128 | 461 |
| 1129 | 496 |
| 1130 | 1604 |
| 1131 | 2324 |
| 1132 | 4135 |
| 1133 | 669 |
| 1134 | 1315 |
| 1135 | 2570 |
| 1136 | 679 |
| 1137 | 1083 |
| 1138 | 724 |
| 1139 | 4355 |
| 1140 | 2106 |
| 1141 | 1193 |
| 1142 | 841 |
| 1143 | 629 |
| 1144 | 2216 |
| 1145 | 4180 |
| 1146 | 1584 |
| 1147 | 351 |
| 1148 | 1138 |
| 1149 | 3077 |
| 1150 | 467 |
| 1151 | 1301 |
| 1152 | 4234 |
| 1153 | 2187 |

TABLE Q1-continued

| with a sequence length of 8192: | |
|---|---|
| Reliability or reliability sequence number | Polarized channel sequence number |
| 1154 | 438 |
| 1155 | 1180 |
| 1156 | 737 |
| 1157 | 2147 |
| 1158 | 4241 |
| 1159 | 1111 |
| 1160 | 251 |
| 1161 | 1221 |
| 1162 | 2134 |
| 1163 | 462 |
| 1164 | 4357 |
| 1165 | 442 |
| 1166 | 2108 |
| 1167 | 1140 |
| 1168 | 441 |
| 1169 | 1194 |
| 1170 | 2328 |
| 1171 | 5128 |
| 1172 | 469 |
| 1173 | 1085 |
| 1174 | 2137 |
| 1175 | 247 |
| 1176 | 1555 |
| 1177 | 4125 |
| 1178 | 683 |
| 1179 | 2338 |
| 1180 | 1549 |
| 1181 | 842 |
| 1182 | 1666 |
| 1183 | 4139 |
| 1184 | 2577 |
| 1185 | 738 |
| 1186 | 899 |
| 1187 | 2572 |
| 1188 | 1305 |
| 1189 | 6148 |
| 1190 | 670 |
| 1191 | 1302 |
| 1192 | 2244 |
| 1193 | 783 |
| 1194 | 1550 |
| 1195 | 3136 |
| 1196 | 4194 |
| 1197 | 849 |
| 1198 | 1201 |
| 1199 | 820 |
| 1200 | 2189 |
| 1201 | 1317 |
| 1202 | 4611 |
| 1203 | 728 |
| 1204 | 2149 |
| 1205 | 1412 |
| 1206 | 928 |
| 1207 | 1115 |
| 1208 | 4184 |
| 1209 | 2195 |
| 1210 | 791 |
| 1211 | 367 |
| 1212 | 2224 |
| 1213 | 1608 |
| 1214 | 4236 |
| 1215 | 901 |
| 1216 | 1793 |
| 1217 | 2190 |
| 1218 | 630 |
| 1219 | 1222 |
| 1220 | 4126 |
| 1221 | 2578 |
| 1222 | 685 |
| 1223 | 1196 |
| 1224 | 844 |
| 1225 | 2369 |
| 1226 | 4242 |
| 1227 | 1144 |
| 1228 | 633 |

TABLE Q1-continued

| with a sequence length of 8192: | |
|---|---|
| Reliability or reliability sequence number | Polarized channel sequence number |
| 1229 | 2079 |
| 1230 | 1225 |
| 1231 | 711 |
| 1232 | 4167 |
| 1233 | 1360 |
| 1234 | 2248 |
| 1235 | 253 |
| 1236 | 1086 |
| 1237 | 3081 |
| 1238 | 4358 |
| 1239 | 691 |
| 1240 | 1306 |
| 1241 | 824 |
| 1242 | 2138 |
| 1243 | 1167 |
| 1244 | 4361 |
| 1245 | 902 |
| 1246 | 2593 |
| 1247 | 1127 |
| 1248 | 686 |
| 1249 | 740 |
| 1250 | 4257 |
| 1251 | 2340 |
| 1252 | 1202 |
| 1253 | 850 |
| 1254 | 2370 |
| 1255 | 1318 |
| 1256 | 4672 |
| 1257 | 375 |
| 1258 | 2580 |
| 1259 | 1117 |
| 1260 | 444 |
| 1261 | 1668 |
| 1262 | 4141 |
| 1263 | 2311 |
| 1264 | 470 |
| 1265 | 1226 |
| 1266 | 2197 |
| 1267 | 483 |
| 1268 | 5136 |
| 1269 | 1616 |
| 1270 | 415 |
| 1271 | 2150 |
| 1272 | 1347 |
| 1273 | 485 |
| 1274 | 4196 |
| 1275 | 2153 |
| 1276 | 1416 |
| 1277 | 905 |
| 1278 | 3078 |
| 1279 | 1321 |
| 1280 | 4736 |
| 1281 | 795 |
| 1282 | 1794 |
| 1283 | 2352 |
| 1284 | 473 |
| 1285 | 4147 |
| 1286 | 1131 |
| 1287 | 2344 |
| 1288 | 634 |
| 1289 | 1204 |
| 1290 | 2211 |
| 1291 | 4244 |
| 1292 | 744 |
| 1293 | 1175 |
| 1294 | 852 |
| 1295 | 2140 |
| 1296 | 1233 |
| 1297 | 4142 |
| 1298 | 960 |
| 1299 | 2095 |
| 1300 | 1308 |
| 1301 | 865 |
| 1302 | 2315 |
| 1303 | 4171 |

TABLE Q1-continued

| with a sequence length of 8192: | |
|---|---|
| Reliability or reliability sequence number | Polarized channel sequence number |
| 1304 | 1672 |
| 1305 | 693 |
| 1306 | 2433 |
| 1307 | 1118 |
| 1308 | 4362 |
| 1309 | 797 |
| 1310 | 1228 |
| 1311 | 2594 |
| 1312 | 906 |
| 1313 | 1322 |
| 1314 | 4369 |
| 1315 | 2372 |
| 1316 | 715 |
| 1317 | 1424 |
| 1318 | 3089 |
| 1319 | 807 |
| 1320 | 4613 |
| 1321 | 1632 |
| 1322 | 474 |
| 1323 | 2256 |
| 1324 | 1376 |
| 1325 | 6152 |
| 1326 | 636 |
| 1327 | 2434 |
| 1328 | 1349 |
| 1329 | 694 |
| 1330 | 2198 |
| 1331 | 4200 |
| 1332 | 1557 |
| 1333 | 254 |
| 1334 | 2201 |
| 1335 | 1179 |
| 1336 | 717 |
| 1337 | 4258 |
| 1338 | 2213 |
| 1339 | 1234 |
| 1340 | 575 |
| 1341 | 1329 |
| 1342 | 4149 |
| 1343 | 2154 |
| 1344 | 913 |
| 1345 | 1571 |
| 1346 | 2103 |
| 1347 | 798 |
| 1348 | 4289 |
| 1349 | 1324 |
| 1350 | 3082 |
| 1351 | 811 |
| 1352 | 1133 |
| 1353 | 5152 |
| 1354 | 2376 |
| 1355 | 379 |
| 1356 | 1208 |
| 1357 | 2584 |
| 1358 | 697 |
| 1359 | 4248 |
| 1360 | 1558 |
| 1361 | 431 |
| 1362 | 2625 |
| 1363 | 607 |
| 1364 | 4173 |
| 1365 | 489 |
| 1366 | 2596 |
| 1367 | 1561 |
| 1368 | 866 |
| 1369 | 2161 |
| 1370 | 4260 |
| 1371 | 1139 |
| 1372 | 723 |
| 1373 | 2202 |
| 1374 | 1191 |
| 1375 | 4864 |
| 1376 | 486 |
| 1377 | 2127 |
| 1378 | 1249 |

TABLE Q1-continued with a sequence length of 8192:

| Reliability or reliability sequence number | Polarized channel sequence number |
|---|---|
| 1379 | 908 |
| 1380 | 2317 |
| 1381 | 4364 |
| 1382 | 1350 |
| 1383 | 718 |
| 1384 | 1330 |
| 1385 | 3090 |
| 1386 | 4370 |
| 1387 | 813 |
| 1388 | 1796 |
| 1389 | 2156 |
| 1390 | 476 |
| 1391 | 4614 |
| 1392 | 1181 |
| 1393 | 2626 |
| 1394 | 856 |
| 1395 | 1680 |
| 1396 | 2272 |
| 1397 | 4150 |
| 1398 | 839 |
| 1399 | 1353 |
| 1400 | 2214 |
| 1401 | 725 |
| 1402 | 4179 |
| 1403 | 1134 |
| 1404 | 2567 |
| 1405 | 698 |
| 1406 | 1141 |
| 1407 | 2600 |
| 1408 | 4153 |
| 1409 | 914 |
| 1410 | 1236 |
| 1411 | 2243 |
| 1412 | 752 |
| 1413 | 4617 |
| 1414 | 1195 |
| 1415 | 3200 |
| 1416 | 868 |
| 1417 | 1800 |
| 1418 | 5123 |
| 1419 | 2318 |
| 1420 | 819 |
| 1421 | 1354 |
| 1422 | 2689 |
| 1423 | 4208 |
| 1424 | 814 |
| 1425 | 1250 |
| 1426 | 439 |
| 1427 | 2571 |
| 1428 | 1573 |
| 1429 | 4231 |
| 1430 | 929 |
| 1431 | 2323 |
| 1432 | 1562 |
| 1433 | 490 |
| 1434 | 6160 |
| 1435 | 2628 |
| 1436 | 1411 |
| 1437 | 623 |
| 1438 | 2339 |
| 1439 | 4174 |
| 1440 | 1332 |
| 1441 | 671 |
| 1442 | 2107 |
| 1443 | 1240 |
| 1444 | 4385 |
| 1445 | 739 |
| 1446 | 3084 |
| 1447 | 1440 |
| 1448 | 916 |
| 1449 | 2217 |
| 1450 | 4290 |
| 1451 | 1295 |
| 1452 | 463 |
| 1453 | 2608 |

TABLE Q1-continued with a sequence length of 8192:

| Reliability or reliability sequence number | Polarized channel sequence number |
|---|---|
| 1454 | 1303 |
| 1455 | 4181 |
| 1456 | 843 |
| 1457 | 2162 |
| 1458 | 1182 |
| 1459 | 381 |
| 1460 | 4372 |
| 1461 | 2325 |
| 1462 | 1361 |
| 1463 | 497 |
| 1464 | 2204 |
| 1465 | 4618 |
| 1466 | 1574 |
| 1467 | 930 |
| 1468 | 2135 |
| 1469 | 1696 |
| 1470 | 4154 |
| 1471 | 821 |
| 1472 | 2245 |
| 1473 | 1142 |
| 1474 | 726 |
| 1475 | 4264 |
| 1476 | 3105 |
| 1477 | 1356 |
| 1478 | 1603 |
| 1479 | 2164 |
| 1480 | 5125 |
| 1481 | 961 |
| 1482 | 2218 |
| 1483 | 1564 |
| 1484 | 872 |
| 1485 | 2109 |
| 1486 | 4235 |
| 1487 | 1413 |
| 1488 | 492 |
| 1489 | 2579 |
| 1490 | 1197 |
| 1491 | 4195 |
| 1492 | 631 |
| 1493 | 2573 |
| 1494 | 1145 |
| 1495 | 729 |
| 1496 | 4182 |
| 1497 | 2690 |
| 1498 | 1577 |
| 1499 | 700 |
| 1500 | 2329 |
| 1501 | 4156 |
| 1502 | 1223 |
| 1503 | 443 |
| 1504 | 3137 |
| 1505 | 1808 |
| 1506 | 4376 |
| 1507 | 741 |
| 1508 | 2326 |
| 1509 | 1203 |
| 1510 | 845 |
| 1511 | 4185 |
| 1512 | 2574 |
| 1513 | 1252 |
| 1514 | 920 |
| 1515 | 2225 |
| 1516 | 4386 |
| 1517 | 1362 |
| 1518 | 382 |
| 1519 | 2341 |
| 1520 | 1336 |
| 1521 | 4625 |
| 1522 | 822 |
| 1523 | 2436 |
| 1524 | 1728 |
| 1525 | 2139 |
| 1526 | 6176 |
| 1527 | 1414 |
| 1528 | 851 |

TABLE Q1-continued with a sequence length of 8192:

| Reliability or reliability sequence number | Polarized channel sequence number |
|---|---|
| 1529 | 3092 |
| 1530 | 1198 |
| 1531 | 4620 |
| 1532 | 730 |
| 1533 | 2632 |
| 1534 | 1578 |
| 1535 | 498 |
| 1536 | 4292 |
| 1537 | 2817 |
| 1538 | 1605 |
| 1539 | 880 |
| 1540 | 5184 |
| 1541 | 2246 |
| 1542 | 1417 |
| 1543 | 742 |
| 1544 | 2220 |
| 1545 | 4237 |
| 1546 | 1307 |
| 1547 | 445 |
| 1548 | 2168 |
| 1549 | 1146 |
| 1550 | 4197 |
| 1551 | 2249 |
| 1552 | 471 |
| 1553 | 1472 |
| 1554 | 2384 |
| 1555 | 4243 |
| 1556 | 1377 |
| 1557 | 635 |
| 1558 | 3328 |
| 1559 | 1585 |
| 1560 | 4272 |
| 1561 | 932 |
| 1562 | 2110 |
| 1563 | 1227 |
| 1564 | 687 |
| 1565 | 4238 |
| 1566 | 2330 |
| 1567 | 1087 |
| 1568 | 903 |
| 1569 | 2191 |
| 1570 | 4626 |
| 1571 | 1364 |
| 1572 | 2151 |
| 1573 | 825 |
| 1574 | 4417 |
| 1575 | 1418 |
| 1576 | 2226 |
| 1577 | 500 |
| 1578 | 1551 |
| 1579 | 4127 |
| 1580 | 2342 |
| 1581 | 1606 |
| 1582 | 846 |
| 1583 | 3106 |
| 1584 | 4296 |
| 1585 | 1580 |
| 1586 | 745 |
| 1587 | 2141 |
| 1588 | 1205 |
| 1589 | 5129 |
| 1590 | 2692 |
| 1591 | 826 |
| 1592 | 1319 |
| 1593 | 2250 |
| 1594 | 4186 |
| 1595 | 732 |
| 1596 | 1309 |
| 1597 | 2640 |
| 1598 | 4641 |
| 1599 | 446 |
| 1600 | 1256 |
| 1601 | 2371 |
| 1602 | 1148 |
| 1603 | 4388 |

TABLE Q1-continued with a sequence length of 8192:

| Reliability or reliability sequence number | Polarized channel sequence number |
|---|---|
| 1604 | 3096 |
| 1605 | 962 |
| 1606 | 1229 |
| 1607 | 2440 |
| 1608 | 6147 |
| 1609 | 936 |
| 1610 | 1206 |
| 1611 | 2345 |
| 1612 | 4418 |
| 1613 | 475 |
| 1614 | 1667 |
| 1615 | 2818 |
| 1616 | 853 |
| 1617 | 4628 |
| 1618 | 2155 |
| 1619 | 1586 |
| 1620 | 867 |
| 1621 | 2228 |
| 1622 | 4359 |
| 1623 | 1310 |
| 1624 | 1609 |
| 1625 | 2199 |
| 1626 | 637 |
| 1627 | 4245 |
| 1628 | 1323 |
| 1629 | 3108 |
| 1630 | 907 |
| 1631 | 4198 |
| 1632 | 2257 |
| 1633 | 1378 |
| 1634 | 487 |
| 1635 | 2332 |
| 1636 | 4201 |
| 1637 | 1235 |
| 1638 | 695 |
| 1639 | 2696 |
| 1640 | 5126 |
| 1641 | 1425 |
| 1642 | 2142 |
| 1643 | 1209 |
| 1644 | 746 |
| 1645 | 4400 |
| 1646 | 2252 |
| 1647 | 1420 |
| 1648 | 828 |
| 1649 | 2346 |
| 1650 | 4392 |
| 1651 | 1368 |
| 1652 | 3079 |
| 1653 | 753 |
| 1654 | 4259 |
| 1655 | 1610 |
| 1656 | 2448 |
| 1657 | 854 |
| 1658 | 1669 |
| 1659 | 4188 |
| 1660 | 2656 |
| 1661 | 1617 |
| 1662 | 2400 |
| 1663 | 857 |
| 1664 | 4143 |
| 1665 | 1559 |
| 1666 | 2373 |
| 1667 | 504 |
| 1668 | 4363 |
| 1669 | 1264 |
| 1670 | 2581 |
| 1671 | 799 |
| 1672 | 3201 |
| 1673 | 4481 |
| 1674 | 1230 |
| 1675 | 1119 |
| 1676 | 2203 |
| 1677 | 4642 |
| 1678 | 255 |

TABLE Q1-continued with a sequence length of 8192:

| Reliability or reliability sequence number | Polarized channel sequence number |
|---|---|
| 1679 | 1351 |
| 1680 | 2258 |
| 1681 | 964 |
| 1682 | 6149 |
| 1683 | 2353 |
| 1684 | 1588 |
| 1685 | 909 |
| 1686 | 4420 |
| 1687 | 2595 |
| 1688 | 1824 |
| 1689 | 719 |
| 1690 | 2348 |
| 1691 | 5137 |
| 1692 | 1426 |
| 1693 | 3138 |
| 1694 | 1380 |
| 1695 | 4304 |
| 1696 | 477 |
| 1697 | 2157 |
| 1698 | 1331 |
| 1699 | 915 |
| 1700 | 4482 |
| 1701 | 2232 |
| 1702 | 1325 |
| 1703 | 2582 |
| 1704 | 4246 |
| 1705 | 638 |
| 1706 | 1441 |
| 1707 | 2585 |
| 1708 | 1237 |
| 1709 | 4249 |
| 1710 | 2163 |
| 1711 | 748 |
| 1712 | 1592 |
| 1713 | 4261 |
| 1714 | 2215 |
| 1715 | 944 |
| 1716 | 1856 |
| 1717 | 3584 |
| 1718 | 4202 |
| 1719 | 869 |
| 1720 | 2273 |
| 1721 | 1612 |
| 1722 | 4151 |
| 1723 | 1210 |
| 1724 | 2374 |
| 1725 | 491 |
| 1726 | 5130 |
| 1727 | 2354 |
| 1728 | 1670 |
| 1729 | 699 |
| 1730 | 2820 |
| 1731 | 4424 |
| 1732 | 1428 |
| 1733 | 1251 |
| 1734 | 2205 |
| 1735 | 4632 |
| 1736 | 754 |
| 1737 | 3083 |
| 1738 | 1920 |
| 1739 | 858 |
| 1740 | 4673 |
| 1741 | 2704 |
| 1742 | 1618 |
| 1743 | 2377 |
| 1744 | 4644 |
| 1745 | 478 |
| 1746 | 1442 |
| 1747 | 2158 |
| 1748 | 6208 |
| 1749 | 1326 |
| 1750 | 968 |
| 1751 | 2165 |
| 1752 | 1673 |
| 1753 | 4209 |

TABLE Q1-continued with a sequence length of 8192:

| Reliability or reliability sequence number | Polarized channel sequence number |
|---|---|
| 1754 | 2260 |
| 1755 | 383 |
| 1756 | 1795 |
| 1757 | 4250 |
| 1758 | 3112 |
| 1759 | 910 |
| 1760 | 2219 |
| 1761 | 4175 |
| 1762 | 1384 |
| 1763 | 1563 |
| 1764 | 2824 |
| 1765 | 815 |
| 1766 | 4365 |
| 1767 | 2378 |
| 1768 | 1135 |
| 1769 | 976 |
| 1770 | 5138 |
| 1771 | 2274 |
| 1772 | 1355 |
| 1773 | 2597 |
| 1774 | 4204 |
| 1775 | 1238 |
| 1776 | 870 |
| 1777 | 3140 |
| 1778 | 1333 |
| 1779 | 4674 |
| 1780 | 2586 |
| 1781 | 917 |
| 1782 | 1212 |
| 1783 | 4320 |
| 1784 | 2435 |
| 1785 | 1473 |
| 1786 | 2356 |
| 1787 | 4262 |
| 1788 | 727 |
| 1789 | 1241 |
| 1790 | 2264 |
| 1791 | 493 |
| 1792 | 4615 |
| 1793 | 3202 |
| 1794 | 1432 |
| 1795 | 873 |
| 1796 | 4648 |
| 1797 | 2464 |
| 1798 | 1633 |
| 1799 | 2319 |
| 1800 | 4291 |
| 1801 | 1620 |
| 1802 | 701 |
| 1803 | 2327 |
| 1804 | 5248 |
| 1805 | 1575 |
| 1806 | 2206 |
| 1807 | 931 |
| 1808 | 4366 |
| 1809 | 1674 |
| 1810 | 2385 |
| 1811 | 1253 |
| 1812 | 3091 |
| 1813 | 7168 |
| 1814 | 756 |
| 1815 | 1183 |
| 1816 | 2598 |
| 1817 | 4737 |
| 1818 | 860 |
| 1819 | 2720 |
| 1820 | 1444 |
| 1821 | 4619 |
| 1822 | 1334 |
| 1823 | 2166 |
| 1824 | 499 |
| 1825 | 4371 |
| 1826 | 2380 |
| 1827 | 1565 |
| 1828 | 731 |

TABLE Q1-continued with a sequence length of 8192:

| Reliability or reliability sequence number | Polarized channel sequence number |
|---|---|
| 1829 | 2627 |
| 1830 | 4676 |
| 1831 | 1797 |
| 1832 | 3085 |
| 1833 | 1634 |
| 1834 | 4387 |
| 1835 | 823 |
| 1836 | 2588 |
| 1837 | 1681 |
| 1838 | 4155 |
| 1839 | 2437 |
| 1840 | 922 |
| 1841 | 1357 |
| 1842 | 5132 |
| 1843 | 2221 |
| 1844 | 1143 |
| 1845 | 2169 |
| 1846 | 4265 |
| 1847 | 874 |
| 1848 | 1624 |
| 1849 | 3120 |
| 1850 | 4656 |
| 1851 | 918 |
| 1852 | 2601 |
| 1853 | 1363 |
| 1854 | 4210 |
| 1855 | 2247 |
| 1856 | 1242 |
| 1857 | 502 |
| 1858 | 2832 |
| 1859 | 4373 |
| 1860 | 1392 |
| 1861 | 2227 |
| 1862 | 933 |
| 1863 | 4252 |
| 1864 | 1676 |
| 1865 | 3086 |
| 1866 | 1254 |
| 1867 | 6153 |
| 1868 | 2276 |
| 1869 | 743 |
| 1870 | 1415 |
| 1871 | 4183 |
| 1872 | 2386 |
| 1873 | 1337 |
| 1874 | 2360 |
| 1875 | 4293 |
| 1876 | 760 |
| 1877 | 2752 |
| 1878 | 1474 |
| 1879 | 5153 |
| 1880 | 881 |
| 1881 | 2438 |
| 1882 | 1566 |
| 1883 | 4212 |
| 1884 | 3144 |
| 1885 | 1358 |
| 1886 | 494 |
| 1887 | 4266 |
| 1888 | 2222 |
| 1889 | 1257 |
| 1890 | 2602 |
| 1891 | 4157 |
| 1892 | 702 |
| 1893 | 2629 |
| 1894 | 1579 |
| 1895 | 4627 |
| 1896 | 1798 |
| 1897 | 2441 |
| 1898 | 921 |
| 1899 | 4621 |
| 1900 | 3329 |
| 1901 | 1199 |
| 1902 | 501 |
| 1903 | 4738 |

TABLE Q1-continued with a sequence length of 8192:

| Reliability or reliability sequence number | Polarized channel sequence number |
|---|---|
| 1904 | 2331 |
| 1905 | 1147 |
| 1906 | 2170 |
| 1907 | 4377 |
| 1908 | 1682 |
| 1909 | 2496 |
| 1910 | 876 |
| 1911 | 5185 |
| 1912 | 1636 |
| 1913 | 2401 |
| 1914 | 1365 |
| 1915 | 4374 |
| 1916 | 3093 |
| 1917 | 847 |
| 1918 | 1801 |
| 1919 | 2609 |
| 1920 | 4622 |
| 1921 | 992 |
| 1922 | 2251 |
| 1923 | 6150 |
| 1924 | 1244 |
| 1925 | 2111 |
| 1926 | 1338 |
| 1927 | 4273 |
| 1928 | 447 |
| 1929 | 2388 |
| 1930 | 1448 |
| 1931 | 4389 |
| 1932 | 3204 |
| 1933 | 1419 |
| 1934 | 2442 |
| 1935 | 4484 |
| 1936 | 733 |
| 1937 | 1697 |
| 1938 | 2575 |
| 1939 | 4187 |
| 1940 | 827 |
| 1941 | 2630 |
| 1942 | 1607 |
| 1943 | 5140 |
| 1944 | 2604 |
| 1945 | 1379 |
| 1946 | 934 |
| 1947 | 4680 |
| 1948 | 2229 |
| 1949 | 1311 |
| 1950 | 3107 |
| 1951 | 4865 |
| 1952 | 1207 |
| 1953 | 2343 |
| 1954 | 882 |
| 1955 | 4294 |
| 1956 | 1258 |
| 1957 | 2333 |
| 1958 | 937 |
| 1959 | 4268 |
| 1960 | 2280 |
| 1961 | 1149 |
| 1962 | 2172 |
| 1963 | 4216 |
| 1964 | 1581 |
| 1965 | 963 |
| 1966 | 3330 |
| 1967 | 4297 |
| 1968 | 1684 |
| 1969 | 2253 |
| 1970 | 1640 |
| 1971 | 6161 |
| 1972 | 2230 |
| 1973 | 747 |
| 1974 | 1366 |
| 1975 | 4432 |
| 1976 | 2691 |
| 1977 | 505 |
| 1978 | 2610 |

TABLE Q1-continued

| with a sequence length of 8192: | |
|---|---|
| Reliability or reliability sequence number | Polarized channel sequence number |
| 1979 | 5376 |
| 1980 | 1340 |
| 1981 | 3098 |
| 1982 | 1265 |
| 1983 | 4158 |
| 1984 | 855 |
| 1985 | 2334 |
| 1986 | 4378 |
| 1987 | 1802 |
| 1988 | 2633 |
| 1989 | 1587 |
| 1990 | 4239 |
| 1991 | 2347 |
| 1992 | 924 |
| 1993 | 3585 |
| 1994 | 4199 |
| 1995 | 1369 |
| 1996 | 734 |
| 1997 | 2402 |
| 1998 | 4274 |
| 1999 | 1476 |
| 2000 | 2259 |
| 2001 | 1421 |
| 2002 | 4390 |
| 2003 | 2449 |
| 2004 | 829 |
| 2005 | 1427 |
| 2006 | 5154 |
| 2007 | 2233 |
| 2008 | 1231 |
| 2009 | 3152 |
| 2010 | 4189 |
| 2011 | 965 |
| 2012 | 2444 |
| 2013 | 4740 |
| 2014 | 1698 |
| 2015 | 2392 |
| 2016 | 1582 |
| 2017 | 6154 |
| 2018 | 938 |
| 2019 | 2634 |
| 2020 | 1809 |
| 2021 | 4298 |
| 2022 | 2693 |
| 2023 | 1456 |
| 2024 | 3109 |
| 2025 | 4688 |
| 2026 | 884 |
| 2027 | 1381 |
| 2028 | 2641 |
| 2029 | 4419 |
| 2030 | 506 |
| 2031 | 2583 |
| 2032 | 5144 |
| 2033 | 1211 |
| 2034 | 2288 |
| 2035 | 1260 |
| 2036 | 4488 |
| 2037 | 2254 |
| 2038 | 749 |
| 2039 | 1688 |
| 2040 | 4393 |
| 2041 | 3097 |
| 2042 | 1648 |
| 2043 | 2143 |
| 2044 | 4866 |
| 2045 | 945 |
| 2046 | 2375 |
| 2047 | 1611 |
| 2048 | 4203 |
| 2049 | 2612 |
| 2050 | 1804 |
| 2051 | 4276 |
| 2052 | 966 |
| 2053 | 3094 |

TABLE Q1-continued

| with a sequence length of 8192: | |
|---|---|
| Reliability or reliability sequence number | Polarized channel sequence number |
| 2054 | 1729 |
| 2055 | 4247 |
| 2056 | 2848 |
| 2057 | 1150 |
| 2058 | 2450 |
| 2059 | 5156 |
| 2060 | 755 |
| 2061 | 2404 |
| 2062 | 1266 |
| 2063 | 6162 |
| 2064 | 859 |
| 2065 | 2355 |
| 2066 | 4305 |
| 2067 | 1589 |
| 2068 | 3208 |
| 2069 | 1422 |
| 2070 | 4380 |
| 2071 | 2349 |
| 2072 | 940 |
| 2073 | 2465 |
| 2074 | 4744 |
| 2075 | 1370 |
| 2076 | 2261 |
| 2077 | 4190 |
| 2078 | 1480 |
| 2079 | 830 |
| 2080 | 2616 |
| 2081 | 4300 |
| 2082 | 1382 |
| 2083 | 3332 |
| 2084 | 1429 |
| 2085 | 4394 |
| 2086 | 2880 |
| 2087 | 911 |
| 2088 | 2636 |
| 2089 | 5127 |
| 2090 | 1327 |
| 2091 | 1593 |
| 2092 | 4496 |
| 2093 | 2234 |
| 2094 | 871 |
| 2095 | 3336 |
| 2096 | 4704 |
| 2097 | 1268 |
| 2098 | 2694 |
| 2099 | 1619 |
| 2100 | 4448 |
| 2101 | 2452 |
| 2102 | 639 |
| 2103 | 6272 |
| 2104 | 2275 |
| 2105 | 1213 |
| 2106 | 1590 |
| 2107 | 4421 |
| 2108 | 2944 |
| 2109 | 888 |
| 2110 | 3110 |
| 2111 | 4629 |
| 2112 | 1700 |
| 2113 | 2642 |
| 2114 | 5249 |
| 2115 | 1385 |
| 2116 | 2466 |
| 2117 | 479 |
| 2118 | 4251 |
| 2119 | 2350 |
| 2120 | 1730 |
| 2121 | 3586 |
| 2122 | 4306 |
| 2123 | 1613 |
| 2124 | 946 |
| 2125 | 4401 |
| 2126 | 2697 |
| 2127 | 1239 |
| 2128 | 2819 |

TABLE Q1-continued

| with a sequence length of 8192: | |
|---|---|
| Reliability or reliability sequence number | Polarized channel sequence number |
| 2129 | 4643 |
| 2130 | 750 |
| 2131 | 2408 |
| 2132 | 4396 |
| 2133 | 1810 |
| 2134 | 2587 |
| 2135 | 1671 |
| 2136 | 5186 |
| 2137 | 3168 |
| 2138 | 969 |
| 2139 | 2159 |
| 2140 | 4205 |
| 2141 | 1372 |
| 2142 | 1443 |
| 2143 | 6156 |
| 2144 | 2379 |
| 2145 | 508 |
| 2146 | 2262 |
| 2147 | 4280 |
| 2148 | 1430 |
| 2149 | 3139 |
| 2150 | 4630 |
| 2151 | 1488 |
| 2152 | 2357 |
| 2153 | 861 |
| 2154 | 4633 |
| 2155 | 2236 |
| 2156 | 1704 |
| 2157 | 2497 |
| 2158 | 4211 |
| 2159 | 1825 |
| 2160 | 757 |
| 2161 | 4263 |
| 2162 | 3113 |
| 2163 | 1386 |
| 2164 | 2265 |
| 2165 | 5632 |
| 2166 | 1614 |
| 2167 | 2456 |
| 2168 | 4321 |
| 2169 | 970 |
| 2170 | 2657 |
| 2171 | 1433 |
| 2172 | 4422 |
| 2173 | 2644 |
| 2174 | 1594 |
| 2175 | 3216 |
| 2176 | 4402 |
| 2177 | 919 |
| 2178 | 2599 |
| 2179 | 4868 |
| 2180 | 1812 |
| 2181 | 1621 |
| 2182 | 2698 |
| 2183 | 6177 |
| 2184 | 1596 |
| 2185 | 2277 |
| 2186 | 4253 |
| 2187 | 875 |
| 2188 | 3100 |
| 2189 | 1243 |
| 2190 | 5131 |
| 2191 | 2207 |
| 2192 | 1335 |
| 2193 | 4752 |
| 2194 | 2468 |
| 2195 | 862 |
| 2196 | 2358 |
| 2197 | 4425 |
| 2198 | 1732 |
| 2199 | 3141 |
| 2200 | 4206 |
| 2201 | 1622 |
| 2202 | 2589 |
| 2203 | 758 |

TABLE Q1-continued

| with a sequence length of 8192: | |
|---|---|
| Reliability or reliability sequence number | Polarized channel sequence number |
| 2204 | 4213 |
| 2205 | 1625 |
| 2206 | 2821 |
| 2207 | 4308 |
| 2208 | 1675 |
| 2209 | 2658 |
| 2210 | 948 |
| 2211 | 5160 |
| 2212 | 3114 |
| 2213 | 1445 |
| 2214 | 4267 |
| 2215 | 2705 |
| 2216 | 1816 |
| 2217 | 2381 |
| 2218 | 6209 |
| 2219 | 977 |
| 2220 | 2167 |
| 2221 | 4872 |
| 2222 | 1826 |
| 2223 | 3588 |
| 2224 | 1635 |
| 2225 | 4426 |
| 2226 | 2648 |
| 2227 | 923 |
| 2228 | 4322 |
| 2229 | 2387 |
| 2230 | 1626 |
| 2231 | 2266 |
| 2232 | 4645 |
| 2233 | 1434 |
| 2234 | 972 |
| 2235 | 5188 |
| 2236 | 3121 |
| 2237 | 1255 |
| 2238 | 2416 |
| 2239 | 4634 |
| 2240 | 1712 |
| 2241 | 2700 |
| 2242 | 4483 |
| 2243 | 761 |
| 2244 | 2278 |
| 2245 | 1677 |
| 2246 | 4404 |
| 2247 | 3146 |
| 2248 | 1272 |
| 2249 | 4312 |
| 2250 | 2439 |
| 2251 | 877 |
| 2252 | 6164 |
| 2253 | 2361 |
| 2254 | 1393 |
| 2255 | 2498 |
| 2256 | 5250 |
| 2257 | 1214 |
| 2258 | 3344 |
| 2259 | 4512 |
| 2260 | 1388 |
| 2261 | 2590 |
| 2262 | 952 |
| 2263 | 4367 |
| 2264 | 2382 |
| 2265 | 1678 |
| 2266 | 4375 |
| 2267 | 2281 |
| 2268 | 1683 |
| 2269 | 495 |
| 2270 | 4254 |
| 2271 | 3232 |
| 2272 | 1359 |
| 2273 | 4433 |
| 2274 | 2603 |
| 2275 | 1504 |
| 2276 | 5139 |
| 2277 | 2822 |
| 2278 | 703 |

TABLE Q1-continued with a sequence length of 8192:

| Reliability or reliability sequence number | Polarized channel sequence number |
|---|---|
| 2279 | 2223 |
| 2280 | 4646 |
| 2281 | 1339 |
| 2282 | 3592 |
| 2283 | 4768 |
| 2284 | 1245 |
| 2285 | 2171 |
| 2286 | 935 |
| 2287 | 6400 |
| 2288 | 2706 |
| 2289 | 1394 |
| 2290 | 4214 |
| 2291 | 2660 |
| 2292 | 1637 |
| 2293 | 4428 |
| 2294 | 3360 |
| 2295 | 978 |
| 2296 | 2389 |
| 2297 | 4675 |
| 2298 | 1446 |
| 2299 | 2825 |
| 2300 | 5133 |
| 2301 | 1449 |
| 2302 | 2268 |
| 2303 | 1475 |
| 2304 | 4636 |
| 2305 | 3600 |
| 2306 | 883 |
| 2307 | 4485 |
| 2308 | 2362 |
| 2309 | 1638 |
| 2310 | 4269 |
| 2311 | 2472 |
| 2312 | 1567 |
| 2313 | 2443 |
| 2314 | 4217 |
| 2315 | 762 |
| 2316 | 3264 |
| 2317 | 5168 |
| 2318 | 1259 |
| 2319 | 2721 |
| 2320 | 6178 |
| 2321 | 1436 |
| 2322 | 2631 |
| 2323 | 503 |
| 2324 | 4649 |
| 2325 | 2403 |
| 2326 | 1367 |
| 2327 | 4295 |
| 2328 | 3616 |
| 2329 | 1396 |
| 2330 | 4880 |
| 2331 | 2335 |
| 2332 | 925 |
| 2333 | 2231 |
| 2334 | 4275 |
| 2335 | 1799 |
| 2336 | 2282 |
| 2337 | 5134 |
| 2338 | 1341 |
| 2339 | 3142 |
| 2340 | 4324 |
| 2341 | 1246 |
| 2342 | 2173 |
| 2343 | 878 |
| 2344 | 4434 |
| 2345 | 2605 |
| 2346 | 1450 |
| 2347 | 4408 |
| 2348 | 2708 |
| 2349 | 1477 |
| 2350 | 6168 |
| 2351 | 3116 |
| 2352 | 735 |
| 2353 | 2664 |
| 2354 | 4800 |
| 2355 | 1261 |
| 2356 | 2390 |
| 2357 | 4486 |
| 2358 | 1583 |
| 2359 | 2364 |
| 2360 | 5192 |
| 2361 | 1857 |
| 2362 | 3203 |
| 2363 | 4270 |
| 2364 | 993 |
| 2365 | 2289 |
| 2366 | 1828 |
| 2367 | 4650 |
| 2368 | 2826 |
| 2369 | 1736 |
| 2370 | 4677 |
| 2371 | 3153 |
| 2372 | 885 |
| 2373 | 4489 |
| 2374 | 2611 |
| 2375 | 1858 |
| 2376 | 2393 |
| 2377 | 5377 |
| 2378 | 1685 |
| 2379 | 2500 |
| 2380 | 4379 |
| 2381 | 939 |
| 2382 | 3122 |
| 2383 | 6180 |
| 2384 | 1832 |
| 2385 | 2445 |
| 2386 | 4218 |
| 2387 | 1803 |
| 2388 | 2451 |
| 2389 | 1641 |
| 2390 | 4544 |
| 2391 | 2255 |
| 2392 | 994 |
| 2393 | 4449 |
| 2394 | 3145 |
| 2395 | 1628 |
| 2396 | 5141 |
| 2397 | 2722 |
| 2398 | 1457 |
| 2399 | 4657 |
| 2400 | 2606 |
| 2401 | 980 |
| 2402 | 3087 |
| 2403 | 4299 |
| 2404 | 1744 |
| 2405 | 2833 |
| 2406 | 4159 |
| 2407 | 1840 |
| 2408 | 2480 |
| 2409 | 4436 |
| 2410 | 1860 |
| 2411 | 2405 |
| 2412 | 6151 |
| 2413 | 926 |
| 2414 | 3392 |
| 2415 | 5252 |
| 2416 | 1371 |
| 2417 | 2235 |
| 2418 | 1921 |
| 2419 | 4490 |
| 2420 | 2284 |
| 2421 | 764 |
| 2422 | 4623 |
| 2423 | 2712 |
| 2424 | 1267 |
| 2425 | 4678 |
| 2426 | 3205 |
| 2427 | 1686 |
| 2428 | 4652 |

TABLE Q1-continued

| with a sequence length of 8192: | |
|---|---|
| Reliability or reliability sequence number | Polarized channel sequence number |
| 2429 | 2672 |
| 2430 | 1478 |
| 2431 | 2635 |
| 2432 | 4277 |
| 2433 | 941 |
| 2434 | 3124 |
| 2435 | 5155 |
| 2436 | 1342 |
| 2437 | 2828 |
| 2438 | 6273 |
| 2439 | 1699 |
| 2440 | 2753 |
| 2441 | 4391 |
| 2442 | 967 |
| 2443 | 2174 |
| 2444 | 4381 |
| 2445 | 1642 |
| 2446 | 3095 |
| 2447 | 4328 |
| 2448 | 1922 |
| 2449 | 2290 |
| 2450 | 1805 |
| 2451 | 4220 |
| 2452 | 2613 |
| 2453 | 886 |
| 2454 | 5378 |
| 2455 | 1400 |
| 2456 | 1452 |
| 2457 | 4301 |
| 2458 | 3206 |
| 2459 | 831 |
| 2460 | 4278 |
| 2461 | 2446 |
| 2462 | 1689 |
| 2463 | 4739 |
| 2464 | 2394 |
| 2465 | 1760 |
| 2466 | 6210 |
| 2467 | 2504 |
| 2468 | 1591 |
| 2469 | 3456 |
| 2470 | 4658 |
| 2471 | 947 |
| 2472 | 2406 |
| 2473 | 5146 |
| 2474 | 1864 |
| 2475 | 2453 |
| 2476 | 4382 |
| 2477 | 1649 |
| 2478 | 3148 |
| 2479 | 4681 |
| 2480 | 507 |
| 2481 | 2351 |
| 2482 | 4395 |
| 2483 | 1262 |
| 2484 | 2617 |
| 2485 | 5633 |
| 2486 | 1383 |
| 2487 | 2292 |
| 2488 | 4450 |
| 2489 | 1481 |
| 2490 | 3209 |
| 2491 | 889 |
| 2492 | 4307 |
| 2493 | 2643 |
| 2494 | 1423 |
| 2495 | 6656 |
| 2496 | 2237 |
| 2497 | 1811 |
| 2498 | 4497 |
| 2499 | 3154 |
| 2500 | 1615 |
| 2501 | 4281 |
| 2502 | 2614 |
| 2503 | 984 |

TABLE Q1-continued

| with a sequence length of 8192: | |
|---|---|
| Reliability or reliability sequence number | Polarized channel sequence number |
| 2504 | 5200 |
| 2505 | 2724 |
| 2506 | 1702 |
| 2507 | 4492 |
| 2508 | 2409 |
| 2509 | 1458 |
| 2510 | 4440 |
| 2511 | 3128 |
| 2512 | 751 |
| 2513 | 4682 |
| 2514 | 2754 |
| 2515 | 1701 |
| 2516 | 4741 |
| 2517 | 2637 |
| 2518 | 1373 |
| 2519 | 3099 |
| 2520 | 6155 |
| 2521 | 1269 |
| 2522 | 2263 |
| 2523 | 5157 |
| 2524 | 942 |
| 2525 | 2834 |
| 2526 | 4689 |
| 2527 | 1482 |
| 2528 | 2695 |
| 2529 | 4631 |
| 2530 | 1690 |
| 2531 | 3169 |
| 2532 | 4336 |
| 2533 | 1644 |
| 2534 | 2396 |
| 2535 | 4302 |
| 2536 | 996 |
| 2537 | 2467 |
| 2538 | 5145 |
| 2539 | 1387 |
| 2540 | 3111 |
| 2541 | 4191 |
| 2542 | 1151 |
| 2543 | 2454 |
| 2544 | 6184 |
| 2545 | 1215 |
| 2546 | 2512 |
| 2547 | 4423 |
| 2548 | 971 |
| 2549 | 2728 |
| 2550 | 4660 |
| 2551 | 1806 |
| 2552 | 3331 |
| 2553 | 5142 |
| 2554 | 1431 |
| 2555 | 2849 |
| 2556 | 4896 |
| 2557 | 890 |
| 2558 | 2410 |
| 2559 | 1460 |
| 2560 | 4498 |
| 2561 | 3156 |
| 2562 | 1650 |
| 2563 | 4452 |
| 2564 | 2638 |
| 2565 | 1595 |
| 2566 | 4403 |
| 2567 | 2457 |
| 2568 | 509 |
| 2569 | 6212 |
| 2570 | 3210 |
| 2571 | 1489 |
| 2572 | 5256 |
| 2573 | 2618 |
| 2574 | 1705 |
| 2575 | 4397 |
| 2576 | 2836 |
| 2577 | 1270 |
| 2578 | 4513 |

TABLE Q1-continued with a sequence length of 8192:

| Reliability or reliability sequence number | Polarized channel sequence number |
|---|---|
| 2579 | 2645 |
| 2580 | 949 |
| 2581 | 4309 |
| 2582 | 3217 |
| 2583 | 1731 |
| 2584 | 4664 |
| 2585 | 2620 |
| 2586 | 1374 |
| 2587 | 5380 |
| 2588 | 2267 |
| 2589 | 1623 |
| 2590 | 4928 |
| 2591 | 3333 |
| 2592 | 973 |
| 2593 | 6274 |
| 2594 | 2359 |
| 2595 | 1692 |
| 2596 | 4684 |
| 2597 | 2756 |
| 2598 | 1814 |
| 2599 | 4282 |
| 2600 | 3101 |
| 2601 | 1484 |
| 2602 | 5384 |
| 2603 | 2646 |
| 2604 | 1000 |
| 2605 | 4742 |
| 2606 | 2649 |
| 2607 | 1273 |
| 2608 | 4500 |
| 2609 | 3115 |
| 2610 | 1706 |
| 2611 | 4323 |
| 2612 | 2699 |
| 2613 | 1597 |
| 2614 | 4992 |
| 2615 | 2469 |
| 2616 | 892 |
| 2617 | 6163 |
| 2618 | 2840 |
| 2619 | 1435 |
| 2620 | 5158 |
| 2621 | 3170 |
| 2622 | 1827 |
| 2623 | 4690 |
| 2624 | 2850 |
| 2625 | 1813 |
| 2626 | 4514 |
| 2627 | 2659 |
| 2628 | 950 |
| 2629 | 4398 |
| 2630 | 3587 |
| 2631 | 1733 |
| 2632 | 5634 |
| 2633 | 2650 |
| 2634 | 1389 |
| 2635 | 4745 |
| 2636 | 2458 |
| 2637 | 1464 |
| 2638 | 4867 |
| 2639 | 3160 |
| 2640 | 863 |
| 2641 | 6157 |
| 2642 | 2279 |
| 2643 | 2736 |
| 2644 | 4456 |
| 2645 | 1652 |
| 2646 | 4635 |
| 2647 | 3212 |
| 2648 | 1713 |
| 2649 | 5216 |
| 2650 | 2701 |
| 2651 | 1398 |
| 2652 | 4207 |
| 2653 | 2296 |

TABLE Q1-continued with a sequence length of 8192:

| Reliability or reliability sequence number | Polarized channel sequence number |
|---|---|
| 2654 | 759 |
| 2655 | 4427 |
| 2656 | 3102 |
| 2657 | 1447 |
| 2658 | 4310 |
| 2659 | 2417 |
| 2660 | 1490 |
| 2661 | 5187 |
| 2662 | 2238 |
| 2663 | 1817 |
| 2664 | 6192 |
| 2665 | 2412 |
| 2666 | 1008 |
| 2667 | 4405 |
| 2668 | 3218 |
| 2669 | 1274 |
| 2670 | 4284 |
| 2671 | 2702 |
| 2672 | 1395 |
| 2673 | 4545 |
| 2674 | 2707 |
| 2675 | 1505 |
| 2676 | 5161 |
| 2677 | 3143 |
| 2678 | 510 |
| 2679 | 4313 |
| 2680 | 2383 |
| 2681 | 1598 |
| 2682 | 4504 |
| 2683 | 2528 |
| 2684 | 3334 |
| 2685 | 6158 |
| 2686 | 1437 |
| 2687 | 2363 |
| 2688 | 4705 |
| 2689 | 1627 |
| 2690 | 4692 |
| 2691 | 2269 |
| 2692 | 979 |
| 2693 | 5264 |
| 2694 | 3337 |
| 2695 | 1390 |
| 2696 | 4647 |
| 2697 | 2418 |
| 2698 | 1492 |
| 2699 | 4746 |
| 2700 | 2661 |
| 2701 | 1679 |
| 2702 | 4325 |
| 2703 | 3233 |
| 2704 | 953 |
| 2705 | 5148 |
| 2706 | 2470 |
| 2707 | 1924 |
| 2708 | 6216 |
| 2709 | 2473 |
| 2710 | 1829 |
| 2711 | 4255 |
| 2712 | 3648 |
| 2713 | 1639 |
| 2714 | 4516 |
| 2715 | 2499 |
| 2716 | 4406 |
| 2717 | 2662 |
| 2718 | 763 |
| 2719 | 5189 |
| 2720 | 3117 |
| 2721 | 1708 |
| 2722 | 4637 |
| 2723 | 2591 |
| 2724 | 1734 |
| 2725 | 4869 |
| 2726 | 2283 |
| 2727 | 1453 |
| 2728 | 6401 |

TABLE Q1-continued

| with a sequence length of 8192: | |
|---|---|
| Reliability or reliability sequence number | Polarized channel sequence number |
| 2729 | 3172 |
| 2730 | 974 |
| 2731 | 4706 |
| 2732 | 2460 |
| 2733 | 1818 |
| 2734 | 5162 |
| 2735 | 2391 |
| 2736 | 1276 |
| 2737 | 4753 |
| 2738 | 2420 |
| 2739 | 4429 |
| 2740 | 1397 |
| 2741 | 3712 |
| 2742 | 4215 |
| 2743 | 2823 |
| 2744 | 1629 |
| 2745 | 5636 |
| 2746 | 2365 |
| 2747 | 954 |
| 2748 | 7169 |
| 2749 | 3123 |
| 2750 | 1872 |
| 2751 | 4696 |
| 2752 | 2270 |
| 2753 | 1714 |
| 2754 | 4435 |
| 2755 | 2474 |
| 2756 | 4314 |
| 2757 | 1737 |
| 2758 | 3220 |
| 2759 | 5169 |
| 2760 | 879 |
| 2761 | 2501 |
| 2762 | 4464 |
| 2763 | 1656 |
| 2764 | 2285 |
| 2765 | 4748 |
| 2766 | 3118 |
| 2767 | 1506 |
| 2768 | 4326 |
| 2769 | 2607 |
| 2770 | 1830 |
| 2771 | 6165 |
| 2772 | 2881 |
| 2773 | 5194 |
| 2774 | 981 |
| 2775 | 3147 |
| 2776 | 4487 |
| 2777 | 1451 |
| 2778 | 2852 |
| 2779 | 4409 |
| 2780 | 1928 |
| 2781 | 2760 |
| 2782 | 4546 |
| 2783 | 1438 |
| 2784 | 3338 |
| 2785 | 5392 |
| 2786 | 2882 |
| 2787 | 982 |
| 2788 | 4638 |
| 2789 | 2709 |
| 2790 | 6276 |
| 2791 | 1247 |
| 2792 | 3345 |
| 2793 | 4430 |
| 2794 | 1687 |
| 2795 | 2856 |
| 2796 | 4329 |
| 2797 | 1716 |
| 2798 | 2827 |
| 2799 | 5280 |
| 2800 | 1859 |
| 2801 | 3589 |
| 2802 | 4651 |
| 2803 | 927 |

TABLE Q1-continued

| with a sequence length of 8192: | |
|---|---|
| Reliability or reliability sequence number | Polarized channel sequence number |
| 2804 | 4870 |
| 2805 | 2665 |
| 2806 | 3176 |
| 2807 | 4271 |
| 2808 | 1643 |
| 2809 | 2652 |
| 2810 | 6179 |
| 2811 | 1496 |
| 2812 | 2481 |
| 2813 | 5640 |
| 2814 | 1479 |
| 2815 | 3234 |
| 2816 | 4219 |
| 2817 | 995 |
| 2818 | 4754 |
| 2819 | 2768 |
| 2820 | 1820 |
| 2821 | 4708 |
| 2822 | 2864 |
| 2823 | 1833 |
| 2824 | 5408 |
| 2825 | 3125 |
| 2826 | 2884 |
| 2827 | 6402 |
| 2828 | 1738 |
| 2829 | 4437 |
| 2830 | 2395 |
| 2831 | 1745 |
| 2832 | 4873 |
| 2833 | 3265 |
| 2834 | 765 |
| 2835 | 4316 |
| 2836 | 2945 |
| 2837 | 1861 |
| 2838 | 5648 |
| 2839 | 2291 |
| 2840 | 4410 |
| 2841 | 3224 |
| 2842 | 1740 |
| 2843 | 4520 |
| 2844 | 2710 |
| 2845 | 1888 |
| 2846 | 6170 |
| 2847 | 2502 |
| 2848 | 956 |
| 2849 | 4491 |
| 2850 | 3149 |
| 2851 | 5312 |
| 2852 | 1834 |
| 2853 | 2366 |
| 2854 | 4769 |
| 2855 | 1630 |
| 2856 | 2723 |
| 2857 | 4679 |
| 2858 | 3236 |
| 2859 | 1936 |
| 2860 | 4451 |
| 2861 | 2666 |
| 2862 | 5664 |
| 2863 | 1746 |
| 2864 | 2946 |
| 2865 | 6657 |
| 2866 | 887 |
| 2867 | 3840 |
| 2868 | 4383 |
| 2869 | 1720 |
| 2870 | 2829 |
| 2871 | 4279 |
| 2872 | 1401 |
| 2873 | 4330 |
| 2874 | 2424 |
| 2875 | 3340 |
| 2876 | 5190 |
| 2877 | 1459 |
| 2878 | 2476 |

TABLE Q1-continued with a sequence length of 8192:

| Reliability or reliability sequence number | Polarized channel sequence number |
|---|---|
| 2879 | 4221 |
| 2880 | 1841 |
| 2881 | 3346 |
| 2882 | 4653 |
| 2883 | 985 |
| 2884 | 6224 |
| 2885 | 2713 |
| 2886 | 1343 |
| 2887 | 4756 |
| 2888 | 2784 |
| 2889 | 3590 |
| 2890 | 5164 |
| 2891 | 1645 |
| 2892 | 4712 |
| 2893 | 2615 |
| 2894 | 1836 |
| 2895 | 4438 |
| 2896 | 2888 |
| 2897 | 997 |
| 2898 | 4412 |
| 2899 | 3126 |
| 2900 | 1508 |
| 2901 | 6181 |
| 2902 | 2673 |
| 2903 | 5251 |
| 2904 | 2286 |
| 2905 | 1454 |
| 2906 | 4337 |
| 2907 | 3155 |
| 2908 | 1862 |
| 2909 | 4874 |
| 2910 | 2407 |
| 2911 | 5201 |
| 2912 | 1691 |
| 2913 | 2505 |
| 2914 | 4659 |
| 2915 | 986 |
| 2916 | 3129 |
| 2917 | 4441 |
| 2918 | 2447 |
| 2919 | 6169 |
| 2920 | 1512 |
| 2921 | 2835 |
| 2922 | 4548 |
| 2923 | 1263 |
| 2924 | 3593 |
| 2925 | 5170 |
| 2926 | 1402 |
| 2927 | 4493 |
| 2928 | 2639 |
| 2929 | 3184 |
| 2930 | 4499 |
| 2931 | 1483 |
| 2932 | 2726 |
| 2933 | 4303 |
| 2934 | 943 |
| 2935 | 6166 |
| 2936 | 2482 |
| 2937 | 1646 |
| 2938 | 5193 |
| 2939 | 3207 |
| 2940 | 1651 |
| 2941 | 4770 |
| 2942 | 2725 |
| 2943 | 2397 |
| 2944 | 4654 |
| 2945 | 1461 |
| 2946 | 5135 |
| 2947 | 3150 |
| 2948 | 1404 |
| 2949 | 4881 |
| 2950 | 2293 |
| 2951 | 4528 |
| 2952 | 891 |
| 2953 | 2506 |

TABLE Q1-continued with a sequence length of 8192:

| Reliability or reliability sequence number | Polarized channel sequence number |
|---|---|
| 2954 | 6280 |
| 2955 | 3361 |
| 2956 | 1842 |
| 2957 | 4453 |
| 2958 | 2714 |
| 2959 | 5440 |
| 2960 | 1485 |
| 2961 | 3266 |
| 2962 | 4283 |
| 2963 | 1520 |
| 2964 | 2668 |
| 2965 | 4332 |
| 2966 | 1693 |
| 2967 | 4760 |
| 2968 | 2411 |
| 2969 | 3157 |
| 2970 | 6404 |
| 2971 | 998 |
| 2972 | 2175 |
| 2973 | 5253 |
| 2974 | 1703 |
| 2975 | 4720 |
| 2976 | 2239 |
| 2977 | 1748 |
| 2978 | 4683 |
| 2979 | 3348 |
| 2980 | 2830 |
| 2981 | 5172 |
| 2982 | 1865 |
| 2983 | 4876 |
| 2984 | 3594 |
| 2985 | 766 |
| 2986 | 6408 |
| 2987 | 2455 |
| 2988 | 1653 |
| 2989 | 4801 |
| 2990 | 2484 |
| 2991 | 4222 |
| 2992 | 3130 |
| 2993 | 1375 |
| 2994 | 5143 |
| 2995 | 2674 |
| 2996 | 4338 |
| 2997 | 1491 |
| 2998 | 2619 |
| 2999 | 4661 |
| 3000 | 1462 |
| 3001 | 3240 |
| 3002 | 5254 |
| 3003 | 2513 |
| 3004 | 6182 |
| 3005 | 511 |
| 3006 | 3211 |
| 3007 | 4494 |
| 3008 | 1761 |
| 3009 | 4442 |
| 3010 | 2729 |
| 3011 | 1275 |
| 3012 | 4552 |
| 3013 | 2294 |
| 3014 | 3171 |
| 3015 | 5504 |
| 3016 | 1486 |
| 3017 | 4454 |
| 3018 | 2755 |
| 3019 | 1466 |
| 3020 | 6658 |
| 3021 | 2398 |
| 3022 | 4501 |
| 3023 | 1465 |
| 3024 | 3158 |
| 3025 | 5196 |
| 3026 | 2647 |
| 3027 | 988 |
| 3028 | 4399 |

TABLE Q1-continued

| with a sequence length of 8192: | |
|---|---|
| Reliability or reliability sequence number | Polarized channel sequence number |
| 3029 | 3132 |
| 3030 | 4665 |
| 3031 | 1493 |
| 3032 | 2716 |
| 3033 | 4340 |
| 3034 | 1271 |
| 3035 | 6240 |
| 3036 | 2838 |
| 3037 | 3352 |
| 3038 | 5257 |
| 3039 | 1707 |
| 3040 | 2508 |
| 3041 | 4691 |
| 3042 | 1866 |
| 3043 | 4285 |
| 3044 | 2297 |
| 3045 | 3161 |
| 3046 | 5202 |
| 3047 | 1001 |
| 3048 | 4662 |
| 3049 | 2730 |
| 3050 | 1762 |
| 3051 | 6211 |
| 3052 | 3362 |
| 3053 | 1923 |
| 3054 | 4772 |
| 3055 | 2621 |
| 3056 | 4457 |
| 3057 | 2459 |
| 3058 | 1694 |
| 3059 | 5176 |
| 3060 | 3601 |
| 3061 | 4802 |
| 3062 | 1807 |
| 3063 | 2851 |
| 3064 | 4685 |
| 3065 | 951 |
| 3066 | 6185 |
| 3067 | 2837 |
| 3068 | 3596 |
| 3069 | 5147 |
| 3070 | 1873 |
| 3071 | 2757 |
| 3072 | 4311 |
| 3073 | 1844 |
| 3074 | 4882 |
| 3075 | 3268 |
| 3076 | 2413 |
| 3077 | 4743 |
| 3078 | 1752 |
| 3079 | 5217 |
| 3080 | 2488 |
| 3081 | 1952 |
| 3082 | 6288 |
| 3083 | 3213 |
| 3084 | 4444 |
| 3085 | 1002 |
| 3086 | 2676 |
| 3087 | 4515 |
| 3088 | 3173 |
| 3089 | 5159 |
| 3090 | 1815 |
| 3091 | 2737 |
| 3092 | 4502 |
| 3093 | 1391 |
| 3094 | 4560 |
| 3095 | 2422 |
| 3096 | 3219 |
| 3097 | 6172 |
| 3098 | 1925 |
| 3099 | 2471 |
| 3100 | 4776 |
| 3101 | 1654 |
| 3102 | 5379 |
| 3103 | 2514 |

TABLE Q1-continued

| with a sequence length of 8192: | |
|---|---|
| Reliability or reliability sequence number | Polarized channel sequence number |
| 3104 | 1709 |
| 3105 | 4897 |
| 3106 | 3248 |
| 3107 | 4458 |
| 3108 | 2841 |
| 3109 | 893 |
| 3110 | 5204 |
| 3111 | 3214 |
| 3112 | 6213 |
| 3113 | 1868 |
| 3114 | 2298 |
| 3115 | 4686 |
| 3116 | 2419 |
| 3117 | 4505 |
| 3118 | 1657 |
| 3119 | 3602 |
| 3120 | 5258 |
| 3121 | 1735 |
| 3122 | 4666 |
| 3123 | 2529 |
| 3124 | 3393 |
| 3125 | 6186 |
| 3126 | 1277 |
| 3127 | 4884 |
| 3128 | 2622 |
| 3129 | 975 |
| 3130 | 4693 |
| 3131 | 2461 |
| 3132 | 5265 |
| 3133 | 1715 |
| 3134 | 3103 |
| 3135 | 4668 |
| 3136 | 2651 |
| 3137 | 4315 |
| 3138 | 1848 |
| 3139 | 3272 |
| 3140 | 6660 |
| 3141 | 1926 |
| 3142 | 5381 |
| 3143 | 2414 |
| 3144 | 2516 |
| 3145 | 4407 |
| 3146 | 1710 |
| 3147 | 4804 |
| 3148 | 3162 |
| 3149 | 894 |
| 3150 | 5149 |
| 3151 | 2703 |
| 3152 | 4694 |
| 3153 | 3617 |
| 3154 | 1764 |
| 3155 | 6193 |
| 3156 | 2948 |
| 3157 | 4697 |
| 3158 | 1874 |
| 3159 | 2853 |
| 3160 | 5163 |
| 3161 | 3364 |
| 3162 | 4747 |
| 3163 | 1399 |
| 3164 | 2663 |
| 3165 | 4517 |
| 3166 | 1468 |
| 3167 | 7170 |
| 3168 | 3394 |
| 3169 | 2732 |
| 3170 | 4888 |
| 3171 | 1494 |
| 3172 | 5218 |
| 3173 | 2758 |
| 3174 | 1009 |
| 3175 | 4898 |
| 3176 | 3604 |
| 3177 | 4707 |
| 3178 | 2477 |

TABLE Q1-continued with a sequence length of 8192:

| Reliability or reliability sequence number | Polarized channel sequence number |
|---|---|
| 3179 | 1507 |
| 3180 | 5635 |
| 3181 | 3335 |
| 3182 | 6218 |
| 3183 | 1439 |
| 3184 | 2842 |
| 3185 | 4698 |
| 3186 | 2300 |
| 3187 | 4506 |
| 3188 | 1509 |
| 3189 | 3221 |
| 3190 | 5208 |
| 3191 | 1929 |
| 3192 | 4327 |
| 3193 | 2421 |
| 3194 | 3174 |
| 3195 | 4784 |
| 3196 | 1819 |
| 3197 | 6416 |
| 3198 | 2653 |
| 3199 | 955 |
| 3200 | 5260 |
| 3201 | 2896 |
| 3202 | 4749 |
| 3203 | 3177 |
| 3204 | 4344 |
| 3205 | 1497 |
| 3206 | 2738 |
| 3207 | 5150 |
| 3208 | 1658 |
| 3209 | 6304 |
| 3210 | 3376 |
| 3211 | 2761 |
| 3212 | 4465 |
| 3213 | 1768 |
| 3214 | 4286 |
| 3215 | 3368 |
| 3216 | 1876 |
| 3217 | 4460 |
| 3218 | 2680 |
| 3219 | 5266 |
| 3220 | 2530 |
| 3221 | 1984 |
| 3222 | 4750 |
| 3223 | 3235 |
| 3224 | 6664 |
| 3225 | 1004 |
| 3226 | 4755 |
| 3227 | 2854 |
| 3228 | 3164 |
| 3229 | 5191 |
| 3230 | 1889 |
| 3231 | 4431 |
| 3232 | 2475 |
| 3233 | 1717 |
| 3234 | 4576 |
| 3235 | 2952 |
| 3236 | 6432 |
| 3237 | 3119 |
| 3238 | 1821 |
| 3239 | 5382 |
| 3240 | 2462 |
| 3241 | 4411 |
| 3242 | 1930 |
| 3243 | 3339 |
| 3244 | 4317 |
| 3245 | 2271 |
| 3246 | 5385 |
| 3247 | 1010 |
| 3248 | 6672 |
| 3249 | 2711 |
| 3250 | 1739 |
| 3251 | 4466 |
| 3252 | 3457 |
| 3253 | 4709 |

TABLE Q1-continued with a sequence length of 8192:

| Reliability or reliability sequence number | Polarized channel sequence number |
|---|---|
| 3254 | 2740 |
| 3255 | 1831 |
| 3256 | 5281 |
| 3257 | 3618 |
| 3258 | 4518 |
| 3259 | 2883 |
| 3260 | 4521 |
| 3261 | 1498 |
| 3262 | 3396 |
| 3263 | 6336 |
| 3264 | 1660 |
| 3265 | 5696 |
| 3266 | 2667 |
| 3267 | 2520 |
| 3268 | 4547 |
| 3269 | 1718 |
| 3270 | 4710 |
| 3271 | 3280 |
| 3272 | 957 |
| 3273 | 5165 |
| 3274 | 2503 |
| 3275 | 6688 |
| 3276 | 3458 |
| 3277 | 4639 |
| 3278 | 1278 |
| 3279 | 2844 |
| 3280 | 4331 |
| 3281 | 1741 |
| 3282 | 5220 |
| 3283 | 2857 |
| 3284 | 3222 |
| 3285 | 4508 |
| 3286 | 1599 |
| 3287 | 6214 |
| 3288 | 2762 |
| 3289 | 4439 |
| 3290 | 3225 |
| 3291 | 1937 |
| 3292 | 4468 |
| 3293 | 2769 |
| 3294 | 5760 |
| 3295 | 1822 |
| 3296 | 3237 |
| 3297 | 4871 |
| 3298 | 2885 |
| 3299 | 4413 |
| 3300 | 983 |
| 3301 | 6188 |
| 3302 | 2764 |
| 3303 | 1835 |
| 3304 | 5171 |
| 3305 | 3178 |
| 3306 | 4318 |
| 3307 | 2912 |
| 3308 | 4522 |
| 3309 | 1403 |
| 3310 | 3127 |
| 3311 | 5268 |
| 3312 | 2858 |
| 3313 | 6275 |
| 3314 | 1721 |
| 3315 | 3400 |
| 3316 | 4549 |
| 3317 | 1455 |
| 3318 | 4333 |
| 3319 | 2654 |
| 3320 | 5166 |
| 3321 | 2960 |
| 3322 | 1631 |
| 3323 | 4655 |
| 3324 | 3608 |
| 3325 | 6225 |
| 3326 | 1513 |
| 3327 | 2770 |
| 3328 | 4929 |

TABLE Q1-continued with a sequence length of 8192:

| Reliability or reliability sequence number | Polarized channel sequence number |
|---|---|
| 3329 | 3649 |
| 3330 | 5195 |
| 3331 | 958 |
| 3332 | 4900 |
| 3333 | 2744 |
| 3334 | 3620 |
| 3335 | 4808 |
| 3336 | 1890 |
| 3337 | 6194 |
| 3338 | 2425 |
| 3339 | 5386 |
| 3340 | 1747 |
| 3341 | 2483 |
| 3342 | 4930 |
| 3343 | 3185 |
| 3344 | 4757 |
| 3345 | 1510 |
| 3346 | 5393 |
| 3347 | 2865 |
| 3348 | 3226 |
| 3349 | 6217 |
| 3350 | 1932 |
| 3351 | 4904 |
| 3352 | 2367 |
| 3353 | 4875 |
| 3354 | 1742 |
| 3355 | 3151 |
| 3356 | 5637 |
| 3357 | 2669 |
| 3358 | 4713 |
| 3359 | 987 |
| 3360 | 3341 |
| 3361 | 5224 |
| 3362 | 2860 |
| 3363 | 6159 |
| 3364 | 1837 |
| 3365 | 4700 |
| 3366 | 2532 |
| 3367 | 1500 |
| 3368 | 4529 |
| 3369 | 3180 |
| 3370 | 5282 |
| 3371 | 2478 |
| 3372 | 4816 |
| 3373 | 1880 |
| 3374 | 3650 |
| 3375 | 6464 |
| 3376 | 2886 |
| 3377 | 4912 |
| 3378 | 1863 |
| 3379 | 5173 |
| 3380 | 3296 |
| 3381 | 1749 |
| 3382 | 4932 |
| 3383 | 2715 |
| 3384 | 4443 |
| 3385 | 2536 |
| 3386 | 6277 |
| 3387 | 1012 |
| 3388 | 3238 |
| 3389 | 5313 |
| 3390 | 2287 |
| 3391 | 4993 |
| 3392 | 1722 |
| 3393 | 4339 |
| 3394 | 3591 |
| 3395 | 1938 |
| 3396 | 5272 |
| 3397 | 2426 |
| 3398 | 6196 |
| 3399 | 3624 |
| 3400 | 4758 |
| 3401 | 1776 |
| 3402 | 2507 |
| 3403 | 4550 |

TABLE Q1-continued with a sequence length of 8192:

| Reliability or reliability sequence number | Polarized channel sequence number |
|---|---|
| 3404 | 3267 |
| 3405 | 5197 |
| 3406 | 1892 |
| 3407 | 4414 |
| 3408 | 2670 |
| 3409 | 7172 |
| 3410 | 1843 |
| 3411 | 2675 |
| 3412 | 4771 |
| 3413 | 3342 |
| 3414 | 5284 |
| 3415 | 1838 |
| 3416 | 4714 |
| 3417 | 2485 |
| 3418 | 3713 |
| 3419 | 4994 |
| 3420 | 999 |
| 3421 | 6167 |
| 3422 | 2428 |
| 3423 | 5888 |
| 3424 | 1463 |
| 3425 | 3595 |
| 3426 | 4877 |
| 3427 | 2866 |
| 3428 | 4472 |
| 3429 | 1953 |
| 3430 | 6278 |
| 3431 | 3347 |
| 3432 | 2509 |
| 3433 | 5388 |
| 3434 | 1514 |
| 3435 | 4524 |
| 3436 | 2544 |
| 3437 | 5394 |
| 3438 | 3652 |
| 3439 | 4761 |
| 3440 | 1647 |
| 3441 | 2717 |
| 3442 | 6528 |
| 3443 | 1695 |
| 3444 | 4832 |
| 3445 | 3363 |
| 3446 | 5638 |
| 3447 | 2727 |
| 3448 | 1763 |
| 3449 | 4663 |
| 3450 | 3131 |
| 3451 | 4936 |
| 3452 | 2772 |
| 3453 | 6220 |
| 3454 | 1016 |
| 3455 | 3241 |
| 3456 | 5174 |
| 3457 | 2889 |
| 3458 | 4721 |
| 3459 | 1940 |
| 3460 | 4334 |
| 3461 | 2677 |
| 3462 | 5203 |
| 3463 | 1487 |
| 3464 | 3632 |
| 3465 | 6281 |
| 3466 | 2399 |
| 3467 | 4455 |
| 3468 | 1867 |
| 3469 | 4553 |
| 3470 | 3186 |
| 3471 | 5177 |
| 3472 | 2515 |
| 3473 | 1405 |
| 3474 | 4495 |
| 3475 | 3349 |
| 3476 | 6226 |
| 3477 | 2486 |
| 3478 | 4883 |

TABLE Q1-continued

| with a sequence length of 8192: | |
|---|---|
| Reliability or reliability sequence number | Polarized channel sequence number |
| 3479 | 1521 |
| 3480 | 3228 |
| 3481 | 5641 |
| 3482 | 2785 |
| 3483 | 4687 |
| 3484 | 767 |
| 3485 | 5232 |
| 3486 | 3159 |
| 3487 | 6200 |
| 3488 | 1954 |
| 3489 | 2299 |
| 3490 | 4774 |
| 3491 | 3269 |
| 3492 | 4530 |
| 3493 | 1845 |
| 3494 | 5255 |
| 3495 | 2510 |
| 3496 | 6171 |
| 3497 | 2490 |
| 3498 | 1750 |
| 3499 | 4773 |
| 3500 | 3188 |
| 3501 | 4445 |
| 3502 | 2489 |
| 3503 | 5198 |
| 3504 | 1985 |
| 3505 | 4341 |
| 3506 | 3242 |
| 3507 | 1896 |
| 3508 | 6241 |
| 3509 | 2517 |
| 3510 | 4554 |
| 3511 | 3133 |
| 3512 | 5409 |
| 3513 | 1516 |
| 3514 | 4762 |
| 3515 | 2295 |
| 3516 | 3603 |
| 3517 | 5314 |
| 3518 | 1655 |
| 3519 | 6183 |
| 3520 | 2731 |
| 3521 | 4716 |
| 3522 | 3597 |
| 3523 | 4459 |
| 3524 | 989 |
| 3525 | 2890 |
| 3526 | 5205 |
| 3527 | 3714 |
| 3528 | 6403 |
| 3529 | 1753 |
| 3530 | 4223 |
| 3531 | 2786 |
| 3532 | 4287 |
| 3533 | 2947 |
| 3534 | 1724 |
| 3535 | 5396 |
| 3536 | 3353 |
| 3537 | 4878 |
| 3538 | 1467 |
| 3539 | 6228 |
| 3540 | 2718 |
| 3541 | 5642 |
| 3542 | 3350 |
| 3543 | 1765 |
| 3544 | 4503 |
| 3545 | 2831 |
| 3546 | 4532 |
| 3547 | 3598 |
| 3548 | 5178 |
| 3549 | 1869 |
| 3550 | 6282 |
| 3551 | 2897 |
| 3552 | 4722 |
| 3553 | 3249 |

TABLE Q1-continued

| with a sequence length of 8192: | |
|---|---|
| Reliability or reliability sequence number | Polarized channel sequence number |
| 3554 | 1944 |
| 3555 | 4667 |
| 3556 | 2868 |
| 3557 | 5288 |
| 3558 | 3365 |
| 3559 | 6289 |
| 3560 | 1003 |
| 3561 | 4561 |
| 3562 | 2776 |
| 3563 | 3460 |
| 3564 | 5259 |
| 3565 | 1406 |
| 3566 | 4777 |
| 3567 | 2976 |
| 3568 | 4342 |
| 3569 | 3163 |
| 3570 | 6405 |
| 3571 | 1846 |
| 3572 | 5219 |
| 3573 | 2839 |
| 3574 | 1875 |
| 3575 | 4803 |
| 3576 | 2415 |
| 3577 | 4446 |
| 3578 | 3656 |
| 3579 | 7176 |
| 3580 | 1754 |
| 3581 | 5206 |
| 3582 | 2949 |
| 3583 | 3841 |
| 3584 | 4695 |
| 3585 | 1522 |
| 3586 | 5180 |
| 3587 | 2678 |
| 3588 | 4764 |
| 3589 | 3270 |
| 3590 | 6173 |
| 3591 | 1904 |
| 3592 | 4886 |
| 3593 | 2733 |
| 3594 | 3244 |
| 3595 | 5400 |
| 3596 | 990 |
| 3597 | 4556 |
| 3598 | 2892 |
| 3599 | 6187 |
| 3600 | 3192 |
| 3601 | 4345 |
| 3602 | 1766 |
| 3603 | 5209 |
| 3604 | 2681 |
| 3605 | 3273 |
| 3606 | 4778 |
| 3607 | 1469 |
| 3608 | 5410 |
| 3609 | 2759 |
| 3610 | 6242 |
| 3611 | 3408 |
| 3612 | 4669 |
| 3613 | 1495 |
| 3614 | 4507 |
| 3615 | 2301 |
| 3616 | 5649 |
| 3617 | 3134 |
| 3618 | 1659 |
| 3619 | 6659 |
| 3620 | 2739 |
| 3621 | 4899 |
| 3622 | 3354 |
| 3623 | 4885 |
| 3624 | 1956 |
| 3625 | 5644 |
| 3626 | 2872 |
| 3627 | 4805 |
| 3628 | 3215 |

TABLE Q1-continued with a sequence length of 8192:

| Reliability or reliability sequence number | Polarized channel sequence number |
|---|---|
| 3629 | 1711 |
| 3630 | 6232 |
| 3631 | 2950 |
| 3632 | 5316 |
| 3633 | 3175 |
| 3634 | 4461 |
| 3635 | 1927 |
| 3636 | 4536 |
| 3637 | 2734 |
| 3638 | 6284 |
| 3639 | 1005 |
| 3640 | 5261 |
| 3641 | 2788 |
| 3642 | 3250 |
| 3643 | 4724 |
| 3644 | 1849 |
| 3645 | 5221 |
| 3646 | 2898 |
| 3647 | 4785 |
| 3648 | 3366 |
| 3649 | 6174 |
| 3650 | 1524 |
| 3651 | 4470 |
| 3652 | 2423 |
| 3653 | 5267 |
| 3654 | 3165 |
| 3655 | 1870 |
| 3656 | 4519 |
| 3657 | 2492 |
| 3658 | 6290 |
| 3659 | 3716 |
| 3660 | 4562 |
| 3661 | 1769 |
| 3662 | 5296 |
| 3663 | 2518 |
| 3664 | 4889 |
| 3665 | 3274 |
| 3666 | 6215 |
| 3667 | 1850 |
| 3668 | 2531 |
| 3669 | 5262 |
| 3670 | 3664 |
| 3671 | 4346 |
| 3672 | 1756 |
| 3673 | 4467 |
| 3674 | 2463 |
| 3675 | 5650 |
| 3676 | 3395 |
| 3677 | 6406 |
| 3678 | 1470 |
| 3679 | 4577 |
| 3680 | 2533 |
| 3681 | 3464 |
| 3682 | 5441 |
| 3683 | 959 |
| 3684 | 4670 |
| 3685 | 2953 |
| 3686 | 6409 |
| 3687 | 3369 |
| 3688 | 4509 |
| 3689 | 1986 |
| 3690 | 5151 |
| 3691 | 2843 |
| 3692 | 4699 |
| 3693 | 3842 |
| 3694 | 6305 |
| 3695 | 1960 |
| 3696 | 2521 |
| 3697 | 5320 |
| 3698 | 3179 |
| 3699 | 4462 |
| 3700 | 1499 |
| 3701 | 4564 |
| 3702 | 2682 |
| 3703 | 5210 |

TABLE Q1-continued with a sequence length of 8192:

| Reliability or reliability sequence number | Polarized channel sequence number |
|---|---|
| 3704 | 3252 |
| 3705 | 6720 |
| 3706 | 1877 |
| 3707 | 4751 |
| 3708 | 2792 |
| 3709 | 5665 |
| 3710 | 3223 |
| 3711 | 1891 |
| 3712 | 4996 |
| 3713 | 2900 |
| 3714 | 6189 |
| 3715 | 3281 |
| 3716 | 4901 |
| 3717 | 3008 |
| 3718 | 5412 |
| 3719 | 1661 |
| 3720 | 4711 |
| 3721 | 3356 |
| 3722 | 7184 |
| 3723 | 2913 |
| 3724 | 5442 |
| 3725 | 1931 |
| 3726 | 4780 |
| 3727 | 3720 |
| 3728 | 2741 |
| 3729 | 4806 |
| 3730 | 1011 |
| 3731 | 6244 |
| 3732 | 3166 |
| 3733 | 5652 |
| 3734 | 2845 |
| 3735 | 4525 |
| 3736 | 1511 |
| 3737 | 5383 |
| 3738 | 3276 |
| 3739 | 6784 |
| 3740 | 2954 |
| 3741 | 4890 |
| 3742 | 1719 |
| 3743 | 4348 |
| 3744 | 3370 |
| 3745 | 5269 |
| 3746 | 2763 |
| 3747 | 1770 |
| 3748 | 4469 |
| 3749 | 3472 |
| 3750 | 6195 |
| 3751 | 2855 |
| 3752 | 5222 |
| 3753 | 1852 |
| 3754 | 4701 |
| 3755 | 3680 |
| 3756 | 4944 |
| 3757 | 2522 |
| 3758 | 6292 |
| 3759 | 1777 |
| 3760 | 5225 |
| 3761 | 3424 |
| 3762 | 4786 |
| 3763 | 2684 |
| 3764 | 5424 |
| 3765 | 1878 |
| 3766 | 3397 |
| 3767 | 6190 |
| 3768 | 2742 |
| 3769 | 4809 |
| 3770 | 1881 |
| 3771 | 5416 |
| 3772 | 3605 |
| 3773 | 4728 |
| 3774 | 2302 |
| 3775 | 6219 |
| 3776 | 1013 |
| 3777 | 4578 |
| 3778 | 3227 |

TABLE Q1-continued

| with a sequence length of 8192: | |
|---|---|
| Reliability or reliability sequence number | Polarized channel sequence number |
| 3779 | 5283 |
| 3780 | 2765 |
| 3781 | 4902 |
| 3782 | 1528 |
| 3783 | 6410 |
| 3784 | 3282 |
| 3785 | 5212 |
| 3786 | 2623 |
| 3787 | 3377 |
| 3788 | 4523 |
| 3789 | 1823 |
| 3790 | 5000 |
| 3791 | 2961 |
| 3792 | 6417 |
| 3793 | 3619 |
| 3794 | 5167 |
| 3795 | 1279 |
| 3796 | 4510 |
| 3797 | 2846 |
| 3798 | 5387 |
| 3799 | 3372 |
| 3800 | 6661 |
| 3801 | 1988 |
| 3802 | 4319 |
| 3803 | 2859 |
| 3804 | 4759 |
| 3805 | 3181 |
| 3806 | 5505 |
| 3807 | 1933 |
| 3808 | 6248 |
| 3809 | 2427 |
| 3810 | 4788 |
| 3811 | 3256 |
| 3812 | 1743 |
| 3813 | 5666 |
| 3814 | 2745 |
| 3815 | 4931 |
| 3816 | 3606 |
| 3817 | 6306 |
| 3818 | 1501 |
| 3819 | 5444 |
| 3820 | 2479 |
| 3821 | 4715 |
| 3822 | 2655 |
| 3823 | 4568 |
| 3824 | 2537 |
| 3825 | 6197 |
| 3826 | 1939 |
| 3827 | 5328 |
| 3828 | 3609 |
| 3829 | 4551 |
| 3830 | 2914 |
| 3831 | 5506 |
| 3832 | 895 |
| 3833 | 6337 |
| 3834 | 3187 |
| 3835 | 4892 |
| 3836 | 2771 |
| 3837 | 4905 |
| 3838 | 1662 |
| 3839 | 3239 |
| 3840 | 5270 |
| 3841 | 2534 |
| 3842 | 7200 |
| 3843 | 1772 |
| 3844 | 4810 |
| 3845 | 3297 |
| 3846 | 5273 |
| 3847 | 2956 |
| 3848 | 4817 |
| 3849 | 1968 |
| 3850 | 6296 |
| 3851 | 3398 |
| 3852 | 5285 |
| 3853 | 2766 |

TABLE Q1-continued

| with a sequence length of 8192: | |
|---|---|
| Reliability or reliability sequence number | Polarized channel sequence number |
| 3854 | 4933 |
| 3855 | 3378 |
| 3856 | 4812 |
| 3857 | 1893 |
| 3858 | 6221 |
| 3859 | 2861 |
| 3860 | 5226 |
| 3861 | 3844 |
| 3862 | 4960 |
| 3863 | 1515 |
| 3864 | 5175 |
| 3865 | 2524 |
| 3866 | 6308 |
| 3867 | 3229 |
| 3868 | 4906 |
| 3869 | 1723 |
| 3870 | 5448 |
| 3871 | 2904 |
| 3872 | 4702 |
| 3873 | 3728 |
| 3874 | 6912 |
| 3875 | 1778 |
| 3876 | 5008 |
| 3877 | 2887 |
| 3878 | 3401 |
| 3879 | 5656 |
| 3880 | 1882 |
| 3881 | 4818 |
| 3882 | 2773 |
| 3883 | 6412 |
| 3884 | 3182 |
| 3885 | 5697 |
| 3886 | 2746 |
| 3887 | 4792 |
| 3888 | 1006 |
| 3889 | 5668 |
| 3890 | 3189 |
| 3891 | 6418 |
| 3892 | 2962 |
| 3893 | 4473 |
| 3894 | 1502 |
| 3895 | 4531 |
| 3896 | 3284 |
| 3897 | 5233 |
| 3898 | 2800 |
| 3899 | 6662 |
| 3900 | 1992 |
| 3901 | 4913 |
| 3902 | 3243 |
| 3903 | 5274 |
| 3904 | 2916 |
| 3905 | 4415 |
| 3906 | 3848 |
| 3907 | 6198 |
| 3908 | 1407 |
| 3909 | 5199 |
| 3910 | 2867 |
| 3911 | 4717 |
| 3912 | 3402 |
| 3913 | 5389 |
| 3914 | 1934 |
| 3915 | 6227 |
| 3916 | 2862 |
| 3917 | 4908 |
| 3918 | 3298 |
| 3919 | 4580 |
| 3920 | 1839 |
| 3921 | 5228 |
| 3922 | 2487 |
| 3923 | 6201 |
| 3924 | 3621 |
| 3925 | 4526 |
| 3926 | 2000 |
| 3927 | 5698 |
| 3928 | 2977 |

TABLE Q1-continued

| with a sequence length of 8192: | |
|---|---|
| Reliability or reliability sequence number | Polarized channel sequence number |
| 3929 | 4934 |
| 3930 | 3610 |
| 3931 | 6665 |
| 3932 | 2538 |
| 3933 | 5344 |
| 3934 | 1894 |
| 3935 | 4763 |
| 3936 | 3459 |
| 3937 | 7171 |
| 3938 | 2671 |
| 3939 | 4584 |
| 3940 | 1941 |
| 3941 | 5286 |
| 3942 | 3380 |
| 3943 | 4335 |
| 3944 | 2719 |
| 3945 | 6256 |
| 3946 | 1014 |
| 3947 | 5639 |
| 3948 | 3288 |
| 3949 | 4474 |
| 3950 | 2787 |
| 3951 | 5672 |
| 3952 | 3488 |
| 3953 | 6279 |
| 3954 | 1751 |
| 3955 | 4555 |
| 3956 | 2964 |
| 3957 | 5315 |
| 3958 | 3343 |
| 3959 | 4718 |
| 3960 | 1517 |
| 3961 | 6222 |
| 3962 | 2511 |
| 3963 | 4723 |
| 3964 | 3351 |
| 3965 | 5390 |
| 3966 | 2891 |
| 3967 | 1897 |
| 3968 | 4533 |
| 3969 | 6433 |
| 3970 | 3230 |
| 3971 | 5761 |
| 3972 | 2429 |
| 3973 | 4476 |
| 3974 | 1725 |
| 3975 | 6338 |
| 3976 | 3409 |
| 3977 | 5643 |
| 3978 | 2545 |
| 3979 | 4914 |
| 3980 | 1955 |
| 3981 | 5395 |
| 3982 | 3622 |
| 3983 | 6229 |
| 3984 | 2978 |
| 3985 | 4557 |
| 3986 | 3744 |
| 3987 | 4592 |
| 3988 | 1780 |
| 3989 | 5700 |
| 3990 | 2869 |
| 3991 | 6420 |
| 3992 | 3190 |
| 3993 | 4765 |
| 3994 | 1884 |
| 3995 | 5411 |
| 3996 | 2774 |
| 3997 | 6666 |
| 3998 | 3404 |
| 3999 | 4775 |
| 4000 | 1523 |
| 4001 | 5179 |
| 4002 | 3651 |
| 4003 | 4820 |

TABLE Q1-continued

| with a sequence length of 8192: | |
|---|---|
| Reliability or reliability sequence number | Polarized channel sequence number |
| 4004 | 3009 |
| 4005 | 6202 |
| 4006 | 3612 |
| 4007 | 5289 |
| 4008 | 1755 |
| 4009 | 4937 |
| 4010 | 2920 |
| 4011 | 4725 |
| 4012 | 3461 |
| 4013 | 6312 |
| 4014 | 1017 |
| 4015 | 5680 |
| 4016 | 2540 |
| 4017 | 4447 |
| 4018 | 3245 |
| 4019 | 5234 |
| 4020 | 2679 |
| 4021 | 7173 |
| 4022 | 1847 |
| 4023 | 4563 |
| 4024 | 3193 |
| 4025 | 5397 |
| 4026 | 2777 |
| 4027 | 6283 |
| 4028 | 1946 |
| 4029 | 4534 |
| 4030 | 3625 |
| 4031 | 5276 |
| 4032 | 2748 |
| 4033 | 4833 |
| 4034 | 3271 |
| 4035 | 6243 |
| 4036 | 1898 |
| 4037 | 5207 |
| 4038 | 2491 |
| 4039 | 4347 |
| 4040 | 3856 |
| 4041 | 5317 |
| 4042 | 1942 |
| 4043 | 6230 |
| 4044 | 2789 |
| 4045 | 4558 |
| 4046 | 3251 |
| 4047 | 4538 |
| 4048 | 2893 |
| 4049 | 6204 |
| 4050 | 1526 |
| 4051 | 5236 |
| 4052 | 3300 |
| 4053 | 4537 |
| 4054 | 2968 |
| 4055 | 5290 |
| 4056 | 1957 |
| 4057 | 6424 |
| 4058 | 4565 |
| 4059 | 3410 |
| 4060 | 5181 |
| 4061 | 2430 |
| 4062 | 6233 |
| 4063 | 3384 |
| 4064 | 4343 |
| 4065 | 1767 |
| 4066 | 5651 |
| 4067 | 2870 |
| 4068 | 4779 |
| 4069 | 3776 |
| 4070 | 6434 |
| 4071 | 1784 |
| 4072 | 5645 |
| 4073 | 3462 |
| 4074 | 4938 |
| 4075 | 2899 |
| 4076 | 5762 |
| 4077 | 3246 |
| 4078 | 6673 |

TABLE Q1-continued with a sequence length of 8192:

| Reliability or reliability sequence number | Polarized channel sequence number |
|---|---|
| 4079 | 1905 |
| 4080 | 4834 |
| 4081 | 2778 |
| 4082 | 4995 |
| 4083 | 3626 |
| 4084 | 6668 |
| 4085 | 1018 |
| 4086 | 5401 |
| 4087 | 2546 |
| 4088 | 4766 |
| 4089 | 3653 |
| 4090 | 5398 |
| 4091 | 2928 |
| 4092 | 6340 |
| 4093 | 1518 |
| 4094 | 4879 |
| 4095 | 3465 |
| 4096 | 2790 |
| 4097 | 1726 |
| 4098 | 5646 |
| 4099 | 3355 |
| 4100 | 7232 |
| 4101 | 2493 |
| 4102 | 4945 |
| 4103 | 3194 |
| 4104 | 5297 |
| 4105 | 1945 |
| 4106 | 4916 |
| 4107 | 2519 |
| 4108 | 6285 |
| 4109 | 3520 |
| 4110 | 5413 |
| 4111 | 1525 |
| 4112 | 4824 |
| 4113 | 3425 |
| 4114 | 6245 |
| 4115 | 2683 |
| 4116 | 5508 |
| 4117 | 3633 |
| 4118 | 5024 |
| 4119 | 1900 |
| 4120 | 5211 |
| 4121 | 2980 |
| 4122 | 6291 |
| 4123 | 3275 |
| 4124 | 4887 |
| 4125 | 2735 |
| 4126 | 4463 |
| 4127 | 1871 |
| 4128 | 6320 |
| 4129 | 3135 |
| 4130 | 5704 |
| 4131 | 2951 |
| 4132 | 4997 |
| 4133 | 2016 |
| 4134 | 3412 |
| 4135 | 5889 |
| 4136 | 2873 |
| 4137 | 6286 |
| 4138 | 3466 |
| 4139 | 4726 |
| 4140 | 1471 |
| 4141 | 5318 |
| 4142 | 2548 |
| 4143 | 6674 |
| 4144 | 3599 |
| 4145 | 4781 |
| 4146 | 1757 |
| 4147 | 5292 |
| 4148 | 3654 |
| 4149 | 4940 |
| 4150 | 2894 |
| 4151 | 6465 |
| 4152 | 3628 |
| 4153 | 5240 |

TABLE Q1-continued with a sequence length of 8192:

| Reliability or reliability sequence number | Polarized channel sequence number |
|---|---|
| 4154 | 1851 |
| 4155 | 4729 |
| 4156 | 2793 |
| 4157 | 6175 |
| 4158 | 3253 |
| 4159 | 5321 |
| 4160 | 2874 |
| 4161 | 4807 |
| 4162 | 991 |
| 4163 | 5456 |
| 4164 | 3367 |
| 4165 | 6344 |
| 4166 | 2780 |
| 4167 | 4349 |
| 4168 | 1958 |
| 4169 | 5182 |
| 4170 | 3357 |
| 4171 | 7177 |
| 4172 | 2494 |
| 4173 | 4787 |
| 4174 | 3304 |
| 4175 | 5402 |
| 4176 | 1906 |
| 4177 | 4920 |
| 4178 | 3196 |
| 4179 | 6234 |
| 4180 | 3010 |
| 4181 | 5263 |
| 4182 | 3277 |
| 4183 | 4998 |
| 4184 | 1961 |
| 4185 | 6689 |
| 4186 | 2984 |
| 4187 | 5223 |
| 4188 | 3254 |
| 4189 | 4782 |
| 4190 | 2523 |
| 4191 | 4836 |
| 4192 | 1987 |
| 4193 | 6436 |
| 4194 | 3715 |
| 4195 | 5298 |
| 4196 | 2901 |
| 4197 | 4946 |
| 4198 | 1771 |
| 4199 | 6466 |
| 4200 | 3634 |
| 4201 | 5414 |
| 4202 | 2915 |
| 4203 | 4471 |
| 4204 | 3358 |
| 4205 | 6676 |
| 4206 | 1529 |
| 4207 | 5213 |
| 4208 | 3657 |
| 4209 | 4540 |
| 4210 | 2685 |
| 4211 | 5764 |
| 4212 | 3371 |
| 4213 | 6407 |
| 4214 | 1879 |
| 4215 | 4566 |
| 4216 | 2955 |
| 4217 | 5322 |
| 4218 | 3426 |
| 4219 | 6293 |
| 4220 | 2535 |
| 4221 | 4579 |
| 4222 | 1948 |
| 4223 | 5712 |
| 4224 | 3283 |
| 4225 | 4511 |
| 4226 | 2743 |
| 4227 | 6246 |
| 4228 | 1758 |

TABLE Q1-continued

| with a sequence length of 8192: | |
|---|---|
| Reliability or reliability sequence number | Polarized channel sequence number |
| 4229 | 5443 |
| 4230 | 3473 |
| 4231 | 4581 |
| 4232 | 3257 |
| 4233 | 6249 |
| 4234 | 2794 |
| 4235 | 5512 |
| 4236 | 1853 |
| 4237 | 5001 |
| 4238 | 3468 |
| 4239 | 7174 |
| 4240 | 2876 |
| 4241 | 5417 |
| 4242 | 3416 |
| 4243 | 4891 |
| 4244 | 1020 |
| 4245 | 5890 |
| 4246 | 2801 |
| 4247 | 6448 |
| 4248 | 3658 |
| 4249 | 4569 |
| 4250 | 2902 |
| 4251 | 5227 |
| 4252 | 1989 |
| 4253 | 6440 |
| 4254 | 3717 |
| 4255 | 4730 |
| 4256 | 3665 |
| 4257 | 5300 |
| 4258 | 1962 |
| 4259 | 6307 |
| 4260 | 2905 |
| 4261 | 4840 |
| 4262 | 3607 |
| 4263 | 5271 |
| 4264 | 2552 |
| 4265 | 4948 |
| 4266 | 1908 |
| 4267 | 6236 |
| 4268 | 3312 |
| 4269 | 5329 |
| 4270 | 2847 |
| 4271 | 5056 |
| 4272 | 3278 |
| 4273 | 6191 |
| 4274 | 1530 |
| 4275 | 5404 |
| 4276 | 3167 |
| 4277 | 4961 |
| 4278 | 2303 |
| 4279 | 6411 |
| 4280 | 3399 |
| 4281 | 5768 |
| 4282 | 1773 |
| 4283 | 4789 |
| 4284 | 3012 |
| 4285 | 6529 |
| 4286 | 3636 |
| 4287 | 5214 |
| 4288 | 2957 |
| 4289 | 4893 |
| 4290 | 1969 |
| 4291 | 5324 |
| 4292 | 3872 |
| 4293 | 6690 |
| 4294 | 2767 |
| 4295 | 5002 |
| 4296 | 3474 |
| 4297 | 5418 |
| 4298 | 1990 |
| 4299 | 6468 |
| 4300 | 3428 |
| 4301 | 4811 |
| 4302 | 2525 |
| 4303 | 5520 |

TABLE Q1-continued

| with a sequence length of 8192: | |
|---|---|
| Reliability or reliability sequence number | Polarized channel sequence number |
| 4304 | 3379 |
| 4305 | 7185 |
| 4306 | 1779 |
| 4307 | 4903 |
| 4308 | 2963 |
| 4309 | 5728 |
| 4310 | 3373 |
| 4311 | 4570 |
| 4312 | 2686 |
| 4313 | 6352 |
| 4314 | 5472 |
| 4315 | 1883 |
| 4316 | 4732 |
| 4317 | 3489 |
| 4318 | 6530 |
| 4319 | 3285 |
| 4320 | 5445 |
| 4321 | 2796 |
| 4322 | 4790 |
| 4323 | 1964 |
| 4324 | 6294 |
| 4325 | 3640 |
| 4326 | 5653 |
| 4327 | 2992 |
| 4328 | 4350 |
| 4329 | 3904 |
| 4330 | 6297 |
| 4331 | 1854 |
| 4332 | 5275 |
| 4333 | 2917 |
| 4334 | 4813 |
| 4335 | 3660 |
| 4336 | 6309 |
| 4337 | 3258 |
| 4338 | 5330 |
| 4339 | 1935 |
| 4340 | 4671 |
| 4341 | 2539 |
| 4342 | 5425 |
| 4343 | 3718 |
| 4344 | 6250 |
| 4345 | 2747 |
| 4346 | 5009 |
| 4347 | 1007 |
| 4348 | 5667 |
| 4349 | 3476 |
| 4350 | 6199 |
| 4351 | 4894 |
| 4352 | 3299 |
| 4353 | 5420 |
| 4354 | 2802 |
| 4355 | 7178 |
| 4356 | 1895 |
| 4357 | 4907 |
| 4358 | 3968 |
| 4359 | 5229 |
| 4360 | 2906 |
| 4361 | 6472 |
| 4362 | 3666 |
| 4363 | 4475 |
| 4364 | 1663 |
| 4365 | 5304 |
| 4366 | 2526 |
| 4367 | 6680 |
| 4368 | 3490 |
| 4369 | 4793 |
| 4370 | 3374 |
| 4371 | 5654 |
| 4372 | 1912 |
| 4373 | 4527 |
| 4374 | 3016 |
| 4375 | 6721 |
| 4376 | 3721 |
| 4377 | 4703 |
| 4378 | 2431 |

TABLE Q1-continued with a sequence length of 8192:

| Reliability or reliability sequence number | Polarized channel sequence number |
|---|---|
| 4379 | 4585 |
| 4380 | 6692 |
| 4381 | 1503 |
| 4382 | 5657 |
| 4383 | 3843 |
| 4384 | 4962 |
| 4385 | 2958 |
| 4386 | 6257 |
| 4387 | 3432 |
| 4388 | 5235 |
| 4389 | 1970 |
| 4390 | 4819 |
| 4391 | 3611 |
| 4392 | 6298 |
| 4393 | 2863 |
| 4394 | 5287 |
| 4395 | 3183 |
| 4396 | 4582 |
| 4397 | 1774 |
| 4398 | 6223 |
| 4399 | 3024 |
| 4400 | 5345 |
| 4401 | 3403 |
| 4402 | 5004 |
| 4403 | 3286 |
| 4404 | 6413 |
| 4405 | 5446 |
| 4406 | 1993 |
| 4407 | 4814 |
| 4408 | 2918 |
| 4409 | 5426 |
| 4410 | 3381 |
| 4411 | 7186 |
| 4412 | 2965 |
| 4413 | 4909 |
| 4414 | 1532 |
| 4415 | 5892 |
| 4416 | 3260 |
| 4417 | 6252 |
| 4418 | 3521 |
| 4419 | 4572 |
| 4420 | 2775 |
| 4421 | 5277 |
| 4422 | 1885 |
| 4423 | 6722 |
| 4424 | 3289 |
| 4425 | 4952 |
| 4426 | 5776 |
| 4427 | 2541 |
| 4428 | 6368 |
| 4429 | 3480 |
| 4430 | 4935 |
| 4431 | 1781 |
| 4432 | 5449 |
| 4433 | 2921 |
| 4434 | 6310 |
| 4435 | 3681 |
| 4436 | 4821 |
| 4437 | 3668 |
| 4438 | 5230 |
| 4439 | 1994 |
| 4440 | 6663 |
| 4441 | 2749 |
| 4442 | 4794 |
| 4443 | 3623 |
| 4444 | 5237 |
| 4445 | 6696 |
| 4446 | 2979 |
| 4447 | 5010 |
| 4448 | 3722 |
| 4449 | 5332 |
| 4450 | 1943 |
| 4451 | 6339 |
| 4452 | 3301 |
| 4453 | 4848 |

TABLE Q1-continued with a sequence length of 8192:

| Reliability or reliability sequence number | Polarized channel sequence number |
|---|---|
| 4454 | 2804 |
| 4455 | 5291 |
| 4456 | 3231 |
| 4457 | 7296 |
| 4458 | 1015 |
| 4459 | 4964 |
| 4460 | 2908 |
| 4461 | 5896 |
| 4462 | 3492 |
| 4463 | 6414 |
| 4464 | 4915 |
| 4465 | 3382 |
| 4466 | 5450 |
| 4467 | 1899 |
| 4468 | 6785 |
| 4469 | 2547 |
| 4470 | 4910 |
| 4471 | 3613 |
| 4472 | 5346 |
| 4473 | 2779 |
| 4474 | 4535 |
| 4475 | 1886 |
| 4476 | 6667 |
| 4477 | 3845 |
| 4478 | 5669 |
| 4479 | 5025 |
| 4480 | 3682 |
| 4481 | 6419 |
| 4482 | 2871 |
| 4483 | 5658 |
| 4484 | 3729 |
| 4485 | 4586 |
| 4486 | 1782 |
| 4487 | 6724 |
| 4488 | 2970 |
| 4489 | 5507 |
| 4490 | 3405 |
| 4491 | 4719 |
| 4492 | 3191 |
| 4493 | 6435 |
| 4494 | 1972 |
| 4495 | 5428 |
| 4496 | 4767 |
| 4497 | 2922 |
| 4498 | 6203 |
| 4499 | 3672 |
| 4500 | 5336 |
| 4501 | 2966 |
| 4502 | 4835 |
| 4503 | 2001 |
| 4504 | 7180 |
| 4505 | 3411 |
| 4506 | 5536 |
| 4507 | 3290 |
| 4508 | 5012 |
| 4509 | 2550 |
| 4510 | 6313 |
| 4511 | 5391 |
| 4512 | 1947 |
| 4513 | 4559 |
| 4514 | 3440 |
| 4515 | 6704 |
| 4516 | 2981 |
| 4517 | 5399 |
| 4518 | 3724 |
| 4519 | 4939 |
| 4520 | 3302 |
| 4521 | 6258 |
| 4522 | 1996 |
| 4523 | 5278 |
| 4524 | 4477 |
| 4525 | 2791 |
| 4526 | 6421 |
| 4527 | 3463 |
| 4528 | 5457 |

TABLE Q1-continued

| with a sequence length of 8192: | |
|---|---|
| Reliability or reliability sequence number | Polarized channel sequence number |
| 4529 | 3385 |
| 4530 | 4593 |
| 4531 | 1785 |
| 4532 | 6300 |
| 4533 | 2808 |
| 4534 | 5670 |
| 4535 | 3522 |
| 4536 | 5026 |
| 4537 | 6231 |
| 4538 | 2929 |
| 4539 | 5792 |
| 4540 | 1901 |
| 4541 | 4917 |
| 4542 | 3614 |
| 4543 | 6341 |
| 4544 | 3406 |
| 4545 | 5238 |
| 4546 | 2542 |
| 4547 | 4822 |
| 4548 | 3305 |
| 4549 | 7201 |
| 4550 | 5452 |
| 4551 | 1976 |
| 4552 | 5699 |
| 4553 | 2750 |
| 4554 | 6260 |
| 4555 | 3627 |
| 4556 | 5057 |
| 4557 | 3846 |
| 4558 | 6314 |
| 4559 | 1519 |
| 4560 | 5660 |
| 4561 | 2969 |
| 4562 | 4968 |
| 4563 | 6205 |
| 4564 | 3247 |
| 4565 | 5509 |
| 4566 | 2549 |
| 4567 | 4588 |
| 4568 | 3195 |
| 4569 | 6675 |
| 4570 | 1727 |
| 4571 | 5293 |
| 4572 | 3730 |
| 4573 | 4727 |
| 4574 | 6669 |
| 4575 | 2924 |
| 4576 | 5241 |
| 4577 | 3684 |
| 4578 | 4825 |
| 4579 | 1959 |
| 4580 | 6786 |
| 4581 | 3413 |
| 4582 | 5673 |
| 4583 | 2895 |
| 4584 | 4796 |
| 4585 | 3849 |
| 4586 | 6425 |
| 4587 | 5319 |
| 4588 | 3040 |
| 4589 | 4539 |
| 4590 | 2002 |
| 4591 | 7233 |
| 4592 | 3292 |
| 4593 | 5904 |
| 4594 | 3386 |
| 4595 | 4837 |
| 4596 | 2495 |
| 4597 | 6422 |
| 4598 | 5299 |
| 4599 | 1019 |
| 4600 | 4941 |
| 4601 | 3496 |
| 4602 | 6670 |
| 4603 | 3467 |
| 4604 | 5348 |
| 4605 | 2781 |
| 4606 | 5016 |
| 4607 | 6321 |
| 4608 | 3745 |
| 4609 | 5458 |
| 4610 | 1907 |
| 4611 | 4478 |
| 4612 | 2875 |
| 4613 | 6437 |
| 4614 | 3655 |
| 4615 | 5432 |
| 4616 | 3427 |
| 4617 | 4918 |
| 4618 | 6532 |
| 4619 | 1786 |
| 4620 | 5824 |
| 4621 | 2982 |
| 4622 | 6235 |
| 4623 | 3359 |
| 4624 | 5510 |
| 4625 | 3255 |
| 4626 | 4947 |
| 4627 | 2930 |
| 4628 | 7188 |
| 4629 | 5294 |
| 4630 | 1527 |
| 4631 | 4826 |
| 4632 | 3306 |
| 4633 | 6728 |
| 4634 | 2985 |
| 4635 | 5674 |
| 4636 | 3197 |
| 4637 | 4594 |
| 4638 | 6913 |
| 4639 | 1949 |
| 4640 | 5701 |
| 4641 | 3629 |
| 4642 | 4976 |
| 4643 | 3011 |
| 4644 | 6342 |
| 4645 | 3732 |
| 4646 | 5513 |
| 4647 | 3688 |
| 4648 | 4838 |
| 4649 | 6316 |
| 4650 | 1902 |
| 4651 | 5403 |
| 4652 | 2795 |
| 4653 | 4541 |
| 4654 | 3414 |
| 4655 | 6264 |
| 4656 | 2553 |
| 4657 | 5242 |
| 4658 | 6345 |
| 4659 | 3388 |
| 4660 | 4567 |
| 4661 | 1759 |
| 4662 | 5568 |
| 4663 | 3313 |
| 4664 | 6480 |
| 4665 | 2903 |
| 4666 | 5473 |
| 4667 | 4731 |
| 4668 | 3850 |
| 4669 | 7424 |
| 4670 | 2017 |
| 4671 | 5681 |
| 4672 | 3635 |
| 4673 | 5028 |
| 4674 | 2972 |
| 4675 | 6206 |
| 4676 | 5323 |
| 4677 | 3417 |
| 4678 | 4783 |

TABLE Q1-continued with a sequence length of 8192:

| Reliability or reliability sequence number | Polarized channel sequence number |
|---|---|
| 4679 | 2782 |
| 4680 | 6426 |
| 4681 | 1909 |
| 4682 | 5183 |
| 4683 | 3524 |
| 4684 | 4999 |
| 4685 | 6287 |
| 4686 | 3469 |
| 4687 | 5460 |
| 4688 | 2877 |
| 4689 | 6247 |
| 4690 | 3475 |
| 4691 | 4921 |
| 4692 | 1963 |
| 4693 | 5514 |
| 4694 | 6322 |
| 4695 | 3279 |
| 4696 | 4596 |
| 4697 | 3013 |
| 4698 | 5647 |
| 4699 | 3746 |
| 4700 | 6438 |
| 4701 | 2018 |
| 4702 | 5702 |
| 4703 | 4942 |
| 4704 | 3630 |
| 4705 | 7202 |
| 4706 | 2986 |
| 4707 | 5676 |
| 4708 | 3857 |
| 4709 | 4841 |
| 4710 | 3504 |
| 4711 | 6237 |
| 4712 | 5301 |
| 4713 | 2004 |
| 4714 | 6788 |
| 4715 | 2932 |
| 4716 | 4922 |
| 4717 | 3429 |
| 4718 | 5415 |
| 4719 | 6346 |
| 4720 | 2554 |
| 4721 | 4828 |
| 4722 | 3259 |
| 4723 | 5405 |
| 4724 | 1950 |
| 4725 | 6736 |
| 4726 | 3308 |
| 4727 | 4542 |
| 4728 | 5352 |
| 4729 | 2797 |
| 4730 | 6467 |
| 4731 | 3736 |
| 4732 | 5244 |
| 4733 | 3696 |
| 4734 | 7192 |
| 4735 | 5058 |
| 4736 | 1788 |
| 4737 | 5325 |
| 4738 | 2993 |
| 4739 | 6536 |
| 4740 | 3659 |
| 4741 | 5032 |
| 4742 | 3852 |
| 4743 | 5302 |
| 4744 | 6441 |
| 4745 | 3014 |
| 4746 | 4571 |
| 4747 | 1965 |
| 4748 | 5763 |
| 4749 | 3777 |
| 4750 | 6914 |
| 4751 | 4949 |
| 4752 | 3198 |
| 4753 | 6251 |

TABLE Q1-continued with a sequence length of 8192:

| Reliability or reliability sequence number | Polarized channel sequence number |
|---|---|
| 4754 | 2803 |
| 4755 | 5682 |
| 4756 | 3314 |
| 4757 | 4963 |
| 4758 | 1991 |
| 4759 | 6324 |
| 4760 | 5406 |
| 4761 | 2907 |
| 4762 | 5705 |
| 4763 | 3637 |
| 4764 | 6295 |
| 4765 | 3470 |
| 4766 | 4733 |
| 4767 | 5419 |
| 4768 | 2988 |
| 4769 | 7204 |
| 4770 | 1021 |
| 4771 | 5003 |
| 4772 | 3418 |
| 4773 | 6353 |
| 4774 | 5474 |
| 4775 | 3528 |
| 4776 | 4583 |
| 4777 | 2878 |
| 4778 | 6428 |
| 4779 | 1910 |
| 4780 | 5331 |
| 4781 | 4791 |
| 4782 | 3430 |
| 4783 | 6792 |
| 4784 | 3477 |
| 4785 | 5521 |
| 4786 | 2959 |
| 4787 | 6238 |
| 4788 | 3375 |
| 4789 | 5305 |
| 4790 | 4842 |
| 4791 | 1855 |
| 4792 | 6348 |
| 4793 | 3641 |
| 4794 | 5516 |
| 4795 | 2919 |
| 4796 | 4924 |
| 4797 | 6442 |
| 4798 | 3316 |
| 4799 | 5464 |
| 4800 | 3667 |
| 4801 | 7175 |
| 4802 | 1971 |
| 4803 | 4849 |
| 4804 | 5706 |
| 4805 | 2687 |
| 4806 | 6544 |
| 4807 | 3261 |
| 4808 | 4950 |
| 4809 | 3638 |
| 4810 | 5765 |
| 4811 | 6752 |
| 4812 | 2936 |
| 4813 | 5713 |
| 4814 | 1531 |
| 4815 | 6496 |
| 4816 | 3748 |
| 4817 | 4953 |
| 4818 | 5655 |
| 4819 | 3433 |
| 4820 | 6469 |
| 4821 | 2527 |
| 4822 | 4600 |
| 4823 | 3778 |
| 4824 | 5360 |
| 4825 | 6677 |
| 4826 | 1913 |
| 4827 | 4895 |
| 4828 | 3661 |

TABLE Q1-continued with a sequence length of 8192:

| Reliability or reliability sequence number | Polarized channel sequence number |
|---|---|
| 4829 | 7297 |
| 4830 | 2994 |
| 4831 | 5326 |
| 4832 | 5215 |
| 4833 | 3287 |
| 4834 | 6299 |
| 4835 | 2798 |
| 4836 | 4351 |
| 4837 | 5447 |
| 4838 | 3858 |
| 4839 | 6354 |
| 4840 | 2008 |
| 4841 | 5060 |
| 4842 | 3719 |
| 4843 | 6449 |
| 4844 | 5684 |
| 4845 | 3017 |
| 4846 | 5005 |
| 4847 | 3420 |
| 4848 | 6691 |
| 4849 | 3491 |
| 4850 | 5920 |
| 4851 | 4815 |
| 4852 | 1775 |
| 4853 | 6444 |
| 4854 | 2556 |
| 4855 | 5522 |
| 4856 | 3478 |
| 4857 | 7234 |
| 4858 | 5476 |
| 4859 | 3536 |
| 4860 | 4573 |
| 4861 | 2909 |
| 4862 | 6253 |
| 4863 | 5427 |
| 4864 | 1966 |
| 4865 | 5011 |
| 4866 | 3752 |
| 4867 | 6328 |
| 4868 | 3873 |
| 4869 | 5421 |
| 4870 | 6678 |
| 4871 | 2805 |
| 4872 | 4734 |
| 4873 | 3434 |
| 4874 | 5537 |
| 4875 | 2020 |
| 4876 | 6681 |
| 4877 | 5333 |
| 4878 | 3662 |
| 4879 | 6259 |
| 4880 | 3018 |
| 4881 | 4844 |
| 4882 | 5688 |
| 4883 | 3481 |
| 4884 | 6311 |
| 4885 | 3642 |
| 4886 | 5040 |
| 4887 | 1995 |
| 4888 | 5952 |
| 4889 | 7680 |
| 4890 | 2967 |
| 4891 | 4965 |
| 4892 | 3860 |
| 4893 | 6369 |
| 4894 | 3669 |
| 4895 | 5708 |
| 4896 | 5306 |
| 4897 | 3644 |
| 4898 | 6470 |
| 4899 | 2923 |
| 4900 | 4587 |
| 4901 | 6450 |
| 4902 | 1914 |
| 4903 | 5766 |

TABLE Q1-continued with a sequence length of 8192:

| Reliability or reliability sequence number | Polarized channel sequence number |
|---|---|
| 4904 | 3291 |
| 4905 | 4795 |
| 4906 | 3383 |
| 4907 | 6916 |
| 4908 | 5524 |
| 4909 | 2910 |
| 4910 | 5347 |
| 4911 | 3780 |
| 4912 | 6301 |
| 4913 | 4850 |
| 4914 | 1533 |
| 4915 | 7179 |
| 4916 | 3670 |
| 4917 | 6016 |
| 4918 | 2806 |
| 4919 | 4954 |
| 4920 | 6800 |
| 4921 | 3673 |
| 4922 | 5714 |
| 4923 | 3723 |
| 4924 | 6473 |
| 4925 | 4574 |
| 4926 | 1973 |
| 4927 | 5538 |
| 4928 | 2996 |
| 4929 | 6254 |
| 4930 | 5422 |
| 4931 | 3493 |
| 4932 | 5064 |
| 4933 | 3864 |
| 4934 | 6261 |
| 4935 | 3025 |
| 4936 | 5769 |
| 4937 | 6356 |
| 4938 | 3874 |
| 4939 | 4479 |
| 4940 | 1997 |
| 4941 | 5891 |
| 4942 | 7208 |
| 4943 | 3683 |
| 4944 | 5006 |
| 4945 | 2971 |
| 4946 | 6315 |
| 4947 | 3674 |
| 4948 | 5480 |
| 4949 | 5659 |
| 4950 | 3482 |
| 4951 | 6920 |
| 4952 | 2024 |
| 4953 | 4911 |
| 4954 | 6474 |
| 4955 | 3020 |
| 4956 | 5231 |
| 4957 | 3303 |
| 4958 | 5072 |
| 4959 | 6370 |
| 4960 | 3760 |
| 4961 | 5451 |
| 4962 | 2809 |
| 4963 | 6693 |
| 4964 | 5334 |
| 4965 | 1916 |
| 4966 | 4966 |
| 4967 | 3725 |
| 4968 | 7236 |
| 4969 | 3320 |
| 4970 | 5429 |
| 4971 | 6682 |
| 4972 | 2925 |
| 4973 | 5013 |
| 4974 | 3441 |
| 4975 | 5308 |
| 4976 | 6531 |
| 4977 | 3262 |
| 4978 | 5569 |

TABLE Q1-continued with a sequence length of 8192:

| Reliability or reliability sequence number | Polarized channel sequence number |
|---|---|
| 4979 | 1974 |
| 4980 | 6452 |
| 4981 | 4823 |
| 4982 | 3436 |
| 4983 | 5337 |
| 4984 | 3000 |
| 4985 | 6360 |
| 4986 | 4589 |
| 4987 | 3726 |
| 4988 | 7298 |
| 4989 | 3731 |
| 4990 | 5528 |
| 4991 | 4969 |
| 4992 | 1887 |
| 4993 | 6560 |
| 4994 | 2543 |
| 4995 | 5729 |
| 4996 | 3407 |
| 4997 | 6415 |
| 4998 | 5716 |
| 4999 | 3552 |
| 5000 | 4797 |
| 5001 | 2751 |
| 5002 | 6423 |
| 5003 | 5671 |
| 5004 | 3387 |
| 5005 | 6302 |
| 5006 | 1783 |
| 5007 | 5027 |
| 5008 | 5770 |
| 5009 | 3293 |
| 5010 | 6481 |
| 5011 | 2983 |
| 5012 | 5349 |
| 5013 | 7187 |
| 5014 | 3442 |
| 5015 | 4852 |
| 5016 | 3685 |
| 5017 | 5279 |
| 5018 | 6694 |
| 5019 | 3026 |
| 5020 | 4956 |
| 5021 | 1022 |
| 5022 | 6816 |
| 5023 | 5540 |
| 5024 | 3494 |
| 5025 | 5430 |
| 5026 | 3497 |
| 5027 | 6262 |
| 5028 | 4595 |
| 5029 | 3523 |
| 5030 | 6476 |
| 5031 | 2931 |
| 5032 | 5661 |
| 5033 | 4827 |
| 5034 | 2032 |
| 5035 | 6723 |
| 5036 | 3686 |
| 5037 | 5893 |
| 5038 | 7181 |
| 5039 | 3615 |
| 5040 | 5730 |
| 5041 | 2810 |
| 5042 | 4919 |
| 5043 | 6684 |
| 5044 | 3307 |
| 5045 | 5777 |
| 5046 | 3484 |
| 5047 | 6533 |
| 5048 | 5018 |
| 5049 | 1534 |
| 5050 | 5453 |
| 5051 | 2551 |
| 5052 | 6317 |
| 5053 | 5239 |

TABLE Q1-continued with a sequence length of 8192:

| Reliability or reliability sequence number | Polarized channel sequence number |
|---|---|
| 5054 | 3415 |
| 5055 | 6265 |
| 5056 | 3444 |
| 5057 | 4970 |
| 5058 | 5720 |
| 5059 | 2973 |
| 5060 | 7216 |
| 5061 | 3847 |
| 5062 | 5014 |
| 5063 | 6697 |
| 5064 | 2003 |
| 5065 | 5459 |
| 5066 | 3389 |
| 5067 | 6343 |
| 5068 | 5338 |
| 5069 | 3294 |
| 5070 | 4598 |
| 5071 | 2926 |
| 5072 | 6928 |
| 5073 | 5488 |
| 5074 | 3498 |
| 5075 | 6323 |
| 5076 | 3525 |
| 5077 | 5029 |
| 5078 | 5772 |
| 5079 | 1977 |
| 5080 | 7182 |
| 5081 | 2783 |
| 5082 | 5350 |
| 5083 | 6372 |
| 5084 | 3309 |
| 5085 | 4839 |
| 5086 | 3631 |
| 5087 | 5511 |
| 5088 | 6482 |
| 5089 | 3905 |
| 5090 | 5433 |
| 5091 | 1787 |
| 5092 | 6456 |
| 5093 | 4856 |
| 5094 | 3041 |
| 5095 | 6848 |
| 5096 | 5570 |
| 5097 | 3876 |
| 5098 | 4977 |
| 5099 | 3784 |
| 5100 | 6534 |
| 5101 | 5662 |
| 5102 | 2933 |
| 5103 | 7240 |
| 5104 | 3906 |
| 5105 | 5454 |
| 5106 | 4590 |
| 5107 | 1998 |
| 5108 | 6318 |
| 5109 | 3733 |
| 5110 | 5353 |
| 5111 | 6698 |
| 5112 | 2987 |
| 5113 | 4798 |
| 5114 | 3880 |
| 5115 | 6725 |
| 5116 | 5675 |
| 5117 | 3851 |
| 5118 | 5894 |
| 5119 | 6537 |
| 5120 | 3689 |
| 5121 | 5017 |
| 5122 | 1978 |
| 5123 | 7425 |
| 5124 | 5295 |
| 5125 | 3042 |
| 5126 | 4597 |
| 5127 | 3676 |
| 5128 | 6427 |

TABLE Q1-continued with a sequence length of 8192:

| Reliability or reliability sequence number | Polarized channel sequence number |
|---|---|
| 5129 | 5243 |
| 5130 | 3505 |
| 5131 | 6266 |
| 5132 | 3028 |
| 5133 | 5778 |
| 5134 | 6592 |
| 5135 | 3792 |
| 5136 | 4972 |
| 5137 | 1903 |
| 5138 | 5732 |
| 5139 | 6497 |
| 5140 | 3888 |
| 5141 | 5461 |
| 5142 | 7189 |
| 5143 | 3908 |
| 5144 | 4943 |
| 5145 | 2974 |
| 5146 | 5897 |
| 5147 | 6705 |
| 5148 | 3419 |
| 5149 | 5088 |
| 5150 | 3969 |
| 5151 | 6347 |
| 5152 | 5340 |
| 5153 | 2005 |
| 5154 | 6207 |
| 5155 | 5434 |
| 5156 | 2812 |
| 5157 | 4543 |
| 5158 | 3315 |
| 5159 | 6484 |
| 5160 | 5544 |
| 5161 | 3734 |
| 5162 | 7300 |
| 5163 | 3526 |
| 5164 | 5515 |
| 5165 | 6538 |
| 5166 | 2989 |
| 5167 | 4829 |
| 5168 | 5793 |
| 5169 | 2006 |
| 5170 | 6671 |
| 5171 | 3390 |
| 5172 | 4923 |
| 5173 | 6726 |
| 5174 | 3747 |
| 5175 | 5703 |
| 5176 | 3015 |
| 5177 | 6700 |
| 5178 | 5475 |
| 5179 | 3690 |
| 5180 | 5030 |
| 5181 | 6325 |
| 5182 | 3970 |
| 5183 | 5407 |
| 5184 | 1951 |
| 5185 | 7203 |
| 5186 | 5303 |
| 5187 | 3853 |
| 5188 | 6439 |
| 5189 | 2934 |
| 5190 | 4978 |
| 5191 | 5354 |
| 5192 | 3448 |
| 5193 | 6429 |
| 5194 | 5033 |
| 5195 | 3500 |
| 5196 | 6376 |
| 5197 | 2879 |
| 5198 | 5245 |
| 5199 | 6268 |
| 5200 | 3737 |
| 5201 | 5677 |
| 5202 | 2019 |
| 5203 | 5059 |

TABLE Q1-continued with a sequence length of 8192:

| Reliability or reliability sequence number | Polarized channel sequence number |
|---|---|
| 5204 | 7426 |
| 5205 | 3808 |
| 5206 | 5780 |
| 5207 | 6349 |
| 5208 | 3639 |
| 5209 | 5736 |
| 5210 | 2995 |
| 5211 | 6326 |
| 5212 | 4843 |
| 5213 | 3912 |
| 5214 | 5462 |
| 5215 | 6787 |
| 5216 | 3697 |
| 5217 | 4601 |
| 5218 | 1789 |
| 5219 | 6706 |
| 5220 | 5436 |
| 5221 | 2555 |
| 5222 | 7194 |
| 5223 | 5361 |
| 5224 | 3310 |
| 5225 | 4951 |
| 5226 | 3431 |
| 5227 | 6430 |
| 5228 | 5898 |
| 5229 | 3529 |
| 5230 | 6729 |
| 5231 | 5683 |
| 5232 | 2937 |
| 5233 | 6443 |
| 5234 | 1980 |
| 5235 | 5020 |
| 5236 | 7681 |
| 5237 | 3471 |
| 5238 | 5465 |
| 5239 | 4830 |
| 5240 | 3859 |
| 5241 | 6498 |
| 5242 | 3663 |
| 5243 | 5572 |
| 5244 | 6355 |
| 5245 | 3032 |
| 5246 | 5517 |
| 5247 | 6545 |
| 5248 | 3750 |
| 5249 | 4925 |
| 5250 | 3506 |
| 5251 | 5523 |
| 5252 | 6329 |
| 5253 | 1911 |
| 5254 | 5327 |
| 5255 | 7248 |
| 5256 | 2799 |
| 5257 | 5061 |
| 5258 | 3749 |
| 5259 | 6540 |
| 5260 | 5794 |
| 5261 | 3421 |
| 5262 | 6488 |
| 5263 | 5678 |
| 5264 | 3317 |
| 5265 | 5034 |
| 5266 | 2990 |
| 5267 | 6730 |
| 5268 | 5905 |
| 5269 | 2009 |
| 5270 | 6789 |
| 5271 | 5552 |
| 5272 | 3530 |
| 5273 | 7205 |
| 5274 | 3738 |
| 5275 | 4980 |
| 5276 | 5477 |
| 5277 | 3692 |
| 5278 | 6737 |

TABLE Q1-continued

| with a sequence length of 8192: | |
|---|---|
| Reliability or reliability sequence number | Polarized channel sequence number |
| 5279 | 4602 |
| 5280 | 3044 |
| 5281 | 6679 |
| 5282 | 3435 |
| 5283 | 5307 |
| 5284 | 6384 |
| 5285 | 3199 |
| 5286 | 5356 |
| 5287 | 6350 |
| 5288 | 2021 |
| 5289 | 4845 |
| 5290 | 3263 |
| 5291 | 5784 |
| 5292 | 7193 |
| 5293 | 3019 |
| 5294 | 5744 |
| 5295 | 6239 |
| 5296 | 3854 |
| 5297 | 5041 |
| 5298 | 6471 |
| 5299 | 3479 |
| 5300 | 5707 |
| 5301 | 2938 |
| 5302 | 6708 |
| 5303 | 5900 |
| 5304 | 2010 |
| 5305 | 5062 |
| 5306 | 7190 |
| 5307 | 3508 |
| 5308 | 5825 |
| 5309 | 3698 |
| 5310 | 6944 |
| 5311 | 5246 |
| 5312 | 3643 |
| 5313 | 6546 |
| 5314 | 4851 |
| 5315 | 2557 |
| 5316 | 6500 |
| 5317 | 5362 |
| 5318 | 3537 |
| 5319 | 4955 |
| 5320 | 3753 |
| 5321 | 6451 |
| 5322 | 5685 |
| 5323 | 1967 |
| 5324 | 7304 |
| 5325 | 5518 |
| 5326 | 3318 |
| 5327 | 6445 |
| 5328 | 5036 |
| 5329 | 2997 |
| 5330 | 6561 |
| 5331 | 3779 |
| 5332 | 5466 |
| 5333 | 6357 |
| 5334 | 3422 |
| 5335 | 5576 |
| 5336 | 4926 |
| 5337 | 3671 |
| 5338 | 6712 |
| 5339 | 5478 |
| 5340 | 3021 |
| 5341 | 7428 |
| 5342 | 1915 |
| 5343 | 5525 |
| 5344 | 6976 |
| 5345 | 3740 |
| 5346 | 5007 |
| 5347 | 6732 |
| 5348 | 3862 |
| 5349 | 5423 |
| 5350 | 5689 |
| 5351 | 3532 |
| 5352 | 6330 |
| 5353 | 3048 |

TABLE Q1-continued

| with a sequence length of 8192: | |
|---|---|
| Reliability or reliability sequence number | Polarized channel sequence number |
| 5354 | 4967 |
| 5355 | 7432 |
| 5356 | 3321 |
| 5357 | 5364 |
| 5358 | 6790 |
| 5359 | 3754 |
| 5360 | 5715 |
| 5361 | 6548 |
| 5362 | 2022 |
| 5363 | 4735 |
| 5364 | 3645 |
| 5365 | 6371 |
| 5366 | 5309 |
| 5367 | 2940 |
| 5368 | 5686 |
| 5369 | 7040 |
| 5370 | 3483 |
| 5371 | 4984 |
| 5372 | 7206 |
| 5373 | 3875 |
| 5374 | 5796 |
| 5375 | 6738 |
| 5376 | 3861 |
| 5377 | 5481 |
| 5378 | 1790 |
| 5379 | 6562 |
| 5380 | 4575 |
| 5381 | 2998 |
| 5382 | 6446 |
| 5383 | 5826 |
| 5384 | 3781 |
| 5385 | 7682 |
| 5386 | 5709 |
| 5387 | 3437 |
| 5388 | 5042 |
| 5389 | 3512 |
| 5390 | 6793 |
| 5391 | 5335 |
| 5392 | 2911 |
| 5393 | 6915 |
| 5394 | 4846 |
| 5395 | 3700 |
| 5396 | 6504 |
| 5397 | 5906 |
| 5398 | 1535 |
| 5399 | 6683 |
| 5400 | 5767 |
| 5401 | 3761 |
| 5402 | 7264 |
| 5403 | 3446 |
| 5404 | 5065 |
| 5405 | 6255 |
| 5406 | 2807 |
| 5407 | 5468 |
| 5408 | 5539 |
| 5409 | 3495 |
| 5410 | 6475 |
| 5411 | 4604 |
| 5412 | 3538 |
| 5413 | 6358 |
| 5414 | 5526 |
| 5415 | 3865 |
| 5416 | 7235 |
| 5417 | 5584 |
| 5418 | 3056 |
| 5419 | 6453 |
| 5420 | 1023 |
| 5421 | 4957 |
| 5422 | 6332 |
| 5423 | 3322 |
| 5424 | 5800 |
| 5425 | 6593 |
| 5426 | 3443 |
| 5427 | 5921 |
| 5428 | 4853 |

TABLE Q1-continued

| with a sequence length of 8192: | |
|---|---|
| Reliability or reliability sequence number | Polarized channel sequence number |
| 5429 | 3553 |
| 5430 | 7209 |
| 5431 | 5482 |
| 5432 | 2558 |
| 5433 | 6361 |
| 5434 | 5710 |
| 5435 | 3646 |
| 5436 | 6552 |
| 5437 | 3485 |
| 5438 | 5066 |
| 5439 | 6753 |
| 5440 | 2012 |
| 5441 | 5529 |
| 5442 | 6740 |
| 5443 | 3675 |
| 5444 | 5690 |
| 5445 | 7312 |
| 5446 | 3027 |
| 5447 | 5015 |
| 5448 | 6695 |
| 5449 | 3438 |
| 5450 | 5908 |
| 5451 | 5717 |
| 5452 | 3540 |
| 5453 | 6794 |
| 5454 | 3727 |
| 5455 | 5692 |
| 5456 | 6373 |
| 5457 | 3001 |
| 5458 | 4971 |
| 5459 | 7196 |
| 5460 | 2025 |
| 5461 | 5339 |
| 5462 | 6303 |
| 5463 | 3972 |
| 5464 | 5431 |
| 5465 | 6564 |
| 5466 | 3877 |
| 5467 | 4958 |
| 5468 | 6454 |
| 5469 | 3687 |
| 5470 | 5828 |
| 5471 | 7237 |
| 5472 | 2811 |
| 5473 | 5718 |
| 5474 | 6685 |
| 5475 | 3756 |
| 5476 | 4854 |
| 5477 | 3782 |
| 5478 | 5721 |
| 5479 | 6917 |
| 5480 | 1975 |
| 5481 | 5771 |
| 5482 | 6754 |
| 5483 | 3501 |
| 5484 | 5044 |
| 5485 | 7210 |
| 5486 | 3022 |
| 5487 | 5541 |
| 5488 | 6801 |
| 5489 | 3866 |
| 5490 | 5912 |
| 5491 | 6477 |
| 5492 | 3324 |
| 5493 | 5073 |
| 5494 | 6263 |
| 5495 | 3445 |
| 5496 | 5922 |
| 5497 | 7684 |
| 5498 | 3677 |
| 5499 | 5731 |
| 5500 | 6744 |
| 5501 | 3002 |
| 5502 | 5019 |
| 5503 | 6483 |

TABLE Q1-continued

| with a sequence length of 8192: | |
|---|---|
| Reliability or reliability sequence number | Polarized channel sequence number |
| 5504 | 2026 |
| 5505 | 5722 |
| 5506 | 3920 |
| 5507 | 6362 |
| 5508 | 5530 |
| 5509 | 3762 |
| 5510 | 5068 |
| 5511 | 7217 |
| 5512 | 3785 |
| 5513 | 5351 |
| 5514 | 6512 |
| 5515 | 2927 |
| 5516 | 5808 |
| 5517 | 6796 |
| 5518 | 3704 |
| 5519 | 4857 |
| 5520 | 6374 |
| 5521 | 3554 |
| 5522 | 5773 |
| 5523 | 7242 |
| 5524 | 1917 |
| 5525 | 5368 |
| 5526 | 6535 |
| 5527 | 3878 |
| 5528 | 4973 |
| 5529 | 6457 |
| 5530 | 3029 |
| 5531 | 5489 |
| 5532 | 6594 |
| 5533 | 3499 |
| 5534 | 5310 |
| 5535 | 7440 |
| 5536 | 3976 |
| 5537 | 5484 |
| 5538 | 6686 |
| 5539 | 3486 |
| 5540 | 5048 |
| 5541 | 6478 |
| 5542 | 3030 |
| 5543 | 5774 |
| 5544 | 6377 |
| 5545 | 3295 |
| 5546 | 5779 |
| 5547 | 1999 |
| 5548 | 4591 |
| 5549 | 7328 |
| 5550 | 3735 |
| 5551 | 5455 |
| 5552 | 6699 |
| 5553 | 3764 |
| 5554 | 5600 |
| 5555 | 6918 |
| 5556 | 3907 |
| 5557 | 4799 |
| 5558 | 6319 |
| 5559 | 2975 |
| 5560 | 5435 |
| 5561 | 7688 |
| 5562 | 3691 |
| 5563 | 5341 |
| 5564 | 6267 |
| 5565 | 3544 |
| 5566 | 5031 |
| 5567 | 6802 |
| 5568 | 3527 |
| 5569 | 5490 |
| 5570 | 6756 |
| 5571 | 1918 |
| 5572 | 5733 |
| 5573 | 7456 |
| 5574 | 3043 |
| 5575 | 5074 |
| 5576 | 6485 |
| 5577 | 3868 |
| 5578 | 5542 |

TABLE Q1-continued

| with a sequence length of 8192: | |
|---|---|
| Reliability or reliability sequence number | Polarized channel sequence number |
| 5579 | 6921 |
| 5580 | 3881 |
| 5581 | 5545 |
| 5582 | 6364 |
| 5583 | 3786 |
| 5584 | 5571 |
| 5585 | 7696 |
| 5586 | 3793 |
| 5587 | 4979 |
| 5588 | 6458 |
| 5589 | 2813 |
| 5590 | 5734 |
| 5591 | 6568 |
| 5592 | 3909 |
| 5593 | 5663 |
| 5594 | 6539 |
| 5595 | 2033 |
| 5596 | 4858 |
| 5597 | 7360 |
| 5598 | 3788 |
| 5599 | 5355 |
| 5600 | 6817 |
| 5601 | 3936 |
| 5602 | 5532 |
| 5603 | 6727 |
| 5604 | 3004 |
| 5605 | 4599 |
| 5606 | 6499 |
| 5607 | 3882 |
| 5608 | 5463 |
| 5609 | 7712 |
| 5610 | 3678 |
| 5611 | 5492 |
| 5612 | 6431 |
| 5613 | 3984 |
| 5614 | 5021 |
| 5615 | 6327 |
| 5616 | 3794 |
| 5617 | 5895 |
| 5618 | 6378 |
| 5619 | 1979 |
| 5620 | 5437 |
| 5621 | 7238 |
| 5622 | 2935 |
| 5623 | 5342 |
| 5624 | 6269 |
| 5625 | 3768 |
| 5626 | 4974 |
| 5627 | 6701 |
| 5628 | 3449 |
| 5629 | 5546 |
| 5630 | 6804 |
| 5631 | 5573 |
| 5632 | 3507 |
| 5633 | 7212 |
| 5634 | 4831 |
| 5635 | 3889 |
| 5636 | 6760 |
| 5637 | 5357 |
| 5638 | 3033 |
| 5639 | 6486 |
| 5640 | 5679 |
| 5641 | 3391 |
| 5642 | 6460 |
| 5643 | 5953 |
| 5644 | 2028 |
| 5645 | 7299 |
| 5646 | 5089 |
| 5647 | 3693 |
| 5648 | 6385 |
| 5649 | 5924 |
| 5650 | 3884 |
| 5651 | 6922 |
| 5652 | 5832 |
| 5653 | 3045 |

TABLE Q1-continued

| with a sequence length of 8192: | |
|---|---|
| Reliability or reliability sequence number | Polarized channel sequence number |
| 5654 | 7249 |
| 5655 | 4981 |
| 5656 | 3556 |
| 5657 | 6707 |
| 5658 | 5954 |
| 5659 | 3502 |
| 5660 | 6489 |
| 5661 | 5781 |
| 5662 | 3910 |
| 5663 | 6596 |
| 5664 | 5035 |
| 5665 | 3739 |
| 5666 | 7218 |
| 5667 | 5928 |
| 5668 | 2034 |
| 5669 | 6541 |
| 5670 | 5899 |
| 5671 | 3034 |
| 5672 | 6547 |
| 5673 | 5737 |
| 5674 | 6351 |
| 5675 | 3560 |
| 5676 | 5090 |
| 5677 | 7241 |
| 5678 | 3311 |
| 5679 | 5724 |
| 5680 | 6818 |
| 5681 | 3450 |
| 5682 | 5553 |
| 5683 | 6702 |
| 5684 | 3531 |
| 5685 | 5076 |
| 5686 | 7183 |
| 5687 | 2991 |
| 5688 | 5840 |
| 5689 | 6929 |
| 5690 | 3694 |
| 5691 | 5936 |
| 5692 | 6576 |
| 5693 | 1981 |
| 5694 | 5956 |
| 5695 | 6501 |
| 5696 | 3699 |
| 5697 | 5022 |
| 5698 | 7488 |
| 5699 | 3509 |
| 5700 | 5467 |
| 5701 | 6331 |
| 5702 | 6017 |
| 5703 | 3452 |
| 5704 | 6380 |
| 5705 | 4860 |
| 5706 | 2939 |
| 5707 | 6808 |
| 5708 | 5363 |
| 5709 | 3890 |
| 5710 | 7301 |
| 5711 | 5782 |
| 5712 | 3533 |
| 5713 | 6768 |
| 5714 | 5574 |
| 5715 | 3568 |
| 5716 | 6731 |
| 5717 | 5037 |
| 5718 | 3741 |
| 5719 | 7220 |
| 5720 | 5438 |
| 5721 | 2007 |
| 5722 | 6924 |
| 5723 | 5795 |
| 5724 | 6849 |
| 5725 | 3046 |
| 5726 | 5063 |
| 5727 | 6270 |
| 5728 | 3751 |

TABLE Q1-continued with a sequence length of 8192:

| Reliability or reliability sequence number | Polarized channel sequence number |
|---|---|
| 5729 | 5738 |
| 5730 | 7191 |
| 5731 | 3796 |
| 5732 | 6018 |
| 5733 | 6386 |
| 5734 | 3913 |
| 5735 | 5901 |
| 5736 | 6709 |
| 5737 | 2814 |
| 5738 | 4982 |
| 5739 | 5496 |
| 5740 | 3701 |
| 5741 | 5548 |
| 5742 | 7302 |
| 5743 | 4927 |
| 5744 | 3423 |
| 5745 | 6542 |
| 5746 | 5785 |
| 5747 | 3539 |
| 5748 | 6490 |
| 5749 | 5856 |
| 5750 | 1982 |
| 5751 | 6600 |
| 5752 | 5687 |
| 5753 | 3510 |
| 5754 | 7552 |
| 5755 | 5043 |
| 5756 | 2559 |
| 5757 | 6502 |
| 5758 | 5960 |
| 5759 | 6549 |
| 5760 | 3809 |
| 5761 | 5745 |
| 5762 | 7244 |
| 5763 | 3323 |
| 5764 | 4603 |
| 5765 | 6447 |
| 5766 | 3534 |
| 5767 | 5358 |
| 5768 | 6713 |
| 5769 | 3514 |
| 5770 | 5479 |
| 5771 | 6388 |
| 5772 | 3513 |
| 5773 | 5577 |
| 5774 | 7305 |
| 5775 | 4985 |
| 5776 | 2011 |
| 5777 | 6739 |
| 5778 | 5519 |
| 5779 | 3036 |
| 5780 | 6333 |
| 5781 | 5907 |
| 5782 | 3541 |
| 5783 | 7250 |
| 5784 | 5711 |
| 5785 | 3319 |
| 5786 | 6710 |
| 5787 | 5080 |
| 5788 | 3755 |
| 5789 | 6820 |
| 5790 | 5798 |
| 5791 | 6505 |
| 5792 | 3914 |
| 5793 | 5554 |
| 5794 | 7224 |
| 5795 | 3049 |
| 5796 | 4847 |
| 5797 | 6850 |
| 5798 | 3810 |
| 5799 | 5797 |
| 5800 | 6733 |
| 5801 | 3971 |
| 5802 | 5469 |
| 5803 | 7195 |

TABLE Q1-continued with a sequence length of 8192:

| Reliability or reliability sequence number | Polarized channel sequence number |
|---|---|
| 5804 | 5365 |
| 5805 | 3742 |
| 5806 | 6359 |
| 5807 | 5038 |
| 5808 | 2036 |
| 5809 | 6930 |
| 5810 | 5578 |
| 5811 | 3855 |
| 5812 | 6791 |
| 5813 | 5786 |
| 5814 | 2999 |
| 5815 | 7265 |
| 5816 | 5740 |
| 5817 | 6492 |
| 5818 | 3921 |
| 5819 | 5092 |
| 5820 | 6563 |
| 5821 | 3892 |
| 5822 | 5483 |
| 5823 | 7207 |
| 5824 | 3800 |
| 5825 | 5247 |
| 5826 | 6550 |
| 5827 | 5311 |
| 5828 | 4000 |
| 5829 | 6608 |
| 5830 | 5067 |
| 5831 | 3050 |
| 5832 | 6824 |
| 5833 | 5902 |
| 5834 | 3863 |
| 5835 | 7427 |
| 5836 | 5527 |
| 5837 | 2023 |
| 5838 | 6945 |
| 5839 | 4986 |
| 5840 | 6506 |
| 5841 | 3439 |
| 5842 | 5556 |
| 5843 | 7252 |
| 5844 | 3973 |
| 5845 | 5746 |
| 5846 | 6734 |
| 5847 | 3702 |
| 5848 | 5691 |
| 5849 | 6553 |
| 5850 | 4605 |
| 5851 | 3757 |
| 5852 | 7306 |
| 5853 | 5585 |
| 5854 | 2941 |
| 5855 | 6714 |
| 5856 | 5801 |
| 5857 | 3916 |
| 5858 | 6932 |
| 5859 | 5366 |
| 5860 | 6741 |
| 5861 | 3705 |
| 5862 | 5045 |
| 5863 | 7313 |
| 5864 | 3783 |
| 5865 | 5827 |
| 5866 | 6716 |
| 5867 | 2040 |
| 5868 | 5470 |
| 5869 | 6363 |
| 5870 | 5719 |
| 5871 | 3325 |
| 5872 | 7429 |
| 5873 | 5069 |
| 5874 | 3023 |
| 5875 | 6455 |
| 5876 | 5788 |
| 5877 | 3763 |
| 5878 | 6852 |

TABLE Q1-continued

| with a sequence length of 8192: | |
|---|---|
| Reliability or reliability sequence number | Polarized channel sequence number |
| 5879 | 5910 |
| 5880 | 7197 |
| 5881 | 3896 |
| 5882 | 5580 |
| 5883 | 6742 |
| 5884 | 3974 |
| 5885 | 5096 |
| 5886 | 6745 |
| 5887 | 5369 |
| 5888 | 3758 |
| 5889 | 7211 |
| 5890 | 5802 |
| 5891 | 2942 |
| 5892 | 6795 |
| 5893 | 5693 |
| 5894 | 3812 |
| 5895 | 6565 |
| 5896 | 4988 |
| 5897 | 6936 |
| 5898 | 3922 |
| 5899 | 5531 |
| 5900 | 7266 |
| 5901 | 1791 |
| 5902 | 5923 |
| 5903 | 6946 |
| 5904 | 3447 |
| 5905 | 5909 |
| 5906 | 6755 |
| 5907 | 5046 |
| 5908 | 3516 |
| 5909 | 7683 |
| 5910 | 5829 |
| 5911 | 3542 |
| 5912 | 6746 |
| 5913 | 5485 |
| 5914 | 6554 |
| 5915 | 3057 |
| 5916 | 5560 |
| 5917 | 7256 |
| 5918 | 3555 |
| 5919 | 4959 |
| 5920 | 6375 |
| 5921 | 3487 |
| 5922 | 6832 |
| 5923 | 5748 |
| 5924 | 7308 |
| 5925 | 3557 |
| 5926 | 5809 |
| 5927 | 6797 |
| 5928 | 3977 |
| 5929 | 5494 |
| 5930 | 6392 |
| 5931 | 4855 |
| 5932 | 3867 |
| 5933 | 7198 |
| 5934 | 5543 |
| 5935 | 2013 |
| 5936 | 6513 |
| 5937 | 5586 |
| 5938 | 6334 |
| 5939 | 3003 |
| 5940 | 5913 |
| 5941 | 6508 |
| 5942 | 3545 |
| 5943 | 5104 |
| 5944 | 7314 |
| 5945 | 3706 |
| 5946 | 5370 |
| 5947 | 6798 |
| 5948 | 5491 |
| 5949 | 3816 |
| 5950 | 6803 |
| 5951 | 5601 |
| 5952 | 3924 |
| 5953 | 7239 |

TABLE Q1-continued

| with a sequence length of 8192: | |
|---|---|
| Reliability or reliability sequence number | Polarized channel sequence number |
| 5954 | 4606 |
| 5955 | 6479 |
| 5956 | 4032 |
| 5957 | 5694 |
| 5958 | 6624 |
| 5959 | 3052 |
| 5960 | 7430 |
| 5961 | 5533 |
| 5962 | 6459 |
| 5963 | 3937 |
| 5964 | 5723 |
| 5965 | 6365 |
| 5966 | 3765 |
| 5967 | 5075 |
| 5968 | 7433 |
| 5969 | 5486 |
| 5970 | 2027 |
| 5971 | 6514 |
| 5972 | 5588 |
| 5973 | 3869 |
| 5974 | 6757 |
| 5975 | 5775 |
| 5976 | 7329 |
| 5977 | 3978 |
| 5978 | 5049 |
| 5979 | 6566 |
| 5980 | 3058 |
| 5981 | 6020 |
| 5982 | 6569 |
| 5983 | 5925 |
| 5984 | 3787 |
| 5985 | 7744 |
| 5986 | 5735 |
| 5987 | 3879 |
| 5988 | 6595 |
| 5989 | 6758 |
| 5990 | 4859 |
| 5991 | 3546 |
| 5992 | 7213 |
| 5993 | 5804 |
| 5994 | 3708 |
| 5995 | 6687 |
| 5996 | 5830 |
| 5997 | 6379 |
| 5998 | 3766 |
| 5999 | 5549 |
| 6000 | 7268 |
| 6001 | 3005 |
| 6002 | 5070 |
| 6003 | 6556 |
| 6004 | 5914 |
| 6005 | 2014 |
| 6006 | 6487 |
| 6007 | 5372 |
| 6008 | 3326 |
| 6009 | 6516 |
| 6010 | 5493 |
| 6011 | 7808 |
| 6012 | 3789 |
| 6013 | 6919 |
| 6014 | 5725 |
| 6015 | 6461 |
| 6016 | 3647 |
| 6017 | 5050 |
| 6018 | 7219 |
| 6019 | 3985 |
| 6020 | 5968 |
| 6021 | 6366 |
| 6022 | 5810 |
| 6023 | 3870 |
| 6024 | 6570 |
| 6025 | 5833 |
| 6026 | 3031 |
| 6027 | 7316 |
| 6028 | 4975 |

TABLE Q1-continued with a sequence length of 8192:

| Reliability or reliability sequence number | Polarized channel sequence number |
|---|---|
| 6029 | 6597 |
| 6030 | 3883 |
| 6031 | 5752 |
| 6032 | 6381 |
| 6033 | 3451 |
| 6034 | 7214 |
| 6035 | 5602 |
| 6036 | 6703 |
| 6037 | 3769 |
| 6038 | 5926 |
| 6039 | 6977 |
| 6040 | 5077 |
| 6041 | 3503 |
| 6042 | 7243 |
| 6043 | 5547 |
| 6044 | 2029 |
| 6045 | 6948 |
| 6046 | 6024 |
| 6047 | 6856 |
| 6048 | 3679 |
| 6049 | 5534 |
| 6050 | 7434 |
| 6051 | 3561 |
| 6052 | 6978 |
| 6053 | 5078 |
| 6054 | 6805 |
| 6055 | 3006 |
| 6056 | 5343 |
| 6057 | 7441 |
| 6058 | 5783 |
| 6059 | 3938 |
| 6060 | 6952 |
| 6061 | 5812 |
| 6062 | 3795 |
| 6063 | 6923 |
| 6064 | 5955 |
| 6065 | 7685 |
| 6066 | 3558 |
| 6067 | 5023 |
| 6068 | 6761 |
| 6069 | 3980 |
| 6070 | 7272 |
| 6071 | 5739 |
| 6072 | 6748 |
| 6073 | 3790 |
| 6074 | 5592 |
| 6075 | 6577 |
| 6076 | 5575 |
| 6077 | 3035 |
| 6078 | 7330 |
| 6079 | 5091 |
| 6080 | 3885 |
| 6081 | 6864 |
| 6082 | 5916 |
| 6083 | 6960 |
| 6084 | 1983 |
| 6085 | 5929 |
| 6086 | 7221 |
| 6087 | 6980 |
| 6088 | 3548 |
| 6089 | 5834 |
| 6090 | 6491 |
| 6091 | 3928 |
| 6092 | 5841 |
| 6093 | 7361 |
| 6094 | 4861 |
| 6095 | 3911 |
| 6096 | 7041 |
| 6097 | 5957 |
| 6098 | 6387 |
| 6099 | 3797 |
| 6100 | 7320 |
| 6101 | 5836 |
| 6102 | 3060 |
| 6103 | 6806 |

TABLE Q1-continued with a sequence length of 8192:

| Reliability or reliability sequence number | Polarized channel sequence number |
|---|---|
| 6104 | 5984 |
| 6105 | 6598 |
| 6106 | 3770 |
| 6107 | 5052 |
| 6108 | 7245 |
| 6109 | 5930 |
| 6110 | 3986 |
| 6111 | 6462 |
| 6112 | 5726 |
| 6113 | 6819 |
| 6114 | 3824 |
| 6115 | 7332 |
| 6116 | 6032 |
| 6117 | 3940 |
| 6118 | 6762 |
| 6119 | 5842 |
| 6120 | 7042 |
| 6121 | 3891 |
| 6122 | 4983 |
| 6123 | 7936 |
| 6124 | 5816 |
| 6125 | 2035 |
| 6126 | 6925 |
| 6127 | 5497 |
| 6128 | 3886 |
| 6129 | 6520 |
| 6130 | 7436 |
| 6131 | 5555 |
| 6132 | 3047 |
| 6133 | 6572 |
| 6134 | 5937 |
| 6135 | 7442 |
| 6136 | 3511 |
| 6137 | 5081 |
| 6138 | 6809 |
| 6139 | 5439 |
| 6140 | 4001 |
| 6141 | 6880 |
| 6142 | 7686 |
| 6143 | 5741 |
| 6144 | 3562 |
| 6145 | 6711 |
| 6146 | 5932 |
| 6147 | 3695 |
| 6148 | 6984 |
| 6149 | 5093 |
| 6150 | 7222 |
| 6151 | 3743 |
| 6152 | 5604 |
| 6153 | 6769 |
| 6154 | 6382 |
| 6155 | 3811 |
| 6156 | 5550 |
| 6157 | 7251 |
| 6158 | 5958 |
| 6159 | 3064 |
| 6160 | 6503 |
| 6161 | 5787 |
| 6162 | 3988 |
| 6163 | 6601 |
| 6164 | 5082 |
| 6165 | 7225 |
| 6166 | 3535 |
| 6167 | 6543 |
| 6168 | 5608 |
| 6169 | 6931 |
| 6170 | 2037 |
| 6171 | 5359 |
| 6172 | 7689 |
| 6173 | 5498 |
| 6174 | 3915 |
| 6175 | 6735 |
| 6176 | 7280 |
| 6177 | 5579 |
| 6178 | 3453 |

TABLE Q1-continued with a sequence length of 8192:

| Reliability or reliability sequence number | Polarized channel sequence number |
|---|---|
| 6179 | 6822 |
| 6180 | 5039 |
| 6181 | 3569 |
| 6182 | 6578 |
| 6183 | 5742 |
| 6184 | 7303 |
| 6185 | 2815 |
| 6186 | 5747 |
| 6187 | 6821 |
| 6188 | 6493 |
| 6189 | 4002 |
| 6190 | 5557 |
| 6191 | 7246 |
| 6192 | 5500 |
| 6193 | 3893 |
| 6194 | 6389 |
| 6195 | 4987 |
| 6196 | 6602 |
| 6197 | 3798 |
| 6198 | 7457 |
| 6199 | 5938 |
| 6200 | 6810 |
| 6201 | 4033 |
| 6202 | 5581 |
| 6203 | 7362 |
| 6204 | 5616 |
| 6205 | 3944 |
| 6206 | 6764 |
| 6207 | 5789 |
| 6208 | 3564 |
| 6209 | 6507 |
| 6210 | 7253 |
| 6211 | 5094 |
| 6212 | 3703 |
| 6213 | 6271 |
| 6214 | 5799 |
| 6215 | 6335 |
| 6216 | 1919 |
| 6217 | 5844 |
| 6218 | 7444 |
| 6219 | 6926 |
| 6220 | 3037 |
| 6221 | 5961 |
| 6222 | 7690 |
| 6223 | 4862 |
| 6224 | 3801 |
| 6225 | 6551 |
| 6226 | 5749 |
| 6227 | 6580 |
| 6228 | 3772 |
| 6229 | 7226 |
| 6230 | 5471 |
| 6231 | 6770 |
| 6232 | 3515 |
| 6233 | 5587 |
| 6234 | 6715 |
| 6235 | 5558 |
| 6236 | 3813 |
| 6237 | 7336 |
| 6238 | 6609 |
| 6239 | 4607 |
| 6240 | 3917 |
| 6241 | 7307 |
| 6242 | 5857 |
| 6243 | 6825 |
| 6244 | 3992 |
| 6245 | 5371 |
| 6246 | 6390 |
| 6247 | 7267 |
| 6248 | 3051 |
| 6249 | 5582 |
| 6250 | 6851 |
| 6251 | 5562 |
| 6252 | 3454 |
| 6253 | 6494 |

TABLE Q1-continued with a sequence length of 8192:

| Reliability or reliability sequence number | Polarized channel sequence number |
|---|---|
| 6254 | 5561 |
| 6255 | 7254 |
| 6256 | 3894 |
| 6257 | 6743 |
| 6258 | 5084 |
| 6259 | 7228 |
| 6260 | 3923 |
| 6261 | 5589 |
| 6262 | 6812 |
| 6263 | 5367 |
| 6264 | 3802 |
| 6265 | 6934 |
| 6266 | 7448 |
| 6267 | 5803 |
| 6268 | 2030 |
| 6269 | 6604 |
| 6270 | 5962 |
| 6271 | 6393 |
| 6272 | 3570 |
| 6273 | 7257 |
| 6274 | 5097 |
| 6275 | 6826 |
| 6276 | 3952 |
| 6277 | 5858 |
| 6278 | 7458 |
| 6279 | 6019 |
| 6280 | 3038 |
| 6281 | 6717 |
| 6282 | 6555 |
| 6283 | 5790 |
| 6284 | 3814 |
| 6285 | 7697 |
| 6286 | 5903 |
| 6287 | 6947 |
| 6288 | 3517 |
| 6289 | 5047 |
| 6290 | 6933 |
| 6291 | 7692 |
| 6292 | 3543 |
| 6293 | 5969 |
| 6294 | 6853 |
| 6295 | 5940 |
| 6296 | 3707 |
| 6297 | 7364 |
| 6298 | 6509 |
| 6299 | 5848 |
| 6300 | 4004 |
| 6301 | 6584 |
| 6302 | 6048 |
| 6303 | 7309 |
| 6304 | 3759 |
| 6305 | 5098 |
| 6306 | 6772 |
| 6307 | 7269 |
| 6308 | 3975 |
| 6309 | 5911 |
| 6310 | 6833 |
| 6311 | 5487 |
| 6312 | 3053 |
| 6313 | 6518 |
| 6314 | 7315 |
| 6315 | 6021 |
| 6316 | 3897 |
| 6317 | 6567 |
| 6318 | 5750 |
| 6319 | 6610 |
| 6320 | 2038 |
| 6321 | 5805 |
| 6322 | 7344 |
| 6323 | 6937 |
| 6324 | 3572 |
| 6325 | 4989 |
| 6326 | 7310 |
| 6327 | 5964 |
| 6328 | 3918 |

TABLE Q1-continued

| with a sequence length of 8192: | |
|---|---|
| Reliability or reliability sequence number | Polarized channel sequence number |
| 6329 | 6394 |
| 6330 | 6515 |
| 6331 | 5753 |
| 6332 | 3817 |
| 6333 | 7698 |
| 6334 | 5831 |
| 6335 | 6625 |
| 6336 | 7489 |
| 6337 | 3898 |
| 6338 | 5373 |
| 6339 | 6718 |
| 6340 | 5071 |
| 6341 | 3804 |
| 6342 | 6557 |
| 6343 | 5811 |
| 6344 | 7199 |
| 6345 | 3518 |
| 6346 | 6747 |
| 6347 | 5944 |
| 6348 | 7368 |
| 6349 | 3007 |
| 6350 | 6022 |
| 6351 | 6510 |
| 6352 | 6612 |
| 6353 | 4034 |
| 6354 | 5806 |
| 6355 | 7258 |
| 6356 | 4990 |
| 6357 | 4008 |
| 6358 | 6799 |
| 6359 | 7713 |
| 6360 | 5860 |
| 6361 | 3547 |
| 6362 | 7044 |
| 6363 | 5970 |
| 6364 | 6949 |
| 6365 | 7460 |
| 6366 | 3925 |
| 6367 | 5495 |
| 6368 | 6759 |
| 6369 | 5564 |
| 6370 | 3939 |
| 6371 | 7490 |
| 6372 | 6828 |
| 6373 | 5590 |
| 6374 | 2041 |
| 6375 | 6854 |
| 6376 | 5105 |
| 6377 | 7700 |
| 6378 | 3709 |
| 6379 | 6573 |
| 6380 | 5603 |
| 6381 | 7431 |
| 6382 | 5535 |
| 6383 | 3979 |
| 6384 | 6938 |
| 6385 | 6396 |
| 6386 | 5605 |
| 6387 | 3059 |
| 6388 | 7317 |
| 6389 | 6025 |
| 6390 | 6517 |
| 6391 | 3559 |
| 6392 | 7270 |
| 6393 | 5915 |
| 6394 | 6749 |
| 6395 | 3767 |
| 6396 | 5051 |
| 6397 | 6992 |
| 6398 | 7273 |
| 6399 | 5593 |
| 6400 | 3818 |
| 6401 | 6834 |
| 6402 | 5754 |
| 6403 | 7472 |

TABLE Q1-continued

| with a sequence length of 8192: | |
|---|---|
| Reliability or reliability sequence number | Polarized channel sequence number |
| 6404 | 3900 |
| 6405 | 6857 |
| 6406 | 5864 |
| 6407 | 7464 |
| 6408 | 3825 |
| 6409 | 5972 |
| 6410 | 6776 |
| 6411 | 6626 |
| 6412 | 3926 |
| 6413 | 6080 |
| 6414 | 7331 |
| 6415 | 5100 |
| 6416 | 6950 |
| 6417 | 3929 |
| 6418 | 7260 |
| 6419 | 5985 |
| 6420 | 6571 |
| 6421 | 3061 |
| 6422 | 5813 |
| 6423 | 7048 |
| 6424 | 7215 |
| 6425 | 3576 |
| 6426 | 5917 |
| 6427 | 6558 |
| 6428 | 6026 |
| 6429 | 7435 |
| 6430 | 3871 |
| 6431 | 6367 |
| 6432 | 5106 |
| 6433 | 6807 |
| 6434 | 3327 |
| 6435 | 5835 |
| 6436 | 7553 |
| 6437 | 6836 |
| 6438 | 2042 |
| 6439 | 5927 |
| 6440 | 7714 |
| 6441 | 6979 |
| 6442 | 5594 |
| 6443 | 4036 |
| 6444 | 7492 |
| 6445 | 5756 |
| 6446 | 6763 |
| 6447 | 3981 |
| 6448 | 6616 |
| 6449 | 5814 |
| 6450 | 7376 |
| 6451 | 3791 |
| 6452 | 5053 |
| 6453 | 6599 |
| 6454 | 7554 |
| 6455 | 5374 |
| 6456 | 3549 |
| 6457 | 6940 |
| 6458 | 5837 |
| 6459 | 6953 |
| 6460 | 3987 |
| 6461 | 7318 |
| 6462 | 5695 |
| 6463 | 6858 |
| 6464 | 7321 |
| 6465 | 2943 |
| 6466 | 6033 |
| 6467 | 6865 |
| 6468 | 5918 |
| 6469 | 3710 |
| 6470 | 7333 |
| 6471 | 6981 |
| 6472 | 5079 |
| 6473 | 3820 |
| 6474 | 6860 |
| 6475 | 5931 |
| 6476 | 7274 |
| 6477 | 7008 |
| 6478 | 4016 |

TABLE Q1-continued

| with a sequence length of 8192: | |
|---|---|
| Reliability or reliability sequence number | Polarized channel sequence number |
| 6479 | 5499 |
| 6480 | 7223 |
| 6481 | 6954 |
| 6482 | 3941 |
| 6483 | 5817 |
| 6484 | 7496 |
| 6485 | 5551 |
| 6486 | 6750 |
| 6487 | 3563 |
| 6488 | 7056 |
| 6489 | 5727 |
| 6490 | 7704 |
| 6491 | 3771 |
| 6492 | 5609 |
| 6493 | 6866 |
| 6494 | 7745 |
| 6495 | 5054 |
| 6496 | 3826 |
| 6497 | 6840 |
| 6498 | 7716 |
| 6499 | 5986 |
| 6500 | 3930 |
| 6501 | 6521 |
| 6502 | 5843 |
| 6503 | 6579 |
| 6504 | 7281 |
| 6505 | 2015 |
| 6506 | 5606 |
| 6507 | 6961 |
| 6508 | 7322 |
| 6509 | 3054 |
| 6510 | 6028 |
| 6511 | 6463 |
| 6512 | 5838 |
| 6513 | 7247 |
| 6514 | 3550 |
| 6515 | 6765 |
| 6516 | 5083 |
| 6517 | 7437 |
| 6518 | 4040 |
| 6519 | 6956 |
| 6520 | 5933 |
| 6521 | 6628 |
| 6522 | 5596 |
| 6523 | 3455 |
| 6524 | 7276 |
| 6525 | 6574 |
| 6526 | 5976 |
| 6527 | 7746 |
| 6528 | 3982 |
| 6529 | 6982 |
| 6530 | 5959 |
| 6531 | 7392 |
| 6532 | 3887 |
| 6533 | 5845 |
| 6534 | 6811 |
| 6535 | 6632 |
| 6536 | 5108 |
| 6537 | 4048 |
| 6538 | 7334 |
| 6539 | 6383 |
| 6540 | 5818 |
| 6541 | 3942 |
| 6542 | 7687 |
| 6543 | 6034 |
| 6544 | 6522 |
| 6545 | 7720 |
| 6546 | 3989 |
| 6547 | 5872 |
| 6548 | 6603 |
| 6549 | 7363 |
| 6550 | 5988 |
| 6551 | 3062 |
| 6552 | 6766 |
| 6553 | 5939 |

TABLE Q1-continued

| with a sequence length of 8192: | |
|---|---|
| Reliability or reliability sequence number | Polarized channel sequence number |
| 6554 | 6771 |
| 6555 | 3799 |
| 6556 | 7438 |
| 6557 | 5934 |
| 6558 | 6581 |
| 6559 | 7809 |
| 6560 | 3565 |
| 6561 | 5095 |
| 6562 | 6524 |
| 6563 | 5559 |
| 6564 | 3945 |
| 6565 | 7691 |
| 6566 | 6962 |
| 6567 | 6049 |
| 6568 | 7443 |
| 6569 | 3773 |
| 6570 | 6605 |
| 6571 | 5610 |
| 6572 | 6640 |
| 6573 | 7748 |
| 6574 | 4003 |
| 6575 | 5743 |
| 6576 | 6813 |
| 6577 | 5791 |
| 6578 | 7459 |
| 6579 | 2044 |
| 6580 | 6823 |
| 6581 | 5859 |
| 6582 | 7227 |
| 6583 | 3828 |
| 6584 | 6868 |
| 6585 | 5112 |
| 6586 | 7337 |
| 6587 | 6985 |
| 6588 | 3932 |
| 6589 | 6036 |
| 6590 | 6773 |
| 6591 | 5583 |
| 6592 | 7728 |
| 6593 | 3571 |
| 6594 | 6495 |
| 6595 | 5963 |
| 6596 | 7282 |
| 6597 | 3803 |
| 6598 | 6611 |
| 6599 | 5501 |
| 6600 | 7445 |
| 6601 | 6582 |
| 6602 | 3065 |
| 6603 | 5617 |
| 6604 | 7324 |
| 6605 | 6881 |
| 6606 | 4863 |
| 6607 | 3895 |
| 6608 | 7255 |
| 6609 | 6050 |
| 6610 | 6395 |
| 6611 | 7365 |
| 6612 | 3994 |
| 6613 | 5941 |
| 6614 | 6606 |
| 6615 | 6586 |
| 6616 | 5846 |
| 6617 | 3946 |
| 6618 | 7284 |
| 6619 | 6585 |
| 6620 | 6081 |
| 6621 | 3990 |
| 6622 | 7338 |
| 6623 | 5992 |
| 6624 | 6613 |
| 6625 | 7229 |
| 6626 | 3574 |
| 6627 | 5612 |
| 6628 | 6391 |

TABLE Q1-continued

| with a sequence length of 8192: | |
|---|---|
| Reliability or reliability sequence number | Polarized channel sequence number |
| 6629 | 7699 |
| 6630 | 5751 |
| 6631 | 4005 |
| 6632 | 6827 |
| 6633 | 7693 |
| 6634 | 5085 |
| 6635 | 6986 |
| 6636 | 3815 |
| 6637 | 7810 |
| 6638 | 5849 |
| 6639 | 6882 |
| 6640 | 7043 |
| 6641 | 3832 |
| 6642 | 5820 |
| 6643 | 7449 |
| 6644 | 5563 |
| 6645 | 6814 |
| 6646 | 3953 |
| 6647 | 7446 |
| 6648 | 5861 |
| 6649 | 6927 |
| 6650 | 7694 |
| 6651 | 3066 |
| 6652 | 5965 |
| 6653 | 6993 |
| 6654 | 7345 |
| 6655 | 6040 |
| 6656 | 3566 |
| 6657 | 6964 |
| 6658 | 7461 |
| 6659 | 5099 |
| 6660 | 2031 |
| 6661 | 6872 |
| 6662 | 7556 |
| 6663 | 5502 |
| 6664 | 7072 |
| 6665 | 3774 |
| 6666 | 7259 |
| 6667 | 5942 |
| 6668 | 6935 |
| 6669 | 5971 |
| 6670 | 3993 |
| 6671 | 6511 |
| 6672 | 7752 |
| 6673 | 5850 |
| 6674 | 7045 |
| 6675 | 3573 |
| 6676 | 7937 |
| 6677 | 5618 |
| 6678 | 6774 |
| 6679 | 7366 |
| 6680 | 3948 |
| 6681 | 6000 |
| 6682 | 6829 |
| 6683 | 7340 |
| 6684 | 5086 |
| 6685 | 3919 |
| 6686 | 6988 |
| 6687 | 7288 |
| 6688 | 5862 |
| 6689 | 6777 |
| 6690 | 4064 |
| 6691 | 7369 |
| 6692 | 5565 |
| 6693 | 6855 |
| 6694 | 7504 |
| 6695 | 3519 |
| 6696 | 5591 |
| 6697 | 6397 |
| 6698 | 7230 |
| 6699 | 5755 |
| 6700 | 3805 |
| 6701 | 6835 |
| 6702 | 7450 |
| 6703 | 6052 |

TABLE Q1-continued

| with a sequence length of 8192: | |
|---|---|
| Reliability or reliability sequence number | Polarized channel sequence number |
| 6704 | 6968 |
| 6705 | 3899 |
| 6706 | 7311 |
| 6707 | 5807 |
| 6708 | 7046 |
| 6709 | 7271 |
| 6710 | 6023 |
| 6711 | 3039 |
| 6712 | 6830 |
| 6713 | 5101 |
| 6714 | 6884 |
| 6715 | 7346 |
| 6716 | 4006 |
| 6717 | 5945 |
| 6718 | 6994 |
| 6719 | 7462 |
| 6720 | 5620 |
| 6721 | 3954 |
| 6722 | 6519 |
| 6723 | 7261 |
| 6724 | 5966 |
| 6725 | 6588 |
| 6726 | 4009 |
| 6727 | 7812 |
| 6728 | 5865 |
| 6729 | 6614 |
| 6730 | 7370 |
| 6731 | 4035 |
| 6732 | 5946 |
| 6733 | 6627 |
| 6734 | 7760 |
| 6735 | 5852 |
| 6736 | 3819 |
| 6737 | 6559 |
| 6738 | 7491 |
| 6739 | 5566 |
| 6740 | 6629 |
| 6741 | 3577 |
| 6742 | 7560 |
| 6743 | 5055 |
| 6744 | 7049 |
| 6745 | 7465 |
| 6746 | 6082 |
| 6747 | 3927 |
| 6748 | 6939 |
| 6749 | 7938 |
| 6750 | 6056 |
| 6751 | 6617 |
| 6752 | 2039 |
| 6753 | 7275 |
| 6754 | 5595 |
| 6755 | 6778 |
| 6756 | 7348 |
| 6757 | 3996 |
| 6758 | 5973 |
| 6759 | 6888 |
| 6760 | 7319 |
| 6761 | 5987 |
| 6762 | 3806 |
| 6763 | 6996 |
| 6764 | 7377 |
| 6765 | 7104 |
| 6766 | 5757 |
| 6767 | 7452 |
| 6768 | 3901 |
| 6769 | 7009 |
| 6770 | 6027 |
| 6771 | 7816 |
| 6772 | 6837 |
| 6773 | 3068 |
| 6774 | 5107 |
| 6775 | 7262 |
| 6776 | 6941 |
| 6777 | 5607 |
| 6778 | 4037 |

TABLE Q1-continued

| with a sequence length of 8192: | |
|---|---|
| Reliability or reliability sequence number | Polarized channel sequence number |
| 6779 | 7372 |
| 6780 | 7050 |
| 6781 | 5815 |
| 6782 | 7466 |
| 6783 | 6859 |
| 6784 | 4010 |
| 6785 | 5866 |
| 6786 | 7568 |
| 6787 | 6951 |
| 6788 | 5948 |
| 6789 | 3956 |
| 6790 | 7776 |
| 6791 | 6618 |
| 6792 | 5873 |
| 6793 | 7520 |
| 6794 | 3578 |
| 6795 | 6780 |
| 6796 | 5974 |
| 6797 | 7493 |
| 6798 | 6838 |
| 6799 | 5977 |
| 6800 | 3821 |
| 6801 | 7701 |
| 6802 | 6398 |
| 6803 | 5109 |
| 6804 | 7323 |
| 6805 | 4017 |
| 6806 | 6861 |
| 6807 | 5624 |
| 6808 | 7378 |
| 6809 | 6719 |
| 6810 | 4038 |
| 6811 | 7473 |
| 6812 | 5919 |
| 6813 | 7057 |
| 6814 | 7715 |
| 6815 | 5375 |
| 6816 | 3827 |
| 6817 | 6942 |
| 6818 | 7468 |
| 6819 | 6084 |
| 6820 | 6955 |
| 6821 | 3931 |
| 6822 | 7277 |
| 6823 | 6029 |
| 6824 | 6523 |
| 6825 | 7352 |
| 6826 | 5839 |
| 6827 | 4012 |
| 6828 | 6841 |
| 6829 | 7702 |
| 6830 | 5597 |
| 6831 | 6575 |
| 6832 | 3902 |
| 6833 | 6751 |
| 6834 | 6633 |
| 6835 | 6035 |
| 6836 | 7705 |
| 6837 | 7010 |
| 6838 | 3983 |
| 6839 | 4991 |
| 6840 | 7283 |
| 6841 | 6867 |
| 6842 | 5758 |
| 6843 | 3055 |
| 6844 | 7335 |
| 6845 | 6630 |
| 6846 | 5868 |
| 6847 | 7393 |
| 6848 | 7052 |
| 6849 | 3943 |
| 6850 | 6064 |
| 6851 | 7494 |
| 6852 | 6862 |
| 6853 | 7474 |

TABLE Q1-continued

| with a sequence length of 8192: | |
|---|---|
| Reliability or reliability sequence number | Polarized channel sequence number |
| 6854 | 3711 |
| 6855 | 5989 |
| 6856 | 6957 |
| 6857 | 7940 |
| 6858 | 5611 |
| 6859 | 6620 |
| 6860 | 3960 |
| 6861 | 7325 |
| 6862 | 5819 |
| 6863 | 7000 |
| 6864 | 7824 |
| 6865 | 5874 |
| 6866 | 2043 |
| 6867 | 6983 |
| 6868 | 7497 |
| 6869 | 5978 |
| 6870 | 6869 |
| 6871 | 3551 |
| 6872 | 7278 |
| 6873 | 6842 |
| 6874 | 5102 |
| 6875 | 7285 |
| 6876 | 7058 |
| 6877 | 4018 |
| 6878 | 5598 |
| 6879 | 7380 |
| 6880 | 6896 |
| 6881 | 6088 |
| 6882 | 7339 |
| 6883 | 3822 |
| 6884 | 7012 |
| 6885 | 7944 |
| 6886 | 5503 |
| 6887 | 6963 |
| 6888 | 4041 |
| 6889 | 7498 |
| 6890 | 6030 |
| 6891 | 6958 |
| 6892 | 7394 |
| 6893 | 5935 |
| 6894 | 3580 |
| 6895 | 6583 |
| 6896 | 7717 |
| 6897 | 6096 |
| 6898 | 7073 |
| 6899 | 7706 |
| 6900 | 3933 |
| 6901 | 6634 |
| 6902 | 5990 |
| 6903 | 7555 |
| 6904 | 6767 |
| 6905 | 6037 |
| 6906 | 3829 |
| 6907 | 7476 |
| 6908 | 6815 |
| 6909 | 5110 |
| 6910 | 7384 |
| 6911 | 6883 |
| 6912 | 4042 |
| 6913 | 7584 |
| 6914 | 5847 |
| 6915 | 7060 |
| 6916 | 7439 |
| 6917 | 3991 |
| 6918 | 5613 |
| 6919 | 6607 |
| 6920 | 7447 |
| 6921 | 6987 |
| 6922 | 5993 |
| 6923 | 3063 |
| 6924 | 7326 |
| 6925 | 6525 |
| 6926 | 5821 |
| 6927 | 7505 |
| 6928 | 6641 |

TABLE Q1-continued

| with a sequence length of 8192: | |
|---|---|
| Reliability or reliability sequence number | Polarized channel sequence number |
| 6929 | 3947 |
| 6930 | 6051 |
| 6931 | 7718 |
| 6932 | 7074 |
| 6933 | 7840 |
| 6934 | 5876 |
| 6935 | 3934 |
| 6936 | 6965 |
| 6937 | 7286 |
| 6938 | 5980 |
| 6939 | 6870 |
| 6940 | 7500 |
| 6941 | 3830 |
| 6942 | 5619 |
| 6943 | 7747 |
| 6944 | 7105 |
| 6945 | 7708 |
| 6946 | 5851 |
| 6947 | 4020 |
| 6948 | 7016 |
| 6949 | 7557 |
| 6950 | 5113 |
| 6951 | 6636 |
| 6952 | 7341 |
| 6953 | 4049 |
| 6954 | 6775 |
| 6955 | 5943 |
| 6956 | 7289 |
| 6957 | 6873 |
| 6958 | 6042 |
| 6959 | 3995 |
| 6960 | 7721 |
| 6961 | 6844 |
| 6962 | 7367 |
| 6963 | 5994 |
| 6964 | 6587 |
| 6965 | 4044 |
| 6966 | 7952 |
| 6967 | 6038 |
| 6968 | 6885 |
| 6969 | 7347 |
| 6970 | 6989 |
| 6971 | 3833 |
| 6972 | 5622 |
| 6973 | 7396 |
| 6974 | 7064 |
| 6975 | 6053 |
| 6976 | 7506 |
| 6977 | 3949 |
| 6978 | 6526 |
| 6979 | 7480 |
| 6980 | 5863 |
| 6981 | 6966 |
| 6982 | 7872 |
| 6983 | 4024 |
| 6984 | 5880 |
| 6985 | 7558 |
| 6986 | 6995 |
| 6987 | 7342 |
| 6988 | 6001 |
| 6989 | 3567 |
| 6990 | 6874 |
| 6991 | 7722 |
| 6992 | 5114 |
| 6993 | 6642 |
| 6994 | 7749 |
| 6995 | 2045 |
| 6996 | 7024 |
| 6997 | 5614 |
| 6998 | 7561 |
| 6999 | 6886 |
| 7000 | 5822 |
| 7001 | 7451 |
| 7002 | 3775 |
| 7003 | 6589 |

TABLE Q1-continued

| with a sequence length of 8192: | |
|---|---|
| Reliability or reliability sequence number | Polarized channel sequence number |
| 7004 | 7290 |
| 7005 | 6041 |
| 7006 | 6615 |
| 7007 | 7616 |
| 7008 | 4007 |
| 7009 | 5621 |
| 7010 | 7521 |
| 7011 | 6779 |
| 7012 | 7729 |
| 7013 | 5996 |
| 7014 | 4050 |
| 7015 | 7076 |
| 7016 | 7371 |
| 7017 | 6831 |
| 7018 | 5967 |
| 7019 | 7231 |
| 7020 | 3067 |
| 7021 | 7047 |
| 7022 | 6112 |
| 7023 | 7508 |
| 7024 | 6969 |
| 7025 | 7562 |
| 7026 | 5567 |
| 7027 | 3955 |
| 7028 | 6644 |
| 7029 | 7695 |
| 7030 | 5853 |
| 7031 | 7750 |
| 7032 | 6990 |
| 7033 | 3834 |
| 7034 | 7724 |
| 7035 | 5947 |
| 7036 | 6889 |
| 7037 | 7349 |
| 7038 | 6970 |
| 7039 | 5087 |
| 7040 | 3575 |
| 7041 | 7463 |
| 7042 | 6876 |
| 7043 | 6054 |
| 7044 | 7453 |
| 7045 | 6590 |
| 7046 | 3997 |
| 7047 | 7400 |
| 7048 | 6002 |
| 7049 | 7292 |
| 7050 | 7106 |
| 7051 | 7373 |
| 7052 | 3950 |
| 7053 | 6057 |
| 7054 | 7080 |
| 7055 | 7350 |
| 7056 | 6619 |
| 7057 | 6083 |
| 7058 | 7811 |
| 7059 | 3807 |
| 7060 | 6997 |
| 7061 | 5867 |
| 7062 | 7730 |
| 7063 | 7011 |
| 7064 | 7454 |
| 7065 | 4065 |
| 7066 | 5625 |
| 7067 | 7753 |
| 7068 | 6781 |
| 7069 | 7467 |
| 7070 | 5975 |
| 7071 | 7051 |
| 7072 | 3957 |
| 7073 | 7522 |
| 7074 | 6631 |
| 7075 | 6044 |
| 7076 | 7379 |
| 7077 | 6839 |
| 7078 | 4011 |

TABLE Q1-continued with a sequence length of 8192:

| Reliability or reliability sequence number | Polarized channel sequence number |
|---|---|
| 7079 | 5854 |
| 7080 | 7569 |
| 7081 | 7353 |
| 7082 | 6890 |
| 7083 | 5949 |
| 7084 | 7564 |
| 7085 | 4066 |
| 7086 | 6972 |
| 7087 | 7512 |
| 7088 | 5116 |
| 7089 | 6897 |
| 7090 | 7754 |
| 7091 | 6998 |
| 7092 | 4052 |
| 7093 | 6085 |
| 7094 | 7813 |
| 7095 | 7761 |
| 7096 | 6058 |
| 7097 | 7001 |
| 7098 | 3998 |
| 7099 | 7703 |
| 7100 | 6648 |
| 7101 | 6004 |
| 7102 | 7408 |
| 7103 | 6943 |
| 7104 | 7374 |
| 7105 | 3836 |
| 7106 | 5626 |
| 7107 | 7263 |
| 7108 | 6399 |
| 7109 | 7495 |
| 7110 | 5869 |
| 7111 | 7108 |
| 7112 | 4013 |
| 7113 | 7732 |
| 7114 | 7053 |
| 7115 | 6065 |
| 7116 | 7968 |
| 7117 | 6863 |
| 7118 | 7570 |
| 7119 | 4039 |
| 7120 | 6086 |
| 7121 | 7524 |
| 7122 | 6621 |
| 7123 | 7475 |
| 7124 | 5875 |
| 7125 | 7059 |
| 7126 | 3069 |
| 7127 | 7469 |
| 7128 | 6782 |
| 7129 | 5979 |
| 7130 | 7585 |
| 7131 | 7381 |
| 7132 | 3958 |
| 7133 | 6892 |
| 7134 | 6060 |
| 7135 | 7736 |
| 7136 | 7088 |
| 7137 | 8000 |
| 7138 | 5950 |
| 7139 | 3903 |
| 7140 | 7013 |
| 7141 | 7756 |
| 7142 | 7354 |
| 7143 | 6031 |
| 7144 | 6635 |
| 7145 | 7814 |
| 7146 | 4019 |
| 7147 | 6843 |
| 7148 | 5103 |
| 7149 | 7572 |
| 7150 | 7395 |
| 7151 | 6898 |
| 7152 | 5991 |
| 7153 | 3579 |

TABLE Q1-continued with a sequence length of 8192:

| Reliability or reliability sequence number | Polarized channel sequence number |
|---|---|
| 7154 | 8064 |
| 7155 | 7002 |
| 7156 | 7762 |
| 7157 | 5759 |
| 7158 | 6622 |
| 7159 | 7586 |
| 7160 | 3961 |
| 7161 | 7470 |
| 7162 | 6008 |
| 7163 | 7112 |
| 7164 | 7817 |
| 7165 | 6527 |
| 7166 | 5599 |
| 7167 | 7939 |
| 7168 | 2046 |
| 7169 | 7054 |
| 7170 | 7528 |
| 7171 | 6066 |
| 7172 | 7707 |
| 7173 | 6959 |
| 7174 | 7279 |
| 7175 | 4056 |
| 7176 | 5870 |
| 7177 | 7120 |
| 7178 | 7499 |
| 7179 | 7382 |
| 7180 | 6089 |
| 7181 | 7014 |
| 7182 | 3823 |
| 7183 | 7477 |
| 7184 | 7061 |
| 7185 | 5628 |
| 7186 | 7356 |
| 7187 | 7617 |
| 7188 | 6871 |
| 7189 | 4014 |
| 7190 | 5981 |
| 7191 | 7385 |
| 7192 | 6637 |
| 7193 | 7576 |
| 7194 | 5877 |
| 7195 | 7017 |
| 7196 | 4068 |
| 7197 | 7777 |
| 7198 | 7764 |
| 7199 | 6090 |
| 7200 | 6845 |
| 7201 | 7719 |
| 7202 | 7075 |
| 7203 | 7818 |
| 7204 | 4043 |
| 7205 | 6039 |
| 7206 | 7397 |
| 7207 | 6900 |
| 7208 | 7327 |
| 7209 | 5111 |
| 7210 | 7004 |
| 7211 | 3962 |
| 7212 | 7588 |
| 7213 | 7478 |
| 7214 | 5995 |
| 7215 | 6643 |
| 7216 | 7709 |
| 7217 | 6875 |
| 7218 | 3581 |
| 7219 | 5982 |
| 7220 | 7941 |
| 7221 | 7778 |
| 7222 | 6967 |
| 7223 | 7825 |
| 7224 | 5878 |
| 7225 | 7066 |
| 7226 | 4021 |
| 7227 | 7501 |
| 7228 | 7287 |

TABLE Q1-continued with a sequence length of 8192:

| Reliability or reliability sequence number | Polarized channel sequence number |
|---|---|
| 7229 | 6068 |
| 7230 | 7018 |
| 7231 | 7768 |
| 7232 | 7062 |
| 7233 | 4045 |
| 7234 | 6097 |
| 7235 | 7507 |
| 7236 | 7386 |
| 7237 | 6646 |
| 7238 | 6043 |
| 7239 | 7536 |
| 7240 | 7077 |
| 7241 | 4072 |
| 7242 | 7820 |
| 7243 | 7398 |
| 7244 | 6092 |
| 7245 | 6887 |
| 7246 | 7559 |
| 7247 | 7481 |
| 7248 | 5881 |
| 7249 | 3964 |
| 7250 | 6904 |
| 7251 | 7618 |
| 7252 | 7025 |
| 7253 | 5997 |
| 7254 | 7710 |
| 7255 | 7502 |
| 7256 | 4022 |
| 7257 | 6638 |
| 7258 | 7401 |
| 7259 | 6072 |
| 7260 | 6846 |
| 7261 | 7723 |
| 7262 | 7942 |
| 7263 | 5615 |
| 7264 | 3935 |
| 7265 | 7065 |
| 7266 | 7343 |
| 7267 | 6645 |
| 7268 | 7291 |
| 7269 | 5823 |
| 7270 | 7826 |
| 7271 | 7020 |
| 7272 | 3831 |
| 7273 | 7780 |
| 7274 | 6055 |
| 7275 | 7509 |
| 7276 | 6991 |
| 7277 | 7945 |
| 7278 | 7136 |
| 7279 | 6098 |
| 7280 | 3070 |
| 7281 | 7388 |
| 7282 | 7482 |
| 7283 | 6591 |
| 7284 | 5115 |
| 7285 | 7592 |
| 7286 | 7563 |
| 7287 | 6877 |
| 7288 | 4080 |
| 7289 | 7841 |
| 7290 | 6003 |
| 7291 | 6971 |
| 7292 | 7751 |
| 7293 | 7523 |
| 7294 | 5882 |
| 7295 | 7078 |
| 7296 | 3582 |
| 7297 | 7455 |
| 7298 | 7351 |
| 7299 | 7026 |
| 7300 | 5623 |
| 7301 | 7402 |
| 7302 | 7081 |
| 7303 | 7293 |

TABLE Q1-continued with a sequence length of 8192:

| Reliability or reliability sequence number | Polarized channel sequence number |
|---|---|
| 7304 | 4051 |
| 7305 | 6045 |
| 7306 | 7725 |
| 7307 | 7107 |
| 7308 | 7828 |
| 7309 | 7784 |
| 7310 | 5998 |
| 7311 | 6891 |
| 7312 | 4025 |
| 7313 | 7510 |
| 7314 | 6649 |
| 7315 | 7484 |
| 7316 | 5855 |
| 7317 | 7409 |
| 7318 | 6999 |
| 7319 | 7946 |
| 7320 | 3835 |
| 7321 | 6113 |
| 7322 | 7731 |
| 7323 | 7068 |
| 7324 | 7513 |
| 7325 | 6878 |
| 7326 | 6005 |
| 7327 | 7620 |
| 7328 | 4046 |
| 7329 | 7565 |
| 7330 | 6973 |
| 7331 | 7571 |
| 7332 | 6059 |
| 7333 | 7375 |
| 7334 | 7109 |
| 7335 | 7842 |
| 7336 | 4026 |
| 7337 | 6114 |
| 7338 | 7726 |
| 7339 | 7082 |
| 7340 | 7953 |
| 7341 | 7600 |
| 7342 | 6100 |
| 7343 | 7028 |
| 7344 | 7525 |
| 7345 | 3951 |
| 7346 | 6650 |
| 7347 | 7355 |
| 7348 | 6046 |
| 7349 | 7404 |
| 7350 | 6893 |
| 7351 | 7832 |
| 7352 | 7792 |
| 7353 | 4053 |
| 7354 | 5884 |
| 7355 | 7089 |
| 7356 | 7755 |
| 7357 | 7948 |
| 7358 | 7110 |
| 7359 | 6061 |
| 7360 | 7873 |
| 7361 | 7294 |
| 7362 | 4054 |
| 7363 | 6899 |
| 7364 | 7410 |
| 7365 | 6087 |
| 7366 | 7003 |
| 7367 | 7733 |
| 7368 | 7566 |
| 7369 | 7084 |
| 7370 | 3999 |
| 7371 | 5117 |
| 7372 | 7514 |
| 7373 | 7624 |
| 7374 | 6974 |
| 7375 | 6006 |
| 7376 | 7526 |
| 7377 | 7573 |
| 7378 | 7055 |

TABLE Q1-continued

| with a sequence length of 8192: | |
|---|---|
| Reliability or reliability sequence number | Polarized channel sequence number |
| 7379 | 4067 |
| 7380 | 7471 |
| 7381 | 5951 |
| 7382 | 7737 |
| 7383 | 7015 |
| 7384 | 7412 |
| 7385 | 7763 |
| 7386 | 6067 |
| 7387 | 6783 |
| 7388 | 3837 |
| 7389 | 7357 |
| 7390 | 7734 |
| 7391 | 7032 |
| 7392 | 5627 |
| 7393 | 7844 |
| 7394 | 7529 |
| 7395 | 6623 |
| 7396 | 4028 |
| 7397 | 7874 |
| 7398 | 6009 |
| 7399 | 7757 |
| 7400 | 7090 |
| 7401 | 7383 |
| 7402 | 6894 |
| 7403 | 7954 |
| 7404 | 6104 |
| 7405 | 3959 |
| 7406 | 7815 |
| 7407 | 7113 |
| 7408 | 7516 |
| 7409 | 7587 |
| 7410 | 5871 |
| 7411 | 6652 |
| 7412 | 7574 |
| 7413 | 7632 |
| 7414 | 4057 |
| 7415 | 7005 |
| 7416 | 6062 |
| 7417 | 7848 |
| 7418 | 7969 |
| 7419 | 6901 |
| 7420 | 7530 |
| 7421 | 6116 |
| 7422 | 7758 |
| 7423 | 7114 |
| 7424 | 4069 |
| 7425 | 7577 |
| 7426 | 7738 |
| 7427 | 6091 |
| 7428 | 7063 |
| 7429 | 7956 |
| 7430 | 7765 |
| 7431 | 7740 |
| 7432 | 7019 |
| 7433 | 2047 |
| 7434 | 6010 |
| 7435 | 7387 |
| 7436 | 7479 |
| 7437 | 7006 |
| 7438 | 7876 |
| 7439 | 5629 |
| 7440 | 7766 |
| 7441 | 6902 |
| 7442 | 4058 |
| 7443 | 7769 |
| 7444 | 7819 |
| 7445 | 6069 |
| 7446 | 7092 |
| 7447 | 7589 |
| 7448 | 7960 |
| 7449 | 7121 |
| 7450 | 7970 |
| 7451 | 4015 |
| 7452 | 6093 |
| 7453 | 7779 |

TABLE Q1-continued

| with a sequence length of 8192: | |
|---|---|
| Reliability or reliability sequence number | Polarized channel sequence number |
| 7454 | 7067 |
| 7455 | 7770 |
| 7456 | 7578 |
| 7457 | 6120 |
| 7458 | 7116 |
| 7459 | 7399 |
| 7460 | 7856 |
| 7461 | 3963 |
| 7462 | 6905 |
| 7463 | 6012 |
| 7464 | 7821 |
| 7465 | 7416 |
| 7466 | 7021 |
| 7467 | 7537 |
| 7468 | 7358 |
| 7469 | 6070 |
| 7470 | 4070 |
| 7471 | 7532 |
| 7472 | 7096 |
| 7473 | 7822 |
| 7474 | 7827 |
| 7475 | 5983 |
| 7476 | 6639 |
| 7477 | 7503 |
| 7478 | 7648 |
| 7479 | 6847 |
| 7480 | 3838 |
| 7481 | 7483 |
| 7482 | 5879 |
| 7483 | 7389 |
| 7484 | 7079 |
| 7485 | 7538 |
| 7486 | 7781 |
| 7487 | 7122 |
| 7488 | 5118 |
| 7489 | 7590 |
| 7490 | 3583 |
| 7491 | 7593 |
| 7492 | 7619 |
| 7493 | 7027 |
| 7494 | 6128 |
| 7495 | 7782 |
| 7496 | 7711 |
| 7497 | 6906 |
| 7498 | 7403 |
| 7499 | 7580 |
| 7500 | 3071 |
| 7501 | 5630 |
| 7502 | 6647 |
| 7503 | 7511 |
| 7504 | 7540 |
| 7505 | 7069 |
| 7506 | 7943 |
| 7507 | 6099 |
| 7508 | 7485 |
| 7509 | 7390 |
| 7510 | 4060 |
| 7511 | 7022 |
| 7512 | 7594 |
| 7513 | 7621 |
| 7514 | 6073 |
| 7515 | 6879 |
| 7516 | 7405 |
| 7517 | 7727 |
| 7518 | 8001 |
| 7519 | 5883 |
| 7520 | 4073 |
| 7521 | 7137 |
| 7522 | 7972 |
| 7523 | 7880 |
| 7524 | 7029 |
| 7525 | 8002 |
| 7526 | 6094 |
| 7527 | 7829 |
| 7528 | 7083 |

TABLE Q1-continued

| with a sequence length of 8192: | |
| --- | --- |
| Reliability or reliability sequence number | Polarized channel sequence number |
| 7529 | 7976 |
| 7530 | 4023 |
| 7531 | 7947 |
| 7532 | 7785 |
| 7533 | 6074 |
| 7534 | 7138 |
| 7535 | 7772 |
| 7536 | 7601 |
| 7537 | 7124 |
| 7538 | 7888 |
| 7539 | 5999 |
| 7540 | 7984 |
| 7541 | 4074 |
| 7542 | 8004 |
| 7543 | 7070 |
| 7544 | 7515 |
| 7545 | 8065 |
| 7546 | 6101 |
| 7547 | 6908 |
| 7548 | 7411 |
| 7549 | 7830 |
| 7550 | 7622 |
| 7551 | 7085 |
| 7552 | 3965 |
| 7553 | 6102 |
| 7554 | 7486 |
| 7555 | 7843 |
| 7556 | 7111 |
| 7557 | 7786 |
| 7558 | 8066 |
| 7559 | 6047 |
| 7560 | 7949 |
| 7561 | 7030 |
| 7562 | 4047 |
| 7563 | 7544 |
| 7564 | 7596 |
| 7565 | 6975 |
| 7566 | 7833 |
| 7567 | 6115 |
| 7568 | 7904 |
| 7569 | 7735 |
| 7570 | 7091 |
| 7571 | 8008 |
| 7572 | 7793 |
| 7573 | 3966 |
| 7574 | 5885 |
| 7575 | 6651 |
| 7576 | 7406 |
| 7577 | 7527 |
| 7578 | 7625 |
| 7579 | 7033 |
| 7580 | 6076 |
| 7581 | 7567 |
| 7582 | 7955 |
| 7583 | 7759 |
| 7584 | 4081 |
| 7585 | 7128 |
| 7586 | 7846 |
| 7587 | 7602 |
| 7588 | 6007 |
| 7589 | 6895 |
| 7590 | 7845 |
| 7591 | 7517 |
| 7592 | 7413 |
| 7593 | 7086 |
| 7594 | 6105 |
| 7595 | 4027 |
| 7596 | 7626 |
| 7597 | 7834 |
| 7598 | 7788 |
| 7599 | 7140 |
| 7600 | 7531 |
| 7601 | 7295 |
| 7602 | 6117 |
| 7603 | 7359 |

TABLE Q1-continued

| with a sequence length of 8192: | |
| --- | --- |
| Reliability or reliability sequence number | Polarized channel sequence number |
| 7604 | 7115 |
| 7605 | 7950 |
| 7606 | 7575 |
| 7607 | 4076 |
| 7608 | 7034 |
| 7609 | 6106 |
| 7610 | 7604 |
| 7611 | 7794 |
| 7612 | 7739 |
| 7613 | 6653 |
| 7614 | 7633 |
| 7615 | 7849 |
| 7616 | 6063 |
| 7617 | 7414 |
| 7618 | 4082 |
| 7619 | 7093 |
| 7620 | 7875 |
| 7621 | 7518 |
| 7622 | 7767 |
| 7623 | 7117 |
| 7624 | 6011 |
| 7625 | 7836 |
| 7626 | 7958 |
| 7627 | 7628 |
| 7628 | 7144 |
| 7629 | 7417 |
| 7630 | 4029 |
| 7631 | 7850 |
| 7632 | 6118 |
| 7633 | 7741 |
| 7634 | 7036 |
| 7635 | 7579 |
| 7636 | 7971 |
| 7637 | 7957 |
| 7638 | 5886 |
| 7639 | 7094 |
| 7640 | 7877 |
| 7641 | 7533 |
| 7642 | 4055 |
| 7643 | 7608 |
| 7644 | 7007 |
| 7645 | 7796 |
| 7646 | 5631 |
| 7647 | 7857 |
| 7648 | 7542 |
| 7649 | 6903 |
| 7650 | 7591 |
| 7651 | 7634 |
| 7652 | 7961 |
| 7653 | 7152 |
| 7654 | 4030 |
| 7655 | 5119 |
| 7656 | 7418 |
| 7657 | 7539 |
| 7658 | 7649 |
| 7659 | 6654 |
| 7660 | 7742 |
| 7661 | 7581 |
| 7662 | 6108 |
| 7663 | 7771 |
| 7664 | 7123 |
| 7665 | 7534 |
| 7666 | 7636 |
| 7667 | 4059 |
| 7668 | 7823 |
| 7669 | 7097 |
| 7670 | 6121 |
| 7671 | 8068 |
| 7672 | 7973 |
| 7673 | 7783 |
| 7674 | 6907 |
| 7675 | 7852 |
| 7676 | 7878 |
| 7677 | 6071 |
| 7678 | 7597 |

TABLE Q1-continued with a sequence length of 8192:

| Reliability or reliability sequence number | Polarized channel sequence number |
|---|---|
| 7679 | 7118 |
| 7680 | 4084 |
| 7681 | 7962 |
| 7682 | 7420 |
| 7683 | 7541 |
| 7684 | 7773 |
| 7685 | 7098 |
| 7686 | 6122 |
| 7687 | 8016 |
| 7688 | 7858 |
| 7689 | 7881 |
| 7690 | 7023 |
| 7691 | 7800 |
| 7692 | 4071 |
| 7693 | 7650 |
| 7694 | 6013 |
| 7695 | 7974 |
| 7696 | 7125 |
| 7697 | 7595 |
| 7698 | 8072 |
| 7699 | 7582 |
| 7700 | 7126 |
| 7701 | 7391 |
| 7702 | 6095 |
| 7703 | 7831 |
| 7704 | 7860 |
| 7705 | 8003 |
| 7706 | 4088 |
| 7707 | 7071 |
| 7708 | 7787 |
| 7709 | 7640 |
| 7710 | 7623 |
| 7711 | 6014 |
| 7712 | 7139 |
| 7713 | 7964 |
| 7714 | 7977 |
| 7715 | 7882 |
| 7716 | 7889 |
| 7717 | 6909 |
| 7718 | 8005 |
| 7719 | 3839 |
| 7720 | 6129 |
| 7721 | 7884 |
| 7722 | 8032 |
| 7723 | 7100 |
| 7724 | 7978 |
| 7725 | 7774 |
| 7726 | 8080 |
| 7727 | 7890 |
| 7728 | 6075 |
| 7729 | 7031 |
| 7730 | 7864 |
| 7731 | 7545 |
| 7732 | 7603 |
| 7733 | 4061 |
| 7734 | 7985 |
| 7735 | 7129 |
| 7736 | 7487 |
| 7737 | 6124 |
| 7738 | 7789 |
| 7739 | 7980 |
| 7740 | 7141 |
| 7741 | 7652 |
| 7742 | 7598 |
| 7743 | 8006 |
| 7744 | 7835 |
| 7745 | 6130 |
| 7746 | 7130 |
| 7747 | 4075 |
| 7748 | 7656 |
| 7749 | 7407 |
| 7750 | 7546 |
| 7751 | 7627 |
| 7752 | 7087 |
| 7753 | 7790 |

TABLE Q1-continued with a sequence length of 8192:

| Reliability or reliability sequence number | Polarized channel sequence number |
|---|---|
| 7754 | 6077 |
| 7755 | 7795 |
| 7756 | 7605 |
| 7757 | 7548 |
| 7758 | 7035 |
| 7759 | 7986 |
| 7760 | 7629 |
| 7761 | 7664 |
| 7762 | 4062 |
| 7763 | 7837 |
| 7764 | 6103 |
| 7765 | 7142 |
| 7766 | 7847 |
| 7767 | 7892 |
| 7768 | 8009 |
| 7769 | 6910 |
| 7770 | 7797 |
| 7771 | 7519 |
| 7772 | 7635 |
| 7773 | 6078 |
| 7774 | 7606 |
| 7775 | 6655 |
| 7776 | 4077 |
| 7777 | 7905 |
| 7778 | 7419 |
| 7779 | 7630 |
| 7780 | 7610 |
| 7781 | 7609 |
| 7782 | 6107 |
| 7783 | 7132 |
| 7784 | 7637 |
| 7785 | 7415 |
| 7786 | 7851 |
| 7787 | 8010 |
| 7788 | 7145 |
| 7789 | 7906 |
| 7790 | 8067 |
| 7791 | 7838 |
| 7792 | 4031 |
| 7793 | 6132 |
| 7794 | 7951 |
| 7795 | 7095 |
| 7796 | 8017 |
| 7797 | 7988 |
| 7798 | 7896 |
| 7799 | 8096 |
| 7800 | 7146 |
| 7801 | 7959 |
| 7802 | 6119 |
| 7803 | 7535 |
| 7804 | 8069 |
| 7805 | 7798 |
| 7806 | 7853 |
| 7807 | 7037 |
| 7808 | 4083 |
| 7809 | 8012 |
| 7810 | 7801 |
| 7811 | 7879 |
| 7812 | 6136 |
| 7813 | 7421 |
| 7814 | 7119 |
| 7815 | 7859 |
| 7816 | 7992 |
| 7817 | 8070 |
| 7818 | 7854 |
| 7819 | 7038 |
| 7820 | 7908 |
| 7821 | 8018 |
| 7822 | 5887 |
| 7823 | 7543 |
| 7824 | 4085 |
| 7825 | 7612 |
| 7826 | 7638 |
| 7827 | 7153 |
| 7828 | 7651 |

TABLE Q1-continued

| with a sequence length of 8192: | |
|---|---|
| Reliability or reliability sequence number | Polarized channel sequence number |
| 7829 | 7583 |
| 7830 | 7653 |
| 7831 | 8073 |
| 7832 | 7963 |
| 7833 | 6109 |
| 7834 | 7099 |
| 7835 | 7641 |
| 7836 | 7802 |
| 7837 | 7912 |
| 7838 | 8020 |
| 7839 | 8128 |
| 7840 | 7148 |
| 7841 | 3967 |
| 7842 | 8033 |
| 7843 | 7861 |
| 7844 | 6123 |
| 7845 | 7965 |
| 7846 | 8074 |
| 7847 | 7154 |
| 7848 | 7883 |
| 7849 | 7975 |
| 7850 | 7642 |
| 7851 | 7804 |
| 7852 | 7862 |
| 7853 | 7101 |
| 7854 | 6110 |
| 7855 | 7422 |
| 7856 | 7885 |
| 7857 | 7743 |
| 7858 | 4078 |
| 7859 | 8081 |
| 7860 | 7966 |
| 7861 | 7127 |
| 7862 | 7979 |
| 7863 | 7547 |
| 7864 | 7865 |
| 7865 | 7599 |
| 7866 | 6125 |
| 7867 | 7775 |
| 7868 | 7657 |
| 7869 | 7102 |
| 7870 | 8034 |
| 7871 | 7891 |
| 7872 | 7654 |
| 7873 | 8076 |
| 7874 | 7886 |
| 7875 | 7131 |
| 7876 | 4086 |
| 7877 | 7981 |
| 7878 | 6079 |
| 7879 | 7644 |
| 7880 | 8024 |
| 7881 | 8007 |
| 7882 | 7893 |
| 7883 | 7156 |
| 7884 | 7866 |
| 7885 | 8082 |
| 7886 | 7920 |
| 7887 | 8036 |
| 7888 | 7987 |
| 7889 | 6131 |
| 7890 | 7982 |
| 7891 | 7143 |
| 7892 | 7607 |
| 7893 | 8097 |
| 7894 | 7658 |
| 7895 | 4089 |
| 7896 | 7791 |
| 7897 | 7839 |
| 7898 | 7907 |
| 7899 | 7160 |
| 7900 | 8084 |
| 7901 | 7631 |
| 7902 | 6133 |
| 7903 | 8011 |

TABLE Q1-continued

| with a sequence length of 8192: | |
|---|---|
| Reliability or reliability sequence number | Polarized channel sequence number |
| 7904 | 7549 |
| 7905 | 7665 |
| 7906 | 6911 |
| 7907 | 8098 |
| 7908 | 7989 |
| 7909 | 7894 |
| 7910 | 8129 |
| 7911 | 8040 |
| 7912 | 7660 |
| 7913 | 7799 |
| 7914 | 6015 |
| 7915 | 4090 |
| 7916 | 7133 |
| 7917 | 7897 |
| 7918 | 7868 |
| 7919 | 7611 |
| 7920 | 7909 |
| 7921 | 8013 |
| 7922 | 8088 |
| 7923 | 7147 |
| 7924 | 7550 |
| 7925 | 7990 |
| 7926 | 8019 |
| 7927 | 7898 |
| 7928 | 6126 |
| 7929 | 7666 |
| 7930 | 8048 |
| 7931 | 7134 |
| 7932 | 7910 |
| 7933 | 7613 |
| 7934 | 7639 |
| 7935 | 7803 |
| 7936 | 4063 |
| 7937 | 8100 |
| 7938 | 7855 |
| 7939 | 8071 |
| 7940 | 7149 |
| 7941 | 7993 |
| 7942 | 6134 |
| 7943 | 7668 |
| 7944 | 8014 |
| 7945 | 7913 |
| 7946 | 7994 |
| 7947 | 7900 |
| 7948 | 7614 |
| 7949 | 7103 |
| 7950 | 8130 |
| 7951 | 8104 |
| 7952 | 7643 |
| 7953 | 8021 |
| 7954 | 8035 |
| 7955 | 6137 |
| 7956 | 7805 |
| 7957 | 4092 |
| 7958 | 8075 |
| 7959 | 7155 |
| 7960 | 7655 |
| 7961 | 7863 |
| 7962 | 7914 |
| 7963 | 7996 |
| 7964 | 7921 |
| 7965 | 8022 |
| 7966 | 8025 |
| 7967 | 7157 |
| 7968 | 7672 |
| 7969 | 7967 |
| 7970 | 7423 |
| 7971 | 6138 |
| 7972 | 8132 |
| 7973 | 8077 |
| 7974 | 7887 |
| 7975 | 7645 |
| 7976 | 8083 |
| 7977 | 7039 |
| 7978 | 7806 |

TABLE Q1-continued with a sequence length of 8192:

| Reliability or reliability sequence number | Polarized channel sequence number |
|---|---|
| 7979 | 7916 |
| 7980 | 8112 |
| 7981 | 4079 |
| 7982 | 8037 |
| 7983 | 7659 |
| 7984 | 7867 |
| 7985 | 7922 |
| 7986 | 8026 |
| 7987 | 6111 |
| 7988 | 7150 |
| 7989 | 7646 |
| 7990 | 8136 |
| 7991 | 7551 |
| 7992 | 8078 |
| 7993 | 7983 |
| 7994 | 8144 |
| 7995 | 8038 |
| 7996 | 8085 |
| 7997 | 7158 |
| 7998 | 7895 |
| 7999 | 7661 |
| 8000 | 8041 |
| 8001 | 7869 |
| 8002 | 8099 |
| 8003 | 6140 |
| 8004 | 7924 |
| 8005 | 8028 |
| 8006 | 4087 |
| 8007 | 7667 |
| 8008 | 7899 |
| 8009 | 7161 |
| 8010 | 7991 |
| 8011 | 8090 |
| 8012 | 8042 |
| 8013 | 8086 |
| 8014 | 7670 |
| 8015 | 8101 |
| 8016 | 7911 |
| 8017 | 7928 |
| 8018 | 8049 |
| 8019 | 7162 |
| 8020 | 7662 |
| 8021 | 6127 |
| 8022 | 7870 |
| 8023 | 8089 |
| 8024 | 7669 |
| 8025 | 8044 |
| 8026 | 8015 |
| 8027 | 8160 |
| 8028 | 7615 |
| 8029 | 7901 |
| 8030 | 7995 |
| 8031 | 7135 |
| 8032 | 8102 |
| 8033 | 4091 |
| 8034 | 8050 |
| 8035 | 8105 |
| 8036 | 8131 |
| 8037 | 7915 |
| 8038 | 7673 |
| 8039 | 8023 |
| 8040 | 6135 |
| 8041 | 8092 |
| 8042 | 7902 |
| 8043 | 7997 |
| 8044 | 7164 |
| 8045 | 8133 |
| 8046 | 8106 |
| 8047 | 8052 |
| 8048 | 7674 |
| 8049 | 7917 |
| 8050 | 8113 |
| 8051 | 8134 |
| 8052 | 7923 |
| 8053 | 8027 |

TABLE Q1-continued with a sequence length of 8192:

| Reliability or reliability sequence number | Polarized channel sequence number |
|---|---|
| 8054 | 8108 |
| 8055 | 7998 |
| 8056 | 8079 |
| 8057 | 7151 |
| 8058 | 8039 |
| 8059 | 7807 |
| 8060 | 8056 |
| 8061 | 6139 |
| 8062 | 7647 |
| 8063 | 8114 |
| 8064 | 4093 |
| 8065 | 7918 |
| 8066 | 8137 |
| 8067 | 7676 |
| 8068 | 8029 |
| 8069 | 7925 |
| 8070 | 8138 |
| 8071 | 8087 |
| 8072 | 7159 |
| 8073 | 8043 |
| 8074 | 8030 |
| 8075 | 7926 |
| 8076 | 8116 |
| 8077 | 8145 |
| 8078 | 8091 |
| 8079 | 8140 |
| 8080 | 7929 |
| 8081 | 8045 |
| 8082 | 8120 |
| 8083 | 7663 |
| 8084 | 6141 |
| 8085 | 7871 |
| 8086 | 8103 |
| 8087 | 8146 |
| 8088 | 7163 |
| 8089 | 8051 |
| 8090 | 7930 |
| 8091 | 7671 |
| 8092 | 8093 |
| 8093 | 8046 |
| 8094 | 7903 |
| 8095 | 8161 |
| 8096 | 8053 |
| 8097 | 8107 |
| 8098 | 4094 |
| 8099 | 8162 |
| 8100 | 8148 |
| 8101 | 8094 |
| 8102 | 7932 |
| 8103 | 8109 |
| 8104 | 8135 |
| 8105 | 7165 |
| 8106 | 8054 |
| 8107 | 7999 |
| 8108 | 8115 |
| 8109 | 7675 |
| 8110 | 8057 |
| 8111 | 6142 |
| 8112 | 8152 |
| 8113 | 7919 |
| 8114 | 8110 |
| 8115 | 8164 |
| 8116 | 8139 |
| 8117 | 8058 |
| 8118 | 7677 |
| 8119 | 8117 |
| 8120 | 8141 |
| 8121 | 8168 |
| 8122 | 8060 |
| 8123 | 8118 |
| 8124 | 8031 |
| 8125 | 7927 |
| 8126 | 7166 |
| 8127 | 8176 |
| 8128 | 7678 |

TABLE Q1-continued

| with a sequence length of 8192: | |
|---|---|
| Reliability or reliability sequence number | Polarized channel sequence number |
| 8129 | 8147 |
| 8130 | 8121 |
| 8131 | 7931 |
| 8132 | 8142 |
| 8133 | 8122 |
| 8134 | 8047 |
| 8135 | 8149 |
| 8136 | 8150 |
| 8137 | 8095 |
| 8138 | 4095 |
| 8139 | 8163 |
| 8140 | 7933 |
| 8141 | 8124 |
| 8142 | 8055 |
| 8143 | 8153 |
| 8144 | 8165 |
| 8145 | 6143 |
| 8146 | 8154 |
| 8147 | 8111 |
| 8148 | 8059 |
| 8149 | 8166 |
| 8150 | 7934 |
| 8151 | 7679 |
| 8152 | 7167 |
| 8153 | 8156 |
| 8154 | 8169 |
| 8155 | 8119 |
| 8156 | 8170 |
| 8157 | 8061 |
| 8158 | 8143 |
| 8159 | 8062 |
| 8160 | 8177 |
| 8161 | 8123 |
| 8162 | 8172 |
| 8163 | 8178 |
| 8164 | 8125 |
| 8165 | 8151 |
| 8166 | 8126 |
| 8167 | 8155 |
| 8168 | 8180 |
| 8169 | 8167 |
| 8170 | 8184 |
| 8171 | 7935 |
| 8172 | 8157 |
| 8173 | 8171 |
| 8174 | 8158 |
| 8175 | 8173 |
| 8176 | 8127 |
| 8177 | 8179 |
| 8178 | 8181 |
| 8179 | 8063 |
| 8180 | 8174 |
| 8181 | 8182 |
| 8182 | 8185 |
| 8183 | 8186 |
| 8184 | 8159 |
| 8185 | 8188 |
| 8186 | 8175 |
| 8187 | 8183 |
| 8188 | 8187 |
| 8189 | 8189 |
| 8190 | 8190 |
| 8191 | 8191 |

Sequence Q2, with a sequence length of 4096:

[0, 1, 2, 4, 8, 16, 32, 3, 5, 64, 1024, 2048, 9, 6, 17, 10, 18, 128, 12, 33, 65, 20, 256, 34, 24, 36, 7, 129, 66, 512, 11, 40, 68, 130, 19, 13, 48, 14, 72, 257, 1025, 21, 132, 35, 258, 26, 2049, 513, 8 0, 37, 25, 22, 136, 260, 264, 38, 514, 96, 67, 41, 144, 28, 69, 42, 516, 49, 1026, 74, 272, 160, 520, 2 88, 528, 192, 544, 70, 44, 131, 81, 2050, 50, 73, 15, 320, 133, 52, 1028, 23, 134, 384, 76, 137, 82, 5 6, 27, 97, 39, 259, 84, 138, 145, 261, 1032, 29, 43, 2052, 98, 515, 88, 140, 30, 146, 71, 262, 265, 16 1, 576, 45, 1040, 100, 640, 51, 148, 46, 75, 266, 273, 517, 2056, 104, 162, 53, 193, 1056, 152, 77, 164, 768, 268, 274, 518, 54, 83, 57, 521, 1027, 112, 135, 2064, 78, 289, 194, 85, 276, 522, 58, 168, 1029, 139, 99, 86, 60, 280, 89, 290, 529, 2080, 524, 196, 1088, 141, 101, 147, 176, 142, 530, 321, 31, 200, 1033, 90, 545, 292, 2051, 322, 532, 263, 149, 102, 105, 1030, 304, 296, 163, 92, 47, 267, 385, 546, 2053, 324, 1041, 208, 386, 150, 153, 165, 106, 55, 1034, 328, 536, 577, 548, 2112, 11 3, 154, 79, 269, 1042, 108, 578, 224, 166, 519, 552, 195, 1152, 270, 3072, 641, 523, 275, 580, 29 1, 59, 1036, 169, 560, 114, 277, 156, 2057, 87, 197, 1057, 116, 170, 61, 531, 525, 642, 281, 1089, 278, 526, 2054, 177, 293, 388, 91, 1044, 584, 769, 198, 172, 120, 201, 2065, 336, 1280, 62, 282, 143, 103, 178, 294, 1058, 93, 644, 2058, 202, 592, 323, 1048, 392, 297, 770, 107, 180, 151, 1060, 2066, 209, 284, 648, 94, 204, 298, 1031, 400, 608, 352, 2176, 325, 533, 1153, 155, 210, 305, 54 7, 300, 1090, 109, 2060, 184, 534, 537, 115, 167, 1536, 225, 326, 306, 772, 2081, 157, 1035, 656, 329, 110, 117, 212, 1064, 171, 2113, 776, 330, 226, 549, 1092, 538, 387, 308, 216, 2068, 1154, 4 16, 271, 279, 158, 337, 1043, 550, 672, 2304, 118, 332, 579, 1037, 540, 389, 173, 121, 1072, 208 2, 553, 199, 784, 179, 1038, 228, 338, 312, 2072, 704, 390, 1096, 174, 554, 581, 393, 1281, 283, 2084, 122, 448, 353, 1045, 561, 203, 63, 340, 2055, 1156, 394, 527, 582, 556, 181, 1059, 2177, 2 95, 285, 232, 124, 1282, 205, 182, 643, 2114, 562, 1050, 286, 585, 299, 1537, 354, 211, 2560, 40 1, 185, 1104, 396, 344, 586, 645, 2059, 1061, 593, 535, 240, 206, 1049, 95, 2088, 327, 564, 1046, 800, 402, 356, 307, 2116, 1160, 301, 417, 213, 568, 1284, 832, 2178, 588, 186, 1288, 646, 404, 227, 896, 2067, 1062, 594, 418, 302, 1538, 649, 771, 2061, 360, 539, 1120, 111, 331, 214, 1091, 2096, 309, 188, 449, 1065, 217, 408, 2062, 609, 596, 1168, 551, 650, 229, 1052, 2120, 159, 420, 310, 1093, 541, 773, 2305, 610, 1066, 657, 333, 119, 1540, 3073, 600, 339, 218, 1073, 368, 652, 230, 2069, 1098, 391, 313, 450, 1296, 542, 2180, 334, 233, 1184, 555, 774, 175, 2083, 1544, 12 3, 658, 612, 1312, 2306, 341, 777, 220, 1552, 314, 424, 2074, 395, 1216, 673, 583, 355, 1568, 25 61, 287, 183, 234, 1094, 125, 557, 2128, 660, 1068, 616, 342, 316, 2085, 1155, 241, 778, 1105, 5 63, 345, 2073, 452, 1074, 397, 403, 207, 2070, 1097, 674, 558, 1039, 785, 432, 2184, 357, 1344, 187, 236, 664, 2308, 1157, 624, 587, 1076, 780, 2312, 705, 126, 1047, 242, 565, 1158, 2086, 39 8, 346, 456, 1408, 358, 2562, 405, 1100, 303, 569, 244, 2144, 1161, 595, 189, 1106, 566, 2115, 6 76, 361, 1080, 706, 589, 2089, 1051, 215, 786, 647, 1121, 2192, 348, 419, 1063, 406, 464, 2076, 680, 1283, 801, 362, 1108, 2117, 590, 409, 1162, 570, 2090, 788, 597, 1169, 572, 219, 2564, 128 5, 311, 708, 1053, 598, 2097, 601, 1067, 651, 421, 3074, 792, 1122, 802, 611, 1539, 2122, 602, 4 10, 1112, 231, 688, 2320, 1164, 653, 248, 1054, 2208, 369, 190, 364, 1170, 654, 2568, 659, 1095, 335, 480, 2336, 1286, 315, 221, 1289, 2576, 370, 613, 1185, 422, 425, 2240, 1600, 451, 614, 10 69, 2592, 543, 235, 1124, 412, 2118, 343, 372, 1664, 775, 317, 2092, 1075, 222, 426, 1172, 217 9, 453, 237, 1070, 559, 2129, 833, 1099, 804, 712, 2098, 1290, 834, 661, 1297, 2121, 808, 779, 1 541, 617, 1128, 2063, 604, 433, 1186, 720, 2368, 816, 1077, 836, 347, 2181, 1217, 897, 243, 11 76, 2100, 662, 454, 1101, 318, 3076, 675, 1188, 618, 898, 2071, 1792, 781, 376, 2182, 1292, 42 8, 1298, 665, 2432, 736, 1542, 567, 840, 2124, 1078, 625, 238, 1107, 2185, 359, 457, 1081, 399, 2130, 787, 1545, 591, 1136, 2104, 678, 434, 1159, 2075, 677, 349, 1102, 245, 2145, 458, 1313, 666, 1218, 2087, 620, 363, 1109, 2307, 127, 191, 1300, 782, 2132, 1546, 407, 436, 1082, 2186, 626, 571, 1192, 2193, 465, 1163, 681, 246, 2309, 1123, 707, 350, 3080, 1110, 599, 1084, 668, 20 77, 790, 1304, 460, 2091, 249, 1113, 682, 1314, 2146, 573, 411, 1553, 2563, 803, 789, 1548, 70 9, 2136, 1220, 365, 440, 2188, 1165, 628, 1125, 689, 2078, 374, 1171, 423, 2194, 466, 1200, 79 3, 2119, 1166, 250, 371, 1554, 2310, 481, 1345, 574, 2313, 413, 1055, 603, 2209, 1224, 366, 46 8, 1114, 2624, 655, 1569, 900, 2093, 805, 1316, 615, 3088, 1346, 684, 710, 2148, 1556, 429, 12 87, 2688, 794, 252, 1173, 373, 2099, 1126, 605, 848, 2196, 1129, 690, 1328, 2094, 713, 1320, 6 32, 2123, 482, 1187, 806, 2314, 1116, 427, 904, 2321, 1071, 414, 1291, 2565, 223, 663, 1409, 2 152, 692, 1570, 835, 2210, 1348, 619, 472, 2101, 1232, 455, 1410, 2241, 796, 809, 1174, 3104, 714, 1177, 721, 2200, 1189, 837, 716, 2125, 1130, 864, 1079, 2212, 810, 1352, 606, 2816, 912, 1560, 722, 2316, 1601, 696, 1572, 2322, 377, 435, 1137, 2566, 817, 1178, 319, 2102, 1103, 621, 1293, 2131, 812, 484, 1132, 2105, 430, 1602, 838, 2569, 1248, 667, 3075, 488, 1190, 239, 216 0, 1543, 378, 1576, 2183, 459, 1219, 622, 2126, 627, 1294, 437, 2337, 1665, 380, 2242, 1547, 8 18, 1299, 2133, 461, 496, 1604, 2324, 669, 1315, 2570, 679, 1083, 724, 2106, 1193, 841, 629, 2 216, 1584, 351, 1138, 3077, 467, 1301, 2187, 438, 1180, 737, 2147, 1111, 251, 1221, 2134, 462, 442, 2108, 1140, 441, 1194, 2328, 469, 1085, 2137, 247, 1555, 683, 2338, 1549, 842, 1666, 257 7, 738, 899, 2572, 1305, 670, 1302, 2244, 783, 1550, 3136, 849, 1201, 820, 2189, 1317, 728, 21 49, 1412, 928, 1115, 2195, 791, 367, 2224, 1608, 901, 1793, 2190, 630, 1222, 2578, 685, 1196, 844, 2369, 1144, 633, 2079, 1225, 711, 1360, 2248, 253, 1086, 3081, 691, 1306, 824, 2138, 116 7, 902, 2593, 1127, 686, 740, 2340, 1202, 850, 2370, 1318, 375, 2580, 1117, 444, 1668, 2311, 47 0, 1226, 2197, 483, 1616, 415, 2150, 1347, 485, 2153, 1416, 905, 3078, 1321, 795, 1794, 2352, 473, 1131, 2344, 634, 1204, 2211, 744, 1175, 852, 2140, 1233, 960, 2095, 1308, 865, 2315, 167 2, 693, 2433, 1118, 797, 1228, 2594, 906, 1322, 2372, 715, 1424, 3089, 807, 1632, 474, 2256, 1 376, 636, 2434, 1349, 694, 2198, 1557, 254, 2201, 1179, 717, 2213, 1234, 575, 1329, 2154, 913, 1571, 2103, 798, 1324, 3082, 811, 1133, 2376, 379, 1208, 2584, 697, 1558, 431, 2625, 607, 48 9, 2596, 1561, 866, 2161, 1139, 723, 2202, 1191, 486, 2127, 1249, 908, 2317, 1350, 718, 1330, 3090, 813, 1796, 2156, 476, 1181, 2626, 856, 1680, 2272, 839, 1353, 2214, 725, 1134, 2567, 69 8, 1141, 2600, 914, 1236, 2243, 752, 1195, 3200, 868, 1800, 2318, 819, 1354, 2689, 814, 1250, 439, 2571, 1573, 929, 2323, 1562, 490, 2628, 1411, 623, 2339, 1332, 671, 2107, 1240, 739, 308 4, 1440, 916, 2217, 1295, 463, 2608, 1303, 843, 2162, 1182, 381, 2325, 1361, 497, 2204, 1574, 930, 2135, 1696, 821, 2245, 1142, 726, 3105, 1356, 1603, 2164, 961, 2218, 1564, 872, 2109, 14 13, 492, 2579, 1197, 631, 2573, 1145, 729, 2690, 1577, 700, 2329, 1223, 443, 3137, 1808, 741, 2326, 1203, 845, 2574, 1252, 920, 2225, 1362, 382, 2341, 1336, 822, 2436, 1728, 2139, 1414, 8 51, 3092, 1198, 730, 2632, 1578, 498, 2817, 1605, 880, 2246, 1417, 742, 2220, 1307, 445, 2168, 1146, 2249, 471, 1472, 2384, 1377, 635, 3328, 1585, 932, 2110, 1227, 687, 2330, 1087, 903, 2 191, 1364, 2151, 825, 1418, 2226, 500, 1551, 2342, 1606, 846, 3106, 1580, 745, 2141, 1205, 26 92, 826, 1319, 2250, 732, 1309, 2640, 446, 1256, 2371, 1148, 3096, 962, 1229, 2440, 936, 1206, 2345, 475, 1667, 2818, 853, 2155, 1586, 867, 2228, 1310, 1609, 2199, 637, 1323, 3108, 907, 2 257, 1378, 487, 2332, 1235, 695, 2696, 1425, 2142, 1209, 746, 2252, 1420, 828, 2346, 1368, 30 79, 753, 1610, 2448, 854, 1669, 2656, 1617, 2400, 857, 1559, 2373, 504, 1264, 2581, 799, 3201, 1230, 1119, 2203, 255, 1351, 2258, 964, 2353, 1588, 909, 2595, 1824, 719, 2348, 1426, 3138, 1380, 477, 2157, 1331, 915, 2232, 1325, 2582, 638, 1441, 2585, 1237, 2163, 748, 1592, 2215, 9 44, 1856, 3584, 869, 2273, 1612, 1210, 2374, 491, 2354, 1670, 699, 2820, 1428, 1251, 2205, 75 4, 3083, 1920, 858, 2704, 1618, 2377, 478, 1442, 2158, 1326, 968, 2165, 1673, 2260, 383, 1795, 3112, 910, 2219, 1384, 1563, 2824, 815, 2378, 1135, 976, 2274, 1355, 2597, 1238, 870, 3140, 1333, 2586, 917, 1212, 2435, 1473, 2356, 727, 1241, 2264, 493, 3202, 1432, 873, 2464, 1633, 2 319, 1620, 701, 2327, 1575, 2206, 931, 1674, 2385, 1253, 3091, 756, 1183, 2598, 860, 2720, 14 44, 1334, 2166, 499, 2380, 1565, 731, 2627, 1797, 3085, 1634, 823, 2588, 1681, 2437, 922, 135 7, 2221, 1143, 2169, 874, 1624, 3120, 918, 2601, 1363, 2247, 1242, 502, 2832, 1392, 2227, 933, 1676, 3086, 1254, 2276, 743, 1415, 2386, 1337, 2360, 760, 2752, 1474, 881, 2438, 1566, 3144, 1358, 494, 2222, 1257, 2602, 702, 2629, 1579, 1798, 2441, 921, 3329, 1199, 501, 2331, 1147, 2170, 1682, 2496, 876, 1636, 2401, 1365, 3093, 847, 1801, 2609, 992, 2251, 1244, 2111, 1338, 447, 2388, 1448, 3204, 1419, 2442, 733, 1697, 2575, 827, 2630, 1607, 2604, 1379, 934, 2229, 1 311, 3107, 1207, 2343, 882, 1258, 2333, 937, 2280, 1149, 2172, 1581, 963, 3330, 1684, 2253, 1 640, 2230, 747, 1366, 2691, 505, 2610, 1340, 3098, 1265, 855, 2334, 1802, 2633, 1587, 2347, 9 24, 3585, 1369, 734, 2402, 1476, 2259, 1421, 2449, 829, 1427, 2233, 1231, 3152, 965, 2444, 16 98, 2392, 1582, 938, 2634, 1809, 2693, 1456, 3109, 884, 1381, 2641, 506, 2583, 1211, 2288, 12 60, 2254, 749, 1688, 3097, 1648, 2143, 945, 2375, 1611, 2612, 1804, 966, 3094, 1729, 2848, 11 50, 2450, 755, 2404, 1266, 859, 2355, 1589, 3208, 1422, 2349, 940, 2465, 1370, 2261, 1480, 83 0, 2616, 1382, 3332, 1429, 2880, 911, 2636, 1327, 1593, 2234, 871, 3336, 1268, 2694, 1619, 24 52, 639, 2275, 1213, 1590, 2944, 888, 3110, 1700, 2642, 1385, 2466, 479, 2350, 1730, 3586, 16 13, 946, 2697, 1239, 2819, 750, 2408, 1810, 2587, 1671, 3168, 969, 2159, 1372, 1443, 2379, 50 8, 2262, 1430, 3139, 1488, 2357, 861, 2236, 1704, 2497, 1825, 757, 3113, 1386, 2265, 1614, 24 56, 970, 2657, 1433, 2644, 1594, 3216, 919, 2599, 1812, 1621, 2698, 1596, 2277, 875, 3100, 12 43, 2207, 1335, 2468, 862, 2358, 1732, 3141, 1622, 2589, 758, 1625, 2821, 1675, 2658, 948, 31 14, 1445, 2705, 1816, 2381, 977, 2167, 1826, 3588, 1635, 2648, 923, 2387, 1626, 2266, 1434, 9 72, 3121, 1255, 2416, 1712, 2700, 761, 2278, 1677, 3146, 1272, 2439, 877, 2361, 1393, 2498, 1 214, 3344, 1388, 2590, 952, 2382, 1678, 2281, 1683, 495, 3232, 1359, 2603, 1504, 2822, 703, 2 223, 1339, 3592, 1245, 2171, 935, 2706, 1394, 2660, 1637, 3360, 978, 2389, 1446, 2825, 1449, 2268, 1475, 3600, 883, 2362, 1638, 2472, 1567, 2443, 762, 3264, 1259, 2721, 1436, 2631, 503, 2403, 1367, 3616, 1396, 2335, 925, 2231, 1799, 2282, 1341, 3142, 1246, 2173, 878, 2605, 145 0, 2708, 1477, 3116, 735, 2664, 1261, 2390, 1583, 2364, 1857, 3203, 993, 2289, 1828, 2826, 17 36, 3153, 885, 2611, 1858, 2393, 1685, 2500, 939, 3122, 1832, 2445, 1803, 2451, 1641, 2255, 9 94, 3145, 1628, 2722, 1457, 2606, 980, 3087, 1744, 2833, 1840, 2480, 1860, 2405, 926, 3392, 1 371, 2235, 1921, 2284, 764, 2712, 1267, 3205, 1686, 2672, 1478, 2635, 941, 3124, 1342, 2828, 1699, 2753, 967, 2174, 1642, 3095, 1922, 2290, 1805, 2613, 886, 1400, 1452, 3206, 831, 2446, 1689, 2394, 1760, 2504, 1591, 3456, 947, 2406, 1864, 2453, 1649, 3148, 507, 2351, 1262, 261 7, 1383, 2292, 1481, 3209, 889, 2643, 1423, 2237, 1811, 3154, 1615, 2614, 984, 2724, 1702, 24 09, 1458, 3128, 751, 2754, 1701, 2637, 1373, 3099, 1269, 2263, 942, 2834, 1482, 2695, 1690, 3 169, 1644, 2396, 996, 2467, 1387, 3111, 1151, 2454, 1215, 2512, 971, 2728, 1806, 3331, 1431, 2849, 890, 2410, 1460, 3156, 1650, 2638, 1595, 2457, 509, 3210, 1489, 2618, 1705, 2836, 127 0, 2645, 949, 3217, 1731, 2620, 1374, 2267, 1623, 3333, 973, 2359, 1692, 2756, 1814, 3101, 14 84, 2646, 1000, 2649, 1273, 3115, 1706, 2699, 1597, 2469, 892, 2840, 1435, 3170, 1827, 2850, 1813, 2659, 950, 3587, 1733, 2650, 1389, 2458, 1464, 3160, 863, 2279, 2736, 1652, 3212, 171 3, 2701, 1398, 2296, 759, 3102, 1447, 2417, 1490, 2238, 1817, 2412, 1008, 3218, 1274, 2702, 1 395, 2707, 1505, 3143, 510, 2383, 1598, 2528, 3334, 1437, 2363, 1627, 2269, 979, 3337, 1390, 2418, 1492, 2661, 1679, 3233, 953, 2470, 1924, 2473, 1829, 3648, 1639, 2499, 2662, 763, 311 7, 1708, 2591, 1734, 2283, 1453, 3172, 974, 2460, 1818, 2391, 1276, 2420, 1397, 3712, 2823, 1 629, 2365, 954, 3123, 1872, 2270, 1714, 2474, 1737, 3220, 879, 2501, 1656, 2285, 3118, 1506, 2607, 1830, 2881, 981, 3147, 1451, 2852, 1928, 2760, 1438, 3338, 2882, 982, 2709, 1247, 334 5, 1687, 2856, 1716, 2827, 1859, 3589, 927, 2665, 3176, 1643, 2652, 1496, 2481, 1479, 3234, 9 95, 2768, 1820, 2864, 1833, 3125, 2884, 1738, 2395, 1745, 3265, 765, 2945, 1861, 2291, 3224, 1740, 2710, 1888, 2502, 956, 3149, 1834, 2366, 1630, 2723, 3236, 1936, 2666, 1746, 2946, 88 7, 3840, 1720, 2829, 1401, 2424, 3340, 1459, 2476, 1841, 3346, 985, 2713, 1343, 2784, 3590, 1 645, 2615, 1836, 2888, 997, 3126, 1508, 2673, 2286, 1454, 3155, 1862, 2407, 1691, 2505, 986, 3129, 2447, 1512, 2835, 1263, 3593, 1402, 2639, 3184, 1483, 2726, 943, 2482, 1646, 3207, 16 51, 2725, 2397, 1461, 3150, 1404, 2293, 891, 2506, 3361, 1842, 2714, 1485, 3266, 1520, 2668, 1693, 2411, 3157, 998, 2175, 1703, 2239, 1748, 3348, 2830, 1865, 3594, 766, 2455, 1653, 248 4, 3130, 1375, 2674, 1491, 2619, 1462, 3240, 2513, 511, 3211, 1761, 2729, 1275, 2294, 3171, 1 486, 2755, 1466, 2398, 1465, 3158, 2647, 988, 3132, 1493, 2716, 1271, 2838, 3352, 1707, 250 8, 1866, 2297, 3161, 1001, 2730, 1762, 3362, 1923, 2621, 2459, 1694, 3601, 1807, 2851, 951, 2 837, 3596, 1873, 2757, 1844, 3268, 2413, 1752, 2488, 1952, 3213, 1002, 2676, 3173, 1815, 27 37, 1391, 2422, 3219, 1925, 2471, 1654, 2514, 1709, 3248, 2841, 893, 3214, 1868, 2298, 2419, 1657, 3602, 1735, 2529, 3393, 1277, 2622, 975, 2461, 1715, 3103, 2651, 1848, 3272, 1926, 24 14, 2516, 1710, 3162, 894, 2703, 3617, 1764, 2948, 1874, 2853, 3364, 1399, 2663, 1468, 3394, 2732, 1494, 2758, 1009, 3604, 2477, 1507, 3335, 1439, 2842, 2300, 1509, 3221, 1929, 2421, 3 174, 1819, 2653, 955, 2896, 3177, 1497, 2738, 1658, 3376, 2761, 1768, 3368, 1876, 2680, 253 0, 1984, 3235, 1004, 2854, 3164, 1889, 2475, 1717, 2952, 3119, 1821, 2462, 1930, 3339, 2271, 1010, 2711, 1739, 3457, 2740, 1831, 3618, 2883, 1498, 3396, 1660, 2667, 2520, 1718, 3280, 9 57, 2503, 3458, 1278, 2844, 1741, 2857, 3222, 1599, 2762, 3225, 1937, 2769, 1822, 3237, 288 5, 983, 2764, 1835, 3178, 2912, 1403, 3127, 2858, 1721, 3400, 1455, 2654, 2960, 1631, 3608, 1 513, 2770, 3649, 958, 2744, 3620, 1890, 2425, 1747, 2483, 3185, 1510, 2865, 3226, 1932, 236 7, 1742, 3151, 2669, 987, 3341, 2860, 1837, 2532, 1500, 3180, 2478, 1880, 3650, 2886, 1863, 3 296, 1749, 2715, 2536, 1012, 3238, 2287, 1722, 3591, 1938, 2426, 3624, 1776, 2507, 3267, 18 92, 2670, 1843, 2675, 3342, 1838, 2485, 3713, 999, 2428, 1463, 3595, 2866, 1953, 3347, 2509, 1514, 2544, 3652, 1647, 2717, 1695, 3363, 2727, 1763, 3131, 2772, 1016, 3241, 2889, 1940, 2 677, 1487, 3632, 2399, 1867, 3186, 2515, 1405, 3349, 2486, 1521, 3228, 2785, 767, 3159, 195 4, 2299, 3269, 1845, 2510, 2490, 1750, 3188, 2489, 1985, 3242, 1896, 2517, 3133, 1516, 2295, 3603, 1655, 2731, 3597, 989, 2890, 3714, 1753, 2786, 2947, 1724, 3353, 1467, 2718, 3350, 17 65, 2831, 3598, 1869, 2897, 3249, 1944, 2868, 3365, 1003, 2776, 3460, 1406, 2976, 3163, 184 6, 2839, 1875, 2415, 3656, 1754, 2949, 3841, 1522, 2678, 3270, 1904, 2733, 3244, 990, 2892, 3 192, 1766, 2681, 3273, 1469, 2759, 3408, 1495, 2301, 3134, 1659, 2739, 3354, 1956, 2872, 32 15, 1711, 2950, 3175, 1927, 2734, 1005, 2788, 3250, 1849, 2898, 3366, 1524, 2423, 3165, 187 0, 2492, 3716, 1769, 2518, 3274, 1850, 2531, 3664, 1756, 2463, 3395, 1470, 2533, 3464, 959, 2 953, 3369, 1986, 2843, 3842, 1960, 2521, 3179, 1499, 2682, 3252, 1877, 2792, 3223, 1891, 29 00, 3281, 3008, 1661, 3356, 2913, 1931, 3720, 2741, 1011, 3166, 2845, 1511, 3276, 2954, 171 9, 3370, 2763, 1770, 3472, 2855, 1852, 3680, 2522, 1777, 3424, 2684, 1878, 3397, 2742, 1881, 3605, 2302, 1013, 3227, 2765, 1528, 3282, 2623, 3377, 1823, 2961, 3619, 1279, 2846, 3372, 1 988, 2859, 3181, 1933, 2427, 3256, 1743, 2745, 3606, 1501, 2479, 2655, 2537, 1939, 3609, 29 14, 895, 3187, 2771, 1662, 3239, 2534, 1772, 3297, 2956, 1968, 3398, 2766, 3378, 1893, 2861, 3844, 1515, 2524, 3229, 1723, 2904, 3728, 1778, 2887, 3401, 1882, 2773, 3182, 2746, 1006, 3 189, 2962, 1502, 3284, 2800, 1992, 3243, 2916, 3848, 1407, 2867, 3402, 1934, 2862, 3298, 18 39, 2487, 3621, 2000, 2977, 3610, 2538, 1894, 3459, 2671, 1941, 3380, 2719, 1014, 3288, 278 7, 3488, 1751, 2964, 3343, 1517, 2511, 3351, 2891, 1897, 3230, 2429, 1725, 3409, 2545, 1955, 3622, 2978, 3744, 1780, 2869, 3190, 1884, 2774, 3404, 1523, 3651, 3009, 3612, 1755, 2920, 3 461, 1017, 2540, 3245, 2679, 1847, 3193, 2777, 1946, 3625, 2748, 3271, 1898, 2491, 3856, 19 42, 2789, 3251, 2893, 1526, 3300, 2968, 1957, 3410, 2430, 3384, 1767, 2870, 3776, 1784, 346 2, 2899, 3246, 1905, 2778, 3626, 1018, 2546, 3653, 2928, 1518, 3465, 2790, 1726, 3355, 2493, 3194, 1945, 2519, 3520, 1525, 3425, 2683, 3633, 1900, 2980, 3275, 2735, 1871, 3135, 2951, 2 016, 3412, 2873, 3466, 1471, 2548, 3599, 1757, 3654, 2894, 3628, 1851, 2793, 3253, 2874, 99 1, 3367, 2780, 1958, 3357, 2494, 3304, 1906, 3196, 3010, 3277, 1961, 2984, 3254, 2523, 1987, 3715, 2901, 1771, 3634, 2915, 3358, 1529, 3657, 2685, 3371, 1879, 2955, 3426, 2535, 1948, 3 283, 2743, 1758, 3473, 3257, 2794, 1853, 3468, 2876, 3416, 1020, 2801, 3658, 2902, 1989, 37 17, 3665, 1962, 2905, 3607, 2552, 1908, 3312, 2847, 3278, 1530, 3167, 2303, 3399, 1773, 301 2, 3636, 2957, 1969, 3872, 2767, 3474, 1990, 3428, 2525, 3379, 1779, 2963, 3373, 2686, 1883, 3489, 3285, 2796, 1964, 3640, 2992, 3904, 1854, 2917, 3660, 3258, 1935, 2539, 3718, 2747, 1 007, 3476, 3299, 2802, 1895, 3968, 2906, 3666, 1663, 2526, 3490, 3374, 1912, 3016, 3721, 24 31, 1503, 3843, 2958, 3432, 1970, 3611, 2863, 3183, 1774, 3024, 3403, 3286, 1993, 2918, 338 1, 2965, 1532, 3260, 3521, 2775, 1885, 3289, 2541, 3480, 1781, 2921, 3681, 3668, 1994, 2749, 3623, 2979, 3722, 1943, 3301, 2804, 3231, 1015, 2908, 3492, 3382, 1899, 2547, 3613, 2779, 1 886, 3845, 3682, 2871, 3729, 1782, 2970, 3405, 3191, 1972, 2922, 3672, 2966, 2001, 3411, 32 90, 2550, 1947, 3440, 2981, 3724, 3302, 1996, 2791, 3463, 3385, 1785, 2808, 3522, 2929, 190 1, 3614, 3406, 2542, 3305, 1976, 2750, 3627, 3846, 1519, 2969, 3247, 2549, 3195, 1727, 3730, 2924, 3684, 1959, 3413, 2895, 3849, 3040, 2002, 3292, 3386, 2495, 1019, 3496, 3467, 2781, 3 745, 1907, 2875, 3655, 3427, 1786, 2982, 3359, 3255, 2930, 1527, 3306, 2985, 3197, 1949, 36 29, 3011, 3732, 3688, 1902, 2795, 3414, 2553, 3388, 1759, 3313, 2903, 3850, 2017, 3635, 297 2, 3417, 2782, 1909, 3524, 3469, 2877, 3475, 1963, 3279, 3013, 3746, 2018, 3630, 2986, 3857, 3504, 2004, 2932, 3429, 2554, 3259, 1950, 3308, 2797, 3736, 3696, 1788, 2993, 3659, 3852, 3 014, 1965, 3777, 3198, 2803, 3314, 1991, 2907, 3637, 3470, 2988, 1021, 3418, 3528, 2878, 19 10, 3430, 3477, 2959, 3375, 1855, 3641, 2919, 3316, 3667, 1971, 2687, 3261, 3638, 2936, 153 1, 3748, 3433, 2527, 3778, 1913, 3661, 2994, 3287, 2798, 3858, 2008, 3719, 3017, 3420, 3491, 1775, 2556, 3478, 3536, 2909, 1966, 3752, 3873, 2805, 3434, 2020, 3662, 3018, 3481, 3642, 1 995, 2967, 3860, 3669, 3644, 2923, 1914, 3291, 3383, 2910, 3780, 1533, 3670, 2806, 3673, 37 23, 1973, 2996, 3493, 3864, 3025, 3874, 1997, 3683, 2971, 3674, 3482, 2024, 3020, 3303, 376 0, 2809, 1916, 3725, 3320, 2925, 3441, 3262, 1974, 3436, 3000, 3726, 3731, 1887, 2543, 3407, 3552, 2751, 3387, 1783, 3293, 2983, 3442, 3685, 3026, 1022, 3494, 3497, 3523, 2931, 2032, 3 686, 3615, 2810, 3307, 3484, 1534, 2551, 3415, 3444, 2973, 3847, 2003, 3389, 3294, 2926, 34 98, 3525, 1977, 2783, 3309, 3631, 3905, 1787, 3041, 3876, 3784, 2933, 3906, 1998, 3733, 298 7, 3880, 3851, 3689, 1978, 3042, 3676, 3505, 3028, 3792, 1903, 3888, 3908, 2974, 3419, 3969, 2005, 2812, 3315, 3734, 3526, 2989, 2006, 3390, 3747, 3015, 3690, 3970, 1951, 3853, 2934, 3 448, 3500, 2879, 3737, 2019, 3808, 3639, 2995, 3912, 3697, 1789, 2555, 3310, 3431, 3529, 29 37, 1980, 3471, 3859, 3663, 3032, 3750, 3506, 1911, 2799, 3749, 3421, 3317, 2990, 2009, 353 0, 3738, 3692, 3044, 3435, 3199, 2021, 3263, 3019, 3854, 3479, 2938, 2010, 3508, 3698, 3643, 2557, 3537, 3753, 1967, 3318, 2997, 3779, 3422, 3671, 3021, 1915, 3740, 3862, 3532, 3048, 3 321, 3754, 2022, 3645, 2940, 3483, 3875, 3861, 1790, 2998, 3781, 3437, 3512, 2911, 3700, 15 35, 3761, 3446, 2807, 3495, 3538, 3865, 3056, 1023, 3322, 3443, 3553, 2558, 3646, 3485, 201 2, 3675, 3027, 3438, 3540, 3727, 3001, 2025, 3972, 3877, 3687, 2811, 3756, 3782, 1975, 3501, 3022, 3866, 3324, 3445, 3677, 3002, 2026, 3920, 3762, 3785, 2927, 3704, 3554, 1917, 3878, 3 029, 3499, 3976, 3486, 3030, 3295, 1999, 3735, 3764, 3907, 2975, 3691, 3544, 3527, 1918, 30 43, 3868, 3881, 3786, 3793, 2813, 3909, 2033, 3788, 3936, 3004, 3882, 3678, 3984, 3794, 197 9, 2935, 3768, 3449, 3507, 3889, 3033, 3391, 2028, 3693, 3884, 3045, 3556, 3502, 3910, 3739, 2034, 3034, 3560, 3311, 3450, 3531, 2991, 3694, 1981, 3699, 3509, 3452, 2939, 3890, 3533, 3 568, 3741, 2007, 3046, 3751, 3796, 3913, 2814, 3701, 3423, 3539, 1982, 3510, 2559, 3809, 33 23, 3534, 3514, 3513, 2011, 3036, 3541, 3319, 3755, 3914, 3049, 3810, 3971, 3742, 2036, 385 5, 2999, 3921, 3892, 3800, 4000, 3050, 3863, 2023, 3439, 3973, 3702, 3757, 2941, 3916, 3705, 3783, 2040, 3325, 3023, 3763, 3896, 3974, 3758, 2942, 3812, 3922, 1791, 3447, 3516, 3542, 3 057, 3555, 3487, 3557, 3977, 3867, 2013, 3003, 3545, 3706, 3816, 3924, 4032, 3052, 3937, 37 65, 2027, 3869, 3978, 3058, 3787, 3879, 3546, 3708, 3766, 3005, 2014, 3326, 3789, 3647, 398 5, 3870, 3031, 3883, 3451, 3769, 3503, 2029, 3679, 3561, 3006, 3938, 3795, 3558, 3980, 3790, 3035, 3885, 1983, 3548, 3928, 3911, 3797, 3060, 3770, 3986, 3824, 3940, 3891, 2035, 3886, 3 047, 3511, 4001, 3562, 3695, 3743, 3811, 3064, 3988, 3535, 2037, 3915, 3453, 3569, 2815, 40 02, 3893, 3798, 4033, 3944, 3564, 3703, 1919, 3037, 3801, 3772, 3515, 3813, 3917, 3992, 305 1, 3454, 3894, 3923, 3802, 2030, 3570, 3952, 3038, 3814, 3517, 3543, 3707, 4004, 3759, 3975, 3053, 3897, 2038, 3572, 3918, 3817, 3898, 3804, 3518, 3007, 4034, 4008, 3547, 3925, 3939, 2 041, 3709, 3979, 3059, 3559, 3767, 3818, 3900, 3825, 3926, 3929, 3061, 3576, 3871, 3327, 20 42, 4036, 3981, 3791, 3549, 3987, 2943, 3710, 3820, 4016, 3941, 3563, 3771, 3826, 3930, 201 5, 3054, 3550, 4040, 3455, 3982, 3887, 4048, 3942, 3989, 3062, 3799, 3565, 3945, 3773, 4003, 2044, 3828, 3932, 3571, 3803, 3065, 3895, 3994, 3946, 3990, 3574, 4005, 3815, 3832, 3953, 3 066, 3566, 2031, 3774, 3993, 3573, 3948, 3919, 4064, 3519, 3805, 3899, 3039, 4006, 3954, 40 09, 4035, 3819, 3577, 3927, 2039, 3996, 3806, 3901, 3068, 4037, 4010, 3956, 3578, 3821, 401 7, 4038, 3827, 3931, 4012, 3902, 3983, 3055, 3943, 3711, 3960, 2043, 3551, 4018, 3822, 4041, 3580, 3933, 3829, 4042, 3991, 3063, 3947, 3934, 3830, 4020, 4049, 3995, 4044, 3833, 3949, 4 024, 3567, 2045, 3775, 4007, 4050, 3067, 3955, 3834, 3575, 3997, 3950, 3807, 4065, 3957, 40 11, 4066, 4052, 3998, 3836, 4013, 4039, 3069, 3958, 3903, 4019, 3579, 3961, 2046, 4056, 382 3, 4014, 4068, 4043, 3962, 3581, 4021, 4045, 4072, 3964, 4022, 3935, 3831, 3070, 4080, 3582, 4051, 4025, 3835, 4046, 4026, 3951, 4053, 4054, 3999, 4067, 3837, 4028, 3959, 4057, 4069, 2 047, 4058, 4015, 3963, 4070, 3838, 3583, 3071, 4060, 4073, 4023, 4074, 3965, 4047, 3966, 40 81, 4027, 4076, 4082, 4029, 4055, 4030, 4059, 4084, 4071, 4088, 3839, 4061, 4075, 4062, 407 7, 4031, 4083, 4085, 3967, 4078, 4086, 4089, 4090, 4063, 4092, 4079, 4087, 4091, 4093, 4094, 4095];

TABLE Q2 with a sequence length of 4096:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 1024 |
| 11 | 2048 |
| 12 | 9 |
| 13 | 6 |
| 14 | 17 |
| 15 | 10 |
| 16 | 18 |
| 17 | 128 |
| 18 | 12 |
| 19 | 33 |
| 20 | 65 |
| 21 | 20 |
| 22 | 256 |
| 23 | 34 |

TABLE Q2-continued

| with a sequence length of 4096: | |
|---|---|
| Reliability or reliability sequence number | Polarized channel sequence number |
| 24 | 24 |
| 25 | 36 |
| 26 | 7 |
| 27 | 129 |
| 28 | 66 |
| 29 | 512 |
| 30 | 11 |
| 31 | 40 |
| 32 | 68 |
| 33 | 130 |
| 34 | 19 |
| 35 | 13 |
| 36 | 48 |
| 37 | 14 |
| 38 | 72 |
| 39 | 257 |
| 40 | 1025 |
| 41 | 21 |
| 42 | 132 |
| 43 | 35 |
| 44 | 258 |
| 45 | 26 |
| 46 | 2049 |
| 47 | 513 |
| 48 | 80 |
| 49 | 37 |
| 50 | 25 |
| 51 | 22 |
| 52 | 136 |
| 53 | 260 |
| 54 | 264 |
| 55 | 38 |
| 56 | 514 |
| 57 | 96 |
| 58 | 67 |
| 59 | 41 |
| 60 | 144 |
| 61 | 28 |
| 62 | 69 |
| 63 | 42 |
| 64 | 516 |
| 65 | 49 |
| 66 | 1026 |
| 67 | 74 |
| 68 | 272 |
| 69 | 160 |
| 70 | 520 |
| 71 | 288 |
| 72 | 528 |
| 73 | 192 |
| 74 | 544 |
| 75 | 70 |
| 76 | 44 |
| 77 | 131 |
| 78 | 81 |
| 79 | 2050 |
| 80 | 50 |
| 81 | 73 |
| 82 | 15 |
| 83 | 320 |
| 84 | 133 |
| 85 | 52 |
| 86 | 1028 |
| 87 | 23 |
| 88 | 134 |
| 89 | 384 |
| 90 | 76 |
| 91 | 137 |
| 92 | 82 |
| 93 | 56 |
| 94 | 27 |
| 95 | 97 |
| 96 | 39 |
| 97 | 259 |
| 98 | 84 |

TABLE Q2-continued

| with a sequence length of 4096: | |
|---|---|
| Reliability or reliability sequence number | Polarized channel sequence number |
| 99 | 138 |
| 100 | 145 |
| 101 | 261 |
| 102 | 1032 |
| 103 | 29 |
| 104 | 43 |
| 105 | 2052 |
| 106 | 98 |
| 107 | 515 |
| 108 | 88 |
| 109 | 140 |
| 110 | 30 |
| 111 | 146 |
| 112 | 71 |
| 113 | 262 |
| 114 | 265 |
| 115 | 161 |
| 116 | 576 |
| 117 | 45 |
| 118 | 1040 |
| 119 | 100 |
| 120 | 640 |
| 121 | 51 |
| 122 | 148 |
| 123 | 46 |
| 124 | 75 |
| 125 | 266 |
| 126 | 273 |
| 127 | 517 |
| 128 | 2056 |
| 129 | 104 |
| 130 | 162 |
| 131 | 53 |
| 132 | 193 |
| 133 | 1056 |
| 134 | 152 |
| 135 | 77 |
| 136 | 164 |
| 137 | 768 |
| 138 | 268 |
| 139 | 274 |
| 140 | 518 |
| 141 | 54 |
| 142 | 83 |
| 143 | 57 |
| 144 | 521 |
| 145 | 1027 |
| 146 | 112 |
| 147 | 135 |
| 148 | 2064 |
| 149 | 78 |
| 150 | 289 |
| 151 | 194 |
| 152 | 85 |
| 153 | 276 |
| 154 | 522 |
| 155 | 58 |
| 156 | 168 |
| 157 | 1029 |
| 158 | 139 |
| 159 | 99 |
| 160 | 86 |
| 161 | 60 |
| 162 | 280 |
| 163 | 89 |
| 164 | 290 |
| 165 | 529 |
| 166 | 2080 |
| 167 | 524 |
| 168 | 196 |
| 169 | 1088 |
| 170 | 141 |
| 171 | 101 |
| 172 | 147 |
| 173 | 176 |

TABLE Q2-continued

| with a sequence length of 4096: | |
|---|---|
| Reliability or reliability sequence number | Polarized channel sequence number |
| 174 | 142 |
| 175 | 530 |
| 176 | 321 |
| 177 | 31 |
| 178 | 200 |
| 179 | 1033 |
| 180 | 90 |
| 181 | 545 |
| 182 | 292 |
| 183 | 2051 |
| 184 | 322 |
| 185 | 532 |
| 186 | 263 |
| 187 | 149 |
| 188 | 102 |
| 189 | 105 |
| 190 | 1030 |
| 191 | 304 |
| 192 | 296 |
| 193 | 163 |
| 194 | 92 |
| 195 | 47 |
| 196 | 267 |
| 197 | 385 |
| 198 | 546 |
| 199 | 2053 |
| 200 | 324 |
| 201 | 1041 |
| 202 | 208 |
| 203 | 386 |
| 204 | 150 |
| 205 | 153 |
| 206 | 165 |
| 207 | 106 |
| 208 | 55 |
| 209 | 1034 |
| 210 | 328 |
| 211 | 536 |
| 212 | 577 |
| 213 | 548 |
| 214 | 2112 |
| 215 | 113 |
| 216 | 154 |
| 217 | 79 |
| 218 | 269 |
| 219 | 1042 |
| 220 | 108 |
| 221 | 578 |
| 222 | 224 |
| 223 | 166 |
| 224 | 519 |
| 225 | 552 |
| 226 | 195 |
| 227 | 1152 |
| 228 | 270 |
| 229 | 3072 |
| 230 | 641 |
| 231 | 523 |
| 232 | 275 |
| 233 | 580 |
| 234 | 291 |
| 235 | 59 |
| 236 | 1036 |
| 237 | 169 |
| 238 | 560 |
| 239 | 114 |
| 240 | 277 |
| 241 | 156 |
| 242 | 2057 |
| 243 | 87 |
| 244 | 197 |
| 245 | 1057 |
| 246 | 116 |
| 247 | 170 |
| 248 | 61 |

TABLE Q2-continued

| with a sequence length of 4096: | |
|---|---|
| Reliability or reliability sequence number | Polarized channel sequence number |
| 249 | 531 |
| 250 | 525 |
| 251 | 642 |
| 252 | 281 |
| 253 | 1089 |
| 254 | 278 |
| 255 | 526 |
| 256 | 2054 |
| 257 | 177 |
| 258 | 293 |
| 259 | 388 |
| 260 | 91 |
| 261 | 1044 |
| 262 | 584 |
| 263 | 769 |
| 264 | 198 |
| 265 | 172 |
| 266 | 120 |
| 267 | 201 |
| 268 | 2065 |
| 269 | 336 |
| 270 | 1280 |
| 271 | 62 |
| 272 | 282 |
| 273 | 143 |
| 274 | 103 |
| 275 | 178 |
| 276 | 294 |
| 277 | 1058 |
| 278 | 93 |
| 279 | 644 |
| 280 | 2058 |
| 281 | 202 |
| 282 | 592 |
| 283 | 323 |
| 284 | 1048 |
| 285 | 392 |
| 286 | 297 |
| 287 | 770 |
| 288 | 107 |
| 289 | 180 |
| 290 | 151 |
| 291 | 1060 |
| 292 | 2066 |
| 293 | 209 |
| 294 | 284 |
| 295 | 648 |
| 296 | 94 |
| 297 | 204 |
| 298 | 298 |
| 299 | 1031 |
| 300 | 400 |
| 301 | 608 |
| 302 | 352 |
| 303 | 2176 |
| 304 | 325 |
| 305 | 533 |
| 306 | 1153 |
| 307 | 155 |
| 308 | 210 |
| 309 | 305 |
| 310 | 547 |
| 311 | 300 |
| 312 | 1090 |
| 313 | 109 |
| 314 | 2060 |
| 315 | 184 |
| 316 | 534 |
| 317 | 537 |
| 318 | 115 |
| 319 | 167 |
| 320 | 1536 |
| 321 | 225 |
| 322 | 326 |
| 323 | 306 |

TABLE Q2-continued

| with a sequence length of 4096: | |
|---|---|
| Reliability or reliability sequence number | Polarized channel sequence number |
| 324 | 772 |
| 325 | 2081 |
| 326 | 157 |
| 327 | 1035 |
| 328 | 656 |
| 329 | 329 |
| 330 | 110 |
| 331 | 117 |
| 332 | 212 |
| 333 | 1064 |
| 334 | 171 |
| 335 | 2113 |
| 336 | 776 |
| 337 | 330 |
| 338 | 226 |
| 339 | 549 |
| 340 | 1092 |
| 341 | 538 |
| 342 | 387 |
| 343 | 308 |
| 344 | 216 |
| 345 | 2068 |
| 346 | 1154 |
| 347 | 416 |
| 348 | 271 |
| 349 | 279 |
| 350 | 158 |
| 351 | 337 |
| 352 | 1043 |
| 353 | 550 |
| 354 | 672 |
| 355 | 2304 |
| 356 | 118 |
| 357 | 332 |
| 358 | 579 |
| 359 | 1037 |
| 360 | 540 |
| 361 | 389 |
| 362 | 173 |
| 363 | 121 |
| 364 | 1072 |
| 365 | 2082 |
| 366 | 553 |
| 367 | 199 |
| 368 | 784 |
| 369 | 179 |
| 370 | 1038 |
| 371 | 228 |
| 372 | 338 |
| 373 | 312 |
| 374 | 2072 |
| 375 | 704 |
| 376 | 390 |
| 377 | 1096 |
| 378 | 174 |
| 379 | 554 |
| 380 | 581 |
| 381 | 393 |
| 382 | 1281 |
| 383 | 283 |
| 384 | 2084 |
| 385 | 122 |
| 386 | 448 |
| 387 | 353 |
| 388 | 1045 |
| 389 | 561 |
| 390 | 203 |
| 391 | 63 |
| 392 | 340 |
| 393 | 2055 |
| 394 | 1156 |
| 395 | 394 |
| 396 | 527 |
| 397 | 582 |
| 398 | 556 |

TABLE Q2-continued

| with a sequence length of 4096: | |
|---|---|
| Reliability or reliability sequence number | Polarized channel sequence number |
| 399 | 181 |
| 400 | 1059 |
| 401 | 2177 |
| 402 | 295 |
| 403 | 285 |
| 404 | 232 |
| 405 | 124 |
| 406 | 1282 |
| 407 | 205 |
| 408 | 182 |
| 409 | 643 |
| 410 | 2114 |
| 411 | 562 |
| 412 | 1050 |
| 413 | 286 |
| 414 | 585 |
| 415 | 299 |
| 416 | 1537 |
| 417 | 354 |
| 418 | 211 |
| 419 | 2560 |
| 420 | 401 |
| 421 | 185 |
| 422 | 1104 |
| 423 | 396 |
| 424 | 344 |
| 425 | 586 |
| 426 | 645 |
| 427 | 2059 |
| 428 | 1061 |
| 429 | 593 |
| 430 | 535 |
| 431 | 240 |
| 432 | 206 |
| 433 | 1049 |
| 434 | 95 |
| 435 | 2088 |
| 436 | 327 |
| 437 | 564 |
| 438 | 1046 |
| 439 | 800 |
| 440 | 402 |
| 441 | 356 |
| 442 | 307 |
| 443 | 2116 |
| 444 | 1160 |
| 445 | 301 |
| 446 | 417 |
| 447 | 213 |
| 448 | 568 |
| 449 | 1284 |
| 450 | 832 |
| 451 | 2178 |
| 452 | 588 |
| 453 | 186 |
| 454 | 1288 |
| 455 | 646 |
| 456 | 404 |
| 457 | 227 |
| 458 | 896 |
| 459 | 2067 |
| 460 | 1062 |
| 461 | 594 |
| 462 | 418 |
| 463 | 302 |
| 464 | 1538 |
| 465 | 649 |
| 466 | 771 |
| 467 | 2061 |
| 468 | 360 |
| 469 | 539 |
| 470 | 1120 |
| 471 | 111 |
| 472 | 331 |
| 473 | 214 |

TABLE Q2-continued with a sequence length of 4096:

| Reliability or reliability sequence number | Polarized channel sequence number |
|---|---|
| 474 | 1091 |
| 475 | 2096 |
| 476 | 309 |
| 477 | 188 |
| 478 | 449 |
| 479 | 1065 |
| 480 | 217 |
| 481 | 408 |
| 482 | 2062 |
| 483 | 609 |
| 484 | 596 |
| 485 | 1168 |
| 486 | 551 |
| 487 | 650 |
| 488 | 229 |
| 489 | 1052 |
| 490 | 2120 |
| 491 | 159 |
| 492 | 420 |
| 493 | 310 |
| 494 | 1093 |
| 495 | 541 |
| 496 | 773 |
| 497 | 2305 |
| 498 | 610 |
| 499 | 1066 |
| 500 | 657 |
| 501 | 333 |
| 502 | 119 |
| 503 | 1540 |
| 504 | 3073 |
| 505 | 600 |
| 506 | 339 |
| 507 | 218 |
| 508 | 1073 |
| 509 | 368 |
| 510 | 652 |
| 511 | 230 |
| 512 | 2069 |
| 513 | 1098 |
| 514 | 391 |
| 515 | 313 |
| 516 | 450 |
| 517 | 1296 |
| 518 | 542 |
| 519 | 2180 |
| 520 | 334 |
| 521 | 233 |
| 522 | 1184 |
| 523 | 555 |
| 524 | 774 |
| 525 | 175 |
| 526 | 2083 |
| 527 | 1544 |
| 528 | 123 |
| 529 | 658 |
| 530 | 612 |
| 531 | 1312 |
| 532 | 2306 |
| 533 | 341 |
| 534 | 777 |
| 535 | 220 |
| 536 | 1552 |
| 537 | 314 |
| 538 | 424 |
| 539 | 2074 |
| 540 | 395 |
| 541 | 1216 |
| 542 | 673 |
| 543 | 583 |
| 544 | 355 |
| 545 | 1568 |
| 546 | 2561 |
| 547 | 287 |
| 548 | 183 |

TABLE Q2-continued with a sequence length of 4096:

| Reliability or reliability sequence number | Polarized channel sequence number |
|---|---|
| 549 | 234 |
| 550 | 1094 |
| 551 | 125 |
| 552 | 557 |
| 553 | 2128 |
| 554 | 660 |
| 555 | 1068 |
| 556 | 616 |
| 557 | 342 |
| 558 | 316 |
| 559 | 2085 |
| 560 | 1155 |
| 561 | 241 |
| 562 | 778 |
| 563 | 1105 |
| 564 | 563 |
| 565 | 345 |
| 566 | 2073 |
| 567 | 452 |
| 568 | 1074 |
| 569 | 397 |
| 570 | 403 |
| 571 | 207 |
| 572 | 2070 |
| 573 | 1097 |
| 574 | 674 |
| 575 | 558 |
| 576 | 1039 |
| 577 | 785 |
| 578 | 432 |
| 579 | 2184 |
| 580 | 357 |
| 581 | 1344 |
| 582 | 187 |
| 583 | 236 |
| 584 | 664 |
| 585 | 2308 |
| 586 | 1157 |
| 587 | 624 |
| 588 | 587 |
| 589 | 1076 |
| 590 | 780 |
| 591 | 2312 |
| 592 | 705 |
| 593 | 126 |
| 594 | 1047 |
| 595 | 242 |
| 596 | 565 |
| 597 | 1158 |
| 598 | 2086 |
| 599 | 398 |
| 600 | 346 |
| 601 | 456 |
| 602 | 1408 |
| 603 | 358 |
| 604 | 2562 |
| 605 | 405 |
| 606 | 1100 |
| 607 | 303 |
| 608 | 569 |
| 609 | 244 |
| 610 | 2144 |
| 611 | 1161 |
| 612 | 595 |
| 613 | 189 |
| 614 | 1106 |
| 615 | 566 |
| 616 | 2115 |
| 617 | 676 |
| 618 | 361 |
| 619 | 1080 |
| 620 | 706 |
| 621 | 589 |
| 622 | 2089 |
| 623 | 1051 |

TABLE Q2-continued

| with a sequence length of 4096: | |
|---|---|
| Reliability or reliability sequence number | Polarized channel sequence number |
| 624 | 215 |
| 625 | 786 |
| 626 | 647 |
| 627 | 1121 |
| 628 | 2192 |
| 629 | 348 |
| 630 | 419 |
| 631 | 1063 |
| 632 | 406 |
| 633 | 464 |
| 634 | 2076 |
| 635 | 680 |
| 636 | 1283 |
| 637 | 801 |
| 638 | 362 |
| 639 | 1108 |
| 640 | 2117 |
| 641 | 590 |
| 642 | 409 |
| 643 | 1162 |
| 644 | 570 |
| 645 | 2090 |
| 646 | 788 |
| 647 | 597 |
| 648 | 1169 |
| 649 | 572 |
| 650 | 219 |
| 651 | 2564 |
| 652 | 1285 |
| 653 | 311 |
| 654 | 708 |
| 655 | 1053 |
| 656 | 598 |
| 657 | 2097 |
| 658 | 601 |
| 659 | 1067 |
| 660 | 651 |
| 661 | 421 |
| 662 | 3074 |
| 663 | 792 |
| 664 | 1122 |
| 665 | 802 |
| 666 | 611 |
| 667 | 1539 |
| 668 | 2122 |
| 669 | 602 |
| 670 | 410 |
| 671 | 1112 |
| 672 | 231 |
| 673 | 688 |
| 674 | 2320 |
| 675 | 1164 |
| 676 | 653 |
| 677 | 248 |
| 678 | 1054 |
| 679 | 2208 |
| 680 | 369 |
| 681 | 190 |
| 682 | 364 |
| 683 | 1170 |
| 684 | 654 |
| 685 | 2568 |
| 686 | 659 |
| 687 | 1095 |
| 688 | 335 |
| 689 | 480 |
| 690 | 2336 |
| 691 | 1286 |
| 692 | 315 |
| 693 | 221 |
| 694 | 1289 |
| 695 | 2576 |
| 696 | 370 |
| 697 | 613 |
| 698 | 1185 |

TABLE Q2-continued

| with a sequence length of 4096: | |
|---|---|
| Reliability or reliability sequence number | Polarized channel sequence number |
| 699 | 422 |
| 700 | 425 |
| 701 | 2240 |
| 702 | 1600 |
| 703 | 451 |
| 704 | 614 |
| 705 | 1069 |
| 706 | 2592 |
| 707 | 543 |
| 708 | 235 |
| 709 | 1124 |
| 710 | 412 |
| 711 | 2118 |
| 712 | 343 |
| 713 | 372 |
| 714 | 1664 |
| 715 | 775 |
| 716 | 317 |
| 717 | 2092 |
| 718 | 1075 |
| 719 | 222 |
| 720 | 426 |
| 721 | 1172 |
| 722 | 2179 |
| 723 | 453 |
| 724 | 237 |
| 725 | 1070 |
| 726 | 559 |
| 727 | 2129 |
| 728 | 833 |
| 729 | 1099 |
| 730 | 804 |
| 731 | 712 |
| 732 | 2098 |
| 733 | 1290 |
| 734 | 834 |
| 735 | 661 |
| 736 | 1297 |
| 737 | 2121 |
| 738 | 808 |
| 739 | 779 |
| 740 | 1541 |
| 741 | 617 |
| 742 | 1128 |
| 743 | 2063 |
| 744 | 604 |
| 745 | 433 |
| 746 | 1186 |
| 747 | 720 |
| 748 | 2368 |
| 749 | 816 |
| 750 | 1077 |
| 751 | 836 |
| 752 | 347 |
| 753 | 2181 |
| 754 | 1217 |
| 755 | 897 |
| 756 | 243 |
| 757 | 1176 |
| 758 | 2100 |
| 759 | 662 |
| 760 | 454 |
| 761 | 1101 |
| 762 | 318 |
| 763 | 3076 |
| 764 | 675 |
| 765 | 1188 |
| 766 | 618 |
| 767 | 898 |
| 768 | 2071 |
| 769 | 1792 |
| 770 | 781 |
| 771 | 376 |
| 772 | 2182 |
| 773 | 1292 |

TABLE Q2-continued

| with a sequence length of 4096: | |
|---|---|
| Reliability or reliability sequence number | Polarized channel sequence number |
| 774 | 428 |
| 775 | 1298 |
| 776 | 665 |
| 777 | 2432 |
| 778 | 736 |
| 779 | 1542 |
| 780 | 567 |
| 781 | 840 |
| 782 | 2124 |
| 783 | 1078 |
| 784 | 625 |
| 785 | 238 |
| 786 | 1107 |
| 787 | 2185 |
| 788 | 359 |
| 789 | 457 |
| 790 | 1081 |
| 791 | 399 |
| 792 | 2130 |
| 793 | 787 |
| 794 | 1545 |
| 795 | 591 |
| 796 | 1136 |
| 797 | 2104 |
| 798 | 678 |
| 799 | 434 |
| 800 | 1159 |
| 801 | 2075 |
| 802 | 677 |
| 803 | 349 |
| 804 | 1102 |
| 805 | 245 |
| 806 | 2145 |
| 807 | 458 |
| 808 | 1313 |
| 809 | 666 |
| 810 | 1218 |
| 811 | 2087 |
| 812 | 620 |
| 813 | 363 |
| 814 | 1109 |
| 815 | 2307 |
| 816 | 127 |
| 817 | 191 |
| 818 | 1300 |
| 819 | 782 |
| 820 | 2132 |
| 821 | 1546 |
| 822 | 407 |
| 823 | 436 |
| 824 | 1082 |
| 825 | 2186 |
| 826 | 626 |
| 827 | 571 |
| 828 | 1192 |
| 829 | 2193 |
| 830 | 465 |
| 831 | 1163 |
| 832 | 681 |
| 833 | 246 |
| 834 | 2309 |
| 835 | 1123 |
| 836 | 707 |
| 837 | 350 |
| 838 | 3080 |
| 839 | 1110 |
| 840 | 599 |
| 841 | 1084 |
| 842 | 668 |
| 843 | 2077 |
| 844 | 790 |
| 845 | 1304 |
| 846 | 460 |
| 847 | 2091 |
| 848 | 249 |

TABLE Q2-continued

| with a sequence length of 4096: | |
|---|---|
| Reliability or reliability sequence number | Polarized channel sequence number |
| 849 | 1113 |
| 850 | 682 |
| 851 | 1314 |
| 852 | 2146 |
| 853 | 573 |
| 854 | 411 |
| 855 | 1553 |
| 856 | 2563 |
| 857 | 803 |
| 858 | 789 |
| 859 | 1548 |
| 860 | 709 |
| 861 | 2136 |
| 862 | 1220 |
| 863 | 365 |
| 864 | 440 |
| 865 | 2188 |
| 866 | 1165 |
| 867 | 628 |
| 868 | 1125 |
| 869 | 689 |
| 870 | 2078 |
| 871 | 374 |
| 872 | 1171 |
| 873 | 423 |
| 874 | 2194 |
| 875 | 466 |
| 876 | 1200 |
| 877 | 793 |
| 878 | 2119 |
| 879 | 1166 |
| 880 | 250 |
| 881 | 371 |
| 882 | 1554 |
| 883 | 2310 |
| 884 | 481 |
| 885 | 1345 |
| 886 | 574 |
| 887 | 2313 |
| 888 | 413 |
| 889 | 1055 |
| 890 | 603 |
| 891 | 2209 |
| 892 | 1224 |
| 893 | 366 |
| 894 | 468 |
| 895 | 1114 |
| 896 | 2624 |
| 897 | 655 |
| 898 | 1569 |
| 899 | 900 |
| 900 | 2093 |
| 901 | 805 |
| 902 | 1316 |
| 903 | 615 |
| 904 | 3088 |
| 905 | 1346 |
| 906 | 684 |
| 907 | 710 |
| 908 | 2148 |
| 909 | 1556 |
| 910 | 429 |
| 911 | 1287 |
| 912 | 2688 |
| 913 | 794 |
| 914 | 252 |
| 915 | 1173 |
| 916 | 373 |
| 917 | 2099 |
| 918 | 1126 |
| 919 | 605 |
| 920 | 848 |
| 921 | 2196 |
| 922 | 1129 |
| 923 | 690 |

TABLE Q2-continued with a sequence length of 4096:

| Reliability or reliability sequence number | Polarized channel sequence number |
|---|---|
| 924 | 1328 |
| 925 | 2094 |
| 926 | 713 |
| 927 | 1320 |
| 928 | 632 |
| 929 | 2123 |
| 930 | 482 |
| 931 | 1187 |
| 932 | 806 |
| 933 | 2314 |
| 934 | 1116 |
| 935 | 427 |
| 936 | 904 |
| 937 | 2321 |
| 938 | 1071 |
| 939 | 414 |
| 940 | 1291 |
| 941 | 2565 |
| 942 | 223 |
| 943 | 663 |
| 944 | 1409 |
| 945 | 2152 |
| 946 | 692 |
| 947 | 1570 |
| 948 | 835 |
| 949 | 2210 |
| 950 | 1348 |
| 951 | 619 |
| 952 | 472 |
| 953 | 2101 |
| 954 | 1232 |
| 955 | 455 |
| 956 | 1410 |
| 957 | 2241 |
| 958 | 796 |
| 959 | 809 |
| 960 | 1174 |
| 961 | 3104 |
| 962 | 714 |
| 963 | 1177 |
| 964 | 721 |
| 965 | 2200 |
| 966 | 1189 |
| 967 | 837 |
| 968 | 716 |
| 969 | 2125 |
| 970 | 1130 |
| 971 | 864 |
| 972 | 1079 |
| 973 | 2212 |
| 974 | 810 |
| 975 | 1352 |
| 976 | 606 |
| 977 | 2816 |
| 978 | 912 |
| 979 | 1560 |
| 980 | 722 |
| 981 | 2316 |
| 982 | 1601 |
| 983 | 696 |
| 984 | 1572 |
| 985 | 2322 |
| 986 | 377 |
| 987 | 435 |
| 988 | 1137 |
| 989 | 2566 |
| 990 | 817 |
| 991 | 1178 |
| 992 | 319 |
| 993 | 2102 |
| 994 | 1103 |
| 995 | 621 |
| 996 | 1293 |
| 997 | 2131 |
| 998 | 812 |
| 999 | 484 |
| 1000 | 1132 |
| 1001 | 2105 |
| 1002 | 430 |
| 1003 | 1602 |
| 1004 | 838 |
| 1005 | 2569 |
| 1006 | 1248 |
| 1007 | 667 |
| 1008 | 3075 |
| 1009 | 488 |
| 1010 | 1190 |
| 1011 | 239 |
| 1012 | 2160 |
| 1013 | 1543 |
| 1014 | 378 |
| 1015 | 1576 |
| 1016 | 2183 |
| 1017 | 459 |
| 1018 | 1219 |
| 1019 | 622 |
| 1020 | 2126 |
| 1021 | 627 |
| 1022 | 1294 |
| 1023 | 437 |
| 1024 | 2337 |
| 1025 | 1665 |
| 1026 | 380 |
| 1027 | 2242 |
| 1028 | 1547 |
| 1029 | 818 |
| 1030 | 1299 |
| 1031 | 2133 |
| 1032 | 461 |
| 1033 | 496 |
| 1034 | 1604 |
| 1035 | 2324 |
| 1036 | 669 |
| 1037 | 1315 |
| 1038 | 2570 |
| 1039 | 679 |
| 1040 | 1083 |
| 1041 | 724 |
| 1042 | 2106 |
| 1043 | 1193 |
| 1044 | 841 |
| 1045 | 629 |
| 1046 | 2216 |
| 1047 | 1584 |
| 1048 | 351 |
| 1049 | 1138 |
| 1050 | 3077 |
| 1051 | 467 |
| 1052 | 1301 |
| 1053 | 2187 |
| 1054 | 438 |
| 1055 | 1180 |
| 1056 | 737 |
| 1057 | 2147 |
| 1058 | 1111 |
| 1059 | 251 |
| 1060 | 1221 |
| 1061 | 2134 |
| 1062 | 462 |
| 1063 | 442 |
| 1064 | 2108 |
| 1065 | 1140 |
| 1066 | 441 |
| 1067 | 1194 |
| 1068 | 2328 |
| 1069 | 469 |
| 1070 | 1085 |
| 1071 | 2137 |
| 1072 | 247 |
| 1073 | 1555 |

TABLE Q2-continued

| with a sequence length of 4096: | |
|---|---|
| Reliability or reliability sequence number | Polarized channel sequence number |
| 1074 | 683 |
| 1075 | 2338 |
| 1076 | 1549 |
| 1077 | 842 |
| 1078 | 1666 |
| 1079 | 2577 |
| 1080 | 738 |
| 1081 | 899 |
| 1082 | 2572 |
| 1083 | 1305 |
| 1084 | 670 |
| 1085 | 1302 |
| 1086 | 2244 |
| 1087 | 783 |
| 1088 | 1550 |
| 1089 | 3136 |
| 1090 | 849 |
| 1091 | 1201 |
| 1092 | 820 |
| 1093 | 2189 |
| 1094 | 1317 |
| 1095 | 728 |
| 1096 | 2149 |
| 1097 | 1412 |
| 1098 | 928 |
| 1099 | 1115 |
| 1100 | 2195 |
| 1101 | 791 |
| 1102 | 367 |
| 1103 | 2224 |
| 1104 | 1608 |
| 1105 | 901 |
| 1106 | 1793 |
| 1107 | 2190 |
| 1108 | 630 |
| 1109 | 1222 |
| 1110 | 2578 |
| 1111 | 685 |
| 1112 | 1196 |
| 1113 | 844 |
| 1114 | 2369 |
| 1115 | 1144 |
| 1116 | 633 |
| 1117 | 2079 |
| 1118 | 1225 |
| 1119 | 711 |
| 1120 | 1360 |
| 1121 | 2248 |
| 1122 | 253 |
| 1123 | 1086 |
| 1124 | 3081 |
| 1125 | 691 |
| 1126 | 1306 |
| 1127 | 824 |
| 1128 | 2138 |
| 1129 | 1167 |
| 1130 | 902 |
| 1131 | 2593 |
| 1132 | 1127 |
| 1133 | 686 |
| 1134 | 740 |
| 1135 | 2340 |
| 1136 | 1202 |
| 1137 | 850 |
| 1138 | 2370 |
| 1139 | 1318 |
| 1140 | 375 |
| 1141 | 2580 |
| 1142 | 1117 |
| 1143 | 444 |
| 1144 | 1668 |
| 1145 | 2311 |
| 1146 | 470 |
| 1147 | 1226 |
| 1148 | 2197 |

TABLE Q2-continued

| with a sequence length of 4096: | |
|---|---|
| Reliability or reliability sequence number | Polarized channel sequence number |
| 1149 | 483 |
| 1150 | 1616 |
| 1151 | 415 |
| 1152 | 2150 |
| 1153 | 1347 |
| 1154 | 485 |
| 1155 | 2153 |
| 1156 | 1416 |
| 1157 | 905 |
| 1158 | 3078 |
| 1159 | 1321 |
| 1160 | 795 |
| 1161 | 1794 |
| 1162 | 2352 |
| 1163 | 473 |
| 1164 | 1131 |
| 1165 | 2344 |
| 1166 | 634 |
| 1167 | 1204 |
| 1168 | 2211 |
| 1169 | 744 |
| 1170 | 1175 |
| 1171 | 852 |
| 1172 | 2140 |
| 1173 | 1233 |
| 1174 | 960 |
| 1175 | 2095 |
| 1176 | 1308 |
| 1177 | 865 |
| 1178 | 2315 |
| 1179 | 1672 |
| 1180 | 693 |
| 1181 | 2433 |
| 1182 | 1118 |
| 1183 | 797 |
| 1184 | 1228 |
| 1185 | 2594 |
| 1186 | 906 |
| 1187 | 1322 |
| 1188 | 2372 |
| 1189 | 715 |
| 1190 | 1424 |
| 1191 | 3089 |
| 1192 | 807 |
| 1193 | 1632 |
| 1194 | 474 |
| 1195 | 2256 |
| 1196 | 1376 |
| 1197 | 636 |
| 1198 | 2434 |
| 1199 | 1349 |
| 1200 | 694 |
| 1201 | 2198 |
| 1202 | 1557 |
| 1203 | 254 |
| 1204 | 2201 |
| 1205 | 1179 |
| 1206 | 717 |
| 1207 | 2213 |
| 1208 | 1234 |
| 1209 | 575 |
| 1210 | 1329 |
| 1211 | 2154 |
| 1212 | 913 |
| 1213 | 1571 |
| 1214 | 2103 |
| 1215 | 798 |
| 1216 | 1324 |
| 1217 | 3082 |
| 1218 | 811 |
| 1219 | 1133 |
| 1220 | 2376 |
| 1221 | 379 |
| 1222 | 1208 |
| 1223 | 2584 |

TABLE Q2-continued

| with a sequence length of 4096: | |
|---|---|
| Reliability or reliability sequence number | Polarized channel sequence number |
| 1224 | 697 |
| 1225 | 1558 |
| 1226 | 431 |
| 1227 | 2625 |
| 1228 | 607 |
| 1229 | 489 |
| 1230 | 2596 |
| 1231 | 1561 |
| 1232 | 866 |
| 1233 | 2161 |
| 1234 | 1139 |
| 1235 | 723 |
| 1236 | 2202 |
| 1237 | 1191 |
| 1238 | 486 |
| 1239 | 2127 |
| 1240 | 1249 |
| 1241 | 908 |
| 1242 | 2317 |
| 1243 | 1350 |
| 1244 | 718 |
| 1245 | 1330 |
| 1246 | 3090 |
| 1247 | 813 |
| 1248 | 1796 |
| 1249 | 2156 |
| 1250 | 476 |
| 1251 | 1181 |
| 1252 | 2626 |
| 1253 | 856 |
| 1254 | 1680 |
| 1255 | 2272 |
| 1256 | 839 |
| 1257 | 1353 |
| 1258 | 2214 |
| 1259 | 725 |
| 1260 | 1134 |
| 1261 | 2567 |
| 1262 | 698 |
| 1263 | 1141 |
| 1264 | 2600 |
| 1265 | 914 |
| 1266 | 1236 |
| 1267 | 2243 |
| 1268 | 752 |
| 1269 | 1195 |
| 1270 | 3200 |
| 1271 | 868 |
| 1272 | 1800 |
| 1273 | 2318 |
| 1274 | 819 |
| 1275 | 1354 |
| 1276 | 2689 |
| 1277 | 814 |
| 1278 | 1250 |
| 1279 | 439 |
| 1280 | 2571 |
| 1281 | 1573 |
| 1282 | 929 |
| 1283 | 2323 |
| 1284 | 1562 |
| 1285 | 490 |
| 1286 | 2628 |
| 1287 | 1411 |
| 1288 | 623 |
| 1289 | 2339 |
| 1290 | 1332 |
| 1291 | 671 |
| 1292 | 2107 |
| 1293 | 1240 |
| 1294 | 739 |
| 1295 | 3084 |
| 1296 | 1440 |
| 1297 | 916 |
| 1298 | 2217 |

TABLE Q2-continued

| with a sequence length of 4096: | |
|---|---|
| Reliability or reliability sequence number | Polarized channel sequence number |
| 1299 | 1295 |
| 1300 | 463 |
| 1301 | 2608 |
| 1302 | 1303 |
| 1303 | 843 |
| 1304 | 2162 |
| 1305 | 1182 |
| 1306 | 381 |
| 1307 | 2325 |
| 1308 | 1361 |
| 1309 | 497 |
| 1310 | 2204 |
| 1311 | 1574 |
| 1312 | 930 |
| 1313 | 2135 |
| 1314 | 1696 |
| 1315 | 821 |
| 1316 | 2245 |
| 1317 | 1142 |
| 1318 | 726 |
| 1319 | 3105 |
| 1320 | 1356 |
| 1321 | 1603 |
| 1322 | 2164 |
| 1323 | 961 |
| 1324 | 2218 |
| 1325 | 1564 |
| 1326 | 872 |
| 1327 | 2109 |
| 1328 | 1413 |
| 1329 | 492 |
| 1330 | 2579 |
| 1331 | 1197 |
| 1332 | 631 |
| 1333 | 2573 |
| 1334 | 1145 |
| 1335 | 729 |
| 1336 | 2690 |
| 1337 | 1577 |
| 1338 | 700 |
| 1339 | 2329 |
| 1340 | 1223 |
| 1341 | 443 |
| 1342 | 3137 |
| 1343 | 1808 |
| 1344 | 741 |
| 1345 | 2326 |
| 1346 | 1203 |
| 1347 | 845 |
| 1348 | 2574 |
| 1349 | 1252 |
| 1350 | 920 |
| 1351 | 2225 |
| 1352 | 1362 |
| 1353 | 382 |
| 1354 | 2341 |
| 1355 | 1336 |
| 1356 | 822 |
| 1357 | 2436 |
| 1358 | 1728 |
| 1359 | 2139 |
| 1360 | 1414 |
| 1361 | 851 |
| 1362 | 3092 |
| 1363 | 1198 |
| 1364 | 730 |
| 1365 | 2632 |
| 1366 | 1578 |
| 1367 | 498 |
| 1368 | 2817 |
| 1369 | 1605 |
| 1370 | 880 |
| 1371 | 2246 |
| 1372 | 1417 |
| 1373 | 742 |

TABLE Q2-continued

| with a sequence length of 4096: | |
|---|---|
| Reliability or reliability sequence number | Polarized channel sequence number |
| 1374 | 2220 |
| 1375 | 1307 |
| 1376 | 445 |
| 1377 | 2168 |
| 1378 | 1146 |
| 1379 | 2249 |
| 1380 | 471 |
| 1381 | 1472 |
| 1382 | 2384 |
| 1383 | 1377 |
| 1384 | 635 |
| 1385 | 3328 |
| 1386 | 1585 |
| 1387 | 932 |
| 1388 | 2110 |
| 1389 | 1227 |
| 1390 | 687 |
| 1391 | 2330 |
| 1392 | 1087 |
| 1393 | 903 |
| 1394 | 2191 |
| 1395 | 1364 |
| 1396 | 2151 |
| 1397 | 825 |
| 1398 | 1418 |
| 1399 | 2226 |
| 1400 | 500 |
| 1401 | 1551 |
| 1402 | 2342 |
| 1403 | 1606 |
| 1404 | 846 |
| 1405 | 3106 |
| 1406 | 1580 |
| 1407 | 745 |
| 1408 | 2141 |
| 1409 | 1205 |
| 1410 | 2692 |
| 1411 | 826 |
| 1412 | 1319 |
| 1413 | 2250 |
| 1414 | 732 |
| 1415 | 1309 |
| 1416 | 2640 |
| 1417 | 446 |
| 1418 | 1256 |
| 1419 | 2371 |
| 1420 | 1148 |
| 1421 | 3096 |
| 1422 | 962 |
| 1423 | 1229 |
| 1424 | 2440 |
| 1425 | 936 |
| 1426 | 1206 |
| 1427 | 2345 |
| 1428 | 475 |
| 1429 | 1667 |
| 1430 | 2818 |
| 1431 | 853 |
| 1432 | 2155 |
| 1433 | 1586 |
| 1434 | 867 |
| 1435 | 2228 |
| 1436 | 1310 |
| 1437 | 1609 |
| 1438 | 2199 |
| 1439 | 637 |
| 1440 | 1323 |
| 1441 | 3108 |
| 1442 | 907 |
| 1443 | 2257 |
| 1444 | 1378 |
| 1445 | 487 |
| 1446 | 2332 |
| 1447 | 1235 |
| 1448 | 695 |

TABLE Q2-continued

| with a sequence length of 4096: | |
|---|---|
| Reliability or reliability sequence number | Polarized channel sequence number |
| 1449 | 2696 |
| 1450 | 1425 |
| 1451 | 2142 |
| 1452 | 1209 |
| 1453 | 746 |
| 1454 | 2252 |
| 1455 | 1420 |
| 1456 | 828 |
| 1457 | 2346 |
| 1458 | 1368 |
| 1459 | 3079 |
| 1460 | 753 |
| 1461 | 1610 |
| 1462 | 2448 |
| 1463 | 854 |
| 1464 | 1669 |
| 1465 | 2656 |
| 1466 | 1617 |
| 1467 | 2400 |
| 1468 | 857 |
| 1469 | 1559 |
| 1470 | 2373 |
| 1471 | 504 |
| 1472 | 1264 |
| 1473 | 2581 |
| 1474 | 799 |
| 1475 | 3201 |
| 1476 | 1230 |
| 1477 | 1119 |
| 1478 | 2203 |
| 1479 | 255 |
| 1480 | 1351 |
| 1481 | 2258 |
| 1482 | 964 |
| 1483 | 2353 |
| 1484 | 1588 |
| 1485 | 909 |
| 1486 | 2595 |
| 1487 | 1824 |
| 1488 | 719 |
| 1489 | 2348 |
| 1490 | 1426 |
| 1491 | 3138 |
| 1492 | 1380 |
| 1493 | 477 |
| 1494 | 2157 |
| 1495 | 1331 |
| 1496 | 915 |
| 1497 | 2232 |
| 1498 | 1325 |
| 1499 | 2582 |
| 1500 | 638 |
| 1501 | 1441 |
| 1502 | 2585 |
| 1503 | 1237 |
| 1504 | 2163 |
| 1505 | 748 |
| 1506 | 1592 |
| 1507 | 2215 |
| 1508 | 944 |
| 1509 | 1856 |
| 1510 | 3584 |
| 1511 | 869 |
| 1512 | 2273 |
| 1513 | 1612 |
| 1514 | 1210 |
| 1515 | 2374 |
| 1516 | 491 |
| 1517 | 2354 |
| 1518 | 1670 |
| 1519 | 699 |
| 1520 | 2820 |
| 1521 | 1428 |
| 1522 | 1251 |
| 1523 | 2205 |

TABLE Q2-continued

| with a sequence length of 4096: | |
|---|---|
| Reliability or reliability sequence number | Polarized channel sequence number |
| 1524 | 754 |
| 1525 | 3083 |
| 1526 | 1920 |
| 1527 | 858 |
| 1528 | 2704 |
| 1529 | 1618 |
| 1530 | 2377 |
| 1531 | 478 |
| 1532 | 1442 |
| 1533 | 2158 |
| 1534 | 1326 |
| 1535 | 968 |
| 1536 | 2165 |
| 1537 | 1673 |
| 1538 | 2260 |
| 1539 | 383 |
| 1540 | 1795 |
| 1541 | 3112 |
| 1542 | 910 |
| 1543 | 2219 |
| 1544 | 1384 |
| 1545 | 1563 |
| 1546 | 2824 |
| 1547 | 815 |
| 1548 | 2378 |
| 1549 | 1135 |
| 1550 | 976 |
| 1551 | 2274 |
| 1552 | 1355 |
| 1553 | 2597 |
| 1554 | 1238 |
| 1555 | 870 |
| 1556 | 3140 |
| 1557 | 1333 |
| 1558 | 2586 |
| 1559 | 917 |
| 1560 | 1212 |
| 1561 | 2435 |
| 1562 | 1473 |
| 1563 | 2356 |
| 1564 | 727 |
| 1565 | 1241 |
| 1566 | 2264 |
| 1567 | 493 |
| 1568 | 3202 |
| 1569 | 1432 |
| 1570 | 873 |
| 1571 | 2464 |
| 1572 | 1633 |
| 1573 | 2319 |
| 1574 | 1620 |
| 1575 | 701 |
| 1576 | 2327 |
| 1577 | 1575 |
| 1578 | 2206 |
| 1579 | 931 |
| 1580 | 1674 |
| 1581 | 2385 |
| 1582 | 1253 |
| 1583 | 3091 |
| 1584 | 756 |
| 1585 | 1183 |
| 1586 | 2598 |
| 1587 | 860 |
| 1588 | 2720 |
| 1589 | 1444 |
| 1590 | 1334 |
| 1591 | 2166 |
| 1592 | 499 |
| 1593 | 2380 |
| 1594 | 1565 |
| 1595 | 731 |
| 1596 | 2627 |
| 1597 | 1797 |
| 1598 | 3085 |

TABLE Q2-continued

| with a sequence length of 4096: | |
|---|---|
| Reliability or reliability sequence number | Polarized channel sequence number |
| 1599 | 1634 |
| 1600 | 823 |
| 1601 | 2588 |
| 1602 | 1681 |
| 1603 | 2437 |
| 1604 | 922 |
| 1605 | 1357 |
| 1606 | 2221 |
| 1607 | 1143 |
| 1608 | 2169 |
| 1609 | 874 |
| 1610 | 1624 |
| 1611 | 3120 |
| 1612 | 918 |
| 1613 | 2601 |
| 1614 | 1363 |
| 1615 | 2247 |
| 1616 | 1242 |
| 1617 | 502 |
| 1618 | 2832 |
| 1619 | 1392 |
| 1620 | 2227 |
| 1621 | 933 |
| 1622 | 1676 |
| 1623 | 3086 |
| 1624 | 1254 |
| 1625 | 2276 |
| 1626 | 743 |
| 1627 | 1415 |
| 1628 | 2386 |
| 1629 | 1337 |
| 1630 | 2360 |
| 1631 | 760 |
| 1632 | 2752 |
| 1633 | 1474 |
| 1634 | 881 |
| 1635 | 2438 |
| 1636 | 1566 |
| 1637 | 3144 |
| 1638 | 1358 |
| 1639 | 494 |
| 1640 | 2222 |
| 1641 | 1257 |
| 1642 | 2602 |
| 1643 | 702 |
| 1644 | 2629 |
| 1645 | 1579 |
| 1646 | 1798 |
| 1647 | 2441 |
| 1648 | 921 |
| 1649 | 3329 |
| 1650 | 1199 |
| 1651 | 501 |
| 1652 | 2331 |
| 1653 | 1147 |
| 1654 | 2170 |
| 1655 | 1682 |
| 1656 | 2496 |
| 1657 | 876 |
| 1658 | 1636 |
| 1659 | 2401 |
| 1660 | 1365 |
| 1661 | 3093 |
| 1662 | 847 |
| 1663 | 1801 |
| 1664 | 2609 |
| 1665 | 992 |
| 1666 | 2251 |
| 1667 | 1244 |
| 1668 | 2111 |
| 1669 | 1338 |
| 1670 | 447 |
| 1671 | 2388 |
| 1672 | 1448 |
| 1673 | 3204 |

TABLE Q2-continued with a sequence length of 4096:

| Reliability or reliability sequence number | Polarized channel sequence number |
|---|---|
| 1674 | 1419 |
| 1675 | 2442 |
| 1676 | 733 |
| 1677 | 1697 |
| 1678 | 2575 |
| 1679 | 827 |
| 1680 | 2630 |
| 1681 | 1607 |
| 1682 | 2604 |
| 1683 | 1379 |
| 1684 | 934 |
| 1685 | 2229 |
| 1686 | 1311 |
| 1687 | 3107 |
| 1688 | 1207 |
| 1689 | 2343 |
| 1690 | 882 |
| 1691 | 1258 |
| 1692 | 2333 |
| 1693 | 937 |
| 1694 | 2280 |
| 1695 | 1149 |
| 1696 | 2172 |
| 1697 | 1581 |
| 1698 | 963 |
| 1699 | 3330 |
| 1700 | 1684 |
| 1701 | 2253 |
| 1702 | 1640 |
| 1703 | 2230 |
| 1704 | 747 |
| 1705 | 1366 |
| 1706 | 2691 |
| 1707 | 505 |
| 1708 | 2610 |
| 1709 | 1340 |
| 1710 | 3098 |
| 1711 | 1265 |
| 1712 | 855 |
| 1713 | 2334 |
| 1714 | 1802 |
| 1715 | 2633 |
| 1716 | 1587 |
| 1717 | 2347 |
| 1718 | 924 |
| 1719 | 3585 |
| 1720 | 1369 |
| 1721 | 734 |
| 1722 | 2402 |
| 1723 | 1476 |
| 1724 | 2259 |
| 1725 | 1421 |
| 1726 | 2449 |
| 1727 | 829 |
| 1728 | 1427 |
| 1729 | 2233 |
| 1730 | 1231 |
| 1731 | 3152 |
| 1732 | 965 |
| 1733 | 2444 |
| 1734 | 1698 |
| 1735 | 2392 |
| 1736 | 1582 |
| 1737 | 938 |
| 1738 | 2634 |
| 1739 | 1809 |
| 1740 | 2693 |
| 1741 | 1456 |
| 1742 | 3109 |
| 1743 | 884 |
| 1744 | 1381 |
| 1745 | 2641 |
| 1746 | 506 |
| 1747 | 2583 |
| 1748 | 1211 |
| 1749 | 2288 |
| 1750 | 1260 |
| 1751 | 2254 |
| 1752 | 749 |
| 1753 | 1688 |
| 1754 | 3097 |
| 1755 | 1648 |
| 1756 | 2143 |
| 1757 | 945 |
| 1758 | 2375 |
| 1759 | 1611 |
| 1760 | 2612 |
| 1761 | 1804 |
| 1762 | 966 |
| 1763 | 3094 |
| 1764 | 1729 |
| 1765 | 2848 |
| 1766 | 1150 |
| 1767 | 2450 |
| 1768 | 755 |
| 1769 | 2404 |
| 1770 | 1266 |
| 1771 | 859 |
| 1772 | 2355 |
| 1773 | 1589 |
| 1774 | 3208 |
| 1775 | 1422 |
| 1776 | 2349 |
| 1777 | 940 |
| 1778 | 2465 |
| 1779 | 1370 |
| 1780 | 2261 |
| 1781 | 1480 |
| 1782 | 830 |
| 1783 | 2616 |
| 1784 | 1382 |
| 1785 | 3332 |
| 1786 | 1429 |
| 1787 | 2880 |
| 1788 | 911 |
| 1789 | 2636 |
| 1790 | 1327 |
| 1791 | 1593 |
| 1792 | 2234 |
| 1793 | 871 |
| 1794 | 3336 |
| 1795 | 1268 |
| 1796 | 2694 |
| 1797 | 1619 |
| 1798 | 2452 |
| 1799 | 639 |
| 1800 | 2275 |
| 1801 | 1213 |
| 1802 | 1590 |
| 1803 | 2944 |
| 1804 | 888 |
| 1805 | 3110 |
| 1806 | 1700 |
| 1807 | 2642 |
| 1808 | 1385 |
| 1809 | 2466 |
| 1810 | 479 |
| 1811 | 2350 |
| 1812 | 1730 |
| 1813 | 3586 |
| 1814 | 1613 |
| 1815 | 946 |
| 1816 | 2697 |
| 1817 | 1239 |
| 1818 | 2819 |
| 1819 | 750 |
| 1820 | 2408 |
| 1821 | 1810 |
| 1822 | 2587 |
| 1823 | 1671 |

TABLE Q2-continued

| with a sequence length of 4096: | |
|---|---|
| Reliability or reliability sequence number | Polarized channel sequence number |
| 1824 | 3168 |
| 1825 | 969 |
| 1826 | 2159 |
| 1827 | 1372 |
| 1828 | 1443 |
| 1829 | 2379 |
| 1830 | 508 |
| 1831 | 2262 |
| 1832 | 1430 |
| 1833 | 3139 |
| 1834 | 1488 |
| 1835 | 2357 |
| 1836 | 861 |
| 1837 | 2236 |
| 1838 | 1704 |
| 1839 | 2497 |
| 1840 | 1825 |
| 1841 | 757 |
| 1842 | 3113 |
| 1843 | 1386 |
| 1844 | 2265 |
| 1845 | 1614 |
| 1846 | 2456 |
| 1847 | 970 |
| 1848 | 2657 |
| 1849 | 1433 |
| 1850 | 2644 |
| 1851 | 1594 |
| 1852 | 3216 |
| 1853 | 919 |
| 1854 | 2599 |
| 1855 | 1812 |
| 1856 | 1621 |
| 1857 | 2698 |
| 1858 | 1596 |
| 1859 | 2277 |
| 1860 | 875 |
| 1861 | 3100 |
| 1862 | 1243 |
| 1863 | 2207 |
| 1864 | 1335 |
| 1865 | 2468 |
| 1866 | 862 |
| 1867 | 2358 |
| 1868 | 1732 |
| 1869 | 3141 |
| 1870 | 1622 |
| 1871 | 2589 |
| 1872 | 758 |
| 1873 | 1625 |
| 1874 | 2821 |
| 1875 | 1675 |
| 1876 | 2658 |
| 1877 | 948 |
| 1878 | 3114 |
| 1879 | 1445 |
| 1880 | 2705 |
| 1881 | 1816 |
| 1882 | 2381 |
| 1883 | 977 |
| 1884 | 2167 |
| 1885 | 1826 |
| 1886 | 3588 |
| 1887 | 1635 |
| 1888 | 2648 |
| 1889 | 923 |
| 1890 | 2387 |
| 1891 | 1626 |
| 1892 | 2266 |
| 1893 | 1434 |
| 1894 | 972 |
| 1895 | 3121 |
| 1896 | 1255 |
| 1897 | 2416 |
| 1898 | 1712 |

TABLE Q2-continued

| with a sequence length of 4096: | |
|---|---|
| Reliability or reliability sequence number | Polarized channel sequence number |
| 1899 | 2700 |
| 1900 | 761 |
| 1901 | 2278 |
| 1902 | 1677 |
| 1903 | 3146 |
| 1904 | 1272 |
| 1905 | 2439 |
| 1906 | 877 |
| 1907 | 2361 |
| 1908 | 1393 |
| 1909 | 2498 |
| 1910 | 1214 |
| 1911 | 3344 |
| 1912 | 1388 |
| 1913 | 2590 |
| 1914 | 952 |
| 1915 | 2382 |
| 1916 | 1678 |
| 1917 | 2281 |
| 1918 | 1683 |
| 1919 | 495 |
| 1920 | 3232 |
| 1921 | 1359 |
| 1922 | 2603 |
| 1923 | 1504 |
| 1924 | 2822 |
| 1925 | 703 |
| 1926 | 2223 |
| 1927 | 1339 |
| 1928 | 3592 |
| 1929 | 1245 |
| 1930 | 2171 |
| 1931 | 935 |
| 1932 | 2706 |
| 1933 | 1394 |
| 1934 | 2660 |
| 1935 | 1637 |
| 1936 | 3360 |
| 1937 | 978 |
| 1938 | 2389 |
| 1939 | 1446 |
| 1940 | 2825 |
| 1941 | 1449 |
| 1942 | 2268 |
| 1943 | 1475 |
| 1944 | 3600 |
| 1945 | 883 |
| 1946 | 2362 |
| 1947 | 1638 |
| 1948 | 2472 |
| 1949 | 1567 |
| 1950 | 2443 |
| 1951 | 762 |
| 1952 | 3264 |
| 1953 | 1259 |
| 1954 | 2721 |
| 1955 | 1436 |
| 1956 | 2631 |
| 1957 | 503 |
| 1958 | 2403 |
| 1959 | 1367 |
| 1960 | 3616 |
| 1961 | 1396 |
| 1962 | 2335 |
| 1963 | 925 |
| 1964 | 2231 |
| 1965 | 1799 |
| 1966 | 2282 |
| 1967 | 1341 |
| 1968 | 3142 |
| 1969 | 1246 |
| 1970 | 2173 |
| 1971 | 878 |
| 1972 | 2605 |
| 1973 | 1450 |

TABLE Q2-continued

| with a sequence length of 4096: | |
|---|---|
| Reliability or reliability sequence number | Polarized channel sequence number |
| 1974 | 2708 |
| 1975 | 1477 |
| 1976 | 3116 |
| 1977 | 735 |
| 1978 | 2664 |
| 1979 | 1261 |
| 1980 | 2390 |
| 1981 | 1583 |
| 1982 | 2364 |
| 1983 | 1857 |
| 1984 | 3203 |
| 1985 | 993 |
| 1986 | 2289 |
| 1987 | 1828 |
| 1988 | 2826 |
| 1989 | 1736 |
| 1990 | 3153 |
| 1991 | 885 |
| 1992 | 2611 |
| 1993 | 1858 |
| 1994 | 2393 |
| 1995 | 1685 |
| 1996 | 2500 |
| 1997 | 939 |
| 1998 | 3122 |
| 1999 | 1832 |
| 2000 | 2445 |
| 2001 | 1803 |
| 2002 | 2451 |
| 2003 | 1641 |
| 2004 | 2255 |
| 2005 | 994 |
| 2006 | 3145 |
| 2007 | 1628 |
| 2008 | 2722 |
| 2009 | 1457 |
| 2010 | 2606 |
| 2011 | 980 |
| 2012 | 3087 |
| 2013 | 1744 |
| 2014 | 2833 |
| 2015 | 1840 |
| 2016 | 2480 |
| 2017 | 1860 |
| 2018 | 2405 |
| 2019 | 926 |
| 2020 | 3392 |
| 2021 | 1371 |
| 2022 | 2235 |
| 2023 | 1921 |
| 2024 | 2284 |
| 2025 | 764 |
| 2026 | 2712 |
| 2027 | 1267 |
| 2028 | 3205 |
| 2029 | 1686 |
| 2030 | 2672 |
| 2031 | 1478 |
| 2032 | 2635 |
| 2033 | 941 |
| 2034 | 3124 |
| 2035 | 1342 |
| 2036 | 2828 |
| 2037 | 1699 |
| 2038 | 2753 |
| 2039 | 967 |
| 2040 | 2174 |
| 2041 | 1642 |
| 2042 | 3095 |
| 2043 | 1922 |
| 2044 | 2290 |
| 2045 | 1805 |
| 2046 | 2613 |
| 2047 | 886 |
| 2048 | 1400 |

TABLE Q2-continued

| with a sequence length of 4096: | |
|---|---|
| Reliability or reliability sequence number | Polarized channel sequence number |
| 2049 | 1452 |
| 2050 | 3206 |
| 2051 | 831 |
| 2052 | 2446 |
| 2053 | 1689 |
| 2054 | 2394 |
| 2055 | 1760 |
| 2056 | 2504 |
| 2057 | 1591 |
| 2058 | 3456 |
| 2059 | 947 |
| 2060 | 2406 |
| 2061 | 1864 |
| 2062 | 2453 |
| 2063 | 1649 |
| 2064 | 3148 |
| 2065 | 507 |
| 2066 | 2351 |
| 2067 | 1262 |
| 2068 | 2617 |
| 2069 | 1383 |
| 2070 | 2292 |
| 2071 | 1481 |
| 2072 | 3209 |
| 2073 | 889 |
| 2074 | 2643 |
| 2075 | 1423 |
| 2076 | 2237 |
| 2077 | 1811 |
| 2078 | 3154 |
| 2079 | 1615 |
| 2080 | 2614 |
| 2081 | 984 |
| 2082 | 2724 |
| 2083 | 1702 |
| 2084 | 2409 |
| 2085 | 1458 |
| 2086 | 3128 |
| 2087 | 751 |
| 2088 | 2754 |
| 2089 | 1701 |
| 2090 | 2637 |
| 2091 | 1373 |
| 2092 | 3099 |
| 2093 | 1269 |
| 2094 | 2263 |
| 2095 | 942 |
| 2096 | 2834 |
| 2097 | 1482 |
| 2098 | 2695 |
| 2099 | 1690 |
| 2100 | 3169 |
| 2101 | 1644 |
| 2102 | 2396 |
| 2103 | 996 |
| 2104 | 2467 |
| 2105 | 1387 |
| 2106 | 3111 |
| 2107 | 1151 |
| 2108 | 2454 |
| 2109 | 1215 |
| 2110 | 2512 |
| 2111 | 971 |
| 2112 | 2728 |
| 2113 | 1806 |
| 2114 | 3331 |
| 2115 | 1431 |
| 2116 | 2849 |
| 2117 | 890 |
| 2118 | 2410 |
| 2119 | 1460 |
| 2120 | 3156 |
| 2121 | 1650 |
| 2122 | 2638 |
| 2123 | 1595 |

TABLE Q2-continued

| with a sequence length of 4096: | |
|---|---|
| Reliability or reliability sequence number | Polarized channel sequence number |
| 2124 | 2457 |
| 2125 | 509 |
| 2126 | 3210 |
| 2127 | 1489 |
| 2128 | 2618 |
| 2129 | 1705 |
| 2130 | 2836 |
| 2131 | 1270 |
| 2132 | 2645 |
| 2133 | 949 |
| 2134 | 3217 |
| 2135 | 1731 |
| 2136 | 2620 |
| 2137 | 1374 |
| 2138 | 2267 |
| 2139 | 1623 |
| 2140 | 3333 |
| 2141 | 973 |
| 2142 | 2359 |
| 2143 | 1692 |
| 2144 | 2756 |
| 2145 | 1814 |
| 2146 | 3101 |
| 2147 | 1484 |
| 2148 | 2646 |
| 2149 | 1000 |
| 2150 | 2649 |
| 2151 | 1273 |
| 2152 | 3115 |
| 2153 | 1706 |
| 2154 | 2699 |
| 2155 | 1597 |
| 2156 | 2469 |
| 2157 | 892 |
| 2158 | 2840 |
| 2159 | 1435 |
| 2160 | 3170 |
| 2161 | 1827 |
| 2162 | 2850 |
| 2163 | 1813 |
| 2164 | 2659 |
| 2165 | 950 |
| 2166 | 3587 |
| 2167 | 1733 |
| 2168 | 2650 |
| 2169 | 1389 |
| 2170 | 2458 |
| 2171 | 1464 |
| 2172 | 3160 |
| 2173 | 863 |
| 2174 | 2279 |
| 2175 | 2736 |
| 2176 | 1652 |
| 2177 | 3212 |
| 2178 | 1713 |
| 2179 | 2701 |
| 2180 | 1398 |
| 2181 | 2296 |
| 2182 | 759 |
| 2183 | 3102 |
| 2184 | 1447 |
| 2185 | 2417 |
| 2186 | 1490 |
| 2187 | 2238 |
| 2188 | 1817 |
| 2189 | 2412 |
| 2190 | 1008 |
| 2191 | 3218 |
| 2192 | 1274 |
| 2193 | 2702 |
| 2194 | 1395 |
| 2195 | 2707 |
| 2196 | 1505 |
| 2197 | 3143 |
| 2198 | 510 |

TABLE Q2-continued

| with a sequence length of 4096: | |
|---|---|
| Reliability or reliability sequence number | Polarized channel sequence number |
| 2199 | 2383 |
| 2200 | 1598 |
| 2201 | 2528 |
| 2202 | 3334 |
| 2203 | 1437 |
| 2204 | 2363 |
| 2205 | 1627 |
| 2206 | 2269 |
| 2207 | 979 |
| 2208 | 3337 |
| 2209 | 1390 |
| 2210 | 2418 |
| 2211 | 1492 |
| 2212 | 2661 |
| 2213 | 1679 |
| 2214 | 3233 |
| 2215 | 953 |
| 2216 | 2470 |
| 2217 | 1924 |
| 2218 | 2473 |
| 2219 | 1829 |
| 2220 | 3648 |
| 2221 | 1639 |
| 2222 | 2499 |
| 2223 | 2662 |
| 2224 | 763 |
| 2225 | 3117 |
| 2226 | 1708 |
| 2227 | 2591 |
| 2228 | 1734 |
| 2229 | 2283 |
| 2230 | 1453 |
| 2231 | 3172 |
| 2232 | 974 |
| 2233 | 2460 |
| 2234 | 1818 |
| 2235 | 2391 |
| 2236 | 1276 |
| 2237 | 2420 |
| 2238 | 1397 |
| 2239 | 3712 |
| 2240 | 2823 |
| 2241 | 1629 |
| 2242 | 2365 |
| 2243 | 954 |
| 2244 | 3123 |
| 2245 | 1872 |
| 2246 | 2270 |
| 2247 | 1714 |
| 2248 | 2474 |
| 2249 | 1737 |
| 2250 | 3220 |
| 2251 | 879 |
| 2252 | 2501 |
| 2253 | 1656 |
| 2254 | 2285 |
| 2255 | 3118 |
| 2256 | 1506 |
| 2257 | 2607 |
| 2258 | 1830 |
| 2259 | 2881 |
| 2260 | 981 |
| 2261 | 3147 |
| 2262 | 1451 |
| 2263 | 2852 |
| 2264 | 1928 |
| 2265 | 2760 |
| 2266 | 1438 |
| 2267 | 3338 |
| 2268 | 2882 |
| 2269 | 982 |
| 2270 | 2709 |
| 2271 | 1247 |
| 2272 | 3345 |
| 2273 | 1687 |

TABLE Q2-continued

| with a sequence length of 4096: | |
|---|---|
| Reliability or reliability sequence number | Polarized channel sequence number |
| 2274 | 2856 |
| 2275 | 1716 |
| 2276 | 2827 |
| 2277 | 1859 |
| 2278 | 3589 |
| 2279 | 927 |
| 2280 | 2665 |
| 2281 | 3176 |
| 2282 | 1643 |
| 2283 | 2652 |
| 2284 | 1496 |
| 2285 | 2481 |
| 2286 | 1479 |
| 2287 | 3234 |
| 2288 | 995 |
| 2289 | 2768 |
| 2290 | 1820 |
| 2291 | 2864 |
| 2292 | 1833 |
| 2293 | 3125 |
| 2294 | 2884 |
| 2295 | 1738 |
| 2296 | 2395 |
| 2297 | 1745 |
| 2298 | 3265 |
| 2299 | 765 |
| 2300 | 2945 |
| 2301 | 1861 |
| 2302 | 2291 |
| 2303 | 3224 |
| 2304 | 1740 |
| 2305 | 2710 |
| 2306 | 1888 |
| 2307 | 2502 |
| 2308 | 956 |
| 2309 | 3149 |
| 2310 | 1834 |
| 2311 | 2366 |
| 2312 | 1630 |
| 2313 | 2723 |
| 2314 | 3236 |
| 2315 | 1936 |
| 2316 | 2666 |
| 2317 | 1746 |
| 2318 | 2946 |
| 2319 | 887 |
| 2320 | 3840 |
| 2321 | 1720 |
| 2322 | 2829 |
| 2323 | 1401 |
| 2324 | 2424 |
| 2325 | 3340 |
| 2326 | 1459 |
| 2327 | 2476 |
| 2328 | 1841 |
| 2329 | 3346 |
| 2330 | 985 |
| 2331 | 2713 |
| 2332 | 1343 |
| 2333 | 2784 |
| 2334 | 3590 |
| 2335 | 1645 |
| 2336 | 2615 |
| 2337 | 1836 |
| 2338 | 2888 |
| 2339 | 997 |
| 2340 | 3126 |
| 2341 | 1508 |
| 2342 | 2673 |
| 2343 | 2286 |
| 2344 | 1454 |
| 2345 | 3155 |
| 2346 | 1862 |
| 2347 | 2407 |
| 2348 | 1691 |

TABLE Q2-continued

| with a sequence length of 4096: | |
|---|---|
| Reliability or reliability sequence number | Polarized channel sequence number |
| 2349 | 2505 |
| 2350 | 986 |
| 2351 | 3129 |
| 2352 | 2447 |
| 2353 | 1512 |
| 2354 | 2835 |
| 2355 | 1263 |
| 2356 | 3593 |
| 2357 | 1402 |
| 2358 | 2639 |
| 2359 | 3184 |
| 2360 | 1483 |
| 2361 | 2726 |
| 2362 | 943 |
| 2363 | 2482 |
| 2364 | 1646 |
| 2365 | 3207 |
| 2366 | 1651 |
| 2367 | 2725 |
| 2368 | 2397 |
| 2369 | 1461 |
| 2370 | 3150 |
| 2371 | 1404 |
| 2372 | 2293 |
| 2373 | 891 |
| 2374 | 2506 |
| 2375 | 3361 |
| 2376 | 1842 |
| 2377 | 2714 |
| 2378 | 1485 |
| 2379 | 3266 |
| 2380 | 1520 |
| 2381 | 2668 |
| 2382 | 1693 |
| 2383 | 2411 |
| 2384 | 3157 |
| 2385 | 998 |
| 2386 | 2175 |
| 2387 | 1703 |
| 2388 | 2239 |
| 2389 | 1748 |
| 2390 | 3348 |
| 2391 | 2830 |
| 2392 | 1865 |
| 2393 | 3594 |
| 2394 | 766 |
| 2395 | 2455 |
| 2396 | 1653 |
| 2397 | 2484 |
| 2398 | 3130 |
| 2399 | 1375 |
| 2400 | 2674 |
| 2401 | 1491 |
| 2402 | 2619 |
| 2403 | 1462 |
| 2404 | 3240 |
| 2405 | 2513 |
| 2406 | 511 |
| 2407 | 3211 |
| 2408 | 1761 |
| 2409 | 2729 |
| 2410 | 1275 |
| 2411 | 2294 |
| 2412 | 3171 |
| 2413 | 1486 |
| 2414 | 2755 |
| 2415 | 1466 |
| 2416 | 2398 |
| 2417 | 1465 |
| 2418 | 3158 |
| 2419 | 2647 |
| 2420 | 988 |
| 2421 | 3132 |
| 2422 | 1493 |
| 2423 | 2716 |

TABLE Q2-continued

| with a sequence length of 4096: | |
|---|---|
| Reliability or reliability sequence number | Polarized channel sequence number |
| 2424 | 1271 |
| 2425 | 2838 |
| 2426 | 3352 |
| 2427 | 1707 |
| 2428 | 2508 |
| 2429 | 1866 |
| 2430 | 2297 |
| 2431 | 3161 |
| 2432 | 1001 |
| 2433 | 2730 |
| 2434 | 1762 |
| 2435 | 3362 |
| 2436 | 1923 |
| 2437 | 2621 |
| 2438 | 2459 |
| 2439 | 1694 |
| 2440 | 3601 |
| 2441 | 1807 |
| 2442 | 2851 |
| 2443 | 951 |
| 2444 | 2837 |
| 2445 | 3596 |
| 2446 | 1873 |
| 2447 | 2757 |
| 2448 | 1844 |
| 2449 | 3268 |
| 2450 | 2413 |
| 2451 | 1752 |
| 2452 | 2488 |
| 2453 | 1952 |
| 2454 | 3213 |
| 2455 | 1002 |
| 2456 | 2676 |
| 2457 | 3173 |
| 2458 | 1815 |
| 2459 | 2737 |
| 2460 | 1391 |
| 2461 | 2422 |
| 2462 | 3219 |
| 2463 | 1925 |
| 2464 | 2471 |
| 2465 | 1654 |
| 2466 | 2514 |
| 2467 | 1709 |
| 2468 | 3248 |
| 2469 | 2841 |
| 2470 | 893 |
| 2471 | 3214 |
| 2472 | 1868 |
| 2473 | 2298 |
| 2474 | 2419 |
| 2475 | 1657 |
| 2476 | 3602 |
| 2477 | 1735 |
| 2478 | 2529 |
| 2479 | 3393 |
| 2480 | 1277 |
| 2481 | 2622 |
| 2482 | 975 |
| 2483 | 2461 |
| 2484 | 1715 |
| 2485 | 3103 |
| 2486 | 2651 |
| 2487 | 1848 |
| 2488 | 3272 |
| 2489 | 1926 |
| 2490 | 2414 |
| 2491 | 2516 |
| 2492 | 1710 |
| 2493 | 3162 |
| 2494 | 894 |
| 2495 | 2703 |
| 2496 | 3617 |
| 2497 | 1764 |
| 2498 | 2948 |

TABLE Q2-continued

| with a sequence length of 4096: | |
|---|---|
| Reliability or reliability sequence number | Polarized channel sequence number |
| 2499 | 1874 |
| 2500 | 2853 |
| 2501 | 3364 |
| 2502 | 1399 |
| 2503 | 2663 |
| 2504 | 1468 |
| 2505 | 3394 |
| 2506 | 2732 |
| 2507 | 1494 |
| 2508 | 2758 |
| 2509 | 1009 |
| 2510 | 3604 |
| 2511 | 2477 |
| 2512 | 1507 |
| 2513 | 3335 |
| 2514 | 1439 |
| 2515 | 2842 |
| 2516 | 2300 |
| 2517 | 1509 |
| 2518 | 3221 |
| 2519 | 1929 |
| 2520 | 2421 |
| 2521 | 3174 |
| 2522 | 1819 |
| 2523 | 2653 |
| 2524 | 955 |
| 2525 | 2896 |
| 2526 | 3177 |
| 2527 | 1497 |
| 2528 | 2738 |
| 2529 | 1658 |
| 2530 | 3376 |
| 2531 | 2761 |
| 2532 | 1768 |
| 2533 | 3368 |
| 2534 | 1876 |
| 2535 | 2680 |
| 2536 | 2530 |
| 2537 | 1984 |
| 2538 | 3235 |
| 2539 | 1004 |
| 2540 | 2854 |
| 2541 | 3164 |
| 2542 | 1889 |
| 2543 | 2475 |
| 2544 | 1717 |
| 2545 | 2952 |
| 2546 | 3119 |
| 2547 | 1821 |
| 2548 | 2462 |
| 2549 | 1930 |
| 2550 | 3339 |
| 2551 | 2271 |
| 2552 | 1010 |
| 2553 | 2711 |
| 2554 | 1739 |
| 2555 | 3457 |
| 2556 | 2740 |
| 2557 | 1831 |
| 2558 | 3618 |
| 2559 | 2883 |
| 2560 | 1498 |
| 2561 | 3396 |
| 2562 | 1660 |
| 2563 | 2667 |
| 2564 | 2520 |
| 2565 | 1718 |
| 2566 | 3280 |
| 2567 | 957 |
| 2568 | 2503 |
| 2569 | 3458 |
| 2570 | 1278 |
| 2571 | 2844 |
| 2572 | 1741 |
| 2573 | 2857 |

TABLE Q2-continued

| with a sequence length of 4096: | |
|---|---|
| Reliability or reliability sequence number | Polarized channel sequence number |
| 2574 | 3222 |
| 2575 | 1599 |
| 2576 | 2762 |
| 2577 | 3225 |
| 2578 | 1937 |
| 2579 | 2769 |
| 2580 | 1822 |
| 2581 | 3237 |
| 2582 | 2885 |
| 2583 | 983 |
| 2584 | 2764 |
| 2585 | 1835 |
| 2586 | 3178 |
| 2587 | 2912 |
| 2588 | 1403 |
| 2589 | 3127 |
| 2590 | 2858 |
| 2591 | 1721 |
| 2592 | 3400 |
| 2593 | 1455 |
| 2594 | 2654 |
| 2595 | 2960 |
| 2596 | 1631 |
| 2597 | 3608 |
| 2598 | 1513 |
| 2599 | 2770 |
| 2600 | 3649 |
| 2601 | 958 |
| 2602 | 2744 |
| 2603 | 3620 |
| 2604 | 1890 |
| 2605 | 2425 |
| 2606 | 1747 |
| 2607 | 2483 |
| 2608 | 3185 |
| 2609 | 1510 |
| 2610 | 2865 |
| 2611 | 3226 |
| 2612 | 1932 |
| 2613 | 2367 |
| 2614 | 1742 |
| 2615 | 3151 |
| 2616 | 2669 |
| 2617 | 987 |
| 2618 | 3341 |
| 2619 | 2860 |
| 2620 | 1837 |
| 2621 | 2532 |
| 2622 | 1500 |
| 2623 | 3180 |
| 2624 | 2478 |
| 2625 | 1880 |
| 2626 | 3650 |
| 2627 | 2886 |
| 2628 | 1863 |
| 2629 | 3296 |
| 2630 | 1749 |
| 2631 | 2715 |
| 2632 | 2536 |
| 2633 | 1012 |
| 2634 | 3238 |
| 2635 | 2287 |
| 2636 | 1722 |
| 2637 | 3591 |
| 2638 | 1938 |
| 2639 | 2426 |
| 2640 | 3624 |
| 2641 | 1776 |
| 2642 | 2507 |
| 2643 | 3267 |
| 2644 | 1892 |
| 2645 | 2670 |
| 2646 | 1843 |
| 2647 | 2675 |
| 2648 | 3342 |

TABLE Q2-continued

| with a sequence length of 4096: | |
|---|---|
| Reliability or reliability sequence number | Polarized channel sequence number |
| 2649 | 1838 |
| 2650 | 2485 |
| 2651 | 3713 |
| 2652 | 999 |
| 2653 | 2428 |
| 2654 | 1463 |
| 2655 | 3595 |
| 2656 | 2866 |
| 2657 | 1953 |
| 2658 | 3347 |
| 2659 | 2509 |
| 2660 | 1514 |
| 2661 | 2544 |
| 2662 | 3652 |
| 2663 | 1647 |
| 2664 | 2717 |
| 2665 | 1695 |
| 2666 | 3363 |
| 2667 | 2727 |
| 2668 | 1763 |
| 2669 | 3131 |
| 2670 | 2772 |
| 2671 | 1016 |
| 2672 | 3241 |
| 2673 | 2889 |
| 2674 | 1940 |
| 2675 | 2677 |
| 2676 | 1487 |
| 2677 | 3632 |
| 2678 | 2399 |
| 2679 | 1867 |
| 2680 | 3186 |
| 2681 | 2515 |
| 2682 | 1405 |
| 2683 | 3349 |
| 2684 | 2486 |
| 2685 | 1521 |
| 2686 | 3228 |
| 2687 | 2785 |
| 2688 | 767 |
| 2689 | 3159 |
| 2690 | 1954 |
| 2691 | 2299 |
| 2692 | 3269 |
| 2693 | 1845 |
| 2694 | 2510 |
| 2695 | 2490 |
| 2696 | 1750 |
| 2697 | 3188 |
| 2698 | 2489 |
| 2699 | 1985 |
| 2700 | 3242 |
| 2701 | 1896 |
| 2702 | 2517 |
| 2703 | 3133 |
| 2704 | 1516 |
| 2705 | 2295 |
| 2706 | 3603 |
| 2707 | 1655 |
| 2708 | 2731 |
| 2709 | 3597 |
| 2710 | 989 |
| 2711 | 2890 |
| 2712 | 3714 |
| 2713 | 1753 |
| 2714 | 2786 |
| 2715 | 2947 |
| 2716 | 1724 |
| 2717 | 3353 |
| 2718 | 1467 |
| 2719 | 2718 |
| 2720 | 3350 |
| 2721 | 1765 |
| 2722 | 2831 |
| 2723 | 3598 |

TABLE Q2-continued with a sequence length of 4096:

| Reliability or reliability sequence number | Polarized channel sequence number |
|---|---|
| 2724 | 1869 |
| 2725 | 2897 |
| 2726 | 3249 |
| 2727 | 1944 |
| 2728 | 2868 |
| 2729 | 3365 |
| 2730 | 1003 |
| 2731 | 2776 |
| 2732 | 3460 |
| 2733 | 1406 |
| 2734 | 2976 |
| 2735 | 3163 |
| 2736 | 1846 |
| 2737 | 2839 |
| 2738 | 1875 |
| 2739 | 2415 |
| 2740 | 3656 |
| 2741 | 1754 |
| 2742 | 2949 |
| 2743 | 3841 |
| 2744 | 1522 |
| 2745 | 2678 |
| 2746 | 3270 |
| 2747 | 1904 |
| 2748 | 2733 |
| 2749 | 3244 |
| 2750 | 990 |
| 2751 | 2892 |
| 2752 | 3192 |
| 2753 | 1766 |
| 2754 | 2681 |
| 2755 | 3273 |
| 2756 | 1469 |
| 2757 | 2759 |
| 2758 | 3408 |
| 2759 | 1495 |
| 2760 | 2301 |
| 2761 | 3134 |
| 2762 | 1659 |
| 2763 | 2739 |
| 2764 | 3354 |
| 2765 | 1956 |
| 2766 | 2872 |
| 2767 | 3215 |
| 2768 | 1711 |
| 2769 | 2950 |
| 2770 | 3175 |
| 2771 | 1927 |
| 2772 | 2734 |
| 2773 | 1005 |
| 2774 | 2788 |
| 2775 | 3250 |
| 2776 | 1849 |
| 2777 | 2898 |
| 2778 | 3366 |
| 2779 | 1524 |
| 2780 | 2423 |
| 2781 | 3165 |
| 2782 | 1870 |
| 2783 | 2492 |
| 2784 | 3716 |
| 2785 | 1769 |
| 2786 | 2518 |
| 2787 | 3274 |
| 2788 | 1850 |
| 2789 | 2531 |
| 2790 | 3664 |
| 2791 | 1756 |
| 2792 | 2463 |
| 2793 | 3395 |
| 2794 | 1470 |
| 2795 | 2533 |
| 2796 | 3464 |
| 2797 | 959 |
| 2798 | 2953 |

TABLE Q2-continued with a sequence length of 4096:

| Reliability or reliability sequence number | Polarized channel sequence number |
|---|---|
| 2799 | 3369 |
| 2800 | 1986 |
| 2801 | 2843 |
| 2802 | 3842 |
| 2803 | 1960 |
| 2804 | 2521 |
| 2805 | 3179 |
| 2806 | 1499 |
| 2807 | 2682 |
| 2808 | 3252 |
| 2809 | 1877 |
| 2810 | 2792 |
| 2811 | 3223 |
| 2812 | 1891 |
| 2813 | 2900 |
| 2814 | 3281 |
| 2815 | 3008 |
| 2816 | 1661 |
| 2817 | 3356 |
| 2818 | 2913 |
| 2819 | 1931 |
| 2820 | 3720 |
| 2821 | 2741 |
| 2822 | 1011 |
| 2823 | 3166 |
| 2824 | 2845 |
| 2825 | 1511 |
| 2826 | 3276 |
| 2827 | 2954 |
| 2828 | 1719 |
| 2829 | 3370 |
| 2830 | 2763 |
| 2831 | 1770 |
| 2832 | 3472 |
| 2833 | 2855 |
| 2834 | 1852 |
| 2835 | 3680 |
| 2836 | 2522 |
| 2837 | 1777 |
| 2838 | 3424 |
| 2839 | 2684 |
| 2840 | 1878 |
| 2841 | 3397 |
| 2842 | 2742 |
| 2843 | 1881 |
| 2844 | 3605 |
| 2845 | 2302 |
| 2846 | 1013 |
| 2847 | 3227 |
| 2848 | 2765 |
| 2849 | 1528 |
| 2850 | 3282 |
| 2851 | 2623 |
| 2852 | 3377 |
| 2853 | 1823 |
| 2854 | 2961 |
| 2855 | 3619 |
| 2856 | 1279 |
| 2857 | 2846 |
| 2858 | 3372 |
| 2859 | 1988 |
| 2860 | 2859 |
| 2861 | 3181 |
| 2862 | 1933 |
| 2863 | 2427 |
| 2864 | 3256 |
| 2865 | 1743 |
| 2866 | 2745 |
| 2867 | 3606 |
| 2868 | 1501 |
| 2869 | 2479 |
| 2870 | 2655 |
| 2871 | 2537 |
| 2872 | 1939 |
| 2873 | 3609 |

TABLE Q2-continued

| with a sequence length of 4096: | |
|---|---|
| Reliability or reliability sequence number | Polarized channel sequence number |
| 2874 | 2914 |
| 2875 | 895 |
| 2876 | 3187 |
| 2877 | 2771 |
| 2878 | 1662 |
| 2879 | 3239 |
| 2880 | 2534 |
| 2881 | 1772 |
| 2882 | 3297 |
| 2883 | 2956 |
| 2884 | 1968 |
| 2885 | 3398 |
| 2886 | 2766 |
| 2887 | 3378 |
| 2888 | 1893 |
| 2889 | 2861 |
| 2890 | 3844 |
| 2891 | 1515 |
| 2892 | 2524 |
| 2893 | 3229 |
| 2894 | 1723 |
| 2895 | 2904 |
| 2896 | 3728 |
| 2897 | 1778 |
| 2898 | 2887 |
| 2899 | 3401 |
| 2900 | 1882 |
| 2901 | 2773 |
| 2902 | 3182 |
| 2903 | 2746 |
| 2904 | 1006 |
| 2905 | 3189 |
| 2906 | 2962 |
| 2907 | 1502 |
| 2908 | 3284 |
| 2909 | 2800 |
| 2910 | 1992 |
| 2911 | 3243 |
| 2912 | 2916 |
| 2913 | 3848 |
| 2914 | 1407 |
| 2915 | 2867 |
| 2916 | 3402 |
| 2917 | 1934 |
| 2918 | 2862 |
| 2919 | 3298 |
| 2920 | 1839 |
| 2921 | 2487 |
| 2922 | 3621 |
| 2923 | 2000 |
| 2924 | 2977 |
| 2925 | 3610 |
| 2926 | 2538 |
| 2927 | 1894 |
| 2928 | 3459 |
| 2929 | 2671 |
| 2930 | 1941 |
| 2931 | 3380 |
| 2932 | 2719 |
| 2933 | 1014 |
| 2934 | 3288 |
| 2935 | 2787 |
| 2936 | 3488 |
| 2937 | 1751 |
| 2938 | 2964 |
| 2939 | 3343 |
| 2940 | 1517 |
| 2941 | 2511 |
| 2942 | 3351 |
| 2943 | 2891 |
| 2944 | 1897 |
| 2945 | 3230 |
| 2946 | 2429 |
| 2947 | 1725 |
| 2948 | 3409 |

TABLE Q2-continued

| with a sequence length of 4096: | |
|---|---|
| Reliability or reliability sequence number | Polarized channel sequence number |
| 2949 | 2545 |
| 2950 | 1955 |
| 2951 | 3622 |
| 2952 | 2978 |
| 2953 | 3744 |
| 2954 | 1780 |
| 2955 | 2869 |
| 2956 | 3190 |
| 2957 | 1884 |
| 2958 | 2774 |
| 2959 | 3404 |
| 2960 | 1523 |
| 2961 | 3651 |
| 2962 | 3009 |
| 2963 | 3612 |
| 2964 | 1755 |
| 2965 | 2920 |
| 2966 | 3461 |
| 2967 | 1017 |
| 2968 | 2540 |
| 2969 | 3245 |
| 2970 | 2679 |
| 2971 | 1847 |
| 2972 | 3193 |
| 2973 | 2777 |
| 2974 | 1946 |
| 2975 | 3625 |
| 2976 | 2748 |
| 2977 | 3271 |
| 2978 | 1898 |
| 2979 | 2491 |
| 2980 | 3856 |
| 2981 | 1942 |
| 2982 | 2789 |
| 2983 | 3251 |
| 2984 | 2893 |
| 2985 | 1526 |
| 2986 | 3300 |
| 2987 | 2968 |
| 2988 | 1957 |
| 2989 | 3410 |
| 2990 | 2430 |
| 2991 | 3384 |
| 2992 | 1767 |
| 2993 | 2870 |
| 2994 | 3776 |
| 2995 | 1784 |
| 2996 | 3462 |
| 2997 | 2899 |
| 2998 | 3246 |
| 2999 | 1905 |
| 3000 | 2778 |
| 3001 | 3626 |
| 3002 | 1018 |
| 3003 | 2546 |
| 3004 | 3653 |
| 3005 | 2928 |
| 3006 | 1518 |
| 3007 | 3465 |
| 3008 | 2790 |
| 3009 | 1726 |
| 3010 | 3355 |
| 3011 | 2493 |
| 3012 | 3194 |
| 3013 | 1945 |
| 3014 | 2519 |
| 3015 | 3520 |
| 3016 | 1525 |
| 3017 | 3425 |
| 3018 | 2683 |
| 3019 | 3633 |
| 3020 | 1900 |
| 3021 | 2980 |
| 3022 | 3275 |
| 3023 | 2735 |

TABLE Q2-continued with a sequence length of 4096:

| Reliability or reliability sequence number | Polarized channel sequence number |
|---|---|
| 3024 | 1871 |
| 3025 | 3135 |
| 3026 | 2951 |
| 3027 | 2016 |
| 3028 | 3412 |
| 3029 | 2873 |
| 3030 | 3466 |
| 3031 | 1471 |
| 3032 | 2548 |
| 3033 | 3599 |
| 3034 | 1757 |
| 3035 | 3654 |
| 3036 | 2894 |
| 3037 | 3628 |
| 3038 | 1851 |
| 3039 | 2793 |
| 3040 | 3253 |
| 3041 | 2874 |
| 3042 | 991 |
| 3043 | 3367 |
| 3044 | 2780 |
| 3045 | 1958 |
| 3046 | 3357 |
| 3047 | 2494 |
| 3048 | 3304 |
| 3049 | 1906 |
| 3050 | 3196 |
| 3051 | 3010 |
| 3052 | 3277 |
| 3053 | 1961 |
| 3054 | 2984 |
| 3055 | 3254 |
| 3056 | 2523 |
| 3057 | 1987 |
| 3058 | 3715 |
| 3059 | 2901 |
| 3060 | 1771 |
| 3061 | 3634 |
| 3062 | 2915 |
| 3063 | 3358 |
| 3064 | 1529 |
| 3065 | 3657 |
| 3066 | 2685 |
| 3067 | 3371 |
| 3068 | 1879 |
| 3069 | 2955 |
| 3070 | 3426 |
| 3071 | 2535 |
| 3072 | 1948 |
| 3073 | 3283 |
| 3074 | 2743 |
| 3075 | 1758 |
| 3076 | 3473 |
| 3077 | 3257 |
| 3078 | 2794 |
| 3079 | 1853 |
| 3080 | 3468 |
| 3081 | 2876 |
| 3082 | 3416 |
| 3083 | 1020 |
| 3084 | 2801 |
| 3085 | 3658 |
| 3086 | 2902 |
| 3087 | 1989 |
| 3088 | 3717 |
| 3089 | 3665 |
| 3090 | 1962 |
| 3091 | 2905 |
| 3092 | 3607 |
| 3093 | 2552 |
| 3094 | 1908 |
| 3095 | 3312 |
| 3096 | 2847 |
| 3097 | 3278 |
| 3098 | 1530 |

TABLE Q2-continued with a sequence length of 4096:

| Reliability or reliability sequence number | Polarized channel sequence number |
|---|---|
| 3099 | 3167 |
| 3100 | 2303 |
| 3101 | 3399 |
| 3102 | 1773 |
| 3103 | 3012 |
| 3104 | 3636 |
| 3105 | 2957 |
| 3106 | 1969 |
| 3107 | 3872 |
| 3108 | 2767 |
| 3109 | 3474 |
| 3110 | 1990 |
| 3111 | 3428 |
| 3112 | 2525 |
| 3113 | 3379 |
| 3114 | 1779 |
| 3115 | 2963 |
| 3116 | 3373 |
| 3117 | 2686 |
| 3118 | 1883 |
| 3119 | 3489 |
| 3120 | 3285 |
| 3121 | 2796 |
| 3122 | 1964 |
| 3123 | 3640 |
| 3124 | 2992 |
| 3125 | 3904 |
| 3126 | 1854 |
| 3127 | 2917 |
| 3128 | 3660 |
| 3129 | 3258 |
| 3130 | 1935 |
| 3131 | 2539 |
| 3132 | 3718 |
| 3133 | 2747 |
| 3134 | 1007 |
| 3135 | 3476 |
| 3136 | 3299 |
| 3137 | 2802 |
| 3138 | 1895 |
| 3139 | 3968 |
| 3140 | 2906 |
| 3141 | 3666 |
| 3142 | 1663 |
| 3143 | 2526 |
| 3144 | 3490 |
| 3145 | 3374 |
| 3146 | 1912 |
| 3147 | 3016 |
| 3148 | 3721 |
| 3149 | 2431 |
| 3150 | 1503 |
| 3151 | 3843 |
| 3152 | 2958 |
| 3153 | 3432 |
| 3154 | 1970 |
| 3155 | 3611 |
| 3156 | 2863 |
| 3157 | 3183 |
| 3158 | 1774 |
| 3159 | 3024 |
| 3160 | 3403 |
| 3161 | 3286 |
| 3162 | 1993 |
| 3163 | 2918 |
| 3164 | 3381 |
| 3165 | 2965 |
| 3166 | 1532 |
| 3167 | 3260 |
| 3168 | 3521 |
| 3169 | 2775 |
| 3170 | 1885 |
| 3171 | 3289 |
| 3172 | 2541 |
| 3173 | 3480 |

TABLE Q2-continued

| with a sequence length of 4096: | |
|---|---|
| Reliability or reliability sequence number | Polarized channel sequence number |
| 3174 | 1781 |
| 3175 | 2921 |
| 3176 | 3681 |
| 3177 | 3668 |
| 3178 | 1994 |
| 3179 | 2749 |
| 3180 | 3623 |
| 3181 | 2979 |
| 3182 | 3722 |
| 3183 | 1943 |
| 3184 | 3301 |
| 3185 | 2804 |
| 3186 | 3231 |
| 3187 | 1015 |
| 3188 | 2908 |
| 3189 | 3492 |
| 3190 | 3382 |
| 3191 | 1899 |
| 3192 | 2547 |
| 3193 | 3613 |
| 3194 | 2779 |
| 3195 | 1886 |
| 3196 | 3845 |
| 3197 | 3682 |
| 3198 | 2871 |
| 3199 | 3729 |
| 3200 | 1782 |
| 3201 | 2970 |
| 3202 | 3405 |
| 3203 | 3191 |
| 3204 | 1972 |
| 3205 | 2922 |
| 3206 | 3672 |
| 3207 | 2966 |
| 3208 | 2001 |
| 3209 | 3411 |
| 3210 | 3290 |
| 3211 | 2550 |
| 3212 | 1947 |
| 3213 | 3440 |
| 3214 | 2981 |
| 3215 | 3724 |
| 3216 | 3302 |
| 3217 | 1996 |
| 3218 | 2791 |
| 3219 | 3463 |
| 3220 | 3385 |
| 3221 | 1785 |
| 3222 | 2808 |
| 3223 | 3522 |
| 3224 | 2929 |
| 3225 | 1901 |
| 3226 | 3614 |
| 3227 | 3406 |
| 3228 | 2542 |
| 3229 | 3305 |
| 3230 | 1976 |
| 3231 | 2750 |
| 3232 | 3627 |
| 3233 | 3846 |
| 3234 | 1519 |
| 3235 | 2969 |
| 3236 | 3247 |
| 3237 | 2549 |
| 3238 | 3195 |
| 3239 | 1727 |
| 3240 | 3730 |
| 3241 | 2924 |
| 3242 | 3684 |
| 3243 | 1959 |
| 3244 | 3413 |
| 3245 | 2895 |
| 3246 | 3849 |
| 3247 | 3040 |
| 3248 | 2002 |

TABLE Q2-continued

| with a sequence length of 4096: | |
|---|---|
| Reliability or reliability sequence number | Polarized channel sequence number |
| 3249 | 3292 |
| 3250 | 3386 |
| 3251 | 2495 |
| 3252 | 1019 |
| 3253 | 3496 |
| 3254 | 3467 |
| 3255 | 2781 |
| 3256 | 3745 |
| 3257 | 1907 |
| 3258 | 2875 |
| 3259 | 3655 |
| 3260 | 3427 |
| 3261 | 1786 |
| 3262 | 2982 |
| 3263 | 3359 |
| 3264 | 3255 |
| 3265 | 2930 |
| 3266 | 1527 |
| 3267 | 3306 |
| 3268 | 2985 |
| 3269 | 3197 |
| 3270 | 1949 |
| 3271 | 3629 |
| 3272 | 3011 |
| 3273 | 3732 |
| 3274 | 3688 |
| 3275 | 1902 |
| 3276 | 2795 |
| 3277 | 3414 |
| 3278 | 2553 |
| 3279 | 3388 |
| 3280 | 1759 |
| 3281 | 3313 |
| 3282 | 2903 |
| 3283 | 3850 |
| 3284 | 2017 |
| 3285 | 3635 |
| 3286 | 2972 |
| 3287 | 3417 |
| 3288 | 2782 |
| 3289 | 1909 |
| 3290 | 3524 |
| 3291 | 3469 |
| 3292 | 2877 |
| 3293 | 3475 |
| 3294 | 1963 |
| 3295 | 3279 |
| 3296 | 3013 |
| 3297 | 3746 |
| 3298 | 2018 |
| 3299 | 3630 |
| 3300 | 2986 |
| 3301 | 3857 |
| 3302 | 3504 |
| 3303 | 2004 |
| 3304 | 2932 |
| 3305 | 3429 |
| 3306 | 2554 |
| 3307 | 3259 |
| 3308 | 1950 |
| 3309 | 3308 |
| 3310 | 2797 |
| 3311 | 3736 |
| 3312 | 3696 |
| 3313 | 1788 |
| 3314 | 2993 |
| 3315 | 3659 |
| 3316 | 3852 |
| 3317 | 3014 |
| 3318 | 1965 |
| 3319 | 3777 |
| 3320 | 3198 |
| 3321 | 2803 |
| 3322 | 3314 |
| 3323 | 1991 |

TABLE Q2-continued

| with a sequence length of 4096: | |
|---|---|
| Reliability or reliability sequence number | Polarized channel sequence number |
| 3324 | 2907 |
| 3325 | 3637 |
| 3326 | 3470 |
| 3327 | 2988 |
| 3328 | 1021 |
| 3329 | 3418 |
| 3330 | 3528 |
| 3331 | 2878 |
| 3332 | 1910 |
| 3333 | 3430 |
| 3334 | 3477 |
| 3335 | 2959 |
| 3336 | 3375 |
| 3337 | 1855 |
| 3338 | 3641 |
| 3339 | 2919 |
| 3340 | 3316 |
| 3341 | 3667 |
| 3342 | 1971 |
| 3343 | 2687 |
| 3344 | 3261 |
| 3345 | 3638 |
| 3346 | 2936 |
| 3347 | 1531 |
| 3348 | 3748 |
| 3349 | 3433 |
| 3350 | 2527 |
| 3351 | 3778 |
| 3352 | 1913 |
| 3353 | 3661 |
| 3354 | 2994 |
| 3355 | 3287 |
| 3356 | 2798 |
| 3357 | 3858 |
| 3358 | 2008 |
| 3359 | 3719 |
| 3360 | 3017 |
| 3361 | 3420 |
| 3362 | 3491 |
| 3363 | 1775 |
| 3364 | 2556 |
| 3365 | 3478 |
| 3366 | 3536 |
| 3367 | 2909 |
| 3368 | 1966 |
| 3369 | 3752 |
| 3370 | 3873 |
| 3371 | 2805 |
| 3372 | 3434 |
| 3373 | 2020 |
| 3374 | 3662 |
| 3375 | 3018 |
| 3376 | 3481 |
| 3377 | 3642 |
| 3378 | 1995 |
| 3379 | 2967 |
| 3380 | 3860 |
| 3381 | 3669 |
| 3382 | 3644 |
| 3383 | 2923 |
| 3384 | 1914 |
| 3385 | 3291 |
| 3386 | 3383 |
| 3387 | 2910 |
| 3388 | 3780 |
| 3389 | 1533 |
| 3390 | 3670 |
| 3391 | 2806 |
| 3392 | 3673 |
| 3393 | 3723 |
| 3394 | 1973 |
| 3395 | 2996 |
| 3396 | 3493 |
| 3397 | 3864 |
| 3398 | 3025 |

TABLE Q2-continued

| with a sequence length of 4096: | |
|---|---|
| Reliability or reliability sequence number | Polarized channel sequence number |
| 3399 | 3874 |
| 3400 | 1997 |
| 3401 | 3683 |
| 3402 | 2971 |
| 3403 | 3674 |
| 3404 | 3482 |
| 3405 | 2024 |
| 3406 | 3020 |
| 3407 | 3303 |
| 3408 | 3760 |
| 3409 | 2809 |
| 3410 | 1916 |
| 3411 | 3725 |
| 3412 | 3320 |
| 3413 | 2925 |
| 3414 | 3441 |
| 3415 | 3262 |
| 3416 | 1974 |
| 3417 | 3436 |
| 3418 | 3000 |
| 3419 | 3726 |
| 3420 | 3731 |
| 3421 | 1887 |
| 3422 | 2543 |
| 3423 | 3407 |
| 3424 | 3552 |
| 3425 | 2751 |
| 3426 | 3387 |
| 3427 | 1783 |
| 3428 | 3293 |
| 3429 | 2983 |
| 3430 | 3442 |
| 3431 | 3685 |
| 3432 | 3026 |
| 3433 | 1022 |
| 3434 | 3494 |
| 3435 | 3497 |
| 3436 | 3523 |
| 3437 | 2931 |
| 3438 | 2032 |
| 3439 | 3686 |
| 3440 | 3615 |
| 3441 | 2810 |
| 3442 | 3307 |
| 3443 | 3484 |
| 3444 | 1534 |
| 3445 | 2551 |
| 3446 | 3415 |
| 3447 | 3444 |
| 3448 | 2973 |
| 3449 | 3847 |
| 3450 | 2003 |
| 3451 | 3389 |
| 3452 | 3294 |
| 3453 | 2926 |
| 3454 | 3498 |
| 3455 | 3525 |
| 3456 | 1977 |
| 3457 | 2783 |
| 3458 | 3309 |
| 3459 | 3631 |
| 3460 | 3905 |
| 3461 | 1787 |
| 3462 | 3041 |
| 3463 | 3876 |
| 3464 | 3784 |
| 3465 | 2933 |
| 3466 | 3906 |
| 3467 | 1998 |
| 3468 | 3733 |
| 3469 | 2987 |
| 3470 | 3880 |
| 3471 | 3851 |
| 3472 | 3689 |
| 3473 | 1978 |

TABLE Q2-continued

| with a sequence length of 4096: | |
|---|---|
| Reliability or reliability sequence number | Polarized channel sequence number |
| 3474 | 3042 |
| 3475 | 3676 |
| 3476 | 3505 |
| 3477 | 3028 |
| 3478 | 3792 |
| 3479 | 1903 |
| 3480 | 3888 |
| 3481 | 3908 |
| 3482 | 2974 |
| 3483 | 3419 |
| 3484 | 3969 |
| 3485 | 2005 |
| 3486 | 2812 |
| 3487 | 3315 |
| 3488 | 3734 |
| 3489 | 3526 |
| 3490 | 2989 |
| 3491 | 2006 |
| 3492 | 3390 |
| 3493 | 3747 |
| 3494 | 3015 |
| 3495 | 3690 |
| 3496 | 3970 |
| 3497 | 1951 |
| 3498 | 3853 |
| 3499 | 2934 |
| 3500 | 3448 |
| 3501 | 3500 |
| 3502 | 2879 |
| 3503 | 3737 |
| 3504 | 2019 |
| 3505 | 3808 |
| 3506 | 3639 |
| 3507 | 2995 |
| 3508 | 3912 |
| 3509 | 3697 |
| 3510 | 1789 |
| 3511 | 2555 |
| 3512 | 3310 |
| 3513 | 3431 |
| 3514 | 3529 |
| 3515 | 2937 |
| 3516 | 1980 |
| 3517 | 3471 |
| 3518 | 3859 |
| 3519 | 3663 |
| 3520 | 3032 |
| 3521 | 3750 |
| 3522 | 3506 |
| 3523 | 1911 |
| 3524 | 2799 |
| 3525 | 3749 |
| 3526 | 3421 |
| 3527 | 3317 |
| 3528 | 2990 |
| 3529 | 2009 |
| 3530 | 3530 |
| 3531 | 3738 |
| 3532 | 3692 |
| 3533 | 3044 |
| 3534 | 3435 |
| 3535 | 3199 |
| 3536 | 2021 |
| 3537 | 3263 |
| 3538 | 3019 |
| 3539 | 3854 |
| 3540 | 3479 |
| 3541 | 2938 |
| 3542 | 2010 |
| 3543 | 3508 |
| 3544 | 3698 |
| 3545 | 3643 |
| 3546 | 2557 |
| 3547 | 3537 |
| 3548 | 3753 |

TABLE Q2-continued

| with a sequence length of 4096: | |
|---|---|
| Reliability or reliability sequence number | Polarized channel sequence number |
| 3549 | 1967 |
| 3550 | 3318 |
| 3551 | 2997 |
| 3552 | 3779 |
| 3553 | 3422 |
| 3554 | 3671 |
| 3555 | 3021 |
| 3556 | 1915 |
| 3557 | 3740 |
| 3558 | 3862 |
| 3559 | 3532 |
| 3560 | 3048 |
| 3561 | 3321 |
| 3562 | 3754 |
| 3563 | 2022 |
| 3564 | 3645 |
| 3565 | 2940 |
| 3566 | 3483 |
| 3567 | 3875 |
| 3568 | 3861 |
| 3569 | 1790 |
| 3570 | 2998 |
| 3571 | 3781 |
| 3572 | 3437 |
| 3573 | 3512 |
| 3574 | 2911 |
| 3575 | 3700 |
| 3576 | 1535 |
| 3577 | 3761 |
| 3578 | 3446 |
| 3579 | 2807 |
| 3580 | 3495 |
| 3581 | 3538 |
| 3582 | 3865 |
| 3583 | 3056 |
| 3584 | 1023 |
| 3585 | 3322 |
| 3586 | 3443 |
| 3587 | 3553 |
| 3588 | 2558 |
| 3589 | 3646 |
| 3590 | 3485 |
| 3591 | 2012 |
| 3592 | 3675 |
| 3593 | 3027 |
| 3594 | 3438 |
| 3595 | 3540 |
| 3596 | 3727 |
| 3597 | 3001 |
| 3598 | 2025 |
| 3599 | 3972 |
| 3600 | 3877 |
| 3601 | 3687 |
| 3602 | 2811 |
| 3603 | 3756 |
| 3604 | 3782 |
| 3605 | 1975 |
| 3606 | 3501 |
| 3607 | 3022 |
| 3608 | 3866 |
| 3609 | 3324 |
| 3610 | 3445 |
| 3611 | 3677 |
| 3612 | 3002 |
| 3613 | 2026 |
| 3614 | 3920 |
| 3615 | 3762 |
| 3616 | 3785 |
| 3617 | 2927 |
| 3618 | 3704 |
| 3619 | 3554 |
| 3620 | 1917 |
| 3621 | 3878 |
| 3622 | 3029 |
| 3623 | 3499 |

TABLE Q2-continued with a sequence length of 4096:

| Reliability or reliability sequence number | Polarized channel sequence number |
|---|---|
| 3624 | 3976 |
| 3625 | 3486 |
| 3626 | 3030 |
| 3627 | 3295 |
| 3628 | 1999 |
| 3629 | 3735 |
| 3630 | 3764 |
| 3631 | 3907 |
| 3632 | 2975 |
| 3633 | 3691 |
| 3634 | 3544 |
| 3635 | 3527 |
| 3636 | 1918 |
| 3637 | 3043 |
| 3638 | 3868 |
| 3639 | 3881 |
| 3640 | 3786 |
| 3641 | 3793 |
| 3642 | 2813 |
| 3643 | 3909 |
| 3644 | 2033 |
| 3645 | 3788 |
| 3646 | 3936 |
| 3647 | 3004 |
| 3648 | 3882 |
| 3649 | 3678 |
| 3650 | 3984 |
| 3651 | 3794 |
| 3652 | 1979 |
| 3653 | 2935 |
| 3654 | 3768 |
| 3655 | 3449 |
| 3656 | 3507 |
| 3657 | 3889 |
| 3658 | 3033 |
| 3659 | 3391 |
| 3660 | 2028 |
| 3661 | 3693 |
| 3662 | 3884 |
| 3663 | 3045 |
| 3664 | 3556 |
| 3665 | 3502 |
| 3666 | 3910 |
| 3667 | 3739 |
| 3668 | 2034 |
| 3669 | 3034 |
| 3670 | 3560 |
| 3671 | 3311 |
| 3672 | 3450 |
| 3673 | 3531 |
| 3674 | 2991 |
| 3675 | 3694 |
| 3676 | 1981 |
| 3677 | 3699 |
| 3678 | 3509 |
| 3679 | 3452 |
| 3680 | 2939 |
| 3681 | 3890 |
| 3682 | 3533 |
| 3683 | 3568 |
| 3684 | 3741 |
| 3685 | 2007 |
| 3686 | 3046 |
| 3687 | 3751 |
| 3688 | 3796 |
| 3689 | 3913 |
| 3690 | 2814 |
| 3691 | 3701 |
| 3692 | 3423 |
| 3693 | 3539 |
| 3694 | 1982 |
| 3695 | 3510 |
| 3696 | 2559 |
| 3697 | 3809 |
| 3698 | 3323 |

TABLE Q2-continued with a sequence length of 4096:

| Reliability or reliability sequence number | Polarized channel sequence number |
|---|---|
| 3699 | 3534 |
| 3700 | 3514 |
| 3701 | 3513 |
| 3702 | 2011 |
| 3703 | 3036 |
| 3704 | 3541 |
| 3705 | 3319 |
| 3706 | 3755 |
| 3707 | 3914 |
| 3708 | 3049 |
| 3709 | 3810 |
| 3710 | 3971 |
| 3711 | 3742 |
| 3712 | 2036 |
| 3713 | 3855 |
| 3714 | 2999 |
| 3715 | 3921 |
| 3716 | 3892 |
| 3717 | 3800 |
| 3718 | 4000 |
| 3719 | 3050 |
| 3720 | 3863 |
| 3721 | 2023 |
| 3722 | 3439 |
| 3723 | 3973 |
| 3724 | 3702 |
| 3725 | 3757 |
| 3726 | 2941 |
| 3727 | 3916 |
| 3728 | 3705 |
| 3729 | 3783 |
| 3730 | 2040 |
| 3731 | 3325 |
| 3732 | 3023 |
| 3733 | 3763 |
| 3734 | 3896 |
| 3735 | 3974 |
| 3736 | 3758 |
| 3737 | 2942 |
| 3738 | 3812 |
| 3739 | 3922 |
| 3740 | 1791 |
| 3741 | 3447 |
| 3742 | 3516 |
| 3743 | 3542 |
| 3744 | 3057 |
| 3745 | 3555 |
| 3746 | 3487 |
| 3747 | 3557 |
| 3748 | 3977 |
| 3749 | 3867 |
| 3750 | 2013 |
| 3751 | 3003 |
| 3752 | 3545 |
| 3753 | 3706 |
| 3754 | 3816 |
| 3755 | 3924 |
| 3756 | 4032 |
| 3757 | 3052 |
| 3758 | 3937 |
| 3759 | 3765 |
| 3760 | 2027 |
| 3761 | 3869 |
| 3762 | 3978 |
| 3763 | 3058 |
| 3764 | 3787 |
| 3765 | 3879 |
| 3766 | 3546 |
| 3767 | 3708 |
| 3768 | 3766 |
| 3769 | 3005 |
| 3770 | 2014 |
| 3771 | 3326 |
| 3772 | 3789 |
| 3773 | 3647 |

TABLE Q2-continued

| with a sequence length of 4096: | |
|---|---|
| Reliability or reliability sequence number | Polarized channel sequence number |
| 3774 | 3985 |
| 3775 | 3870 |
| 3776 | 3031 |
| 3777 | 3883 |
| 3778 | 3451 |
| 3779 | 3769 |
| 3780 | 3503 |
| 3781 | 2029 |
| 3782 | 3679 |
| 3783 | 3561 |
| 3784 | 3006 |
| 3785 | 3938 |
| 3786 | 3795 |
| 3787 | 3558 |
| 3788 | 3980 |
| 3789 | 3790 |
| 3790 | 3035 |
| 3791 | 3885 |
| 3792 | 1983 |
| 3793 | 3548 |
| 3794 | 3928 |
| 3795 | 3911 |
| 3796 | 3797 |
| 3797 | 3060 |
| 3798 | 3770 |
| 3799 | 3986 |
| 3800 | 3824 |
| 3801 | 3940 |
| 3802 | 3891 |
| 3803 | 2035 |
| 3804 | 3886 |
| 3805 | 3047 |
| 3806 | 3511 |
| 3807 | 4001 |
| 3808 | 3562 |
| 3809 | 3695 |
| 3810 | 3743 |
| 3811 | 3811 |
| 3812 | 3064 |
| 3813 | 3988 |
| 3814 | 3535 |
| 3815 | 2037 |
| 3816 | 3915 |
| 3817 | 3453 |
| 3818 | 3569 |
| 3819 | 2815 |
| 3820 | 4002 |
| 3821 | 3893 |
| 3822 | 3798 |
| 3823 | 4033 |
| 3824 | 3944 |
| 3825 | 3564 |
| 3826 | 3703 |
| 3827 | 1919 |
| 3828 | 3037 |
| 3829 | 3801 |
| 3830 | 3772 |
| 3831 | 3515 |
| 3832 | 3813 |
| 3833 | 3917 |
| 3834 | 3992 |
| 3835 | 3051 |
| 3836 | 3454 |
| 3837 | 3894 |
| 3838 | 3923 |
| 3839 | 3802 |
| 3840 | 2030 |
| 3841 | 3570 |
| 3842 | 3952 |
| 3843 | 3038 |
| 3844 | 3814 |
| 3845 | 3517 |
| 3846 | 3543 |
| 3847 | 3707 |
| 3848 | 4004 |

TABLE Q2-continued

| with a sequence length of 4096: | |
|---|---|
| Reliability or reliability sequence number | Polarized channel sequence number |
| 3849 | 3759 |
| 3850 | 3975 |
| 3851 | 3053 |
| 3852 | 3897 |
| 3853 | 2038 |
| 3854 | 3572 |
| 3855 | 3918 |
| 3856 | 3817 |
| 3857 | 3898 |
| 3858 | 3804 |
| 3859 | 3518 |
| 3860 | 3007 |
| 3861 | 4034 |
| 3862 | 4008 |
| 3863 | 3547 |
| 3864 | 3925 |
| 3865 | 3939 |
| 3866 | 2041 |
| 3867 | 3709 |
| 3868 | 3979 |
| 3869 | 3059 |
| 3870 | 3559 |
| 3871 | 3767 |
| 3872 | 3818 |
| 3873 | 3900 |
| 3874 | 3825 |
| 3875 | 3926 |
| 3876 | 3929 |
| 3877 | 3061 |
| 3878 | 3576 |
| 3879 | 3871 |
| 3880 | 3327 |
| 3881 | 2042 |
| 3882 | 4036 |
| 3883 | 3981 |
| 3884 | 3791 |
| 3885 | 3549 |
| 3886 | 3987 |
| 3887 | 2943 |
| 3888 | 3710 |
| 3889 | 3820 |
| 3890 | 4016 |
| 3891 | 3941 |
| 3892 | 3563 |
| 3893 | 3771 |
| 3894 | 3826 |
| 3895 | 3930 |
| 3896 | 2015 |
| 3897 | 3054 |
| 3898 | 3550 |
| 3899 | 4040 |
| 3900 | 3455 |
| 3901 | 3982 |
| 3902 | 3887 |
| 3903 | 4048 |
| 3904 | 3942 |
| 3905 | 3989 |
| 3906 | 3062 |
| 3907 | 3799 |
| 3908 | 3565 |
| 3909 | 3945 |
| 3910 | 3773 |
| 3911 | 4003 |
| 3912 | 2044 |
| 3913 | 3828 |
| 3914 | 3932 |
| 3915 | 3571 |
| 3916 | 3803 |
| 3917 | 3065 |
| 3918 | 3895 |
| 3919 | 3994 |
| 3920 | 3946 |
| 3921 | 3990 |
| 3922 | 3574 |
| 3923 | 4005 |

TABLE Q2-continued with a sequence length of 4096:

| Reliability or reliability sequence number | Polarized channel sequence number |
|---|---|
| 3924 | 3815 |
| 3925 | 3832 |
| 3926 | 3953 |
| 3927 | 3066 |
| 3928 | 3566 |
| 3929 | 2031 |
| 3930 | 3774 |
| 3931 | 3993 |
| 3932 | 3573 |
| 3933 | 3948 |
| 3934 | 3919 |
| 3935 | 4064 |
| 3936 | 3519 |
| 3937 | 3805 |
| 3938 | 3899 |
| 3939 | 3039 |
| 3940 | 4006 |
| 3941 | 3954 |
| 3942 | 4009 |
| 3943 | 4035 |
| 3944 | 3819 |
| 3945 | 3577 |
| 3946 | 3927 |
| 3947 | 2039 |
| 3948 | 3996 |
| 3949 | 3806 |
| 3950 | 3901 |
| 3951 | 3068 |
| 3952 | 4037 |
| 3953 | 4010 |
| 3954 | 3956 |
| 3955 | 3578 |
| 3956 | 3821 |
| 3957 | 4017 |
| 3958 | 4038 |
| 3959 | 3827 |
| 3960 | 3931 |
| 3961 | 4012 |
| 3962 | 3902 |
| 3963 | 3983 |
| 3964 | 3055 |
| 3965 | 3943 |
| 3966 | 3711 |
| 3967 | 3960 |
| 3968 | 2043 |
| 3969 | 3551 |
| 3970 | 4018 |
| 3971 | 3822 |
| 3972 | 4041 |
| 3973 | 3580 |
| 3974 | 3933 |
| 3975 | 3829 |
| 3976 | 4042 |
| 3977 | 3991 |
| 3978 | 3063 |
| 3979 | 3947 |
| 3980 | 3934 |
| 3981 | 3830 |
| 3982 | 4020 |
| 3983 | 4049 |
| 3984 | 3995 |
| 3985 | 4044 |
| 3986 | 3833 |
| 3987 | 3949 |
| 3988 | 4024 |
| 3989 | 3567 |
| 3990 | 2045 |
| 3991 | 3775 |
| 3992 | 4007 |
| 3993 | 4050 |
| 3994 | 3067 |
| 3995 | 3955 |
| 3996 | 3834 |
| 3997 | 3575 |
| 3998 | 3997 |

TABLE Q2-continued with a sequence length of 4096:

| Reliability or reliability sequence number | Polarized channel sequence number |
|---|---|
| 3999 | 3950 |
| 4000 | 3807 |
| 4001 | 4065 |
| 4002 | 3957 |
| 4003 | 4011 |
| 4004 | 4066 |
| 4005 | 4052 |
| 4006 | 3998 |
| 4007 | 3836 |
| 4008 | 4013 |
| 4009 | 4039 |
| 4010 | 3069 |
| 4011 | 3958 |
| 4012 | 3903 |
| 4013 | 4019 |
| 4014 | 3579 |
| 4015 | 3961 |
| 4016 | 2046 |
| 4017 | 4056 |
| 4018 | 3823 |
| 4019 | 4014 |
| 4020 | 4068 |
| 4021 | 4043 |
| 4022 | 3962 |
| 4023 | 3581 |
| 4024 | 4021 |
| 4025 | 4045 |
| 4026 | 4072 |
| 4027 | 3964 |
| 4028 | 4022 |
| 4029 | 3935 |
| 4030 | 3831 |
| 4031 | 3070 |
| 4032 | 4080 |
| 4033 | 3582 |
| 4034 | 4051 |
| 4035 | 4025 |
| 4036 | 3835 |
| 4037 | 4046 |
| 4038 | 4026 |
| 4039 | 3951 |
| 4040 | 4053 |
| 4041 | 4054 |
| 4042 | 3999 |
| 4043 | 4067 |
| 4044 | 3837 |
| 4045 | 4028 |
| 4046 | 3959 |
| 4047 | 4057 |
| 4048 | 4069 |
| 4049 | 2047 |
| 4050 | 4058 |
| 4051 | 4015 |
| 4052 | 3963 |
| 4053 | 4070 |
| 4054 | 3838 |
| 4055 | 3583 |
| 4056 | 3071 |
| 4057 | 4060 |
| 4058 | 4073 |
| 4059 | 4023 |
| 4060 | 4074 |
| 4061 | 3965 |
| 4062 | 4047 |
| 4063 | 3966 |
| 4064 | 4081 |
| 4065 | 4027 |
| 4066 | 4076 |
| 4067 | 4082 |
| 4068 | 4029 |
| 4069 | 4055 |
| 4070 | 4030 |
| 4071 | 4059 |
| 4072 | 4084 |
| 4073 | 4071 |

TABLE Q2-continued

| with a sequence length of 4096: | |
|---|---|
| Reliability or reliability sequence number | Polarized channel sequence number |
| 4074 | 4088 |
| 4075 | 3839 |
| 4076 | 4061 |
| 4077 | 4075 |
| 4078 | 4062 |
| 4079 | 4077 |
| 4080 | 4031 |
| 4081 | 4083 |
| 4082 | 4085 |
| 4083 | 3967 |
| 4084 | 4078 |
| 4085 | 4086 |
| 4086 | 4089 |
| 4087 | 4090 |
| 4088 | 4063 |
| 4089 | 4092 |
| 4090 | 4079 |
| 4091 | 4087 |
| 4092 | 4091 |
| 4093 | 4093 |
| 4094 | 4094 |
| 4095 | 4095 |

Sequence Q3, with a sequence length of 2048:

[0, 1, 2, 4, 8, 16, 32, 3, 5, 64, 1024, 9, 6, 17, 10, 18, 128, 12, 33, 65, 20, 256, 34, 24, 36, 7, 129, 66, 512, 11, 40, 68, 130, 19, 13, 48, 14, 72, 257, 1025, 21, 132, 35, 258, 26, 513, 80, 37, 25, 22, 136, 260, 264, 38, 514, 96, 67, 41, 144, 28, 69, 42, 516, 49, 1026, 74, 272, 160, 520, 288, 528, 192, 544, 70, 44, 131, 81, 50, 73, 15, 320, 133, 52, 1028, 23, 134, 384, 76, 137, 82, 56, 27, 97, 39, 259, 8 4, 138, 145, 261, 1032, 29, 43, 98, 515, 88, 140, 30, 146, 71, 262, 265, 161, 576, 45, 1040, 100, 64 0, 51, 148, 46, 75, 266, 273, 517, 104, 162, 53, 193, 1056, 152, 77, 164, 768, 268, 274, 518, 54, 83, 57, 521, 1027, 112, 135, 78, 289, 194, 85, 276, 522, 58, 168, 1029, 139, 99, 86, 60, 280, 89, 290, 5 29, 524, 196, 1088, 141, 101, 147, 176, 142, 530, 321, 31, 200, 1033, 90, 545, 292, 322, 532, 263, 149, 102, 105, 1030, 304, 296, 163, 92, 47, 267, 385, 546, 324, 1041, 208, 386, 150, 153, 165, 10 6, 55, 1034, 328, 536, 577, 548, 113, 154, 79, 269, 1042, 108, 578, 224, 166, 519, 552, 195, 1152, 270, 641, 523, 275, 580, 291, 59, 1036, 169, 560, 114, 277, 156, 87, 197, 1057, 116, 170, 61, 531, 525, 642, 281, 1089, 278, 526, 177, 293, 388, 91, 1044, 584, 769, 198, 172, 120, 201, 336, 1280, 62, 282, 143, 103, 178, 294, 1058, 93, 644, 202, 592, 323, 1048, 392, 297, 770, 107, 180, 151, 10 60, 209, 284, 648, 94, 204, 298, 1031, 400, 608, 352, 325, 533, 1153, 155, 210, 305, 547, 300, 10 90, 109, 184, 534, 537, 115, 167, 1536, 225, 326, 306, 772, 157, 1035, 656, 329, 110, 117, 212, 1 064, 171, 776, 330, 226, 549, 1092, 538, 387, 308, 216, 1154, 416, 271, 279, 158, 337, 1043, 550, 672, 118, 332, 579, 1037, 540, 389, 173, 121, 1072, 553, 199, 784, 179, 1038, 228, 338, 312, 70 4, 390, 1096, 174, 554, 581, 393, 1281, 283, 122, 448, 353, 1045, 561, 203, 63, 340, 1156, 394, 5 27, 582, 556, 181, 1059, 295, 285, 232, 124, 1282, 205, 182, 643, 562, 1050, 286, 585, 299, 1537, 354, 211, 401, 185, 1104, 396, 344, 586, 645, 1061, 593, 535, 240, 206, 1049, 95, 327, 564, 104 6, 800, 402, 356, 307, 1160, 301, 417, 213, 568, 1284, 832, 588, 186, 1288, 646, 404, 227, 896, 1 062, 594, 418, 302, 1538, 649, 771, 360, 539, 1120, 111, 331, 214, 1091, 309, 188, 449, 1065, 21 7, 408, 609, 596, 1168, 551, 650, 229, 1052, 159, 420, 310, 1093, 541, 773, 610, 1066, 657, 333, 119, 1540, 600, 339, 218, 1073, 368, 652, 230, 1098, 391, 313, 450, 1296, 542, 334, 233, 1184, 5 55, 774, 175, 1544, 123, 658, 612, 1312, 341, 777, 220, 1552, 314, 424, 395, 1216, 673, 583, 355, 1568, 287, 183, 234, 1094, 125, 557, 660, 1068, 616, 342, 316, 1155, 241, 778, 1105, 563, 345, 452, 1074, 397, 403, 207, 1097, 674, 558, 1039, 785, 432, 357, 1344, 187, 236, 664, 1157, 624, 5 87, 1076, 780, 705, 126, 1047, 242, 565, 1158, 398, 346, 456, 1408, 358, 405, 1100, 303, 569, 24 4, 1161, 595, 189, 1106, 566, 676, 361, 1080, 706, 589, 1051, 215, 786, 647, 1121, 348, 419, 106 3, 406, 464, 680, 1283, 801, 362, 1108, 590, 409, 1162, 570, 788, 597, 1169, 572, 219, 1285, 311, 708, 1053, 598, 601, 1067, 651, 421, 792, 1122, 802, 611, 1539, 602, 410, 1112, 231, 688, 1164, 653, 248, 1054, 369, 190, 364, 1170, 654, 659, 1095, 335, 480, 1286, 315, 221, 1289, 370, 613, 1 185, 422, 425, 1600, 451, 614, 1069, 543, 235, 1124, 412, 343, 372, 1664, 775, 317, 1075, 222, 4 26, 1172, 453, 237, 1070, 559, 833, 1099, 804, 712, 1290, 834, 661, 1297, 808, 779, 1541, 617, 1 128, 604, 433, 1186, 720, 816, 1077, 836, 347, 1217, 897, 243, 1176, 662, 454, 1101, 318, 675, 1 188, 618, 898, 1792, 781, 376, 1292, 428, 1298, 665, 736, 1542, 567, 840, 1078, 625, 238, 1107, 359, 457, 1081, 399, 787, 1545, 591, 1136, 678, 434, 1159, 677, 349, 1102, 245, 458, 1313, 666, 1218, 620, 363, 1109, 127, 191, 1300, 782, 1546, 407, 436, 1082, 626, 571, 1192, 465, 1163, 68 1, 246, 1123, 707, 350, 1110, 599, 1084, 668, 790, 1304, 460, 249, 1113, 682, 1314, 573, 411, 15 53, 803, 789, 1548, 709, 1220, 365, 440, 1165, 628, 1125, 689, 374, 1171, 423, 466, 1200, 793, 1 166, 250, 371, 1554, 481, 1345, 574, 413, 1055, 603, 1224, 366, 468, 1114, 655, 1569, 900, 805, 1316, 615, 1346, 684, 710, 1556, 429, 1287, 794, 252, 1173, 373, 1126, 605, 848, 1129, 690, 13 28, 713, 1320, 632, 482, 1187, 806, 1116, 427, 904, 1071, 414, 1291, 223, 663, 1409, 692, 1570, 835, 1348, 619, 472, 1232, 455, 1410, 796, 809, 1174, 714, 1177, 721, 1189, 837, 716, 1130, 864, 1079, 810, 1352, 606, 912, 1560, 722, 1601, 696, 1572, 377, 435, 1137, 817, 1178, 319, 1103, 6 21, 1293, 812, 484, 1132, 430, 1602, 838, 1248, 667, 488, 1190, 239, 1543, 378, 1576, 459, 121 9, 622, 627, 1294, 437, 1665, 380, 1547, 818, 1299, 461, 496, 1604, 669, 1315, 679, 1083, 724, 1 193, 841, 629, 1584, 351, 1138, 467, 1301, 438, 1180, 737, 1111, 251, 1221, 462, 442, 1140, 441, 1194, 469, 1085, 247, 1555, 683, 1549, 842, 1666, 738, 899, 1305, 670, 1302, 783, 1550, 849, 1 201, 820, 1317, 728, 1412, 928, 1115, 791, 367, 1608, 901, 1793, 630, 1222, 685, 1196, 844, 114 4, 633, 1225, 711, 1360, 253, 1086, 691, 1306, 824, 1167, 902, 1127, 686, 740, 1202, 850, 1318, 375, 1117, 444, 1668, 470, 1226, 483, 1616, 415, 1347, 485, 1416, 905, 1321, 795, 1794, 473, 1 131, 634, 1204, 744, 1175, 852, 1233, 960, 1308, 865, 1672, 693, 1118, 797, 1228, 906, 1322, 7 15, 1424, 807, 1632, 474, 1376, 636, 1349, 694, 1557, 254, 1179, 717, 1234, 575, 1329, 913, 15 71, 798, 1324, 811, 1133, 379, 1208, 697, 1558, 431, 607, 489, 1561, 866, 1139, 723, 1191, 486, 1249, 908, 1350, 718, 1330, 813, 1796, 476, 1181, 856, 1680, 839, 1353, 725, 1134, 698, 1141, 914, 1236, 752, 1195, 868, 1800, 819, 1354, 814, 1250, 439, 1573, 929, 1562, 490, 1411, 623, 1 332, 671, 1240, 739, 1440, 916, 1295, 463, 1303, 843, 1182, 381, 1361, 497, 1574, 930, 1696, 8 21, 1142, 726, 1356, 1603, 961, 1564, 872, 1413, 492, 1197, 631, 1145, 729, 1577, 700, 1223, 4 43, 1808, 741, 1203, 845, 1252, 920, 1362, 382, 1336, 822, 1728, 1414, 851, 1198, 730, 1578, 4 98, 1605, 880, 1417, 742, 1307, 445, 1146, 471, 1472, 1377, 635, 1585, 932, 1227, 687, 1087, 9 03, 1364, 825, 1418, 500, 1551, 1606, 846, 1580, 745, 1205, 826, 1319, 732, 1309, 446, 1256, 1 148, 962, 1229, 936, 1206, 475, 1667, 853, 1586, 867, 1310, 1609, 637, 1323, 907, 1378, 487, 1 235, 695, 1425, 1209, 746, 1420, 828, 1368, 753, 1610, 854, 1669, 1617, 857, 1559, 504, 1264, 799, 1230, 1119, 255, 1351, 964, 1588, 909, 1824, 719, 1426, 1380, 477, 1331, 915, 1325, 638, 1441, 1237, 748, 1592, 944, 1856, 869, 1612, 1210, 491, 1670, 699, 1428, 1251, 754, 1920, 858, 1618, 478, 1442, 1326, 968, 1673, 383, 1795, 910, 1384, 1563, 815, 1135, 976, 1355, 1238, 87 0, 1333, 917, 1212, 1473, 727, 1241, 493, 1432, 873, 1633, 1620, 701, 1575, 931, 1674, 1253, 7 56, 1183, 860, 1444, 1334, 499, 1565, 731, 1797, 1634, 823, 1681, 922, 1357, 1143, 874, 1624, 918, 1363, 1242, 502, 1392, 933, 1676, 1254, 743, 1415, 1337, 760, 1474, 881, 1566, 1358, 494, 1257, 702, 1579, 1798, 921, 1199, 501, 1147, 1682, 876, 1636, 1365, 847, 1801, 992, 1244, 13 38, 447, 1448, 1419, 733, 1697, 827, 1607, 1379, 934, 1311, 1207, 882, 1258, 937, 1149, 1581, 963, 1684, 1640, 747, 1366, 505, 1340, 1265, 855, 1802, 1587, 924, 1369, 734, 1476, 1421, 829, 1427, 1231, 965, 1698, 1582, 938, 1809, 1456, 884, 1381, 506, 1211, 1260, 749, 1688, 1648, 9 45, 1611, 1804, 966, 1729, 1150, 755, 1266, 859, 1589, 1422, 940, 1370, 1480, 830, 1382, 1429, 911, 1327, 1593, 871, 1268, 1619, 639, 1213, 1590, 888, 1700, 1385, 479, 1730, 1613, 946, 12 39, 750, 1810, 1671, 969, 1372, 1443, 508, 1430, 1488, 861, 1704, 1825, 757, 1386, 1614, 970, 1433, 1594, 919, 1812, 1621, 1596, 875, 1243, 1335, 862, 1732, 1622, 758, 1625, 1675, 948, 14 45, 1816, 977, 1826, 1635, 923, 1626, 1434, 972, 1255, 1712, 761, 1677, 1272, 877, 1393, 1214, 1388, 952, 1678, 1683, 495, 1359, 1504, 703, 1339, 1245, 935, 1394, 1637, 978, 1446, 1449, 1 475, 883, 1638, 1567, 762, 1259, 1436, 503, 1367, 1396, 925, 1799, 1341, 1246, 878, 1450, 147 7, 735, 1261, 1583, 1857, 993, 1828, 1736, 885, 1858, 1685, 939, 1832, 1803, 1641, 994, 1628, 1457, 980, 1744, 1840, 1860, 926, 1371, 1921, 764, 1267, 1686, 1478, 941, 1342, 1699, 967, 16 42, 1922, 1805, 886, 1400, 1452, 831, 1689, 1760, 1591, 947, 1864, 1649, 507, 1262, 1383, 148 1, 889, 1423, 1811, 1615, 984, 1702, 1458, 751, 1701, 1373, 1269, 942, 1482, 1690, 1644, 996, 1387, 1151, 1215, 971, 1806, 1431, 890, 1460, 1650, 1595, 509, 1489, 1705, 1270, 949, 1731, 1 374, 1623, 973, 1692, 1814, 1484, 1000, 1273, 1706, 1597, 892, 1435, 1827, 1813, 950, 1733, 1 389, 1464, 863, 1652, 1713, 1398, 759, 1447, 1490, 1817, 1008, 1274, 1395, 1505, 510, 1598, 1 437, 1627, 979, 1390, 1492, 1679, 953, 1924, 1829, 1639, 763, 1708, 1734, 1453, 974, 1818, 12 76, 1397, 1629, 954, 1872, 1714, 1737, 879, 1656, 1506, 1830, 981, 1451, 1928, 1438, 982, 124 7, 1687, 1716, 1859, 927, 1643, 1643, 1479, 995, 1820, 1833, 1738, 1745, 765, 1861, 1740, 188 8, 956, 1834, 1630, 1936, 1746, 887, 1720, 1401, 1459, 1841, 985, 1343, 1645, 1836, 997, 1508, 1454, 1862, 1691, 986, 1512, 1263, 1402, 1483, 943, 1646, 1651, 1461, 1404, 891, 1842, 1485, 1520, 1693, 998, 1703, 1748, 1865, 766, 1653, 1375, 1491, 1462, 511, 1761, 1275, 1486, 1466, 1465, 988, 1493, 1271, 1707, 1866, 1001, 1762, 1923, 1694, 1807, 951, 1873, 1844, 1752, 195 2, 1002, 1815, 1391, 1925, 1654, 1709, 893, 1868, 1657, 1735, 1277, 975, 1715, 1848, 1926, 17 10, 894, 1764, 1874, 1399, 1468, 1494, 1009, 1507, 1439, 1509, 1929, 1819, 955, 1497, 1658, 1 768, 1876, 1984, 1004, 1889, 1717, 1821, 1930, 1010, 1739, 1831, 1498, 1660, 1718, 957, 127 8, 1741, 1599, 1937, 1822, 983, 1835, 1403, 1721, 1455, 1631, 1513, 958, 1890, 1747, 1510, 19 32, 1742, 987, 1837, 1500, 1880, 1863, 1749, 1012, 1722, 1938, 1776, 1892, 1843, 1838, 999, 1 463, 1953, 1514, 1647, 1695, 1763, 1016, 1940, 1487, 1867, 1405, 1521, 767, 1954, 1845, 175 0, 1985, 1896, 1516, 1655, 989, 1753, 1724, 1467, 1765, 1869, 1944, 1003, 1406, 1846, 1875, 1 754, 1522, 1904, 990, 1766, 1469, 1495, 1659, 1956, 1711, 1927, 1005, 1849, 1524, 1870, 176 9, 1850, 1756, 1470, 959, 1986, 1960, 1499, 1877, 1891, 1661, 1931, 1011, 1511, 1719, 1770, 1 852, 1777, 1878, 1881, 1013, 1528, 1823, 1279, 1988, 1933, 1743, 1501, 1939, 895, 1662, 177 2, 1968, 1893, 1515, 1723, 1778, 1882, 1006, 1502, 1992, 1407, 1934, 1839, 2000, 1894, 1941, 1014, 1751, 1517, 1897, 1725, 1955, 1780, 1884, 1523, 1755, 1017, 1847, 1946, 1898, 1942, 1 526, 1957, 1767, 1784, 1905, 1018, 1518, 1726, 1945, 1525, 1900, 1871, 2016, 1471, 1757, 18 51, 991, 1958, 1906, 1961, 1987, 1771, 1529, 1879, 1948, 1758, 1853, 1020, 1989, 1962, 1908, 1530, 1773, 1969, 1990, 1779, 1883, 1964, 1854, 1935, 1007, 1895, 1663, 1912, 1503, 1970, 1 774, 1993, 1532, 1885, 1781, 1994, 1943, 1015, 1899, 1886, 1782, 1972, 2001, 1947, 1996, 17 85, 1901, 1976, 1519, 1727, 1959, 2002, 1019, 1907, 1786, 1527, 1949, 1902, 1759, 2017, 190 9, 1963, 2018, 2004, 1950, 1788, 1965, 1991, 1021, 1910, 1855, 1971, 1531, 1913, 2008, 1775, 1966, 2020, 1995, 1914, 1533, 1973, 1997, 2024, 1916, 1974, 1887, 1783, 1022, 2032, 1534, 2 003, 1977, 1787, 1998, 1978, 1903, 2005, 2006, 1951, 2019, 1789, 1980, 1911, 2009, 2021, 20 10, 1967, 1915, 2022, 1790, 1535, 1023, 2012, 2025, 1975, 2026, 1917, 1999, 1918, 2033, 197 9, 2028, 2034, 1981, 2007, 1982, 2011, 2036, 2023, 2040, 1791, 2013, 2027, 2014, 2029, 1983, 2035, 2037, 1919, 2030, 2038, 2041, 2042, 2015, 2044, 2031, 2039, 2043, 2045, 2046, 2047]

TABLE Q3

| with a sequence length of 2048: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 1024 |
| 11 | 9 |
| 12 | 6 |
| 13 | 17 |
| 14 | 10 |
| 15 | 18 |
| 16 | 128 |
| 17 | 12 |
| 18 | 33 |
| 19 | 65 |
| 20 | 20 |
| 21 | 256 |
| 22 | 34 |
| 23 | 24 |
| 24 | 36 |
| 25 | 7 |
| 26 | 129 |

TABLE Q3-continued

| with a sequence length of 2048: | |
|---|---|
| Reliability or reliability sequence number | Polarized channel sequence number |
| 27 | 66 |
| 28 | 512 |
| 29 | 11 |
| 30 | 40 |
| 31 | 68 |
| 32 | 130 |
| 33 | 19 |
| 34 | 13 |
| 35 | 48 |
| 36 | 14 |
| 37 | 72 |
| 38 | 257 |
| 39 | 1025 |
| 40 | 21 |
| 41 | 132 |
| 42 | 35 |
| 43 | 258 |
| 44 | 26 |
| 45 | 513 |
| 46 | 80 |
| 47 | 37 |
| 48 | 25 |
| 49 | 22 |
| 50 | 136 |
| 51 | 260 |
| 52 | 264 |
| 53 | 38 |
| 54 | 514 |
| 55 | 96 |
| 56 | 67 |
| 57 | 41 |
| 58 | 144 |
| 59 | 28 |
| 60 | 69 |
| 61 | 42 |
| 62 | 516 |
| 63 | 49 |
| 64 | 1026 |
| 65 | 74 |
| 66 | 272 |
| 67 | 160 |
| 68 | 520 |
| 69 | 288 |
| 70 | 528 |
| 71 | 192 |
| 72 | 544 |
| 73 | 70 |
| 74 | 44 |
| 75 | 131 |
| 76 | 81 |
| 77 | 50 |
| 78 | 73 |
| 79 | 15 |
| 80 | 320 |
| 81 | 133 |
| 82 | 52 |
| 83 | 1028 |
| 84 | 23 |
| 85 | 134 |
| 86 | 384 |
| 87 | 76 |
| 88 | 137 |
| 89 | 82 |
| 90 | 56 |
| 91 | 27 |
| 92 | 97 |
| 93 | 39 |
| 94 | 259 |
| 95 | 84 |
| 96 | 138 |
| 97 | 145 |
| 98 | 261 |
| 99 | 1032 |
| 100 | 29 |
| 101 | 43 |

TABLE Q3-continued

| with a sequence length of 2048: | |
|---|---|
| Reliability or reliability sequence number | Polarized channel sequence number |
| 102 | 98 |
| 103 | 515 |
| 104 | 88 |
| 105 | 140 |
| 106 | 30 |
| 107 | 146 |
| 108 | 71 |
| 109 | 262 |
| 110 | 265 |
| 111 | 161 |
| 112 | 576 |
| 113 | 45 |
| 114 | 1040 |
| 115 | 100 |
| 116 | 640 |
| 117 | 51 |
| 118 | 148 |
| 119 | 46 |
| 120 | 75 |
| 121 | 266 |
| 122 | 273 |
| 123 | 517 |
| 124 | 104 |
| 125 | 162 |
| 126 | 53 |
| 127 | 193 |
| 128 | 1056 |
| 129 | 152 |
| 130 | 77 |
| 131 | 164 |
| 132 | 768 |
| 133 | 268 |
| 134 | 274 |
| 135 | 518 |
| 136 | 54 |
| 137 | 83 |
| 138 | 57 |
| 139 | 521 |
| 140 | 1027 |
| 141 | 112 |
| 142 | 135 |
| 143 | 78 |
| 144 | 289 |
| 145 | 194 |
| 146 | 85 |
| 147 | 276 |
| 148 | 522 |
| 149 | 58 |
| 150 | 168 |
| 151 | 1029 |
| 152 | 139 |
| 153 | 99 |
| 154 | 86 |
| 155 | 60 |
| 156 | 280 |
| 157 | 89 |
| 158 | 290 |
| 159 | 529 |
| 160 | 524 |
| 161 | 196 |
| 162 | 1088 |
| 163 | 141 |
| 164 | 101 |
| 165 | 147 |
| 166 | 176 |
| 167 | 142 |
| 168 | 530 |
| 169 | 321 |
| 170 | 31 |
| 171 | 200 |
| 172 | 1033 |
| 173 | 90 |
| 174 | 545 |
| 175 | 292 |
| 176 | 322 |

TABLE Q3-continued

| with a sequence length of 2048: | |
|---|---|
| Reliability or reliability sequence number | Polarized channel sequence number |
| 177 | 532 |
| 178 | 263 |
| 179 | 149 |
| 180 | 102 |
| 181 | 105 |
| 182 | 1030 |
| 183 | 304 |
| 184 | 296 |
| 185 | 163 |
| 186 | 92 |
| 187 | 47 |
| 188 | 267 |
| 189 | 385 |
| 190 | 546 |
| 191 | 324 |
| 192 | 1041 |
| 193 | 208 |
| 194 | 386 |
| 195 | 150 |
| 196 | 153 |
| 197 | 165 |
| 198 | 106 |
| 199 | 55 |
| 200 | 1034 |
| 201 | 328 |
| 202 | 536 |
| 203 | 577 |
| 204 | 548 |
| 205 | 113 |
| 206 | 154 |
| 207 | 79 |
| 208 | 269 |
| 209 | 1042 |
| 210 | 108 |
| 211 | 578 |
| 212 | 224 |
| 213 | 166 |
| 214 | 519 |
| 215 | 552 |
| 216 | 195 |
| 217 | 1152 |
| 218 | 270 |
| 219 | 641 |
| 220 | 523 |
| 221 | 275 |
| 222 | 580 |
| 223 | 291 |
| 224 | 59 |
| 225 | 1036 |
| 226 | 169 |
| 227 | 560 |
| 228 | 114 |
| 229 | 277 |
| 230 | 156 |
| 231 | 87 |
| 232 | 197 |
| 233 | 1057 |
| 234 | 116 |
| 235 | 170 |
| 236 | 61 |
| 237 | 531 |
| 238 | 525 |
| 239 | 642 |
| 240 | 281 |
| 241 | 1089 |
| 242 | 278 |
| 243 | 526 |
| 244 | 177 |
| 245 | 293 |
| 246 | 388 |
| 247 | 91 |
| 248 | 1044 |
| 249 | 584 |
| 250 | 769 |
| 251 | 198 |

TABLE Q3-continued

| with a sequence length of 2048: | |
|---|---|
| Reliability or reliability sequence number | Polarized channel sequence number |
| 252 | 172 |
| 253 | 120 |
| 254 | 201 |
| 255 | 336 |
| 256 | 1280 |
| 257 | 62 |
| 258 | 282 |
| 259 | 143 |
| 260 | 103 |
| 261 | 178 |
| 262 | 294 |
| 263 | 1058 |
| 264 | 93 |
| 265 | 644 |
| 266 | 202 |
| 267 | 592 |
| 268 | 323 |
| 269 | 1048 |
| 270 | 392 |
| 271 | 297 |
| 272 | 770 |
| 273 | 107 |
| 274 | 180 |
| 275 | 151 |
| 276 | 1060 |
| 277 | 209 |
| 278 | 284 |
| 279 | 648 |
| 280 | 94 |
| 281 | 204 |
| 282 | 298 |
| 283 | 1031 |
| 284 | 400 |
| 285 | 608 |
| 286 | 352 |
| 287 | 325 |
| 288 | 533 |
| 289 | 1153 |
| 290 | 155 |
| 291 | 210 |
| 292 | 305 |
| 293 | 547 |
| 294 | 300 |
| 295 | 1090 |
| 296 | 109 |
| 297 | 184 |
| 298 | 534 |
| 299 | 537 |
| 300 | 115 |
| 301 | 167 |
| 302 | 1536 |
| 303 | 225 |
| 304 | 326 |
| 305 | 306 |
| 306 | 772 |
| 307 | 157 |
| 308 | 1035 |
| 309 | 656 |
| 310 | 329 |
| 311 | 110 |
| 312 | 117 |
| 313 | 212 |
| 314 | 1064 |
| 315 | 171 |
| 316 | 776 |
| 317 | 330 |
| 318 | 226 |
| 319 | 549 |
| 320 | 1092 |
| 321 | 538 |
| 322 | 387 |
| 323 | 308 |
| 324 | 216 |
| 325 | 1154 |
| 326 | 416 |

TABLE Q3-continued with a sequence length of 2048:

| Reliability or reliability sequence number | Polarized channel sequence number |
|---|---|
| 327 | 271 |
| 328 | 279 |
| 329 | 158 |
| 330 | 337 |
| 331 | 1043 |
| 332 | 550 |
| 333 | 672 |
| 334 | 118 |
| 335 | 332 |
| 336 | 579 |
| 337 | 1037 |
| 338 | 540 |
| 339 | 389 |
| 340 | 173 |
| 341 | 121 |
| 342 | 1072 |
| 343 | 553 |
| 344 | 199 |
| 345 | 784 |
| 346 | 179 |
| 347 | 1038 |
| 348 | 228 |
| 349 | 338 |
| 350 | 312 |
| 351 | 704 |
| 352 | 390 |
| 353 | 1096 |
| 354 | 174 |
| 355 | 554 |
| 356 | 581 |
| 357 | 393 |
| 358 | 1281 |
| 359 | 283 |
| 360 | 122 |
| 361 | 448 |
| 362 | 353 |
| 363 | 1045 |
| 364 | 561 |
| 365 | 203 |
| 366 | 63 |
| 367 | 340 |
| 368 | 1156 |
| 369 | 394 |
| 370 | 527 |
| 371 | 582 |
| 372 | 556 |
| 373 | 181 |
| 374 | 1059 |
| 375 | 295 |
| 376 | 285 |
| 377 | 232 |
| 378 | 124 |
| 379 | 1282 |
| 380 | 205 |
| 381 | 182 |
| 382 | 643 |
| 383 | 562 |
| 384 | 1050 |
| 385 | 286 |
| 386 | 585 |
| 387 | 299 |
| 388 | 1537 |
| 389 | 354 |
| 390 | 211 |
| 391 | 401 |
| 392 | 185 |
| 393 | 1104 |
| 394 | 396 |
| 395 | 344 |
| 396 | 586 |
| 397 | 645 |
| 398 | 1061 |
| 399 | 593 |
| 400 | 535 |
| 401 | 240 |

TABLE Q3-continued with a sequence length of 2048:

| Reliability or reliability sequence number | Polarized channel sequence number |
|---|---|
| 402 | 206 |
| 403 | 1049 |
| 404 | 95 |
| 405 | 327 |
| 406 | 564 |
| 407 | 1046 |
| 408 | 800 |
| 409 | 402 |
| 410 | 356 |
| 411 | 307 |
| 412 | 1160 |
| 413 | 301 |
| 414 | 417 |
| 415 | 213 |
| 416 | 568 |
| 417 | 1284 |
| 418 | 832 |
| 419 | 588 |
| 420 | 186 |
| 421 | 1288 |
| 422 | 646 |
| 423 | 404 |
| 424 | 227 |
| 425 | 896 |
| 426 | 1062 |
| 427 | 594 |
| 428 | 418 |
| 429 | 302 |
| 430 | 1538 |
| 431 | 649 |
| 432 | 771 |
| 433 | 360 |
| 434 | 539 |
| 435 | 1120 |
| 436 | 111 |
| 437 | 331 |
| 438 | 214 |
| 439 | 1091 |
| 440 | 309 |
| 441 | 188 |
| 442 | 449 |
| 443 | 1065 |
| 444 | 217 |
| 445 | 408 |
| 446 | 609 |
| 447 | 596 |
| 448 | 1168 |
| 449 | 551 |
| 450 | 650 |
| 451 | 229 |
| 452 | 1052 |
| 453 | 159 |
| 454 | 420 |
| 455 | 310 |
| 456 | 1093 |
| 457 | 541 |
| 458 | 773 |
| 459 | 610 |
| 460 | 1066 |
| 461 | 657 |
| 462 | 333 |
| 463 | 119 |
| 464 | 1540 |
| 465 | 600 |
| 466 | 339 |
| 467 | 218 |
| 468 | 1073 |
| 469 | 368 |
| 470 | 652 |
| 471 | 230 |
| 472 | 1098 |
| 473 | 391 |
| 474 | 313 |
| 475 | 450 |
| 476 | 1296 |

TABLE Q3-continued

| with a sequence length of 2048: | |
|---|---|
| Reliability or reliability sequence number | Polarized channel sequence number |
| 477 | 542 |
| 478 | 334 |
| 479 | 233 |
| 480 | 1184 |
| 481 | 555 |
| 482 | 774 |
| 483 | 175 |
| 484 | 1544 |
| 485 | 123 |
| 486 | 658 |
| 487 | 612 |
| 488 | 1312 |
| 489 | 341 |
| 490 | 777 |
| 491 | 220 |
| 492 | 1552 |
| 493 | 314 |
| 494 | 424 |
| 495 | 395 |
| 496 | 1216 |
| 497 | 673 |
| 498 | 583 |
| 499 | 355 |
| 500 | 1568 |
| 501 | 287 |
| 502 | 183 |
| 503 | 234 |
| 504 | 1094 |
| 505 | 125 |
| 506 | 557 |
| 507 | 660 |
| 508 | 1068 |
| 509 | 616 |
| 510 | 342 |
| 511 | 316 |
| 512 | 1155 |
| 513 | 241 |
| 514 | 778 |
| 515 | 1105 |
| 516 | 563 |
| 517 | 345 |
| 518 | 452 |
| 519 | 1074 |
| 520 | 397 |
| 521 | 403 |
| 522 | 207 |
| 523 | 1097 |
| 524 | 674 |
| 525 | 558 |
| 526 | 1039 |
| 527 | 785 |
| 528 | 432 |
| 529 | 357 |
| 530 | 1344 |
| 531 | 187 |
| 532 | 236 |
| 533 | 664 |
| 534 | 1157 |
| 535 | 624 |
| 536 | 587 |
| 537 | 1076 |
| 538 | 780 |
| 539 | 705 |
| 540 | 126 |
| 541 | 1047 |
| 542 | 242 |
| 543 | 565 |
| 544 | 1158 |
| 545 | 398 |
| 546 | 346 |
| 547 | 456 |
| 548 | 1408 |
| 549 | 358 |
| 550 | 405 |
| 551 | 1100 |

TABLE Q3-continued

| with a sequence length of 2048: | |
|---|---|
| Reliability or reliability sequence number | Polarized channel sequence number |
| 552 | 303 |
| 553 | 569 |
| 554 | 244 |
| 555 | 1161 |
| 556 | 595 |
| 557 | 189 |
| 558 | 1106 |
| 559 | 566 |
| 560 | 676 |
| 561 | 361 |
| 562 | 1080 |
| 563 | 706 |
| 564 | 589 |
| 565 | 1051 |
| 566 | 215 |
| 567 | 786 |
| 568 | 647 |
| 569 | 1121 |
| 570 | 348 |
| 571 | 419 |
| 572 | 1063 |
| 573 | 406 |
| 574 | 464 |
| 575 | 680 |
| 576 | 1283 |
| 577 | 801 |
| 578 | 362 |
| 579 | 1108 |
| 580 | 590 |
| 581 | 409 |
| 582 | 1162 |
| 583 | 570 |
| 584 | 788 |
| 585 | 597 |
| 586 | 1169 |
| 587 | 572 |
| 588 | 219 |
| 589 | 1285 |
| 590 | 311 |
| 591 | 708 |
| 592 | 1053 |
| 593 | 598 |
| 594 | 601 |
| 595 | 1067 |
| 596 | 651 |
| 597 | 421 |
| 598 | 792 |
| 599 | 1122 |
| 600 | 802 |
| 601 | 611 |
| 602 | 1539 |
| 603 | 602 |
| 604 | 410 |
| 605 | 1112 |
| 606 | 231 |
| 607 | 688 |
| 608 | 1164 |
| 609 | 653 |
| 610 | 248 |
| 611 | 1054 |
| 612 | 369 |
| 613 | 190 |
| 614 | 364 |
| 615 | 1170 |
| 616 | 654 |
| 617 | 659 |
| 618 | 1095 |
| 619 | 335 |
| 620 | 480 |
| 621 | 1286 |
| 622 | 315 |
| 623 | 221 |
| 624 | 1289 |
| 625 | 370 |
| 626 | 613 |

TABLE Q3-continued

| with a sequence length of 2048: | |
|---|---|
| Reliability or reliability sequence number | Polarized channel sequence number |
| 627 | 1185 |
| 628 | 422 |
| 629 | 425 |
| 630 | 1600 |
| 631 | 451 |
| 632 | 614 |
| 633 | 1069 |
| 634 | 543 |
| 635 | 235 |
| 636 | 1124 |
| 637 | 412 |
| 638 | 343 |
| 639 | 372 |
| 640 | 1664 |
| 641 | 775 |
| 642 | 317 |
| 643 | 1075 |
| 644 | 222 |
| 645 | 426 |
| 646 | 1172 |
| 647 | 453 |
| 648 | 237 |
| 649 | 1070 |
| 650 | 559 |
| 651 | 833 |
| 652 | 1099 |
| 653 | 804 |
| 654 | 712 |
| 655 | 1290 |
| 656 | 834 |
| 657 | 661 |
| 658 | 1297 |
| 659 | 808 |
| 660 | 779 |
| 661 | 1541 |
| 662 | 617 |
| 663 | 1128 |
| 664 | 604 |
| 665 | 433 |
| 666 | 1186 |
| 667 | 720 |
| 668 | 816 |
| 669 | 1077 |
| 670 | 836 |
| 671 | 347 |
| 672 | 1217 |
| 673 | 897 |
| 674 | 243 |
| 675 | 1176 |
| 676 | 662 |
| 677 | 454 |
| 678 | 1101 |
| 679 | 318 |
| 680 | 675 |
| 681 | 1188 |
| 682 | 618 |
| 683 | 898 |
| 684 | 1792 |
| 685 | 781 |
| 686 | 376 |
| 687 | 1292 |
| 688 | 428 |
| 689 | 1298 |
| 690 | 665 |
| 691 | 736 |
| 692 | 1542 |
| 693 | 567 |
| 694 | 840 |
| 695 | 1078 |
| 696 | 625 |
| 697 | 238 |
| 698 | 1107 |
| 699 | 359 |
| 700 | 457 |
| 701 | 1081 |

TABLE Q3-continued

| with a sequence length of 2048: | |
|---|---|
| Reliability or reliability sequence number | Polarized channel sequence number |
| 702 | 399 |
| 703 | 787 |
| 704 | 1545 |
| 705 | 591 |
| 706 | 1136 |
| 707 | 678 |
| 708 | 434 |
| 709 | 1159 |
| 710 | 677 |
| 711 | 349 |
| 712 | 1102 |
| 713 | 245 |
| 714 | 458 |
| 715 | 1313 |
| 716 | 666 |
| 717 | 1218 |
| 718 | 620 |
| 719 | 363 |
| 720 | 1109 |
| 721 | 127 |
| 722 | 191 |
| 723 | 1300 |
| 724 | 782 |
| 725 | 1546 |
| 726 | 407 |
| 727 | 436 |
| 728 | 1082 |
| 729 | 626 |
| 730 | 571 |
| 731 | 1192 |
| 732 | 465 |
| 733 | 1163 |
| 734 | 681 |
| 735 | 246 |
| 736 | 1123 |
| 737 | 707 |
| 738 | 350 |
| 739 | 1110 |
| 740 | 599 |
| 741 | 1084 |
| 742 | 668 |
| 743 | 790 |
| 744 | 1304 |
| 745 | 460 |
| 746 | 249 |
| 747 | 1113 |
| 748 | 682 |
| 749 | 1314 |
| 750 | 573 |
| 751 | 411 |
| 752 | 1553 |
| 753 | 803 |
| 754 | 789 |
| 755 | 1548 |
| 756 | 709 |
| 757 | 1220 |
| 758 | 365 |
| 759 | 440 |
| 760 | 1165 |
| 761 | 628 |
| 762 | 1125 |
| 763 | 689 |
| 764 | 374 |
| 765 | 1171 |
| 766 | 423 |
| 767 | 466 |
| 768 | 1200 |
| 769 | 793 |
| 770 | 1166 |
| 771 | 250 |
| 772 | 371 |
| 773 | 1554 |
| 774 | 481 |
| 775 | 1345 |
| 776 | 574 |

TABLE Q3-continued

| with a sequence length of 2048: | |
|---|---|
| Reliability or reliability sequence number | Polarized channel sequence number |
| 777 | 413 |
| 778 | 1055 |
| 779 | 603 |
| 780 | 1224 |
| 781 | 366 |
| 782 | 468 |
| 783 | 1114 |
| 784 | 655 |
| 785 | 1569 |
| 786 | 900 |
| 787 | 805 |
| 788 | 1316 |
| 789 | 615 |
| 790 | 1346 |
| 791 | 684 |
| 792 | 710 |
| 793 | 1556 |
| 794 | 429 |
| 795 | 1287 |
| 796 | 794 |
| 797 | 252 |
| 798 | 1173 |
| 799 | 373 |
| 800 | 1126 |
| 801 | 605 |
| 802 | 848 |
| 803 | 1129 |
| 804 | 690 |
| 805 | 1328 |
| 806 | 713 |
| 807 | 1320 |
| 808 | 632 |
| 809 | 482 |
| 810 | 1187 |
| 811 | 806 |
| 812 | 1116 |
| 813 | 427 |
| 814 | 904 |
| 815 | 1071 |
| 816 | 414 |
| 817 | 1291 |
| 818 | 223 |
| 819 | 663 |
| 820 | 1409 |
| 821 | 692 |
| 822 | 1570 |
| 823 | 835 |
| 824 | 1348 |
| 825 | 619 |
| 826 | 472 |
| 827 | 1232 |
| 828 | 455 |
| 829 | 1410 |
| 830 | 796 |
| 831 | 809 |
| 832 | 1174 |
| 833 | 714 |
| 834 | 1177 |
| 835 | 721 |
| 836 | 1189 |
| 837 | 837 |
| 838 | 716 |
| 839 | 1130 |
| 840 | 864 |
| 841 | 1079 |
| 842 | 810 |
| 843 | 1352 |
| 844 | 606 |
| 845 | 912 |
| 846 | 1560 |
| 847 | 722 |
| 848 | 1601 |
| 849 | 696 |
| 850 | 1572 |
| 851 | 377 |

TABLE Q3-continued

| with a sequence length of 2048: | |
|---|---|
| Reliability or reliability sequence number | Polarized channel sequence number |
| 852 | 435 |
| 853 | 1137 |
| 854 | 817 |
| 855 | 1178 |
| 856 | 319 |
| 857 | 1103 |
| 858 | 621 |
| 859 | 1293 |
| 860 | 812 |
| 861 | 484 |
| 862 | 1132 |
| 863 | 430 |
| 864 | 1602 |
| 865 | 838 |
| 866 | 1248 |
| 867 | 667 |
| 868 | 488 |
| 869 | 1190 |
| 870 | 239 |
| 871 | 1543 |
| 872 | 378 |
| 873 | 1576 |
| 874 | 459 |
| 875 | 1219 |
| 876 | 622 |
| 877 | 627 |
| 878 | 1294 |
| 879 | 437 |
| 880 | 1665 |
| 881 | 380 |
| 882 | 1547 |
| 883 | 818 |
| 884 | 1299 |
| 885 | 461 |
| 886 | 496 |
| 887 | 1604 |
| 888 | 669 |
| 889 | 1315 |
| 890 | 679 |
| 891 | 1083 |
| 892 | 724 |
| 893 | 1193 |
| 894 | 841 |
| 895 | 629 |
| 896 | 1584 |
| 897 | 351 |
| 898 | 1138 |
| 899 | 467 |
| 900 | 1301 |
| 901 | 438 |
| 902 | 1180 |
| 903 | 737 |
| 904 | 1111 |
| 905 | 251 |
| 906 | 1221 |
| 907 | 462 |
| 908 | 442 |
| 909 | 1140 |
| 910 | 441 |
| 911 | 1194 |
| 912 | 469 |
| 913 | 1085 |
| 914 | 247 |
| 915 | 1555 |
| 916 | 683 |
| 917 | 1549 |
| 918 | 842 |
| 919 | 1666 |
| 920 | 738 |
| 921 | 899 |
| 922 | 1305 |
| 923 | 670 |
| 924 | 1302 |
| 925 | 783 |
| 926 | 1550 |

TABLE Q3-continued

| with a sequence length of 2048: | |
|---|---|
| Reliability or reliability sequence number | Polarized channel sequence number |
| 927 | 849 |
| 928 | 1201 |
| 929 | 820 |
| 930 | 1317 |
| 931 | 728 |
| 932 | 1412 |
| 933 | 928 |
| 934 | 1115 |
| 935 | 791 |
| 936 | 367 |
| 937 | 1608 |
| 938 | 901 |
| 939 | 1793 |
| 940 | 630 |
| 941 | 1222 |
| 942 | 685 |
| 943 | 1196 |
| 944 | 844 |
| 945 | 1144 |
| 946 | 633 |
| 947 | 1225 |
| 948 | 711 |
| 949 | 1360 |
| 950 | 253 |
| 951 | 1086 |
| 952 | 691 |
| 953 | 1306 |
| 954 | 824 |
| 955 | 1167 |
| 956 | 902 |
| 957 | 1127 |
| 958 | 686 |
| 959 | 740 |
| 960 | 1202 |
| 961 | 850 |
| 962 | 1318 |
| 963 | 375 |
| 964 | 1117 |
| 965 | 444 |
| 966 | 1668 |
| 967 | 470 |
| 968 | 1226 |
| 969 | 483 |
| 970 | 1616 |
| 971 | 415 |
| 972 | 1347 |
| 973 | 485 |
| 974 | 1416 |
| 975 | 905 |
| 976 | 1321 |
| 977 | 795 |
| 978 | 1794 |
| 979 | 473 |
| 980 | 1131 |
| 981 | 634 |
| 982 | 1204 |
| 983 | 744 |
| 984 | 1175 |
| 985 | 852 |
| 986 | 1233 |
| 987 | 960 |
| 988 | 1308 |
| 989 | 865 |
| 990 | 1672 |
| 991 | 693 |
| 992 | 1118 |
| 993 | 797 |
| 994 | 1228 |
| 995 | 906 |
| 996 | 1322 |
| 997 | 715 |
| 998 | 1424 |
| 999 | 807 |
| 1000 | 1632 |
| 1001 | 474 |

TABLE Q3-continued

| with a sequence length of 2048: | |
|---|---|
| Reliability or reliability sequence number | Polarized channel sequence number |
| 1002 | 1376 |
| 1003 | 636 |
| 1004 | 1349 |
| 1005 | 694 |
| 1006 | 1557 |
| 1007 | 254 |
| 1008 | 1179 |
| 1009 | 717 |
| 1010 | 1234 |
| 1011 | 575 |
| 1012 | 1329 |
| 1013 | 913 |
| 1014 | 1571 |
| 1015 | 798 |
| 1016 | 1324 |
| 1017 | 811 |
| 1018 | 1133 |
| 1019 | 379 |
| 1020 | 1208 |
| 1021 | 697 |
| 1022 | 1558 |
| 1023 | 431 |
| 1024 | 607 |
| 1025 | 489 |
| 1026 | 1561 |
| 1027 | 866 |
| 1028 | 1139 |
| 1029 | 723 |
| 1030 | 1191 |
| 1031 | 486 |
| 1032 | 1249 |
| 1033 | 908 |
| 1034 | 1350 |
| 1035 | 718 |
| 1036 | 1330 |
| 1037 | 813 |
| 1038 | 1796 |
| 1039 | 476 |
| 1040 | 1181 |
| 1041 | 856 |
| 1042 | 1680 |
| 1043 | 839 |
| 1044 | 1353 |
| 1045 | 725 |
| 1046 | 1134 |
| 1047 | 698 |
| 1048 | 1141 |
| 1049 | 914 |
| 1050 | 1236 |
| 1051 | 752 |
| 1052 | 1195 |
| 1053 | 868 |
| 1054 | 1800 |
| 1055 | 819 |
| 1056 | 1354 |
| 1057 | 814 |
| 1058 | 1250 |
| 1059 | 439 |
| 1060 | 1573 |
| 1061 | 929 |
| 1062 | 1562 |
| 1063 | 490 |
| 1064 | 1411 |
| 1065 | 623 |
| 1066 | 1332 |
| 1067 | 671 |
| 1068 | 1240 |
| 1069 | 739 |
| 1070 | 1440 |
| 1071 | 916 |
| 1072 | 1295 |
| 1073 | 463 |
| 1074 | 1303 |
| 1075 | 843 |
| 1076 | 1182 |

TABLE Q3-continued

| with a sequence length of 2048: | |
|---|---|
| Reliability or reliability sequence number | Polarized channel sequence number |
| 1077 | 381 |
| 1078 | 1361 |
| 1079 | 497 |
| 1080 | 1574 |
| 1081 | 930 |
| 1082 | 1696 |
| 1083 | 821 |
| 1084 | 1142 |
| 1085 | 726 |
| 1086 | 1356 |
| 1087 | 1603 |
| 1088 | 961 |
| 1089 | 1564 |
| 1090 | 872 |
| 1091 | 1413 |
| 1092 | 492 |
| 1093 | 1197 |
| 1094 | 631 |
| 1095 | 1145 |
| 1096 | 729 |
| 1097 | 1577 |
| 1098 | 700 |
| 1099 | 1223 |
| 1100 | 443 |
| 1101 | 1808 |
| 1102 | 741 |
| 1103 | 1203 |
| 1104 | 845 |
| 1105 | 1252 |
| 1106 | 920 |
| 1107 | 1362 |
| 1108 | 382 |
| 1109 | 1336 |
| 1110 | 822 |
| 1111 | 1728 |
| 1112 | 1414 |
| 1113 | 851 |
| 1114 | 1198 |
| 1115 | 730 |
| 1116 | 1578 |
| 1117 | 498 |
| 1118 | 1605 |
| 1119 | 880 |
| 1120 | 1417 |
| 1121 | 742 |
| 1122 | 1307 |
| 1123 | 445 |
| 1124 | 1146 |
| 1125 | 471 |
| 1126 | 1472 |
| 1127 | 1377 |
| 1128 | 635 |
| 1129 | 1585 |
| 1130 | 932 |
| 1131 | 1227 |
| 1132 | 687 |
| 1133 | 1087 |
| 1134 | 903 |
| 1135 | 1364 |
| 1136 | 825 |
| 1137 | 1418 |
| 1138 | 500 |
| 1139 | 1551 |
| 1140 | 1606 |
| 1141 | 846 |
| 1142 | 1580 |
| 1143 | 745 |
| 1144 | 1205 |
| 1145 | 826 |
| 1146 | 1319 |
| 1147 | 732 |
| 1148 | 1309 |
| 1149 | 446 |
| 1150 | 1256 |
| 1151 | 1148 |

TABLE Q3-continued

| with a sequence length of 2048: | |
|---|---|
| Reliability or reliability sequence number | Polarized channel sequence number |
| 1152 | 962 |
| 1153 | 1229 |
| 1154 | 936 |
| 1155 | 1206 |
| 1156 | 475 |
| 1157 | 1667 |
| 1158 | 853 |
| 1159 | 1586 |
| 1160 | 867 |
| 1161 | 1310 |
| 1162 | 1609 |
| 1163 | 637 |
| 1164 | 1323 |
| 1165 | 907 |
| 1166 | 1378 |
| 1167 | 487 |
| 1168 | 1235 |
| 1169 | 695 |
| 1170 | 1425 |
| 1171 | 1209 |
| 1172 | 746 |
| 1173 | 1420 |
| 1174 | 828 |
| 1175 | 1368 |
| 1176 | 753 |
| 1177 | 1610 |
| 1178 | 854 |
| 1179 | 1669 |
| 1180 | 1617 |
| 1181 | 857 |
| 1182 | 1559 |
| 1183 | 504 |
| 1184 | 1264 |
| 1185 | 799 |
| 1186 | 1230 |
| 1187 | 1119 |
| 1188 | 255 |
| 1189 | 1351 |
| 1190 | 964 |
| 1191 | 1588 |
| 1192 | 909 |
| 1193 | 1824 |
| 1194 | 719 |
| 1195 | 1426 |
| 1196 | 1380 |
| 1197 | 477 |
| 1198 | 1331 |
| 1199 | 915 |
| 1200 | 1325 |
| 1201 | 638 |
| 1202 | 1441 |
| 1203 | 1237 |
| 1204 | 748 |
| 1205 | 1592 |
| 1206 | 944 |
| 1207 | 1856 |
| 1208 | 869 |
| 1209 | 1612 |
| 1210 | 1210 |
| 1211 | 491 |
| 1212 | 1670 |
| 1213 | 699 |
| 1214 | 1428 |
| 1215 | 1251 |
| 1216 | 754 |
| 1217 | 1920 |
| 1218 | 858 |
| 1219 | 1618 |
| 1220 | 478 |
| 1221 | 1442 |
| 1222 | 1326 |
| 1223 | 968 |
| 1224 | 1673 |
| 1225 | 383 |
| 1226 | 1795 |

TABLE Q3-continued

| with a sequence length of 2048: | |
|---|---|
| Reliability or reliability sequence number | Polarized channel sequence number |
| 1227 | 910 |
| 1228 | 1384 |
| 1229 | 1563 |
| 1230 | 815 |
| 1231 | 1135 |
| 1232 | 976 |
| 1233 | 1355 |
| 1234 | 1238 |
| 1235 | 870 |
| 1236 | 1333 |
| 1237 | 917 |
| 1238 | 1212 |
| 1239 | 1473 |
| 1240 | 727 |
| 1241 | 1241 |
| 1242 | 493 |
| 1243 | 1432 |
| 1244 | 873 |
| 1245 | 1633 |
| 1246 | 1620 |
| 1247 | 701 |
| 1248 | 1575 |
| 1249 | 931 |
| 1250 | 1674 |
| 1251 | 1253 |
| 1252 | 756 |
| 1253 | 1183 |
| 1254 | 860 |
| 1255 | 1444 |
| 1256 | 1334 |
| 1257 | 499 |
| 1258 | 1565 |
| 1259 | 731 |
| 1260 | 1797 |
| 1261 | 1634 |
| 1262 | 823 |
| 1263 | 1681 |
| 1264 | 922 |
| 1265 | 1357 |
| 1266 | 1143 |
| 1267 | 874 |
| 1268 | 1624 |
| 1269 | 918 |
| 1270 | 1363 |
| 1271 | 1242 |
| 1272 | 502 |
| 1273 | 1392 |
| 1274 | 933 |
| 1275 | 1676 |
| 1276 | 1254 |
| 1277 | 743 |
| 1278 | 1415 |
| 1279 | 1337 |
| 1280 | 760 |
| 1281 | 1474 |
| 1282 | 881 |
| 1283 | 1566 |
| 1284 | 1358 |
| 1285 | 494 |
| 1286 | 1257 |
| 1287 | 702 |
| 1288 | 1579 |
| 1289 | 1798 |
| 1290 | 921 |
| 1291 | 1199 |
| 1292 | 501 |
| 1293 | 1147 |
| 1294 | 1682 |
| 1295 | 876 |
| 1296 | 1636 |
| 1297 | 1365 |
| 1298 | 847 |
| 1299 | 1801 |
| 1300 | 992 |
| 1301 | 1244 |

TABLE Q3-continued

| with a sequence length of 2048: | |
|---|---|
| Reliability or reliability sequence number | Polarized channel sequence number |
| 1302 | 1338 |
| 1303 | 447 |
| 1304 | 1448 |
| 1305 | 1419 |
| 1306 | 733 |
| 1307 | 1697 |
| 1308 | 827 |
| 1309 | 1607 |
| 1310 | 1379 |
| 1311 | 934 |
| 1312 | 1311 |
| 1313 | 1207 |
| 1314 | 882 |
| 1315 | 1258 |
| 1316 | 937 |
| 1317 | 1149 |
| 1318 | 1581 |
| 1319 | 963 |
| 1320 | 1684 |
| 1321 | 1640 |
| 1322 | 747 |
| 1323 | 1366 |
| 1324 | 505 |
| 1325 | 1340 |
| 1326 | 1265 |
| 1327 | 855 |
| 1328 | 1802 |
| 1329 | 1587 |
| 1330 | 924 |
| 1331 | 1369 |
| 1332 | 734 |
| 1333 | 1476 |
| 1334 | 1421 |
| 1335 | 829 |
| 1336 | 1427 |
| 1337 | 1231 |
| 1338 | 965 |
| 1339 | 1698 |
| 1340 | 1582 |
| 1341 | 938 |
| 1342 | 1809 |
| 1343 | 1456 |
| 1344 | 884 |
| 1345 | 1381 |
| 1346 | 506 |
| 1347 | 1211 |
| 1348 | 1260 |
| 1349 | 749 |
| 1350 | 1688 |
| 1351 | 1648 |
| 1352 | 945 |
| 1353 | 1611 |
| 1354 | 1804 |
| 1355 | 966 |
| 1356 | 1729 |
| 1357 | 1150 |
| 1358 | 755 |
| 1359 | 1266 |
| 1360 | 859 |
| 1361 | 1589 |
| 1362 | 1422 |
| 1363 | 940 |
| 1364 | 1370 |
| 1365 | 1480 |
| 1366 | 830 |
| 1367 | 1382 |
| 1368 | 1429 |
| 1369 | 911 |
| 1370 | 1327 |
| 1371 | 1593 |
| 1372 | 871 |
| 1373 | 1268 |
| 1374 | 1619 |
| 1375 | 639 |
| 1376 | 1213 |

TABLE Q3-continued

| with a sequence length of 2048: | |
|---|---|
| Reliability or reliability sequence number | Polarized channel sequence number |
| 1377 | 1590 |
| 1378 | 888 |
| 1379 | 1700 |
| 1380 | 1385 |
| 1381 | 479 |
| 1382 | 1730 |
| 1383 | 1613 |
| 1384 | 946 |
| 1385 | 1239 |
| 1386 | 750 |
| 1387 | 1810 |
| 1388 | 1671 |
| 1389 | 969 |
| 1390 | 1372 |
| 1391 | 1443 |
| 1392 | 508 |
| 1393 | 1430 |
| 1394 | 1488 |
| 1395 | 861 |
| 1396 | 1704 |
| 1397 | 1825 |
| 1398 | 757 |
| 1399 | 1386 |
| 1400 | 1614 |
| 1401 | 970 |
| 1402 | 1433 |
| 1403 | 1594 |
| 1404 | 919 |
| 1405 | 1812 |
| 1406 | 1621 |
| 1407 | 1596 |
| 1408 | 875 |
| 1409 | 1243 |
| 1410 | 1335 |
| 1411 | 862 |
| 1412 | 1732 |
| 1413 | 1622 |
| 1414 | 758 |
| 1415 | 1625 |
| 1416 | 1675 |
| 1417 | 948 |
| 1418 | 1445 |
| 1419 | 1816 |
| 1420 | 977 |
| 1421 | 1826 |
| 1422 | 1635 |
| 1423 | 923 |
| 1424 | 1626 |
| 1425 | 1434 |
| 1426 | 972 |
| 1427 | 1255 |
| 1428 | 1712 |
| 1429 | 761 |
| 1430 | 1677 |
| 1431 | 1272 |
| 1432 | 877 |
| 1433 | 1393 |
| 1434 | 1214 |
| 1435 | 1388 |
| 1436 | 952 |
| 1437 | 1678 |
| 1438 | 1683 |
| 1439 | 495 |
| 1440 | 1359 |
| 1441 | 1504 |
| 1442 | 703 |
| 1443 | 1339 |
| 1444 | 1245 |
| 1445 | 935 |
| 1446 | 1394 |
| 1447 | 1637 |
| 1448 | 978 |
| 1449 | 1446 |
| 1450 | 1449 |
| 1451 | 1475 |

TABLE Q3-continued

| with a sequence length of 2048: | |
|---|---|
| Reliability or reliability sequence number | Polarized channel sequence number |
| 1452 | 883 |
| 1453 | 1638 |
| 1454 | 1567 |
| 1455 | 762 |
| 1456 | 1259 |
| 1457 | 1436 |
| 1458 | 503 |
| 1459 | 1367 |
| 1460 | 1396 |
| 1461 | 925 |
| 1462 | 1799 |
| 1463 | 1341 |
| 1464 | 1246 |
| 1465 | 878 |
| 1466 | 1450 |
| 1467 | 1477 |
| 1468 | 735 |
| 1469 | 1261 |
| 1470 | 1583 |
| 1471 | 1857 |
| 1472 | 993 |
| 1473 | 1828 |
| 1474 | 1736 |
| 1475 | 885 |
| 1476 | 1858 |
| 1477 | 1685 |
| 1478 | 939 |
| 1479 | 1832 |
| 1480 | 1803 |
| 1481 | 1641 |
| 1482 | 994 |
| 1483 | 1628 |
| 1484 | 1457 |
| 1485 | 980 |
| 1486 | 1744 |
| 1487 | 1840 |
| 1488 | 1860 |
| 1489 | 926 |
| 1490 | 1371 |
| 1491 | 1921 |
| 1492 | 764 |
| 1493 | 1267 |
| 1494 | 1686 |
| 1495 | 1478 |
| 1496 | 941 |
| 1497 | 1342 |
| 1498 | 1699 |
| 1499 | 967 |
| 1500 | 1642 |
| 1501 | 1922 |
| 1502 | 1805 |
| 1503 | 886 |
| 1504 | 1400 |
| 1505 | 1452 |
| 1506 | 831 |
| 1507 | 1689 |
| 1508 | 1760 |
| 1509 | 1591 |
| 1510 | 947 |
| 1511 | 1864 |
| 1512 | 1649 |
| 1513 | 507 |
| 1514 | 1262 |
| 1515 | 1383 |
| 1516 | 1481 |
| 1517 | 889 |
| 1518 | 1423 |
| 1519 | 1811 |
| 1520 | 1615 |
| 1521 | 984 |
| 1522 | 1702 |
| 1523 | 1458 |
| 1524 | 751 |
| 1525 | 1701 |
| 1526 | 1373 |

TABLE Q3-continued

| with a sequence length of 2048: | |
|---|---|
| Reliability or reliability sequence number | Polarized channel sequence number |
| 1527 | 1269 |
| 1528 | 942 |
| 1529 | 1482 |
| 1530 | 1690 |
| 1531 | 1644 |
| 1532 | 996 |
| 1533 | 1387 |
| 1534 | 1151 |
| 1535 | 1215 |
| 1536 | 971 |
| 1537 | 1806 |
| 1538 | 1431 |
| 1539 | 890 |
| 1540 | 1460 |
| 1541 | 1650 |
| 1542 | 1595 |
| 1543 | 509 |
| 1544 | 1489 |
| 1545 | 1705 |
| 1546 | 1270 |
| 1547 | 949 |
| 1548 | 1731 |
| 1549 | 1374 |
| 1550 | 1623 |
| 1551 | 973 |
| 1552 | 1692 |
| 1553 | 1814 |
| 1554 | 1484 |
| 1555 | 1000 |
| 1556 | 1273 |
| 1557 | 1706 |
| 1558 | 1597 |
| 1559 | 892 |
| 1560 | 1435 |
| 1561 | 1827 |
| 1562 | 1813 |
| 1563 | 950 |
| 1564 | 1733 |
| 1565 | 1389 |
| 1566 | 1464 |
| 1567 | 863 |
| 1568 | 1652 |
| 1569 | 1713 |
| 1570 | 1398 |
| 1571 | 759 |
| 1572 | 1447 |
| 1573 | 1490 |
| 1574 | 1817 |
| 1575 | 1008 |
| 1576 | 1274 |
| 1577 | 1395 |
| 1578 | 1505 |
| 1579 | 510 |
| 1580 | 1598 |
| 1581 | 1437 |
| 1582 | 1627 |
| 1583 | 979 |
| 1584 | 1390 |
| 1585 | 1492 |
| 1586 | 1679 |
| 1587 | 953 |
| 1588 | 1924 |
| 1589 | 1829 |
| 1590 | 1639 |
| 1591 | 763 |
| 1592 | 1708 |
| 1593 | 1734 |
| 1594 | 1453 |
| 1595 | 974 |
| 1596 | 1818 |
| 1597 | 1276 |
| 1598 | 1397 |
| 1599 | 1629 |
| 1600 | 954 |
| 1601 | 1872 |

TABLE Q3-continued

| with a sequence length of 2048: | |
|---|---|
| Reliability or reliability sequence number | Polarized channel sequence number |
| 1602 | 1714 |
| 1603 | 1737 |
| 1604 | 879 |
| 1605 | 1656 |
| 1606 | 1506 |
| 1607 | 1830 |
| 1608 | 981 |
| 1609 | 1451 |
| 1610 | 1928 |
| 1611 | 1438 |
| 1612 | 982 |
| 1613 | 1247 |
| 1614 | 1687 |
| 1615 | 1716 |
| 1616 | 1859 |
| 1617 | 927 |
| 1618 | 1643 |
| 1619 | 1496 |
| 1620 | 1479 |
| 1621 | 995 |
| 1622 | 1820 |
| 1623 | 1833 |
| 1624 | 1738 |
| 1625 | 1745 |
| 1626 | 765 |
| 1627 | 1861 |
| 1628 | 1740 |
| 1629 | 1888 |
| 1630 | 956 |
| 1631 | 1834 |
| 1632 | 1630 |
| 1633 | 1936 |
| 1634 | 1746 |
| 1635 | 887 |
| 1636 | 1720 |
| 1637 | 1401 |
| 1638 | 1459 |
| 1639 | 1841 |
| 1640 | 985 |
| 1641 | 1343 |
| 1642 | 1645 |
| 1643 | 1836 |
| 1644 | 997 |
| 1645 | 1508 |
| 1646 | 1454 |
| 1647 | 1862 |
| 1648 | 1691 |
| 1649 | 986 |
| 1650 | 1512 |
| 1651 | 1263 |
| 1652 | 1402 |
| 1653 | 1483 |
| 1654 | 943 |
| 1655 | 1646 |
| 1656 | 1651 |
| 1657 | 1461 |
| 1658 | 1404 |
| 1659 | 891 |
| 1660 | 1842 |
| 1661 | 1485 |
| 1662 | 1520 |
| 1663 | 1693 |
| 1664 | 998 |
| 1665 | 1703 |
| 1666 | 1748 |
| 1667 | 1865 |
| 1668 | 766 |
| 1669 | 1653 |
| 1670 | 1375 |
| 1671 | 1491 |
| 1672 | 1462 |
| 1673 | 511 |
| 1674 | 1761 |
| 1675 | 1275 |
| 1676 | 1486 |

TABLE Q3-continued

| with a sequence length of 2048: | |
|---|---|
| Reliability or reliability sequence number | Polarized channel sequence number |
| 1677 | 1466 |
| 1678 | 1465 |
| 1679 | 988 |
| 1680 | 1493 |
| 1681 | 1271 |
| 1682 | 1707 |
| 1683 | 1866 |
| 1684 | 1001 |
| 1685 | 1762 |
| 1686 | 1923 |
| 1687 | 1694 |
| 1688 | 1807 |
| 1689 | 951 |
| 1690 | 1873 |
| 1691 | 1844 |
| 1692 | 1752 |
| 1693 | 1952 |
| 1694 | 1002 |
| 1695 | 1815 |
| 1696 | 1391 |
| 1697 | 1925 |
| 1698 | 1654 |
| 1699 | 1709 |
| 1700 | 893 |
| 1701 | 1868 |
| 1702 | 1657 |
| 1703 | 1735 |
| 1704 | 1277 |
| 1705 | 975 |
| 1706 | 1715 |
| 1707 | 1848 |
| 1708 | 1926 |
| 1709 | 1710 |
| 1710 | 894 |
| 1711 | 1764 |
| 1712 | 1874 |
| 1713 | 1399 |
| 1714 | 1468 |
| 1715 | 1494 |
| 1716 | 1009 |
| 1717 | 1507 |
| 1718 | 1439 |
| 1719 | 1509 |
| 1720 | 1929 |
| 1721 | 1819 |
| 1722 | 955 |
| 1723 | 1497 |
| 1724 | 1658 |
| 1725 | 1768 |
| 1726 | 1876 |
| 1727 | 1984 |
| 1728 | 1004 |
| 1729 | 1889 |
| 1730 | 1717 |
| 1731 | 1821 |
| 1732 | 1930 |
| 1733 | 1010 |
| 1734 | 1739 |
| 1735 | 1831 |
| 1736 | 1498 |
| 1737 | 1660 |
| 1738 | 1718 |
| 1739 | 957 |
| 1740 | 1278 |
| 1741 | 1741 |
| 1742 | 1599 |
| 1743 | 1937 |
| 1744 | 1822 |
| 1745 | 983 |
| 1746 | 1835 |
| 1747 | 1403 |
| 1748 | 1721 |
| 1749 | 1455 |
| 1750 | 1631 |
| 1751 | 1513 |

TABLE Q3-continued

| with a sequence length of 2048: | |
|---|---|
| Reliability or reliability sequence number | Polarized channel sequence number |
| 1752 | 958 |
| 1753 | 1890 |
| 1754 | 1747 |
| 1755 | 1510 |
| 1756 | 1932 |
| 1757 | 1742 |
| 1758 | 987 |
| 1759 | 1837 |
| 1760 | 1500 |
| 1761 | 1880 |
| 1762 | 1863 |
| 1763 | 1749 |
| 1764 | 1012 |
| 1765 | 1722 |
| 1766 | 1938 |
| 1767 | 1776 |
| 1768 | 1892 |
| 1769 | 1843 |
| 1770 | 1838 |
| 1771 | 999 |
| 1772 | 1463 |
| 1773 | 1953 |
| 1774 | 1514 |
| 1775 | 1647 |
| 1776 | 1695 |
| 1777 | 1763 |
| 1778 | 1016 |
| 1779 | 1940 |
| 1780 | 1487 |
| 1781 | 1867 |
| 1782 | 1405 |
| 1783 | 1521 |
| 1784 | 767 |
| 1785 | 1954 |
| 1786 | 1845 |
| 1787 | 1750 |
| 1788 | 1985 |
| 1789 | 1896 |
| 1790 | 1516 |
| 1791 | 1655 |
| 1792 | 989 |
| 1793 | 1753 |
| 1794 | 1724 |
| 1795 | 1467 |
| 1796 | 1765 |
| 1797 | 1869 |
| 1798 | 1944 |
| 1799 | 1003 |
| 1800 | 1406 |
| 1801 | 1846 |
| 1802 | 1875 |
| 1803 | 1754 |
| 1804 | 1522 |
| 1805 | 1904 |
| 1806 | 990 |
| 1807 | 1766 |
| 1808 | 1469 |
| 1809 | 1495 |
| 1810 | 1659 |
| 1811 | 1956 |
| 1812 | 1711 |
| 1813 | 1927 |
| 1814 | 1005 |
| 1815 | 1849 |
| 1816 | 1524 |
| 1817 | 1870 |
| 1818 | 1769 |
| 1819 | 1850 |
| 1820 | 1756 |
| 1821 | 1470 |
| 1822 | 959 |
| 1823 | 1986 |
| 1824 | 1960 |
| 1825 | 1499 |
| 1826 | 1877 |

TABLE Q3-continued

| with a sequence length of 2048: | |
|---|---|
| Reliability or reliability sequence number | Polarized channel sequence number |
| 1827 | 1891 |
| 1828 | 1661 |
| 1829 | 1931 |
| 1830 | 1011 |
| 1831 | 1511 |
| 1832 | 1719 |
| 1833 | 1770 |
| 1834 | 1852 |
| 1835 | 1777 |
| 1836 | 1878 |
| 1837 | 1881 |
| 1838 | 1013 |
| 1839 | 1528 |
| 1840 | 1823 |
| 1841 | 1279 |
| 1842 | 1988 |
| 1843 | 1933 |
| 1844 | 1743 |
| 1845 | 1501 |
| 1846 | 1939 |
| 1847 | 895 |
| 1848 | 1662 |
| 1849 | 1772 |
| 1850 | 1968 |
| 1851 | 1893 |
| 1852 | 1515 |
| 1853 | 1723 |
| 1854 | 1778 |
| 1855 | 1882 |
| 1856 | 1006 |
| 1857 | 1502 |
| 1858 | 1992 |
| 1859 | 1407 |
| 1860 | 1934 |
| 1861 | 1839 |
| 1862 | 2000 |
| 1863 | 1894 |
| 1864 | 1941 |
| 1865 | 1014 |
| 1866 | 1751 |
| 1867 | 1517 |
| 1868 | 1897 |
| 1869 | 1725 |
| 1870 | 1955 |
| 1871 | 1780 |
| 1872 | 1884 |
| 1873 | 1523 |
| 1874 | 1755 |
| 1875 | 1017 |
| 1876 | 1847 |
| 1877 | 1946 |
| 1878 | 1898 |
| 1879 | 1942 |
| 1880 | 1526 |
| 1881 | 1957 |
| 1882 | 1767 |
| 1883 | 1784 |
| 1884 | 1905 |
| 1885 | 1018 |
| 1886 | 1518 |
| 1887 | 1726 |
| 1888 | 1945 |
| 1889 | 1525 |
| 1890 | 1900 |
| 1891 | 1871 |
| 1892 | 2016 |
| 1893 | 1471 |
| 1894 | 1757 |
| 1895 | 1851 |
| 1896 | 991 |
| 1897 | 1958 |
| 1898 | 1906 |
| 1899 | 1961 |
| 1900 | 1987 |
| 1901 | 1771 |

TABLE Q3-continued

| with a sequence length of 2048: | |
|---|---|
| Reliability or reliability sequence number | Polarized channel sequence number |
| 1902 | 1529 |
| 1903 | 1879 |
| 1904 | 1948 |
| 1905 | 1758 |
| 1906 | 1853 |
| 1907 | 1020 |
| 1908 | 1989 |
| 1909 | 1962 |
| 1910 | 1908 |
| 1911 | 1530 |
| 1912 | 1773 |
| 1913 | 1969 |
| 1914 | 1990 |
| 1915 | 1779 |
| 1916 | 1883 |
| 1917 | 1964 |
| 1918 | 1854 |
| 1919 | 1935 |
| 1920 | 1007 |
| 1921 | 1895 |
| 1922 | 1663 |
| 1923 | 1912 |
| 1924 | 1503 |
| 1925 | 1970 |
| 1926 | 1774 |
| 1927 | 1993 |
| 1928 | 1532 |
| 1929 | 1885 |
| 1930 | 1781 |
| 1931 | 1994 |
| 1932 | 1943 |
| 1933 | 1015 |
| 1934 | 1899 |
| 1935 | 1886 |
| 1936 | 1782 |
| 1937 | 1972 |
| 1938 | 2001 |
| 1939 | 1947 |
| 1940 | 1996 |
| 1941 | 1785 |
| 1942 | 1901 |
| 1943 | 1976 |
| 1944 | 1519 |
| 1945 | 1727 |
| 1946 | 1959 |
| 1947 | 2002 |
| 1948 | 1019 |
| 1949 | 1907 |
| 1950 | 1786 |
| 1951 | 1527 |
| 1952 | 1949 |
| 1953 | 1902 |
| 1954 | 1759 |
| 1955 | 2017 |
| 1956 | 1909 |
| 1957 | 1963 |
| 1958 | 2018 |
| 1959 | 2004 |
| 1960 | 1950 |
| 1961 | 1788 |
| 1962 | 1965 |
| 1963 | 1991 |
| 1964 | 1021 |
| 1965 | 1910 |
| 1966 | 1855 |
| 1967 | 1971 |
| 1968 | 1531 |
| 1969 | 1913 |
| 1970 | 2008 |
| 1971 | 1775 |
| 1972 | 1966 |
| 1973 | 2020 |
| 1974 | 1995 |
| 1975 | 1914 |
| 1976 | 1533 |

TABLE Q3-continued

| with a sequence length of 2048: | |
|---|---|
| Reliability or reliability sequence number | Polarized channel sequence number |
| 1977 | 1973 |
| 1978 | 1997 |
| 1979 | 2024 |
| 1980 | 1916 |
| 1981 | 1974 |
| 1982 | 1887 |
| 1983 | 1783 |
| 1984 | 1022 |
| 1985 | 2032 |
| 1986 | 1534 |
| 1987 | 2003 |
| 1988 | 1977 |
| 1989 | 1787 |
| 1990 | 1998 |
| 1991 | 1978 |
| 1992 | 1903 |
| 1993 | 2005 |
| 1994 | 2006 |
| 1995 | 1951 |
| 1996 | 2019 |
| 1997 | 1789 |
| 1998 | 1980 |
| 1999 | 1911 |
| 2000 | 2009 |
| 2001 | 2021 |
| 2002 | 2010 |
| 2003 | 1967 |
| 2004 | 1915 |
| 2005 | 2022 |
| 2006 | 1790 |
| 2007 | 1535 |
| 2008 | 1023 |
| 2009 | 2012 |
| 2010 | 2025 |
| 2011 | 1975 |
| 2012 | 2026 |
| 2013 | 1917 |
| 2014 | 1999 |
| 2015 | 1918 |
| 2016 | 2033 |
| 2017 | 1979 |
| 2018 | 2028 |
| 2019 | 2034 |
| 2020 | 1981 |
| 2021 | 2007 |
| 2022 | 1982 |
| 2023 | 2011 |
| 2024 | 2036 |
| 2025 | 2023 |
| 2026 | 2040 |
| 2027 | 1791 |
| 2028 | 2013 |
| 2029 | 2027 |
| 2030 | 2014 |
| 2031 | 2029 |
| 2032 | 1983 |
| 2033 | 2035 |
| 2034 | 2037 |
| 2035 | 1919 |
| 2036 | 2030 |
| 2037 | 2038 |
| 2038 | 2041 |
| 2039 | 2042 |
| 2040 | 2015 |
| 2041 | 2044 |
| 2042 | 2031 |
| 2043 | 2039 |
| 2044 | 2043 |
| 2045 | 2045 |
| 2046 | 2046 |
| 2047 | 2047 |

Sequence Q4, with a sequence length of 1024

[0, 1, 2, 4, 8, 16, 32, 3, 5, 64, 9, 6, 17, 10, 18, 128, 12, 33, 65, 20, 256, 34, 24, 36, 7, 129, 6 6, 512, 11, 40, 68, 130, 19, 13, 48, 14, 72, 257, 21, 132, 35, 258, 26, 513, 80, 37, 25, 22, 136, 260, 26 4, 38, 514, 96, 67, 41, 144, 28, 69, 42, 516, 49, 74, 272, 160, 520, 288, 528, 192, 544, 70, 44, 131, 8 1, 50, 73, 15, 320, 133, 52, 23, 134, 384, 76, 137, 82, 56, 27, 97, 39, 259, 84, 138, 145, 261, 29, 43, 9 8, 515, 88, 140, 30, 146, 71, 262, 265, 161, 576, 45, 100, 640, 51, 148, 46, 75, 266, 273, 517, 104, 1 62, 53, 193, 152, 77, 164, 768, 268, 274, 518, 54, 83, 57, 521, 112, 135, 78, 289, 194, 85, 276, 522, 58, 168, 139, 99, 86, 60, 280, 89, 290, 529, 524, 196, 141, 101, 147, 176, 142, 530, 321, 31, 200, 9 0, 545, 292, 322, 532, 263, 149, 102, 105, 304, 296, 163, 92, 47, 267, 385, 546, 324, 208, 386, 150, 153, 165, 106, 55, 328, 536, 577, 548, 113, 154, 79, 269, 108, 578, 224, 166, 519, 552, 195, 270, 641, 523, 275, 580, 291, 59, 169, 560, 114, 277, 156, 87, 197, 116, 170, 61, 531, 525, 642, 281, 27 8, 526, 177, 293, 388, 91, 584, 769, 198, 172, 120, 201, 336, 62, 282, 143, 103, 178, 294, 93, 644, 202, 592, 323, 392, 297, 770, 107, 180, 151, 209, 284, 648, 94, 204, 298, 400, 608, 352, 325, 533, 155, 210, 305, 547, 300, 109, 184, 534, 537, 115, 167, 225, 326, 306, 772, 157, 656, 329, 110, 11 7, 212, 171, 776, 330, 226, 549, 538, 387, 308, 216, 416, 271, 279, 158, 337, 550, 672, 118, 332, 5 79, 540, 389, 173, 121, 553, 199, 784, 179, 228, 338, 312, 704, 390, 174, 554, 581, 393, 283, 122, 448, 353, 561, 203, 63, 340, 394, 527, 582, 556, 181, 295, 285, 232, 124, 205, 182, 643, 562, 286, 585, 299, 354, 211, 401, 185, 396, 344, 586, 645, 593, 535, 240, 206, 95, 327, 564, 800, 402, 356, 307, 301, 417, 213, 568, 832, 588, 186, 646, 404, 227, 896, 594, 418, 302, 649, 771, 360, 539, 11 1, 331, 214, 309, 188, 449, 217, 408, 609, 596, 551, 650, 229, 159, 420, 310, 541, 773, 610, 657, 3 33, 119, 600, 339, 218, 368, 652, 230, 391, 313, 450, 542, 334, 233, 555, 774, 175, 123, 658, 612, 341, 777, 220, 314, 424, 395, 673, 583, 355, 287, 183, 234, 125, 557, 660, 616, 342, 316, 241, 77 8, 563, 345, 452, 397, 403, 207, 674, 558, 785, 432, 357, 187, 236, 664, 624, 587, 780, 705, 126, 2 42, 565, 398, 346, 456, 358, 405, 303, 569, 244, 595, 189, 566, 676, 361, 706, 589, 215, 786, 647, 348, 419, 406, 464, 680, 801, 362, 590, 409, 570, 788, 597, 572, 219, 311, 708, 598, 601, 651, 42 1, 792, 802, 611, 602, 410, 231, 688, 653, 248, 369, 190, 364, 654, 659, 335, 480, 315, 221, 370, 6 13, 422, 425, 451, 614, 543, 235, 412, 343, 372, 775, 317, 222, 426, 453, 237, 559, 833, 804, 712, 834, 661, 808, 779, 617, 604, 433, 720, 816, 836, 347, 897, 243, 662, 454, 318, 675, 618, 898, 78 1, 376, 428, 665, 736, 567, 840, 625, 238, 359, 457, 399, 787, 591, 678, 434, 677, 349, 245, 458, 6 66, 620, 363, 127, 191, 782, 407, 436, 626, 571, 465, 681, 246, 707, 350, 599, 668, 790, 460, 249, 682, 573, 411, 803, 789, 709, 365, 440, 628, 689, 374, 423, 466, 793, 250, 371, 481, 574, 413, 60 3, 366, 468, 655, 900, 805, 615, 684, 710, 429, 794, 252, 373, 605, 848, 690, 713, 632, 482, 806, 4 27, 904, 414, 223, 663, 692, 835, 619, 472, 455, 796, 809, 714, 721, 837, 716, 864, 810, 606, 912, 722, 696, 377, 435, 817, 319, 621, 812, 484, 430, 838, 667, 488, 239, 378, 459, 622, 627, 437, 38 0, 818, 461, 496, 669, 679, 724, 841, 629, 351, 467, 438, 737, 251, 462, 442, 441, 469, 247, 683, 8 42, 738, 899, 670, 783, 849, 820, 728, 928, 791, 367, 901, 630, 685, 844, 633, 711, 253, 691, 824, 902, 686, 740, 850, 375, 444, 470, 483, 415, 485, 905, 795, 473, 634, 744, 852, 960, 865, 693, 79 7, 906, 715, 807, 474, 636, 694, 254, 717, 575, 913, 798, 811, 379, 697, 431, 607, 489, 866, 723, 4 86, 908, 718, 813, 476, 856, 839, 725, 698, 914, 752, 868, 819, 814, 439, 929, 490, 623, 671, 739, 916, 463, 843, 381, 497, 930, 821, 726, 96, 872, 492, 631, 872, 492, 631, 729, 700, 443, 741, 845, 920, 382, 82 2, 851, 730, 498, 880, 742, 445, 471, 635, 932, 687, 903, 825, 500, 846, 745, 826, 732, 446, 962, 9 36, 475, 853, 867, 637, 907, 487, 695, 746, 828, 753, 854, 857, 504, 799, 255, 964, 909, 719, 477, 915, 638, 748, 944, 869, 491, 699, 754, 858, 478, 968, 383, 910, 815, 976, 870, 917, 727, 493, 87 3, 701, 931, 756, 860, 499, 731, 823, 922, 874, 918, 502, 933, 743, 760, 881, 494, 702, 921, 501, 8 76, 847, 992, 447, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 91 9, 875, 862, 758, 948, 977, 923, 972, 761, 877, 952, 495, 703, 935, 978, 883, 762, 503, 925, 878, 7 35, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 95 9, 1011, 1013, 895, 1006, 1014, 1017, 1018, 991, 1020, 1007, 1015, 1019, 1021, 1022, 1023]

TABLE Q4 with a sequence length of 1024:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 513 |
| 44 | 80 |

TABLE Q4-continued with a sequence length of 1024:

| Reliability or reliability sequence number | Polarized channel sequence number |
|---|---|
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |

TABLE Q4-continued

| with a sequence length of 1024: | |
|---|---|
| Reliability or reliability sequence number | Polarized channel sequence number |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |
| 192 | 154 |
| 193 | 79 |
| 194 | 269 |

TABLE Q4-continued

| with a sequence length of 1024: | |
|---|---|
| Reliability or reliability sequence number | Polarized channel sequence number |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |
| 269 | 109 |

TABLE Q4-continued with a sequence length of 1024:

| Reliability or reliability sequence number | Polarized channel sequence number |
|---|---|
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |

TABLE Q4-continued with a sequence length of 1024:

| Reliability or reliability sequence number | Polarized channel sequence number |
|---|---|
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |

TABLE Q4-continued

| with a sequence length of 1024: | |
|---|---|
| Reliability or reliability sequence number | Polarized channel sequence number |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |

TABLE Q4-continued

| with a sequence length of 1024: | |
|---|---|
| Reliability or reliability sequence number | Polarized channel sequence number |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |

TABLE Q4-continued

| with a sequence length of 1024: | |
|---|---|
| Reliability or reliability sequence number | Polarized channel sequence number |
| 570 | 399 |
| 571 | 787 |
| 572 | 591 |
| 573 | 678 |
| 574 | 434 |
| 575 | 677 |
| 576 | 349 |
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |

TABLE Q4-continued

| with a sequence length of 1024: | |
|---|---|
| Reliability or reliability sequence number | Polarized channel sequence number |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 251 |
| 691 | 462 |
| 692 | 442 |
| 693 | 441 |
| 694 | 469 |
| 695 | 247 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |

TABLE Q4-continued

| with a sequence length of 1024: | |
|---|---|
| Reliability or reliability sequence number | Polarized channel sequence number |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |

TABLE Q4-continued

| with a sequence length of 1024: | |
|---|---|
| Reliability or reliability sequence number | Polarized channel sequence number |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |

TABLE Q4-continued

| with a sequence length of 1024: | |
|---|---|
| Reliability or reliability sequence number | Polarized channel sequence number |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |

TABLE Q4-continued

| with a sequence length of 1024: | |
|---|---|
| Reliability or reliability sequence number | Polarized channel sequence number |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |

TABLE Q4-continued

| with a sequence length of 1024: | |
|---|---|
| Reliability or reliability sequence number | Polarized channel sequence number |
| 1020 | 1019 |
| 1021 | 1021 |
| 1022 | 1022 |
| 1023 | 1023 |

Sequence Q5, with a sequence length of 512:

[0, 1, 2, 4, 8, 16, 32, 3, 5, 64, 9, 6, 17, 10, 18, 128, 12, 33, 65, 20, 256, 34, 24, 36, 7, 129, 6 6, 11, 40, 68, 130, 19, 13, 48, 14, 72, 257, 21, 132, 35, 258, 26, 80, 37, 25, 22, 136, 260, 264, 38, 96, 67, 41, 144, 28, 69, 42, 49, 74, 272, 160, 288, 192, 70, 44, 131, 81, 50, 73, 15, 320, 133, 52, 23, 134, 384, 76, 137, 82, 56, 27, 97, 39, 259, 84, 138, 145, 261, 29, 43, 98, 88, 140, 30, 146, 71, 262, 265, 1 61, 45, 100, 51, 148, 46, 75, 266, 273, 104, 162, 53, 193, 152, 77, 164, 268, 274, 54, 83, 57, 112, 13 5, 78, 289, 194, 85, 276, 58, 168, 139, 99, 86, 60, 280, 89, 290, 196, 141, 101, 147, 176, 142, 321, 3 1, 200, 90, 292, 322, 263, 149, 102, 105, 304, 296, 163, 92, 47, 267, 385, 324, 208, 386, 150, 153, 165, 106, 55, 328, 113, 154, 79, 269, 108, 224, 166, 195, 270, 275, 291, 59, 169, 114, 277, 156, 87, 197, 116, 170, 61, 281, 278, 177, 293, 388, 91, 198, 172, 120, 201, 336, 62, 282, 143, 103, 178, 2 94, 93, 202, 323, 392, 297, 107, 180, 151, 209, 284, 94, 204, 298, 400, 352, 325, 155, 210, 305, 30 0, 109, 184, 115, 167, 225, 326, 306, 157, 329, 110, 117, 212, 171, 330, 226, 387, 308, 216, 416, 2 71, 279, 158, 337, 118, 332, 389, 173, 121, 199, 179, 228, 338, 312, 390, 174, 393, 283, 122, 448, 353, 203, 63, 340, 394, 181, 295, 285, 232, 124, 205, 182, 286, 299, 354, 211, 401, 185, 396, 344, 240, 206, 95, 327, 402, 356, 307, 301, 417, 213, 186, 404, 227, 418, 302, 360, 111, 331, 214, 309, 188, 449, 217, 408, 229, 159, 420, 310, 333, 119, 339, 218, 368, 230, 391, 313, 450, 334, 233, 17 5, 123, 341, 220, 314, 424, 395, 355, 287, 183, 234, 125, 342, 316, 241, 345, 452, 397, 403, 207, 4 32, 357, 187, 236, 126, 242, 398, 346, 456, 358, 405, 303, 244, 189, 361, 215, 348, 419, 406, 464, 362, 409, 219, 311, 421, 410, 231, 248, 369, 190, 364, 335, 480, 315, 221, 370, 422, 425, 451, 23 5, 412, 343, 372, 317, 222, 426, 453, 237, 433, 347, 243, 454, 318, 376, 428, 238, 359, 457, 399, 4 34, 349, 245, 458, 363, 127, 191, 407, 436, 465, 246, 350, 460, 249, 411, 365, 440, 374, 423, 466, 250, 371, 481, 413, 366, 468, 429, 252, 373, 482, 427, 414, 223, 472, 455, 377, 435, 319, 484, 43 0, 488, 239, 378, 459, 437, 380, 461, 496, 351, 467, 438, 251, 4642, 441, 469, 247, 367, 253, 3 75, 444, 470, 483, 415, 485, 473, 474, 254, 379, 431, 489, 486, 476, 439, 490, 463, 381, 497, 492, 443, 382, 498, 445, 471, 500, 446, 475, 487, 504, 255, 477, 491, 478, 383, 493, 499, 502, 494, 50 1, 447, 505, 506, 479, 508, 495, 503, 507, 509, 510, 511]

TABLE Q5

| with a sequence length of 512: | |
|---|---|
| Reliability or reliability sequence number | Polarized channel sequence number |
| 0 | 0 |
| 1 | 1 |
| 2 | 2 |

TABLE Q5-continued

| with a sequence length of 512: | |
|---|---|
| Reliability or reliability sequence number | Polarized channel sequence number |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 11 |
| 28 | 40 |
| 29 | 68 |
| 30 | 130 |
| 31 | 19 |
| 32 | 13 |
| 33 | 48 |
| 34 | 14 |
| 35 | 72 |
| 36 | 257 |
| 37 | 21 |
| 38 | 132 |
| 39 | 35 |
| 40 | 258 |
| 41 | 26 |
| 42 | 80 |
| 43 | 37 |
| 44 | 25 |
| 45 | 22 |
| 46 | 136 |
| 47 | 260 |
| 48 | 264 |
| 49 | 38 |
| 50 | 96 |
| 51 | 67 |
| 52 | 41 |
| 53 | 144 |
| 54 | 28 |
| 55 | 69 |
| 56 | 42 |
| 57 | 49 |
| 58 | 74 |
| 59 | 272 |
| 60 | 160 |
| 61 | 288 |
| 62 | 192 |
| 63 | 70 |
| 64 | 44 |
| 65 | 131 |
| 66 | 81 |
| 67 | 50 |
| 68 | 73 |
| 69 | 15 |
| 70 | 320 |
| 71 | 133 |
| 72 | 52 |
| 73 | 23 |
| 74 | 134 |
| 75 | 384 |
| 76 | 76 |
| 77 | 137 |

TABLE Q5-continued

| with a sequence length of 512: | |
|---|---|
| Reliability or reliability sequence number | Polarized channel sequence number |
| 78 | 82 |
| 79 | 56 |
| 80 | 27 |
| 81 | 97 |
| 82 | 39 |
| 83 | 259 |
| 84 | 84 |
| 85 | 138 |
| 86 | 145 |
| 87 | 261 |
| 88 | 29 |
| 89 | 43 |
| 90 | 98 |
| 91 | 88 |
| 92 | 140 |
| 93 | 30 |
| 94 | 146 |
| 95 | 71 |
| 96 | 262 |
| 97 | 265 |
| 98 | 161 |
| 99 | 45 |
| 100 | 100 |
| 101 | 51 |
| 102 | 148 |
| 103 | 46 |
| 104 | 75 |
| 105 | 266 |
| 106 | 273 |
| 107 | 104 |
| 108 | 162 |
| 109 | 53 |
| 110 | 193 |
| 111 | 152 |
| 112 | 77 |
| 113 | 164 |
| 114 | 268 |
| 115 | 274 |
| 116 | 54 |
| 117 | 83 |
| 118 | 57 |
| 119 | 112 |
| 120 | 135 |
| 121 | 78 |
| 122 | 289 |
| 123 | 194 |
| 124 | 85 |
| 125 | 276 |
| 126 | 58 |
| 127 | 168 |
| 128 | 139 |
| 129 | 99 |
| 130 | 86 |
| 131 | 60 |
| 132 | 280 |
| 133 | 89 |
| 134 | 290 |
| 135 | 196 |
| 136 | 141 |
| 137 | 101 |
| 138 | 147 |
| 139 | 176 |
| 140 | 142 |
| 141 | 321 |
| 142 | 31 |
| 143 | 200 |
| 144 | 90 |
| 145 | 292 |
| 146 | 322 |
| 147 | 263 |
| 148 | 149 |
| 149 | 102 |
| 150 | 105 |
| 151 | 304 |
| 152 | 296 |

TABLE Q5-continued

| with a sequence length of 512: | |
|---|---|
| Reliability or reliability sequence number | Polarized channel sequence number |
| 153 | 163 |
| 154 | 92 |
| 155 | 47 |
| 156 | 267 |
| 157 | 385 |
| 158 | 324 |
| 159 | 208 |
| 160 | 386 |
| 161 | 150 |
| 162 | 153 |
| 163 | 165 |
| 164 | 106 |
| 165 | 55 |
| 166 | 328 |
| 167 | 113 |
| 168 | 154 |
| 169 | 79 |
| 170 | 269 |
| 171 | 108 |
| 172 | 224 |
| 173 | 166 |
| 174 | 195 |
| 175 | 270 |
| 176 | 275 |
| 177 | 291 |
| 178 | 59 |
| 179 | 169 |
| 180 | 114 |
| 181 | 277 |
| 182 | 156 |
| 183 | 87 |
| 184 | 197 |
| 185 | 116 |
| 186 | 170 |
| 187 | 61 |
| 188 | 281 |
| 189 | 278 |
| 190 | 177 |
| 191 | 293 |
| 192 | 388 |
| 193 | 91 |
| 194 | 198 |
| 195 | 172 |
| 196 | 120 |
| 197 | 201 |
| 198 | 336 |
| 199 | 62 |
| 200 | 282 |
| 201 | 143 |
| 202 | 103 |
| 203 | 178 |
| 204 | 294 |
| 205 | 93 |
| 206 | 202 |
| 207 | 323 |
| 208 | 392 |
| 209 | 297 |
| 210 | 107 |
| 211 | 180 |
| 212 | 151 |
| 213 | 209 |
| 214 | 284 |
| 215 | 94 |
| 216 | 204 |
| 217 | 298 |
| 218 | 400 |
| 219 | 352 |
| 220 | 325 |
| 221 | 155 |
| 222 | 210 |
| 223 | 305 |
| 224 | 300 |
| 225 | 109 |
| 226 | 184 |
| 227 | 115 |

TABLE Q5-continued

| with a sequence length of 512: | |
|---|---|
| Reliability or reliability sequence number | Polarized channel sequence number |
| 228 | 167 |
| 229 | 225 |
| 230 | 326 |
| 231 | 306 |
| 232 | 157 |
| 233 | 329 |
| 234 | 110 |
| 235 | 117 |
| 236 | 212 |
| 237 | 171 |
| 238 | 330 |
| 239 | 226 |
| 240 | 387 |
| 241 | 308 |
| 242 | 216 |
| 243 | 416 |
| 244 | 271 |
| 245 | 279 |
| 246 | 158 |
| 247 | 337 |
| 248 | 118 |
| 249 | 332 |
| 250 | 389 |
| 251 | 173 |
| 252 | 121 |
| 253 | 199 |
| 254 | 179 |
| 255 | 228 |
| 256 | 338 |
| 257 | 312 |
| 258 | 390 |
| 259 | 174 |
| 260 | 393 |
| 261 | 283 |
| 262 | 122 |
| 263 | 448 |
| 264 | 353 |
| 265 | 203 |
| 266 | 63 |
| 267 | 340 |
| 268 | 394 |
| 269 | 181 |
| 270 | 295 |
| 271 | 285 |
| 272 | 232 |
| 273 | 124 |
| 274 | 205 |
| 275 | 182 |
| 276 | 286 |
| 277 | 299 |
| 278 | 354 |
| 279 | 211 |
| 280 | 401 |
| 281 | 185 |
| 282 | 396 |
| 283 | 344 |
| 284 | 240 |
| 285 | 206 |
| 286 | 95 |
| 287 | 327 |
| 288 | 402 |
| 289 | 356 |
| 290 | 307 |
| 291 | 301 |
| 292 | 417 |
| 293 | 213 |
| 294 | 186 |
| 295 | 404 |
| 296 | 227 |
| 297 | 418 |
| 298 | 302 |
| 299 | 360 |
| 300 | 111 |
| 301 | 331 |
| 302 | 214 |

TABLE Q5-continued

| with a sequence length of 512: | |
|---|---|
| Reliability or reliability sequence number | Polarized channel sequence number |
| 303 | 309 |
| 304 | 188 |
| 305 | 449 |
| 306 | 217 |
| 307 | 408 |
| 308 | 229 |
| 309 | 159 |
| 310 | 420 |
| 311 | 310 |
| 312 | 333 |
| 313 | 119 |
| 314 | 339 |
| 315 | 218 |
| 316 | 368 |
| 317 | 230 |
| 318 | 391 |
| 319 | 313 |
| 320 | 450 |
| 321 | 334 |
| 322 | 233 |
| 323 | 175 |
| 324 | 123 |
| 325 | 341 |
| 326 | 220 |
| 327 | 314 |
| 328 | 424 |
| 329 | 395 |
| 330 | 355 |
| 331 | 287 |
| 332 | 183 |
| 333 | 234 |
| 334 | 125 |
| 335 | 342 |
| 336 | 316 |
| 337 | 241 |
| 338 | 345 |
| 339 | 452 |
| 340 | 397 |
| 341 | 403 |
| 342 | 207 |
| 343 | 432 |
| 344 | 357 |
| 345 | 187 |
| 346 | 236 |
| 347 | 126 |
| 348 | 242 |
| 349 | 398 |
| 350 | 346 |
| 351 | 456 |
| 352 | 358 |
| 353 | 405 |
| 354 | 303 |
| 355 | 244 |
| 356 | 189 |
| 357 | 361 |
| 358 | 215 |
| 359 | 348 |
| 360 | 419 |
| 361 | 406 |
| 362 | 464 |
| 363 | 362 |
| 364 | 409 |
| 365 | 219 |
| 366 | 311 |
| 367 | 421 |
| 368 | 410 |
| 369 | 231 |
| 370 | 248 |
| 371 | 369 |
| 372 | 190 |
| 373 | 364 |
| 374 | 335 |
| 375 | 480 |
| 376 | 315 |
| 377 | 221 |

TABLE Q5-continued with a sequence length of 512:

| Reliability or reliability sequence number | Polarized channel sequence number |
|---|---|
| 378 | 370 |
| 379 | 422 |
| 380 | 425 |
| 381 | 451 |
| 382 | 235 |
| 383 | 412 |
| 384 | 343 |
| 385 | 372 |
| 386 | 317 |
| 387 | 222 |
| 388 | 426 |
| 389 | 453 |
| 390 | 237 |
| 391 | 433 |
| 392 | 347 |
| 393 | 243 |
| 394 | 454 |
| 395 | 318 |
| 396 | 376 |
| 397 | 428 |
| 398 | 238 |
| 399 | 359 |
| 400 | 457 |
| 401 | 399 |
| 402 | 434 |
| 403 | 349 |
| 404 | 245 |
| 405 | 458 |
| 406 | 363 |
| 407 | 127 |
| 408 | 191 |
| 409 | 407 |
| 410 | 436 |
| 411 | 465 |
| 412 | 246 |
| 413 | 350 |
| 414 | 460 |
| 415 | 249 |
| 416 | 411 |
| 417 | 365 |
| 418 | 440 |
| 419 | 374 |
| 420 | 423 |
| 421 | 466 |
| 422 | 250 |
| 423 | 371 |
| 424 | 481 |
| 425 | 413 |
| 426 | 366 |
| 427 | 468 |
| 428 | 429 |
| 429 | 252 |
| 430 | 373 |
| 431 | 482 |
| 432 | 427 |
| 433 | 414 |
| 434 | 223 |
| 435 | 472 |
| 436 | 455 |
| 437 | 377 |
| 438 | 435 |
| 439 | 319 |
| 440 | 484 |
| 441 | 430 |
| 442 | 488 |
| 443 | 239 |
| 444 | 378 |
| 445 | 459 |
| 446 | 437 |
| 447 | 380 |
| 448 | 461 |
| 449 | 496 |
| 450 | 351 |
| 451 | 467 |
| 452 | 438 |

TABLE Q5-continued with a sequence length of 512:

| Reliability or reliability sequence number | Polarized channel sequence number |
|---|---|
| 453 | 251 |
| 454 | 462 |
| 455 | 442 |
| 456 | 441 |
| 457 | 469 |
| 458 | 247 |
| 459 | 367 |
| 460 | 253 |
| 461 | 375 |
| 462 | 444 |
| 463 | 470 |
| 464 | 483 |
| 465 | 415 |
| 466 | 485 |
| 467 | 473 |
| 468 | 474 |
| 469 | 254 |
| 470 | 379 |
| 471 | 431 |
| 472 | 489 |
| 473 | 486 |
| 474 | 476 |
| 475 | 439 |
| 476 | 490 |
| 477 | 463 |
| 478 | 381 |
| 479 | 497 |
| 480 | 492 |
| 481 | 443 |
| 482 | 382 |
| 483 | 498 |
| 484 | 445 |
| 485 | 471 |
| 486 | 500 |
| 487 | 446 |
| 488 | 475 |
| 489 | 487 |
| 490 | 504 |
| 491 | 255 |
| 492 | 477 |
| 493 | 491 |
| 494 | 478 |
| 495 | 383 |
| 496 | 493 |
| 497 | 499 |
| 498 | 502 |
| 499 | 494 |
| 500 | 501 |
| 501 | 447 |
| 502 | 505 |
| 503 | 506 |
| 504 | 479 |
| 505 | 508 |
| 506 | 495 |
| 507 | 503 |
| 508 | 507 |
| 509 | 509 |
| 510 | 510 |
| 511 | 511 |

Sequence Q6, with a sequence length of 256:

[0, 1, 2, 4, 8, 16, 32, 3, 5, 64, 9, 6, 17, 10, 18, 128, 12, 33, 65, 20, 34, 24, 36, 7, 129, 66, 11, 40, 68, 130, 19, 13, 48, 14, 72, 21, 132, 35, 26, 80, 37, 25, 22, 136, 38, 96, 67, 41, 144, 28, 69, 42, 49, 74, 160, 192, 70, 44, 131, 81, 50, 73, 15, 133, 52, 23, 134, 76, 137, 82, 56, 27, 97, 39, 84, 138, 145, 2 9, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 139, 99, 86, 60, 89, 196, 141, 101, 47, 176, 142, 31, 200, 90, 14 9, 102, 105, 163, 92, 47, 208, 150, 153, 165, 106, 55, 113, 154, 79, 108, 224, 166, 195, 59, 169, 11 4, 156, 87, 197, 116, 170, 61, 177, 91, 198, 172, 120, 201, 62, 143, 103, 178, 93, 202, 107, 180, 15 1, 209, 94, 204, 155, 210, 109, 184, 115, 167, 225, 157, 110, 117, 212, 171, 226, 216, 158, 118, 17 3, 121, 199, 179, 228, 174, 122, 203, 63, 181, 232, 124, 205, 182, 211, 185, 240, 206, 95, 213, 186, 227, 111, 214, 188, 217, 229, 159, 119, 218, 230, 233, 175, 123, 220, 183, 234, 125, 241, 207, 18 7, 236, 126, 242, 244, 189, 215, 219, 231, 248, 190, 221, 235, 222, 237, 243, 238, 245, 127, 191, 2 46, 249, 250, 252, 223, 239, 251, 247, 253, 254, 255]

TABLE Q6

| with a sequence length of 256: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 34 |
| 21 | 24 |
| 22 | 36 |
| 23 | 7 |
| 24 | 129 |
| 25 | 66 |
| 26 | 11 |
| 27 | 40 |
| 28 | 68 |
| 29 | 130 |
| 30 | 19 |
| 31 | 13 |
| 32 | 48 |
| 33 | 14 |
| 34 | 72 |
| 35 | 21 |
| 36 | 132 |
| 37 | 35 |
| 38 | 26 |
| 39 | 80 |
| 40 | 37 |
| 41 | 25 |
| 42 | 22 |
| 43 | 136 |
| 44 | 38 |
| 45 | 96 |
| 46 | 67 |
| 47 | 41 |
| 48 | 144 |
| 49 | 28 |
| 50 | 69 |
| 51 | 42 |
| 52 | 49 |
| 53 | 74 |
| 54 | 160 |
| 55 | 192 |
| 56 | 70 |
| 57 | 44 |
| 58 | 131 |
| 59 | 81 |
| 60 | 50 |

TABLE Q6-continued

| with a sequence length of 256: | |
|---|---|
| Reliability or reliability sequence number | Polarized channel sequence number |
| 61 | 73 |
| 62 | 15 |
| 63 | 133 |
| 64 | 52 |
| 65 | 23 |
| 66 | 134 |
| 67 | 76 |
| 68 | 137 |
| 69 | 82 |
| 70 | 56 |
| 71 | 27 |
| 72 | 97 |
| 73 | 39 |
| 74 | 84 |
| 75 | 138 |
| 76 | 145 |
| 77 | 29 |
| 78 | 43 |
| 79 | 98 |
| 80 | 88 |
| 81 | 140 |
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 31 |
| 121 | 200 |
| 122 | 90 |
| 123 | 149 |
| 124 | 102 |
| 125 | 105 |
| 126 | 163 |
| 127 | 92 |
| 128 | 47 |
| 129 | 208 |
| 130 | 150 |
| 131 | 153 |
| 132 | 165 |
| 133 | 106 |
| 134 | 55 |
| 135 | 113 |

TABLE Q6-continued

| with a sequence length of 256: | |
|---|---|
| Reliability or reliability sequence number | Polarized channel sequence number |
| 136 | 154 |
| 137 | 79 |
| 138 | 108 |
| 139 | 224 |
| 140 | 166 |
| 141 | 195 |
| 142 | 59 |
| 143 | 169 |
| 144 | 114 |
| 145 | 156 |
| 146 | 87 |
| 147 | 197 |
| 148 | 116 |
| 149 | 170 |
| 150 | 61 |
| 151 | 177 |
| 152 | 91 |
| 153 | 198 |
| 154 | 172 |
| 155 | 120 |
| 156 | 201 |
| 157 | 62 |
| 158 | 143 |
| 159 | 103 |
| 160 | 178 |
| 161 | 93 |
| 162 | 202 |
| 163 | 107 |
| 164 | 180 |
| 165 | 151 |
| 166 | 209 |
| 167 | 94 |
| 168 | 204 |
| 169 | 155 |
| 170 | 210 |
| 171 | 109 |
| 172 | 184 |
| 173 | 115 |
| 174 | 167 |
| 175 | 225 |
| 176 | 157 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 174 |
| 191 | 122 |
| 192 | 203 |
| 193 | 63 |
| 194 | 181 |
| 195 | 232 |
| 196 | 124 |
| 197 | 205 |
| 198 | 182 |
| 199 | 211 |
| 200 | 185 |
| 201 | 240 |
| 202 | 206 |
| 203 | 95 |
| 204 | 213 |
| 205 | 186 |
| 206 | 227 |
| 207 | 111 |
| 208 | 214 |
| 209 | 188 |
| 210 | 217 |

TABLE Q6-continued

| with a sequence length of 256: | |
|---|---|
| Reliability or reliability sequence number | Polarized channel sequence number |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |
| 224 | 207 |
| 225 | 187 |
| 226 | 236 |
| 227 | 126 |
| 228 | 242 |
| 229 | 244 |
| 230 | 189 |
| 231 | 215 |
| 232 | 219 |
| 233 | 231 |
| 234 | 248 |
| 235 | 190 |
| 236 | 221 |
| 237 | 235 |
| 238 | 222 |
| 239 | 237 |
| 240 | 243 |
| 241 | 238 |
| 242 | 245 |
| 243 | 127 |
| 244 | 191 |
| 245 | 246 |
| 246 | 249 |
| 247 | 250 |
| 248 | 252 |
| 249 | 223 |
| 250 | 239 |
| 251 | 251 |
| 252 | 247 |
| 253 | 253 |
| 254 | 254 |
| 255 | 255 |

Sequence Q7, with a sequence length of 128:

[0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 26, 80, 37, 25, 22, 38, 96, 67, 41, 28, 69, 42, 49, 74, 70, 44, 81, 50, 73, 15, 52, 2 3, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 1 27]

TABLE Q7

| with a sequence length of 128: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |

TABLE Q7-continued

| with a sequence length of 128: | |
|---|---|
| Reliability or reliability sequence number | Polarized channel sequence number |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 65 |
| 18 | 20 |
| 19 | 34 |
| 20 | 24 |
| 21 | 36 |
| 22 | 7 |
| 23 | 66 |
| 24 | 11 |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 38 |
| 40 | 96 |
| 41 | 67 |
| 42 | 41 |
| 43 | 28 |
| 44 | 69 |
| 45 | 42 |
| 46 | 49 |
| 47 | 74 |
| 48 | 70 |
| 49 | 44 |
| 50 | 81 |
| 51 | 50 |
| 52 | 73 |
| 53 | 15 |
| 54 | 52 |
| 55 | 23 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |

TABLE Q7-continued

| with a sequence length of 128: | |
|---|---|
| Reliability or reliability sequence number | Polarized channel sequence number |
| 81 | 78 |
| 82 | 85 |
| 83 | 58 |
| 84 | 99 |
| 85 | 86 |
| 86 | 60 |
| 87 | 89 |
| 88 | 101 |
| 89 | 31 |
| 90 | 90 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q8, with a sequence length of 64:
[0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 5 8, 60, 31, 47, 55, 59, 61, 62, 63]

TABLE Q8

| with a sequence length of 64: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 9 |

TABLE Q8-continued with a sequence length of 64:

| Reliability or reliability sequence number | Polarized channel sequence number |
|---|---|
| 10 | 6 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |
| 26 | 14 |
| 27 | 21 |
| 28 | 35 |
| 29 | 26 |
| 30 | 37 |
| 31 | 25 |
| 32 | 22 |
| 33 | 38 |
| 34 | 41 |
| 35 | 28 |
| 36 | 42 |
| 37 | 49 |
| 38 | 44 |
| 39 | 50 |
| 40 | 15 |
| 41 | 52 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z1, with a sequence length of 8192:

[0, 1, 2, 7, 3, 8, 14, 27, 4, 13, 16, 31, 19, 36, 38, 84, 5, 15, 17, 35, 22, 42, 52, 89, 25, 51, 46, 97, 63, 106, 113, 182, 6, 20, 24, 44, 26, 50, 57, 99, 32, 61, 65, 107, 78, 120, 126, 201, 37, 67, 82, 124, 87, 135, 145, 215, 96, 147, 160, 243, 166, 257, 281, 408, 9, 21, 29, 60, 33, 64, 77, 115, 39, 83, 69, 1 27, 92, 139, 153, 224, 49, 80, 95, 146, 101, 156, 165, 251, 111, 168, 186, 269, 200, 288, 307, 454, 59, 98, 109, 164, 122, 176, 194, 284, 133, 195, 214, 299, 227, 325, 343, 494, 150, 222, 247, 330, 2 54, 344, 371, 528, 275, 378, 402, 556, 423, 581, 627, 877, 18, 28, 34, 79, 43, 86, 90, 151, 54, 94, 10 2, 163, 112, 175, 179, 283, 62, 103, 114, 177, 125, 193, 211, 301, 138, 212, 223, 319, 249, 339, 36 4, 516, 71, 118, 134, 199, 140, 213, 230, 331, 161, 245, 255, 347, 274, 377, 394, 553, 178, 266, 28 5, 385, 300, 417, 426, 578, 327, 440, 475, 615, 501, 649, 725, 878, 75, 136, 155, 233, 173, 252, 27 3, 382, 183, 277, 291, 407, 308, 425, 452, 603, 208, 304, 320, 437, 345, 468, 496, 662, 358, 504, 5 33, 690, 564, 738, 767, 1022, 229, 334, 352, 479, 387, 513, 538, 715, 422, 548, 579, 755, 616, 77 3, 842, 1103, 451, 592, 630, 809, 645, 865, 897, 1175, 720, 914, 951, 1160, 990, 1235, 1333, 167 8, 23, 40, 45, 100, 55, 104, 116, 192, 56, 117, 129, 202, 142, 225, 236, 362, 70, 130, 143, 240, 157, 248, 263, 363, 167, 261, 282, 400, 305, 421, 432, 577, 73, 154, 169, 242, 188, 267, 286, 420, 198, 297, 309, 434, 323, 466, 486, 643, 197, 321, 336, 463, 357, 500, 518, 694, 389, 542, 566, 737, 58 9, 764, 816, 1081, 85, 181, 190, 293, 206, 316, 335, 456, 217, 342, 351, 495, 372, 527, 547, 733, 2 79, 365, 388, 532, 409, 562, 588, 760, 443, 597, 635, 805, 667, 862, 901, 1147, 313, 404, 436, 57 4, 462, 613, 638, 845, 491, 655, 677, 874, 726, 931, 966, 1211, 535, 724, 742, 952, 761, 992, 940, 1257, 826, 1074, 1107, 1355, 1121, 1459, 1518, 1755, 91, 203, 209, 356, 268, 376, 392, 541, 29 5, 397, 412, 569, 442, 601, 634, 849, 311, 439, 461, 602, 478, 641, 670, 884, 505, 682, 713, 921, 7 57, 960, 1019, 1270, 361, 467, 484, 668, 517, 703, 745, 943, 567, 746, 769, 1014, 830, 985, 1092, 1361, 611, 797, 858, 1075, 885, 1117, 1154, 1426, 932, 1168, 1165, 1503, 1260, 1547, 1599, 19 28, 403, 502, 543, 750, 599, 772, 814, 1037, 636, 847, 867, 1110, 912, 1128, 1163, 1452, 672, 89 3, 945, 1150, 967, 1172, 1264, 1552, 1034, 1284, 1322, 1613, 1390, 1696, 1745, 2117, 734, 955, 1008, 1267, 1089, 1273, 1376, 1634, 1101, 1365, 1433, 1725, 1488, 1791, 1886, 2269, 1129, 1 463, 1535, 1824, 1577, 1902, 1857, 2323, 1667, 1977, 2030, 2480, 2145, 2568, 2678, 3005, 30, 48, 58, 110, 66, 131, 144, 231, 72, 148, 159, 239, 172, 259, 264, 413, 74, 170, 180, 258, 191, 317, 328, 450, 218, 329, 355, 492, 375, 520, 545, 754, 76, 187, 204, 322, 220, 353, 368, 510, 232, 381, 395, 551, 416, 582, 608, 775, 246, 406, 430, 595, 457, 631, 652, 836, 469, 644, 684, 890, 689, 92 0, 957, 1340, 119, 219, 228, 373, 241, 396, 414, 572, 271, 433, 445, 622, 474, 658, 680, 853, 292, 449, 483, 648, 508, 687, 697, 905, 531, 699, 712, 962, 796, 996, 1062, 1363, 312, 507, 523, 708, 558, 743, 751, 977, 587, 792, 820, 1033, 873, 1084, 1112, 1437, 621, 841, 889, 1115, 936, 1143, 1218, 1492, 1006, 1228, 1288, 1557, 1326, 1626, 1705, 2102, 123, 238, 260, 427, 289, 446, 477, 664, 306, 488, 511, 702, 536, 719, 728, 970, 341, 526, 557, 731, 585, 785, 813, 1023, 617, 832, 8 69, 1098, 907, 1133, 1190, 1441, 369, 571, 606, 818, 654, 861, 857, 1136, 674, 895, 916, 1178, 9 81, 1222, 1248, 1564, 716, 938, 1000, 1239, 1027, 1305, 1329, 1638, 1070, 1358, 1405, 1729, 1 499, 1802, 1892, 2278, 391, 626, 657, 900, 695, 928, 982, 1231, 781, 1004, 1046, 1316, 1053, 1 336, 1383, 1689, 799, 1048, 1067, 1372, 1138, 1401, 1474, 1788, 1203, 1495, 1532, 1828, 159 5, 1936, 1996, 2352, 834, 1156, 1185, 1445, 1249, 1507, 1543, 1869, 1292, 1586, 1644, 1973, 1 711, 2038, 2130, 2512, 1412, 1653, 1736, 2060, 1814, 2160, 2203, 2654, 1876, 2243, 2315, 27 18, 2421, 2834, 2985, 3484, 141, 272, 298, 489, 337, 521, 552, 763, 349, 563, 593, 790, 624, 825, 881, 1193, 383, 610, 663, 851, 686, 925, 909, 1210, 705, 947, 989, 1281, 1041, 1309, 1347, 167 1, 460, 676, 707, 924, 780, 975, 1011, 1319, 789, 1042, 1060, 1351, 1088, 1387, 1424, 1765, 80 1, 1078, 1124, 1420, 1199, 1471, 1522, 1835, 1241, 1573, 1591, 1940, 1648, 2004, 2079, 2459, 471, 778, 784, 1029, 804, 1051, 1095, 1398, 837, 1142, 1181, 1456, 1224, 1510, 1582, 1917, 99 7, 1197, 1253, 1528, 1294, 1616, 1657, 1984, 1394, 1663, 1739, 2064, 1818, 2153, 2195, 2640, 1056, 1301, 1368, 1620, 1416, 1719, 1776, 2094, 1484, 1795, 1847, 2187, 1910, 2251, 2343, 2 760, 1539, 1880, 1954, 2306, 2026, 2372, 2453, 2866, 2109, 2491, 2557, 2952, 2616, 3109, 31 49, 3832, 480, 808, 822, 1186, 972, 1215, 1245, 1568, 1015, 1277, 1312, 1630, 1379, 1685, 175 9, 2087, 1064, 1344, 1409, 1699, 1448, 1781, 1851, 2177, 1514, 1898, 1840, 2227, 1992, 2332, 2413, 2803, 1206, 1430, 1467, 1807, 1561, 1862, 1946, 2286, 1609, 1958, 2018, 2381, 2072, 2 433, 2524, 2934, 1715, 2045, 2124, 2471, 2210, 2580, 2628, 3065, 2262, 2704, 2747, 3199, 28 48, 3272, 3331, 3683, 1298, 1481, 1605, 1965, 1681, 2011, 2052, 2442, 1750, 2138, 2169, 254 8, 2234, 2592, 2730, 3129, 1769, 2219, 2295, 2692, 2401, 2774, 2787, 3300, 2503, 2883, 2915, 3359, 3027, 3524, 3596, 4162, 1921, 2364, 2392, 2817, 2536, 2897, 2971, 3420, 2604, 3047, 3 085, 3560, 3225, 3639, 3888, 4347, 2666, 3174, 3247, 3730, 3387, 3776, 3946, 4458, 3454, 40 14, 4085, 4599, 4244, 4770, 5021, 5420, 10, 41, 68, 149, 88, 162, 196, 310, 105, 184, 216, 340, 2 44, 374, 386, 609, 121, 207, 226, 366, 270, 405, 459, 628, 294, 453, 431, 660, 514, 696, 722, 961, 137, 253, 287, 418, 302, 448, 482, 669, 346, 503, 525, 700, 586, 752, 774, 1018, 379, 534, 600, 7 66, 623, 802, 840, 1057, 656, 848, 886, 1137, 906, 1173, 1236, 1567, 174, 262, 324, 497, 354, 51 9, 580, 732, 393, 605, 540, 779, 642, 815, 864, 1083, 441, 594, 651, 843, 678, 875, 904, 1159, 71 4, 915, 968, 1207, 1013, 1259, 1307, 1675, 493, 665, 706, 899, 756, 937, 994, 1247, 793, 999, 10 55, 1286, 1090, 1352, 1403, 1768, 854, 1076, 1148, 1371, 1167, 1406, 1473, 1844, 1227, 1494, 1549, 1905, 1602, 1961, 2057, 2542, 235, 318, 360, 591, 411, 620, 632, 859, 465, 647, 683, 894, 718, 934, 949, 1243, 509, 688, 727, 941, 770, 991, 1043, 1293, 810, 1047, 1080, 1335, 1155, 13 92, 1458, 1815, 550, 744, 798, 1010, 819, 1050, 1102, 1374, 891, 1141, 1169, 1414, 1223, 1490, 1530, 1901, 946, 1198, 1252, 1509, 1289, 1588, 1610, 1952, 1356, 1643, 1723, 2033, 1782, 21 05, 2257, 2545, 570, 807, 870, 1111, 930, 1161, 1219, 1502, 964, 1230, 1265, 1563, 1310, 1606, 1674, 2008, 1036, 1296, 1339, 1637, 1410, 1708, 1775, 2127, 1443, 1789, 1856, 2189, 1924, 2 284, 2341, 2791, 1097, 1378, 1425, 1733, 1513, 1811, 1866, 2237, 1600, 1889, 1956, 2318, 20 35, 2355, 2483, 2923, 1669, 1982, 2062, 2424, 2097, 2521, 2577, 3034, 2248, 2607, 2669, 301 1, 2736, 3126, 3278, 3795, 280, 398, 424, 675, 470, 693, 736, 986, 476, 739, 783, 1020, 828, 108 5, 1116, 1451, 544, 787, 831, 1125, 880, 1151, 1191, 1454, 910, 1188, 1240, 1546, 1300, 1596, 1 623, 1949, 559, 868, 917, 1134, 976, 1201, 1255, 1592, 1005, 1279, 1313, 1628, 1349, 1702, 17 49, 2090, 1001, 1341, 1384, 1698, 1440, 1778, 1822, 2192, 1520, 1873, 1926, 2281, 1980, 233 8, 2436, 2886, 614, 956, 979, 1272, 1032, 1328, 1382, 1679, 1061, 1399, 1421, 1772, 1477, 184 1, 1885, 2272, 1233, 1462, 1517, 1853, 1571, 1914, 1974, 2326, 1651, 1995, 2075, 2416, 2141, 2518, 2586, 2993, 1324, 1556, 1633, 1945, 1694, 2027, 2082, 2486, 1762, 2115, 2163, 2539, 2 260, 2634, 2695, 3093, 1860, 2254, 2289, 2672, 2329, 2740, 2651, 3163, 2455, 2872, 2926, 33 09, 2948, 3473, 3565, 3908, 637, 1025, 1039, 1436, 1205, 1487, 1527, 1870, 1276, 1542, 1575, 1933, 1647, 2001, 2069, 2494, 1317, 1641, 1692, 2005, 1732, 2084, 2148, 2554, 1794, 2171, 2 233, 2619, 2321, 2686, 2783, 3183, 1447, 1706, 1746, 2142, 1820, 2213, 2298, 2657, 1930, 23 01, 2346, 2777, 2456, 2727, 2905, 3317, 2023, 2398, 2509, 2877, 2559, 2945, 3000, 3424, 263 7, 3023, 3019, 3538, 3166, 3607, 3678, 4140, 1553, 1785, 1878, 2303, 1999, 2349, 2430, 2814, 2078, 2489, 2527, 2931, 2601, 2960, 3016, 3463, 2151, 2571, 2660, 2997, 2698, 3031, 3171, 3 613, 2811, 3205, 3261, 3700, 3367, 3818, 3894, 4381, 2275, 2675, 2767, 3179, 2900, 3188, 33 45, 3736, 2920, 3326, 3434, 3863, 3513, 3960, 4093, 4559, 2963, 3479, 3585, 4000, 3650, 411 1, 4050, 4630, 3782, 4206, 4274, 4814, 4414, 4914, 5049, 5398, 332, 435, 487, 709, 529, 791, 8 35, 1105, 555, 852, 883, 1123, 926, 1180, 1194, 1578, 565, 922, 953, 1176, 984, 1332, 1360, 166 5, 1066, 1367, 1432, 1763, 1483, 1827, 1882, 2312, 575, 971, 1028, 1345, 1071, 1428, 1466, 18 05, 1108, 1498, 1534, 1894, 1585, 1964, 2016, 2358, 1146, 1559, 1619, 1989, 1684, 2067, 210 6, 2468, 1712, 2091, 2174, 2565, 2184, 2613, 2681, 3286, 748, 1069, 1094, 1478, 1130, 1538, 1 581, 1942, 1213, 1624, 1655, 2047, 1721, 2123, 2166, 2500, 1269, 1661, 1742, 2099, 1801, 21 81, 2201, 2589, 1848, 2205, 2230, 2689, 2395, 2744, 2855, 3322, 1321, 1798, 1833, 2224, 191 2, 2292, 2309, 2713, 1970, 2389, 2445, 2808, 2533, 2891, 2937, 3440, 2042, 2477, 2562, 2940, 2645, 2988, 3101, 3518, 2763, 3118, 320864, 3719, 3618, 3264, 3719, 3838, 4364, 762, 1120, 1182, 16 14, 1261, 1658, 1728, 2135, 1304, 1752, 1809, 2208, 1864, 2245, 2265, 2701, 1395, 1837, 190 8, 2268, 1968, 2378, 2427, 2794, 2039, 2462, 2530, 2912, 2595, 2966, 3058, 3443, 1469, 1937, 2014, 2439, 2112, 2515, 2506, 2974, 2156, 2574, 2610, 3039, 2721, 3104, 3146, 3629, 2240, 2 648, 2753, 3133, 2797, 3233, 3269, 3742, 2869, 3314, 3392, 3869, 3534, 3974, 4097, 4570, 15 24, 2054, 2120, 2583, 2198, 2631, 2724, 3121, 2369, 2757, 2828, 3250, 2842, 3281, 3354, 381 2, 2404, 2831, 2863, 3340, 2977, 3381, 3498, 3954, 3078, 3529, 3580, 4008, 3672, 4146, 4228, 4661, 2465, 3008, 3050, 3448, 3154, 3543, 3602, 4065, 3213, 3661, 3747, 4198, 3843, 4282, 4 397, 4852, 3401, 3759, 3875, 4306, 3988, 4431, 4486, 5006, 4071, 4531, 4619, 5091, 4736, 52 18, 5378, 5901, 824, 1216, 1282, 1756, 1388, 1831, 1896, 2335, 1417, 1918, 1987, 2387, 2050, 2450, 2551, 3062, 1505, 2020, 2133, 2497, 2180, 2625, 2598, 3090, 2216, 2663, 2733, 3196, 2 820, 3238, 3295, 3789, 1688, 2159, 2222, 2622, 2366, 2710, 2770, 3255, 2384, 2823, 2852, 33 03, 2894, 3364, 3415, 3920, 2407, 2880, 2956, 3410, 3073, 3493, 3571, 4022, 3138, 3644, 366 7, 4154, 3753, 4236, 4331, 4791, 1716, 2361, 2375, 2800, 2410, 2837, 2908, 3378, 2474, 2982, 3042, 3468, 3113, 3549, 3655, 4127, 2750, 3070, 3158, 3574, 3216, 3706, 3765, 4214, 3373, 3 770, 3880, 4315, 3994, 4422, 4475, 4992, 2845, 3230, 3336, 3711, 3406, 3857, 3934, 4356, 35 07, 3967, 4036, 4467, 4119, 4540, 4650, 5137, 3591, 4079, 4176, 4610, 4266, 4681, 4779, 525 3, 4372, 4826, 4902, 5342, 4965, 5524, 5571, 6216, 1738, 2418, 2448, 3053, 2707, 3098, 3141, 3635, 2780, 3191, 3242, 3725, 3350, 3807, 3914, 4339, 2859, 3291, 3395, 3826, 3459, 3940, 4 042, 4450, 3554, 4105, 4028, 4512, 4222, 4639, 4724, 5184, 3081, 3429, 3488, 3980, 3624, 40 56, 4168, 4579, 3695, 4184, 4258, 4692, 4323, 4747, 4864, 5323, 3849, 4290, 4389, 4802, 449 4, 4926, 4979, 5480, 4551, 5079, 5122, 5619, 5234, 5693, 5750, 6084, 3221, 3504, 3689, 4192, 3801, 4252, 4298, 4758, 3900, 4406, 4439, 4887, 4522, 4940, 5107, 5547, 3926, 4503, 4590, 5 064, 4713, 5153, 5169, 5721, 4840, 5269, 5304, 5776, 5440, 5935, 6005, 6505, 4133, 4670, 47 01, 5202, 4875, 5288, 5362, 5837, 4952, 5460, 5504, 5970, 5644, 6044, 6268, 6660, 5034, 559 5, 5668, 6125, 5808, 6170, 6320, 6752, 5867, 6374, 6438, 6866, 6579, 6995, 7168, 7433, 11, 47, 81, 189, 108, 205, 265, 410, 132, 250, 290, 447, 326, 490, 506, 794, 152, 278, 303, 481, 359, 539, 604, 823, 390, 598, 568, 860, 673, 908, 939, 1229, 171, 338, 380, 554, 401, 590, 633, 872, 455, 6 59, 685, 913, 765, 974, 1003, 1299, 498, 698, 782, 993, 811, 1035, 1082, 1346, 856, 1091, 1140, 1442, 1166, 1485, 1562, 1925, 221, 348, 428, 653, 464, 679, 759, 948, 515, 788, 710, 1007, 839, 1054, 1114, 1377, 583, 776, 850, 1087, 882, 1127, 1162, 1468, 929, 1174, 1242, 1525, 1295, 15 87, 1642, 2043, 646, 866, 918, 1157, 983, 1204, 1271, 1572, 1026, 1275, 1343, 1618, 1389, 169 7, 1747, 2139, 1104, 1369, 1457, 1710, 1479, 1751, 1823, 2220, 1548, 1845, 1906, 2285, 1962, 2342, 2443, 2972, 314, 419, 473, 771, 546, 806, 827, 1109, 612, 844, 888, 1153, 933, 1200, 121 7, 1569, 666, 892, 944, 1209, 998, 1266, 1330, 1625, 1049, 1334, 1373, 1676, 1464, 1734, 1806, 2191, 723, 963, 1030, 1290, 1058, 1338, 1400, 1714, 1144, 1449, 1482, 1760, 1544, 1843, 188 8, 2279, 1212, 1515, 1576, 1861, 1621, 1948, 1972, 2333, 1701, 2007, 2093, 2417, 2155, 2496, 2662, 2976, 747, 1040, 1122, 1411, 1192, 1472, 1541, 1855, 1234, 1551, 1593, 1922, 1646, 19 69, 2037, 2391, 1323, 1632, 1680, 2000, 1754, 2076, 2146, 2522, 1790, 2164, 2231, 2588, 230 2, 2691, 2752, 3245, 1396, 1720, 1771, 2104, 1868, 2185, 2244, 2642, 1960, 2267, 2336, 2726, 2420, 2764, 2904, 3390, 2034, 2365, 2449, 2839, 2487, 2950, 3013, 3515, 2653, 3044, 3114, 3 489, 3186, 3615, 3774, 4278, 370, 522, 560, 876, 619, 898, 954, 1263, 625, 959, 1012, 1302, 10 68, 1380, 1419, 1799, 717, 1017, 1073, 1431, 1131, 1461, 1508, 1803, 1170, 1500, 1566, 1904, 1635, 1957, 1985, 2331, 735, 1118, 1179, 1438, 1251, 1519, 1580, 1953, 1287, 1611, 1649, 199 1, 1690, 2071, 2119, 2481, 1283, 1683, 1727, 2065, 1786, 2152, 2196, 2594, 1874, 2253, 2308, 2687, 2359, 2746, 2853, 3352, 800, 1225, 1254, 1601, 1315, 1666, 1724, 2046, 1354, 1743, 17 67, 2144, 1826, 2217, 2264, 2680, 1554, 1810, 1872, 2229, 1929, 2296, 2356, 2735, 2015, 237 6, 2464, 2830, 2534, 2943, 3021, 3466, 1662, 1913, 1997, 2325, 2061, 2411, 2472, 2910, 2131, 2508, 2558, 2968, 2665, 3076, 3143, 3576, 2238, 2659, 2697, 3116, 2738, 3193, 3095, 3652, 2 874, 3338, 3397, 3809, 3422, 3972, 4061, 4378, 833, 1306, 1327, 1784, 1523, 1839, 1881, 225 0, 1607, 1897, 1934, 2313, 2012, 2385, 2461, 2918, 1656, 2003, 2058, 2388, 2101, 2475, 2543, 2987, 2167, 2567, 2636, 3057, 2732, 3131, 3240, 3674, 1797, 2073, 2116, 2537, 2194, 2615, 2 706, 3099, 2311, 2709, 2755, 3232, 2878, 3178, 3371, 3820, 2408, 2812, 2936, 3341, 2990, 34 17, 3477, 3922, 3080, 3502, 3497, 4038, 3657, 4101, 4172, 4596, 1909, 2157, 2255, 2715, 237 9, 2761, 2847, 3274, 2467, 2913, 2953, 3402, 3040, 3432, 3495, 3962, 2546, 3003, 3103, 3472, 3144, 3509, 3663, 4107, 3267, 3696, 3757, 4190, 3865, 4302, 4366, 4821, 2683, 3123, 3220, 3 668, 3366, 3680, 3841, 4220, 3385, 3824, 3932, 4341, 4016, 4427, 4546, 4994, 3436, 3978, 40 87, 4469, 4142, 4566, 4509, 5051, 4264, 4656, 4720, 5221, 4854, 5315, 5432, 5756, 438, 576, 6 39, 923, 692, 1021, 1077, 1404, 729, 1096, 1135, 1427, 1187, 1493, 1512, 1938, 741, 1184, 122 1, 1489, 1258, 1670, 1703, 2031, 1357, 1707, 1780, 2134, 1836, 2202, 2261, 2723, 753, 1246, 1 311, 1687, 1366, 1773, 1816, 2178, 1407, 1852, 1890, 2274, 1944, 2345, 2400, 2769, 1453, 19 19, 1978, 2374, 2049, 2452, 2502, 2893, 2080, 2484, 2573, 2998, 2585, 3055, 3128, 3786, 969, 1362, 1393, 1829, 1435, 1893, 1941, 2322, 1533, 1988, 2019, 2431, 2088, 2517, 2564, 2928, 1 597, 2028, 2113, 2493, 2173, 2579, 2603, 3026, 2226, 2606, 2633, 3136, 2809, 3198, 3319, 38 22, 1660, 2170, 2209, 2627, 2291, 2700, 2717, 3164, 2353, 2805, 2861, 3266, 2964, 3357, 340 8, 3938, 2429, 2902, 2995, 3411, 3086, 3461, 3587, 4020, 3218, 3604, 3702, 4115, 3763, 4210, 4312, 4805, 988, 1422, 1497, 1976, 1590, 2022, 2098, 2528, 1639, 2126, 2182, 2612, 2241, 26 50, 2671, 3151, 1741, 2215, 2288, 2674, 2348, 2789, 2844, 3249, 2423, 2885, 2958, 3383, 303 2, 3441, 3540, 3944, 1819, 2319, 2397, 2856, 2505, 2942, 2932, 3447, 2549, 3010, 3049, 3520, 3169, 3593, 3637, 4125, 2643, 3091, 3206, 3620, 3254, 3728, 3768, 4226, 3333, 3814, 3886, 4 345, 4032, 4441, 4553, 5001, 1877, 2440, 2514, 3018, 2597, 3071, 3173, 3609, 2781, 3211, 32 88, 3746, 3302, 3780, 3853, 4294, 2819, 3293, 3327, 3836, 3452, 3882, 3996, 4420, 3562, 402 6, 4081, 4473, 4166, 4605, 4679, 5081, 2888, 3482, 3531, 3950, 3641, 4044, 4096, 4525, 3708, 4156, 4234, 4652, 4321, 4729, 4835, 5256, 3898, 4246, 4354, 4754, 4454, 4871, 4918, 5406, 4 533, 4962, 5041, 5472, 5156, 5589, 5737, 6185, 1063, 1537, 1615, 2128, 1730, 2206, 2277, 27 43, 1764, 2299, 2368, 2798, 2437, 2870, 2980, 3545, 1858, 2405, 2525, 2921, 2576, 3067, 303 6, 3573, 2618, 3108, 3184, 3691, 3279, 3734, 3797, 4270, 2056, 2555, 2624, 3063, 2778, 3159, 3227, 3751, 2795, 3283, 3312, 3803, 3362, 3859, 3916, 4393, 2822, 3347, 3427, 3910, 3556, 3 990, 4067, 4482, 3626, 4136, 4160, 4612, 4240, 4688, 4777, 5197, 2086, 2772, 2786, 3259, 28 26, 3298, 3376, 3877, 2896, 3457, 3525, 3966, 3598, 4048, 4150, 4583, 3201, 3551, 3646, 407 5, 3713, 4196, 4250, 4665, 3871, 4260, 4360, 4761, 4460, 4861, 4909, 5392, 3307, 3723, 3830, 4202, 3904, 4333, 4408, 4795, 4010, 4433, 4497, 4899, 4575, 4972, 5071, 5515, 4091, 4538, 4 627, 5031, 4715, 5102, 5189, 5622, 4812, 5232, 5301, 5706, 5367, 5854, 5891, 6465, 2108, 28 36, 2864, 3533, 3156, 3582, 3631, 4131, 3235, 3685, 3740, 4216, 3847, 4288, 4385, 4786, 332 1, 3791, 3892, 4308, 3956, 4412, 4501, 4890, 4054, 4561, 4488, 4945, 4674, 5059, 5145, 5559, 3567, 3928, 3984, 4446, 4121, 4516, 4621, 5011, 4186, 4634, 4706, 5112, 4768, 5166, 5266, 5 687, 4327, 4738, 4830, 5210, 4928, 5329, 5381, 5814, 4984, 5457, 5501, 5939, 5604, 6001, 60 55, 6349, 3717, 4004, 4180, 4643, 4284, 4697, 4745, 5176, 4374, 4845, 4880, 5293, 4955, 534 0, 5486, 5874, 4399, 4935, 5019, 5446, 5132, 5530, 5542, 6026, 5245, 5638, 5671, 6077, 5779, 6220, 6280, 6711, 4588, 5094, 5125, 5574, 5280, 5653, 5725, 6132, 5353, 5795, 5831, 6248, 5 959, 6312, 6509, 6843, 5418, 5915, 5980, 6387, 6102, 6421, 6551, 6923, 6159, 6602, 6651, 70 20, 6773, 7126, 7280, 7500, 237, 530, 704, 1100, 817, 1149, 1278, 1652, 902, 1237, 1350, 1737, 1446, 1832, 1865, 2402, 978, 1318, 1385, 1812, 1529, 1916, 2053, 2446, 1604, 2041, 1981, 25 19, 2188, 2600, 2656, 3134, 1044, 1476, 1583, 1950, 1629, 2024, 2110, 2540, 1758, 2162, 221 2, 2609, 2351, 2720, 2766, 3237, 1849, 2236, 2382, 2749, 2434, 2825, 2899, 3310, 2511, 2916, 2992, 3450, 3029, 3511, 3617, 4129, 1195, 1504, 1693, 2149, 1777, 2199, 2339, 2677, 1884, 2 394, 2247, 2775, 2478, 2850, 2947, 3355, 2009, 2371, 2499, 2907, 2561, 2969, 3024, 3486, 26 39, 3045, 3148, 3569, 3228, 3654, 3732, 4276, 2137, 2531, 2621, 3014, 2729, 3088, 3194, 363 3, 2806, 3203, 3305, 3698, 3369, 3805, 3884, 4395, 2929, 3343, 3470, 3834, 3500, 3890, 3992, 4492, 3600, 4024, 4103, 4568, 4178, 4636, 4752, 5285, 1415, 1672, 1793, 2362, 1932, 2426, 2 458, 2939, 2068, 2490, 2570, 3006, 2647, 3083, 3111, 3628, 2175, 2582, 2668, 3096, 2758, 31 89, 3284, 3710, 2841, 3290, 3348, 3778, 3480, 3867, 3970, 4456, 2271, 2703, 2815, 3223, 285 8, 3296, 3388, 3839, 3001, 3455, 3506, 3902, 3594, 4018, 4077, 4564, 3106, 3553, 3642, 4046, 3704, 4158, 4188, 4625, 3811, 4232, 4337, 4722, 4416, 4807, 4977, 5290, 2316, 2833, 2961, 3 404, 3075, 3491, 3589, 4034, 3139, 3605, 3665, 4123, 3738, 4182, 4272, 4695, 3271, 3715, 37 84, 4224, 3896, 4319, 4403, 4833, 3948, 4424, 4507, 4904, 4592, 5009, 5069, 5545, 3380, 384 5, 3918, 4352, 4052, 4452, 4520, 4957, 4174, 4548, 4632, 5044, 4726, 5084, 5224, 5678, 4268, 4663, 4756, 5158, 4798, 5264, 5326, 5785, 4969, 5356, 5423, 5763, 5492, 5871, 6008, 6434, 1 558, 1900, 1966, 2552, 2083, 2591, 2684, 3181, 2095, 2694, 2784, 3243, 2875, 3360, 3413, 39 58, 2258, 2792, 2881, 3431, 2979, 3475, 3542, 3964, 3037, 3536, 3622, 4099, 3721, 4170, 420 4, 4623, 2294, 2955, 3052, 3445, 3161, 3558, 3648, 4164, 3215, 3687, 3744, 4212, 3799, 4310, 4370, 4788, 3210, 3787, 3855, 4304, 3942, 4410, 4465, 4906, 4063, 4529, 4594, 5004, 4659, 5 066, 5171, 5641, 2414, 3124, 3168, 3676, 3262, 3766, 3851, 4280, 3315, 3878, 3912, 4401, 39 98, 4490, 4544, 4996, 3611, 3976, 4059, 4505, 4134, 4581, 4654, 5054, 4242, 4677, 4772, 514 8, 4847, 5261, 5334, 5744, 3761, 4113, 4218, 4616, 4300, 4717, 4782, 5226, 4387, 4819, 4873, 5282, 4982, 5387, 5449, 5841, 4514, 4974, 5014, 5426, 5056, 5495, 5403, 5904, 5192, 5628, 5 681, 6033, 5703, 6178, 6252, 6523, 2469, 3252, 3276, 3936, 3563, 4012, 4073, 4527, 3681, 40 95, 4138, 4603, 4238, 4686, 4765, 5237, 3749, 4230, 4296, 4690, 4349, 4784, 4856, 5299, 442 9, 4883, 4950, 5370, 5046, 5437, 5539, 5921, 3952, 4317, 4368, 4849, 4462, 4931, 5024, 5409, 4601, 5026, 5074, 5533, 5195, 5483, 5659, 6041, 4710, 5130, 5250, 5632, 5307, 5699, 5753, 6 136, 5389, 5772, 5769, 6232, 5908, 6288, 6345, 6695, 4109, 4418, 4535, 5029, 4683, 5076, 51 63, 5568, 4775, 5229, 5272, 5684, 5351, 5712, 5766, 6166, 4859, 5318, 5412, 5747, 5452, 578 2, 5911, 6292, 5565, 5942, 5991, 6361, 6088, 6456, 6514, 6871, 4999, 5429, 5521, 5918, 5656, 5925, 6066, 6391, 5675, 6051, 6144, 6487, 6208, 6560, 6656, 6989, 5715, 6181, 6272, 6593, 6 324, 6675, 6626, 7040, 6425, 6741, 6794, 7153, 6894, 7218, 7296, 7490, 1717, 1993, 2121, 26 30, 2223, 2801, 2889, 3394, 2282, 2924, 2984, 3425, 3068, 3522, 3547, 4144, 2305, 3060, 311 9, 3516, 3176, 3772, 3816, 4262, 3324, 3828, 3930, 4391, 4006, 4471, 4542, 5039, 2328, 3153, 3257, 3793, 3334, 3924, 3982, 4443, 3399, 4030, 4083, 4555, 4152, 4641, 4704, 5086, 3464, 4 117, 4200, 4672, 4286, 4763, 4809, 5208, 4325, 4793, 4885, 5312, 4897, 5364, 5435, 6016, 27 12, 3329, 3374, 4002, 3438, 4089, 4148, 4614, 3578, 4208, 4248, 4740, 4335, 4828, 4878, 524 2, 3670, 4256, 4362, 4800, 4437, 4894, 4916, 5337, 4499, 4921, 4947, 5443, 5127, 5498, 5610, 6048, 3755, 4435, 4480, 4943, 4577, 5016, 5036, 5469, 4647, 5120, 5179, 5562, 5277, 5647, 5 690, 6147, 4733, 5216, 5309, 5696, 5395, 5740, 5847, 6212, 5518, 5861, 5945, 6296, 5994, 63 78, 6469, 6854, 2741, 3418, 3527, 4194, 3659, 4254, 4343, 4842, 3727, 4376, 4448, 4923, 451 8, 4967, 4987, 5454, 3873, 4484, 4572, 4989, 4645, 5109, 5161, 5550, 4731, 5200, 5274, 5665, 5345, 5718, 5805, 6151, 3986, 4608, 4699, 5174, 4816, 5258, 5248, 5728, 4866, 5320, 5359, 5 788, 5475, 5851, 5888, 6304, 4960, 5401, 5509, 5877, 5553, 5966, 5998, 6395, 5625, 6037, 61 06, 6491, 6228, 6569, 6665, 7002, 4069, 4749, 4823, 5331, 4911, 5384, 5477, 5864, 5099, 551 2, 5583, 5984, 5598, 6012, 6073, 6451, 5135, 5586, 5616, 6062, 5731, 6099, 6197, 6555, 5824, 6224, 6264, 6597, 6341, 6700, 6762, 7059, 5205, 5760, 5798, 6155, 5894, 6236, 6284, 6636, 5 949, 6332, 6400, 6736, 6473, 6800, 6883, 7182, 6114, 6408, 6496, 6816, 6583, 6906, 6941, 72 72, 6641, 6971, 7033, 7320, 7105, 7388, 7480, 7719, 2867, 3583, 3693, 4383, 3861, 4477, 455 7, 5061, 3906, 4585, 4668, 5117, 4742, 5187, 5296, 5811, 4040, 4708, 4838, 5240, 4892, 5376, 5348, 5834, 4933, 5415, 5489, 5932, 5577, 5973, 6023, 6430, 4292, 4868, 4938, 5373, 5097, 5 466, 5527, 5987, 5114, 5580, 5607, 6030, 5650, 6080, 6128, 6532, 5140, 5635, 5709, 6121, 58 21, 6193, 6256, 6607, 5881, 6316, 6337, 6705, 6404, 6768, 6832, 7139, 4329, 5089, 5104, 555 6, 5143, 5592, 5662, 6095, 5213, 5734, 5792, 6174, 5857, 6240, 6328, 6685, 5506, 5818, 5898, 6260, 5952, 6366, 6412, 6747, 6091, 6417, 6500, 6821, 6588, 6900, 6935, 7264, 5601, 5963, 6 059, 6370, 6117, 6482, 6541, 6849, 6205, 6564, 6617, 6929, 6680, 6977, 7052, 7345, 6276, 66 46, 6721, 7027, 6789, 7072, 7132, 7405, 6860, 7160, 7211, 7461, 7249, 7552, 7573, 7841, 435 8, 5150, 5182, 5801, 5463, 5844, 5884, 6308, 5536, 5928, 5977, 6383, 6069, 6447, 6528, 6838, 5613, 6019, 6110, 6460, 6162, 6546, 6621, 6917, 6244, 6670, 6612, 6959, 6757, 7046, 7098, 7 370, 5828, 6140, 6189, 6574, 6300, 6631, 6716, 7008, 6357, 6726, 6784, 7078, 6827, 7112, 71 89, 7451, 6478, 6805, 6877, 7146, 6947, 7226, 7256, 7530, 6983, 7312, 7336, 7595, 7396, 763 0, 7654, 7792, 5956, 6201, 6353, 6731, 6443, 6778, 6810, 7119, 6518, 6888, 6912, 7204, 6965, 7233, 7328, 7562, 6537, 6953, 7014, 7304, 7092, 7353, 7362, 7642, 7175, 7414, 7442, 7667, 7 510, 7733, 7762, 7936, 6690, 7065, 7085, 7379, 7196, 7424, 7470, 7692, 7241, 7520, 7541, 77 47, 7607, 7776, 7858, 7981, 7288, 7584, 7618, 7808, 7680, 7824, 7876, 8006, 7706, 7895, 791 5, 8033, 7957, 8064, 8098, 8138, 12, 53, 93, 234, 128, 256, 350, 537, 158, 333, 384, 584, 429, 64 0, 661, 1038, 185, 367, 399, 629, 472, 701, 795, 1072, 512, 786, 740, 1119, 879, 1177, 1220, 157 9, 210, 444, 499, 721, 524, 777, 829, 1132, 596, 863, 896, 1183, 995, 1262, 1297, 1664, 650, 911, 1024, 1285, 1059, 1342, 1397, 1722, 1113, 1408, 1470, 1838, 1501, 1891, 1983, 2406, 276, 45 8, 561, 855, 607, 887, 987, 1232, 671, 1031, 927, 1303, 1093, 1364, 1439, 1761, 768, 1009, 110 6, 1402, 1145, 1455, 1496, 1871, 1208, 1511, 1594, 1939, 1659, 2010, 2077, 2541, 846, 1126, 1 196, 1491, 1274, 1550, 1631, 1994, 1331, 1636, 1718, 2048, 1774, 2140, 2200, 2652, 1423, 17 53, 1854, 2158, 1883, 2204, 2290, 2742, 1963, 2314, 2386, 2816, 2451, 2879, 2991, 3530, 415, 549, 618, 1002, 711, 1052, 1079, 1429, 803, 1099, 1152, 1486, 1214, 1545, 1565, 1990, 871, 11 58, 1226, 1555, 1291, 1627, 1704, 2055, 1359, 1709, 1757, 2118, 1863, 2186, 2270, 2711, 942, 1250, 1337, 1654, 1370, 1713, 1787, 2161, 1475, 1846, 1887, 2214, 1959, 2310, 2363, 2807, 1 560, 1927, 1998, 2334, 2051, 2432, 2460, 2871, 2147, 2501, 2599, 2962, 2670, 3043, 3214, 35 32, 973, 1348, 1450, 1800, 1536, 1875, 1955, 2327, 1584, 1967, 2021, 2403, 2081, 2457, 2535, 2933, 1695, 2066, 2122, 2492, 2207, 2581, 2658, 3072, 2249, 2679, 2756, 3137, 2835, 3244, 3 306, 3802, 1783, 2168, 2228, 2611, 2340, 2702, 2768, 3192, 2447, 2796, 2873, 3280, 2965, 33 18, 3460, 3943, 2532, 2906, 2996, 3393, 3033, 3505, 3568, 4064, 3204, 3601, 3671, 4039, 374 3, 4167, 4328, 4836, 485, 681, 730, 1139, 812, 1164, 1238, 1622, 821, 1244, 1308, 1668, 1381, 1766, 1808, 2263, 935, 1314, 1386, 1825, 1460, 1859, 1915, 2266, 1506, 1907, 1986, 2380, 20 70, 2444, 2476, 2868, 958, 1444, 1516, 1834, 1603, 1931, 2002, 2441, 1650, 2040, 2085, 2482, 2132, 2575, 2629, 3028, 1645, 2125, 2176, 2566, 2246, 2667, 2716, 3145, 2347, 2779, 2840, 3 241, 2898, 3299, 3407, 3905, 1045, 1574, 1612, 2029, 1686, 2107, 2172, 2547, 1731, 2197, 22 25, 2655, 2293, 2739, 2793, 3231, 1975, 2273, 2344, 2754, 2409, 2829, 2895, 3289, 2510, 291 7, 3009, 3384, 3084, 3501, 3577, 4017, 2100, 2393, 2488, 2860, 2563, 2957, 3017, 3467, 2644, 3056, 3107, 3523, 3217, 3634, 3699, 4126, 2762, 3212, 3251, 3673, 3292, 3748, 3651, 4203, 3 428, 3893, 3949, 4363, 3973, 4524, 4611, 4939, 1086, 1673, 1700, 2242, 1935, 2307, 2357, 27 76, 2036, 2373, 2419, 2849, 2507, 2927, 3007, 3474, 2092, 2498, 2560, 2930, 2608, 3022, 309 2, 3544, 2682, 3117, 3187, 3614, 3285, 3688, 3796, 4225, 2259, 2578, 2626, 3087, 2714, 3165, 3258, 3656, 2843, 3260, 3308, 3788, 3435, 3735, 3925, 4373, 2951, 3368, 3492, 3895, 3546, 3 968, 4029, 4474, 3636, 4053, 4047, 4589, 4209, 4653, 4727, 5157, 2390, 2673, 2782, 3268, 29 22, 3316, 3403, 3829, 3012, 3469, 3510, 3955, 3597, 3985, 4045, 4513, 3094, 3561, 3660, 402 3, 3701, 4058, 4215, 4660, 3823, 4249, 4311, 4746, 4419, 4860, 4925, 5380, 3234, 3679, 3777, 4221, 3919, 4231, 4396, 4776, 3939, 4379, 4485, 4900, 4567, 4986, 5106, 5548, 3987, 4530, 4 637, 5028, 4696, 5126, 5070, 5605, 4822, 5217, 5279, 5764, 5411, 5850, 5954, 6239, 573, 758, 838, 1202, 903, 1320, 1391, 1792, 950, 1413, 1465, 1821, 1531, 1899, 1920, 2422, 965, 1521, 1 570, 1895, 1617, 2111, 2150, 2529, 1735, 2154, 2239, 2646, 2304, 2722, 2788, 3277, 980, 159 8, 1677, 2129, 1744, 2232, 2280, 2696, 1796, 2324, 2367, 2802, 2428, 2882, 2944, 3323, 1850, 2399, 2470, 2914, 2550, 2999, 3048, 3449, 2584, 3030, 3122, 3555, 3135, 3612, 3684, 4340, 1 256, 1740, 1779, 2297, 1830, 2370, 2425, 2857, 1947, 2479, 2513, 2978, 2596, 3064, 3115, 34 83, 2025, 2526, 2623, 3041, 2690, 3130, 3152, 3584, 2751, 3157, 3185, 3692, 3365, 3754, 387 2, 4377, 2096, 2688, 2731, 3177, 2821, 3253, 3270, 3720, 2892, 3358, 3416, 3821, 3521, 3911, 3959, 4491, 2975, 3458, 3552, 3963, 3643, 4011, 4139, 4573, 3773, 4155, 4255, 4667, 4316, 4 766, 4872, 5363, 1280, 1817, 1903, 2463, 2013, 2516, 2605, 3077, 2074, 2635, 2699, 3162, 27 65, 3202, 3222, 3707, 2193, 2737, 2818, 3226, 2887, 3344, 3400, 3804, 2967, 3439, 3514, 393 5, 3588, 3993, 4088, 4496, 2283, 2854, 2941, 3412, 3054, 3499, 3490, 3999, 3100, 3566, 3606, 4068, 3726, 4145, 4189, 4678, 3195, 3647, 3762, 4173, 3810, 4283, 4322, 4781, 3887, 4369, 4 442, 4905, 4584, 5000, 5113, 5557, 2354, 2989, 3061, 3575, 3147, 3627, 3729, 4161, 3335, 37 69, 3844, 4301, 3856, 4334, 4407, 4851, 3372, 3848, 3881, 4390, 4003, 4436, 4547, 4981, 411 2, 4578, 4631, 5033, 4721, 5167, 5239, 5634, 3444, 4033, 4080, 4502, 4191, 4595, 4648, 5085, 4261, 4709, 4790, 5212, 4881, 5289, 5394, 5796, 4453, 4803, 4913, 5314, 5015, 5428, 5476, 5 931, 5093, 5519, 5596, 5990, 5705, 6094, 6223, 6606, 1375, 1951, 2044, 2638, 2179, 2725, 28 04, 3297, 2221, 2832, 2909, 3353, 2983, 3426, 3537, 4094, 2330, 2949, 3074, 3478, 3127, 362 3, 3592, 4124, 3170, 3664, 3741, 4243, 3835, 4289, 4351, 4827, 2556, 3105, 3175, 3621, 3332, 3716, 3781, 4307, 3351, 3837, 3868, 4357, 3917, 4413, 4470, 4953, 3377, 3901, 3979, 4464, 4 106, 4541, 4617, 5042, 4177, 4691, 4716, 5172, 4796, 5249, 5336, 5743, 2590, 3328, 3342, 38 15, 3382, 3854, 3929, 4430, 3451, 4009, 4074, 4519, 4149, 4600, 4703, 5144, 3756, 4102, 419 7, 4626, 4265, 4751, 4808, 5225, 4425, 4817, 4919, 5319, 5020, 5421, 5467, 5919, 3862, 4277, 4384, 4757, 4459, 4891, 4966, 5354, 4562, 4991, 5057, 5458, 5136, 5528, 5626, 6028, 4642, 5 098, 5190, 5587, 5275, 5655, 5738, 6122, 5371, 5775, 5839, 6195, 5896, 6325, 6356, 6839, 26 14, 3391, 3419, 4082, 3712, 4132, 4183, 4684, 3790, 4237, 4295, 4771, 4402, 4846, 4944, 534 6, 3876, 4346, 4447, 4865, 4508, 4973, 5062, 5447, 4606, 5121, 5048, 5502, 5235, 5614, 5697, 6067, 4118, 4479, 4536, 5007, 4673, 5077, 5180, 5566, 4741, 5194, 5265, 5664, 5328, 5717, 5 807, 6180, 4886, 5297, 5388, 5755, 5484, 5862, 5907, 6289, 5540, 5978, 6017, 6396, 6107, 64 52, 6495, 6743, 4271, 4556, 4735, 5203, 4841, 5257, 5305, 5726, 4932, 5404, 5438, 5830, 551 0, 5873, 6002, 6340, 4958, 5493, 5575, 5967, 5685, 6040, 6053, 6472, 5787, 6137, 6164, 6516, 6258, 6634, 6684, 7039, 5149, 5646, 5676, 6079, 5819, 6149, 6211, 6561, 5885, 6274, 6305, 6 659, 6415, 6713, 6874, 7148, 5943, 6376, 6432, 6774, 6536, 6803, 6909, 7209, 6585, 6950, 69 92, 7284, 7088, 7371, 7488, 7655, 296, 691, 919, 1418, 1065, 1480, 1640, 2089, 1171, 1589, 17 26, 2190, 1842, 2300, 2337, 2946, 1268, 1691, 1770, 2276, 1943, 2396, 2553, 2994, 2032, 253 8, 2473, 3069, 2705, 3150, 3207, 3690, 1353, 1879, 2006, 2435, 2059, 2523, 2620, 3089, 2211, 2676, 2734, 3160, 2890, 3273, 3320, 3794, 2317, 2759, 2925, 3304, 2981, 3379, 3456, 3864, 3 059, 3471, 3548, 4001, 3586, 4060, 4169, 4682, 1540, 1911, 2136, 2661, 2235, 2719, 2876, 32 29, 2360, 2938, 2773, 3330, 3025, 3405, 3503, 3909, 2504, 2911, 3046, 3462, 3110, 3526, 358 1, 4037, 3190, 3603, 3703, 4120, 3785, 4207, 4287, 4832, 2649, 3079, 3172, 3572, 3282, 3645, 3752, 4187, 3361, 3760, 3860, 4251, 3921, 4359, 4438, 4956, 3485, 3897, 4019, 4388, 4051, 4 444, 4545, 5053, 4153, 4576, 4657, 5129, 4732, 5198, 5311, 5825, 1804, 2114, 2256, 2903, 24 15, 2973, 3002, 3494, 2572, 3038, 3120, 3564, 3200, 3640, 3669, 4181, 2693, 3132, 3219, 365 3, 3311, 3745, 3840, 4263, 3396, 3846, 3903, 4332, 4031, 4421, 4523, 5017, 2799, 3256, 3370, 3779, 3414, 3852, 3941, 4394, 3557, 4007, 4055, 4455, 4147, 4571, 4629, 5124, 3662, 4104, 4 195, 4598, 4257, 4712, 4743, 5186, 4365, 4789, 4896, 5283, 4975, 5366, 5534, 5827, 2851, 33 89, 3517, 3957, 3632, 4041, 4141, 4587, 3697, 4159, 4217, 4676, 4291, 4737, 4831, 5254, 382 7, 4269, 4338, 4780, 4449, 4877, 4964, 5391, 4500, 4983, 5068, 5461, 5152, 5563, 5623, 6056, 3933, 4400, 4472, 4910, 4604, 5012, 5082, 5513, 4728, 5110, 5191, 5599, 5286, 5637, 5767, 6 171, 4824, 5223, 5317, 5708, 5357, 5804, 5859, 6263, 5525, 5887, 5946, 6245, 6007, 6338, 64 55, 6815, 1979, 2377, 2454, 3102, 2587, 3142, 3239, 3737, 2602, 3246, 3339, 3798, 3433, 391 3, 3965, 4511, 2785, 3346, 3437, 3981, 3535, 4025, 4090, 4517, 3595, 4086, 4175, 4651, 4275, 4723, 4760, 5183, 2824, 3512, 3608, 3995, 3718, 4110, 4201, 4718, 3771, 4241, 4297, 4767, 4 353, 4869, 4930, 5349, 3764, 4342, 4409, 4863, 4495, 4970, 5025, 5464, 4615, 5090, 5155, 55 60, 5220, 5620, 5720, 6139, 2959, 3682, 3724, 4229, 3819, 4320, 4405, 4837, 3870, 4432, 446 6, 4961, 4550, 5050, 5105, 5551, 4163, 4528, 4609, 5065, 4687, 5141, 5214, 5608, 4799, 5238, 5332, 5700, 5407, 5802, 5868, 6230, 4314, 4666, 4774, 5178, 4858, 5276, 5339, 5770, 4948, 5 377, 5431, 5822, 5537, 5913, 5969, 6311, 5073, 5531, 5569, 5948, 5611, 6010, 5929, 6367, 57 39, 6127, 6173, 6479, 6192, 6599, 6663, 6886, 3015, 3806, 3831, 4489, 4116, 4565, 4624, 508 7, 4235, 4646, 4693, 5164, 4794, 5246, 5325, 5778, 4303, 4785, 4855, 5251, 4908, 5343, 5414, 5836, 4990, 5441, 5508, 5899, 5602, 5961, 6049, 6382, 4506, 4874, 4927, 5408, 5023, 5487, 5 578, 5934, 5160, 5581, 5629, 6043, 5741, 5999, 6156, 6485, 5271, 5682, 5793, 6131, 5842, 61 90, 6235, 6563, 5916, 6254, 6251, 6644, 6369, 6692, 6739, 7026, 4662, 4978, 5096, 5584, 524 3, 5631, 5714, 6076, 5335, 5773, 5810, 6177, 5882, 6202, 6249, 6591, 5417, 5853, 5937, 6233, 5972, 6261, 6373, 6696, 6074, 6399, 6442, 6754, 6522, 6830, 6878, 7166, 5554, 5951, 6035, 6 380, 6152, 6386, 6506, 6777, 6168, 6492, 6571, 6858, 6627, 6918, 6997, 7263, 6204, 6603, 66 77, 6942, 6720, 7009, 6972, 7300, 6807, 7066, 7106, 7392, 7185, 7439, 7501, 7646, 2165, 248 5, 2632, 3180, 2745, 3356, 3446, 3947, 2813, 3481, 3541, 3977, 3625, 4072, 4098, 4698, 2838, 3616, 3675, 4066, 3733, 4326, 4371, 4818, 3879, 4382, 4483, 4949, 4560, 5032, 5101, 5593, 2 862, 3709, 3813, 4348, 3889, 4478, 4534, 5003, 3951, 4582, 4635, 5116, 4707, 5201, 5263, 56 40, 4015, 4671, 4755, 5231, 4844, 5322, 5368, 5752, 4882, 5350, 5444, 5848, 5455, 5893, 595 7, 6462, 3265, 3885, 3927, 4552, 3989, 4640, 4702, 5175, 4130, 4762, 4804, 5300, 4895, 5386, 5434, 5784, 4223, 4813, 4922, 5360, 4998, 5451, 5473, 5870, 5058, 5478, 5505, 5964, 5679, 6 014, 6112, 6489, 4309, 4995, 5040, 5499, 5138, 5572, 5590, 5986, 5209, 5673, 5729, 6071, 58 16, 6143, 6183, 6575, 5294, 5761, 5845, 6186, 5923, 6226, 6318, 6630, 6031, 6331, 6402, 669 9, 6445, 6766, 6842, 7157, 3294, 3971, 4076, 4748, 4211, 4810, 4903, 5400, 4281, 4936, 5008, 5481, 5078, 5522, 5543, 5975, 4426, 5045, 5133, 5546, 5206, 5661, 5711, 6058, 5291, 5746, 5 813, 6161, 5876, 6207, 6283, 6577, 4539, 5168, 5260, 5723, 5374, 5799, 5790, 6214, 5424, 58 56, 5890, 6267, 5993, 6321, 6354, 6707, 5516, 5926, 6022, 6343, 6061, 6422, 6449, 6781, 612 4, 6483, 6540, 6862, 6642, 6926, 7000, 7269, 4620, 5308, 5383, 5865, 5470, 5910, 5996, 6334, 5652, 6025, 6089, 6435, 6101, 6458, 6512, 6826, 5688, 6092, 6119, 6502, 6217, 6533, 6616, 6 914, 6299, 6638, 6673, 6946, 6735, 7030, 7079, 7316, 5749, 6242, 6277, 6581, 6360, 6648, 66 88, 6980, 6406, 6728, 6785, 7061, 6846, 717410, 7176, 7416547, 6792, 6865, 7124, 6934, 719 4, 7224, 7482, 6984, 7248, 7294, 7519, 7354, 7574, 7638, 7822, 3423, 4135, 4245, 4941, 4415, 5037, 5118, 5617, 4461, 5146, 5228, 5670, 5303, 5735, 5833, 6286, 4593, 5268, 5397, 5781, 5 450, 5905, 5879, 6309, 5490, 5940, 6004, 6393, 6082, 6426, 6468, 6812, 4850, 5427, 5496, 59 02, 5649, 5983, 6038, 6439, 5667, 6085, 6109, 6475, 6146, 6520, 6557, 6893, 5691, 6134, 619 9, 6553, 6295, 6613, 6667, 6955, 6347, 6717, 6732, 7035, 6788, 7083, 7138, 7381, 4888, 5643, 5658, 6064, 5694, 6097, 6158, 6530, 5758, 6221, 6270, 6595, 6327, 6652, 6724, 7018, 6020, 6 293, 6363, 6669, 6409, 6758, 6796, 7070, 6526, 6799, 6869, 7129, 6938, 7190, 7219, 7475, 61 04, 6419, 6499, 6761, 6550, 6855, 6902, 7152, 6623, 6922, 6963, 7214, 7013, 7253, 7310, 753 9, 6681, 6988, 7048, 7290, 7101, 7326, 7375, 7588, 7162, 7398, 7434, 7624, 7463, 7694, 7711, 7914, 4917, 5702, 5732, 6279, 5981, 6315, 6350, 6710, 6046, 6389, 6428, 6770, 6510, 6823, 6 890, 7143, 6116, 6466, 6543, 6835, 6589, 6905, 6967, 7205, 6655, 7005, 6958, 7238, 7075, 73 05, 7348, 7559, 6302, 6567, 6609, 6930, 6703, 6975, 7043, 7274, 6750, 7053, 7096, 7332, 713 4, 7359, 7416, 7616, 6850, 7115, 7171, 7386, 7229, 7445, 7469, 7677, 7259, 7514, 7533, 7728, 7580, 7754, 7773, 7878, 6413, 6620, 6746, 7057, 6819, 7093, 7120, 7365, 6881, 7180, 7199, 7 427, 7244, 7452, 7526, 7702, 6897, 7234, 7279, 7507, 7342, 7546, 7553, 7764, 7404, 7594, 76 09, 7782, 7662, 7833, 7854, 7987, 7022, 7321, 7337, 7567, 7421, 7602, 7632, 7802, 7457, 767 0, 7686, 7844, 7737, 7866, 7928, 8021, 7494, 7720, 7745, 7889, 7793, 7902, 7942, 8040, 7812, 7955, 7971, 8061, 8003, 8084, 8111, 8145, 315, 749, 1016, 1608, 1189, 1682, 1923, 2412, 132 5, 1867, 2017, 2520, 2143, 2641, 2685, 3363, 1434, 1971, 2063, 2617, 2252, 2771, 2935, 3421, 2350, 2919, 2846, 3496, 3097, 3590, 3649, 4157, 1526, 2183, 2320, 2810, 2383, 2901, 3004, 3 519, 2544, 3066, 3125, 3599, 3301, 3714, 3767, 4273, 2664, 3155, 3337, 3750, 3398, 3825, 39 07, 4350, 3487, 3923, 4005, 4498, 4049, 4563, 4675, 5154, 1748, 2218, 2466, 3051, 2569, 311 2, 3287, 3666, 2708, 3349, 3182, 3775, 3453, 3858, 3961, 4398, 2884, 3325, 3476, 3915, 3539, 3983, 4043, 4537, 3630, 4062, 4179, 4622, 4267, 4711, 4787, 5295, 3035, 3508, 3610, 4035, 3 731, 4114, 4227, 4689, 3808, 4233, 4344, 4753, 4417, 4862, 4929, 5405, 3945, 4386, 4521, 48 79, 4554, 4934, 5027, 5494, 4655, 5055, 5131, 5564, 5199, 5624, 5727, 6213, 2103, 2438, 259 3, 3313, 2790, 3386, 3430, 3953, 2954, 3465, 3550, 4027, 3638, 4108, 4137, 4685, 3082, 3559, 3658, 4122, 3758, 4219, 4324, 4764, 3850, 4330, 4392, 4834, 4532, 4912, 5005, 5462, 3209, 3 694, 3817, 4259, 3866, 4336, 4434, 4884, 4013, 4510, 4558, 4946, 4649, 5052, 5108, 5558, 41 28, 4607, 4694, 5075, 4759, 5181, 5211, 5615, 4867, 5252, 5352, 5701, 5422, 5780, 5938, 621 5, 3263, 3833, 3975, 4451, 4092, 4543, 4644, 5067, 4165, 4658, 4719, 5151, 4792, 5207, 5287, 5674, 4313, 4773, 4839, 5244, 4937, 5333, 5413, 5806, 4985, 5433, 5507, 5869, 5582, 5965, 6 021, 6431, 4428, 4893, 4959, 5365, 5083, 5456, 5520, 5920, 5196, 5544, 5618, 5997, 5704, 60 32, 6154, 6539, 5284, 5648, 5733, 6098, 5771, 6194, 6246, 6628, 5930, 6271, 6329, 6610, 638 5, 6697, 6802, 7108, 2287, 2728, 2827, 3528, 2970, 3570, 3677, 4213, 2986, 3686, 3783, 4279, 3883, 4404, 4463, 4997, 3197, 3792, 3891, 4481, 3991, 4526, 4597, 5002, 4057, 4586, 4680, 5 128, 4778, 5193, 5227, 5612, 3236, 3969, 4070, 4493, 4193, 4613, 4700, 5188, 4253, 4744, 47 97, 5233, 4853, 5327, 5382, 5765, 4247, 4843, 4901, 5321, 4980, 5419, 5468, 5875, 5092, 552 9, 5588, 5962, 5642, 6015, 6111, 6511, 3375, 4151, 4199, 4730, 4299, 4820, 4898, 5298, 4361, 4924, 4954, 5410, 5030, 5491, 5541, 5955, 4664, 5010, 5088, 5503, 5159, 5576, 5639, 6006, 5 262, 5660, 5748, 6090, 5817, 6188, 6253, 6594, 4815, 5139, 5241, 5606, 5316, 5695, 5757, 61 60, 5396, 5791, 5840, 6209, 5941, 6298, 6351, 6671, 5514, 5936, 5971, 6330, 6009, 6390, 631 3, 6722, 6129, 6501, 6544, 6824, 6562, 6925, 6978, 7165, 3442, 4285, 4318, 4976, 4618, 5047, 5100, 5526, 4739, 5119, 5165, 5594, 5259, 5669, 5745, 6167, 4806, 5247, 5313, 5672, 5361, 5 759, 5826, 6225, 5436, 5849, 5914, 6282, 6003, 6342, 6427, 6737, 4993, 5330, 5379, 5820, 54 65, 5895, 5979, 6317, 5591, 5982, 6024, 6420, 6133, 6379, 6525, 6831, 5692, 6075, 6182, 650 3, 6227, 6558, 6601, 6895, 6301, 6619, 6615, 6964, 6725, 7003, 7045, 7283, 5134, 5425, 5532, 5988, 5663, 6029, 6105, 6453, 5751, 6163, 6196, 6548, 6269, 6570, 6614, 6919, 5829, 6238, 6 319, 6598, 6352, 6624, 6729, 7006, 6448, 6751, 6791, 7056, 6859, 7122, 7158, 7395, 5958, 63 35, 6411, 6733, 6521, 6740, 6845, 7074, 6535, 6834, 6901, 7144, 6951, 7192, 7257, 7476, 657 2, 6928, 6993, 7215, 7028, 7267, 7237, 7502, 7100, 7314, 7346, 7575, 7411, 7613, 7659, 7775, 2495, 2865, 3020, 3619, 3140, 3800, 3899, 4440, 3224, 3931, 3997, 4476, 4084, 4574, 4602, 5 170, 3248, 4078, 4143, 4569, 4205, 4825, 4870, 5281, 4367, 4876, 4971, 5399, 5043, 5474, 55 38, 5995, 3275, 4185, 4293, 4848, 4380, 4963, 5018, 5448, 4445, 5063, 5111, 5552, 5177, 562 7, 5683, 6036, 4515, 5147, 5219, 5657, 5302, 5736, 5786, 6145, 5338, 5768, 5855, 6234, 5866, 6281, 6339, 6809, 3705, 4375, 4423, 5035, 4487, 5115, 5173, 5603, 4633, 5230, 5267, 5716, 5 347, 5800, 5846, 6175, 4725, 5278, 5375, 5777, 5442, 5883, 6257, 5500, 5886, 5912, 63 46, 6072, 6394, 6486, 6833, 4811, 5439, 5482, 5906, 5570, 5974, 5989, 6368, 5636, 6068, 611 8, 6446, 6206, 6515, 6552, 6904, 5713, 6153, 6231, 6554, 6306, 6590, 6678, 6954, 6410, 6689, 6755, 7011, 6795, 7068, 7128, 7387, 3739, 4468, 4580, 5215, 4714, 5270, 5358, 5812, 4783, 5 390, 5453, 5892, 5517, 5927, 5947, 6358, 4920, 5488, 5567, 5950, 5630, 6054, 6103, 6433, 57 07, 6138, 6200, 6534, 6262, 6576, 6645, 6908, 5022, 5600, 5680, 6113, 5789, 6187, 6179, 658 0, 5832, 6243, 6275, 6632, 6372, 6682, 6712, 7017, 5922, 6310, 6401, 6701, 6437, 6772, 6798, 7077, 6497, 6828, 6873, 7147, 6961, 7200, 7260, 7479, 5095, 5724, 5797, 6250, 5878, 6294, 6 375, 6693, 6047, 6405, 6463, 6783, 6474, 6806, 6852, 7117, 6081, 6467, 6493, 6841, 6584, 68 70, 6939, 7188, 6661, 6957, 6990, 7217, 7042, 7287, 7325, 7515, 6141, 6605, 6639, 6911, 671 4, 6968, 6999, 7245, 6759, 7036, 7082, 7311, 7133, 7350, 7402, 7589, 6880, 7089, 7151, 7363, 7207, 7419, 7441, 7649, 7250, 7462, 7497, 7674, 7547, 7717, 7769, 7906, 3874, 4638, 4750, 5 393, 4907, 5479, 5555, 6013, 4951, 5579, 5651, 6063, 5722, 6126, 6219, 6649, 5072, 5689, 58 09, 6169, 5858, 6290, 6265, 6668, 5897, 6323, 6384, 6748, 6457, 6776, 6817, 7103, 5310, 583 8, 5903, 6287, 6045, 6364, 6416, 6787, 6060, 6459, 6481, 6820, 6519, 6856, 6891, 7173, 6083, 6507, 6566, 6887, 6657, 6936, 6981, 7222, 6704, 7024, 7038, 7291, 7086, 7330, 7374, 7565, 5 344, 6039, 6052, 6441, 6087, 6471, 6529, 6867, 6148, 6587, 6635, 6921, 6686, 6970, 7032, 72 76, 6397, 6653, 6718, 6986, 6763, 7060, 7091, 7318, 6863, 7097, 7155, 7366, 7210, 7415, 743 7, 7644, 6477, 6769, 6837, 7063, 6884, 7140, 7181, 7383, 6948, 7195, 7230, 7432, 7271, 7466, 7511, 7690, 6996, 7252, 7299, 7493, 7343, 7524, 7561, 7729, 7391, 7579, 7608, 7758, 7634, 7 807, 7819, 7977, 5369, 6096, 6120, 6640, 6362, 6674, 6708, 7021, 6423, 6744, 6780, 7071, 68 48, 7114, 7169, 7378, 6488, 6813, 6876, 7125, 6915, 7184, 7232, 7428, 6974, 7265, 7225, 745 4, 7323, 7505, 7543, 7707, 6664, 6898, 6932, 7202, 7015, 7240, 7295, 7484, 7054, 7302, 7339, 7528, 7369, 7551, 7593, 7752, 7136, 7355, 7400, 7570, 7446, 7619, 7639, 7795, 7472, 7669, 7 685, 7834, 7723, 7853, 7869, 7949, 6765, 6944, 7050, 7307, 7111, 7334, 7358, 7556, 7163, 74 07, 7423, 7604, 7458, 7623, 7679, 7814, 7177, 7449, 7487, 7664, 7537, 7696, 7700, 7861, 758 5, 7735, 7746, 7875, 7783, 7916, 7931, 8031, 7278, 7521, 7534, 7712, 7599, 7740, 7765, 7891, 7628, 7788, 7800, 7923, 7840, 7940, 7988, 8057, 7653, 7827, 7847, 7959, 7883, 7967, 7997, 8 072, 7899, 8009, 8019, 8088, 8044, 8105, 8126, 8152, 1813, 2748, 3167, 3937, 3409, 4021, 42 39, 4801, 3579, 4171, 4355, 4915, 4504, 5038, 5080, 5686, 3722, 4305, 4411, 5013, 4628, 514 2, 5306, 5730, 4734, 5292, 5222, 5803, 5459, 5880, 5933, 6344, 3842, 4549, 4705, 5185, 4769, 5273, 5372, 5823, 4942, 5430, 5485, 5889, 5633, 5992, 6034, 6424, 5060, 5511, 5666, 6018, 5 719, 6086, 6150, 6480, 5794, 6165, 6229, 6582, 6259, 6625, 6698, 7019, 4100, 4591, 4857, 54 16, 4968, 5471, 5621, 5953, 5103, 5677, 5523, 6042, 5762, 6108, 6191, 6513, 5255, 5654, 578 3, 6157, 5843, 6210, 6255, 6608, 5917, 6273, 6355, 6666, 6418, 6723, 6775, 7107, 5402, 5815, 5900, 6247, 6000, 6307, 6392, 6709, 6070, 6398, 6476, 6753, 6524, 6822, 6872, 7174, 6176, 6 504, 6596, 6840, 6618, 6875, 6937, 7228, 6687, 6956, 7004, 7268, 7049, 7303, 7361, 7601, 44 57, 4829, 4988, 5645, 5162, 5710, 5742, 6184, 5324, 5774, 5852, 6241, 5924, 6303, 6326, 670 6, 5445, 5863, 5944, 6314, 6027, 6388, 6461, 6760, 6100, 6464, 6508, 6804, 6604, 6861, 6924, 7208, 5549, 5976, 6078, 6414, 6115, 6470, 6538, 6844, 6237, 6586, 6622, 6882, 6683, 6952, 6 987, 7266, 6322, 6654, 6715, 6969, 6756, 7037, 7055, 7298, 6825, 7081, 7142, 7347, 7186, 73 89, 7468, 7603, 5597, 6093, 6203, 6549, 6297, 6611, 6679, 6962, 6348, 6691, 6730, 7016, 677 9, 7051, 7104, 7333, 6450, 6764, 6808, 7076, 6879, 7131, 7179, 7401, 6910, 7191, 7236, 7435, 7281, 7483, 7509, 7701, 6531, 6847, 6892, 7150, 6973, 7206, 7243, 7459, 7047, 7258, 7301, 7 498, 7349, 7516, 7576, 7749, 7102, 7317, 7364, 7548, 7384, 7592, 7617, 7785, 7465, 7629, 76 56, 7778, 7682, 7813, 7855, 7970, 4669, 5123, 5204, 5835, 5341, 5872, 5960, 6381, 5355, 596 8, 6050, 6429, 6130, 6517, 6556, 6916, 5535, 6057, 6135, 6568, 6218, 6600, 6647, 6920, 6266, 6643, 6702, 7001, 6767, 7044, 7064, 7297, 5573, 6198, 6278, 6578, 6365, 6658, 6719, 7041, 6 407, 6745, 6782, 7069, 6818, 7127, 7161, 7380, 6403, 6811, 6853, 7123, 6907, 7183, 7213, 74 36, 6979, 7247, 7282, 7481, 7315, 7508, 7554, 7736, 5698, 6336, 6371, 6738, 6444, 6797, 685 1, 7109, 6484, 6868, 6889, 7178, 6940, 7227, 7255, 7477, 6694, 6927, 6976, 7235, 7023, 7275, 7313, 7503, 7087, 7324, 7372, 7544, 7408, 7591, 7621, 7771, 6793, 7010, 7073, 7293, 7121, 7 344, 7376, 7577, 7170, 7394, 7420, 7600, 7471, 7641, 7665, 7803, 7239, 7467, 7485, 7657, 75 04, 7683, 7648, 7823, 7563, 7731, 7750, 7863, 7757, 7904, 7924, 7991, 5754, 6436, 6454, 690 3, 6662, 6949, 6985, 7246, 6742, 6998, 7025, 7286, 7084, 7329, 7368, 7581, 6786, 7080, 7118, 7331, 7149, 7377, 7412, 7606, 7193, 7425, 7456, 7635, 7499, 7661, 7699, 7829, 6913, 7130, 7 159, 7409, 7212, 7447, 7489, 7650, 7285, 7491, 7512, 7697, 7564, 7678, 7742, 7865, 7341, 75 36, 7587, 7732, 7610, 7756, 7774, 7892, 7643, 7781, 7780, 7919, 7825, 7933, 7948, 8028, 700 7, 7187, 7251, 7492, 7327, 7513, 7550, 7710, 7373, 7578, 7596, 7751, 7627, 7760, 7779, 7901, 7413, 7614, 7651, 7772, 7666, 7784, 7826, 7934, 7709, 7835, 7850, 7952, 7879, 7975, 7989, 8 062, 7478, 7658, 7693, 7828, 7741, 7830, 7872, 7960, 7748, 7868, 7894, 7983, 7912, 7999, 80 20, 8083, 7761, 7905, 7929, 8007, 7943, 8024, 8014, 8091, 7968, 8038, 8048, 8109, 8067, 811 8, 8128, 8151, 4889, 5236, 5385, 5909, 5497, 6065, 6142, 6542, 5561, 6172, 6222, 6565, 6291, 6633, 6650, 7029, 5585, 6285, 6333, 6629, 6377, 6801, 6829, 7099, 6490, 6836, 6899, 7172, 6 945, 7216, 7254, 7496, 5609, 6359, 6440, 6814, 6498, 6896, 6931, 7201, 6545, 6960, 6991, 72 61, 7034, 7306, 7338, 7517, 6592, 7012, 7062, 7113, 7367, 7390, 7569, 7135, 7382, 742 6, 7612, 7431, 7633, 7660, 7857, 5985, 6494, 6527, 6943, 6573, 6994, 7031, 7292, 6672, 7067, 7090, 7356, 7141, 7399, 7422, 7583, 6734, 7095, 7156, 7385, 7198, 7430, 7440, 7622, 7231, 7 443, 7455, 7663, 7535, 7684, 7725, 7867, 6790, 7197, 7221, 7453, 7273, 7486, 7495, 7673, 73 09, 7532, 7557, 7708, 7598, 7738, 7753, 7896, 7352, 7572, 7611, 7755, 7645, 7770, 7805, 791 3, 7691, 7810, 7836, 7935, 7851, 7956, 7978, 8059, 6011, 6559, 6637, 7058, 6727, 7094, 7145, 7406, 6771, 7164, 7203, 7444, 7242, 7464, 7473, 7668, 6864, 7223, 7270, 7474, 7308, 7527, 7 549, 7703, 7351, 7566, 7597, 7744, 7625, 7763, 7791, 7897, 6933, 7289, 7335, 7555, 7393, 75 90, 7586, 7766, 7417, 7615, 7631, 7786, 7675, 7806, 7818, 7938, 7460, 7647, 7688, 7815, 770 4, 7843, 7852, 7961, 7730, 7864, 7884, 7984, 7918, 8001, 8022, 8085, 6982, 7360, 7397, 7620, 7438, 7640, 7676, 7811, 7523, 7689, 7715, 7848, 7721, 7856, 7874, 7974, 7538, 7716, 7727, 7 871, 7767, 7882, 7909, 7998, 7798, 7917, 7927, 8008, 7947, 8029, 8042, 8094, 7568, 7777, 77 89, 7898, 7820, 7920, 7932, 8016, 7837, 7945, 7962, 8037, 7979, 8049, 8065, 8113, 7886, 796 4, 7985, 8052, 8004, 8069, 8075, 8125, 8017, 8080, 8090, 8131, 8102, 8140, 8150, 8171, 6123, 6676, 6749, 7167, 6857, 7220, 7262, 7506, 6885, 7277, 7319, 7531, 7357, 7560, 7605, 7794, 6 966, 7340, 7403, 7582, 7429, 7637, 7626, 7801, 7448, 7652, 7681, 7832, 7713, 7845, 7860, 79 69, 7116, 7418, 7450, 7636, 7522, 7672, 7695, 7849, 7529, 7714, 7724, 7862, 7739, 7877, 789 0, 7993, 7540, 7734, 7759, 7888, 7797, 7908, 7925, 8010, 7816, 7941, 7946, 8030, 7963, 8043, 8055, 8107, 7137, 7518, 7525, 7705, 7542, 7718, 7743, 7881, 7571, 7768, 7787, 7903, 7809, 7 921, 7944, 8026, 7687, 7796, 7821, 7926, 7838, 7953, 7965, 8039, 7880, 7966, 7986, 8053, 80 05, 8068, 8074, 8124, 7722, 7842, 7870, 7954, 7887, 7982, 7995, 8058, 7911, 8000, 8012, 807 3, 8025, 8081, 8093, 8134, 7930, 8018, 8034, 8089, 8047, 8096, 8106, 8142, 8060, 8110, 8117, 8148, 8122, 8157, 8159, 8179, 7154, 7545, 7558, 7790, 7671, 7804, 7817, 7939, 7698, 7831, 7 846, 7958, 7873, 7973, 7992, 8056, 7726, 7859, 7885, 7976, 7900, 7996, 8013, 8071, 7922, 80 23, 8011, 8078, 8041, 8092, 8101, 8137, 7799, 7893, 7907, 8002, 7937, 8015, 8032, 8086, 795 1, 8035, 8046, 8097, 8054, 8103, 8114, 8147, 7980, 8050, 8063, 8108, 8076, 8119, 8123, 8155, 8082, 8130, 8133, 8161, 8141, 8164, 8166, 8176, 7839, 7910, 7950, 8036, 7972, 8045, 8051, 8 104, 7990, 8066, 8070, 8116, 8079, 8120, 8132, 8158, 7994, 8077, 8087, 8129, 8100, 8135, 81 36, 8165, 8112, 8143, 8146, 8167, 8153, 8172, 8174, 8184, 8027, 8095, 8099, 8139, 8115, 814 4, 8149, 8169, 8121, 8154, 8156, 8173, 8162, 8175, 8180, 8186, 8127, 8160, 8163, 8177, 8168, 8178, 8181, 8187, 8170, 8182, 8183, 8188, 8185, 8159, 8190, 8191];

TABLE Z1 with a sequence length of 8192:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 8 |
| 6 | 14 |
| 7 | 27 |
| 8 | 4 |
| 9 | 13 |
| 10 | 16 |
| 11 | 31 |
| 12 | 19 |
| 13 | 36 |
| 14 | 38 |
| 15 | 84 |
| 16 | 5 |
| 17 | 15 |
| 18 | 17 |
| 19 | 35 |
| 20 | 22 |
| 21 | 42 |
| 22 | 52 |
| 23 | 89 |
| 24 | 25 |
| 25 | 51 |
| 26 | 46 |
| 27 | 97 |
| 28 | 63 |
| 29 | 106 |
| 30 | 113 |
| 31 | 182 |
| 32 | 6 |
| 33 | 20 |
| 34 | 24 |
| 35 | 44 |
| 36 | 26 |
| 37 | 50 |
| 38 | 57 |
| 39 | 99 |
| 40 | 32 |
| 41 | 61 |
| 42 | 65 |
| 43 | 107 |
| 44 | 78 |
| 45 | 120 |
| 46 | 126 |
| 47 | 201 |
| 48 | 37 |
| 49 | 67 |
| 50 | 82 |
| 51 | 124 |
| 52 | 87 |
| 53 | 135 |
| 54 | 145 |
| 55 | 215 |
| 56 | 96 |
| 57 | 147 |
| 58 | 160 |
| 59 | 243 |
| 60 | 166 |
| 61 | 257 |
| 62 | 281 |
| 63 | 408 |
| 64 | 9 |
| 65 | 21 |
| 66 | 29 |
| 67 | 60 |
| 68 | 33 |
| 69 | 64 |
| 70 | 77 |
| 71 | 115 |
| 72 | 39 |
| 73 | 83 |
| 74 | 69 |
| 75 | 127 |
| 76 | 92 |
| 77 | 139 |
| 78 | 153 |
| 79 | 224 |
| 80 | 49 |
| 81 | 80 |
| 82 | 95 |
| 83 | 146 |
| 84 | 101 |
| 85 | 156 |
| 86 | 165 |
| 87 | 251 |
| 88 | 111 |
| 89 | 168 |
| 90 | 186 |
| 91 | 269 |
| 92 | 200 |
| 93 | 288 |
| 94 | 307 |
| 95 | 454 |
| 96 | 59 |
| 97 | 98 |
| 98 | 109 |

TABLE Z1-continued with a sequence length of 8192:

| Polarized channel sequence number | Reliability or reliability sequence number |
|---|---|
| 99 | 164 |
| 100 | 122 |
| 101 | 176 |
| 102 | 194 |
| 103 | 284 |
| 104 | 133 |
| 105 | 195 |
| 106 | 214 |
| 107 | 299 |
| 108 | 227 |
| 109 | 325 |
| 110 | 343 |
| 111 | 494 |
| 112 | 150 |
| 113 | 222 |
| 114 | 247 |
| 115 | 330 |
| 116 | 254 |
| 117 | 344 |
| 118 | 371 |
| 119 | 528 |
| 120 | 275 |
| 121 | 378 |
| 122 | 402 |
| 123 | 556 |
| 124 | 423 |
| 125 | 581 |
| 126 | 627 |
| 127 | 877 |
| 128 | 18 |
| 129 | 28 |
| 130 | 34 |
| 131 | 79 |
| 132 | 43 |
| 133 | 86 |
| 134 | 90 |
| 135 | 151 |
| 136 | 54 |
| 137 | 94 |
| 138 | 102 |
| 139 | 163 |
| 140 | 112 |
| 141 | 175 |
| 142 | 179 |
| 143 | 283 |
| 144 | 62 |
| 145 | 103 |
| 146 | 114 |
| 147 | 177 |
| 148 | 125 |
| 149 | 193 |
| 150 | 211 |
| 151 | 301 |
| 152 | 138 |
| 153 | 212 |
| 154 | 223 |
| 155 | 319 |
| 156 | 249 |
| 157 | 339 |
| 158 | 364 |
| 159 | 516 |
| 160 | 71 |
| 161 | 118 |
| 162 | 134 |
| 163 | 199 |
| 164 | 140 |
| 165 | 213 |
| 166 | 230 |
| 167 | 331 |
| 168 | 161 |
| 169 | 245 |
| 170 | 255 |
| 171 | 347 |
| 172 | 274 |
| 173 | 377 |

TABLE Z1-continued with a sequence length of 8192:

| Polarized channel sequence number | Reliability or reliability sequence number |
|---|---|
| 174 | 394 |
| 175 | 553 |
| 176 | 178 |
| 177 | 266 |
| 178 | 285 |
| 179 | 385 |
| 180 | 300 |
| 181 | 417 |
| 182 | 426 |
| 183 | 578 |
| 184 | 327 |
| 185 | 440 |
| 186 | 475 |
| 187 | 615 |
| 188 | 501 |
| 189 | 649 |
| 190 | 725 |
| 191 | 878 |
| 192 | 75 |
| 193 | 136 |
| 194 | 155 |
| 195 | 233 |
| 196 | 173 |
| 197 | 252 |
| 198 | 273 |
| 199 | 382 |
| 200 | 183 |
| 201 | 277 |
| 202 | 291 |
| 203 | 407 |
| 204 | 308 |
| 205 | 425 |
| 206 | 452 |
| 207 | 603 |
| 208 | 208 |
| 209 | 304 |
| 210 | 320 |
| 211 | 437 |
| 212 | 345 |
| 213 | 468 |
| 214 | 496 |
| 215 | 662 |
| 216 | 358 |
| 217 | 504 |
| 218 | 533 |
| 219 | 690 |
| 220 | 564 |
| 221 | 738 |
| 222 | 767 |
| 223 | 1022 |
| 224 | 229 |
| 225 | 334 |
| 226 | 352 |
| 227 | 479 |
| 228 | 387 |
| 229 | 513 |
| 230 | 538 |
| 231 | 715 |
| 232 | 422 |
| 233 | 548 |
| 234 | 579 |
| 235 | 755 |
| 236 | 616 |
| 237 | 773 |
| 238 | 842 |
| 239 | 1103 |
| 240 | 451 |
| 241 | 592 |
| 242 | 630 |
| 243 | 809 |
| 244 | 645 |
| 245 | 865 |
| 246 | 897 |
| 247 | 1175 |
| 248 | 720 |

TABLE Z1-continued with a sequence length of 8192:

| Polarized channel sequence number | Reliability or reliability sequence number |
|---|---|
| 249 | 914 |
| 250 | 951 |
| 251 | 1160 |
| 252 | 990 |
| 253 | 1235 |
| 254 | 1333 |
| 255 | 1678 |
| 256 | 23 |
| 257 | 40 |
| 258 | 45 |
| 259 | 100 |
| 260 | 55 |
| 261 | 104 |
| 262 | 116 |
| 263 | 192 |
| 264 | 56 |
| 265 | 117 |
| 266 | 129 |
| 267 | 202 |
| 268 | 142 |
| 269 | 225 |
| 270 | 236 |
| 271 | 362 |
| 272 | 70 |
| 273 | 130 |
| 274 | 143 |
| 275 | 240 |
| 276 | 157 |
| 277 | 248 |
| 278 | 263 |
| 279 | 363 |
| 280 | 167 |
| 281 | 261 |
| 282 | 282 |
| 283 | 400 |
| 284 | 305 |
| 285 | 421 |
| 286 | 432 |
| 287 | 577 |
| 288 | 73 |
| 289 | 154 |
| 290 | 169 |
| 291 | 242 |
| 292 | 188 |
| 293 | 267 |
| 294 | 286 |
| 295 | 420 |
| 296 | 198 |
| 297 | 297 |
| 298 | 309 |
| 299 | 434 |
| 300 | 323 |
| 301 | 466 |
| 302 | 486 |
| 303 | 643 |
| 304 | 197 |
| 305 | 321 |
| 306 | 336 |
| 307 | 463 |
| 308 | 357 |
| 309 | 500 |
| 310 | 518 |
| 311 | 694 |
| 312 | 389 |
| 313 | 542 |
| 314 | 566 |
| 315 | 737 |
| 316 | 589 |
| 317 | 764 |
| 318 | 816 |
| 319 | 1081 |
| 320 | 85 |
| 321 | 181 |
| 322 | 190 |
| 323 | 293 |

TABLE Z1-continued with a sequence length of 8192:

| Polarized channel sequence number | Reliability or reliability sequence number |
|---|---|
| 324 | 206 |
| 325 | 316 |
| 326 | 335 |
| 327 | 456 |
| 328 | 217 |
| 329 | 342 |
| 330 | 351 |
| 331 | 495 |
| 332 | 372 |
| 333 | 527 |
| 334 | 547 |
| 335 | 733 |
| 336 | 279 |
| 337 | 365 |
| 338 | 388 |
| 339 | 532 |
| 340 | 409 |
| 341 | 562 |
| 342 | 588 |
| 343 | 760 |
| 344 | 443 |
| 345 | 597 |
| 346 | 635 |
| 347 | 805 |
| 348 | 667 |
| 349 | 862 |
| 350 | 901 |
| 351 | 1147 |
| 352 | 313 |
| 353 | 404 |
| 354 | 436 |
| 355 | 574 |
| 356 | 462 |
| 357 | 613 |
| 358 | 638 |
| 359 | 845 |
| 360 | 491 |
| 361 | 655 |
| 362 | 677 |
| 363 | 874 |
| 364 | 726 |
| 365 | 931 |
| 366 | 966 |
| 367 | 1211 |
| 368 | 535 |
| 369 | 724 |
| 370 | 742 |
| 371 | 952 |
| 372 | 761 |
| 373 | 992 |
| 374 | 940 |
| 375 | 1257 |
| 376 | 826 |
| 377 | 1074 |
| 378 | 1107 |
| 379 | 1355 |
| 380 | 1121 |
| 381 | 1459 |
| 382 | 1518 |
| 383 | 1755 |
| 384 | 91 |
| 385 | 203 |
| 386 | 209 |
| 387 | 356 |
| 388 | 268 |
| 389 | 376 |
| 390 | 392 |
| 391 | 541 |
| 392 | 295 |
| 393 | 397 |
| 394 | 412 |
| 395 | 569 |
| 396 | 442 |
| 397 | 601 |
| 398 | 634 |

TABLE Z1-continued with a sequence length of 8192:

| Polarized channel sequence number | Reliability or reliability sequence number |
|---|---|
| 399 | 849 |
| 400 | 311 |
| 401 | 439 |
| 402 | 461 |
| 403 | 602 |
| 404 | 478 |
| 405 | 641 |
| 406 | 670 |
| 407 | 884 |
| 408 | 505 |
| 409 | 682 |
| 410 | 713 |
| 411 | 921 |
| 412 | 757 |
| 413 | 960 |
| 414 | 1019 |
| 415 | 1270 |
| 416 | 361 |
| 417 | 467 |
| 418 | 484 |
| 419 | 668 |
| 420 | 517 |
| 421 | 703 |
| 422 | 745 |
| 423 | 943 |
| 424 | 567 |
| 425 | 746 |
| 426 | 769 |
| 427 | 1014 |
| 428 | 830 |
| 429 | 985 |
| 430 | 1092 |
| 431 | 1361 |
| 432 | 611 |
| 433 | 797 |
| 434 | 858 |
| 435 | 1075 |
| 436 | 885 |
| 437 | 1117 |
| 438 | 1154 |
| 439 | 1426 |
| 440 | 932 |
| 441 | 1168 |
| 442 | 1165 |
| 443 | 1503 |
| 444 | 1260 |
| 445 | 1547 |
| 446 | 1599 |
| 447 | 1928 |
| 448 | 403 |
| 449 | 502 |
| 450 | 543 |
| 451 | 750 |
| 452 | 599 |
| 453 | 772 |
| 454 | 814 |
| 455 | 1037 |
| 456 | 636 |
| 457 | 847 |
| 458 | 867 |
| 459 | 1110 |
| 460 | 912 |
| 461 | 1128 |
| 462 | 1163 |
| 463 | 1452 |
| 464 | 672 |
| 465 | 893 |
| 466 | 945 |
| 467 | 1150 |
| 468 | 967 |
| 469 | 1172 |
| 470 | 1264 |
| 471 | 1552 |
| 472 | 1034 |
| 473 | 1284 |

TABLE Z1-continued with a sequence length of 8192:

| Polarized channel sequence number | Reliability or reliability sequence number |
|---|---|
| 474 | 1322 |
| 475 | 1613 |
| 476 | 1390 |
| 477 | 1696 |
| 478 | 1745 |
| 479 | 2117 |
| 480 | 734 |
| 481 | 955 |
| 482 | 1008 |
| 483 | 1267 |
| 484 | 1089 |
| 485 | 1273 |
| 486 | 1376 |
| 487 | 1634 |
| 488 | 1101 |
| 489 | 1365 |
| 490 | 1433 |
| 491 | 1725 |
| 492 | 1488 |
| 493 | 1791 |
| 494 | 1886 |
| 495 | 2269 |
| 496 | 1129 |
| 497 | 1463 |
| 498 | 1535 |
| 499 | 1824 |
| 500 | 1577 |
| 501 | 1902 |
| 502 | 1857 |
| 503 | 2323 |
| 504 | 1667 |
| 505 | 1977 |
| 506 | 2030 |
| 507 | 2480 |
| 508 | 2145 |
| 509 | 2568 |
| 510 | 2678 |
| 511 | 3005 |
| 512 | 30 |
| 513 | 48 |
| 514 | 58 |
| 515 | 110 |
| 516 | 66 |
| 517 | 131 |
| 518 | 144 |
| 519 | 231 |
| 520 | 72 |
| 521 | 148 |
| 522 | 159 |
| 523 | 239 |
| 524 | 172 |
| 525 | 259 |
| 526 | 264 |
| 527 | 413 |
| 528 | 74 |
| 529 | 170 |
| 530 | 180 |
| 531 | 258 |
| 532 | 191 |
| 533 | 317 |
| 534 | 328 |
| 535 | 450 |
| 536 | 218 |
| 537 | 329 |
| 538 | 355 |
| 539 | 492 |
| 540 | 375 |
| 541 | 520 |
| 542 | 545 |
| 543 | 754 |
| 544 | 76 |
| 545 | 187 |
| 546 | 204 |
| 547 | 322 |
| 548 | 220 |

TABLE Z1-continued with a sequence length of 8192:

| Polarized channel sequence number | Reliability or reliability sequence number |
|---|---|
| 549 | 353 |
| 550 | 368 |
| 551 | 510 |
| 552 | 232 |
| 553 | 381 |
| 554 | 395 |
| 555 | 551 |
| 556 | 416 |
| 557 | 582 |
| 558 | 608 |
| 559 | 775 |
| 560 | 246 |
| 561 | 406 |
| 562 | 430 |
| 563 | 595 |
| 564 | 457 |
| 565 | 631 |
| 566 | 652 |
| 567 | 836 |
| 568 | 469 |
| 569 | 644 |
| 570 | 684 |
| 571 | 890 |
| 572 | 689 |
| 573 | 920 |
| 574 | 957 |
| 575 | 1340 |
| 576 | 119 |
| 577 | 219 |
| 578 | 228 |
| 579 | 373 |
| 580 | 241 |
| 581 | 396 |
| 582 | 414 |
| 583 | 572 |
| 584 | 271 |
| 585 | 433 |
| 586 | 445 |
| 587 | 622 |
| 588 | 474 |
| 589 | 658 |
| 590 | 680 |
| 591 | 853 |
| 592 | 292 |
| 593 | 449 |
| 594 | 483 |
| 595 | 648 |
| 596 | 508 |
| 597 | 687 |
| 598 | 697 |
| 599 | 905 |
| 600 | 531 |
| 601 | 699 |
| 602 | 712 |
| 603 | 962 |
| 604 | 796 |
| 605 | 996 |
| 606 | 1062 |
| 607 | 1363 |
| 608 | 312 |
| 609 | 507 |
| 610 | 523 |
| 611 | 708 |
| 612 | 558 |
| 613 | 743 |
| 614 | 751 |
| 615 | 977 |
| 616 | 587 |
| 617 | 792 |
| 618 | 820 |
| 619 | 1033 |
| 620 | 873 |
| 621 | 1084 |
| 622 | 1112 |
| 623 | 1437 |

TABLE Z1-continued with a sequence length of 8192:

| Polarized channel sequence number | Reliability or reliability sequence number |
|---|---|
| 624 | 621 |
| 625 | 841 |
| 626 | 889 |
| 627 | 1115 |
| 628 | 936 |
| 629 | 1143 |
| 630 | 1218 |
| 631 | 1492 |
| 632 | 1006 |
| 633 | 1228 |
| 634 | 1288 |
| 635 | 1557 |
| 636 | 1326 |
| 637 | 1626 |
| 638 | 1705 |
| 639 | 2102 |
| 640 | 123 |
| 641 | 238 |
| 642 | 260 |
| 643 | 427 |
| 644 | 289 |
| 645 | 446 |
| 646 | 477 |
| 647 | 664 |
| 648 | 306 |
| 649 | 488 |
| 650 | 511 |
| 651 | 702 |
| 652 | 536 |
| 653 | 719 |
| 654 | 728 |
| 655 | 970 |
| 656 | 341 |
| 657 | 526 |
| 658 | 557 |
| 659 | 731 |
| 660 | 585 |
| 661 | 785 |
| 662 | 813 |
| 663 | 1023 |
| 664 | 617 |
| 665 | 832 |
| 666 | 869 |
| 667 | 1098 |
| 668 | 907 |
| 669 | 1133 |
| 670 | 1190 |
| 671 | 1441 |
| 672 | 369 |
| 673 | 571 |
| 674 | 606 |
| 675 | 818 |
| 676 | 654 |
| 677 | 861 |
| 678 | 857 |
| 679 | 1136 |
| 680 | 674 |
| 681 | 895 |
| 682 | 916 |
| 683 | 1178 |
| 684 | 981 |
| 685 | 1222 |
| 686 | 1248 |
| 687 | 1564 |
| 688 | 716 |
| 689 | 938 |
| 690 | 1000 |
| 691 | 1239 |
| 692 | 1027 |
| 693 | 1305 |
| 694 | 1329 |
| 695 | 1638 |
| 696 | 1070 |
| 697 | 1358 |
| 698 | 1405 |

TABLE Z1-continued with a sequence length of 8192:

| Polarized channel sequence number | Reliability or reliability sequence number |
|---|---|
| 699 | 1729 |
| 700 | 1499 |
| 701 | 1802 |
| 702 | 1892 |
| 703 | 2278 |
| 704 | 391 |
| 705 | 626 |
| 706 | 657 |
| 707 | 900 |
| 708 | 695 |
| 709 | 928 |
| 710 | 982 |
| 711 | 1231 |
| 712 | 781 |
| 713 | 1004 |
| 714 | 1046 |
| 715 | 1316 |
| 716 | 1053 |
| 717 | 1336 |
| 718 | 1383 |
| 719 | 1689 |
| 720 | 799 |
| 721 | 1048 |
| 722 | 1067 |
| 723 | 1372 |
| 724 | 1138 |
| 725 | 1401 |
| 726 | 1474 |
| 727 | 1788 |
| 728 | 1203 |
| 729 | 1495 |
| 730 | 1532 |
| 731 | 1828 |
| 732 | 1595 |
| 733 | 1936 |
| 734 | 1996 |
| 735 | 2352 |
| 736 | 834 |
| 737 | 1156 |
| 738 | 1185 |
| 739 | 1445 |
| 740 | 1249 |
| 741 | 1507 |
| 742 | 1543 |
| 743 | 1869 |
| 744 | 1292 |
| 745 | 1586 |
| 746 | 1644 |
| 747 | 1973 |
| 748 | 1711 |
| 749 | 2038 |
| 750 | 2130 |
| 751 | 2512 |
| 752 | 1412 |
| 753 | 1653 |
| 754 | 1736 |
| 755 | 2060 |
| 756 | 1814 |
| 757 | 2160 |
| 758 | 2203 |
| 759 | 2654 |
| 760 | 1876 |
| 761 | 2243 |
| 762 | 2315 |
| 763 | 2718 |
| 764 | 2421 |
| 765 | 2834 |
| 766 | 2985 |
| 767 | 3484 |
| 768 | 141 |
| 769 | 272 |
| 770 | 298 |
| 771 | 489 |
| 772 | 337 |
| 773 | 521 |

TABLE Z1-continued with a sequence length of 8192:

| Polarized channel sequence number | Reliability or reliability sequence number |
|---|---|
| 774 | 552 |
| 775 | 763 |
| 776 | 349 |
| 777 | 563 |
| 778 | 593 |
| 779 | 790 |
| 780 | 624 |
| 781 | 825 |
| 782 | 881 |
| 783 | 1193 |
| 784 | 383 |
| 785 | 610 |
| 786 | 663 |
| 787 | 851 |
| 788 | 686 |
| 789 | 925 |
| 790 | 909 |
| 791 | 1210 |
| 792 | 705 |
| 793 | 947 |
| 794 | 989 |
| 795 | 1281 |
| 796 | 1041 |
| 797 | 1309 |
| 798 | 1347 |
| 799 | 1671 |
| 800 | 460 |
| 801 | 676 |
| 802 | 707 |
| 803 | 924 |
| 804 | 780 |
| 805 | 975 |
| 806 | 1011 |
| 807 | 1319 |
| 808 | 789 |
| 809 | 1042 |
| 810 | 1060 |
| 811 | 1351 |
| 812 | 1088 |
| 813 | 1387 |
| 814 | 1424 |
| 815 | 1765 |
| 816 | 801 |
| 817 | 1078 |
| 818 | 1124 |
| 819 | 1420 |
| 820 | 1199 |
| 821 | 1471 |
| 822 | 1522 |
| 823 | 1835 |
| 824 | 1241 |
| 825 | 1573 |
| 826 | 1591 |
| 827 | 1940 |
| 828 | 1648 |
| 829 | 2004 |
| 830 | 2079 |
| 831 | 2459 |
| 832 | 471 |
| 833 | 778 |
| 834 | 784 |
| 835 | 1029 |
| 836 | 804 |
| 837 | 1051 |
| 838 | 1095 |
| 839 | 1398 |
| 840 | 837 |
| 841 | 1142 |
| 842 | 1181 |
| 843 | 1456 |
| 844 | 1224 |
| 845 | 1510 |
| 846 | 1582 |
| 847 | 1917 |
| 848 | 997 |

TABLE Z1-continued

| with a sequence length of 8192: | |
|---|---|
| Polarized channel sequence number | Reliability or reliability sequence number |
| 849 | 1197 |
| 850 | 1253 |
| 851 | 1528 |
| 852 | 1294 |
| 853 | 1616 |
| 854 | 1657 |
| 855 | 1984 |
| 856 | 1394 |
| 857 | 1663 |
| 858 | 1739 |
| 859 | 2064 |
| 860 | 1818 |
| 861 | 2153 |
| 862 | 2195 |
| 863 | 2640 |
| 864 | 1056 |
| 865 | 1301 |
| 866 | 1368 |
| 867 | 1620 |
| 868 | 1416 |
| 869 | 1719 |
| 870 | 1776 |
| 871 | 2094 |
| 872 | 1484 |
| 873 | 1795 |
| 874 | 1847 |
| 875 | 2187 |
| 876 | 1910 |
| 877 | 2251 |
| 878 | 2343 |
| 879 | 2760 |
| 880 | 1539 |
| 881 | 1880 |
| 882 | 1954 |
| 883 | 2306 |
| 884 | 2026 |
| 885 | 2372 |
| 886 | 2453 |
| 887 | 2866 |
| 888 | 2109 |
| 889 | 2491 |
| 890 | 2557 |
| 891 | 2952 |
| 892 | 2616 |
| 893 | 3109 |
| 894 | 3149 |
| 895 | 3832 |
| 896 | 480 |
| 897 | 808 |
| 898 | 822 |
| 899 | 1186 |
| 900 | 972 |
| 901 | 1215 |
| 902 | 1245 |
| 903 | 1568 |
| 904 | 1015 |
| 905 | 1277 |
| 906 | 1312 |
| 907 | 1630 |
| 908 | 1379 |
| 909 | 1685 |
| 910 | 1759 |
| 911 | 2087 |
| 912 | 1064 |
| 913 | 1344 |
| 914 | 1409 |
| 915 | 1699 |
| 916 | 1448 |
| 917 | 1781 |
| 918 | 1851 |
| 919 | 2177 |
| 920 | 1514 |
| 921 | 1898 |
| 922 | 1840 |
| 923 | 2227 |

TABLE Z1-continued

| with a sequence length of 8192: | |
|---|---|
| Polarized channel sequence number | Reliability or reliability sequence number |
| 924 | 1992 |
| 925 | 2332 |
| 926 | 2413 |
| 927 | 2803 |
| 928 | 1206 |
| 929 | 1430 |
| 930 | 1467 |
| 931 | 1807 |
| 932 | 1561 |
| 933 | 1862 |
| 934 | 1946 |
| 935 | 2286 |
| 936 | 1609 |
| 937 | 1958 |
| 938 | 2018 |
| 939 | 2381 |
| 940 | 2072 |
| 941 | 2433 |
| 942 | 2524 |
| 943 | 2934 |
| 944 | 1715 |
| 945 | 2045 |
| 946 | 2124 |
| 947 | 2471 |
| 948 | 2210 |
| 949 | 2580 |
| 950 | 2628 |
| 951 | 3065 |
| 952 | 2262 |
| 953 | 2704 |
| 954 | 2747 |
| 955 | 3199 |
| 956 | 2848 |
| 957 | 3272 |
| 958 | 3331 |
| 959 | 3683 |
| 960 | 1298 |
| 961 | 1481 |
| 962 | 1605 |
| 963 | 1965 |
| 964 | 1681 |
| 965 | 2011 |
| 966 | 2052 |
| 967 | 2442 |
| 968 | 1750 |
| 969 | 2138 |
| 970 | 2169 |
| 971 | 2548 |
| 972 | 2234 |
| 973 | 2592 |
| 974 | 2730 |
| 975 | 3129 |
| 976 | 1769 |
| 977 | 2219 |
| 978 | 2295 |
| 979 | 2692 |
| 980 | 2401 |
| 981 | 2774 |
| 982 | 2787 |
| 983 | 3300 |
| 984 | 2503 |
| 985 | 2883 |
| 986 | 2915 |
| 987 | 3359 |
| 988 | 3027 |
| 989 | 3524 |
| 990 | 3596 |
| 991 | 4162 |
| 992 | 1921 |
| 993 | 2364 |
| 994 | 2392 |
| 995 | 2817 |
| 996 | 2536 |
| 997 | 2897 |
| 998 | 2971 |

TABLE Z1-continued with a sequence length of 8192:

| Polarized channel sequence number | Reliability or reliability sequence number |
|---|---|
| 999 | 3420 |
| 1000 | 2604 |
| 1001 | 3047 |
| 1002 | 3085 |
| 1003 | 3560 |
| 1004 | 3225 |
| 1005 | 3639 |
| 1006 | 3888 |
| 1007 | 4347 |
| 1008 | 2666 |
| 1009 | 3174 |
| 1010 | 3247 |
| 1011 | 3730 |
| 1012 | 3387 |
| 1013 | 3776 |
| 1014 | 3946 |
| 1015 | 4458 |
| 1016 | 3454 |
| 1017 | 4014 |
| 1018 | 4085 |
| 1019 | 4599 |
| 1020 | 4244 |
| 1021 | 4770 |
| 1022 | 5021 |
| 1023 | 5420 |
| 1024 | 10 |
| 1025 | 41 |
| 1026 | 68 |
| 1027 | 149 |
| 1028 | 88 |
| 1029 | 162 |
| 1030 | 196 |
| 1031 | 310 |
| 1032 | 105 |
| 1033 | 184 |
| 1034 | 216 |
| 1035 | 340 |
| 1036 | 244 |
| 1037 | 374 |
| 1038 | 386 |
| 1039 | 609 |
| 1040 | 121 |
| 1041 | 207 |
| 1042 | 226 |
| 1043 | 366 |
| 1044 | 270 |
| 1045 | 405 |
| 1046 | 459 |
| 1047 | 628 |
| 1048 | 294 |
| 1049 | 453 |
| 1050 | 431 |
| 1051 | 660 |
| 1052 | 514 |
| 1053 | 696 |
| 1054 | 722 |
| 1055 | 961 |
| 1056 | 137 |
| 1057 | 253 |
| 1058 | 287 |
| 1059 | 418 |
| 1060 | 302 |
| 1061 | 448 |
| 1062 | 482 |
| 1063 | 669 |
| 1064 | 346 |
| 1065 | 503 |
| 1066 | 525 |
| 1067 | 700 |
| 1068 | 586 |
| 1069 | 752 |
| 1070 | 774 |
| 1071 | 1018 |
| 1072 | 379 |
| 1073 | 534 |

TABLE Z1-continued with a sequence length of 8192:

| Polarized channel sequence number | Reliability or reliability sequence number |
|---|---|
| 1074 | 600 |
| 1075 | 766 |
| 1076 | 623 |
| 1077 | 802 |
| 1078 | 840 |
| 1079 | 1057 |
| 1080 | 656 |
| 1081 | 848 |
| 1082 | 886 |
| 1083 | 1137 |
| 1084 | 906 |
| 1085 | 1173 |
| 1086 | 1236 |
| 1087 | 1567 |
| 1088 | 174 |
| 1089 | 262 |
| 1090 | 324 |
| 1091 | 497 |
| 1092 | 354 |
| 1093 | 519 |
| 1094 | 580 |
| 1095 | 732 |
| 1096 | 393 |
| 1097 | 605 |
| 1098 | 540 |
| 1099 | 779 |
| 1100 | 642 |
| 1101 | 815 |
| 1102 | 864 |
| 1103 | 1083 |
| 1104 | 441 |
| 1105 | 594 |
| 1106 | 651 |
| 1107 | 843 |
| 1108 | 678 |
| 1109 | 875 |
| 1110 | 904 |
| 1111 | 1159 |
| 1112 | 714 |
| 1113 | 915 |
| 1114 | 968 |
| 1115 | 1207 |
| 1116 | 1013 |
| 1117 | 1259 |
| 1118 | 1307 |
| 1119 | 1675 |
| 1120 | 493 |
| 1121 | 665 |
| 1122 | 706 |
| 1123 | 899 |
| 1124 | 756 |
| 1125 | 937 |
| 1126 | 994 |
| 1127 | 1247 |
| 1128 | 793 |
| 1129 | 999 |
| 1130 | 1055 |
| 1131 | 1286 |
| 1132 | 1090 |
| 1133 | 1352 |
| 1134 | 1403 |
| 1135 | 1768 |
| 1136 | 854 |
| 1137 | 1076 |
| 1138 | 1148 |
| 1139 | 1371 |
| 1140 | 1167 |
| 1141 | 1406 |
| 1142 | 1473 |
| 1143 | 1844 |
| 1144 | 1227 |
| 1145 | 1494 |
| 1146 | 1549 |
| 1147 | 1905 |
| 1148 | 1602 |

TABLE Z1-continued

| with a sequence length of 8192: | |
|---|---|
| Polarized channel sequence number | Reliability or reliability sequence number |
| 1149 | 1961 |
| 1150 | 2057 |
| 1151 | 2542 |
| 1152 | 235 |
| 1153 | 318 |
| 1154 | 360 |
| 1155 | 591 |
| 1156 | 411 |
| 1157 | 620 |
| 1158 | 632 |
| 1159 | 859 |
| 1160 | 465 |
| 1161 | 647 |
| 1162 | 683 |
| 1163 | 894 |
| 1164 | 718 |
| 1165 | 934 |
| 1166 | 949 |
| 1167 | 1243 |
| 1168 | 509 |
| 1169 | 688 |
| 1170 | 727 |
| 1171 | 941 |
| 1172 | 770 |
| 1173 | 991 |
| 1174 | 1043 |
| 1175 | 1293 |
| 1176 | 810 |
| 1177 | 1047 |
| 1178 | 1080 |
| 1179 | 1335 |
| 1180 | 1155 |
| 1181 | 1392 |
| 1182 | 1458 |
| 1183 | 1815 |
| 1184 | 550 |
| 1185 | 744 |
| 1186 | 798 |
| 1187 | 1010 |
| 1188 | 819 |
| 1189 | 1050 |
| 1190 | 1102 |
| 1191 | 1374 |
| 1192 | 891 |
| 1193 | 1141 |
| 1194 | 1169 |
| 1195 | 1414 |
| 1196 | 1223 |
| 1197 | 1490 |
| 1198 | 1530 |
| 1199 | 1901 |
| 1200 | 946 |
| 1201 | 1198 |
| 1202 | 1252 |
| 1203 | 1509 |
| 1204 | 1289 |
| 1205 | 1588 |
| 1206 | 1610 |
| 1207 | 1952 |
| 1208 | 1356 |
| 1209 | 1643 |
| 1210 | 1723 |
| 1211 | 2033 |
| 1212 | 1782 |
| 1213 | 2105 |
| 1214 | 2257 |
| 1215 | 2545 |
| 1216 | 570 |
| 1217 | 807 |
| 1218 | 870 |
| 1219 | 1111 |
| 1220 | 930 |
| 1221 | 1161 |
| 1222 | 1219 |
| 1223 | 1502 |

TABLE Z1-continued

| with a sequence length of 8192: | |
|---|---|
| Polarized channel sequence number | Reliability or reliability sequence number |
| 1224 | 964 |
| 1225 | 1230 |
| 1226 | 1265 |
| 1227 | 1563 |
| 1228 | 1310 |
| 1229 | 1606 |
| 1230 | 1674 |
| 1231 | 2008 |
| 1232 | 1036 |
| 1233 | 1296 |
| 1234 | 1339 |
| 1235 | 1637 |
| 1236 | 1410 |
| 1237 | 1708 |
| 1238 | 1775 |
| 1239 | 2127 |
| 1240 | 1443 |
| 1241 | 1789 |
| 1242 | 1856 |
| 1243 | 2189 |
| 1244 | 1924 |
| 1245 | 2284 |
| 1246 | 2341 |
| 1247 | 2791 |
| 1248 | 1097 |
| 1249 | 1378 |
| 1250 | 1425 |
| 1251 | 1733 |
| 1252 | 1513 |
| 1253 | 1811 |
| 1254 | 1866 |
| 1255 | 2237 |
| 1256 | 1600 |
| 1257 | 1889 |
| 1258 | 1956 |
| 1259 | 2318 |
| 1260 | 2035 |
| 1261 | 2355 |
| 1262 | 2483 |
| 1263 | 2923 |
| 1264 | 1669 |
| 1265 | 1982 |
| 1266 | 2062 |
| 1267 | 2424 |
| 1268 | 2097 |
| 1269 | 2521 |
| 1270 | 2577 |
| 1271 | 3034 |
| 1272 | 2248 |
| 1273 | 2607 |
| 1274 | 2669 |
| 1275 | 3011 |
| 1276 | 2736 |
| 1277 | 3126 |
| 1278 | 3278 |
| 1279 | 3795 |
| 1280 | 280 |
| 1281 | 398 |
| 1282 | 424 |
| 1283 | 675 |
| 1284 | 470 |
| 1285 | 693 |
| 1286 | 736 |
| 1287 | 986 |
| 1288 | 476 |
| 1289 | 739 |
| 1290 | 783 |
| 1291 | 1020 |
| 1292 | 828 |
| 1293 | 1085 |
| 1294 | 1116 |
| 1295 | 1451 |
| 1296 | 544 |
| 1297 | 787 |
| 1298 | 831 |

TABLE Z1-continued with a sequence length of 8192:

| Polarized channel sequence number | Reliability or reliability sequence number |
|---|---|
| 1299 | 1125 |
| 1300 | 880 |
| 1301 | 1151 |
| 1302 | 1191 |
| 1303 | 1454 |
| 1304 | 910 |
| 1305 | 1188 |
| 1306 | 1240 |
| 1307 | 1546 |
| 1308 | 1300 |
| 1309 | 1596 |
| 1310 | 1623 |
| 1311 | 1949 |
| 1312 | 559 |
| 1313 | 868 |
| 1314 | 917 |
| 1315 | 1134 |
| 1316 | 976 |
| 1317 | 1201 |
| 1318 | 1255 |
| 1319 | 1592 |
| 1320 | 1005 |
| 1321 | 1279 |
| 1322 | 1313 |
| 1323 | 1628 |
| 1324 | 1349 |
| 1325 | 1702 |
| 1326 | 1749 |
| 1327 | 2090 |
| 1328 | 1001 |
| 1329 | 1341 |
| 1330 | 1384 |
| 1331 | 1698 |
| 1332 | 1440 |
| 1333 | 1778 |
| 1334 | 1822 |
| 1335 | 2192 |
| 1336 | 1520 |
| 1337 | 1873 |
| 1338 | 1926 |
| 1339 | 2281 |
| 1340 | 1980 |
| 1341 | 2338 |
| 1342 | 2436 |
| 1343 | 2886 |
| 1344 | 614 |
| 1345 | 956 |
| 1346 | 979 |
| 1347 | 1272 |
| 1348 | 1032 |
| 1349 | 1328 |
| 1350 | 1382 |
| 1351 | 1679 |
| 1352 | 1061 |
| 1353 | 1399 |
| 1354 | 1421 |
| 1355 | 1772 |
| 1356 | 1477 |
| 1357 | 1841 |
| 1358 | 1885 |
| 1359 | 2272 |
| 1360 | 1233 |
| 1361 | 1462 |
| 1362 | 1517 |
| 1363 | 1853 |
| 1364 | 1571 |
| 1365 | 1914 |
| 1366 | 1974 |
| 1367 | 2326 |
| 1368 | 1651 |
| 1369 | 1995 |
| 1370 | 2075 |
| 1371 | 2416 |
| 1372 | 2141 |
| 1373 | 2518 |

TABLE Z1-continued with a sequence length of 8192:

| Polarized channel sequence number | Reliability or reliability sequence number |
|---|---|
| 1374 | 2586 |
| 1375 | 2993 |
| 1376 | 1324 |
| 1377 | 1556 |
| 1378 | 1633 |
| 1379 | 1945 |
| 1380 | 1694 |
| 1381 | 2027 |
| 1382 | 2082 |
| 1383 | 2486 |
| 1384 | 1762 |
| 1385 | 2115 |
| 1386 | 2163 |
| 1387 | 2539 |
| 1388 | 2260 |
| 1389 | 2634 |
| 1390 | 2695 |
| 1391 | 3093 |
| 1392 | 1860 |
| 1393 | 2254 |
| 1394 | 2289 |
| 1395 | 2672 |
| 1396 | 2329 |
| 1397 | 2740 |
| 1398 | 2651 |
| 1399 | 3163 |
| 1400 | 2455 |
| 1401 | 2872 |
| 1402 | 2926 |
| 1403 | 3309 |
| 1404 | 2948 |
| 1405 | 3473 |
| 1406 | 3565 |
| 1407 | 3908 |
| 1408 | 637 |
| 1409 | 1025 |
| 1410 | 1039 |
| 1411 | 1436 |
| 1412 | 1205 |
| 1413 | 1487 |
| 1414 | 1527 |
| 1415 | 1870 |
| 1416 | 1276 |
| 1417 | 1542 |
| 1418 | 1575 |
| 1419 | 1933 |
| 1420 | 1647 |
| 1421 | 2001 |
| 1422 | 2069 |
| 1423 | 2494 |
| 1424 | 1317 |
| 1425 | 1641 |
| 1426 | 1692 |
| 1427 | 2005 |
| 1428 | 1732 |
| 1429 | 2084 |
| 1430 | 2148 |
| 1431 | 2554 |
| 1432 | 1794 |
| 1433 | 2171 |
| 1434 | 2233 |
| 1435 | 2619 |
| 1436 | 2321 |
| 1437 | 2686 |
| 1438 | 2783 |
| 1439 | 3183 |
| 1440 | 1447 |
| 1441 | 1706 |
| 1442 | 1746 |
| 1443 | 2142 |
| 1444 | 1820 |
| 1445 | 2213 |
| 1446 | 2298 |
| 1447 | 2657 |
| 1448 | 1930 |

TABLE Z1-continued

| with a sequence length of 8192: | |
|---|---|
| Polarized channel sequence number | Reliability or reliability sequence number |
| 1449 | 2301 |
| 1450 | 2346 |
| 1451 | 2777 |
| 1452 | 2456 |
| 1453 | 2727 |
| 1454 | 2905 |
| 1455 | 3317 |
| 1456 | 2023 |
| 1457 | 2398 |
| 1458 | 2509 |
| 1459 | 2877 |
| 1460 | 2559 |
| 1461 | 2945 |
| 1462 | 3000 |
| 1463 | 3424 |
| 1464 | 2637 |
| 1465 | 3023 |
| 1466 | 3019 |
| 1467 | 3538 |
| 1468 | 3166 |
| 1469 | 3607 |
| 1470 | 3678 |
| 1471 | 4140 |
| 1472 | 1553 |
| 1473 | 1785 |
| 1474 | 1878 |
| 1475 | 2303 |
| 1476 | 1999 |
| 1477 | 2349 |
| 1478 | 2430 |
| 1479 | 2814 |
| 1480 | 2078 |
| 1481 | 2489 |
| 1482 | 2527 |
| 1483 | 2931 |
| 1484 | 2601 |
| 1485 | 2960 |
| 1486 | 3016 |
| 1487 | 3463 |
| 1488 | 2151 |
| 1489 | 2571 |
| 1490 | 2660 |
| 1491 | 2997 |
| 1492 | 2698 |
| 1493 | 3031 |
| 1494 | 3171 |
| 1495 | 3613 |
| 1496 | 2811 |
| 1497 | 3205 |
| 1498 | 3261 |
| 1499 | 3700 |
| 1500 | 3367 |
| 1501 | 3818 |
| 1502 | 3894 |
| 1503 | 4381 |
| 1504 | 2275 |
| 1505 | 2675 |
| 1506 | 2767 |
| 1507 | 3179 |
| 1508 | 2900 |
| 1509 | 3188 |
| 1510 | 3345 |
| 1511 | 3736 |
| 1512 | 2920 |
| 1513 | 3326 |
| 1514 | 3434 |
| 1515 | 3863 |
| 1516 | 3513 |
| 1517 | 3960 |
| 1518 | 4093 |
| 1519 | 4559 |
| 1520 | 2963 |
| 1521 | 3479 |
| 1522 | 3585 |
| 1523 | 4000 |

TABLE Z1-continued

| with a sequence length of 8192: | |
|---|---|
| Polarized channel sequence number | Reliability or reliability sequence number |
| 1524 | 3650 |
| 1525 | 4111 |
| 1526 | 4050 |
| 1527 | 4630 |
| 1528 | 3782 |
| 1529 | 4206 |
| 1530 | 4274 |
| 1531 | 4814 |
| 1532 | 4414 |
| 1533 | 4914 |
| 1534 | 5049 |
| 1535 | 5398 |
| 1536 | 332 |
| 1537 | 435 |
| 1538 | 487 |
| 1539 | 709 |
| 1540 | 529 |
| 1541 | 791 |
| 1542 | 835 |
| 1543 | 1105 |
| 1544 | 555 |
| 1545 | 852 |
| 1546 | 883 |
| 1547 | 1123 |
| 1548 | 926 |
| 1549 | 1180 |
| 1550 | 1194 |
| 1551 | 1578 |
| 1552 | 565 |
| 1553 | 922 |
| 1554 | 953 |
| 1555 | 1176 |
| 1556 | 984 |
| 1557 | 1332 |
| 1558 | 1360 |
| 1559 | 1665 |
| 1560 | 1066 |
| 1561 | 1367 |
| 1562 | 1432 |
| 1563 | 1763 |
| 1564 | 1483 |
| 1565 | 1827 |
| 1566 | 1882 |
| 1567 | 2312 |
| 1568 | 575 |
| 1569 | 971 |
| 1570 | 1028 |
| 1571 | 1345 |
| 1572 | 1071 |
| 1573 | 1428 |
| 1574 | 1466 |
| 1575 | 1805 |
| 1576 | 1108 |
| 1577 | 1498 |
| 1578 | 1534 |
| 1579 | 1894 |
| 1580 | 1585 |
| 1581 | 1964 |
| 1582 | 2016 |
| 1583 | 2358 |
| 1584 | 1146 |
| 1585 | 1559 |
| 1586 | 1619 |
| 1587 | 1989 |
| 1588 | 1684 |
| 1589 | 2067 |
| 1590 | 2106 |
| 1591 | 2468 |
| 1592 | 1712 |
| 1593 | 2091 |
| 1594 | 2174 |
| 1595 | 2565 |
| 1596 | 2184 |
| 1597 | 2613 |
| 1598 | 2681 |

TABLE Z1-continued

| with a sequence length of 8192: | |
|---|---|
| Polarized channel sequence number | Reliability or reliability sequence number |
| 1599 | 3286 |
| 1600 | 748 |
| 1601 | 1069 |
| 1602 | 1094 |
| 1603 | 1478 |
| 1604 | 1130 |
| 1605 | 1538 |
| 1606 | 1581 |
| 1607 | 1942 |
| 1608 | 1213 |
| 1609 | 1624 |
| 1610 | 1655 |
| 1611 | 2047 |
| 1612 | 1721 |
| 1613 | 2123 |
| 1614 | 2166 |
| 1615 | 2500 |
| 1616 | 1269 |
| 1617 | 1661 |
| 1618 | 1742 |
| 1619 | 2099 |
| 1620 | 1801 |
| 1621 | 2181 |
| 1622 | 2201 |
| 1623 | 2589 |
| 1624 | 1848 |
| 1625 | 2205 |
| 1626 | 2230 |
| 1627 | 2689 |
| 1628 | 2395 |
| 1629 | 2744 |
| 1630 | 2855 |
| 1631 | 3322 |
| 1632 | 1321 |
| 1633 | 1798 |
| 1634 | 1833 |
| 1635 | 2224 |
| 1636 | 1912 |
| 1637 | 2292 |
| 1638 | 2309 |
| 1639 | 2713 |
| 1640 | 1970 |
| 1641 | 2389 |
| 1642 | 2445 |
| 1643 | 2808 |
| 1644 | 2533 |
| 1645 | 2891 |
| 1646 | 2937 |
| 1647 | 3440 |
| 1648 | 2042 |
| 1649 | 2477 |
| 1650 | 2562 |
| 1651 | 2940 |
| 1652 | 2645 |
| 1653 | 2988 |
| 1654 | 3101 |
| 1655 | 3518 |
| 1656 | 2763 |
| 1657 | 3118 |
| 1658 | 3208 |
| 1659 | 3618 |
| 1660 | 3264 |
| 1661 | 3719 |
| 1662 | 3838 |
| 1663 | 4364 |
| 1664 | 762 |
| 1665 | 1120 |
| 1666 | 1182 |
| 1667 | 1614 |
| 1668 | 1261 |
| 1669 | 1658 |
| 1670 | 1728 |
| 1671 | 2135 |
| 1672 | 1304 |
| 1673 | 1752 |

TABLE Z1-continued

| with a sequence length of 8192: | |
|---|---|
| Polarized channel sequence number | Reliability or reliability sequence number |
| 1674 | 1809 |
| 1675 | 2208 |
| 1676 | 1864 |
| 1677 | 2245 |
| 1678 | 2265 |
| 1679 | 2701 |
| 1680 | 1395 |
| 1681 | 1837 |
| 1682 | 1908 |
| 1683 | 2268 |
| 1684 | 1968 |
| 1685 | 2378 |
| 1686 | 2427 |
| 1687 | 2794 |
| 1688 | 2039 |
| 1689 | 2462 |
| 1690 | 2530 |
| 1691 | 2912 |
| 1692 | 2595 |
| 1693 | 2966 |
| 1694 | 3058 |
| 1695 | 3443 |
| 1696 | 1469 |
| 1697 | 1937 |
| 1698 | 2014 |
| 1699 | 2439 |
| 1700 | 2112 |
| 1701 | 2515 |
| 1702 | 2506 |
| 1703 | 2974 |
| 1704 | 2156 |
| 1705 | 2574 |
| 1706 | 2610 |
| 1707 | 3039 |
| 1708 | 2721 |
| 1709 | 3104 |
| 1710 | 3146 |
| 1711 | 3629 |
| 1712 | 2240 |
| 1713 | 2648 |
| 1714 | 2753 |
| 1715 | 3133 |
| 1716 | 2797 |
| 1717 | 3233 |
| 1718 | 3269 |
| 1719 | 3742 |
| 1720 | 2869 |
| 1721 | 3314 |
| 1722 | 3392 |
| 1723 | 3869 |
| 1724 | 3534 |
| 1725 | 3974 |
| 1726 | 4097 |
| 1727 | 4570 |
| 1728 | 1524 |
| 1729 | 2054 |
| 1730 | 2120 |
| 1731 | 2583 |
| 1732 | 2198 |
| 1733 | 2631 |
| 1734 | 2724 |
| 1735 | 3121 |
| 1736 | 2369 |
| 1737 | 2757 |
| 1738 | 2828 |
| 1739 | 3250 |
| 1740 | 2842 |
| 1741 | 3281 |
| 1742 | 3354 |
| 1743 | 3812 |
| 1744 | 2404 |
| 1745 | 2831 |
| 1746 | 2863 |
| 1747 | 3340 |
| 1748 | 2977 |

TABLE Z1-continued

| with a sequence length of 8192: | |
|---|---|
| Polarized channel sequence number | Reliability or reliability sequence number |
| 1749 | 3381 |
| 1750 | 3498 |
| 1751 | 3954 |
| 1752 | 3078 |
| 1753 | 3529 |
| 1754 | 3580 |
| 1755 | 4008 |
| 1756 | 3672 |
| 1757 | 4146 |
| 1758 | 4228 |
| 1759 | 4661 |
| 1760 | 2465 |
| 1761 | 3008 |
| 1762 | 3050 |
| 1763 | 3448 |
| 1764 | 3154 |
| 1765 | 3543 |
| 1766 | 3602 |
| 1767 | 4065 |
| 1768 | 3213 |
| 1769 | 3661 |
| 1770 | 3747 |
| 1771 | 4198 |
| 1772 | 3843 |
| 1773 | 4282 |
| 1774 | 4397 |
| 1775 | 4852 |
| 1776 | 3401 |
| 1777 | 3759 |
| 1778 | 3875 |
| 1779 | 4306 |
| 1780 | 3988 |
| 1781 | 4431 |
| 1782 | 4486 |
| 1783 | 5006 |
| 1784 | 4071 |
| 1785 | 4531 |
| 1786 | 4619 |
| 1787 | 5091 |
| 1788 | 4736 |
| 1789 | 5218 |
| 1790 | 5378 |
| 1791 | 5901 |
| 1792 | 824 |
| 1793 | 1216 |
| 1794 | 1282 |
| 1795 | 1756 |
| 1796 | 1388 |
| 1797 | 1831 |
| 1798 | 1896 |
| 1799 | 2335 |
| 1800 | 1417 |
| 1801 | 1918 |
| 1802 | 1987 |
| 1803 | 2387 |
| 1804 | 2050 |
| 1805 | 2450 |
| 1806 | 2551 |
| 1807 | 3062 |
| 1808 | 1505 |
| 1809 | 2020 |
| 1810 | 2133 |
| 1811 | 2497 |
| 1812 | 2180 |
| 1813 | 2625 |
| 1814 | 2598 |
| 1815 | 3090 |
| 1816 | 2216 |
| 1817 | 2663 |
| 1818 | 2733 |
| 1819 | 3196 |
| 1820 | 2820 |
| 1821 | 3238 |
| 1822 | 3295 |
| 1823 | 3789 |

TABLE Z1-continued

| with a sequence length of 8192: | |
|---|---|
| Polarized channel sequence number | Reliability or reliability sequence number |
| 1824 | 1688 |
| 1825 | 2159 |
| 1826 | 2222 |
| 1827 | 2622 |
| 1828 | 2366 |
| 1829 | 2710 |
| 1830 | 2770 |
| 1831 | 3255 |
| 1832 | 2384 |
| 1833 | 2823 |
| 1834 | 2852 |
| 1835 | 3303 |
| 1836 | 2894 |
| 1837 | 3364 |
| 1838 | 3415 |
| 1839 | 3920 |
| 1840 | 2407 |
| 1841 | 2880 |
| 1842 | 2956 |
| 1843 | 3410 |
| 1844 | 3073 |
| 1845 | 3493 |
| 1846 | 3571 |
| 1847 | 4022 |
| 1848 | 3138 |
| 1849 | 3644 |
| 1850 | 3667 |
| 1851 | 4154 |
| 1852 | 3753 |
| 1853 | 4236 |
| 1854 | 4331 |
| 1855 | 4791 |
| 1856 | 1716 |
| 1857 | 2361 |
| 1858 | 2375 |
| 1859 | 2800 |
| 1860 | 2410 |
| 1861 | 2837 |
| 1862 | 2908 |
| 1863 | 3378 |
| 1864 | 2474 |
| 1865 | 2982 |
| 1866 | 3042 |
| 1867 | 3468 |
| 1868 | 3113 |
| 1869 | 3549 |
| 1870 | 3655 |
| 1871 | 4127 |
| 1872 | 2750 |
| 1873 | 3070 |
| 1874 | 3158 |
| 1875 | 3574 |
| 1876 | 3216 |
| 1877 | 3706 |
| 1878 | 3765 |
| 1879 | 4214 |
| 1880 | 3373 |
| 1881 | 3770 |
| 1882 | 3880 |
| 1883 | 4315 |
| 1884 | 3994 |
| 1885 | 4422 |
| 1886 | 4475 |
| 1887 | 4992 |
| 1888 | 2845 |
| 1889 | 3230 |
| 1890 | 3336 |
| 1891 | 3711 |
| 1892 | 3406 |
| 1893 | 3857 |
| 1894 | 3934 |
| 1895 | 4356 |
| 1896 | 3507 |
| 1897 | 3967 |
| 1898 | 4036 |

TABLE Z1-continued

| with a sequence length of 8192: | |
|---|---|
| Polarized channel sequence number | Reliability or reliability sequence number |
| 1899 | 4467 |
| 1900 | 4119 |
| 1901 | 4540 |
| 1902 | 4650 |
| 1903 | 5137 |
| 1904 | 3591 |
| 1905 | 4079 |
| 1906 | 4176 |
| 1907 | 4610 |
| 1908 | 4266 |
| 1909 | 4681 |
| 1910 | 4779 |
| 1911 | 5253 |
| 1912 | 4372 |
| 1913 | 4826 |
| 1914 | 4902 |
| 1915 | 5342 |
| 1916 | 4965 |
| 1917 | 5524 |
| 1918 | 5571 |
| 1919 | 6216 |
| 1920 | 1738 |
| 1921 | 2418 |
| 1922 | 2448 |
| 1923 | 3053 |
| 1924 | 2707 |
| 1925 | 3098 |
| 1926 | 3141 |
| 1927 | 3635 |
| 1928 | 2780 |
| 1929 | 3191 |
| 1930 | 3242 |
| 1931 | 3725 |
| 1932 | 3350 |
| 1933 | 3807 |
| 1934 | 3914 |
| 1935 | 4339 |
| 1936 | 2859 |
| 1937 | 3291 |
| 1938 | 3395 |
| 1939 | 3826 |
| 1940 | 3459 |
| 1941 | 3940 |
| 1942 | 4042 |
| 1943 | 4450 |
| 1944 | 3554 |
| 1945 | 4105 |
| 1946 | 4028 |
| 1947 | 4512 |
| 1948 | 4222 |
| 1949 | 4639 |
| 1950 | 4724 |
| 1951 | 5184 |
| 1952 | 3081 |
| 1953 | 3429 |
| 1954 | 3488 |
| 1955 | 3980 |
| 1956 | 3624 |
| 1957 | 4056 |
| 1958 | 4168 |
| 1959 | 4579 |
| 1960 | 3695 |
| 1961 | 4184 |
| 1962 | 4258 |
| 1963 | 4692 |
| 1964 | 4323 |
| 1965 | 4747 |
| 1966 | 4864 |
| 1967 | 5323 |
| 1968 | 3849 |
| 1969 | 4290 |
| 1970 | 4389 |
| 1971 | 4802 |
| 1972 | 4494 |
| 1973 | 4926 |

TABLE Z1-continued

| with a sequence length of 8192: | |
|---|---|
| Polarized channel sequence number | Reliability or reliability sequence number |
| 1974 | 4979 |
| 1975 | 5480 |
| 1976 | 4551 |
| 1977 | 5079 |
| 1978 | 5122 |
| 1979 | 5619 |
| 1980 | 5234 |
| 1981 | 5693 |
| 1982 | 5750 |
| 1983 | 6084 |
| 1984 | 3221 |
| 1985 | 3504 |
| 1986 | 3689 |
| 1987 | 4192 |
| 1988 | 3801 |
| 1989 | 4252 |
| 1990 | 4298 |
| 1991 | 4758 |
| 1992 | 3900 |
| 1993 | 4406 |
| 1994 | 4439 |
| 1995 | 4887 |
| 1996 | 4522 |
| 1997 | 4940 |
| 1998 | 5107 |
| 1999 | 5547 |
| 2000 | 3926 |
| 2001 | 4503 |
| 2002 | 4590 |
| 2003 | 5064 |
| 2004 | 4713 |
| 2005 | 5153 |
| 2006 | 5169 |
| 2007 | 5721 |
| 2008 | 4840 |
| 2009 | 5269 |
| 2010 | 5304 |
| 2011 | 5776 |
| 2012 | 5440 |
| 2013 | 5935 |
| 2014 | 6005 |
| 2015 | 6505 |
| 2016 | 4133 |
| 2017 | 4670 |
| 2018 | 4701 |
| 2019 | 5202 |
| 2020 | 4875 |
| 2021 | 5288 |
| 2022 | 5362 |
| 2023 | 5837 |
| 2024 | 4952 |
| 2025 | 5460 |
| 2026 | 5504 |
| 2027 | 5970 |
| 2028 | 5644 |
| 2029 | 6044 |
| 2030 | 6268 |
| 2031 | 6660 |
| 2032 | 5034 |
| 2033 | 5595 |
| 2034 | 5668 |
| 2035 | 6125 |
| 2036 | 5808 |
| 2037 | 6170 |
| 2038 | 6320 |
| 2039 | 6752 |
| 2040 | 5867 |
| 2041 | 6374 |
| 2042 | 6438 |
| 2043 | 6866 |
| 2044 | 6579 |
| 2045 | 6995 |
| 2046 | 7168 |
| 2047 | 7433 |
| 2048 | 11 |

TABLE Z1-continued with a sequence length of 8192:

| Polarized channel sequence number | Reliability or reliability sequence number |
|---|---|
| 2049 | 47 |
| 2050 | 81 |
| 2051 | 189 |
| 2052 | 108 |
| 2053 | 205 |
| 2054 | 265 |
| 2055 | 410 |
| 2056 | 132 |
| 2057 | 250 |
| 2058 | 290 |
| 2059 | 447 |
| 2060 | 326 |
| 2061 | 490 |
| 2062 | 506 |
| 2063 | 794 |
| 2064 | 152 |
| 2065 | 278 |
| 2066 | 303 |
| 2067 | 481 |
| 2068 | 359 |
| 2069 | 539 |
| 2070 | 604 |
| 2071 | 823 |
| 2072 | 390 |
| 2073 | 598 |
| 2074 | 568 |
| 2075 | 860 |
| 2076 | 673 |
| 2077 | 908 |
| 2078 | 939 |
| 2079 | 1229 |
| 2080 | 171 |
| 2081 | 338 |
| 2082 | 380 |
| 2083 | 554 |
| 2084 | 401 |
| 2085 | 590 |
| 2086 | 633 |
| 2087 | 872 |
| 2088 | 455 |
| 2089 | 659 |
| 2090 | 685 |
| 2091 | 913 |
| 2092 | 765 |
| 2093 | 974 |
| 2094 | 1003 |
| 2095 | 1299 |
| 2096 | 498 |
| 2097 | 698 |
| 2098 | 782 |
| 2099 | 993 |
| 2100 | 811 |
| 2101 | 1035 |
| 2102 | 1082 |
| 2103 | 1346 |
| 2104 | 856 |
| 2105 | 1091 |
| 2106 | 1140 |
| 2107 | 1442 |
| 2108 | 1166 |
| 2109 | 1485 |
| 2110 | 1562 |
| 2111 | 1925 |
| 2112 | 221 |
| 2113 | 348 |
| 2114 | 428 |
| 2115 | 653 |
| 2116 | 464 |
| 2117 | 679 |
| 2118 | 759 |
| 2119 | 948 |
| 2120 | 515 |
| 2121 | 788 |
| 2122 | 710 |
| 2123 | 1007 |

TABLE Z1-continued with a sequence length of 8192:

| Polarized channel sequence number | Reliability or reliability sequence number |
|---|---|
| 2124 | 839 |
| 2125 | 1054 |
| 2126 | 1114 |
| 2127 | 1377 |
| 2128 | 583 |
| 2129 | 776 |
| 2130 | 850 |
| 2131 | 1087 |
| 2132 | 882 |
| 2133 | 1127 |
| 2134 | 1162 |
| 2135 | 1468 |
| 2136 | 929 |
| 2137 | 1174 |
| 2138 | 1242 |
| 2139 | 1525 |
| 2140 | 1295 |
| 2141 | 1587 |
| 2142 | 1642 |
| 2143 | 2043 |
| 2144 | 646 |
| 2145 | 866 |
| 2146 | 918 |
| 2147 | 1157 |
| 2148 | 983 |
| 2149 | 1204 |
| 2150 | 1271 |
| 2151 | 1572 |
| 2152 | 1026 |
| 2153 | 1275 |
| 2154 | 1343 |
| 2155 | 1618 |
| 2156 | 1389 |
| 2157 | 1697 |
| 2158 | 1747 |
| 2159 | 2139 |
| 2160 | 1104 |
| 2161 | 1369 |
| 2162 | 1457 |
| 2163 | 1710 |
| 2164 | 1479 |
| 2165 | 1751 |
| 2166 | 1823 |
| 2167 | 2220 |
| 2168 | 1548 |
| 2169 | 1845 |
| 2170 | 1906 |
| 2171 | 2285 |
| 2172 | 1962 |
| 2173 | 2342 |
| 2174 | 2443 |
| 2175 | 2972 |
| 2176 | 314 |
| 2177 | 419 |
| 2178 | 473 |
| 2179 | 771 |
| 2180 | 546 |
| 2181 | 806 |
| 2182 | 827 |
| 2183 | 1109 |
| 2184 | 612 |
| 2185 | 844 |
| 2186 | 888 |
| 2187 | 1153 |
| 2188 | 933 |
| 2189 | 1200 |
| 2190 | 1217 |
| 2191 | 1569 |
| 2192 | 666 |
| 2193 | 892 |
| 2194 | 944 |
| 2195 | 1209 |
| 2196 | 998 |
| 2197 | 1266 |
| 2198 | 1330 |

TABLE Z1-continued with a sequence length of 8192:

| Polarized channel sequence number | Reliability or reliability sequence number |
|---|---|
| 2199 | 1625 |
| 2200 | 1049 |
| 2201 | 1334 |
| 2202 | 1373 |
| 2203 | 1676 |
| 2204 | 1464 |
| 2205 | 1734 |
| 2206 | 1806 |
| 2207 | 2191 |
| 2208 | 723 |
| 2209 | 963 |
| 2210 | 1030 |
| 2211 | 1290 |
| 2212 | 1058 |
| 2213 | 1338 |
| 2214 | 1400 |
| 2215 | 1714 |
| 2216 | 1144 |
| 2217 | 1449 |
| 2218 | 1482 |
| 2219 | 1760 |
| 2220 | 1544 |
| 2221 | 1843 |
| 2222 | 1888 |
| 2223 | 2279 |
| 2224 | 1212 |
| 2225 | 1515 |
| 2226 | 1576 |
| 2227 | 1861 |
| 2228 | 1621 |
| 2229 | 1948 |
| 2230 | 1972 |
| 2231 | 2333 |
| 2232 | 1701 |
| 2233 | 2007 |
| 2234 | 2093 |
| 2235 | 2417 |
| 2236 | 2155 |
| 2237 | 2496 |
| 2238 | 2662 |
| 2239 | 2976 |
| 2240 | 747 |
| 2241 | 1040 |
| 2242 | 1122 |
| 2243 | 1411 |
| 2244 | 1192 |
| 2245 | 1472 |
| 2246 | 1541 |
| 2247 | 1855 |
| 2248 | 1234 |
| 2249 | 1551 |
| 2250 | 1593 |
| 2251 | 1922 |
| 2252 | 1646 |
| 2253 | 1969 |
| 2254 | 2037 |
| 2255 | 2391 |
| 2256 | 1323 |
| 2257 | 1632 |
| 2258 | 1680 |
| 2259 | 2000 |
| 2260 | 1754 |
| 2261 | 2076 |
| 2262 | 2146 |
| 2263 | 2522 |
| 2264 | 1790 |
| 2265 | 2164 |
| 2266 | 2231 |
| 2267 | 2588 |
| 2268 | 2302 |
| 2269 | 2691 |
| 2270 | 2752 |
| 2271 | 3245 |
| 2272 | 1396 |
| 2273 | 1720 |
| 2274 | 1771 |
| 2275 | 2104 |
| 2276 | 1868 |
| 2277 | 2185 |
| 2278 | 2244 |
| 2279 | 2642 |
| 2280 | 1960 |
| 2281 | 2267 |
| 2282 | 2336 |
| 2283 | 2726 |
| 2284 | 2420 |
| 2285 | 2764 |
| 2286 | 2904 |
| 2287 | 3390 |
| 2288 | 2034 |
| 2289 | 2365 |
| 2290 | 2449 |
| 2291 | 2839 |
| 2292 | 2487 |
| 2293 | 2950 |
| 2294 | 3013 |
| 2295 | 3515 |
| 2296 | 2653 |
| 2297 | 3044 |
| 2298 | 3114 |
| 2299 | 3489 |
| 2300 | 3186 |
| 2301 | 3615 |
| 2302 | 3774 |
| 2303 | 4278 |
| 2304 | 370 |
| 2305 | 522 |
| 2306 | 560 |
| 2307 | 876 |
| 2308 | 619 |
| 2309 | 898 |
| 2310 | 954 |
| 2311 | 1263 |
| 2312 | 625 |
| 2313 | 959 |
| 2314 | 1012 |
| 2315 | 1302 |
| 2316 | 1068 |
| 2317 | 1380 |
| 2318 | 1419 |
| 2319 | 1799 |
| 2320 | 717 |
| 2321 | 1017 |
| 2322 | 1073 |
| 2323 | 1431 |
| 2324 | 1131 |
| 2325 | 1461 |
| 2326 | 1508 |
| 2327 | 1803 |
| 2328 | 1170 |
| 2329 | 1500 |
| 2330 | 1566 |
| 2331 | 1904 |
| 2332 | 1635 |
| 2333 | 1957 |
| 2334 | 1985 |
| 2335 | 2331 |
| 2336 | 735 |
| 2337 | 1118 |
| 2338 | 1179 |
| 2339 | 1438 |
| 2340 | 1251 |
| 2341 | 1519 |
| 2342 | 1580 |
| 2343 | 1953 |
| 2344 | 1287 |
| 2345 | 1611 |
| 2346 | 1649 |
| 2347 | 1991 |
| 2348 | 1690 |

TABLE Z1-continued

| with a sequence length of 8192: | |
|---|---|
| Polarized channel sequence number | Reliability or reliability sequence number |
| 2349 | 2071 |
| 2350 | 2119 |
| 2351 | 2481 |
| 2352 | 1283 |
| 2353 | 1683 |
| 2354 | 1727 |
| 2355 | 2065 |
| 2356 | 1786 |
| 2357 | 2152 |
| 2358 | 2196 |
| 2359 | 2594 |
| 2360 | 1874 |
| 2361 | 2253 |
| 2362 | 2308 |
| 2363 | 2687 |
| 2364 | 2359 |
| 2365 | 2746 |
| 2366 | 2853 |
| 2367 | 3352 |
| 2368 | 800 |
| 2369 | 1225 |
| 2370 | 1254 |
| 2371 | 1601 |
| 2372 | 1315 |
| 2373 | 1666 |
| 2374 | 1724 |
| 2375 | 2046 |
| 2376 | 1354 |
| 2377 | 1743 |
| 2378 | 1767 |
| 2379 | 2144 |
| 2380 | 1826 |
| 2381 | 2217 |
| 2382 | 2264 |
| 2383 | 2680 |
| 2384 | 1554 |
| 2385 | 1810 |
| 2386 | 1872 |
| 2387 | 2229 |
| 2388 | 1929 |
| 2389 | 2296 |
| 2390 | 2356 |
| 2391 | 2735 |
| 2392 | 2015 |
| 2393 | 2376 |
| 2394 | 2464 |
| 2395 | 2830 |
| 2396 | 2534 |
| 2397 | 2943 |
| 2398 | 3021 |
| 2399 | 3466 |
| 2400 | 1662 |
| 2401 | 1913 |
| 2402 | 1997 |
| 2403 | 2325 |
| 2404 | 2061 |
| 2405 | 2411 |
| 2406 | 2472 |
| 2407 | 2910 |
| 2408 | 2131 |
| 2409 | 2508 |
| 2410 | 2558 |
| 2411 | 2968 |
| 2412 | 2665 |
| 2413 | 3076 |
| 2414 | 3143 |
| 2415 | 3576 |
| 2416 | 2238 |
| 2417 | 2659 |
| 2418 | 2697 |
| 2419 | 3116 |
| 2420 | 2738 |
| 2421 | 3193 |
| 2422 | 3095 |
| 2423 | 3652 |

TABLE Z1-continued

| with a sequence length of 8192: | |
|---|---|
| Polarized channel sequence number | Reliability or reliability sequence number |
| 2424 | 2874 |
| 2425 | 3338 |
| 2426 | 3397 |
| 2427 | 3809 |
| 2428 | 3422 |
| 2429 | 3972 |
| 2430 | 4061 |
| 2431 | 4378 |
| 2432 | 833 |
| 2433 | 1306 |
| 2434 | 1327 |
| 2435 | 1784 |
| 2436 | 1523 |
| 2437 | 1839 |
| 2438 | 1881 |
| 2439 | 2250 |
| 2440 | 1607 |
| 2441 | 1897 |
| 2442 | 1934 |
| 2443 | 2313 |
| 2444 | 2012 |
| 2445 | 2385 |
| 2446 | 2461 |
| 2447 | 2918 |
| 2448 | 1656 |
| 2449 | 2003 |
| 2450 | 2058 |
| 2451 | 2388 |
| 2452 | 2101 |
| 2453 | 2475 |
| 2454 | 2543 |
| 2455 | 2987 |
| 2456 | 2167 |
| 2457 | 2567 |
| 2458 | 2636 |
| 2459 | 3057 |
| 2460 | 2732 |
| 2461 | 3131 |
| 2462 | 3240 |
| 2463 | 3674 |
| 2464 | 1797 |
| 2465 | 2073 |
| 2466 | 2116 |
| 2467 | 2537 |
| 2468 | 2194 |
| 2469 | 2615 |
| 2470 | 2706 |
| 2471 | 3099 |
| 2472 | 2311 |
| 2473 | 2709 |
| 2474 | 2755 |
| 2475 | 3232 |
| 2476 | 2878 |
| 2477 | 3178 |
| 2478 | 3371 |
| 2479 | 3820 |
| 2480 | 2408 |
| 2481 | 2812 |
| 2482 | 2936 |
| 2483 | 3341 |
| 2484 | 2990 |
| 2485 | 3417 |
| 2486 | 3477 |
| 2487 | 3922 |
| 2488 | 3080 |
| 2489 | 3502 |
| 2490 | 3497 |
| 2491 | 4038 |
| 2492 | 3657 |
| 2493 | 4101 |
| 2494 | 4172 |
| 2495 | 4596 |
| 2496 | 1909 |
| 2497 | 2157 |
| 2498 | 2255 |

TABLE Z1-continued with a sequence length of 8192:

| Polarized channel sequence number | Reliability or reliability sequence number |
|---|---|
| 2499 | 2715 |
| 2500 | 2379 |
| 2501 | 2761 |
| 2502 | 2847 |
| 2503 | 3274 |
| 2504 | 2467 |
| 2505 | 2913 |
| 2506 | 2953 |
| 2507 | 3402 |
| 2508 | 3040 |
| 2509 | 3432 |
| 2510 | 3495 |
| 2511 | 3962 |
| 2512 | 2546 |
| 2513 | 3003 |
| 2514 | 3103 |
| 2515 | 3472 |
| 2516 | 3144 |
| 2517 | 3509 |
| 2518 | 3663 |
| 2519 | 4107 |
| 2520 | 3267 |
| 2521 | 3696 |
| 2522 | 3757 |
| 2523 | 4190 |
| 2524 | 3865 |
| 2525 | 4302 |
| 2526 | 4366 |
| 2527 | 4821 |
| 2528 | 2683 |
| 2529 | 3123 |
| 2530 | 3220 |
| 2531 | 3668 |
| 2532 | 3366 |
| 2533 | 3680 |
| 2534 | 3841 |
| 2535 | 4220 |
| 2536 | 3385 |
| 2537 | 3824 |
| 2538 | 3932 |
| 2539 | 4341 |
| 2540 | 4016 |
| 2541 | 4427 |
| 2542 | 4546 |
| 2543 | 4994 |
| 2544 | 3436 |
| 2545 | 3978 |
| 2546 | 4087 |
| 2547 | 4469 |
| 2548 | 4142 |
| 2549 | 4566 |
| 2550 | 4509 |
| 2551 | 5051 |
| 2552 | 4264 |
| 2553 | 4656 |
| 2554 | 4720 |
| 2555 | 5221 |
| 2556 | 4854 |
| 2557 | 5315 |
| 2558 | 5432 |
| 2559 | 5756 |
| 2560 | 438 |
| 2561 | 576 |
| 2562 | 639 |
| 2563 | 923 |
| 2564 | 692 |
| 2565 | 1021 |
| 2566 | 1077 |
| 2567 | 1404 |
| 2568 | 729 |
| 2569 | 1096 |
| 2570 | 1135 |
| 2571 | 1427 |
| 2572 | 1187 |
| 2573 | 1493 |

TABLE Z1-continued with a sequence length of 8192:

| Polarized channel sequence number | Reliability or reliability sequence number |
|---|---|
| 2574 | 1512 |
| 2575 | 1938 |
| 2576 | 741 |
| 2577 | 1184 |
| 2578 | 1221 |
| 2579 | 1489 |
| 2580 | 1258 |
| 2581 | 1670 |
| 2582 | 1703 |
| 2583 | 2031 |
| 2584 | 1357 |
| 2585 | 1707 |
| 2586 | 1780 |
| 2587 | 2134 |
| 2588 | 1836 |
| 2589 | 2202 |
| 2590 | 2261 |
| 2591 | 2723 |
| 2592 | 753 |
| 2593 | 1246 |
| 2594 | 1311 |
| 2595 | 1687 |
| 2596 | 1366 |
| 2597 | 1773 |
| 2598 | 1816 |
| 2599 | 2178 |
| 2600 | 1407 |
| 2601 | 1852 |
| 2602 | 1890 |
| 2603 | 2274 |
| 2604 | 1944 |
| 2605 | 2345 |
| 2606 | 2400 |
| 2607 | 2769 |
| 2608 | 1453 |
| 2609 | 1919 |
| 2610 | 1978 |
| 2611 | 2374 |
| 2612 | 2049 |
| 2613 | 2452 |
| 2614 | 2502 |
| 2615 | 2893 |
| 2616 | 2080 |
| 2617 | 2484 |
| 2618 | 2573 |
| 2619 | 2998 |
| 2620 | 2585 |
| 2621 | 3055 |
| 2622 | 3128 |
| 2623 | 3786 |
| 2624 | 969 |
| 2625 | 1362 |
| 2626 | 1393 |
| 2627 | 1829 |
| 2628 | 1435 |
| 2629 | 1893 |
| 2630 | 1941 |
| 2631 | 2322 |
| 2632 | 1533 |
| 2633 | 1988 |
| 2634 | 2019 |
| 2635 | 2431 |
| 2636 | 2088 |
| 2637 | 2517 |
| 2638 | 2564 |
| 2639 | 2928 |
| 2640 | 1597 |
| 2641 | 2028 |
| 2642 | 2113 |
| 2643 | 2493 |
| 2644 | 2173 |
| 2645 | 2579 |
| 2646 | 2603 |
| 2647 | 3026 |
| 2648 | 2226 |

TABLE Z1-continued with a sequence length of 8192:

| Polarized channel sequence number | Reliability or reliability sequence number |
| --- | --- |
| 2649 | 2606 |
| 2650 | 2633 |
| 2651 | 3136 |
| 2652 | 2809 |
| 2653 | 3198 |
| 2654 | 3319 |
| 2655 | 3822 |
| 2656 | 1660 |
| 2657 | 2170 |
| 2658 | 2209 |
| 2659 | 2627 |
| 2660 | 2291 |
| 2661 | 2700 |
| 2662 | 2717 |
| 2663 | 3164 |
| 2664 | 2353 |
| 2665 | 2805 |
| 2666 | 2861 |
| 2667 | 3266 |
| 2668 | 2964 |
| 2669 | 3357 |
| 2670 | 3408 |
| 2671 | 3938 |
| 2672 | 2429 |
| 2673 | 2902 |
| 2674 | 2995 |
| 2675 | 3411 |
| 2676 | 3086 |
| 2677 | 3461 |
| 2678 | 3587 |
| 2679 | 4020 |
| 2680 | 3218 |
| 2681 | 3604 |
| 2682 | 3702 |
| 2683 | 4115 |
| 2684 | 3763 |
| 2685 | 4210 |
| 2686 | 4312 |
| 2687 | 4805 |
| 2688 | 988 |
| 2689 | 1422 |
| 2690 | 1497 |
| 2691 | 1976 |
| 2692 | 1590 |
| 2693 | 2022 |
| 2694 | 2098 |
| 2695 | 2528 |
| 2696 | 1639 |
| 2697 | 2126 |
| 2698 | 2182 |
| 2699 | 2612 |
| 2700 | 2241 |
| 2701 | 2650 |
| 2702 | 2671 |
| 2703 | 3151 |
| 2704 | 1741 |
| 2705 | 2215 |
| 2706 | 2288 |
| 2707 | 2674 |
| 2708 | 2348 |
| 2709 | 2789 |
| 2710 | 2844 |
| 2711 | 3249 |
| 2712 | 2423 |
| 2713 | 2885 |
| 2714 | 2958 |
| 2715 | 3383 |
| 2716 | 3032 |
| 2717 | 3441 |
| 2718 | 3540 |
| 2719 | 3944 |
| 2720 | 1819 |
| 2721 | 2319 |
| 2722 | 2397 |
| 2723 | 2856 |
| 2724 | 2505 |
| 2725 | 2942 |
| 2726 | 2932 |
| 2727 | 3447 |
| 2728 | 2549 |
| 2729 | 3010 |
| 2730 | 3049 |
| 2731 | 3520 |
| 2732 | 3169 |
| 2733 | 3593 |
| 2734 | 3637 |
| 2735 | 4125 |
| 2736 | 2643 |
| 2737 | 3091 |
| 2738 | 3206 |
| 2739 | 3620 |
| 2740 | 3254 |
| 2741 | 3728 |
| 2742 | 3768 |
| 2743 | 4226 |
| 2744 | 3333 |
| 2745 | 3814 |
| 2746 | 3886 |
| 2747 | 4345 |
| 2748 | 4032 |
| 2749 | 4441 |
| 2750 | 4553 |
| 2751 | 5001 |
| 2752 | 1877 |
| 2753 | 2440 |
| 2754 | 2514 |
| 2755 | 3018 |
| 2756 | 2597 |
| 2757 | 3071 |
| 2758 | 3173 |
| 2759 | 3609 |
| 2760 | 2781 |
| 2761 | 3211 |
| 2762 | 3288 |
| 2763 | 3746 |
| 2764 | 3302 |
| 2765 | 3780 |
| 2766 | 3853 |
| 2767 | 4294 |
| 2768 | 2819 |
| 2769 | 3293 |
| 2770 | 3327 |
| 2771 | 3836 |
| 2772 | 3452 |
| 2773 | 3882 |
| 2774 | 3996 |
| 2775 | 4420 |
| 2776 | 3562 |
| 2777 | 4026 |
| 2778 | 4081 |
| 2779 | 4473 |
| 2780 | 4166 |
| 2781 | 4605 |
| 2782 | 4679 |
| 2783 | 5081 |
| 2784 | 2888 |
| 2785 | 3482 |
| 2786 | 3531 |
| 2787 | 3950 |
| 2788 | 3641 |
| 2789 | 4044 |
| 2790 | 4096 |
| 2791 | 4525 |
| 2792 | 3708 |
| 2793 | 4156 |
| 2794 | 4234 |
| 2795 | 4652 |
| 2796 | 4321 |
| 2797 | 4729 |
| 2798 | 4835 |

TABLE Z1-continued with a sequence length of 8192:

| Polarized channel sequence number | Reliability or reliability sequence number |
|---|---|
| 2799 | 5256 |
| 2800 | 3898 |
| 2801 | 4246 |
| 2802 | 4354 |
| 2803 | 4754 |
| 2804 | 4454 |
| 2805 | 4871 |
| 2806 | 4918 |
| 2807 | 5406 |
| 2808 | 4533 |
| 2809 | 4962 |
| 2810 | 5041 |
| 2811 | 5472 |
| 2812 | 5156 |
| 2813 | 5589 |
| 2814 | 5737 |
| 2815 | 6185 |
| 2816 | 1063 |
| 2817 | 1537 |
| 2818 | 1615 |
| 2819 | 2128 |
| 2820 | 1730 |
| 2821 | 2206 |
| 2822 | 2277 |
| 2823 | 2743 |
| 2824 | 1764 |
| 2825 | 2299 |
| 2826 | 2368 |
| 2827 | 2798 |
| 2828 | 2437 |
| 2829 | 2870 |
| 2830 | 2980 |
| 2831 | 3545 |
| 2832 | 1858 |
| 2833 | 2405 |
| 2834 | 2525 |
| 2835 | 2921 |
| 2836 | 2576 |
| 2837 | 3067 |
| 2838 | 3036 |
| 2839 | 3573 |
| 2840 | 2618 |
| 2841 | 3108 |
| 2842 | 3184 |
| 2843 | 3691 |
| 2844 | 3279 |
| 2845 | 3734 |
| 2846 | 3797 |
| 2847 | 4270 |
| 2848 | 2056 |
| 2849 | 2555 |
| 2850 | 2624 |
| 2851 | 3063 |
| 2852 | 2778 |
| 2853 | 3159 |
| 2854 | 3227 |
| 2855 | 3751 |
| 2856 | 2795 |
| 2857 | 3283 |
| 2858 | 3312 |
| 2859 | 3803 |
| 2860 | 3362 |
| 2861 | 3859 |
| 2862 | 3916 |
| 2863 | 4393 |
| 2864 | 2822 |
| 2865 | 3347 |
| 2866 | 3427 |
| 2867 | 3910 |
| 2868 | 3556 |
| 2869 | 3990 |
| 2870 | 4067 |
| 2871 | 4482 |
| 2872 | 3626 |
| 2873 | 4136 |

TABLE Z1-continued with a sequence length of 8192:

| Polarized channel sequence number | Reliability or reliability sequence number |
|---|---|
| 2874 | 4160 |
| 2875 | 4612 |
| 2876 | 4240 |
| 2877 | 4688 |
| 2878 | 4777 |
| 2879 | 5197 |
| 2880 | 2086 |
| 2881 | 2772 |
| 2882 | 2786 |
| 2883 | 3259 |
| 2884 | 2826 |
| 2885 | 3298 |
| 2886 | 3376 |
| 2887 | 3877 |
| 2888 | 2896 |
| 2889 | 3457 |
| 2890 | 3525 |
| 2891 | 3966 |
| 2892 | 3598 |
| 2893 | 4048 |
| 2894 | 4150 |
| 2895 | 4583 |
| 2896 | 3201 |
| 2897 | 3551 |
| 2898 | 3646 |
| 2899 | 4075 |
| 2900 | 3713 |
| 2901 | 4196 |
| 2902 | 4250 |
| 2903 | 4665 |
| 2904 | 3871 |
| 2905 | 4260 |
| 2906 | 4360 |
| 2907 | 4761 |
| 2908 | 4460 |
| 2909 | 4861 |
| 2910 | 4909 |
| 2911 | 5392 |
| 2912 | 3307 |
| 2913 | 3723 |
| 2914 | 3830 |
| 2915 | 4202 |
| 2916 | 3904 |
| 2917 | 4333 |
| 2918 | 4408 |
| 2919 | 4795 |
| 2920 | 4010 |
| 2921 | 4433 |
| 2922 | 4497 |
| 2923 | 4899 |
| 2924 | 4575 |
| 2925 | 4972 |
| 2926 | 5071 |
| 2927 | 5515 |
| 2928 | 4091 |
| 2929 | 4538 |
| 2930 | 4627 |
| 2931 | 5031 |
| 2932 | 4715 |
| 2933 | 5102 |
| 2934 | 5189 |
| 2935 | 5622 |
| 2936 | 4812 |
| 2937 | 5232 |
| 2938 | 5301 |
| 2939 | 5706 |
| 2940 | 5367 |
| 2941 | 5854 |
| 2942 | 5891 |
| 2943 | 6465 |
| 2944 | 2108 |
| 2945 | 2836 |
| 2946 | 2864 |
| 2947 | 3533 |
| 2948 | 3156 |

TABLE Z1-continued with a sequence length of 8192:

| Polarized channel sequence number | Reliability or reliability sequence number |
|---|---|
| 2949 | 3582 |
| 2950 | 3631 |
| 2951 | 4131 |
| 2952 | 3235 |
| 2953 | 3685 |
| 2954 | 3740 |
| 2955 | 4216 |
| 2956 | 3847 |
| 2957 | 4288 |
| 2958 | 4385 |
| 2959 | 4786 |
| 2960 | 3321 |
| 2961 | 3791 |
| 2962 | 3892 |
| 2963 | 4308 |
| 2964 | 3956 |
| 2965 | 4412 |
| 2966 | 4501 |
| 2967 | 4890 |
| 2968 | 4054 |
| 2969 | 4561 |
| 2969 | 4561 |
| 2970 | 4488 |
| 2971 | 4945 |
| 2972 | 4674 |
| 2973 | 5059 |
| 2974 | 5145 |
| 2975 | 5559 |
| 2976 | 3567 |
| 2977 | 3928 |
| 2978 | 3984 |
| 2979 | 4446 |
| 2980 | 4121 |
| 2981 | 4516 |
| 2982 | 4621 |
| 2983 | 5011 |
| 2984 | 4186 |
| 2985 | 4634 |
| 2986 | 4706 |
| 2987 | 5112 |
| 2988 | 4768 |
| 2989 | 5166 |
| 2990 | 5266 |
| 2991 | 5687 |
| 2992 | 4327 |
| 2993 | 4738 |
| 2994 | 4830 |
| 2995 | 5210 |
| 2996 | 4928 |
| 2997 | 5329 |
| 2998 | 5381 |
| 2999 | 5814 |
| 3000 | 4984 |
| 3001 | 5457 |
| 3002 | 5501 |
| 3003 | 5939 |
| 3004 | 5604 |
| 3005 | 6001 |
| 3006 | 6055 |
| 3007 | 6349 |
| 3008 | 3717 |
| 3009 | 4004 |
| 3010 | 4180 |
| 3011 | 4643 |
| 3012 | 4284 |
| 3013 | 4697 |
| 3014 | 4745 |
| 3015 | 5176 |
| 3016 | 4374 |
| 3017 | 4845 |
| 3018 | 4880 |
| 3019 | 5293 |
| 3020 | 4955 |
| 3021 | 5340 |
| 3022 | 5486 |

TABLE Z1-continued with a sequence length of 8192:

| Polarized channel sequence number | Reliability or reliability sequence number |
|---|---|
| 3023 | 5874 |
| 3024 | 4399 |
| 3025 | 4935 |
| 3026 | 5019 |
| 3027 | 5446 |
| 3028 | 5132 |
| 3029 | 5530 |
| 3030 | 5542 |
| 3031 | 6026 |
| 3032 | 5245 |
| 3033 | 5638 |
| 3034 | 5671 |
| 3035 | 6077 |
| 3036 | 5779 |
| 3037 | 6220 |
| 3038 | 6280 |
| 3039 | 6711 |
| 3040 | 4588 |
| 3041 | 5094 |
| 3042 | 5125 |
| 3043 | 5574 |
| 3044 | 5280 |
| 3045 | 5653 |
| 3046 | 5725 |
| 3047 | 6132 |
| 3048 | 5353 |
| 3049 | 5795 |
| 3050 | 5831 |
| 3051 | 6248 |
| 3052 | 5959 |
| 3053 | 6312 |
| 3054 | 6509 |
| 3055 | 6843 |
| 3056 | 5418 |
| 3057 | 5915 |
| 3058 | 5980 |
| 3059 | 6387 |
| 3060 | 6102 |
| 3061 | 6421 |
| 3062 | 6551 |
| 3063 | 6923 |
| 3064 | 6159 |
| 3065 | 6602 |
| 3066 | 6651 |
| 3067 | 7020 |
| 3068 | 6773 |
| 3069 | 7126 |
| 3070 | 7280 |
| 3071 | 7500 |
| 3072 | 237 |
| 3073 | 530 |
| 3074 | 704 |
| 3075 | 1100 |
| 3076 | 817 |
| 3077 | 1149 |
| 3078 | 1278 |
| 3079 | 1652 |
| 3080 | 902 |
| 3081 | 1237 |
| 3082 | 1350 |
| 3083 | 1737 |
| 3084 | 1446 |
| 3085 | 1832 |
| 3086 | 1865 |
| 3087 | 2402 |
| 3088 | 978 |
| 3089 | 1318 |
| 3090 | 1385 |
| 3091 | 1812 |
| 3092 | 1529 |
| 3093 | 1916 |
| 3094 | 2053 |
| 3095 | 2446 |
| 3096 | 1604 |
| 3097 | 2041 |

TABLE Z1-continued

| with a sequence length of 8192: | |
|---|---|
| Polarized channel sequence number | Reliability or reliability sequence number |
| 3098 | 1981 |
| 3099 | 2519 |
| 3100 | 2188 |
| 3101 | 2600 |
| 3102 | 2656 |
| 3103 | 3134 |
| 3104 | 1044 |
| 3105 | 1476 |
| 3106 | 1583 |
| 3107 | 1950 |
| 3108 | 1629 |
| 3109 | 2024 |
| 3110 | 2110 |
| 3111 | 2540 |
| 3112 | 1758 |
| 3113 | 2162 |
| 3114 | 2212 |
| 3115 | 2609 |
| 3116 | 2351 |
| 3117 | 2720 |
| 3118 | 2766 |
| 3119 | 3237 |
| 3120 | 1849 |
| 3121 | 2236 |
| 3122 | 2382 |
| 3123 | 2749 |
| 3124 | 2434 |
| 3125 | 2825 |
| 3126 | 2899 |
| 3127 | 3310 |
| 3128 | 2511 |
| 3129 | 2916 |
| 3130 | 2992 |
| 3131 | 3450 |
| 3132 | 3029 |
| 3133 | 3511 |
| 3134 | 3617 |
| 3135 | 4129 |
| 3136 | 1195 |
| 3137 | 1504 |
| 3138 | 1693 |
| 3139 | 2149 |
| 3140 | 1777 |
| 3141 | 2199 |
| 3142 | 2339 |
| 3143 | 2677 |
| 3144 | 1884 |
| 3145 | 2394 |
| 3146 | 2247 |
| 3147 | 2775 |
| 3148 | 2478 |
| 3149 | 2850 |
| 3150 | 2947 |
| 3151 | 3355 |
| 3152 | 2009 |
| 3153 | 2371 |
| 3154 | 2499 |
| 3155 | 2907 |
| 3156 | 2561 |
| 3157 | 2969 |
| 3158 | 3024 |
| 3159 | 3486 |
| 3160 | 2639 |
| 3161 | 3045 |
| 3162 | 3148 |
| 3163 | 3569 |
| 3164 | 3228 |
| 3165 | 3654 |
| 3166 | 3732 |
| 3167 | 4276 |
| 3168 | 2137 |
| 3169 | 2531 |
| 3170 | 2621 |
| 3171 | 3014 |
| 3172 | 2729 |

TABLE Z1-continued

| with a sequence length of 8192: | |
|---|---|
| Polarized channel sequence number | Reliability or reliability sequence number |
| 3173 | 3088 |
| 3174 | 3194 |
| 3175 | 3633 |
| 3176 | 2806 |
| 3177 | 3203 |
| 3178 | 3305 |
| 3179 | 3698 |
| 3180 | 3369 |
| 3181 | 3805 |
| 3182 | 3884 |
| 3183 | 4395 |
| 3184 | 2929 |
| 3185 | 3343 |
| 3186 | 3470 |
| 3187 | 3834 |
| 3188 | 3500 |
| 3189 | 3890 |
| 3190 | 3992 |
| 3191 | 4492 |
| 3192 | 3600 |
| 3193 | 4024 |
| 3194 | 4103 |
| 3195 | 4568 |
| 3196 | 4178 |
| 3197 | 4636 |
| 3198 | 4752 |
| 3199 | 5285 |
| 3200 | 1415 |
| 3201 | 1672 |
| 3202 | 1793 |
| 3203 | 2362 |
| 3204 | 1932 |
| 3205 | 2426 |
| 3206 | 2458 |
| 3207 | 2939 |
| 3208 | 2068 |
| 3209 | 2490 |
| 3210 | 2570 |
| 3211 | 3006 |
| 3212 | 2647 |
| 3213 | 3083 |
| 3214 | 3111 |
| 3215 | 3628 |
| 3216 | 2175 |
| 3217 | 2582 |
| 3218 | 2668 |
| 3219 | 3096 |
| 3220 | 2758 |
| 3221 | 3189 |
| 3222 | 3284 |
| 3223 | 3710 |
| 3224 | 2841 |
| 3225 | 3290 |
| 3226 | 3348 |
| 3227 | 3778 |
| 3228 | 3480 |
| 3229 | 3867 |
| 3230 | 3970 |
| 3231 | 4456 |
| 3232 | 2271 |
| 3233 | 2703 |
| 3234 | 2815 |
| 3235 | 3223 |
| 3236 | 2858 |
| 3237 | 3296 |
| 3238 | 3388 |
| 3239 | 3839 |
| 3240 | 3001 |
| 3241 | 3455 |
| 3242 | 3506 |
| 3243 | 3902 |
| 3244 | 3594 |
| 3245 | 4018 |
| 3246 | 4077 |
| 3247 | 4564 |

TABLE Z1-continued with a sequence length of 8192:

| Polarized channel sequence number | Reliability or reliability sequence number |
|---|---|
| 3248 | 3106 |
| 3249 | 3553 |
| 3250 | 3642 |
| 3251 | 4046 |
| 3252 | 3704 |
| 3253 | 4158 |
| 3254 | 4188 |
| 3255 | 4625 |
| 3256 | 3811 |
| 3257 | 4232 |
| 3258 | 4337 |
| 3259 | 4722 |
| 3260 | 4416 |
| 3261 | 4807 |
| 3262 | 4977 |
| 3263 | 5290 |
| 3264 | 2316 |
| 3265 | 2833 |
| 3266 | 2961 |
| 3267 | 3404 |
| 3268 | 3075 |
| 3269 | 3491 |
| 3270 | 3589 |
| 3271 | 4034 |
| 3272 | 3139 |
| 3273 | 3605 |
| 3274 | 3665 |
| 3275 | 4123 |
| 3276 | 3738 |
| 3277 | 4182 |
| 3278 | 4272 |
| 3279 | 4695 |
| 3280 | 3271 |
| 3281 | 3715 |
| 3282 | 3784 |
| 3283 | 4224 |
| 3284 | 3896 |
| 3285 | 4319 |
| 3286 | 4403 |
| 3287 | 4833 |
| 3288 | 3948 |
| 3289 | 4424 |
| 3290 | 4507 |
| 3291 | 4904 |
| 3292 | 4592 |
| 3293 | 5009 |
| 3294 | 5069 |
| 3295 | 5545 |
| 3296 | 3380 |
| 3297 | 3845 |
| 3298 | 3918 |
| 3299 | 4352 |
| 3300 | 4052 |
| 3301 | 4452 |
| 3302 | 4520 |
| 3303 | 4957 |
| 3304 | 4174 |
| 3305 | 4548 |
| 3306 | 4632 |
| 3307 | 5044 |
| 3308 | 4726 |
| 3309 | 5084 |
| 3310 | 5224 |
| 3311 | 5678 |
| 3312 | 4268 |
| 3313 | 4663 |
| 3314 | 4756 |
| 3315 | 5158 |
| 3316 | 4798 |
| 3317 | 5264 |
| 3318 | 5326 |
| 3319 | 5785 |
| 3320 | 4969 |
| 3321 | 5356 |
| 3322 | 5423 |

TABLE Z1-continued with a sequence length of 8192:

| Polarized channel sequence number | Reliability or reliability sequence number |
|---|---|
| 3323 | 5763 |
| 3324 | 5492 |
| 3325 | 5871 |
| 3326 | 6008 |
| 3327 | 6434 |
| 3328 | 1558 |
| 3329 | 1900 |
| 3330 | 1966 |
| 3331 | 2552 |
| 3332 | 2083 |
| 3333 | 2591 |
| 3334 | 2684 |
| 3335 | 3181 |
| 3336 | 2095 |
| 3337 | 2694 |
| 3338 | 2784 |
| 3339 | 3243 |
| 3340 | 2875 |
| 3341 | 3360 |
| 3342 | 3413 |
| 3343 | 3958 |
| 3344 | 2258 |
| 3345 | 2792 |
| 3346 | 2881 |
| 3347 | 3431 |
| 3348 | 2979 |
| 3349 | 3475 |
| 3350 | 3542 |
| 3351 | 3964 |
| 3352 | 3037 |
| 3353 | 3536 |
| 3354 | 3622 |
| 3355 | 4099 |
| 3356 | 3721 |
| 3357 | 4170 |
| 3358 | 4204 |
| 3359 | 4623 |
| 3360 | 2294 |
| 3361 | 2955 |
| 3362 | 3052 |
| 3363 | 3445 |
| 3364 | 3161 |
| 3365 | 3558 |
| 3366 | 3648 |
| 3367 | 4164 |
| 3368 | 3215 |
| 3369 | 3687 |
| 3370 | 3744 |
| 3371 | 4212 |
| 3372 | 3799 |
| 3373 | 4310 |
| 3374 | 4370 |
| 3375 | 4788 |
| 3376 | 3210 |
| 3377 | 3787 |
| 3378 | 3855 |
| 3379 | 4304 |
| 3380 | 3942 |
| 3381 | 4410 |
| 3382 | 4465 |
| 3383 | 4906 |
| 3384 | 4063 |
| 3385 | 4529 |
| 3386 | 4594 |
| 3387 | 5004 |
| 3388 | 4659 |
| 3389 | 5066 |
| 3390 | 5171 |
| 3391 | 5641 |
| 3392 | 2414 |
| 3393 | 3124 |
| 3394 | 3168 |
| 3395 | 3676 |
| 3396 | 3262 |
| 3397 | 3766 |

TABLE Z1-continued with a sequence length of 8192:

| Polarized channel sequence number | Reliability or reliability sequence number |
|---|---|
| 3398 | 3851 |
| 3399 | 4280 |
| 3400 | 3315 |
| 3401 | 3878 |
| 3402 | 3912 |
| 3403 | 4401 |
| 3404 | 3998 |
| 3405 | 4490 |
| 3406 | 4544 |
| 3407 | 4996 |
| 3408 | 3611 |
| 3409 | 3976 |
| 3410 | 4059 |
| 3411 | 4505 |
| 3412 | 4134 |
| 3413 | 4581 |
| 3414 | 4654 |
| 3415 | 5054 |
| 3416 | 4242 |
| 3417 | 4677 |
| 3418 | 4772 |
| 3419 | 5148 |
| 3420 | 4847 |
| 3421 | 5261 |
| 3422 | 5334 |
| 3423 | 5744 |
| 3424 | 3761 |
| 3425 | 4113 |
| 3426 | 4218 |
| 3427 | 4616 |
| 3428 | 4300 |
| 3429 | 4717 |
| 3430 | 4782 |
| 3431 | 5226 |
| 3432 | 4387 |
| 3433 | 4819 |
| 3434 | 4873 |
| 3435 | 5282 |
| 3436 | 4982 |
| 3437 | 5387 |
| 3438 | 5449 |
| 3439 | 5841 |
| 3440 | 4514 |
| 3441 | 4974 |
| 3442 | 5014 |
| 3443 | 5426 |
| 3444 | 5056 |
| 3445 | 5495 |
| 3446 | 5403 |
| 3447 | 5904 |
| 3448 | 5192 |
| 3449 | 5628 |
| 3450 | 5681 |
| 3451 | 6033 |
| 3452 | 5703 |
| 3453 | 6178 |
| 3454 | 6252 |
| 3455 | 6523 |
| 3456 | 2469 |
| 3457 | 3252 |
| 3458 | 3276 |
| 3459 | 3936 |
| 3460 | 3563 |
| 3461 | 4012 |
| 3462 | 4073 |
| 3463 | 4527 |
| 3464 | 3681 |
| 3465 | 4095 |
| 3466 | 4138 |
| 3467 | 4603 |
| 3468 | 4238 |
| 3469 | 4686 |
| 3470 | 4765 |
| 3471 | 5237 |
| 3472 | 3749 |

TABLE Z1-continued with a sequence length of 8192:

| Polarized channel sequence number | Reliability or reliability sequence number |
|---|---|
| 3473 | 4230 |
| 3474 | 4296 |
| 3475 | 4690 |
| 3476 | 4349 |
| 3477 | 4784 |
| 3478 | 4856 |
| 3479 | 5299 |
| 3480 | 4429 |
| 3481 | 4883 |
| 3482 | 4950 |
| 3483 | 5370 |
| 3484 | 5046 |
| 3485 | 5437 |
| 3486 | 5539 |
| 3487 | 5921 |
| 3488 | 3952 |
| 3489 | 4317 |
| 3490 | 4368 |
| 3491 | 4849 |
| 3492 | 4462 |
| 3493 | 4931 |
| 3494 | 5024 |
| 3495 | 5409 |
| 3496 | 4601 |
| 3497 | 5026 |
| 3498 | 5074 |
| 3499 | 5533 |
| 3500 | 5195 |
| 3501 | 5483 |
| 3502 | 5659 |
| 3503 | 6041 |
| 3504 | 4710 |
| 3505 | 5130 |
| 3506 | 5250 |
| 3507 | 5632 |
| 3508 | 5307 |
| 3509 | 5699 |
| 3510 | 5753 |
| 3511 | 6136 |
| 3512 | 5389 |
| 3513 | 5772 |
| 3514 | 5769 |
| 3515 | 6232 |
| 3516 | 5908 |
| 3517 | 6288 |
| 3518 | 6345 |
| 3519 | 6695 |
| 3520 | 4109 |
| 3521 | 4418 |
| 3522 | 4535 |
| 3523 | 5029 |
| 3524 | 4683 |
| 3525 | 5076 |
| 3526 | 5163 |
| 3527 | 5568 |
| 3528 | 4775 |
| 3529 | 5229 |
| 3530 | 5272 |
| 3531 | 5684 |
| 3532 | 5351 |
| 3533 | 5712 |
| 3534 | 5766 |
| 3535 | 6166 |
| 3536 | 4859 |
| 3537 | 5318 |
| 3538 | 5412 |
| 3539 | 5747 |
| 3540 | 5452 |
| 3541 | 5782 |
| 3542 | 5911 |
| 3543 | 6292 |
| 3544 | 5565 |
| 3545 | 5942 |
| 3546 | 5991 |
| 3547 | 6361 |

TABLE Z1-continued

| with a sequence length of 8192: | |
|---|---|
| Polarized channel sequence number | Reliability or reliability sequence number |
| 3548 | 6088 |
| 3549 | 6456 |
| 3550 | 6514 |
| 3551 | 6871 |
| 3552 | 4999 |
| 3553 | 5429 |
| 3554 | 5521 |
| 3555 | 5918 |
| 3556 | 5656 |
| 3557 | 5925 |
| 3558 | 6066 |
| 3559 | 6391 |
| 3560 | 5675 |
| 3561 | 6051 |
| 3562 | 6144 |
| 3563 | 6487 |
| 3564 | 6208 |
| 3565 | 6560 |
| 3566 | 6656 |
| 3567 | 6989 |
| 3568 | 5715 |
| 3569 | 6181 |
| 3570 | 6272 |
| 3571 | 6593 |
| 3572 | 6324 |
| 3573 | 6675 |
| 3574 | 6626 |
| 3575 | 7040 |
| 3576 | 6425 |
| 3577 | 6741 |
| 3578 | 6794 |
| 3579 | 7153 |
| 3580 | 6894 |
| 3581 | 7218 |
| 3582 | 7296 |
| 3583 | 7490 |
| 3584 | 1717 |
| 3585 | 1993 |
| 3586 | 2121 |
| 3587 | 2630 |
| 3588 | 2223 |
| 3589 | 2801 |
| 3590 | 2889 |
| 3591 | 3394 |
| 3592 | 2282 |
| 3593 | 2924 |
| 3594 | 2984 |
| 3595 | 3425 |
| 3596 | 3068 |
| 3597 | 3522 |
| 3598 | 3547 |
| 3599 | 4144 |
| 3600 | 2305 |
| 3601 | 3060 |
| 3602 | 3119 |
| 3603 | 3516 |
| 3604 | 3176 |
| 3605 | 3772 |
| 3606 | 3816 |
| 3607 | 4262 |
| 3608 | 3324 |
| 3609 | 3828 |
| 3610 | 3930 |
| 3611 | 4391 |
| 3612 | 4006 |
| 3613 | 4471 |
| 3614 | 4542 |
| 3615 | 5039 |
| 3616 | 2328 |
| 3617 | 3153 |
| 3618 | 3257 |
| 3619 | 3793 |
| 3620 | 3334 |
| 3621 | 3924 |
| 3622 | 3982 |

TABLE Z1-continued

| with a sequence length of 8192: | |
|---|---|
| Polarized channel sequence number | Reliability or reliability sequence number |
| 3623 | 4443 |
| 3624 | 3399 |
| 3625 | 4030 |
| 3626 | 4083 |
| 3627 | 4555 |
| 3628 | 4152 |
| 3629 | 4641 |
| 3630 | 4704 |
| 3631 | 5086 |
| 3632 | 3464 |
| 3633 | 4117 |
| 3634 | 4200 |
| 3635 | 4672 |
| 3636 | 4286 |
| 3637 | 4763 |
| 3638 | 4809 |
| 3639 | 5208 |
| 3640 | 4325 |
| 3641 | 4793 |
| 3642 | 4885 |
| 3643 | 5312 |
| 3644 | 4897 |
| 3645 | 5364 |
| 3646 | 5435 |
| 3647 | 6016 |
| 3648 | 2712 |
| 3649 | 3329 |
| 3650 | 3374 |
| 3651 | 4002 |
| 3652 | 3438 |
| 3653 | 4089 |
| 3654 | 4148 |
| 3655 | 4614 |
| 3656 | 3578 |
| 3657 | 4208 |
| 3658 | 4248 |
| 3659 | 4740 |
| 3660 | 4335 |
| 3661 | 4828 |
| 3662 | 4878 |
| 3663 | 5242 |
| 3664 | 3670 |
| 3665 | 4256 |
| 3666 | 4362 |
| 3667 | 4800 |
| 3668 | 4437 |
| 3669 | 4894 |
| 3670 | 4916 |
| 3671 | 5337 |
| 3672 | 4499 |
| 3673 | 4921 |
| 3674 | 4947 |
| 3675 | 5443 |
| 3676 | 5127 |
| 3677 | 5498 |
| 3678 | 5610 |
| 3679 | 6048 |
| 3680 | 3755 |
| 3681 | 4435 |
| 3682 | 4480 |
| 3683 | 4943 |
| 3684 | 4577 |
| 3685 | 5016 |
| 3686 | 5036 |
| 3687 | 5469 |
| 3688 | 4647 |
| 3689 | 5120 |
| 3690 | 5179 |
| 3691 | 5562 |
| 3692 | 5277 |
| 3693 | 5647 |
| 3694 | 5690 |
| 3695 | 6147 |
| 3696 | 4733 |
| 3697 | 5216 |

TABLE Z1-continued with a sequence length of 8192:

| Polarized channel sequence number | Reliability or reliability sequence number |
|---|---|
| 3698 | 5309 |
| 3699 | 5696 |
| 3700 | 5395 |
| 3701 | 5740 |
| 3702 | 5847 |
| 3703 | 6212 |
| 3704 | 5518 |
| 3705 | 5861 |
| 3706 | 5945 |
| 3707 | 6296 |
| 3708 | 5994 |
| 3709 | 6378 |
| 3710 | 6469 |
| 3711 | 6854 |
| 3712 | 2741 |
| 3713 | 3418 |
| 3714 | 3527 |
| 3715 | 4194 |
| 3716 | 3659 |
| 3717 | 4254 |
| 3718 | 4343 |
| 3719 | 4842 |
| 3720 | 3727 |
| 3721 | 4376 |
| 3722 | 4448 |
| 3723 | 4923 |
| 3724 | 4518 |
| 3725 | 4967 |
| 3726 | 4987 |
| 3727 | 5454 |
| 3728 | 3873 |
| 3729 | 4484 |
| 3730 | 4572 |
| 3731 | 4989 |
| 3732 | 4645 |
| 3733 | 5109 |
| 3734 | 5161 |
| 3735 | 5550 |
| 3736 | 4731 |
| 3737 | 5200 |
| 3738 | 5274 |
| 3739 | 5665 |
| 3740 | 5345 |
| 3741 | 5718 |
| 3742 | 5805 |
| 3743 | 6151 |
| 3744 | 3986 |
| 3745 | 4608 |
| 3746 | 4699 |
| 3747 | 5174 |
| 3748 | 4816 |
| 3749 | 5258 |
| 3750 | 5248 |
| 3751 | 5728 |
| 3752 | 4866 |
| 3753 | 5320 |
| 3754 | 5359 |
| 3755 | 5788 |
| 3756 | 5475 |
| 3757 | 5851 |
| 3758 | 5888 |
| 3759 | 6304 |
| 3760 | 4960 |
| 3761 | 5401 |
| 3762 | 5509 |
| 3763 | 5877 |
| 3764 | 5553 |
| 3765 | 5966 |
| 3766 | 5998 |
| 3767 | 6395 |
| 3768 | 5625 |
| 3769 | 6037 |
| 3770 | 6106 |
| 3771 | 6491 |
| 3772 | 6228 |

TABLE Z1-continued with a sequence length of 8192:

| Polarized channel sequence number | Reliability or reliability sequence number |
|---|---|
| 3773 | 6569 |
| 3774 | 6665 |
| 3775 | 7002 |
| 3776 | 4069 |
| 3777 | 4749 |
| 3778 | 4823 |
| 3779 | 5331 |
| 3780 | 4911 |
| 3781 | 5384 |
| 3782 | 5477 |
| 3783 | 5864 |
| 3784 | 5099 |
| 3785 | 5512 |
| 3786 | 5583 |
| 3787 | 5984 |
| 3788 | 5598 |
| 3789 | 6012 |
| 3790 | 6073 |
| 3791 | 6451 |
| 3792 | 5135 |
| 3793 | 5586 |
| 3794 | 5616 |
| 3795 | 6062 |
| 3796 | 5731 |
| 3797 | 6099 |
| 3798 | 6197 |
| 3799 | 6555 |
| 3800 | 5824 |
| 3801 | 6224 |
| 3802 | 6264 |
| 3803 | 6597 |
| 3804 | 6341 |
| 3805 | 6700 |
| 3806 | 6762 |
| 3807 | 7059 |
| 3808 | 5205 |
| 3809 | 5760 |
| 3810 | 5798 |
| 3811 | 6155 |
| 3812 | 5894 |
| 3813 | 6236 |
| 3814 | 6284 |
| 3815 | 6636 |
| 3816 | 5949 |
| 3817 | 6332 |
| 3818 | 6400 |
| 3819 | 6736 |
| 3820 | 6473 |
| 3821 | 6800 |
| 3822 | 6883 |
| 3823 | 7182 |
| 3824 | 6114 |
| 3825 | 6408 |
| 3826 | 6496 |
| 3827 | 6816 |
| 3828 | 6583 |
| 3829 | 6906 |
| 3830 | 6941 |
| 3831 | 7272 |
| 3832 | 6641 |
| 3833 | 6971 |
| 3834 | 7033 |
| 3835 | 7320 |
| 3836 | 7105 |
| 3837 | 7388 |
| 3838 | 7480 |
| 3839 | 7719 |
| 3840 | 2867 |
| 3841 | 3583 |
| 3842 | 3693 |
| 3843 | 4383 |
| 3844 | 3861 |
| 3845 | 4477 |
| 3846 | 4557 |
| 3847 | 5061 |

TABLE Z1-continued with a sequence length of 8192:

| Polarized channel sequence number | Reliability or reliability sequence number |
|---|---|
| 3848 | 3906 |
| 3849 | 4585 |
| 3850 | 4668 |
| 3851 | 5117 |
| 3852 | 4742 |
| 3853 | 5187 |
| 3854 | 5296 |
| 3855 | 5811 |
| 3856 | 4040 |
| 3857 | 4708 |
| 3858 | 4838 |
| 3859 | 5240 |
| 3860 | 4892 |
| 3861 | 5376 |
| 3862 | 5348 |
| 3863 | 5834 |
| 3864 | 4933 |
| 3865 | 5415 |
| 3866 | 5489 |
| 3867 | 5932 |
| 3868 | 5577 |
| 3869 | 5973 |
| 3870 | 6023 |
| 3871 | 6430 |
| 3872 | 4292 |
| 3873 | 4868 |
| 3874 | 4938 |
| 3875 | 5373 |
| 3876 | 5097 |
| 3877 | 5466 |
| 3878 | 5527 |
| 3879 | 5987 |
| 3880 | 5114 |
| 3881 | 5580 |
| 3882 | 5607 |
| 3883 | 6030 |
| 3884 | 5650 |
| 3885 | 6080 |
| 3886 | 6128 |
| 3887 | 6532 |
| 3888 | 5140 |
| 3889 | 5635 |
| 3890 | 5709 |
| 3891 | 6121 |
| 3892 | 5821 |
| 3893 | 6193 |
| 3894 | 6256 |
| 3895 | 6607 |
| 3896 | 5881 |
| 3897 | 6316 |
| 3898 | 6337 |
| 3899 | 6705 |
| 3900 | 6404 |
| 3901 | 6768 |
| 3902 | 6832 |
| 3903 | 7139 |
| 3904 | 4329 |
| 3905 | 5089 |
| 3906 | 5104 |
| 3907 | 5556 |
| 3908 | 5143 |
| 3909 | 5592 |
| 3910 | 5662 |
| 3911 | 6095 |
| 3912 | 5213 |
| 3913 | 5734 |
| 3914 | 5792 |
| 3915 | 6174 |
| 3916 | 5857 |
| 3917 | 6240 |
| 3918 | 6328 |
| 3919 | 6685 |
| 3920 | 5506 |
| 3921 | 5818 |
| 3922 | 5898 |

TABLE Z1-continued with a sequence length of 8192:

| Polarized channel sequence number | Reliability or reliability sequence number |
|---|---|
| 3923 | 6260 |
| 3924 | 5952 |
| 3925 | 6366 |
| 3926 | 6412 |
| 3927 | 6747 |
| 3928 | 6091 |
| 3929 | 6417 |
| 3930 | 6500 |
| 3931 | 6821 |
| 3932 | 6588 |
| 3933 | 6900 |
| 3934 | 6935 |
| 3935 | 7264 |
| 3936 | 5601 |
| 3937 | 5963 |
| 3938 | 6059 |
| 3939 | 6370 |
| 3940 | 6117 |
| 3941 | 6482 |
| 3942 | 6541 |
| 3943 | 6849 |
| 3944 | 6205 |
| 3945 | 6564 |
| 3946 | 6617 |
| 3947 | 6929 |
| 3948 | 6680 |
| 3949 | 6977 |
| 3950 | 7052 |
| 3951 | 7345 |
| 3952 | 6276 |
| 3953 | 6646 |
| 3954 | 6721 |
| 3955 | 7027 |
| 3956 | 6789 |
| 3957 | 7072 |
| 3958 | 7132 |
| 3959 | 7405 |
| 3960 | 6860 |
| 3961 | 7160 |
| 3962 | 7211 |
| 3963 | 7461 |
| 3964 | 7249 |
| 3965 | 7552 |
| 3966 | 7573 |
| 3967 | 7841 |
| 3968 | 4358 |
| 3969 | 5150 |
| 3970 | 5182 |
| 3971 | 5801 |
| 3972 | 5463 |
| 3973 | 5844 |
| 3974 | 5884 |
| 3975 | 6308 |
| 3976 | 5536 |
| 3977 | 5928 |
| 3978 | 5977 |
| 3979 | 6383 |
| 3980 | 6069 |
| 3981 | 6447 |
| 3982 | 6528 |
| 3983 | 6838 |
| 3984 | 5613 |
| 3985 | 6019 |
| 3986 | 6110 |
| 3987 | 6460 |
| 3988 | 6162 |
| 3989 | 6546 |
| 3990 | 6621 |
| 3991 | 6917 |
| 3992 | 6244 |
| 3993 | 6670 |
| 3993 | 6670 |
| 3994 | 6612 |
| 3995 | 6959 |
| 3996 | 6757 |

TABLE Z1-continued with a sequence length of 8192:

| Polarized channel sequence number | Reliability or reliability sequence number |
|---|---|
| 3997 | 7046 |
| 3998 | 7098 |
| 3999 | 7370 |
| 4000 | 5828 |
| 4001 | 6140 |
| 4002 | 6189 |
| 4003 | 6574 |
| 4004 | 6300 |
| 4005 | 6631 |
| 4006 | 6716 |
| 4007 | 7008 |
| 4008 | 6357 |
| 4009 | 6726 |
| 4010 | 6784 |
| 4011 | 7078 |
| 4012 | 6827 |
| 4013 | 7112 |
| 4014 | 7189 |
| 4015 | 7451 |
| 4016 | 6478 |
| 4017 | 6805 |
| 4018 | 6877 |
| 4019 | 7146 |
| 4020 | 6947 |
| 4021 | 7226 |
| 4022 | 7256 |
| 4023 | 7530 |
| 4024 | 6983 |
| 4025 | 7312 |
| 4026 | 7336 |
| 4027 | 7595 |
| 4028 | 7396 |
| 4029 | 7630 |
| 4030 | 7654 |
| 4031 | 7792 |
| 4032 | 5956 |
| 4033 | 6201 |
| 4034 | 6353 |
| 4035 | 6731 |
| 4036 | 6443 |
| 4037 | 6778 |
| 4038 | 6810 |
| 4039 | 7119 |
| 4040 | 6518 |
| 4041 | 6888 |
| 4042 | 6912 |
| 4043 | 7204 |
| 4044 | 6965 |
| 4045 | 7233 |
| 4046 | 7328 |
| 4047 | 7562 |
| 4048 | 6537 |
| 4049 | 6953 |
| 4050 | 7014 |
| 4051 | 7304 |
| 4052 | 7092 |
| 4053 | 7353 |
| 4054 | 7362 |
| 4055 | 7642 |
| 4056 | 7175 |
| 4057 | 7414 |
| 4058 | 7442 |
| 4059 | 7667 |
| 4060 | 7510 |
| 4061 | 7733 |
| 4062 | 7762 |
| 4063 | 7936 |
| 4064 | 6690 |
| 4065 | 7065 |
| 4066 | 7085 |
| 4067 | 7379 |
| 4068 | 7196 |
| 4069 | 7424 |
| 4070 | 7470 |
| 4071 | 7692 |

TABLE Z1-continued with a sequence length of 8192:

| Polarized channel sequence number | Reliability or reliability sequence number |
|---|---|
| 4072 | 7241 |
| 4073 | 7520 |
| 4074 | 7541 |
| 4075 | 7747 |
| 4076 | 7607 |
| 4077 | 7776 |
| 4078 | 7858 |
| 4079 | 7981 |
| 4080 | 7288 |
| 4081 | 7584 |
| 4082 | 7618 |
| 4083 | 7808 |
| 4084 | 7680 |
| 4085 | 7824 |
| 4086 | 7876 |
| 4087 | 8006 |
| 4088 | 7706 |
| 4089 | 7895 |
| 4090 | 7915 |
| 4091 | 8033 |
| 4092 | 7957 |
| 4093 | 8064 |
| 4094 | 8098 |
| 4095 | 8138 |
| 4096 | 12 |
| 4097 | 53 |
| 4098 | 93 |
| 4099 | 234 |
| 4100 | 128 |
| 4101 | 256 |
| 4102 | 350 |
| 4103 | 537 |
| 4104 | 158 |
| 4105 | 333 |
| 4106 | 384 |
| 4107 | 584 |
| 4108 | 429 |
| 4109 | 640 |
| 4110 | 661 |
| 4111 | 1038 |
| 4112 | 185 |
| 4113 | 367 |
| 4114 | 399 |
| 4115 | 629 |
| 4116 | 472 |
| 4117 | 701 |
| 4118 | 795 |
| 4119 | 1072 |
| 4120 | 512 |
| 4121 | 786 |
| 4122 | 740 |
| 4123 | 1119 |
| 4124 | 879 |
| 4125 | 1177 |
| 4126 | 1220 |
| 4127 | 1579 |
| 4128 | 210 |
| 4129 | 444 |
| 4130 | 499 |
| 4131 | 721 |
| 4132 | 524 |
| 4133 | 777 |
| 4134 | 829 |
| 4135 | 1132 |
| 4136 | 596 |
| 4137 | 863 |
| 4138 | 896 |
| 4139 | 1183 |
| 4140 | 995 |
| 4141 | 1262 |
| 4142 | 1297 |
| 4143 | 1664 |
| 4144 | 650 |
| 4145 | 911 |
| 4146 | 1024 |

TABLE Z1-continued with a sequence length of 8192:

| Polarized channel sequence number | Reliability or reliability sequence number |
|---|---|
| 4147 | 1285 |
| 4148 | 1059 |
| 4149 | 1342 |
| 4150 | 1397 |
| 4151 | 1722 |
| 4152 | 1113 |
| 4153 | 1408 |
| 4154 | 1470 |
| 4155 | 1838 |
| 4156 | 1501 |
| 4157 | 1891 |
| 4158 | 1983 |
| 4159 | 2406 |
| 4160 | 276 |
| 4161 | 458 |
| 4162 | 561 |
| 4163 | 855 |
| 4164 | 607 |
| 4165 | 887 |
| 4166 | 987 |
| 4167 | 1232 |
| 4168 | 671 |
| 4169 | 1031 |
| 4170 | 927 |
| 4171 | 1303 |
| 4172 | 1093 |
| 4173 | 1364 |
| 4174 | 1439 |
| 4175 | 1761 |
| 4176 | 768 |
| 4177 | 1009 |
| 4178 | 1106 |
| 4179 | 1402 |
| 4180 | 1145 |
| 4181 | 1455 |
| 4182 | 1496 |
| 4183 | 1871 |
| 4184 | 1208 |
| 4185 | 1511 |
| 4186 | 1594 |
| 4187 | 1939 |
| 4188 | 1659 |
| 4189 | 2010 |
| 4190 | 2077 |
| 4191 | 2541 |
| 4192 | 846 |
| 4193 | 1126 |
| 4194 | 1196 |
| 4195 | 1491 |
| 4196 | 1274 |
| 4197 | 1550 |
| 4198 | 1631 |
| 4199 | 1994 |
| 4200 | 1331 |
| 4201 | 1636 |
| 4202 | 1718 |
| 4203 | 2048 |
| 4204 | 1774 |
| 4205 | 2140 |
| 4206 | 2200 |
| 4207 | 2652 |
| 4208 | 1423 |
| 4209 | 1753 |
| 4210 | 1854 |
| 4211 | 2158 |
| 4212 | 1883 |
| 4213 | 2204 |
| 4214 | 2290 |
| 4215 | 2742 |
| 4216 | 1963 |
| 4217 | 2314 |
| 4218 | 2386 |
| 4219 | 2816 |
| 4220 | 2451 |
| 4221 | 2879 |

TABLE Z1-continued with a sequence length of 8192:

| Polarized channel sequence number | Reliability or reliability sequence number |
|---|---|
| 4222 | 2991 |
| 4223 | 3530 |
| 4224 | 415 |
| 4225 | 549 |
| 4226 | 618 |
| 4227 | 1002 |
| 4228 | 711 |
| 4229 | 1052 |
| 4230 | 1079 |
| 4231 | 1429 |
| 4232 | 803 |
| 4233 | 1099 |
| 4234 | 1152 |
| 4235 | 1486 |
| 4236 | 1214 |
| 4237 | 1545 |
| 4238 | 1565 |
| 4239 | 1990 |
| 4240 | 871 |
| 4241 | 1158 |
| 4242 | 1226 |
| 4243 | 1555 |
| 4244 | 1291 |
| 4245 | 1627 |
| 4246 | 1704 |
| 4247 | 2055 |
| 4248 | 1359 |
| 4249 | 1709 |
| 4250 | 1757 |
| 4251 | 2118 |
| 4252 | 1863 |
| 4253 | 2186 |
| 4254 | 2270 |
| 4255 | 2711 |
| 4256 | 942 |
| 4257 | 1250 |
| 4258 | 1337 |
| 4259 | 1654 |
| 4260 | 1370 |
| 4261 | 1713 |
| 4262 | 1787 |
| 4263 | 2161 |
| 4264 | 1475 |
| 4265 | 1846 |
| 4266 | 1887 |
| 4267 | 2214 |
| 4268 | 1959 |
| 4269 | 2310 |
| 4270 | 2363 |
| 4271 | 2807 |
| 4272 | 1560 |
| 4273 | 1927 |
| 4274 | 1998 |
| 4275 | 2334 |
| 4276 | 2051 |
| 4277 | 2432 |
| 4278 | 2460 |
| 4279 | 2871 |
| 4280 | 2147 |
| 4281 | 2501 |
| 4282 | 2599 |
| 4283 | 2962 |
| 4284 | 2670 |
| 4285 | 3043 |
| 4286 | 3214 |
| 4287 | 3532 |
| 4288 | 973 |
| 4289 | 1348 |
| 4290 | 1450 |
| 4291 | 1800 |
| 4292 | 1536 |
| 4293 | 1875 |
| 4294 | 1955 |
| 4295 | 2327 |
| 4296 | 1584 |

TABLE Z1-continued with a sequence length of 8192:

| Polarized channel sequence number | Reliability or reliability sequence number |
|---|---|
| 4297 | 1967 |
| 4298 | 2021 |
| 4299 | 2403 |
| 4300 | 2081 |
| 4301 | 2457 |
| 4302 | 2535 |
| 4303 | 2933 |
| 4304 | 1695 |
| 4305 | 2066 |
| 4306 | 2122 |
| 4307 | 2492 |
| 4308 | 2207 |
| 4309 | 2581 |
| 4310 | 2658 |
| 4311 | 3072 |
| 4312 | 2249 |
| 4313 | 2679 |
| 4314 | 2756 |
| 4315 | 3137 |
| 4316 | 2835 |
| 4317 | 3244 |
| 4318 | 3306 |
| 4319 | 3802 |
| 4320 | 1783 |
| 4321 | 2168 |
| 4322 | 2228 |
| 4323 | 2611 |
| 4324 | 2340 |
| 4325 | 2702 |
| 4326 | 2768 |
| 4327 | 3192 |
| 4328 | 2447 |
| 4329 | 2796 |
| 4330 | 2873 |
| 4331 | 3280 |
| 4332 | 2965 |
| 4333 | 3318 |
| 4334 | 3460 |
| 4335 | 3943 |
| 4336 | 2532 |
| 4337 | 2906 |
| 4338 | 2996 |
| 4339 | 3393 |
| 4340 | 3033 |
| 4341 | 3505 |
| 4342 | 3568 |
| 4343 | 4064 |
| 4344 | 3204 |
| 4345 | 3601 |
| 4346 | 3671 |
| 4347 | 4039 |
| 4348 | 3743 |
| 4349 | 4167 |
| 4350 | 4328 |
| 4351 | 4836 |
| 4352 | 485 |
| 4353 | 681 |
| 4354 | 730 |
| 4355 | 1139 |
| 4356 | 812 |
| 4357 | 1164 |
| 4358 | 1238 |
| 4359 | 1622 |
| 4360 | 821 |
| 4361 | 1244 |
| 4362 | 1308 |
| 4363 | 1668 |
| 4364 | 1381 |
| 4365 | 1766 |
| 4366 | 1808 |
| 4367 | 2263 |
| 4368 | 935 |
| 4369 | 1314 |
| 4370 | 1386 |
| 4371 | 1825 |

TABLE Z1-continued with a sequence length of 8192:

| Polarized channel sequence number | Reliability or reliability sequence number |
|---|---|
| 4372 | 1460 |
| 4373 | 1859 |
| 4374 | 1915 |
| 4375 | 2266 |
| 4376 | 1506 |
| 4377 | 1907 |
| 4378 | 1986 |
| 4379 | 2380 |
| 4380 | 2070 |
| 4381 | 2444 |
| 4382 | 2476 |
| 4383 | 2868 |
| 4384 | 958 |
| 4385 | 1444 |
| 4386 | 1516 |
| 4387 | 1834 |
| 4388 | 1603 |
| 4389 | 1931 |
| 4390 | 2002 |
| 4391 | 2441 |
| 4392 | 1650 |
| 4393 | 2040 |
| 4394 | 2085 |
| 4395 | 2482 |
| 4396 | 2132 |
| 4397 | 2575 |
| 4398 | 2629 |
| 4399 | 3028 |
| 4400 | 1645 |
| 4401 | 2125 |
| 4402 | 2176 |
| 4403 | 2566 |
| 4404 | 2246 |
| 4405 | 2667 |
| 4406 | 2716 |
| 4407 | 3145 |
| 4408 | 2347 |
| 4409 | 2779 |
| 4410 | 2840 |
| 4411 | 3241 |
| 4412 | 2898 |
| 4413 | 3299 |
| 4414 | 3407 |
| 4415 | 3905 |
| 4416 | 1045 |
| 4417 | 1574 |
| 4418 | 1612 |
| 4419 | 2029 |
| 4420 | 1686 |
| 4421 | 2107 |
| 4422 | 2172 |
| 4423 | 2547 |
| 4424 | 1731 |
| 4425 | 2197 |
| 4426 | 2225 |
| 4427 | 2655 |
| 4428 | 2293 |
| 4429 | 2739 |
| 4430 | 2793 |
| 4431 | 3231 |
| 4432 | 1975 |
| 4433 | 2273 |
| 4434 | 2344 |
| 4435 | 2754 |
| 4436 | 2409 |
| 4437 | 2829 |
| 4438 | 2895 |
| 4439 | 3289 |
| 4440 | 2510 |
| 4441 | 2917 |
| 4442 | 3009 |
| 4443 | 3384 |
| 4444 | 3084 |
| 4445 | 3501 |
| 4446 | 3577 |

TABLE Z1-continued with a sequence length of 8192:

| Polarized channel sequence number | Reliability or reliability sequence number |
|---|---|
| 4447 | 4017 |
| 4448 | 2100 |
| 4449 | 2393 |
| 4450 | 2488 |
| 4451 | 2860 |
| 4452 | 2563 |
| 4453 | 2957 |
| 4454 | 3017 |
| 4455 | 3467 |
| 4456 | 2644 |
| 4457 | 3056 |
| 4458 | 3107 |
| 4459 | 3523 |
| 4460 | 3217 |
| 4461 | 3634 |
| 4462 | 3699 |
| 4463 | 4126 |
| 4464 | 2762 |
| 4465 | 3212 |
| 4466 | 3251 |
| 4467 | 3673 |
| 4468 | 3292 |
| 4469 | 3748 |
| 4470 | 3651 |
| 4471 | 4203 |
| 4472 | 3428 |
| 4473 | 3893 |
| 4474 | 3949 |
| 4475 | 4363 |
| 4476 | 3973 |
| 4477 | 4524 |
| 4478 | 4611 |
| 4479 | 4939 |
| 4480 | 1086 |
| 4481 | 1673 |
| 4482 | 1700 |
| 4483 | 2242 |
| 4484 | 1935 |
| 4485 | 2307 |
| 4486 | 2357 |
| 4487 | 2776 |
| 4488 | 2036 |
| 4489 | 2373 |
| 4490 | 2419 |
| 4491 | 2849 |
| 4492 | 2507 |
| 4493 | 2927 |
| 4494 | 3007 |
| 4495 | 3474 |
| 4496 | 2092 |
| 4497 | 2498 |
| 4498 | 2560 |
| 4499 | 2930 |
| 4500 | 2608 |
| 4501 | 3022 |
| 4502 | 3092 |
| 4503 | 3544 |
| 4504 | 2682 |
| 4505 | 3117 |
| 4506 | 3187 |
| 4507 | 3614 |
| 4508 | 3285 |
| 4509 | 3688 |
| 4510 | 3796 |
| 4511 | 4225 |
| 4512 | 2259 |
| 4513 | 2578 |
| 4514 | 2626 |
| 4515 | 3087 |
| 4516 | 2714 |
| 4517 | 3165 |
| 4518 | 3258 |
| 4519 | 3656 |
| 4520 | 2843 |
| 4521 | 3260 |

TABLE Z1-continued with a sequence length of 8192:

| Polarized channel sequence number | Reliability or reliability sequence number |
|---|---|
| 4522 | 3308 |
| 4523 | 3788 |
| 4524 | 3435 |
| 4525 | 3735 |
| 4526 | 3925 |
| 4527 | 4373 |
| 4528 | 2951 |
| 4529 | 3368 |
| 4530 | 3492 |
| 4531 | 3895 |
| 4532 | 3546 |
| 4533 | 3968 |
| 4534 | 4029 |
| 4535 | 4474 |
| 4536 | 3636 |
| 4537 | 4053 |
| 4538 | 4047 |
| 4539 | 4589 |
| 4540 | 4209 |
| 4541 | 4653 |
| 4542 | 4727 |
| 4543 | 5157 |
| 4544 | 2390 |
| 4545 | 2673 |
| 4546 | 2782 |
| 4547 | 3268 |
| 4548 | 2922 |
| 4549 | 3316 |
| 4550 | 3403 |
| 4551 | 3829 |
| 4552 | 3012 |
| 4553 | 3469 |
| 4554 | 3510 |
| 4555 | 3955 |
| 4556 | 3597 |
| 4557 | 3985 |
| 4558 | 4045 |
| 4559 | 4513 |
| 4560 | 3094 |
| 4561 | 3561 |
| 4562 | 3660 |
| 4563 | 4023 |
| 4564 | 3701 |
| 4565 | 4058 |
| 4566 | 4215 |
| 4567 | 4660 |
| 4568 | 3823 |
| 4569 | 4249 |
| 4570 | 4311 |
| 4571 | 4746 |
| 4572 | 4419 |
| 4573 | 4860 |
| 4574 | 4925 |
| 4575 | 5380 |
| 4576 | 3234 |
| 4577 | 3679 |
| 4578 | 3777 |
| 4579 | 4221 |
| 4580 | 3919 |
| 4581 | 4231 |
| 4582 | 4396 |
| 4583 | 4776 |
| 4584 | 3939 |
| 4585 | 4379 |
| 4586 | 4485 |
| 4587 | 4900 |
| 4588 | 4567 |
| 4589 | 4986 |
| 4590 | 5106 |
| 4591 | 5548 |
| 4592 | 3987 |
| 4593 | 4530 |
| 4594 | 4637 |
| 4595 | 5028 |
| 4596 | 4696 |

TABLE Z1-continued with a sequence length of 8192:

| Polarized channel sequence number | Reliability or reliability sequence number |
|---|---|
| 4597 | 5126 |
| 4598 | 5070 |
| 4599 | 5605 |
| 4600 | 4822 |
| 4601 | 5217 |
| 4602 | 5279 |
| 4603 | 5764 |
| 4604 | 5411 |
| 4605 | 5850 |
| 4606 | 5954 |
| 4607 | 6239 |
| 4608 | 573 |
| 4609 | 758 |
| 4610 | 838 |
| 4611 | 1202 |
| 4612 | 903 |
| 4613 | 1320 |
| 4614 | 1391 |
| 4615 | 1792 |
| 4616 | 950 |
| 4617 | 1413 |
| 4618 | 1465 |
| 4619 | 1821 |
| 4620 | 1531 |
| 4621 | 1899 |
| 4622 | 1920 |
| 4623 | 2422 |
| 4624 | 965 |
| 4625 | 1521 |
| 4626 | 1570 |
| 4627 | 1895 |
| 4628 | 1617 |
| 4629 | 2111 |
| 4630 | 2150 |
| 4631 | 2529 |
| 4632 | 1735 |
| 4633 | 2154 |
| 4634 | 2239 |
| 4635 | 2646 |
| 4636 | 2304 |
| 4637 | 2722 |
| 4638 | 2788 |
| 4639 | 3277 |
| 4640 | 980 |
| 4641 | 1598 |
| 4642 | 1677 |
| 4643 | 2129 |
| 4644 | 1744 |
| 4645 | 2232 |
| 4646 | 2280 |
| 4647 | 2696 |
| 4648 | 1796 |
| 4649 | 2324 |
| 4650 | 2367 |
| 4651 | 2802 |
| 4652 | 2428 |
| 4653 | 2882 |
| 4654 | 2944 |
| 4655 | 3323 |
| 4656 | 1850 |
| 4657 | 2399 |
| 4658 | 2470 |
| 4659 | 2914 |
| 4660 | 2550 |
| 4661 | 2999 |
| 4662 | 3048 |
| 4663 | 3449 |
| 4664 | 2584 |
| 4665 | 3030 |
| 4666 | 3122 |
| 4667 | 3555 |
| 4668 | 3135 |
| 4669 | 3612 |
| 4670 | 3684 |
| 4671 | 4340 |

TABLE Z1-continued with a sequence length of 8192:

| Polarized channel sequence number | Reliability or reliability sequence number |
|---|---|
| 4672 | 1256 |
| 4673 | 1740 |
| 4674 | 1779 |
| 4675 | 2297 |
| 4676 | 1830 |
| 4677 | 2370 |
| 4678 | 2425 |
| 4679 | 2857 |
| 4680 | 1947 |
| 4681 | 2479 |
| 4682 | 2513 |
| 4683 | 2978 |
| 4684 | 2596 |
| 4685 | 3064 |
| 4686 | 3115 |
| 4687 | 3483 |
| 4688 | 2025 |
| 4689 | 2526 |
| 4690 | 2623 |
| 4691 | 3041 |
| 4692 | 2690 |
| 4693 | 3130 |
| 4694 | 3152 |
| 4695 | 3584 |
| 4696 | 2751 |
| 4697 | 3157 |
| 4698 | 3185 |
| 4699 | 3692 |
| 4700 | 3365 |
| 4701 | 3754 |
| 4702 | 3872 |
| 4703 | 4377 |
| 4704 | 2096 |
| 4705 | 2688 |
| 4706 | 2731 |
| 4707 | 3177 |
| 4708 | 2821 |
| 4709 | 3253 |
| 4710 | 3270 |
| 4711 | 3720 |
| 4712 | 2892 |
| 4713 | 3358 |
| 4714 | 3416 |
| 4715 | 3821 |
| 4716 | 3521 |
| 4717 | 3911 |
| 4718 | 3959 |
| 4719 | 4491 |
| 4720 | 2975 |
| 4721 | 3458 |
| 4722 | 3552 |
| 4723 | 3963 |
| 4724 | 3643 |
| 4725 | 4011 |
| 4726 | 4139 |
| 4727 | 4573 |
| 4728 | 3773 |
| 4729 | 4155 |
| 4730 | 4255 |
| 4731 | 4667 |
| 4732 | 4316 |
| 4733 | 4766 |
| 4734 | 4872 |
| 4735 | 5363 |
| 4736 | 1280 |
| 4737 | 1817 |
| 4738 | 1903 |
| 4739 | 2463 |
| 4740 | 2013 |
| 4741 | 2516 |
| 4742 | 2605 |
| 4743 | 3077 |
| 4744 | 2074 |
| 4745 | 2635 |
| 4746 | 2699 |

TABLE Z1-continued with a sequence length of 8192:

| Polarized channel sequence number | Reliability or reliability sequence number |
|---|---|
| 4747 | 3162 |
| 4748 | 2765 |
| 4749 | 3202 |
| 4750 | 3222 |
| 4751 | 3707 |
| 4752 | 2193 |
| 4753 | 2737 |
| 4754 | 2818 |
| 4755 | 3226 |
| 4756 | 2887 |
| 4757 | 3344 |
| 4758 | 3400 |
| 4759 | 3804 |
| 4760 | 2967 |
| 4761 | 3439 |
| 4762 | 3514 |
| 4763 | 3935 |
| 4764 | 3588 |
| 4765 | 3993 |
| 4766 | 4088 |
| 4767 | 4496 |
| 4768 | 2283 |
| 4769 | 2854 |
| 4770 | 2941 |
| 4771 | 3412 |
| 4772 | 3054 |
| 4773 | 3499 |
| 4774 | 3490 |
| 4775 | 3999 |
| 4776 | 3100 |
| 4777 | 3566 |
| 4778 | 3606 |
| 4779 | 4068 |
| 4780 | 3726 |
| 4781 | 4145 |
| 4782 | 4189 |
| 4783 | 4678 |
| 4784 | 3195 |
| 4785 | 3647 |
| 4786 | 3762 |
| 4787 | 4173 |
| 4788 | 3810 |
| 4789 | 4283 |
| 4790 | 4322 |
| 4791 | 4781 |
| 4792 | 3887 |
| 4793 | 4369 |
| 4794 | 4442 |
| 4795 | 4905 |
| 4796 | 4584 |
| 4797 | 5000 |
| 4798 | 5113 |
| 4799 | 5557 |
| 4800 | 2354 |
| 4801 | 2989 |
| 4802 | 3061 |
| 4803 | 3575 |
| 4804 | 3147 |
| 4805 | 3627 |
| 4806 | 3729 |
| 4807 | 4161 |
| 4808 | 3335 |
| 4809 | 3769 |
| 4810 | 3844 |
| 4811 | 4301 |
| 4812 | 3856 |
| 4813 | 4334 |
| 4814 | 4407 |
| 4815 | 4851 |
| 4816 | 3372 |
| 4817 | 3848 |
| 4818 | 3881 |
| 4819 | 4390 |
| 4820 | 4003 |
| 4821 | 4436 |

TABLE Z1-continued with a sequence length of 8192:

| Polarized channel sequence number | Reliability or reliability sequence number |
|---|---|
| 4822 | 4547 |
| 4823 | 4981 |
| 4824 | 4112 |
| 4825 | 4578 |
| 4826 | 4631 |
| 4827 | 5033 |
| 4828 | 4721 |
| 4829 | 5167 |
| 4830 | 5239 |
| 4831 | 5634 |
| 4832 | 3444 |
| 4833 | 4033 |
| 4834 | 4080 |
| 4835 | 4502 |
| 4836 | 4191 |
| 4837 | 4595 |
| 4838 | 4648 |
| 4839 | 5085 |
| 4840 | 4261 |
| 4841 | 4709 |
| 4842 | 4790 |
| 4843 | 5212 |
| 4844 | 4881 |
| 4845 | 5289 |
| 4846 | 5394 |
| 4847 | 5796 |
| 4848 | 4453 |
| 4849 | 4803 |
| 4850 | 4913 |
| 4851 | 5314 |
| 4852 | 5015 |
| 4853 | 5428 |
| 4854 | 5476 |
| 4855 | 5931 |
| 4856 | 5093 |
| 4857 | 5519 |
| 4858 | 5596 |
| 4859 | 5990 |
| 4860 | 5705 |
| 4861 | 6094 |
| 4862 | 6223 |
| 4863 | 6606 |
| 4864 | 1375 |
| 4865 | 1951 |
| 4866 | 2044 |
| 4867 | 2638 |
| 4868 | 2179 |
| 4869 | 2725 |
| 4870 | 2804 |
| 4871 | 3297 |
| 4872 | 2221 |
| 4873 | 2832 |
| 4874 | 2909 |
| 4875 | 3353 |
| 4876 | 2983 |
| 4877 | 3426 |
| 4878 | 3537 |
| 4879 | 4094 |
| 4880 | 2330 |
| 4881 | 2949 |
| 4882 | 3074 |
| 4883 | 3478 |
| 4884 | 3127 |
| 4885 | 3623 |
| 4886 | 3592 |
| 4887 | 4124 |
| 4888 | 3170 |
| 4889 | 3664 |
| 4890 | 3741 |
| 4891 | 4243 |
| 4892 | 3835 |
| 4893 | 4289 |
| 4894 | 4351 |
| 4895 | 4827 |
| 4896 | 2556 |

TABLE Z1-continued with a sequence length of 8192:

| Polarized channel sequence number | Reliability or reliability sequence number |
|---|---|
| 4897 | 3105 |
| 4898 | 3175 |
| 4899 | 3621 |
| 4900 | 3332 |
| 4901 | 3716 |
| 4902 | 3781 |
| 4903 | 4307 |
| 4904 | 3351 |
| 4905 | 3837 |
| 4906 | 3868 |
| 4907 | 4357 |
| 4908 | 3917 |
| 4909 | 4413 |
| 4910 | 4470 |
| 4911 | 4953 |
| 4912 | 3377 |
| 4913 | 3901 |
| 4914 | 3979 |
| 4915 | 4464 |
| 4916 | 4106 |
| 4917 | 4541 |
| 4918 | 4617 |
| 4919 | 5042 |
| 4920 | 4177 |
| 4921 | 4691 |
| 4922 | 4716 |
| 4923 | 5172 |
| 4924 | 4796 |
| 4925 | 5249 |
| 4926 | 5336 |
| 4927 | 5743 |
| 4928 | 2590 |
| 4929 | 3328 |
| 4930 | 3342 |
| 4931 | 3815 |
| 4932 | 3382 |
| 4933 | 3854 |
| 4934 | 3929 |
| 4935 | 4430 |
| 4936 | 3451 |
| 4937 | 4009 |
| 4938 | 4074 |
| 4939 | 4519 |
| 4940 | 4149 |
| 4941 | 4600 |
| 4942 | 4703 |
| 4943 | 5144 |
| 4944 | 3756 |
| 4945 | 4102 |
| 4946 | 4197 |
| 4947 | 4626 |
| 4948 | 4265 |
| 4949 | 4751 |
| 4950 | 4808 |
| 4951 | 5225 |
| 4952 | 4425 |
| 4953 | 4817 |
| 4954 | 4919 |
| 4955 | 5319 |
| 4956 | 5020 |
| 4957 | 5421 |
| 4958 | 5467 |
| 4959 | 5919 |
| 4960 | 3862 |
| 4961 | 4277 |
| 4962 | 4384 |
| 4963 | 4757 |
| 4964 | 4459 |
| 4965 | 4891 |
| 4966 | 4966 |
| 4967 | 5354 |
| 4968 | 4562 |
| 4969 | 4991 |
| 4970 | 5057 |
| 4971 | 5458 |

TABLE Z1-continued with a sequence length of 8192:

| Polarized channel sequence number | Reliability or reliability sequence number |
|---|---|
| 4972 | 5136 |
| 4973 | 5528 |
| 4974 | 5626 |
| 4975 | 6028 |
| 4976 | 4642 |
| 4977 | 5098 |
| 4978 | 5190 |
| 4979 | 5587 |
| 4980 | 5275 |
| 4981 | 5655 |
| 4982 | 5738 |
| 4983 | 6122 |
| 4984 | 5371 |
| 4985 | 5775 |
| 4986 | 5839 |
| 4987 | 6195 |
| 4988 | 5896 |
| 4989 | 6325 |
| 4990 | 6356 |
| 4991 | 6839 |
| 4992 | 2614 |
| 4993 | 3391 |
| 4994 | 3419 |
| 4995 | 4082 |
| 4996 | 3712 |
| 4997 | 4132 |
| 4998 | 4183 |
| 4999 | 4684 |
| 5000 | 3790 |
| 5001 | 4237 |
| 5002 | 4295 |
| 5003 | 4771 |
| 5004 | 4402 |
| 5005 | 4846 |
| 5006 | 4944 |
| 5007 | 5346 |
| 5008 | 3876 |
| 5009 | 4346 |
| 5010 | 4447 |
| 5011 | 4865 |
| 5012 | 4508 |
| 5013 | 4973 |
| 5014 | 5062 |
| 5015 | 5447 |
| 5016 | 4606 |
| 5017 | 5121 |
| 5018 | 5048 |
| 5019 | 5502 |
| 5020 | 5235 |
| 5021 | 5614 |
| 5022 | 5697 |
| 5023 | 6067 |
| 5024 | 4118 |
| 5025 | 4479 |
| 5026 | 4536 |
| 5027 | 5007 |
| 5028 | 4673 |
| 5029 | 5077 |
| 5030 | 5180 |
| 5031 | 5566 |
| 5032 | 4741 |
| 5033 | 5194 |
| 5034 | 5265 |
| 5035 | 5664 |
| 5036 | 5328 |
| 5037 | 5717 |
| 5038 | 5807 |
| 5039 | 6180 |
| 5040 | 4886 |
| 5041 | 5297 |
| 5042 | 5388 |
| 5043 | 5755 |
| 5044 | 5484 |
| 5045 | 5862 |
| 5046 | 5907 |

TABLE Z1-continued with a sequence length of 8192:

| Polarized channel sequence number | Reliability or reliability sequence number |
|---|---|
| 5047 | 6289 |
| 5048 | 5540 |
| 5049 | 5978 |
| 5050 | 6017 |
| 5051 | 6396 |
| 5052 | 6107 |
| 5053 | 6452 |
| 5054 | 6495 |
| 5055 | 6743 |
| 5056 | 4271 |
| 5057 | 4556 |
| 5058 | 4735 |
| 5059 | 5203 |
| 5060 | 4841 |
| 5061 | 5257 |
| 5062 | 5305 |
| 5063 | 5726 |
| 5064 | 4932 |
| 5065 | 5404 |
| 5066 | 5438 |
| 5067 | 5830 |
| 5068 | 5510 |
| 5069 | 5873 |
| 5070 | 6002 |
| 5071 | 6340 |
| 5072 | 4958 |
| 5073 | 5493 |
| 5074 | 5575 |
| 5075 | 5967 |
| 5076 | 5685 |
| 5077 | 6040 |
| 5078 | 6053 |
| 5079 | 6472 |
| 5080 | 5787 |
| 5081 | 6137 |
| 5082 | 6164 |
| 5083 | 6516 |
| 5084 | 6258 |
| 5085 | 6634 |
| 5086 | 6684 |
| 5087 | 7039 |
| 5088 | 5149 |
| 5089 | 5646 |
| 5090 | 5676 |
| 5091 | 6079 |
| 5092 | 5819 |
| 5093 | 6149 |
| 5094 | 6211 |
| 5095 | 6561 |
| 5096 | 5885 |
| 5097 | 6274 |
| 5098 | 6305 |
| 5099 | 6659 |
| 5100 | 6415 |
| 5101 | 6713 |
| 5102 | 6874 |
| 5103 | 7148 |
| 5104 | 5943 |
| 5105 | 6376 |
| 5106 | 6432 |
| 5107 | 6774 |
| 5108 | 6536 |
| 5109 | 6803 |
| 5110 | 6909 |
| 5111 | 7209 |
| 5112 | 6585 |
| 5113 | 6950 |
| 5114 | 6992 |
| 5115 | 7284 |
| 5116 | 7088 |
| 5117 | 7371 |
| 5118 | 7488 |
| 5119 | 7655 |
| 5120 | 296 |
| 5121 | 691 |

TABLE Z1-continued with a sequence length of 8192:

| Polarized channel sequence number | Reliability or reliability sequence number |
|---|---|
| 5122 | 919 |
| 5123 | 1418 |
| 5124 | 1065 |
| 5125 | 1480 |
| 5126 | 1640 |
| 5127 | 2089 |
| 5128 | 1171 |
| 5129 | 1589 |
| 5130 | 1726 |
| 5131 | 2190 |
| 5132 | 1842 |
| 5133 | 2300 |
| 5134 | 2337 |
| 5135 | 2946 |
| 5136 | 1268 |
| 5137 | 1691 |
| 5138 | 1770 |
| 5139 | 2276 |
| 5140 | 1943 |
| 5141 | 2396 |
| 5142 | 2553 |
| 5143 | 2994 |
| 5144 | 2032 |
| 5145 | 2538 |
| 5146 | 2473 |
| 5147 | 3069 |
| 5148 | 2705 |
| 5149 | 3150 |
| 5150 | 3207 |
| 5151 | 3690 |
| 5152 | 1353 |
| 5153 | 1879 |
| 5154 | 2006 |
| 5155 | 2435 |
| 5156 | 2059 |
| 5157 | 2523 |
| 5158 | 2620 |
| 5159 | 3089 |
| 5160 | 2211 |
| 5161 | 2676 |
| 5162 | 2734 |
| 5163 | 3160 |
| 5164 | 2890 |
| 5165 | 3273 |
| 5166 | 3320 |
| 5167 | 3794 |
| 5168 | 2317 |
| 5169 | 2759 |
| 5170 | 2925 |
| 5171 | 3304 |
| 5172 | 2981 |
| 5173 | 3379 |
| 5174 | 3456 |
| 5175 | 3864 |
| 5176 | 3059 |
| 5177 | 3471 |
| 5178 | 3548 |
| 5179 | 4001 |
| 5180 | 3586 |
| 5181 | 4060 |
| 5182 | 4169 |
| 5183 | 4682 |
| 5184 | 1540 |
| 5185 | 1911 |
| 5186 | 2136 |
| 5187 | 2661 |
| 5188 | 2235 |
| 5189 | 2719 |
| 5190 | 2876 |
| 5191 | 3229 |
| 5192 | 2360 |
| 5193 | 2938 |
| 5194 | 2773 |
| 5195 | 3330 |
| 5196 | 3025 |

TABLE Z1-continued

| with a sequence length of 8192: | |
|---|---|
| Polarized channel sequence number | Reliability or reliability sequence number |
| 5197 | 3405 |
| 5198 | 3503 |
| 5199 | 3909 |
| 5200 | 2504 |
| 5201 | 2911 |
| 5202 | 3046 |
| 5203 | 3462 |
| 5204 | 3110 |
| 5205 | 3526 |
| 5206 | 3581 |
| 5207 | 4037 |
| 5208 | 3190 |
| 5209 | 3603 |
| 5210 | 3703 |
| 5211 | 4120 |
| 5212 | 3785 |
| 5213 | 4207 |
| 5214 | 4287 |
| 5215 | 4832 |
| 5216 | 2649 |
| 5217 | 3079 |
| 5218 | 3172 |
| 5219 | 3572 |
| 5220 | 3282 |
| 5221 | 3645 |
| 5222 | 3752 |
| 5223 | 4187 |
| 5224 | 3361 |
| 5225 | 3760 |
| 5226 | 3860 |
| 5227 | 4251 |
| 5228 | 3921 |
| 5229 | 4359 |
| 5230 | 4438 |
| 5231 | 4956 |
| 5232 | 3485 |
| 5233 | 3897 |
| 5234 | 4019 |
| 5235 | 4388 |
| 5236 | 4051 |
| 5237 | 4444 |
| 5238 | 4545 |
| 5239 | 5053 |
| 5240 | 4153 |
| 5241 | 4576 |
| 5242 | 4657 |
| 5243 | 5129 |
| 5244 | 4732 |
| 5245 | 5198 |
| 5246 | 5311 |
| 5247 | 5825 |
| 5248 | 1804 |
| 5249 | 2114 |
| 5250 | 2256 |
| 5251 | 2903 |
| 5252 | 2415 |
| 5253 | 2973 |
| 5254 | 3002 |
| 5255 | 3494 |
| 5256 | 2572 |
| 5257 | 3038 |
| 5258 | 3120 |
| 5259 | 3564 |
| 5260 | 3200 |
| 5261 | 3640 |
| 5262 | 3669 |
| 5263 | 4181 |
| 5264 | 2693 |
| 5265 | 3132 |
| 5266 | 3219 |
| 5267 | 3653 |
| 5268 | 3311 |
| 5269 | 3745 |
| 5270 | 3840 |
| 5271 | 4263 |

TABLE Z1-continued

| with a sequence length of 8192: | |
|---|---|
| Polarized channel sequence number | Reliability or reliability sequence number |
| 5272 | 3396 |
| 5273 | 3846 |
| 5274 | 3903 |
| 5275 | 4332 |
| 5276 | 4031 |
| 5277 | 4421 |
| 5278 | 4523 |
| 5279 | 5017 |
| 5280 | 2799 |
| 5281 | 3256 |
| 5282 | 3370 |
| 5283 | 3779 |
| 5284 | 3414 |
| 5285 | 3852 |
| 5286 | 3941 |
| 5287 | 4394 |
| 5288 | 3557 |
| 5289 | 4007 |
| 5290 | 4055 |
| 5291 | 4455 |
| 5292 | 4147 |
| 5293 | 4571 |
| 5294 | 4629 |
| 5295 | 5124 |
| 5296 | 3662 |
| 5297 | 4104 |
| 5298 | 4195 |
| 5299 | 4598 |
| 5300 | 4257 |
| 5301 | 4712 |
| 5302 | 4743 |
| 5303 | 5186 |
| 5304 | 4365 |
| 5305 | 4789 |
| 5306 | 4896 |
| 5307 | 5283 |
| 5308 | 4975 |
| 5309 | 5366 |
| 5310 | 5534 |
| 5311 | 5827 |
| 5312 | 2851 |
| 5313 | 3389 |
| 5314 | 3517 |
| 5315 | 3957 |
| 5316 | 3632 |
| 5317 | 4041 |
| 5318 | 4141 |
| 5319 | 4587 |
| 5320 | 3697 |
| 5321 | 4159 |
| 5322 | 4217 |
| 5323 | 4676 |
| 5324 | 4291 |
| 5325 | 4737 |
| 5326 | 4831 |
| 5327 | 5254 |
| 5328 | 3827 |
| 5329 | 4269 |
| 5330 | 4338 |
| 5331 | 4780 |
| 5332 | 4449 |
| 5333 | 4877 |
| 5334 | 4964 |
| 5335 | 5391 |
| 5336 | 4500 |
| 5337 | 4983 |
| 5338 | 5068 |
| 5339 | 5461 |
| 5340 | 5152 |
| 5341 | 5563 |
| 5342 | 5623 |
| 5343 | 6056 |
| 5344 | 3933 |
| 5345 | 4400 |
| 5346 | 4472 |

TABLE Z1-continued with a sequence length of 8192:

| Polarized channel sequence number | Reliability or reliability sequence number |
|---|---|
| 5347 | 4910 |
| 5348 | 4604 |
| 5349 | 5012 |
| 5350 | 5082 |
| 5351 | 5513 |
| 5352 | 4728 |
| 5353 | 5110 |
| 5354 | 5191 |
| 5355 | 5599 |
| 5356 | 5286 |
| 5357 | 5637 |
| 5358 | 5767 |
| 5359 | 6171 |
| 5360 | 4824 |
| 5361 | 5223 |
| 5362 | 5317 |
| 5363 | 5708 |
| 5364 | 5357 |
| 5365 | 5804 |
| 5366 | 5859 |
| 5367 | 6263 |
| 5368 | 5525 |
| 5369 | 5887 |
| 5370 | 5946 |
| 5371 | 6245 |
| 5372 | 6007 |
| 5373 | 6338 |
| 5374 | 6455 |
| 5375 | 6815 |
| 5376 | 1979 |
| 5377 | 2377 |
| 5378 | 2454 |
| 5379 | 3102 |
| 5380 | 2587 |
| 5381 | 3142 |
| 5382 | 3239 |
| 5383 | 3737 |
| 5384 | 2602 |
| 5385 | 3246 |
| 5386 | 3339 |
| 5387 | 3798 |
| 5388 | 3433 |
| 5389 | 3913 |
| 5390 | 3965 |
| 5391 | 4511 |
| 5392 | 2785 |
| 5393 | 3346 |
| 5394 | 3437 |
| 5395 | 3981 |
| 5396 | 3535 |
| 5397 | 4025 |
| 5398 | 4090 |
| 5399 | 4517 |
| 5400 | 3595 |
| 5401 | 4086 |
| 5402 | 4175 |
| 5403 | 4651 |
| 5404 | 4275 |
| 5405 | 4723 |
| 5406 | 4760 |
| 5407 | 5183 |
| 5408 | 2824 |
| 5409 | 3512 |
| 5410 | 3608 |
| 5411 | 3995 |
| 5412 | 3718 |
| 5413 | 4110 |
| 5414 | 4201 |
| 5415 | 4718 |
| 5416 | 3771 |
| 5417 | 4241 |
| 5418 | 4297 |
| 5419 | 4767 |
| 5420 | 4353 |
| 5421 | 4869 |

TABLE Z1-continued with a sequence length of 8192:

| Polarized channel sequence number | Reliability or reliability sequence number |
|---|---|
| 5422 | 4930 |
| 5423 | 5349 |
| 5424 | 3764 |
| 5425 | 4342 |
| 5426 | 4409 |
| 5427 | 4863 |
| 5428 | 4495 |
| 5429 | 4970 |
| 5430 | 5025 |
| 5431 | 5464 |
| 5432 | 4615 |
| 5433 | 5090 |
| 5434 | 5155 |
| 5435 | 5560 |
| 5436 | 5220 |
| 5437 | 5620 |
| 5438 | 5720 |
| 5439 | 6139 |
| 5440 | 2959 |
| 5441 | 3682 |
| 5442 | 3724 |
| 5443 | 4229 |
| 5444 | 3819 |
| 5445 | 4320 |
| 5446 | 4405 |
| 5447 | 4837 |
| 5448 | 3870 |
| 5449 | 4432 |
| 5450 | 4466 |
| 5451 | 4961 |
| 5452 | 4550 |
| 5453 | 5050 |
| 5454 | 5105 |
| 5455 | 5551 |
| 5456 | 4163 |
| 5457 | 4528 |
| 5458 | 4609 |
| 5459 | 5065 |
| 5460 | 4687 |
| 5461 | 5141 |
| 5462 | 5214 |
| 5463 | 5608 |
| 5464 | 4799 |
| 5465 | 5238 |
| 5466 | 5332 |
| 5467 | 5700 |
| 5468 | 5407 |
| 5469 | 5802 |
| 5470 | 5868 |
| 5471 | 6230 |
| 5472 | 4314 |
| 5473 | 4666 |
| 5474 | 4774 |
| 5475 | 5178 |
| 5476 | 4858 |
| 5477 | 5276 |
| 5478 | 5339 |
| 5479 | 5770 |
| 5480 | 4948 |
| 5481 | 5377 |
| 5482 | 5431 |
| 5483 | 5822 |
| 5484 | 5537 |
| 5485 | 5913 |
| 5486 | 5969 |
| 5487 | 6311 |
| 5488 | 5073 |
| 5489 | 5531 |
| 5490 | 5569 |
| 5491 | 5948 |
| 5492 | 5611 |
| 5493 | 6010 |
| 5494 | 5929 |
| 5495 | 6367 |
| 5496 | 5739 |

TABLE Z1-continued

| with a sequence length of 8192: | |
|---|---|
| Polarized channel sequence number | Reliability or reliability sequence number |
| 5497 | 6127 |
| 5498 | 6173 |
| 5499 | 6479 |
| 5500 | 6192 |
| 5501 | 6599 |
| 5502 | 6663 |
| 5503 | 6886 |
| 5504 | 3015 |
| 5505 | 3806 |
| 5506 | 3831 |
| 5507 | 4489 |
| 5508 | 4116 |
| 5509 | 4565 |
| 5510 | 4624 |
| 5511 | 5087 |
| 5512 | 4235 |
| 5513 | 4646 |
| 5514 | 4693 |
| 5515 | 5164 |
| 5516 | 4794 |
| 5517 | 5246 |
| 5518 | 5325 |
| 5519 | 5778 |
| 5520 | 4303 |
| 5521 | 4785 |
| 5522 | 4855 |
| 5523 | 5251 |
| 5524 | 4908 |
| 5525 | 5343 |
| 5526 | 5414 |
| 5527 | 5836 |
| 5528 | 4990 |
| 5529 | 5441 |
| 5530 | 5508 |
| 5531 | 5899 |
| 5532 | 5602 |
| 5533 | 5961 |
| 5534 | 6049 |
| 5535 | 6382 |
| 5536 | 4506 |
| 5537 | 4874 |
| 5538 | 4927 |
| 5539 | 5408 |
| 5540 | 5023 |
| 5541 | 5487 |
| 5542 | 5578 |
| 5543 | 5934 |
| 5544 | 5160 |
| 5545 | 5581 |
| 5546 | 5629 |
| 5547 | 6043 |
| 5548 | 5741 |
| 5549 | 5999 |
| 5550 | 6156 |
| 5551 | 6485 |
| 5552 | 5271 |
| 5553 | 5682 |
| 5554 | 5793 |
| 5555 | 6131 |
| 5556 | 5842 |
| 5557 | 6190 |
| 5558 | 6235 |
| 5559 | 6563 |
| 5560 | 5916 |
| 5561 | 6254 |
| 5562 | 6251 |
| 5563 | 6644 |
| 5564 | 6369 |
| 5565 | 6692 |
| 5566 | 6739 |
| 5567 | 7026 |
| 5568 | 4662 |
| 5569 | 4978 |
| 5570 | 5096 |
| 5571 | 5584 |

TABLE Z1-continued

| with a sequence length of 8192: | |
|---|---|
| Polarized channel sequence number | Reliability or reliability sequence number |
| 5572 | 5243 |
| 5573 | 5631 |
| 5574 | 5714 |
| 5575 | 6076 |
| 5576 | 5335 |
| 5577 | 5773 |
| 5578 | 5810 |
| 5579 | 6177 |
| 5580 | 5882 |
| 5581 | 6202 |
| 5582 | 6249 |
| 5583 | 6591 |
| 5584 | 5417 |
| 5585 | 5853 |
| 5586 | 5937 |
| 5587 | 6233 |
| 5588 | 5972 |
| 5589 | 6261 |
| 5590 | 6373 |
| 5591 | 6696 |
| 5592 | 6074 |
| 5593 | 6399 |
| 5594 | 6442 |
| 5595 | 6754 |
| 5596 | 6522 |
| 5597 | 6830 |
| 5598 | 6878 |
| 5599 | 7166 |
| 5600 | 5554 |
| 5601 | 5951 |
| 5602 | 6035 |
| 5603 | 6380 |
| 5604 | 6152 |
| 5605 | 6386 |
| 5606 | 6506 |
| 5607 | 6777 |
| 5608 | 6168 |
| 5609 | 6492 |
| 5610 | 6571 |
| 5611 | 6858 |
| 5612 | 6627 |
| 5613 | 6918 |
| 5614 | 6997 |
| 5615 | 7263 |
| 5616 | 6204 |
| 5617 | 6603 |
| 5618 | 6677 |
| 5619 | 6942 |
| 5620 | 6720 |
| 5621 | 7009 |
| 5622 | 6972 |
| 5623 | 7300 |
| 5624 | 6807 |
| 5625 | 7066 |
| 5626 | 7106 |
| 5627 | 7392 |
| 5628 | 7185 |
| 5629 | 7439 |
| 5630 | 7501 |
| 5631 | 7646 |
| 5632 | 2165 |
| 5633 | 2485 |
| 5634 | 2632 |
| 5635 | 3180 |
| 5636 | 2745 |
| 5637 | 3356 |
| 5638 | 3446 |
| 5639 | 3947 |
| 5640 | 2813 |
| 5641 | 3481 |
| 5642 | 3541 |
| 5643 | 3977 |
| 5644 | 3625 |
| 5645 | 4072 |
| 5646 | 4098 |

TABLE Z1-continued

| with a sequence length of 8192: | |
|---|---|
| Polarized channel sequence number | Reliability or reliability sequence number |
| 5647 | 4698 |
| 5648 | 2838 |
| 5649 | 3616 |
| 5650 | 3675 |
| 5651 | 4066 |
| 5652 | 3733 |
| 5653 | 4326 |
| 5654 | 4371 |
| 5655 | 4818 |
| 5656 | 3879 |
| 5657 | 4382 |
| 5658 | 4483 |
| 5659 | 4949 |
| 5660 | 4560 |
| 5661 | 5032 |
| 5662 | 5101 |
| 5663 | 5593 |
| 5664 | 2862 |
| 5665 | 3709 |
| 5666 | 3813 |
| 5667 | 4348 |
| 5668 | 3889 |
| 5669 | 4478 |
| 5670 | 4534 |
| 5671 | 5003 |
| 5672 | 3951 |
| 5673 | 4582 |
| 5674 | 4635 |
| 5675 | 5116 |
| 5676 | 4707 |
| 5677 | 5201 |
| 5678 | 5263 |
| 5679 | 5640 |
| 5680 | 4015 |
| 5681 | 4671 |
| 5682 | 4755 |
| 5683 | 5231 |
| 5684 | 4844 |
| 5685 | 5322 |
| 5686 | 5368 |
| 5687 | 5752 |
| 5688 | 4882 |
| 5689 | 5350 |
| 5690 | 5444 |
| 5691 | 5848 |
| 5692 | 5455 |
| 5693 | 5893 |
| 5694 | 5957 |
| 5695 | 6462 |
| 5696 | 3265 |
| 5697 | 3885 |
| 5698 | 3927 |
| 5699 | 4552 |
| 5700 | 3989 |
| 5701 | 4640 |
| 5702 | 4702 |
| 5703 | 5175 |
| 5704 | 4130 |
| 5705 | 4762 |
| 5706 | 4804 |
| 5707 | 5300 |
| 5708 | 4895 |
| 5709 | 5386 |
| 5710 | 5434 |
| 5711 | 5784 |
| 5712 | 4223 |
| 5713 | 4813 |
| 5714 | 4922 |
| 5715 | 5360 |
| 5716 | 4998 |
| 5717 | 5451 |
| 5718 | 5473 |
| 5719 | 5870 |
| 5720 | 5058 |
| 5721 | 5478 |

TABLE Z1-continued

| with a sequence length of 8192: | |
|---|---|
| Polarized channel sequence number | Reliability or reliability sequence number |
| 5722 | 5505 |
| 5723 | 5964 |
| 5724 | 5679 |
| 5725 | 6014 |
| 5726 | 6112 |
| 5727 | 6489 |
| 5728 | 4309 |
| 5729 | 4995 |
| 5730 | 5040 |
| 5731 | 5499 |
| 5732 | 5138 |
| 5733 | 5572 |
| 5734 | 5590 |
| 5735 | 5986 |
| 5736 | 5209 |
| 5737 | 5673 |
| 5738 | 5729 |
| 5739 | 6071 |
| 5740 | 5816 |
| 5741 | 6143 |
| 5742 | 6183 |
| 5743 | 6575 |
| 5744 | 5294 |
| 5745 | 5761 |
| 5746 | 5845 |
| 5747 | 6186 |
| 5748 | 5923 |
| 5749 | 6226 |
| 5750 | 6318 |
| 5751 | 6630 |
| 5752 | 6031 |
| 5753 | 6331 |
| 5754 | 6402 |
| 5755 | 6699 |
| 5756 | 6445 |
| 5757 | 6766 |
| 5758 | 6842 |
| 5759 | 7157 |
| 5760 | 3294 |
| 5761 | 3971 |
| 5762 | 4076 |
| 5763 | 4748 |
| 5764 | 4211 |
| 5765 | 4810 |
| 5766 | 4903 |
| 5767 | 5400 |
| 5768 | 4281 |
| 5769 | 4936 |
| 5770 | 5008 |
| 5771 | 5481 |
| 5772 | 5078 |
| 5773 | 5522 |
| 5774 | 5543 |
| 5775 | 5975 |
| 5776 | 4426 |
| 5777 | 5045 |
| 5778 | 5133 |
| 5779 | 5546 |
| 5780 | 5206 |
| 5781 | 5661 |
| 5782 | 5711 |
| 5783 | 6058 |
| 5784 | 5291 |
| 5785 | 5746 |
| 5786 | 5813 |
| 5787 | 6161 |
| 5788 | 5876 |
| 5789 | 6207 |
| 5790 | 6283 |
| 5791 | 6577 |
| 5792 | 4539 |
| 5793 | 5168 |
| 5794 | 5260 |
| 5795 | 5723 |
| 5796 | 5374 |

TABLE Z1-continued

| with a sequence length of 8192: | |
|---|---|
| Polarized channel sequence number | Reliability or reliability sequence number |
| 5797 | 5799 |
| 5798 | 5790 |
| 5799 | 6214 |
| 5800 | 5424 |
| 5801 | 5856 |
| 5802 | 5890 |
| 5803 | 6267 |
| 5804 | 5993 |
| 5805 | 6321 |
| 5806 | 6354 |
| 5807 | 6707 |
| 5808 | 5516 |
| 5809 | 5926 |
| 5810 | 6022 |
| 5811 | 6343 |
| 5812 | 6061 |
| 5813 | 6422 |
| 5814 | 6449 |
| 5815 | 6781 |
| 5816 | 6124 |
| 5817 | 6483 |
| 5818 | 6540 |
| 5819 | 6862 |
| 5820 | 6642 |
| 5821 | 6926 |
| 5822 | 7000 |
| 5823 | 7269 |
| 5824 | 4620 |
| 5825 | 5308 |
| 5826 | 5383 |
| 5827 | 5865 |
| 5828 | 5470 |
| 5829 | 5910 |
| 5830 | 5996 |
| 5831 | 6334 |
| 5832 | 5652 |
| 5833 | 6025 |
| 5834 | 6089 |
| 5835 | 6435 |
| 5836 | 6101 |
| 5837 | 6458 |
| 5838 | 6512 |
| 5839 | 6826 |
| 5840 | 5688 |
| 5841 | 6092 |
| 5842 | 6119 |
| 5843 | 6502 |
| 5844 | 6217 |
| 5845 | 6533 |
| 5846 | 6616 |
| 5847 | 6914 |
| 5848 | 6299 |
| 5849 | 6638 |
| 5850 | 6673 |
| 5851 | 6946 |
| 5852 | 6735 |
| 5853 | 7030 |
| 5854 | 7079 |
| 5855 | 7316 |
| 5856 | 5749 |
| 5857 | 6242 |
| 5858 | 6277 |
| 5859 | 6581 |
| 5860 | 6360 |
| 5861 | 6648 |
| 5862 | 6688 |
| 5863 | 6980 |
| 5864 | 6406 |
| 5865 | 6728 |
| 5866 | 6785 |
| 5867 | 7061 |
| 5868 | 6846 |
| 5869 | 7110 |
| 5870 | 7176 |
| 5871 | 7410 |

TABLE Z1-continued

| with a sequence length of 8192: | |
|---|---|
| Polarized channel sequence number | Reliability or reliability sequence number |
| 5872 | 6547 |
| 5873 | 6792 |
| 5874 | 6865 |
| 5875 | 7124 |
| 5876 | 6934 |
| 5877 | 7194 |
| 5878 | 7224 |
| 5879 | 7482 |
| 5880 | 6984 |
| 5881 | 7248 |
| 5882 | 7294 |
| 5883 | 7519 |
| 5884 | 7354 |
| 5885 | 7574 |
| 5886 | 7638 |
| 5887 | 7822 |
| 5888 | 3423 |
| 5889 | 4135 |
| 5890 | 4245 |
| 5891 | 4941 |
| 5892 | 4415 |
| 5893 | 5037 |
| 5894 | 5118 |
| 5895 | 5617 |
| 5896 | 4461 |
| 5897 | 5146 |
| 5898 | 5228 |
| 5899 | 5670 |
| 5900 | 5303 |
| 5901 | 5735 |
| 5902 | 5833 |
| 5903 | 6286 |
| 5904 | 4593 |
| 5905 | 5268 |
| 5906 | 5397 |
| 5907 | 5781 |
| 5908 | 5450 |
| 5909 | 5905 |
| 5910 | 5879 |
| 5911 | 6309 |
| 5912 | 5490 |
| 5913 | 5940 |
| 5914 | 6004 |
| 5915 | 6393 |
| 5916 | 6082 |
| 5917 | 6426 |
| 5918 | 6468 |
| 5919 | 6812 |
| 5920 | 4850 |
| 5921 | 5427 |
| 5922 | 5496 |
| 5923 | 5902 |
| 5924 | 5649 |
| 5925 | 5983 |
| 5926 | 6038 |
| 5927 | 6439 |
| 5928 | 5667 |
| 5929 | 6085 |
| 5930 | 6109 |
| 5931 | 6475 |
| 5932 | 6146 |
| 5933 | 6520 |
| 5934 | 6557 |
| 5935 | 6893 |
| 5936 | 5691 |
| 5937 | 6134 |
| 5938 | 6199 |
| 5939 | 6553 |
| 5940 | 6295 |
| 5941 | 6613 |
| 5942 | 6667 |
| 5943 | 6955 |
| 5944 | 6347 |
| 5945 | 6717 |
| 5946 | 6732 |

TABLE Z1-continued with a sequence length of 8192:

| Polarized channel sequence number | Reliability or reliability sequence number |
|---|---|
| 5947 | 7035 |
| 5948 | 6788 |
| 5949 | 7083 |
| 5950 | 7138 |
| 5951 | 7381 |
| 5952 | 4888 |
| 5953 | 5643 |
| 5954 | 5658 |
| 5955 | 6064 |
| 5956 | 5694 |
| 5957 | 6097 |
| 5958 | 6158 |
| 5959 | 6530 |
| 5960 | 5758 |
| 5961 | 6221 |
| 5962 | 6270 |
| 5963 | 6595 |
| 5964 | 6327 |
| 5965 | 6652 |
| 5966 | 6724 |
| 5967 | 7018 |
| 5968 | 6020 |
| 5969 | 6293 |
| 5970 | 6363 |
| 5971 | 6669 |
| 5972 | 6409 |
| 5973 | 6758 |
| 5974 | 6796 |
| 5975 | 7070 |
| 5976 | 6526 |
| 5977 | 6799 |
| 5978 | 6869 |
| 5979 | 7129 |
| 5980 | 6938 |
| 5981 | 7190 |
| 5982 | 7219 |
| 5983 | 7475 |
| 5984 | 6104 |
| 5985 | 6419 |
| 5986 | 6499 |
| 5987 | 6761 |
| 5988 | 6550 |
| 5989 | 6855 |
| 5990 | 6902 |
| 5991 | 7152 |
| 5992 | 6623 |
| 5993 | 6922 |
| 5994 | 6963 |
| 5995 | 7214 |
| 5996 | 7013 |
| 5997 | 7253 |
| 5998 | 7310 |
| 5999 | 7539 |
| 6000 | 6681 |
| 6001 | 6988 |
| 6002 | 7048 |
| 6003 | 7290 |
| 6004 | 7101 |
| 6005 | 7326 |
| 6006 | 7375 |
| 6007 | 7588 |
| 6008 | 7162 |
| 6009 | 7398 |
| 6010 | 7434 |
| 6011 | 7624 |
| 6012 | 7463 |
| 6013 | 7694 |
| 6014 | 7711 |
| 6015 | 7914 |
| 6016 | 4917 |
| 6017 | 5702 |
| 6018 | 5732 |
| 6019 | 6279 |
| 6020 | 5981 |
| 6021 | 6315 |

TABLE Z1-continued with a sequence length of 8192:

| Polarized channel sequence number | Reliability or reliability sequence number |
|---|---|
| 6022 | 6350 |
| 6023 | 6710 |
| 6024 | 6046 |
| 6025 | 6389 |
| 6026 | 6428 |
| 6027 | 6770 |
| 6028 | 6510 |
| 6029 | 6823 |
| 6030 | 6890 |
| 6031 | 7143 |
| 6032 | 6116 |
| 6033 | 6466 |
| 6034 | 6543 |
| 6035 | 6835 |
| 6036 | 6589 |
| 6037 | 6905 |
| 6038 | 6967 |
| 6039 | 7205 |
| 6040 | 6655 |
| 6041 | 7005 |
| 6041 | 7005 |
| 6042 | 6958 |
| 6043 | 7238 |
| 6044 | 7075 |
| 6045 | 7305 |
| 6046 | 7348 |
| 6047 | 7559 |
| 6048 | 6302 |
| 6049 | 6567 |
| 6050 | 6609 |
| 6051 | 6930 |
| 6052 | 6703 |
| 6053 | 6975 |
| 6054 | 7043 |
| 6055 | 7274 |
| 6056 | 6750 |
| 6057 | 7053 |
| 6058 | 7096 |
| 6059 | 7332 |
| 6060 | 7134 |
| 6061 | 7359 |
| 6062 | 7416 |
| 6063 | 7616 |
| 6064 | 6850 |
| 6065 | 7115 |
| 6066 | 7171 |
| 6067 | 7386 |
| 6068 | 7229 |
| 6069 | 7445 |
| 6070 | 7469 |
| 6071 | 7677 |
| 6072 | 7259 |
| 6073 | 7514 |
| 6074 | 7533 |
| 6075 | 7728 |
| 6076 | 7580 |
| 6077 | 7754 |
| 6078 | 7773 |
| 6079 | 7878 |
| 6080 | 6413 |
| 6081 | 6620 |
| 6082 | 6746 |
| 6083 | 7057 |
| 6084 | 6819 |
| 6085 | 7093 |
| 6086 | 7120 |
| 6087 | 7365 |
| 6088 | 6881 |
| 6089 | 7180 |
| 6090 | 7199 |
| 6091 | 7427 |
| 6092 | 7244 |
| 6093 | 7452 |
| 6094 | 7526 |
| 6095 | 7702 |

TABLE Z1-continued with a sequence length of 8192:

| Polarized channel sequence number | Reliability or reliability sequence number |
|---|---|
| 6096 | 6897 |
| 6097 | 7234 |
| 6098 | 7279 |
| 6099 | 7507 |
| 6100 | 7342 |
| 6101 | 7546 |
| 6102 | 7553 |
| 6103 | 7764 |
| 6104 | 7404 |
| 6105 | 7594 |
| 6106 | 7609 |
| 6107 | 7782 |
| 6108 | 7662 |
| 6109 | 7833 |
| 6110 | 7854 |
| 6111 | 7987 |
| 6112 | 7022 |
| 6113 | 7321 |
| 6114 | 7337 |
| 6115 | 7567 |
| 6116 | 7421 |
| 6117 | 7602 |
| 6118 | 7632 |
| 6119 | 7802 |
| 6120 | 7457 |
| 6121 | 7670 |
| 6122 | 7686 |
| 6123 | 7844 |
| 6124 | 7737 |
| 6125 | 7866 |
| 6126 | 7928 |
| 6127 | 8021 |
| 6128 | 7494 |
| 6129 | 7720 |
| 6130 | 7745 |
| 6131 | 7889 |
| 6132 | 7793 |
| 6133 | 7902 |
| 6134 | 7942 |
| 6135 | 8040 |
| 6136 | 7812 |
| 6137 | 7955 |
| 6138 | 7971 |
| 6139 | 8061 |
| 6140 | 8003 |
| 6141 | 8084 |
| 6142 | 8111 |
| 6143 | 8145 |
| 6144 | 315 |
| 6145 | 749 |
| 6146 | 1016 |
| 6147 | 1608 |
| 6148 | 1189 |
| 6149 | 1682 |
| 6150 | 1923 |
| 6151 | 2412 |
| 6152 | 1325 |
| 6153 | 1867 |
| 6154 | 2017 |
| 6155 | 2520 |
| 6156 | 2143 |
| 6157 | 2641 |
| 6158 | 2685 |
| 6159 | 3363 |
| 6160 | 1434 |
| 6161 | 1971 |
| 6162 | 2063 |
| 6163 | 2617 |
| 6164 | 2252 |
| 6165 | 2771 |
| 6166 | 2935 |
| 6167 | 3421 |
| 6168 | 2350 |
| 6169 | 2919 |
| 6170 | 2846 |

TABLE Z1-continued with a sequence length of 8192:

| Polarized channel sequence number | Reliability or reliability sequence number |
|---|---|
| 6171 | 3496 |
| 6172 | 3097 |
| 6173 | 3590 |
| 6174 | 3649 |
| 6175 | 4157 |
| 6176 | 1526 |
| 6177 | 2183 |
| 6178 | 2320 |
| 6179 | 2810 |
| 6180 | 2383 |
| 6181 | 2901 |
| 6182 | 3004 |
| 6183 | 3519 |
| 6184 | 2544 |
| 6185 | 3066 |
| 6186 | 3125 |
| 6187 | 3599 |
| 6188 | 3301 |
| 6189 | 3714 |
| 6190 | 3767 |
| 6191 | 4273 |
| 6192 | 2664 |
| 6193 | 3155 |
| 6194 | 3337 |
| 6195 | 3750 |
| 6196 | 3398 |
| 6197 | 3825 |
| 6198 | 3907 |
| 6199 | 4350 |
| 6200 | 3487 |
| 6201 | 3923 |
| 6202 | 4005 |
| 6203 | 4498 |
| 6204 | 4049 |
| 6205 | 4563 |
| 6206 | 4675 |
| 6207 | 5154 |
| 6208 | 1748 |
| 6209 | 2218 |
| 6210 | 2466 |
| 6211 | 3051 |
| 6212 | 2569 |
| 6213 | 3112 |
| 6214 | 3287 |
| 6215 | 3666 |
| 6216 | 2708 |
| 6217 | 3349 |
| 6218 | 3182 |
| 6219 | 3775 |
| 6220 | 3453 |
| 6221 | 3858 |
| 6222 | 3961 |
| 6223 | 4398 |
| 6224 | 2884 |
| 6225 | 3325 |
| 6226 | 3476 |
| 6227 | 3915 |
| 6228 | 3539 |
| 6229 | 3983 |
| 6230 | 4043 |
| 6231 | 4537 |
| 6232 | 3630 |
| 6233 | 4062 |
| 6234 | 4179 |
| 6235 | 4622 |
| 6236 | 4267 |
| 6237 | 4711 |
| 6238 | 4787 |
| 6239 | 5295 |
| 6240 | 3035 |
| 6241 | 3508 |
| 6242 | 3610 |
| 6243 | 4035 |
| 6244 | 3731 |
| 6245 | 4114 |

TABLE Z1-continued

| with a sequence length of 8192: | |
|---|---|
| Polarized channel sequence number | Reliability or reliability sequence number |
| 6246 | 4227 |
| 6247 | 4689 |
| 6248 | 3808 |
| 6249 | 4233 |
| 6250 | 4344 |
| 6251 | 4753 |
| 6252 | 4417 |
| 6253 | 4862 |
| 6254 | 4929 |
| 6255 | 5405 |
| 6256 | 3945 |
| 6257 | 4386 |
| 6258 | 4521 |
| 6259 | 4879 |
| 6260 | 4554 |
| 6261 | 4934 |
| 6262 | 5027 |
| 6263 | 5494 |
| 6264 | 4655 |
| 6265 | 5055 |
| 6266 | 5131 |
| 6267 | 5564 |
| 6268 | 5199 |
| 6269 | 5624 |
| 6270 | 5727 |
| 6271 | 6213 |
| 6272 | 2103 |
| 6273 | 2438 |
| 6274 | 2593 |
| 6275 | 3313 |
| 6276 | 2790 |
| 6277 | 3386 |
| 6278 | 3430 |
| 6279 | 3953 |
| 6280 | 2954 |
| 6281 | 3465 |
| 6282 | 3550 |
| 6283 | 4027 |
| 6284 | 3638 |
| 6285 | 4108 |
| 6286 | 4137 |
| 6287 | 4685 |
| 6288 | 3082 |
| 6289 | 3559 |
| 6290 | 3658 |
| 6291 | 4122 |
| 6292 | 3758 |
| 6293 | 4219 |
| 6294 | 4324 |
| 6295 | 4764 |
| 6296 | 3850 |
| 6297 | 4330 |
| 6298 | 4392 |
| 6299 | 4834 |
| 6300 | 4532 |
| 6301 | 4912 |
| 6302 | 5005 |
| 6303 | 5462 |
| 6304 | 3209 |
| 6305 | 3694 |
| 6306 | 3817 |
| 6307 | 4259 |
| 6308 | 3866 |
| 6309 | 4336 |
| 6310 | 4434 |
| 6311 | 4884 |
| 6312 | 4013 |
| 6313 | 4510 |
| 6314 | 4558 |
| 6315 | 4946 |
| 6316 | 4649 |
| 6317 | 5052 |
| 6318 | 5108 |
| 6319 | 5558 |
| 6320 | 4128 |

TABLE Z1-continued

| with a sequence length of 8192: | |
|---|---|
| Polarized channel sequence number | Reliability or reliability sequence number |
| 6321 | 4607 |
| 6322 | 4694 |
| 6323 | 5075 |
| 6324 | 4759 |
| 6325 | 5181 |
| 6326 | 5211 |
| 6327 | 5615 |
| 6328 | 4867 |
| 6329 | 5252 |
| 6330 | 5352 |
| 6331 | 5701 |
| 6332 | 5422 |
| 6333 | 5780 |
| 6334 | 5938 |
| 6335 | 6215 |
| 6336 | 3263 |
| 6337 | 3833 |
| 6338 | 3975 |
| 6339 | 4451 |
| 6340 | 4092 |
| 6341 | 4543 |
| 6342 | 4644 |
| 6343 | 5067 |
| 6344 | 4165 |
| 6345 | 4658 |
| 6346 | 4719 |
| 6347 | 5151 |
| 6348 | 4792 |
| 6349 | 5207 |
| 6350 | 5287 |
| 6351 | 5674 |
| 6352 | 4313 |
| 6353 | 4773 |
| 6354 | 4839 |
| 6355 | 5244 |
| 6356 | 4937 |
| 6357 | 5333 |
| 6358 | 5413 |
| 6359 | 5806 |
| 6360 | 4985 |
| 6361 | 5433 |
| 6362 | 5507 |
| 6363 | 5869 |
| 6364 | 5582 |
| 6365 | 5965 |
| 6366 | 6021 |
| 6367 | 6431 |
| 6368 | 4428 |
| 6369 | 4893 |
| 6370 | 4959 |
| 6371 | 5365 |
| 6372 | 5083 |
| 6373 | 5456 |
| 6374 | 5520 |
| 6375 | 5920 |
| 6376 | 5196 |
| 6377 | 5544 |
| 6378 | 5618 |
| 6379 | 5997 |
| 6380 | 5704 |
| 6381 | 6032 |
| 6382 | 6154 |
| 6383 | 6539 |
| 6384 | 5284 |
| 6385 | 5648 |
| 6386 | 5733 |
| 6387 | 6098 |
| 6388 | 5771 |
| 6389 | 6194 |
| 6390 | 6246 |
| 6391 | 6628 |
| 6392 | 5930 |
| 6393 | 6271 |
| 6394 | 6329 |
| 6395 | 6610 |

TABLE Z1-continued with a sequence length of 8192:

| Polarized channel sequence number | Reliability or reliability sequence number |
|---|---|
| 6396 | 6385 |
| 6397 | 6697 |
| 6398 | 6802 |
| 6399 | 7108 |
| 6400 | 2287 |
| 6401 | 2728 |
| 6402 | 2827 |
| 6403 | 3528 |
| 6404 | 2970 |
| 6405 | 3570 |
| 6406 | 3677 |
| 6407 | 4213 |
| 6408 | 2986 |
| 6409 | 3686 |
| 6410 | 3783 |
| 6411 | 4279 |
| 6412 | 3883 |
| 6413 | 4404 |
| 6414 | 4463 |
| 6415 | 4997 |
| 6416 | 3197 |
| 6417 | 3792 |
| 6418 | 3891 |
| 6419 | 4481 |
| 6420 | 3991 |
| 6421 | 4526 |
| 6422 | 4597 |
| 6423 | 5002 |
| 6424 | 4057 |
| 6425 | 4586 |
| 6426 | 4680 |
| 6427 | 5128 |
| 6428 | 4778 |
| 6429 | 5193 |
| 6430 | 5227 |
| 6431 | 5612 |
| 6432 | 3236 |
| 6433 | 3969 |
| 6434 | 4070 |
| 6435 | 4493 |
| 6436 | 4193 |
| 6437 | 4613 |
| 6438 | 4700 |
| 6439 | 5188 |
| 6440 | 4253 |
| 6441 | 4744 |
| 6442 | 4797 |
| 6443 | 5233 |
| 6444 | 4853 |
| 6445 | 5327 |
| 6446 | 5382 |
| 6447 | 5765 |
| 6448 | 4247 |
| 6449 | 4843 |
| 6450 | 4901 |
| 6451 | 5321 |
| 6452 | 4980 |
| 6453 | 5419 |
| 6454 | 5468 |
| 6455 | 5875 |
| 6456 | 5092 |
| 6457 | 5529 |
| 6458 | 5588 |
| 6459 | 5962 |
| 6460 | 5642 |
| 6461 | 6015 |
| 6462 | 6111 |
| 6463 | 6511 |
| 6464 | 3375 |
| 6465 | 4151 |
| 6466 | 4199 |
| 6467 | 4730 |
| 6468 | 4299 |
| 6469 | 4820 |
| 6470 | 4898 |
| 6471 | 5298 |
| 6472 | 4361 |
| 6473 | 4924 |
| 6474 | 4954 |
| 6475 | 5410 |
| 6476 | 5030 |
| 6477 | 5491 |
| 6478 | 5541 |
| 6479 | 5955 |
| 6480 | 4664 |
| 6481 | 5010 |
| 6482 | 5088 |
| 6483 | 5503 |
| 6484 | 5159 |
| 6485 | 5576 |
| 6486 | 5639 |
| 6487 | 6006 |
| 6488 | 5262 |
| 6489 | 5660 |
| 6490 | 5748 |
| 6491 | 6090 |
| 6492 | 5817 |
| 6493 | 6188 |
| 6494 | 6253 |
| 6495 | 6594 |
| 6496 | 4815 |
| 6497 | 5139 |
| 6498 | 5241 |
| 6499 | 5606 |
| 6500 | 5316 |
| 6501 | 5695 |
| 6502 | 5757 |
| 6503 | 6160 |
| 6504 | 5396 |
| 6505 | 5791 |
| 6506 | 5840 |
| 6507 | 6209 |
| 6508 | 5941 |
| 6509 | 6298 |
| 6510 | 6351 |
| 6511 | 6671 |
| 6512 | 5514 |
| 6513 | 5936 |
| 6514 | 5971 |
| 6515 | 6330 |
| 6516 | 6009 |
| 6517 | 6390 |
| 6518 | 6313 |
| 6519 | 6722 |
| 6520 | 6129 |
| 6521 | 6501 |
| 6522 | 6544 |
| 6523 | 6824 |
| 6524 | 6562 |
| 6525 | 6925 |
| 6526 | 6978 |
| 6527 | 7165 |
| 6528 | 3442 |
| 6529 | 4285 |
| 6530 | 4318 |
| 6531 | 4976 |
| 6532 | 4618 |
| 6533 | 5047 |
| 6534 | 5100 |
| 6535 | 5526 |
| 6536 | 4739 |
| 6537 | 5119 |
| 6538 | 5165 |
| 6539 | 5594 |
| 6540 | 5259 |
| 6541 | 5669 |
| 6542 | 5745 |
| 6543 | 6167 |
| 6544 | 4806 |
| 6545 | 5247 |

TABLE Z1-continued with a sequence length of 8192:

| Polarized channel sequence number | Reliability or reliability sequence number |
|---|---|
| 6546 | 5313 |
| 6547 | 5672 |
| 6548 | 5361 |
| 6549 | 5759 |
| 6550 | 5826 |
| 6551 | 6225 |
| 6552 | 5436 |
| 6553 | 5849 |
| 6554 | 5914 |
| 6555 | 6282 |
| 6556 | 6003 |
| 6557 | 6342 |
| 6558 | 6427 |
| 6559 | 6737 |
| 6560 | 4993 |
| 6561 | 5330 |
| 6562 | 5379 |
| 6563 | 5820 |
| 6564 | 5465 |
| 6565 | 5895 |
| 6566 | 5979 |
| 6567 | 6317 |
| 6568 | 5591 |
| 6569 | 5982 |
| 6570 | 6024 |
| 6571 | 6420 |
| 6572 | 6133 |
| 6573 | 6379 |
| 6574 | 6525 |
| 6575 | 6831 |
| 6576 | 5692 |
| 6577 | 6075 |
| 6578 | 6182 |
| 6579 | 6503 |
| 6580 | 6227 |
| 6581 | 6558 |
| 6582 | 6601 |
| 6583 | 6895 |
| 6584 | 6301 |
| 6585 | 6619 |
| 6586 | 6615 |
| 6587 | 6964 |
| 6588 | 6725 |
| 6589 | 7003 |
| 6590 | 7045 |
| 6591 | 7283 |
| 6592 | 5134 |
| 6593 | 5425 |
| 6594 | 5532 |
| 6595 | 5988 |
| 6596 | 5663 |
| 6597 | 6029 |
| 6598 | 6105 |
| 6599 | 6453 |
| 6600 | 5751 |
| 6601 | 6163 |
| 6602 | 6196 |
| 6603 | 6548 |
| 6604 | 6269 |
| 6605 | 6570 |
| 6606 | 6614 |
| 6607 | 6919 |
| 6608 | 5829 |
| 6609 | 6238 |
| 6610 | 6319 |
| 6611 | 6598 |
| 6612 | 6352 |
| 6613 | 6624 |
| 6614 | 6729 |
| 6615 | 7006 |
| 6616 | 6448 |
| 6617 | 6751 |
| 6618 | 6791 |
| 6619 | 7056 |
| 6620 | 6859 |

TABLE Z1-continued with a sequence length of 8192:

| Polarized channel sequence number | Reliability or reliability sequence number |
|---|---|
| 6621 | 7122 |
| 6622 | 7158 |
| 6623 | 7395 |
| 6624 | 5958 |
| 6625 | 6335 |
| 6626 | 6411 |
| 6627 | 6733 |
| 6628 | 6521 |
| 6629 | 6740 |
| 6630 | 6845 |
| 6631 | 7074 |
| 6632 | 6535 |
| 6633 | 6834 |
| 6634 | 6901 |
| 6635 | 7144 |
| 6636 | 6951 |
| 6637 | 7192 |
| 6638 | 7257 |
| 6639 | 7476 |
| 6640 | 6572 |
| 6641 | 6928 |
| 6642 | 6993 |
| 6643 | 7215 |
| 6644 | 7028 |
| 6645 | 7267 |
| 6646 | 7237 |
| 6647 | 7502 |
| 6648 | 7100 |
| 6649 | 7314 |
| 6650 | 7346 |
| 6651 | 7575 |
| 6652 | 7411 |
| 6653 | 7613 |
| 6654 | 7659 |
| 6655 | 7775 |
| 6656 | 2495 |
| 6657 | 2865 |
| 6658 | 3020 |
| 6659 | 3619 |
| 6660 | 3140 |
| 6661 | 3800 |
| 6662 | 3899 |
| 6663 | 4440 |
| 6664 | 3224 |
| 6665 | 3931 |
| 6666 | 3997 |
| 6667 | 4476 |
| 6668 | 4084 |
| 6669 | 4574 |
| 6670 | 4602 |
| 6671 | 5170 |
| 6672 | 3248 |
| 6673 | 4078 |
| 6674 | 4143 |
| 6675 | 4569 |
| 6676 | 4205 |
| 6677 | 4825 |
| 6678 | 4870 |
| 6679 | 5281 |
| 6680 | 4367 |
| 6681 | 4876 |
| 6682 | 4971 |
| 6683 | 5399 |
| 6684 | 5043 |
| 6685 | 5474 |
| 6686 | 5538 |
| 6687 | 5995 |
| 6688 | 3275 |
| 6689 | 4185 |
| 6690 | 4293 |
| 6691 | 4848 |
| 6692 | 4380 |
| 6693 | 4963 |
| 6694 | 5018 |
| 6695 | 5448 |

TABLE Z1-continued with a sequence length of 8192:

| Polarized channel sequence number | Reliability or reliability sequence number |
|---|---|
| 6696 | 4445 |
| 6697 | 5063 |
| 6698 | 5111 |
| 6699 | 5552 |
| 6700 | 5177 |
| 6701 | 5627 |
| 6702 | 5683 |
| 6703 | 6036 |
| 6704 | 4515 |
| 6705 | 5147 |
| 6706 | 5219 |
| 6707 | 5657 |
| 6708 | 5302 |
| 6709 | 5736 |
| 6710 | 5786 |
| 6711 | 6145 |
| 6712 | 5338 |
| 6713 | 5768 |
| 6714 | 5855 |
| 6715 | 6234 |
| 6716 | 5866 |
| 6717 | 6281 |
| 6718 | 6339 |
| 6719 | 6809 |
| 6720 | 3705 |
| 6721 | 4375 |
| 6722 | 4423 |
| 6723 | 5035 |
| 6724 | 4487 |
| 6725 | 5115 |
| 6726 | 5173 |
| 6727 | 5603 |
| 6728 | 4633 |
| 6729 | 5230 |
| 6730 | 5267 |
| 6731 | 5716 |
| 6732 | 5347 |
| 6733 | 5800 |
| 6734 | 5846 |
| 6735 | 6175 |
| 6736 | 4725 |
| 6737 | 5278 |
| 6738 | 5375 |
| 6739 | 5777 |
| 6740 | 5442 |
| 6741 | 5860 |
| 6742 | 5883 |
| 6743 | 6257 |
| 6744 | 5500 |
| 6745 | 5886 |
| 6746 | 5912 |
| 6747 | 6346 |
| 6748 | 6072 |
| 6749 | 6394 |
| 6750 | 6486 |
| 6751 | 6833 |
| 6752 | 4811 |
| 6753 | 5439 |
| 6754 | 5482 |
| 6755 | 5906 |
| 6756 | 5570 |
| 6757 | 5974 |
| 6758 | 5989 |
| 6759 | 6368 |
| 6760 | 5636 |
| 6761 | 6068 |
| 6762 | 6118 |
| 6763 | 6446 |
| 6764 | 6206 |
| 6765 | 6515 |
| 6766 | 6552 |
| 6767 | 6904 |
| 6768 | 5713 |
| 6769 | 6153 |
| 6770 | 6231 |

TABLE Z1-continued with a sequence length of 8192:

| Polarized channel sequence number | Reliability or reliability sequence number |
|---|---|
| 6771 | 6554 |
| 6772 | 6306 |
| 6773 | 6590 |
| 6774 | 6678 |
| 6775 | 6954 |
| 6776 | 6410 |
| 6777 | 6689 |
| 6778 | 6755 |
| 6779 | 7011 |
| 6780 | 6795 |
| 6781 | 7068 |
| 6782 | 7128 |
| 6783 | 7387 |
| 6784 | 3739 |
| 6785 | 4468 |
| 6786 | 4580 |
| 6787 | 5215 |
| 6788 | 4714 |
| 6789 | 5270 |
| 6790 | 5358 |
| 6791 | 5812 |
| 6792 | 4783 |
| 6793 | 5390 |
| 6794 | 5453 |
| 6795 | 5892 |
| 6796 | 5517 |
| 6797 | 5927 |
| 6798 | 5947 |
| 6799 | 6358 |
| 6800 | 4920 |
| 6801 | 5488 |
| 6802 | 5567 |
| 6803 | 5950 |
| 6804 | 5630 |
| 6805 | 6054 |
| 6806 | 6103 |
| 6807 | 6433 |
| 6808 | 5707 |
| 6809 | 6138 |
| 6810 | 6200 |
| 6811 | 6534 |
| 6812 | 6262 |
| 6813 | 6576 |
| 6814 | 6645 |
| 6815 | 6908 |
| 6816 | 5022 |
| 6817 | 5600 |
| 6818 | 5680 |
| 6819 | 6113 |
| 6820 | 5789 |
| 6821 | 6187 |
| 6822 | 6179 |
| 6823 | 6580 |
| 6824 | 5832 |
| 6825 | 6243 |
| 6826 | 6275 |
| 6827 | 6632 |
| 6828 | 6372 |
| 6829 | 6682 |
| 6830 | 6712 |
| 6831 | 7017 |
| 6832 | 5922 |
| 6833 | 6310 |
| 6834 | 6401 |
| 6835 | 6701 |
| 6836 | 6437 |
| 6837 | 6772 |
| 6838 | 6798 |
| 6839 | 7077 |
| 6840 | 6497 |
| 6841 | 6828 |
| 6842 | 6873 |
| 6843 | 7147 |
| 6844 | 6961 |
| 6845 | 7200 |

TABLE Z1-continued with a sequence length of 8192:

| Polarized channel sequence number | Reliability or reliability sequence number |
|---|---|
| 6846 | 7260 |
| 6847 | 7479 |
| 6848 | 5095 |
| 6849 | 5724 |
| 6850 | 5797 |
| 6851 | 6250 |
| 6852 | 5878 |
| 6853 | 6294 |
| 6854 | 6375 |
| 6855 | 6693 |
| 6856 | 6047 |
| 6857 | 6405 |
| 6858 | 6463 |
| 6859 | 6783 |
| 6860 | 6474 |
| 6861 | 6806 |
| 6862 | 6852 |
| 6863 | 7117 |
| 6864 | 6081 |
| 6865 | 6467 |
| 6866 | 6493 |
| 6867 | 6841 |
| 6868 | 6584 |
| 6869 | 6870 |
| 6870 | 6939 |
| 6871 | 7188 |
| 6872 | 6661 |
| 6873 | 6957 |
| 6874 | 6990 |
| 6875 | 7217 |
| 6876 | 7042 |
| 6877 | 7287 |
| 6878 | 7325 |
| 6879 | 7515 |
| 6880 | 6141 |
| 6881 | 6605 |
| 6882 | 6639 |
| 6883 | 6911 |
| 6884 | 6714 |
| 6885 | 6968 |
| 6886 | 6999 |
| 6887 | 7245 |
| 6888 | 6759 |
| 6889 | 7036 |
| 6890 | 7082 |
| 6891 | 7311 |
| 6892 | 7133 |
| 6893 | 7350 |
| 6894 | 7402 |
| 6895 | 7589 |
| 6896 | 6880 |
| 6897 | 7089 |
| 6898 | 7151 |
| 6899 | 7363 |
| 6900 | 7207 |
| 6901 | 7419 |
| 6902 | 7441 |
| 6903 | 7649 |
| 6904 | 7250 |
| 6905 | 7462 |
| 6906 | 7497 |
| 6907 | 7674 |
| 6908 | 7547 |
| 6909 | 7717 |
| 6910 | 7769 |
| 6911 | 7906 |
| 6912 | 3874 |
| 6913 | 4638 |
| 6914 | 4750 |
| 6915 | 5393 |
| 6916 | 4907 |
| 6917 | 5479 |
| 6918 | 5555 |
| 6919 | 6013 |
| 6920 | 4951 |

TABLE Z1-continued with a sequence length of 8192:

| Polarized channel sequence number | Reliability or reliability sequence number |
|---|---|
| 6921 | 5579 |
| 6922 | 5651 |
| 6923 | 6063 |
| 6924 | 5722 |
| 6925 | 6126 |
| 6926 | 6219 |
| 6927 | 6649 |
| 6928 | 5072 |
| 6929 | 5689 |
| 6930 | 5809 |
| 6931 | 6169 |
| 6932 | 5858 |
| 6933 | 6290 |
| 6934 | 6265 |
| 6935 | 6668 |
| 6936 | 5897 |
| 6937 | 6323 |
| 6938 | 6384 |
| 6939 | 6748 |
| 6940 | 6457 |
| 6941 | 6776 |
| 6942 | 6817 |
| 6943 | 7103 |
| 6944 | 5310 |
| 6945 | 5838 |
| 6946 | 5903 |
| 6947 | 6287 |
| 6948 | 6045 |
| 6949 | 6364 |
| 6950 | 6416 |
| 6951 | 6787 |
| 6952 | 6060 |
| 6953 | 6459 |
| 6954 | 6481 |
| 6955 | 6820 |
| 6956 | 6519 |
| 6957 | 6856 |
| 6958 | 6891 |
| 6959 | 7173 |
| 6960 | 6083 |
| 6961 | 6507 |
| 6962 | 6566 |
| 6963 | 6887 |
| 6964 | 6657 |
| 6965 | 6936 |
| 6966 | 6981 |
| 6967 | 7222 |
| 6968 | 6704 |
| 6969 | 7024 |
| 6970 | 7038 |
| 6971 | 7291 |
| 6972 | 7086 |
| 6973 | 7330 |
| 6974 | 7374 |
| 6975 | 7565 |
| 6976 | 5344 |
| 6977 | 6039 |
| 6978 | 6052 |
| 6979 | 6441 |
| 6980 | 6087 |
| 6981 | 6471 |
| 6982 | 6529 |
| 6983 | 6867 |
| 6984 | 6148 |
| 6985 | 6587 |
| 6986 | 6635 |
| 6987 | 6921 |
| 6988 | 6686 |
| 6989 | 6970 |
| 6990 | 7032 |
| 6991 | 7276 |
| 6992 | 6397 |
| 6993 | 6653 |
| 6994 | 6718 |
| 6995 | 6986 |

TABLE Z1-continued

| with a sequence length of 8192: | |
|---|---|
| Polarized channel sequence number | Reliability or reliability sequence number |
| 6996 | 6763 |
| 6997 | 7060 |
| 6998 | 7091 |
| 6999 | 7318 |
| 7000 | 6863 |
| 7001 | 7097 |
| 7002 | 7155 |
| 7003 | 7366 |
| 7004 | 7210 |
| 7005 | 7415 |
| 7006 | 7437 |
| 7007 | 7644 |
| 7008 | 6477 |
| 7009 | 6769 |
| 7010 | 6837 |
| 7011 | 7063 |
| 7012 | 6884 |
| 7013 | 7140 |
| 7014 | 7181 |
| 7015 | 7383 |
| 7016 | 6948 |
| 7017 | 7195 |
| 7018 | 7230 |
| 7019 | 7432 |
| 7020 | 7271 |
| 7021 | 7466 |
| 7022 | 7511 |
| 7023 | 7690 |
| 7024 | 6996 |
| 7025 | 7252 |
| 7026 | 7299 |
| 7027 | 7493 |
| 7028 | 7343 |
| 7029 | 7524 |
| 7030 | 7561 |
| 7031 | 7729 |
| 7032 | 7391 |
| 7033 | 7579 |
| 7034 | 7608 |
| 7035 | 7758 |
| 7036 | 7634 |
| 7037 | 7807 |
| 7038 | 7819 |
| 7039 | 7977 |
| 7040 | 5369 |
| 7041 | 6096 |
| 7042 | 6120 |
| 7043 | 6640 |
| 7044 | 6362 |
| 7045 | 6674 |
| 7046 | 6708 |
| 7047 | 7021 |
| 7048 | 6423 |
| 7049 | 6744 |
| 7050 | 6780 |
| 7051 | 7071 |
| 7052 | 6848 |
| 7053 | 7114 |
| 7054 | 7169 |
| 7055 | 7378 |
| 7056 | 6488 |
| 7057 | 6813 |
| 7058 | 6876 |
| 7059 | 7125 |
| 7060 | 6915 |
| 7061 | 7184 |
| 7062 | 7232 |
| 7063 | 7428 |
| 7064 | 6974 |
| 7065 | 7265 |
| 7065 | 7265 |
| 7066 | 7225 |
| 7067 | 7454 |
| 7068 | 7323 |
| 7069 | 7505 |

TABLE Z1-continued

| with a sequence length of 8192: | |
|---|---|
| Polarized channel sequence number | Reliability or reliability sequence number |
| 7070 | 7543 |
| 7071 | 7707 |
| 7072 | 6664 |
| 7073 | 6898 |
| 7074 | 6932 |
| 7075 | 7202 |
| 7076 | 7015 |
| 7077 | 7240 |
| 7078 | 7295 |
| 7079 | 7484 |
| 7080 | 7054 |
| 7081 | 7302 |
| 7082 | 7339 |
| 7083 | 7528 |
| 7084 | 7369 |
| 7085 | 7551 |
| 7086 | 7593 |
| 7087 | 7752 |
| 7088 | 7136 |
| 7089 | 7355 |
| 7090 | 7400 |
| 7091 | 7570 |
| 7092 | 7446 |
| 7093 | 7619 |
| 7094 | 7639 |
| 7095 | 7795 |
| 7096 | 7472 |
| 7097 | 7669 |
| 7098 | 7685 |
| 7099 | 7834 |
| 7100 | 7723 |
| 7101 | 7853 |
| 7102 | 7869 |
| 7103 | 7949 |
| 7104 | 6765 |
| 7105 | 6944 |
| 7106 | 7050 |
| 7107 | 7307 |
| 7108 | 7111 |
| 7109 | 7334 |
| 7110 | 7358 |
| 7111 | 7556 |
| 7112 | 7163 |
| 7113 | 7407 |
| 7114 | 7423 |
| 7115 | 7604 |
| 7116 | 7458 |
| 7117 | 7623 |
| 7118 | 7679 |
| 7119 | 7814 |
| 7120 | 7177 |
| 7121 | 7449 |
| 7122 | 7487 |
| 7123 | 7664 |
| 7124 | 7537 |
| 7125 | 7696 |
| 7126 | 7700 |
| 7127 | 7861 |
| 7128 | 7585 |
| 7129 | 7735 |
| 7130 | 7746 |
| 7131 | 7875 |
| 7132 | 7783 |
| 7133 | 7916 |
| 7134 | 7931 |
| 7135 | 8031 |
| 7136 | 7278 |
| 7137 | 7521 |
| 7138 | 7534 |
| 7139 | 7712 |
| 7140 | 7599 |
| 7141 | 7740 |
| 7142 | 7765 |
| 7143 | 7891 |
| 7144 | 7628 |

TABLE Z1-continued

| with a sequence length of 8192: | |
|---|---|
| Polarized channel sequence number | Reliability or reliability sequence number |
| 7145 | 7788 |
| 7146 | 7800 |
| 7147 | 7923 |
| 7148 | 7840 |
| 7149 | 7940 |
| 7150 | 7988 |
| 7151 | 8057 |
| 7152 | 7653 |
| 7153 | 7827 |
| 7154 | 7847 |
| 7155 | 7959 |
| 7156 | 7883 |
| 7157 | 7967 |
| 7158 | 7997 |
| 7159 | 8072 |
| 7160 | 7899 |
| 7161 | 8009 |
| 7162 | 8019 |
| 7163 | 8088 |
| 7164 | 8044 |
| 7165 | 8105 |
| 7166 | 8126 |
| 7167 | 8152 |
| 7168 | 1813 |
| 7169 | 2748 |
| 7170 | 3167 |
| 7171 | 3937 |
| 7172 | 3409 |
| 7173 | 4021 |
| 7174 | 4239 |
| 7175 | 4801 |
| 7176 | 3579 |
| 7177 | 4171 |
| 7178 | 4355 |
| 7179 | 4915 |
| 7180 | 4504 |
| 7181 | 5038 |
| 7182 | 5080 |
| 7183 | 5686 |
| 7184 | 3722 |
| 7185 | 4305 |
| 7186 | 4411 |
| 7187 | 5013 |
| 7188 | 4628 |
| 7189 | 5142 |
| 7190 | 5306 |
| 7191 | 5730 |
| 7192 | 4734 |
| 7193 | 5292 |
| 7194 | 5222 |
| 7195 | 5803 |
| 7196 | 5459 |
| 7197 | 5880 |
| 7198 | 5933 |
| 7199 | 6344 |
| 7200 | 3842 |
| 7201 | 4549 |
| 7202 | 4705 |
| 7203 | 5185 |
| 7204 | 4769 |
| 7205 | 5273 |
| 7206 | 5372 |
| 7207 | 5823 |
| 7208 | 4942 |
| 7209 | 5430 |
| 7210 | 5485 |
| 7211 | 5889 |
| 7212 | 5633 |
| 7213 | 5992 |
| 7214 | 6034 |
| 7215 | 6424 |
| 7216 | 5060 |
| 7217 | 5511 |
| 7218 | 5666 |
| 7219 | 6018 |

TABLE Z1-continued

| with a sequence length of 8192: | |
|---|---|
| Polarized channel sequence number | Reliability or reliability sequence number |
| 7220 | 5719 |
| 7221 | 6086 |
| 7222 | 6150 |
| 7223 | 6480 |
| 7224 | 5794 |
| 7225 | 6165 |
| 7226 | 6229 |
| 7227 | 6582 |
| 7228 | 6259 |
| 7229 | 6625 |
| 7230 | 6698 |
| 7231 | 7019 |
| 7232 | 4100 |
| 7233 | 4591 |
| 7234 | 4857 |
| 7235 | 5416 |
| 7236 | 4968 |
| 7237 | 5471 |
| 7238 | 5621 |
| 7239 | 5953 |
| 7240 | 5103 |
| 7241 | 5677 |
| 7242 | 5523 |
| 7243 | 6042 |
| 7244 | 5762 |
| 7245 | 6108 |
| 7246 | 6191 |
| 7247 | 6513 |
| 7248 | 5255 |
| 7249 | 5654 |
| 7250 | 5783 |
| 7251 | 6157 |
| 7252 | 5843 |
| 7253 | 6210 |
| 7254 | 6255 |
| 7255 | 6608 |
| 7256 | 5917 |
| 7257 | 6273 |
| 7258 | 6355 |
| 7259 | 6666 |
| 7260 | 6418 |
| 7261 | 6723 |
| 7262 | 6775 |
| 7263 | 7107 |
| 7264 | 5402 |
| 7265 | 5815 |
| 7266 | 5900 |
| 7267 | 6247 |
| 7268 | 6000 |
| 7269 | 6307 |
| 7270 | 6392 |
| 7271 | 6709 |
| 7272 | 6070 |
| 7273 | 6398 |
| 7274 | 6476 |
| 7275 | 6753 |
| 7276 | 6524 |
| 7277 | 6822 |
| 7278 | 6872 |
| 7279 | 7174 |
| 7280 | 6176 |
| 7281 | 6504 |
| 7282 | 6596 |
| 7283 | 6840 |
| 7284 | 6618 |
| 7285 | 6875 |
| 7286 | 6937 |
| 7287 | 7228 |
| 7288 | 6687 |
| 7289 | 6956 |
| 7290 | 7004 |
| 7291 | 7268 |
| 7292 | 7049 |
| 7293 | 7303 |
| 7294 | 7361 |

TABLE Z1-continued

| with a sequence length of 8192: | |
|---|---|
| Polarized channel sequence number | Reliability or reliability sequence number |
| 7295 | 7601 |
| 7296 | 4457 |
| 7297 | 4829 |
| 7298 | 4988 |
| 7299 | 5645 |
| 7300 | 5162 |
| 7301 | 5710 |
| 7302 | 5742 |
| 7303 | 6184 |
| 7304 | 5324 |
| 7305 | 5774 |
| 7306 | 5852 |
| 7307 | 6241 |
| 7308 | 5924 |
| 7309 | 6303 |
| 7310 | 6326 |
| 7311 | 6706 |
| 7312 | 5445 |
| 7313 | 5863 |
| 7314 | 5944 |
| 7315 | 6314 |
| 7316 | 6027 |
| 7317 | 6388 |
| 7318 | 6461 |
| 7319 | 6760 |
| 7320 | 6100 |
| 7321 | 6464 |
| 7322 | 6508 |
| 7323 | 6804 |
| 7324 | 6604 |
| 7325 | 6861 |
| 7326 | 6924 |
| 7327 | 7208 |
| 7328 | 5549 |
| 7329 | 5976 |
| 7330 | 6078 |
| 7331 | 6414 |
| 7332 | 6115 |
| 7333 | 6470 |
| 7334 | 6538 |
| 7335 | 6844 |
| 7336 | 6237 |
| 7337 | 6586 |
| 7338 | 6622 |
| 7339 | 6882 |
| 7340 | 6683 |
| 7341 | 6952 |
| 7342 | 6987 |
| 7343 | 7266 |
| 7344 | 6322 |
| 7345 | 6654 |
| 7346 | 6715 |
| 7347 | 6969 |
| 7348 | 6756 |
| 7349 | 7037 |
| 7350 | 7055 |
| 7351 | 7298 |
| 7352 | 6825 |
| 7353 | 7081 |
| 7354 | 7142 |
| 7355 | 7347 |
| 7356 | 7186 |
| 7357 | 7389 |
| 7358 | 7468 |
| 7359 | 7603 |
| 7360 | 5597 |
| 7361 | 6093 |
| 7362 | 6203 |
| 7363 | 6549 |
| 7364 | 6297 |
| 7365 | 6611 |
| 7366 | 6679 |
| 7367 | 6962 |
| 7368 | 6348 |
| 7369 | 6691 |

TABLE Z1-continued

| with a sequence length of 8192: | |
|---|---|
| Polarized channel sequence number | Reliability or reliability sequence number |
| 7370 | 6730 |
| 7371 | 7016 |
| 7372 | 6779 |
| 7373 | 7051 |
| 7374 | 7104 |
| 7375 | 7333 |
| 7376 | 6450 |
| 7377 | 6764 |
| 7378 | 6808 |
| 7379 | 7076 |
| 7380 | 6879 |
| 7381 | 7131 |
| 7382 | 7179 |
| 7383 | 7401 |
| 7384 | 6910 |
| 7385 | 7191 |
| 7386 | 7236 |
| 7387 | 7435 |
| 7388 | 7281 |
| 7389 | 7483 |
| 7390 | 7509 |
| 7391 | 7701 |
| 7392 | 6531 |
| 7393 | 6847 |
| 7394 | 6892 |
| 7395 | 7150 |
| 7396 | 6973 |
| 7397 | 7206 |
| 7398 | 7243 |
| 7399 | 7459 |
| 7400 | 7047 |
| 7401 | 7258 |
| 7402 | 7301 |
| 7403 | 7498 |
| 7404 | 7349 |
| 7405 | 7516 |
| 7406 | 7576 |
| 7407 | 7749 |
| 7408 | 7102 |
| 7409 | 7317 |
| 7410 | 7364 |
| 7411 | 7548 |
| 7412 | 7384 |
| 7413 | 7592 |
| 7414 | 7617 |
| 7415 | 7785 |
| 7416 | 7465 |
| 7417 | 7629 |
| 7418 | 7656 |
| 7419 | 7778 |
| 7420 | 7682 |
| 7421 | 7813 |
| 7422 | 7855 |
| 7423 | 7970 |
| 7424 | 4669 |
| 7425 | 5123 |
| 7426 | 5204 |
| 7427 | 5835 |
| 7428 | 5341 |
| 7429 | 5872 |
| 7430 | 5960 |
| 7431 | 6381 |
| 7432 | 5355 |
| 7433 | 5968 |
| 7434 | 6050 |
| 7435 | 6429 |
| 7436 | 6130 |
| 7437 | 6517 |
| 7438 | 6556 |
| 7439 | 6916 |
| 7440 | 5535 |
| 7441 | 6057 |
| 7442 | 6135 |
| 7443 | 6568 |
| 7444 | 6218 |

TABLE Z1-continued

| with a sequence length of 8192: | |
|---|---|
| Polarized channel sequence number | Reliability or reliability sequence number |
| 7445 | 6600 |
| 7446 | 6647 |
| 7447 | 6920 |
| 7448 | 6266 |
| 7449 | 6643 |
| 7450 | 6702 |
| 7451 | 7001 |
| 7452 | 6767 |
| 7453 | 7044 |
| 7454 | 7064 |
| 7455 | 7297 |
| 7456 | 5573 |
| 7457 | 6198 |
| 7458 | 6278 |
| 7459 | 6578 |
| 7460 | 6365 |
| 7461 | 6658 |
| 7462 | 6719 |
| 7463 | 7041 |
| 7464 | 6407 |
| 7465 | 6745 |
| 7466 | 6782 |
| 7467 | 7069 |
| 7468 | 6818 |
| 7469 | 7127 |
| 7470 | 7161 |
| 7471 | 7380 |
| 7472 | 6403 |
| 7473 | 6811 |
| 7474 | 6853 |
| 7475 | 7123 |
| 7476 | 6907 |
| 7477 | 7183 |
| 7478 | 7213 |
| 7479 | 7436 |
| 7480 | 6979 |
| 7481 | 7247 |
| 7482 | 7282 |
| 7483 | 7481 |
| 7484 | 7315 |
| 7485 | 7508 |
| 7486 | 7554 |
| 7487 | 7736 |
| 7488 | 5698 |
| 7489 | 6336 |
| 7490 | 6371 |
| 7491 | 6738 |
| 7492 | 6444 |
| 7493 | 6797 |
| 7494 | 6851 |
| 7495 | 7109 |
| 7496 | 6484 |
| 7497 | 6868 |
| 7498 | 6889 |
| 7499 | 7178 |
| 7500 | 6940 |
| 7501 | 7227 |
| 7502 | 7255 |
| 7503 | 7477 |
| 7504 | 6694 |
| 7505 | 6927 |
| 7506 | 6976 |
| 7507 | 7235 |
| 7508 | 7023 |
| 7509 | 7275 |
| 7510 | 7313 |
| 7511 | 7503 |
| 7512 | 7087 |
| 7513 | 7324 |
| 7514 | 7372 |
| 7515 | 7544 |
| 7516 | 7408 |
| 7517 | 7591 |
| 7518 | 7621 |
| 7519 | 7771 |

TABLE Z1-continued

| with a sequence length of 8192: | |
|---|---|
| Polarized channel sequence number | Reliability or reliability sequence number |
| 7520 | 6793 |
| 7521 | 7010 |
| 7522 | 7073 |
| 7523 | 7293 |
| 7524 | 7121 |
| 7525 | 7344 |
| 7526 | 7376 |
| 7527 | 7577 |
| 7528 | 7170 |
| 7529 | 7394 |
| 7530 | 7420 |
| 7531 | 7600 |
| 7532 | 7471 |
| 7533 | 7641 |
| 7534 | 7665 |
| 7535 | 7803 |
| 7536 | 7239 |
| 7537 | 7467 |
| 7538 | 7485 |
| 7539 | 7657 |
| 7540 | 7504 |
| 7541 | 7683 |
| 7542 | 7648 |
| 7543 | 7823 |
| 7544 | 7563 |
| 7545 | 7731 |
| 7546 | 7750 |
| 7547 | 7863 |
| 7548 | 7757 |
| 7549 | 7904 |
| 7550 | 7924 |
| 7551 | 7991 |
| 7552 | 5754 |
| 7553 | 6436 |
| 7554 | 6454 |
| 7555 | 6903 |
| 7556 | 6662 |
| 7557 | 6949 |
| 7558 | 6985 |
| 7559 | 7246 |
| 7560 | 6742 |
| 7561 | 6998 |
| 7562 | 7025 |
| 7563 | 7286 |
| 7564 | 7084 |
| 7565 | 7329 |
| 7566 | 7368 |
| 7567 | 7581 |
| 7568 | 6786 |
| 7569 | 7080 |
| 7570 | 7118 |
| 7571 | 7331 |
| 7572 | 7149 |
| 7573 | 7377 |
| 7574 | 7412 |
| 7575 | 7606 |
| 7576 | 7193 |
| 7577 | 7425 |
| 7578 | 7456 |
| 7579 | 7635 |
| 7580 | 7499 |
| 7581 | 7661 |
| 7582 | 7699 |
| 7583 | 7829 |
| 7584 | 6913 |
| 7585 | 7130 |
| 7586 | 7159 |
| 7587 | 7409 |
| 7588 | 7212 |
| 7589 | 7447 |
| 7590 | 7489 |
| 7591 | 7650 |
| 7592 | 7285 |
| 7593 | 7491 |
| 7594 | 7512 |

TABLE Z1-continued with a sequence length of 8192:

| Polarized channel sequence number | Reliability or reliability sequence number |
|---|---|
| 7595 | 7697 |
| 7596 | 7564 |
| 7597 | 7678 |
| 7598 | 7742 |
| 7599 | 7865 |
| 7600 | 7341 |
| 7601 | 7536 |
| 7602 | 7587 |
| 7603 | 7732 |
| 7604 | 7610 |
| 7605 | 7756 |
| 7606 | 7774 |
| 7607 | 7892 |
| 7608 | 7643 |
| 7609 | 7781 |
| 7610 | 7780 |
| 7611 | 7919 |
| 7612 | 7825 |
| 7613 | 7933 |
| 7614 | 7948 |
| 7615 | 8028 |
| 7616 | 7007 |
| 7617 | 7187 |
| 7618 | 7251 |
| 7619 | 7492 |
| 7620 | 7327 |
| 7621 | 7513 |
| 7622 | 7550 |
| 7623 | 7710 |
| 7624 | 7373 |
| 7625 | 7578 |
| 7626 | 7596 |
| 7627 | 7751 |
| 7628 | 7627 |
| 7629 | 7760 |
| 7630 | 7779 |
| 7631 | 7901 |
| 7632 | 7413 |
| 7633 | 7614 |
| 7634 | 7651 |
| 7635 | 7772 |
| 7636 | 7666 |
| 7637 | 7784 |
| 7638 | 7826 |
| 7639 | 7934 |
| 7640 | 7709 |
| 7641 | 7835 |
| 7642 | 7850 |
| 7643 | 7952 |
| 7644 | 7879 |
| 7645 | 7975 |
| 7646 | 7989 |
| 7647 | 8062 |
| 7648 | 7478 |
| 7649 | 7658 |
| 7650 | 7693 |
| 7651 | 7828 |
| 7652 | 7741 |
| 7653 | 7830 |
| 7654 | 7872 |
| 7655 | 7960 |
| 7656 | 7748 |
| 7657 | 7868 |
| 7658 | 7894 |
| 7659 | 7983 |
| 7660 | 7912 |
| 7661 | 7999 |
| 7662 | 8020 |
| 7663 | 8083 |
| 7664 | 7761 |
| 7665 | 7905 |
| 7666 | 7929 |
| 7667 | 8007 |
| 7668 | 7943 |
| 7669 | 8024 |

TABLE Z1-continued with a sequence length of 8192:

| Polarized channel sequence number | Reliability or reliability sequence number |
|---|---|
| 7670 | 8014 |
| 7671 | 8091 |
| 7672 | 7968 |
| 7673 | 8038 |
| 7674 | 8048 |
| 7675 | 8109 |
| 7676 | 8067 |
| 7677 | 8118 |
| 7678 | 8128 |
| 7679 | 8151 |
| 7680 | 4889 |
| 7681 | 5236 |
| 7682 | 5385 |
| 7683 | 5909 |
| 7684 | 5497 |
| 7685 | 6065 |
| 7686 | 6142 |
| 7687 | 6542 |
| 7688 | 5561 |
| 7689 | 6172 |
| 7690 | 6222 |
| 7691 | 6565 |
| 7692 | 6291 |
| 7693 | 6633 |
| 7694 | 6650 |
| 7695 | 7029 |
| 7696 | 5585 |
| 7697 | 6285 |
| 7698 | 6333 |
| 7699 | 6629 |
| 7700 | 6377 |
| 7701 | 6801 |
| 7702 | 6829 |
| 7703 | 7099 |
| 7704 | 6490 |
| 7705 | 6836 |
| 7706 | 6899 |
| 7707 | 7172 |
| 7708 | 6945 |
| 7709 | 7216 |
| 7710 | 7254 |
| 7711 | 7496 |
| 7712 | 5609 |
| 7713 | 6359 |
| 7714 | 6440 |
| 7715 | 6814 |
| 7716 | 6498 |
| 7717 | 6896 |
| 7718 | 6931 |
| 7719 | 7201 |
| 7720 | 6545 |
| 7721 | 6960 |
| 7722 | 6991 |
| 7723 | 7261 |
| 7724 | 7034 |
| 7725 | 7306 |
| 7726 | 7338 |
| 7727 | 7517 |
| 7728 | 6592 |
| 7729 | 7012 |
| 7730 | 7062 |
| 7731 | 7322 |
| 7732 | 7113 |
| 7733 | 7367 |
| 7734 | 7390 |
| 7735 | 7569 |
| 7736 | 7135 |
| 7737 | 7382 |
| 7738 | 7426 |
| 7739 | 7612 |
| 7740 | 7431 |
| 7741 | 7633 |
| 7742 | 7660 |
| 7743 | 7857 |
| 7744 | 5985 |

TABLE Z1-continued

| with a sequence length of 8192: | |
| --- | --- |
| Polarized channel sequence number | Reliability or reliability sequence number |
| 7745 | 6494 |
| 7746 | 6527 |
| 7747 | 6943 |
| 7748 | 6573 |
| 7749 | 6994 |
| 7750 | 7031 |
| 7751 | 7292 |
| 7752 | 6672 |
| 7753 | 7067 |
| 7754 | 7090 |
| 7755 | 7356 |
| 7756 | 7141 |
| 7757 | 7399 |
| 7758 | 7422 |
| 7759 | 7583 |
| 7760 | 6734 |
| 7761 | 7095 |
| 7762 | 7156 |
| 7763 | 7385 |
| 7764 | 7198 |
| 7765 | 7430 |
| 7766 | 7440 |
| 7767 | 7622 |
| 7768 | 7231 |
| 7769 | 7443 |
| 7770 | 7455 |
| 7771 | 7663 |
| 7772 | 7535 |
| 7773 | 7684 |
| 7774 | 7725 |
| 7775 | 7867 |
| 7776 | 6790 |
| 7777 | 7197 |
| 7778 | 7221 |
| 7779 | 7453 |
| 7780 | 7273 |
| 7781 | 7486 |
| 7782 | 7495 |
| 7783 | 7673 |
| 7784 | 7309 |
| 7785 | 7532 |
| 7786 | 7557 |
| 7787 | 7708 |
| 7788 | 7598 |
| 7789 | 7738 |
| 7790 | 7753 |
| 7791 | 7896 |
| 7792 | 7352 |
| 7793 | 7572 |
| 7794 | 7611 |
| 7795 | 7755 |
| 7796 | 7645 |
| 7797 | 7770 |
| 7798 | 7805 |
| 7799 | 7913 |
| 7800 | 7691 |
| 7801 | 7810 |
| 7802 | 7836 |
| 7803 | 7935 |
| 7804 | 7851 |
| 7805 | 7956 |
| 7806 | 7978 |
| 7807 | 8059 |
| 7808 | 6011 |
| 7809 | 6559 |
| 7810 | 6637 |
| 7811 | 7058 |
| 7812 | 6727 |
| 7813 | 7094 |
| 7814 | 7145 |
| 7815 | 7406 |
| 7816 | 6771 |
| 7817 | 7164 |
| 7818 | 7203 |
| 7819 | 7444 |

TABLE Z1-continued

| with a sequence length of 8192: | |
| --- | --- |
| Polarized channel sequence number | Reliability or reliability sequence number |
| 7820 | 7242 |
| 7821 | 7464 |
| 7822 | 7473 |
| 7823 | 7668 |
| 7824 | 6864 |
| 7825 | 7223 |
| 7826 | 7270 |
| 7827 | 7474 |
| 7828 | 7308 |
| 7829 | 7527 |
| 7830 | 7549 |
| 7831 | 7703 |
| 7832 | 7351 |
| 7833 | 7566 |
| 7834 | 7597 |
| 7835 | 7744 |
| 7836 | 7625 |
| 7837 | 7763 |
| 7838 | 7791 |
| 7839 | 7897 |
| 7840 | 6933 |
| 7841 | 7289 |
| 7842 | 7335 |
| 7843 | 7555 |
| 7844 | 7393 |
| 7845 | 7590 |
| 7846 | 7586 |
| 7847 | 7766 |
| 7848 | 7417 |
| 7849 | 7615 |
| 7850 | 7631 |
| 7851 | 7786 |
| 7852 | 7675 |
| 7853 | 7806 |
| 7854 | 7818 |
| 7855 | 7938 |
| 7856 | 7460 |
| 7857 | 7647 |
| 7858 | 7688 |
| 7859 | 7815 |
| 7860 | 7704 |
| 7861 | 7843 |
| 7862 | 7852 |
| 7863 | 7961 |
| 7864 | 7730 |
| 7865 | 7864 |
| 7866 | 7884 |
| 7867 | 7984 |
| 7868 | 7918 |
| 7869 | 8001 |
| 7870 | 8022 |
| 7871 | 8085 |
| 7872 | 6982 |
| 7873 | 7360 |
| 7874 | 7397 |
| 7875 | 7620 |
| 7876 | 7438 |
| 7877 | 7640 |
| 7878 | 7676 |
| 7879 | 7811 |
| 7880 | 7523 |
| 7881 | 7689 |
| 7882 | 7715 |
| 7883 | 7848 |
| 7884 | 7721 |
| 7885 | 7856 |
| 7886 | 7874 |
| 7887 | 7974 |
| 7888 | 7538 |
| 7889 | 7716 |
| 7890 | 7727 |
| 7891 | 7871 |
| 7892 | 7767 |
| 7893 | 7882 |
| 7894 | 7909 |

TABLE Z1-continued with a sequence length of 8192:

| Polarized channel sequence number | Reliability or reliability sequence number |
|---|---|
| 7895 | 7998 |
| 7896 | 7798 |
| 7897 | 7917 |
| 7898 | 7927 |
| 7899 | 8008 |
| 7900 | 7947 |
| 7901 | 8029 |
| 7902 | 8042 |
| 7903 | 8094 |
| 7904 | 7568 |
| 7905 | 7777 |
| 7906 | 7789 |
| 7907 | 7898 |
| 7908 | 7820 |
| 7909 | 7920 |
| 7910 | 7932 |
| 7911 | 8016 |
| 7912 | 7837 |
| 7913 | 7945 |
| 7914 | 7962 |
| 7915 | 8037 |
| 7916 | 7979 |
| 7917 | 8049 |
| 7918 | 8065 |
| 7919 | 8113 |
| 7920 | 7886 |
| 7921 | 7964 |
| 7922 | 7985 |
| 7923 | 8052 |
| 7924 | 8004 |
| 7925 | 8069 |
| 7926 | 8075 |
| 7927 | 8125 |
| 7928 | 8017 |
| 7929 | 8080 |
| 7930 | 8090 |
| 7931 | 8131 |
| 7932 | 8102 |
| 7933 | 8140 |
| 7934 | 8150 |
| 7935 | 8171 |
| 7936 | 6123 |
| 7937 | 6676 |
| 7938 | 6749 |
| 7939 | 7167 |
| 7940 | 6857 |
| 7941 | 7220 |
| 7942 | 7262 |
| 7943 | 7506 |
| 7944 | 6885 |
| 7945 | 7277 |
| 7946 | 7319 |
| 7947 | 7531 |
| 7948 | 7357 |
| 7949 | 7560 |
| 7950 | 7605 |
| 7951 | 7794 |
| 7952 | 6966 |
| 7953 | 7340 |
| 7954 | 7403 |
| 7955 | 7582 |
| 7956 | 7429 |
| 7957 | 7637 |
| 7958 | 7626 |
| 7959 | 7801 |
| 7960 | 7448 |
| 7961 | 7652 |
| 7962 | 7681 |
| 7963 | 7832 |
| 7964 | 7713 |
| 7965 | 7845 |
| 7966 | 7860 |
| 7967 | 7969 |
| 7968 | 7116 |
| 7969 | 7418 |

TABLE Z1-continued with a sequence length of 8192:

| Polarized channel sequence number | Reliability or reliability sequence number |
|---|---|
| 7970 | 7450 |
| 7971 | 7636 |
| 7972 | 7522 |
| 7973 | 7672 |
| 7974 | 7695 |
| 7975 | 7849 |
| 7976 | 7529 |
| 7977 | 7714 |
| 7978 | 7724 |
| 7979 | 7862 |
| 7980 | 7739 |
| 7981 | 7877 |
| 7982 | 7890 |
| 7983 | 7993 |
| 7984 | 7540 |
| 7985 | 7734 |
| 7986 | 7759 |
| 7987 | 7888 |
| 7988 | 7797 |
| 7989 | 7908 |
| 7990 | 7925 |
| 7991 | 8010 |
| 7992 | 7816 |
| 7993 | 7941 |
| 7994 | 7946 |
| 7995 | 8030 |
| 7996 | 7963 |
| 7997 | 8043 |
| 7998 | 8055 |
| 7999 | 8107 |
| 8000 | 7137 |
| 8001 | 7518 |
| 8002 | 7525 |
| 8003 | 7705 |
| 8004 | 7542 |
| 8005 | 7718 |
| 8006 | 7743 |
| 8007 | 7881 |
| 8008 | 7571 |
| 8009 | 7768 |
| 8010 | 7787 |
| 8011 | 7903 |
| 8012 | 7809 |
| 8013 | 7921 |
| 8014 | 7944 |
| 8015 | 8026 |
| 8016 | 7687 |
| 8017 | 7796 |
| 8018 | 7821 |
| 8019 | 7926 |
| 8020 | 7838 |
| 8021 | 7953 |
| 8022 | 7965 |
| 8023 | 8039 |
| 8024 | 7880 |
| 8025 | 7966 |
| 8026 | 7986 |
| 8027 | 8053 |
| 8028 | 8005 |
| 8029 | 8068 |
| 8030 | 8074 |
| 8031 | 8124 |
| 8032 | 7722 |
| 8033 | 7842 |
| 8034 | 7870 |
| 8035 | 7954 |
| 8036 | 7887 |
| 8037 | 7982 |
| 8038 | 7995 |
| 8039 | 8058 |
| 8040 | 7911 |
| 8041 | 8000 |
| 8042 | 8012 |
| 8043 | 8073 |
| 8044 | 8025 |

TABLE Z1-continued

| with a sequence length of 8192: | |
|---|---|
| Polarized channel sequence number | Reliability or reliability sequence number |
| 8045 | 8081 |
| 8046 | 8093 |
| 8047 | 8134 |
| 8048 | 7930 |
| 8049 | 8018 |
| 8050 | 8034 |
| 8051 | 8089 |
| 8052 | 8047 |
| 8053 | 8096 |
| 8054 | 8106 |
| 8055 | 8142 |
| 8056 | 8060 |
| 8057 | 8110 |
| 8058 | 8117 |
| 8059 | 8148 |
| 8060 | 8122 |
| 8061 | 8157 |
| 8062 | 8159 |
| 8063 | 8179 |
| 8064 | 7154 |
| 8065 | 7545 |
| 8066 | 7558 |
| 8067 | 7790 |
| 8068 | 7671 |
| 8069 | 7804 |
| 8070 | 7817 |
| 8071 | 7939 |
| 8072 | 7698 |
| 8073 | 7831 |
| 8074 | 7846 |
| 8075 | 7958 |
| 8076 | 7873 |
| 8077 | 7973 |
| 8078 | 7992 |
| 8079 | 8056 |
| 8080 | 7726 |
| 8081 | 7859 |
| 8082 | 7885 |
| 8083 | 7976 |
| 8084 | 7900 |
| 8085 | 7996 |
| 8086 | 8013 |
| 8087 | 8071 |
| 8088 | 7922 |
| 8089 | 8023 |
| 8090 | 8011 |
| 8091 | 8078 |
| 8092 | 8041 |
| 8093 | 8092 |
| 8094 | 8101 |
| 8095 | 8137 |
| 8096 | 7799 |
| 8097 | 7893 |
| 8098 | 7907 |
| 8099 | 8002 |
| 8100 | 7937 |
| 8101 | 8015 |
| 8102 | 8032 |
| 8103 | 8086 |
| 8104 | 7951 |
| 8105 | 8035 |
| 8106 | 8046 |
| 8107 | 8097 |
| 8108 | 8054 |
| 8109 | 8103 |
| 8110 | 8114 |
| 8111 | 8147 |
| 8112 | 7980 |
| 8113 | 8050 |
| 8114 | 8063 |
| 8115 | 8108 |
| 8116 | 8076 |
| 8117 | 8119 |
| 8118 | 8123 |
| 8119 | 8155 |

TABLE Z1-continued

| with a sequence length of 8192: | |
|---|---|
| Polarized channel sequence number | Reliability or reliability sequence number |
| 8120 | 8082 |
| 8121 | 8130 |
| 8122 | 8133 |
| 8123 | 8161 |
| 8124 | 8141 |
| 8125 | 8164 |
| 8126 | 8166 |
| 8127 | 8176 |
| 8128 | 7839 |
| 8129 | 7910 |
| 8130 | 7950 |
| 8131 | 8036 |
| 8132 | 7972 |
| 8133 | 8045 |
| 8134 | 8051 |
| 8135 | 8104 |
| 8136 | 7990 |
| 8137 | 8066 |
| 8138 | 8070 |
| 8139 | 8116 |
| 8140 | 8079 |
| 8141 | 8120 |
| 8142 | 8132 |
| 8143 | 8158 |
| 8144 | 7994 |
| 8145 | 8077 |
| 8146 | 8087 |
| 8147 | 8129 |
| 8148 | 8100 |
| 8149 | 8135 |
| 8150 | 8136 |
| 8151 | 8165 |
| 8152 | 8112 |
| 8153 | 8143 |
| 8154 | 8146 |
| 8155 | 8167 |
| 8156 | 8153 |
| 8157 | 8172 |
| 8158 | 8174 |
| 8159 | 8184 |
| 8160 | 8027 |
| 8161 | 8095 |
| 8162 | 8099 |
| 8163 | 8139 |
| 8164 | 8115 |
| 8165 | 8144 |
| 8166 | 8149 |
| 8167 | 8169 |
| 8168 | 8121 |
| 8169 | 8154 |
| 8170 | 8156 |
| 8171 | 8173 |
| 8172 | 8162 |
| 8173 | 8175 |
| 8174 | 8180 |
| 8175 | 8186 |
| 8176 | 8127 |
| 8177 | 8160 |
| 8178 | 8163 |
| 8179 | 8177 |
| 8180 | 8168 |
| 8181 | 8178 |
| 8182 | 8181 |
| 8183 | 8187 |
| 8184 | 8170 |
| 8185 | 8182 |
| 8186 | 8183 |
| 8187 | 8188 |
| 8188 | 8185 |
| 8189 | 8189 |
| 8190 | 8190 |
| 8191 | 8191 |

Sequence Z2, with a sequence length of 4096:

[0, 1, 2, 7, 3, 8, 13, 26, 4, 12, 15, 30, 18, 35, 37, 82, 5, 14, 16, 34, 21, 41, 51, 87, 24, 50, 45, 94, 61, 103, 110, 177, 6, 19, 23, 43, 25, 49, 55, 96, 31, 59, 63, 104, 76, 117, 123, 195, 36, 65, 80, 121, 85, 131, 141, 208, 93, 143, 155, 235, 161, 248, 271, 391, 9, 20, 28, 58, 32, 62, 75, 112, 38, 81, 67, 1 24, 90, 135, 149, 217, 48, 78, 92, 142, 98, 152, 160, 243, 108, 163, 180, 260, 194, 278, 296, 434, 5 7, 95, 106, 159, 119, 171, 188, 274, 129, 189, 207, 288, 220, 313, 330, 471, 146, 215, 239, 318, 24 6, 331, 356, 502, 266, 363, 385, 528, 405, 551, 593, 816, 17, 27, 33, 77, 42, 84, 88, 147, 52, 91, 99, 158, 109, 170, 174, 273, 60, 100, 111, 172, 122, 187, 204, 290, 134, 205, 216, 307, 241, 326, 350, 491, 69, 115, 130, 193, 136, 206, 223, 319, 156, 237, 247, 334, 265, 362, 378, 525, 173, 257, 275, 369, 289, 399, 408, 548, 315, 421, 453, 582, 477, 613, 681, 817, 73, 132, 151, 226, 168, 244, 264, 367, 178, 267, 281, 390, 297, 407, 432, 571, 202, 293, 308, 418, 332, 447, 473, 624, 344, 480, 50 7, 650, 535, 693, 719, 942, 222, 321, 338, 457, 371, 488, 511, 672, 404, 521, 549, 708, 583, 724, 7 85, 1011, 431, 561, 595, 756, 609, 805, 833, 1072, 677, 848, 880, 1059, 914, 1122, 1203, 1479, 2 2, 39, 44, 97, 53, 101, 113, 186, 54, 114, 125, 196, 138, 218, 228, 348, 68, 126, 139, 232, 153, 240, 254, 349, 162, 252, 272, 383, 294, 403, 413, 547, 71, 150, 164, 234, 182, 258, 276, 402, 192, 286, 298, 415, 311, 445, 463, 607, 191, 309, 323, 442, 343, 476, 493, 653, 373, 515, 537, 692, 558, 71 6, 762, 992, 83, 176, 184, 283, 200, 304, 322, 436, 210, 329, 337, 472, 357, 501, 520, 688, 269, 35 1, 372, 506, 392, 533, 557, 712, 424, 565, 600, 752, 629, 803, 837, 1048, 302, 387, 417, 544, 441, 580, 603, 788, 468, 618, 638, 813, 682, 863, 893, 1102, 509, 680, 696, 881, 713, 916, 871, 1140, 771, 986, 1014, 1221, 1026, 1306, 1353, 1539, 89, 197, 203, 342, 259, 361, 376, 514, 285, 381, 3 95, 540, 423, 569, 599, 791, 300, 420, 440, 570, 456, 605, 632, 822, 481, 642, 670, 854, 710, 888, 939, 1151, 347, 446, 462, 630, 492, 661, 699, 873, 538, 700, 720, 935, 774, 910, 1002, 1226, 578, 745, 799, 987, 823, 1023, 1054, 1279, 864, 1066, 1063, 1341, 1143, 1376, 1417, 1670, 386, 47 8, 516, 703, 567, 723, 760, 955, 601, 789, 807, 1017, 846, 1032, 1062, 1300, 633, 830, 875, 1051, 894, 1069, 1146, 1380, 952, 1163, 1194, 1428, 1250, 1493, 1531, 1810, 689, 884, 930, 1149, 99 9, 1154, 1238, 1445, 1009, 1229, 1285, 1516, 1329, 1567, 1639, 1919, 1033, 1309, 1367, 1592, 1400, 1651, 1617, 1957, 1471, 1707, 1746, 2065, 1830, 2125, 2198, 2406, 29, 47, 56, 107, 64, 1 27, 140, 224, 70, 144, 154, 231, 167, 250, 255, 396, 72, 165, 175, 249, 185, 305, 316, 430, 211, 31 7, 341, 469, 360, 495, 518, 707, 74, 181, 198310, 213, 339, 310, 213, 339, 353, 486, 225, 366, 379, 523, 398, 55 2, 575, 726, 238, 389, 411, 564, 437, 596, 615, 780, 448, 608, 644, 827, 649, 853, 886, 1209, 116, 212, 221, 358, 233, 380, 397, 543, 262, 414, 425, 588, 452, 621, 641, 795, 282, 429, 461, 612, 48 4, 647, 656, 840, 505, 658, 669, 890, 744, 919, 976, 1228, 301, 483, 498, 666, 530, 697, 704, 903, 556, 741, 766, 951, 812, 995, 1019, 1288, 587, 784, 826, 1021, 867, 1045, 1108, 1332, 928, 111 6, 1166, 1384, 1197, 1439, 1500, 1799, 120, 230, 251, 409, 279, 426, 455, 626, 295, 465, 487, 66 0, 510, 676, 684, 897, 328, 500, 529, 686, 554, 735, 759, 943, 584, 776, 809, 1007, 842, 1036, 10 84, 1291, 354, 542, 574, 764, 617, 802, 798, 1039, 635, 832, 850, 1074, 906, 1111, 1133, 1390, 6 73, 869, 923, 1125, 946, 1180, 1200, 1448, 983, 1224, 1262, 1519, 1338, 1575, 1643, 1925, 375, 592, 620, 836, 654, 860, 907, 1119, 731, 926, 962, 1189, 968, 1206, 1244, 1488, 747, 964, 980, 1235, 1041, 1259, 1318, 1564, 1095, 1335, 1364, 1595, 1414, 1676, 1721, 1977, 778, 1056, 10 80, 1294, 1134, 1344, 1373, 1626, 1169, 1407, 1453, 1704, 1505, 1752, 1819, 2087, 1268, 146 0, 1524, 1768, 1584, 1841, 1872, 2182, 1631, 1900, 1951, 2224, 2025, 2299, 2394, 2688, 137, 2 63, 287, 466, 324, 496, 524, 715, 336, 534, 562, 739, 590, 770, 819, 1087, 368, 577, 625, 793, 64 6, 858, 844, 1101, 663, 877, 913, 1160, 958, 1183, 1215, 1474, 439, 637, 665, 857, 730, 901, 932, 1192, 738, 959, 974, 1218, 998, 1247, 1277, 1547, 749, 990, 1029, 1274, 1092, 1315, 1356, 16 00, 1127, 1397, 1411, 1679, 1456, 1727, 1782, 2051, 450, 728, 734, 948, 751, 967, 1004, 1256, 781, 1044, 1077, 1303, 1113, 1347, 1404, 1662, 920, 1090, 1137, 1361, 1171, 1431, 1463, 1712, 1253, 1468, 1527, 1771, 1587, 1836, 1866, 2173, 971, 1177, 1232, 1434, 1271, 1511, 1555, 17 93, 1326, 1570, 1609, 1860, 1657, 1906, 1971, 2251, 1370, 1634, 1690, 1945, 1743, 1991, 204 7, 2319, 1804, 2073, 2117, 2373, 2157, 2470, 2494, 2875, 458, 755, 767, 1081, 899, 1105, 1130, 1393, 936, 1157, 1186, 1442, 1241, 1485, 1542, 1788, 978, 1212, 1265, 1496, 1297, 1559, 161 2, 1853, 1350, 1648, 1604, 1889, 1718, 1963, 2019, 2279, 1098, 1282, 1312, 1579, 1387, 1621, 1684, 1931, 1425, 1693, 1737, 1997, 1777, 2033, 2095, 2362, 1508, 1757, 1815, 2059, 1877, 2 133, 2165, 2443, 1914, 2215, 2243, 2524, 2308, 2567, 2601, 2797, 1174, 1323, 1422, 1698, 14 82, 1732, 1762, 2039, 1535, 1825, 1847, 2111, 1894, 2141, 2232, 2482, 1550, 1883, 1937, 220 7, 2011, 2260, 2269, 2583, 2081, 2330, 2350, 2617, 2420, 2710, 2750, 3042, 1665, 1985, 2005, 2288, 2103, 2339, 2385, 2652, 2149, 2432, 2455, 2730, 2539, 2773, 2904, 3134, 2190, 2509, 2 552, 2822, 2633, 2846, 2933, 3187, 2671, 2967, 3002, 3252, 3083, 3328, 3433, 3584, 10, 40, 66, 145, 86, 157, 190, 299, 102, 179, 209, 327, 236, 359, 370, 576, 118, 201, 219, 352, 261, 388, 438, 594, 284, 433, 412, 623, 489, 655, 678, 889, 133, 245, 277, 400, 291, 428, 460, 631, 333, 479, 49 9, 659, 555, 705, 725, 938, 364, 508, 568, 718, 589, 750, 783, 972, 619, 790, 824, 1040, 841, 107 0, 1123, 1392, 169, 253, 312, 474, 340, 494, 550, 687, 377, 573, 513, 729, 606, 761, 804, 994, 42 2, 563, 614, 786, 639, 814, 839, 1058, 671, 849, 895, 1099, 934, 1142, 1182, 1477, 470, 627, 664, 835, 709, 868, 918, 1132, 742, 922, 970, 1164, 1000, 1219, 1260, 1549, 796, 988, 1049, 1234, 1 065, 1263, 1317, 1607, 1115, 1334, 1378, 1653, 1420, 1695, 1766, 2107, 227, 306, 346, 560, 39 4, 586, 597, 800, 444, 611, 643, 831, 675, 866, 879, 1129, 485, 648, 683, 872, 721, 915, 960, 117 0, 757, 963, 991, 1205, 1055, 1251, 1305, 1585, 522, 698, 746, 931, 765, 966, 1010, 1237, 828, 1 043, 1067, 1269, 1112, 1331, 1363, 1650, 876, 1091, 1136, 1346, 1167, 1409, 1426, 1688, 1222, 1452, 1514, 1748, 1560, 1801, 1910, 2109, 541, 754, 810, 1018, 862, 1060, 1109, 1340, 892, 1 118, 1147, 1389, 1184, 1423, 1476, 1730, 954, 1173, 1208, 1447, 1266, 1503, 1554, 1817, 1293, 1565, 1616, 1862, 1667, 1929, 1969, 2271, 1006, 1240, 1278, 1522, 1349, 1582, 1624, 1896, 1 418, 1641, 1691, 1953, 1750, 1979, 2067, 2355, 1472, 1711, 1770, 2027, 1795, 2093, 2131, 24 24, 1904, 2151, 2192, 2410, 2236, 2480, 2570, 2856, 270, 382, 406, 636, 449, 652, 691, 911, 45 4, 694, 733, 940, 773, 996, 1022, 1299, 517, 736, 775, 1030, 818, 1052, 1085, 1302, 845, 1083, 1 126, 1375, 1176, 1415, 1436, 1686, 531, 808, 851, 1037, 902, 1094, 1139, 1412, 927, 1159, 118 7, 1440, 1216, 1498, 1534, 1790, 924, 1210, 1245, 1495, 1290, 1557, 1590, 1864, 1355, 1629, 1 669, 1927, 1709, 1967, 2035, 2332, 581, 885, 905, 1153, 950, 1199, 1243, 1480, 975, 1257, 127 5, 1552, 1320, 1605, 1638, 1921, 1120, 1308, 1352, 1614, 1395, 1660, 1705, 1959, 1458, 1720, 1779, 2021, 1827, 2091, 2137, 2399, 1196, 1383, 1444, 1683, 1492, 1744, 1784, 2069, 1544, 1 808, 1843, 2105, 1912, 2169, 2209, 2460, 1619, 1908, 1933, 2194, 1961, 2238, 2180, 2502, 20 48, 2323, 2357, 2588, 2371, 2682, 2733, 2914, 602, 944, 956, 1287, 1097, 1328, 1360, 1627, 11 56, 1372, 1398, 1674, 1455, 1725, 1775, 2075, 1190, 1450, 1490, 1728, 1521, 1786, 1832, 211 5, 1569, 1849, 1893, 2159, 1955, 2203, 2266, 2514, 1296, 1501, 1532, 1828, 1589, 1879, 1939, 2184, 1672, 1941, 1973, 2262, 2049, 2230, 2344, 2593, 1741, 2009, 2085, 2326, 2119, 2369, 2 403, 2654, 2171, 2417, 2415, 2718, 2504, 2756, 2794, 3031, 1381, 1562, 1633, 1943, 1723, 19 75, 2031, 2286, 1781, 2071, 2097, 2360, 2147, 2378, 2413, 2676, 1834, 2127, 2186, 2401, 221 1, 2422, 2507, 2759, 2284, 2527, 2560, 2806, 2622, 2868, 2907, 3150, 1923, 2196, 2256, 2512, 2341, 2517, 2609, 2825, 2353, 2598, 2660, 2891, 2704, 2940, 3006, 3234, 2380, 2685, 2744, 2 960, 2779, 3016, 2985, 3266, 2849, 3064, 3098, 3347, 3166, 3389, 3444, 3576, 320, 416, 464, 6 67, 503, 740, 779, 1013, 527, 794, 821, 1028, 859, 1076, 1088, 1401, 536, 855, 882, 1073, 909, 1 202, 1225, 1469, 979, 1231, 1284, 1545, 1325, 1594, 1636, 1949, 545, 898, 947, 1213, 984, 128 1, 1311, 1577, 1015, 1337, 1366, 1645, 1406, 1697, 1736, 1981, 1047, 1386, 1433, 1716, 1484, 1773, 1802, 2057, 1506, 1791, 1851, 2123, 1858, 2155, 2200, 2575, 702, 982, 1003, 1321, 103 4, 1369, 1403, 1681, 1104, 1437, 1461, 1759, 1513, 1814, 1845, 2079, 1150, 1466, 1529, 1797, 1574, 1856, 1870, 2139, 1610, 1873, 1891, 2205, 2007, 2241, 2312, 2596, 1193, 1572, 1599, 1 887, 1658, 1935, 1947, 2221, 1702, 2003, 2041, 2282, 2101, 2335, 2364, 2663, 1755, 2063, 21 21, 2366, 2176, 2396, 2465, 2707, 2253, 2475, 2529, 2762, 2562, 2816, 2878, 3142, 714, 1025, 1078, 1429, 1144, 1464, 1518, 1823, 1179, 1537, 1580, 1875, 1622, 1902, 1916, 2213, 1254, 1 602, 1655, 1918, 1700, 1995, 2029, 2273, 1753, 2053, 2099, 2348, 2143, 2382, 2439, 2665, 13 14, 1677, 1734, 2037, 1806, 2089, 2083, 2387, 1838, 2129, 2153, 2427, 2226, 2467, 2492, 276 8, 1898, 2178, 2247, 2484, 2275, 2544, 2565, 2828, 2321, 2591, 2636, 2894, 2716, 2947, 3009, 3239, 1358, 1764, 1812, 2135, 1868, 2167, 2228, 2477, 1989, 2249, 2295, 2554, 2304, 2572, 2 614, 2865, 2013, 2297, 2317, 2606, 2389, 2630, 2696, 2937, 2451, 2713, 2741, 2964, 2791, 30 34, 3075, 3280, 2055, 2408, 2434, 2668, 2497, 2721, 2753, 2992, 2532, 2785, 2831, 3060, 288 1, 3102, 3158, 3363, 2641, 2837, 2897, 3114, 2954, 3174, 3200, 3427, 2995, 3221, 3261, 3461, 3313, 3510, 3569, 3740, 769, 1106, 1161, 1540, 1248, 116, 1965540, 1272, 1663, 1714, 20 01, 1761, 2045, 2113, 2441, 1343, 1739, 1821, 2077, 1855, 2163, 2145, 2458, 1881, 2188, 223 4, 2522, 2290, 2547, 2580, 2853, 1487, 1840, 1885, 2161, 1987, 2219, 2258, 2557, 1999, 2292, 2310, 2585, 2337, 2620, 2649, 2920, 2015, 2328, 2376, 2646, 2448, 2693, 2736, 2971, 2487, 2 776, 2788, 3038, 2834, 3079, 3126, 3337, 1509, 1983, 1993, 2277, 2017, 2301, 2346, 2628, 20 61, 2392, 2429, 2679, 2472, 2724, 2782, 3024, 2245, 2446, 2499, 2738, 2534, 2809, 2840, 306 8, 2625, 2843, 2900, 3118, 2957, 3170, 3195, 3421, 2306, 2542, 2604, 2812, 2644, 2888, 2927, 3138, 2701, 2944, 2978, 3191, 3020, 3225, 3275, 3479, 2747, 2999, 3049, 3257, 3094, 3289, 3 332, 3523, 3146, 3352, 3384, 3556, 3410, 3620, 3636, 3827, 1526, 2023, 2043, 2436, 2217, 24 63, 2489, 2771, 2264, 2519, 2549, 2819, 2612, 2862, 2917, 3130, 2315, 2578, 2638, 2872, 267 4, 2930, 2981, 3183, 2727, 3013, 2974, 3212, 3072, 3270, 3308, 3497, 2453, 2657, 2690, 2950, 2765, 2988, 3045, 3243, 2803, 3053, 3090, 3294, 3122, 3318, 3368, 3549, 2884, 3106, 3154, 3 342, 3204, 3394, 3416, 3605, 3230, 3456, 3473, 3652, 3516, 3676, 3694, 3792, 2537, 2699, 28 00, 3057, 2859, 3087, 3110, 3323, 2910, 3162, 3178, 3378, 3217, 3400, 3467, 3628, 2923, 320 8, 3248, 3450, 3303, 3485, 3491, 3685, 3358, 3529, 3542, 3702, 3591, 3750, 3770, 3896, 3027, 3284, 3298, 3504, 3373, 3536, 3563, 3721, 3405, 3598, 3613, 3760, 3660, 3781, 3840, 3929, 3 438, 3644, 3668, 3803, 3712, 3815, 3853, 3947, 3730, 3866, 3881, 3968, 3912, 3990, 4016, 40 49, 11, 46, 79, 183, 105, 199, 256, 393, 128, 242, 280, 427, 314, 467, 482, 743, 148, 268, 292, 459, 345, 512, 572, 768, 374, 566, 539, 801, 634, 843, 870, 1117, 166, 325, 365, 526, 384, 559, 598, 8 11, 435, 622, 645, 847, 717, 900, 925, 1175, 475, 657, 732, 917, 758, 953, 993, 1214, 797, 1001, 1042, 1292, 1064, 1327, 1388, 1668, 214, 335, 410, 616, 443, 640, 711, 878, 490, 737, 668, 929, 782, 969, 1020, 1239, 553, 727, 792, 997, 820, 1031, 1061, 1313, 861, 1071, 1128, 1359, 1172, 1408, 1451, 1756, 610, 806, 852, 1057, 908, 1096, 1152, 1396, 945, 1155, 1211, 1432, 1249, 14 94, 1533, 1826, 1012, 1233, 1304, 1504, 1322, 1536, 1591, 1884, 1377, 1608, 1654, 1930, 169 6, 1970, 2040, 2386, 303, 401, 451, 722, 519, 753, 772, 1016, 579, 787, 825, 1053, 865, 1093, 11 07, 1394, 628, 829, 874, 1100, 921, 1148, 1201, 1438, 965, 1204, 1236, 1478, 1310, 1523, 1578, 1863, 679, 891, 949, 1168, 973, 1207, 1258, 1507, 1046, 1298, 1324, 1543, 1374, 1606, 1640, 1926, 1103, 1351, 1399, 1620, 1435, 1685, 1703, 1964, 1497, 1729, 1792, 2022, 1837, 2076, 2 187, 2388, 701, 957, 1027, 1267, 1086, 1316, 1371, 1615, 1121, 1379, 1413, 1666, 1454, 1701, 1751, 2004, 1195, 1443, 1481, 1724, 1538, 1780, 1831, 2094, 1566, 1844, 1892, 2138, 1942, 2 206, 2246, 2551, 1255, 1512, 1551, 1800, 1625, 1859, 1901, 2174, 1694, 1917, 1966, 2229, 20 24, 2254, 2343, 2635, 1749, 1986, 2044, 2302, 2070, 2372, 2411, 2705, 2181, 2430, 2473, 269 1, 2516, 2760, 2845, 3100, 355, 497, 532, 815, 585, 834, 883, 1145, 591, 887, 933, 1178, 981, 12 42, 1273, 1573, 674, 937, 985, 1283, 1035, 1307, 1345, 1576, 1068, 1339, 1391, 1652, 1446, 16 92, 1713, 1962, 690, 1024, 1075, 1289, 1135, 1354, 1402, 1689, 1165, 1427, 1457, 1717, 1489, 1776, 1811, 2066, 1162, 1483, 1517, 1772, 1563, 1835, 1867, 2142, 1630, 1907, 1946, 2204, 1 982, 2242, 2311, 2613, 748, 1114, 1138, 1419, 1188, 1470, 1515, 1758, 1220, 1530, 1548, 1829, 1593, 1882, 1915, 2199, 1382, 1581, 1628, 1890, 1671, 1938, 1980, 2235, 1735, 1994, 2054, 2 296, 2102, 2368, 2416, 2678, 1467, 1659, 1722, 1958, 1769, 2018, 2060, 2347, 1820, 2084, 21 18, 2383, 2189, 2450, 2490, 2739, 1897, 2185, 2210, 2474, 2237, 2520, 2461, 2780, 2324, 260 5, 2639, 2863, 2653, 2946, 2990, 3149, 777, 1181, 1198, 1561, 1357, 1603, 1635, 1905, 1424, 1 647, 1675, 1950, 1733, 2000, 2052, 2352, 1462, 1726, 1767, 2002, 1798, 2062, 2108, 2395, 18 46, 2124, 2170, 2438, 2233, 2483, 2548, 2792, 1571, 1778, 1809, 2104, 1865, 2156, 2216, 246 4, 1948, 2218, 2248, 2543, 2327, 2511, 2624, 2869, 2016, 2285, 2363, 2607, 2397, 2650, 2684, 2921, 2452, 2698, 2695, 2979, 2783, 3011, 3047, 3251, 1656, 1839, 1909, 2222, 1996, 2252, 2 307, 2568, 2056, 2349, 2374, 2642, 2428, 2659, 2694, 2941, 2110, 2405, 2466, 2681, 2491, 27 02, 2786, 3014, 2564, 2804, 2836, 3056, 2892, 3112, 3143, 3350, 2201, 2478, 2536, 2789, 262 1, 2795, 2880, 3071, 2632, 2871, 2926, 3131, 2968, 3172, 3228, 3422, 2661, 2949, 3003, 3192, 3032, 3237, 3211, 3445, 3093, 3278, 3306, 3511, 3364, 3546, 3588, 3696, 419, 546, 604, 856, 6 51, 941, 989, 1261, 685, 1005, 1038, 1280, 1082, 1333, 1348, 1678, 695, 1079, 1110, 1330, 114 1, 1473, 1499, 1747, 1223, 1502, 1558, 1822, 1601, 1871, 1913, 2227, 706, 1131, 1185, 1486, 1 230, 1553, 1586, 1854, 1264, 1613, 1642, 1922, 1682, 1972, 2010, 2257, 1301, 1664, 1708, 19 92, 1760, 2046, 2080, 2336, 1783, 2068, 2128, 2402, 2136, 2437, 2481, 2851, 896, 1227, 1252, 1596, 1286, 1644, 1680, 1956, 1365, 1715, 1738, 2032, 1789, 2090, 2122, 2358, 1416, 1745, 1 807, 2074, 1850, 2132, 2148, 2419, 1888, 2150, 2168, 2486, 2283, 2523, 2594, 2870, 1465, 18 48, 1876, 2164, 1934, 2212, 2223, 2503, 1978, 2280, 2316, 2563, 2381, 2616, 2645, 2929, 203 0, 2342, 2400, 2647, 2456, 2675, 2745, 2970, 2535, 2754, 2807, 3018, 2839, 3066, 3117, 3343, 912, 1276, 1336, 1706, 1410, 1740, 17996, 2098, 1449, 1816, 1857, 2154, 1899, 2179, 2193, 24 95, 1528, 1880, 1932, 2195, 1974, 2270, 2305, 2553, 2026, 2331, 2377, 2631, 2423, 2664, 271 9, 2932, 1588, 1954, 2008, 2313, 2082, 2367, 2361, 2667, 2112, 2409, 2433, 2708, 2506, 2748, 2772, 3023, 2175, 2459, 2528, 2763, 2556, 2821, 2842, 3074, 2602, 2866, 2903, 3133, 2976, 3 179, 3231, 3425, 1632, 2038, 2088, 2414, 2144, 2447, 2508, 2757, 2265, 2531, 2576, 2830, 25 84, 2848, 2886, 3108, 2289, 2579, 2599, 2877, 2670, 2901, 2958, 3169, 2731, 2973, 3000, 319 4, 3044, 3255, 3288, 3457, 2333, 2687, 2714, 2935, 2774, 2982, 3008, 3218, 2810, 3039, 3078, 3276, 3121, 3310, 3356, 3524, 2909, 3084, 3137, 3321, 3185, 3371, 3391, 3579, 3222, 3409, 3 441, 3602, 3486, 3642, 3690, 3819, 977, 1368, 1430, 1818, 1520, 1874, 1924, 2240, 1546, 194 0, 1988, 2276, 2036, 2322, 2391, 2722, 1618, 2014, 2096, 2354, 2130, 2444, 2425, 2737, 2158, 2469, 2515, 2801, 2571, 2824, 2857, 3096, 1765, 2116, 2162, 2442, 2263, 2500, 2540, 2833, 2 274, 2573, 2590, 2860, 2619, 2889, 2918, 3156, 2291, 2610, 2656, 2915, 2728, 2955, 2993, 31 98, 2766, 3029, 3041, 3258, 3081, 3292, 3331, 3502, 1787, 2259, 2268, 2559, 2294, 2582, 262 7, 2898, 2338, 2673, 2711, 2943, 2751, 2984, 3036, 3245, 2525, 2725, 2777, 2997, 2813, 3059, 3086, 3282, 2895, 3091, 3140, 3324, 3188, 3367, 3387, 3574, 2587, 2818, 2874, 3062, 2912, 3 127, 3163, 3339, 2965, 3175, 3205, 3383, 3241, 3413, 3453, 3617, 3005, 3224, 3265, 3437, 33 04, 3465, 3499, 3653, 3346, 3515, 3541, 3680, 3565, 3726, 3737, 3887, 1803, 2300, 2318, 271 5, 2498, 2742, 2769, 3026, 2545, 2798, 2827, 3069, 2883, 3105, 3152, 3335, 2595, 2854, 2906, 3115, 2938, 3165, 3207, 3379, 2987, 3235, 3201, 3402, 3286, 3448, 3482, 3632, 2734, 2924, 2 952, 3181, 3021, 3214, 3262, 3429, 3054, 3268, 3300, 3469, 3327, 3490, 3528, 3674, 3124, 33 14, 3354, 3507, 3395, 3551, 3570, 3714, 3418, 3597, 3612, 3751, 3647, 3769, 3784, 3860, 281 5, 2962, 3051, 3272, 3103, 3296, 3317, 3494, 3147, 3360, 3375, 3538, 3406, 3555, 3607, 3732, 3159, 3398, 3432, 3593, 3477, 3622, 3626, 3776, 3520, 3658, 3669, 3790, 3703, 3828, 3843, 3 939, 3247, 3462, 3474, 3637, 3533, 3663, 3686, 3805, 3560, 3708, 3719, 3835, 3757, 3851, 38 97, 3964, 3583, 3744, 3763, 3869, 3797, 3877, 3906, 3978, 3812, 3917, 3927, 3994, 3951, 401 0, 4031, 4056, 229, 504, 662, 1008, 763, 1050, 1158, 1459, 838, 1124, 1217, 1525, 1295, 1598, 1623, 2012, 904, 1191, 1246, 1583, 1362, 1661, 1763, 2042, 1421, 1754, 1710, 2092, 1861, 21 46, 2183, 2485, 961, 1319, 1405, 1687, 1441, 1742, 1805, 2106, 1541, 1842, 1878, 2152, 1976, 2225, 2255, 2546, 1611, 1895, 1998, 2244, 2034, 2293, 2340, 2589, 2086, 2351, 2398, 2669, 2 421, 2703, 2761, 3025, 1089, 1342, 1491, 1833, 1556, 1869, 1968, 2197, 1637, 2006, 1903, 22 61, 2064, 2309, 2370, 2615, 1731, 1990, 2078, 2345, 2120, 2384, 2418, 2689, 2172, 2431, 249 3, 2735, 2541, 2781, 2823, 3099, 1824, 2100, 2160, 2412, 2231, 2457, 2521, 2770, 2281, 2526, 2586, 2805, 2623, 2861, 2902, 3157, 2359, 2608, 2680, 2876, 2697, 2905, 2956, 3203, 2752, 2 972, 3012, 3238, 3050, 3269, 3320, 3535, 1270, 1475, 1568, 1984, 1673, 2028, 2050, 2365, 17 74, 2072, 2126, 2407, 2177, 2454, 2471, 2767, 1852, 2134, 2191, 2462, 2250, 2518, 2574, 281 1, 2303, 2577, 2611, 2847, 2686, 2893, 2945, 3186, 1920, 2214, 2287, 2538, 2314, 2581, 2634, 2879, 2404, 2672, 2700, 2911, 2749, 2969, 2998, 3236, 2468, 2726, 2775, 2983, 2808, 3040, 3 055, 3264, 2864, 3077, 3129, 3307, 3167, 3344, 3415, 3537, 1952, 2298, 2379, 2643, 2449, 26 92, 2746, 2977, 2488, 2755, 2787, 3022, 2826, 3052, 3097, 3295, 2566, 2814, 2850, 3073, 290 8, 3120, 3161, 3355, 2934, 3171, 3210, 3385, 3249, 3428, 3452, 3627, 2629, 2882, 2919, 3136, 2986, 3184, 3216, 3407, 3048, 3229, 3267, 3442, 3309, 3458, 3512, 3671, 3095, 3281, 3322, 3 487, 3340, 3527, 3550, 3705, 3412, 3561, 3585, 3698, 3609, 3731, 3771, 3880, 1385, 1649, 16 99, 2114, 1785, 2140, 2202, 2513, 1794, 2208, 2267, 2550, 2325, 2618, 2648, 2939, 1911, 227 2, 2329, 2658, 2390, 2683, 2720, 2942, 2426, 2717, 2764, 3010, 2817, 3046, 3063, 3263, 1936, 2375, 2435, 2666, 2501, 2729, 2778, 3043, 2533, 2799, 2829, 3067, 2858, 3116, 3145, 3336, 2 530, 2852, 2887, 3113, 2931, 3164, 3190, 3386, 2991, 3220, 3250, 3426, 3279, 3451, 3492, 36 59, 2020, 2479, 2505, 2793, 2561, 2841, 2885, 3101, 2592, 2899, 2916, 3160, 2959, 3202, 322 7, 3423, 2758, 2948, 2989, 3209, 3028, 3244, 3277, 3446, 3082, 3287, 3329, 3483, 3361, 3526, 3553, 3692, 2838, 3017, 3070, 3260, 3111, 3305, 3333, 3513, 3153, 3349, 3372, 3534, 3417, 3 572, 3594, 3722, 3213, 3414, 3430, 3586, 3447, 3610, 3578, 3741, 3500, 3655, 3672, 3778, 36 79, 3817, 3836, 3900, 2058, 2555, 2569, 2928, 2732, 2966, 2996, 3219, 2796, 3007, 3030, 325 4, 3080, 3291, 3326, 3517, 2832, 3076, 3109, 3293, 3135, 3334, 3365, 3540, 3173, 3376, 3404, 3566, 3443, 3590, 3625, 3746, 2936, 3119, 3144, 3362, 3189, 3396, 3434, 3580, 3253, 3435, 3 454, 3623, 3501, 3606, 3665, 3780, 3302, 3476, 3522, 3656, 3543, 3678, 3695, 3806, 3573, 37 01, 3700, 3831, 3742, 3845, 3859, 3936, 3015, 3168, 3223, 3436, 3290, 3455, 3489, 3635, 333 0, 3514, 3530, 3673, 3559, 3682, 3699, 3814, 3366, 3547, 3581, 3693, 3595, 3704, 3743, 3846, 3634, 3752, 3766, 3863, 3793, 3885, 3898, 3969, 3424, 3587, 3619, 3745, 3664, 3747, 3787, 3 870, 3670, 3783, 3808, 3892, 3825, 3908, 3928, 3989, 3683, 3818, 3841, 3915, 3854, 3932, 39 22, 3997, 3878, 3945, 3955, 4014, 3973, 4023, 4033, 4055, 1510, 1719, 1813, 2166, 1886, 227 8, 2334, 2637, 1928, 2356, 2393, 2655, 2445, 2709, 2723, 3033, 1944, 2440, 2476, 2706, 2510, 2844, 2867, 3092, 2597, 2873, 2925, 3155, 2963, 3193, 3226, 3440, 1960, 2496, 2558, 2855, 2 603, 2922, 2951, 3180, 2640, 2975, 3001, 3232, 3037, 3271, 3299, 3459, 2677, 3019, 3061, 32 85, 3104, 3325, 3345, 3506, 3123, 3338, 3377, 3545, 3382, 3564, 3589, 3773, 2220, 2600, 262 6, 2961, 2662, 3004, 3035, 3259, 2740, 3065, 3085, 3315, 3128, 3353, 3374, 3519, 2790, 3089, 3141, 3341, 3177, 3381, 3390, 3554, 3206, 3392, 3403, 3592, 3475, 3611, 3649, 3782, 2835, 3 176, 3197, 3401, 3242, 3431, 3439, 3601, 3274, 3472, 3495, 3633, 3532, 3661, 3675, 3809, 33 12, 3509, 3544, 3677, 3575, 3691, 3724, 3826, 3618, 3728, 3753, 3847, 3767, 3867, 3888, 396 6, 2239, 2651, 2712, 3058, 2784, 3088, 3132, 3359, 2820, 3148, 3182, 3393, 3215, 3411, 3419, 3596, 2896, 3199, 3240, 3420, 3273, 3468, 3488, 3629, 3311, 3503, 3531, 3667, 3557, 3684, 3 711, 3810, 2953, 3256, 3297, 3493, 3348, 3525, 3521, 3687, 3369, 3548, 3562, 3706, 3603, 37 25, 3736, 3849, 3408, 3577, 3615, 3733, 3630, 3759, 3768, 3871, 3654, 3779, 3798, 3893, 383 0, 3910, 3930, 3991, 2994, 3319, 3351, 3552, 3388, 3571, 3604, 3729, 3464, 3616, 3640, 3764, 3645, 3772, 3789, 3884, 3478, 3641, 3651, 3786, 3688, 3796, 3822, 3907, 3717, 3829, 3839, 3 916, 3858, 3937, 3949, 4000, 3505, 3697, 3709, 3811, 3738, 3832, 3844, 3924, 3754, 3856, 38 72, 3944, 3889, 3956, 3971, 4018, 3800, 3874, 3894, 3959, 3913, 3975, 3981, 4030, 3925, 398 6, 3996, 4036, 4007, 4044, 4054, 4075, 2320, 2743, 2802, 3151, 2890, 3196, 3233, 3449, 2913, 3246, 3283, 3471, 3316, 3498, 3539, 3713, 2980, 3301, 3357, 3518, 3380, 3568, 3558, 3720, 3 397, 3582, 3608, 3749, 3638, 3761, 3775, 3879, 3107, 3370, 3399, 3567, 3463, 3600, 3621, 37 65, 3470, 3639, 3648, 3777, 3662, 3796621, 3804, 3902, 3480, 3657, 3681, 3802, 3716, 3821, 383 7, 3918, 3734, 3852, 3857, 3938, 3873, 3950, 3962, 4012, 3125, 3460, 3466, 3631, 3481, 3643, 3666, 3795, 3508, 3689, 3707, 3816, 3727, 3833, 3855, 3934, 3614, 3715, 3739, 3838, 3755, 3 864, 3875, 3946, 3794, 3876, 3895, 3960, 3914, 3974, 3980, 4029, 3646, 3758, 3785, 3865, 38 01, 3891, 3904, 3965, 3824, 3909, 3920, 3979, 3933, 3987, 3999, 4039, 3842, 3926, 3941, 399 5, 3954, 4002, 4011, 4046, 3967, 4015, 4022, 4052, 4027, 4061, 4063, 4083, 3139, 3484, 3496, 3710, 3599, 3723, 3735, 3850, 3624, 3748, 3762, 3868, 3788, 3883, 3901, 3963, 3650, 3774, 3 799, 3886, 3813, 3905, 3921, 3977, 3834, 3931, 3919, 3984, 3948, 3998, 4006, 4042, 3718, 38 07, 3820, 3911, 3848, 3923, 3940, 3992, 3862, 3942, 3953, 4003, 3961, 4008, 4019, 4051, 389 0, 3957, 3970, 4013, 3982, 4024, 4028, 4059, 3988, 4035, 4038, 4065, 4045, 4068, 4070, 4080, 3756, 3823, 3861, 3943, 3882, 3952, 3958, 4009, 3899, 3972, 3976, 4021, 3985, 4025, 4037, 4 062, 3903, 3983, 3993, 4034, 4005, 4040, 4041, 4069, 4017, 4047, 4050, 4071, 4057, 4076, 40 78, 4088, 3935, 4001, 4004, 4043, 4020, 4048, 4053, 4073, 4026, 4058, 4060, 4077, 4066, 407 9, 4084, 4090, 4032, 4064, 4067, 4081, 4072, 4082, 4085, 4091, 4074, 4086, 4087, 4092, 4089, 4093, 4094, 4095];

TABLE Z2 with a sequence length of 4096:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 8 |
| 6 | 13 |
| 7 | 26 |
| 8 | 4 |
| 9 | 12 |
| 10 | 15 |
| 11 | 30 |
| 12 | 18 |
| 13 | 35 |
| 14 | 37 |
| 15 | 82 |
| 16 | 5 |
| 17 | 14 |
| 18 | 16 |
| 19 | 34 |
| 20 | 21 |
| 21 | 41 |
| 22 | 51 |
| 23 | 87 |
| 24 | 24 |
| 25 | 50 |
| 26 | 45 |
| 27 | 94 |
| 28 | 61 |
| 29 | 103 |
| 30 | 110 |
| 31 | 177 |
| 32 | 6 |
| 33 | 19 |
| 34 | 23 |
| 35 | 43 |
| 36 | 25 |
| 37 | 49 |
| 38 | 55 |
| 39 | 96 |
| 40 | 31 |
| 41 | 59 |
| 42 | 63 |
| 43 | 104 |
| 44 | 76 |
| 45 | 117 |
| 46 | 123 |
| 47 | 195 |
| 48 | 36 |
| 49 | 65 |
| 50 | 80 |
| 51 | 121 |
| 52 | 85 |
| 53 | 131 |
| 54 | 141 |
| 55 | 208 |
| 56 | 93 |
| 57 | 143 |
| 58 | 155 |
| 59 | 235 |
| 60 | 161 |
| 61 | 248 |
| 62 | 271 |
| 63 | 391 |
| 64 | 9 |
| 65 | 20 |
| 66 | 28 |
| 67 | 58 |
| 68 | 32 |
| 69 | 62 |
| 70 | 75 |
| 71 | 112 |
| 72 | 38 |
| 73 | 81 |
| 74 | 67 |
| 75 | 124 |
| 76 | 90 |
| 77 | 135 |
| 78 | 149 |
| 79 | 217 |
| 80 | 48 |
| 81 | 78 |
| 82 | 92 |
| 83 | 142 |
| 84 | 98 |
| 85 | 152 |
| 86 | 160 |
| 87 | 243 |
| 88 | 108 |

TABLE Z2-continued

| with a sequence length of 4096: | |
|---|---|
| Polarized channel sequence number | Reliability or reliability sequence number |
| 89 | 163 |
| 90 | 180 |
| 91 | 260 |
| 92 | 194 |
| 93 | 278 |
| 94 | 296 |
| 95 | 434 |
| 96 | 57 |
| 97 | 95 |
| 98 | 106 |
| 99 | 159 |
| 100 | 119 |
| 101 | 171 |
| 102 | 188 |
| 103 | 274 |
| 104 | 129 |
| 105 | 189 |
| 106 | 207 |
| 107 | 288 |
| 108 | 220 |
| 109 | 313 |
| 110 | 330 |
| 111 | 471 |
| 112 | 146 |
| 113 | 215 |
| 114 | 239 |
| 115 | 318 |
| 116 | 246 |
| 117 | 331 |
| 118 | 356 |
| 119 | 502 |
| 120 | 266 |
| 121 | 363 |
| 122 | 385 |
| 123 | 528 |
| 124 | 405 |
| 125 | 551 |
| 126 | 593 |
| 127 | 816 |
| 128 | 17 |
| 129 | 27 |
| 130 | 33 |
| 131 | 77 |
| 132 | 42 |
| 133 | 84 |
| 134 | 88 |
| 135 | 147 |
| 136 | 52 |
| 137 | 91 |
| 138 | 99 |
| 139 | 158 |
| 140 | 109 |
| 141 | 170 |
| 142 | 174 |
| 143 | 273 |
| 144 | 60 |
| 145 | 100 |
| 146 | 111 |
| 147 | 172 |
| 148 | 122 |
| 149 | 187 |
| 150 | 204 |
| 151 | 290 |
| 152 | 134 |
| 153 | 205 |
| 154 | 216 |
| 155 | 307 |
| 156 | 241 |
| 157 | 326 |
| 158 | 350 |
| 159 | 491 |
| 160 | 69 |
| 161 | 115 |
| 162 | 130 |
| 163 | 193 |

TABLE Z2-continued

| with a sequence length of 4096: | |
|---|---|
| Polarized channel sequence number | Reliability or reliability sequence number |
| 164 | 136 |
| 165 | 206 |
| 166 | 223 |
| 167 | 319 |
| 168 | 156 |
| 169 | 237 |
| 170 | 247 |
| 171 | 334 |
| 172 | 265 |
| 173 | 362 |
| 174 | 378 |
| 175 | 525 |
| 176 | 173 |
| 177 | 257 |
| 178 | 275 |
| 179 | 369 |
| 180 | 289 |
| 181 | 399 |
| 182 | 408 |
| 183 | 548 |
| 184 | 315 |
| 185 | 421 |
| 186 | 453 |
| 187 | 582 |
| 188 | 477 |
| 189 | 613 |
| 190 | 681 |
| 191 | 817 |
| 192 | 73 |
| 193 | 132 |
| 194 | 151 |
| 195 | 226 |
| 196 | 168 |
| 197 | 244 |
| 198 | 264 |
| 199 | 367 |
| 200 | 178 |
| 201 | 267 |
| 202 | 281 |
| 203 | 390 |
| 204 | 297 |
| 205 | 407 |
| 206 | 432 |
| 207 | 571 |
| 208 | 202 |
| 209 | 293 |
| 210 | 308 |
| 211 | 418 |
| 212 | 332 |
| 213 | 447 |
| 214 | 473 |
| 215 | 624 |
| 216 | 344 |
| 217 | 480 |
| 218 | 507 |
| 219 | 650 |
| 220 | 535 |
| 221 | 693 |
| 222 | 719 |
| 223 | 942 |
| 224 | 222 |
| 225 | 321 |
| 226 | 338 |
| 227 | 457 |
| 228 | 371 |
| 229 | 488 |
| 230 | 511 |
| 231 | 672 |
| 232 | 404 |
| 233 | 521 |
| 234 | 549 |
| 235 | 708 |
| 236 | 583 |
| 237 | 724 |
| 238 | 785 |

TABLE Z2-continued

| with a sequence length of 4096: | |
|---|---|
| Polarized channel sequence number | Reliability or reliability sequence number |
| 239 | 1011 |
| 240 | 431 |
| 241 | 561 |
| 242 | 595 |
| 243 | 756 |
| 244 | 609 |
| 245 | 805 |
| 246 | 833 |
| 247 | 1072 |
| 248 | 677 |
| 249 | 848 |
| 250 | 880 |
| 251 | 1059 |
| 252 | 914 |
| 253 | 1122 |
| 254 | 1203 |
| 255 | 1479 |
| 256 | 22 |
| 257 | 39 |
| 258 | 44 |
| 259 | 97 |
| 260 | 53 |
| 261 | 101 |
| 262 | 113 |
| 263 | 186 |
| 264 | 54 |
| 265 | 114 |
| 266 | 125 |
| 267 | 196 |
| 268 | 138 |
| 269 | 218 |
| 270 | 228 |
| 271 | 348 |
| 272 | 68 |
| 273 | 126 |
| 274 | 139 |
| 275 | 232 |
| 276 | 153 |
| 277 | 240 |
| 278 | 254 |
| 279 | 349 |
| 280 | 162 |
| 281 | 252 |
| 282 | 272 |
| 283 | 383 |
| 284 | 294 |
| 285 | 403 |
| 286 | 413 |
| 287 | 547 |
| 288 | 71 |
| 289 | 150 |
| 290 | 164 |
| 291 | 234 |
| 292 | 182 |
| 293 | 258 |
| 294 | 276 |
| 295 | 402 |
| 296 | 192 |
| 297 | 286 |
| 298 | 298 |
| 299 | 415 |
| 300 | 311 |
| 301 | 445 |
| 302 | 463 |
| 303 | 607 |
| 304 | 191 |
| 305 | 309 |
| 306 | 323 |
| 307 | 442 |
| 308 | 343 |
| 309 | 476 |
| 310 | 493 |
| 311 | 653 |
| 312 | 373 |
| 313 | 515 |

TABLE Z2-continued

| with a sequence length of 4096: | |
|---|---|
| Polarized channel sequence number | Reliability or reliability sequence number |
| 314 | 537 |
| 315 | 692 |
| 316 | 558 |
| 317 | 716 |
| 318 | 762 |
| 319 | 992 |
| 320 | 83 |
| 321 | 176 |
| 322 | 184 |
| 323 | 283 |
| 324 | 200 |
| 325 | 304 |
| 326 | 322 |
| 327 | 436 |
| 328 | 210 |
| 329 | 329 |
| 330 | 337 |
| 331 | 472 |
| 332 | 357 |
| 333 | 501 |
| 334 | 520 |
| 335 | 688 |
| 336 | 269 |
| 337 | 351 |
| 338 | 372 |
| 339 | 506 |
| 340 | 392 |
| 341 | 533 |
| 342 | 557 |
| 343 | 712 |
| 344 | 424 |
| 345 | 565 |
| 346 | 600 |
| 347 | 752 |
| 348 | 629 |
| 349 | 803 |
| 350 | 837 |
| 351 | 1048 |
| 352 | 302 |
| 353 | 387 |
| 354 | 417 |
| 355 | 544 |
| 356 | 441 |
| 357 | 580 |
| 358 | 603 |
| 359 | 788 |
| 360 | 468 |
| 361 | 618 |
| 362 | 638 |
| 363 | 813 |
| 364 | 682 |
| 365 | 863 |
| 366 | 893 |
| 367 | 1102 |
| 368 | 509 |
| 369 | 680 |
| 370 | 696 |
| 371 | 881 |
| 372 | 713 |
| 373 | 916 |
| 374 | 871 |
| 375 | 1140 |
| 376 | 771 |
| 377 | 986 |
| 378 | 1014 |
| 379 | 1221 |
| 380 | 1026 |
| 381 | 1306 |
| 382 | 1353 |
| 383 | 1539 |
| 384 | 89 |
| 385 | 197 |
| 386 | 203 |
| 387 | 342 |
| 388 | 259 |

TABLE Z2-continued

| with a sequence length of 4096: | |
|---|---|
| Polarized channel sequence number | Reliability or reliability sequence number |
| 389 | 361 |
| 390 | 376 |
| 391 | 514 |
| 392 | 285 |
| 393 | 381 |
| 394 | 395 |
| 395 | 540 |
| 396 | 423 |
| 397 | 569 |
| 398 | 599 |
| 399 | 791 |
| 400 | 300 |
| 401 | 420 |
| 402 | 440 |
| 403 | 570 |
| 404 | 456 |
| 405 | 605 |
| 406 | 632 |
| 407 | 822 |
| 408 | 481 |
| 409 | 642 |
| 410 | 670 |
| 411 | 854 |
| 412 | 710 |
| 413 | 888 |
| 414 | 939 |
| 415 | 1151 |
| 416 | 347 |
| 417 | 446 |
| 418 | 462 |
| 419 | 630 |
| 420 | 492 |
| 421 | 661 |
| 422 | 699 |
| 423 | 873 |
| 424 | 538 |
| 425 | 700 |
| 426 | 720 |
| 427 | 935 |
| 428 | 774 |
| 429 | 910 |
| 430 | 1002 |
| 431 | 1226 |
| 432 | 578 |
| 433 | 745 |
| 434 | 799 |
| 435 | 987 |
| 436 | 823 |
| 437 | 1023 |
| 438 | 1054 |
| 439 | 1279 |
| 440 | 864 |
| 441 | 1066 |
| 442 | 1063 |
| 443 | 1341 |
| 444 | 1143 |
| 445 | 1376 |
| 446 | 1417 |
| 447 | 1670 |
| 448 | 386 |
| 449 | 478 |
| 450 | 516 |
| 451 | 703 |
| 452 | 567 |
| 453 | 723 |
| 454 | 760 |
| 455 | 955 |
| 456 | 601 |
| 457 | 789 |
| 458 | 807 |
| 459 | 1017 |
| 460 | 846 |
| 461 | 1032 |
| 462 | 1062 |
| 463 | 1300 |

TABLE Z2-continued

| with a sequence length of 4096: | |
|---|---|
| Polarized channel sequence number | Reliability or reliability sequence number |
| 464 | 633 |
| 465 | 830 |
| 466 | 875 |
| 467 | 1051 |
| 468 | 894 |
| 469 | 1069 |
| 470 | 1146 |
| 471 | 1380 |
| 472 | 952 |
| 473 | 1163 |
| 474 | 1194 |
| 475 | 1428 |
| 476 | 1250 |
| 477 | 1493 |
| 478 | 1531 |
| 479 | 1810 |
| 480 | 689 |
| 481 | 884 |
| 482 | 930 |
| 483 | 1149 |
| 484 | 999 |
| 485 | 1154 |
| 486 | 1238 |
| 487 | 1445 |
| 488 | 1009 |
| 489 | 1229 |
| 490 | 1285 |
| 491 | 1516 |
| 492 | 1329 |
| 493 | 1567 |
| 494 | 1639 |
| 495 | 1919 |
| 496 | 1033 |
| 497 | 1309 |
| 498 | 1367 |
| 499 | 1592 |
| 500 | 1400 |
| 501 | 1651 |
| 502 | 1617 |
| 503 | 1957 |
| 504 | 1471 |
| 505 | 1707 |
| 506 | 1746 |
| 507 | 2065 |
| 508 | 1830 |
| 509 | 2125 |
| 510 | 2198 |
| 511 | 2406 |
| 512 | 29 |
| 513 | 47 |
| 514 | 56 |
| 515 | 107 |
| 516 | 64 |
| 517 | 127 |
| 518 | 140 |
| 519 | 224 |
| 520 | 70 |
| 521 | 144 |
| 522 | 154 |
| 523 | 231 |
| 524 | 167 |
| 525 | 250 |
| 526 | 255 |
| 527 | 396 |
| 528 | 72 |
| 529 | 165 |
| 530 | 175 |
| 531 | 249 |
| 532 | 185 |
| 533 | 305 |
| 534 | 316 |
| 535 | 430 |
| 536 | 211 |
| 537 | 317 |
| 538 | 341 |

TABLE Z2-continued

| with a sequence length of 4096: | |
|---|---|
| Polarized channel sequence number | Reliability or reliability sequence number |
| 539 | 469 |
| 540 | 360 |
| 541 | 495 |
| 542 | 518 |
| 543 | 707 |
| 544 | 74 |
| 545 | 181 |
| 546 | 198 |
| 547 | 310 |
| 548 | 213 |
| 549 | 339 |
| 550 | 353 |
| 551 | 486 |
| 552 | 225 |
| 553 | 366 |
| 554 | 379 |
| 555 | 523 |
| 556 | 398 |
| 557 | 552 |
| 558 | 575 |
| 559 | 726 |
| 560 | 238 |
| 561 | 389 |
| 562 | 411 |
| 563 | 564 |
| 564 | 437 |
| 565 | 596 |
| 566 | 615 |
| 567 | 780 |
| 568 | 448 |
| 569 | 608 |
| 570 | 644 |
| 571 | 827 |
| 572 | 649 |
| 573 | 853 |
| 574 | 886 |
| 575 | 1209 |
| 576 | 116 |
| 577 | 212 |
| 578 | 221 |
| 579 | 358 |
| 580 | 233 |
| 581 | 380 |
| 582 | 397 |
| 583 | 543 |
| 584 | 262 |
| 585 | 414 |
| 586 | 425 |
| 587 | 588 |
| 588 | 452 |
| 589 | 621 |
| 590 | 641 |
| 591 | 795 |
| 592 | 282 |
| 593 | 429 |
| 594 | 461 |
| 595 | 612 |
| 596 | 484 |
| 597 | 647 |
| 598 | 656 |
| 599 | 840 |
| 600 | 505 |
| 601 | 658 |
| 602 | 669 |
| 603 | 890 |
| 604 | 744 |
| 605 | 919 |
| 606 | 976 |
| 607 | 1228 |
| 608 | 301 |
| 609 | 483 |
| 610 | 498 |
| 611 | 666 |
| 612 | 530 |
| 613 | 697 |

TABLE Z2-continued

| with a sequence length of 4096: | |
|---|---|
| Polarized channel sequence number | Reliability or reliability sequence number |
| 614 | 704 |
| 615 | 903 |
| 616 | 556 |
| 617 | 741 |
| 618 | 766 |
| 619 | 951 |
| 620 | 812 |
| 621 | 995 |
| 622 | 1019 |
| 623 | 1288 |
| 624 | 587 |
| 625 | 784 |
| 626 | 826 |
| 627 | 1021 |
| 628 | 867 |
| 629 | 1045 |
| 630 | 1108 |
| 631 | 1332 |
| 632 | 928 |
| 633 | 1116 |
| 634 | 1166 |
| 635 | 1384 |
| 636 | 1197 |
| 637 | 1439 |
| 638 | 1500 |
| 639 | 1799 |
| 640 | 120 |
| 641 | 230 |
| 642 | 251 |
| 643 | 409 |
| 644 | 279 |
| 645 | 426 |
| 646 | 455 |
| 647 | 626 |
| 648 | 295 |
| 649 | 465 |
| 650 | 487 |
| 651 | 660 |
| 652 | 510 |
| 653 | 676 |
| 654 | 684 |
| 655 | 897 |
| 656 | 328 |
| 657 | 500 |
| 658 | 529 |
| 659 | 686 |
| 660 | 554 |
| 661 | 735 |
| 662 | 759 |
| 663 | 943 |
| 664 | 584 |
| 665 | 776 |
| 666 | 809 |
| 667 | 1007 |
| 668 | 842 |
| 669 | 1036 |
| 670 | 1084 |
| 671 | 1291 |
| 672 | 354 |
| 673 | 542 |
| 674 | 574 |
| 675 | 764 |
| 676 | 617 |
| 677 | 802 |
| 678 | 798 |
| 679 | 1039 |
| 680 | 635 |
| 681 | 832 |
| 682 | 850 |
| 683 | 1074 |
| 684 | 906 |
| 685 | 1111 |
| 686 | 1133 |
| 687 | 1390 |
| 688 | 673 |

TABLE Z2-continued

| with a sequence length of 4096: | |
|---|---|
| Polarized channel sequence number | Reliability or reliability sequence number |
| 689 | 869 |
| 690 | 923 |
| 691 | 1125 |
| 692 | 946 |
| 693 | 1180 |
| 694 | 1200 |
| 695 | 1448 |
| 696 | 983 |
| 697 | 1224 |
| 698 | 1262 |
| 699 | 1519 |
| 700 | 1338 |
| 701 | 1575 |
| 702 | 1643 |
| 703 | 1925 |
| 704 | 375 |
| 705 | 592 |
| 706 | 620 |
| 707 | 836 |
| 708 | 654 |
| 709 | 860 |
| 710 | 907 |
| 711 | 1119 |
| 712 | 731 |
| 713 | 926 |
| 714 | 962 |
| 715 | 1189 |
| 716 | 968 |
| 717 | 1206 |
| 718 | 1244 |
| 719 | 1488 |
| 720 | 747 |
| 721 | 964 |
| 722 | 980 |
| 723 | 1235 |
| 724 | 1041 |
| 725 | 1259 |
| 726 | 1318 |
| 727 | 1564 |
| 728 | 1095 |
| 729 | 1335 |
| 730 | 1364 |
| 731 | 1595 |
| 732 | 1414 |
| 733 | 1676 |
| 734 | 1721 |
| 735 | 1977 |
| 736 | 778 |
| 737 | 1056 |
| 738 | 1080 |
| 739 | 1294 |
| 740 | 1134 |
| 741 | 1344 |
| 742 | 1373 |
| 743 | 1626 |
| 744 | 1169 |
| 745 | 1407 |
| 746 | 1453 |
| 747 | 1704 |
| 748 | 1505 |
| 749 | 1752 |
| 750 | 1819 |
| 751 | 2087 |
| 752 | 1268 |
| 753 | 1460 |
| 754 | 1524 |
| 755 | 1768 |
| 756 | 1584 |
| 757 | 1841 |
| 758 | 1872 |
| 759 | 2182 |
| 760 | 1631 |
| 761 | 1900 |
| 762 | 1951 |
| 763 | 2224 |

TABLE Z2-continued

| with a sequence length of 4096: | |
|---|---|
| Polarized channel sequence number | Reliability or reliability sequence number |
| 764 | 2025 |
| 765 | 2299 |
| 766 | 2394 |
| 767 | 2688 |
| 768 | 137 |
| 769 | 263 |
| 770 | 287 |
| 771 | 466 |
| 772 | 324 |
| 773 | 496 |
| 774 | 524 |
| 775 | 715 |
| 776 | 336 |
| 777 | 534 |
| 778 | 562 |
| 779 | 739 |
| 780 | 590 |
| 781 | 770 |
| 782 | 819 |
| 783 | 1087 |
| 784 | 368 |
| 785 | 577 |
| 786 | 625 |
| 787 | 793 |
| 788 | 646 |
| 789 | 858 |
| 790 | 844 |
| 791 | 1101 |
| 792 | 663 |
| 793 | 877 |
| 794 | 913 |
| 795 | 1160 |
| 796 | 958 |
| 797 | 1183 |
| 798 | 1215 |
| 799 | 1474 |
| 800 | 439 |
| 801 | 637 |
| 802 | 665 |
| 803 | 857 |
| 804 | 730 |
| 805 | 901 |
| 806 | 932 |
| 807 | 1192 |
| 808 | 738 |
| 809 | 959 |
| 810 | 974 |
| 811 | 1218 |
| 812 | 998 |
| 813 | 1247 |
| 814 | 1277 |
| 815 | 1547 |
| 816 | 749 |
| 817 | 990 |
| 818 | 1029 |
| 819 | 1274 |
| 820 | 1092 |
| 821 | 1315 |
| 822 | 1356 |
| 823 | 1600 |
| 824 | 1127 |
| 825 | 1397 |
| 826 | 1411 |
| 827 | 1679 |
| 828 | 1456 |
| 829 | 1727 |
| 830 | 1782 |
| 831 | 2051 |
| 832 | 450 |
| 833 | 728 |
| 834 | 734 |
| 835 | 948 |
| 836 | 751 |
| 837 | 967 |
| 838 | 1004 |

TABLE Z2-continued with a sequence length of 4096:

| Polarized channel sequence number | Reliability or reliability sequence number |
|---|---|
| 839 | 1256 |
| 840 | 781 |
| 841 | 1044 |
| 842 | 1077 |
| 843 | 1303 |
| 844 | 1113 |
| 845 | 1347 |
| 846 | 1404 |
| 847 | 1662 |
| 848 | 920 |
| 849 | 1090 |
| 850 | 1137 |
| 851 | 1361 |
| 852 | 1171 |
| 853 | 1431 |
| 854 | 1463 |
| 855 | 1712 |
| 856 | 1253 |
| 857 | 1468 |
| 858 | 1527 |
| 859 | 1771 |
| 860 | 1587 |
| 861 | 1836 |
| 862 | 1866 |
| 863 | 2173 |
| 864 | 971 |
| 865 | 1177 |
| 866 | 1232 |
| 867 | 1434 |
| 868 | 1271 |
| 869 | 1511 |
| 870 | 1555 |
| 871 | 1793 |
| 872 | 1326 |
| 873 | 1570 |
| 874 | 1609 |
| 875 | 1860 |
| 876 | 1657 |
| 877 | 1906 |
| 878 | 1971 |
| 879 | 2251 |
| 880 | 1370 |
| 881 | 1634 |
| 882 | 1690 |
| 883 | 1945 |
| 884 | 1743 |
| 885 | 1991 |
| 886 | 2047 |
| 887 | 2319 |
| 888 | 1804 |
| 889 | 2073 |
| 890 | 2117 |
| 891 | 2373 |
| 892 | 2157 |
| 893 | 2470 |
| 894 | 2494 |
| 895 | 2875 |
| 896 | 458 |
| 897 | 755 |
| 898 | 767 |
| 899 | 1081 |
| 900 | 899 |
| 901 | 1105 |
| 902 | 1130 |
| 903 | 1393 |
| 904 | 936 |
| 905 | 1157 |
| 906 | 1186 |
| 907 | 1442 |
| 908 | 1241 |
| 909 | 1485 |
| 910 | 1542 |
| 911 | 1788 |
| 912 | 978 |
| 913 | 1212 |

TABLE Z2-continued with a sequence length of 4096:

| Polarized channel sequence number | Reliability or reliability sequence number |
|---|---|
| 914 | 1265 |
| 915 | 1496 |
| 916 | 1297 |
| 917 | 1559 |
| 918 | 1612 |
| 919 | 1853 |
| 920 | 1350 |
| 921 | 1648 |
| 922 | 1604 |
| 923 | 1889 |
| 924 | 1718 |
| 925 | 1963 |
| 926 | 2019 |
| 927 | 2279 |
| 928 | 1098 |
| 929 | 1282 |
| 930 | 1312 |
| 931 | 1579 |
| 932 | 1387 |
| 933 | 1621 |
| 934 | 1684 |
| 935 | 1931 |
| 936 | 1425 |
| 937 | 1693 |
| 938 | 1737 |
| 939 | 1997 |
| 940 | 1777 |
| 941 | 2033 |
| 942 | 2095 |
| 943 | 2362 |
| 944 | 1508 |
| 945 | 1757 |
| 946 | 1815 |
| 947 | 2059 |
| 948 | 1877 |
| 949 | 2133 |
| 950 | 2165 |
| 951 | 2443 |
| 952 | 1914 |
| 953 | 2215 |
| 954 | 2243 |
| 955 | 2524 |
| 956 | 2308 |
| 957 | 2567 |
| 958 | 2601 |
| 959 | 2797 |
| 960 | 1174 |
| 961 | 1323 |
| 962 | 1422 |
| 963 | 1698 |
| 964 | 1482 |
| 965 | 1732 |
| 966 | 1762 |
| 967 | 2039 |
| 968 | 1535 |
| 969 | 1825 |
| 970 | 1847 |
| 971 | 2111 |
| 972 | 1894 |
| 973 | 2141 |
| 974 | 2232 |
| 975 | 2482 |
| 976 | 1550 |
| 977 | 1883 |
| 978 | 1937 |
| 979 | 2207 |
| 980 | 2011 |
| 981 | 2260 |
| 982 | 2269 |
| 983 | 2583 |
| 984 | 2081 |
| 985 | 2330 |
| 986 | 2350 |
| 987 | 2617 |
| 988 | 2420 |

TABLE Z2-continued with a sequence length of 4096:

| Polarized channel sequence number | Reliability or reliability sequence number |
|---|---|
| 989 | 2710 |
| 990 | 2750 |
| 991 | 3042 |
| 992 | 1665 |
| 993 | 1985 |
| 994 | 2005 |
| 995 | 2288 |
| 996 | 2103 |
| 997 | 2339 |
| 998 | 2385 |
| 999 | 2652 |
| 1000 | 2149 |
| 1001 | 2432 |
| 1002 | 2455 |
| 1003 | 2730 |
| 1004 | 2539 |
| 1005 | 2773 |
| 1006 | 2904 |
| 1007 | 3134 |
| 1008 | 2190 |
| 1009 | 2509 |
| 1010 | 2552 |
| 1011 | 2822 |
| 1012 | 2633 |
| 1013 | 2846 |
| 1014 | 2933 |
| 1015 | 3187 |
| 1016 | 2671 |
| 1017 | 2967 |
| 1018 | 3002 |
| 1019 | 3252 |
| 1020 | 3083 |
| 1021 | 3328 |
| 1022 | 3433 |
| 1023 | 3584 |
| 1024 | 10 |
| 1025 | 40 |
| 1026 | 66 |
| 1027 | 145 |
| 1028 | 86 |
| 1029 | 157 |
| 1030 | 190 |
| 1031 | 299 |
| 1032 | 102 |
| 1033 | 179 |
| 1034 | 209 |
| 1035 | 327 |
| 1036 | 236 |
| 1037 | 359 |
| 1038 | 370 |
| 1039 | 576 |
| 1040 | 118 |
| 1041 | 201 |
| 1042 | 219 |
| 1043 | 352 |
| 1044 | 261 |
| 1045 | 388 |
| 1046 | 438 |
| 1047 | 594 |
| 1048 | 284 |
| 1049 | 433 |
| 1050 | 412 |
| 1051 | 623 |
| 1052 | 489 |
| 1053 | 655 |
| 1054 | 678 |
| 1055 | 889 |
| 1056 | 133 |
| 1057 | 245 |
| 1058 | 277 |
| 1059 | 400 |
| 1060 | 291 |
| 1061 | 428 |
| 1062 | 460 |
| 1063 | 631 |
| 1064 | 333 |
| 1065 | 479 |
| 1066 | 499 |
| 1067 | 659 |
| 1068 | 555 |
| 1069 | 705 |
| 1070 | 725 |
| 1071 | 938 |
| 1072 | 364 |
| 1073 | 508 |
| 1074 | 568 |
| 1075 | 718 |
| 1076 | 589 |
| 1077 | 750 |
| 1078 | 783 |
| 1079 | 972 |
| 1080 | 619 |
| 1081 | 790 |
| 1082 | 824 |
| 1083 | 1040 |
| 1084 | 841 |
| 1085 | 1070 |
| 1086 | 1123 |
| 1087 | 1392 |
| 1088 | 169 |
| 1089 | 253 |
| 1090 | 312 |
| 1091 | 474 |
| 1092 | 340 |
| 1093 | 494 |
| 1094 | 550 |
| 1095 | 687 |
| 1096 | 377 |
| 1097 | 573 |
| 1098 | 513 |
| 1099 | 729 |
| 1100 | 606 |
| 1101 | 761 |
| 1102 | 804 |
| 1103 | 994 |
| 1104 | 422 |
| 1105 | 563 |
| 1106 | 614 |
| 1107 | 786 |
| 1108 | 639 |
| 1109 | 814 |
| 1110 | 839 |
| 1111 | 1058 |
| 1112 | 671 |
| 1113 | 849 |
| 1114 | 895 |
| 1115 | 1099 |
| 1116 | 934 |
| 1117 | 1142 |
| 1118 | 1182 |
| 1119 | 1477 |
| 1120 | 470 |
| 1121 | 627 |
| 1122 | 664 |
| 1123 | 835 |
| 1124 | 709 |
| 1125 | 868 |
| 1126 | 918 |
| 1127 | 1132 |
| 1128 | 742 |
| 1129 | 922 |
| 1130 | 970 |
| 1131 | 1164 |
| 1132 | 1000 |
| 1133 | 1219 |
| 1134 | 1260 |
| 1135 | 1549 |
| 1136 | 796 |
| 1137 | 988 |
| 1138 | 1049 |

TABLE Z2-continued with a sequence length of 4096:

| Polarized channel sequence number | Reliability or reliability sequence number |
|---|---|
| 1139 | 1234 |
| 1140 | 1065 |
| 1141 | 1263 |
| 1142 | 1317 |
| 1143 | 1607 |
| 1144 | 1115 |
| 1145 | 1334 |
| 1146 | 1378 |
| 1147 | 1653 |
| 1148 | 1420 |
| 1149 | 1695 |
| 1150 | 1766 |
| 1151 | 2107 |
| 1152 | 227 |
| 1153 | 306 |
| 1154 | 346 |
| 1155 | 560 |
| 1156 | 394 |
| 1157 | 586 |
| 1158 | 597 |
| 1159 | 800 |
| 1160 | 444 |
| 1161 | 611 |
| 1162 | 643 |
| 1163 | 831 |
| 1164 | 675 |
| 1165 | 866 |
| 1166 | 879 |
| 1167 | 1129 |
| 1168 | 485 |
| 1169 | 648 |
| 1170 | 683 |
| 1171 | 872 |
| 1172 | 721 |
| 1173 | 915 |
| 1174 | 960 |
| 1175 | 1170 |
| 1176 | 757 |
| 1177 | 963 |
| 1178 | 991 |
| 1179 | 1205 |
| 1180 | 1055 |
| 1181 | 1251 |
| 1182 | 1305 |
| 1183 | 1585 |
| 1184 | 522 |
| 1185 | 698 |
| 1186 | 746 |
| 1187 | 931 |
| 1188 | 765 |
| 1189 | 966 |
| 1190 | 1010 |
| 1191 | 1237 |
| 1192 | 828 |
| 1193 | 1043 |
| 1194 | 1067 |
| 1195 | 1269 |
| 1196 | 1112 |
| 1197 | 1331 |
| 1198 | 1363 |
| 1199 | 1650 |
| 1200 | 876 |
| 1201 | 1091 |
| 1202 | 1136 |
| 1203 | 1346 |
| 1204 | 1167 |
| 1205 | 1409 |
| 1206 | 1426 |
| 1207 | 1688 |
| 1208 | 1222 |
| 1209 | 1452 |
| 1210 | 1514 |
| 1211 | 1748 |
| 1212 | 1560 |
| 1213 | 1801 |
| 1214 | 1910 |
| 1215 | 2109 |
| 1216 | 541 |
| 1217 | 754 |
| 1218 | 810 |
| 1219 | 1018 |
| 1220 | 862 |
| 1221 | 1060 |
| 1222 | 1109 |
| 1223 | 1340 |
| 1224 | 892 |
| 1225 | 1118 |
| 1226 | 1147 |
| 1227 | 1389 |
| 1228 | 1184 |
| 1229 | 1423 |
| 1230 | 1476 |
| 1231 | 1730 |
| 1232 | 954 |
| 1233 | 1173 |
| 1234 | 1208 |
| 1235 | 1447 |
| 1236 | 1266 |
| 1237 | 1503 |
| 1238 | 1554 |
| 1239 | 1817 |
| 1240 | 1293 |
| 1241 | 1565 |
| 1242 | 1616 |
| 1243 | 1862 |
| 1244 | 1667 |
| 1245 | 1929 |
| 1246 | 1969 |
| 1247 | 2271 |
| 1248 | 1006 |
| 1249 | 1240 |
| 1250 | 1278 |
| 1251 | 1522 |
| 1252 | 1349 |
| 1253 | 1582 |
| 1254 | 1624 |
| 1255 | 1896 |
| 1256 | 1418 |
| 1257 | 1641 |
| 1258 | 1691 |
| 1259 | 1953 |
| 1260 | 1750 |
| 1261 | 1979 |
| 1262 | 2067 |
| 1263 | 2355 |
| 1264 | 1472 |
| 1265 | 1711 |
| 1266 | 1770 |
| 1267 | 2027 |
| 1268 | 1795 |
| 1269 | 2093 |
| 1270 | 2131 |
| 1271 | 2424 |
| 1272 | 1904 |
| 1273 | 2151 |
| 1274 | 2192 |
| 1275 | 2410 |
| 1276 | 2236 |
| 1277 | 2480 |
| 1278 | 2570 |
| 1279 | 2856 |
| 1280 | 270 |
| 1281 | 382 |
| 1282 | 406 |
| 1283 | 636 |
| 1284 | 449 |
| 1285 | 652 |
| 1286 | 691 |
| 1287 | 911 |
| 1288 | 454 |

TABLE Z2-continued with a sequence length of 4096:

| Polarized channel sequence number | Reliability or reliability sequence number |
|---|---|
| 1289 | 694 |
| 1290 | 733 |
| 1291 | 940 |
| 1292 | 773 |
| 1293 | 996 |
| 1294 | 1022 |
| 1295 | 1299 |
| 1296 | 517 |
| 1297 | 736 |
| 1298 | 775 |
| 1299 | 1030 |
| 1300 | 818 |
| 1301 | 1052 |
| 1302 | 1085 |
| 1303 | 1302 |
| 1304 | 845 |
| 1305 | 1083 |
| 1306 | 1126 |
| 1307 | 1375 |
| 1308 | 1176 |
| 1309 | 1415 |
| 1310 | 1436 |
| 1311 | 1686 |
| 1312 | 531 |
| 1313 | 808 |
| 1314 | 851 |
| 1315 | 1037 |
| 1316 | 902 |
| 1317 | 1094 |
| 1318 | 1139 |
| 1319 | 1412 |
| 1320 | 927 |
| 1321 | 1159 |
| 1322 | 1187 |
| 1323 | 1440 |
| 1324 | 1216 |
| 1325 | 1498 |
| 1326 | 1534 |
| 1327 | 1790 |
| 1328 | 924 |
| 1329 | 1210 |
| 1330 | 1245 |
| 1331 | 1495 |
| 1332 | 1290 |
| 1333 | 1557 |
| 1334 | 1590 |
| 1335 | 1864 |
| 1336 | 1355 |
| 1337 | 1629 |
| 1338 | 1669 |
| 1339 | 1927 |
| 1340 | 1709 |
| 1341 | 1967 |
| 1342 | 2035 |
| 1343 | 2332 |
| 1344 | 581 |
| 1345 | 885 |
| 1346 | 905 |
| 1347 | 1153 |
| 1348 | 950 |
| 1349 | 1199 |
| 1350 | 1243 |
| 1351 | 1480 |
| 1352 | 975 |
| 1353 | 1257 |
| 1354 | 1275 |
| 1355 | 1552 |
| 1356 | 1320 |
| 1357 | 1605 |
| 1358 | 1638 |
| 1359 | 1921 |
| 1360 | 1120 |
| 1361 | 1308 |
| 1362 | 1352 |
| 1363 | 1614 |

TABLE Z2-continued with a sequence length of 4096:

| Polarized channel sequence number | Reliability or reliability sequence number |
|---|---|
| 1364 | 1395 |
| 1365 | 1660 |
| 1366 | 1705 |
| 1367 | 1959 |
| 1368 | 1458 |
| 1369 | 1720 |
| 1370 | 1779 |
| 1371 | 2021 |
| 1372 | 1827 |
| 1373 | 2091 |
| 1374 | 2137 |
| 1375 | 2399 |
| 1376 | 1196 |
| 1377 | 1383 |
| 1378 | 1444 |
| 1379 | 1683 |
| 1380 | 1492 |
| 1381 | 1744 |
| 1382 | 1784 |
| 1383 | 2069 |
| 1384 | 1544 |
| 1385 | 1808 |
| 1386 | 1843 |
| 1387 | 2105 |
| 1388 | 1912 |
| 1389 | 2169 |
| 1390 | 2209 |
| 1391 | 2460 |
| 1392 | 1619 |
| 1393 | 1908 |
| 1394 | 1933 |
| 1395 | 2194 |
| 1396 | 1961 |
| 1397 | 2238 |
| 1398 | 2180 |
| 1399 | 2502 |
| 1400 | 2048 |
| 1401 | 2323 |
| 1402 | 2357 |
| 1403 | 2588 |
| 1404 | 2371 |
| 1405 | 2682 |
| 1406 | 2733 |
| 1407 | 2914 |
| 1408 | 602 |
| 1409 | 944 |
| 1410 | 956 |
| 1411 | 1287 |
| 1412 | 1097 |
| 1413 | 1328 |
| 1414 | 1360 |
| 1415 | 1627 |
| 1416 | 1156 |
| 1417 | 1372 |
| 1418 | 1398 |
| 1419 | 1674 |
| 1420 | 1455 |
| 1421 | 1725 |
| 1422 | 1775 |
| 1423 | 2075 |
| 1424 | 1190 |
| 1425 | 1450 |
| 1426 | 1490 |
| 1427 | 1728 |
| 1428 | 1521 |
| 1429 | 1786 |
| 1430 | 1832 |
| 1431 | 2115 |
| 1432 | 1569 |
| 1433 | 1849 |
| 1434 | 1893 |
| 1435 | 2159 |
| 1436 | 1955 |
| 1437 | 2203 |
| 1438 | 2266 |

TABLE Z2-continued with a sequence length of 4096:

| Polarized channel sequence number | Reliability or reliability sequence number |
|---|---|
| 1439 | 2514 |
| 1440 | 1296 |
| 1441 | 1501 |
| 1442 | 1532 |
| 1443 | 1828 |
| 1444 | 1589 |
| 1445 | 1879 |
| 1446 | 1939 |
| 1447 | 2184 |
| 1448 | 1672 |
| 1449 | 1941 |
| 1450 | 1973 |
| 1451 | 2262 |
| 1452 | 2049 |
| 1453 | 2230 |
| 1454 | 2344 |
| 1455 | 2593 |
| 1456 | 1741 |
| 1457 | 2009 |
| 1458 | 2085 |
| 1459 | 2326 |
| 1460 | 2119 |
| 1461 | 2369 |
| 1462 | 2403 |
| 1463 | 2654 |
| 1464 | 2171 |
| 1465 | 2417 |
| 1466 | 2415 |
| 1467 | 2718 |
| 1468 | 2504 |
| 1469 | 2756 |
| 1470 | 2794 |
| 1471 | 3031 |
| 1472 | 1381 |
| 1473 | 1562 |
| 1474 | 1633 |
| 1475 | 1943 |
| 1476 | 1723 |
| 1477 | 1975 |
| 1478 | 2031 |
| 1479 | 2286 |
| 1480 | 1781 |
| 1481 | 2071 |
| 1482 | 2097 |
| 1483 | 2360 |
| 1484 | 2147 |
| 1485 | 2378 |
| 1486 | 2413 |
| 1487 | 2676 |
| 1488 | 1834 |
| 1489 | 2127 |
| 1490 | 2186 |
| 1491 | 2401 |
| 1492 | 2211 |
| 1493 | 2422 |
| 1494 | 2507 |
| 1495 | 2759 |
| 1496 | 2284 |
| 1497 | 2527 |
| 1498 | 2560 |
| 1499 | 2806 |
| 1500 | 2622 |
| 1501 | 2868 |
| 1502 | 2907 |
| 1503 | 3150 |
| 1504 | 1923 |
| 1505 | 2196 |
| 1506 | 2256 |
| 1507 | 2512 |
| 1508 | 2341 |
| 1509 | 2517 |
| 1510 | 2609 |
| 1511 | 2825 |
| 1512 | 2353 |
| 1513 | 2598 |

TABLE Z2-continued with a sequence length of 4096:

| Polarized channel sequence number | Reliability or reliability sequence number |
|---|---|
| 1514 | 2660 |
| 1515 | 2891 |
| 1516 | 2704 |
| 1517 | 2940 |
| 1518 | 3006 |
| 1519 | 3234 |
| 1520 | 2380 |
| 1521 | 2685 |
| 1522 | 2744 |
| 1523 | 2960 |
| 1524 | 2779 |
| 1525 | 3016 |
| 1526 | 2985 |
| 1527 | 3266 |
| 1528 | 2849 |
| 1529 | 3064 |
| 1530 | 3098 |
| 1531 | 3347 |
| 1532 | 3166 |
| 1533 | 3389 |
| 1534 | 3444 |
| 1535 | 3576 |
| 1536 | 320 |
| 1537 | 416 |
| 1538 | 464 |
| 1539 | 667 |
| 1540 | 503 |
| 1541 | 740 |
| 1542 | 779 |
| 1543 | 1013 |
| 1544 | 527 |
| 1545 | 794 |
| 1546 | 821 |
| 1547 | 1028 |
| 1548 | 859 |
| 1549 | 1076 |
| 1550 | 1088 |
| 1551 | 1401 |
| 1552 | 536 |
| 1553 | 855 |
| 1554 | 882 |
| 1555 | 1073 |
| 1556 | 909 |
| 1557 | 1202 |
| 1558 | 1225 |
| 1559 | 1469 |
| 1560 | 979 |
| 1561 | 1231 |
| 1562 | 1284 |
| 1563 | 1545 |
| 1564 | 1325 |
| 1565 | 1594 |
| 1566 | 1636 |
| 1567 | 1949 |
| 1568 | 545 |
| 1569 | 898 |
| 1570 | 947 |
| 1571 | 1213 |
| 1572 | 984 |
| 1573 | 1281 |
| 1574 | 1311 |
| 1575 | 1577 |
| 1576 | 1015 |
| 1577 | 1337 |
| 1578 | 1366 |
| 1579 | 1645 |
| 1580 | 1406 |
| 1581 | 1697 |
| 1582 | 1736 |
| 1583 | 1981 |
| 1584 | 1047 |
| 1585 | 1386 |
| 1586 | 1433 |
| 1587 | 1716 |
| 1588 | 1484 |

TABLE Z2-continued

| with a sequence length of 4096: | |
|---|---|
| Polarized channel sequence number | Reliability or reliability sequence number |
| 1589 | 1773 |
| 1590 | 1802 |
| 1591 | 2057 |
| 1592 | 1506 |
| 1593 | 1791 |
| 1594 | 1851 |
| 1595 | 2123 |
| 1596 | 1858 |
| 1597 | 2155 |
| 1598 | 2200 |
| 1599 | 2575 |
| 1600 | 702 |
| 1601 | 982 |
| 1602 | 1003 |
| 1603 | 1321 |
| 1604 | 1034 |
| 1605 | 1369 |
| 1606 | 1403 |
| 1607 | 1681 |
| 1608 | 1104 |
| 1609 | 1437 |
| 1610 | 1461 |
| 1611 | 1759 |
| 1612 | 1513 |
| 1613 | 1814 |
| 1614 | 1845 |
| 1615 | 2079 |
| 1616 | 1150 |
| 1617 | 1466 |
| 1618 | 1529 |
| 1619 | 1797 |
| 1620 | 1574 |
| 1621 | 1856 |
| 1622 | 1870 |
| 1623 | 2139 |
| 1624 | 1610 |
| 1625 | 1873 |
| 1626 | 1891 |
| 1627 | 2205 |
| 1628 | 2007 |
| 1629 | 2241 |
| 1630 | 2312 |
| 1631 | 2596 |
| 1632 | 1193 |
| 1633 | 1572 |
| 1634 | 1599 |
| 1635 | 1887 |
| 1636 | 1658 |
| 1637 | 1935 |
| 1638 | 1947 |
| 1639 | 2221 |
| 1640 | 1702 |
| 1641 | 2003 |
| 1642 | 2041 |
| 1643 | 2282 |
| 1644 | 2101 |
| 1645 | 2335 |
| 1646 | 2364 |
| 1647 | 2663 |
| 1648 | 1755 |
| 1649 | 2063 |
| 1650 | 2121 |
| 1651 | 2366 |
| 1652 | 2176 |
| 1653 | 2396 |
| 1654 | 2465 |
| 1655 | 2707 |
| 1656 | 2253 |
| 1657 | 2475 |
| 1658 | 2529 |
| 1659 | 2762 |
| 1660 | 2562 |
| 1661 | 2816 |
| 1662 | 2878 |
| 1663 | 3142 |

TABLE Z2-continued

| with a sequence length of 4096: | |
|---|---|
| Polarized channel sequence number | Reliability or reliability sequence number |
| 1664 | 714 |
| 1665 | 1025 |
| 1666 | 1078 |
| 1667 | 1429 |
| 1668 | 1144 |
| 1669 | 1464 |
| 1670 | 1518 |
| 1671 | 1823 |
| 1672 | 1179 |
| 1673 | 1537 |
| 1674 | 1580 |
| 1675 | 1875 |
| 1676 | 1622 |
| 1677 | 1902 |
| 1678 | 1916 |
| 1679 | 2213 |
| 1680 | 1254 |
| 1681 | 1602 |
| 1682 | 1655 |
| 1683 | 1918 |
| 1684 | 1700 |
| 1685 | 1995 |
| 1686 | 2029 |
| 1687 | 2273 |
| 1688 | 1753 |
| 1689 | 2053 |
| 1690 | 2099 |
| 1691 | 2348 |
| 1692 | 2143 |
| 1693 | 2382 |
| 1694 | 2439 |
| 1695 | 2665 |
| 1696 | 1314 |
| 1697 | 1677 |
| 1698 | 1734 |
| 1699 | 2037 |
| 1700 | 1806 |
| 1701 | 2089 |
| 1702 | 2083 |
| 1703 | 2387 |
| 1704 | 1838 |
| 1705 | 2129 |
| 1706 | 2153 |
| 1707 | 2427 |
| 1708 | 2226 |
| 1709 | 2467 |
| 1710 | 2492 |
| 1711 | 2768 |
| 1712 | 1898 |
| 1713 | 2178 |
| 1714 | 2247 |
| 1715 | 2484 |
| 1716 | 2275 |
| 1717 | 2544 |
| 1718 | 2565 |
| 1719 | 2828 |
| 1720 | 2321 |
| 1721 | 2591 |
| 1722 | 2636 |
| 1723 | 2894 |
| 1724 | 2716 |
| 1725 | 2947 |
| 1726 | 3009 |
| 1727 | 3239 |
| 1728 | 1358 |
| 1729 | 1764 |
| 1730 | 1812 |
| 1731 | 2135 |
| 1732 | 1868 |
| 1733 | 2167 |
| 1734 | 2228 |
| 1735 | 2477 |
| 1736 | 1989 |
| 1737 | 2249 |
| 1738 | 2295 |

TABLE Z2-continued

| with a sequence length of 4096: | |
|---|---|
| Polarized channel sequence number | Reliability or reliability sequence number |
| 1739 | 2554 |
| 1740 | 2304 |
| 1741 | 2572 |
| 1742 | 2614 |
| 1743 | 2865 |
| 1744 | 2013 |
| 1745 | 2297 |
| 1746 | 2317 |
| 1747 | 2606 |
| 1748 | 2389 |
| 1749 | 2630 |
| 1750 | 2696 |
| 1751 | 2937 |
| 1752 | 2451 |
| 1753 | 2713 |
| 1754 | 2741 |
| 1755 | 2964 |
| 1756 | 2791 |
| 1757 | 3034 |
| 1758 | 3075 |
| 1759 | 3280 |
| 1760 | 2055 |
| 1761 | 2408 |
| 1762 | 2434 |
| 1763 | 2668 |
| 1764 | 2497 |
| 1765 | 2721 |
| 1766 | 2753 |
| 1767 | 2992 |
| 1768 | 2532 |
| 1769 | 2785 |
| 1770 | 2831 |
| 1771 | 3060 |
| 1772 | 2881 |
| 1773 | 3102 |
| 1774 | 3158 |
| 1775 | 3363 |
| 1776 | 2641 |
| 1777 | 2837 |
| 1778 | 2897 |
| 1779 | 3114 |
| 1780 | 2954 |
| 1781 | 3174 |
| 1782 | 3200 |
| 1783 | 3427 |
| 1784 | 2995 |
| 1785 | 3221 |
| 1786 | 3261 |
| 1787 | 3461 |
| 1788 | 3313 |
| 1789 | 3510 |
| 1790 | 3569 |
| 1791 | 3740 |
| 1792 | 769 |
| 1793 | 1106 |
| 1794 | 1161 |
| 1795 | 1540 |
| 1796 | 1248 |
| 1797 | 1597 |
| 1798 | 1646 |
| 1799 | 1965 |
| 1800 | 1272 |
| 1801 | 1663 |
| 1802 | 1714 |
| 1803 | 2001 |
| 1804 | 1761 |
| 1805 | 2045 |
| 1806 | 2113 |
| 1807 | 2441 |
| 1808 | 1343 |
| 1809 | 1739 |
| 1810 | 1821 |
| 1811 | 2077 |
| 1812 | 1855 |
| 1813 | 2163 |

TABLE Z2-continued

| with a sequence length of 4096: | |
|---|---|
| Polarized channel sequence number | Reliability or reliability sequence number |
| 1814 | 2145 |
| 1815 | 2458 |
| 1816 | 1881 |
| 1817 | 2188 |
| 1818 | 2234 |
| 1819 | 2522 |
| 1820 | 2290 |
| 1821 | 2547 |
| 1822 | 2580 |
| 1823 | 2853 |
| 1824 | 1487 |
| 1825 | 1840 |
| 1826 | 1885 |
| 1827 | 2161 |
| 1828 | 1987 |
| 1829 | 2219 |
| 1830 | 2258 |
| 1831 | 2557 |
| 1832 | 1999 |
| 1833 | 2292 |
| 1834 | 2310 |
| 1835 | 2585 |
| 1836 | 2337 |
| 1837 | 2620 |
| 1838 | 2649 |
| 1839 | 2920 |
| 1840 | 2015 |
| 1841 | 2328 |
| 1842 | 2376 |
| 1843 | 2646 |
| 1844 | 2448 |
| 1845 | 2693 |
| 1846 | 2736 |
| 1847 | 2971 |
| 1848 | 2487 |
| 1849 | 2776 |
| 1850 | 2788 |
| 1851 | 3038 |
| 1852 | 2834 |
| 1853 | 3079 |
| 1854 | 3126 |
| 1855 | 3337 |
| 1856 | 1509 |
| 1857 | 1983 |
| 1858 | 1993 |
| 1859 | 2277 |
| 1860 | 2017 |
| 1861 | 2301 |
| 1862 | 2346 |
| 1863 | 2628 |
| 1864 | 2061 |
| 1865 | 2392 |
| 1866 | 2429 |
| 1867 | 2679 |
| 1868 | 2472 |
| 1869 | 2724 |
| 1870 | 2782 |
| 1871 | 3024 |
| 1872 | 2245 |
| 1873 | 2446 |
| 1874 | 2499 |
| 1875 | 2738 |
| 1876 | 2534 |
| 1877 | 2809 |
| 1878 | 2840 |
| 1879 | 3068 |
| 1880 | 2625 |
| 1881 | 2843 |
| 1882 | 2900 |
| 1883 | 3118 |
| 1884 | 2957 |
| 1885 | 3170 |
| 1886 | 3195 |
| 1887 | 3421 |
| 1888 | 2306 |

TABLE Z2-continued with a sequence length of 4096:

| Polarized channel sequence number | Reliability or reliability sequence number |
|---|---|
| 1889 | 2542 |
| 1890 | 2604 |
| 1891 | 2812 |
| 1892 | 2644 |
| 1893 | 2888 |
| 1894 | 2927 |
| 1895 | 3138 |
| 1896 | 2701 |
| 1897 | 2944 |
| 1898 | 2978 |
| 1899 | 3191 |
| 1900 | 3020 |
| 1901 | 3225 |
| 1902 | 3275 |
| 1903 | 3479 |
| 1904 | 2747 |
| 1905 | 2999 |
| 1906 | 3049 |
| 1907 | 3257 |
| 1908 | 3094 |
| 1909 | 3289 |
| 1910 | 3332 |
| 1911 | 3523 |
| 1912 | 3146 |
| 1913 | 3352 |
| 1914 | 3384 |
| 1915 | 3556 |
| 1916 | 3410 |
| 1917 | 3620 |
| 1918 | 3636 |
| 1919 | 3827 |
| 1920 | 1526 |
| 1921 | 2023 |
| 1922 | 2043 |
| 1923 | 2436 |
| 1924 | 2217 |
| 1925 | 2463 |
| 1926 | 2489 |
| 1927 | 2771 |
| 1928 | 2264 |
| 1929 | 2519 |
| 1930 | 2549 |
| 1931 | 2819 |
| 1932 | 2612 |
| 1933 | 2862 |
| 1934 | 2917 |
| 1935 | 3130 |
| 1936 | 2315 |
| 1937 | 2578 |
| 1938 | 2638 |
| 1939 | 2872 |
| 1940 | 2674 |
| 1941 | 2930 |
| 1942 | 2981 |
| 1943 | 3183 |
| 1944 | 2727 |
| 1945 | 3013 |
| 1946 | 2974 |
| 1947 | 3212 |
| 1948 | 3072 |
| 1949 | 3270 |
| 1950 | 3308 |
| 1951 | 3497 |
| 1952 | 2453 |
| 1953 | 2657 |
| 1954 | 2690 |
| 1955 | 2950 |
| 1956 | 2765 |
| 1957 | 2988 |
| 1958 | 3045 |
| 1959 | 3243 |
| 1960 | 2803 |
| 1961 | 3053 |
| 1962 | 3090 |
| 1963 | 3294 |

TABLE Z2-continued with a sequence length of 4096:

| Polarized channel sequence number | Reliability or reliability sequence number |
|---|---|
| 1964 | 3122 |
| 1965 | 3318 |
| 1966 | 3368 |
| 1967 | 3549 |
| 1968 | 2884 |
| 1969 | 3106 |
| 1970 | 3154 |
| 1971 | 3342 |
| 1972 | 3204 |
| 1973 | 3394 |
| 1974 | 3416 |
| 1975 | 3605 |
| 1976 | 3230 |
| 1977 | 3456 |
| 1978 | 3473 |
| 1979 | 3652 |
| 1980 | 3516 |
| 1981 | 3676 |
| 1982 | 3694 |
| 1983 | 3792 |
| 1984 | 2537 |
| 1985 | 2699 |
| 1986 | 2800 |
| 1987 | 3057 |
| 1988 | 2859 |
| 1989 | 3087 |
| 1990 | 3110 |
| 1991 | 3323 |
| 1992 | 2910 |
| 1993 | 3162 |
| 1994 | 3178 |
| 1995 | 3378 |
| 1996 | 3217 |
| 1997 | 3400 |
| 1998 | 3467 |
| 1999 | 3628 |
| 2000 | 2923 |
| 2001 | 3208 |
| 2002 | 3248 |
| 2003 | 3450 |
| 2004 | 3303 |
| 2005 | 3485 |
| 2006 | 3491 |
| 2007 | 3685 |
| 2008 | 3358 |
| 2009 | 3529 |
| 2010 | 3542 |
| 2011 | 3702 |
| 2012 | 3591 |
| 2013 | 3750 |
| 2014 | 3770 |
| 2015 | 3896 |
| 2016 | 3027 |
| 2017 | 3284 |
| 2018 | 3298 |
| 2019 | 3504 |
| 2020 | 3373 |
| 2021 | 3536 |
| 2022 | 3563 |
| 2023 | 3721 |
| 2024 | 3405 |
| 2025 | 3598 |
| 2026 | 3613 |
| 2027 | 3760 |
| 2028 | 3660 |
| 2029 | 3781 |
| 2030 | 3840 |
| 2031 | 3929 |
| 2032 | 3438 |
| 2033 | 3644 |
| 2034 | 3668 |
| 2035 | 3803 |
| 2036 | 3712 |
| 2037 | 3815 |
| 2038 | 3853 |

TABLE Z2-continued with a sequence length of 4096:

| Polarized channel sequence number | Reliability or reliability sequence number |
|---|---|
| 2039 | 3947 |
| 2040 | 3730 |
| 2041 | 3866 |
| 2042 | 3881 |
| 2043 | 3968 |
| 2044 | 3912 |
| 2045 | 3990 |
| 2046 | 4016 |
| 2047 | 4049 |
| 2048 | 11 |
| 2049 | 46 |
| 2050 | 79 |
| 2051 | 183 |
| 2052 | 105 |
| 2053 | 199 |
| 2054 | 256 |
| 2055 | 393 |
| 2056 | 128 |
| 2057 | 242 |
| 2058 | 280 |
| 2059 | 427 |
| 2060 | 314 |
| 2061 | 467 |
| 2062 | 482 |
| 2063 | 743 |
| 2064 | 148 |
| 2065 | 268 |
| 2066 | 292 |
| 2067 | 459 |
| 2068 | 345 |
| 2069 | 512 |
| 2070 | 572 |
| 2071 | 768 |
| 2072 | 374 |
| 2073 | 566 |
| 2074 | 539 |
| 2075 | 801 |
| 2076 | 634 |
| 2077 | 843 |
| 2078 | 870 |
| 2079 | 1117 |
| 2080 | 166 |
| 2081 | 325 |
| 2082 | 365 |
| 2083 | 526 |
| 2084 | 384 |
| 2085 | 559 |
| 2086 | 598 |
| 2087 | 811 |
| 2088 | 435 |
| 2089 | 622 |
| 2090 | 645 |
| 2091 | 847 |
| 2092 | 717 |
| 2093 | 900 |
| 2094 | 925 |
| 2095 | 1175 |
| 2096 | 475 |
| 2097 | 657 |
| 2098 | 732 |
| 2099 | 917 |
| 2100 | 758 |
| 2101 | 953 |
| 2102 | 993 |
| 2103 | 1214 |
| 2104 | 797 |
| 2105 | 1001 |
| 2106 | 1042 |
| 2107 | 1292 |
| 2108 | 1064 |
| 2109 | 1327 |
| 2110 | 1388 |
| 2111 | 1668 |
| 2112 | 214 |
| 2113 | 335 |

TABLE Z2-continued with a sequence length of 4096:

| Polarized channel sequence number | Reliability or reliability sequence number |
|---|---|
| 2114 | 410 |
| 2115 | 616 |
| 2116 | 443 |
| 2117 | 640 |
| 2118 | 711 |
| 2119 | 878 |
| 2120 | 490 |
| 2121 | 737 |
| 2122 | 668 |
| 2123 | 929 |
| 2124 | 782 |
| 2125 | 969 |
| 2126 | 1020 |
| 2127 | 1239 |
| 2128 | 553 |
| 2129 | 727 |
| 2130 | 792 |
| 2131 | 997 |
| 2132 | 820 |
| 2133 | 1031 |
| 2134 | 1061 |
| 2135 | 1313 |
| 2136 | 861 |
| 2137 | 1071 |
| 2138 | 1128 |
| 2139 | 1359 |
| 2140 | 1172 |
| 2141 | 1408 |
| 2142 | 1451 |
| 2143 | 1756 |
| 2144 | 610 |
| 2145 | 806 |
| 2146 | 852 |
| 2147 | 1057 |
| 2148 | 908 |
| 2149 | 1096 |
| 2150 | 1152 |
| 2151 | 1396 |
| 2152 | 945 |
| 2153 | 1155 |
| 2154 | 1211 |
| 2155 | 1432 |
| 2156 | 1249 |
| 2157 | 1494 |
| 2158 | 1533 |
| 2159 | 1826 |
| 2160 | 1012 |
| 2161 | 1233 |
| 2162 | 1304 |
| 2163 | 1504 |
| 2164 | 1322 |
| 2165 | 1536 |
| 2166 | 1591 |
| 2167 | 1884 |
| 2168 | 1377 |
| 2169 | 1608 |
| 2170 | 1654 |
| 2171 | 1930 |
| 2172 | 1696 |
| 2173 | 1970 |
| 2174 | 2040 |
| 2175 | 2386 |
| 2176 | 303 |
| 2177 | 401 |
| 2178 | 451 |
| 2179 | 722 |
| 2180 | 519 |
| 2181 | 753 |
| 2182 | 772 |
| 2183 | 1016 |
| 2184 | 579 |
| 2185 | 787 |
| 2186 | 825 |
| 2187 | 1053 |
| 2188 | 865 |

TABLE Z2-continued with a sequence length of 4096:

| Polarized channel sequence number | Reliability or reliability sequence number |
|---|---|
| 2189 | 1093 |
| 2190 | 1107 |
| 2191 | 1394 |
| 2192 | 628 |
| 2193 | 829 |
| 2194 | 874 |
| 2195 | 1100 |
| 2196 | 921 |
| 2197 | 1148 |
| 2198 | 1201 |
| 2199 | 1438 |
| 2200 | 965 |
| 2201 | 1204 |
| 2202 | 1236 |
| 2203 | 1478 |
| 2204 | 1310 |
| 2205 | 1523 |
| 2206 | 1578 |
| 2207 | 1863 |
| 2208 | 679 |
| 2209 | 891 |
| 2210 | 949 |
| 2211 | 1168 |
| 2212 | 973 |
| 2213 | 1207 |
| 2214 | 1258 |
| 2215 | 1507 |
| 2216 | 1046 |
| 2217 | 1298 |
| 2218 | 1324 |
| 2219 | 1543 |
| 2220 | 1374 |
| 2221 | 1606 |
| 2222 | 1640 |
| 2223 | 1926 |
| 2224 | 1103 |
| 2225 | 1351 |
| 2226 | 1399 |
| 2227 | 1620 |
| 2228 | 1435 |
| 2229 | 1685 |
| 2230 | 1703 |
| 2231 | 1964 |
| 2232 | 1497 |
| 2233 | 1729 |
| 2234 | 1792 |
| 2235 | 2022 |
| 2236 | 1837 |
| 2237 | 2076 |
| 2238 | 2187 |
| 2239 | 2388 |
| 2240 | 701 |
| 2241 | 957 |
| 2242 | 1027 |
| 2243 | 1267 |
| 2244 | 1086 |
| 2245 | 1316 |
| 2246 | 1371 |
| 2247 | 1615 |
| 2248 | 1121 |
| 2249 | 1379 |
| 2250 | 1413 |
| 2251 | 1666 |
| 2252 | 1454 |
| 2253 | 1701 |
| 2254 | 1751 |
| 2255 | 2004 |
| 2256 | 1195 |
| 2257 | 1443 |
| 2258 | 1481 |
| 2259 | 1724 |
| 2260 | 1538 |
| 2261 | 1780 |
| 2262 | 1831 |
| 2263 | 2094 |

TABLE Z2-continued with a sequence length of 4096:

| Polarized channel sequence number | Reliability or reliability sequence number |
|---|---|
| 2264 | 1566 |
| 2265 | 1844 |
| 2266 | 1892 |
| 2267 | 2138 |
| 2268 | 1942 |
| 2269 | 2206 |
| 2270 | 2246 |
| 2271 | 2551 |
| 2272 | 1255 |
| 2273 | 1512 |
| 2274 | 1551 |
| 2275 | 1800 |
| 2276 | 1625 |
| 2277 | 1859 |
| 2278 | 1901 |
| 2279 | 2174 |
| 2280 | 1694 |
| 2281 | 1917 |
| 2282 | 1966 |
| 2283 | 2229 |
| 2284 | 2024 |
| 2285 | 2254 |
| 2286 | 2343 |
| 2287 | 2635 |
| 2288 | 1749 |
| 2289 | 1986 |
| 2290 | 2044 |
| 2291 | 2302 |
| 2292 | 2070 |
| 2293 | 2372 |
| 2294 | 2411 |
| 2295 | 2705 |
| 2296 | 2181 |
| 2297 | 2430 |
| 2298 | 2473 |
| 2299 | 2691 |
| 2300 | 2516 |
| 2301 | 2760 |
| 2302 | 2845 |
| 2303 | 3100 |
| 2304 | 355 |
| 2305 | 497 |
| 2306 | 532 |
| 2307 | 815 |
| 2308 | 585 |
| 2309 | 834 |
| 2310 | 883 |
| 2311 | 1145 |
| 2312 | 591 |
| 2313 | 887 |
| 2314 | 933 |
| 2315 | 1178 |
| 2316 | 981 |
| 2317 | 1242 |
| 2318 | 1273 |
| 2319 | 1573 |
| 2320 | 674 |
| 2321 | 937 |
| 2322 | 985 |
| 2323 | 1283 |
| 2324 | 1035 |
| 2325 | 1307 |
| 2326 | 1345 |
| 2327 | 1576 |
| 2328 | 1068 |
| 2329 | 1339 |
| 2330 | 1391 |
| 2331 | 1652 |
| 2332 | 1446 |
| 2333 | 1692 |
| 2334 | 1713 |
| 2335 | 1962 |
| 2336 | 690 |
| 2337 | 1024 |
| 2338 | 1075 |

TABLE Z2-continued with a sequence length of 4096:

| Polarized channel sequence number | Reliability or reliability sequence number |
|---|---|
| 2339 | 1289 |
| 2340 | 1135 |
| 2341 | 1354 |
| 2342 | 1402 |
| 2343 | 1689 |
| 2344 | 1165 |
| 2345 | 1427 |
| 2346 | 1457 |
| 2347 | 1717 |
| 2348 | 1489 |
| 2349 | 1776 |
| 2350 | 1811 |
| 2351 | 2066 |
| 2352 | 1162 |
| 2353 | 1483 |
| 2354 | 1517 |
| 2355 | 1772 |
| 2356 | 1563 |
| 2357 | 1835 |
| 2358 | 1867 |
| 2359 | 2142 |
| 2360 | 1630 |
| 2361 | 1907 |
| 2362 | 1946 |
| 2363 | 2204 |
| 2364 | 1982 |
| 2365 | 2242 |
| 2366 | 2311 |
| 2367 | 2613 |
| 2368 | 748 |
| 2369 | 1114 |
| 2370 | 1138 |
| 2371 | 1419 |
| 2372 | 1188 |
| 2373 | 1470 |
| 2374 | 1515 |
| 2375 | 1758 |
| 2376 | 1220 |
| 2377 | 1530 |
| 2378 | 1548 |
| 2379 | 1829 |
| 2380 | 1593 |
| 2381 | 1882 |
| 2382 | 1915 |
| 2383 | 2199 |
| 2384 | 1382 |
| 2385 | 1581 |
| 2386 | 1628 |
| 2387 | 1890 |
| 2388 | 1671 |
| 2389 | 1938 |
| 2390 | 1980 |
| 2391 | 2235 |
| 2392 | 1735 |
| 2393 | 1994 |
| 2394 | 2054 |
| 2395 | 2296 |
| 2396 | 2102 |
| 2397 | 2368 |
| 2398 | 2416 |
| 2399 | 2678 |
| 2400 | 1467 |
| 2401 | 1659 |
| 2402 | 1722 |
| 2403 | 1958 |
| 2404 | 1769 |
| 2405 | 2018 |
| 2406 | 2060 |
| 2407 | 2347 |
| 2408 | 1820 |
| 2409 | 2084 |
| 2410 | 2118 |
| 2411 | 2383 |
| 2412 | 2189 |
| 2413 | 2450 |
| 2414 | 2490 |
| 2415 | 2739 |
| 2416 | 1897 |
| 2417 | 2185 |
| 2418 | 2210 |
| 2419 | 2474 |
| 2420 | 2237 |
| 2421 | 2520 |
| 2422 | 2461 |
| 2423 | 2780 |
| 2424 | 2324 |
| 2425 | 2605 |
| 2426 | 2639 |
| 2427 | 2863 |
| 2428 | 2653 |
| 2429 | 2946 |
| 2430 | 2990 |
| 2431 | 3149 |
| 2432 | 777 |
| 2433 | 1181 |
| 2434 | 1198 |
| 2435 | 1561 |
| 2436 | 1357 |
| 2437 | 1603 |
| 2438 | 1635 |
| 2439 | 1905 |
| 2440 | 1424 |
| 2441 | 1647 |
| 2442 | 1675 |
| 2443 | 1950 |
| 2444 | 1733 |
| 2445 | 2000 |
| 2446 | 2052 |
| 2447 | 2352 |
| 2448 | 1462 |
| 2449 | 1726 |
| 2450 | 1767 |
| 2451 | 2002 |
| 2452 | 1798 |
| 2453 | 2062 |
| 2454 | 2108 |
| 2455 | 2395 |
| 2456 | 1846 |
| 2457 | 2124 |
| 2458 | 2170 |
| 2459 | 2438 |
| 2460 | 2233 |
| 2461 | 2483 |
| 2462 | 2548 |
| 2463 | 2792 |
| 2464 | 1571 |
| 2465 | 1778 |
| 2466 | 1809 |
| 2467 | 2104 |
| 2468 | 1865 |
| 2469 | 2156 |
| 2470 | 2216 |
| 2471 | 2464 |
| 2472 | 1948 |
| 2473 | 2218 |
| 2474 | 2248 |
| 2475 | 2543 |
| 2476 | 2327 |
| 2477 | 2511 |
| 2478 | 2624 |
| 2479 | 2869 |
| 2480 | 2016 |
| 2481 | 2285 |
| 2482 | 2363 |
| 2483 | 2607 |
| 2484 | 2397 |
| 2485 | 2650 |
| 2486 | 2684 |
| 2487 | 2921 |
| 2488 | 2452 |

TABLE Z2-continued

| with a sequence length of 4096: | |
|---|---|
| Polarized channel sequence number | Reliability or reliability sequence number |
| 2489 | 2698 |
| 2490 | 2695 |
| 2491 | 2979 |
| 2492 | 2783 |
| 2493 | 3011 |
| 2494 | 3047 |
| 2495 | 3251 |
| 2496 | 1656 |
| 2497 | 1839 |
| 2498 | 1909 |
| 2499 | 2222 |
| 2500 | 1996 |
| 2501 | 2252 |
| 2502 | 2307 |
| 2503 | 2568 |
| 2504 | 2056 |
| 2505 | 2349 |
| 2506 | 2374 |
| 2507 | 2642 |
| 2508 | 2428 |
| 2509 | 2659 |
| 2510 | 2694 |
| 2511 | 2941 |
| 2512 | 2110 |
| 2513 | 2405 |
| 2514 | 2466 |
| 2515 | 2681 |
| 2516 | 2491 |
| 2517 | 2702 |
| 2518 | 2786 |
| 2519 | 3014 |
| 2520 | 2564 |
| 2521 | 2804 |
| 2522 | 2836 |
| 2523 | 3056 |
| 2524 | 2892 |
| 2525 | 3112 |
| 2526 | 3143 |
| 2527 | 3350 |
| 2528 | 2201 |
| 2529 | 2478 |
| 2530 | 2536 |
| 2531 | 2789 |
| 2532 | 2621 |
| 2533 | 2795 |
| 2534 | 2880 |
| 2535 | 3071 |
| 2536 | 2632 |
| 2537 | 2871 |
| 2538 | 2926 |
| 2539 | 3131 |
| 2540 | 2968 |
| 2541 | 3172 |
| 2542 | 3228 |
| 2543 | 3422 |
| 2544 | 2661 |
| 2545 | 2949 |
| 2546 | 3003 |
| 2547 | 3192 |
| 2548 | 3032 |
| 2549 | 3237 |
| 2550 | 3211 |
| 2551 | 3445 |
| 2552 | 3093 |
| 2553 | 3278 |
| 2554 | 3306 |
| 2555 | 3511 |
| 2556 | 3364 |
| 2557 | 3546 |
| 2558 | 3588 |
| 2559 | 3696 |
| 2560 | 419 |
| 2561 | 546 |
| 2562 | 604 |
| 2563 | 856 |

TABLE Z2-continued

| with a sequence length of 4096: | |
|---|---|
| Polarized channel sequence number | Reliability or reliability sequence number |
| 2564 | 651 |
| 2565 | 941 |
| 2566 | 989 |
| 2567 | 1261 |
| 2568 | 685 |
| 2569 | 1005 |
| 2570 | 1038 |
| 2571 | 1280 |
| 2572 | 1082 |
| 2573 | 1333 |
| 2574 | 1348 |
| 2575 | 1678 |
| 2576 | 695 |
| 2577 | 1079 |
| 2578 | 1110 |
| 2579 | 1330 |
| 2580 | 1141 |
| 2581 | 1473 |
| 2582 | 1499 |
| 2583 | 1747 |
| 2584 | 1223 |
| 2585 | 1502 |
| 2586 | 1558 |
| 2587 | 1822 |
| 2588 | 1601 |
| 2589 | 1871 |
| 2590 | 1913 |
| 2591 | 2227 |
| 2592 | 706 |
| 2593 | 1131 |
| 2594 | 1185 |
| 2595 | 1486 |
| 2596 | 1230 |
| 2597 | 1553 |
| 2598 | 1586 |
| 2599 | 1854 |
| 2600 | 1264 |
| 2601 | 1613 |
| 2602 | 1642 |
| 2603 | 1922 |
| 2604 | 1682 |
| 2605 | 1972 |
| 2606 | 2010 |
| 2607 | 2257 |
| 2608 | 1301 |
| 2609 | 1664 |
| 2610 | 1708 |
| 2611 | 1992 |
| 2612 | 1760 |
| 2613 | 2046 |
| 2614 | 2080 |
| 2615 | 2336 |
| 2616 | 1783 |
| 2617 | 2068 |
| 2618 | 2128 |
| 2619 | 2402 |
| 2620 | 2136 |
| 2621 | 2437 |
| 2622 | 2481 |
| 2623 | 2851 |
| 2624 | 896 |
| 2625 | 1227 |
| 2626 | 1252 |
| 2627 | 1596 |
| 2628 | 1286 |
| 2629 | 1644 |
| 2630 | 1680 |
| 2631 | 1956 |
| 2632 | 1365 |
| 2633 | 1715 |
| 2634 | 1738 |
| 2635 | 2032 |
| 2636 | 1789 |
| 2637 | 2090 |
| 2638 | 2122 |

TABLE Z2-continued with a sequence length of 4096:

| Polarized channel sequence number | Reliability or reliability sequence number |
|---|---|
| 2639 | 2358 |
| 2640 | 1416 |
| 2641 | 1745 |
| 2642 | 1807 |
| 2643 | 2074 |
| 2644 | 1850 |
| 2645 | 2132 |
| 2646 | 2148 |
| 2647 | 2419 |
| 2648 | 1888 |
| 2649 | 2150 |
| 2650 | 2168 |
| 2651 | 2486 |
| 2652 | 2283 |
| 2653 | 2523 |
| 2654 | 2594 |
| 2655 | 2870 |
| 2656 | 1465 |
| 2657 | 1848 |
| 2658 | 1876 |
| 2659 | 2164 |
| 2660 | 1934 |
| 2661 | 2212 |
| 2662 | 2223 |
| 2663 | 2503 |
| 2664 | 1978 |
| 2665 | 2280 |
| 2666 | 2316 |
| 2667 | 2563 |
| 2668 | 2381 |
| 2669 | 2616 |
| 2670 | 2645 |
| 2671 | 2929 |
| 2672 | 2030 |
| 2673 | 2342 |
| 2674 | 2400 |
| 2675 | 2647 |
| 2676 | 2456 |
| 2677 | 2675 |
| 2678 | 2745 |
| 2679 | 2970 |
| 2680 | 2535 |
| 2681 | 2754 |
| 2682 | 2807 |
| 2683 | 3018 |
| 2684 | 2839 |
| 2685 | 3066 |
| 2686 | 3117 |
| 2687 | 3343 |
| 2688 | 912 |
| 2689 | 1276 |
| 2690 | 1336 |
| 2691 | 1706 |
| 2692 | 1410 |
| 2693 | 1740 |
| 2694 | 1796 |
| 2695 | 2098 |
| 2696 | 1449 |
| 2697 | 1816 |
| 2698 | 1857 |
| 2699 | 2154 |
| 2700 | 1899 |
| 2701 | 2179 |
| 2702 | 2193 |
| 2703 | 2495 |
| 2704 | 1528 |
| 2705 | 1880 |
| 2706 | 1932 |
| 2707 | 2195 |
| 2708 | 1974 |
| 2709 | 2270 |
| 2710 | 2305 |
| 2711 | 2553 |
| 2712 | 2026 |
| 2713 | 2331 |

TABLE Z2-continued with a sequence length of 4096:

| Polarized channel sequence number | Reliability or reliability sequence number |
|---|---|
| 2714 | 2377 |
| 2715 | 2631 |
| 2716 | 2423 |
| 2717 | 2664 |
| 2718 | 2719 |
| 2719 | 2932 |
| 2720 | 1588 |
| 2721 | 1954 |
| 2722 | 2008 |
| 2723 | 2313 |
| 2724 | 2082 |
| 2725 | 2367 |
| 2726 | 2361 |
| 2727 | 2667 |
| 2728 | 2112 |
| 2729 | 2409 |
| 2730 | 2433 |
| 2731 | 2708 |
| 2732 | 2506 |
| 2733 | 2748 |
| 2734 | 2772 |
| 2735 | 3023 |
| 2736 | 2175 |
| 2737 | 2459 |
| 2738 | 2528 |
| 2739 | 2763 |
| 2740 | 2556 |
| 2741 | 2821 |
| 2742 | 2842 |
| 2743 | 3074 |
| 2744 | 2602 |
| 2745 | 2866 |
| 2746 | 2903 |
| 2747 | 3133 |
| 2748 | 2976 |
| 2749 | 3179 |
| 2750 | 3231 |
| 2751 | 3425 |
| 2752 | 1632 |
| 2753 | 2038 |
| 2754 | 2088 |
| 2755 | 2414 |
| 2756 | 2144 |
| 2757 | 2447 |
| 2758 | 2508 |
| 2759 | 2757 |
| 2760 | 2265 |
| 2761 | 2531 |
| 2762 | 2576 |
| 2763 | 2830 |
| 2764 | 2584 |
| 2765 | 2848 |
| 2766 | 2886 |
| 2767 | 3108 |
| 2768 | 2289 |
| 2769 | 2579 |
| 2770 | 2599 |
| 2771 | 2877 |
| 2772 | 2670 |
| 2773 | 2901 |
| 2774 | 2958 |
| 2775 | 3169 |
| 2776 | 2731 |
| 2777 | 2973 |
| 2778 | 3000 |
| 2779 | 3194 |
| 2780 | 3044 |
| 2781 | 3255 |
| 2782 | 3288 |
| 2783 | 3457 |
| 2784 | 2333 |
| 2785 | 2687 |
| 2786 | 2714 |
| 2787 | 2935 |
| 2788 | 2774 |

TABLE Z2-continued with a sequence length of 4096:

| Polarized channel sequence number | Reliability or reliability sequence number |
|---|---|
| 2789 | 2982 |
| 2790 | 3008 |
| 2791 | 3218 |
| 2792 | 2810 |
| 2793 | 3039 |
| 2794 | 3078 |
| 2795 | 3276 |
| 2796 | 3121 |
| 2797 | 3310 |
| 2798 | 3356 |
| 2799 | 3524 |
| 2800 | 2909 |
| 2801 | 3084 |
| 2802 | 3137 |
| 2803 | 3321 |
| 2804 | 3185 |
| 2805 | 3371 |
| 2806 | 3391 |
| 2807 | 3579 |
| 2808 | 3222 |
| 2809 | 3409 |
| 2810 | 3441 |
| 2811 | 3602 |
| 2812 | 3486 |
| 2813 | 3642 |
| 2814 | 3690 |
| 2815 | 3819 |
| 2816 | 977 |
| 2817 | 1368 |
| 2818 | 1430 |
| 2819 | 1818 |
| 2820 | 1520 |
| 2821 | 1874 |
| 2822 | 1924 |
| 2823 | 2240 |
| 2824 | 1546 |
| 2825 | 1940 |
| 2826 | 1988 |
| 2827 | 2276 |
| 2828 | 2036 |
| 2829 | 2322 |
| 2830 | 2391 |
| 2831 | 2722 |
| 2832 | 1618 |
| 2833 | 2014 |
| 2834 | 2096 |
| 2835 | 2354 |
| 2836 | 2130 |
| 2837 | 2444 |
| 2838 | 2425 |
| 2839 | 2737 |
| 2840 | 2158 |
| 2841 | 2469 |
| 2842 | 2515 |
| 2843 | 2801 |
| 2844 | 2571 |
| 2845 | 2824 |
| 2846 | 2857 |
| 2847 | 3096 |
| 2848 | 1765 |
| 2849 | 2116 |
| 2850 | 2162 |
| 2851 | 2442 |
| 2852 | 2263 |
| 2853 | 2500 |
| 2854 | 2540 |
| 2855 | 2833 |
| 2856 | 2274 |
| 2857 | 2573 |
| 2858 | 2590 |
| 2859 | 2860 |
| 2860 | 2619 |
| 2861 | 2889 |
| 2862 | 2918 |
| 2863 | 3156 |

TABLE Z2-continued with a sequence length of 4096:

| Polarized channel sequence number | Reliability or reliability sequence number |
|---|---|
| 2864 | 2291 |
| 2865 | 2610 |
| 2866 | 2656 |
| 2867 | 2915 |
| 2868 | 2728 |
| 2869 | 2955 |
| 2870 | 2993 |
| 2871 | 3198 |
| 2872 | 2766 |
| 2873 | 3029 |
| 2874 | 3041 |
| 2875 | 3258 |
| 2876 | 3081 |
| 2877 | 3292 |
| 2878 | 3331 |
| 2879 | 3502 |
| 2880 | 1787 |
| 2881 | 2259 |
| 2882 | 2268 |
| 2883 | 2559 |
| 2884 | 2294 |
| 2885 | 2582 |
| 2886 | 2627 |
| 2887 | 2898 |
| 2888 | 2338 |
| 2889 | 2673 |
| 2890 | 2711 |
| 2891 | 2943 |
| 2892 | 2751 |
| 2893 | 2984 |
| 2894 | 3036 |
| 2895 | 3245 |
| 2896 | 2525 |
| 2897 | 2725 |
| 2898 | 2777 |
| 2899 | 2997 |
| 2900 | 2813 |
| 2901 | 3059 |
| 2902 | 3086 |
| 2903 | 3282 |
| 2904 | 2895 |
| 2905 | 3091 |
| 2906 | 3140 |
| 2907 | 3324 |
| 2908 | 3188 |
| 2909 | 3367 |
| 2910 | 3387 |
| 2911 | 3574 |
| 2912 | 2587 |
| 2913 | 2818 |
| 2914 | 2874 |
| 2915 | 3062 |
| 2916 | 2912 |
| 2917 | 3127 |
| 2918 | 3163 |
| 2919 | 3339 |
| 2920 | 2965 |
| 2921 | 3175 |
| 2922 | 3205 |
| 2923 | 3383 |
| 2924 | 3241 |
| 2925 | 3413 |
| 2926 | 3453 |
| 2927 | 3617 |
| 2928 | 3005 |
| 2929 | 3224 |
| 2930 | 3265 |
| 2931 | 3437 |
| 2932 | 3304 |
| 2933 | 3465 |
| 2934 | 3499 |
| 2935 | 3653 |
| 2936 | 3346 |
| 2937 | 3515 |
| 2938 | 3541 |

TABLE Z2-continued

| with a sequence length of 4096: | |
|---|---|
| Polarized channel sequence number | Reliability or reliability sequence number |
| 2939 | 3680 |
| 2940 | 3565 |
| 2941 | 3726 |
| 2942 | 3737 |
| 2943 | 3887 |
| 2944 | 1803 |
| 2945 | 2300 |
| 2946 | 2318 |
| 2947 | 2715 |
| 2948 | 2498 |
| 2949 | 2742 |
| 2950 | 2769 |
| 2951 | 3026 |
| 2952 | 2545 |
| 2953 | 2798 |
| 2954 | 2827 |
| 2955 | 3069 |
| 2956 | 2883 |
| 2957 | 3105 |
| 2958 | 3152 |
| 2959 | 3335 |
| 2960 | 2595 |
| 2961 | 2854 |
| 2962 | 2906 |
| 2963 | 3115 |
| 2964 | 2938 |
| 2965 | 3165 |
| 2966 | 3207 |
| 2967 | 3379 |
| 2968 | 2987 |
| 2969 | 3235 |
| 2970 | 3201 |
| 2971 | 3402 |
| 2972 | 3286 |
| 2973 | 3448 |
| 2974 | 3482 |
| 2975 | 3632 |
| 2976 | 2734 |
| 2977 | 2924 |
| 2978 | 2952 |
| 2979 | 3181 |
| 2980 | 3021 |
| 2981 | 3214 |
| 2982 | 3262 |
| 2983 | 3429 |
| 2984 | 3054 |
| 2985 | 3268 |
| 2986 | 3300 |
| 2987 | 3469 |
| 2988 | 3327 |
| 2989 | 3490 |
| 2990 | 3528 |
| 2991 | 3674 |
| 2992 | 3124 |
| 2993 | 3314 |
| 2994 | 3354 |
| 2995 | 3507 |
| 2996 | 3395 |
| 2997 | 3551 |
| 2998 | 3570 |
| 2999 | 3714 |
| 3000 | 3418 |
| 3001 | 3597 |
| 3002 | 3612 |
| 3003 | 3751 |
| 3004 | 3647 |
| 3005 | 3769 |
| 3006 | 3784 |
| 3007 | 3860 |
| 3008 | 2815 |
| 3009 | 2962 |
| 3010 | 3051 |
| 3011 | 3272 |
| 3012 | 3103 |
| 3013 | 3296 |

TABLE Z2-continued

| with a sequence length of 4096: | |
|---|---|
| Polarized channel sequence number | Reliability or reliability sequence number |
| 3014 | 3317 |
| 3015 | 3494 |
| 3016 | 3147 |
| 3017 | 3360 |
| 3018 | 3375 |
| 3019 | 3538 |
| 3020 | 3406 |
| 3021 | 3555 |
| 3022 | 3607 |
| 3023 | 3732 |
| 3024 | 3159 |
| 3025 | 3398 |
| 3026 | 3432 |
| 3027 | 3593 |
| 3028 | 3477 |
| 3029 | 3622 |
| 3030 | 3626 |
| 3031 | 3776 |
| 3032 | 3520 |
| 3033 | 3658 |
| 3034 | 3669 |
| 3035 | 3790 |
| 3036 | 3703 |
| 3037 | 3828 |
| 3038 | 3843 |
| 3039 | 3939 |
| 3040 | 3247 |
| 3041 | 3462 |
| 3042 | 3474 |
| 3043 | 3637 |
| 3044 | 3533 |
| 3045 | 3663 |
| 3046 | 3686 |
| 3047 | 3805 |
| 3048 | 3560 |
| 3049 | 3708 |
| 3050 | 3719 |
| 3051 | 3835 |
| 3052 | 3757 |
| 3053 | 3851 |
| 3054 | 3897 |
| 3055 | 3964 |
| 3056 | 3583 |
| 3057 | 3744 |
| 3058 | 3763 |
| 3059 | 3869 |
| 3060 | 3797 |
| 3061 | 3877 |
| 3062 | 3906 |
| 3063 | 3978 |
| 3064 | 3812 |
| 3065 | 3917 |
| 3066 | 3927 |
| 3067 | 3994 |
| 3068 | 3951 |
| 3069 | 4010 |
| 3070 | 4031 |
| 3071 | 4056 |
| 3072 | 229 |
| 3073 | 504 |
| 3074 | 662 |
| 3075 | 1008 |
| 3076 | 763 |
| 3077 | 1050 |
| 3078 | 1158 |
| 3079 | 1459 |
| 3080 | 838 |
| 3081 | 1124 |
| 3082 | 1217 |
| 3083 | 1525 |
| 3084 | 1295 |
| 3085 | 1598 |
| 3086 | 1623 |
| 3087 | 2012 |
| 3088 | 904 |

TABLE Z2-continued

| with a sequence length of 4096: | |
|---|---|
| Polarized channel sequence number | Reliability or reliability sequence number |
| 3089 | 1191 |
| 3090 | 1246 |
| 3091 | 1583 |
| 3092 | 1362 |
| 3093 | 1661 |
| 3094 | 1763 |
| 3095 | 2042 |
| 3096 | 1421 |
| 3097 | 1754 |
| 3098 | 1710 |
| 3099 | 2092 |
| 3100 | 1861 |
| 3101 | 2146 |
| 3102 | 2183 |
| 3103 | 2485 |
| 3104 | 961 |
| 3105 | 1319 |
| 3106 | 1405 |
| 3107 | 1687 |
| 3108 | 1441 |
| 3109 | 1742 |
| 3110 | 1805 |
| 3111 | 2106 |
| 3112 | 1541 |
| 3113 | 1842 |
| 3114 | 1878 |
| 3115 | 2152 |
| 3116 | 1976 |
| 3117 | 2225 |
| 3118 | 2255 |
| 3119 | 2546 |
| 3120 | 1611 |
| 3121 | 1895 |
| 3122 | 1998 |
| 3123 | 2244 |
| 3124 | 2034 |
| 3125 | 2293 |
| 3126 | 2340 |
| 3127 | 2589 |
| 3128 | 2086 |
| 3129 | 2351 |
| 3130 | 2398 |
| 3131 | 2669 |
| 3132 | 2421 |
| 3133 | 2703 |
| 3134 | 2761 |
| 3135 | 3025 |
| 3136 | 1089 |
| 3137 | 1342 |
| 3138 | 1491 |
| 3139 | 1833 |
| 3140 | 1556 |
| 3141 | 1869 |
| 3142 | 1968 |
| 3143 | 2197 |
| 3144 | 1637 |
| 3145 | 2006 |
| 3146 | 1903 |
| 3147 | 2261 |
| 3148 | 2064 |
| 3149 | 2309 |
| 3150 | 2370 |
| 3151 | 2615 |
| 3152 | 1731 |
| 3153 | 1990 |
| 3154 | 2078 |
| 3155 | 2345 |
| 3156 | 2120 |
| 3157 | 2384 |
| 3158 | 2418 |
| 3159 | 2689 |
| 3160 | 2172 |
| 3161 | 2431 |
| 3162 | 2493 |
| 3163 | 2735 |

TABLE Z2-continued

| with a sequence length of 4096: | |
|---|---|
| Polarized channel sequence number | Reliability or reliability sequence number |
| 3164 | 2541 |
| 3165 | 2781 |
| 3166 | 2823 |
| 3167 | 3099 |
| 3168 | 1824 |
| 3169 | 2100 |
| 3170 | 2160 |
| 3171 | 2412 |
| 3172 | 2231 |
| 3173 | 2457 |
| 3174 | 2521 |
| 3175 | 2770 |
| 3176 | 2281 |
| 3177 | 2526 |
| 3178 | 2586 |
| 3179 | 2805 |
| 3180 | 2623 |
| 3181 | 2861 |
| 3182 | 2902 |
| 3183 | 3157 |
| 3184 | 2359 |
| 3185 | 2608 |
| 3186 | 2680 |
| 3187 | 2876 |
| 3188 | 2697 |
| 3189 | 2905 |
| 3190 | 2956 |
| 3191 | 3203 |
| 3192 | 2752 |
| 3193 | 2972 |
| 3194 | 3012 |
| 3195 | 3238 |
| 3196 | 3050 |
| 3197 | 3269 |
| 3198 | 3320 |
| 3199 | 3535 |
| 3200 | 1270 |
| 3201 | 1475 |
| 3202 | 1568 |
| 3203 | 1984 |
| 3204 | 1673 |
| 3205 | 2028 |
| 3206 | 2050 |
| 3207 | 2365 |
| 3208 | 1774 |
| 3209 | 2072 |
| 3210 | 2126 |
| 3211 | 2407 |
| 3212 | 2177 |
| 3213 | 2454 |
| 3214 | 2471 |
| 3215 | 2767 |
| 3216 | 1852 |
| 3217 | 2134 |
| 3218 | 2191 |
| 3219 | 2462 |
| 3220 | 2250 |
| 3221 | 2518 |
| 3222 | 2574 |
| 3223 | 2811 |
| 3224 | 2303 |
| 3225 | 2577 |
| 3226 | 2611 |
| 3227 | 2847 |
| 3228 | 2686 |
| 3229 | 2893 |
| 3230 | 2945 |
| 3231 | 3186 |
| 3232 | 1920 |
| 3233 | 2214 |
| 3234 | 2287 |
| 3235 | 2538 |
| 3236 | 2314 |
| 3237 | 2581 |
| 3238 | 2634 |

TABLE Z2-continued

| with a sequence length of 4096: | |
|---|---|
| Polarized channel sequence number | Reliability or reliability sequence number |
| 3239 | 2879 |
| 3240 | 2404 |
| 3241 | 2672 |
| 3242 | 2700 |
| 3243 | 2911 |
| 3244 | 2749 |
| 3245 | 2969 |
| 3246 | 2998 |
| 3247 | 3236 |
| 3248 | 2468 |
| 3249 | 2726 |
| 3250 | 2775 |
| 3251 | 2983 |
| 3252 | 2808 |
| 3253 | 3040 |
| 3254 | 3055 |
| 3255 | 3264 |
| 3256 | 2864 |
| 3257 | 3077 |
| 3258 | 3129 |
| 3259 | 3307 |
| 3260 | 3167 |
| 3261 | 3344 |
| 3262 | 3415 |
| 3263 | 3537 |
| 3264 | 1952 |
| 3265 | 2298 |
| 3266 | 2379 |
| 3267 | 2643 |
| 3268 | 2449 |
| 3269 | 2692 |
| 3270 | 2746 |
| 3271 | 2977 |
| 3272 | 2488 |
| 3273 | 2755 |
| 3274 | 2787 |
| 3275 | 3022 |
| 3276 | 2826 |
| 3277 | 3052 |
| 3278 | 3097 |
| 3279 | 3295 |
| 3280 | 2566 |
| 3281 | 2814 |
| 3282 | 2850 |
| 3283 | 3073 |
| 3284 | 2908 |
| 3285 | 3120 |
| 3286 | 3161 |
| 3287 | 3355 |
| 3288 | 2934 |
| 3289 | 3171 |
| 3290 | 3210 |
| 3291 | 3385 |
| 3292 | 3249 |
| 3293 | 3428 |
| 3294 | 3452 |
| 3295 | 3627 |
| 3296 | 2629 |
| 3297 | 2882 |
| 3298 | 2919 |
| 3299 | 3136 |
| 3300 | 2986 |
| 3301 | 3184 |
| 3302 | 3216 |
| 3303 | 3407 |
| 3304 | 3048 |
| 3305 | 3229 |
| 3306 | 3267 |
| 3307 | 3442 |
| 3308 | 3309 |
| 3309 | 3458 |
| 3310 | 3512 |
| 3311 | 3671 |
| 3312 | 3095 |
| 3313 | 3281 |

TABLE Z2-continued

| with a sequence length of 4096: | |
|---|---|
| Polarized channel sequence number | Reliability or reliability sequence number |
| 3314 | 3322 |
| 3315 | 3487 |
| 3316 | 3340 |
| 3317 | 3527 |
| 3318 | 3550 |
| 3319 | 3705 |
| 3320 | 3412 |
| 3321 | 3561 |
| 3322 | 3585 |
| 3323 | 3698 |
| 3324 | 3609 |
| 3325 | 3731 |
| 3326 | 3771 |
| 3327 | 3880 |
| 3328 | 1385 |
| 3329 | 1649 |
| 3330 | 1699 |
| 3331 | 2114 |
| 3332 | 1785 |
| 3333 | 2140 |
| 3334 | 2202 |
| 3335 | 2513 |
| 3336 | 1794 |
| 3337 | 2208 |
| 3338 | 2267 |
| 3339 | 2550 |
| 3340 | 2325 |
| 3341 | 2618 |
| 3342 | 2648 |
| 3343 | 2939 |
| 3344 | 1911 |
| 3345 | 2272 |
| 3346 | 2329 |
| 3347 | 2658 |
| 3348 | 2390 |
| 3349 | 2683 |
| 3350 | 2720 |
| 3351 | 2942 |
| 3352 | 2426 |
| 3353 | 2717 |
| 3354 | 2764 |
| 3355 | 3010 |
| 3356 | 2817 |
| 3357 | 3046 |
| 3358 | 3063 |
| 3359 | 3263 |
| 3360 | 1936 |
| 3361 | 2375 |
| 3362 | 2435 |
| 3363 | 2666 |
| 3364 | 2501 |
| 3365 | 2729 |
| 3366 | 2778 |
| 3367 | 3043 |
| 3368 | 2533 |
| 3369 | 2799 |
| 3370 | 2829 |
| 3371 | 3067 |
| 3372 | 2858 |
| 3373 | 3116 |
| 3374 | 3145 |
| 3375 | 3336 |
| 3376 | 2530 |
| 3377 | 2852 |
| 3378 | 2887 |
| 3379 | 3113 |
| 3380 | 2931 |
| 3381 | 3164 |
| 3382 | 3190 |
| 3383 | 3386 |
| 3384 | 2991 |
| 3385 | 3220 |
| 3386 | 3250 |
| 3387 | 3426 |
| 3388 | 3279 |

TABLE Z2-continued with a sequence length of 4096:

| Polarized channel sequence number | Reliability or reliability sequence number |
|---|---|
| 3389 | 3451 |
| 3390 | 3492 |
| 3391 | 3659 |
| 3392 | 2020 |
| 3393 | 2479 |
| 3394 | 2505 |
| 3395 | 2793 |
| 3396 | 2561 |
| 3397 | 2841 |
| 3398 | 2885 |
| 3399 | 3101 |
| 3400 | 2592 |
| 3401 | 2899 |
| 3402 | 2916 |
| 3403 | 3160 |
| 3404 | 2959 |
| 3405 | 3202 |
| 3406 | 3227 |
| 3407 | 3423 |
| 3408 | 2758 |
| 3409 | 2948 |
| 3410 | 2989 |
| 3411 | 3209 |
| 3412 | 3028 |
| 3413 | 3244 |
| 3414 | 3277 |
| 3415 | 3446 |
| 3416 | 3082 |
| 3417 | 3287 |
| 3418 | 3329 |
| 3419 | 3483 |
| 3420 | 3361 |
| 3421 | 3526 |
| 3422 | 3553 |
| 3423 | 3692 |
| 3424 | 2838 |
| 3425 | 3017 |
| 3426 | 3070 |
| 3427 | 3260 |
| 3428 | 3111 |
| 3429 | 3305 |
| 3430 | 3333 |
| 3431 | 3513 |
| 3432 | 3153 |
| 3433 | 3349 |
| 3434 | 3372 |
| 3435 | 3534 |
| 3436 | 3417 |
| 3437 | 3572 |
| 3438 | 3594 |
| 3439 | 3722 |
| 3440 | 3213 |
| 3441 | 3414 |
| 3442 | 3430 |
| 3443 | 3586 |
| 3444 | 3447 |
| 3445 | 3610 |
| 3446 | 3578 |
| 3447 | 3741 |
| 3448 | 3500 |
| 3449 | 3655 |
| 3450 | 3672 |
| 3451 | 3778 |
| 3452 | 3679 |
| 3453 | 3817 |
| 3454 | 3836 |
| 3455 | 3900 |
| 3456 | 2058 |
| 3457 | 2555 |
| 3458 | 2569 |
| 3459 | 2928 |
| 3460 | 2732 |
| 3461 | 2966 |
| 3462 | 2996 |
| 3463 | 3219 |

TABLE Z2-continued with a sequence length of 4096:

| Polarized channel sequence number | Reliability or reliability sequence number |
|---|---|
| 3464 | 2796 |
| 3465 | 3007 |
| 3466 | 3030 |
| 3467 | 3254 |
| 3468 | 3080 |
| 3469 | 3291 |
| 3470 | 3326 |
| 3471 | 3517 |
| 3472 | 2832 |
| 3473 | 3076 |
| 3474 | 3109 |
| 3475 | 3293 |
| 3476 | 3135 |
| 3477 | 3334 |
| 3478 | 3365 |
| 3479 | 3540 |
| 3480 | 3173 |
| 3481 | 3376 |
| 3482 | 3404 |
| 3483 | 3566 |
| 3484 | 3443 |
| 3485 | 3590 |
| 3486 | 3625 |
| 3487 | 3746 |
| 3488 | 2936 |
| 3489 | 3119 |
| 3490 | 3144 |
| 3491 | 3362 |
| 3492 | 3189 |
| 3493 | 3396 |
| 3494 | 3434 |
| 3495 | 3580 |
| 3496 | 3253 |
| 3497 | 3435 |
| 3498 | 3454 |
| 3499 | 3623 |
| 3500 | 3501 |
| 3501 | 3606 |
| 3502 | 3665 |
| 3503 | 3780 |
| 3504 | 3302 |
| 3505 | 3476 |
| 3506 | 3522 |
| 3507 | 3656 |
| 3508 | 3543 |
| 3509 | 3678 |
| 3510 | 3695 |
| 3511 | 3806 |
| 3512 | 3573 |
| 3513 | 3701 |
| 3514 | 3700 |
| 3515 | 3831 |
| 3516 | 3742 |
| 3517 | 3845 |
| 3518 | 3859 |
| 3519 | 3936 |
| 3520 | 3015 |
| 3521 | 3168 |
| 3522 | 3223 |
| 3523 | 3436 |
| 3524 | 3290 |
| 3525 | 3455 |
| 3526 | 3489 |
| 3527 | 3635 |
| 3528 | 3330 |
| 3529 | 3514 |
| 3530 | 3530 |
| 3531 | 3673 |
| 3532 | 3559 |
| 3533 | 3682 |
| 3534 | 3699 |
| 3535 | 3814 |
| 3536 | 3366 |
| 3537 | 3547 |
| 3538 | 3581 |

TABLE Z2-continued with a sequence length of 4096:

| Polarized channel sequence number | Reliability or reliability sequence number |
|---|---|
| 3539 | 3693 |
| 3540 | 3595 |
| 3541 | 3704 |
| 3542 | 3743 |
| 3543 | 3846 |
| 3544 | 3634 |
| 3545 | 3752 |
| 3546 | 3766 |
| 3547 | 3863 |
| 3548 | 3793 |
| 3549 | 3885 |
| 3550 | 3898 |
| 3551 | 3969 |
| 3552 | 3424 |
| 3553 | 3587 |
| 3554 | 3619 |
| 3555 | 3745 |
| 3556 | 3664 |
| 3557 | 3747 |
| 3558 | 3787 |
| 3559 | 3870 |
| 3560 | 3670 |
| 3561 | 3783 |
| 3562 | 3808 |
| 3563 | 3892 |
| 3564 | 3825 |
| 3565 | 3908 |
| 3566 | 3928 |
| 3567 | 3989 |
| 3568 | 3683 |
| 3569 | 3818 |
| 3570 | 3841 |
| 3571 | 3915 |
| 3572 | 3854 |
| 3573 | 3932 |
| 3574 | 3922 |
| 3575 | 3997 |
| 3576 | 3878 |
| 3577 | 3945 |
| 3578 | 3955 |
| 3579 | 4014 |
| 3580 | 3973 |
| 3581 | 4023 |
| 3582 | 4033 |
| 3583 | 4055 |
| 3584 | 1510 |
| 3585 | 1719 |
| 3586 | 1813 |
| 3587 | 2166 |
| 3588 | 1886 |
| 3589 | 2278 |
| 3590 | 2334 |
| 3591 | 2637 |
| 3592 | 1928 |
| 3593 | 2356 |
| 3594 | 2393 |
| 3595 | 2655 |
| 3596 | 2445 |
| 3597 | 2709 |
| 3598 | 2723 |
| 3599 | 3033 |
| 3600 | 1944 |
| 3601 | 2440 |
| 3602 | 2476 |
| 3603 | 2706 |
| 3604 | 2510 |
| 3605 | 2844 |
| 3606 | 2867 |
| 3607 | 3092 |
| 3608 | 2597 |
| 3609 | 2873 |
| 3610 | 2925 |
| 3611 | 3155 |
| 3612 | 2963 |
| 3613 | 3193 |

TABLE Z2-continued with a sequence length of 4096:

| Polarized channel sequence number | Reliability or reliability sequence number |
|---|---|
| 3614 | 3226 |
| 3615 | 3440 |
| 3616 | 1960 |
| 3617 | 2496 |
| 3618 | 2558 |
| 3619 | 2855 |
| 3620 | 2603 |
| 3621 | 2922 |
| 3622 | 2951 |
| 3623 | 3180 |
| 3624 | 2640 |
| 3625 | 2975 |
| 3626 | 3001 |
| 3627 | 3232 |
| 3628 | 3037 |
| 3629 | 3271 |
| 3630 | 3299 |
| 3631 | 3459 |
| 3632 | 2677 |
| 3633 | 3019 |
| 3634 | 3061 |
| 3635 | 3285 |
| 3636 | 3104 |
| 3637 | 3325 |
| 3638 | 3345 |
| 3639 | 3506 |
| 3640 | 3123 |
| 3641 | 3338 |
| 3642 | 3377 |
| 3643 | 3545 |
| 3644 | 3382 |
| 3645 | 3564 |
| 3646 | 3589 |
| 3647 | 3773 |
| 3648 | 2220 |
| 3649 | 2600 |
| 3650 | 2626 |
| 3651 | 2961 |
| 3652 | 2662 |
| 3653 | 3004 |
| 3654 | 3035 |
| 3655 | 3259 |
| 3656 | 2740 |
| 3657 | 3065 |
| 3658 | 3085 |
| 3659 | 3315 |
| 3660 | 3128 |
| 3661 | 3353 |
| 3662 | 3374 |
| 3663 | 3519 |
| 3664 | 2790 |
| 3665 | 3089 |
| 3666 | 3141 |
| 3667 | 3341 |
| 3668 | 3177 |
| 3669 | 3381 |
| 3670 | 3390 |
| 3671 | 3554 |
| 3672 | 3206 |
| 3673 | 3392 |
| 3674 | 3403 |
| 3675 | 3592 |
| 3676 | 3475 |
| 3677 | 3611 |
| 3678 | 3649 |
| 3679 | 3782 |
| 3680 | 2835 |
| 3681 | 3176 |
| 3682 | 3197 |
| 3683 | 3401 |
| 3684 | 3242 |
| 3685 | 3431 |
| 3686 | 3439 |
| 3687 | 3601 |
| 3688 | 3274 |

TABLE Z2-continued with a sequence length of 4096:

| Polarized channel sequence number | Reliability or reliability sequence number |
|---|---|
| 3689 | 3472 |
| 3690 | 3495 |
| 3691 | 3633 |
| 3692 | 3532 |
| 3693 | 3661 |
| 3694 | 3675 |
| 3695 | 3809 |
| 3696 | 3312 |
| 3697 | 3509 |
| 3698 | 3544 |
| 3699 | 3677 |
| 3700 | 3575 |
| 3701 | 3691 |
| 3702 | 3724 |
| 3703 | 3826 |
| 3704 | 3618 |
| 3705 | 3728 |
| 3706 | 3753 |
| 3707 | 3847 |
| 3708 | 3767 |
| 3709 | 3867 |
| 3710 | 3888 |
| 3711 | 3966 |
| 3712 | 2239 |
| 3713 | 2651 |
| 3714 | 2712 |
| 3715 | 3058 |
| 3716 | 2784 |
| 3717 | 3088 |
| 3718 | 3132 |
| 3719 | 3359 |
| 3720 | 2820 |
| 3721 | 3148 |
| 3722 | 3182 |
| 3723 | 3393 |
| 3724 | 3215 |
| 3725 | 3411 |
| 3726 | 3419 |
| 3727 | 3596 |
| 3728 | 2896 |
| 3729 | 3199 |
| 3730 | 3240 |
| 3731 | 3420 |
| 3732 | 3273 |
| 3733 | 3468 |
| 3734 | 3488 |
| 3735 | 3629 |
| 3736 | 3311 |
| 3737 | 3503 |
| 3738 | 3531 |
| 3739 | 3667 |
| 3740 | 3557 |
| 3741 | 3684 |
| 3742 | 3711 |
| 3743 | 3810 |
| 3744 | 2953 |
| 3745 | 3256 |
| 3746 | 3297 |
| 3747 | 3493 |
| 3748 | 3348 |
| 3749 | 3525 |
| 3750 | 3521 |
| 3751 | 3687 |
| 3752 | 3369 |
| 3753 | 3548 |
| 3754 | 3562 |
| 3755 | 3706 |
| 3756 | 3603 |
| 3757 | 3725 |
| 3758 | 3736 |
| 3759 | 3849 |
| 3760 | 3408 |
| 3761 | 3577 |
| 3762 | 3615 |
| 3763 | 3733 |
| 3764 | 3630 |
| 3765 | 3759 |
| 3766 | 3768 |
| 3767 | 3871 |
| 3768 | 3654 |
| 3769 | 3779 |
| 3770 | 3798 |
| 3771 | 3893 |
| 3772 | 3830 |
| 3773 | 3910 |
| 3774 | 3930 |
| 3775 | 3991 |
| 3776 | 2994 |
| 3777 | 3319 |
| 3778 | 3351 |
| 3779 | 3552 |
| 3780 | 3388 |
| 3781 | 3571 |
| 3782 | 3604 |
| 3783 | 3729 |
| 3784 | 3464 |
| 3785 | 3616 |
| 3786 | 3640 |
| 3787 | 3764 |
| 3788 | 3645 |
| 3789 | 3772 |
| 3790 | 3789 |
| 3791 | 3884 |
| 3792 | 3478 |
| 3793 | 3641 |
| 3794 | 3651 |
| 3795 | 3786 |
| 3796 | 3688 |
| 3797 | 3796 |
| 3798 | 3822 |
| 3799 | 3907 |
| 3800 | 3717 |
| 3801 | 3829 |
| 3802 | 3839 |
| 3803 | 3916 |
| 3804 | 3858 |
| 3805 | 3937 |
| 3806 | 3949 |
| 3807 | 4000 |
| 3808 | 3505 |
| 3809 | 3697 |
| 3810 | 3709 |
| 3811 | 3811 |
| 3812 | 3738 |
| 3813 | 3832 |
| 3814 | 3844 |
| 3815 | 3924 |
| 3816 | 3754 |
| 3817 | 3856 |
| 3818 | 3872 |
| 3819 | 3944 |
| 3820 | 3889 |
| 3821 | 3956 |
| 3822 | 3971 |
| 3823 | 4018 |
| 3824 | 3800 |
| 3825 | 3874 |
| 3826 | 3894 |
| 3827 | 3959 |
| 3828 | 3913 |
| 3829 | 3975 |
| 3830 | 3981 |
| 3831 | 4030 |
| 3832 | 3925 |
| 3833 | 3986 |
| 3834 | 3996 |
| 3835 | 4036 |
| 3836 | 4007 |
| 3837 | 4044 |
| 3838 | 4054 |

TABLE Z2-continued with a sequence length of 4096:

| Polarized channel sequence number | Reliability or reliability sequence number |
|---|---|
| 3839 | 4075 |
| 3840 | 2320 |
| 3841 | 2743 |
| 3842 | 2802 |
| 3843 | 3151 |
| 3844 | 2890 |
| 3845 | 3196 |
| 3846 | 3233 |
| 3847 | 3449 |
| 3848 | 2913 |
| 3849 | 3246 |
| 3850 | 3283 |
| 3851 | 3471 |
| 3852 | 3316 |
| 3853 | 3498 |
| 3854 | 3539 |
| 3855 | 3713 |
| 3856 | 2980 |
| 3857 | 3301 |
| 3858 | 3357 |
| 3859 | 3518 |
| 3860 | 3380 |
| 3861 | 3568 |
| 3862 | 3558 |
| 3863 | 3720 |
| 3864 | 3397 |
| 3865 | 3582 |
| 3866 | 3608 |
| 3867 | 3749 |
| 3868 | 3638 |
| 3869 | 3761 |
| 3870 | 3775 |
| 3871 | 3879 |
| 3872 | 3107 |
| 3873 | 3370 |
| 3874 | 3399 |
| 3875 | 3567 |
| 3876 | 3463 |
| 3877 | 3600 |
| 3878 | 3621 |
| 3879 | 3765 |
| 3880 | 3470 |
| 3881 | 3639 |
| 3882 | 3648 |
| 3883 | 3777 |
| 3884 | 3662 |
| 3885 | 3791 |
| 3886 | 3804 |
| 3887 | 3902 |
| 3888 | 3480 |
| 3889 | 3657 |
| 3890 | 3681 |
| 3891 | 3802 |
| 3892 | 3716 |
| 3893 | 3821 |
| 3894 | 3837 |
| 3895 | 3918 |
| 3896 | 3734 |
| 3897 | 3852 |
| 3898 | 3857 |
| 3899 | 3938 |
| 3900 | 3873 |
| 3901 | 3950 |
| 3902 | 3962 |
| 3903 | 4012 |
| 3904 | 3125 |
| 3905 | 3460 |
| 3906 | 3466 |
| 3907 | 3631 |
| 3908 | 3481 |
| 3909 | 3643 |
| 3910 | 3666 |
| 3911 | 3795 |
| 3912 | 3508 |
| 3913 | 3689 |

TABLE Z2-continued with a sequence length of 4096:

| Polarized channel sequence number | Reliability or reliability sequence number |
|---|---|
| 3914 | 3707 |
| 3915 | 3816 |
| 3916 | 3727 |
| 3917 | 3833 |
| 3918 | 3855 |
| 3919 | 3934 |
| 3920 | 3614 |
| 3921 | 3715 |
| 3922 | 3739 |
| 3923 | 3838 |
| 3924 | 3755 |
| 3925 | 3864 |
| 3926 | 3875 |
| 3927 | 3946 |
| 3928 | 3794 |
| 3929 | 3876 |
| 3930 | 3895 |
| 3931 | 3960 |
| 3932 | 3914 |
| 3933 | 3974 |
| 3934 | 3980 |
| 3935 | 4029 |
| 3936 | 3646 |
| 3937 | 3758 |
| 3938 | 3785 |
| 3939 | 3865 |
| 3940 | 3801 |
| 3941 | 3891 |
| 3942 | 3904 |
| 3943 | 3965 |
| 3944 | 3824 |
| 3945 | 3909 |
| 3946 | 3920 |
| 3947 | 3979 |
| 3948 | 3933 |
| 3949 | 3987 |
| 3950 | 3999 |
| 3951 | 4039 |
| 3952 | 3842 |
| 3953 | 3926 |
| 3954 | 3941 |
| 3955 | 3995 |
| 3956 | 3954 |
| 3957 | 4002 |
| 3958 | 4011 |
| 3959 | 4046 |
| 3960 | 3967 |
| 3961 | 4015 |
| 3962 | 4022 |
| 3963 | 4052 |
| 3964 | 4027 |
| 3965 | 4061 |
| 3966 | 4063 |
| 3967 | 4083 |
| 3968 | 3139 |
| 3969 | 3484 |
| 3970 | 3496 |
| 3971 | 3710 |
| 3972 | 3599 |
| 3973 | 3723 |
| 3974 | 3735 |
| 3975 | 3850 |
| 3976 | 3624 |
| 3977 | 3748 |
| 3978 | 3762 |
| 3979 | 3868 |
| 3980 | 3788 |
| 3981 | 3883 |
| 3982 | 3901 |
| 3983 | 3963 |
| 3984 | 3650 |
| 3985 | 3774 |
| 3986 | 3799 |
| 3987 | 3886 |
| 3988 | 3813 |

TABLE Z2-continued with a sequence length of 4096:

| Polarized channel sequence number | Reliability or reliability sequence number |
|---|---|
| 3989 | 3905 |
| 3990 | 3921 |
| 3991 | 3977 |
| 3992 | 3834 |
| 3993 | 3931 |
| 3994 | 3919 |
| 3995 | 3984 |
| 3996 | 3948 |
| 3997 | 3998 |
| 3998 | 4006 |
| 3999 | 4042 |
| 4000 | 3718 |
| 4001 | 3807 |
| 4002 | 3820 |
| 4003 | 3911 |
| 4004 | 3848 |
| 4005 | 3923 |
| 4006 | 3940 |
| 4007 | 3992 |
| 4008 | 3862 |
| 4009 | 3942 |
| 4010 | 3953 |
| 4011 | 4003 |
| 4012 | 3961 |
| 4013 | 4008 |
| 4014 | 4019 |
| 4015 | 4051 |
| 4016 | 3890 |
| 4017 | 3957 |
| 4018 | 3970 |
| 4019 | 4013 |
| 4020 | 3982 |
| 4021 | 4024 |
| 4022 | 4028 |
| 4023 | 4059 |
| 4024 | 3988 |
| 4025 | 4035 |
| 4026 | 4038 |
| 4027 | 4065 |
| 4028 | 4045 |
| 4029 | 4068 |
| 4030 | 4070 |
| 4031 | 4080 |
| 4032 | 3756 |
| 4033 | 3823 |
| 4034 | 3861 |
| 4035 | 3943 |
| 4036 | 3882 |
| 4037 | 3952 |
| 4038 | 3958 |
| 4039 | 4009 |
| 4040 | 3899 |
| 4041 | 3972 |
| 4042 | 3976 |
| 4043 | 4021 |
| 4044 | 3985 |
| 4045 | 4025 |
| 4046 | 4037 |
| 4047 | 4062 |
| 4048 | 3903 |
| 4049 | 3983 |
| 4050 | 3993 |
| 4051 | 4034 |
| 4052 | 4005 |
| 4053 | 4040 |
| 4054 | 4041 |
| 4055 | 4069 |
| 4056 | 4017 |
| 4057 | 4047 |
| 4058 | 4050 |
| 4059 | 4071 |
| 4060 | 4057 |
| 4061 | 4076 |
| 4062 | 4078 |
| 4063 | 4088 |
| 4064 | 3935 |
| 4065 | 4001 |
| 4066 | 4004 |
| 4067 | 4043 |
| 4068 | 4020 |
| 4069 | 4048 |
| 4070 | 4053 |
| 4071 | 4073 |
| 4072 | 4026 |
| 4073 | 4058 |
| 4074 | 4060 |
| 4075 | 4077 |
| 4076 | 4066 |
| 4077 | 4079 |
| 4078 | 4084 |
| 4079 | 4090 |
| 4080 | 4032 |
| 4081 | 4064 |
| 4082 | 4067 |
| 4083 | 4081 |
| 4084 | 4072 |
| 4085 | 4082 |
| 4086 | 4085 |
| 4087 | 4091 |
| 4088 | 4074 |
| 4089 | 4086 |
| 4090 | 4087 |
| 4091 | 4092 |
| 4092 | 4089 |
| 4093 | 4093 |
| 4094 | 4094 |
| 4095 | 4095 |

Sequence Z3, with a sequence length of 2048:

[0, 1, 2, 7, 3, 8, 12, 25, 4, 11, 14, 29, 17, 34, 36, 79, 5, 13, 15, 33, 20, 40, 49, 84, 23, 48, 44, 91, 59, 100, 106, 170, 6, 18, 22, 42, 24, 47, 53, 93, 30, 57, 61, 101, 74, 113, 119, 187, 35, 63, 77, 117, 82, 126, 136, 199, 90, 138, 149, 224, 155, 236, 257, 366, 9, 19, 27, 56, 31, 60, 73, 108, 37, 78, 65, 1 20, 87, 130, 143, 207, 46, 76, 89, 137, 95, 146, 154, 231, 104, 157, 173, 247, 186, 264, 280, 404, 5 5, 92, 102, 153, 115, 164, 180, 260, 124, 181, 198, 273, 210, 296, 311, 436, 141, 205, 228, 300, 23 4, 312, 334, 463, 253, 341, 360, 485, 378, 505, 540, 721, 16, 26, 32, 75, 41, 81, 85, 142, 50, 88, 96, 152, 105, 163, 167, 259, 58, 97, 107, 165, 118, 179, 195, 275, 129, 196, 206, 290, 230, 307, 329, 4 53, 67, 111, 125, 185, 131, 197, 213, 301, 150, 226, 235, 315, 252, 340, 354, 483, 166, 244, 261, 3 46, 274, 373, 381, 502, 297, 392, 420, 531, 441, 557, 613, 722, 71, 127, 145, 216, 161, 232, 251, 3 44, 171, 254, 266, 365, 281, 380, 402, 522, 193, 277, 291, 390, 313, 415, 438, 566, 324, 444, 467, 588, 491, 623, 644, 818, 212, 303, 318, 424, 348, 451, 471, 606, 377, 479, 503, 635, 532, 648, 69 7, 870, 401, 513, 542, 674, 554, 713, 735, 914, 610, 746, 771, 905, 797, 950, 1007, 1188, 21, 38, 4 3, 94, 51, 98, 109, 178, 52, 110, 121, 188, 133, 208, 218, 327, 66, 122, 134, 221, 147, 229, 242, 32 8, 156, 240, 258, 359, 278, 376, 385, 501, 69, 144, 158, 223, 175, 245, 262, 375, 184, 271, 282, 38 7, 294, 413, 429, 552, 183, 292, 305, 411, 323, 440, 455, 590, 350, 474, 493, 622, 511, 642, 679, 8 56, 80, 169, 176, 268, 191, 287, 304, 405, 201, 310, 317, 437, 335, 462, 478, 619, 255, 330, 349, 4 66, 367, 489, 510, 638, 395, 517, 546, 671, 570, 711, 738, 897, 286, 362, 389, 499, 410, 529, 549, 699, 433, 561, 578, 719, 614, 758, 781, 936, 469, 612, 625, 772, 639, 799, 764, 963, 686, 851, 87 2, 1019, 881, 1077, 1108, 1225, 86, 189, 194, 322, 246, 339, 352, 473, 270, 357, 369, 495, 394, 5 20, 545, 702, 284, 391, 409, 521, 423, 550, 573, 726, 445, 581, 604, 751, 637, 777, 816, 971, 326, 414, 428, 571, 454, 597, 628, 766, 494, 629, 645, 813, 688, 794, 863, 1023, 528, 665, 708, 852, 7 27, 879, 901, 1059, 759, 910, 908, 1100, 965, 1123, 1149, 1303, 361, 442, 475, 631, 518, 647, 67 7, 828, 547, 700, 714, 874, 745, 885, 907, 1073, 574, 732, 767, 899, 782, 912, 967, 1125, 826, 97 9, 1001, 1156, 1039, 1197, 1220, 1381, 620, 774, 809, 969, 861, 973, 1031, 1167, 868, 1025, 10 63, 1211, 1092, 1242, 1285, 1439, 886, 1079, 1117, 1257, 1138, 1292, 1272, 1458, 1183, 1324, 1346, 1513, 1392, 1543, 1579, 1673, 28, 45, 54, 103, 62, 123, 135, 214, 68, 139, 148, 220, 160, 2 38, 243, 370, 70, 159, 168, 237, 177, 288, 298, 400, 202, 299, 321, 434, 338, 457, 477, 634, 72, 17 4, 190, 293, 204, 319, 332, 449, 215, 343, 355, 481, 372, 506, 525, 650, 227, 364, 383, 516, 406, 5 43, 559, 693, 416, 553, 583, 730, 587, 750, 776, 1011, 112, 203, 211, 336, 222, 356, 371, 498, 24 9, 386, 396, 536, 419, 564, 580, 705, 267, 399, 427, 556, 447, 585, 593, 740, 465, 594, 603, 779, 6 64, 801, 844, 1024, 285, 446, 459, 601, 487, 626, 632, 789, 509, 662, 682, 825, 718, 858, 876, 10 65, 535, 696, 729, 877, 761, 895, 940, 1094, 808, 946, 981, 1128, 1003, 1163, 1201, 1375, 116, 2 19, 239, 382, 265, 397, 422, 568, 279, 431, 450, 596, 470, 609, 616, 784, 309, 461, 486, 617, 507, 657, 676, 819, 533, 690, 716, 867, 742, 888, 923, 1067, 333, 497, 524, 680, 560, 710, 707, 890, 5 75, 734, 748, 916, 791, 942, 958, 1132, 607, 763, 804, 952, 821, 991, 1005, 1169, 849, 1021, 104 7, 1213, 1098, 1247, 1287, 1442, 351, 539, 563, 737, 591, 756, 792, 948, 654, 806, 833, 997, 838, 1009, 1035, 1194, 667, 835, 847, 1029, 892, 1045, 1085, 1240, 931, 1096, 1115, 1259, 1147, 13 06, 1332, 1468, 691, 903, 920, 1069, 959, 1102, 1121, 1277, 983, 1143, 1172, 1322, 1204, 1349, 1386, 1524, 1051, 1176, 1216, 1358, 1252, 1398, 1414, 1571, 1280, 1429, 1455, 1591, 1492, 1 626, 1668, 1784, 132, 250, 272, 432, 306, 458, 482, 641, 316, 490, 514, 660, 538, 685, 724, 925, 345, 527, 567, 703, 584, 754, 743, 935, 598, 769, 796, 977, 830, 993, 1015, 1185, 408, 577, 600, 753, 653, 787, 811, 999, 659, 831, 842, 1017, 860, 1037, 1057, 1230, 668, 854, 883, 1055, 929, 1 083, 1110, 1262, 954, 1136, 1145, 1308, 1174, 1335, 1366, 1506, 418, 651, 656, 823, 670, 837, 8 65, 1043, 694, 894, 918, 1075, 944, 1104, 1141, 1298, 802, 927, 961, 1113, 985, 1158, 1178, 132 7, 1041, 1181, 1218, 1360, 1254, 1395, 1411, 1567, 840, 989, 1027, 1160, 1053, 1208, 1235, 13 72, 1090, 1244, 1267, 1408, 1295, 1432, 1465, 1604, 1119, 1282, 1314, 1452, 1344, 1475, 150 3, 1635, 1378, 1517, 1539, 1659, 1559, 1700, 1710, 1847, 425, 673, 683, 921, 786, 938, 956, 11 34, 814, 975, 995, 1165, 1033, 1192, 1227, 1369, 845, 1013, 1049, 1199, 1071, 1237, 1269, 140 4, 1106, 1290, 1264, 1423, 1330, 1461, 1489, 1617, 933, 1061, 1081, 1249, 1130, 1274, 1311, 1 445, 1154, 1316, 1341, 1478, 1363, 1496, 1528, 1654, 1206, 1352, 1384, 1510, 1417, 1547, 15 63, 1689, 1436, 1587, 1600, 1722, 1630, 1739, 1752, 1822, 987, 1088, 1152, 1319, 1190, 1338, 1355, 1499, 1223, 1389, 1401, 1536, 1426, 1551, 1595, 1705, 1232, 1420, 1448, 1583, 1485, 1 608, 1612, 1745, 1521, 1640, 1649, 1758, 1679, 1792, 1806, 1896, 1300, 1472, 1482, 1621, 15 32, 1644, 1664, 1771, 1555, 1684, 1694, 1799, 1728, 1814, 1856, 1920, 1575, 1716, 1733, 183 0, 1764, 1838, 1865, 1933, 1778, 1875, 1885, 1948, 1907, 1964, 1984, 2008, 10, 39, 64, 140, 83, 151, 182, 283, 99, 172, 200, 308, 225, 337, 347, 526, 114, 192, 209, 331, 248, 363, 407, 541, 269, 403, 384, 565, 452, 592, 611, 778, 128, 233, 263, 374, 276, 398, 426, 572, 314, 443, 460, 595, 50 8, 633, 649, 815, 342, 468, 519, 643, 537, 669, 695, 841, 562, 701, 728, 891, 741, 913, 951, 1133, 162, 241, 295, 439, 320, 456, 504, 618, 353, 523, 472, 652, 551, 678, 712, 857, 393, 515, 558, 69 8, 579, 720, 739, 904, 605, 747, 783, 934, 812, 964, 992, 1187, 435, 569, 599, 736, 636, 762, 800, 957, 663, 803, 839, 980, 862, 1018, 1046, 1231, 706, 853, 898, 1028, 909, 1048, 1084, 1266, 94 5, 1095, 1124, 1293, 1151, 1317, 1357, 1534, 217, 289, 325, 512, 368, 534, 544, 709, 412, 555, 5 82, 733, 608, 760, 770, 955, 448, 586, 615, 765, 646, 798, 832, 984, 675, 834, 855, 1008, 902, 10 40, 1076, 1253, 480, 627, 666, 810, 681, 836, 869, 1030, 731, 893, 911, 1052, 943, 1093, 1114, 1 291, 768, 928, 960, 1103, 982, 1144, 1155, 1313, 1020, 1171, 1210, 1347, 1238, 1376, 1434, 15 35, 496, 672, 717, 875, 757, 906, 941, 1099, 780, 947, 968, 1131, 994, 1153, 1186, 1337, 827, 98 6, 1010, 1168, 1050, 1203, 1234, 1385, 1068, 1241, 1271, 1409, 1301, 1444, 1464, 1613, 866, 1 032, 1058, 1215, 1105, 1251, 1276, 1427, 1150, 1286, 1315, 1456, 1348, 1469, 1514, 1651, 11 84, 1326, 1359, 1493, 1373, 1527, 1546, 1681, 1431, 1556, 1576, 1675, 1597, 1704, 1740, 184 1, 256, 358, 379, 576, 417, 589, 621, 795, 421, 624, 655, 817, 687, 859, 878, 1072, 476, 658, 689, 884, 723, 900, 924, 1074, 744, 922, 953, 1122, 988, 1148, 1161, 1312, 488, 715, 749, 889, 788, 9 30, 962, 1146, 807, 976, 996, 1164, 1016, 1200, 1222, 1370, 805, 1012, 1036, 1198, 1066, 1236, 1256, 1410, 1109, 1279, 1302, 1443, 1325, 1463, 1497, 1641, 530, 775, 790, 972, 824, 1004, 1 034, 1189, 843, 1044, 1056, 1233, 1086, 1265, 1284, 1440, 949, 1078, 1107, 1270, 1135, 1297, 1323, 1459, 1175, 1331, 1364, 1490, 1390, 1526, 1549, 1670, 1002, 1127, 1166, 1310, 1196, 13 45, 1367, 1515, 1228, 1380, 1399, 1533, 1435, 1565, 1584, 1696, 1273, 1433, 1446, 1577, 146 0, 1598, 1570, 1713, 1504, 1637, 1652, 1747, 1658, 1782, 1800, 1859, 548, 820, 829, 1064, 932, 1091, 1112, 1278, 974, 1120, 1137, 1305, 1173, 1334, 1362, 1518, 998, 1170, 1195, 1336, 121 4, 1368, 1393, 1538, 1243, 1402, 1425, 1560, 1457, 1581, 1611, 1718, 1070, 1202, 1221, 1391, 1255, 1418, 1449, 1572, 1304, 1450, 1466, 1609, 1505, 1594, 1646, 1749, 1343, 1484, 1523, 1 638, 1540, 1657, 1672, 1772, 1566, 1678, 1677, 1795, 1714, 1808, 1821, 1893, 1126, 1239, 12 81, 1451, 1333, 1467, 1495, 1620, 1365, 1516, 1529, 1653, 15661, 1676, 1780, 1394, 154 4, 1573, 1671, 1585, 1680, 1715, 1809, 1619, 1723, 1736, 1825, 1760, 1845, 1857, 1924, 1441, 1578, 1606, 1717, 1645, 1719, 1755, 1831, 1650, 1751, 1774, 1852, 1790, 1867, 1886, 1944, 1 662, 1783, 1804, 1873, 1816, 1889, 1880, 1951, 1839, 1902, 1911, 1968, 1928, 1976, 1986, 20 07, 302, 388, 430, 602, 464, 661, 692, 871, 484, 704, 725, 882, 755, 917, 926, 1139, 492, 752, 77 3, 915, 793, 1006, 1022, 1182, 846, 1026, 1062, 1229, 1089, 1258, 1283, 1454, 500, 785, 822, 1 014, 850, 1060, 1080, 1248, 873, 1097, 1116, 1288, 1142, 1318, 1340, 1470, 896, 1129, 1159, 1 329, 1191, 1361, 1377, 1509, 1205, 1371, 1403, 1542, 1407, 1558, 1580, 1742, 630, 848, 864, 1 087, 887, 1118, 1140, 1309, 937, 1162, 1177, 1353, 1209, 1383, 1400, 1520, 970, 1180, 1219, 1 374, 1246, 1406, 1413, 1550, 1268, 1415, 1424, 1582, 1483, 1599, 1632, 1750, 1000, 1245, 12 61, 1422, 1296, 1447, 1453, 1590, 1321, 1481, 1500, 1618, 1531, 1642, 1655, 1775, 1351, 151 2, 1541, 1656, 1568, 1669, 1698, 1791, 1605, 1702, 1724, 1810, 1737, 1828, 1848, 1922, 640, 8 80, 919, 1157, 966, 1179, 1212, 1388, 990, 1224, 1250, 1416, 1275, 1430, 1437, 1586, 1042, 12 63, 1294, 1438, 1320, 1477, 1494, 1614, 1350, 1507, 1530, 1648, 1552, 1663, 1687, 1776, 108 2, 1307, 1339, 1498, 1379, 1525, 1522, 1665, 1396, 1545, 1557, 1682, 1592, 1699, 1709, 1812, 1428, 1569, 1602, 1706, 1615, 1730, 1738, 1832, 1636, 1748, 1765, 1853, 1794, 1869, 1887, 1 945, 1111, 1356, 1382, 1548, 1412, 1564, 1593, 1703, 1474, 1603, 1624, 1734, 1628, 1741, 17 57, 1844, 1486, 1625, 1634, 1754, 1666, 1763, 1787, 1866, 1692, 1793, 1803, 1874, 1820, 189 4, 1905, 1954, 1508, 1674, 1685, 1777, 1711, 1796, 1807, 1882, 1725, 1818, 188, 1833, 1901, 1849, 1912, 1926, 1971, 1767, 1835, 1854, 1915, 1871, 1930, 1936, 1983, 1883, 1941, 1950, 1989, 1 961, 1997, 2006, 2027, 684, 939, 978, 1226, 1038, 1260, 1289, 1462, 1054, 1299, 1328, 1480, 1 354, 1502, 1537, 1688, 1101, 1342, 1387, 1519, 1405, 1562, 1553, 1695, 1419, 1574, 1596, 17 21, 1622, 1731, 1744, 1840, 1193, 1397, 1421, 1561, 1473, 1589, 1607, 1735, 1479, 1623, 163 1, 1746, 1643, 1759, 1770, 1861, 1487, 1639, 1660, 1769, 1691, 1786, 1801, 1876, 1707, 1815, 1819, 1895, 1834, 1906, 1918, 1966, 1207, 1471, 1476, 1616, 1488, 1627, 1647, 1762, 1511, 1 667, 1683, 1781, 1701, 1797, 1817, 1891, 1601, 1690, 1712, 1802, 1726, 1826, 1836, 1903, 17 61, 1837, 1855, 1916, 1872, 1929, 1935, 1982, 1629, 1729, 1753, 1827, 1768, 1851, 1863, 192 1, 1789, 1868, 1878, 1934, 1890, 1942, 1953, 1992, 1805, 1884, 1898, 1949, 1910, 1956, 1965, 1999, 1923, 1969, 1975, 2004, 1980, 2013, 2015, 2035, 1217, 1491, 1501, 1686, 1588, 1697, 1 708, 1813, 1610, 1720, 1732, 1829, 1756, 1843, 1860, 1919, 1633, 1743, 1766, 1846, 1779, 18 64, 1879, 1932, 1798, 1888, 1877, 1939, 1904, 1952, 1960, 1995, 1693, 1773, 1785, 1870, 181 1, 1881, 1897, 1946, 1824, 1899, 1909, 1957, 1917, 1962, 1972, 2003, 1850, 1913, 1925, 1967, 1937, 1977, 1981, 2011, 1943, 1988, 1991, 2017, 1998, 2020, 2022, 2032, 1727, 1788, 1823, 1 900, 1842, 1908, 1914, 1963, 1858, 1927, 1931, 1974, 1940, 1978, 1990, 2014, 1862, 1938, 19 47, 1987, 1959, 1993, 1994, 2021, 1970, 2000, 2002, 2023, 2009, 2028, 2030, 2040, 1892, 195 5, 1958, 1996, 1973, 2001, 2005, 2025, 1979, 2010, 2012, 2029, 2018, 2031, 2036, 2042, 1985, 2016, 2019, 2033, 2024, 2034, 2037, 2043, 2026, 2038, 2039, 2044, 2041, 2045, 2046, 2047];

TABLE Z3 with a sequence length of 2048:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 8 |
| 6 | 12 |
| 7 | 25 |
| 8 | 4 |
| 9 | 11 |
| 10 | 14 |
| 11 | 29 |
| 12 | 17 |
| 13 | 34 |
| 14 | 36 |
| 15 | 79 |
| 16 | 5 |
| 17 | 13 |
| 18 | 15 |
| 19 | 33 |
| 20 | 20 |
| 21 | 40 |
| 22 | 49 |
| 23 | 84 |
| 24 | 23 |
| 25 | 48 |
| 26 | 44 |
| 27 | 91 |
| 28 | 59 |
| 29 | 100 |
| 30 | 106 |
| 31 | 170 |
| 32 | 6 |
| 33 | 18 |
| 34 | 22 |
| 35 | 42 |
| 36 | 24 |
| 37 | 47 |
| 38 | 53 |
| 39 | 93 |
| 40 | 30 |
| 41 | 57 |
| 42 | 61 |
| 43 | 101 |
| 44 | 74 |
| 45 | 113 |
| 46 | 119 |
| 47 | 187 |
| 48 | 35 |
| 49 | 63 |
| 50 | 77 |
| 51 | 117 |
| 52 | 82 |
| 53 | 126 |
| 54 | 136 |
| 55 | 199 |
| 56 | 90 |
| 57 | 138 |
| 58 | 149 |
| 59 | 224 |
| 60 | 155 |
| 61 | 236 |
| 62 | 257 |
| 63 | 366 |
| 64 | 9 |
| 65 | 19 |
| 66 | 27 |
| 67 | 56 |
| 68 | 31 |
| 69 | 60 |
| 70 | 73 |
| 71 | 108 |
| 72 | 37 |
| 73 | 78 |
| 74 | 65 |
| 75 | 120 |
| 76 | 87 |
| 77 | 130 |
| 78 | 143 |
| 79 | 207 |
| 80 | 46 |
| 81 | 76 |
| 82 | 89 |
| 83 | 137 |
| 84 | 95 |
| 85 | 146 |
| 86 | 154 |
| 87 | 231 |
| 88 | 104 |
| 89 | 157 |
| 90 | 173 |
| 91 | 247 |
| 92 | 186 |
| 93 | 264 |

TABLE Z3-continued

| with a sequence length of 2048: | |
|---|---|
| Polarized channel sequence number | Reliability or reliability sequence number |
| 94 | 280 |
| 95 | 404 |
| 96 | 55 |
| 97 | 92 |
| 98 | 102 |
| 99 | 153 |
| 100 | 115 |
| 101 | 164 |
| 102 | 180 |
| 103 | 260 |
| 104 | 124 |
| 105 | 181 |
| 106 | 198 |
| 107 | 273 |
| 108 | 210 |
| 109 | 296 |
| 110 | 311 |
| 111 | 436 |
| 112 | 141 |
| 113 | 205 |
| 114 | 228 |
| 115 | 300 |
| 116 | 234 |
| 117 | 312 |
| 118 | 334 |
| 119 | 463 |
| 120 | 253 |
| 121 | 341 |
| 122 | 360 |
| 123 | 485 |
| 124 | 378 |
| 125 | 505 |
| 126 | 540 |
| 127 | 721 |
| 128 | 16 |
| 129 | 26 |
| 130 | 32 |
| 131 | 75 |
| 132 | 41 |
| 133 | 81 |
| 134 | 85 |
| 135 | 142 |
| 136 | 50 |
| 137 | 88 |
| 138 | 96 |
| 139 | 152 |
| 140 | 105 |
| 141 | 163 |
| 142 | 167 |
| 143 | 259 |
| 144 | 58 |
| 145 | 97 |
| 146 | 107 |
| 147 | 165 |
| 148 | 118 |
| 149 | 179 |
| 150 | 195 |
| 151 | 275 |
| 152 | 129 |
| 153 | 196 |
| 154 | 206 |
| 155 | 290 |
| 156 | 230 |
| 157 | 307 |
| 158 | 329 |
| 159 | 453 |
| 160 | 67 |
| 161 | 111 |
| 162 | 125 |
| 163 | 185 |
| 164 | 131 |
| 165 | 197 |
| 166 | 213 |
| 167 | 301 |
| 168 | 150 |

TABLE Z3-continued

| with a sequence length of 2048: | |
|---|---|
| Polarized channel sequence number | Reliability or reliability sequence number |
| 169 | 226 |
| 170 | 235 |
| 171 | 315 |
| 172 | 252 |
| 173 | 340 |
| 174 | 354 |
| 175 | 483 |
| 176 | 166 |
| 177 | 244 |
| 178 | 261 |
| 179 | 346 |
| 180 | 274 |
| 181 | 373 |
| 182 | 381 |
| 183 | 502 |
| 184 | 297 |
| 185 | 392 |
| 186 | 420 |
| 187 | 531 |
| 188 | 441 |
| 189 | 557 |
| 190 | 613 |
| 191 | 722 |
| 192 | 71 |
| 193 | 127 |
| 194 | 145 |
| 195 | 216 |
| 196 | 161 |
| 197 | 232 |
| 198 | 251 |
| 199 | 344 |
| 200 | 171 |
| 201 | 254 |
| 202 | 266 |
| 203 | 365 |
| 204 | 281 |
| 205 | 380 |
| 206 | 402 |
| 207 | 522 |
| 208 | 193 |
| 209 | 277 |
| 210 | 291 |
| 211 | 390 |
| 212 | 313 |
| 213 | 415 |
| 214 | 438 |
| 215 | 566 |
| 216 | 324 |
| 217 | 444 |
| 218 | 467 |
| 219 | 588 |
| 220 | 491 |
| 221 | 623 |
| 222 | 644 |
| 223 | 818 |
| 224 | 212 |
| 225 | 303 |
| 226 | 318 |
| 227 | 424 |
| 228 | 348 |
| 229 | 451 |
| 230 | 471 |
| 231 | 606 |
| 232 | 377 |
| 233 | 479 |
| 234 | 503 |
| 235 | 635 |
| 236 | 532 |
| 237 | 648 |
| 238 | 697 |
| 239 | 870 |
| 240 | 401 |
| 241 | 513 |
| 242 | 542 |
| 243 | 674 |

TABLE Z3-continued with a sequence length of 2048:

| Polarized channel sequence number | Reliability or reliability sequence number |
|---|---|
| 244 | 554 |
| 245 | 713 |
| 246 | 735 |
| 247 | 914 |
| 248 | 610 |
| 249 | 746 |
| 250 | 771 |
| 251 | 905 |
| 252 | 797 |
| 253 | 950 |
| 254 | 1007 |
| 255 | 1188 |
| 256 | 21 |
| 257 | 38 |
| 258 | 43 |
| 259 | 94 |
| 260 | 51 |
| 261 | 98 |
| 262 | 109 |
| 263 | 178 |
| 264 | 52 |
| 265 | 110 |
| 266 | 121 |
| 267 | 188 |
| 268 | 133 |
| 269 | 208 |
| 270 | 218 |
| 271 | 327 |
| 272 | 66 |
| 273 | 122 |
| 274 | 134 |
| 275 | 221 |
| 276 | 147 |
| 277 | 229 |
| 278 | 242 |
| 279 | 328 |
| 280 | 156 |
| 281 | 240 |
| 282 | 258 |
| 283 | 359 |
| 284 | 278 |
| 285 | 376 |
| 286 | 385 |
| 287 | 501 |
| 288 | 69 |
| 289 | 144 |
| 290 | 158 |
| 291 | 223 |
| 292 | 175 |
| 293 | 245 |
| 294 | 262 |
| 295 | 375 |
| 296 | 184 |
| 297 | 271 |
| 298 | 282 |
| 299 | 387 |
| 300 | 294 |
| 301 | 413 |
| 302 | 429 |
| 303 | 552 |
| 304 | 183 |
| 305 | 292 |
| 306 | 305 |
| 307 | 411 |
| 308 | 323 |
| 309 | 440 |
| 310 | 455 |
| 311 | 590 |
| 312 | 350 |
| 313 | 474 |
| 314 | 493 |
| 315 | 622 |
| 316 | 511 |
| 317 | 642 |
| 318 | 679 |

TABLE Z3-continued with a sequence length of 2048:

| Polarized channel sequence number | Reliability or reliability sequence number |
|---|---|
| 319 | 856 |
| 320 | 80 |
| 321 | 169 |
| 322 | 176 |
| 323 | 268 |
| 324 | 191 |
| 325 | 287 |
| 326 | 304 |
| 327 | 405 |
| 328 | 201 |
| 329 | 310 |
| 330 | 317 |
| 331 | 437 |
| 332 | 335 |
| 333 | 462 |
| 334 | 478 |
| 335 | 619 |
| 336 | 255 |
| 337 | 330 |
| 338 | 349 |
| 339 | 466 |
| 340 | 367 |
| 341 | 489 |
| 342 | 510 |
| 343 | 638 |
| 344 | 395 |
| 345 | 517 |
| 346 | 546 |
| 347 | 671 |
| 348 | 570 |
| 349 | 711 |
| 350 | 738 |
| 351 | 897 |
| 352 | 286 |
| 353 | 362 |
| 354 | 389 |
| 355 | 499 |
| 356 | 410 |
| 357 | 529 |
| 358 | 549 |
| 359 | 699 |
| 360 | 433 |
| 361 | 561 |
| 362 | 578 |
| 363 | 719 |
| 364 | 614 |
| 365 | 758 |
| 366 | 781 |
| 367 | 936 |
| 368 | 469 |
| 369 | 612 |
| 370 | 625 |
| 371 | 772 |
| 372 | 639 |
| 373 | 799 |
| 374 | 764 |
| 375 | 963 |
| 376 | 686 |
| 377 | 851 |
| 378 | 872 |
| 379 | 1019 |
| 380 | 881 |
| 381 | 1077 |
| 382 | 1108 |
| 383 | 1225 |
| 384 | 86 |
| 385 | 189 |
| 386 | 194 |
| 387 | 322 |
| 388 | 246 |
| 389 | 339 |
| 390 | 352 |
| 391 | 473 |
| 392 | 270 |
| 393 | 357 |

TABLE Z3-continued with a sequence length of 2048:

| Polarized channel sequence number | Reliability or reliability sequence number |
|---|---|
| 394 | 369 |
| 395 | 495 |
| 396 | 394 |
| 397 | 520 |
| 398 | 545 |
| 399 | 702 |
| 400 | 284 |
| 401 | 391 |
| 402 | 409 |
| 403 | 521 |
| 404 | 423 |
| 405 | 550 |
| 406 | 573 |
| 407 | 726 |
| 408 | 445 |
| 409 | 581 |
| 410 | 604 |
| 411 | 751 |
| 412 | 637 |
| 413 | 777 |
| 414 | 816 |
| 415 | 971 |
| 416 | 326 |
| 417 | 414 |
| 418 | 428 |
| 419 | 571 |
| 420 | 454 |
| 421 | 597 |
| 422 | 628 |
| 423 | 766 |
| 424 | 494 |
| 425 | 629 |
| 426 | 645 |
| 427 | 813 |
| 428 | 688 |
| 429 | 794 |
| 430 | 863 |
| 431 | 1023 |
| 432 | 528 |
| 433 | 665 |
| 434 | 708 |
| 435 | 852 |
| 436 | 727 |
| 437 | 879 |
| 438 | 901 |
| 439 | 1059 |
| 440 | 759 |
| 441 | 910 |
| 442 | 908 |
| 443 | 1100 |
| 444 | 965 |
| 445 | 1123 |
| 446 | 1149 |
| 447 | 1303 |
| 448 | 361 |
| 449 | 442 |
| 450 | 475 |
| 451 | 631 |
| 452 | 518 |
| 453 | 647 |
| 454 | 677 |
| 455 | 828 |
| 456 | 547 |
| 457 | 700 |
| 458 | 714 |
| 459 | 874 |
| 460 | 745 |
| 461 | 885 |
| 462 | 907 |
| 463 | 1073 |
| 464 | 574 |
| 465 | 732 |
| 466 | 767 |
| 467 | 899 |
| 468 | 782 |

TABLE Z3-continued with a sequence length of 2048:

| Polarized channel sequence number | Reliability or reliability sequence number |
|---|---|
| 469 | 912 |
| 470 | 967 |
| 471 | 1125 |
| 472 | 826 |
| 473 | 979 |
| 474 | 1001 |
| 475 | 1156 |
| 476 | 1039 |
| 477 | 1197 |
| 478 | 1220 |
| 479 | 1381 |
| 480 | 620 |
| 481 | 774 |
| 482 | 809 |
| 483 | 969 |
| 484 | 861 |
| 485 | 973 |
| 486 | 1031 |
| 487 | 1167 |
| 488 | 868 |
| 489 | 1025 |
| 490 | 1063 |
| 491 | 1211 |
| 492 | 1092 |
| 493 | 1242 |
| 494 | 1285 |
| 495 | 1439 |
| 496 | 886 |
| 497 | 1079 |
| 498 | 1117 |
| 499 | 1257 |
| 500 | 1138 |
| 501 | 1292 |
| 502 | 1272 |
| 503 | 1458 |
| 504 | 1183 |
| 505 | 1324 |
| 506 | 1346 |
| 507 | 1513 |
| 508 | 1392 |
| 509 | 1543 |
| 510 | 1579 |
| 511 | 1673 |
| 512 | 28 |
| 513 | 45 |
| 514 | 54 |
| 515 | 103 |
| 516 | 62 |
| 517 | 123 |
| 518 | 135 |
| 519 | 214 |
| 520 | 68 |
| 521 | 139 |
| 522 | 148 |
| 523 | 220 |
| 524 | 160 |
| 525 | 238 |
| 526 | 243 |
| 527 | 370 |
| 528 | 70 |
| 529 | 159 |
| 530 | 168 |
| 531 | 237 |
| 532 | 177 |
| 533 | 288 |
| 534 | 298 |
| 535 | 400 |
| 536 | 202 |
| 537 | 299 |
| 538 | 321 |
| 539 | 434 |
| 540 | 338 |
| 541 | 457 |
| 542 | 477 |
| 543 | 634 |

TABLE Z3-continued with a sequence length of 2048:

| Polarized channel sequence number | Reliability or reliability sequence number |
|---|---|
| 544 | 72 |
| 545 | 174 |
| 546 | 190 |
| 547 | 293 |
| 548 | 204 |
| 549 | 319 |
| 550 | 332 |
| 551 | 449 |
| 552 | 215 |
| 553 | 343 |
| 554 | 355 |
| 555 | 481 |
| 556 | 372 |
| 557 | 506 |
| 558 | 525 |
| 559 | 650 |
| 560 | 227 |
| 561 | 364 |
| 562 | 383 |
| 563 | 516 |
| 564 | 406 |
| 565 | 543 |
| 566 | 559 |
| 567 | 693 |
| 568 | 416 |
| 569 | 553 |
| 570 | 583 |
| 571 | 730 |
| 572 | 587 |
| 573 | 750 |
| 574 | 776 |
| 575 | 1011 |
| 576 | 112 |
| 577 | 203 |
| 578 | 211 |
| 579 | 336 |
| 580 | 222 |
| 581 | 356 |
| 582 | 371 |
| 583 | 498 |
| 584 | 249 |
| 585 | 386 |
| 586 | 396 |
| 587 | 536 |
| 588 | 419 |
| 589 | 564 |
| 590 | 580 |
| 591 | 705 |
| 592 | 267 |
| 593 | 399 |
| 594 | 427 |
| 595 | 556 |
| 596 | 447 |
| 597 | 585 |
| 598 | 593 |
| 599 | 740 |
| 600 | 465 |
| 601 | 594 |
| 602 | 603 |
| 603 | 779 |
| 604 | 664 |
| 605 | 801 |
| 606 | 844 |
| 607 | 1024 |
| 608 | 285 |
| 609 | 446 |
| 610 | 459 |
| 611 | 601 |
| 612 | 487 |
| 613 | 626 |
| 614 | 632 |
| 615 | 789 |
| 616 | 509 |
| 617 | 662 |
| 618 | 682 |

TABLE Z3-continued with a sequence length of 2048:

| Polarized channel sequence number | Reliability or reliability sequence number |
|---|---|
| 619 | 825 |
| 620 | 718 |
| 621 | 858 |
| 622 | 876 |
| 623 | 1065 |
| 624 | 535 |
| 625 | 696 |
| 626 | 729 |
| 627 | 877 |
| 628 | 761 |
| 629 | 895 |
| 630 | 940 |
| 631 | 1094 |
| 632 | 808 |
| 633 | 946 |
| 634 | 981 |
| 635 | 1128 |
| 636 | 1003 |
| 637 | 1163 |
| 638 | 1201 |
| 639 | 1375 |
| 640 | 116 |
| 641 | 219 |
| 642 | 239 |
| 643 | 382 |
| 644 | 265 |
| 645 | 397 |
| 646 | 422 |
| 647 | 568 |
| 648 | 279 |
| 649 | 431 |
| 650 | 450 |
| 651 | 596 |
| 652 | 470 |
| 653 | 609 |
| 654 | 616 |
| 655 | 784 |
| 656 | 309 |
| 657 | 461 |
| 658 | 486 |
| 659 | 617 |
| 660 | 507 |
| 661 | 657 |
| 662 | 676 |
| 663 | 819 |
| 664 | 533 |
| 665 | 690 |
| 666 | 716 |
| 667 | 867 |
| 668 | 742 |
| 669 | 888 |
| 670 | 923 |
| 671 | 1067 |
| 672 | 333 |
| 673 | 497 |
| 674 | 524 |
| 675 | 680 |
| 676 | 560 |
| 677 | 710 |
| 678 | 707 |
| 679 | 890 |
| 680 | 575 |
| 681 | 734 |
| 682 | 748 |
| 683 | 916 |
| 684 | 791 |
| 685 | 942 |
| 686 | 958 |
| 687 | 1132 |
| 688 | 607 |
| 689 | 763 |
| 690 | 804 |
| 691 | 952 |
| 692 | 821 |
| 693 | 991 |

TABLE Z3-continued

| with a sequence length of 2048: | |
|---|---|
| Polarized channel sequence number | Reliability or reliability sequence number |
| 694 | 1005 |
| 695 | 1169 |
| 696 | 849 |
| 697 | 1021 |
| 698 | 1047 |
| 699 | 1213 |
| 700 | 1098 |
| 701 | 1247 |
| 702 | 1287 |
| 703 | 1442 |
| 704 | 351 |
| 705 | 539 |
| 706 | 563 |
| 707 | 737 |
| 708 | 591 |
| 709 | 756 |
| 710 | 792 |
| 711 | 948 |
| 712 | 654 |
| 713 | 806 |
| 714 | 833 |
| 715 | 997 |
| 716 | 838 |
| 717 | 1009 |
| 718 | 1035 |
| 719 | 1194 |
| 720 | 667 |
| 721 | 835 |
| 722 | 847 |
| 723 | 1029 |
| 724 | 892 |
| 725 | 1045 |
| 726 | 1085 |
| 727 | 1240 |
| 728 | 931 |
| 729 | 1096 |
| 730 | 1115 |
| 731 | 1259 |
| 732 | 1147 |
| 733 | 1306 |
| 734 | 1332 |
| 735 | 1468 |
| 736 | 691 |
| 737 | 903 |
| 738 | 920 |
| 739 | 1069 |
| 740 | 959 |
| 741 | 1102 |
| 742 | 1121 |
| 743 | 1277 |
| 744 | 983 |
| 745 | 1143 |
| 746 | 1172 |
| 747 | 1322 |
| 748 | 1204 |
| 749 | 1349 |
| 750 | 1386 |
| 751 | 1524 |
| 752 | 1051 |
| 753 | 1176 |
| 754 | 1216 |
| 755 | 1358 |
| 756 | 1252 |
| 757 | 1398 |
| 758 | 1414 |
| 759 | 1571 |
| 760 | 1280 |
| 761 | 1429 |
| 762 | 1455 |
| 763 | 1591 |
| 764 | 1492 |
| 765 | 1626 |
| 766 | 1668 |
| 767 | 1784 |
| 768 | 132 |

TABLE Z3-continued

| with a sequence length of 2048: | |
|---|---|
| Polarized channel sequence number | Reliability or reliability sequence number |
| 769 | 250 |
| 770 | 272 |
| 771 | 432 |
| 772 | 306 |
| 773 | 458 |
| 774 | 482 |
| 775 | 641 |
| 776 | 316 |
| 777 | 490 |
| 778 | 514 |
| 779 | 660 |
| 780 | 538 |
| 781 | 685 |
| 782 | 724 |
| 783 | 925 |
| 784 | 345 |
| 785 | 527 |
| 786 | 567 |
| 787 | 703 |
| 788 | 584 |
| 789 | 754 |
| 790 | 743 |
| 791 | 935 |
| 792 | 598 |
| 793 | 769 |
| 794 | 796 |
| 795 | 977 |
| 796 | 830 |
| 797 | 993 |
| 798 | 1015 |
| 799 | 1185 |
| 800 | 408 |
| 801 | 577 |
| 802 | 600 |
| 803 | 753 |
| 804 | 653 |
| 805 | 787 |
| 806 | 811 |
| 807 | 999 |
| 808 | 659 |
| 809 | 831 |
| 810 | 842 |
| 811 | 1017 |
| 812 | 860 |
| 813 | 1037 |
| 814 | 1057 |
| 815 | 1230 |
| 816 | 668 |
| 817 | 854 |
| 818 | 883 |
| 819 | 1055 |
| 820 | 929 |
| 821 | 1083 |
| 822 | 1110 |
| 823 | 1262 |
| 824 | 954 |
| 825 | 1136 |
| 826 | 1145 |
| 827 | 1308 |
| 828 | 1174 |
| 829 | 1335 |
| 830 | 1366 |
| 831 | 1506 |
| 832 | 418 |
| 833 | 651 |
| 834 | 656 |
| 835 | 823 |
| 836 | 670 |
| 837 | 837 |
| 838 | 865 |
| 839 | 1043 |
| 840 | 694 |
| 841 | 894 |
| 842 | 918 |
| 843 | 1075 |

TABLE Z3-continued with a sequence length of 2048:

| Polarized channel sequence number | Reliability or reliability sequence number |
|---|---|
| 844 | 944 |
| 845 | 1104 |
| 846 | 1141 |
| 847 | 1298 |
| 848 | 802 |
| 849 | 927 |
| 850 | 961 |
| 851 | 1113 |
| 852 | 985 |
| 853 | 1158 |
| 854 | 1178 |
| 855 | 1327 |
| 856 | 1041 |
| 857 | 1181 |
| 858 | 1218 |
| 859 | 1360 |
| 860 | 1254 |
| 861 | 1395 |
| 862 | 1411 |
| 863 | 1567 |
| 864 | 840 |
| 865 | 989 |
| 866 | 1027 |
| 867 | 1160 |
| 868 | 1053 |
| 869 | 1208 |
| 870 | 1235 |
| 871 | 1372 |
| 872 | 1090 |
| 873 | 1244 |
| 874 | 1267 |
| 875 | 1408 |
| 876 | 1295 |
| 877 | 1432 |
| 878 | 1465 |
| 879 | 1604 |
| 880 | 1119 |
| 881 | 1282 |
| 882 | 1314 |
| 883 | 1452 |
| 884 | 1344 |
| 885 | 1475 |
| 886 | 1503 |
| 887 | 1635 |
| 888 | 1378 |
| 889 | 1517 |
| 890 | 1539 |
| 891 | 1659 |
| 892 | 1559 |
| 893 | 1700 |
| 894 | 1710 |
| 895 | 1847 |
| 896 | 425 |
| 897 | 673 |
| 898 | 683 |
| 899 | 921 |
| 900 | 786 |
| 901 | 938 |
| 902 | 956 |
| 903 | 1134 |
| 904 | 814 |
| 905 | 975 |
| 906 | 995 |
| 907 | 1165 |
| 908 | 1033 |
| 909 | 1192 |
| 910 | 1227 |
| 911 | 1369 |
| 912 | 845 |
| 913 | 1013 |
| 914 | 1049 |
| 915 | 1199 |
| 916 | 1071 |
| 917 | 1237 |
| 918 | 1269 |

TABLE Z3-continued with a sequence length of 2048:

| Polarized channel sequence number | Reliability or reliability sequence number |
|---|---|
| 919 | 1404 |
| 920 | 1106 |
| 921 | 1290 |
| 922 | 1264 |
| 923 | 1423 |
| 924 | 1330 |
| 925 | 1461 |
| 926 | 1489 |
| 927 | 1617 |
| 928 | 933 |
| 929 | 1061 |
| 930 | 1081 |
| 931 | 1249 |
| 932 | 1130 |
| 933 | 1274 |
| 934 | 1311 |
| 935 | 1445 |
| 936 | 1154 |
| 937 | 1316 |
| 938 | 1341 |
| 939 | 1478 |
| 940 | 1363 |
| 941 | 1496 |
| 942 | 1528 |
| 943 | 1654 |
| 944 | 1206 |
| 945 | 1352 |
| 946 | 1384 |
| 947 | 1510 |
| 948 | 1417 |
| 949 | 1547 |
| 950 | 1563 |
| 951 | 1689 |
| 952 | 1436 |
| 953 | 1587 |
| 954 | 1600 |
| 955 | 1722 |
| 956 | 1630 |
| 957 | 1739 |
| 958 | 1752 |
| 959 | 1822 |
| 960 | 987 |
| 961 | 1088 |
| 962 | 1152 |
| 963 | 1319 |
| 964 | 1190 |
| 965 | 1338 |
| 966 | 1355 |
| 967 | 1499 |
| 968 | 1223 |
| 969 | 1389 |
| 970 | 1401 |
| 971 | 1536 |
| 972 | 1426 |
| 973 | 1551 |
| 974 | 1595 |
| 975 | 1705 |
| 976 | 1232 |
| 977 | 1420 |
| 978 | 1448 |
| 979 | 1583 |
| 980 | 1485 |
| 981 | 1608 |
| 982 | 1612 |
| 983 | 1745 |
| 984 | 1521 |
| 985 | 1640 |
| 986 | 1649 |
| 987 | 1758 |
| 988 | 1679 |
| 989 | 1792 |
| 990 | 1806 |
| 991 | 1896 |
| 992 | 1300 |
| 993 | 1472 |

TABLE Z3-continued

| with a sequence length of 2048: | |
|---|---|
| Polarized channel sequence number | Reliability or reliability sequence number |
| 994 | 1482 |
| 995 | 1621 |
| 996 | 1532 |
| 997 | 1644 |
| 998 | 1664 |
| 999 | 1771 |
| 1000 | 1555 |
| 1001 | 1684 |
| 1002 | 1694 |
| 1003 | 1799 |
| 1004 | 1728 |
| 1005 | 1814 |
| 1006 | 1856 |
| 1007 | 1920 |
| 1008 | 1575 |
| 1009 | 1716 |
| 1010 | 1733 |
| 1011 | 1830 |
| 1012 | 1764 |
| 1013 | 1838 |
| 1014 | 1865 |
| 1015 | 1933 |
| 1016 | 1778 |
| 1017 | 1875 |
| 1018 | 1885 |
| 1019 | 1948 |
| 1020 | 1907 |
| 1021 | 1964 |
| 1022 | 1984 |
| 1023 | 2008 |
| 1024 | 10 |
| 1025 | 39 |
| 1026 | 64 |
| 1027 | 140 |
| 1028 | 83 |
| 1029 | 151 |
| 1030 | 182 |
| 1031 | 283 |
| 1032 | 99 |
| 1033 | 172 |
| 1034 | 200 |
| 1035 | 308 |
| 1036 | 225 |
| 1037 | 337 |
| 1038 | 347 |
| 1039 | 526 |
| 1040 | 114 |
| 1041 | 192 |
| 1042 | 209 |
| 1043 | 331 |
| 1044 | 248 |
| 1045 | 363 |
| 1046 | 407 |
| 1047 | 541 |
| 1048 | 269 |
| 1049 | 403 |
| 1050 | 384 |
| 1051 | 565 |
| 1052 | 452 |
| 1053 | 592 |
| 1054 | 611 |
| 1055 | 778 |
| 1056 | 128 |
| 1057 | 233 |
| 1058 | 263 |
| 1059 | 374 |
| 1060 | 276 |
| 1061 | 398 |
| 1062 | 426 |
| 1063 | 572 |
| 1064 | 314 |
| 1065 | 443 |
| 1066 | 460 |
| 1067 | 595 |
| 1068 | 508 |

TABLE Z3-continued

| with a sequence length of 2048: | |
|---|---|
| Polarized channel sequence number | Reliability or reliability sequence number |
| 1069 | 633 |
| 1070 | 649 |
| 1071 | 815 |
| 1072 | 342 |
| 1073 | 468 |
| 1074 | 519 |
| 1075 | 643 |
| 1076 | 537 |
| 1077 | 669 |
| 1078 | 695 |
| 1079 | 841 |
| 1080 | 562 |
| 1081 | 701 |
| 1082 | 728 |
| 1083 | 891 |
| 1084 | 741 |
| 1085 | 913 |
| 1086 | 951 |
| 1087 | 1133 |
| 1088 | 162 |
| 1089 | 241 |
| 1090 | 295 |
| 1091 | 439 |
| 1092 | 320 |
| 1093 | 456 |
| 1094 | 504 |
| 1095 | 618 |
| 1096 | 353 |
| 1097 | 523 |
| 1098 | 472 |
| 1099 | 652 |
| 1100 | 551 |
| 1101 | 678 |
| 1102 | 712 |
| 1103 | 857 |
| 1104 | 393 |
| 1105 | 515 |
| 1106 | 558 |
| 1107 | 698 |
| 1108 | 579 |
| 1109 | 720 |
| 1110 | 739 |
| 1111 | 904 |
| 1112 | 605 |
| 1113 | 747 |
| 1114 | 783 |
| 1115 | 934 |
| 1116 | 812 |
| 1117 | 964 |
| 1118 | 992 |
| 1119 | 1187 |
| 1120 | 435 |
| 1121 | 569 |
| 1122 | 599 |
| 1123 | 736 |
| 1124 | 636 |
| 1125 | 762 |
| 1126 | 800 |
| 1127 | 957 |
| 1128 | 663 |
| 1129 | 803 |
| 1130 | 839 |
| 1131 | 980 |
| 1132 | 862 |
| 1133 | 1018 |
| 1134 | 1046 |
| 1135 | 1231 |
| 1136 | 706 |
| 1137 | 853 |
| 1138 | 898 |
| 1139 | 1028 |
| 1140 | 909 |
| 1141 | 1048 |
| 1142 | 1084 |
| 1143 | 1266 |

TABLE Z3-continued with a sequence length of 2048:

| Polarized channel sequence number | Reliability or reliability sequence number |
|---|---|
| 1144 | 945 |
| 1145 | 1095 |
| 1146 | 1124 |
| 1147 | 1293 |
| 1148 | 1151 |
| 1149 | 1317 |
| 1150 | 1357 |
| 1151 | 1534 |
| 1152 | 217 |
| 1153 | 289 |
| 1154 | 325 |
| 1155 | 512 |
| 1156 | 368 |
| 1157 | 534 |
| 1158 | 544 |
| 1159 | 709 |
| 1160 | 412 |
| 1161 | 555 |
| 1162 | 582 |
| 1163 | 733 |
| 1164 | 608 |
| 1165 | 760 |
| 1166 | 770 |
| 1167 | 955 |
| 1168 | 448 |
| 1169 | 586 |
| 1170 | 615 |
| 1171 | 765 |
| 1172 | 646 |
| 1173 | 798 |
| 1174 | 832 |
| 1175 | 984 |
| 1176 | 675 |
| 1177 | 834 |
| 1178 | 855 |
| 1179 | 1008 |
| 1180 | 902 |
| 1181 | 1040 |
| 1182 | 1076 |
| 1183 | 1253 |
| 1184 | 480 |
| 1185 | 627 |
| 1186 | 666 |
| 1187 | 810 |
| 1188 | 681 |
| 1189 | 836 |
| 1190 | 869 |
| 1191 | 1030 |
| 1192 | 731 |
| 1193 | 893 |
| 1194 | 911 |
| 1195 | 1052 |
| 1196 | 943 |
| 1197 | 1093 |
| 1198 | 1114 |
| 1199 | 1291 |
| 1200 | 768 |
| 1201 | 928 |
| 1202 | 960 |
| 1203 | 1103 |
| 1204 | 982 |
| 1205 | 1144 |
| 1206 | 1155 |
| 1207 | 1313 |
| 1208 | 1020 |
| 1209 | 1171 |
| 1210 | 1210 |
| 1211 | 1347 |
| 1212 | 1238 |
| 1213 | 1376 |
| 1214 | 1434 |
| 1215 | 1535 |
| 1216 | 496 |
| 1217 | 672 |
| 1218 | 717 |
| 1219 | 875 |
| 1220 | 757 |
| 1221 | 906 |
| 1222 | 941 |
| 1223 | 1099 |
| 1224 | 780 |
| 1225 | 947 |
| 1226 | 968 |
| 1227 | 1131 |
| 1228 | 994 |
| 1229 | 1153 |
| 1230 | 1186 |
| 1231 | 1337 |
| 1232 | 827 |
| 1233 | 986 |
| 1234 | 1010 |
| 1235 | 1168 |
| 1236 | 1050 |
| 1237 | 1203 |
| 1238 | 1234 |
| 1239 | 1385 |
| 1240 | 1068 |
| 1241 | 1241 |
| 1242 | 1271 |
| 1243 | 1409 |
| 1244 | 1301 |
| 1245 | 1444 |
| 1246 | 1464 |
| 1247 | 1613 |
| 1248 | 866 |
| 1249 | 1032 |
| 1250 | 1058 |
| 1251 | 1215 |
| 1252 | 1105 |
| 1253 | 1251 |
| 1254 | 1276 |
| 1255 | 1427 |
| 1256 | 1150 |
| 1257 | 1286 |
| 1258 | 1315 |
| 1259 | 1456 |
| 1260 | 1348 |
| 1261 | 1469 |
| 1262 | 1514 |
| 1263 | 1651 |
| 1264 | 1184 |
| 1265 | 1326 |
| 1266 | 1359 |
| 1267 | 1493 |
| 1268 | 1373 |
| 1269 | 1527 |
| 1270 | 1546 |
| 1271 | 1681 |
| 1272 | 1431 |
| 1273 | 1556 |
| 1274 | 1576 |
| 1275 | 1675 |
| 1276 | 1597 |
| 1277 | 1704 |
| 1278 | 1740 |
| 1279 | 1841 |
| 1280 | 256 |
| 1281 | 358 |
| 1282 | 379 |
| 1283 | 576 |
| 1284 | 417 |
| 1285 | 589 |
| 1286 | 621 |
| 1287 | 795 |
| 1288 | 421 |
| 1289 | 624 |
| 1290 | 655 |
| 1291 | 817 |
| 1292 | 687 |
| 1293 | 859 |

TABLE Z3-continued with a sequence length of 2048:

| Polarized channel sequence number | Reliability or reliability sequence number |
|---|---|
| 1294 | 878 |
| 1295 | 1072 |
| 1296 | 476 |
| 1297 | 658 |
| 1298 | 689 |
| 1299 | 884 |
| 1300 | 723 |
| 1301 | 900 |
| 1302 | 924 |
| 1303 | 1074 |
| 1304 | 744 |
| 1305 | 922 |
| 1306 | 953 |
| 1307 | 1122 |
| 1308 | 988 |
| 1309 | 1148 |
| 1310 | 1161 |
| 1311 | 1312 |
| 1312 | 488 |
| 1313 | 715 |
| 1314 | 749 |
| 1315 | 889 |
| 1316 | 788 |
| 1317 | 930 |
| 1318 | 962 |
| 1319 | 1146 |
| 1320 | 807 |
| 1321 | 976 |
| 1322 | 996 |
| 1323 | 1164 |
| 1324 | 1016 |
| 1325 | 1200 |
| 1326 | 1222 |
| 1327 | 1370 |
| 1328 | 805 |
| 1329 | 1012 |
| 1330 | 1036 |
| 1331 | 1198 |
| 1332 | 1066 |
| 1333 | 1236 |
| 1334 | 1256 |
| 1335 | 1410 |
| 1336 | 1109 |
| 1337 | 1279 |
| 1338 | 1302 |
| 1339 | 1443 |
| 1340 | 1325 |
| 1341 | 1463 |
| 1342 | 1497 |
| 1343 | 1641 |
| 1344 | 530 |
| 1345 | 775 |
| 1346 | 790 |
| 1347 | 972 |
| 1348 | 824 |
| 1349 | 1004 |
| 1350 | 1034 |
| 1351 | 1189 |
| 1352 | 843 |
| 1353 | 1044 |
| 1354 | 1056 |
| 1355 | 1233 |
| 1356 | 1086 |
| 1357 | 1265 |
| 1358 | 1284 |
| 1359 | 1440 |
| 1360 | 949 |
| 1361 | 1078 |
| 1362 | 1107 |
| 1363 | 1270 |
| 1364 | 1135 |
| 1365 | 1297 |
| 1366 | 1323 |
| 1367 | 1459 |
| 1368 | 1175 |

TABLE Z3-continued with a sequence length of 2048:

| Polarized channel sequence number | Reliability or reliability sequence number |
|---|---|
| 1369 | 1331 |
| 1370 | 1364 |
| 1371 | 1490 |
| 1372 | 1390 |
| 1373 | 1526 |
| 1374 | 1549 |
| 1375 | 1670 |
| 1376 | 1002 |
| 1377 | 1127 |
| 1378 | 1166 |
| 1379 | 1310 |
| 1380 | 1196 |
| 1381 | 1345 |
| 1382 | 1367 |
| 1383 | 1515 |
| 1384 | 1228 |
| 1385 | 1380 |
| 1386 | 1399 |
| 1387 | 1533 |
| 1388 | 1435 |
| 1389 | 1565 |
| 1390 | 1584 |
| 1391 | 1696 |
| 1392 | 1273 |
| 1393 | 1433 |
| 1394 | 1446 |
| 1395 | 1577 |
| 1396 | 1460 |
| 1397 | 1598 |
| 1398 | 1570 |
| 1399 | 1713 |
| 1400 | 1504 |
| 1401 | 1637 |
| 1402 | 1652 |
| 1403 | 1747 |
| 1404 | 1658 |
| 1405 | 1782 |
| 1406 | 1800 |
| 1407 | 1859 |
| 1408 | 548 |
| 1409 | 820 |
| 1410 | 829 |
| 1411 | 1064 |
| 1412 | 932 |
| 1413 | 1091 |
| 1414 | 1112 |
| 1415 | 1278 |
| 1416 | 974 |
| 1417 | 1120 |
| 1418 | 1137 |
| 1419 | 1305 |
| 1420 | 1173 |
| 1421 | 1334 |
| 1422 | 1362 |
| 1423 | 1518 |
| 1424 | 998 |
| 1425 | 1170 |
| 1426 | 1195 |
| 1427 | 1336 |
| 1428 | 1214 |
| 1429 | 1368 |
| 1430 | 1393 |
| 1431 | 1538 |
| 1432 | 1243 |
| 1433 | 1402 |
| 1434 | 1425 |
| 1435 | 1560 |
| 1436 | 1457 |
| 1437 | 1581 |
| 1438 | 1611 |
| 1439 | 1718 |
| 1440 | 1070 |
| 1441 | 1202 |
| 1442 | 1221 |
| 1443 | 1391 |

TABLE Z3-continued with a sequence length of 2048:

| Polarized channel sequence number | Reliability or reliability sequence number |
|---|---|
| 1444 | 1255 |
| 1445 | 1418 |
| 1446 | 1449 |
| 1447 | 1572 |
| 1448 | 1304 |
| 1449 | 1450 |
| 1450 | 1466 |
| 1451 | 1609 |
| 1452 | 1505 |
| 1453 | 1594 |
| 1454 | 1646 |
| 1455 | 1749 |
| 1456 | 1343 |
| 1457 | 1484 |
| 1458 | 1523 |
| 1459 | 1638 |
| 1460 | 1540 |
| 1461 | 1657 |
| 1462 | 1672 |
| 1463 | 1772 |
| 1464 | 1566 |
| 1465 | 1678 |
| 1466 | 1677 |
| 1467 | 1795 |
| 1468 | 1714 |
| 1469 | 1808 |
| 1470 | 1821 |
| 1471 | 1893 |
| 1472 | 1126 |
| 1473 | 1239 |
| 1474 | 1281 |
| 1475 | 1451 |
| 1476 | 1333 |
| 1477 | 1467 |
| 1478 | 1495 |
| 1479 | 1620 |
| 1480 | 1365 |
| 1481 | 1516 |
| 1482 | 1529 |
| 1483 | 1653 |
| 1484 | 1554 |
| 1485 | 1661 |
| 1486 | 1676 |
| 1487 | 1780 |
| 1488 | 1394 |
| 1489 | 1544 |
| 1490 | 1573 |
| 1491 | 1671 |
| 1492 | 1585 |
| 1493 | 1680 |
| 1494 | 1715 |
| 1495 | 1809 |
| 1496 | 1619 |
| 1497 | 1723 |
| 1498 | 1736 |
| 1499 | 1825 |
| 1500 | 1760 |
| 1501 | 1845 |
| 1502 | 1857 |
| 1503 | 1924 |
| 1504 | 1441 |
| 1505 | 1578 |
| 1506 | 1606 |
| 1507 | 1717 |
| 1508 | 1645 |
| 1509 | 1719 |
| 1510 | 1755 |
| 1511 | 1831 |
| 1512 | 1650 |
| 1513 | 1751 |
| 1514 | 1774 |
| 1515 | 1852 |
| 1516 | 1790 |
| 1517 | 1867 |
| 1518 | 1886 |

TABLE Z3-continued with a sequence length of 2048:

| Polarized channel sequence number | Reliability or reliability sequence number |
|---|---|
| 1519 | 1944 |
| 1520 | 1662 |
| 1521 | 1783 |
| 1522 | 1804 |
| 1523 | 1873 |
| 1524 | 1816 |
| 1525 | 1889 |
| 1526 | 1880 |
| 1527 | 1951 |
| 1528 | 1839 |
| 1529 | 1902 |
| 1530 | 1911 |
| 1531 | 1968 |
| 1532 | 1928 |
| 1533 | 1976 |
| 1534 | 1986 |
| 1535 | 2007 |
| 1536 | 302 |
| 1537 | 388 |
| 1538 | 430 |
| 1539 | 602 |
| 1540 | 464 |
| 1541 | 661 |
| 1542 | 692 |
| 1543 | 871 |
| 1544 | 484 |
| 1545 | 704 |
| 1546 | 725 |
| 1547 | 882 |
| 1548 | 755 |
| 1549 | 917 |
| 1550 | 926 |
| 1551 | 1139 |
| 1552 | 492 |
| 1553 | 752 |
| 1554 | 773 |
| 1555 | 915 |
| 1556 | 793 |
| 1557 | 1006 |
| 1558 | 1022 |
| 1559 | 1182 |
| 1560 | 846 |
| 1561 | 1026 |
| 1562 | 1062 |
| 1563 | 1229 |
| 1564 | 1089 |
| 1565 | 1258 |
| 1566 | 1283 |
| 1567 | 1454 |
| 1568 | 500 |
| 1569 | 785 |
| 1570 | 822 |
| 1571 | 1014 |
| 1572 | 850 |
| 1573 | 1060 |
| 1574 | 1080 |
| 1575 | 1248 |
| 1576 | 873 |
| 1577 | 1097 |
| 1578 | 1116 |
| 1579 | 1288 |
| 1580 | 1142 |
| 1581 | 1318 |
| 1582 | 1340 |
| 1583 | 1470 |
| 1584 | 896 |
| 1585 | 1129 |
| 1586 | 1159 |
| 1587 | 1329 |
| 1588 | 1191 |
| 1589 | 1361 |
| 1590 | 1377 |
| 1591 | 1509 |
| 1592 | 1205 |
| 1593 | 1371 |

TABLE Z3-continued

| with a sequence length of 2048: | |
|---|---|
| Polarized channel sequence number | Reliability or reliability sequence number |
| 1594 | 1403 |
| 1595 | 1542 |
| 1596 | 1407 |
| 1597 | 1558 |
| 1598 | 1580 |
| 1599 | 1742 |
| 1600 | 630 |
| 1601 | 848 |
| 1602 | 864 |
| 1603 | 1087 |
| 1604 | 887 |
| 1605 | 1118 |
| 1606 | 1140 |
| 1607 | 1309 |
| 1608 | 937 |
| 1609 | 1162 |
| 1610 | 1177 |
| 1611 | 1353 |
| 1612 | 1209 |
| 1613 | 1383 |
| 1614 | 1400 |
| 1615 | 1520 |
| 1616 | 970 |
| 1617 | 1180 |
| 1618 | 1219 |
| 1619 | 1374 |
| 1620 | 1246 |
| 1621 | 1406 |
| 1622 | 1413 |
| 1623 | 1550 |
| 1624 | 1268 |
| 1625 | 1415 |
| 1626 | 1424 |
| 1627 | 1582 |
| 1628 | 1483 |
| 1629 | 1599 |
| 1630 | 1632 |
| 1631 | 1750 |
| 1632 | 1000 |
| 1633 | 1245 |
| 1634 | 1261 |
| 1635 | 1422 |
| 1636 | 1296 |
| 1637 | 1447 |
| 1638 | 1453 |
| 1639 | 1590 |
| 1640 | 1321 |
| 1641 | 1481 |
| 1642 | 1500 |
| 1643 | 1618 |
| 1644 | 1531 |
| 1645 | 1642 |
| 1646 | 1655 |
| 1647 | 1775 |
| 1648 | 1351 |
| 1649 | 1512 |
| 1650 | 1541 |
| 1651 | 1656 |
| 1652 | 1568 |
| 1653 | 1669 |
| 1654 | 1698 |
| 1655 | 1791 |
| 1656 | 1605 |
| 1657 | 1702 |
| 1658 | 1724 |
| 1659 | 1810 |
| 1660 | 1737 |
| 1661 | 1828 |
| 1662 | 1848 |
| 1663 | 1922 |
| 1664 | 640 |
| 1665 | 880 |
| 1666 | 919 |
| 1667 | 1157 |
| 1668 | 966 |

TABLE Z3-continued

| with a sequence length of 2048: | |
|---|---|
| Polarized channel sequence number | Reliability or reliability sequence number |
| 1669 | 1179 |
| 1670 | 1212 |
| 1671 | 1388 |
| 1672 | 990 |
| 1673 | 1224 |
| 1674 | 1250 |
| 1675 | 1416 |
| 1676 | 1275 |
| 1677 | 1430 |
| 1678 | 1437 |
| 1679 | 1586 |
| 1680 | 1042 |
| 1681 | 1263 |
| 1682 | 1294 |
| 1683 | 1438 |
| 1684 | 1320 |
| 1685 | 1477 |
| 1686 | 1494 |
| 1687 | 1614 |
| 1688 | 1350 |
| 1689 | 1507 |
| 1690 | 1530 |
| 1691 | 1648 |
| 1692 | 1552 |
| 1693 | 1663 |
| 1694 | 1687 |
| 1695 | 1776 |
| 1696 | 1082 |
| 1697 | 1307 |
| 1698 | 1339 |
| 1699 | 1498 |
| 1700 | 1379 |
| 1701 | 1525 |
| 1702 | 1522 |
| 1703 | 1665 |
| 1704 | 1396 |
| 1705 | 1545 |
| 1706 | 1557 |
| 1707 | 1682 |
| 1708 | 1592 |
| 1709 | 1699 |
| 1710 | 1709 |
| 1711 | 1812 |
| 1712 | 1428 |
| 1713 | 1569 |
| 1714 | 1602 |
| 1715 | 1706 |
| 1716 | 1615 |
| 1717 | 1730 |
| 1718 | 1738 |
| 1719 | 1832 |
| 1720 | 1636 |
| 1721 | 1748 |
| 1722 | 1765 |
| 1723 | 1853 |
| 1724 | 1794 |
| 1725 | 1869 |
| 1726 | 1887 |
| 1727 | 1945 |
| 1728 | 1111 |
| 1729 | 1356 |
| 1730 | 1382 |
| 1731 | 1548 |
| 1732 | 1412 |
| 1733 | 1564 |
| 1734 | 1593 |
| 1735 | 1703 |
| 1736 | 1474 |
| 1737 | 1603 |
| 1738 | 1624 |
| 1739 | 1734 |
| 1740 | 1628 |
| 1741 | 1741 |
| 1742 | 1757 |
| 1743 | 1844 |

TABLE Z3-continued

| with a sequence length of 2048: | |
|---|---|
| Polarized channel sequence number | Reliability or reliability sequence number |
| 1744 | 1486 |
| 1745 | 1625 |
| 1746 | 1634 |
| 1747 | 1754 |
| 1748 | 1666 |
| 1749 | 1763 |
| 1750 | 1787 |
| 1751 | 1866 |
| 1752 | 1692 |
| 1753 | 1793 |
| 1754 | 1803 |
| 1755 | 1874 |
| 1756 | 1820 |
| 1757 | 1894 |
| 1758 | 1905 |
| 1759 | 1954 |
| 1760 | 1508 |
| 1761 | 1674 |
| 1762 | 1685 |
| 1763 | 1777 |
| 1764 | 1711 |
| 1765 | 1796 |
| 1766 | 1807 |
| 1767 | 1882 |
| 1768 | 1725 |
| 1769 | 1818 |
| 1770 | 1833 |
| 1771 | 1901 |
| 1772 | 1849 |
| 1773 | 1912 |
| 1774 | 1926 |
| 1775 | 1971 |
| 1776 | 1767 |
| 1777 | 1835 |
| 1778 | 1854 |
| 1779 | 1915 |
| 1780 | 1871 |
| 1781 | 1930 |
| 1782 | 1936 |
| 1783 | 1983 |
| 1784 | 1883 |
| 1785 | 1941 |
| 1786 | 1950 |
| 1787 | 1989 |
| 1788 | 1961 |
| 1789 | 1997 |
| 1790 | 2006 |
| 1791 | 2027 |
| 1792 | 684 |
| 1793 | 939 |
| 1794 | 978 |
| 1795 | 1226 |
| 1796 | 1038 |
| 1797 | 1260 |
| 1798 | 1289 |
| 1799 | 1462 |
| 1800 | 1054 |
| 1801 | 1299 |
| 1802 | 1328 |
| 1803 | 1480 |
| 1804 | 1354 |
| 1805 | 1502 |
| 1806 | 1537 |
| 1807 | 1688 |
| 1808 | 1101 |
| 1809 | 1342 |
| 1810 | 1387 |
| 1811 | 1519 |
| 1812 | 1405 |
| 1813 | 1562 |
| 1814 | 1553 |
| 1815 | 1695 |
| 1816 | 1419 |
| 1817 | 1574 |
| 1818 | 1596 |

TABLE Z3-continued

| with a sequence length of 2048: | |
|---|---|
| Polarized channel sequence number | Reliability or reliability sequence number |
| 1819 | 1721 |
| 1820 | 1622 |
| 1821 | 1731 |
| 1822 | 1744 |
| 1823 | 1840 |
| 1824 | 1193 |
| 1825 | 1397 |
| 1826 | 1421 |
| 1827 | 1561 |
| 1828 | 1473 |
| 1829 | 1589 |
| 1830 | 1607 |
| 1831 | 1735 |
| 1832 | 1479 |
| 1833 | 1623 |
| 1834 | 1631 |
| 1835 | 1746 |
| 1836 | 1643 |
| 1837 | 1759 |
| 1838 | 1770 |
| 1839 | 1861 |
| 1840 | 1487 |
| 1841 | 1639 |
| 1842 | 1660 |
| 1843 | 1769 |
| 1844 | 1691 |
| 1845 | 1786 |
| 1846 | 1801 |
| 1847 | 1876 |
| 1848 | 1707 |
| 1849 | 1815 |
| 1850 | 1819 |
| 1851 | 1895 |
| 1852 | 1834 |
| 1853 | 1906 |
| 1854 | 1918 |
| 1855 | 1966 |
| 1856 | 1207 |
| 1857 | 1471 |
| 1858 | 1476 |
| 1859 | 1616 |
| 1860 | 1488 |
| 1861 | 1627 |
| 1862 | 1647 |
| 1863 | 1762 |
| 1864 | 1511 |
| 1865 | 1667 |
| 1866 | 1683 |
| 1867 | 1781 |
| 1868 | 1701 |
| 1869 | 1797 |
| 1870 | 1817 |
| 1871 | 1891 |
| 1872 | 1601 |
| 1873 | 1690 |
| 1874 | 1712 |
| 1875 | 1802 |
| 1876 | 1726 |
| 1877 | 1826 |
| 1878 | 1836 |
| 1879 | 1903 |
| 1880 | 1761 |
| 1881 | 1837 |
| 1882 | 1855 |
| 1883 | 1916 |
| 1884 | 1872 |
| 1885 | 1929 |
| 1886 | 1935 |
| 1887 | 1982 |
| 1888 | 1629 |
| 1889 | 1729 |
| 1890 | 1753 |
| 1891 | 1827 |
| 1892 | 1768 |
| 1893 | 1851 |

TABLE Z3-continued

| with a sequence length of 2048: | |
|---|---|
| Polarized channel sequence number | Reliability or reliability sequence number |
| 1894 | 1863 |
| 1895 | 1921 |
| 1896 | 1789 |
| 1897 | 1868 |
| 1898 | 1878 |
| 1899 | 1934 |
| 1900 | 1890 |
| 1901 | 1942 |
| 1902 | 1953 |
| 1903 | 1992 |
| 1904 | 1805 |
| 1905 | 1884 |
| 1906 | 1898 |
| 1907 | 1949 |
| 1908 | 1910 |
| 1909 | 1956 |
| 1910 | 1965 |
| 1911 | 1999 |
| 1912 | 1923 |
| 1913 | 1969 |
| 1914 | 1975 |
| 1915 | 2004 |
| 1916 | 1980 |
| 1917 | 2013 |
| 1918 | 2015 |
| 1919 | 2035 |
| 1920 | 1217 |
| 1921 | 1491 |
| 1922 | 1501 |
| 1923 | 1686 |
| 1924 | 1588 |
| 1925 | 1697 |
| 1926 | 1708 |
| 1927 | 1813 |
| 1928 | 1610 |
| 1929 | 1720 |
| 1930 | 1732 |
| 1931 | 1829 |
| 1932 | 1756 |
| 1933 | 1843 |
| 1934 | 1860 |
| 1935 | 1919 |
| 1936 | 1633 |
| 1937 | 1743 |
| 1938 | 1766 |
| 1939 | 1846 |
| 1940 | 1779 |
| 1941 | 1864 |
| 1942 | 1879 |
| 1943 | 1932 |
| 1944 | 1798 |
| 1945 | 1888 |
| 1946 | 1877 |
| 1947 | 1939 |
| 1948 | 1904 |
| 1949 | 1952 |
| 1950 | 1960 |
| 1951 | 1995 |
| 1952 | 1693 |
| 1953 | 1773 |
| 1954 | 1785 |
| 1955 | 1870 |
| 1956 | 1811 |
| 1957 | 1881 |
| 1958 | 1897 |
| 1959 | 1946 |
| 1960 | 1824 |
| 1961 | 1899 |
| 1962 | 1909 |
| 1963 | 1957 |
| 1964 | 1917 |
| 1965 | 1962 |
| 1966 | 1972 |
| 1967 | 2003 |
| 1968 | 1850 |

TABLE Z3-continued

| with a sequence length of 2048: | |
|---|---|
| Polarized channel sequence number | Reliability or reliability sequence number |
| 1969 | 1913 |
| 1970 | 1925 |
| 1971 | 1967 |
| 1972 | 1937 |
| 1973 | 1977 |
| 1974 | 1981 |
| 1975 | 2011 |
| 1976 | 1943 |
| 1977 | 1988 |
| 1978 | 1991 |
| 1979 | 2017 |
| 1980 | 1998 |
| 1981 | 2020 |
| 1982 | 2022 |
| 1983 | 2032 |
| 1984 | 1727 |
| 1985 | 1788 |
| 1986 | 1823 |
| 1987 | 1900 |
| 1988 | 1842 |
| 1989 | 1908 |
| 1990 | 1914 |
| 1991 | 1963 |
| 1992 | 1858 |
| 1993 | 1927 |
| 1994 | 1931 |
| 1995 | 1974 |
| 1996 | 1940 |
| 1997 | 1978 |
| 1998 | 1990 |
| 1999 | 2014 |
| 2000 | 1862 |
| 2001 | 1938 |
| 2002 | 1947 |
| 2003 | 1987 |
| 2004 | 1959 |
| 2005 | 1993 |
| 2006 | 1994 |
| 2007 | 2021 |
| 2008 | 1970 |
| 2009 | 2000 |
| 2010 | 2002 |
| 2011 | 2023 |
| 2012 | 2009 |
| 2013 | 2028 |
| 2014 | 2030 |
| 2015 | 2040 |
| 2016 | 1892 |
| 2017 | 1955 |
| 2018 | 1958 |
| 2019 | 1996 |
| 2020 | 1973 |
| 2021 | 2001 |
| 2022 | 2005 |
| 2023 | 2025 |
| 2024 | 1979 |
| 2025 | 2010 |
| 2026 | 2012 |
| 2027 | 2029 |
| 2028 | 2018 |
| 2029 | 2031 |
| 2030 | 2036 |
| 2031 | 2042 |
| 2032 | 1985 |
| 2033 | 2016 |
| 2034 | 2019 |
| 2035 | 2033 |
| 2036 | 2024 |
| 2037 | 2034 |
| 2038 | 2037 |
| 2039 | 2043 |
| 2040 | 2026 |
| 2041 | 2038 |
| 2042 | 2039 |
| 2043 | 2044 |

TABLE Z3-continued

| with a sequence length of 2048: | |
|---|---|
| Polarized channel sequence number | Reliability or reliability sequence number |
| 2044 | 2041 |
| 2045 | 2045 |
| 2046 | 2046 |
| 2047 | 2047 |

Sequence Z4, with a sequence length of 1024:

[0, 1, 2, 7, 3, 8, 11, 24, 4, 10, 13, 28, 16, 33, 35, 76, 5, 12, 14, 32, 19, 38, 47, 80, 22, 46, 42, 87, 57, 95, 101, 160, 6, 17, 21, 40, 23, 45, 51, 89, 29, 55, 59, 96, 71, 108, 113, 175, 34, 61, 74, 111, 7 9, 120, 129, 186, 86, 131, 141, 208, 146, 218, 236, 327, 9, 18, 26, 54, 30, 58, 70, 103, 36, 75, 62, 11 4, 83, 123, 135, 193, 44, 73, 85, 130, 91, 138, 145, 214, 99, 148, 162, 228, 174, 242, 256, 357, 53, 8 8, 97, 144, 109, 154, 169, 239, 118, 170, 185, 250, 195, 269, 282, 382, 133, 191, 211, 273, 216, 28 3, 301, 403, 233, 307, 322, 419, 337, 434, 460, 582, 15, 25, 31, 72, 39, 78, 81, 134, 48, 84, 92, 143, 100, 153, 157, 238, 56, 93, 102, 155, 11, 12, 183, 192, 264, 213, 279, 297, 395, 6 4, 106, 119, 173, 124, 184, 198, 274, 142, 209, 217, 285, 232, 306, 317, 418, 156, 225, 240, 311, 2 51, 333, 339, 432, 270, 348, 370, 453, 386, 472, 511, 583, 68, 121, 137, 201, 152, 215, 231, 309, 1 61, 234, 244, 326, 257, 338, 356, 447, 180, 253, 265, 346, 284, 366, 384, 478, 293, 388, 406, 494, 424, 518, 532, 641, 197, 275, 288, 373, 312, 394, 409, 506, 336, 415, 433, 526, 454, 535, 567, 67 1, 355, 440, 461, 552, 470, 577, 591, 695, 509, 598, 613, 690, 629, 714, 743, 830, 20, 37, 41, 90, 4 9, 94, 104, 167, 50, 105, 115, 176, 126, 194, 202, 295, 63, 116, 127, 205, 139, 212, 223, 296, 147, 222, 237, 321, 254, 335, 342, 431, 66, 136, 149, 207, 164, 226, 241, 334, 172, 248, 258, 344, 268, 364, 377, 468, 171, 266, 277, 363, 292, 385, 397, 495, 314, 411, 425, 517, 439, 531, 555, 663, 77, 159, 165, 246, 179, 262, 276, 358, 187, 281, 287, 383, 302, 402, 414, 515, 235, 298, 313, 405, 32 8, 422, 438, 528, 350, 443, 464, 550, 481, 576, 593, 686, 261, 324, 345, 430, 362, 452, 466, 568, 3 80, 475, 487, 581, 512, 605, 619, 707, 407, 510, 519, 614, 529, 630, 609, 721, 560, 660, 672, 749, 677, 779, 794, 846, 82, 177, 181, 291, 227, 305, 316, 410, 247, 320, 329, 427, 349, 445, 463, 570, 259, 347, 361, 446, 372, 467, 483, 585, 389, 489, 505, 601, 527, 617, 640, 725, 294, 365, 376, 48 2, 396, 500, 521, 610, 426, 522, 533, 638, 561, 627, 667, 751, 451, 546, 574, 661, 586, 676, 688, 7 70, 606, 693, 692, 790, 722, 801, 813, 877, 323, 387, 412, 523, 444, 534, 554, 647, 465, 569, 578, 673, 597, 679, 691, 777, 484, 589, 611, 687, 620, 694, 723, 802, 646, 729, 740, 816, 760, 834, 84 4, 905, 516, 615, 636, 724, 666, 726, 756, 821, 670, 753, 772, 840, 786, 853, 870, 924, 680, 780, 7 98, 859, 808, 873, 865, 930, 828, 885, 893, 946, 909, 954, 963, 984, 27, 43, 52, 98, 60, 117, 128, 1 99, 65, 132, 140, 204, 151, 220, 224, 330, 67, 150, 158, 219, 166, 263, 271, 354, 188, 272, 290, 38 1, 304, 398, 413, 525, 69, 163, 178, 267, 190, 289, 299, 392, 200, 308, 318, 416, 332, 435, 449, 53 6, 210, 325, 341, 442, 359, 462, 473, 564, 367, 469, 490, 588, 493, 600, 616, 745, 107, 189, 196, 3 03, 206, 319, 331, 429, 229, 343, 351, 457, 369, 477, 488, 572, 245, 353, 375, 471, 391, 492, 497, 594, 404, 498, 504, 618, 545, 631, 656, 752, 260, 390, 400, 503, 421, 520, 524, 624, 437, 544, 55 7, 645, 580, 664, 674, 773, 456, 566, 587, 675, 607, 685, 709, 787, 635, 712, 730, 803, 741, 819, 8 36, 903, 110, 203, 221, 340, 243, 352, 371, 480, 255, 378, 393, 499, 408, 508, 513, 621, 280, 401, 420, 514, 436, 541, 553, 642, 455, 562, 579, 669, 595, 681, 700, 774, 300, 428, 448, 556, 474, 57 5, 573, 682, 485, 590, 599, 696, 625, 710, 718, 805, 507, 608, 633, 715, 643, 735, 742, 822, 659, 7 50, 764, 841, 789, 855, 871, 925, 315, 459, 476, 592, 496, 604, 626, 713, 539, 634, 650, 738, 653, 744, 758, 833, 547, 651, 658, 755, 683, 763, 783, 852, 704, 788, 797, 860, 812, 878, 888, 933, 56 3, 689, 698, 775, 719, 791, 800, 867, 731, 810, 823, 884, 837, 894, 907, 949, 766, 825, 842, 897, 8 57, 911, 916, 961, 868, 921, 929, 966, 940, 974, 983, 1003, 125, 230, 249, 379, 278, 399, 417, 53 0, 286, 423, 441, 543, 458, 559, 584, 701, 310, 450, 479, 571, 491, 603, 596, 706, 501, 612, 628, 7 28, 648, 736, 747, 829, 360, 486, 502, 602, 538, 623, 637, 739, 542, 649, 655, 748, 665, 759, 769, 848, 548, 662, 678, 768, 703, 782, 795, 861, 716, 807, 811, 879, 824, 889, 900, 944, 368, 537, 54 0, 644, 549, 652, 668, 762, 565, 684, 697, 778, 711, 792, 809, 875, 632, 702, 720, 796, 732, 817, 8 26, 886, 761, 827, 843, 898, 858, 910, 915, 960, 654, 734, 754, 818, 767, 839, 850, 902, 785, 854, 863, 914, 874, 922, 932, 969, 799, 869, 881, 928, 892, 935, 943, 976, 904, 947, 953, 981, 958, 98 9, 991, 1011, 374, 551, 558, 699, 622, 708, 717, 806, 639, 727, 737, 820, 757, 832, 847, 901, 657, 746, 765, 835, 776, 851, 864, 913, 793, 872, 862, 919, 887, 931, 939, 972, 705, 771, 781, 856, 80 4, 866, 880, 926, 815, 882, 891, 936, 899, 941, 950, 980, 838, 895, 906, 945, 917, 955, 959, 987, 9 23, 965, 968, 993, 975, 996, 998, 1008, 733, 784, 814, 883, 831, 890, 896, 942, 845, 908, 912, 95 2, 920, 956, 967, 990, 849, 918, 927, 964, 938, 970, 971, 997, 948, 977, 979, 999, 985, 1004, 100 6, 1016, 876, 934, 937, 973, 951, 978, 982, 1001, 957, 986, 988, 1005, 994, 1007, 1012, 1018, 96 2, 992, 995, 1009, 1000, 1010, 1013, 1019, 1002, 1014, 1015, 1020, 1017, 1021, 1022, 1023]

TABLE Z4

| with a sequence length of 1024: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 11 |
| 7 | 24 |
| 8 | 4 |
| 9 | 10 |
| 10 | 13 |
| 11 | 28 |
| 12 | 16 |
| 13 | 33 |
| 14 | 35 |
| 15 | 76 |
| 16 | 5 |
| 17 | 12 |
| 18 | 14 |
| 19 | 32 |
| 20 | 19 |
| 21 | 38 |
| 22 | 47 |
| 23 | 80 |
| 24 | 22 |
| 25 | 46 |
| 26 | 42 |

TABLE Z4-continued

| with a sequence length of 1024: | |
|---|---|
| Polarized channel sequence number | Reliability or reliability sequence number |
| 27 | 87 |
| 28 | 57 |
| 29 | 95 |
| 30 | 101 |
| 31 | 160 |
| 32 | 6 |
| 33 | 17 |
| 34 | 21 |
| 35 | 40 |
| 36 | 23 |
| 37 | 45 |
| 38 | 51 |
| 39 | 89 |
| 40 | 29 |
| 41 | 55 |
| 42 | 59 |
| 43 | 96 |
| 44 | 71 |
| 45 | 108 |
| 46 | 113 |
| 47 | 175 |
| 48 | 34 |
| 49 | 61 |
| 50 | 74 |
| 51 | 111 |
| 52 | 79 |
| 53 | 120 |
| 54 | 129 |
| 55 | 186 |
| 56 | 86 |
| 57 | 131 |
| 58 | 141 |
| 59 | 208 |
| 60 | 146 |
| 61 | 218 |
| 62 | 236 |
| 63 | 327 |
| 64 | 9 |
| 65 | 18 |
| 66 | 26 |
| 67 | 54 |
| 68 | 30 |
| 69 | 58 |
| 70 | 70 |
| 71 | 103 |
| 72 | 36 |
| 73 | 75 |
| 74 | 62 |
| 75 | 114 |
| 76 | 83 |
| 77 | 123 |
| 78 | 135 |
| 79 | 193 |
| 80 | 44 |
| 81 | 73 |
| 82 | 85 |
| 83 | 130 |
| 84 | 91 |
| 85 | 138 |
| 86 | 145 |
| 87 | 214 |
| 88 | 99 |
| 89 | 148 |
| 90 | 162 |
| 91 | 228 |
| 92 | 174 |
| 93 | 242 |
| 94 | 256 |
| 95 | 357 |
| 96 | 53 |
| 97 | 88 |
| 98 | 97 |
| 99 | 144 |
| 100 | 109 |
| 101 | 154 |

TABLE Z4-continued

| with a sequence length of 1024: | |
|---|---|
| Polarized channel sequence number | Reliability or reliability sequence number |
| 102 | 169 |
| 103 | 239 |
| 104 | 118 |
| 105 | 170 |
| 106 | 185 |
| 107 | 250 |
| 108 | 195 |
| 109 | 269 |
| 110 | 282 |
| 111 | 382 |
| 112 | 133 |
| 113 | 191 |
| 114 | 211 |
| 115 | 273 |
| 116 | 216 |
| 117 | 283 |
| 118 | 301 |
| 119 | 403 |
| 120 | 233 |
| 121 | 307 |
| 122 | 322 |
| 123 | 419 |
| 124 | 337 |
| 125 | 434 |
| 126 | 460 |
| 127 | 582 |
| 128 | 15 |
| 129 | 25 |
| 130 | 31 |
| 131 | 72 |
| 132 | 39 |
| 133 | 78 |
| 134 | 81 |
| 135 | 134 |
| 136 | 48 |
| 137 | 84 |
| 138 | 92 |
| 139 | 143 |
| 140 | 100 |
| 141 | 153 |
| 142 | 157 |
| 143 | 238 |
| 144 | 56 |
| 145 | 93 |
| 146 | 102 |
| 147 | 155 |
| 148 | 112 |
| 149 | 168 |
| 150 | 182 |
| 151 | 252 |
| 152 | 122 |
| 153 | 183 |
| 154 | 192 |
| 155 | 264 |
| 156 | 213 |
| 157 | 279 |
| 158 | 297 |
| 159 | 395 |
| 160 | 64 |
| 161 | 106 |
| 162 | 119 |
| 163 | 173 |
| 164 | 124 |
| 165 | 184 |
| 166 | 198 |
| 167 | 274 |
| 168 | 142 |
| 169 | 209 |
| 170 | 217 |
| 171 | 285 |
| 172 | 232 |
| 173 | 306 |
| 174 | 317 |
| 175 | 418 |
| 176 | 156 |

TABLE Z4-continued

| with a sequence length of 1024: | |
|---|---|
| Polarized channel sequence number | Reliability or reliability sequence number |
| 177 | 225 |
| 178 | 240 |
| 179 | 311 |
| 180 | 251 |
| 181 | 333 |
| 182 | 339 |
| 183 | 432 |
| 184 | 270 |
| 185 | 348 |
| 186 | 370 |
| 187 | 453 |
| 188 | 386 |
| 189 | 472 |
| 190 | 511 |
| 191 | 583 |
| 192 | 68 |
| 193 | 121 |
| 194 | 137 |
| 195 | 201 |
| 196 | 152 |
| 197 | 215 |
| 198 | 231 |
| 199 | 309 |
| 200 | 161 |
| 201 | 234 |
| 202 | 244 |
| 203 | 326 |
| 204 | 257 |
| 205 | 338 |
| 206 | 356 |
| 207 | 447 |
| 208 | 180 |
| 209 | 253 |
| 210 | 265 |
| 211 | 346 |
| 212 | 284 |
| 213 | 366 |
| 214 | 384 |
| 215 | 478 |
| 216 | 293 |
| 217 | 388 |
| 218 | 406 |
| 219 | 494 |
| 220 | 424 |
| 221 | 518 |
| 222 | 532 |
| 223 | 641 |
| 224 | 197 |
| 225 | 275 |
| 226 | 288 |
| 227 | 373 |
| 228 | 312 |
| 229 | 394 |
| 230 | 409 |
| 231 | 506 |
| 232 | 336 |
| 233 | 415 |
| 234 | 433 |
| 235 | 526 |
| 236 | 454 |
| 237 | 535 |
| 238 | 567 |
| 239 | 671 |
| 240 | 355 |
| 241 | 440 |
| 242 | 461 |
| 243 | 552 |
| 244 | 470 |
| 245 | 577 |
| 246 | 591 |
| 247 | 695 |
| 248 | 509 |
| 249 | 598 |
| 250 | 613 |
| 251 | 690 |

TABLE Z4-continued

| with a sequence length of 1024: | |
|---|---|
| Polarized channel sequence number | Reliability or reliability sequence number |
| 252 | 629 |
| 253 | 714 |
| 254 | 743 |
| 255 | 830 |
| 256 | 20 |
| 257 | 37 |
| 258 | 41 |
| 259 | 90 |
| 260 | 49 |
| 261 | 94 |
| 262 | 104 |
| 263 | 167 |
| 264 | 50 |
| 265 | 105 |
| 266 | 115 |
| 267 | 176 |
| 268 | 126 |
| 269 | 194 |
| 270 | 202 |
| 271 | 295 |
| 272 | 63 |
| 273 | 116 |
| 274 | 127 |
| 275 | 205 |
| 276 | 139 |
| 277 | 212 |
| 278 | 223 |
| 279 | 296 |
| 280 | 147 |
| 281 | 222 |
| 282 | 237 |
| 283 | 321 |
| 284 | 254 |
| 285 | 335 |
| 286 | 342 |
| 287 | 431 |
| 288 | 66 |
| 289 | 136 |
| 290 | 149 |
| 291 | 207 |
| 292 | 164 |
| 293 | 226 |
| 294 | 241 |
| 295 | 334 |
| 296 | 172 |
| 297 | 248 |
| 298 | 258 |
| 299 | 344 |
| 300 | 268 |
| 301 | 364 |
| 302 | 377 |
| 303 | 468 |
| 304 | 171 |
| 305 | 266 |
| 306 | 277 |
| 307 | 363 |
| 308 | 292 |
| 309 | 385 |
| 310 | 397 |
| 311 | 495 |
| 312 | 314 |
| 313 | 411 |
| 314 | 425 |
| 315 | 517 |
| 316 | 439 |
| 317 | 531 |
| 318 | 555 |
| 319 | 663 |
| 320 | 77 |
| 321 | 159 |
| 322 | 165 |
| 323 | 246 |
| 324 | 179 |
| 325 | 262 |
| 326 | 276 |

TABLE Z4-continued

| with a sequence length of 1024: | |
|---|---|
| Polarized channel sequence number | Reliability or reliability sequence number |
| 327 | 358 |
| 328 | 187 |
| 329 | 281 |
| 330 | 287 |
| 331 | 383 |
| 332 | 302 |
| 333 | 402 |
| 334 | 414 |
| 335 | 515 |
| 336 | 235 |
| 337 | 298 |
| 338 | 313 |
| 339 | 405 |
| 340 | 328 |
| 341 | 422 |
| 342 | 438 |
| 343 | 528 |
| 344 | 350 |
| 345 | 443 |
| 346 | 464 |
| 347 | 550 |
| 348 | 481 |
| 349 | 576 |
| 350 | 593 |
| 351 | 686 |
| 352 | 261 |
| 353 | 324 |
| 354 | 345 |
| 355 | 430 |
| 356 | 362 |
| 357 | 452 |
| 358 | 466 |
| 359 | 568 |
| 360 | 380 |
| 361 | 475 |
| 362 | 487 |
| 363 | 581 |
| 364 | 512 |
| 365 | 605 |
| 366 | 619 |
| 367 | 707 |
| 368 | 407 |
| 369 | 510 |
| 370 | 519 |
| 371 | 614 |
| 372 | 529 |
| 373 | 630 |
| 374 | 609 |
| 375 | 721 |
| 376 | 560 |
| 377 | 660 |
| 378 | 672 |
| 379 | 749 |
| 380 | 677 |
| 381 | 779 |
| 382 | 794 |
| 383 | 846 |
| 384 | 82 |
| 385 | 177 |
| 386 | 181 |
| 387 | 291 |
| 388 | 227 |
| 389 | 305 |
| 390 | 316 |
| 391 | 410 |
| 392 | 247 |
| 393 | 320 |
| 394 | 329 |
| 395 | 427 |
| 396 | 349 |
| 397 | 445 |
| 398 | 463 |
| 399 | 570 |
| 400 | 259 |
| 401 | 347 |

TABLE Z4-continued

| with a sequence length of 1024: | |
|---|---|
| Polarized channel sequence number | Reliability or reliability sequence number |
| 402 | 361 |
| 403 | 446 |
| 404 | 372 |
| 405 | 467 |
| 406 | 483 |
| 407 | 585 |
| 408 | 389 |
| 409 | 489 |
| 410 | 505 |
| 411 | 601 |
| 412 | 527 |
| 413 | 617 |
| 414 | 640 |
| 415 | 725 |
| 416 | 294 |
| 417 | 365 |
| 418 | 376 |
| 419 | 482 |
| 420 | 396 |
| 421 | 500 |
| 422 | 521 |
| 423 | 610 |
| 424 | 426 |
| 425 | 522 |
| 426 | 533 |
| 427 | 638 |
| 428 | 561 |
| 429 | 627 |
| 430 | 667 |
| 431 | 751 |
| 432 | 451 |
| 433 | 546 |
| 434 | 574 |
| 435 | 661 |
| 436 | 586 |
| 437 | 676 |
| 438 | 688 |
| 439 | 770 |
| 440 | 606 |
| 441 | 693 |
| 442 | 692 |
| 443 | 790 |
| 444 | 722 |
| 445 | 801 |
| 446 | 813 |
| 447 | 877 |
| 448 | 323 |
| 449 | 387 |
| 450 | 412 |
| 451 | 523 |
| 452 | 444 |
| 453 | 534 |
| 454 | 554 |
| 455 | 647 |
| 456 | 465 |
| 457 | 569 |
| 458 | 578 |
| 459 | 673 |
| 460 | 597 |
| 461 | 679 |
| 462 | 691 |
| 463 | 777 |
| 464 | 484 |
| 465 | 589 |
| 466 | 611 |
| 467 | 687 |
| 468 | 620 |
| 469 | 694 |
| 470 | 723 |
| 471 | 802 |
| 472 | 646 |
| 473 | 729 |
| 474 | 740 |
| 475 | 816 |
| 476 | 760 |

TABLE Z4-continued

| with a sequence length of 1024: | |
|---|---|
| Polarized channel sequence number | Reliability or reliability sequence number |
| 477 | 834 |
| 478 | 844 |
| 479 | 905 |
| 480 | 516 |
| 481 | 615 |
| 482 | 636 |
| 483 | 724 |
| 484 | 666 |
| 485 | 726 |
| 486 | 756 |
| 487 | 821 |
| 488 | 670 |
| 489 | 753 |
| 490 | 772 |
| 491 | 840 |
| 492 | 786 |
| 493 | 853 |
| 494 | 870 |
| 495 | 924 |
| 496 | 680 |
| 497 | 780 |
| 498 | 798 |
| 499 | 859 |
| 500 | 808 |
| 501 | 873 |
| 502 | 865 |
| 503 | 930 |
| 504 | 828 |
| 505 | 885 |
| 506 | 893 |
| 507 | 946 |
| 508 | 909 |
| 509 | 954 |
| 510 | 963 |
| 511 | 984 |
| 512 | 27 |
| 513 | 43 |
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |
| 526 | 224 |
| 527 | 330 |
| 528 | 67 |
| 529 | 150 |
| 530 | 158 |
| 531 | 219 |
| 532 | 166 |
| 533 | 263 |
| 534 | 271 |
| 535 | 354 |
| 536 | 188 |
| 537 | 272 |
| 538 | 290 |
| 539 | 381 |
| 540 | 304 |
| 541 | 398 |
| 542 | 413 |
| 543 | 525 |
| 544 | 69 |
| 545 | 163 |
| 546 | 178 |
| 547 | 267 |
| 548 | 190 |
| 549 | 289 |
| 550 | 299 |
| 551 | 392 |

TABLE Z4-continued

| with a sequence length of 1024: | |
|---|---|
| Polarized channel sequence number | Reliability or reliability sequence number |
| 552 | 200 |
| 553 | 308 |
| 554 | 318 |
| 555 | 416 |
| 556 | 332 |
| 557 | 435 |
| 558 | 449 |
| 559 | 536 |
| 560 | 210 |
| 561 | 325 |
| 562 | 341 |
| 563 | 442 |
| 564 | 359 |
| 565 | 462 |
| 566 | 473 |
| 567 | 564 |
| 568 | 367 |
| 569 | 469 |
| 570 | 490 |
| 571 | 588 |
| 572 | 493 |
| 573 | 600 |
| 574 | 616 |
| 575 | 745 |
| 576 | 107 |
| 577 | 189 |
| 578 | 196 |
| 579 | 303 |
| 580 | 206 |
| 581 | 319 |
| 582 | 331 |
| 583 | 429 |
| 584 | 229 |
| 585 | 343 |
| 586 | 351 |
| 587 | 457 |
| 588 | 369 |
| 589 | 477 |
| 590 | 488 |
| 591 | 572 |
| 592 | 245 |
| 593 | 353 |
| 594 | 375 |
| 595 | 471 |
| 596 | 391 |
| 597 | 492 |
| 598 | 497 |
| 599 | 594 |
| 600 | 404 |
| 601 | 498 |
| 602 | 504 |
| 603 | 618 |
| 604 | 545 |
| 605 | 631 |
| 606 | 656 |
| 607 | 752 |
| 608 | 260 |
| 609 | 390 |
| 610 | 400 |
| 611 | 503 |
| 612 | 421 |
| 613 | 520 |
| 614 | 524 |
| 615 | 624 |
| 616 | 437 |
| 617 | 544 |
| 618 | 557 |
| 619 | 645 |
| 620 | 580 |
| 621 | 664 |
| 622 | 674 |
| 623 | 773 |
| 624 | 456 |
| 625 | 566 |
| 626 | 587 |

TABLE Z4-continued with a sequence length of 1024:

| Polarized channel sequence number | Reliability or reliability sequence number |
|---|---|
| 627 | 675 |
| 628 | 607 |
| 629 | 685 |
| 630 | 709 |
| 631 | 787 |
| 632 | 635 |
| 633 | 712 |
| 634 | 730 |
| 635 | 803 |
| 636 | 741 |
| 637 | 819 |
| 638 | 836 |
| 639 | 903 |
| 640 | 110 |
| 641 | 203 |
| 642 | 221 |
| 643 | 340 |
| 644 | 243 |
| 645 | 352 |
| 646 | 371 |
| 647 | 480 |
| 648 | 255 |
| 649 | 378 |
| 650 | 393 |
| 651 | 499 |
| 652 | 408 |
| 653 | 508 |
| 654 | 513 |
| 655 | 621 |
| 656 | 280 |
| 657 | 401 |
| 658 | 420 |
| 659 | 514 |
| 660 | 436 |
| 661 | 541 |
| 662 | 553 |
| 663 | 642 |
| 664 | 455 |
| 665 | 562 |
| 666 | 579 |
| 667 | 669 |
| 668 | 595 |
| 669 | 681 |
| 670 | 700 |
| 671 | 774 |
| 672 | 300 |
| 673 | 428 |
| 674 | 448 |
| 675 | 556 |
| 676 | 474 |
| 677 | 575 |
| 678 | 573 |
| 679 | 682 |
| 680 | 485 |
| 681 | 590 |
| 682 | 599 |
| 683 | 696 |
| 684 | 625 |
| 685 | 710 |
| 686 | 718 |
| 687 | 805 |
| 688 | 507 |
| 689 | 608 |
| 690 | 633 |
| 691 | 715 |
| 692 | 643 |
| 693 | 735 |
| 694 | 742 |
| 695 | 822 |
| 696 | 659 |
| 697 | 750 |
| 698 | 764 |
| 699 | 841 |
| 700 | 789 |
| 701 | 855 |

TABLE Z4-continued with a sequence length of 1024:

| Polarized channel sequence number | Reliability or reliability sequence number |
|---|---|
| 702 | 871 |
| 703 | 925 |
| 704 | 315 |
| 705 | 459 |
| 706 | 476 |
| 707 | 592 |
| 708 | 496 |
| 709 | 604 |
| 710 | 626 |
| 711 | 713 |
| 712 | 539 |
| 713 | 634 |
| 714 | 650 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 812 |
| 733 | 878 |
| 734 | 888 |
| 735 | 933 |
| 736 | 563 |
| 737 | 689 |
| 738 | 698 |
| 739 | 775 |
| 740 | 719 |
| 741 | 791 |
| 742 | 800 |
| 743 | 867 |
| 744 | 731 |
| 745 | 810 |
| 746 | 823 |
| 747 | 884 |
| 748 | 837 |
| 749 | 894 |
| 750 | 907 |
| 751 | 949 |
| 752 | 766 |
| 753 | 825 |
| 754 | 842 |
| 755 | 897 |
| 756 | 857 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 379 |
| 772 | 278 |
| 773 | 399 |
| 774 | 417 |
| 775 | 530 |
| 776 | 286 |

TABLE Z4-continued

| with a sequence length of 1024: | |
|---|---|
| Polarized channel sequence number | Reliability or reliability sequence number |
| 777 | 423 |
| 778 | 441 |
| 779 | 543 |
| 780 | 458 |
| 781 | 559 |
| 782 | 584 |
| 783 | 701 |
| 784 | 310 |
| 785 | 450 |
| 786 | 479 |
| 787 | 571 |
| 788 | 491 |
| 789 | 603 |
| 790 | 596 |
| 791 | 706 |
| 792 | 501 |
| 793 | 612 |
| 794 | 628 |
| 795 | 728 |
| 796 | 648 |
| 797 | 736 |
| 798 | 747 |
| 799 | 829 |
| 800 | 360 |
| 801 | 486 |
| 802 | 502 |
| 803 | 602 |
| 804 | 538 |
| 805 | 623 |
| 806 | 637 |
| 807 | 739 |
| 808 | 542 |
| 809 | 649 |
| 810 | 655 |
| 811 | 748 |
| 812 | 665 |
| 813 | 759 |
| 814 | 769 |
| 815 | 848 |
| 816 | 548 |
| 817 | 662 |
| 818 | 678 |
| 819 | 768 |
| 820 | 703 |
| 821 | 782 |
| 822 | 795 |
| 823 | 861 |
| 824 | 716 |
| 825 | 807 |
| 826 | 811 |
| 827 | 879 |
| 828 | 824 |
| 829 | 889 |
| 830 | 900 |
| 831 | 944 |
| 832 | 368 |
| 833 | 537 |
| 834 | 540 |
| 835 | 644 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 875 |
| 848 | 632 |
| 849 | 702 |
| 850 | 720 |
| 851 | 796 |

TABLE Z4-continued

| with a sequence length of 1024: | |
|---|---|
| Polarized channel sequence number | Reliability or reliability sequence number |
| 852 | 732 |
| 853 | 817 |
| 854 | 826 |
| 855 | 886 |
| 856 | 761 |
| 857 | 827 |
| 858 | 843 |
| 859 | 898 |
| 860 | 858 |
| 861 | 910 |
| 862 | 915 |
| 863 | 960 |
| 864 | 654 |
| 865 | 734 |
| 866 | 754 |
| 867 | 818 |
| 868 | 767 |
| 869 | 839 |
| 870 | 850 |
| 871 | 902 |
| 872 | 785 |
| 873 | 854 |
| 874 | 863 |
| 875 | 914 |
| 876 | 874 |
| 877 | 922 |
| 878 | 932 |
| 879 | 969 |
| 880 | 799 |
| 881 | 869 |
| 882 | 881 |
| 883 | 928 |
| 884 | 892 |
| 885 | 935 |
| 886 | 943 |
| 887 | 976 |
| 888 | 904 |
| 889 | 947 |
| 890 | 953 |
| 891 | 981 |
| 892 | 958 |
| 893 | 989 |
| 894 | 991 |
| 895 | 1011 |
| 896 | 374 |
| 897 | 551 |
| 898 | 558 |
| 899 | 699 |
| 900 | 622 |
| 901 | 708 |
| 902 | 717 |
| 903 | 806 |
| 904 | 639 |
| 905 | 727 |
| 906 | 737 |
| 907 | 820 |
| 908 | 757 |
| 909 | 832 |
| 910 | 847 |
| 911 | 901 |
| 912 | 657 |
| 913 | 746 |
| 914 | 765 |
| 915 | 835 |
| 916 | 776 |
| 917 | 851 |
| 918 | 864 |
| 919 | 913 |
| 920 | 793 |
| 921 | 872 |
| 922 | 862 |
| 923 | 919 |
| 924 | 887 |
| 925 | 931 |
| 926 | 939 |

TABLE Z4-continued

| with a sequence length of 1024: | |
|---|---|
| Polarized channel sequence number | Reliability or reliability sequence number |
| 927 | 972 |
| 928 | 705 |
| 929 | 771 |
| 930 | 781 |
| 931 | 856 |
| 932 | 804 |
| 933 | 866 |
| 934 | 880 |
| 935 | 926 |
| 936 | 815 |
| 937 | 882 |
| 938 | 891 |
| 939 | 936 |
| 940 | 899 |
| 941 | 941 |
| 942 | 950 |
| 943 | 980 |
| 944 | 838 |
| 945 | 895 |
| 946 | 906 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |
| 958 | 998 |
| 959 | 1008 |
| 960 | 733 |
| 961 | 784 |
| 962 | 814 |
| 963 | 883 |
| 964 | 831 |
| 965 | 890 |
| 966 | 896 |
| 967 | 942 |
| 968 | 845 |
| 969 | 908 |
| 970 | 912 |
| 971 | 952 |
| 972 | 920 |
| 973 | 956 |
| 974 | 967 |
| 975 | 990 |
| 976 | 849 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 876 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |

TABLE Z4-continued

| with a sequence length of 1024: | |
|---|---|
| Polarized channel sequence number | Reliability or reliability sequence number |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Sequence Z5, with a sequence length of 512:

[0, 1, 2, 7, 3, 8, 11, 24, 4, 10, 13, 27, 16, 32, 34, 69, 5, 12, 14, 31, 19, 37, 45, 73, 22, 44, 41, 80, 54, 88, 93, 142, 6, 17, 21, 39, 23, 43, 49, 82, 28, 52, 56, 89, 64, 99, 103, 155, 33, 57, 67, 101, 72, 1 09, 116, 165, 79, 118, 126, 178, 131, 187, 199, 266, 9, 18, 26, 51, 29, 55, 63, 95, 35, 68, 58, 104, 76, 112, 121, 169, 42, 66, 78, 117, 84, 124, 130, 183, 91, 133, 144, 193, 154, 205, 215, 286, 50, 81, 90, 129, 100, 137, 149, 202, 107, 150, 164, 210, 171, 225, 234, 300, 119, 167, 180, 227, 185, 235, 24 8, 313, 196, 252, 262, 324, 273, 334, 347, 407, 15, 25, 30, 65, 38, 71, 74, 120, 46, 77, 85, 128, 92, 1 36, 140, 201, 53, 86, 94, 138, 102, 148, 161, 212, 111, 162, 168, 221, 182, 232, 246, 309, 60, 98, 1 08, 153, 113, 163, 173, 228, 127, 179, 186, 237, 195, 251, 259, 323, 139, 190, 203, 254, 211, 269, 275, 332, 226, 281, 294, 345, 304, 356, 372, 408, 62, 110, 123, 174, 135, 184, 194, 253, 143, 197, 206, 265, 216, 274, 285, 342, 159, 213, 222, 279, 236, 293, 302, 358, 242, 306, 315, 365, 326, 37 7, 387, 434, 172, 229, 239, 296, 255, 308, 317, 369, 272, 322, 333, 382, 346, 390, 398, 443, 284, 3 37, 348, 393, 355, 404, 412, 458, 370, 415, 422, 453, 429, 460, 469, 491, 20, 36, 40, 83, 47, 87, 96, 147, 48, 97, 105, 156, 114, 170, 175, 244, 59, 106, 115, 176, 125, 181, 189, 245, 132, 188, 200, 26 1, 214, 271, 276, 331, 61, 122, 134, 177, 145, 191, 204, 270, 152, 209, 217, 277, 224, 291, 298, 35 4, 151, 223, 231, 290, 241, 303, 311, 366, 257, 319, 327, 376, 336, 386, 395, 439, 70, 141, 146, 20 7, 158, 220, 230, 287, 166, 233, 238, 301, 249, 312, 321, 374, 198, 247, 256, 314, 267, 325, 335, 3 84, 283, 338, 350, 392, 359, 403, 413, 450, 219, 264, 278, 330, 289, 344, 352, 399, 299, 357, 363, 406, 373, 417, 426, 459, 316, 371, 378, 423, 385, 430, 419, 461, 396, 437, 444, 470, 447, 478, 48 2, 495, 75, 157, 160, 240, 192, 250, 258, 318, 208, 260, 268, 329, 282, 340, 349, 401, 218, 280, 28 8, 341, 295, 353, 361, 409, 307, 364, 368, 416, 383, 425, 433, 465, 243, 292, 297, 360, 310, 367, 3 79, 420, 328, 380, 388, 432, 397, 428, 441, 471, 343, 391, 402, 438, 410, 446, 452, 475, 418, 456, 455, 481, 462, 484, 487, 501, 263, 305, 320, 381, 339, 389, 394, 436, 351, 400, 405, 445, 414, 44 8, 454, 477, 362, 411, 421, 451, 427, 457, 463, 485, 435, 467, 468, 488, 474, 492, 494, 504, 375, 4 24, 431, 464, 440, 466, 473, 489, 442, 472, 476, 493, 480, 496, 499, 506, 449, 479, 483, 497, 486, 500, 498, 507, 490, 502, 503, 508, 505, 509, 510, 511]

TABLE Z5

| with a sequence length of 512: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 11 |
| 7 | 24 |
| 8 | 4 |
| 9 | 10 |
| 10 | 13 |
| 11 | 27 |
| 12 | 16 |
| 13 | 32 |
| 14 | 34 |
| 15 | 69 |
| 16 | 5 |
| 17 | 12 |
| 18 | 14 |
| 19 | 31 |
| 20 | 19 |
| 21 | 37 |
| 22 | 45 |
| 23 | 73 |
| 24 | 22 |
| 25 | 44 |
| 26 | 41 |
| 27 | 80 |
| 28 | 54 |
| 29 | 88 |
| 30 | 93 |
| 31 | 142 |
| 32 | 6 |
| 33 | 17 |
| 34 | 21 |
| 35 | 39 |
| 36 | 23 |
| 37 | 43 |
| 38 | 49 |
| 39 | 82 |
| 40 | 28 |
| 41 | 52 |
| 42 | 56 |
| 43 | 89 |
| 44 | 64 |
| 45 | 99 |
| 46 | 103 |
| 47 | 155 |
| 48 | 33 |
| 49 | 57 |
| 50 | 67 |
| 51 | 101 |
| 52 | 72 |
| 53 | 109 |
| 54 | 116 |
| 55 | 165 |
| 56 | 79 |
| 57 | 118 |
| 58 | 126 |
| 59 | 178 |
| 60 | 131 |
| 61 | 187 |
| 62 | 199 |
| 63 | 266 |
| 64 | 9 |
| 65 | 18 |
| 66 | 26 |
| 67 | 51 |
| 68 | 29 |

TABLE Z5-continued

| with a sequence length of 512: | |
|---|---|
| Polarized channel sequence number | Reliability or reliability sequence number |
| 69 | 55 |
| 70 | 63 |
| 71 | 95 |
| 72 | 35 |
| 73 | 68 |
| 74 | 58 |
| 75 | 104 |
| 76 | 76 |
| 77 | 112 |
| 78 | 121 |
| 79 | 169 |
| 80 | 42 |
| 81 | 66 |
| 82 | 78 |
| 83 | 117 |
| 84 | 84 |
| 85 | 124 |
| 86 | 130 |
| 87 | 183 |
| 88 | 91 |
| 89 | 133 |
| 90 | 144 |
| 91 | 193 |
| 92 | 154 |
| 93 | 205 |
| 94 | 215 |
| 95 | 286 |
| 96 | 50 |
| 97 | 81 |
| 98 | 90 |
| 99 | 129 |
| 100 | 100 |
| 101 | 137 |
| 102 | 149 |
| 103 | 202 |
| 104 | 107 |
| 105 | 150 |
| 106 | 164 |
| 107 | 210 |
| 108 | 171 |
| 109 | 225 |
| 110 | 234 |
| 111 | 300 |
| 112 | 119 |
| 113 | 167 |
| 114 | 180 |
| 115 | 227 |
| 116 | 185 |
| 117 | 235 |
| 118 | 248 |
| 119 | 313 |
| 120 | 196 |
| 121 | 252 |
| 122 | 262 |
| 123 | 324 |
| 124 | 273 |
| 125 | 334 |
| 126 | 347 |
| 127 | 407 |
| 128 | 15 |
| 129 | 25 |
| 130 | 30 |
| 131 | 65 |
| 132 | 38 |
| 133 | 71 |
| 134 | 74 |
| 135 | 120 |
| 136 | 46 |
| 137 | 77 |
| 138 | 85 |
| 139 | 128 |
| 140 | 92 |
| 141 | 136 |
| 142 | 140 |
| 143 | 201 |

TABLE Z5-continued with a sequence length of 512:

| Polarized channel sequence number | Reliability or reliability sequence number |
|---|---|
| 144 | 53 |
| 145 | 86 |
| 146 | 94 |
| 147 | 138 |
| 148 | 102 |
| 149 | 148 |
| 150 | 161 |
| 151 | 212 |
| 152 | 111 |
| 153 | 162 |
| 154 | 168 |
| 155 | 221 |
| 156 | 182 |
| 157 | 232 |
| 158 | 246 |
| 159 | 309 |
| 160 | 60 |
| 161 | 98 |
| 162 | 108 |
| 163 | 153 |
| 164 | 113 |
| 165 | 163 |
| 166 | 173 |
| 167 | 228 |
| 168 | 127 |
| 169 | 179 |
| 170 | 186 |
| 171 | 237 |
| 172 | 195 |
| 173 | 251 |
| 174 | 259 |
| 175 | 323 |
| 176 | 139 |
| 177 | 190 |
| 178 | 203 |
| 179 | 254 |
| 180 | 211 |
| 181 | 269 |
| 182 | 275 |
| 183 | 332 |
| 184 | 226 |
| 185 | 281 |
| 186 | 294 |
| 187 | 345 |
| 188 | 304 |
| 189 | 356 |
| 190 | 372 |
| 191 | 408 |
| 192 | 62 |
| 193 | 110 |
| 194 | 123 |
| 195 | 174 |
| 196 | 135 |
| 197 | 184 |
| 198 | 194 |
| 199 | 253 |
| 200 | 143 |
| 201 | 197 |
| 202 | 206 |
| 203 | 265 |
| 204 | 216 |
| 205 | 274 |
| 206 | 285 |
| 207 | 342 |
| 208 | 159 |
| 209 | 213 |
| 210 | 222 |
| 211 | 279 |
| 212 | 236 |
| 213 | 293 |
| 214 | 302 |
| 215 | 358 |
| 216 | 242 |
| 217 | 306 |
| 218 | 315 |

TABLE Z5-continued with a sequence length of 512:

| Polarized channel sequence number | Reliability or reliability sequence number |
|---|---|
| 219 | 365 |
| 220 | 326 |
| 221 | 377 |
| 222 | 387 |
| 223 | 434 |
| 224 | 172 |
| 225 | 229 |
| 226 | 239 |
| 227 | 296 |
| 228 | 255 |
| 229 | 308 |
| 230 | 317 |
| 231 | 369 |
| 232 | 272 |
| 233 | 322 |
| 234 | 333 |
| 235 | 382 |
| 236 | 346 |
| 237 | 390 |
| 238 | 398 |
| 239 | 443 |
| 240 | 284 |
| 241 | 337 |
| 242 | 348 |
| 243 | 393 |
| 244 | 355 |
| 245 | 404 |
| 246 | 412 |
| 247 | 458 |
| 248 | 370 |
| 249 | 415 |
| 250 | 422 |
| 251 | 453 |
| 252 | 429 |
| 253 | 460 |
| 254 | 469 |
| 255 | 491 |
| 256 | 20 |
| 257 | 36 |
| 258 | 40 |
| 259 | 83 |
| 260 | 47 |
| 261 | 87 |
| 262 | 96 |
| 263 | 147 |
| 264 | 48 |
| 265 | 97 |
| 266 | 105 |
| 267 | 156 |
| 268 | 114 |
| 269 | 170 |
| 270 | 175 |
| 271 | 244 |
| 272 | 59 |
| 273 | 106 |
| 274 | 115 |
| 275 | 176 |
| 276 | 125 |
| 277 | 181 |
| 278 | 189 |
| 279 | 245 |
| 280 | 132 |
| 281 | 188 |
| 282 | 200 |
| 283 | 261 |
| 284 | 214 |
| 285 | 271 |
| 286 | 276 |
| 287 | 331 |
| 288 | 61 |
| 289 | 122 |
| 290 | 134 |
| 291 | 177 |
| 292 | 145 |
| 293 | 191 |

TABLE Z5-continued with a sequence length of 512:

| Polarized channel sequence number | Reliability or reliability sequence number |
|---|---|
| 294 | 204 |
| 295 | 270 |
| 296 | 152 |
| 297 | 209 |
| 298 | 217 |
| 299 | 277 |
| 300 | 224 |
| 301 | 291 |
| 302 | 298 |
| 303 | 354 |
| 304 | 151 |
| 305 | 223 |
| 306 | 231 |
| 307 | 290 |
| 308 | 241 |
| 309 | 303 |
| 310 | 311 |
| 311 | 366 |
| 312 | 257 |
| 313 | 319 |
| 314 | 327 |
| 315 | 376 |
| 316 | 336 |
| 317 | 386 |
| 318 | 395 |
| 319 | 439 |
| 320 | 70 |
| 321 | 141 |
| 322 | 146 |
| 323 | 207 |
| 324 | 158 |
| 325 | 220 |
| 326 | 230 |
| 327 | 287 |
| 328 | 166 |
| 329 | 233 |
| 330 | 238 |
| 331 | 301 |
| 332 | 249 |
| 333 | 312 |
| 334 | 321 |
| 335 | 374 |
| 336 | 198 |
| 337 | 247 |
| 338 | 256 |
| 339 | 314 |
| 340 | 267 |
| 341 | 325 |
| 342 | 335 |
| 343 | 384 |
| 344 | 283 |
| 345 | 338 |
| 346 | 350 |
| 347 | 392 |
| 348 | 359 |
| 349 | 403 |
| 350 | 413 |
| 351 | 450 |
| 352 | 219 |
| 353 | 264 |
| 354 | 278 |
| 355 | 330 |
| 356 | 289 |
| 357 | 344 |
| 358 | 352 |
| 359 | 399 |
| 360 | 299 |
| 361 | 357 |
| 362 | 363 |
| 363 | 406 |
| 364 | 373 |
| 365 | 417 |
| 366 | 426 |
| 367 | 459 |
| 368 | 316 |

TABLE Z5-continued with a sequence length of 512:

| Polarized channel sequence number | Reliability or reliability sequence number |
|---|---|
| 369 | 371 |
| 370 | 378 |
| 371 | 423 |
| 372 | 385 |
| 373 | 430 |
| 374 | 419 |
| 375 | 461 |
| 376 | 396 |
| 377 | 437 |
| 378 | 444 |
| 379 | 470 |
| 380 | 447 |
| 381 | 478 |
| 382 | 482 |
| 383 | 495 |
| 384 | 75 |
| 385 | 157 |
| 386 | 160 |
| 387 | 240 |
| 388 | 192 |
| 389 | 250 |
| 390 | 258 |
| 391 | 318 |
| 392 | 208 |
| 393 | 260 |
| 394 | 268 |
| 395 | 329 |
| 396 | 282 |
| 397 | 340 |
| 398 | 349 |
| 399 | 401 |
| 400 | 218 |
| 401 | 280 |
| 402 | 288 |
| 403 | 341 |
| 404 | 295 |
| 405 | 353 |
| 406 | 361 |
| 407 | 409 |
| 408 | 307 |
| 409 | 364 |
| 410 | 368 |
| 411 | 416 |
| 412 | 383 |
| 413 | 425 |
| 414 | 433 |
| 415 | 465 |
| 416 | 243 |
| 417 | 292 |
| 418 | 297 |
| 419 | 360 |
| 420 | 310 |
| 421 | 367 |
| 422 | 379 |
| 423 | 420 |
| 424 | 328 |
| 425 | 380 |
| 426 | 388 |
| 427 | 432 |
| 428 | 397 |
| 429 | 428 |
| 430 | 441 |
| 431 | 471 |
| 432 | 343 |
| 433 | 391 |
| 434 | 402 |
| 435 | 438 |
| 436 | 410 |
| 437 | 446 |
| 438 | 452 |
| 439 | 475 |
| 440 | 418 |
| 441 | 456 |
| 442 | 455 |
| 443 | 481 |

TABLE Z5-continued

| with a sequence length of 512: | |
|---|---|
| Polarized channel sequence number | Reliability or reliability sequence number |
| 444 | 462 |
| 445 | 484 |
| 446 | 487 |
| 447 | 501 |
| 448 | 263 |
| 449 | 305 |
| 450 | 320 |
| 451 | 381 |
| 452 | 339 |
| 453 | 389 |
| 454 | 394 |
| 455 | 436 |
| 456 | 351 |
| 457 | 400 |
| 458 | 405 |
| 459 | 445 |
| 460 | 414 |
| 461 | 448 |
| 462 | 454 |
| 463 | 477 |
| 464 | 362 |
| 465 | 411 |
| 466 | 421 |
| 467 | 451 |
| 468 | 427 |
| 469 | 457 |
| 470 | 463 |
| 471 | 485 |
| 472 | 435 |
| 473 | 467 |
| 474 | 468 |
| 475 | 488 |
| 476 | 474 |
| 477 | 492 |
| 478 | 494 |
| 479 | 504 |
| 480 | 375 |
| 481 | 424 |
| 482 | 431 |
| 483 | 464 |
| 484 | 440 |
| 485 | 466 |
| 486 | 473 |
| 487 | 489 |
| 488 | 442 |
| 489 | 472 |
| 490 | 476 |
| 491 | 493 |
| 492 | 480 |
| 493 | 496 |
| 494 | 499 |
| 495 | 506 |
| 496 | 449 |
| 497 | 479 |
| 498 | 483 |
| 499 | 497 |
| 500 | 486 |
| 501 | 500 |
| 502 | 498 |
| 503 | 507 |
| 504 | 490 |
| 505 | 502 |
| 506 | 503 |
| 507 | 508 |
| 508 | 505 |
| 509 | 509 |
| 510 | 510 |
| 511 | 511 |

Sequence Z6, with a sequence length of 256:

[0, 1, 2, 7, 3, 8, 11, 23, 4, 10, 13, 26, 16, 31, 33, 62, 5, 12, 14, 30, 19, 35, 42, 65, 21, 41, 38, 71, 49, 77, 82, 120, 6, 17, 20, 37, 22, 40, 44, 73, 27, 47, 51, 78, 57, 86, 90, 128, 32, 52, 60, 88, 64, 94, 99, 134, 70, 101, 107, 142, 112, 150, 157, 193, 9, 18, 25, 46, 28, 50, 56, 84, 34, 61, 53, 91, 67, 97, 10 4, 137, 39, 59, 69, 100, 74, 106, 111, 146, 80, 113, 122, 152, 127, 161, 167, 203, 45, 72, 79, 110, 87, 116, 124, 159, 92, 125, 133, 163, 138, 171, 177, 207, 102, 135, 144, 173, 148, 178, 184, 213, 155, 186, 191, 218, 196, 222, 227, 243, 15, 24, 29, 58, 36, 63, 66, 103, 43, 68, 75, 109, 81, 115, 119, 158, 48, 76, 83, 117, 89, 123, 130, 165, 96, 131, 136, 169, 145, 176, 183, 212, 54, 85, 93, 126, 98, 132, 140, 174, 108, 143, 149, 180, 154, 185, 190, 217, 118, 151, 160, 188, 164, 194, 198, 220, 172, 20 0, 205, 225, 209, 230, 235, 244, 55, 95, 105, 141, 114, 147, 153, 187, 121, 156, 162, 192, 168, 197, 202, 224, 129, 166, 170, 199, 179, 204, 208, 231, 182, 210, 214, 232, 219, 236, 238, 249, 139, 17 5, 181, 206, 189, 211, 215, 233, 195, 216, 221, 237, 226, 239, 241, 250, 201, 223, 228, 240, 229, 2 42, 245, 252, 234, 246, 247, 251, 248, 253, 254, 255]

TABLE Z6

| with a sequence length of 256: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 11 |
| 7 | 23 |
| 8 | 4 |
| 9 | 10 |
| 10 | 13 |
| 11 | 26 |
| 12 | 16 |
| 13 | 31 |
| 14 | 33 |
| 15 | 62 |
| 16 | 5 |
| 17 | 12 |
| 18 | 14 |
| 19 | 30 |
| 20 | 19 |
| 21 | 35 |
| 22 | 42 |
| 23 | 65 |
| 24 | 21 |
| 25 | 41 |
| 26 | 38 |
| 27 | 71 |
| 28 | 49 |
| 29 | 77 |
| 30 | 82 |
| 31 | 120 |
| 32 | 6 |
| 33 | 17 |
| 34 | 20 |
| 35 | 37 |
| 36 | 22 |
| 37 | 40 |
| 38 | 44 |
| 39 | 73 |
| 40 | 27 |
| 41 | 47 |
| 42 | 51 |
| 43 | 78 |
| 44 | 57 |
| 45 | 86 |
| 46 | 90 |
| 47 | 128 |
| 48 | 32 |
| 49 | 52 |
| 50 | 60 |
| 51 | 88 |

TABLE Z6-continued

| with a sequence length of 256: | |
|---|---|
| Polarized channel sequence number | Reliability or reliability sequence number |
| 52 | 64 |
| 53 | 94 |
| 54 | 99 |
| 55 | 134 |
| 56 | 70 |
| 57 | 101 |
| 58 | 107 |
| 59 | 142 |
| 60 | 112 |
| 61 | 150 |
| 62 | 157 |
| 63 | 193 |
| 64 | 9 |
| 65 | 18 |
| 66 | 25 |
| 67 | 46 |
| 68 | 28 |
| 69 | 50 |
| 70 | 56 |
| 71 | 84 |
| 72 | 34 |
| 73 | 61 |
| 74 | 53 |
| 75 | 91 |
| 76 | 67 |
| 77 | 97 |
| 78 | 104 |
| 79 | 137 |
| 80 | 39 |
| 81 | 59 |
| 82 | 69 |
| 83 | 100 |
| 84 | 74 |
| 85 | 106 |
| 86 | 111 |
| 87 | 146 |
| 88 | 80 |
| 89 | 113 |
| 90 | 122 |
| 91 | 152 |
| 92 | 127 |
| 93 | 161 |
| 94 | 167 |
| 95 | 203 |
| 96 | 45 |
| 97 | 72 |
| 98 | 79 |
| 99 | 110 |
| 100 | 87 |
| 101 | 116 |
| 102 | 124 |
| 103 | 159 |
| 104 | 92 |
| 105 | 125 |
| 106 | 133 |
| 107 | 163 |
| 108 | 138 |
| 109 | 171 |
| 110 | 177 |
| 111 | 207 |
| 112 | 102 |
| 113 | 135 |
| 114 | 144 |
| 115 | 173 |
| 116 | 148 |
| 117 | 178 |
| 118 | 184 |
| 119 | 213 |
| 120 | 155 |
| 121 | 186 |
| 122 | 191 |
| 123 | 218 |
| 124 | 196 |
| 125 | 222 |
| 126 | 227 |
| 127 | 243 |
| 128 | 15 |
| 129 | 24 |
| 130 | 29 |
| 131 | 58 |
| 132 | 36 |
| 133 | 63 |
| 134 | 66 |
| 135 | 103 |
| 136 | 43 |
| 137 | 68 |
| 138 | 75 |
| 139 | 109 |
| 140 | 81 |
| 141 | 115 |
| 142 | 119 |
| 143 | 158 |
| 144 | 48 |
| 145 | 76 |
| 146 | 83 |
| 147 | 117 |
| 148 | 89 |
| 149 | 123 |
| 150 | 130 |
| 151 | 165 |
| 152 | 96 |
| 153 | 131 |
| 154 | 136 |
| 155 | 169 |
| 156 | 145 |
| 157 | 176 |
| 158 | 183 |
| 159 | 212 |
| 160 | 54 |
| 161 | 85 |
| 162 | 93 |
| 163 | 126 |
| 164 | 98 |
| 165 | 132 |
| 166 | 140 |
| 167 | 174 |
| 168 | 108 |
| 169 | 143 |
| 170 | 149 |
| 171 | 180 |
| 172 | 154 |
| 173 | 185 |
| 174 | 190 |
| 175 | 217 |
| 176 | 118 |
| 177 | 151 |
| 178 | 160 |
| 179 | 188 |
| 180 | 164 |
| 181 | 194 |
| 182 | 198 |
| 183 | 220 |
| 184 | 172 |
| 185 | 200 |
| 186 | 205 |
| 187 | 225 |
| 188 | 209 |
| 189 | 230 |
| 190 | 235 |
| 191 | 244 |
| 192 | 55 |
| 193 | 95 |
| 194 | 105 |
| 195 | 141 |
| 196 | 114 |
| 197 | 147 |
| 198 | 153 |
| 199 | 187 |
| 200 | 121 |
| 201 | 156 |

TABLE Z6-continued

| with a sequence length of 256: | |
|---|---|
| Polarized channel sequence number | Reliability or reliability sequence number |
| 202 | 162 |
| 203 | 192 |
| 204 | 168 |
| 205 | 197 |
| 206 | 202 |
| 207 | 224 |
| 208 | 129 |
| 209 | 166 |
| 210 | 170 |
| 211 | 199 |
| 212 | 179 |
| 213 | 204 |
| 214 | 208 |
| 215 | 231 |
| 216 | 182 |
| 217 | 210 |
| 218 | 214 |
| 219 | 232 |
| 220 | 219 |
| 221 | 236 |
| 222 | 238 |
| 223 | 249 |
| 224 | 139 |
| 225 | 175 |
| 226 | 181 |
| 227 | 206 |
| 228 | 189 |
| 229 | 211 |
| 230 | 215 |
| 231 | 233 |
| 232 | 195 |
| 233 | 216 |
| 234 | 221 |
| 235 | 237 |
| 236 | 226 |
| 237 | 239 |
| 238 | 241 |
| 239 | 250 |
| 240 | 201 |
| 241 | 223 |
| 242 | 228 |
| 243 | 240 |
| 244 | 229 |
| 245 | 242 |
| 246 | 245 |
| 247 | 252 |
| 248 | 234 |
| 249 | 246 |
| 250 | 247 |
| 251 | 251 |
| 252 | 248 |
| 253 | 253 |
| 254 | 254 |
| 255 | 255 |

Sequence Z7, with a sequence length of 128:

[0, 1, 2, 7, 3, 8, 11, 22, 4, 10, 13, 24, 15, 28, 30, 53, 5, 12, 14, 27, 18, 32, 38, 55, 20, 37, 34, 59, 43, 63, 67, 89, 6, 16, 19, 33, 21, 36, 39, 61, 25, 42, 45, 64, 49, 69, 72, 94, 29, 46, 51, 71, 54, 75, 77, 96, 58, 79, 83, 100, 86, 104, 107, 119, 9, 17, 23, 41, 26, 44, 48, 68, 31, 52, 47, 73, 56, 76, 81, 98, 35, 5 0, 57, 78, 62, 82, 85, 102, 66, 87, 90, 105, 93, 109, 111, 121, 40, 60, 65, 84, 70, 88, 91, 108, 74, 92, 9 5, 110, 99, 112, 114, 122, 80, 97, 101, 113, 103, 115, 116, 123, 106, 117, 118, 124, 120, 125, 126, 1 27]

TABLE Z7

| with a sequence length of 128: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 11 |
| 7 | 22 |
| 8 | 4 |
| 9 | 10 |
| 10 | 13 |
| 11 | 24 |
| 12 | 15 |
| 13 | 28 |
| 14 | 30 |
| 15 | 53 |
| 16 | 5 |
| 17 | 12 |
| 18 | 14 |
| 19 | 27 |
| 20 | 18 |
| 21 | 32 |
| 22 | 38 |
| 23 | 55 |
| 24 | 20 |
| 25 | 37 |
| 26 | 34 |
| 27 | 59 |
| 28 | 43 |
| 29 | 63 |
| 30 | 67 |
| 31 | 89 |
| 32 | 6 |
| 33 | 16 |
| 34 | 19 |
| 35 | 33 |
| 36 | 21 |
| 37 | 36 |
| 38 | 39 |
| 39 | 61 |
| 40 | 25 |
| 41 | 42 |
| 42 | 45 |
| 43 | 64 |
| 44 | 49 |
| 45 | 69 |
| 46 | 72 |
| 47 | 94 |
| 48 | 29 |
| 49 | 46 |
| 50 | 51 |
| 51 | 71 |
| 52 | 54 |
| 53 | 75 |
| 54 | 77 |
| 55 | 96 |
| 56 | 58 |
| 57 | 79 |
| 58 | 83 |
| 59 | 100 |
| 60 | 86 |
| 61 | 104 |
| 62 | 107 |
| 63 | 119 |
| 64 | 9 |
| 65 | 17 |
| 66 | 23 |
| 67 | 41 |
| 68 | 26 |
| 69 | 44 |
| 70 | 48 |
| 71 | 68 |
| 72 | 31 |
| 73 | 52 |
| 74 | 47 |

TABLE Z7-continued

| with a sequence length of 128: | |
|---|---|
| Polarized channel sequence number | Reliability or reliability sequence number |
| 75 | 73 |
| 76 | 56 |
| 77 | 76 |
| 78 | 81 |
| 79 | 98 |
| 80 | 35 |
| 81 | 50 |
| 82 | 57 |
| 83 | 78 |
| 84 | 62 |
| 85 | 82 |
| 86 | 85 |
| 87 | 102 |
| 88 | 66 |
| 89 | 87 |
| 90 | 90 |
| 91 | 105 |
| 92 | 93 |
| 93 | 109 |
| 94 | 111 |
| 95 | 121 |
| 96 | 40 |
| 97 | 60 |
| 98 | 65 |
| 99 | 84 |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z8, with a sequence length of 64:
[0, 1, 2, 7, 3, 8, 10, 20, 4, 9, 12, 21, 14, 24, 26, 40, 5, 11, 13, 23, 16, 27, 32, 42, 18, 31, 29, 4 4, 35, 46, 48, 57, 6, 15, 17, 28, 19, 30, 33, 45, 22, 34, 36, 47, 38, 49, 51, 58, 25, 37, 39, 50, 41, 52, 53, 5 9, 43, 54, 55, 60, 56, 61, 62, 63]

TABLE Z8

| with a sequence length of 64: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 10 |
| 7 | 20 |
| 8 | 4 |
| 9 | 9 |
| 10 | 12 |
| 11 | 21 |
| 12 | 14 |
| 13 | 24 |
| 14 | 26 |
| 15 | 40 |
| 16 | 5 |
| 17 | 11 |
| 18 | 13 |
| 19 | 23 |
| 20 | 16 |
| 21 | 27 |
| 22 | 32 |
| 23 | 42 |
| 24 | 18 |
| 25 | 31 |
| 26 | 29 |
| 27 | 44 |
| 28 | 35 |
| 29 | 46 |
| 30 | 48 |
| 31 | 57 |
| 32 | 6 |
| 33 | 15 |
| 34 | 17 |
| 35 | 28 |
| 36 | 19 |
| 37 | 30 |
| 38 | 33 |
| 39 | 45 |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 41 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Second group of sequences (obtained by expanding a sequence of a mother code length 128 based on a channel capacity):

Sequence Q9, with a sequence length of 8192:
[0, 1, 2, 4, 8, 16, 32, 128, 256, 512, 1024, 2048, 4096, 3, 5, 64, 9, 6, 17, 10, 18, 12, 33, 12 9, 65, 20, 34, 24, 257, 36, 7, 66, 11, 40, 130, 513, 68, 19, 13, 48, 14, 1025, 72, 258, 132, 21, 35, 2049, 26, 80, 37, 136, 25, 4097, 22, 514, 260, 38, 96, 144, 67, 41, 28, 69, 160, 264, 42, 49, 1026, 74, 516, 70, 131, 44, 272, 81, 50, 133, 73, 15, 52, 2050, 288, 520, 192, 23, 76, 137, 1028, 82, 56, 384, 27, 40 98, 134, 97, 528, 39, 259, 145, 84, 29, 138, 43, 261, 1032, 544, 98, 2052, 146, 88, 30, 320, 140, 71, 45, 640, 161, 265, 100, 51, 1040, 193, 46, 262, 768, 75, 148, 4100, 104, 273, 162, 2056, 53, 77, 51 5, 152, 1056, 266, 54, 164, 83, 274, 517, 57, 135, 112, 268, 194, 1152, 78, 576, 2064, 139, 289, 85, 58, 168, 4104, 385, 521, 99, 1280, 196, 321, 86, 147, 518, 60, 276, 141, 2080, 89, 290, 1536, 176, 529, 101, 31, 280, 142, 90, 522, 292, 1027, 4112, 200, 102, 263, 2176, 530, 149, 105, 163, 322, 9 2, 1029, 524, 47, 267, 106, 154, 545, 296, 55, 2304, 208, 1088, 386, 641, 4128, 113, 165, 324, 15 3, 79, 1033, 577, 275, 150, 108, 2560, 532, 269, 166, 59, 1030, 304, 546, 224, 114, 270, 195, 536, 4224, 1041, 328, 3072, 87, 169, 388, 769, 116, 156, 1034, 277, 548, 197, 291, 61, 2051, 170, 519, 1042, 282, 91, 4352, 177, 578, 336, 120, 293, 1036, 202, 523, 2053, 198, 392, 62, 552, 1057, 28 1, 172, 278, 642, 103, 4608, 209, 2112, 294, 1153, 580, 178, 352, 93, 531, 201, 1089, 400, 107, 2 057, 525, 323, 143, 1044, 297, 5120, 560, 180, 94, 284, 526, 1058, 2054, 151, 325, 204, 584, 416, 109, 1048, 770, 298, 210, 2065, 6144, 184, 644, 1281, 305, 115, 330, 533, 155, 1060, 326, 2058, 547, 225, 387, 110, 538, 1031, 4099, 300, 167, 592, 337, 2066, 212, 1090, 306, 549, 117, 157, 6 48, 1035, 389, 2060, 171, 4101, 329, 537, 118, 1064, 271, 534, 226, 308, 2081, 1154, 772, 216, 4 48, 550, 121, 1537, 4160, 279, 158, 2177, 608, 332, 199, 1092, 656, 393, 173, 579, 1043, 2113, 1 22, 228, 553, 4105, 338, 1037, 179, 540, 312, 2068, 174, 581, 1072, 283, 63, 390, 672, 1038, 410 2, 203, 2082, 353, 776, 232, 1096, 295, 554, 124, 401, 2072, 1282, 561, 340, 586, 4113, 181, 285, 1156, 2305, 582, 205, 394, 643, 1045, 182, 299, 556, 2084, 4106, 211, 1059, 354, 784, 95, 1050, 402, 593, 2055, 185, 344, 1104, 562, 240, 4114, 286, 645, 2114, 1061, 206, 585, 396, 327, 1160, 527, 2059, 111, 301, 4108, 1049, 564, 213, 800, 417, 2088, 1046, 186, 704, 356, 227, 1538, 535, 4129, 2178, 307, 588, 1284, 449, 214, 649, 302, 2561, 1062, 119, 594, 4225, 331, 1120, 568, 18 8, 2116, 404, 896, 1168, 360, 217, 539, 1091, 2067, 4161, 418, 646, 229, 1065, 309, 609, 2061, 3 33, 551, 1052, 159, 408, 4116, 771, 1093, 2096, 123, 657, 310, 1184, 218, 596, 2062, 420, 4130, 1288, 541, 339, 650, 1066, 3073, 230, 313, 555, 1073, 391, 773, 4120, 233, 2120, 1098, 368, 61 0, 220, 1540, 658, 2306, 450, 334, 4353, 1094, 600, 175, 542, 2180, 1155, 395, 832, 125, 1068, 2 069, 4132, 341, 652, 314, 1296, 583, 234, 2083, 557, 1105, 424, 673, 4103, 355, 1074, 2074, 18 3, 777, 452, 1157, 612, 342, 2128, 4162, 563, 1097, 241, 403, 705, 2085, 1039, 207, 558, 1076, 3 16, 4107, 774, 2184, 397, 1312, 587, 236, 345, 2073, 1544, 660, 4136, 432, 1216, 616, 187, 207 0, 785, 1047, 357, 674, 287, 4226, 2562, 1100, 565, 126, 1161, 589, 2308, 398, 346, 1106, 4609, 664, 242, 1080, 2086, 778, 456, 566, 1408, 358, 2144, 4164, 676, 1051, 215, 595, 405, 2192, 11 58, 786, 361, 4115, 1121, 569, 2115, 244, 647, 1552, 419, 624, 2089, 1063, 4109, 348, 189, 780, 1283, 2076, 303, 706, 1169, 362, 4144, 590, 2117, 410, 1108, 651, 219, 1053, 2208, 801, 4110, 3 11, 1162, 597, 2312, 464, 570, 1067, 248, 680, 5121, 2090, 1285, 369, 897, 1568, 421, 2097, 61 1, 1122, 4168, 190, 708, 3074, 409, 1170, 833, 335, 1112, 2122, 4354, 598, 406, 1054, 659, 231, 2564, 1344, 572, 364, 4228, 1164, 2118, 788, 422, 221, 1095, 315, 2179, 4117, 653, 1069, 480, 601, 2092, 1664, 370, 802, 1185, 4131, 2320, 127, 688, 1289, 451, 613, 2129, 1124, 6145, 343, 543, 1075, 2098, 425, 792, 1217, 235, 4122, 2181, 654, 372, 1070, 602, 412, 2121, 1286, 804, 4 176, 222, 1792, 2063, 712, 453, 1099, 614, 2100, 4133, 317, 1172, 775, 426, 2336, 1128, 661, 2 37, 4232, 1297, 2568, 617, 675, 1186, 347, 1077, 2240, 4121, 834, 433, 1101, 604, 2071, 376, 1 539, 4118, 559, 243, 2124, 1176, 779, 458, 1290, 2185, 4610, 618, 454, 1078, 666, 3076, 318, 1 188, 808, 4356, 428, 2130, 1107, 567, 238, 2104, 1298, 4134, 720, 1541, 359, 2432, 898, 1081, 625, 465, 4192, 2075, 1159, 677, 434, 1136, 2182, 836, 4240, 245, 1292, 665, 2145, 349, 1218, 591, 1102, 4163, 2576, 457, 787, 1600, 2087, 662, 363, 4137, 1163, 620, 2307, 246, 1313, 781, 1109, 4124, 2193, 399, 678, 1082, 2132, 436, 571, 4165, 1192, 350, 2077, 1409, 816, 736, 1545, 4256, 2186, 407, 626, 1123, 2091, 249, 1220, 782, 4360, 460, 2309, 1345, 707, 840, 3080, 413 8, 1110, 365, 1171, 599, 2592, 466, 1542, 4145, 681, 2146, 440, 1084, 900, 1300, 2194, 5122, 2 50, 628, 1165, 2136, 668, 371, 1113, 4170, 789, 2078, 1314, 411, 709, 2368, 1200, 4612, 803, 15 53, 481, 2188, 573, 1125, 4166, 366, 2119, 682, 1055, 191, 2093, 1304, 4227, 794, 603, 1166, 2 688, 423, 1114, 689, 4140, 2209, 468, 1546, 848, 2313, 1316, 4368, 632, 373, 1224, 2148, 805, 1126, 413, 4177, 2099, 714, 1287, 427, 3088, 1554, 4146, 710, 904, 2241, 1173, 252, 1129, 422 9, 2094, 574, 374, 1187, 793, 2310, 1346, 4169, 684, 482, 2816, 1116, 790, 1548, 4111, 2123, 47 2, 1071, 615, 2196, 721, 4148, 1291, 377, 2152, 1130, 806, 690, 6146, 2321, 1178, 223, 1569, 2 210, 864, 414, 4384, 1320, 2101, 605, 1079, 713, 2125, 4616, 1232, 455, 912, 2563, 1410, 429, 4288, 1665, 2200, 619, 835, 1137, 3104, 4119, 378, 1189, 655, 2314, 1348, 809, 4172, 484, 210 2, 1177, 692, 1103, 2212, 4233, 435, 1601, 606, 2131, 796, 5124, 1299, 239, 2322, 1174, 663, 11 32, 4178, 2565, 837, 430, 1556, 2105, 716, 4152, 1293, 319, 2183, 1190, 928, 1083, 4480, 2160, 621, 459, 1328, 2316, 810, 4123, 1570, 722, 2242, 1248, 488, 4230, 3200, 696, 1138, 817, 212 6, 1294, 4193, 380, 1219, 2624, 627, 1560, 437, 4624, 2187, 842, 1352, 667, 2337, 4135, 1111, 247, 2133, 1193, 838, 1412, 4355, 2106, 737, 461, 1793, 2216, 4241, 899, 1140, 2433, 622, 118 0, 438, 4180, 2569, 1301, 812, 679, 2147, 4125, 1572, 467, 1221, 3328, 849, 1315, 4234, 2244, 724, 1085, 351, 2369, 4139, 1194, 818, 1543, 2134, 629, 4357, 441, 2195, 1306, 669, 1115, 256 6, 5128, 496, 1201, 2108, 901, 1602, 4640, 683, 2324, 1360, 251, 1144, 4194, 2189, 841, 630, 2 137, 1317, 6148, 462, 1226, 2338, 783, 1547, 3584, 4242, 738, 1222, 820, 2224, 1416, 4184, 36 7, 2577, 1086, 728, 1576, 4126, 2149, 960, 469, 2079, 1305, 4416, 633, 1196, 2328, 791, 1302, 4236, 2190, 442, 1666, 670, 2138, 4167, 1127, 844, 2570, 1233, 483, 4141, 1318, 2340, 711, 16 04, 3075, 4736, 905, 1202, 470, 2248, 1376, 4257, 685, 2150, 1117, 634, 375, 4361, 2311, 1555, 740, 2578, 1225, 4196, 850, 2197, 1424, 444, 1131, 4147, 2153, 691, 1549, 2211, 824, 5136, 1 347, 686, 2370, 1167, 253, 4289, 2140, 1321, 795, 3077, 1584, 4142, 575, 1204, 2572, 473, 435 8, 1118, 2095, 902, 1308, 2315, 4864, 715, 1550, 485, 2154, 1175, 4171, 865, 2202, 1349, 744, 2593, 4244, 1228, 807, 2344, 1608, 4200, 415, 1440, 2103, 636, 1133, 4369, 2256, 913, 1794, 3 136, 379, 4258, 1322, 852, 2434, 1234, 6152, 693, 2689, 1208, 474, 2161, 4149, 1668, 797, 221 3, 1329, 717, 4173, 2372, 1139, 906, 1354, 4611, 2201, 486, 1557, 2127, 694, 4248, 1179, 3081, 811, 1350, 5152, 2625, 489, 1571, 2323, 723, 4362, 1249, 866, 2198, 607, 4150, 476, 2156, 14 11, 914, 2580, 4260, 1134, 697, 2317, 1562, 4179, 431, 2214, 1324, 856, 2107, 4370, 1191, 752, 1616, 3078, 4613, 798, 1361, 2352, 254, 4153, 1236, 2594, 718, 1330, 2272, 4231, 908, 1573, 2162, 839, 4208, 1141, 2318, 381, 1181, 2243, 4364, 623, 1672, 2584, 813, 4290, 1413, 3089, 7 25, 1195, 5248, 2376, 490, 1353, 2135, 4174, 929, 1561, 698, 2217, 1142, 4672, 439, 2436, 129 5, 868, 6160, 2817, 1558, 739, 2164, 4235, 1250, 819, 2204, 1332, 4385, 497, 3082, 1796, 961, 2325, 4181, 1240, 726, 2596, 1472, 4154, 814, 2245, 1574, 463, 4264, 2339, 1145, 631, 2109, 4 481, 1303, 843, 2218, 1182, 4617, 700, 2567, 1632, 492, 4195, 3090, 1356, 1223, 2330, 5376, 9 16, 2139, 1680, 872, 2225, 4292, 1417, 729, 2626, 1197, 4417, 443, 2384, 1603, 930, 4182, 216 8, 1146, 741, 2341, 4243, 1252, 821, 3084, 1577, 4614, 382, 2250, 1362, 845, 4156, 2571, 1203, 671, 2246, 4372, 1564, 920, 2440, 1336, 4237, 498, 2110, 1198, 2600, 6176, 1605, 635, 3105, 1307, 4185, 822, 2329, 1087, 730, 4386, 2220, 1414, 932, 5632, 2326, 1696, 471, 2690, 4272, 1 227, 851, 2151, 1377, 4625, 2257, 742, 1800, 2342, 4197, 1256, 825, 3201, 1319, 4127, 500, 26 28, 1578, 903, 4376, 2226, 1148, 745, 2400, 4238, 1425, 2141, 880, 4186, 1585, 2579, 445, 136 4, 4618, 2249, 1610, 732, 3137, 4388, 1205, 962, 2448, 1309, 5123, 2155, 846, 1606, 2573, 429 6, 687, 1229, 2371, 4198, 255, 1418, 2191, 1667, 4359, 3092, 907, 1206, 2345, 6272, 637, 1323, 2608, 4626, 853, 1580, 2228, 475, 4245, 2142, 1235, 826, 2332, 4201, 1378, 1808, 2574, 746, 4259, 1119, 3106, 936, 4418, 2199, 1426, 867, 2373, 4188, 1617, 504, 2252, 5125, 1209, 2632, 1368, 695, 4620, 2464, 1586, 964, 2157, 4143, 1264, 3096, 854, 4363, 1310, 2818, 753, 1669, 4 202, 2346, 1230, 2258, 446, 4250, 1609, 2232, 915, 4641, 1420, 2692, 719, 3329, 4392, 1351, 1 551, 2353, 4151, 828, 1135, 2163, 909, 6400, 2378, 1325, 487, 4304, 2581, 1588, 748, 2203, 51 84, 1237, 3108, 1824, 4482, 857, 2374, 1441, 944, 4737, 2595, 1210, 2273, 4209, 477, 1728, 24 35, 1380, 4261, 2158, 699, 1251, 4420, 2586, 869, 1559, 3079, 4249, 799, 2348, 1331, 4175, 16 12, 2215, 638, 5129, 2640, 1473, 910, 2385, 4673, 1238, 1673, 2260, 4371, 383, 3138, 1326, 85 8, 4246, 2354, 1143, 2597, 4204, 754, 1618, 2165, 6656, 1355, 968, 2205, 1592, 4628, 2696, 87 0, 1212, 4365, 3083, 491, 2437, 4262, 1428, 1920, 2219, 727, 4155, 2377, 1384, 917, 5126, 258 5, 1241, 2166, 4400, 1563, 873, 3112, 1442, 4642, 2319, 756, 1670, 4320, 2582, 1253, 2274, 42 10, 478, 1333, 2356, 931, 4366, 3202, 1633, 860, 4291, 2820, 1357, 2264, 4632, 1575, 701, 249 6, 5137, 1183, 2598, 815, 4424, 1432, 2169, 1795, 3585, 7168, 874, 1147, 2327, 4183, 493, 220 6, 1681, 4265, 1334, 2656, 922, 4484, 2380, 1242, 731, 2247, 4865, 1620, 3140, 1444, 4212, 82 3, 2704, 1565, 4252, 2441, 976, 1363, 5130, 2221, 1674, 2627, 4373, 760, 1254, 3091, 4644, 49 9, 2170, 1337, 4293, 2276, 1579, 881, 2601, 4387, 1415, 2386, 933, 4157, 1797, 3085, 1257, 61 47, 2227, 702, 1392, 4266, 2588, 1634, 2360, 4615, 921, 2222, 1244, 5138, 494, 2629, 1682, 43 78, 3120, 1474, 847, 4187, 2331, 1358, 2111, 4273, 918, 2438, 1624, 4674, 1199, 2720, 743, 44 32, 3086, 1566, 876, 4216, 2251, 1419, 2401, 4389, 1856, 2824, 934, 5132, 1149, 2280, 1365, 4 298, 3144, 733, 1676, 2343, 4619, 501, 2602, 6149, 1338, 2172, 1607, 4294, 827, 2449, 1258, 4 488, 3330, 1581, 2609, 4158, 992, 1448, 2388, 4648, 882, 2634, 1697, 5153, 2229, 1379, 639, 4 377, 2333, 1207, 3204, 4268, 1801, 2630, 963, 4374, 1476, 2253, 502, 4738, 2442, 1636, 2691, 4199, 1366, 855, 3093, 4305, 1587, 2230, 1265, 6208, 2347, 937, 1427, 4390, 2604, 747, 2259, 5249, 1729, 3107, 1231, 4676, 884, 2402, 4274, 1582, 2832, 1340, 4448, 2143, 924, 3098, 418 9, 1798, 734, 2450, 4627, 1421, 2641, 1611, 4297, 2233, 505, 1260, 5185, 2392, 1369, 3152, 44 96, 965, 2610, 4203, 1684, 2288, 1456, 6153, 829, 2334, 1640, 4621, 2693, 1211, 3109, 4419, 9 38, 1809, 2254, 4239, 749, 2633, 5140, 1381, 2444, 1698, 4393, 2375, 859, 1311, 4656, 3208, 1 589, 2575, 4276, 945, 2159, 1150, 4190, 2349, 1613, 4380, 506, 3097, 1422, 4622, 2612, 1370, 2261, 5154, 888, 2848, 1688, 6150, 755, 2465, 4247, 1266, 3094, 1802, 4421, 2234, 970, 2752, 4300, 1480, 2404, 4680, 1590, 966, 2275, 4512, 1382, 3586, 1700, 4205, 2583, 830, 2355, 514 4, 1239, 1619, 4866, 2636, 940, 3332, 4394, 1429, 2497, 1810, 4306, 2262, 447, 6161, 2697, 13 85, 1593, 4280, 2350, 750, 3110, 4740, 1268, 2167, 5377, 1671, 2642, 871, 4401, 2379, 1443, 3 168, 4211, 1648, 977, 4426, 2616, 1372, 2236, 4629, 946, 2452, 4251, 1213, 2944, 1804, 5156, 3216, 757, 2408, 4422, 1327, 1730, 6154, 2265, 861, 2587, 4643, 1386, 3139, 4321, 1614, 246 6, 969, 4483, 2694, 1434, 2277, 4206, 1675, 508, 4634, 3113, 1243, 2357, 5127, 1825, 2657, 43 96, 875, 2381, 1335, 4263, 2599, 1621, 3100, 4688, 758, 2207, 4433, 1488, 1594, 2456, 6162, 1 272, 2819, 4308, 911, 3141, 1704, 5186, 2171, 1393, 4402, 2705, 948, 2358, 4645, 1921, 3232, 4213, 1445, 2266, 862, 4253, 1635, 2644, 4744, 1214, 2468, 919, 5131, 3336, 1732, 4485, 258 9, 1433, 2387, 6156, 761, 2698, 4267, 1857, 3114, 1359, 4425, 2278, 479, 4633, 2361, 1622, 26 03, 4214, 1430, 972, 5160, 3121, 1683, 2439, 4367, 1255, 2821, 4630, 877, 2281, 1596, 4322, 3 146, 1388, 4404, 2416, 978, 6177, 2658, 1812, 2268, 5250, 1446, 3588, 4868, 1245, 2706, 952, 4312, 2498, 1339, 4544, 2382, 1677, 762, 4646, 3142, 1504, 4217, 2648, 1625, 5633, 2223, 88 3, 2590, 4375, 1394, 3203, 4254, 1826, 2443, 923, 6273, 2880, 1151, 4704, 2173, 1712, 4428, 3 116, 993, 2389, 4295, 1475, 2700, 5188, 1637, 2362, 1367, 4752, 3344, 495, 4489, 2631, 1567, 4269, 2282, 1449, 2605, 4675, 878, 3153, 5139, 1816, 2472, 6209, 1259, 2721, 703, 4218, 240 3, 1678, 4324, 3122, 1396, 4649, 2231, 935, 2825, 4434, 1626, 2500, 5133, 1436, 3205, 4275, 1 828, 2660, 980, 4636, 2390, 1246, 4408, 2611, 1736, 6164, 3145, 885, 2289, 4270, 1477, 2451, 4677, 1638, 2753, 5168, 1341, 3087, 4379, 925, 2255, 1799, 4159, 2606, 1450, 4486, 3124, 93 9, 4768, 2364, 1685, 2822, 5134, 1261, 2445, 4299, 764, 3360, 6178, 1641, 2635, 4449, 1699, 2 284, 1371, 4872, 2393, 503, 4328, 3592, 1858, 5192, 2708, 1457, 4391, 2480, 886, 3264, 4650, 1628, 2664, 4220, 1400, 2235, 4497, 1583, 2833, 6168, 994, 3095, 5378, 1267, 2405, 1803, 46 57, 2722, 984, 4436, 2335, 1482, 4682, 3148, 1642, 4277, 2613, 1478, 2174, 4381, 889, 3209, 5 252, 1690, 2637, 6401, 1342, 2446, 4678, 735, 2394, 4301, 1832, 3154, 4490, 1452, 2712, 159 1, 4739, 2290, 926, 5141, 1262, 1744, 4278, 3128, 967, 4395, 2826, 1383, 4652, 2504, 1922, 61 80, 2614, 1649, 3456, 4307, 941, 2406, 5155, 1489, 2724, 4450, 1701, 3099, 4880, 890, 2263, 4 191, 1458, 2643, 5146, 1860, 2453, 4498, 1269, 3206, 996, 4689, 2834, 1689, 6151, 2409, 137 3, 4281, 3169, 1615, 4440, 2617, 507, 5200, 2292, 1481, 4658, 2695, 1811, 4336, 3600, 947, 43 82, 2467, 1686, 4741, 2672, 1387, 3111, 6210, 1644, 2396, 5157, 751, 2237, 4302, 1270, 2828, 4681, 1805, 3331, 4492, 1423, 2351, 4423, 942, 2754, 5256, 1702, 3217, 4623, 1460, 2410, 61 55, 1595, 2638, 4207, 831, 2458, 4397, 1374, 3156, 5145, 1840, 2699, 4660, 971, 2267, 1760, 4 309, 3101, 1431, 4896, 2849, 1650, 4513, 2359, 1000, 6184, 3210, 1273, 5142, 2645, 1806, 42 82, 2512, 1484, 4800, 2618, 892, 4452, 3115, 1731, 4323, 2296, 1864, 5634, 2728, 1389, 4631, 3333, 949, 6274, 2417, 1623, 4403, 2945, 1490, 4684, 3616, 1705, 5380, 2469, 759, 4545, 265 9, 1464, 4310, 3170, 1924, 4745, 2238, 1274, 4398, 2756, 973, 6657, 2457, 1652, 5158, 3218, 1 692, 4215, 2881, 1395, 4690, 2383, 950, 4427, 3160, 1813, 5216, 2646, 1435, 4664, 2454, 173 3, 4284, 3102, 509, 6212, 2707, 2279, 4500, 1827, 4992, 3392, 1505, 5264, 2620, 1597, 4456, 2 412, 979, 4313, 3212, 1390, 4635, 2836, 1706, 5187, 2470, 1215, 6163, 2269, 863, 4514, 3143, 1818, 4742, 2363, 1627, 4325, 2701, 1447, 5161, 3117, 953, 4405, 2528, 1713, 4705, 2649, 37 12, 6157, 1492, 2418, 4429, 1872, 4647, 2850, 1008, 5148, 3233, 1656, 4255, 2175, 1397, 450 4, 2736, 1829, 4867, 3337, 763, 5189, 2499, 1437, 6192, 2661, 1738, 4219, 3172, 1451, 4753, 2 391, 4406, 2591, 974, 5280, 3123, 1734, 4314, 2473, 1928, 4692, 2840, 1276, 6158, 3265, 879, 4516, 2283, 1598, 5384, 2702, 1398, 4637, 2420, 4435, 1817, 3118, 4746, 2650, 1708, 5162, 2 460, 981, 7169, 3334, 1506, 4326, 2852, 1814, 4409, 2270, 4651, 1496, 3840, 5169, 954, 2760, 4487, 1639, 2501, 4869, 3147, 1745, 4329, 2662, 1401, 6216, 2365, 5194, 995, 3220, 4464, 18 30, 2823, 4706, 1714, 2474, 4316, 1247, 3176, 5636, 2709, 982, 4754, 2285, 6402, 1888, 3345, 4546, 1438, 2665, 4430, 1629, 2723, 5190, 1737, 3234, 4696, 887, 4271, 2395, 3125, 4638, 14 79, 2882, 6276, 1936, 2481, 5251, 1453, 3149, 4491, 956, 4928, 2652, 1643, 4221, 2424, 1859, 5164, 3587, 2607, 6165, 1402, 4437, 2291, 1679, 4748, 3224, 510, 4410, 2827, 1833, 5392, 25 06, 4679, 3338, 1508, 4330, 2666, 1716, 6179, 2502, 765, 4653, 3126, 5201, 1459, 2714, 4520, 1630, 2366, 4769, 3236, 1820, 4451, 2856, 5170, 1263, 2476, 6170, 985, 3155, 4279, 1687, 26 15, 4873, 1861, 4548, 2286, 3346, 5253, 1454, 2768, 4708, 1740, 3589, 4438, 997, 6224, 2407, 1343, 4659, 2946, 3129, 5193, 1952, 4337, 2673, 1645, 4499, 2513, 927, 4801, 3207, 1483, 61 81, 2725, 5135, 2482, 1834, 4303, 3184, 1746, 4654, 2884, 5172, 1512, 2293, 4412, 891, 3340, 4870, 2713, 6280, 1720, 2397, 4493, 1841, 3266, 5408, 1404, 4683, 2639, 3150, 4332, 1651, 2 505, 4441, 986, 6169, 2835, 1461, 5640, 3648, 1866, 4756, 2710, 2411, 4528, 1691, 5312, 321 1, 1271, 4712, 2668, 4283, 998, 2294, 6166, 3361, 1862, 4881, 2829, 5143, 1761, 3157, 4453, 1 485, 2447, 4770, 1923, 4383, 2726, 3130, 6658, 1001, 2484, 5196, 1646, 4661, 2619, 1462, 42 22, 3240, 2398, 5257, 1836, 4685, 3457, 988, 6404, 2864, 1703, 4494, 2784, 4442, 3593, 1491, 5202, 2455, 4760, 1873, 2674, 4338, 1748, 3171, 5176, 2297, 6182, 943, 3268, 4874, 1375, 45 52, 2830, 1842, 4662, 2508, 3393, 5504, 1653, 4454, 2755, 1465, 6240, 2888, 4772, 1693, 315 8, 5147, 2413, 766, 4311, 3219, 4691, 1520, 2647, 4501, 1925, 6288, 2514, 3590, 5254, 1707, 2 729, 4882, 1275, 4457, 2488, 3132, 5217, 893, 4665, 2948, 1865, 6211, 3348, 1654, 4340, 229 8, 4743, 2676, 1486, 5648, 3213, 4515, 1807, 2716, 4720, 1002, 6185, 2419, 3161, 5159, 1762, 2837, 4444, 1844, 4285, 3362, 2459, 4876, 1391, 5379, 2757, 1752, 6172, 3248, 4399, 951, 28 51, 4802, 3601, 5265, 1984, 2529, 4458, 1493, 4686, 2621, 3173, 6213, 1657, 2414, 4506, 181 5, 5204, 2730, 1466, 4747, 3103, 4315, 2239, 1009, 5149, 3352, 6304, 1694, 2842, 4897, 2651, 4407, 1868, 3214, 5258, 1507, 4693, 2471, 3162, 6408, 1735, 4560, 2737, 975, 4666, 2516, 51 63, 1929, 3594, 4344, 2896, 4776, 1494, 3364, 6186, 1709, 5381, 2680, 2421, 4465, 1658, 499 3, 3272, 1004, 5664, 2853, 4517, 3174, 1399, 6193, 2461, 4707, 1764, 2762, 5218, 3335, 4286, 1874, 2475, 4804, 1468, 7170, 3602, 2758, 4505, 1715, 5266, 2952, 511, 4929, 3221, 4431, 23 00, 1848, 5208, 3177, 6218, 1710, 2622, 4694, 2422, 4502, 1277, 3235, 5150, 1819, 4755, 284 1, 3394, 4327, 1599, 6660, 2732, 955, 5440, 2530, 4668, 3164, 4460, 1497, 2838, 5260, 1926, 6 214, 3596, 2520, 4884, 1739, 4518, 3119, 1509, 4317, 2663, 5191, 2769, 1889, 4411, 3339, 62 75, 894, 4749, 2425, 3178, 5165, 1768, 4576, 2854, 1831, 4697, 2738, 6188, 3226, 1439, 5760, 2271, 4466, 1660, 3617, 4898, 2912, 5281, 1010, 6416, 2462, 1937, 4223, 3368, 4784, 2653, 1 403, 5385, 3127, 4547, 2761, 4709, 1876, 3280, 6225, 1717, 5220, 2503, 2960, 4439, 1498, 46 39, 3458, 983, 5171, 2477, 6194, 3713, 4521, 1821, 2667, 4888, 1741, 5313, 2883, 3185, 4331, 1930, 6277, 2426, 4750, 3237, 1510, 4468, 2703, 5166, 1718, 3396, 4698, 2857, 4508, 1012, 6 217, 2532, 1835, 5382, 3225, 4900, 2740, 4318, 1513, 3151, 5888, 2483, 6159, 1747, 3649, 48 08, 1890, 4549, 2654, 5195, 2844, 1631, 4710, 3347, 6196, 1500, 2287, 4413, 3222, 5268, 957, 4871, 2711, 3180, 4522, 1938, 6432, 2885, 5224, 1721, 2478, 4757, 3604, 4333, 1455, 5393, 2 764, 3341, 6664, 1880, 4713, 2367, 4771, 1776, 3238, 5282, 2976, 4443, 767, 3131, 5173, 266 9, 6336, 1822, 4930, 2507, 1278, 4529, 3376, 5197, 2858, 4700, 1742, 3618, 6167, 2770, 4472, 1932, 5635, 3296, 1863, 4655, 2536, 4339, 2744, 6220, 987, 3186, 5272, 2865, 4875, 1405, 45 54, 3342, 1647, 5386, 2428, 6281, 3267, 4714, 1837, 2675, 4550, 3608, 5174, 1749, 4762, 248 5, 7172, 1514, 2890, 4414, 3400, 5284, 1953, 4904, 2715, 3159, 4524, 1016, 6226, 2295, 5203, 1722, 3241, 4663, 2886, 4334, 1463, 6200, 3460, 2785, 5394, 1892, 4816, 2509, 5637, 3841, 4 455, 1763, 2947, 6528, 1843, 4994, 3188, 5177, 2670, 1521, 4721, 3228, 4561, 2486, 6171, 95 8, 3349, 5255, 2860, 4773, 1985, 4530, 2727, 5232, 1750, 3620, 6278, 2515, 4932, 1838, 4341, 3269, 5388, 2897, 1487, 4761, 3363, 6241, 2772, 4445, 1655, 3133, 5314, 2399, 4687, 999, 51 98, 3242, 6672, 1867, 2866, 4553, 3591, 4883, 1724, 5696, 2677, 6183, 2489, 1516, 4758, 335 4, 4459, 2717, 5259, 1940, 4716, 3163, 1896, 6403, 2544, 4342, 3249, 5409, 1753, 4877, 2949, 3650, 5205, 1467, 6289, 2731, 4495, 3408, 4774, 989, 2299, 5178, 3192, 6228, 1954, 4532, 28 89, 4667, 2678, 1765, 5288, 3365, 4446, 1845, 6173, 2510, 5505, 3274, 1406, 4912, 2831, 483 2, 3595, 5641, 1869, 6282, 2786, 4503, 3270, 1695, 4722, 2868, 5219, 3464, 6187, 895, 4345, 2 415, 3134, 5316, 1944, 4878, 2776, 4556, 3624, 6405, 1522, 5441, 3008, 1659, 4803, 2517, 49 36, 3353, 7176, 1846, 5206, 2681, 3244, 4461, 1754, 5267, 2839, 4695, 3350, 6688, 1956, 456 2, 2490, 3714, 5638, 1003, 4777, 2718, 6242, 3175, 4536, 1495, 5180, 2892, 3281, 4996, 1875, 5396, 2531, 6290, 3366, 4346, 1766, 4724, 2759, 5261, 3652, 1849, 6232, 2953, 4764, 3250, 4 467, 1524, 5209, 2518, 4885, 3424, 1927, 6174, 2733, 5410, 3165, 4507, 1769, 4805, 2682, 64 64, 990, 5296, 2423, 3603, 4899, 1904, 5649, 2788, 4577, 3273, 6284, 1469, 4669, 2898, 5221, 3472, 1756, 4462, 2492, 6215, 3179, 4778, 1986, 5151, 2739, 4287, 3597, 6189, 1870, 2872, 5 400, 3395, 4890, 1711, 4699, 2734, 5262, 3215, 6784, 1279, 4519, 2301, 3369, 5210, 1005, 47 85, 2843, 6305, 3632, 4564, 1931, 5642, 2623, 4944, 3252, 6409, 1661, 2521, 5412, 3166, 472 8, 1877, 4469, 2950, 5320, 3356, 6244, 1499, 4901, 2763, 5222, 3598, 1850, 4509, 2533, 6195, 3223, 4810, 2913, 5383, 1770, 4523, 3397, 7184, 2792, 5650, 1960, 4806, 3276, 2855, 5000, 1 011, 6337, 3656, 5269, 2463, 4348, 1891, 5225, 3488, 6190, 2684, 4670, 1528, 4470, 3181, 52 83, 2961, 1719, 4889, 3842, 6406, 2427, 5442, 1988, 4780, 3370, 4578, 2900, 6912, 1878, 521 2, 3282, 4886, 2741, 5644, 1777, 3256, 6219, 2522, 4568, 1470, 5167, 3716, 4711, 2845, 6292, 1006, 4817, 3377, 5387, 2765, 4473, 1939, 6248, 3187, 5226, 2954, 3402, 4902, 1743, 4786, 2 534, 6417, 3605, 5274, 1852, 4319, 2742, 5665, 3227, 6306, 1933, 4960, 2859, 4510, 3398, 54 16, 1511, 6197, 2537, 4701, 3619, 1772, 5175, 2771, 4809, 3297, 6221, 1881, 5328, 2914, 455 1, 2655, 5008, 2524, 6659, 1968, 5506, 3459, 4525, 2962, 5761, 1013, 6296, 3182, 4715, 2745, 4931, 1501, 3610, 5233, 2479, 7200, 1723, 4474, 3372, 5285, 2904, 4751, 1893, 6410, 3239, 5 444, 2800, 4905, 3664, 4580, 1823, 6198, 2846, 5273, 3409, 4788, 1662, 5199, 2302, 6308, 32 84, 4531, 1934, 5697, 2766, 4702, 3378, 6227, 1407, 4892, 2956, 3621, 5395, 1882, 4335, 288 7, 6418, 3189, 5270, 2429, 4759, 1014, 5228, 3229, 6661, 2671, 4933, 1778, 4526, 3720, 5652, 2861, 6201, 1992, 4812, 3461, 5389, 2773, 4415, 3243, 6279, 1894, 5286, 2538, 5024, 3401, 5 179, 1515, 6256, 2977, 4717, 3609, 4555, 1751, 5424, 2746, 6412, 3190, 4906, 1941, 5666, 24 87, 4818, 3343, 6338, 2916, 5344, 1897, 4584, 3606, 7296, 2787, 4792, 1780, 5234, 3298, 491 3, 2867, 6222, 1017, 5390, 3380, 4476, 2545, 5315, 3844, 6720, 1502, 4723, 3009, 5656, 3288, 4533, 1955, 6283, 2774, 4938, 3520, 5448, 2862, 1884, 4763, 6433, 3622, 5207, 2511, 4343, 1 725, 6229, 3193, 5289, 2679, 4934, 1839, 5508, 3351, 6202, 2891, 4833, 3230, 4557, 1898, 58 89, 2748, 6312, 3680, 4995, 1517, 5236, 2540, 6529, 3404, 4718, 1946, 5276, 3271, 4534, 296 4, 6665, 3728, 5397, 1755, 4908, 2920, 4775, 3465, 6243, 1018, 5668, 2777, 4563, 3245, 5317, 2491, 7424, 1847, 4945, 3651, 5411, 2978, 6340, 2000, 4820, 3194, 5181, 2789, 4447, 3300, 6 465, 1784, 5290, 2869, 4914, 3625, 5639, 1523, 6230, 2430, 4725, 3410, 4537, 2893, 6291, 19 05, 5402, 3251, 4765, 2719, 5211, 1957, 6662, 4592, 3612, 5297, 2968, 6204, 3384, 4997, 172 6, 5698, 2546, 4779, 3246, 6420, 1945, 5456, 3653, 4347, 2683, 5240, 3355, 6285, 1518, 4937, 2870, 4726, 3135, 6233, 959, 5413, 2778, 4558, 3462, 5322, 2980, 6434, 1871, 4879, 3744, 25 19, 1942, 5643, 3275, 7680, 2899, 4834, 3425, 5318, 1767, 4916, 2790, 6320, 3848, 5512, 190 0, 4463, 3304, 6673, 2873, 5182, 3367, 4824, 1958, 5672, 2548, 6245, 3626, 5056, 2951, 4565, 1757, 6175, 3196, 5401, 2793, 4729, 1525, 3473, 5292, 2928, 6424, 3633, 4887, 1851, 5398, 2 493, 6286, 3412, 4538, 2016, 5762, 3658, 4766, 2780, 6234, 3253, 5223, 1906, 4940, 3010, 66 66, 3357, 5329, 2894, 4579, 1020, 5414, 3654, 6436, 2735, 4807, 1663, 5700, 3277, 7171, 230 3, 5001, 3466, 5298, 1987, 4566, 3715, 6344, 2955, 5472, 3254, 4781, 1526, 6246, 2685, 5213, 3371, 4730, 2901, 4471, 1879, 6407, 3628, 5651, 2523, 4836, 1961, 6674, 3283, 5321, 2874, 4 946, 3426, 6293, 1771, 5520, 3856, 4540, 2794, 5227, 3167, 6249, 1908, 4787, 2984, 5645, 34 74, 6307, 2915, 4920, 1948, 5443, 3665, 4782, 2552, 6466, 1758, 5263, 3257, 4349, 3416, 623 6, 2743, 5417, 1529, 4891, 3634, 7173, 3012, 5680, 3312, 4671, 991, 5300, 2902, 6668, 3358, 4 569, 2801, 5214, 1989, 6191, 3717, 4998, 3278, 5404, 1853, 6411, 2494, 4811, 3657, 5646, 29 63, 4581, 1962, 6250, 3468, 5271, 2767, 4961, 3399, 6298, 1773, 5445, 3599, 4840, 2876, 668 9, 3183, 5324, 1883, 4903, 2957, 6440, 3373, 5704, 2535, 4511, 1969, 5536, 3636, 6199, 2796, 4732, 3285, 5229, 1530, 6352, 3872, 5009, 2905, 5890, 3489, 7232, 1912, 4475, 2992, 5418, 3 258, 4948, 2525, 6530, 5330, 1779, 4789, 3776, 6785, 3428, 5304, 2747, 4570, 1994, 6257, 32 99, 5764, 2917, 4893, 3607, 6309, 1990, 5425, 2847, 4813, 3379, 6468, 3660, 5235, 1854, 500 2, 2686, 5450, 3521, 6297, 2958, 4582, 1007, 5653, 3286, 6223, 4790, 3721, 5275, 2431, 7177, 1964, 4907, 3374, 5446, 2906, 6721, 3191, 4585, 1471, 5667, 2802, 6419, 3666, 4819, 3403, 5 345, 1774, 4962, 3016, 6294, 3640, 4703, 2918, 4572, 6252, 1895, 5507, 3260, 5010, 2539, 66 76, 3476, 5230, 2001, 4793, 3968, 6413, 2775, 5658, 3432, 4527, 1970, 6310, 2965, 5420, 328 9, 4952, 3611, 6203, 5287, 1781, 4848, 2921, 5712, 3490, 7174, 2804, 4894, 1885, 5457, 3718, 6448, 3301, 4350, 2526, 5332, 1993, 6690, 3381, 4814, 5426, 2979, 6368, 3681, 5004, 1532, 5 669, 2908, 6258, 3405, 4935, 3623, 5237, 1899, 6414, 2749, 4477, 3231, 5277, 6339, 2863, 47 19, 3480, 5768, 1782, 6680, 3843, 4909, 2922, 5509, 3195, 7185, 1015, 4821, 2541, 5291, 372 9, 6472, 4586, 3382, 5449, 1935, 6231, 2970, 5025, 3290, 5657, 2779, 4794, 1972, 6313, 3668, 5238, 4535, 3492, 6532, 2871, 5391, 3613, 4964, 1886, 6913, 3024, 5654, 3411, 4835, 3722, 6 260, 1943, 5346, 4915, 2808, 6300, 3302, 5428, 2547, 4593, 1785, 7178, 3385, 5892, 3627, 50 57, 2929, 6421, 5336, 1503, 4822, 3463, 6692, 2981, 5568, 3845, 4910, 3305, 6341, 1996, 567 0, 4559, 2750, 6435, 3440, 5241, 3682, 4727, 1901, 6205, 2969, 5399, 3292, 4939, 6314, 2542, 5278, 2002, 4796, 3730, 6663, 3522, 5728, 2895, 4588, 3406, 7186, 5452, 1976, 5319, 2966, 6 426, 3672, 5012, 3247, 6235, 1786, 5776, 2791, 4968, 6321, 3614, 5513, 2924, 4825, 3467, 67 22, 1907, 5293, 3904, 4539, 6480, 2982, 5699, 3197, 5026, 1947, 6264, 3413, 5242, 2781, 483 7, 3724, 6437, 5348, 2549, 4917, 2017, 7180, 3386, 5673, 3655, 4478, 2875, 6346, 5458, 1019, 4941, 3306, 6667, 3629, 5299, 3040, 4767, 6342, 3496, 5660, 1519, 5016, 2930, 6536, 3745, 5 432, 3427, 4594, 6206, 1902, 5294, 2687, 6696, 3255, 5701, 3849, 4731, 3011, 7201, 5403, 17 27, 4918, 3524, 6425, 2550, 5183, 3684, 4826, 6316, 1959, 5510, 3414, 5028, 2903, 6422, 363 5, 5792, 3313, 4567, 6786, 2004, 5323, 2985, 4947, 3475, 6247, 2795, 5473, 6353, 3777, 4838, 1909, 5896, 3279, 6438, 2932, 5352, 4921, 3630, 7297, 1949, 5415, 3388, 4596, 2972, 6724, 5 674, 3846, 4999, 2782, 6322, 1963, 5244, 3469, 4841, 6496, 3659, 5521, 2553, 6237, 3308, 49 76, 1788, 5681, 6675, 3417, 4541, 3013, 5460, 3732, 6345, 1527, 5706, 4828, 3504, 7233, 287 7, 5301, 3688, 5058, 3259, 6544, 5405, 1910, 6251, 2986, 4942, 3857, 5702, 6669, 2797, 4783, 3429, 5325, 2018, 6467, 3746, 4351, 5514, 2907, 6287, 3359, 5763, 3637, 7188, 5003, 2008, 5 302, 2993, 6441, 3198, 4733, 3661, 5419, 6704, 2554, 4949, 1913, 5676, 3470, 6324, 4571, 34 18, 6238, 2936, 5331, 3736, 4922, 1759, 6428, 5474, 2803, 5904, 3314, 6670, 3850, 4842, 521 5, 3018, 7202, 1021, 5032, 3528, 6295, 5522, 3638, 4963, 3014, 6469, 1950, 5713, 4600, 3430, 6348, 3748, 5305, 2878, 6728, 3287, 5464, 4791, 1991, 6560, 3667, 5682, 2988, 5060, 6253, 3 477, 5360, 3858, 7192, 1965, 4950, 5406, 2495, 6914, 3433, 4849, 3641, 5765, 6442, 2798, 53 26, 1914, 6354, 3316, 4542, 5705, 3719, 6328, 2919, 5011, 3491, 5516, 6788, 2020, 4815, 369 6, 7425, 3025, 5447, 5647, 3420, 6449, 2994, 4924, 5231, 3261, 6259, 1531, 5005, 3852, 6474, 5421, 2805, 4583, 3375, 6677, 3778, 5684, 4844, 1971, 6299, 2909, 5333, 3434, 7204, 5920, 3 662, 4953, 3017, 6470, 5537, 1775, 5040, 3482, 6691, 3723, 5306, 6369, 2556, 4573, 3291, 58 24, 1966, 6531, 5476, 3873, 6254, 2923, 4795, 5347, 3383, 6682, 3669, 4965, 1855, 5655, 717 5, 2806, 4895, 3536, 6444, 3642, 5427, 5708, 3320, 6311, 2959, 4734, 6736, 1995, 5569, 3752, 5006, 3441, 6481, 5334, 2996, 5769, 3969, 6356, 4479, 2024, 7234, 3493, 5422, 2910, 4954, 6 450, 3683, 5239, 3262, 6693, 4850, 1916, 5714, 2967, 6261, 5451, 3780, 5064, 3481, 6301, 28 09, 5688, 6792, 3905, 4966, 1973, 5308, 7179, 3407, 4587, 2527, 6533, 3670, 5524, 6016, 347 8, 6315, 1783, 4823, 6473, 3020, 5480, 3731, 5013, 6681, 3303, 5337, 2925, 6262, 5659, 1997, 4969, 3644, 7208, 3436, 5538, 6415, 3026, 4852, 3860, 5766, 6678, 3494, 5349, 1974, 6370, 4 574, 3293, 5429, 3000, 6452, 5027, 3387, 7298, 3725, 5729, 4956, 1533, 6916, 2810, 5453, 35 52, 6360, 5671, 3673, 4797, 2931, 6592, 5279, 3442, 6694, 2003, 4911, 5528, 3874, 6265, 297 1, 5891, 7681, 3199, 4970, 3760, 5243, 6423, 3041, 4589, 1022, 6302, 5777, 3523, 5430, 3685, 6752, 5018, 3415, 6476, 2543, 5338, 4827, 1887, 6343, 3615, 5716, 7236, 3497, 5540, 2926, 4 919, 6800, 3864, 5661, 3307, 6537, 5072, 1977, 5459, 2751, 6317, 5770, 3726, 6723, 3444, 48 56, 5350, 2983, 7187, 3674, 4595, 6266, 2032, 5433, 3484, 6372, 5675, 3876, 4977, 3028, 669 7, 5511, 3294, 6482, 3784, 5029, 5893, 1787, 7181, 2933, 5353, 6323, 3525, 4798, 3686, 5488, 6684, 3389, 5730, 1998, 6456, 5017, 2973, 6318, 5340, 3847, 4590, 3498, 6725, 5778, 2987, 7 216, 3733, 5570, 4943, 1903, 6427, 3309, 5454, 6207, 2812, 5014, 3689, 6534, 5720, 3747, 52 95, 6816, 3419, 4839, 2005, 7182, 5662, 2551, 4972, 3906, 6347, 5515, 3505, 6497, 2934, 595 2, 6920, 3676, 5030, 1978, 5245, 6376, 3448, 5461, 7240, 3631, 4829, 3042, 5772, 6439, 3315, 4597, 3851, 6698, 5434, 2019, 6268, 5703, 3032, 4923, 3530, 6545, 5354, 3690, 7426, 3526, 5 677, 6705, 2937, 5088, 5544, 2006, 6484, 3738, 4978, 6730, 3390, 5793, 2783, 6325, 5475, 38 80, 4735, 6429, 3500, 5303, 1911, 7300, 5897, 3639, 6726, 2974, 5059, 5572, 3310, 6349, 459 8, 3792, 6538, 3015, 5732, 6787, 3431, 5462, 1980, 4951, 7189, 3970, 5683, 6326, 3697, 5361, 2989, 6443, 5033, 3537, 5523, 6700, 3749, 4843, 1534, 6355, 5825, 2938, 7203, 5327, 3506, 4 980, 3908, 6498, 5678, 3317, 6928, 5436, 3044, 6239, 1789, 5020, 7194, 3737, 5894, 4830, 34 21, 6546, 3663, 5517, 6737, 2555, 5707, 6329, 3529, 4601, 3859, 5356, 6488, 2009, 5465, 724 8, 2995, 5061, 3734, 6706, 5780, 3435, 6384, 5552, 3692, 4925, 2799, 6430, 5736, 2021, 6789, 5307, 3318, 7205, 3853, 5034, 5905, 3471, 6350, 4845, 2990, 6729, 3750, 5477, 6540, 3508, 5 794, 6471, 1951, 4955, 3643, 5407, 7304, 2879, 5685, 6671, 3422, 5041, 6255, 3888, 5246, 30 19, 6445, 5709, 1915, 4602, 7193, 3808, 5518, 3479, 6708, 5466, 3698, 6357, 4984, 3048, 694 4, 5784, 3321, 4851, 3854, 6561, 5362, 2010, 7190, 5898, 3532, 6330, 5066, 2940, 6848, 3779, 5576, 6500, 3912, 5686, 5062, 3437, 6371, 5478, 2997, 7682, 2022, 5796, 6679, 3671, 4926, 6 451, 3538, 5335, 5715, 3753, 6732, 2807, 5036, 7428, 3512, 5525, 6593, 3972, 5906, 6358, 20 25, 4543, 3322, 6793, 5481, 3021, 5689, 6446, 3700, 4846, 7206, 3740, 5364, 6263, 3443, 576 7, 2012, 6738, 4967, 2998, 6475, 5539, 3861, 7264, 5744, 3483, 5073, 3781, 6712, 5468, 2557, 6332, 5042, 3875, 6548, 5309, 1967, 7040, 5900, 3553, 7312, 3645, 4853, 6504, 3027, 5423, 5 826, 3438, 6361, 4957, 3754, 6683, 5482, 3263, 7235, 5710, 2911, 6562, 1023, 5065, 6790, 38 66, 5530, 6373, 3675, 5771, 4604, 3495, 7209, 5339, 3001, 6453, 5921, 3761, 6753, 3540, 497 1, 6477, 1790, 5431, 6695, 3920, 5717, 7196, 3056, 4854, 6303, 3704, 5584, 5690, 3445, 6552, 3877, 5368, 6915, 2811, 5007, 7237, 1917, 5800, 6267, 3485, 5489, 6801, 3786, 5044, 6454, 3 499, 6017, 7328, 3022, 5541, 6362, 3782, 4958, 3976, 5731, 6740, 2026, 5310, 6564, 3324, 50 15, 7432, 2927, 5828, 6685, 3646, 5529, 6483, 3446, 4857, 6794, 3865, 5953, 7210, 3756, 545 5, 6374, 3029, 4575, 6457, 1975, 5718, 3554, 6699, 5526, 3862, 5068, 7217, 3544, 5779, 6535, 3002, 5351, 6917, 3687, 4973, 6377, 3793, 5692, 7242, 2033, 5484, 6512, 3449, 5074, 6754, 3 043, 5908, 6364, 3878, 5542, 7684, 3762, 5341, 6802, 3295, 5048, 6594, 3030, 5435, 6478, 39 36, 5773, 1999, 4858, 7238, 3486, 5600, 6744, 3677, 5721, 6319, 3785, 4979, 6686, 2935, 549 0, 7299, 3527, 5922, 6539, 3984, 5019, 6976, 3501, 5247, 6269, 2028, 5808, 7212, 3004, 5089, 6485, 3691, 5571, 6796, 3907, 5733, 6458, 3450, 5463, 7440, 3727, 4591, 6727, 2558, 5663, 6 378, 3881, 5545, 6701, 1535, 4974, 7249, 3556, 5912, 6568, 3764, 5355, 6817, 2813, 4799, 64 99, 3507, 5774, 7218, 3678, 5492, 6327, 3868, 5031, 6921, 3311, 5722, 6596, 1979, 5532, 730 1, 3033, 5924, 6756, 3735, 5076, 6486, 3909, 5342, 6707, 5832, 3502, 7241, 4981, 3788, 6385, 5573, 3045, 6547, 5734, 3391, 6849, 5437, 1918, 7183, 5021, 4000, 6351, 5895, 3693, 6702, 5 546, 2975, 7220, 5035, 3531, 6460, 5781, 3882, 6918, 5357, 3794, 6541, 4860, 3560, 7456, 57 37, 2034, 6731, 5795, 2939, 6380, 5467, 6489, 3768, 4599, 7688, 3889, 5954, 6804, 3452, 555 3, 6576, 3699, 4982, 7360, 3034, 5724, 6760, 3509, 5496, 6331, 2007, 5679, 6929, 3914, 5090, 7191, 3739, 5363, 6501, 5899, 3319, 6818, 5080, 3046, 6431, 5578, 3910, 7244, 5738, 3809, 6 709, 5574, 3533, 6270, 4985, 3971, 7305, 5786, 2036, 6733, 5438, 6542, 3049, 4831, 6490, 36 94, 5928, 7250, 3510, 5548, 6808, 3884, 5687, 6386, 3036, 5022, 5358, 3751, 5840, 7224, 506 3, 3539, 6922, 5479, 3921, 6600, 6018, 1981, 6710, 5745, 3796, 7552, 5037, 2991, 6502, 5585, 6820, 3423, 5797, 7195, 3890, 4986, 6359, 3701, 5554, 6739, 3513, 5956, 6549, 3741, 5365, 7 302, 5092, 1791, 6930, 5785, 2814, 6505, 5469, 3568, 7265, 5711, 3973, 6713, 4603, 3755, 63 88, 5577, 6791, 3323, 5907, 7696, 2941, 5043, 6563, 3913, 5782, 6768, 3702, 5483, 7207, 574 0, 3534, 6492, 4847, 2011, 6333, 5366, 3855, 6924, 5901, 3050, 7427, 5519, 6447, 3810, 5038, 6850, 3892, 5798, 7313, 3439, 5556, 6506, 5691, 3800, 6734, 4927, 2999, 6554, 5470, 4032, 7 252, 5936, 2040, 6795, 5067, 6363, 3541, 5856, 7197, 3705, 5527, 6945, 3863, 5746, 6455, 50 96, 3514, 7306, 5369, 3057, 6741, 5902, 3742, 6608, 5580, 6714, 3916, 4988, 7211, 3555, 582 7, 6392, 1982, 5960, 6824, 5485, 3783, 7429, 5045, 3023, 6513, 5719, 3977, 7041, 5586, 7712, 3542, 5801, 6565, 3757, 4855, 6755, 5560, 3706, 7266, 6020, 3052, 6334, 5370, 3447, 6852, 5 069, 6553, 3812, 5748, 7314, 2023, 5788, 6977, 3922, 5491, 6479, 5046, 3516, 7256, 5909, 37 63, 6742, 5531, 6550, 2559, 5829, 7198, 3896, 4605, 6803, 3758, 6375, 5923, 7488, 3325, 560 1, 6716, 3867, 5693, 6508, 5075, 3647, 7308, 5486, 2013, 6932, 5802, 6566, 3003, 5311, 6365, 3545, 4959, 7239, 3974, 5914, 6459, 5723, 3787, 6797, 5543, 3557, 7213, 5049, 6624, 3937, 5 809, 6745, 2942, 7808, 5588, 6514, 3816, 5968, 6946, 3879, 5104, 7329, 5752, 1919, 6271, 54 93, 3487, 6832, 5925, 7433, 3708, 4859, 6595, 3058, 5533, 6757, 5834, 3985, 7268, 5547, 345 1, 6487, 6687, 5070, 3924, 7219, 5830, 3765, 6569, 6024, 6936, 3546, 5372, 7361, 3031, 4975, 6379, 5694, 2027, 6798, 5494, 3869, 6516, 5913, 7214, 3789, 6746, 5804, 6556, 3978, 5077, 7 430, 3558, 5602, 6948, 5910, 3766, 6366, 5592, 3060, 7936, 5050, 6856, 3883, 5735, 6597, 35 61, 7243, 5841, 6758, 3795, 5497, 6461, 5091, 3938, 7316, 5926, 2014, 6919, 5810, 6570, 367 9, 5343, 7272, 3548, 6805, 5078, 6381, 3005, 5984, 7441, 5534, 3986, 6761, 5725, 3769, 6819, 5833, 7330, 3503, 4983, 6491, 3928, 7221, 5575, 6978, 3824, 6032, 6577, 5549, 2815, 7245, 5 052, 3870, 6748, 5739, 6520, 2029, 5955, 7683, 6703, 3326, 5498, 6387, 3790, 5775, 7320, 46 06, 3980, 6923, 5929, 6602, 3911, 7434, 5604, 3035, 6762, 5812, 6598, 3453, 4861, 7222, 555 5, 3695, 6810, 5726, 6462, 3885, 7332, 5916, 3797, 6952, 5359, 6572, 3562, 5081, 7251, 5783, 2035, 6711, 5957, 4001, 6382, 7442, 5550, 3064, 6864, 5836, 7685, 3770, 5093, 6503, 5439, 3 511, 7042, 7225, 6048, 3940, 6769, 5741, 3811, 6609, 5023, 7303, 3891, 5579, 6821, 6578, 35 69, 5930, 7280, 5842, 3006, 6980, 5608, 4033, 6389, 4987, 7436, 3798, 6809, 5816, 6493, 203 0, 5937, 7362, 5500, 3886, 6735, 7246, 5747, 3535, 6601, 5082, 3703, 6931, 5557, 7744, 3047, 5962, 6806, 6507, 3915, 5787, 7307, 5367, 3772, 6764, 5094, 6390, 3564, 7457, 5958, 6925, 3 988, 5857, 7253, 5581, 3944, 6543, 6019, 3801, 6822, 7226, 5097, 3515, 6580, 5742, 6715, 20 37, 5558, 7336, 6494, 3037, 5932, 7553, 5084, 4002, 6960, 5799, 6880, 3813, 7689, 5587, 655 1, 3893, 5969, 6770, 5844, 3454, 7267, 6393, 5039, 3917, 7364, 5471, 6926, 3743, 5938, 6604, 7489, 2943, 5749, 6851, 5561, 3992, 6984, 5789, 7254, 3570, 6509, 4862, 7315, 3707, 5616, 6 743, 6021, 3894, 6610, 7686, 5803, 2038, 6825, 5371, 6584, 3802, 7228, 4989, 7044, 4004, 59 61, 7444, 5750, 3051, 6394, 6772, 5582, 3543, 7309, 5903, 6812, 3923, 5098, 6515, 7257, 381 4, 5858, 6933, 5940, 3897, 7458, 6555, 5487, 3572, 6853, 5848, 7344, 3975, 5047, 6947, 7697, 3817, 6080, 6625, 5589, 3038, 6717, 7269, 5753, 3952, 6510, 5911, 6826, 2041, 5562, 7199, 6 335, 3517, 5105, 7448, 5790, 3804, 6938, 6747, 5964, 4034, 7310, 5603, 6567, 7258, 3918, 58 31, 6833, 5071, 3759, 6612, 6025, 7690, 3327, 6992, 5590, 7460, 3053, 5805, 6776, 6517, 397 9, 5754, 7368, 5100, 3709, 6949, 7270, 5495, 3925, 6557, 5860, 6858, 7431, 3547, 5970, 6571, 5564, 3898, 7698, 6854, 5811, 2042, 7048, 4607, 7317, 3818, 6396, 5944, 7273, 5806, 4008, 6 718, 6518, 5373, 3059, 7331, 5915, 6937, 3939, 7490, 5695, 6828, 3576, 5051, 6626, 7260, 55 93, 3767, 6934, 6022, 7692, 4036, 6616, 5835, 7215, 3926, 5605, 6759, 6865, 3825, 5985, 743 5, 4990, 6521, 3518, 7274, 5864, 6950, 3054, 5927, 6834, 7322, 3987, 5535, 6367, 5756, 7713, 3791, 7008, 5106, 6558, 3900, 6033, 7464, 6749, 1983, 5499, 7223, 6857, 5972, 3981, 7376, 5 813, 6599, 3559, 7056, 5594, 7554, 3820, 5079, 6573, 7809, 5917, 3929, 6763, 5837, 6979, 40 16, 7281, 6026, 6522, 7333, 3061, 5606, 6799, 5814, 3549, 7492, 6953, 5108, 3771, 6628, 593 1, 7321, 6836, 3941, 5609, 7247, 6579, 3871, 5843, 7745, 5986, 6750, 3710, 6940, 5727, 7443, 3982, 5596, 6383, 7318, 5053, 3455, 6807, 7276, 6034, 3930, 6981, 5817, 6574, 7700, 2044, 5 551, 6860, 7437, 3062, 5976, 6463, 5872, 7334, 3826, 7072, 4863, 7227, 4040, 6765, 5918, 66 03, 5374, 3942, 7472, 6954, 5838, 7714, 3563, 6866, 6028, 7392, 3799, 5959, 6632, 6840, 508 3, 3989, 7282, 6961, 5501, 3945, 7438, 5743, 6524, 7363, 3828, 5933, 6771, 7704, 5845, 3065, 6581, 5610, 6986, 3550, 7496, 6049, 6811, 7255, 4003, 5112, 6391, 5818, 3932, 7337, 6982, 5 559, 7556, 3773, 6881, 5988, 6605, 7937, 3887, 5859, 7043, 5939, 7284, 2015, 6766, 5617, 73 24, 3946, 6582, 5054, 7445, 6956, 3565, 6081, 6823, 5846, 7716, 3994, 6611, 5934, 7365, 380 3, 6993, 5583, 7459, 6868, 3066, 5751, 7229, 6495, 5095, 3895, 7338, 5963, 6962, 7687, 4048, 5820, 6773, 6585, 5612, 3832, 7450, 6813, 6036, 3571, 7259, 5992, 6640, 7345, 3953, 5849, 7 045, 7746, 5563, 4005, 6827, 7504, 5085, 6395, 3774, 7288, 6050, 6985, 6774, 3993, 5861, 74 61, 5941, 6606, 3566, 7370, 5502, 6927, 7691, 3007, 5965, 6882, 7366, 5791, 3919, 6964, 756 0, 4991, 2031, 6511, 7230, 6040, 6872, 3990, 7720, 5618, 7104, 5755, 3815, 6613, 7449, 5942, 6777, 3948, 7340, 5850, 6935, 7446, 4006, 6052, 6586, 7810, 5099, 3805, 6814, 7271, 5591, 6 988, 3573, 7377, 5971, 6627, 7462, 3899, 5862, 6855, 7748, 5945, 4064, 7049, 7346, 5620, 66 14, 3954, 7520, 6023, 6829, 7261, 5865, 3068, 6778, 5086, 6519, 7699, 3711, 6000, 6884, 736 9, 5565, 4035, 6994, 7568, 5852, 6588, 3574, 7275, 6082, 6835, 7693, 3927, 5966, 6968, 7491, 5807, 4009, 6830, 7311, 5375, 6397, 3819, 7465, 5101, 6939, 7728, 6027, 3956, 6719, 7348, 5 757, 6617, 2039, 7262, 5973, 7046, 7452, 3996, 5595, 6859, 7694, 5946, 3806, 6629, 7319, 70 09, 5866, 7493, 3577, 6888, 6056, 7372, 6951, 3039, 5107, 7752, 6559, 5987, 4037, 7584, 678 0, 5624, 7277, 7057, 3901, 5815, 7938, 6523, 6084, 4010, 7466, 6996, 5974, 7378, 3821, 6837, 5873, 7352, 6618, 5566, 3931, 7812, 6941, 5102, 7473, 4017, 6861, 6035, 7283, 7050, 3578, 7 498, 5839, 6630, 7701, 5948, 3960, 6838, 7323, 6029, 6955, 3827, 7494, 5607, 6633, 7715, 58 68, 4042, 6867, 7393, 5977, 7010, 4038, 6751, 6620, 6064, 7555, 7058, 3902, 5109, 7278, 684 1, 5597, 3055, 7706, 6575, 5819, 7468, 7000, 4012, 5989, 7335, 6896, 7760, 3519, 5919, 6942, 7505, 5758, 6398, 3822, 7380, 6030, 6862, 7474, 5503, 2043, 7052, 7717, 5978, 6983, 3943, 7 285, 6525, 5110, 7325, 6767, 4049, 5874, 7816, 6957, 6088, 7557, 4018, 6869, 7339, 5990, 66 34, 3829, 7497, 5611, 7073, 7705, 5847, 3933, 6842, 7286, 6037, 6583, 7439, 4041, 7012, 599 3, 7702, 6883, 5876, 3580, 7394, 6963, 5113, 7476, 6641, 3947, 7940, 5598, 7105, 7384, 3830, 6051, 6870, 7616, 6958, 5980, 3063, 7718, 6607, 5821, 7289, 6775, 3983, 5935, 7447, 6987, 7 326, 5994, 4020, 6844, 7776, 5613, 6636, 7500, 3934, 6042, 7367, 7060, 7824, 5851, 3991, 70 16, 7561, 5114, 6873, 7341, 3833, 6587, 5943, 7747, 7074, 6096, 3551, 7290, 6885, 7396, 588 0, 6965, 4044, 7721, 5619, 6526, 7506, 6989, 3949, 6001, 7347, 6815, 6053, 7708, 4050, 7064, 7480, 5822, 6642, 7342, 4024, 6041, 7749, 6779, 7451, 5614, 3834, 6966, 7231, 5055, 6874, 7 558, 2045, 7076, 5967, 7840, 6615, 6038, 7371, 3955, 6995, 7521, 5863, 6886, 7944, 3995, 59 96, 7400, 6969, 7463, 6054, 4065, 6644, 7722, 7047, 5853, 7292, 3067, 6889, 5621, 7569, 702 4, 7729, 5947, 3567, 6589, 7508, 6112, 7754, 6876, 3950, 7349, 6002, 7106, 7453, 6990, 5116, 3775, 7750, 6831, 5759, 7373, 6399, 4007, 7562, 6083, 7811, 7051, 7350, 4052, 5622, 6781, 7 467, 6997, 5975, 7724, 3957, 6619, 6057, 7379, 6970, 7522, 3997, 5867, 7952, 6890, 7263, 60 04, 7080, 4011, 7570, 7011, 6044, 7761, 6648, 3836, 5854, 7353, 7512, 6839, 5625, 7730, 357 5, 7108, 7408, 5087, 6998, 7454, 6897, 3958, 6085, 7813, 7374, 5949, 6590, 4066, 7753, 7059, 6058, 7564, 6863, 7495, 4056, 5869, 7695, 6972, 7279, 5979, 7053, 3961, 7469, 6631, 6065, 7 732, 6892, 7381, 3807, 5626, 7968, 7001, 7585, 6008, 7088, 3069, 7354, 6621, 5875, 7872, 75 24, 3998, 6843, 6090, 7395, 7013, 7703, 6086, 4039, 6943, 7475, 7756, 5950, 6782, 7617, 401 3, 7054, 5103, 7382, 7817, 6527, 6060, 3962, 7470, 7002, 7287, 5567, 6898, 7762, 4068, 7499, 5870, 7112, 7736, 7014, 5991, 7356, 2046, 6635, 7572, 6097, 8064, 6871, 7528, 3579, 6066, 7 061, 7385, 7707, 5877, 7017, 4019, 7586, 6900, 5981, 7814, 7397, 6622, 3823, 6089, 7477, 70 75, 7777, 5628, 7004, 4014, 7501, 7719, 5995, 6845, 7327, 6959, 7576, 3903, 5878, 7939, 701 8, 7291, 5111, 6637, 4043, 7825, 7478, 6031, 7066, 7386, 6875, 4072, 6068, 7764, 7588, 6967, 7709, 5982, 7120, 3964, 7507, 7818, 6039, 6904, 7398, 6643, 4021, 5881, 7481, 7723, 7025, 5 599, 7559, 7077, 3831, 7941, 7401, 6092, 6846, 7536, 7778, 5997, 4045, 7065, 7388, 6638, 60 98, 7826, 7618, 4022, 6991, 7502, 6072, 7062, 7768, 7343, 5882, 3581, 6887, 7710, 7020, 756 3, 6003, 8000, 7078, 4051, 7293, 6043, 7509, 6877, 7820, 6645, 6113, 3070, 7482, 7751, 6971, 5115, 7402, 7725, 7136, 3935, 7592, 5615, 7026, 7841, 7523, 5998, 6783, 4025, 7351, 7945, 7 107, 5823, 7620, 6646, 7780, 4080, 6055, 7510, 6999, 7731, 7409, 6100, 7081, 3835, 7571, 68 91, 7873, 6005, 7375, 7028, 7726, 4046, 6045, 7484, 7068, 7942, 6878, 6059, 7565, 3951, 775 5, 6649, 7404, 5884, 7513, 7109, 7828, 4053, 5623, 7600, 6973, 7784, 7355, 6006, 7082, 7953, 4026, 6893, 7525, 6114, 7842, 7003, 7455, 7733, 4067, 6104, 7089, 7294, 7757, 6650, 6009, 7 566, 7514, 4054, 7032, 7832, 5855, 6899, 7410, 7946, 7114, 3959, 5117, 7624, 7734, 7110, 60 46, 7526, 7844, 6974, 4028, 7383, 6087, 7763, 7084, 7573, 7954, 6061, 6591, 3582, 7529, 773 7, 6894, 6010, 7412, 7815, 7015, 3837, 7587, 6116, 7792, 7121, 7516, 7090, 7357, 5627, 4057, 7948, 6901, 7471, 7874, 6067, 7005, 7530, 7758, 4069, 7113, 5871, 7578, 7819, 6652, 7387, 6 062, 7969, 7019, 3999, 7479, 7765, 5951, 6902, 7632, 7738, 7416, 7055, 2047, 6091, 7848, 75 37, 7092, 8065, 6120, 7589, 7006, 3963, 7779, 7358, 6012, 7063, 7876, 7577, 6905, 8001, 405 8, 6069, 7503, 6623, 7766, 7574, 5879, 7116, 7827, 7399, 4070, 7021, 6093, 7740, 7532, 7122, 7956, 7590, 6070, 4073, 7389, 7096, 7483, 7821, 5629, 6906, 7648, 7769, 7027, 4060, 7538, 6 099, 7970, 7067, 7295, 7856, 7137, 5118, 7619, 4015, 7781, 7511, 6639, 5983, 7711, 7593, 70 22, 7960, 7403, 3071, 6073, 6847, 7822, 7540, 7079, 7770, 6128, 7580, 7972, 3838, 7124, 739 0, 7880, 5883, 7029, 7621, 7782, 7485, 6094, 3965, 7069, 7943, 7594, 7083, 7829, 5999, 7405, 6908, 7785, 4074, 7843, 7515, 6101, 6647, 8002, 7601, 7030, 7772, 6074, 7544, 4023, 7727, 7 138, 7411, 7947, 6115, 7128, 7626, 7786, 7622, 7033, 4081, 6102, 7834, 7486, 6879, 7976, 75 96, 6007, 7735, 7070, 4047, 7406, 7888, 7111, 7527, 6076, 8066, 7793, 7085, 7633, 7845, 407 6, 5630, 7034, 7602, 8004, 7413, 7140, 5885, 7833, 7517, 7759, 3583, 6651, 7625, 7955, 6105, 7091, 7830, 7531, 7788, 6895, 6117, 4027, 7414, 7949, 7567, 7086, 7846, 7604, 6047, 7739, 6 975, 7518, 7984, 3966, 7115, 6011, 7904, 7575, 7794, 7144, 7417, 7950, 6106, 7628, 4082, 70 36, 7875, 8008, 7533, 7093, 6118, 7767, 7634, 7849, 6903, 7608, 4055, 8068, 6121, 7418, 711 7, 7796, 7836, 7539, 6108, 7094, 7957, 7579, 4084, 7877, 6653, 7971, 6063, 7649, 7741, 7123, 7534, 7850, 7359, 7007, 4029, 5119, 7962, 7771, 7591, 7097, 7857, 7636, 5886, 8016, 7152, 7 800, 7541, 3839, 7973, 6907, 6013, 7581, 7882, 7595, 7118, 7878, 8072, 6122, 7420, 7023, 40 59, 7742, 7542, 7961, 7852, 7125, 6071, 7650, 7958, 7640, 7098, 7783, 4088, 7889, 6129, 754 5, 7139, 7974, 7858, 7391, 7126, 8032, 6095, 7582, 7773, 7881, 4030, 7031, 7623, 8080, 7597, 6124, 7100, 7787, 8003, 7546, 7823, 6654, 7977, 4071, 5631, 7652, 7860, 6909, 7603, 7774, 7 964, 7407, 6075, 7129, 7831, 8005, 7598, 4061, 7884, 7141, 7487, 6014, 8096, 7789, 7071, 76 27, 7978, 7890, 7656, 6130, 7035, 3967, 7864, 7985, 7548, 7795, 7130, 7605, 6103, 8010, 783 5, 7415, 7142, 8006, 7905, 7629, 4075, 8067, 6132, 7145, 7790, 7606, 7980, 7132, 7847, 7635, 8017, 6077, 7892, 7087, 4062, 7519, 7986, 7797, 7609, 7837, 5887, 6910, 7664, 8069, 7851, 7 419, 7037, 8009, 7798, 7630, 4077, 6107, 7951, 7146, 7906, 7988, 7535, 7896, 7095, 8128, 61 36, 7637, 7801, 7959, 7610, 7153, 4083, 7838, 8012, 7651, 6078, 7879, 7119, 8073, 7638, 785 3, 7802, 7148, 7543, 7908, 6119, 8018, 4078, 7612, 7859, 6655, 7992, 7854, 7421, 7963, 7743, 6109, 7099, 7641, 8070, 7883, 7653, 8033, 7038, 4085, 7912, 7975, 6015, 7583, 7804, 7154, 8 081, 7547, 8020, 7861, 7642, 7127, 6123, 7965, 7885, 8074, 4086, 7654, 7862, 7156, 7979, 76 57, 7891, 8034, 6110, 7775, 7644, 7101, 8082, 7865, 7599, 8024, 7920, 6911, 4089, 7966, 612 5, 7422, 7886, 8076, 8007, 7131, 7549, 7791, 7981, 7893, 7658, 6131, 8097, 7160, 7866, 7607, 8036, 4090, 7907, 7987, 7665, 7102, 8129, 7894, 6126, 7982, 7631, 7799, 7143, 8011, 7868, 7 660, 8084, 8040, 7897, 7611, 6133, 4031, 7133, 8098, 7909, 7989, 7550, 8013, 7839, 7039, 80 88, 7666, 7803, 7990, 6134, 7898, 8100, 7147, 7639, 8019, 7910, 7993, 4092, 7668, 8071, 791 3, 7134, 8048, 6137, 7613, 7900, 8130, 8014, 7855, 7423, 7149, 8075, 7805, 8021, 7643, 7994, 6138, 7914, 4063, 8104, 7155, 8035, 7672, 7863, 8132, 8022, 7921, 7614, 7150, 8083, 7887, 7 996, 6079, 8077, 7655, 7916, 8025, 8112, 7157, 7645, 7867, 8037, 4079, 7967, 7806, 8078, 75 51, 8026, 6140, 7158, 7922, 8136, 8038, 7659, 7895, 8085, 8041, 7924, 7161, 7646, 8099, 802 8, 7869, 7983, 6111, 8042, 7661, 4087, 8090, 7899, 7162, 7991, 8144, 7928, 7667, 8049, 8101, 7870, 8089, 7662, 7103, 8015, 6127, 8086, 7911, 8044, 8102, 7901, 7669, 7995, 8160, 8050, 7 164, 7807, 4091, 8131, 7670, 8023, 8105, 7915, 8052, 6135, 8092, 7902, 7673, 7135, 8133, 79 97, 8106, 7917, 8027, 8113, 7674, 8056, 7923, 8138, 8134, 7998, 7151, 8108, 7615, 7918, 613 9, 8039, 8145, 4093, 8114, 7925, 8029, 8137, 7676, 8043, 7926, 7159, 8079, 8116, 8030, 8087, 7929, 7647, 8140, 8045, 8146, 8120, 7930, 6141, 8051, 8091, 8161, 7163, 7663, 8046, 7871, 8 103, 8148, 8053, 8093, 8107, 7932, 4094, 7671, 8054, 8162, 8152, 8057, 7903, 7165, 8094, 81 35, 8109, 8058, 8164, 6142, 7675, 8115, 7919, 8110, 7999, 8139, 8168, 8060, 8117, 7927, 814 1, 8118, 7677, 8147, 7166, 8031, 8121, 8176, 7931, 8142, 8047, 8149, 8122, 8163, 8150, 8055, 4095, 8124, 7678, 7933, 8153, 8165, 8095, 6143, 8059, 8154, 8166, 8169, 8156, 8111, 7167, 7 934, 8061, 8170, 8119, 8177, 8143, 8172, 7679, 8123, 8062, 8178, 8151, 8180, 8125, 7935, 81 55, 8184, 8126, 8167, 8157, 8063, 8171, 8158, 8173, 8179, 8174, 8181, 8182, 8185, 8186, 812 7, 8188, 8159, 8175, 8183, 8187, 8189, 8190, 8191]

TABLE Q9 with a sequence length of 8192:

| Polarized channel sequence number | Reliability or reliability sequence number |
|---|---|
| 0 | 0 |
| 1 | 1 |
| 2 | 2 |
| 3 | 4 |
| 4 | 8 |
| 5 | 16 |
| 6 | 32 |
| 7 | 128 |
| 8 | 256 |
| 9 | 512 |
| 10 | 1024 |
| 11 | 2048 |
| 12 | 4096 |
| 13 | 3 |
| 14 | 5 |
| 15 | 64 |

TABLE Q9-continued with a sequence length of 8192:

| Polarized channel sequence number | Reliability or reliability sequence number |
|---|---|
| 16 | 9 |
| 17 | 6 |
| 18 | 17 |
| 19 | 10 |
| 20 | 18 |
| 21 | 12 |
| 22 | 33 |
| 23 | 129 |
| 24 | 65 |
| 25 | 20 |
| 26 | 34 |
| 27 | 24 |
| 28 | 257 |
| 29 | 36 |
| 30 | 7 |
| 31 | 66 |
| 32 | 11 |
| 33 | 40 |
| 34 | 130 |
| 35 | 513 |
| 36 | 68 |
| 37 | 19 |
| 38 | 13 |
| 39 | 48 |
| 40 | 14 |
| 41 | 1025 |
| 42 | 72 |
| 43 | 258 |
| 44 | 132 |
| 45 | 21 |
| 46 | 35 |
| 47 | 2049 |
| 48 | 26 |
| 49 | 80 |
| 50 | 37 |
| 51 | 136 |
| 52 | 25 |
| 53 | 4097 |
| 54 | 22 |
| 55 | 514 |
| 56 | 260 |
| 57 | 38 |
| 58 | 96 |
| 59 | 144 |
| 60 | 67 |
| 61 | 41 |
| 62 | 28 |
| 63 | 69 |
| 64 | 160 |
| 65 | 264 |
| 66 | 42 |
| 67 | 49 |
| 68 | 1026 |
| 69 | 74 |
| 70 | 516 |
| 71 | 70 |
| 72 | 131 |
| 73 | 44 |
| 74 | 272 |
| 75 | 81 |
| 76 | 50 |
| 77 | 133 |
| 78 | 73 |
| 79 | 15 |
| 80 | 52 |
| 81 | 2050 |
| 82 | 288 |
| 83 | 520 |
| 84 | 192 |
| 85 | 23 |
| 86 | 76 |
| 87 | 137 |
| 88 | 1028 |
| 89 | 82 |
| 90 | 56 |

TABLE Q9-continued with a sequence length of 8192:

| Polarized channel sequence number | Reliability or reliability sequence number |
|---|---|
| 91 | 384 |
| 92 | 27 |
| 93 | 4098 |
| 94 | 134 |
| 95 | 97 |
| 96 | 528 |
| 97 | 39 |
| 98 | 259 |
| 99 | 145 |
| 100 | 84 |
| 101 | 29 |
| 102 | 138 |
| 103 | 43 |
| 104 | 261 |
| 105 | 1032 |
| 106 | 544 |
| 107 | 98 |
| 108 | 2052 |
| 109 | 146 |
| 110 | 88 |
| 111 | 30 |
| 112 | 320 |
| 113 | 140 |
| 114 | 71 |
| 115 | 45 |
| 116 | 640 |
| 117 | 161 |
| 118 | 265 |
| 119 | 100 |
| 120 | 51 |
| 121 | 1040 |
| 122 | 193 |
| 123 | 46 |
| 124 | 262 |
| 125 | 768 |
| 126 | 75 |
| 127 | 148 |
| 128 | 4100 |
| 129 | 104 |
| 130 | 273 |
| 131 | 162 |
| 132 | 2056 |
| 133 | 53 |
| 134 | 77 |
| 135 | 515 |
| 136 | 152 |
| 137 | 1056 |
| 138 | 266 |
| 139 | 54 |
| 140 | 164 |
| 141 | 83 |
| 142 | 274 |
| 143 | 517 |
| 144 | 57 |
| 145 | 135 |
| 146 | 112 |
| 147 | 268 |
| 148 | 194 |
| 149 | 1152 |
| 150 | 78 |
| 151 | 576 |
| 152 | 2064 |
| 153 | 139 |
| 154 | 289 |
| 155 | 85 |
| 156 | 58 |
| 157 | 168 |
| 158 | 4104 |
| 159 | 385 |
| 160 | 521 |
| 161 | 99 |
| 162 | 1280 |
| 163 | 196 |
| 164 | 321 |
| 165 | 86 |

TABLE Q9-continued

| with a sequence length of 8192: | |
|---|---|
| Polarized channel sequence number | Reliability or reliability sequence number |
| 166 | 147 |
| 167 | 518 |
| 168 | 60 |
| 169 | 276 |
| 170 | 141 |
| 171 | 2080 |
| 172 | 89 |
| 173 | 290 |
| 174 | 1536 |
| 175 | 176 |
| 176 | 529 |
| 177 | 101 |
| 178 | 31 |
| 179 | 280 |
| 180 | 142 |
| 181 | 90 |
| 182 | 522 |
| 183 | 292 |
| 184 | 1027 |
| 185 | 4112 |
| 186 | 200 |
| 187 | 102 |
| 188 | 263 |
| 189 | 2176 |
| 190 | 530 |
| 191 | 149 |
| 192 | 105 |
| 193 | 163 |
| 194 | 322 |
| 195 | 92 |
| 196 | 1029 |
| 197 | 524 |
| 198 | 47 |
| 199 | 267 |
| 200 | 106 |
| 201 | 154 |
| 202 | 545 |
| 203 | 296 |
| 204 | 55 |
| 205 | 2304 |
| 206 | 208 |
| 207 | 1088 |
| 208 | 386 |
| 209 | 641 |
| 210 | 4128 |
| 211 | 113 |
| 212 | 165 |
| 213 | 324 |
| 214 | 153 |
| 215 | 79 |
| 216 | 1033 |
| 217 | 577 |
| 218 | 275 |
| 219 | 150 |
| 220 | 108 |
| 221 | 2560 |
| 222 | 532 |
| 223 | 269 |
| 224 | 166 |
| 225 | 59 |
| 226 | 1030 |
| 227 | 304 |
| 228 | 546 |
| 229 | 224 |
| 230 | 114 |
| 231 | 270 |
| 232 | 195 |
| 233 | 536 |
| 234 | 4224 |
| 235 | 1041 |
| 236 | 328 |
| 237 | 3072 |
| 238 | 87 |
| 239 | 169 |
| 240 | 388 |

TABLE Q9-continued

| with a sequence length of 8192: | |
|---|---|
| Polarized channel sequence number | Reliability or reliability sequence number |
| 241 | 769 |
| 242 | 116 |
| 243 | 156 |
| 244 | 1034 |
| 245 | 277 |
| 246 | 548 |
| 247 | 197 |
| 248 | 291 |
| 249 | 61 |
| 250 | 2051 |
| 251 | 170 |
| 252 | 519 |
| 253 | 1042 |
| 254 | 282 |
| 255 | 91 |
| 256 | 4352 |
| 257 | 177 |
| 258 | 578 |
| 259 | 336 |
| 260 | 120 |
| 261 | 293 |
| 262 | 1036 |
| 263 | 202 |
| 264 | 523 |
| 265 | 2053 |
| 266 | 198 |
| 267 | 392 |
| 268 | 62 |
| 269 | 552 |
| 270 | 1057 |
| 271 | 281 |
| 272 | 172 |
| 273 | 278 |
| 274 | 642 |
| 275 | 103 |
| 276 | 4608 |
| 277 | 209 |
| 278 | 2112 |
| 279 | 294 |
| 280 | 1153 |
| 281 | 580 |
| 282 | 178 |
| 283 | 352 |
| 284 | 93 |
| 285 | 531 |
| 286 | 201 |
| 287 | 1089 |
| 288 | 400 |
| 289 | 107 |
| 290 | 2057 |
| 291 | 525 |
| 292 | 323 |
| 293 | 143 |
| 294 | 1044 |
| 295 | 297 |
| 296 | 5120 |
| 297 | 560 |
| 298 | 180 |
| 299 | 94 |
| 300 | 284 |
| 301 | 526 |
| 302 | 1058 |
| 303 | 2054 |
| 304 | 151 |
| 305 | 325 |
| 306 | 204 |
| 307 | 584 |
| 308 | 416 |
| 309 | 109 |
| 310 | 1048 |
| 311 | 770 |
| 312 | 298 |
| 313 | 210 |
| 314 | 2065 |
| 315 | 6144 |

TABLE Q9-continued with a sequence length of 8192:

| Polarized channel sequence number | Reliability or reliability sequence number |
|---|---|
| 316 | 184 |
| 317 | 644 |
| 318 | 1281 |
| 319 | 305 |
| 320 | 115 |
| 321 | 330 |
| 322 | 533 |
| 323 | 155 |
| 324 | 1060 |
| 325 | 326 |
| 326 | 2058 |
| 327 | 547 |
| 328 | 225 |
| 329 | 387 |
| 330 | 110 |
| 331 | 538 |
| 332 | 1031 |
| 333 | 4099 |
| 334 | 300 |
| 335 | 167 |
| 336 | 592 |
| 337 | 337 |
| 338 | 2066 |
| 339 | 212 |
| 340 | 1090 |
| 341 | 306 |
| 342 | 549 |
| 343 | 117 |
| 344 | 157 |
| 345 | 648 |
| 346 | 1035 |
| 347 | 389 |
| 348 | 2060 |
| 349 | 171 |
| 350 | 4101 |
| 351 | 329 |
| 352 | 537 |
| 353 | 118 |
| 354 | 1064 |
| 355 | 271 |
| 356 | 534 |
| 357 | 226 |
| 358 | 308 |
| 359 | 2081 |
| 360 | 1154 |
| 361 | 772 |
| 362 | 216 |
| 363 | 448 |
| 364 | 550 |
| 365 | 121 |
| 366 | 1537 |
| 367 | 4160 |
| 368 | 279 |
| 369 | 158 |
| 370 | 2177 |
| 371 | 608 |
| 372 | 332 |
| 373 | 199 |
| 374 | 1092 |
| 375 | 656 |
| 376 | 393 |
| 377 | 173 |
| 378 | 579 |
| 379 | 1043 |
| 380 | 2113 |
| 381 | 122 |
| 382 | 228 |
| 383 | 553 |
| 384 | 4105 |
| 385 | 338 |
| 386 | 1037 |
| 387 | 179 |
| 388 | 540 |
| 389 | 312 |
| 390 | 2068 |

TABLE Q9-continued with a sequence length of 8192:

| Polarized channel sequence number | Reliability or reliability sequence number |
|---|---|
| 391 | 174 |
| 392 | 581 |
| 393 | 1072 |
| 394 | 283 |
| 395 | 63 |
| 396 | 390 |
| 397 | 672 |
| 398 | 1038 |
| 399 | 4102 |
| 400 | 203 |
| 401 | 2082 |
| 402 | 353 |
| 403 | 776 |
| 404 | 232 |
| 405 | 1096 |
| 406 | 295 |
| 407 | 554 |
| 408 | 124 |
| 409 | 401 |
| 410 | 2072 |
| 411 | 1282 |
| 412 | 561 |
| 413 | 340 |
| 414 | 586 |
| 415 | 4113 |
| 416 | 181 |
| 417 | 285 |
| 418 | 1156 |
| 419 | 2305 |
| 420 | 582 |
| 421 | 205 |
| 422 | 394 |
| 423 | 643 |
| 424 | 1045 |
| 425 | 182 |
| 426 | 299 |
| 427 | 556 |
| 428 | 2084 |
| 429 | 4106 |
| 430 | 211 |
| 431 | 1059 |
| 432 | 354 |
| 433 | 784 |
| 434 | 95 |
| 435 | 1050 |
| 436 | 402 |
| 437 | 593 |
| 438 | 2055 |
| 439 | 185 |
| 440 | 344 |
| 441 | 1104 |
| 442 | 562 |
| 443 | 240 |
| 444 | 4114 |
| 445 | 286 |
| 446 | 645 |
| 447 | 2114 |
| 448 | 1061 |
| 449 | 206 |
| 450 | 585 |
| 451 | 396 |
| 452 | 327 |
| 453 | 1160 |
| 454 | 527 |
| 455 | 2059 |
| 456 | 111 |
| 457 | 301 |
| 458 | 4108 |
| 459 | 1049 |
| 460 | 564 |
| 461 | 213 |
| 462 | 800 |
| 463 | 417 |
| 464 | 2088 |
| 465 | 1046 |

TABLE Q9-continued

| with a sequence length of 8192: | |
|---|---|
| Polarized channel sequence number | Reliability or reliability sequence number |
| 466 | 186 |
| 467 | 704 |
| 468 | 356 |
| 469 | 227 |
| 470 | 1538 |
| 471 | 535 |
| 472 | 4129 |
| 473 | 2178 |
| 474 | 307 |
| 475 | 588 |
| 476 | 1284 |
| 477 | 449 |
| 478 | 214 |
| 479 | 649 |
| 480 | 302 |
| 481 | 2561 |
| 482 | 1062 |
| 483 | 119 |
| 484 | 594 |
| 485 | 4225 |
| 486 | 331 |
| 487 | 1120 |
| 488 | 568 |
| 489 | 188 |
| 490 | 2116 |
| 491 | 404 |
| 492 | 896 |
| 493 | 1168 |
| 494 | 360 |
| 495 | 217 |
| 496 | 539 |
| 497 | 1091 |
| 498 | 2067 |
| 499 | 4161 |
| 500 | 418 |
| 501 | 646 |
| 502 | 229 |
| 503 | 1065 |
| 504 | 309 |
| 505 | 609 |
| 506 | 2061 |
| 507 | 333 |
| 508 | 551 |
| 509 | 1052 |
| 510 | 159 |
| 511 | 408 |
| 512 | 4116 |
| 513 | 771 |
| 514 | 1093 |
| 515 | 2096 |
| 516 | 123 |
| 517 | 657 |
| 518 | 310 |
| 519 | 1184 |
| 520 | 218 |
| 521 | 596 |
| 522 | 2062 |
| 523 | 420 |
| 524 | 4130 |
| 525 | 1288 |
| 526 | 541 |
| 527 | 339 |
| 528 | 650 |
| 529 | 1066 |
| 530 | 3073 |
| 531 | 230 |
| 532 | 313 |
| 533 | 555 |
| 534 | 1073 |
| 535 | 391 |
| 536 | 773 |
| 537 | 4120 |
| 538 | 233 |
| 539 | 2120 |
| 540 | 1098 |

TABLE Q9-continued

| with a sequence length of 8192: | |
|---|---|
| Polarized channel sequence number | Reliability or reliability sequence number |
| 541 | 368 |
| 542 | 610 |
| 543 | 220 |
| 544 | 1540 |
| 545 | 658 |
| 546 | 2306 |
| 547 | 450 |
| 548 | 334 |
| 549 | 4353 |
| 550 | 1094 |
| 551 | 600 |
| 552 | 175 |
| 553 | 542 |
| 554 | 2180 |
| 555 | 1155 |
| 556 | 395 |
| 557 | 832 |
| 558 | 125 |
| 559 | 1068 |
| 560 | 2069 |
| 561 | 4132 |
| 562 | 341 |
| 563 | 652 |
| 564 | 314 |
| 565 | 1296 |
| 566 | 583 |
| 567 | 234 |
| 568 | 2083 |
| 569 | 557 |
| 570 | 1105 |
| 571 | 424 |
| 572 | 673 |
| 573 | 4103 |
| 574 | 355 |
| 575 | 1074 |
| 576 | 2074 |
| 577 | 183 |
| 578 | 777 |
| 579 | 452 |
| 580 | 1157 |
| 581 | 612 |
| 582 | 342 |
| 583 | 2128 |
| 584 | 4162 |
| 585 | 563 |
| 586 | 1097 |
| 587 | 241 |
| 588 | 403 |
| 589 | 705 |
| 590 | 2085 |
| 591 | 1039 |
| 592 | 207 |
| 593 | 558 |
| 594 | 1076 |
| 595 | 316 |
| 596 | 4107 |
| 597 | 774 |
| 598 | 2184 |
| 599 | 397 |
| 600 | 1312 |
| 601 | 587 |
| 602 | 236 |
| 603 | 345 |
| 604 | 2073 |
| 605 | 1544 |
| 606 | 660 |
| 607 | 4136 |
| 608 | 432 |
| 609 | 1216 |
| 610 | 616 |
| 611 | 187 |
| 612 | 2070 |
| 613 | 785 |
| 614 | 1047 |
| 615 | 357 |

TABLE Q9-continued

| with a sequence length of 8192: | |
|---|---|
| Polarized channel sequence number | Reliability or reliability sequence number |
| 616 | 674 |
| 617 | 287 |
| 618 | 4226 |
| 619 | 2562 |
| 620 | 1100 |
| 621 | 565 |
| 622 | 126 |
| 623 | 1161 |
| 624 | 589 |
| 625 | 2308 |
| 626 | 398 |
| 627 | 346 |
| 628 | 1106 |
| 629 | 4609 |
| 630 | 664 |
| 631 | 242 |
| 632 | 1080 |
| 633 | 2086 |
| 634 | 778 |
| 635 | 456 |
| 636 | 566 |
| 637 | 1408 |
| 638 | 358 |
| 639 | 2144 |
| 640 | 4164 |
| 641 | 676 |
| 642 | 1051 |
| 643 | 215 |
| 644 | 595 |
| 645 | 405 |
| 646 | 2192 |
| 647 | 1158 |
| 648 | 786 |
| 649 | 361 |
| 650 | 4115 |
| 651 | 1121 |
| 652 | 569 |
| 653 | 2115 |
| 654 | 244 |
| 655 | 647 |
| 656 | 1552 |
| 657 | 419 |
| 658 | 624 |
| 659 | 2089 |
| 660 | 1063 |
| 661 | 4109 |
| 662 | 348 |
| 663 | 189 |
| 664 | 780 |
| 665 | 1283 |
| 666 | 2076 |
| 667 | 303 |
| 668 | 706 |
| 669 | 1169 |
| 670 | 362 |
| 671 | 4144 |
| 672 | 590 |
| 673 | 2117 |
| 674 | 410 |
| 675 | 1108 |
| 676 | 651 |
| 677 | 219 |
| 678 | 1053 |
| 679 | 2208 |
| 680 | 801 |
| 681 | 4110 |
| 682 | 311 |
| 683 | 1162 |
| 684 | 597 |
| 685 | 2312 |
| 686 | 464 |
| 687 | 570 |
| 688 | 1067 |
| 689 | 248 |
| 690 | 680 |

TABLE Q9-continued

| with a sequence length of 8192: | |
|---|---|
| Polarized channel sequence number | Reliability or reliability sequence number |
| 691 | 5121 |
| 692 | 2090 |
| 693 | 1285 |
| 694 | 369 |
| 695 | 897 |
| 696 | 1568 |
| 697 | 421 |
| 698 | 2097 |
| 699 | 611 |
| 700 | 1122 |
| 701 | 4168 |
| 702 | 190 |
| 703 | 708 |
| 704 | 3074 |
| 705 | 409 |
| 706 | 1170 |
| 707 | 833 |
| 708 | 335 |
| 709 | 1112 |
| 710 | 2122 |
| 711 | 4354 |
| 712 | 598 |
| 713 | 406 |
| 714 | 1054 |
| 715 | 659 |
| 716 | 231 |
| 717 | 2564 |
| 718 | 1344 |
| 719 | 572 |
| 720 | 364 |
| 721 | 4228 |
| 722 | 1164 |
| 723 | 2118 |
| 724 | 788 |
| 725 | 422 |
| 726 | 221 |
| 727 | 1095 |
| 728 | 315 |
| 729 | 2179 |
| 730 | 4117 |
| 731 | 653 |
| 732 | 1069 |
| 733 | 480 |
| 734 | 601 |
| 735 | 2092 |
| 736 | 1664 |
| 737 | 370 |
| 738 | 802 |
| 739 | 1185 |
| 740 | 4131 |
| 741 | 2320 |
| 742 | 127 |
| 743 | 688 |
| 744 | 1289 |
| 745 | 451 |
| 746 | 613 |
| 747 | 2129 |
| 748 | 1124 |
| 749 | 6145 |
| 750 | 343 |
| 751 | 543 |
| 752 | 1075 |
| 753 | 2098 |
| 754 | 425 |
| 755 | 792 |
| 756 | 1217 |
| 757 | 235 |
| 758 | 4122 |
| 759 | 2181 |
| 760 | 654 |
| 761 | 372 |
| 762 | 1070 |
| 763 | 602 |
| 764 | 412 |
| 765 | 2121 |

TABLE Q9-continued

| with a sequence length of 8192: | |
|---|---|
| Polarized channel sequence number | Reliability or reliability sequence number |
| 766 | 1286 |
| 767 | 804 |
| 768 | 4176 |
| 769 | 222 |
| 770 | 1792 |
| 771 | 2063 |
| 772 | 712 |
| 773 | 453 |
| 774 | 1099 |
| 775 | 614 |
| 776 | 2100 |
| 777 | 4133 |
| 778 | 317 |
| 779 | 1172 |
| 780 | 775 |
| 781 | 426 |
| 782 | 2336 |
| 783 | 1128 |
| 784 | 661 |
| 785 | 237 |
| 786 | 4232 |
| 787 | 1297 |
| 788 | 2568 |
| 789 | 617 |
| 790 | 675 |
| 791 | 1186 |
| 792 | 347 |
| 793 | 1077 |
| 794 | 2240 |
| 795 | 4121 |
| 796 | 834 |
| 797 | 433 |
| 798 | 1101 |
| 799 | 604 |
| 800 | 2071 |
| 801 | 376 |
| 802 | 1539 |
| 803 | 4118 |
| 804 | 559 |
| 805 | 243 |
| 806 | 2124 |
| 807 | 1176 |
| 808 | 779 |
| 809 | 458 |
| 810 | 1290 |
| 811 | 2185 |
| 812 | 4610 |
| 813 | 618 |
| 814 | 454 |
| 815 | 1078 |
| 816 | 666 |
| 817 | 3076 |
| 818 | 318 |
| 819 | 1188 |
| 820 | 808 |
| 821 | 4356 |
| 822 | 428 |
| 823 | 2130 |
| 824 | 1107 |
| 825 | 567 |
| 826 | 238 |
| 827 | 2104 |
| 828 | 1298 |
| 829 | 4134 |
| 830 | 720 |
| 831 | 1541 |
| 832 | 359 |
| 833 | 2432 |
| 834 | 898 |
| 835 | 1081 |
| 836 | 625 |
| 837 | 465 |
| 838 | 4192 |
| 839 | 2075 |
| 840 | 1159 |

TABLE Q9-continued

| with a sequence length of 8192: | |
|---|---|
| Polarized channel sequence number | Reliability or reliability sequence number |
| 841 | 677 |
| 842 | 434 |
| 843 | 1136 |
| 844 | 2182 |
| 845 | 836 |
| 846 | 4240 |
| 847 | 245 |
| 848 | 1292 |
| 849 | 665 |
| 850 | 2145 |
| 851 | 349 |
| 852 | 1218 |
| 853 | 591 |
| 854 | 1102 |
| 855 | 4163 |
| 856 | 2576 |
| 857 | 457 |
| 858 | 787 |
| 859 | 1600 |
| 860 | 2087 |
| 861 | 662 |
| 862 | 363 |
| 863 | 4137 |
| 864 | 1163 |
| 865 | 620 |
| 866 | 2307 |
| 867 | 246 |
| 868 | 1313 |
| 869 | 781 |
| 870 | 1109 |
| 871 | 4124 |
| 872 | 2193 |
| 873 | 399 |
| 874 | 678 |
| 875 | 1082 |
| 876 | 2132 |
| 877 | 436 |
| 878 | 571 |
| 879 | 4165 |
| 880 | 1192 |
| 881 | 350 |
| 882 | 2077 |
| 883 | 1409 |
| 884 | 816 |
| 885 | 736 |
| 886 | 1545 |
| 887 | 4256 |
| 888 | 2186 |
| 889 | 407 |
| 890 | 626 |
| 891 | 1123 |
| 892 | 2091 |
| 893 | 249 |
| 894 | 1220 |
| 895 | 782 |
| 896 | 4360 |
| 897 | 460 |
| 898 | 2309 |
| 899 | 1345 |
| 900 | 707 |
| 901 | 840 |
| 902 | 3080 |
| 903 | 4138 |
| 904 | 1110 |
| 905 | 365 |
| 906 | 1171 |
| 907 | 599 |
| 908 | 2592 |
| 909 | 466 |
| 910 | 1542 |
| 911 | 4145 |
| 912 | 681 |
| 913 | 2146 |
| 914 | 440 |
| 915 | 1084 |

TABLE Q9-continued with a sequence length of 8192:

| Polarized channel sequence number | Reliability or reliability sequence number |
|---|---|
| 916 | 900 |
| 917 | 1300 |
| 918 | 2194 |
| 919 | 5122 |
| 920 | 250 |
| 921 | 628 |
| 922 | 1165 |
| 923 | 2136 |
| 924 | 668 |
| 925 | 371 |
| 926 | 1113 |
| 927 | 4170 |
| 928 | 789 |
| 929 | 2078 |
| 930 | 1314 |
| 931 | 411 |
| 932 | 709 |
| 933 | 2368 |
| 934 | 1200 |
| 935 | 4612 |
| 936 | 803 |
| 937 | 1553 |
| 938 | 481 |
| 939 | 2188 |
| 940 | 573 |
| 941 | 1125 |
| 942 | 4166 |
| 943 | 366 |
| 944 | 2119 |
| 945 | 682 |
| 946 | 1055 |
| 947 | 191 |
| 948 | 2093 |
| 949 | 1304 |
| 950 | 4227 |
| 951 | 794 |
| 952 | 603 |
| 953 | 1166 |
| 954 | 2688 |
| 955 | 423 |
| 956 | 1114 |
| 957 | 689 |
| 958 | 4140 |
| 959 | 2209 |
| 960 | 468 |
| 961 | 1546 |
| 962 | 848 |
| 963 | 2313 |
| 964 | 1316 |
| 965 | 4368 |
| 966 | 632 |
| 967 | 373 |
| 968 | 1224 |
| 969 | 2148 |
| 970 | 805 |
| 971 | 1126 |
| 972 | 413 |
| 973 | 4177 |
| 974 | 2099 |
| 975 | 714 |
| 976 | 1287 |
| 977 | 427 |
| 978 | 3088 |
| 979 | 1554 |
| 980 | 4146 |
| 981 | 710 |
| 982 | 904 |
| 983 | 2241 |
| 984 | 1173 |
| 985 | 252 |
| 986 | 1129 |
| 987 | 4229 |
| 988 | 2094 |
| 989 | 574 |
| 990 | 374 |
| 991 | 1187 |
| 992 | 793 |
| 993 | 2310 |
| 994 | 1346 |
| 995 | 4169 |
| 996 | 684 |
| 997 | 482 |
| 998 | 2816 |
| 999 | 1116 |
| 1000 | 790 |
| 1001 | 1548 |
| 1002 | 4111 |
| 1003 | 2123 |
| 1004 | 472 |
| 1005 | 1071 |
| 1006 | 615 |
| 1007 | 2196 |
| 1008 | 721 |
| 1009 | 4148 |
| 1010 | 1291 |
| 1011 | 377 |
| 1012 | 2152 |
| 1013 | 1130 |
| 1014 | 806 |
| 1015 | 690 |
| 1016 | 6146 |
| 1017 | 2321 |
| 1018 | 1178 |
| 1019 | 223 |
| 1020 | 1569 |
| 1021 | 2210 |
| 1022 | 864 |
| 1023 | 414 |
| 1024 | 4384 |
| 1025 | 1320 |
| 1026 | 2101 |
| 1027 | 605 |
| 1028 | 1079 |
| 1029 | 713 |
| 1030 | 2125 |
| 1031 | 4616 |
| 1032 | 1232 |
| 1033 | 455 |
| 1034 | 912 |
| 1035 | 2563 |
| 1036 | 1410 |
| 1037 | 429 |
| 1038 | 4288 |
| 1039 | 1665 |
| 1040 | 2200 |
| 1041 | 619 |
| 1042 | 835 |
| 1043 | 1137 |
| 1044 | 3104 |
| 1045 | 4119 |
| 1046 | 378 |
| 1047 | 1189 |
| 1048 | 655 |
| 1049 | 2314 |
| 1050 | 1348 |
| 1051 | 809 |
| 1052 | 4172 |
| 1053 | 484 |
| 1054 | 2102 |
| 1055 | 1177 |
| 1056 | 692 |
| 1057 | 1103 |
| 1058 | 2212 |
| 1059 | 4233 |
| 1060 | 435 |
| 1061 | 1601 |
| 1062 | 606 |
| 1063 | 2131 |
| 1064 | 796 |
| 1065 | 5124 |

TABLE Q9-continued

| with a sequence length of 8192: | |
|---|---|
| Polarized channel sequence number | Reliability or reliability sequence number |
| 1066 | 1299 |
| 1067 | 239 |
| 1068 | 2322 |
| 1069 | 1174 |
| 1070 | 663 |
| 1071 | 1132 |
| 1072 | 4178 |
| 1073 | 2565 |
| 1074 | 837 |
| 1075 | 430 |
| 1076 | 1556 |
| 1077 | 2105 |
| 1078 | 716 |
| 1079 | 4152 |
| 1080 | 1293 |
| 1081 | 319 |
| 1082 | 2183 |
| 1083 | 1190 |
| 1084 | 928 |
| 1085 | 1083 |
| 1086 | 4480 |
| 1087 | 2160 |
| 1088 | 621 |
| 1089 | 459 |
| 1090 | 1328 |
| 1091 | 2316 |
| 1092 | 810 |
| 1093 | 4123 |
| 1094 | 1570 |
| 1095 | 722 |
| 1096 | 2242 |
| 1097 | 1248 |
| 1098 | 488 |
| 1099 | 4230 |
| 1100 | 3200 |
| 1101 | 696 |
| 1102 | 1138 |
| 1103 | 817 |
| 1104 | 2126 |
| 1105 | 1294 |
| 1106 | 4193 |
| 1107 | 380 |
| 1108 | 1219 |
| 1109 | 2624 |
| 1110 | 627 |
| 1111 | 1560 |
| 1112 | 437 |
| 1113 | 4624 |
| 1114 | 2187 |
| 1115 | 842 |
| 1116 | 1352 |
| 1117 | 667 |
| 1118 | 2337 |
| 1119 | 4135 |
| 1120 | 1111 |
| 1121 | 247 |
| 1122 | 2133 |
| 1123 | 1193 |
| 1124 | 838 |
| 1125 | 1412 |
| 1126 | 4355 |
| 1127 | 2106 |
| 1128 | 737 |
| 1129 | 461 |
| 1130 | 1793 |
| 1131 | 2216 |
| 1132 | 4241 |
| 1133 | 899 |
| 1134 | 1140 |
| 1135 | 2433 |
| 1136 | 622 |
| 1137 | 1180 |
| 1138 | 438 |
| 1139 | 4180 |
| 1140 | 2569 |

TABLE Q9-continued

| with a sequence length of 8192: | |
|---|---|
| Polarized channel sequence number | Reliability or reliability sequence number |
| 1141 | 1301 |
| 1142 | 812 |
| 1143 | 679 |
| 1144 | 2147 |
| 1145 | 4125 |
| 1146 | 1572 |
| 1147 | 467 |
| 1148 | 1221 |
| 1149 | 3328 |
| 1150 | 849 |
| 1151 | 1315 |
| 1152 | 4234 |
| 1153 | 2244 |
| 1154 | 724 |
| 1155 | 1085 |
| 1156 | 351 |
| 1157 | 2369 |
| 1158 | 4139 |
| 1159 | 1194 |
| 1160 | 818 |
| 1161 | 1543 |
| 1162 | 2134 |
| 1163 | 629 |
| 1164 | 4357 |
| 1165 | 441 |
| 1166 | 2195 |
| 1167 | 1306 |
| 1168 | 669 |
| 1169 | 1115 |
| 1170 | 2566 |
| 1171 | 5128 |
| 1172 | 496 |
| 1173 | 1201 |
| 1174 | 2108 |
| 1175 | 901 |
| 1176 | 1602 |
| 1177 | 4640 |
| 1178 | 683 |
| 1179 | 2324 |
| 1180 | 1360 |
| 1181 | 251 |
| 1182 | 1144 |
| 1183 | 4194 |
| 1184 | 2189 |
| 1185 | 841 |
| 1186 | 630 |
| 1187 | 2137 |
| 1188 | 1317 |
| 1189 | 6148 |
| 1190 | 462 |
| 1191 | 1226 |
| 1192 | 2338 |
| 1193 | 783 |
| 1194 | 1547 |
| 1195 | 3584 |
| 1196 | 4242 |
| 1197 | 738 |
| 1198 | 1222 |
| 1199 | 820 |
| 1200 | 2224 |
| 1201 | 1416 |
| 1202 | 4184 |
| 1203 | 367 |
| 1204 | 2577 |
| 1205 | 1086 |
| 1206 | 728 |
| 1207 | 1576 |
| 1208 | 4126 |
| 1209 | 2149 |
| 1210 | 960 |
| 1211 | 469 |
| 1212 | 2079 |
| 1213 | 1305 |
| 1214 | 4416 |
| 1215 | 633 |

TABLE Q9-continued with a sequence length of 8192:

| Polarized channel sequence number | Reliability or reliability sequence number |
|---|---|
| 1216 | 1196 |
| 1217 | 2328 |
| 1218 | 791 |
| 1219 | 1302 |
| 1220 | 4236 |
| 1221 | 2190 |
| 1222 | 442 |
| 1223 | 1666 |
| 1224 | 670 |
| 1225 | 2138 |
| 1226 | 4167 |
| 1227 | 1127 |
| 1228 | 844 |
| 1229 | 2570 |
| 1230 | 1233 |
| 1231 | 483 |
| 1232 | 4141 |
| 1233 | 1318 |
| 1234 | 2340 |
| 1235 | 711 |
| 1236 | 1604 |
| 1237 | 3075 |
| 1238 | 4736 |
| 1239 | 905 |
| 1240 | 1202 |
| 1241 | 470 |
| 1242 | 2248 |
| 1243 | 1376 |
| 1244 | 4257 |
| 1245 | 685 |
| 1246 | 2150 |
| 1247 | 1117 |
| 1248 | 634 |
| 1249 | 375 |
| 1250 | 4361 |
| 1251 | 2311 |
| 1252 | 1555 |
| 1253 | 740 |
| 1254 | 2578 |
| 1255 | 1225 |
| 1256 | 4196 |
| 1257 | 850 |
| 1258 | 2197 |
| 1259 | 1424 |
| 1260 | 444 |
| 1261 | 1131 |
| 1262 | 4147 |
| 1263 | 2153 |
| 1264 | 691 |
| 1265 | 1549 |
| 1266 | 2211 |
| 1267 | 824 |
| 1268 | 5136 |
| 1269 | 1347 |
| 1270 | 686 |
| 1271 | 2370 |
| 1272 | 1167 |
| 1273 | 253 |
| 1274 | 4289 |
| 1275 | 2140 |
| 1276 | 1321 |
| 1277 | 795 |
| 1278 | 3077 |
| 1279 | 1584 |
| 1280 | 4142 |
| 1281 | 575 |
| 1282 | 1204 |
| 1283 | 2572 |
| 1284 | 473 |
| 1285 | 4358 |
| 1286 | 1118 |
| 1287 | 2095 |
| 1288 | 902 |
| 1289 | 1308 |
| 1290 | 2315 |

TABLE Q9-continued with a sequence length of 8192:

| Polarized channel sequence number | Reliability or reliability sequence number |
|---|---|
| 1291 | 4864 |
| 1292 | 715 |
| 1293 | 1550 |
| 1294 | 485 |
| 1295 | 2154 |
| 1296 | 1175 |
| 1297 | 4171 |
| 1298 | 865 |
| 1299 | 2202 |
| 1300 | 1349 |
| 1301 | 744 |
| 1302 | 2593 |
| 1303 | 4244 |
| 1304 | 1228 |
| 1305 | 807 |
| 1306 | 2344 |
| 1307 | 1608 |
| 1308 | 4200 |
| 1309 | 415 |
| 1310 | 1440 |
| 1311 | 2103 |
| 1312 | 636 |
| 1313 | 1133 |
| 1314 | 4369 |
| 1315 | 2256 |
| 1316 | 913 |
| 1317 | 1794 |
| 1318 | 3136 |
| 1319 | 379 |
| 1320 | 4258 |
| 1321 | 1322 |
| 1322 | 852 |
| 1323 | 2434 |
| 1324 | 1234 |
| 1325 | 6152 |
| 1326 | 693 |
| 1327 | 2689 |
| 1328 | 1208 |
| 1329 | 474 |
| 1330 | 2161 |
| 1331 | 4149 |
| 1332 | 1668 |
| 1333 | 797 |
| 1334 | 2213 |
| 1335 | 1329 |
| 1336 | 717 |
| 1337 | 4173 |
| 1338 | 2372 |
| 1339 | 1139 |
| 1340 | 906 |
| 1341 | 1354 |
| 1342 | 4611 |
| 1343 | 2201 |
| 1344 | 486 |
| 1345 | 1557 |
| 1346 | 2127 |
| 1347 | 694 |
| 1348 | 4248 |
| 1349 | 1179 |
| 1350 | 3081 |
| 1351 | 811 |
| 1352 | 1350 |
| 1353 | 5152 |
| 1354 | 2625 |
| 1355 | 489 |
| 1356 | 1571 |
| 1357 | 2323 |
| 1358 | 723 |
| 1359 | 4362 |
| 1360 | 1249 |
| 1361 | 866 |
| 1362 | 2198 |
| 1363 | 607 |
| 1364 | 4150 |
| 1365 | 476 |

TABLE Q9-continued with a sequence length of 8192:

| Polarized channel sequence number | Reliability or reliability sequence number |
|---|---|
| 1366 | 2156 |
| 1367 | 1411 |
| 1368 | 914 |
| 1369 | 2580 |
| 1370 | 4260 |
| 1371 | 1134 |
| 1372 | 697 |
| 1373 | 2317 |
| 1374 | 1562 |
| 1375 | 4179 |
| 1376 | 431 |
| 1377 | 2214 |
| 1378 | 1324 |
| 1379 | 856 |
| 1380 | 2107 |
| 1381 | 4370 |
| 1382 | 1191 |
| 1383 | 752 |
| 1384 | 1616 |
| 1385 | 3078 |
| 1386 | 4613 |
| 1387 | 798 |
| 1388 | 1361 |
| 1389 | 2352 |
| 1390 | 254 |
| 1391 | 4153 |
| 1392 | 1236 |
| 1393 | 2594 |
| 1394 | 718 |
| 1395 | 1330 |
| 1396 | 2272 |
| 1397 | 4231 |
| 1398 | 908 |
| 1399 | 1573 |
| 1400 | 2162 |
| 1401 | 839 |
| 1402 | 4208 |
| 1403 | 1141 |
| 1404 | 2318 |
| 1405 | 381 |
| 1406 | 1181 |
| 1407 | 2243 |
| 1408 | 4364 |
| 1409 | 623 |
| 1410 | 1672 |
| 1411 | 2584 |
| 1412 | 813 |
| 1413 | 4290 |
| 1414 | 1413 |
| 1415 | 3089 |
| 1416 | 725 |
| 1417 | 1195 |
| 1418 | 5248 |
| 1419 | 2376 |
| 1420 | 490 |
| 1421 | 1353 |
| 1422 | 2135 |
| 1423 | 4174 |
| 1424 | 929 |
| 1425 | 1561 |
| 1426 | 698 |
| 1427 | 2217 |
| 1428 | 1142 |
| 1429 | 4672 |
| 1430 | 439 |
| 1431 | 2436 |
| 1432 | 1295 |
| 1433 | 868 |
| 1434 | 6160 |
| 1435 | 2817 |
| 1436 | 1558 |
| 1437 | 739 |
| 1438 | 2164 |
| 1439 | 4235 |
| 1440 | 1250 |

TABLE Q9-continued with a sequence length of 8192:

| Polarized channel sequence number | Reliability or reliability sequence number |
|---|---|
| 1441 | 819 |
| 1442 | 2204 |
| 1443 | 1332 |
| 1444 | 4385 |
| 1445 | 497 |
| 1446 | 3082 |
| 1447 | 1796 |
| 1448 | 961 |
| 1449 | 2325 |
| 1450 | 4181 |
| 1451 | 1240 |
| 1452 | 726 |
| 1453 | 2596 |
| 1454 | 1472 |
| 1455 | 4154 |
| 1456 | 814 |
| 1457 | 2245 |
| 1458 | 1574 |
| 1459 | 463 |
| 1460 | 4264 |
| 1461 | 2339 |
| 1462 | 1145 |
| 1463 | 631 |
| 1464 | 2109 |
| 1465 | 4481 |
| 1466 | 1303 |
| 1467 | 843 |
| 1468 | 2218 |
| 1469 | 1182 |
| 1470 | 4617 |
| 1471 | 700 |
| 1472 | 2567 |
| 1473 | 1632 |
| 1474 | 492 |
| 1475 | 4195 |
| 1476 | 3090 |
| 1477 | 1356 |
| 1478 | 1223 |
| 1479 | 2330 |
| 1480 | 5376 |
| 1481 | 916 |
| 1482 | 2139 |
| 1483 | 1680 |
| 1484 | 872 |
| 1485 | 2225 |
| 1486 | 4292 |
| 1487 | 1417 |
| 1488 | 729 |
| 1489 | 2626 |
| 1490 | 1197 |
| 1491 | 4417 |
| 1492 | 443 |
| 1493 | 2384 |
| 1494 | 1603 |
| 1495 | 930 |
| 1496 | 4182 |
| 1497 | 2168 |
| 1498 | 1146 |
| 1499 | 741 |
| 1500 | 2341 |
| 1501 | 4243 |
| 1502 | 1252 |
| 1503 | 821 |
| 1504 | 3084 |
| 1505 | 1577 |
| 1506 | 4614 |
| 1507 | 382 |
| 1508 | 2250 |
| 1509 | 1362 |
| 1510 | 845 |
| 1511 | 4156 |
| 1512 | 2571 |
| 1513 | 1203 |
| 1514 | 671 |
| 1515 | 2246 |

TABLE Q9-continued

| with a sequence length of 8192: | |
|---|---|
| Polarized channel sequence number | Reliability or reliability sequence number |
| 1516 | 4372 |
| 1517 | 1564 |
| 1518 | 920 |
| 1519 | 2440 |
| 1520 | 1336 |
| 1521 | 4237 |
| 1522 | 498 |
| 1523 | 2110 |
| 1524 | 1198 |
| 1525 | 2600 |
| 1526 | 6176 |
| 1527 | 1605 |
| 1528 | 635 |
| 1529 | 3105 |
| 1530 | 1307 |
| 1531 | 4185 |
| 1532 | 822 |
| 1533 | 2329 |
| 1534 | 1087 |
| 1535 | 730 |
| 1536 | 4386 |
| 1537 | 2220 |
| 1538 | 1414 |
| 1539 | 932 |
| 1540 | 5632 |
| 1541 | 2326 |
| 1542 | 1696 |
| 1543 | 471 |
| 1544 | 2690 |
| 1545 | 4272 |
| 1546 | 1227 |
| 1547 | 851 |
| 1548 | 2151 |
| 1549 | 1377 |
| 1550 | 4625 |
| 1551 | 2257 |
| 1552 | 742 |
| 1553 | 1800 |
| 1554 | 2342 |
| 1555 | 4197 |
| 1556 | 1256 |
| 1557 | 825 |
| 1558 | 3201 |
| 1559 | 1319 |
| 1560 | 4127 |
| 1561 | 500 |
| 1562 | 2628 |
| 1563 | 1578 |
| 1564 | 903 |
| 1565 | 4376 |
| 1566 | 2226 |
| 1567 | 1148 |
| 1568 | 745 |
| 1569 | 2400 |
| 1570 | 4238 |
| 1571 | 1425 |
| 1572 | 2141 |
| 1573 | 880 |
| 1574 | 4186 |
| 1575 | 1585 |
| 1576 | 2579 |
| 1577 | 445 |
| 1578 | 1364 |
| 1579 | 4618 |
| 1580 | 2249 |
| 1581 | 1610 |
| 1582 | 732 |
| 1583 | 3137 |
| 1584 | 4388 |
| 1585 | 1205 |
| 1586 | 962 |
| 1587 | 2448 |
| 1588 | 1309 |
| 1589 | 5123 |
| 1590 | 2155 |

TABLE Q9-continued

| with a sequence length of 8192: | |
|---|---|
| Polarized channel sequence number | Reliability or reliability sequence number |
| 1591 | 846 |
| 1592 | 1606 |
| 1593 | 2573 |
| 1594 | 4296 |
| 1595 | 687 |
| 1596 | 1229 |
| 1597 | 2371 |
| 1598 | 4198 |
| 1599 | 255 |
| 1600 | 1418 |
| 1601 | 2191 |
| 1602 | 1667 |
| 1603 | 4359 |
| 1604 | 3092 |
| 1605 | 907 |
| 1606 | 1206 |
| 1607 | 2345 |
| 1608 | 6272 |
| 1609 | 637 |
| 1610 | 1323 |
| 1611 | 2608 |
| 1612 | 4626 |
| 1613 | 853 |
| 1614 | 1580 |
| 1615 | 2228 |
| 1616 | 475 |
| 1617 | 4245 |
| 1618 | 2142 |
| 1619 | 1235 |
| 1620 | 826 |
| 1621 | 2332 |
| 1622 | 4201 |
| 1623 | 1378 |
| 1624 | 1808 |
| 1625 | 2574 |
| 1626 | 746 |
| 1627 | 4259 |
| 1628 | 1119 |
| 1629 | 3106 |
| 1630 | 936 |
| 1631 | 4418 |
| 1632 | 2199 |
| 1633 | 1426 |
| 1634 | 867 |
| 1635 | 2373 |
| 1636 | 4188 |
| 1637 | 1617 |
| 1638 | 504 |
| 1639 | 2252 |
| 1640 | 5125 |
| 1641 | 1209 |
| 1642 | 2632 |
| 1643 | 1368 |
| 1644 | 695 |
| 1645 | 4620 |
| 1646 | 2464 |
| 1647 | 1586 |
| 1648 | 964 |
| 1649 | 2157 |
| 1650 | 4143 |
| 1651 | 1264 |
| 1652 | 3096 |
| 1653 | 854 |
| 1654 | 4363 |
| 1655 | 1310 |
| 1656 | 2818 |
| 1657 | 753 |
| 1658 | 1669 |
| 1659 | 4202 |
| 1660 | 2346 |
| 1661 | 1230 |
| 1662 | 2258 |
| 1663 | 446 |
| 1664 | 4250 |
| 1665 | 1609 |

TABLE Q9-continued with a sequence length of 8192:

| Polarized channel sequence number | Reliability or reliability sequence number |
|---|---|
| 1666 | 2232 |
| 1667 | 915 |
| 1668 | 4641 |
| 1669 | 1420 |
| 1670 | 2692 |
| 1671 | 719 |
| 1672 | 3329 |
| 1673 | 4392 |
| 1674 | 1351 |
| 1675 | 1551 |
| 1676 | 2353 |
| 1677 | 4151 |
| 1678 | 828 |
| 1679 | 1135 |
| 1680 | 2163 |
| 1681 | 909 |
| 1682 | 6400 |
| 1683 | 2378 |
| 1684 | 1325 |
| 1685 | 487 |
| 1686 | 4304 |
| 1687 | 2581 |
| 1688 | 1588 |
| 1689 | 748 |
| 1690 | 2203 |
| 1691 | 5184 |
| 1692 | 1237 |
| 1693 | 3108 |
| 1694 | 1824 |
| 1695 | 4482 |
| 1696 | 857 |
| 1697 | 2374 |
| 1698 | 1441 |
| 1699 | 944 |
| 1700 | 4737 |
| 1701 | 2595 |
| 1702 | 1210 |
| 1703 | 2273 |
| 1704 | 4209 |
| 1705 | 477 |
| 1706 | 1728 |
| 1707 | 2435 |
| 1708 | 1380 |
| 1709 | 4261 |
| 1710 | 2158 |
| 1711 | 699 |
| 1712 | 1251 |
| 1713 | 4420 |
| 1714 | 2586 |
| 1715 | 869 |
| 1716 | 1559 |
| 1717 | 3079 |
| 1718 | 4249 |
| 1719 | 799 |
| 1720 | 2348 |
| 1721 | 1331 |
| 1722 | 4175 |
| 1723 | 1612 |
| 1724 | 2215 |
| 1725 | 638 |
| 1726 | 5129 |
| 1727 | 2640 |
| 1728 | 1473 |
| 1729 | 910 |
| 1730 | 2385 |
| 1731 | 4673 |
| 1732 | 1238 |
| 1733 | 1673 |
| 1734 | 2260 |
| 1735 | 4371 |
| 1736 | 383 |
| 1737 | 3138 |
| 1738 | 1326 |
| 1739 | 858 |
| 1740 | 4246 |

TABLE Q9-continued with a sequence length of 8192:

| Polarized channel sequence number | Reliability or reliability sequence number |
|---|---|
| 1741 | 2354 |
| 1742 | 1143 |
| 1743 | 2597 |
| 1744 | 4204 |
| 1745 | 754 |
| 1746 | 1618 |
| 1747 | 2165 |
| 1748 | 6656 |
| 1749 | 1355 |
| 1750 | 968 |
| 1751 | 2205 |
| 1752 | 1592 |
| 1753 | 4628 |
| 1754 | 2696 |
| 1755 | 870 |
| 1756 | 1212 |
| 1757 | 4365 |
| 1758 | 3083 |
| 1759 | 491 |
| 1760 | 2437 |
| 1761 | 4262 |
| 1762 | 1428 |
| 1763 | 1920 |
| 1764 | 2219 |
| 1765 | 727 |
| 1766 | 4155 |
| 1767 | 2377 |
| 1768 | 1384 |
| 1769 | 917 |
| 1770 | 5126 |
| 1771 | 2585 |
| 1772 | 1241 |
| 1773 | 2166 |
| 1774 | 4400 |
| 1775 | 1563 |
| 1776 | 873 |
| 1777 | 3112 |
| 1778 | 1442 |
| 1779 | 4642 |
| 1780 | 2319 |
| 1781 | 756 |
| 1782 | 1670 |
| 1783 | 4320 |
| 1784 | 2582 |
| 1785 | 1253 |
| 1786 | 2274 |
| 1787 | 4210 |
| 1788 | 478 |
| 1789 | 1333 |
| 1790 | 2356 |
| 1791 | 931 |
| 1792 | 4366 |
| 1793 | 3202 |
| 1794 | 1633 |
| 1795 | 860 |
| 1796 | 4291 |
| 1797 | 2820 |
| 1798 | 1357 |
| 1799 | 2264 |
| 1800 | 4632 |
| 1801 | 1575 |
| 1802 | 701 |
| 1803 | 2496 |
| 1804 | 5137 |
| 1805 | 1183 |
| 1806 | 2598 |
| 1807 | 815 |
| 1808 | 4424 |
| 1809 | 1432 |
| 1810 | 2169 |
| 1811 | 1795 |
| 1812 | 3585 |
| 1813 | 7168 |
| 1814 | 874 |
| 1815 | 1147 |

TABLE Q9-continued

| with a sequence length of 8192: | |
|---|---|
| Polarized channel sequence number | Reliability or reliability sequence number |
| 1816 | 2327 |
| 1817 | 4183 |
| 1818 | 493 |
| 1819 | 2206 |
| 1820 | 1681 |
| 1821 | 4265 |
| 1822 | 1334 |
| 1823 | 2656 |
| 1824 | 922 |
| 1825 | 4484 |
| 1826 | 2380 |
| 1827 | 1242 |
| 1828 | 731 |
| 1829 | 2247 |
| 1830 | 4865 |
| 1831 | 1620 |
| 1832 | 3140 |
| 1833 | 1444 |
| 1834 | 4212 |
| 1835 | 823 |
| 1836 | 2704 |
| 1837 | 1565 |
| 1838 | 4252 |
| 1839 | 2441 |
| 1840 | 976 |
| 1841 | 1363 |
| 1842 | 5130 |
| 1843 | 2221 |
| 1844 | 1674 |
| 1845 | 2627 |
| 1846 | 4373 |
| 1847 | 760 |
| 1848 | 1254 |
| 1849 | 3091 |
| 1850 | 4644 |
| 1851 | 499 |
| 1852 | 2170 |
| 1853 | 1337 |
| 1854 | 4293 |
| 1855 | 2276 |
| 1856 | 1579 |
| 1857 | 881 |
| 1858 | 2601 |
| 1859 | 4387 |
| 1860 | 1415 |
| 1861 | 2386 |
| 1862 | 933 |
| 1863 | 4157 |
| 1864 | 1797 |
| 1865 | 3085 |
| 1866 | 1257 |
| 1867 | 6147 |
| 1868 | 2227 |
| 1869 | 702 |
| 1870 | 1392 |
| 1871 | 4266 |
| 1872 | 2588 |
| 1873 | 1634 |
| 1874 | 2360 |
| 1875 | 4615 |
| 1876 | 921 |
| 1877 | 2222 |
| 1878 | 1244 |
| 1879 | 5138 |
| 1880 | 494 |
| 1881 | 2629 |
| 1882 | 1682 |
| 1883 | 4378 |
| 1884 | 3120 |
| 1885 | 1474 |
| 1886 | 847 |
| 1887 | 4187 |
| 1888 | 2331 |
| 1889 | 1358 |
| 1890 | 2111 |

TABLE Q9-continued

| with a sequence length of 8192: | |
|---|---|
| Polarized channel sequence number | Reliability or reliability sequence number |
| 1891 | 4273 |
| 1892 | 918 |
| 1893 | 2438 |
| 1894 | 1624 |
| 1895 | 4674 |
| 1896 | 1199 |
| 1897 | 2720 |
| 1898 | 743 |
| 1899 | 4432 |
| 1900 | 3086 |
| 1901 | 1566 |
| 1902 | 876 |
| 1903 | 4216 |
| 1904 | 2251 |
| 1905 | 1419 |
| 1906 | 2401 |
| 1907 | 4389 |
| 1908 | 1856 |
| 1909 | 2824 |
| 1910 | 934 |
| 1911 | 5132 |
| 1912 | 1149 |
| 1913 | 2280 |
| 1914 | 1365 |
| 1915 | 4298 |
| 1916 | 3144 |
| 1917 | 733 |
| 1918 | 1676 |
| 1919 | 2343 |
| 1920 | 4619 |
| 1921 | 501 |
| 1922 | 2602 |
| 1923 | 6149 |
| 1924 | 1338 |
| 1925 | 2172 |
| 1926 | 1607 |
| 1927 | 4294 |
| 1928 | 827 |
| 1929 | 2449 |
| 1930 | 1258 |
| 1931 | 4488 |
| 1932 | 3330 |
| 1933 | 1581 |
| 1934 | 2609 |
| 1935 | 4158 |
| 1936 | 992 |
| 1937 | 1448 |
| 1938 | 2388 |
| 1939 | 4648 |
| 1940 | 882 |
| 1941 | 2634 |
| 1942 | 1697 |
| 1943 | 5153 |
| 1944 | 2229 |
| 1945 | 1379 |
| 1946 | 639 |
| 1947 | 4377 |
| 1948 | 2333 |
| 1949 | 1207 |
| 1950 | 3204 |
| 1951 | 4268 |
| 1952 | 1801 |
| 1953 | 2630 |
| 1954 | 963 |
| 1955 | 4374 |
| 1956 | 1476 |
| 1957 | 2253 |
| 1958 | 502 |
| 1959 | 4738 |
| 1960 | 2442 |
| 1961 | 1636 |
| 1962 | 2691 |
| 1963 | 4199 |
| 1964 | 1366 |
| 1965 | 855 |

TABLE Q9-continued

| with a sequence length of 8192: | |
|---|---|
| Polarized channel sequence number | Reliability or reliability sequence number |
| 1966 | 3093 |
| 1967 | 4305 |
| 1968 | 1587 |
| 1969 | 2230 |
| 1970 | 1265 |
| 1971 | 6208 |
| 1972 | 2347 |
| 1973 | 937 |
| 1974 | 1427 |
| 1975 | 4390 |
| 1976 | 2604 |
| 1977 | 747 |
| 1978 | 2259 |
| 1979 | 5249 |
| 1980 | 1729 |
| 1981 | 3107 |
| 1982 | 1231 |
| 1983 | 4676 |
| 1984 | 884 |
| 1985 | 2402 |
| 1986 | 4274 |
| 1987 | 1582 |
| 1988 | 2832 |
| 1989 | 1340 |
| 1990 | 4448 |
| 1991 | 2143 |
| 1992 | 924 |
| 1993 | 3098 |
| 1994 | 4189 |
| 1995 | 1798 |
| 1996 | 734 |
| 1997 | 2450 |
| 1998 | 4627 |
| 1999 | 1421 |
| 2000 | 2641 |
| 2001 | 1611 |
| 2002 | 4297 |
| 2003 | 2233 |
| 2004 | 505 |
| 2005 | 1260 |
| 2006 | 5185 |
| 2007 | 2392 |
| 2008 | 1369 |
| 2009 | 3152 |
| 2010 | 4496 |
| 2011 | 965 |
| 2012 | 2610 |
| 2013 | 4203 |
| 2014 | 1684 |
| 2015 | 2288 |
| 2016 | 1456 |
| 2017 | 6153 |
| 2018 | 829 |
| 2019 | 2334 |
| 2020 | 1640 |
| 2021 | 4621 |
| 2022 | 2693 |
| 2023 | 1211 |
| 2024 | 3109 |
| 2025 | 4419 |
| 2026 | 938 |
| 2027 | 1809 |
| 2028 | 2254 |
| 2029 | 4239 |
| 2030 | 749 |
| 2031 | 2633 |
| 2032 | 5140 |
| 2033 | 1381 |
| 2034 | 2444 |
| 2035 | 1698 |
| 2036 | 4393 |
| 2037 | 2375 |
| 2038 | 859 |
| 2039 | 1311 |
| 2040 | 4656 |

TABLE Q9-continued

| with a sequence length of 8192: | |
|---|---|
| Polarized channel sequence number | Reliability or reliability sequence number |
| 2041 | 3208 |
| 2042 | 1589 |
| 2043 | 2575 |
| 2044 | 4276 |
| 2045 | 945 |
| 2046 | 2159 |
| 2047 | 1150 |
| 2048 | 4190 |
| 2049 | 2349 |
| 2050 | 1613 |
| 2051 | 4380 |
| 2052 | 506 |
| 2053 | 3097 |
| 2054 | 1422 |
| 2055 | 4622 |
| 2056 | 2612 |
| 2057 | 1370 |
| 2058 | 2261 |
| 2059 | 5154 |
| 2060 | 888 |
| 2061 | 2848 |
| 2062 | 1688 |
| 2063 | 6150 |
| 2064 | 755 |
| 2065 | 2465 |
| 2066 | 4247 |
| 2067 | 1266 |
| 2068 | 3094 |
| 2069 | 1802 |
| 2070 | 4421 |
| 2071 | 2234 |
| 2072 | 970 |
| 2073 | 2752 |
| 2074 | 4300 |
| 2075 | 1480 |
| 2076 | 2404 |
| 2077 | 4680 |
| 2078 | 1590 |
| 2079 | 966 |
| 2080 | 2275 |
| 2081 | 4512 |
| 2082 | 1382 |
| 2083 | 3586 |
| 2084 | 1700 |
| 2085 | 4205 |
| 2086 | 2583 |
| 2087 | 830 |
| 2088 | 2355 |
| 2089 | 5144 |
| 2090 | 1239 |
| 2091 | 1619 |
| 2092 | 4866 |
| 2093 | 2636 |
| 2094 | 940 |
| 2095 | 3332 |
| 2096 | 4394 |
| 2097 | 1429 |
| 2098 | 2497 |
| 2099 | 1810 |
| 2100 | 4306 |
| 2101 | 2262 |
| 2102 | 447 |
| 2103 | 6161 |
| 2104 | 2697 |
| 2105 | 1385 |
| 2106 | 1593 |
| 2107 | 4280 |
| 2108 | 2350 |
| 2109 | 750 |
| 2110 | 3110 |
| 2111 | 4740 |
| 2112 | 1268 |
| 2113 | 2167 |
| 2114 | 5377 |
| 2115 | 1671 |

TABLE Q9-continued

| with a sequence length of 8192: | |
|---|---|
| Polarized channel sequence number | Reliability or reliability sequence number |
| 2116 | 2642 |
| 2117 | 871 |
| 2118 | 4401 |
| 2119 | 2379 |
| 2120 | 1443 |
| 2121 | 3168 |
| 2122 | 4211 |
| 2123 | 1648 |
| 2124 | 977 |
| 2125 | 4426 |
| 2126 | 2616 |
| 2127 | 1372 |
| 2128 | 2236 |
| 2129 | 4629 |
| 2130 | 946 |
| 2131 | 2452 |
| 2132 | 4251 |
| 2133 | 1213 |
| 2134 | 2944 |
| 2135 | 1804 |
| 2136 | 5156 |
| 2137 | 3216 |
| 2138 | 757 |
| 2139 | 2408 |
| 2140 | 4422 |
| 2141 | 1327 |
| 2142 | 1730 |
| 2143 | 6154 |
| 2144 | 2265 |
| 2145 | 861 |
| 2146 | 2587 |
| 2147 | 4643 |
| 2148 | 1386 |
| 2149 | 3139 |
| 2150 | 4321 |
| 2151 | 1614 |
| 2152 | 2466 |
| 2153 | 969 |
| 2154 | 4483 |
| 2155 | 2694 |
| 2156 | 1434 |
| 2157 | 2277 |
| 2158 | 4206 |
| 2159 | 1675 |
| 2160 | 508 |
| 2161 | 4634 |
| 2162 | 3113 |
| 2163 | 1243 |
| 2164 | 2357 |
| 2165 | 5127 |
| 2166 | 1825 |
| 2167 | 2657 |
| 2168 | 4396 |
| 2169 | 875 |
| 2170 | 2381 |
| 2171 | 1335 |
| 2172 | 4263 |
| 2173 | 2599 |
| 2174 | 1621 |
| 2175 | 3100 |
| 2176 | 4688 |
| 2177 | 758 |
| 2178 | 2207 |
| 2179 | 4433 |
| 2180 | 1488 |
| 2181 | 1594 |
| 2182 | 2456 |
| 2183 | 6162 |
| 2184 | 1272 |
| 2185 | 2819 |
| 2186 | 4308 |
| 2187 | 911 |
| 2188 | 3141 |
| 2189 | 1704 |
| 2190 | 5186 |

TABLE Q9-continued

| with a sequence length of 8192: | |
|---|---|
| Polarized channel sequence number | Reliability or reliability sequence number |
| 2191 | 2171 |
| 2192 | 1393 |
| 2193 | 4402 |
| 2194 | 2705 |
| 2195 | 948 |
| 2196 | 2358 |
| 2197 | 4645 |
| 2198 | 1921 |
| 2199 | 3232 |
| 2200 | 4213 |
| 2201 | 1445 |
| 2202 | 2266 |
| 2203 | 862 |
| 2204 | 4253 |
| 2205 | 1635 |
| 2206 | 2644 |
| 2207 | 4744 |
| 2208 | 1214 |
| 2209 | 2468 |
| 2210 | 919 |
| 2211 | 5131 |
| 2212 | 3336 |
| 2213 | 1732 |
| 2214 | 4485 |
| 2215 | 2589 |
| 2216 | 1433 |
| 2217 | 2387 |
| 2218 | 6156 |
| 2219 | 761 |
| 2220 | 2698 |
| 2221 | 4267 |
| 2222 | 1857 |
| 2223 | 3114 |
| 2224 | 1359 |
| 2225 | 4425 |
| 2226 | 2278 |
| 2227 | 479 |
| 2228 | 4633 |
| 2229 | 2361 |
| 2230 | 1622 |
| 2231 | 2603 |
| 2232 | 4214 |
| 2233 | 1430 |
| 2234 | 972 |
| 2235 | 5160 |
| 2236 | 3121 |
| 2237 | 1683 |
| 2238 | 2439 |
| 2239 | 4367 |
| 2240 | 1255 |
| 2241 | 2821 |
| 2242 | 4630 |
| 2243 | 877 |
| 2244 | 2281 |
| 2245 | 1596 |
| 2246 | 4322 |
| 2247 | 3146 |
| 2248 | 1388 |
| 2249 | 4404 |
| 2250 | 2416 |
| 2251 | 978 |
| 2252 | 6177 |
| 2253 | 2658 |
| 2254 | 1812 |
| 2255 | 2268 |
| 2256 | 5250 |
| 2257 | 1446 |
| 2258 | 3588 |
| 2259 | 4868 |
| 2260 | 1245 |
| 2261 | 2706 |
| 2262 | 952 |
| 2263 | 4312 |
| 2264 | 2498 |
| 2265 | 1339 |

TABLE Q9-continued with a sequence length of 8192:

| Polarized channel sequence number | Reliability or reliability sequence number |
|---|---|
| 2266 | 4544 |
| 2267 | 2382 |
| 2268 | 1677 |
| 2269 | 762 |
| 2270 | 4646 |
| 2271 | 3142 |
| 2272 | 1504 |
| 2273 | 4217 |
| 2274 | 2648 |
| 2275 | 1625 |
| 2276 | 5633 |
| 2277 | 2223 |
| 2278 | 883 |
| 2279 | 2590 |
| 2280 | 4375 |
| 2281 | 1394 |
| 2282 | 3203 |
| 2283 | 4254 |
| 2284 | 1826 |
| 2285 | 2443 |
| 2286 | 923 |
| 2287 | 6273 |
| 2288 | 2880 |
| 2289 | 1151 |
| 2290 | 4704 |
| 2291 | 2173 |
| 2292 | 1712 |
| 2293 | 4428 |
| 2294 | 3116 |
| 2295 | 993 |
| 2296 | 2389 |
| 2297 | 4295 |
| 2298 | 1475 |
| 2299 | 2700 |
| 2300 | 5188 |
| 2301 | 1637 |
| 2302 | 2362 |
| 2303 | 1367 |
| 2304 | 4752 |
| 2305 | 3344 |
| 2306 | 495 |
| 2307 | 4489 |
| 2308 | 2631 |
| 2309 | 1567 |
| 2310 | 4269 |
| 2311 | 2282 |
| 2312 | 1449 |
| 2313 | 2605 |
| 2314 | 4675 |
| 2315 | 878 |
| 2316 | 3153 |
| 2317 | 5139 |
| 2318 | 1816 |
| 2319 | 2472 |
| 2320 | 6209 |
| 2321 | 1259 |
| 2322 | 2721 |
| 2323 | 703 |
| 2324 | 4218 |
| 2325 | 2403 |
| 2326 | 1678 |
| 2327 | 4324 |
| 2328 | 3122 |
| 2329 | 1396 |
| 2330 | 4649 |
| 2331 | 2231 |
| 2332 | 935 |
| 2333 | 2825 |
| 2334 | 4434 |
| 2335 | 1626 |
| 2336 | 2500 |
| 2337 | 5133 |
| 2338 | 1436 |
| 2339 | 3205 |
| 2340 | 4275 |

TABLE Q9-continued with a sequence length of 8192:

| Polarized channel sequence number | Reliability or reliability sequence number |
|---|---|
| 2341 | 1828 |
| 2342 | 2660 |
| 2343 | 980 |
| 2344 | 4636 |
| 2345 | 2390 |
| 2346 | 1246 |
| 2347 | 4408 |
| 2348 | 2611 |
| 2349 | 1736 |
| 2350 | 6164 |
| 2351 | 3145 |
| 2352 | 885 |
| 2353 | 2289 |
| 2354 | 4270 |
| 2355 | 1477 |
| 2356 | 2451 |
| 2357 | 4677 |
| 2358 | 1638 |
| 2359 | 2753 |
| 2360 | 5168 |
| 2361 | 1341 |
| 2362 | 3087 |
| 2363 | 4379 |
| 2364 | 925 |
| 2365 | 2255 |
| 2366 | 1799 |
| 2367 | 4159 |
| 2368 | 2606 |
| 2369 | 1450 |
| 2370 | 4486 |
| 2371 | 3124 |
| 2372 | 939 |
| 2373 | 4768 |
| 2374 | 2364 |
| 2375 | 1685 |
| 2376 | 2822 |
| 2377 | 5134 |
| 2378 | 1261 |
| 2379 | 2445 |
| 2380 | 4299 |
| 2381 | 764 |
| 2382 | 3360 |
| 2383 | 6178 |
| 2384 | 1641 |
| 2385 | 2635 |
| 2386 | 4449 |
| 2387 | 1699 |
| 2388 | 2284 |
| 2389 | 1371 |
| 2390 | 4872 |
| 2391 | 2393 |
| 2392 | 503 |
| 2393 | 4328 |
| 2394 | 3592 |
| 2395 | 1858 |
| 2396 | 5192 |
| 2397 | 2708 |
| 2398 | 1457 |
| 2399 | 4391 |
| 2400 | 2480 |
| 2401 | 886 |
| 2402 | 3264 |
| 2403 | 4650 |
| 2404 | 1628 |
| 2405 | 2664 |
| 2406 | 4220 |
| 2407 | 1400 |
| 2408 | 2235 |
| 2409 | 4497 |
| 2410 | 1583 |
| 2411 | 2833 |
| 2412 | 6168 |
| 2413 | 994 |
| 2414 | 3095 |
| 2415 | 5378 |

TABLE Q9-continued

| with a sequence length of 8192: | |
|---|---|
| Polarized channel sequence number | Reliability or reliability sequence number |
| 2416 | 1267 |
| 2417 | 2405 |
| 2418 | 1803 |
| 2419 | 4657 |
| 2420 | 2722 |
| 2421 | 984 |
| 2422 | 4436 |
| 2423 | 2335 |
| 2424 | 1482 |
| 2425 | 4682 |
| 2426 | 3148 |
| 2427 | 1642 |
| 2428 | 4277 |
| 2429 | 2613 |
| 2430 | 1478 |
| 2431 | 2174 |
| 2432 | 4381 |
| 2433 | 889 |
| 2434 | 3209 |
| 2435 | 5252 |
| 2436 | 1690 |
| 2437 | 2637 |
| 2438 | 6401 |
| 2439 | 1342 |
| 2440 | 2446 |
| 2441 | 4678 |
| 2442 | 735 |
| 2443 | 2394 |
| 2444 | 4301 |
| 2445 | 1832 |
| 2446 | 3154 |
| 2447 | 4490 |
| 2448 | 1452 |
| 2449 | 2712 |
| 2450 | 1591 |
| 2451 | 4739 |
| 2452 | 2290 |
| 2453 | 926 |
| 2454 | 5141 |
| 2455 | 1262 |
| 2456 | 1744 |
| 2457 | 4278 |
| 2458 | 3128 |
| 2459 | 967 |
| 2460 | 4395 |
| 2461 | 2826 |
| 2462 | 1383 |
| 2463 | 4652 |
| 2464 | 2504 |
| 2465 | 1922 |
| 2466 | 6180 |
| 2467 | 2614 |
| 2468 | 1649 |
| 2469 | 3456 |
| 2470 | 4307 |
| 2471 | 941 |
| 2472 | 2406 |
| 2473 | 5155 |
| 2474 | 1489 |
| 2475 | 2724 |
| 2476 | 4450 |
| 2477 | 1701 |
| 2478 | 3099 |
| 2479 | 4880 |
| 2480 | 890 |
| 2481 | 2263 |
| 2482 | 4191 |
| 2483 | 1458 |
| 2484 | 2643 |
| 2485 | 5146 |
| 2486 | 1860 |
| 2487 | 2453 |
| 2488 | 4498 |
| 2489 | 1269 |
| 2490 | 3206 |

TABLE Q9-continued

| with a sequence length of 8192: | |
|---|---|
| Polarized channel sequence number | Reliability or reliability sequence number |
| 2491 | 996 |
| 2492 | 4689 |
| 2493 | 2834 |
| 2494 | 1689 |
| 2495 | 6151 |
| 2496 | 2409 |
| 2497 | 1373 |
| 2498 | 4281 |
| 2499 | 3169 |
| 2500 | 1615 |
| 2501 | 4440 |
| 2502 | 2617 |
| 2503 | 507 |
| 2504 | 5200 |
| 2505 | 2292 |
| 2506 | 1481 |
| 2507 | 4658 |
| 2508 | 2695 |
| 2509 | 1811 |
| 2510 | 4336 |
| 2511 | 3600 |
| 2512 | 947 |
| 2513 | 4382 |
| 2514 | 2467 |
| 2515 | 1686 |
| 2516 | 4741 |
| 2517 | 2672 |
| 2518 | 1387 |
| 2519 | 3111 |
| 2520 | 6210 |
| 2521 | 1644 |
| 2522 | 2396 |
| 2523 | 5157 |
| 2524 | 751 |
| 2525 | 2237 |
| 2526 | 4302 |
| 2527 | 1270 |
| 2528 | 2828 |
| 2529 | 4681 |
| 2530 | 1805 |
| 2531 | 3331 |
| 2532 | 4492 |
| 2533 | 1423 |
| 2534 | 2351 |
| 2535 | 4423 |
| 2536 | 942 |
| 2537 | 2754 |
| 2538 | 5256 |
| 2539 | 1702 |
| 2540 | 3217 |
| 2541 | 4623 |
| 2542 | 1460 |
| 2543 | 2410 |
| 2544 | 6155 |
| 2545 | 1595 |
| 2546 | 2638 |
| 2547 | 4207 |
| 2548 | 831 |
| 2549 | 2458 |
| 2550 | 4397 |
| 2551 | 1374 |
| 2552 | 3156 |
| 2553 | 5145 |
| 2554 | 1840 |
| 2555 | 2699 |
| 2556 | 4660 |
| 2557 | 971 |
| 2558 | 2267 |
| 2559 | 1760 |
| 2560 | 4309 |
| 2561 | 3101 |
| 2562 | 1431 |
| 2563 | 4896 |
| 2564 | 2849 |
| 2565 | 1650 |

TABLE Q9-continued

| with a sequence length of 8192: | |
|---|---|
| Polarized channel sequence number | Reliability or reliability sequence number |
| 2566 | 4513 |
| 2567 | 2359 |
| 2568 | 1000 |
| 2569 | 6184 |
| 2570 | 3210 |
| 2571 | 1273 |
| 2572 | 5142 |
| 2573 | 2645 |
| 2574 | 1806 |
| 2575 | 4282 |
| 2576 | 2512 |
| 2577 | 1484 |
| 2578 | 4800 |
| 2579 | 2618 |
| 2580 | 892 |
| 2581 | 4452 |
| 2582 | 3115 |
| 2583 | 1731 |
| 2584 | 4323 |
| 2585 | 2296 |
| 2586 | 1864 |
| 2587 | 5634 |
| 2588 | 2728 |
| 2589 | 1389 |
| 2590 | 4631 |
| 2591 | 3333 |
| 2592 | 949 |
| 2593 | 6274 |
| 2594 | 2417 |
| 2595 | 1623 |
| 2596 | 4403 |
| 2597 | 2945 |
| 2598 | 1490 |
| 2599 | 4684 |
| 2600 | 3616 |
| 2601 | 1705 |
| 2602 | 5380 |
| 2603 | 2469 |
| 2604 | 759 |
| 2605 | 4545 |
| 2606 | 2659 |
| 2607 | 1464 |
| 2608 | 4310 |
| 2609 | 3170 |
| 2610 | 1924 |
| 2611 | 4745 |
| 2612 | 2238 |
| 2613 | 1274 |
| 2614 | 4398 |
| 2615 | 2756 |
| 2616 | 973 |
| 2617 | 6657 |
| 2618 | 2457 |
| 2619 | 1652 |
| 2620 | 5158 |
| 2621 | 3218 |
| 2622 | 1692 |
| 2623 | 4215 |
| 2624 | 2881 |
| 2625 | 1395 |
| 2626 | 4690 |
| 2627 | 2383 |
| 2628 | 950 |
| 2629 | 4427 |
| 2630 | 3160 |
| 2631 | 1813 |
| 2632 | 5216 |
| 2633 | 2646 |
| 2634 | 1435 |
| 2635 | 4664 |
| 2636 | 2454 |
| 2637 | 1733 |
| 2638 | 4284 |
| 2639 | 3102 |
| 2640 | 509 |

TABLE Q9-continued

| with a sequence length of 8192: | |
|---|---|
| Polarized channel sequence number | Reliability or reliability sequence number |
| 2641 | 6212 |
| 2642 | 2707 |
| 2643 | 2279 |
| 2644 | 4500 |
| 2645 | 1827 |
| 2646 | 4992 |
| 2647 | 3392 |
| 2648 | 1505 |
| 2649 | 5264 |
| 2650 | 2620 |
| 2651 | 1597 |
| 2652 | 4456 |
| 2653 | 2412 |
| 2654 | 979 |
| 2655 | 4313 |
| 2656 | 3212 |
| 2657 | 1390 |
| 2658 | 4635 |
| 2659 | 2836 |
| 2660 | 1706 |
| 2661 | 5187 |
| 2662 | 2470 |
| 2663 | 1215 |
| 2664 | 6163 |
| 2665 | 2269 |
| 2666 | 863 |
| 2667 | 4514 |
| 2668 | 3143 |
| 2669 | 1818 |
| 2670 | 4742 |
| 2671 | 2363 |
| 2672 | 1627 |
| 2673 | 4325 |
| 2674 | 2701 |
| 2675 | 1447 |
| 2676 | 5161 |
| 2677 | 3117 |
| 2678 | 953 |
| 2679 | 4405 |
| 2680 | 2528 |
| 2681 | 1713 |
| 2682 | 4705 |
| 2683 | 2649 |
| 2684 | 3712 |
| 2685 | 6157 |
| 2686 | 1492 |
| 2687 | 2418 |
| 2688 | 4429 |
| 2689 | 1872 |
| 2690 | 4647 |
| 2691 | 2850 |
| 2692 | 1008 |
| 2693 | 5148 |
| 2694 | 3233 |
| 2695 | 1656 |
| 2696 | 4255 |
| 2697 | 2175 |
| 2698 | 1397 |
| 2699 | 4504 |
| 2700 | 2736 |
| 2701 | 1829 |
| 2702 | 4867 |
| 2703 | 3337 |
| 2704 | 763 |
| 2705 | 5189 |
| 2706 | 2499 |
| 2707 | 1437 |
| 2708 | 6192 |
| 2709 | 2661 |
| 2710 | 1738 |
| 2711 | 4219 |
| 2712 | 3172 |
| 2713 | 1451 |
| 2714 | 4753 |
| 2715 | 2391 |

TABLE Q9-continued

| with a sequence length of 8192: | |
|---|---|
| Polarized channel sequence number | Reliability or reliability sequence number |
| 2716 | 4406 |
| 2717 | 2591 |
| 2718 | 974 |
| 2719 | 5280 |
| 2720 | 3123 |
| 2721 | 1734 |
| 2722 | 4314 |
| 2723 | 2473 |
| 2724 | 1928 |
| 2725 | 4692 |
| 2726 | 2840 |
| 2727 | 1276 |
| 2728 | 6158 |
| 2729 | 3265 |
| 2730 | 879 |
| 2731 | 4516 |
| 2732 | 2283 |
| 2733 | 1598 |
| 2734 | 5384 |
| 2735 | 2702 |
| 2736 | 1398 |
| 2737 | 4637 |
| 2738 | 2420 |
| 2739 | 4435 |
| 2740 | 1817 |
| 2741 | 3118 |
| 2742 | 4746 |
| 2743 | 2650 |
| 2744 | 1708 |
| 2745 | 5162 |
| 2746 | 2460 |
| 2747 | 981 |
| 2748 | 7169 |
| 2749 | 3334 |
| 2750 | 1506 |
| 2751 | 4326 |
| 2752 | 2852 |
| 2753 | 1814 |
| 2754 | 4409 |
| 2755 | 2270 |
| 2756 | 4651 |
| 2757 | 1496 |
| 2758 | 3840 |
| 2759 | 5169 |
| 2760 | 954 |
| 2761 | 2760 |
| 2762 | 4487 |
| 2763 | 1639 |
| 2764 | 2501 |
| 2765 | 4869 |
| 2766 | 3147 |
| 2767 | 1745 |
| 2768 | 4329 |
| 2769 | 2662 |
| 2770 | 1401 |
| 2771 | 6216 |
| 2772 | 2365 |
| 2773 | 5194 |
| 2774 | 995 |
| 2775 | 3220 |
| 2776 | 4464 |
| 2777 | 1830 |
| 2778 | 2823 |
| 2779 | 4706 |
| 2780 | 1714 |
| 2781 | 2474 |
| 2782 | 4316 |
| 2783 | 1247 |
| 2784 | 3176 |
| 2785 | 5636 |
| 2786 | 2709 |
| 2787 | 982 |
| 2788 | 4754 |
| 2789 | 2285 |
| 2790 | 6402 |

TABLE Q9-continued

| with a sequence length of 8192: | |
|---|---|
| Polarized channel sequence number | Reliability or reliability sequence number |
| 2791 | 1888 |
| 2792 | 3345 |
| 2793 | 4546 |
| 2794 | 1438 |
| 2795 | 2665 |
| 2796 | 4430 |
| 2797 | 1629 |
| 2798 | 2723 |
| 2799 | 5190 |
| 2800 | 1737 |
| 2801 | 3234 |
| 2802 | 4696 |
| 2803 | 887 |
| 2804 | 4271 |
| 2805 | 2395 |
| 2806 | 3125 |
| 2807 | 4638 |
| 2808 | 1479 |
| 2809 | 2882 |
| 2810 | 6276 |
| 2811 | 1936 |
| 2812 | 2481 |
| 2813 | 5251 |
| 2814 | 1453 |
| 2815 | 3149 |
| 2816 | 4491 |
| 2817 | 956 |
| 2818 | 4928 |
| 2819 | 2652 |
| 2820 | 1643 |
| 2821 | 4221 |
| 2822 | 2424 |
| 2823 | 1859 |
| 2824 | 5164 |
| 2825 | 3587 |
| 2826 | 2607 |
| 2827 | 6165 |
| 2828 | 1402 |
| 2829 | 4437 |
| 2830 | 2291 |
| 2831 | 1679 |
| 2832 | 4748 |
| 2833 | 3224 |
| 2834 | 510 |
| 2835 | 4410 |
| 2836 | 2827 |
| 2837 | 1833 |
| 2838 | 5392 |
| 2839 | 2506 |
| 2840 | 4679 |
| 2841 | 3338 |
| 2842 | 1508 |
| 2843 | 4330 |
| 2844 | 2666 |
| 2845 | 1716 |
| 2846 | 6179 |
| 2847 | 2502 |
| 2848 | 765 |
| 2849 | 4653 |
| 2850 | 3126 |
| 2851 | 5201 |
| 2852 | 1459 |
| 2853 | 2714 |
| 2854 | 4520 |
| 2855 | 1630 |
| 2856 | 2366 |
| 2857 | 4769 |
| 2858 | 3236 |
| 2859 | 1820 |
| 2860 | 4451 |
| 2861 | 2856 |
| 2862 | 5170 |
| 2863 | 1263 |
| 2864 | 2476 |
| 2865 | 6170 |

TABLE Q9-continued

| with a sequence length of 8192: | |
|---|---|
| Polarized channel sequence number | Reliability or reliability sequence number |
| 2866 | 985 |
| 2867 | 3155 |
| 2868 | 4279 |
| 2869 | 1687 |
| 2870 | 2615 |
| 2871 | 4873 |
| 2872 | 1861 |
| 2873 | 4548 |
| 2874 | 2286 |
| 2875 | 3346 |
| 2876 | 5253 |
| 2877 | 1454 |
| 2878 | 2768 |
| 2879 | 4708 |
| 2880 | 1740 |
| 2881 | 3589 |
| 2882 | 4438 |
| 2883 | 997 |
| 2884 | 6224 |
| 2885 | 2407 |
| 2886 | 1343 |
| 2887 | 4659 |
| 2888 | 2946 |
| 2889 | 3129 |
| 2890 | 5193 |
| 2891 | 1952 |
| 2892 | 4337 |
| 2893 | 2673 |
| 2894 | 1645 |
| 2895 | 4499 |
| 2896 | 2513 |
| 2897 | 927 |
| 2898 | 4801 |
| 2899 | 3207 |
| 2900 | 1483 |
| 2901 | 6181 |
| 2902 | 2725 |
| 2903 | 5135 |
| 2904 | 2482 |
| 2905 | 1834 |
| 2906 | 4303 |
| 2907 | 3184 |
| 2908 | 1746 |
| 2909 | 4654 |
| 2910 | 2884 |
| 2911 | 5172 |
| 2912 | 1512 |
| 2913 | 2293 |
| 2914 | 4412 |
| 2915 | 891 |
| 2916 | 3340 |
| 2917 | 4870 |
| 2918 | 2713 |
| 2919 | 6280 |
| 2920 | 1720 |
| 2921 | 2397 |
| 2922 | 4493 |
| 2923 | 1841 |
| 2924 | 3266 |
| 2925 | 5408 |
| 2926 | 1404 |
| 2927 | 4683 |
| 2928 | 2639 |
| 2929 | 3150 |
| 2930 | 4332 |
| 2931 | 1651 |
| 2932 | 2505 |
| 2933 | 4441 |
| 2934 | 986 |
| 2935 | 6169 |
| 2936 | 2835 |
| 2937 | 1461 |
| 2938 | 5640 |
| 2939 | 3648 |
| 2940 | 1866 |

TABLE Q9-continued

| with a sequence length of 8192: | |
|---|---|
| Polarized channel sequence number | Reliability or reliability sequence number |
| 2941 | 4756 |
| 2942 | 2710 |
| 2943 | 2411 |
| 2944 | 4528 |
| 2945 | 1691 |
| 2946 | 5312 |
| 2947 | 3211 |
| 2948 | 1271 |
| 2949 | 4712 |
| 2950 | 2668 |
| 2951 | 4283 |
| 2952 | 998 |
| 2953 | 2294 |
| 2954 | 6166 |
| 2955 | 3361 |
| 2956 | 1862 |
| 2957 | 4881 |
| 2958 | 2829 |
| 2959 | 5143 |
| 2960 | 1761 |
| 2961 | 3157 |
| 2962 | 4453 |
| 2963 | 1485 |
| 2964 | 2447 |
| 2965 | 4770 |
| 2966 | 1923 |
| 2967 | 4383 |
| 2968 | 2726 |
| 2969 | 3130 |
| 2970 | 6658 |
| 2971 | 1001 |
| 2972 | 2484 |
| 2973 | 5196 |
| 2974 | 1646 |
| 2975 | 4661 |
| 2976 | 2619 |
| 2977 | 1462 |
| 2978 | 4222 |
| 2979 | 3240 |
| 2980 | 2398 |
| 2981 | 5257 |
| 2982 | 1836 |
| 2983 | 4685 |
| 2984 | 3457 |
| 2985 | 988 |
| 2986 | 6404 |
| 2987 | 2864 |
| 2988 | 1703 |
| 2989 | 4494 |
| 2990 | 2784 |
| 2991 | 4442 |
| 2992 | 3593 |
| 2993 | 1491 |
| 2994 | 5202 |
| 2995 | 2455 |
| 2996 | 4760 |
| 2997 | 1873 |
| 2998 | 2674 |
| 2999 | 4338 |
| 3000 | 1748 |
| 3001 | 3171 |
| 3002 | 5176 |
| 3003 | 2297 |
| 3004 | 6182 |
| 3005 | 943 |
| 3006 | 3268 |
| 3007 | 4874 |
| 3008 | 1375 |
| 3009 | 4552 |
| 3010 | 2830 |
| 3011 | 1842 |
| 3012 | 4662 |
| 3013 | 2508 |
| 3014 | 3393 |
| 3015 | 5504 |

TABLE Q9-continued

| with a sequence length of 8192: | |
|---|---|
| Polarized channel sequence number | Reliability or reliability sequence number |
| 3016 | 1653 |
| 3017 | 4454 |
| 3018 | 2755 |
| 3019 | 1465 |
| 3020 | 6240 |
| 3021 | 2888 |
| 3022 | 4772 |
| 3023 | 1693 |
| 3024 | 3158 |
| 3025 | 5147 |
| 3026 | 2413 |
| 3027 | 766 |
| 3028 | 4311 |
| 3029 | 3219 |
| 3030 | 4691 |
| 3031 | 1520 |
| 3032 | 2647 |
| 3033 | 4501 |
| 3034 | 1925 |
| 3035 | 6288 |
| 3036 | 2514 |
| 3037 | 3590 |
| 3038 | 5254 |
| 3039 | 1707 |
| 3040 | 2729 |
| 3041 | 4882 |
| 3042 | 1275 |
| 3043 | 4457 |
| 3044 | 2488 |
| 3045 | 3132 |
| 3046 | 5217 |
| 3047 | 893 |
| 3048 | 4665 |
| 3049 | 2948 |
| 3050 | 1865 |
| 3051 | 6211 |
| 3052 | 3348 |
| 3053 | 1654 |
| 3054 | 4340 |
| 3055 | 2298 |
| 3056 | 4743 |
| 3057 | 2676 |
| 3058 | 1486 |
| 3059 | 5648 |
| 3060 | 3213 |
| 3061 | 4515 |
| 3062 | 1807 |
| 3063 | 2716 |
| 3064 | 4720 |
| 3065 | 1002 |
| 3066 | 6185 |
| 3067 | 2419 |
| 3068 | 3161 |
| 3069 | 5159 |
| 3070 | 1762 |
| 3071 | 2837 |
| 3072 | 4444 |
| 3073 | 1844 |
| 3074 | 4285 |
| 3075 | 3362 |
| 3076 | 2459 |
| 3077 | 4876 |
| 3078 | 1391 |
| 3079 | 5379 |
| 3080 | 2757 |
| 3081 | 1752 |
| 3082 | 6172 |
| 3083 | 3248 |
| 3084 | 4399 |
| 3085 | 951 |
| 3086 | 2851 |
| 3087 | 4802 |
| 3088 | 3601 |
| 3089 | 5265 |
| 3090 | 1984 |

TABLE Q9-continued

| with a sequence length of 8192: | |
|---|---|
| Polarized channel sequence number | Reliability or reliability sequence number |
| 3091 | 2529 |
| 3092 | 4458 |
| 3093 | 1493 |
| 3094 | 4686 |
| 3095 | 2621 |
| 3096 | 3173 |
| 3097 | 6213 |
| 3098 | 1657 |
| 3099 | 2414 |
| 3100 | 4506 |
| 3101 | 1815 |
| 3102 | 5204 |
| 3103 | 2730 |
| 3104 | 1466 |
| 3105 | 4747 |
| 3106 | 3103 |
| 3107 | 4315 |
| 3108 | 2239 |
| 3109 | 1009 |
| 3110 | 5149 |
| 3111 | 3352 |
| 3112 | 6304 |
| 3113 | 1694 |
| 3114 | 2842 |
| 3115 | 4897 |
| 3116 | 2651 |
| 3117 | 4407 |
| 3118 | 1868 |
| 3119 | 3214 |
| 3120 | 5258 |
| 3121 | 1507 |
| 3122 | 4693 |
| 3123 | 2471 |
| 3124 | 3162 |
| 3125 | 6408 |
| 3126 | 1735 |
| 3127 | 4560 |
| 3128 | 2737 |
| 3129 | 975 |
| 3130 | 4666 |
| 3131 | 2516 |
| 3132 | 5163 |
| 3133 | 1929 |
| 3134 | 3594 |
| 3135 | 4344 |
| 3136 | 2896 |
| 3137 | 4776 |
| 3138 | 1494 |
| 3139 | 3364 |
| 3140 | 6186 |
| 3141 | 1709 |
| 3142 | 5381 |
| 3143 | 2680 |
| 3144 | 2421 |
| 3145 | 4465 |
| 3146 | 1658 |
| 3147 | 4993 |
| 3148 | 3272 |
| 3149 | 1004 |
| 3150 | 5664 |
| 3151 | 2853 |
| 3152 | 4517 |
| 3153 | 3174 |
| 3154 | 1399 |
| 3155 | 6193 |
| 3156 | 2461 |
| 3157 | 4707 |
| 3158 | 1764 |
| 3159 | 2762 |
| 3160 | 5218 |
| 3161 | 3335 |
| 3162 | 4286 |
| 3163 | 1874 |
| 3164 | 2475 |
| 3165 | 4804 |

TABLE Q9-continued

| with a sequence length of 8192: | |
|---|---|
| Polarized channel sequence number | Reliability or reliability sequence number |
| 3166 | 1468 |
| 3167 | 7170 |
| 3168 | 3602 |
| 3169 | 2758 |
| 3170 | 4505 |
| 3171 | 1715 |
| 3172 | 5266 |
| 3173 | 2952 |
| 3174 | 511 |
| 3175 | 4929 |
| 3176 | 3221 |
| 3177 | 4431 |
| 3178 | 2300 |
| 3179 | 1848 |
| 3180 | 5208 |
| 3181 | 3177 |
| 3182 | 6218 |
| 3183 | 1710 |
| 3184 | 2622 |
| 3185 | 4694 |
| 3186 | 2422 |
| 3187 | 4502 |
| 3188 | 1277 |
| 3189 | 3235 |
| 3190 | 5150 |
| 3191 | 1819 |
| 3192 | 4755 |
| 3193 | 2841 |
| 3194 | 3394 |
| 3195 | 4327 |
| 3196 | 1599 |
| 3197 | 6660 |
| 3198 | 2732 |
| 3199 | 955 |
| 3200 | 5440 |
| 3201 | 2530 |
| 3202 | 4668 |
| 3203 | 3164 |
| 3204 | 4460 |
| 3205 | 1497 |
| 3206 | 2838 |
| 3207 | 5260 |
| 3208 | 1926 |
| 3209 | 6214 |
| 3210 | 3596 |
| 3211 | 2520 |
| 3212 | 4884 |
| 3213 | 1739 |
| 3214 | 4518 |
| 3215 | 3119 |
| 3216 | 1509 |
| 3217 | 4317 |
| 3218 | 2663 |
| 3219 | 5191 |
| 3220 | 2769 |
| 3221 | 1889 |
| 3222 | 4411 |
| 3223 | 3339 |
| 3224 | 6275 |
| 3225 | 894 |
| 3226 | 4749 |
| 3227 | 2425 |
| 3228 | 3178 |
| 3229 | 5165 |
| 3230 | 1768 |
| 3231 | 4576 |
| 3232 | 2854 |
| 3233 | 1831 |
| 3234 | 4697 |
| 3235 | 2738 |
| 3236 | 6188 |
| 3237 | 3226 |
| 3238 | 1439 |
| 3239 | 5760 |
| 3240 | 2271 |

TABLE Q9-continued

| with a sequence length of 8192: | |
|---|---|
| Polarized channel sequence number | Reliability or reliability sequence number |
| 3241 | 4466 |
| 3242 | 1660 |
| 3243 | 3617 |
| 3244 | 4898 |
| 3245 | 2912 |
| 3246 | 5281 |
| 3247 | 1010 |
| 3248 | 6416 |
| 3249 | 2462 |
| 3250 | 1937 |
| 3251 | 4223 |
| 3252 | 3368 |
| 3253 | 4784 |
| 3254 | 2653 |
| 3255 | 1403 |
| 3256 | 5385 |
| 3257 | 3127 |
| 3258 | 4547 |
| 3259 | 2761 |
| 3260 | 4709 |
| 3261 | 1876 |
| 3262 | 3280 |
| 3263 | 6225 |
| 3264 | 1717 |
| 3265 | 5220 |
| 3266 | 2503 |
| 3267 | 2960 |
| 3268 | 4439 |
| 3269 | 1498 |
| 3270 | 4639 |
| 3271 | 3458 |
| 3272 | 983 |
| 3273 | 5171 |
| 3274 | 2477 |
| 3275 | 6194 |
| 3276 | 3713 |
| 3277 | 4521 |
| 3278 | 1821 |
| 3279 | 2667 |
| 3280 | 4888 |
| 3281 | 1741 |
| 3282 | 5313 |
| 3283 | 2883 |
| 3284 | 3185 |
| 3285 | 4331 |
| 3286 | 1930 |
| 3287 | 6277 |
| 3288 | 2426 |
| 3289 | 4750 |
| 3290 | 3237 |
| 3291 | 1510 |
| 3292 | 4468 |
| 3293 | 2703 |
| 3294 | 5166 |
| 3295 | 1718 |
| 3296 | 3396 |
| 3297 | 4698 |
| 3298 | 2857 |
| 3299 | 4508 |
| 3300 | 1012 |
| 3301 | 6217 |
| 3302 | 2532 |
| 3303 | 1835 |
| 3304 | 5382 |
| 3305 | 3225 |
| 3306 | 4900 |
| 3307 | 2740 |
| 3308 | 4318 |
| 3309 | 1513 |
| 3310 | 3151 |
| 3311 | 5888 |
| 3312 | 2483 |
| 3313 | 6159 |
| 3314 | 1747 |
| 3315 | 3649 |

TABLE Q9-continued

| with a sequence length of 8192: | |
|---|---|
| Polarized channel sequence number | Reliability or reliability sequence number |
| 3316 | 4808 |
| 3317 | 1890 |
| 3318 | 4549 |
| 3319 | 2654 |
| 3320 | 5195 |
| 3321 | 2844 |
| 3322 | 1631 |
| 3323 | 4710 |
| 3324 | 3347 |
| 3325 | 6196 |
| 3326 | 1500 |
| 3327 | 2287 |
| 3328 | 4413 |
| 3329 | 3222 |
| 3330 | 5268 |
| 3331 | 957 |
| 3332 | 4871 |
| 3333 | 2711 |
| 3334 | 3180 |
| 3335 | 4522 |
| 3336 | 1938 |
| 3337 | 6432 |
| 3338 | 2885 |
| 3339 | 5224 |
| 3340 | 1721 |
| 3341 | 2478 |
| 3342 | 4757 |
| 3343 | 3604 |
| 3344 | 4333 |
| 3345 | 1455 |
| 3346 | 5393 |
| 3347 | 2764 |
| 3348 | 3341 |
| 3349 | 6664 |
| 3350 | 1880 |
| 3351 | 4713 |
| 3352 | 2367 |
| 3353 | 4771 |
| 3354 | 1776 |
| 3355 | 3238 |
| 3356 | 5282 |
| 3357 | 2976 |
| 3358 | 4443 |
| 3359 | 767 |
| 3360 | 3131 |
| 3361 | 5173 |
| 3362 | 2669 |
| 3363 | 6336 |
| 3364 | 1822 |
| 3365 | 4930 |
| 3366 | 2507 |
| 3367 | 1278 |
| 3368 | 4529 |
| 3369 | 3376 |
| 3370 | 5197 |
| 3371 | 2858 |
| 3372 | 4700 |
| 3373 | 1742 |
| 3374 | 3618 |
| 3375 | 6167 |
| 3376 | 2770 |
| 3377 | 4472 |
| 3378 | 1932 |
| 3379 | 5635 |
| 3380 | 3296 |
| 3381 | 1863 |
| 3382 | 4655 |
| 3383 | 2536 |
| 3384 | 4339 |
| 3385 | 2744 |
| 3386 | 6220 |
| 3387 | 987 |
| 3388 | 3186 |
| 3389 | 5272 |
| 3390 | 2865 |

TABLE Q9-continued

| with a sequence length of 8192: | |
|---|---|
| Polarized channel sequence number | Reliability or reliability sequence number |
| 3391 | 4875 |
| 3392 | 1405 |
| 3393 | 4554 |
| 3394 | 3342 |
| 3395 | 1647 |
| 3396 | 5386 |
| 3397 | 2428 |
| 3398 | 6281 |
| 3399 | 3267 |
| 3400 | 4714 |
| 3401 | 1837 |
| 3402 | 2675 |
| 3403 | 4550 |
| 3404 | 3608 |
| 3405 | 5174 |
| 3406 | 1749 |
| 3407 | 4762 |
| 3408 | 2485 |
| 3409 | 7172 |
| 3410 | 1514 |
| 3411 | 2890 |
| 3412 | 4414 |
| 3413 | 3400 |
| 3414 | 5284 |
| 3415 | 1953 |
| 3416 | 4904 |
| 3417 | 2715 |
| 3418 | 3159 |
| 3419 | 4524 |
| 3420 | 1016 |
| 3421 | 6226 |
| 3422 | 2295 |
| 3423 | 5203 |
| 3424 | 1722 |
| 3425 | 3241 |
| 3426 | 4663 |
| 3427 | 2886 |
| 3428 | 4334 |
| 3429 | 1463 |
| 3430 | 6200 |
| 3431 | 3460 |
| 3432 | 2785 |
| 3433 | 5394 |
| 3434 | 1892 |
| 3435 | 4816 |
| 3436 | 2509 |
| 3437 | 5637 |
| 3438 | 3841 |
| 3439 | 4455 |
| 3440 | 1763 |
| 3441 | 2947 |
| 3442 | 6528 |
| 3443 | 1843 |
| 3444 | 4994 |
| 3445 | 3188 |
| 3446 | 5177 |
| 3447 | 2670 |
| 3448 | 1521 |
| 3449 | 4721 |
| 3450 | 3228 |
| 3451 | 4561 |
| 3452 | 2486 |
| 3453 | 6171 |
| 3454 | 958 |
| 3455 | 3349 |
| 3456 | 5255 |
| 3457 | 2860 |
| 3458 | 4773 |
| 3459 | 1985 |
| 3460 | 4530 |
| 3461 | 2727 |
| 3462 | 5232 |
| 3463 | 1750 |
| 3464 | 3620 |
| 3465 | 6278 |

TABLE Q9-continued

| with a sequence length of 8192: | |
|---|---|
| Polarized channel sequence number | Reliability or reliability sequence number |
| 3466 | 2515 |
| 3467 | 4932 |
| 3468 | 1838 |
| 3469 | 4341 |
| 3470 | 3269 |
| 3471 | 5388 |
| 3472 | 2897 |
| 3473 | 1487 |
| 3474 | 4761 |
| 3475 | 3363 |
| 3476 | 6241 |
| 3477 | 2772 |
| 3478 | 4445 |
| 3479 | 1655 |
| 3480 | 3133 |
| 3481 | 5314 |
| 3482 | 2399 |
| 3483 | 4687 |
| 3484 | 999 |
| 3485 | 5198 |
| 3486 | 3242 |
| 3487 | 6672 |
| 3488 | 1867 |
| 3489 | 2866 |
| 3490 | 4553 |
| 3491 | 3591 |
| 3492 | 4883 |
| 3493 | 1724 |
| 3494 | 5696 |
| 3495 | 2677 |
| 3496 | 6183 |
| 3497 | 2489 |
| 3498 | 1516 |
| 3499 | 4758 |
| 3500 | 3354 |
| 3501 | 4459 |
| 3502 | 2717 |
| 3503 | 5259 |
| 3504 | 1940 |
| 3505 | 4716 |
| 3506 | 3163 |
| 3507 | 1896 |
| 3508 | 6403 |
| 3509 | 2544 |
| 3510 | 4342 |
| 3511 | 3249 |
| 3512 | 5409 |
| 3513 | 1753 |
| 3514 | 4877 |
| 3515 | 2949 |
| 3516 | 3650 |
| 3517 | 5205 |
| 3518 | 1467 |
| 3519 | 6289 |
| 3520 | 2731 |
| 3521 | 4495 |
| 3522 | 3408 |
| 3523 | 4774 |
| 3524 | 989 |
| 3525 | 2299 |
| 3526 | 5178 |
| 3527 | 3192 |
| 3528 | 6228 |
| 3529 | 1954 |
| 3530 | 4532 |
| 3531 | 2889 |
| 3532 | 4667 |
| 3533 | 2678 |
| 3534 | 1765 |
| 3535 | 5288 |
| 3536 | 3365 |
| 3537 | 4446 |
| 3538 | 1845 |
| 3539 | 6173 |
| 3540 | 2510 |

TABLE Q9-continued

| with a sequence length of 8192: | |
|---|---|
| Polarized channel sequence number | Reliability or reliability sequence number |
| 3541 | 5505 |
| 3542 | 3274 |
| 3543 | 1406 |
| 3544 | 4912 |
| 3545 | 2831 |
| 3546 | 4832 |
| 3547 | 3595 |
| 3548 | 5641 |
| 3549 | 1869 |
| 3550 | 6282 |
| 3551 | 2786 |
| 3552 | 4503 |
| 3553 | 3270 |
| 3554 | 1695 |
| 3555 | 4722 |
| 3556 | 2868 |
| 3557 | 5219 |
| 3558 | 3464 |
| 3559 | 6187 |
| 3560 | 895 |
| 3561 | 4345 |
| 3562 | 2415 |
| 3563 | 3134 |
| 3564 | 5316 |
| 3565 | 1944 |
| 3566 | 4878 |
| 3567 | 2776 |
| 3568 | 4556 |
| 3569 | 3624 |
| 3570 | 6405 |
| 3571 | 1522 |
| 3572 | 5441 |
| 3573 | 3008 |
| 3574 | 1659 |
| 3575 | 4803 |
| 3576 | 2517 |
| 3577 | 4936 |
| 3578 | 3353 |
| 3579 | 7176 |
| 3580 | 1846 |
| 3581 | 5206 |
| 3582 | 2681 |
| 3583 | 3244 |
| 3584 | 4461 |
| 3585 | 1754 |
| 3586 | 5267 |
| 3587 | 2839 |
| 3588 | 4695 |
| 3589 | 3350 |
| 3590 | 6688 |
| 3591 | 1956 |
| 3592 | 4562 |
| 3593 | 2490 |
| 3594 | 3714 |
| 3595 | 5638 |
| 3596 | 1003 |
| 3597 | 4777 |
| 3598 | 2718 |
| 3599 | 6242 |
| 3600 | 3175 |
| 3601 | 4536 |
| 3602 | 1495 |
| 3603 | 5180 |
| 3604 | 2892 |
| 3605 | 3281 |
| 3606 | 4996 |
| 3607 | 1875 |
| 3608 | 5396 |
| 3609 | 2531 |
| 3610 | 6290 |
| 3611 | 3366 |
| 3612 | 4346 |
| 3613 | 1766 |
| 3614 | 4724 |
| 3615 | 2759 |

TABLE Q9-continued with a sequence length of 8192:

| Polarized channel sequence number | Reliability or reliability sequence number |
|---|---|
| 3616 | 5261 |
| 3617 | 3652 |
| 3618 | 1849 |
| 3619 | 6232 |
| 3620 | 2953 |
| 3621 | 4764 |
| 3622 | 3250 |
| 3623 | 4467 |
| 3624 | 1524 |
| 3625 | 5209 |
| 3626 | 2518 |
| 3627 | 4885 |
| 3628 | 3424 |
| 3629 | 1927 |
| 3630 | 6174 |
| 3631 | 2733 |
| 3632 | 5410 |
| 3633 | 3165 |
| 3634 | 4507 |
| 3635 | 1769 |
| 3636 | 4805 |
| 3637 | 2682 |
| 3638 | 6464 |
| 3639 | 990 |
| 3640 | 5296 |
| 3641 | 2423 |
| 3642 | 3603 |
| 3643 | 4899 |
| 3644 | 1904 |
| 3645 | 5649 |
| 3646 | 2788 |
| 3647 | 4577 |
| 3648 | 3273 |
| 3649 | 6284 |
| 3650 | 1469 |
| 3651 | 4669 |
| 3652 | 2898 |
| 3653 | 5221 |
| 3654 | 3472 |
| 3655 | 1756 |
| 3656 | 4462 |
| 3657 | 2492 |
| 3658 | 6215 |
| 3659 | 3179 |
| 3660 | 4778 |
| 3661 | 1986 |
| 3662 | 5151 |
| 3663 | 2739 |
| 3664 | 4287 |
| 3665 | 3597 |
| 3666 | 6189 |
| 3667 | 1870 |
| 3668 | 2872 |
| 3669 | 5400 |
| 3670 | 3395 |
| 3671 | 4890 |
| 3672 | 1711 |
| 3673 | 4699 |
| 3674 | 2734 |
| 3675 | 5262 |
| 3676 | 3215 |
| 3677 | 6784 |
| 3678 | 1279 |
| 3679 | 4519 |
| 3680 | 2301 |
| 3681 | 3369 |
| 3682 | 5210 |
| 3683 | 1005 |
| 3684 | 4785 |
| 3685 | 2843 |
| 3686 | 6305 |
| 3687 | 3632 |
| 3688 | 4564 |
| 3689 | 1931 |
| 3690 | 5642 |

TABLE Q9-continued with a sequence length of 8192:

| Polarized channel sequence number | Reliability or reliability sequence number |
|---|---|
| 3691 | 2623 |
| 3692 | 4944 |
| 3693 | 3252 |
| 3694 | 6409 |
| 3695 | 1661 |
| 3696 | 2521 |
| 3697 | 5412 |
| 3698 | 3166 |
| 3699 | 4728 |
| 3700 | 1877 |
| 3701 | 4469 |
| 3702 | 2950 |
| 3703 | 5320 |
| 3704 | 3356 |
| 3705 | 6244 |
| 3706 | 1499 |
| 3707 | 4901 |
| 3708 | 2763 |
| 3709 | 5222 |
| 3710 | 3598 |
| 3711 | 1850 |
| 3712 | 4509 |
| 3713 | 2533 |
| 3714 | 6195 |
| 3715 | 3223 |
| 3716 | 4810 |
| 3717 | 2913 |
| 3718 | 5383 |
| 3719 | 1770 |
| 3720 | 4523 |
| 3721 | 3397 |
| 3722 | 7184 |
| 3723 | 2792 |
| 3724 | 5650 |
| 3725 | 1960 |
| 3726 | 4806 |
| 3727 | 3276 |
| 3728 | 2855 |
| 3729 | 5000 |
| 3730 | 1011 |
| 3731 | 6337 |
| 3732 | 3656 |
| 3733 | 5269 |
| 3734 | 2463 |
| 3735 | 4348 |
| 3736 | 1891 |
| 3737 | 5225 |
| 3738 | 3488 |
| 3739 | 6190 |
| 3740 | 2684 |
| 3741 | 4670 |
| 3742 | 1528 |
| 3743 | 4470 |
| 3744 | 3181 |
| 3745 | 5283 |
| 3746 | 2961 |
| 3747 | 1719 |
| 3748 | 4889 |
| 3749 | 3842 |
| 3750 | 6406 |
| 3751 | 2427 |
| 3752 | 5442 |
| 3753 | 1988 |
| 3754 | 4780 |
| 3755 | 3370 |
| 3756 | 4578 |
| 3757 | 2900 |
| 3758 | 6912 |
| 3759 | 1878 |
| 3760 | 5212 |
| 3761 | 3282 |
| 3762 | 4886 |
| 3763 | 2741 |
| 3764 | 5644 |
| 3765 | 1777 |

TABLE Q9-continued with a sequence length of 8192:

| Polarized channel sequence number | Reliability or reliability sequence number |
|---|---|
| 3766 | 3256 |
| 3767 | 6219 |
| 3768 | 2522 |
| 3769 | 4568 |
| 3770 | 1470 |
| 3771 | 5167 |
| 3772 | 3716 |
| 3773 | 4711 |
| 3774 | 2845 |
| 3775 | 6292 |
| 3776 | 1006 |
| 3777 | 4817 |
| 3778 | 3377 |
| 3779 | 5387 |
| 3780 | 2765 |
| 3781 | 4473 |
| 3782 | 1939 |
| 3783 | 6248 |
| 3784 | 3187 |
| 3785 | 5226 |
| 3786 | 2954 |
| 3787 | 3402 |
| 3788 | 4902 |
| 3789 | 1743 |
| 3790 | 4786 |
| 3791 | 2534 |
| 3792 | 6417 |
| 3793 | 3605 |
| 3794 | 5274 |
| 3795 | 1852 |
| 3796 | 4319 |
| 3797 | 2742 |
| 3798 | 5665 |
| 3799 | 3227 |
| 3800 | 6306 |
| 3801 | 1933 |
| 3802 | 4960 |
| 3803 | 2859 |
| 3804 | 4510 |
| 3805 | 3398 |
| 3806 | 5416 |
| 3807 | 1511 |
| 3808 | 6197 |
| 3809 | 2537 |
| 3810 | 4701 |
| 3811 | 3619 |
| 3812 | 1772 |
| 3813 | 5175 |
| 3814 | 2771 |
| 3815 | 4809 |
| 3816 | 3297 |
| 3817 | 6221 |
| 3818 | 1881 |
| 3819 | 5328 |
| 3820 | 2914 |
| 3821 | 4551 |
| 3822 | 2655 |
| 3823 | 5008 |
| 3824 | 2524 |
| 3825 | 6659 |
| 3826 | 1968 |
| 3827 | 5506 |
| 3828 | 3459 |
| 3829 | 4525 |
| 3830 | 2962 |
| 3831 | 5761 |
| 3832 | 1013 |
| 3833 | 6296 |
| 3834 | 3182 |
| 3835 | 4715 |
| 3836 | 2745 |
| 3837 | 4931 |
| 3838 | 1501 |
| 3839 | 3610 |
| 3840 | 5233 |

TABLE Q9-continued with a sequence length of 8192:

| Polarized channel sequence number | Reliability or reliability sequence number |
|---|---|
| 3841 | 2479 |
| 3842 | 7200 |
| 3843 | 1723 |
| 3844 | 4474 |
| 3845 | 3372 |
| 3846 | 5285 |
| 3847 | 2904 |
| 3848 | 4751 |
| 3849 | 1893 |
| 3850 | 6410 |
| 3851 | 3239 |
| 3852 | 5444 |
| 3853 | 2800 |
| 3854 | 4905 |
| 3855 | 3664 |
| 3856 | 4580 |
| 3857 | 1823 |
| 3858 | 6198 |
| 3859 | 2846 |
| 3860 | 5273 |
| 3861 | 3409 |
| 3862 | 4788 |
| 3863 | 1662 |
| 3864 | 5199 |
| 3865 | 2302 |
| 3866 | 6308 |
| 3867 | 3284 |
| 3868 | 4531 |
| 3869 | 1934 |
| 3870 | 5697 |
| 3871 | 2766 |
| 3872 | 4702 |
| 3873 | 3378 |
| 3874 | 6227 |
| 3875 | 1407 |
| 3876 | 4892 |
| 3877 | 2956 |
| 3878 | 3621 |
| 3879 | 5395 |
| 3880 | 1882 |
| 3881 | 4335 |
| 3882 | 2887 |
| 3883 | 6418 |
| 3884 | 3189 |
| 3885 | 5270 |
| 3886 | 2429 |
| 3887 | 4759 |
| 3888 | 1014 |
| 3889 | 5228 |
| 3890 | 3229 |
| 3891 | 6661 |
| 3892 | 2671 |
| 3893 | 4933 |
| 3894 | 1778 |
| 3895 | 4526 |
| 3896 | 3720 |
| 3897 | 5652 |
| 3898 | 2861 |
| 3899 | 6201 |
| 3900 | 1992 |
| 3901 | 4812 |
| 3902 | 3461 |
| 3903 | 5389 |
| 3904 | 2773 |
| 3905 | 4415 |
| 3906 | 3243 |
| 3907 | 6279 |
| 3908 | 1894 |
| 3909 | 5286 |
| 3910 | 2538 |
| 3911 | 5024 |
| 3912 | 3401 |
| 3913 | 5179 |
| 3914 | 1515 |
| 3915 | 6256 |

TABLE Q9-continued with a sequence length of 8192:

| Polarized channel sequence number | Reliability or reliability sequence number |
|---|---|
| 3916 | 2977 |
| 3917 | 4717 |
| 3918 | 3609 |
| 3919 | 4555 |
| 3920 | 1751 |
| 3921 | 5424 |
| 3922 | 2746 |
| 3923 | 6412 |
| 3924 | 3190 |
| 3925 | 4906 |
| 3926 | 1941 |
| 3927 | 5666 |
| 3928 | 2487 |
| 3929 | 4818 |
| 3930 | 3343 |
| 3931 | 6338 |
| 3932 | 2916 |
| 3933 | 5344 |
| 3934 | 1897 |
| 3935 | 4584 |
| 3936 | 3606 |
| 3937 | 7296 |
| 3938 | 2787 |
| 3939 | 4792 |
| 3940 | 1780 |
| 3941 | 5234 |
| 3942 | 3298 |
| 3943 | 4913 |
| 3944 | 2867 |
| 3945 | 6222 |
| 3946 | 1017 |
| 3947 | 5390 |
| 3948 | 3380 |
| 3949 | 4476 |
| 3950 | 2545 |
| 3951 | 5315 |
| 3952 | 3844 |
| 3953 | 6720 |
| 3954 | 1502 |
| 3955 | 4723 |
| 3956 | 3009 |
| 3957 | 5656 |
| 3958 | 3288 |
| 3959 | 4533 |
| 3960 | 1955 |
| 3961 | 6283 |
| 3962 | 2774 |
| 3963 | 4938 |
| 3964 | 3520 |
| 3965 | 5448 |
| 3966 | 2862 |
| 3967 | 1884 |
| 3968 | 4763 |
| 3969 | 6433 |
| 3970 | 3622 |
| 3971 | 5207 |
| 3972 | 2511 |
| 3973 | 4343 |
| 3974 | 1725 |
| 3975 | 6229 |
| 3976 | 3193 |
| 3977 | 5289 |
| 3978 | 2679 |
| 3979 | 4934 |
| 3980 | 1839 |
| 3981 | 5508 |
| 3982 | 3351 |
| 3983 | 6202 |
| 3984 | 2891 |
| 3985 | 4833 |
| 3986 | 3230 |
| 3987 | 4557 |
| 3988 | 1898 |
| 3989 | 5889 |
| 3990 | 2748 |

TABLE Q9-continued with a sequence length of 8192:

| Polarized channel sequence number | Reliability or reliability sequence number |
|---|---|
| 3991 | 6312 |
| 3992 | 3680 |
| 3993 | 4995 |
| 3994 | 1517 |
| 3995 | 5236 |
| 3996 | 2540 |
| 3997 | 6529 |
| 3998 | 3404 |
| 3999 | 4718 |
| 4000 | 1946 |
| 4001 | 5276 |
| 4002 | 3271 |
| 4003 | 4534 |
| 4004 | 2964 |
| 4005 | 6665 |
| 4006 | 3728 |
| 4007 | 5397 |
| 4008 | 1755 |
| 4009 | 4908 |
| 4010 | 2920 |
| 4011 | 4775 |
| 4012 | 3465 |
| 4013 | 6243 |
| 4014 | 1018 |
| 4015 | 5668 |
| 4016 | 2777 |
| 4017 | 4563 |
| 4018 | 3245 |
| 4019 | 5317 |
| 4020 | 2491 |
| 4021 | 7424 |
| 4022 | 1847 |
| 4023 | 4945 |
| 4024 | 3651 |
| 4025 | 5411 |
| 4026 | 2978 |
| 4027 | 6340 |
| 4028 | 2000 |
| 4029 | 4820 |
| 4030 | 3194 |
| 4031 | 5181 |
| 4032 | 2789 |
| 4033 | 4447 |
| 4034 | 3300 |
| 4035 | 6465 |
| 4036 | 1784 |
| 4037 | 5290 |
| 4038 | 2869 |
| 4039 | 4914 |
| 4040 | 3625 |
| 4041 | 5639 |
| 4042 | 1523 |
| 4043 | 6230 |
| 4044 | 2430 |
| 4045 | 4725 |
| 4046 | 3410 |
| 4047 | 4537 |
| 4048 | 2893 |
| 4049 | 6291 |
| 4050 | 1905 |
| 4051 | 5402 |
| 4052 | 3251 |
| 4053 | 4765 |
| 4054 | 2719 |
| 4055 | 5211 |
| 4056 | 1957 |
| 4057 | 6662 |
| 4058 | 4592 |
| 4059 | 3612 |
| 4060 | 5297 |
| 4061 | 2968 |
| 4062 | 6204 |
| 4063 | 3384 |
| 4064 | 4997 |
| 4065 | 1726 |

TABLE Q9-continued with a sequence length of 8192:

| Polarized channel sequence number | Reliability or reliability sequence number |
|---|---|
| 4066 | 5698 |
| 4067 | 2546 |
| 4068 | 4779 |
| 4069 | 3246 |
| 4070 | 6420 |
| 4071 | 1945 |
| 4072 | 5456 |
| 4073 | 3653 |
| 4074 | 4347 |
| 4075 | 2683 |
| 4076 | 5240 |
| 4077 | 3355 |
| 4078 | 6285 |
| 4079 | 1518 |
| 4080 | 4937 |
| 4081 | 2870 |
| 4082 | 4726 |
| 4083 | 3135 |
| 4084 | 6233 |
| 4085 | 959 |
| 4086 | 5413 |
| 4087 | 2778 |
| 4088 | 4558 |
| 4089 | 3462 |
| 4090 | 5322 |
| 4091 | 2980 |
| 4092 | 6434 |
| 4093 | 1871 |
| 4094 | 4879 |
| 4095 | 3744 |
| 4096 | 2519 |
| 4097 | 1942 |
| 4098 | 5643 |
| 4099 | 3275 |
| 4100 | 7680 |
| 4101 | 2899 |
| 4102 | 4834 |
| 4103 | 3425 |
| 4104 | 5318 |
| 4105 | 1767 |
| 4106 | 4916 |
| 4107 | 2790 |
| 4108 | 6320 |
| 4109 | 3848 |
| 4110 | 5512 |
| 4111 | 1900 |
| 4112 | 4463 |
| 4113 | 3304 |
| 4114 | 6673 |
| 4115 | 2873 |
| 4116 | 5182 |
| 4117 | 3367 |
| 4118 | 4824 |
| 4119 | 1958 |
| 4120 | 5672 |
| 4121 | 2548 |
| 4122 | 6245 |
| 4123 | 3626 |
| 4124 | 5056 |
| 4125 | 2951 |
| 4126 | 4565 |
| 4127 | 1757 |
| 4128 | 6175 |
| 4129 | 3196 |
| 4130 | 5401 |
| 4131 | 2793 |
| 4132 | 4729 |
| 4133 | 1525 |
| 4134 | 3473 |
| 4135 | 5292 |
| 4136 | 2928 |
| 4137 | 6424 |
| 4138 | 3633 |
| 4139 | 4887 |
| 4140 | 1851 |

TABLE Q9-continued with a sequence length of 8192:

| Polarized channel sequence number | Reliability or reliability sequence number |
|---|---|
| 4141 | 5398 |
| 4142 | 2493 |
| 4143 | 6286 |
| 4144 | 3412 |
| 4145 | 4538 |
| 4146 | 2016 |
| 4147 | 5762 |
| 4148 | 3658 |
| 4149 | 4766 |
| 4150 | 2780 |
| 4151 | 6234 |
| 4152 | 3253 |
| 4153 | 5223 |
| 4154 | 1906 |
| 4155 | 4940 |
| 4156 | 3010 |
| 4157 | 6666 |
| 4158 | 3357 |
| 4159 | 5329 |
| 4160 | 2894 |
| 4161 | 4579 |
| 4162 | 1020 |
| 4163 | 5414 |
| 4164 | 3654 |
| 4165 | 6436 |
| 4166 | 2735 |
| 4167 | 4807 |
| 4168 | 1663 |
| 4169 | 5700 |
| 4170 | 3277 |
| 4171 | 7171 |
| 4172 | 2303 |
| 4173 | 5001 |
| 4174 | 3466 |
| 4175 | 5298 |
| 4176 | 1987 |
| 4177 | 4566 |
| 4178 | 3715 |
| 4179 | 6344 |
| 4180 | 2955 |
| 4181 | 5472 |
| 4182 | 3254 |
| 4183 | 4781 |
| 4184 | 1526 |
| 4185 | 6246 |
| 4186 | 2685 |
| 4187 | 5213 |
| 4188 | 3371 |
| 4189 | 4730 |
| 4190 | 2901 |
| 4191 | 4471 |
| 4192 | 1879 |
| 4193 | 6407 |
| 4194 | 3628 |
| 4195 | 5651 |
| 4196 | 2523 |
| 4197 | 4836 |
| 4198 | 1961 |
| 4199 | 6674 |
| 4200 | 3283 |
| 4201 | 5321 |
| 4202 | 2874 |
| 4203 | 4946 |
| 4204 | 3426 |
| 4205 | 6293 |
| 4206 | 1771 |
| 4207 | 5520 |
| 4208 | 3856 |
| 4209 | 4540 |
| 4210 | 2794 |
| 4211 | 5227 |
| 4212 | 3167 |
| 4213 | 6249 |
| 4214 | 1908 |
| 4215 | 4787 |

TABLE Q9-continued

| with a sequence length of 8192: | |
|---|---|
| Polarized channel sequence number | Reliability or reliability sequence number |
| 4216 | 2984 |
| 4217 | 5645 |
| 4218 | 3474 |
| 4219 | 6307 |
| 4220 | 2915 |
| 4221 | 4920 |
| 4222 | 1948 |
| 4223 | 5443 |
| 4224 | 3665 |
| 4225 | 4782 |
| 4226 | 2552 |
| 4227 | 6466 |
| 4228 | 1758 |
| 4229 | 5263 |
| 4230 | 3257 |
| 4231 | 4349 |
| 4232 | 3416 |
| 4233 | 6236 |
| 4234 | 2743 |
| 4235 | 5417 |
| 4236 | 1529 |
| 4237 | 4891 |
| 4238 | 3634 |
| 4239 | 7173 |
| 4240 | 3012 |
| 4241 | 5680 |
| 4242 | 3312 |
| 4243 | 4671 |
| 4244 | 991 |
| 4245 | 5300 |
| 4246 | 2902 |
| 4247 | 6668 |
| 4248 | 3358 |
| 4249 | 4569 |
| 4250 | 2801 |
| 4251 | 5214 |
| 4252 | 1989 |
| 4253 | 6191 |
| 4254 | 3717 |
| 4255 | 4998 |
| 4256 | 3278 |
| 4257 | 5404 |
| 4258 | 1853 |
| 4259 | 6411 |
| 4260 | 2494 |
| 4261 | 4811 |
| 4262 | 3657 |
| 4263 | 5646 |
| 4264 | 2963 |
| 4265 | 4581 |
| 4266 | 1962 |
| 4267 | 6250 |
| 4268 | 3468 |
| 4269 | 5271 |
| 4270 | 2767 |
| 4271 | 4961 |
| 4272 | 3399 |
| 4273 | 6298 |
| 4274 | 1773 |
| 4275 | 5445 |
| 4276 | 3599 |
| 4277 | 4840 |
| 4278 | 2876 |
| 4279 | 6689 |
| 4280 | 3183 |
| 4281 | 5324 |
| 4282 | 1883 |
| 4283 | 4903 |
| 4284 | 2957 |
| 4285 | 6440 |
| 4286 | 3373 |
| 4287 | 5704 |
| 4288 | 2535 |
| 4289 | 4511 |
| 4290 | 1969 |

TABLE Q9-continued

| with a sequence length of 8192: | |
|---|---|
| Polarized channel sequence number | Reliability or reliability sequence number |
| 4291 | 5536 |
| 4292 | 3636 |
| 4293 | 6199 |
| 4294 | 2796 |
| 4295 | 4732 |
| 4296 | 3285 |
| 4297 | 5229 |
| 4298 | 1530 |
| 4299 | 6352 |
| 4300 | 3872 |
| 4301 | 5009 |
| 4302 | 2905 |
| 4303 | 5890 |
| 4304 | 3489 |
| 4305 | 7232 |
| 4306 | 1912 |
| 4307 | 4475 |
| 4308 | 2992 |
| 4309 | 5418 |
| 4310 | 3258 |
| 4311 | 4948 |
| 4312 | 2525 |
| 4313 | 6530 |
| 4314 | 5330 |
| 4315 | 1779 |
| 4316 | 4789 |
| 4317 | 3776 |
| 4318 | 6785 |
| 4319 | 3428 |
| 4320 | 5304 |
| 4321 | 2747 |
| 4322 | 4570 |
| 4323 | 1994 |
| 4324 | 6257 |
| 4325 | 3299 |
| 4326 | 5764 |
| 4327 | 2917 |
| 4328 | 4893 |
| 4329 | 3607 |
| 4330 | 6309 |
| 4331 | 1990 |
| 4332 | 5425 |
| 4333 | 2847 |
| 4334 | 4813 |
| 4335 | 3379 |
| 4336 | 6468 |
| 4337 | 3660 |
| 4338 | 5235 |
| 4339 | 1854 |
| 4340 | 5002 |
| 4341 | 2686 |
| 4342 | 5450 |
| 4343 | 3521 |
| 4344 | 6297 |
| 4345 | 2958 |
| 4346 | 4582 |
| 4347 | 1007 |
| 4348 | 5653 |
| 4349 | 3286 |
| 4350 | 6223 |
| 4351 | 4790 |
| 4352 | 3721 |
| 4353 | 5275 |
| 4354 | 2431 |
| 4355 | 7177 |
| 4356 | 1964 |
| 4357 | 4907 |
| 4358 | 3374 |
| 4359 | 5446 |
| 4360 | 2906 |
| 4361 | 6721 |
| 4362 | 3191 |
| 4363 | 4585 |
| 4364 | 1471 |
| 4365 | 5667 |

TABLE Q9-continued with a sequence length of 8192:

| Polarized channel sequence number | Reliability or reliability sequence number |
|---|---|
| 4366 | 2802 |
| 4367 | 6419 |
| 4368 | 3666 |
| 4369 | 4819 |
| 4370 | 3403 |
| 4371 | 5345 |
| 4372 | 1774 |
| 4373 | 4962 |
| 4374 | 3016 |
| 4375 | 6294 |
| 4376 | 3640 |
| 4377 | 4703 |
| 4378 | 2918 |
| 4379 | 4572 |
| 4380 | 6252 |
| 4381 | 1895 |
| 4382 | 5507 |
| 4383 | 3260 |
| 4384 | 5010 |
| 4385 | 2539 |
| 4386 | 6676 |
| 4387 | 3476 |
| 4388 | 5230 |
| 4389 | 2001 |
| 4390 | 4793 |
| 4391 | 3968 |
| 4392 | 6413 |
| 4393 | 2775 |
| 4394 | 5658 |
| 4395 | 3432 |
| 4396 | 4527 |
| 4397 | 1970 |
| 4398 | 6310 |
| 4399 | 2965 |
| 4400 | 5420 |
| 4401 | 3289 |
| 4402 | 4952 |
| 4403 | 3611 |
| 4404 | 6203 |
| 4405 | 5287 |
| 4406 | 1781 |
| 4407 | 4848 |
| 4408 | 2921 |
| 4409 | 5712 |
| 4410 | 3490 |
| 4411 | 7174 |
| 4412 | 2804 |
| 4413 | 4894 |
| 4414 | 1885 |
| 4415 | 5457 |
| 4416 | 3718 |
| 4417 | 6448 |
| 4418 | 3301 |
| 4419 | 4350 |
| 4420 | 2526 |
| 4421 | 5332 |
| 4422 | 1993 |
| 4423 | 6690 |
| 4424 | 3381 |
| 4425 | 4814 |
| 4426 | 5426 |
| 4427 | 2979 |
| 4428 | 6368 |
| 4429 | 3681 |
| 4430 | 5004 |
| 4431 | 1532 |
| 4432 | 5669 |
| 4433 | 2908 |
| 4434 | 6258 |
| 4435 | 3405 |
| 4436 | 4935 |
| 4437 | 3623 |
| 4438 | 5237 |
| 4439 | 1899 |
| 4440 | 6414 |

TABLE Q9-continued with a sequence length of 8192:

| Polarized channel sequence number | Reliability or reliability sequence number |
|---|---|
| 4441 | 2749 |
| 4442 | 4477 |
| 4443 | 3231 |
| 4444 | 5277 |
| 4445 | 6339 |
| 4446 | 2863 |
| 4447 | 4719 |
| 4448 | 3480 |
| 4449 | 5768 |
| 4450 | 1782 |
| 4451 | 6680 |
| 4452 | 3843 |
| 4453 | 4909 |
| 4454 | 2922 |
| 4455 | 5509 |
| 4456 | 3195 |
| 4457 | 7185 |
| 4458 | 1015 |
| 4459 | 4821 |
| 4460 | 2541 |
| 4461 | 5291 |
| 4462 | 3729 |
| 4463 | 6472 |
| 4464 | 4586 |
| 4465 | 3382 |
| 4466 | 5449 |
| 4467 | 1935 |
| 4468 | 6231 |
| 4469 | 2970 |
| 4470 | 5025 |
| 4471 | 3290 |
| 4472 | 5657 |
| 4473 | 2779 |
| 4474 | 4794 |
| 4475 | 1972 |
| 4476 | 6313 |
| 4477 | 3668 |
| 4478 | 5238 |
| 4479 | 4535 |
| 4480 | 3492 |
| 4481 | 6532 |
| 4482 | 2871 |
| 4483 | 5391 |
| 4484 | 3613 |
| 4485 | 4964 |
| 4486 | 1886 |
| 4487 | 6913 |
| 4488 | 3024 |
| 4489 | 5654 |
| 4490 | 3411 |
| 4491 | 4835 |
| 4492 | 3722 |
| 4493 | 6260 |
| 4494 | 1943 |
| 4495 | 5346 |
| 4496 | 4915 |
| 4497 | 2808 |
| 4498 | 6300 |
| 4499 | 3302 |
| 4500 | 5428 |
| 4501 | 2547 |
| 4502 | 4593 |
| 4503 | 1785 |
| 4504 | 7178 |
| 4505 | 3385 |
| 4506 | 5892 |
| 4507 | 3627 |
| 4508 | 5057 |
| 4509 | 2929 |
| 4510 | 6421 |
| 4511 | 5336 |
| 4512 | 1503 |
| 4513 | 4822 |
| 4514 | 3463 |
| 4515 | 6692 |

TABLE Q9-continued with a sequence length of 8192:

| Polarized channel sequence number | Reliability or reliability sequence number |
|---|---|
| 4516 | 2981 |
| 4517 | 5568 |
| 4518 | 3845 |
| 4519 | 4910 |
| 4520 | 3305 |
| 4521 | 6341 |
| 4522 | 1996 |
| 4523 | 5670 |
| 4524 | 4559 |
| 4525 | 2750 |
| 4526 | 6435 |
| 4527 | 3440 |
| 4528 | 5241 |
| 4529 | 3682 |
| 4530 | 4727 |
| 4531 | 1901 |
| 4532 | 6205 |
| 4533 | 2969 |
| 4534 | 5399 |
| 4535 | 3292 |
| 4536 | 4939 |
| 4537 | 6314 |
| 4538 | 2542 |
| 4539 | 5278 |
| 4540 | 2002 |
| 4541 | 4796 |
| 4542 | 3730 |
| 4543 | 6663 |
| 4544 | 3522 |
| 4545 | 5728 |
| 4546 | 2895 |
| 4547 | 4588 |
| 4548 | 3406 |
| 4549 | 7186 |
| 4550 | 5452 |
| 4551 | 1976 |
| 4552 | 5319 |
| 4553 | 2966 |
| 4554 | 6426 |
| 4555 | 3672 |
| 4556 | 5012 |
| 4557 | 3247 |
| 4558 | 6235 |
| 4559 | 1786 |
| 4560 | 5776 |
| 4561 | 2791 |
| 4562 | 4968 |
| 4563 | 6321 |
| 4564 | 3614 |
| 4565 | 5513 |
| 4566 | 2924 |
| 4567 | 4825 |
| 4568 | 3467 |
| 4569 | 6722 |
| 4570 | 1907 |
| 4571 | 5293 |
| 4572 | 3904 |
| 4573 | 4539 |
| 4574 | 6480 |
| 4575 | 2982 |
| 4576 | 5699 |
| 4577 | 3197 |
| 4578 | 5026 |
| 4579 | 1947 |
| 4580 | 6264 |
| 4581 | 3413 |
| 4582 | 5242 |
| 4583 | 2781 |
| 4584 | 4837 |
| 4585 | 3724 |
| 4586 | 6437 |
| 4587 | 5348 |
| 4588 | 2549 |
| 4589 | 4917 |
| 4590 | 2017 |

TABLE Q9-continued with a sequence length of 8192:

| Polarized channel sequence number | Reliability or reliability sequence number |
|---|---|
| 4591 | 7180 |
| 4592 | 3386 |
| 4593 | 5673 |
| 4594 | 3655 |
| 4595 | 4478 |
| 4596 | 2875 |
| 4597 | 6346 |
| 4598 | 5458 |
| 4599 | 1019 |
| 4600 | 4941 |
| 4601 | 3306 |
| 4602 | 6667 |
| 4603 | 3629 |
| 4604 | 5299 |
| 4605 | 3040 |
| 4606 | 4767 |
| 4607 | 6342 |
| 4608 | 3496 |
| 4609 | 5660 |
| 4610 | 1519 |
| 4611 | 5016 |
| 4612 | 2930 |
| 4613 | 6536 |
| 4614 | 3745 |
| 4615 | 5432 |
| 4616 | 3427 |
| 4617 | 4594 |
| 4618 | 6206 |
| 4619 | 1902 |
| 4620 | 5294 |
| 4621 | 2687 |
| 4622 | 6696 |
| 4623 | 3255 |
| 4624 | 5701 |
| 4625 | 3849 |
| 4626 | 4731 |
| 4627 | 3011 |
| 4628 | 7201 |
| 4629 | 5403 |
| 4630 | 1727 |
| 4631 | 4918 |
| 4632 | 3524 |
| 4633 | 6425 |
| 4634 | 2550 |
| 4635 | 5183 |
| 4636 | 3684 |
| 4637 | 4826 |
| 4638 | 6316 |
| 4639 | 1959 |
| 4640 | 5510 |
| 4641 | 3414 |
| 4642 | 5028 |
| 4643 | 2903 |
| 4644 | 6422 |
| 4645 | 3635 |
| 4646 | 5792 |
| 4647 | 3313 |
| 4648 | 4567 |
| 4649 | 6786 |
| 4650 | 2004 |
| 4651 | 5323 |
| 4652 | 2985 |
| 4653 | 4947 |
| 4654 | 3475 |
| 4655 | 6247 |
| 4656 | 2795 |
| 4657 | 5473 |
| 4658 | 6353 |
| 4659 | 3777 |
| 4660 | 4838 |
| 4661 | 1909 |
| 4662 | 5896 |
| 4663 | 3279 |
| 4664 | 6438 |
| 4665 | 2932 |

TABLE Q9-continued

| with a sequence length of 8192: | |
|---|---|
| Polarized channel sequence number | Reliability or reliability sequence number |
| 4666 | 5352 |
| 4667 | 4921 |
| 4668 | 3630 |
| 4669 | 7297 |
| 4670 | 1949 |
| 4671 | 5415 |
| 4672 | 3388 |
| 4673 | 4596 |
| 4674 | 2972 |
| 4675 | 6724 |
| 4676 | 5674 |
| 4677 | 3846 |
| 4678 | 4999 |
| 4679 | 2782 |
| 4680 | 6322 |
| 4681 | 1963 |
| 4682 | 5244 |
| 4683 | 3469 |
| 4684 | 4841 |
| 4685 | 6496 |
| 4686 | 3659 |
| 4687 | 5521 |
| 4688 | 2553 |
| 4689 | 6237 |
| 4690 | 3308 |
| 4691 | 4976 |
| 4692 | 1788 |
| 4693 | 5681 |
| 4694 | 6675 |
| 4695 | 3417 |
| 4696 | 4541 |
| 4697 | 3013 |
| 4698 | 5460 |
| 4699 | 3732 |
| 4700 | 6345 |
| 4701 | 1527 |
| 4702 | 5706 |
| 4703 | 4828 |
| 4704 | 3504 |
| 4705 | 7233 |
| 4706 | 2877 |
| 4707 | 5301 |
| 4708 | 3688 |
| 4709 | 5058 |
| 4710 | 3259 |
| 4711 | 6544 |
| 4712 | 5405 |
| 4713 | 1910 |
| 4714 | 6251 |
| 4715 | 2986 |
| 4716 | 4942 |
| 4717 | 3857 |
| 4718 | 5702 |
| 4719 | 6669 |
| 4720 | 2797 |
| 4721 | 4783 |
| 4722 | 3429 |
| 4723 | 5325 |
| 4724 | 2018 |
| 4725 | 6467 |
| 4726 | 3746 |
| 4727 | 4351 |
| 4728 | 5514 |
| 4729 | 2907 |
| 4730 | 6287 |
| 4731 | 3359 |
| 4732 | 5763 |
| 4733 | 3637 |
| 4734 | 7188 |
| 4735 | 5003 |
| 4736 | 2008 |
| 4737 | 5302 |
| 4738 | 2993 |
| 4739 | 6441 |
| 4740 | 3198 |

TABLE Q9-continued

| with a sequence length of 8192: | |
|---|---|
| Polarized channel sequence number | Reliability or reliability sequence number |
| 4741 | 4733 |
| 4742 | 3661 |
| 4743 | 5419 |
| 4744 | 6704 |
| 4745 | 2554 |
| 4746 | 4949 |
| 4747 | 1913 |
| 4748 | 5676 |
| 4749 | 3470 |
| 4750 | 6324 |
| 4751 | 4571 |
| 4752 | 3418 |
| 4753 | 6238 |
| 4754 | 2936 |
| 4755 | 5331 |
| 4756 | 3736 |
| 4757 | 4922 |
| 4758 | 1759 |
| 4759 | 6428 |
| 4760 | 5474 |
| 4761 | 2803 |
| 4762 | 5904 |
| 4763 | 3314 |
| 4764 | 6670 |
| 4765 | 3850 |
| 4766 | 4842 |
| 4767 | 5215 |
| 4768 | 3018 |
| 4769 | 7202 |
| 4770 | 1021 |
| 4771 | 5032 |
| 4772 | 3528 |
| 4773 | 6295 |
| 4774 | 5522 |
| 4775 | 3638 |
| 4776 | 4963 |
| 4777 | 3014 |
| 4778 | 6469 |
| 4779 | 1950 |
| 4780 | 5713 |
| 4781 | 4600 |
| 4782 | 3430 |
| 4783 | 6348 |
| 4784 | 3748 |
| 4785 | 5305 |
| 4786 | 2878 |
| 4787 | 6728 |
| 4788 | 3287 |
| 4789 | 5464 |
| 4790 | 4791 |
| 4791 | 1991 |
| 4792 | 6560 |
| 4793 | 3667 |
| 4794 | 5682 |
| 4795 | 2988 |
| 4796 | 5060 |
| 4797 | 6253 |
| 4798 | 3477 |
| 4799 | 5360 |
| 4800 | 3858 |
| 4801 | 7192 |
| 4802 | 1965 |
| 4803 | 4950 |
| 4804 | 5406 |
| 4805 | 2495 |
| 4806 | 6914 |
| 4807 | 3433 |
| 4808 | 4849 |
| 4809 | 3641 |
| 4810 | 5765 |
| 4811 | 6442 |
| 4812 | 2798 |
| 4813 | 5326 |
| 4814 | 1914 |
| 4815 | 6354 |

TABLE Q9-continued with a sequence length of 8192:

| Polarized channel sequence number | Reliability or reliability sequence number |
|---|---|
| 4816 | 3316 |
| 4817 | 4542 |
| 4818 | 5705 |
| 4819 | 3719 |
| 4820 | 6328 |
| 4821 | 2919 |
| 4822 | 5011 |
| 4823 | 3491 |
| 4824 | 5516 |
| 4825 | 6788 |
| 4826 | 2020 |
| 4827 | 4815 |
| 4828 | 3696 |
| 4829 | 7425 |
| 4830 | 3025 |
| 4831 | 5447 |
| 4832 | 5647 |
| 4833 | 3420 |
| 4834 | 6449 |
| 4835 | 2994 |
| 4836 | 4924 |
| 4837 | 5231 |
| 4838 | 3261 |
| 4839 | 6259 |
| 4840 | 1531 |
| 4841 | 5005 |
| 4842 | 3852 |
| 4843 | 6474 |
| 4844 | 5421 |
| 4845 | 2805 |
| 4846 | 4583 |
| 4847 | 3375 |
| 4848 | 6677 |
| 4849 | 3778 |
| 4850 | 5684 |
| 4851 | 4844 |
| 4852 | 1971 |
| 4853 | 6299 |
| 4854 | 2909 |
| 4855 | 5333 |
| 4856 | 3434 |
| 4857 | 7204 |
| 4858 | 5920 |
| 4859 | 3662 |
| 4860 | 4953 |
| 4861 | 3017 |
| 4862 | 6470 |
| 4863 | 5537 |
| 4864 | 1775 |
| 4865 | 5040 |
| 4866 | 3482 |
| 4867 | 6691 |
| 4868 | 3723 |
| 4869 | 5306 |
| 4870 | 6369 |
| 4871 | 2556 |
| 4872 | 4573 |
| 4873 | 3291 |
| 4874 | 5824 |
| 4875 | 1966 |
| 4876 | 6531 |
| 4877 | 5476 |
| 4878 | 3873 |
| 4879 | 6254 |
| 4880 | 2923 |
| 4881 | 4795 |
| 4882 | 5347 |
| 4883 | 3383 |
| 4884 | 6682 |
| 4885 | 3669 |
| 4886 | 4965 |
| 4887 | 1855 |
| 4888 | 5655 |
| 4889 | 7175 |
| 4890 | 2806 |

TABLE Q9-continued with a sequence length of 8192:

| Polarized channel sequence number | Reliability or reliability sequence number |
|---|---|
| 4891 | 4895 |
| 4892 | 3536 |
| 4893 | 6444 |
| 4894 | 3642 |
| 4895 | 5427 |
| 4896 | 5708 |
| 4897 | 3320 |
| 4898 | 6311 |
| 4899 | 2959 |
| 4900 | 4734 |
| 4901 | 6736 |
| 4902 | 1995 |
| 4903 | 5569 |
| 4904 | 3752 |
| 4905 | 5006 |
| 4906 | 3441 |
| 4907 | 6481 |
| 4908 | 5334 |
| 4909 | 2996 |
| 4910 | 5769 |
| 4911 | 3969 |
| 4912 | 6356 |
| 4913 | 4479 |
| 4914 | 2024 |
| 4915 | 7234 |
| 4916 | 3493 |
| 4917 | 5422 |
| 4918 | 2910 |
| 4919 | 4954 |
| 4920 | 6450 |
| 4921 | 3683 |
| 4922 | 5239 |
| 4923 | 3262 |
| 4924 | 6693 |
| 4925 | 4850 |
| 4926 | 1916 |
| 4927 | 5714 |
| 4928 | 2967 |
| 4929 | 6261 |
| 4930 | 5451 |
| 4931 | 3780 |
| 4932 | 5064 |
| 4933 | 3481 |
| 4934 | 6301 |
| 4935 | 2809 |
| 4936 | 5688 |
| 4937 | 6792 |
| 4938 | 3905 |
| 4939 | 4966 |
| 4940 | 1973 |
| 4941 | 5308 |
| 4942 | 7179 |
| 4943 | 3407 |
| 4944 | 4587 |
| 4945 | 2527 |
| 4946 | 6533 |
| 4947 | 3670 |
| 4948 | 5524 |
| 4949 | 6016 |
| 4950 | 3478 |
| 4951 | 6315 |
| 4952 | 1783 |
| 4953 | 4823 |
| 4954 | 6473 |
| 4955 | 3020 |
| 4956 | 5480 |
| 4957 | 3731 |
| 4958 | 5013 |
| 4959 | 6681 |
| 4960 | 3303 |
| 4961 | 5337 |
| 4962 | 2925 |
| 4963 | 6262 |
| 4964 | 5659 |
| 4965 | 1997 |

TABLE Q9-continued

| with a sequence length of 8192: | |
|---|---|
| Polarized channel sequence number | Reliability or reliability sequence number |
| 4966 | 4969 |
| 4967 | 3644 |
| 4968 | 7208 |
| 4969 | 3436 |
| 4970 | 5538 |
| 4971 | 6415 |
| 4972 | 3026 |
| 4973 | 4852 |
| 4974 | 3860 |
| 4975 | 5766 |
| 4976 | 6678 |
| 4977 | 3494 |
| 4978 | 5349 |
| 4979 | 1974 |
| 4980 | 6370 |
| 4981 | 4574 |
| 4982 | 3293 |
| 4983 | 5429 |
| 4984 | 3000 |
| 4985 | 6452 |
| 4986 | 5027 |
| 4987 | 3387 |
| 4988 | 7298 |
| 4989 | 3725 |
| 4990 | 5729 |
| 4991 | 4956 |
| 4992 | 1533 |
| 4993 | 6916 |
| 4994 | 2810 |
| 4995 | 5453 |
| 4996 | 3552 |
| 4997 | 6360 |
| 4998 | 5671 |
| 4999 | 3673 |
| 5000 | 4797 |
| 5001 | 2931 |
| 5002 | 6592 |
| 5003 | 5279 |
| 5004 | 3442 |
| 5005 | 6694 |
| 5006 | 2003 |
| 5007 | 4911 |
| 5008 | 5528 |
| 5009 | 3874 |
| 5010 | 6265 |
| 5011 | 2971 |
| 5012 | 5891 |
| 5013 | 7681 |
| 5014 | 3199 |
| 5015 | 4970 |
| 5016 | 3760 |
| 5017 | 5243 |
| 5018 | 6423 |
| 5019 | 3041 |
| 5020 | 4589 |
| 5021 | 1022 |
| 5022 | 6302 |
| 5023 | 5777 |
| 5024 | 3523 |
| 5025 | 5430 |
| 5026 | 3685 |
| 5027 | 6752 |
| 5028 | 5018 |
| 5029 | 3415 |
| 5030 | 6476 |
| 5031 | 2543 |
| 5032 | 5338 |
| 5033 | 4827 |
| 5034 | 1887 |
| 5035 | 6343 |
| 5036 | 3615 |
| 5037 | 5716 |
| 5038 | 7236 |
| 5039 | 3497 |
| 5040 | 5540 |

TABLE Q9-continued

| with a sequence length of 8192: | |
|---|---|
| Polarized channel sequence number | Reliability or reliability sequence number |
| 5041 | 2926 |
| 5042 | 4919 |
| 5043 | 6800 |
| 5044 | 3864 |
| 5045 | 5661 |
| 5046 | 3307 |
| 5047 | 6537 |
| 5048 | 5072 |
| 5049 | 1977 |
| 5050 | 5459 |
| 5051 | 2751 |
| 5052 | 6317 |
| 5053 | 5770 |
| 5054 | 3726 |
| 5055 | 6723 |
| 5056 | 3444 |
| 5057 | 4856 |
| 5058 | 5350 |
| 5059 | 2983 |
| 5060 | 7187 |
| 5061 | 3674 |
| 5062 | 4595 |
| 5063 | 6266 |
| 5064 | 2032 |
| 5065 | 5433 |
| 5066 | 3484 |
| 5067 | 6372 |
| 5068 | 5675 |
| 5069 | 3876 |
| 5070 | 4977 |
| 5071 | 3028 |
| 5072 | 6697 |
| 5073 | 5511 |
| 5074 | 3294 |
| 5075 | 6482 |
| 5076 | 3784 |
| 5077 | 5029 |
| 5078 | 5893 |
| 5079 | 1787 |
| 5080 | 7181 |
| 5081 | 2933 |
| 5082 | 5353 |
| 5083 | 6323 |
| 5084 | 3525 |
| 5085 | 4798 |
| 5086 | 3686 |
| 5087 | 5488 |
| 5088 | 6684 |
| 5089 | 3389 |
| 5090 | 5730 |
| 5091 | 1998 |
| 5092 | 6456 |
| 5093 | 5017 |
| 5094 | 2973 |
| 5095 | 6318 |
| 5096 | 5340 |
| 5097 | 3847 |
| 5098 | 4590 |
| 5099 | 3498 |
| 5100 | 6725 |
| 5101 | 5778 |
| 5102 | 2987 |
| 5103 | 7216 |
| 5104 | 3733 |
| 5105 | 5570 |
| 5106 | 4943 |
| 5107 | 1903 |
| 5108 | 6427 |
| 5109 | 3309 |
| 5110 | 5454 |
| 5111 | 6207 |
| 5112 | 2812 |
| 5113 | 5014 |
| 5114 | 3689 |
| 5115 | 6534 |

TABLE Q9-continued with a sequence length of 8192:

| Polarized channel sequence number | Reliability or reliability sequence number |
|---|---|
| 5116 | 5720 |
| 5117 | 3747 |
| 5118 | 5295 |
| 5119 | 6816 |
| 5120 | 3419 |
| 5121 | 4839 |
| 5122 | 2005 |
| 5123 | 7182 |
| 5124 | 5662 |
| 5125 | 2551 |
| 5126 | 4972 |
| 5127 | 3906 |
| 5128 | 6347 |
| 5129 | 5515 |
| 5130 | 3505 |
| 5131 | 6497 |
| 5132 | 2934 |
| 5133 | 5952 |
| 5134 | 6920 |
| 5135 | 3676 |
| 5136 | 5030 |
| 5137 | 1978 |
| 5138 | 5245 |
| 5139 | 6376 |
| 5140 | 3448 |
| 5141 | 5461 |
| 5142 | 7240 |
| 5143 | 3631 |
| 5144 | 4829 |
| 5145 | 3042 |
| 5146 | 5772 |
| 5147 | 6439 |
| 5148 | 3315 |
| 5149 | 4597 |
| 5150 | 3851 |
| 5151 | 6698 |
| 5152 | 5434 |
| 5153 | 2019 |
| 5154 | 6268 |
| 5155 | 5703 |
| 5156 | 3032 |
| 5157 | 4923 |
| 5158 | 3530 |
| 5159 | 6545 |
| 5160 | 5354 |
| 5161 | 3690 |
| 5162 | 7426 |
| 5163 | 3526 |
| 5164 | 5677 |
| 5165 | 6705 |
| 5166 | 2937 |
| 5167 | 5088 |
| 5168 | 5544 |
| 5169 | 2006 |
| 5170 | 6484 |
| 5171 | 3738 |
| 5172 | 4978 |
| 5173 | 6730 |
| 5174 | 3390 |
| 5175 | 5793 |
| 5176 | 2783 |
| 5177 | 6325 |
| 5178 | 5475 |
| 5179 | 3880 |
| 5180 | 4735 |
| 5181 | 6429 |
| 5182 | 3500 |
| 5183 | 5303 |
| 5184 | 1911 |
| 5185 | 7300 |
| 5186 | 5897 |
| 5187 | 3639 |
| 5188 | 6726 |
| 5189 | 2974 |
| 5190 | 5059 |

TABLE Q9-continued with a sequence length of 8192:

| Polarized channel sequence number | Reliability or reliability sequence number |
|---|---|
| 5191 | 5572 |
| 5192 | 3310 |
| 5193 | 6349 |
| 5194 | 4598 |
| 5195 | 3792 |
| 5196 | 6538 |
| 5197 | 3015 |
| 5198 | 5732 |
| 5199 | 6787 |
| 5200 | 3431 |
| 5201 | 5462 |
| 5202 | 1980 |
| 5203 | 4951 |
| 5204 | 7189 |
| 5205 | 3970 |
| 5206 | 5683 |
| 5207 | 6326 |
| 5208 | 3697 |
| 5209 | 5361 |
| 5210 | 2989 |
| 5211 | 6443 |
| 5212 | 5033 |
| 5213 | 3537 |
| 5214 | 5523 |
| 5215 | 6700 |
| 5216 | 3749 |
| 5217 | 4843 |
| 5218 | 1534 |
| 5219 | 6355 |
| 5220 | 5825 |
| 5221 | 2938 |
| 5222 | 7203 |
| 5223 | 5327 |
| 5224 | 3506 |
| 5225 | 4980 |
| 5226 | 3908 |
| 5227 | 6498 |
| 5228 | 5678 |
| 5229 | 3317 |
| 5230 | 6928 |
| 5231 | 5436 |
| 5232 | 3044 |
| 5233 | 6239 |
| 5234 | 1789 |
| 5235 | 5020 |
| 5236 | 7194 |
| 5237 | 3737 |
| 5238 | 5894 |
| 5239 | 4830 |
| 5240 | 3421 |
| 5241 | 6546 |
| 5242 | 3663 |
| 5243 | 5517 |
| 5244 | 6737 |
| 5245 | 2555 |
| 5246 | 5707 |
| 5247 | 6329 |
| 5248 | 3529 |
| 5249 | 4601 |
| 5250 | 3859 |
| 5251 | 5356 |
| 5252 | 6488 |
| 5253 | 2009 |
| 5254 | 5465 |
| 5255 | 7248 |
| 5256 | 2995 |
| 5257 | 5061 |
| 5258 | 3734 |
| 5259 | 6706 |
| 5260 | 5780 |
| 5261 | 3435 |
| 5262 | 6384 |
| 5263 | 5552 |
| 5264 | 3692 |
| 5265 | 4925 |

TABLE Q9-continued with a sequence length of 8192:

| Polarized channel sequence number | Reliability or reliability sequence number |
|---|---|
| 5266 | 2799 |
| 5267 | 6430 |
| 5268 | 5736 |
| 5269 | 2021 |
| 5270 | 6789 |
| 5271 | 5307 |
| 5272 | 3318 |
| 5273 | 7205 |
| 5274 | 3853 |
| 5275 | 5034 |
| 5276 | 5905 |
| 5277 | 3471 |
| 5278 | 6350 |
| 5279 | 4845 |
| 5280 | 2990 |
| 5281 | 6729 |
| 5282 | 3750 |
| 5283 | 5477 |
| 5284 | 6540 |
| 5285 | 3508 |
| 5286 | 5794 |
| 5287 | 6471 |
| 5288 | 1951 |
| 5289 | 4955 |
| 5290 | 3643 |
| 5291 | 5407 |
| 5292 | 7304 |
| 5293 | 2879 |
| 5294 | 5685 |
| 5295 | 6671 |
| 5296 | 3422 |
| 5297 | 5041 |
| 5298 | 6255 |
| 5299 | 3888 |
| 5300 | 5246 |
| 5301 | 3019 |
| 5302 | 6445 |
| 5303 | 5709 |
| 5304 | 1915 |
| 5305 | 4602 |
| 5306 | 7193 |
| 5307 | 3808 |
| 5308 | 5518 |
| 5309 | 3479 |
| 5310 | 6708 |
| 5311 | 5466 |
| 5312 | 3698 |
| 5313 | 6357 |
| 5314 | 4984 |
| 5315 | 3048 |
| 5316 | 6944 |
| 5317 | 5784 |
| 5318 | 3321 |
| 5319 | 4851 |
| 5320 | 3854 |
| 5321 | 6561 |
| 5322 | 5362 |
| 5323 | 2010 |
| 5324 | 7190 |
| 5325 | 5898 |
| 5326 | 3532 |
| 5327 | 6330 |
| 5328 | 5066 |
| 5329 | 2940 |
| 5330 | 6848 |
| 5331 | 3779 |
| 5332 | 5576 |
| 5333 | 6500 |
| 5334 | 3912 |
| 5335 | 5686 |
| 5336 | 5062 |
| 5337 | 3437 |
| 5338 | 6371 |
| 5339 | 5478 |
| 5340 | 2997 |

TABLE Q9-continued with a sequence length of 8192:

| Polarized channel sequence number | Reliability or reliability sequence number |
|---|---|
| 5341 | 7682 |
| 5342 | 2022 |
| 5343 | 5796 |
| 5344 | 6679 |
| 5345 | 3671 |
| 5346 | 4926 |
| 5347 | 6451 |
| 5348 | 3538 |
| 5349 | 5335 |
| 5350 | 5715 |
| 5351 | 3753 |
| 5352 | 6732 |
| 5353 | 2807 |
| 5354 | 5036 |
| 5355 | 7428 |
| 5356 | 3512 |
| 5357 | 5525 |
| 5358 | 6593 |
| 5359 | 3972 |
| 5360 | 5906 |
| 5361 | 6358 |
| 5362 | 2025 |
| 5363 | 4543 |
| 5364 | 3322 |
| 5365 | 6793 |
| 5366 | 5481 |
| 5367 | 3021 |
| 5368 | 5689 |
| 5369 | 6446 |
| 5370 | 3700 |
| 5371 | 4846 |
| 5372 | 7206 |
| 5373 | 3740 |
| 5374 | 5364 |
| 5375 | 6263 |
| 5376 | 3443 |
| 5377 | 5767 |
| 5378 | 2012 |
| 5379 | 6738 |
| 5380 | 4967 |
| 5381 | 2998 |
| 5382 | 6475 |
| 5383 | 5539 |
| 5384 | 3861 |
| 5385 | 7264 |
| 5386 | 5744 |
| 5387 | 3483 |
| 5388 | 5073 |
| 5389 | 3781 |
| 5390 | 6712 |
| 5391 | 5468 |
| 5392 | 2557 |
| 5393 | 6332 |
| 5394 | 5042 |
| 5395 | 3875 |
| 5396 | 6548 |
| 5397 | 5309 |
| 5398 | 1967 |
| 5399 | 7040 |
| 5400 | 5900 |
| 5401 | 3553 |
| 5402 | 7312 |
| 5403 | 3645 |
| 5404 | 4853 |
| 5405 | 6504 |
| 5406 | 3027 |
| 5407 | 5423 |
| 5408 | 5826 |
| 5409 | 3438 |
| 5410 | 6361 |
| 5411 | 4957 |
| 5412 | 3754 |
| 5413 | 6683 |
| 5414 | 5482 |
| 5415 | 3263 |

TABLE Q9-continued with a sequence length of 8192:

| Polarized channel sequence number | Reliability or reliability sequence number |
|---|---|
| 5416 | 7235 |
| 5417 | 5710 |
| 5418 | 2911 |
| 5419 | 6562 |
| 5420 | 1023 |
| 5421 | 5065 |
| 5422 | 6790 |
| 5423 | 3866 |
| 5424 | 5530 |
| 5425 | 6373 |
| 5426 | 3675 |
| 5427 | 5771 |
| 5428 | 4604 |
| 5429 | 3495 |
| 5430 | 7209 |
| 5431 | 5339 |
| 5432 | 3001 |
| 5433 | 6453 |
| 5434 | 5921 |
| 5435 | 3761 |
| 5436 | 6753 |
| 5437 | 3540 |
| 5438 | 4971 |
| 5439 | 6477 |
| 5440 | 1790 |
| 5441 | 5431 |
| 5442 | 6695 |
| 5443 | 3920 |
| 5444 | 5717 |
| 5445 | 7196 |
| 5446 | 3056 |
| 5447 | 4854 |
| 5448 | 6303 |
| 5449 | 3704 |
| 5450 | 5584 |
| 5451 | 5690 |
| 5452 | 3445 |
| 5453 | 6552 |
| 5454 | 3877 |
| 5455 | 5368 |
| 5456 | 6915 |
| 5457 | 2811 |
| 5458 | 5007 |
| 5459 | 7237 |
| 5460 | 1917 |
| 5461 | 5800 |
| 5462 | 6267 |
| 5463 | 3485 |
| 5464 | 5489 |
| 5465 | 6801 |
| 5466 | 3786 |
| 5467 | 5044 |
| 5468 | 6454 |
| 5469 | 3499 |
| 5470 | 6017 |
| 5471 | 7328 |
| 5472 | 3022 |
| 5473 | 5541 |
| 5474 | 6362 |
| 5475 | 3782 |
| 5476 | 4958 |
| 5477 | 3976 |
| 5478 | 5731 |
| 5479 | 6740 |
| 5480 | 2026 |
| 5481 | 5310 |
| 5482 | 6564 |
| 5483 | 3324 |
| 5484 | 5015 |
| 5485 | 7432 |
| 5486 | 2927 |
| 5487 | 5828 |
| 5488 | 6685 |
| 5489 | 3646 |
| 5490 | 5529 |

TABLE Q9-continued with a sequence length of 8192:

| Polarized channel sequence number | Reliability or reliability sequence number |
|---|---|
| 5491 | 6483 |
| 5492 | 3446 |
| 5493 | 4857 |
| 5494 | 6794 |
| 5495 | 3865 |
| 5496 | 5953 |
| 5497 | 7210 |
| 5498 | 3756 |
| 5499 | 5455 |
| 5500 | 6374 |
| 5501 | 3029 |
| 5502 | 4575 |
| 5503 | 6457 |
| 5504 | 1975 |
| 5505 | 5718 |
| 5506 | 3554 |
| 5507 | 6699 |
| 5508 | 5526 |
| 5509 | 3862 |
| 5510 | 5068 |
| 5511 | 7217 |
| 5512 | 3544 |
| 5513 | 5779 |
| 5514 | 6535 |
| 5515 | 3002 |
| 5516 | 5351 |
| 5517 | 6917 |
| 5518 | 3687 |
| 5519 | 4973 |
| 5520 | 6377 |
| 5521 | 3793 |
| 5522 | 5692 |
| 5523 | 7242 |
| 5524 | 2033 |
| 5525 | 5484 |
| 5526 | 6512 |
| 5527 | 3449 |
| 5528 | 5074 |
| 5529 | 6754 |
| 5530 | 3043 |
| 5531 | 5908 |
| 5532 | 6364 |
| 5533 | 3878 |
| 5534 | 5542 |
| 5535 | 7684 |
| 5536 | 3762 |
| 5537 | 5341 |
| 5538 | 6802 |
| 5539 | 3295 |
| 5540 | 5048 |
| 5541 | 6594 |
| 5542 | 3030 |
| 5543 | 5435 |
| 5544 | 6478 |
| 5545 | 3936 |
| 5546 | 5773 |
| 5547 | 1999 |
| 5548 | 4858 |
| 5549 | 7238 |
| 5550 | 3486 |
| 5551 | 5600 |
| 5552 | 6744 |
| 5553 | 3677 |
| 5554 | 5721 |
| 5555 | 6319 |
| 5556 | 3785 |
| 5557 | 4979 |
| 5558 | 6686 |
| 5559 | 2935 |
| 5560 | 5490 |
| 5561 | 7299 |
| 5562 | 3527 |
| 5563 | 5922 |
| 5564 | 6539 |
| 5565 | 3984 |

TABLE Q9-continued with a sequence length of 8192:

| Polarized channel sequence number | Reliability or reliability sequence number |
|---|---|
| 5566 | 5019 |
| 5567 | 6976 |
| 5568 | 3501 |
| 5569 | 5247 |
| 5570 | 6269 |
| 5571 | 2028 |
| 5572 | 5808 |
| 5573 | 7212 |
| 5574 | 3004 |
| 5575 | 5089 |
| 5576 | 6485 |
| 5577 | 3691 |
| 5578 | 5571 |
| 5579 | 6796 |
| 5580 | 3907 |
| 5581 | 5733 |
| 5582 | 6458 |
| 5583 | 3450 |
| 5584 | 5463 |
| 5585 | 7440 |
| 5586 | 3727 |
| 5587 | 4591 |
| 5588 | 6727 |
| 5589 | 2558 |
| 5590 | 5663 |
| 5591 | 6378 |
| 5592 | 3881 |
| 5593 | 5545 |
| 5594 | 6701 |
| 5595 | 1535 |
| 5596 | 4974 |
| 5597 | 7249 |
| 5598 | 3556 |
| 5599 | 5912 |
| 5600 | 6568 |
| 5601 | 3764 |
| 5602 | 5355 |
| 5603 | 6817 |
| 5604 | 2813 |
| 5605 | 4799 |
| 5606 | 6499 |
| 5607 | 3507 |
| 5608 | 5774 |
| 5609 | 7218 |
| 5610 | 3678 |
| 5611 | 5492 |
| 5612 | 6327 |
| 5613 | 3868 |
| 5614 | 5031 |
| 5615 | 6921 |
| 5616 | 3311 |
| 5617 | 5722 |
| 5618 | 6596 |
| 5619 | 1979 |
| 5620 | 5532 |
| 5621 | 7301 |
| 5622 | 3033 |
| 5623 | 5924 |
| 5624 | 6756 |
| 5625 | 3735 |
| 5626 | 5076 |
| 5627 | 6486 |
| 5628 | 3909 |
| 5629 | 5342 |
| 5630 | 6707 |
| 5631 | 5832 |
| 5632 | 3502 |
| 5633 | 7241 |
| 5634 | 4981 |
| 5635 | 3788 |
| 5636 | 6385 |
| 5637 | 5573 |
| 5638 | 3045 |
| 5639 | 6547 |
| 5640 | 5734 |

TABLE Q9-continued with a sequence length of 8192:

| Polarized channel sequence number | Reliability or reliability sequence number |
|---|---|
| 5641 | 3391 |
| 5642 | 6849 |
| 5643 | 5437 |
| 5644 | 1918 |
| 5645 | 7183 |
| 5646 | 5021 |
| 5647 | 4000 |
| 5648 | 6351 |
| 5649 | 5895 |
| 5650 | 3693 |
| 5651 | 6702 |
| 5652 | 5546 |
| 5653 | 2975 |
| 5654 | 7220 |
| 5655 | 5035 |
| 5656 | 3531 |
| 5657 | 6460 |
| 5658 | 5781 |
| 5659 | 3882 |
| 5660 | 6918 |
| 5661 | 5357 |
| 5662 | 3794 |
| 5663 | 6541 |
| 5664 | 4860 |
| 5665 | 3560 |
| 5666 | 7456 |
| 5667 | 5737 |
| 5668 | 2034 |
| 5669 | 6731 |
| 5670 | 5795 |
| 5671 | 2939 |
| 5672 | 6380 |
| 5673 | 5467 |
| 5674 | 6489 |
| 5675 | 3768 |
| 5676 | 4599 |
| 5677 | 7688 |
| 5678 | 3889 |
| 5679 | 5954 |
| 5680 | 6804 |
| 5681 | 3452 |
| 5682 | 5553 |
| 5683 | 6576 |
| 5684 | 3699 |
| 5685 | 4982 |
| 5686 | 7360 |
| 5687 | 3034 |
| 5688 | 5724 |
| 5689 | 6760 |
| 5690 | 3509 |
| 5691 | 5496 |
| 5692 | 6331 |
| 5693 | 2007 |
| 5694 | 5679 |
| 5695 | 6929 |
| 5696 | 3914 |
| 5697 | 5090 |
| 5698 | 7191 |
| 5699 | 3739 |
| 5700 | 5363 |
| 5701 | 6501 |
| 5702 | 5899 |
| 5703 | 3319 |
| 5704 | 6818 |
| 5705 | 5080 |
| 5706 | 3046 |
| 5707 | 6431 |
| 5708 | 5578 |
| 5709 | 3910 |
| 5710 | 7244 |
| 5711 | 5738 |
| 5712 | 3809 |
| 5713 | 6709 |
| 5714 | 5574 |
| 5715 | 3533 |

TABLE Q9-continued with a sequence length of 8192:

| Polarized channel sequence number | Reliability or reliability sequence number |
|---|---|
| 5716 | 6270 |
| 5717 | 4985 |
| 5718 | 3971 |
| 5719 | 7305 |
| 5720 | 5786 |
| 5721 | 2036 |
| 5722 | 6733 |
| 5723 | 5438 |
| 5724 | 6542 |
| 5725 | 3049 |
| 5726 | 4831 |
| 5727 | 6490 |
| 5728 | 3694 |
| 5729 | 5928 |
| 5730 | 7250 |
| 5731 | 3510 |
| 5732 | 5548 |
| 5733 | 6808 |
| 5734 | 3884 |
| 5735 | 5687 |
| 5736 | 6386 |
| 5737 | 3036 |
| 5738 | 5022 |
| 5739 | 5358 |
| 5740 | 3751 |
| 5741 | 5840 |
| 5742 | 7224 |
| 5743 | 5063 |
| 5744 | 3539 |
| 5745 | 6922 |
| 5746 | 5479 |
| 5747 | 3921 |
| 5748 | 6600 |
| 5749 | 6018 |
| 5750 | 1981 |
| 5751 | 6710 |
| 5752 | 5745 |
| 5753 | 3796 |
| 5754 | 7552 |
| 5755 | 5037 |
| 5756 | 2991 |
| 5757 | 6502 |
| 5758 | 5585 |
| 5759 | 6820 |
| 5760 | 3423 |
| 5761 | 5797 |
| 5762 | 7195 |
| 5763 | 3890 |
| 5764 | 4986 |
| 5765 | 6359 |
| 5766 | 3701 |
| 5767 | 5554 |
| 5768 | 6739 |
| 5769 | 3513 |
| 5770 | 5956 |
| 5771 | 6549 |
| 5772 | 3741 |
| 5773 | 5365 |
| 5774 | 7302 |
| 5775 | 5092 |
| 5776 | 1791 |
| 5777 | 6930 |
| 5778 | 5785 |
| 5779 | 2814 |
| 5780 | 6505 |
| 5781 | 5469 |
| 5782 | 3568 |
| 5783 | 7265 |
| 5784 | 5711 |
| 5785 | 3973 |
| 5786 | 6713 |
| 5787 | 4603 |
| 5788 | 3755 |
| 5789 | 6388 |
| 5790 | 5577 |

TABLE Q9-continued with a sequence length of 8192:

| Polarized channel sequence number | Reliability or reliability sequence number |
|---|---|
| 5791 | 6791 |
| 5792 | 3323 |
| 5793 | 5907 |
| 5794 | 7696 |
| 5795 | 2941 |
| 5796 | 5043 |
| 5797 | 6563 |
| 5798 | 3913 |
| 5799 | 5782 |
| 5800 | 6768 |
| 5801 | 3702 |
| 5802 | 5483 |
| 5803 | 7207 |
| 5804 | 5740 |
| 5805 | 3534 |
| 5806 | 6492 |
| 5807 | 4847 |
| 5808 | 2011 |
| 5809 | 6333 |
| 5810 | 5366 |
| 5811 | 3855 |
| 5812 | 6924 |
| 5813 | 5901 |
| 5814 | 3050 |
| 5815 | 7427 |
| 5816 | 5519 |
| 5817 | 6447 |
| 5818 | 3810 |
| 5819 | 5038 |
| 5820 | 6850 |
| 5821 | 3892 |
| 5822 | 5798 |
| 5823 | 7313 |
| 5824 | 3439 |
| 5825 | 5556 |
| 5826 | 6506 |
| 5827 | 5691 |
| 5828 | 3800 |
| 5829 | 6734 |
| 5830 | 4927 |
| 5831 | 2999 |
| 5832 | 6554 |
| 5833 | 5470 |
| 5834 | 4032 |
| 5835 | 7252 |
| 5836 | 5936 |
| 5837 | 2040 |
| 5838 | 6795 |
| 5839 | 5067 |
| 5840 | 6363 |
| 5841 | 3541 |
| 5842 | 5856 |
| 5843 | 7197 |
| 5844 | 3705 |
| 5845 | 5527 |
| 5846 | 6945 |
| 5847 | 3863 |
| 5848 | 5746 |
| 5849 | 6455 |
| 5850 | 5096 |
| 5851 | 3514 |
| 5852 | 7306 |
| 5853 | 5369 |
| 5854 | 3057 |
| 5855 | 6741 |
| 5856 | 5902 |
| 5857 | 3742 |
| 5858 | 6608 |
| 5859 | 5580 |
| 5860 | 6714 |
| 5861 | 3916 |
| 5862 | 4988 |
| 5863 | 7211 |
| 5864 | 3555 |
| 5865 | 5827 |

TABLE Q9-continued with a sequence length of 8192:

| Polarized channel sequence number | Reliability or reliability sequence number |
|---|---|
| 5866 | 6392 |
| 5867 | 1982 |
| 5868 | 5960 |
| 5869 | 6824 |
| 5870 | 5485 |
| 5871 | 3783 |
| 5872 | 7429 |
| 5873 | 5045 |
| 5874 | 3023 |
| 5875 | 6513 |
| 5876 | 5719 |
| 5877 | 3977 |
| 5878 | 7041 |
| 5879 | 5586 |
| 5880 | 7712 |
| 5881 | 3542 |
| 5882 | 5801 |
| 5883 | 6565 |
| 5884 | 3757 |
| 5885 | 4855 |
| 5886 | 6755 |
| 5887 | 5560 |
| 5888 | 3706 |
| 5889 | 7266 |
| 5890 | 6020 |
| 5891 | 3052 |
| 5892 | 6334 |
| 5893 | 5370 |
| 5894 | 3447 |
| 5895 | 6852 |
| 5896 | 5069 |
| 5897 | 6553 |
| 5898 | 3812 |
| 5899 | 5748 |
| 5900 | 7314 |
| 5901 | 2023 |
| 5902 | 5788 |
| 5903 | 6977 |
| 5904 | 3922 |
| 5905 | 5491 |
| 5906 | 6479 |
| 5907 | 5046 |
| 5908 | 3516 |
| 5909 | 7256 |
| 5910 | 5909 |
| 5911 | 3763 |
| 5912 | 6742 |
| 5913 | 5531 |
| 5914 | 6550 |
| 5915 | 2559 |
| 5916 | 5829 |
| 5917 | 7198 |
| 5918 | 3896 |
| 5919 | 4605 |
| 5920 | 6803 |
| 5921 | 3758 |
| 5922 | 6375 |
| 5923 | 5923 |
| 5924 | 7488 |
| 5925 | 3325 |
| 5926 | 5601 |
| 5927 | 6716 |
| 5928 | 3867 |
| 5929 | 5693 |
| 5930 | 6508 |
| 5931 | 5075 |
| 5932 | 3647 |
| 5933 | 7308 |
| 5934 | 5486 |
| 5935 | 2013 |
| 5936 | 6932 |
| 5937 | 5802 |
| 5938 | 6566 |
| 5939 | 3003 |
| 5940 | 5311 |

TABLE Q9-continued with a sequence length of 8192:

| Polarized channel sequence number | Reliability or reliability sequence number |
|---|---|
| 5941 | 6365 |
| 5942 | 3545 |
| 5943 | 4959 |
| 5944 | 7239 |
| 5945 | 3974 |
| 5946 | 5914 |
| 5947 | 6459 |
| 5948 | 5723 |
| 5949 | 3787 |
| 5950 | 6797 |
| 5951 | 5543 |
| 5952 | 3557 |
| 5953 | 7213 |
| 5954 | 5049 |
| 5955 | 6624 |
| 5956 | 3937 |
| 5957 | 5809 |
| 5958 | 6745 |
| 5959 | 2942 |
| 5960 | 7808 |
| 5961 | 5588 |
| 5962 | 6514 |
| 5963 | 3816 |
| 5964 | 5968 |
| 5965 | 6946 |
| 5966 | 3879 |
| 5967 | 5104 |
| 5968 | 7329 |
| 5969 | 5752 |
| 5970 | 1919 |
| 5971 | 6271 |
| 5972 | 5493 |
| 5973 | 3487 |
| 5974 | 6832 |
| 5975 | 5925 |
| 5976 | 7433 |
| 5977 | 3708 |
| 5978 | 4859 |
| 5979 | 6595 |
| 5980 | 3058 |
| 5981 | 5533 |
| 5982 | 6757 |
| 5983 | 5834 |
| 5984 | 3985 |
| 5985 | 7268 |
| 5986 | 5547 |
| 5987 | 3451 |
| 5988 | 6487 |
| 5989 | 6687 |
| 5990 | 5070 |
| 5991 | 3924 |
| 5992 | 7219 |
| 5993 | 5830 |
| 5994 | 3765 |
| 5995 | 6569 |
| 5996 | 6024 |
| 5997 | 6936 |
| 5998 | 3546 |
| 5999 | 5372 |
| 6000 | 7361 |
| 6001 | 3031 |
| 6002 | 4975 |
| 6003 | 6379 |
| 6004 | 5694 |
| 6005 | 2027 |
| 6006 | 6798 |
| 6007 | 5494 |
| 6008 | 3869 |
| 6009 | 6516 |
| 6010 | 5913 |
| 6011 | 7214 |
| 6012 | 3789 |
| 6013 | 6746 |
| 6014 | 5804 |
| 6015 | 6556 |

TABLE Q9-continued with a sequence length of 8192:

| Polarized channel sequence number | Reliability or reliability sequence number |
|---|---|
| 6016 | 3978 |
| 6017 | 5077 |
| 6018 | 7430 |
| 6019 | 3558 |
| 6020 | 5602 |
| 6021 | 6948 |
| 6022 | 5910 |
| 6023 | 3766 |
| 6024 | 6366 |
| 6025 | 5592 |
| 6026 | 3060 |
| 6027 | 7936 |
| 6028 | 5050 |
| 6029 | 6856 |
| 6030 | 3883 |
| 6031 | 5735 |
| 6032 | 6597 |
| 6033 | 3561 |
| 6034 | 7243 |
| 6035 | 5841 |
| 6036 | 6758 |
| 6037 | 3795 |
| 6038 | 5497 |
| 6039 | 6461 |
| 6040 | 5091 |
| 6041 | 3938 |
| 6042 | 7316 |
| 6043 | 5926 |
| 6044 | 2014 |
| 6045 | 6919 |
| 6046 | 5810 |
| 6047 | 6570 |
| 6048 | 3679 |
| 6049 | 5343 |
| 6050 | 7272 |
| 6051 | 3548 |
| 6052 | 6805 |
| 6053 | 5078 |
| 6054 | 6381 |
| 6055 | 3005 |
| 6056 | 5984 |
| 6057 | 7441 |
| 6058 | 5534 |
| 6059 | 3986 |
| 6060 | 6761 |
| 6061 | 5725 |
| 6062 | 3769 |
| 6063 | 6819 |
| 6064 | 5833 |
| 6065 | 7330 |
| 6066 | 3503 |
| 6067 | 4983 |
| 6068 | 6491 |
| 6069 | 3928 |
| 6070 | 7221 |
| 6071 | 5575 |
| 6072 | 6978 |
| 6073 | 3824 |
| 6074 | 6032 |
| 6075 | 6577 |
| 6076 | 5549 |
| 6077 | 2815 |
| 6078 | 7245 |
| 6079 | 5052 |
| 6080 | 3870 |
| 6081 | 6748 |
| 6082 | 5739 |
| 6083 | 6520 |
| 6084 | 2029 |
| 6085 | 5955 |
| 6086 | 7683 |
| 6087 | 6703 |
| 6088 | 3326 |
| 6089 | 5498 |
| 6090 | 6387 |

TABLE Q9-continued with a sequence length of 8192:

| Polarized channel sequence number | Reliability or reliability sequence number |
|---|---|
| 6091 | 3790 |
| 6092 | 5775 |
| 6093 | 7320 |
| 6094 | 4606 |
| 6095 | 3980 |
| 6096 | 6923 |
| 6097 | 5929 |
| 6098 | 6602 |
| 6099 | 3911 |
| 6100 | 7434 |
| 6101 | 5604 |
| 6102 | 3035 |
| 6103 | 6762 |
| 6104 | 5812 |
| 6105 | 6598 |
| 6106 | 3453 |
| 6107 | 4861 |
| 6108 | 7222 |
| 6109 | 5555 |
| 6110 | 3695 |
| 6111 | 6810 |
| 6112 | 5726 |
| 6113 | 6462 |
| 6114 | 3885 |
| 6115 | 7332 |
| 6116 | 5916 |
| 6117 | 3797 |
| 6118 | 6952 |
| 6119 | 5359 |
| 6120 | 6572 |
| 6121 | 3562 |
| 6122 | 5081 |
| 6123 | 7251 |
| 6124 | 5783 |
| 6125 | 2035 |
| 6126 | 6711 |
| 6127 | 5957 |
| 6128 | 4001 |
| 6129 | 6382 |
| 6130 | 7442 |
| 6131 | 5550 |
| 6132 | 3064 |
| 6133 | 6864 |
| 6134 | 5836 |
| 6135 | 7685 |
| 6136 | 3770 |
| 6137 | 5093 |
| 6138 | 6503 |
| 6139 | 5439 |
| 6140 | 3511 |
| 6141 | 7042 |
| 6142 | 7225 |
| 6143 | 6048 |
| 6144 | 3940 |
| 6145 | 6769 |
| 6146 | 5741 |
| 6147 | 3811 |
| 6148 | 6609 |
| 6149 | 5023 |
| 6150 | 7303 |
| 6151 | 3891 |
| 6152 | 5579 |
| 6153 | 6821 |
| 6154 | 6578 |
| 6155 | 3569 |
| 6156 | 5930 |
| 6157 | 7280 |
| 6158 | 5842 |
| 6159 | 3006 |
| 6160 | 6980 |
| 6161 | 5608 |
| 6162 | 4033 |
| 6163 | 6389 |
| 6164 | 4987 |
| 6165 | 7436 |

TABLE Q9-continued with a sequence length of 8192:

| Polarized channel sequence number | Reliability or reliability sequence number |
|---|---|
| 6166 | 3798 |
| 6167 | 6809 |
| 6168 | 5816 |
| 6169 | 6493 |
| 6170 | 2030 |
| 6171 | 5937 |
| 6172 | 7362 |
| 6173 | 5500 |
| 6174 | 3886 |
| 6175 | 6735 |
| 6176 | 7246 |
| 6177 | 5747 |
| 6178 | 3535 |
| 6179 | 6601 |
| 6180 | 5082 |
| 6181 | 3703 |
| 6182 | 6931 |
| 6183 | 5557 |
| 6184 | 7744 |
| 6185 | 3047 |
| 6186 | 5962 |
| 6187 | 6806 |
| 6188 | 6507 |
| 6189 | 3915 |
| 6190 | 5787 |
| 6191 | 7307 |
| 6192 | 5367 |
| 6193 | 3772 |
| 6194 | 6764 |
| 6195 | 5094 |
| 6196 | 6390 |
| 6197 | 3564 |
| 6198 | 7457 |
| 6199 | 5958 |
| 6200 | 6925 |
| 6201 | 3988 |
| 6202 | 5857 |
| 6203 | 7253 |
| 6204 | 5581 |
| 6205 | 3944 |
| 6206 | 6543 |
| 6207 | 6019 |
| 6208 | 3801 |
| 6209 | 6822 |
| 6210 | 7226 |
| 6211 | 5097 |
| 6212 | 3515 |
| 6213 | 6580 |
| 6214 | 5742 |
| 6215 | 6715 |
| 6216 | 2037 |
| 6217 | 5558 |
| 6218 | 7336 |
| 6219 | 6494 |
| 6220 | 3037 |
| 6221 | 5932 |
| 6222 | 7553 |
| 6223 | 5084 |
| 6224 | 4002 |
| 6225 | 6960 |
| 6226 | 5799 |
| 6227 | 6880 |
| 6228 | 3813 |
| 6229 | 7689 |
| 6230 | 5587 |
| 6231 | 6551 |
| 6232 | 3893 |
| 6233 | 5969 |
| 6234 | 6770 |
| 6235 | 5844 |
| 6236 | 3454 |
| 6237 | 7267 |
| 6238 | 6393 |
| 6239 | 5039 |
| 6240 | 3917 |

TABLE Q9-continued with a sequence length of 8192:

| Polarized channel sequence number | Reliability or reliability sequence number |
|---|---|
| 6241 | 7364 |
| 6242 | 5471 |
| 6243 | 6926 |
| 6244 | 3743 |
| 6245 | 5938 |
| 6246 | 6604 |
| 6247 | 7489 |
| 6248 | 2943 |
| 6249 | 5749 |
| 6250 | 6851 |
| 6251 | 5561 |
| 6252 | 3992 |
| 6253 | 6984 |
| 6254 | 5789 |
| 6255 | 7254 |
| 6256 | 3570 |
| 6257 | 6509 |
| 6258 | 4862 |
| 6259 | 7315 |
| 6260 | 3707 |
| 6261 | 5616 |
| 6262 | 6743 |
| 6263 | 6021 |
| 6264 | 3894 |
| 6265 | 6610 |
| 6266 | 7686 |
| 6267 | 5803 |
| 6268 | 2038 |
| 6269 | 6825 |
| 6270 | 5371 |
| 6271 | 6584 |
| 6272 | 3802 |
| 6273 | 7228 |
| 6274 | 4989 |
| 6275 | 7044 |
| 6276 | 4004 |
| 6277 | 5961 |
| 6278 | 7444 |
| 6279 | 5750 |
| 6280 | 3051 |
| 6281 | 6394 |
| 6282 | 6772 |
| 6283 | 5582 |
| 6284 | 3543 |
| 6285 | 7309 |
| 6286 | 5903 |
| 6287 | 6812 |
| 6288 | 3923 |
| 6289 | 5098 |
| 6290 | 6515 |
| 6291 | 7257 |
| 6292 | 3814 |
| 6293 | 5858 |
| 6294 | 6933 |
| 6295 | 5940 |
| 6296 | 3897 |
| 6297 | 7458 |
| 6298 | 6555 |
| 6299 | 5487 |
| 6300 | 3572 |
| 6301 | 6853 |
| 6302 | 5848 |
| 6303 | 7344 |
| 6304 | 3975 |
| 6305 | 5047 |
| 6306 | 6947 |
| 6307 | 7697 |
| 6308 | 3817 |
| 6309 | 6080 |
| 6310 | 6625 |
| 6311 | 5589 |
| 6312 | 3038 |
| 6313 | 6717 |
| 6314 | 7269 |
| 6315 | 5753 |

TABLE Q9-continued with a sequence length of 8192:

| Polarized channel sequence number | Reliability or reliability sequence number |
|---|---|
| 6316 | 3952 |
| 6317 | 6510 |
| 6318 | 5911 |
| 6319 | 6826 |
| 6320 | 2041 |
| 6321 | 5562 |
| 6322 | 7199 |
| 6323 | 6335 |
| 6324 | 3517 |
| 6325 | 5105 |
| 6326 | 7448 |
| 6327 | 5790 |
| 6328 | 3804 |
| 6329 | 6938 |
| 6330 | 6747 |
| 6331 | 5964 |
| 6332 | 4034 |
| 6333 | 7310 |
| 6334 | 5603 |
| 6335 | 6567 |
| 6336 | 7258 |
| 6337 | 3918 |
| 6338 | 5831 |
| 6339 | 6833 |
| 6340 | 5071 |
| 6341 | 3759 |
| 6342 | 6612 |
| 6343 | 6025 |
| 6344 | 7690 |
| 6345 | 3327 |
| 6346 | 6992 |
| 6347 | 5590 |
| 6348 | 7460 |
| 6349 | 3053 |
| 6350 | 5805 |
| 6351 | 6776 |
| 6352 | 6517 |
| 6353 | 3979 |
| 6354 | 5754 |
| 6355 | 7368 |
| 6356 | 5100 |
| 6357 | 3709 |
| 6358 | 6949 |
| 6359 | 7270 |
| 6360 | 5495 |
| 6361 | 3925 |
| 6362 | 6557 |
| 6363 | 5860 |
| 6364 | 6858 |
| 6365 | 7431 |
| 6366 | 3547 |
| 6367 | 5970 |
| 6368 | 6571 |
| 6369 | 5564 |
| 6370 | 3898 |
| 6371 | 7698 |
| 6372 | 6854 |
| 6373 | 5811 |
| 6374 | 2042 |
| 6375 | 7048 |
| 6376 | 4607 |
| 6377 | 7317 |
| 6378 | 3818 |
| 6379 | 6396 |
| 6380 | 5944 |
| 6381 | 7273 |
| 6382 | 5806 |
| 6383 | 4008 |
| 6384 | 6718 |
| 6385 | 6518 |
| 6386 | 5373 |
| 6387 | 3059 |
| 6388 | 7331 |
| 6389 | 5915 |
| 6390 | 6937 |

TABLE Q9-continued with a sequence length of 8192:

| Polarized channel sequence number | Reliability or reliability sequence number |
|---|---|
| 6391 | 3939 |
| 6392 | 7490 |
| 6393 | 5695 |
| 6394 | 6828 |
| 6395 | 3576 |
| 6396 | 5051 |
| 6397 | 6626 |
| 6398 | 7260 |
| 6399 | 5593 |
| 6400 | 3767 |
| 6401 | 6934 |
| 6402 | 6022 |
| 6403 | 7692 |
| 6404 | 4036 |
| 6405 | 6616 |
| 6406 | 5835 |
| 6407 | 7215 |
| 6408 | 3926 |
| 6409 | 5605 |
| 6410 | 6759 |
| 6411 | 6865 |
| 6412 | 3825 |
| 6413 | 5985 |
| 6414 | 7435 |
| 6415 | 4990 |
| 6416 | 6521 |
| 6417 | 3518 |
| 6418 | 7274 |
| 6419 | 5864 |
| 6420 | 6950 |
| 6421 | 3054 |
| 6422 | 5927 |
| 6423 | 6834 |
| 6424 | 7322 |
| 6425 | 3987 |
| 6426 | 5535 |
| 6427 | 6367 |
| 6428 | 5756 |
| 6429 | 7713 |
| 6430 | 3791 |
| 6431 | 7008 |
| 6432 | 5106 |
| 6433 | 6558 |
| 6434 | 3900 |
| 6435 | 6033 |
| 6436 | 7464 |
| 6437 | 6749 |
| 6438 | 1983 |
| 6439 | 5499 |
| 6440 | 7223 |
| 6441 | 6857 |
| 6442 | 5972 |
| 6443 | 3981 |
| 6444 | 7376 |
| 6445 | 5813 |
| 6446 | 6599 |
| 6447 | 3559 |
| 6448 | 7056 |
| 6449 | 5594 |
| 6450 | 7554 |
| 6451 | 3820 |
| 6452 | 5079 |
| 6453 | 6573 |
| 6454 | 7809 |
| 6455 | 5917 |
| 6456 | 3929 |
| 6457 | 6763 |
| 6458 | 5837 |
| 6459 | 6979 |
| 6460 | 4016 |
| 6461 | 7281 |
| 6462 | 6026 |
| 6463 | 6522 |
| 6464 | 7333 |
| 6465 | 3061 |

TABLE Q9-continued

| with a sequence length of 8192: | |
|---|---|
| Polarized channel sequence number | Reliability or reliability sequence number |
| 6466 | 5606 |
| 6467 | 6799 |
| 6468 | 5814 |
| 6469 | 3549 |
| 6470 | 7492 |
| 6471 | 6953 |
| 6472 | 5108 |
| 6473 | 3771 |
| 6474 | 6628 |
| 6475 | 5931 |
| 6476 | 7321 |
| 6477 | 6836 |
| 6478 | 3941 |
| 6479 | 5609 |
| 6480 | 7247 |
| 6481 | 6579 |
| 6482 | 3871 |
| 6483 | 5843 |
| 6484 | 7745 |
| 6485 | 5986 |
| 6486 | 6750 |
| 6487 | 3710 |
| 6488 | 6940 |
| 6489 | 5727 |
| 6490 | 7443 |
| 6491 | 3982 |
| 6492 | 5596 |
| 6493 | 6383 |
| 6494 | 7318 |
| 6495 | 5053 |
| 6496 | 3455 |
| 6497 | 6807 |
| 6498 | 7276 |
| 6499 | 6034 |
| 6500 | 3930 |
| 6501 | 6981 |
| 6502 | 5817 |
| 6503 | 6574 |
| 6504 | 7700 |
| 6505 | 2044 |
| 6506 | 5551 |
| 6507 | 6860 |
| 6508 | 7437 |
| 6509 | 3062 |
| 6510 | 5976 |
| 6511 | 6463 |
| 6512 | 5872 |
| 6513 | 7334 |
| 6514 | 3826 |
| 6515 | 7072 |
| 6516 | 4863 |
| 6517 | 7227 |
| 6518 | 4040 |
| 6519 | 6765 |
| 6520 | 5918 |
| 6521 | 6603 |
| 6522 | 5374 |
| 6523 | 3942 |
| 6524 | 7472 |
| 6525 | 6954 |
| 6526 | 5838 |
| 6527 | 7714 |
| 6528 | 3563 |
| 6529 | 6866 |
| 6530 | 6028 |
| 6531 | 7392 |
| 6532 | 3799 |
| 6533 | 5959 |
| 6534 | 6632 |
| 6535 | 6840 |
| 6536 | 5083 |
| 6537 | 3989 |
| 6538 | 7282 |
| 6539 | 6961 |
| 6540 | 5501 |

TABLE Q9-continued

| with a sequence length of 8192: | |
|---|---|
| Polarized channel sequence number | Reliability or reliability sequence number |
| 6541 | 3945 |
| 6542 | 7438 |
| 6543 | 5743 |
| 6544 | 6524 |
| 6545 | 7363 |
| 6546 | 3828 |
| 6547 | 5933 |
| 6548 | 6771 |
| 6549 | 7704 |
| 6550 | 5845 |
| 6551 | 3065 |
| 6552 | 6581 |
| 6553 | 5610 |
| 6554 | 6986 |
| 6555 | 3550 |
| 6556 | 7496 |
| 6557 | 6049 |
| 6558 | 6811 |
| 6559 | 7255 |
| 6560 | 4003 |
| 6561 | 5112 |
| 6562 | 6391 |
| 6563 | 5818 |
| 6564 | 3932 |
| 6565 | 7337 |
| 6566 | 6982 |
| 6567 | 5559 |
| 6568 | 7556 |
| 6569 | 3773 |
| 6570 | 6881 |
| 6571 | 5988 |
| 6572 | 6605 |
| 6573 | 7937 |
| 6574 | 3887 |
| 6575 | 5859 |
| 6576 | 7043 |
| 6577 | 5939 |
| 6578 | 7284 |
| 6579 | 2015 |
| 6580 | 6766 |
| 6581 | 5617 |
| 6582 | 7324 |
| 6583 | 3946 |
| 6584 | 6582 |
| 6585 | 5054 |
| 6586 | 7445 |
| 6587 | 6956 |
| 6588 | 3565 |
| 6589 | 6081 |
| 6590 | 6823 |
| 6591 | 5846 |
| 6592 | 7716 |
| 6593 | 3994 |
| 6594 | 6611 |
| 6595 | 5934 |
| 6596 | 7365 |
| 6597 | 3803 |
| 6598 | 6993 |
| 6599 | 5583 |
| 6600 | 7459 |
| 6601 | 6868 |
| 6602 | 3066 |
| 6603 | 5751 |
| 6604 | 7229 |
| 6605 | 6495 |
| 6606 | 5095 |
| 6607 | 3895 |
| 6608 | 7338 |
| 6609 | 5963 |
| 6610 | 6962 |
| 6611 | 7687 |
| 6612 | 4048 |
| 6613 | 5820 |
| 6614 | 6773 |
| 6615 | 6585 |

TABLE Q9-continued

| with a sequence length of 8192: | |
|---|---|
| Polarized channel sequence number | Reliability or reliability sequence number |
| 6616 | 5612 |
| 6617 | 3832 |
| 6618 | 7450 |
| 6619 | 6813 |
| 6620 | 6036 |
| 6621 | 3571 |
| 6622 | 7259 |
| 6623 | 5992 |
| 6624 | 6640 |
| 6625 | 7345 |
| 6626 | 3953 |
| 6627 | 5849 |
| 6628 | 7045 |
| 6629 | 7746 |
| 6630 | 5563 |
| 6631 | 4005 |
| 6632 | 6827 |
| 6633 | 7504 |
| 6634 | 5085 |
| 6635 | 6395 |
| 6636 | 3774 |
| 6637 | 7288 |
| 6638 | 6050 |
| 6639 | 6985 |
| 6640 | 6774 |
| 6641 | 3993 |
| 6642 | 5861 |
| 6643 | 7461 |
| 6644 | 5941 |
| 6645 | 6606 |
| 6646 | 3566 |
| 6647 | 7370 |
| 6648 | 5502 |
| 6649 | 6927 |
| 6650 | 7691 |
| 6651 | 3007 |
| 6652 | 5965 |
| 6653 | 6882 |
| 6654 | 7366 |
| 6655 | 5791 |
| 6656 | 3919 |
| 6657 | 6964 |
| 6658 | 7560 |
| 6659 | 4991 |
| 6660 | 2031 |
| 6661 | 6511 |
| 6662 | 7230 |
| 6663 | 6040 |
| 6664 | 6872 |
| 6665 | 3990 |
| 6666 | 7720 |
| 6667 | 5618 |
| 6668 | 7104 |
| 6669 | 5755 |
| 6670 | 3815 |
| 6671 | 6613 |
| 6672 | 7449 |
| 6673 | 5942 |
| 6674 | 6777 |
| 6675 | 3948 |
| 6676 | 7340 |
| 6677 | 5850 |
| 6678 | 6935 |
| 6679 | 7446 |
| 6680 | 4006 |
| 6681 | 6052 |
| 6682 | 6586 |
| 6683 | 7810 |
| 6684 | 5099 |
| 6685 | 3805 |
| 6686 | 6814 |
| 6687 | 7271 |
| 6688 | 5591 |
| 6689 | 6988 |
| 6690 | 3573 |

TABLE Q9-continued

| with a sequence length of 8192: | |
|---|---|
| Polarized channel sequence number | Reliability or reliability sequence number |
| 6691 | 7377 |
| 6692 | 5971 |
| 6693 | 6627 |
| 6694 | 7462 |
| 6695 | 3899 |
| 6696 | 5862 |
| 6697 | 6855 |
| 6698 | 7748 |
| 6699 | 5945 |
| 6700 | 4064 |
| 6701 | 7049 |
| 6702 | 7346 |
| 6703 | 5620 |
| 6704 | 6614 |
| 6705 | 3954 |
| 6706 | 7520 |
| 6707 | 6023 |
| 6708 | 6829 |
| 6709 | 7261 |
| 6710 | 5865 |
| 6711 | 3068 |
| 6712 | 6778 |
| 6713 | 5086 |
| 6714 | 6519 |
| 6715 | 7699 |
| 6716 | 3711 |
| 6717 | 6000 |
| 6718 | 6884 |
| 6719 | 7369 |
| 6720 | 5565 |
| 6721 | 4035 |
| 6722 | 6994 |
| 6723 | 7568 |
| 6724 | 5852 |
| 6725 | 6588 |
| 6726 | 3574 |
| 6727 | 7275 |
| 6728 | 6082 |
| 6729 | 6835 |
| 6730 | 7693 |
| 6731 | 3927 |
| 6732 | 5966 |
| 6733 | 6968 |
| 6734 | 7491 |
| 6735 | 5807 |
| 6736 | 4009 |
| 6737 | 6830 |
| 6738 | 7311 |
| 6739 | 5375 |
| 6740 | 6397 |
| 6741 | 3819 |
| 6742 | 7465 |
| 6743 | 5101 |
| 6744 | 6939 |
| 6745 | 7728 |
| 6746 | 6027 |
| 6747 | 3956 |
| 6748 | 6719 |
| 6749 | 7348 |
| 6750 | 5757 |
| 6751 | 6617 |
| 6752 | 2039 |
| 6753 | 7262 |
| 6754 | 5973 |
| 6755 | 7046 |
| 6756 | 7452 |
| 6757 | 3996 |
| 6758 | 5595 |
| 6759 | 6859 |
| 6760 | 7694 |
| 6761 | 5946 |
| 6762 | 3806 |
| 6763 | 6629 |
| 6764 | 7319 |
| 6765 | 7009 |

TABLE Q9-continued with a sequence length of 8192:

| Polarized channel sequence number | Reliability or reliability sequence number |
|---|---|
| 6766 | 5866 |
| 6767 | 7493 |
| 6768 | 3577 |
| 6769 | 6888 |
| 6770 | 6056 |
| 6771 | 7372 |
| 6772 | 6951 |
| 6773 | 3039 |
| 6774 | 5107 |
| 6775 | 7752 |
| 6776 | 6559 |
| 6777 | 5987 |
| 6778 | 4037 |
| 6779 | 7584 |
| 6780 | 6780 |
| 6781 | 5624 |
| 6782 | 7277 |
| 6783 | 7057 |
| 6784 | 3901 |
| 6785 | 5815 |
| 6786 | 7938 |
| 6787 | 6523 |
| 6788 | 6084 |
| 6789 | 4010 |
| 6790 | 7466 |
| 6791 | 6996 |
| 6792 | 5974 |
| 6793 | 7378 |
| 6794 | 3821 |
| 6795 | 6837 |
| 6796 | 5873 |
| 6797 | 7352 |
| 6798 | 6618 |
| 6799 | 5566 |
| 6800 | 3931 |
| 6801 | 7812 |
| 6802 | 6941 |
| 6803 | 5102 |
| 6804 | 7473 |
| 6805 | 4017 |
| 6806 | 6861 |
| 6807 | 6035 |
| 6808 | 7283 |
| 6809 | 7050 |
| 6810 | 3578 |
| 6811 | 7498 |
| 6812 | 5839 |
| 6813 | 6630 |
| 6814 | 7701 |
| 6815 | 5948 |
| 6816 | 3960 |
| 6817 | 6838 |
| 6818 | 7323 |
| 6819 | 6029 |
| 6820 | 6955 |
| 6821 | 3827 |
| 6822 | 7494 |
| 6823 | 5607 |
| 6824 | 6633 |
| 6825 | 7715 |
| 6826 | 5868 |
| 6827 | 4042 |
| 6828 | 6867 |
| 6829 | 7393 |
| 6830 | 5977 |
| 6831 | 7010 |
| 6832 | 4038 |
| 6833 | 6751 |
| 6834 | 6620 |
| 6835 | 6064 |
| 6836 | 7555 |
| 6837 | 7058 |
| 6838 | 3902 |
| 6839 | 5109 |
| 6840 | 7278 |

TABLE Q9-continued with a sequence length of 8192:

| Polarized channel sequence number | Reliability or reliability sequence number |
|---|---|
| 6841 | 6841 |
| 6842 | 5597 |
| 6843 | 3055 |
| 6844 | 7706 |
| 6845 | 6575 |
| 6846 | 5819 |
| 6847 | 7468 |
| 6848 | 7000 |
| 6849 | 4012 |
| 6850 | 5989 |
| 6851 | 7335 |
| 6852 | 6896 |
| 6853 | 7760 |
| 6854 | 3519 |
| 6855 | 5919 |
| 6856 | 6942 |
| 6857 | 7505 |
| 6858 | 5758 |
| 6859 | 6398 |
| 6860 | 3822 |
| 6861 | 7380 |
| 6862 | 6030 |
| 6863 | 6862 |
| 6864 | 7474 |
| 6865 | 5503 |
| 6866 | 2043 |
| 6867 | 7052 |
| 6868 | 7717 |
| 6869 | 5978 |
| 6870 | 6983 |
| 6871 | 3943 |
| 6872 | 7285 |
| 6873 | 6525 |
| 6874 | 5110 |
| 6875 | 7325 |
| 6876 | 6767 |
| 6877 | 4049 |
| 6878 | 5874 |
| 6879 | 7816 |
| 6880 | 6957 |
| 6881 | 6088 |
| 6882 | 7557 |
| 6883 | 4018 |
| 6884 | 6869 |
| 6885 | 7339 |
| 6886 | 5990 |
| 6887 | 6634 |
| 6888 | 3829 |
| 6889 | 7497 |
| 6890 | 5611 |
| 6891 | 7073 |
| 6892 | 7705 |
| 6893 | 5847 |
| 6894 | 3933 |
| 6895 | 6842 |
| 6896 | 7286 |
| 6897 | 6037 |
| 6898 | 6583 |
| 6899 | 7439 |
| 6900 | 4041 |
| 6901 | 7012 |
| 6902 | 5993 |
| 6903 | 7702 |
| 6904 | 6883 |
| 6905 | 5876 |
| 6906 | 3580 |
| 6907 | 7394 |
| 6908 | 6963 |
| 6909 | 5113 |
| 6910 | 7476 |
| 6911 | 6641 |
| 6912 | 3947 |
| 6913 | 7940 |
| 6914 | 5598 |
| 6915 | 7105 |

TABLE Q9-continued with a sequence length of 8192:

| Polarized channel sequence number | Reliability or reliability sequence number |
|---|---|
| 6916 | 7384 |
| 6917 | 3830 |
| 6918 | 6051 |
| 6919 | 6870 |
| 6920 | 7616 |
| 6921 | 6958 |
| 6922 | 5980 |
| 6923 | 3063 |
| 6924 | 7718 |
| 6925 | 6607 |
| 6926 | 5821 |
| 6927 | 7289 |
| 6928 | 6775 |
| 6929 | 3983 |
| 6930 | 5935 |
| 6931 | 7447 |
| 6932 | 6987 |
| 6933 | 7326 |
| 6934 | 5994 |
| 6935 | 4020 |
| 6936 | 6844 |
| 6937 | 7776 |
| 6938 | 5613 |
| 6939 | 6636 |
| 6940 | 7500 |
| 6941 | 3934 |
| 6942 | 6042 |
| 6943 | 7367 |
| 6944 | 7060 |
| 6945 | 7824 |
| 6946 | 5851 |
| 6947 | 3991 |
| 6948 | 7016 |
| 6949 | 7561 |
| 6950 | 5114 |
| 6951 | 6873 |
| 6952 | 7341 |
| 6953 | 3833 |
| 6954 | 6587 |
| 6955 | 5943 |
| 6956 | 7747 |
| 6957 | 7074 |
| 6958 | 6096 |
| 6959 | 3551 |
| 6960 | 7290 |
| 6961 | 6885 |
| 6962 | 7396 |
| 6963 | 5880 |
| 6964 | 6965 |
| 6965 | 4044 |
| 6966 | 7721 |
| 6967 | 5619 |
| 6968 | 6526 |
| 6969 | 7506 |
| 6970 | 6989 |
| 6971 | 3949 |
| 6972 | 6001 |
| 6973 | 7347 |
| 6974 | 6815 |
| 6975 | 6053 |
| 6976 | 7708 |
| 6977 | 4050 |
| 6978 | 7064 |
| 6979 | 7480 |
| 6980 | 5822 |
| 6981 | 6642 |
| 6982 | 7342 |
| 6983 | 4024 |
| 6984 | 6041 |
| 6985 | 7749 |
| 6986 | 6779 |
| 6987 | 7451 |
| 6988 | 5614 |
| 6989 | 3834 |
| 6990 | 6966 |

TABLE Q9-continued with a sequence length of 8192:

| Polarized channel sequence number | Reliability or reliability sequence number |
|---|---|
| 6991 | 7231 |
| 6992 | 5055 |
| 6993 | 6874 |
| 6994 | 7558 |
| 6995 | 2045 |
| 6996 | 7076 |
| 6997 | 5967 |
| 6998 | 7840 |
| 6999 | 6615 |
| 7000 | 6038 |
| 7001 | 7371 |
| 7002 | 3955 |
| 7003 | 6995 |
| 7004 | 7521 |
| 7005 | 5863 |
| 7006 | 6886 |
| 7007 | 7944 |
| 7008 | 3995 |
| 7009 | 5996 |
| 7010 | 7400 |
| 7011 | 6969 |
| 7012 | 7463 |
| 7013 | 6054 |
| 7014 | 4065 |
| 7015 | 6644 |
| 7016 | 7722 |
| 7017 | 7047 |
| 7018 | 5853 |
| 7019 | 7292 |
| 7020 | 3067 |
| 7021 | 6889 |
| 7022 | 5621 |
| 7023 | 7569 |
| 7024 | 7024 |
| 7025 | 7729 |
| 7026 | 5947 |
| 7027 | 3567 |
| 7028 | 6589 |
| 7029 | 7508 |
| 7030 | 6112 |
| 7031 | 7754 |
| 7032 | 6876 |
| 7033 | 3950 |
| 7034 | 7349 |
| 7035 | 6002 |
| 7036 | 7106 |
| 7037 | 7453 |
| 7038 | 6990 |
| 7039 | 5116 |
| 7040 | 3775 |
| 7041 | 7750 |
| 7042 | 6831 |
| 7043 | 5759 |
| 7044 | 7373 |
| 7045 | 6399 |
| 7046 | 4007 |
| 7047 | 7562 |
| 7048 | 6083 |
| 7049 | 7811 |
| 7050 | 7051 |
| 7051 | 7350 |
| 7052 | 4052 |
| 7053 | 5622 |
| 7054 | 6781 |
| 7055 | 7467 |
| 7056 | 6997 |
| 7057 | 5975 |
| 7058 | 7724 |
| 7059 | 3957 |
| 7060 | 6619 |
| 7061 | 6057 |
| 7062 | 7379 |
| 7063 | 6970 |
| 7064 | 7522 |
| 7065 | 3997 |

TABLE Q9-continued with a sequence length of 8192:

| Polarized channel sequence number | Reliability or reliability sequence number |
|---|---|
| 7066 | 5867 |
| 7067 | 7952 |
| 7068 | 6890 |
| 7069 | 7263 |
| 7070 | 6004 |
| 7071 | 7080 |
| 7072 | 4011 |
| 7073 | 7570 |
| 7074 | 7011 |
| 7075 | 6044 |
| 7076 | 7761 |
| 7077 | 6648 |
| 7078 | 3836 |
| 7079 | 5854 |
| 7080 | 7353 |
| 7081 | 7512 |
| 7082 | 6839 |
| 7083 | 5625 |
| 7084 | 7730 |
| 7085 | 3575 |
| 7086 | 7108 |
| 7087 | 7408 |
| 7088 | 5087 |
| 7089 | 6998 |
| 7090 | 7454 |
| 7091 | 6897 |
| 7092 | 3958 |
| 7093 | 6085 |
| 7094 | 7813 |
| 7095 | 7374 |
| 7096 | 5949 |
| 7097 | 6590 |
| 7098 | 4066 |
| 7099 | 7753 |
| 7100 | 7059 |
| 7101 | 6058 |
| 7102 | 7564 |
| 7103 | 6863 |
| 7104 | 7495 |
| 7105 | 4056 |
| 7106 | 5869 |
| 7107 | 7695 |
| 7108 | 6972 |
| 7109 | 7279 |
| 7110 | 5979 |
| 7111 | 7053 |
| 7112 | 3961 |
| 7113 | 7469 |
| 7114 | 6631 |
| 7115 | 6065 |
| 7116 | 7732 |
| 7117 | 6892 |
| 7118 | 7381 |
| 7119 | 3807 |
| 7120 | 5626 |
| 7121 | 7968 |
| 7122 | 7001 |
| 7123 | 7585 |
| 7124 | 6008 |
| 7125 | 7088 |
| 7126 | 3069 |
| 7127 | 7354 |
| 7128 | 6621 |
| 7129 | 5875 |
| 7130 | 7872 |
| 7131 | 7524 |
| 7132 | 3998 |
| 7133 | 6843 |
| 7134 | 6090 |
| 7135 | 7395 |
| 7136 | 7013 |
| 7137 | 7703 |
| 7138 | 6086 |
| 7139 | 4039 |
| 7140 | 6943 |

TABLE Q9-continued with a sequence length of 8192:

| Polarized channel sequence number | Reliability or reliability sequence number |
|---|---|
| 7141 | 7475 |
| 7142 | 7756 |
| 7143 | 5950 |
| 7144 | 6782 |
| 7145 | 7617 |
| 7146 | 4013 |
| 7147 | 7054 |
| 7148 | 5103 |
| 7149 | 7382 |
| 7150 | 7817 |
| 7151 | 6527 |
| 7152 | 6060 |
| 7153 | 3962 |
| 7154 | 7470 |
| 7155 | 7002 |
| 7156 | 7287 |
| 7157 | 5567 |
| 7158 | 6898 |
| 7159 | 7762 |
| 7160 | 4068 |
| 7161 | 7499 |
| 7162 | 5870 |
| 7163 | 7112 |
| 7164 | 7736 |
| 7165 | 7014 |
| 7166 | 5991 |
| 7167 | 7356 |
| 7168 | 2046 |
| 7169 | 6635 |
| 7170 | 7572 |
| 7171 | 6097 |
| 7172 | 8064 |
| 7173 | 6871 |
| 7174 | 7528 |
| 7175 | 3579 |
| 7176 | 6066 |
| 7177 | 7061 |
| 7178 | 7385 |
| 7179 | 7707 |
| 7180 | 5877 |
| 7181 | 7017 |
| 7182 | 4019 |
| 7183 | 7586 |
| 7184 | 6900 |
| 7185 | 5981 |
| 7186 | 7814 |
| 7187 | 7397 |
| 7188 | 6622 |
| 7189 | 3823 |
| 7190 | 6089 |
| 7191 | 7477 |
| 7192 | 7075 |
| 7193 | 7777 |
| 7194 | 5628 |
| 7195 | 7004 |
| 7196 | 4014 |
| 7197 | 7501 |
| 7198 | 7719 |
| 7199 | 5995 |
| 7200 | 6845 |
| 7201 | 7327 |
| 7202 | 6959 |
| 7203 | 7576 |
| 7204 | 3903 |
| 7205 | 5878 |
| 7206 | 7939 |
| 7207 | 7018 |
| 7208 | 7291 |
| 7209 | 5111 |
| 7210 | 6637 |
| 7211 | 4043 |
| 7212 | 7825 |
| 7213 | 7478 |
| 7214 | 6031 |
| 7215 | 7066 |

TABLE Q9-continued with a sequence length of 8192:

| Polarized channel sequence number | Reliability or reliability sequence number |
|---|---|
| 7216 | 7386 |
| 7217 | 6875 |
| 7218 | 4072 |
| 7219 | 6068 |
| 7220 | 7764 |
| 7221 | 7588 |
| 7222 | 6967 |
| 7223 | 7709 |
| 7224 | 5982 |
| 7225 | 7120 |
| 7226 | 3964 |
| 7227 | 7507 |
| 7228 | 7818 |
| 7229 | 6039 |
| 7230 | 6904 |
| 7231 | 7398 |
| 7232 | 6643 |
| 7233 | 4021 |
| 7234 | 5881 |
| 7235 | 7481 |
| 7236 | 7723 |
| 7237 | 7025 |
| 7238 | 5599 |
| 7239 | 7559 |
| 7240 | 7077 |
| 7241 | 3831 |
| 7242 | 7941 |
| 7243 | 7401 |
| 7244 | 6092 |
| 7245 | 6846 |
| 7246 | 7536 |
| 7247 | 7778 |
| 7248 | 5997 |
| 7249 | 4045 |
| 7250 | 7065 |
| 7251 | 7388 |
| 7252 | 6638 |
| 7253 | 6098 |
| 7254 | 7826 |
| 7255 | 7618 |
| 7256 | 4022 |
| 7257 | 6991 |
| 7258 | 7502 |
| 7259 | 6072 |
| 7260 | 7062 |
| 7261 | 7768 |
| 7262 | 7343 |
| 7263 | 5882 |
| 7264 | 3581 |
| 7265 | 6887 |
| 7266 | 7710 |
| 7267 | 7020 |
| 7268 | 7563 |
| 7269 | 6003 |
| 7270 | 8000 |
| 7271 | 7078 |
| 7272 | 4051 |
| 7273 | 7293 |
| 7274 | 6043 |
| 7275 | 7509 |
| 7276 | 6877 |
| 7277 | 7820 |
| 7278 | 6645 |
| 7279 | 6113 |
| 7280 | 3070 |
| 7281 | 7482 |
| 7282 | 7751 |
| 7283 | 6971 |
| 7284 | 5115 |
| 7285 | 7402 |
| 7286 | 7725 |
| 7287 | 7136 |
| 7288 | 3935 |
| 7289 | 7592 |
| 7290 | 5615 |

TABLE Q9-continued with a sequence length of 8192:

| Polarized channel sequence number | Reliability or reliability sequence number |
|---|---|
| 7291 | 7026 |
| 7292 | 7841 |
| 7293 | 7523 |
| 7294 | 5998 |
| 7295 | 6783 |
| 7296 | 4025 |
| 7297 | 7351 |
| 7298 | 7945 |
| 7299 | 7107 |
| 7300 | 5823 |
| 7301 | 7620 |
| 7302 | 6646 |
| 7303 | 7780 |
| 7304 | 4080 |
| 7305 | 6055 |
| 7306 | 7510 |
| 7307 | 6999 |
| 7308 | 7731 |
| 7309 | 7409 |
| 7310 | 6100 |
| 7311 | 7081 |
| 7312 | 3835 |
| 7313 | 7571 |
| 7314 | 6891 |
| 7315 | 7873 |
| 7316 | 6005 |
| 7317 | 7375 |
| 7318 | 7028 |
| 7319 | 7726 |
| 7320 | 4046 |
| 7321 | 6045 |
| 7322 | 7484 |
| 7323 | 7068 |
| 7324 | 7942 |
| 7325 | 6878 |
| 7326 | 6059 |
| 7327 | 7565 |
| 7328 | 3951 |
| 7329 | 7755 |
| 7330 | 6649 |
| 7331 | 7404 |
| 7332 | 5884 |
| 7333 | 7513 |
| 7334 | 7109 |
| 7335 | 7828 |
| 7336 | 4053 |
| 7337 | 5623 |
| 7338 | 7600 |
| 7339 | 6973 |
| 7340 | 7784 |
| 7341 | 7355 |
| 7342 | 6006 |
| 7343 | 7082 |
| 7344 | 7953 |
| 7345 | 4026 |
| 7346 | 6893 |
| 7347 | 7525 |
| 7348 | 6114 |
| 7349 | 7842 |
| 7350 | 7003 |
| 7351 | 7455 |
| 7352 | 7733 |
| 7353 | 4067 |
| 7354 | 6104 |
| 7355 | 7089 |
| 7356 | 7294 |
| 7357 | 7757 |
| 7358 | 6650 |
| 7359 | 6009 |
| 7360 | 7566 |
| 7361 | 7514 |
| 7362 | 4054 |
| 7363 | 7032 |
| 7364 | 7832 |
| 7365 | 5855 |

TABLE Q9-continued

| with a sequence length of 8192: | |
|---|---|
| Polarized channel sequence number | Reliability or reliability sequence number |
| 7366 | 6899 |
| 7367 | 7410 |
| 7368 | 7946 |
| 7369 | 7114 |
| 7370 | 3959 |
| 7371 | 5117 |
| 7372 | 7624 |
| 7373 | 7734 |
| 7374 | 7110 |
| 7375 | 6046 |
| 7376 | 7526 |
| 7377 | 7844 |
| 7378 | 6974 |
| 7379 | 4028 |
| 7380 | 7383 |
| 7381 | 6087 |
| 7382 | 7763 |
| 7383 | 7084 |
| 7384 | 7573 |
| 7385 | 7954 |
| 7386 | 6061 |
| 7387 | 6591 |
| 7388 | 3582 |
| 7389 | 7529 |
| 7390 | 7737 |
| 7391 | 6894 |
| 7392 | 6010 |
| 7393 | 7412 |
| 7394 | 7815 |
| 7395 | 7015 |
| 7396 | 3837 |
| 7397 | 7587 |
| 7398 | 6116 |
| 7399 | 7792 |
| 7400 | 7121 |
| 7401 | 7516 |
| 7402 | 7090 |
| 7403 | 7357 |
| 7404 | 5627 |
| 7405 | 4057 |
| 7406 | 7948 |
| 7407 | 6901 |
| 7408 | 7471 |
| 7409 | 7874 |
| 7410 | 6067 |
| 7411 | 7005 |
| 7412 | 7530 |
| 7413 | 7758 |
| 7414 | 4069 |
| 7415 | 7113 |
| 7416 | 5871 |
| 7417 | 7578 |
| 7418 | 7819 |
| 7419 | 6652 |
| 7420 | 7387 |
| 7421 | 6062 |
| 7422 | 7969 |
| 7423 | 7019 |
| 7424 | 3999 |
| 7425 | 7479 |
| 7426 | 7765 |
| 7427 | 5951 |
| 7428 | 6902 |
| 7429 | 7632 |
| 7430 | 7738 |
| 7431 | 7416 |
| 7432 | 7055 |
| 7433 | 2047 |
| 7434 | 6091 |
| 7435 | 7848 |
| 7436 | 7537 |
| 7437 | 7092 |
| 7438 | 8065 |
| 7439 | 6120 |
| 7440 | 7589 |

TABLE Q9-continued

| with a sequence length of 8192: | |
|---|---|
| Polarized channel sequence number | Reliability or reliability sequence number |
| 7441 | 7006 |
| 7442 | 3963 |
| 7443 | 7779 |
| 7444 | 7358 |
| 7445 | 6012 |
| 7446 | 7063 |
| 7447 | 7876 |
| 7448 | 7577 |
| 7449 | 6905 |
| 7450 | 8001 |
| 7451 | 4058 |
| 7452 | 6069 |
| 7453 | 7503 |
| 7454 | 6623 |
| 7455 | 7766 |
| 7456 | 7574 |
| 7457 | 5879 |
| 7458 | 7116 |
| 7459 | 7827 |
| 7460 | 7399 |
| 7461 | 4070 |
| 7462 | 7021 |
| 7463 | 6093 |
| 7464 | 7740 |
| 7465 | 7532 |
| 7466 | 7122 |
| 7467 | 7956 |
| 7468 | 7590 |
| 7469 | 6070 |
| 7470 | 4073 |
| 7471 | 7389 |
| 7472 | 7096 |
| 7473 | 7483 |
| 7474 | 7821 |
| 7475 | 5629 |
| 7476 | 6906 |
| 7477 | 7648 |
| 7478 | 7769 |
| 7479 | 7027 |
| 7480 | 4060 |
| 7481 | 7538 |
| 7482 | 6099 |
| 7483 | 7970 |
| 7484 | 7067 |
| 7485 | 7295 |
| 7486 | 7856 |
| 7487 | 7137 |
| 7488 | 5118 |
| 7489 | 7619 |
| 7490 | 4015 |
| 7491 | 7781 |
| 7492 | 7511 |
| 7493 | 6639 |
| 7494 | 5983 |
| 7495 | 7711 |
| 7496 | 7593 |
| 7497 | 7022 |
| 7498 | 7960 |
| 7499 | 7403 |
| 7500 | 3071 |
| 7501 | 6073 |
| 7502 | 6847 |
| 7503 | 7822 |
| 7504 | 7540 |
| 7505 | 7079 |
| 7506 | 7770 |
| 7507 | 6128 |
| 7508 | 7580 |
| 7509 | 7972 |
| 7510 | 3838 |
| 7511 | 7124 |
| 7512 | 7390 |
| 7513 | 7880 |
| 7514 | 5883 |
| 7515 | 7029 |

TABLE Q9-continued with a sequence length of 8192:

| Polarized channel sequence number | Reliability or reliability sequence number |
|---|---|
| 7516 | 7621 |
| 7517 | 7782 |
| 7518 | 7485 |
| 7519 | 6094 |
| 7520 | 3965 |
| 7521 | 7069 |
| 7522 | 7943 |
| 7523 | 7594 |
| 7524 | 7083 |
| 7525 | 7829 |
| 7526 | 5999 |
| 7527 | 7405 |
| 7528 | 6908 |
| 7529 | 7785 |
| 7530 | 4074 |
| 7531 | 7843 |
| 7532 | 7515 |
| 7533 | 6101 |
| 7534 | 6647 |
| 7535 | 8002 |
| 7536 | 7601 |
| 7537 | 7030 |
| 7538 | 7772 |
| 7539 | 6074 |
| 7540 | 7544 |
| 7541 | 4023 |
| 7542 | 7727 |
| 7543 | 7138 |
| 7544 | 7411 |
| 7545 | 7947 |
| 7546 | 6115 |
| 7547 | 7128 |
| 7548 | 7626 |
| 7549 | 7786 |
| 7550 | 7622 |
| 7551 | 7033 |
| 7552 | 4081 |
| 7553 | 6102 |
| 7554 | 7834 |
| 7555 | 7486 |
| 7556 | 6879 |
| 7557 | 7976 |
| 7558 | 7596 |
| 7559 | 6007 |
| 7560 | 7735 |
| 7561 | 7070 |
| 7562 | 4047 |
| 7563 | 7406 |
| 7564 | 7888 |
| 7565 | 7111 |
| 7566 | 7527 |
| 7567 | 6076 |
| 7568 | 8066 |
| 7569 | 7793 |
| 7570 | 7085 |
| 7571 | 7633 |
| 7572 | 7845 |
| 7573 | 4076 |
| 7574 | 5630 |
| 7575 | 7034 |
| 7576 | 7602 |
| 7577 | 8004 |
| 7578 | 7413 |
| 7579 | 7140 |
| 7580 | 5885 |
| 7581 | 7833 |
| 7582 | 7517 |
| 7583 | 7759 |
| 7584 | 3583 |
| 7585 | 6651 |
| 7586 | 7625 |
| 7587 | 7955 |
| 7588 | 6105 |
| 7589 | 7091 |
| 7590 | 7830 |

TABLE Q9-continued with a sequence length of 8192:

| Polarized channel sequence number | Reliability or reliability sequence number |
|---|---|
| 7591 | 7531 |
| 7592 | 7788 |
| 7593 | 6895 |
| 7594 | 6117 |
| 7595 | 4027 |
| 7596 | 7414 |
| 7597 | 7949 |
| 7598 | 7567 |
| 7599 | 7086 |
| 7600 | 7846 |
| 7601 | 7604 |
| 7602 | 6047 |
| 7603 | 7739 |
| 7604 | 6975 |
| 7605 | 7518 |
| 7606 | 7984 |
| 7607 | 3966 |
| 7608 | 7115 |
| 7609 | 6011 |
| 7610 | 7904 |
| 7611 | 7575 |
| 7612 | 7794 |
| 7613 | 7144 |
| 7614 | 7417 |
| 7615 | 7950 |
| 7616 | 6106 |
| 7617 | 7628 |
| 7618 | 4082 |
| 7619 | 7036 |
| 7620 | 7875 |
| 7621 | 8008 |
| 7622 | 7533 |
| 7623 | 7093 |
| 7624 | 6118 |
| 7625 | 7767 |
| 7626 | 7634 |
| 7627 | 7849 |
| 7628 | 6903 |
| 7629 | 7608 |
| 7630 | 4055 |
| 7631 | 8068 |
| 7632 | 6121 |
| 7633 | 7418 |
| 7634 | 7117 |
| 7635 | 7796 |
| 7636 | 7836 |
| 7637 | 7539 |
| 7638 | 6108 |
| 7639 | 7094 |
| 7640 | 7957 |
| 7641 | 7579 |
| 7642 | 4084 |
| 7643 | 7877 |
| 7644 | 6653 |
| 7645 | 7971 |
| 7646 | 6063 |
| 7647 | 7649 |
| 7648 | 7741 |
| 7649 | 7123 |
| 7650 | 7534 |
| 7651 | 7850 |
| 7652 | 7359 |
| 7653 | 7007 |
| 7654 | 4029 |
| 7655 | 5119 |
| 7656 | 7962 |
| 7657 | 7771 |
| 7658 | 7591 |
| 7659 | 7097 |
| 7660 | 7857 |
| 7661 | 7636 |
| 7662 | 5886 |
| 7663 | 8016 |
| 7664 | 7152 |
| 7665 | 7800 |

TABLE Q9-continued with a sequence length of 8192:

| Polarized channel sequence number | Reliability or reliability sequence number |
|---|---|
| 7666 | 7541 |
| 7667 | 3839 |
| 7668 | 7973 |
| 7669 | 6907 |
| 7670 | 6013 |
| 7671 | 7581 |
| 7672 | 7882 |
| 7673 | 7595 |
| 7674 | 7118 |
| 7675 | 7878 |
| 7676 | 8072 |
| 7677 | 6122 |
| 7678 | 7420 |
| 7679 | 7023 |
| 7680 | 4059 |
| 7681 | 7742 |
| 7682 | 7542 |
| 7683 | 7961 |
| 7684 | 7852 |
| 7685 | 7125 |
| 7686 | 6071 |
| 7687 | 7650 |
| 7688 | 7958 |
| 7689 | 7640 |
| 7690 | 7098 |
| 7691 | 7783 |
| 7692 | 4088 |
| 7693 | 7889 |
| 7694 | 6129 |
| 7695 | 7545 |
| 7696 | 7139 |
| 7697 | 7974 |
| 7698 | 7858 |
| 7699 | 7391 |
| 7700 | 7126 |
| 7701 | 8032 |
| 7702 | 6095 |
| 7703 | 7582 |
| 7704 | 7773 |
| 7705 | 7881 |
| 7706 | 4030 |
| 7707 | 7031 |
| 7708 | 7623 |
| 7709 | 8080 |
| 7710 | 7597 |
| 7711 | 6124 |
| 7712 | 7100 |
| 7713 | 7787 |
| 7714 | 8003 |
| 7715 | 7546 |
| 7716 | 7823 |
| 7717 | 6654 |
| 7718 | 7977 |
| 7719 | 4071 |
| 7720 | 5631 |
| 7721 | 7652 |
| 7722 | 7860 |
| 7723 | 6909 |
| 7724 | 7603 |
| 7725 | 7774 |
| 7726 | 7964 |
| 7727 | 7407 |
| 7728 | 6075 |
| 7729 | 7129 |
| 7730 | 7831 |
| 7731 | 8005 |
| 7732 | 7598 |
| 7733 | 4061 |
| 7734 | 7884 |
| 7735 | 7141 |
| 7736 | 7487 |
| 7737 | 6014 |
| 7738 | 8096 |
| 7739 | 7789 |
| 7740 | 7071 |

TABLE Q9-continued with a sequence length of 8192:

| Polarized channel sequence number | Reliability or reliability sequence number |
|---|---|
| 7741 | 7627 |
| 7742 | 7978 |
| 7743 | 7890 |
| 7744 | 7656 |
| 7745 | 6130 |
| 7746 | 7035 |
| 7747 | 3967 |
| 7748 | 7864 |
| 7749 | 7985 |
| 7750 | 7548 |
| 7751 | 7795 |
| 7752 | 7130 |
| 7753 | 7605 |
| 7754 | 6103 |
| 7755 | 8010 |
| 7756 | 7835 |
| 7757 | 7415 |
| 7758 | 7142 |
| 7759 | 8006 |
| 7760 | 7905 |
| 7761 | 7629 |
| 7762 | 4075 |
| 7763 | 8067 |
| 7764 | 6132 |
| 7765 | 7145 |
| 7766 | 7790 |
| 7767 | 7606 |
| 7768 | 7980 |
| 7769 | 7132 |
| 7770 | 7847 |
| 7771 | 7635 |
| 7772 | 8017 |
| 7773 | 6077 |
| 7774 | 7892 |
| 7775 | 7087 |
| 7776 | 4062 |
| 7777 | 7519 |
| 7778 | 7986 |
| 7779 | 7797 |
| 7780 | 7609 |
| 7781 | 7837 |
| 7782 | 5887 |
| 7783 | 6910 |
| 7784 | 7664 |
| 7785 | 8069 |
| 7786 | 7851 |
| 7787 | 7419 |
| 7788 | 7037 |
| 7789 | 8009 |
| 7790 | 7798 |
| 7791 | 7630 |
| 7792 | 4077 |
| 7793 | 6107 |
| 7794 | 7951 |
| 7795 | 7146 |
| 7796 | 7906 |
| 7797 | 7988 |
| 7798 | 7535 |
| 7799 | 7896 |
| 7800 | 7095 |
| 7801 | 8128 |
| 7802 | 6136 |
| 7803 | 7637 |
| 7804 | 7801 |
| 7805 | 7959 |
| 7806 | 7610 |
| 7807 | 7153 |
| 7808 | 4083 |
| 7809 | 7838 |
| 7810 | 8012 |
| 7811 | 7651 |
| 7812 | 6078 |
| 7813 | 7879 |
| 7814 | 7119 |
| 7815 | 8073 |

TABLE Q9-continued

| with a sequence length of 8192: | |
|---|---|
| Polarized channel sequence number | Reliability or reliability sequence number |
| 7816 | 7638 |
| 7817 | 7853 |
| 7818 | 7802 |
| 7819 | 7148 |
| 7820 | 7543 |
| 7821 | 7908 |
| 7822 | 6119 |
| 7823 | 8018 |
| 7824 | 4078 |
| 7825 | 7612 |
| 7826 | 7859 |
| 7827 | 6655 |
| 7828 | 7992 |
| 7829 | 7854 |
| 7830 | 7421 |
| 7831 | 7963 |
| 7832 | 7743 |
| 7833 | 6109 |
| 7834 | 7099 |
| 7835 | 7641 |
| 7836 | 8070 |
| 7837 | 7883 |
| 7838 | 7653 |
| 7839 | 8033 |
| 7840 | 7038 |
| 7841 | 4085 |
| 7842 | 7912 |
| 7843 | 7975 |
| 7844 | 6015 |
| 7845 | 7583 |
| 7846 | 7804 |
| 7847 | 7154 |
| 7848 | 8081 |
| 7849 | 7547 |
| 7850 | 8020 |
| 7851 | 7861 |
| 7852 | 7642 |
| 7853 | 7127 |
| 7854 | 6123 |
| 7855 | 7965 |
| 7856 | 7885 |
| 7857 | 8074 |
| 7858 | 4086 |
| 7859 | 7654 |
| 7860 | 7862 |
| 7861 | 7156 |
| 7862 | 7979 |
| 7863 | 7657 |
| 7864 | 7891 |
| 7865 | 8034 |
| 7866 | 6110 |
| 7867 | 7775 |
| 7868 | 7644 |
| 7869 | 7101 |
| 7870 | 8082 |
| 7871 | 7865 |
| 7872 | 7599 |
| 7873 | 8024 |
| 7874 | 7920 |
| 7875 | 6911 |
| 7876 | 4089 |
| 7877 | 7966 |
| 7878 | 6125 |
| 7879 | 7422 |
| 7880 | 7886 |
| 7881 | 8076 |
| 7882 | 8007 |
| 7883 | 7131 |
| 7884 | 7549 |
| 7885 | 7791 |
| 7886 | 7981 |
| 7887 | 7893 |
| 7888 | 7658 |
| 7889 | 6131 |
| 7890 | 8097 |

TABLE Q9-continued

| with a sequence length of 8192: | |
|---|---|
| Polarized channel sequence number | Reliability or reliability sequence number |
| 7891 | 7160 |
| 7892 | 7866 |
| 7893 | 7607 |
| 7894 | 8036 |
| 7895 | 4090 |
| 7896 | 7907 |
| 7897 | 7987 |
| 7898 | 7665 |
| 7899 | 7102 |
| 7900 | 8129 |
| 7901 | 7894 |
| 7902 | 6126 |
| 7903 | 7982 |
| 7904 | 7631 |
| 7905 | 7799 |
| 7906 | 7143 |
| 7907 | 8011 |
| 7908 | 7868 |
| 7909 | 7660 |
| 7910 | 8084 |
| 7911 | 8040 |
| 7912 | 7897 |
| 7913 | 7611 |
| 7914 | 6133 |
| 7915 | 4031 |
| 7916 | 7133 |
| 7917 | 8098 |
| 7918 | 7909 |
| 7919 | 7989 |
| 7920 | 7550 |
| 7921 | 8013 |
| 7922 | 7839 |
| 7923 | 7039 |
| 7924 | 8088 |
| 7925 | 7666 |
| 7926 | 7803 |
| 7927 | 7990 |
| 7928 | 6134 |
| 7929 | 7898 |
| 7930 | 8100 |
| 7931 | 7147 |
| 7932 | 7639 |
| 7933 | 8019 |
| 7934 | 7910 |
| 7935 | 7993 |
| 7936 | 4092 |
| 7937 | 7668 |
| 7938 | 8071 |
| 7939 | 7913 |
| 7940 | 7134 |
| 7941 | 8048 |
| 7942 | 6137 |
| 7943 | 7613 |
| 7944 | 7900 |
| 7945 | 8130 |
| 7946 | 8014 |
| 7947 | 7855 |
| 7948 | 7423 |
| 7949 | 7149 |
| 7950 | 8075 |
| 7951 | 7805 |
| 7952 | 8021 |
| 7953 | 7643 |
| 7954 | 7994 |
| 7955 | 6138 |
| 7956 | 7914 |
| 7957 | 4063 |
| 7958 | 8104 |
| 7959 | 7155 |
| 7960 | 8035 |
| 7961 | 7672 |
| 7962 | 7863 |
| 7963 | 8132 |
| 7964 | 8022 |
| 7965 | 7921 |

TABLE Q9-continued

| with a sequence length of 8192: | |
|---|---|
| Polarized channel sequence number | Reliability or reliability sequence number |
| 7966 | 7614 |
| 7967 | 7150 |
| 7968 | 8083 |
| 7969 | 7887 |
| 7970 | 7996 |
| 7971 | 6079 |
| 7972 | 8077 |
| 7973 | 7655 |
| 7974 | 7916 |
| 7975 | 8025 |
| 7976 | 8112 |
| 7977 | 7157 |
| 7978 | 7645 |
| 7979 | 7867 |
| 7980 | 8037 |
| 7981 | 4079 |
| 7982 | 7967 |
| 7983 | 7806 |
| 7984 | 8078 |
| 7985 | 7551 |
| 7986 | 8026 |
| 7987 | 6140 |
| 7988 | 7158 |
| 7989 | 7922 |
| 7990 | 8136 |
| 7991 | 8038 |
| 7992 | 7659 |
| 7993 | 7895 |
| 7994 | 8085 |
| 7995 | 8041 |
| 7996 | 7924 |
| 7997 | 7161 |
| 7998 | 7646 |
| 7999 | 8099 |
| 8000 | 8028 |
| 8001 | 7869 |
| 8002 | 7983 |
| 8003 | 6111 |
| 8004 | 8042 |
| 8005 | 7661 |
| 8006 | 4087 |
| 8007 | 8090 |
| 8008 | 7899 |
| 8009 | 7162 |
| 8010 | 7991 |
| 8011 | 8144 |
| 8012 | 7928 |
| 8013 | 7667 |
| 8014 | 8049 |
| 8015 | 8101 |
| 8016 | 7870 |
| 8017 | 8089 |
| 8018 | 7662 |
| 8019 | 7103 |
| 8020 | 8015 |
| 8021 | 6127 |
| 8022 | 8086 |
| 8023 | 7911 |
| 8024 | 8044 |
| 8025 | 8102 |
| 8026 | 7901 |
| 8027 | 7669 |
| 8028 | 7995 |
| 8029 | 8160 |
| 8030 | 8050 |
| 8031 | 7164 |
| 8032 | 7807 |
| 8033 | 4091 |
| 8034 | 8131 |
| 8035 | 7670 |
| 8036 | 8023 |
| 8037 | 8105 |
| 8038 | 7915 |
| 8039 | 8052 |
| 8040 | 6135 |

TABLE Q9-continued

| with a sequence length of 8192: | |
|---|---|
| Polarized channel sequence number | Reliability or reliability sequence number |
| 8041 | 8092 |
| 8042 | 7902 |
| 8043 | 7673 |
| 8044 | 7135 |
| 8045 | 8133 |
| 8046 | 7997 |
| 8047 | 8106 |
| 8048 | 7917 |
| 8049 | 8027 |
| 8050 | 8113 |
| 8051 | 7674 |
| 8052 | 8056 |
| 8053 | 7923 |
| 8054 | 8138 |
| 8055 | 8134 |
| 8056 | 7998 |
| 8057 | 7151 |
| 8058 | 8108 |
| 8059 | 7615 |
| 8060 | 7918 |
| 8061 | 6139 |
| 8062 | 8039 |
| 8063 | 8145 |
| 8064 | 4093 |
| 8065 | 8114 |
| 8066 | 7925 |
| 8067 | 8029 |
| 8068 | 8137 |
| 8069 | 7676 |
| 8070 | 8043 |
| 8071 | 7926 |
| 8072 | 7159 |
| 8073 | 8079 |
| 8074 | 8116 |
| 8075 | 8030 |
| 8076 | 8087 |
| 8077 | 7929 |
| 8078 | 7647 |
| 8079 | 8140 |
| 8080 | 8045 |
| 8081 | 8146 |
| 8082 | 8120 |
| 8083 | 7930 |
| 8084 | 6141 |
| 8085 | 8051 |
| 8086 | 8091 |
| 8087 | 8161 |
| 8088 | 7163 |
| 8089 | 7663 |
| 8090 | 8046 |
| 8091 | 7871 |
| 8092 | 8103 |
| 8093 | 8148 |
| 8094 | 8053 |
| 8095 | 8093 |
| 8096 | 8107 |
| 8097 | 7932 |
| 8098 | 4094 |
| 8099 | 7671 |
| 8100 | 8054 |
| 8101 | 8162 |
| 8102 | 8152 |
| 8103 | 8057 |
| 8104 | 7903 |
| 8105 | 7165 |
| 8106 | 8094 |
| 8107 | 8135 |
| 8108 | 8109 |
| 8109 | 8058 |
| 8110 | 8164 |
| 8111 | 6142 |
| 8112 | 7675 |
| 8113 | 8115 |
| 8114 | 7919 |
| 8115 | 8110 |

TABLE Q9-continued

| with a sequence length of 8192: | |
|---|---|
| Polarized channel sequence number | Reliability or reliability sequence number |
| 8116 | 7999 |
| 8117 | 8139 |
| 8118 | 8168 |
| 8119 | 8060 |
| 8120 | 8117 |
| 8121 | 7927 |
| 8122 | 8141 |
| 8123 | 8118 |
| 8124 | 7677 |
| 8125 | 8147 |
| 8126 | 7166 |
| 8127 | 8031 |
| 8128 | 8121 |
| 8129 | 8176 |
| 8130 | 7931 |
| 8131 | 8142 |
| 8132 | 8047 |
| 8133 | 8149 |
| 8134 | 8122 |
| 8135 | 8163 |
| 8136 | 8150 |
| 8137 | 8055 |
| 8138 | 4095 |
| 8139 | 8124 |
| 8140 | 7678 |
| 8141 | 7933 |
| 8142 | 8153 |
| 8143 | 8165 |
| 8144 | 8095 |
| 8145 | 6143 |
| 8146 | 8059 |
| 8147 | 8154 |
| 8148 | 8166 |
| 8149 | 8169 |
| 8150 | 8156 |
| 8151 | 8111 |
| 8152 | 7167 |
| 8153 | 7934 |
| 8154 | 8061 |
| 8155 | 8170 |
| 8156 | 8119 |
| 8157 | 8177 |
| 8158 | 8143 |
| 8159 | 8172 |
| 8160 | 7679 |
| 8161 | 8123 |
| 8162 | 8062 |
| 8163 | 8178 |
| 8164 | 8151 |
| 8165 | 8180 |
| 8166 | 8125 |
| 8167 | 7935 |
| 8168 | 8155 |
| 8169 | 8184 |
| 8170 | 8126 |
| 8171 | 8167 |
| 8172 | 8157 |
| 8173 | 8063 |
| 8174 | 8171 |
| 8175 | 8158 |
| 8176 | 8173 |
| 8177 | 8179 |
| 8178 | 8174 |
| 8179 | 8181 |
| 8180 | 8182 |
| 8181 | 8185 |
| 8182 | 8186 |
| 8183 | 8127 |
| 8184 | 8188 |
| 8185 | 8159 |
| 8186 | 8175 |
| 8187 | 8183 |
| 8188 | 8187 |
| 8189 | 8189 |
| 8190 | 8190 |

TABLE Q9-continued

| with a sequence length of 8192: | |
|---|---|
| Polarized channel sequence number | Reliability or reliability sequence number |
| 8191 | 8191 |

Sequence Q10, with a sequence length of 4096:
[0, 1, 2, 4, 8, 16, 32, 128, 256, 512, 1024, 2048, 3, 5, 64, 9, 6, 17, 10, 18, 12, 33, 129, 65, 20, 34, 24, 257, 36, 7, 66, 11, 40, 130, 513, 68, 19, 13, 48, 14, 1025, 72, 258, 132, 21, 35, 2049, 26, 8 0, 37, 136, 25, 22, 514, 260, 38, 96, 144, 67, 41, 28, 69, 160, 264, 42, 49, 1026, 74, 516, 70, 131, 44, 272, 81, 50, 133, 73, 15, 52, 2050, 288, 520, 192, 23, 76, 137, 1028, 82, 56, 384, 27, 134, 97, 528, 3 9, 259, 145, 84, 29, 138, 43, 261, 1032, 544, 98, 2052, 146, 88, 30, 320, 140, 71, 45, 640, 161, 265, 100, 51, 1040, 193, 46, 262, 768, 75, 148, 104, 273, 162, 2056, 53, 77, 515, 152, 1056, 266, 54, 16 4, 83, 274, 517, 57, 135, 112, 268, 194, 1152, 78, 576, 2064, 139, 289, 85, 58, 168, 385, 521, 99, 1 280, 196, 321, 86, 147, 518, 60, 276, 141, 2080, 89, 290, 1536, 176, 529, 101, 31, 280, 142, 90, 52 2, 292, 1027, 200, 102, 263, 2176, 530, 149, 105, 163, 322, 92, 1029, 524, 47, 267, 106, 154, 545, 296, 55, 2304, 208, 1088, 386, 641, 113, 165, 324, 153, 79, 1033, 577, 275, 150, 108, 2560, 532, 269, 166, 59, 1030, 304, 546, 224, 114, 270, 195, 536, 1041, 328, 3072, 87, 169, 388, 769, 116, 1 56, 1034, 277, 548, 197, 291, 61, 2051, 170, 519, 1042, 282, 91, 177, 578, 336, 120, 293, 1036, 2 02, 523, 2053, 198, 392, 62, 552, 1057, 281, 172, 278, 642, 103, 209, 2112, 294, 1153, 580, 178, 352, 93, 531, 201, 1089, 400, 107, 2057, 525, 323, 143, 1044, 297, 560, 180, 94, 284, 526, 1058, 2054, 151, 325, 204, 584, 416, 109, 1048, 770, 298, 210, 2065, 184, 644, 1281, 305, 115, 330, 53 3, 155, 1060, 326, 2058, 547, 225, 387, 110, 538, 1031, 300, 167, 592, 337, 2066, 212, 1090, 306, 549, 117, 157, 648, 1035, 389, 2060, 171, 329, 537, 118, 1064, 271, 534, 226, 308, 2081, 1154, 772, 216, 448, 550, 121, 1537, 279, 158, 2177, 608, 332, 199, 1092, 656, 393, 173, 579, 1043, 21 13, 122, 228, 553, 338, 1037, 179, 540, 312, 2068, 174, 581, 1072, 283, 63, 390, 672, 1038, 203, 2082, 353, 776, 232, 1096, 295, 554, 124, 401, 2072, 1282, 561, 340, 586, 181, 285, 1156, 2305, 582, 205, 394, 643, 1045, 182, 299, 556, 2084, 211, 1059, 354, 784, 95, 1050, 402, 593, 2055, 18 5, 344, 1104, 562, 240, 286, 645, 2114, 1061, 206, 585, 396, 327, 1160, 527, 2059, 111, 301, 104 9, 564, 213, 800, 417, 2088, 1046, 186, 704, 356, 227, 1538, 535, 2178, 307, 588, 1284, 449, 214, 649, 302, 2561, 1062, 119, 594, 331, 1120, 568, 188, 2116, 404, 896, 1168, 360, 217, 539, 1091, 2067, 418, 646, 229, 1065, 309, 609, 2061, 333, 551, 1052, 159, 408, 771, 1093, 2096, 123, 657, 310, 1184, 218, 596, 2062, 420, 1288, 541, 339, 650, 1066, 3073, 230, 313, 555, 1073, 391, 773, 233, 2120, 1098, 368, 610, 220, 1540, 658, 2306, 450, 334, 1094, 600, 175, 542, 2180, 1155, 39 5, 832, 125, 1068, 2069, 341, 652, 314, 1296, 583, 234, 2083, 557, 1105, 424, 673, 355, 1074, 20 74, 183, 777, 452, 1157, 612, 342, 2128, 563, 1097, 241, 403, 705, 2085, 1039, 207, 558, 1076, 3 16, 774, 2184, 397, 1312, 587, 236, 345, 2073, 1544, 660, 432, 1216, 616, 187, 2070, 785, 1047, 357, 674, 287, 2562, 1100, 565, 126, 1161, 589, 2308, 398, 346, 1106, 664, 242, 1080, 2086, 77 8, 456, 566, 1408, 358, 2144, 676, 1051, 215, 595, 405, 2192, 1158, 786, 361, 1121, 569, 2115, 2 44, 647, 1552, 419, 624, 2089, 1063, 348, 189, 780, 1283, 2076, 303, 706, 1169, 362, 590, 2117, 410, 1108, 651, 219, 1053, 2208, 801, 311, 1162, 597, 2312, 464, 570, 1067, 248, 680, 2090, 12 85, 369, 897, 1568, 421, 2097, 611, 1122, 190, 708, 3074, 409, 1170, 833, 335, 1112, 2122, 598, 406, 1054, 659, 231, 2564, 1344, 572, 364, 1164, 2118, 788, 422, 221, 1095, 315, 2179, 653, 10 69, 480, 601, 2092, 1664, 370, 802, 1185, 2320, 127, 688, 1289, 451, 613, 2129, 1124, 343, 543, 1075, 2098, 425, 792, 1217, 235, 2181, 654, 372, 1070, 602, 412, 2121, 1286, 804, 222, 1792, 2 063, 712, 453, 1099, 614, 2100, 317, 1172, 775, 426, 2336, 1128, 661, 237, 1297, 2568, 617, 67 5, 1186, 347, 1077, 2240, 834, 433, 1101, 604, 2071, 376, 1539, 559, 243, 2124, 1176, 779, 458, 1290, 2185, 618, 454, 1078, 666, 3076, 318, 1188, 808, 428, 2130, 1107, 567, 238, 2104, 1298, 720, 1541, 359, 2432, 898, 1081, 625, 465, 2075, 1159, 677, 434, 1136, 2182, 836, 245, 1292, 6 65, 2145, 349, 1218, 591, 1102, 2576, 457, 787, 1600, 2087, 662, 363, 1163, 620, 2307, 246, 13 13, 781, 1109, 2193, 399, 678, 1082, 2132, 436, 571, 1192, 350, 2077, 1409, 816, 736, 1545, 21 86, 407, 626, 1123, 2091, 249, 1220, 782, 460, 2309, 1345, 707, 840, 3080, 1110, 365, 1171, 599, 2592, 466, 1542, 681, 2146, 440, 1084, 900, 1300, 2194, 250, 628, 1165, 2136, 668, 371, 1113, 789, 2078, 1314, 411, 709, 2368, 1200, 803, 1553, 481, 2188, 573, 1125, 366, 2119, 682, 1055, 191, 2093, 1304, 794, 603, 1166, 2688, 423, 1114, 689, 2209, 468, 1546, 848, 2313, 1316, 632, 373, 1224, 2148, 805, 1126, 413, 2099, 714, 1287, 427, 3088, 1554, 710, 904, 2241, 1173, 252, 1129, 2094, 574, 374, 1187, 793, 2310, 1346, 684, 482, 2816, 1116, 790, 1548, 2123, 472, 1071, 615, 2196, 721, 1291, 377, 2152, 1130, 806, 690, 2321, 1178, 223, 1569, 2210, 864, 414, 1320, 2101, 605, 1079, 713, 2125, 1232, 455, 912, 2563, 1410, 429, 1665, 2200, 619, 835, 1137, 3104, 378, 1189, 655, 2314, 1348, 809, 484, 2102, 1177, 692, 1103, 2212, 435, 1601, 606, 2131, 796, 1299, 239, 2322, 1174, 663, 1132, 2565, 837, 430, 1556, 2105, 716, 1293, 319, 2183, 1190, 928, 1083, 2160, 621, 459, 1328, 2316, 810, 1570, 722, 2242, 1248, 488, 3200, 696, 1138, 817, 212 6, 1294, 380, 1219, 2624, 627, 1560, 437, 2187, 842, 1352, 667, 2337, 1111, 247, 2133, 1193, 83 8, 1412, 2106, 737, 461, 1793, 2216, 899, 1140, 2433, 622, 1180, 438, 2569, 1301, 812, 679, 21 47, 1572, 467, 1221, 3328, 849, 1315, 2244, 724, 1085, 351, 2369, 1194, 818, 1543, 2134, 629, 441, 2195, 1306, 669, 1115, 2566, 496, 1201, 2108, 901, 1602, 683, 2324, 1360, 251, 1144, 218 9, 841, 630, 2137, 1317, 462, 1226, 2338, 783, 1547, 3584, 738, 1222, 820, 2224, 1416, 367, 25 77, 1086, 728, 1576, 2149, 960, 469, 2079, 1305, 633, 1196, 2328, 791, 1302, 2190, 442, 1666, 670, 2138, 1127, 844, 2570, 1233, 483, 1318, 2340, 711, 1604, 3075, 905, 1202, 470, 2248, 137 6, 685, 2150, 1117, 634, 375, 2311, 1555, 740, 2578, 1225, 850, 2197, 1424, 444, 1131, 2153, 69 1, 1549, 2211, 824, 1347, 686, 2370, 1167, 253, 2140, 1321, 795, 3077, 1584, 575, 1204, 2572, 473, 1118, 2095, 902, 1308, 2315, 715, 1550, 485, 2154, 1175, 865, 2202, 1349, 744, 2593, 122 8, 807, 2344, 1608, 415, 1440, 2103, 636, 1133, 2256, 913, 1794, 3136, 379, 1322, 852, 2434, 1 234, 693, 2689, 1208, 474, 2161, 1668, 797, 2213, 1329, 717, 2372, 1139, 906, 1354, 2201, 486, 1557, 2127, 694, 1179, 3081, 811, 1350, 2625, 489, 1571, 2323, 723, 1249, 866, 2198, 607, 47 6, 2156, 1411, 914, 2580, 1134, 697, 2317, 1562, 431, 2214, 1324, 856, 2107, 1191, 752, 1616, 3078, 798, 1361, 2352, 254, 1236, 2594, 718, 1330, 2272, 908, 1573, 2162, 839, 1141, 2318, 38 1, 1181, 2243, 623, 1672, 2584, 813, 1413, 3089, 725, 1195, 2376, 490, 1353, 2135, 929, 1561, 698, 2217, 1142, 439, 2436, 1295, 868, 2817, 1558, 739, 2164, 1250, 819, 2204, 1332, 497, 308 2, 1796, 961, 2325, 1240, 726, 2596, 1472, 814, 2245, 1574, 463, 2339, 1145, 631, 2109, 1303, 843, 2218, 1182, 700, 2567, 1632, 492, 3090, 1356, 1223, 2330, 916, 2139, 1680, 872, 2225, 14 17, 729, 2626, 1197, 443, 2384, 1603, 930, 2168, 1146, 741, 2341, 1252, 821, 3084, 1577, 382, 2250, 1362, 845, 2571, 1203, 671, 2246, 1564, 920, 2440, 1336, 498, 2110, 1198, 2600, 1605, 6 35, 3105, 1307, 822, 2329, 1087, 730, 2220, 1414, 932, 2326, 1696, 471, 2690, 1227, 851, 2151, 1377, 2257, 742, 1800, 2342, 1256, 825, 3201, 1319, 500, 2628, 1578, 903, 2226, 1148, 745, 2 400, 1425, 2141, 880, 1585, 2579, 445, 1364, 2249, 1610, 732, 3137, 1205, 962, 2448, 1309, 21 55, 846, 1606, 2573, 687, 1229, 2371, 255, 1418, 2191, 1667, 3092, 907, 1206, 2345, 637, 1323, 2608, 853, 1580, 2228, 475, 2142, 1235, 826, 2332, 1378, 1808, 2574, 746, 1119, 3106, 936, 2 199, 1426, 867, 2373, 1617, 504, 2252, 1209, 2632, 1368, 695, 2464, 1586, 964, 2157, 1264, 30 96, 854, 1310, 2818, 753, 1669, 2346, 1230, 2258, 446, 1609, 2232, 915, 1420, 2692, 719, 3329, 1351, 1551, 2353, 828, 1135, 2163, 909, 2378, 1325, 487, 2581, 1588, 748, 2203, 1237, 3108, 1824, 857, 2374, 1441, 944, 2595, 1210, 2273, 477, 1728, 2435, 1380, 2158, 699, 1251, 2586, 8 69, 1559, 3079, 799, 2348, 1331, 1612, 2215, 638, 2640, 1473, 910, 2385, 1238, 1673, 2260, 38 3, 3138, 1326, 858, 2354, 1143, 2597, 754, 1618, 2165, 1355, 968, 2205, 1592, 2696, 870, 1212, 3083, 491, 2437, 1428, 1920, 2219, 727, 2377, 1384, 917, 2585, 1241, 2166, 1563, 873, 3112, 1442, 2319, 756, 1670, 2582, 1253, 2274, 478, 1333, 2356, 931, 3202, 1633, 860, 2820, 1357, 2 264, 1575, 701, 2496, 1183, 2598, 815, 1432, 2169, 1795, 3585, 874, 1147, 2327, 493, 2206, 16 81, 1334, 2656, 922, 2380, 1242, 731, 2247, 1620, 3140, 1444, 823, 2704, 1565, 2441, 976, 136 3, 2221, 1674, 2627, 760, 1254, 3091, 499, 2170, 1337, 2276, 1579, 881, 2601, 1415, 2386, 933, 1797, 3085, 1257, 2227, 702, 1392, 2588, 1634, 2360, 921, 2222, 1244, 494, 2629, 1682, 3120, 1474, 847, 2331, 1358, 2111, 918, 2438, 1624, 1199, 2720, 743, 3086, 1566, 876, 2251, 1419, 2401, 1856, 2824, 934, 1149, 2280, 1365, 3144, 733, 1676, 2343, 501, 2602, 1338, 2172, 1607, 827, 2449, 1258, 3330, 1581, 2609, 992, 1448, 2388, 882, 2634, 1697, 2229, 1379, 639, 2333, 1 207, 3204, 1801, 2630, 963, 1476, 2253, 502, 2442, 1636, 2691, 1366, 855, 3093, 1587, 2230, 1 265, 2347, 937, 1427, 2604, 747, 2259, 1729, 3107, 1231, 884, 2402, 1582, 2832, 1340, 2143, 9 24, 3098, 1798, 734, 2450, 1421, 2641, 1611, 2233, 505, 1260, 2392, 1369, 3152, 965, 2610, 16 84, 2288, 1456, 829, 2334, 1640, 2693, 1211, 3109, 938, 1809, 2254, 749, 2633, 1381, 2444, 16 98, 2375, 859, 1311, 3208, 1589, 2575, 945, 2159, 1150, 2349, 1613, 506, 3097, 1422, 2612, 13 70, 2261, 888, 2848, 1688, 755, 2465, 1266, 3094, 1802, 2234, 970, 2752, 1480, 2404, 1590, 96 6, 2275, 1382, 3586, 1700, 2583, 830, 2355, 1239, 1619, 2636, 940, 3332, 1429, 2497, 1810, 22 62, 447, 2697, 1385, 1593, 2350, 750, 3110, 1268, 2167, 1671, 2642, 871, 2379, 1443, 3168, 16 48, 977, 2616, 1372, 2236, 946, 2452, 1213, 2944, 1804, 3216, 757, 2408, 1327, 1730, 2265, 86 1, 2587, 1386, 3139, 1614, 2466, 969, 2694, 1434, 2277, 1675, 508, 3113, 1243, 2357, 1825, 26 57, 875, 2381, 1335, 2599, 1621, 3100, 758, 2207, 1488, 1594, 2456, 1272, 2819, 911, 3141, 17 04, 2171, 1393, 2705, 948, 2358, 1921, 3232, 1445, 2266, 862, 1635, 2644, 1214, 2468, 919, 33 36, 1732, 2589, 1433, 2387, 761, 2698, 1857, 3114, 1359, 2278, 479, 2361, 1622, 2603, 1430, 9 72, 3121, 1683, 2439, 1255, 2821, 877, 2281, 1596, 3146, 1596, 3146, 388, 2416, 978, 2658, 1812, 2268, 1 446, 3588, 1245, 2706, 952, 2498, 1339, 2382, 1677, 762, 3142, 1504, 2648, 1625, 2223, 883, 2 590, 1394, 3203, 1826, 2443, 923, 2880, 1151, 2173, 1712, 3116, 993, 2389, 1475, 2700, 1637, 2362, 1367, 3344, 495, 2631, 1567, 2282, 1449, 2605, 878, 3153, 1816, 2472, 1259, 2721, 703, 2403, 1678, 3122, 1396, 2231, 935, 2825, 1626, 2500, 1436, 3205, 1828, 2660, 980, 2390, 124 6, 2611, 1736, 3145, 885, 2289, 1477, 2451, 1638, 2753, 1341, 3087, 925, 2255, 1799, 2606, 14 50, 3124, 939, 2364, 1685, 2822, 1261, 2445, 764, 3360, 1641, 2635, 1699, 2284, 1371, 2393, 5 03, 3592, 1858, 2708, 1457, 2480, 886, 3264, 1628, 2664, 1400, 2235, 1583, 2833, 994, 3095, 1 267, 2405, 1803, 2722, 984, 2335, 1482, 3148, 1642, 2613, 1478, 2174, 889, 3209, 1690, 2637, 1342, 2446, 735, 2394, 1832, 3154, 1452, 2712, 1591, 2290, 926, 1262, 1744, 3128, 967, 2826, 1383, 2504, 1922, 2614, 1649, 3456, 941, 2406, 1489, 2724, 1701, 3099, 890, 2263, 1458, 264 3, 1860, 2453, 1269, 3206, 996, 2834, 1689, 2409, 1373, 3169, 1615, 2617, 507, 2292, 1481, 26 95, 1811, 3600, 947, 2467, 1686, 2672, 1387, 3111, 1644, 2396, 751, 2237, 1270, 2828, 1805, 3 331, 1423, 2351, 942, 2754, 1702, 3217, 1460, 2410, 1595, 2638, 831, 2458, 1374, 3156, 1840, 2699, 971, 2267, 1760, 3101, 1431, 2849, 1650, 2359, 1000, 3210, 1273, 2645, 1806, 2512, 14 84, 2618, 892, 3115, 1731, 2296, 1864, 2728, 1389, 3333, 949, 2417, 1623, 2945, 1490, 3616, 1 705, 2469, 759, 2659, 1464, 3170, 1924, 2238, 1274, 2756, 973, 2457, 1652, 3218, 1692, 2881, 1395, 2383, 950, 3160, 1813, 2646, 1435, 2454, 1733, 3102, 509, 2707, 2279, 1827, 3392, 150 5, 2620, 1597, 2412, 979, 3212, 1390, 2836, 1706, 2470, 1215, 2269, 863, 3143, 1818, 2363, 16 27, 2701, 1447, 3117, 953, 2528, 1713, 2649, 3712, 1492, 2418, 1872, 2850, 1008, 3233, 1656, 2175, 1397, 2736, 1829, 3337, 763, 2499, 1437, 2661, 1738, 3172, 1451, 2391, 2591, 974, 312 3, 1734, 2473, 1928, 2840, 1276, 3265, 879, 2283, 1598, 2702, 1398, 2420, 1817, 3118, 2650, 1 708, 2460, 981, 3334, 1506, 2852, 1814, 2270, 1496, 3840, 954, 2760, 1639, 2501, 3147, 1745, 2662, 1401, 2365, 995, 3220, 1830, 2823, 1714, 2474, 1247, 3176, 2709, 982, 2285, 1888, 334 5, 1438, 2665, 1629, 2723, 1737, 3234, 887, 2395, 3125, 1479, 2882, 1936, 2481, 1453, 3149, 9 56, 2652, 1643, 2424, 1859, 3587, 2607, 1402, 2291, 1679, 3224, 510, 2827, 1833, 2506, 3338, 1508, 2666, 1716, 2502, 765, 3126, 1459, 2714, 1630, 2366, 3236, 1820, 2856, 1263, 2476, 98 5, 3155, 1687, 2615, 1861, 2286, 3346, 1454, 2768, 1740, 3589, 997, 2407, 1343, 2946, 3129, 1 952, 2673, 1645, 2513, 927, 3207, 1483, 2725, 2482, 1834, 3184, 1746, 2884, 1512, 2293, 891, 3340, 2713, 1720, 2397, 1841, 3266, 1404, 2639, 3150, 1651, 2505, 986, 2835, 1461, 3648, 18 66, 2710, 2411, 1691, 3211, 1271, 2668, 998, 2294, 3361, 1862, 2829, 1761, 3157, 1485, 2447, 1923, 2726, 3130, 1001, 2484, 1646, 2619, 1462, 3240, 2398, 1836, 3457, 988, 2864, 1703, 27 84, 3593, 1491, 2455, 1873, 2674, 1748, 3171, 2297, 943, 3268, 1375, 2830, 1842, 2508, 3393, 1653, 2755, 1465, 2888, 1693, 3158, 2413, 766, 3219, 1520, 2647, 1925, 2514, 3590, 1707, 27 29, 1275, 2488, 3132, 893, 2948, 1865, 3348, 1654, 2298, 2676, 1486, 3213, 1807, 2716, 1002, 2419, 3161, 1762, 2837, 1844, 3362, 2459, 1391, 2757, 1752, 3248, 951, 2851, 3601, 1984, 25 29, 1493, 2621, 3173, 1657, 2414, 1815, 2730, 1466, 3103, 2239, 1009, 3352, 1694, 2842, 265 1, 1868, 3214, 1507, 2471, 3162, 1735, 2737, 975, 2516, 1929, 3594, 2896, 1494, 3364, 1709, 2 680, 2421, 1658, 3272, 1004, 2853, 3174, 1399, 2461, 1764, 2762, 3335, 1874, 2475, 1468, 36 02, 2758, 1715, 2952, 511, 3221, 2300, 1848, 3177, 1710, 2622, 2422, 1277, 3235, 1819, 2841, 3394, 1599, 2732, 955, 2530, 3164, 1497, 2838, 1926, 3596, 2520, 1739, 3119, 1509, 2663, 27 69, 1889, 3339, 894, 2425, 3178, 1768, 2854, 1831, 2738, 3226, 1439, 2271, 1660, 3617, 2912, 1010, 2462, 1937, 3368, 2653, 1403, 3127, 2761, 1876, 3280, 1717, 2503, 2960, 1498, 3458, 9 83, 2477, 3713, 1821, 2667, 1741, 2883, 3185, 1930, 2426, 3237, 1510, 2703, 1718, 3396, 285 7, 1012, 2532, 1835, 3225, 2740, 1513, 3151, 2483, 1747, 3649, 1890, 2654, 2844, 1631, 3347, 1500, 2287, 3222, 957, 2711, 3180, 1938, 2885, 1721, 2478, 3604, 1455, 2764, 3341, 1880, 23 67, 1776, 3238, 2976, 767, 3131, 2669, 1822, 2507, 1278, 3376, 2858, 1742, 3618, 2770, 1932, 3296, 1863, 2536, 2744, 987, 3186, 2865, 1405, 3342, 1647, 2428, 3267, 1837, 2675, 3608, 17 49, 2485, 1514, 2890, 3400, 1953, 2715, 3159, 1016, 2295, 1722, 3241, 2886, 1463, 3460, 278 5, 1892, 2509, 3841, 1763, 2947, 1843, 3188, 2670, 1521, 3228, 2486, 958, 3349, 2860, 1985, 2 727, 1750, 3620, 2515, 1838, 3269, 2897, 1487, 3363, 2772, 1655, 3133, 2399, 999, 3242, 186 7, 2866, 3591, 1724, 2677, 2489, 1516, 3354, 2717, 1940, 3163, 1896, 2544, 3249, 1753, 2949, 3650, 1467, 2731, 3408, 989, 2299, 3192, 1954, 2889, 2678, 1765, 3365, 1845, 2510, 3274, 14 06, 2831, 3595, 1869, 2786, 3270, 1695, 2868, 3464, 895, 2415, 3134, 1944, 2776, 3624, 1522, 3008, 1659, 2517, 3353, 1846, 2681, 3244, 1754, 2839, 3350, 1956, 2490, 3714, 1003, 2718, 3 175, 1495, 2892, 3281, 1875, 2531, 3366, 1766, 2759, 3652, 1849, 2953, 3250, 1524, 2518, 34 24, 1927, 2733, 3165, 1769, 2682, 990, 2423, 3603, 1904, 2788, 3273, 1469, 2898, 3472, 1756, 2492, 3179, 1986, 2739, 3597, 1870, 2872, 3395, 1711, 2734, 3215, 1279, 2301, 3369, 1005, 2 843, 3632, 1931, 2623, 3252, 1661, 2521, 3166, 1877, 2950, 3356, 1499, 2763, 3598, 1850, 25 33, 3223, 2913, 1770, 3397, 2792, 1960, 3276, 2855, 1011, 3656, 2463, 1891, 3488, 2684, 152 8, 3181, 2961, 1719, 3842, 2427, 1988, 3370, 2900, 1878, 3282, 2741, 1777, 3256, 2522, 1470, 3716, 2845, 1006, 3377, 2765, 1939, 3187, 2954, 3402, 1743, 2534, 3605, 1852, 2742, 3227, 1 933, 2859, 3398, 1511, 2537, 3619, 1772, 2771, 3297, 1881, 2914, 2655, 2524, 1968, 3459, 29 62, 1013, 3182, 2745, 1501, 3610, 2479, 1723, 3372, 2904, 1893, 3239, 2800, 3664, 1823, 284 6, 3409, 1662, 2302, 3284, 1934, 2766, 3378, 1407, 2956, 3621, 1882, 2887, 3189, 2429, 1014, 3229, 2671, 1778, 3720, 2861, 1992, 3461, 2773, 3243, 1894, 2538, 3401, 1515, 2977, 3609, 1 751, 2746, 3190, 1941, 2487, 3343, 2916, 1897, 3606, 2787, 1780, 3298, 2867, 1017, 3380, 25 45, 3844, 1502, 3009, 3288, 1955, 2774, 3520, 2862, 1884, 3622, 2511, 1725, 3193, 2679, 183 9, 3351, 2891, 3230, 1898, 2748, 3680, 1517, 2540, 3404, 1946, 3271, 2964, 3728, 1755, 2920, 3465, 1018, 2777, 3245, 2491, 1847, 3651, 2978, 2000, 3194, 2789, 3300, 1784, 2869, 3625, 1 523, 2430, 3410, 2893, 1905, 3251, 2719, 1957, 3612, 2968, 3384, 1726, 2546, 3246, 1945, 36 53, 2683, 3355, 1518, 2870, 3135, 959, 2778, 3462, 2980, 1871, 3744, 2519, 1942, 3275, 2899, 3425, 1767, 2790, 3848, 1900, 3304, 2873, 3367, 1958, 2548, 3626, 2951, 1757, 3196, 2793, 1

525, 3473, 2928, 3633, 1851, 2493, 3412, 2016, 3658, 2780, 3253, 1906, 3010, 3357, 2894, 10 20, 3654, 2735, 1663, 3277, 2303, 3466, 1987, 3715, 2955, 3254, 1526, 2685, 3371, 2901, 187 9, 3628, 2523, 1961, 3283, 2874, 3426, 1771, 3856, 2794, 3167, 1908, 2984, 3474, 2915, 1948, 3665, 2552, 1758, 3257, 3416, 2743, 1529, 3634, 3012, 3312, 991, 2902, 3358, 2801, 1989, 37 17, 3278, 1853, 2494, 3657, 2963, 1962, 3468, 2767, 3399, 1773, 3599, 2876, 3183, 1883, 295 7, 3373, 2535, 1969, 3636, 2796, 3285, 1530, 3872, 2905, 3489, 1912, 2992, 3258, 2525, 1779, 3776, 3428, 2747, 1994, 3299, 2917, 3607, 1990, 2847, 3379, 3660, 1854, 2686, 3521, 2958, 1 007, 3286, 3721, 2431, 1964, 3374, 2906, 3191, 1471, 2802, 3666, 3403, 1774, 3016, 3640, 29 18, 1895, 3260, 2539, 3476, 2001, 3968, 2775, 3432, 1970, 2965, 3289, 3611, 1781, 2921, 349 0, 2804, 1885, 3718, 3301, 2526, 1993, 3381, 2979, 3681, 1532, 2908, 3405, 3623, 1899, 2749, 3231, 2863, 3480, 1782, 3843, 2922, 3195, 1015, 2541, 3729, 3382, 1935, 2970, 3290, 2779, 1 972, 3668, 3492, 2871, 3613, 1886, 3024, 3411, 3722, 1943, 2808, 3302, 2547, 1785, 3385, 36 27, 2929, 1503, 3463, 2981, 3845, 3305, 1996, 2750, 3440, 3682, 1901, 2969, 3292, 2542, 200 2, 3730, 3522, 2895, 3406, 1976, 2966, 3672, 3247, 1786, 2791, 3614, 2924, 3467, 1907, 3904, 2982, 3197, 1947, 3413, 2781, 3724, 2549, 2017, 3386, 3655, 2875, 1019, 3306, 3629, 3040, 3 496, 1519, 2930, 3745, 3427, 1902, 2687, 3255, 3849, 3011, 1727, 3524, 2550, 3684, 1959, 34 14, 2903, 3635, 3313, 2004, 2985, 3475, 2795, 3777, 1909, 3279, 2932, 3630, 1949, 3388, 297 2, 3846, 2782, 1963, 3469, 3659, 2553, 3308, 1788, 3417, 3013, 3732, 1527, 3504, 2877, 3688, 3259, 1910, 2986, 3857, 2797, 3429, 2018, 3746, 2907, 3359, 3637, 2008, 2993, 3198, 3661, 2 554, 1913, 3470, 3418, 2936, 3736, 1759, 2803, 3314, 3850, 3018, 1021, 3528, 3638, 3014, 19 50, 3430, 3748, 2878, 3287, 1991, 3667, 2988, 3477, 3858, 1965, 2495, 3433, 3641, 2798, 191 4, 3316, 3719, 2919, 3491, 2020, 3696, 3025, 3420, 2994, 3261, 1531, 3852, 2805, 3375, 3778, 1971, 2909, 3434, 3662, 3017, 1775, 3482, 3723, 2556, 3291, 1966, 3873, 2923, 3383, 3669, 1 855, 2806, 3536, 3642, 3320, 2959, 1995, 3752, 3441, 2996, 3969, 2024, 3493, 2910, 3683, 32 62, 1916, 2967, 3780, 3481, 2809, 3905, 1973, 3407, 2527, 3670, 3478, 1783, 3020, 3731, 330 3, 2925, 1997, 3644, 3436, 3026, 3860, 3494, 1974, 3293, 3000, 3387, 3725, 1533, 2810, 3552, 3673, 2931, 3442, 2003, 3874, 2971, 3199, 3760, 3041, 1022, 3523, 3685, 3415, 2543, 1887, 3 615, 3497, 2926, 3864, 3307, 1977, 2751, 3726, 3444, 2983, 3674, 2032, 3484, 3876, 3028, 32 94, 3784, 1787, 2933, 3525, 3686, 3389, 1998, 2973, 3847, 3498, 2987, 3733, 1903, 3309, 281 2, 3689, 3747, 3419, 2005, 2551, 3906, 3505, 2934, 3676, 1978, 3448, 3631, 3042, 3315, 3851, 2019, 3032, 3530, 3690, 3526, 2937, 2006, 3738, 3390, 2783, 3880, 3500, 1911, 3639, 2974, 3 310, 3792, 3015, 3431, 1980, 3970, 3697, 2989, 3537, 3749, 1534, 2938, 3506, 3908, 3317, 30 44, 1789, 3737, 3421, 3663, 2555, 3529, 3859, 2009, 2995, 3734, 3435, 3692, 2799, 2021, 331 8, 3853, 3471, 2990, 3750, 3508, 1951, 3643, 2879, 3422, 3888, 3019, 1915, 3808, 3479, 3698, 3048, 3321, 3854, 2010, 3532, 2940, 3779, 3912, 3437, 2997, 2022, 3671, 3538, 3753, 2807, 3 512, 3972, 2025, 3322, 3021, 3700, 3740, 3443, 2012, 2998, 3861, 3483, 3781, 2557, 3875, 19 67, 3553, 3645, 3027, 3438, 3754, 3263, 2911, 1023, 3866, 3675, 3495, 3001, 3761, 3540, 179 0, 3920, 3056, 3704, 3445, 3877, 2811, 1917, 3485, 3786, 3499, 3022, 3782, 3976, 2026, 3324, 2927, 3646, 3446, 3865, 3756, 3029, 1975, 3554, 3862, 3544, 3002, 3687, 3793, 2033, 3449, 3 043, 3878, 3762, 3295, 3030, 3936, 1999, 3486, 3677, 3785, 2935, 3527, 3984, 3501, 2028, 30 04, 3691, 3907, 3450, 3727, 2558, 3881, 1535, 3556, 3764, 2813, 3507, 3678, 3868, 3311, 197 9, 3033, 3735, 3909, 3502, 3788, 3045, 3391, 1918, 4000, 3693, 2975, 3531, 3882, 3794, 3560, 2034, 2939, 3768, 3889, 3452, 3699, 3034, 3509, 2007, 3914, 3739, 3319, 3046, 3910, 3809, 3 533, 3971, 2036, 3049, 3694, 3510, 3884, 3036, 3751, 3539, 3921, 1981, 3796, 2991, 3423, 38 90, 3701, 3513, 3741, 1791, 2814, 3568, 3973, 3755, 3323, 2941, 3913, 3702, 3534, 2011, 385 5, 3050, 3810, 3892, 3439, 3800, 2999, 4032, 2040, 3541, 3705, 3863, 3514, 3057, 3742, 3916, 3555, 1982, 3783, 3023, 3977, 3542, 3757, 3706, 3052, 3447, 3812, 2023, 3922, 3516, 3763, 2 559, 3896, 3758, 3325, 3867, 3647, 2013, 3003, 3545, 3974, 3787, 3557, 3937, 2942, 3816, 38 79, 1919, 3487, 3708, 3058, 3985, 3451, 3924, 3765, 3546, 3031, 2027, 3869, 3789, 3978, 355 8, 3766, 3060, 3883, 3561, 3795, 3938, 2014, 3679, 3548, 3005, 3986, 3769, 3503, 3928, 3824, 2815, 3870, 2029, 3326, 3790, 3980, 3911, 3035, 3453, 3695, 3885, 3797, 3562, 2035, 4001, 3 064, 3770, 3511, 3940, 3811, 3891, 3569, 3006, 4033, 3798, 2030, 3886, 3535, 3703, 3047, 39 15, 3772, 3564, 3988, 3944, 3801, 3515, 2037, 3037, 4002, 3813, 3893, 3454, 3917, 3743, 294 3, 3992, 3570, 3707, 3894, 2038, 3802, 4004, 3051, 3543, 3923, 3814, 3897, 3572, 3975, 3817, 3038, 3952, 2041, 3517, 3804, 4034, 3918, 3759, 3327, 3053, 3979, 3709, 3925, 3547, 3898, 2 042, 3818, 4008, 3059, 3939, 3576, 3767, 4036, 3926, 3825, 3518, 3054, 3987, 3791, 3900, 19 83, 3981, 3559, 3820, 3929, 4016, 3061, 3549, 3771, 3941, 3871, 3710, 3982, 3455, 3930, 204 4, 3062, 3826, 4040, 3942, 3563, 3799, 3989, 3945, 3828, 3065, 3550, 4003, 3932, 3773, 3887, 2015, 3946, 3565, 3994, 3803, 3066, 3895, 4048, 3832, 3571, 3953, 4005, 3774, 3993, 3566, 3 007, 3919, 2031, 3990, 3815, 3948, 4006, 3805, 3573, 3899, 4064, 3954, 3068, 3711, 4035, 35 74, 3927, 4009, 3819, 3956, 2039, 3996, 3806, 3577, 3039, 4037, 3901, 4010, 3821, 3931, 401 7, 3578, 3960, 3827, 4042, 4038, 3902, 3055, 4012, 3519, 3822, 2043, 3943, 4049, 4018, 3829, 3933, 4041, 3580, 3947, 3830, 3063, 3983, 4020, 3934, 3991, 3833, 3551, 4044, 3949, 4050, 4 024, 3834, 2045, 3955, 3995, 4065, 3067, 3567, 3950, 3775, 4007, 4052, 3957, 3997, 4011, 38 36, 3575, 3958, 4066, 4056, 3998, 4039, 4013, 3962, 4807, 30698, 2046, 3579, 401 9, 3823, 4014, 3903, 4043, 4072, 3964, 4021, 3831, 4045, 4022, 3581, 4051, 3070, 3935, 4025, 4080, 3835, 4046, 3951, 4053, 4026, 4067, 4054, 3959, 4028, 3582, 3837, 4057, 4069, 3999, 2 047, 3963, 4058, 4070, 4073, 4060, 4015, 3071, 3838, 3965, 4074, 4023, 4081, 4047, 4076, 35 83, 4027, 3966, 4082, 4055, 4084, 4029, 3839, 4059, 4088, 4030, 4071, 4061, 3967, 4075, 406 2, 4077, 4083, 4078, 4085, 4086, 4089, 4090, 4031, 4092, 4063, 4079, 4087, 4091, 4093, 4094, 4095]

TABLE Q10

| with a sequence length of 4096: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 128 |
| 8 | 256 |
| 9 | 512 |
| 10 | 1024 |
| 11 | 2048 |
| 12 | 3 |
| 13 | 5 |
| 14 | 64 |
| 15 | 9 |
| 16 | 6 |
| 17 | 17 |
| 18 | 10 |
| 19 | 18 |
| 20 | 12 |
| 21 | 33 |
| 22 | 129 |
| 23 | 65 |
| 24 | 20 |
| 25 | 34 |
| 26 | 24 |
| 27 | 257 |
| 28 | 36 |
| 29 | 7 |
| 30 | 66 |
| 31 | 11 |
| 32 | 40 |
| 33 | 130 |
| 34 | 513 |
| 35 | 68 |
| 36 | 19 |
| 37 | 13 |
| 38 | 48 |
| 39 | 14 |
| 40 | 1025 |
| 41 | 72 |
| 42 | 258 |
| 43 | 132 |
| 44 | 21 |
| 45 | 35 |
| 46 | 2049 |
| 47 | 26 |
| 48 | 80 |
| 49 | 37 |
| 50 | 136 |
| 51 | 25 |
| 52 | 22 |
| 53 | 514 |
| 54 | 260 |
| 55 | 38 |
| 56 | 96 |
| 57 | 144 |
| 58 | 67 |
| 59 | 41 |
| 60 | 28 |
| 61 | 69 |
| 62 | 160 |
| 63 | 264 |
| 64 | 42 |
| 65 | 49 |
| 66 | 1026 |
| 67 | 74 |
| 68 | 516 |
| 69 | 70 |
| 70 | 131 |
| 71 | 44 |
| 72 | 272 |
| 73 | 81 |
| 74 | 50 |

TABLE Q10-continued

| with a sequence length of 4096: | |
|---|---|
| Reliability or reliability sequence number | Polarized channel sequence number |
| 75 | 133 |
| 76 | 73 |
| 77 | 15 |
| 78 | 52 |
| 79 | 2050 |
| 80 | 288 |
| 81 | 520 |
| 82 | 192 |
| 83 | 23 |
| 84 | 76 |
| 85 | 137 |
| 86 | 1028 |
| 87 | 82 |
| 88 | 56 |
| 89 | 384 |
| 90 | 27 |
| 91 | 134 |
| 92 | 97 |
| 93 | 528 |
| 94 | 39 |
| 95 | 259 |
| 96 | 145 |
| 97 | 84 |
| 98 | 29 |
| 99 | 138 |
| 100 | 43 |
| 101 | 261 |
| 102 | 1032 |
| 103 | 544 |
| 104 | 98 |
| 105 | 2052 |
| 106 | 146 |
| 107 | 88 |
| 108 | 30 |
| 109 | 320 |
| 110 | 140 |
| 111 | 71 |
| 112 | 45 |
| 113 | 640 |
| 114 | 161 |
| 115 | 265 |
| 116 | 100 |
| 117 | 51 |
| 118 | 1040 |
| 119 | 193 |
| 120 | 46 |
| 121 | 262 |
| 122 | 768 |
| 123 | 75 |
| 124 | 148 |
| 125 | 104 |
| 126 | 273 |
| 127 | 162 |
| 128 | 2056 |
| 129 | 53 |
| 130 | 77 |
| 131 | 515 |
| 132 | 152 |
| 133 | 1056 |
| 134 | 266 |
| 135 | 54 |
| 136 | 164 |
| 137 | 83 |
| 138 | 274 |
| 139 | 517 |
| 140 | 57 |
| 141 | 135 |
| 142 | 112 |
| 143 | 268 |
| 144 | 194 |
| 145 | 1152 |
| 146 | 78 |
| 147 | 576 |
| 148 | 2064 |
| 149 | 139 |

TABLE Q10-continued

| with a sequence length of 4096: | |
|---|---|
| Reliability or reliability sequence number | Polarized channel sequence number |
| 150 | 289 |
| 151 | 85 |
| 152 | 58 |
| 153 | 168 |
| 154 | 385 |
| 155 | 521 |
| 156 | 99 |
| 157 | 1280 |
| 158 | 196 |
| 159 | 321 |
| 160 | 86 |
| 161 | 147 |
| 162 | 518 |
| 163 | 60 |
| 164 | 276 |
| 165 | 141 |
| 166 | 2080 |
| 167 | 89 |
| 168 | 290 |
| 169 | 1536 |
| 170 | 176 |
| 171 | 529 |
| 172 | 101 |
| 173 | 31 |
| 174 | 280 |
| 175 | 142 |
| 176 | 90 |
| 177 | 522 |
| 178 | 292 |
| 179 | 1027 |
| 180 | 200 |
| 181 | 102 |
| 182 | 263 |
| 183 | 2176 |
| 184 | 530 |
| 185 | 149 |
| 186 | 105 |
| 187 | 163 |
| 188 | 322 |
| 189 | 92 |
| 190 | 1029 |
| 191 | 524 |
| 192 | 47 |
| 193 | 267 |
| 194 | 106 |
| 195 | 154 |
| 196 | 545 |
| 197 | 296 |
| 198 | 55 |
| 199 | 2304 |
| 200 | 208 |
| 201 | 1088 |
| 202 | 386 |
| 203 | 641 |
| 204 | 113 |
| 205 | 165 |
| 206 | 324 |
| 207 | 153 |
| 208 | 79 |
| 209 | 1033 |
| 210 | 577 |
| 211 | 275 |
| 212 | 150 |
| 213 | 108 |
| 214 | 2560 |
| 215 | 532 |
| 216 | 269 |
| 217 | 166 |
| 218 | 59 |
| 219 | 1030 |
| 220 | 304 |
| 221 | 546 |
| 222 | 224 |
| 223 | 114 |
| 224 | 270 |

TABLE Q10-continued

| with a sequence length of 4096: | |
|---|---|
| Reliability or reliability sequence number | Polarized channel sequence number |
| 225 | 195 |
| 226 | 536 |
| 227 | 1041 |
| 228 | 328 |
| 229 | 3072 |
| 230 | 87 |
| 231 | 169 |
| 232 | 388 |
| 233 | 769 |
| 234 | 116 |
| 235 | 156 |
| 236 | 1034 |
| 237 | 277 |
| 238 | 548 |
| 239 | 197 |
| 240 | 291 |
| 241 | 61 |
| 242 | 2051 |
| 243 | 170 |
| 244 | 519 |
| 245 | 1042 |
| 246 | 282 |
| 247 | 91 |
| 248 | 177 |
| 249 | 578 |
| 250 | 336 |
| 251 | 120 |
| 252 | 293 |
| 253 | 1036 |
| 254 | 202 |
| 255 | 523 |
| 256 | 2053 |
| 257 | 198 |
| 258 | 392 |
| 259 | 62 |
| 260 | 552 |
| 261 | 1057 |
| 262 | 281 |
| 263 | 172 |
| 264 | 278 |
| 265 | 642 |
| 266 | 103 |
| 267 | 209 |
| 268 | 2112 |
| 269 | 294 |
| 270 | 1153 |
| 271 | 580 |
| 272 | 178 |
| 273 | 352 |
| 274 | 93 |
| 275 | 531 |
| 276 | 201 |
| 277 | 1089 |
| 278 | 400 |
| 279 | 107 |
| 280 | 2057 |
| 281 | 525 |
| 282 | 323 |
| 283 | 143 |
| 284 | 1044 |
| 285 | 297 |
| 286 | 560 |
| 287 | 180 |
| 288 | 94 |
| 289 | 284 |
| 290 | 526 |
| 291 | 1058 |
| 292 | 2054 |
| 293 | 151 |
| 294 | 325 |
| 295 | 204 |
| 296 | 584 |
| 297 | 416 |
| 298 | 109 |
| 299 | 1048 |

TABLE Q10-continued

| with a sequence length of 4096: | |
|---|---|
| Reliability or reliability sequence number | Polarized channel sequence number |
| 300 | 770 |
| 301 | 298 |
| 302 | 210 |
| 303 | 2065 |
| 304 | 184 |
| 305 | 644 |
| 306 | 1281 |
| 307 | 305 |
| 308 | 115 |
| 309 | 330 |
| 310 | 533 |
| 311 | 155 |
| 312 | 1060 |
| 313 | 326 |
| 314 | 2058 |
| 315 | 547 |
| 316 | 225 |
| 317 | 387 |
| 318 | 110 |
| 319 | 538 |
| 320 | 1031 |
| 321 | 300 |
| 322 | 167 |
| 323 | 592 |
| 324 | 337 |
| 325 | 2066 |
| 326 | 212 |
| 327 | 1090 |
| 328 | 306 |
| 329 | 549 |
| 330 | 117 |
| 331 | 157 |
| 332 | 648 |
| 333 | 1035 |
| 334 | 389 |
| 335 | 2060 |
| 336 | 171 |
| 337 | 329 |
| 338 | 537 |
| 339 | 118 |
| 340 | 1064 |
| 341 | 271 |
| 342 | 534 |
| 343 | 226 |
| 344 | 308 |
| 345 | 2081 |
| 346 | 1154 |
| 347 | 772 |
| 348 | 216 |
| 349 | 448 |
| 350 | 550 |
| 351 | 121 |
| 352 | 1537 |
| 353 | 279 |
| 354 | 158 |
| 355 | 2177 |
| 356 | 608 |
| 357 | 332 |
| 358 | 199 |
| 359 | 1092 |
| 360 | 656 |
| 361 | 393 |
| 362 | 173 |
| 363 | 579 |
| 364 | 1043 |
| 365 | 2113 |
| 366 | 122 |
| 367 | 228 |
| 368 | 553 |
| 369 | 338 |
| 370 | 1037 |
| 371 | 179 |
| 372 | 540 |
| 373 | 312 |
| 374 | 2068 |
| 375 | 174 |
| 376 | 581 |
| 377 | 1072 |
| 378 | 283 |
| 379 | 63 |
| 380 | 390 |
| 381 | 672 |
| 382 | 1038 |
| 383 | 203 |
| 384 | 2082 |
| 385 | 353 |
| 386 | 776 |
| 387 | 232 |
| 388 | 1096 |
| 389 | 295 |
| 390 | 554 |
| 391 | 124 |
| 392 | 401 |
| 393 | 2072 |
| 394 | 1282 |
| 395 | 561 |
| 396 | 340 |
| 397 | 586 |
| 398 | 181 |
| 399 | 285 |
| 400 | 1156 |
| 401 | 2305 |
| 402 | 582 |
| 403 | 205 |
| 404 | 394 |
| 405 | 643 |
| 406 | 1045 |
| 407 | 182 |
| 408 | 299 |
| 409 | 556 |
| 410 | 2084 |
| 411 | 211 |
| 412 | 1059 |
| 413 | 354 |
| 414 | 784 |
| 415 | 95 |
| 416 | 1050 |
| 417 | 402 |
| 418 | 593 |
| 419 | 2055 |
| 420 | 185 |
| 421 | 344 |
| 422 | 1104 |
| 423 | 562 |
| 424 | 240 |
| 425 | 286 |
| 426 | 645 |
| 427 | 2114 |
| 428 | 1061 |
| 429 | 206 |
| 430 | 585 |
| 431 | 396 |
| 432 | 327 |
| 433 | 1160 |
| 434 | 527 |
| 435 | 2059 |
| 436 | 111 |
| 437 | 301 |
| 438 | 1049 |
| 439 | 564 |
| 440 | 213 |
| 441 | 800 |
| 442 | 417 |
| 443 | 2088 |
| 444 | 1046 |
| 445 | 186 |
| 446 | 704 |
| 447 | 356 |
| 448 | 227 |
| 449 | 1538 |

TABLE Q10-continued

| with a sequence length of 4096: | |
|---|---|
| Reliability or reliability sequence number | Polarized channel sequence number |
| 450 | 535 |
| 451 | 2178 |
| 452 | 307 |
| 453 | 588 |
| 454 | 1284 |
| 455 | 449 |
| 456 | 214 |
| 457 | 649 |
| 458 | 302 |
| 459 | 2561 |
| 460 | 1062 |
| 461 | 119 |
| 462 | 594 |
| 463 | 331 |
| 464 | 1120 |
| 465 | 568 |
| 466 | 188 |
| 467 | 2116 |
| 468 | 404 |
| 469 | 896 |
| 470 | 1168 |
| 471 | 360 |
| 472 | 217 |
| 473 | 539 |
| 474 | 1091 |
| 475 | 2067 |
| 476 | 418 |
| 477 | 646 |
| 478 | 229 |
| 479 | 1065 |
| 480 | 309 |
| 481 | 609 |
| 482 | 2061 |
| 483 | 333 |
| 484 | 551 |
| 485 | 1052 |
| 486 | 159 |
| 487 | 408 |
| 488 | 771 |
| 489 | 1093 |
| 490 | 2096 |
| 491 | 123 |
| 492 | 657 |
| 493 | 310 |
| 494 | 1184 |
| 495 | 218 |
| 496 | 596 |
| 497 | 2062 |
| 498 | 420 |
| 499 | 1288 |
| 500 | 541 |
| 501 | 339 |
| 502 | 650 |
| 503 | 1066 |
| 504 | 3073 |
| 505 | 230 |
| 506 | 313 |
| 507 | 555 |
| 508 | 1073 |
| 509 | 391 |
| 510 | 773 |
| 511 | 233 |
| 512 | 2120 |
| 513 | 1098 |
| 514 | 368 |
| 515 | 610 |
| 516 | 220 |
| 517 | 1540 |
| 518 | 658 |
| 519 | 2306 |
| 520 | 450 |
| 521 | 334 |
| 522 | 1094 |
| 523 | 600 |
| 524 | 175 |

TABLE Q10-continued

| with a sequence length of 4096: | |
|---|---|
| Reliability or reliability sequence number | Polarized channel sequence number |
| 525 | 542 |
| 526 | 2180 |
| 527 | 1155 |
| 528 | 395 |
| 529 | 832 |
| 530 | 125 |
| 531 | 1068 |
| 532 | 2069 |
| 533 | 341 |
| 534 | 652 |
| 535 | 314 |
| 536 | 1296 |
| 537 | 583 |
| 538 | 234 |
| 539 | 2083 |
| 540 | 557 |
| 541 | 1105 |
| 542 | 424 |
| 543 | 673 |
| 544 | 355 |
| 545 | 1074 |
| 546 | 2074 |
| 547 | 183 |
| 548 | 777 |
| 549 | 452 |
| 550 | 1157 |
| 551 | 612 |
| 552 | 342 |
| 553 | 2128 |
| 554 | 563 |
| 555 | 1097 |
| 556 | 241 |
| 557 | 403 |
| 558 | 705 |
| 559 | 2085 |
| 560 | 1039 |
| 561 | 207 |
| 562 | 558 |
| 563 | 1076 |
| 564 | 316 |
| 565 | 774 |
| 566 | 2184 |
| 567 | 397 |
| 568 | 1312 |
| 569 | 587 |
| 570 | 236 |
| 571 | 345 |
| 572 | 2073 |
| 573 | 1544 |
| 574 | 660 |
| 575 | 432 |
| 576 | 1216 |
| 577 | 616 |
| 578 | 187 |
| 579 | 2070 |
| 580 | 785 |
| 581 | 1047 |
| 582 | 357 |
| 583 | 674 |
| 584 | 287 |
| 585 | 2562 |
| 586 | 1100 |
| 587 | 565 |
| 588 | 126 |
| 589 | 1161 |
| 590 | 589 |
| 591 | 2308 |
| 592 | 398 |
| 593 | 346 |
| 594 | 1106 |
| 595 | 664 |
| 596 | 242 |
| 597 | 1080 |
| 598 | 2086 |
| 599 | 778 |

TABLE Q10-continued

| with a sequence length of 4096: | |
|---|---|
| Reliability or reliability sequence number | Polarized channel sequence number |
| 600 | 456 |
| 601 | 566 |
| 602 | 1408 |
| 603 | 358 |
| 604 | 2144 |
| 605 | 676 |
| 606 | 1051 |
| 607 | 215 |
| 608 | 595 |
| 609 | 405 |
| 610 | 2192 |
| 611 | 1158 |
| 612 | 786 |
| 613 | 361 |
| 614 | 1121 |
| 615 | 569 |
| 616 | 2115 |
| 617 | 244 |
| 618 | 647 |
| 619 | 1552 |
| 620 | 419 |
| 621 | 624 |
| 622 | 2089 |
| 623 | 1063 |
| 624 | 348 |
| 625 | 189 |
| 626 | 780 |
| 627 | 1283 |
| 628 | 2076 |
| 629 | 303 |
| 630 | 706 |
| 631 | 1169 |
| 632 | 362 |
| 633 | 590 |
| 634 | 2117 |
| 635 | 410 |
| 636 | 1108 |
| 637 | 651 |
| 638 | 219 |
| 639 | 1053 |
| 640 | 2208 |
| 641 | 801 |
| 642 | 311 |
| 643 | 1162 |
| 644 | 597 |
| 645 | 2312 |
| 646 | 464 |
| 647 | 570 |
| 648 | 1067 |
| 649 | 248 |
| 650 | 680 |
| 651 | 2090 |
| 652 | 1285 |
| 653 | 369 |
| 654 | 897 |
| 655 | 1568 |
| 656 | 421 |
| 657 | 2097 |
| 658 | 611 |
| 659 | 1122 |
| 660 | 190 |
| 661 | 708 |
| 662 | 3074 |
| 663 | 409 |
| 664 | 1170 |
| 665 | 833 |
| 666 | 335 |
| 667 | 1112 |
| 668 | 2122 |
| 669 | 598 |
| 670 | 406 |
| 671 | 1054 |
| 672 | 659 |
| 673 | 231 |
| 674 | 2564 |

TABLE Q10-continued

| with a sequence length of 4096: | |
|---|---|
| Reliability or reliability sequence number | Polarized channel sequence number |
| 675 | 1344 |
| 676 | 572 |
| 677 | 364 |
| 678 | 1164 |
| 679 | 2118 |
| 680 | 788 |
| 681 | 422 |
| 682 | 221 |
| 683 | 1095 |
| 684 | 315 |
| 685 | 2179 |
| 686 | 653 |
| 687 | 1069 |
| 688 | 480 |
| 689 | 601 |
| 690 | 2092 |
| 691 | 1664 |
| 692 | 370 |
| 693 | 802 |
| 694 | 1185 |
| 695 | 2320 |
| 696 | 127 |
| 697 | 688 |
| 698 | 1289 |
| 699 | 451 |
| 700 | 613 |
| 701 | 2129 |
| 702 | 1124 |
| 703 | 343 |
| 704 | 543 |
| 705 | 1075 |
| 706 | 2098 |
| 707 | 425 |
| 708 | 792 |
| 709 | 1217 |
| 710 | 235 |
| 711 | 2181 |
| 712 | 654 |
| 713 | 372 |
| 714 | 1070 |
| 715 | 602 |
| 716 | 412 |
| 717 | 2121 |
| 718 | 1286 |
| 719 | 804 |
| 720 | 222 |
| 721 | 1792 |
| 722 | 2063 |
| 723 | 712 |
| 724 | 453 |
| 725 | 1099 |
| 726 | 614 |
| 727 | 2100 |
| 728 | 317 |
| 729 | 1172 |
| 730 | 775 |
| 731 | 426 |
| 732 | 2336 |
| 733 | 1128 |
| 734 | 661 |
| 735 | 237 |
| 736 | 1297 |
| 737 | 2568 |
| 738 | 617 |
| 739 | 675 |
| 740 | 1186 |
| 741 | 347 |
| 742 | 1077 |
| 743 | 2240 |
| 744 | 834 |
| 745 | 433 |
| 746 | 1101 |
| 747 | 604 |
| 748 | 2071 |
| 749 | 376 |

TABLE Q10-continued

| with a sequence length of 4096: | |
|---|---|
| Reliability or reliability sequence number | Polarized channel sequence number |
| 750 | 1539 |
| 751 | 559 |
| 752 | 243 |
| 753 | 2124 |
| 754 | 1176 |
| 755 | 779 |
| 756 | 458 |
| 757 | 1290 |
| 758 | 2185 |
| 759 | 618 |
| 760 | 454 |
| 761 | 1078 |
| 762 | 666 |
| 763 | 3076 |
| 764 | 318 |
| 765 | 1188 |
| 766 | 808 |
| 767 | 428 |
| 768 | 2130 |
| 769 | 1107 |
| 770 | 567 |
| 771 | 238 |
| 772 | 2104 |
| 773 | 1298 |
| 774 | 720 |
| 775 | 1541 |
| 776 | 359 |
| 777 | 2432 |
| 778 | 898 |
| 779 | 1081 |
| 780 | 625 |
| 781 | 465 |
| 782 | 2075 |
| 783 | 1159 |
| 784 | 677 |
| 785 | 434 |
| 786 | 1136 |
| 787 | 2182 |
| 788 | 836 |
| 789 | 245 |
| 790 | 1292 |
| 791 | 665 |
| 792 | 2145 |
| 793 | 349 |
| 794 | 1218 |
| 795 | 591 |
| 796 | 1102 |
| 797 | 2576 |
| 798 | 457 |
| 799 | 787 |
| 800 | 1600 |
| 801 | 2087 |
| 802 | 662 |
| 803 | 363 |
| 804 | 1163 |
| 805 | 620 |
| 806 | 2307 |
| 807 | 246 |
| 808 | 1313 |
| 809 | 781 |
| 810 | 1109 |
| 811 | 2193 |
| 812 | 399 |
| 813 | 678 |
| 814 | 1082 |
| 815 | 2132 |
| 816 | 436 |
| 817 | 571 |
| 818 | 1192 |
| 819 | 350 |
| 820 | 2077 |
| 821 | 1409 |
| 822 | 816 |
| 823 | 736 |
| 824 | 1545 |

TABLE Q10-continued

| with a sequence length of 4096: | |
|---|---|
| Reliability or reliability sequence number | Polarized channel sequence number |
| 825 | 2186 |
| 826 | 407 |
| 827 | 626 |
| 828 | 1123 |
| 829 | 2091 |
| 830 | 249 |
| 831 | 1220 |
| 832 | 782 |
| 833 | 460 |
| 834 | 2309 |
| 835 | 1345 |
| 836 | 707 |
| 837 | 840 |
| 838 | 3080 |
| 839 | 1110 |
| 840 | 365 |
| 841 | 1171 |
| 842 | 599 |
| 843 | 2592 |
| 844 | 466 |
| 845 | 1542 |
| 846 | 681 |
| 847 | 2146 |
| 848 | 440 |
| 849 | 1084 |
| 850 | 900 |
| 851 | 1300 |
| 852 | 2194 |
| 853 | 250 |
| 854 | 628 |
| 855 | 1165 |
| 856 | 2136 |
| 857 | 668 |
| 858 | 371 |
| 859 | 1113 |
| 860 | 789 |
| 861 | 2078 |
| 862 | 1314 |
| 863 | 411 |
| 864 | 709 |
| 865 | 2368 |
| 866 | 1200 |
| 867 | 803 |
| 868 | 1553 |
| 869 | 481 |
| 870 | 2188 |
| 871 | 573 |
| 872 | 1125 |
| 873 | 366 |
| 874 | 2119 |
| 875 | 682 |
| 876 | 1055 |
| 877 | 191 |
| 878 | 2093 |
| 879 | 1304 |
| 880 | 794 |
| 881 | 603 |
| 882 | 1166 |
| 883 | 2688 |
| 884 | 423 |
| 885 | 1114 |
| 886 | 689 |
| 887 | 2209 |
| 888 | 468 |
| 889 | 1546 |
| 890 | 848 |
| 891 | 2313 |
| 892 | 1316 |
| 893 | 632 |
| 894 | 373 |
| 895 | 1224 |
| 896 | 2148 |
| 897 | 805 |
| 898 | 1126 |
| 899 | 413 |

TABLE Q10-continued

| with a sequence length of 4096: | |
|---|---|
| Reliability or reliability sequence number | Polarized channel sequence number |
| 900 | 2099 |
| 901 | 714 |
| 902 | 1287 |
| 903 | 427 |
| 904 | 3088 |
| 905 | 1554 |
| 906 | 710 |
| 907 | 904 |
| 908 | 2241 |
| 909 | 1173 |
| 910 | 252 |
| 911 | 1129 |
| 912 | 2094 |
| 913 | 574 |
| 914 | 374 |
| 915 | 1187 |
| 916 | 793 |
| 917 | 2310 |
| 918 | 1346 |
| 919 | 684 |
| 920 | 482 |
| 921 | 2816 |
| 922 | 1116 |
| 923 | 790 |
| 924 | 1548 |
| 925 | 2123 |
| 926 | 472 |
| 927 | 1071 |
| 928 | 615 |
| 929 | 2196 |
| 930 | 721 |
| 931 | 1291 |
| 932 | 377 |
| 933 | 2152 |
| 934 | 1130 |
| 935 | 806 |
| 936 | 690 |
| 937 | 2321 |
| 938 | 1178 |
| 939 | 223 |
| 940 | 1569 |
| 941 | 2210 |
| 942 | 864 |
| 943 | 414 |
| 944 | 1320 |
| 945 | 2101 |
| 946 | 605 |
| 947 | 1079 |
| 948 | 713 |
| 949 | 2125 |
| 950 | 1232 |
| 951 | 455 |
| 952 | 912 |
| 953 | 2563 |
| 954 | 1410 |
| 955 | 429 |
| 956 | 1665 |
| 957 | 2200 |
| 958 | 619 |
| 959 | 835 |
| 960 | 1137 |
| 961 | 3104 |
| 962 | 378 |
| 963 | 1189 |
| 964 | 655 |
| 965 | 2314 |
| 966 | 1348 |
| 967 | 809 |
| 968 | 484 |
| 969 | 2102 |
| 970 | 1177 |
| 971 | 692 |
| 972 | 1103 |
| 973 | 2212 |
| 974 | 435 |

TABLE Q10-continued

| with a sequence length of 4096: | |
|---|---|
| Reliability or reliability sequence number | Polarized channel sequence number |
| 975 | 1601 |
| 976 | 606 |
| 977 | 2131 |
| 978 | 796 |
| 979 | 1299 |
| 980 | 239 |
| 981 | 2322 |
| 982 | 1174 |
| 983 | 663 |
| 984 | 1132 |
| 985 | 2565 |
| 986 | 837 |
| 987 | 430 |
| 988 | 1556 |
| 989 | 2105 |
| 990 | 716 |
| 991 | 1293 |
| 992 | 319 |
| 993 | 2183 |
| 994 | 1190 |
| 995 | 928 |
| 996 | 1083 |
| 997 | 2160 |
| 998 | 621 |
| 999 | 459 |
| 1000 | 1328 |
| 1001 | 2316 |
| 1002 | 810 |
| 1003 | 1570 |
| 1004 | 722 |
| 1005 | 2242 |
| 1006 | 1248 |
| 1007 | 488 |
| 1008 | 3200 |
| 1009 | 696 |
| 1010 | 1138 |
| 1011 | 817 |
| 1012 | 2126 |
| 1013 | 1294 |
| 1014 | 380 |
| 1015 | 1219 |
| 1016 | 2624 |
| 1017 | 627 |
| 1018 | 1560 |
| 1019 | 437 |
| 1020 | 2187 |
| 1021 | 842 |
| 1022 | 1352 |
| 1023 | 667 |
| 1024 | 2337 |
| 1025 | 1111 |
| 1026 | 247 |
| 1027 | 2133 |
| 1028 | 1193 |
| 1029 | 838 |
| 1030 | 1412 |
| 1031 | 2106 |
| 1032 | 737 |
| 1033 | 461 |
| 1034 | 1793 |
| 1035 | 2216 |
| 1036 | 899 |
| 1037 | 1140 |
| 1038 | 2433 |
| 1039 | 622 |
| 1040 | 1180 |
| 1041 | 438 |
| 1042 | 2569 |
| 1043 | 1301 |
| 1044 | 812 |
| 1045 | 679 |
| 1046 | 2147 |
| 1047 | 1572 |
| 1048 | 467 |
| 1049 | 1221 |

TABLE Q10-continued

| with a sequence length of 4096: | |
|---|---|
| Reliability or reliability sequence number | Polarized channel sequence number |
| 1050 | 3328 |
| 1051 | 849 |
| 1052 | 1315 |
| 1053 | 2244 |
| 1054 | 724 |
| 1055 | 1085 |
| 1056 | 351 |
| 1057 | 2369 |
| 1058 | 1194 |
| 1059 | 818 |
| 1060 | 1543 |
| 1061 | 2134 |
| 1062 | 629 |
| 1063 | 441 |
| 1064 | 2195 |
| 1065 | 1306 |
| 1066 | 669 |
| 1067 | 1115 |
| 1068 | 2566 |
| 1069 | 496 |
| 1070 | 1201 |
| 1071 | 2108 |
| 1072 | 901 |
| 1073 | 1602 |
| 1074 | 683 |
| 1075 | 2324 |
| 1076 | 1360 |
| 1077 | 251 |
| 1078 | 1144 |
| 1079 | 2189 |
| 1080 | 841 |
| 1081 | 630 |
| 1082 | 2137 |
| 1083 | 1317 |
| 1084 | 462 |
| 1085 | 1226 |
| 1086 | 2338 |
| 1087 | 783 |
| 1088 | 1547 |
| 1089 | 3584 |
| 1090 | 738 |
| 1091 | 1222 |
| 1092 | 820 |
| 1093 | 2224 |
| 1094 | 1416 |
| 1095 | 367 |
| 1096 | 2577 |
| 1097 | 1086 |
| 1098 | 728 |
| 1099 | 1576 |
| 1100 | 2149 |
| 1101 | 960 |
| 1102 | 469 |
| 1103 | 2079 |
| 1104 | 1305 |
| 1105 | 633 |
| 1106 | 1196 |
| 1107 | 2328 |
| 1108 | 791 |
| 1109 | 1302 |
| 1110 | 2190 |
| 1111 | 442 |
| 1112 | 1666 |
| 1113 | 670 |
| 1114 | 2138 |
| 1115 | 1127 |
| 1116 | 844 |
| 1117 | 2570 |
| 1118 | 1233 |
| 1119 | 483 |
| 1120 | 1318 |
| 1121 | 2340 |
| 1122 | 711 |
| 1123 | 1604 |
| 1124 | 3075 |

TABLE Q10-continued

| with a sequence length of 4096: | |
|---|---|
| Reliability or reliability sequence number | Polarized channel sequence number |
| 1125 | 905 |
| 1126 | 1202 |
| 1127 | 470 |
| 1128 | 2248 |
| 1129 | 1376 |
| 1130 | 685 |
| 1131 | 2150 |
| 1132 | 1117 |
| 1133 | 634 |
| 1134 | 375 |
| 1135 | 2311 |
| 1136 | 1555 |
| 1137 | 740 |
| 1138 | 2578 |
| 1139 | 1225 |
| 1140 | 850 |
| 1141 | 2197 |
| 1142 | 1424 |
| 1143 | 444 |
| 1144 | 1131 |
| 1145 | 2153 |
| 1146 | 691 |
| 1147 | 1549 |
| 1148 | 2211 |
| 1149 | 824 |
| 1150 | 1347 |
| 1151 | 686 |
| 1152 | 2370 |
| 1153 | 1167 |
| 1154 | 253 |
| 1155 | 2140 |
| 1156 | 1321 |
| 1157 | 795 |
| 1158 | 3077 |
| 1159 | 1584 |
| 1160 | 575 |
| 1161 | 1204 |
| 1162 | 2572 |
| 1163 | 473 |
| 1164 | 1118 |
| 1165 | 2095 |
| 1166 | 902 |
| 1167 | 1308 |
| 1168 | 2315 |
| 1169 | 715 |
| 1170 | 1550 |
| 1171 | 485 |
| 1172 | 2154 |
| 1173 | 1175 |
| 1174 | 865 |
| 1175 | 2202 |
| 1176 | 1349 |
| 1177 | 744 |
| 1178 | 2593 |
| 1179 | 1228 |
| 1180 | 807 |
| 1181 | 2344 |
| 1182 | 1608 |
| 1183 | 415 |
| 1184 | 1440 |
| 1185 | 2103 |
| 1186 | 636 |
| 1187 | 1133 |
| 1188 | 2256 |
| 1189 | 913 |
| 1190 | 1794 |
| 1191 | 3136 |
| 1192 | 379 |
| 1193 | 1322 |
| 1194 | 852 |
| 1195 | 2434 |
| 1196 | 1234 |
| 1197 | 693 |
| 1198 | 2689 |
| 1199 | 1208 |

TABLE Q10-continued

| with a sequence length of 4096: | |
|---|---|
| Reliability or reliability sequence number | Polarized channel sequence number |
| 1200 | 474 |
| 1201 | 2161 |
| 1202 | 1668 |
| 1203 | 797 |
| 1204 | 2213 |
| 1205 | 1329 |
| 1206 | 717 |
| 1207 | 2372 |
| 1208 | 1139 |
| 1209 | 906 |
| 1210 | 1354 |
| 1211 | 2201 |
| 1212 | 486 |
| 1213 | 1557 |
| 1214 | 2127 |
| 1215 | 694 |
| 1216 | 1179 |
| 1217 | 3081 |
| 1218 | 811 |
| 1219 | 1350 |
| 1220 | 2625 |
| 1221 | 489 |
| 1222 | 1571 |
| 1223 | 2323 |
| 1224 | 723 |
| 1225 | 1249 |
| 1226 | 866 |
| 1227 | 2198 |
| 1228 | 607 |
| 1229 | 476 |
| 1230 | 2156 |
| 1231 | 1411 |
| 1232 | 914 |
| 1233 | 2580 |
| 1234 | 1134 |
| 1235 | 697 |
| 1236 | 2317 |
| 1237 | 1562 |
| 1238 | 431 |
| 1239 | 2214 |
| 1240 | 1324 |
| 1241 | 856 |
| 1242 | 2107 |
| 1243 | 1191 |
| 1244 | 752 |
| 1245 | 1616 |
| 1246 | 3078 |
| 1247 | 798 |
| 1248 | 1361 |
| 1249 | 2352 |
| 1250 | 254 |
| 1251 | 1236 |
| 1252 | 2594 |
| 1253 | 718 |
| 1254 | 1330 |
| 1255 | 2272 |
| 1256 | 908 |
| 1257 | 1573 |
| 1258 | 2162 |
| 1259 | 839 |
| 1260 | 1141 |
| 1261 | 2318 |
| 1262 | 381 |
| 1263 | 1181 |
| 1264 | 2243 |
| 1265 | 623 |
| 1266 | 1672 |
| 1267 | 2584 |
| 1268 | 813 |
| 1269 | 1413 |
| 1270 | 3089 |
| 1271 | 725 |
| 1272 | 1195 |
| 1273 | 2376 |
| 1274 | 490 |

TABLE Q10-continued

| with a sequence length of 4096: | |
|---|---|
| Reliability or reliability sequence number | Polarized channel sequence number |
| 1275 | 1353 |
| 1276 | 2135 |
| 1277 | 929 |
| 1278 | 1561 |
| 1279 | 698 |
| 1280 | 2217 |
| 1281 | 1142 |
| 1282 | 439 |
| 1283 | 2436 |
| 1284 | 1295 |
| 1285 | 868 |
| 1286 | 2817 |
| 1287 | 1558 |
| 1288 | 739 |
| 1289 | 2164 |
| 1290 | 1250 |
| 1291 | 819 |
| 1292 | 2204 |
| 1293 | 1332 |
| 1294 | 497 |
| 1295 | 3082 |
| 1296 | 1796 |
| 1297 | 961 |
| 1298 | 2325 |
| 1299 | 1240 |
| 1300 | 726 |
| 1301 | 2596 |
| 1302 | 1472 |
| 1303 | 814 |
| 1304 | 2245 |
| 1305 | 1574 |
| 1306 | 463 |
| 1307 | 2339 |
| 1308 | 1145 |
| 1309 | 631 |
| 1310 | 2109 |
| 1311 | 1303 |
| 1312 | 843 |
| 1313 | 2218 |
| 1314 | 1182 |
| 1315 | 700 |
| 1316 | 2567 |
| 1317 | 1632 |
| 1318 | 492 |
| 1319 | 3090 |
| 1320 | 1356 |
| 1321 | 1223 |
| 1322 | 2330 |
| 1323 | 916 |
| 1324 | 2139 |
| 1325 | 1680 |
| 1326 | 872 |
| 1327 | 2225 |
| 1328 | 1417 |
| 1329 | 729 |
| 1330 | 2626 |
| 1331 | 1197 |
| 1332 | 443 |
| 1333 | 2384 |
| 1334 | 1603 |
| 1335 | 930 |
| 1336 | 2168 |
| 1337 | 1146 |
| 1338 | 741 |
| 1339 | 2341 |
| 1340 | 1252 |
| 1341 | 821 |
| 1342 | 3084 |
| 1343 | 1577 |
| 1344 | 382 |
| 1345 | 2250 |
| 1346 | 1362 |
| 1347 | 845 |
| 1348 | 2571 |
| 1349 | 1203 |

TABLE Q10-continued

| with a sequence length of 4096: | |
| --- | --- |
| Reliability or reliability sequence number | Polarized channel sequence number |
| 1350 | 671 |
| 1351 | 2246 |
| 1352 | 1564 |
| 1353 | 920 |
| 1354 | 2440 |
| 1355 | 1336 |
| 1356 | 498 |
| 1357 | 2110 |
| 1358 | 1198 |
| 1359 | 2600 |
| 1360 | 1605 |
| 1361 | 635 |
| 1362 | 3105 |
| 1363 | 1307 |
| 1364 | 822 |
| 1365 | 2329 |
| 1366 | 1087 |
| 1367 | 730 |
| 1368 | 2220 |
| 1369 | 1414 |
| 1370 | 932 |
| 1371 | 2326 |
| 1372 | 1696 |
| 1373 | 471 |
| 1374 | 2690 |
| 1375 | 1227 |
| 1376 | 851 |
| 1377 | 2151 |
| 1378 | 1377 |
| 1379 | 2257 |
| 1380 | 742 |
| 1381 | 1800 |
| 1382 | 2342 |
| 1383 | 1256 |
| 1384 | 825 |
| 1385 | 3201 |
| 1386 | 1319 |
| 1387 | 500 |
| 1388 | 2628 |
| 1389 | 1578 |
| 1390 | 903 |
| 1391 | 2226 |
| 1392 | 1148 |
| 1393 | 745 |
| 1394 | 2400 |
| 1395 | 1425 |
| 1396 | 2141 |
| 1397 | 880 |
| 1398 | 1585 |
| 1399 | 2579 |
| 1400 | 445 |
| 1401 | 1364 |
| 1402 | 2249 |
| 1403 | 1610 |
| 1404 | 732 |
| 1405 | 3137 |
| 1406 | 1205 |
| 1407 | 962 |
| 1408 | 2448 |
| 1409 | 1309 |
| 1410 | 2155 |
| 1411 | 846 |
| 1412 | 1606 |
| 1413 | 2573 |
| 1414 | 687 |
| 1415 | 1229 |
| 1416 | 2371 |
| 1417 | 255 |
| 1418 | 1418 |
| 1419 | 2191 |
| 1420 | 1667 |
| 1421 | 3092 |
| 1422 | 907 |
| 1423 | 1206 |
| 1424 | 2345 |

TABLE Q10-continued

| with a sequence length of 4096: | |
| --- | --- |
| Reliability or reliability sequence number | Polarized channel sequence number |
| 1425 | 637 |
| 1426 | 1323 |
| 1427 | 2608 |
| 1428 | 853 |
| 1429 | 1580 |
| 1430 | 2228 |
| 1431 | 475 |
| 1432 | 2142 |
| 1433 | 1235 |
| 1434 | 826 |
| 1435 | 2332 |
| 1436 | 1378 |
| 1437 | 1808 |
| 1438 | 2574 |
| 1439 | 746 |
| 1440 | 1119 |
| 1441 | 3106 |
| 1442 | 936 |
| 1443 | 2199 |
| 1444 | 1426 |
| 1445 | 867 |
| 1446 | 2373 |
| 1447 | 1617 |
| 1448 | 504 |
| 1449 | 2252 |
| 1450 | 1209 |
| 1451 | 2632 |
| 1452 | 1368 |
| 1453 | 695 |
| 1454 | 2464 |
| 1455 | 1586 |
| 1456 | 964 |
| 1457 | 2157 |
| 1458 | 1264 |
| 1459 | 3096 |
| 1460 | 854 |
| 1461 | 1310 |
| 1462 | 2818 |
| 1463 | 753 |
| 1464 | 1669 |
| 1465 | 2346 |
| 1466 | 1230 |
| 1467 | 2258 |
| 1468 | 446 |
| 1469 | 1609 |
| 1470 | 2232 |
| 1471 | 915 |
| 1472 | 1420 |
| 1473 | 2692 |
| 1474 | 719 |
| 1475 | 3329 |
| 1476 | 1351 |
| 1477 | 1551 |
| 1478 | 2353 |
| 1479 | 828 |
| 1480 | 1135 |
| 1481 | 2163 |
| 1482 | 909 |
| 1483 | 2378 |
| 1484 | 1325 |
| 1485 | 487 |
| 1486 | 2581 |
| 1487 | 1588 |
| 1488 | 748 |
| 1489 | 2203 |
| 1490 | 1237 |
| 1491 | 3108 |
| 1492 | 1824 |
| 1493 | 857 |
| 1494 | 2374 |
| 1495 | 1441 |
| 1496 | 944 |
| 1497 | 2595 |
| 1498 | 1210 |
| 1499 | 2273 |

TABLE Q10-continued

| with a sequence length of 4096: | |
|---|---|
| Reliability or reliability sequence number | Polarized channel sequence number |
| 1500 | 477 |
| 1501 | 1728 |
| 1502 | 2435 |
| 1503 | 1380 |
| 1504 | 2158 |
| 1505 | 699 |
| 1506 | 1251 |
| 1507 | 2586 |
| 1508 | 869 |
| 1509 | 1559 |
| 1510 | 3079 |
| 1511 | 799 |
| 1512 | 2348 |
| 1513 | 1331 |
| 1514 | 1612 |
| 1515 | 2215 |
| 1516 | 638 |
| 1517 | 2640 |
| 1518 | 1473 |
| 1519 | 910 |
| 1520 | 2385 |
| 1521 | 1238 |
| 1522 | 1673 |
| 1523 | 2260 |
| 1524 | 383 |
| 1525 | 3138 |
| 1526 | 1326 |
| 1527 | 858 |
| 1528 | 2354 |
| 1529 | 1143 |
| 1530 | 2597 |
| 1531 | 754 |
| 1532 | 1618 |
| 1533 | 2165 |
| 1534 | 1355 |
| 1535 | 968 |
| 1536 | 2205 |
| 1537 | 1592 |
| 1538 | 2696 |
| 1539 | 870 |
| 1540 | 1212 |
| 1541 | 3083 |
| 1542 | 491 |
| 1543 | 2437 |
| 1544 | 1428 |
| 1545 | 1920 |
| 1546 | 2219 |
| 1547 | 727 |
| 1548 | 2377 |
| 1549 | 1384 |
| 1550 | 917 |
| 1551 | 2585 |
| 1552 | 1241 |
| 1553 | 2166 |
| 1554 | 1563 |
| 1555 | 873 |
| 1556 | 3112 |
| 1557 | 1442 |
| 1558 | 2319 |
| 1559 | 756 |
| 1560 | 1670 |
| 1561 | 2582 |
| 1562 | 1253 |
| 1563 | 2274 |
| 1564 | 478 |
| 1565 | 1333 |
| 1566 | 2356 |
| 1567 | 931 |
| 1568 | 3202 |
| 1569 | 1633 |
| 1570 | 860 |
| 1571 | 2820 |
| 1572 | 1357 |
| 1573 | 2264 |
| 1574 | 1575 |

TABLE Q10-continued

| with a sequence length of 4096: | |
|---|---|
| Reliability or reliability sequence number | Polarized channel sequence number |
| 1575 | 701 |
| 1576 | 2496 |
| 1577 | 1183 |
| 1578 | 2598 |
| 1579 | 815 |
| 1580 | 1432 |
| 1581 | 2169 |
| 1582 | 1795 |
| 1583 | 3585 |
| 1584 | 874 |
| 1585 | 1147 |
| 1586 | 2327 |
| 1587 | 493 |
| 1588 | 2206 |
| 1589 | 1681 |
| 1590 | 1334 |
| 1591 | 2656 |
| 1592 | 922 |
| 1593 | 2380 |
| 1594 | 1242 |
| 1595 | 731 |
| 1596 | 2247 |
| 1597 | 1620 |
| 1598 | 3140 |
| 1599 | 1444 |
| 1600 | 823 |
| 1601 | 2704 |
| 1602 | 1565 |
| 1603 | 2441 |
| 1604 | 976 |
| 1605 | 1363 |
| 1606 | 2221 |
| 1607 | 1674 |
| 1608 | 2627 |
| 1609 | 760 |
| 1610 | 1254 |
| 1611 | 3091 |
| 1612 | 499 |
| 1613 | 2170 |
| 1614 | 1337 |
| 1615 | 2276 |
| 1616 | 1579 |
| 1617 | 881 |
| 1618 | 2601 |
| 1619 | 1415 |
| 1620 | 2386 |
| 1621 | 933 |
| 1622 | 1797 |
| 1623 | 3085 |
| 1624 | 1257 |
| 1625 | 2227 |
| 1626 | 702 |
| 1627 | 1392 |
| 1628 | 2588 |
| 1629 | 1634 |
| 1630 | 2360 |
| 1631 | 921 |
| 1632 | 2222 |
| 1633 | 1244 |
| 1634 | 494 |
| 1635 | 2629 |
| 1636 | 1682 |
| 1637 | 3120 |
| 1638 | 1474 |
| 1639 | 847 |
| 1640 | 2331 |
| 1641 | 1358 |
| 1642 | 2111 |
| 1643 | 918 |
| 1644 | 2438 |
| 1645 | 1624 |
| 1646 | 1199 |
| 1647 | 2720 |
| 1648 | 743 |
| 1649 | 3086 |

TABLE Q10-continued with a sequence length of 4096:

| Reliability or reliability sequence number | Polarized channel sequence number |
|---|---|
| 1650 | 1566 |
| 1651 | 876 |
| 1652 | 2251 |
| 1653 | 1419 |
| 1654 | 2401 |
| 1655 | 1856 |
| 1656 | 2824 |
| 1657 | 934 |
| 1658 | 1149 |
| 1659 | 2280 |
| 1660 | 1365 |
| 1661 | 3144 |
| 1662 | 733 |
| 1663 | 1676 |
| 1664 | 2343 |
| 1665 | 501 |
| 1666 | 2602 |
| 1667 | 1338 |
| 1668 | 2172 |
| 1669 | 1607 |
| 1670 | 827 |
| 1671 | 2449 |
| 1672 | 1258 |
| 1673 | 3330 |
| 1674 | 1581 |
| 1675 | 2609 |
| 1676 | 992 |
| 1677 | 1448 |
| 1678 | 2388 |
| 1679 | 882 |
| 1680 | 2634 |
| 1681 | 1697 |
| 1682 | 2229 |
| 1683 | 1379 |
| 1684 | 639 |
| 1685 | 2333 |
| 1686 | 1207 |
| 1687 | 3204 |
| 1688 | 1801 |
| 1689 | 2630 |
| 1690 | 963 |
| 1691 | 1476 |
| 1692 | 2253 |
| 1693 | 502 |
| 1694 | 2442 |
| 1695 | 1636 |
| 1696 | 2691 |
| 1697 | 1366 |
| 1698 | 855 |
| 1699 | 3093 |
| 1700 | 1587 |
| 1701 | 2230 |
| 1702 | 1265 |
| 1703 | 2347 |
| 1704 | 937 |
| 1705 | 1427 |
| 1706 | 2604 |
| 1707 | 747 |
| 1708 | 2259 |
| 1709 | 1729 |
| 1710 | 3107 |
| 1711 | 1231 |
| 1712 | 884 |
| 1713 | 2402 |
| 1714 | 1582 |
| 1715 | 2832 |
| 1716 | 1340 |
| 1717 | 2143 |
| 1718 | 924 |
| 1719 | 3098 |
| 1720 | 1798 |
| 1721 | 734 |
| 1722 | 2450 |
| 1723 | 1421 |
| 1724 | 2641 |

TABLE Q10-continued with a sequence length of 4096:

| Reliability or reliability sequence number | Polarized channel sequence number |
|---|---|
| 1725 | 1611 |
| 1726 | 2233 |
| 1727 | 505 |
| 1728 | 1260 |
| 1729 | 2392 |
| 1730 | 1369 |
| 1731 | 3152 |
| 1732 | 965 |
| 1733 | 2610 |
| 1734 | 1684 |
| 1735 | 2288 |
| 1736 | 1456 |
| 1737 | 829 |
| 1738 | 2334 |
| 1739 | 1640 |
| 1740 | 2693 |
| 1741 | 1211 |
| 1742 | 3109 |
| 1743 | 938 |
| 1744 | 1809 |
| 1745 | 2254 |
| 1746 | 749 |
| 1747 | 2633 |
| 1748 | 1381 |
| 1749 | 2444 |
| 1750 | 1698 |
| 1751 | 2375 |
| 1752 | 859 |
| 1753 | 1311 |
| 1754 | 3208 |
| 1755 | 1589 |
| 1756 | 2575 |
| 1757 | 945 |
| 1758 | 2159 |
| 1759 | 1150 |
| 1760 | 2349 |
| 1761 | 1613 |
| 1762 | 506 |
| 1763 | 3097 |
| 1764 | 1422 |
| 1765 | 2612 |
| 1766 | 1370 |
| 1767 | 2261 |
| 1768 | 888 |
| 1769 | 2848 |
| 1770 | 1688 |
| 1771 | 755 |
| 1772 | 2465 |
| 1773 | 1266 |
| 1774 | 3094 |
| 1775 | 1802 |
| 1776 | 2234 |
| 1777 | 970 |
| 1778 | 2752 |
| 1779 | 1480 |
| 1780 | 2404 |
| 1781 | 1590 |
| 1782 | 966 |
| 1783 | 2275 |
| 1784 | 1382 |
| 1785 | 3586 |
| 1786 | 1700 |
| 1787 | 2583 |
| 1788 | 830 |
| 1789 | 2355 |
| 1790 | 1239 |
| 1791 | 1619 |
| 1792 | 2636 |
| 1793 | 940 |
| 1794 | 3332 |
| 1795 | 1429 |
| 1796 | 2497 |
| 1797 | 1810 |
| 1798 | 2262 |
| 1799 | 447 |

TABLE Q10-continued

| with a sequence length of 4096: | |
|---|---|
| Reliability or reliability sequence number | Polarized channel sequence number |
| 1800 | 2697 |
| 1801 | 1385 |
| 1802 | 1593 |
| 1803 | 2350 |
| 1804 | 750 |
| 1805 | 3110 |
| 1806 | 1268 |
| 1807 | 2167 |
| 1808 | 1671 |
| 1809 | 2642 |
| 1810 | 871 |
| 1811 | 2379 |
| 1812 | 1443 |
| 1813 | 3168 |
| 1814 | 1648 |
| 1815 | 977 |
| 1816 | 2616 |
| 1817 | 1372 |
| 1818 | 2236 |
| 1819 | 946 |
| 1820 | 2452 |
| 1821 | 1213 |
| 1822 | 2944 |
| 1823 | 1804 |
| 1824 | 3216 |
| 1825 | 757 |
| 1826 | 2408 |
| 1827 | 1327 |
| 1828 | 1730 |
| 1829 | 2265 |
| 1830 | 861 |
| 1831 | 2587 |
| 1832 | 1386 |
| 1833 | 3139 |
| 1834 | 1614 |
| 1835 | 2466 |
| 1836 | 969 |
| 1837 | 2694 |
| 1838 | 1434 |
| 1839 | 2277 |
| 1840 | 1675 |
| 1841 | 508 |
| 1842 | 3113 |
| 1843 | 1243 |
| 1844 | 2357 |
| 1845 | 1825 |
| 1846 | 2657 |
| 1847 | 875 |
| 1848 | 2381 |
| 1849 | 1335 |
| 1850 | 2599 |
| 1851 | 1621 |
| 1852 | 3100 |
| 1853 | 758 |
| 1854 | 2207 |
| 1855 | 1488 |
| 1856 | 1594 |
| 1857 | 2456 |
| 1858 | 1272 |
| 1859 | 2819 |
| 1860 | 911 |
| 1861 | 3141 |
| 1862 | 1704 |
| 1863 | 2171 |
| 1864 | 1393 |
| 1865 | 2705 |
| 1866 | 948 |
| 1867 | 2358 |
| 1868 | 1921 |
| 1869 | 3232 |
| 1870 | 1445 |
| 1871 | 2266 |
| 1872 | 862 |
| 1873 | 1635 |
| 1874 | 2644 |

TABLE Q10-continued

| with a sequence length of 4096: | |
|---|---|
| Reliability or reliability sequence number | Polarized channel sequence number |
| 1875 | 1214 |
| 1876 | 2468 |
| 1877 | 919 |
| 1878 | 3336 |
| 1879 | 1732 |
| 1880 | 2589 |
| 1881 | 1433 |
| 1882 | 2387 |
| 1883 | 761 |
| 1884 | 2698 |
| 1885 | 1857 |
| 1886 | 3114 |
| 1887 | 1359 |
| 1888 | 2278 |
| 1889 | 479 |
| 1890 | 2361 |
| 1891 | 1622 |
| 1892 | 2603 |
| 1893 | 1430 |
| 1894 | 972 |
| 1895 | 3121 |
| 1896 | 1683 |
| 1897 | 2439 |
| 1898 | 1255 |
| 1899 | 2821 |
| 1900 | 877 |
| 1901 | 2281 |
| 1902 | 1596 |
| 1903 | 3146 |
| 1904 | 1388 |
| 1905 | 2416 |
| 1906 | 978 |
| 1907 | 2658 |
| 1908 | 1812 |
| 1909 | 2268 |
| 1910 | 1446 |
| 1911 | 3588 |
| 1912 | 1245 |
| 1913 | 2706 |
| 1914 | 952 |
| 1915 | 2498 |
| 1916 | 1339 |
| 1917 | 2382 |
| 1918 | 1677 |
| 1919 | 762 |
| 1920 | 3142 |
| 1921 | 1504 |
| 1922 | 2648 |
| 1923 | 1625 |
| 1924 | 2223 |
| 1925 | 883 |
| 1926 | 2590 |
| 1927 | 1394 |
| 1928 | 3203 |
| 1929 | 1826 |
| 1930 | 2443 |
| 1931 | 923 |
| 1932 | 2880 |
| 1933 | 1151 |
| 1934 | 2173 |
| 1935 | 1712 |
| 1936 | 3116 |
| 1937 | 993 |
| 1938 | 2389 |
| 1939 | 1475 |
| 1940 | 2700 |
| 1941 | 1637 |
| 1942 | 2362 |
| 1943 | 1367 |
| 1944 | 3344 |
| 1945 | 495 |
| 1946 | 2631 |
| 1947 | 1567 |
| 1948 | 2282 |
| 1949 | 1449 |

TABLE Q10-continued with a sequence length of 4096:

| Reliability or reliability sequence number | Polarized channel sequence number |
|---|---|
| 1950 | 2605 |
| 1951 | 878 |
| 1952 | 3153 |
| 1953 | 1816 |
| 1954 | 2472 |
| 1955 | 1259 |
| 1956 | 2721 |
| 1957 | 703 |
| 1958 | 2403 |
| 1959 | 1678 |
| 1960 | 3122 |
| 1961 | 1396 |
| 1962 | 2231 |
| 1963 | 935 |
| 1964 | 2825 |
| 1965 | 1626 |
| 1966 | 2500 |
| 1967 | 1436 |
| 1968 | 3205 |
| 1969 | 1828 |
| 1970 | 2660 |
| 1971 | 980 |
| 1972 | 2390 |
| 1973 | 1246 |
| 1974 | 2611 |
| 1975 | 1736 |
| 1976 | 3145 |
| 1977 | 885 |
| 1978 | 2289 |
| 1979 | 1477 |
| 1980 | 2451 |
| 1981 | 1638 |
| 1982 | 2753 |
| 1983 | 1341 |
| 1984 | 3087 |
| 1985 | 925 |
| 1986 | 2255 |
| 1987 | 1799 |
| 1988 | 2606 |
| 1989 | 1450 |
| 1990 | 3124 |
| 1991 | 939 |
| 1992 | 2364 |
| 1993 | 1685 |
| 1994 | 2822 |
| 1995 | 1261 |
| 1996 | 2445 |
| 1997 | 764 |
| 1998 | 3360 |
| 1999 | 1641 |
| 2000 | 2635 |
| 2001 | 1699 |
| 2002 | 2284 |
| 2003 | 1371 |
| 2004 | 2393 |
| 2005 | 503 |
| 2006 | 3592 |
| 2007 | 1858 |
| 2008 | 2708 |
| 2009 | 1457 |
| 2010 | 2480 |
| 2011 | 886 |
| 2012 | 3264 |
| 2013 | 1628 |
| 2014 | 2664 |
| 2015 | 1400 |
| 2016 | 2235 |
| 2017 | 1583 |
| 2018 | 2833 |
| 2019 | 994 |
| 2020 | 3095 |
| 2021 | 1267 |
| 2022 | 2405 |
| 2023 | 1803 |
| 2024 | 2722 |

TABLE Q10-continued with a sequence length of 4096:

| Reliability or reliability sequence number | Polarized channel sequence number |
|---|---|
| 2025 | 984 |
| 2026 | 2335 |
| 2027 | 1482 |
| 2028 | 3148 |
| 2029 | 1642 |
| 2030 | 2613 |
| 2031 | 1478 |
| 2032 | 2174 |
| 2033 | 889 |
| 2034 | 3209 |
| 2035 | 1690 |
| 2036 | 2637 |
| 2037 | 1342 |
| 2038 | 2446 |
| 2039 | 735 |
| 2040 | 2394 |
| 2041 | 1832 |
| 2042 | 3154 |
| 2043 | 1452 |
| 2044 | 2712 |
| 2045 | 1591 |
| 2046 | 2290 |
| 2047 | 926 |
| 2048 | 1262 |
| 2049 | 1744 |
| 2050 | 3128 |
| 2051 | 967 |
| 2052 | 2826 |
| 2053 | 1383 |
| 2054 | 2504 |
| 2055 | 1922 |
| 2056 | 2614 |
| 2057 | 1649 |
| 2058 | 3456 |
| 2059 | 941 |
| 2060 | 2406 |
| 2061 | 1489 |
| 2062 | 2724 |
| 2063 | 1701 |
| 2064 | 3099 |
| 2065 | 890 |
| 2066 | 2263 |
| 2067 | 1458 |
| 2068 | 2643 |
| 2069 | 1860 |
| 2070 | 2453 |
| 2071 | 1269 |
| 2072 | 3206 |
| 2073 | 996 |
| 2074 | 2834 |
| 2075 | 1689 |
| 2076 | 2409 |
| 2077 | 1373 |
| 2078 | 3169 |
| 2079 | 1615 |
| 2080 | 2617 |
| 2081 | 507 |
| 2082 | 2292 |
| 2083 | 1481 |
| 2084 | 2695 |
| 2085 | 1811 |
| 2086 | 3600 |
| 2087 | 947 |
| 2088 | 2467 |
| 2089 | 1686 |
| 2090 | 2672 |
| 2091 | 1387 |
| 2092 | 3111 |
| 2093 | 1644 |
| 2094 | 2396 |
| 2095 | 751 |
| 2096 | 2237 |
| 2097 | 1270 |
| 2098 | 2828 |
| 2099 | 1805 |

TABLE Q10-continued

| with a sequence length of 4096: | |
|---|---|
| Reliability or reliability sequence number | Polarized channel sequence number |
| 2100 | 3331 |
| 2101 | 1423 |
| 2102 | 2351 |
| 2103 | 942 |
| 2104 | 2754 |
| 2105 | 1702 |
| 2106 | 3217 |
| 2107 | 1460 |
| 2108 | 2410 |
| 2109 | 1595 |
| 2110 | 2638 |
| 2111 | 831 |
| 2112 | 2458 |
| 2113 | 1374 |
| 2114 | 3156 |
| 2115 | 1840 |
| 2116 | 2699 |
| 2117 | 971 |
| 2118 | 2267 |
| 2119 | 1760 |
| 2120 | 3101 |
| 2121 | 1431 |
| 2122 | 2849 |
| 2123 | 1650 |
| 2124 | 2359 |
| 2125 | 1000 |
| 2126 | 3210 |
| 2127 | 1273 |
| 2128 | 2645 |
| 2129 | 1806 |
| 2130 | 2512 |
| 2131 | 1484 |
| 2132 | 2618 |
| 2133 | 892 |
| 2134 | 3115 |
| 2135 | 1731 |
| 2136 | 2296 |
| 2137 | 1864 |
| 2138 | 2728 |
| 2139 | 1389 |
| 2140 | 3333 |
| 2141 | 949 |
| 2142 | 2417 |
| 2143 | 1623 |
| 2144 | 2945 |
| 2145 | 1490 |
| 2146 | 3616 |
| 2147 | 1705 |
| 2148 | 2469 |
| 2149 | 759 |
| 2150 | 2659 |
| 2151 | 1464 |
| 2152 | 3170 |
| 2153 | 1924 |
| 2154 | 2238 |
| 2155 | 1274 |
| 2156 | 2756 |
| 2157 | 973 |
| 2158 | 2457 |
| 2159 | 1652 |
| 2160 | 3218 |
| 2161 | 1692 |
| 2162 | 2881 |
| 2163 | 1395 |
| 2164 | 2383 |
| 2165 | 950 |
| 2166 | 3160 |
| 2167 | 1813 |
| 2168 | 2646 |
| 2169 | 1435 |
| 2170 | 2454 |
| 2171 | 1733 |
| 2172 | 3102 |
| 2173 | 509 |
| 2174 | 2707 |

TABLE Q10-continued

| with a sequence length of 4096: | |
|---|---|
| Reliability or reliability sequence number | Polarized channel sequence number |
| 2175 | 2279 |
| 2176 | 1827 |
| 2177 | 3392 |
| 2178 | 1505 |
| 2179 | 2620 |
| 2180 | 1597 |
| 2181 | 2412 |
| 2182 | 979 |
| 2183 | 3212 |
| 2184 | 1390 |
| 2185 | 2836 |
| 2186 | 1706 |
| 2187 | 2470 |
| 2188 | 1215 |
| 2189 | 2269 |
| 2190 | 863 |
| 2191 | 3143 |
| 2192 | 1818 |
| 2193 | 2363 |
| 2194 | 1627 |
| 2195 | 2701 |
| 2196 | 1447 |
| 2197 | 3117 |
| 2198 | 953 |
| 2199 | 2528 |
| 2200 | 1713 |
| 2201 | 2649 |
| 2202 | 3712 |
| 2203 | 1492 |
| 2204 | 2418 |
| 2205 | 1872 |
| 2206 | 2850 |
| 2207 | 1008 |
| 2208 | 3233 |
| 2209 | 1656 |
| 2210 | 2175 |
| 2211 | 1397 |
| 2212 | 2736 |
| 2213 | 1829 |
| 2214 | 3337 |
| 2215 | 763 |
| 2216 | 2499 |
| 2217 | 1437 |
| 2218 | 2661 |
| 2219 | 1738 |
| 2220 | 3172 |
| 2221 | 1451 |
| 2222 | 2391 |
| 2223 | 2591 |
| 2224 | 974 |
| 2225 | 3123 |
| 2226 | 1734 |
| 2227 | 2473 |
| 2228 | 1928 |
| 2229 | 2840 |
| 2230 | 1276 |
| 2231 | 3265 |
| 2232 | 879 |
| 2233 | 2283 |
| 2234 | 1598 |
| 2235 | 2702 |
| 2236 | 1398 |
| 2237 | 2420 |
| 2238 | 1817 |
| 2239 | 3118 |
| 2240 | 2650 |
| 2241 | 1708 |
| 2242 | 2460 |
| 2243 | 981 |
| 2244 | 3334 |
| 2245 | 1506 |
| 2246 | 2852 |
| 2247 | 1814 |
| 2248 | 2270 |
| 2249 | 1496 |

TABLE Q10-continued

| with a sequence length of 4096: | |
|---|---|
| Reliability or reliability sequence number | Polarized channel sequence number |
| 2250 | 3840 |
| 2251 | 954 |
| 2252 | 2760 |
| 2253 | 1639 |
| 2254 | 2501 |
| 2255 | 3147 |
| 2256 | 1745 |
| 2257 | 2662 |
| 2258 | 1401 |
| 2259 | 2365 |
| 2260 | 995 |
| 2261 | 3220 |
| 2262 | 1830 |
| 2263 | 2823 |
| 2264 | 1714 |
| 2265 | 2474 |
| 2266 | 1247 |
| 2267 | 3176 |
| 2268 | 2709 |
| 2269 | 982 |
| 2270 | 2285 |
| 2271 | 1888 |
| 2272 | 3345 |
| 2273 | 1438 |
| 2274 | 2665 |
| 2275 | 1629 |
| 2276 | 2723 |
| 2277 | 1737 |
| 2278 | 3234 |
| 2279 | 887 |
| 2280 | 2395 |
| 2281 | 3125 |
| 2282 | 1479 |
| 2283 | 2882 |
| 2284 | 1936 |
| 2285 | 2481 |
| 2286 | 1453 |
| 2287 | 3149 |
| 2288 | 956 |
| 2289 | 2652 |
| 2290 | 1643 |
| 2291 | 2424 |
| 2292 | 1859 |
| 2293 | 3587 |
| 2294 | 2607 |
| 2295 | 1402 |
| 2296 | 2291 |
| 2297 | 1679 |
| 2298 | 3224 |
| 2299 | 510 |
| 2300 | 2827 |
| 2301 | 1833 |
| 2302 | 2506 |
| 2303 | 3338 |
| 2304 | 1508 |
| 2305 | 2666 |
| 2306 | 1716 |
| 2307 | 2502 |
| 2308 | 765 |
| 2309 | 3126 |
| 2310 | 1459 |
| 2311 | 2714 |
| 2312 | 1630 |
| 2313 | 2366 |
| 2314 | 3236 |
| 2315 | 1820 |
| 2316 | 2856 |
| 2317 | 1263 |
| 2318 | 2476 |
| 2319 | 985 |
| 2320 | 3155 |
| 2321 | 1687 |
| 2322 | 2615 |
| 2323 | 1861 |
| 2324 | 2286 |

TABLE Q10-continued

| with a sequence length of 4096: | |
|---|---|
| Reliability or reliability sequence number | Polarized channel sequence number |
| 2325 | 3346 |
| 2326 | 1454 |
| 2327 | 2768 |
| 2328 | 1740 |
| 2329 | 3589 |
| 2330 | 997 |
| 2331 | 2407 |
| 2332 | 1343 |
| 2333 | 2946 |
| 2334 | 3129 |
| 2335 | 1952 |
| 2336 | 2673 |
| 2337 | 1645 |
| 2338 | 2513 |
| 2339 | 927 |
| 2340 | 3207 |
| 2341 | 1483 |
| 2342 | 2725 |
| 2343 | 2482 |
| 2344 | 1834 |
| 2345 | 3184 |
| 2346 | 1746 |
| 2347 | 2884 |
| 2348 | 1512 |
| 2349 | 2293 |
| 2350 | 891 |
| 2351 | 3340 |
| 2352 | 2713 |
| 2353 | 1720 |
| 2354 | 2397 |
| 2355 | 1841 |
| 2356 | 3266 |
| 2357 | 1404 |
| 2358 | 2639 |
| 2359 | 3150 |
| 2360 | 1651 |
| 2361 | 2505 |
| 2362 | 986 |
| 2363 | 2835 |
| 2364 | 1461 |
| 2365 | 3648 |
| 2366 | 1866 |
| 2367 | 2710 |
| 2368 | 2411 |
| 2369 | 1691 |
| 2370 | 3211 |
| 2371 | 1271 |
| 2372 | 2668 |
| 2373 | 998 |
| 2374 | 2294 |
| 2375 | 3361 |
| 2376 | 1862 |
| 2377 | 2829 |
| 2378 | 1761 |
| 2379 | 3157 |
| 2380 | 1485 |
| 2381 | 2447 |
| 2382 | 1923 |
| 2383 | 2726 |
| 2384 | 3130 |
| 2385 | 1001 |
| 2386 | 2484 |
| 2387 | 1646 |
| 2388 | 2619 |
| 2389 | 1462 |
| 2390 | 3240 |
| 2391 | 2398 |
| 2392 | 1836 |
| 2393 | 3457 |
| 2394 | 988 |
| 2395 | 2864 |
| 2396 | 1703 |
| 2397 | 2784 |
| 2398 | 3593 |
| 2399 | 1491 |

TABLE Q10-continued with a sequence length of 4096:

| Reliability or reliability sequence number | Polarized channel sequence number |
|---|---|
| 2400 | 2455 |
| 2401 | 1873 |
| 2402 | 2674 |
| 2403 | 1748 |
| 2404 | 3171 |
| 2405 | 2297 |
| 2406 | 943 |
| 2407 | 3268 |
| 2408 | 1375 |
| 2409 | 2830 |
| 2410 | 1842 |
| 2411 | 2508 |
| 2412 | 3393 |
| 2413 | 1653 |
| 2414 | 2755 |
| 2415 | 1465 |
| 2416 | 2888 |
| 2417 | 1693 |
| 2418 | 3158 |
| 2419 | 2413 |
| 2420 | 766 |
| 2421 | 3219 |
| 2422 | 1520 |
| 2423 | 2647 |
| 2424 | 1925 |
| 2425 | 2514 |
| 2426 | 3590 |
| 2427 | 1707 |
| 2428 | 2729 |
| 2429 | 1275 |
| 2430 | 2488 |
| 2431 | 3132 |
| 2432 | 893 |
| 2433 | 2948 |
| 2434 | 1865 |
| 2435 | 3348 |
| 2436 | 1654 |
| 2437 | 2298 |
| 2438 | 2676 |
| 2439 | 1486 |
| 2440 | 3213 |
| 2441 | 1807 |
| 2442 | 2716 |
| 2443 | 1002 |
| 2444 | 2419 |
| 2445 | 3161 |
| 2446 | 1762 |
| 2447 | 2837 |
| 2448 | 1844 |
| 2449 | 3362 |
| 2450 | 2459 |
| 2451 | 1391 |
| 2452 | 2757 |
| 2453 | 1752 |
| 2454 | 3248 |
| 2455 | 951 |
| 2456 | 2851 |
| 2457 | 3601 |
| 2458 | 1984 |
| 2459 | 2529 |
| 2460 | 1493 |
| 2461 | 2621 |
| 2462 | 3173 |
| 2463 | 1657 |
| 2464 | 2414 |
| 2465 | 1815 |
| 2466 | 2730 |
| 2467 | 1466 |
| 2468 | 3103 |
| 2469 | 2239 |
| 2470 | 1009 |
| 2471 | 3352 |
| 2472 | 1694 |
| 2473 | 2842 |
| 2474 | 2651 |

TABLE Q10-continued with a sequence length of 4096:

| Reliability or reliability sequence number | Polarized channel sequence number |
|---|---|
| 2475 | 1868 |
| 2476 | 3214 |
| 2477 | 1507 |
| 2478 | 2471 |
| 2479 | 3162 |
| 2480 | 1735 |
| 2481 | 2737 |
| 2482 | 975 |
| 2483 | 2516 |
| 2484 | 1929 |
| 2485 | 3594 |
| 2486 | 2896 |
| 2487 | 1494 |
| 2488 | 3364 |
| 2489 | 1709 |
| 2490 | 2680 |
| 2491 | 2421 |
| 2492 | 1658 |
| 2493 | 3272 |
| 2494 | 1004 |
| 2495 | 2853 |
| 2496 | 3174 |
| 2497 | 1399 |
| 2498 | 2461 |
| 2499 | 1764 |
| 2500 | 2762 |
| 2501 | 3335 |
| 2502 | 1874 |
| 2503 | 2475 |
| 2504 | 1468 |
| 2505 | 3602 |
| 2506 | 2758 |
| 2507 | 1715 |
| 2508 | 2952 |
| 2509 | 511 |
| 2510 | 3221 |
| 2511 | 2300 |
| 2512 | 1848 |
| 2513 | 3177 |
| 2514 | 1710 |
| 2515 | 2622 |
| 2516 | 2422 |
| 2517 | 1277 |
| 2518 | 3235 |
| 2519 | 1819 |
| 2520 | 2841 |
| 2521 | 3394 |
| 2522 | 1599 |
| 2523 | 2732 |
| 2524 | 955 |
| 2525 | 2530 |
| 2526 | 3164 |
| 2527 | 1497 |
| 2528 | 2838 |
| 2529 | 1926 |
| 2530 | 3596 |
| 2531 | 2520 |
| 2532 | 1739 |
| 2533 | 3119 |
| 2534 | 1509 |
| 2535 | 2663 |
| 2536 | 2769 |
| 2537 | 1889 |
| 2538 | 3339 |
| 2539 | 894 |
| 2540 | 2425 |
| 2541 | 3178 |
| 2542 | 1768 |
| 2543 | 2854 |
| 2544 | 1831 |
| 2545 | 2738 |
| 2546 | 3226 |
| 2547 | 1439 |
| 2548 | 2271 |
| 2549 | 1660 |

TABLE Q10-continued

| with a sequence length of 4096: | |
|---|---|
| Reliability or reliability sequence number | Polarized channel sequence number |
| 2550 | 3617 |
| 2551 | 2912 |
| 2552 | 1010 |
| 2553 | 2462 |
| 2554 | 1937 |
| 2555 | 3368 |
| 2556 | 2653 |
| 2557 | 1403 |
| 2558 | 3127 |
| 2559 | 2761 |
| 2560 | 1876 |
| 2561 | 3280 |
| 2562 | 1717 |
| 2563 | 2503 |
| 2564 | 2960 |
| 2565 | 1498 |
| 2566 | 3458 |
| 2567 | 983 |
| 2568 | 2477 |
| 2569 | 3713 |
| 2570 | 1821 |
| 2571 | 2667 |
| 2572 | 1741 |
| 2573 | 2883 |
| 2574 | 3185 |
| 2575 | 1930 |
| 2576 | 2426 |
| 2577 | 3237 |
| 2578 | 1510 |
| 2579 | 2703 |
| 2580 | 1718 |
| 2581 | 3396 |
| 2582 | 2857 |
| 2583 | 1012 |
| 2584 | 2532 |
| 2585 | 1835 |
| 2586 | 3225 |
| 2587 | 2740 |
| 2588 | 1513 |
| 2589 | 3151 |
| 2590 | 2483 |
| 2591 | 1747 |
| 2592 | 3649 |
| 2593 | 1890 |
| 2594 | 2654 |
| 2595 | 2844 |
| 2596 | 1631 |
| 2597 | 3347 |
| 2598 | 1500 |
| 2599 | 2287 |
| 2600 | 3222 |
| 2601 | 957 |
| 2602 | 2711 |
| 2603 | 3180 |
| 2604 | 1938 |
| 2605 | 2885 |
| 2606 | 1721 |
| 2607 | 2478 |
| 2608 | 3604 |
| 2609 | 1455 |
| 2610 | 2764 |
| 2611 | 3341 |
| 2612 | 1880 |
| 2613 | 2367 |
| 2614 | 1776 |
| 2615 | 3238 |
| 2616 | 2976 |
| 2617 | 767 |
| 2618 | 3131 |
| 2619 | 2669 |
| 2620 | 1822 |
| 2621 | 2507 |
| 2622 | 1278 |
| 2623 | 3376 |
| 2624 | 2858 |

TABLE Q10-continued

| with a sequence length of 4096: | |
|---|---|
| Reliability or reliability sequence number | Polarized channel sequence number |
| 2625 | 1742 |
| 2626 | 3618 |
| 2627 | 2770 |
| 2628 | 1932 |
| 2629 | 3296 |
| 2630 | 1863 |
| 2631 | 2536 |
| 2632 | 2744 |
| 2633 | 987 |
| 2634 | 3186 |
| 2635 | 2865 |
| 2636 | 1405 |
| 2637 | 3342 |
| 2638 | 1647 |
| 2639 | 2428 |
| 2640 | 3267 |
| 2641 | 1837 |
| 2642 | 2675 |
| 2643 | 3608 |
| 2644 | 1749 |
| 2645 | 2485 |
| 2646 | 1514 |
| 2647 | 2890 |
| 2648 | 3400 |
| 2649 | 1953 |
| 2650 | 2715 |
| 2651 | 3159 |
| 2652 | 1016 |
| 2653 | 2295 |
| 2654 | 1722 |
| 2655 | 3241 |
| 2656 | 2886 |
| 2657 | 1463 |
| 2658 | 3460 |
| 2659 | 2785 |
| 2660 | 1892 |
| 2661 | 2509 |
| 2662 | 3841 |
| 2663 | 1763 |
| 2664 | 2947 |
| 2665 | 1843 |
| 2666 | 3188 |
| 2667 | 2670 |
| 2668 | 1521 |
| 2669 | 3228 |
| 2670 | 2486 |
| 2671 | 958 |
| 2672 | 3349 |
| 2673 | 2860 |
| 2674 | 1985 |
| 2675 | 2727 |
| 2676 | 1750 |
| 2677 | 3620 |
| 2678 | 2515 |
| 2679 | 1838 |
| 2680 | 3269 |
| 2681 | 2897 |
| 2682 | 1487 |
| 2683 | 3363 |
| 2684 | 2772 |
| 2685 | 1655 |
| 2686 | 3133 |
| 2687 | 2399 |
| 2688 | 999 |
| 2689 | 3242 |
| 2690 | 1867 |
| 2691 | 2866 |
| 2692 | 3591 |
| 2693 | 1724 |
| 2694 | 2677 |
| 2695 | 2489 |
| 2696 | 1516 |
| 2697 | 3354 |
| 2698 | 2717 |
| 2699 | 1940 |

TABLE Q10-continued

| with a sequence length of 4096: | |
|---|---|
| Reliability or reliability sequence number | Polarized channel sequence number |
| 2700 | 3163 |
| 2701 | 1896 |
| 2702 | 2544 |
| 2703 | 3249 |
| 2704 | 1753 |
| 2705 | 2949 |
| 2706 | 3650 |
| 2707 | 1467 |
| 2708 | 2731 |
| 2709 | 3408 |
| 2710 | 989 |
| 2711 | 2299 |
| 2712 | 3192 |
| 2713 | 1954 |
| 2714 | 2889 |
| 2715 | 2678 |
| 2716 | 1765 |
| 2717 | 3365 |
| 2718 | 1845 |
| 2719 | 2510 |
| 2720 | 3274 |
| 2721 | 1406 |
| 2722 | 2831 |
| 2723 | 3595 |
| 2724 | 1869 |
| 2725 | 2786 |
| 2726 | 3270 |
| 2727 | 1695 |
| 2728 | 2868 |
| 2729 | 3464 |
| 2730 | 895 |
| 2731 | 2415 |
| 2732 | 3134 |
| 2733 | 1944 |
| 2734 | 2776 |
| 2735 | 3624 |
| 2736 | 1522 |
| 2737 | 3008 |
| 2738 | 1659 |
| 2739 | 2517 |
| 2740 | 3353 |
| 2741 | 1846 |
| 2742 | 2681 |
| 2743 | 3244 |
| 2744 | 1754 |
| 2745 | 2839 |
| 2746 | 3350 |
| 2747 | 1956 |
| 2748 | 2490 |
| 2749 | 3714 |
| 2750 | 1003 |
| 2751 | 2718 |
| 2752 | 3175 |
| 2753 | 1495 |
| 2754 | 2892 |
| 2755 | 3281 |
| 2756 | 1875 |
| 2757 | 2531 |
| 2758 | 3366 |
| 2759 | 1766 |
| 2760 | 2759 |
| 2761 | 3652 |
| 2762 | 1849 |
| 2763 | 2953 |
| 2764 | 3250 |
| 2765 | 1524 |
| 2766 | 2518 |
| 2767 | 3424 |
| 2768 | 1927 |
| 2769 | 2733 |
| 2770 | 3165 |
| 2771 | 1769 |
| 2772 | 2682 |
| 2773 | 990 |
| 2774 | 2423 |

TABLE Q10-continued

| with a sequence length of 4096: | |
|---|---|
| Reliability or reliability sequence number | Polarized channel sequence number |
| 2775 | 3603 |
| 2776 | 1904 |
| 2777 | 2788 |
| 2778 | 3273 |
| 2779 | 1469 |
| 2780 | 2898 |
| 2781 | 3472 |
| 2782 | 1756 |
| 2783 | 2492 |
| 2784 | 3179 |
| 2785 | 1986 |
| 2786 | 2739 |
| 2787 | 3597 |
| 2788 | 1870 |
| 2789 | 2872 |
| 2790 | 3395 |
| 2791 | 1711 |
| 2792 | 2734 |
| 2793 | 3215 |
| 2794 | 1279 |
| 2795 | 2301 |
| 2796 | 3369 |
| 2797 | 1005 |
| 2798 | 2843 |
| 2799 | 3632 |
| 2800 | 1931 |
| 2801 | 2623 |
| 2802 | 3252 |
| 2803 | 1661 |
| 2804 | 2521 |
| 2805 | 3166 |
| 2806 | 1877 |
| 2807 | 2950 |
| 2808 | 3356 |
| 2809 | 1499 |
| 2810 | 2763 |
| 2811 | 3598 |
| 2812 | 1850 |
| 2813 | 2533 |
| 2814 | 3223 |
| 2815 | 2913 |
| 2816 | 1770 |
| 2817 | 3397 |
| 2818 | 2792 |
| 2819 | 1960 |
| 2820 | 3276 |
| 2821 | 2855 |
| 2822 | 1011 |
| 2823 | 3656 |
| 2824 | 2463 |
| 2825 | 1891 |
| 2826 | 3488 |
| 2827 | 2684 |
| 2828 | 1528 |
| 2829 | 3181 |
| 2830 | 2961 |
| 2831 | 1719 |
| 2832 | 3842 |
| 2833 | 2427 |
| 2834 | 1988 |
| 2835 | 3370 |
| 2836 | 2900 |
| 2837 | 1878 |
| 2838 | 3282 |
| 2839 | 2741 |
| 2840 | 1777 |
| 2841 | 3256 |
| 2842 | 2522 |
| 2843 | 1470 |
| 2844 | 3716 |
| 2845 | 2845 |
| 2846 | 1006 |
| 2847 | 3377 |
| 2848 | 2765 |
| 2849 | 1939 |

TABLE Q10-continued with a sequence length of 4096:

| Reliability or reliability sequence number | Polarized channel sequence number |
|---|---|
| 2850 | 3187 |
| 2851 | 2954 |
| 2852 | 3402 |
| 2853 | 1743 |
| 2854 | 2534 |
| 2855 | 3605 |
| 2856 | 1852 |
| 2857 | 2742 |
| 2858 | 3227 |
| 2859 | 1933 |
| 2860 | 2859 |
| 2861 | 3398 |
| 2862 | 1511 |
| 2863 | 2537 |
| 2864 | 3619 |
| 2865 | 1772 |
| 2866 | 2771 |
| 2867 | 3297 |
| 2868 | 1881 |
| 2869 | 2914 |
| 2870 | 2655 |
| 2871 | 2524 |
| 2872 | 1968 |
| 2873 | 3459 |
| 2874 | 2962 |
| 2875 | 1013 |
| 2876 | 3182 |
| 2877 | 2745 |
| 2878 | 1501 |
| 2879 | 3610 |
| 2880 | 2479 |
| 2881 | 1723 |
| 2882 | 3372 |
| 2883 | 2904 |
| 2884 | 1893 |
| 2885 | 3239 |
| 2886 | 2800 |
| 2887 | 3664 |
| 2888 | 1823 |
| 2889 | 2846 |
| 2890 | 3409 |
| 2891 | 1662 |
| 2892 | 2302 |
| 2893 | 3284 |
| 2894 | 1934 |
| 2895 | 2766 |
| 2896 | 3378 |
| 2897 | 1407 |
| 2898 | 2956 |
| 2899 | 3621 |
| 2900 | 1882 |
| 2901 | 2887 |
| 2902 | 3189 |
| 2903 | 2429 |
| 2904 | 1014 |
| 2905 | 3229 |
| 2906 | 2671 |
| 2907 | 1778 |
| 2908 | 3720 |
| 2909 | 2861 |
| 2910 | 1992 |
| 2911 | 3461 |
| 2912 | 2773 |
| 2913 | 3243 |
| 2914 | 1894 |
| 2915 | 2538 |
| 2916 | 3401 |
| 2917 | 1515 |
| 2918 | 2977 |
| 2919 | 3609 |
| 2920 | 1751 |
| 2921 | 2746 |
| 2922 | 3190 |
| 2923 | 1941 |
| 2924 | 2487 |
| 2925 | 3343 |
| 2926 | 2916 |
| 2927 | 1897 |
| 2928 | 3606 |
| 2929 | 2787 |
| 2930 | 1780 |
| 2931 | 3298 |
| 2932 | 2867 |
| 2933 | 1017 |
| 2934 | 3380 |
| 2935 | 2545 |
| 2936 | 3844 |
| 2937 | 1502 |
| 2938 | 3009 |
| 2939 | 3288 |
| 2940 | 1955 |
| 2941 | 2774 |
| 2942 | 3520 |
| 2943 | 2862 |
| 2944 | 1884 |
| 2945 | 3622 |
| 2946 | 2511 |
| 2947 | 1725 |
| 2948 | 3193 |
| 2949 | 2679 |
| 2950 | 1839 |
| 2951 | 3351 |
| 2952 | 2891 |
| 2953 | 3230 |
| 2954 | 1898 |
| 2955 | 2748 |
| 2956 | 3680 |
| 2957 | 1517 |
| 2958 | 2540 |
| 2959 | 3404 |
| 2960 | 1946 |
| 2961 | 3271 |
| 2962 | 2964 |
| 2963 | 3728 |
| 2964 | 1755 |
| 2965 | 2920 |
| 2966 | 3465 |
| 2967 | 1018 |
| 2968 | 2777 |
| 2969 | 3245 |
| 2970 | 2491 |
| 2971 | 1847 |
| 2972 | 3651 |
| 2973 | 2978 |
| 2974 | 2000 |
| 2975 | 3194 |
| 2976 | 2789 |
| 2977 | 3300 |
| 2978 | 1784 |
| 2979 | 2869 |
| 2980 | 3625 |
| 2981 | 1523 |
| 2982 | 2430 |
| 2983 | 3410 |
| 2984 | 2893 |
| 2985 | 1905 |
| 2986 | 3251 |
| 2987 | 2719 |
| 2988 | 1957 |
| 2989 | 3612 |
| 2990 | 2968 |
| 2991 | 3384 |
| 2992 | 1726 |
| 2993 | 2546 |
| 2994 | 3246 |
| 2995 | 1945 |
| 2996 | 3653 |
| 2997 | 2683 |
| 2998 | 3355 |
| 2999 | 1518 |

TABLE Q10-continued

| with a sequence length of 4096: | |
|---|---|
| Reliability or reliability sequence number | Polarized channel sequence number |
| 3000 | 2870 |
| 3001 | 3135 |
| 3002 | 959 |
| 3003 | 2778 |
| 3004 | 3462 |
| 3005 | 2980 |
| 3006 | 1871 |
| 3007 | 3744 |
| 3008 | 2519 |
| 3009 | 1942 |
| 3010 | 3275 |
| 3011 | 2899 |
| 3012 | 3425 |
| 3013 | 1767 |
| 3014 | 2790 |
| 3015 | 3848 |
| 3016 | 1900 |
| 3017 | 3304 |
| 3018 | 2873 |
| 3019 | 3367 |
| 3020 | 1958 |
| 3021 | 2548 |
| 3022 | 3626 |
| 3023 | 2951 |
| 3024 | 1757 |
| 3025 | 3196 |
| 3026 | 2793 |
| 3027 | 1525 |
| 3028 | 3473 |
| 3029 | 2928 |
| 3030 | 3633 |
| 3031 | 1851 |
| 3032 | 2493 |
| 3033 | 3412 |
| 3034 | 2016 |
| 3035 | 3658 |
| 3036 | 2780 |
| 3037 | 3253 |
| 3038 | 1906 |
| 3039 | 3010 |
| 3040 | 3357 |
| 3041 | 2894 |
| 3042 | 1020 |
| 3043 | 3654 |
| 3044 | 2735 |
| 3045 | 1663 |
| 3046 | 3277 |
| 3047 | 2303 |
| 3048 | 3466 |
| 3049 | 1987 |
| 3050 | 3715 |
| 3051 | 2955 |
| 3052 | 3254 |
| 3053 | 1526 |
| 3054 | 2685 |
| 3055 | 3371 |
| 3056 | 2901 |
| 3057 | 1879 |
| 3058 | 3628 |
| 3059 | 2523 |
| 3060 | 1961 |
| 3061 | 3283 |
| 3062 | 2874 |
| 3063 | 3426 |
| 3064 | 1771 |
| 3065 | 3856 |
| 3066 | 2794 |
| 3067 | 3167 |
| 3068 | 1908 |
| 3069 | 2984 |
| 3070 | 3474 |
| 3071 | 2915 |
| 3072 | 1948 |
| 3073 | 3665 |
| 3074 | 2552 |

TABLE Q10-continued

| with a sequence length of 4096: | |
|---|---|
| Reliability or reliability sequence number | Polarized channel sequence number |
| 3075 | 1758 |
| 3076 | 3257 |
| 3077 | 3416 |
| 3078 | 2743 |
| 3079 | 1529 |
| 3080 | 3634 |
| 3081 | 3012 |
| 3082 | 3312 |
| 3083 | 991 |
| 3084 | 2902 |
| 3085 | 3358 |
| 3086 | 2801 |
| 3087 | 1989 |
| 3088 | 3717 |
| 3089 | 3278 |
| 3090 | 1853 |
| 3091 | 2494 |
| 3092 | 3657 |
| 3093 | 2963 |
| 3094 | 1962 |
| 3095 | 3468 |
| 3096 | 2767 |
| 3097 | 3399 |
| 3098 | 1773 |
| 3099 | 3599 |
| 3100 | 2876 |
| 3101 | 3183 |
| 3102 | 1883 |
| 3103 | 2957 |
| 3104 | 3373 |
| 3105 | 2535 |
| 3106 | 1969 |
| 3107 | 3636 |
| 3108 | 2796 |
| 3109 | 3285 |
| 3110 | 1530 |
| 3111 | 3872 |
| 3112 | 2905 |
| 3113 | 3489 |
| 3114 | 1912 |
| 3115 | 2992 |
| 3116 | 3258 |
| 3117 | 2525 |
| 3118 | 1779 |
| 3119 | 3776 |
| 3120 | 3428 |
| 3121 | 2747 |
| 3122 | 1994 |
| 3123 | 3299 |
| 3124 | 2917 |
| 3125 | 3607 |
| 3126 | 1990 |
| 3127 | 2847 |
| 3128 | 3379 |
| 3129 | 3660 |
| 3130 | 1854 |
| 3131 | 2686 |
| 3132 | 3521 |
| 3133 | 2958 |
| 3134 | 1007 |
| 3135 | 3286 |
| 3136 | 3721 |
| 3137 | 2431 |
| 3138 | 1964 |
| 3139 | 3374 |
| 3140 | 2906 |
| 3141 | 3191 |
| 3142 | 1471 |
| 3143 | 2802 |
| 3144 | 3666 |
| 3145 | 3403 |
| 3146 | 1774 |
| 3147 | 3016 |
| 3148 | 3640 |
| 3149 | 2918 |

TABLE Q10-continued

| with a sequence length of 4096: | |
|---|---|
| Reliability or reliability sequence number | Polarized channel sequence number |
| 3150 | 1895 |
| 3151 | 3260 |
| 3152 | 2539 |
| 3153 | 3476 |
| 3154 | 2001 |
| 3155 | 3968 |
| 3156 | 2775 |
| 3157 | 3432 |
| 3158 | 1970 |
| 3159 | 2965 |
| 3160 | 3289 |
| 3161 | 3611 |
| 3162 | 1781 |
| 3163 | 2921 |
| 3164 | 3490 |
| 3165 | 2804 |
| 3166 | 1885 |
| 3167 | 3718 |
| 3168 | 3301 |
| 3169 | 2526 |
| 3170 | 1993 |
| 3171 | 3381 |
| 3172 | 2979 |
| 3173 | 3681 |
| 3174 | 1532 |
| 3175 | 2908 |
| 3176 | 3405 |
| 3177 | 3623 |
| 3178 | 1899 |
| 3179 | 2749 |
| 3180 | 3231 |
| 3181 | 2863 |
| 3182 | 3480 |
| 3183 | 1782 |
| 3184 | 3843 |
| 3185 | 2922 |
| 3186 | 3195 |
| 3187 | 1015 |
| 3188 | 2541 |
| 3189 | 3729 |
| 3190 | 3382 |
| 3191 | 1935 |
| 3192 | 2970 |
| 3193 | 3290 |
| 3194 | 2779 |
| 3195 | 1972 |
| 3196 | 3668 |
| 3197 | 3492 |
| 3198 | 2871 |
| 3199 | 3613 |
| 3200 | 1886 |
| 3201 | 3024 |
| 3202 | 3411 |
| 3203 | 3722 |
| 3204 | 1943 |
| 3205 | 2808 |
| 3206 | 3302 |
| 3207 | 2547 |
| 3208 | 1785 |
| 3209 | 3385 |
| 3210 | 3627 |
| 3211 | 2929 |
| 3212 | 1503 |
| 3213 | 3463 |
| 3214 | 2981 |
| 3215 | 3845 |
| 3216 | 3305 |
| 3217 | 1996 |
| 3218 | 2750 |
| 3219 | 3440 |
| 3220 | 3682 |
| 3221 | 1901 |
| 3222 | 2969 |
| 3223 | 3292 |
| 3224 | 2542 |

TABLE Q10-continued

| with a sequence length of 4096: | |
|---|---|
| Reliability or reliability sequence number | Polarized channel sequence number |
| 3225 | 2002 |
| 3226 | 3730 |
| 3227 | 3522 |
| 3228 | 2895 |
| 3229 | 3406 |
| 3230 | 1976 |
| 3231 | 2966 |
| 3232 | 3672 |
| 3233 | 3247 |
| 3234 | 1786 |
| 3235 | 2791 |
| 3236 | 3614 |
| 3237 | 2924 |
| 3238 | 3467 |
| 3239 | 1907 |
| 3240 | 3904 |
| 3241 | 2982 |
| 3242 | 3197 |
| 3243 | 1947 |
| 3244 | 3413 |
| 3245 | 2781 |
| 3246 | 3724 |
| 3247 | 2549 |
| 3248 | 2017 |
| 3249 | 3386 |
| 3250 | 3655 |
| 3251 | 2875 |
| 3252 | 1019 |
| 3253 | 3306 |
| 3254 | 3629 |
| 3255 | 3040 |
| 3256 | 3496 |
| 3257 | 1519 |
| 3258 | 2930 |
| 3259 | 3745 |
| 3260 | 3427 |
| 3261 | 1902 |
| 3262 | 2687 |
| 3263 | 3255 |
| 3264 | 3849 |
| 3265 | 3011 |
| 3266 | 1727 |
| 3267 | 3524 |
| 3268 | 2550 |
| 3269 | 3684 |
| 3270 | 1959 |
| 3271 | 3414 |
| 3272 | 2903 |
| 3273 | 3635 |
| 3274 | 3313 |
| 3275 | 2004 |
| 3276 | 2985 |
| 3277 | 3475 |
| 3278 | 2795 |
| 3279 | 3777 |
| 3280 | 1909 |
| 3281 | 3279 |
| 3282 | 2932 |
| 3283 | 3630 |
| 3284 | 1949 |
| 3285 | 3388 |
| 3286 | 2972 |
| 3287 | 3846 |
| 3288 | 2782 |
| 3289 | 1963 |
| 3290 | 3469 |
| 3291 | 3659 |
| 3292 | 2553 |
| 3293 | 3308 |
| 3294 | 1788 |
| 3295 | 3417 |
| 3296 | 3013 |
| 3297 | 3732 |
| 3298 | 1527 |
| 3299 | 3504 |

TABLE Q10-continued

| with a sequence length of 4096: | |
|---|---|
| Reliability or reliability sequence number | Polarized channel sequence number |
| 3300 | 2877 |
| 3301 | 3688 |
| 3302 | 3259 |
| 3303 | 1910 |
| 3304 | 2986 |
| 3305 | 3857 |
| 3306 | 2797 |
| 3307 | 3429 |
| 3308 | 2018 |
| 3309 | 3746 |
| 3310 | 2907 |
| 3311 | 3359 |
| 3312 | 3637 |
| 3313 | 2008 |
| 3314 | 2993 |
| 3315 | 3198 |
| 3316 | 3661 |
| 3317 | 2554 |
| 3318 | 1913 |
| 3319 | 3470 |
| 3320 | 3418 |
| 3321 | 2936 |
| 3322 | 3736 |
| 3323 | 1759 |
| 3324 | 2803 |
| 3325 | 3314 |
| 3326 | 3850 |
| 3327 | 3018 |
| 3328 | 1021 |
| 3329 | 3528 |
| 3330 | 3638 |
| 3331 | 3014 |
| 3332 | 1950 |
| 3333 | 3430 |
| 3334 | 3748 |
| 3335 | 2878 |
| 3336 | 3287 |
| 3337 | 1991 |
| 3338 | 3667 |
| 3339 | 2988 |
| 3340 | 3477 |
| 3341 | 3858 |
| 3342 | 1965 |
| 3343 | 2495 |
| 3344 | 3433 |
| 3345 | 3641 |
| 3346 | 2798 |
| 3347 | 1914 |
| 3348 | 3316 |
| 3349 | 3719 |
| 3350 | 2919 |
| 3351 | 3491 |
| 3352 | 2020 |
| 3353 | 3696 |
| 3354 | 3025 |
| 3355 | 3420 |
| 3356 | 2994 |
| 3357 | 3261 |
| 3358 | 1531 |
| 3359 | 3852 |
| 3360 | 2805 |
| 3361 | 3375 |
| 3362 | 3778 |
| 3363 | 1971 |
| 3364 | 2909 |
| 3365 | 3434 |
| 3366 | 3662 |
| 3367 | 3017 |
| 3368 | 1775 |
| 3369 | 3482 |
| 3370 | 3723 |
| 3371 | 2556 |
| 3372 | 3291 |
| 3373 | 1966 |
| 3374 | 3873 |

TABLE Q10-continued

| with a sequence length of 4096: | |
|---|---|
| Reliability or reliability sequence number | Polarized channel sequence number |
| 3375 | 2923 |
| 3376 | 3383 |
| 3377 | 3669 |
| 3378 | 1855 |
| 3379 | 2806 |
| 3380 | 3536 |
| 3381 | 3642 |
| 3382 | 3320 |
| 3383 | 2959 |
| 3384 | 1995 |
| 3385 | 3752 |
| 3386 | 3441 |
| 3387 | 2996 |
| 3388 | 3969 |
| 3389 | 2024 |
| 3390 | 3493 |
| 3391 | 2910 |
| 3392 | 3683 |
| 3393 | 3262 |
| 3394 | 1916 |
| 3395 | 2967 |
| 3396 | 3780 |
| 3397 | 3481 |
| 3398 | 2809 |
| 3399 | 3905 |
| 3400 | 1973 |
| 3401 | 3407 |
| 3402 | 2527 |
| 3403 | 3670 |
| 3404 | 3478 |
| 3405 | 1783 |
| 3406 | 3020 |
| 3407 | 3731 |
| 3408 | 3303 |
| 3409 | 2925 |
| 3410 | 1997 |
| 3411 | 3644 |
| 3412 | 3436 |
| 3413 | 3026 |
| 3414 | 3860 |
| 3415 | 3494 |
| 3416 | 1974 |
| 3417 | 3293 |
| 3418 | 3000 |
| 3419 | 3387 |
| 3420 | 3725 |
| 3421 | 1533 |
| 3422 | 2810 |
| 3423 | 3552 |
| 3424 | 3673 |
| 3425 | 2931 |
| 3426 | 3442 |
| 3427 | 2003 |
| 3428 | 3874 |
| 3429 | 2971 |
| 3430 | 3199 |
| 3431 | 3760 |
| 3432 | 3041 |
| 3433 | 1022 |
| 3434 | 3523 |
| 3435 | 3685 |
| 3436 | 3415 |
| 3437 | 2543 |
| 3438 | 1887 |
| 3439 | 3615 |
| 3440 | 3497 |
| 3441 | 2926 |
| 3442 | 3864 |
| 3443 | 3307 |
| 3444 | 1977 |
| 3445 | 2751 |
| 3446 | 3726 |
| 3447 | 3444 |
| 3448 | 2983 |
| 3449 | 3674 |

TABLE Q10-continued with a sequence length of 4096:

| Reliability or reliability sequence number | Polarized channel sequence number |
|---|---|
| 3450 | 2032 |
| 3451 | 3484 |
| 3452 | 3876 |
| 3453 | 3028 |
| 3454 | 3294 |
| 3455 | 3784 |
| 3456 | 1787 |
| 3457 | 2933 |
| 3458 | 3525 |
| 3459 | 3686 |
| 3460 | 3389 |
| 3461 | 1998 |
| 3462 | 2973 |
| 3463 | 3847 |
| 3464 | 3498 |
| 3465 | 2987 |
| 3466 | 3733 |
| 3467 | 1903 |
| 3468 | 3309 |
| 3469 | 2812 |
| 3470 | 3689 |
| 3471 | 3747 |
| 3472 | 3419 |
| 3473 | 2005 |
| 3474 | 2551 |
| 3475 | 3906 |
| 3476 | 3505 |
| 3477 | 2934 |
| 3478 | 3676 |
| 3479 | 1978 |
| 3480 | 3448 |
| 3481 | 3631 |
| 3482 | 3042 |
| 3483 | 3315 |
| 3484 | 3851 |
| 3485 | 2019 |
| 3486 | 3032 |
| 3487 | 3530 |
| 3488 | 3690 |
| 3489 | 3526 |
| 3490 | 2937 |
| 3491 | 2006 |
| 3492 | 3738 |
| 3493 | 3390 |
| 3494 | 2783 |
| 3495 | 3880 |
| 3496 | 3500 |
| 3497 | 1911 |
| 3498 | 3639 |
| 3499 | 2974 |
| 3500 | 3310 |
| 3501 | 3792 |
| 3502 | 3015 |
| 3503 | 3431 |
| 3504 | 1980 |
| 3505 | 3970 |
| 3506 | 3697 |
| 3507 | 2989 |
| 3508 | 3537 |
| 3509 | 3749 |
| 3510 | 1534 |
| 3511 | 2938 |
| 3512 | 3506 |
| 3513 | 3908 |
| 3514 | 3317 |
| 3515 | 3044 |
| 3516 | 1789 |
| 3517 | 3737 |
| 3518 | 3421 |
| 3519 | 3663 |
| 3520 | 2555 |
| 3521 | 3529 |
| 3522 | 3859 |
| 3523 | 2009 |
| 3524 | 2995 |

TABLE Q10-continued with a sequence length of 4096:

| Reliability or reliability sequence number | Polarized channel sequence number |
|---|---|
| 3525 | 3734 |
| 3526 | 3435 |
| 3527 | 3692 |
| 3528 | 2799 |
| 3529 | 2021 |
| 3530 | 3318 |
| 3531 | 3853 |
| 3532 | 3471 |
| 3533 | 2990 |
| 3534 | 3750 |
| 3535 | 3508 |
| 3536 | 1951 |
| 3537 | 3643 |
| 3538 | 2879 |
| 3539 | 3422 |
| 3540 | 3888 |
| 3541 | 3019 |
| 3542 | 1915 |
| 3543 | 3808 |
| 3544 | 3479 |
| 3545 | 3698 |
| 3546 | 3048 |
| 3547 | 3321 |
| 3548 | 3854 |
| 3549 | 2010 |
| 3550 | 3532 |
| 3551 | 2940 |
| 3552 | 3779 |
| 3553 | 3912 |
| 3554 | 3437 |
| 3555 | 2997 |
| 3556 | 2022 |
| 3557 | 3671 |
| 3558 | 3538 |
| 3559 | 3753 |
| 3560 | 2807 |
| 3561 | 3512 |
| 3562 | 3972 |
| 3563 | 2025 |
| 3564 | 3322 |
| 3565 | 3021 |
| 3566 | 3700 |
| 3567 | 3740 |
| 3568 | 3443 |
| 3569 | 2012 |
| 3570 | 2998 |
| 3571 | 3861 |
| 3572 | 3483 |
| 3573 | 3781 |
| 3574 | 2557 |
| 3575 | 3875 |
| 3576 | 1967 |
| 3577 | 3553 |
| 3578 | 3645 |
| 3579 | 3027 |
| 3580 | 3438 |
| 3581 | 3754 |
| 3582 | 3263 |
| 3583 | 2911 |
| 3584 | 1023 |
| 3585 | 3866 |
| 3586 | 3675 |
| 3587 | 3495 |
| 3588 | 3001 |
| 3589 | 3761 |
| 3590 | 3540 |
| 3591 | 1790 |
| 3592 | 3920 |
| 3593 | 3056 |
| 3594 | 3704 |
| 3595 | 3445 |
| 3596 | 3877 |
| 3597 | 2811 |
| 3598 | 1917 |
| 3599 | 3485 |

TABLE Q10-continued

| with a sequence length of 4096: | |
|---|---|
| Reliability or reliability sequence number | Polarized channel sequence number |
| 3600 | 3786 |
| 3601 | 3499 |
| 3602 | 3022 |
| 3603 | 3782 |
| 3604 | 3976 |
| 3605 | 2026 |
| 3606 | 3324 |
| 3607 | 2927 |
| 3608 | 3646 |
| 3609 | 3446 |
| 3610 | 3865 |
| 3611 | 3756 |
| 3612 | 3029 |
| 3613 | 1975 |
| 3614 | 3554 |
| 3615 | 3862 |
| 3616 | 3544 |
| 3617 | 3002 |
| 3618 | 3687 |
| 3619 | 3793 |
| 3620 | 2033 |
| 3621 | 3449 |
| 3622 | 3043 |
| 3623 | 3878 |
| 3624 | 3762 |
| 3625 | 3295 |
| 3626 | 3030 |
| 3627 | 3936 |
| 3628 | 1999 |
| 3629 | 3486 |
| 3630 | 3677 |
| 3631 | 3785 |
| 3632 | 2935 |
| 3633 | 3527 |
| 3634 | 3984 |
| 3635 | 3501 |
| 3636 | 2028 |
| 3637 | 3004 |
| 3638 | 3691 |
| 3639 | 3907 |
| 3640 | 3450 |
| 3641 | 3727 |
| 3642 | 2558 |
| 3643 | 3881 |
| 3644 | 1535 |
| 3645 | 3556 |
| 3646 | 3764 |
| 3647 | 2813 |
| 3648 | 3507 |
| 3649 | 3678 |
| 3650 | 3868 |
| 3651 | 3311 |
| 3652 | 1979 |
| 3653 | 3033 |
| 3654 | 3735 |
| 3655 | 3909 |
| 3656 | 3502 |
| 3657 | 3788 |
| 3658 | 3045 |
| 3659 | 3391 |
| 3660 | 1918 |
| 3661 | 4000 |
| 3662 | 3693 |
| 3663 | 2975 |
| 3664 | 3531 |
| 3665 | 3882 |
| 3666 | 3794 |
| 3667 | 3560 |
| 3668 | 2034 |
| 3669 | 2939 |
| 3670 | 3768 |
| 3671 | 3889 |
| 3672 | 3452 |
| 3673 | 3699 |
| 3674 | 3034 |

TABLE Q10-continued

| with a sequence length of 4096: | |
|---|---|
| Reliability or reliability sequence number | Polarized channel sequence number |
| 3675 | 3509 |
| 3676 | 2007 |
| 3677 | 3914 |
| 3678 | 3739 |
| 3679 | 3319 |
| 3680 | 3046 |
| 3681 | 3910 |
| 3682 | 3809 |
| 3683 | 3533 |
| 3684 | 3971 |
| 3685 | 2036 |
| 3686 | 3049 |
| 3687 | 3694 |
| 3688 | 3510 |
| 3689 | 3884 |
| 3690 | 3036 |
| 3691 | 3751 |
| 3692 | 3539 |
| 3693 | 3921 |
| 3694 | 1981 |
| 3695 | 3796 |
| 3696 | 2991 |
| 3697 | 3423 |
| 3698 | 3890 |
| 3699 | 3701 |
| 3700 | 3513 |
| 3701 | 3741 |
| 3702 | 1791 |
| 3703 | 2814 |
| 3704 | 3568 |
| 3705 | 3973 |
| 3706 | 3755 |
| 3707 | 3323 |
| 3708 | 2941 |
| 3709 | 3913 |
| 3710 | 3702 |
| 3711 | 3534 |
| 3712 | 2011 |
| 3713 | 3855 |
| 3714 | 3050 |
| 3715 | 3810 |
| 3716 | 3892 |
| 3717 | 3439 |
| 3718 | 3800 |
| 3719 | 2999 |
| 3720 | 4032 |
| 3721 | 2040 |
| 3722 | 3541 |
| 3723 | 3705 |
| 3724 | 3863 |
| 3725 | 3514 |
| 3726 | 3057 |
| 3727 | 3742 |
| 3728 | 3916 |
| 3729 | 3555 |
| 3730 | 1982 |
| 3731 | 3783 |
| 3732 | 3023 |
| 3733 | 3977 |
| 3734 | 3542 |
| 3735 | 3757 |
| 3736 | 3706 |
| 3737 | 3052 |
| 3738 | 3447 |
| 3739 | 3812 |
| 3740 | 2023 |
| 3741 | 3922 |
| 3742 | 3516 |
| 3743 | 3763 |
| 3744 | 2559 |
| 3745 | 3896 |
| 3746 | 3758 |
| 3747 | 3325 |
| 3748 | 3867 |
| 3749 | 3647 |

TABLE Q10-continued

| with a sequence length of 4096: | |
|---|---|
| Reliability or reliability sequence number | Polarized channel sequence number |
| 3750 | 2013 |
| 3751 | 3003 |
| 3752 | 3545 |
| 3753 | 3974 |
| 3754 | 3787 |
| 3755 | 3557 |
| 3756 | 3937 |
| 3757 | 2942 |
| 3758 | 3816 |
| 3759 | 3879 |
| 3760 | 1919 |
| 3761 | 3487 |
| 3762 | 3708 |
| 3763 | 3058 |
| 3764 | 3985 |
| 3765 | 3451 |
| 3766 | 3924 |
| 3767 | 3765 |
| 3768 | 3546 |
| 3769 | 3031 |
| 3770 | 2027 |
| 3771 | 3869 |
| 3772 | 3789 |
| 3773 | 3978 |
| 3774 | 3558 |
| 3775 | 3766 |
| 3776 | 3060 |
| 3777 | 3883 |
| 3778 | 3561 |
| 3779 | 3795 |
| 3780 | 3938 |
| 3781 | 2014 |
| 3782 | 3679 |
| 3783 | 3548 |
| 3784 | 3005 |
| 3785 | 3986 |
| 3786 | 3769 |
| 3787 | 3503 |
| 3788 | 3928 |
| 3789 | 3824 |
| 3790 | 2815 |
| 3791 | 3870 |
| 3792 | 2029 |
| 3793 | 3326 |
| 3794 | 3790 |
| 3795 | 3980 |
| 3796 | 3911 |
| 3797 | 3035 |
| 3798 | 3453 |
| 3799 | 3695 |
| 3800 | 3885 |
| 3801 | 3797 |
| 3802 | 3562 |
| 3803 | 2035 |
| 3804 | 4001 |
| 3805 | 3064 |
| 3806 | 3770 |
| 3807 | 3511 |
| 3808 | 3940 |
| 3809 | 3811 |
| 3810 | 3891 |
| 3811 | 3569 |
| 3812 | 3006 |
| 3813 | 4033 |
| 3814 | 3798 |
| 3815 | 2030 |
| 3816 | 3886 |
| 3817 | 3535 |
| 3818 | 3703 |
| 3819 | 3047 |
| 3820 | 3915 |
| 3821 | 3772 |
| 3822 | 3564 |
| 3823 | 3988 |
| 3824 | 3944 |

TABLE Q10-continued

| with a sequence length of 4096: | |
|---|---|
| Reliability or reliability sequence number | Polarized channel sequence number |
| 3825 | 3801 |
| 3826 | 3515 |
| 3827 | 2037 |
| 3828 | 3037 |
| 3829 | 4002 |
| 3830 | 3813 |
| 3831 | 3893 |
| 3832 | 3454 |
| 3833 | 3917 |
| 3834 | 3743 |
| 3835 | 2943 |
| 3836 | 3992 |
| 3837 | 3570 |
| 3838 | 3707 |
| 3839 | 3894 |
| 3840 | 2038 |
| 3841 | 3802 |
| 3842 | 4004 |
| 3843 | 3051 |
| 3844 | 3543 |
| 3845 | 3923 |
| 3846 | 3814 |
| 3847 | 3897 |
| 3848 | 3572 |
| 3849 | 3975 |
| 3850 | 3817 |
| 3851 | 3038 |
| 3852 | 3952 |
| 3853 | 2041 |
| 3854 | 3517 |
| 3855 | 3804 |
| 3856 | 4034 |
| 3857 | 3918 |
| 3858 | 3759 |
| 3859 | 3327 |
| 3860 | 3053 |
| 3861 | 3979 |
| 3862 | 3709 |
| 3863 | 3925 |
| 3864 | 3547 |
| 3865 | 3898 |
| 3866 | 2042 |
| 3867 | 3818 |
| 3868 | 4008 |
| 3869 | 3059 |
| 3870 | 3939 |
| 3871 | 3576 |
| 3872 | 3767 |
| 3873 | 4036 |
| 3874 | 3926 |
| 3875 | 3825 |
| 3876 | 3518 |
| 3877 | 3054 |
| 3878 | 3987 |
| 3879 | 3791 |
| 3880 | 3900 |
| 3881 | 1983 |
| 3882 | 3981 |
| 3883 | 3559 |
| 3884 | 3820 |
| 3885 | 3929 |
| 3886 | 4016 |
| 3887 | 3061 |
| 3888 | 3549 |
| 3889 | 3771 |
| 3890 | 3941 |
| 3891 | 3871 |
| 3892 | 3710 |
| 3893 | 3982 |
| 3894 | 3455 |
| 3895 | 3930 |
| 3896 | 2044 |
| 3897 | 3062 |
| 3898 | 3826 |
| 3899 | 4040 |

TABLE Q10-continued with a sequence length of 4096:

| Reliability or reliability sequence number | Polarized channel sequence number |
|---|---|
| 3900 | 3942 |
| 3901 | 3563 |
| 3902 | 3799 |
| 3903 | 3989 |
| 3904 | 3945 |
| 3905 | 3828 |
| 3906 | 3065 |
| 3907 | 3550 |
| 3908 | 4003 |
| 3909 | 3932 |
| 3910 | 3773 |
| 3911 | 3887 |
| 3912 | 2015 |
| 3913 | 3946 |
| 3914 | 3565 |
| 3915 | 3994 |
| 3916 | 3803 |
| 3917 | 3066 |
| 3918 | 3895 |
| 3919 | 4048 |
| 3920 | 3832 |
| 3921 | 3571 |
| 3922 | 3953 |
| 3923 | 4005 |
| 3924 | 3774 |
| 3925 | 3993 |
| 3926 | 3566 |
| 3927 | 3007 |
| 3928 | 3919 |
| 3929 | 2031 |
| 3930 | 3990 |
| 3931 | 3815 |
| 3932 | 3948 |
| 3933 | 4006 |
| 3934 | 3805 |
| 3935 | 3573 |
| 3936 | 3899 |
| 3937 | 4064 |
| 3938 | 3954 |
| 3939 | 3068 |
| 3940 | 3711 |
| 3941 | 4035 |
| 3942 | 3574 |
| 3943 | 3927 |
| 3944 | 4009 |
| 3945 | 3819 |
| 3946 | 3956 |
| 3947 | 2039 |
| 3948 | 3996 |
| 3949 | 3806 |
| 3950 | 3577 |
| 3951 | 3039 |
| 3952 | 4037 |
| 3953 | 3901 |
| 3954 | 4010 |
| 3955 | 3821 |
| 3956 | 3931 |
| 3957 | 4017 |
| 3958 | 3578 |
| 3959 | 3960 |
| 3960 | 3827 |
| 3961 | 4042 |
| 3962 | 4038 |
| 3963 | 3902 |
| 3964 | 3055 |
| 3965 | 4012 |
| 3966 | 3519 |
| 3967 | 3822 |
| 3968 | 2043 |
| 3969 | 3943 |
| 3970 | 4049 |
| 3971 | 4018 |
| 3972 | 3829 |
| 3973 | 3933 |
| 3974 | 4041 |

TABLE Q10-continued with a sequence length of 4096:

| Reliability or reliability sequence number | Polarized channel sequence number |
|---|---|
| 3975 | 3580 |
| 3976 | 3947 |
| 3977 | 3830 |
| 3978 | 3063 |
| 3979 | 3983 |
| 3980 | 4020 |
| 3981 | 3934 |
| 3982 | 3991 |
| 3983 | 3833 |
| 3984 | 3551 |
| 3985 | 4044 |
| 3986 | 3949 |
| 3987 | 4050 |
| 3988 | 4024 |
| 3989 | 3834 |
| 3990 | 2045 |
| 3991 | 3955 |
| 3992 | 3995 |
| 3993 | 4065 |
| 3994 | 3067 |
| 3995 | 3567 |
| 3996 | 3950 |
| 3997 | 3775 |
| 3998 | 4007 |
| 3999 | 4052 |
| 4000 | 3957 |
| 4001 | 3997 |
| 4002 | 4011 |
| 4003 | 3836 |
| 4004 | 3575 |
| 4005 | 3958 |
| 4006 | 4066 |
| 4007 | 4056 |
| 4008 | 3961 |
| 4009 | 3807 |
| 4010 | 3069 |
| 4011 | 3998 |
| 4012 | 4039 |
| 4013 | 4013 |
| 4014 | 3962 |
| 4015 | 4068 |
| 4016 | 2046 |
| 4017 | 3579 |
| 4018 | 4019 |
| 4019 | 3823 |
| 4020 | 4014 |
| 4021 | 3903 |
| 4022 | 4043 |
| 4023 | 4072 |
| 4024 | 3964 |
| 4025 | 4021 |
| 4026 | 3831 |
| 4027 | 4045 |
| 4028 | 4022 |
| 4029 | 3581 |
| 4030 | 4051 |
| 4031 | 3070 |
| 4032 | 3935 |
| 4033 | 4025 |
| 4034 | 4080 |
| 4035 | 3835 |
| 4036 | 4046 |
| 4037 | 3951 |
| 4038 | 4053 |
| 4039 | 4026 |
| 4040 | 4067 |
| 4041 | 4054 |
| 4042 | 3959 |
| 4043 | 4028 |
| 4044 | 3582 |
| 4045 | 3837 |
| 4046 | 4057 |
| 4047 | 4069 |
| 4048 | 3999 |
| 4049 | 2047 |

TABLE Q10-continued

| with a sequence length of 4096: | |
|---|---|
| Reliability or reliability sequence number | Polarized channel sequence number |
| 4050 | 3963 |
| 4051 | 4058 |
| 4052 | 4070 |
| 4053 | 4073 |
| 4054 | 4060 |
| 4055 | 4015 |
| 4056 | 3071 |
| 4057 | 3838 |
| 4058 | 3965 |
| 4059 | 4074 |
| 4060 | 4023 |
| 4061 | 4081 |
| 4062 | 4047 |
| 4063 | 4076 |
| 4064 | 3583 |
| 4065 | 4027 |
| 4066 | 3966 |
| 4067 | 4082 |
| 4068 | 4055 |
| 4069 | 4084 |
| 4070 | 4029 |
| 4071 | 3839 |
| 4072 | 4059 |
| 4073 | 4088 |
| 4074 | 4030 |
| 4075 | 4071 |
| 4076 | 4061 |
| 4077 | 3967 |
| 4078 | 4075 |
| 4079 | 4062 |
| 4080 | 4077 |
| 4081 | 4083 |
| 4082 | 4078 |
| 4083 | 4085 |
| 4084 | 4086 |
| 4085 | 4089 |
| 4086 | 4090 |
| 4087 | 4031 |
| 4088 | 4092 |
| 4089 | 4063 |
| 4090 | 4079 |
| 4091 | 4087 |
| 4092 | 4091 |
| 4093 | 4093 |
| 4094 | 4094 |
| 4095 | 4095 |

Sequence Q11, with a sequence length of 2048:

[0, 1, 2, 4, 8, 16, 32, 128, 256, 512, 1024, 3, 5, 64, 9, 6, 17, 10, 18, 12, 33, 129, 65, 20, 34, 24, 257, 36, 7, 66, 11, 40, 130, 513, 68, 19, 13, 48, 14, 1025, 72, 258, 132, 21, 35, 26, 80, 37, 136, 25, 22, 514, 260, 38, 96, 144, 67, 41, 28, 69, 160, 264, 42, 49, 1026, 74, 516, 70, 131, 44, 272, 81, 50, 1 33, 73, 15, 52, 288, 520, 192, 23, 76, 137, 1028, 82, 56, 384, 27, 134, 97, 528, 39, 259, 145, 84, 29, 138, 43, 261, 1032, 544, 98, 146, 88, 30, 320, 140, 71, 45, 640, 161, 265, 100, 51, 1040, 193, 46, 2 62, 768, 75, 148, 104, 273, 162, 53, 77, 515, 152, 1056, 266, 54, 164, 83, 274, 517, 57, 135, 112, 2 68, 194, 1152, 78, 576, 139, 289, 85, 58, 168, 385, 521, 99, 1280, 196, 321, 86, 147, 518, 60, 276, 141, 89, 290, 1536, 176, 529, 101, 31, 280, 142, 90, 522, 292, 1027, 200, 102, 263, 530, 149, 105, 163, 322, 92, 1029, 524, 47, 267, 106, 154, 545, 296, 55, 208, 1088, 386, 641, 113, 165, 324, 153, 79, 1033, 577, 275, 150, 108, 532, 269, 166, 59, 1030, 304, 546, 224, 114, 270, 195, 536, 1041, 3 28, 87, 169, 388, 769, 116, 156, 1034, 277, 548, 197, 291, 61, 170, 519, 1042, 282, 91, 177, 578, 3 36, 120, 293, 1036, 202, 523, 198, 392, 62, 552, 1057, 281, 172, 278, 642, 103, 209, 294, 1153, 5 80, 178, 352, 93, 531, 201, 1089, 400, 107, 525, 323, 143, 1044, 297, 560, 180, 94, 284, 526, 105 8, 151, 325, 204, 584, 416, 109, 1048, 770, 298, 210, 184, 644, 1281, 305, 115, 330, 533, 155, 10 60, 326, 547, 225, 387, 110, 538, 1031, 300, 167, 592, 337, 212, 1090, 306, 549, 117, 157, 648, 1 035, 389, 171, 329, 537, 118, 1064, 271, 534, 226, 308, 1154, 772, 216, 448, 550, 121, 1537, 279, 158, 608, 332, 199, 1092, 656, 393, 173, 579, 1043, 122, 228, 553, 338, 1037, 179, 540, 312, 17 4, 581, 1072, 283, 63, 390, 672, 1038, 203, 353, 776, 232, 1096, 295, 554, 124, 401, 1282, 561, 3 40, 586, 181, 285, 1156, 582, 205, 394, 643, 1045, 182, 299, 556, 211, 1059, 354, 784, 95, 1050, 402, 593, 185, 344, 1104, 562, 240, 286, 645, 1061, 206, 585, 396, 327, 1160, 527, 111, 301, 104 9, 564, 213, 800, 417, 1046, 186, 704, 356, 227, 1538, 535, 307, 588, 1284, 449, 214, 649, 302, 1 062, 119, 594, 331, 1120, 568, 188, 404, 896, 1168, 360, 217, 539, 1091, 418, 646, 229, 1065, 30 9, 609, 333, 551, 1052, 159, 408, 771, 1093, 123, 657, 310, 1184, 218, 596, 420, 1288, 541, 339, 650, 1066, 230, 313, 555, 1073, 391, 773, 233, 1098, 368, 610, 220, 1540, 658, 450, 334, 1094, 6 00, 175, 542, 1155, 395, 832, 125, 1068, 341, 652, 314, 1296, 583, 234, 557, 1105, 424, 673, 355, 1074, 183, 777, 452, 1157, 612, 342, 563, 1097, 241, 403, 705, 1039, 207, 558, 1076, 316, 774, 397, 1312, 587, 236, 345, 1544, 660, 432, 1216, 616, 187, 785, 1047, 357, 674, 287, 1100, 565, 1 26, 1161, 589, 398, 346, 1106, 664, 242, 1080, 778, 456, 566, 1408, 358, 676, 1051, 215, 595, 40 5, 1158, 786, 361, 1121, 569, 244, 647, 1552, 419, 624, 1063, 348, 189, 780, 1283, 303, 706, 116 9, 362, 590, 410, 1108, 651, 219, 1053, 801, 311, 1162, 597, 464, 570, 1067, 248, 680, 1285, 369, 897, 1568, 421, 611, 1122, 190, 708, 409, 1170, 833, 335, 1112, 598, 406, 1054, 659, 231, 1344, 572, 364, 1164, 788, 422, 221, 1095, 315, 653, 1069, 480, 601, 1664, 370, 802, 1185, 127, 688, 1 289, 451, 613, 1124, 343, 543, 1075, 425, 792, 1217, 235, 654, 372, 1070, 602, 412, 1286, 804, 2 22, 1792, 712, 453, 1099, 614, 317, 1172, 775, 426, 1128, 661, 237, 1297, 617, 675, 1186, 347, 1 077, 834, 433, 1101, 604, 376, 1539, 559, 243, 1176, 779, 458, 1290, 618, 454, 1078, 666, 318, 1 188, 808, 428, 1107, 567, 238, 1298, 720, 1541, 359, 898, 1081, 625, 465, 1159, 677, 434, 1136, 836, 245, 1292, 665, 349, 1218, 591, 1102, 457, 787, 1600, 662, 363, 1163, 620, 246, 1313, 781, 1109, 399, 678, 1082, 436, 571, 1192, 350, 1409, 816, 736, 1545, 407, 626, 1123, 249, 1220, 78 2, 460, 1345, 707, 840, 1110, 365, 1171, 599, 466, 1542, 681, 440, 1084, 900, 1300, 250, 628, 11 65, 668, 371, 1113, 789, 1314, 411, 709, 1200, 803, 1553, 481, 573, 1125, 366, 682, 1055, 191, 1 304, 794, 603, 1166, 423, 1114, 689, 468, 1546, 848, 1316, 632, 373, 1224, 805, 1126, 413, 714, 1287, 427, 1554, 710, 904, 1173, 252, 1129, 574, 374, 1187, 793, 1346, 684, 482, 1116, 790, 154 8, 472, 1071, 615, 721, 1291, 377, 1130, 806, 690, 1178, 223, 1569, 864, 414, 1320, 605, 1079, 7 13, 1232, 455, 912, 1410, 429, 1665, 619, 835, 1137, 378, 1189, 655, 1348, 809, 484, 1177, 692, 1103, 435, 1601, 606, 796, 1299, 239, 1174, 663, 1132, 837, 430, 1556, 716, 1293, 319, 1190, 92 8, 1083, 621, 459, 1328, 810, 1570, 722, 1248, 488, 696, 1138, 817, 1294, 380, 1219, 627, 1560, 437, 842, 1352, 667, 1111, 247, 1193, 838, 1412, 737, 461, 1793, 899, 1140, 622, 1180, 438, 130 1, 812, 679, 1572, 467, 1221, 849, 1315, 724, 1085, 351, 1194, 818, 1543, 629, 441, 1306, 669, 1 115, 496, 1201, 901, 1602, 683, 1360, 251, 1144, 841, 630, 1317, 462, 1226, 783, 1547, 738, 12 22, 820, 1416, 367, 1086, 728, 1576, 960, 469, 1305, 633, 1196, 791, 1302, 442, 1666, 670, 112 7, 844, 1233, 483, 1318, 711, 1604, 905, 1202, 470, 1376, 685, 1117, 634, 375, 1555, 740, 1225, 850, 1424, 444, 1131, 691, 1549, 824, 1347, 686, 1167, 253, 1321, 795, 1584, 575, 1204, 473, 1 118, 902, 1308, 715, 1550, 485, 1175, 865, 1349, 744, 1228, 807, 1608, 415, 1440, 636, 1133, 9 13, 1794, 379, 1322, 852, 1234, 693, 1208, 474, 1668, 797, 1329, 717, 1139, 906, 1354, 486, 15 57, 694, 1179, 811, 1350, 489, 1571, 723, 1249, 866, 607, 476, 1411, 914, 1134, 697, 1562, 431, 1324, 856, 1191, 752, 1616, 798, 1361, 254, 1236, 718, 1330, 908, 1573, 839, 1141, 381, 1181, 623, 1672, 813, 1413, 725, 1195, 490, 1353, 929, 1561, 698, 1142, 439, 1295, 868, 1558, 739, 1 250, 819, 1332, 497, 1796, 961, 1240, 726, 1472, 814, 1574, 463, 1145, 631, 1303, 843, 1182, 7 00, 1632, 492, 1356, 1223, 916, 1680, 872, 1417, 729, 1197, 443, 1603, 930, 1146, 741, 1252, 8 21, 1577, 382, 1362, 845, 1203, 671, 1564, 920, 1336, 498, 1198, 1605, 635, 1307, 822, 1087, 7 30, 1414, 932, 1696, 471, 1227, 851, 1377, 742, 1800, 1256, 825, 1319, 500, 1578, 903, 1148, 7 45, 1425, 880, 1585, 445, 1364, 1610, 732, 1205, 962, 1309, 846, 1606, 687, 1229, 255, 1418, 1 667, 907, 1206, 637, 1323, 853, 1580, 475, 1235, 826, 1378, 1808, 746, 1119, 936, 1426, 867, 1 617, 504, 1209, 1368, 695, 1586, 964, 1264, 854, 1310, 753, 1669, 1230, 446, 1609, 915, 1420, 719, 1351, 1551, 828, 1135, 909, 1325, 487, 1588, 748, 1237, 1824, 857, 1441, 944, 1210, 477, 1728, 1380, 699, 1251, 869, 1559, 799, 1331, 1612, 638, 1473, 910, 1238, 1673, 383, 1326, 858, 1143, 754, 1618, 1355, 968, 1592, 870, 1212, 491, 1428, 1920, 727, 1384, 917, 1241, 1563, 87 3, 1442, 756, 1670, 1253, 478, 1333, 931, 1633, 860, 1357, 1575, 701, 1183, 815, 1432, 1795, 8 74, 1147, 493, 1681, 1334, 922, 1242, 731, 1620, 1444, 823, 1565, 976, 1363, 1674, 760, 1254, 499, 1337, 1579, 881, 1415, 933, 1797, 1257, 702, 1392, 1634, 921, 1244, 494, 1682, 1474, 847, 1358, 918, 1624, 1199, 743, 1566, 876, 1419, 1856, 934, 1149, 1365, 733, 1676, 501, 1338, 16 07, 827, 1258, 1581, 992, 1448, 882, 1697, 1379, 639, 1207, 1801, 963, 1476, 502, 1636, 1366, 855, 1587, 1265, 937, 1427, 747, 1729, 1231, 884, 1582, 1340, 924, 1798, 734, 1421, 1611, 505, 1260, 1369, 965, 1684, 1456, 829, 1640, 1211, 938, 1809, 749, 1381, 1698, 859, 1311, 1589, 9 45, 1150, 1613, 506, 1422, 1370, 888, 1688, 755, 1266, 1802, 970, 1480, 1590, 966, 1382, 1700, 830, 1239, 1619, 940, 1429, 1810, 447, 1385, 1593, 750, 1268, 1671, 871, 1443, 1648, 977, 13 72, 946, 1213, 1804, 757, 1327, 1730, 861, 1386, 1614, 969, 1434, 1675, 508, 1243, 1825, 875, 1335, 1621, 758, 1488, 1594, 1272, 911, 1704, 1393, 948, 1921, 1445, 862, 1635, 1214, 919, 17 32, 1433, 761, 1857, 1359, 479, 1622, 1430, 972, 1683, 1255, 877, 1596, 1388, 978, 1812, 1446, 1245, 952, 1339, 1677, 762, 1504, 1625, 883, 1394, 1826, 923, 1151, 1712, 993, 1475, 1637, 1 367, 495, 1567, 1449, 878, 1816, 1259, 703, 1678, 1396, 935, 1626, 1436, 1828, 980, 1246, 173 6, 885, 1477, 1638, 1341, 925, 1799, 1450, 939, 1685, 1261, 764, 1641, 1699, 1371, 503, 1858, 1457, 886, 1628, 1400, 1583, 994, 1267, 1803, 984, 1482, 1642, 1478, 889, 1690, 1342, 735, 18 32, 1452, 1591, 926, 1262, 1744, 967, 1383, 1922, 1649, 941, 1489, 1701, 890, 1458, 1860, 126 9, 996, 1689, 1373, 1615, 507, 1481, 1811, 947, 1686, 1387, 1644, 751, 1270, 1805, 1423, 942, 1702, 1460, 1595, 831, 1374, 1840, 971, 1760, 1431, 1650, 1000, 1273, 1806, 1484, 892, 1731, 1864, 1389, 949, 1623, 1490, 1705, 759, 1464, 1924, 1274, 973, 1652, 1692, 1395, 950, 1813, 1 435, 1733, 509, 1827, 1505, 1597, 979, 1390, 1706, 1215, 863, 1818, 1627, 1447, 953, 1713, 14 92, 1872, 1008, 1656, 1397, 1829, 763, 1437, 1738, 1451, 974, 1734, 1928, 1276, 879, 1598, 13 98, 1817, 1708, 981, 1506, 1814, 1496, 954, 1639, 1745, 1401, 995, 1830, 1714, 1247, 982, 188 8, 1438, 1629, 1737, 887, 1479, 1936, 1453, 956, 1643, 1859, 1402, 1679, 510, 1833, 1508, 171 6, 765, 1459, 1630, 1820, 1263, 985, 1687, 1861, 1454, 1740, 997, 1343, 1952, 1645, 927, 1483, 1834, 1746, 1512, 891, 1720, 1841, 1404, 1651, 986, 1461, 1866, 1691, 1271, 998, 1862, 1761, 1485, 1923, 1001, 1646, 1462, 1836, 988, 1703, 1491, 1873, 1748, 943, 1375, 1842, 1653, 146 5, 1693, 766, 1520, 1925, 1707, 1275, 893, 1865, 1654, 1486, 1807, 1002, 1762, 1844, 1391, 17 52, 951, 1984, 1493, 1657, 1815, 1466, 1009, 1694, 1868, 1507, 1735, 975, 1929, 1494, 1709, 1 658, 1004, 1399, 1764, 1874, 1468, 1715, 511, 1848, 1710, 1277, 1819, 1599, 955, 1497, 1926, 1739, 1509, 1889, 894, 1768, 1831, 1439, 1660, 1010, 1937, 1403, 1876, 1717, 1498, 983, 182 1, 1741, 1930, 1510, 1718, 1012, 1835, 1513, 1747, 1890, 1631, 1500, 957, 1938, 1721, 1455, 1 880, 1776, 767, 1822, 1278, 1742, 1932, 1863, 987, 1405, 1647, 1837, 1749, 1514, 1953, 1016, 1722, 1463, 1892, 1763, 1843, 1521, 958, 1985, 1750, 1838, 1487, 1655, 999, 1867, 1724, 151 6, 1940, 1896, 1753, 1467, 989, 1954, 1765, 1845, 1406, 1869, 1695, 895, 1944, 1522, 1659, 18 46, 1754, 1956, 1003, 1495, 1875, 1766, 1849, 1524, 1927, 1769, 990, 1904, 1469, 1756, 1986, 1870, 1711, 1279, 1005, 1931, 1661, 1877, 1499, 1850, 1770, 1960, 1011, 1891, 1528, 1719, 1 988, 1878, 1777, 1470, 1006, 1939, 1743, 1852, 1933, 1511, 1772, 1881, 1968, 1013, 1501, 17 23, 1893, 1823, 1662, 1934, 1407, 1882, 1014, 1778, 1992, 1894, 1515, 1751, 1941, 1897, 178 0, 1017, 1502, 1955, 1884, 1725, 1839, 1898, 1517, 1946, 1755, 1018, 1847, 2000, 1784, 1523, 1905, 1957, 1726, 1945, 1518, 959, 1871, 1942, 1767, 1900, 1958, 1757, 1525, 1851, 2016, 19 06, 1020, 1663, 1987, 1526, 1879, 1961, 1771, 1908, 1948, 1758, 1529, 991, 1989, 1853, 1962, 1773, 1883, 1969, 1530, 1912, 1779, 1994, 1990, 1854, 1007, 1964, 1471, 1774, 1895, 2001, 1 970, 1781, 1885, 1993, 1532, 1899, 1782, 1015, 1935, 1972, 1886, 1943, 1785, 1503, 1996, 19 01, 2002, 1976, 1786, 1907, 1947, 2017, 1019, 1519, 1902, 1727, 1959, 2004, 1909, 1949, 196 3, 1788, 1527, 1910, 2018, 2008, 1913, 1759, 1021, 1950, 1991, 1965, 1914, 2020, 1531, 1971, 1775, 1966, 1855, 1995, 2024, 1916, 1973, 1783, 1997, 1974, 1533, 2003, 1022, 1887, 1977, 2 032, 1787, 1998, 1903, 2005, 1978, 2019, 2006, 1911, 1980, 1534, 1789, 2009, 2021, 1951, 19 15, 2010, 2022, 2025, 2012, 1967, 1023, 1790, 1917, 2026, 1975, 2033, 1999, 2028, 1535, 197 9, 1918, 2034, 2007, 2036, 1981, 1791, 2011, 2040, 1982, 2023, 2013, 1919, 2027, 2014, 2029, 2035, 2030, 2037, 2038, 2041, 2042, 1983, 2044, 2015, 2031, 2039, 2043, 2045, 2046, 2047]

TABLE Q11

| with a sequence length of 2048: | |
|---|---|
| Reliability or reliability sequence number | Polarized channel sequence number |
| 0 | 0 |
| 1 | 1 |

TABLE Q11-continued

| with a sequence length of 2048: | |
|---|---|
| Reliability or reliability sequence number | Polarized channel sequence number |
| 2 | 2 |
| 3 | 4 |
| 4 | 8 |
| 5 | 16 |
| 6 | 32 |
| 7 | 128 |
| 8 | 256 |
| 9 | 512 |
| 10 | 1024 |
| 11 | 3 |
| 12 | 5 |
| 13 | 64 |
| 14 | 9 |
| 15 | 6 |
| 16 | 17 |
| 17 | 10 |
| 18 | 18 |
| 19 | 12 |
| 20 | 33 |
| 21 | 129 |
| 22 | 65 |
| 23 | 20 |
| 24 | 34 |
| 25 | 24 |
| 26 | 257 |
| 27 | 36 |
| 28 | 7 |
| 29 | 66 |
| 30 | 11 |
| 31 | 40 |
| 32 | 130 |
| 33 | 513 |
| 34 | 68 |
| 35 | 19 |
| 36 | 13 |
| 37 | 48 |
| 38 | 14 |
| 39 | 1025 |
| 40 | 72 |
| 41 | 258 |
| 42 | 132 |
| 43 | 21 |
| 44 | 35 |
| 45 | 26 |
| 46 | 80 |
| 47 | 37 |
| 48 | 136 |
| 49 | 25 |
| 50 | 22 |
| 51 | 514 |
| 52 | 260 |
| 53 | 38 |
| 54 | 96 |
| 55 | 144 |
| 56 | 67 |
| 57 | 41 |
| 58 | 28 |
| 59 | 69 |
| 60 | 160 |
| 61 | 264 |
| 62 | 42 |
| 63 | 49 |
| 64 | 1026 |
| 65 | 74 |
| 66 | 516 |
| 67 | 70 |
| 68 | 131 |
| 69 | 44 |
| 70 | 272 |
| 71 | 81 |
| 72 | 50 |
| 73 | 133 |
| 74 | 73 |
| 75 | 15 |
| 76 | 52 |

TABLE Q11-continued

| with a sequence length of 2048: | |
|---|---|
| Reliability or reliability sequence number | Polarized channel sequence number |
| 77 | 288 |
| 78 | 520 |
| 79 | 192 |
| 80 | 23 |
| 81 | 76 |
| 82 | 137 |
| 83 | 1028 |
| 84 | 82 |
| 85 | 56 |
| 86 | 384 |
| 87 | 27 |
| 88 | 134 |
| 89 | 97 |
| 90 | 528 |
| 91 | 39 |
| 92 | 259 |
| 93 | 145 |
| 94 | 84 |
| 95 | 29 |
| 96 | 138 |
| 97 | 43 |
| 98 | 261 |
| 99 | 1032 |
| 100 | 544 |
| 101 | 98 |
| 102 | 146 |
| 103 | 88 |
| 104 | 30 |
| 105 | 320 |
| 106 | 140 |
| 107 | 71 |
| 108 | 45 |
| 109 | 640 |
| 110 | 161 |
| 111 | 265 |
| 112 | 100 |
| 113 | 51 |
| 114 | 1040 |
| 115 | 193 |
| 116 | 46 |
| 117 | 262 |
| 118 | 768 |
| 119 | 75 |
| 120 | 148 |
| 121 | 104 |
| 122 | 273 |
| 123 | 162 |
| 124 | 53 |
| 125 | 77 |
| 126 | 515 |
| 127 | 152 |
| 128 | 1056 |
| 129 | 266 |
| 130 | 54 |
| 131 | 164 |
| 132 | 83 |
| 133 | 274 |
| 134 | 517 |
| 135 | 57 |
| 136 | 135 |
| 137 | 112 |
| 138 | 268 |
| 139 | 194 |
| 140 | 1152 |
| 141 | 78 |
| 142 | 576 |
| 143 | 139 |
| 144 | 289 |
| 145 | 85 |
| 146 | 58 |
| 147 | 168 |
| 148 | 385 |
| 149 | 521 |
| 150 | 99 |
| 151 | 1280 |

TABLE Q11-continued

| with a sequence length of 2048: | |
|---|---|
| Reliability or reliability sequence number | Polarized channel sequence number |
| 152 | 196 |
| 153 | 321 |
| 154 | 86 |
| 155 | 147 |
| 156 | 518 |
| 157 | 60 |
| 158 | 276 |
| 159 | 141 |
| 160 | 89 |
| 161 | 290 |
| 162 | 1536 |
| 163 | 176 |
| 164 | 529 |
| 165 | 101 |
| 166 | 31 |
| 167 | 280 |
| 168 | 142 |
| 169 | 90 |
| 170 | 522 |
| 171 | 292 |
| 172 | 1027 |
| 173 | 200 |
| 174 | 102 |
| 175 | 263 |
| 176 | 530 |
| 177 | 149 |
| 178 | 105 |
| 179 | 163 |
| 180 | 322 |
| 181 | 92 |
| 182 | 1029 |
| 183 | 524 |
| 184 | 47 |
| 185 | 267 |
| 186 | 106 |
| 187 | 154 |
| 188 | 545 |
| 189 | 296 |
| 190 | 55 |
| 191 | 208 |
| 192 | 1088 |
| 193 | 386 |
| 194 | 641 |
| 195 | 113 |
| 196 | 165 |
| 197 | 324 |
| 198 | 153 |
| 199 | 79 |
| 200 | 1033 |
| 201 | 577 |
| 202 | 275 |
| 203 | 150 |
| 204 | 108 |
| 205 | 532 |
| 206 | 269 |
| 207 | 166 |
| 208 | 59 |
| 209 | 1030 |
| 210 | 304 |
| 211 | 546 |
| 212 | 224 |
| 213 | 114 |
| 214 | 270 |
| 215 | 195 |
| 216 | 536 |
| 217 | 1041 |
| 218 | 328 |
| 219 | 87 |
| 220 | 169 |
| 221 | 388 |
| 222 | 769 |
| 223 | 116 |
| 224 | 156 |
| 225 | 1034 |
| 226 | 277 |

TABLE Q11-continued

| with a sequence length of 2048: | |
|---|---|
| Reliability or reliability sequence number | Polarized channel sequence number |
| 227 | 548 |
| 228 | 197 |
| 229 | 291 |
| 230 | 61 |
| 231 | 170 |
| 232 | 519 |
| 233 | 1042 |
| 234 | 282 |
| 235 | 91 |
| 236 | 177 |
| 237 | 578 |
| 238 | 336 |
| 239 | 120 |
| 240 | 293 |
| 241 | 1036 |
| 242 | 202 |
| 243 | 523 |
| 244 | 198 |
| 245 | 392 |
| 246 | 62 |
| 247 | 552 |
| 248 | 1057 |
| 249 | 281 |
| 250 | 172 |
| 251 | 278 |
| 252 | 642 |
| 253 | 103 |
| 254 | 209 |
| 255 | 294 |
| 256 | 1153 |
| 257 | 580 |
| 258 | 178 |
| 259 | 352 |
| 260 | 93 |
| 261 | 531 |
| 262 | 201 |
| 263 | 1089 |
| 264 | 400 |
| 265 | 107 |
| 266 | 525 |
| 267 | 323 |
| 268 | 143 |
| 269 | 1044 |
| 270 | 297 |
| 271 | 560 |
| 272 | 180 |
| 273 | 94 |
| 274 | 284 |
| 275 | 526 |
| 276 | 1058 |
| 277 | 151 |
| 278 | 325 |
| 279 | 204 |
| 280 | 584 |
| 281 | 416 |
| 282 | 109 |
| 283 | 1048 |
| 284 | 770 |
| 285 | 298 |
| 286 | 210 |
| 287 | 184 |
| 288 | 644 |
| 289 | 1281 |
| 290 | 305 |
| 291 | 115 |
| 292 | 330 |
| 293 | 533 |
| 294 | 155 |
| 295 | 1060 |
| 296 | 326 |
| 297 | 547 |
| 298 | 225 |
| 299 | 387 |
| 300 | 110 |
| 301 | 538 |

TABLE Q11-continued

| with a sequence length of 2048: | |
|---|---|
| Reliability or reliability sequence number | Polarized channel sequence number |
| 302 | 1031 |
| 303 | 300 |
| 304 | 167 |
| 305 | 592 |
| 306 | 337 |
| 307 | 212 |
| 308 | 1090 |
| 309 | 306 |
| 310 | 549 |
| 311 | 117 |
| 312 | 157 |
| 313 | 648 |
| 314 | 1035 |
| 315 | 389 |
| 316 | 171 |
| 317 | 329 |
| 318 | 537 |
| 319 | 118 |
| 320 | 1064 |
| 321 | 271 |
| 322 | 534 |
| 323 | 226 |
| 324 | 308 |
| 325 | 1154 |
| 326 | 772 |
| 327 | 216 |
| 328 | 448 |
| 329 | 550 |
| 330 | 121 |
| 331 | 1537 |
| 332 | 279 |
| 333 | 158 |
| 334 | 608 |
| 335 | 332 |
| 336 | 199 |
| 337 | 1092 |
| 338 | 656 |
| 339 | 393 |
| 340 | 173 |
| 341 | 579 |
| 342 | 1043 |
| 343 | 122 |
| 344 | 228 |
| 345 | 553 |
| 346 | 338 |
| 347 | 1037 |
| 348 | 179 |
| 349 | 540 |
| 350 | 312 |
| 351 | 174 |
| 352 | 581 |
| 353 | 1072 |
| 354 | 283 |
| 355 | 63 |
| 356 | 390 |
| 357 | 672 |
| 358 | 1038 |
| 359 | 203 |
| 360 | |
| 361 | 776 |
| 362 | 232 |
| 363 | 1096 |
| 364 | 295 |
| 365 | 554 |
| 366 | 124 |
| 367 | 401 |
| 368 | 1282 |
| 369 | 561 |
| 370 | 340 |
| 371 | 586 |
| 372 | 181 |
| 373 | 285 |
| 374 | 1156 |
| 375 | 582 |
| 376 | 205 |

TABLE Q11-continued

| with a sequence length of 2048: | |
|---|---|
| Reliability or reliability sequence number | Polarized channel sequence number |
| 377 | 394 |
| 378 | 643 |
| 379 | 1045 |
| 380 | 182 |
| 381 | 299 |
| 382 | 556 |
| 383 | 211 |
| 384 | 1059 |
| 385 | 354 |
| 386 | 784 |
| 387 | 95 |
| 388 | 1050 |
| 389 | 402 |
| 390 | 593 |
| 391 | 185 |
| 392 | 344 |
| 393 | 1104 |
| 394 | 562 |
| 395 | 240 |
| 396 | 286 |
| 397 | 645 |
| 398 | 1061 |
| 399 | 206 |
| 400 | 585 |
| 401 | 396 |
| 402 | 327 |
| 403 | 1160 |
| 404 | 527 |
| 405 | 111 |
| 406 | 301 |
| 407 | 1049 |
| 408 | 564 |
| 409 | 213 |
| 410 | 800 |
| 411 | 417 |
| 412 | 1046 |
| 413 | 186 |
| 414 | 704 |
| 415 | 356 |
| 416 | 227 |
| 417 | 1538 |
| 418 | 535 |
| 419 | 307 |
| 420 | 588 |
| 421 | 1284 |
| 422 | 449 |
| 423 | 214 |
| 424 | 649 |
| 425 | 302 |
| 426 | 1062 |
| 427 | 119 |
| 428 | 594 |
| 429 | 331 |
| 430 | 1120 |
| 431 | 568 |
| 432 | 188 |
| 433 | 404 |
| 434 | 896 |
| 435 | 1168 |
| 436 | 360 |
| 437 | 217 |
| 438 | 539 |
| 439 | 1091 |
| 440 | 418 |
| 441 | 646 |
| 442 | 229 |
| 443 | 1065 |
| 444 | 309 |
| 445 | 609 |
| 446 | 333 |
| 447 | 551 |
| 448 | 1052 |
| 449 | 159 |
| 450 | 408 |
| 451 | 771 |

TABLE Q11-continued

| with a sequence length of 2048: | |
|---|---|
| Reliability or reliability sequence number | Polarized channel sequence number |
| 452 | 1093 |
| 453 | 123 |
| 454 | 657 |
| 455 | 310 |
| 456 | 1184 |
| 457 | 218 |
| 458 | 596 |
| 459 | 420 |
| 460 | 1288 |
| 461 | 541 |
| 462 | 339 |
| 463 | 650 |
| 464 | 1066 |
| 465 | 230 |
| 466 | 313 |
| 467 | 555 |
| 468 | 1073 |
| 469 | 391 |
| 470 | 773 |
| 471 | 233 |
| 472 | 1098 |
| 473 | 368 |
| 474 | 610 |
| 475 | 220 |
| 476 | 1540 |
| 477 | 658 |
| 478 | 450 |
| 479 | 334 |
| 480 | 1094 |
| 481 | 600 |
| 482 | 175 |
| 483 | 542 |
| 484 | 1155 |
| 485 | 395 |
| 486 | 832 |
| 487 | 125 |
| 488 | 1068 |
| 489 | 341 |
| 490 | 652 |
| 491 | 314 |
| 492 | 1296 |
| 493 | 583 |
| 494 | 234 |
| 495 | 557 |
| 496 | 1105 |
| 497 | 424 |
| 498 | 673 |
| 499 | 355 |
| 500 | 1074 |
| 501 | 183 |
| 502 | 777 |
| 503 | 452 |
| 504 | 1157 |
| 505 | 612 |
| 506 | 342 |
| 507 | 563 |
| 508 | 1097 |
| 509 | 241 |
| 510 | 403 |
| 511 | 705 |
| 512 | 1039 |
| 513 | 207 |
| 514 | 558 |
| 515 | 1076 |
| 516 | 316 |
| 517 | 774 |
| 518 | 397 |
| 519 | 1312 |
| 520 | 587 |
| 521 | 236 |
| 522 | 345 |
| 523 | 1544 |
| 524 | 660 |
| 525 | 432 |
| 526 | 1216 |

TABLE Q11-continued

| with a sequence length of 2048: | |
|---|---|
| Reliability or reliability sequence number | Polarized channel sequence number |
| 527 | 616 |
| 528 | 187 |
| 529 | 785 |
| 530 | 1047 |
| 531 | 357 |
| 532 | 674 |
| 533 | 287 |
| 534 | 1100 |
| 535 | 565 |
| 536 | 126 |
| 537 | 1161 |
| 538 | 589 |
| 539 | 398 |
| 540 | 346 |
| 541 | 1106 |
| 542 | 664 |
| 543 | 242 |
| 544 | 1080 |
| 545 | 778 |
| 546 | 456 |
| 547 | 566 |
| 548 | 1408 |
| 549 | 358 |
| 550 | 676 |
| 551 | 1051 |
| 552 | 215 |
| 553 | 595 |
| 554 | 405 |
| 555 | 1158 |
| 556 | 786 |
| 557 | 361 |
| 558 | 1121 |
| 559 | 569 |
| 560 | 244 |
| 561 | 647 |
| 562 | 1552 |
| 563 | 419 |
| 564 | 624 |
| 565 | 1063 |
| 566 | 348 |
| 567 | 189 |
| 568 | 780 |
| 569 | 1283 |
| 570 | 303 |
| 571 | 706 |
| 572 | 1169 |
| 573 | 362 |
| 574 | 590 |
| 575 | 410 |
| 576 | 1108 |
| 577 | 651 |
| 578 | 219 |
| 579 | 1053 |
| 580 | 801 |
| 581 | 311 |
| 582 | 1162 |
| 583 | 597 |
| 584 | 464 |
| 585 | 570 |
| 586 | 1067 |
| 587 | 248 |
| 588 | 680 |
| 589 | 1285 |
| 590 | 369 |
| 591 | 897 |
| 592 | 1568 |
| 593 | 421 |
| 594 | 611 |
| 595 | 1122 |
| 596 | 190 |
| 597 | 708 |
| 598 | 409 |
| 599 | 1170 |
| 600 | 833 |
| 601 | 335 |

TABLE Q11-continued

| with a sequence length of 2048: | |
|---|---|
| Reliability or reliability sequence number | Polarized channel sequence number |
| 602 | 1112 |
| 603 | 598 |
| 604 | 406 |
| 605 | 1054 |
| 606 | 659 |
| 607 | 231 |
| 608 | 1344 |
| 609 | 572 |
| 610 | 364 |
| 611 | 1164 |
| 612 | 788 |
| 613 | 422 |
| 614 | 221 |
| 615 | 1095 |
| 616 | 315 |
| 617 | 653 |
| 618 | 1069 |
| 619 | 480 |
| 620 | 601 |
| 621 | 1664 |
| 622 | 370 |
| 623 | 802 |
| 624 | 1185 |
| 625 | 127 |
| 626 | 688 |
| 627 | 1289 |
| 628 | 451 |
| 629 | 613 |
| 630 | 1124 |
| 631 | 343 |
| 632 | 543 |
| 633 | 1075 |
| 634 | 425 |
| 635 | 792 |
| 636 | 1217 |
| 637 | 235 |
| 638 | 654 |
| 639 | 372 |
| 640 | 1070 |
| 641 | 602 |
| 642 | 412 |
| 643 | 1286 |
| 644 | 804 |
| 645 | 222 |
| 646 | 1792 |
| 647 | 712 |
| 648 | 453 |
| 649 | 1099 |
| 650 | 614 |
| 651 | 317 |
| 652 | 1172 |
| 653 | 775 |
| 654 | 426 |
| 655 | 1128 |
| 656 | 661 |
| 657 | 237 |
| 658 | 1297 |
| 659 | 617 |
| 660 | 675 |
| 661 | 1186 |
| 662 | 347 |
| 663 | 1077 |
| 664 | 834 |
| 665 | 433 |
| 666 | 1101 |
| 667 | 604 |
| 668 | 376 |
| 669 | 1539 |
| 670 | 559 |
| 671 | 243 |
| 672 | 1176 |
| 673 | 779 |
| 674 | 458 |
| 675 | 1290 |
| 676 | 618 |

TABLE Q11-continued

| with a sequence length of 2048: | |
|---|---|
| Reliability or reliability sequence number | Polarized channel sequence number |
| 677 | 454 |
| 678 | 1078 |
| 679 | 666 |
| 680 | 318 |
| 681 | 1188 |
| 682 | 808 |
| 683 | 428 |
| 684 | 1107 |
| 685 | 567 |
| 686 | 238 |
| 687 | 1298 |
| 688 | 720 |
| 689 | 1541 |
| 690 | 359 |
| 691 | 898 |
| 692 | 1081 |
| 693 | 625 |
| 694 | 465 |
| 695 | 1159 |
| 696 | 677 |
| 697 | 434 |
| 698 | 1136 |
| 699 | 836 |
| 700 | 245 |
| 701 | 1292 |
| 702 | 665 |
| 703 | 349 |
| 704 | 1218 |
| 705 | 591 |
| 706 | 1102 |
| 707 | 457 |
| 708 | 787 |
| 709 | 1600 |
| 710 | 662 |
| 711 | 363 |
| 712 | 1163 |
| 713 | 620 |
| 714 | 246 |
| 715 | 1313 |
| 716 | 781 |
| 717 | 1109 |
| 718 | 399 |
| 719 | 678 |
| 720 | 1082 |
| 721 | 436 |
| 722 | 571 |
| 723 | 1192 |
| 724 | 350 |
| 725 | 1409 |
| 726 | 816 |
| 727 | 736 |
| 728 | 1545 |
| 729 | 407 |
| 730 | 626 |
| 731 | 1123 |
| 732 | 249 |
| 733 | 1220 |
| 734 | 782 |
| 735 | 460 |
| 736 | 1345 |
| 737 | 707 |
| 738 | 840 |
| 739 | 1110 |
| 740 | 365 |
| 741 | 1171 |
| 742 | 599 |
| 743 | 466 |
| 744 | 1542 |
| 745 | 681 |
| 746 | 440 |
| 747 | 1084 |
| 748 | 900 |
| 749 | 1300 |
| 750 | 250 |
| 751 | 628 |

TABLE Q11-continued

| with a sequence length of 2048: | |
|---|---|
| Reliability or reliability sequence number | Polarized channel sequence number |
| 752 | 1165 |
| 753 | 668 |
| 754 | 371 |
| 755 | 1113 |
| 756 | 789 |
| 757 | 1314 |
| 758 | 411 |
| 759 | 709 |
| 760 | 1200 |
| 761 | 803 |
| 762 | 1553 |
| 763 | 481 |
| 764 | 573 |
| 765 | 1125 |
| 766 | 366 |
| 767 | 682 |
| 768 | 1055 |
| 769 | 191 |
| 770 | 1304 |
| 771 | 794 |
| 772 | 603 |
| 773 | 1166 |
| 774 | 423 |
| 775 | 1114 |
| 776 | 689 |
| 777 | 468 |
| 778 | 1546 |
| 779 | 848 |
| 780 | 1316 |
| 781 | 632 |
| 782 | 373 |
| 783 | 1224 |
| 784 | 805 |
| 785 | 1126 |
| 786 | 413 |
| 787 | 714 |
| 788 | 1287 |
| 789 | 427 |
| 790 | 1554 |
| 791 | 710 |
| 792 | 904 |
| 793 | 1173 |
| 794 | 252 |
| 795 | 1129 |
| 796 | 574 |
| 797 | 374 |
| 798 | 1187 |
| 799 | 793 |
| 800 | 1346 |
| 801 | 684 |
| 802 | 482 |
| 803 | 1116 |
| 804 | 790 |
| 805 | 1548 |
| 806 | 472 |
| 807 | 1071 |
| 808 | 615 |
| 809 | 721 |
| 810 | 1291 |
| 811 | 377 |
| 812 | 1130 |
| 813 | 806 |
| 814 | 690 |
| 815 | 1178 |
| 816 | 223 |
| 817 | 1569 |
| 818 | 864 |
| 819 | 414 |
| 820 | 1320 |
| 821 | 605 |
| 822 | 1079 |
| 823 | 713 |
| 824 | 1232 |
| 825 | 455 |
| 826 | 912 |

TABLE Q11-continued

| with a sequence length of 2048: | |
|---|---|
| Reliability or reliability sequence number | Polarized channel sequence number |
| 827 | 1410 |
| 828 | 429 |
| 829 | 1665 |
| 830 | 619 |
| 831 | 835 |
| 832 | 1137 |
| 833 | 378 |
| 834 | 1189 |
| 835 | 655 |
| 836 | 1348 |
| 837 | 809 |
| 838 | 484 |
| 839 | 1177 |
| 840 | 692 |
| 841 | 1103 |
| 842 | 435 |
| 843 | 1601 |
| 844 | 606 |
| 845 | 796 |
| 846 | 1299 |
| 847 | 239 |
| 848 | 1174 |
| 849 | 663 |
| 850 | 1132 |
| 851 | 837 |
| 852 | 430 |
| 853 | 1556 |
| 854 | 716 |
| 855 | 1293 |
| 856 | 319 |
| 857 | 1190 |
| 858 | 928 |
| 859 | 1083 |
| 860 | 621 |
| 861 | 459 |
| 862 | 1328 |
| 863 | 810 |
| 864 | 1570 |
| 865 | 722 |
| 866 | 1248 |
| 867 | 488 |
| 868 | 696 |
| 869 | 1138 |
| 870 | 817 |
| 871 | 1294 |
| 872 | 380 |
| 873 | 1219 |
| 874 | 627 |
| 875 | 1560 |
| 876 | 437 |
| 877 | 842 |
| 878 | 1352 |
| 879 | 667 |
| 880 | 1111 |
| 881 | 247 |
| 882 | 1193 |
| 883 | 838 |
| 884 | 1412 |
| 885 | 737 |
| 886 | 461 |
| 887 | 1793 |
| 888 | 899 |
| 889 | 1140 |
| 890 | 622 |
| 891 | 1180 |
| 892 | 438 |
| 893 | 1301 |
| 894 | 812 |
| 895 | 679 |
| 896 | 1572 |
| 897 | 467 |
| 898 | 1221 |
| 899 | 849 |
| 900 | 1315 |
| 901 | 724 |

TABLE Q11-continued

| with a sequence length of 2048: | |
|---|---|
| Reliability or reliability sequence number | Polarized channel sequence number |
| 902 | 1085 |
| 903 | 351 |
| 904 | 1194 |
| 905 | 818 |
| 906 | 1543 |
| 907 | 629 |
| 908 | 441 |
| 909 | 1306 |
| 910 | 669 |
| 911 | 1115 |
| 912 | 496 |
| 913 | 1201 |
| 914 | 901 |
| 915 | 1602 |
| 916 | 683 |
| 917 | 1360 |
| 918 | 251 |
| 919 | 1144 |
| 920 | 841 |
| 921 | 630 |
| 922 | 1317 |
| 923 | 462 |
| 924 | 1226 |
| 925 | 783 |
| 926 | 1547 |
| 927 | 738 |
| 928 | 1222 |
| 929 | 820 |
| 930 | 1416 |
| 931 | 367 |
| 932 | 1086 |
| 933 | 728 |
| 934 | 1576 |
| 935 | 960 |
| 936 | 469 |
| 937 | 1305 |
| 938 | 633 |
| 939 | 1196 |
| 940 | 791 |
| 941 | 1302 |
| 942 | 442 |
| 943 | 1666 |
| 944 | 670 |
| 945 | 1127 |
| 946 | 844 |
| 947 | 1233 |
| 948 | 483 |
| 949 | 1318 |
| 950 | 711 |
| 951 | 1604 |
| 952 | 905 |
| 953 | 1202 |
| 954 | 470 |
| 955 | 1376 |
| 956 | 685 |
| 957 | 1117 |
| 958 | 634 |
| 959 | 375 |
| 960 | 1555 |
| 961 | 740 |
| 962 | 1225 |
| 963 | 850 |
| 964 | 1424 |
| 965 | 444 |
| 966 | 1131 |
| 967 | 691 |
| 968 | 1549 |
| 969 | 824 |
| 970 | 1347 |
| 971 | 686 |
| 972 | 1167 |
| 973 | 253 |
| 974 | 1321 |
| 975 | 795 |
| 976 | 1584 |

TABLE Q11-continued

| with a sequence length of 2048: | |
|---|---|
| Reliability or reliability sequence number | Polarized channel sequence number |
| 977 | 575 |
| 978 | 1204 |
| 979 | 473 |
| 980 | 1118 |
| 981 | 902 |
| 982 | 1308 |
| 983 | 715 |
| 984 | 1550 |
| 985 | 485 |
| 986 | 1175 |
| 987 | 865 |
| 988 | 1349 |
| 989 | 744 |
| 990 | 1228 |
| 991 | 807 |
| 992 | 1608 |
| 993 | 415 |
| 994 | 1440 |
| 995 | 636 |
| 996 | 1133 |
| 997 | 913 |
| 998 | 1794 |
| 999 | 379 |
| 1000 | 1322 |
| 1001 | 852 |
| 1002 | 1234 |
| 1003 | 693 |
| 1004 | 1208 |
| 1005 | 474 |
| 1006 | 1668 |
| 1007 | 797 |
| 1008 | 1329 |
| 1009 | 717 |
| 1010 | 1139 |
| 1011 | 906 |
| 1012 | 1354 |
| 1013 | 486 |
| 1014 | 1557 |
| 1015 | 694 |
| 1016 | 1179 |
| 1017 | 811 |
| 1018 | 1350 |
| 1019 | 489 |
| 1020 | 1571 |
| 1021 | 723 |
| 1022 | 1249 |
| 1023 | 866 |
| 1024 | 607 |
| 1025 | 476 |
| 1026 | 1411 |
| 1027 | 914 |
| 1028 | 1134 |
| 1029 | 697 |
| 1030 | 1562 |
| 1031 | 431 |
| 1032 | 1324 |
| 1033 | 856 |
| 1034 | 1191 |
| 1035 | 752 |
| 1036 | 1616 |
| 1037 | 798 |
| 1038 | 1361 |
| 1039 | 254 |
| 1040 | 1236 |
| 1041 | 718 |
| 1042 | 1330 |
| 1043 | 908 |
| 1044 | 1573 |
| 1045 | 839 |
| 1046 | 1141 |
| 1047 | 381 |
| 1048 | 1181 |
| 1049 | 623 |
| 1050 | 1672 |
| 1051 | 813 |

TABLE Q11-continued with a sequence length of 2048:

| Reliability or reliability sequence number | Polarized channel sequence number |
|---|---|
| 1052 | 1413 |
| 1053 | 725 |
| 1054 | 1195 |
| 1055 | 490 |
| 1056 | 1353 |
| 1057 | 929 |
| 1058 | 1561 |
| 1059 | 698 |
| 1060 | 1142 |
| 1061 | 439 |
| 1062 | 1295 |
| 1063 | 868 |
| 1064 | 1558 |
| 1065 | 739 |
| 1066 | 1250 |
| 1067 | 819 |
| 1068 | 1332 |
| 1069 | 497 |
| 1070 | 1796 |
| 1071 | 961 |
| 1072 | 1240 |
| 1073 | 726 |
| 1074 | 1472 |
| 1075 | 814 |
| 1076 | 1574 |
| 1077 | 463 |
| 1078 | 1145 |
| 1079 | 631 |
| 1080 | 1303 |
| 1081 | 843 |
| 1082 | 1182 |
| 1083 | 700 |
| 1084 | 1632 |
| 1085 | 492 |
| 1086 | 1356 |
| 1087 | 1223 |
| 1088 | 916 |
| 1089 | 1680 |
| 1090 | 872 |
| 1091 | 1417 |
| 1092 | 729 |
| 1093 | 1197 |
| 1094 | 443 |
| 1095 | 1603 |
| 1096 | 930 |
| 1097 | 1146 |
| 1098 | 741 |
| 1099 | 1252 |
| 1100 | 821 |
| 1101 | 1577 |
| 1102 | 382 |
| 1103 | 1362 |
| 1104 | 845 |
| 1105 | 1203 |
| 1106 | 671 |
| 1107 | 1564 |
| 1108 | 920 |
| 1109 | 1336 |
| 1110 | 498 |
| 1111 | 1198 |
| 1112 | 1605 |
| 1113 | 635 |
| 1114 | 1307 |
| 1115 | 822 |
| 1116 | 1087 |
| 1117 | 730 |
| 1118 | 1414 |
| 1119 | 932 |
| 1120 | 1696 |
| 1121 | 471 |
| 1122 | 1227 |
| 1123 | 851 |
| 1124 | 1377 |
| 1125 | 742 |
| 1126 | 1800 |

TABLE Q11-continued with a sequence length of 2048:

| Reliability or reliability sequence number | Polarized channel sequence number |
|---|---|
| 1127 | 1256 |
| 1128 | 825 |
| 1129 | 1319 |
| 1130 | 500 |
| 1131 | 1578 |
| 1132 | 903 |
| 1133 | 1148 |
| 1134 | 745 |
| 1135 | 1425 |
| 1136 | 880 |
| 1137 | 1585 |
| 1138 | 445 |
| 1139 | 1364 |
| 1140 | 1610 |
| 1141 | 732 |
| 1142 | 1205 |
| 1143 | 962 |
| 1144 | 1309 |
| 1145 | 846 |
| 1146 | 1606 |
| 1147 | 687 |
| 1148 | 1229 |
| 1149 | 255 |
| 1150 | 1418 |
| 1151 | 1667 |
| 1152 | 907 |
| 1153 | 1206 |
| 1154 | 637 |
| 1155 | 1323 |
| 1156 | 853 |
| 1157 | 1580 |
| 1158 | 475 |
| 1159 | 1235 |
| 1160 | 826 |
| 1161 | 1378 |
| 1162 | 1808 |
| 1163 | 746 |
| 1164 | 1119 |
| 1165 | 936 |
| 1166 | 1426 |
| 1167 | 867 |
| 1168 | 1617 |
| 1169 | 504 |
| 1170 | 1209 |
| 1171 | 1368 |
| 1172 | 695 |
| 1173 | 1586 |
| 1174 | 964 |
| 1175 | 1264 |
| 1176 | 854 |
| 1177 | 1310 |
| 1178 | 753 |
| 1179 | 1669 |
| 1180 | 1230 |
| 1181 | 446 |
| 1182 | 1609 |
| 1183 | 915 |
| 1184 | 1420 |
| 1185 | 719 |
| 1186 | 1351 |
| 1187 | 1551 |
| 1188 | 828 |
| 1189 | 1135 |
| 1190 | 909 |
| 1191 | 1325 |
| 1192 | 487 |
| 1193 | 1588 |
| 1194 | 748 |
| 1195 | 1237 |
| 1196 | 1824 |
| 1197 | 857 |
| 1198 | 1441 |
| 1199 | 944 |
| 1200 | 1210 |
| 1201 | 477 |

TABLE Q11-continued with a sequence length of 2048:

| Reliability or reliability sequence number | Polarized channel sequence number |
|---|---|
| 1202 | 1728 |
| 1203 | 1380 |
| 1204 | 699 |
| 1205 | 1251 |
| 1206 | 869 |
| 1207 | 1559 |
| 1208 | 799 |
| 1209 | 1331 |
| 1210 | 1612 |
| 1211 | 638 |
| 1212 | 1473 |
| 1213 | 910 |
| 1214 | 1238 |
| 1215 | 1673 |
| 1216 | 383 |
| 1217 | 1326 |
| 1218 | 858 |
| 1219 | 1143 |
| 1220 | 754 |
| 1221 | 1618 |
| 1222 | 1355 |
| 1223 | 968 |
| 1224 | 1592 |
| 1225 | 870 |
| 1226 | 1212 |
| 1227 | 491 |
| 1228 | 1428 |
| 1229 | 1920 |
| 1230 | 727 |
| 1231 | 1384 |
| 1232 | 917 |
| 1233 | 1241 |
| 1234 | 1563 |
| 1235 | 873 |
| 1236 | 1442 |
| 1237 | 756 |
| 1238 | 1670 |
| 1239 | 1253 |
| 1240 | 478 |
| 1241 | 1333 |
| 1242 | 931 |
| 1243 | 1633 |
| 1244 | 860 |
| 1245 | 1357 |
| 1246 | 1575 |
| 1247 | 701 |
| 1248 | 1183 |
| 1249 | 815 |
| 1250 | 1432 |
| 1251 | 1795 |
| 1252 | 874 |
| 1253 | 1147 |
| 1254 | 493 |
| 1255 | 1681 |
| 1256 | 1334 |
| 1257 | 922 |
| 1258 | 1242 |
| 1259 | 731 |
| 1260 | 1620 |
| 1261 | 1444 |
| 1262 | 823 |
| 1263 | 1565 |
| 1264 | 976 |
| 1265 | 1363 |
| 1266 | 1674 |
| 1267 | 760 |
| 1268 | 1254 |
| 1269 | 499 |
| 1270 | 1337 |
| 1271 | 1579 |
| 1272 | 881 |
| 1273 | 1415 |
| 1274 | 933 |
| 1275 | 1797 |
| 1276 | 1257 |
| 1277 | 702 |
| 1278 | 1392 |
| 1279 | 1634 |
| 1280 | 921 |
| 1281 | 1244 |
| 1282 | 494 |
| 1283 | 1682 |
| 1284 | 1474 |
| 1285 | 847 |
| 1286 | 1358 |
| 1287 | 918 |
| 1288 | 1624 |
| 1289 | 1199 |
| 1290 | 743 |
| 1291 | 1566 |
| 1292 | 876 |
| 1293 | 1419 |
| 1294 | 1856 |
| 1295 | 934 |
| 1296 | 1149 |
| 1297 | 1365 |
| 1298 | 733 |
| 1299 | 1676 |
| 1300 | 501 |
| 1301 | 1338 |
| 1302 | 1607 |
| 1303 | 827 |
| 1304 | 1258 |
| 1305 | 1581 |
| 1306 | 992 |
| 1307 | 1448 |
| 1308 | 882 |
| 1309 | 1697 |
| 1310 | 1379 |
| 1311 | 639 |
| 1312 | 1207 |
| 1313 | 1801 |
| 1314 | 963 |
| 1315 | 1476 |
| 1316 | 502 |
| 1317 | 1636 |
| 1318 | 1366 |
| 1319 | 855 |
| 1320 | 1587 |
| 1321 | 1265 |
| 1322 | 937 |
| 1323 | 1427 |
| 1324 | 747 |
| 1325 | 1729 |
| 1326 | 1231 |
| 1327 | 884 |
| 1328 | 1582 |
| 1329 | 1340 |
| 1330 | 924 |
| 1331 | 1798 |
| 1332 | 734 |
| 1333 | 1421 |
| 1334 | 1611 |
| 1335 | 505 |
| 1336 | 1260 |
| 1337 | 1369 |
| 1338 | 965 |
| 1339 | 1684 |
| 1340 | 1456 |
| 1341 | 829 |
| 1342 | 1640 |
| 1343 | 1211 |
| 1344 | 938 |
| 1345 | 1809 |
| 1346 | 749 |
| 1347 | 1381 |
| 1348 | 1698 |
| 1349 | 859 |
| 1350 | 1311 |
| 1351 | 1589 |

TABLE Q11-continued

| with a sequence length of 2048: | |
|---|---|
| Reliability or reliability sequence number | Polarized channel sequence number |
| 1352 | 945 |
| 1353 | 1150 |
| 1354 | 1613 |
| 1355 | 506 |
| 1356 | 1422 |
| 1357 | 1370 |
| 1358 | 888 |
| 1359 | 1688 |
| 1360 | 755 |
| 1361 | 1266 |
| 1362 | 1802 |
| 1363 | 970 |
| 1364 | 1480 |
| 1365 | 1590 |
| 1366 | 966 |
| 1367 | 1382 |
| 1368 | 1700 |
| 1369 | 830 |
| 1370 | 1239 |
| 1371 | 1619 |
| 1372 | 940 |
| 1373 | 1429 |
| 1374 | 1810 |
| 1375 | 447 |
| 1376 | 1385 |
| 1377 | 1593 |
| 1378 | 750 |
| 1379 | 1268 |
| 1380 | 1671 |
| 1381 | 871 |
| 1382 | 1443 |
| 1383 | 1648 |
| 1384 | 977 |
| 1385 | 1372 |
| 1386 | 946 |
| 1387 | 1213 |
| 1388 | 1804 |
| 1389 | 757 |
| 1390 | 1327 |
| 1391 | 1730 |
| 1392 | 861 |
| 1393 | 1386 |
| 1394 | 1614 |
| 1395 | 969 |
| 1396 | 1434 |
| 1397 | 1675 |
| 1398 | 508 |
| 1399 | 1243 |
| 1400 | 1825 |
| 1401 | 875 |
| 1402 | 1335 |
| 1403 | 1621 |
| 1404 | 758 |
| 1405 | 1488 |
| 1406 | 1594 |
| 1407 | 1272 |
| 1408 | 911 |
| 1409 | 1704 |
| 1410 | 1393 |
| 1411 | 948 |
| 1412 | 1921 |
| 1413 | 1445 |
| 1414 | 862 |
| 1415 | 1635 |
| 1416 | 1214 |
| 1417 | 919 |
| 1418 | 1732 |
| 1419 | 1433 |
| 1420 | 761 |
| 1421 | 1857 |
| 1422 | 1359 |
| 1423 | 479 |
| 1424 | 1622 |
| 1425 | 1430 |
| 1426 | 972 |

TABLE Q11-continued

| with a sequence length of 2048: | |
|---|---|
| Reliability or reliability sequence number | Polarized channel sequence number |
| 1427 | 1683 |
| 1428 | 1255 |
| 1429 | 877 |
| 1430 | 1596 |
| 1431 | 1388 |
| 1432 | 978 |
| 1433 | 1812 |
| 1434 | 1446 |
| 1435 | 1245 |
| 1436 | 952 |
| 1437 | 1339 |
| 1438 | 1677 |
| 1439 | 762 |
| 1440 | 1504 |
| 1441 | 1625 |
| 1442 | 883 |
| 1443 | 1394 |
| 1444 | 1826 |
| 1445 | 923 |
| 1446 | 1151 |
| 1447 | 1712 |
| 1448 | 993 |
| 1449 | 1475 |
| 1450 | 1637 |
| 1451 | 1367 |
| 1452 | 495 |
| 1453 | 1567 |
| 1454 | 1449 |
| 1455 | 878 |
| 1456 | 1816 |
| 1457 | 1259 |
| 1458 | 703 |
| 1459 | 1678 |
| 1460 | 1396 |
| 1461 | 935 |
| 1462 | 1626 |
| 1463 | 1436 |
| 1464 | 1828 |
| 1465 | 980 |
| 1466 | 1246 |
| 1467 | 1736 |
| 1468 | 885 |
| 1469 | 1477 |
| 1470 | 1638 |
| 1471 | 1341 |
| 1472 | 925 |
| 1473 | 1799 |
| 1474 | 1450 |
| 1475 | 939 |
| 1476 | 1685 |
| 1477 | 1261 |
| 1478 | 764 |
| 1479 | 1641 |
| 1480 | 1699 |
| 1481 | 1371 |
| 1482 | 503 |
| 1483 | 1858 |
| 1484 | 1457 |
| 1485 | 886 |
| 1486 | 1628 |
| 1487 | 1400 |
| 1488 | 1583 |
| 1489 | 994 |
| 1490 | 1267 |
| 1491 | 1803 |
| 1492 | 984 |
| 1493 | 1482 |
| 1494 | 1642 |
| 1495 | 1478 |
| 1496 | 889 |
| 1497 | 1690 |
| 1498 | 1342 |
| 1499 | 735 |
| 1500 | 1832 |
| 1501 | 1452 |

TABLE Q11-continued

| with a sequence length of 2048: | |
|---|---|
| Reliability or reliability sequence number | Polarized channel sequence number |
| 1502 | 1591 |
| 1503 | 926 |
| 1504 | 1262 |
| 1505 | 1744 |
| 1506 | 967 |
| 1507 | 1383 |
| 1508 | 1922 |
| 1509 | 1649 |
| 1510 | 941 |
| 1511 | 1489 |
| 1512 | 1701 |
| 1513 | 890 |
| 1514 | 1458 |
| 1515 | 1860 |
| 1516 | 1269 |
| 1517 | 996 |
| 1518 | 1689 |
| 1519 | 1373 |
| 1520 | 1615 |
| 1521 | 507 |
| 1522 | 1481 |
| 1523 | 1811 |
| 1524 | 947 |
| 1525 | 1686 |
| 1526 | 1387 |
| 1527 | 1644 |
| 1528 | 751 |
| 1529 | 1270 |
| 1530 | 1805 |
| 1531 | 1423 |
| 1532 | 942 |
| 1533 | 1702 |
| 1534 | 1460 |
| 1535 | 1595 |
| 1536 | 831 |
| 1537 | 1374 |
| 1538 | 1840 |
| 1539 | 971 |
| 1540 | 1760 |
| 1541 | 1431 |
| 1542 | 1650 |
| 1543 | 1000 |
| 1544 | 1273 |
| 1545 | 1806 |
| 1546 | 1484 |
| 1547 | 892 |
| 1548 | 1731 |
| 1549 | 1864 |
| 1550 | 1389 |
| 1551 | 949 |
| 1552 | 1623 |
| 1553 | 1490 |
| 1554 | 1705 |
| 1555 | 759 |
| 1556 | 1464 |
| 1557 | 1924 |
| 1558 | 1274 |
| 1559 | 973 |
| 1560 | 1652 |
| 1561 | 1692 |
| 1562 | 1395 |
| 1563 | 950 |
| 1564 | 1813 |
| 1565 | 1435 |
| 1566 | 1733 |
| 1567 | 509 |
| 1568 | 1827 |
| 1569 | 1505 |
| 1570 | 1597 |
| 1571 | 979 |
| 1572 | 1390 |
| 1573 | 1706 |
| 1574 | 1215 |
| 1575 | 863 |
| 1576 | 1818 |

TABLE Q11-continued

| with a sequence length of 2048: | |
|---|---|
| Reliability or reliability sequence number | Polarized channel sequence number |
| 1577 | 1627 |
| 1578 | 1447 |
| 1579 | 953 |
| 1580 | 1713 |
| 1581 | 1492 |
| 1582 | 1872 |
| 1583 | 1008 |
| 1584 | 1656 |
| 1585 | 1397 |
| 1586 | 1829 |
| 1587 | 763 |
| 1588 | 1437 |
| 1589 | 1738 |
| 1590 | 1451 |
| 1591 | 974 |
| 1592 | 1734 |
| 1593 | 1928 |
| 1594 | 1276 |
| 1595 | 879 |
| 1596 | 1598 |
| 1597 | 1398 |
| 1598 | 1817 |
| 1599 | 1708 |
| 1600 | 981 |
| 1601 | 1506 |
| 1602 | 1814 |
| 1603 | 1496 |
| 1604 | 954 |
| 1605 | 1639 |
| 1606 | 1745 |
| 1607 | 1401 |
| 1608 | 995 |
| 1609 | 1830 |
| 1610 | 1714 |
| 1611 | 1247 |
| 1612 | 982 |
| 1613 | 1888 |
| 1614 | 1438 |
| 1615 | 1629 |
| 1616 | 1737 |
| 1617 | 887 |
| 1618 | 1479 |
| 1619 | 1936 |
| 1620 | 1453 |
| 1621 | 956 |
| 1622 | 1643 |
| 1623 | 1859 |
| 1624 | 1402 |
| 1625 | 1679 |
| 1626 | 510 |
| 1627 | 1833 |
| 1628 | 1508 |
| 1629 | 1716 |
| 1630 | 765 |
| 1631 | 1459 |
| 1632 | 1630 |
| 1633 | 1820 |
| 1634 | 1263 |
| 1635 | 985 |
| 1636 | 1687 |
| 1637 | 1861 |
| 1638 | 1454 |
| 1639 | 1740 |
| 1640 | 997 |
| 1641 | 1343 |
| 1642 | 1952 |
| 1643 | 1645 |
| 1644 | 927 |
| 1645 | 1483 |
| 1646 | 1834 |
| 1647 | 1746 |
| 1648 | 1512 |
| 1649 | 891 |
| 1650 | 1720 |
| 1651 | 1841 |

TABLE Q11-continued

| with a sequence length of 2048: | |
|---|---|
| Reliability or reliability sequence number | Polarized channel sequence number |
| 1652 | 1404 |
| 1653 | 1651 |
| 1654 | 986 |
| 1655 | 1461 |
| 1656 | 1866 |
| 1657 | 1691 |
| 1658 | 1271 |
| 1659 | 998 |
| 1660 | 1862 |
| 1661 | 1761 |
| 1662 | 1485 |
| 1663 | 1923 |
| 1664 | 1001 |
| 1665 | 1646 |
| 1666 | 1462 |
| 1667 | 1836 |
| 1668 | 988 |
| 1669 | 1703 |
| 1670 | 1491 |
| 1671 | 1873 |
| 1672 | 1748 |
| 1673 | 943 |
| 1674 | 1375 |
| 1675 | 1842 |
| 1676 | 1653 |
| 1677 | 1465 |
| 1678 | 1693 |
| 1679 | 766 |
| 1680 | 1520 |
| 1681 | 1925 |
| 1682 | 1707 |
| 1683 | 1275 |
| 1684 | 893 |
| 1685 | 1865 |
| 1686 | 1654 |
| 1687 | 1486 |
| 1688 | 1807 |
| 1689 | 1002 |
| 1690 | 1762 |
| 1691 | 1844 |
| 1692 | 1391 |
| 1693 | 1752 |
| 1694 | 951 |
| 1695 | 1984 |
| 1696 | 1493 |
| 1697 | 1657 |
| 1698 | 1815 |
| 1699 | 1466 |
| 1700 | 1009 |
| 1701 | 1694 |
| 1702 | 1868 |
| 1703 | 1507 |
| 1704 | 1735 |
| 1705 | 975 |
| 1706 | 1929 |
| 1707 | 1494 |
| 1708 | 1709 |
| 1709 | 1658 |
| 1710 | 1004 |
| 1711 | 1399 |
| 1712 | 1764 |
| 1713 | 1874 |
| 1714 | 1468 |
| 1715 | 1715 |
| 1716 | 511 |
| 1717 | 1848 |
| 1718 | 1710 |
| 1719 | 1277 |
| 1720 | 1819 |
| 1721 | 1599 |
| 1722 | 955 |
| 1723 | 1497 |
| 1724 | 1926 |
| 1725 | 1739 |
| 1726 | 1509 |

TABLE Q11-continued

| with a sequence length of 2048: | |
|---|---|
| Reliability or reliability sequence number | Polarized channel sequence number |
| 1727 | 1889 |
| 1728 | 894 |
| 1729 | 1768 |
| 1730 | 1831 |
| 1731 | 1439 |
| 1732 | 1660 |
| 1733 | 1010 |
| 1734 | 1937 |
| 1735 | 1403 |
| 1736 | 1876 |
| 1737 | 1717 |
| 1738 | 1498 |
| 1739 | 983 |
| 1740 | 1821 |
| 1741 | 1741 |
| 1742 | 1930 |
| 1743 | 1510 |
| 1744 | 1718 |
| 1745 | 1012 |
| 1746 | 1835 |
| 1747 | 1513 |
| 1748 | 1747 |
| 1749 | 1890 |
| 1750 | 1631 |
| 1751 | 1500 |
| 1752 | 957 |
| 1753 | 1938 |
| 1754 | 1721 |
| 1755 | 1455 |
| 1756 | 1880 |
| 1757 | 1776 |
| 1758 | 767 |
| 1759 | 1822 |
| 1760 | 1278 |
| 1761 | 1742 |
| 1762 | 1932 |
| 1763 | 1863 |
| 1764 | 987 |
| 1765 | 1405 |
| 1766 | 1647 |
| 1767 | 1837 |
| 1768 | 1749 |
| 1769 | 1514 |
| 1770 | 1953 |
| 1771 | 1016 |
| 1772 | 1722 |
| 1773 | 1463 |
| 1774 | 1892 |
| 1775 | 1763 |
| 1776 | 1843 |
| 1777 | 1521 |
| 1778 | 958 |
| 1779 | 1985 |
| 1780 | 1750 |
| 1781 | 1838 |
| 1782 | 1487 |
| 1783 | 1655 |
| 1784 | 999 |
| 1785 | 1867 |
| 1786 | 1724 |
| 1787 | 1516 |
| 1788 | 1940 |
| 1789 | 1896 |
| 1790 | 1753 |
| 1791 | 1467 |
| 1792 | 989 |
| 1793 | 1954 |
| 1794 | 1765 |
| 1795 | 1845 |
| 1796 | 1406 |
| 1797 | 1869 |
| 1798 | 1695 |
| 1799 | 895 |
| 1800 | 1944 |
| 1801 | 1522 |

TABLE Q11-continued

| with a sequence length of 2048: | |
|---|---|
| Reliability or reliability sequence number | Polarized channel sequence number |
| 1802 | 1659 |
| 1803 | 1846 |
| 1804 | 1754 |
| 1805 | 1956 |
| 1806 | 1003 |
| 1807 | 1495 |
| 1808 | 1875 |
| 1809 | 1766 |
| 1810 | 1849 |
| 1811 | 1524 |
| 1812 | 1927 |
| 1813 | 1769 |
| 1814 | 990 |
| 1815 | 1904 |
| 1816 | 1469 |
| 1817 | 1756 |
| 1818 | 1986 |
| 1819 | 1870 |
| 1820 | 1711 |
| 1821 | 1279 |
| 1822 | 1005 |
| 1823 | 1931 |
| 1824 | 1661 |
| 1825 | 1877 |
| 1826 | 1499 |
| 1827 | 1850 |
| 1828 | 1770 |
| 1829 | 1960 |
| 1830 | 1011 |
| 1831 | 1891 |
| 1832 | 1528 |
| 1833 | 1719 |
| 1834 | 1988 |
| 1835 | 1878 |
| 1836 | 1777 |
| 1837 | 1470 |
| 1838 | 1006 |
| 1839 | 1939 |
| 1840 | 1743 |
| 1841 | 1852 |
| 1842 | 1933 |
| 1843 | 1511 |
| 1844 | 1772 |
| 1845 | 1881 |
| 1846 | 1968 |
| 1847 | 1013 |
| 1848 | 1501 |
| 1849 | 1723 |
| 1850 | 1893 |
| 1851 | 1823 |
| 1852 | 1662 |
| 1853 | 1934 |
| 1854 | 1407 |
| 1855 | 1882 |
| 1856 | 1014 |
| 1857 | 1778 |
| 1858 | 1992 |
| 1859 | 1894 |
| 1860 | 1515 |
| 1861 | 1751 |
| 1862 | 1941 |
| 1863 | 1897 |
| 1864 | 1780 |
| 1865 | 1017 |
| 1866 | 1502 |
| 1867 | 1955 |
| 1868 | 1884 |
| 1869 | 1725 |
| 1870 | 1839 |
| 1871 | 1898 |
| 1872 | 1517 |
| 1873 | 1946 |
| 1874 | 1755 |
| 1875 | 1018 |
| 1876 | 1847 |

TABLE Q11-continued

| with a sequence length of 2048: | |
|---|---|
| Reliability or reliability sequence number | Polarized channel sequence number |
| 1877 | 2000 |
| 1878 | 1784 |
| 1879 | 1523 |
| 1880 | 1905 |
| 1881 | 1957 |
| 1882 | 1726 |
| 1883 | 1945 |
| 1884 | 1518 |
| 1885 | 959 |
| 1886 | 1871 |
| 1887 | 1942 |
| 1888 | 1767 |
| 1889 | 1900 |
| 1890 | 1958 |
| 1891 | 1757 |
| 1892 | 1525 |
| 1893 | 1851 |
| 1894 | 2016 |
| 1895 | 1906 |
| 1896 | 1020 |
| 1897 | 1663 |
| 1898 | 1987 |
| 1899 | 1526 |
| 1900 | 1879 |
| 1901 | 1961 |
| 1902 | 1771 |
| 1903 | 1908 |
| 1904 | 1948 |
| 1905 | 1758 |
| 1906 | 1529 |
| 1907 | 991 |
| 1908 | 1989 |
| 1909 | 1853 |
| 1910 | 1962 |
| 1911 | 1773 |
| 1912 | 1883 |
| 1913 | 1969 |
| 1914 | 1530 |
| 1915 | 1912 |
| 1916 | 1779 |
| 1917 | 1994 |
| 1918 | 1990 |
| 1919 | 1854 |
| 1920 | 1007 |
| 1921 | 1964 |
| 1922 | 1471 |
| 1923 | 1774 |
| 1924 | 1895 |
| 1925 | 2001 |
| 1926 | 1970 |
| 1927 | 1781 |
| 1928 | 1885 |
| 1929 | 1993 |
| 1930 | 1532 |
| 1931 | 1899 |
| 1932 | 1782 |
| 1933 | 1015 |
| 1934 | 1935 |
| 1935 | 1972 |
| 1936 | 1886 |
| 1937 | 1943 |
| 1938 | 1785 |
| 1939 | 1503 |
| 1940 | 1996 |
| 1941 | 1901 |
| 1942 | 2002 |
| 1943 | 1976 |
| 1944 | 1786 |
| 1945 | 1907 |
| 1946 | 1947 |
| 1947 | 2017 |
| 1948 | 1019 |
| 1949 | 1519 |
| 1950 | 1902 |
| 1951 | 1727 |

TABLE Q11-continued

| with a sequence length of 2048: | |
|---|---|
| Reliability or reliability sequence number | Polarized channel sequence number |
| 1952 | 1959 |
| 1953 | 2004 |
| 1954 | 1909 |
| 1955 | 1949 |
| 1956 | 1963 |
| 1957 | 1788 |
| 1958 | 1527 |
| 1959 | 1910 |
| 1960 | 2018 |
| 1961 | 2008 |
| 1962 | 1913 |
| 1963 | 1759 |
| 1964 | 1021 |
| 1965 | 1950 |
| 1966 | 1991 |
| 1967 | 1965 |
| 1968 | 1914 |
| 1969 | 2020 |
| 1970 | 1531 |
| 1971 | 1971 |
| 1972 | 1775 |
| 1973 | 1966 |
| 1974 | 1855 |
| 1975 | 1995 |
| 1976 | 2024 |
| 1977 | 1916 |
| 1978 | 1973 |
| 1979 | 1783 |
| 1980 | 1997 |
| 1981 | 1974 |
| 1982 | 1533 |
| 1983 | 2003 |
| 1984 | 1022 |
| 1985 | 1887 |
| 1986 | 1977 |
| 1987 | 2032 |
| 1988 | 1787 |
| 1989 | 1998 |
| 1990 | 1903 |
| 1991 | 2005 |
| 1992 | 1978 |
| 1993 | 2019 |
| 1994 | 2006 |
| 1995 | 1911 |
| 1996 | 1980 |
| 1997 | 1534 |
| 1998 | 1789 |
| 1999 | 2009 |
| 2000 | 2021 |
| 2001 | 1951 |
| 2002 | 1915 |
| 2003 | 2010 |
| 2004 | 2022 |
| 2005 | 2025 |
| 2006 | 2012 |
| 2007 | 1967 |
| 2008 | 1023 |
| 2009 | 1790 |
| 2010 | 1917 |
| 2011 | 2026 |
| 2012 | 1975 |
| 2013 | 2033 |
| 2014 | 1999 |
| 2015 | 2028 |
| 2016 | 1535 |
| 2017 | 1979 |
| 2018 | 1918 |
| 2019 | 2034 |
| 2020 | 2007 |
| 2021 | 2036 |
| 2022 | 1981 |
| 2023 | 1791 |
| 2024 | 2011 |
| 2025 | 2040 |
| 2026 | 1982 |

TABLE Q11-continued

| with a sequence length of 2048: | |
|---|---|
| Reliability or reliability sequence number | Polarized channel sequence number |
| 2027 | 2023 |
| 2028 | 2013 |
| 2029 | 1919 |
| 2030 | 2027 |
| 2031 | 2014 |
| 2032 | 2029 |
| 2033 | 2035 |
| 2034 | 2030 |
| 2035 | 2037 |
| 2036 | 2038 |
| 2037 | 2041 |
| 2038 | 2042 |
| 2039 | 1983 |
| 2040 | 2044 |
| 2041 | 2015 |
| 2042 | 2031 |
| 2043 | 2039 |
| 2044 | 2043 |
| 2045 | 2045 |
| 2046 | 2046 |
| 2047 | 2047 |

Sequence Q12, with a sequence length of 1024

[0, 1, 2, 4, 8, 16, 32, 128, 256, 512, 3, 5, 64, 9, 6, 17, 10, 18, 12, 33, 129, 65, 20, 34, 24, 25 7, 36, 7, 66, 11, 40, 130, 513, 68, 19, 13, 48, 14, 72, 258, 132, 21, 35, 26, 80, 37, 136, 25, 22, 514, 26 0, 38, 96, 144, 67, 41, 28, 69, 160, 264, 42, 49, 74, 516, 70, 131, 44, 272, 81, 50, 133, 73, 15, 52, 288, 520, 192, 23, 76, 137, 82, 56, 384, 27, 134, 97, 528, 39, 259, 145, 84, 29, 138, 43, 261, 544, 98, 14 6, 88, 30, 320, 140, 71, 45, 640, 161, 265, 100, 51, 193, 46, 262, 768, 75, 148, 104, 273, 162, 53, 77, 515, 152, 266, 54, 164, 83, 274, 517, 57, 135, 112, 268, 194, 78, 576, 139, 289, 85, 58, 168, 385, 5 21, 99, 196, 321, 86, 147, 518, 60, 276, 141, 89, 290, 176, 529, 101, 31, 280, 142, 90, 522, 292, 20 0, 102, 263, 530, 149, 105, 163, 322, 92, 524, 47, 267, 106, 154, 545, 296, 55, 208, 386, 641, 113, 165, 324, 153, 79, 577, 275, 150, 108, 532, 269, 166, 59, 304, 546, 224, 114, 270, 195, 536, 328, 8 7, 169, 388, 769, 116, 156, 277, 548, 197, 291, 61, 170, 519, 282, 91, 177, 578, 336, 120, 293, 202, 523, 198, 392, 62, 552, 281, 172, 278, 642, 103, 209, 294, 580, 178, 352, 93, 531, 201, 400, 107, 525, 323, 143, 297, 560, 180, 94, 284, 526, 151, 325, 204, 584, 416, 109, 770, 298, 210, 184, 644, 305, 115, 330, 533, 155, 326, 547, 225, 387, 110, 538, 300, 167, 592, 337, 212, 306, 549, 117, 15 7, 648, 389, 171, 329, 537, 118, 271, 534, 226, 308, 772, 216, 448, 550, 121, 279, 158, 608, 332, 1 99, 656, 393, 173, 579, 122, 228, 553, 338, 179, 540, 312, 174, 581, 283, 63, 390, 672, 203, 353, 7 76, 232, 295, 554, 124, 401, 561, 340, 586, 181, 285, 582, 205, 394, 643, 182, 299, 556, 211, 354, 784, 95, 402, 593, 185, 344, 562, 240, 286, 645, 206, 585, 396, 327, 527, 111, 301, 564, 213, 800, 417, 186, 704, 356, 227, 535, 307, 588, 449, 214, 649, 302, 119, 594, 331, 568, 188, 404, 896, 36 0, 217, 539, 418, 646, 229, 309, 609, 333, 551, 159, 408, 771, 123, 657, 310, 218, 596, 420, 541, 3 39, 650, 230, 313, 555, 391, 773, 233, 368, 610, 220, 658, 450, 334, 600, 175, 542, 395, 832, 125, 341, 652, 314, 583, 234, 557, 424, 673, 355, 183, 777, 452, 612, 342, 563, 241, 403, 705, 207, 55 8, 316, 774, 397, 587, 236, 345, 660, 432, 616, 187, 785, 357, 674, 287, 565, 126, 589, 398, 346, 6 64, 242, 778, 456, 566, 358, 676, 215, 595, 405, 786, 361, 569, 244, 647, 419, 624, 348, 189, 780, 303, 706, 362, 590, 410, 651, 219, 801, 311, 597, 464, 570, 248, 680, 369, 897, 421, 611, 190, 70 8, 409, 833, 335, 598, 406, 659, 231, 572, 364, 788, 422, 221, 315, 653, 480, 601, 370, 802, 127, 6 88, 451, 613, 343, 543, 425, 792, 235, 654, 372, 602, 412, 804, 222, 712, 453, 614, 317, 775, 426, 661, 237, 617, 675, 347, 834, 433, 604, 376, 559, 243, 779, 458, 618, 454, 666, 318, 808, 428, 56 7, 238, 720, 359, 898, 625, 465, 677, 434, 836, 245, 665, 349, 591, 457, 787, 662, 363, 620, 246, 7 81, 399, 678, 436, 571, 350, 816, 736, 407, 626, 249, 782, 460, 707, 840, 365, 599, 466, 681, 440, 900, 250, 628, 668, 371, 789, 411, 709, 803, 481, 573, 366, 682, 191, 794, 603, 423, 689, 468, 84 8, 632, 373, 805, 413, 714, 427, 710, 904, 252, 574, 374, 793, 684, 482, 790, 472, 615, 721, 377, 8 06, 690, 223, 864, 414, 605, 713, 455, 912, 429, 619, 835, 378, 655, 809, 484, 692, 435, 606, 796, 239, 663, 837, 430, 716, 319, 928, 621, 459, 810, 722, 488, 696, 817, 380, 627, 437, 842, 667, 24 7, 838, 737, 461, 899, 622, 438, 812, 679, 467, 849, 724, 351, 818, 629, 441, 669, 496, 901, 683, 2 51, 841, 630, 462, 783, 738, 820, 367, 728, 960, 469, 633, 791, 442, 670, 844, 483, 711, 905, 470, 685, 634, 375, 740, 850, 444, 691, 824, 686, 253, 795, 575, 473, 902, 715, 485, 865, 744, 807, 41 5, 636, 913, 379, 852, 693, 474, 797, 717, 906, 486, 694, 811, 489, 723, 866, 607, 476, 914, 697, 4 31, 856, 752, 798, 254, 718, 908, 839, 381, 623, 813, 725, 490, 929, 698, 439, 868, 739, 819, 497, 961, 726, 814, 463, 631, 843, 700, 492, 916, 872, 729, 443, 930, 741, 821, 382, 845, 671, 920, 49 8, 635, 822, 730, 932, 471, 851, 742, 825, 500, 903, 745, 880, 445, 732, 962, 846, 687, 255, 907, 6 37, 853, 475, 826, 746, 936, 867, 504, 695, 964, 854, 753, 446, 915, 719, 828, 909, 487, 748, 857, 944, 477, 699, 869, 799, 638, 910, 383, 858, 754, 968, 870, 491, 727, 917, 873, 756, 478, 931, 86 0, 701, 815, 874, 493, 922, 731, 823, 976, 760, 499, 881, 933, 702, 921, 494, 847, 918, 743, 876, 9 34, 733, 501, 827, 992, 882, 639, 963, 502, 855, 937, 747, 884, 924, 734, 505, 965, 829, 938, 749, 859, 945, 506, 888, 755, 970, 966, 830, 940, 447, 750, 871, 977, 946, 757, 861, 969, 508, 875, 75 8, 911, 948, 862, 919, 761, 479, 972, 877, 978, 952, 762, 883, 923, 993, 495, 878, 703, 935, 980, 8 85, 925, 939, 764, 503, 886, 994, 984, 889, 735, 926, 967, 941, 890, 996, 507, 947, 751, 942, 831, 971, 1000, 892, 949, 759, 973, 950, 509, 979, 863, 953, 1008, 763, 974, 879, 981, 954, 995, 982, 887, 956, 510, 765, 985, 997, 927, 891, 986, 998, 1001, 988, 943, 766, 893, 1002, 951, 1009, 975, 1004, 511, 955, 894, 1010, 983, 1012, 957, 767, 987, 1016, 958, 999, 989, 895, 1003, 990, 1005, 1011, 1006, 1013, 1014, 1017, 1018, 959, 1020, 991, 1007, 1015, 1019, 1021, 1022, 1023]

TABLE Q12

| with a sequence length of 1024: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 128 |
| 8 | 256 |
| 9 | 512 |

TABLE Q12-continued

| with a sequence length of 1024: | |
|---|---|
| Reliability or reliability sequence number | Polarized channel sequence number |
| 10 | 3 |
| 11 | 5 |
| 12 | 64 |
| 13 | 9 |
| 14 | 6 |
| 15 | 17 |
| 16 | 10 |
| 17 | 18 |
| 18 | 12 |
| 19 | 33 |
| 20 | 129 |
| 21 | 65 |
| 22 | 20 |
| 23 | 34 |
| 24 | 24 |
| 25 | 257 |
| 26 | 36 |
| 27 | 7 |
| 28 | 66 |
| 29 | 11 |
| 30 | 40 |
| 31 | 130 |
| 32 | 513 |
| 33 | 68 |
| 34 | 19 |
| 35 | 13 |
| 36 | 48 |
| 37 | 14 |
| 38 | 72 |
| 39 | 258 |
| 40 | 132 |
| 41 | 21 |
| 42 | 35 |
| 43 | 26 |
| 44 | 80 |
| 45 | 37 |
| 46 | 136 |
| 47 | 25 |
| 48 | 22 |
| 49 | 514 |
| 50 | 260 |
| 51 | 38 |
| 52 | 96 |
| 53 | 144 |
| 54 | 67 |
| 55 | 41 |
| 56 | 28 |
| 57 | 69 |
| 58 | 160 |
| 59 | 264 |
| 60 | 42 |
| 61 | 49 |
| 62 | 74 |
| 63 | 516 |
| 64 | 70 |
| 65 | 131 |
| 66 | 44 |
| 67 | 272 |
| 68 | 81 |
| 69 | 50 |
| 70 | 133 |
| 71 | 73 |
| 72 | 15 |
| 73 | 52 |
| 74 | 288 |
| 75 | 520 |
| 76 | 192 |
| 77 | 23 |
| 78 | 76 |
| 79 | 137 |
| 80 | 82 |
| 81 | 56 |
| 82 | 384 |
| 83 | 27 |
| 84 | 134 |

TABLE Q12-continued

| with a sequence length of 1024: | |
|---|---|
| Reliability or reliability sequence number | Polarized channel sequence number |
| 85 | 97 |
| 86 | 528 |
| 87 | 39 |
| 88 | 259 |
| 89 | 145 |
| 90 | 84 |
| 91 | 29 |
| 92 | 138 |
| 93 | 43 |
| 94 | 261 |
| 95 | 544 |
| 96 | 98 |
| 97 | 146 |
| 98 | 88 |
| 99 | 30 |
| 100 | 320 |
| 101 | 140 |
| 102 | 71 |
| 103 | 45 |
| 104 | 640 |
| 105 | 161 |
| 106 | 265 |
| 107 | 100 |
| 108 | 51 |
| 109 | 193 |
| 110 | 46 |
| 111 | 262 |
| 112 | 768 |
| 113 | 75 |
| 114 | 148 |
| 115 | 104 |
| 116 | 273 |
| 117 | 162 |
| 118 | 53 |
| 119 | 77 |
| 120 | 515 |
| 121 | 152 |
| 122 | 266 |
| 123 | 54 |
| 124 | 164 |
| 125 | 83 |
| 126 | 274 |
| 127 | 517 |
| 128 | 57 |
| 129 | 135 |
| 130 | 112 |
| 131 | 268 |
| 132 | 194 |
| 133 | 78 |
| 134 | 576 |
| 135 | 139 |
| 136 | 289 |
| 137 | 85 |
| 138 | 58 |
| 139 | 168 |
| 140 | 385 |
| 141 | 521 |
| 142 | 99 |
| 143 | 196 |
| 144 | 321 |
| 145 | 86 |
| 146 | 147 |
| 147 | 518 |
| 148 | 60 |
| 149 | 276 |
| 150 | 141 |
| 151 | 89 |
| 152 | 290 |
| 153 | 176 |
| 154 | 529 |
| 155 | 101 |
| 156 | 31 |
| 157 | 280 |
| 158 | 142 |
| 159 | 90 |

TABLE Q12-continued

| with a sequence length of 1024: | |
|---|---|
| Reliability or reliability sequence number | Polarized channel sequence number |
| 160 | 522 |
| 161 | 292 |
| 162 | 200 |
| 163 | 102 |
| 164 | 263 |
| 165 | 530 |
| 166 | 149 |
| 167 | 105 |
| 168 | 163 |
| 169 | 322 |
| 170 | 92 |
| 171 | 524 |
| 172 | 47 |
| 173 | 267 |
| 174 | 106 |
| 175 | 154 |
| 176 | 545 |
| 177 | 296 |
| 178 | 55 |
| 179 | 208 |
| 180 | 386 |
| 181 | 641 |
| 182 | 113 |
| 183 | 165 |
| 184 | 324 |
| 185 | 153 |
| 186 | 79 |
| 187 | 577 |
| 188 | 275 |
| 189 | 150 |
| 190 | 108 |
| 191 | 532 |
| 192 | 269 |
| 193 | 166 |
| 194 | 59 |
| 195 | 304 |
| 196 | 546 |
| 197 | 224 |
| 198 | 114 |
| 199 | 270 |
| 200 | 195 |
| 201 | 536 |
| 202 | 328 |
| 203 | 87 |
| 204 | 169 |
| 205 | 388 |
| 206 | 769 |
| 207 | 116 |
| 208 | 156 |
| 209 | 277 |
| 210 | 548 |
| 211 | 197 |
| 212 | 291 |
| 213 | 61 |
| 214 | 170 |
| 215 | 519 |
| 216 | 282 |
| 217 | 91 |
| 218 | 177 |
| 219 | 578 |
| 220 | 336 |
| 221 | 120 |
| 222 | 293 |
| 223 | 202 |
| 224 | 523 |
| 225 | 198 |
| 226 | 392 |
| 227 | 62 |
| 228 | 552 |
| 229 | 281 |
| 230 | 172 |
| 231 | 278 |
| 232 | 642 |
| 233 | 103 |
| 234 | 209 |

TABLE Q12-continued

| with a sequence length of 1024: | |
|---|---|
| Reliability or reliability sequence number | Polarized channel sequence number |
| 235 | 294 |
| 236 | 580 |
| 237 | 178 |
| 238 | 352 |
| 239 | 93 |
| 240 | 531 |
| 241 | 201 |
| 242 | 400 |
| 243 | 107 |
| 244 | 525 |
| 245 | 323 |
| 246 | 143 |
| 247 | 297 |
| 248 | 560 |
| 249 | 180 |
| 250 | 94 |
| 251 | 284 |
| 252 | 526 |
| 253 | 151 |
| 254 | 325 |
| 255 | 204 |
| 256 | 584 |
| 257 | 416 |
| 258 | 109 |
| 259 | 770 |
| 260 | 298 |
| 261 | 210 |
| 262 | 184 |
| 263 | 644 |
| 264 | 305 |
| 265 | 115 |
| 266 | 330 |
| 267 | 533 |
| 268 | 155 |
| 269 | 326 |
| 270 | 547 |
| 271 | 225 |
| 272 | 387 |
| 273 | 110 |
| 274 | 538 |
| 275 | 300 |
| 276 | 167 |
| 277 | 592 |
| 278 | 337 |
| 279 | 212 |
| 280 | 306 |
| 281 | 549 |
| 282 | 117 |
| 283 | 157 |
| 284 | 648 |
| 285 | 389 |
| 286 | 171 |
| 287 | 329 |
| 288 | 537 |
| 289 | 118 |
| 290 | 271 |
| 291 | 534 |
| 292 | 226 |
| 293 | 308 |
| 294 | 772 |
| 295 | 216 |
| 296 | 448 |
| 297 | 550 |
| 298 | 121 |
| 299 | 279 |
| 300 | 158 |
| 301 | 608 |
| 302 | 332 |
| 303 | 199 |
| 304 | 656 |
| 305 | 393 |
| 306 | 173 |
| 307 | 579 |
| 308 | 122 |
| 309 | 228 |

TABLE Q12-continued

| with a sequence length of 1024: | |
|---|---|
| Reliability or reliability sequence number | Polarized channel sequence number |
| 310 | 553 |
| 311 | 338 |
| 312 | 179 |
| 313 | 540 |
| 314 | 312 |
| 315 | 174 |
| 316 | 581 |
| 317 | 283 |
| 318 | 63 |
| 319 | 390 |
| 320 | 672 |
| 321 | 203 |
| 322 | 353 |
| 323 | 776 |
| 324 | 232 |
| 325 | 295 |
| 326 | 554 |
| 327 | 124 |
| 328 | 401 |
| 329 | 561 |
| 330 | 340 |
| 331 | 586 |
| 332 | 181 |
| 333 | 285 |
| 334 | 582 |
| 335 | 205 |
| 336 | 394 |
| 337 | 643 |
| 338 | 182 |
| 339 | 299 |
| 340 | 556 |
| 341 | 211 |
| 342 | 354 |
| 343 | 784 |
| 344 | 95 |
| 345 | 402 |
| 346 | 593 |
| 347 | 185 |
| 348 | 344 |
| 349 | 562 |
| 350 | 240 |
| 351 | 286 |
| 352 | 645 |
| 353 | 206 |
| 354 | 585 |
| 355 | 396 |
| 356 | 327 |
| 357 | 527 |
| 358 | 111 |
| 359 | 301 |
| 360 | 564 |
| 361 | 213 |
| 362 | 800 |
| 363 | 417 |
| 364 | 186 |
| 365 | 704 |
| 366 | 356 |
| 367 | 227 |
| 368 | 535 |
| 369 | 307 |
| 370 | 588 |
| 371 | 449 |
| 372 | 214 |
| 373 | 649 |
| 374 | 302 |
| 375 | 119 |
| 376 | 594 |
| 377 | 331 |
| 378 | 568 |
| 379 | 188 |
| 380 | 404 |
| 381 | 896 |
| 382 | 360 |
| 383 | 217 |
| 384 | 539 |

TABLE Q12-continued

| with a sequence length of 1024: | |
|---|---|
| Reliability or reliability sequence number | Polarized channel sequence number |
| 385 | 418 |
| 386 | 646 |
| 387 | 229 |
| 388 | 309 |
| 389 | 609 |
| 390 | 333 |
| 391 | 551 |
| 392 | 159 |
| 393 | 408 |
| 394 | 771 |
| 395 | 123 |
| 396 | 657 |
| 397 | 310 |
| 398 | 218 |
| 399 | 596 |
| 400 | 420 |
| 401 | 541 |
| 402 | 339 |
| 403 | 650 |
| 404 | 230 |
| 405 | 313 |
| 406 | 555 |
| 407 | 391 |
| 408 | 773 |
| 409 | 233 |
| 410 | 368 |
| 411 | 610 |
| 412 | 220 |
| 413 | 658 |
| 414 | 450 |
| 415 | 334 |
| 416 | 600 |
| 417 | 175 |
| 418 | 542 |
| 419 | 395 |
| 420 | 832 |
| 421 | 125 |
| 422 | 341 |
| 423 | 652 |
| 424 | 314 |
| 425 | 583 |
| 426 | 234 |
| 427 | 557 |
| 428 | 424 |
| 429 | 673 |
| 430 | 355 |
| 431 | 183 |
| 432 | 777 |
| 433 | 452 |
| 434 | 612 |
| 435 | 342 |
| 436 | 563 |
| 437 | 241 |
| 438 | 403 |
| 439 | 705 |
| 440 | 207 |
| 441 | 558 |
| 442 | 316 |
| 443 | 774 |
| 444 | 397 |
| 445 | 587 |
| 446 | 236 |
| 447 | 345 |
| 448 | 660 |
| 449 | 432 |
| 450 | 616 |
| 451 | 187 |
| 452 | 785 |
| 453 | 357 |
| 454 | 674 |
| 455 | 287 |
| 456 | 565 |
| 457 | 126 |
| 458 | 589 |
| 459 | 398 |

TABLE Q12-continued

| with a sequence length of 1024: | |
|---|---|
| Reliability or reliability sequence number | Polarized channel sequence number |
| 460 | 346 |
| 461 | 664 |
| 462 | 242 |
| 463 | 778 |
| 464 | 456 |
| 465 | 566 |
| 466 | 358 |
| 467 | 676 |
| 468 | 215 |
| 469 | 595 |
| 470 | 405 |
| 471 | 786 |
| 472 | 361 |
| 473 | 569 |
| 474 | 244 |
| 475 | 647 |
| 476 | 419 |
| 477 | 624 |
| 478 | 348 |
| 479 | 189 |
| 480 | 780 |
| 481 | 303 |
| 482 | 706 |
| 483 | 362 |
| 484 | 590 |
| 485 | 410 |
| 486 | 651 |
| 487 | 219 |
| 488 | 801 |
| 489 | 311 |
| 490 | 597 |
| 491 | 464 |
| 492 | 570 |
| 493 | 248 |
| 494 | 680 |
| 495 | 369 |
| 496 | 897 |
| 497 | 421 |
| 498 | 611 |
| 499 | 190 |
| 500 | 708 |
| 501 | 409 |
| 502 | 833 |
| 503 | 335 |
| 504 | 598 |
| 505 | 406 |
| 506 | 659 |
| 507 | 231 |
| 508 | 572 |
| 509 | 364 |
| 510 | 788 |
| 511 | 422 |
| 512 | 221 |
| 513 | 315 |
| 514 | 653 |
| 515 | 480 |
| 516 | 601 |
| 517 | 370 |
| 518 | 802 |
| 519 | 127 |
| 520 | 688 |
| 521 | 451 |
| 522 | 613 |
| 523 | 343 |
| 524 | 543 |
| 525 | 425 |
| 526 | 792 |
| 527 | 235 |
| 528 | 654 |
| 529 | 372 |
| 530 | 602 |
| 531 | 412 |
| 532 | 804 |
| 533 | 222 |
| 534 | 712 |

TABLE Q12-continued

| with a sequence length of 1024: | |
|---|---|
| Reliability or reliability sequence number | Polarized channel sequence number |
| 535 | 453 |
| 536 | 614 |
| 537 | 317 |
| 538 | 775 |
| 539 | 426 |
| 540 | 661 |
| 541 | 237 |
| 542 | 617 |
| 543 | 675 |
| 544 | 347 |
| 545 | 834 |
| 546 | 433 |
| 547 | 604 |
| 548 | 376 |
| 549 | 559 |
| 550 | 243 |
| 551 | 779 |
| 552 | 458 |
| 553 | 618 |
| 554 | 454 |
| 555 | 666 |
| 556 | 318 |
| 557 | 808 |
| 558 | 428 |
| 559 | 567 |
| 560 | 238 |
| 561 | 720 |
| 562 | 359 |
| 563 | 898 |
| 564 | 625 |
| 565 | 465 |
| 566 | 677 |
| 567 | 434 |
| 568 | 836 |
| 569 | 245 |
| 570 | 665 |
| 571 | 349 |
| 572 | 591 |
| 573 | 457 |
| 574 | 787 |
| 575 | 662 |
| 576 | 363 |
| 577 | 620 |
| 578 | 246 |
| 579 | 781 |
| 580 | 399 |
| 581 | 678 |
| 582 | 436 |
| 583 | 571 |
| 584 | 350 |
| 585 | 816 |
| 586 | 736 |
| 587 | 407 |
| 588 | 626 |
| 589 | 249 |
| 590 | 782 |
| 591 | 460 |
| 592 | 707 |
| 593 | 840 |
| 594 | 365 |
| 595 | 599 |
| 596 | 466 |
| 597 | 681 |
| 598 | 440 |
| 599 | 900 |
| 600 | 250 |
| 601 | 628 |
| 602 | 668 |
| 603 | 371 |
| 604 | 789 |
| 605 | 411 |
| 606 | 709 |
| 607 | 803 |
| 608 | 481 |
| 609 | 573 |

TABLE Q12-continued

| with a sequence length of 1024: | |
|---|---|
| Reliability or reliability sequence number | Polarized channel sequence number |
| 610 | 366 |
| 611 | 682 |
| 612 | 191 |
| 613 | 794 |
| 614 | 603 |
| 615 | 423 |
| 616 | 689 |
| 617 | 468 |
| 618 | 848 |
| 619 | 632 |
| 620 | 373 |
| 621 | 805 |
| 622 | 413 |
| 623 | 714 |
| 624 | 427 |
| 625 | 710 |
| 626 | 904 |
| 627 | 252 |
| 628 | 574 |
| 629 | 374 |
| 630 | 793 |
| 631 | 684 |
| 632 | 482 |
| 633 | 790 |
| 634 | 472 |
| 635 | 615 |
| 636 | 721 |
| 637 | 377 |
| 638 | 806 |
| 639 | 690 |
| 640 | 223 |
| 641 | 864 |
| 642 | 414 |
| 643 | 605 |
| 644 | 713 |
| 645 | 455 |
| 646 | 912 |
| 647 | 429 |
| 648 | 619 |
| 649 | 835 |
| 650 | 378 |
| 651 | 655 |
| 652 | 809 |
| 653 | 484 |
| 654 | 692 |
| 655 | 435 |
| 656 | 606 |
| 657 | 796 |
| 658 | 239 |
| 659 | 663 |
| 660 | 837 |
| 661 | 430 |
| 662 | 716 |
| 663 | 319 |
| 664 | 928 |
| 665 | 621 |
| 666 | 459 |
| 667 | 810 |
| 668 | 722 |
| 669 | 488 |
| 670 | 696 |
| 671 | 817 |
| 672 | 380 |
| 673 | 627 |
| 674 | 437 |
| 675 | 842 |
| 676 | 667 |
| 677 | 247 |
| 678 | 838 |
| 679 | 737 |
| 680 | 461 |
| 681 | 899 |
| 682 | 622 |
| 683 | 438 |
| 684 | 812 |

TABLE Q12-continued with a sequence length of 1024:

| Reliability or reliability sequence number | Polarized channel sequence number |
|---|---|
| 685 | 679 |
| 686 | 467 |
| 687 | 849 |
| 688 | 724 |
| 689 | 351 |
| 690 | 818 |
| 691 | 629 |
| 692 | 441 |
| 693 | 669 |
| 694 | 496 |
| 695 | 901 |
| 696 | 683 |
| 697 | 251 |
| 698 | 841 |
| 699 | 630 |
| 700 | 462 |
| 701 | 783 |
| 702 | 738 |
| 703 | 820 |
| 704 | 367 |
| 705 | 728 |
| 706 | 960 |
| 707 | 469 |
| 708 | 633 |
| 709 | 791 |
| 710 | 442 |
| 711 | 670 |
| 712 | 844 |
| 713 | 483 |
| 714 | 711 |
| 715 | 905 |
| 716 | 470 |
| 717 | 685 |
| 718 | 634 |
| 719 | 375 |
| 720 | 740 |
| 721 | 850 |
| 722 | 444 |
| 723 | 691 |
| 724 | 824 |
| 725 | 686 |
| 726 | 253 |
| 727 | 795 |
| 728 | 575 |
| 729 | 473 |
| 730 | 902 |
| 731 | 715 |
| 732 | 485 |
| 733 | 865 |
| 734 | 744 |
| 735 | 807 |
| 736 | 415 |
| 737 | 636 |
| 738 | 913 |
| 739 | 379 |
| 740 | 852 |
| 741 | 693 |
| 742 | 474 |
| 743 | 797 |
| 744 | 717 |
| 745 | 906 |
| 746 | 486 |
| 747 | 694 |
| 748 | 811 |
| 749 | 489 |
| 750 | 723 |
| 751 | 866 |
| 752 | 607 |
| 753 | 476 |
| 754 | 914 |
| 755 | 697 |
| 756 | 431 |
| 757 | 856 |
| 758 | 752 |
| 759 | 798 |
| 760 | 254 |
| 761 | 718 |
| 762 | 908 |
| 763 | 839 |
| 764 | 381 |
| 765 | 623 |
| 766 | 813 |
| 767 | 725 |
| 768 | 490 |
| 769 | 929 |
| 770 | 698 |
| 771 | 439 |
| 772 | 868 |
| 773 | 739 |
| 774 | 819 |
| 775 | 497 |
| 776 | 961 |
| 777 | 726 |
| 778 | 814 |
| 779 | 463 |
| 780 | 631 |
| 781 | 843 |
| 782 | 700 |
| 783 | 492 |
| 784 | 916 |
| 785 | 872 |
| 786 | 729 |
| 787 | 443 |
| 788 | 930 |
| 789 | 741 |
| 790 | 821 |
| 791 | 382 |
| 792 | 845 |
| 793 | 671 |
| 794 | 920 |
| 795 | 498 |
| 796 | 635 |
| 797 | 822 |
| 798 | 730 |
| 799 | 932 |
| 800 | 471 |
| 801 | 851 |
| 802 | 742 |
| 803 | 825 |
| 804 | 500 |
| 805 | 903 |
| 806 | 745 |
| 807 | 880 |
| 808 | 445 |
| 809 | 732 |
| 810 | 962 |
| 811 | 846 |
| 812 | 687 |
| 813 | 255 |
| 814 | 907 |
| 815 | 637 |
| 816 | 853 |
| 817 | 475 |
| 818 | 826 |
| 819 | 746 |
| 820 | 936 |
| 821 | 867 |
| 822 | 504 |
| 823 | 695 |
| 824 | 964 |
| 825 | 854 |
| 826 | 753 |
| 827 | 446 |
| 828 | 915 |
| 829 | 719 |
| 830 | 828 |
| 831 | 909 |
| 832 | 487 |
| 833 | 748 |
| 834 | 857 |

TABLE Q12-continued

| with a sequence length of 1024: | |
|---|---|
| Reliability or reliability sequence number | Polarized channel sequence number |
| 835 | 944 |
| 836 | 477 |
| 837 | 699 |
| 838 | 869 |
| 839 | 799 |
| 840 | 638 |
| 841 | 910 |
| 842 | 383 |
| 843 | 858 |
| 844 | 754 |
| 845 | 968 |
| 846 | 870 |
| 847 | 491 |
| 848 | 727 |
| 849 | 917 |
| 850 | 873 |
| 851 | 756 |
| 852 | 478 |
| 853 | 931 |
| 854 | 860 |
| 855 | 701 |
| 856 | 815 |
| 857 | 874 |
| 858 | 493 |
| 859 | 922 |
| 860 | 731 |
| 861 | 823 |
| 862 | 976 |
| 863 | 760 |
| 864 | 499 |
| 865 | 881 |
| 866 | 933 |
| 867 | 702 |
| 868 | 921 |
| 869 | 494 |
| 870 | 847 |
| 871 | 918 |
| 872 | 743 |
| 873 | 876 |
| 874 | 934 |
| 875 | 733 |
| 876 | 501 |
| 877 | 827 |
| 878 | 992 |
| 879 | 882 |
| 880 | 639 |
| 881 | 963 |
| 882 | 502 |
| 883 | 855 |
| 884 | 937 |
| 885 | 747 |
| 886 | 884 |
| 887 | 924 |
| 888 | 734 |
| 889 | 505 |
| 890 | 965 |
| 891 | 829 |
| 892 | 938 |
| 893 | 749 |
| 894 | 859 |
| 895 | 945 |
| 896 | 506 |
| 897 | 888 |
| 898 | 755 |
| 899 | 970 |
| 900 | 966 |
| 901 | 830 |
| 902 | 940 |
| 903 | 447 |
| 904 | 750 |
| 905 | 871 |
| 906 | 977 |
| 907 | 946 |
| 908 | 757 |
| 909 | 861 |

TABLE Q12-continued

| with a sequence length of 1024: | |
|---|---|
| Reliability or reliability sequence number | Polarized channel sequence number |
| 910 | 969 |
| 911 | 508 |
| 912 | 875 |
| 913 | 758 |
| 914 | 911 |
| 915 | 948 |
| 916 | 862 |
| 917 | 919 |
| 918 | 761 |
| 919 | 479 |
| 920 | 972 |
| 921 | 877 |
| 922 | 978 |
| 923 | 952 |
| 924 | 762 |
| 925 | 883 |
| 926 | 923 |
| 927 | 993 |
| 928 | 495 |
| 929 | 878 |
| 930 | 703 |
| 931 | 935 |
| 932 | 980 |
| 933 | 885 |
| 934 | 925 |
| 935 | 939 |
| 936 | 764 |
| 937 | 503 |
| 938 | 886 |
| 939 | 994 |
| 940 | 984 |
| 941 | 889 |
| 942 | 735 |
| 943 | 926 |
| 944 | 967 |
| 945 | 941 |
| 946 | 890 |
| 947 | 996 |
| 948 | 507 |
| 949 | 947 |
| 950 | 751 |
| 951 | 942 |
| 952 | 831 |
| 953 | 971 |
| 954 | 1000 |
| 955 | 892 |
| 956 | 949 |
| 957 | 759 |
| 958 | 973 |
| 959 | 950 |
| 960 | 509 |
| 961 | 979 |
| 962 | 863 |
| 963 | 953 |
| 964 | 1008 |
| 965 | 763 |
| 966 | 974 |
| 967 | 879 |
| 968 | 981 |
| 969 | 954 |
| 970 | 995 |
| 971 | 982 |
| 972 | 887 |
| 973 | 956 |
| 974 | 510 |
| 975 | 765 |
| 976 | 985 |
| 977 | 997 |
| 978 | 927 |
| 979 | 891 |
| 980 | 986 |
| 981 | 998 |
| 982 | 1001 |
| 983 | 988 |
| 984 | 943 |

TABLE Q12-continued

| with a sequence length of 1024: | |
|---|---|
| Reliability or reliability sequence number | Polarized channel sequence number |
| 985 | 766 |
| 986 | 893 |
| 987 | 1002 |
| 988 | 951 |
| 989 | 1009 |
| 990 | 975 |
| 991 | 1004 |
| 992 | 511 |
| 993 | 955 |
| 994 | 894 |
| 995 | 1010 |
| 996 | 983 |
| 997 | 1012 |
| 998 | 957 |
| 999 | 767 |
| 1000 | 987 |
| 1001 | 1016 |
| 1002 | 958 |
| 1003 | 999 |
| 1004 | 989 |
| 1005 | 895 |
| 1006 | 1003 |
| 1007 | 990 |
| 1008 | 1005 |
| 1009 | 1011 |
| 1010 | 1006 |
| 1011 | 1013 |
| 1012 | 1014 |
| 1013 | 1017 |
| 1014 | 1018 |
| 1015 | 959 |
| 1016 | 1020 |
| 1017 | 991 |
| 1018 | 1007 |
| 1019 | 1015 |
| 1020 | 1019 |
| 1021 | 1021 |
| 1022 | 1022 |
| 1023 | 1023 |

Sequence Q13, with a sequence length of 512:

[0, 1, 2, 4, 8, 16, 32, 128, 256, 3, 5, 64, 9, 6, 17, 10, 18, 12, 33, 129, 65, 20, 34, 24, 257, 36, 7, 66, 11, 40, 130, 68, 19, 13, 48, 14, 72, 258, 132, 21, 35, 26, 80, 37, 136, 25, 22, 260, 38, 96, 144, 6 7, 41, 28, 69, 160, 264, 42, 49, 74, 70, 131, 44, 272, 81, 50, 133, 73, 15, 52, 288, 192, 23, 76, 137, 82, 56, 384, 27, 134, 97, 39, 259, 145, 84, 29, 138, 43, 261, 98, 146, 88, 30, 320, 140, 71, 45, 161, 265, 100, 51, 193, 46, 262, 75, 148, 104, 273, 162, 53, 77, 152, 266, 54, 164, 83, 274, 57, 135, 112, 268, 194, 78, 139, 289, 85, 58, 168, 385, 99, 196, 321, 86, 147, 60, 276, 141, 89, 290, 176, 101, 31, 280, 142, 90, 292, 200, 102, 263, 149, 105, 163, 322, 92, 47, 267, 106, 154, 296, 55, 208, 386, 113, 165, 324, 153, 79, 275, 150, 108, 269, 166, 59, 304, 224, 114, 270, 195, 328, 87, 169, 388, 116, 156, 2 77, 197, 291, 61, 170, 282, 91, 177, 336, 120, 293, 202, 198, 392, 62, 281, 172, 278, 103, 209, 294, 178, 352, 93, 201, 400, 107, 323, 143, 297, 180, 94, 284, 151, 325, 204, 416, 109, 298, 210, 184, 305, 115, 330, 155, 326, 225, 387, 110, 300, 167, 337, 212, 306, 117, 157, 389, 171, 329, 118, 271, 226, 308, 216, 448, 121, 279, 158, 332, 199, 393, 173, 122, 228, 338, 179, 312, 174, 283, 63, 390, 203, 353, 232, 295, 124, 401, 340, 181, 285, 205, 394, 182, 299, 211, 354, 95, 402, 185, 344, 240, 286, 206, 396, 327, 111, 301, 213, 417, 186, 356, 227, 307, 449, 214, 302, 119, 331, 188, 404, 36 0, 217, 418, 229, 309, 333, 159, 408, 123, 310, 218, 420, 339, 230, 313, 391, 233, 368, 220, 450, 3 34, 175, 395, 125, 341, 314, 234, 424, 355, 183, 452, 342, 241, 403, 207, 316, 397, 236, 345, 432, 187, 357, 287, 126, 398, 346, 242, 456, 358, 215, 405, 361, 244, 419, 348, 189, 303, 362, 410, 21 9, 311, 464, 248, 369, 421, 190, 409, 335, 406, 231, 364, 422, 221, 315, 480, 370, 127, 451, 343, 4 25, 235, 372, 412, 222, 453, 317, 426, 237, 347, 433, 376, 243, 458, 454, 318, 428, 238, 359, 465, 434, 245, 349, 457, 363, 246, 399, 436, 350, 407, 249, 460, 365, 466, 440, 250, 371, 411, 481, 36 6, 191, 423, 468, 373, 413, 427, 252, 374, 482, 472, 377, 223, 414, 455, 429, 378, 484, 435, 239, 4 30, 319, 459, 488, 380, 437, 247, 461, 438, 467, 351, 441, 496, 251, 462, 367, 469, 442, 483, 470, 375, 444, 253, 473, 485, 415, 379, 474, 486, 489, 476, 431, 254, 381, 490, 439, 497, 463, 492, 44 3, 382, 498, 471, 500, 445, 255, 475, 504, 446, 487, 477, 383, 491, 478, 493, 499, 494, 501, 502, 5 05, 506, 447, 508, 479, 495, 503, 507, 509, 510, 511]

TABLE Q13

| with a sequence length of 512: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 128 |
| 8 | 256 |
| 9 | 3 |
| 10 | 5 |
| 11 | 64 |
| 12 | 9 |
| 13 | 6 |
| 14 | 17 |
| 15 | 10 |
| 16 | 18 |
| 17 | 12 |
| 18 | 33 |
| 19 | 129 |
| 20 | 65 |
| 21 | 20 |
| 22 | 34 |
| 23 | 24 |
| 24 | 257 |
| 25 | 36 |
| 26 | 7 |
| 27 | 66 |
| 28 | 11 |
| 29 | 40 |
| 30 | 130 |
| 31 | 68 |
| 32 | 19 |
| 33 | 13 |
| 34 | 48 |
| 35 | 14 |
| 36 | 72 |
| 37 | 258 |
| 38 | 132 |
| 39 | 21 |
| 40 | 35 |
| 41 | 26 |
| 42 | 80 |
| 43 | 37 |
| 44 | 136 |
| 45 | 25 |
| 46 | 22 |
| 47 | 260 |
| 48 | 38 |
| 49 | 96 |
| 50 | 144 |

TABLE Q13-continued

| with a sequence length of 512: | |
|---|---|
| Reliability or reliability sequence number | Polarized channel sequence number |
| 51 | 67 |
| 52 | 41 |
| 53 | 28 |
| 54 | 69 |
| 55 | 160 |
| 56 | 264 |
| 57 | 42 |
| 58 | 49 |
| 59 | 74 |
| 60 | 70 |
| 61 | 131 |
| 62 | 44 |
| 63 | 272 |
| 64 | 81 |
| 65 | 50 |
| 66 | 133 |
| 67 | 73 |
| 68 | 15 |
| 69 | 52 |
| 70 | 288 |
| 71 | 192 |
| 72 | 23 |
| 73 | 76 |
| 74 | 137 |
| 75 | 82 |
| 76 | 56 |
| 77 | 384 |
| 78 | 27 |
| 79 | 134 |
| 80 | 97 |
| 81 | 39 |
| 82 | 259 |
| 83 | 145 |
| 84 | 84 |
| 85 | 29 |
| 86 | 138 |
| 87 | 43 |
| 88 | 261 |
| 89 | 98 |
| 90 | 146 |
| 91 | 88 |
| 92 | 30 |
| 93 | 320 |
| 94 | 140 |
| 95 | 71 |
| 96 | 45 |
| 97 | 161 |
| 98 | 265 |
| 99 | 100 |
| 100 | 51 |
| 101 | 193 |
| 102 | 46 |
| 103 | 262 |
| 104 | 75 |
| 105 | 148 |
| 106 | 104 |
| 107 | 273 |
| 108 | 162 |
| 109 | 53 |
| 110 | 77 |
| 111 | 152 |
| 112 | 266 |
| 113 | 54 |
| 114 | 164 |
| 115 | 83 |
| 116 | 274 |
| 117 | 57 |
| 118 | 135 |
| 119 | 112 |
| 120 | 268 |
| 121 | 194 |
| 122 | 78 |
| 123 | 139 |
| 124 | 289 |
| 125 | 85 |

TABLE Q13-continued

| with a sequence length of 512: | |
|---|---|
| Reliability or reliability sequence number | Polarized channel sequence number |
| 126 | 58 |
| 127 | 168 |
| 128 | 385 |
| 129 | 99 |
| 130 | 196 |
| 131 | 321 |
| 132 | 86 |
| 133 | 147 |
| 134 | 60 |
| 135 | 276 |
| 136 | 141 |
| 137 | 89 |
| 138 | 290 |
| 139 | 176 |
| 140 | 101 |
| 141 | 31 |
| 142 | 280 |
| 143 | 142 |
| 144 | 90 |
| 145 | 292 |
| 146 | 200 |
| 147 | 102 |
| 148 | 263 |
| 149 | 149 |
| 150 | 105 |
| 151 | 163 |
| 152 | 322 |
| 153 | 92 |
| 154 | 47 |
| 155 | 267 |
| 156 | 106 |
| 157 | 154 |
| 158 | 296 |
| 159 | 55 |
| 160 | 208 |
| 161 | 386 |
| 162 | 113 |
| 163 | 165 |
| 164 | 324 |
| 165 | 153 |
| 166 | 79 |
| 167 | 275 |
| 168 | 150 |
| 169 | 108 |
| 170 | 269 |
| 171 | 166 |
| 172 | 59 |
| 173 | 304 |
| 174 | 224 |
| 175 | 114 |
| 176 | 270 |
| 177 | 195 |
| 178 | 328 |
| 179 | 87 |
| 180 | 169 |
| 181 | 388 |
| 182 | 116 |
| 183 | 156 |
| 184 | 277 |
| 185 | 197 |
| 186 | 291 |
| 187 | 61 |
| 188 | 170 |
| 189 | 282 |
| 190 | 91 |
| 191 | 177 |
| 192 | 336 |
| 193 | 120 |
| 194 | 293 |
| 195 | 202 |
| 196 | 198 |
| 197 | 392 |
| 198 | 62 |
| 199 | 281 |
| 200 | 172 |

TABLE Q13-continued

| with a sequence length of 512: | |
|---|---|
| Reliability or reliability sequence number | Polarized channel sequence number |
| 201 | 278 |
| 202 | 103 |
| 203 | 209 |
| 204 | 294 |
| 205 | 178 |
| 206 | 352 |
| 207 | 93 |
| 208 | 201 |
| 209 | 400 |
| 210 | 107 |
| 211 | 323 |
| 212 | 143 |
| 213 | 297 |
| 214 | 180 |
| 215 | 94 |
| 216 | 284 |
| 217 | 151 |
| 218 | 325 |
| 219 | 204 |
| 220 | 416 |
| 221 | 109 |
| 222 | 298 |
| 223 | 210 |
| 224 | 184 |
| 225 | 305 |
| 226 | 115 |
| 227 | 330 |
| 228 | 155 |
| 229 | 326 |
| 230 | 225 |
| 231 | 387 |
| 232 | 110 |
| 233 | 300 |
| 234 | 167 |
| 235 | 337 |
| 236 | 212 |
| 237 | 306 |
| 238 | 117 |
| 239 | 157 |
| 240 | 389 |
| 241 | 171 |
| 242 | 329 |
| 243 | 118 |
| 244 | 271 |
| 245 | 226 |
| 246 | 308 |
| 247 | 216 |
| 248 | 448 |
| 249 | 121 |
| 250 | 279 |
| 251 | 158 |
| 252 | 332 |
| 253 | 199 |
| 254 | 393 |
| 255 | 173 |
| 256 | 122 |
| 257 | 228 |
| 258 | 338 |
| 259 | 179 |
| 260 | 312 |
| 261 | 174 |
| 262 | 283 |
| 263 | 63 |
| 264 | 390 |
| 265 | 203 |
| 266 | 353 |
| 267 | 232 |
| 268 | 295 |
| 269 | 124 |
| 270 | 401 |
| 271 | 340 |
| 272 | 181 |
| 273 | 285 |
| 274 | 205 |
| 275 | 394 |

TABLE Q13-continued

| with a sequence length of 512: | |
|---|---|
| Reliability or reliability sequence number | Polarized channel sequence number |
| 276 | 182 |
| 277 | 299 |
| 278 | 211 |
| 279 | 354 |
| 280 | 95 |
| 281 | 402 |
| 282 | 185 |
| 283 | 344 |
| 284 | 240 |
| 285 | 286 |
| 286 | 206 |
| 287 | 396 |
| 288 | 327 |
| 289 | 111 |
| 290 | 301 |
| 291 | 213 |
| 292 | 417 |
| 293 | 186 |
| 294 | 356 |
| 295 | 227 |
| 296 | 307 |
| 297 | 449 |
| 298 | 214 |
| 299 | 302 |
| 300 | 119 |
| 301 | 331 |
| 302 | 188 |
| 303 | 404 |
| 304 | 360 |
| 305 | 217 |
| 306 | 418 |
| 307 | 229 |
| 308 | 309 |
| 309 | 333 |
| 310 | 159 |
| 311 | 408 |
| 312 | 123 |
| 313 | 310 |
| 314 | 218 |
| 315 | 420 |
| 316 | 339 |
| 317 | 230 |
| 318 | 313 |
| 319 | 391 |
| 320 | 233 |
| 321 | 368 |
| 322 | 220 |
| 323 | 450 |
| 324 | 334 |
| 325 | 175 |
| 326 | 395 |
| 327 | 125 |
| 328 | 341 |
| 329 | 314 |
| 330 | 234 |
| 331 | 424 |
| 332 | 355 |
| 333 | 183 |
| 334 | 452 |
| 335 | 342 |
| 336 | 241 |
| 337 | 403 |
| 338 | 207 |
| 339 | 316 |
| 340 | 397 |
| 341 | 236 |
| 342 | 345 |
| 343 | 432 |
| 344 | 187 |
| 345 | 357 |
| 346 | 287 |
| 347 | 126 |
| 348 | 398 |
| 349 | 346 |
| 350 | 242 |

TABLE Q13-continued with a sequence length of 512:

| Reliability or reliability sequence number | Polarized channel sequence number |
|---|---|
| 351 | 456 |
| 352 | 358 |
| 353 | 215 |
| 354 | 405 |
| 355 | 361 |
| 356 | 244 |
| 357 | 419 |
| 358 | 348 |
| 359 | 189 |
| 360 | 303 |
| 361 | 362 |
| 362 | 410 |
| 363 | 219 |
| 364 | 311 |
| 365 | 464 |
| 366 | 248 |
| 367 | 369 |
| 368 | 421 |
| 369 | 190 |
| 370 | 409 |
| 371 | 335 |
| 372 | 406 |
| 373 | 231 |
| 374 | 364 |
| 375 | 422 |
| 376 | 221 |
| 377 | 315 |
| 378 | 480 |
| 379 | 370 |
| 380 | 127 |
| 381 | 451 |
| 382 | 343 |
| 383 | 425 |
| 384 | 235 |
| 385 | 372 |
| 386 | 412 |
| 387 | 222 |
| 388 | 453 |
| 389 | 317 |
| 390 | 426 |
| 391 | 237 |
| 392 | 347 |
| 393 | 433 |
| 394 | 376 |
| 395 | 243 |
| 396 | 458 |
| 397 | 454 |
| 398 | 318 |
| 399 | 428 |
| 400 | 238 |
| 401 | 359 |
| 402 | 465 |
| 403 | 434 |
| 404 | 245 |
| 405 | 349 |
| 406 | 457 |
| 407 | 363 |
| 408 | 246 |
| 409 | 399 |
| 410 | 436 |
| 411 | 350 |
| 412 | 407 |
| 413 | 249 |
| 414 | 460 |
| 415 | 365 |
| 416 | 466 |
| 417 | 440 |
| 418 | 250 |
| 419 | 371 |
| 420 | 411 |
| 421 | 481 |
| 422 | 366 |
| 423 | 191 |
| 424 | 423 |
| 425 | 468 |

TABLE Q13-continued with a sequence length of 512:

| Reliability or reliability sequence number | Polarized channel sequence number |
|---|---|
| 426 | 373 |
| 427 | 413 |
| 428 | 427 |
| 429 | 252 |
| 430 | 374 |
| 431 | 482 |
| 432 | 472 |
| 433 | 377 |
| 434 | 223 |
| 435 | 414 |
| 436 | 455 |
| 437 | 429 |
| 438 | 378 |
| 439 | 484 |
| 440 | 435 |
| 441 | 239 |
| 442 | 430 |
| 443 | 319 |
| 444 | 459 |
| 445 | 488 |
| 446 | 380 |
| 447 | 437 |
| 448 | 247 |
| 449 | 461 |
| 450 | 438 |
| 451 | 467 |
| 452 | 351 |
| 453 | 441 |
| 454 | 496 |
| 455 | 251 |
| 456 | 462 |
| 457 | 367 |
| 458 | 469 |
| 459 | 442 |
| 460 | 483 |
| 461 | 470 |
| 462 | 375 |
| 463 | 444 |
| 464 | 253 |
| 465 | 473 |
| 466 | 485 |
| 467 | 415 |
| 468 | 379 |
| 469 | 474 |
| 470 | 486 |
| 471 | 489 |
| 472 | 476 |
| 473 | 431 |
| 474 | 254 |
| 475 | 381 |
| 476 | 490 |
| 477 | 439 |
| 478 | 497 |
| 479 | 463 |
| 480 | 492 |
| 481 | 443 |
| 482 | 382 |
| 483 | 498 |
| 484 | 471 |
| 485 | 500 |
| 486 | 445 |
| 487 | 255 |
| 488 | 475 |
| 489 | 504 |
| 490 | 446 |
| 491 | 487 |
| 492 | 477 |
| 493 | 383 |
| 494 | 491 |
| 495 | 478 |
| 496 | 493 |
| 497 | 499 |
| 498 | 494 |
| 499 | 501 |
| 500 | 502 |

TABLE Q13-continued

| with a sequence length of 512: | |
|---|---|
| Reliability or reliability sequence number | Polarized channel sequence number |
| 501 | 505 |
| 502 | 506 |
| 503 | 447 |
| 504 | 508 |
| 505 | 479 |
| 506 | 495 |
| 507 | 503 |
| 508 | 507 |
| 509 | 509 |
| 510 | 510 |
| 511 | 511 |

Sequence Q14, with a sequence length of 256:

[0, 1, 2, 4, 8, 16, 32, 128, 3, 5, 64, 9, 6, 17, 10, 18, 12, 33, 129, 65, 20, 34, 24, 36, 7, 66, 11, 40, 130, 68, 19, 13, 48, 14, 72, 132, 21, 35, 26, 80, 37, 136, 25, 22, 38, 96, 144, 67, 41, 28, 69, 160, 4 2, 49, 74, 70, 131, 44, 81, 50, 133, 73, 15, 52, 192, 23, 76, 137, 82, 56, 27, 134, 97, 39, 145, 84, 29, 1 38, 43, 98, 146, 88, 30, 140, 71, 45, 161, 100, 51, 193, 46, 75, 148, 104, 162, 53, 77, 152, 54, 164, 8 3, 57, 135, 112, 194, 78, 139, 85, 58, 168, 99, 196, 86, 147, 60, 141, 89, 176, 101, 31, 142, 90, 200, 102, 149, 105, 163, 92, 47, 106, 154, 55, 208, 113, 165, 153, 79, 150, 108, 166, 59, 224, 114, 195, 87, 169, 116, 156, 197, 61, 170, 91, 177, 120, 202, 198, 62, 172, 103, 209, 178, 93, 201, 107, 143, 180, 94, 151, 204, 109, 210, 184, 115, 155, 225, 110, 167, 212, 117, 157, 171, 118, 226, 216, 121, 158, 199, 173, 122, 228, 179, 174, 63, 203, 232, 124, 181, 205, 182, 211, 95, 185, 240, 206, 111, 2 13, 186, 227, 214, 119, 188, 217, 229, 159, 123, 218, 230, 233, 220, 175, 125, 234, 183, 241, 207, 236, 187, 126, 242, 215, 244, 189, 219, 248, 190, 231, 221, 127, 235, 222, 237, 243, 238, 245, 24 6, 249, 250, 191, 252, 223, 239, 247, 251, 253, 254, 255]

TABLE Q14

| with a sequence length of 256: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 128 |
| 8 | 3 |
| 9 | 5 |
| 10 | 64 |
| 11 | 9 |
| 12 | 6 |
| 13 | 17 |
| 14 | 10 |
| 15 | 18 |
| 16 | 12 |
| 17 | 33 |
| 18 | 129 |
| 19 | 65 |
| 20 | 20 |
| 21 | 34 |
| 22 | 24 |
| 23 | 36 |
| 24 | 7 |
| 25 | 66 |

TABLE Q14-continued

| with a sequence length of 256: | |
|---|---|
| Reliability or reliability sequence number | Polarized channel sequence number |
| 26 | 11 |
| 27 | 40 |
| 28 | 130 |
| 29 | 68 |
| 30 | 19 |
| 31 | 13 |
| 32 | 48 |
| 33 | 14 |
| 34 | 72 |
| 35 | 132 |
| 36 | 21 |
| 37 | 35 |
| 38 | 26 |
| 39 | 80 |
| 40 | 37 |
| 41 | 136 |
| 42 | 25 |
| 43 | 22 |
| 44 | 38 |
| 45 | 96 |
| 46 | 144 |
| 47 | 67 |
| 48 | 41 |
| 49 | 28 |
| 50 | 69 |
| 51 | 160 |
| 52 | 42 |
| 53 | 49 |
| 54 | 74 |
| 55 | 70 |
| 56 | 131 |
| 57 | 44 |
| 58 | 81 |
| 59 | 50 |
| 60 | 133 |
| 61 | 73 |
| 62 | 15 |
| 63 | 52 |
| 64 | 192 |
| 65 | 23 |
| 66 | 76 |
| 67 | 137 |
| 68 | 82 |
| 69 | 56 |
| 70 | 27 |
| 71 | 134 |
| 72 | 97 |
| 73 | 39 |
| 74 | 145 |
| 75 | 84 |
| 76 | 29 |
| 77 | 138 |
| 78 | 43 |
| 79 | 98 |
| 80 | 146 |
| 81 | 88 |
| 82 | 30 |
| 83 | 140 |
| 84 | 71 |
| 85 | 45 |
| 86 | 161 |
| 87 | 100 |
| 88 | 51 |
| 89 | 193 |
| 90 | 46 |
| 91 | 75 |
| 92 | 148 |
| 93 | 104 |
| 94 | 162 |
| 95 | 53 |
| 96 | 77 |
| 97 | 152 |
| 98 | 54 |
| 99 | 164 |
| 100 | 83 |

TABLE Q14-continued

| with a sequence length of 256: | |
|---|---|
| Reliability or reliability sequence number | Polarized channel sequence number |
| 101 | 57 |
| 102 | 135 |
| 103 | 112 |
| 104 | 194 |
| 105 | 78 |
| 106 | 139 |
| 107 | 85 |
| 108 | 58 |
| 109 | 168 |
| 110 | 99 |
| 111 | 196 |
| 112 | 86 |
| 113 | 147 |
| 114 | 60 |
| 115 | 141 |
| 116 | 89 |
| 117 | 176 |
| 118 | 101 |
| 119 | 31 |
| 120 | 142 |
| 121 | 90 |
| 122 | 200 |
| 123 | 102 |
| 124 | 149 |
| 125 | 105 |
| 126 | 163 |
| 127 | 92 |
| 128 | 47 |
| 129 | 106 |
| 130 | 154 |
| 131 | 55 |
| 132 | 208 |
| 133 | 113 |
| 134 | 165 |
| 135 | 153 |
| 136 | 79 |
| 137 | 150 |
| 138 | 108 |
| 139 | 166 |
| 140 | 59 |
| 141 | 224 |
| 142 | 114 |
| 143 | 195 |
| 144 | 87 |
| 145 | 169 |
| 146 | 116 |
| 147 | 156 |
| 148 | 197 |
| 149 | 61 |
| 150 | 170 |
| 151 | 91 |
| 152 | 177 |
| 153 | 120 |
| 154 | 202 |
| 155 | 198 |
| 156 | 62 |
| 157 | 172 |
| 158 | 103 |
| 159 | 209 |
| 160 | 178 |
| 161 | 93 |
| 162 | 201 |
| 163 | 107 |
| 164 | 143 |
| 165 | 180 |
| 166 | 94 |
| 167 | 151 |
| 168 | 204 |
| 169 | 109 |
| 170 | 210 |
| 171 | 184 |
| 172 | 115 |
| 173 | 155 |
| 174 | 225 |
| 175 | 110 |

TABLE Q14-continued

| with a sequence length of 256: | |
|---|---|
| Reliability or reliability sequence number | Polarized channel sequence number |
| 176 | 167 |
| 177 | 212 |
| 178 | 117 |
| 179 | 157 |
| 180 | 171 |
| 181 | 118 |
| 182 | 226 |
| 183 | 216 |
| 184 | 121 |
| 185 | 158 |
| 186 | 199 |
| 187 | 173 |
| 188 | 122 |
| 189 | 228 |
| 190 | 179 |
| 191 | 174 |
| 192 | 63 |
| 193 | 203 |
| 194 | 232 |
| 195 | 124 |
| 196 | 181 |
| 197 | 205 |
| 198 | 182 |
| 199 | 211 |
| 200 | 95 |
| 201 | 185 |
| 202 | 240 |
| 203 | 206 |
| 204 | 111 |
| 205 | 213 |
| 206 | 186 |
| 207 | 227 |
| 208 | 214 |
| 209 | 119 |
| 210 | 188 |
| 211 | 217 |
| 212 | 229 |
| 213 | 159 |
| 214 | 123 |
| 215 | 218 |
| 216 | 230 |
| 217 | 233 |
| 218 | 220 |
| 219 | 175 |
| 220 | 125 |
| 221 | 234 |
| 222 | 183 |
| 223 | 241 |
| 224 | 207 |
| 225 | 236 |
| 226 | 187 |
| 227 | 126 |
| 228 | 242 |
| 229 | 215 |
| 230 | 244 |
| 231 | 189 |
| 232 | 219 |
| 233 | 248 |
| 234 | 190 |
| 235 | 231 |
| 236 | 221 |
| 237 | 127 |
| 238 | 235 |
| 239 | 222 |
| 240 | 237 |
| 241 | 243 |
| 242 | 238 |
| 243 | 245 |
| 244 | 246 |
| 245 | 249 |
| 246 | 250 |
| 247 | 191 |
| 248 | 252 |
| 249 | 223 |
| 250 | 239 |

TABLE Q14-continued

| with a sequence length of 256: | |
|---|---|
| Reliability or reliability sequence number | Polarized channel sequence number |
| 251 | 247 |
| 252 | 251 |
| 253 | 253 |
| 254 | 254 |
| 255 | 255 |

Sequence Q15, with a sequence length of 128: [0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 26, 80, 37, 25, 22, 38, 96, 67, 41, 28, 69, 42, 49, 74, 70, 44, 81, 50, 73, 15, 52, 2 3, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 1 27]

TABLE Q15

| with a sequence length of 128: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 65 |
| 18 | 20 |
| 19 | 34 |
| 20 | 24 |
| 21 | 36 |
| 22 | 7 |
| 23 | 66 |
| 24 | 11 |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 38 |
| 40 | 96 |
| 41 | 67 |
| 42 | 41 |
| 43 | 28 |
| 44 | 69 |
| 45 | 42 |

TABLE Q15-continued

| with a sequence length of 128: | |
|---|---|
| Reliability or reliability sequence number | Polarized channel sequence number |
| 46 | 49 |
| 47 | 74 |
| 48 | 70 |
| 49 | 44 |
| 50 | 81 |
| 51 | 50 |
| 52 | 73 |
| 53 | 15 |
| 54 | 52 |
| 55 | 23 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 31 |
| 90 | 90 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |

TABLE Q15-continued

| with a sequence length of 128: | |
|---|---|
| Reliability or reliability sequence number | Polarized channel sequence number |
| 121 | 95 |
| 122 | 111 |
| 123 | 119 |
| 124 | 123 |
| 125 | 125 |
| 126 | 126 |
| 127 | 127 |

Sequence Q16, with a sequence length of 64:

[0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 5 8, 60, 31, 47, 55, 59, 61, 62, 63]

TABLE Q16

| with a sequence length of 64: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 9 |
| 10 | 6 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |
| 26 | 14 |
| 27 | 21 |
| 28 | 35 |
| 29 | 26 |
| 30 | 37 |
| 31 | 25 |
| 32 | 22 |
| 33 | 38 |
| 34 | 41 |
| 35 | 28 |
| 36 | 42 |
| 37 | 49 |
| 38 | 44 |
| 39 | 50 |
| 40 | 15 |
| 41 | 52 |
| 42 | 23 |
| 43 | 56 |
| 44 | 27 |
| 45 | 39 |
| 46 | 29 |
| 47 | 43 |
| 48 | 30 |
| 49 | 45 |

TABLE Q16-continued

| with a sequence length of 64: | |
|---|---|
| Reliability or reliability sequence number | Polarized channel sequence number |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z9, with a sequence length of 8192:

0, 1, 2, 13, 3, 14, 17, 30, 4, 16, 19, 32, 21, 38, 40, 79, 5, 18, 20, 37, 25, 45, 54, 85, 27, 52, 4 8, 92, 62, 101, 111, 178, 6, 22, 26, 46, 29, 50, 57, 97, 33, 61, 66, 103, 73, 115, 123, 198, 39, 67, 76, 1 20, 80, 133, 139, 204, 90, 144, 156, 225, 168, 249, 268, 395, 15, 24, 31, 60, 36, 63, 71, 114, 42, 78, 69, 126, 86, 134, 150, 215, 49, 75, 89, 141, 100, 155, 165, 238, 110, 172, 181, 255, 195, 284, 299, 434, 58, 95, 107, 161, 119, 177, 187, 275, 129, 192, 200, 289, 220, 309, 330, 456, 146, 211, 230, 3 20, 242, 343, 353, 483, 260, 365, 381, 516, 408, 558, 622, 742, 7, 23, 34, 72, 44, 77, 94, 145, 51, 87, 102, 153, 113, 170, 180, 293, 59, 99, 109, 166, 127, 191, 219, 304, 136, 214, 201, 323, 243, 344, 369, 510, 64, 117, 131, 193, 140, 212, 224, 335, 157, 239, 251, 349, 272, 377, 391, 552, 175, 257, 282, 387, 298, 416, 425, 577, 316, 439, 466, 611, 489, 663, 702, 947, 84, 122, 148, 232, 163, 247, 266, 373, 186, 286, 263, 400, 306, 421, 449, 592, 206, 277, 313, 430, 339, 461, 478, 643, 362, 49 5, 520, 677, 543, 726, 769, 1019, 229, 328, 357, 469, 382, 502, 531, 716, 404, 538, 567, 757, 602, 785, 826, 1067, 443, 587, 631, 805, 654, 847, 867, 1121, 689, 893, 920, 1181, 985, 1273, 1390, 1 599, 8, 28, 43, 98, 56, 104, 124, 188, 65, 118, 138, 199, 147, 223, 231, 355, 74, 130, 142, 218, 169, 245, 273, 368, 179, 271, 254, 394, 300, 417, 445, 617, 82, 154, 173, 248, 183, 261, 279, 406, 203, 295, 312, 426, 334, 457, 480, 667, 227, 319, 341, 474, 358, 504, 518, 682, 389, 532, 564, 728, 59 5, 778, 818, 1081, 112, 164, 194, 292, 213, 305, 325, 452, 236, 351, 321, 486, 372, 507, 548, 708, 259, 337, 385, 527, 413, 562, 582, 750, 440, 603, 627, 792, 662, 851, 881, 1156, 283, 402, 432, 5 74, 468, 615, 638, 832, 494, 649, 670, 862, 720, 905, 943, 1203, 541, 694, 737, 925, 761, 967, 99 0, 1249, 801, 1011, 1046, 1319, 1107, 1405, 1507, 1736, 91, 159, 208, 329, 240, 347, 396, 535, 2 67, 376, 422, 556, 451, 599, 626, 873, 288, 409, 436, 588, 491, 645, 713, 889, 511, 705, 674, 931, 764, 972, 1023, 1309, 308, 463, 500, 657, 523, 697, 725, 955, 571, 754, 781, 977, 822, 1037, 107 5, 1376, 608, 797, 842, 1060, 877, 1112, 1138, 1430, 914, 1165, 1222, 1492, 1260, 1577, 1663, 2 102, 363, 477, 547, 745, 579, 773, 814, 1033, 635, 857, 809, 1089, 897, 1129, 1190, 1459, 686, 8 37, 909, 1147, 960, 1211, 1241, 1543, 1004, 1284, 1329, 1616, 1365, 1705, 1788, 2227, 733, 93 8, 997, 1231, 1053, 1294, 1344, 1685, 1098, 1355, 1420, 1759, 1474, 1818, 1880, 2306, 1172, 1 445, 1522, 1851, 1561, 1921, 1958, 2392, 1638, 2004, 2052, 2503, 2160, 2640, 2834, 3174, 9, 3 5, 55, 135, 70, 143, 167, 252, 83, 160, 182, 264, 197, 291, 301, 454, 96, 176, 190, 285, 222, 322, 3 56, 471, 233, 352, 331, 496, 388, 526, 553, 751, 106, 202, 228, 327, 246, 342, 364, 508, 269, 383, 407, 533, 427, 569, 593, 804, 297, 412, 442, 585, 460, 621, 636, 825, 488, 652, 687, 878, 719, 94 0, 989, 1281, 151, 217, 258, 378, 281, 392, 420, 566, 307, 450, 414, 601, 475, 624, 672, 853, 336, 437, 484, 644, 521, 684, 712, 907, 551, 734, 763, 952, 799, 1027, 1062, 1363, 371, 505, 542, 699, 581, 746, 775, 1006, 610, 789, 813, 1041, 865, 1088, 1136, 1409, 658, 836, 890, 1110, 921, 116 3, 1186, 1463, 966, 1215, 1248, 1528, 1312, 1609, 1725, 1946, 116, 209, 274, 423, 317, 446, 50 1, 655, 345, 479, 528, 676, 563, 731, 760, 1048, 375, 517, 545, 715, 606, 784, 861, 1070, 630, 84 9, 816, 1117, 924, 1168, 1224, 1514, 397, 572, 616, 790, 641, 841, 874, 1143, 690, 912, 945, 117 8, 996, 1245, 1270, 1595, 743, 957, 1015, 1264, 1056, 1326, 1347, 1644, 1101, 1372, 1426, 171 1, 1471, 1802, 1869, 2323, 467, 589, 668, 900, 703, 932, 981, 1235, 772, 1029, 975, 1292, 1078, 1336, 1394, 1671, 830, 1008, 1095, 1358, 1154, 1416, 1452, 1765, 1206, 1488, 1535, 1828, 15 82, 1917, 1996, 2442, 885, 1128, 1197, 1437, 1253, 1499, 1552, 1898, 1301, 1568, 1626, 1977, 1689, 2030, 2109, 2524, 1383, 1657, 1745, 2064, 1781, 2138, 2177, 2604, 1847, 2219, 2269, 2 704, 2381, 2848, 3027, 3359, 125, 241, 311, 513, 361, 536, 597, 780, 403, 578, 634, 808, 664, 86 9, 895, 1193, 433, 613, 648, 858, 724, 928, 1000, 1218, 755, 992, 951, 1277, 1064, 1333, 1387, 1 719, 462, 680, 738, 936, 767, 970, 1014, 1305, 820, 1051, 1092, 1351, 1142, 1412, 1456, 1807, 884, 1103, 1160, 1441, 1199, 1503, 1532, 1835, 1267, 1557, 1620, 1928, 1678, 2018, 2087, 25 48, 557, 707, 796, 1042, 845, 1074, 1124, 1401, 901, 1185, 1115, 1467, 1228, 1510, 1591, 1886, 962, 1150, 1257, 1547, 1322, 1613, 1653, 1965, 1379, 1696, 1739, 2038, 1795, 2145, 2203, 26 66, 1022, 1298, 1361, 1634, 1433, 1715, 1755, 2117, 1484, 1776, 1814, 2169, 1902, 2243, 231 5, 2730, 1573, 1857, 1940, 2278, 1984, 2352, 2401, 2803, 2060, 2433, 2480, 2915, 2580, 3047, 3225, 3560, 492, 695, 834, 1133, 916, 1175, 1288, 1564, 982, 1239, 1340, 1605, 1398, 1681, 17 29, 2187, 1034, 1316, 1368, 1667, 1481, 1769, 1892, 2210, 1518, 1876, 1824, 2286, 1992, 236 4, 2453, 2897, 1084, 1424, 1495, 1791, 1539, 1862, 1910, 2332, 1630, 1973, 2026, 2372, 2094, 2471, 2536, 3005, 1699, 2045, 2130, 2512, 2195, 2592, 2628, 3085, 2262, 2678, 2760, 3199, 2 817, 3331, 3454, 4085, 1210, 1448, 1586, 1954, 1648, 2011, 2079, 2459, 1750, 2153, 2072, 25 57, 2234, 2616, 2718, 3129, 1840, 2124, 2251, 2654, 2343, 2747, 2787, 3272, 2421, 2866, 293 4, 3387, 2985, 3524, 3639, 4244, 1936, 2295, 2413, 2774, 2491, 2883, 2952, 3484, 2568, 2971, 3065, 3596, 3149, 3683, 3776, 4347, 2692, 3109, 3247, 3730, 3300, 3832, 3888, 4458, 3420, 3 946, 4014, 4599, 4162, 4770, 5021, 5420, 10, 41, 68, 184, 88, 196, 226, 332, 105, 216, 244, 346, 262, 386, 398, 591, 121, 235, 253, 379, 294, 424, 465, 614, 310, 459, 435, 642, 509, 678, 714, 94 6, 137, 270, 302, 431, 324, 448, 482, 660, 354, 503, 529, 688, 559, 732, 762, 1005, 393, 534, 575, 752, 594, 793, 815, 1028, 632, 835, 875, 1085, 915, 1155, 1205, 1534, 207, 287, 340, 497, 374, 5 14, 550, 727, 405, 586, 540, 774, 620, 798, 854, 1057, 441, 570, 628, 824, 675, 870, 904, 1120, 7 09, 926, 956, 1169, 999, 1247, 1286, 1628, 487, 651, 700, 891, 748, 941, 971, 1227, 783, 986, 10 13, 1261, 1071, 1313, 1371, 1679, 843, 1043, 1102, 1339, 1134, 1403, 1428, 1742, 1182, 1462, 1498, 1815, 1567, 1912, 2047, 2289, 149, 280, 360, 555, 418, 580, 647, 840, 453, 623, 683, 864, 722, 922, 953, 1272, 493, 669, 706, 906, 779, 984, 1069, 1296, 807, 1055, 1018, 1349, 1137, 14 06, 1469, 1805, 519, 739, 791, 991, 819, 1047, 1083, 1382, 880, 1123, 1159, 1417, 1216, 1490, 1524, 1896, 934, 1173, 1240, 1513, 1282, 1585, 1606, 1949, 1328, 1641, 1702, 2023, 1756, 21 33, 2208, 2663, 609, 756, 852, 1108, 894, 1148, 1198, 1478, 968, 1255, 1191, 1546, 1304, 1596, 1661, 1982, 1032, 1230, 1324, 1619, 1392, 1692, 1732, 2090, 1451, 1772, 1827, 2163, 1878, 2 260, 2346, 2783, 1097, 1360, 1440, 1712, 1502, 1785, 1848, 2240, 1556, 1866, 1930, 2321, 20 05, 2378, 2455, 2863, 1651, 1970, 2067, 2416, 2112, 2489, 2527, 2948, 2184, 2571, 2613, 304 2, 2727, 3188, 3367, 3678, 162, 318, 411, 665, 476, 693, 766, 976, 525, 744, 810, 1010, 848, 108 0, 1105, 1432, 565, 787, 828, 1066, 917, 1141, 1219, 1466, 949, 1213, 1167, 1530, 1289, 1588, 1655, 2039, 600, 868, 930, 1151, 964, 1188, 1233, 1559, 1025, 1276, 1321, 1610, 1378, 1684, 1 738, 2141, 1090, 1335, 1395, 1721, 1443, 1789, 1822, 2171, 1520, 1853, 1924, 2265, 1989, 23 61, 2439, 2886, 718, 899, 994, 1269, 1050, 1300, 1352, 1674, 1116, 1421, 1341, 1749, 1477, 17 98, 1889, 2224, 1180, 1388, 1509, 1841, 1578, 1914, 1964, 2303, 1643, 2008, 2057, 2389, 212 7, 2497, 2551, 3008, 1243, 1549, 1623, 1945, 1708, 2033, 2082, 2462, 1768, 2105, 2148, 2518, 2248, 2589, 2657, 3078, 1870, 2192, 2281, 2625, 2329, 2698, 2736, 3154, 2407, 2770, 2828, 3 255, 2926, 3392, 3543, 3875, 637, 883, 1036, 1367, 1125, 1414, 1538, 1860, 1201, 1487, 1600, 1905, 1669, 1999, 2054, 2533, 1259, 1571, 1633, 1974, 1762, 2097, 2233, 2562, 1809, 2216, 2 156, 2634, 2338, 2707, 2794, 3238, 1310, 1698, 1778, 2120, 1833, 2201, 2257, 2675, 1937, 23 12, 2369, 2713, 2448, 2814, 2877, 3345, 2016, 2398, 2483, 2852, 2542, 2937, 2977, 3429, 260 7, 3019, 3104, 3518, 3166, 3650, 3770, 4364, 1454, 1728, 1885, 2298, 1956, 2355, 2430, 2808, 2075, 2506, 2424, 2900, 2577, 2963, 3058, 3473, 2180, 2474, 2598, 2993, 2686, 3093, 3138, 3 602, 2757, 3205, 3269, 3706, 3326, 3838, 3954, 4512, 2272, 2648, 2750, 3121, 2842, 3216, 32 91, 3807, 2912, 3309, 3410, 3914, 3498, 3994, 4079, 4610, 3031, 3448, 3571, 4042, 3624, 413 3, 4184, 4701, 3742, 4236, 4298, 4840, 4431, 4992, 5218, 5595, 174, 366, 470, 802, 544, 831, 9 10, 1161, 605, 886, 961, 1194, 1001, 1265, 1293, 1675, 656, 937, 979, 1252, 1076, 1345, 1436, 1716, 1111, 1425, 1374, 1775, 1517, 1837, 1901, 2309, 696, 1020, 1094, 1356, 1146, 1399, 145 8, 1801, 1207, 1505, 1563, 1856, 1614, 1933, 1987, 2410, 1279, 1575, 1647, 1968, 1688, 2042, 2078, 2450, 1752, 2106, 2181, 2545, 2245, 2651, 2733, 3196, 859, 1061, 1176, 1494, 1236, 15 27, 1592, 1926, 1307, 1665, 1581, 2001, 1723, 2050, 2151, 2500, 1384, 1637, 1746, 2091, 183 1, 2174, 2230, 2595, 1894, 2275, 2335, 2672, 2404, 2797, 2855, 3322, 1473, 1794, 1873, 2205, 1961, 2301, 2358, 2763, 2020, 2384, 2427, 2820, 2521, 2894, 2974, 3395, 2123, 2468, 2565, 2 931, 2619, 3016, 3053, 3479, 2695, 3098, 3146, 3574, 3242, 3695, 3863, 4168, 736, 1039, 122 3, 1602, 1332, 1658, 1782, 2115, 1410, 1733, 1844, 2159, 1918, 2268, 2326, 2831, 1483, 1820, 1882, 2237, 2014, 2375, 2515, 2869, 2062, 2494, 2436, 2945, 2622, 3023, 3113, 3554, 1542, 1 942, 2035, 2387, 2084, 2477, 2539, 2988, 2189, 2601, 2660, 3039, 2744, 3141, 3183, 3672, 22 92, 2681, 2780, 3171, 2845, 3264, 3295, 3747, 2920, 3340, 3424, 3843, 3493, 3974, 4065, 463 0, 1706, 1980, 2142, 2583, 2213, 2637, 2721, 3126, 2349, 2800, 2710, 3213, 2880, 3281, 3373, 3789, 2456, 2767, 2908, 3314, 3000, 3406, 3463, 3920, 3081, 3513, 3585, 4008, 3655, 4127, 4 228, 4758, 2559, 2960, 3070, 3440, 3158, 3534, 3613, 4105, 3230, 3635, 3719, 4206, 3812, 42 74, 4372, 4864, 3354, 3765, 3894, 4315, 3940, 4406, 4450, 4952, 4036, 4503, 4559, 5079, 469 2, 5234, 5440, 5776, 770, 1130, 1317, 1811, 1447, 1864, 1995, 2366, 1553, 1952, 2069, 2418, 2 135, 2530, 2574, 3062, 1624, 2027, 2099, 2509, 2254, 2631, 2753, 3101, 2318, 2740, 2669, 31 91, 2859, 3278, 3364, 3857, 1694, 2166, 2284, 2645, 2341, 2701, 2777, 3233, 2445, 2837, 290 5, 3303, 2982, 3401, 3468, 3980, 2554, 2923, 3011, 3443, 3073, 3538, 3580, 4022, 3179, 3618, 3711, 4140, 3795, 4258, 4339, 4887, 1908, 2222, 2395, 2823, 2486, 2872, 2956, 3381, 2586, 3 050, 2940, 3488, 3118, 3549, 3667, 4093, 2689, 2997, 3163, 3607, 3261, 3700, 3759, 4192, 33 50, 3818, 3880, 4282, 3967, 4414, 4486, 5034, 2791, 3221, 3317, 3736, 3434, 3849, 3908, 438 1, 3507, 3934, 3988, 4439, 4111, 4531, 4619, 5107, 3644, 4050, 4154, 4570, 4214, 4661, 4713, 5184, 4306, 4747, 4814, 5304, 4926, 5460, 5644, 5970, 1763, 2198, 2465, 2966, 2610, 3034, 3 208, 3629, 2724, 3133, 3286, 3689, 3378, 3801, 3869, 4467, 2811, 3250, 3336, 3782, 3504, 39 26, 4097, 4494, 3565, 4071, 4000, 4579, 4222, 4670, 4779, 5288, 2891, 3415, 3529, 3960, 359 1, 4056, 4119, 4639, 3725, 4198, 4266, 4681, 4356, 4802, 4875, 5398, 3826, 4290, 4397, 4852, 4475, 4940, 4979, 5504, 4551, 5049, 5137, 5619, 5202, 5750, 5867, 6438, 3090, 3459, 3661, 4 176, 3753, 4252, 4331, 4791, 3900, 4422, 4323, 4902, 4522, 4965, 5091, 5547, 4028, 4389, 45 40, 5006, 4650, 5122, 5169, 5693, 4736, 5253, 5323, 5808, 5378, 5935, 6044, 6579, 4146, 459 0, 4724, 5153, 4826, 5269, 5342, 5901, 4914, 5362, 5480, 6005, 5571, 6084, 6170, 6660, 5064, 5524, 5668, 6125, 5721, 6216, 6268, 6752, 5837, 6320, 6374, 6866, 6505, 6995, 7168, 7433, 1 1, 47, 81, 250, 108, 265, 303, 438, 132, 290, 326, 455, 348, 506, 522, 771, 152, 314, 338, 498, 390, 560, 612, 800, 410, 604, 576, 839, 666, 882, 929, 1212, 171, 359, 401, 568, 428, 590, 633, 860, 4 64, 659, 692, 892, 735, 948, 988, 1287, 515, 698, 753, 974, 776, 1026, 1054, 1311, 827, 1077, 11 27, 1380, 1174, 1464, 1523, 1890, 278, 380, 447, 653, 490, 673, 723, 944, 539, 765, 710, 1003, 8 06, 1030, 1104, 1346, 583, 747, 823, 1063, 876, 1122, 1162, 1422, 923, 1187, 1225, 1482, 1275, 1572, 1618, 1991, 639, 850, 913, 1144, 969, 1209, 1246, 1548, 1012, 1263, 1295, 1590, 1366, 1 649, 1710, 2046, 1087, 1330, 1400, 1680, 1438, 1747, 1773, 2113, 1497, 1810, 1852, 2191, 19 25, 2291, 2431, 2697, 189, 370, 473, 729, 554, 759, 844, 1082, 598, 811, 888, 1114, 939, 1184, 1 221, 1601, 646, 872, 918, 1166, 1007, 1258, 1362, 1632, 1040, 1343, 1299, 1690, 1442, 1751, 1 819, 2178, 679, 959, 1021, 1266, 1058, 1334, 1377, 1724, 1131, 1427, 1468, 1764, 1537, 1843, 1877, 2277, 1200, 1485, 1566, 1868, 1615, 1944, 1969, 2331, 1666, 2003, 2071, 2408, 2128, 2 525, 2612, 3108, 794, 983, 1096, 1407, 1153, 1457, 1515, 1829, 1242, 1580, 1508, 1904, 1639, 1957, 2028, 2365, 1315, 1551, 1662, 1978, 1734, 2058, 2101, 2481, 1799, 2144, 2202, 2558, 2 255, 2665, 2755, 3240, 1396, 1703, 1786, 2080, 1855, 2157, 2226, 2643, 1913, 2244, 2311, 27 32, 2388, 2789, 2874, 3327, 2015, 2353, 2452, 2830, 2505, 2913, 2953, 3422, 2585, 3003, 305 5, 3525, 3178, 3680, 3865, 4172, 205, 419, 546, 866, 625, 898, 993, 1251, 685, 963, 1049, 1290, 1091, 1373, 1404, 1780, 741, 1017, 1068, 1357, 1179, 1449, 1541, 1816, 1217, 1533, 1479, 18 88, 1621, 1948, 2019, 2423, 782, 1118, 1192, 1461, 1234, 1500, 1554, 1919, 1306, 1607, 1660, 1972, 1720, 2049, 2108, 2534, 1389, 1676, 1741, 2088, 1790, 2164, 2196, 2567, 1874, 2229, 2 302, 2671, 2374, 2772, 2856, 3352, 933, 1157, 1271, 1597, 1338, 1635, 1697, 2037, 1419, 176 7, 1683, 2119, 1826, 2170, 2267, 2627, 1493, 1730, 1861, 2217, 1938, 2296, 2345, 2715, 2007, 2391, 2443, 2805, 2522, 2921, 2980, 3482, 1569, 1906, 1985, 2325, 2076, 2417, 2472, 2885, 2 139, 2496, 2543, 2943, 2653, 3026, 3099, 3562, 2250, 2594, 2687, 3067, 2738, 3144, 3186, 36 41, 2822, 3227, 3288, 3751, 3397, 3886, 4044, 4354, 833, 1135, 1323, 1707, 1431, 1760, 1893, 2238, 1519, 1839, 1960, 2285, 2034, 2379, 2440, 2964, 1587, 1929, 1997, 2356, 2131, 2487, 2 636, 2995, 2182, 2618, 2549, 3076, 2746, 3156, 3249, 3734, 1646, 2065, 2152, 2514, 2209, 26 03, 2662, 3123, 2319, 2723, 2781, 3164, 2864, 3274, 3341, 3841, 2400, 2812, 2904, 3312, 297 2, 3408, 3452, 3928, 3044, 3497, 3593, 4020, 3657, 4142, 4260, 4805, 1803, 2098, 2264, 2706, 2336, 2764, 2847, 3266, 2464, 2932, 2839, 3366, 3013, 3436, 3540, 3972, 2576, 2896, 3036, 3 466, 3131, 3576, 3626, 4096, 3211, 3696, 3768, 4196, 3824, 4312, 4420, 4945, 2680, 3091, 32 01, 3609, 3302, 3713, 3791, 4288, 3383, 3809, 3910, 4385, 3996, 4460, 4538, 5031, 3509, 395 0, 4067, 4501, 4121, 4588, 4634, 5125, 4226, 4688, 4745, 5245, 4871, 5392, 5589, 5915, 221, 4 81, 619, 1035, 717, 1073, 1170, 1472, 788, 1512, 1283, 1593, 1625, 2043, 856, 120 4, 1254, 1576, 1369, 1687, 1784, 2086, 1411, 1771, 1714, 2146, 1872, 2215, 2279, 2717, 908, 1 302, 1393, 1701, 1453, 1743, 1806, 2173, 1525, 1858, 1922, 2231, 1976, 2313, 2368, 2826, 16 11, 1934, 2012, 2348, 2056, 2429, 2467, 2870, 2126, 2502, 2579, 2976, 2650, 3095, 3184, 369 1, 1109, 1354, 1489, 1845, 1562, 1881, 1953, 2308, 1642, 2031, 1941, 2385, 2093, 2437, 2546, 2928, 1727, 2000, 2116, 2484, 2206, 2573, 2633, 3032, 2274, 2683, 2743, 3116, 2819, 3254, 3 319, 3822, 1823, 2167, 2253, 2606, 2342, 2709, 2769, 3218, 2405, 2795, 2844, 3279, 2950, 33 62, 3447, 3892, 2517, 2893, 2998, 3402, 3057, 3495, 3533, 3978, 3143, 3582, 3637, 4075, 374 0, 4186, 4341, 4621, 954, 1327, 1544, 1962, 1670, 2022, 2155, 2508, 1754, 2104, 2220, 2555, 2 299, 2674, 2735, 3293, 1836, 2194, 2261, 2642, 2397, 2786, 2942, 3333, 2449, 2918, 2853, 34 17, 3063, 3502, 3598, 4054, 1897, 2322, 2420, 2798, 2475, 2902, 2968, 3461, 2588, 3040, 310 3, 3520, 3198, 3631, 3674, 4166, 2700, 3128, 3235, 3663, 3307, 3763, 3797, 4234, 3385, 3836, 3922, 4321, 3990, 4441, 4525, 5051, 2073, 2359, 2537, 3018, 2615, 3080, 3169, 3615, 2761, 3 259, 3159, 3708, 3347, 3780, 3871, 4270, 2878, 3220, 3376, 3814, 3477, 3904, 3962, 4393, 35 67, 4016, 4087, 4473, 4150, 4583, 4679, 5176, 2990, 3432, 3551, 3938, 3646, 4032, 4107, 456 1, 3723, 4131, 4210, 4656, 4294, 4720, 4812, 5266, 3853, 4250, 4366, 4761, 4412, 4845, 4890, 5353, 4497, 4935, 4994, 5457, 5112, 5604, 5779, 6077, 998, 1435, 1656, 2185, 1797, 2241, 23 76, 2778, 1909, 2333, 2461, 2836, 2528, 2958, 3010, 3545, 1988, 2411, 2493, 2936, 2659, 307 1, 3206, 3587, 2726, 3193, 3114, 3685, 3321, 3774, 3859, 4333, 2061, 2564, 2691, 3086, 2752, 3151, 3232, 3728, 2861, 3298, 3371, 3803, 3457, 3898, 3966, 4446, 2987, 3390, 3489, 3944, 3 556, 4038, 4081, 4482, 3668, 4115, 4202, 4596, 4278, 4706, 4786, 5293, 2288, 2624, 2809, 32 83, 2910, 3338, 3427, 3882, 3021, 3531, 3411, 3984, 3604, 4048, 4160, 4546, 3136, 3472, 365 2, 4101, 3757, 4190, 4246, 4643, 3847, 4302, 4360, 4729, 4433, 4854, 4918, 5418, 3245, 3717, 3820, 4220, 3932, 4327, 4378, 4821, 4010, 4408, 4454, 4880, 4566, 4962, 5041, 5486, 4136, 4 509, 4612, 5001, 4665, 5081, 5132, 5559, 4754, 5166, 5221, 5671, 5329, 5795, 5959, 6248, 21 34, 2597, 2888, 3441, 3049, 3515, 3702, 4125, 3173, 3620, 3786, 4180, 3877, 4284, 4345, 489 9, 3267, 3746, 3830, 4264, 4004, 4399, 4553, 4928, 4061, 4533, 4469, 5011, 4674, 5094, 5189, 5653, 3357, 3916, 4026, 4427, 4091, 4516, 4575, 5059, 4216, 4652, 4715, 5102, 4795, 5210, 5 280, 5756, 4308, 4738, 4835, 5256, 4909, 5340, 5381, 5831, 4984, 5432, 5515, 5939, 5574, 60 55, 6159, 6651, 3573, 3956, 4156, 4627, 4240, 4697, 4777, 5197, 4374, 4861, 4768, 5301, 495 5, 5367, 5472, 5874, 4488, 4830, 4972, 5406, 5071, 5501, 5542, 6001, 5156, 5622, 5687, 6102, 5737, 6220, 6312, 6773, 4605, 5019, 5145, 5530, 5232, 5638, 5706, 6185, 5315, 5725, 5814, 6 280, 5891, 6349, 6421, 6843, 5446, 5854, 5980, 6387, 6026, 6465, 6509, 6923, 6132, 6551, 66 02, 7020, 6711, 7126, 7280, 7500, 237, 530, 704, 1237, 817, 1278, 1385, 1717, 902, 1350, 1446, 1758, 1504, 1865, 1900, 2362, 978, 1415, 1476, 1849, 1604, 1966, 2068, 2414, 1652, 2053, 19 93, 2478, 2175, 2561, 2639, 3106, 1044, 1529, 1629, 1981, 1693, 2024, 2110, 2519, 1777, 216 2, 2223, 2582, 2294, 2677, 2741, 3215, 1884, 2236, 2328, 2720, 2371, 2806, 2850, 3257, 2458, 2889, 2969, 3360, 3045, 3480, 3563, 4083, 1318, 1583, 1737, 2149, 1832, 2188, 2271, 2668, 1 916, 2351, 2247, 2766, 2426, 2815, 2929, 3310, 2009, 2316, 2446, 2867, 2552, 2961, 3024, 34 18, 2630, 3068, 3124, 3506, 3203, 3633, 3698, 4212, 2121, 2499, 2609, 3001, 2712, 3096, 315 3, 3600, 2784, 3181, 3228, 3659, 3334, 3744, 3834, 4280, 2907, 3284, 3388, 3784, 3445, 3884, 3924, 4362, 3527, 3976, 4030, 4456, 4129, 4577, 4740, 5014, 1100, 1558, 1793, 2282, 1950, 2 339, 2490, 2899, 2041, 2434, 2570, 2947, 2656, 3060, 3119, 3676, 2137, 2540, 2621, 3029, 27 75, 3176, 3329, 3715, 2833, 3305, 3237, 3799, 3450, 3890, 3986, 4443, 2199, 2694, 2801, 318 9, 2858, 3290, 3355, 3851, 2979, 3425, 3486, 3906, 3583, 4018, 4069, 4557, 3083, 3511, 3622, 4052, 3693, 4152, 4182, 4623, 3766, 4230, 4310, 4710, 4383, 4838, 4923, 5415, 2402, 2729, 2 924, 3399, 3006, 3470, 3553, 4002, 3148, 3648, 3542, 4099, 3727, 4170, 4256, 4663, 3262, 36 05, 3761, 4200, 3867, 4296, 4349, 4788, 3958, 4401, 4471, 4873, 4535, 4982, 5074, 5539, 338 0, 3816, 3942, 4325, 4034, 4418, 4499, 4960, 4113, 4520, 4601, 5046, 4690, 5109, 5192, 5616, 4242, 4647, 4763, 5148, 4816, 5229, 5272, 5703, 4897, 5318, 5364, 5792, 5483, 5925, 6088, 6 345, 1149, 1672, 1932, 2531, 2095, 2591, 2749, 3161, 2212, 2703, 2841, 3223, 2916, 3348, 33 94, 3930, 2305, 2792, 2875, 3324, 3052, 3455, 3589, 3982, 3111, 3578, 3500, 4077, 3704, 415 8, 4248, 4731, 2382, 2955, 3075, 3475, 3139, 3536, 3611, 4117, 3252, 3681, 3755, 4188, 3845, 4286, 4358, 4847, 3369, 3778, 3873, 4335, 3948, 4424, 4465, 4883, 4063, 4505, 4592, 4987, 4 672, 5089, 5174, 5641, 2647, 3014, 3194, 3670, 3296, 3721, 3805, 4272, 3413, 3912, 3787, 43 70, 3998, 4435, 4548, 4943, 3522, 3861, 4046, 4490, 4144, 4581, 4641, 5029, 4232, 4695, 475 2, 5120, 4833, 5240, 5296, 5760, 3628, 4103, 4204, 4616, 4319, 4722, 4782, 5200, 4395, 4807, 4856, 5261, 4969, 5337, 5409, 5824, 4527, 4906, 5004, 5376, 5056, 5452, 5492, 5894, 5140, 5 527, 5583, 5987, 5681, 6106, 6236, 6496, 2469, 2984, 3271, 3828, 3431, 3902, 4089, 4514, 35 58, 4012, 4174, 4568, 4268, 4683, 4749, 5277, 3654, 4134, 4218, 4654, 4387, 4798, 4950, 530 9, 4448, 4933, 4866, 5387, 5066, 5463, 5550, 5973, 3738, 4304, 4410, 4823, 4480, 4916, 4977, 5429, 4608, 5039, 5099, 5469, 5182, 5568, 5632, 6066, 4704, 5130, 5224, 5607, 5285, 5690, 5 731, 6140, 5356, 5769, 5851, 6212, 5908, 6324, 6417, 6854, 3964, 4343, 4544, 5024, 4632, 50 84, 5163, 5562, 4772, 5248, 5158, 5656, 5326, 5715, 5805, 6178, 4892, 5213, 5348, 5744, 543 7, 5841, 5881, 6284, 5512, 5942, 5998, 6366, 6051, 6469, 6555, 6959, 4996, 5401, 5506, 5864, 5598, 5952, 6019, 6447, 5665, 6033, 6121, 6528, 6197, 6588, 6646, 7027, 5782, 6155, 6256, 6 621, 6300, 6690, 6726, 7085, 6395, 6768, 6810, 7175, 6906, 7264, 7388, 7584, 1195, 1812, 20 83, 2825, 2258, 2881, 3037, 3491, 2394, 2992, 3134, 3547, 3210, 3665, 3710, 4276, 2511, 308 8, 3168, 3642, 3343, 3793, 3936, 4329, 3404, 3918, 3839, 4403, 4059, 4484, 4564, 5036, 2600, 3243, 3374, 3811, 3464, 3878, 3970, 4437, 3569, 4040, 4123, 4507, 4194, 4603, 4668, 5143, 3 687, 4138, 4238, 4645, 4292, 4733, 4775, 5187, 4376, 4809, 4894, 5290, 4967, 5403, 5489, 59 32, 2939, 3315, 3516, 4024, 3617, 4073, 4164, 4594, 3732, 4262, 4148, 4686, 4337, 4742, 485 9, 5242, 3855, 4224, 4368, 4793, 4477, 4885, 4947, 5345, 4555, 4999, 5061, 5426, 5135, 5553, 5610, 6048, 3992, 4429, 4529, 4921, 4636, 5026, 5086, 5518, 4708, 5114, 5161, 5577, 5264, 5 650, 5728, 6110, 4828, 5208, 5312, 5684, 5370, 5766, 5801, 6181, 5449, 5844, 5888, 6260, 59 77, 6357, 6487, 6716, 2684, 3276, 3594, 4178, 3772, 4254, 4416, 4819, 3896, 4352, 4492, 486 8, 4585, 4989, 5054, 5586, 4006, 4462, 4542, 4957, 4699, 5104, 5258, 5625, 4756, 5237, 5171, 5699, 5373, 5772, 5857, 6244, 4095, 4614, 4726, 5117, 4784, 5216, 5282, 5740, 4904, 5351, 5 412, 5788, 5498, 5884, 5921, 6341, 5016, 5435, 5536, 5911, 5601, 5994, 6023, 6400, 5675, 60 62, 6136, 6473, 6193, 6569, 6636, 7040, 4317, 4659, 4849, 5331, 4931, 5389, 5475, 5871, 507 6, 5556, 5466, 5949, 5635, 6012, 6091, 6430, 5195, 5521, 5662, 6037, 5753, 6117, 6166, 6532, 5828, 6208, 6272, 6597, 6328, 6685, 6762, 7119, 5307, 5712, 5818, 6147, 5898, 6228, 6292, 6 670, 5963, 6308, 6378, 6741, 6451, 6794, 6860, 7189, 6073, 6412, 6514, 6821, 6546, 6888, 69 17, 7241, 6617, 6953, 6989, 7312, 7078, 7396, 7510, 7667, 2758, 3438, 3749, 4452, 3952, 451 8, 4677, 5097, 4109, 4625, 4765, 5150, 4842, 5274, 5320, 5811, 4208, 4717, 4800, 5250, 4974, 5384, 5509, 5847, 5044, 5495, 5423, 5928, 5613, 6008, 6080, 6482, 4300, 4878, 5009, 5395, 5 069, 5454, 5533, 5966, 5179, 5592, 5659, 6030, 5734, 6114, 6174, 6574, 5299, 5678, 5763, 61 51, 5821, 6232, 6264, 6607, 5918, 6296, 6370, 6695, 6434, 6784, 6838, 7204, 4572, 4938, 512 7, 5580, 5226, 5628, 5709, 6099, 5334, 5798, 5696, 6189, 5861, 6240, 6337, 6656, 5443, 5747, 5904, 6288, 5991, 6361, 6408, 6731, 6069, 6456, 6500, 6800, 6564, 6894, 6941, 7288, 5545, 5 956, 6041, 6391, 6144, 6478, 6523, 6871, 6205, 6541, 6583, 6912, 6675, 6971, 7033, 7328, 63 16, 6626, 6705, 7002, 6747, 7059, 7092, 7370, 6816, 7112, 7153, 7442, 7226, 7520, 7607, 774 7, 4391, 4911, 5205, 5718, 5359, 5785, 5945, 6304, 5477, 5877, 6016, 6353, 6095, 6443, 6491, 6929, 5565, 5984, 6059, 6425, 6201, 6537, 6665, 6947, 6252, 6641, 6593, 7008, 6757, 7065, 7 132, 7424, 5647, 6128, 6224, 6560, 6276, 6631, 6680, 7046, 6383, 6736, 6789, 7072, 6849, 71 46, 7196, 7490, 6460, 6805, 6883, 7182, 6935, 7233, 7256, 7541, 6983, 7296, 7345, 7595, 737 9, 7654, 7706, 7915, 5834, 6162, 6332, 6721, 6404, 6778, 6832, 7139, 6518, 6900, 6827, 7211, 6965, 7249, 7320, 7562, 6612, 6877, 6977, 7272, 7052, 7336, 7362, 7630, 7105, 7405, 7451, 7 680, 7480, 7733, 7776, 7957, 6700, 7014, 7098, 7353, 7160, 7414, 7461, 7719, 7218, 7470, 75 30, 7762, 7573, 7792, 7824, 7981, 7304, 7552, 7618, 7808, 7642, 7841, 7858, 8006, 7692, 787 6, 7895, 8033, 7936, 8064, 8098, 8138, 12, 53, 93, 333, 128, 350, 399, 573, 158, 384, 429, 596, 4 58, 661, 681, 1002, 185, 415, 444, 650, 512, 730, 803, 1045, 537, 795, 758, 1093, 871, 1145, 120 8, 1560, 210, 472, 524, 740, 561, 777, 829, 1119, 607, 863, 903, 1158, 958, 1232, 1280, 1650, 67 1, 911, 980, 1262, 1009, 1331, 1364, 1677, 1079, 1391, 1455, 1766, 1511, 1863, 1935, 2367, 36 7, 499, 584, 855, 640, 879, 942, 1226, 701, 995, 927, 1297, 1052, 1337, 1423, 1722, 768, 973, 10 72, 1375, 1139, 1450, 1496, 1817, 1202, 1531, 1574, 1887, 1636, 1994, 2048, 2482, 838, 1106, 1183, 1475, 1256, 1555, 1598, 1963, 1308, 1622, 1659, 2013, 1744, 2085, 2158, 2547, 1402, 1 704, 1787, 2122, 1834, 2200, 2232, 2623, 1903, 2273, 2324, 2711, 2406, 2821, 2978, 3251, 23 4, 485, 618, 950, 721, 987, 1099, 1397, 786, 1059, 1152, 1439, 1220, 1521, 1570, 2029, 846, 11 32, 1196, 1501, 1303, 1617, 1740, 2066, 1348, 1718, 1664, 2132, 1838, 2204, 2283, 2696, 887, 1244, 1320, 1627, 1370, 1709, 1761, 2172, 1460, 1821, 1871, 2221, 1951, 2310, 2354, 2804, 1 545, 1891, 1986, 2340, 2044, 2428, 2457, 2868, 2107, 2498, 2575, 2951, 2638, 3074, 3162, 36 64, 1038, 1274, 1413, 1796, 1486, 1854, 1927, 2297, 1594, 2002, 1915, 2380, 2074, 2444, 252 6, 2906, 1686, 1967, 2100, 2470, 2186, 2560, 2608, 3028, 2263, 2655, 2722, 3107, 2782, 3217, 3308, 3796, 1783, 2150, 2246, 2584, 2327, 2673, 2751, 3195, 2393, 2768, 2843, 3285, 2930, 3 344, 3428, 3881, 2510, 2892, 2999, 3384, 3054, 3469, 3510, 3973, 3135, 3561, 3612, 4074, 37 35, 4231, 4419, 4727, 256, 549, 711, 1126, 821, 1164, 1285, 1603, 896, 1250, 1359, 1654, 1408, 1757, 1792, 2239, 965, 1314, 1381, 1735, 1516, 1846, 1955, 2280, 1565, 1947, 1883, 2363, 20 51, 2432, 2513, 2967, 1024, 1444, 1536, 1859, 1584, 1907, 1975, 2399, 1673, 2036, 2096, 246 0, 2168, 2550, 2614, 3084, 1774, 2118, 2193, 2596, 2249, 2679, 2716, 3117, 2347, 2754, 2835, 3222, 2914, 3328, 3412, 3905, 1214, 1491, 1631, 2025, 1713, 2070, 2140, 2535, 1808, 2225, 2 125, 2629, 2293, 2688, 2796, 3177, 1899, 2179, 2334, 2739, 2422, 2829, 2882, 3268, 2501, 29 33, 2991, 3358, 3072, 3478, 3537, 4033, 1990, 2386, 2476, 2860, 2581, 2962, 3017, 3439, 265 2, 3043, 3092, 3501, 3204, 3584, 3656, 4112, 2776, 3145, 3241, 3623, 3292, 3701, 3743, 4191, 3377, 3781, 3844, 4307, 3949, 4442, 4595, 4913, 1086, 1465, 1695, 2154, 1825, 2214, 2370, 2 762, 1931, 2307, 2447, 2816, 2532, 2922, 2989, 3521, 2010, 2409, 2488, 2895, 2644, 3033, 31 87, 3552, 2699, 3170, 3100, 3634, 3299, 3712, 3804, 4289, 2081, 2566, 2667, 3061, 2731, 315 2, 3214, 3679, 2854, 3277, 3335, 3720, 3419, 3829, 3895, 4396, 2944, 3368, 3460, 3868, 3530, 3959, 4003, 4479, 3601, 4047, 4145, 4573, 4209, 4696, 4817, 5363, 2266, 2605, 2793, 3258, 2 873, 3318, 3403, 3821, 3009, 3490, 3393, 3919, 3568, 3987, 4088, 4524, 3127, 3451, 3592, 40 17, 3688, 4126, 4177, 4648, 3769, 4249, 4322, 4751, 4379, 4872, 4981, 5502, 3231, 3647, 375 6, 4161, 3856, 4265, 4346, 4846, 3935, 4363, 4464, 4944, 4547, 5020, 5098, 5587, 4058, 4502, 4617, 5062, 4673, 5149, 5194, 5676, 4781, 5249, 5305, 5787, 5428, 5919, 6094, 6376, 276, 62 9, 812, 1342, 935, 1386, 1506, 1875, 1031, 1470, 1579, 1920, 1645, 2021, 2055, 2541, 1113, 15 50, 1612, 1998, 1753, 2129, 2242, 2590, 1800, 2228, 2161, 2658, 2344, 2737, 2807, 3270, 117 7, 1668, 1779, 2147, 1850, 2197, 2270, 2690, 1939, 2330, 2403, 2756, 2463, 2849, 2909, 3382, 2040, 2419, 2507, 2887, 2556, 2975, 3012, 3426, 2635, 3048, 3130, 3532, 3202, 3651, 3741, 4 243, 1429, 1731, 1895, 2314, 1983, 2357, 2441, 2840, 2077, 2529, 2425, 2927, 2599, 2983, 30 94, 3483, 2176, 2492, 2626, 3030, 2725, 3122, 3185, 3588, 2802, 3234, 3297, 3673, 3372, 381 0, 3872, 4377, 2290, 2682, 2779, 3157, 2879, 3260, 3323, 3773, 2949, 3351, 3400, 3835, 3505, 3917, 3999, 4447, 3064, 3449, 3555, 3955, 3614, 4045, 4082, 4530, 3699, 4132, 4189, 4626, 4 295, 4741, 4900, 5180, 1238, 1700, 1959, 2451, 2111, 2516, 2670, 3056, 2207, 2611, 2742, 31 05, 2832, 3226, 3289, 3848, 2304, 2714, 2788, 3192, 2941, 3342, 3499, 3887, 2996, 3474, 340 7, 3968, 3621, 4053, 4149, 4606, 2373, 2857, 2965, 3353, 3022, 3458, 3523, 4011, 3137, 3597, 3660, 4068, 3754, 4183, 4225, 4721, 3253, 3684, 3790, 4215, 3862, 4316, 4351, 4790, 3939, 4 390, 4474, 4881, 4541, 5000, 5085, 5605, 2578, 2898, 3087, 3575, 3165, 3636, 3726, 4167, 33 16, 3815, 3716, 4261, 3901, 4334, 4425, 4827, 3435, 3777, 3929, 4369, 4029, 4459, 4513, 495 3, 4118, 4567, 4637, 5033, 4703, 5144, 5239, 5726, 3546, 3985, 4102, 4491, 4197, 4584, 4660, 5121, 4277, 4684, 4766, 5217, 4851, 5279, 5371, 5807, 4407, 4808, 4925, 5319, 4973, 5404, 5 447, 5885, 5057, 5493, 5548, 5978, 5664, 6107, 6258, 6516, 1291, 1830, 2092, 2702, 2259, 27 65, 2917, 3332, 2390, 2871, 3007, 3391, 3077, 3514, 3566, 4094, 2479, 2957, 3041, 3492, 321 2, 3627, 3762, 4139, 3280, 3748, 3671, 4237, 3876, 4328, 4413, 4891, 2563, 3115, 3244, 3643, 3306, 3707, 3788, 4283, 3416, 3854, 3925, 4357, 4009, 4453, 4519, 5007, 3544, 3943, 4039, 4 496, 4106, 4589, 4631, 5042, 4221, 4667, 4757, 5157, 4836, 5265, 5346, 5830, 2818, 3175, 33 65, 3837, 3467, 3893, 3979, 4436, 3577, 4080, 3963, 4536, 4155, 4600, 4716, 5106, 3692, 402 3, 4203, 4653, 4311, 4746, 4803, 5203, 4402, 4860, 4919, 5289, 4991, 5411, 5476, 5943, 3802, 4271, 4373, 4776, 4485, 4886, 4939, 5380, 4562, 4966, 5015, 5438, 5126, 5519, 5596, 6002, 4 691, 5070, 5172, 5557, 5225, 5634, 5685, 6067, 5314, 5717, 5764, 6164, 5862, 6274, 6415, 66 59, 2646, 3147, 3444, 3993, 3606, 4064, 4255, 4678, 3729, 4173, 4340, 4735, 4430, 4841, 490 5, 5458, 3823, 4301, 4384, 4822, 4556, 4958, 5113, 5484, 4611, 5093, 5028, 5566, 5235, 5646, 5738, 6149, 3911, 4470, 4578, 4986, 4642, 5077, 5136, 5614, 4771, 5212, 5275, 5655, 5354, 5 755, 5819, 6239, 4865, 5297, 5394, 5796, 5467, 5873, 5907, 6305, 5540, 5954, 6028, 6396, 60 79, 6495, 6585, 6992, 4124, 4508, 4709, 5190, 4796, 5257, 5336, 5743, 4932, 5421, 5328, 583 9, 5510, 5896, 5990, 6340, 5048, 5388, 5528, 5931, 5626, 6017, 6053, 6452, 5705, 6122, 6180, 6536, 6223, 6634, 6713, 7088, 5167, 5575, 5697, 6040, 5775, 6137, 6195, 6606, 5850, 6211, 6 289, 6684, 6356, 6743, 6803, 7148, 5967, 6325, 6432, 6774, 6472, 6839, 6874, 7209, 6561, 69 09, 6950, 7284, 7039, 7371, 7488, 7655, 296, 691, 919, 1589, 1065, 1640, 1770, 2165, 1171, 17 26, 1842, 2211, 1911, 2337, 2377, 2903, 1268, 1804, 1879, 2317, 2032, 2454, 2572, 2959, 208 9, 2553, 2485, 3025, 2693, 3110, 3190, 3662, 1353, 1943, 2059, 2473, 2136, 2523, 2620, 3069, 2235, 2676, 2745, 3132, 2824, 3229, 3294, 3771, 2360, 2759, 2862, 3273, 2911, 3361, 3405, 3 813, 3002, 3446, 3526, 3913, 3603, 4031, 4116, 4635, 1691, 2006, 2190, 2661, 2300, 2705, 27 99, 3219, 2396, 2890, 2773, 3320, 2973, 3370, 3485, 3864, 2504, 2851, 2994, 3423, 3102, 351 7, 3581, 3971, 3180, 3625, 3682, 4055, 3760, 4187, 4251, 4767, 2632, 3046, 3160, 3557, 3265, 3653, 3709, 4153, 3339, 3737, 3785, 4211, 3889, 4297, 4388, 4837, 3462, 3840, 3941, 4338, 3 995, 4438, 4478, 4922, 4076, 4528, 4582, 5017, 4682, 5138, 5300, 5569, 1418, 1979, 2256, 28 13, 2435, 2876, 3038, 3456, 2538, 2981, 3120, 3503, 3207, 3616, 3675, 4229, 2649, 3089, 317 2, 3586, 3330, 3733, 3885, 4269, 3389, 3860, 3794, 4353, 4001, 4444, 4539, 5003, 2719, 3246, 3356, 3745, 3414, 3846, 3909, 4405, 3535, 3977, 4037, 4461, 4135, 4571, 4620, 5118, 3640, 4 060, 4175, 4604, 4245, 4707, 4737, 5183, 4320, 4785, 4869, 5271, 4941, 5397, 5481, 5940, 29 46, 3282, 3481, 3951, 3564, 4019, 4104, 4552, 3703, 4201, 4090, 4651, 4281, 4723, 4813, 522 3, 3819, 4159, 4314, 4755, 4421, 4855, 4908, 5349, 4511, 4961, 5032, 5431, 5096, 5537, 5629, 6049, 3933, 4371, 4495, 4882, 4587, 4978, 5058, 5516, 4666, 5082, 5160, 5602, 5251, 5661, 5 739, 6119, 4799, 5209, 5322, 5700, 5374, 5773, 5810, 6192, 5455, 5853, 5893, 6270, 5999, 63 86, 6522, 6739, 1480, 2114, 2415, 3079, 2602, 3142, 3304, 3718, 2734, 3256, 3396, 3779, 347 1, 3903, 3947, 4483, 2838, 3346, 3433, 3879, 3608, 4007, 4141, 4534, 3669, 4130, 4051, 4629, 4257, 4712, 4804, 5291, 2925, 3512, 3632, 4025, 3697, 4086, 4163, 4671, 3806, 4235, 4309, 4 743, 4400, 4844, 4917, 5407, 3921, 4332, 4426, 4895, 4500, 4983, 5025, 5441, 4615, 5065, 51 52, 5543, 5231, 5643, 5723, 6139, 3200, 3572, 3752, 4223, 3852, 4275, 4359, 4831, 3965, 446 6, 4342, 4930, 4550, 4995, 5110, 5499, 4072, 4415, 4598, 5050, 4698, 5141, 5201, 5584, 4789, 5254, 5311, 5673, 5391, 5781, 5833, 6242, 4181, 4657, 4760, 5178, 4877, 5283, 5339, 5746, 4 956, 5366, 5414, 5802, 5525, 5870, 5934, 6299, 5087, 5464, 5560, 5905, 5611, 5972, 6007, 63 60, 5691, 6038, 6089, 6439, 6173, 6540, 6648, 6865, 3015, 3541, 3827, 4382, 3981, 4455, 464 0, 5073, 4110, 4565, 4728, 5129, 4824, 5243, 5308, 5816, 4207, 4687, 4774, 5214, 4948, 5357, 5508, 5845, 5008, 5490, 5424, 5913, 5620, 5981, 6058, 6426, 4291, 4863, 4970, 5383, 5040, 5 473, 5534, 5951, 5168, 5593, 5652, 5986, 5732, 6076, 6131, 6506, 5263, 5682, 5767, 6109, 58 25, 6183, 6217, 6567, 5887, 6251, 6321, 6630, 6369, 6720, 6799, 7157, 4517, 4903, 5105, 557 8, 5191, 5637, 5714, 6071, 5332, 5790, 5708, 6152, 5859, 6204, 6283, 6599, 5450, 5758, 5879, 6230, 5961, 6311, 6347, 6688, 6025, 6399, 6449, 6758, 6492, 6842, 6914, 7238, 5551, 5926, 6 020, 6334, 6101, 6409, 6466, 6823, 6161, 6479, 6553, 6890, 6616, 6938, 6988, 7290, 6261, 65 81, 6667, 6967, 6703, 7022, 7053, 7337, 6781, 7083, 7120, 7404, 7194, 7475, 7574, 7720, 154 0, 2276, 2587, 3379, 2785, 3437, 3595, 4041, 2938, 3548, 3690, 4098, 3764, 4217, 4263, 4832, 3059, 3645, 3724, 4195, 3897, 4348, 4489, 4888, 3957, 4472, 4394, 4964, 4609, 5045, 5124, 5 590, 3150, 3798, 3927, 4365, 4015, 4432, 4523, 4998, 4120, 4593, 4676, 5068, 4748, 5164, 52 28, 5694, 4241, 4693, 4794, 5206, 4850, 5294, 5335, 5735, 4936, 5368, 5451, 5827, 5522, 592 9, 6004, 6393, 3494, 3870, 4066, 4576, 4169, 4624, 4718, 5155, 4287, 4818, 4702, 5246, 4896, 5303, 5417, 5784, 4409, 4780, 4927, 5350, 5037, 5444, 5505, 5876, 5116, 5554, 5617, 5948, 5 688, 6061, 6112, 6489, 4545, 4990, 5090, 5478, 5198, 5581, 5640, 6031, 5268, 5667, 5711, 60 82, 5804, 6146, 6214, 6543, 5386, 5752, 5848, 6177, 5899, 6249, 6279, 6603, 5969, 6315, 635 4, 6669, 6428, 6750, 6858, 7043, 3239, 3831, 4147, 4732, 4326, 4810, 4975, 5377, 4449, 4910, 5053, 5427, 5146, 5546, 5608, 6092, 4560, 5023, 5101, 5513, 5260, 5658, 5799, 6124, 5317, 5 778, 5720, 6190, 5902, 6254, 6327, 6655, 4646, 5175, 5286, 5670, 5343, 5761, 5822, 6226, 54 61, 5882, 5937, 6267, 6014, 6350, 6382, 6735, 5572, 5957, 6046, 6373, 6104, 6445, 6468, 678 5, 6168, 6502, 6563, 6846, 6613, 6926, 6980, 7300, 4874, 5220, 5408, 5865, 5487, 5916, 5993, 6338, 5631, 6064, 5983, 6406, 6134, 6458, 6526, 6812, 5741, 6035, 6158, 6483, 6235, 6550, 6 591, 6893, 6302, 6627, 6677, 6946, 6724, 7018, 7079, 7365, 5842, 6202, 6293, 6575, 6363, 66 42, 6696, 7005, 6419, 6710, 6766, 7066, 6826, 7106, 7162, 7416, 6512, 6796, 6878, 7129, 690 5, 7180, 7205, 7457, 6963, 7234, 7263, 7514, 7332, 7580, 7662, 7782, 3311, 3989, 4303, 5012, 4506, 5078, 5238, 5649, 4662, 5186, 5325, 5702, 5400, 5813, 5856, 6286, 4762, 5276, 5360, 5 793, 5531, 5910, 6022, 6318, 5599, 6010, 5946, 6389, 6116, 6455, 6520, 6855, 4858, 5434, 55 63, 5923, 5623, 5975, 6043, 6422, 5729, 6097, 6156, 6475, 6221, 6547, 6595, 6930, 5836, 617 1, 6245, 6577, 6295, 6644, 6673, 6955, 6380, 6699, 6761, 7026, 6815, 7096, 7143, 7427, 5133, 5496, 5679, 6085, 5770, 6127, 6199, 6533, 5868, 6277, 6186, 6609, 6331, 6652, 6732, 6997, 5 964, 6233, 6367, 6692, 6442, 6754, 6792, 7057, 6510, 6830, 6869, 7110, 6922, 7185, 7224, 74 94, 6056, 6413, 6485, 6777, 6571, 6850, 6886, 7166, 6623, 6902, 6934, 7199, 7009, 7248, 729 4, 7526, 6717, 6972, 7035, 7269, 7070, 7316, 7342, 7559, 7124, 7359, 7392, 7609, 7445, 7670, 7737, 7844, 4949, 5470, 5749, 6207, 5890, 6263, 6402, 6707, 5996, 6343, 6462, 6746, 6530, 6 819, 6862, 7214, 6074, 6435, 6499, 6807, 6620, 6897, 7000, 7229, 6663, 6984, 6942, 7274, 70 75, 7321, 7375, 7602, 6143, 6557, 6638, 6918, 6681, 6975, 7013, 7305, 6770, 7061, 7101, 732 6, 7152, 7386, 7421, 7646, 6835, 7115, 7176, 7410, 7219, 7452, 7469, 7686, 7259, 7501, 7539, 7728, 7567, 7773, 7812, 7971, 6309, 6589, 6728, 7048, 6788, 7093, 7138, 7381, 6881, 7190, 7 134, 7434, 7244, 7463, 7519, 7702, 6958, 7171, 7253, 7482, 7310, 7533, 7553, 7754, 7354, 75 88, 7616, 7793, 7638, 7833, 7866, 8003, 7030, 7279, 7348, 7546, 7398, 7594, 7624, 7822, 743 9, 7632, 7677, 7854, 7711, 7878, 7902, 8021, 7507, 7694, 7745, 7889, 7764, 7914, 7928, 8040, 7802, 7942, 7955, 8061, 7987, 8084, 8111, 8145, 315, 749, 1016, 1867, 1189, 1923, 2063, 249 5, 1325, 2017, 2143, 2544, 2218, 2685, 2728, 3313, 1434, 2103, 2183, 2664, 2350, 2827, 2954, 3375, 2412, 2935, 2865, 3453, 3082, 3539, 3630, 4128, 1526, 2252, 2383, 2846, 2466, 2901, 3 004, 3496, 2569, 3066, 3140, 3559, 3236, 3666, 3739, 4253, 2708, 3155, 3275, 3714, 3325, 38 08, 3858, 4293, 3430, 3899, 3983, 4404, 4062, 4532, 4618, 5111, 1971, 2320, 2520, 3051, 264 1, 3097, 3209, 3658, 2771, 3301, 3182, 3767, 3386, 3817, 3945, 4350, 2884, 3263, 3421, 3874, 3528, 3975, 4043, 4468, 3619, 4084, 4151, 4558, 4233, 4689, 4753, 5233, 3020, 3476, 3599, 4 013, 3705, 4122, 4185, 4655, 3783, 4213, 4267, 4714, 4380, 4797, 4879, 5298, 3915, 4324, 44 34, 4839, 4493, 4929, 4963, 5375, 4580, 5010, 5063, 5462, 5154, 5570, 5716, 5971, 1608, 228 7, 2593, 3224, 2810, 3287, 3465, 3907, 2919, 3398, 3550, 3961, 3649, 4078, 4143, 4730, 3035, 3519, 3610, 4049, 3775, 4205, 4375, 4773, 3833, 4344, 4273, 4853, 4498, 4934, 5022, 5448, 3 112, 3686, 3800, 4219, 3866, 4330, 4398, 4898, 3991, 4476, 4537, 4951, 4638, 5052, 5095, 55 55, 4108, 4563, 4680, 5083, 4750, 5177, 5207, 5612, 4820, 5247, 5327, 5692, 5393, 5809, 589 2, 6323, 3363, 3731, 3931, 4445, 4027, 4521, 4607, 5035, 4179, 4700, 4597, 5128, 4783, 5193, 5278, 5648, 4299, 4658, 4815, 5219, 4912, 5313, 5361, 5765, 4997, 5410, 5474, 5840, 5532, 5 941, 6024, 6427, 4428, 4870, 4980, 5338, 5067, 5500, 5922, 5139, 5520, 5591, 6003, 56 72, 6054, 6129, 6493, 5262, 5636, 5736, 6090, 5789, 6163, 6196, 6562, 5866, 6238, 6281, 663 5, 6379, 6740, 6859, 7045, 1682, 2438, 2790, 3508, 2986, 3570, 3750, 4193, 3125, 3694, 3850, 4259, 3923, 4392, 4440, 4971, 3248, 3792, 3883, 4367, 4070, 4510, 4644, 5018, 4137, 4633, 4 554, 5108, 4759, 5181, 5267, 5707, 3337, 3969, 4092, 4526, 4165, 4586, 4664, 5147, 4285, 47 39, 4811, 5211, 4893, 5302, 5369, 5817, 4417, 4834, 4920, 5347, 4985, 5433, 5468, 5849, 509 2, 5503, 5582, 5947, 5657, 6039, 6113, 6511, 3638, 4035, 4227, 4725, 4336, 4778, 4862, 5287, 4463, 4954, 4843, 5382, 5030, 5439, 5544, 5906, 4574, 4907, 5075, 5491, 5170, 5576, 5627, 5 988, 5252, 5674, 5727, 6068, 5806, 6169, 6219, 6605, 4685, 5131, 5227, 5606, 5333, 5701, 57 57, 6138, 5405, 5780, 5826, 6188, 5930, 6257, 6317, 6661, 5526, 5875, 5962, 6290, 6009, 635 2, 6385, 6714, 6083, 6416, 6463, 6787, 6544, 6873, 6968, 7151, 3442, 3997, 4313, 4876, 4481, 4946, 5115, 5514, 4613, 5047, 5196, 5564, 5284, 5663, 5724, 6206, 4711, 5159, 5241, 5639, 5 396, 5771, 5914, 6231, 5453, 5897, 5832, 6298, 6015, 6362, 6433, 6776, 4792, 5321, 5419, 57 97, 5482, 5883, 5938, 6335, 5600, 5995, 6047, 6368, 6120, 6453, 6503, 6845, 5683, 6075, 615 4, 6481, 6213, 6552, 6584, 6898, 6271, 6615, 6682, 6954, 6725, 7028, 7097, 7387, 5002, 5358, 5541, 5979, 5618, 6032, 6105, 6446, 5748, 6179, 6098, 6521, 6246, 6572, 6645, 6925, 5858, 6 148, 6265, 6594, 6342, 6671, 6704, 6999, 6405, 6751, 6798, 7060, 6834, 7128, 7188, 7454, 59 55, 6310, 6397, 6693, 6474, 6763, 6813, 7114, 6534, 6824, 6887, 7169, 6939, 7210, 7252, 749 3, 6624, 6911, 6981, 7232, 7015, 7278, 7302, 7534, 7077, 7330, 7358, 7585, 7419, 7644, 7717, 7827, 1748, 2617, 2970, 3825, 3197, 3891, 4057, 4543, 3349, 4005, 4157, 4602, 4247, 4719, 4 764, 5295, 3487, 4114, 4199, 4694, 4386, 4848, 4976, 5344, 4451, 4959, 4884, 5413, 5088, 54 88, 5558, 5989, 3590, 4279, 4423, 4867, 4515, 4924, 5005, 5442, 4622, 5072, 5151, 5507, 521 5, 5594, 5651, 6087, 4744, 5165, 5259, 5630, 5310, 5713, 5751, 6126, 5390, 5786, 5860, 6215, 5927, 6313, 6384, 6748, 3953, 4361, 4569, 5055, 4675, 5100, 5188, 5588, 4787, 5281, 5173, 5 669, 5352, 5722, 5829, 6175, 4901, 5244, 5379, 5768, 5479, 5855, 5912, 6262, 5552, 5958, 60 13, 6330, 6081, 6437, 6486, 6833, 5027, 5436, 5529, 5886, 5624, 5982, 6036, 6410, 5689, 606 0, 6103, 6457, 6194, 6519, 6580, 6876, 5800, 6145, 6234, 6548, 6282, 6614, 6640, 6928, 6351, 6674, 6712, 6986, 6780, 7054, 7144, 7295, 3677, 4318, 4649, 5199, 4825, 5270, 5422, 5791, 4 937, 5365, 5494, 5838, 5579, 5950, 6006, 6467, 5043, 5465, 5538, 5920, 5680, 6052, 6187, 64 97, 5733, 6167, 6111, 6558, 6287, 6619, 6686, 6974, 5119, 5603, 5704, 6063, 5759, 6153, 620 9, 6590, 5869, 6269, 6319, 6632, 6394, 6708, 6737, 7042, 5974, 6339, 6423, 6729, 6477, 6795, 6817, 7082, 6535, 6841, 6895, 7133, 6936, 7200, 7245, 7502, 5330, 5642, 5820, 6250, 5895, 6 301, 6372, 6697, 6029, 6441, 6364, 6759, 6507, 6806, 6863, 7103, 6133, 6411, 6529, 6828, 66 01, 6884, 6919, 7173, 6664, 6951, 6993, 7217, 7032, 7276, 7325, 7556, 6227, 6570, 6653, 690 4, 6718, 6961, 7006, 7265, 6769, 7021, 7068, 7314, 7117, 7346, 7391, 7593, 6852, 7091, 7158, 7366, 7184, 7407, 7428, 7628, 7230, 7449, 7476, 7669, 7528, 7723, 7783, 7875, 3758, 4487, 4 806, 5456, 4993, 5517, 5660, 6045, 5134, 5615, 5745, 6096, 5812, 6200, 6243, 6649, 5230, 56 95, 5777, 6182, 5936, 6294, 6401, 6678, 5997, 6390, 6329, 6744, 6488, 6802, 6856, 7140, 531 6, 5846, 5965, 6306, 6021, 6358, 6420, 6772, 6118, 6471, 6525, 6820, 6587, 6880, 6921, 7202, 6225, 6539, 6610, 6908, 6657, 6964, 6990, 7222, 6733, 7011, 7063, 7283, 7108, 7339, 7378, 7 604, 5567, 5903, 6072, 6459, 6160, 6501, 6566, 6870, 6253, 6639, 6554, 6932, 6689, 6970, 70 38, 7257, 6346, 6598, 6722, 7003, 6791, 7056, 7089, 7307, 6848, 7122, 7155, 7350, 7195, 741 1, 7441, 7653, 6431, 6765, 6831, 7074, 6901, 7136, 7165, 7395, 6948, 7181, 7207, 7423, 7267, 7462, 7497, 7679, 7024, 7237, 7291, 7479, 7318, 7515, 7537, 7707, 7363, 7551, 7575, 7746, 7 619, 7788, 7840, 7923, 5399, 5878, 6141, 6576, 6275, 6628, 6755, 7017, 6375, 6701, 6809, 70 50, 6867, 7111, 7147, 7432, 6448, 6783, 6837, 7100, 6944, 7177, 7260, 7446, 6978, 7250, 721 5, 7484, 7323, 7521, 7561, 7740, 6515, 6891, 6957, 7192, 6996, 7240, 7271, 7505, 7071, 7311, 7343, 7524, 7383, 7570, 7599, 7775, 7125, 7355, 7402, 7589, 7437, 7623, 7639, 7800, 7472, 7 659, 7690, 7834, 7712, 7869, 7899, 8019, 6668, 6915, 7036, 7299, 7086, 7334, 7374, 7565, 71 63, 7415, 7369, 7608, 7458, 7634, 7674, 7814, 7225, 7400, 7466, 7649, 7511, 7685, 7700, 785 3, 7547, 7729, 7752, 7883, 7769, 7916, 7940, 8044, 7287, 7487, 7543, 7696, 7579, 7735, 7758, 7906, 7613, 7765, 7795, 7931, 7819, 7949, 7967, 8057, 7664, 7807, 7847, 7959, 7861, 7977, 7 988, 8072, 7891, 7997, 8009, 8088, 8031, 8105, 8126, 8152, 1813, 2748, 3167, 4171, 3409, 42 39, 4411, 4889, 3579, 4355, 4504, 4942, 4591, 5080, 5123, 5645, 3722, 4457, 4549, 5060, 473 4, 5204, 5324, 5698, 4801, 5306, 5236, 5762, 5445, 5843, 5917, 6322, 3842, 4628, 4769, 5222, 4857, 5273, 5372, 5803, 4968, 5430, 5497, 5863, 5573, 5953, 6011, 6407, 5103, 5511, 5609, 5 992, 5654, 6070, 6108, 6440, 5742, 6142, 6210, 6517, 6273, 6604, 6662, 6991, 4305, 4705, 49 15, 5416, 5038, 5459, 5549, 5944, 5142, 5633, 5523, 6034, 5710, 6078, 6176, 6480, 5255, 559 7, 5730, 6123, 5835, 6203, 6255, 6559, 5909, 6291, 6336, 6622, 6398, 6709, 6753, 7069, 5385, 5783, 5889, 6237, 5985, 6314, 6359, 6687, 6050, 6381, 6418, 6727, 6498, 6782, 6840, 7109, 6 157, 6461, 6538, 6808, 6578, 6872, 6896, 7156, 6637, 6927, 6960, 7208, 7019, 7273, 7356, 74 85, 3937, 4669, 4988, 5561, 5185, 5621, 5774, 6150, 5292, 5719, 5852, 6191, 5933, 6285, 633 3, 6738, 5402, 5823, 5900, 6259, 6042, 6377, 6494, 6764, 6093, 6476, 6424, 6818, 6582, 6875, 6933, 7201, 5471, 5968, 6065, 6388, 6115, 6464, 6513, 6851, 6218, 6565, 6608, 6885, 6676, 6 952, 6982, 7262, 6303, 6625, 6702, 6973, 6749, 7034, 7051, 7297, 6797, 7080, 7127, 7341, 71 67, 7403, 7444, 7652, 5686, 6000, 6172, 6545, 6241, 6596, 6654, 6943, 6355, 6719, 6647, 700 1, 6771, 7044, 7095, 7317, 6444, 6691, 6793, 7062, 6861, 7118, 7149, 7380, 6916, 7178, 7216, 7420, 7251, 7471, 7512, 7699, 6531, 6829, 6907, 7135, 6962, 7187, 7231, 7460, 7010, 7243, 7 285, 7499, 7331, 7527, 7563, 7727, 7087, 7309, 7367, 7544, 7393, 7578, 7596, 7757, 7431, 76 14, 7633, 7787, 7678, 7830, 7879, 7948, 4021, 4829, 5162, 5815, 5355, 5872, 6018, 6365, 548 5, 5976, 6100, 6414, 6165, 6508, 6542, 6899, 5585, 6057, 6130, 6490, 6278, 6586, 6679, 6931, 6326, 6672, 6618, 6987, 6756, 7037, 7090, 7351, 5666, 6198, 6297, 6600, 6348, 6643, 6694, 7 012, 6436, 6742, 6790, 7055, 6847, 7113, 7154, 7408, 6524, 6804, 6864, 7141, 6910, 7191, 72 13, 7425, 6979, 7235, 7281, 7473, 7322, 7518, 7555, 7736, 5924, 6247, 6392, 6734, 6470, 676 7, 6822, 7104, 6556, 6889, 6811, 7161, 6940, 7197, 7258, 7453, 6633, 6857, 6969, 7227, 7029, 7275, 7306, 7492, 7081, 7333, 7361, 7532, 7401, 7582, 7605, 7777, 6706, 7004, 7064, 7293, 7 131, 7347, 7376, 7566, 7174, 7389, 7412, 7591, 7465, 7622, 7650, 7798, 7246, 7436, 7481, 76 37, 7504, 7666, 7682, 7820, 7540, 7695, 7715, 7849, 7750, 7884, 7920, 7985, 5754, 6222, 645 0, 6836, 6568, 6882, 6994, 7239, 6658, 6949, 7047, 7268, 7102, 7327, 7360, 7598, 6723, 7023, 7073, 7313, 7170, 7384, 7456, 7611, 7203, 7448, 7417, 7641, 7508, 7671, 7703, 7845, 6779, 7 123, 7183, 7397, 7221, 7440, 7468, 7658, 7289, 7496, 7523, 7673, 7558, 7710, 7732, 7872, 73 38, 7536, 7576, 7724, 7601, 7753, 7767, 7893, 7629, 7780, 7806, 7913, 7825, 7943, 7966, 805 9, 6920, 7145, 7255, 7489, 7301, 7516, 7550, 7708, 7372, 7586, 7548, 7741, 7617, 7761, 7791, 7904, 7429, 7571, 7626, 7771, 7661, 7803, 7816, 7932, 7689, 7835, 7852, 7953, 7868, 7978, 7 998, 8078, 7477, 7647, 7687, 7811, 7721, 7838, 7859, 7973, 7744, 7863, 7888, 7992, 7909, 80 05, 8018, 8089, 7784, 7898, 7925, 8013, 7937, 8027, 8035, 8099, 7961, 8043, 8051, 8112, 806 9, 8124, 8140, 8160, 4100, 5013, 5341, 6086, 5535, 6135, 6266, 6611, 5677, 6229, 6344, 6650, 6403, 6730, 6760, 7107, 5794, 6307, 6371, 6715, 6504, 6814, 6903, 7137, 6549, 6892, 6844, 7 179, 6976, 7223, 7266, 7495, 5880, 6429, 6527, 6825, 6592, 6868, 6924, 7198, 6666, 6966, 70 16, 7236, 7058, 7286, 7319, 7542, 6745, 7025, 7084, 7308, 7116, 7352, 7373, 7560, 7164, 739 0, 7430, 7603, 7464, 7648, 7681, 7832, 6184, 6484, 6629, 6956, 6698, 6985, 7041, 7282, 6775, 7099, 7031, 7329, 7142, 7357, 7413, 7583, 6853, 7076, 7159, 7382, 7220, 7426, 7455, 7625, 7 261, 7478, 7506, 7657, 7538, 7704, 7725, 7867, 6937, 7193, 7247, 7443, 7303, 7491, 7517, 76 91, 7340, 7529, 7549, 7713, 7592, 7739, 7766, 7885, 7399, 7569, 7612, 7751, 7635, 7779, 779 0, 7905, 7665, 7804, 7818, 7926, 7846, 7951, 7983, 8032, 5960, 6454, 6683, 7049, 6801, 7094, 7186, 7394, 6879, 7150, 7228, 7418, 7277, 7474, 7503, 7716, 6945, 7212, 7254, 7459, 7335, 7 525, 7590, 7730, 7364, 7581, 7554, 7756, 7636, 7781, 7809, 7922, 6998, 7292, 7349, 7531, 73 77, 7572, 7600, 7770, 7435, 7627, 7651, 7786, 7684, 7817, 7829, 7947, 7486, 7660, 7698, 782 6, 7722, 7851, 7860, 7962, 7748, 7871, 7892, 7979, 7908, 8001, 8016, 8091, 7130, 7315, 7409, 7620, 7447, 7643, 7675, 7813, 7513, 7705, 7672, 7837, 7734, 7856, 7880, 7969, 7564, 7693, 7 743, 7864, 7774, 7887, 7901, 7993, 7799, 7912, 7929, 8008, 7944, 8026, 8042, 8104, 7610, 77 60, 7796, 7896, 7821, 7918, 7934, 8023, 7842, 7939, 7956, 8038, 7974, 8048, 8060, 8114, 787 4, 7965, 7989, 8053, 7996, 8066, 8071, 8121, 8012, 8077, 8083, 8130, 8097, 8141, 8153, 8167, 6027, 6573, 6786, 7206, 6913, 7242, 7324, 7522, 7007, 7298, 7368, 7545, 7406, 7597, 7615, 7 794, 7067, 7344, 7385, 7587, 7467, 7640, 7688, 7805, 7498, 7683, 7656, 7831, 7726, 7855, 78 77, 7982, 7121, 7422, 7483, 7645, 7509, 7668, 7697, 7843, 7557, 7718, 7742, 7862, 7768, 788 6, 7903, 8002, 7606, 7749, 7778, 7897, 7797, 7919, 7927, 8010, 7828, 7935, 7954, 8028, 7970, 8046, 8056, 8116, 7270, 7450, 7535, 7714, 7577, 7731, 7759, 7882, 7621, 7789, 7755, 7907, 7 810, 7921, 7946, 8020, 7663, 7772, 7823, 7933, 7850, 7952, 7964, 8036, 7873, 7975, 7986, 80 49, 8000, 8067, 8075, 8127, 7701, 7839, 7865, 7960, 7894, 7980, 7991, 8062, 7911, 7995, 800 4, 8070, 8024, 8080, 8090, 8132, 7941, 8014, 8030, 8085, 8039, 8094, 8100, 8137, 8052, 8103, 8109, 8146, 8119, 8154, 8162, 8173, 7172, 7438, 7568, 7763, 7631, 7785, 7836, 7938, 7676, 7 815, 7857, 7950, 7881, 7972, 7984, 8073, 7709, 7848, 7870, 7968, 7910, 7994, 8022, 8076, 79 24, 8017, 8007, 8086, 8041, 8095, 8106, 8144, 7738, 7890, 7917, 7999, 7930, 8015, 8025, 809 2, 7958, 8037, 8047, 8096, 8058, 8108, 8115, 8151, 7976, 8050, 8065, 8113, 8074, 8120, 8123, 8156, 8082, 8128, 8134, 8161, 8139, 8166, 8170, 8183, 7801, 7900, 7945, 8034, 7963, 8045, 8 055, 8107, 7990, 8068, 8054, 8117, 8079, 8122, 8131, 8158, 8011, 8063, 8081, 8125, 8093, 81 33, 8136, 8164, 8102, 8142, 8147, 8168, 8150, 8172, 8175, 8185, 8029, 8087, 8101, 8135, 811 0, 8143, 8148, 8171, 8118, 8149, 8155, 8174, 8159, 8176, 8178, 8186, 8129, 8157, 8163, 8177, 8165, 8179, 8180, 8187, 8169, 8181, 8182, 8188, 8184, 8189, 8190, 8191

TABLE Z9 with a sequence length of 8192:

| Polarized channel sequence number | Reliability or reliability sequence number |
|---|---|
| 0 | 0 |
| 1 | 1 |
| 2 | 2 |
| 3 | 13 |
| 4 | 3 |
| 5 | 14 |
| 6 | 17 |
| 7 | 30 |
| 8 | 4 |
| 9 | 16 |
| 10 | 19 |
| 11 | 32 |
| 12 | 21 |
| 13 | 38 |
| 14 | 40 |
| 15 | 79 |
| 16 | 5 |
| 17 | 18 |
| 18 | 20 |
| 19 | 37 |
| 20 | 25 |
| 21 | 45 |
| 22 | 54 |
| 23 | 85 |
| 24 | 27 |
| 25 | 52 |
| 26 | 48 |
| 27 | 92 |
| 28 | 62 |
| 29 | 101 |
| 30 | 111 |
| 31 | 178 |
| 32 | 6 |
| 33 | 22 |
| 34 | 26 |
| 35 | 46 |
| 36 | 29 |
| 37 | 50 |
| 38 | 57 |
| 39 | 97 |
| 40 | 33 |
| 41 | 61 |
| 42 | 66 |
| 43 | 103 |
| 44 | 73 |
| 45 | 115 |
| 46 | 123 |
| 47 | 198 |
| 48 | 39 |
| 49 | 67 |
| 50 | 76 |
| 51 | 120 |
| 52 | 80 |
| 53 | 133 |
| 54 | 139 |
| 55 | 204 |
| 56 | 90 |
| 57 | 144 |
| 58 | 156 |
| 59 | 225 |
| 60 | 168 |
| 61 | 249 |
| 62 | 268 |
| 63 | 395 |
| 64 | 15 |

TABLE Z9-continued

| with a sequence length of 8192: | |
|---|---|
| Polarized channel sequence number | Reliability or reliability sequence number |
| 65 | 24 |
| 66 | 31 |
| 67 | 60 |
| 68 | 36 |
| 69 | 63 |
| 70 | 71 |
| 71 | 114 |
| 72 | 42 |
| 73 | 78 |
| 74 | 69 |
| 75 | 126 |
| 76 | 86 |
| 77 | 134 |
| 78 | 150 |
| 79 | 215 |
| 80 | 49 |
| 81 | 75 |
| 82 | 89 |
| 83 | 141 |
| 84 | 100 |
| 85 | 155 |
| 86 | 165 |
| 87 | 238 |
| 88 | 110 |
| 89 | 172 |
| 90 | 181 |
| 91 | 255 |
| 92 | 195 |
| 93 | 284 |
| 94 | 299 |
| 95 | 434 |
| 96 | 58 |
| 97 | 95 |
| 98 | 107 |
| 99 | 161 |
| 100 | 119 |
| 101 | 177 |
| 102 | 187 |
| 103 | 275 |
| 104 | 129 |
| 105 | 192 |
| 106 | 200 |
| 107 | 289 |
| 108 | 220 |
| 109 | 309 |
| 110 | 330 |
| 111 | 456 |
| 112 | 146 |
| 113 | 211 |
| 114 | 230 |
| 115 | 320 |
| 116 | 242 |
| 117 | 343 |
| 118 | 353 |
| 119 | 483 |
| 120 | 260 |
| 121 | 365 |
| 122 | 381 |
| 123 | 516 |
| 124 | 408 |
| 125 | 558 |
| 126 | 622 |
| 127 | 742 |
| 128 | 7 |
| 129 | 23 |
| 130 | 34 |
| 131 | 72 |
| 132 | 44 |
| 133 | 77 |
| 134 | 94 |
| 135 | 145 |
| 136 | 51 |
| 137 | 87 |
| 138 | 102 |
| 139 | 153 |

TABLE Z9-continued

| with a sequence length of 8192: | |
|---|---|
| Polarized channel sequence number | Reliability or reliability sequence number |
| 140 | 113 |
| 141 | 170 |
| 142 | 180 |
| 143 | 293 |
| 144 | 59 |
| 145 | 99 |
| 146 | 109 |
| 147 | 166 |
| 148 | 127 |
| 149 | 191 |
| 150 | 219 |
| 151 | 304 |
| 152 | 136 |
| 153 | 214 |
| 154 | 201 |
| 155 | 323 |
| 156 | 243 |
| 157 | 344 |
| 158 | 369 |
| 159 | 510 |
| 160 | 64 |
| 161 | 117 |
| 162 | 131 |
| 163 | 193 |
| 164 | 140 |
| 165 | 212 |
| 166 | 224 |
| 167 | 335 |
| 168 | 157 |
| 169 | 239 |
| 170 | 251 |
| 171 | 349 |
| 172 | 272 |
| 173 | 377 |
| 174 | 391 |
| 175 | 552 |
| 176 | 175 |
| 177 | 257 |
| 178 | 282 |
| 179 | 387 |
| 180 | 298 |
| 181 | 416 |
| 182 | 425 |
| 183 | 577 |
| 184 | 316 |
| 185 | 439 |
| 186 | 466 |
| 187 | 611 |
| 188 | 489 |
| 189 | 663 |
| 190 | 702 |
| 191 | 947 |
| 192 | 84 |
| 193 | 122 |
| 194 | 148 |
| 195 | 232 |
| 196 | 163 |
| 197 | 247 |
| 198 | 266 |
| 199 | 373 |
| 200 | 186 |
| 201 | 286 |
| 202 | 263 |
| 203 | 400 |
| 204 | 306 |
| 205 | 421 |
| 206 | 449 |
| 207 | 592 |
| 208 | 206 |
| 209 | 277 |
| 210 | 313 |
| 211 | 430 |
| 212 | 339 |
| 213 | 461 |
| 214 | 478 |

TABLE Z9-continued

| with a sequence length of 8192: | |
|---|---|
| Polarized channel sequence number | Reliability or reliability sequence number |
| 215 | 643 |
| 216 | 362 |
| 217 | 495 |
| 218 | 520 |
| 219 | 677 |
| 220 | 543 |
| 221 | 726 |
| 222 | 769 |
| 223 | 1019 |
| 224 | 229 |
| 225 | 328 |
| 226 | 357 |
| 227 | 469 |
| 228 | 382 |
| 229 | 502 |
| 230 | 531 |
| 231 | 716 |
| 232 | 404 |
| 233 | 538 |
| 234 | 567 |
| 235 | 757 |
| 236 | 602 |
| 237 | 785 |
| 238 | 826 |
| 239 | 1067 |
| 240 | 443 |
| 241 | 587 |
| 242 | 631 |
| 243 | 805 |
| 244 | 654 |
| 245 | 847 |
| 246 | 867 |
| 247 | 1121 |
| 248 | 689 |
| 249 | 893 |
| 250 | 920 |
| 251 | 1181 |
| 252 | 985 |
| 253 | 1273 |
| 254 | 1390 |
| 255 | 1599 |
| 256 | 8 |
| 257 | 28 |
| 258 | 43 |
| 259 | 98 |
| 260 | 56 |
| 261 | 104 |
| 262 | 124 |
| 263 | 188 |
| 264 | 65 |
| 265 | 118 |
| 266 | 138 |
| 267 | 199 |
| 268 | 147 |
| 269 | 223 |
| 270 | 231 |
| 271 | 355 |
| 272 | 74 |
| 273 | 130 |
| 274 | 142 |
| 275 | 218 |
| 276 | 169 |
| 277 | 245 |
| 278 | 273 |
| 279 | 368 |
| 280 | 179 |
| 281 | 271 |
| 282 | 254 |
| 283 | 394 |
| 284 | 300 |
| 285 | 417 |
| 286 | 445 |
| 287 | 617 |
| 288 | 82 |
| 289 | 154 |

TABLE Z9-continued

| with a sequence length of 8192: | |
|---|---|
| Polarized channel sequence number | Reliability or reliability sequence number |
| 290 | 173 |
| 291 | 248 |
| 292 | 183 |
| 293 | 261 |
| 294 | 279 |
| 295 | 406 |
| 296 | 203 |
| 297 | 295 |
| 298 | 312 |
| 299 | 426 |
| 300 | 334 |
| 301 | 457 |
| 302 | 480 |
| 303 | 667 |
| 304 | 227 |
| 305 | 319 |
| 306 | 341 |
| 307 | 474 |
| 308 | 358 |
| 309 | 504 |
| 310 | 518 |
| 311 | 682 |
| 312 | 389 |
| 313 | 532 |
| 314 | 564 |
| 315 | 728 |
| 316 | 595 |
| 317 | 778 |
| 318 | 818 |
| 319 | 1081 |
| 320 | 112 |
| 321 | 164 |
| 322 | 194 |
| 323 | 292 |
| 324 | 213 |
| 325 | 305 |
| 326 | 325 |
| 327 | 452 |
| 328 | 236 |
| 329 | 351 |
| 330 | 321 |
| 331 | 486 |
| 332 | 372 |
| 333 | 507 |
| 334 | 548 |
| 335 | 708 |
| 336 | 259 |
| 337 | 337 |
| 338 | 385 |
| 339 | 527 |
| 340 | 413 |
| 341 | 562 |
| 342 | 582 |
| 343 | 750 |
| 344 | 440 |
| 345 | 603 |
| 346 | 627 |
| 347 | 792 |
| 348 | 662 |
| 349 | 851 |
| 350 | 881 |
| 351 | 1156 |
| 352 | 283 |
| 353 | 402 |
| 354 | 432 |
| 355 | 574 |
| 356 | 468 |
| 357 | 615 |
| 358 | 638 |
| 359 | 832 |
| 360 | 494 |
| 361 | 649 |
| 362 | 670 |
| 363 | 862 |
| 364 | 720 |

TABLE Z9-continued

| with a sequence length of 8192: | |
|---|---|
| Polarized channel sequence number | Reliability or reliability sequence number |
| 365 | 905 |
| 366 | 943 |
| 367 | 1203 |
| 368 | 541 |
| 369 | 694 |
| 370 | 737 |
| 371 | 925 |
| 372 | 761 |
| 373 | 967 |
| 374 | 990 |
| 375 | 1249 |
| 376 | 801 |
| 377 | 1011 |
| 378 | 1046 |
| 379 | 1319 |
| 380 | 1107 |
| 381 | 1405 |
| 382 | 1507 |
| 383 | 1736 |
| 384 | 91 |
| 385 | 159 |
| 386 | 208 |
| 387 | 329 |
| 388 | 240 |
| 389 | 347 |
| 390 | 396 |
| 391 | 535 |
| 392 | 267 |
| 393 | 376 |
| 394 | 422 |
| 395 | 556 |
| 396 | 451 |
| 397 | 599 |
| 398 | 626 |
| 399 | 873 |
| 400 | 288 |
| 401 | 409 |
| 402 | 436 |
| 403 | 588 |
| 404 | 491 |
| 405 | 645 |
| 406 | 713 |
| 407 | 889 |
| 408 | 511 |
| 409 | 705 |
| 410 | 674 |
| 411 | 931 |
| 412 | 764 |
| 413 | 972 |
| 414 | 1023 |
| 415 | 1309 |
| 416 | 308 |
| 417 | 463 |
| 418 | 500 |
| 419 | 657 |
| 420 | 523 |
| 421 | 697 |
| 422 | 725 |
| 423 | 955 |
| 424 | 571 |
| 425 | 754 |
| 426 | 781 |
| 427 | 977 |
| 428 | 822 |
| 429 | 1037 |
| 430 | 1075 |
| 431 | 1376 |
| 432 | 608 |
| 433 | 797 |
| 434 | 842 |
| 435 | 1060 |
| 436 | 877 |
| 437 | 1112 |
| 438 | 1138 |
| 439 | 1430 |

TABLE Z9-continued

| with a sequence length of 8192: | |
|---|---|
| Polarized channel sequence number | Reliability or reliability sequence number |
| 440 | 914 |
| 441 | 1165 |
| 442 | 1222 |
| 443 | 1492 |
| 444 | 1260 |
| 445 | 1577 |
| 446 | 1663 |
| 447 | 2102 |
| 448 | 363 |
| 449 | 477 |
| 450 | 547 |
| 451 | 745 |
| 452 | 579 |
| 453 | 773 |
| 454 | 814 |
| 455 | 1033 |
| 456 | 635 |
| 457 | 857 |
| 458 | 809 |
| 459 | 1089 |
| 460 | 897 |
| 461 | 1129 |
| 462 | 1190 |
| 463 | 1459 |
| 464 | 686 |
| 465 | 837 |
| 466 | 909 |
| 467 | 1147 |
| 468 | 960 |
| 469 | 1211 |
| 470 | 1241 |
| 471 | 1543 |
| 472 | 1004 |
| 473 | 1284 |
| 474 | 1329 |
| 475 | 1616 |
| 476 | 1365 |
| 477 | 1705 |
| 478 | 1788 |
| 479 | 2227 |
| 480 | 733 |
| 481 | 938 |
| 482 | 997 |
| 483 | 1231 |
| 484 | 1053 |
| 485 | 1294 |
| 486 | 1344 |
| 487 | 1685 |
| 488 | 1098 |
| 489 | 1355 |
| 490 | 1420 |
| 491 | 1759 |
| 492 | 1474 |
| 493 | 1818 |
| 494 | 1880 |
| 495 | 2306 |
| 496 | 1172 |
| 497 | 1445 |
| 498 | 1522 |
| 499 | 1851 |
| 500 | 1561 |
| 501 | 1921 |
| 502 | 1958 |
| 503 | 2392 |
| 504 | 1638 |
| 505 | 2004 |
| 506 | 2052 |
| 507 | 2503 |
| 508 | 2160 |
| 509 | 2640 |
| 510 | 2834 |
| 511 | 3174 |
| 512 | 9 |
| 513 | 35 |
| 514 | 55 |

TABLE Z9-continued with a sequence length of 8192:

| Polarized channel sequence number | Reliability or reliability sequence number |
|---|---|
| 515 | 135 |
| 516 | 70 |
| 517 | 143 |
| 518 | 167 |
| 519 | 252 |
| 520 | 83 |
| 521 | 160 |
| 522 | 182 |
| 523 | 264 |
| 524 | 197 |
| 525 | 291 |
| 526 | 301 |
| 527 | 454 |
| 528 | 96 |
| 529 | 176 |
| 530 | 190 |
| 531 | 285 |
| 532 | 222 |
| 533 | 322 |
| 534 | 356 |
| 535 | 471 |
| 536 | 233 |
| 537 | 352 |
| 538 | 331 |
| 539 | 496 |
| 540 | 388 |
| 541 | 526 |
| 542 | 553 |
| 543 | 751 |
| 544 | 106 |
| 545 | 202 |
| 546 | 228 |
| 547 | 327 |
| 548 | 246 |
| 549 | 342 |
| 550 | 364 |
| 551 | 508 |
| 552 | 269 |
| 553 | 383 |
| 554 | 407 |
| 555 | 533 |
| 556 | 427 |
| 557 | 569 |
| 558 | 593 |
| 559 | 804 |
| 560 | 297 |
| 561 | 412 |
| 562 | 442 |
| 563 | 585 |
| 564 | 460 |
| 565 | 621 |
| 566 | 636 |
| 567 | 825 |
| 568 | 488 |
| 569 | 652 |
| 570 | 687 |
| 571 | 878 |
| 572 | 719 |
| 573 | 940 |
| 574 | 989 |
| 575 | 1281 |
| 576 | 151 |
| 577 | 217 |
| 578 | 258 |
| 579 | 378 |
| 580 | 281 |
| 581 | 392 |
| 582 | 420 |
| 583 | 566 |
| 584 | 307 |
| 585 | 450 |
| 586 | 414 |
| 587 | 601 |
| 588 | 475 |
| 589 | 624 |

TABLE Z9-continued with a sequence length of 8192:

| Polarized channel sequence number | Reliability or reliability sequence number |
|---|---|
| 590 | 672 |
| 591 | 853 |
| 592 | 336 |
| 593 | 437 |
| 594 | 484 |
| 595 | 644 |
| 596 | 521 |
| 597 | 684 |
| 598 | 712 |
| 599 | 907 |
| 600 | 551 |
| 601 | 734 |
| 602 | 763 |
| 603 | 952 |
| 604 | 799 |
| 605 | 1027 |
| 606 | 1062 |
| 607 | 1363 |
| 608 | 371 |
| 609 | 505 |
| 610 | 542 |
| 611 | 699 |
| 612 | 581 |
| 613 | 746 |
| 614 | 775 |
| 615 | 1006 |
| 616 | 610 |
| 617 | 789 |
| 618 | 813 |
| 619 | 1041 |
| 620 | 865 |
| 621 | 1088 |
| 622 | 1136 |
| 623 | 1409 |
| 624 | 658 |
| 625 | 836 |
| 626 | 890 |
| 627 | 1110 |
| 628 | 921 |
| 629 | 1163 |
| 630 | 1186 |
| 631 | 1463 |
| 632 | 966 |
| 633 | 1215 |
| 634 | 1248 |
| 635 | 1528 |
| 636 | 1312 |
| 637 | 1609 |
| 638 | 1725 |
| 639 | 1946 |
| 640 | 116 |
| 641 | 209 |
| 642 | 274 |
| 643 | 423 |
| 644 | 317 |
| 645 | 446 |
| 646 | 501 |
| 647 | 655 |
| 648 | 345 |
| 649 | 479 |
| 650 | 528 |
| 651 | 676 |
| 652 | 563 |
| 653 | 731 |
| 654 | 760 |
| 655 | 1048 |
| 656 | 375 |
| 657 | 517 |
| 658 | 545 |
| 659 | 715 |
| 660 | 606 |
| 661 | 784 |
| 662 | 861 |
| 663 | 1070 |
| 664 | 630 |

TABLE Z9-continued with a sequence length of 8192:

| Polarized channel sequence number | Reliability or reliability sequence number |
|---|---|
| 665 | 849 |
| 666 | 816 |
| 667 | 1117 |
| 668 | 924 |
| 669 | 1168 |
| 670 | 1224 |
| 671 | 1514 |
| 672 | 397 |
| 673 | 572 |
| 674 | 616 |
| 675 | 790 |
| 676 | 641 |
| 677 | 841 |
| 678 | 874 |
| 679 | 1143 |
| 680 | 690 |
| 681 | 912 |
| 682 | 945 |
| 683 | 1178 |
| 684 | 996 |
| 685 | 1245 |
| 686 | 1270 |
| 687 | 1595 |
| 688 | 743 |
| 689 | 957 |
| 690 | 1015 |
| 691 | 1264 |
| 692 | 1056 |
| 693 | 1326 |
| 694 | 1347 |
| 695 | 1644 |
| 696 | 1101 |
| 697 | 1372 |
| 698 | 1426 |
| 699 | 1711 |
| 700 | 1471 |
| 701 | 1802 |
| 702 | 1869 |
| 703 | 2323 |
| 704 | 467 |
| 705 | 589 |
| 706 | 668 |
| 707 | 900 |
| 708 | 703 |
| 709 | 932 |
| 710 | 981 |
| 711 | 1235 |
| 712 | 772 |
| 713 | 1029 |
| 714 | 975 |
| 715 | 1292 |
| 716 | 1078 |
| 717 | 1336 |
| 718 | 1394 |
| 719 | 1671 |
| 720 | 830 |
| 721 | 1008 |
| 722 | 1095 |
| 723 | 1358 |
| 724 | 1154 |
| 725 | 1416 |
| 726 | 1452 |
| 727 | 1765 |
| 728 | 1206 |
| 729 | 1488 |
| 730 | 1535 |
| 731 | 1828 |
| 732 | 1582 |
| 733 | 1917 |
| 734 | 1996 |
| 735 | 2442 |
| 736 | 885 |
| 737 | 1128 |
| 738 | 1197 |
| 739 | 1437 |

TABLE Z9-continued with a sequence length of 8192:

| Polarized channel sequence number | Reliability or reliability sequence number |
|---|---|
| 740 | 1253 |
| 741 | 1499 |
| 742 | 1552 |
| 743 | 1898 |
| 744 | 1301 |
| 745 | 1568 |
| 746 | 1626 |
| 747 | 1977 |
| 748 | 1689 |
| 749 | 2030 |
| 750 | 2109 |
| 751 | 2524 |
| 752 | 1383 |
| 753 | 1657 |
| 754 | 1745 |
| 755 | 2064 |
| 756 | 1781 |
| 757 | 2138 |
| 758 | 2177 |
| 759 | 2604 |
| 760 | 1847 |
| 761 | 2219 |
| 762 | 2269 |
| 763 | 2704 |
| 764 | 2381 |
| 765 | 2848 |
| 766 | 3027 |
| 767 | 3359 |
| 768 | 125 |
| 769 | 241 |
| 770 | 311 |
| 771 | 513 |
| 772 | 361 |
| 773 | 536 |
| 774 | 597 |
| 775 | 780 |
| 776 | 403 |
| 777 | 578 |
| 778 | 634 |
| 779 | 808 |
| 780 | 664 |
| 781 | 869 |
| 782 | 895 |
| 783 | 1193 |
| 784 | 433 |
| 785 | 613 |
| 786 | 648 |
| 787 | 858 |
| 788 | 724 |
| 789 | 928 |
| 790 | 1000 |
| 791 | 1218 |
| 792 | 755 |
| 793 | 992 |
| 794 | 951 |
| 795 | 1277 |
| 796 | 1064 |
| 797 | 1333 |
| 798 | 1387 |
| 799 | 1719 |
| 800 | 462 |
| 801 | 680 |
| 802 | 738 |
| 803 | 936 |
| 804 | 767 |
| 805 | 970 |
| 806 | 1014 |
| 807 | 1305 |
| 808 | 820 |
| 809 | 1051 |
| 810 | 1092 |
| 811 | 1351 |
| 812 | 1142 |
| 813 | 1412 |
| 814 | 1456 |

TABLE Z9-continued with a sequence length of 8192:

| Polarized channel sequence number | Reliability or reliability sequence number |
|---|---|
| 815 | 1807 |
| 816 | 884 |
| 817 | 1103 |
| 818 | 1160 |
| 819 | 1441 |
| 820 | 1199 |
| 821 | 1503 |
| 822 | 1532 |
| 823 | 1835 |
| 824 | 1267 |
| 825 | 1557 |
| 826 | 1620 |
| 827 | 1928 |
| 828 | 1678 |
| 829 | 2018 |
| 830 | 2087 |
| 831 | 2548 |
| 832 | 557 |
| 833 | 707 |
| 834 | 796 |
| 835 | 1042 |
| 836 | 845 |
| 837 | 1074 |
| 838 | 1124 |
| 839 | 1401 |
| 840 | 901 |
| 841 | 1185 |
| 842 | 1115 |
| 843 | 1467 |
| 844 | 1228 |
| 845 | 1510 |
| 846 | 1591 |
| 847 | 1886 |
| 848 | 962 |
| 849 | 1150 |
| 850 | 1257 |
| 851 | 1547 |
| 852 | 1322 |
| 853 | 1613 |
| 854 | 1653 |
| 855 | 1965 |
| 856 | 1379 |
| 857 | 1696 |
| 858 | 1739 |
| 859 | 2038 |
| 860 | 1795 |
| 861 | 2145 |
| 862 | 2203 |
| 863 | 2666 |
| 864 | 1022 |
| 865 | 1298 |
| 866 | 1361 |
| 867 | 1634 |
| 868 | 1433 |
| 869 | 1715 |
| 870 | 1755 |
| 871 | 2117 |
| 872 | 1484 |
| 873 | 1776 |
| 874 | 1814 |
| 875 | 2169 |
| 876 | 1902 |
| 877 | 2243 |
| 878 | 2315 |
| 879 | 2730 |
| 880 | 1573 |
| 881 | 1857 |
| 882 | 1940 |
| 883 | 2278 |
| 884 | 1984 |
| 885 | 2352 |
| 886 | 2401 |
| 887 | 2803 |
| 888 | 2060 |
| 889 | 2433 |

TABLE Z9-continued with a sequence length of 8192:

| Polarized channel sequence number | Reliability or reliability sequence number |
|---|---|
| 890 | 2480 |
| 891 | 2915 |
| 892 | 2580 |
| 893 | 3047 |
| 894 | 3225 |
| 895 | 3560 |
| 896 | 492 |
| 897 | 695 |
| 898 | 834 |
| 899 | 1133 |
| 900 | 916 |
| 901 | 1175 |
| 902 | 1288 |
| 903 | 1564 |
| 904 | 982 |
| 905 | 1239 |
| 906 | 1340 |
| 907 | 1605 |
| 908 | 1398 |
| 909 | 1681 |
| 910 | 1729 |
| 911 | 2187 |
| 912 | 1034 |
| 913 | 1316 |
| 914 | 1368 |
| 915 | 1667 |
| 916 | 1481 |
| 917 | 1769 |
| 918 | 1892 |
| 919 | 2210 |
| 920 | 1518 |
| 921 | 1876 |
| 922 | 1824 |
| 923 | 2286 |
| 924 | 1992 |
| 925 | 2364 |
| 926 | 2453 |
| 927 | 2897 |
| 928 | 1084 |
| 929 | 1424 |
| 930 | 1495 |
| 931 | 1791 |
| 932 | 1539 |
| 933 | 1862 |
| 934 | 1910 |
| 935 | 2332 |
| 936 | 1630 |
| 937 | 1973 |
| 938 | 2026 |
| 939 | 2372 |
| 940 | 2094 |
| 941 | 2471 |
| 942 | 2536 |
| 943 | 3005 |
| 944 | 1699 |
| 945 | 2045 |
| 946 | 2130 |
| 947 | 2512 |
| 948 | 2195 |
| 949 | 2592 |
| 950 | 2628 |
| 951 | 3085 |
| 952 | 2262 |
| 953 | 2678 |
| 954 | 2760 |
| 955 | 3199 |
| 956 | 2817 |
| 957 | 3331 |
| 958 | 3454 |
| 959 | 4085 |
| 960 | 1210 |
| 961 | 1448 |
| 962 | 1586 |
| 963 | 1954 |
| 964 | 1648 |

TABLE Z9-continued with a sequence length of 8192:

| Polarized channel sequence number | Reliability or reliability sequence number |
|---|---|
| 965 | 2011 |
| 966 | 2079 |
| 967 | 2459 |
| 968 | 1750 |
| 969 | 2153 |
| 970 | 2072 |
| 971 | 2557 |
| 972 | 2234 |
| 973 | 2616 |
| 974 | 2718 |
| 975 | 3129 |
| 976 | 1840 |
| 977 | 2124 |
| 978 | 2251 |
| 979 | 2654 |
| 980 | 2343 |
| 981 | 2747 |
| 982 | 2787 |
| 983 | 3272 |
| 984 | 2421 |
| 985 | 2866 |
| 986 | 2934 |
| 987 | 3387 |
| 988 | 2985 |
| 989 | 3524 |
| 990 | 3639 |
| 991 | 4244 |
| 992 | 1936 |
| 993 | 2295 |
| 994 | 2413 |
| 995 | 2774 |
| 996 | 2491 |
| 997 | 2883 |
| 998 | 2952 |
| 999 | 3484 |
| 1000 | 2568 |
| 1001 | 2971 |
| 1002 | 3065 |
| 1003 | 3596 |
| 1004 | 3149 |
| 1005 | 3683 |
| 1006 | 3776 |
| 1007 | 4347 |
| 1008 | 2692 |
| 1009 | 3109 |
| 1010 | 3247 |
| 1011 | 3730 |
| 1012 | 3300 |
| 1013 | 3832 |
| 1014 | 3888 |
| 1015 | 4458 |
| 1016 | 3420 |
| 1017 | 3946 |
| 1018 | 4014 |
| 1019 | 4599 |
| 1020 | 4162 |
| 1021 | 4770 |
| 1022 | 5021 |
| 1023 | 5420 |
| 1024 | 10 |
| 1025 | 41 |
| 1026 | 68 |
| 1027 | 184 |
| 1028 | 88 |
| 1029 | 196 |
| 1030 | 226 |
| 1031 | 332 |
| 1032 | 105 |
| 1033 | 216 |
| 1034 | 244 |
| 1035 | 346 |
| 1036 | 262 |
| 1037 | 386 |
| 1038 | 398 |
| 1039 | 591 |

TABLE Z9-continued with a sequence length of 8192:

| Polarized channel sequence number | Reliability or reliability sequence number |
|---|---|
| 1040 | 121 |
| 1041 | 235 |
| 1042 | 253 |
| 1043 | 379 |
| 1044 | 294 |
| 1045 | 424 |
| 1046 | 465 |
| 1047 | 614 |
| 1048 | 310 |
| 1049 | 459 |
| 1050 | 435 |
| 1051 | 642 |
| 1052 | 509 |
| 1053 | 678 |
| 1054 | 714 |
| 1055 | 946 |
| 1056 | 137 |
| 1057 | 270 |
| 1058 | 302 |
| 1059 | 431 |
| 1060 | 324 |
| 1061 | 448 |
| 1062 | 482 |
| 1063 | 660 |
| 1064 | 354 |
| 1065 | 503 |
| 1066 | 529 |
| 1067 | 688 |
| 1068 | 559 |
| 1069 | 732 |
| 1070 | 762 |
| 1071 | 1005 |
| 1072 | 393 |
| 1073 | 534 |
| 1074 | 575 |
| 1075 | 752 |
| 1076 | 594 |
| 1077 | 793 |
| 1078 | 815 |
| 1079 | 1028 |
| 1080 | 632 |
| 1081 | 835 |
| 1082 | 875 |
| 1083 | 1085 |
| 1084 | 915 |
| 1085 | 1155 |
| 1086 | 1205 |
| 1087 | 1534 |
| 1088 | 207 |
| 1089 | 287 |
| 1090 | 340 |
| 1091 | 497 |
| 1092 | 374 |
| 1093 | 514 |
| 1094 | 550 |
| 1095 | 727 |
| 1096 | 405 |
| 1097 | 586 |
| 1098 | 540 |
| 1099 | 774 |
| 1100 | 620 |
| 1101 | 798 |
| 1102 | 854 |
| 1103 | 1057 |
| 1104 | 441 |
| 1105 | 570 |
| 1106 | 628 |
| 1107 | 824 |
| 1108 | 675 |
| 1109 | 870 |
| 1110 | 904 |
| 1111 | 1120 |
| 1112 | 709 |
| 1113 | 926 |
| 1114 | 956 |

TABLE Z9-continued with a sequence length of 8192:

| Polarized channel sequence number | Reliability or reliability sequence number |
|---|---|
| 1115 | 1169 |
| 1116 | 999 |
| 1117 | 1247 |
| 1118 | 1286 |
| 1119 | 1628 |
| 1120 | 487 |
| 1121 | 651 |
| 1122 | 700 |
| 1123 | 891 |
| 1124 | 748 |
| 1125 | 941 |
| 1126 | 971 |
| 1127 | 1227 |
| 1128 | 783 |
| 1129 | 986 |
| 1130 | 1013 |
| 1131 | 1261 |
| 1132 | 1071 |
| 1133 | 1313 |
| 1134 | 1371 |
| 1135 | 1679 |
| 1136 | 843 |
| 1137 | 1043 |
| 1138 | 1102 |
| 1139 | 1339 |
| 1140 | 1134 |
| 1141 | 1403 |
| 1142 | 1428 |
| 1143 | 1742 |
| 1144 | 1182 |
| 1145 | 1462 |
| 1146 | 1498 |
| 1147 | 1815 |
| 1148 | 1567 |
| 1149 | 1912 |
| 1150 | 2047 |
| 1151 | 2289 |
| 1152 | 149 |
| 1153 | 280 |
| 1154 | 360 |
| 1155 | 555 |
| 1156 | 418 |
| 1157 | 580 |
| 1158 | 647 |
| 1159 | 840 |
| 1160 | 453 |
| 1161 | 623 |
| 1162 | 683 |
| 1163 | 864 |
| 1164 | 722 |
| 1165 | 922 |
| 1166 | 953 |
| 1167 | 1272 |
| 1168 | 493 |
| 1169 | 669 |
| 1170 | 706 |
| 1171 | 906 |
| 1172 | 779 |
| 1173 | 984 |
| 1174 | 1069 |
| 1175 | 1296 |
| 1176 | 807 |
| 1177 | 1055 |
| 1178 | 1018 |
| 1179 | 1349 |
| 1180 | 1137 |
| 1181 | 1406 |
| 1182 | 1469 |
| 1183 | 1805 |
| 1184 | 519 |
| 1185 | 739 |
| 1186 | 791 |
| 1187 | 991 |
| 1188 | 819 |
| 1189 | 1047 |
| 1190 | 1083 |
| 1191 | 1382 |
| 1192 | 880 |
| 1193 | 1123 |
| 1194 | 1159 |
| 1195 | 1417 |
| 1196 | 1216 |
| 1197 | 1490 |
| 1198 | 1524 |
| 1199 | 1896 |
| 1200 | 934 |
| 1201 | 1173 |
| 1202 | 1240 |
| 1203 | 1513 |
| 1204 | 1282 |
| 1205 | 1585 |
| 1206 | 1606 |
| 1207 | 1949 |
| 1208 | 1328 |
| 1209 | 1641 |
| 1210 | 1702 |
| 1211 | 2023 |
| 1212 | 1756 |
| 1213 | 2133 |
| 1214 | 2208 |
| 1215 | 2663 |
| 1216 | 609 |
| 1217 | 756 |
| 1218 | 852 |
| 1219 | 1108 |
| 1220 | 894 |
| 1221 | 1148 |
| 1222 | 1198 |
| 1223 | 1478 |
| 1224 | 968 |
| 1225 | 1255 |
| 1226 | 1191 |
| 1227 | 1546 |
| 1228 | 1304 |
| 1229 | 1596 |
| 1230 | 1661 |
| 1231 | 1982 |
| 1232 | 1032 |
| 1233 | 1230 |
| 1234 | 1324 |
| 1235 | 1619 |
| 1236 | 1392 |
| 1237 | 1692 |
| 1238 | 1732 |
| 1239 | 2090 |
| 1240 | 1451 |
| 1241 | 1772 |
| 1242 | 1827 |
| 1243 | 2163 |
| 1244 | 1878 |
| 1245 | 2260 |
| 1246 | 2346 |
| 1247 | 2783 |
| 1248 | 1097 |
| 1249 | 1360 |
| 1250 | 1440 |
| 1251 | 1712 |
| 1252 | 1502 |
| 1253 | 1785 |
| 1254 | 1848 |
| 1255 | 2240 |
| 1256 | 1556 |
| 1257 | 1866 |
| 1258 | 1930 |
| 1259 | 2321 |
| 1260 | 2005 |
| 1261 | 2378 |
| 1262 | 2455 |
| 1263 | 2863 |
| 1264 | 1651 |

TABLE Z9-continued

| with a sequence length of 8192: | |
|---|---|
| Polarized channel sequence number | Reliability or reliability sequence number |
| 1265 | 1970 |
| 1266 | 2067 |
| 1267 | 2416 |
| 1268 | 2112 |
| 1269 | 2489 |
| 1270 | 2527 |
| 1271 | 2948 |
| 1272 | 2184 |
| 1273 | 2571 |
| 1274 | 2613 |
| 1275 | 3042 |
| 1276 | 2727 |
| 1277 | 3188 |
| 1278 | 3367 |
| 1279 | 3678 |
| 1280 | 162 |
| 1281 | 318 |
| 1282 | 411 |
| 1283 | 665 |
| 1284 | 476 |
| 1285 | 693 |
| 1286 | 766 |
| 1287 | 976 |
| 1288 | 525 |
| 1289 | 744 |
| 1290 | 810 |
| 1291 | 1010 |
| 1292 | 848 |
| 1293 | 1080 |
| 1294 | 1105 |
| 1295 | 1432 |
| 1296 | 565 |
| 1297 | 787 |
| 1298 | 828 |
| 1299 | 1066 |
| 1300 | 917 |
| 1301 | 1141 |
| 1302 | 1219 |
| 1303 | 1466 |
| 1304 | 949 |
| 1305 | 1213 |
| 1306 | 1167 |
| 1307 | 1530 |
| 1308 | 1289 |
| 1309 | 1588 |
| 1310 | 1655 |
| 1311 | 2039 |
| 1312 | 600 |
| 1313 | 868 |
| 1314 | 930 |
| 1315 | 1151 |
| 1316 | 964 |
| 1317 | 1188 |
| 1318 | 1233 |
| 1319 | 1559 |
| 1320 | 1025 |
| 1321 | 1276 |
| 1322 | 1321 |
| 1323 | 1610 |
| 1324 | 1378 |
| 1325 | 1684 |
| 1326 | 1738 |
| 1327 | 2141 |
| 1328 | 1090 |
| 1329 | 1335 |
| 1330 | 1395 |
| 1331 | 1721 |
| 1332 | 1443 |
| 1333 | 1789 |
| 1334 | 1822 |
| 1335 | 2171 |
| 1336 | 1520 |
| 1337 | 1853 |
| 1338 | 1924 |
| 1339 | 2265 |

TABLE Z9-continued

| with a sequence length of 8192: | |
|---|---|
| Polarized channel sequence number | Reliability or reliability sequence number |
| 1340 | 1989 |
| 1341 | 2361 |
| 1342 | 2439 |
| 1343 | 2886 |
| 1344 | 718 |
| 1345 | 899 |
| 1346 | 994 |
| 1347 | 1269 |
| 1348 | 1050 |
| 1349 | 1300 |
| 1350 | 1352 |
| 1351 | 1674 |
| 1352 | 1116 |
| 1353 | 1421 |
| 1354 | 1341 |
| 1355 | 1749 |
| 1356 | 1477 |
| 1357 | 1798 |
| 1358 | 1889 |
| 1359 | 2224 |
| 1360 | 1180 |
| 1361 | 1388 |
| 1362 | 1509 |
| 1363 | 1841 |
| 1364 | 1578 |
| 1365 | 1914 |
| 1366 | 1964 |
| 1367 | 2303 |
| 1368 | 1643 |
| 1369 | 2008 |
| 1370 | 2057 |
| 1371 | 2389 |
| 1372 | 2127 |
| 1373 | 2497 |
| 1374 | 2551 |
| 1375 | 3008 |
| 1376 | 1243 |
| 1377 | 1549 |
| 1378 | 1623 |
| 1379 | 1945 |
| 1380 | 1708 |
| 1381 | 2033 |
| 1382 | 2082 |
| 1383 | 2462 |
| 1384 | 1768 |
| 1385 | 2105 |
| 1386 | 2148 |
| 1387 | 2518 |
| 1388 | 2248 |
| 1389 | 2589 |
| 1390 | 2657 |
| 1391 | 3078 |
| 1392 | 1870 |
| 1393 | 2192 |
| 1394 | 2281 |
| 1395 | 2625 |
| 1396 | 2329 |
| 1397 | 2698 |
| 1398 | 2736 |
| 1399 | 3154 |
| 1400 | 2407 |
| 1401 | 2770 |
| 1402 | 2828 |
| 1403 | 3255 |
| 1404 | 2926 |
| 1405 | 3392 |
| 1406 | 3543 |
| 1407 | 3875 |
| 1408 | 637 |
| 1409 | 883 |
| 1410 | 1036 |
| 1411 | 1367 |
| 1412 | 1125 |
| 1413 | 1414 |
| 1414 | 1538 |

TABLE Z9-continued

| with a sequence length of 8192: | |
|---|---|
| Polarized channel sequence number | Reliability or reliability sequence number |
| 1415 | 1860 |
| 1416 | 1201 |
| 1417 | 1487 |
| 1418 | 1600 |
| 1419 | 1905 |
| 1420 | 1669 |
| 1421 | 1999 |
| 1422 | 2054 |
| 1423 | 2533 |
| 1424 | 1259 |
| 1425 | 1571 |
| 1426 | 1633 |
| 1427 | 1974 |
| 1428 | 1762 |
| 1429 | 2097 |
| 1430 | 2233 |
| 1431 | 2562 |
| 1432 | 1809 |
| 1433 | 2216 |
| 1434 | 2156 |
| 1435 | 2634 |
| 1436 | 2338 |
| 1437 | 2707 |
| 1438 | 2794 |
| 1439 | 3238 |
| 1440 | 1310 |
| 1441 | 1698 |
| 1442 | 1778 |
| 1443 | 2120 |
| 1444 | 1833 |
| 1445 | 2201 |
| 1446 | 2257 |
| 1447 | 2675 |
| 1448 | 1937 |
| 1449 | 2312 |
| 1450 | 2369 |
| 1451 | 2713 |
| 1452 | 2448 |
| 1453 | 2814 |
| 1454 | 2877 |
| 1455 | 3345 |
| 1456 | 2016 |
| 1457 | 2398 |
| 1458 | 2483 |
| 1459 | 2852 |
| 1460 | 2542 |
| 1461 | 2937 |
| 1462 | 2977 |
| 1463 | 3429 |
| 1464 | 2607 |
| 1465 | 3019 |
| 1466 | 3104 |
| 1467 | 3518 |
| 1468 | 3166 |
| 1469 | 3650 |
| 1470 | 3770 |
| 1471 | 4364 |
| 1472 | 1454 |
| 1473 | 1728 |
| 1474 | 1885 |
| 1475 | 2298 |
| 1476 | 1956 |
| 1477 | 2355 |
| 1478 | 2430 |
| 1479 | 2808 |
| 1480 | 2075 |
| 1481 | 2506 |
| 1482 | 2424 |
| 1483 | 2900 |
| 1484 | 2577 |
| 1485 | 2963 |
| 1486 | 3058 |
| 1487 | 3473 |
| 1488 | 2180 |
| 1489 | 2474 |

TABLE Z9-continued

| with a sequence length of 8192: | |
|---|---|
| Polarized channel sequence number | Reliability or reliability sequence number |
| 1490 | 2598 |
| 1491 | 2993 |
| 1492 | 2686 |
| 1493 | 3093 |
| 1494 | 3138 |
| 1495 | 3602 |
| 1496 | 2757 |
| 1497 | 3205 |
| 1498 | 3269 |
| 1499 | 3706 |
| 1500 | 3326 |
| 1501 | 3838 |
| 1502 | 3954 |
| 1503 | 4512 |
| 1504 | 2272 |
| 1505 | 2648 |
| 1506 | 2750 |
| 1507 | 3121 |
| 1508 | 2842 |
| 1509 | 3216 |
| 1510 | 3291 |
| 1511 | 3807 |
| 1512 | 2912 |
| 1513 | 3309 |
| 1514 | 3410 |
| 1515 | 3914 |
| 1516 | 3498 |
| 1517 | 3994 |
| 1518 | 4079 |
| 1519 | 4610 |
| 1520 | 3031 |
| 1521 | 3448 |
| 1522 | 3571 |
| 1523 | 4042 |
| 1524 | 3624 |
| 1525 | 4133 |
| 1526 | 4184 |
| 1527 | 4701 |
| 1528 | 3742 |
| 1529 | 4236 |
| 1530 | 4298 |
| 1531 | 4840 |
| 1532 | 4431 |
| 1533 | 4992 |
| 1534 | 5218 |
| 1535 | 5595 |
| 1536 | 174 |
| 1537 | 366 |
| 1538 | 470 |
| 1539 | 802 |
| 1540 | 544 |
| 1541 | 831 |
| 1542 | 910 |
| 1543 | 1161 |
| 1544 | 605 |
| 1545 | 886 |
| 1546 | 961 |
| 1547 | 1194 |
| 1548 | 1001 |
| 1549 | 1265 |
| 1550 | 1293 |
| 1551 | 1675 |
| 1552 | 656 |
| 1553 | 937 |
| 1554 | 979 |
| 1555 | 1252 |
| 1556 | 1076 |
| 1557 | 1345 |
| 1558 | 1436 |
| 1559 | 1716 |
| 1560 | 1111 |
| 1561 | 1425 |
| 1562 | 1374 |
| 1563 | 1775 |
| 1564 | 1517 |

TABLE Z9-continued with a sequence length of 8192:

| Polarized channel sequence number | Reliability or reliability sequence number |
|---|---|
| 1565 | 1837 |
| 1566 | 1901 |
| 1567 | 2309 |
| 1568 | 696 |
| 1569 | 1020 |
| 1570 | 1094 |
| 1571 | 1356 |
| 1572 | 1146 |
| 1573 | 1399 |
| 1574 | 1458 |
| 1575 | 1801 |
| 1576 | 1207 |
| 1577 | 1505 |
| 1578 | 1563 |
| 1579 | 1856 |
| 1580 | 1614 |
| 1581 | 1933 |
| 1582 | 1987 |
| 1583 | 2410 |
| 1584 | 1279 |
| 1585 | 1575 |
| 1586 | 1647 |
| 1587 | 1968 |
| 1588 | 1688 |
| 1589 | 2042 |
| 1590 | 2078 |
| 1591 | 2450 |
| 1592 | 1752 |
| 1593 | 2106 |
| 1594 | 2181 |
| 1595 | 2545 |
| 1596 | 2245 |
| 1597 | 2651 |
| 1598 | 2733 |
| 1599 | 3196 |
| 1600 | 859 |
| 1601 | 1061 |
| 1602 | 1176 |
| 1603 | 1494 |
| 1604 | 1236 |
| 1605 | 1527 |
| 1606 | 1592 |
| 1607 | 1926 |
| 1608 | 1307 |
| 1609 | 1665 |
| 1610 | 1581 |
| 1611 | 2001 |
| 1612 | 1723 |
| 1613 | 2050 |
| 1614 | 2151 |
| 1615 | 2500 |
| 1616 | 1384 |
| 1617 | 1637 |
| 1618 | 1746 |
| 1619 | 2091 |
| 1620 | 1831 |
| 1621 | 2174 |
| 1622 | 2230 |
| 1623 | 2595 |
| 1624 | 1894 |
| 1625 | 2275 |
| 1626 | 2335 |
| 1627 | 2672 |
| 1628 | 2404 |
| 1629 | 2797 |
| 1630 | 2855 |
| 1631 | 3322 |
| 1632 | 1473 |
| 1633 | 1794 |
| 1634 | 1873 |
| 1635 | 2205 |
| 1636 | 1961 |
| 1637 | 2301 |
| 1638 | 2358 |
| 1639 | 2763 |

TABLE Z9-continued with a sequence length of 8192:

| Polarized channel sequence number | Reliability or reliability sequence number |
|---|---|
| 1640 | 2020 |
| 1641 | 2384 |
| 1642 | 2427 |
| 1643 | 2820 |
| 1644 | 2521 |
| 1645 | 2894 |
| 1646 | 2974 |
| 1647 | 3395 |
| 1648 | 2123 |
| 1649 | 2468 |
| 1650 | 2565 |
| 1651 | 2931 |
| 1652 | 2619 |
| 1653 | 3016 |
| 1654 | 3053 |
| 1655 | 3479 |
| 1656 | 2695 |
| 1657 | 3098 |
| 1658 | 3146 |
| 1659 | 3574 |
| 1660 | 3242 |
| 1661 | 3695 |
| 1662 | 3863 |
| 1663 | 4168 |
| 1664 | 736 |
| 1665 | 1039 |
| 1666 | 1223 |
| 1667 | 1602 |
| 1668 | 1332 |
| 1669 | 1658 |
| 1670 | 1782 |
| 1671 | 2115 |
| 1672 | 1410 |
| 1673 | 1733 |
| 1674 | 1844 |
| 1675 | 2159 |
| 1676 | 1918 |
| 1677 | 2268 |
| 1678 | 2326 |
| 1679 | 2831 |
| 1680 | 1483 |
| 1681 | 1820 |
| 1682 | 1882 |
| 1683 | 2237 |
| 1684 | 2014 |
| 1685 | 2375 |
| 1686 | 2515 |
| 1687 | 2869 |
| 1688 | 2062 |
| 1689 | 2494 |
| 1690 | 2436 |
| 1691 | 2945 |
| 1692 | 2622 |
| 1693 | 3023 |
| 1694 | 3113 |
| 1695 | 3554 |
| 1696 | 1542 |
| 1697 | 1942 |
| 1698 | 2035 |
| 1699 | 2387 |
| 1700 | 2084 |
| 1701 | 2477 |
| 1702 | 2539 |
| 1703 | 2988 |
| 1704 | 2189 |
| 1705 | 2601 |
| 1706 | 2660 |
| 1707 | 3039 |
| 1708 | 2744 |
| 1709 | 3141 |
| 1710 | 3183 |
| 1711 | 3672 |
| 1712 | 2292 |
| 1713 | 2681 |
| 1714 | 2780 |

TABLE Z9-continued with a sequence length of 8192:

| Polarized channel sequence number | Reliability or reliability sequence number |
|---|---|
| 1715 | 3171 |
| 1716 | 2845 |
| 1717 | 3264 |
| 1718 | 3295 |
| 1719 | 3747 |
| 1720 | 2920 |
| 1721 | 3340 |
| 1722 | 3424 |
| 1723 | 3843 |
| 1724 | 3493 |
| 1725 | 3974 |
| 1726 | 4065 |
| 1727 | 4630 |
| 1728 | 1706 |
| 1729 | 1980 |
| 1730 | 2142 |
| 1731 | 2583 |
| 1732 | 2213 |
| 1733 | 2637 |
| 1734 | 2721 |
| 1735 | 3126 |
| 1736 | 2349 |
| 1737 | 2800 |
| 1738 | 2710 |
| 1739 | 3213 |
| 1740 | 2880 |
| 1741 | 3281 |
| 1742 | 3373 |
| 1743 | 3789 |
| 1744 | 2456 |
| 1745 | 2767 |
| 1746 | 2908 |
| 1747 | 3314 |
| 1748 | 3000 |
| 1749 | 3406 |
| 1750 | 3463 |
| 1751 | 3920 |
| 1752 | 3081 |
| 1753 | 3513 |
| 1754 | 3585 |
| 1755 | 4008 |
| 1756 | 3655 |
| 1757 | 4127 |
| 1758 | 4228 |
| 1759 | 4758 |
| 1760 | 2559 |
| 1761 | 2960 |
| 1762 | 3070 |
| 1763 | 3440 |
| 1764 | 3158 |
| 1765 | 3534 |
| 1766 | 3613 |
| 1767 | 4105 |
| 1768 | 3230 |
| 1769 | 3635 |
| 1770 | 3719 |
| 1771 | 4206 |
| 1772 | 3812 |
| 1773 | 4274 |
| 1774 | 4372 |
| 1775 | 4864 |
| 1776 | 3354 |
| 1777 | 3765 |
| 1778 | 3894 |
| 1779 | 4315 |
| 1780 | 3940 |
| 1781 | 4406 |
| 1782 | 4450 |
| 1783 | 4952 |
| 1784 | 4036 |
| 1785 | 4503 |
| 1786 | 4559 |
| 1787 | 5079 |
| 1788 | 4692 |
| 1789 | 5234 |

TABLE Z9-continued with a sequence length of 8192:

| Polarized channel sequence number | Reliability or reliability sequence number |
|---|---|
| 1790 | 5440 |
| 1791 | 5776 |
| 1792 | 770 |
| 1793 | 1130 |
| 1794 | 1317 |
| 1795 | 1811 |
| 1796 | 1447 |
| 1797 | 1864 |
| 1798 | 1995 |
| 1799 | 2366 |
| 1800 | 1553 |
| 1801 | 1952 |
| 1802 | 2069 |
| 1803 | 2418 |
| 1804 | 2135 |
| 1805 | 2530 |
| 1806 | 2574 |
| 1807 | 3062 |
| 1808 | 1624 |
| 1809 | 2027 |
| 1810 | 2099 |
| 1811 | 2509 |
| 1812 | 2254 |
| 1813 | 2631 |
| 1814 | 2753 |
| 1815 | 3101 |
| 1816 | 2318 |
| 1817 | 2740 |
| 1818 | 2669 |
| 1819 | 3191 |
| 1820 | 2859 |
| 1821 | 3278 |
| 1822 | 3364 |
| 1823 | 3857 |
| 1824 | 1694 |
| 1825 | 2166 |
| 1826 | 2284 |
| 1827 | 2645 |
| 1828 | 2341 |
| 1829 | 2701 |
| 1830 | 2777 |
| 1831 | 3233 |
| 1832 | 2445 |
| 1833 | 2837 |
| 1834 | 2905 |
| 1835 | 3303 |
| 1836 | 2982 |
| 1837 | 3401 |
| 1838 | 3468 |
| 1839 | 3980 |
| 1840 | 2554 |
| 1841 | 2923 |
| 1842 | 3011 |
| 1843 | 3443 |
| 1844 | 3073 |
| 1845 | 3538 |
| 1846 | 3580 |
| 1847 | 4022 |
| 1848 | 3179 |
| 1849 | 3618 |
| 1850 | 3711 |
| 1851 | 4140 |
| 1852 | 3795 |
| 1853 | 4258 |
| 1854 | 4339 |
| 1855 | 4887 |
| 1856 | 1908 |
| 1857 | 2222 |
| 1858 | 2395 |
| 1859 | 2823 |
| 1860 | 2486 |
| 1861 | 2872 |
| 1862 | 2956 |
| 1863 | 3381 |
| 1864 | 2586 |

TABLE Z9-continued

| with a sequence length of 8192: | |
|---|---|
| Polarized channel sequence number | Reliability or reliability sequence number |
| 1865 | 3050 |
| 1866 | 2940 |
| 1867 | 3488 |
| 1868 | 3118 |
| 1869 | 3549 |
| 1870 | 3667 |
| 1871 | 4093 |
| 1872 | 2689 |
| 1873 | 2997 |
| 1874 | 3163 |
| 1875 | 3607 |
| 1876 | 3261 |
| 1877 | 3700 |
| 1878 | 3759 |
| 1879 | 4192 |
| 1880 | 3350 |
| 1881 | 3818 |
| 1882 | 3880 |
| 1883 | 4282 |
| 1884 | 3967 |
| 1885 | 4414 |
| 1886 | 4486 |
| 1887 | 5034 |
| 1888 | 2791 |
| 1889 | 3221 |
| 1890 | 3317 |
| 1891 | 3736 |
| 1892 | 3434 |
| 1893 | 3849 |
| 1894 | 3908 |
| 1895 | 4381 |
| 1896 | 3507 |
| 1897 | 3934 |
| 1898 | 3988 |
| 1899 | 4439 |
| 1900 | 4111 |
| 1901 | 4531 |
| 1902 | 4619 |
| 1903 | 5107 |
| 1904 | 3644 |
| 1905 | 4050 |
| 1906 | 4154 |
| 1907 | 4570 |
| 1908 | 4214 |
| 1909 | 4661 |
| 1910 | 4713 |
| 1911 | 5184 |
| 1912 | 4306 |
| 1913 | 4747 |
| 1914 | 4814 |
| 1915 | 5304 |
| 1916 | 4926 |
| 1917 | 5460 |
| 1918 | 5644 |
| 1919 | 5970 |
| 1920 | 1763 |
| 1921 | 2198 |
| 1922 | 2465 |
| 1923 | 2966 |
| 1924 | 2610 |
| 1925 | 3034 |
| 1926 | 3208 |
| 1927 | 3629 |
| 1928 | 2724 |
| 1929 | 3133 |
| 1930 | 3286 |
| 1931 | 3689 |
| 1932 | 3378 |
| 1933 | 3801 |
| 1934 | 3869 |
| 1935 | 4467 |
| 1936 | 2811 |
| 1937 | 3250 |
| 1938 | 3336 |
| 1939 | 3782 |

TABLE Z9-continued

| with a sequence length of 8192: | |
|---|---|
| Polarized channel sequence number | Reliability or reliability sequence number |
| 1940 | 3504 |
| 1941 | 3926 |
| 1942 | 4097 |
| 1943 | 4494 |
| 1944 | 3565 |
| 1945 | 4071 |
| 1946 | 4000 |
| 1947 | 4579 |
| 1948 | 4222 |
| 1949 | 4670 |
| 1950 | 4779 |
| 1951 | 5288 |
| 1952 | 2891 |
| 1953 | 3415 |
| 1954 | 3529 |
| 1955 | 3960 |
| 1956 | 3591 |
| 1957 | 4056 |
| 1958 | 4119 |
| 1959 | 4639 |
| 1960 | 3725 |
| 1961 | 4198 |
| 1962 | 4266 |
| 1963 | 4681 |
| 1964 | 4356 |
| 1965 | 4802 |
| 1966 | 4875 |
| 1967 | 5398 |
| 1968 | 3826 |
| 1969 | 4290 |
| 1970 | 4397 |
| 1971 | 4852 |
| 1972 | 4475 |
| 1973 | 4940 |
| 1974 | 4979 |
| 1975 | 5504 |
| 1976 | 4551 |
| 1977 | 5049 |
| 1978 | 5137 |
| 1979 | 5619 |
| 1980 | 5202 |
| 1981 | 5750 |
| 1982 | 5867 |
| 1983 | 6438 |
| 1984 | 3090 |
| 1985 | 3459 |
| 1986 | 3661 |
| 1987 | 4176 |
| 1988 | 3753 |
| 1989 | 4252 |
| 1990 | 4331 |
| 1991 | 4791 |
| 1992 | 3900 |
| 1993 | 4422 |
| 1994 | 4323 |
| 1995 | 4902 |
| 1996 | 4522 |
| 1997 | 4965 |
| 1998 | 5091 |
| 1999 | 5547 |
| 2000 | 4028 |
| 2001 | 4389 |
| 2002 | 4540 |
| 2003 | 5006 |
| 2004 | 4650 |
| 2005 | 5122 |
| 2006 | 5169 |
| 2007 | 5693 |
| 2008 | 4736 |
| 2009 | 5253 |
| 2010 | 5323 |
| 2011 | 5808 |
| 2012 | 5378 |
| 2013 | 5935 |
| 2014 | 6044 |

TABLE Z9-continued with a sequence length of 8192:

| Polarized channel sequence number | Reliability or reliability sequence number |
|---|---|
| 2015 | 6579 |
| 2016 | 4146 |
| 2017 | 4590 |
| 2018 | 4724 |
| 2019 | 5153 |
| 2020 | 4826 |
| 2021 | 5269 |
| 2022 | 5342 |
| 2023 | 5901 |
| 2024 | 4914 |
| 2025 | 5362 |
| 2026 | 5480 |
| 2027 | 6005 |
| 2028 | 5571 |
| 2029 | 6084 |
| 2030 | 6170 |
| 2031 | 6660 |
| 2032 | 5064 |
| 2033 | 5524 |
| 2034 | 5668 |
| 2035 | 6125 |
| 2036 | 5721 |
| 2037 | 6216 |
| 2038 | 6268 |
| 2039 | 6752 |
| 2040 | 5837 |
| 2041 | 6320 |
| 2042 | 6374 |
| 2043 | 6866 |
| 2044 | 6505 |
| 2045 | 6995 |
| 2046 | 7168 |
| 2047 | 7433 |
| 2048 | 11 |
| 2049 | 47 |
| 2050 | 81 |
| 2051 | 250 |
| 2052 | 108 |
| 2053 | 265 |
| 2054 | 303 |
| 2055 | 438 |
| 2056 | 132 |
| 2057 | 290 |
| 2058 | 326 |
| 2059 | 455 |
| 2060 | 348 |
| 2061 | 506 |
| 2062 | 522 |
| 2063 | 771 |
| 2064 | 152 |
| 2065 | 314 |
| 2066 | 338 |
| 2067 | 498 |
| 2068 | 390 |
| 2069 | 560 |
| 2070 | 612 |
| 2071 | 800 |
| 2072 | 410 |
| 2073 | 604 |
| 2074 | 576 |
| 2075 | 839 |
| 2076 | 666 |
| 2077 | 882 |
| 2078 | 929 |
| 2079 | 1212 |
| 2080 | 171 |
| 2081 | 359 |
| 2082 | 401 |
| 2083 | 568 |
| 2084 | 428 |
| 2085 | 590 |
| 2086 | 633 |
| 2087 | 860 |
| 2088 | 464 |
| 2089 | 659 |

TABLE Z9-continued with a sequence length of 8192:

| Polarized channel sequence number | Reliability or reliability sequence number |
|---|---|
| 2090 | 692 |
| 2091 | 892 |
| 2092 | 735 |
| 2093 | 948 |
| 2094 | 988 |
| 2095 | 1287 |
| 2096 | 515 |
| 2097 | 698 |
| 2098 | 753 |
| 2099 | 974 |
| 2100 | 776 |
| 2101 | 1026 |
| 2102 | 1054 |
| 2103 | 1311 |
| 2104 | 827 |
| 2105 | 1077 |
| 2106 | 1127 |
| 2107 | 1380 |
| 2108 | 1174 |
| 2109 | 1464 |
| 2110 | 1523 |
| 2111 | 1890 |
| 2112 | 278 |
| 2113 | 380 |
| 2114 | 447 |
| 2115 | 653 |
| 2116 | 490 |
| 2117 | 673 |
| 2118 | 723 |
| 2119 | 944 |
| 2120 | 539 |
| 2121 | 765 |
| 2122 | 710 |
| 2123 | 1003 |
| 2124 | 806 |
| 2125 | 1030 |
| 2126 | 1104 |
| 2127 | 1346 |
| 2128 | 583 |
| 2129 | 747 |
| 2130 | 823 |
| 2131 | 1063 |
| 2132 | 876 |
| 2133 | 1122 |
| 2134 | 1162 |
| 2135 | 1422 |
| 2136 | 923 |
| 2137 | 1187 |
| 2138 | 1225 |
| 2139 | 1482 |
| 2140 | 1275 |
| 2141 | 1572 |
| 2142 | 1618 |
| 2143 | 1991 |
| 2144 | 639 |
| 2145 | 850 |
| 2146 | 913 |
| 2147 | 1144 |
| 2148 | 969 |
| 2149 | 1209 |
| 2150 | 1246 |
| 2151 | 1548 |
| 2152 | 1012 |
| 2153 | 1263 |
| 2154 | 1295 |
| 2155 | 1590 |
| 2156 | 1366 |
| 2157 | 1649 |
| 2158 | 1710 |
| 2159 | 2046 |
| 2160 | 1087 |
| 2161 | 1330 |
| 2162 | 1400 |
| 2163 | 1680 |
| 2164 | 1438 |

TABLE Z9-continued

| with a sequence length of 8192: | |
|---|---|
| Polarized channel sequence number | Reliability or reliability sequence number |
| 2165 | 1747 |
| 2166 | 1773 |
| 2167 | 2113 |
| 2168 | 1497 |
| 2169 | 1810 |
| 2170 | 1852 |
| 2171 | 2191 |
| 2172 | 1925 |
| 2173 | 2291 |
| 2174 | 2431 |
| 2175 | 2697 |
| 2176 | 189 |
| 2177 | 370 |
| 2178 | 473 |
| 2179 | 729 |
| 2180 | 554 |
| 2181 | 759 |
| 2182 | 844 |
| 2183 | 1082 |
| 2184 | 598 |
| 2185 | 811 |
| 2186 | 888 |
| 2187 | 1114 |
| 2188 | 939 |
| 2189 | 1184 |
| 2190 | 1221 |
| 2191 | 1601 |
| 2192 | 646 |
| 2193 | 872 |
| 2194 | 918 |
| 2195 | 1166 |
| 2196 | 1007 |
| 2197 | 1258 |
| 2198 | 1362 |
| 2199 | 1632 |
| 2200 | 1040 |
| 2201 | 1343 |
| 2202 | 1299 |
| 2203 | 1690 |
| 2204 | 1442 |
| 2205 | 1751 |
| 2206 | 1819 |
| 2207 | 2178 |
| 2208 | 679 |
| 2209 | 959 |
| 2210 | 1021 |
| 2211 | 1266 |
| 2212 | 1058 |
| 2213 | 1334 |
| 2214 | 1377 |
| 2215 | 1724 |
| 2216 | 1131 |
| 2217 | 1427 |
| 2218 | 1468 |
| 2219 | 1764 |
| 2220 | 1537 |
| 2221 | 1843 |
| 2222 | 1877 |
| 2223 | 2277 |
| 2224 | 1200 |
| 2225 | 1485 |
| 2226 | 1566 |
| 2227 | 1868 |
| 2228 | 1615 |
| 2229 | 1944 |
| 2230 | 1969 |
| 2231 | 2331 |
| 2232 | 1666 |
| 2233 | 2003 |
| 2234 | 2071 |
| 2235 | 2408 |
| 2236 | 2128 |
| 2237 | 2525 |
| 2238 | 2612 |
| 2239 | 3108 |

TABLE Z9-continued

| with a sequence length of 8192: | |
|---|---|
| Polarized channel sequence number | Reliability or reliability sequence number |
| 2240 | 794 |
| 2241 | 983 |
| 2242 | 1096 |
| 2243 | 1407 |
| 2244 | 1153 |
| 2245 | 1457 |
| 2246 | 1515 |
| 2247 | 1829 |
| 2248 | 1242 |
| 2249 | 1580 |
| 2250 | 1508 |
| 2251 | 1904 |
| 2252 | 1639 |
| 2253 | 1957 |
| 2254 | 2028 |
| 2255 | 2365 |
| 2256 | 1315 |
| 2257 | 1551 |
| 2258 | 1662 |
| 2259 | 1978 |
| 2260 | 1734 |
| 2261 | 2058 |
| 2262 | 2101 |
| 2263 | 2481 |
| 2264 | 1799 |
| 2265 | 2144 |
| 2266 | 2202 |
| 2267 | 2558 |
| 2268 | 2255 |
| 2269 | 2665 |
| 2270 | 2755 |
| 2271 | 3240 |
| 2272 | 1396 |
| 2273 | 1703 |
| 2274 | 1786 |
| 2275 | 2080 |
| 2276 | 1855 |
| 2277 | 2157 |
| 2278 | 2226 |
| 2279 | 2643 |
| 2280 | 1913 |
| 2281 | 2244 |
| 2282 | 2311 |
| 2283 | 2732 |
| 2284 | 2388 |
| 2285 | 2789 |
| 2286 | 2874 |
| 2287 | 3327 |
| 2288 | 2015 |
| 2289 | 2353 |
| 2290 | 2452 |
| 2291 | 2830 |
| 2292 | 2505 |
| 2293 | 2913 |
| 2294 | 2953 |
| 2295 | 3422 |
| 2296 | 2585 |
| 2297 | 3003 |
| 2298 | 3055 |
| 2299 | 3525 |
| 2300 | 3178 |
| 2301 | 3680 |
| 2302 | 3865 |
| 2303 | 4172 |
| 2304 | 205 |
| 2305 | 419 |
| 2306 | 546 |
| 2307 | 866 |
| 2308 | 625 |
| 2309 | 898 |
| 2310 | 993 |
| 2311 | 1251 |
| 2312 | 685 |
| 2313 | 963 |
| 2314 | 1049 |

TABLE Z9-continued with a sequence length of 8192:

| Polarized channel sequence number | Reliability or reliability sequence number |
|---|---|
| 2315 | 1290 |
| 2316 | 1091 |
| 2317 | 1373 |
| 2318 | 1404 |
| 2319 | 1780 |
| 2320 | 741 |
| 2321 | 1017 |
| 2322 | 1068 |
| 2323 | 1357 |
| 2324 | 1179 |
| 2325 | 1449 |
| 2326 | 1541 |
| 2327 | 1816 |
| 2328 | 1217 |
| 2329 | 1533 |
| 2330 | 1479 |
| 2331 | 1888 |
| 2332 | 1621 |
| 2333 | 1948 |
| 2334 | 2019 |
| 2335 | 2423 |
| 2336 | 782 |
| 2337 | 1118 |
| 2338 | 1192 |
| 2339 | 1461 |
| 2340 | 1234 |
| 2341 | 1500 |
| 2342 | 1554 |
| 2343 | 1919 |
| 2344 | 1306 |
| 2345 | 1607 |
| 2346 | 1660 |
| 2347 | 1972 |
| 2348 | 1720 |
| 2349 | 2049 |
| 2350 | 2108 |
| 2351 | 2534 |
| 2352 | 1389 |
| 2353 | 1676 |
| 2354 | 1741 |
| 2355 | 2088 |
| 2356 | 1790 |
| 2357 | 2164 |
| 2358 | 2196 |
| 2359 | 2567 |
| 2360 | 1874 |
| 2361 | 2229 |
| 2362 | 2302 |
| 2363 | 2671 |
| 2364 | 2374 |
| 2365 | 2772 |
| 2366 | 2856 |
| 2367 | 3352 |
| 2368 | 933 |
| 2369 | 1157 |
| 2370 | 1271 |
| 2371 | 1597 |
| 2372 | 1338 |
| 2373 | 1635 |
| 2374 | 1697 |
| 2375 | 2037 |
| 2376 | 1419 |
| 2377 | 1767 |
| 2378 | 1683 |
| 2379 | 2119 |
| 2380 | 1826 |
| 2381 | 2170 |
| 2382 | 2267 |
| 2383 | 2627 |
| 2384 | 1493 |
| 2385 | 1730 |
| 2386 | 1861 |
| 2387 | 2217 |
| 2388 | 1938 |
| 2389 | 2296 |

TABLE Z9-continued with a sequence length of 8192:

| Polarized channel sequence number | Reliability or reliability sequence number |
|---|---|
| 2390 | 2345 |
| 2391 | 2715 |
| 2392 | 2007 |
| 2393 | 2391 |
| 2394 | 2443 |
| 2395 | 2805 |
| 2396 | 2522 |
| 2397 | 2921 |
| 2398 | 2980 |
| 2399 | 3482 |
| 2400 | 1569 |
| 2401 | 1906 |
| 2402 | 1985 |
| 2403 | 2325 |
| 2404 | 2076 |
| 2405 | 2417 |
| 2406 | 2472 |
| 2407 | 2885 |
| 2408 | 2139 |
| 2409 | 2496 |
| 2410 | 2543 |
| 2411 | 2943 |
| 2412 | 2653 |
| 2413 | 3026 |
| 2414 | 3099 |
| 2415 | 3562 |
| 2416 | 2250 |
| 2417 | 2594 |
| 2418 | 2687 |
| 2419 | 3067 |
| 2420 | 2738 |
| 2421 | 3144 |
| 2422 | 3186 |
| 2423 | 3641 |
| 2424 | 2822 |
| 2425 | 3227 |
| 2426 | 3288 |
| 2427 | 3751 |
| 2428 | 3397 |
| 2429 | 3886 |
| 2430 | 4044 |
| 2431 | 4354 |
| 2432 | 833 |
| 2433 | 1135 |
| 2434 | 1323 |
| 2435 | 1707 |
| 2436 | 1431 |
| 2437 | 1760 |
| 2438 | 1893 |
| 2439 | 2238 |
| 2440 | 1519 |
| 2441 | 1839 |
| 2442 | 1960 |
| 2443 | 2285 |
| 2444 | 2034 |
| 2445 | 2379 |
| 2446 | 2440 |
| 2447 | 2964 |
| 2448 | 1587 |
| 2449 | 1929 |
| 2450 | 1997 |
| 2451 | 2356 |
| 2452 | 2131 |
| 2453 | 2487 |
| 2454 | 2636 |
| 2455 | 2995 |
| 2456 | 2182 |
| 2457 | 2618 |
| 2458 | 2549 |
| 2459 | 3076 |
| 2460 | 2746 |
| 2461 | 3156 |
| 2462 | 3249 |
| 2463 | 3734 |
| 2464 | 1646 |

TABLE Z9-continued

| with a sequence length of 8192: | |
|---|---|
| Polarized channel sequence number | Reliability or reliability sequence number |
| 2465 | 2065 |
| 2466 | 2152 |
| 2467 | 2514 |
| 2468 | 2209 |
| 2469 | 2603 |
| 2470 | 2662 |
| 2471 | 3123 |
| 2472 | 2319 |
| 2473 | 2723 |
| 2474 | 2781 |
| 2475 | 3164 |
| 2476 | 2864 |
| 2477 | 3274 |
| 2478 | 3341 |
| 2479 | 3841 |
| 2480 | 2400 |
| 2481 | 2812 |
| 2482 | 2904 |
| 2483 | 3312 |
| 2484 | 2972 |
| 2485 | 3408 |
| 2486 | 3452 |
| 2487 | 3928 |
| 2488 | 3044 |
| 2489 | 3497 |
| 2490 | 3593 |
| 2491 | 4020 |
| 2492 | 3657 |
| 2493 | 4142 |
| 2494 | 4260 |
| 2495 | 4805 |
| 2496 | 1803 |
| 2497 | 2098 |
| 2498 | 2264 |
| 2499 | 2706 |
| 2500 | 2336 |
| 2501 | 2764 |
| 2502 | 2847 |
| 2503 | 3266 |
| 2504 | 2464 |
| 2505 | 2932 |
| 2506 | 2839 |
| 2507 | 3366 |
| 2508 | 3013 |
| 2509 | 3436 |
| 2510 | 3540 |
| 2511 | 3972 |
| 2512 | 2576 |
| 2513 | 2896 |
| 2514 | 3036 |
| 2515 | 3466 |
| 2516 | 3131 |
| 2517 | 3576 |
| 2518 | 3626 |
| 2519 | 4096 |
| 2520 | 3211 |
| 2521 | 3696 |
| 2522 | 3768 |
| 2523 | 4196 |
| 2524 | 3824 |
| 2525 | 4312 |
| 2526 | 4420 |
| 2527 | 4945 |
| 2528 | 2680 |
| 2529 | 3091 |
| 2530 | 3201 |
| 2531 | 3609 |
| 2532 | 3302 |
| 2533 | 3713 |
| 2534 | 3791 |
| 2535 | 4288 |
| 2536 | 3383 |
| 2537 | 3809 |
| 2538 | 3910 |
| 2539 | 4385 |

TABLE Z9-continued

| with a sequence length of 8192: | |
|---|---|
| Polarized channel sequence number | Reliability or reliability sequence number |
| 2540 | 3996 |
| 2541 | 4460 |
| 2542 | 4538 |
| 2543 | 5031 |
| 2544 | 3509 |
| 2545 | 3950 |
| 2546 | 4067 |
| 2547 | 4501 |
| 2548 | 4121 |
| 2549 | 4588 |
| 2550 | 4634 |
| 2551 | 5125 |
| 2552 | 4226 |
| 2553 | 4688 |
| 2554 | 4745 |
| 2555 | 5245 |
| 2556 | 4871 |
| 2557 | 5392 |
| 2558 | 5589 |
| 2559 | 5915 |
| 2560 | 221 |
| 2561 | 481 |
| 2562 | 619 |
| 2563 | 1035 |
| 2564 | 717 |
| 2565 | 1073 |
| 2566 | 1170 |
| 2567 | 1472 |
| 2568 | 788 |
| 2569 | 1140 |
| 2570 | 1229 |
| 2571 | 1512 |
| 2572 | 1283 |
| 2573 | 1593 |
| 2574 | 1625 |
| 2575 | 2043 |
| 2576 | 856 |
| 2577 | 1204 |
| 2578 | 1254 |
| 2579 | 1576 |
| 2580 | 1369 |
| 2581 | 1687 |
| 2582 | 1784 |
| 2583 | 2086 |
| 2584 | 1411 |
| 2585 | 1771 |
| 2586 | 1714 |
| 2587 | 2146 |
| 2588 | 1872 |
| 2589 | 2215 |
| 2590 | 2279 |
| 2591 | 2717 |
| 2592 | 908 |
| 2593 | 1302 |
| 2594 | 1393 |
| 2595 | 1701 |
| 2596 | 1453 |
| 2597 | 1743 |
| 2598 | 1806 |
| 2599 | 2173 |
| 2600 | 1525 |
| 2601 | 1858 |
| 2602 | 1922 |
| 2603 | 2231 |
| 2604 | 1976 |
| 2605 | 2313 |
| 2606 | 2368 |
| 2607 | 2826 |
| 2608 | 1611 |
| 2609 | 1934 |
| 2610 | 2012 |
| 2611 | 2348 |
| 2612 | 2056 |
| 2613 | 2429 |
| 2614 | 2467 |

TABLE Z9-continued with a sequence length of 8192:

| Polarized channel sequence number | Reliability or reliability sequence number |
|---|---|
| 2615 | 2870 |
| 2616 | 2126 |
| 2617 | 2502 |
| 2618 | 2579 |
| 2619 | 2976 |
| 2620 | 2650 |
| 2621 | 3095 |
| 2622 | 3184 |
| 2623 | 3691 |
| 2624 | 1109 |
| 2625 | 1354 |
| 2626 | 1489 |
| 2627 | 1845 |
| 2628 | 1562 |
| 2629 | 1881 |
| 2630 | 1953 |
| 2631 | 2308 |
| 2632 | 1642 |
| 2633 | 2031 |
| 2634 | 1941 |
| 2635 | 2385 |
| 2636 | 2093 |
| 2637 | 2437 |
| 2638 | 2546 |
| 2639 | 2928 |
| 2640 | 1727 |
| 2641 | 2000 |
| 2642 | 2116 |
| 2643 | 2484 |
| 2644 | 2206 |
| 2645 | 2573 |
| 2646 | 2633 |
| 2647 | 3032 |
| 2648 | 2274 |
| 2649 | 2683 |
| 2650 | 2743 |
| 2651 | 3116 |
| 2652 | 2819 |
| 2653 | 3254 |
| 2654 | 3319 |
| 2655 | 3822 |
| 2656 | 1823 |
| 2657 | 2167 |
| 2658 | 2253 |
| 2659 | 2606 |
| 2660 | 2342 |
| 2661 | 2709 |
| 2662 | 2769 |
| 2663 | 3218 |
| 2664 | 2405 |
| 2665 | 2795 |
| 2666 | 2844 |
| 2667 | 3279 |
| 2668 | 2950 |
| 2669 | 3362 |
| 2670 | 3447 |
| 2671 | 3892 |
| 2672 | 2517 |
| 2673 | 2893 |
| 2674 | 2998 |
| 2675 | 3402 |
| 2676 | 3057 |
| 2677 | 3495 |
| 2678 | 3533 |
| 2679 | 3978 |
| 2680 | 3143 |
| 2681 | 3582 |
| 2682 | 3637 |
| 2683 | 4075 |
| 2684 | 3740 |
| 2685 | 4186 |
| 2686 | 4341 |
| 2687 | 4621 |
| 2688 | 954 |
| 2689 | 1327 |

TABLE Z9-continued with a sequence length of 8192:

| Polarized channel sequence number | Reliability or reliability sequence number |
|---|---|
| 2690 | 1544 |
| 2691 | 1962 |
| 2692 | 1670 |
| 2693 | 2022 |
| 2694 | 2155 |
| 2695 | 2508 |
| 2696 | 1754 |
| 2697 | 2104 |
| 2698 | 2220 |
| 2699 | 2555 |
| 2700 | 2299 |
| 2701 | 2674 |
| 2702 | 2735 |
| 2703 | 3293 |
| 2704 | 1836 |
| 2705 | 2194 |
| 2706 | 2261 |
| 2707 | 2642 |
| 2708 | 2397 |
| 2709 | 2786 |
| 2710 | 2942 |
| 2711 | 3333 |
| 2712 | 2449 |
| 2713 | 2918 |
| 2714 | 2853 |
| 2715 | 3417 |
| 2716 | 3063 |
| 2717 | 3502 |
| 2718 | 3598 |
| 2719 | 4054 |
| 2720 | 1897 |
| 2721 | 2322 |
| 2722 | 2420 |
| 2723 | 2798 |
| 2724 | 2475 |
| 2725 | 2902 |
| 2726 | 2968 |
| 2727 | 3461 |
| 2728 | 2588 |
| 2729 | 3040 |
| 2730 | 3103 |
| 2731 | 3520 |
| 2732 | 3198 |
| 2733 | 3631 |
| 2734 | 3674 |
| 2735 | 4166 |
| 2736 | 2700 |
| 2737 | 3128 |
| 2738 | 3235 |
| 2739 | 3663 |
| 2740 | 3307 |
| 2741 | 3763 |
| 2742 | 3797 |
| 2743 | 4234 |
| 2744 | 3385 |
| 2745 | 3836 |
| 2746 | 3922 |
| 2747 | 4321 |
| 2748 | 3990 |
| 2749 | 4441 |
| 2750 | 4525 |
| 2751 | 5051 |
| 2752 | 2073 |
| 2753 | 2359 |
| 2754 | 2537 |
| 2755 | 3018 |
| 2756 | 2615 |
| 2757 | 3080 |
| 2758 | 3169 |
| 2759 | 3615 |
| 2760 | 2761 |
| 2761 | 3259 |
| 2762 | 3159 |
| 2763 | 3708 |
| 2764 | 3347 |

TABLE Z9-continued

| with a sequence length of 8192: | |
|---|---|
| Polarized channel sequence number | Reliability or reliability sequence number |
| 2765 | 3780 |
| 2766 | 3871 |
| 2767 | 4270 |
| 2768 | 2878 |
| 2769 | 3220 |
| 2770 | 3376 |
| 2771 | 3814 |
| 2772 | 3477 |
| 2773 | 3904 |
| 2774 | 3962 |
| 2775 | 4393 |
| 2776 | 3567 |
| 2777 | 4016 |
| 2778 | 4087 |
| 2779 | 4473 |
| 2780 | 4150 |
| 2781 | 4583 |
| 2782 | 4679 |
| 2783 | 5176 |
| 2784 | 2990 |
| 2785 | 3432 |
| 2786 | 3551 |
| 2787 | 3938 |
| 2788 | 3646 |
| 2789 | 4032 |
| 2790 | 4107 |
| 2791 | 4561 |
| 2792 | 3723 |
| 2793 | 4131 |
| 2794 | 4210 |
| 2795 | 4656 |
| 2796 | 4294 |
| 2797 | 4720 |
| 2798 | 4812 |
| 2799 | 5266 |
| 2800 | 3853 |
| 2801 | 4250 |
| 2802 | 4366 |
| 2803 | 4761 |
| 2804 | 4412 |
| 2805 | 4845 |
| 2806 | 4890 |
| 2807 | 5353 |
| 2808 | 4497 |
| 2809 | 4935 |
| 2810 | 4994 |
| 2811 | 5457 |
| 2812 | 5112 |
| 2813 | 5604 |
| 2814 | 5779 |
| 2815 | 6077 |
| 2816 | 998 |
| 2817 | 1435 |
| 2818 | 1656 |
| 2819 | 2185 |
| 2820 | 1797 |
| 2821 | 2241 |
| 2822 | 2376 |
| 2823 | 2778 |
| 2824 | 1909 |
| 2825 | 2333 |
| 2826 | 2461 |
| 2827 | 2836 |
| 2828 | 2528 |
| 2829 | 2958 |
| 2830 | 3010 |
| 2831 | 3545 |
| 2832 | 1988 |
| 2833 | 2411 |
| 2834 | 2493 |
| 2835 | 2936 |
| 2836 | 2659 |
| 2837 | 3071 |
| 2838 | 3206 |
| 2839 | 3587 |

TABLE Z9-continued

| with a sequence length of 8192: | |
|---|---|
| Polarized channel sequence number | Reliability or reliability sequence number |
| 2840 | 2726 |
| 2841 | 3193 |
| 2842 | 3114 |
| 2843 | 3685 |
| 2844 | 3321 |
| 2845 | 3774 |
| 2846 | 3859 |
| 2847 | 4333 |
| 2848 | 2061 |
| 2849 | 2564 |
| 2850 | 2691 |
| 2851 | 3086 |
| 2852 | 2752 |
| 2853 | 3151 |
| 2854 | 3232 |
| 2855 | 3728 |
| 2856 | 2861 |
| 2857 | 3298 |
| 2858 | 3371 |
| 2859 | 3803 |
| 2860 | 3457 |
| 2861 | 3898 |
| 2862 | 3966 |
| 2863 | 4446 |
| 2864 | 2987 |
| 2865 | 3390 |
| 2866 | 3489 |
| 2867 | 3944 |
| 2868 | 3556 |
| 2869 | 4038 |
| 2870 | 4081 |
| 2871 | 4482 |
| 2872 | 3668 |
| 2873 | 4115 |
| 2874 | 4202 |
| 2875 | 4596 |
| 2876 | 4278 |
| 2877 | 4706 |
| 2878 | 4786 |
| 2879 | 5293 |
| 2880 | 2288 |
| 2881 | 2624 |
| 2882 | 2809 |
| 2883 | 3283 |
| 2884 | 2910 |
| 2885 | 3338 |
| 2886 | 3427 |
| 2887 | 3882 |
| 2888 | 3021 |
| 2889 | 3531 |
| 2890 | 3411 |
| 2891 | 3984 |
| 2892 | 3604 |
| 2893 | 4048 |
| 2894 | 4160 |
| 2895 | 4546 |
| 2896 | 3136 |
| 2897 | 3472 |
| 2898 | 3652 |
| 2899 | 4101 |
| 2900 | 3757 |
| 2901 | 4190 |
| 2902 | 4246 |
| 2903 | 4643 |
| 2904 | 3847 |
| 2905 | 4302 |
| 2906 | 4360 |
| 2907 | 4729 |
| 2908 | 4433 |
| 2909 | 4854 |
| 2910 | 4918 |
| 2911 | 5418 |
| 2912 | 3245 |
| 2913 | 3717 |
| 2914 | 3820 |

TABLE Z9-continued with a sequence length of 8192:

| Polarized channel sequence number | Reliability or reliability sequence number |
|---|---|
| 2915 | 4220 |
| 2916 | 3932 |
| 2917 | 4327 |
| 2918 | 4378 |
| 2919 | 4821 |
| 2920 | 4010 |
| 2921 | 4408 |
| 2922 | 4454 |
| 2923 | 4880 |
| 2924 | 4566 |
| 2925 | 4962 |
| 2926 | 5041 |
| 2927 | 5486 |
| 2928 | 4136 |
| 2929 | 4509 |
| 2930 | 4612 |
| 2931 | 5001 |
| 2932 | 4665 |
| 2933 | 5081 |
| 2934 | 5132 |
| 2935 | 5559 |
| 2936 | 4754 |
| 2937 | 5166 |
| 2938 | 5221 |
| 2939 | 5671 |
| 2940 | 5329 |
| 2941 | 5795 |
| 2942 | 5959 |
| 2943 | 6248 |
| 2944 | 2134 |
| 2945 | 2597 |
| 2946 | 2888 |
| 2947 | 3441 |
| 2948 | 3049 |
| 2949 | 3515 |
| 2950 | 3702 |
| 2951 | 4125 |
| 2952 | 3173 |
| 2953 | 3620 |
| 2954 | 3786 |
| 2955 | 4180 |
| 2956 | 3877 |
| 2957 | 4284 |
| 2958 | 4345 |
| 2959 | 4899 |
| 2960 | 3267 |
| 2961 | 3746 |
| 2962 | 3830 |
| 2963 | 4264 |
| 2964 | 4004 |
| 2965 | 4399 |
| 2966 | 4553 |
| 2967 | 4928 |
| 2968 | 4061 |
| 2969 | 4533 |
| 2970 | 4469 |
| 2971 | 5011 |
| 2972 | 4674 |
| 2973 | 5094 |
| 2974 | 5189 |
| 2975 | 5653 |
| 2976 | 3357 |
| 2977 | 3916 |
| 2978 | 4026 |
| 2979 | 4427 |
| 2980 | 4091 |
| 2981 | 4516 |
| 2982 | 4575 |
| 2983 | 5059 |
| 2984 | 4216 |
| 2985 | 4652 |
| 2986 | 4715 |
| 2987 | 5102 |
| 2988 | 4795 |
| 2989 | 5210 |
| 2990 | 5280 |
| 2991 | 5756 |
| 2992 | 4308 |
| 2993 | 4738 |
| 2994 | 4835 |
| 2995 | 5256 |
| 2996 | 4909 |
| 2997 | 5340 |
| 2998 | 5381 |
| 2999 | 5831 |
| 3000 | 4984 |
| 3001 | 5432 |
| 3002 | 5515 |
| 3003 | 5939 |
| 3004 | 5574 |
| 3005 | 6055 |
| 3006 | 6159 |
| 3007 | 6651 |
| 3008 | 3573 |
| 3009 | 3956 |
| 3010 | 4156 |
| 3011 | 4627 |
| 3012 | 4240 |
| 3013 | 4697 |
| 3014 | 4777 |
| 3015 | 5197 |
| 3016 | 4374 |
| 3017 | 4861 |
| 3018 | 4768 |
| 3019 | 5301 |
| 3020 | 4955 |
| 3021 | 5367 |
| 3022 | 5472 |
| 3023 | 5874 |
| 3024 | 4488 |
| 3025 | 4830 |
| 3026 | 4972 |
| 3027 | 5406 |
| 3028 | 5071 |
| 3029 | 5501 |
| 3030 | 5542 |
| 3031 | 6001 |
| 3032 | 5156 |
| 3033 | 5622 |
| 3034 | 5687 |
| 3035 | 6102 |
| 3036 | 5737 |
| 3037 | 6220 |
| 3038 | 6312 |
| 3039 | 6773 |
| 3040 | 4605 |
| 3041 | 5019 |
| 3042 | 5145 |
| 3043 | 5530 |
| 3044 | 5232 |
| 3045 | 5638 |
| 3046 | 5706 |
| 3047 | 6185 |
| 3048 | 5315 |
| 3049 | 5725 |
| 3050 | 5814 |
| 3051 | 6280 |
| 3052 | 5891 |
| 3053 | 6349 |
| 3054 | 6421 |
| 3055 | 6843 |
| 3056 | 5446 |
| 3057 | 5854 |
| 3058 | 5980 |
| 3059 | 6387 |
| 3060 | 6026 |
| 3061 | 6465 |
| 3062 | 6509 |
| 3063 | 6923 |
| 3064 | 6132 |

TABLE Z9-continued with a sequence length of 8192:

| Polarized channel sequence number | Reliability or reliability sequence number |
|---|---|
| 3065 | 6551 |
| 3066 | 6602 |
| 3067 | 7020 |
| 3068 | 6711 |
| 3069 | 7126 |
| 3070 | 7280 |
| 3071 | 7500 |
| 3072 | 237 |
| 3073 | 530 |
| 3074 | 704 |
| 3075 | 1237 |
| 3076 | 817 |
| 3077 | 1278 |
| 3078 | 1385 |
| 3079 | 1717 |
| 3080 | 902 |
| 3081 | 1350 |
| 3082 | 1446 |
| 3083 | 1758 |
| 3084 | 1504 |
| 3085 | 1865 |
| 3086 | 1900 |
| 3087 | 2362 |
| 3088 | 978 |
| 3089 | 1415 |
| 3090 | 1476 |
| 3091 | 1849 |
| 3092 | 1604 |
| 3093 | 1966 |
| 3094 | 2068 |
| 3095 | 2414 |
| 3096 | 1652 |
| 3097 | 2053 |
| 3098 | 1993 |
| 3099 | 2478 |
| 3100 | 2175 |
| 3101 | 2561 |
| 3102 | 2639 |
| 3103 | 3106 |
| 3104 | 1044 |
| 3105 | 1529 |
| 3106 | 1629 |
| 3107 | 1981 |
| 3108 | 1693 |
| 3109 | 2024 |
| 3110 | 2110 |
| 3111 | 2519 |
| 3112 | 1777 |
| 3113 | 2162 |
| 3114 | 2223 |
| 3115 | 2582 |
| 3116 | 2294 |
| 3117 | 2677 |
| 3118 | 2741 |
| 3119 | 3215 |
| 3120 | 1884 |
| 3121 | 2236 |
| 3122 | 2328 |
| 3123 | 2720 |
| 3124 | 2371 |
| 3125 | 2806 |
| 3126 | 2850 |
| 3127 | 3257 |
| 3128 | 2458 |
| 3129 | 2889 |
| 3130 | 2969 |
| 3131 | 3360 |
| 3132 | 3045 |
| 3133 | 3480 |
| 3134 | 3563 |
| 3135 | 4083 |
| 3136 | 1318 |
| 3137 | 1583 |
| 3138 | 1737 |
| 3139 | 2149 |

TABLE Z9-continued with a sequence length of 8192:

| Polarized channel sequence number | Reliability or reliability sequence number |
|---|---|
| 3140 | 1832 |
| 3141 | 2188 |
| 3142 | 2271 |
| 3143 | 2668 |
| 3144 | 1916 |
| 3145 | 2351 |
| 3146 | 2247 |
| 3147 | 2766 |
| 3148 | 2426 |
| 3149 | 2815 |
| 3150 | 2929 |
| 3151 | 3310 |
| 3152 | 2009 |
| 3153 | 2316 |
| 3154 | 2446 |
| 3155 | 2867 |
| 3156 | 2552 |
| 3157 | 2961 |
| 3158 | 3024 |
| 3159 | 3418 |
| 3160 | 2630 |
| 3161 | 3068 |
| 3162 | 3124 |
| 3163 | 3506 |
| 3164 | 3203 |
| 3165 | 3633 |
| 3166 | 3698 |
| 3167 | 4212 |
| 3168 | 2121 |
| 3169 | 2499 |
| 3170 | 2609 |
| 3171 | 3001 |
| 3172 | 2712 |
| 3173 | 3096 |
| 3174 | 3153 |
| 3175 | 3600 |
| 3176 | 2784 |
| 3177 | 3181 |
| 3178 | 3228 |
| 3179 | 3659 |
| 3180 | 3334 |
| 3181 | 3744 |
| 3182 | 3834 |
| 3183 | 4280 |
| 3184 | 2907 |
| 3185 | 3284 |
| 3186 | 3388 |
| 3187 | 3784 |
| 3188 | 3445 |
| 3189 | 3884 |
| 3190 | 3924 |
| 3191 | 4362 |
| 3192 | 3527 |
| 3193 | 3976 |
| 3194 | 4030 |
| 3195 | 4456 |
| 3196 | 4129 |
| 3197 | 4577 |
| 3198 | 4740 |
| 3199 | 5014 |
| 3200 | 1100 |
| 3201 | 1558 |
| 3202 | 1793 |
| 3203 | 2282 |
| 3204 | 1950 |
| 3205 | 2339 |
| 3206 | 2490 |
| 3207 | 2899 |
| 3208 | 2041 |
| 3209 | 2434 |
| 3210 | 2570 |
| 3211 | 2947 |
| 3212 | 2656 |
| 3213 | 3060 |
| 3214 | 3119 |

TABLE Z9-continued with a sequence length of 8192:

| Polarized channel sequence number | Reliability or reliability sequence number |
|---|---|
| 3215 | 3676 |
| 3216 | 2137 |
| 3217 | 2540 |
| 3218 | 2621 |
| 3219 | 3029 |
| 3220 | 2775 |
| 3221 | 3176 |
| 3222 | 3329 |
| 3223 | 3715 |
| 3224 | 2833 |
| 3225 | 3305 |
| 3226 | 3237 |
| 3227 | 3799 |
| 3228 | 3450 |
| 3229 | 3890 |
| 3230 | 3986 |
| 3231 | 4443 |
| 3232 | 2199 |
| 3233 | 2694 |
| 3234 | 2801 |
| 3235 | 3189 |
| 3236 | 2858 |
| 3237 | 3290 |
| 3238 | 3355 |
| 3239 | 3851 |
| 3240 | 2979 |
| 3241 | 3425 |
| 3242 | 3486 |
| 3243 | 3906 |
| 3244 | 3583 |
| 3245 | 4018 |
| 3246 | 4069 |
| 3247 | 4557 |
| 3248 | 3083 |
| 3249 | 3511 |
| 3250 | 3622 |
| 3251 | 4052 |
| 3252 | 3693 |
| 3253 | 4152 |
| 3254 | 4182 |
| 3255 | 4623 |
| 3256 | 3766 |
| 3257 | 4230 |
| 3258 | 4310 |
| 3259 | 4710 |
| 3260 | 4383 |
| 3261 | 4838 |
| 3262 | 4923 |
| 3263 | 5415 |
| 3264 | 2402 |
| 3265 | 2729 |
| 3266 | 2924 |
| 3267 | 3399 |
| 3268 | 3006 |
| 3269 | 3470 |
| 3270 | 3553 |
| 3271 | 4002 |
| 3272 | 3148 |
| 3273 | 3648 |
| 3274 | 3542 |
| 3275 | 4099 |
| 3276 | 3727 |
| 3277 | 4170 |
| 3278 | 4256 |
| 3279 | 4663 |
| 3280 | 3262 |
| 3281 | 3605 |
| 3282 | 3761 |
| 3283 | 4200 |
| 3284 | 3867 |
| 3285 | 4296 |
| 3286 | 4349 |
| 3287 | 4788 |
| 3288 | 3958 |
| 3289 | 4401 |

TABLE Z9-continued with a sequence length of 8192:

| Polarized channel sequence number | Reliability or reliability sequence number |
|---|---|
| 3290 | 4471 |
| 3291 | 4873 |
| 3292 | 4535 |
| 3293 | 4982 |
| 3294 | 5074 |
| 3295 | 5539 |
| 3296 | 3380 |
| 3297 | 3816 |
| 3298 | 3942 |
| 3299 | 4325 |
| 3300 | 4034 |
| 3301 | 4418 |
| 3302 | 4499 |
| 3303 | 4960 |
| 3304 | 4113 |
| 3305 | 4520 |
| 3306 | 4601 |
| 3307 | 5046 |
| 3308 | 4690 |
| 3309 | 5109 |
| 3310 | 5192 |
| 3311 | 5616 |
| 3312 | 4242 |
| 3313 | 4647 |
| 3314 | 4763 |
| 3315 | 5148 |
| 3316 | 4816 |
| 3317 | 5229 |
| 3318 | 5272 |
| 3319 | 5703 |
| 3320 | 4897 |
| 3321 | 5318 |
| 3322 | 5364 |
| 3323 | 5792 |
| 3324 | 5483 |
| 3325 | 5925 |
| 3326 | 6088 |
| 3327 | 6345 |
| 3328 | 1149 |
| 3329 | 1672 |
| 3330 | 1932 |
| 3331 | 2531 |
| 3332 | 2095 |
| 3333 | 2591 |
| 3334 | 2749 |
| 3335 | 3161 |
| 3336 | 2212 |
| 3337 | 2703 |
| 3338 | 2841 |
| 3339 | 3223 |
| 3340 | 2916 |
| 3341 | 3348 |
| 3342 | 3394 |
| 3343 | 3930 |
| 3344 | 2305 |
| 3345 | 2792 |
| 3346 | 2875 |
| 3347 | 3324 |
| 3348 | 3052 |
| 3349 | 3455 |
| 3350 | 3589 |
| 3351 | 3982 |
| 3352 | 3111 |
| 3353 | 3578 |
| 3354 | 3500 |
| 3355 | 4077 |
| 3356 | 3704 |
| 3357 | 4158 |
| 3358 | 4248 |
| 3359 | 4731 |
| 3360 | 2382 |
| 3361 | 2955 |
| 3362 | 3075 |
| 3363 | 3475 |
| 3364 | 3139 |

TABLE Z9-continued with a sequence length of 8192:

| Polarized channel sequence number | Reliability or reliability sequence number |
|---|---|
| 3365 | 3536 |
| 3366 | 3611 |
| 3367 | 4117 |
| 3368 | 3252 |
| 3369 | 3681 |
| 3370 | 3755 |
| 3371 | 4188 |
| 3372 | 3845 |
| 3373 | 4286 |
| 3374 | 4358 |
| 3375 | 4847 |
| 3376 | 3369 |
| 3377 | 3778 |
| 3378 | 3873 |
| 3379 | 4335 |
| 3380 | 3948 |
| 3381 | 4424 |
| 3382 | 4465 |
| 3383 | 4883 |
| 3384 | 4063 |
| 3385 | 4505 |
| 3386 | 4592 |
| 3387 | 4987 |
| 3388 | 4672 |
| 3389 | 5089 |
| 3390 | 5174 |
| 3391 | 5641 |
| 3392 | 2647 |
| 3393 | 3014 |
| 3394 | 3194 |
| 3395 | 3670 |
| 3396 | 3296 |
| 3397 | 3721 |
| 3398 | 3805 |
| 3399 | 4272 |
| 3400 | 3413 |
| 3401 | 3912 |
| 3402 | 3787 |
| 3403 | 4370 |
| 3404 | 3998 |
| 3405 | 4435 |
| 3406 | 4548 |
| 3407 | 4943 |
| 3408 | 3522 |
| 3409 | 3861 |
| 3410 | 4046 |
| 3411 | 4490 |
| 3412 | 4144 |
| 3413 | 4581 |
| 3414 | 4641 |
| 3415 | 5029 |
| 3416 | 4232 |
| 3417 | 4695 |
| 3418 | 4752 |
| 3419 | 5120 |
| 3420 | 4833 |
| 3421 | 5240 |
| 3422 | 5296 |
| 3423 | 5760 |
| 3424 | 3628 |
| 3425 | 4103 |
| 3426 | 4204 |
| 3427 | 4616 |
| 3428 | 4319 |
| 3429 | 4722 |
| 3430 | 4782 |
| 3431 | 5200 |
| 3432 | 4395 |
| 3433 | 4807 |
| 3434 | 4856 |
| 3435 | 5261 |
| 3436 | 4969 |
| 3437 | 5337 |
| 3438 | 5409 |
| 3439 | 5824 |

TABLE Z9-continued with a sequence length of 8192:

| Polarized channel sequence number | Reliability or reliability sequence number |
|---|---|
| 3440 | 4527 |
| 3441 | 4906 |
| 3442 | 5004 |
| 3443 | 5376 |
| 3444 | 5056 |
| 3445 | 5452 |
| 3446 | 5492 |
| 3447 | 5894 |
| 3448 | 5140 |
| 3449 | 5527 |
| 3450 | 5583 |
| 3451 | 5987 |
| 3452 | 5681 |
| 3453 | 6106 |
| 3454 | 6236 |
| 3455 | 6496 |
| 3456 | 2469 |
| 3457 | 2984 |
| 3458 | 3271 |
| 3459 | 3828 |
| 3460 | 3431 |
| 3461 | 3902 |
| 3462 | 4089 |
| 3463 | 4514 |
| 3464 | 3558 |
| 3465 | 4012 |
| 3466 | 4174 |
| 3467 | 4568 |
| 3468 | 4268 |
| 3469 | 4683 |
| 3470 | 4749 |
| 3471 | 5277 |
| 3472 | 3654 |
| 3473 | 4134 |
| 3474 | 4218 |
| 3475 | 4654 |
| 3476 | 4387 |
| 3477 | 4798 |
| 3478 | 4950 |
| 3479 | 5309 |
| 3480 | 4448 |
| 3481 | 4933 |
| 3482 | 4866 |
| 3483 | 5387 |
| 3484 | 5066 |
| 3485 | 5463 |
| 3486 | 5550 |
| 3487 | 5973 |
| 3488 | 3738 |
| 3489 | 4304 |
| 3490 | 4410 |
| 3491 | 4823 |
| 3492 | 4480 |
| 3493 | 4916 |
| 3494 | 4977 |
| 3495 | 5429 |
| 3496 | 4608 |
| 3497 | 5039 |
| 3498 | 5099 |
| 3499 | 5469 |
| 3500 | 5182 |
| 3501 | 5568 |
| 3502 | 5632 |
| 3503 | 6066 |
| 3504 | 4704 |
| 3505 | 5130 |
| 3506 | 5224 |
| 3507 | 5607 |
| 3508 | 5285 |
| 3509 | 5690 |
| 3510 | 5731 |
| 3511 | 6140 |
| 3512 | 5356 |
| 3513 | 5769 |
| 3514 | 5851 |

TABLE Z9-continued with a sequence length of 8192:

| Polarized channel sequence number | Reliability or reliability sequence number |
| --- | --- |
| 3515 | 6212 |
| 3516 | 5908 |
| 3517 | 6324 |
| 3518 | 6417 |
| 3519 | 6854 |
| 3520 | 3964 |
| 3521 | 4343 |
| 3522 | 4544 |
| 3523 | 5024 |
| 3524 | 4632 |
| 3525 | 5084 |
| 3526 | 5163 |
| 3527 | 5562 |
| 3528 | 4772 |
| 3529 | 5248 |
| 3530 | 5158 |
| 3531 | 5656 |
| 3532 | 5326 |
| 3533 | 5715 |
| 3534 | 5805 |
| 3535 | 6178 |
| 3536 | 4892 |
| 3537 | 5213 |
| 3538 | 5348 |
| 3539 | 5744 |
| 3540 | 5437 |
| 3541 | 5841 |
| 3542 | 5881 |
| 3543 | 6284 |
| 3544 | 5512 |
| 3545 | 5942 |
| 3546 | 5998 |
| 3547 | 6366 |
| 3548 | 6051 |
| 3549 | 6469 |
| 3550 | 6555 |
| 3551 | 6959 |
| 3552 | 4996 |
| 3553 | 5401 |
| 3554 | 5506 |
| 3555 | 5864 |
| 3556 | 5598 |
| 3557 | 5952 |
| 3558 | 6019 |
| 3559 | 6447 |
| 3560 | 5665 |
| 3561 | 6033 |
| 3562 | 6121 |
| 3563 | 6528 |
| 3564 | 6197 |
| 3565 | 6588 |
| 3566 | 6646 |
| 3567 | 7027 |
| 3568 | 5782 |
| 3569 | 6155 |
| 3570 | 6256 |
| 3571 | 6621 |
| 3572 | 6300 |
| 3573 | 6690 |
| 3574 | 6726 |
| 3575 | 7085 |
| 3576 | 6395 |
| 3577 | 6768 |
| 3578 | 6810 |
| 3579 | 7175 |
| 3580 | 6906 |
| 3581 | 7264 |
| 3582 | 7388 |
| 3583 | 7584 |
| 3584 | 1195 |
| 3585 | 1812 |
| 3586 | 2083 |
| 3587 | 2825 |
| 3588 | 2258 |
| 3589 | 2881 |

TABLE Z9-continued with a sequence length of 8192:

| Polarized channel sequence number | Reliability or reliability sequence number |
| --- | --- |
| 3590 | 3037 |
| 3591 | 3491 |
| 3592 | 2394 |
| 3593 | 2992 |
| 3594 | 3134 |
| 3595 | 3547 |
| 3596 | 3210 |
| 3597 | 3665 |
| 3598 | 3710 |
| 3599 | 4276 |
| 3600 | 2511 |
| 3601 | 3088 |
| 3602 | 3168 |
| 3603 | 3642 |
| 3604 | 3343 |
| 3605 | 3793 |
| 3606 | 3936 |
| 3607 | 4329 |
| 3608 | 3404 |
| 3609 | 3918 |
| 3610 | 3839 |
| 3611 | 4403 |
| 3612 | 4059 |
| 3613 | 4484 |
| 3614 | 4564 |
| 3615 | 5036 |
| 3616 | 2600 |
| 3617 | 3243 |
| 3618 | 3374 |
| 3619 | 3811 |
| 3620 | 3464 |
| 3621 | 3878 |
| 3622 | 3970 |
| 3623 | 4437 |
| 3624 | 3569 |
| 3625 | 4040 |
| 3626 | 4123 |
| 3627 | 4507 |
| 3628 | 4194 |
| 3629 | 4603 |
| 3630 | 4668 |
| 3631 | 5143 |
| 3632 | 3687 |
| 3633 | 4138 |
| 3634 | 4238 |
| 3635 | 4645 |
| 3636 | 4292 |
| 3637 | 4733 |
| 3638 | 4775 |
| 3639 | 5187 |
| 3640 | 4376 |
| 3641 | 4809 |
| 3642 | 4894 |
| 3643 | 5290 |
| 3644 | 4967 |
| 3645 | 5403 |
| 3646 | 5489 |
| 3647 | 5932 |
| 3648 | 2939 |
| 3649 | 3315 |
| 3650 | 3516 |
| 3651 | 4024 |
| 3652 | 3617 |
| 3653 | 4073 |
| 3654 | 4164 |
| 3655 | 4594 |
| 3656 | 3732 |
| 3657 | 4262 |
| 3658 | 4148 |
| 3659 | 4686 |
| 3660 | 4337 |
| 3661 | 4742 |
| 3662 | 4859 |
| 3663 | 5242 |
| 3664 | 3855 |

TABLE Z9-continued with a sequence length of 8192:

| Polarized channel sequence number | Reliability or reliability sequence number |
|---|---|
| 3665 | 4224 |
| 3666 | 4368 |
| 3667 | 4793 |
| 3668 | 4477 |
| 3669 | 4885 |
| 3670 | 4947 |
| 3671 | 5345 |
| 3672 | 4555 |
| 3673 | 4999 |
| 3674 | 5061 |
| 3675 | 5426 |
| 3676 | 5135 |
| 3677 | 5553 |
| 3678 | 5610 |
| 3679 | 6048 |
| 3680 | 3992 |
| 3681 | 4429 |
| 3682 | 4529 |
| 3683 | 4921 |
| 3684 | 4636 |
| 3685 | 5026 |
| 3686 | 5086 |
| 3687 | 5518 |
| 3688 | 4708 |
| 3689 | 5114 |
| 3690 | 5161 |
| 3691 | 5577 |
| 3692 | 5264 |
| 3693 | 5650 |
| 3694 | 5728 |
| 3695 | 6110 |
| 3696 | 4828 |
| 3697 | 5208 |
| 3698 | 5312 |
| 3699 | 5684 |
| 3700 | 5370 |
| 3701 | 5766 |
| 3702 | 5801 |
| 3703 | 6181 |
| 3704 | 5449 |
| 3705 | 5844 |
| 3706 | 5888 |
| 3707 | 6260 |
| 3708 | 5977 |
| 3709 | 6357 |
| 3710 | 6487 |
| 3711 | 6716 |
| 3712 | 2684 |
| 3713 | 3276 |
| 3714 | 3594 |
| 3715 | 4178 |
| 3716 | 3772 |
| 3717 | 4254 |
| 3718 | 4416 |
| 3719 | 4819 |
| 3720 | 3896 |
| 3721 | 4352 |
| 3722 | 4492 |
| 3723 | 4868 |
| 3724 | 4585 |
| 3725 | 4989 |
| 3726 | 5054 |
| 3727 | 5586 |
| 3728 | 4006 |
| 3729 | 4462 |
| 3730 | 4542 |
| 3731 | 4957 |
| 3732 | 4699 |
| 3733 | 5104 |
| 3734 | 5258 |
| 3735 | 5625 |
| 3736 | 4756 |
| 3737 | 5237 |
| 3738 | 5171 |
| 3739 | 5699 |

TABLE Z9-continued with a sequence length of 8192:

| Polarized channel sequence number | Reliability or reliability sequence number |
|---|---|
| 3740 | 5373 |
| 3741 | 5772 |
| 3742 | 5857 |
| 3743 | 6244 |
| 3744 | 4095 |
| 3745 | 4614 |
| 3746 | 4726 |
| 3747 | 5117 |
| 3748 | 4784 |
| 3749 | 5216 |
| 3750 | 5282 |
| 3751 | 5740 |
| 3752 | 4904 |
| 3753 | 5351 |
| 3754 | 5412 |
| 3755 | 5788 |
| 3756 | 5498 |
| 3757 | 5884 |
| 3758 | 5921 |
| 3759 | 6341 |
| 3760 | 5016 |
| 3761 | 5435 |
| 3762 | 5536 |
| 3763 | 5911 |
| 3764 | 5601 |
| 3765 | 5994 |
| 3766 | 6023 |
| 3767 | 6400 |
| 3768 | 5675 |
| 3769 | 6062 |
| 3770 | 6136 |
| 3771 | 6473 |
| 3772 | 6193 |
| 3773 | 6569 |
| 3774 | 6636 |
| 3775 | 7040 |
| 3776 | 4317 |
| 3777 | 4659 |
| 3778 | 4849 |
| 3779 | 5331 |
| 3780 | 4931 |
| 3781 | 5389 |
| 3782 | 5475 |
| 3783 | 5871 |
| 3784 | 5076 |
| 3785 | 5556 |
| 3786 | 5466 |
| 3787 | 5949 |
| 3788 | 5635 |
| 3789 | 6012 |
| 3790 | 6091 |
| 3791 | 6430 |
| 3792 | 5195 |
| 3793 | 5521 |
| 3794 | 5662 |
| 3795 | 6037 |
| 3796 | 5753 |
| 3797 | 6117 |
| 3798 | 6166 |
| 3799 | 6532 |
| 3800 | 5828 |
| 3801 | 6208 |
| 3802 | 6272 |
| 3803 | 6597 |
| 3804 | 6328 |
| 3805 | 6685 |
| 3806 | 6762 |
| 3807 | 7119 |
| 3808 | 5307 |
| 3809 | 5712 |
| 3810 | 5818 |
| 3811 | 6147 |
| 3812 | 5898 |
| 3813 | 6228 |
| 3814 | 6292 |

TABLE Z9-continued

| with a sequence length of 8192: | |
|---|---|
| Polarized channel sequence number | Reliability or reliability sequence number |
| 3815 | 6670 |
| 3816 | 5963 |
| 3817 | 6308 |
| 3818 | 6378 |
| 3819 | 6741 |
| 3820 | 6451 |
| 3821 | 6794 |
| 3822 | 6860 |
| 3823 | 7189 |
| 3824 | 6073 |
| 3825 | 6412 |
| 3826 | 6514 |
| 3827 | 6821 |
| 3828 | 6546 |
| 3829 | 6888 |
| 3830 | 6917 |
| 3831 | 7241 |
| 3832 | 6617 |
| 3833 | 6953 |
| 3834 | 6989 |
| 3835 | 7312 |
| 3836 | 7078 |
| 3837 | 7396 |
| 3838 | 7510 |
| 3839 | 7667 |
| 3840 | 2758 |
| 3841 | 3438 |
| 3842 | 3749 |
| 3843 | 4452 |
| 3844 | 3952 |
| 3845 | 4518 |
| 3846 | 4677 |
| 3847 | 5097 |
| 3848 | 4109 |
| 3849 | 4625 |
| 3850 | 4765 |
| 3851 | 5150 |
| 3852 | 4842 |
| 3853 | 5274 |
| 3854 | 5320 |
| 3855 | 5811 |
| 3856 | 4208 |
| 3857 | 4717 |
| 3858 | 4800 |
| 3859 | 5250 |
| 3860 | 4974 |
| 3861 | 5384 |
| 3862 | 5509 |
| 3863 | 5847 |
| 3864 | 5044 |
| 3865 | 5495 |
| 3866 | 5423 |
| 3867 | 5928 |
| 3868 | 5613 |
| 3869 | 6008 |
| 3870 | 6080 |
| 3871 | 6482 |
| 3872 | 4300 |
| 3873 | 4878 |
| 3874 | 5009 |
| 3875 | 5395 |
| 3876 | 5069 |
| 3877 | 5454 |
| 3878 | 5533 |
| 3879 | 5966 |
| 3880 | 5179 |
| 3881 | 5592 |
| 3882 | 5659 |
| 3883 | 6030 |
| 3884 | 5734 |
| 3885 | 6114 |
| 3886 | 6174 |
| 3887 | 6574 |
| 3888 | 5299 |
| 3889 | 5678 |

TABLE Z9-continued

| with a sequence length of 8192: | |
|---|---|
| Polarized channel sequence number | Reliability or reliability sequence number |
| 3890 | 5763 |
| 3891 | 6151 |
| 3892 | 5821 |
| 3893 | 6232 |
| 3894 | 6264 |
| 3895 | 6607 |
| 3896 | 5918 |
| 3897 | 6296 |
| 3898 | 6370 |
| 3899 | 6695 |
| 3900 | 6434 |
| 3901 | 6784 |
| 3902 | 6838 |
| 3903 | 7204 |
| 3904 | 4572 |
| 3905 | 4938 |
| 3906 | 5127 |
| 3907 | 5580 |
| 3908 | 5226 |
| 3909 | 5628 |
| 3910 | 5709 |
| 3911 | 6099 |
| 3912 | 5334 |
| 3913 | 5798 |
| 3914 | 5696 |
| 3915 | 6189 |
| 3916 | 5861 |
| 3917 | 6240 |
| 3918 | 6337 |
| 3919 | 6656 |
| 3920 | 5443 |
| 3921 | 5747 |
| 3922 | 5904 |
| 3923 | 6288 |
| 3924 | 5991 |
| 3925 | 6361 |
| 3926 | 6408 |
| 3927 | 6731 |
| 3928 | 6069 |
| 3929 | 6456 |
| 3930 | 6500 |
| 3931 | 6800 |
| 3932 | 6564 |
| 3933 | 6894 |
| 3934 | 6941 |
| 3935 | 7288 |
| 3936 | 5545 |
| 3937 | 5956 |
| 3938 | 6041 |
| 3939 | 6391 |
| 3940 | 6144 |
| 3941 | 6478 |
| 3942 | 6523 |
| 3943 | 6871 |
| 3944 | 6205 |
| 3945 | 6541 |
| 3946 | 6583 |
| 3947 | 6912 |
| 3948 | 6675 |
| 3949 | 6971 |
| 3950 | 7033 |
| 3951 | 7328 |
| 3952 | 6316 |
| 3953 | 6626 |
| 3954 | 6705 |
| 3955 | 7002 |
| 3956 | 6747 |
| 3957 | 7059 |
| 3958 | 7092 |
| 3959 | 7370 |
| 3960 | 6816 |
| 3961 | 7112 |
| 3962 | 7153 |
| 3963 | 7442 |
| 3964 | 7226 |

TABLE Z9-continued

| with a sequence length of 8192: | |
|---|---|
| Polarized channel sequence number | Reliability or reliability sequence number |
| 3965 | 7520 |
| 3966 | 7607 |
| 3967 | 7747 |
| 3968 | 4391 |
| 3969 | 4911 |
| 3970 | 5205 |
| 3971 | 5718 |
| 3972 | 5359 |
| 3973 | 5785 |
| 3974 | 5945 |
| 3975 | 6304 |
| 3976 | 5477 |
| 3977 | 5877 |
| 3978 | 6016 |
| 3979 | 6353 |
| 3980 | 6095 |
| 3981 | 6443 |
| 3982 | 6491 |
| 3983 | 6929 |
| 3984 | 5565 |
| 3985 | 5984 |
| 3986 | 6059 |
| 3987 | 6425 |
| 3988 | 6201 |
| 3989 | 6537 |
| 3990 | 6665 |
| 3991 | 6947 |
| 3992 | 6252 |
| 3993 | 6641 |
| 3994 | 6593 |
| 3995 | 7008 |
| 3996 | 6757 |
| 3997 | 7065 |
| 3998 | 7132 |
| 3999 | 7424 |
| 4000 | 5647 |
| 4001 | 6128 |
| 4002 | 6224 |
| 4003 | 6560 |
| 4004 | 6276 |
| 4005 | 6631 |
| 4006 | 6680 |
| 4007 | 7046 |
| 4008 | 6383 |
| 4009 | 6736 |
| 4010 | 6789 |
| 4011 | 7072 |
| 4012 | 6849 |
| 4013 | 7146 |
| 4014 | 7196 |
| 4015 | 7490 |
| 4016 | 6460 |
| 4017 | 6805 |
| 4018 | 6883 |
| 4019 | 7182 |
| 4020 | 6935 |
| 4021 | 7233 |
| 4022 | 7256 |
| 4023 | 7541 |
| 4024 | 6983 |
| 4025 | 7296 |
| 4026 | 7345 |
| 4027 | 7595 |
| 4028 | 7379 |
| 4029 | 7654 |
| 4030 | 7706 |
| 4031 | 7915 |
| 4032 | 5834 |
| 4033 | 6162 |
| 4034 | 6332 |
| 4035 | 6721 |
| 4036 | 6404 |
| 4037 | 6778 |
| 4038 | 6832 |
| 4039 | 7139 |

TABLE Z9-continued

| with a sequence length of 8192: | |
|---|---|
| Polarized channel sequence number | Reliability or reliability sequence number |
| 4040 | 6518 |
| 4041 | 6900 |
| 4042 | 6827 |
| 4043 | 7211 |
| 4044 | 6965 |
| 4045 | 7249 |
| 4046 | 7320 |
| 4047 | 7562 |
| 4048 | 6612 |
| 4049 | 6877 |
| 4050 | 6977 |
| 4051 | 7272 |
| 4052 | 7052 |
| 4053 | 7336 |
| 4054 | 7362 |
| 4055 | 7630 |
| 4056 | 7105 |
| 4057 | 7405 |
| 4058 | 7451 |
| 4059 | 7680 |
| 4060 | 7480 |
| 4061 | 7733 |
| 4062 | 7776 |
| 4063 | 7957 |
| 4064 | 6700 |
| 4065 | 7014 |
| 4066 | 7098 |
| 4067 | 7353 |
| 4068 | 7160 |
| 4069 | 7414 |
| 4070 | 7461 |
| 4071 | 7719 |
| 4072 | 7218 |
| 4073 | 7470 |
| 4074 | 7530 |
| 4075 | 7762 |
| 4076 | 7573 |
| 4077 | 7792 |
| 4078 | 7824 |
| 4079 | 7981 |
| 4080 | 7304 |
| 4081 | 7552 |
| 4082 | 7618 |
| 4083 | 7808 |
| 4084 | 7642 |
| 4085 | 7841 |
| 4086 | 7858 |
| 4087 | 8006 |
| 4088 | 7692 |
| 4089 | 7876 |
| 4090 | 7895 |
| 4091 | 8033 |
| 4092 | 7936 |
| 4093 | 8064 |
| 4094 | 8098 |
| 4095 | 8138 |
| 4096 | 12 |
| 4097 | 53 |
| 4098 | 93 |
| 4099 | 333 |
| 4100 | 128 |
| 4101 | 350 |
| 4102 | 399 |
| 4103 | 573 |
| 4104 | 158 |
| 4105 | 384 |
| 4106 | 429 |
| 4107 | 596 |
| 4108 | 458 |
| 4109 | 661 |
| 4110 | 681 |
| 4111 | 1002 |
| 4112 | 185 |
| 4113 | 415 |
| 4114 | 444 |

TABLE Z9-continued

| with a sequence length of 8192: | |
|---|---|
| Polarized channel sequence number | Reliability or reliability sequence number |
| 4115 | 650 |
| 4116 | 512 |
| 4117 | 730 |
| 4118 | 803 |
| 4119 | 1045 |
| 4120 | 537 |
| 4121 | 795 |
| 4122 | 758 |
| 4123 | 1093 |
| 4124 | 871 |
| 4125 | 1145 |
| 4126 | 1208 |
| 4127 | 1560 |
| 4128 | 210 |
| 4129 | 472 |
| 4130 | 524 |
| 4131 | 740 |
| 4132 | 561 |
| 4133 | 777 |
| 4134 | 829 |
| 4135 | 1119 |
| 4136 | 607 |
| 4137 | 863 |
| 4138 | 903 |
| 4139 | 1158 |
| 4140 | 958 |
| 4141 | 1232 |
| 4142 | 1280 |
| 4143 | 1650 |
| 4144 | 671 |
| 4145 | 911 |
| 4146 | 980 |
| 4147 | 1262 |
| 4148 | 1009 |
| 4149 | 1331 |
| 4150 | 1364 |
| 4151 | 1677 |
| 4152 | 1079 |
| 4153 | 1391 |
| 4154 | 1455 |
| 4155 | 1766 |
| 4156 | 1511 |
| 4157 | 1863 |
| 4158 | 1935 |
| 4159 | 2367 |
| 4160 | 367 |
| 4161 | 499 |
| 4162 | 584 |
| 4163 | 855 |
| 4164 | 640 |
| 4165 | 879 |
| 4166 | 942 |
| 4167 | 1226 |
| 4168 | 701 |
| 4169 | 995 |
| 4170 | 927 |
| 4171 | 1297 |
| 4172 | 1052 |
| 4173 | 1337 |
| 4174 | 1423 |
| 4175 | 1722 |
| 4176 | 768 |
| 4177 | 973 |
| 4178 | 1072 |
| 4179 | 1375 |
| 4180 | 1139 |
| 4181 | 1450 |
| 4182 | 1496 |
| 4183 | 1817 |
| 4184 | 1202 |
| 4185 | 1531 |
| 4186 | 1574 |
| 4187 | 1887 |
| 4188 | 1636 |
| 4189 | 1994 |

TABLE Z9-continued

| with a sequence length of 8192: | |
|---|---|
| Polarized channel sequence number | Reliability or reliability sequence number |
| 4190 | 2048 |
| 4191 | 2482 |
| 4192 | 838 |
| 4193 | 1106 |
| 4194 | 1183 |
| 4195 | 1475 |
| 4196 | 1256 |
| 4197 | 1555 |
| 4198 | 1598 |
| 4199 | 1963 |
| 4200 | 1308 |
| 4201 | 1622 |
| 4202 | 1659 |
| 4203 | 2013 |
| 4204 | 1744 |
| 4205 | 2085 |
| 4206 | 2158 |
| 4207 | 2547 |
| 4208 | 1402 |
| 4209 | 1704 |
| 4210 | 1787 |
| 4211 | 2122 |
| 4212 | 1834 |
| 4213 | 2200 |
| 4214 | 2232 |
| 4215 | 2623 |
| 4216 | 1903 |
| 4217 | 2273 |
| 4218 | 2324 |
| 4219 | 2711 |
| 4220 | 2406 |
| 4221 | 2821 |
| 4222 | 2978 |
| 4223 | 3251 |
| 4224 | 234 |
| 4225 | 485 |
| 4226 | 618 |
| 4227 | 950 |
| 4228 | 721 |
| 4229 | 987 |
| 4230 | 1099 |
| 4231 | 1397 |
| 4232 | 786 |
| 4233 | 1059 |
| 4234 | 1152 |
| 4235 | 1439 |
| 4236 | 1220 |
| 4237 | 1521 |
| 4238 | 1570 |
| 4239 | 2029 |
| 4240 | 846 |
| 4241 | 1132 |
| 4242 | 1196 |
| 4243 | 1501 |
| 4244 | 1303 |
| 4245 | 1617 |
| 4246 | 1740 |
| 4247 | 2066 |
| 4248 | 1348 |
| 4249 | 1718 |
| 4250 | 1664 |
| 4251 | 2132 |
| 4252 | 1838 |
| 4253 | 2204 |
| 4254 | 2283 |
| 4255 | 2696 |
| 4256 | 887 |
| 4257 | 1244 |
| 4258 | 1320 |
| 4259 | 1627 |
| 4260 | 1370 |
| 4261 | 1709 |
| 4262 | 1761 |
| 4263 | 2172 |
| 4264 | 1460 |

TABLE Z9-continued

| with a sequence length of 8192: | |
|---|---|
| Polarized channel sequence number | Reliability or reliability sequence number |
| 4265 | 1821 |
| 4266 | 1871 |
| 4267 | 2221 |
| 4268 | 1951 |
| 4269 | 2310 |
| 4270 | 2354 |
| 4271 | 2804 |
| 4272 | 1545 |
| 4273 | 1891 |
| 4274 | 1986 |
| 4275 | 2340 |
| 4276 | 2044 |
| 4277 | 2428 |
| 4278 | 2457 |
| 4279 | 2868 |
| 4280 | 2107 |
| 4281 | 2498 |
| 4282 | 2575 |
| 4283 | 2951 |
| 4284 | 2638 |
| 4285 | 3074 |
| 4286 | 3162 |
| 4287 | 3664 |
| 4288 | 1038 |
| 4289 | 1274 |
| 4290 | 1413 |
| 4291 | 1796 |
| 4292 | 1486 |
| 4293 | 1854 |
| 4294 | 1927 |
| 4295 | 2297 |
| 4296 | 1594 |
| 4297 | 2002 |
| 4298 | 1915 |
| 4299 | 2380 |
| 4300 | 2074 |
| 4301 | 2444 |
| 4302 | 2526 |
| 4303 | 2906 |
| 4304 | 1686 |
| 4305 | 1967 |
| 4306 | 2100 |
| 4307 | 2470 |
| 4308 | 2186 |
| 4309 | 2560 |
| 4310 | 2608 |
| 4311 | 3028 |
| 4312 | 2263 |
| 4313 | 2655 |
| 4314 | 2722 |
| 4315 | 3107 |
| 4316 | 2782 |
| 4317 | 3217 |
| 4318 | 3308 |
| 4319 | 3796 |
| 4320 | 1783 |
| 4321 | 2150 |
| 4322 | 2246 |
| 4323 | 2584 |
| 4324 | 2327 |
| 4325 | 2673 |
| 4326 | 2751 |
| 4327 | 3195 |
| 4328 | 2393 |
| 4329 | 2768 |
| 4330 | 2843 |
| 4331 | 3285 |
| 4332 | 2930 |
| 4333 | 3344 |
| 4334 | 3428 |
| 4335 | 3881 |
| 4336 | 2510 |
| 4337 | 2892 |
| 4338 | 2999 |
| 4339 | 3384 |

TABLE Z9-continued

| with a sequence length of 8192: | |
|---|---|
| Polarized channel sequence number | Reliability or reliability sequence number |
| 4340 | 3054 |
| 4341 | 3469 |
| 4342 | 3510 |
| 4343 | 3973 |
| 4344 | 3135 |
| 4345 | 3561 |
| 4346 | 3612 |
| 4347 | 4074 |
| 4348 | 3735 |
| 4349 | 4231 |
| 4350 | 4419 |
| 4351 | 4727 |
| 4352 | 256 |
| 4353 | 549 |
| 4354 | 711 |
| 4355 | 1126 |
| 4356 | 821 |
| 4357 | 1164 |
| 4358 | 1285 |
| 4359 | 1603 |
| 4360 | 896 |
| 4361 | 1250 |
| 4362 | 1359 |
| 4363 | 1654 |
| 4364 | 1408 |
| 4365 | 1757 |
| 4366 | 1792 |
| 4367 | 2239 |
| 4368 | 965 |
| 4369 | 1314 |
| 4370 | 1381 |
| 4371 | 1735 |
| 4372 | 1516 |
| 4373 | 1846 |
| 4374 | 1955 |
| 4375 | 2280 |
| 4376 | 1565 |
| 4377 | 1947 |
| 4378 | 1883 |
| 4379 | 2363 |
| 4380 | 2051 |
| 4381 | 2432 |
| 4382 | 2513 |
| 4383 | 2967 |
| 4384 | 1024 |
| 4385 | 1444 |
| 4386 | 1536 |
| 4387 | 1859 |
| 4388 | 1584 |
| 4389 | 1907 |
| 4390 | 1975 |
| 4391 | 2399 |
| 4392 | 1673 |
| 4393 | 2036 |
| 4394 | 2096 |
| 4395 | 2460 |
| 4396 | 2168 |
| 4397 | 2550 |
| 4398 | 2614 |
| 4399 | 3084 |
| 4400 | 1774 |
| 4401 | 2118 |
| 4402 | 2193 |
| 4403 | 2596 |
| 4404 | 2249 |
| 4405 | 2679 |
| 4406 | 2716 |
| 4407 | 3117 |
| 4408 | 2347 |
| 4409 | 2754 |
| 4410 | 2835 |
| 4411 | 3222 |
| 4412 | 2914 |
| 4413 | 3328 |
| 4414 | 3412 |

TABLE Z9-continued with a sequence length of 8192:

| Polarized channel sequence number | Reliability or reliability sequence number |
|---|---|
| 4415 | 3905 |
| 4416 | 1214 |
| 4417 | 1491 |
| 4418 | 1631 |
| 4419 | 2025 |
| 4420 | 1713 |
| 4421 | 2070 |
| 4422 | 2140 |
| 4423 | 2535 |
| 4424 | 1808 |
| 4425 | 2225 |
| 4426 | 2125 |
| 4427 | 2629 |
| 4428 | 2293 |
| 4429 | 2688 |
| 4430 | 2796 |
| 4431 | 3177 |
| 4432 | 1899 |
| 4433 | 2179 |
| 4434 | 2334 |
| 4435 | 2739 |
| 4436 | 2422 |
| 4437 | 2829 |
| 4438 | 2882 |
| 4439 | 3268 |
| 4440 | 2501 |
| 4441 | 2933 |
| 4442 | 2991 |
| 4443 | 3358 |
| 4444 | 3072 |
| 4445 | 3478 |
| 4446 | 3537 |
| 4447 | 4033 |
| 4448 | 1990 |
| 4449 | 2386 |
| 4450 | 2476 |
| 4451 | 2860 |
| 4452 | 2581 |
| 4453 | 2962 |
| 4454 | 3017 |
| 4455 | 3439 |
| 4456 | 2652 |
| 4457 | 3043 |
| 4458 | 3092 |
| 4459 | 3501 |
| 4460 | 3204 |
| 4461 | 3584 |
| 4462 | 3656 |
| 4463 | 4112 |
| 4464 | 2776 |
| 4465 | 3145 |
| 4466 | 3241 |
| 4467 | 3623 |
| 4468 | 3292 |
| 4469 | 3701 |
| 4470 | 3743 |
| 4471 | 4191 |
| 4472 | 3377 |
| 4473 | 3781 |
| 4474 | 3844 |
| 4475 | 4307 |
| 4476 | 3949 |
| 4477 | 4442 |
| 4478 | 4595 |
| 4479 | 4913 |
| 4480 | 1086 |
| 4481 | 1465 |
| 4482 | 1695 |
| 4483 | 2154 |
| 4484 | 1825 |
| 4485 | 2214 |
| 4486 | 2370 |
| 4487 | 2762 |
| 4488 | 1931 |
| 4489 | 2307 |

TABLE Z9-continued with a sequence length of 8192:

| Polarized channel sequence number | Reliability or reliability sequence number |
|---|---|
| 4490 | 2447 |
| 4491 | 2816 |
| 4492 | 2532 |
| 4493 | 2922 |
| 4494 | 2989 |
| 4495 | 3521 |
| 4496 | 2010 |
| 4497 | 2409 |
| 4498 | 2488 |
| 4499 | 2895 |
| 4500 | 2644 |
| 4501 | 3033 |
| 4502 | 3187 |
| 4503 | 3552 |
| 4504 | 2699 |
| 4505 | 3170 |
| 4506 | 3100 |
| 4507 | 3634 |
| 4508 | 3299 |
| 4509 | 3712 |
| 4510 | 3804 |
| 4511 | 4289 |
| 4512 | 2081 |
| 4513 | 2566 |
| 4514 | 2667 |
| 4515 | 3061 |
| 4516 | 2731 |
| 4517 | 3152 |
| 4518 | 3214 |
| 4519 | 3679 |
| 4520 | 2854 |
| 4521 | 3277 |
| 4522 | 3335 |
| 4523 | 3720 |
| 4524 | 3419 |
| 4525 | 3829 |
| 4526 | 3895 |
| 4527 | 4396 |
| 4528 | 2944 |
| 4529 | 3368 |
| 4530 | 3460 |
| 4531 | 3868 |
| 4532 | 3530 |
| 4533 | 3959 |
| 4534 | 4003 |
| 4535 | 4479 |
| 4536 | 3601 |
| 4537 | 4047 |
| 4538 | 4145 |
| 4539 | 4573 |
| 4540 | 4209 |
| 4541 | 4696 |
| 4542 | 4817 |
| 4543 | 5363 |
| 4544 | 2266 |
| 4545 | 2605 |
| 4546 | 2793 |
| 4547 | 3258 |
| 4548 | 2873 |
| 4549 | 3318 |
| 4550 | 3403 |
| 4551 | 3821 |
| 4552 | 3009 |
| 4553 | 3490 |
| 4554 | 3393 |
| 4555 | 3919 |
| 4556 | 3568 |
| 4557 | 3987 |
| 4558 | 4088 |
| 4559 | 4524 |
| 4560 | 3127 |
| 4561 | 3451 |
| 4562 | 3592 |
| 4563 | 4017 |
| 4564 | 3688 |

TABLE Z9-continued

| with a sequence length of 8192: | |
|---|---|
| Polarized channel sequence number | Reliability or reliability sequence number |
| 4565 | 4126 |
| 4566 | 4177 |
| 4567 | 4648 |
| 4568 | 3769 |
| 4569 | 4249 |
| 4570 | 4322 |
| 4571 | 4751 |
| 4572 | 4379 |
| 4573 | 4872 |
| 4574 | 4981 |
| 4575 | 5502 |
| 4576 | 3231 |
| 4577 | 3647 |
| 4578 | 3756 |
| 4579 | 4161 |
| 4580 | 3856 |
| 4581 | 4265 |
| 4582 | 4346 |
| 4583 | 4846 |
| 4584 | 3935 |
| 4585 | 4363 |
| 4586 | 4464 |
| 4587 | 4944 |
| 4588 | 4547 |
| 4589 | 5020 |
| 4590 | 5098 |
| 4591 | 5587 |
| 4592 | 4058 |
| 4593 | 4502 |
| 4594 | 4617 |
| 4595 | 5062 |
| 4596 | 4673 |
| 4597 | 5149 |
| 4598 | 5194 |
| 4599 | 5676 |
| 4600 | 4781 |
| 4601 | 5249 |
| 4602 | 5305 |
| 4603 | 5787 |
| 4604 | 5428 |
| 4605 | 5919 |
| 4606 | 6094 |
| 4607 | 6376 |
| 4608 | 276 |
| 4609 | 629 |
| 4610 | 812 |
| 4611 | 1342 |
| 4612 | 935 |
| 4613 | 1386 |
| 4614 | 1506 |
| 4615 | 1875 |
| 4616 | 1031 |
| 4617 | 1470 |
| 4618 | 1579 |
| 4619 | 1920 |
| 4620 | 1645 |
| 4621 | 2021 |
| 4622 | 2055 |
| 4623 | 2541 |
| 4624 | 1113 |
| 4625 | 1550 |
| 4626 | 1612 |
| 4627 | 1998 |
| 4628 | 1753 |
| 4629 | 2129 |
| 4630 | 2242 |
| 4631 | 2590 |
| 4632 | 1800 |
| 4633 | 2228 |
| 4634 | 2161 |
| 4635 | 2658 |
| 4636 | 2344 |
| 4637 | 2737 |
| 4638 | 2807 |
| 4639 | 3270 |

TABLE Z9-continued

| with a sequence length of 8192: | |
|---|---|
| Polarized channel sequence number | Reliability or reliability sequence number |
| 4640 | 1177 |
| 4641 | 1668 |
| 4642 | 1779 |
| 4643 | 2147 |
| 4644 | 1850 |
| 4645 | 2197 |
| 4646 | 2270 |
| 4647 | 2690 |
| 4648 | 1939 |
| 4649 | 2330 |
| 4650 | 2403 |
| 4651 | 2756 |
| 4652 | 2463 |
| 4653 | 2849 |
| 4654 | 2909 |
| 4655 | 3382 |
| 4656 | 2040 |
| 4657 | 2419 |
| 4658 | 2507 |
| 4659 | 2887 |
| 4660 | 2556 |
| 4661 | 2975 |
| 4662 | 3012 |
| 4663 | 3426 |
| 4664 | 2635 |
| 4665 | 3048 |
| 4666 | 3130 |
| 4667 | 3532 |
| 4668 | 3202 |
| 4669 | 3651 |
| 4670 | 3741 |
| 4671 | 4243 |
| 4672 | 1429 |
| 4673 | 1731 |
| 4674 | 1895 |
| 4675 | 2314 |
| 4676 | 1983 |
| 4677 | 2357 |
| 4678 | 2441 |
| 4679 | 2840 |
| 4680 | 2077 |
| 4681 | 2529 |
| 4682 | 2425 |
| 4683 | 2927 |
| 4684 | 2599 |
| 4685 | 2983 |
| 4686 | 3094 |
| 4687 | 3483 |
| 4688 | 2176 |
| 4689 | 2492 |
| 4690 | 2626 |
| 4691 | 3030 |
| 4692 | 2725 |
| 4693 | 3122 |
| 4694 | 3185 |
| 4695 | 3588 |
| 4696 | 2802 |
| 4697 | 3234 |
| 4698 | 3297 |
| 4699 | 3673 |
| 4700 | 3372 |
| 4701 | 3810 |
| 4702 | 3872 |
| 4703 | 4377 |
| 4704 | 2290 |
| 4705 | 2682 |
| 4706 | 2779 |
| 4707 | 3157 |
| 4708 | 2879 |
| 4709 | 3260 |
| 4710 | 3323 |
| 4711 | 3773 |
| 4712 | 2949 |
| 4713 | 3351 |
| 4714 | 3400 |

TABLE Z9-continued

| with a sequence length of 8192: | |
|---|---|
| Polarized channel sequence number | Reliability or reliability sequence number |
| 4715 | 3835 |
| 4716 | 3505 |
| 4717 | 3917 |
| 4718 | 3999 |
| 4719 | 4447 |
| 4720 | 3064 |
| 4721 | 3449 |
| 4722 | 3555 |
| 4723 | 3955 |
| 4724 | 3614 |
| 4725 | 4045 |
| 4726 | 4082 |
| 4727 | 4530 |
| 4728 | 3699 |
| 4729 | 4132 |
| 4730 | 4189 |
| 4731 | 4626 |
| 4732 | 4295 |
| 4733 | 4741 |
| 4734 | 4900 |
| 4735 | 5180 |
| 4736 | 1238 |
| 4737 | 1700 |
| 4738 | 1959 |
| 4739 | 2451 |
| 4740 | 2111 |
| 4741 | 2516 |
| 4742 | 2670 |
| 4743 | 3056 |
| 4744 | 2207 |
| 4745 | 2611 |
| 4746 | 2742 |
| 4747 | 3105 |
| 4748 | 2832 |
| 4749 | 3226 |
| 4750 | 3289 |
| 4751 | 3848 |
| 4752 | 2304 |
| 4753 | 2714 |
| 4754 | 2788 |
| 4755 | 3192 |
| 4756 | 2941 |
| 4757 | 3342 |
| 4758 | 3499 |
| 4759 | 3887 |
| 4760 | 2996 |
| 4761 | 3474 |
| 4762 | 3407 |
| 4763 | 3968 |
| 4764 | 3621 |
| 4765 | 4053 |
| 4766 | 4149 |
| 4767 | 4606 |
| 4768 | 2373 |
| 4769 | 2857 |
| 4770 | 2965 |
| 4771 | 3353 |
| 4772 | 3022 |
| 4773 | 3458 |
| 4774 | 3523 |
| 4775 | 4011 |
| 4776 | 3137 |
| 4777 | 3597 |
| 4778 | 3660 |
| 4779 | 4068 |
| 4780 | 3754 |
| 4781 | 4183 |
| 4782 | 4225 |
| 4783 | 4721 |
| 4784 | 3253 |
| 4785 | 3684 |
| 4786 | 3790 |
| 4787 | 4215 |
| 4788 | 3862 |
| 4789 | 4316 |

TABLE Z9-continued

| with a sequence length of 8192: | |
|---|---|
| Polarized channel sequence number | Reliability or reliability sequence number |
| 4790 | 4351 |
| 4791 | 4790 |
| 4792 | 3939 |
| 4793 | 4390 |
| 4794 | 4474 |
| 4795 | 4881 |
| 4796 | 4541 |
| 4797 | 5000 |
| 4798 | 5085 |
| 4799 | 5605 |
| 4800 | 2578 |
| 4801 | 2898 |
| 4802 | 3087 |
| 4803 | 3575 |
| 4804 | 3165 |
| 4805 | 3636 |
| 4806 | 3726 |
| 4807 | 4167 |
| 4808 | 3316 |
| 4809 | 3815 |
| 4810 | 3716 |
| 4811 | 4261 |
| 4812 | 3901 |
| 4813 | 4334 |
| 4814 | 4425 |
| 4815 | 4827 |
| 4816 | 3435 |
| 4817 | 3777 |
| 4818 | 3929 |
| 4819 | 4369 |
| 4820 | 4029 |
| 4821 | 4459 |
| 4822 | 4513 |
| 4823 | 4953 |
| 4824 | 4118 |
| 4825 | 4567 |
| 4826 | 4637 |
| 4827 | 5033 |
| 4828 | 4703 |
| 4829 | 5144 |
| 4830 | 5239 |
| 4831 | 5726 |
| 4832 | 3546 |
| 4833 | 3985 |
| 4834 | 4102 |
| 4835 | 4491 |
| 4836 | 4197 |
| 4837 | 4584 |
| 4838 | 4660 |
| 4839 | 5121 |
| 4840 | 4277 |
| 4841 | 4684 |
| 4842 | 4766 |
| 4843 | 5217 |
| 4844 | 4851 |
| 4845 | 5279 |
| 4846 | 5371 |
| 4847 | 5807 |
| 4848 | 4407 |
| 4849 | 4808 |
| 4850 | 4925 |
| 4851 | 5319 |
| 4852 | 4973 |
| 4853 | 5404 |
| 4854 | 5447 |
| 4855 | 5885 |
| 4856 | 5057 |
| 4857 | 5493 |
| 4858 | 5548 |
| 4859 | 5978 |
| 4860 | 5664 |
| 4861 | 6107 |
| 4862 | 6258 |
| 4863 | 6516 |
| 4864 | 1291 |

TABLE Z9-continued

| with a sequence length of 8192: | |
|---|---|
| Polarized channel sequence number | Reliability or reliability sequence number |
| 4865 | 1830 |
| 4866 | 2092 |
| 4867 | 2702 |
| 4868 | 2259 |
| 4869 | 2765 |
| 4870 | 2917 |
| 4871 | 3332 |
| 4872 | 2390 |
| 4873 | 2871 |
| 4874 | 3007 |
| 4875 | 3391 |
| 4876 | 3077 |
| 4877 | 3514 |
| 4878 | 3566 |
| 4879 | 4094 |
| 4880 | 2479 |
| 4881 | 2957 |
| 4882 | 3041 |
| 4883 | 3492 |
| 4884 | 3212 |
| 4885 | 3627 |
| 4886 | 3762 |
| 4887 | 4139 |
| 4888 | 3280 |
| 4889 | 3748 |
| 4890 | 3671 |
| 4891 | 4237 |
| 4892 | 3876 |
| 4893 | 4328 |
| 4894 | 4413 |
| 4895 | 4891 |
| 4896 | 2563 |
| 4897 | 3115 |
| 4898 | 3244 |
| 4899 | 3643 |
| 4900 | 3306 |
| 4901 | 3707 |
| 4902 | 3788 |
| 4903 | 4283 |
| 4904 | 3416 |
| 4905 | 3854 |
| 4906 | 3925 |
| 4907 | 4357 |
| 4908 | 4009 |
| 4909 | 4453 |
| 4910 | 4519 |
| 4911 | 5007 |
| 4912 | 3544 |
| 4913 | 3943 |
| 4914 | 4039 |
| 4915 | 4496 |
| 4916 | 4106 |
| 4917 | 4589 |
| 4918 | 4631 |
| 4919 | 5042 |
| 4920 | 4221 |
| 4921 | 4667 |
| 4922 | 4757 |
| 4923 | 5157 |
| 4924 | 4836 |
| 4925 | 5265 |
| 4926 | 5346 |
| 4927 | 5830 |
| 4928 | 2818 |
| 4929 | 3175 |
| 4930 | 3365 |
| 4931 | 3837 |
| 4932 | 3467 |
| 4933 | 3893 |
| 4934 | 3979 |
| 4935 | 4436 |
| 4936 | 3577 |
| 4937 | 4080 |
| 4938 | 3963 |
| 4939 | 4536 |

TABLE Z9-continued

| with a sequence length of 8192: | |
|---|---|
| Polarized channel sequence number | Reliability or reliability sequence number |
| 4940 | 4155 |
| 4941 | 4600 |
| 4942 | 4716 |
| 4943 | 5106 |
| 4944 | 3692 |
| 4945 | 4023 |
| 4946 | 4203 |
| 4947 | 4653 |
| 4948 | 4311 |
| 4949 | 4746 |
| 4950 | 4803 |
| 4951 | 5203 |
| 4952 | 4402 |
| 4953 | 4860 |
| 4954 | 4919 |
| 4955 | 5289 |
| 4956 | 4991 |
| 4957 | 5411 |
| 4958 | 5476 |
| 4959 | 5943 |
| 4960 | 3802 |
| 4961 | 4271 |
| 4962 | 4373 |
| 4963 | 4776 |
| 4964 | 4485 |
| 4965 | 4886 |
| 4966 | 4939 |
| 4967 | 5380 |
| 4968 | 4562 |
| 4969 | 4966 |
| 4970 | 5015 |
| 4971 | 5438 |
| 4972 | 5126 |
| 4973 | 5519 |
| 4974 | 5596 |
| 4975 | 6002 |
| 4976 | 4691 |
| 4977 | 5070 |
| 4978 | 5172 |
| 4979 | 5557 |
| 4980 | 5225 |
| 4981 | 5634 |
| 4982 | 5685 |
| 4983 | 6067 |
| 4984 | 5314 |
| 4985 | 5717 |
| 4986 | 5764 |
| 4987 | 6164 |
| 4988 | 5862 |
| 4989 | 6274 |
| 4990 | 6415 |
| 4991 | 6659 |
| 4992 | 2646 |
| 4993 | 3147 |
| 4994 | 3444 |
| 4995 | 3993 |
| 4996 | 3606 |
| 4997 | 4064 |
| 4998 | 4255 |
| 4999 | 4678 |
| 5000 | 3729 |
| 5001 | 4173 |
| 5002 | 4340 |
| 5003 | 4735 |
| 5004 | 4430 |
| 5005 | 4841 |
| 5006 | 4905 |
| 5007 | 5458 |
| 5008 | 3823 |
| 5009 | 4301 |
| 5010 | 4384 |
| 5011 | 4822 |
| 5012 | 4556 |
| 5013 | 4958 |
| 5014 | 5113 |

TABLE Z9-continued

| with a sequence length of 8192: | |
|---|---|
| Polarized channel sequence number | Reliability or reliability sequence number |
| 5015 | 5484 |
| 5016 | 4611 |
| 5017 | 5093 |
| 5018 | 5028 |
| 5019 | 5566 |
| 5020 | 5235 |
| 5021 | 5646 |
| 5022 | 5738 |
| 5023 | 6149 |
| 5024 | 3911 |
| 5025 | 4470 |
| 5026 | 4578 |
| 5027 | 4986 |
| 5028 | 4642 |
| 5029 | 5077 |
| 5030 | 5136 |
| 5031 | 5614 |
| 5032 | 4771 |
| 5033 | 5212 |
| 5034 | 5275 |
| 5035 | 5655 |
| 5036 | 5354 |
| 5037 | 5755 |
| 5038 | 5819 |
| 5039 | 6239 |
| 5040 | 4865 |
| 5041 | 5297 |
| 5042 | 5394 |
| 5043 | 5796 |
| 5044 | 5467 |
| 5045 | 5873 |
| 5046 | 5907 |
| 5047 | 6305 |
| 5048 | 5540 |
| 5049 | 5954 |
| 5050 | 6028 |
| 5051 | 6396 |
| 5052 | 6079 |
| 5053 | 6495 |
| 5054 | 6585 |
| 5055 | 6992 |
| 5056 | 4124 |
| 5057 | 4508 |
| 5058 | 4709 |
| 5059 | 5190 |
| 5060 | 4796 |
| 5061 | 5257 |
| 5062 | 5336 |
| 5063 | 5743 |
| 5064 | 4932 |
| 5065 | 5421 |
| 5066 | 5328 |
| 5067 | 5839 |
| 5068 | 5510 |
| 5069 | 5896 |
| 5070 | 5990 |
| 5071 | 6340 |
| 5072 | 5048 |
| 5073 | 5388 |
| 5074 | 5528 |
| 5075 | 5931 |
| 5076 | 5626 |
| 5077 | 6017 |
| 5078 | 6053 |
| 5079 | 6452 |
| 5080 | 5705 |
| 5081 | 6122 |
| 5082 | 6180 |
| 5083 | 6536 |
| 5084 | 6223 |
| 5085 | 6634 |
| 5086 | 6713 |
| 5087 | 7088 |
| 5088 | 5167 |
| 5089 | 5575 |

TABLE Z9-continued

| with a sequence length of 8192: | |
|---|---|
| Polarized channel sequence number | Reliability or reliability sequence number |
| 5090 | 5697 |
| 5091 | 6040 |
| 5092 | 5775 |
| 5093 | 6137 |
| 5094 | 6195 |
| 5095 | 6606 |
| 5096 | 5850 |
| 5097 | 6211 |
| 5098 | 6289 |
| 5099 | 6684 |
| 5100 | 6356 |
| 5101 | 6743 |
| 5102 | 6803 |
| 5103 | 7148 |
| 5104 | 5967 |
| 5105 | 6325 |
| 5106 | 6432 |
| 5107 | 6774 |
| 5108 | 6472 |
| 5109 | 6839 |
| 5110 | 6874 |
| 5111 | 7209 |
| 5112 | 6561 |
| 5113 | 6909 |
| 5114 | 6950 |
| 5115 | 7284 |
| 5116 | 7039 |
| 5117 | 7371 |
| 5118 | 7488 |
| 5119 | 7655 |
| 5120 | 296 |
| 5121 | 691 |
| 5122 | 919 |
| 5123 | 1589 |
| 5124 | 1065 |
| 5125 | 1640 |
| 5126 | 1770 |
| 5127 | 2165 |
| 5128 | 1171 |
| 5129 | 1726 |
| 5130 | 1842 |
| 5131 | 2211 |
| 5132 | 1911 |
| 5133 | 2337 |
| 5134 | 2377 |
| 5135 | 2903 |
| 5136 | 1268 |
| 5137 | 1804 |
| 5138 | 1879 |
| 5139 | 2317 |
| 5140 | 2032 |
| 5141 | 2454 |
| 5142 | 2572 |
| 5143 | 2959 |
| 5144 | 2089 |
| 5145 | 2553 |
| 5146 | 2485 |
| 5147 | 3025 |
| 5148 | 2693 |
| 5149 | 3110 |
| 5150 | 3190 |
| 5151 | 3662 |
| 5152 | 1353 |
| 5153 | 1943 |
| 5154 | 2059 |
| 5155 | 2473 |
| 5156 | 2136 |
| 5157 | 2523 |
| 5158 | 2620 |
| 5159 | 3069 |
| 5160 | 2235 |
| 5161 | 2676 |
| 5162 | 2745 |
| 5163 | 3132 |
| 5164 | 2824 |

TABLE Z9-continued

| with a sequence length of 8192: | |
|---|---|
| Polarized channel sequence number | Reliability or reliability sequence number |
| 5165 | 3229 |
| 5166 | 3294 |
| 5167 | 3771 |
| 5168 | 2360 |
| 5169 | 2759 |
| 5170 | 2862 |
| 5171 | 3273 |
| 5172 | 2911 |
| 5173 | 3361 |
| 5174 | 3405 |
| 5175 | 3813 |
| 5176 | 3002 |
| 5177 | 3446 |
| 5178 | 3526 |
| 5179 | 3913 |
| 5180 | 3603 |
| 5181 | 4031 |
| 5182 | 4116 |
| 5183 | 4635 |
| 5184 | 1691 |
| 5185 | 2006 |
| 5186 | 2190 |
| 5187 | 2661 |
| 5188 | 2300 |
| 5189 | 2705 |
| 5190 | 2799 |
| 5191 | 3219 |
| 5192 | 2396 |
| 5193 | 2890 |
| 5194 | 2773 |
| 5195 | 3320 |
| 5196 | 2973 |
| 5197 | 3370 |
| 5198 | 3485 |
| 5199 | 3864 |
| 5200 | 2504 |
| 5201 | 2851 |
| 5202 | 2994 |
| 5203 | 3423 |
| 5204 | 3102 |
| 5205 | 3517 |
| 5206 | 3581 |
| 5207 | 3971 |
| 5208 | 3180 |
| 5209 | 3625 |
| 5210 | 3682 |
| 5211 | 4055 |
| 5212 | 3760 |
| 5213 | 4187 |
| 5214 | 4251 |
| 5215 | 4767 |
| 5216 | 2632 |
| 5217 | 3046 |
| 5218 | 3160 |
| 5219 | 3557 |
| 5220 | 3265 |
| 5221 | 3653 |
| 5222 | 3709 |
| 5223 | 4153 |
| 5224 | 3339 |
| 5225 | 3737 |
| 5226 | 3785 |
| 5227 | 4211 |
| 5228 | 3889 |
| 5229 | 4297 |
| 5230 | 4388 |
| 5231 | 4837 |
| 5232 | 3462 |
| 5233 | 3840 |
| 5234 | 3941 |
| 5235 | 4338 |
| 5236 | 3995 |
| 5237 | 4438 |
| 5238 | 4478 |
| 5239 | 4922 |

TABLE Z9-continued

| with a sequence length of 8192: | |
|---|---|
| Polarized channel sequence number | Reliability or reliability sequence number |
| 5240 | 4076 |
| 5241 | 4528 |
| 5242 | 4582 |
| 5243 | 5017 |
| 5244 | 4682 |
| 5245 | 5138 |
| 5246 | 5300 |
| 5247 | 5569 |
| 5248 | 1418 |
| 5249 | 1979 |
| 5250 | 2256 |
| 5251 | 2813 |
| 5252 | 2435 |
| 5253 | 2876 |
| 5254 | 3038 |
| 5255 | 3456 |
| 5256 | 2538 |
| 5257 | 2981 |
| 5258 | 3120 |
| 5259 | 3503 |
| 5260 | 3207 |
| 5261 | 3616 |
| 5262 | 3675 |
| 5263 | 4229 |
| 5264 | 2649 |
| 5265 | 3089 |
| 5266 | 3172 |
| 5267 | 3586 |
| 5268 | 3330 |
| 5269 | 3733 |
| 5270 | 3885 |
| 5271 | 4269 |
| 5272 | 3389 |
| 5273 | 3860 |
| 5274 | 3794 |
| 5275 | 4353 |
| 5276 | 4001 |
| 5277 | 4444 |
| 5278 | 4539 |
| 5279 | 5003 |
| 5280 | 2719 |
| 5281 | 3246 |
| 5282 | 3356 |
| 5283 | 3745 |
| 5284 | 3414 |
| 5285 | 3846 |
| 5286 | 3909 |
| 5287 | 4405 |
| 5288 | 3535 |
| 5289 | 3977 |
| 5290 | 4037 |
| 5291 | 4461 |
| 5292 | 4135 |
| 5293 | 4571 |
| 5294 | 4620 |
| 5295 | 5118 |
| 5296 | 3640 |
| 5297 | 4060 |
| 5298 | 4175 |
| 5299 | 4604 |
| 5300 | 4245 |
| 5301 | 4707 |
| 5302 | 4737 |
| 5303 | 5183 |
| 5304 | 4320 |
| 5305 | 4785 |
| 5306 | 4869 |
| 5307 | 5271 |
| 5308 | 4941 |
| 5309 | 5397 |
| 5310 | 5481 |
| 5311 | 5940 |
| 5312 | 2946 |
| 5313 | 3282 |
| 5314 | 3481 |

TABLE Z9-continued

| with a sequence length of 8192: | |
|---|---|
| Polarized channel sequence number | Reliability or reliability sequence number |
| 5315 | 3951 |
| 5316 | 3564 |
| 5317 | 4019 |
| 5318 | 4104 |
| 5319 | 4552 |
| 5320 | 3703 |
| 5321 | 4201 |
| 5322 | 4090 |
| 5323 | 4651 |
| 5324 | 4281 |
| 5325 | 4723 |
| 5326 | 4813 |
| 5327 | 5223 |
| 5328 | 3819 |
| 5329 | 4159 |
| 5330 | 4314 |
| 5331 | 4755 |
| 5332 | 4421 |
| 5333 | 4855 |
| 5334 | 4908 |
| 5335 | 5349 |
| 5336 | 4511 |
| 5337 | 4961 |
| 5338 | 5032 |
| 5339 | 5431 |
| 5340 | 5096 |
| 5341 | 5537 |
| 5342 | 5629 |
| 5343 | 6049 |
| 5344 | 3933 |
| 5345 | 4371 |
| 5346 | 4495 |
| 5347 | 4882 |
| 5348 | 4587 |
| 5349 | 4978 |
| 5350 | 5058 |
| 5351 | 5516 |
| 5352 | 4666 |
| 5353 | 5082 |
| 5354 | 5160 |
| 5355 | 5602 |
| 5356 | 5251 |
| 5357 | 5661 |
| 5358 | 5739 |
| 5359 | 6119 |
| 5360 | 4799 |
| 5361 | 5209 |
| 5362 | 5322 |
| 5363 | 5700 |
| 5364 | 5374 |
| 5365 | 5773 |
| 5366 | 5810 |
| 5367 | 6192 |
| 5368 | 5455 |
| 5369 | 5853 |
| 5370 | 5893 |
| 5371 | 6270 |
| 5372 | 5999 |
| 5373 | 6386 |
| 5374 | 6522 |
| 5375 | 6739 |
| 5376 | 1480 |
| 5377 | 2114 |
| 5378 | 2415 |
| 5379 | 3079 |
| 5380 | 2602 |
| 5381 | 3142 |
| 5382 | 3304 |
| 5383 | 3718 |
| 5384 | 2734 |
| 5385 | 3256 |
| 5386 | 3396 |
| 5387 | 3779 |
| 5388 | 3471 |
| 5389 | 3903 |

TABLE Z9-continued

| with a sequence length of 8192: | |
|---|---|
| Polarized channel sequence number | Reliability or reliability sequence number |
| 5390 | 3947 |
| 5391 | 4483 |
| 5392 | 2838 |
| 5393 | 3346 |
| 5394 | 3433 |
| 5395 | 3879 |
| 5396 | 3608 |
| 5397 | 4007 |
| 5398 | 4141 |
| 5399 | 4534 |
| 5400 | 3669 |
| 5401 | 4130 |
| 5402 | 4051 |
| 5403 | 4629 |
| 5404 | 4257 |
| 5405 | 4712 |
| 5406 | 4804 |
| 5407 | 5291 |
| 5408 | 2925 |
| 5409 | 3512 |
| 5410 | 3632 |
| 5411 | 4025 |
| 5412 | 3697 |
| 5413 | 4086 |
| 5414 | 4163 |
| 5415 | 4671 |
| 5416 | 3806 |
| 5417 | 4235 |
| 5418 | 4309 |
| 5419 | 4743 |
| 5420 | 4400 |
| 5421 | 4844 |
| 5422 | 4917 |
| 5423 | 5407 |
| 5424 | 3921 |
| 5425 | 4332 |
| 5426 | 4426 |
| 5427 | 4895 |
| 5428 | 4500 |
| 5429 | 4983 |
| 5430 | 5025 |
| 5431 | 5441 |
| 5432 | 4615 |
| 5433 | 5065 |
| 5434 | 5152 |
| 5435 | 5543 |
| 5436 | 5231 |
| 5437 | 5643 |
| 5438 | 5723 |
| 5439 | 6139 |
| 5440 | 3200 |
| 5441 | 3572 |
| 5442 | 3752 |
| 5443 | 4223 |
| 5444 | 3852 |
| 5445 | 4275 |
| 5446 | 4359 |
| 5447 | 4831 |
| 5448 | 3965 |
| 5449 | 4466 |
| 5450 | 4342 |
| 5451 | 4930 |
| 5452 | 4550 |
| 5453 | 4995 |
| 5454 | 5110 |
| 5455 | 5499 |
| 5456 | 4072 |
| 5457 | 4415 |
| 5458 | 4598 |
| 5459 | 5050 |
| 5460 | 4698 |
| 5461 | 5141 |
| 5462 | 5201 |
| 5463 | 5584 |
| 5464 | 4789 |

TABLE Z9-continued with a sequence length of 8192:

| Polarized channel sequence number | Reliability or reliability sequence number |
|---|---|
| 5465 | 5254 |
| 5466 | 5311 |
| 5467 | 5673 |
| 5468 | 5391 |
| 5469 | 5781 |
| 5470 | 5833 |
| 5471 | 6242 |
| 5472 | 4181 |
| 5473 | 4657 |
| 5474 | 4760 |
| 5475 | 5178 |
| 5476 | 4877 |
| 5477 | 5283 |
| 5478 | 5339 |
| 5479 | 5746 |
| 5480 | 4956 |
| 5481 | 5366 |
| 5482 | 5414 |
| 5483 | 5802 |
| 5484 | 5525 |
| 5485 | 5870 |
| 5486 | 5934 |
| 5487 | 6299 |
| 5488 | 5087 |
| 5489 | 5464 |
| 5490 | 5560 |
| 5491 | 5905 |
| 5492 | 5611 |
| 5493 | 5972 |
| 5494 | 6007 |
| 5495 | 6360 |
| 5496 | 5691 |
| 5497 | 6038 |
| 5498 | 6089 |
| 5499 | 6439 |
| 5500 | 6173 |
| 5501 | 6540 |
| 5502 | 6648 |
| 5503 | 6865 |
| 5504 | 3015 |
| 5505 | 3541 |
| 5506 | 3827 |
| 5507 | 4382 |
| 5508 | 3981 |
| 5509 | 4455 |
| 5510 | 4640 |
| 5511 | 5073 |
| 5512 | 4110 |
| 5513 | 4565 |
| 5514 | 4728 |
| 5515 | 5129 |
| 5516 | 4824 |
| 5517 | 5243 |
| 5518 | 5308 |
| 5519 | 5816 |
| 5520 | 4207 |
| 5521 | 4687 |
| 5522 | 4774 |
| 5523 | 5214 |
| 5524 | 4948 |
| 5525 | 5357 |
| 5526 | 5508 |
| 5527 | 5845 |
| 5528 | 5008 |
| 5529 | 5490 |
| 5530 | 5424 |
| 5531 | 5913 |
| 5532 | 5620 |
| 5533 | 5981 |
| 5534 | 6058 |
| 5535 | 6426 |
| 5536 | 4291 |
| 5537 | 4863 |
| 5538 | 4970 |
| 5539 | 5383 |
| 5540 | 5040 |
| 5541 | 5473 |
| 5542 | 5534 |
| 5543 | 5951 |
| 5544 | 5168 |
| 5545 | 5593 |
| 5546 | 5652 |
| 5547 | 5986 |
| 5548 | 5732 |
| 5549 | 6076 |
| 5550 | 6131 |
| 5551 | 6506 |
| 5552 | 5263 |
| 5553 | 5682 |
| 5554 | 5767 |
| 5555 | 6109 |
| 5556 | 5825 |
| 5557 | 6183 |
| 5558 | 6217 |
| 5559 | 6567 |
| 5560 | 5887 |
| 5561 | 6251 |
| 5562 | 6321 |
| 5563 | 6630 |
| 5564 | 6369 |
| 5565 | 6720 |
| 5566 | 6799 |
| 5567 | 7157 |
| 5568 | 4517 |
| 5569 | 4903 |
| 5570 | 5105 |
| 5571 | 5578 |
| 5572 | 5191 |
| 5573 | 5637 |
| 5574 | 5714 |
| 5575 | 6071 |
| 5576 | 5332 |
| 5577 | 5790 |
| 5578 | 5708 |
| 5579 | 6152 |
| 5580 | 5859 |
| 5581 | 6204 |
| 5582 | 6283 |
| 5583 | 6599 |
| 5584 | 5450 |
| 5585 | 5758 |
| 5586 | 5879 |
| 5587 | 6230 |
| 5588 | 5961 |
| 5589 | 6311 |
| 5590 | 6347 |
| 5591 | 6688 |
| 5592 | 6025 |
| 5593 | 6399 |
| 5594 | 6449 |
| 5595 | 6758 |
| 5596 | 6492 |
| 5597 | 6842 |
| 5598 | 6914 |
| 5599 | 7238 |
| 5600 | 5551 |
| 5601 | 5926 |
| 5602 | 6020 |
| 5603 | 6334 |
| 5604 | 6101 |
| 5605 | 6409 |
| 5606 | 6466 |
| 5607 | 6823 |
| 5608 | 6161 |
| 5609 | 6479 |
| 5610 | 6553 |
| 5611 | 6890 |
| 5612 | 6616 |
| 5613 | 6938 |
| 5614 | 6988 |

TABLE Z9-continued with a sequence length of 8192:

| Polarized channel sequence number | Reliability or reliability sequence number |
|---|---|
| 5615 | 7290 |
| 5616 | 6261 |
| 5617 | 6581 |
| 5618 | 6667 |
| 5619 | 6967 |
| 5620 | 6703 |
| 5621 | 7022 |
| 5622 | 7053 |
| 5623 | 7337 |
| 5624 | 6781 |
| 5625 | 7083 |
| 5626 | 7120 |
| 5627 | 7404 |
| 5628 | 7194 |
| 5629 | 7475 |
| 5630 | 7574 |
| 5631 | 7720 |
| 5632 | 1540 |
| 5633 | 2276 |
| 5634 | 2587 |
| 5635 | 3379 |
| 5636 | 2785 |
| 5637 | 3437 |
| 5638 | 3595 |
| 5639 | 4041 |
| 5640 | 2938 |
| 5641 | 3548 |
| 5642 | 3690 |
| 5643 | 4098 |
| 5644 | 3764 |
| 5645 | 4217 |
| 5646 | 4263 |
| 5647 | 4832 |
| 5648 | 3059 |
| 5649 | 3645 |
| 5650 | 3724 |
| 5651 | 4195 |
| 5652 | 3897 |
| 5653 | 4348 |
| 5654 | 4489 |
| 5655 | 4888 |
| 5656 | 3957 |
| 5657 | 4472 |
| 5658 | 4394 |
| 5659 | 4964 |
| 5660 | 4609 |
| 5661 | 5045 |
| 5662 | 5124 |
| 5663 | 5590 |
| 5664 | 3150 |
| 5665 | 3798 |
| 5666 | 3927 |
| 5667 | 4365 |
| 5668 | 4015 |
| 5669 | 4432 |
| 5670 | 4523 |
| 5671 | 4998 |
| 5672 | 4120 |
| 5673 | 4593 |
| 5674 | 4676 |
| 5675 | 5068 |
| 5676 | 4748 |
| 5677 | 5164 |
| 5678 | 5228 |
| 5679 | 5694 |
| 5680 | 4241 |
| 5681 | 4693 |
| 5682 | 4794 |
| 5683 | 5206 |
| 5684 | 4850 |
| 5685 | 5294 |
| 5686 | 5335 |
| 5687 | 5735 |
| 5688 | 4936 |
| 5689 | 5368 |

TABLE Z9-continued with a sequence length of 8192:

| Polarized channel sequence number | Reliability or reliability sequence number |
|---|---|
| 5690 | 5451 |
| 5691 | 5827 |
| 5692 | 5522 |
| 5693 | 5929 |
| 5694 | 6004 |
| 5695 | 6393 |
| 5696 | 3494 |
| 5697 | 3870 |
| 5698 | 4066 |
| 5699 | 4576 |
| 5700 | 4169 |
| 5701 | 4624 |
| 5702 | 4718 |
| 5703 | 5155 |
| 5704 | 4287 |
| 5705 | 4818 |
| 5706 | 4702 |
| 5707 | 5246 |
| 5708 | 4896 |
| 5709 | 5303 |
| 5710 | 5417 |
| 5711 | 5784 |
| 5712 | 4409 |
| 5713 | 4780 |
| 5714 | 4927 |
| 5715 | 5350 |
| 5716 | 5037 |
| 5717 | 5444 |
| 5718 | 5505 |
| 5719 | 5876 |
| 5720 | 5116 |
| 5721 | 5554 |
| 5722 | 5617 |
| 5723 | 5948 |
| 5724 | 5688 |
| 5725 | 6061 |
| 5726 | 6112 |
| 5727 | 6489 |
| 5728 | 4545 |
| 5729 | 4990 |
| 5730 | 5090 |
| 5731 | 5478 |
| 5732 | 5198 |
| 5733 | 5581 |
| 5734 | 5640 |
| 5735 | 6031 |
| 5736 | 5268 |
| 5737 | 5667 |
| 5738 | 5711 |
| 5739 | 6082 |
| 5740 | 5804 |
| 5741 | 6146 |
| 5742 | 6214 |
| 5743 | 6543 |
| 5744 | 5386 |
| 5745 | 5752 |
| 5746 | 5848 |
| 5747 | 6177 |
| 5748 | 5899 |
| 5749 | 6249 |
| 5750 | 6279 |
| 5751 | 6603 |
| 5752 | 5969 |
| 5753 | 6315 |
| 5754 | 6354 |
| 5755 | 6669 |
| 5756 | 6428 |
| 5757 | 6750 |
| 5758 | 6858 |
| 5759 | 7043 |
| 5760 | 3239 |
| 5761 | 3831 |
| 5762 | 4147 |
| 5763 | 4732 |
| 5764 | 4326 |

TABLE Z9-continued with a sequence length of 8192:

| Polarized channel sequence number | Reliability or reliability sequence number |
|---|---|
| 5765 | 4810 |
| 5766 | 4975 |
| 5767 | 5377 |
| 5768 | 4449 |
| 5769 | 4910 |
| 5770 | 5053 |
| 5771 | 5427 |
| 5772 | 5146 |
| 5773 | 5546 |
| 5774 | 5608 |
| 5775 | 6092 |
| 5776 | 4560 |
| 5777 | 5023 |
| 5778 | 5101 |
| 5779 | 5513 |
| 5780 | 5260 |
| 5781 | 5658 |
| 5782 | 5799 |
| 5783 | 6124 |
| 5784 | 5317 |
| 5785 | 5778 |
| 5786 | 5720 |
| 5787 | 6190 |
| 5788 | 5902 |
| 5789 | 6254 |
| 5790 | 6327 |
| 5791 | 6655 |
| 5792 | 4646 |
| 5793 | 5175 |
| 5794 | 5286 |
| 5795 | 5670 |
| 5796 | 5343 |
| 5797 | 5761 |
| 5798 | 5822 |
| 5799 | 6226 |
| 5800 | 5461 |
| 5801 | 5882 |
| 5802 | 5937 |
| 5803 | 6267 |
| 5804 | 6014 |
| 5805 | 6350 |
| 5806 | 6382 |
| 5807 | 6735 |
| 5808 | 5572 |
| 5809 | 5957 |
| 5810 | 6046 |
| 5811 | 6373 |
| 5812 | 6104 |
| 5813 | 6445 |
| 5814 | 6468 |
| 5815 | 6785 |
| 5816 | 6168 |
| 5817 | 6502 |
| 5818 | 6563 |
| 5819 | 6846 |
| 5820 | 6613 |
| 5821 | 6926 |
| 5822 | 6980 |
| 5823 | 7300 |
| 5824 | 4874 |
| 5825 | 5220 |
| 5826 | 5408 |
| 5827 | 5865 |
| 5828 | 5487 |
| 5829 | 5916 |
| 5830 | 5993 |
| 5831 | 6338 |
| 5832 | 5631 |
| 5833 | 6064 |
| 5834 | 5983 |
| 5835 | 6406 |
| 5836 | 6134 |
| 5837 | 6458 |
| 5838 | 6526 |
| 5839 | 6812 |
| 5840 | 5741 |
| 5841 | 6035 |
| 5842 | 6158 |
| 5843 | 6483 |
| 5844 | 6235 |
| 5845 | 6550 |
| 5846 | 6591 |
| 5847 | 6893 |
| 5848 | 6302 |
| 5849 | 6627 |
| 5850 | 6677 |
| 5851 | 6946 |
| 5852 | 6724 |
| 5853 | 7018 |
| 5854 | 7079 |
| 5855 | 7365 |
| 5856 | 5842 |
| 5857 | 6202 |
| 5858 | 6293 |
| 5859 | 6575 |
| 5860 | 6363 |
| 5861 | 6642 |
| 5862 | 6696 |
| 5863 | 7005 |
| 5864 | 6419 |
| 5865 | 6710 |
| 5866 | 6766 |
| 5867 | 7066 |
| 5868 | 6826 |
| 5869 | 7106 |
| 5870 | 7162 |
| 5871 | 7416 |
| 5872 | 6512 |
| 5873 | 6796 |
| 5874 | 6878 |
| 5875 | 7129 |
| 5876 | 6905 |
| 5877 | 7180 |
| 5878 | 7205 |
| 5879 | 7457 |
| 5880 | 6963 |
| 5881 | 7234 |
| 5882 | 7263 |
| 5883 | 7514 |
| 5884 | 7332 |
| 5885 | 7580 |
| 5886 | 7662 |
| 5887 | 7782 |
| 5888 | 3311 |
| 5889 | 3989 |
| 5890 | 4303 |
| 5891 | 5012 |
| 5892 | 4506 |
| 5893 | 5078 |
| 5894 | 5238 |
| 5895 | 5649 |
| 5896 | 4662 |
| 5897 | 5186 |
| 5898 | 5325 |
| 5899 | 5702 |
| 5900 | 5400 |
| 5901 | 5813 |
| 5902 | 5856 |
| 5903 | 6286 |
| 5904 | 4762 |
| 5905 | 5276 |
| 5906 | 5360 |
| 5907 | 5793 |
| 5908 | 5531 |
| 5909 | 5910 |
| 5910 | 6022 |
| 5911 | 6318 |
| 5912 | 5599 |
| 5913 | 6010 |
| 5914 | 5946 |

TABLE Z9-continued with a sequence length of 8192:

| Polarized channel sequence number | Reliability or reliability sequence number |
|---|---|
| 5915 | 6389 |
| 5916 | 6116 |
| 5917 | 6455 |
| 5918 | 6520 |
| 5919 | 6855 |
| 5920 | 4858 |
| 5921 | 5434 |
| 5922 | 5563 |
| 5923 | 5923 |
| 5924 | 5623 |
| 5925 | 5975 |
| 5926 | 6043 |
| 5927 | 6422 |
| 5928 | 5729 |
| 5929 | 6097 |
| 5930 | 6156 |
| 5931 | 6475 |
| 5932 | 6221 |
| 5933 | 6547 |
| 5934 | 6595 |
| 5935 | 6930 |
| 5936 | 5836 |
| 5937 | 6171 |
| 5938 | 6245 |
| 5939 | 6577 |
| 5940 | 6295 |
| 5941 | 6644 |
| 5942 | 6673 |
| 5943 | 6955 |
| 5944 | 6380 |
| 5945 | 6699 |
| 5946 | 6761 |
| 5947 | 7026 |
| 5948 | 6815 |
| 5949 | 7096 |
| 5950 | 7143 |
| 5951 | 7427 |
| 5952 | 5133 |
| 5953 | 5496 |
| 5954 | 5679 |
| 5955 | 6085 |
| 5956 | 5770 |
| 5957 | 6127 |
| 5958 | 6199 |
| 5959 | 6533 |
| 5960 | 5868 |
| 5961 | 6277 |
| 5962 | 6186 |
| 5963 | 6609 |
| 5964 | 6331 |
| 5965 | 6652 |
| 5966 | 6732 |
| 5967 | 6997 |
| 5968 | 5964 |
| 5969 | 6233 |
| 5970 | 6367 |
| 5971 | 6692 |
| 5972 | 6442 |
| 5973 | 6754 |
| 5974 | 6792 |
| 5975 | 7057 |
| 5976 | 6510 |
| 5977 | 6830 |
| 5978 | 6869 |
| 5979 | 7110 |
| 5980 | 6922 |
| 5981 | 7185 |
| 5982 | 7224 |
| 5983 | 7494 |
| 5984 | 6056 |
| 5985 | 6413 |
| 5986 | 6485 |
| 5987 | 6777 |
| 5988 | 6571 |
| 5989 | 6850 |

TABLE Z9-continued with a sequence length of 8192:

| Polarized channel sequence number | Reliability or reliability sequence number |
|---|---|
| 5990 | 6886 |
| 5991 | 7166 |
| 5992 | 6623 |
| 5993 | 6902 |
| 5994 | 6934 |
| 5995 | 7199 |
| 5996 | 7009 |
| 5997 | 7248 |
| 5998 | 7294 |
| 5999 | 7526 |
| 6000 | 6717 |
| 6001 | 6972 |
| 6002 | 7035 |
| 6003 | 7269 |
| 6004 | 7070 |
| 6005 | 7316 |
| 6006 | 7342 |
| 6007 | 7559 |
| 6008 | 7124 |
| 6009 | 7359 |
| 6010 | 7392 |
| 6011 | 7609 |
| 6012 | 7445 |
| 6013 | 7670 |
| 6014 | 7737 |
| 6015 | 7844 |
| 6016 | 4949 |
| 6017 | 5470 |
| 6018 | 5749 |
| 6019 | 6207 |
| 6020 | 5890 |
| 6021 | 6263 |
| 6022 | 6402 |
| 6023 | 6707 |
| 6024 | 5996 |
| 6025 | 6343 |
| 6026 | 6462 |
| 6027 | 6746 |
| 6028 | 6530 |
| 6029 | 6819 |
| 6030 | 6862 |
| 6031 | 7214 |
| 6032 | 6074 |
| 6033 | 6435 |
| 6034 | 6499 |
| 6035 | 6807 |
| 6036 | 6620 |
| 6037 | 6897 |
| 6038 | 7000 |
| 6039 | 7229 |
| 6040 | 6663 |
| 6041 | 6984 |
| 6042 | 6942 |
| 6043 | 7274 |
| 6044 | 7075 |
| 6045 | 7321 |
| 6046 | 7375 |
| 6047 | 7602 |
| 6048 | 6143 |
| 6049 | 6557 |
| 6050 | 6638 |
| 6051 | 6918 |
| 6052 | 6681 |
| 6053 | 6975 |
| 6054 | 7013 |
| 6055 | 7305 |
| 6056 | 6770 |
| 6057 | 7061 |
| 6058 | 7101 |
| 6059 | 7326 |
| 6060 | 7152 |
| 6061 | 7386 |
| 6062 | 7421 |
| 6063 | 7646 |
| 6064 | 6835 |

TABLE Z9-continued

| with a sequence length of 8192: | |
|---|---|
| Polarized channel sequence number | Reliability or reliability sequence number |
| 6065 | 7115 |
| 6066 | 7176 |
| 6067 | 7410 |
| 6068 | 7219 |
| 6069 | 7452 |
| 6070 | 7469 |
| 6071 | 7686 |
| 6072 | 7259 |
| 6073 | 7501 |
| 6074 | 7539 |
| 6075 | 7728 |
| 6076 | 7567 |
| 6077 | 7773 |
| 6078 | 7812 |
| 6079 | 7971 |
| 6080 | 6309 |
| 6081 | 6589 |
| 6082 | 6728 |
| 6083 | 7048 |
| 6084 | 6788 |
| 6085 | 7093 |
| 6086 | 7138 |
| 6087 | 7381 |
| 6088 | 6881 |
| 6089 | 7190 |
| 6090 | 7134 |
| 6091 | 7434 |
| 6092 | 7244 |
| 6093 | 7463 |
| 6094 | 7519 |
| 6095 | 7702 |
| 6096 | 6958 |
| 6097 | 7171 |
| 6098 | 7253 |
| 6099 | 7482 |
| 6100 | 7310 |
| 6101 | 7533 |
| 6102 | 7553 |
| 6103 | 7754 |
| 6104 | 7354 |
| 6105 | 7588 |
| 6106 | 7616 |
| 6107 | 7793 |
| 6108 | 7638 |
| 6109 | 7833 |
| 6110 | 7866 |
| 6111 | 8003 |
| 6112 | 7030 |
| 6113 | 7279 |
| 6114 | 7348 |
| 6115 | 7546 |
| 6116 | 7398 |
| 6117 | 7594 |
| 6118 | 7624 |
| 6119 | 7822 |
| 6120 | 7439 |
| 6121 | 7632 |
| 6122 | 7677 |
| 6123 | 7854 |
| 6124 | 7711 |
| 6125 | 7878 |
| 6126 | 7902 |
| 6127 | 8021 |
| 6128 | 7507 |
| 6129 | 7694 |
| 6130 | 7745 |
| 6131 | 7889 |
| 6132 | 7764 |
| 6133 | 7914 |
| 6134 | 7928 |
| 6135 | 8040 |
| 6136 | 7802 |
| 6137 | 7942 |
| 6138 | 7955 |
| 6139 | 8061 |

TABLE Z9-continued

| with a sequence length of 8192: | |
|---|---|
| Polarized channel sequence number | Reliability or reliability sequence number |
| 6140 | 7987 |
| 6141 | 8084 |
| 6142 | 8111 |
| 6143 | 8145 |
| 6144 | 315 |
| 6145 | 749 |
| 6146 | 1016 |
| 6147 | 1867 |
| 6148 | 1189 |
| 6149 | 1923 |
| 6150 | 2063 |
| 6151 | 2495 |
| 6152 | 1325 |
| 6153 | 2017 |
| 6154 | 2143 |
| 6155 | 2544 |
| 6156 | 2218 |
| 6157 | 2685 |
| 6158 | 2728 |
| 6159 | 3313 |
| 6160 | 1434 |
| 6161 | 2103 |
| 6162 | 2183 |
| 6163 | 2664 |
| 6164 | 2350 |
| 6165 | 2827 |
| 6166 | 2954 |
| 6167 | 3375 |
| 6168 | 2412 |
| 6169 | 2935 |
| 6170 | 2865 |
| 6171 | 3453 |
| 6172 | 3082 |
| 6173 | 3539 |
| 6174 | 3630 |
| 6175 | 4128 |
| 6176 | 1526 |
| 6177 | 2252 |
| 6178 | 2383 |
| 6179 | 2846 |
| 6180 | 2466 |
| 6181 | 2901 |
| 6182 | 3004 |
| 6183 | 3496 |
| 6184 | 2569 |
| 6185 | 3066 |
| 6186 | 3140 |
| 6187 | 3559 |
| 6188 | 3236 |
| 6189 | 3666 |
| 6190 | 3739 |
| 6191 | 4253 |
| 6192 | 2708 |
| 6193 | 3155 |
| 6194 | 3275 |
| 6195 | 3714 |
| 6196 | 3325 |
| 6197 | 3808 |
| 6198 | 3858 |
| 6199 | 4293 |
| 6200 | 3430 |
| 6201 | 3899 |
| 6202 | 3983 |
| 6203 | 4404 |
| 6204 | 4062 |
| 6205 | 4532 |
| 6206 | 4618 |
| 6207 | 5111 |
| 6208 | 1971 |
| 6209 | 2320 |
| 6210 | 2520 |
| 6211 | 3051 |
| 6212 | 2641 |
| 6213 | 3097 |
| 6214 | 3209 |

TABLE Z9-continued

| with a sequence length of 8192: | |
|---|---|
| Polarized channel sequence number | Reliability or reliability sequence number |
| 6215 | 3658 |
| 6216 | 2771 |
| 6217 | 3301 |
| 6218 | 3182 |
| 6219 | 3767 |
| 6220 | 3386 |
| 6221 | 3817 |
| 6222 | 3945 |
| 6223 | 4350 |
| 6224 | 2884 |
| 6225 | 3263 |
| 6226 | 3421 |
| 6227 | 3874 |
| 6228 | 3528 |
| 6229 | 3975 |
| 6230 | 4043 |
| 6231 | 4468 |
| 6232 | 3619 |
| 6233 | 4084 |
| 6234 | 4151 |
| 6235 | 4558 |
| 6236 | 4233 |
| 6237 | 4689 |
| 6238 | 4753 |
| 6239 | 5233 |
| 6240 | 3020 |
| 6241 | 3476 |
| 6242 | 3599 |
| 6243 | 4013 |
| 6244 | 3705 |
| 6245 | 4122 |
| 6246 | 4185 |
| 6247 | 4655 |
| 6248 | 3783 |
| 6249 | 4213 |
| 6250 | 4267 |
| 6251 | 4714 |
| 6252 | 4380 |
| 6253 | 4797 |
| 6254 | 4879 |
| 6255 | 5298 |
| 6256 | 3915 |
| 6257 | 4324 |
| 6258 | 4434 |
| 6259 | 4839 |
| 6260 | 4493 |
| 6261 | 4929 |
| 6262 | 4963 |
| 6263 | 5375 |
| 6264 | 4580 |
| 6265 | 5010 |
| 6266 | 5063 |
| 6267 | 5462 |
| 6268 | 5154 |
| 6269 | 5570 |
| 6270 | 5716 |
| 6271 | 5971 |
| 6272 | 1608 |
| 6273 | 2287 |
| 6274 | 2593 |
| 6275 | 3224 |
| 6276 | 2810 |
| 6277 | 3287 |
| 6278 | 3465 |
| 6279 | 3907 |
| 6280 | 2919 |
| 6281 | 3398 |
| 6282 | 3550 |
| 6283 | 3961 |
| 6284 | 3649 |
| 6285 | 4078 |
| 6286 | 4143 |
| 6287 | 4730 |
| 6288 | 3035 |
| 6289 | 3519 |

TABLE Z9-continued

| with a sequence length of 8192: | |
|---|---|
| Polarized channel sequence number | Reliability or reliability sequence number |
| 6290 | 3610 |
| 6291 | 4049 |
| 6292 | 3775 |
| 6293 | 4205 |
| 6294 | 4375 |
| 6295 | 4773 |
| 6296 | 3833 |
| 6297 | 4344 |
| 6298 | 4273 |
| 6299 | 4853 |
| 6300 | 4498 |
| 6301 | 4934 |
| 6302 | 5022 |
| 6303 | 5448 |
| 6304 | 3112 |
| 6305 | 3686 |
| 6306 | 3800 |
| 6307 | 4219 |
| 6308 | 3866 |
| 6309 | 4330 |
| 6310 | 4398 |
| 6311 | 4898 |
| 6312 | 3991 |
| 6313 | 4476 |
| 6314 | 4537 |
| 6315 | 4951 |
| 6316 | 4638 |
| 6317 | 5052 |
| 6318 | 5095 |
| 6319 | 5555 |
| 6320 | 4108 |
| 6321 | 4563 |
| 6322 | 4680 |
| 6323 | 5083 |
| 6324 | 4750 |
| 6325 | 5177 |
| 6326 | 5207 |
| 6327 | 5612 |
| 6328 | 4820 |
| 6329 | 5247 |
| 6330 | 5327 |
| 6331 | 5692 |
| 6332 | 5393 |
| 6333 | 5809 |
| 6334 | 5892 |
| 6335 | 6323 |
| 6336 | 3363 |
| 6337 | 3731 |
| 6338 | 3931 |
| 6339 | 4445 |
| 6340 | 4027 |
| 6341 | 4521 |
| 6342 | 4607 |
| 6343 | 5035 |
| 6344 | 4179 |
| 6345 | 4700 |
| 6346 | 4597 |
| 6347 | 5128 |
| 6348 | 4783 |
| 6349 | 5193 |
| 6350 | 5278 |
| 6351 | 5648 |
| 6352 | 4299 |
| 6353 | 4658 |
| 6354 | 4815 |
| 6355 | 5219 |
| 6356 | 4912 |
| 6357 | 5313 |
| 6358 | 5361 |
| 6359 | 5765 |
| 6360 | 4997 |
| 6361 | 5410 |
| 6362 | 5474 |
| 6363 | 5840 |
| 6364 | 5532 |

TABLE Z9-continued with a sequence length of 8192:

| Polarized channel sequence number | Reliability or reliability sequence number |
|---|---|
| 6365 | 5941 |
| 6366 | 6024 |
| 6367 | 6427 |
| 6368 | 4428 |
| 6369 | 4870 |
| 6370 | 4980 |
| 6371 | 5338 |
| 6372 | 5067 |
| 6373 | 5425 |
| 6374 | 5500 |
| 6375 | 5922 |
| 6376 | 5139 |
| 6377 | 5520 |
| 6378 | 5591 |
| 6379 | 6003 |
| 6380 | 5672 |
| 6381 | 6054 |
| 6382 | 6129 |
| 6383 | 6493 |
| 6384 | 5262 |
| 6385 | 5636 |
| 6386 | 5736 |
| 6387 | 6090 |
| 6388 | 5789 |
| 6389 | 6163 |
| 6390 | 6196 |
| 6391 | 6562 |
| 6392 | 5866 |
| 6393 | 6238 |
| 6394 | 6281 |
| 6395 | 6635 |
| 6396 | 6379 |
| 6397 | 6740 |
| 6398 | 6859 |
| 6399 | 7045 |
| 6400 | 1682 |
| 6401 | 2438 |
| 6402 | 2790 |
| 6403 | 3508 |
| 6404 | 2986 |
| 6405 | 3570 |
| 6406 | 3750 |
| 6407 | 4193 |
| 6408 | 3125 |
| 6409 | 3694 |
| 6410 | 3850 |
| 6411 | 4259 |
| 6412 | 3923 |
| 6413 | 4392 |
| 6414 | 4440 |
| 6415 | 4971 |
| 6416 | 3248 |
| 6417 | 3792 |
| 6418 | 3883 |
| 6419 | 4367 |
| 6420 | 4070 |
| 6421 | 4510 |
| 6422 | 4644 |
| 6423 | 5018 |
| 6424 | 4137 |
| 6425 | 4633 |
| 6426 | 4554 |
| 6427 | 5108 |
| 6428 | 4759 |
| 6429 | 5181 |
| 6430 | 5267 |
| 6431 | 5707 |
| 6432 | 3337 |
| 6433 | 3969 |
| 6434 | 4092 |
| 6435 | 4526 |
| 6436 | 4165 |
| 6437 | 4586 |
| 6438 | 4664 |
| 6439 | 5147 |

TABLE Z9-continued with a sequence length of 8192:

| Polarized channel sequence number | Reliability or reliability sequence number |
|---|---|
| 6440 | 4285 |
| 6441 | 4739 |
| 6442 | 4811 |
| 6443 | 5211 |
| 6444 | 4893 |
| 6445 | 5302 |
| 6446 | 5369 |
| 6447 | 5817 |
| 6448 | 4417 |
| 6449 | 4834 |
| 6450 | 4920 |
| 6451 | 5347 |
| 6452 | 4985 |
| 6453 | 5433 |
| 6454 | 5468 |
| 6455 | 5849 |
| 6456 | 5092 |
| 6457 | 5503 |
| 6458 | 5582 |
| 6459 | 5947 |
| 6460 | 5657 |
| 6461 | 6039 |
| 6462 | 6113 |
| 6463 | 6511 |
| 6464 | 3638 |
| 6465 | 4035 |
| 6466 | 4227 |
| 6467 | 4725 |
| 6468 | 4336 |
| 6469 | 4778 |
| 6470 | 4862 |
| 6471 | 5287 |
| 6472 | 4463 |
| 6473 | 4954 |
| 6474 | 4843 |
| 6475 | 5382 |
| 6476 | 5030 |
| 6477 | 5439 |
| 6478 | 5544 |
| 6479 | 5906 |
| 6480 | 4574 |
| 6481 | 4907 |
| 6482 | 5075 |
| 6483 | 5491 |
| 6484 | 5170 |
| 6485 | 5576 |
| 6486 | 5627 |
| 6487 | 5988 |
| 6488 | 5252 |
| 6489 | 5674 |
| 6490 | 5727 |
| 6491 | 6068 |
| 6492 | 5806 |
| 6493 | 6169 |
| 6494 | 6219 |
| 6495 | 6605 |
| 6496 | 4685 |
| 6497 | 5131 |
| 6498 | 5227 |
| 6499 | 5606 |
| 6500 | 5333 |
| 6501 | 5701 |
| 6502 | 5757 |
| 6503 | 6138 |
| 6504 | 5405 |
| 6505 | 5780 |
| 6506 | 5826 |
| 6507 | 6188 |
| 6508 | 5930 |
| 6509 | 6257 |
| 6510 | 6317 |
| 6511 | 6661 |
| 6512 | 5526 |
| 6513 | 5875 |
| 6514 | 5962 |

TABLE Z9-continued with a sequence length of 8192:

| Polarized channel sequence number | Reliability or reliability sequence number |
|---|---|
| 6515 | 6290 |
| 6516 | 6009 |
| 6517 | 6352 |
| 6518 | 6385 |
| 6519 | 6714 |
| 6520 | 6083 |
| 6521 | 6416 |
| 6522 | 6463 |
| 6523 | 6787 |
| 6524 | 6544 |
| 6525 | 6873 |
| 6526 | 6968 |
| 6527 | 7151 |
| 6528 | 3442 |
| 6529 | 3997 |
| 6530 | 4313 |
| 6531 | 4876 |
| 6532 | 4481 |
| 6533 | 4946 |
| 6534 | 5115 |
| 6535 | 5514 |
| 6536 | 4613 |
| 6537 | 5047 |
| 6538 | 5196 |
| 6539 | 5564 |
| 6540 | 5284 |
| 6541 | 5663 |
| 6542 | 5724 |
| 6543 | 6206 |
| 6544 | 4711 |
| 6545 | 5159 |
| 6546 | 5241 |
| 6547 | 5639 |
| 6548 | 5396 |
| 6549 | 5771 |
| 6550 | 5914 |
| 6551 | 6231 |
| 6552 | 5453 |
| 6553 | 5897 |
| 6554 | 5832 |
| 6555 | 6298 |
| 6556 | 6015 |
| 6557 | 6362 |
| 6558 | 6433 |
| 6559 | 6776 |
| 6560 | 4792 |
| 6561 | 5321 |
| 6562 | 5419 |
| 6563 | 5797 |
| 6564 | 5482 |
| 6565 | 5883 |
| 6566 | 5938 |
| 6567 | 6335 |
| 6568 | 5600 |
| 6569 | 5995 |
| 6570 | 6047 |
| 6571 | 6368 |
| 6572 | 6120 |
| 6573 | 6453 |
| 6574 | 6503 |
| 6575 | 6845 |
| 6576 | 5683 |
| 6577 | 6075 |
| 6578 | 6154 |
| 6579 | 6481 |
| 6580 | 6213 |
| 6581 | 6552 |
| 6582 | 6584 |
| 6583 | 6898 |
| 6584 | 6271 |
| 6585 | 6615 |
| 6586 | 6682 |
| 6587 | 6954 |
| 6588 | 6725 |
| 6589 | 7028 |

TABLE Z9-continued with a sequence length of 8192:

| Polarized channel sequence number | Reliability or reliability sequence number |
|---|---|
| 6590 | 7097 |
| 6591 | 7387 |
| 6592 | 5002 |
| 6593 | 5358 |
| 6594 | 5541 |
| 6595 | 5979 |
| 6596 | 5618 |
| 6597 | 6032 |
| 6598 | 6105 |
| 6599 | 6446 |
| 6600 | 5748 |
| 6601 | 6179 |
| 6602 | 6098 |
| 6603 | 6521 |
| 6604 | 6246 |
| 6605 | 6572 |
| 6606 | 6645 |
| 6607 | 6925 |
| 6608 | 5858 |
| 6609 | 6148 |
| 6610 | 6265 |
| 6611 | 6594 |
| 6612 | 6342 |
| 6613 | 6671 |
| 6614 | 6704 |
| 6615 | 6999 |
| 6616 | 6405 |
| 6617 | 6751 |
| 6618 | 6798 |
| 6619 | 7060 |
| 6620 | 6834 |
| 6621 | 7128 |
| 6622 | 7188 |
| 6623 | 7454 |
| 6624 | 5955 |
| 6625 | 6310 |
| 6626 | 6397 |
| 6627 | 6693 |
| 6628 | 6474 |
| 6629 | 6763 |
| 6630 | 6813 |
| 6631 | 7114 |
| 6632 | 6534 |
| 6633 | 6824 |
| 6634 | 6887 |
| 6635 | 7169 |
| 6636 | 6939 |
| 6637 | 7210 |
| 6638 | 7252 |
| 6639 | 7493 |
| 6640 | 6624 |
| 6641 | 6911 |
| 6642 | 6981 |
| 6643 | 7232 |
| 6644 | 7015 |
| 6645 | 7278 |
| 6646 | 7302 |
| 6647 | 7534 |
| 6648 | 7077 |
| 6649 | 7330 |
| 6650 | 7358 |
| 6651 | 7585 |
| 6652 | 7419 |
| 6653 | 7644 |
| 6654 | 7717 |
| 6655 | 7827 |
| 6656 | 1748 |
| 6657 | 2617 |
| 6658 | 2970 |
| 6659 | 3825 |
| 6660 | 3197 |
| 6661 | 3891 |
| 6662 | 4057 |
| 6663 | 4543 |
| 6664 | 3349 |

TABLE Z9-continued

| with a sequence length of 8192: | |
|---|---|
| Polarized channel sequence number | Reliability or reliability sequence number |
| 6665 | 4005 |
| 6666 | 4157 |
| 6667 | 4602 |
| 6668 | 4247 |
| 6669 | 4719 |
| 6670 | 4764 |
| 6671 | 5295 |
| 6672 | 3487 |
| 6673 | 4114 |
| 6674 | 4199 |
| 6675 | 4694 |
| 6676 | 4386 |
| 6677 | 4848 |
| 6678 | 4976 |
| 6679 | 5344 |
| 6680 | 4451 |
| 6681 | 4959 |
| 6682 | 4884 |
| 6683 | 5413 |
| 6684 | 5088 |
| 6685 | 5488 |
| 6686 | 5558 |
| 6687 | 5989 |
| 6688 | 3590 |
| 6689 | 4279 |
| 6690 | 4423 |
| 6691 | 4867 |
| 6692 | 4515 |
| 6693 | 4924 |
| 6694 | 5005 |
| 6695 | 5442 |
| 6696 | 4622 |
| 6697 | 5072 |
| 6698 | 5151 |
| 6699 | 5507 |
| 6700 | 5215 |
| 6701 | 5594 |
| 6702 | 5651 |
| 6703 | 6087 |
| 6704 | 4744 |
| 6705 | 5165 |
| 6706 | 5259 |
| 6707 | 5630 |
| 6708 | 5310 |
| 6709 | 5713 |
| 6710 | 5751 |
| 6711 | 6126 |
| 6712 | 5390 |
| 6713 | 5786 |
| 6714 | 5860 |
| 6715 | 6215 |
| 6716 | 5927 |
| 6717 | 6313 |
| 6718 | 6384 |
| 6719 | 6748 |
| 6720 | 3953 |
| 6721 | 4361 |
| 6722 | 4569 |
| 6723 | 5055 |
| 6724 | 4675 |
| 6725 | 5100 |
| 6726 | 5188 |
| 6727 | 5588 |
| 6728 | 4787 |
| 6729 | 5281 |
| 6730 | 5173 |
| 6731 | 5669 |
| 6732 | 5352 |
| 6733 | 5722 |
| 6734 | 5829 |
| 6735 | 6175 |
| 6736 | 4901 |
| 6737 | 5244 |
| 6738 | 5379 |
| 6739 | 5768 |

TABLE Z9-continued

| with a sequence length of 8192: | |
|---|---|
| Polarized channel sequence number | Reliability or reliability sequence number |
| 6740 | 5479 |
| 6741 | 5855 |
| 6742 | 5912 |
| 6743 | 6262 |
| 6744 | 5552 |
| 6745 | 5958 |
| 6746 | 6013 |
| 6747 | 6330 |
| 6748 | 6081 |
| 6749 | 6437 |
| 6750 | 6486 |
| 6751 | 6833 |
| 6752 | 5027 |
| 6753 | 5436 |
| 6754 | 5529 |
| 6755 | 5886 |
| 6756 | 5624 |
| 6757 | 5982 |
| 6758 | 6036 |
| 6759 | 6410 |
| 6760 | 5689 |
| 6761 | 6060 |
| 6762 | 6103 |
| 6763 | 6457 |
| 6764 | 6194 |
| 6765 | 6519 |
| 6766 | 6580 |
| 6767 | 6876 |
| 6768 | 5800 |
| 6769 | 6145 |
| 6770 | 6234 |
| 6771 | 6548 |
| 6772 | 6282 |
| 6773 | 6614 |
| 6774 | 6640 |
| 6775 | 6928 |
| 6776 | 6351 |
| 6777 | 6674 |
| 6778 | 6712 |
| 6779 | 6986 |
| 6780 | 6780 |
| 6781 | 7054 |
| 6782 | 7144 |
| 6783 | 7295 |
| 6784 | 3677 |
| 6785 | 4318 |
| 6786 | 4649 |
| 6787 | 5199 |
| 6788 | 4825 |
| 6789 | 5270 |
| 6790 | 5422 |
| 6791 | 5791 |
| 6792 | 4937 |
| 6793 | 5365 |
| 6794 | 5494 |
| 6795 | 5838 |
| 6796 | 5579 |
| 6797 | 5950 |
| 6798 | 6006 |
| 6799 | 6467 |
| 6800 | 5043 |
| 6801 | 5465 |
| 6802 | 5538 |
| 6803 | 5920 |
| 6804 | 5680 |
| 6805 | 6052 |
| 6806 | 6187 |
| 6807 | 6497 |
| 6808 | 5733 |
| 6809 | 6167 |
| 6810 | 6111 |
| 6811 | 6558 |
| 6812 | 6287 |
| 6813 | 6619 |
| 6814 | 6686 |

TABLE Z9-continued

| with a sequence length of 8192: | |
|---|---|
| Polarized channel sequence number | Reliability or reliability sequence number |
| 6815 | 6974 |
| 6816 | 5119 |
| 6817 | 5603 |
| 6818 | 5704 |
| 6819 | 6063 |
| 6820 | 5759 |
| 6821 | 6153 |
| 6822 | 6209 |
| 6823 | 6590 |
| 6824 | 5869 |
| 6825 | 6269 |
| 6826 | 6319 |
| 6827 | 6632 |
| 6828 | 6394 |
| 6829 | 6708 |
| 6830 | 6737 |
| 6831 | 7042 |
| 6832 | 5974 |
| 6833 | 6339 |
| 6834 | 6423 |
| 6835 | 6729 |
| 6836 | 6477 |
| 6837 | 6795 |
| 6838 | 6817 |
| 6839 | 7082 |
| 6840 | 6535 |
| 6841 | 6841 |
| 6842 | 6895 |
| 6843 | 7133 |
| 6844 | 6936 |
| 6845 | 7200 |
| 6846 | 7245 |
| 6847 | 7502 |
| 6848 | 5330 |
| 6849 | 5642 |
| 6850 | 5820 |
| 6851 | 6250 |
| 6852 | 5895 |
| 6853 | 6301 |
| 6854 | 6372 |
| 6855 | 6697 |
| 6856 | 6029 |
| 6857 | 6441 |
| 6858 | 6364 |
| 6859 | 6759 |
| 6860 | 6507 |
| 6861 | 6806 |
| 6862 | 6863 |
| 6863 | 7103 |
| 6864 | 6133 |
| 6865 | 6411 |
| 6866 | 6529 |
| 6867 | 6828 |
| 6868 | 6601 |
| 6869 | 6884 |
| 6870 | 6919 |
| 6871 | 7173 |
| 6872 | 6664 |
| 6873 | 6951 |
| 6874 | 6993 |
| 6875 | 7217 |
| 6876 | 7032 |
| 6877 | 7276 |
| 6878 | 7325 |
| 6879 | 7556 |
| 6880 | 6227 |
| 6881 | 6570 |
| 6882 | 6653 |
| 6883 | 6904 |
| 6884 | 6718 |
| 6885 | 6961 |
| 6886 | 7006 |
| 6887 | 7265 |
| 6888 | 6769 |
| 6889 | 7021 |

TABLE Z9-continued

| with a sequence length of 8192: | |
|---|---|
| Polarized channel sequence number | Reliability or reliability sequence number |
| 6890 | 7068 |
| 6891 | 7314 |
| 6892 | 7117 |
| 6893 | 7346 |
| 6894 | 7391 |
| 6895 | 7593 |
| 6896 | 6852 |
| 6897 | 7091 |
| 6898 | 7158 |
| 6899 | 7366 |
| 6900 | 7184 |
| 6901 | 7407 |
| 6902 | 7428 |
| 6903 | 7628 |
| 6904 | 7230 |
| 6905 | 7449 |
| 6906 | 7476 |
| 6907 | 7669 |
| 6908 | 7528 |
| 6909 | 7723 |
| 6910 | 7783 |
| 6911 | 7875 |
| 6912 | 3758 |
| 6913 | 4487 |
| 6914 | 4806 |
| 6915 | 5456 |
| 6916 | 4993 |
| 6917 | 5517 |
| 6918 | 5660 |
| 6919 | 6045 |
| 6920 | 5134 |
| 6921 | 5615 |
| 6922 | 5745 |
| 6923 | 6096 |
| 6924 | 5812 |
| 6925 | 6200 |
| 6926 | 6243 |
| 6927 | 6649 |
| 6928 | 5230 |
| 6929 | 5695 |
| 6930 | 5777 |
| 6931 | 6182 |
| 6932 | 5936 |
| 6933 | 6294 |
| 6934 | 6401 |
| 6935 | 6678 |
| 6936 | 5997 |
| 6937 | 6390 |
| 6938 | 6329 |
| 6939 | 6744 |
| 6940 | 6488 |
| 6941 | 6802 |
| 6942 | 6856 |
| 6943 | 7140 |
| 6944 | 5316 |
| 6945 | 5846 |
| 6946 | 5965 |
| 6947 | 6306 |
| 6948 | 6021 |
| 6949 | 6358 |
| 6950 | 6420 |
| 6951 | 6772 |
| 6952 | 6118 |
| 6953 | 6471 |
| 6954 | 6525 |
| 6955 | 6820 |
| 6956 | 6587 |
| 6957 | 6880 |
| 6958 | 6921 |
| 6959 | 7202 |
| 6960 | 6225 |
| 6961 | 6539 |
| 6962 | 6610 |
| 6963 | 6908 |
| 6964 | 6657 |

TABLE Z9-continued

| with a sequence length of 8192: | |
|---|---|
| Polarized channel sequence number | Reliability or reliability sequence number |
| 6965 | 6964 |
| 6966 | 6990 |
| 6967 | 7222 |
| 6968 | 6733 |
| 6969 | 7011 |
| 6970 | 7063 |
| 6971 | 7283 |
| 6972 | 7108 |
| 6973 | 7339 |
| 6974 | 7378 |
| 6975 | 7604 |
| 6976 | 5567 |
| 6977 | 5903 |
| 6978 | 6072 |
| 6979 | 6459 |
| 6980 | 6160 |
| 6981 | 6501 |
| 6982 | 6566 |
| 6983 | 6870 |
| 6984 | 6253 |
| 6985 | 6639 |
| 6986 | 6554 |
| 6987 | 6932 |
| 6988 | 6689 |
| 6989 | 6970 |
| 6990 | 7038 |
| 6991 | 7257 |
| 6992 | 6346 |
| 6993 | 6598 |
| 6994 | 6722 |
| 6995 | 7003 |
| 6996 | 6791 |
| 6997 | 7056 |
| 6998 | 7089 |
| 6999 | 7307 |
| 7000 | 6848 |
| 7001 | 7122 |
| 7002 | 7155 |
| 7003 | 7350 |
| 7004 | 7195 |
| 7005 | 7411 |
| 7006 | 7441 |
| 7007 | 7653 |
| 7008 | 6431 |
| 7009 | 6765 |
| 7010 | 6831 |
| 7011 | 7074 |
| 7012 | 6901 |
| 7013 | 7136 |
| 7014 | 7165 |
| 7015 | 7395 |
| 7016 | 6948 |
| 7017 | 7181 |
| 7018 | 7207 |
| 7019 | 7423 |
| 7020 | 7267 |
| 7021 | 7462 |
| 7022 | 7497 |
| 7023 | 7679 |
| 7024 | 7024 |
| 7025 | 7237 |
| 7026 | 7291 |
| 7027 | 7479 |
| 7028 | 7318 |
| 7029 | 7515 |
| 7030 | 7537 |
| 7031 | 7707 |
| 7032 | 7363 |
| 7033 | 7551 |
| 7034 | 7575 |
| 7035 | 7746 |
| 7036 | 7619 |
| 7037 | 7788 |
| 7038 | 7840 |
| 7039 | 7923 |

TABLE Z9-continued

| with a sequence length of 8192: | |
|---|---|
| Polarized channel sequence number | Reliability or reliability sequence number |
| 7040 | 5399 |
| 7041 | 5878 |
| 7042 | 6141 |
| 7043 | 6576 |
| 7044 | 6275 |
| 7045 | 6628 |
| 7046 | 6755 |
| 7047 | 7017 |
| 7048 | 6375 |
| 7049 | 6701 |
| 7050 | 6809 |
| 7051 | 7050 |
| 7052 | 6867 |
| 7053 | 7111 |
| 7054 | 7147 |
| 7055 | 7432 |
| 7056 | 6448 |
| 7057 | 6783 |
| 7058 | 6837 |
| 7059 | 7100 |
| 7060 | 6944 |
| 7061 | 7177 |
| 7062 | 7260 |
| 7063 | 7446 |
| 7064 | 6978 |
| 7065 | 7250 |
| 7066 | 7215 |
| 7067 | 7484 |
| 7068 | 7323 |
| 7069 | 7521 |
| 7070 | 7561 |
| 7071 | 7740 |
| 7072 | 6515 |
| 7073 | 6891 |
| 7074 | 6957 |
| 7075 | 7192 |
| 7076 | 6996 |
| 7077 | 7240 |
| 7078 | 7271 |
| 7079 | 7505 |
| 7080 | 7071 |
| 7081 | 7311 |
| 7082 | 7343 |
| 7083 | 7524 |
| 7084 | 7383 |
| 7085 | 7570 |
| 7086 | 7599 |
| 7087 | 7775 |
| 7088 | 7125 |
| 7089 | 7355 |
| 7090 | 7402 |
| 7091 | 7589 |
| 7092 | 7437 |
| 7093 | 7623 |
| 7094 | 7639 |
| 7095 | 7800 |
| 7096 | 7472 |
| 7097 | 7659 |
| 7098 | 7690 |
| 7099 | 7834 |
| 7100 | 7712 |
| 7101 | 7869 |
| 7102 | 7899 |
| 7103 | 8019 |
| 7104 | 6668 |
| 7105 | 6915 |
| 7106 | 7036 |
| 7107 | 7299 |
| 7108 | 7086 |
| 7109 | 7334 |
| 7110 | 7374 |
| 7111 | 7565 |
| 7112 | 7163 |
| 7113 | 7415 |
| 7114 | 7369 |

TABLE Z9-continued with a sequence length of 8192:

| Polarized channel sequence number | Reliability or reliability sequence number |
|---|---|
| 7115 | 7608 |
| 7116 | 7458 |
| 7117 | 7634 |
| 7118 | 7674 |
| 7119 | 7814 |
| 7120 | 7225 |
| 7121 | 7400 |
| 7122 | 7466 |
| 7123 | 7649 |
| 7124 | 7511 |
| 7125 | 7685 |
| 7126 | 7700 |
| 7127 | 7853 |
| 7128 | 7547 |
| 7129 | 7729 |
| 7130 | 7752 |
| 7131 | 7883 |
| 7132 | 7769 |
| 7133 | 7916 |
| 7134 | 7940 |
| 7135 | 8044 |
| 7136 | 7287 |
| 7137 | 7487 |
| 7138 | 7543 |
| 7139 | 7696 |
| 7140 | 7579 |
| 7141 | 7735 |
| 7142 | 7758 |
| 7143 | 7906 |
| 7144 | 7613 |
| 7145 | 7765 |
| 7146 | 7795 |
| 7147 | 7931 |
| 7148 | 7819 |
| 7149 | 7949 |
| 7150 | 7967 |
| 7151 | 8057 |
| 7152 | 7664 |
| 7153 | 7807 |
| 7154 | 7847 |
| 7155 | 7959 |
| 7156 | 7861 |
| 7157 | 7977 |
| 7158 | 7988 |
| 7159 | 8072 |
| 7160 | 7891 |
| 7161 | 7997 |
| 7162 | 8009 |
| 7163 | 8088 |
| 7164 | 8031 |
| 7165 | 8105 |
| 7166 | 8126 |
| 7167 | 8152 |
| 7168 | 1813 |
| 7169 | 2748 |
| 7170 | 3167 |
| 7171 | 4171 |
| 7172 | 3409 |
| 7173 | 4239 |
| 7174 | 4411 |
| 7175 | 4889 |
| 7176 | 3579 |
| 7177 | 4355 |
| 7178 | 4504 |
| 7179 | 4942 |
| 7180 | 4591 |
| 7181 | 5080 |
| 7182 | 5123 |
| 7183 | 5645 |
| 7184 | 3722 |
| 7185 | 4457 |
| 7186 | 4549 |
| 7187 | 5060 |
| 7188 | 4734 |
| 7189 | 5204 |

TABLE Z9-continued with a sequence length of 8192:

| Polarized channel sequence number | Reliability or reliability sequence number |
|---|---|
| 7190 | 5324 |
| 7191 | 5698 |
| 7192 | 4801 |
| 7193 | 5306 |
| 7194 | 5236 |
| 7195 | 5762 |
| 7196 | 5445 |
| 7197 | 5843 |
| 7198 | 5917 |
| 7199 | 6322 |
| 7200 | 3842 |
| 7201 | 4628 |
| 7202 | 4769 |
| 7203 | 5222 |
| 7204 | 4857 |
| 7205 | 5273 |
| 7206 | 5372 |
| 7207 | 5803 |
| 7208 | 4968 |
| 7209 | 5430 |
| 7210 | 5497 |
| 7211 | 5863 |
| 7212 | 5573 |
| 7213 | 5953 |
| 7214 | 6011 |
| 7215 | 6407 |
| 7216 | 5103 |
| 7217 | 5511 |
| 7218 | 5609 |
| 7219 | 5992 |
| 7220 | 5654 |
| 7221 | 6070 |
| 7222 | 6108 |
| 7223 | 6440 |
| 7224 | 5742 |
| 7225 | 6142 |
| 7226 | 6210 |
| 7227 | 6517 |
| 7228 | 6273 |
| 7229 | 6604 |
| 7230 | 6662 |
| 7231 | 6991 |
| 7232 | 4305 |
| 7233 | 4705 |
| 7234 | 4915 |
| 7235 | 5416 |
| 7236 | 5038 |
| 7237 | 5459 |
| 7238 | 5549 |
| 7239 | 5944 |
| 7240 | 5142 |
| 7241 | 5633 |
| 7242 | 5523 |
| 7243 | 6034 |
| 7244 | 5710 |
| 7245 | 6078 |
| 7246 | 6176 |
| 7247 | 6480 |
| 7248 | 5255 |
| 7249 | 5597 |
| 7250 | 5730 |
| 7251 | 6123 |
| 7252 | 5835 |
| 7253 | 6203 |
| 7254 | 6255 |
| 7255 | 6559 |
| 7256 | 5909 |
| 7257 | 6291 |
| 7258 | 6336 |
| 7259 | 6622 |
| 7260 | 6398 |
| 7261 | 6709 |
| 7262 | 6753 |
| 7263 | 7069 |
| 7264 | 5385 |

TABLE Z9-continued

| with a sequence length of 8192: | |
|---|---|
| Polarized channel sequence number | Reliability or reliability sequence number |
| 7265 | 5783 |
| 7266 | 5889 |
| 7267 | 6237 |
| 7268 | 5985 |
| 7269 | 6314 |
| 7270 | 6359 |
| 7271 | 6687 |
| 7272 | 6050 |
| 7273 | 6381 |
| 7274 | 6418 |
| 7275 | 6727 |
| 7276 | 6498 |
| 7277 | 6782 |
| 7278 | 6840 |
| 7279 | 7109 |
| 7280 | 6157 |
| 7281 | 6461 |
| 7282 | 6538 |
| 7283 | 6808 |
| 7284 | 6578 |
| 7285 | 6872 |
| 7286 | 6896 |
| 7287 | 7156 |
| 7288 | 6637 |
| 7289 | 6927 |
| 7290 | 6960 |
| 7291 | 7208 |
| 7292 | 7019 |
| 7293 | 7273 |
| 7294 | 7356 |
| 7295 | 7485 |
| 7296 | 3937 |
| 7297 | 4669 |
| 7298 | 4988 |
| 7299 | 5561 |
| 7300 | 5185 |
| 7301 | 5621 |
| 7302 | 5774 |
| 7303 | 6150 |
| 7304 | 5292 |
| 7305 | 5719 |
| 7306 | 5852 |
| 7307 | 6191 |
| 7308 | 5933 |
| 7309 | 6285 |
| 7310 | 6333 |
| 7311 | 6738 |
| 7312 | 5402 |
| 7313 | 5823 |
| 7314 | 5900 |
| 7315 | 6259 |
| 7316 | 6042 |
| 7317 | 6377 |
| 7318 | 6494 |
| 7319 | 6764 |
| 7320 | 6093 |
| 7321 | 6476 |
| 7322 | 6424 |
| 7323 | 6818 |
| 7324 | 6582 |
| 7325 | 6875 |
| 7326 | 6933 |
| 7327 | 7201 |
| 7328 | 5471 |
| 7329 | 5968 |
| 7330 | 6065 |
| 7331 | 6388 |
| 7332 | 6115 |
| 7333 | 6464 |
| 7334 | 6513 |
| 7335 | 6851 |
| 7336 | 6218 |
| 7337 | 6565 |
| 7338 | 6608 |
| 7339 | 6885 |

TABLE Z9-continued

| with a sequence length of 8192: | |
|---|---|
| Polarized channel sequence number | Reliability or reliability sequence number |
| 7340 | 6676 |
| 7341 | 6952 |
| 7342 | 6982 |
| 7343 | 7262 |
| 7344 | 6303 |
| 7345 | 6625 |
| 7346 | 6702 |
| 7347 | 6973 |
| 7348 | 6749 |
| 7349 | 7034 |
| 7350 | 7051 |
| 7351 | 7297 |
| 7352 | 6797 |
| 7353 | 7080 |
| 7354 | 7127 |
| 7355 | 7341 |
| 7356 | 7167 |
| 7357 | 7403 |
| 7358 | 7444 |
| 7359 | 7652 |
| 7360 | 5686 |
| 7361 | 6000 |
| 7362 | 6172 |
| 7363 | 6545 |
| 7364 | 6241 |
| 7365 | 6596 |
| 7366 | 6654 |
| 7367 | 6943 |
| 7368 | 6355 |
| 7369 | 6719 |
| 7370 | 6647 |
| 7371 | 7001 |
| 7372 | 6771 |
| 7373 | 7044 |
| 7374 | 7095 |
| 7375 | 7317 |
| 7376 | 6444 |
| 7377 | 6691 |
| 7378 | 6793 |
| 7379 | 7062 |
| 7380 | 6861 |
| 7381 | 7118 |
| 7382 | 7149 |
| 7383 | 7380 |
| 7384 | 6916 |
| 7385 | 7178 |
| 7386 | 7216 |
| 7387 | 7420 |
| 7388 | 7251 |
| 7389 | 7471 |
| 7390 | 7512 |
| 7391 | 7699 |
| 7392 | 6531 |
| 7393 | 6829 |
| 7394 | 6907 |
| 7395 | 7135 |
| 7396 | 6962 |
| 7397 | 7187 |
| 7398 | 7231 |
| 7399 | 7460 |
| 7400 | 7010 |
| 7401 | 7243 |
| 7402 | 7285 |
| 7403 | 7499 |
| 7404 | 7331 |
| 7405 | 7527 |
| 7406 | 7563 |
| 7407 | 7727 |
| 7408 | 7087 |
| 7409 | 7309 |
| 7410 | 7367 |
| 7411 | 7544 |
| 7412 | 7393 |
| 7413 | 7578 |
| 7414 | 7596 |

TABLE Z9-continued

| with a sequence length of 8192: | |
|---|---|
| Polarized channel sequence number | Reliability or reliability sequence number |
| 7415 | 7757 |
| 7416 | 7431 |
| 7417 | 7614 |
| 7418 | 7633 |
| 7419 | 7787 |
| 7420 | 7678 |
| 7421 | 7830 |
| 7422 | 7879 |
| 7423 | 7948 |
| 7424 | 4021 |
| 7425 | 4829 |
| 7426 | 5162 |
| 7427 | 5815 |
| 7428 | 5355 |
| 7429 | 5872 |
| 7430 | 6018 |
| 7431 | 6365 |
| 7432 | 5485 |
| 7433 | 5976 |
| 7434 | 6100 |
| 7435 | 6414 |
| 7436 | 6165 |
| 7437 | 6508 |
| 7438 | 6542 |
| 7439 | 6899 |
| 7440 | 5585 |
| 7441 | 6057 |
| 7442 | 6130 |
| 7443 | 6490 |
| 7444 | 6278 |
| 7445 | 6586 |
| 7446 | 6679 |
| 7447 | 6931 |
| 7448 | 6326 |
| 7449 | 6672 |
| 7450 | 6618 |
| 7451 | 6987 |
| 7452 | 6756 |
| 7453 | 7037 |
| 7454 | 7090 |
| 7455 | 7351 |
| 7456 | 5666 |
| 7457 | 6198 |
| 7458 | 6297 |
| 7459 | 6600 |
| 7460 | 6348 |
| 7461 | 6643 |
| 7462 | 6694 |
| 7463 | 7012 |
| 7464 | 6436 |
| 7465 | 6742 |
| 7466 | 6790 |
| 7467 | 7055 |
| 7468 | 6847 |
| 7469 | 7113 |
| 7470 | 7154 |
| 7471 | 7408 |
| 7472 | 6524 |
| 7473 | 6804 |
| 7474 | 6864 |
| 7475 | 7141 |
| 7476 | 6910 |
| 7477 | 7191 |
| 7478 | 7213 |
| 7479 | 7425 |
| 7480 | 6979 |
| 7481 | 7235 |
| 7482 | 7281 |
| 7483 | 7473 |
| 7484 | 7322 |
| 7485 | 7518 |
| 7486 | 7555 |
| 7487 | 7736 |
| 7488 | 5924 |
| 7489 | 6247 |

TABLE Z9-continued

| with a sequence length of 8192: | |
|---|---|
| Polarized channel sequence number | Reliability or reliability sequence number |
| 7490 | 6392 |
| 7491 | 6734 |
| 7492 | 6470 |
| 7493 | 6767 |
| 7494 | 6822 |
| 7495 | 7104 |
| 7496 | 6556 |
| 7497 | 6889 |
| 7498 | 6811 |
| 7499 | 7161 |
| 7500 | 6940 |
| 7501 | 7197 |
| 7502 | 7258 |
| 7503 | 7453 |
| 7504 | 6633 |
| 7505 | 6857 |
| 7506 | 6969 |
| 7507 | 7227 |
| 7508 | 7029 |
| 7509 | 7275 |
| 7510 | 7306 |
| 7511 | 7492 |
| 7512 | 7081 |
| 7513 | 7333 |
| 7514 | 7361 |
| 7515 | 7532 |
| 7516 | 7401 |
| 7517 | 7582 |
| 7518 | 7605 |
| 7519 | 7777 |
| 7520 | 6706 |
| 7521 | 7004 |
| 7522 | 7064 |
| 7523 | 7293 |
| 7524 | 7131 |
| 7525 | 7347 |
| 7526 | 7376 |
| 7527 | 7566 |
| 7528 | 7174 |
| 7529 | 7389 |
| 7530 | 7412 |
| 7531 | 7591 |
| 7532 | 7465 |
| 7533 | 7622 |
| 7534 | 7650 |
| 7535 | 7798 |
| 7536 | 7246 |
| 7537 | 7436 |
| 7538 | 7481 |
| 7539 | 7637 |
| 7540 | 7504 |
| 7541 | 7666 |
| 7542 | 7682 |
| 7543 | 7820 |
| 7544 | 7540 |
| 7545 | 7695 |
| 7546 | 7715 |
| 7547 | 7849 |
| 7548 | 7750 |
| 7549 | 7884 |
| 7550 | 7920 |
| 7551 | 7985 |
| 7552 | 5754 |
| 7553 | 6222 |
| 7554 | 6450 |
| 7555 | 6836 |
| 7556 | 6568 |
| 7557 | 6882 |
| 7558 | 6994 |
| 7559 | 7239 |
| 7560 | 6658 |
| 7561 | 6949 |
| 7562 | 7047 |
| 7563 | 7268 |
| 7564 | 7102 |

TABLE Z9-continued

| with a sequence length of 8192: | |
|---|---|
| Polarized channel sequence number | Reliability or reliability sequence number |
| 7565 | 7327 |
| 7566 | 7360 |
| 7567 | 7598 |
| 7568 | 6723 |
| 7569 | 7023 |
| 7570 | 7073 |
| 7571 | 7313 |
| 7572 | 7170 |
| 7573 | 7384 |
| 7574 | 7456 |
| 7575 | 7611 |
| 7576 | 7203 |
| 7577 | 7448 |
| 7578 | 7417 |
| 7579 | 7641 |
| 7580 | 7508 |
| 7581 | 7671 |
| 7582 | 7703 |
| 7583 | 7845 |
| 7584 | 6779 |
| 7585 | 7123 |
| 7586 | 7183 |
| 7587 | 7397 |
| 7588 | 7221 |
| 7589 | 7440 |
| 7590 | 7468 |
| 7591 | 7658 |
| 7592 | 7289 |
| 7593 | 7496 |
| 7594 | 7523 |
| 7595 | 7673 |
| 7596 | 7558 |
| 7597 | 7710 |
| 7598 | 7732 |
| 7599 | 7872 |
| 7600 | 7338 |
| 7601 | 7536 |
| 7602 | 7576 |
| 7603 | 7724 |
| 7604 | 7601 |
| 7605 | 7753 |
| 7606 | 7767 |
| 7607 | 7893 |
| 7608 | 7629 |
| 7609 | 7780 |
| 7610 | 7806 |
| 7611 | 7913 |
| 7612 | 7825 |
| 7613 | 7943 |
| 7614 | 7966 |
| 7615 | 8059 |
| 7616 | 6920 |
| 7617 | 7145 |
| 7618 | 7255 |
| 7619 | 7489 |
| 7620 | 7301 |
| 7621 | 7516 |
| 7622 | 7550 |
| 7623 | 7708 |
| 7624 | 7372 |
| 7625 | 7586 |
| 7626 | 7548 |
| 7627 | 7741 |
| 7628 | 7617 |
| 7629 | 7761 |
| 7630 | 7791 |
| 7631 | 7904 |
| 7632 | 7429 |
| 7633 | 7571 |
| 7634 | 7626 |
| 7635 | 7771 |
| 7636 | 7661 |
| 7637 | 7803 |
| 7638 | 7816 |
| 7639 | 7932 |

TABLE Z9-continued

| with a sequence length of 8192: | |
|---|---|
| Polarized channel sequence number | Reliability or reliability sequence number |
| 7640 | 7689 |
| 7641 | 7835 |
| 7642 | 7852 |
| 7643 | 7953 |
| 7644 | 7868 |
| 7645 | 7978 |
| 7646 | 7998 |
| 7647 | 8078 |
| 7648 | 7477 |
| 7649 | 7647 |
| 7650 | 7687 |
| 7651 | 7811 |
| 7652 | 7721 |
| 7653 | 7838 |
| 7654 | 7859 |
| 7655 | 7973 |
| 7656 | 7744 |
| 7657 | 7863 |
| 7658 | 7888 |
| 7659 | 7992 |
| 7660 | 7909 |
| 7661 | 8005 |
| 7662 | 8018 |
| 7663 | 8089 |
| 7664 | 7784 |
| 7665 | 7898 |
| 7666 | 7925 |
| 7667 | 8013 |
| 7668 | 7937 |
| 7669 | 8027 |
| 7670 | 8035 |
| 7671 | 8099 |
| 7672 | 7961 |
| 7673 | 8043 |
| 7674 | 8051 |
| 7675 | 8112 |
| 7676 | 8069 |
| 7677 | 8124 |
| 7678 | 8140 |
| 7679 | 8160 |
| 7680 | 4100 |
| 7681 | 5013 |
| 7682 | 5341 |
| 7683 | 6086 |
| 7684 | 5535 |
| 7685 | 6135 |
| 7686 | 6266 |
| 7687 | 6611 |
| 7688 | 5677 |
| 7689 | 6229 |
| 7690 | 6344 |
| 7691 | 6650 |
| 7692 | 6403 |
| 7693 | 6730 |
| 7694 | 6760 |
| 7695 | 7107 |
| 7696 | 5794 |
| 7697 | 6307 |
| 7698 | 6371 |
| 7699 | 6715 |
| 7700 | 6504 |
| 7701 | 6814 |
| 7702 | 6903 |
| 7703 | 7137 |
| 7704 | 6549 |
| 7705 | 6892 |
| 7706 | 6844 |
| 7707 | 7179 |
| 7708 | 6976 |
| 7709 | 7223 |
| 7710 | 7266 |
| 7711 | 7495 |
| 7712 | 5880 |
| 7713 | 6429 |
| 7714 | 6527 |

TABLE Z9-continued

| with a sequence length of 8192: | |
|---|---|
| Polarized channel sequence number | Reliability or reliability sequence number |
| 7715 | 6825 |
| 7716 | 6592 |
| 7717 | 6868 |
| 7718 | 6924 |
| 7719 | 7198 |
| 7720 | 6666 |
| 7721 | 6966 |
| 7722 | 7016 |
| 7723 | 7236 |
| 7724 | 7058 |
| 7725 | 7286 |
| 7726 | 7319 |
| 7727 | 7542 |
| 7728 | 6745 |
| 7729 | 7025 |
| 7730 | 7084 |
| 7731 | 7308 |
| 7732 | 7116 |
| 7733 | 7352 |
| 7734 | 7373 |
| 7735 | 7560 |
| 7736 | 7164 |
| 7737 | 7390 |
| 7738 | 7430 |
| 7739 | 7603 |
| 7740 | 7464 |
| 7741 | 7648 |
| 7742 | 7681 |
| 7743 | 7832 |
| 7744 | 6184 |
| 7745 | 6484 |
| 7746 | 6629 |
| 7747 | 6956 |
| 7748 | 6698 |
| 7749 | 6985 |
| 7750 | 7041 |
| 7751 | 7282 |
| 7752 | 6775 |
| 7753 | 7099 |
| 7754 | 7031 |
| 7755 | 7329 |
| 7756 | 7142 |
| 7757 | 7357 |
| 7758 | 7413 |
| 7759 | 7583 |
| 7760 | 6853 |
| 7761 | 7076 |
| 7762 | 7159 |
| 7763 | 7382 |
| 7764 | 7220 |
| 7765 | 7426 |
| 7766 | 7455 |
| 7767 | 7625 |
| 7768 | 7261 |
| 7769 | 7478 |
| 7770 | 7506 |
| 7771 | 7657 |
| 7772 | 7538 |
| 7773 | 7704 |
| 7774 | 7725 |
| 7775 | 7867 |
| 7776 | 6937 |
| 7777 | 7193 |
| 7778 | 7247 |
| 7779 | 7443 |
| 7780 | 7303 |
| 7781 | 7491 |
| 7782 | 7517 |
| 7783 | 7691 |
| 7784 | 7340 |
| 7785 | 7529 |
| 7786 | 7549 |
| 7787 | 7713 |
| 7788 | 7592 |
| 7789 | 7739 |

TABLE Z9-continued

| with a sequence length of 8192: | |
|---|---|
| Polarized channel sequence number | Reliability or reliability sequence number |
| 7790 | 7766 |
| 7791 | 7885 |
| 7792 | 7399 |
| 7793 | 7569 |
| 7794 | 7612 |
| 7795 | 7751 |
| 7796 | 7635 |
| 7797 | 7779 |
| 7798 | 7790 |
| 7799 | 7905 |
| 7800 | 7665 |
| 7801 | 7804 |
| 7802 | 7818 |
| 7803 | 7926 |
| 7804 | 7846 |
| 7805 | 7951 |
| 7806 | 7983 |
| 7807 | 8032 |
| 7808 | 5960 |
| 7809 | 6454 |
| 7810 | 6683 |
| 7811 | 7049 |
| 7812 | 6801 |
| 7813 | 7094 |
| 7814 | 7186 |
| 7815 | 7394 |
| 7816 | 6879 |
| 7817 | 7150 |
| 7818 | 7228 |
| 7819 | 7418 |
| 7820 | 7277 |
| 7821 | 7474 |
| 7822 | 7503 |
| 7823 | 7716 |
| 7824 | 6945 |
| 7825 | 7212 |
| 7826 | 7254 |
| 7827 | 7459 |
| 7828 | 7335 |
| 7829 | 7525 |
| 7830 | 7590 |
| 7831 | 7730 |
| 7832 | 7364 |
| 7833 | 7581 |
| 7834 | 7554 |
| 7835 | 7756 |
| 7836 | 7636 |
| 7837 | 7781 |
| 7838 | 7809 |
| 7839 | 7922 |
| 7840 | 6998 |
| 7841 | 7292 |
| 7842 | 7349 |
| 7843 | 7531 |
| 7844 | 7377 |
| 7845 | 7572 |
| 7846 | 7600 |
| 7847 | 7770 |
| 7848 | 7435 |
| 7849 | 7627 |
| 7850 | 7651 |
| 7851 | 7786 |
| 7852 | 7684 |
| 7853 | 7817 |
| 7854 | 7829 |
| 7855 | 7947 |
| 7856 | 7486 |
| 7857 | 7660 |
| 7858 | 7698 |
| 7859 | 7826 |
| 7860 | 7722 |
| 7861 | 7851 |
| 7862 | 7860 |
| 7863 | 7962 |
| 7864 | 7748 |

TABLE Z9-continued

| with a sequence length of 8192: | |
|---|---|
| Polarized channel sequence number | Reliability or reliability sequence number |
| 7865 | 7871 |
| 7866 | 7892 |
| 7867 | 7979 |
| 7868 | 7908 |
| 7869 | 8001 |
| 7870 | 8016 |
| 7871 | 8091 |
| 7872 | 7130 |
| 7873 | 7315 |
| 7874 | 7409 |
| 7875 | 7620 |
| 7876 | 7447 |
| 7877 | 7643 |
| 7878 | 7675 |
| 7879 | 7813 |
| 7880 | 7513 |
| 7881 | 7705 |
| 7882 | 7672 |
| 7883 | 7837 |
| 7884 | 7734 |
| 7885 | 7856 |
| 7886 | 7880 |
| 7887 | 7969 |
| 7888 | 7564 |
| 7889 | 7693 |
| 7890 | 7743 |
| 7891 | 7864 |
| 7892 | 7774 |
| 7893 | 7887 |
| 7894 | 7901 |
| 7895 | 7993 |
| 7896 | 7799 |
| 7897 | 7912 |
| 7898 | 7929 |
| 7899 | 8008 |
| 7900 | 7944 |
| 7901 | 8026 |
| 7902 | 8042 |
| 7903 | 8104 |
| 7904 | 7610 |
| 7905 | 7760 |
| 7906 | 7796 |
| 7907 | 7896 |
| 7908 | 7821 |
| 7909 | 7918 |
| 7910 | 7934 |
| 7911 | 8023 |
| 7912 | 7842 |
| 7913 | 7939 |
| 7914 | 7956 |
| 7915 | 8038 |
| 7916 | 7974 |
| 7917 | 8048 |
| 7918 | 8060 |
| 7919 | 8114 |
| 7920 | 7874 |
| 7921 | 7965 |
| 7922 | 7989 |
| 7923 | 8053 |
| 7924 | 7996 |
| 7925 | 8066 |
| 7926 | 8071 |
| 7927 | 8121 |
| 7928 | 8012 |
| 7929 | 8077 |
| 7930 | 8083 |
| 7931 | 8130 |
| 7932 | 8097 |
| 7933 | 8141 |
| 7934 | 8153 |
| 7935 | 8167 |
| 7936 | 6027 |
| 7937 | 6573 |
| 7938 | 6786 |
| 7939 | 7206 |

TABLE Z9-continued

| with a sequence length of 8192: | |
|---|---|
| Polarized channel sequence number | Reliability or reliability sequence number |
| 7940 | 6913 |
| 7941 | 7242 |
| 7942 | 7324 |
| 7943 | 7522 |
| 7944 | 7007 |
| 7945 | 7298 |
| 7946 | 7368 |
| 7947 | 7545 |
| 7948 | 7406 |
| 7949 | 7597 |
| 7950 | 7615 |
| 7951 | 7794 |
| 7952 | 7067 |
| 7953 | 7344 |
| 7954 | 7385 |
| 7955 | 7587 |
| 7956 | 7467 |
| 7957 | 7640 |
| 7958 | 7688 |
| 7959 | 7805 |
| 7960 | 7498 |
| 7961 | 7683 |
| 7962 | 7656 |
| 7963 | 7831 |
| 7964 | 7726 |
| 7965 | 7855 |
| 7966 | 7877 |
| 7967 | 7982 |
| 7968 | 7121 |
| 7969 | 7422 |
| 7970 | 7483 |
| 7971 | 7645 |
| 7972 | 7509 |
| 7973 | 7668 |
| 7974 | 7697 |
| 7975 | 7843 |
| 7976 | 7557 |
| 7977 | 7718 |
| 7978 | 7742 |
| 7979 | 7862 |
| 7980 | 7768 |
| 7981 | 7886 |
| 7982 | 7903 |
| 7983 | 8002 |
| 7984 | 7606 |
| 7985 | 7749 |
| 7986 | 7778 |
| 7987 | 7897 |
| 7988 | 7797 |
| 7989 | 7919 |
| 7990 | 7927 |
| 7991 | 8010 |
| 7992 | 7828 |
| 7993 | 7935 |
| 7994 | 7954 |
| 7995 | 8028 |
| 7996 | 7970 |
| 7997 | 8046 |
| 7998 | 8056 |
| 7999 | 8116 |
| 8000 | 7270 |
| 8001 | 7450 |
| 8002 | 7535 |
| 8003 | 7714 |
| 8004 | 7577 |
| 8005 | 7731 |
| 8006 | 7759 |
| 8007 | 7882 |
| 8008 | 7621 |
| 8009 | 7789 |
| 8010 | 7755 |
| 8011 | 7907 |
| 8012 | 7810 |
| 8013 | 7921 |
| 8014 | 7946 |

TABLE Z9-continued

| with a sequence length of 8192: | |
|---|---|
| Polarized channel sequence number | Reliability or reliability sequence number |
| 8015 | 8020 |
| 8016 | 7663 |
| 8017 | 7772 |
| 8018 | 7823 |
| 8019 | 7933 |
| 8020 | 7850 |
| 8021 | 7952 |
| 8022 | 7964 |
| 8023 | 8036 |
| 8024 | 7873 |
| 8025 | 7975 |
| 8026 | 7986 |
| 8027 | 8049 |
| 8028 | 8000 |
| 8029 | 8067 |
| 8030 | 8075 |
| 8031 | 8127 |
| 8032 | 7701 |
| 8033 | 7839 |
| 8034 | 7865 |
| 8035 | 7960 |
| 8036 | 7894 |
| 8037 | 7980 |
| 8038 | 7991 |
| 8039 | 8062 |
| 8040 | 7911 |
| 8041 | 7995 |
| 8042 | 8004 |
| 8043 | 8070 |
| 8044 | 8024 |
| 8045 | 8080 |
| 8046 | 8090 |
| 8047 | 8132 |
| 8048 | 7941 |
| 8049 | 8014 |
| 8050 | 8030 |
| 8051 | 8085 |
| 8052 | 8039 |
| 8053 | 8094 |
| 8054 | 8100 |
| 8055 | 8137 |
| 8056 | 8052 |
| 8057 | 8103 |
| 8058 | 8109 |
| 8059 | 8146 |
| 8060 | 8119 |
| 8061 | 8154 |
| 8062 | 8162 |
| 8063 | 8173 |
| 8064 | 7172 |
| 8065 | 7438 |
| 8066 | 7568 |
| 8067 | 7763 |
| 8068 | 7631 |
| 8069 | 7785 |
| 8070 | 7836 |
| 8071 | 7938 |
| 8072 | 7676 |
| 8073 | 7815 |
| 8074 | 7857 |
| 8075 | 7950 |
| 8076 | 7881 |
| 8077 | 7972 |
| 8078 | 7984 |
| 8079 | 8073 |
| 8080 | 7709 |
| 8081 | 7848 |
| 8082 | 7870 |
| 8083 | 7968 |
| 8084 | 7910 |
| 8085 | 7994 |
| 8086 | 8022 |
| 8087 | 8076 |
| 8088 | 7924 |
| 8089 | 8017 |

TABLE Z9-continued

| with a sequence length of 8192: | |
|---|---|
| Polarized channel sequence number | Reliability or reliability sequence number |
| 8090 | 8007 |
| 8091 | 8086 |
| 8092 | 8041 |
| 8093 | 8095 |
| 8094 | 8106 |
| 8095 | 8144 |
| 8096 | 7738 |
| 8097 | 7890 |
| 8098 | 7917 |
| 8099 | 7999 |
| 8100 | 7930 |
| 8101 | 8015 |
| 8102 | 8025 |
| 8103 | 8092 |
| 8104 | 7958 |
| 8105 | 8037 |
| 8106 | 8047 |
| 8107 | 8096 |
| 8108 | 8058 |
| 8109 | 8108 |
| 8110 | 8115 |
| 8111 | 8151 |
| 8112 | 7976 |
| 8113 | 8050 |
| 8114 | 8065 |
| 8115 | 8113 |
| 8116 | 8074 |
| 8117 | 8120 |
| 8118 | 8123 |
| 8119 | 8156 |
| 8120 | 8082 |
| 8121 | 8128 |
| 8122 | 8134 |
| 8123 | 8161 |
| 8124 | 8139 |
| 8125 | 8166 |
| 8126 | 8170 |
| 8127 | 8183 |
| 8128 | 7801 |
| 8129 | 7900 |
| 8130 | 7945 |
| 8131 | 8034 |
| 8132 | 7963 |
| 8133 | 8045 |
| 8134 | 8055 |
| 8135 | 8107 |
| 8136 | 7990 |
| 8137 | 8068 |
| 8138 | 8054 |
| 8139 | 8117 |
| 8140 | 8079 |
| 8141 | 8122 |
| 8142 | 8131 |
| 8143 | 8158 |
| 8144 | 8011 |
| 8145 | 8063 |
| 8146 | 8081 |
| 8147 | 8125 |
| 8148 | 8093 |
| 8149 | 8133 |
| 8150 | 8136 |
| 8151 | 8164 |
| 8152 | 8102 |
| 8153 | 8142 |
| 8154 | 8147 |
| 8155 | 8168 |
| 8156 | 8150 |
| 8157 | 8172 |
| 8158 | 8175 |
| 8159 | 8185 |
| 8160 | 8029 |
| 8161 | 8087 |
| 8162 | 8101 |
| 8163 | 8135 |
| 8164 | 8110 |

TABLE Z9-continued

| with a sequence length of 8192: | |
|---|---|
| Polarized channel sequence number | Reliability or reliability sequence number |
| 8165 | 8143 |
| 8166 | 8148 |
| 8167 | 8171 |
| 8168 | 8118 |
| 8169 | 8149 |
| 8170 | 8155 |
| 8171 | 8174 |
| 8172 | 8159 |
| 8173 | 8176 |
| 8174 | 8178 |
| 8175 | 8186 |
| 8176 | 8129 |
| 8177 | 8157 |
| 8178 | 8163 |
| 8179 | 8177 |
| 8180 | 8165 |
| 8181 | 8179 |
| 8182 | 8180 |
| 8183 | 8187 |
| 8184 | 8169 |
| 8185 | 8181 |
| 8186 | 8182 |
| 8187 | 8188 |
| 8188 | 8184 |
| 8189 | 8189 |
| 8190 | 8190 |
| 8191 | 8191 |

Sequence Z10, with a sequence length of 4096:

[0, 1, 2, 12, 3, 13, 16, 29, 4, 15, 18, 31, 20, 37, 39, 77, 5, 17, 19, 36, 24, 44, 52, 83, 26, 51, 47, 90, 60, 98, 108, 173, 6, 21, 25, 45, 28, 49, 55, 94, 32, 59, 64, 100, 71, 112, 120, 192, 38, 65, 74, 1 17, 78, 129, 135, 198, 88, 140, 152, 218, 163, 241, 259, 379, 14, 23, 30, 58, 35, 61, 69, 111, 41, 76, 67, 123, 84, 130, 146, 208, 48, 73, 87, 137, 97, 151, 160, 230, 107, 167, 176, 247, 189, 274, 288, 4 15, 56, 92, 104, 156, 116, 172, 181, 266, 125, 186, 194, 279, 213, 298, 318, 436, 142, 204, 223, 30 8, 234, 330, 339, 461, 251, 351, 366, 491, 391, 530, 588, 696, 7, 22, 33, 70, 43, 75, 91, 141, 50, 85, 99, 149, 110, 165, 175, 283, 57, 96, 106, 161, 124, 185, 212, 293, 132, 207, 195, 311, 235, 331, 35 4, 486, 62, 114, 127, 187, 136, 205, 217, 322, 153, 231, 243, 336, 263, 362, 375, 524, 170, 248, 27 2, 371, 287, 398, 407, 547, 304, 420, 445, 578, 466, 625, 660, 877, 82, 119, 144, 225, 158, 239, 25 7, 358, 180, 276, 254, 383, 295, 403, 429, 561, 200, 267, 302, 411, 326, 440, 456, 607, 348, 472, 4 95, 638, 516, 682, 720, 939, 222, 316, 343, 448, 367, 478, 505, 673, 387, 511, 538, 710, 570, 735, 771, 980, 424, 556, 596, 752, 617, 789, 807, 1026, 649, 830, 853, 1077, 910, 1154, 1250, 1417, 8, 27, 42, 95, 54, 101, 121, 182, 63, 115, 134, 193, 143, 216, 224, 341, 72, 126, 138, 211, 164, 237, 2 64, 353, 174, 262, 246, 378, 289, 399, 425, 584, 80, 150, 168, 240, 178, 252, 269, 389, 197, 285, 3 01, 408, 321, 437, 458, 629, 220, 307, 328, 452, 344, 480, 493, 642, 373, 506, 535, 684, 564, 728, 764, 992, 109, 159, 188, 282, 206, 294, 313, 432, 228, 337, 309, 463, 357, 483, 521, 666, 250, 32 4, 369, 501, 396, 533, 552, 703, 421, 571, 593, 741, 624, 793, 819, 1056, 273, 385, 413, 544, 447, 582, 603, 776, 471, 613, 632, 803, 677, 840, 873, 1095, 514, 653, 692, 858, 713, 894, 914, 1134, 749, 932, 962, 1192, 1014, 1262, 1344, 1524, 89, 154, 202, 317, 232, 334, 380, 509, 258, 361, 40 4, 528, 431, 567, 592, 812, 278, 392, 417, 557, 468, 609, 670, 826, 487, 663, 635, 863, 716, 899, 9 43, 1183, 297, 442, 476, 620, 498, 656, 681, 884, 542, 707, 731, 903, 767, 955, 987, 1238, 575, 7 45, 785, 974, 816, 1019, 1041, 1282, 848, 1063, 1111, 1332, 1143, 1400, 1468, 1799, 349, 455, 5 20, 699, 549, 724, 760, 951, 600, 798, 756, 999, 833, 1033, 1084, 1306, 646, 781, 844, 1048, 888, 1102, 1127, 1373, 926, 1163, 1200, 1431, 1229, 1500, 1564, 1889, 688, 869, 920, 1119, 968, 11 71, 1212, 1485, 1007, 1221, 1274, 1542, 1318, 1587, 1634, 1945, 1069, 1294, 1356, 1612, 138 7, 1665, 1693, 2005, 1448, 1727, 1762, 2081, 1841, 2173, 2299, 2509, 9, 34, 53, 131, 68, 139, 16 2, 244, 81, 155, 177, 255, 191, 281, 290, 434, 93, 171, 184, 275, 215, 310, 342, 450, 226, 338, 319, 473, 372, 500, 525, 704, 103, 196, 221, 315, 238, 329, 350, 484, 260, 368, 390, 507, 409, 540, 56 2, 751, 286, 395, 423, 554, 439, 587, 601, 770, 465, 615, 647, 817, 676, 871, 913, 1160, 147, 210, 249, 363, 271, 376, 402, 537, 296, 430, 397, 569, 453, 590, 633, 795, 323, 418, 462, 608, 496, 64 4, 669, 842, 523, 689, 715, 881, 747, 946, 976, 1228, 356, 481, 515, 658, 551, 700, 726, 928, 577, 738, 759, 958, 805, 998, 1039, 1265, 621, 780, 827, 1017, 854, 1062, 1081, 1309, 893, 1105, 11 33, 1361, 1186, 1425, 1516, 1684, 113, 203, 265, 405, 305, 426, 477, 618, 332, 457, 502, 637, 53 4, 686, 712, 964, 360, 492, 518, 672, 574, 734, 802, 983, 595, 791, 762, 1023, 857, 1066, 1113, 1 350, 381, 543, 583, 739, 605, 784, 813, 1045, 650, 846, 875, 1074, 919, 1130, 1151, 1414, 697, 8 86, 936, 1146, 971, 1197, 1215, 1453, 1009, 1235, 1279, 1505, 1315, 1575, 1626, 1957, 446, 55 8, 630, 836, 661, 864, 906, 1122, 723, 948, 901, 1169, 990, 1206, 1253, 1474, 774, 930, 1004, 12 24, 1054, 1271, 1300, 1547, 1098, 1329, 1367, 1595, 1404, 1662, 1721, 2039, 823, 1032, 1090, 1288, 1137, 1338, 1380, 1648, 1177, 1393, 1439, 1707, 1488, 1746, 1804, 2095, 1244, 1463, 1 531, 1771, 1559, 1825, 1853, 2149, 1609, 1883, 1919, 2215, 1997, 2308, 2420, 2617, 122, 233, 300, 488, 347, 510, 565, 730, 386, 548, 599, 755, 626, 809, 832, 1087, 414, 580, 612, 799, 680, 8 60, 923, 1108, 708, 916, 880, 1157, 978, 1203, 1247, 1511, 441, 641, 693, 867, 719, 897, 935, 11 80, 766, 967, 1002, 1218, 1044, 1268, 1303, 1579, 822, 1011, 1059, 1291, 1092, 1341, 1364, 16 00, 1149, 1384, 1434, 1670, 1479, 1737, 1788, 2111, 529, 665, 744, 959, 788, 986, 1029, 1259, 837, 1080, 1021, 1312, 1116, 1347, 1411, 1639, 890, 1051, 1140, 1376, 1194, 1428, 1460, 1698, 1241, 1493, 1527, 1752, 1570, 1830, 1872, 2190, 942, 1174, 1226, 1445, 1285, 1508, 1539, 18 10, 1326, 1555, 1584, 1847, 1651, 1900, 1951, 2232, 1397, 1617, 1679, 1925, 1712, 1977, 201 1, 2279, 1768, 2033, 2065, 2350, 2133, 2432, 2539, 2730, 469, 654, 778, 1036, 850, 1072, 1166, 1390, 907, 1125, 1209, 1422, 1256, 1482, 1519, 1860, 952, 1189, 1232, 1471, 1323, 1550, 164 3, 1877, 1353, 1631, 1592, 1931, 1718, 1985, 2047, 2339, 995, 1277, 1335, 1567, 1370, 1621, 1 657, 1963, 1442, 1704, 1743, 1991, 1793, 2059, 2103, 2406, 1496, 1757, 1819, 2087, 1866, 21 41, 2165, 2455, 1914, 2198, 2251, 2524, 2288, 2601, 2671, 3002, 1101, 1297, 1407, 1690, 145 6, 1732, 1782, 2051, 1535, 1836, 1777, 2117, 1894, 2157, 2224, 2482, 1604, 1815, 1906, 2182, 1971, 2243, 2269, 2567, 2025, 2319, 2362, 2633, 2394, 2710, 2773, 3083, 1676, 1937, 2019, 2 260, 2073, 2330, 2373, 2688, 2125, 2385, 2443, 2750, 2494, 2797, 2846, 3134, 2207, 2470, 25 52, 2822, 2583, 2875, 2904, 3187, 2652, 2933, 2967, 3252, 3042, 3328, 3433, 3584, 10, 40, 66, 179, 86, 190, 219, 320, 102, 209, 236, 333, 253, 370, 382, 560, 118, 227, 245, 364, 284, 406, 444, 581, 299, 438, 416, 606, 485, 639, 671, 876, 133, 261, 291, 412, 312, 428, 460, 623, 340, 479, 50 3, 648, 531, 687, 714, 927, 377, 508, 545, 705, 563, 742, 761, 947, 597, 779, 814, 996, 849, 1055, 1097, 1366, 201, 277, 327, 474, 359, 489, 522, 683, 388, 555, 513, 725, 586, 746, 796, 972, 422, 541, 594, 769, 636, 810, 839, 1025, 667, 859, 885, 1067, 922, 1132, 1164, 1440, 464, 614, 659, 8 28, 702, 872, 898, 1115, 733, 911, 934, 1144, 984, 1187, 1234, 1480, 786, 960, 1010, 1208, 1037, 1260, 1281, 1529, 1078, 1308, 1337, 1585, 1392, 1658, 1759, 1933, 145, 270, 346, 527, 400, 5 50, 611, 783, 433, 589, 643, 804, 678, 855, 882, 1153, 470, 631, 664, 841, 729, 909, 982, 1173, 7 54, 970, 938, 1216, 1040, 1263, 1314, 1577, 494, 694, 740, 915, 765, 963, 994, 1243, 818, 1028, 1058, 1272, 1106, 1331, 1358, 1646, 866, 1070, 1126, 1349, 1161, 1406, 1423, 1686, 1199, 145 0, 1498, 1741, 1540, 1821, 1875, 2188, 576, 709, 794, 1015, 831, 1049, 1091, 1321, 895, 1139, 1085, 1375, 1179, 1415, 1466, 1711, 950, 1118, 1196, 1433, 1251, 1490, 1521, 1790, 1299, 155 2, 1594, 1843, 1633, 1912, 1973, 2266, 1006, 1225, 1290, 1506, 1340, 1562, 1610, 1898, 1383, 1624, 1672, 1955, 1728, 1995, 2048, 2317, 1458, 1702, 1773, 2021, 1806, 2071, 2097, 2371, 1 858, 2127, 2155, 2429, 2230, 2517, 2622, 2794, 157, 306, 394, 627, 454, 652, 718, 902, 499, 69 8, 757, 931, 790, 991, 1013, 1284, 536, 736, 773, 979, 851, 1043, 1109, 1311, 879, 1104, 1065, 1 363, 1167, 1409, 1461, 1753, 568, 808, 862, 1052, 892, 1083, 1120, 1386, 944, 1156, 1193, 142 6, 1240, 1484, 1526, 1827, 1000, 1205, 1254, 1513, 1293, 1565, 1590, 1849, 1355, 1614, 1667, 1916, 1716, 1983, 2037, 2332, 675, 835, 918, 1150, 966, 1176, 1219, 1476, 1022, 1275, 1210, 1 534, 1320, 1572, 1641, 1887, 1076, 1248, 1346, 1605, 1401, 1660, 1697, 1943, 1452, 1730, 17 66, 2003, 1817, 2077, 2113, 2408, 1129, 1378, 1436, 1683, 1503, 1748, 1784, 2053, 1549, 180 1, 1832, 2091, 1904, 2139, 2184, 2451, 1627, 1864, 1927, 2163, 1961, 2211, 2236, 2497, 2015, 2258, 2295, 2557, 2357, 2636, 2721, 2897, 602, 821, 954, 1231, 1030, 1269, 1369, 1619, 1094, 1328, 1418, 1653, 1472, 1723, 1764, 2101, 1142, 1395, 1444, 1705, 1544, 1795, 1893, 2121, 1 580, 1881, 1838, 2169, 1967, 2217, 2273, 2547, 1184, 1495, 1557, 1812, 1599, 1870, 1910, 21 96, 1677, 1949, 1989, 2221, 2043, 2286, 2326, 2609, 1736, 2009, 2067, 2310, 2107, 2364, 238 9, 2657, 2151, 2415, 2467, 2707, 2504, 2779, 2843, 3142, 1302, 1518, 1638, 1939, 1691, 1979, 2031, 2282, 1779, 2083, 2027, 2341, 2131, 2380, 2439, 2682, 1855, 2061, 2145, 2399, 2203, 2 460, 2487, 2753, 2249, 2527, 2565, 2809, 2598, 2878, 2937, 3212, 1921, 2178, 2245, 2477, 23 04, 2534, 2578, 2862, 2348, 2588, 2646, 2917, 2696, 2957, 2999, 3257, 2422, 2668, 2736, 298 1, 2765, 3027, 3053, 3298, 2828, 3079, 3110, 3358, 3174, 3421, 3510, 3644, 169, 352, 449, 750, 517, 775, 845, 1060, 573, 824, 889, 1088, 924, 1147, 1170, 1477, 619, 868, 905, 1136, 988, 121 3, 1287, 1509, 1018, 1278, 1237, 1554, 1352, 1602, 1650, 1947, 655, 940, 1003, 1222, 1047, 12 57, 1305, 1574, 1099, 1343, 1389, 1616, 1429, 1674, 1714, 2017, 1159, 1398, 1455, 1700, 148 7, 1755, 1781, 2045, 1537, 1802, 1856, 2109, 1902, 2180, 2234, 2522, 800, 975, 1073, 1334, 11 23, 1360, 1412, 1669, 1182, 1469, 1403, 1725, 1514, 1761, 1834, 2079, 1245, 1447, 1532, 179 1, 1597, 1851, 1891, 2143, 1645, 1923, 1965, 2194, 2013, 2275, 2312, 2596, 1317, 1569, 1629, 1873, 1695, 1941, 1981, 2253, 1739, 1999, 2029, 2290, 2093, 2337, 2387, 2638, 1814, 2057, 2 123, 2360, 2159, 2413, 2436, 2685, 2209, 2463, 2492, 2738, 2549, 2803, 2891, 3045, 691, 956, 1112, 1420, 1202, 1464, 1560, 1808, 1266, 1522, 1607, 1840, 1663, 1918, 1959, 2297, 1325, 1 589, 1636, 1896, 1734, 1993, 2089, 2321, 1770, 2075, 2035, 2369, 2161, 2417, 2472, 2727, 13 72, 1681, 1750, 2001, 1786, 2063, 2105, 2396, 1862, 2147, 2186, 2427, 2241, 2489, 2514, 279 1, 1935, 2200, 2264, 2507, 2306, 2562, 2580, 2831, 2353, 2606, 2654, 2881, 2693, 2947, 2992, 3266, 1501, 1709, 1828, 2135, 1879, 2171, 2226, 2480, 1975, 2277, 2219, 2532, 2328, 2572, 2 625, 2853, 2049, 2256, 2346, 2591, 2403, 2644, 2676, 2920, 2453, 2704, 2744, 2964, 2782, 30 24, 3075, 3323, 2119, 2378, 2446, 2663, 2499, 2716, 2759, 3013, 2542, 2771, 2816, 3064, 286 5, 3098, 3146, 3368, 2614, 2840, 2907, 3118, 2930, 3162, 3183, 3405, 2978, 3208, 3234, 3456, 3294, 3516, 3591, 3702, 721, 1034, 1190, 1582, 1296, 1622, 1720, 1987, 1381, 1688, 1775, 20 23, 1823, 2099, 2129, 2441, 1437, 1744, 1797, 2085, 1908, 2167, 2247, 2465, 1953, 2238, 219 2, 2519, 2315, 2570, 2620, 2888, 1492, 1845, 1929, 2176, 1969, 2213, 2262, 2544, 2041, 2301, 2344, 2585, 2392, 2641, 2679, 2950, 2115, 2355, 2410, 2665, 2448, 2718, 2741, 2971, 2512, 2 762, 2812, 3031, 2856, 3090, 3130, 3378, 1655, 1885, 2007, 2292, 2069, 2323, 2376, 2630, 21 37, 2434, 2366, 2690, 2475, 2724, 2788, 3006, 2205, 2401, 2502, 2756, 2560, 2806, 2837, 305 7, 2612, 2868, 2900, 3102, 2944, 3166, 3200, 3438, 2271, 2537, 2593, 2825, 2660, 2884, 2914, 3150, 2701, 2927, 2954, 3178, 3016, 3221, 3261, 3467, 2776, 2985, 3038, 3239, 3068, 3280, 3 303, 3497, 3114, 3318, 3347, 3542, 3394, 3598, 3660, 3760, 1545, 1868, 2055, 2382, 2153, 24 24, 2529, 2768, 2228, 2484, 2575, 2800, 2628, 2859, 2894, 3191, 2284, 2554, 2604, 2849, 269 9, 2923, 3009, 3204, 2733, 2995, 2960, 3243, 3072, 3284, 3332, 3536, 2335, 2649, 2713, 2940, 2747, 2988, 3020, 3270, 2819, 3060, 3094, 3289, 3138, 3342, 3373, 3576, 2872, 3106, 3158, 3 363, 3195, 3400, 3416, 3613, 3230, 3444, 3479, 3652, 3504, 3694, 3730, 3881, 2458, 2674, 27 85, 3049, 2834, 3087, 3126, 3337, 2910, 3170, 3122, 3384, 3217, 3410, 3461, 3628, 2974, 315 4, 3225, 3427, 3275, 3473, 3491, 3676, 3313, 3523, 3549, 3712, 3569, 3750, 3781, 3912, 3034, 3248, 3308, 3485, 3352, 3529, 3556, 3740, 3389, 3563, 3605, 3770, 3636, 3792, 3815, 3929, 3 450, 3620, 3668, 3803, 3685, 3827, 3840, 3947, 3721, 3853, 3866, 3968, 3896, 3990, 4016, 40 49, 11, 46, 79, 242, 105, 256, 292, 419, 128, 280, 314, 435, 335, 482, 497, 722, 148, 303, 325, 475, 374, 532, 579, 748, 393, 572, 546, 782, 628, 820, 861, 1103, 166, 345, 384, 539, 410, 559, 598, 8 01, 443, 622, 651, 829, 690, 878, 912, 1165, 490, 657, 706, 900, 727, 945, 969, 1185, 772, 989, 1 031, 1242, 1071, 1310, 1357, 1642, 268, 365, 427, 616, 467, 634, 679, 874, 512, 717, 668, 925, 7 53, 949, 1012, 1214, 553, 701, 768, 977, 815, 1027, 1061, 1276, 856, 1082, 1114, 1324, 1155, 1 396, 1432, 1717, 604, 792, 847, 1046, 896, 1100, 1131, 1377, 933, 1145, 1172, 1410, 1230, 145 7, 1504, 1758, 997, 1201, 1258, 1481, 1289, 1533, 1553, 1807, 1336, 1581, 1613, 1863, 1668, 1 934, 2032, 2210, 183, 355, 451, 685, 526, 711, 787, 993, 566, 758, 825, 1020, 870, 1079, 1110, 1 419, 610, 811, 852, 1064, 929, 1141, 1227, 1443, 957, 1211, 1175, 1489, 1292, 1536, 1588, 185 4, 640, 887, 941, 1148, 973, 1204, 1239, 1515, 1035, 1280, 1313, 1546, 1368, 1606, 1632, 1924, 1093, 1327, 1391, 1625, 1430, 1682, 1701, 1962, 1470, 1726, 1776, 2016, 1818, 2096, 2154, 2 469, 743, 908, 1005, 1264, 1053, 1304, 1351, 1596, 1128, 1402, 1345, 1652, 1449, 1692, 1745, 1986, 1188, 1379, 1467, 1708, 1523, 1767, 1798, 2066, 1573, 1829, 1871, 2118, 1909, 2189, 2 248, 2548, 1255, 1499, 1563, 1783, 1615, 1839, 1888, 2175, 1659, 1901, 1948, 2233, 2002, 22 70, 2324, 2599, 1735, 1978, 2046, 2296, 2082, 2349, 2374, 2653, 2136, 2405, 2437, 2711, 251 1, 2795, 2892, 3047, 199, 401, 519, 806, 591, 834, 917, 1135, 645, 891, 965, 1168, 1001, 1236, 1 261, 1558, 695, 937, 981, 1223, 1075, 1298, 1371, 1586, 1107, 1365, 1322, 1640, 1435, 1685, 1 738, 2026, 732, 1024, 1086, 1307, 1121, 1339, 1382, 1664, 1181, 1424, 1465, 1703, 1512, 176 0, 1803, 2102, 1249, 1478, 1528, 1789, 1566, 1844, 1867, 2124, 1630, 1890, 1942, 2193, 1992, 2259, 2313, 2613, 865, 1057, 1152, 1416, 1207, 1446, 1494, 1751, 1273, 1548, 1483, 1811, 15 93, 1848, 1917, 2164, 1333, 1520, 1620, 1882, 1678, 1938, 1972, 2222, 1729, 2004, 2040, 228 0, 2094, 2354, 2391, 2687, 1394, 1654, 1713, 1958, 1780, 2022, 2060, 2331, 1826, 2076, 2108, 2368, 2181, 2419, 2464, 2731, 1905, 2142, 2204, 2444, 2237, 2491, 2516, 2774, 2291, 2540, 2 576, 2833, 2639, 2903, 2982, 3137, 777, 1038, 1195, 1502, 1283, 1543, 1644, 1897, 1354, 160 3, 1694, 1930, 1749, 1996, 2038, 2381, 1408, 1671, 1722, 1980, 1820, 2070, 2170, 2400, 1857, 2158, 2112, 2450, 2242, 2498, 2553, 2824, 1454, 1772, 1835, 2088, 1876, 2148, 2187, 2478, 1 954, 2227, 2265, 2503, 2318, 2568, 2607, 2880, 2010, 2285, 2343, 2590, 2386, 2645, 2670, 29 24, 2430, 2695, 2748, 2970, 2783, 3032, 3091, 3343, 1576, 1796, 1915, 2216, 1966, 2254, 230 7, 2563, 2054, 2361, 2302, 2621, 2411, 2661, 2719, 2946, 2130, 2338, 2425, 2678, 2483, 2739, 2766, 3008, 2531, 2804, 2842, 3059, 2871, 3117, 3169, 3402, 2199, 2459, 2525, 2757, 2584, 2 813, 2854, 3105, 2631, 2863, 2915, 3152, 2958, 3188, 3224, 3437, 2702, 2935, 2993, 3207, 30 21, 3247, 3268, 3474, 3074, 3292, 3317, 3520, 3371, 3574, 3642, 3744, 214, 459, 585, 953, 674, 985, 1068, 1316, 737, 1042, 1117, 1348, 1162, 1413, 1438, 1756, 797, 1096, 1138, 1399, 1233, 1486, 1561, 1787, 1267, 1551, 1507, 1831, 1628, 1880, 1926, 2223, 843, 1178, 1252, 1497, 13 01, 1530, 1578, 1850, 1359, 1618, 1666, 1892, 1706, 1950, 1988, 2294, 1427, 1675, 1733, 197 4, 1765, 2030, 2056, 2322, 1816, 2080, 2132, 2388, 2179, 2461, 2515, 2801, 1016, 1220, 1330, 1608, 1388, 1635, 1689, 1946, 1451, 1747, 1680, 2000, 1792, 2036, 2110, 2358, 1517, 1724, 1 809, 2068, 1874, 2128, 2168, 2423, 1922, 2201, 2240, 2474, 2289, 2556, 2594, 2870, 1591, 18 46, 1907, 2150, 1970, 2218, 2257, 2535, 2014, 2274, 2305, 2571, 2372, 2619, 2667, 2906, 209 0, 2336, 2402, 2642, 2438, 2694, 2715, 2949, 2490, 2742, 2772, 2997, 2827, 3054, 3131, 3262, 883, 1198, 1374, 1696, 1473, 1740, 1837, 2084, 1538, 1800, 1884, 2116, 1940, 2195, 2235, 25 79, 1601, 1865, 1913, 2174, 2008, 2268, 2367, 2602, 2044, 2352, 2311, 2650, 2442, 2698, 275 1, 2987, 1647, 1956, 2024, 2276, 2062, 2342, 2383, 2675, 2138, 2428, 2466, 2708, 2523, 2769, 2792, 3044, 2212, 2481, 2545, 2786, 2587, 2839, 2857, 3078, 2632, 2877, 2921, 3121, 2955, 3 179, 3218, 3445, 1778, 1982, 2104, 2414, 2156, 2452, 2506, 2760, 2252, 2559, 2500, 2810, 26 10, 2848, 2895, 3096, 2327, 2536, 2627, 2866, 2684, 2912, 2941, 3156, 2734, 2968, 3003, 319 4, 3036, 3245, 3288, 3494, 2397, 2659, 2725, 2929, 2777, 2976, 3014, 3235, 2818, 3026, 3066, 3278, 3108, 3306, 3346, 3528, 2886, 3086, 3143, 3324, 3165, 3360, 3379, 3560, 3205, 3398, 3 422, 3597, 3469, 3647, 3703, 3790, 921, 1286, 1462, 1859, 1571, 1899, 1994, 2263, 1656, 196 4, 2052, 2300, 2098, 2377, 2409, 2722, 1715, 2018, 2074, 2363, 2185, 2447, 2528, 2745, 2229, 2520, 2473, 2798, 2595, 2845, 2889, 3127, 1769, 2122, 2206, 2456, 2246, 2495, 2543, 2821, 2 316, 2582, 2624, 2860, 2673, 2909, 2943, 3181, 2395, 2635, 2691, 2932, 2728, 2979, 3000, 31 98, 2789, 3018, 3062, 3251, 3100, 3300, 3335, 3538, 1932, 2162, 2283, 2573, 2347, 2605, 265 6, 2901, 2416, 2714, 2647, 2952, 2754, 2984, 3041, 3228, 2486, 2681, 2780, 3011, 2836, 3056, 3084, 3272, 2883, 3112, 3140, 3310, 3175, 3364, 3391, 3583, 2551, 2815, 2869, 3071, 2926, 3 124, 3149, 3350, 2965, 3163, 3185, 3375, 3237, 3409, 3441, 3607, 3029, 3211, 3258, 3425, 32 82, 3457, 3477, 3632, 3321, 3490, 3511, 3669, 3551, 3708, 3757, 3835, 1822, 2144, 2333, 266 4, 2433, 2705, 2807, 3023, 2508, 2763, 2851, 3051, 2898, 3103, 3133, 3383, 2564, 2830, 2874, 3093, 2962, 3159, 3231, 3395, 2990, 3222, 3192, 3429, 3286, 3462, 3499, 3663, 2616, 2918, 2 973, 3172, 3005, 3214, 3241, 3448, 3069, 3276, 3304, 3465, 3339, 3507, 3533, 3696, 3115, 33 14, 3356, 3524, 3387, 3555, 3570, 3719, 3418, 3588, 3617, 3751, 3637, 3784, 3812, 3927, 273 7, 2938, 3039, 3265, 3081, 3296, 3331, 3502, 3147, 3367, 3327, 3541, 3406, 3565, 3602, 3732, 3201, 3354, 3413, 3579, 3453, 3612, 3626, 3769, 3486, 3653, 3674, 3797, 3690, 3828, 3851, 3 951, 3255, 3432, 3482, 3622, 3515, 3658, 3680, 3819, 3546, 3686, 3714, 3843, 3737, 3860, 38 77, 3964, 3593, 3726, 3763, 3869, 3776, 3887, 3897, 3978, 3805, 3906, 3917, 3994, 3939, 401 0, 4031, 4056, 229, 504, 662, 1124, 763, 1158, 1246, 1510, 838, 1217, 1295, 1541, 1342, 1623, 1649, 1984, 904, 1270, 1319, 1611, 1421, 1699, 1774, 2020, 1459, 1763, 1719, 2064, 1852, 21 20, 2172, 2468, 961, 1362, 1441, 1710, 1491, 1742, 1805, 2092, 1556, 1842, 1886, 2134, 1936, 2197, 2239, 2533, 1637, 1895, 1960, 2225, 1990, 2281, 2309, 2558, 2050, 2334, 2384, 2618, 2 431, 2686, 2732, 3001, 1191, 1405, 1525, 1833, 1598, 1861, 1920, 2191, 1661, 1976, 1903, 22 55, 2028, 2287, 2359, 2589, 1731, 1952, 2042, 2320, 2114, 2379, 2418, 2651, 2166, 2445, 247 9, 2700, 2526, 2770, 2805, 3067, 1813, 2078, 2152, 2404, 2220, 2462, 2496, 2752, 2267, 2513, 2541, 2784, 2603, 2829, 2876, 3101, 2345, 2574, 2634, 2850, 2666, 2902, 2922, 3141, 2712, 2 948, 2975, 3186, 3025, 3242, 3315, 3430, 1008, 1385, 1568, 1928, 1687, 1968, 2072, 2340, 17 54, 2034, 2126, 2370, 2183, 2440, 2476, 2793, 1824, 2106, 2160, 2421, 2261, 2510, 2600, 281 4, 2298, 2586, 2546, 2858, 2669, 2905, 2953, 3180, 1869, 2208, 2278, 2518, 2314, 2577, 2615, 2885, 2390, 2655, 2689, 2913, 2743, 2969, 2994, 3233, 2454, 2703, 2764, 2986, 2802, 3037, 3 052, 3263, 2841, 3076, 3116, 3302, 3151, 3357, 3393, 3582, 2012, 2231, 2356, 2640, 2407, 26 80, 2726, 2961, 2493, 2778, 2720, 3010, 2820, 3046, 3089, 3281, 2561, 2755, 2838, 3061, 289 3, 3109, 3135, 3336, 2939, 3160, 3193, 3372, 3223, 3417, 3454, 3625, 2629, 2867, 2931, 3123, 2977, 3168, 3206, 3408, 3017, 3216, 3253, 3443, 3293, 3468, 3500, 3651, 3082, 3274, 3325, 3 483, 3348, 3514, 3530, 3679, 3382, 3547, 3564, 3707, 3606, 3747, 3793, 3859, 1050, 1475, 16 73, 2100, 1794, 2140, 2244, 2501, 1878, 2214, 2303, 2538, 2351, 2611, 2637, 2925, 1944, 227 2, 2325, 2597, 2435, 2672, 2746, 2951, 2471, 2740, 2697, 2998, 2808, 3040, 3085, 3311, 1998, 2375, 2449, 2683, 2488, 2717, 2758, 3019, 2555, 2796, 2835, 3055, 2882, 3104, 3139, 3361, 2 623, 2847, 2896, 3128, 2934, 3171, 3190, 3376, 2991, 3209, 3249, 3419, 3285, 3460, 3493, 36 59, 2177, 2412, 2521, 2790, 2581, 2817, 2861, 3097, 2648, 2916, 2852, 3145, 2959, 3176, 322 9, 3401, 2709, 2890, 2983, 3202, 3033, 3244, 3271, 3436, 3077, 3295, 3320, 3472, 3355, 3518, 3539, 3697, 2767, 3012, 3063, 3260, 3120, 3307, 3333, 3503, 3157, 3344, 3365, 3526, 3412, 3 554, 3580, 3717, 3219, 3386, 3426, 3568, 3447, 3595, 3609, 3738, 3480, 3621, 3640, 3765, 36 72, 3798, 3832, 3894, 2058, 2393, 2566, 2873, 2658, 2911, 3004, 3213, 2729, 2966, 3048, 323 8, 3095, 3290, 3319, 3532, 2781, 3028, 3070, 3277, 3153, 3340, 3404, 3544, 3182, 3397, 3369, 3572, 3451, 3599, 3629, 3761, 2826, 3113, 3164, 3351, 3197, 3390, 3415, 3587, 3256, 3440, 3 464, 3601, 3496, 3635, 3656, 3787, 3299, 3476, 3512, 3648, 3535, 3675, 3688, 3807, 3561, 37 00, 3725, 3826, 3742, 3854, 3876, 3966, 2942, 3132, 3227, 3434, 3267, 3458, 3489, 3633, 332 9, 3521, 3487, 3664, 3550, 3683, 3711, 3817, 3380, 3508, 3558, 3692, 3590, 3722, 3734, 3844, 3616, 3752, 3768, 3864, 3783, 3888, 3907, 3984, 3423, 3577, 3614, 3729, 3645, 3755, 3774, 3 883, 3667, 3778, 3802, 3901, 3822, 3914, 3926, 3995, 3704, 3811, 3837, 3921, 3848, 3935, 39 42, 4004, 3871, 3950, 3958, 4017, 3975, 4029, 4044, 4064, 1089, 1583, 1785, 2293, 1911, 232 9, 2426, 2692, 2006, 2398, 2485, 2723, 2530, 2787, 2811, 3099, 2086, 2457, 2505, 2775, 2608, 2855, 2928, 3125, 2643, 2919, 2879, 3161, 2989, 3199, 3236, 3439, 2146, 2550, 2626, 2864, 2 677, 2899, 2945, 3177, 2735, 2980, 3022, 3210, 3058, 3254, 3283, 3481, 2799, 3030, 3080, 32 73, 3107, 3312, 3330, 3498, 3148, 3345, 3381, 3537, 3411, 3578, 3608, 3749, 2365, 2592, 270 6, 2972, 2761, 2996, 3043, 3250, 2823, 3092, 3035, 3291, 3129, 3316, 3366, 3519, 2887, 3073, 3144, 3338, 3196, 3377, 3403, 3557, 3232, 3424, 3449, 3586, 3478, 3630, 3649, 3782, 2956, 3 173, 3220, 3392, 3269, 3435, 3459, 3618, 3301, 3470, 3488, 3638, 3527, 3662, 3687, 3799, 33 53, 3506, 3545, 3673, 3566, 3699, 3710, 3818, 3594, 3723, 3736, 3838, 3762, 3862, 3892, 394 0, 2202, 2569, 2749, 3050, 2844, 3088, 3167, 3349, 2908, 3136, 3203, 3370, 3246, 3420, 3446, 3641, 2963, 3189, 3226, 3407, 3297, 3466, 3525, 3654, 3322, 3517, 3492, 3678, 3567, 3701, 3 727, 3834, 3007, 3259, 3309, 3471, 3334, 3509, 3534, 3691, 3385, 3559, 3581, 3706, 3611, 37 35, 3746, 3858, 3431, 3589, 3624, 3743, 3646, 3767, 3775, 3872, 3670, 3786, 3806, 3889, 382 1, 3910, 3924, 3997, 3119, 3279, 3362, 3552, 3396, 3573, 3603, 3731, 3455, 3631, 3600, 3754, 3657, 3772, 3794, 3879, 3501, 3619, 3666, 3779, 3695, 3801, 3814, 3902, 3718, 3825, 3841, 3 916, 3855, 3934, 3949, 4009, 3543, 3682, 3715, 3809, 3739, 3830, 3846, 3931, 3758, 3850, 38 67, 3945, 3884, 3955, 3967, 4019, 3789, 3875, 3898, 3960, 3905, 3972, 3977, 4026, 3920, 398 3, 3989, 4035, 4003, 4045, 4057, 4071, 2250, 2662, 2832, 3184, 2936, 3215, 3287, 3463, 3015, 3264, 3326, 3484, 3359, 3531, 3548, 3713, 3065, 3305, 3341, 3522, 3414, 3571, 3615, 3724, 3 442, 3610, 3585, 3748, 3650, 3771, 3791, 3891, 3111, 3374, 3428, 3575, 3452, 3596, 3623, 37 59, 3495, 3643, 3665, 3777, 3689, 3800, 3816, 3911, 3540, 3671, 3698, 3810, 3716, 3831, 383 9, 3918, 3745, 3847, 3865, 3936, 3880, 3953, 3963, 4021, 3240, 3399, 3475, 3639, 3513, 3655, 3681, 3796, 3553, 3709, 3677, 3820, 3728, 3833, 3857, 3928, 3592, 3693, 3741, 3845, 3766, 3 863, 3874, 3943, 3788, 3885, 3895, 3956, 3909, 3973, 3981, 4032, 3627, 3756, 3780, 3870, 38 08, 3890, 3900, 3969, 3824, 3904, 3913, 3976, 3932, 3986, 3996, 4037, 3852, 3922, 3938, 399 1, 3946, 4000, 4005, 4042, 3959, 4008, 4014, 4050, 4024, 4058, 4066, 4077, 3155, 3388, 3505, 3684, 3562, 3705, 3753, 3849, 3604, 3733, 3773, 3861, 3795, 3882, 3893, 3979, 3634, 3764, 3 785, 3878, 3823, 3903, 3930, 3982, 3836, 3925, 3915, 3992, 3948, 4001, 4011, 4048, 3661, 38 04, 3829, 3908, 3842, 3923, 3933, 3998, 3868, 3944, 3954, 4002, 3965, 4013, 4020, 4055, 388 6, 3957, 3971, 4018, 3980, 4025, 4028, 4060, 3988, 4033, 4039, 4065, 4043, 4070, 4074, 4087, 3720, 3813, 3856, 3941, 3873, 3952, 3962, 4012, 3899, 3974, 3961, 4022, 3985, 4027, 4036, 4 062, 3919, 3970, 3987, 4030, 3999, 4038, 4041, 4068, 4007, 4046, 4051, 4072, 4054, 4076, 40 79, 4089, 3937, 3993, 4006, 4040, 4015, 4047, 4052, 4075, 4023, 4053, 4059, 4078, 4063, 408 0, 4082, 4090, 4034, 4061, 4067, 4081, 4069, 4083, 4084, 4091, 4073, 4085, 4086, 4092, 4088, 4093, 4094, 4095]

TABLE Z10 with a sequence length of 4096:

| Polarized channel sequence number | Reliability or reliability sequence number |
|---|---|
| 0 | 0 |
| 1 | 1 |
| 2 | 2 |
| 3 | 12 |
| 4 | 3 |
| 5 | 13 |
| 6 | 16 |
| 7 | 29 |
| 8 | 4 |
| 9 | 15 |
| 10 | 18 |
| 11 | 31 |
| 12 | 20 |
| 13 | 37 |
| 14 | 39 |
| 15 | 77 |
| 16 | 5 |
| 17 | 17 |
| 18 | 19 |
| 19 | 36 |
| 20 | 24 |
| 21 | 44 |
| 22 | 52 |
| 23 | 83 |
| 24 | 26 |
| 25 | 51 |
| 26 | 47 |
| 27 | 90 |
| 28 | 60 |
| 29 | 98 |
| 30 | 108 |
| 31 | 173 |
| 32 | 6 |
| 33 | 21 |
| 34 | 25 |
| 35 | 45 |
| 36 | 28 |
| 37 | 49 |
| 38 | 55 |
| 39 | 94 |
| 40 | 32 |
| 41 | 59 |
| 42 | 64 |
| 43 | 100 |
| 44 | 71 |
| 45 | 112 |
| 46 | 120 |
| 47 | 192 |
| 48 | 38 |
| 49 | 65 |
| 50 | 74 |
| 51 | 117 |
| 52 | 78 |
| 53 | 129 |
| 54 | 135 |
| 55 | 198 |
| 56 | 88 |
| 57 | 140 |
| 58 | 152 |
| 59 | 218 |
| 60 | 163 |

TABLE Z10-continued

| with a sequence length of 4096: | |
|---|---|
| Polarized channel sequence number | Reliability or reliability sequence number |
| 61 | 241 |
| 62 | 259 |
| 63 | 379 |
| 64 | 14 |
| 65 | 23 |
| 66 | 30 |
| 67 | 58 |
| 68 | 35 |
| 69 | 61 |
| 70 | 69 |
| 71 | 111 |
| 72 | 41 |
| 73 | 76 |
| 74 | 67 |
| 75 | 123 |
| 76 | 84 |
| 77 | 130 |
| 78 | 146 |
| 79 | 208 |
| 80 | 48 |
| 81 | 73 |
| 82 | 87 |
| 83 | 137 |
| 84 | 97 |
| 85 | 151 |
| 86 | 160 |
| 87 | 230 |
| 88 | 107 |
| 89 | 167 |
| 90 | 176 |
| 91 | 247 |
| 92 | 189 |
| 93 | 274 |
| 94 | 288 |
| 95 | 415 |
| 96 | 56 |
| 97 | 92 |
| 98 | 104 |
| 99 | 156 |
| 100 | 116 |
| 101 | 172 |
| 102 | 181 |
| 103 | 266 |
| 104 | 125 |
| 105 | 186 |
| 106 | 194 |
| 107 | 279 |
| 108 | 213 |
| 109 | 298 |
| 110 | 318 |
| 111 | 436 |
| 112 | 142 |
| 113 | 204 |
| 114 | 223 |
| 115 | 308 |
| 116 | 234 |
| 117 | 330 |
| 118 | 339 |
| 119 | 461 |
| 120 | 251 |
| 121 | 351 |
| 122 | 366 |
| 123 | 491 |
| 124 | 391 |
| 125 | 530 |
| 126 | 588 |
| 127 | 696 |
| 128 | 7 |
| 129 | 22 |
| 130 | 33 |
| 131 | 70 |
| 132 | 43 |
| 133 | 75 |
| 134 | 91 |
| 135 | 141 |

TABLE Z10-continued

| with a sequence length of 4096: | |
|---|---|
| Polarized channel sequence number | Reliability or reliability sequence number |
| 136 | 50 |
| 137 | 85 |
| 138 | 99 |
| 139 | 149 |
| 140 | 110 |
| 141 | 165 |
| 142 | 175 |
| 143 | 283 |
| 144 | 57 |
| 145 | 96 |
| 146 | 106 |
| 147 | 161 |
| 148 | 124 |
| 149 | 185 |
| 150 | 212 |
| 151 | 293 |
| 152 | 132 |
| 153 | 207 |
| 154 | 195 |
| 155 | 311 |
| 156 | 235 |
| 157 | 331 |
| 158 | 354 |
| 159 | 486 |
| 160 | 62 |
| 161 | 114 |
| 162 | 127 |
| 163 | 187 |
| 164 | 136 |
| 165 | 205 |
| 166 | 217 |
| 167 | 322 |
| 168 | 153 |
| 169 | 231 |
| 170 | 243 |
| 171 | 336 |
| 172 | 263 |
| 173 | 362 |
| 174 | 375 |
| 175 | 524 |
| 176 | 170 |
| 177 | 248 |
| 178 | 272 |
| 179 | 371 |
| 180 | 287 |
| 181 | 398 |
| 182 | 407 |
| 183 | 547 |
| 184 | 304 |
| 185 | 420 |
| 186 | 445 |
| 187 | 578 |
| 188 | 466 |
| 189 | 625 |
| 190 | 660 |
| 191 | 877 |
| 192 | 82 |
| 193 | 119 |
| 194 | 144 |
| 195 | 225 |
| 196 | 158 |
| 197 | 239 |
| 198 | 257 |
| 199 | 358 |
| 200 | 180 |
| 201 | 276 |
| 202 | 254 |
| 203 | 383 |
| 204 | 295 |
| 205 | 403 |
| 206 | 429 |
| 207 | 561 |
| 208 | 200 |
| 209 | 267 |
| 210 | 302 |

TABLE Z10-continued

| with a sequence length of 4096: | |
|---|---|
| Polarized channel sequence number | Reliability or reliability sequence number |
| 211 | 411 |
| 212 | 326 |
| 213 | 440 |
| 214 | 456 |
| 215 | 607 |
| 216 | 348 |
| 217 | 472 |
| 218 | 495 |
| 219 | 638 |
| 220 | 516 |
| 221 | 682 |
| 222 | 720 |
| 223 | 939 |
| 224 | 222 |
| 225 | 316 |
| 226 | 343 |
| 227 | 448 |
| 228 | 367 |
| 229 | 478 |
| 230 | 505 |
| 231 | 673 |
| 232 | 387 |
| 233 | 511 |
| 234 | 538 |
| 235 | 710 |
| 236 | 570 |
| 237 | 735 |
| 238 | 771 |
| 239 | 980 |
| 240 | 424 |
| 241 | 556 |
| 242 | 596 |
| 243 | 752 |
| 244 | 617 |
| 245 | 789 |
| 246 | 807 |
| 247 | 1026 |
| 248 | 649 |
| 249 | 830 |
| 250 | 853 |
| 251 | 1077 |
| 252 | 910 |
| 253 | 1154 |
| 254 | 1250 |
| 255 | 1417 |
| 256 | 8 |
| 257 | 27 |
| 258 | 42 |
| 259 | 95 |
| 260 | 54 |
| 261 | 101 |
| 262 | 121 |
| 263 | 182 |
| 264 | 63 |
| 265 | 115 |
| 266 | 134 |
| 267 | 193 |
| 268 | 143 |
| 269 | 216 |
| 270 | 224 |
| 271 | 341 |
| 272 | 72 |
| 273 | 126 |
| 274 | 138 |
| 275 | 211 |
| 276 | 164 |
| 277 | 237 |
| 278 | 264 |
| 279 | 353 |
| 280 | 174 |
| 281 | 262 |
| 282 | 246 |
| 283 | 378 |
| 284 | 289 |
| 285 | 399 |

TABLE Z10-continued

| with a sequence length of 4096: | |
|---|---|
| Polarized channel sequence number | Reliability or reliability sequence number |
| 286 | 425 |
| 287 | 584 |
| 288 | 80 |
| 289 | 150 |
| 290 | 168 |
| 291 | 240 |
| 292 | 178 |
| 293 | 252 |
| 294 | 269 |
| 295 | 389 |
| 296 | 197 |
| 297 | 285 |
| 298 | 301 |
| 299 | 408 |
| 300 | 321 |
| 301 | 437 |
| 302 | 458 |
| 303 | 629 |
| 304 | 220 |
| 305 | 307 |
| 306 | 328 |
| 307 | 452 |
| 308 | 344 |
| 309 | 480 |
| 310 | 493 |
| 311 | 642 |
| 312 | 373 |
| 313 | 506 |
| 314 | 535 |
| 315 | 684 |
| 316 | 564 |
| 317 | 728 |
| 318 | 764 |
| 319 | 992 |
| 320 | 109 |
| 321 | 159 |
| 322 | 188 |
| 323 | 282 |
| 324 | 206 |
| 325 | 294 |
| 326 | 313 |
| 327 | 432 |
| 328 | 228 |
| 329 | 337 |
| 330 | 309 |
| 331 | 463 |
| 332 | 357 |
| 333 | 483 |
| 334 | 521 |
| 335 | 666 |
| 336 | 250 |
| 337 | 324 |
| 338 | 369 |
| 339 | 501 |
| 340 | 396 |
| 341 | 533 |
| 342 | 552 |
| 343 | 703 |
| 344 | 421 |
| 345 | 571 |
| 346 | 593 |
| 347 | 741 |
| 348 | 624 |
| 349 | 793 |
| 350 | 819 |
| 351 | 1056 |
| 352 | 273 |
| 353 | 385 |
| 354 | 413 |
| 355 | 544 |
| 356 | 447 |
| 357 | 582 |
| 358 | 603 |
| 359 | 776 |
| 360 | 471 |

TABLE Z10-continued

| with a sequence length of 4096: | |
|---|---|
| Polarized channel sequence number | Reliability or reliability sequence number |
| 361 | 613 |
| 362 | 632 |
| 363 | 803 |
| 364 | 677 |
| 365 | 840 |
| 366 | 873 |
| 367 | 1095 |
| 368 | 514 |
| 369 | 653 |
| 370 | 692 |
| 371 | 858 |
| 372 | 713 |
| 373 | 894 |
| 374 | 914 |
| 375 | 1134 |
| 376 | 749 |
| 377 | 932 |
| 378 | 962 |
| 379 | 1192 |
| 380 | 1014 |
| 381 | 1262 |
| 382 | 1344 |
| 383 | 1524 |
| 384 | 89 |
| 385 | 154 |
| 386 | 202 |
| 387 | 317 |
| 388 | 232 |
| 389 | 334 |
| 390 | 380 |
| 391 | 509 |
| 392 | 258 |
| 393 | 361 |
| 394 | 404 |
| 395 | 528 |
| 396 | 431 |
| 397 | 567 |
| 398 | 592 |
| 399 | 812 |
| 400 | 278 |
| 401 | 392 |
| 402 | 417 |
| 403 | 557 |
| 404 | 468 |
| 405 | 609 |
| 406 | 670 |
| 407 | 826 |
| 408 | 487 |
| 409 | 663 |
| 410 | 635 |
| 411 | 863 |
| 412 | 716 |
| 413 | 899 |
| 414 | 943 |
| 415 | 1183 |
| 416 | 297 |
| 417 | 442 |
| 418 | 476 |
| 419 | 620 |
| 420 | 498 |
| 421 | 656 |
| 422 | 681 |
| 423 | 884 |
| 424 | 542 |
| 425 | 707 |
| 426 | 731 |
| 427 | 903 |
| 428 | 767 |
| 429 | 955 |
| 430 | 987 |
| 431 | 1238 |
| 432 | 575 |
| 433 | 745 |
| 434 | 785 |
| 435 | 974 |

TABLE Z10-continued

| with a sequence length of 4096: | |
|---|---|
| Polarized channel sequence number | Reliability or reliability sequence number |
| 436 | 816 |
| 437 | 1019 |
| 438 | 1041 |
| 439 | 1282 |
| 440 | 848 |
| 441 | 1063 |
| 442 | 1111 |
| 443 | 1332 |
| 444 | 1143 |
| 445 | 1400 |
| 446 | 1468 |
| 447 | 1799 |
| 448 | 349 |
| 449 | 455 |
| 450 | 520 |
| 451 | 699 |
| 452 | 549 |
| 453 | 724 |
| 454 | 760 |
| 455 | 951 |
| 456 | 600 |
| 457 | 798 |
| 458 | 756 |
| 459 | 999 |
| 460 | 833 |
| 461 | 1033 |
| 462 | 1084 |
| 463 | 1306 |
| 464 | 646 |
| 465 | 781 |
| 466 | 844 |
| 467 | 1048 |
| 468 | 888 |
| 469 | 1102 |
| 470 | 1127 |
| 471 | 1373 |
| 472 | 926 |
| 473 | 1163 |
| 474 | 1200 |
| 475 | 1431 |
| 476 | 1229 |
| 477 | 1500 |
| 478 | 1564 |
| 479 | 1889 |
| 480 | 688 |
| 481 | 869 |
| 482 | 920 |
| 483 | 1119 |
| 484 | 968 |
| 485 | 1171 |
| 486 | 1212 |
| 487 | 1485 |
| 488 | 1007 |
| 489 | 1221 |
| 490 | 1274 |
| 491 | 1542 |
| 492 | 1318 |
| 493 | 1587 |
| 494 | 1634 |
| 495 | 1945 |
| 496 | 1069 |
| 497 | 1294 |
| 498 | 1356 |
| 499 | 1612 |
| 500 | 1387 |
| 501 | 1665 |
| 502 | 1693 |
| 503 | 2005 |
| 504 | 1448 |
| 505 | 1727 |
| 506 | 1762 |
| 507 | 2081 |
| 508 | 1841 |
| 509 | 2173 |
| 510 | 2299 |

TABLE Z10-continued

| with a sequence length of 4096: | |
|---|---|
| Polarized channel sequence number | Reliability or reliability sequence number |
| 511 | 2509 |
| 512 | 9 |
| 513 | 34 |
| 514 | 53 |
| 515 | 131 |
| 516 | 68 |
| 517 | 139 |
| 518 | 162 |
| 519 | 244 |
| 520 | 81 |
| 521 | 155 |
| 522 | 177 |
| 523 | 255 |
| 524 | 191 |
| 525 | 281 |
| 526 | 290 |
| 527 | 434 |
| 528 | 93 |
| 529 | 171 |
| 530 | 184 |
| 531 | 275 |
| 532 | 215 |
| 533 | 310 |
| 534 | 342 |
| 535 | 450 |
| 536 | 226 |
| 537 | 338 |
| 538 | 319 |
| 539 | 473 |
| 540 | 372 |
| 541 | 500 |
| 542 | 525 |
| 543 | 704 |
| 544 | 103 |
| 545 | 196 |
| 546 | 221 |
| 547 | 315 |
| 548 | 238 |
| 549 | 329 |
| 550 | 350 |
| 551 | 484 |
| 552 | 260 |
| 553 | 368 |
| 554 | 390 |
| 555 | 507 |
| 556 | 409 |
| 557 | 540 |
| 558 | 562 |
| 559 | 751 |
| 560 | 286 |
| 561 | 395 |
| 562 | 423 |
| 563 | 554 |
| 564 | 439 |
| 565 | 587 |
| 566 | 601 |
| 567 | 770 |
| 568 | 465 |
| 569 | 615 |
| 570 | 647 |
| 571 | 817 |
| 572 | 676 |
| 573 | 871 |
| 574 | 913 |
| 575 | 1160 |
| 576 | 147 |
| 577 | 210 |
| 578 | 249 |
| 579 | 363 |
| 580 | 271 |
| 581 | 376 |
| 582 | 402 |
| 583 | 537 |
| 584 | 296 |
| 585 | 430 |

TABLE Z10-continued

| with a sequence length of 4096: | |
|---|---|
| Polarized channel sequence number | Reliability or reliability sequence number |
| 586 | 397 |
| 587 | 569 |
| 588 | 453 |
| 589 | 590 |
| 590 | 633 |
| 591 | 795 |
| 592 | 323 |
| 593 | 418 |
| 594 | 462 |
| 595 | 608 |
| 596 | 496 |
| 597 | 644 |
| 598 | 669 |
| 599 | 842 |
| 600 | 523 |
| 601 | 689 |
| 602 | 715 |
| 603 | 881 |
| 604 | 747 |
| 605 | 946 |
| 606 | 976 |
| 607 | 1228 |
| 608 | 356 |
| 609 | 481 |
| 610 | 515 |
| 611 | 658 |
| 612 | 551 |
| 613 | 700 |
| 614 | 726 |
| 615 | 928 |
| 616 | 577 |
| 617 | 738 |
| 618 | 759 |
| 619 | 958 |
| 620 | 805 |
| 621 | 998 |
| 622 | 1039 |
| 623 | 1265 |
| 624 | 621 |
| 625 | 780 |
| 626 | 827 |
| 627 | 1017 |
| 628 | 854 |
| 629 | 1062 |
| 630 | 1081 |
| 631 | 1309 |
| 632 | 893 |
| 633 | 1105 |
| 634 | 1133 |
| 635 | 1361 |
| 636 | 1186 |
| 637 | 1425 |
| 638 | 1516 |
| 639 | 1684 |
| 640 | 113 |
| 641 | 203 |
| 642 | 265 |
| 643 | 405 |
| 644 | 305 |
| 645 | 426 |
| 646 | 477 |
| 647 | 618 |
| 648 | 332 |
| 649 | 457 |
| 650 | 502 |
| 651 | 637 |
| 652 | 534 |
| 653 | 686 |
| 654 | 712 |
| 655 | 964 |
| 656 | 360 |
| 657 | 492 |
| 658 | 518 |
| 659 | 672 |
| 660 | 574 |

TABLE Z10-continued with a sequence length of 4096:

| Polarized channel sequence number | Reliability or reliability sequence number |
|---|---|
| 661 | 734 |
| 662 | 802 |
| 663 | 983 |
| 664 | 595 |
| 665 | 791 |
| 666 | 762 |
| 667 | 1023 |
| 668 | 857 |
| 669 | 1066 |
| 670 | 1113 |
| 671 | 1350 |
| 672 | 381 |
| 673 | 543 |
| 674 | 583 |
| 675 | 739 |
| 676 | 605 |
| 677 | 784 |
| 678 | 813 |
| 679 | 1045 |
| 680 | 650 |
| 681 | 846 |
| 682 | 875 |
| 683 | 1074 |
| 684 | 919 |
| 685 | 1130 |
| 686 | 1151 |
| 687 | 1414 |
| 688 | 697 |
| 689 | 886 |
| 690 | 936 |
| 691 | 1146 |
| 692 | 971 |
| 693 | 1197 |
| 694 | 1215 |
| 695 | 1453 |
| 696 | 1009 |
| 697 | 1235 |
| 698 | 1279 |
| 699 | 1505 |
| 700 | 1315 |
| 701 | 1575 |
| 702 | 1626 |
| 703 | 1957 |
| 704 | 446 |
| 705 | 558 |
| 706 | 630 |
| 707 | 836 |
| 708 | 661 |
| 709 | 864 |
| 710 | 906 |
| 711 | 1122 |
| 712 | 723 |
| 713 | 948 |
| 714 | 901 |
| 715 | 1169 |
| 716 | 990 |
| 717 | 1206 |
| 718 | 1253 |
| 719 | 1474 |
| 720 | 774 |
| 721 | 930 |
| 722 | 1004 |
| 723 | 1224 |
| 724 | 1054 |
| 725 | 1271 |
| 726 | 1300 |
| 727 | 1547 |
| 728 | 1098 |
| 729 | 1329 |
| 730 | 1367 |
| 731 | 1595 |
| 732 | 1404 |
| 733 | 1662 |
| 734 | 1721 |
| 735 | 2039 |

TABLE Z10-continued with a sequence length of 4096:

| Polarized channel sequence number | Reliability or reliability sequence number |
|---|---|
| 736 | 823 |
| 737 | 1032 |
| 738 | 1090 |
| 739 | 1288 |
| 740 | 1137 |
| 741 | 1338 |
| 742 | 1380 |
| 743 | 1648 |
| 744 | 1177 |
| 745 | 1393 |
| 746 | 1439 |
| 747 | 1707 |
| 748 | 1488 |
| 749 | 1746 |
| 750 | 1804 |
| 751 | 2095 |
| 752 | 1244 |
| 753 | 1463 |
| 754 | 1531 |
| 755 | 1771 |
| 756 | 1559 |
| 757 | 1825 |
| 758 | 1853 |
| 759 | 2149 |
| 760 | 1609 |
| 761 | 1883 |
| 762 | 1919 |
| 763 | 2215 |
| 764 | 1997 |
| 765 | 2308 |
| 766 | 2420 |
| 767 | 2617 |
| 768 | 122 |
| 769 | 233 |
| 770 | 300 |
| 771 | 488 |
| 772 | 347 |
| 773 | 510 |
| 774 | 565 |
| 775 | 730 |
| 776 | 386 |
| 777 | 548 |
| 778 | 599 |
| 779 | 755 |
| 780 | 626 |
| 781 | 809 |
| 782 | 832 |
| 783 | 1087 |
| 784 | 414 |
| 785 | 580 |
| 786 | 612 |
| 787 | 799 |
| 788 | 680 |
| 789 | 860 |
| 790 | 923 |
| 791 | 1108 |
| 792 | 708 |
| 793 | 916 |
| 794 | 880 |
| 795 | 1157 |
| 796 | 978 |
| 797 | 1203 |
| 798 | 1247 |
| 799 | 1511 |
| 800 | 441 |
| 801 | 641 |
| 802 | 693 |
| 803 | 867 |
| 804 | 719 |
| 805 | 897 |
| 806 | 935 |
| 807 | 1180 |
| 808 | 766 |
| 809 | 967 |
| 810 | 1002 |

TABLE Z10-continued with a sequence length of 4096:

| Polarized channel sequence number | Reliability or reliability sequence number |
|---|---|
| 811 | 1218 |
| 812 | 1044 |
| 813 | 1268 |
| 814 | 1303 |
| 815 | 1579 |
| 816 | 822 |
| 817 | 1011 |
| 818 | 1059 |
| 819 | 1291 |
| 820 | 1092 |
| 821 | 1341 |
| 822 | 1364 |
| 823 | 1600 |
| 824 | 1149 |
| 825 | 1384 |
| 826 | 1434 |
| 827 | 1670 |
| 828 | 1479 |
| 829 | 1737 |
| 830 | 1788 |
| 831 | 2111 |
| 832 | 529 |
| 833 | 665 |
| 834 | 744 |
| 835 | 959 |
| 836 | 788 |
| 837 | 986 |
| 838 | 1029 |
| 839 | 1259 |
| 840 | 837 |
| 841 | 1080 |
| 842 | 1021 |
| 843 | 1312 |
| 844 | 1116 |
| 845 | 1347 |
| 846 | 1411 |
| 847 | 1639 |
| 848 | 890 |
| 849 | 1051 |
| 850 | 1140 |
| 851 | 1376 |
| 852 | 1194 |
| 853 | 1428 |
| 854 | 1460 |
| 855 | 1698 |
| 856 | 1241 |
| 857 | 1493 |
| 858 | 1527 |
| 859 | 1752 |
| 860 | 1570 |
| 861 | 1830 |
| 862 | 1872 |
| 863 | 2190 |
| 864 | 942 |
| 865 | 1174 |
| 866 | 1226 |
| 867 | 1445 |
| 868 | 1285 |
| 869 | 1508 |
| 870 | 1539 |
| 871 | 1810 |
| 872 | 1326 |
| 873 | 1555 |
| 874 | 1584 |
| 875 | 1847 |
| 876 | 1651 |
| 877 | 1900 |
| 878 | 1951 |
| 879 | 2232 |
| 880 | 1397 |
| 881 | 1617 |
| 882 | 1679 |
| 883 | 1925 |
| 884 | 1712 |
| 885 | 1977 |

TABLE Z10-continued with a sequence length of 4096:

| Polarized channel sequence number | Reliability or reliability sequence number |
|---|---|
| 886 | 2011 |
| 887 | 2279 |
| 888 | 1768 |
| 889 | 2033 |
| 890 | 2065 |
| 891 | 2350 |
| 892 | 2133 |
| 893 | 2432 |
| 894 | 2539 |
| 895 | 2730 |
| 896 | 469 |
| 897 | 654 |
| 898 | 778 |
| 899 | 1036 |
| 900 | 850 |
| 901 | 1072 |
| 902 | 1166 |
| 903 | 1390 |
| 904 | 907 |
| 905 | 1125 |
| 906 | 1209 |
| 907 | 1422 |
| 908 | 1256 |
| 909 | 1482 |
| 910 | 1519 |
| 911 | 1860 |
| 912 | 952 |
| 913 | 1189 |
| 914 | 1232 |
| 915 | 1471 |
| 916 | 1323 |
| 917 | 1550 |
| 918 | 1643 |
| 919 | 1877 |
| 920 | 1353 |
| 921 | 1631 |
| 922 | 1592 |
| 923 | 1931 |
| 924 | 1718 |
| 925 | 1985 |
| 926 | 2047 |
| 927 | 2339 |
| 928 | 995 |
| 929 | 1277 |
| 930 | 1335 |
| 931 | 1567 |
| 932 | 1370 |
| 933 | 1621 |
| 934 | 1657 |
| 935 | 1963 |
| 936 | 1442 |
| 937 | 1704 |
| 938 | 1743 |
| 939 | 1991 |
| 940 | 1793 |
| 941 | 2059 |
| 942 | 2103 |
| 943 | 2406 |
| 944 | 1496 |
| 945 | 1757 |
| 946 | 1819 |
| 947 | 2087 |
| 948 | 1866 |
| 949 | 2141 |
| 950 | 2165 |
| 951 | 2455 |
| 952 | 1914 |
| 953 | 2198 |
| 954 | 2251 |
| 955 | 2524 |
| 956 | 2288 |
| 957 | 2601 |
| 958 | 2671 |
| 959 | 3002 |
| 960 | 1101 |

TABLE Z10-continued with a sequence length of 4096:

| Polarized channel sequence number | Reliability or reliability sequence number |
|---|---|
| 961 | 1297 |
| 962 | 1407 |
| 963 | 1690 |
| 964 | 1456 |
| 965 | 1732 |
| 966 | 1782 |
| 967 | 2051 |
| 968 | 1535 |
| 969 | 1836 |
| 970 | 1777 |
| 971 | 2117 |
| 972 | 1894 |
| 973 | 2157 |
| 974 | 2224 |
| 975 | 2482 |
| 976 | 1604 |
| 977 | 1815 |
| 978 | 1906 |
| 979 | 2182 |
| 980 | 1971 |
| 981 | 2243 |
| 982 | 2269 |
| 983 | 2567 |
| 984 | 2025 |
| 985 | 2319 |
| 986 | 2362 |
| 987 | 2633 |
| 988 | 2394 |
| 989 | 2710 |
| 990 | 2773 |
| 991 | 3083 |
| 992 | 1676 |
| 993 | 1937 |
| 994 | 2019 |
| 995 | 2260 |
| 996 | 2073 |
| 997 | 2330 |
| 998 | 2373 |
| 999 | 2688 |
| 1000 | 2125 |
| 1001 | 2385 |
| 1002 | 2443 |
| 1003 | 2750 |
| 1004 | 2494 |
| 1005 | 2797 |
| 1006 | 2846 |
| 1007 | 3134 |
| 1008 | 2207 |
| 1009 | 2470 |
| 1010 | 2552 |
| 1011 | 2822 |
| 1012 | 2583 |
| 1013 | 2875 |
| 1014 | 2904 |
| 1015 | 3187 |
| 1016 | 2652 |
| 1017 | 2933 |
| 1018 | 2967 |
| 1019 | 3252 |
| 1020 | 3042 |
| 1021 | 3328 |
| 1022 | 3433 |
| 1023 | 3584 |
| 1024 | 10 |
| 1025 | 40 |
| 1026 | 66 |
| 1027 | 179 |
| 1028 | 86 |
| 1029 | 190 |
| 1030 | 219 |
| 1031 | 320 |
| 1032 | 102 |
| 1033 | 209 |
| 1034 | 236 |
| 1035 | 333 |

TABLE Z10-continued with a sequence length of 4096:

| Polarized channel sequence number | Reliability or reliability sequence number |
|---|---|
| 1036 | 253 |
| 1037 | 370 |
| 1038 | 382 |
| 1039 | 560 |
| 1040 | 118 |
| 1041 | 227 |
| 1042 | 245 |
| 1043 | 364 |
| 1044 | 284 |
| 1045 | 406 |
| 1046 | 444 |
| 1047 | 581 |
| 1048 | 299 |
| 1049 | 438 |
| 1050 | 416 |
| 1051 | 606 |
| 1052 | 485 |
| 1053 | 639 |
| 1054 | 671 |
| 1055 | 876 |
| 1056 | 133 |
| 1057 | 261 |
| 1058 | 291 |
| 1059 | 412 |
| 1060 | 312 |
| 1061 | 428 |
| 1062 | 460 |
| 1063 | 623 |
| 1064 | 340 |
| 1065 | 479 |
| 1066 | 503 |
| 1067 | 648 |
| 1068 | 531 |
| 1069 | 687 |
| 1070 | 714 |
| 1071 | 927 |
| 1072 | 377 |
| 1073 | 508 |
| 1074 | 545 |
| 1075 | 705 |
| 1076 | 563 |
| 1077 | 742 |
| 1078 | 761 |
| 1079 | 947 |
| 1080 | 597 |
| 1081 | 779 |
| 1082 | 814 |
| 1083 | 996 |
| 1084 | 849 |
| 1085 | 1055 |
| 1086 | 1097 |
| 1087 | 1366 |
| 1088 | 201 |
| 1089 | 277 |
| 1090 | 327 |
| 1091 | 474 |
| 1092 | 359 |
| 1093 | 489 |
| 1094 | 522 |
| 1095 | 683 |
| 1096 | 388 |
| 1097 | 555 |
| 1098 | 513 |
| 1099 | 725 |
| 1100 | 586 |
| 1101 | 746 |
| 1102 | 796 |
| 1103 | 972 |
| 1104 | 422 |
| 1105 | 541 |
| 1106 | 594 |
| 1107 | 769 |
| 1108 | 636 |
| 1109 | 810 |
| 1110 | 839 |

TABLE Z10-continued with a sequence length of 4096:

| Polarized channel sequence number | Reliability or reliability sequence number |
|---|---|
| 1111 | 1025 |
| 1112 | 667 |
| 1113 | 859 |
| 1114 | 885 |
| 1115 | 1067 |
| 1116 | 922 |
| 1117 | 1132 |
| 1118 | 1164 |
| 1119 | 1440 |
| 1120 | 464 |
| 1121 | 614 |
| 1122 | 659 |
| 1123 | 828 |
| 1124 | 702 |
| 1125 | 872 |
| 1126 | 898 |
| 1127 | 1115 |
| 1128 | 733 |
| 1129 | 911 |
| 1130 | 934 |
| 1131 | 1144 |
| 1132 | 984 |
| 1133 | 1187 |
| 1134 | 1234 |
| 1135 | 1480 |
| 1136 | 786 |
| 1137 | 960 |
| 1138 | 1010 |
| 1139 | 1208 |
| 1140 | 1037 |
| 1141 | 1260 |
| 1142 | 1281 |
| 1143 | 1529 |
| 1144 | 1078 |
| 1145 | 1308 |
| 1146 | 1337 |
| 1147 | 1585 |
| 1148 | 1392 |
| 1149 | 1658 |
| 1150 | 1759 |
| 1151 | 1933 |
| 1152 | 145 |
| 1153 | 270 |
| 1154 | 346 |
| 1155 | 527 |
| 1156 | 400 |
| 1157 | 550 |
| 1158 | 611 |
| 1159 | 783 |
| 1160 | 433 |
| 1161 | 589 |
| 1162 | 643 |
| 1163 | 804 |
| 1164 | 678 |
| 1165 | 855 |
| 1166 | 882 |
| 1167 | 1153 |
| 1168 | 470 |
| 1169 | 631 |
| 1170 | 664 |
| 1171 | 841 |
| 1172 | 729 |
| 1173 | 909 |
| 1174 | 982 |
| 1175 | 1173 |
| 1176 | 754 |
| 1177 | 970 |
| 1178 | 938 |
| 1179 | 1216 |
| 1180 | 1040 |
| 1181 | 1263 |
| 1182 | 1314 |
| 1183 | 1577 |
| 1184 | 494 |
| 1185 | 694 |

TABLE Z10-continued with a sequence length of 4096:

| Polarized channel sequence number | Reliability or reliability sequence number |
|---|---|
| 1186 | 740 |
| 1187 | 915 |
| 1188 | 765 |
| 1189 | 963 |
| 1190 | 994 |
| 1191 | 1243 |
| 1192 | 818 |
| 1193 | 1028 |
| 1194 | 1058 |
| 1195 | 1272 |
| 1196 | 1106 |
| 1197 | 1331 |
| 1198 | 1358 |
| 1199 | 1646 |
| 1200 | 866 |
| 1201 | 1070 |
| 1202 | 1126 |
| 1203 | 1349 |
| 1204 | 1161 |
| 1205 | 1406 |
| 1206 | 1423 |
| 1207 | 1686 |
| 1208 | 1199 |
| 1209 | 1450 |
| 1210 | 1498 |
| 1211 | 1741 |
| 1212 | 1540 |
| 1213 | 1821 |
| 1214 | 1875 |
| 1215 | 2188 |
| 1216 | 576 |
| 1217 | 709 |
| 1218 | 794 |
| 1219 | 1015 |
| 1220 | 831 |
| 1221 | 1049 |
| 1222 | 1091 |
| 1223 | 1321 |
| 1224 | 895 |
| 1225 | 1139 |
| 1226 | 1085 |
| 1227 | 1375 |
| 1228 | 1179 |
| 1229 | 1415 |
| 1230 | 1466 |
| 1231 | 1711 |
| 1232 | 950 |
| 1233 | 1118 |
| 1234 | 1196 |
| 1235 | 1433 |
| 1236 | 1251 |
| 1237 | 1490 |
| 1238 | 1521 |
| 1239 | 1790 |
| 1240 | 1299 |
| 1241 | 1552 |
| 1242 | 1594 |
| 1243 | 1843 |
| 1244 | 1633 |
| 1245 | 1912 |
| 1246 | 1973 |
| 1247 | 2266 |
| 1248 | 1006 |
| 1249 | 1225 |
| 1250 | 1290 |
| 1251 | 1506 |
| 1252 | 1340 |
| 1253 | 1562 |
| 1254 | 1610 |
| 1255 | 1898 |
| 1256 | 1383 |
| 1257 | 1624 |
| 1258 | 1672 |
| 1259 | 1955 |
| 1260 | 1728 |

TABLE Z10-continued with a sequence length of 4096:

| Polarized channel sequence number | Reliability or reliability sequence number |
|---|---|
| 1261 | 1995 |
| 1262 | 2048 |
| 1263 | 2317 |
| 1264 | 1458 |
| 1265 | 1702 |
| 1266 | 1773 |
| 1267 | 2021 |
| 1268 | 1806 |
| 1269 | 2071 |
| 1270 | 2097 |
| 1271 | 2371 |
| 1272 | 1858 |
| 1273 | 2127 |
| 1274 | 2155 |
| 1275 | 2429 |
| 1276 | 2230 |
| 1277 | 2517 |
| 1278 | 2622 |
| 1279 | 2794 |
| 1280 | 157 |
| 1281 | 306 |
| 1282 | 394 |
| 1283 | 627 |
| 1284 | 454 |
| 1285 | 652 |
| 1286 | 718 |
| 1287 | 902 |
| 1288 | 499 |
| 1289 | 698 |
| 1290 | 757 |
| 1291 | 931 |
| 1292 | 790 |
| 1293 | 991 |
| 1294 | 1013 |
| 1295 | 1284 |
| 1296 | 536 |
| 1297 | 736 |
| 1298 | 773 |
| 1299 | 979 |
| 1300 | 851 |
| 1301 | 1043 |
| 1302 | 1109 |
| 1303 | 1311 |
| 1304 | 879 |
| 1305 | 1104 |
| 1306 | 1065 |
| 1307 | 1363 |
| 1308 | 1167 |
| 1309 | 1409 |
| 1310 | 1461 |
| 1311 | 1753 |
| 1312 | 568 |
| 1313 | 808 |
| 1314 | 862 |
| 1315 | 1052 |
| 1316 | 892 |
| 1317 | 1083 |
| 1318 | 1120 |
| 1319 | 1386 |
| 1320 | 944 |
| 1321 | 1156 |
| 1322 | 1193 |
| 1323 | 1426 |
| 1324 | 1240 |
| 1325 | 1484 |
| 1326 | 1526 |
| 1327 | 1827 |
| 1328 | 1000 |
| 1329 | 1205 |
| 1330 | 1254 |
| 1331 | 1513 |
| 1332 | 1293 |
| 1333 | 1565 |
| 1334 | 1590 |
| 1335 | 1849 |

TABLE Z10-continued with a sequence length of 4096:

| Polarized channel sequence number | Reliability or reliability sequence number |
|---|---|
| 1336 | 1355 |
| 1337 | 1614 |
| 1338 | 1667 |
| 1339 | 1916 |
| 1340 | 1716 |
| 1341 | 1983 |
| 1342 | 2037 |
| 1343 | 2332 |
| 1344 | 675 |
| 1345 | 835 |
| 1346 | 918 |
| 1347 | 1150 |
| 1348 | 966 |
| 1349 | 1176 |
| 1350 | 1219 |
| 1351 | 1476 |
| 1352 | 1022 |
| 1353 | 1275 |
| 1354 | 1210 |
| 1355 | 1534 |
| 1356 | 1320 |
| 1357 | 1572 |
| 1358 | 1641 |
| 1359 | 1887 |
| 1360 | 1076 |
| 1361 | 1248 |
| 1362 | 1346 |
| 1363 | 1605 |
| 1364 | 1401 |
| 1365 | 1660 |
| 1366 | 1697 |
| 1367 | 1943 |
| 1368 | 1452 |
| 1369 | 1730 |
| 1370 | 1766 |
| 1371 | 2003 |
| 1372 | 1817 |
| 1373 | 2077 |
| 1374 | 2113 |
| 1375 | 2408 |
| 1376 | 1129 |
| 1377 | 1378 |
| 1378 | 1436 |
| 1379 | 1683 |
| 1380 | 1503 |
| 1381 | 1748 |
| 1382 | 1784 |
| 1383 | 2053 |
| 1384 | 1549 |
| 1385 | 1801 |
| 1386 | 1832 |
| 1387 | 2091 |
| 1388 | 1904 |
| 1389 | 2139 |
| 1390 | 2184 |
| 1391 | 2451 |
| 1392 | 1627 |
| 1393 | 1864 |
| 1394 | 1927 |
| 1395 | 2163 |
| 1396 | 1961 |
| 1397 | 2211 |
| 1398 | 2236 |
| 1399 | 2497 |
| 1400 | 2015 |
| 1401 | 2258 |
| 1402 | 2295 |
| 1403 | 2557 |
| 1404 | 2357 |
| 1405 | 2636 |
| 1406 | 2721 |
| 1407 | 2897 |
| 1408 | 602 |
| 1409 | 821 |
| 1410 | 954 |

TABLE Z10-continued with a sequence length of 4096:

| Polarized channel sequence number | Reliability or reliability sequence number |
|---|---|
| 1411 | 1231 |
| 1412 | 1030 |
| 1413 | 1269 |
| 1414 | 1369 |
| 1415 | 1619 |
| 1416 | 1094 |
| 1417 | 1328 |
| 1418 | 1418 |
| 1419 | 1653 |
| 1420 | 1472 |
| 1421 | 1723 |
| 1422 | 1764 |
| 1423 | 2101 |
| 1424 | 1142 |
| 1425 | 1395 |
| 1426 | 1444 |
| 1427 | 1705 |
| 1428 | 1544 |
| 1429 | 1795 |
| 1430 | 1893 |
| 1431 | 2121 |
| 1432 | 1580 |
| 1433 | 1881 |
| 1434 | 1838 |
| 1435 | 2169 |
| 1436 | 1967 |
| 1437 | 2217 |
| 1438 | 2273 |
| 1439 | 2547 |
| 1440 | 1184 |
| 1441 | 1495 |
| 1442 | 1557 |
| 1443 | 1812 |
| 1444 | 1599 |
| 1445 | 1870 |
| 1446 | 1910 |
| 1447 | 2196 |
| 1448 | 1677 |
| 1449 | 1949 |
| 1450 | 1989 |
| 1451 | 2221 |
| 1452 | 2043 |
| 1453 | 2286 |
| 1454 | 2326 |
| 1455 | 2609 |
| 1456 | 1736 |
| 1457 | 2009 |
| 1458 | 2067 |
| 1459 | 2310 |
| 1460 | 2107 |
| 1461 | 2364 |
| 1462 | 2389 |
| 1463 | 2657 |
| 1464 | 2151 |
| 1465 | 2415 |
| 1466 | 2467 |
| 1467 | 2707 |
| 1468 | 2504 |
| 1469 | 2779 |
| 1470 | 2843 |
| 1471 | 3142 |
| 1472 | 1302 |
| 1473 | 1518 |
| 1474 | 1638 |
| 1475 | 1939 |
| 1476 | 1691 |
| 1477 | 1979 |
| 1478 | 2031 |
| 1479 | 2282 |
| 1480 | 1779 |
| 1481 | 2083 |
| 1482 | 2027 |
| 1483 | 2341 |
| 1484 | 2131 |
| 1485 | 2380 |

TABLE Z10-continued with a sequence length of 4096:

| Polarized channel sequence number | Reliability or reliability sequence number |
|---|---|
| 1486 | 2439 |
| 1487 | 2682 |
| 1488 | 1855 |
| 1489 | 2061 |
| 1490 | 2145 |
| 1491 | 2399 |
| 1492 | 2203 |
| 1493 | 2460 |
| 1494 | 2487 |
| 1495 | 2753 |
| 1496 | 2249 |
| 1497 | 2527 |
| 1498 | 2565 |
| 1499 | 2809 |
| 1500 | 2598 |
| 1501 | 2878 |
| 1502 | 2937 |
| 1503 | 3212 |
| 1504 | 1921 |
| 1505 | 2178 |
| 1506 | 2245 |
| 1507 | 2477 |
| 1508 | 2304 |
| 1509 | 2534 |
| 1510 | 2578 |
| 1511 | 2862 |
| 1512 | 2348 |
| 1513 | 2588 |
| 1514 | 2646 |
| 1515 | 2917 |
| 1516 | 2696 |
| 1517 | 2957 |
| 1518 | 2999 |
| 1519 | 3257 |
| 1520 | 2422 |
| 1521 | 2668 |
| 1522 | 2736 |
| 1523 | 2981 |
| 1524 | 2765 |
| 1525 | 3027 |
| 1526 | 3053 |
| 1527 | 3298 |
| 1528 | 2828 |
| 1529 | 3079 |
| 1530 | 3110 |
| 1531 | 3358 |
| 1532 | 3174 |
| 1533 | 3421 |
| 1534 | 3510 |
| 1535 | 3644 |
| 1536 | 169 |
| 1537 | 352 |
| 1538 | 449 |
| 1539 | 750 |
| 1540 | 517 |
| 1541 | 775 |
| 1542 | 845 |
| 1543 | 1060 |
| 1544 | 573 |
| 1545 | 824 |
| 1546 | 889 |
| 1547 | 1088 |
| 1548 | 924 |
| 1549 | 1147 |
| 1550 | 1170 |
| 1551 | 1477 |
| 1552 | 619 |
| 1553 | 868 |
| 1554 | 905 |
| 1555 | 1136 |
| 1556 | 988 |
| 1557 | 1213 |
| 1558 | 1287 |
| 1559 | 1509 |
| 1560 | 1018 |

TABLE Z10-continued with a sequence length of 4096:

| Polarized channel sequence number | Reliability or reliability sequence number |
|---|---|
| 1561 | 1278 |
| 1562 | 1237 |
| 1563 | 1554 |
| 1564 | 1352 |
| 1565 | 1602 |
| 1566 | 1650 |
| 1567 | 1947 |
| 1568 | 655 |
| 1569 | 940 |
| 1570 | 1003 |
| 1571 | 1222 |
| 1572 | 1047 |
| 1573 | 1257 |
| 1574 | 1305 |
| 1575 | 1574 |
| 1576 | 1099 |
| 1577 | 1343 |
| 1578 | 1389 |
| 1579 | 1616 |
| 1580 | 1429 |
| 1581 | 1674 |
| 1582 | 1714 |
| 1583 | 2017 |
| 1584 | 1159 |
| 1585 | 1398 |
| 1586 | 1455 |
| 1587 | 1700 |
| 1588 | 1487 |
| 1589 | 1755 |
| 1590 | 1781 |
| 1591 | 2045 |
| 1592 | 1537 |
| 1593 | 1802 |
| 1594 | 1856 |
| 1595 | 2109 |
| 1596 | 1902 |
| 1597 | 2180 |
| 1598 | 2234 |
| 1599 | 2522 |
| 1600 | 800 |
| 1601 | 975 |
| 1602 | 1073 |
| 1603 | 1334 |
| 1604 | 1123 |
| 1605 | 1360 |
| 1606 | 1412 |
| 1607 | 1669 |
| 1608 | 1182 |
| 1609 | 1469 |
| 1610 | 1403 |
| 1611 | 1725 |
| 1612 | 1514 |
| 1613 | 1761 |
| 1614 | 1834 |
| 1615 | 2079 |
| 1616 | 1245 |
| 1617 | 1447 |
| 1618 | 1532 |
| 1619 | 1791 |
| 1620 | 1597 |
| 1621 | 1851 |
| 1622 | 1891 |
| 1623 | 2143 |
| 1624 | 1645 |
| 1625 | 1923 |
| 1626 | 1965 |
| 1627 | 2194 |
| 1628 | 2013 |
| 1629 | 2275 |
| 1630 | 2312 |
| 1631 | 2596 |
| 1632 | 1317 |
| 1633 | 1569 |
| 1634 | 1629 |
| 1635 | 1873 |
| 1636 | 1695 |
| 1637 | 1941 |
| 1638 | 1981 |
| 1639 | 2253 |
| 1640 | 1739 |
| 1641 | 1999 |
| 1642 | 2029 |
| 1643 | 2290 |
| 1644 | 2093 |
| 1645 | 2337 |
| 1646 | 2387 |
| 1647 | 2638 |
| 1648 | 1814 |
| 1649 | 2057 |
| 1650 | 2123 |
| 1651 | 2360 |
| 1652 | 2159 |
| 1653 | 2413 |
| 1654 | 2436 |
| 1655 | 2685 |
| 1656 | 2209 |
| 1657 | 2463 |
| 1658 | 2492 |
| 1659 | 2738 |
| 1660 | 2549 |
| 1661 | 2803 |
| 1662 | 2891 |
| 1663 | 3045 |
| 1664 | 691 |
| 1665 | 956 |
| 1666 | 1112 |
| 1667 | 1420 |
| 1668 | 1202 |
| 1669 | 1464 |
| 1670 | 1560 |
| 1671 | 1808 |
| 1672 | 1266 |
| 1673 | 1522 |
| 1674 | 1607 |
| 1675 | 1840 |
| 1676 | 1663 |
| 1677 | 1918 |
| 1678 | 1959 |
| 1679 | 2297 |
| 1680 | 1325 |
| 1681 | 1589 |
| 1682 | 1636 |
| 1683 | 1896 |
| 1684 | 1734 |
| 1685 | 1993 |
| 1686 | 2089 |
| 1687 | 2321 |
| 1688 | 1770 |
| 1689 | 2075 |
| 1690 | 2035 |
| 1691 | 2369 |
| 1692 | 2161 |
| 1693 | 2417 |
| 1694 | 2472 |
| 1695 | 2727 |
| 1696 | 1372 |
| 1697 | 1681 |
| 1698 | 1750 |
| 1699 | 2001 |
| 1700 | 1786 |
| 1701 | 2063 |
| 1702 | 2105 |
| 1703 | 2396 |
| 1704 | 1862 |
| 1705 | 2147 |
| 1706 | 2186 |
| 1707 | 2427 |
| 1708 | 2241 |
| 1709 | 2489 |
| 1710 | 2514 |

TABLE Z10-continued with a sequence length of 4096:

| Polarized channel sequence number | Reliability or reliability sequence number |
|---|---|
| 1711 | 2791 |
| 1712 | 1935 |
| 1713 | 2200 |
| 1714 | 2264 |
| 1715 | 2507 |
| 1716 | 2306 |
| 1717 | 2562 |
| 1718 | 2580 |
| 1719 | 2831 |
| 1720 | 2353 |
| 1721 | 2606 |
| 1722 | 2654 |
| 1723 | 2881 |
| 1724 | 2693 |
| 1725 | 2947 |
| 1726 | 2992 |
| 1727 | 3266 |
| 1728 | 1501 |
| 1729 | 1709 |
| 1730 | 1828 |
| 1731 | 2135 |
| 1732 | 1879 |
| 1733 | 2171 |
| 1734 | 2226 |
| 1735 | 2480 |
| 1736 | 1975 |
| 1737 | 2277 |
| 1738 | 2219 |
| 1739 | 2532 |
| 1740 | 2328 |
| 1741 | 2572 |
| 1742 | 2625 |
| 1743 | 2853 |
| 1744 | 2049 |
| 1745 | 2256 |
| 1746 | 2346 |
| 1747 | 2591 |
| 1748 | 2403 |
| 1749 | 2644 |
| 1750 | 2676 |
| 1751 | 2920 |
| 1752 | 2453 |
| 1753 | 2704 |
| 1754 | 2744 |
| 1755 | 2964 |
| 1756 | 2782 |
| 1757 | 3024 |
| 1758 | 3075 |
| 1759 | 3323 |
| 1760 | 2119 |
| 1761 | 2378 |
| 1762 | 2446 |
| 1763 | 2663 |
| 1764 | 2499 |
| 1765 | 2716 |
| 1766 | 2759 |
| 1767 | 3013 |
| 1768 | 2542 |
| 1769 | 2771 |
| 1770 | 2816 |
| 1771 | 3064 |
| 1772 | 2865 |
| 1773 | 3098 |
| 1774 | 3146 |
| 1775 | 3368 |
| 1776 | 2614 |
| 1777 | 2840 |
| 1778 | 2907 |
| 1779 | 3118 |
| 1780 | 2930 |
| 1781 | 3162 |
| 1782 | 3183 |
| 1783 | 3405 |
| 1784 | 2978 |
| 1785 | 3208 |

TABLE Z10-continued with a sequence length of 4096:

| Polarized channel sequence number | Reliability or reliability sequence number |
|---|---|
| 1786 | 3234 |
| 1787 | 3456 |
| 1788 | 3294 |
| 1789 | 3516 |
| 1790 | 3591 |
| 1791 | 3702 |
| 1792 | 721 |
| 1793 | 1034 |
| 1794 | 1190 |
| 1795 | 1582 |
| 1796 | 1296 |
| 1797 | 1622 |
| 1798 | 1720 |
| 1799 | 1987 |
| 1800 | 1381 |
| 1801 | 1688 |
| 1802 | 1775 |
| 1803 | 2023 |
| 1804 | 1823 |
| 1805 | 2099 |
| 1806 | 2129 |
| 1807 | 2441 |
| 1808 | 1437 |
| 1809 | 1744 |
| 1810 | 1797 |
| 1811 | 2085 |
| 1812 | 1908 |
| 1813 | 2167 |
| 1814 | 2247 |
| 1815 | 2465 |
| 1816 | 1953 |
| 1817 | 2238 |
| 1818 | 2192 |
| 1819 | 2519 |
| 1820 | 2315 |
| 1821 | 2570 |
| 1822 | 2620 |
| 1823 | 2888 |
| 1824 | 1492 |
| 1825 | 1845 |
| 1826 | 1929 |
| 1827 | 2176 |
| 1828 | 1969 |
| 1829 | 2213 |
| 1830 | 2262 |
| 1831 | 2544 |
| 1832 | 2041 |
| 1833 | 2301 |
| 1834 | 2344 |
| 1835 | 2585 |
| 1836 | 2392 |
| 1837 | 2641 |
| 1838 | 2679 |
| 1839 | 2950 |
| 1840 | 2115 |
| 1841 | 2355 |
| 1842 | 2410 |
| 1843 | 2665 |
| 1844 | 2448 |
| 1845 | 2718 |
| 1846 | 2741 |
| 1847 | 2971 |
| 1848 | 2512 |
| 1849 | 2762 |
| 1850 | 2812 |
| 1851 | 3031 |
| 1852 | 2856 |
| 1853 | 3090 |
| 1854 | 3130 |
| 1855 | 3378 |
| 1856 | 1655 |
| 1857 | 1885 |
| 1858 | 2007 |
| 1859 | 2292 |
| 1860 | 2069 |

TABLE Z10-continued with a sequence length of 4096:

| Polarized channel sequence number | Reliability or reliability sequence number |
|---|---|
| 1861 | 2323 |
| 1862 | 2376 |
| 1863 | 2630 |
| 1864 | 2137 |
| 1865 | 2434 |
| 1866 | 2366 |
| 1867 | 2690 |
| 1868 | 2475 |
| 1869 | 2724 |
| 1870 | 2788 |
| 1871 | 3006 |
| 1872 | 2205 |
| 1873 | 2401 |
| 1874 | 2502 |
| 1875 | 2756 |
| 1876 | 2560 |
| 1877 | 2806 |
| 1878 | 2837 |
| 1879 | 3057 |
| 1880 | 2612 |
| 1881 | 2868 |
| 1882 | 2900 |
| 1883 | 3102 |
| 1884 | 2944 |
| 1885 | 3166 |
| 1886 | 3200 |
| 1887 | 3438 |
| 1888 | 2271 |
| 1889 | 2537 |
| 1890 | 2593 |
| 1891 | 2825 |
| 1892 | 2660 |
| 1893 | 2884 |
| 1894 | 2914 |
| 1895 | 3150 |
| 1896 | 2701 |
| 1897 | 2927 |
| 1898 | 2954 |
| 1899 | 3178 |
| 1900 | 3016 |
| 1901 | 3221 |
| 1902 | 3261 |
| 1903 | 3467 |
| 1904 | 2776 |
| 1905 | 2985 |
| 1906 | 3038 |
| 1907 | 3239 |
| 1908 | 3068 |
| 1909 | 3280 |
| 1910 | 3303 |
| 1911 | 3497 |
| 1912 | 3114 |
| 1913 | 3318 |
| 1914 | 3347 |
| 1915 | 3542 |
| 1916 | 3394 |
| 1917 | 3598 |
| 1918 | 3660 |
| 1919 | 3760 |
| 1920 | 1545 |
| 1921 | 1868 |
| 1922 | 2055 |
| 1923 | 2382 |
| 1924 | 2153 |
| 1925 | 2424 |
| 1926 | 2529 |
| 1927 | 2768 |
| 1928 | 2228 |
| 1929 | 2484 |
| 1930 | 2575 |
| 1931 | 2800 |
| 1932 | 2628 |
| 1933 | 2859 |
| 1934 | 2894 |
| 1935 | 3191 |
| 1936 | 2284 |
| 1937 | 2554 |
| 1938 | 2604 |
| 1939 | 2849 |
| 1940 | 2699 |
| 1941 | 2923 |
| 1942 | 3009 |
| 1943 | 3204 |
| 1944 | 2733 |
| 1945 | 2995 |
| 1946 | 2960 |
| 1947 | 3243 |
| 1948 | 3072 |
| 1949 | 3284 |
| 1950 | 3332 |
| 1951 | 3536 |
| 1952 | 2335 |
| 1953 | 2649 |
| 1954 | 2713 |
| 1955 | 2940 |
| 1956 | 2747 |
| 1957 | 2988 |
| 1958 | 3020 |
| 1959 | 3270 |
| 1960 | 2819 |
| 1961 | 3060 |
| 1962 | 3094 |
| 1963 | 3289 |
| 1964 | 3138 |
| 1965 | 3342 |
| 1966 | 3373 |
| 1967 | 3576 |
| 1968 | 2872 |
| 1969 | 3106 |
| 1970 | 3158 |
| 1971 | 3363 |
| 1972 | 3195 |
| 1973 | 3400 |
| 1974 | 3416 |
| 1975 | 3613 |
| 1976 | 3230 |
| 1977 | 3444 |
| 1978 | 3479 |
| 1979 | 3652 |
| 1980 | 3504 |
| 1981 | 3694 |
| 1982 | 3730 |
| 1983 | 3881 |
| 1984 | 2458 |
| 1985 | 2674 |
| 1986 | 2785 |
| 1987 | 3049 |
| 1988 | 2834 |
| 1989 | 3087 |
| 1990 | 3126 |
| 1991 | 3337 |
| 1992 | 2910 |
| 1993 | 3170 |
| 1994 | 3122 |
| 1995 | 3384 |
| 1996 | 3217 |
| 1997 | 3410 |
| 1998 | 3461 |
| 1999 | 3628 |
| 2000 | 2974 |
| 2001 | 3154 |
| 2002 | 3225 |
| 2003 | 3427 |
| 2004 | 3275 |
| 2005 | 3473 |
| 2006 | 3491 |
| 2007 | 3676 |
| 2008 | 3313 |
| 2009 | 3523 |
| 2010 | 3549 |

TABLE Z10-continued with a sequence length of 4096:

| Polarized channel sequence number | Reliability or reliability sequence number |
|---|---|
| 2011 | 3712 |
| 2012 | 3569 |
| 2013 | 3750 |
| 2014 | 3781 |
| 2015 | 3912 |
| 2016 | 3034 |
| 2017 | 3248 |
| 2018 | 3308 |
| 2019 | 3485 |
| 2020 | 3352 |
| 2021 | 3529 |
| 2022 | 3556 |
| 2023 | 3740 |
| 2024 | 3389 |
| 2025 | 3563 |
| 2026 | 3605 |
| 2027 | 3770 |
| 2028 | 3636 |
| 2029 | 3792 |
| 2030 | 3815 |
| 2031 | 3929 |
| 2032 | 3450 |
| 2033 | 3620 |
| 2034 | 3668 |
| 2035 | 3803 |
| 2036 | 3685 |
| 2037 | 3827 |
| 2038 | 3840 |
| 2039 | 3947 |
| 2040 | 3721 |
| 2041 | 3853 |
| 2042 | 3866 |
| 2043 | 3968 |
| 2044 | 3896 |
| 2045 | 3990 |
| 2046 | 4016 |
| 2047 | 4049 |
| 2048 | 11 |
| 2049 | 46 |
| 2050 | 79 |
| 2051 | 242 |
| 2052 | 105 |
| 2053 | 256 |
| 2054 | 292 |
| 2055 | 419 |
| 2056 | 128 |
| 2057 | 280 |
| 2058 | 314 |
| 2059 | 435 |
| 2060 | 335 |
| 2061 | 482 |
| 2062 | 497 |
| 2063 | 722 |
| 2064 | 148 |
| 2065 | 303 |
| 2066 | 325 |
| 2067 | 475 |
| 2068 | 374 |
| 2069 | 532 |
| 2070 | 579 |
| 2071 | 748 |
| 2072 | 393 |
| 2073 | 572 |
| 2074 | 546 |
| 2075 | 782 |
| 2076 | 628 |
| 2077 | 820 |
| 2078 | 861 |
| 2079 | 1103 |
| 2080 | 166 |
| 2081 | 345 |
| 2082 | 384 |
| 2083 | 539 |
| 2084 | 410 |
| 2085 | 559 |

TABLE Z10-continued with a sequence length of 4096:

| Polarized channel sequence number | Reliability or reliability sequence number |
|---|---|
| 2086 | 598 |
| 2087 | 801 |
| 2088 | 443 |
| 2089 | 622 |
| 2090 | 651 |
| 2091 | 829 |
| 2092 | 690 |
| 2093 | 878 |
| 2094 | 912 |
| 2095 | 1165 |
| 2096 | 490 |
| 2097 | 657 |
| 2098 | 706 |
| 2099 | 900 |
| 2100 | 727 |
| 2101 | 945 |
| 2102 | 969 |
| 2103 | 1185 |
| 2104 | 772 |
| 2105 | 989 |
| 2106 | 1031 |
| 2107 | 1242 |
| 2108 | 1071 |
| 2109 | 1310 |
| 2110 | 1357 |
| 2111 | 1642 |
| 2112 | 268 |
| 2113 | 365 |
| 2114 | 427 |
| 2115 | 616 |
| 2116 | 467 |
| 2117 | 634 |
| 2118 | 679 |
| 2119 | 874 |
| 2120 | 512 |
| 2121 | 717 |
| 2122 | 668 |
| 2123 | 925 |
| 2124 | 753 |
| 2125 | 949 |
| 2126 | 1012 |
| 2127 | 1214 |
| 2128 | 553 |
| 2129 | 701 |
| 2130 | 768 |
| 2131 | 977 |
| 2132 | 815 |
| 2133 | 1027 |
| 2134 | 1061 |
| 2135 | 1276 |
| 2136 | 856 |
| 2137 | 1082 |
| 2138 | 1114 |
| 2139 | 1324 |
| 2140 | 1155 |
| 2141 | 1396 |
| 2142 | 1432 |
| 2143 | 1717 |
| 2144 | 604 |
| 2145 | 792 |
| 2146 | 847 |
| 2147 | 1046 |
| 2148 | 896 |
| 2149 | 1100 |
| 2150 | 1131 |
| 2151 | 1377 |
| 2152 | 933 |
| 2153 | 1145 |
| 2154 | 1172 |
| 2155 | 1410 |
| 2156 | 1230 |
| 2157 | 1457 |
| 2158 | 1504 |
| 2159 | 1758 |
| 2160 | 997 |

TABLE Z10-continued with a sequence length of 4096:

| Polarized channel sequence number | Reliability or reliability sequence number |
|---|---|
| 2161 | 1201 |
| 2162 | 1258 |
| 2163 | 1481 |
| 2164 | 1289 |
| 2165 | 1533 |
| 2166 | 1553 |
| 2167 | 1807 |
| 2168 | 1336 |
| 2169 | 1581 |
| 2170 | 1613 |
| 2171 | 1863 |
| 2172 | 1668 |
| 2173 | 1934 |
| 2174 | 2032 |
| 2175 | 2210 |
| 2176 | 183 |
| 2177 | 355 |
| 2178 | 451 |
| 2179 | 685 |
| 2180 | 526 |
| 2181 | 711 |
| 2182 | 787 |
| 2183 | 993 |
| 2184 | 566 |
| 2185 | 758 |
| 2186 | 825 |
| 2187 | 1020 |
| 2188 | 870 |
| 2189 | 1079 |
| 2190 | 1110 |
| 2191 | 1419 |
| 2192 | 610 |
| 2193 | 811 |
| 2194 | 852 |
| 2195 | 1064 |
| 2196 | 929 |
| 2197 | 1141 |
| 2198 | 1227 |
| 2199 | 1443 |
| 2200 | 957 |
| 2201 | 1211 |
| 2202 | 1175 |
| 2203 | 1489 |
| 2204 | 1292 |
| 2205 | 1536 |
| 2206 | 1588 |
| 2207 | 1854 |
| 2208 | 640 |
| 2209 | 887 |
| 2210 | 941 |
| 2211 | 1148 |
| 2212 | 973 |
| 2213 | 1204 |
| 2214 | 1239 |
| 2215 | 1515 |
| 2216 | 1035 |
| 2217 | 1280 |
| 2218 | 1313 |
| 2219 | 1546 |
| 2220 | 1368 |
| 2221 | 1606 |
| 2222 | 1632 |
| 2223 | 1924 |
| 2224 | 1093 |
| 2225 | 1327 |
| 2226 | 1391 |
| 2227 | 1625 |
| 2228 | 1430 |
| 2229 | 1682 |
| 2230 | 1701 |
| 2231 | 1962 |
| 2232 | 1470 |
| 2233 | 1726 |
| 2234 | 1776 |
| 2235 | 2016 |

TABLE Z10-continued with a sequence length of 4096:

| Polarized channel sequence number | Reliability or reliability sequence number |
|---|---|
| 2236 | 1818 |
| 2237 | 2096 |
| 2238 | 2154 |
| 2239 | 2469 |
| 2240 | 743 |
| 2241 | 908 |
| 2242 | 1005 |
| 2243 | 1264 |
| 2244 | 1053 |
| 2245 | 1304 |
| 2246 | 1351 |
| 2247 | 1596 |
| 2248 | 1128 |
| 2249 | 1402 |
| 2250 | 1345 |
| 2251 | 1652 |
| 2252 | 1449 |
| 2253 | 1692 |
| 2254 | 1745 |
| 2255 | 1986 |
| 2256 | 1188 |
| 2257 | 1379 |
| 2258 | 1467 |
| 2259 | 1708 |
| 2260 | 1523 |
| 2261 | 1767 |
| 2262 | 1798 |
| 2263 | 2066 |
| 2264 | 1573 |
| 2265 | 1829 |
| 2266 | 1871 |
| 2267 | 2118 |
| 2268 | 1909 |
| 2269 | 2189 |
| 2270 | 2248 |
| 2271 | 2548 |
| 2272 | 1255 |
| 2273 | 1499 |
| 2274 | 1563 |
| 2275 | 1783 |
| 2276 | 1615 |
| 2277 | 1839 |
| 2278 | 1888 |
| 2279 | 2175 |
| 2280 | 1659 |
| 2281 | 1901 |
| 2282 | 1948 |
| 2283 | 2233 |
| 2284 | 2002 |
| 2285 | 2270 |
| 2286 | 2324 |
| 2287 | 2599 |
| 2288 | 1735 |
| 2289 | 1978 |
| 2290 | 2046 |
| 2291 | 2296 |
| 2292 | 2082 |
| 2293 | 2349 |
| 2294 | 2374 |
| 2295 | 2653 |
| 2296 | 2136 |
| 2297 | 2405 |
| 2298 | 2437 |
| 2299 | 2711 |
| 2300 | 2511 |
| 2301 | 2795 |
| 2302 | 2892 |
| 2303 | 3047 |
| 2304 | 199 |
| 2305 | 401 |
| 2306 | 519 |
| 2307 | 806 |
| 2308 | 591 |
| 2309 | 834 |
| 2310 | 917 |

TABLE Z10-continued with a sequence length of 4096:

| Polarized channel sequence number | Reliability or reliability sequence number |
|---|---|
| 2311 | 1135 |
| 2312 | 645 |
| 2313 | 891 |
| 2314 | 965 |
| 2315 | 1168 |
| 2316 | 1001 |
| 2317 | 1236 |
| 2318 | 1261 |
| 2319 | 1558 |
| 2320 | 695 |
| 2321 | 937 |
| 2322 | 981 |
| 2323 | 1223 |
| 2324 | 1075 |
| 2325 | 1298 |
| 2326 | 1371 |
| 2327 | 1586 |
| 2328 | 1107 |
| 2329 | 1365 |
| 2330 | 1322 |
| 2331 | 1640 |
| 2332 | 1435 |
| 2333 | 1685 |
| 2334 | 1738 |
| 2335 | 2026 |
| 2336 | 732 |
| 2337 | 1024 |
| 2338 | 1086 |
| 2339 | 1307 |
| 2340 | 1121 |
| 2341 | 1339 |
| 2342 | 1382 |
| 2343 | 1664 |
| 2344 | 1181 |
| 2345 | 1424 |
| 2346 | 1465 |
| 2347 | 1703 |
| 2348 | 1512 |
| 2349 | 1760 |
| 2350 | 1803 |
| 2351 | 2102 |
| 2352 | 1249 |
| 2353 | 1478 |
| 2354 | 1528 |
| 2355 | 1789 |
| 2356 | 1566 |
| 2357 | 1844 |
| 2358 | 1867 |
| 2359 | 2124 |
| 2360 | 1630 |
| 2361 | 1890 |
| 2362 | 1942 |
| 2363 | 2193 |
| 2364 | 1992 |
| 2365 | 2259 |
| 2366 | 2313 |
| 2367 | 2613 |
| 2368 | 865 |
| 2369 | 1057 |
| 2370 | 1152 |
| 2371 | 1416 |
| 2372 | 1207 |
| 2373 | 1446 |
| 2374 | 1494 |
| 2375 | 1751 |
| 2376 | 1273 |
| 2377 | 1548 |
| 2378 | 1483 |
| 2379 | 1811 |
| 2380 | 1593 |
| 2381 | 1848 |
| 2382 | 1917 |
| 2383 | 2164 |
| 2384 | 1333 |
| 2385 | 1520 |

TABLE Z10-continued with a sequence length of 4096:

| Polarized channel sequence number | Reliability or reliability sequence number |
|---|---|
| 2386 | 1620 |
| 2387 | 1882 |
| 2388 | 1678 |
| 2389 | 1938 |
| 2390 | 1972 |
| 2391 | 2222 |
| 2392 | 1729 |
| 2393 | 2004 |
| 2394 | 2040 |
| 2395 | 2280 |
| 2396 | 2094 |
| 2397 | 2354 |
| 2398 | 2391 |
| 2399 | 2687 |
| 2400 | 1394 |
| 2401 | 1654 |
| 2402 | 1713 |
| 2403 | 1958 |
| 2404 | 1780 |
| 2405 | 2022 |
| 2406 | 2060 |
| 2407 | 2331 |
| 2408 | 1826 |
| 2409 | 2076 |
| 2410 | 2108 |
| 2411 | 2368 |
| 2412 | 2181 |
| 2413 | 2419 |
| 2414 | 2464 |
| 2415 | 2731 |
| 2416 | 1905 |
| 2417 | 2142 |
| 2418 | 2204 |
| 2419 | 2444 |
| 2420 | 2237 |
| 2421 | 2491 |
| 2422 | 2516 |
| 2423 | 2774 |
| 2424 | 2291 |
| 2425 | 2540 |
| 2426 | 2576 |
| 2427 | 2833 |
| 2428 | 2639 |
| 2429 | 2903 |
| 2430 | 2982 |
| 2431 | 3137 |
| 2432 | 777 |
| 2433 | 1038 |
| 2434 | 1195 |
| 2435 | 1502 |
| 2436 | 1283 |
| 2437 | 1543 |
| 2438 | 1644 |
| 2439 | 1897 |
| 2440 | 1354 |
| 2441 | 1603 |
| 2442 | 1694 |
| 2443 | 1930 |
| 2444 | 1749 |
| 2445 | 1996 |
| 2446 | 2038 |
| 2447 | 2381 |
| 2448 | 1408 |
| 2449 | 1671 |
| 2450 | 1722 |
| 2451 | 1980 |
| 2452 | 1820 |
| 2453 | 2070 |
| 2454 | 2170 |
| 2455 | 2400 |
| 2456 | 1857 |
| 2457 | 2158 |
| 2458 | 2112 |
| 2459 | 2450 |
| 2460 | 2242 |

TABLE Z10-continued with a sequence length of 4096:

| Polarized channel sequence number | Reliability or reliability sequence number |
|---|---|
| 2461 | 2498 |
| 2462 | 2553 |
| 2463 | 2824 |
| 2464 | 1454 |
| 2465 | 1772 |
| 2466 | 1835 |
| 2467 | 2088 |
| 2468 | 1876 |
| 2469 | 2148 |
| 2470 | 2187 |
| 2471 | 2478 |
| 2472 | 1954 |
| 2473 | 2227 |
| 2474 | 2265 |
| 2475 | 2503 |
| 2476 | 2318 |
| 2477 | 2568 |
| 2478 | 2607 |
| 2479 | 2880 |
| 2480 | 2010 |
| 2481 | 2285 |
| 2482 | 2343 |
| 2483 | 2590 |
| 2484 | 2386 |
| 2485 | 2645 |
| 2486 | 2670 |
| 2487 | 2924 |
| 2488 | 2430 |
| 2489 | 2695 |
| 2490 | 2748 |
| 2491 | 2970 |
| 2492 | 2783 |
| 2493 | 3032 |
| 2494 | 3091 |
| 2495 | 3343 |
| 2496 | 1576 |
| 2497 | 1796 |
| 2498 | 1915 |
| 2499 | 2216 |
| 2500 | 1966 |
| 2501 | 2254 |
| 2502 | 2307 |
| 2503 | 2563 |
| 2504 | 2054 |
| 2505 | 2361 |
| 2506 | 2302 |
| 2507 | 2621 |
| 2508 | 2411 |
| 2509 | 2661 |
| 2510 | 2719 |
| 2511 | 2946 |
| 2512 | 2130 |
| 2513 | 2338 |
| 2514 | 2425 |
| 2515 | 2678 |
| 2516 | 2483 |
| 2517 | 2739 |
| 2518 | 2766 |
| 2519 | 3008 |
| 2520 | 2531 |
| 2521 | 2804 |
| 2522 | 2842 |
| 2523 | 3059 |
| 2524 | 2871 |
| 2525 | 3117 |
| 2526 | 3169 |
| 2527 | 3402 |
| 2528 | 2199 |
| 2529 | 2459 |
| 2530 | 2525 |
| 2531 | 2757 |
| 2532 | 2584 |
| 2533 | 2813 |
| 2534 | 2854 |
| 2535 | 3105 |

TABLE Z10-continued with a sequence length of 4096:

| Polarized channel sequence number | Reliability or reliability sequence number |
|---|---|
| 2536 | 2631 |
| 2537 | 2863 |
| 2538 | 2915 |
| 2539 | 3152 |
| 2540 | 2958 |
| 2541 | 3188 |
| 2542 | 3224 |
| 2543 | 3437 |
| 2544 | 2702 |
| 2545 | 2935 |
| 2546 | 2993 |
| 2547 | 3207 |
| 2548 | 3021 |
| 2549 | 3247 |
| 2550 | 3268 |
| 2551 | 3474 |
| 2552 | 3074 |
| 2553 | 3292 |
| 2554 | 3317 |
| 2555 | 3520 |
| 2556 | 3371 |
| 2557 | 3574 |
| 2558 | 3642 |
| 2559 | 3744 |
| 2560 | 214 |
| 2561 | 459 |
| 2562 | 585 |
| 2563 | 953 |
| 2564 | 674 |
| 2565 | 985 |
| 2566 | 1068 |
| 2567 | 1316 |
| 2568 | 737 |
| 2569 | 1042 |
| 2570 | 1117 |
| 2571 | 1348 |
| 2572 | 1162 |
| 2573 | 1413 |
| 2574 | 1438 |
| 2575 | 1756 |
| 2576 | 797 |
| 2577 | 1096 |
| 2578 | 1138 |
| 2579 | 1399 |
| 2580 | 1233 |
| 2581 | 1486 |
| 2582 | 1561 |
| 2583 | 1787 |
| 2584 | 1267 |
| 2585 | 1551 |
| 2586 | 1507 |
| 2587 | 1831 |
| 2588 | 1628 |
| 2589 | 1880 |
| 2590 | 1926 |
| 2591 | 2223 |
| 2592 | 843 |
| 2593 | 1178 |
| 2594 | 1252 |
| 2595 | 1497 |
| 2596 | 1301 |
| 2597 | 1530 |
| 2598 | 1578 |
| 2599 | 1850 |
| 2600 | 1359 |
| 2601 | 1618 |
| 2602 | 1666 |
| 2603 | 1892 |
| 2604 | 1706 |
| 2605 | 1950 |
| 2606 | 1988 |
| 2607 | 2294 |
| 2608 | 1427 |
| 2609 | 1675 |
| 2610 | 1733 |

TABLE Z10-continued with a sequence length of 4096:

| Polarized channel sequence number | Reliability or reliability sequence number |
|---|---|
| 2611 | 1974 |
| 2612 | 1765 |
| 2613 | 2030 |
| 2614 | 2056 |
| 2615 | 2322 |
| 2616 | 1816 |
| 2617 | 2080 |
| 2618 | 2132 |
| 2619 | 2388 |
| 2620 | 2179 |
| 2621 | 2461 |
| 2622 | 2515 |
| 2623 | 2801 |
| 2624 | 1016 |
| 2625 | 1220 |
| 2626 | 1330 |
| 2627 | 1608 |
| 2628 | 1388 |
| 2629 | 1635 |
| 2630 | 1689 |
| 2631 | 1946 |
| 2632 | 1451 |
| 2633 | 1747 |
| 2634 | 1680 |
| 2635 | 2000 |
| 2636 | 1792 |
| 2637 | 2036 |
| 2638 | 2110 |
| 2639 | 2358 |
| 2640 | 1517 |
| 2641 | 1724 |
| 2642 | 1809 |
| 2643 | 2068 |
| 2644 | 1874 |
| 2645 | 2128 |
| 2646 | 2168 |
| 2647 | 2423 |
| 2648 | 1922 |
| 2649 | 2201 |
| 2650 | 2240 |
| 2651 | 2474 |
| 2652 | 2289 |
| 2653 | 2556 |
| 2654 | 2594 |
| 2655 | 2870 |
| 2656 | 1591 |
| 2657 | 1846 |
| 2658 | 1907 |
| 2659 | 2150 |
| 2660 | 1970 |
| 2661 | 2218 |
| 2662 | 2257 |
| 2663 | 2535 |
| 2664 | 2014 |
| 2665 | 2274 |
| 2666 | 2305 |
| 2667 | 2571 |
| 2668 | 2372 |
| 2669 | 2619 |
| 2670 | 2667 |
| 2671 | 2906 |
| 2672 | 2090 |
| 2673 | 2336 |
| 2674 | 2402 |
| 2675 | 2642 |
| 2676 | 2438 |
| 2677 | 2694 |
| 2678 | 2715 |
| 2679 | 2949 |
| 2680 | 2490 |
| 2681 | 2742 |
| 2682 | 2772 |
| 2683 | 2997 |
| 2684 | 2827 |
| 2685 | 3054 |

TABLE Z10-continued with a sequence length of 4096:

| Polarized channel sequence number | Reliability or reliability sequence number |
|---|---|
| 2686 | 3131 |
| 2687 | 3262 |
| 2688 | 883 |
| 2689 | 1198 |
| 2690 | 1374 |
| 2691 | 1696 |
| 2692 | 1473 |
| 2693 | 1740 |
| 2694 | 1837 |
| 2695 | 2084 |
| 2696 | 1538 |
| 2697 | 1800 |
| 2698 | 1884 |
| 2699 | 2116 |
| 2700 | 1940 |
| 2701 | 2195 |
| 2702 | 2235 |
| 2703 | 2579 |
| 2704 | 1601 |
| 2705 | 1865 |
| 2706 | 1913 |
| 2707 | 2174 |
| 2708 | 2008 |
| 2709 | 2268 |
| 2710 | 2367 |
| 2711 | 2602 |
| 2712 | 2044 |
| 2713 | 2352 |
| 2714 | 2311 |
| 2715 | 2650 |
| 2716 | 2442 |
| 2717 | 2698 |
| 2718 | 2751 |
| 2719 | 2987 |
| 2720 | 1647 |
| 2721 | 1956 |
| 2722 | 2024 |
| 2723 | 2276 |
| 2724 | 2062 |
| 2725 | 2342 |
| 2726 | 2383 |
| 2727 | 2675 |
| 2728 | 2138 |
| 2729 | 2428 |
| 2730 | 2466 |
| 2731 | 2708 |
| 2732 | 2523 |
| 2733 | 2769 |
| 2734 | 2792 |
| 2735 | 3044 |
| 2736 | 2212 |
| 2737 | 2481 |
| 2738 | 2545 |
| 2739 | 2786 |
| 2740 | 2587 |
| 2741 | 2839 |
| 2742 | 2857 |
| 2743 | 3078 |
| 2744 | 2632 |
| 2745 | 2877 |
| 2746 | 2921 |
| 2747 | 3121 |
| 2748 | 2955 |
| 2749 | 3179 |
| 2750 | 3218 |
| 2751 | 3445 |
| 2752 | 1778 |
| 2753 | 1982 |
| 2754 | 2104 |
| 2755 | 2414 |
| 2756 | 2156 |
| 2757 | 2452 |
| 2758 | 2506 |
| 2759 | 2760 |
| 2760 | 2252 |

TABLE Z10-continued

| with a sequence length of 4096: | |
|---|---|
| Polarized channel sequence number | Reliability or reliability sequence number |
| 2761 | 2559 |
| 2762 | 2500 |
| 2763 | 2810 |
| 2764 | 2610 |
| 2765 | 2848 |
| 2766 | 2895 |
| 2767 | 3096 |
| 2768 | 2327 |
| 2769 | 2536 |
| 2770 | 2627 |
| 2771 | 2866 |
| 2772 | 2684 |
| 2773 | 2912 |
| 2774 | 2941 |
| 2775 | 3156 |
| 2776 | 2734 |
| 2777 | 2968 |
| 2778 | 3003 |
| 2779 | 3194 |
| 2780 | 3036 |
| 2781 | 3245 |
| 2782 | 3288 |
| 2783 | 3494 |
| 2784 | 2397 |
| 2785 | 2659 |
| 2786 | 2725 |
| 2787 | 2929 |
| 2788 | 2777 |
| 2789 | 2976 |
| 2790 | 3014 |
| 2791 | 3235 |
| 2792 | 2818 |
| 2793 | 3026 |
| 2794 | 3066 |
| 2795 | 3278 |
| 2796 | 3108 |
| 2797 | 3306 |
| 2798 | 3346 |
| 2799 | 3528 |
| 2800 | 2886 |
| 2801 | 3086 |
| 2802 | 3143 |
| 2803 | 3324 |
| 2804 | 3165 |
| 2805 | 3360 |
| 2806 | 3379 |
| 2807 | 3560 |
| 2808 | 3205 |
| 2809 | 3398 |
| 2810 | 3422 |
| 2811 | 3597 |
| 2812 | 3469 |
| 2813 | 3647 |
| 2814 | 3703 |
| 2815 | 3790 |
| 2816 | 921 |
| 2817 | 1286 |
| 2818 | 1462 |
| 2819 | 1859 |
| 2820 | 1571 |
| 2821 | 1899 |
| 2822 | 1994 |
| 2823 | 2263 |
| 2824 | 1656 |
| 2825 | 1964 |
| 2826 | 2052 |
| 2827 | 2300 |
| 2828 | 2098 |
| 2829 | 2377 |
| 2830 | 2409 |
| 2831 | 2722 |
| 2832 | 1715 |
| 2833 | 2018 |
| 2834 | 2074 |
| 2835 | 2363 |

TABLE Z10-continued

| with a sequence length of 4096: | |
|---|---|
| Polarized channel sequence number | Reliability or reliability sequence number |
| 2836 | 2185 |
| 2837 | 2447 |
| 2838 | 2528 |
| 2839 | 2745 |
| 2840 | 2229 |
| 2841 | 2520 |
| 2842 | 2473 |
| 2843 | 2798 |
| 2844 | 2595 |
| 2845 | 2845 |
| 2846 | 2889 |
| 2847 | 3127 |
| 2848 | 1769 |
| 2849 | 2122 |
| 2850 | 2206 |
| 2851 | 2456 |
| 2852 | 2246 |
| 2853 | 2495 |
| 2854 | 2543 |
| 2855 | 2821 |
| 2856 | 2316 |
| 2857 | 2582 |
| 2858 | 2624 |
| 2859 | 2860 |
| 2860 | 2673 |
| 2861 | 2909 |
| 2862 | 2943 |
| 2863 | 3181 |
| 2864 | 2395 |
| 2865 | 2635 |
| 2866 | 2691 |
| 2867 | 2932 |
| 2868 | 2728 |
| 2869 | 2979 |
| 2870 | 3000 |
| 2871 | 3198 |
| 2872 | 2789 |
| 2873 | 3018 |
| 2874 | 3062 |
| 2875 | 3251 |
| 2876 | 3100 |
| 2877 | 3300 |
| 2878 | 3335 |
| 2879 | 3538 |
| 2880 | 1932 |
| 2881 | 2162 |
| 2882 | 2283 |
| 2883 | 2573 |
| 2884 | 2347 |
| 2885 | 2605 |
| 2886 | 2656 |
| 2887 | 2901 |
| 2888 | 2416 |
| 2889 | 2714 |
| 2890 | 2647 |
| 2891 | 2952 |
| 2892 | 2754 |
| 2893 | 2984 |
| 2894 | 3041 |
| 2895 | 3228 |
| 2896 | 2486 |
| 2897 | 2681 |
| 2898 | 2780 |
| 2899 | 3011 |
| 2900 | 2836 |
| 2901 | 3056 |
| 2902 | 3084 |
| 2903 | 3272 |
| 2904 | 2883 |
| 2905 | 3112 |
| 2906 | 3140 |
| 2907 | 3310 |
| 2908 | 3175 |
| 2909 | 3364 |
| 2910 | 3391 |

TABLE Z10-continued

| with a sequence length of 4096: | |
|---|---|
| Polarized channel sequence number | Reliability or reliability sequence number |
| 2911 | 3583 |
| 2912 | 2551 |
| 2913 | 2815 |
| 2914 | 2869 |
| 2915 | 3071 |
| 2916 | 2926 |
| 2917 | 3124 |
| 2918 | 3149 |
| 2919 | 3350 |
| 2920 | 2965 |
| 2921 | 3163 |
| 2922 | 3185 |
| 2923 | 3375 |
| 2924 | 3237 |
| 2925 | 3409 |
| 2926 | 3441 |
| 2927 | 3607 |
| 2928 | 3029 |
| 2929 | 3211 |
| 2930 | 3258 |
| 2931 | 3425 |
| 2932 | 3282 |
| 2933 | 3457 |
| 2934 | 3477 |
| 2935 | 3632 |
| 2936 | 3321 |
| 2937 | 3490 |
| 2938 | 3511 |
| 2939 | 3669 |
| 2940 | 3551 |
| 2941 | 3708 |
| 2942 | 3757 |
| 2943 | 3835 |
| 2944 | 1822 |
| 2945 | 2144 |
| 2946 | 2333 |
| 2947 | 2664 |
| 2948 | 2433 |
| 2949 | 2705 |
| 2950 | 2807 |
| 2951 | 3023 |
| 2952 | 2508 |
| 2953 | 2763 |
| 2954 | 2851 |
| 2955 | 3051 |
| 2956 | 2898 |
| 2957 | 3103 |
| 2958 | 3133 |
| 2959 | 3383 |
| 2960 | 2564 |
| 2961 | 2830 |
| 2962 | 2874 |
| 2963 | 3093 |
| 2964 | 2962 |
| 2965 | 3159 |
| 2966 | 3231 |
| 2967 | 3395 |
| 2968 | 2990 |
| 2969 | 3222 |
| 2970 | 3192 |
| 2971 | 3429 |
| 2972 | 3286 |
| 2973 | 3462 |
| 2974 | 3499 |
| 2975 | 3663 |
| 2976 | 2616 |
| 2977 | 2918 |
| 2978 | 2973 |
| 2979 | 3172 |
| 2980 | 3005 |
| 2981 | 3214 |
| 2982 | 3241 |
| 2983 | 3448 |
| 2984 | 3069 |
| 2985 | 3276 |

TABLE Z10-continued

| with a sequence length of 4096: | |
|---|---|
| Polarized channel sequence number | Reliability or reliability sequence number |
| 2986 | 3304 |
| 2987 | 3465 |
| 2988 | 3339 |
| 2989 | 3507 |
| 2990 | 3533 |
| 2991 | 3696 |
| 2992 | 3115 |
| 2993 | 3314 |
| 2994 | 3356 |
| 2995 | 3524 |
| 2996 | 3387 |
| 2997 | 3555 |
| 2998 | 3570 |
| 2999 | 3719 |
| 3000 | 3418 |
| 3001 | 3588 |
| 3002 | 3617 |
| 3003 | 3751 |
| 3004 | 3637 |
| 3005 | 3784 |
| 3006 | 3812 |
| 3007 | 3927 |
| 3008 | 2737 |
| 3009 | 2938 |
| 3010 | 3039 |
| 3011 | 3265 |
| 3012 | 3081 |
| 3013 | 3296 |
| 3014 | 3331 |
| 3015 | 3502 |
| 3016 | 3147 |
| 3017 | 3367 |
| 3018 | 3327 |
| 3019 | 3541 |
| 3020 | 3406 |
| 3021 | 3565 |
| 3022 | 3602 |
| 3023 | 3732 |
| 3024 | 3201 |
| 3025 | 3354 |
| 3026 | 3413 |
| 3027 | 3579 |
| 3028 | 3453 |
| 3029 | 3612 |
| 3030 | 3626 |
| 3031 | 3769 |
| 3032 | 3486 |
| 3033 | 3653 |
| 3034 | 3674 |
| 3035 | 3797 |
| 3036 | 3690 |
| 3037 | 3828 |
| 3038 | 3851 |
| 3039 | 3951 |
| 3040 | 3255 |
| 3041 | 3432 |
| 3042 | 3482 |
| 3043 | 3622 |
| 3044 | 3515 |
| 3045 | 3658 |
| 3046 | 3680 |
| 3047 | 3819 |
| 3048 | 3546 |
| 3049 | 3686 |
| 3050 | 3714 |
| 3051 | 3843 |
| 3052 | 3737 |
| 3053 | 3860 |
| 3054 | 3877 |
| 3055 | 3964 |
| 3056 | 3593 |
| 3057 | 3726 |
| 3058 | 3763 |
| 3059 | 3869 |
| 3060 | 3776 |

TABLE Z10-continued

| with a sequence length of 4096: | |
|---|---|
| Polarized channel sequence number | Reliability or reliability sequence number |
| 3061 | 3887 |
| 3062 | 3897 |
| 3063 | 3978 |
| 3064 | 3805 |
| 3065 | 3906 |
| 3066 | 3917 |
| 3067 | 3994 |
| 3068 | 3939 |
| 3069 | 4010 |
| 3070 | 4031 |
| 3071 | 4056 |
| 3072 | 229 |
| 3073 | 504 |
| 3074 | 662 |
| 3075 | 1124 |
| 3076 | 763 |
| 3077 | 1158 |
| 3078 | 1246 |
| 3079 | 1510 |
| 3080 | 838 |
| 3081 | 1217 |
| 3082 | 1295 |
| 3083 | 1541 |
| 3084 | 1342 |
| 3085 | 1623 |
| 3086 | 1649 |
| 3087 | 1984 |
| 3088 | 904 |
| 3089 | 1270 |
| 3090 | 1319 |
| 3091 | 1611 |
| 3092 | 1421 |
| 3093 | 1699 |
| 3094 | 1774 |
| 3095 | 2020 |
| 3096 | 1459 |
| 3097 | 1763 |
| 3098 | 1719 |
| 3099 | 2064 |
| 3100 | 1852 |
| 3101 | 2120 |
| 3102 | 2172 |
| 3103 | 2468 |
| 3104 | 961 |
| 3105 | 1362 |
| 3106 | 1441 |
| 3107 | 1710 |
| 3108 | 1491 |
| 3109 | 1742 |
| 3110 | 1805 |
| 3111 | 2092 |
| 3112 | 1556 |
| 3113 | 1842 |
| 3114 | 1886 |
| 3115 | 2134 |
| 3116 | 1936 |
| 3117 | 2197 |
| 3118 | 2239 |
| 3119 | 2533 |
| 3120 | 1637 |
| 3121 | 1895 |
| 3122 | 1960 |
| 3123 | 2225 |
| 3124 | 1990 |
| 3125 | 2281 |
| 3126 | 2309 |
| 3127 | 2558 |
| 3128 | 2050 |
| 3129 | 2334 |
| 3130 | 2384 |
| 3131 | 2618 |
| 3132 | 2431 |
| 3133 | 2686 |
| 3134 | 2732 |
| 3135 | 3001 |

TABLE Z10-continued

| with a sequence length of 4096: | |
|---|---|
| Polarized channel sequence number | Reliability or reliability sequence number |
| 3136 | 1191 |
| 3137 | 1405 |
| 3138 | 1525 |
| 3139 | 1833 |
| 3140 | 1598 |
| 3141 | 1861 |
| 3142 | 1920 |
| 3143 | 2191 |
| 3144 | 1661 |
| 3145 | 1976 |
| 3146 | 1903 |
| 3147 | 2255 |
| 3148 | 2028 |
| 3149 | 2287 |
| 3150 | 2359 |
| 3151 | 2589 |
| 3152 | 1731 |
| 3153 | 1952 |
| 3154 | 2042 |
| 3155 | 2320 |
| 3156 | 2114 |
| 3157 | 2379 |
| 3158 | 2418 |
| 3159 | 2651 |
| 3160 | 2166 |
| 3161 | 2445 |
| 3162 | 2479 |
| 3163 | 2700 |
| 3164 | 2526 |
| 3165 | 2770 |
| 3166 | 2805 |
| 3167 | 3067 |
| 3168 | 1813 |
| 3169 | 2078 |
| 3170 | 2152 |
| 3171 | 2404 |
| 3172 | 2220 |
| 3173 | 2462 |
| 3174 | 2496 |
| 3175 | 2752 |
| 3176 | 2267 |
| 3177 | 2513 |
| 3178 | 2541 |
| 3179 | 2784 |
| 3180 | 2603 |
| 3181 | 2829 |
| 3182 | 2876 |
| 3183 | 3101 |
| 3184 | 2345 |
| 3185 | 2574 |
| 3186 | 2634 |
| 3187 | 2850 |
| 3188 | 2666 |
| 3189 | 2902 |
| 3190 | 2922 |
| 3191 | 3141 |
| 3192 | 2712 |
| 3193 | 2948 |
| 3194 | 2975 |
| 3195 | 3186 |
| 3196 | 3025 |
| 3197 | 3242 |
| 3198 | 3315 |
| 3199 | 3430 |
| 3200 | 1008 |
| 3201 | 1385 |
| 3202 | 1568 |
| 3203 | 1928 |
| 3204 | 1687 |
| 3205 | 1968 |
| 3206 | 2072 |
| 3207 | 2340 |
| 3208 | 1754 |
| 3209 | 2034 |
| 3210 | 2126 |

TABLE Z10-continued

| with a sequence length of 4096: | |
|---|---|
| Polarized channel sequence number | Reliability or reliability sequence number |
| 3211 | 2370 |
| 3212 | 2183 |
| 3213 | 2440 |
| 3214 | 2476 |
| 3215 | 2793 |
| 3216 | 1824 |
| 3217 | 2106 |
| 3218 | 2160 |
| 3219 | 2421 |
| 3220 | 2261 |
| 3221 | 2510 |
| 3222 | 2600 |
| 3223 | 2814 |
| 3224 | 2298 |
| 3225 | 2586 |
| 3226 | 2546 |
| 3227 | 2858 |
| 3228 | 2669 |
| 3229 | 2905 |
| 3230 | 2953 |
| 3231 | 3180 |
| 3232 | 1869 |
| 3233 | 2208 |
| 3234 | 2278 |
| 3235 | 2518 |
| 3236 | 2314 |
| 3237 | 2577 |
| 3238 | 2615 |
| 3239 | 2885 |
| 3240 | 2390 |
| 3241 | 2655 |
| 3242 | 2689 |
| 3243 | 2913 |
| 3244 | 2743 |
| 3245 | 2969 |
| 3246 | 2994 |
| 3247 | 3233 |
| 3248 | 2454 |
| 3249 | 2703 |
| 3250 | 2764 |
| 3251 | 2986 |
| 3252 | 2802 |
| 3253 | 3037 |
| 3254 | 3052 |
| 3255 | 3263 |
| 3256 | 2841 |
| 3257 | 3076 |
| 3258 | 3116 |
| 3259 | 3302 |
| 3260 | 3151 |
| 3261 | 3357 |
| 3262 | 3393 |
| 3263 | 3582 |
| 3264 | 2012 |
| 3265 | 2231 |
| 3266 | 2356 |
| 3267 | 2640 |
| 3268 | 2407 |
| 3269 | 2680 |
| 3270 | 2726 |
| 3271 | 2961 |
| 3272 | 2493 |
| 3273 | 2778 |
| 3274 | 2720 |
| 3275 | 3010 |
| 3276 | 2820 |
| 3277 | 3046 |
| 3278 | 3089 |
| 3279 | 3281 |
| 3280 | 2561 |
| 3281 | 2755 |
| 3282 | 2838 |
| 3283 | 3061 |
| 3284 | 2893 |
| 3285 | 3109 |

TABLE Z10-continued

| with a sequence length of 4096: | |
|---|---|
| Polarized channel sequence number | Reliability or reliability sequence number |
| 3286 | 3135 |
| 3287 | 3336 |
| 3288 | 2939 |
| 3289 | 3160 |
| 3290 | 3193 |
| 3291 | 3372 |
| 3292 | 3223 |
| 3293 | 3417 |
| 3294 | 3454 |
| 3295 | 3625 |
| 3296 | 2629 |
| 3297 | 2867 |
| 3298 | 2931 |
| 3299 | 3123 |
| 3300 | 2977 |
| 3301 | 3168 |
| 3302 | 3206 |
| 3303 | 3408 |
| 3304 | 3017 |
| 3305 | 3216 |
| 3306 | 3253 |
| 3307 | 3443 |
| 3308 | 3293 |
| 3309 | 3468 |
| 3310 | 3500 |
| 3311 | 3651 |
| 3312 | 3082 |
| 3313 | 3274 |
| 3314 | 3325 |
| 3315 | 3483 |
| 3316 | 3348 |
| 3317 | 3514 |
| 3318 | 3530 |
| 3319 | 3679 |
| 3320 | 3382 |
| 3321 | 3547 |
| 3322 | 3564 |
| 3323 | 3707 |
| 3324 | 3606 |
| 3325 | 3747 |
| 3326 | 3793 |
| 3327 | 3859 |
| 3328 | 1050 |
| 3329 | 1475 |
| 3330 | 1673 |
| 3331 | 2100 |
| 3332 | 1794 |
| 3333 | 2140 |
| 3334 | 2244 |
| 3335 | 2501 |
| 3336 | 1878 |
| 3337 | 2214 |
| 3338 | 2303 |
| 3339 | 2538 |
| 3340 | 2351 |
| 3341 | 2611 |
| 3342 | 2637 |
| 3343 | 2925 |
| 3344 | 1944 |
| 3345 | 2272 |
| 3346 | 2325 |
| 3347 | 2597 |
| 3348 | 2435 |
| 3349 | 2672 |
| 3350 | 2746 |
| 3351 | 2951 |
| 3352 | 2471 |
| 3353 | 2740 |
| 3354 | 2697 |
| 3355 | 2998 |
| 3356 | 2808 |
| 3357 | 3040 |
| 3358 | 3085 |
| 3359 | 3311 |
| 3360 | 1998 |

TABLE Z10-continued with a sequence length of 4096:

| Polarized channel sequence number | Reliability or reliability sequence number |
|---|---|
| 3361 | 2375 |
| 3362 | 2449 |
| 3363 | 2683 |
| 3364 | 2488 |
| 3365 | 2717 |
| 3366 | 2758 |
| 3367 | 3019 |
| 3368 | 2555 |
| 3369 | 2796 |
| 3370 | 2835 |
| 3371 | 3055 |
| 3372 | 2882 |
| 3373 | 3104 |
| 3374 | 3139 |
| 3375 | 3361 |
| 3376 | 2623 |
| 3377 | 2847 |
| 3378 | 2896 |
| 3379 | 3128 |
| 3380 | 2934 |
| 3381 | 3171 |
| 3382 | 3190 |
| 3383 | 3376 |
| 3384 | 2991 |
| 3385 | 3209 |
| 3386 | 3249 |
| 3387 | 3419 |
| 3388 | 3285 |
| 3389 | 3460 |
| 3390 | 3493 |
| 3391 | 3659 |
| 3392 | 2177 |
| 3393 | 2412 |
| 3394 | 2521 |
| 3395 | 2790 |
| 3396 | 2581 |
| 3397 | 2817 |
| 3398 | 2861 |
| 3399 | 3097 |
| 3400 | 2648 |
| 3401 | 2916 |
| 3402 | 2852 |
| 3403 | 3145 |
| 3404 | 2959 |
| 3405 | 3176 |
| 3406 | 3229 |
| 3407 | 3401 |
| 3408 | 2709 |
| 3409 | 2890 |
| 3410 | 2983 |
| 3411 | 3202 |
| 3412 | 3033 |
| 3413 | 3244 |
| 3414 | 3271 |
| 3415 | 3436 |
| 3416 | 3077 |
| 3417 | 3295 |
| 3418 | 3320 |
| 3419 | 3472 |
| 3420 | 3355 |
| 3421 | 3518 |
| 3422 | 3539 |
| 3423 | 3697 |
| 3424 | 2767 |
| 3425 | 3012 |
| 3426 | 3063 |
| 3427 | 3260 |
| 3428 | 3120 |
| 3429 | 3307 |
| 3430 | 3333 |
| 3431 | 3503 |
| 3432 | 3157 |
| 3433 | 3344 |
| 3434 | 3365 |
| 3435 | 3526 |

TABLE Z10-continued with a sequence length of 4096:

| Polarized channel sequence number | Reliability or reliability sequence number |
|---|---|
| 3436 | 3412 |
| 3437 | 3554 |
| 3438 | 3580 |
| 3439 | 3717 |
| 3440 | 3219 |
| 3441 | 3386 |
| 3442 | 3426 |
| 3443 | 3568 |
| 3444 | 3447 |
| 3445 | 3595 |
| 3446 | 3609 |
| 3447 | 3738 |
| 3448 | 3480 |
| 3449 | 3621 |
| 3450 | 3640 |
| 3451 | 3765 |
| 3452 | 3672 |
| 3453 | 3798 |
| 3454 | 3832 |
| 3455 | 3894 |
| 3456 | 2058 |
| 3457 | 2393 |
| 3458 | 2566 |
| 3459 | 2873 |
| 3460 | 2658 |
| 3461 | 2911 |
| 3462 | 3004 |
| 3463 | 3213 |
| 3464 | 2729 |
| 3465 | 2966 |
| 3466 | 3048 |
| 3467 | 3238 |
| 3468 | 3095 |
| 3469 | 3290 |
| 3470 | 3319 |
| 3471 | 3532 |
| 3472 | 2781 |
| 3473 | 3028 |
| 3474 | 3070 |
| 3475 | 3277 |
| 3476 | 3153 |
| 3477 | 3340 |
| 3478 | 3404 |
| 3479 | 3544 |
| 3480 | 3182 |
| 3481 | 3397 |
| 3482 | 3369 |
| 3483 | 3572 |
| 3484 | 3451 |
| 3485 | 3599 |
| 3486 | 3629 |
| 3487 | 3761 |
| 3488 | 2826 |
| 3489 | 3113 |
| 3490 | 3164 |
| 3491 | 3351 |
| 3492 | 3197 |
| 3493 | 3390 |
| 3494 | 3415 |
| 3495 | 3587 |
| 3496 | 3256 |
| 3497 | 3440 |
| 3498 | 3464 |
| 3499 | 3601 |
| 3500 | 3496 |
| 3501 | 3635 |
| 3502 | 3656 |
| 3503 | 3787 |
| 3504 | 3299 |
| 3505 | 3476 |
| 3506 | 3512 |
| 3507 | 3648 |
| 3508 | 3535 |
| 3509 | 3675 |
| 3510 | 3688 |

TABLE Z10-continued

| with a sequence length of 4096: | |
|---|---|
| Polarized channel sequence number | Reliability or reliability sequence number |
| 3511 | 3807 |
| 3512 | 3561 |
| 3513 | 3700 |
| 3514 | 3725 |
| 3515 | 3826 |
| 3516 | 3742 |
| 3517 | 3854 |
| 3518 | 3876 |
| 3519 | 3966 |
| 3520 | 2942 |
| 3521 | 3132 |
| 3522 | 3227 |
| 3523 | 3434 |
| 3524 | 3267 |
| 3525 | 3458 |
| 3526 | 3489 |
| 3527 | 3633 |
| 3528 | 3329 |
| 3529 | 3521 |
| 3530 | 3487 |
| 3531 | 3664 |
| 3532 | 3550 |
| 3533 | 3683 |
| 3534 | 3711 |
| 3535 | 3817 |
| 3536 | 3380 |
| 3537 | 3508 |
| 3538 | 3558 |
| 3539 | 3692 |
| 3540 | 3590 |
| 3541 | 3722 |
| 3542 | 3734 |
| 3543 | 3844 |
| 3544 | 3616 |
| 3545 | 3752 |
| 3546 | 3768 |
| 3547 | 3864 |
| 3548 | 3783 |
| 3549 | 3888 |
| 3550 | 3907 |
| 3551 | 3984 |
| 3552 | 3423 |
| 3553 | 3577 |
| 3554 | 3614 |
| 3555 | 3729 |
| 3556 | 3645 |
| 3557 | 3755 |
| 3558 | 3774 |
| 3559 | 3883 |
| 3560 | 3667 |
| 3561 | 3778 |
| 3562 | 3802 |
| 3563 | 3901 |
| 3564 | 3822 |
| 3565 | 3914 |
| 3566 | 3926 |
| 3567 | 3995 |
| 3568 | 3704 |
| 3569 | 3811 |
| 3570 | 3837 |
| 3571 | 3921 |
| 3572 | 3848 |
| 3573 | 3935 |
| 3574 | 3942 |
| 3575 | 4004 |
| 3576 | 3871 |
| 3577 | 3950 |
| 3578 | 3958 |
| 3579 | 4017 |
| 3580 | 3975 |
| 3581 | 4029 |
| 3582 | 4044 |
| 3583 | 4064 |
| 3584 | 1089 |
| 3585 | 1583 |

TABLE Z10-continued

| with a sequence length of 4096: | |
|---|---|
| Polarized channel sequence number | Reliability or reliability sequence number |
| 3586 | 1785 |
| 3587 | 2293 |
| 3588 | 1911 |
| 3589 | 2329 |
| 3590 | 2426 |
| 3591 | 2692 |
| 3592 | 2006 |
| 3593 | 2398 |
| 3594 | 2485 |
| 3595 | 2723 |
| 3596 | 2530 |
| 3597 | 2787 |
| 3598 | 2811 |
| 3599 | 3099 |
| 3600 | 2086 |
| 3601 | 2457 |
| 3602 | 2505 |
| 3603 | 2775 |
| 3604 | 2608 |
| 3605 | 2855 |
| 3606 | 2928 |
| 3607 | 3125 |
| 3608 | 2643 |
| 3609 | 2919 |
| 3610 | 2879 |
| 3611 | 3161 |
| 3612 | 2989 |
| 3613 | 3199 |
| 3614 | 3236 |
| 3615 | 3439 |
| 3616 | 2146 |
| 3617 | 2550 |
| 3618 | 2626 |
| 3619 | 2864 |
| 3620 | 2677 |
| 3621 | 2899 |
| 3622 | 2945 |
| 3623 | 3177 |
| 3624 | 2735 |
| 3625 | 2980 |
| 3626 | 3022 |
| 3627 | 3210 |
| 3628 | 3058 |
| 3629 | 3254 |
| 3630 | 3283 |
| 3631 | 3481 |
| 3632 | 2799 |
| 3633 | 3030 |
| 3634 | 3080 |
| 3635 | 3273 |
| 3636 | 3107 |
| 3637 | 3312 |
| 3638 | 3330 |
| 3639 | 3498 |
| 3640 | 3148 |
| 3641 | 3345 |
| 3642 | 3381 |
| 3643 | 3537 |
| 3644 | 3411 |
| 3645 | 3578 |
| 3646 | 3608 |
| 3647 | 3749 |
| 3648 | 2365 |
| 3649 | 2592 |
| 3650 | 2706 |
| 3651 | 2972 |
| 3652 | 2761 |
| 3653 | 2996 |
| 3654 | 3043 |
| 3655 | 3250 |
| 3656 | 2823 |
| 3657 | 3092 |
| 3658 | 3035 |
| 3659 | 3291 |
| 3660 | 3129 |

TABLE Z10-continued

| with a sequence length of 4096: | |
|---|---|
| Polarized channel sequence number | Reliability or reliability sequence number |
| 3661 | 3316 |
| 3662 | 3366 |
| 3663 | 3519 |
| 3664 | 2887 |
| 3665 | 3073 |
| 3666 | 3144 |
| 3667 | 3338 |
| 3668 | 3196 |
| 3669 | 3377 |
| 3670 | 3403 |
| 3671 | 3557 |
| 3672 | 3232 |
| 3673 | 3424 |
| 3674 | 3449 |
| 3675 | 3586 |
| 3676 | 3478 |
| 3677 | 3630 |
| 3678 | 3649 |
| 3679 | 3782 |
| 3680 | 2956 |
| 3681 | 3173 |
| 3682 | 3220 |
| 3683 | 3392 |
| 3684 | 3269 |
| 3685 | 3435 |
| 3686 | 3459 |
| 3687 | 3618 |
| 3688 | 3301 |
| 3689 | 3470 |
| 3690 | 3488 |
| 3691 | 3638 |
| 3692 | 3527 |
| 3693 | 3662 |
| 3694 | 3687 |
| 3695 | 3799 |
| 3696 | 3353 |
| 3697 | 3506 |
| 3698 | 3545 |
| 3699 | 3673 |
| 3700 | 3566 |
| 3701 | 3699 |
| 3702 | 3710 |
| 3703 | 3818 |
| 3704 | 3594 |
| 3705 | 3723 |
| 3706 | 3736 |
| 3707 | 3838 |
| 3708 | 3762 |
| 3709 | 3862 |
| 3710 | 3892 |
| 3711 | 3940 |
| 3712 | 2202 |
| 3713 | 2569 |
| 3714 | 2749 |
| 3715 | 3050 |
| 3716 | 2844 |
| 3717 | 3088 |
| 3718 | 3167 |
| 3719 | 3349 |
| 3720 | 2908 |
| 3721 | 3136 |
| 3722 | 3203 |
| 3723 | 3370 |
| 3724 | 3246 |
| 3725 | 3420 |
| 3726 | 3446 |
| 3727 | 3641 |
| 3728 | 2963 |
| 3729 | 3189 |
| 3730 | 3226 |
| 3731 | 3407 |
| 3732 | 3297 |
| 3733 | 3466 |
| 3734 | 3525 |
| 3735 | 3654 |

TABLE Z10-continued

| with a sequence length of 4096: | |
|---|---|
| Polarized channel sequence number | Reliability or reliability sequence number |
| 3736 | 3322 |
| 3737 | 3517 |
| 3738 | 3492 |
| 3739 | 3678 |
| 3740 | 3567 |
| 3741 | 3701 |
| 3742 | 3727 |
| 3743 | 3834 |
| 3744 | 3007 |
| 3745 | 3259 |
| 3746 | 3309 |
| 3747 | 3471 |
| 3748 | 3334 |
| 3749 | 3509 |
| 3750 | 3534 |
| 3751 | 3691 |
| 3752 | 3385 |
| 3753 | 3559 |
| 3754 | 3581 |
| 3755 | 3706 |
| 3756 | 3611 |
| 3757 | 3735 |
| 3758 | 3746 |
| 3759 | 3858 |
| 3760 | 3431 |
| 3761 | 3589 |
| 3762 | 3624 |
| 3763 | 3743 |
| 3764 | 3646 |
| 3765 | 3767 |
| 3766 | 3775 |
| 3767 | 3872 |
| 3768 | 3670 |
| 3769 | 3786 |
| 3770 | 3806 |
| 3771 | 3889 |
| 3772 | 3821 |
| 3773 | 3910 |
| 3774 | 3924 |
| 3775 | 3997 |
| 3776 | 3119 |
| 3777 | 3279 |
| 3778 | 3362 |
| 3779 | 3552 |
| 3780 | 3396 |
| 3781 | 3573 |
| 3782 | 3603 |
| 3783 | 3731 |
| 3784 | 3455 |
| 3785 | 3631 |
| 3786 | 3600 |
| 3787 | 3754 |
| 3788 | 3657 |
| 3789 | 3772 |
| 3790 | 3794 |
| 3791 | 3879 |
| 3792 | 3501 |
| 3793 | 3619 |
| 3794 | 3666 |
| 3795 | 3779 |
| 3796 | 3695 |
| 3797 | 3801 |
| 3798 | 3814 |
| 3799 | 3902 |
| 3800 | 3718 |
| 3801 | 3825 |
| 3802 | 3841 |
| 3803 | 3916 |
| 3804 | 3855 |
| 3805 | 3934 |
| 3806 | 3949 |
| 3807 | 4009 |
| 3808 | 3543 |
| 3809 | 3682 |
| 3810 | 3715 |

TABLE Z10-continued

| with a sequence length of 4096: | |
|---|---|
| Polarized channel sequence number | Reliability or reliability sequence number |
| 3811 | 3809 |
| 3812 | 3739 |
| 3813 | 3830 |
| 3814 | 3846 |
| 3815 | 3931 |
| 3816 | 3758 |
| 3817 | 3850 |
| 3818 | 3867 |
| 3819 | 3945 |
| 3820 | 3884 |
| 3821 | 3955 |
| 3822 | 3967 |
| 3823 | 4019 |
| 3824 | 3789 |
| 3825 | 3875 |
| 3826 | 3898 |
| 3827 | 3960 |
| 3828 | 3905 |
| 3829 | 3972 |
| 3830 | 3977 |
| 3831 | 4026 |
| 3832 | 3920 |
| 3833 | 3983 |
| 3834 | 3989 |
| 3835 | 4035 |
| 3836 | 4003 |
| 3837 | 4045 |
| 3838 | 4057 |
| 3839 | 4071 |
| 3840 | 2250 |
| 3841 | 2662 |
| 3842 | 2832 |
| 3843 | 3184 |
| 3844 | 2936 |
| 3845 | 3215 |
| 3846 | 3287 |
| 3847 | 3463 |
| 3848 | 3015 |
| 3849 | 3264 |
| 3850 | 3326 |
| 3851 | 3484 |
| 3852 | 3359 |
| 3853 | 3531 |
| 3854 | 3548 |
| 3855 | 3713 |
| 3856 | 3065 |
| 3857 | 3305 |
| 3858 | 3341 |
| 3859 | 3522 |
| 3860 | 3414 |
| 3861 | 3571 |
| 3862 | 3615 |
| 3863 | 3724 |
| 3864 | 3442 |
| 3865 | 3610 |
| 3866 | 3585 |
| 3867 | 3748 |
| 3868 | 3650 |
| 3869 | 3771 |
| 3870 | 3791 |
| 3871 | 3891 |
| 3872 | 3111 |
| 3873 | 3374 |
| 3874 | 3428 |
| 3875 | 3575 |
| 3876 | 3452 |
| 3877 | 3596 |
| 3878 | 3623 |
| 3879 | 3759 |
| 3880 | 3495 |
| 3881 | 3643 |
| 3882 | 3665 |
| 3883 | 3777 |
| 3884 | 3689 |
| 3885 | 3800 |

TABLE Z10-continued

| with a sequence length of 4096: | |
|---|---|
| Polarized channel sequence number | Reliability or reliability sequence number |
| 3886 | 3816 |
| 3887 | 3911 |
| 3888 | 3540 |
| 3889 | 3671 |
| 3890 | 3698 |
| 3891 | 3810 |
| 3892 | 3716 |
| 3893 | 3831 |
| 3894 | 3839 |
| 3895 | 3918 |
| 3896 | 3745 |
| 3897 | 3847 |
| 3898 | 3865 |
| 3899 | 3936 |
| 3900 | 3880 |
| 3901 | 3953 |
| 3902 | 3963 |
| 3903 | 4021 |
| 3904 | 3240 |
| 3905 | 3399 |
| 3906 | 3475 |
| 3907 | 3639 |
| 3908 | 3513 |
| 3909 | 3655 |
| 3910 | 3681 |
| 3911 | 3796 |
| 3912 | 3553 |
| 3913 | 3709 |
| 3914 | 3677 |
| 3915 | 3820 |
| 3916 | 3728 |
| 3917 | 3833 |
| 3918 | 3857 |
| 3919 | 3928 |
| 3920 | 3592 |
| 3921 | 3693 |
| 3922 | 3741 |
| 3923 | 3845 |
| 3924 | 3766 |
| 3925 | 3863 |
| 3926 | 3874 |
| 3927 | 3943 |
| 3928 | 3788 |
| 3929 | 3885 |
| 3930 | 3895 |
| 3931 | 3956 |
| 3932 | 3909 |
| 3933 | 3973 |
| 3934 | 3981 |
| 3935 | 4032 |
| 3936 | 3627 |
| 3937 | 3756 |
| 3938 | 3780 |
| 3939 | 3870 |
| 3940 | 3808 |
| 3941 | 3890 |
| 3942 | 3900 |
| 3943 | 3969 |
| 3944 | 3824 |
| 3945 | 3904 |
| 3946 | 3913 |
| 3947 | 3976 |
| 3948 | 3932 |
| 3949 | 3986 |
| 3950 | 3996 |
| 3951 | 4037 |
| 3952 | 3852 |
| 3953 | 3922 |
| 3954 | 3938 |
| 3955 | 3991 |
| 3956 | 3946 |
| 3957 | 4000 |
| 3958 | 4005 |
| 3959 | 4042 |
| 3960 | 3959 |

TABLE Z10-continued

| with a sequence length of 4096: | |
|---|---|
| Polarized channel sequence number | Reliability or reliability sequence number |
| 3961 | 4008 |
| 3962 | 4014 |
| 3963 | 4050 |
| 3964 | 4024 |
| 3965 | 4058 |
| 3966 | 4066 |
| 3967 | 4077 |
| 3968 | 3155 |
| 3969 | 3388 |
| 3970 | 3505 |
| 3971 | 3684 |
| 3972 | 3562 |
| 3973 | 3705 |
| 3974 | 3753 |
| 3975 | 3849 |
| 3976 | 3604 |
| 3977 | 3733 |
| 3978 | 3773 |
| 3979 | 3861 |
| 3980 | 3795 |
| 3981 | 3882 |
| 3982 | 3893 |
| 3983 | 3979 |
| 3984 | 3634 |
| 3985 | 3764 |
| 3986 | 3785 |
| 3987 | 3878 |
| 3988 | 3823 |
| 3989 | 3903 |
| 3990 | 3930 |
| 3991 | 3982 |
| 3992 | 3836 |
| 3993 | 3925 |
| 3994 | 3915 |
| 3995 | 3992 |
| 3996 | 3948 |
| 3997 | 4001 |
| 3998 | 4011 |
| 3999 | 4048 |
| 4000 | 3661 |
| 4001 | 3804 |
| 4002 | 3829 |
| 4003 | 3908 |
| 4004 | 3842 |
| 4005 | 3923 |
| 4006 | 3933 |
| 4007 | 3998 |
| 4008 | 3868 |
| 4009 | 3944 |
| 4010 | 3954 |
| 4011 | 4002 |
| 4012 | 3965 |
| 4013 | 4013 |
| 4014 | 4020 |
| 4015 | 4055 |
| 4016 | 3886 |
| 4017 | 3957 |
| 4018 | 3971 |
| 4019 | 4018 |
| 4020 | 3980 |
| 4021 | 4025 |
| 4022 | 4028 |
| 4023 | 4060 |
| 4024 | 3988 |
| 4025 | 4033 |
| 4026 | 4039 |
| 4027 | 4065 |
| 4028 | 4043 |
| 4029 | 4070 |
| 4030 | 4074 |
| 4031 | 4087 |
| 4032 | 3720 |
| 4033 | 3813 |
| 4034 | 3856 |
| 4035 | 3941 |

TABLE Z10-continued

| with a sequence length of 4096: | |
|---|---|
| Polarized channel sequence number | Reliability or reliability sequence number |
| 4036 | 3873 |
| 4037 | 3952 |
| 4038 | 3962 |
| 4039 | 4012 |
| 4040 | 3899 |
| 4041 | 3974 |
| 4042 | 3961 |
| 4043 | 4022 |
| 4044 | 3985 |
| 4045 | 4027 |
| 4046 | 4036 |
| 4047 | 4062 |
| 4048 | 3919 |
| 4049 | 3970 |
| 4050 | 3987 |
| 4051 | 4030 |
| 4052 | 3999 |
| 4053 | 4038 |
| 4054 | 4041 |
| 4055 | 4068 |
| 4056 | 4007 |
| 4057 | 4046 |
| 4058 | 4051 |
| 4059 | 4072 |
| 4060 | 4054 |
| 4061 | 4076 |
| 4062 | 4079 |
| 4063 | 4089 |
| 4064 | 3937 |
| 4065 | 3993 |
| 4066 | 4006 |
| 4067 | 4040 |
| 4068 | 4015 |
| 4069 | 4047 |
| 4070 | 4052 |
| 4071 | 4075 |
| 4072 | 4023 |
| 4073 | 4053 |
| 4074 | 4059 |
| 4075 | 4078 |
| 4076 | 4063 |
| 4077 | 4080 |
| 4078 | 4082 |
| 4079 | 4090 |
| 4080 | 4034 |
| 4081 | 4061 |
| 4082 | 4067 |
| 4083 | 4081 |
| 4084 | 4069 |
| 4085 | 4083 |
| 4086 | 4084 |
| 4087 | 4091 |
| 4088 | 4073 |
| 4089 | 4085 |
| 4090 | 4086 |
| 4091 | 4092 |
| 4092 | 4088 |
| 4093 | 4093 |
| 4094 | 4094 |
| 4095 | 4095 |

Sequence Z11, with a sequence length of 2048:
[0, 1, 2, 11, 3, 12, 15, 28, 4, 14, 17, 30, 19, 36, 38, 75, 5, 16, 18, 35, 23, 43, 50, 80, 25, 49, 45, 87, 58, 95, 104, 166, 6, 20, 24, 44, 27, 47, 53, 91, 31, 57, 62, 97, 69, 108, 116, 184, 37, 63, 72, 11 3, 76, 124, 130, 190, 85, 135, 146, 208, 157, 230, 246, 355, 13, 22, 29, 56, 34, 59, 67, 107, 40, 74, 6 5, 119, 81, 125, 141, 199, 46, 71, 84, 132, 94, 145, 154, 219, 103, 160, 169, 235, 181, 260, 273, 38 7, 54, 89, 101, 150, 112, 165, 174, 253, 121, 178, 186, 265, 204, 282, 300, 405, 137, 195, 213, 291, 223, 311, 319, 427, 239, 330, 343, 453, 366, 487, 536, 625, 7, 21, 32, 68, 42, 73, 88, 136, 48, 82, 9 6, 143, 106, 159, 168, 268, 55, 93, 102, 155, 120, 177, 203, 277, 127, 198, 187, 294, 224, 312, 333, 449, 60, 110, 123, 179, 131, 196, 207, 304, 147, 220, 231, 316, 250, 340, 351, 482, 163, 236, 258, 348, 272, 372, 380, 501, 287, 391, 413, 528, 432, 567, 596, 769, 79, 115, 139, 215, 152, 228, 244, 336, 173, 262, 242, 359, 279, 376, 399, 513, 191, 254, 286, 383, 307, 409, 423, 552, 327, 437, 45 7, 578, 475, 614, 645, 816, 212, 298, 323, 416, 344, 442, 465, 607, 362, 471, 494, 637, 521, 657, 6 86, 847, 395, 509, 543, 671, 560, 700, 714, 881, 587, 732, 750, 918, 794, 973, 1039, 1149, 8, 26, 4 1, 92, 52, 98, 117, 175, 61, 111, 129, 185, 138, 206, 214, 321, 70, 122, 133, 202, 158, 226, 251, 33 2, 167, 249, 234, 354, 274, 373, 396, 533, 77, 144, 161, 229, 171, 240, 255, 364, 189, 270, 285, 38 1, 303, 406, 425, 570, 210, 290, 309, 419, 324, 444, 455, 581, 350, 466, 491, 616, 516, 651, 680, 8 56, 105, 153, 180, 267, 197, 278, 296, 402, 218, 317, 292, 429, 335, 446, 479, 601, 238, 306, 346, 462, 370, 489, 506, 631, 392, 522, 540, 662, 566, 703, 724, 903, 259, 360, 385, 499, 415, 531, 54 9, 690, 436, 557, 573, 711, 610, 740, 766, 931, 473, 590, 622, 754, 639, 782, 797, 959, 668, 811, 8 33, 999, 872, 1047, 1102, 1216, 86, 148, 193, 299, 221, 315, 356, 469, 245, 339, 377, 485, 401, 5 18, 539, 718, 264, 367, 389, 510, 433, 554, 604, 729, 450, 598, 575, 758, 642, 786, 819, 993, 281, 411, 440, 563, 459, 593, 613, 774, 497, 634, 654, 789, 683, 828, 852, 1031, 525, 665, 697, 842, 7 21, 876, 892, 1061, 746, 908, 942, 1094, 965, 1138, 1181, 1375, 328, 422, 478, 628, 503, 648, 67 7, 825, 546, 707, 674, 861, 735, 886, 923, 1077, 584, 694, 743, 897, 777, 936, 954, 1121, 806, 97 9, 1005, 1158, 1025, 1201, 1240, 1423, 619, 763, 802, 948, 838, 985, 1013, 1192, 867, 1019, 10 55, 1227, 1085, 1254, 1282, 1452, 912, 1069, 1110, 1269, 1130, 1300, 1316, 1482, 1169, 1335, 1355, 1521, 1398, 1567, 1626, 1716, 9, 33, 51, 126, 66, 134, 156, 232, 78, 149, 170, 243, 183, 26 6, 275, 404, 90, 164, 176, 261, 205, 293, 322, 418, 216, 318, 301, 438, 349, 461, 483, 632, 100, 18 8, 211, 297, 227, 310, 329, 447, 247, 345, 365, 467, 382, 495, 514, 670, 271, 369, 394, 507, 408, 5 35, 547, 685, 431, 559, 585, 722, 609, 764, 796, 977, 142, 201, 237, 341, 257, 352, 375, 493, 280, 400, 371, 520, 420, 538, 574, 705, 305, 390, 428, 553, 458, 583, 603, 742, 481, 620, 641, 772, 66 7, 821, 844, 1024, 334, 445, 474, 594, 505, 629, 650, 808, 527, 659, 676, 830, 713, 860, 890, 104 9, 564, 693, 730, 874, 751, 907, 921, 1079, 781, 938, 958, 1113, 995, 1154, 1211, 1311, 109, 194, 252, 378, 288, 397, 441, 561, 313, 424, 463, 577, 490, 617, 638, 835, 338, 454, 477, 606, 524, 656, 710, 849, 542, 702, 679, 879, 753, 910, 944, 1106, 357, 498, 532, 660, 550, 696, 719, 895, 588, 745, 767, 916, 801, 956, 971, 1147, 626, 776, 814, 967, 840, 1003, 1015, 1172, 868, 1029, 1059, 1204, 1083, 1247, 1277, 1458, 414, 511, 571, 737, 597, 759, 791, 950, 647, 823, 787, 983, 854, 1 009, 1041, 1185, 688, 809, 865, 1021, 901, 1053, 1073, 1230, 933, 1092, 1117, 1259, 1141, 129 8, 1332, 1499, 727, 885, 927, 1065, 961, 1098, 1125, 1290, 989, 1134, 1163, 1324, 1194, 1346, 1 378, 1528, 1035, 1178, 1220, 1360, 1237, 1389, 1404, 1555, 1267, 1420, 1439, 1587, 1478, 16 30, 1679, 1758, 118, 222, 284, 451, 326, 470, 517, 653, 361, 502, 545, 673, 568, 716, 734, 925, 3 86, 529, 556, 708, 612, 756, 804, 940, 635, 799, 771, 975, 845, 1007, 1037, 1208, 410, 580, 623, 761, 644, 784, 813, 991, 682, 837, 863, 1017, 894, 1051, 1075, 1249, 726, 870, 905, 1067, 929, 1 100, 1115, 1262, 969, 1128, 1160, 1303, 1188, 1341, 1369, 1536, 486, 600, 664, 831, 699, 851, 8 83, 1045, 738, 920, 877, 1081, 946, 1104, 1145, 1285, 779, 899, 963, 1123, 1001, 1156, 1176, 13 19, 1033, 1197, 1218, 1349, 1244, 1392, 1414, 1575, 818, 987, 1023, 1167, 1063, 1206, 1225, 1 381, 1090, 1235, 1252, 1401, 1292, 1429, 1455, 1595, 1136, 1272, 1308, 1442, 1327, 1468, 14 85, 1617, 1358, 1496, 1513, 1649, 1547, 1684, 1728, 1799, 434, 591, 691, 888, 748, 914, 981, 1 132, 792, 952, 1011, 1152, 1043, 1213, 1408, 826, 997, 1027, 1183, 1088, 1232, 1287, 14 17, 1108, 1280, 1257, 1445, 1330, 1472, 1503, 1644, 858, 1057, 1096, 1242, 1119, 1274, 1295, 1461, 1165, 1322, 1344, 1475, 1372, 1510, 1532, 1673, 1199, 1352, 1386, 1524, 1411, 1551, 1 563, 1694, 1436, 1579, 1604, 1722, 1621, 1752, 1778, 1885, 935, 1071, 1143, 1314, 1174, 133 8, 1366, 1506, 1223, 1395, 1363, 1539, 1426, 1559, 1591, 1705, 1264, 1384, 1432, 1571, 1465, 1600, 1612, 1739, 1492, 1635, 1654, 1764, 1668, 1792, 1814, 1907, 1306, 1448, 1489, 1608, 1 517, 1640, 1659, 1784, 1543, 1664, 1689, 1806, 1710, 1822, 1838, 1920, 1583, 1700, 1733, 18 30, 1745, 1847, 1856, 1933, 1771, 1865, 1875, 1948, 1896, 1964, 1984, 2008, 10, 39, 64, 172, 8 3, 182, 209, 302, 99, 200, 225, 314, 241, 347, 358, 512, 114, 217, 233, 342, 269, 379, 412, 530, 28 3, 407, 388, 551, 448, 579, 605, 768, 128, 248, 276, 384, 295, 398, 426, 565, 320, 443, 464, 586, 4 88, 618, 640, 807, 353, 468, 500, 633, 515, 663, 678, 822, 544, 692, 720, 859, 747, 902, 932, 111 6, 192, 263, 308, 439, 337, 452, 480, 615, 363, 508, 472, 649, 534, 666, 706, 841, 393, 496, 541, 6 84, 576, 717, 739, 880, 602, 755, 775, 911, 803, 957, 980, 1164, 430, 558, 595, 731, 630, 765, 78 5, 945, 655, 795, 812, 966, 850, 996, 1028, 1189, 698, 832, 869, 1010, 889, 1046, 1060, 1219, 91 9, 1078, 1097, 1253, 1133, 1296, 1353, 1446, 140, 256, 325, 484, 374, 504, 555, 695, 403, 537, 5 82, 712, 611, 752, 773, 972, 435, 572, 599, 741, 652, 793, 848, 986, 672, 839, 815, 1016, 891, 10 48, 1082, 1248, 456, 624, 661, 798, 681, 834, 857, 1034, 723, 882, 904, 1054, 939, 1093, 1111, 1 289, 760, 913, 953, 1105, 978, 1142, 1153, 1312, 1004, 1170, 1200, 1343, 1226, 1387, 1416, 15 74, 526, 636, 704, 873, 733, 898, 928, 1087, 783, 962, 924, 1122, 990, 1148, 1180, 1326, 824, 94 7, 1002, 1159, 1040, 1195, 1214, 1370, 1072, 1233, 1258, 1399, 1281, 1435, 1466, 1611, 866, 1 022, 1066, 1205, 1099, 1239, 1268, 1428, 1127, 1276, 1304, 1457, 1336, 1477, 1504, 1634, 11 75, 1321, 1361, 1490, 1379, 1516, 1529, 1658, 1407, 1544, 1558, 1683, 1594, 1719, 1760, 182 1, 151, 289, 368, 569, 421, 589, 643, 788, 460, 627, 675, 810, 701, 855, 871, 1062, 492, 658, 687, 846, 749, 893, 941, 1080, 770, 937, 909, 1114, 982, 1144, 1177, 1350, 519, 715, 757, 900, 780, 9 22, 949, 1129, 820, 974, 1000, 1155, 1032, 1191, 1217, 1390, 862, 1008, 1042, 1209, 1068, 124 1, 1256, 1402, 1109, 1270, 1301, 1437, 1329, 1471, 1498, 1641, 608, 736, 800, 970, 836, 988, 1 018, 1186, 878, 1056, 1012, 1222, 1086, 1245, 1286, 1422, 917, 1038, 1103, 1265, 1139, 1297, 1318, 1451, 1171, 1337, 1357, 1481, 1385, 1519, 1537, 1674, 955, 1124, 1161, 1310, 1203, 13 47, 1367, 1507, 1231, 1376, 1393, 1526, 1431, 1550, 1572, 1692, 1278, 1410, 1443, 1562, 146 0, 1585, 1597, 1711, 1487, 1607, 1624, 1735, 1652, 1765, 1796, 1854, 548, 725, 827, 1026, 884, 1052, 1118, 1273, 930, 1091, 1150, 1293, 1184, 1333, 1356, 1531, 964, 1135, 1166, 1323, 122 8, 1373, 1425, 1541, 1250, 1419, 1396, 1565, 1463, 1588, 1614, 1731, 994, 1198, 1236, 1382, 1 261, 1413, 1434, 1578, 1307, 1454, 1474, 1590, 1501, 1620, 1638, 1755, 1340, 1484, 1514, 16 31, 1534, 1655, 1666, 1773, 1556, 1677, 1699, 1791, 1714, 1816, 1837, 1922, 1074, 1212, 128 4, 1449, 1315, 1469, 1495, 1618, 1364, 1522, 1493, 1645, 1546, 1662, 1687, 1782, 1405, 1511, 1553, 1670, 1581, 1696, 1707, 1807, 1603, 1723, 1738, 1826, 1751, 1848, 1866, 1939, 1440, 1 569, 1601, 1703, 1628, 1726, 1743, 1843, 1648, 1747, 1769, 1860, 1787, 1872, 1884, 1949, 16 80, 1777, 1801, 1879, 1811, 1892, 1899, 1958, 1832, 1906, 1914, 1970, 1930, 1982, 1997, 201 6, 162, 331, 417, 669, 476, 689, 744, 906, 523, 728, 778, 926, 805, 68, 984, 1187, 562, 762, 790, 960, 853, 1014, 1064, 1207, 875, 1058, 1030, 1234, 1107, 1263, 1291, 1453, 592, 817, 864, 102 0, 896, 1044, 1076, 1246, 934, 1101, 1131, 1271, 1157, 1305, 1328, 1488, 976, 1137, 1173, 132 0, 1193, 1351, 1365, 1502, 1224, 1377, 1406, 1535, 1430, 1570, 1596, 1721, 709, 843, 915, 109 5, 951, 1112, 1146, 1302, 992, 1182, 1140, 1334, 1210, 1354, 1394, 1520, 1036, 1168, 1221, 13 71, 1260, 1403, 1424, 1552, 1288, 1441, 1462, 1577, 1486, 1615, 1632, 1750, 1084, 1243, 127 9, 1415, 1317, 1450, 1470, 1605, 1342, 1479, 1494, 1622, 1527, 1643, 1665, 1766, 1383, 1509, 1542, 1653, 1560, 1676, 1686, 1783, 1584, 1697, 1709, 1802, 1732, 1824, 1852, 1897, 621, 82 9, 943, 1151, 1006, 1179, 1238, 1380, 1050, 1215, 1266, 1397, 1299, 1438, 1459, 1625, 1089, 1 255, 1283, 1427, 1339, 1476, 1525, 1636, 1359, 1518, 1497, 1657, 1561, 1678, 1701, 1798, 11 20, 1309, 1348, 1480, 1368, 1512, 1533, 1669, 1409, 1554, 1573, 1682, 1599, 1708, 1718, 182 0, 1447, 1580, 1610, 1715, 1629, 1737, 1744, 1833, 1650, 1754, 1772, 1849, 1786, 1869, 1882, 1951, 1202, 1325, 1391, 1548, 1418, 1566, 1592, 1704, 1467, 1616, 1589, 1725, 1639, 1741, 1 761, 1840, 1505, 1606, 1647, 1748, 1672, 1768, 1780, 1861, 1693, 1790, 1804, 1874, 1817, 18 91, 1905, 1963, 1540, 1661, 1690, 1775, 1712, 1794, 1809, 1888, 1729, 1813, 1828, 1902, 184 4, 1911, 1923, 1972, 1757, 1836, 1857, 1916, 1864, 1927, 1932, 1979, 1878, 1938, 1944, 1988, 1957, 1998, 2009, 2023, 646, 887, 998, 1251, 1070, 1275, 1331, 1473, 1126, 1313, 1362, 1491, 1388, 1530, 1545, 1688, 1162, 1345, 1374, 1523, 1433, 1564, 1602, 1698, 1456, 1598, 1576, 1 720, 1633, 1740, 1759, 1851, 1196, 1400, 1444, 1568, 1464, 1586, 1609, 1730, 1500, 1627, 16 46, 1746, 1667, 1767, 1781, 1870, 1538, 1651, 1675, 1776, 1691, 1795, 1803, 1876, 1717, 181 0, 1827, 1893, 1841, 1909, 1919, 1974, 1294, 1421, 1483, 1623, 1515, 1637, 1660, 1763, 1549, 1685, 1656, 1785, 1702, 1797, 1819, 1886, 1582, 1671, 1713, 1808, 1736, 1825, 1835, 1900, 1 756, 1845, 1855, 1912, 1868, 1928, 1936, 1985, 1613, 1727, 1749, 1831, 1774, 1850, 1859, 19 24, 1789, 1863, 1871, 1931, 1889, 1941, 1950, 1990, 1815, 1880, 1895, 1945, 1903, 1954, 195 9, 1995, 1915, 1962, 1968, 2002, 1977, 2010, 2018, 2029, 1229, 1412, 1508, 1663, 1557, 1681, 1724, 1812, 1593, 1706, 1742, 1823, 1762, 1842, 1853, 1934, 1619, 1734, 1753, 1839, 1788, 1 862, 1887, 1937, 1800, 1883, 1873, 1946, 1904, 1955, 1965, 2001, 1642, 1770, 1793, 1867, 18 05, 1881, 1890, 1952, 1829, 1901, 1910, 1956, 1921, 1967, 1973, 2007, 1846, 1913, 1926, 197 1, 1935, 1978, 1981, 2012, 1943, 1986, 1992, 2017, 1996, 2022, 2026, 2039, 1695, 1779, 1818, 1898, 1834, 1908, 1918, 1966, 1858, 1929, 1917, 1975, 1940, 1980, 1989, 2014, 1877, 1925, 1 942, 1983, 1953, 1991, 1994, 2020, 1961, 1999, 2003, 2024, 2006, 2028, 2031, 2041, 1894, 19 47, 1960, 1993, 1969, 2000, 2004, 2027, 1976, 2005, 2011, 2030, 2015, 2032, 2034, 2042, 198 7, 2013, 2019, 2033, 2021, 2035, 2036, 2043, 2025, 2037, 2038, 2044, 2040, 2045, 2046, 2047];

TABLE Z11 with a sequence length of 2048:

| Polarized channel sequence number | Reliability or reliability sequence number |
|---|---|
| 0 | 0 |
| 1 | 1 |
| 2 | 2 |
| 3 | 11 |
| 4 | 3 |
| 5 | 12 |
| 6 | 15 |
| 7 | 28 |
| 8 | 4 |
| 9 | 14 |
| 10 | 17 |
| 11 | 30 |
| 12 | 19 |
| 13 | 36 |
| 14 | 38 |
| 15 | 75 |
| 16 | 5 |
| 17 | 16 |
| 18 | 18 |
| 19 | 35 |
| 20 | 23 |
| 21 | 43 |
| 22 | 50 |
| 23 | 80 |
| 24 | 25 |
| 25 | 49 |
| 26 | 45 |
| 27 | 87 |
| 28 | 58 |
| 29 | 95 |
| 30 | 104 |
| 31 | 166 |
| 32 | 6 |
| 33 | 20 |
| 34 | 24 |
| 35 | 44 |
| 36 | 27 |
| 37 | 47 |
| 38 | 53 |
| 39 | 91 |
| 40 | 31 |
| 41 | 57 |
| 42 | 62 |
| 43 | 97 |
| 44 | 69 |
| 45 | 108 |
| 46 | 116 |
| 47 | 184 |
| 48 | 37 |
| 49 | 63 |
| 50 | 72 |
| 51 | 113 |
| 52 | 76 |
| 53 | 124 |
| 54 | 130 |
| 55 | 190 |
| 56 | 85 |
| 57 | 135 |
| 58 | 146 |
| 59 | 208 |
| 60 | 157 |
| 61 | 230 |
| 62 | 246 |
| 63 | 355 |
| 64 | 13 |
| 65 | 22 |
| 66 | 29 |
| 67 | 56 |
| 68 | 34 |
| 69 | 59 |
| 70 | 67 |
| 71 | 107 |
| 72 | 40 |
| 73 | 74 |
| 74 | 65 |

TABLE Z11-continued with a sequence length of 2048:

| Polarized channel sequence number | Reliability or reliability sequence number |
|---|---|
| 75 | 119 |
| 76 | 81 |
| 77 | 125 |
| 78 | 141 |
| 79 | 199 |
| 80 | 46 |
| 81 | 71 |
| 82 | 84 |
| 83 | 132 |
| 84 | 94 |
| 85 | 145 |
| 86 | 154 |
| 87 | 219 |
| 88 | 103 |
| 89 | 160 |
| 90 | 169 |
| 91 | 235 |
| 92 | 181 |
| 93 | 260 |
| 94 | 273 |
| 95 | 387 |
| 96 | 54 |
| 97 | 89 |
| 98 | 101 |
| 99 | 150 |
| 100 | 112 |
| 101 | 165 |
| 102 | 174 |
| 103 | 253 |
| 104 | 121 |
| 105 | 178 |
| 106 | 186 |
| 107 | 265 |
| 108 | 204 |
| 109 | 282 |
| 110 | 300 |
| 111 | 405 |
| 112 | 137 |
| 113 | 195 |
| 114 | 213 |
| 115 | 291 |
| 116 | 223 |
| 117 | 311 |
| 118 | 319 |
| 119 | 427 |
| 120 | 239 |
| 121 | 330 |
| 122 | 343 |
| 123 | 453 |
| 124 | 366 |
| 125 | 487 |
| 126 | 536 |
| 127 | 625 |
| 128 | 7 |
| 129 | 21 |
| 130 | 32 |
| 131 | 68 |
| 132 | 42 |
| 133 | 73 |
| 134 | 88 |
| 135 | 136 |
| 136 | 48 |
| 137 | 82 |
| 138 | 96 |
| 139 | 143 |
| 140 | 106 |
| 141 | 159 |
| 142 | 168 |
| 143 | 268 |
| 144 | 55 |
| 145 | 93 |
| 146 | 102 |
| 147 | 155 |
| 148 | 120 |
| 149 | 177 |

TABLE Z11-continued with a sequence length of 2048:

| Polarized channel sequence number | Reliability or reliability sequence number |
|---|---|
| 150 | 203 |
| 151 | 277 |
| 152 | 127 |
| 153 | 198 |
| 154 | 187 |
| 155 | 294 |
| 156 | 224 |
| 157 | 312 |
| 158 | 333 |
| 159 | 449 |
| 160 | 60 |
| 161 | 110 |
| 162 | 123 |
| 163 | 179 |
| 164 | 131 |
| 165 | 196 |
| 166 | 207 |
| 167 | 304 |
| 168 | 147 |
| 169 | 220 |
| 170 | 231 |
| 171 | 316 |
| 172 | 250 |
| 173 | 340 |
| 174 | 351 |
| 175 | 482 |
| 176 | 163 |
| 177 | 236 |
| 178 | 258 |
| 179 | 348 |
| 180 | 272 |
| 181 | 372 |
| 182 | 380 |
| 183 | 501 |
| 184 | 287 |
| 185 | 391 |
| 186 | 413 |
| 187 | 528 |
| 188 | 432 |
| 189 | 567 |
| 190 | 596 |
| 191 | 769 |
| 192 | 79 |
| 193 | 115 |
| 194 | 139 |
| 195 | 215 |
| 196 | 152 |
| 197 | 228 |
| 198 | 244 |
| 199 | 336 |
| 200 | 173 |
| 201 | 262 |
| 202 | 242 |
| 203 | 359 |
| 204 | 279 |
| 205 | 376 |
| 206 | 399 |
| 207 | 513 |
| 208 | 191 |
| 209 | 254 |
| 210 | 286 |
| 211 | 383 |
| 212 | 307 |
| 213 | 409 |
| 214 | 423 |
| 215 | 552 |
| 216 | 327 |
| 217 | 437 |
| 218 | 457 |
| 219 | 578 |
| 220 | 475 |
| 221 | 614 |
| 222 | 645 |
| 223 | 816 |
| 224 | 212 |

TABLE Z11-continued

| with a sequence length of 2048: | |
|---|---|
| Polarized channel sequence number | Reliability or reliability sequence number |
| 225 | 298 |
| 226 | 323 |
| 227 | 416 |
| 228 | 344 |
| 229 | 442 |
| 230 | 465 |
| 231 | 607 |
| 232 | 362 |
| 233 | 471 |
| 234 | 494 |
| 235 | 637 |
| 236 | 521 |
| 237 | 657 |
| 238 | 686 |
| 239 | 847 |
| 240 | 395 |
| 241 | 509 |
| 242 | 543 |
| 243 | 671 |
| 244 | 560 |
| 245 | 700 |
| 246 | 714 |
| 247 | 881 |
| 248 | 587 |
| 249 | 732 |
| 250 | 750 |
| 251 | 918 |
| 252 | 794 |
| 253 | 973 |
| 254 | 1039 |
| 255 | 1149 |
| 256 | 8 |
| 257 | 26 |
| 258 | 41 |
| 259 | 92 |
| 260 | 52 |
| 261 | 98 |
| 262 | 117 |
| 263 | 175 |
| 264 | 61 |
| 265 | 111 |
| 266 | 129 |
| 267 | 185 |
| 268 | 138 |
| 269 | 206 |
| 270 | 214 |
| 271 | 321 |
| 272 | 70 |
| 273 | 122 |
| 274 | 133 |
| 275 | 202 |
| 276 | 158 |
| 277 | 226 |
| 278 | 251 |
| 279 | 332 |
| 280 | 167 |
| 281 | 249 |
| 282 | 234 |
| 283 | 354 |
| 284 | 274 |
| 285 | 373 |
| 286 | 396 |
| 287 | 533 |
| 288 | 77 |
| 289 | 144 |
| 290 | 161 |
| 291 | 229 |
| 292 | 171 |
| 293 | 240 |
| 294 | 255 |
| 295 | 364 |
| 296 | 189 |
| 297 | 270 |
| 298 | 285 |
| 299 | 381 |

TABLE Z11-continued

| with a sequence length of 2048: | |
|---|---|
| Polarized channel sequence number | Reliability or reliability sequence number |
| 300 | 303 |
| 301 | 406 |
| 302 | 425 |
| 303 | 570 |
| 304 | 210 |
| 305 | 290 |
| 306 | 309 |
| 307 | 419 |
| 308 | 324 |
| 309 | 444 |
| 310 | 455 |
| 311 | 581 |
| 312 | 350 |
| 313 | 466 |
| 314 | 491 |
| 315 | 616 |
| 316 | 516 |
| 317 | 651 |
| 318 | 680 |
| 319 | 856 |
| 320 | 105 |
| 321 | 153 |
| 322 | 180 |
| 323 | 267 |
| 324 | 197 |
| 325 | 278 |
| 326 | 296 |
| 327 | 402 |
| 328 | 218 |
| 329 | 317 |
| 330 | 292 |
| 331 | 429 |
| 332 | 335 |
| 333 | 446 |
| 334 | 479 |
| 335 | 601 |
| 336 | 238 |
| 337 | 306 |
| 338 | 346 |
| 339 | 462 |
| 340 | 370 |
| 341 | 489 |
| 342 | 506 |
| 343 | 631 |
| 344 | 392 |
| 345 | 522 |
| 346 | 540 |
| 347 | 662 |
| 348 | 566 |
| 349 | 703 |
| 350 | 724 |
| 351 | 903 |
| 352 | 259 |
| 353 | 360 |
| 354 | 385 |
| 355 | 499 |
| 356 | 415 |
| 357 | 531 |
| 358 | 549 |
| 359 | 690 |
| 360 | 436 |
| 361 | 557 |
| 362 | 573 |
| 363 | 711 |
| 364 | 610 |
| 365 | 740 |
| 366 | 766 |
| 367 | 931 |
| 368 | 473 |
| 369 | 590 |
| 370 | 622 |
| 371 | 754 |
| 372 | 639 |
| 373 | 782 |
| 374 | 797 |

TABLE Z11-continued

| with a sequence length of 2048: | |
|---|---|
| Polarized channel sequence number | Reliability or reliability sequence number |
| 375 | 959 |
| 376 | 668 |
| 377 | 811 |
| 378 | 833 |
| 379 | 999 |
| 380 | 872 |
| 381 | 1047 |
| 382 | 1102 |
| 383 | 1216 |
| 384 | 86 |
| 385 | 148 |
| 386 | 193 |
| 387 | 299 |
| 388 | 221 |
| 389 | 315 |
| 390 | 356 |
| 391 | 469 |
| 392 | 245 |
| 393 | 339 |
| 394 | 377 |
| 395 | 485 |
| 396 | 401 |
| 397 | 518 |
| 398 | 539 |
| 399 | 718 |
| 400 | 264 |
| 401 | 367 |
| 402 | 389 |
| 403 | 510 |
| 404 | 433 |
| 405 | 554 |
| 406 | 604 |
| 407 | 729 |
| 408 | 450 |
| 409 | 598 |
| 410 | 575 |
| 411 | 758 |
| 412 | 642 |
| 413 | 786 |
| 414 | 819 |
| 415 | 993 |
| 416 | 281 |
| 417 | 411 |
| 418 | 440 |
| 419 | 563 |
| 420 | 459 |
| 421 | 593 |
| 422 | 613 |
| 423 | 774 |
| 424 | 497 |
| 425 | 634 |
| 426 | 654 |
| 427 | 789 |
| 428 | 683 |
| 429 | 828 |
| 430 | 852 |
| 431 | 1031 |
| 432 | 525 |
| 433 | 665 |
| 434 | 697 |
| 435 | 842 |
| 436 | 721 |
| 437 | 876 |
| 438 | 892 |
| 439 | 1061 |
| 440 | 746 |
| 441 | 908 |
| 442 | 942 |
| 443 | 1094 |
| 444 | 965 |
| 445 | 1138 |
| 446 | 1181 |
| 447 | 1375 |
| 448 | 328 |
| 449 | 422 |

TABLE Z11-continued

| with a sequence length of 2048: | |
|---|---|
| Polarized channel sequence number | Reliability or reliability sequence number |
| 450 | 478 |
| 451 | 628 |
| 452 | 503 |
| 453 | 648 |
| 454 | 677 |
| 455 | 825 |
| 456 | 546 |
| 457 | 707 |
| 458 | 674 |
| 459 | 861 |
| 460 | 735 |
| 461 | 886 |
| 462 | 923 |
| 463 | 1077 |
| 464 | 584 |
| 465 | 694 |
| 466 | 743 |
| 467 | 897 |
| 468 | 777 |
| 469 | 936 |
| 470 | 954 |
| 471 | 1121 |
| 472 | 806 |
| 473 | 979 |
| 474 | 1005 |
| 475 | 1158 |
| 476 | 1025 |
| 477 | 1201 |
| 478 | 1240 |
| 479 | 1423 |
| 480 | 619 |
| 481 | 763 |
| 482 | 802 |
| 483 | 948 |
| 484 | 838 |
| 485 | 985 |
| 486 | 1013 |
| 487 | 1192 |
| 488 | 867 |
| 489 | 1019 |
| 490 | 1055 |
| 491 | 1227 |
| 492 | 1085 |
| 493 | 1254 |
| 494 | 1282 |
| 495 | 1452 |
| 496 | 912 |
| 497 | 1069 |
| 498 | 1110 |
| 499 | 1269 |
| 500 | 1130 |
| 501 | 1300 |
| 502 | 1316 |
| 503 | 1482 |
| 504 | 1169 |
| 505 | 1335 |
| 506 | 1355 |
| 507 | 1521 |
| 508 | 1398 |
| 509 | 1567 |
| 510 | 1626 |
| 511 | 1716 |
| 512 | 9 |
| 513 | 33 |
| 514 | 51 |
| 515 | 126 |
| 516 | 66 |
| 517 | 134 |
| 518 | 156 |
| 519 | 232 |
| 520 | 78 |
| 521 | 149 |
| 522 | 170 |
| 523 | 243 |
| 524 | 183 |

TABLE Z11-continued with a sequence length of 2048:

| Polarized channel sequence number | Reliability or reliability sequence number |
|---|---|
| 525 | 266 |
| 526 | 275 |
| 527 | 404 |
| 528 | 90 |
| 529 | 164 |
| 530 | 176 |
| 531 | 261 |
| 532 | 205 |
| 533 | 293 |
| 534 | 322 |
| 535 | 418 |
| 536 | 216 |
| 537 | 318 |
| 538 | 301 |
| 539 | 438 |
| 540 | 349 |
| 541 | 461 |
| 542 | 483 |
| 543 | 632 |
| 544 | 100 |
| 545 | 188 |
| 546 | 211 |
| 547 | 297 |
| 548 | 227 |
| 549 | 310 |
| 550 | 329 |
| 551 | 447 |
| 552 | 247 |
| 553 | 345 |
| 554 | 365 |
| 555 | 467 |
| 556 | 382 |
| 557 | 495 |
| 558 | 514 |
| 559 | 670 |
| 560 | 271 |
| 561 | 369 |
| 562 | 394 |
| 563 | 507 |
| 564 | 408 |
| 565 | 535 |
| 566 | 547 |
| 567 | 685 |
| 568 | 431 |
| 569 | 559 |
| 570 | 585 |
| 571 | 722 |
| 572 | 609 |
| 573 | 764 |
| 574 | 796 |
| 575 | 977 |
| 576 | 142 |
| 577 | 201 |
| 578 | 237 |
| 579 | 341 |
| 580 | 257 |
| 581 | 352 |
| 582 | 375 |
| 583 | 493 |
| 584 | 280 |
| 585 | 400 |
| 586 | 371 |
| 587 | 520 |
| 588 | 420 |
| 589 | 538 |
| 590 | 574 |
| 591 | 705 |
| 592 | 305 |
| 593 | 390 |
| 594 | 428 |
| 595 | 553 |
| 596 | 458 |
| 597 | 583 |
| 598 | 603 |
| 599 | 742 |

TABLE Z11-continued with a sequence length of 2048:

| Polarized channel sequence number | Reliability or reliability sequence number |
|---|---|
| 600 | 481 |
| 601 | 620 |
| 602 | 641 |
| 603 | 772 |
| 604 | 667 |
| 605 | 821 |
| 606 | 844 |
| 607 | 1024 |
| 608 | 334 |
| 609 | 445 |
| 610 | 474 |
| 611 | 594 |
| 612 | 505 |
| 613 | 629 |
| 614 | 650 |
| 615 | 808 |
| 616 | 527 |
| 617 | 659 |
| 618 | 676 |
| 619 | 830 |
| 620 | 713 |
| 621 | 860 |
| 622 | 890 |
| 623 | 1049 |
| 624 | 564 |
| 625 | 693 |
| 626 | 730 |
| 627 | 874 |
| 628 | 751 |
| 629 | 907 |
| 630 | 921 |
| 631 | 1079 |
| 632 | 781 |
| 633 | 938 |
| 634 | 958 |
| 635 | 1113 |
| 636 | 995 |
| 637 | 1154 |
| 638 | 1211 |
| 639 | 1311 |
| 640 | 109 |
| 641 | 194 |
| 642 | 252 |
| 643 | 378 |
| 644 | 288 |
| 645 | 397 |
| 646 | 441 |
| 647 | 561 |
| 648 | 313 |
| 649 | 424 |
| 650 | 463 |
| 651 | 577 |
| 652 | 490 |
| 653 | 617 |
| 654 | 638 |
| 655 | 835 |
| 656 | 338 |
| 657 | 454 |
| 658 | 477 |
| 659 | 606 |
| 660 | 524 |
| 661 | 656 |
| 662 | 710 |
| 663 | 849 |
| 664 | 542 |
| 665 | 702 |
| 666 | 679 |
| 667 | 879 |
| 668 | 753 |
| 669 | 910 |
| 670 | 944 |
| 671 | 1106 |
| 672 | 357 |
| 673 | 498 |
| 674 | 532 |

TABLE Z11-continued with a sequence length of 2048:

| Polarized channel sequence number | Reliability or reliability sequence number |
|---|---|
| 675 | 660 |
| 676 | 550 |
| 677 | 696 |
| 678 | 719 |
| 679 | 895 |
| 680 | 588 |
| 681 | 745 |
| 682 | 767 |
| 683 | 916 |
| 684 | 801 |
| 685 | 956 |
| 686 | 971 |
| 687 | 1147 |
| 688 | 626 |
| 689 | 776 |
| 690 | 814 |
| 691 | 967 |
| 692 | 840 |
| 693 | 1003 |
| 694 | 1015 |
| 695 | 1172 |
| 696 | 868 |
| 697 | 1029 |
| 698 | 1059 |
| 699 | 1204 |
| 700 | 1083 |
| 701 | 1247 |
| 702 | 1277 |
| 703 | 1458 |
| 704 | 414 |
| 705 | 511 |
| 706 | 571 |
| 707 | 737 |
| 708 | 597 |
| 709 | 759 |
| 710 | 791 |
| 711 | 950 |
| 712 | 647 |
| 713 | 823 |
| 714 | 787 |
| 715 | 983 |
| 716 | 854 |
| 717 | 1009 |
| 718 | 1041 |
| 719 | 1185 |
| 720 | 688 |
| 721 | 809 |
| 722 | 865 |
| 723 | 1021 |
| 724 | 901 |
| 725 | 1053 |
| 726 | 1073 |
| 727 | 1230 |
| 728 | 933 |
| 729 | 1092 |
| 730 | 1117 |
| 731 | 1259 |
| 732 | 1141 |
| 733 | 1298 |
| 734 | 1332 |
| 735 | 1499 |
| 736 | 727 |
| 737 | 885 |
| 738 | 927 |
| 739 | 1065 |
| 740 | 961 |
| 741 | 1098 |
| 742 | 1125 |
| 743 | 1290 |
| 744 | 989 |
| 745 | 1134 |
| 746 | 1163 |
| 747 | 1324 |
| 748 | 1194 |
| 749 | 1346 |

TABLE Z11-continued with a sequence length of 2048:

| Polarized channel sequence number | Reliability or reliability sequence number |
|---|---|
| 750 | 1378 |
| 751 | 1528 |
| 752 | 1035 |
| 753 | 1178 |
| 754 | 1220 |
| 755 | 1360 |
| 756 | 1237 |
| 757 | 1389 |
| 758 | 1404 |
| 759 | 1555 |
| 760 | 1267 |
| 761 | 1420 |
| 762 | 1439 |
| 763 | 1587 |
| 764 | 1478 |
| 765 | 1630 |
| 766 | 1679 |
| 767 | 1758 |
| 768 | 118 |
| 769 | 222 |
| 770 | 284 |
| 771 | 451 |
| 772 | 326 |
| 773 | 470 |
| 774 | 517 |
| 775 | 653 |
| 776 | 361 |
| 777 | 502 |
| 778 | 545 |
| 779 | 673 |
| 780 | 568 |
| 781 | 716 |
| 782 | 734 |
| 783 | 925 |
| 784 | 386 |
| 785 | 529 |
| 786 | 556 |
| 787 | 708 |
| 788 | 612 |
| 789 | 756 |
| 790 | 804 |
| 791 | 940 |
| 792 | 635 |
| 793 | 799 |
| 794 | 771 |
| 795 | 975 |
| 796 | 845 |
| 797 | 1007 |
| 798 | 1037 |
| 799 | 1208 |
| 800 | 410 |
| 801 | 580 |
| 802 | 623 |
| 803 | 761 |
| 804 | 644 |
| 805 | 784 |
| 806 | 813 |
| 807 | 991 |
| 808 | 682 |
| 809 | 837 |
| 810 | 863 |
| 811 | 1017 |
| 812 | 894 |
| 813 | 1051 |
| 814 | 1075 |
| 815 | 1249 |
| 816 | 726 |
| 817 | 870 |
| 818 | 905 |
| 819 | 1067 |
| 820 | 929 |
| 821 | 1100 |
| 822 | 1115 |
| 823 | 1262 |
| 824 | 969 |

TABLE Z11-continued

| with a sequence length of 2048: | |
|---|---|
| Polarized channel sequence number | Reliability or reliability sequence number |
| 825 | 1128 |
| 826 | 1160 |
| 827 | 1303 |
| 828 | 1188 |
| 829 | 1341 |
| 830 | 1369 |
| 831 | 1536 |
| 832 | 486 |
| 833 | 600 |
| 834 | 664 |
| 835 | 831 |
| 836 | 699 |
| 837 | 851 |
| 838 | 883 |
| 839 | 1045 |
| 840 | 738 |
| 841 | 920 |
| 842 | 877 |
| 843 | 1081 |
| 844 | 946 |
| 845 | 1104 |
| 846 | 1145 |
| 847 | 1285 |
| 848 | 779 |
| 849 | 899 |
| 850 | 963 |
| 851 | 1123 |
| 852 | 1001 |
| 853 | 1156 |
| 854 | 1176 |
| 855 | 1319 |
| 856 | 1033 |
| 857 | 1197 |
| 858 | 1218 |
| 859 | 1349 |
| 860 | 1244 |
| 861 | 1392 |
| 862 | 1414 |
| 863 | 1575 |
| 864 | 818 |
| 865 | 987 |
| 866 | 1023 |
| 867 | 1167 |
| 868 | 1063 |
| 869 | 1206 |
| 870 | 1225 |
| 871 | 1381 |
| 872 | 1090 |
| 873 | 1235 |
| 874 | 1252 |
| 875 | 1401 |
| 876 | 1292 |
| 877 | 1429 |
| 878 | 1455 |
| 879 | 1595 |
| 880 | 1136 |
| 881 | 1272 |
| 882 | 1308 |
| 883 | 1442 |
| 884 | 1327 |
| 885 | 1468 |
| 886 | 1485 |
| 887 | 1617 |
| 888 | 1358 |
| 889 | 1496 |
| 890 | 1513 |
| 891 | 1649 |
| 892 | 1547 |
| 893 | 1684 |
| 894 | 1728 |
| 895 | 1799 |
| 896 | 434 |
| 897 | 591 |
| 898 | 691 |
| 899 | 888 |

TABLE Z11-continued

| with a sequence length of 2048: | |
|---|---|
| Polarized channel sequence number | Reliability or reliability sequence number |
| 900 | 748 |
| 901 | 914 |
| 902 | 981 |
| 903 | 1132 |
| 904 | 792 |
| 905 | 952 |
| 906 | 1011 |
| 907 | 1152 |
| 908 | 1043 |
| 909 | 1190 |
| 910 | 1213 |
| 911 | 1408 |
| 912 | 826 |
| 913 | 997 |
| 914 | 1027 |
| 915 | 1183 |
| 916 | 1088 |
| 917 | 1232 |
| 918 | 1287 |
| 919 | 1417 |
| 920 | 1108 |
| 921 | 1280 |
| 922 | 1257 |
| 923 | 1445 |
| 924 | 1330 |
| 925 | 1472 |
| 926 | 1503 |
| 927 | 1644 |
| 928 | 858 |
| 929 | 1057 |
| 930 | 1096 |
| 931 | 1242 |
| 932 | 1119 |
| 933 | 1274 |
| 934 | 1295 |
| 935 | 1461 |
| 936 | 1165 |
| 937 | 1322 |
| 938 | 1344 |
| 939 | 1475 |
| 940 | 1372 |
| 941 | 1510 |
| 942 | 1532 |
| 943 | 1673 |
| 944 | 1199 |
| 945 | 1352 |
| 946 | 1386 |
| 947 | 1524 |
| 948 | 1411 |
| 949 | 1551 |
| 950 | 1563 |
| 951 | 1694 |
| 952 | 1436 |
| 953 | 1579 |
| 954 | 1604 |
| 955 | 1722 |
| 956 | 1621 |
| 957 | 1752 |
| 958 | 1778 |
| 959 | 1885 |
| 960 | 935 |
| 961 | 1071 |
| 962 | 1143 |
| 963 | 1314 |
| 964 | 1174 |
| 965 | 1338 |
| 966 | 1366 |
| 967 | 1506 |
| 968 | 1223 |
| 969 | 1395 |
| 970 | 1363 |
| 971 | 1539 |
| 972 | 1426 |
| 973 | 1559 |
| 974 | 1591 |

TABLE Z11-continued

| with a sequence length of 2048: | |
|---|---|
| Polarized channel sequence number | Reliability or reliability sequence number |
| 975 | 1705 |
| 976 | 1264 |
| 977 | 1384 |
| 978 | 1432 |
| 979 | 1571 |
| 980 | 1465 |
| 981 | 1600 |
| 982 | 1612 |
| 983 | 1739 |
| 984 | 1492 |
| 985 | 1635 |
| 986 | 1654 |
| 987 | 1764 |
| 988 | 1668 |
| 989 | 1792 |
| 990 | 1814 |
| 991 | 1907 |
| 992 | 1306 |
| 993 | 1448 |
| 994 | 1489 |
| 995 | 1608 |
| 996 | 1517 |
| 997 | 1640 |
| 998 | 1659 |
| 999 | 1784 |
| 1000 | 1543 |
| 1001 | 1664 |
| 1002 | 1689 |
| 1003 | 1806 |
| 1004 | 1710 |
| 1005 | 1822 |
| 1006 | 1838 |
| 1007 | 1920 |
| 1008 | 1583 |
| 1009 | 1700 |
| 1010 | 1733 |
| 1011 | 1830 |
| 1012 | 1745 |
| 1013 | 1847 |
| 1014 | 1856 |
| 1015 | 1933 |
| 1016 | 1771 |
| 1017 | 1865 |
| 1018 | 1875 |
| 1019 | 1948 |
| 1020 | 1896 |
| 1021 | 1964 |
| 1022 | 1984 |
| 1023 | 2008 |
| 1024 | 10 |
| 1025 | 39 |
| 1026 | 64 |
| 1027 | 172 |
| 1028 | 83 |
| 1029 | 182 |
| 1030 | 209 |
| 1031 | 302 |
| 1032 | 99 |
| 1033 | 200 |
| 1034 | 225 |
| 1035 | 314 |
| 1036 | 241 |
| 1037 | 347 |
| 1038 | 358 |
| 1039 | 512 |
| 1040 | 114 |
| 1041 | 217 |
| 1042 | 233 |
| 1043 | 342 |
| 1044 | 269 |
| 1045 | 379 |
| 1046 | 412 |
| 1047 | 530 |
| 1048 | 283 |
| 1049 | 407 |

TABLE Z11-continued

| with a sequence length of 2048: | |
|---|---|
| Polarized channel sequence number | Reliability or reliability sequence number |
| 1050 | 388 |
| 1051 | 551 |
| 1052 | 448 |
| 1053 | 579 |
| 1054 | 605 |
| 1055 | 768 |
| 1056 | 128 |
| 1057 | 248 |
| 1058 | 276 |
| 1059 | 384 |
| 1060 | 295 |
| 1061 | 398 |
| 1062 | 426 |
| 1063 | 565 |
| 1064 | 320 |
| 1065 | 443 |
| 1066 | 464 |
| 1067 | 586 |
| 1068 | 488 |
| 1069 | 618 |
| 1070 | 640 |
| 1071 | 807 |
| 1072 | 353 |
| 1073 | 468 |
| 1074 | 500 |
| 1075 | 633 |
| 1076 | 515 |
| 1077 | 663 |
| 1078 | 678 |
| 1079 | 822 |
| 1080 | 544 |
| 1081 | 692 |
| 1082 | 720 |
| 1083 | 859 |
| 1084 | 747 |
| 1085 | 902 |
| 1086 | 932 |
| 1087 | 1116 |
| 1088 | 192 |
| 1089 | 263 |
| 1090 | 308 |
| 1091 | 439 |
| 1092 | 337 |
| 1093 | 452 |
| 1094 | 480 |
| 1095 | 615 |
| 1096 | 363 |
| 1097 | 508 |
| 1098 | 472 |
| 1099 | 649 |
| 1100 | 534 |
| 1101 | 666 |
| 1102 | 706 |
| 1103 | 841 |
| 1104 | 393 |
| 1105 | 496 |
| 1106 | 541 |
| 1107 | 684 |
| 1108 | 576 |
| 1109 | 717 |
| 1110 | 739 |
| 1111 | 880 |
| 1112 | 602 |
| 1113 | 755 |
| 1114 | 775 |
| 1115 | 911 |
| 1116 | 803 |
| 1117 | 957 |
| 1118 | 980 |
| 1119 | 1164 |
| 1120 | 430 |
| 1121 | 558 |
| 1122 | 595 |
| 1123 | 731 |
| 1124 | 630 |

TABLE Z11-continued

| with a sequence length of 2048: | |
|---|---|
| Polarized channel sequence number | Reliability or reliability sequence number |
| 1125 | 765 |
| 1126 | 785 |
| 1127 | 945 |
| 1128 | 655 |
| 1129 | 795 |
| 1130 | 812 |
| 1131 | 966 |
| 1132 | 850 |
| 1133 | 996 |
| 1134 | 1028 |
| 1135 | 1189 |
| 1136 | 698 |
| 1137 | 832 |
| 1138 | 869 |
| 1139 | 1010 |
| 1140 | 889 |
| 1141 | 1046 |
| 1142 | 1060 |
| 1143 | 1219 |
| 1144 | 919 |
| 1145 | 1078 |
| 1146 | 1097 |
| 1147 | 1253 |
| 1148 | 1133 |
| 1149 | 1296 |
| 1150 | 1353 |
| 1151 | 1446 |
| 1152 | 140 |
| 1153 | 256 |
| 1154 | 325 |
| 1155 | 484 |
| 1156 | 374 |
| 1157 | 504 |
| 1158 | 555 |
| 1159 | 695 |
| 1160 | 403 |
| 1161 | 537 |
| 1162 | 582 |
| 1163 | 712 |
| 1164 | 611 |
| 1165 | 752 |
| 1166 | 773 |
| 1167 | 972 |
| 1168 | 435 |
| 1169 | 572 |
| 1170 | 599 |
| 1171 | 741 |
| 1172 | 652 |
| 1173 | 793 |
| 1174 | 848 |
| 1175 | 986 |
| 1176 | 672 |
| 1177 | 839 |
| 1178 | 815 |
| 1179 | 1016 |
| 1180 | 891 |
| 1181 | 1048 |
| 1182 | 1082 |
| 1183 | 1248 |
| 1184 | 456 |
| 1185 | 624 |
| 1186 | 661 |
| 1187 | 798 |
| 1188 | 681 |
| 1189 | 834 |
| 1190 | 857 |
| 1191 | 1034 |
| 1192 | 723 |
| 1193 | 882 |
| 1194 | 904 |
| 1195 | 1054 |
| 1196 | 939 |
| 1197 | 1093 |
| 1198 | 1111 |
| 1199 | 1289 |

TABLE Z11-continued

| with a sequence length of 2048: | |
|---|---|
| Polarized channel sequence number | Reliability or reliability sequence number |
| 1200 | 760 |
| 1201 | 913 |
| 1202 | 953 |
| 1203 | 1105 |
| 1204 | 978 |
| 1205 | 1142 |
| 1206 | 1153 |
| 1207 | 1312 |
| 1208 | 1004 |
| 1209 | 1170 |
| 1210 | 1200 |
| 1211 | 1343 |
| 1212 | 1226 |
| 1213 | 1387 |
| 1214 | 1416 |
| 1215 | 1574 |
| 1216 | 526 |
| 1217 | 636 |
| 1218 | 704 |
| 1219 | 873 |
| 1220 | 733 |
| 1221 | 898 |
| 1222 | 928 |
| 1223 | 1087 |
| 1224 | 783 |
| 1225 | 962 |
| 1226 | 924 |
| 1227 | 1122 |
| 1228 | 990 |
| 1229 | 1148 |
| 1230 | 1180 |
| 1231 | 1326 |
| 1232 | 824 |
| 1233 | 947 |
| 1234 | 1002 |
| 1235 | 1159 |
| 1236 | 1040 |
| 1237 | 1195 |
| 1238 | 1214 |
| 1239 | 1370 |
| 1240 | 1072 |
| 1241 | 1233 |
| 1242 | 1258 |
| 1243 | 1399 |
| 1244 | 1281 |
| 1245 | 1435 |
| 1246 | 1466 |
| 1247 | 1611 |
| 1248 | 866 |
| 1249 | 1022 |
| 1250 | 1066 |
| 1251 | 1205 |
| 1252 | 1099 |
| 1253 | 1239 |
| 1254 | 1268 |
| 1255 | 1428 |
| 1256 | 1127 |
| 1257 | 1276 |
| 1258 | 1304 |
| 1259 | 1457 |
| 1260 | 1336 |
| 1261 | 1477 |
| 1262 | 1504 |
| 1263 | 1634 |
| 1264 | 1175 |
| 1265 | 1321 |
| 1266 | 1361 |
| 1267 | 1490 |
| 1268 | 1379 |
| 1269 | 1516 |
| 1270 | 1529 |
| 1271 | 1658 |
| 1272 | 1407 |
| 1273 | 1544 |
| 1274 | 1558 |

TABLE Z11-continued with a sequence length of 2048:

| Polarized channel sequence number | Reliability or reliability sequence number |
|---|---|
| 1275 | 1683 |
| 1276 | 1594 |
| 1277 | 1719 |
| 1278 | 1760 |
| 1279 | 1821 |
| 1280 | 151 |
| 1281 | 289 |
| 1282 | 368 |
| 1283 | 569 |
| 1284 | 421 |
| 1285 | 589 |
| 1286 | 643 |
| 1287 | 788 |
| 1288 | 460 |
| 1289 | 627 |
| 1290 | 675 |
| 1291 | 810 |
| 1292 | 701 |
| 1293 | 855 |
| 1294 | 871 |
| 1295 | 1062 |
| 1296 | 492 |
| 1297 | 658 |
| 1298 | 687 |
| 1299 | 846 |
| 1300 | 749 |
| 1301 | 893 |
| 1302 | 941 |
| 1303 | 1080 |
| 1304 | 770 |
| 1305 | 937 |
| 1306 | 909 |
| 1307 | 1114 |
| 1308 | 982 |
| 1309 | 1144 |
| 1310 | 1177 |
| 1311 | 1350 |
| 1312 | 519 |
| 1313 | 715 |
| 1314 | 757 |
| 1315 | 900 |
| 1316 | 780 |
| 1317 | 922 |
| 1318 | 949 |
| 1319 | 1129 |
| 1320 | 820 |
| 1321 | 974 |
| 1322 | 1000 |
| 1323 | 1155 |
| 1324 | 1032 |
| 1325 | 1191 |
| 1326 | 1217 |
| 1327 | 1390 |
| 1328 | 862 |
| 1329 | 1008 |
| 1330 | 1042 |
| 1331 | 1209 |
| 1332 | 1068 |
| 1333 | 1241 |
| 1334 | 1256 |
| 1335 | 1402 |
| 1336 | 1109 |
| 1337 | 1270 |
| 1338 | 1301 |
| 1339 | 1437 |
| 1340 | 1329 |
| 1341 | 1471 |
| 1342 | 1498 |
| 1343 | 1641 |
| 1344 | 608 |
| 1345 | 736 |
| 1346 | 800 |
| 1347 | 970 |
| 1348 | 836 |
| 1349 | 988 |

TABLE Z11-continued with a sequence length of 2048:

| Polarized channel sequence number | Reliability or reliability sequence number |
|---|---|
| 1350 | 1018 |
| 1351 | 1186 |
| 1352 | 878 |
| 1353 | 1056 |
| 1354 | 1012 |
| 1355 | 1222 |
| 1356 | 1086 |
| 1357 | 1245 |
| 1358 | 1286 |
| 1359 | 1422 |
| 1360 | 917 |
| 1361 | 1038 |
| 1362 | 1103 |
| 1363 | 1265 |
| 1364 | 1139 |
| 1365 | 1297 |
| 1366 | 1318 |
| 1367 | 1451 |
| 1368 | 1171 |
| 1369 | 1337 |
| 1370 | 1357 |
| 1371 | 1481 |
| 1372 | 1385 |
| 1373 | 1519 |
| 1374 | 1537 |
| 1375 | 1674 |
| 1376 | 955 |
| 1377 | 1124 |
| 1378 | 1161 |
| 1379 | 1310 |
| 1380 | 1203 |
| 1381 | 1347 |
| 1382 | 1367 |
| 1383 | 1507 |
| 1384 | 1231 |
| 1385 | 1376 |
| 1386 | 1393 |
| 1387 | 1526 |
| 1388 | 1431 |
| 1389 | 1550 |
| 1390 | 1572 |
| 1391 | 1692 |
| 1392 | 1278 |
| 1393 | 1410 |
| 1394 | 1443 |
| 1395 | 1562 |
| 1396 | 1460 |
| 1397 | 1585 |
| 1398 | 1597 |
| 1399 | 1711 |
| 1400 | 1487 |
| 1401 | 1607 |
| 1402 | 1624 |
| 1403 | 1735 |
| 1404 | 1652 |
| 1405 | 1765 |
| 1406 | 1796 |
| 1407 | 1854 |
| 1408 | 548 |
| 1409 | 725 |
| 1410 | 827 |
| 1411 | 1026 |
| 1412 | 884 |
| 1413 | 1052 |
| 1414 | 1118 |
| 1415 | 1273 |
| 1416 | 930 |
| 1417 | 1091 |
| 1418 | 1150 |
| 1419 | 1293 |
| 1420 | 1184 |
| 1421 | 1333 |
| 1422 | 1356 |
| 1423 | 1531 |
| 1424 | 964 |

TABLE Z11-continued

| with a sequence length of 2048: | |
|---|---|
| Polarized channel sequence number | Reliability or reliability sequence number |
| 1425 | 1135 |
| 1426 | 1166 |
| 1427 | 1323 |
| 1428 | 1228 |
| 1429 | 1373 |
| 1430 | 1425 |
| 1431 | 1541 |
| 1432 | 1250 |
| 1433 | 1419 |
| 1434 | 1396 |
| 1435 | 1565 |
| 1436 | 1463 |
| 1437 | 1588 |
| 1438 | 1614 |
| 1439 | 1731 |
| 1440 | 994 |
| 1441 | 1198 |
| 1442 | 1236 |
| 1443 | 1382 |
| 1444 | 1261 |
| 1445 | 1413 |
| 1446 | 1434 |
| 1447 | 1578 |
| 1448 | 1307 |
| 1449 | 1454 |
| 1450 | 1474 |
| 1451 | 1590 |
| 1452 | 1501 |
| 1453 | 1620 |
| 1454 | 1638 |
| 1455 | 1755 |
| 1456 | 1340 |
| 1457 | 1484 |
| 1458 | 1514 |
| 1459 | 1631 |
| 1460 | 1534 |
| 1461 | 1655 |
| 1462 | 1666 |
| 1463 | 1773 |
| 1464 | 1556 |
| 1465 | 1677 |
| 1466 | 1699 |
| 1467 | 1791 |
| 1468 | 1714 |
| 1469 | 1816 |
| 1470 | 1837 |
| 1471 | 1922 |
| 1472 | 1074 |
| 1473 | 1212 |
| 1474 | 1284 |
| 1475 | 1449 |
| 1476 | 1315 |
| 1477 | 1469 |
| 1478 | 1495 |
| 1479 | 1618 |
| 1480 | 1364 |
| 1481 | 1522 |
| 1482 | 1493 |
| 1483 | 1645 |
| 1484 | 1546 |
| 1485 | 1662 |
| 1486 | 1687 |
| 1487 | 1782 |
| 1488 | 1405 |
| 1489 | 1511 |
| 1490 | 1553 |
| 1491 | 1670 |
| 1492 | 1581 |
| 1493 | 1696 |
| 1494 | 1707 |
| 1495 | 1807 |
| 1496 | 1603 |
| 1497 | 1723 |
| 1498 | 1738 |
| 1499 | 1826 |

TABLE Z11-continued

| with a sequence length of 2048: | |
|---|---|
| Polarized channel sequence number | Reliability or reliability sequence number |
| 1500 | 1751 |
| 1501 | 1848 |
| 1502 | 1866 |
| 1503 | 1939 |
| 1504 | 1440 |
| 1505 | 1569 |
| 1506 | 1601 |
| 1507 | 1703 |
| 1508 | 1628 |
| 1509 | 1726 |
| 1510 | 1743 |
| 1511 | 1843 |
| 1512 | 1648 |
| 1513 | 1747 |
| 1514 | 1769 |
| 1515 | 1860 |
| 1516 | 1787 |
| 1517 | 1872 |
| 1518 | 1884 |
| 1519 | 1949 |
| 1520 | 1680 |
| 1521 | 1777 |
| 1522 | 1801 |
| 1523 | 1879 |
| 1524 | 1811 |
| 1525 | 1892 |
| 1526 | 1899 |
| 1527 | 1958 |
| 1528 | 1832 |
| 1529 | 1906 |
| 1530 | 1914 |
| 1531 | 1970 |
| 1532 | 1930 |
| 1533 | 1982 |
| 1534 | 1997 |
| 1535 | 2016 |
| 1536 | 162 |
| 1537 | 331 |
| 1538 | 417 |
| 1539 | 669 |
| 1540 | 476 |
| 1541 | 689 |
| 1542 | 744 |
| 1543 | 906 |
| 1544 | 523 |
| 1545 | 728 |
| 1546 | 778 |
| 1547 | 926 |
| 1548 | 805 |
| 1549 | 968 |
| 1550 | 984 |
| 1551 | 1187 |
| 1552 | 562 |
| 1553 | 762 |
| 1554 | 790 |
| 1555 | 960 |
| 1556 | 853 |
| 1557 | 1014 |
| 1558 | 1064 |
| 1559 | 1207 |
| 1560 | 875 |
| 1561 | 1058 |
| 1562 | 1030 |
| 1563 | 1234 |
| 1564 | 1107 |
| 1565 | 1263 |
| 1566 | 1291 |
| 1567 | 1453 |
| 1568 | 592 |
| 1569 | 817 |
| 1570 | 864 |
| 1571 | 1020 |
| 1572 | 896 |
| 1573 | 1044 |
| 1574 | 1076 |

TABLE Z11-continued

| with a sequence length of 2048: | |
|---|---|
| Polarized channel sequence number | Reliability or reliability sequence number |
| 1575 | 1246 |
| 1576 | 934 |
| 1577 | 1101 |
| 1578 | 1131 |
| 1579 | 1271 |
| 1580 | 1157 |
| 1581 | 1305 |
| 1582 | 1328 |
| 1583 | 1488 |
| 1584 | 976 |
| 1585 | 1137 |
| 1586 | 1173 |
| 1587 | 1320 |
| 1588 | 1193 |
| 1589 | 1351 |
| 1590 | 1365 |
| 1591 | 1502 |
| 1592 | 1224 |
| 1593 | 1377 |
| 1594 | 1406 |
| 1595 | 1535 |
| 1596 | 1430 |
| 1597 | 1570 |
| 1598 | 1596 |
| 1599 | 1721 |
| 1600 | 709 |
| 1601 | 843 |
| 1602 | 915 |
| 1603 | 1095 |
| 1604 | 951 |
| 1605 | 1112 |
| 1606 | 1146 |
| 1607 | 1302 |
| 1608 | 992 |
| 1609 | 1182 |
| 1610 | 1140 |
| 1611 | 1334 |
| 1612 | 1210 |
| 1613 | 1354 |
| 1614 | 1394 |
| 1615 | 1520 |
| 1616 | 1036 |
| 1617 | 1168 |
| 1618 | 1221 |
| 1619 | 1371 |
| 1620 | 1260 |
| 1621 | 1403 |
| 1622 | 1424 |
| 1623 | 1552 |
| 1624 | 1288 |
| 1625 | 1441 |
| 1626 | 1462 |
| 1627 | 1577 |
| 1628 | 1486 |
| 1629 | 1615 |
| 1630 | 1632 |
| 1631 | 1750 |
| 1632 | 1084 |
| 1633 | 1243 |
| 1634 | 1279 |
| 1635 | 1415 |
| 1636 | 1317 |
| 1637 | 1450 |
| 1638 | 1470 |
| 1639 | 1605 |
| 1640 | 1342 |
| 1641 | 1479 |
| 1642 | 1494 |
| 1643 | 1622 |
| 1644 | 1527 |
| 1645 | 1643 |
| 1646 | 1665 |
| 1647 | 1766 |
| 1648 | 1383 |
| 1649 | 1509 |

TABLE Z11-continued

| with a sequence length of 2048: | |
|---|---|
| Polarized channel sequence number | Reliability or reliability sequence number |
| 1650 | 1542 |
| 1651 | 1653 |
| 1652 | 1560 |
| 1653 | 1676 |
| 1654 | 1686 |
| 1655 | 1783 |
| 1656 | 1584 |
| 1657 | 1697 |
| 1658 | 1709 |
| 1659 | 1802 |
| 1660 | 1732 |
| 1661 | 1824 |
| 1662 | 1852 |
| 1663 | 1897 |
| 1664 | 621 |
| 1665 | 829 |
| 1666 | 943 |
| 1667 | 1151 |
| 1668 | 1006 |
| 1669 | 1179 |
| 1670 | 1238 |
| 1671 | 1380 |
| 1672 | 1050 |
| 1673 | 1215 |
| 1674 | 1266 |
| 1675 | 1397 |
| 1676 | 1299 |
| 1677 | 1438 |
| 1678 | 1459 |
| 1679 | 1625 |
| 1680 | 1089 |
| 1681 | 1255 |
| 1682 | 1283 |
| 1683 | 1427 |
| 1684 | 1339 |
| 1685 | 1476 |
| 1686 | 1525 |
| 1687 | 1636 |
| 1688 | 1359 |
| 1689 | 1518 |
| 1690 | 1497 |
| 1691 | 1657 |
| 1692 | 1561 |
| 1693 | 1678 |
| 1694 | 1701 |
| 1695 | 1798 |
| 1696 | 1120 |
| 1697 | 1309 |
| 1698 | 1348 |
| 1699 | 1480 |
| 1700 | 1368 |
| 1701 | 1512 |
| 1702 | 1533 |
| 1703 | 1669 |
| 1704 | 1409 |
| 1705 | 1554 |
| 1706 | 1573 |
| 1707 | 1682 |
| 1708 | 1599 |
| 1709 | 1708 |
| 1710 | 1718 |
| 1711 | 1820 |
| 1712 | 1447 |
| 1713 | 1580 |
| 1714 | 1610 |
| 1715 | 1715 |
| 1716 | 1629 |
| 1717 | 1737 |
| 1718 | 1744 |
| 1719 | 1833 |
| 1720 | 1650 |
| 1721 | 1754 |
| 1722 | 1772 |
| 1723 | 1849 |
| 1724 | 1786 |

TABLE Z11-continued

| with a sequence length of 2048: | |
|---|---|
| Polarized channel sequence number | Reliability or reliability sequence number |
| 1725 | 1869 |
| 1726 | 1882 |
| 1727 | 1951 |
| 1728 | 1202 |
| 1729 | 1325 |
| 1730 | 1391 |
| 1731 | 1548 |
| 1732 | 1418 |
| 1733 | 1566 |
| 1734 | 1592 |
| 1735 | 1704 |
| 1736 | 1467 |
| 1737 | 1616 |
| 1738 | 1589 |
| 1739 | 1725 |
| 1740 | 1639 |
| 1741 | 1741 |
| 1742 | 1761 |
| 1743 | 1840 |
| 1744 | 1505 |
| 1745 | 1606 |
| 1746 | 1647 |
| 1747 | 1748 |
| 1748 | 1672 |
| 1749 | 1768 |
| 1750 | 1780 |
| 1751 | 1861 |
| 1752 | 1693 |
| 1753 | 1790 |
| 1754 | 1804 |
| 1755 | 1874 |
| 1756 | 1817 |
| 1757 | 1891 |
| 1758 | 1905 |
| 1759 | 1963 |
| 1760 | 1540 |
| 1761 | 1661 |
| 1762 | 1690 |
| 1763 | 1775 |
| 1764 | 1712 |
| 1765 | 1794 |
| 1766 | 1809 |
| 1767 | 1888 |
| 1768 | 1729 |
| 1769 | 1813 |
| 1770 | 1828 |
| 1771 | 1902 |
| 1772 | 1844 |
| 1773 | 1911 |
| 1774 | 1923 |
| 1775 | 1972 |
| 1776 | 1757 |
| 1777 | 1836 |
| 1778 | 1857 |
| 1779 | 1916 |
| 1780 | 1864 |
| 1781 | 1927 |
| 1782 | 1932 |
| 1783 | 1979 |
| 1784 | 1878 |
| 1785 | 1938 |
| 1786 | 1944 |
| 1787 | 1988 |
| 1788 | 1957 |
| 1789 | 1998 |
| 1790 | 2009 |
| 1791 | 2023 |
| 1792 | 646 |
| 1793 | 887 |
| 1794 | 998 |
| 1795 | 1251 |
| 1796 | 1070 |
| 1797 | 1275 |
| 1798 | 1331 |
| 1799 | 1473 |

TABLE Z11-continued

| with a sequence length of 2048: | |
|---|---|
| Polarized channel sequence number | Reliability or reliability sequence number |
| 1800 | 1126 |
| 1801 | 1313 |
| 1802 | 1362 |
| 1803 | 1491 |
| 1804 | 1388 |
| 1805 | 1530 |
| 1806 | 1545 |
| 1807 | 1688 |
| 1808 | 1162 |
| 1809 | 1345 |
| 1810 | 1374 |
| 1811 | 1523 |
| 1812 | 1433 |
| 1813 | 1564 |
| 1814 | 1602 |
| 1815 | 1698 |
| 1816 | 1456 |
| 1817 | 1598 |
| 1818 | 1576 |
| 1819 | 1720 |
| 1820 | 1633 |
| 1821 | 1740 |
| 1822 | 1759 |
| 1823 | 1851 |
| 1824 | 1196 |
| 1825 | 1400 |
| 1826 | 1444 |
| 1827 | 1568 |
| 1828 | 1464 |
| 1829 | 1586 |
| 1830 | 1609 |
| 1831 | 1730 |
| 1832 | 1500 |
| 1833 | 1627 |
| 1834 | 1646 |
| 1835 | 1746 |
| 1836 | 1667 |
| 1837 | 1767 |
| 1838 | 1781 |
| 1839 | 1870 |
| 1840 | 1538 |
| 1841 | 1651 |
| 1842 | 1675 |
| 1843 | 1776 |
| 1844 | 1691 |
| 1845 | 1795 |
| 1846 | 1803 |
| 1847 | 1876 |
| 1848 | 1717 |
| 1849 | 1810 |
| 1850 | 1827 |
| 1851 | 1893 |
| 1852 | 1841 |
| 1853 | 1909 |
| 1854 | 1919 |
| 1855 | 1974 |
| 1856 | 1294 |
| 1857 | 1421 |
| 1858 | 1483 |
| 1859 | 1623 |
| 1860 | 1515 |
| 1861 | 1637 |
| 1862 | 1660 |
| 1863 | 1763 |
| 1864 | 1549 |
| 1865 | 1685 |
| 1866 | 1656 |
| 1867 | 1785 |
| 1868 | 1702 |
| 1869 | 1797 |
| 1870 | 1819 |
| 1871 | 1886 |
| 1872 | 1582 |
| 1873 | 1671 |
| 1874 | 1713 |

TABLE Z11-continued

| with a sequence length of 2048: | |
|---|---|
| Polarized channel sequence number | Reliability or reliability sequence number |
| 1875 | 1808 |
| 1876 | 1736 |
| 1877 | 1825 |
| 1878 | 1835 |
| 1879 | 1900 |
| 1880 | 1756 |
| 1881 | 1845 |
| 1882 | 1855 |
| 1883 | 1912 |
| 1884 | 1868 |
| 1885 | 1928 |
| 1886 | 1936 |
| 1887 | 1985 |
| 1888 | 1613 |
| 1889 | 1727 |
| 1890 | 1749 |
| 1891 | 1831 |
| 1892 | 1774 |
| 1893 | 1850 |
| 1894 | 1859 |
| 1895 | 1924 |
| 1896 | 1789 |
| 1897 | 1863 |
| 1898 | 1871 |
| 1899 | 1931 |
| 1900 | 1889 |
| 1901 | 1941 |
| 1902 | 1950 |
| 1903 | 1990 |
| 1904 | 1815 |
| 1905 | 1880 |
| 1906 | 1895 |
| 1907 | 1945 |
| 1908 | 1903 |
| 1909 | 1954 |
| 1910 | 1959 |
| 1911 | 1995 |
| 1912 | 1915 |
| 1913 | 1962 |
| 1914 | 1968 |
| 1915 | 2002 |
| 1916 | 1977 |
| 1917 | 2010 |
| 1918 | 2018 |
| 1919 | 2029 |
| 1920 | 1229 |
| 1921 | 1412 |
| 1922 | 1508 |
| 1923 | 1663 |
| 1924 | 1557 |
| 1925 | 1681 |
| 1926 | 1724 |
| 1927 | 1812 |
| 1928 | 1593 |
| 1929 | 1706 |
| 1930 | 1742 |
| 1931 | 1823 |
| 1932 | 1762 |
| 1933 | 1842 |
| 1934 | 1853 |
| 1935 | 1934 |
| 1936 | 1619 |
| 1937 | 1734 |
| 1938 | 1753 |
| 1939 | 1839 |
| 1940 | 1788 |
| 1941 | 1862 |
| 1942 | 1887 |
| 1943 | 1937 |
| 1944 | 1800 |
| 1945 | 1883 |
| 1946 | 1873 |
| 1947 | 1946 |
| 1948 | 1904 |
| 1949 | 1955 |

TABLE Z11-continued

| with a sequence length of 2048: | |
|---|---|
| Polarized channel sequence number | Reliability or reliability sequence number |
| 1950 | 1965 |
| 1951 | 2001 |
| 1952 | 1642 |
| 1953 | 1770 |
| 1954 | 1793 |
| 1955 | 1867 |
| 1956 | 1805 |
| 1957 | 1881 |
| 1958 | 1890 |
| 1959 | 1952 |
| 1960 | 1829 |
| 1961 | 1901 |
| 1962 | 1910 |
| 1963 | 1956 |
| 1964 | 1921 |
| 1965 | 1967 |
| 1966 | 1973 |
| 1967 | 2007 |
| 1968 | 1846 |
| 1969 | 1913 |
| 1970 | 1926 |
| 1971 | 1971 |
| 1972 | 1935 |
| 1973 | 1978 |
| 1974 | 1981 |
| 1975 | 2012 |
| 1976 | 1943 |
| 1977 | 1986 |
| 1978 | 1992 |
| 1979 | 2017 |
| 1980 | 1996 |
| 1981 | 2022 |
| 1982 | 2026 |
| 1983 | 2039 |
| 1984 | 1695 |
| 1985 | 1779 |
| 1986 | 1818 |
| 1987 | 1898 |
| 1988 | 1834 |
| 1989 | 1908 |
| 1990 | 1918 |
| 1991 | 1966 |
| 1992 | 1858 |
| 1993 | 1929 |
| 1994 | 1917 |
| 1995 | 1975 |
| 1996 | 1940 |
| 1997 | 1980 |
| 1998 | 1989 |
| 1999 | 2014 |
| 2000 | 1877 |
| 2001 | 1925 |
| 2002 | 1942 |
| 2003 | 1983 |
| 2004 | 1953 |
| 2005 | 1991 |
| 2006 | 1994 |
| 2007 | 2020 |
| 2008 | 1961 |
| 2009 | 1999 |
| 2010 | 2003 |
| 2011 | 2024 |
| 2012 | 2006 |
| 2013 | 2028 |
| 2014 | 2031 |
| 2015 | 2041 |
| 2016 | 1894 |
| 2017 | 1947 |
| 2018 | 1960 |
| 2019 | 1993 |
| 2020 | 1969 |
| 2021 | 2000 |
| 2022 | 2004 |
| 2023 | 2027 |
| 2024 | 1976 |

TABLE Z11-continued

| with a sequence length of 2048: | |
|---|---|
| Polarized channel sequence number | Reliability or reliability sequence number |
| 2025 | 2005 |
| 2026 | 2011 |
| 2027 | 2030 |
| 2028 | 2015 |
| 2029 | 2032 |
| 2030 | 2034 |
| 2031 | 2042 |
| 2032 | 1987 |
| 2033 | 2013 |
| 2034 | 2019 |
| 2035 | 2033 |
| 2036 | 2021 |
| 2037 | 2035 |
| 2038 | 2036 |
| 2039 | 2043 |
| 2040 | 2025 |
| 2041 | 2037 |
| 2042 | 2038 |
| 2043 | 2044 |
| 2044 | 2040 |
| 2045 | 2045 |
| 2046 | 2046 |
| 2047 | 2047 |

Sequence Z12, with a sequence length of 1024:

[0, 1, 2, 10, 3, 11, 14, 27, 4, 13, 16, 29, 18, 35, 37, 72, 5, 15, 17, 34, 22, 41, 48, 77, 24, 47, 43, 83, 56, 91, 99, 156, 6, 19, 23, 42, 26, 45, 51, 87, 30, 55, 60, 93, 66, 103, 110, 172, 36, 61, 69, 108, 73, 118, 123, 178, 81, 128, 138, 194, 148, 213, 227, 318, 12, 21, 28, 54, 33, 57, 64, 102, 38, 71, 62, 113, 78, 119, 133, 186, 44, 68, 80, 125, 90, 137, 145, 203, 98, 151, 159, 217, 170, 239, 250, 344, 5 2, 85, 96, 142, 107, 155, 163, 233, 115, 167, 174, 243, 190, 258, 273, 358, 130, 182, 198, 265, 207, 282, 289, 375, 221, 298, 308, 395, 327, 421, 457, 519, 7, 20, 31, 65, 40, 70, 84, 129, 46, 79, 92, 13 5, 101, 150, 158, 246, 53, 89, 97, 146, 114, 166, 189, 253, 121, 185, 175, 268, 208, 283, 300, 392, 58, 105, 117, 168, 124, 183, 193, 276, 139, 204, 214, 286, 230, 306, 315, 417, 153, 218, 237, 312, 249, 332, 338, 431, 262, 347, 364, 451, 379, 479, 499, 612, 76, 109, 132, 200, 143, 211, 225, 303, 162, 241, 223, 321, 255, 335, 353, 440, 179, 234, 261, 341, 279, 361, 372, 468, 295, 383, 398, 48 7, 412, 512, 533, 640, 197, 271, 292, 367, 309, 387, 404, 507, 324, 409, 426, 527, 446, 541, 560, 6 58, 350, 437, 462, 550, 474, 569, 578, 677, 493, 589, 600, 697, 627, 726, 760, 813, 8, 25, 39, 88, 5 0, 94, 111, 164, 59, 106, 122, 173, 131, 192, 199, 290, 67, 116, 126, 188, 149, 209, 231, 299, 157, 229, 216, 317, 251, 333, 351, 455, 74, 136, 152, 212, 161, 222, 235, 325, 177, 247, 260, 339, 275, 359, 374, 481, 195, 264, 280, 369, 293, 388, 397, 489, 314, 405, 424, 513, 442, 537, 556, 663, 10 0, 144, 169, 245, 184, 254, 269, 356, 202, 287, 266, 377, 302, 390, 415, 503, 220, 278, 311, 402, 3 30, 422, 435, 523, 348, 447, 460, 544, 478, 571, 584, 689, 238, 322, 342, 430, 366, 453, 466, 562, 382, 472, 483, 576, 509, 594, 610, 704, 410, 495, 517, 603, 529, 620, 629, 719, 548, 637, 650, 73 9, 672, 764, 791, 842, 82, 140, 180, 272, 205, 285, 319, 407, 226, 305, 336, 419, 355, 444, 459, 58 0, 242, 328, 345, 438, 380, 470, 505, 587, 393, 501, 485, 605, 531, 622, 642, 736, 257, 363, 385, 4 76, 400, 497, 511, 615, 428, 525, 539, 624, 558, 647, 661, 756, 449, 546, 567, 655, 582, 674, 683, 771, 598, 692, 710, 787, 722, 808, 827, 903, 296, 371, 414, 521, 433, 535, 554, 645, 464, 573, 55 2, 666, 591, 680, 700, 779, 491, 565, 596, 686, 617, 707, 716, 800, 634, 729, 742, 817, 753, 836, 8 52, 919, 515, 608, 632, 713, 653, 732, 746, 832, 669, 749, 768, 847, 783, 858, 869, 928, 694, 775, 795, 864, 804, 876, 882, 937, 822, 889, 896, 948, 911, 960, 974, 992, 9, 32, 49, 120, 63, 127, 147, 215, 75, 141, 160, 224, 171, 244, 252, 357, 86, 154, 165, 240, 191, 267, 291, 368, 201, 288, 274, 3 84, 313, 401, 418, 524, 95, 176, 196, 270, 210, 281, 297, 391, 228, 310, 326, 406, 340, 427, 441, 5 49, 248, 329, 349, 436, 360, 456, 465, 559, 378, 473, 492, 583, 508, 609, 628, 728, 134, 187, 219, 307, 236, 316, 334, 425, 256, 354, 331, 445, 370, 458, 484, 572, 277, 346, 376, 469, 399, 490, 50 4, 595, 416, 516, 530, 614, 547, 643, 656, 752, 301, 389, 411, 498, 434, 522, 536, 635, 450, 542, 5 53, 648, 577, 665, 682, 765, 477, 564, 588, 673, 601, 691, 699, 780, 619, 708, 718, 796, 737, 815, 840, 880, 104, 181, 232, 337, 263, 352, 386, 475, 284, 373, 403, 486, 423, 514, 528, 651, 304, 39 6, 413, 506, 448, 540, 575, 659, 461, 570, 555, 676, 602, 693, 711, 793, 320, 429, 454, 543, 467, 5 66, 581, 685, 494, 597, 611, 696, 631, 717, 725, 812, 520, 616, 639, 723, 654, 741, 747, 823, 670, 755, 770, 837, 782, 855, 867, 930, 365, 439, 482, 592, 500, 606, 625, 714, 534, 644, 623, 731, 66 2, 744, 761, 829, 561, 636, 668, 750, 688, 767, 777, 848, 705, 786, 798, 860, 809, 875, 888, 942, 5 86, 679, 702, 773, 720, 789, 802, 872, 734, 806, 819, 885, 833, 893, 904, 950, 758, 826, 844, 898, 851, 908, 913, 957, 863, 918, 924, 965, 936, 975, 985, 999, 112, 206, 259, 394, 294, 408, 443, 53 8, 323, 432, 463, 551, 480, 579, 590, 701, 343, 452, 471, 574, 510, 604, 633, 709, 526, 630, 613, 7 27, 657, 743, 759, 839, 362, 488, 518, 607, 532, 621, 638, 735, 557, 652, 667, 748, 684, 766, 778, 856, 585, 671, 690, 774, 703, 790, 797, 861, 724, 803, 818, 877, 830, 891, 901, 952, 420, 502, 54 5, 649, 568, 660, 678, 763, 593, 698, 675, 781, 712, 792, 811, 870, 618, 687, 721, 801, 740, 816, 8 25, 883, 757, 834, 843, 894, 854, 909, 916, 962, 641, 733, 751, 821, 772, 838, 846, 905, 785, 850, 857, 912, 873, 921, 929, 967, 807, 865, 879, 925, 886, 933, 938, 972, 897, 941, 946, 979, 955, 98 6, 994, 1005, 381, 496, 563, 681, 599, 695, 730, 805, 626, 715, 745, 814, 762, 831, 841, 914, 646, 738, 754, 828, 784, 849, 871, 917, 794, 868, 859, 926, 887, 934, 943, 978, 664, 769, 788, 853, 79 9, 866, 874, 931, 820, 884, 892, 935, 902, 945, 951, 984, 835, 895, 907, 949, 915, 956, 959, 988, 9 23, 963, 969, 993, 973, 998, 1002, 1015, 706, 776, 810, 881, 824, 890, 900, 944, 845, 910, 899, 9 53, 920, 958, 966, 990, 862, 906, 922, 961, 932, 968, 971, 996, 940, 976, 980, 1000, 983, 1004, 1 007, 1017, 878, 927, 939, 970, 947, 977, 981, 1003, 954, 982, 987, 1006, 991, 1008, 1010, 1018, 964, 989, 995, 1009, 997, 1011, 1012, 1019, 1001, 1013, 1014, 1020, 1016, 1021, 1022, 1023]

TABLE Z12

| with a sequence length of 1024: | |
|---|---|
| Polarized channel sequence number | Reliability or reliability sequence number |
| 0 | 0 |
| 1 | 1 |
| 2 | 2 |
| 3 | 10 |
| 4 | 3 |
| 5 | 11 |
| 6 | 14 |
| 7 | 27 |
| 8 | 4 |

TABLE Z12-continued with a sequence length of 1024:

| Polarized channel sequence number | Reliability or reliability sequence number |
|---|---|
| 9 | 13 |
| 10 | 16 |
| 11 | 29 |
| 12 | 18 |
| 13 | 35 |
| 14 | 37 |
| 15 | 72 |
| 16 | 5 |
| 17 | 15 |
| 18 | 17 |
| 19 | 34 |
| 20 | 22 |
| 21 | 41 |
| 22 | 48 |
| 23 | 77 |
| 24 | 24 |
| 25 | 47 |
| 26 | 43 |
| 27 | 83 |
| 28 | 56 |
| 29 | 91 |
| 30 | 99 |
| 31 | 156 |
| 32 | 6 |
| 33 | 19 |
| 34 | 23 |
| 35 | 42 |
| 36 | 26 |
| 37 | 45 |
| 38 | 51 |
| 39 | 87 |
| 40 | 30 |
| 41 | 55 |
| 42 | 60 |
| 43 | 93 |
| 44 | 66 |
| 45 | 103 |
| 46 | 110 |
| 47 | 172 |
| 48 | 36 |
| 49 | 61 |
| 50 | 69 |
| 51 | 108 |
| 52 | 73 |
| 53 | 118 |
| 54 | 123 |
| 55 | 178 |
| 56 | 81 |
| 57 | 128 |
| 58 | 138 |
| 59 | 194 |
| 60 | 148 |
| 61 | 213 |
| 62 | 227 |
| 63 | 318 |
| 64 | 12 |
| 65 | 21 |
| 66 | 28 |
| 67 | 54 |
| 68 | 33 |
| 69 | 57 |
| 70 | 64 |
| 71 | 102 |
| 72 | 38 |
| 73 | 71 |
| 74 | 62 |
| 75 | 113 |
| 76 | 78 |
| 77 | 119 |
| 78 | 133 |
| 79 | 186 |
| 80 | 44 |
| 81 | 68 |
| 82 | 80 |
| 83 | 125 |
| 84 | 90 |
| 85 | 137 |
| 86 | 145 |
| 87 | 203 |
| 88 | 98 |
| 89 | 151 |
| 90 | 159 |
| 91 | 217 |
| 92 | 170 |
| 93 | 239 |
| 94 | 250 |
| 95 | 344 |
| 96 | 52 |
| 97 | 85 |
| 98 | 96 |
| 99 | 142 |
| 100 | 107 |
| 101 | 155 |
| 102 | 163 |
| 103 | 233 |
| 104 | 115 |
| 105 | 167 |
| 106 | 174 |
| 107 | 243 |
| 108 | 190 |
| 109 | 258 |
| 110 | 273 |
| 111 | 358 |
| 112 | 130 |
| 113 | 182 |
| 114 | 198 |
| 115 | 265 |
| 116 | 207 |
| 117 | 282 |
| 118 | 289 |
| 119 | 375 |
| 120 | 221 |
| 121 | 298 |
| 122 | 308 |
| 123 | 395 |
| 124 | 327 |
| 125 | 421 |
| 126 | 457 |
| 127 | 519 |
| 128 | 7 |
| 129 | 20 |
| 130 | 31 |
| 131 | 65 |
| 132 | 40 |
| 133 | 70 |
| 134 | 84 |
| 135 | 129 |
| 136 | 46 |
| 137 | 79 |
| 138 | 92 |
| 139 | 135 |
| 140 | 101 |
| 141 | 150 |
| 142 | 158 |
| 143 | 246 |
| 144 | 53 |
| 145 | 89 |
| 146 | 97 |
| 147 | 146 |
| 148 | 114 |
| 149 | 166 |
| 150 | 189 |
| 151 | 253 |
| 152 | 121 |
| 153 | 185 |
| 154 | 175 |
| 155 | 268 |
| 156 | 208 |
| 157 | 283 |
| 158 | 300 |

TABLE Z12-continued

| with a sequence length of 1024: | |
|---|---|
| Polarized channel sequence number | Reliability or reliability sequence number |
| 159 | 392 |
| 160 | 58 |
| 161 | 105 |
| 162 | 117 |
| 163 | 168 |
| 164 | 124 |
| 165 | 183 |
| 166 | 193 |
| 167 | 276 |
| 168 | 139 |
| 169 | 204 |
| 170 | 214 |
| 171 | 286 |
| 172 | 230 |
| 173 | 306 |
| 174 | 315 |
| 175 | 417 |
| 176 | 153 |
| 177 | 218 |
| 178 | 237 |
| 179 | 312 |
| 180 | 249 |
| 181 | 332 |
| 182 | 338 |
| 183 | 431 |
| 184 | 262 |
| 185 | 347 |
| 186 | 364 |
| 187 | 451 |
| 188 | 379 |
| 189 | 479 |
| 190 | 499 |
| 191 | 612 |
| 192 | 76 |
| 193 | 109 |
| 194 | 132 |
| 195 | 200 |
| 196 | 143 |
| 197 | 211 |
| 198 | 225 |
| 199 | 303 |
| 200 | 162 |
| 201 | 241 |
| 202 | 223 |
| 203 | 321 |
| 204 | 255 |
| 205 | 335 |
| 206 | 353 |
| 207 | 440 |
| 208 | 179 |
| 209 | 234 |
| 210 | 261 |
| 211 | 341 |
| 212 | 279 |
| 213 | 361 |
| 214 | 372 |
| 215 | 468 |
| 216 | 295 |
| 217 | 383 |
| 218 | 398 |
| 219 | 487 |
| 220 | 412 |
| 221 | 512 |
| 222 | 533 |
| 223 | 640 |
| 224 | 197 |
| 225 | 271 |
| 226 | 292 |
| 227 | 367 |
| 228 | 309 |
| 229 | 387 |
| 230 | 404 |
| 231 | 507 |
| 232 | 324 |
| 233 | 409 |

TABLE Z12-continued

| with a sequence length of 1024: | |
|---|---|
| Polarized channel sequence number | Reliability or reliability sequence number |
| 234 | 426 |
| 235 | 527 |
| 236 | 446 |
| 237 | 541 |
| 238 | 560 |
| 239 | 658 |
| 240 | 350 |
| 241 | 437 |
| 242 | 462 |
| 243 | 550 |
| 244 | 474 |
| 245 | 569 |
| 246 | 578 |
| 247 | 677 |
| 248 | 493 |
| 249 | 589 |
| 250 | 600 |
| 251 | 697 |
| 252 | 627 |
| 253 | 726 |
| 254 | 760 |
| 255 | 813 |
| 256 | 8 |
| 257 | 25 |
| 258 | 39 |
| 259 | 88 |
| 260 | 50 |
| 261 | 94 |
| 262 | 111 |
| 263 | 164 |
| 264 | 59 |
| 265 | 106 |
| 266 | 122 |
| 267 | 173 |
| 268 | 131 |
| 269 | 192 |
| 270 | 199 |
| 271 | 290 |
| 272 | 67 |
| 273 | 116 |
| 274 | 126 |
| 275 | 188 |
| 276 | 149 |
| 277 | 209 |
| 278 | 231 |
| 279 | 299 |
| 280 | 157 |
| 281 | 229 |
| 282 | 216 |
| 283 | 317 |
| 284 | 251 |
| 285 | 333 |
| 286 | 351 |
| 287 | 455 |
| 288 | 74 |
| 289 | 136 |
| 290 | 152 |
| 291 | 212 |
| 292 | 161 |
| 293 | 222 |
| 294 | 235 |
| 295 | 325 |
| 296 | 177 |
| 297 | 247 |
| 298 | 260 |
| 299 | 339 |
| 300 | 275 |
| 301 | 359 |
| 302 | 374 |
| 303 | 481 |
| 304 | 195 |
| 305 | 264 |
| 306 | 280 |
| 307 | 369 |
| 308 | 293 |

TABLE Z12-continued

| with a sequence length of 1024: | |
|---|---|
| Polarized channel sequence number | Reliability or reliability sequence number |
| 309 | 388 |
| 310 | 397 |
| 311 | 489 |
| 312 | 314 |
| 313 | 405 |
| 314 | 424 |
| 315 | 513 |
| 316 | 442 |
| 317 | 537 |
| 318 | 556 |
| 319 | 663 |
| 320 | 100 |
| 321 | 144 |
| 322 | 169 |
| 323 | 245 |
| 324 | 184 |
| 325 | 254 |
| 326 | 269 |
| 327 | 356 |
| 328 | 202 |
| 329 | 287 |
| 330 | 266 |
| 331 | 377 |
| 332 | 302 |
| 333 | 390 |
| 334 | 415 |
| 335 | 503 |
| 336 | 220 |
| 337 | 278 |
| 338 | 311 |
| 339 | 402 |
| 340 | 330 |
| 341 | 422 |
| 342 | 435 |
| 343 | 523 |
| 344 | 348 |
| 345 | 447 |
| 346 | 460 |
| 347 | 544 |
| 348 | 478 |
| 349 | 571 |
| 350 | 584 |
| 351 | 689 |
| 352 | 238 |
| 353 | 322 |
| 354 | 342 |
| 355 | 430 |
| 356 | 366 |
| 357 | 453 |
| 358 | 466 |
| 359 | 562 |
| 360 | 382 |
| 361 | 472 |
| 362 | 483 |
| 363 | 576 |
| 364 | 509 |
| 365 | 594 |
| 366 | 610 |
| 367 | 704 |
| 368 | 410 |
| 369 | 495 |
| 370 | 517 |
| 371 | 603 |
| 372 | 529 |
| 373 | 620 |
| 374 | 629 |
| 375 | 719 |
| 376 | 548 |
| 377 | 637 |
| 378 | 650 |
| 379 | 739 |
| 380 | 672 |
| 381 | 764 |
| 382 | 791 |
| 383 | 842 |

TABLE Z12-continued

| with a sequence length of 1024: | |
|---|---|
| Polarized channel sequence number | Reliability or reliability sequence number |
| 384 | 82 |
| 385 | 140 |
| 386 | 180 |
| 387 | 272 |
| 388 | 205 |
| 389 | 285 |
| 390 | 319 |
| 391 | 407 |
| 392 | 226 |
| 393 | 305 |
| 394 | 336 |
| 395 | 419 |
| 396 | 355 |
| 397 | 444 |
| 398 | 459 |
| 399 | 580 |
| 400 | 242 |
| 401 | 328 |
| 402 | 345 |
| 403 | 438 |
| 404 | 380 |
| 405 | 470 |
| 406 | 505 |
| 407 | 587 |
| 408 | 393 |
| 409 | 501 |
| 410 | 485 |
| 411 | 605 |
| 412 | 531 |
| 413 | 622 |
| 414 | 642 |
| 415 | 736 |
| 416 | 257 |
| 417 | 363 |
| 418 | 385 |
| 419 | 476 |
| 420 | 400 |
| 421 | 497 |
| 422 | 511 |
| 423 | 615 |
| 424 | 428 |
| 425 | 525 |
| 426 | 539 |
| 427 | 624 |
| 428 | 558 |
| 429 | 647 |
| 430 | 661 |
| 431 | 756 |
| 432 | 449 |
| 433 | 546 |
| 434 | 567 |
| 435 | 655 |
| 436 | 582 |
| 437 | 674 |
| 438 | 683 |
| 439 | 771 |
| 440 | 598 |
| 441 | 692 |
| 442 | 710 |
| 443 | 787 |
| 444 | 722 |
| 445 | 808 |
| 446 | 827 |
| 447 | 903 |
| 448 | 296 |
| 449 | 371 |
| 450 | 414 |
| 451 | 521 |
| 452 | 433 |
| 453 | 535 |
| 454 | 554 |
| 455 | 645 |
| 456 | 464 |
| 457 | 573 |
| 458 | 552 |

TABLE Z12-continued with a sequence length of 1024:

| Polarized channel sequence number | Reliability or reliability sequence number |
|---|---|
| 459 | 666 |
| 460 | 591 |
| 461 | 680 |
| 462 | 700 |
| 463 | 779 |
| 464 | 491 |
| 465 | 565 |
| 466 | 596 |
| 467 | 686 |
| 468 | 617 |
| 469 | 707 |
| 470 | 716 |
| 471 | 800 |
| 472 | 634 |
| 473 | 729 |
| 474 | 742 |
| 475 | 817 |
| 476 | 753 |
| 477 | 836 |
| 478 | 852 |
| 479 | 919 |
| 480 | 515 |
| 481 | 608 |
| 482 | 632 |
| 483 | 713 |
| 484 | 653 |
| 485 | 732 |
| 486 | 746 |
| 487 | 832 |
| 488 | 669 |
| 489 | 749 |
| 490 | 768 |
| 491 | 847 |
| 492 | 783 |
| 493 | 858 |
| 494 | 869 |
| 495 | 928 |
| 496 | 694 |
| 497 | 775 |
| 498 | 795 |
| 499 | 864 |
| 500 | 804 |
| 501 | 876 |
| 502 | 882 |
| 503 | 937 |
| 504 | 822 |
| 505 | 889 |
| 506 | 896 |
| 507 | 948 |
| 508 | 911 |
| 509 | 960 |
| 510 | 974 |
| 511 | 992 |
| 512 | 9 |
| 513 | 32 |
| 514 | 49 |
| 515 | 120 |
| 516 | 63 |
| 517 | 127 |
| 518 | 147 |
| 519 | 215 |
| 520 | 75 |
| 521 | 141 |
| 522 | 160 |
| 523 | 224 |
| 524 | 171 |
| 525 | 244 |
| 526 | 252 |
| 527 | 357 |
| 528 | 86 |
| 529 | 154 |
| 530 | 165 |
| 531 | 240 |
| 532 | 191 |
| 533 | 267 |

TABLE Z12-continued with a sequence length of 1024:

| Polarized channel sequence number | Reliability or reliability sequence number |
|---|---|
| 534 | 291 |
| 535 | 368 |
| 536 | 201 |
| 537 | 288 |
| 538 | 274 |
| 539 | 384 |
| 540 | 313 |
| 541 | 401 |
| 542 | 418 |
| 543 | 524 |
| 544 | 95 |
| 545 | 176 |
| 546 | 196 |
| 547 | 270 |
| 548 | 210 |
| 549 | 281 |
| 550 | 297 |
| 551 | 391 |
| 552 | 228 |
| 553 | 310 |
| 554 | 326 |
| 555 | 406 |
| 556 | 340 |
| 557 | 427 |
| 558 | 441 |
| 559 | 549 |
| 560 | 248 |
| 561 | 329 |
| 562 | 349 |
| 563 | 436 |
| 564 | 360 |
| 565 | 456 |
| 566 | 465 |
| 567 | 559 |
| 568 | 378 |
| 569 | 473 |
| 570 | 492 |
| 571 | 583 |
| 572 | 508 |
| 573 | 609 |
| 574 | 628 |
| 575 | 728 |
| 576 | 134 |
| 577 | 187 |
| 578 | 219 |
| 579 | 307 |
| 580 | 236 |
| 581 | 316 |
| 582 | 334 |
| 583 | 425 |
| 584 | 256 |
| 585 | 354 |
| 586 | 331 |
| 587 | 445 |
| 588 | 370 |
| 589 | 458 |
| 590 | 484 |
| 591 | 572 |
| 592 | 277 |
| 593 | 346 |
| 594 | 376 |
| 595 | 469 |
| 596 | 399 |
| 597 | 490 |
| 598 | 504 |
| 599 | 595 |
| 600 | 416 |
| 601 | 516 |
| 602 | 530 |
| 603 | 614 |
| 604 | 547 |
| 605 | 643 |
| 606 | 656 |
| 607 | 752 |
| 608 | 301 |

TABLE Z12-continued

| with a sequence length of 1024: | |
|---|---|
| Polarized channel sequence number | Reliability or reliability sequence number |
| 609 | 389 |
| 610 | 411 |
| 611 | 498 |
| 612 | 434 |
| 613 | 522 |
| 614 | 536 |
| 615 | 635 |
| 616 | 450 |
| 617 | 542 |
| 618 | 553 |
| 619 | 648 |
| 620 | 577 |
| 621 | 665 |
| 622 | 682 |
| 623 | 765 |
| 624 | 477 |
| 625 | 564 |
| 626 | 588 |
| 627 | 673 |
| 628 | 601 |
| 629 | 691 |
| 630 | 699 |
| 631 | 780 |
| 632 | 619 |
| 633 | 708 |
| 634 | 718 |
| 635 | 796 |
| 636 | 737 |
| 637 | 815 |
| 638 | 840 |
| 639 | 880 |
| 640 | 104 |
| 641 | 181 |
| 642 | 232 |
| 643 | 337 |
| 644 | 263 |
| 645 | 352 |
| 646 | 386 |
| 647 | 475 |
| 648 | 284 |
| 649 | 373 |
| 650 | 403 |
| 651 | 486 |
| 652 | 423 |
| 653 | 514 |
| 654 | 528 |
| 655 | 651 |
| 656 | 304 |
| 657 | 396 |
| 658 | 413 |
| 659 | 506 |
| 660 | 448 |
| 661 | 540 |
| 662 | 575 |
| 663 | 659 |
| 664 | 461 |
| 665 | 570 |
| 666 | 555 |
| 667 | 676 |
| 668 | 602 |
| 669 | 693 |
| 670 | 711 |
| 671 | 793 |
| 672 | 320 |
| 673 | 429 |
| 674 | 454 |
| 675 | 543 |
| 676 | 467 |
| 677 | 566 |
| 678 | 581 |
| 679 | 685 |
| 680 | 494 |
| 681 | 597 |
| 682 | 611 |
| 683 | 696 |

TABLE Z12-continued

| with a sequence length of 1024: | |
|---|---|
| Polarized channel sequence number | Reliability or reliability sequence number |
| 684 | 631 |
| 685 | 717 |
| 686 | 725 |
| 687 | 812 |
| 688 | 520 |
| 689 | 616 |
| 690 | 639 |
| 691 | 723 |
| 692 | 654 |
| 693 | 741 |
| 694 | 747 |
| 695 | 823 |
| 696 | 670 |
| 697 | 755 |
| 698 | 770 |
| 699 | 837 |
| 700 | 782 |
| 701 | 855 |
| 702 | 867 |
| 703 | 930 |
| 704 | 365 |
| 705 | 439 |
| 706 | 482 |
| 707 | 592 |
| 708 | 500 |
| 709 | 606 |
| 710 | 625 |
| 711 | 714 |
| 712 | 534 |
| 713 | 644 |
| 714 | 623 |
| 715 | 731 |
| 716 | 662 |
| 717 | 744 |
| 718 | 761 |
| 719 | 829 |
| 720 | 561 |
| 721 | 636 |
| 722 | 668 |
| 723 | 750 |
| 724 | 688 |
| 725 | 767 |
| 726 | 777 |
| 727 | 848 |
| 728 | 705 |
| 729 | 786 |
| 730 | 798 |
| 731 | 860 |
| 732 | 809 |
| 733 | 875 |
| 734 | 888 |
| 735 | 942 |
| 736 | 586 |
| 737 | 679 |
| 738 | 702 |
| 739 | 773 |
| 740 | 720 |
| 741 | 789 |
| 742 | 802 |
| 743 | 872 |
| 744 | 734 |
| 745 | 806 |
| 746 | 819 |
| 747 | 885 |
| 748 | 833 |
| 749 | 893 |
| 750 | 904 |
| 751 | 950 |
| 752 | 758 |
| 753 | 826 |
| 754 | 844 |
| 755 | 898 |
| 756 | 851 |
| 757 | 908 |
| 758 | 913 |

TABLE Z12-continued with a sequence length of 1024:

| Polarized channel sequence number | Reliability or reliability sequence number |
|---|---|
| 759 | 957 |
| 760 | 863 |
| 761 | 918 |
| 762 | 924 |
| 763 | 965 |
| 764 | 936 |
| 765 | 975 |
| 766 | 985 |
| 767 | 999 |
| 768 | 112 |
| 769 | 206 |
| 770 | 259 |
| 771 | 394 |
| 772 | 294 |
| 773 | 408 |
| 774 | 443 |
| 775 | 538 |
| 776 | 323 |
| 777 | 432 |
| 778 | 463 |
| 779 | 551 |
| 780 | 480 |
| 781 | 579 |
| 782 | 590 |
| 783 | 701 |
| 784 | 343 |
| 785 | 452 |
| 786 | 471 |
| 787 | 574 |
| 788 | 510 |
| 789 | 604 |
| 790 | 633 |
| 791 | 709 |
| 792 | 526 |
| 793 | 630 |
| 794 | 613 |
| 795 | 727 |
| 796 | 657 |
| 797 | 743 |
| 798 | 759 |
| 799 | 839 |
| 800 | 362 |
| 801 | 488 |
| 802 | 518 |
| 803 | 607 |
| 804 | 532 |
| 805 | 621 |
| 806 | 638 |
| 807 | 735 |
| 808 | 557 |
| 809 | 652 |
| 810 | 667 |
| 811 | 748 |
| 812 | 684 |
| 813 | 766 |
| 814 | 778 |
| 815 | 856 |
| 816 | 585 |
| 817 | 671 |
| 818 | 690 |
| 819 | 774 |
| 820 | 703 |
| 821 | 790 |
| 822 | 797 |
| 823 | 861 |
| 824 | 724 |
| 825 | 803 |
| 826 | 818 |
| 827 | 877 |
| 828 | 830 |
| 829 | 891 |
| 830 | 901 |
| 831 | 952 |
| 832 | 420 |
| 833 | 502 |

TABLE Z12-continued with a sequence length of 1024:

| Polarized channel sequence number | Reliability or reliability sequence number |
|---|---|
| 834 | 545 |
| 835 | 649 |
| 836 | 568 |
| 837 | 660 |
| 838 | 678 |
| 839 | 763 |
| 840 | 593 |
| 841 | 698 |
| 842 | 675 |
| 843 | 781 |
| 844 | 712 |
| 845 | 792 |
| 846 | 811 |
| 847 | 870 |
| 848 | 618 |
| 849 | 687 |
| 850 | 721 |
| 851 | 801 |
| 852 | 740 |
| 853 | 816 |
| 854 | 825 |
| 855 | 883 |
| 856 | 757 |
| 857 | 834 |
| 858 | 843 |
| 859 | 894 |
| 860 | 854 |
| 861 | 909 |
| 862 | 916 |
| 863 | 962 |
| 864 | 641 |
| 865 | 733 |
| 866 | 751 |
| 867 | 821 |
| 868 | 772 |
| 869 | 838 |
| 870 | 846 |
| 871 | 905 |
| 872 | 785 |
| 873 | 850 |
| 874 | 857 |
| 875 | 912 |
| 876 | 873 |
| 877 | 921 |
| 878 | 929 |
| 879 | 967 |
| 880 | 807 |
| 881 | 865 |
| 882 | 879 |
| 883 | 925 |
| 884 | 886 |
| 885 | 933 |
| 886 | 938 |
| 887 | 972 |
| 888 | 897 |
| 889 | 941 |
| 890 | 946 |
| 891 | 979 |
| 892 | 955 |
| 893 | 986 |
| 894 | 994 |
| 895 | 1005 |
| 896 | 381 |
| 897 | 496 |
| 898 | 563 |
| 899 | 681 |
| 900 | 599 |
| 901 | 695 |
| 902 | 730 |
| 903 | 805 |
| 904 | 626 |
| 905 | 715 |
| 906 | 745 |
| 907 | 814 |
| 908 | 762 |

TABLE Z12-continued with a sequence length of 1024:

| Polarized channel sequence number | Reliability or reliability sequence number |
|---|---|
| 909 | 831 |
| 910 | 841 |
| 911 | 914 |
| 912 | 646 |
| 913 | 738 |
| 914 | 754 |
| 915 | 828 |
| 916 | 784 |
| 917 | 849 |
| 918 | 871 |
| 919 | 917 |
| 920 | 794 |
| 921 | 868 |
| 922 | 859 |
| 923 | 926 |
| 924 | 887 |
| 925 | 934 |
| 926 | 943 |
| 927 | 978 |
| 928 | 664 |
| 929 | 769 |
| 930 | 788 |
| 931 | 853 |
| 932 | 799 |
| 933 | 866 |
| 934 | 874 |
| 935 | 931 |
| 936 | 820 |
| 937 | 884 |
| 938 | 892 |
| 939 | 935 |
| 940 | 902 |
| 941 | 945 |
| 942 | 951 |
| 943 | 984 |
| 944 | 835 |
| 945 | 895 |
| 946 | 907 |
| 947 | 949 |
| 948 | 915 |
| 949 | 956 |
| 950 | 959 |
| 951 | 988 |
| 952 | 923 |
| 953 | 963 |
| 954 | 969 |
| 955 | 993 |
| 956 | 973 |
| 957 | 998 |
| 958 | 1002 |
| 959 | 1015 |
| 960 | 706 |
| 961 | 776 |
| 962 | 810 |
| 963 | 881 |
| 964 | 824 |
| 965 | 890 |
| 966 | 900 |
| 967 | 944 |
| 968 | 845 |
| 969 | 910 |
| 970 | 899 |
| 971 | 953 |
| 972 | 920 |
| 973 | 958 |
| 974 | 966 |
| 975 | 990 |
| 976 | 862 |
| 977 | 906 |
| 978 | 922 |
| 979 | 961 |
| 980 | 932 |
| 981 | 968 |
| 982 | 971 |
| 983 | 996 |
| 984 | 940 |
| 985 | 976 |
| 986 | 980 |
| 987 | 1000 |
| 988 | 983 |
| 989 | 1004 |
| 990 | 1007 |
| 991 | 1017 |
| 992 | 878 |
| 993 | 927 |
| 994 | 939 |
| 995 | 970 |
| 996 | 947 |
| 997 | 977 |
| 998 | 981 |
| 999 | 1003 |
| 1000 | 954 |
| 1001 | 982 |
| 1002 | 987 |
| 1003 | 1006 |
| 1004 | 991 |
| 1005 | 1008 |
| 1006 | 1010 |
| 1007 | 1018 |
| 1008 | 964 |
| 1009 | 989 |
| 1010 | 995 |
| 1011 | 1009 |
| 1012 | 997 |
| 1013 | 1011 |
| 1014 | 1012 |
| 1015 | 1019 |
| 1016 | 1001 |
| 1017 | 1013 |
| 1018 | 1014 |
| 1019 | 1020 |
| 1020 | 1016 |
| 1021 | 1021 |
| 1022 | 1022 |
| 1023 | 1023 |

Sequence Z13, with a sequence length of 512:

[0, 1, 2, 9, 3, 10, 13, 26, 4, 12, 15, 28, 17, 33, 35, 68, 5, 14, 16, 32, 21, 39, 46, 72, 23, 45, 4 1, 78, 53, 85, 92, 141, 6, 18, 22, 40, 25, 43, 48, 81, 29, 52, 57, 87, 62, 96, 102, 154, 34, 58, 65, 100, 69, 109, 113, 159, 76, 117, 126, 172, 134, 187, 198, 263, 11, 20, 27, 51, 31, 54, 60, 95, 36, 67, 59, 104, 73, 110, 122, 166, 42, 64, 75, 115, 84, 125, 132, 179, 91, 137, 144, 190, 153, 207, 215, 280, 49, 80, 89, 129, 99, 140, 147, 202, 106, 150, 156, 210, 169, 221, 232, 289, 119, 162, 175, 226, 182, 238, 2 43, 300, 193, 249, 256, 312, 269, 327, 347, 380, 7, 19, 30, 61, 38, 66, 79, 118, 44, 74, 86, 123, 94, 1 36, 143, 212, 50, 83, 90, 133, 105, 149, 168, 217, 111, 165, 157, 228, 183, 239, 251, 310, 55, 97, 1 08, 151, 114, 163, 171, 234, 127, 180, 188, 241, 200, 255, 261, 325, 139, 191, 205, 259, 214, 272, 276, 333, 224, 282, 293, 344, 302, 359, 369, 423, 71, 101, 121, 177, 130, 185, 196, 253, 146, 208, 195, 265, 219, 274, 286, 338, 160, 203, 223, 278, 236, 291, 298, 353, 247, 305, 314, 363, 322, 37 6, 387, 434, 174, 230, 245, 295, 257, 307, 317, 373, 267, 320, 330, 384, 341, 391, 400, 441, 284, 3 36, 350, 395, 356, 404, 408, 448, 366, 413, 418, 455, 429, 464, 474, 487, 8, 24, 37, 82, 47, 88, 103, 148, 56, 98, 112, 155, 120, 170, 176, 244, 63, 107, 116, 167, 135, 184, 201, 250, 142, 199, 189, 26 2, 216, 273, 285, 346, 70, 124, 138, 186, 145, 194, 204, 268, 158, 213, 222, 277, 233, 290, 299, 36 0, 173, 225, 237, 296, 246, 308, 313, 364, 260, 318, 329, 377, 339, 389, 398, 443, 93, 131, 152, 21 1, 164, 218, 229, 288, 178, 242, 227, 301, 252, 309, 324, 371, 192, 235, 258, 316, 271, 328, 335, 3 82, 283, 342, 349, 392, 358, 405, 411, 452, 206, 266, 279, 332, 294, 345, 352, 401, 304, 355, 361, 407, 374, 415, 422, 457, 321, 367, 379, 419, 385, 426, 430, 462, 394, 433, 438, 468, 446, 475, 48 2, 493, 77, 128, 161, 231, 181, 240, 264, 319, 197, 254, 275, 326, 287, 340, 348, 409, 209, 270, 28 1, 337, 303, 354, 372, 412, 311, 370, 362, 420, 386, 427, 435, 467, 220, 292, 306, 357, 315, 368, 3 75, 424, 331, 383, 390, 428, 399, 437, 442, 473, 343, 393, 403, 440, 410, 447, 450, 477, 417, 453, 459, 481, 463, 486, 490, 503, 248, 297, 323, 381, 334, 388, 397, 436, 351, 406, 396, 444, 414, 44 9, 456, 479, 365, 402, 416, 451, 425, 458, 461, 484, 432, 465, 469, 488, 472, 492, 495, 505, 378, 4 21, 431, 460, 439, 466, 470, 491, 445, 471, 476, 494, 480, 496, 498, 506, 454, 478, 483, 497, 485, 499, 500, 507, 489, 501, 502, 508, 504, 509, 510, 511]

TABLE Z13 with a sequence length of 512

| Polarized channel sequence number | Reliability or reliability sequence number |
|---|---|
| 0 | 0 |
| 1 | 1 |
| 2 | 2 |
| 3 | 9 |
| 4 | 3 |
| 5 | 10 |
| 6 | 13 |
| 7 | 26 |
| 8 | 4 |
| 9 | 12 |
| 10 | 15 |
| 11 | 28 |
| 12 | 17 |
| 13 | 33 |
| 14 | 35 |
| 15 | 68 |
| 16 | 5 |
| 17 | 14 |
| 18 | 16 |
| 19 | 32 |
| 20 | 21 |
| 21 | 39 |
| 22 | 46 |
| 23 | 72 |
| 24 | 23 |
| 25 | 45 |
| 26 | 41 |
| 27 | 78 |
| 28 | 53 |
| 29 | 85 |
| 30 | 92 |
| 31 | 141 |
| 32 | 6 |
| 33 | 18 |
| 34 | 22 |
| 35 | 40 |
| 36 | 25 |
| 37 | 43 |
| 38 | 48 |
| 39 | 81 |
| 40 | 29 |
| 41 | 52 |
| 42 | 57 |
| 43 | 87 |
| 44 | 62 |
| 45 | 96 |
| 46 | 102 |
| 47 | 154 |
| 48 | 34 |
| 49 | 58 |

TABLE Z13-continued with a sequence length of 512

| Polarized channel sequence number | Reliability or reliability sequence number |
|---|---|
| 50 | 65 |
| 51 | 100 |
| 52 | 69 |
| 53 | 109 |
| 54 | 113 |
| 55 | 159 |
| 56 | 76 |
| 57 | 117 |
| 58 | 126 |
| 59 | 172 |
| 60 | 134 |
| 61 | 187 |
| 62 | 198 |
| 63 | 263 |
| 64 | 11 |
| 65 | 20 |
| 66 | 27 |
| 67 | 51 |
| 68 | 31 |
| 69 | 54 |
| 70 | 60 |
| 71 | 95 |
| 72 | 36 |
| 73 | 67 |
| 74 | 59 |
| 75 | 104 |
| 76 | 73 |
| 77 | 110 |
| 78 | 122 |
| 79 | 166 |
| 80 | 42 |
| 81 | 64 |
| 82 | 75 |
| 83 | 115 |
| 84 | 84 |
| 85 | 125 |
| 86 | 132 |
| 87 | 179 |
| 88 | 91 |
| 89 | 137 |
| 90 | 144 |
| 91 | 190 |
| 92 | 153 |
| 93 | 207 |
| 94 | 215 |
| 95 | 280 |
| 96 | 49 |
| 97 | 80 |
| 98 | 89 |
| 99 | 129 |
| 100 | 99 |
| 101 | 140 |
| 102 | 147 |
| 103 | 202 |
| 104 | 106 |
| 105 | 150 |
| 106 | 156 |
| 107 | 210 |
| 108 | 169 |
| 109 | 221 |
| 110 | 232 |
| 111 | 289 |
| 112 | 119 |
| 113 | 162 |
| 114 | 175 |
| 115 | 226 |
| 116 | 182 |
| 117 | 238 |
| 118 | 243 |
| 119 | 300 |
| 120 | 193 |
| 121 | 249 |
| 122 | 256 |
| 123 | 312 |
| 124 | 269 |

TABLE Z13-continued with a sequence length of 512

| Polarized channel sequence number | Reliability or reliability sequence number |
|---|---|
| 125 | 327 |
| 126 | 347 |
| 127 | 380 |
| 128 | 7 |
| 129 | 19 |
| 130 | 30 |
| 131 | 61 |
| 132 | 38 |
| 133 | 66 |
| 134 | 79 |
| 135 | 118 |
| 136 | 44 |
| 137 | 74 |
| 138 | 86 |
| 139 | 123 |
| 140 | 94 |
| 141 | 136 |
| 142 | 143 |
| 143 | 212 |
| 144 | 50 |
| 145 | 83 |
| 146 | 90 |
| 147 | 133 |
| 148 | 105 |
| 149 | 149 |
| 150 | 168 |
| 151 | 217 |
| 152 | 111 |
| 153 | 165 |
| 154 | 157 |
| 155 | 228 |
| 156 | 183 |
| 157 | 239 |
| 158 | 251 |
| 159 | 310 |
| 160 | 55 |
| 161 | 97 |
| 162 | 108 |
| 163 | 151 |
| 164 | 114 |
| 165 | 163 |
| 166 | 171 |
| 167 | 234 |
| 168 | 127 |
| 169 | 180 |
| 170 | 188 |
| 171 | 241 |
| 172 | 200 |
| 173 | 255 |
| 174 | 261 |
| 175 | 325 |
| 176 | 139 |
| 177 | 191 |
| 178 | 205 |
| 179 | 259 |
| 180 | 214 |
| 181 | 272 |
| 182 | 276 |
| 183 | 333 |
| 184 | 224 |
| 185 | 282 |
| 186 | 293 |
| 187 | 344 |
| 188 | 302 |
| 189 | 359 |
| 190 | 369 |
| 191 | 423 |
| 192 | 71 |
| 193 | 101 |
| 194 | 121 |
| 195 | 177 |
| 196 | 130 |
| 197 | 185 |
| 198 | 196 |
| 199 | 253 |

TABLE Z13-continued with a sequence length of 512

| Polarized channel sequence number | Reliability or reliability sequence number |
|---|---|
| 200 | 146 |
| 201 | 208 |
| 202 | 195 |
| 203 | 265 |
| 204 | 219 |
| 205 | 274 |
| 206 | 286 |
| 207 | 338 |
| 208 | 160 |
| 209 | 203 |
| 210 | 223 |
| 211 | 278 |
| 212 | 236 |
| 213 | 291 |
| 214 | 298 |
| 215 | 353 |
| 216 | 247 |
| 217 | 305 |
| 218 | 314 |
| 219 | 363 |
| 220 | 322 |
| 221 | 376 |
| 222 | 387 |
| 223 | 434 |
| 224 | 174 |
| 225 | 230 |
| 226 | 245 |
| 227 | 295 |
| 228 | 257 |
| 229 | 307 |
| 230 | 317 |
| 231 | 373 |
| 232 | 267 |
| 233 | 320 |
| 234 | 330 |
| 235 | 384 |
| 236 | 341 |
| 237 | 391 |
| 238 | 400 |
| 239 | 441 |
| 240 | 284 |
| 241 | 336 |
| 242 | 350 |
| 243 | 395 |
| 244 | 356 |
| 245 | 404 |
| 246 | 408 |
| 247 | 448 |
| 248 | 366 |
| 249 | 413 |
| 250 | 418 |
| 251 | 455 |
| 252 | 429 |
| 253 | 464 |
| 254 | 474 |
| 255 | 487 |
| 256 | 8 |
| 257 | 24 |
| 258 | 37 |
| 259 | 82 |
| 260 | 47 |
| 261 | 88 |
| 262 | 103 |
| 263 | 148 |
| 264 | 56 |
| 265 | 98 |
| 266 | 112 |
| 267 | 155 |
| 268 | 120 |
| 269 | 170 |
| 270 | 176 |
| 271 | 244 |
| 272 | 63 |
| 273 | 107 |
| 274 | 116 |

TABLE Z13-continued

| with a sequence length of 512 | |
|---|---|
| Polarized channel sequence number | Reliability or reliability sequence number |
| 275 | 167 |
| 276 | 135 |
| 277 | 184 |
| 278 | 201 |
| 279 | 250 |
| 280 | 142 |
| 281 | 199 |
| 282 | 189 |
| 283 | 262 |
| 284 | 216 |
| 285 | 273 |
| 286 | 285 |
| 287 | 346 |
| 288 | 70 |
| 289 | 124 |
| 290 | 138 |
| 291 | 186 |
| 292 | 145 |
| 293 | 194 |
| 294 | 204 |
| 295 | 268 |
| 296 | 158 |
| 297 | 213 |
| 298 | 222 |
| 299 | 277 |
| 300 | 233 |
| 301 | 290 |
| 302 | 299 |
| 303 | 360 |
| 304 | 173 |
| 305 | 225 |
| 306 | 237 |
| 307 | 296 |
| 308 | 246 |
| 309 | 308 |
| 310 | 313 |
| 311 | 364 |
| 312 | 260 |
| 313 | 318 |
| 314 | 329 |
| 315 | 377 |
| 316 | 339 |
| 317 | 389 |
| 318 | 398 |
| 319 | 443 |
| 320 | 93 |
| 321 | 131 |
| 322 | 152 |
| 323 | 211 |
| 324 | 164 |
| 325 | 218 |
| 326 | 229 |
| 327 | 288 |
| 328 | 178 |
| 329 | 242 |
| 330 | 227 |
| 331 | 301 |
| 332 | 252 |
| 333 | 309 |
| 334 | 324 |
| 335 | 371 |
| 336 | 192 |
| 337 | 235 |
| 338 | 258 |
| 339 | 316 |
| 340 | 271 |
| 341 | 328 |
| 342 | 335 |
| 343 | 382 |
| 344 | 283 |
| 345 | 342 |
| 346 | 349 |
| 347 | 392 |
| 348 | 358 |
| 349 | 405 |

TABLE Z13-continued

| with a sequence length of 512 | |
|---|---|
| Polarized channel sequence number | Reliability or reliability sequence number |
| 350 | 411 |
| 351 | 452 |
| 352 | 206 |
| 353 | 266 |
| 354 | 279 |
| 355 | 332 |
| 356 | 294 |
| 357 | 345 |
| 358 | 352 |
| 359 | 401 |
| 360 | 304 |
| 361 | 355 |
| 362 | 361 |
| 363 | 407 |
| 364 | 374 |
| 365 | 415 |
| 366 | 422 |
| 367 | 457 |
| 368 | 321 |
| 369 | 367 |
| 370 | 379 |
| 371 | 419 |
| 372 | 385 |
| 373 | 426 |
| 374 | 430 |
| 375 | 462 |
| 376 | 394 |
| 377 | 433 |
| 378 | 438 |
| 379 | 468 |
| 380 | 446 |
| 381 | 475 |
| 382 | 482 |
| 383 | 493 |
| 384 | 77 |
| 385 | 128 |
| 386 | 161 |
| 387 | 231 |
| 388 | 181 |
| 389 | 240 |
| 390 | 264 |
| 391 | 319 |
| 392 | 197 |
| 393 | 254 |
| 394 | 275 |
| 395 | 326 |
| 396 | 287 |
| 397 | 340 |
| 398 | 348 |
| 399 | 409 |
| 400 | 209 |
| 401 | 270 |
| 402 | 281 |
| 403 | 337 |
| 404 | 303 |
| 405 | 354 |
| 406 | 372 |
| 407 | 412 |
| 408 | 311 |
| 409 | 370 |
| 410 | 362 |
| 411 | 420 |
| 412 | 386 |
| 413 | 427 |
| 414 | 435 |
| 415 | 467 |
| 416 | 220 |
| 417 | 292 |
| 418 | 306 |
| 419 | 357 |
| 420 | 315 |
| 421 | 368 |
| 422 | 375 |
| 423 | 424 |
| 424 | 331 |

TABLE Z13-continued

| with a sequence length of 512 | |
|---|---|
| Polarized channel sequence number | Reliability or reliability sequence number |
| 425 | 383 |
| 426 | 390 |
| 427 | 428 |
| 428 | 399 |
| 429 | 437 |
| 430 | 442 |
| 431 | 473 |
| 432 | 343 |
| 433 | 393 |
| 434 | 403 |
| 435 | 440 |
| 436 | 410 |
| 437 | 447 |
| 438 | 450 |
| 439 | 477 |
| 440 | 417 |
| 441 | 453 |
| 442 | 459 |
| 443 | 481 |
| 444 | 463 |
| 445 | 486 |
| 446 | 490 |
| 447 | 503 |
| 448 | 248 |
| 449 | 297 |
| 450 | 323 |
| 451 | 381 |
| 452 | 334 |
| 453 | 388 |
| 454 | 397 |
| 455 | 436 |
| 456 | 351 |
| 457 | 406 |
| 458 | 396 |
| 459 | 444 |
| 460 | 414 |
| 461 | 449 |
| 462 | 456 |
| 463 | 479 |
| 464 | 365 |
| 465 | 402 |
| 466 | 416 |
| 467 | 451 |
| 468 | 425 |
| 469 | 458 |
| 470 | 461 |
| 471 | 484 |
| 472 | 432 |
| 473 | 465 |
| 474 | 469 |
| 475 | 488 |
| 476 | 472 |
| 477 | 492 |
| 478 | 495 |
| 479 | 505 |
| 480 | 378 |
| 481 | 421 |
| 482 | 431 |
| 483 | 460 |
| 484 | 439 |
| 485 | 466 |
| 486 | 470 |
| 487 | 491 |
| 488 | 445 |
| 489 | 471 |
| 490 | 476 |
| 491 | 494 |
| 492 | 480 |
| 493 | 496 |
| 494 | 498 |
| 495 | 506 |
| 496 | 454 |
| 497 | 478 |
| 498 | 483 |
| 499 | 497 |
| 500 | 485 |
| 501 | 499 |
| 502 | 500 |
| 503 | 507 |
| 504 | 489 |
| 505 | 501 |
| 506 | 502 |
| 507 | 508 |
| 508 | 504 |
| 509 | 509 |
| 510 | 510 |
| 511 | 511 |

Sequence Z14, with a sequence length of 256:

[0, 1, 2, 8, 3, 9, 12, 24, 4, 11, 14, 26, 16, 31, 33, 62, 5, 13, 15, 30, 20, 36, 43, 65, 22, 42, 38, 70, 49, 76, 82, 119, 6, 17, 21, 37, 23, 40, 44, 73, 27, 48, 52, 78, 57, 85, 90, 128, 32, 53, 59, 88, 63, 95, 98, 131, 69, 101, 108, 140, 114, 149, 156, 192, 10, 19, 25, 47, 29, 50, 55, 84, 34, 61, 54, 91, 66, 96, 1 05, 136395868, 100, 75, 107, 112, 144, 81, 116, 121, 151, 12136, 39, 58, 68, 100, 75, 161, 166, 200, 45, 72, 79, 110, 8 7, 118, 123, 158, 93, 125, 129, 163, 138, 169, 175, 204, 103, 133, 142, 172, 146, 178, 181, 209, 15 3, 184, 188, 214, 195, 220, 227, 237, 7, 18, 28, 56, 35, 60, 71, 102, 41, 67, 77, 106, 83, 115, 120, 16 4, 46, 74, 80, 113, 92, 124, 137, 167, 97, 135, 130, 173, 147, 179, 185, 213, 51, 86, 94, 126, 99, 134, 139, 176, 109, 145, 150, 180, 157, 187, 191, 219, 117, 152, 160, 190, 165, 196, 198, 222, 171, 20 1, 206, 226, 210, 231, 234, 247, 64, 89, 104, 143, 111, 148, 155, 186, 122, 162, 154, 193, 168, 197, 203, 224, 132, 159, 170, 199, 177, 205, 208, 229, 183, 211, 215, 232, 218, 236, 239, 249, 141, 17 4, 182, 207, 189, 212, 216, 235, 194, 217, 221, 238, 225, 240, 242, 250, 202, 223, 228, 241, 230, 2 43, 244, 251, 233, 245, 246, 252, 248, 253, 254, 255]

TABLE Z14

| with a sequence length of 256: | |
|---|---|
| Polarized channel sequence number | Reliability or reliability sequence number |
| 0 | 0 |
| 1 | 1 |
| 2 | 2 |
| 3 | 8 |
| 4 | 3 |
| 5 | 9 |
| 6 | 12 |
| 7 | 24 |
| 8 | 4 |
| 9 | 11 |
| 10 | 14 |
| 11 | 26 |
| 12 | 16 |
| 13 | 31 |
| 14 | 33 |
| 15 | 62 |
| 16 | 5 |
| 17 | 13 |
| 18 | 15 |
| 19 | 30 |
| 20 | 20 |
| 21 | 36 |
| 22 | 43 |
| 23 | 65 |

TABLE Z14-continued

| with a sequence length of 256: | |
|---|---|
| Polarized channel sequence number | Reliability or reliability sequence number |
| 24 | 22 |
| 25 | 42 |
| 26 | 38 |
| 27 | 70 |
| 28 | 49 |
| 29 | 76 |
| 30 | 82 |
| 31 | 119 |
| 32 | 6 |
| 33 | 17 |
| 34 | 21 |
| 35 | 37 |
| 36 | 23 |
| 37 | 40 |
| 38 | 44 |
| 39 | 73 |
| 40 | 27 |
| 41 | 48 |
| 42 | 52 |
| 43 | 78 |
| 44 | 57 |
| 45 | 85 |
| 46 | 90 |
| 47 | 128 |
| 48 | 32 |
| 49 | 53 |
| 50 | 59 |
| 51 | 88 |
| 52 | 63 |
| 53 | 95 |
| 54 | 98 |
| 55 | 131 |
| 56 | 69 |
| 57 | 101 |
| 58 | 108 |
| 59 | 140 |
| 60 | 114 |
| 61 | 149 |
| 62 | 156 |
| 63 | 192 |
| 64 | 10 |
| 65 | 19 |
| 66 | 25 |
| 67 | 47 |
| 68 | 29 |
| 69 | 50 |
| 70 | 55 |
| 71 | 84 |
| 72 | 34 |
| 73 | 61 |
| 74 | 54 |
| 75 | 91 |
| 76 | 66 |
| 77 | 96 |
| 78 | 105 |
| 79 | 136 |
| 80 | 39 |
| 81 | 58 |
| 82 | 68 |
| 83 | 100 |
| 84 | 75 |
| 85 | 107 |
| 86 | 112 |
| 87 | 144 |
| 88 | 81 |
| 89 | 116 |
| 90 | 121 |
| 91 | 151 |
| 92 | 127 |
| 93 | 161 |
| 94 | 166 |
| 95 | 200 |
| 96 | 45 |
| 97 | 72 |
| 98 | 79 |
| 99 | 110 |
| 100 | 87 |
| 101 | 118 |
| 102 | 123 |
| 103 | 158 |
| 104 | 93 |
| 105 | 125 |
| 106 | 129 |
| 107 | 163 |
| 108 | 138 |
| 109 | 169 |
| 110 | 175 |
| 111 | 204 |
| 112 | 103 |
| 113 | 133 |
| 114 | 142 |
| 115 | 172 |
| 116 | 146 |
| 117 | 178 |
| 118 | 181 |
| 119 | 209 |
| 120 | 153 |
| 121 | 184 |
| 122 | 188 |
| 123 | 214 |
| 124 | 195 |
| 125 | 220 |
| 126 | 227 |
| 127 | 237 |
| 128 | 7 |
| 129 | 18 |
| 130 | 28 |
| 131 | 56 |
| 132 | 35 |
| 133 | 60 |
| 134 | 71 |
| 135 | 102 |
| 136 | 41 |
| 137 | 67 |
| 138 | 77 |
| 139 | 106 |
| 140 | 83 |
| 141 | 115 |
| 142 | 120 |
| 143 | 164 |
| 144 | 46 |
| 145 | 74 |
| 146 | 80 |
| 147 | 113 |
| 148 | 92 |
| 149 | 124 |
| 150 | 137 |
| 151 | 167 |
| 152 | 97 |
| 153 | 135 |
| 154 | 130 |
| 155 | 173 |
| 156 | 147 |
| 157 | 179 |
| 158 | 185 |
| 159 | 213 |
| 160 | 51 |
| 161 | 86 |
| 162 | 94 |
| 163 | 126 |
| 164 | 99 |
| 165 | 134 |
| 166 | 139 |
| 167 | 176 |
| 168 | 109 |
| 169 | 145 |
| 170 | 150 |
| 171 | 180 |
| 172 | 157 |
| 173 | 187 |

TABLE Z14-continued

| with a sequence length of 256: | |
|---|---|
| Polarized channel sequence number | Reliability or reliability sequence number |
| 174 | 191 |
| 175 | 219 |
| 176 | 117 |
| 177 | 152 |
| 178 | 160 |
| 179 | 190 |
| 180 | 165 |
| 181 | 196 |
| 182 | 198 |
| 183 | 222 |
| 184 | 171 |
| 185 | 201 |
| 186 | 206 |
| 187 | 226 |
| 188 | 210 |
| 189 | 231 |
| 190 | 234 |
| 191 | 247 |
| 192 | 64 |
| 193 | 89 |
| 194 | 104 |
| 195 | 143 |
| 196 | 111 |
| 197 | 148 |
| 198 | 155 |
| 199 | 186 |
| 200 | 122 |
| 201 | 162 |
| 202 | 154 |
| 203 | 193 |
| 204 | 168 |
| 205 | 197 |
| 206 | 203 |
| 207 | 224 |
| 208 | 132 |
| 209 | 159 |
| 210 | 170 |
| 211 | 199 |
| 212 | 177 |
| 213 | 205 |
| 214 | 208 |
| 215 | 229 |
| 216 | 183 |
| 217 | 211 |
| 218 | 215 |
| 219 | 232 |
| 220 | 218 |
| 221 | 236 |
| 222 | 239 |
| 223 | 249 |
| 224 | 141 |
| 225 | 174 |
| 226 | 182 |
| 227 | 207 |
| 228 | 189 |
| 229 | 212 |
| 230 | 216 |
| 231 | 235 |
| 232 | 194 |
| 233 | 217 |
| 234 | 221 |
| 235 | 238 |
| 236 | 225 |
| 237 | 240 |
| 238 | 242 |
| 239 | 250 |
| 240 | 202 |
| 241 | 223 |
| 242 | 228 |
| 243 | 241 |
| 244 | 230 |
| 245 | 243 |
| 246 | 244 |
| 247 | 251 |
| 248 | 233 |
| 249 | 245 |
| 250 | 246 |
| 251 | 252 |
| 252 | 248 |
| 253 | 253 |
| 254 | 254 |
| 255 | 255 |

Sequence Z15, with a sequence length of 128:
[0, 1, 2, 7, 3, 8, 11, 22, 4, 10, 13, 24, 15, 28, 30, 53, 5, 12, 14, 27, 18, 32, 38, 55, 20, 37, 34, 59, 43, 63, 67, 89, 6, 16, 19, 33, 21, 36, 39, 61, 25, 42, 45, 64, 49, 69, 72, 94, 29, 46, 51, 71, 54, 75, 77, 96, 58, 79, 83, 100, 86, 104, 107, 119, 9, 17, 23, 41, 26, 44, 48, 68, 31, 52, 47, 73, 56, 76, 81, 98, 35, 5 0, 57, 78, 62, 82, 85, 102, 66, 87, 90, 105, 93, 109, 111, 121, 40, 60, 65, 84, 70, 88, 91, 108, 74, 92, 9 5, 110, 99, 112, 114, 122, 80, 97, 101, 113, 103, 115, 116, 123, 106, 117, 118, 124, 120, 125, 126, 127]

TABLE Z15

| with a sequence length of 128: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 11 |
| 7 | 22 |
| 8 | 4 |
| 9 | 10 |
| 10 | 13 |
| 11 | 24 |
| 12 | 15 |
| 13 | 28 |
| 14 | 30 |
| 15 | 53 |
| 16 | 5 |
| 17 | 12 |
| 18 | 14 |
| 19 | 27 |
| 20 | 18 |
| 21 | 32 |
| 22 | 38 |
| 23 | 55 |
| 24 | 20 |
| 25 | 37 |
| 26 | 34 |
| 27 | 59 |
| 28 | 43 |
| 29 | 63 |
| 30 | 67 |
| 31 | 89 |
| 32 | 6 |
| 33 | 16 |
| 34 | 19 |
| 35 | 33 |
| 36 | 21 |
| 37 | 36 |
| 38 | 39 |
| 39 | 61 |
| 40 | 25 |
| 41 | 42 |

TABLE Z15-continued

| with a sequence length of 128: | |
|---|---|
| Polarized channel sequence number | Reliability or reliability sequence number |
| 42 | 45 |
| 43 | 64 |
| 44 | 49 |
| 45 | 69 |
| 46 | 72 |
| 47 | 94 |
| 48 | 29 |
| 49 | 46 |
| 50 | 51 |
| 51 | 71 |
| 52 | 54 |
| 53 | 75 |
| 54 | 77 |
| 55 | 96 |
| 56 | 58 |
| 57 | 79 |
| 58 | 83 |
| 59 | 100 |
| 60 | 86 |
| 61 | 104 |
| 62 | 107 |
| 63 | 119 |
| 64 | 9 |
| 65 | 17 |
| 66 | 23 |
| 67 | 41 |
| 68 | 26 |
| 69 | 44 |
| 70 | 48 |
| 71 | 68 |
| 72 | 31 |
| 73 | 52 |
| 74 | 47 |
| 75 | 73 |
| 76 | 56 |
| 77 | 76 |
| 78 | 81 |
| 79 | 98 |
| 80 | 35 |
| 81 | 50 |
| 82 | 57 |
| 83 | 78 |
| 84 | 62 |
| 85 | 82 |
| 86 | 85 |
| 87 | 102 |
| 88 | 66 |
| 89 | 87 |
| 90 | 90 |
| 91 | 105 |
| 92 | 93 |
| 93 | 109 |
| 94 | 111 |
| 95 | 121 |
| 96 | 40 |
| 97 | 60 |
| 98 | 65 |
| 99 | 84 |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |

TABLE Z15-continued

| with a sequence length of 128: | |
|---|---|
| Polarized channel sequence number | Reliability or reliability sequence number |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z16, with a sequence length of 64:
[0, 1, 2, 7, 3, 8, 10, 20, 4, 9, 12, 21, 14, 24, 26, 40, 5, 11, 13, 23, 16, 27, 32, 42, 18, 31, 29, 4 4, 35, 46, 48, 57, 6, 15, 17, 28, 19, 30, 33, 45, 22, 34, 36, 47, 38, 49, 51, 58, 25, 37, 39, 50, 41, 52, 53, 5 9, 43, 54, 55, 60, 56, 61, 62, 63]

TABLE Z16

| with a sequence length of 64: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 10 |
| 7 | 20 |
| 8 | 4 |
| 9 | 9 |
| 10 | 12 |
| 11 | 21 |
| 12 | 14 |
| 13 | 24 |
| 14 | 26 |
| 15 | 40 |
| 16 | 5 |
| 17 | 11 |
| 18 | 13 |
| 19 | 23 |
| 20 | 16 |
| 21 | 27 |
| 22 | 32 |
| 23 | 42 |
| 24 | 18 |
| 25 | 31 |
| 26 | 29 |
| 27 | 44 |
| 28 | 35 |
| 29 | 46 |
| 30 | 48 |
| 31 | 57 |
| 32 | 6 |
| 33 | 15 |
| 34 | 17 |
| 35 | 28 |
| 36 | 19 |
| 37 | 30 |
| 38 | 33 |
| 39 | 45 |

TABLE Z16-continued

| with a sequence length of 64: | |
|---|---|
| Polarized channel sequence number | Reliability or reliability sequence number |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 41 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Third group of sequences (obtained by expanding a sequence of a mother code length 256 based on a channel capacity):

Sequence Q17, with a sequence length of 8192:

[0, 1, 2, 4, 8, 16, 32, 3, 256, 512, 1024, 2048, 4096, 5, 64, 9, 6, 17, 10, 18, 128, 12, 33, 65, 20, 34, 24, 36, 257, 7, 129, 66, 11, 40, 68, 513, 130, 19, 13, 48, 14, 1025, 72, 258, 21, 132, 35, 2049, 26, 80, 37, 25, 22, 4097, 136, 514, 260, 38, 96, 67, 41, 144, 28, 69, 42, 264, 49, 74, 1026, 160, 516, 192, 70, 44, 272, 131, 81, 50, 73, 15, 133, 2050, 288, 520, 52, 23, 134, 76, 1028, 137, 82, 259, 56, 4 098, 27, 97, 528, 39, 261, 84, 138, 145, 29, 43, 320, 1032, 544, 98, 2052, 88, 140, 30, 265, 146, 71, 161, 515, 45, 262, 100, 51, 1040, 148, 46, 273, 768, 75, 104, 4100, 162, 266, 53, 2056, 193, 152, 5 17, 77, 1056, 274, 164, 54, 83, 384, 576, 57, 112, 135, 268, 78, 1027, 194, 521, 2064, 85, 289, 58, 168, 139, 4104, 321, 518, 99, 1280, 86, 276, 60, 89, 529, 196, 290, 141, 2080, 101, 280, 1536, 14 7, 522, 176, 142, 292, 31, 200, 530, 263, 1029, 4112, 90, 149, 385, 2051, 640, 102, 105, 163, 322, 92, 1088, 524, 47, 267, 208, 150, 545, 296, 153, 2304, 165, 1033, 324, 577, 4128, 106, 55, 386, 1 13, 154, 1030, 532, 275, 79, 108, 2560, 546, 269, 224, 166, 1041, 304, 536, 195, 59, 270, 169, 54 8, 4099, 1034, 328, 3072, 114, 156, 277, 769, 87, 197, 1042, 388, 519, 116, 291, 170, 2053, 61, 6 41, 1152, 282, 177, 4352, 91, 578, 336, 198, 293, 1036, 172, 523, 2112, 120, 281, 201, 552, 1057, 278, 62, 392, 580, 143, 4608, 103, 2057, 294, 1089, 642, 178, 352, 93, 531, 202, 1044, 323, 107, 2054, 525, 297, 180, 1058, 400, 5120, 560, 151, 209, 284, 526, 1048, 2065, 94, 325, 204, 584, 29 8, 155, 1060, 770, 305, 210, 2058, 6144, 109, 533, 1281, 330, 184, 416, 644, 115, 1031, 448, 206 6, 547, 167, 326, 225, 538, 1153, 4101, 300, 157, 592, 387, 2176, 110, 1090, 337, 549, 117, 212, 537, 1035, 306, 2060, 171, 4160, 329, 534, 226, 1064, 271, 648, 216, 389, 2081, 1092, 772, 158, 308, 550, 118, 1537, 4105, 279, 173, 2113, 608, 390, 121, 1154, 579, 332, 199, 553, 1043, 2068, 179, 228, 656, 4102, 393, 1037, 174, 540, 338, 2082, 122, 581, 1072, 312, 203, 283, 554, 1038, 4 113, 63, 2072, 353, 776, 181, 1096, 295, 561, 232, 340, 2084, 1282, 586, 394, 672, 4106, 124, 40 1, 1045, 2305, 704, 205, 285, 582, 1156, 182, 299, 556, 2055, 4114, 211, 1059, 354, 784, 185, 10 50, 344, 643, 2177, 240, 396, 1104, 593, 206, 4224, 286, 562, 2114, 1061, 95, 585, 402, 327, 104 9, 527, 2059, 213, 417, 4108, 1046, 645, 186, 800, 301, 2088, 1160, 227, 564, 356, 111, 1538, 53 5, 4129, 2116, 307, 646, 1284, 404, 214, 588, 302, 2561, 1062, 188, 649, 4161, 331, 1120, 594, 2 17, 2178, 360, 771, 1091, 418, 229, 568, 1065, 2067, 4116, 309, 539, 159, 1168, 449, 609, 2061, 408, 551, 1052, 119, 333, 4130, 773, 1093, 2096, 218, 596, 420, 1066, 230, 650, 2062, 310, 412 0, 1288, 657, 339, 541, 1073, 3073, 233, 313, 555, 1098, 368, 832, 4132, 175, 2120, 1184, 391, 6 10, 123, 1540, 600, 2306, 334, 450, 4353, 1216, 652, 220, 542, 2069, 1094, 341, 777, 183, 1068, 2180, 4103, 314, 658, 424, 1296, 583, 234, 2083, 673, 1155, 395, 557, 4225, 355, 1105, 2074, 1 25, 774, 342, 1074, 612, 316, 2128, 4162, 563, 1097, 241, 345, 660, 2085, 1039, 207, 558, 1157, 452, 4107, 785, 2073, 397, 1312, 587, 187, 357, 2070, 1544, 616, 4136, 403, 1076, 674, 236, 21 84, 778, 1047, 432, 565, 398, 4164, 2562, 1158, 705, 126, 1100, 664, 2308, 287, 456, 1161, 460 9, 589, 242, 1106, 2086, 786, 346, 676, 1283, 405, 2144, 4226, 566, 1080, 244, 595, 358, 2115, 1 051, 896, 361, 4115, 1121, 569, 2089, 189, 624, 1552, 419, 647, 2192, 1063, 4109, 348, 215, 78 0, 1285, 2076, 303, 590, 1108, 464, 4144, 706, 2117, 406, 1162, 597, 219, 1169, 2090, 801, 4110, 409, 1053, 570, 2312, 421, 680, 1067, 231, 651, 5121, 2097, 1344, 362, 833, 1568, 311, 2122, 6 11, 1122, 4168, 248, 598, 3074, 369, 1112, 788, 410, 1164, 2208, 4354, 572, 335, 1054, 601, 190, 2564, 1289, 708, 364, 4117, 1170, 2240, 802, 480, 221, 1095, 422, 2118, 4228, 653, 1185, 451, 613, 2092, 1539, 315, 792, 1069, 4131, 2320, 235, 659, 1286, 425, 688, 2179, 1124, 6145, 370, 654, 1075, 2129, 412, 804, 1172, 222, 4122, 2098, 543, 343, 1070, 712, 453, 2121, 1297, 775, 4 176, 237, 1792, 2063, 602, 372, 1099, 661, 2181, 4133, 426, 1128, 897, 317, 2336, 1186, 614, 2 43, 4121, 1290, 2568, 617, 675, 1077, 433, 1217, 2100, 4118, 834, 347, 1176, 604, 2071, 454, 1 541, 4232, 559, 238, 2182, 1101, 779, 428, 1298, 2124, 4610, 720, 376, 1188, 662, 3076, 457, 1 078, 808, 4356, 318, 2185, 1107, 665, 245, 2130, 1408, 4134, 677, 1600, 399, 2307, 836, 1081, 618, 359, 4192, 2104, 1136, 567, 434, 1159, 2075, 898, 4163, 127, 1292, 625, 2145, 349, 1102, 666, 1218, 4137, 2576, 458, 787, 1545, 2087, 591, 363, 4240, 1109, 620, 2309, 191, 1313, 781, 1082, 4124, 2132, 436, 736, 1192, 2186, 407, 678, 4165, 1163, 465, 2193, 1345, 816, 707, 1542, 4138, 2077, 350, 571, 1123, 2091, 246, 1110, 782, 4360, 460, 2368, 1300, 681, 840, 3080, 414 5, 1084, 411, 1113, 626, 2592, 466, 1553, 4170, 668, 2146, 365, 1220, 789, 1314, 2136, 5122, 2 49, 599, 1165, 2188, 709, 440, 1125, 4256, 900, 2078, 1304, 371, 628, 2313, 1171, 4612, 803, 1 546, 423, 2194, 682, 1200, 4288, 481, 2119, 573, 1166, 250, 2209, 1316, 4166, 794, 689, 1055, 2563, 413, 1224, 603, 4140, 2093, 366, 1554, 848, 2310, 1287, 4368, 710, 373, 1114, 2148, 805, 1173, 468, 4227, 2099, 684, 1409, 427, 3088, 1664, 4177, 632, 793, 2196, 1126, 252, 1129, 41 46, 2094, 713, 482, 1187, 790, 2321, 1346, 4169, 574, 472, 2816, 1116, 904, 1548, 4111, 2123, 4 14, 1071, 655, 2152, 615, 4229, 1291, 374, 2210, 1232, 806, 690, 6146, 2314, 1174, 223, 1569, 2101, 864, 429, 4384, 1320, 2241, 605, 1177, 714, 2200, 4616, 1189, 377, 835, 2565, 1348, 455, 4148, 1601, 2125, 619, 809, 1130, 3104, 4119, 435, 1079, 692, 2322, 1410, 912, 4230, 484, 22 12, 1137, 663, 1178, 2102, 4172, 430, 1556, 721, 2131, 796, 5124, 1299, 239, 2432, 1103, 606, 1132, 4233, 2624, 837, 378, 1570, 2105, 716, 4178, 1293, 459, 2160, 1248, 810, 1190, 4355, 21 83, 667, 319, 1328, 2316, 817, 4152, 1560, 722, 2126, 1219, 437, 4123, 3075, 621, 1083, 842, 2 242, 1294, 4193, 488, 1193, 2569, 696, 1572, 380, 4624, 2133, 928, 1352, 627, 2337, 4135, 113 8, 251, 2106, 1180, 960, 1301, 4357, 2216, 679, 461, 1793, 2187, 4180, 838, 1111, 2369, 737, 12 21, 438, 4234, 2566, 1412, 812, 669, 2147, 4241, 1543, 467, 1140, 3328, 899, 1315, 4125, 2134, 622, 1194, 441, 2324, 4139, 1085, 849, 1665, 2108, 629, 4416, 496, 2137, 1306, 724, 1201, 25 77, 5128, 462, 1115, 2244, 818, 1602, 4640, 683, 2338, 1360, 247, 1222, 4194, 2189, 841, 738, 2149, 1317, 6148, 351, 1196, 2328, 783, 1547, 3584, 4184, 728, 1144, 901, 2195, 1305, 4236, 4 69, 2570, 1225, 670, 1576, 4126, 2224, 820, 442, 2190, 1302, 4361, 630, 1086, 2340, 791, 1416, 4242, 2079, 483, 1604, 685, 2248, 4167, 1167, 902, 2578, 1127, 367, 4257, 1318, 2311, 633, 1 666, 3077, 4611, 844, 1202, 470, 2138, 1376, 4141, 711, 2197, 1117, 691, 444, 4358, 2433, 155 5, 740, 2688, 1226, 4196, 905, 2150, 1347, 473, 1131, 4147, 2153, 686, 1549, 2211, 850, 5136, 1321, 634, 2370, 1204, 253, 4244, 2140, 1424, 824, 3136, 1584, 4142, 715, 1175, 2572, 485, 43 69, 1233, 2095, 795, 1308, 2315, 4864, 575, 1550, 415, 2256, 1118, 4171, 865, 2198, 1349, 693, 2593, 4200, 1228, 807, 2344, 1608, 4258, 375, 1322, 2201, 744, 1179, 4362, 2213, 852, 1794, 3081, 474, 4149, 1329, 906, 2372, 1234, 6152, 636, 2625, 1133, 486, 2154, 4289, 1557, 913, 21 03, 1354, 717, 4248, 2434, 1208, 797, 1440, 4613, 2161, 489, 1668, 2202, 694, 4173, 1139, 307 8, 811, 1472, 5152, 2580, 431, 1571, 2323, 723, 4370, 1191, 866, 2127, 697, 4260, 379, 2156, 1 350, 856, 2594, 4150, 1249, 752, 2317, 1562, 4179, 476, 2272, 1324, 908, 2214, 4480, 1181, 71 8, 1616, 3089, 4672, 798, 1411, 2352, 254, 4153, 1134, 2584, 607, 1361, 2243, 4208, 914, 1573, 2107, 839, 4231, 1141, 2318, 439, 1236, 2217, 4364, 725, 1561, 2596, 929, 4174, 1330, 3082, 698, 1195, 5123, 2376, 490, 1353, 2162, 4290, 813, 1558, 739, 2204, 1250, 4617, 381, 2325, 12 95, 868, 6160, 2817, 1672, 623, 2135, 4181, 1240, 819, 2245, 1413, 4385, 497, 3090, 1796, 916, 2436, 4154, 1182, 726, 2567, 1332, 4264, 814, 2164, 1574, 463, 4235, 2339, 1142, 700, 2218, 4417, 1303, 843, 2109, 1197, 4614, 729, 2689, 1632, 443, 4195, 3200, 1414, 1145, 2330, 5376, 872, 2225, 1603, 930, 2139, 4182, 1356, 741, 2626, 1223, 4372, 492, 2384, 1577, 821, 4156, 22 46, 1203, 671, 2341, 4185, 1252, 961, 3084, 1680, 4625, 382, 2220, 1417, 920, 4292, 2571, 119 8, 631, 2168, 4386, 1564, 845, 2329, 1362, 4237, 498, 2249, 1146, 2600, 6176, 1605, 730, 3105, 1336, 4197, 932, 2326, 1227, 742, 4376, 2110, 1307, 822, 5632, 2440, 1578, 500, 2628, 4243, 1087, 851, 2191, 1377, 4618, 2151, 745, 1800, 2342, 4272, 1205, 825, 3137, 1319, 4238, 445, 2 690, 1585, 880, 4388, 2226, 1256, 687, 2400, 4127, 1364, 2141, 903, 4296, 1610, 2579, 471, 14 18, 4626, 2250, 1696, 635, 3092, 4359, 1148, 846, 2371, 1425, 5125, 2155, 962, 1728, 2573, 41 86, 732, 1229, 2345, 4245, 255, 1309, 2228, 1606, 4481, 3106, 853, 1206, 2448, 6147, 695, 132 3, 2608, 4736, 826, 1580, 2199, 475, 4198, 2257, 1235, 936, 2332, 4201, 1378, 1808, 2574, 746, 4259, 1209, 3096, 907, 4418, 2142, 1368, 867, 2373, 4188, 1667, 487, 2252, 5184, 1264, 2632, 1420, 637, 4620, 2346, 1617, 854, 2203, 4143, 1230, 3108, 828, 4363, 1310, 2818, 753, 1586, 4304, 2353, 1119, 2258, 504, 4246, 1609, 2157, 857, 4641, 1426, 2581, 719, 3329, 4392, 1351, 1551, 2378, 4249, 964, 1237, 2232, 909, 6400, 2464, 1441, 446, 4261, 2692, 1669, 699, 2163, 5 129, 1210, 3079, 1824, 4420, 869, 2496, 1325, 915, 4673, 2595, 1251, 2215, 4202, 477, 1588, 2 374, 1380, 4151, 2273, 748, 1135, 4482, 2586, 944, 1559, 3201, 4209, 910, 2348, 1331, 4250, 1 670, 2205, 638, 5126, 2640, 1428, 799, 2435, 4628, 1238, 1612, 2158, 4371, 491, 3138, 1326, 9 68, 4175, 2385, 1212, 2597, 4204, 754, 1673, 2165, 6656, 1355, 858, 2260, 1618, 4642, 2585, 9 17, 1241, 4365, 3083, 478, 2354, 4320, 1384, 1795, 2219, 756, 4262, 2377, 1442, 870, 5137, 25 82, 1253, 2274, 4400, 1592, 873, 3112, 1333, 4632, 2319, 701, 1563, 4291, 2696, 1183, 2264, 4 155, 493, 1473, 2437, 931, 4366, 3140, 1633, 860, 4265, 2820, 1432, 2206, 4644, 1575, 727, 23 56, 5130, 1143, 2598, 815, 4424, 1357, 2166, 1797, 3585, 7168, 976, 1242, 2327, 4210, 499, 22 21, 1620, 4252, 1444, 2656, 918, 4373, 2438, 1254, 731, 2169, 4865, 1674, 3202, 1334, 4183, 9 21, 2627, 1681, 4293, 2380, 933, 1363, 5138, 2247, 1565, 2601, 4484, 743, 1257, 3091, 4615, 4 94, 2227, 1337, 4212, 2276, 1579, 874, 2704, 4387, 1392, 2441, 823, 4266, 1856, 3085, 1199, 6 149, 2222, 760, 1415, 4157, 2588, 1634, 2386, 4737, 881, 2170, 1147, 5248, 501, 2629, 1624, 4 378, 3120, 1358, 922, 4273, 2360, 1474, 2251, 4187, 847, 2331, 1676, 4674, 1244, 2602, 702, 4 432, 3086, 1566, 876, 4294, 2111, 1365, 2401, 4389, 1801, 2824, 992, 5132, 1207, 2229, 1338, 4268, 3144, 733, 1682, 2343, 4619, 383, 2609, 6208, 1448, 2280, 1607, 4216, 934, 2388, 1258, 4377, 3330, 1697, 2634, 4297, 963, 1419, 2442, 4648, 827, 2720, 1581, 5153, 2172, 1379, 747, 4374, 2449, 1149, 3093, 4158, 1798, 2752, 937, 4488, 1366, 2253, 447, 4676, 2333, 1636, 263 0, 4239, 1340, 882, 3204, 4199, 1587, 2230, 1265, 6153, 2347, 924, 1369, 4390, 2604, 734, 225 9, 5185, 1684, 3107, 1231, 4738, 855, 2402, 4274, 1582, 2832, 1476, 4448, 2233, 965, 3098, 41 89, 1809, 749, 2392, 4627, 1421, 2691, 1611, 4298, 2288, 502, 1211, 5140, 2444, 1381, 3152, 4 419, 884, 2641, 4203, 1640, 2254, 1427, 6150, 938, 2334, 1698, 4621, 2610, 1260, 3109, 4393, 829, 1802, 2143, 4276, 755, 2633, 5154, 1456, 2450, 1589, 4496, 2375, 945, 1422, 4656, 3097, 1729, 2575, 4247, 859, 2261, 1150, 4305, 2465, 1688, 4380, 505, 3094, 1311, 4622, 2693, 148 0, 2234, 5144, 966, 2848, 1613, 6161, 750, 2349, 4190, 1266, 3208, 1810, 4421, 2275, 940, 261 2, 4300, 1370, 2404, 4680, 1700, 888, 2159, 4394, 1429, 3586, 1590, 4251, 2583, 969, 2355, 51 56, 1268, 1619, 4866, 2694, 830, 3332, 4401, 1382, 2452, 1920, 4306, 2262, 506, 6154, 2636, 1 385, 1593, 4205, 2350, 757, 3110, 4629, 1213, 2236, 5377, 1648, 2697, 911, 4426, 2379, 1443, 3168, 4280, 1671, 871, 4512, 2642, 1372, 2265, 4740, 946, 2408, 4211, 1239, 2819, 1804, 512 7, 3139, 639, 2466, 4544, 1327, 1614, 6162, 2277, 861, 2616, 4643, 1488, 3113, 4263, 1730, 23 57, 970, 4422, 2587, 1430, 2207, 4321, 1621, 508, 4634, 3216, 1243, 2497, 5249, 1825, 2657, 4 396, 875, 2456, 1433, 4253, 2599, 1594, 3100, 4688, 703, 2167, 4483, 1445, 1704, 2381, 6272, 1255, 2821, 4206, 948, 3141, 1675, 5186, 2266, 1386, 4433, 2644, 919, 2468, 4645, 1857, 311 4, 4213, 1335, 2278, 977, 4308, 1635, 2698, 4633, 1272, 2358, 862, 5131, 3336, 1622, 4402, 27 05, 1393, 2387, 6156, 758, 2589, 4267, 1812, 3121, 1434, 4425, 2281, 479, 4630, 2361, 1596, 2 603, 4322, 1359, 972, 5160, 3146, 1625, 2416, 4367, 1214, 2880, 4744, 923, 2223, 1732, 4312, 3232, 1388, 4485, 2439, 978, 6177, 2658, 1826, 2171, 5188, 1504, 3588, 4868, 1245, 2648, 87 7, 4254, 2382, 1446, 4404, 2498, 1677, 761, 4646, 3264, 1475, 4214, 2700, 1637, 5633, 2268, 9 52, 2590, 4375, 1339, 3142, 4269, 1816, 2389, 883, 6209, 2825, 1259, 4704, 2231, 1683, 4486, 3116, 935, 2362, 4217, 1449, 2706, 5250, 1712, 2472, 1394, 4675, 3344, 495, 4428, 2631, 167 8, 4295, 2282, 1436, 2721, 4649, 993, 3203, 5139, 1828, 2443, 6164, 1246, 2605, 762, 4275, 24 03, 1567, 4324, 3153, 1367, 4752, 2173, 925, 2822, 4489, 1736, 2390, 5133, 1477, 3122, 4270, 1799, 2660, 878, 4636, 2364, 1261, 4434, 2611, 1626, 6178, 3145, 885, 2289, 4218, 1396, 239 3, 4677, 1685, 2708, 5168, 1450, 3087, 4408, 980, 2255, 1921, 4299, 2606, 1341, 4379, 3205, 9 39, 4650, 2500, 1638, 2833, 5134, 1267, 2445, 4159, 764, 3360, 6168, 1641, 2635, 4449, 1699, 2235, 1457, 4872, 2405, 507, 4277, 3592, 1858, 5192, 2664, 1371, 4391, 2451, 994, 3124, 465 7, 1628, 2722, 4328, 1478, 2284, 4436, 1583, 2826, 6180, 984, 3095, 5378, 1262, 2480, 1803, 4 682, 2613, 926, 4490, 2446, 1452, 4768, 3206, 1744, 4220, 2753, 1400, 2174, 4497, 886, 3148, 5141, 1686, 2712, 6401, 1481, 2335, 4800, 735, 2504, 4301, 1832, 3209, 4381, 1342, 2637, 16 89, 4678, 2290, 941, 5252, 1269, 1701, 4278, 3154, 889, 4395, 2834, 1423, 4652, 2394, 1860, 6 151, 2724, 1642, 3331, 4307, 967, 2453, 5155, 1383, 2614, 4450, 1591, 3128, 4880, 947, 2292, 4281, 1458, 2643, 5146, 1922, 2406, 4440, 1151, 3099, 996, 4739, 2944, 1649, 6273, 2409, 13 73, 4336, 3169, 1690, 4492, 2617, 503, 5200, 2237, 1482, 4689, 2672, 1811, 4302, 3600, 942, 4 382, 2467, 1615, 4658, 2695, 1387, 3111, 6210, 1644, 2396, 5157, 751, 2263, 4191, 1215, 282 8, 4681, 1805, 3333, 4498, 1460, 2351, 4423, 890, 2638, 5145, 1760, 3156, 4623, 1431, 2512, 6 155, 1702, 2754, 4309, 971, 2454, 4513, 1489, 3210, 5142, 1840, 2645, 4741, 831, 2267, 1731, 4282, 3217, 1374, 4896, 2849, 1595, 4397, 2457, 949, 6184, 3101, 1270, 5256, 2618, 1806, 43 23, 2469, 1484, 4660, 2728, 1000, 4452, 3115, 1705, 4207, 2279, 1864, 5634, 2699, 1435, 463 1, 3392, 892, 6212, 2410, 1650, 4403, 2881, 1490, 4742, 3616, 1692, 5380, 2359, 763, 4500, 26 59, 1389, 4310, 3170, 1813, 4684, 2296, 1273, 4398, 2646, 973, 6657, 2417, 1623, 5158, 3160, 1733, 4284, 2836, 1464, 4745, 2458, 950, 4427, 3212, 1924, 5216, 2620, 1395, 4690, 2383, 16 52, 4313, 3102, 509, 6274, 2649, 2238, 4456, 1827, 4867, 3337, 1447, 5187, 2756, 1706, 4514, 2412, 979, 4325, 3218, 1505, 4664, 2850, 1597, 5161, 2528, 1274, 6163, 2269, 953, 4405, 314 3, 1818, 4635, 2470, 1713, 4255, 2701, 1437, 5264, 3233, 1008, 4545, 2499, 1627, 4705, 2661, 3587, 6157, 1390, 2363, 4504, 1872, 4647, 2840, 974, 5148, 3117, 1734, 4215, 2283, 1397, 44 29, 2707, 1829, 4869, 3334, 759, 5189, 2473, 1492, 6192, 2736, 1708, 4314, 3172, 1451, 4692, 2418, 4516, 2702, 863, 5162, 3123, 1656, 4326, 2460, 1817, 4746, 2852, 1276, 6158, 3220, 98 1, 4406, 2270, 1737, 5384, 2591, 1506, 4753, 2391, 4435, 1814, 3118, 4637, 2760, 1598, 5169, 2501, 954, 7169, 3345, 1496, 4329, 2823, 1928, 4409, 2285, 4651, 1438, 3840, 5194, 995, 265 0, 4464, 1679, 2420, 4928, 3147, 1639, 4271, 2709, 1398, 6216, 2474, 5280, 879, 3176, 4487, 1 830, 2945, 4706, 1714, 2365, 4219, 1247, 3234, 5636, 2662, 982, 4696, 2291, 6402, 1888, 333 8, 4430, 1453, 2665, 4546, 1629, 2723, 5312, 1738, 3125, 4748, 956, 4316, 2481, 3265, 4638, 1 401, 2882, 6165, 1859, 2395, 5190, 1479, 3224, 4437, 985, 4873, 2652, 1643, 4279, 2502, 183 3, 5164, 3589, 2607, 6276, 1459, 4410, 2286, 1716, 4754, 3149, 510, 4520, 2827, 1936, 5392, 2 476, 4679, 3346, 1508, 4330, 2768, 1687, 6179, 2424, 765, 4769, 3236, 5251, 1454, 2710, 449 1, 1745, 2505, 4653, 3126, 1820, 4451, 2856, 5201, 1263, 2366, 6170, 997, 3155, 4221, 1630, 2 713, 4870, 1861, 4438, 2293, 3456, 5170, 1402, 2725, 4708, 1740, 3648, 4412, 927, 6224, 244 7, 1483, 4659, 2884, 3129, 5193, 1834, 4337, 2666, 1691, 4441, 2407, 887, 4756, 3184, 1343, 6 181, 2615, 5135, 2482, 1841, 4303, 3207, 1746, 4654, 2946, 5253, 1461, 2175, 4548, 986, 334 0, 4881, 2673, 6169, 1645, 2397, 4493, 1866, 3150, 5408, 1512, 4683, 2714, 3266, 4283, 1720, 2506, 4453, 998, 6166, 2835, 1404, 5640, 3593, 1952, 4712, 2639, 2411, 4499, 1651, 5172, 31 57, 1275, 4770, 2668, 4332, 1001, 2239, 6280, 3361, 1984, 4874, 2829, 5143, 1703, 3130, 452 8, 1485, 2484, 4661, 1862, 4494, 2784, 3240, 6658, 943, 2455, 5254, 1761, 4801, 2726, 1462, 4 222, 3211, 2513, 5196, 1836, 4760, 3393, 891, 6404, 2864, 1693, 4383, 2755, 4552, 3590, 149 1, 5257, 2398, 4685, 1923, 2619, 4338, 1646, 3171, 5202, 2294, 6182, 988, 3158, 4882, 1465, 4 442, 2830, 1873, 4772, 2508, 3348, 5379, 1653, 4501, 2729, 1520, 6240, 2888, 4662, 1748, 31 32, 5176, 2459, 766, 4340, 3161, 4691, 1486, 2674, 4454, 1842, 6211, 2514, 3601, 5147, 1707, 2716, 4992, 1271, 4457, 2413, 3268, 5217, 951, 4665, 2837, 1865, 6185, 3362, 1762, 4285, 22 97, 4720, 2647, 1375, 5648, 3213, 4515, 1807, 2757, 4743, 1002, 6288, 2488, 3173, 5159, 175 2, 2948, 4444, 1925, 4311, 3352, 2419, 4876, 1493, 5381, 2676, 1694, 6172, 3219, 4399, 893, 2 851, 4686, 3594, 5204, 1844, 2471, 4560, 1466, 4802, 2730, 3248, 6213, 1654, 2529, 4502, 18 15, 5258, 2621, 1507, 4693, 3214, 4315, 2298, 1009, 5265, 3364, 6186, 1709, 2842, 4897, 273 7, 4505, 1926, 3103, 5149, 1391, 4666, 2461, 3272, 6408, 1657, 4517, 2651, 975, 4776, 2414, 5 163, 1868, 3602, 4327, 2896, 4747, 1494, 3335, 6193, 1735, 5440, 2758, 2421, 4458, 1715, 49 29, 3162, 955, 5664, 2853, 4407, 3221, 1468, 6218, 2516, 4707, 1764, 2732, 5218, 3457, 4344, 1929, 2475, 4694, 1497, 7170, 3712, 2680, 4465, 1710, 5208, 2841, 511, 4884, 3174, 4506, 23 00, 1874, 5260, 3177, 6304, 1658, 2761, 4668, 2530, 4431, 1277, 3235, 5150, 1848, 4697, 283 8, 3394, 4286, 1739, 6660, 2622, 1004, 5385, 2520, 4804, 3164, 4460, 1509, 2952, 5266, 1819, 6336, 3596, 2462, 4898, 1599, 4576, 3119, 1439, 4317, 2703, 5191, 2663, 1889, 4518, 3339, 6 214, 894, 4749, 2422, 3280, 5281, 1717, 4547, 2854, 1831, 4709, 2738, 6188, 3222, 1399, 563 5, 2271, 4411, 1768, 3617, 4888, 2912, 5165, 1010, 6416, 2477, 1876, 4331, 3368, 4755, 2653, 1498, 5382, 3225, 4521, 2762, 4784, 1930, 3237, 6275, 1660, 5220, 2425, 2883, 4466, 1510, 4 750, 3396, 1012, 5171, 2503, 6225, 3649, 4508, 1937, 2667, 4900, 1741, 5268, 2857, 3178, 43 18, 1821, 6194, 2483, 4639, 3127, 1513, 4439, 2740, 5166, 1718, 3458, 4808, 2960, 4549, 957, 6217, 2532, 1835, 5393, 3185, 4871, 2711, 4333, 1455, 3226, 5888, 2478, 6159, 1747, 3604, 4 698, 1890, 4468, 2769, 5195, 2844, 1721, 4757, 3347, 6277, 1403, 2287, 4522, 3151, 5224, 98 3, 4993, 2654, 3180, 4413, 1880, 6432, 2885, 5282, 1776, 2426, 4710, 3618, 4339, 1500, 5386, 2764, 3341, 6664, 1932, 4713, 2507, 4771, 1742, 3296, 5173, 2858, 4529, 767, 3238, 5313, 27 15, 6196, 1822, 4930, 2367, 1278, 4443, 3376, 5272, 2865, 4700, 1631, 3608, 6167, 2770, 455 0, 1938, 5637, 3267, 1863, 4655, 2485, 4334, 2669, 6278, 987, 3131, 5197, 2890, 4875, 1463, 4 524, 3342, 1749, 5394, 2536, 6220, 3241, 4816, 1953, 2744, 4472, 3620, 5284, 1722, 4758, 24 28, 7172, 1514, 2976, 4553, 3400, 5174, 1837, 4904, 2675, 3186, 4414, 999, 6281, 2299, 5203, 1763, 3228, 4761, 3008, 4341, 1405, 6226, 3349, 2727, 5504, 1892, 4773, 2509, 5696, 3841, 4 495, 1647, 2886, 6403, 1843, 4932, 3159, 5177, 2785, 1521, 4714, 3269, 4455, 2486, 6200, 10 16, 3460, 5232, 2860, 4663, 1940, 4530, 2717, 5255, 1750, 3591, 6171, 2515, 4994, 1838, 422 3, 3188, 5388, 2947, 1487, 4721, 3363, 6241, 2670, 4445, 1724, 3242, 5198, 2489, 4762, 958, 5 314, 3133, 6672, 1867, 2897, 4554, 3713, 4883, 1753, 5641, 2677, 6183, 2544, 1467, 4687, 33 54, 4459, 2772, 5205, 1896, 4716, 3249, 1954, 6405, 2510, 4287, 3163, 5409, 1765, 4877, 286 6, 3650, 5178, 1516, 6228, 2731, 4532, 3408, 4832, 989, 2295, 5288, 3270, 6282, 1845, 4503, 2 889, 4774, 2786, 1695, 5259, 3365, 4561, 1985, 6289, 2399, 5441, 3244, 1406, 4912, 2831, 48 03, 3595, 5638, 1944, 6173, 2776, 4446, 3192, 1655, 4667, 2949, 5219, 3353, 6187, 1003, 434 2, 2517, 3273, 5206, 1869, 4878, 2718, 4556, 3624, 6464, 1522, 5396, 2868, 1754, 4777, 2490, 4936, 3350, 7176, 1956, 5180, 2678, 3134, 4507, 1766, 5209, 2839, 4722, 3464, 6688, 1846, 4 562, 2531, 3652, 5649, 990, 4764, 2733, 6242, 3215, 4461, 1524, 5316, 2950, 3175, 4885, 187 5, 5410, 2415, 6232, 3366, 4345, 1769, 4695, 2681, 5261, 3714, 1849, 6284, 2892, 4805, 3250, 4536, 1469, 5221, 2518, 4996, 3424, 1904, 6174, 2759, 5400, 3165, 4467, 1711, 4724, 2739, 6 409, 1005, 5267, 2492, 3603, 4899, 1927, 5642, 2788, 4519, 3274, 6290, 1495, 4778, 2953, 52 96, 3395, 1659, 4577, 2521, 6215, 3179, 4669, 1870, 5262, 2734, 4346, 3597, 6305, 1986, 289 8, 5412, 3369, 4890, 1756, 4785, 2682, 5151, 3252, 6659, 1279, 4509, 2301, 3472, 5320, 1011, 4699, 2872, 6189, 3632, 4462, 1877, 5650, 2763, 4944, 3223, 6406, 1719, 2533, 5383, 3281, 4 806, 1850, 4469, 2843, 5210, 3356, 6244, 1499, 4901, 2623, 5269, 3598, 1960, 4564, 2463, 61 95, 3166, 4780, 2913, 5505, 1770, 4523, 3397, 7184, 2741, 5760, 1931, 4728, 3276, 2855, 488 9, 1006, 6292, 3656, 5222, 2423, 4348, 1891, 5225, 3370, 6190, 2792, 4809, 1511, 4578, 3227, 5283, 2900, 1661, 4886, 3842, 6417, 2522, 5442, 1878, 4670, 3377, 4568, 2954, 6912, 1852, 5 212, 3282, 5000, 2684, 5644, 1777, 3181, 6219, 2534, 4510, 1528, 5167, 3605, 4751, 2961, 62 48, 1013, 4711, 3402, 5387, 2765, 4470, 1881, 6306, 3256, 5328, 2845, 3488, 4902, 1743, 478 6, 2537, 6410, 3716, 5270, 1988, 4319, 2742, 5665, 3187, 6197, 1933, 4960, 2859, 4525, 3520, 5416, 1470, 6337, 2479, 4701, 3619, 1723, 5273, 2771, 4810, 3239, 6296, 1893, 5285, 2914, 4 473, 2745, 4931, 2427, 6661, 1939, 5444, 3398, 4551, 2904, 5697, 895, 6221, 3297, 4715, 280 0, 4905, 1501, 3610, 5226, 2524, 7200, 1772, 4531, 3372, 5175, 2956, 4788, 1968, 6418, 3229, 5506, 2766, 5008, 3664, 4580, 1934, 6308, 2846, 5233, 3459, 4759, 1662, 5274, 2302, 6198, 3 182, 4526, 1823, 5652, 2655, 4817, 3409, 6227, 1515, 4892, 2962, 3621, 5395, 1992, 4335, 28 87, 6528, 3189, 5199, 2487, 4702, 959, 5228, 3284, 6720, 2773, 4933, 1778, 4474, 3609, 5666, 2977, 6201, 1882, 4812, 3378, 5389, 2746, 4555, 3243, 6256, 1941, 5344, 2538, 4906, 3401, 5 286, 1502, 6279, 2861, 4763, 3606, 4415, 1780, 5424, 2787, 6412, 3298, 4913, 1894, 5656, 24 29, 4818, 3343, 6222, 2916, 5315, 1897, 4533, 3720, 7171, 2671, 4717, 1725, 5179, 3288, 493 8, 2867, 6338, 1014, 5390, 3461, 4584, 2545, 5289, 3844, 6665, 1517, 4792, 2964, 5668, 3230, 4476, 1955, 6229, 2774, 5024, 3380, 5448, 2862, 1884, 4723, 6433, 3622, 5234, 2511, 4347, 1 751, 6202, 3190, 5276, 2748, 5056, 1839, 5397, 3351, 6312, 2891, 4775, 3245, 4557, 2000, 58 89, 2777, 6283, 3680, 4934, 1523, 5207, 2491, 6465, 3462, 4833, 1942, 5317, 3193, 4534, 292 0, 6662, 3651, 5508, 1755, 4908, 2978, 4765, 3404, 6243, 1017, 5639, 2789, 4563, 3271, 5236, 2540, 7424, 1945, 4995, 3625, 5411, 2869, 6230, 1957, 4718, 3251, 5290, 2719, 4537, 3300, 6 420, 1767, 5181, 3009, 4945, 3728, 5761, 1518, 6204, 2430, 4725, 3465, 4592, 2968, 6233, 18 98, 5402, 3246, 4820, 2679, 5297, 1847, 6673, 4558, 3612, 5211, 2893, 6340, 3410, 4914, 178 4, 5698, 2546, 4779, 3194, 6434, 1905, 5456, 3653, 4343, 2778, 5318, 3384, 6285, 1525, 4937, 2980, 4834, 3275, 6245, 1018, 5413, 2790, 4447, 3355, 5292, 2870, 6424, 1946, 4879, 3626, 2 548, 1871, 5643, 3135, 7680, 2899, 4824, 3425, 5240, 1726, 4997, 2793, 6291, 3848, 5401, 19 00, 4565, 3253, 6666, 2873, 5321, 3367, 4766, 2016, 5672, 2493, 6320, 3633, 4916, 2928, 453 8, 1757, 6286, 3304, 5398, 2735, 4726, 1407, 3412, 5182, 2951, 6436, 3658, 4887, 1958, 5512, 2519, 6175, 3466, 4579, 1987, 5700, 3744, 4781, 2683, 6344, 3196, 5263, 1851, 4998, 2894, 6 674, 3473, 5223, 3010, 4463, 1020, 5414, 3776, 6407, 2780, 4729, 1771, 5762, 3277, 7173, 23 03, 4940, 3357, 5298, 1961, 4566, 3654, 6234, 2901, 5472, 3254, 4807, 1471, 6293, 2743, 521 3, 3371, 4787, 2874, 4540, 1906, 6529, 3628, 5651, 2523, 4836, 1948, 6784, 3283, 5322, 2984, 5001, 3426, 6246, 1758, 5443, 3856, 4569, 2794, 5227, 3257, 6249, 1879, 4782, 2955, 5645, 3 416, 6307, 2915, 4946, 1989, 5417, 3715, 4730, 2535, 6466, 1773, 5300, 3312, 4349, 3468, 62 36, 2685, 5520, 1526, 4920, 3665, 7232, 2902, 5680, 3278, 4811, 991, 5271, 2876, 6668, 3358, 4581, 2801, 5329, 1908, 6191, 3634, 4891, 3167, 5404, 1962, 6411, 2552, 4671, 3657, 5646, 2 905, 4511, 1853, 6352, 3474, 5214, 2767, 4961, 3399, 6294, 1779, 5445, 3599, 4789, 3012, 66 89, 3285, 5324, 1969, 4903, 2957, 6440, 3489, 5704, 2494, 4471, 1883, 5418, 3717, 6297, 274 7, 4840, 3258, 5275, 1529, 6309, 3872, 4948, 2917, 5890, 3373, 7177, 1990, 4570, 2963, 5425, 3299, 5002, 2525, 6468, 5330, 1774, 4732, 3636, 6721, 3428, 5229, 2796, 4582, 1964, 6250, 3 183, 5653, 2992, 5009, 3607, 6199, 1912, 5450, 2958, 4813, 3379, 6530, 3718, 5304, 1993, 48 93, 2686, 5536, 3476, 6257, 2847, 4585, 1007, 5764, 3286, 6298, 4790, 3660, 5235, 2539, 717 4, 1854, 4907, 3374, 5568, 3016, 6676, 3260, 4527, 1530, 5667, 2802, 6419, 3721, 4819, 3403, 5287, 1781, 4962, 2906, 6223, 3666, 4793, 2965, 4475, 6252, 1935, 5446, 3289, 4952, 2526, 6 690, 3432, 5345, 1895, 4848, 3843, 6413, 2804, 5658, 3490, 4572, 1970, 6368, 2918, 5420, 33 01, 5004, 3640, 6310, 5277, 1663, 4814, 2921, 5712, 3381, 7185, 2749, 4894, 1885, 5507, 361 1, 6448, 3231, 4350, 2541, 5230, 1994, 6680, 3521, 4703, 5457, 2979, 6339, 3681, 5010, 1532, 5669, 2908, 6203, 3480, 4935, 3623, 5237, 1899, 6414, 2775, 4535, 3191, 5332, 6313, 2863, 4 821, 3405, 5657, 1727, 6692, 3845, 5025, 3024, 5426, 3290, 7178, 1019, 4794, 2547, 5291, 36 68, 6472, 4586, 3492, 5449, 1972, 6258, 2966, 4909, 3302, 5654, 2779, 4835, 1943, 6300, 372 2, 5346, 4477, 3382, 6421, 2969, 5391, 3729, 4964, 2001, 6913, 2981, 5768, 3411, 4719, 3613, 6231, 1886, 5336, 4915, 2791, 6341, 3305, 5509, 2542, 4593, 1782, 7186, 3385, 5892, 3627, 5 012, 2922, 6532, 5278, 1503, 4822, 3440, 6663, 2871, 5428, 3904, 4910, 3247, 6260, 1996, 56 70, 4559, 2808, 6435, 3463, 5238, 3682, 4796, 1947, 6314, 2929, 5399, 3195, 4939, 6205, 254 9, 5293, 2002, 4825, 3672, 6785, 3406, 5728, 2970, 4539, 3522, 7296, 5510, 1901, 5241, 2895, 6426, 3724, 4968, 3292, 6321, 1785, 5699, 2750, 5026, 6235, 3614, 5452, 2924, 4837, 3413, 6

722, 1976, 5319, 3849, 4588, 6480, 3040, 5673, 3255, 4917, 1907, 6342, 3386, 5299, 2781, 47 67, 3730, 6437, 5348, 2431, 5057, 1959, 7180, 3496, 5776, 3655, 4478, 2982, 6316, 5513, 101 5, 5016, 3306, 6667, 3745, 5294, 3011, 4727, 6264, 3467, 5660, 1519, 4941, 2875, 6425, 3629, 5458, 3427, 4594, 6345, 2017, 5242, 2795, 6696, 3197, 5701, 3846, 4826, 2985, 7201, 5432, 1 786, 5028, 3414, 6422, 2495, 5323, 3684, 4838, 6206, 1949, 5403, 3388, 4918, 2930, 6536, 36 35, 5674, 3313, 4596, 6724, 1902, 5183, 2972, 4947, 3417, 6287, 2782, 5473, 6247, 3732, 484 1, 1909, 5896, 3279, 6438, 2903, 5301, 4921, 3630, 7233, 2004, 5415, 3524, 4541, 3013, 6786, 5681, 3857, 4976, 2797, 6322, 1963, 5352, 3469, 4783, 6496, 3659, 5460, 2550, 6237, 3259, 4 999, 1788, 5706, 6675, 3429, 4567, 2932, 5514, 3688, 6346, 1531, 5792, 4731, 3475, 7188, 29 86, 5244, 3746, 4942, 3308, 6467, 5521, 2018, 6251, 2877, 5058, 3850, 5824, 6669, 2803, 482 8, 3504, 5325, 2008, 6441, 3637, 4351, 5405, 2993, 6324, 3470, 5702, 3777, 7202, 4949, 1950, 5302, 2907, 6544, 3198, 4791, 3736, 5419, 6704, 2553, 4922, 1910, 5676, 3359, 6295, 4571, 3 528, 6353, 3014, 5331, 3661, 5032, 1759, 6428, 5474, 2798, 5904, 3314, 6670, 3858, 4842, 53 05, 2988, 7192, 1021, 5003, 3418, 6238, 5464, 3748, 4963, 2936, 6469, 1965, 5763, 4583, 347 7, 6348, 3638, 5360, 3017, 6728, 3316, 5516, 4733, 1913, 6442, 3667, 5713, 2878, 4950, 6299, 3430, 5326, 3968, 7204, 1991, 4924, 5406, 2554, 6914, 3433, 4849, 3641, 5682, 6449, 2805, 5 215, 1971, 6354, 3261, 4600, 5705, 3696, 6253, 2959, 4953, 3491, 5522, 6677, 2020, 4815, 37 19, 7425, 2919, 5447, 5647, 3420, 6474, 2994, 5060, 5333, 3287, 6328, 1527, 5005, 3852, 656 0, 5537, 2687, 4542, 3375, 6788, 3662, 5765, 4795, 1966, 6259, 2909, 5306, 3536, 7175, 5920, 3778, 4965, 3018, 6592, 5421, 1775, 5011, 3478, 6691, 3669, 5347, 6311, 2556, 4573, 3291, 5 684, 1914, 6470, 5476, 3873, 6369, 2923, 4844, 5231, 3481, 6682, 3642, 5040, 1995, 5655, 72 97, 2751, 5006, 3493, 6444, 3752, 5427, 5766, 3303, 6301, 2996, 4734, 6736, 1855, 5524, 372 3, 4895, 3434, 6531, 5334, 2967, 5708, 3905, 6254, 4587, 1973, 7234, 3383, 5422, 3025, 5064, 6481, 3683, 5308, 3320, 6693, 4850, 2024, 5769, 2910, 6261, 5451, 3670, 4954, 3441, 6356, 2 806, 5714, 6681, 3860, 5013, 1916, 5337, 7179, 3482, 4574, 2527, 6450, 3644, 5480, 5891, 34 07, 6315, 1787, 4852, 6473, 3020, 5538, 3673, 4966, 6678, 3262, 5349, 2971, 6370, 5688, 199 7, 4969, 3780, 7208, 3436, 5429, 6415, 3026, 4797, 3874, 5659, 6792, 3552, 5279, 1974, 6360, 4589, 3293, 5569, 2925, 6533, 5027, 3494, 7236, 3725, 5729, 4956, 1533, 6916, 2809, 5528, 3 523, 6302, 5671, 3685, 4823, 3000, 6452, 5239, 3387, 6694, 2003, 4911, 5453, 3864, 6262, 29 31, 5893, 7681, 3307, 5072, 3731, 5338, 6423, 2983, 4595, 1022, 6317, 5716, 3497, 5540, 376 0, 6752, 5014, 3442, 6534, 2543, 5350, 4827, 1977, 6265, 3726, 5770, 7298, 3484, 5430, 3041, 5017, 6723, 3876, 5777, 3294, 6476, 5029, 2032, 5459, 2810, 6343, 5661, 3615, 6697, 3415, 4 839, 5353, 2973, 7187, 3784, 4590, 6323, 1998, 5433, 3525, 6372, 5675, 3847, 4970, 2926, 68 00, 5488, 3309, 6537, 3674, 4919, 5952, 1783, 7181, 2933, 5295, 6318, 3444, 4856, 3733, 551 1, 6684, 3498, 5730, 1887, 6482, 4977, 3028, 6266, 5243, 3969, 4597, 3389, 6725, 5720, 2987, 7216, 3686, 5454, 5018, 2005, 6456, 3315, 5570, 6347, 2812, 4943, 3689, 6427, 5772, 3747, 5 340, 6698, 3505, 4798, 1978, 7182, 5662, 2555, 4972, 3906, 6207, 5461, 3419, 6497, 3042, 58 97, 6920, 3676, 5088, 2019, 5303, 6325, 3526, 5434, 7240, 3631, 4829, 3032, 5778, 6439, 331 0, 4479, 3851, 6705, 5544, 1903, 6376, 5703, 2974, 5030, 3500, 6484, 5354, 3792, 7426, 3448, 5793, 6730, 2934, 5059, 5515, 2006, 6538, 3734, 4923, 6816, 3529, 5677, 2783, 6268, 5475, 3 880, 4843, 6545, 3390, 5245, 1980, 7189, 5894, 3737, 6848, 2989, 5033, 5462, 3317, 6349, 45 43, 3749, 6429, 2937, 5732, 6726, 3471, 5436, 2009, 4978, 7300, 3908, 5683, 6326, 3690, 536 1, 3015, 6443, 5020, 3431, 5465, 6700, 3639, 4830, 1534, 6355, 5780, 2995, 7203, 5327, 3506, 4951, 3970, 6498, 5678, 3199, 6928, 5572, 3044, 6329, 1789, 5061, 7194, 3697, 5905, 4845, 3 421, 6488, 3738, 5517, 6787, 2551, 5707, 6384, 3530, 4598, 3859, 5307, 6540, 2021, 5477, 72 48, 2990, 4980, 3663, 6737, 5736, 3435, 6350, 5523, 3692, 5034, 2799, 6430, 5794, 1951, 670 6, 5356, 3263, 7205, 3853, 4925, 5898, 3508, 6239, 4851, 2938, 6729, 3808, 5552, 6546, 3479, 5685, 6471, 1911, 5041, 3750, 5518, 7193, 3019, 5825, 6671, 3537, 4955, 6357, 3888, 5246, 2 879, 6561, 5784, 2010, 4601, 7190, 3779, 5407, 3422, 6789, 5576, 3643, 6330, 5062, 2997, 69 44, 5709, 3318, 4846, 3854, 6445, 5362, 2022, 7304, 5906, 3532, 6371, 5036, 3048, 6708, 375 3, 5466, 6500, 3912, 5796, 4984, 3483, 6255, 5525, 2940, 7682, 2025, 5686, 6679, 3698, 5065, 6451, 3538, 5364, 5715, 3740, 6790, 2811, 4926, 7428, 3437, 5478, 6548, 3861, 6016, 6358, 1 967, 4602, 3321, 6732, 5481, 3021, 5689, 6446, 3671, 4853, 7206, 3781, 5309, 6332, 3512, 57 44, 1915, 6793, 5007, 2998, 6475, 5539, 3972, 7264, 5767, 3443, 4967, 3700, 6738, 5468, 255 7, 6361, 5042, 3875, 6504, 5335, 2012, 6915, 5900, 3495, 7235, 3754, 4735, 6562, 3027, 5423, 5710, 3553, 6373, 4957, 3645, 6712, 5584, 3322, 7209, 5826, 3001, 6453, 1023, 5066, 6683, 3 866, 5526, 6303, 3761, 5717, 4604, 3485, 7312, 5339, 3056, 6593, 5921, 3675, 6753, 3438, 49 71, 6552, 1790, 5529, 6695, 3920, 5690, 7196, 3022, 4799, 6263, 3782, 5541, 5800, 3445, 647 7, 3877, 5351, 6917, 2807, 5044, 7237, 1975, 5771, 6362, 3540, 5482, 6740, 3756, 5015, 6564, 3499, 5953, 7210, 2911, 5431, 6374, 3704, 5073, 3865, 5731, 6794, 2026, 5368, 6454, 3324, 4 958, 7432, 3029, 5718, 6801, 3785, 5489, 6483, 3554, 4854, 6685, 3862, 5908, 7217, 3646, 55 30, 6377, 3002, 4575, 6457, 1917, 5692, 3544, 6699, 5455, 3976, 5068, 7242, 3486, 5721, 651 2, 3043, 5310, 6976, 3727, 5019, 6319, 3687, 5828, 7328, 2033, 5484, 6535, 3446, 5074, 6754, 2927, 5922, 6267, 3878, 5600, 7684, 3762, 5341, 6744, 3295, 4973, 6478, 3030, 5542, 6594, 3 936, 5773, 1999, 4857, 7360, 3501, 5571, 6796, 3677, 5733, 6364, 3786, 5048, 6686, 3004, 54 35, 7238, 3449, 5912, 6485, 3907, 4979, 6921, 3527, 5355, 6327, 1979, 5779, 7212, 3033, 503 1, 6458, 3691, 5545, 6802, 3881, 5808, 6568, 3507, 5490, 7440, 3764, 4591, 6727, 2558, 5774, 6378, 3984, 5532, 6817, 1535, 5089, 7299, 3556, 5924, 6539, 3735, 5342, 6701, 2813, 4858, 6 499, 3502, 5663, 7249, 3793, 5463, 6269, 3868, 5021, 6918, 3311, 5832, 6486, 2028, 5573, 72 18, 3045, 5895, 6756, 3678, 4974, 6460, 3909, 5357, 6707, 5722, 3450, 7241, 4981, 3788, 638 5, 5492, 2975, 6489, 5781, 3531, 6804, 5546, 1918, 7183, 5076, 3882, 6351, 6017, 3739, 6702, 5437, 2935, 7301, 5035, 3391, 6596, 5734, 3889, 6929, 5363, 3794, 6541, 4860, 3509, 7456, 5 737, 2034, 6731, 5795, 3034, 6331, 5553, 6501, 3693, 4603, 7688, 3914, 5954, 6760, 3560, 54 67, 6547, 3768, 5090, 7220, 3046, 5724, 6818, 3452, 5574, 6380, 2036, 5679, 6922, 4000, 508 0, 7191, 3699, 5358, 6576, 5899, 3323, 6709, 5022, 3049, 6542, 5548, 4032, 7302, 5840, 3751, 6849, 5496, 3533, 6270, 4982, 3910, 7244, 5782, 1981, 6808, 5577, 6431, 2991, 4831, 6600, 3 809, 5928, 7305, 3510, 5438, 6733, 3884, 5785, 6386, 2939, 5037, 5365, 3741, 5797, 7250, 49 85, 3539, 6930, 5519, 3971, 6490, 5956, 2007, 6820, 5738, 3694, 7427, 5063, 3036, 6549, 547 9, 6710, 3513, 5687, 7224, 3921, 5043, 6388, 3701, 5554, 6739, 3568, 6018, 6502, 3796, 5247, 7195, 5092, 1791, 7040, 5745, 2814, 6505, 5469, 3534, 7265, 5786, 3890, 6713, 4599, 3755, 6 333, 5578, 6768, 3319, 5907, 7696, 2999, 5038, 6563, 3913, 5711, 6791, 3810, 5483, 7207, 57 40, 3423, 6492, 4847, 2011, 6359, 5311, 3855, 6924, 5901, 3050, 7429, 5556, 6447, 3800, 498 6, 6734, 3973, 5856, 7252, 3541, 5527, 6608, 5798, 3742, 6850, 5067, 2941, 6550, 5585, 3892, 7306, 5936, 2023, 6741, 4927, 6363, 3514, 5827, 7313, 3702, 5470, 6945, 3863, 5691, 6553, 5 045, 3555, 7197, 5366, 3057, 6714, 5902, 3757, 6565, 5580, 6824, 3974, 5096, 7211, 3439, 58 01, 6375, 2040, 5960, 6795, 5531, 3705, 7488, 4988, 3023, 6506, 5746, 3916, 6977, 5586, 771 2, 3542, 5788, 6455, 3783, 4859, 6755, 5485, 3763, 7266, 5909, 3003, 6392, 5369, 3516, 6742, 5069, 6513, 3812, 5719, 7256, 1982, 5829, 6932, 3977, 5560, 6554, 5046, 3545, 7308, 6020, 3 758, 6716, 5491, 6479, 2559, 5748, 7198, 3922, 4605, 6745, 3706, 6334, 5923, 7433, 3325, 55 43, 6852, 3896, 5802, 6508, 5075, 3787, 7314, 5601, 2013, 6946, 5693, 6624, 3052, 5370, 636 5, 3557, 5049, 7239, 3867, 5914, 6566, 5809, 3647, 6797, 5533, 3487, 7329, 5104, 6595, 3937, 5723, 6757, 2942, 7683, 5486, 6459, 3765, 5968, 6936, 3879, 5070, 7213, 5830, 2027, 6379, 5 493, 3447, 6803, 5925, 7430, 3816, 4855, 6569, 3058, 5588, 6832, 5804, 3924, 7268, 5547, 35 46, 6514, 6798, 4959, 3978, 7219, 5752, 3708, 6556, 5913, 6948, 3558, 5372, 7316, 3060, 507 7, 6366, 5833, 2014, 6687, 5602, 3985, 6487, 5910, 7214, 3789, 6856, 5694, 6597, 3869, 5050, 7441, 3561, 5592, 6919, 6024, 3766, 6381, 5534, 3005, 7936, 5091, 6746, 3883, 5775, 6516, 3 503, 7243, 5735, 6805, 3795, 5494, 6570, 4975, 3938, 7272, 5926, 2029, 7041, 5810, 6461, 37 69, 5343, 7330, 3451, 6758, 5078, 6387, 3031, 5984, 7434, 5549, 3928, 6761, 5725, 3824, 681 9, 5834, 7221, 3548, 5052, 6577, 3980, 7361, 5497, 6978, 3790, 5955, 6491, 5575, 2815, 7320, 5081, 3870, 6748, 5739, 6598, 2035, 5929, 7685, 6703, 3326, 5555, 6382, 3679, 5812, 7245, 4 606, 3986, 6923, 6032, 6572, 3911, 7442, 5604, 3035, 6864, 5783, 6520, 3511, 4861, 7332, 55 50, 3797, 6806, 5841, 6601, 4001, 7222, 5916, 3770, 6952, 5359, 6462, 3562, 5093, 7251, 572 6, 2030, 6809, 5957, 3885, 6389, 7552, 5498, 3047, 6821, 5836, 7744, 3811, 5023, 6543, 5579, 3453, 6980, 7225, 5930, 3940, 6762, 5787, 3695, 6503, 4983, 7280, 3891, 5439, 6711, 6578, 3 569, 5937, 7303, 5842, 3064, 7042, 5557, 3988, 6271, 5082, 7436, 3798, 6769, 5741, 6493, 20 37, 5962, 7246, 5608, 3886, 6810, 7362, 5816, 3535, 6602, 5094, 3772, 6931, 5500, 7689, 300 6, 6048, 6735, 6507, 3915, 5747, 7253, 5371, 3801, 6764, 5097, 6335, 3515, 7457, 6080, 6925, 3944, 5799, 7226, 5581, 4002, 6580, 5958, 3813, 6880, 7336, 5039, 3564, 6551, 5857, 6822, 1 919, 5558, 7307, 6609, 3037, 5932, 7489, 4987, 3893, 6960, 5789, 6851, 3743, 7686, 5587, 64 94, 4033, 6019, 6715, 5742, 3454, 7267, 6390, 5084, 3992, 7254, 5561, 6926, 3703, 5969, 660 4, 7444, 3051, 5749, 6825, 5616, 3917, 6984, 5844, 7228, 3570, 6555, 4862, 7257, 3802, 5582, 6770, 5938, 4004, 6610, 7697, 5803, 1983, 6812, 5367, 6509, 3814, 7364, 5047, 6933, 3894, 5 961, 7458, 5858, 3038, 6393, 6743, 5471, 3572, 7309, 5903, 6853, 3923, 5098, 6584, 7269, 38 17, 5848, 7044, 6021, 3897, 7448, 6515, 5589, 3517, 6772, 5790, 7315, 3952, 4989, 6947, 769 0, 3759, 5940, 6567, 5562, 3053, 6826, 7344, 5750, 3975, 6625, 5911, 6717, 2038, 5603, 7310, 6394, 3543, 5105, 7460, 5805, 3707, 6938, 6833, 6022, 3918, 7199, 5487, 6557, 7368, 4034, 5 753, 6747, 5071, 3804, 6510, 5964, 7698, 3327, 6992, 5590, 7431, 3059, 5831, 6854, 6517, 39 25, 5811, 7258, 5051, 3767, 6949, 7317, 5564, 3898, 6612, 5860, 6828, 7553, 3547, 6025, 657 1, 5593, 4008, 7808, 6776, 5806, 2041, 6937, 4607, 7270, 3818, 6396, 5970, 7273, 5754, 3979, 6857, 6626, 5373, 3054, 7331, 5944, 6934, 3939, 7490, 5835, 6718, 3559, 5100, 6616, 7260, 5 605, 3709, 7048, 5915, 7692, 3926, 6558, 5695, 7215, 3900, 5535, 6799, 6759, 3825, 5985, 74 35, 4990, 6518, 3576, 7376, 5813, 6950, 3061, 5927, 6834, 7318, 3929, 5495, 6367, 5864, 771 3, 3791, 7008, 5106, 6573, 4036, 5972, 7464, 6749, 2042, 5594, 7321, 6858, 6026, 3981, 7333, 5756, 6521, 3518, 6979, 5606, 7492, 3771, 5108, 6599, 7745, 6033, 3941, 6763, 5837, 6953, 3 987, 7274, 5917, 6579, 7223, 2943, 5609, 6836, 5814, 3549, 7554, 7056, 5053, 3820, 6628, 59 31, 7281, 6807, 4016, 5551, 7322, 6574, 3982, 5843, 7700, 5986, 6865, 3710, 6940, 5817, 744 3, 3871, 5499, 6383, 7247, 5079, 3563, 6750, 7276, 5976, 4040, 6981, 5872, 6522, 7714, 2044, 5596, 6860, 7437, 3007, 6028, 6603, 5838, 7392, 3826, 6954, 4863, 7334, 3930, 6811, 5918, 6 463, 5374, 3989, 7472, 6961, 5727, 7704, 3550, 6866, 6034, 7363, 3828, 5959, 6581, 6765, 50 83, 3942, 7227, 6986, 5559, 3945, 7438, 5845, 6632, 7337, 3773, 6049, 6840, 7716, 5818, 306 2, 6524, 5610, 7072, 3565, 7496, 5933, 6771, 7282, 4003, 5095, 6395, 5859, 3932, 7324, 7104, 5501, 7445, 3799, 6823, 5988, 6605, 7937, 3887, 5743, 6982, 5939, 7255, 2015, 6881, 5617, 7 365, 4048, 6582, 5112, 7556, 6956, 3571, 6036, 6813, 5846, 7687, 3990, 6611, 5934, 7284, 38 03, 7043, 5583, 7459, 6766, 3065, 5820, 7338, 6585, 5054, 3993, 7229, 5963, 6993, 7809, 400 5, 5849, 6773, 6640, 5563, 3815, 7450, 6868, 5992, 3566, 7345, 6050, 6606, 7259, 3946, 5861, 6962, 7746, 5612, 3895, 6827, 7504, 5085, 6391, 3832, 7366, 5941, 6985, 6882, 3953, 5791, 7 461, 6081, 6495, 3573, 7340, 5502, 6927, 7691, 3066, 6040, 6872, 7288, 5751, 3994, 7045, 74 49, 5099, 2031, 6613, 7369, 5965, 6814, 3919, 7720, 5618, 6964, 5850, 3774, 6586, 7446, 605 2, 6774, 3948, 7230, 5862, 6935, 7560, 4064, 5942, 6627, 7748, 5086, 3805, 6829, 7311, 5620, 7046, 3455, 7271, 5971, 6511, 7462, 4006, 5865, 6777, 7810, 5945, 4035, 6988, 7346, 5565, 6 614, 3899, 7520, 6000, 6855, 7261, 5807, 3068, 6835, 5101, 6588, 7699, 3819, 6023, 6884, 73 70, 5591, 4009, 7049, 7491, 5755, 6617, 3519, 7275, 5966, 6830, 7693, 3954, 6082, 6994, 746 5, 5852, 3996, 6778, 7348, 5375, 6397, 3806, 7568, 5107, 6968, 7728, 5973, 3927, 6859, 7319, 5815, 6629, 2043, 7377, 5946, 6939, 7452, 4037, 5595, 6719, 7694, 6056, 3821, 6559, 7262, 7 009, 5866, 7493, 3574, 6837, 6027, 7372, 6951, 3039, 5102, 7752, 6519, 5987, 3956, 7466, 68 88, 5607, 7323, 6996, 4010, 5757, 7938, 6618, 5974, 3901, 7473, 7050, 5948, 7378, 3827, 678 0, 5873, 7277, 6630, 5624, 4017, 7701, 7057, 5109, 7498, 3931, 6861, 5977, 7352, 6941, 3577, 7584, 5839, 6633, 7812, 6084, 4038, 6838, 7283, 6029, 6955, 3822, 7616, 5566, 6575, 7715, 5 819, 4012, 6867, 7335, 5989, 7010, 3960, 6841, 6523, 6035, 7494, 7000, 4041, 4991, 7393, 68 96, 5597, 3055, 7706, 6620, 5868, 7468, 7052, 3902, 6064, 7325, 6862, 7760, 3578, 6030, 694 2, 7555, 5758, 6398, 3829, 7278, 5919, 6751, 7505, 5611, 2039, 7058, 7717, 6088, 6983, 3983, 7285, 6583, 5055, 7380, 6869, 3943, 5874, 7705, 7073, 5978, 7474, 4018, 6842, 7339, 6037, 6 634, 3711, 7497, 5598, 6957, 7702, 5876, 3933, 6883, 7394, 5990, 6525, 7439, 4042, 7012, 59 93, 7816, 6767, 5821, 3580, 7384, 6963, 5110, 7557, 6641, 3947, 7940, 5613, 7060, 7326, 377 5, 6051, 6870, 7476, 6958, 5980, 3067, 7718, 6607, 5847, 7286, 6844, 4020, 5935, 7447, 6987, 7341, 6096, 3991, 6873, 7776, 5619, 6587, 7558, 4049, 6038, 7289, 7016, 7747, 5851, 3934, 7 074, 7500, 5113, 6885, 7367, 3830, 6636, 6041, 7721, 6965, 6053, 3551, 7347, 6815, 7396, 58 63, 7105, 4044, 7824, 5614, 6526, 7561, 7064, 3995, 5994, 7342, 6775, 5943, 7708, 4050, 698 9, 7506, 5880, 6642, 7290, 3949, 6001, 7749, 6874, 7480, 5621, 3833, 7076, 7371, 5114, 6886, 7451, 2045, 6966, 6042, 7722, 6644, 5967, 7231, 4024, 6995, 7521, 5822, 6889, 7944, 3955, 5 996, 7349, 6969, 7463, 6112, 4007, 6589, 7729, 7024, 5853, 7400, 3063, 6831, 5503, 7508, 70 47, 7754, 6054, 3567, 6615, 7562, 6083, 7840, 6779, 4065, 7292, 5947, 6990, 7569, 7106, 511 6, 3834, 7872, 6876, 5867, 7373, 6399, 3997, 7453, 6057, 7750, 6997, 7350, 3950, 5567, 6839, 7467, 6970, 6002, 7724, 3957, 6619, 6044, 7379, 7080, 7522, 4052, 5854, 7952, 6890, 7353, 5 975, 7051, 4011, 7512, 7011, 6085, 7811, 3836, 5869, 7408, 7564, 6781, 5622, 7761, 35 79, 6998, 7374, 5087, 6972, 7454, 6897, 4066, 6004, 7730, 7263, 6058, 6648, 4056, 7753, 700 1, 5949, 7570, 6863, 7495, 3998, 5875, 7695, 7108, 7381, 6065, 7053, 3958, 7585, 6590, 5979, 7813, 6843, 7354, 3807, 5625, 7968, 7013, 7469, 6086, 7059, 3069, 7395, 6621, 5870, 7732, 7 524, 4013, 6892, 6060, 7279, 7088, 7703, 6008, 3961, 7054, 7475, 7814, 6089, 6782, 7572, 40 39, 6943, 5103, 7382, 7756, 6635, 5950, 4019, 7470, 7112, 7356, 5626, 6898, 7817, 4068, 749 9, 5877, 7002, 7762, 7061, 6031, 7385, 2046, 6622, 7528, 5991, 7939, 6900, 7586, 3575, 6066, 7014, 7397, 7736, 5759, 7017, 4014, 7477, 6845, 5981, 7707, 7327, 6637, 3823, 6090, 7617, 7 075, 7777, 5628, 7004, 3962, 7576, 7719, 5995, 6871, 7287, 6959, 7501, 4043, 5823, 7941, 71 20, 7386, 5115, 6643, 3903, 7764, 7588, 6068, 7062, 7398, 6875, 4021, 6039, 7818, 7478, 706 5, 7825, 6097, 7077, 4072, 7507, 7709, 5982, 6887, 7401, 6638, 3964, 5878, 7481, 7723, 7018, 5599, 7536, 6967, 3835, 8000, 7343, 6092, 6904, 7559, 7778, 6043, 4045, 7025, 7291, 6645, 6 098, 7768, 7502, 4022, 7066, 7618, 5997, 6991, 7820, 7388, 5881, 3581, 6846, 7710, 7020, 75 09, 6072, 7945, 7136, 4051, 7351, 6003, 7482, 6877, 7826, 6527, 6055, 3070, 7592, 7751, 707 8, 5111, 7402, 7841, 7107, 4025, 7563, 5615, 6971, 7725, 7523, 6113, 6891, 4080, 7293, 7942, 7081, 5882, 7510, 6591, 7780, 4046, 6045, 7484, 7026, 7731, 7409, 5998, 7068, 3831, 7513, 6 878, 7828, 6005, 7375, 6999, 7726, 3935, 6100, 7620, 7109, 7953, 6893, 6059, 7565, 4053, 77 55, 6646, 7355, 5884, 7525, 7028, 7784, 4026, 5627, 7571, 7082, 7842, 7404, 6114, 6973, 794 6, 4067, 6899, 7600, 6104, 7733, 7089, 7566, 7873, 3951, 6046, 7003, 7294, 7832, 6649, 6006, 7455, 7624, 4054, 7110, 7757, 5855, 6894, 7410, 7954, 7084, 4028, 5117, 7514, 7844, 7032, 6 061, 7573, 7734, 7113, 4057, 7412, 6009, 7763, 6974, 7526, 8064, 6087, 6650, 3582, 7529, 77 37, 6901, 6067, 7357, 7792, 7055, 3837, 7587, 6116, 7815, 7015, 7516, 7090, 7383, 5623, 406 9, 7948, 6783, 7471, 7758, 6062, 7005, 7632, 7874, 3999, 7114, 5871, 7574, 7765, 6652, 7387, 6010, 7969, 7019, 3959, 7577, 7738, 6091, 6847, 7589, 7848, 7399, 7092, 2047, 5951, 7819, 7 530, 7063, 8001, 6069, 7479, 7121, 4058, 7779, 7416, 6120, 7006, 7766, 7537, 6902, 7956, 40 70, 6012, 7578, 6623, 7740, 7503, 5883, 7116, 7769, 7358, 4073, 7067, 6093, 7876, 7532, 712 2, 7970, 7648, 6070, 4015, 7389, 7021, 7590, 7821, 5629, 6905, 7619, 7781, 7096, 3963, 7483, 6099, 7960, 7027, 7403, 7827, 7079, 5118, 7593, 4060, 7856, 7538, 6639, 6073, 7822, 7580, 7 137, 7972, 7390, 3071, 6128, 6906, 7711, 7511, 7069, 7880, 6094, 7621, 7943, 3838, 7022, 74 05, 7770, 5879, 7029, 7540, 7829, 7594, 5983, 4023, 7124, 8065, 7485, 7083, 7782, 6101, 741 1, 6908, 7785, 4074, 7843, 7601, 6074, 6651, 8002, 7515, 7138, 7772, 6115, 7622, 3965, 7727, 7128, 7406, 7947, 5999, 7070, 7596, 7888, 7544, 7030, 4081, 6102, 7830, 7625, 6879, 7976, 7 486, 6076, 7833, 7085, 4047, 7413, 7845, 7033, 7567, 6105, 8004, 7786, 7111, 7527, 7735, 40 27, 5630, 7091, 7602, 8066, 7295, 7140, 5885, 7793, 7517, 7834, 3583, 6647, 7626, 7955, 611 7, 7086, 7759, 7531, 7788, 6895, 6047, 4076, 7359, 7949, 7604, 7034, 7904, 7575, 6007, 7846, 7115, 7633, 7984, 3966, 6975, 6106, 7875, 7518, 7739, 7093, 7414, 7950, 6118, 7628, 4082, 7 144, 7849, 8008, 7579, 7036, 6121, 7794, 7634, 7836, 6907, 7533, 4084, 7957, 6063, 7417, 71 17, 7767, 7877, 7608, 6011, 7094, 8068, 7539, 4029, 7796, 6653, 7971, 6108, 7591, 7850, 712 3, 7649, 7741, 7418, 7097, 4055, 5119, 7962, 7857, 7581, 7152, 7771, 7534, 5886, 8016, 7118, 7878, 7541, 3839, 7973, 6903, 6071, 7636, 7852, 7595, 7007, 7800, 7961, 6122, 7420, 7125, 4 059, 7881, 7650, 7958, 7742, 7098, 6013, 7640, 8072, 7582, 7139, 7823, 4071, 7783, 6129, 75 42, 7023, 7974, 7858, 7391, 7126, 8032, 6095, 7597, 7773, 7882, 4088, 7100, 7545, 8003, 762 3, 6075, 7129, 7787, 7977, 7603, 7860, 6654, 8080, 4030, 5631, 7652, 7831, 6909, 7598, 7889, 7964, 7407, 6124, 7141, 7774, 8005, 7546, 4061, 7884, 7071, 7627, 6014, 7978, 7835, 7031, 7 487, 7985, 7890, 7605, 6130, 7130, 4075, 7789, 8010, 7656, 7864, 7142, 7548, 6132, 8096, 77 95, 7419, 7145, 8128, 7847, 7629, 4062, 8006, 6077, 7087, 7905, 7606, 7980, 7035, 7837, 763 5, 8067, 6103, 7790, 7132, 4077, 7609, 8017, 7797, 7664, 7892, 5887, 6910, 7630, 7986, 7851, 7415, 7095, 8009, 7906, 7519, 4083, 6107, 7951, 7146, 7896, 8069, 7637, 7838, 7037, 7988, 6 119, 7610, 7798, 7959, 7651, 7153, 4078, 7853, 8070, 7535, 6136, 7801, 7119, 8012, 7638, 78 79, 7859, 7099, 7612, 7908, 6078, 8073, 4085, 7641, 7854, 6655, 8018, 7802, 7421, 7992, 788 3, 6109, 7148, 7653, 7963, 7743, 7583, 8033, 7038, 3967, 7861, 7975, 6123, 7543, 7912, 7154, 8020, 7642, 8074, 7804, 7654, 7156, 6110, 8081, 7885, 7965, 4031, 7657, 7862, 7101, 7979, 7 599, 7891, 8034, 6125, 7865, 7547, 7127, 8024, 7920, 7644, 8076, 7886, 6911, 4086, 7966, 61 31, 7422, 7775, 8082, 8007, 7131, 7607, 7893, 8097, 7866, 7658, 6126, 7981, 7143, 7907, 754 9, 8036, 4089, 7791, 7987, 7665, 7160, 8084, 7894, 6133, 7982, 7631, 7868, 7102, 8011, 7897, 7611, 8040, 8098, 7909, 7660, 6015, 4090, 7133, 7989, 7839, 8129, 7550, 8088, 7799, 7147, 8 013, 7666, 7898, 8100, 6079, 7910, 7990, 7134, 7668, 8019, 7913, 7993, 4092, 7613, 8048, 78 55, 7149, 8071, 6134, 7639, 7803, 8014, 8130, 7900, 7423, 7155, 8021, 7863, 7994, 7643, 810 4, 6137, 7914, 4063, 8075, 7150, 8035, 7655, 7805, 8022, 7996, 7921, 7672, 7157, 8025, 7887, 8132, 6138, 8077, 7614, 7867, 8037, 8083, 7039, 7645, 7916, 8112, 4079, 8078, 7806, 7967, 7 659, 8136, 6140, 7103, 7922, 8026, 8085, 7646, 7924, 8038, 8041, 7869, 7158, 7661, 8099, 80 28, 7895, 7983, 6111, 8144, 7667, 4091, 8086, 7899, 7161, 8089, 8101, 7911, 7662, 8042, 799 1, 7928, 8049, 7669, 7162, 8090, 6127, 8015, 7870, 8044, 8160, 7901, 7551, 8102, 8131, 7995, 7164, 7915, 4087, 8105, 7615, 8050, 8092, 7902, 8023, 6139, 8133, 7917, 7670, 7135, 8052, 8 106, 7997, 7923, 8113, 8027, 7673, 8134, 7918, 8108, 8056, 8137, 7151, 7998, 7674, 7925, 61 35, 8079, 8039, 4093, 8114, 7807, 8029, 8138, 7676, 8043, 7871, 7163, 8116, 8087, 8145, 803 0, 7926, 7647, 8140, 8091, 8146, 8045, 7929, 6141, 8120, 8051, 8103, 7159, 7663, 8161, 7930, 8093, 8046, 8053, 8148, 8107, 7932, 4094, 7675, 8162, 8152, 8094, 8054, 7903, 7165, 8109, 8 057, 8135, 8115, 8164, 6142, 7671, 8110, 7919, 8058, 8139, 7999, 8117, 8168, 8060, 7931, 81 41, 8118, 7677, 8147, 7166, 8121, 8176, 8142, 7927, 8031, 8149, 8122, 8163, 8047, 8150, 812 4, 4095, 8153, 7678, 7933, 8165, 8095, 8055, 6143, 8154, 8166, 8169, 8111, 8059, 8156, 7167, 7934, 8119, 8170, 8061, 8177, 8143, 8123, 7679, 8172, 8062, 8178, 8180, 8125, 8151, 7935, 8 155, 8167, 8184, 8126, 8157, 8171, 8158, 8173, 8179, 8174, 8181, 8063, 8127, 8182, 8185, 81 86, 8188, 8159, 8175, 8187, 8183, 8189, 8190, 8191]

TABLE Q17 with a sequence length of 8192:

| Polarized channel sequence number | Reliability or reliability sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 256 |
| 9 | 512 |
| 10 | 1024 |
| 11 | 2048 |
| 12 | 4096 |
| 13 | 5 |
| 14 | 64 |
| 15 | 9 |
| 16 | 6 |
| 17 | 17 |
| 18 | 10 |
| 19 | 18 |
| 20 | 128 |
| 21 | 12 |
| 22 | 33 |
| 23 | 65 |
| 24 | 20 |
| 25 | 34 |
| 26 | 24 |
| 27 | 36 |
| 28 | 257 |
| 29 | 7 |
| 30 | 129 |
| 31 | 66 |
| 32 | 11 |
| 33 | 40 |
| 34 | 68 |
| 35 | 513 |
| 36 | 130 |
| 37 | 19 |
| 38 | 13 |
| 39 | 48 |
| 40 | 14 |
| 41 | 1025 |
| 42 | 72 |
| 43 | 258 |
| 44 | 21 |
| 45 | 132 |
| 46 | 35 |

TABLE Q17-continued with a sequence length of 8192:

| Polarized channel sequence number | Reliability or reliability sequence number |
|---|---|
| 47 | 2049 |
| 48 | 26 |
| 49 | 80 |
| 50 | 37 |
| 51 | 25 |
| 52 | 22 |
| 53 | 4097 |
| 54 | 136 |
| 55 | 514 |
| 56 | 260 |
| 57 | 38 |
| 58 | 96 |
| 59 | 67 |
| 60 | 41 |
| 61 | 144 |
| 62 | 28 |
| 63 | 69 |
| 64 | 42 |
| 65 | 264 |
| 66 | 49 |
| 67 | 74 |
| 68 | 1026 |
| 69 | 160 |
| 70 | 516 |
| 71 | 192 |
| 72 | 70 |
| 73 | 44 |
| 74 | 272 |
| 75 | 131 |
| 76 | 81 |
| 77 | 50 |
| 78 | 73 |
| 79 | 15 |
| 80 | 133 |
| 81 | 2050 |
| 82 | 288 |
| 83 | 520 |
| 84 | 52 |
| 85 | 23 |
| 86 | 134 |
| 87 | 76 |
| 88 | 1028 |
| 89 | 137 |
| 90 | 82 |
| 91 | 259 |
| 92 | 56 |
| 93 | 4098 |
| 94 | 27 |
| 95 | 97 |
| 96 | 528 |
| 97 | 39 |
| 98 | 261 |
| 99 | 84 |
| 100 | 138 |
| 101 | 145 |
| 102 | 29 |
| 103 | 43 |
| 104 | 320 |
| 105 | 1032 |
| 106 | 544 |
| 107 | 98 |
| 108 | 2052 |
| 109 | 88 |
| 110 | 140 |
| 111 | 30 |
| 112 | 265 |
| 113 | 146 |
| 114 | 71 |
| 115 | 161 |
| 116 | 515 |
| 117 | 45 |
| 118 | 262 |
| 119 | 100 |

TABLE Q17-continued

| with a sequence length of 8192: | |
|---|---|
| Polarized channel sequence number | Reliability or reliability sequence number |
| 120 | 51 |
| 121 | 1040 |
| 122 | 148 |
| 123 | 46 |
| 124 | 273 |
| 125 | 768 |
| 126 | 75 |
| 127 | 104 |
| 128 | 4100 |
| 129 | 162 |
| 130 | 266 |
| 131 | 53 |
| 132 | 2056 |
| 133 | 193 |
| 134 | 152 |
| 135 | 517 |
| 136 | 77 |
| 137 | 1056 |
| 138 | 274 |
| 139 | 164 |
| 140 | 54 |
| 141 | 83 |
| 142 | 384 |
| 143 | 576 |
| 144 | 57 |
| 145 | 112 |
| 146 | 135 |
| 147 | 268 |
| 148 | 78 |
| 149 | 1027 |
| 150 | 194 |
| 151 | 521 |
| 152 | 2064 |
| 153 | 85 |
| 154 | 289 |
| 155 | 58 |
| 156 | 168 |
| 157 | 139 |
| 158 | 4104 |
| 159 | 321 |
| 160 | 518 |
| 161 | 99 |
| 162 | 1280 |
| 163 | 86 |
| 164 | 276 |
| 165 | 60 |
| 166 | 89 |
| 167 | 529 |
| 168 | 196 |
| 169 | 290 |
| 170 | 141 |
| 171 | 2080 |
| 172 | 101 |
| 173 | 280 |
| 174 | 1536 |
| 175 | 147 |
| 176 | 522 |
| 177 | 176 |
| 178 | 142 |
| 179 | 292 |
| 180 | 31 |
| 181 | 200 |
| 182 | 530 |
| 183 | 263 |
| 184 | 1029 |
| 185 | 4112 |
| 186 | 90 |
| 187 | 149 |
| 188 | 385 |
| 189 | 2051 |
| 190 | 640 |
| 191 | 102 |
| 192 | 105 |

TABLE Q17-continued

| with a sequence length of 8192: | |
|---|---|
| Polarized channel sequence number | Reliability or reliability sequence number |
| 193 | 163 |
| 194 | 322 |
| 195 | 92 |
| 196 | 1088 |
| 197 | 524 |
| 198 | 47 |
| 199 | 267 |
| 200 | 208 |
| 201 | 150 |
| 202 | 545 |
| 203 | 296 |
| 204 | 153 |
| 205 | 2304 |
| 206 | 165 |
| 207 | 1033 |
| 208 | 324 |
| 209 | 577 |
| 210 | 4128 |
| 211 | 106 |
| 212 | 55 |
| 213 | 386 |
| 214 | 113 |
| 215 | 154 |
| 216 | 1030 |
| 217 | 532 |
| 218 | 275 |
| 219 | 79 |
| 220 | 108 |
| 221 | 2560 |
| 222 | 546 |
| 223 | 269 |
| 224 | 224 |
| 225 | 166 |
| 226 | 1041 |
| 227 | 304 |
| 228 | 536 |
| 229 | 195 |
| 230 | 59 |
| 231 | 270 |
| 232 | 169 |
| 233 | 548 |
| 234 | 4099 |
| 235 | 1034 |
| 236 | 328 |
| 237 | 3072 |
| 238 | 114 |
| 239 | 156 |
| 240 | 277 |
| 241 | 769 |
| 242 | 87 |
| 243 | 197 |
| 244 | 1042 |
| 245 | 388 |
| 246 | 519 |
| 247 | 116 |
| 248 | 291 |
| 249 | 170 |
| 250 | 2053 |
| 251 | 61 |
| 252 | 641 |
| 253 | 1152 |
| 254 | 282 |
| 255 | 177 |
| 256 | 4352 |
| 257 | 91 |
| 258 | 578 |
| 259 | 336 |
| 260 | 198 |
| 261 | 293 |
| 262 | 1036 |
| 263 | 172 |
| 264 | 523 |
| 265 | 2112 |

TABLE Q17-continued

| with a sequence length of 8192: | |
|---|---|
| Polarized channel sequence number | Reliability or reliability sequence number |
| 266 | 120 |
| 267 | 281 |
| 268 | 201 |
| 269 | 552 |
| 270 | 1057 |
| 271 | 278 |
| 272 | 62 |
| 273 | 392 |
| 274 | 580 |
| 275 | 143 |
| 276 | 4608 |
| 277 | 103 |
| 278 | 2057 |
| 279 | 294 |
| 280 | 1089 |
| 281 | 642 |
| 282 | 178 |
| 283 | 352 |
| 284 | 93 |
| 285 | 531 |
| 286 | 202 |
| 287 | 1044 |
| 288 | 323 |
| 289 | 107 |
| 290 | 2054 |
| 291 | 525 |
| 292 | 297 |
| 293 | 180 |
| 294 | 1058 |
| 295 | 400 |
| 296 | 5120 |
| 297 | 560 |
| 298 | 151 |
| 299 | 209 |
| 300 | 284 |
| 301 | 526 |
| 302 | 1048 |
| 303 | 2065 |
| 304 | 94 |
| 305 | 325 |
| 306 | 204 |
| 307 | 584 |
| 308 | 298 |
| 309 | 155 |
| 310 | 1060 |
| 311 | 770 |
| 312 | 305 |
| 313 | 210 |
| 314 | 2058 |
| 315 | 6144 |
| 316 | 109 |
| 317 | 533 |
| 318 | 1281 |
| 319 | 330 |
| 320 | 184 |
| 321 | 416 |
| 322 | 644 |
| 323 | 115 |
| 324 | 1031 |
| 325 | 448 |
| 326 | 2066 |
| 327 | 547 |
| 328 | 167 |
| 329 | 326 |
| 330 | 225 |
| 331 | 538 |
| 332 | 1153 |
| 333 | 4101 |
| 334 | 300 |
| 335 | 157 |
| 336 | 592 |
| 337 | 387 |
| 338 | 2176 |

TABLE Q17-continued

| with a sequence length of 8192: | |
|---|---|
| Polarized channel sequence number | Reliability or reliability sequence number |
| 339 | 110 |
| 340 | 1090 |
| 341 | 337 |
| 342 | 549 |
| 343 | 117 |
| 344 | 212 |
| 345 | 537 |
| 346 | 1035 |
| 347 | 306 |
| 348 | 2060 |
| 349 | 171 |
| 350 | 4160 |
| 351 | 329 |
| 352 | 534 |
| 353 | 226 |
| 354 | 1064 |
| 355 | 271 |
| 356 | 648 |
| 357 | 216 |
| 358 | 389 |
| 359 | 2081 |
| 360 | 1092 |
| 361 | 772 |
| 362 | 158 |
| 363 | 308 |
| 364 | 550 |
| 365 | 118 |
| 366 | 1537 |
| 367 | 4105 |
| 368 | 279 |
| 369 | 173 |
| 370 | 2113 |
| 371 | 608 |
| 372 | 390 |
| 373 | 121 |
| 374 | 1154 |
| 375 | 579 |
| 376 | 332 |
| 377 | 199 |
| 378 | 553 |
| 379 | 1043 |
| 380 | 2068 |
| 381 | 179 |
| 382 | 228 |
| 383 | 656 |
| 384 | 4102 |
| 385 | 393 |
| 386 | 1037 |
| 387 | 174 |
| 388 | 540 |
| 389 | 338 |
| 390 | 2082 |
| 391 | 122 |
| 392 | 581 |
| 393 | 1072 |
| 394 | 312 |
| 395 | 203 |
| 396 | 283 |
| 397 | 554 |
| 398 | 1038 |
| 399 | 4113 |
| 400 | 63 |
| 401 | 2072 |
| 402 | 353 |
| 403 | 776 |
| 404 | 181 |
| 405 | 1096 |
| 406 | 295 |
| 407 | 561 |
| 408 | 232 |
| 409 | 340 |
| 410 | 2084 |
| 411 | 1282 |

TABLE Q17-continued with a sequence length of 8192:

| Polarized channel sequence number | Reliability or reliability sequence number |
|---|---|
| 412 | 586 |
| 413 | 394 |
| 414 | 672 |
| 415 | 4106 |
| 416 | 124 |
| 417 | 401 |
| 418 | 1045 |
| 419 | 2305 |
| 420 | 704 |
| 421 | 205 |
| 422 | 285 |
| 423 | 582 |
| 424 | 1156 |
| 425 | 182 |
| 426 | 299 |
| 427 | 556 |
| 428 | 2055 |
| 429 | 4114 |
| 430 | 211 |
| 431 | 1059 |
| 432 | 354 |
| 433 | 784 |
| 434 | 185 |
| 435 | 1050 |
| 436 | 344 |
| 437 | 643 |
| 438 | 2177 |
| 439 | 240 |
| 440 | 396 |
| 441 | 1104 |
| 442 | 593 |
| 443 | 206 |
| 444 | 4224 |
| 445 | 286 |
| 446 | 562 |
| 447 | 2114 |
| 448 | 1061 |
| 449 | 95 |
| 450 | 585 |
| 451 | 402 |
| 452 | 327 |
| 453 | 1049 |
| 454 | 527 |
| 455 | 2059 |
| 456 | 213 |
| 457 | 417 |
| 458 | 4108 |
| 459 | 1046 |
| 460 | 645 |
| 461 | 186 |
| 462 | 800 |
| 463 | 301 |
| 464 | 2088 |
| 465 | 1160 |
| 466 | 227 |
| 467 | 564 |
| 468 | 356 |
| 469 | 111 |
| 470 | 1538 |
| 471 | 535 |
| 472 | 4129 |
| 473 | 2116 |
| 474 | 307 |
| 475 | 646 |
| 476 | 1284 |
| 477 | 404 |
| 478 | 214 |
| 479 | 588 |
| 480 | 302 |
| 481 | 2561 |
| 482 | 1062 |
| 483 | 188 |
| 484 | 649 |

TABLE Q17-continued with a sequence length of 8192:

| Polarized channel sequence number | Reliability or reliability sequence number |
|---|---|
| 485 | 4161 |
| 486 | 331 |
| 487 | 1120 |
| 488 | 594 |
| 489 | 217 |
| 490 | 2178 |
| 491 | 360 |
| 492 | 771 |
| 493 | 1091 |
| 494 | 418 |
| 495 | 229 |
| 496 | 568 |
| 497 | 1065 |
| 498 | 2067 |
| 499 | 4116 |
| 500 | 309 |
| 501 | 539 |
| 502 | 159 |
| 503 | 1168 |
| 504 | 449 |
| 505 | 609 |
| 506 | 2061 |
| 507 | 408 |
| 508 | 551 |
| 509 | 1052 |
| 510 | 119 |
| 511 | 333 |
| 512 | 4130 |
| 513 | 773 |
| 514 | 1093 |
| 515 | 2096 |
| 516 | 218 |
| 517 | 596 |
| 518 | 420 |
| 519 | 1066 |
| 520 | 230 |
| 521 | 650 |
| 522 | 2062 |
| 523 | 310 |
| 524 | 4120 |
| 525 | 1288 |
| 526 | 657 |
| 527 | 339 |
| 528 | 541 |
| 529 | 1073 |
| 530 | 3073 |
| 531 | 233 |
| 532 | 313 |
| 533 | 555 |
| 534 | 1098 |
| 535 | 368 |
| 536 | 832 |
| 537 | 4132 |
| 538 | 175 |
| 539 | 2120 |
| 540 | 1184 |
| 541 | 391 |
| 542 | 610 |
| 543 | 123 |
| 544 | 1540 |
| 545 | 600 |
| 546 | 2306 |
| 547 | 334 |
| 548 | 450 |
| 549 | 4353 |
| 550 | 1216 |
| 551 | 652 |
| 552 | 220 |
| 553 | 542 |
| 554 | 2069 |
| 555 | 1094 |
| 556 | 341 |
| 557 | 777 |

TABLE Q17-continued

| with a sequence length of 8192: | |
|---|---|
| Polarized channel sequence number | Reliability or reliability sequence number |
| 558 | 183 |
| 559 | 1068 |
| 560 | 2180 |
| 561 | 4103 |
| 562 | 314 |
| 563 | 658 |
| 564 | 424 |
| 565 | 1296 |
| 566 | 583 |
| 567 | 234 |
| 568 | 2083 |
| 569 | 673 |
| 570 | 1155 |
| 571 | 395 |
| 572 | 557 |
| 573 | 4225 |
| 574 | 355 |
| 575 | 1105 |
| 576 | 2074 |
| 577 | 125 |
| 578 | 774 |
| 579 | 342 |
| 580 | 1074 |
| 581 | 612 |
| 582 | 316 |
| 583 | 2128 |
| 584 | 4162 |
| 585 | 563 |
| 586 | 1097 |
| 587 | 241 |
| 588 | 345 |
| 589 | 660 |
| 590 | 2085 |
| 591 | 1039 |
| 592 | 207 |
| 593 | 558 |
| 594 | 1157 |
| 595 | 452 |
| 596 | 4107 |
| 597 | 785 |
| 598 | 2073 |
| 599 | 397 |
| 600 | 1312 |
| 601 | 587 |
| 602 | 187 |
| 603 | 357 |
| 604 | 2070 |
| 605 | 1544 |
| 606 | 616 |
| 607 | 4136 |
| 608 | 403 |
| 609 | 1076 |
| 610 | 674 |
| 611 | 236 |
| 612 | 2184 |
| 613 | 778 |
| 614 | 1047 |
| 615 | 432 |
| 616 | 565 |
| 617 | 398 |
| 618 | 4164 |
| 619 | 2562 |
| 620 | 1158 |
| 621 | 705 |
| 622 | 126 |
| 623 | 1100 |
| 624 | 664 |
| 625 | 2308 |
| 626 | 287 |
| 627 | 456 |
| 628 | 1161 |
| 629 | 4609 |
| 630 | 589 |

TABLE Q17-continued

| with a sequence length of 8192: | |
|---|---|
| Polarized channel sequence number | Reliability or reliability sequence number |
| 631 | 242 |
| 632 | 1106 |
| 633 | 2086 |
| 634 | 786 |
| 635 | 346 |
| 636 | 676 |
| 637 | 1283 |
| 638 | 405 |
| 639 | 2144 |
| 640 | 4226 |
| 641 | 566 |
| 642 | 1080 |
| 643 | 244 |
| 644 | 595 |
| 645 | 358 |
| 646 | 2115 |
| 647 | 1051 |
| 648 | 896 |
| 649 | 361 |
| 650 | 4115 |
| 651 | 1121 |
| 652 | 569 |
| 653 | 2089 |
| 654 | 189 |
| 655 | 624 |
| 656 | 1552 |
| 657 | 419 |
| 658 | 647 |
| 659 | 2192 |
| 660 | 1063 |
| 661 | 4109 |
| 662 | 348 |
| 663 | 215 |
| 664 | 780 |
| 665 | 1285 |
| 666 | 2076 |
| 667 | 303 |
| 668 | 590 |
| 669 | 1108 |
| 670 | 464 |
| 671 | 4144 |
| 672 | 706 |
| 673 | 2117 |
| 674 | 406 |
| 675 | 1162 |
| 676 | 597 |
| 677 | 219 |
| 678 | 1169 |
| 679 | 2090 |
| 680 | 801 |
| 681 | 4110 |
| 682 | 409 |
| 683 | 1053 |
| 684 | 570 |
| 685 | 2312 |
| 686 | 421 |
| 687 | 680 |
| 688 | 1067 |
| 689 | 231 |
| 690 | 651 |
| 691 | 5121 |
| 692 | 2097 |
| 693 | 1344 |
| 694 | 362 |
| 695 | 833 |
| 696 | 1568 |
| 697 | 311 |
| 698 | 2122 |
| 699 | 611 |
| 700 | 1122 |
| 701 | 4168 |
| 702 | 248 |
| 703 | 598 |

TABLE Q17-continued with a sequence length of 8192:

| Polarized channel sequence number | Reliability or reliability sequence number |
|---|---|
| 704 | 3074 |
| 705 | 369 |
| 706 | 1112 |
| 707 | 788 |
| 708 | 410 |
| 709 | 1164 |
| 710 | 2208 |
| 711 | 4354 |
| 712 | 572 |
| 713 | 335 |
| 714 | 1054 |
| 715 | 601 |
| 716 | 190 |
| 717 | 2564 |
| 718 | 1289 |
| 719 | 708 |
| 720 | 364 |
| 721 | 4117 |
| 722 | 1170 |
| 723 | 2240 |
| 724 | 802 |
| 725 | 480 |
| 726 | 221 |
| 727 | 1095 |
| 728 | 422 |
| 729 | 2118 |
| 730 | 4228 |
| 731 | 653 |
| 732 | 1185 |
| 733 | 451 |
| 734 | 613 |
| 735 | 2092 |
| 736 | 1539 |
| 737 | 315 |
| 738 | 792 |
| 739 | 1069 |
| 740 | 4131 |
| 741 | 2320 |
| 742 | 235 |
| 743 | 659 |
| 744 | 1286 |
| 745 | 425 |
| 746 | 688 |
| 747 | 2179 |
| 748 | 1124 |
| 749 | 6145 |
| 750 | 370 |
| 751 | 654 |
| 752 | 1075 |
| 753 | 2129 |
| 754 | 412 |
| 755 | 804 |
| 756 | 1172 |
| 757 | 222 |
| 758 | 4122 |
| 759 | 2098 |
| 760 | 543 |
| 761 | 343 |
| 762 | 1070 |
| 763 | 712 |
| 764 | 453 |
| 765 | 2121 |
| 766 | 1297 |
| 767 | 775 |
| 768 | 4176 |
| 769 | 237 |
| 770 | 1792 |
| 771 | 2063 |
| 772 | 602 |
| 773 | 372 |
| 774 | 1099 |
| 775 | 661 |
| 776 | 2181 |

TABLE Q17-continued with a sequence length of 8192:

| Polarized channel sequence number | Reliability or reliability sequence number |
|---|---|
| 777 | 4133 |
| 778 | 426 |
| 779 | 1128 |
| 780 | 897 |
| 781 | 317 |
| 782 | 2336 |
| 783 | 1186 |
| 784 | 614 |
| 785 | 243 |
| 786 | 4121 |
| 787 | 1290 |
| 788 | 2568 |
| 789 | 617 |
| 790 | 675 |
| 791 | 1077 |
| 792 | 433 |
| 793 | 1217 |
| 794 | 2100 |
| 795 | 4118 |
| 796 | 834 |
| 797 | 347 |
| 798 | 1176 |
| 799 | 604 |
| 800 | 2071 |
| 801 | 454 |
| 802 | 1541 |
| 803 | 4232 |
| 804 | 559 |
| 805 | 238 |
| 806 | 2182 |
| 807 | 1101 |
| 808 | 779 |
| 809 | 428 |
| 810 | 1298 |
| 811 | 2124 |
| 812 | 4610 |
| 813 | 720 |
| 814 | 376 |
| 815 | 1188 |
| 816 | 662 |
| 817 | 3076 |
| 818 | 457 |
| 819 | 1078 |
| 820 | 808 |
| 821 | 4356 |
| 822 | 318 |
| 823 | 2185 |
| 824 | 1107 |
| 825 | 665 |
| 826 | 245 |
| 827 | 2130 |
| 828 | 1408 |
| 829 | 4134 |
| 830 | 677 |
| 831 | 1600 |
| 832 | 399 |
| 833 | 2307 |
| 834 | 836 |
| 835 | 1081 |
| 836 | 618 |
| 837 | 359 |
| 838 | 4192 |
| 839 | 2104 |
| 840 | 1136 |
| 841 | 567 |
| 842 | 434 |
| 843 | 1159 |
| 844 | 2075 |
| 845 | 898 |
| 846 | 4163 |
| 847 | 127 |
| 848 | 1292 |
| 849 | 625 |

TABLE Q17-continued with a sequence length of 8192:

| Polarized channel sequence number | Reliability or reliability sequence number |
|---|---|
| 850 | 2145 |
| 851 | 349 |
| 852 | 1102 |
| 853 | 666 |
| 854 | 1218 |
| 855 | 4137 |
| 856 | 2576 |
| 857 | 458 |
| 858 | 787 |
| 859 | 1545 |
| 860 | 2087 |
| 861 | 591 |
| 862 | 363 |
| 863 | 4240 |
| 864 | 1109 |
| 865 | 620 |
| 866 | 2309 |
| 867 | 191 |
| 868 | 1313 |
| 869 | 781 |
| 870 | 1082 |
| 871 | 4124 |
| 872 | 2132 |
| 873 | 436 |
| 874 | 736 |
| 875 | 1192 |
| 876 | 2186 |
| 877 | 407 |
| 878 | 678 |
| 879 | 4165 |
| 880 | 1163 |
| 881 | 465 |
| 882 | 2193 |
| 883 | 1345 |
| 884 | 816 |
| 885 | 707 |
| 886 | 1542 |
| 887 | 4138 |
| 888 | 2077 |
| 889 | 350 |
| 890 | 571 |
| 891 | 1123 |
| 892 | 2091 |
| 893 | 246 |
| 894 | 1110 |
| 895 | 782 |
| 896 | 4360 |
| 897 | 460 |
| 898 | 2368 |
| 899 | 1300 |
| 900 | 681 |
| 901 | 840 |
| 902 | 3080 |
| 903 | 4145 |
| 904 | 1084 |
| 905 | 411 |
| 906 | 1113 |
| 907 | 626 |
| 908 | 2592 |
| 909 | 466 |
| 910 | 1553 |
| 911 | 4170 |
| 912 | 668 |
| 913 | 2146 |
| 914 | 365 |
| 915 | 1220 |
| 916 | 789 |
| 917 | 1314 |
| 918 | 2136 |
| 919 | 5122 |
| 920 | 249 |
| 921 | 599 |
| 922 | 1165 |

TABLE Q17-continued with a sequence length of 8192:

| Polarized channel sequence number | Reliability or reliability sequence number |
|---|---|
| 923 | 2188 |
| 924 | 709 |
| 925 | 440 |
| 926 | 1125 |
| 927 | 4256 |
| 928 | 900 |
| 929 | 2078 |
| 930 | 1304 |
| 931 | 371 |
| 932 | 628 |
| 933 | 2313 |
| 934 | 1171 |
| 935 | 4612 |
| 936 | 803 |
| 937 | 1546 |
| 938 | 423 |
| 939 | 2194 |
| 940 | 682 |
| 941 | 1200 |
| 942 | 4288 |
| 943 | 481 |
| 944 | 2119 |
| 945 | 573 |
| 946 | 1166 |
| 947 | 250 |
| 948 | 2209 |
| 949 | 1316 |
| 950 | 4166 |
| 951 | 794 |
| 952 | 689 |
| 953 | 1055 |
| 954 | 2563 |
| 955 | 413 |
| 956 | 1224 |
| 957 | 603 |
| 958 | 4140 |
| 959 | 2093 |
| 960 | 366 |
| 961 | 1554 |
| 962 | 848 |
| 963 | 2310 |
| 964 | 1287 |
| 965 | 4368 |
| 966 | 710 |
| 967 | 373 |
| 968 | 1114 |
| 969 | 2148 |
| 970 | 805 |
| 971 | 1173 |
| 972 | 468 |
| 973 | 4227 |
| 974 | 2099 |
| 975 | 684 |
| 976 | 1409 |
| 977 | 427 |
| 978 | 3088 |
| 979 | 1664 |
| 980 | 4177 |
| 981 | 632 |
| 982 | 793 |
| 983 | 2196 |
| 984 | 1126 |
| 985 | 252 |
| 986 | 1129 |
| 987 | 4146 |
| 988 | 2094 |
| 989 | 713 |
| 990 | 482 |
| 991 | 1187 |
| 992 | 790 |
| 993 | 2321 |
| 994 | 1346 |
| 995 | 4169 |

TABLE Q17-continued with a sequence length of 8192:

| Polarized channel sequence number | Reliability or reliability sequence number |
|---|---|
| 996 | 574 |
| 997 | 472 |
| 998 | 2816 |
| 999 | 1116 |
| 1000 | 904 |
| 1001 | 1548 |
| 1002 | 4111 |
| 1003 | 2123 |
| 1004 | 414 |
| 1005 | 1071 |
| 1006 | 655 |
| 1007 | 2152 |
| 1008 | 615 |
| 1009 | 4229 |
| 1010 | 1291 |
| 1011 | 374 |
| 1012 | 2210 |
| 1013 | 1232 |
| 1014 | 806 |
| 1015 | 690 |
| 1016 | 6146 |
| 1017 | 2314 |
| 1018 | 1174 |
| 1019 | 223 |
| 1020 | 1569 |
| 1021 | 2101 |
| 1022 | 864 |
| 1023 | 429 |
| 1024 | 4384 |
| 1025 | 1320 |
| 1026 | 2241 |
| 1027 | 605 |
| 1028 | 1177 |
| 1029 | 714 |
| 1030 | 2200 |
| 1031 | 4616 |
| 1032 | 1189 |
| 1033 | 377 |
| 1034 | 835 |
| 1035 | 2565 |
| 1036 | 1348 |
| 1037 | 455 |
| 1038 | 4148 |
| 1039 | 1601 |
| 1040 | 2125 |
| 1041 | 619 |
| 1042 | 809 |
| 1043 | 1130 |
| 1044 | 3104 |
| 1045 | 4119 |
| 1046 | 435 |
| 1047 | 1079 |
| 1048 | 692 |
| 1049 | 2322 |
| 1050 | 1410 |
| 1051 | 912 |
| 1052 | 4230 |
| 1053 | 484 |
| 1054 | 2212 |
| 1055 | 1137 |
| 1056 | 663 |
| 1057 | 1178 |
| 1058 | 2102 |
| 1059 | 4172 |
| 1060 | 430 |
| 1061 | 1556 |
| 1062 | 721 |
| 1063 | 2131 |
| 1064 | 796 |
| 1065 | 5124 |
| 1066 | 1299 |
| 1067 | 239 |
| 1068 | 2432 |

TABLE Q17-continued with a sequence length of 8192:

| Polarized channel sequence number | Reliability or reliability sequence number |
|---|---|
| 1069 | 1103 |
| 1070 | 606 |
| 1071 | 1132 |
| 1072 | 4233 |
| 1073 | 2624 |
| 1074 | 837 |
| 1075 | 378 |
| 1076 | 1570 |
| 1077 | 2105 |
| 1078 | 716 |
| 1079 | 4178 |
| 1080 | 1293 |
| 1081 | 459 |
| 1082 | 2160 |
| 1083 | 1248 |
| 1084 | 810 |
| 1085 | 1190 |
| 1086 | 4355 |
| 1087 | 2183 |
| 1088 | 667 |
| 1089 | 319 |
| 1090 | 1328 |
| 1091 | 2316 |
| 1092 | 817 |
| 1093 | 4152 |
| 1094 | 1560 |
| 1095 | 722 |
| 1096 | 2126 |
| 1097 | 1219 |
| 1098 | 437 |
| 1099 | 4123 |
| 1100 | 3075 |
| 1101 | 621 |
| 1102 | 1083 |
| 1103 | 842 |
| 1104 | 2242 |
| 1105 | 1294 |
| 1106 | 4193 |
| 1107 | 488 |
| 1108 | 1193 |
| 1109 | 2569 |
| 1110 | 696 |
| 1111 | 1572 |
| 1112 | 380 |
| 1113 | 4624 |
| 1114 | 2133 |
| 1115 | 928 |
| 1116 | 1352 |
| 1117 | 627 |
| 1118 | 2337 |
| 1119 | 4135 |
| 1120 | 1138 |
| 1121 | 251 |
| 1122 | 2106 |
| 1123 | 1180 |
| 1124 | 960 |
| 1125 | 1301 |
| 1126 | 4357 |
| 1127 | 2216 |
| 1128 | 679 |
| 1129 | 461 |
| 1130 | 1793 |
| 1131 | 2187 |
| 1132 | 4180 |
| 1133 | 838 |
| 1134 | 1111 |
| 1135 | 2369 |
| 1136 | 737 |
| 1137 | 1221 |
| 1138 | 438 |
| 1139 | 4234 |
| 1140 | 2566 |
| 1141 | 1412 |

TABLE Q17-continued

| with a sequence length of 8192: | |
|---|---|
| Polarized channel sequence number | Reliability or reliability sequence number |
| 1142 | 812 |
| 1143 | 669 |
| 1144 | 2147 |
| 1145 | 4241 |
| 1146 | 1543 |
| 1147 | 467 |
| 1148 | 1140 |
| 1149 | 3328 |
| 1150 | 899 |
| 1151 | 1315 |
| 1152 | 4125 |
| 1153 | 2134 |
| 1154 | 622 |
| 1155 | 1194 |
| 1156 | 441 |
| 1157 | 2324 |
| 1158 | 4139 |
| 1159 | 1085 |
| 1160 | 849 |
| 1161 | 1665 |
| 1162 | 2108 |
| 1163 | 629 |
| 1164 | 4416 |
| 1165 | 496 |
| 1166 | 2137 |
| 1167 | 1306 |
| 1168 | 724 |
| 1169 | 1201 |
| 1170 | 2577 |
| 1171 | 5128 |
| 1172 | 462 |
| 1173 | 1115 |
| 1174 | 2244 |
| 1175 | 818 |
| 1176 | 1602 |
| 1177 | 4640 |
| 1178 | 683 |
| 1179 | 2338 |
| 1180 | 1360 |
| 1181 | 247 |
| 1182 | 1222 |
| 1183 | 4194 |
| 1184 | 2189 |
| 1185 | 841 |
| 1186 | 738 |
| 1187 | 2149 |
| 1188 | 1317 |
| 1189 | 6148 |
| 1190 | 351 |
| 1191 | 1196 |
| 1192 | 2328 |
| 1193 | 783 |
| 1194 | 1547 |
| 1195 | 3584 |
| 1196 | 4184 |
| 1197 | 728 |
| 1198 | 1144 |
| 1199 | 901 |
| 1200 | 2195 |
| 1201 | 1305 |
| 1202 | 4236 |
| 1203 | 469 |
| 1204 | 2570 |
| 1205 | 1225 |
| 1206 | 670 |
| 1207 | 1576 |
| 1208 | 4126 |
| 1209 | 2224 |
| 1210 | 820 |
| 1211 | 442 |
| 1212 | 2190 |
| 1213 | 1302 |
| 1214 | 4361 |

TABLE Q17-continued

| with a sequence length of 8192: | |
|---|---|
| Polarized channel sequence number | Reliability or reliability sequence number |
| 1215 | 630 |
| 1216 | 1086 |
| 1217 | 2340 |
| 1218 | 791 |
| 1219 | 1416 |
| 1220 | 4242 |
| 1221 | 2079 |
| 1222 | 483 |
| 1223 | 1604 |
| 1224 | 685 |
| 1225 | 2248 |
| 1226 | 4167 |
| 1227 | 1167 |
| 1228 | 902 |
| 1229 | 2578 |
| 1230 | 1127 |
| 1231 | 367 |
| 1232 | 4257 |
| 1233 | 1318 |
| 1234 | 2311 |
| 1235 | 633 |
| 1236 | 1666 |
| 1237 | 3077 |
| 1238 | 4611 |
| 1239 | 844 |
| 1240 | 1202 |
| 1241 | 470 |
| 1242 | 2138 |
| 1243 | 1376 |
| 1244 | 4141 |
| 1245 | 711 |
| 1246 | 2197 |
| 1247 | 1117 |
| 1248 | 691 |
| 1249 | 444 |
| 1250 | 4358 |
| 1251 | 2433 |
| 1252 | 1555 |
| 1253 | 740 |
| 1254 | 2688 |
| 1255 | 1226 |
| 1256 | 4196 |
| 1257 | 905 |
| 1258 | 2150 |
| 1259 | 1347 |
| 1260 | 473 |
| 1261 | 1131 |
| 1262 | 4147 |
| 1263 | 2153 |
| 1264 | 686 |
| 1265 | 1549 |
| 1266 | 2211 |
| 1267 | 850 |
| 1268 | 5136 |
| 1269 | 1321 |
| 1270 | 634 |
| 1271 | 2370 |
| 1272 | 1204 |
| 1273 | 253 |
| 1274 | 4244 |
| 1275 | 2140 |
| 1276 | 1424 |
| 1277 | 824 |
| 1278 | 3136 |
| 1279 | 1584 |
| 1280 | 4142 |
| 1281 | 715 |
| 1282 | 1175 |
| 1283 | 2572 |
| 1284 | 485 |
| 1285 | 4369 |
| 1286 | 1233 |
| 1287 | 2095 |

TABLE Q17-continued with a sequence length of 8192:

| Polarized channel sequence number | Reliability or reliability sequence number |
|---|---|
| 1288 | 795 |
| 1289 | 1308 |
| 1290 | 2315 |
| 1291 | 4864 |
| 1292 | 575 |
| 1293 | 1550 |
| 1294 | 415 |
| 1295 | 2256 |
| 1296 | 1118 |
| 1297 | 4171 |
| 1298 | 865 |
| 1299 | 2198 |
| 1300 | 1349 |
| 1301 | 693 |
| 1302 | 2593 |
| 1303 | 4200 |
| 1304 | 1228 |
| 1305 | 807 |
| 1306 | 2344 |
| 1307 | 1608 |
| 1308 | 4258 |
| 1309 | 375 |
| 1310 | 1322 |
| 1311 | 2201 |
| 1312 | 744 |
| 1313 | 1179 |
| 1314 | 4362 |
| 1315 | 2213 |
| 1316 | 852 |
| 1317 | 1794 |
| 1318 | 3081 |
| 1319 | 474 |
| 1320 | 4149 |
| 1321 | 1329 |
| 1322 | 906 |
| 1323 | 2372 |
| 1324 | 1234 |
| 1325 | 6152 |
| 1326 | 636 |
| 1327 | 2625 |
| 1328 | 1133 |
| 1329 | 486 |
| 1330 | 2154 |
| 1331 | 4289 |
| 1332 | 1557 |
| 1333 | 913 |
| 1334 | 2103 |
| 1335 | 1354 |
| 1336 | 717 |
| 1337 | 4248 |
| 1338 | 2434 |
| 1339 | 1208 |
| 1340 | 797 |
| 1341 | 1440 |
| 1342 | 4613 |
| 1343 | 2161 |
| 1344 | 489 |
| 1345 | 1668 |
| 1346 | 2202 |
| 1347 | 694 |
| 1348 | 4173 |
| 1349 | 1139 |
| 1350 | 3078 |
| 1351 | 811 |
| 1352 | 1472 |
| 1353 | 5152 |
| 1354 | 2580 |
| 1355 | 431 |
| 1356 | 1571 |
| 1357 | 2323 |
| 1358 | 723 |
| 1359 | 4370 |
| 1360 | 1191 |

TABLE Q17-continued with a sequence length of 8192:

| Polarized channel sequence number | Reliability or reliability sequence number |
|---|---|
| 1361 | 866 |
| 1362 | 2127 |
| 1363 | 697 |
| 1364 | 4260 |
| 1365 | 379 |
| 1366 | 2156 |
| 1367 | 1350 |
| 1368 | 856 |
| 1369 | 2594 |
| 1370 | 4150 |
| 1371 | 1249 |
| 1372 | 752 |
| 1373 | 2317 |
| 1374 | 1562 |
| 1375 | 4179 |
| 1376 | 476 |
| 1377 | 2272 |
| 1378 | 1324 |
| 1379 | 908 |
| 1380 | 2214 |
| 1381 | 4480 |
| 1382 | 1181 |
| 1383 | 718 |
| 1384 | 1616 |
| 1385 | 3089 |
| 1386 | 4672 |
| 1387 | 798 |
| 1388 | 1411 |
| 1389 | 2352 |
| 1390 | 254 |
| 1391 | 4153 |
| 1392 | 1134 |
| 1393 | 2584 |
| 1394 | 607 |
| 1395 | 1361 |
| 1396 | 2243 |
| 1397 | 4208 |
| 1398 | 914 |
| 1399 | 1573 |
| 1400 | 2107 |
| 1401 | 839 |
| 1402 | 4231 |
| 1403 | 1141 |
| 1404 | 2318 |
| 1405 | 439 |
| 1406 | 1236 |
| 1407 | 2217 |
| 1408 | 4364 |
| 1409 | 725 |
| 1410 | 1561 |
| 1411 | 2596 |
| 1412 | 929 |
| 1413 | 4174 |
| 1414 | 1330 |
| 1415 | 3082 |
| 1416 | 698 |
| 1417 | 1195 |
| 1418 | 5123 |
| 1419 | 2376 |
| 1420 | 490 |
| 1421 | 1353 |
| 1422 | 2162 |
| 1423 | 4290 |
| 1424 | 813 |
| 1425 | 1558 |
| 1426 | 739 |
| 1427 | 2204 |
| 1428 | 1250 |
| 1429 | 4617 |
| 1430 | 381 |
| 1431 | 2325 |
| 1432 | 1295 |
| 1433 | 868 |

TABLE Q17-continued

| with a sequence length of 8192: | |
|---|---|
| Polarized channel sequence number | Reliability or reliability sequence number |
| 1434 | 6160 |
| 1435 | 2817 |
| 1436 | 1672 |
| 1437 | 623 |
| 1438 | 2135 |
| 1439 | 4181 |
| 1440 | 1240 |
| 1441 | 819 |
| 1442 | 2245 |
| 1443 | 1413 |
| 1444 | 4385 |
| 1445 | 497 |
| 1446 | 3090 |
| 1447 | 1796 |
| 1448 | 916 |
| 1449 | 2436 |
| 1450 | 4154 |
| 1451 | 1182 |
| 1452 | 726 |
| 1453 | 2567 |
| 1454 | 1332 |
| 1455 | 4264 |
| 1456 | 814 |
| 1457 | 2164 |
| 1458 | 1574 |
| 1459 | 463 |
| 1460 | 4235 |
| 1461 | 2339 |
| 1462 | 1142 |
| 1463 | 700 |
| 1464 | 2218 |
| 1465 | 4417 |
| 1466 | 1303 |
| 1467 | 843 |
| 1468 | 2109 |
| 1469 | 1197 |
| 1470 | 4614 |
| 1471 | 729 |
| 1472 | 2689 |
| 1473 | 1632 |
| 1474 | 443 |
| 1475 | 4195 |
| 1476 | 3200 |
| 1477 | 1414 |
| 1478 | 1145 |
| 1479 | 2330 |
| 1480 | 5376 |
| 1481 | 872 |
| 1482 | 2225 |
| 1483 | 1603 |
| 1484 | 930 |
| 1485 | 2139 |
| 1486 | 4182 |
| 1487 | 1356 |
| 1488 | 741 |
| 1489 | 2626 |
| 1490 | 1223 |
| 1491 | 4372 |
| 1492 | 492 |
| 1493 | 2384 |
| 1494 | 1577 |
| 1495 | 821 |
| 1496 | 4156 |
| 1497 | 2246 |
| 1498 | 1203 |
| 1499 | 671 |
| 1500 | 2341 |
| 1501 | 4185 |
| 1502 | 1252 |
| 1503 | 961 |
| 1504 | 3084 |
| 1505 | 1680 |
| 1506 | 4625 |

TABLE Q17-continued

| with a sequence length of 8192: | |
|---|---|
| Polarized channel sequence number | Reliability or reliability sequence number |
| 1507 | 382 |
| 1508 | 2220 |
| 1509 | 1417 |
| 1510 | 920 |
| 1511 | 4292 |
| 1512 | 2571 |
| 1513 | 1198 |
| 1514 | 631 |
| 1515 | 2168 |
| 1516 | 4386 |
| 1517 | 1564 |
| 1518 | 845 |
| 1519 | 2329 |
| 1520 | 1362 |
| 1521 | 4237 |
| 1522 | 498 |
| 1523 | 2249 |
| 1524 | 1146 |
| 1525 | 2600 |
| 1526 | 6176 |
| 1527 | 1605 |
| 1528 | 730 |
| 1529 | 3105 |
| 1530 | 1336 |
| 1531 | 4197 |
| 1532 | 932 |
| 1533 | 2326 |
| 1534 | 1227 |
| 1535 | 742 |
| 1536 | 4376 |
| 1537 | 2110 |
| 1538 | 1307 |
| 1539 | 822 |
| 1540 | 5632 |
| 1541 | 2440 |
| 1542 | 1578 |
| 1543 | 500 |
| 1544 | 2628 |
| 1545 | 4243 |
| 1546 | 1087 |
| 1547 | 851 |
| 1548 | 2191 |
| 1549 | 1377 |
| 1550 | 4618 |
| 1551 | 2151 |
| 1552 | 745 |
| 1553 | 1800 |
| 1554 | 2342 |
| 1555 | 4272 |
| 1556 | 1205 |
| 1557 | 825 |
| 1558 | 3137 |
| 1559 | 1319 |
| 1560 | 4238 |
| 1561 | 445 |
| 1562 | 2690 |
| 1563 | 1585 |
| 1564 | 880 |
| 1565 | 4388 |
| 1566 | 2226 |
| 1567 | 1256 |
| 1568 | 687 |
| 1569 | 2400 |
| 1570 | 4127 |
| 1571 | 1364 |
| 1572 | 2141 |
| 1573 | 903 |
| 1574 | 4296 |
| 1575 | 1610 |
| 1576 | 2579 |
| 1577 | 471 |
| 1578 | 1418 |
| 1579 | 4626 |

TABLE Q17-continued with a sequence length of 8192:

| Polarized channel sequence number | Reliability or reliability sequence number |
|---|---|
| 1580 | 2250 |
| 1581 | 1696 |
| 1582 | 635 |
| 1583 | 3092 |
| 1584 | 4359 |
| 1585 | 1148 |
| 1586 | 846 |
| 1587 | 2371 |
| 1588 | 1425 |
| 1589 | 5125 |
| 1590 | 2155 |
| 1591 | 962 |
| 1592 | 1728 |
| 1593 | 2573 |
| 1594 | 4186 |
| 1595 | 732 |
| 1596 | 1229 |
| 1597 | 2345 |
| 1598 | 4245 |
| 1599 | 255 |
| 1600 | 1309 |
| 1601 | 2228 |
| 1602 | 1606 |
| 1603 | 4481 |
| 1604 | 3106 |
| 1605 | 853 |
| 1606 | 1206 |
| 1607 | 2448 |
| 1608 | 6147 |
| 1609 | 695 |
| 1610 | 1323 |
| 1611 | 2608 |
| 1612 | 4736 |
| 1613 | 826 |
| 1614 | 1580 |
| 1615 | 2199 |
| 1616 | 475 |
| 1617 | 4198 |
| 1618 | 2257 |
| 1619 | 1235 |
| 1620 | 936 |
| 1621 | 2332 |
| 1622 | 4201 |
| 1623 | 1378 |
| 1624 | 1808 |
| 1625 | 2574 |
| 1626 | 746 |
| 1627 | 4259 |
| 1628 | 1209 |
| 1629 | 3096 |
| 1630 | 907 |
| 1631 | 4418 |
| 1632 | 2142 |
| 1633 | 1368 |
| 1634 | 867 |
| 1635 | 2373 |
| 1636 | 4188 |
| 1637 | 1667 |
| 1638 | 487 |
| 1639 | 2252 |
| 1640 | 5184 |
| 1641 | 1264 |
| 1642 | 2632 |
| 1643 | 1420 |
| 1644 | 637 |
| 1645 | 4620 |
| 1646 | 2346 |
| 1647 | 1617 |
| 1648 | 854 |
| 1649 | 2203 |
| 1650 | 4143 |
| 1651 | 1230 |
| 1652 | 3108 |

TABLE Q17-continued with a sequence length of 8192:

| Polarized channel sequence number | Reliability or reliability sequence number |
|---|---|
| 1653 | 828 |
| 1654 | 4363 |
| 1655 | 1310 |
| 1656 | 2818 |
| 1657 | 753 |
| 1658 | 1586 |
| 1659 | 4304 |
| 1660 | 2353 |
| 1661 | 1119 |
| 1662 | 2258 |
| 1663 | 504 |
| 1664 | 4246 |
| 1665 | 1609 |
| 1666 | 2157 |
| 1667 | 857 |
| 1668 | 4641 |
| 1669 | 1426 |
| 1670 | 2581 |
| 1671 | 719 |
| 1672 | 3329 |
| 1673 | 4392 |
| 1674 | 1351 |
| 1675 | 1551 |
| 1676 | 2378 |
| 1677 | 4249 |
| 1678 | 964 |
| 1679 | 1237 |
| 1680 | 2232 |
| 1681 | 909 |
| 1682 | 6400 |
| 1683 | 2464 |
| 1684 | 1441 |
| 1685 | 446 |
| 1686 | 4261 |
| 1687 | 2692 |
| 1688 | 1669 |
| 1689 | 699 |
| 1690 | 2163 |
| 1691 | 5129 |
| 1692 | 1210 |
| 1693 | 3079 |
| 1694 | 1824 |
| 1695 | 4420 |
| 1696 | 869 |
| 1697 | 2496 |
| 1698 | 1325 |
| 1699 | 915 |
| 1700 | 4673 |
| 1701 | 2595 |
| 1702 | 1251 |
| 1703 | 2215 |
| 1704 | 4202 |
| 1705 | 477 |
| 1706 | 1588 |
| 1707 | 2374 |
| 1708 | 1380 |
| 1709 | 4151 |
| 1710 | 2273 |
| 1711 | 748 |
| 1712 | 1135 |
| 1713 | 4482 |
| 1714 | 2586 |
| 1715 | 944 |
| 1716 | 1559 |
| 1717 | 3201 |
| 1718 | 4209 |
| 1719 | 910 |
| 1720 | 2348 |
| 1721 | 1331 |
| 1722 | 4250 |
| 1723 | 1670 |
| 1724 | 2205 |
| 1725 | 638 |

TABLE Q17-continued with a sequence length of 8192:

| Polarized channel sequence number | Reliability or reliability sequence number |
|---|---|
| 1726 | 5126 |
| 1727 | 2640 |
| 1728 | 1428 |
| 1729 | 799 |
| 1730 | 2435 |
| 1731 | 4628 |
| 1732 | 1238 |
| 1733 | 1612 |
| 1734 | 2158 |
| 1735 | 4371 |
| 1736 | 491 |
| 1737 | 3138 |
| 1738 | 1326 |
| 1739 | 968 |
| 1740 | 4175 |
| 1741 | 2385 |
| 1742 | 1212 |
| 1743 | 2597 |
| 1744 | 4204 |
| 1745 | 754 |
| 1746 | 1673 |
| 1747 | 2165 |
| 1748 | 6656 |
| 1749 | 1355 |
| 1750 | 858 |
| 1751 | 2260 |
| 1752 | 1618 |
| 1753 | 4642 |
| 1754 | 2585 |
| 1755 | 917 |
| 1756 | 1241 |
| 1757 | 4365 |
| 1758 | 3083 |
| 1759 | 478 |
| 1760 | 2354 |
| 1761 | 4320 |
| 1762 | 1384 |
| 1763 | 1795 |
| 1764 | 2219 |
| 1765 | 756 |
| 1766 | 4262 |
| 1767 | 2377 |
| 1768 | 1442 |
| 1769 | 870 |
| 1770 | 5137 |
| 1771 | 2582 |
| 1772 | 1253 |
| 1773 | 2274 |
| 1774 | 4400 |
| 1775 | 1592 |
| 1776 | 873 |
| 1777 | 3112 |
| 1778 | 1333 |
| 1779 | 4632 |
| 1780 | 2319 |
| 1781 | 701 |
| 1782 | 1563 |
| 1783 | 4291 |
| 1784 | 2696 |
| 1785 | 1183 |
| 1786 | 2264 |
| 1787 | 4155 |
| 1788 | 493 |
| 1789 | 1473 |
| 1790 | 2437 |
| 1791 | 931 |
| 1792 | 4366 |
| 1793 | 3140 |
| 1794 | 1633 |
| 1795 | 860 |
| 1796 | 4265 |
| 1797 | 2820 |
| 1798 | 1432 |

TABLE Q17-continued with a sequence length of 8192:

| Polarized channel sequence number | Reliability or reliability sequence number |
|---|---|
| 1799 | 2206 |
| 1800 | 4644 |
| 1801 | 1575 |
| 1802 | 727 |
| 1803 | 2356 |
| 1804 | 5130 |
| 1805 | 1143 |
| 1806 | 2598 |
| 1807 | 815 |
| 1808 | 4424 |
| 1809 | 1357 |
| 1810 | 2166 |
| 1811 | 1797 |
| 1812 | 3585 |
| 1813 | 7168 |
| 1814 | 976 |
| 1815 | 1242 |
| 1816 | 2327 |
| 1817 | 4210 |
| 1818 | 499 |
| 1819 | 2221 |
| 1820 | 1620 |
| 1821 | 4252 |
| 1822 | 1444 |
| 1823 | 2656 |
| 1824 | 918 |
| 1825 | 4373 |
| 1826 | 2438 |
| 1827 | 1254 |
| 1828 | 731 |
| 1829 | 2169 |
| 1830 | 4865 |
| 1831 | 1674 |
| 1832 | 3202 |
| 1833 | 1334 |
| 1834 | 4183 |
| 1835 | 921 |
| 1836 | 2627 |
| 1837 | 1681 |
| 1838 | 4293 |
| 1839 | 2380 |
| 1840 | 933 |
| 1841 | 1363 |
| 1842 | 5138 |
| 1843 | 2247 |
| 1844 | 1565 |
| 1845 | 2601 |
| 1846 | 4484 |
| 1847 | 743 |
| 1848 | 1257 |
| 1849 | 3091 |
| 1850 | 4615 |
| 1851 | 494 |
| 1852 | 2227 |
| 1853 | 1337 |
| 1854 | 4212 |
| 1855 | 2276 |
| 1856 | 1579 |
| 1857 | 874 |
| 1858 | 2704 |
| 1859 | 4387 |
| 1860 | 1392 |
| 1861 | 2441 |
| 1862 | 823 |
| 1863 | 4266 |
| 1864 | 1856 |
| 1865 | 3085 |
| 1866 | 1199 |
| 1867 | 6149 |
| 1868 | 2222 |
| 1869 | 760 |
| 1870 | 1415 |
| 1871 | 4157 |

TABLE Q17-continued with a sequence length of 8192:

| Polarized channel sequence number | Reliability or reliability sequence number |
|---|---|
| 1872 | 2588 |
| 1873 | 1634 |
| 1874 | 2386 |
| 1875 | 4737 |
| 1876 | 881 |
| 1877 | 2170 |
| 1878 | 1147 |
| 1879 | 5248 |
| 1880 | 501 |
| 1881 | 2629 |
| 1882 | 1624 |
| 1883 | 4378 |
| 1884 | 3120 |
| 1885 | 1358 |
| 1886 | 922 |
| 1887 | 4273 |
| 1888 | 2360 |
| 1889 | 1474 |
| 1890 | 2251 |
| 1891 | 4187 |
| 1892 | 847 |
| 1893 | 2331 |
| 1894 | 1676 |
| 1895 | 4674 |
| 1896 | 1244 |
| 1897 | 2602 |
| 1898 | 702 |
| 1899 | 4432 |
| 1900 | 3086 |
| 1901 | 1566 |
| 1902 | 876 |
| 1903 | 4294 |
| 1904 | 2111 |
| 1905 | 1365 |
| 1906 | 2401 |
| 1907 | 4389 |
| 1908 | 1801 |
| 1909 | 2824 |
| 1910 | 992 |
| 1911 | 5132 |
| 1912 | 1207 |
| 1913 | 2229 |
| 1914 | 1338 |
| 1915 | 4268 |
| 1916 | 3144 |
| 1917 | 733 |
| 1918 | 1682 |
| 1919 | 2343 |
| 1920 | 4619 |
| 1921 | 383 |
| 1922 | 2609 |
| 1923 | 6208 |
| 1924 | 1448 |
| 1925 | 2280 |
| 1926 | 1607 |
| 1927 | 4216 |
| 1928 | 934 |
| 1929 | 2388 |
| 1930 | 1258 |
| 1931 | 4377 |
| 1932 | 3330 |
| 1933 | 1697 |
| 1934 | 2634 |
| 1935 | 4297 |
| 1936 | 963 |
| 1937 | 1419 |
| 1938 | 2442 |
| 1939 | 4648 |
| 1940 | 827 |
| 1941 | 2720 |
| 1942 | 1581 |
| 1943 | 5153 |
| 1944 | 2172 |

TABLE Q17-continued with a sequence length of 8192:

| Polarized channel sequence number | Reliability or reliability sequence number |
|---|---|
| 1945 | 1379 |
| 1946 | 747 |
| 1947 | 4374 |
| 1948 | 2449 |
| 1949 | 1149 |
| 1950 | 3093 |
| 1951 | 4158 |
| 1952 | 1798 |
| 1953 | 2752 |
| 1954 | 937 |
| 1955 | 4488 |
| 1956 | 1366 |
| 1957 | 2253 |
| 1958 | 447 |
| 1959 | 4676 |
| 1960 | 2333 |
| 1961 | 1636 |
| 1962 | 2630 |
| 1963 | 4239 |
| 1964 | 1340 |
| 1965 | 882 |
| 1966 | 3204 |
| 1967 | 4199 |
| 1968 | 1587 |
| 1969 | 2230 |
| 1970 | 1265 |
| 1971 | 6153 |
| 1972 | 2347 |
| 1973 | 924 |
| 1974 | 1369 |
| 1975 | 4390 |
| 1976 | 2604 |
| 1977 | 734 |
| 1978 | 2259 |
| 1979 | 5185 |
| 1980 | 1684 |
| 1981 | 3107 |
| 1982 | 1231 |
| 1983 | 4738 |
| 1984 | 855 |
| 1985 | 2402 |
| 1986 | 4274 |
| 1987 | 1582 |
| 1988 | 2832 |
| 1989 | 1476 |
| 1990 | 4448 |
| 1991 | 2233 |
| 1992 | 965 |
| 1993 | 3098 |
| 1994 | 4189 |
| 1995 | 1809 |
| 1996 | 749 |
| 1997 | 2392 |
| 1998 | 4627 |
| 1999 | 1421 |
| 2000 | 2691 |
| 2001 | 1611 |
| 2002 | 4298 |
| 2003 | 2288 |
| 2004 | 502 |
| 2005 | 1211 |
| 2006 | 5140 |
| 2007 | 2444 |
| 2008 | 1381 |
| 2009 | 3152 |
| 2010 | 4419 |
| 2011 | 884 |
| 2012 | 2641 |
| 2013 | 4203 |
| 2014 | 1640 |
| 2015 | 2254 |
| 2016 | 1427 |
| 2017 | 6150 |

TABLE Q17-continued with a sequence length of 8192:

| Polarized channel sequence number | Reliability or reliability sequence number |
|---|---|
| 2018 | 938 |
| 2019 | 2334 |
| 2020 | 1698 |
| 2021 | 4621 |
| 2022 | 2610 |
| 2023 | 1260 |
| 2024 | 3109 |
| 2025 | 4393 |
| 2026 | 829 |
| 2027 | 1802 |
| 2028 | 2143 |
| 2029 | 4276 |
| 2030 | 755 |
| 2031 | 2633 |
| 2032 | 5154 |
| 2033 | 1456 |
| 2034 | 2450 |
| 2035 | 1589 |
| 2036 | 4496 |
| 2037 | 2375 |
| 2038 | 945 |
| 2039 | 1422 |
| 2040 | 4656 |
| 2041 | 3097 |
| 2042 | 1729 |
| 2043 | 2575 |
| 2044 | 4247 |
| 2045 | 859 |
| 2046 | 2261 |
| 2047 | 1150 |
| 2048 | 4305 |
| 2049 | 2465 |
| 2050 | 1688 |
| 2051 | 4380 |
| 2052 | 505 |
| 2053 | 3094 |
| 2054 | 1311 |
| 2055 | 4622 |
| 2056 | 2693 |
| 2057 | 1480 |
| 2058 | 2234 |
| 2059 | 5144 |
| 2060 | 966 |
| 2061 | 2848 |
| 2062 | 1613 |
| 2063 | 6161 |
| 2064 | 750 |
| 2065 | 2349 |
| 2066 | 4190 |
| 2067 | 1266 |
| 2068 | 3208 |
| 2069 | 1810 |
| 2070 | 4421 |
| 2071 | 2275 |
| 2072 | 940 |
| 2073 | 2612 |
| 2074 | 4300 |
| 2075 | 1370 |
| 2076 | 2404 |
| 2077 | 4680 |
| 2078 | 1700 |
| 2079 | 888 |
| 2080 | 2159 |
| 2081 | 4394 |
| 2082 | 1429 |
| 2083 | 3586 |
| 2084 | 1590 |
| 2085 | 4251 |
| 2086 | 2583 |
| 2087 | 969 |
| 2088 | 2355 |
| 2089 | 5156 |
| 2090 | 1268 |

TABLE Q17-continued with a sequence length of 8192:

| Polarized channel sequence number | Reliability or reliability sequence number |
|---|---|
| 2091 | 1619 |
| 2092 | 4866 |
| 2093 | 2694 |
| 2094 | 830 |
| 2095 | 3332 |
| 2096 | 4401 |
| 2097 | 1382 |
| 2098 | 2452 |
| 2099 | 1920 |
| 2100 | 4306 |
| 2101 | 2262 |
| 2102 | 506 |
| 2103 | 6154 |
| 2104 | 2636 |
| 2105 | 1385 |
| 2106 | 1593 |
| 2107 | 4205 |
| 2108 | 2350 |
| 2109 | 757 |
| 2110 | 3110 |
| 2111 | 4629 |
| 2112 | 1213 |
| 2113 | 2236 |
| 2114 | 5377 |
| 2115 | 1648 |
| 2116 | 2697 |
| 2117 | 911 |
| 2118 | 4426 |
| 2119 | 2379 |
| 2120 | 1443 |
| 2121 | 3168 |
| 2122 | 4280 |
| 2123 | 1671 |
| 2124 | 871 |
| 2125 | 4512 |
| 2126 | 2642 |
| 2127 | 1372 |
| 2128 | 2265 |
| 2129 | 4740 |
| 2130 | 946 |
| 2131 | 2408 |
| 2132 | 4211 |
| 2133 | 1239 |
| 2134 | 2819 |
| 2135 | 1804 |
| 2136 | 5127 |
| 2137 | 3139 |
| 2138 | 639 |
| 2139 | 2466 |
| 2140 | 4544 |
| 2141 | 1327 |
| 2142 | 1614 |
| 2143 | 6162 |
| 2144 | 2277 |
| 2145 | 861 |
| 2146 | 2616 |
| 2147 | 4643 |
| 2148 | 1488 |
| 2149 | 3113 |
| 2150 | 4263 |
| 2151 | 1730 |
| 2152 | 2357 |
| 2153 | 970 |
| 2154 | 4422 |
| 2155 | 2587 |
| 2156 | 1430 |
| 2157 | 2207 |
| 2158 | 4321 |
| 2159 | 1621 |
| 2160 | 508 |
| 2161 | 4634 |
| 2162 | 3216 |
| 2163 | 1243 |

TABLE Q17-continued with a sequence length of 8192:

| Polarized channel sequence number | Reliability or reliability sequence number |
|---|---|
| 2164 | 2497 |
| 2165 | 5249 |
| 2166 | 1825 |
| 2167 | 2657 |
| 2168 | 4396 |
| 2169 | 875 |
| 2170 | 2456 |
| 2171 | 1433 |
| 2172 | 4253 |
| 2173 | 2599 |
| 2174 | 1594 |
| 2175 | 3100 |
| 2176 | 4688 |
| 2177 | 703 |
| 2178 | 2167 |
| 2179 | 4483 |
| 2180 | 1445 |
| 2181 | 1704 |
| 2182 | 2381 |
| 2183 | 6272 |
| 2184 | 1255 |
| 2185 | 2821 |
| 2186 | 4206 |
| 2187 | 948 |
| 2188 | 3141 |
| 2189 | 1675 |
| 2190 | 5186 |
| 2191 | 2266 |
| 2192 | 1386 |
| 2193 | 4433 |
| 2194 | 2644 |
| 2195 | 919 |
| 2196 | 2468 |
| 2197 | 4645 |
| 2198 | 1857 |
| 2199 | 3114 |
| 2200 | 4213 |
| 2201 | 1335 |
| 2202 | 2278 |
| 2203 | 977 |
| 2204 | 4308 |
| 2205 | 1635 |
| 2206 | 2698 |
| 2207 | 4633 |
| 2208 | 1272 |
| 2209 | 2358 |
| 2210 | 862 |
| 2211 | 5131 |
| 2212 | 3336 |
| 2213 | 1622 |
| 2214 | 4402 |
| 2215 | 2705 |
| 2216 | 1393 |
| 2217 | 2387 |
| 2218 | 6156 |
| 2219 | 758 |
| 2220 | 2589 |
| 2221 | 4267 |
| 2222 | 1812 |
| 2223 | 3121 |
| 2224 | 1434 |
| 2225 | 4425 |
| 2226 | 2281 |
| 2227 | 479 |
| 2228 | 4630 |
| 2229 | 2361 |
| 2230 | 1596 |
| 2231 | 2603 |
| 2232 | 4322 |
| 2233 | 1359 |
| 2234 | 972 |
| 2235 | 5160 |
| 2236 | 3146 |

TABLE Q17-continued with a sequence length of 8192:

| Polarized channel sequence number | Reliability or reliability sequence number |
|---|---|
| 2237 | 1625 |
| 2238 | 2416 |
| 2239 | 4367 |
| 2240 | 1214 |
| 2241 | 2880 |
| 2242 | 4744 |
| 2243 | 923 |
| 2244 | 2223 |
| 2245 | 1732 |
| 2246 | 4312 |
| 2247 | 3232 |
| 2248 | 1388 |
| 2249 | 4485 |
| 2250 | 2439 |
| 2251 | 978 |
| 2252 | 6177 |
| 2253 | 2658 |
| 2254 | 1826 |
| 2255 | 2171 |
| 2256 | 5188 |
| 2257 | 1504 |
| 2258 | 3588 |
| 2259 | 4868 |
| 2260 | 1245 |
| 2261 | 2648 |
| 2262 | 877 |
| 2263 | 4254 |
| 2264 | 2382 |
| 2265 | 1446 |
| 2266 | 4404 |
| 2267 | 2498 |
| 2268 | 1677 |
| 2269 | 761 |
| 2270 | 4646 |
| 2271 | 3264 |
| 2272 | 1475 |
| 2273 | 4214 |
| 2274 | 2700 |
| 2275 | 1637 |
| 2276 | 5633 |
| 2277 | 2268 |
| 2278 | 952 |
| 2279 | 2590 |
| 2280 | 4375 |
| 2281 | 1339 |
| 2282 | 3142 |
| 2283 | 4269 |
| 2284 | 1816 |
| 2285 | 2389 |
| 2286 | 883 |
| 2287 | 6209 |
| 2288 | 2825 |
| 2289 | 1259 |
| 2290 | 4704 |
| 2291 | 2231 |
| 2292 | 1683 |
| 2293 | 4486 |
| 2294 | 3116 |
| 2295 | 935 |
| 2296 | 2362 |
| 2297 | 4217 |
| 2298 | 1449 |
| 2299 | 2706 |
| 2300 | 5250 |
| 2301 | 1712 |
| 2302 | 2472 |
| 2303 | 1394 |
| 2304 | 4675 |
| 2305 | 3344 |
| 2306 | 495 |
| 2307 | 4428 |
| 2308 | 2631 |
| 2309 | 1678 |

TABLE Q17-continued with a sequence length of 8192:

| Polarized channel sequence number | Reliability or reliability sequence number |
|---|---|
| 2310 | 4295 |
| 2311 | 2282 |
| 2312 | 1436 |
| 2313 | 2721 |
| 2314 | 4649 |
| 2315 | 993 |
| 2316 | 3203 |
| 2317 | 5139 |
| 2318 | 1828 |
| 2319 | 2443 |
| 2320 | 6164 |
| 2321 | 1246 |
| 2322 | 2605 |
| 2323 | 762 |
| 2324 | 4275 |
| 2325 | 2403 |
| 2326 | 1567 |
| 2327 | 4324 |
| 2328 | 3153 |
| 2329 | 1367 |
| 2330 | 4752 |
| 2331 | 2173 |
| 2332 | 925 |
| 2333 | 2822 |
| 2334 | 4489 |
| 2335 | 1736 |
| 2336 | 2390 |
| 2337 | 5133 |
| 2338 | 1477 |
| 2339 | 3122 |
| 2340 | 4270 |
| 2341 | 1799 |
| 2342 | 2660 |
| 2343 | 878 |
| 2344 | 4636 |
| 2345 | 2364 |
| 2346 | 1261 |
| 2347 | 4434 |
| 2348 | 2611 |
| 2349 | 1626 |
| 2350 | 6178 |
| 2351 | 3145 |
| 2352 | 885 |
| 2353 | 2289 |
| 2354 | 4218 |
| 2355 | 1396 |
| 2356 | 2393 |
| 2357 | 4677 |
| 2358 | 1685 |
| 2359 | 2708 |
| 2360 | 5168 |
| 2361 | 1450 |
| 2362 | 3087 |
| 2363 | 4408 |
| 2364 | 980 |
| 2365 | 2255 |
| 2366 | 1921 |
| 2367 | 4299 |
| 2368 | 2606 |
| 2369 | 1341 |
| 2370 | 4379 |
| 2371 | 3205 |
| 2372 | 939 |
| 2373 | 4650 |
| 2374 | 2500 |
| 2375 | 1638 |
| 2376 | 2833 |
| 2377 | 5134 |
| 2378 | 1267 |
| 2379 | 2445 |
| 2380 | 4159 |
| 2381 | 764 |
| 2382 | 3360 |

TABLE Q17-continued with a sequence length of 8192:

| Polarized channel sequence number | Reliability or reliability sequence number |
|---|---|
| 2383 | 6168 |
| 2384 | 1641 |
| 2385 | 2635 |
| 2386 | 4449 |
| 2387 | 1699 |
| 2388 | 2235 |
| 2389 | 1457 |
| 2390 | 4872 |
| 2391 | 2405 |
| 2392 | 507 |
| 2393 | 4277 |
| 2394 | 3592 |
| 2395 | 1858 |
| 2396 | 5192 |
| 2397 | 2664 |
| 2398 | 1371 |
| 2399 | 4391 |
| 2400 | 2451 |
| 2401 | 994 |
| 2402 | 3124 |
| 2403 | 4657 |
| 2404 | 1628 |
| 2405 | 2722 |
| 2406 | 4328 |
| 2407 | 1478 |
| 2408 | 2284 |
| 2409 | 4436 |
| 2410 | 1583 |
| 2411 | 2826 |
| 2412 | 6180 |
| 2413 | 984 |
| 2414 | 3095 |
| 2415 | 5378 |
| 2416 | 1262 |
| 2417 | 2480 |
| 2418 | 1803 |
| 2419 | 4682 |
| 2420 | 2613 |
| 2421 | 926 |
| 2422 | 4490 |
| 2423 | 2446 |
| 2424 | 1452 |
| 2425 | 4768 |
| 2426 | 3206 |
| 2427 | 1744 |
| 2428 | 4220 |
| 2429 | 2753 |
| 2430 | 1400 |
| 2431 | 2174 |
| 2432 | 4497 |
| 2433 | 886 |
| 2434 | 3148 |
| 2435 | 5141 |
| 2436 | 1686 |
| 2437 | 2712 |
| 2438 | 6401 |
| 2439 | 1481 |
| 2440 | 2335 |
| 2441 | 4800 |
| 2442 | 735 |
| 2443 | 2504 |
| 2444 | 4301 |
| 2445 | 1832 |
| 2446 | 3209 |
| 2447 | 4381 |
| 2448 | 1342 |
| 2449 | 2637 |
| 2450 | 1689 |
| 2451 | 4678 |
| 2452 | 2290 |
| 2453 | 941 |
| 2454 | 5252 |
| 2455 | 1269 |

TABLE Q17-continued with a sequence length of 8192:

| Polarized channel sequence number | Reliability or reliability sequence number |
|---|---|
| 2456 | 1701 |
| 2457 | 4278 |
| 2458 | 3154 |
| 2459 | 889 |
| 2460 | 4395 |
| 2461 | 2834 |
| 2462 | 1423 |
| 2463 | 4652 |
| 2464 | 2394 |
| 2465 | 1860 |
| 2466 | 6151 |
| 2467 | 2724 |
| 2468 | 1642 |
| 2469 | 3331 |
| 2470 | 4307 |
| 2471 | 967 |
| 2472 | 2453 |
| 2473 | 5155 |
| 2474 | 1383 |
| 2475 | 2614 |
| 2476 | 4450 |
| 2477 | 1591 |
| 2478 | 3128 |
| 2479 | 4880 |
| 2480 | 947 |
| 2481 | 2292 |
| 2482 | 4281 |
| 2483 | 1458 |
| 2484 | 2643 |
| 2485 | 5146 |
| 2486 | 1922 |
| 2487 | 2406 |
| 2488 | 4440 |
| 2489 | 1151 |
| 2490 | 3099 |
| 2491 | 996 |
| 2492 | 4739 |
| 2493 | 2944 |
| 2494 | 1649 |
| 2495 | 6273 |
| 2496 | 2409 |
| 2497 | 1373 |
| 2498 | 4336 |
| 2499 | 3169 |
| 2500 | 1690 |
| 2501 | 4492 |
| 2502 | 2617 |
| 2503 | 503 |
| 2504 | 5200 |
| 2505 | 2237 |
| 2506 | 1482 |
| 2507 | 4689 |
| 2508 | 2672 |
| 2509 | 1811 |
| 2510 | 4302 |
| 2511 | 3600 |
| 2512 | 942 |
| 2513 | 4382 |
| 2514 | 2467 |
| 2515 | 1615 |
| 2516 | 4658 |
| 2517 | 2695 |
| 2518 | 1387 |
| 2519 | 3111 |
| 2520 | 6210 |
| 2521 | 1644 |
| 2522 | 2396 |
| 2523 | 5157 |
| 2524 | 751 |
| 2525 | 2263 |
| 2526 | 4191 |
| 2527 | 1215 |
| 2528 | 2828 |

TABLE Q17-continued with a sequence length of 8192:

| Polarized channel sequence number | Reliability or reliability sequence number |
|---|---|
| 2529 | 4681 |
| 2530 | 1805 |
| 2531 | 3333 |
| 2532 | 4498 |
| 2533 | 1460 |
| 2534 | 2351 |
| 2535 | 4423 |
| 2536 | 890 |
| 2537 | 2638 |
| 2538 | 5145 |
| 2539 | 1760 |
| 2540 | 3156 |
| 2541 | 4623 |
| 2542 | 1431 |
| 2543 | 2512 |
| 2544 | 6155 |
| 2545 | 1702 |
| 2546 | 2754 |
| 2547 | 4309 |
| 2548 | 971 |
| 2549 | 2454 |
| 2550 | 4513 |
| 2551 | 1489 |
| 2552 | 3210 |
| 2553 | 5142 |
| 2554 | 1840 |
| 2555 | 2645 |
| 2556 | 4741 |
| 2557 | 831 |
| 2558 | 2267 |
| 2559 | 1731 |
| 2560 | 4282 |
| 2561 | 3217 |
| 2562 | 1374 |
| 2563 | 4896 |
| 2564 | 2849 |
| 2565 | 1595 |
| 2566 | 4397 |
| 2567 | 2457 |
| 2568 | 949 |
| 2569 | 6184 |
| 2570 | 3101 |
| 2571 | 1270 |
| 2572 | 5256 |
| 2573 | 2618 |
| 2574 | 1806 |
| 2575 | 4323 |
| 2576 | 2469 |
| 2577 | 1484 |
| 2578 | 4660 |
| 2579 | 2728 |
| 2580 | 1000 |
| 2581 | 4452 |
| 2582 | 3115 |
| 2583 | 1705 |
| 2584 | 4207 |
| 2585 | 2279 |
| 2586 | 1864 |
| 2587 | 5634 |
| 2588 | 2699 |
| 2589 | 1435 |
| 2590 | 4631 |
| 2591 | 3392 |
| 2592 | 892 |
| 2593 | 6212 |
| 2594 | 2410 |
| 2595 | 1650 |
| 2596 | 4403 |
| 2597 | 2881 |
| 2598 | 1490 |
| 2599 | 4742 |
| 2600 | 3616 |
| 2601 | 1692 |

TABLE Q17-continued

| with a sequence length of 8192: | |
|---|---|
| Polarized channel sequence number | Reliability or reliability sequence number |
| 2602 | 5380 |
| 2603 | 2359 |
| 2604 | 763 |
| 2605 | 4500 |
| 2606 | 2659 |
| 2607 | 1389 |
| 2608 | 4310 |
| 2609 | 3170 |
| 2610 | 1813 |
| 2611 | 4684 |
| 2612 | 2296 |
| 2613 | 1273 |
| 2614 | 4398 |
| 2615 | 2646 |
| 2616 | 973 |
| 2617 | 6657 |
| 2618 | 2417 |
| 2619 | 1623 |
| 2620 | 5158 |
| 2621 | 3160 |
| 2622 | 1733 |
| 2623 | 4284 |
| 2624 | 2836 |
| 2625 | 1464 |
| 2626 | 4745 |
| 2627 | 2458 |
| 2628 | 950 |
| 2629 | 4427 |
| 2630 | 3212 |
| 2631 | 1924 |
| 2632 | 5216 |
| 2633 | 2620 |
| 2634 | 1395 |
| 2635 | 4690 |
| 2636 | 2383 |
| 2637 | 1652 |
| 2638 | 4313 |
| 2639 | 3102 |
| 2640 | 509 |
| 2641 | 6274 |
| 2642 | 2649 |
| 2643 | 2238 |
| 2644 | 4456 |
| 2645 | 1827 |
| 2646 | 4867 |
| 2647 | 3337 |
| 2648 | 1447 |
| 2649 | 5187 |
| 2650 | 2756 |
| 2651 | 1706 |
| 2652 | 4514 |
| 2653 | 2412 |
| 2654 | 979 |
| 2655 | 4325 |
| 2656 | 3218 |
| 2657 | 1505 |
| 2658 | 4664 |
| 2659 | 2850 |
| 2660 | 1597 |
| 2661 | 5161 |
| 2662 | 2528 |
| 2663 | 1274 |
| 2664 | 6163 |
| 2665 | 2269 |
| 2666 | 953 |
| 2667 | 4405 |
| 2668 | 3143 |
| 2669 | 1818 |
| 2670 | 4635 |
| 2671 | 2470 |
| 2672 | 1713 |
| 2673 | 4255 |
| 2674 | 2701 |

TABLE Q17-continued

| with a sequence length of 8192: | |
|---|---|
| Polarized channel sequence number | Reliability or reliability sequence number |
| 2675 | 1437 |
| 2676 | 5264 |
| 2677 | 3233 |
| 2678 | 1008 |
| 2679 | 4545 |
| 2680 | 2499 |
| 2681 | 1627 |
| 2682 | 4705 |
| 2683 | 2661 |
| 2684 | 3587 |
| 2685 | 6157 |
| 2686 | 1390 |
| 2687 | 2363 |
| 2688 | 4504 |
| 2689 | 1872 |
| 2690 | 4647 |
| 2691 | 2840 |
| 2692 | 974 |
| 2693 | 5148 |
| 2694 | 3117 |
| 2695 | 1734 |
| 2696 | 4215 |
| 2697 | 2283 |
| 2698 | 1397 |
| 2699 | 4429 |
| 2700 | 2707 |
| 2701 | 1829 |
| 2702 | 4869 |
| 2703 | 3334 |
| 2704 | 759 |
| 2705 | 5189 |
| 2706 | 2473 |
| 2707 | 1492 |
| 2708 | 6192 |
| 2709 | 2736 |
| 2710 | 1708 |
| 2711 | 4314 |
| 2712 | 3172 |
| 2713 | 1451 |
| 2714 | 4692 |
| 2715 | 2418 |
| 2716 | 4516 |
| 2717 | 2702 |
| 2718 | 863 |
| 2719 | 5162 |
| 2720 | 3123 |
| 2721 | 1656 |
| 2722 | 4326 |
| 2723 | 2460 |
| 2724 | 1817 |
| 2725 | 4746 |
| 2726 | 2852 |
| 2727 | 1276 |
| 2728 | 6158 |
| 2729 | 3220 |
| 2730 | 981 |
| 2731 | 4406 |
| 2732 | 2270 |
| 2733 | 1737 |
| 2734 | 5384 |
| 2735 | 2591 |
| 2736 | 1506 |
| 2737 | 4753 |
| 2738 | 2391 |
| 2739 | 4435 |
| 2740 | 1814 |
| 2741 | 3118 |
| 2742 | 4637 |
| 2743 | 2760 |
| 2744 | 1598 |
| 2745 | 5169 |
| 2746 | 2501 |
| 2747 | 954 |

TABLE Q17-continued

| with a sequence length of 8192: | |
|---|---|
| Polarized channel sequence number | Reliability or reliability sequence number |
| 2748 | 7169 |
| 2749 | 3345 |
| 2750 | 1496 |
| 2751 | 4329 |
| 2752 | 2823 |
| 2753 | 1928 |
| 2754 | 4409 |
| 2755 | 2285 |
| 2756 | 4651 |
| 2757 | 1438 |
| 2758 | 3840 |
| 2759 | 5194 |
| 2760 | 995 |
| 2761 | 2650 |
| 2762 | 4464 |
| 2763 | 1679 |
| 2764 | 2420 |
| 2765 | 4928 |
| 2766 | 3147 |
| 2767 | 1639 |
| 2768 | 4271 |
| 2769 | 2709 |
| 2770 | 1398 |
| 2771 | 6216 |
| 2772 | 2474 |
| 2773 | 5280 |
| 2774 | 879 |
| 2775 | 3176 |
| 2776 | 4487 |
| 2777 | 1830 |
| 2778 | 2945 |
| 2779 | 4706 |
| 2780 | 1714 |
| 2781 | 2365 |
| 2782 | 4219 |
| 2783 | 1247 |
| 2784 | 3234 |
| 2785 | 5636 |
| 2786 | 2662 |
| 2787 | 982 |
| 2788 | 4696 |
| 2789 | 2291 |
| 2790 | 6402 |
| 2791 | 1888 |
| 2792 | 3338 |
| 2793 | 4430 |
| 2794 | 1453 |
| 2795 | 2665 |
| 2796 | 4546 |
| 2797 | 1629 |
| 2798 | 2723 |
| 2799 | 5312 |
| 2800 | 1738 |
| 2801 | 3125 |
| 2802 | 4748 |
| 2803 | 956 |
| 2804 | 4316 |
| 2805 | 2481 |
| 2806 | 3265 |
| 2807 | 4638 |
| 2808 | 1401 |
| 2809 | 2882 |
| 2810 | 6165 |
| 2811 | 1859 |
| 2812 | 2395 |
| 2813 | 5190 |
| 2814 | 1479 |
| 2815 | 3224 |
| 2816 | 4437 |
| 2817 | 985 |
| 2818 | 4873 |
| 2819 | 2652 |
| 2820 | 1643 |

TABLE Q17-continued

| with a sequence length of 8192: | |
|---|---|
| Polarized channel sequence number | Reliability or reliability sequence number |
| 2821 | 4279 |
| 2822 | 2502 |
| 2823 | 1833 |
| 2824 | 5164 |
| 2825 | 3589 |
| 2826 | 2607 |
| 2827 | 6276 |
| 2828 | 1459 |
| 2829 | 4410 |
| 2830 | 2286 |
| 2831 | 1716 |
| 2832 | 4754 |
| 2833 | 3149 |
| 2834 | 510 |
| 2835 | 4520 |
| 2836 | 2827 |
| 2837 | 1936 |
| 2838 | 5392 |
| 2839 | 2476 |
| 2840 | 4679 |
| 2841 | 3346 |
| 2842 | 1508 |
| 2843 | 4330 |
| 2844 | 2768 |
| 2845 | 1687 |
| 2846 | 6179 |
| 2847 | 2424 |
| 2848 | 765 |
| 2849 | 4769 |
| 2850 | 3236 |
| 2851 | 5251 |
| 2852 | 1454 |
| 2853 | 2710 |
| 2854 | 4491 |
| 2855 | 1745 |
| 2856 | 2505 |
| 2857 | 4653 |
| 2858 | 3126 |
| 2859 | 1820 |
| 2860 | 4451 |
| 2861 | 2856 |
| 2862 | 5201 |
| 2863 | 1263 |
| 2864 | 2366 |
| 2865 | 6170 |
| 2866 | 997 |
| 2867 | 3155 |
| 2868 | 4221 |
| 2869 | 1630 |
| 2870 | 2713 |
| 2871 | 4870 |
| 2872 | 1861 |
| 2873 | 4438 |
| 2874 | 2293 |
| 2875 | 3456 |
| 2876 | 5170 |
| 2877 | 1402 |
| 2878 | 2725 |
| 2879 | 4708 |
| 2880 | 1740 |
| 2881 | 3648 |
| 2882 | 4412 |
| 2883 | 927 |
| 2884 | 6224 |
| 2885 | 2447 |
| 2886 | 1483 |
| 2887 | 4659 |
| 2888 | 2884 |
| 2889 | 3129 |
| 2890 | 5193 |
| 2891 | 1834 |
| 2892 | 4337 |
| 2893 | 2666 |

TABLE Q17-continued with a sequence length of 8192:

| Polarized channel sequence number | Reliability or reliability sequence number |
|---|---|
| 2894 | 1691 |
| 2895 | 4441 |
| 2896 | 2407 |
| 2897 | 887 |
| 2898 | 4756 |
| 2899 | 3184 |
| 2900 | 1343 |
| 2901 | 6181 |
| 2902 | 2615 |
| 2903 | 5135 |
| 2904 | 2482 |
| 2905 | 1841 |
| 2906 | 4303 |
| 2907 | 3207 |
| 2908 | 1746 |
| 2909 | 4654 |
| 2910 | 2946 |
| 2911 | 5253 |
| 2912 | 1461 |
| 2913 | 2175 |
| 2914 | 4548 |
| 2915 | 986 |
| 2916 | 3340 |
| 2917 | 4881 |
| 2918 | 2673 |
| 2919 | 6169 |
| 2920 | 1645 |
| 2921 | 2397 |
| 2922 | 4493 |
| 2923 | 1866 |
| 2924 | 3150 |
| 2925 | 5408 |
| 2926 | 1512 |
| 2927 | 4683 |
| 2928 | 2714 |
| 2929 | 3266 |
| 2930 | 4283 |
| 2931 | 1720 |
| 2932 | 2506 |
| 2933 | 4453 |
| 2934 | 998 |
| 2935 | 6166 |
| 2936 | 2835 |
| 2937 | 1404 |
| 2938 | 5640 |
| 2939 | 3593 |
| 2940 | 1952 |
| 2941 | 4712 |
| 2942 | 2639 |
| 2943 | 2411 |
| 2944 | 4499 |
| 2945 | 1651 |
| 2946 | 5172 |
| 2947 | 3157 |
| 2948 | 1275 |
| 2949 | 4770 |
| 2950 | 2668 |
| 2951 | 4332 |
| 2952 | 1001 |
| 2953 | 2239 |
| 2954 | 6280 |
| 2955 | 3361 |
| 2956 | 1984 |
| 2957 | 4874 |
| 2958 | 2829 |
| 2959 | 5143 |
| 2960 | 1703 |
| 2961 | 3130 |
| 2962 | 4528 |
| 2963 | 1485 |
| 2964 | 2484 |
| 2965 | 4661 |
| 2966 | 1862 |

TABLE Q17-continued with a sequence length of 8192:

| Polarized channel sequence number | Reliability or reliability sequence number |
|---|---|
| 2967 | 4494 |
| 2968 | 2784 |
| 2969 | 3240 |
| 2970 | 6658 |
| 2971 | 943 |
| 2972 | 2455 |
| 2973 | 5254 |
| 2974 | 1761 |
| 2975 | 4801 |
| 2976 | 2726 |
| 2977 | 1462 |
| 2978 | 4222 |
| 2979 | 3211 |
| 2980 | 2513 |
| 2981 | 5196 |
| 2982 | 1836 |
| 2983 | 4760 |
| 2984 | 3393 |
| 2985 | 891 |
| 2986 | 6404 |
| 2987 | 2864 |
| 2988 | 1693 |
| 2989 | 4383 |
| 2990 | 2755 |
| 2991 | 4552 |
| 2992 | 3590 |
| 2993 | 1491 |
| 2994 | 5257 |
| 2995 | 2398 |
| 2996 | 4685 |
| 2997 | 1923 |
| 2998 | 2619 |
| 2999 | 4338 |
| 3000 | 1646 |
| 3001 | 3171 |
| 3002 | 5202 |
| 3003 | 2294 |
| 3004 | 6182 |
| 3005 | 988 |
| 3006 | 3158 |
| 3007 | 4882 |
| 3008 | 1465 |
| 3009 | 4442 |
| 3010 | 2830 |
| 3011 | 1873 |
| 3012 | 4772 |
| 3013 | 2508 |
| 3014 | 3348 |
| 3015 | 5379 |
| 3016 | 1653 |
| 3017 | 4501 |
| 3018 | 2729 |
| 3019 | 1520 |
| 3020 | 6240 |
| 3021 | 2888 |
| 3022 | 4662 |
| 3023 | 1748 |
| 3024 | 3132 |
| 3025 | 5176 |
| 3026 | 2459 |
| 3027 | 766 |
| 3028 | 4340 |
| 3029 | 3161 |
| 3030 | 4691 |
| 3031 | 1486 |
| 3032 | 2674 |
| 3033 | 4454 |
| 3034 | 1842 |
| 3035 | 6211 |
| 3036 | 2514 |
| 3037 | 3601 |
| 3038 | 5147 |
| 3039 | 1707 |

TABLE Q17-continued with a sequence length of 8192:

| Polarized channel sequence number | Reliability or reliability sequence number |
|---|---|
| 3040 | 2716 |
| 3041 | 4992 |
| 3042 | 1271 |
| 3043 | 4457 |
| 3044 | 2413 |
| 3045 | 3268 |
| 3046 | 5217 |
| 3047 | 951 |
| 3048 | 4665 |
| 3049 | 2837 |
| 3050 | 1865 |
| 3051 | 6185 |
| 3052 | 3362 |
| 3053 | 1762 |
| 3054 | 4285 |
| 3055 | 2297 |
| 3056 | 4720 |
| 3057 | 2647 |
| 3058 | 1375 |
| 3059 | 5648 |
| 3060 | 3213 |
| 3061 | 4515 |
| 3062 | 1807 |
| 3063 | 2757 |
| 3064 | 4743 |
| 3065 | 1002 |
| 3066 | 6288 |
| 3067 | 2488 |
| 3068 | 3173 |
| 3069 | 5159 |
| 3070 | 1752 |
| 3071 | 2948 |
| 3072 | 4444 |
| 3073 | 1925 |
| 3074 | 4311 |
| 3075 | 3352 |
| 3076 | 2419 |
| 3077 | 4876 |
| 3078 | 1493 |
| 3079 | 5381 |
| 3080 | 2676 |
| 3081 | 1694 |
| 3082 | 6172 |
| 3083 | 3219 |
| 3084 | 4399 |
| 3085 | 893 |
| 3086 | 2851 |
| 3087 | 4686 |
| 3088 | 3594 |
| 3089 | 5204 |
| 3090 | 1844 |
| 3091 | 2471 |
| 3092 | 4560 |
| 3093 | 1466 |
| 3094 | 4802 |
| 3095 | 2730 |
| 3096 | 3248 |
| 3097 | 6213 |
| 3098 | 1654 |
| 3099 | 2529 |
| 3100 | 4502 |
| 3101 | 1815 |
| 3102 | 5258 |
| 3103 | 2621 |
| 3104 | 1507 |
| 3105 | 4693 |
| 3106 | 3214 |
| 3107 | 4315 |
| 3108 | 2298 |
| 3109 | 1009 |
| 3110 | 5265 |
| 3111 | 3364 |
| 3112 | 6186 |

TABLE Q17-continued with a sequence length of 8192:

| Polarized channel sequence number | Reliability or reliability sequence number |
|---|---|
| 3113 | 1709 |
| 3114 | 2842 |
| 3115 | 4897 |
| 3116 | 2737 |
| 3117 | 4505 |
| 3118 | 1926 |
| 3119 | 3103 |
| 3120 | 5149 |
| 3121 | 1391 |
| 3122 | 4666 |
| 3123 | 2461 |
| 3124 | 3272 |
| 3125 | 6408 |
| 3126 | 1657 |
| 3127 | 4517 |
| 3128 | 2651 |
| 3129 | 975 |
| 3130 | 4776 |
| 3131 | 2414 |
| 3132 | 5163 |
| 3133 | 1868 |
| 3134 | 3602 |
| 3135 | 4327 |
| 3136 | 2896 |
| 3137 | 4747 |
| 3138 | 1494 |
| 3139 | 3335 |
| 3140 | 6193 |
| 3141 | 1735 |
| 3142 | 5440 |
| 3143 | 2758 |
| 3144 | 2421 |
| 3145 | 4458 |
| 3146 | 1715 |
| 3147 | 4929 |
| 3148 | 3162 |
| 3149 | 955 |
| 3150 | 5664 |
| 3151 | 2853 |
| 3152 | 4407 |
| 3153 | 3221 |
| 3154 | 1468 |
| 3155 | 6218 |
| 3156 | 2516 |
| 3157 | 4707 |
| 3158 | 1764 |
| 3159 | 2732 |
| 3160 | 5218 |
| 3161 | 3457 |
| 3162 | 4344 |
| 3163 | 1929 |
| 3164 | 2475 |
| 3165 | 4694 |
| 3166 | 1497 |
| 3167 | 7170 |
| 3168 | 3712 |
| 3169 | 2680 |
| 3170 | 4465 |
| 3171 | 1710 |
| 3172 | 5208 |
| 3173 | 2841 |
| 3174 | 511 |
| 3175 | 4884 |
| 3176 | 3174 |
| 3177 | 4506 |
| 3178 | 2300 |
| 3179 | 1874 |
| 3180 | 5260 |
| 3181 | 3177 |
| 3182 | 6304 |
| 3183 | 1658 |
| 3184 | 2761 |
| 3185 | 4668 |

TABLE Q17-continued with a sequence length of 8192:

| Polarized channel sequence number | Reliability or reliability sequence number |
|---|---|
| 3186 | 2530 |
| 3187 | 4431 |
| 3188 | 1277 |
| 3189 | 3235 |
| 3190 | 5150 |
| 3191 | 1848 |
| 3192 | 4697 |
| 3193 | 2838 |
| 3194 | 3394 |
| 3195 | 4286 |
| 3196 | 1739 |
| 3197 | 6660 |
| 3198 | 2622 |
| 3199 | 1004 |
| 3200 | 5385 |
| 3201 | 2520 |
| 3202 | 4804 |
| 3203 | 3164 |
| 3204 | 4460 |
| 3205 | 1509 |
| 3206 | 2952 |
| 3207 | 5266 |
| 3208 | 1819 |
| 3209 | 6336 |
| 3210 | 3596 |
| 3211 | 2462 |
| 3212 | 4898 |
| 3213 | 1599 |
| 3214 | 4576 |
| 3215 | 3119 |
| 3216 | 1439 |
| 3217 | 4317 |
| 3218 | 2703 |
| 3219 | 5191 |
| 3220 | 2663 |
| 3221 | 1889 |
| 3222 | 4518 |
| 3223 | 3339 |
| 3224 | 6214 |
| 3225 | 894 |
| 3226 | 4749 |
| 3227 | 2422 |
| 3228 | 3280 |
| 3229 | 5281 |
| 3230 | 1717 |
| 3231 | 4547 |
| 3232 | 2854 |
| 3233 | 1831 |
| 3234 | 4709 |
| 3235 | 2738 |
| 3236 | 6188 |
| 3237 | 3222 |
| 3238 | 1399 |
| 3239 | 5635 |
| 3240 | 2271 |
| 3241 | 4411 |
| 3242 | 1768 |
| 3243 | 3617 |
| 3244 | 4888 |
| 3245 | 2912 |
| 3246 | 5165 |
| 3247 | 1010 |
| 3248 | 6416 |
| 3249 | 2477 |
| 3250 | 1876 |
| 3251 | 4331 |
| 3252 | 3368 |
| 3253 | 4755 |
| 3254 | 2653 |
| 3255 | 1498 |
| 3256 | 5382 |
| 3257 | 3225 |
| 3258 | 4521 |

TABLE Q17-continued with a sequence length of 8192:

| Polarized channel sequence number | Reliability or reliability sequence number |
|---|---|
| 3259 | 2762 |
| 3260 | 4784 |
| 3261 | 1930 |
| 3262 | 3237 |
| 3263 | 6275 |
| 3264 | 1660 |
| 3265 | 5220 |
| 3266 | 2425 |
| 3267 | 2883 |
| 3268 | 4466 |
| 3269 | 1510 |
| 3270 | 4750 |
| 3271 | 3396 |
| 3272 | 1012 |
| 3273 | 5171 |
| 3274 | 2503 |
| 3275 | 6225 |
| 3276 | 3649 |
| 3277 | 4508 |
| 3278 | 1937 |
| 3279 | 2667 |
| 3280 | 4900 |
| 3281 | 1741 |
| 3282 | 5268 |
| 3283 | 2857 |
| 3284 | 3178 |
| 3285 | 4318 |
| 3286 | 1821 |
| 3287 | 6194 |
| 3288 | 2483 |
| 3289 | 4639 |
| 3290 | 3127 |
| 3291 | 1513 |
| 3292 | 4439 |
| 3293 | 2740 |
| 3294 | 5166 |
| 3295 | 1718 |
| 3296 | 3458 |
| 3297 | 4808 |
| 3298 | 2960 |
| 3299 | 4549 |
| 3300 | 957 |
| 3301 | 6217 |
| 3302 | 2532 |
| 3303 | 1835 |
| 3304 | 5393 |
| 3305 | 3185 |
| 3306 | 4871 |
| 3307 | 2711 |
| 3308 | 4333 |
| 3309 | 1455 |
| 3310 | 3226 |
| 3311 | 5888 |
| 3312 | 2478 |
| 3313 | 6159 |
| 3314 | 1747 |
| 3315 | 3604 |
| 3316 | 4698 |
| 3317 | 1890 |
| 3318 | 4468 |
| 3319 | 2769 |
| 3320 | 5195 |
| 3321 | 2844 |
| 3322 | 1721 |
| 3323 | 4757 |
| 3324 | 3347 |
| 3325 | 6277 |
| 3326 | 1403 |
| 3327 | 2287 |
| 3328 | 4522 |
| 3329 | 3151 |
| 3330 | 5224 |
| 3331 | 983 |

TABLE Q17-continued with a sequence length of 8192:

| Polarized channel sequence number | Reliability or reliability sequence number |
|---|---|
| 3332 | 4993 |
| 3333 | 2654 |
| 3334 | 3180 |
| 3335 | 4413 |
| 3336 | 1880 |
| 3337 | 6432 |
| 3338 | 2885 |
| 3339 | 5282 |
| 3340 | 1776 |
| 3341 | 2426 |
| 3342 | 4710 |
| 3343 | 3618 |
| 3344 | 4339 |
| 3345 | 1500 |
| 3346 | 5386 |
| 3347 | 2764 |
| 3348 | 3341 |
| 3349 | 6664 |
| 3350 | 1932 |
| 3351 | 4713 |
| 3352 | 2507 |
| 3353 | 4771 |
| 3354 | 1742 |
| 3355 | 3296 |
| 3356 | 5173 |
| 3357 | 2858 |
| 3358 | 4529 |
| 3359 | 767 |
| 3360 | 3238 |
| 3361 | 5313 |
| 3362 | 2715 |
| 3363 | 6196 |
| 3364 | 1822 |
| 3365 | 4930 |
| 3366 | 2367 |
| 3367 | 1278 |
| 3368 | 4443 |
| 3369 | 3376 |
| 3370 | 5272 |
| 3371 | 2865 |
| 3372 | 4700 |
| 3373 | 1631 |
| 3374 | 3608 |
| 3375 | 6167 |
| 3376 | 2770 |
| 3377 | 4550 |
| 3378 | 1938 |
| 3379 | 5637 |
| 3380 | 3267 |
| 3381 | 1863 |
| 3382 | 4655 |
| 3383 | 2485 |
| 3384 | 4334 |
| 3385 | 2669 |
| 3386 | 6278 |
| 3387 | 987 |
| 3388 | 3131 |
| 3389 | 5197 |
| 3390 | 2890 |
| 3391 | 4875 |
| 3392 | 1463 |
| 3393 | 4524 |
| 3394 | 3342 |
| 3395 | 1749 |
| 3396 | 5394 |
| 3397 | 2536 |
| 3398 | 6220 |
| 3399 | 3241 |
| 3400 | 4816 |
| 3401 | 1953 |
| 3402 | 2744 |
| 3403 | 4472 |
| 3404 | 3620 |

TABLE Q17-continued with a sequence length of 8192:

| Polarized channel sequence number | Reliability or reliability sequence number |
|---|---|
| 3405 | 5284 |
| 3406 | 1722 |
| 3407 | 4758 |
| 3408 | 2428 |
| 3409 | 7172 |
| 3410 | 1514 |
| 3411 | 2976 |
| 3412 | 4553 |
| 3413 | 3400 |
| 3414 | 5174 |
| 3415 | 1837 |
| 3416 | 4904 |
| 3417 | 2675 |
| 3418 | 3186 |
| 3419 | 4414 |
| 3420 | 999 |
| 3421 | 6281 |
| 3422 | 2299 |
| 3423 | 5203 |
| 3424 | 1763 |
| 3425 | 3228 |
| 3426 | 4761 |
| 3427 | 3008 |
| 3428 | 4341 |
| 3429 | 1405 |
| 3430 | 6226 |
| 3431 | 3349 |
| 3432 | 2727 |
| 3433 | 5504 |
| 3434 | 1892 |
| 3435 | 4773 |
| 3436 | 2509 |
| 3437 | 5696 |
| 3438 | 3841 |
| 3439 | 4495 |
| 3440 | 1647 |
| 3441 | 2886 |
| 3442 | 6403 |
| 3443 | 1843 |
| 3444 | 4932 |
| 3445 | 3159 |
| 3446 | 5177 |
| 3447 | 2785 |
| 3448 | 1521 |
| 3449 | 4714 |
| 3450 | 3269 |
| 3451 | 4455 |
| 3452 | 2486 |
| 3453 | 6200 |
| 3454 | 1016 |
| 3455 | 3460 |
| 3456 | 5232 |
| 3457 | 2860 |
| 3458 | 4663 |
| 3459 | 1940 |
| 3460 | 4530 |
| 3461 | 2717 |
| 3462 | 5255 |
| 3463 | 1750 |
| 3464 | 3591 |
| 3465 | 6171 |
| 3466 | 2515 |
| 3467 | 4994 |
| 3468 | 1838 |
| 3469 | 4223 |
| 3470 | 3188 |
| 3471 | 5388 |
| 3472 | 2947 |
| 3473 | 1487 |
| 3474 | 4721 |
| 3475 | 3363 |
| 3476 | 6241 |
| 3477 | 2670 |

TABLE Q17-continued with a sequence length of 8192:

| Polarized channel sequence number | Reliability or reliability sequence number |
|---|---|
| 3478 | 4445 |
| 3479 | 1724 |
| 3480 | 3242 |
| 3481 | 5198 |
| 3482 | 2489 |
| 3483 | 4762 |
| 3484 | 958 |
| 3485 | 5314 |
| 3486 | 3133 |
| 3487 | 6672 |
| 3488 | 1867 |
| 3489 | 2897 |
| 3490 | 4554 |
| 3491 | 3713 |
| 3492 | 4883 |
| 3493 | 1753 |
| 3494 | 5641 |
| 3495 | 2677 |
| 3496 | 6183 |
| 3497 | 2544 |
| 3498 | 1467 |
| 3499 | 4687 |
| 3500 | 3354 |
| 3501 | 4459 |
| 3502 | 2772 |
| 3503 | 5205 |
| 3504 | 1896 |
| 3505 | 4716 |
| 3506 | 3249 |
| 3507 | 1954 |
| 3508 | 6405 |
| 3509 | 2510 |
| 3510 | 4287 |
| 3511 | 3163 |
| 3512 | 5409 |
| 3513 | 1765 |
| 3514 | 4877 |
| 3515 | 2866 |
| 3516 | 3650 |
| 3517 | 5178 |
| 3518 | 1516 |
| 3519 | 6228 |
| 3520 | 2731 |
| 3521 | 4532 |
| 3522 | 3408 |
| 3523 | 4832 |
| 3524 | 989 |
| 3525 | 2295 |
| 3526 | 5288 |
| 3527 | 3270 |
| 3528 | 6282 |
| 3529 | 1845 |
| 3530 | 4503 |
| 3531 | 2889 |
| 3532 | 4774 |
| 3533 | 2786 |
| 3534 | 1695 |
| 3535 | 5259 |
| 3536 | 3365 |
| 3537 | 4561 |
| 3538 | 1985 |
| 3539 | 6289 |
| 3540 | 2399 |
| 3541 | 5441 |
| 3542 | 3244 |
| 3543 | 1406 |
| 3544 | 4912 |
| 3545 | 2831 |
| 3546 | 4803 |
| 3547 | 3595 |
| 3548 | 5638 |
| 3549 | 1944 |
| 3550 | 6173 |

TABLE Q17-continued with a sequence length of 8192:

| Polarized channel sequence number | Reliability or reliability sequence number |
|---|---|
| 3551 | 2776 |
| 3552 | 4446 |
| 3553 | 3192 |
| 3554 | 1655 |
| 3555 | 4667 |
| 3556 | 2949 |
| 3557 | 5219 |
| 3558 | 3353 |
| 3559 | 6187 |
| 3560 | 1003 |
| 3561 | 4342 |
| 3562 | 2517 |
| 3563 | 3273 |
| 3564 | 5206 |
| 3565 | 1869 |
| 3566 | 4878 |
| 3567 | 2718 |
| 3568 | 4556 |
| 3569 | 3624 |
| 3570 | 6464 |
| 3571 | 1522 |
| 3572 | 5396 |
| 3573 | 2868 |
| 3574 | 1754 |
| 3575 | 4777 |
| 3576 | 2490 |
| 3577 | 4936 |
| 3578 | 3350 |
| 3579 | 7176 |
| 3580 | 1956 |
| 3581 | 5180 |
| 3582 | 2678 |
| 3583 | 3134 |
| 3584 | 4507 |
| 3585 | 1766 |
| 3586 | 5209 |
| 3587 | 2839 |
| 3588 | 4722 |
| 3589 | 3464 |
| 3590 | 6688 |
| 3591 | 1846 |
| 3592 | 4562 |
| 3593 | 2531 |
| 3594 | 3652 |
| 3595 | 5649 |
| 3596 | 990 |
| 3597 | 4764 |
| 3598 | 2733 |
| 3599 | 6242 |
| 3600 | 3215 |
| 3601 | 4461 |
| 3602 | 1524 |
| 3603 | 5316 |
| 3604 | 2950 |
| 3605 | 3175 |
| 3606 | 4885 |
| 3607 | 1875 |
| 3608 | 5410 |
| 3609 | 2415 |
| 3610 | 6232 |
| 3611 | 3366 |
| 3612 | 4345 |
| 3613 | 1769 |
| 3614 | 4695 |
| 3615 | 2681 |
| 3616 | 5261 |
| 3617 | 3714 |
| 3618 | 1849 |
| 3619 | 6284 |
| 3620 | 2892 |
| 3621 | 4805 |
| 3622 | 3250 |
| 3623 | 4536 |

TABLE Q17-continued

| with a sequence length of 8192: | |
|---|---|
| Polarized channel sequence number | Reliability or reliability sequence number |
| 3624 | 1469 |
| 3625 | 5221 |
| 3626 | 2518 |
| 3627 | 4996 |
| 3628 | 3424 |
| 3629 | 1904 |
| 3630 | 6174 |
| 3631 | 2759 |
| 3632 | 5400 |
| 3633 | 3165 |
| 3634 | 4467 |
| 3635 | 1711 |
| 3636 | 4724 |
| 3637 | 2739 |
| 3638 | 6409 |
| 3639 | 1005 |
| 3640 | 5267 |
| 3641 | 2492 |
| 3642 | 3603 |
| 3643 | 4899 |
| 3644 | 1927 |
| 3645 | 5642 |
| 3646 | 2788 |
| 3647 | 4519 |
| 3648 | 3274 |
| 3649 | 6290 |
| 3650 | 1495 |
| 3651 | 4778 |
| 3652 | 2953 |
| 3653 | 5296 |
| 3654 | 3395 |
| 3655 | 1659 |
| 3656 | 4577 |
| 3657 | 2521 |
| 3658 | 6215 |
| 3659 | 3179 |
| 3660 | 4669 |
| 3661 | 1870 |
| 3662 | 5262 |
| 3663 | 2734 |
| 3664 | 4346 |
| 3665 | 3597 |
| 3666 | 6305 |
| 3667 | 1986 |
| 3668 | 2898 |
| 3669 | 5412 |
| 3670 | 3369 |
| 3671 | 4890 |
| 3672 | 1756 |
| 3673 | 4785 |
| 3674 | 2682 |
| 3675 | 5151 |
| 3676 | 3252 |
| 3677 | 6659 |
| 3678 | 1279 |
| 3679 | 4509 |
| 3680 | 2301 |
| 3681 | 3472 |
| 3682 | 5320 |
| 3683 | 1011 |
| 3684 | 4699 |
| 3685 | 2872 |
| 3686 | 6189 |
| 3687 | 3632 |
| 3688 | 4462 |
| 3689 | 1877 |
| 3690 | 5650 |
| 3691 | 2763 |
| 3692 | 4944 |
| 3693 | 3223 |
| 3694 | 6406 |
| 3695 | 1719 |
| 3696 | 2533 |

TABLE Q17-continued

| with a sequence length of 8192: | |
|---|---|
| Polarized channel sequence number | Reliability or reliability sequence number |
| 3697 | 5383 |
| 3698 | 3281 |
| 3699 | 4806 |
| 3700 | 1850 |
| 3701 | 4469 |
| 3702 | 2843 |
| 3703 | 5210 |
| 3704 | 3356 |
| 3705 | 6244 |
| 3706 | 1499 |
| 3707 | 4901 |
| 3708 | 2623 |
| 3709 | 5269 |
| 3710 | 3598 |
| 3711 | 1960 |
| 3712 | 4564 |
| 3713 | 2463 |
| 3714 | 6195 |
| 3715 | 3166 |
| 3716 | 4780 |
| 3717 | 2913 |
| 3718 | 5505 |
| 3719 | 1770 |
| 3720 | 4523 |
| 3721 | 3397 |
| 3722 | 7184 |
| 3723 | 2741 |
| 3724 | 5760 |
| 3725 | 1931 |
| 3726 | 4728 |
| 3727 | 3276 |
| 3728 | 2855 |
| 3729 | 4889 |
| 3730 | 1006 |
| 3731 | 6292 |
| 3732 | 3656 |
| 3733 | 5222 |
| 3734 | 2423 |
| 3735 | 4348 |
| 3736 | 1891 |
| 3737 | 5225 |
| 3738 | 3370 |
| 3739 | 6190 |
| 3740 | 2792 |
| 3741 | 4809 |
| 3742 | 1511 |
| 3743 | 4578 |
| 3744 | 3227 |
| 3745 | 5283 |
| 3746 | 2900 |
| 3747 | 1661 |
| 3748 | 4886 |
| 3749 | 3842 |
| 3750 | 6417 |
| 3751 | 2522 |
| 3752 | 5442 |
| 3753 | 1878 |
| 3754 | 4670 |
| 3755 | 3377 |
| 3756 | 4568 |
| 3757 | 2954 |
| 3758 | 6912 |
| 3759 | 1852 |
| 3760 | 5212 |
| 3761 | 3282 |
| 3762 | 5000 |
| 3763 | 2684 |
| 3764 | 5644 |
| 3765 | 1777 |
| 3766 | 3181 |
| 3767 | 6219 |
| 3768 | 2534 |
| 3769 | 4510 |

TABLE Q17-continued

| with a sequence length of 8192: | |
|---|---|
| Polarized channel sequence number | Reliability or reliability sequence number |
| 3770 | 1528 |
| 3771 | 5167 |
| 3772 | 3605 |
| 3773 | 4751 |
| 3774 | 2961 |
| 3775 | 6248 |
| 3776 | 1013 |
| 3777 | 4711 |
| 3778 | 3402 |
| 3779 | 5387 |
| 3780 | 2765 |
| 3781 | 4470 |
| 3782 | 1881 |
| 3783 | 6306 |
| 3784 | 3256 |
| 3785 | 5328 |
| 3786 | 2845 |
| 3787 | 3488 |
| 3788 | 4902 |
| 3789 | 1743 |
| 3790 | 4786 |
| 3791 | 2537 |
| 3792 | 6410 |
| 3793 | 3716 |
| 3794 | 5270 |
| 3795 | 1988 |
| 3796 | 4319 |
| 3797 | 2742 |
| 3798 | 5665 |
| 3799 | 3187 |
| 3800 | 6197 |
| 3801 | 1933 |
| 3802 | 4960 |
| 3803 | 2859 |
| 3804 | 4525 |
| 3805 | 3520 |
| 3806 | 5416 |
| 3807 | 1470 |
| 3808 | 6337 |
| 3809 | 2479 |
| 3810 | 4701 |
| 3811 | 3619 |
| 3812 | 1723 |
| 3813 | 5273 |
| 3814 | 2771 |
| 3815 | 4810 |
| 3816 | 3239 |
| 3817 | 6296 |
| 3818 | 1893 |
| 3819 | 5285 |
| 3820 | 2914 |
| 3821 | 4473 |
| 3822 | 2745 |
| 3823 | 4931 |
| 3824 | 2427 |
| 3825 | 6661 |
| 3826 | 1939 |
| 3827 | 5444 |
| 3828 | 3398 |
| 3829 | 4551 |
| 3830 | 2904 |
| 3831 | 5697 |
| 3832 | 895 |
| 3833 | 6221 |
| 3834 | 3297 |
| 3835 | 4715 |
| 3836 | 2800 |
| 3837 | 4905 |
| 3838 | 1501 |
| 3839 | 3610 |
| 3840 | 5226 |
| 3841 | 2524 |
| 3842 | 7200 |

TABLE Q17-continued

| with a sequence length of 8192: | |
|---|---|
| Polarized channel sequence number | Reliability or reliability sequence number |
| 3843 | 1772 |
| 3844 | 4531 |
| 3845 | 3372 |
| 3846 | 5175 |
| 3847 | 2956 |
| 3848 | 4788 |
| 3849 | 1968 |
| 3850 | 6418 |
| 3851 | 3229 |
| 3852 | 5506 |
| 3853 | 2766 |
| 3854 | 5008 |
| 3855 | 3664 |
| 3856 | 4580 |
| 3857 | 1934 |
| 3858 | 6308 |
| 3859 | 2846 |
| 3860 | 5233 |
| 3861 | 3459 |
| 3862 | 4759 |
| 3863 | 1662 |
| 3864 | 5274 |
| 3865 | 2302 |
| 3866 | 6198 |
| 3867 | 3182 |
| 3868 | 4526 |
| 3869 | 1823 |
| 3870 | 5652 |
| 3871 | 2655 |
| 3872 | 4817 |
| 3873 | 3409 |
| 3874 | 6227 |
| 3875 | 1515 |
| 3876 | 4892 |
| 3877 | 2962 |
| 3878 | 3621 |
| 3879 | 5395 |
| 3880 | 1992 |
| 3881 | 4335 |
| 3882 | 2887 |
| 3883 | 6528 |
| 3884 | 3189 |
| 3885 | 5199 |
| 3886 | 2487 |
| 3887 | 4702 |
| 3888 | 959 |
| 3889 | 5228 |
| 3890 | 3284 |
| 3891 | 6720 |
| 3892 | 2773 |
| 3893 | 4933 |
| 3894 | 1778 |
| 3895 | 4474 |
| 3896 | 3609 |
| 3897 | 5666 |
| 3898 | 2977 |
| 3899 | 6201 |
| 3900 | 1882 |
| 3901 | 4812 |
| 3902 | 3378 |
| 3903 | 5389 |
| 3904 | 2746 |
| 3905 | 4555 |
| 3906 | 3243 |
| 3907 | 6256 |
| 3908 | 1941 |
| 3909 | 5344 |
| 3910 | 2538 |
| 3911 | 4906 |
| 3912 | 3401 |
| 3913 | 5286 |
| 3914 | 1502 |
| 3915 | 6279 |

TABLE Q17-continued with a sequence length of 8192:

| Polarized channel sequence number | Reliability or reliability sequence number |
|---|---|
| 3916 | 2861 |
| 3917 | 4763 |
| 3918 | 3606 |
| 3919 | 4415 |
| 3920 | 1780 |
| 3921 | 5424 |
| 3922 | 2787 |
| 3923 | 6412 |
| 3924 | 3298 |
| 3925 | 4913 |
| 3926 | 1894 |
| 3927 | 5656 |
| 3928 | 2429 |
| 3929 | 4818 |
| 3930 | 3343 |
| 3931 | 6222 |
| 3932 | 2916 |
| 3933 | 5315 |
| 3934 | 1897 |
| 3935 | 4533 |
| 3936 | 3720 |
| 3937 | 7171 |
| 3938 | 2671 |
| 3939 | 4717 |
| 3940 | 1725 |
| 3941 | 5179 |
| 3942 | 3288 |
| 3943 | 4938 |
| 3944 | 2867 |
| 3945 | 6338 |
| 3946 | 1014 |
| 3947 | 5390 |
| 3948 | 3461 |
| 3949 | 4584 |
| 3950 | 2545 |
| 3951 | 5289 |
| 3952 | 3844 |
| 3953 | 6665 |
| 3954 | 1517 |
| 3955 | 4792 |
| 3956 | 2964 |
| 3957 | 5668 |
| 3958 | 3230 |
| 3959 | 4476 |
| 3960 | 1955 |
| 3961 | 6229 |
| 3962 | 2774 |
| 3963 | 5024 |
| 3964 | 3380 |
| 3965 | 5448 |
| 3966 | 2862 |
| 3967 | 1884 |
| 3968 | 4723 |
| 3969 | 6433 |
| 3970 | 3622 |
| 3971 | 5234 |
| 3972 | 2511 |
| 3973 | 4347 |
| 3974 | 1751 |
| 3975 | 6202 |
| 3976 | 3190 |
| 3977 | 5276 |
| 3978 | 2748 |
| 3979 | 5056 |
| 3980 | 1839 |
| 3981 | 5397 |
| 3982 | 3351 |
| 3983 | 6312 |
| 3984 | 2891 |
| 3985 | 4775 |
| 3986 | 3245 |
| 3987 | 4557 |
| 3988 | 2000 |
| 3989 | 5889 |
| 3990 | 2777 |
| 3991 | 6283 |
| 3992 | 3680 |
| 3993 | 4934 |
| 3994 | 1523 |
| 3995 | 5207 |
| 3996 | 2491 |
| 3997 | 6465 |
| 3998 | 3462 |
| 3999 | 4833 |
| 4000 | 1942 |
| 4001 | 5317 |
| 4002 | 3193 |
| 4003 | 4534 |
| 4004 | 2920 |
| 4005 | 6662 |
| 4006 | 3651 |
| 4007 | 5508 |
| 4008 | 1755 |
| 4009 | 4908 |
| 4010 | 2978 |
| 4011 | 4765 |
| 4012 | 3404 |
| 4013 | 6243 |
| 4014 | 1017 |
| 4015 | 5639 |
| 4016 | 2789 |
| 4017 | 4563 |
| 4018 | 3271 |
| 4019 | 5236 |
| 4020 | 2540 |
| 4021 | 7424 |
| 4022 | 1945 |
| 4023 | 4995 |
| 4024 | 3625 |
| 4025 | 5411 |
| 4026 | 2869 |
| 4027 | 6230 |
| 4028 | 1957 |
| 4029 | 4718 |
| 4030 | 3251 |
| 4031 | 5290 |
| 4032 | 2719 |
| 4033 | 4537 |
| 4034 | 3300 |
| 4035 | 6420 |
| 4036 | 1767 |
| 4037 | 5181 |
| 4038 | 3009 |
| 4039 | 4945 |
| 4040 | 3728 |
| 4041 | 5761 |
| 4042 | 1518 |
| 4043 | 6204 |
| 4044 | 2430 |
| 4045 | 4725 |
| 4046 | 3465 |
| 4047 | 4592 |
| 4048 | 2968 |
| 4049 | 6233 |
| 4050 | 1898 |
| 4051 | 5402 |
| 4052 | 3246 |
| 4053 | 4820 |
| 4054 | 2679 |
| 4055 | 5297 |
| 4056 | 1847 |
| 4057 | 6673 |
| 4058 | 4558 |
| 4059 | 3612 |
| 4060 | 5211 |
| 4061 | 2893 |

TABLE Q17-continued with a sequence length of 8192:

| Polarized channel sequence number | Reliability or reliability sequence number |
|---|---|
| 4062 | 6340 |
| 4063 | 3410 |
| 4064 | 4914 |
| 4065 | 1784 |
| 4066 | 5698 |
| 4067 | 2546 |
| 4068 | 4779 |
| 4069 | 3194 |
| 4070 | 6434 |
| 4071 | 1905 |
| 4072 | 5456 |
| 4073 | 3653 |
| 4074 | 4343 |
| 4075 | 2778 |
| 4076 | 5318 |
| 4077 | 3384 |
| 4078 | 6285 |
| 4079 | 1525 |
| 4080 | 4937 |
| 4081 | 2980 |
| 4082 | 4834 |
| 4083 | 3275 |
| 4084 | 6245 |
| 4085 | 1018 |
| 4086 | 5413 |
| 4087 | 2790 |
| 4088 | 4447 |
| 4089 | 3355 |
| 4090 | 5292 |
| 4091 | 2870 |
| 4092 | 6424 |
| 4093 | 1946 |
| 4094 | 4879 |
| 4095 | 3626 |
| 4096 | 2548 |
| 4097 | 1871 |
| 4098 | 5643 |
| 4099 | 3135 |
| 4100 | 7680 |
| 4101 | 2899 |
| 4102 | 4824 |
| 4103 | 3425 |
| 4104 | 5240 |
| 4105 | 1726 |
| 4106 | 4997 |
| 4107 | 2793 |
| 4108 | 6291 |
| 4109 | 3848 |
| 4110 | 5401 |
| 4111 | 1900 |
| 4112 | 4565 |
| 4113 | 3253 |
| 4114 | 6666 |
| 4115 | 2873 |
| 4116 | 5321 |
| 4117 | 3367 |
| 4118 | 4766 |
| 4119 | 2016 |
| 4120 | 5672 |
| 4121 | 2493 |
| 4122 | 6320 |
| 4123 | 3633 |
| 4124 | 4916 |
| 4125 | 2928 |
| 4126 | 4538 |
| 4127 | 1757 |
| 4128 | 6286 |
| 4129 | 3304 |
| 4130 | 5398 |
| 4131 | 2735 |
| 4132 | 4726 |
| 4133 | 1407 |
| 4134 | 3412 |

TABLE Q17-continued with a sequence length of 8192:

| Polarized channel sequence number | Reliability or reliability sequence number |
|---|---|
| 4135 | 5182 |
| 4136 | 2951 |
| 4137 | 6436 |
| 4138 | 3658 |
| 4139 | 4887 |
| 4140 | 1958 |
| 4141 | 5512 |
| 4142 | 2519 |
| 4143 | 6175 |
| 4144 | 3466 |
| 4145 | 4579 |
| 4146 | 1987 |
| 4147 | 5700 |
| 4148 | 3744 |
| 4149 | 4781 |
| 4150 | 2683 |
| 4151 | 6344 |
| 4152 | 3196 |
| 4153 | 5263 |
| 4154 | 1851 |
| 4155 | 4998 |
| 4156 | 2894 |
| 4157 | 6674 |
| 4158 | 3473 |
| 4159 | 5223 |
| 4160 | 3010 |
| 4161 | 4463 |
| 4162 | 1020 |
| 4163 | 5414 |
| 4164 | 3776 |
| 4165 | 6407 |
| 4166 | 2780 |
| 4167 | 4729 |
| 4168 | 1771 |
| 4169 | 5762 |
| 4170 | 3277 |
| 4171 | 7173 |
| 4172 | 2303 |
| 4173 | 4940 |
| 4174 | 3357 |
| 4175 | 5298 |
| 4176 | 1961 |
| 4177 | 4566 |
| 4178 | 3654 |
| 4179 | 6234 |
| 4180 | 2901 |
| 4181 | 5472 |
| 4182 | 3254 |
| 4183 | 4807 |
| 4184 | 1471 |
| 4185 | 6293 |
| 4186 | 2743 |
| 4187 | 5213 |
| 4188 | 3371 |
| 4189 | 4787 |
| 4190 | 2874 |
| 4191 | 4540 |
| 4192 | 1906 |
| 4193 | 6529 |
| 4194 | 3628 |
| 4195 | 5651 |
| 4196 | 2523 |
| 4197 | 4836 |
| 4198 | 1948 |
| 4199 | 6784 |
| 4200 | 3283 |
| 4201 | 5322 |
| 4202 | 2984 |
| 4203 | 5001 |
| 4204 | 3426 |
| 4205 | 6246 |
| 4206 | 1758 |
| 4207 | 5443 |

TABLE Q17-continued

| with a sequence length of 8192: | |
|---|---|
| Polarized channel sequence number | Reliability or reliability sequence number |
| 4208 | 3856 |
| 4209 | 4569 |
| 4210 | 2794 |
| 4211 | 5227 |
| 4212 | 3257 |
| 4213 | 6249 |
| 4214 | 1879 |
| 4215 | 4782 |
| 4216 | 2955 |
| 4217 | 5645 |
| 4218 | 3416 |
| 4219 | 6307 |
| 4220 | 2915 |
| 4221 | 4946 |
| 4222 | 1989 |
| 4223 | 5417 |
| 4224 | 3715 |
| 4225 | 4730 |
| 4226 | 2535 |
| 4227 | 6466 |
| 4228 | 1773 |
| 4229 | 5300 |
| 4230 | 3312 |
| 4231 | 4349 |
| 4232 | 3468 |
| 4233 | 6236 |
| 4234 | 2685 |
| 4235 | 5520 |
| 4236 | 1526 |
| 4237 | 4920 |
| 4238 | 3665 |
| 4239 | 7232 |
| 4240 | 2902 |
| 4241 | 5680 |
| 4242 | 3278 |
| 4243 | 4811 |
| 4244 | 991 |
| 4245 | 5271 |
| 4246 | 2876 |
| 4247 | 6668 |
| 4248 | 3358 |
| 4249 | 4581 |
| 4250 | 2801 |
| 4251 | 5329 |
| 4252 | 1908 |
| 4253 | 6191 |
| 4254 | 3634 |
| 4255 | 4891 |
| 4256 | 3167 |
| 4257 | 5404 |
| 4258 | 1962 |
| 4259 | 6411 |
| 4260 | 2552 |
| 4261 | 4671 |
| 4262 | 3657 |
| 4263 | 5646 |
| 4264 | 2905 |
| 4265 | 4511 |
| 4266 | 1853 |
| 4267 | 6352 |
| 4268 | 3474 |
| 4269 | 5214 |
| 4270 | 2767 |
| 4271 | 4961 |
| 4272 | 3399 |
| 4273 | 6294 |
| 4274 | 1779 |
| 4275 | 5445 |
| 4276 | 3599 |
| 4277 | 4789 |
| 4278 | 3012 |
| 4279 | 6689 |
| 4280 | 3285 |

TABLE Q17-continued

| with a sequence length of 8192: | |
|---|---|
| Polarized channel sequence number | Reliability or reliability sequence number |
| 4281 | 5324 |
| 4282 | 1969 |
| 4283 | 4903 |
| 4284 | 2957 |
| 4285 | 6440 |
| 4286 | 3489 |
| 4287 | 5704 |
| 4288 | 2494 |
| 4289 | 4471 |
| 4290 | 1883 |
| 4291 | 5418 |
| 4292 | 3717 |
| 4293 | 6297 |
| 4294 | 2747 |
| 4295 | 4840 |
| 4296 | 3258 |
| 4297 | 5275 |
| 4298 | 1529 |
| 4299 | 6309 |
| 4300 | 3872 |
| 4301 | 4948 |
| 4302 | 2917 |
| 4303 | 5890 |
| 4304 | 3373 |
| 4305 | 7177 |
| 4306 | 1990 |
| 4307 | 4570 |
| 4308 | 2963 |
| 4309 | 5425 |
| 4310 | 3299 |
| 4311 | 5002 |
| 4312 | 2525 |
| 4313 | 6468 |
| 4314 | 5330 |
| 4315 | 1774 |
| 4316 | 4732 |
| 4317 | 3636 |
| 4318 | 6721 |
| 4319 | 3428 |
| 4320 | 5229 |
| 4321 | 2796 |
| 4322 | 4582 |
| 4323 | 1964 |
| 4324 | 6250 |
| 4325 | 3183 |
| 4326 | 5653 |
| 4327 | 2992 |
| 4328 | 5009 |
| 4329 | 3607 |
| 4330 | 6199 |
| 4331 | 1912 |
| 4332 | 5450 |
| 4333 | 2958 |
| 4334 | 4813 |
| 4335 | 3379 |
| 4336 | 6530 |
| 4337 | 3718 |
| 4338 | 5304 |
| 4339 | 1993 |
| 4340 | 4893 |
| 4341 | 2686 |
| 4342 | 5536 |
| 4343 | 3476 |
| 4344 | 6257 |
| 4345 | 2847 |
| 4346 | 4585 |
| 4347 | 1007 |
| 4348 | 5764 |
| 4349 | 3286 |
| 4350 | 6298 |
| 4351 | 4790 |
| 4352 | 3660 |
| 4353 | 5235 |

TABLE Q17-continued

| with a sequence length of 8192: | |
|---|---|
| Polarized channel sequence number | Reliability or reliability sequence number |
| 4354 | 2539 |
| 4355 | 7174 |
| 4356 | 1854 |
| 4357 | 4907 |
| 4358 | 3374 |
| 4359 | 5568 |
| 4360 | 3016 |
| 4361 | 6676 |
| 4362 | 3260 |
| 4363 | 4527 |
| 4364 | 1530 |
| 4365 | 5667 |
| 4366 | 2802 |
| 4367 | 6419 |
| 4368 | 3721 |
| 4369 | 4819 |
| 4370 | 3403 |
| 4371 | 5287 |
| 4372 | 1781 |
| 4373 | 4962 |
| 4374 | 2906 |
| 4375 | 6223 |
| 4376 | 3666 |
| 4377 | 4793 |
| 4378 | 2965 |
| 4379 | 4475 |
| 4380 | 6252 |
| 4381 | 1935 |
| 4382 | 5446 |
| 4383 | 3289 |
| 4384 | 4952 |
| 4385 | 2526 |
| 4386 | 6690 |
| 4387 | 3432 |
| 4388 | 5345 |
| 4389 | 1895 |
| 4390 | 4848 |
| 4391 | 3843 |
| 4392 | 6413 |
| 4393 | 2804 |
| 4394 | 5658 |
| 4395 | 3490 |
| 4396 | 4572 |
| 4397 | 1970 |
| 4398 | 6368 |
| 4399 | 2918 |
| 4400 | 5420 |
| 4401 | 3301 |
| 4402 | 5004 |
| 4403 | 3640 |
| 4404 | 6310 |
| 4405 | 5277 |
| 4406 | 1663 |
| 4407 | 4814 |
| 4408 | 2921 |
| 4409 | 5712 |
| 4410 | 3381 |
| 4411 | 7185 |
| 4412 | 2749 |
| 4413 | 4894 |
| 4414 | 1885 |
| 4415 | 5507 |
| 4416 | 3611 |
| 4417 | 6448 |
| 4418 | 3231 |
| 4419 | 4350 |
| 4420 | 2541 |
| 4421 | 5230 |
| 4422 | 1994 |
| 4423 | 6680 |
| 4424 | 3521 |
| 4425 | 4703 |
| 4426 | 5457 |

TABLE Q17-continued

| with a sequence length of 8192: | |
|---|---|
| Polarized channel sequence number | Reliability or reliability sequence number |
| 4427 | 2979 |
| 4428 | 6339 |
| 4429 | 3681 |
| 4430 | 5010 |
| 4431 | 1532 |
| 4432 | 5669 |
| 4433 | 2908 |
| 4434 | 6203 |
| 4435 | 3480 |
| 4436 | 4935 |
| 4437 | 3623 |
| 4438 | 5237 |
| 4439 | 1899 |
| 4440 | 6414 |
| 4441 | 2775 |
| 4442 | 4535 |
| 4443 | 3191 |
| 4444 | 5332 |
| 4445 | 6313 |
| 4446 | 2863 |
| 4447 | 4821 |
| 4448 | 3405 |
| 4449 | 5657 |
| 4450 | 1727 |
| 4451 | 6692 |
| 4452 | 3845 |
| 4453 | 5025 |
| 4454 | 3024 |
| 4455 | 5426 |
| 4456 | 3290 |
| 4457 | 7178 |
| 4458 | 1019 |
| 4459 | 4794 |
| 4460 | 2547 |
| 4461 | 5291 |
| 4462 | 3668 |
| 4463 | 6472 |
| 4464 | 4586 |
| 4465 | 3492 |
| 4466 | 5449 |
| 4467 | 1972 |
| 4468 | 6258 |
| 4469 | 2966 |
| 4470 | 4909 |
| 4471 | 3302 |
| 4472 | 5654 |
| 4473 | 2779 |
| 4474 | 4835 |
| 4475 | 1943 |
| 4476 | 6300 |
| 4477 | 3722 |
| 4478 | 5346 |
| 4479 | 4477 |
| 4480 | 3382 |
| 4481 | 6421 |
| 4482 | 2969 |
| 4483 | 5391 |
| 4484 | 3729 |
| 4485 | 4964 |
| 4486 | 2001 |
| 4487 | 6913 |
| 4488 | 2981 |
| 4489 | 5768 |
| 4490 | 3411 |
| 4491 | 4719 |
| 4492 | 3613 |
| 4493 | 6231 |
| 4494 | 1886 |
| 4495 | 5336 |
| 4496 | 4915 |
| 4497 | 2791 |
| 4498 | 6341 |
| 4499 | 3305 |

TABLE Q17-continued with a sequence length of 8192:

| Polarized channel sequence number | Reliability or reliability sequence number |
|---|---|
| 4500 | 5509 |
| 4501 | 2542 |
| 4502 | 4593 |
| 4503 | 1782 |
| 4504 | 7186 |
| 4505 | 3385 |
| 4506 | 5892 |
| 4507 | 3627 |
| 4508 | 5012 |
| 4509 | 2922 |
| 4510 | 6532 |
| 4511 | 5278 |
| 4512 | 1503 |
| 4513 | 4822 |
| 4514 | 3440 |
| 4515 | 6663 |
| 4516 | 2871 |
| 4517 | 5428 |
| 4518 | 3904 |
| 4519 | 4910 |
| 4520 | 3247 |
| 4521 | 6260 |
| 4522 | 1996 |
| 4523 | 5670 |
| 4524 | 4559 |
| 4525 | 2808 |
| 4526 | 6435 |
| 4527 | 3463 |
| 4528 | 5238 |
| 4529 | 3682 |
| 4530 | 4796 |
| 4531 | 1947 |
| 4532 | 6314 |
| 4533 | 2929 |
| 4534 | 5399 |
| 4535 | 3195 |
| 4536 | 4939 |
| 4537 | 6205 |
| 4538 | 2549 |
| 4539 | 5293 |
| 4540 | 2002 |
| 4541 | 4825 |
| 4542 | 3672 |
| 4543 | 6785 |
| 4544 | 3406 |
| 4545 | 5728 |
| 4546 | 2970 |
| 4547 | 4539 |
| 4548 | 3522 |
| 4549 | 7296 |
| 4550 | 5510 |
| 4551 | 1901 |
| 4552 | 5241 |
| 4553 | 2895 |
| 4554 | 6426 |
| 4555 | 3724 |
| 4556 | 4968 |
| 4557 | 3292 |
| 4558 | 6321 |
| 4559 | 1785 |
| 4560 | 5699 |
| 4561 | 2750 |
| 4562 | 5026 |
| 4563 | 6235 |
| 4564 | 3614 |
| 4565 | 5452 |
| 4566 | 2924 |
| 4567 | 4837 |
| 4568 | 3413 |
| 4569 | 6722 |
| 4570 | 1976 |
| 4571 | 5319 |
| 4572 | 3849 |

TABLE Q17-continued with a sequence length of 8192:

| Polarized channel sequence number | Reliability or reliability sequence number |
|---|---|
| 4573 | 4588 |
| 4574 | 6480 |
| 4575 | 3040 |
| 4576 | 5673 |
| 4577 | 3255 |
| 4578 | 4917 |
| 4579 | 1907 |
| 4580 | 6342 |
| 4581 | 3386 |
| 4582 | 5299 |
| 4583 | 2781 |
| 4584 | 4767 |
| 4585 | 3730 |
| 4586 | 6437 |
| 4587 | 5348 |
| 4588 | 2431 |
| 4589 | 5057 |
| 4590 | 1959 |
| 4591 | 7180 |
| 4592 | 3496 |
| 4593 | 5776 |
| 4594 | 3655 |
| 4595 | 4478 |
| 4596 | 2982 |
| 4597 | 6316 |
| 4598 | 5513 |
| 4599 | 1015 |
| 4600 | 5016 |
| 4601 | 3306 |
| 4602 | 6667 |
| 4603 | 3745 |
| 4604 | 5294 |
| 4605 | 3011 |
| 4606 | 4727 |
| 4607 | 6264 |
| 4608 | 3467 |
| 4609 | 5660 |
| 4610 | 1519 |
| 4611 | 4941 |
| 4612 | 2875 |
| 4613 | 6425 |
| 4614 | 3629 |
| 4615 | 5458 |
| 4616 | 3427 |
| 4617 | 4594 |
| 4618 | 6345 |
| 4619 | 2017 |
| 4620 | 5242 |
| 4621 | 2795 |
| 4622 | 6696 |
| 4623 | 3197 |
| 4624 | 5701 |
| 4625 | 3846 |
| 4626 | 4826 |
| 4627 | 2985 |
| 4628 | 7201 |
| 4629 | 5432 |
| 4630 | 1786 |
| 4631 | 5028 |
| 4632 | 3414 |
| 4633 | 6422 |
| 4634 | 2495 |
| 4635 | 5323 |
| 4636 | 3684 |
| 4637 | 4838 |
| 4638 | 6206 |
| 4639 | 1949 |
| 4640 | 5403 |
| 4641 | 3388 |
| 4642 | 4918 |
| 4643 | 2930 |
| 4644 | 6536 |
| 4645 | 3635 |

TABLE Q17-continued

| with a sequence length of 8192: | |
|---|---|
| Polarized channel sequence number | Reliability or reliability sequence number |
| 4646 | 5674 |
| 4647 | 3313 |
| 4648 | 4596 |
| 4649 | 6724 |
| 4650 | 1902 |
| 4651 | 5183 |
| 4652 | 2972 |
| 4653 | 4947 |
| 4654 | 3417 |
| 4655 | 6287 |
| 4656 | 2782 |
| 4657 | 5473 |
| 4658 | 6247 |
| 4659 | 3732 |
| 4660 | 4841 |
| 4661 | 1909 |
| 4662 | 5896 |
| 4663 | 3279 |
| 4664 | 6438 |
| 4665 | 2903 |
| 4666 | 5301 |
| 4667 | 4921 |
| 4668 | 3630 |
| 4669 | 7233 |
| 4670 | 2004 |
| 4671 | 5415 |
| 4672 | 3524 |
| 4673 | 4541 |
| 4674 | 3013 |
| 4675 | 6786 |
| 4676 | 5681 |
| 4677 | 3857 |
| 4678 | 4976 |
| 4679 | 2797 |
| 4680 | 6322 |
| 4681 | 1963 |
| 4682 | 5352 |
| 4683 | 3469 |
| 4684 | 4783 |
| 4685 | 6496 |
| 4686 | 3659 |
| 4687 | 5460 |
| 4688 | 2550 |
| 4689 | 6237 |
| 4690 | 3259 |
| 4691 | 4999 |
| 4692 | 1788 |
| 4693 | 5706 |
| 4694 | 6675 |
| 4695 | 3429 |
| 4696 | 4567 |
| 4697 | 2932 |
| 4698 | 5514 |
| 4699 | 3688 |
| 4700 | 6346 |
| 4701 | 1531 |
| 4702 | 5792 |
| 4703 | 4731 |
| 4704 | 3475 |
| 4705 | 7188 |
| 4706 | 2986 |
| 4707 | 5244 |
| 4708 | 3746 |
| 4709 | 4942 |
| 4710 | 3308 |
| 4711 | 6467 |
| 4712 | 5521 |
| 4713 | 2018 |
| 4714 | 6251 |
| 4715 | 2877 |
| 4716 | 5058 |
| 4717 | 3850 |
| 4718 | 5824 |

TABLE Q17-continued

| with a sequence length of 8192: | |
|---|---|
| Polarized channel sequence number | Reliability or reliability sequence number |
| 4719 | 6669 |
| 4720 | 2803 |
| 4721 | 4828 |
| 4722 | 3504 |
| 4723 | 5325 |
| 4724 | 2008 |
| 4725 | 6441 |
| 4726 | 3637 |
| 4727 | 4351 |
| 4728 | 5405 |
| 4729 | 2993 |
| 4730 | 6324 |
| 4731 | 3470 |
| 4732 | 5702 |
| 4733 | 3777 |
| 4734 | 7202 |
| 4735 | 4949 |
| 4736 | 1950 |
| 4737 | 5302 |
| 4738 | 2907 |
| 4739 | 6544 |
| 4740 | 3198 |
| 4741 | 4791 |
| 4742 | 3736 |
| 4743 | 5419 |
| 4744 | 6704 |
| 4745 | 2553 |
| 4746 | 4922 |
| 4747 | 1910 |
| 4748 | 5676 |
| 4749 | 3359 |
| 4750 | 6295 |
| 4751 | 4571 |
| 4752 | 3528 |
| 4753 | 6353 |
| 4754 | 3014 |
| 4755 | 5331 |
| 4756 | 3661 |
| 4757 | 5032 |
| 4758 | 1759 |
| 4759 | 6428 |
| 4760 | 5474 |
| 4761 | 2798 |
| 4762 | 5904 |
| 4763 | 3314 |
| 4764 | 6670 |
| 4765 | 3858 |
| 4766 | 4842 |
| 4767 | 5305 |
| 4768 | 2988 |
| 4769 | 7192 |
| 4770 | 1021 |
| 4771 | 5003 |
| 4772 | 3418 |
| 4773 | 6238 |
| 4774 | 5464 |
| 4775 | 3748 |
| 4776 | 4963 |
| 4777 | 2936 |
| 4778 | 6469 |
| 4779 | 1965 |
| 4780 | 5763 |
| 4781 | 4583 |
| 4782 | 3477 |
| 4783 | 6348 |
| 4784 | 3638 |
| 4785 | 5360 |
| 4786 | 3017 |
| 4787 | 6728 |
| 4788 | 3316 |
| 4789 | 5516 |
| 4790 | 4733 |
| 4791 | 1913 |

TABLE Q17-continued with a sequence length of 8192:

| Polarized channel sequence number | Reliability or reliability sequence number |
|---|---|
| 4792 | 6442 |
| 4793 | 3667 |
| 4794 | 5713 |
| 4795 | 2878 |
| 4796 | 4950 |
| 4797 | 6299 |
| 4798 | 3430 |
| 4799 | 5326 |
| 4800 | 3968 |
| 4801 | 7204 |
| 4802 | 1991 |
| 4803 | 4924 |
| 4804 | 5406 |
| 4805 | 2554 |
| 4806 | 6914 |
| 4807 | 3433 |
| 4808 | 4849 |
| 4809 | 3641 |
| 4810 | 5682 |
| 4811 | 6449 |
| 4812 | 2805 |
| 4813 | 5215 |
| 4814 | 1971 |
| 4815 | 6354 |
| 4816 | 3261 |
| 4817 | 4600 |
| 4818 | 5705 |
| 4819 | 3696 |
| 4820 | 6253 |
| 4821 | 2959 |
| 4822 | 4953 |
| 4823 | 3491 |
| 4824 | 5522 |
| 4825 | 6677 |
| 4826 | 2020 |
| 4827 | 4815 |
| 4828 | 3719 |
| 4829 | 7425 |
| 4830 | 2919 |
| 4831 | 5447 |
| 4832 | 5647 |
| 4833 | 3420 |
| 4834 | 6474 |
| 4835 | 2994 |
| 4836 | 5060 |
| 4837 | 5333 |
| 4838 | 3287 |
| 4839 | 6328 |
| 4840 | 1527 |
| 4841 | 5005 |
| 4842 | 3852 |
| 4843 | 6560 |
| 4844 | 5537 |
| 4845 | 2687 |
| 4846 | 4542 |
| 4847 | 3375 |
| 4848 | 6788 |
| 4849 | 3662 |
| 4850 | 5765 |
| 4851 | 4795 |
| 4852 | 1966 |
| 4853 | 6259 |
| 4854 | 2909 |
| 4855 | 5306 |
| 4856 | 3536 |
| 4857 | 7175 |
| 4858 | 5920 |
| 4859 | 3778 |
| 4860 | 4965 |
| 4861 | 3018 |
| 4862 | 6592 |
| 4863 | 5421 |
| 4864 | 1775 |

TABLE Q17-continued with a sequence length of 8192:

| Polarized channel sequence number | Reliability or reliability sequence number |
|---|---|
| 4865 | 5011 |
| 4866 | 3478 |
| 4867 | 6691 |
| 4868 | 3669 |
| 4869 | 5347 |
| 4870 | 6311 |
| 4871 | 2556 |
| 4872 | 4573 |
| 4873 | 3291 |
| 4874 | 5684 |
| 4875 | 1914 |
| 4876 | 6470 |
| 4877 | 5476 |
| 4878 | 3873 |
| 4879 | 6369 |
| 4880 | 2923 |
| 4881 | 4844 |
| 4882 | 5231 |
| 4883 | 3481 |
| 4884 | 6682 |
| 4885 | 3642 |
| 4886 | 5040 |
| 4887 | 1995 |
| 4888 | 5655 |
| 4889 | 7297 |
| 4890 | 2751 |
| 4891 | 5006 |
| 4892 | 3493 |
| 4893 | 6444 |
| 4894 | 3752 |
| 4895 | 5427 |
| 4896 | 5766 |
| 4897 | 3303 |
| 4898 | 6301 |
| 4899 | 2996 |
| 4900 | 4734 |
| 4901 | 6736 |
| 4902 | 1855 |
| 4903 | 5524 |
| 4904 | 3723 |
| 4905 | 4895 |
| 4906 | 3434 |
| 4907 | 6531 |
| 4908 | 5334 |
| 4909 | 2967 |
| 4910 | 5708 |
| 4911 | 3905 |
| 4912 | 6254 |
| 4913 | 4587 |
| 4914 | 1973 |
| 4915 | 7234 |
| 4916 | 3383 |
| 4917 | 5422 |
| 4918 | 3025 |
| 4919 | 5064 |
| 4920 | 6481 |
| 4921 | 3683 |
| 4922 | 5308 |
| 4923 | 3320 |
| 4924 | 6693 |
| 4925 | 4850 |
| 4926 | 2024 |
| 4927 | 5769 |
| 4928 | 2910 |
| 4929 | 6261 |
| 4930 | 5451 |
| 4931 | 3670 |
| 4932 | 4954 |
| 4933 | 3441 |
| 4934 | 6356 |
| 4935 | 2806 |
| 4936 | 5714 |
| 4937 | 6681 |

TABLE Q17-continued with a sequence length of 8192:

| Polarized channel sequence number | Reliability or reliability sequence number |
|---|---|
| 4938 | 3860 |
| 4939 | 5013 |
| 4940 | 1916 |
| 4941 | 5337 |
| 4942 | 7179 |
| 4943 | 3482 |
| 4944 | 4574 |
| 4945 | 2527 |
| 4946 | 6450 |
| 4947 | 3644 |
| 4948 | 5480 |
| 4949 | 5891 |
| 4950 | 3407 |
| 4951 | 6315 |
| 4952 | 1787 |
| 4953 | 4852 |
| 4954 | 6473 |
| 4955 | 3020 |
| 4956 | 5538 |
| 4957 | 3673 |
| 4958 | 4966 |
| 4959 | 6678 |
| 4960 | 3262 |
| 4961 | 5349 |
| 4962 | 2971 |
| 4963 | 6370 |
| 4964 | 5688 |
| 4965 | 1997 |
| 4966 | 4969 |
| 4967 | 3780 |
| 4968 | 7208 |
| 4969 | 3436 |
| 4970 | 5429 |
| 4971 | 6415 |
| 4972 | 3026 |
| 4973 | 4797 |
| 4974 | 3874 |
| 4975 | 5659 |
| 4976 | 6792 |
| 4977 | 3552 |
| 4978 | 5279 |
| 4979 | 1974 |
| 4980 | 6360 |
| 4981 | 4589 |
| 4982 | 3293 |
| 4983 | 5569 |
| 4984 | 2925 |
| 4985 | 6533 |
| 4986 | 5027 |
| 4987 | 3494 |
| 4988 | 7236 |
| 4989 | 3725 |
| 4990 | 5729 |
| 4991 | 4956 |
| 4992 | 1533 |
| 4993 | 6916 |
| 4994 | 2809 |
| 4995 | 5528 |
| 4996 | 3523 |
| 4997 | 6302 |
| 4998 | 5671 |
| 4999 | 3685 |
| 5000 | 4823 |
| 5001 | 3000 |
| 5002 | 6452 |
| 5003 | 5239 |
| 5004 | 3387 |
| 5005 | 6694 |
| 5006 | 2003 |
| 5007 | 4911 |
| 5008 | 5453 |
| 5009 | 3864 |
| 5010 | 6262 |

TABLE Q17-continued with a sequence length of 8192:

| Polarized channel sequence number | Reliability or reliability sequence number |
|---|---|
| 5011 | 2931 |
| 5012 | 5893 |
| 5013 | 7681 |
| 5014 | 3307 |
| 5015 | 5072 |
| 5016 | 3731 |
| 5017 | 5338 |
| 5018 | 6423 |
| 5019 | 2983 |
| 5020 | 4595 |
| 5021 | 1022 |
| 5022 | 6317 |
| 5023 | 5716 |
| 5024 | 3497 |
| 5025 | 5540 |
| 5026 | 3760 |
| 5027 | 6752 |
| 5028 | 5014 |
| 5029 | 3442 |
| 5030 | 6534 |
| 5031 | 2543 |
| 5032 | 5350 |
| 5033 | 4827 |
| 5034 | 1977 |
| 5035 | 6265 |
| 5036 | 3726 |
| 5037 | 5770 |
| 5038 | 7298 |
| 5039 | 3484 |
| 5040 | 5430 |
| 5041 | 3041 |
| 5042 | 5017 |
| 5043 | 6723 |
| 5044 | 3876 |
| 5045 | 5777 |
| 5046 | 3294 |
| 5047 | 6476 |
| 5048 | 5029 |
| 5049 | 2032 |
| 5050 | 5459 |
| 5051 | 2810 |
| 5052 | 6343 |
| 5053 | 5661 |
| 5054 | 3615 |
| 5055 | 6697 |
| 5056 | 3415 |
| 5057 | 4839 |
| 5058 | 5353 |
| 5059 | 2973 |
| 5060 | 7187 |
| 5061 | 3784 |
| 5062 | 4590 |
| 5063 | 6323 |
| 5064 | 1998 |
| 5065 | 5433 |
| 5066 | 3525 |
| 5067 | 6372 |
| 5068 | 5675 |
| 5069 | 3847 |
| 5070 | 4970 |
| 5071 | 2926 |
| 5072 | 6800 |
| 5073 | 5488 |
| 5074 | 3309 |
| 5075 | 6537 |
| 5076 | 3674 |
| 5077 | 4919 |
| 5078 | 5952 |
| 5079 | 1783 |
| 5080 | 7181 |
| 5081 | 2933 |
| 5082 | 5295 |
| 5083 | 6318 |

TABLE Q17-continued with a sequence length of 8192:

| Polarized channel sequence number | Reliability or reliability sequence number |
|---|---|
| 5084 | 3444 |
| 5085 | 4856 |
| 5086 | 3733 |
| 5087 | 5511 |
| 5088 | 6684 |
| 5089 | 3498 |
| 5090 | 5730 |
| 5091 | 1887 |
| 5092 | 6482 |
| 5093 | 4977 |
| 5094 | 3028 |
| 5095 | 6266 |
| 5096 | 5243 |
| 5097 | 3969 |
| 5098 | 4597 |
| 5099 | 3389 |
| 5100 | 6725 |
| 5101 | 5720 |
| 5102 | 2987 |
| 5103 | 7216 |
| 5104 | 3686 |
| 5105 | 5454 |
| 5106 | 5018 |
| 5107 | 2005 |
| 5108 | 6456 |
| 5109 | 3315 |
| 5110 | 5570 |
| 5111 | 6347 |
| 5112 | 2812 |
| 5113 | 4943 |
| 5114 | 3689 |
| 5115 | 6427 |
| 5116 | 5772 |
| 5117 | 3747 |
| 5118 | 5340 |
| 5119 | 6698 |
| 5120 | 3505 |
| 5121 | 4798 |
| 5122 | 1978 |
| 5123 | 7182 |
| 5124 | 5662 |
| 5125 | 2555 |
| 5126 | 4972 |
| 5127 | 3906 |
| 5128 | 6207 |
| 5129 | 5461 |
| 5130 | 3419 |
| 5131 | 6497 |
| 5132 | 3042 |
| 5133 | 5897 |
| 5134 | 6920 |
| 5135 | 3676 |
| 5136 | 5088 |
| 5137 | 2019 |
| 5138 | 5303 |
| 5139 | 6325 |
| 5140 | 3526 |
| 5141 | 5434 |
| 5142 | 7240 |
| 5143 | 3631 |
| 5144 | 4829 |
| 5145 | 3032 |
| 5146 | 5778 |
| 5147 | 6439 |
| 5148 | 3310 |
| 5149 | 4479 |
| 5150 | 3851 |
| 5151 | 6705 |
| 5152 | 5544 |
| 5153 | 1903 |
| 5154 | 6376 |
| 5155 | 5703 |
| 5156 | 2974 |

TABLE Q17-continued with a sequence length of 8192:

| Polarized channel sequence number | Reliability or reliability sequence number |
|---|---|
| 5157 | 5030 |
| 5158 | 3500 |
| 5159 | 6484 |
| 5160 | 5354 |
| 5161 | 3792 |
| 5162 | 7426 |
| 5163 | 3448 |
| 5164 | 5793 |
| 5165 | 6730 |
| 5166 | 2934 |
| 5167 | 5059 |
| 5168 | 5515 |
| 5169 | 2006 |
| 5170 | 6538 |
| 5171 | 3734 |
| 5172 | 4923 |
| 5173 | 6816 |
| 5174 | 3529 |
| 5175 | 5677 |
| 5176 | 2783 |
| 5177 | 6268 |
| 5178 | 5475 |
| 5179 | 3880 |
| 5180 | 4843 |
| 5181 | 6545 |
| 5182 | 3390 |
| 5183 | 5245 |
| 5184 | 1980 |
| 5185 | 7189 |
| 5186 | 5894 |
| 5187 | 3737 |
| 5188 | 6848 |
| 5189 | 2989 |
| 5190 | 5033 |
| 5191 | 5462 |
| 5192 | 3317 |
| 5193 | 6349 |
| 5194 | 4543 |
| 5195 | 3749 |
| 5196 | 6429 |
| 5197 | 2937 |
| 5198 | 5732 |
| 5199 | 6726 |
| 5200 | 3471 |
| 5201 | 5436 |
| 5202 | 2009 |
| 5203 | 4978 |
| 5204 | 7300 |
| 5205 | 3908 |
| 5206 | 5683 |
| 5207 | 6326 |
| 5208 | 3690 |
| 5209 | 5361 |
| 5210 | 3015 |
| 5211 | 6443 |
| 5212 | 5020 |
| 5213 | 3431 |
| 5214 | 5465 |
| 5215 | 6700 |
| 5216 | 3639 |
| 5217 | 4830 |
| 5218 | 1534 |
| 5219 | 6355 |
| 5220 | 5780 |
| 5221 | 2995 |
| 5222 | 7203 |
| 5223 | 5327 |
| 5224 | 3506 |
| 5225 | 4951 |
| 5226 | 3970 |
| 5227 | 6498 |
| 5228 | 5678 |
| 5229 | 3199 |

TABLE Q17-continued with a sequence length of 8192:

| Polarized channel sequence number | Reliability or reliability sequence number |
|---|---|
| 5230 | 6928 |
| 5231 | 5572 |
| 5232 | 3044 |
| 5233 | 6329 |
| 5234 | 1789 |
| 5235 | 5061 |
| 5236 | 7194 |
| 5237 | 3697 |
| 5238 | 5905 |
| 5239 | 4845 |
| 5240 | 3421 |
| 5241 | 6488 |
| 5242 | 3738 |
| 5243 | 5517 |
| 5244 | 6787 |
| 5245 | 2551 |
| 5246 | 5707 |
| 5247 | 6384 |
| 5248 | 3530 |
| 5249 | 4598 |
| 5250 | 3859 |
| 5251 | 5307 |
| 5252 | 6540 |
| 5253 | 2021 |
| 5254 | 5477 |
| 5255 | 7248 |
| 5256 | 2990 |
| 5257 | 4980 |
| 5258 | 3663 |
| 5259 | 6737 |
| 5260 | 5736 |
| 5261 | 3435 |
| 5262 | 6350 |
| 5263 | 5523 |
| 5264 | 3692 |
| 5265 | 5034 |
| 5266 | 2799 |
| 5267 | 6430 |
| 5268 | 5794 |
| 5269 | 1951 |
| 5270 | 6706 |
| 5271 | 5356 |
| 5272 | 3263 |
| 5273 | 7205 |
| 5274 | 3853 |
| 5275 | 4925 |
| 5276 | 5898 |
| 5277 | 3508 |
| 5278 | 6239 |
| 5279 | 4851 |
| 5280 | 2938 |
| 5281 | 6729 |
| 5282 | 3808 |
| 5283 | 5552 |
| 5284 | 6546 |
| 5285 | 3479 |
| 5286 | 5685 |
| 5287 | 6471 |
| 5288 | 1911 |
| 5289 | 5041 |
| 5290 | 3750 |
| 5291 | 5518 |
| 5292 | 7193 |
| 5293 | 3019 |
| 5294 | 5825 |
| 5295 | 6671 |
| 5296 | 3537 |
| 5297 | 4955 |
| 5298 | 6357 |
| 5299 | 3888 |
| 5300 | 5246 |
| 5301 | 2879 |
| 5302 | 6561 |

TABLE Q17-continued with a sequence length of 8192:

| Polarized channel sequence number | Reliability or reliability sequence number |
|---|---|
| 5303 | 5784 |
| 5304 | 2010 |
| 5305 | 4601 |
| 5306 | 7190 |
| 5307 | 3779 |
| 5308 | 5407 |
| 5309 | 3422 |
| 5310 | 6789 |
| 5311 | 5576 |
| 5312 | 3643 |
| 5313 | 6330 |
| 5314 | 5062 |
| 5315 | 2997 |
| 5316 | 6944 |
| 5317 | 5709 |
| 5318 | 3318 |
| 5319 | 4846 |
| 5320 | 3854 |
| 5321 | 6445 |
| 5322 | 5362 |
| 5323 | 2022 |
| 5324 | 7304 |
| 5325 | 5906 |
| 5326 | 3532 |
| 5327 | 6371 |
| 5328 | 5036 |
| 5329 | 3048 |
| 5330 | 6708 |
| 5331 | 3753 |
| 5332 | 5466 |
| 5333 | 6500 |
| 5334 | 3912 |
| 5335 | 5796 |
| 5336 | 4984 |
| 5337 | 3483 |
| 5338 | 6255 |
| 5339 | 5525 |
| 5340 | 2940 |
| 5341 | 7682 |
| 5342 | 2025 |
| 5343 | 5686 |
| 5344 | 6679 |
| 5345 | 3698 |
| 5346 | 5065 |
| 5347 | 6451 |
| 5348 | 3538 |
| 5349 | 5364 |
| 5350 | 5715 |
| 5351 | 3740 |
| 5352 | 6790 |
| 5353 | 2811 |
| 5354 | 4926 |
| 5355 | 7428 |
| 5356 | 3437 |
| 5357 | 5478 |
| 5358 | 6548 |
| 5359 | 3861 |
| 5360 | 6016 |
| 5361 | 6358 |
| 5362 | 1967 |
| 5363 | 4602 |
| 5364 | 3321 |
| 5365 | 6732 |
| 5366 | 5481 |
| 5367 | 3021 |
| 5368 | 5689 |
| 5369 | 6446 |
| 5370 | 3671 |
| 5371 | 4853 |
| 5372 | 7206 |
| 5373 | 3781 |
| 5374 | 5309 |
| 5375 | 6332 |

TABLE Q17-continued

| with a sequence length of 8192: | |
|---|---|
| Polarized channel sequence number | Reliability or reliability sequence number |
| 5376 | 3512 |
| 5377 | 5744 |
| 5378 | 1915 |
| 5379 | 6793 |
| 5380 | 5007 |
| 5381 | 2998 |
| 5382 | 6475 |
| 5383 | 5539 |
| 5384 | 3972 |
| 5385 | 7264 |
| 5386 | 5767 |
| 5387 | 3443 |
| 5388 | 4967 |
| 5389 | 3700 |
| 5390 | 6738 |
| 5391 | 5468 |
| 5392 | 2557 |
| 5393 | 6361 |
| 5394 | 5042 |
| 5395 | 3875 |
| 5396 | 6504 |
| 5397 | 5335 |
| 5398 | 2012 |
| 5399 | 6915 |
| 5400 | 5900 |
| 5401 | 3495 |
| 5402 | 7235 |
| 5403 | 3754 |
| 5404 | 4735 |
| 5405 | 6562 |
| 5406 | 3027 |
| 5407 | 5423 |
| 5408 | 5710 |
| 5409 | 3553 |
| 5410 | 6373 |
| 5411 | 4957 |
| 5412 | 3645 |
| 5413 | 6712 |
| 5414 | 5584 |
| 5415 | 3322 |
| 5416 | 7209 |
| 5417 | 5826 |
| 5418 | 3001 |
| 5419 | 6453 |
| 5420 | 1023 |
| 5421 | 5066 |
| 5422 | 6683 |
| 5423 | 3866 |
| 5424 | 5526 |
| 5425 | 6303 |
| 5426 | 3761 |
| 5427 | 5717 |
| 5428 | 4604 |
| 5429 | 3485 |
| 5430 | 7312 |
| 5431 | 5339 |
| 5432 | 3056 |
| 5433 | 6593 |
| 5434 | 5921 |
| 5435 | 3675 |
| 5436 | 6753 |
| 5437 | 3438 |
| 5438 | 4971 |
| 5439 | 6552 |
| 5440 | 1790 |
| 5441 | 5529 |
| 5442 | 6695 |
| 5443 | 3920 |
| 5444 | 5690 |
| 5445 | 7196 |
| 5446 | 3022 |
| 5447 | 4799 |
| 5448 | 6263 |

TABLE Q17-continued

| with a sequence length of 8192: | |
|---|---|
| Polarized channel sequence number | Reliability or reliability sequence number |
| 5449 | 3782 |
| 5450 | 5541 |
| 5451 | 5800 |
| 5452 | 3445 |
| 5453 | 6477 |
| 5454 | 3877 |
| 5455 | 5351 |
| 5456 | 6917 |
| 5457 | 2807 |
| 5458 | 5044 |
| 5459 | 7237 |
| 5460 | 1975 |
| 5461 | 5771 |
| 5462 | 6362 |
| 5463 | 3540 |
| 5464 | 5482 |
| 5465 | 6740 |
| 5466 | 3756 |
| 5467 | 5015 |
| 5468 | 6564 |
| 5469 | 3499 |
| 5470 | 5953 |
| 5471 | 7210 |
| 5472 | 2911 |
| 5473 | 5431 |
| 5474 | 6374 |
| 5475 | 3704 |
| 5476 | 5073 |
| 5477 | 3865 |
| 5478 | 5731 |
| 5479 | 6794 |
| 5480 | 2026 |
| 5481 | 5368 |
| 5482 | 6454 |
| 5483 | 3324 |
| 5484 | 4958 |
| 5485 | 7432 |
| 5486 | 3029 |
| 5487 | 5718 |
| 5488 | 6801 |
| 5489 | 3785 |
| 5490 | 5489 |
| 5491 | 6483 |
| 5492 | 3554 |
| 5493 | 4854 |
| 5494 | 6685 |
| 5495 | 3862 |
| 5496 | 5908 |
| 5497 | 7217 |
| 5498 | 3646 |
| 5499 | 5530 |
| 5500 | 6377 |
| 5501 | 3002 |
| 5502 | 4575 |
| 5503 | 6457 |
| 5504 | 1917 |
| 5505 | 5692 |
| 5506 | 3544 |
| 5507 | 6699 |
| 5508 | 5455 |
| 5509 | 3976 |
| 5510 | 5068 |
| 5511 | 7242 |
| 5512 | 3486 |
| 5513 | 5721 |
| 5514 | 6512 |
| 5515 | 3043 |
| 5516 | 5310 |
| 5517 | 6976 |
| 5518 | 3727 |
| 5519 | 5019 |
| 5520 | 6319 |
| 5521 | 3687 |

TABLE Q17-continued

| with a sequence length of 8192: | |
|---|---|
| Polarized channel sequence number | Reliability or reliability sequence number |
| 5522 | 5828 |
| 5523 | 7328 |
| 5524 | 2033 |
| 5525 | 5484 |
| 5526 | 6535 |
| 5527 | 3446 |
| 5528 | 5074 |
| 5529 | 6754 |
| 5530 | 2927 |
| 5531 | 5922 |
| 5532 | 6267 |
| 5533 | 3878 |
| 5534 | 5600 |
| 5535 | 7684 |
| 5536 | 3762 |
| 5537 | 5341 |
| 5538 | 6744 |
| 5539 | 3295 |
| 5540 | 4973 |
| 5541 | 6478 |
| 5542 | 3030 |
| 5543 | 5542 |
| 5544 | 6594 |
| 5545 | 3936 |
| 5546 | 5773 |
| 5547 | 1999 |
| 5548 | 4857 |
| 5549 | 7360 |
| 5550 | 3501 |
| 5551 | 5571 |
| 5552 | 6796 |
| 5553 | 3677 |
| 5554 | 5733 |
| 5555 | 6364 |
| 5556 | 3786 |
| 5557 | 5048 |
| 5558 | 6686 |
| 5559 | 3004 |
| 5560 | 5435 |
| 5561 | 7238 |
| 5562 | 3449 |
| 5563 | 5912 |
| 5564 | 6485 |
| 5565 | 3907 |
| 5566 | 4979 |
| 5567 | 6921 |
| 5568 | 3527 |
| 5569 | 5355 |
| 5570 | 6327 |
| 5571 | 1979 |
| 5572 | 5779 |
| 5573 | 7212 |
| 5574 | 3033 |
| 5575 | 5031 |
| 5576 | 6458 |
| 5577 | 3691 |
| 5578 | 5545 |
| 5579 | 6802 |
| 5580 | 3881 |
| 5581 | 5808 |
| 5582 | 6568 |
| 5583 | 3507 |
| 5584 | 5490 |
| 5585 | 7440 |
| 5586 | 3764 |
| 5587 | 4591 |
| 5588 | 6727 |
| 5589 | 2558 |
| 5590 | 5774 |
| 5591 | 6378 |
| 5592 | 3984 |
| 5593 | 5532 |
| 5594 | 6817 |

TABLE Q17-continued

| with a sequence length of 8192: | |
|---|---|
| Polarized channel sequence number | Reliability or reliability sequence number |
| 5595 | 1535 |
| 5596 | 5089 |
| 5597 | 7299 |
| 5598 | 3556 |
| 5599 | 5924 |
| 5600 | 6539 |
| 5601 | 3735 |
| 5602 | 5342 |
| 5603 | 6701 |
| 5604 | 2813 |
| 5605 | 4858 |
| 5606 | 6499 |
| 5607 | 3502 |
| 5608 | 5663 |
| 5609 | 7249 |
| 5610 | 3793 |
| 5611 | 5463 |
| 5612 | 6269 |
| 5613 | 3868 |
| 5614 | 5021 |
| 5615 | 6918 |
| 5616 | 3311 |
| 5617 | 5832 |
| 5618 | 6486 |
| 5619 | 2028 |
| 5620 | 5573 |
| 5621 | 7218 |
| 5622 | 3045 |
| 5623 | 5895 |
| 5624 | 6756 |
| 5625 | 3678 |
| 5626 | 4974 |
| 5627 | 6460 |
| 5628 | 3909 |
| 5629 | 5357 |
| 5630 | 6707 |
| 5631 | 5722 |
| 5632 | 3450 |
| 5633 | 7241 |
| 5634 | 4981 |
| 5635 | 3788 |
| 5636 | 6385 |
| 5637 | 5492 |
| 5638 | 2975 |
| 5639 | 6489 |
| 5640 | 5781 |
| 5641 | 3531 |
| 5642 | 6804 |
| 5643 | 5546 |
| 5644 | 1918 |
| 5645 | 7183 |
| 5646 | 5076 |
| 5647 | 3882 |
| 5648 | 6351 |
| 5649 | 6017 |
| 5650 | 3739 |
| 5651 | 6702 |
| 5652 | 5437 |
| 5653 | 2935 |
| 5654 | 7301 |
| 5655 | 5035 |
| 5656 | 3391 |
| 5657 | 6596 |
| 5658 | 5734 |
| 5659 | 3889 |
| 5660 | 6929 |
| 5661 | 5363 |
| 5662 | 3794 |
| 5663 | 6541 |
| 5664 | 4860 |
| 5665 | 3509 |
| 5666 | 7456 |
| 5667 | 5737 |

TABLE Q17-continued with a sequence length of 8192:

| Polarized channel sequence number | Reliability or reliability sequence number |
|---|---|
| 5668 | 2034 |
| 5669 | 6731 |
| 5670 | 5795 |
| 5671 | 3034 |
| 5672 | 6331 |
| 5673 | 5553 |
| 5674 | 6501 |
| 5675 | 3693 |
| 5676 | 4603 |
| 5677 | 7688 |
| 5678 | 3914 |
| 5679 | 5954 |
| 5680 | 6760 |
| 5681 | 3560 |
| 5682 | 5467 |
| 5683 | 6547 |
| 5684 | 3768 |
| 5685 | 5090 |
| 5686 | 7220 |
| 5687 | 3046 |
| 5688 | 5724 |
| 5689 | 6818 |
| 5690 | 3452 |
| 5691 | 5574 |
| 5692 | 6380 |
| 5693 | 2036 |
| 5694 | 5679 |
| 5695 | 6922 |
| 5696 | 4000 |
| 5697 | 5080 |
| 5698 | 7191 |
| 5699 | 3699 |
| 5700 | 5358 |
| 5701 | 6576 |
| 5702 | 5899 |
| 5703 | 3323 |
| 5704 | 6709 |
| 5705 | 5022 |
| 5706 | 3049 |
| 5707 | 6542 |
| 5708 | 5548 |
| 5709 | 4032 |
| 5710 | 7302 |
| 5711 | 5840 |
| 5712 | 3751 |
| 5713 | 6849 |
| 5714 | 5496 |
| 5715 | 3533 |
| 5716 | 6270 |
| 5717 | 4982 |
| 5718 | 3910 |
| 5719 | 7244 |
| 5720 | 5782 |
| 5721 | 1981 |
| 5722 | 6808 |
| 5723 | 5577 |
| 5724 | 6431 |
| 5725 | 2991 |
| 5726 | 4831 |
| 5727 | 6600 |
| 5728 | 3809 |
| 5729 | 5928 |
| 5730 | 7305 |
| 5731 | 3510 |
| 5732 | 5438 |
| 5733 | 6733 |
| 5734 | 3884 |
| 5735 | 5785 |
| 5736 | 6386 |
| 5737 | 2939 |
| 5738 | 5037 |
| 5739 | 5365 |
| 5740 | 3741 |

TABLE Q17-continued with a sequence length of 8192:

| Polarized channel sequence number | Reliability or reliability sequence number |
|---|---|
| 5741 | 5797 |
| 5742 | 7250 |
| 5743 | 4985 |
| 5744 | 3539 |
| 5745 | 6930 |
| 5746 | 5519 |
| 5747 | 3971 |
| 5748 | 6490 |
| 5749 | 5956 |
| 5750 | 2007 |
| 5751 | 6820 |
| 5752 | 5738 |
| 5753 | 3694 |
| 5754 | 7427 |
| 5755 | 5063 |
| 5756 | 3036 |
| 5757 | 6549 |
| 5758 | 5479 |
| 5759 | 6710 |
| 5760 | 3513 |
| 5761 | 5687 |
| 5762 | 7224 |
| 5763 | 3921 |
| 5764 | 5043 |
| 5765 | 6388 |
| 5766 | 3701 |
| 5767 | 5554 |
| 5768 | 6739 |
| 5769 | 3568 |
| 5770 | 6018 |
| 5771 | 6502 |
| 5772 | 3796 |
| 5773 | 5247 |
| 5774 | 7195 |
| 5775 | 5092 |
| 5776 | 1791 |
| 5777 | 7040 |
| 5778 | 5745 |
| 5779 | 2814 |
| 5780 | 6505 |
| 5781 | 5469 |
| 5782 | 3534 |
| 5783 | 7265 |
| 5784 | 5786 |
| 5785 | 3890 |
| 5786 | 6713 |
| 5787 | 4599 |
| 5788 | 3755 |
| 5789 | 6333 |
| 5790 | 5578 |
| 5791 | 6768 |
| 5792 | 3319 |
| 5793 | 5907 |
| 5794 | 7696 |
| 5795 | 2999 |
| 5796 | 5038 |
| 5797 | 6563 |
| 5798 | 3913 |
| 5799 | 5711 |
| 5800 | 6791 |
| 5801 | 3810 |
| 5802 | 5483 |
| 5803 | 7207 |
| 5804 | 5740 |
| 5805 | 3423 |
| 5806 | 6492 |
| 5807 | 4847 |
| 5808 | 2011 |
| 5809 | 6359 |
| 5810 | 5311 |
| 5811 | 3855 |
| 5812 | 6924 |
| 5813 | 5901 |

TABLE Q17-continued

| with a sequence length of 8192: | |
|---|---|
| Polarized channel sequence number | Reliability or reliability sequence number |
| 5814 | 3050 |
| 5815 | 7429 |
| 5816 | 5556 |
| 5817 | 6447 |
| 5818 | 3800 |
| 5819 | 4986 |
| 5820 | 6734 |
| 5821 | 3973 |
| 5822 | 5856 |
| 5823 | 7252 |
| 5824 | 3541 |
| 5825 | 5527 |
| 5826 | 6608 |
| 5827 | 5798 |
| 5828 | 3742 |
| 5829 | 6850 |
| 5830 | 5067 |
| 5831 | 2941 |
| 5832 | 6550 |
| 5833 | 5585 |
| 5834 | 3892 |
| 5835 | 7306 |
| 5836 | 5936 |
| 5837 | 2023 |
| 5838 | 6741 |
| 5839 | 4927 |
| 5840 | 6363 |
| 5841 | 3514 |
| 5842 | 5827 |
| 5843 | 7313 |
| 5844 | 3702 |
| 5845 | 5470 |
| 5846 | 6945 |
| 5847 | 3863 |
| 5848 | 5691 |
| 5849 | 6553 |
| 5850 | 5045 |
| 5851 | 3555 |
| 5852 | 7197 |
| 5853 | 5366 |
| 5854 | 3057 |
| 5855 | 6714 |
| 5856 | 5902 |
| 5857 | 3757 |
| 5858 | 6565 |
| 5859 | 5580 |
| 5860 | 6824 |
| 5861 | 3974 |
| 5862 | 5096 |
| 5863 | 7211 |
| 5864 | 3439 |
| 5865 | 5801 |
| 5866 | 6375 |
| 5867 | 2040 |
| 5868 | 5960 |
| 5869 | 6795 |
| 5870 | 5531 |
| 5871 | 3705 |
| 5872 | 7488 |
| 5873 | 4988 |
| 5874 | 3023 |
| 5875 | 6506 |
| 5876 | 5746 |
| 5877 | 3916 |
| 5878 | 6977 |
| 5879 | 5586 |
| 5880 | 7712 |
| 5881 | 3542 |
| 5882 | 5788 |
| 5883 | 6455 |
| 5884 | 3783 |
| 5885 | 4859 |
| 5886 | 6755 |

TABLE Q17-continued

| with a sequence length of 8192: | |
|---|---|
| Polarized channel sequence number | Reliability or reliability sequence number |
| 5887 | 5485 |
| 5888 | 3763 |
| 5889 | 7266 |
| 5890 | 5909 |
| 5891 | 3003 |
| 5892 | 6392 |
| 5893 | 5369 |
| 5894 | 3516 |
| 5895 | 6742 |
| 5896 | 5069 |
| 5897 | 6513 |
| 5898 | 3812 |
| 5899 | 5719 |
| 5900 | 7256 |
| 5901 | 1982 |
| 5902 | 5829 |
| 5903 | 6932 |
| 5904 | 3977 |
| 5905 | 5560 |
| 5906 | 6554 |
| 5907 | 5046 |
| 5908 | 3545 |
| 5909 | 7308 |
| 5910 | 6020 |
| 5911 | 3758 |
| 5912 | 6716 |
| 5913 | 5491 |
| 5914 | 6479 |
| 5915 | 2559 |
| 5916 | 5748 |
| 5917 | 7198 |
| 5918 | 3922 |
| 5919 | 4605 |
| 5920 | 6745 |
| 5921 | 3706 |
| 5922 | 6334 |
| 5923 | 5923 |
| 5924 | 7433 |
| 5925 | 3325 |
| 5926 | 5543 |
| 5927 | 6852 |
| 5928 | 3896 |
| 5929 | 5802 |
| 5930 | 6508 |
| 5931 | 5075 |
| 5932 | 3787 |
| 5933 | 7314 |
| 5934 | 5601 |
| 5935 | 2013 |
| 5936 | 6946 |
| 5937 | 5693 |
| 5938 | 6624 |
| 5939 | 3052 |
| 5940 | 5370 |
| 5941 | 6365 |
| 5942 | 3557 |
| 5943 | 5049 |
| 5944 | 7239 |
| 5945 | 3867 |
| 5946 | 5914 |
| 5947 | 6566 |
| 5948 | 5809 |
| 5949 | 3647 |
| 5950 | 6797 |
| 5951 | 5533 |
| 5952 | 3487 |
| 5953 | 7329 |
| 5954 | 5104 |
| 5955 | 6595 |
| 5956 | 3937 |
| 5957 | 5723 |
| 5958 | 6757 |
| 5959 | 2942 |

TABLE Q17-continued with a sequence length of 8192:

| Polarized channel sequence number | Reliability or reliability sequence number |
|---|---|
| 5960 | 7683 |
| 5961 | 5486 |
| 5962 | 6459 |
| 5963 | 3765 |
| 5964 | 5968 |
| 5965 | 6936 |
| 5966 | 3879 |
| 5967 | 5070 |
| 5968 | 7213 |
| 5969 | 5830 |
| 5970 | 2027 |
| 5971 | 6379 |
| 5972 | 5493 |
| 5973 | 3447 |
| 5974 | 6803 |
| 5975 | 5925 |
| 5976 | 7430 |
| 5977 | 3816 |
| 5978 | 4855 |
| 5979 | 6569 |
| 5980 | 3058 |
| 5981 | 5588 |
| 5982 | 6832 |
| 5983 | 5804 |
| 5984 | 3924 |
| 5985 | 7268 |
| 5986 | 5547 |
| 5987 | 3546 |
| 5988 | 6514 |
| 5989 | 6798 |
| 5990 | 4959 |
| 5991 | 3978 |
| 5992 | 7219 |
| 5993 | 5752 |
| 5994 | 3708 |
| 5995 | 6556 |
| 5996 | 5913 |
| 5997 | 6948 |
| 5998 | 3558 |
| 5999 | 5372 |
| 6000 | 7316 |
| 6001 | 3060 |
| 6002 | 5077 |
| 6003 | 6366 |
| 6004 | 5833 |
| 6005 | 2014 |
| 6006 | 6687 |
| 6007 | 5602 |
| 6008 | 3985 |
| 6009 | 6487 |
| 6010 | 5910 |
| 6011 | 7214 |
| 6012 | 3789 |
| 6013 | 6856 |
| 6014 | 5694 |
| 6015 | 6597 |
| 6016 | 3869 |
| 6017 | 5050 |
| 6018 | 7441 |
| 6019 | 3561 |
| 6020 | 5592 |
| 6021 | 6919 |
| 6022 | 6024 |
| 6023 | 3766 |
| 6024 | 6381 |
| 6025 | 5534 |
| 6026 | 3005 |
| 6027 | 7936 |
| 6028 | 5091 |
| 6029 | 6746 |
| 6030 | 3883 |
| 6031 | 5775 |
| 6032 | 6516 |

TABLE Q17-continued with a sequence length of 8192:

| Polarized channel sequence number | Reliability or reliability sequence number |
|---|---|
| 6033 | 3503 |
| 6034 | 7243 |
| 6035 | 5735 |
| 6036 | 6805 |
| 6037 | 3795 |
| 6038 | 5494 |
| 6039 | 6570 |
| 6040 | 4975 |
| 6041 | 3938 |
| 6042 | 7272 |
| 6043 | 5926 |
| 6044 | 2029 |
| 6045 | 7041 |
| 6046 | 5810 |
| 6047 | 6461 |
| 6048 | 3769 |
| 6049 | 5343 |
| 6050 | 7330 |
| 6051 | 3451 |
| 6052 | 6758 |
| 6053 | 5078 |
| 6054 | 6387 |
| 6055 | 3031 |
| 6056 | 5984 |
| 6057 | 7434 |
| 6058 | 5549 |
| 6059 | 3928 |
| 6060 | 6761 |
| 6061 | 5725 |
| 6062 | 3824 |
| 6063 | 6819 |
| 6064 | 5834 |
| 6065 | 7221 |
| 6066 | 3548 |
| 6067 | 5052 |
| 6068 | 6577 |
| 6069 | 3980 |
| 6070 | 7361 |
| 6071 | 5497 |
| 6072 | 6978 |
| 6073 | 3790 |
| 6074 | 5955 |
| 6075 | 6491 |
| 6076 | 5575 |
| 6077 | 2815 |
| 6078 | 7320 |
| 6079 | 5081 |
| 6080 | 3870 |
| 6081 | 6748 |
| 6082 | 5739 |
| 6083 | 6598 |
| 6084 | 2035 |
| 6085 | 5929 |
| 6086 | 7685 |
| 6087 | 6703 |
| 6088 | 3326 |
| 6089 | 5555 |
| 6090 | 6382 |
| 6091 | 3679 |
| 6092 | 5812 |
| 6093 | 7245 |
| 6094 | 4606 |
| 6095 | 3986 |
| 6096 | 6923 |
| 6097 | 6032 |
| 6098 | 6572 |
| 6099 | 3911 |
| 6100 | 7442 |
| 6101 | 5604 |
| 6102 | 3035 |
| 6103 | 6864 |
| 6104 | 5783 |
| 6105 | 6520 |

TABLE Q17-continued with a sequence length of 8192:

| Polarized channel sequence number | Reliability or reliability sequence number |
|---|---|
| 6106 | 3511 |
| 6107 | 4861 |
| 6108 | 7332 |
| 6109 | 5550 |
| 6110 | 3797 |
| 6111 | 6806 |
| 6112 | 5841 |
| 6113 | 6601 |
| 6114 | 4001 |
| 6115 | 7222 |
| 6116 | 5916 |
| 6117 | 3770 |
| 6118 | 6952 |
| 6119 | 5359 |
| 6120 | 6462 |
| 6121 | 3562 |
| 6122 | 5093 |
| 6123 | 7251 |
| 6124 | 5726 |
| 6125 | 2030 |
| 6126 | 6809 |
| 6127 | 5957 |
| 6128 | 3885 |
| 6129 | 6389 |
| 6130 | 7552 |
| 6131 | 5498 |
| 6132 | 3047 |
| 6133 | 6821 |
| 6134 | 5836 |
| 6135 | 7744 |
| 6136 | 3811 |
| 6137 | 5023 |
| 6138 | 6543 |
| 6139 | 5579 |
| 6140 | 3453 |
| 6141 | 6980 |
| 6142 | 7225 |
| 6143 | 5930 |
| 6144 | 3940 |
| 6145 | 6762 |
| 6146 | 5787 |
| 6147 | 3695 |
| 6148 | 6503 |
| 6149 | 4983 |
| 6150 | 7280 |
| 6151 | 3891 |
| 6152 | 5439 |
| 6153 | 6711 |
| 6154 | 6578 |
| 6155 | 3569 |
| 6156 | 5937 |
| 6157 | 7303 |
| 6158 | 5842 |
| 6159 | 3064 |
| 6160 | 7042 |
| 6161 | 5557 |
| 6162 | 3988 |
| 6163 | 6271 |
| 6164 | 5082 |
| 6165 | 7436 |
| 6166 | 3798 |
| 6167 | 6769 |
| 6168 | 5741 |
| 6169 | 6493 |
| 6170 | 2037 |
| 6171 | 5962 |
| 6172 | 7246 |
| 6173 | 5608 |
| 6174 | 3886 |
| 6175 | 6810 |
| 6176 | 7362 |
| 6177 | 5816 |
| 6178 | 3535 |

TABLE Q17-continued with a sequence length of 8192:

| Polarized channel sequence number | Reliability or reliability sequence number |
|---|---|
| 6179 | 6602 |
| 6180 | 5094 |
| 6181 | 3772 |
| 6182 | 6931 |
| 6183 | 5500 |
| 6184 | 7689 |
| 6185 | 3006 |
| 6186 | 6048 |
| 6187 | 6735 |
| 6188 | 6507 |
| 6189 | 3915 |
| 6190 | 5747 |
| 6191 | 7253 |
| 6192 | 5371 |
| 6193 | 3801 |
| 6194 | 6764 |
| 6195 | 5097 |
| 6196 | 6335 |
| 6197 | 3515 |
| 6198 | 7457 |
| 6199 | 6080 |
| 6200 | 6925 |
| 6201 | 3944 |
| 6202 | 5799 |
| 6203 | 7226 |
| 6204 | 5581 |
| 6205 | 4002 |
| 6206 | 6580 |
| 6207 | 5958 |
| 6208 | 3813 |
| 6209 | 6880 |
| 6210 | 7336 |
| 6211 | 5039 |
| 6212 | 3564 |
| 6213 | 6551 |
| 6214 | 5857 |
| 6215 | 6822 |
| 6216 | 1919 |
| 6217 | 5558 |
| 6218 | 7307 |
| 6219 | 6609 |
| 6220 | 3037 |
| 6221 | 5932 |
| 6222 | 7489 |
| 6223 | 4987 |
| 6224 | 3893 |
| 6225 | 6960 |
| 6226 | 5789 |
| 6227 | 6851 |
| 6228 | 3743 |
| 6229 | 7686 |
| 6230 | 5587 |
| 6231 | 6494 |
| 6232 | 4033 |
| 6233 | 6019 |
| 6234 | 6715 |
| 6235 | 5742 |
| 6236 | 3454 |
| 6237 | 7267 |
| 6238 | 6390 |
| 6239 | 5084 |
| 6240 | 3992 |
| 6241 | 7254 |
| 6242 | 5561 |
| 6243 | 6926 |
| 6244 | 3703 |
| 6245 | 5969 |
| 6246 | 6604 |
| 6247 | 7444 |
| 6248 | 3051 |
| 6249 | 5749 |
| 6250 | 6825 |
| 6251 | 5616 |

TABLE Q17-continued with a sequence length of 8192:

| Polarized channel sequence number | Reliability or reliability sequence number |
|---|---|
| 6252 | 3917 |
| 6253 | 6984 |
| 6254 | 5844 |
| 6255 | 7228 |
| 6256 | 3570 |
| 6257 | 6555 |
| 6258 | 4862 |
| 6259 | 7257 |
| 6260 | 3802 |
| 6261 | 5582 |
| 6262 | 6770 |
| 6263 | 5938 |
| 6264 | 4004 |
| 6265 | 6610 |
| 6266 | 7697 |
| 6267 | 5803 |
| 6268 | 1983 |
| 6269 | 6812 |
| 6270 | 5367 |
| 6271 | 6509 |
| 6272 | 3814 |
| 6273 | 7364 |
| 6274 | 5047 |
| 6275 | 6933 |
| 6276 | 3894 |
| 6277 | 5961 |
| 6278 | 7458 |
| 6279 | 5858 |
| 6280 | 3038 |
| 6281 | 6393 |
| 6282 | 6743 |
| 6283 | 5471 |
| 6284 | 3572 |
| 6285 | 7309 |
| 6286 | 5903 |
| 6287 | 6853 |
| 6288 | 3923 |
| 6289 | 5098 |
| 6290 | 6584 |
| 6291 | 7269 |
| 6292 | 3817 |
| 6293 | 5848 |
| 6294 | 7044 |
| 6295 | 6021 |
| 6296 | 3897 |
| 6297 | 7448 |
| 6298 | 6515 |
| 6299 | 5589 |
| 6300 | 3517 |
| 6301 | 6772 |
| 6302 | 5790 |
| 6303 | 7315 |
| 6304 | 3952 |
| 6305 | 4989 |
| 6306 | 6947 |
| 6307 | 7690 |
| 6308 | 3759 |
| 6309 | 5940 |
| 6310 | 6567 |
| 6311 | 5562 |
| 6312 | 3053 |
| 6313 | 6826 |
| 6314 | 7344 |
| 6315 | 5750 |
| 6316 | 3975 |
| 6317 | 6625 |
| 6318 | 5911 |
| 6319 | 6717 |
| 6320 | 2038 |
| 6321 | 5603 |
| 6322 | 7310 |
| 6323 | 6394 |
| 6324 | 3543 |

TABLE Q17-continued with a sequence length of 8192:

| Polarized channel sequence number | Reliability or reliability sequence number |
|---|---|
| 6325 | 5105 |
| 6326 | 7460 |
| 6327 | 5805 |
| 6328 | 3707 |
| 6329 | 6938 |
| 6330 | 6833 |
| 6331 | 6022 |
| 6332 | 3918 |
| 6333 | 7199 |
| 6334 | 5487 |
| 6335 | 6557 |
| 6336 | 7368 |
| 6337 | 4034 |
| 6338 | 5753 |
| 6339 | 6747 |
| 6340 | 5071 |
| 6341 | 3804 |
| 6342 | 6510 |
| 6343 | 5964 |
| 6344 | 7698 |
| 6345 | 3327 |
| 6346 | 6992 |
| 6347 | 5590 |
| 6348 | 7431 |
| 6349 | 3059 |
| 6350 | 5831 |
| 6351 | 6854 |
| 6352 | 6517 |
| 6353 | 3925 |
| 6354 | 5811 |
| 6355 | 7258 |
| 6356 | 5051 |
| 6357 | 3767 |
| 6358 | 6949 |
| 6359 | 7317 |
| 6360 | 5564 |
| 6361 | 3898 |
| 6362 | 6612 |
| 6363 | 5860 |
| 6364 | 6828 |
| 6365 | 7553 |
| 6366 | 3547 |
| 6367 | 6025 |
| 6368 | 6571 |
| 6369 | 5593 |
| 6370 | 4008 |
| 6371 | 7808 |
| 6372 | 6776 |
| 6373 | 5806 |
| 6374 | 2041 |
| 6375 | 6937 |
| 6376 | 4607 |
| 6377 | 7270 |
| 6378 | 3818 |
| 6379 | 6396 |
| 6380 | 5970 |
| 6381 | 7273 |
| 6382 | 5754 |
| 6383 | 3979 |
| 6384 | 6857 |
| 6385 | 6626 |
| 6386 | 5373 |
| 6387 | 3054 |
| 6388 | 7331 |
| 6389 | 5944 |
| 6390 | 6934 |
| 6391 | 3939 |
| 6392 | 7490 |
| 6393 | 5835 |
| 6394 | 6718 |
| 6395 | 3559 |
| 6396 | 5100 |
| 6397 | 6616 |

TABLE Q17-continued with a sequence length of 8192:

| Polarized channel sequence number | Reliability or reliability sequence number |
|---|---|
| 6398 | 7260 |
| 6399 | 5605 |
| 6400 | 3709 |
| 6401 | 7048 |
| 6402 | 5915 |
| 6403 | 7692 |
| 6404 | 3926 |
| 6405 | 6558 |
| 6406 | 5695 |
| 6407 | 7215 |
| 6408 | 3900 |
| 6409 | 5535 |
| 6410 | 6799 |
| 6411 | 6759 |
| 6412 | 3825 |
| 6413 | 5985 |
| 6414 | 7435 |
| 6415 | 4990 |
| 6416 | 6518 |
| 6417 | 3576 |
| 6418 | 7376 |
| 6419 | 5813 |
| 6420 | 6950 |
| 6421 | 3061 |
| 6422 | 5927 |
| 6423 | 6834 |
| 6424 | 7318 |
| 6425 | 3929 |
| 6426 | 5495 |
| 6427 | 6367 |
| 6428 | 5864 |
| 6429 | 7713 |
| 6430 | 3791 |
| 6431 | 7008 |
| 6432 | 5106 |
| 6433 | 6573 |
| 6434 | 4036 |
| 6435 | 5972 |
| 6436 | 7464 |
| 6437 | 6749 |
| 6438 | 2042 |
| 6439 | 5594 |
| 6440 | 7321 |
| 6441 | 6858 |
| 6442 | 6026 |
| 6443 | 3981 |
| 6444 | 7333 |
| 6445 | 5756 |
| 6446 | 6521 |
| 6447 | 3518 |
| 6448 | 6979 |
| 6449 | 5606 |
| 6450 | 7492 |
| 6451 | 3771 |
| 6452 | 5108 |
| 6453 | 6599 |
| 6454 | 7745 |
| 6455 | 6033 |
| 6456 | 3941 |
| 6457 | 6763 |
| 6458 | 5837 |
| 6459 | 6953 |
| 6460 | 3987 |
| 6461 | 7274 |
| 6462 | 5917 |
| 6463 | 6579 |
| 6464 | 7223 |
| 6465 | 2943 |
| 6466 | 5609 |
| 6467 | 6836 |
| 6468 | 5814 |
| 6469 | 3549 |
| 6470 | 7554 |
| 6471 | 7056 |
| 6472 | 5053 |
| 6473 | 3820 |
| 6474 | 6628 |
| 6475 | 5931 |
| 6476 | 7281 |
| 6477 | 6807 |
| 6478 | 4016 |
| 6479 | 5551 |
| 6480 | 7322 |
| 6481 | 6574 |
| 6482 | 3982 |
| 6483 | 5843 |
| 6484 | 7700 |
| 6485 | 5986 |
| 6486 | 6865 |
| 6487 | 3710 |
| 6488 | 6940 |
| 6489 | 5817 |
| 6490 | 7443 |
| 6491 | 3871 |
| 6492 | 5499 |
| 6493 | 6383 |
| 6494 | 7247 |
| 6495 | 5079 |
| 6496 | 3563 |
| 6497 | 6750 |
| 6498 | 7276 |
| 6499 | 5976 |
| 6500 | 4040 |
| 6501 | 6981 |
| 6502 | 5872 |
| 6503 | 6522 |
| 6504 | 7714 |
| 6505 | 2044 |
| 6506 | 5596 |
| 6507 | 6860 |
| 6508 | 7437 |
| 6509 | 3007 |
| 6510 | 6028 |
| 6511 | 6603 |
| 6512 | 5838 |
| 6513 | 7392 |
| 6514 | 3826 |
| 6515 | 6954 |
| 6516 | 4863 |
| 6517 | 7334 |
| 6518 | 3930 |
| 6519 | 6811 |
| 6520 | 5918 |
| 6521 | 6463 |
| 6522 | 5374 |
| 6523 | 3989 |
| 6524 | 7472 |
| 6525 | 6961 |
| 6526 | 5727 |
| 6527 | 7704 |
| 6528 | 3550 |
| 6529 | 6866 |
| 6530 | 6034 |
| 6531 | 7363 |
| 6532 | 3828 |
| 6533 | 5959 |
| 6534 | 6581 |
| 6535 | 6765 |
| 6536 | 5083 |
| 6537 | 3942 |
| 6538 | 7227 |
| 6539 | 6986 |
| 6540 | 5559 |
| 6541 | 3945 |
| 6542 | 7438 |
| 6543 | 5845 |

TABLE Q17-continued

| with a sequence length of 8192: | |
|---|---|
| Polarized channel sequence number | Reliability or reliability sequence number |
| 6544 | 6632 |
| 6545 | 7337 |
| 6546 | 3773 |
| 6547 | 6049 |
| 6548 | 6840 |
| 6549 | 7716 |
| 6550 | 5818 |
| 6551 | 3062 |
| 6552 | 6524 |
| 6553 | 5610 |
| 6554 | 7072 |
| 6555 | 3565 |
| 6556 | 7496 |
| 6557 | 5933 |
| 6558 | 6771 |
| 6559 | 7282 |
| 6560 | 4003 |
| 6561 | 5095 |
| 6562 | 6395 |
| 6563 | 5859 |
| 6564 | 3932 |
| 6565 | 7324 |
| 6566 | 7104 |
| 6567 | 5501 |
| 6568 | 7445 |
| 6569 | 3799 |
| 6570 | 6823 |
| 6571 | 5988 |
| 6572 | 6605 |
| 6573 | 7937 |
| 6574 | 3887 |
| 6575 | 5743 |
| 6576 | 6982 |
| 6577 | 5939 |
| 6578 | 7255 |
| 6579 | 2015 |
| 6580 | 6881 |
| 6581 | 5617 |
| 6582 | 7365 |
| 6583 | 4048 |
| 6584 | 6582 |
| 6585 | 5112 |
| 6586 | 7556 |
| 6587 | 6956 |
| 6588 | 3571 |
| 6589 | 6036 |
| 6590 | 6813 |
| 6591 | 5846 |
| 6592 | 7687 |
| 6593 | 3990 |
| 6594 | 6611 |
| 6595 | 5934 |
| 6596 | 7284 |
| 6597 | 3803 |
| 6598 | 7043 |
| 6599 | 5583 |
| 6600 | 7459 |
| 6601 | 6766 |
| 6602 | 3065 |
| 6603 | 5820 |
| 6604 | 7338 |
| 6605 | 6585 |
| 6606 | 5054 |
| 6607 | 3993 |
| 6608 | 7229 |
| 6609 | 5963 |
| 6610 | 6993 |
| 6611 | 7809 |
| 6612 | 4005 |
| 6613 | 5849 |
| 6614 | 6773 |
| 6615 | 6640 |
| 6616 | 5563 |

TABLE Q17-continued

| with a sequence length of 8192: | |
|---|---|
| Polarized channel sequence number | Reliability or reliability sequence number |
| 6617 | 3815 |
| 6618 | 7450 |
| 6619 | 6868 |
| 6620 | 5992 |
| 6621 | 3566 |
| 6622 | 7345 |
| 6623 | 6050 |
| 6624 | 6606 |
| 6625 | 7259 |
| 6626 | 3946 |
| 6627 | 5861 |
| 6628 | 6962 |
| 6629 | 7746 |
| 6630 | 5612 |
| 6631 | 3895 |
| 6632 | 6827 |
| 6633 | 7504 |
| 6634 | 5085 |
| 6635 | 6391 |
| 6636 | 3832 |
| 6637 | 7366 |
| 6638 | 5941 |
| 6639 | 6985 |
| 6640 | 6882 |
| 6641 | 3953 |
| 6642 | 5791 |
| 6643 | 7461 |
| 6644 | 6081 |
| 6645 | 6495 |
| 6646 | 3573 |
| 6647 | 7340 |
| 6648 | 5502 |
| 6649 | 6927 |
| 6650 | 7691 |
| 6651 | 3066 |
| 6652 | 6040 |
| 6653 | 6872 |
| 6654 | 7288 |
| 6655 | 5751 |
| 6656 | 3994 |
| 6657 | 7045 |
| 6658 | 7449 |
| 6659 | 5099 |
| 6660 | 2031 |
| 6661 | 6613 |
| 6662 | 7369 |
| 6663 | 5965 |
| 6664 | 6814 |
| 6665 | 3919 |
| 6666 | 7720 |
| 6667 | 5618 |
| 6668 | 6964 |
| 6669 | 5850 |
| 6670 | 3774 |
| 6671 | 6586 |
| 6672 | 7446 |
| 6673 | 6052 |
| 6674 | 6774 |
| 6675 | 3948 |
| 6676 | 7230 |
| 6677 | 5862 |
| 6678 | 6935 |
| 6679 | 7560 |
| 6680 | 4064 |
| 6681 | 5942 |
| 6682 | 6627 |
| 6683 | 7748 |
| 6684 | 5086 |
| 6685 | 3805 |
| 6686 | 6829 |
| 6687 | 7311 |
| 6688 | 5620 |
| 6689 | 7046 |

TABLE Q17-continued with a sequence length of 8192:

| Polarized channel sequence number | Reliability or reliability sequence number |
|---|---|
| 6690 | 3455 |
| 6691 | 7271 |
| 6692 | 5971 |
| 6693 | 6511 |
| 6694 | 7462 |
| 6695 | 4006 |
| 6696 | 5865 |
| 6697 | 6777 |
| 6698 | 7810 |
| 6699 | 5945 |
| 6700 | 4035 |
| 6701 | 6988 |
| 6702 | 7346 |
| 6703 | 5565 |
| 6704 | 6614 |
| 6705 | 3899 |
| 6706 | 7520 |
| 6707 | 6000 |
| 6708 | 6855 |
| 6709 | 7261 |
| 6710 | 5807 |
| 6711 | 3068 |
| 6712 | 6835 |
| 6713 | 5101 |
| 6714 | 6588 |
| 6715 | 7699 |
| 6716 | 3819 |
| 6717 | 6023 |
| 6718 | 6884 |
| 6719 | 7370 |
| 6720 | 5591 |
| 6721 | 4009 |
| 6722 | 7049 |
| 6723 | 7491 |
| 6724 | 5755 |
| 6725 | 6617 |
| 6726 | 3519 |
| 6727 | 7275 |
| 6728 | 5966 |
| 6729 | 6830 |
| 6730 | 7693 |
| 6731 | 3954 |
| 6732 | 6082 |
| 6733 | 6994 |
| 6734 | 7465 |
| 6735 | 5852 |
| 6736 | 3996 |
| 6737 | 6778 |
| 6738 | 7348 |
| 6739 | 5375 |
| 6740 | 6397 |
| 6741 | 3806 |
| 6742 | 7568 |
| 6743 | 5107 |
| 6744 | 6968 |
| 6745 | 7728 |
| 6746 | 5973 |
| 6747 | 3927 |
| 6748 | 6859 |
| 6749 | 7319 |
| 6750 | 5815 |
| 6751 | 6629 |
| 6752 | 2043 |
| 6753 | 7377 |
| 6754 | 5946 |
| 6755 | 6939 |
| 6756 | 7452 |
| 6757 | 4037 |
| 6758 | 5595 |
| 6759 | 6719 |
| 6760 | 7694 |
| 6761 | 6056 |
| 6762 | 3821 |

TABLE Q17-continued with a sequence length of 8192:

| Polarized channel sequence number | Reliability or reliability sequence number |
|---|---|
| 6763 | 6559 |
| 6764 | 7262 |
| 6765 | 7009 |
| 6766 | 5866 |
| 6767 | 7493 |
| 6768 | 3574 |
| 6769 | 6837 |
| 6770 | 6027 |
| 6771 | 7372 |
| 6772 | 6951 |
| 6773 | 3039 |
| 6774 | 5102 |
| 6775 | 7752 |
| 6776 | 6519 |
| 6777 | 5987 |
| 6778 | 3956 |
| 6779 | 7466 |
| 6780 | 6888 |
| 6781 | 5607 |
| 6782 | 7323 |
| 6783 | 6996 |
| 6784 | 4010 |
| 6785 | 5757 |
| 6786 | 7938 |
| 6787 | 6618 |
| 6788 | 5974 |
| 6789 | 3901 |
| 6790 | 7473 |
| 6791 | 7050 |
| 6792 | 5948 |
| 6793 | 7378 |
| 6794 | 3827 |
| 6795 | 6780 |
| 6796 | 5873 |
| 6797 | 7277 |
| 6798 | 6630 |
| 6799 | 5624 |
| 6800 | 4017 |
| 6801 | 7701 |
| 6802 | 7057 |
| 6803 | 5109 |
| 6804 | 7498 |
| 6805 | 3931 |
| 6806 | 6861 |
| 6807 | 5977 |
| 6808 | 7352 |
| 6809 | 6941 |
| 6810 | 3577 |
| 6811 | 7584 |
| 6812 | 5839 |
| 6813 | 6633 |
| 6814 | 7812 |
| 6815 | 6084 |
| 6816 | 4038 |
| 6817 | 6838 |
| 6818 | 7283 |
| 6819 | 6029 |
| 6820 | 6955 |
| 6821 | 3822 |
| 6822 | 7616 |
| 6823 | 5566 |
| 6824 | 6575 |
| 6825 | 7715 |
| 6826 | 5819 |
| 6827 | 4012 |
| 6828 | 6867 |
| 6829 | 7335 |
| 6830 | 5989 |
| 6831 | 7010 |
| 6832 | 3960 |
| 6833 | 6841 |
| 6834 | 6523 |
| 6835 | 6035 |

TABLE Q17-continued with a sequence length of 8192:

| Polarized channel sequence number | Reliability or reliability sequence number |
|---|---|
| 6836 | 7494 |
| 6837 | 7000 |
| 6838 | 4041 |
| 6839 | 4991 |
| 6840 | 7393 |
| 6841 | 6896 |
| 6842 | 5597 |
| 6843 | 3055 |
| 6844 | 7706 |
| 6845 | 6620 |
| 6846 | 5868 |
| 6847 | 7468 |
| 6848 | 7052 |
| 6849 | 3902 |
| 6850 | 6064 |
| 6851 | 7325 |
| 6852 | 6862 |
| 6853 | 7760 |
| 6854 | 3578 |
| 6855 | 6030 |
| 6856 | 6942 |
| 6857 | 7555 |
| 6858 | 5758 |
| 6859 | 6398 |
| 6860 | 3829 |
| 6861 | 7278 |
| 6862 | 5919 |
| 6863 | 6751 |
| 6864 | 7505 |
| 6865 | 5611 |
| 6866 | 2039 |
| 6867 | 7058 |
| 6868 | 7717 |
| 6869 | 6088 |
| 6870 | 6983 |
| 6871 | 3983 |
| 6872 | 7285 |
| 6873 | 6583 |
| 6874 | 5055 |
| 6875 | 7380 |
| 6876 | 6869 |
| 6877 | 3943 |
| 6878 | 5874 |
| 6879 | 7705 |
| 6880 | 7073 |
| 6881 | 5978 |
| 6882 | 7474 |
| 6883 | 4018 |
| 6884 | 6842 |
| 6885 | 7339 |
| 6886 | 6037 |
| 6887 | 6634 |
| 6888 | 3711 |
| 6889 | 7497 |
| 6890 | 5598 |
| 6891 | 6957 |
| 6892 | 7702 |
| 6893 | 5876 |
| 6894 | 3933 |
| 6895 | 6883 |
| 6896 | 7394 |
| 6897 | 5990 |
| 6898 | 6525 |
| 6899 | 7439 |
| 6900 | 4042 |
| 6901 | 7012 |
| 6902 | 5993 |
| 6903 | 7816 |
| 6904 | 6767 |
| 6905 | 5821 |
| 6906 | 3580 |
| 6907 | 7384 |
| 6908 | 6963 |

TABLE Q17-continued with a sequence length of 8192:

| Polarized channel sequence number | Reliability or reliability sequence number |
|---|---|
| 6909 | 5110 |
| 6910 | 7557 |
| 6911 | 6641 |
| 6912 | 3947 |
| 6913 | 7940 |
| 6914 | 5613 |
| 6915 | 7060 |
| 6916 | 7326 |
| 6917 | 3775 |
| 6918 | 6051 |
| 6919 | 6870 |
| 6920 | 7476 |
| 6921 | 6958 |
| 6922 | 5980 |
| 6923 | 3067 |
| 6924 | 7718 |
| 6925 | 6607 |
| 6926 | 5847 |
| 6927 | 7286 |
| 6928 | 6844 |
| 6929 | 4020 |
| 6930 | 5935 |
| 6931 | 7447 |
| 6932 | 6987 |
| 6933 | 7341 |
| 6934 | 6096 |
| 6935 | 3991 |
| 6936 | 6873 |
| 6937 | 7776 |
| 6938 | 5619 |
| 6939 | 6587 |
| 6940 | 7558 |
| 6941 | 4049 |
| 6942 | 6038 |
| 6943 | 7289 |
| 6944 | 7016 |
| 6945 | 7747 |
| 6946 | 5851 |
| 6947 | 3934 |
| 6948 | 7074 |
| 6949 | 7500 |
| 6950 | 5113 |
| 6951 | 6885 |
| 6952 | 7367 |
| 6953 | 3830 |
| 6954 | 6636 |
| 6955 | 6041 |
| 6956 | 7721 |
| 6957 | 6965 |
| 6958 | 6053 |
| 6959 | 3551 |
| 6960 | 7347 |
| 6961 | 6815 |
| 6962 | 7396 |
| 6963 | 5863 |
| 6964 | 7105 |
| 6965 | 4044 |
| 6966 | 7824 |
| 6967 | 5614 |
| 6968 | 6526 |
| 6969 | 7561 |
| 6970 | 7064 |
| 6971 | 3995 |
| 6972 | 5994 |
| 6973 | 7342 |
| 6974 | 6775 |
| 6975 | 5943 |
| 6976 | 7708 |
| 6977 | 4050 |
| 6978 | 6989 |
| 6979 | 7506 |
| 6980 | 5880 |
| 6981 | 6642 |

TABLE Q17-continued with a sequence length of 8192:

| Polarized channel sequence number | Reliability or reliability sequence number |
|---|---|
| 6982 | 7290 |
| 6983 | 3949 |
| 6984 | 6001 |
| 6985 | 7749 |
| 6986 | 6874 |
| 6987 | 7480 |
| 6988 | 5621 |
| 6989 | 3833 |
| 6990 | 7076 |
| 6991 | 7371 |
| 6992 | 5114 |
| 6993 | 6886 |
| 6994 | 7451 |
| 6995 | 2045 |
| 6996 | 6966 |
| 6997 | 6042 |
| 6998 | 7722 |
| 6999 | 6644 |
| 7000 | 5967 |
| 7001 | 7231 |
| 7002 | 4024 |
| 7003 | 6995 |
| 7004 | 7521 |
| 7005 | 5822 |
| 7006 | 6889 |
| 7007 | 7944 |
| 7008 | 3955 |
| 7009 | 5996 |
| 7010 | 7349 |
| 7011 | 6969 |
| 7012 | 7463 |
| 7013 | 6112 |
| 7014 | 4007 |
| 7015 | 6589 |
| 7016 | 7729 |
| 7017 | 7024 |
| 7018 | 5853 |
| 7019 | 7400 |
| 7020 | 3063 |
| 7021 | 6831 |
| 7022 | 5503 |
| 7023 | 7508 |
| 7024 | 7047 |
| 7025 | 7754 |
| 7026 | 6054 |
| 7027 | 3567 |
| 7028 | 6615 |
| 7029 | 7562 |
| 7030 | 6083 |
| 7031 | 7840 |
| 7032 | 6779 |
| 7033 | 4065 |
| 7034 | 7292 |
| 7035 | 5947 |
| 7036 | 6990 |
| 7037 | 7569 |
| 7038 | 7106 |
| 7039 | 5116 |
| 7040 | 3834 |
| 7041 | 7872 |
| 7042 | 6876 |
| 7043 | 5867 |
| 7044 | 7373 |
| 7045 | 6399 |
| 7046 | 3997 |
| 7047 | 7453 |
| 7048 | 6057 |
| 7049 | 7750 |
| 7050 | 6997 |
| 7051 | 7350 |
| 7052 | 3950 |
| 7053 | 5567 |
| 7054 | 6839 |

TABLE Q17-continued with a sequence length of 8192:

| Polarized channel sequence number | Reliability or reliability sequence number |
|---|---|
| 7055 | 7467 |
| 7056 | 6970 |
| 7057 | 6002 |
| 7058 | 7724 |
| 7059 | 3957 |
| 7060 | 6619 |
| 7061 | 6044 |
| 7062 | 7379 |
| 7063 | 7080 |
| 7064 | 7522 |
| 7065 | 4052 |
| 7066 | 5854 |
| 7067 | 7952 |
| 7068 | 6890 |
| 7069 | 7353 |
| 7070 | 5975 |
| 7071 | 7051 |
| 7072 | 4011 |
| 7073 | 7512 |
| 7074 | 7011 |
| 7075 | 6085 |
| 7076 | 7811 |
| 7077 | 6631 |
| 7078 | 3836 |
| 7079 | 5869 |
| 7080 | 7408 |
| 7081 | 7564 |
| 7082 | 6781 |
| 7083 | 5622 |
| 7084 | 7761 |
| 7085 | 3579 |
| 7086 | 6998 |
| 7087 | 7374 |
| 7088 | 5087 |
| 7089 | 6972 |
| 7090 | 7454 |
| 7091 | 6897 |
| 7092 | 4066 |
| 7093 | 6004 |
| 7094 | 7730 |
| 7095 | 7263 |
| 7096 | 6058 |
| 7097 | 6648 |
| 7098 | 4056 |
| 7099 | 7753 |
| 7100 | 7001 |
| 7101 | 5949 |
| 7102 | 7570 |
| 7103 | 6863 |
| 7104 | 7495 |
| 7105 | 3998 |
| 7106 | 5875 |
| 7107 | 7695 |
| 7108 | 7108 |
| 7109 | 7381 |
| 7110 | 6065 |
| 7111 | 7053 |
| 7112 | 3958 |
| 7113 | 7585 |
| 7114 | 6590 |
| 7115 | 5979 |
| 7116 | 7813 |
| 7117 | 6843 |
| 7118 | 7354 |
| 7119 | 3807 |
| 7120 | 5625 |
| 7121 | 7968 |
| 7122 | 7013 |
| 7123 | 7469 |
| 7124 | 6086 |
| 7125 | 7059 |
| 7126 | 3069 |
| 7127 | 7395 |

TABLE Q17-continued with a sequence length of 8192:

| Polarized channel sequence number | Reliability or reliability sequence number |
|---|---|
| 7128 | 6621 |
| 7129 | 5870 |
| 7130 | 7732 |
| 7131 | 7524 |
| 7132 | 4013 |
| 7133 | 6892 |
| 7134 | 6060 |
| 7135 | 7279 |
| 7136 | 7088 |
| 7137 | 7703 |
| 7138 | 6008 |
| 7139 | 3961 |
| 7140 | 7054 |
| 7141 | 7475 |
| 7142 | 7814 |
| 7143 | 6089 |
| 7144 | 6782 |
| 7145 | 7572 |
| 7146 | 4039 |
| 7147 | 6943 |
| 7148 | 5103 |
| 7149 | 7382 |
| 7150 | 7756 |
| 7151 | 6635 |
| 7152 | 5950 |
| 7153 | 4019 |
| 7154 | 7470 |
| 7155 | 7112 |
| 7156 | 7356 |
| 7157 | 5626 |
| 7158 | 6898 |
| 7159 | 7817 |
| 7160 | 4068 |
| 7161 | 7499 |
| 7162 | 5877 |
| 7163 | 7002 |
| 7164 | 7762 |
| 7165 | 7061 |
| 7166 | 6031 |
| 7167 | 7385 |
| 7168 | 2046 |
| 7169 | 6622 |
| 7170 | 7528 |
| 7171 | 5991 |
| 7172 | 7939 |
| 7173 | 6900 |
| 7174 | 7586 |
| 7175 | 3575 |
| 7176 | 6066 |
| 7177 | 7014 |
| 7178 | 7397 |
| 7179 | 7736 |
| 7180 | 5759 |
| 7181 | 7017 |
| 7182 | 4014 |
| 7183 | 7477 |
| 7184 | 6845 |
| 7185 | 5981 |
| 7186 | 7707 |
| 7187 | 7327 |
| 7188 | 6637 |
| 7189 | 3823 |
| 7190 | 6090 |
| 7191 | 7617 |
| 7192 | 7075 |
| 7193 | 7777 |
| 7194 | 5628 |
| 7195 | 7004 |
| 7196 | 3962 |
| 7197 | 7576 |
| 7198 | 7719 |
| 7199 | 5995 |
| 7200 | 6871 |

TABLE Q17-continued with a sequence length of 8192:

| Polarized channel sequence number | Reliability or reliability sequence number |
|---|---|
| 7201 | 7287 |
| 7202 | 6959 |
| 7203 | 7501 |
| 7204 | 4043 |
| 7205 | 5823 |
| 7206 | 7941 |
| 7207 | 7120 |
| 7208 | 7386 |
| 7209 | 5115 |
| 7210 | 6643 |
| 7211 | 3903 |
| 7212 | 7764 |
| 7213 | 7588 |
| 7214 | 6068 |
| 7215 | 7062 |
| 7216 | 7398 |
| 7217 | 6875 |
| 7218 | 4021 |
| 7219 | 6039 |
| 7220 | 7818 |
| 7221 | 7478 |
| 7222 | 7065 |
| 7223 | 7825 |
| 7224 | 6097 |
| 7225 | 7077 |
| 7226 | 4072 |
| 7227 | 7507 |
| 7228 | 7709 |
| 7229 | 5982 |
| 7230 | 6887 |
| 7231 | 7401 |
| 7232 | 6638 |
| 7233 | 3964 |
| 7234 | 5878 |
| 7235 | 7481 |
| 7236 | 7723 |
| 7237 | 7018 |
| 7238 | 5599 |
| 7239 | 7536 |
| 7240 | 6967 |
| 7241 | 3835 |
| 7242 | 8000 |
| 7243 | 7343 |
| 7244 | 6092 |
| 7245 | 6904 |
| 7246 | 7559 |
| 7247 | 7778 |
| 7248 | 6043 |
| 7249 | 4045 |
| 7250 | 7025 |
| 7251 | 7291 |
| 7252 | 6645 |
| 7253 | 6098 |
| 7254 | 7768 |
| 7255 | 7502 |
| 7256 | 4022 |
| 7257 | 7066 |
| 7258 | 7618 |
| 7259 | 5997 |
| 7260 | 6991 |
| 7261 | 7820 |
| 7262 | 7388 |
| 7263 | 5881 |
| 7264 | 3581 |
| 7265 | 6846 |
| 7266 | 7710 |
| 7267 | 7020 |
| 7268 | 7509 |
| 7269 | 6072 |
| 7270 | 7945 |
| 7271 | 7136 |
| 7272 | 4051 |
| 7273 | 7351 |

TABLE Q17-continued

| with a sequence length of 8192: | |
|---|---|
| Polarized channel sequence number | Reliability or reliability sequence number |
| 7274 | 6003 |
| 7275 | 7482 |
| 7276 | 6877 |
| 7277 | 7826 |
| 7278 | 6527 |
| 7279 | 6055 |
| 7280 | 3070 |
| 7281 | 7592 |
| 7282 | 7751 |
| 7283 | 7078 |
| 7284 | 5111 |
| 7285 | 7402 |
| 7286 | 7841 |
| 7287 | 7107 |
| 7288 | 4025 |
| 7289 | 7563 |
| 7290 | 5615 |
| 7291 | 6971 |
| 7292 | 7725 |
| 7293 | 7523 |
| 7294 | 6113 |
| 7295 | 6891 |
| 7296 | 4080 |
| 7297 | 7293 |
| 7298 | 7942 |
| 7299 | 7081 |
| 7300 | 5882 |
| 7301 | 7510 |
| 7302 | 6591 |
| 7303 | 7780 |
| 7304 | 4046 |
| 7305 | 6045 |
| 7306 | 7484 |
| 7307 | 7026 |
| 7308 | 7731 |
| 7309 | 7409 |
| 7310 | 5998 |
| 7311 | 7068 |
| 7312 | 3831 |
| 7313 | 7513 |
| 7314 | 6878 |
| 7315 | 7828 |
| 7316 | 6005 |
| 7317 | 7375 |
| 7318 | 6999 |
| 7319 | 7726 |
| 7320 | 3935 |
| 7321 | 6100 |
| 7322 | 7620 |
| 7323 | 7109 |
| 7324 | 7953 |
| 7325 | 6893 |
| 7326 | 6059 |
| 7327 | 7565 |
| 7328 | 4053 |
| 7329 | 7755 |
| 7330 | 6646 |
| 7331 | 7355 |
| 7332 | 5884 |
| 7333 | 7525 |
| 7334 | 7028 |
| 7335 | 7784 |
| 7336 | 4026 |
| 7337 | 5627 |
| 7338 | 7571 |
| 7339 | 7082 |
| 7340 | 7842 |
| 7341 | 7404 |
| 7342 | 6114 |
| 7343 | 6973 |
| 7344 | 7946 |
| 7345 | 4067 |
| 7346 | 6899 |

TABLE Q17-continued

| with a sequence length of 8192: | |
|---|---|
| Polarized channel sequence number | Reliability or reliability sequence number |
| 7347 | 7600 |
| 7348 | 6104 |
| 7349 | 7733 |
| 7350 | 7089 |
| 7351 | 7566 |
| 7352 | 7873 |
| 7353 | 3951 |
| 7354 | 6046 |
| 7355 | 7003 |
| 7356 | 7294 |
| 7357 | 7832 |
| 7358 | 6649 |
| 7359 | 6006 |
| 7360 | 7455 |
| 7361 | 7624 |
| 7362 | 4054 |
| 7363 | 7110 |
| 7364 | 7757 |
| 7365 | 5855 |
| 7366 | 6894 |
| 7367 | 7410 |
| 7368 | 7954 |
| 7369 | 7084 |
| 7370 | 4028 |
| 7371 | 5117 |
| 7372 | 7514 |
| 7373 | 7844 |
| 7374 | 7032 |
| 7375 | 6061 |
| 7376 | 7573 |
| 7377 | 7734 |
| 7378 | 7113 |
| 7379 | 4057 |
| 7380 | 7412 |
| 7381 | 6009 |
| 7382 | 7763 |
| 7383 | 6974 |
| 7384 | 7526 |
| 7385 | 8064 |
| 7386 | 6087 |
| 7387 | 6650 |
| 7388 | 3582 |
| 7389 | 7529 |
| 7390 | 7737 |
| 7391 | 6901 |
| 7392 | 6067 |
| 7393 | 7357 |
| 7394 | 7792 |
| 7395 | 7055 |
| 7396 | 3837 |
| 7397 | 7587 |
| 7398 | 6116 |
| 7399 | 7815 |
| 7400 | 7015 |
| 7401 | 7516 |
| 7402 | 7090 |
| 7403 | 7383 |
| 7404 | 5623 |
| 7405 | 4069 |
| 7406 | 7948 |
| 7407 | 6783 |
| 7408 | 7471 |
| 7409 | 7758 |
| 7410 | 6062 |
| 7411 | 7005 |
| 7412 | 7632 |
| 7413 | 7874 |
| 7414 | 3999 |
| 7415 | 7114 |
| 7416 | 5871 |
| 7417 | 7574 |
| 7418 | 7765 |
| 7419 | 6652 |

TABLE Q17-continued with a sequence length of 8192:

| Polarized channel sequence number | Reliability or reliability sequence number |
|---|---|
| 7420 | 7387 |
| 7421 | 6010 |
| 7422 | 7969 |
| 7423 | 7019 |
| 7424 | 3959 |
| 7425 | 7577 |
| 7426 | 7738 |
| 7427 | 6091 |
| 7428 | 6847 |
| 7429 | 7589 |
| 7430 | 7848 |
| 7431 | 7399 |
| 7432 | 7092 |
| 7433 | 2047 |
| 7434 | 5951 |
| 7435 | 7819 |
| 7436 | 7530 |
| 7437 | 7063 |
| 7438 | 8001 |
| 7439 | 6069 |
| 7440 | 7479 |
| 7441 | 7121 |
| 7442 | 4058 |
| 7443 | 7779 |
| 7444 | 7416 |
| 7445 | 6120 |
| 7446 | 7006 |
| 7447 | 7766 |
| 7448 | 7537 |
| 7449 | 6902 |
| 7450 | 7956 |
| 7451 | 4070 |
| 7452 | 6012 |
| 7453 | 7578 |
| 7454 | 6623 |
| 7455 | 7740 |
| 7456 | 7503 |
| 7457 | 5883 |
| 7458 | 7116 |
| 7459 | 7769 |
| 7460 | 7358 |
| 7461 | 4073 |
| 7462 | 7067 |
| 7463 | 6093 |
| 7464 | 7876 |
| 7465 | 7532 |
| 7466 | 7122 |
| 7467 | 7970 |
| 7468 | 7648 |
| 7469 | 6070 |
| 7470 | 4015 |
| 7471 | 7389 |
| 7472 | 7021 |
| 7473 | 7590 |
| 7474 | 7821 |
| 7475 | 5629 |
| 7476 | 6905 |
| 7477 | 7619 |
| 7478 | 7781 |
| 7479 | 7096 |
| 7480 | 3963 |
| 7481 | 7483 |
| 7482 | 6099 |
| 7483 | 7960 |
| 7484 | 7027 |
| 7485 | 7403 |
| 7486 | 7827 |
| 7487 | 7079 |
| 7488 | 5118 |
| 7489 | 7593 |
| 7490 | 4060 |
| 7491 | 7856 |
| 7492 | 7538 |
| 7493 | 6639 |
| 7494 | 6073 |
| 7495 | 7822 |
| 7496 | 7580 |
| 7497 | 7137 |
| 7498 | 7972 |
| 7499 | 7390 |
| 7500 | 3071 |
| 7501 | 6128 |
| 7502 | 6906 |
| 7503 | 7711 |
| 7504 | 7511 |
| 7505 | 7069 |
| 7506 | 7880 |
| 7507 | 6094 |
| 7508 | 7621 |
| 7509 | 7943 |
| 7510 | 3838 |
| 7511 | 7022 |
| 7512 | 7405 |
| 7513 | 7770 |
| 7514 | 5879 |
| 7515 | 7029 |
| 7516 | 7540 |
| 7517 | 7829 |
| 7518 | 7594 |
| 7519 | 5983 |
| 7520 | 4023 |
| 7521 | 7124 |
| 7522 | 8065 |
| 7523 | 7485 |
| 7524 | 7083 |
| 7525 | 7782 |
| 7526 | 6101 |
| 7527 | 7411 |
| 7528 | 6908 |
| 7529 | 7785 |
| 7530 | 4074 |
| 7531 | 7843 |
| 7532 | 7601 |
| 7533 | 6074 |
| 7534 | 6651 |
| 7535 | 8002 |
| 7536 | 7515 |
| 7537 | 7138 |
| 7538 | 7772 |
| 7539 | 6115 |
| 7540 | 7622 |
| 7541 | 3965 |
| 7542 | 7727 |
| 7543 | 7128 |
| 7544 | 7406 |
| 7545 | 7947 |
| 7546 | 5999 |
| 7547 | 7070 |
| 7548 | 7596 |
| 7549 | 7888 |
| 7550 | 7544 |
| 7551 | 7030 |
| 7552 | 4081 |
| 7553 | 6102 |
| 7554 | 7830 |
| 7555 | 7625 |
| 7556 | 6879 |
| 7557 | 7976 |
| 7558 | 7486 |
| 7559 | 6076 |
| 7560 | 7833 |
| 7561 | 7085 |
| 7562 | 4047 |
| 7563 | 7413 |
| 7564 | 7845 |
| 7565 | 7033 |

TABLE Q17-continued with a sequence length of 8192:

| Polarized channel sequence number | Reliability or reliability sequence number |
|---|---|
| 7566 | 7567 |
| 7567 | 6105 |
| 7568 | 8004 |
| 7569 | 7786 |
| 7570 | 7111 |
| 7571 | 7527 |
| 7572 | 7735 |
| 7573 | 4027 |
| 7574 | 5630 |
| 7575 | 7091 |
| 7576 | 7602 |
| 7577 | 8066 |
| 7578 | 7295 |
| 7579 | 7140 |
| 7580 | 5885 |
| 7581 | 7793 |
| 7582 | 7517 |
| 7583 | 7834 |
| 7584 | 3583 |
| 7585 | 6647 |
| 7586 | 7626 |
| 7587 | 7955 |
| 7588 | 6117 |
| 7589 | 7086 |
| 7590 | 7759 |
| 7591 | 7531 |
| 7592 | 7788 |
| 7593 | 6895 |
| 7594 | 6047 |
| 7595 | 4076 |
| 7596 | 7359 |
| 7597 | 7949 |
| 7598 | 7604 |
| 7599 | 7034 |
| 7600 | 7904 |
| 7601 | 7575 |
| 7602 | 6007 |
| 7603 | 7846 |
| 7604 | 7115 |
| 7605 | 7633 |
| 7606 | 7984 |
| 7607 | 3966 |
| 7608 | 6975 |
| 7609 | 6106 |
| 7610 | 7875 |
| 7611 | 7518 |
| 7612 | 7739 |
| 7613 | 7093 |
| 7614 | 7414 |
| 7615 | 7950 |
| 7616 | 6118 |
| 7617 | 7628 |
| 7618 | 4082 |
| 7619 | 7144 |
| 7620 | 7849 |
| 7621 | 8008 |
| 7622 | 7579 |
| 7623 | 7036 |
| 7624 | 6121 |
| 7625 | 7794 |
| 7626 | 7634 |
| 7627 | 7836 |
| 7628 | 6907 |
| 7629 | 7533 |
| 7630 | 4084 |
| 7631 | 7957 |
| 7632 | 6063 |
| 7633 | 7417 |
| 7634 | 7117 |
| 7635 | 7767 |
| 7636 | 7877 |
| 7637 | 7608 |
| 7638 | 6011 |

TABLE Q17-continued with a sequence length of 8192:

| Polarized channel sequence number | Reliability or reliability sequence number |
|---|---|
| 7639 | 7094 |
| 7640 | 8068 |
| 7641 | 7539 |
| 7642 | 4029 |
| 7643 | 7796 |
| 7644 | 6653 |
| 7645 | 7971 |
| 7646 | 6108 |
| 7647 | 7591 |
| 7648 | 7850 |
| 7649 | 7123 |
| 7650 | 7649 |
| 7651 | 7741 |
| 7652 | 7418 |
| 7653 | 7097 |
| 7654 | 4055 |
| 7655 | 5119 |
| 7656 | 7962 |
| 7657 | 7857 |
| 7658 | 7581 |
| 7659 | 7152 |
| 7660 | 7771 |
| 7661 | 7534 |
| 7662 | 5886 |
| 7663 | 8016 |
| 7664 | 7118 |
| 7665 | 7878 |
| 7666 | 7541 |
| 7667 | 3839 |
| 7668 | 7973 |
| 7669 | 6903 |
| 7670 | 6071 |
| 7671 | 7636 |
| 7672 | 7852 |
| 7673 | 7595 |
| 7674 | 7007 |
| 7675 | 7800 |
| 7676 | 7961 |
| 7677 | 6122 |
| 7678 | 7420 |
| 7679 | 7125 |
| 7680 | 4059 |
| 7681 | 7881 |
| 7682 | 7650 |
| 7683 | 7958 |
| 7684 | 7742 |
| 7685 | 7098 |
| 7686 | 6013 |
| 7687 | 7640 |
| 7688 | 8072 |
| 7689 | 7582 |
| 7690 | 7139 |
| 7691 | 7823 |
| 7692 | 4071 |
| 7693 | 7783 |
| 7694 | 6129 |
| 7695 | 7542 |
| 7696 | 7023 |
| 7697 | 7974 |
| 7698 | 7858 |
| 7699 | 7391 |
| 7700 | 7126 |
| 7701 | 8032 |
| 7702 | 6095 |
| 7703 | 7597 |
| 7704 | 7773 |
| 7705 | 7882 |
| 7706 | 4088 |
| 7707 | 7100 |
| 7708 | 7545 |
| 7709 | 8003 |
| 7710 | 7623 |
| 7711 | 6075 |

TABLE Q17-continued

| with a sequence length of 8192: | |
|---|---|
| Polarized channel sequence number | Reliability or reliability sequence number |
| 7712 | 7129 |
| 7713 | 7787 |
| 7714 | 7977 |
| 7715 | 7603 |
| 7716 | 7860 |
| 7717 | 6654 |
| 7718 | 8080 |
| 7719 | 4030 |
| 7720 | 5631 |
| 7721 | 7652 |
| 7722 | 7831 |
| 7723 | 6909 |
| 7724 | 7598 |
| 7725 | 7889 |
| 7726 | 7964 |
| 7727 | 7407 |
| 7728 | 6124 |
| 7729 | 7141 |
| 7730 | 7774 |
| 7731 | 8005 |
| 7732 | 7546 |
| 7733 | 4061 |
| 7734 | 7884 |
| 7735 | 7071 |
| 7736 | 7627 |
| 7737 | 6014 |
| 7738 | 7978 |
| 7739 | 7835 |
| 7740 | 7031 |
| 7741 | 7487 |
| 7742 | 7985 |
| 7743 | 7890 |
| 7744 | 7605 |
| 7745 | 6130 |
| 7746 | 7130 |
| 7747 | 4075 |
| 7748 | 7789 |
| 7749 | 8010 |
| 7750 | 7656 |
| 7751 | 7864 |
| 7752 | 7142 |
| 7753 | 7548 |
| 7754 | 6132 |
| 7755 | 8096 |
| 7756 | 7795 |
| 7757 | 7419 |
| 7758 | 7145 |
| 7759 | 8128 |
| 7760 | 7847 |
| 7761 | 7629 |
| 7762 | 4062 |
| 7763 | 8006 |
| 7764 | 6077 |
| 7765 | 7087 |
| 7766 | 7905 |
| 7767 | 7606 |
| 7768 | 7980 |
| 7769 | 7035 |
| 7770 | 7837 |
| 7771 | 7635 |
| 7772 | 8067 |
| 7773 | 6103 |
| 7774 | 7790 |
| 7775 | 7132 |
| 7776 | 4077 |
| 7777 | 7609 |
| 7778 | 8017 |
| 7779 | 7797 |
| 7780 | 7664 |
| 7781 | 7892 |
| 7782 | 5887 |
| 7783 | 6910 |
| 7784 | 7630 |

TABLE Q17-continued

| with a sequence length of 8192: | |
|---|---|
| Polarized channel sequence number | Reliability or reliability sequence number |
| 7785 | 7986 |
| 7786 | 7851 |
| 7787 | 7415 |
| 7788 | 7095 |
| 7789 | 8009 |
| 7790 | 7906 |
| 7791 | 7519 |
| 7792 | 4083 |
| 7793 | 6107 |
| 7794 | 7951 |
| 7795 | 7146 |
| 7796 | 7896 |
| 7797 | 8069 |
| 7798 | 7637 |
| 7799 | 7838 |
| 7800 | 7037 |
| 7801 | 7988 |
| 7802 | 6119 |
| 7803 | 7610 |
| 7804 | 7798 |
| 7805 | 7959 |
| 7806 | 7651 |
| 7807 | 7153 |
| 7808 | 4078 |
| 7809 | 7853 |
| 7810 | 8070 |
| 7811 | 7535 |
| 7812 | 6136 |
| 7813 | 7801 |
| 7814 | 7119 |
| 7815 | 8012 |
| 7816 | 7638 |
| 7817 | 7879 |
| 7818 | 7859 |
| 7819 | 7099 |
| 7820 | 7612 |
| 7821 | 7908 |
| 7822 | 6078 |
| 7823 | 8073 |
| 7824 | 4085 |
| 7825 | 7641 |
| 7826 | 7854 |
| 7827 | 6655 |
| 7828 | 8018 |
| 7829 | 7802 |
| 7830 | 7421 |
| 7831 | 7992 |
| 7832 | 7883 |
| 7833 | 6109 |
| 7834 | 7148 |
| 7835 | 7653 |
| 7836 | 7963 |
| 7837 | 7743 |
| 7838 | 7583 |
| 7839 | 8033 |
| 7840 | 7038 |
| 7841 | 3967 |
| 7842 | 7861 |
| 7843 | 7975 |
| 7844 | 6123 |
| 7845 | 7543 |
| 7846 | 7912 |
| 7847 | 7154 |
| 7848 | 8020 |
| 7849 | 7642 |
| 7850 | 8074 |
| 7851 | 7804 |
| 7852 | 7654 |
| 7853 | 7156 |
| 7854 | 6110 |
| 7855 | 8081 |
| 7856 | 7885 |
| 7857 | 7965 |

TABLE Q17-continued with a sequence length of 8192:

| Polarized channel sequence number | Reliability or reliability sequence number |
|---|---|
| 7858 | 4031 |
| 7859 | 7657 |
| 7860 | 7862 |
| 7861 | 7101 |
| 7862 | 7979 |
| 7863 | 7599 |
| 7864 | 7891 |
| 7865 | 8034 |
| 7866 | 6125 |
| 7867 | 7865 |
| 7868 | 7547 |
| 7869 | 7127 |
| 7870 | 8024 |
| 7871 | 7920 |
| 7872 | 7644 |
| 7873 | 8076 |
| 7874 | 7886 |
| 7875 | 6911 |
| 7876 | 4086 |
| 7877 | 7966 |
| 7878 | 6131 |
| 7879 | 7422 |
| 7880 | 7775 |
| 7881 | 8082 |
| 7882 | 8007 |
| 7883 | 7131 |
| 7884 | 7607 |
| 7885 | 7893 |
| 7886 | 8097 |
| 7887 | 7866 |
| 7888 | 7658 |
| 7889 | 6126 |
| 7890 | 7981 |
| 7891 | 7143 |
| 7892 | 7907 |
| 7893 | 7549 |
| 7894 | 8036 |
| 7895 | 4089 |
| 7896 | 7791 |
| 7897 | 7987 |
| 7898 | 7665 |
| 7899 | 7160 |
| 7900 | 8084 |
| 7901 | 7894 |
| 7902 | 6133 |
| 7903 | 7982 |
| 7904 | 7631 |
| 7905 | 7868 |
| 7906 | 7102 |
| 7907 | 8011 |
| 7908 | 7897 |
| 7909 | 7611 |
| 7910 | 8040 |
| 7911 | 8098 |
| 7912 | 7909 |
| 7913 | 7660 |
| 7914 | 6015 |
| 7915 | 4090 |
| 7916 | 7133 |
| 7917 | 7989 |
| 7918 | 7839 |
| 7919 | 8129 |
| 7920 | 7550 |
| 7921 | 8088 |
| 7922 | 7799 |
| 7923 | 7147 |
| 7924 | 8013 |
| 7925 | 7666 |
| 7926 | 7898 |
| 7927 | 8100 |
| 7928 | 6079 |
| 7929 | 7910 |
| 7930 | 7990 |
| 7931 | 7134 |
| 7932 | 7668 |
| 7933 | 8019 |
| 7934 | 7913 |
| 7935 | 7993 |
| 7936 | 4092 |
| 7937 | 7613 |
| 7938 | 8048 |
| 7939 | 7855 |
| 7940 | 7149 |
| 7941 | 8071 |
| 7942 | 6134 |
| 7943 | 7639 |
| 7944 | 7803 |
| 7945 | 8014 |
| 7946 | 8130 |
| 7947 | 7900 |
| 7948 | 7423 |
| 7949 | 7155 |
| 7950 | 8021 |
| 7951 | 7863 |
| 7952 | 7994 |
| 7953 | 7643 |
| 7954 | 8104 |
| 7955 | 6137 |
| 7956 | 7914 |
| 7957 | 4063 |
| 7958 | 8075 |
| 7959 | 7150 |
| 7960 | 8035 |
| 7961 | 7655 |
| 7962 | 7805 |
| 7963 | 8022 |
| 7964 | 7996 |
| 7965 | 7921 |
| 7966 | 7672 |
| 7967 | 7157 |
| 7968 | 8025 |
| 7969 | 7887 |
| 7970 | 8132 |
| 7971 | 6138 |
| 7972 | 8077 |
| 7973 | 7614 |
| 7974 | 7867 |
| 7975 | 8037 |
| 7976 | 8083 |
| 7977 | 7039 |
| 7978 | 7645 |
| 7979 | 7916 |
| 7980 | 8112 |
| 7981 | 4079 |
| 7982 | 8078 |
| 7983 | 7806 |
| 7984 | 7967 |
| 7985 | 7659 |
| 7986 | 8136 |
| 7987 | 6140 |
| 7988 | 7103 |
| 7989 | 7922 |
| 7990 | 8026 |
| 7991 | 8085 |
| 7992 | 7646 |
| 7993 | 7924 |
| 7994 | 8038 |
| 7995 | 8041 |
| 7996 | 7869 |
| 7997 | 7158 |
| 7998 | 7661 |
| 7999 | 8099 |
| 8000 | 8028 |
| 8001 | 7895 |
| 8002 | 7983 |
| 8003 | 6111 |

TABLE Q17-continued with a sequence length of 8192:

| Polarized channel sequence number | Reliability or reliability sequence number |
|---|---|
| 8004 | 8144 |
| 8005 | 7667 |
| 8006 | 4091 |
| 8007 | 8086 |
| 8008 | 7899 |
| 8009 | 7161 |
| 8010 | 8089 |
| 8011 | 8101 |
| 8012 | 7911 |
| 8013 | 7662 |
| 8014 | 8042 |
| 8015 | 7991 |
| 8016 | 7928 |
| 8017 | 8049 |
| 8018 | 7669 |
| 8019 | 7162 |
| 8020 | 8090 |
| 8021 | 6127 |
| 8022 | 8015 |
| 8023 | 7870 |
| 8024 | 8044 |
| 8025 | 8160 |
| 8026 | 7901 |
| 8027 | 7551 |
| 8028 | 8102 |
| 8029 | 8131 |
| 8030 | 7995 |
| 8031 | 7164 |
| 8032 | 7915 |
| 8033 | 4087 |
| 8034 | 8105 |
| 8035 | 7615 |
| 8036 | 8050 |
| 8037 | 8092 |
| 8038 | 7902 |
| 8039 | 8023 |
| 8040 | 6139 |
| 8041 | 8133 |
| 8042 | 7917 |
| 8043 | 7670 |
| 8044 | 7135 |
| 8045 | 8052 |
| 8046 | 8106 |
| 8047 | 7997 |
| 8048 | 7923 |
| 8049 | 8113 |
| 8050 | 8027 |
| 8051 | 7673 |
| 8052 | 8134 |
| 8053 | 7918 |
| 8054 | 8108 |
| 8055 | 8056 |
| 8056 | 8137 |
| 8057 | 7151 |
| 8058 | 7998 |
| 8059 | 7674 |
| 8060 | 7925 |
| 8061 | 6135 |
| 8062 | 8079 |
| 8063 | 8039 |
| 8064 | 4093 |
| 8065 | 8114 |
| 8066 | 7807 |
| 8067 | 8029 |
| 8068 | 8138 |
| 8069 | 7676 |
| 8070 | 8043 |
| 8071 | 7871 |
| 8072 | 7163 |
| 8073 | 8116 |
| 8074 | 8087 |
| 8075 | 8145 |
| 8076 | 8030 |
| 8077 | 7926 |
| 8078 | 7647 |
| 8079 | 8140 |
| 8080 | 8091 |
| 8081 | 8146 |
| 8082 | 8045 |
| 8083 | 7929 |
| 8084 | 6141 |
| 8085 | 8120 |
| 8086 | 8051 |
| 8087 | 8103 |
| 8088 | 7159 |
| 8089 | 7663 |
| 8090 | 8161 |
| 8091 | 7930 |
| 8092 | 8093 |
| 8093 | 8046 |
| 8094 | 8053 |
| 8095 | 8148 |
| 8096 | 8107 |
| 8097 | 7932 |
| 8098 | 4094 |
| 8099 | 7675 |
| 8100 | 8162 |
| 8101 | 8152 |
| 8102 | 8094 |
| 8103 | 8054 |
| 8104 | 7903 |
| 8105 | 7165 |
| 8106 | 8109 |
| 8107 | 8057 |
| 8108 | 8135 |
| 8109 | 8115 |
| 8110 | 8164 |
| 8111 | 6142 |
| 8112 | 7671 |
| 8113 | 8110 |
| 8114 | 7919 |
| 8115 | 8058 |
| 8116 | 8139 |
| 8117 | 7999 |
| 8118 | 8117 |
| 8119 | 8168 |
| 8120 | 8060 |
| 8121 | 7931 |
| 8122 | 8141 |
| 8123 | 8118 |
| 8124 | 7677 |
| 8125 | 8147 |
| 8126 | 7166 |
| 8127 | 8121 |
| 8128 | 8176 |
| 8129 | 8142 |
| 8130 | 7927 |
| 8131 | 8031 |
| 8132 | 8149 |
| 8133 | 8122 |
| 8134 | 8163 |
| 8135 | 8047 |
| 8136 | 8150 |
| 8137 | 8124 |
| 8138 | 4095 |
| 8139 | 8153 |
| 8140 | 7678 |
| 8141 | 7933 |
| 8142 | 8165 |
| 8143 | 8095 |
| 8144 | 8055 |
| 8145 | 6143 |
| 8146 | 8154 |
| 8147 | 8166 |
| 8148 | 8169 |
| 8149 | 8111 |

TABLE Q17-continued

| with a sequence length of 8192: | |
|---|---|
| Polarized channel sequence number | Reliability or reliability sequence number |
| 8150 | 8059 |
| 8151 | 8156 |
| 8152 | 7167 |
| 8153 | 7934 |
| 8154 | 8119 |
| 8155 | 8170 |
| 8156 | 8061 |
| 8157 | 8177 |
| 8158 | 8143 |
| 8159 | 8123 |
| 8160 | 7679 |
| 8161 | 8172 |
| 8162 | 8062 |
| 8163 | 8178 |
| 8164 | 8180 |
| 8165 | 8125 |
| 8166 | 8151 |
| 8167 | 7935 |
| 8168 | 8155 |
| 8169 | 8167 |
| 8170 | 8184 |
| 8171 | 8126 |
| 8172 | 8157 |
| 8173 | 8171 |
| 8174 | 8158 |
| 8175 | 8173 |
| 8176 | 8179 |
| 8177 | 8174 |
| 8178 | 8181 |
| 8179 | 8063 |
| 8180 | 8127 |
| 8181 | 8182 |
| 8182 | 8185 |
| 8183 | 8186 |
| 8184 | 8188 |
| 8185 | 8159 |
| 8186 | 8175 |
| 8187 | 8187 |
| 8188 | 8183 |
| 8189 | 8189 |
| 8190 | 8190 |
| 8191 | 8191 |

Sequence Q18, with a sequence length of 4096:

[0, 1, 2, 4, 8, 16, 32, 3, 256, 512, 1024, 2048, 5, 64, 9, 6, 17, 10, 18, 128, 12, 33, 65, 20, 3 4, 24, 36, 257, 7, 129, 66, 11, 40, 68, 513, 130, 19, 13, 48, 14, 1025, 72, 258, 21, 132, 35, 2049, 26, 8 0, 37, 25, 22, 136, 514, 260, 38, 96, 67, 41, 144, 28, 69, 42, 264, 49, 74, 1026, 160, 516, 192, 70, 44, 272, 131, 81, 50, 73, 15, 133, 2050, 288, 520, 52, 23, 134, 76, 1028, 137, 82, 259, 56, 27, 97, 528, 3 9, 261, 84, 138, 145, 29, 43, 320, 1032, 544, 98, 2052, 88, 140, 30, 265, 146, 71, 161, 515, 45, 262, 100, 51, 1040, 148, 46, 273, 768, 75, 104, 162, 266, 53, 2056, 193, 152, 517, 77, 1056, 274, 164, 5 4, 83, 384, 576, 57, 112, 135, 268, 78, 1027, 194, 521, 2064, 85, 289, 58, 168, 139, 321, 518, 99, 1 280, 86, 276, 60, 89, 529, 196, 290, 141, 2080, 101, 280, 1536, 147, 522, 176, 142, 292, 31, 200, 5 30, 263, 1029, 90, 149, 385, 2051, 640, 102, 105, 163, 322, 92, 1088, 524, 47, 267, 208, 150, 545, 296, 153, 2304, 165, 1033, 324, 577, 106, 55, 386, 113, 154, 1030, 532, 275, 79, 108, 2560, 546, 269, 224, 166, 1041, 304, 536, 195, 59, 270, 169, 548, 1034, 328, 3072, 114, 156, 277, 769, 87, 1 97, 1042, 388, 519, 116, 291, 170, 2053, 61, 641, 1152, 282, 177, 91, 578, 336, 198, 293, 1036, 1 72, 523, 2112, 120, 281, 201, 552, 1057, 278, 62, 392, 580, 143, 103, 2057, 294, 1089, 642, 178, 352, 93, 531, 202, 1044, 323, 107, 2054, 525, 297, 180, 1058, 400, 560, 151, 209, 284, 526, 1048, 2065, 94, 325, 204, 584, 298, 155, 1060, 770, 305, 210, 2058, 109, 533, 1281, 330, 184, 416, 64 4, 115, 1031, 448, 2066, 547, 167, 326, 225, 538, 1153, 300, 157, 592, 387, 2176, 110, 1090, 337, 549, 117, 212, 537, 1035, 306, 2060, 171, 329, 534, 226, 1064, 271, 648, 216, 389, 2081, 1092, 772, 158, 308, 550, 118, 1537, 279, 173, 2113, 608, 390, 121, 1154, 579, 332, 199, 553, 1043, 20 68, 179, 228, 656, 393, 1037, 174, 540, 338, 2082, 122, 581, 1072, 312, 203, 283, 554, 1038, 63, 2072, 353, 776, 181, 1096, 295, 561, 232, 340, 2084, 1282, 586, 394, 672, 124, 401, 1045, 2305, 704, 205, 285, 582, 1156, 182, 299, 556, 2055, 211, 1059, 354, 784, 185, 1050, 344, 643, 2177, 2 40, 396, 1104, 593, 206, 286, 562, 2114, 1061, 95, 585, 402, 327, 1049, 527, 2059, 213, 417, 104 6, 645, 186, 800, 301, 2088, 1160, 227, 564, 356, 111, 1538, 535, 2116, 307, 646, 1284, 404, 214, 588, 302, 2561, 1062, 188, 649, 331, 1120, 594, 217, 2178, 360, 771, 1091, 418, 229, 568, 1065, 2067, 309, 539, 159, 1168, 449, 609, 2061, 408, 551, 1052, 119, 333, 773, 1093, 2096, 218, 596, 420, 1066, 230, 650, 2062, 310, 1288, 657, 339, 541, 1073, 3073, 233, 313, 555, 1098, 368, 832, 175, 2120, 1184, 391, 610, 123, 1540, 600, 2306, 334, 450, 1216, 652, 220, 542, 2069, 1094, 34 1, 777, 183, 1068, 2180, 314, 658, 424, 1296, 583, 234, 2083, 673, 1155, 395, 557, 355, 1105, 20 74, 125, 774, 342, 1074, 612, 316, 2128, 563, 1097, 241, 345, 660, 2085, 1039, 207, 558, 1157, 4 52, 785, 2073, 397, 1312, 587, 187, 357, 2070, 1544, 616, 403, 1076, 674, 236, 2184, 778, 1047, 432, 565, 398, 2562, 1158, 705, 126, 1100, 664, 2308, 287, 456, 1161, 589, 242, 1106, 2086, 786, 346, 676, 1283, 405, 2144, 566, 1080, 244, 595, 358, 2115, 1051, 896, 361, 1121, 569, 2089, 18 9, 624, 1552, 419, 647, 2192, 1063, 348, 215, 780, 1285, 2076, 303, 590, 1108, 464, 706, 2117, 4 06, 1162, 597, 219, 1169, 2090, 801, 409, 1053, 570, 2312, 421, 680, 1067, 231, 651, 2097, 134 4, 362, 833, 1568, 311, 2122, 611, 1122, 248, 598, 3074, 369, 1112, 788, 410, 1164, 2208, 572, 3 35, 1054, 601, 190, 2564, 1289, 708, 364, 1170, 221, 1095, 422, 2118, 653, 118 5, 451, 613, 2092, 1539, 315, 792, 1069, 2320, 235, 659, 1286, 425, 688, 2179, 1124, 370, 654, 1 075, 2129, 412, 804, 1172, 222, 2098, 543, 343, 1070, 712, 453, 2121, 1297, 775, 237, 1792, 20 63, 602, 372, 1099, 661, 2181, 426, 1128, 897, 317, 2336, 1186, 614, 243, 1290, 2568, 617, 675, 1077, 433, 1217, 2100, 834, 347, 1176, 604, 2071, 454, 1541, 559, 238, 2182, 1101, 779, 428, 1 298, 2124, 720, 376, 1188, 662, 3076, 457, 1078, 808, 318, 2185, 1107, 665, 245, 2130, 1408, 6 77, 1600, 399, 2307, 836, 1081, 618, 359, 2104, 1136, 567, 434, 1159, 2075, 898, 127, 1292, 62 5, 2145, 349, 1102, 666, 1218, 2576, 458, 787, 1545, 2087, 591, 363, 1109, 620, 2309, 191, 131 3, 781, 1082, 2132, 436, 736, 1192, 2186, 407, 678, 1163, 465, 2193, 1345, 816, 707, 1542, 207 7, 350, 571, 1123, 2091, 246, 1110, 782, 460, 2368, 1300, 681, 840, 3080, 1084, 411, 1113, 626, 2592, 466, 1553, 668, 2146, 365, 1220, 789, 1314, 2136, 249, 599, 1165, 2188, 709, 440, 1125, 900, 2078, 1304, 371, 628, 2313, 1171, 803, 1546, 423, 2194, 682, 1200, 481, 2119, 573, 1166, 250, 2209, 1316, 794, 689, 1055, 2563, 413, 1224, 603, 2093, 366, 1554, 848, 2310, 1287, 710, 373, 1114, 2148, 805, 1173, 468, 2099, 684, 1409, 427, 3088, 1664, 632, 793, 2196, 1126, 252, 1 129, 2094, 713, 482, 1187, 790, 2321, 1346, 574, 472, 2816, 1116, 904, 1548, 2123, 414, 1071, 655, 2152, 615, 1291, 374, 2210, 1232, 806, 690, 2314, 1174, 223, 1569, 2101, 864, 429, 1320, 2241, 605, 1177, 714, 2200, 1189, 377, 835, 2565, 1348, 455, 1601, 2125, 619, 809, 1130, 3104, 435, 1079, 692, 2322, 1410, 912, 484, 2212, 1137, 663, 1178, 2102, 430, 1556, 721, 2131, 796, 1299, 239, 2432, 1103, 606, 1132, 2624, 837, 378, 1570, 2105, 716, 1293, 459, 2160, 1248, 810, 1190, 2183, 667, 319, 1328, 2316, 817, 1560, 722, 2126, 1219, 437, 3075, 621, 1083, 842, 224 2, 1294, 488, 1193, 2569, 696, 1572, 380, 2133, 928, 1352, 627, 2337, 1138, 251, 2106, 1180, 9 60, 1301, 2216, 679, 461, 1793, 2187, 838, 1111, 2369, 737, 1221, 438, 2566, 1412, 812, 669, 2 147, 1543, 467, 1140, 3328, 899, 1315, 2134, 622, 1194, 441, 2324, 1085, 849, 1665, 2108, 629, 496, 2137, 1306, 724, 1201, 2577, 462, 1115, 2244, 818, 1602, 683, 2338, 1360, 247, 1222, 21 89, 841, 738, 2149, 1317, 351, 1196, 2328, 783, 1547, 3584, 728, 1144, 901, 2195, 1305, 469, 2 570, 1225, 670, 1576, 2224, 820, 442, 2190, 1302, 630, 1086, 2340, 791, 1416, 2079, 483, 1604, 685, 2248, 1167, 902, 2578, 1127, 367, 1318, 2311, 633, 1666, 3077, 844, 1202, 470, 2138, 13 76, 711, 2197, 1117, 691, 444, 2433, 1555, 740, 2688, 1226, 905, 2150, 1347, 473, 1131, 2153, 6 86, 1549, 2211, 850, 1321, 634, 2370, 1204, 253, 2140, 1424, 824, 3136, 1584, 715, 1175, 2572, 485, 1233, 2095, 795, 1308, 2315, 575, 1550, 415, 2256, 1118, 865, 2198, 1349, 693, 2593, 12 28, 807, 2344, 1608, 375, 1322, 2201, 744, 1179, 2213, 852, 1794, 3081, 474, 1329, 906, 2372, 1234, 636, 2625, 1133, 486, 2154, 1557, 913, 2103, 1354, 717, 2434, 1208, 797, 1440, 2161, 48 9, 1668, 2202, 694, 1139, 3078, 811, 1472, 2580, 431, 1571, 2323, 723, 1191, 866, 2127, 697, 3 79, 2156, 1350, 856, 2594, 1249, 752, 2317, 1562, 476, 2272, 1324, 908, 2214, 1181, 718, 1616, 3089, 798, 1411, 2352, 254, 1134, 2584, 607, 1361, 2243, 914, 1573, 2107, 839, 1141, 2318, 4 39, 1236, 2217, 725, 1561, 2596, 929, 1330, 3082, 698, 1195, 2376, 490, 1353, 2162, 813, 1558, 739, 2204, 1250, 381, 2325, 1295, 868, 2817, 1672, 623, 2135, 1240, 819, 2245, 1413, 497, 30 90, 1796, 916, 2436, 1182, 726, 2567, 1332, 814, 2164, 1574, 463, 2339, 1142, 700, 2218, 1303, 843, 2109, 1197, 729, 2689, 1632, 443, 3200, 1414, 1145, 2330, 872, 2225, 1603, 930, 2139, 1 356, 741, 2626, 1223, 492, 2384, 1577, 821, 2246, 1203, 671, 2341, 1252, 961, 3084, 1680, 382, 2220, 1417, 920, 2571, 1198, 631, 2168, 1564, 845, 2329, 1362, 498, 2249, 1146, 2600, 1605, 730, 3105, 1336, 932, 2326, 1227, 742, 2110, 1307, 822, 2440, 1578, 500, 2628, 1087, 851, 219 1, 1377, 2151, 745, 1800, 2342, 1205, 825, 3137, 1319, 445, 2690, 1585, 880, 2226, 1256, 687, 2400, 1364, 2141, 903, 1610, 2579, 471, 1418, 2250, 1696, 635, 3092, 1148, 846, 2371, 1425, 2 155, 962, 1728, 2573, 732, 1229, 2345, 255, 1309, 2228, 1606, 3106, 853, 1206, 2448, 695, 132 3, 2608, 826, 1580, 2199, 475, 2257, 1235, 936, 2332, 1378, 1808, 2574, 746, 1209, 3096, 907, 2142, 1368, 867, 2373, 1667, 487, 2252, 1264, 2632, 1420, 637, 2346, 1617, 854, 2203, 1230, 3 108, 828, 1310, 2818, 753, 1586, 2353, 1119, 2258, 504, 1609, 2157, 857, 1426, 2581, 719, 332 9, 1351, 1551, 2378, 964, 1237, 2232, 909, 2464, 1441, 446, 2692, 1669, 699, 2163, 1210, 3079, 1824, 869, 2496, 1325, 915, 2595, 1251, 2215, 477, 1588, 2374, 1380, 2273, 748, 1135, 2586, 944, 1559, 3201, 910, 2348, 1331, 1670, 2205, 638, 2640, 1428, 799, 2435, 1238, 1612, 2158, 4 91, 3138, 1326, 968, 2385, 1212, 2597, 754, 1673, 2165, 1355, 858, 2260, 1618, 2585, 917, 124 1, 3083, 478, 2354, 1384, 1795, 2219, 756, 2377, 1442, 870, 2582, 1253, 2274, 1592, 873, 3112, 1333, 2319, 701, 1563, 2696, 1183, 2264, 493, 1473, 2437, 931, 3140, 1633, 860, 2820, 1432, 2206, 1575, 727, 2356, 1143, 2598, 815, 1357, 2166, 1797, 3585, 976, 1242, 2327, 499, 2221, 1 620, 1444, 2656, 918, 2438, 1254, 731, 2169, 1674, 3202, 1334, 921, 2627, 1681, 2380, 933, 13 63, 2247, 1565, 2601, 743, 1257, 3091, 494, 2227, 1337, 2276, 1579, 874, 2704, 1392, 2441, 82 3, 1856, 3085, 1199, 2222, 760, 1415, 2588, 1634, 2386, 881, 2170, 1147, 501, 2629, 1624, 312 0, 1358, 922, 2360, 1474, 2251, 847, 2331, 1676, 1244, 2602, 702, 3086, 1566, 876, 2111, 1365, 2401, 1801, 2824, 992, 1207, 2229, 1338, 3144, 733, 1682, 2343, 383, 2609, 1448, 2280, 1607, 934, 2388, 1258, 3330, 1697, 2634, 963, 1419, 2442, 827, 2720, 1581, 2172, 1379, 747, 2449, 1149, 3093, 1798, 2752, 937, 1366, 2253, 447, 2333, 1636, 2630, 1340, 882, 3204, 1587, 2230, 1265, 2347, 924, 1369, 2604, 734, 2259, 1684, 3107, 1231, 855, 2402, 1582, 2832, 1476, 2233, 965, 3098, 1809, 749, 2392, 1421, 2691, 1611, 2288, 502, 1211, 2444, 1381, 3152, 884, 2641, 1 640, 2254, 1427, 938, 2334, 1698, 2610, 1260, 3109, 829, 1802, 2143, 755, 2633, 1456, 2450, 1 589, 2375, 945, 1422, 3097, 1729, 2575, 859, 2261, 1150, 2465, 1688, 505, 3094, 1311, 2693, 1 480, 2234, 966, 2848, 1613, 750, 2349, 1266, 3208, 1810, 2275, 940, 2612, 1370, 2404, 1700, 8 88, 2159, 1429, 3586, 1590, 2583, 969, 2355, 1268, 1619, 2694, 830, 3332, 1382, 2452, 1920, 2 262, 506, 2636, 1385, 1593, 2350, 757, 3110, 1213, 2236, 1648, 2697, 911, 2379, 1443, 3168, 1 671, 871, 2642, 1372, 2265, 946, 2408, 1239, 2819, 1804, 3139, 639, 2466, 1327, 1614, 2277, 8 61, 2616, 1488, 3113, 1730, 2357, 970, 2587, 1430, 2207, 1621, 508, 3216, 1243, 2497, 1825, 2 657, 875, 2456, 1433, 2599, 1594, 3100, 703, 2167, 1445, 1704, 2381, 1255, 2821, 948, 3141, 1 675, 2266, 1386, 2644, 919, 2468, 1857, 3114, 1335, 2278, 977, 1635, 2698, 1272, 2358, 862, 3 336, 1622, 2705, 1393, 2387, 758, 2589, 1812, 3121, 1434, 2281, 479, 2361, 1596, 2603, 1359, 972, 3146, 1625, 2416, 1214, 2880, 923, 2223, 1732, 3232, 1388, 2439, 978, 2658, 1826, 2171, 1504, 3588, 1245, 2648, 877, 2382, 1446, 2498, 1677, 761, 3264, 1475, 2700, 1637, 2268, 952, 2590, 1339, 3142, 1816, 2389, 883, 2825, 1259, 2231, 1683, 3116, 935, 2362, 1449, 2706, 171 2, 2472, 1394, 3344, 495, 2631, 1678, 2282, 1436, 2721, 993, 3203, 1828, 2443, 1246, 2605, 76 2, 2403, 1567, 3153, 1367, 2173, 925, 2822, 1736, 2390, 1477, 3122, 1799, 2660, 878, 2364, 12 61, 2611, 1626, 3145, 885, 2289, 1396, 2393, 1685, 2708, 1450, 3087, 980, 2255, 1921, 2606, 1 341, 3205, 939, 2500, 1638, 2833, 1267, 2445, 764, 3360, 1641, 2635, 1699, 2235, 1457, 2405, 507, 3592, 1858, 2664, 1371, 2451, 994, 3124, 1628, 2722, 1478, 2284, 1583, 2826, 984, 3095, 1262, 2480, 1803, 2613, 926, 2446, 1452, 3206, 1744, 2753, 1400, 2174, 886, 3148, 1686, 271 2, 1481, 2335, 735, 2504, 1832, 3209, 1342, 2637, 1689, 2290, 941, 1269, 1701, 3154, 889, 283 4, 1423, 2394, 1860, 2724, 1642, 3331, 967, 2453, 1383, 2614, 1591, 3128, 947, 2292, 1458, 26 43, 1922, 2406, 1151, 3099, 996, 2944, 1649, 2409, 1373, 3169, 1690, 2617, 503, 2237, 1482, 2 672, 1811, 3600, 942, 2467, 1615, 2695, 1387, 3111, 1644, 2396, 751, 2263, 1215, 2828, 1805, 3333, 1460, 2351, 890, 2638, 1760, 3156, 1431, 2512, 1702, 2754, 971, 2454, 1489, 3210, 184 0, 2645, 831, 2267, 1731, 3217, 1374, 2849, 1595, 2457, 949, 3101, 1270, 2618, 1806, 2469, 14 84, 2728, 1000, 3115, 1705, 2279, 1864, 2699, 1435, 3392, 892, 2410, 1650, 2881, 1490, 3616, 1692, 2359, 763, 2659, 1389, 3170, 1813, 2296, 1273, 2646, 973, 2417, 1623, 3160, 1733, 283 6, 1464, 2458, 950, 3212, 1924, 2620, 1395, 2383, 1652, 3102, 509, 2649, 2238, 1827, 3337, 14 47, 2756, 1706, 2412, 979, 3218, 1505, 2850, 1597, 2528, 1274, 2269, 953, 3143, 1818, 2470, 1 713, 2701, 1437, 3233, 1008, 2499, 1627, 2661, 3587, 1390, 2363, 1872, 2840, 974, 3117, 173 4, 2283, 1397, 2707, 1829, 3334, 759, 2473, 1492, 2736, 1708, 3172, 1451, 2418, 2702, 863, 31 23, 1656, 2460, 1817, 2852, 1276, 3220, 981, 2270, 1737, 2591, 1506, 2391, 1814, 3118, 2760, 1598, 2501, 954, 3345, 1496, 2823, 1928, 2285, 1438, 3840, 995, 2650, 1679, 2420, 3147, 163 9, 2709, 1398, 2474, 879, 3176, 1830, 2945, 1714, 2365, 1247, 3234, 2662, 982, 2291, 1888, 33 38, 1453, 2665, 1629, 2723, 1738, 3125, 956, 2481, 3265, 1401, 2882, 1859, 2395, 1479, 3224, 985, 2652, 1643, 2502, 1833, 3589, 2607, 1459, 2286, 1716, 3149, 510, 2827, 1936, 2476, 334 6, 1508, 2768, 1687, 2424, 765, 3236, 1454, 2710, 1745, 2505, 3126, 1820, 2856, 1263, 2366, 9 97, 3155, 1630, 2713, 1861, 2293, 3456, 1402, 2725, 1740, 3648, 927, 2447, 1483, 2884, 3129, 1834, 2666, 1691, 2407, 887, 3184, 1343, 2615, 2482, 1841, 3207, 1746, 2946, 1461, 2175, 98 6, 3340, 2673, 1645, 2397, 1866, 3150, 1512, 2714, 3266, 1720, 2506, 998, 2835, 1404, 3593, 1 952, 2639, 2411, 1651, 3157, 1275, 2668, 1001, 2239, 3361, 1984, 2829, 1703, 3130, 1485, 24 84, 1862, 2784, 3240, 943, 2455, 1761, 2726, 1462, 3211, 2513, 1836, 3393, 891, 2864, 1693, 2 755, 3590, 1491, 2398, 1923, 2619, 1646, 3171, 2294, 988, 3158, 1465, 2830, 1873, 2508, 334 8, 1653, 2729, 1520, 2888, 1748, 3132, 2459, 766, 3161, 1486, 2674, 1842, 2514, 3601, 1707, 2 716, 1271, 2413, 3268, 951, 2837, 1865, 3362, 1762, 2297, 2647, 1375, 3213, 1807, 2757, 100 2, 2488, 3173, 1752, 2948, 1925, 3352, 2419, 1493, 2676, 1694, 3219, 893, 2851, 3594, 1844, 2 471, 1466, 2730, 3248, 1654, 2529, 1815, 2621, 1507, 3214, 2298, 1009, 3364, 1709, 2842, 27 37, 1926, 3103, 1391, 2461, 3272, 1657, 2651, 975, 2414, 1868, 3602, 2896, 1494, 3335, 1735, 2758, 2421, 1715, 3162, 955, 2853, 3221, 1468, 2516, 1764, 2732, 3457, 1929, 2475, 1497, 37 12, 2680, 1710, 2841, 511, 3174, 2300, 1874, 3177, 1658, 2761, 2530, 1277, 3235, 1848, 2838, 3394, 1739, 2622, 1004, 2520, 3164, 1509, 2952, 1819, 3596, 2462, 1599, 3119, 1439, 2703, 2 663, 1889, 3339, 894, 2422, 3280, 1717, 2854, 1831, 2738, 3222, 1399, 2271, 1768, 3617, 291 2, 1010, 2477, 1876, 3368, 2653, 1498, 3225, 2762, 1930, 3237, 1660, 2425, 2883, 1510, 3396, 1012, 2503, 3649, 1937, 2667, 1741, 2857, 3178, 1821, 2483, 3127, 1513, 2740, 1718, 3458, 2 960, 957, 2532, 1835, 3185, 2711, 1455, 3226, 2478, 1747, 3604, 1890, 2769, 2844, 1721, 334 7, 1403, 2287, 3151, 983, 2654, 3180, 1880, 2885, 1776, 2426, 3618, 1500, 2764, 3341, 1932, 2 507, 1742, 3296, 2858, 767, 3238, 2715, 1822, 2367, 1278, 3376, 2865, 1631, 3608, 2770, 193 8, 3267, 1863, 2485, 2669, 987, 3131, 2890, 1463, 3342, 1749, 2536, 3241, 1953, 2744, 3620, 1 722, 2428, 1514, 2976, 3400, 1837, 2675, 3186, 999, 2299, 1763, 3228, 3008, 1405, 3349, 272 7, 1892, 2509, 3841, 1647, 2886, 1843, 3159, 2785, 1521, 3269, 2486, 1016, 3460, 2860, 1940, 2717, 1750, 3591, 2515, 1838, 3188, 2947, 1487, 3363, 2670, 1724, 3242, 2489, 958, 3133, 18 67, 2897, 3713, 1753, 2677, 2544, 1467, 3354, 2772, 1896, 3249, 1954, 2510, 3163, 1765, 286 6, 3650, 1516, 2731, 3408, 989, 2295, 3270, 1845, 2889, 2786, 1695, 3365, 1985, 2399, 3244, 1 406, 2831, 3595, 1944, 2776, 3192, 1655, 2949, 3353, 1003, 2517, 3273, 1869, 2718, 3624, 15 22, 2868, 1754, 2490, 3350, 1956, 2678, 3134, 1766, 2839, 3464, 1846, 2531, 3652, 990, 2733, 3215, 1524, 2950, 3175, 1875, 2415, 3366, 1769, 2681, 3714, 1849, 2892, 3250, 1469, 2518, 3 424, 1904, 2759, 3165, 1711, 2739, 1005, 2492, 3603, 1927, 2788, 3274, 1495, 2953, 3395, 16 59, 2521, 3179, 1870, 2734, 3597, 1986, 2898, 3369, 1756, 2682, 3252, 1279, 2301, 3472, 101 1, 2872, 3632, 1877, 2763, 3223, 1719, 2533, 3281, 1850, 2843, 3356, 1499, 2623, 3598, 1960, 2463, 3166, 2913, 1770, 3397, 2741, 1931, 3276, 2855, 1006, 3656, 2423, 1891, 3370, 2792, 1 511, 3227, 2900, 1661, 3842, 2522, 1878, 3377, 2954, 1852, 3282, 2684, 1777, 3181, 2534, 15 28, 3605, 2961, 1013, 3402, 2765, 1881, 3256, 2845, 3488, 1743, 2537, 3716, 1988, 2742, 318 7, 1933, 2859, 3520, 1470, 2479, 3619, 1723, 2771, 3239, 1893, 2914, 2745, 2427, 1939, 3398, 2904, 895, 3297, 2800, 1501, 3610, 2524, 1772, 3372, 2956, 1968, 3229, 2766, 3664, 1934, 28 46, 3459, 1662, 2302, 3182, 1823, 2655, 3409, 1515, 2962, 3621, 1992, 2887, 3189, 2487, 959, 3284, 2773, 1778, 3609, 2977, 1882, 3378, 2746, 3243, 1941, 2538, 3401, 1502, 2861, 3606, 1 780, 2787, 3298, 1894, 2429, 3343, 2916, 1897, 3720, 2671, 1725, 3288, 2867, 1014, 3461, 25 45, 3844, 1517, 2964, 3230, 1955, 2774, 3380, 2862, 1884, 3622, 2511, 1751, 3190, 2748, 183 9, 3351, 2891, 3245, 2000, 2777, 3680, 1523, 2491, 3462, 1942, 3193, 2920, 3651, 1755, 2978, 3404, 1017, 2789, 3271, 2540, 1945, 3625, 2869, 1957, 3251, 2719, 3300, 1767, 3009, 3728, 1 518, 2430, 3465, 2968, 1898, 3246, 2679, 1847, 3612, 2893, 3410, 1784, 2546, 3194, 1905, 36 53, 2778, 3384, 1525, 2980, 3275, 1018, 2790, 3355, 2870, 1946, 3626, 2548, 1871, 3135, 289 9, 3425, 1726, 2793, 3848, 1900, 3253, 2873, 3367, 2016, 2493, 3633, 2928, 1757, 3304, 2735, 1407, 3412, 2951, 3658, 1958, 2519, 3466, 1987, 3744, 2683, 3196, 1851, 2894, 3473, 3010, 1 020, 3776, 2780, 1771, 3277, 2303, 3357, 1961, 3654, 2901, 3254, 1471, 2743, 3371, 2874, 19 06, 3628, 2523, 1948, 3283, 2984, 3426, 1758, 3856, 2794, 3257, 1879, 2955, 3416, 2915, 198 9, 3715, 2535, 1773, 3312, 3468, 2685, 1526, 3665, 2902, 3278, 991, 2876, 3358, 2801, 1908, 3 634, 3167, 1962, 2552, 3657, 2905, 1853, 3474, 2767, 3399, 1779, 3599, 3012, 3285, 1969, 29 57, 3489, 2494, 1883, 3717, 2747, 3258, 1529, 3872, 2917, 3373, 1990, 2963, 3299, 2525, 177 4, 3636, 3428, 2796, 1964, 3183, 2992, 3607, 1912, 2958, 3379, 3718, 1993, 2686, 3476, 2847, 1007, 3286, 3660, 2539, 1854, 3374, 3016, 3260, 1530, 2802, 3721, 3403, 1781, 2906, 3666, 2 965, 1935, 3289, 2526, 3432, 1895, 3843, 2804, 3490, 1970, 2918, 3301, 3640, 1663, 2921, 33 81, 2749, 1885, 3611, 3231, 2541, 1994, 3521, 2979, 3681, 1532, 2908, 3480, 3623, 1899, 277 5, 3191, 2863, 3405, 1727, 3845, 3024, 3290, 1019, 2547, 3668, 3492, 1972, 2966, 3302, 2779, 1943, 3722, 3382, 2969, 3729, 2001, 2981, 3411, 3613, 1886, 2791, 3305, 2542, 1782, 3385, 3 627, 2922, 1503, 3440, 2871, 3904, 3247, 1996, 2808, 3463, 3682, 1947, 2929, 3195, 2549, 20 02, 3672, 3406, 2970, 3522, 1901, 2895, 3724, 3292, 1785, 2750, 3614, 2924, 3413, 1976, 384 9, 3040, 3255, 1907, 3386, 2781, 3730, 2431, 1959, 3496, 3655, 2982, 1015, 3306, 3745, 3011, 3467, 1519, 2875, 3629, 3427, 2017, 2795, 3197, 3846, 2985, 1786, 3414, 2495, 3684, 1949, 3 388, 2930, 3635, 3313, 1902, 2972, 3417, 2782, 3732, 1909, 3279, 2903, 3630, 2004, 3524, 30 13, 3857, 2797, 1963, 3469, 3659, 2550, 3259, 1788, 3429, 2932, 3688, 1531, 3475, 2986, 374 6, 3308, 2018, 2877, 3850, 2803, 3504, 2008, 3637, 2993, 3470, 3777, 1950, 2907, 3198, 3736, 2553, 1910, 3359, 3528, 3014, 3661, 1759, 2798, 3314, 3858, 2988, 1021, 3418, 3748, 2936, 1 965, 3477, 3638, 3017, 3316, 1913, 3667, 2878, 3430, 3968, 1991, 2554, 3433, 3641, 2805, 19 71, 3261, 3696, 2959, 3491, 2020, 3719, 2919, 3420, 2994, 3287, 1527, 3852, 2687, 3375, 366 2, 1966, 2909, 3536, 3778, 3018, 1775, 3478, 3669, 2556, 3291, 1914, 3873, 2923, 3481, 3642, 1995, 2751, 3493, 3752, 3303, 2996, 1855, 3723, 3434, 2967, 3905, 1973, 3383, 3025, 3683, 3 320, 2024, 2910, 3670, 3441, 2806, 3860, 1916, 3482, 2527, 3644, 3407, 1787, 3020, 3673, 32 62, 2971, 1997, 3780, 3436, 3026, 3874, 3552, 1974, 3293, 2925, 3494, 3725, 1533, 2809, 352 3, 3685, 3000, 3387, 2003, 3864, 2931, 3307, 3731, 2983, 1022, 3497, 3760, 3442, 2543, 1977, 3726, 3484, 3041, 3876, 3294, 2032, 2810, 3615, 3415, 2973, 3784, 1998, 3525, 3847, 2926, 3 309, 3674, 1783, 2933, 3444, 3733, 3498, 1887, 3028, 3969, 3389, 2987, 3686, 2005, 3315, 28 12, 3689, 3747, 3505, 1978, 2555, 3906, 3419, 3042, 3676, 2019, 3526, 3631, 3032, 3310, 385 1, 1903, 2974, 3500, 3792, 3448, 2934, 2006, 3734, 3529, 2783, 3880, 3390, 1980, 3737, 2989, 3317, 3749, 2937, 3471, 2009, 3908, 3690, 3015, 3431, 3639, 1534, 2995, 3506, 3970, 3199, 3 044, 1789, 3697, 3421, 3738, 2551, 3530, 3859, 2021, 2990, 3663, 3435, 3692, 2799, 1951, 32 63, 3853, 3508, 2938, 3808, 3479, 1911, 3750, 3019, 3537, 3888, 2879, 2010, 3779, 3422, 364 3, 2997, 3318, 3854, 2022, 3532, 3048, 3753, 3912, 3483, 2940, 2025, 3698, 3538, 3740, 2811, 3437, 3861, 1967, 3321, 3021, 3671, 3781, 3512, 1915, 2998, 3972, 3443, 3700, 2557, 3875, 2 012, 3495, 3754, 3027, 3553, 3645, 3322, 3001, 1023, 3866, 3761, 3485, 3056, 3675, 3438, 17 90, 3920, 3022, 3782, 3445, 3877, 2807, 1975, 3540, 3756, 3499, 2911, 3704, 3865, 2026, 332 4, 3029, 3785, 3554, 3862, 3646, 3002, 1917, 3544, 3976, 3486, 3043, 3727, 3687, 2033, 3446, 2927, 3878, 3762, 3295, 3030, 3936, 1999, 3501, 3677, 3786, 3004, 3449, 3907, 3527, 1979, 3 033, 3691, 3881, 3507, 3764, 2558, 3984, 1535, 3556, 3735, 2813, 3502, 3793, 3868, 3311, 20 28, 3045, 3678, 3909, 3450, 3788, 2975, 3531, 1918, 3882, 3739, 2935, 3391, 3889, 3794, 350 9, 2034, 3034, 3693, 3914, 3560, 3768, 3046, 3452, 2036, 4000, 3699, 3323, 3049, 4032, 3751, 3533, 3910, 1981, 2991, 3809, 3510, 3884, 2939, 3741, 3539, 3971, 2007, 3694, 3036, 3513, 3 921, 3701, 3568, 3796, 1791, 2814, 3534, 3890, 3755, 3319, 2999, 3913, 3810, 3423, 2011, 38 55, 3050, 3800, 3973, 3541, 3742, 2941, 3892, 2023, 3514, 3702, 3863, 3555, 3057, 3757, 397 4, 3439, 2040, 3705, 3023, 3916, 3542, 3783, 3763, 3003, 3516, 3812, 1982, 3977, 3545, 3758, 2559, 3922, 3706, 3325, 3896, 3787, 2013, 3052, 3557, 3867, 3647, 3487, 3937, 2942, 3765, 3 879, 2027, 3447, 3816, 3058, 3924, 3546, 3978, 3708, 3558, 3060, 2014, 3985, 3789, 3869, 35 61, 3766, 3005, 3883, 3503, 3795, 3938, 2029, 3769, 3451, 3031, 3928, 3824, 3548, 3980, 379 0, 2815, 3870, 2035, 3326, 3679, 3986, 3911, 3035, 3511, 3797, 4001, 3770, 3562, 2030, 3885, 3047, 3811, 3453, 3940, 3695, 3891, 3569, 3064, 3988, 3798, 2037, 3886, 3535, 3772, 3006, 3 915, 3801, 3515, 3944, 4002, 3813, 3564, 1919, 3037, 3893, 3743, 4033, 3454, 3992, 3703, 30 51, 3917, 3570, 3802, 4004, 1983, 3814, 3894, 3038, 3572, 3923, 3817, 3897, 3517, 3952, 375 9, 3053, 3975, 2038, 3543, 3707, 3918, 4034, 3804, 3327, 3059, 3925, 3767, 3898, 3547, 4008, 2041, 3818, 3979, 3054, 3939, 3559, 3709, 3926, 3900, 3825, 3576, 3061, 3929, 3791, 4036, 2 042, 3981, 3518, 3771, 3941, 3987, 2943, 3549, 3820, 4016, 3982, 3710, 3871, 3563, 4040, 20 44, 3007, 3826, 3930, 3989, 3550, 3828, 3942, 3945, 3773, 3062, 3565, 4003, 3932, 3799, 388 7, 2015, 4048, 3571, 3990, 3803, 3065, 3993, 4005, 3815, 3566, 3946, 3895, 3832, 3953, 3573, 3066, 3994, 2031, 3919, 3774, 3948, 4064, 3805, 3455, 4006, 4035, 3899, 3068, 3819, 4009, 3 519, 3954, 3996, 3806, 3927, 2043, 4037, 3821, 3574, 3039, 3956, 4010, 3901, 3827, 4017, 39 31, 3577, 4038, 3822, 4012, 3960, 4041, 3055, 3902, 3578, 3829, 2039, 3983, 3943, 4018, 371 1, 3933, 4042, 3580, 3947, 3775, 3067, 4020, 3991, 4049, 3934, 3830, 3551, 4044, 3995, 4050, 3949, 3833, 2045, 4024, 3955, 4007, 3063, 3567, 4065, 3834, 3997, 3950, 3957, 4052, 4011, 3 836, 3579, 4066, 4056, 3998, 3958, 3807, 3069, 4013, 3961, 4039, 4019, 4068, 2046, 3575, 40 14, 3823, 3962, 4043, 3903, 4021, 4072, 3964, 3835, 4045, 4022, 3581, 4051, 3070, 4025, 408 0, 4046, 3831, 3935, 4053, 4026, 4067, 3951, 4054, 4028, 4057, 3582, 3837, 4069, 3999, 3959, 2047, 4058, 4070, 4073, 4015, 3963, 4060, 3071, 3838, 4023, 4074, 3965, 4081, 4047, 4027, 3 583, 4076, 3966, 4082, 4084, 4029, 4055, 3839, 4059, 4071, 4088, 4030, 4061, 4075, 4062, 40 77, 4083, 4078, 4085, 3967, 4031, 4086, 4089, 4090, 4092, 4063, 4079, 4091, 4087, 4093, 409 4, 4095]

TABLE Q18 with a sequence length of 4096:

| Reliabilily or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 256 |
| 9 | 512 |
| 10 | 1024 |
| 11 | 2048 |
| 12 | 5 |
| 13 | 64 |
| 14 | 9 |
| 15 | 6 |
| 16 | 17 |
| 17 | 10 |
| 18 | 18 |
| 19 | 128 |
| 20 | 12 |
| 21 | 33 |
| 22 | 65 |
| 23 | 20 |
| 24 | 34 |
| 25 | 24 |
| 26 | 36 |
| 27 | 257 |
| 28 | 7 |
| 29 | 129 |
| 30 | 66 |
| 31 | 11 |
| 32 | 40 |
| 33 | 68 |
| 34 | 513 |
| 35 | 130 |
| 36 | 19 |
| 37 | 13 |
| 38 | 48 |
| 39 | 14 |
| 40 | 1025 |
| 41 | 72 |

TABLE Q18-continued

| with a sequence length of 4096: | |
|---|---|
| Reliabilily or reliability sequence number | Polarized channel sequence number |
| 42 | 258 |
| 43 | 21 |
| 44 | 132 |
| 45 | 35 |
| 46 | 2049 |
| 47 | 26 |
| 48 | 80 |
| 49 | 37 |
| 50 | 25 |
| 51 | 22 |
| 52 | 136 |
| 53 | 514 |
| 54 | 260 |
| 55 | 38 |
| 56 | 96 |
| 57 | 67 |
| 58 | 41 |
| 59 | 144 |
| 60 | 28 |
| 61 | 69 |
| 62 | 42 |
| 63 | 264 |
| 64 | 49 |
| 65 | 74 |
| 66 | 1026 |
| 67 | 160 |
| 68 | 516 |
| 69 | 192 |
| 70 | 70 |
| 71 | 44 |
| 72 | 272 |
| 73 | 131 |
| 74 | 81 |
| 75 | 50 |
| 76 | 73 |
| 77 | 15 |
| 78 | 133 |
| 79 | 2050 |
| 80 | 288 |
| 81 | 520 |
| 82 | 52 |
| 83 | 23 |
| 84 | 134 |
| 85 | 76 |
| 86 | 1028 |
| 87 | 137 |
| 88 | 82 |
| 89 | 259 |
| 90 | 56 |
| 91 | 27 |
| 92 | 97 |
| 93 | 528 |
| 94 | 39 |
| 95 | 261 |
| 96 | 84 |
| 97 | 138 |
| 98 | 145 |
| 99 | 29 |
| 100 | 43 |
| 101 | 320 |
| 102 | 1032 |
| 103 | 544 |
| 104 | 98 |
| 105 | 2052 |
| 106 | 88 |
| 107 | 140 |
| 108 | 30 |
| 109 | 265 |
| 110 | 146 |
| 111 | 71 |
| 112 | 161 |
| 113 | 515 |
| 114 | 45 |
| 115 | 262 |
| 116 | 100 |

TABLE Q18-continued

| with a sequence length of 4096: | |
|---|---|
| Reliabilily or reliability sequence number | Polarized channel sequence number |
| 117 | 51 |
| 118 | 1040 |
| 119 | 148 |
| 120 | 46 |
| 121 | 273 |
| 122 | 768 |
| 123 | 75 |
| 124 | 104 |
| 125 | 162 |
| 126 | 266 |
| 127 | 53 |
| 128 | 2056 |
| 129 | 193 |
| 130 | 152 |
| 131 | 517 |
| 132 | 77 |
| 133 | 1056 |
| 134 | 274 |
| 135 | 164 |
| 136 | 54 |
| 137 | 83 |
| 138 | 384 |
| 139 | 576 |
| 140 | 57 |
| 141 | 112 |
| 142 | 135 |
| 143 | 268 |
| 144 | 78 |
| 145 | 1027 |
| 146 | 194 |
| 147 | 521 |
| 148 | 2064 |
| 149 | 85 |
| 150 | 289 |
| 151 | 58 |
| 152 | 168 |
| 153 | 139 |
| 154 | 321 |
| 155 | 518 |
| 156 | 99 |
| 157 | 1280 |
| 158 | 86 |
| 159 | 276 |
| 160 | 60 |
| 161 | 89 |
| 162 | 529 |
| 163 | 196 |
| 164 | 290 |
| 165 | 141 |
| 166 | 2080 |
| 167 | 101 |
| 168 | 280 |
| 169 | 1536 |
| 170 | 147 |
| 171 | 522 |
| 172 | 176 |
| 173 | 142 |
| 174 | 292 |
| 175 | 31 |
| 176 | 200 |
| 177 | 530 |
| 178 | 263 |
| 179 | 1029 |
| 180 | 90 |
| 181 | 149 |
| 182 | 385 |
| 183 | 2051 |
| 184 | 640 |
| 185 | 102 |
| 186 | 105 |
| 187 | 163 |
| 188 | 322 |
| 189 | 92 |
| 190 | 1088 |
| 191 | 524 |

TABLE Q18-continued

| with a sequence length of 4096: | |
|---|---|
| Reliabilily or reliability sequence number | Polarized channel sequence number |
| 192 | 47 |
| 193 | 267 |
| 194 | 208 |
| 195 | 150 |
| 196 | 545 |
| 197 | 296 |
| 198 | 153 |
| 199 | 2304 |
| 200 | 165 |
| 201 | 1033 |
| 202 | 324 |
| 203 | 577 |
| 204 | 106 |
| 205 | 55 |
| 206 | 386 |
| 207 | 113 |
| 208 | 154 |
| 209 | 1030 |
| 210 | 532 |
| 211 | 275 |
| 212 | 79 |
| 213 | 108 |
| 214 | 2560 |
| 215 | 546 |
| 216 | 269 |
| 217 | 224 |
| 218 | 166 |
| 219 | 1041 |
| 220 | 304 |
| 221 | 536 |
| 222 | 195 |
| 223 | 59 |
| 224 | 270 |
| 225 | 169 |
| 226 | 548 |
| 227 | 1034 |
| 228 | 328 |
| 229 | 3072 |
| 230 | 114 |
| 231 | 156 |
| 232 | 277 |
| 233 | 769 |
| 234 | 87 |
| 235 | 197 |
| 236 | 1042 |
| 237 | 388 |
| 238 | 519 |
| 239 | 116 |
| 240 | 291 |
| 241 | 170 |
| 242 | 2053 |
| 243 | 61 |
| 244 | 641 |
| 245 | 1152 |
| 246 | 282 |
| 247 | 177 |
| 248 | 91 |
| 249 | 578 |
| 250 | 336 |
| 251 | 198 |
| 252 | 293 |
| 253 | 1036 |
| 254 | 172 |
| 255 | 523 |
| 256 | 2112 |
| 257 | 120 |
| 258 | 281 |
| 259 | 201 |
| 260 | 552 |
| 261 | 1057 |
| 262 | 278 |
| 263 | 62 |
| 264 | 392 |
| 265 | 580 |
| 266 | 143 |

TABLE Q18-continued

| with a sequence length of 4096: | |
|---|---|
| Reliabilily or reliability sequence number | Polarized channel sequence number |
| 267 | 103 |
| 268 | 2057 |
| 269 | 294 |
| 270 | 1089 |
| 271 | 642 |
| 272 | 178 |
| 273 | 352 |
| 274 | 93 |
| 275 | 531 |
| 276 | 202 |
| 277 | 1044 |
| 278 | 323 |
| 279 | 107 |
| 280 | 2054 |
| 281 | 525 |
| 282 | 297 |
| 283 | 180 |
| 284 | 1058 |
| 285 | 400 |
| 286 | 560 |
| 287 | 151 |
| 288 | 209 |
| 289 | 284 |
| 290 | 526 |
| 291 | 1048 |
| 292 | 2065 |
| 293 | 94 |
| 294 | 325 |
| 295 | 204 |
| 296 | 584 |
| 297 | 298 |
| 298 | 155 |
| 299 | 1060 |
| 300 | 770 |
| 301 | 305 |
| 302 | 210 |
| 303 | 2058 |
| 304 | 109 |
| 305 | 533 |
| 306 | 1281 |
| 307 | 330 |
| 308 | 184 |
| 309 | 416 |
| 310 | 644 |
| 311 | 115 |
| 312 | 1031 |
| 313 | 448 |
| 314 | 2066 |
| 315 | 547 |
| 316 | 167 |
| 317 | 326 |
| 318 | 225 |
| 319 | 538 |
| 320 | 1153 |
| 321 | 300 |
| 322 | 157 |
| 323 | 592 |
| 324 | 387 |
| 325 | 2176 |
| 326 | 110 |
| 327 | 1090 |
| 328 | 337 |
| 329 | 549 |
| 330 | 117 |
| 331 | 212 |
| 332 | 537 |
| 333 | 1035 |
| 334 | 306 |
| 335 | 2060 |
| 336 | 171 |
| 337 | 329 |
| 338 | 534 |
| 339 | 226 |
| 340 | 1064 |
| 341 | 271 |

TABLE Q18-continued

| with a sequence length of 4096: | |
|---|---|
| Reliabilily or reliability sequence number | Polarized channel sequence number |
| 342 | 648 |
| 343 | 216 |
| 344 | 389 |
| 345 | 2081 |
| 346 | 1092 |
| 347 | 772 |
| 348 | 158 |
| 349 | 308 |
| 350 | 550 |
| 351 | 118 |
| 352 | 1537 |
| 353 | 279 |
| 354 | 173 |
| 355 | 2113 |
| 356 | 608 |
| 357 | 390 |
| 358 | 121 |
| 359 | 1154 |
| 360 | 579 |
| 361 | 332 |
| 362 | 199 |
| 363 | 553 |
| 364 | 1043 |
| 365 | 2068 |
| 366 | 179 |
| 367 | 228 |
| 368 | 656 |
| 369 | 393 |
| 370 | 1037 |
| 371 | 174 |
| 372 | 540 |
| 373 | 338 |
| 374 | 2082 |
| 375 | 122 |
| 376 | 581 |
| 377 | 1072 |
| 378 | 312 |
| 379 | 203 |
| 380 | 283 |
| 381 | 554 |
| 382 | 1038 |
| 383 | 63 |
| 384 | 2072 |
| 385 | 353 |
| 386 | 776 |
| 387 | 181 |
| 388 | 1096 |
| 389 | 295 |
| 390 | 561 |
| 391 | 232 |
| 392 | 340 |
| 393 | 2084 |
| 394 | 1282 |
| 395 | 586 |
| 396 | 394 |
| 397 | 672 |
| 398 | 124 |
| 399 | 401 |
| 400 | 1045 |
| 401 | 2305 |
| 402 | 704 |
| 403 | 205 |
| 404 | 285 |
| 405 | 582 |
| 406 | 1156 |
| 407 | 182 |
| 408 | 299 |
| 409 | 556 |
| 410 | 2055 |
| 411 | 211 |
| 412 | 1059 |
| 413 | 354 |
| 414 | 784 |
| 415 | 185 |
| 416 | 1050 |

TABLE Q18-continued

| with a sequence length of 4096: | |
|---|---|
| Reliabilily or reliability sequence number | Polarized channel sequence number |
| 417 | 344 |
| 418 | 643 |
| 419 | 2177 |
| 420 | 240 |
| 421 | 396 |
| 422 | 1104 |
| 423 | 593 |
| 424 | 206 |
| 425 | 286 |
| 426 | 562 |
| 427 | 2114 |
| 428 | 1061 |
| 429 | 95 |
| 430 | 585 |
| 431 | 402 |
| 432 | 327 |
| 433 | 1049 |
| 434 | 527 |
| 435 | 2059 |
| 436 | 213 |
| 437 | 417 |
| 438 | 1046 |
| 439 | 645 |
| 440 | 186 |
| 441 | 800 |
| 442 | 301 |
| 443 | 2088 |
| 444 | 1160 |
| 445 | 227 |
| 446 | 564 |
| 447 | 356 |
| 448 | 111 |
| 449 | 1538 |
| 450 | 535 |
| 451 | 2116 |
| 452 | 307 |
| 453 | 646 |
| 454 | 1284 |
| 455 | 404 |
| 456 | 214 |
| 457 | 588 |
| 458 | 302 |
| 459 | 2561 |
| 460 | 1062 |
| 461 | 188 |
| 462 | 649 |
| 463 | 331 |
| 464 | 1120 |
| 465 | 594 |
| 466 | 217 |
| 467 | 2178 |
| 468 | 360 |
| 469 | 771 |
| 470 | 1091 |
| 471 | 418 |
| 472 | 229 |
| 473 | 568 |
| 474 | 1065 |
| 475 | 2067 |
| 476 | 309 |
| 477 | 539 |
| 478 | 159 |
| 479 | 1168 |
| 480 | 449 |
| 481 | 609 |
| 482 | 2061 |
| 483 | 408 |
| 484 | 551 |
| 485 | 1052 |
| 486 | 119 |
| 487 | 333 |
| 488 | 773 |
| 489 | 1093 |
| 490 | 2096 |
| 491 | 218 |

TABLE Q18-continued

| with a sequence length of 4096: | |
|---|---|
| Reliabilily or reliability sequence number | Polarized channel sequence number |
| 492 | 596 |
| 493 | 420 |
| 494 | 1066 |
| 495 | 230 |
| 496 | 650 |
| 497 | 2062 |
| 498 | 310 |
| 499 | 1288 |
| 500 | 657 |
| 501 | 339 |
| 502 | 541 |
| 503 | 1073 |
| 504 | 3073 |
| 505 | 233 |
| 506 | 313 |
| 507 | 555 |
| 508 | 1098 |
| 509 | 368 |
| 510 | 832 |
| 511 | 175 |
| 512 | 2120 |
| 513 | 1184 |
| 514 | 391 |
| 515 | 610 |
| 516 | 123 |
| 517 | 1540 |
| 518 | 600 |
| 519 | 2306 |
| 520 | 334 |
| 521 | 450 |
| 522 | 1216 |
| 523 | 652 |
| 524 | 220 |
| 525 | 542 |
| 526 | 2069 |
| 527 | 1094 |
| 528 | 341 |
| 529 | 777 |
| 530 | 183 |
| 531 | 1068 |
| 532 | 2180 |
| 533 | 314 |
| 534 | 658 |
| 535 | 424 |
| 536 | 1296 |
| 537 | 583 |
| 538 | 234 |
| 539 | 2083 |
| 540 | 673 |
| 541 | 1155 |
| 542 | 395 |
| 543 | 557 |
| 544 | 355 |
| 545 | 1105 |
| 546 | 2074 |
| 547 | 125 |
| 548 | 774 |
| 549 | 342 |
| 550 | 1074 |
| 551 | 612 |
| 552 | 316 |
| 553 | 2128 |
| 554 | 563 |
| 555 | 1097 |
| 556 | 241 |
| 557 | 345 |
| 558 | 660 |
| 559 | 2085 |
| 560 | 1039 |
| 561 | 207 |
| 562 | 558 |
| 563 | 1157 |
| 564 | 452 |
| 565 | 785 |
| 566 | 2073 |

TABLE Q18-continued

| with a sequence length of 4096: | |
|---|---|
| Reliabilily or reliability sequence number | Polarized channel sequence number |
| 567 | 397 |
| 568 | 1312 |
| 569 | 587 |
| 570 | 187 |
| 571 | 357 |
| 572 | 2070 |
| 573 | 1544 |
| 574 | 616 |
| 575 | 403 |
| 576 | 1076 |
| 577 | 674 |
| 578 | 236 |
| 579 | 2184 |
| 580 | 778 |
| 581 | 1047 |
| 582 | 432 |
| 583 | 565 |
| 584 | 398 |
| 585 | 2562 |
| 586 | 1158 |
| 587 | 705 |
| 588 | 126 |
| 589 | 1100 |
| 590 | 664 |
| 591 | 2308 |
| 592 | 287 |
| 593 | 456 |
| 594 | 1161 |
| 595 | 589 |
| 596 | 242 |
| 597 | 1106 |
| 598 | 2086 |
| 599 | 786 |
| 600 | 346 |
| 601 | 676 |
| 602 | 1283 |
| 603 | 405 |
| 604 | 2144 |
| 605 | 566 |
| 606 | 1080 |
| 607 | 244 |
| 608 | 595 |
| 609 | 358 |
| 610 | 2115 |
| 611 | 1051 |
| 612 | 896 |
| 613 | 361 |
| 614 | 1121 |
| 615 | 569 |
| 616 | 2089 |
| 617 | 189 |
| 618 | 624 |
| 619 | 1552 |
| 620 | 419 |
| 621 | 647 |
| 622 | 2192 |
| 623 | 1063 |
| 624 | 348 |
| 625 | 215 |
| 626 | 780 |
| 627 | 1285 |
| 628 | 2076 |
| 629 | 303 |
| 630 | 590 |
| 631 | 1108 |
| 632 | 464 |
| 633 | 706 |
| 634 | 2117 |
| 635 | 406 |
| 636 | 1162 |
| 637 | 597 |
| 638 | 219 |
| 639 | 1169 |
| 640 | 2090 |
| 641 | 801 |

TABLE Q18-continued

| with a sequence length of 4096: | |
|---|---|
| Reliabilily or reliability sequence number | Polarized channel sequence number |
| 642 | 409 |
| 643 | 1053 |
| 644 | 570 |
| 645 | 2312 |
| 646 | 421 |
| 647 | 680 |
| 648 | 1067 |
| 649 | 231 |
| 650 | 651 |
| 651 | 2097 |
| 652 | 1344 |
| 653 | 362 |
| 654 | 833 |
| 655 | 1568 |
| 656 | 311 |
| 657 | 2122 |
| 658 | 611 |
| 659 | 1122 |
| 660 | 248 |
| 661 | 598 |
| 662 | 3074 |
| 663 | 369 |
| 664 | 1112 |
| 665 | 788 |
| 666 | 410 |
| 667 | 1164 |
| 668 | 2208 |
| 669 | 572 |
| 670 | 335 |
| 671 | 1054 |
| 672 | 601 |
| 673 | 190 |
| 674 | 2564 |
| 675 | 1289 |
| 676 | 708 |
| 677 | 364 |
| 678 | 1170 |
| 679 | 2240 |
| 680 | 802 |
| 681 | 480 |
| 682 | 221 |
| 683 | 1095 |
| 684 | 422 |
| 685 | 2118 |
| 686 | 653 |
| 687 | 1185 |
| 688 | 451 |
| 689 | 613 |
| 690 | 2092 |
| 691 | 1539 |
| 692 | 315 |
| 693 | 792 |
| 694 | 1069 |
| 695 | 2320 |
| 696 | 235 |
| 697 | 659 |
| 698 | 1286 |
| 699 | 425 |
| 700 | 688 |
| 701 | 2179 |
| 702 | 1124 |
| 703 | 370 |
| 704 | 654 |
| 705 | 1075 |
| 706 | 2129 |
| 707 | 412 |
| 708 | 804 |
| 709 | 1172 |
| 710 | 222 |
| 711 | 2098 |
| 712 | 543 |
| 713 | 343 |
| 714 | 1070 |
| 715 | 712 |
| 716 | 453 |
| 717 | 2121 |
| 718 | 1297 |
| 719 | 775 |
| 720 | 237 |
| 721 | 1792 |
| 722 | 2063 |
| 723 | 602 |
| 724 | 372 |
| 725 | 1099 |
| 726 | 661 |
| 727 | 2181 |
| 728 | 426 |
| 729 | 1128 |
| 730 | 897 |
| 731 | 317 |
| 732 | 2336 |
| 733 | 1186 |
| 734 | 614 |
| 735 | 243 |
| 736 | 1290 |
| 737 | 2568 |
| 738 | 617 |
| 739 | 675 |
| 740 | 1077 |
| 741 | 433 |
| 742 | 1217 |
| 743 | 2100 |
| 744 | 834 |
| 745 | 347 |
| 746 | 1176 |
| 747 | 604 |
| 748 | 2071 |
| 749 | 454 |
| 750 | 1541 |
| 751 | 559 |
| 752 | 238 |
| 753 | 2182 |
| 754 | 1101 |
| 755 | 779 |
| 756 | 428 |
| 757 | 1298 |
| 758 | 2124 |
| 759 | 720 |
| 760 | 376 |
| 761 | 1188 |
| 762 | 662 |
| 763 | 3076 |
| 764 | 457 |
| 765 | 1078 |
| 766 | 808 |
| 767 | 318 |
| 768 | 2185 |
| 769 | 1107 |
| 770 | 665 |
| 771 | 245 |
| 772 | 2130 |
| 773 | 1408 |
| 774 | 677 |
| 775 | 1600 |
| 776 | 399 |
| 777 | 2307 |
| 778 | 836 |
| 779 | 1081 |
| 780 | 618 |
| 781 | 359 |
| 782 | 2104 |
| 783 | 1136 |
| 784 | 567 |
| 785 | 434 |
| 786 | 1159 |
| 787 | 2075 |
| 788 | 898 |
| 789 | 127 |
| 790 | 1292 |
| 791 | 625 |

TABLE Q18-continued

| with a sequence length of 4096: | |
|---|---|
| Reliabilily or reliability sequence number | Polarized channel sequence number |
| 792 | 2145 |
| 793 | 349 |
| 794 | 1102 |
| 795 | 666 |
| 796 | 1218 |
| 797 | 2576 |
| 798 | 458 |
| 799 | 787 |
| 800 | 1545 |
| 801 | 2087 |
| 802 | 591 |
| 803 | 363 |
| 804 | 1109 |
| 805 | 620 |
| 806 | 2309 |
| 807 | 191 |
| 808 | 1313 |
| 809 | 781 |
| 810 | 1082 |
| 811 | 2132 |
| 812 | 436 |
| 813 | 736 |
| 814 | 1192 |
| 815 | 2186 |
| 816 | 407 |
| 817 | 678 |
| 818 | 1163 |
| 819 | 465 |
| 820 | 2193 |
| 821 | 1345 |
| 822 | 816 |
| 823 | 707 |
| 824 | 1542 |
| 825 | 2077 |
| 826 | 350 |
| 827 | 571 |
| 828 | 1123 |
| 829 | 2091 |
| 830 | 246 |
| 831 | 1110 |
| 832 | 782 |
| 833 | 460 |
| 834 | 2368 |
| 835 | 1300 |
| 836 | 681 |
| 837 | 840 |
| 838 | 3080 |
| 839 | 1084 |
| 840 | 411 |
| 841 | 1113 |
| 842 | 626 |
| 843 | 2592 |
| 844 | 466 |
| 845 | 1553 |
| 846 | 668 |
| 847 | 2146 |
| 848 | 365 |
| 849 | 1220 |
| 850 | 789 |
| 851 | 1314 |
| 852 | 2136 |
| 853 | 249 |
| 854 | 599 |
| 855 | 1165 |
| 856 | 2188 |
| 857 | 709 |
| 858 | 440 |
| 859 | 1125 |
| 860 | 900 |
| 861 | 2078 |
| 862 | 1304 |
| 863 | 371 |
| 864 | 628 |
| 865 | 2313 |
| 866 | 1171 |
| 867 | 803 |
| 868 | 1546 |
| 869 | 423 |
| 870 | 2194 |
| 871 | 682 |
| 872 | 1200 |
| 873 | 481 |
| 874 | 2119 |
| 875 | 573 |
| 876 | 1166 |
| 877 | 250 |
| 878 | 2209 |
| 879 | 1316 |
| 880 | 794 |
| 881 | 689 |
| 882 | 1055 |
| 883 | 2563 |
| 884 | 413 |
| 885 | 1224 |
| 886 | 603 |
| 887 | 2093 |
| 888 | 366 |
| 889 | 1554 |
| 890 | 848 |
| 891 | 2310 |
| 892 | 1287 |
| 893 | 710 |
| 894 | 373 |
| 895 | 1114 |
| 896 | 2148 |
| 897 | 805 |
| 898 | 1173 |
| 899 | 468 |
| 900 | 2099 |
| 901 | 684 |
| 902 | 1409 |
| 903 | 427 |
| 904 | 3088 |
| 905 | 1664 |
| 906 | 632 |
| 907 | 793 |
| 908 | 2196 |
| 909 | 1126 |
| 910 | 252 |
| 911 | 1129 |
| 912 | 2094 |
| 913 | 713 |
| 914 | 482 |
| 915 | 1187 |
| 916 | 790 |
| 917 | 2321 |
| 918 | 1346 |
| 919 | 574 |
| 920 | 472 |
| 921 | 2816 |
| 922 | 1116 |
| 923 | 904 |
| 924 | 1548 |
| 925 | 2123 |
| 926 | 414 |
| 927 | 1071 |
| 928 | 655 |
| 929 | 2152 |
| 930 | 615 |
| 931 | 1291 |
| 932 | 374 |
| 933 | 2210 |
| 934 | 1232 |
| 935 | 806 |
| 936 | 690 |
| 937 | 2314 |
| 938 | 1174 |
| 939 | 223 |
| 940 | 1569 |
| 941 | 2101 |

TABLE Q18-continued

| with a sequence length of 4096: | |
|---|---|
| Reliabilily or reliability sequence number | Polarized channel sequence number |
| 942 | 864 |
| 943 | 429 |
| 944 | 1320 |
| 945 | 2241 |
| 946 | 605 |
| 947 | 1177 |
| 948 | 714 |
| 949 | 2200 |
| 950 | 1189 |
| 951 | 377 |
| 952 | 835 |
| 953 | 2565 |
| 954 | 1348 |
| 955 | 455 |
| 956 | 1601 |
| 957 | 2125 |
| 958 | 619 |
| 959 | 809 |
| 960 | 1130 |
| 961 | 3104 |
| 962 | 435 |
| 963 | 1079 |
| 964 | 692 |
| 965 | 2322 |
| 966 | 1410 |
| 967 | 912 |
| 968 | 484 |
| 969 | 2212 |
| 970 | 1137 |
| 971 | 663 |
| 972 | 1178 |
| 973 | 2102 |
| 974 | 430 |
| 975 | 1556 |
| 976 | 721 |
| 977 | 2131 |
| 978 | 796 |
| 979 | 1299 |
| 980 | 239 |
| 981 | 2432 |
| 982 | 1103 |
| 983 | 606 |
| 984 | 1132 |
| 985 | 2624 |
| 986 | 837 |
| 987 | 378 |
| 988 | 1570 |
| 989 | 2105 |
| 990 | 716 |
| 991 | 1293 |
| 992 | 459 |
| 993 | 2160 |
| 994 | 1248 |
| 995 | 810 |
| 996 | 1190 |
| 997 | 2183 |
| 998 | 667 |
| 999 | 319 |
| 1000 | 1328 |
| 1001 | 2316 |
| 1002 | 817 |
| 1003 | 1560 |
| 1004 | 722 |
| 1005 | 2126 |
| 1006 | 1219 |
| 1007 | 437 |
| 1008 | 3075 |
| 1009 | 621 |
| 1010 | 1083 |
| 1011 | 842 |
| 1012 | 2242 |
| 1013 | 1294 |
| 1014 | 488 |
| 1015 | 1193 |
| 1016 | 2569 |

TABLE Q18-continued

| with a sequence length of 4096: | |
|---|---|
| Reliabilily or reliability sequence number | Polarized channel sequence number |
| 1017 | 696 |
| 1018 | 1572 |
| 1019 | 380 |
| 1020 | 2133 |
| 1021 | 928 |
| 1022 | 1352 |
| 1023 | 627 |
| 1024 | 2337 |
| 1025 | 1138 |
| 1026 | 251 |
| 1027 | 2106 |
| 1028 | 1180 |
| 1029 | 960 |
| 1030 | 1301 |
| 1031 | 2216 |
| 1032 | 679 |
| 1033 | 461 |
| 1034 | 1793 |
| 1035 | 2187 |
| 1036 | 838 |
| 1037 | 1111 |
| 1038 | 2369 |
| 1039 | 737 |
| 1040 | 1221 |
| 1041 | 438 |
| 1042 | 2566 |
| 1043 | 1412 |
| 1044 | 812 |
| 1045 | 669 |
| 1046 | 2147 |
| 1047 | 1543 |
| 1048 | 467 |
| 1049 | 1140 |
| 1050 | 3328 |
| 1051 | 899 |
| 1052 | 1315 |
| 1053 | 2134 |
| 1054 | 622 |
| 1055 | 1194 |
| 1056 | 441 |
| 1057 | 2324 |
| 1058 | 1085 |
| 1059 | 849 |
| 1060 | 1665 |
| 1061 | 2108 |
| 1062 | 629 |
| 1063 | 496 |
| 1064 | 2137 |
| 1065 | 1306 |
| 1066 | 724 |
| 1067 | 1201 |
| 1068 | 2577 |
| 1069 | 462 |
| 1070 | 1115 |
| 1071 | 2244 |
| 1072 | 818 |
| 1073 | 1602 |
| 1074 | 683 |
| 1075 | 2338 |
| 1076 | 1360 |
| 1077 | 247 |
| 1078 | 1222 |
| 1079 | 2189 |
| 1080 | 841 |
| 1081 | 738 |
| 1082 | 2149 |
| 1083 | 1317 |
| 1084 | 351 |
| 1085 | 1196 |
| 1086 | 2328 |
| 1087 | 783 |
| 1088 | 1547 |
| 1089 | 3584 |
| 1090 | 728 |
| 1091 | 1144 |

TABLE Q18-continued

| with a sequence length of 4096: | |
|---|---|
| Reliabilily or reliability sequence number | Polarized channel sequence number |
| 1092 | 901 |
| 1093 | 2195 |
| 1094 | 1305 |
| 1095 | 469 |
| 1096 | 2570 |
| 1097 | 1225 |
| 1098 | 670 |
| 1099 | 1576 |
| 1100 | 2224 |
| 1101 | 820 |
| 1102 | 442 |
| 1103 | 2190 |
| 1104 | 1302 |
| 1105 | 630 |
| 1106 | 1086 |
| 1107 | 2340 |
| 1108 | 791 |
| 1109 | 1416 |
| 1110 | 2079 |
| 1111 | 483 |
| 1112 | 1604 |
| 1113 | 685 |
| 1114 | 2248 |
| 1115 | 1167 |
| 1116 | 902 |
| 1117 | 2578 |
| 1118 | 1127 |
| 1119 | 367 |
| 1120 | 1318 |
| 1121 | 2311 |
| 1122 | 633 |
| 1123 | 1666 |
| 1124 | 3077 |
| 1125 | 844 |
| 1126 | 1202 |
| 1127 | 470 |
| 1128 | 2138 |
| 1129 | 1376 |
| 1130 | 711 |
| 1131 | 2197 |
| 1132 | 1117 |
| 1133 | 691 |
| 1134 | 444 |
| 1135 | 2433 |
| 1136 | 1555 |
| 1137 | 740 |
| 1138 | 2688 |
| 1139 | 1226 |
| 1140 | 905 |
| 1141 | 2150 |
| 1142 | 1347 |
| 1143 | 473 |
| 1144 | 1131 |
| 1145 | 2153 |
| 1146 | 686 |
| 1147 | 1549 |
| 1148 | 2211 |
| 1149 | 850 |
| 1150 | 1321 |
| 1151 | 634 |
| 1152 | 2370 |
| 1153 | 1204 |
| 1154 | 253 |
| 1155 | 2140 |
| 1156 | 1424 |
| 1157 | 824 |
| 1158 | 3136 |
| 1159 | 1584 |
| 1160 | 715 |
| 1161 | 1175 |
| 1162 | 2572 |
| 1163 | 485 |
| 1164 | 1233 |
| 1165 | 2095 |
| 1166 | 795 |
| 1167 | 1308 |
| 1168 | 2315 |
| 1169 | 575 |
| 1170 | 1550 |
| 1171 | 415 |
| 1172 | 2256 |
| 1173 | 1118 |
| 1174 | 865 |
| 1175 | 2198 |
| 1176 | 1349 |
| 1177 | 693 |
| 1178 | 2593 |
| 1179 | 1228 |
| 1180 | 807 |
| 1181 | 2344 |
| 1182 | 1608 |
| 1183 | 375 |
| 1184 | 1322 |
| 1185 | 2201 |
| 1186 | 744 |
| 1187 | 1179 |
| 1188 | 2213 |
| 1189 | 852 |
| 1190 | 1794 |
| 1191 | 3081 |
| 1192 | 474 |
| 1193 | 1329 |
| 1194 | 906 |
| 1195 | 2372 |
| 1196 | 1234 |
| 1197 | 636 |
| 1198 | 2625 |
| 1199 | 1133 |
| 1200 | 486 |
| 1201 | 2154 |
| 1202 | 1557 |
| 1203 | 913 |
| 1204 | 2103 |
| 1205 | 1354 |
| 1206 | 717 |
| 1207 | 2434 |
| 1208 | 1208 |
| 1209 | 797 |
| 1210 | 1440 |
| 1211 | 2161 |
| 1212 | 489 |
| 1213 | 1668 |
| 1214 | 2202 |
| 1215 | 694 |
| 1216 | 1139 |
| 1217 | 3078 |
| 1218 | 811 |
| 1219 | 1472 |
| 1220 | 2580 |
| 1221 | 431 |
| 1222 | 1571 |
| 1223 | 2323 |
| 1224 | 723 |
| 1225 | 1191 |
| 1226 | 866 |
| 1227 | 2127 |
| 1228 | 697 |
| 1229 | 379 |
| 1230 | 2156 |
| 1231 | 1350 |
| 1232 | 856 |
| 1233 | 2594 |
| 1234 | 1249 |
| 1235 | 752 |
| 1236 | 2317 |
| 1237 | 1562 |
| 1238 | 476 |
| 1239 | 2272 |
| 1240 | 1324 |
| 1241 | 908 |

TABLE Q18-continued

| with a sequence length of 4096: | |
|---|---|
| Reliabilily or reliability sequence number | Polarized channel sequence number |
| 1242 | 2214 |
| 1243 | 1181 |
| 1244 | 718 |
| 1245 | 1616 |
| 1246 | 3089 |
| 1247 | 798 |
| 1248 | 1411 |
| 1249 | 2352 |
| 1250 | 254 |
| 1251 | 1134 |
| 1252 | 2584 |
| 1253 | 607 |
| 1254 | 1361 |
| 1255 | 2243 |
| 1256 | 914 |
| 1257 | 1573 |
| 1258 | 2107 |
| 1259 | 839 |
| 1260 | 1141 |
| 1261 | 2318 |
| 1262 | 439 |
| 1263 | 1236 |
| 1264 | 2217 |
| 1265 | 725 |
| 1266 | 1561 |
| 1267 | 2596 |
| 1268 | 929 |
| 1269 | 1330 |
| 1270 | 3082 |
| 1271 | 698 |
| 1272 | 1195 |
| 1273 | 2376 |
| 1274 | 490 |
| 1275 | 1353 |
| 1276 | 2162 |
| 1277 | 813 |
| 1278 | 1558 |
| 1279 | 739 |
| 1280 | 2204 |
| 1281 | 1250 |
| 1282 | 381 |
| 1283 | 2325 |
| 1284 | 1295 |
| 1285 | 868 |
| 1286 | 2817 |
| 1287 | 1672 |
| 1288 | 623 |
| 1289 | 2135 |
| 1290 | 1240 |
| 1291 | 819 |
| 1292 | 2245 |
| 1293 | 1413 |
| 1294 | 497 |
| 1295 | 3090 |
| 1296 | 1796 |
| 1297 | 916 |
| 1298 | 2436 |
| 1299 | 1182 |
| 1300 | 726 |
| 1301 | 2567 |
| 1302 | 1332 |
| 1303 | 814 |
| 1304 | 2164 |
| 1305 | 1574 |
| 1306 | 463 |
| 1307 | 2339 |
| 1308 | 1142 |
| 1309 | 700 |
| 1310 | 2218 |
| 1311 | 1303 |
| 1312 | 843 |
| 1313 | 2109 |
| 1314 | 1197 |
| 1315 | 729 |
| 1316 | 2689 |

TABLE Q18-continued

| with a sequence length of 4096: | |
|---|---|
| Reliabilily or reliability sequence number | Polarized channel sequence number |
| 1317 | 1632 |
| 1318 | 443 |
| 1319 | 3200 |
| 1320 | 1414 |
| 1321 | 1145 |
| 1322 | 2330 |
| 1323 | 872 |
| 1324 | 2225 |
| 1325 | 1603 |
| 1326 | 930 |
| 1327 | 2139 |
| 1328 | 1356 |
| 1329 | 741 |
| 1330 | 2626 |
| 1331 | 1223 |
| 1332 | 492 |
| 1333 | 2384 |
| 1334 | 1577 |
| 1335 | 821 |
| 1336 | 2246 |
| 1337 | 1203 |
| 1338 | 671 |
| 1339 | 2341 |
| 1340 | 1252 |
| 1341 | 961 |
| 1342 | 3084 |
| 1343 | 1680 |
| 1344 | 382 |
| 1345 | 2220 |
| 1346 | 1417 |
| 1347 | 920 |
| 1348 | 2571 |
| 1349 | 1198 |
| 1350 | 631 |
| 1351 | 2168 |
| 1352 | 1564 |
| 1353 | 845 |
| 1354 | 2329 |
| 1355 | 1362 |
| 1356 | 498 |
| 1357 | 2249 |
| 1358 | 1146 |
| 1359 | 2600 |
| 1360 | 1605 |
| 1361 | 730 |
| 1362 | 3105 |
| 1363 | 1336 |
| 1364 | 932 |
| 1365 | 2326 |
| 1366 | 1227 |
| 1367 | 742 |
| 1368 | 2110 |
| 1369 | 1307 |
| 1370 | 822 |
| 1371 | 2440 |
| 1372 | 1578 |
| 1373 | 500 |
| 1374 | 2628 |
| 1375 | 1087 |
| 1376 | 851 |
| 1377 | 2191 |
| 1378 | 1377 |
| 1379 | 2151 |
| 1380 | 745 |
| 1381 | 1800 |
| 1382 | 2342 |
| 1383 | 1205 |
| 1384 | 825 |
| 1385 | 3137 |
| 1386 | 1319 |
| 1387 | 445 |
| 1388 | 2690 |
| 1389 | 1585 |
| 1390 | 880 |
| 1391 | 2226 |

TABLE Q18-continued

| with a sequence length of 4096: | |
|---|---|
| Reliabilily or reliability sequence number | Polarized channel sequence number |
| 1392 | 1256 |
| 1393 | 687 |
| 1394 | 2400 |
| 1395 | 1364 |
| 1396 | 2141 |
| 1397 | 903 |
| 1398 | 1610 |
| 1399 | 2579 |
| 1400 | 471 |
| 1401 | 1418 |
| 1402 | 2250 |
| 1403 | 1696 |
| 1404 | 635 |
| 1405 | 3092 |
| 1406 | 1148 |
| 1407 | 846 |
| 1408 | 2371 |
| 1409 | 1425 |
| 1410 | 2155 |
| 1411 | 962 |
| 1412 | 1728 |
| 1413 | 2573 |
| 1414 | 732 |
| 1415 | 1229 |
| 1416 | 2345 |
| 1417 | 255 |
| 1418 | 1309 |
| 1419 | 2228 |
| 1420 | 1606 |
| 1421 | 3106 |
| 1422 | 853 |
| 1423 | 1206 |
| 1424 | 2448 |
| 1425 | 695 |
| 1426 | 1323 |
| 1427 | 2608 |
| 1428 | 826 |
| 1429 | 1580 |
| 1430 | 2199 |
| 1431 | 475 |
| 1432 | 2257 |
| 1433 | 1235 |
| 1434 | 936 |
| 1435 | 2332 |
| 1436 | 1378 |
| 1437 | 1808 |
| 1438 | 2574 |
| 1439 | 746 |
| 1440 | 1209 |
| 1441 | 3096 |
| 1442 | 907 |
| 1443 | 2142 |
| 1444 | 1368 |
| 1445 | 867 |
| 1446 | 2373 |
| 1447 | 1667 |
| 1448 | 487 |
| 1449 | 2252 |
| 1450 | 1264 |
| 1451 | 2632 |
| 1452 | 1420 |
| 1453 | 637 |
| 1454 | 2346 |
| 1455 | 1617 |
| 1456 | 854 |
| 1457 | 2203 |
| 1458 | 1230 |
| 1459 | 3108 |
| 1460 | 828 |
| 1461 | 1310 |
| 1462 | 2818 |
| 1463 | 753 |
| 1464 | 1586 |
| 1465 | 2353 |
| 1466 | 1119 |

TABLE Q18-continued

| with a sequence length of 4096: | |
|---|---|
| Reliabilily or reliability sequence number | Polarized channel sequence number |
| 1467 | 2258 |
| 1468 | 504 |
| 1469 | 1609 |
| 1470 | 2157 |
| 1471 | 857 |
| 1472 | 1426 |
| 1473 | 2581 |
| 1474 | 719 |
| 1475 | 3329 |
| 1476 | 1351 |
| 1477 | 1551 |
| 1478 | 2378 |
| 1479 | 964 |
| 1480 | 1237 |
| 1481 | 2232 |
| 1482 | 909 |
| 1483 | 2464 |
| 1484 | 1441 |
| 1485 | 446 |
| 1486 | 2692 |
| 1487 | 1669 |
| 1488 | 699 |
| 1489 | 2163 |
| 1490 | 1210 |
| 1491 | 3079 |
| 1492 | 1824 |
| 1493 | 869 |
| 1494 | 2496 |
| 1495 | 1325 |
| 1496 | 915 |
| 1497 | 2595 |
| 1498 | 1251 |
| 1499 | 2215 |
| 1500 | 477 |
| 1501 | 1588 |
| 1502 | 2374 |
| 1503 | 1380 |
| 1504 | 2273 |
| 1505 | 748 |
| 1506 | 1135 |
| 1507 | 2586 |
| 1508 | 944 |
| 1509 | 1559 |
| 1510 | 3201 |
| 1511 | 910 |
| 1512 | 2348 |
| 1513 | 1331 |
| 1514 | 1670 |
| 1515 | 2205 |
| 1516 | 638 |
| 1517 | 2640 |
| 1518 | 1428 |
| 1519 | 799 |
| 1520 | 2435 |
| 1521 | 1238 |
| 1522 | 1612 |
| 1523 | 2158 |
| 1524 | 491 |
| 1525 | 3138 |
| 1526 | 1326 |
| 1527 | 968 |
| 1528 | 2385 |
| 1529 | 1212 |
| 1530 | 2597 |
| 1531 | 754 |
| 1532 | 1673 |
| 1533 | 2165 |
| 1534 | 1355 |
| 1535 | 858 |
| 1536 | 2260 |
| 1537 | 1618 |
| 1538 | 2585 |
| 1539 | 917 |
| 1540 | 1241 |
| 1541 | 3083 |

TABLE Q18-continued with a sequence length of 4096:

| Reliabilily or reliability sequence number | Polarized channel sequence number |
|---|---|
| 1542 | 478 |
| 1543 | 2354 |
| 1544 | 1384 |
| 1545 | 1795 |
| 1546 | 2219 |
| 1547 | 756 |
| 1548 | 2377 |
| 1549 | 1442 |
| 1550 | 870 |
| 1551 | 2582 |
| 1552 | 1253 |
| 1553 | 2274 |
| 1554 | 1592 |
| 1555 | 873 |
| 1556 | 3112 |
| 1557 | 1333 |
| 1558 | 2319 |
| 1559 | 701 |
| 1560 | 1563 |
| 1561 | 2696 |
| 1562 | 1183 |
| 1563 | 2264 |
| 1564 | 493 |
| 1565 | 1473 |
| 1566 | 2437 |
| 1567 | 931 |
| 1568 | 3140 |
| 1569 | 1633 |
| 1570 | 860 |
| 1571 | 2820 |
| 1572 | 1432 |
| 1573 | 2206 |
| 1574 | 1575 |
| 1575 | 727 |
| 1576 | 2356 |
| 1577 | 1143 |
| 1578 | 2598 |
| 1579 | 815 |
| 1580 | 1357 |
| 1581 | 2166 |
| 1582 | 1797 |
| 1583 | 3585 |
| 1584 | 976 |
| 1585 | 1242 |
| 1586 | 2327 |
| 1587 | 499 |
| 1588 | 2221 |
| 1589 | 1620 |
| 1590 | 1444 |
| 1591 | 2656 |
| 1592 | 918 |
| 1593 | 2438 |
| 1594 | 1254 |
| 1595 | 731 |
| 1596 | 2169 |
| 1597 | 1674 |
| 1598 | 3202 |
| 1599 | 1334 |
| 1600 | 921 |
| 1601 | 2627 |
| 1602 | 1681 |
| 1603 | 2380 |
| 1604 | 933 |
| 1605 | 1363 |
| 1606 | 2247 |
| 1607 | 1565 |
| 1608 | 2601 |
| 1609 | 743 |
| 1610 | 1257 |
| 1611 | 3091 |
| 1612 | 494 |
| 1613 | 2227 |
| 1614 | 1337 |
| 1615 | 2276 |
| 1616 | 1579 |

TABLE Q18-continued with a sequence length of 4096:

| Reliabilily or reliability sequence number | Polarized channel sequence number |
|---|---|
| 1617 | 874 |
| 1618 | 2704 |
| 1619 | 1392 |
| 1620 | 2441 |
| 1621 | 823 |
| 1622 | 1856 |
| 1623 | 3085 |
| 1624 | 1199 |
| 1625 | 2222 |
| 1626 | 760 |
| 1627 | 1415 |
| 1628 | 2588 |
| 1629 | 1634 |
| 1630 | 2386 |
| 1631 | 881 |
| 1632 | 2170 |
| 1633 | 1147 |
| 1634 | 501 |
| 1635 | 2629 |
| 1636 | 1624 |
| 1637 | 3120 |
| 1638 | 1358 |
| 1639 | 922 |
| 1640 | 2360 |
| 1641 | 1474 |
| 1642 | 2251 |
| 1643 | 847 |
| 1644 | 2331 |
| 1645 | 1676 |
| 1646 | 1244 |
| 1647 | 2602 |
| 1648 | 702 |
| 1649 | 3086 |
| 1650 | 1566 |
| 1651 | 876 |
| 1652 | 2111 |
| 1653 | 1365 |
| 1654 | 2401 |
| 1655 | 1801 |
| 1656 | 2824 |
| 1657 | 992 |
| 1658 | 1207 |
| 1659 | 2229 |
| 1660 | 1338 |
| 1661 | 3144 |
| 1662 | 733 |
| 1663 | 1682 |
| 1664 | 2343 |
| 1665 | 383 |
| 1666 | 2609 |
| 1667 | 1448 |
| 1668 | 2280 |
| 1669 | 1607 |
| 1670 | 934 |
| 1671 | 2388 |
| 1672 | 1258 |
| 1673 | 3330 |
| 1674 | 1697 |
| 1675 | 2634 |
| 1676 | 963 |
| 1677 | 1419 |
| 1678 | 2442 |
| 1679 | 827 |
| 1680 | 2720 |
| 1681 | 1581 |
| 1682 | 2172 |
| 1683 | 1379 |
| 1684 | 747 |
| 1685 | 2449 |
| 1686 | 1149 |
| 1687 | 3093 |
| 1688 | 1798 |
| 1689 | 2752 |
| 1690 | 937 |
| 1691 | 1366 |

TABLE Q18-continued

| with a sequence length of 4096: | |
|---|---|
| Reliabilily or reliability sequence number | Polarized channel sequence number |
| 1692 | 2253 |
| 1693 | 447 |
| 1694 | 2333 |
| 1695 | 1636 |
| 1696 | 2630 |
| 1697 | 1340 |
| 1698 | 882 |
| 1699 | 3204 |
| 1700 | 1587 |
| 1701 | 2230 |
| 1702 | 1265 |
| 1703 | 2347 |
| 1704 | 924 |
| 1705 | 1369 |
| 1706 | 2604 |
| 1707 | 734 |
| 1708 | 2259 |
| 1709 | 1684 |
| 1710 | 3107 |
| 1711 | 1231 |
| 1712 | 855 |
| 1713 | 2402 |
| 1714 | 1582 |
| 1715 | 2832 |
| 1716 | 1476 |
| 1717 | 2233 |
| 1718 | 965 |
| 1719 | 3098 |
| 1720 | 1809 |
| 1721 | 749 |
| 1722 | 2392 |
| 1723 | 1421 |
| 1724 | 2691 |
| 1725 | 1611 |
| 1726 | 2288 |
| 1727 | 502 |
| 1728 | 1211 |
| 1729 | 2444 |
| 1730 | 1381 |
| 1731 | 3152 |
| 1732 | 884 |
| 1733 | 2641 |
| 1734 | 1640 |
| 1735 | 2254 |
| 1736 | 1427 |
| 1737 | 938 |
| 1738 | 2334 |
| 1739 | 1698 |
| 1740 | 2610 |
| 1741 | 1260 |
| 1742 | 3109 |
| 1743 | 829 |
| 1744 | 1802 |
| 1745 | 2143 |
| 1746 | 755 |
| 1747 | 2633 |
| 1748 | 1456 |
| 1749 | 2450 |
| 1750 | 1589 |
| 1751 | 2375 |
| 1752 | 945 |
| 1753 | 1422 |
| 1754 | 3097 |
| 1755 | 1729 |
| 1756 | 2575 |
| 1757 | 859 |
| 1758 | 2261 |
| 1759 | 1150 |
| 1760 | 2465 |
| 1761 | 1688 |
| 1762 | 505 |
| 1763 | 3094 |
| 1764 | 1311 |
| 1765 | 2693 |
| 1766 | 1480 |

TABLE Q18-continued

| with a sequence length of 4096: | |
|---|---|
| Reliabilily or reliability sequence number | Polarized channel sequence number |
| 1767 | 2234 |
| 1768 | 966 |
| 1769 | 2848 |
| 1770 | 1613 |
| 1771 | 750 |
| 1772 | 2349 |
| 1773 | 1266 |
| 1774 | 3208 |
| 1775 | 1810 |
| 1776 | 2275 |
| 1777 | 940 |
| 1778 | 2612 |
| 1779 | 1370 |
| 1780 | 2404 |
| 1781 | 1700 |
| 1782 | 888 |
| 1783 | 2159 |
| 1784 | 1429 |
| 1785 | 3586 |
| 1786 | 1590 |
| 1787 | 2583 |
| 1788 | 969 |
| 1789 | 2355 |
| 1790 | 1268 |
| 1791 | 1619 |
| 1792 | 2694 |
| 1793 | 830 |
| 1794 | 3332 |
| 1795 | 1382 |
| 1796 | 2452 |
| 1797 | 1920 |
| 1798 | 2262 |
| 1799 | 506 |
| 1800 | 2636 |
| 1801 | 1385 |
| 1802 | 1593 |
| 1803 | 2350 |
| 1804 | 757 |
| 1805 | 3110 |
| 1806 | 1213 |
| 1807 | 2236 |
| 1808 | 1648 |
| 1809 | 2697 |
| 1810 | 911 |
| 1811 | 2379 |
| 1812 | 1443 |
| 1813 | 3168 |
| 1814 | 1671 |
| 1815 | 871 |
| 1816 | 2642 |
| 1817 | 1372 |
| 1818 | 2265 |
| 1819 | 946 |
| 1820 | 2408 |
| 1821 | 1239 |
| 1822 | 2819 |
| 1823 | 1804 |
| 1824 | 3139 |
| 1825 | 639 |
| 1826 | 2466 |
| 1827 | 1327 |
| 1828 | 1614 |
| 1829 | 2277 |
| 1830 | 861 |
| 1831 | 2616 |
| 1832 | 1488 |
| 1833 | 3113 |
| 1834 | 1730 |
| 1835 | 2357 |
| 1836 | 970 |
| 1837 | 2587 |
| 1838 | 1430 |
| 1839 | 2207 |
| 1840 | 1621 |
| 1841 | 508 |

TABLE Q18-continued

| with a sequence length of 4096: | |
|---|---|
| Reliabilily or reliability sequence number | Polarized channel sequence number |
| 1842 | 3216 |
| 1843 | 1243 |
| 1844 | 2497 |
| 1845 | 1825 |
| 1846 | 2657 |
| 1847 | 875 |
| 1848 | 2456 |
| 1849 | 1433 |
| 1850 | 2599 |
| 1851 | 1594 |
| 1852 | 3100 |
| 1853 | 703 |
| 1854 | 2167 |
| 1855 | 1445 |
| 1856 | 1704 |
| 1857 | 2381 |
| 1858 | 1255 |
| 1859 | 2821 |
| 1860 | 948 |
| 1861 | 3141 |
| 1862 | 1675 |
| 1863 | 2266 |
| 1864 | 1386 |
| 1865 | 2644 |
| 1866 | 919 |
| 1867 | 2468 |
| 1868 | 1857 |
| 1869 | 3114 |
| 1870 | 1335 |
| 1871 | 2278 |
| 1872 | 977 |
| 1873 | 1635 |
| 1874 | 2698 |
| 1875 | 1272 |
| 1876 | 2358 |
| 1877 | 862 |
| 1878 | 3336 |
| 1879 | 1622 |
| 1880 | 2705 |
| 1881 | 1393 |
| 1882 | 2387 |
| 1883 | 758 |
| 1884 | 2589 |
| 1885 | 1812 |
| 1886 | 3121 |
| 1887 | 1434 |
| 1888 | 2281 |
| 1889 | 479 |
| 1890 | 2361 |
| 1891 | 1596 |
| 1892 | 2603 |
| 1893 | 1359 |
| 1894 | 972 |
| 1895 | 3146 |
| 1896 | 1625 |
| 1897 | 2416 |
| 1898 | 1214 |
| 1899 | 2880 |
| 1900 | 923 |
| 1901 | 2223 |
| 1902 | 1732 |
| 1903 | 3232 |
| 1904 | 1388 |
| 1905 | 2439 |
| 1906 | 978 |
| 1907 | 2658 |
| 1908 | 1826 |
| 1909 | 2171 |
| 1910 | 1504 |
| 1911 | 3588 |
| 1912 | 1245 |
| 1913 | 2648 |
| 1914 | 877 |
| 1915 | 2382 |
| 1916 | 1446 |

TABLE Q18-continued

| with a sequence length of 4096: | |
|---|---|
| Reliabilily or reliability sequence number | Polarized channel sequence number |
| 1917 | 2498 |
| 1918 | 1677 |
| 1919 | 761 |
| 1920 | 3264 |
| 1921 | 1475 |
| 1922 | 2700 |
| 1923 | 1637 |
| 1924 | 2268 |
| 1925 | 952 |
| 1926 | 2590 |
| 1927 | 1339 |
| 1928 | 3142 |
| 1929 | 1816 |
| 1930 | 2389 |
| 1931 | 883 |
| 1932 | 2825 |
| 1933 | 1259 |
| 1934 | 2231 |
| 1935 | 1683 |
| 1936 | 3116 |
| 1937 | 935 |
| 1938 | 2362 |
| 1939 | 1449 |
| 1940 | 2706 |
| 1941 | 1712 |
| 1942 | 2472 |
| 1943 | 1394 |
| 1944 | 3344 |
| 1945 | 495 |
| 1946 | 2631 |
| 1947 | 1678 |
| 1948 | 2282 |
| 1949 | 1436 |
| 1950 | 2721 |
| 1951 | 993 |
| 1952 | 3203 |
| 1953 | 1828 |
| 1954 | 2443 |
| 1955 | 1246 |
| 1956 | 2605 |
| 1957 | 762 |
| 1958 | 2403 |
| 1959 | 1567 |
| 1960 | 3153 |
| 1961 | 1367 |
| 1962 | 2173 |
| 1963 | 925 |
| 1964 | 2822 |
| 1965 | 1736 |
| 1966 | 2390 |
| 1967 | 1477 |
| 1968 | 3122 |
| 1969 | 1799 |
| 1970 | 2660 |
| 1971 | 878 |
| 1972 | 2364 |
| 1973 | 1261 |
| 1974 | 2611 |
| 1975 | 1626 |
| 1976 | 3145 |
| 1977 | 885 |
| 1978 | 2289 |
| 1979 | 1396 |
| 1980 | 2393 |
| 1981 | 1685 |
| 1982 | 2708 |
| 1983 | 1450 |
| 1984 | 3087 |
| 1985 | 980 |
| 1986 | 2255 |
| 1987 | 1921 |
| 1988 | 2606 |
| 1989 | 1341 |
| 1990 | 3205 |
| 1991 | 939 |

TABLE Q18-continued

| with a sequence length of 4096: | |
|---|---|
| Reliabilily or reliability sequence number | Polarized channel sequence number |
| 1992 | 2500 |
| 1993 | 1638 |
| 1994 | 2833 |
| 1995 | 1267 |
| 1996 | 2445 |
| 1997 | 764 |
| 1998 | 3360 |
| 1999 | 1641 |
| 2000 | 2635 |
| 2001 | 1699 |
| 2002 | 2235 |
| 2003 | 1457 |
| 2004 | 2405 |
| 2005 | 507 |
| 2006 | 3592 |
| 2007 | 1858 |
| 2008 | 2664 |
| 2009 | 1371 |
| 2010 | 2451 |
| 2011 | 994 |
| 2012 | 3124 |
| 2013 | 1628 |
| 2014 | 2722 |
| 2015 | 1478 |
| 2016 | 2284 |
| 2017 | 1583 |
| 2018 | 2826 |
| 2019 | 984 |
| 2020 | 3095 |
| 2021 | 1262 |
| 2022 | 2480 |
| 2023 | 1803 |
| 2024 | 2613 |
| 2025 | 926 |
| 2026 | 2446 |
| 2027 | 1452 |
| 2028 | 3206 |
| 2029 | 1744 |
| 2030 | 2753 |
| 2031 | 1400 |
| 2032 | 2174 |
| 2033 | 886 |
| 2034 | 3148 |
| 2035 | 1686 |
| 2036 | 2712 |
| 2037 | 1481 |
| 2038 | 2335 |
| 2039 | 735 |
| 2040 | 2504 |
| 2041 | 1832 |
| 2042 | 3209 |
| 2043 | 1342 |
| 2044 | 2637 |
| 2045 | 1689 |
| 2046 | 2290 |
| 2047 | 941 |
| 2048 | 1269 |
| 2049 | 1701 |
| 2050 | 3154 |
| 2051 | 889 |
| 2052 | 2834 |
| 2053 | 1423 |
| 2054 | 2394 |
| 2055 | 1860 |
| 2056 | 2724 |
| 2057 | 1642 |
| 2058 | 3331 |
| 2059 | 967 |
| 2060 | 2453 |
| 2061 | 1383 |
| 2062 | 2614 |
| 2063 | 1591 |
| 2064 | 3128 |
| 2065 | 947 |
| 2066 | 2292 |

TABLE Q18-continued

| with a sequence length of 4096: | |
|---|---|
| Reliabilily or reliability sequence number | Polarized channel sequence number |
| 2067 | 1458 |
| 2068 | 2643 |
| 2069 | 1922 |
| 2070 | 2406 |
| 2071 | 1151 |
| 2072 | 3099 |
| 2073 | 996 |
| 2074 | 2944 |
| 2075 | 1649 |
| 2076 | 2409 |
| 2077 | 1373 |
| 2078 | 3169 |
| 2079 | 1690 |
| 2080 | 2617 |
| 2081 | 503 |
| 2082 | 2237 |
| 2083 | 1482 |
| 2084 | 2672 |
| 2085 | 1811 |
| 2086 | 3600 |
| 2087 | 942 |
| 2088 | 2467 |
| 2089 | 1615 |
| 2090 | 2695 |
| 2091 | 1387 |
| 2092 | 3111 |
| 2093 | 1644 |
| 2094 | 2396 |
| 2095 | 751 |
| 2096 | 2263 |
| 2097 | 1215 |
| 2098 | 2828 |
| 2099 | 1805 |
| 2100 | 3333 |
| 2101 | 1460 |
| 2102 | 2351 |
| 2103 | 890 |
| 2104 | 2638 |
| 2105 | 1760 |
| 2106 | 3156 |
| 2107 | 1431 |
| 2108 | 2512 |
| 2109 | 1702 |
| 2110 | 2754 |
| 2111 | 971 |
| 2112 | 2454 |
| 2113 | 1489 |
| 2114 | 3210 |
| 2115 | 1840 |
| 2116 | 2645 |
| 2117 | 831 |
| 2118 | 2267 |
| 2119 | 1731 |
| 2120 | 3217 |
| 2121 | 1374 |
| 2122 | 2849 |
| 2123 | 1595 |
| 2124 | 2457 |
| 2125 | 949 |
| 2126 | 3101 |
| 2127 | 1270 |
| 2128 | 2618 |
| 2129 | 1806 |
| 2130 | 2469 |
| 2131 | 1484 |
| 2132 | 2728 |
| 2133 | 1000 |
| 2134 | 3115 |
| 2135 | 1705 |
| 2136 | 2279 |
| 2137 | 1864 |
| 2138 | 2699 |
| 2139 | 1435 |
| 2140 | 3392 |
| 2141 | 892 |

TABLE Q18-continued with a sequence length of 4096:

| Reliabilily or reliability sequence number | Polarized channel sequence number |
|---|---|
| 2142 | 2410 |
| 2143 | 1650 |
| 2144 | 2881 |
| 2145 | 1490 |
| 2146 | 3616 |
| 2147 | 1692 |
| 2148 | 2359 |
| 2149 | 763 |
| 2150 | 2659 |
| 2151 | 1389 |
| 2152 | 3170 |
| 2153 | 1813 |
| 2154 | 2296 |
| 2155 | 1273 |
| 2156 | 2646 |
| 2157 | 973 |
| 2158 | 2417 |
| 2159 | 1623 |
| 2160 | 3160 |
| 2161 | 1733 |
| 2162 | 2836 |
| 2163 | 1464 |
| 2164 | 2458 |
| 2165 | 950 |
| 2166 | 3212 |
| 2167 | 1924 |
| 2168 | 2620 |
| 2169 | 1395 |
| 2170 | 2383 |
| 2171 | 1652 |
| 2172 | 3102 |
| 2173 | 509 |
| 2174 | 2649 |
| 2175 | 2238 |
| 2176 | 1827 |
| 2177 | 3337 |
| 2178 | 1447 |
| 2179 | 2756 |
| 2180 | 1706 |
| 2181 | 2412 |
| 2182 | 979 |
| 2183 | 3218 |
| 2184 | 1505 |
| 2185 | 2850 |
| 2186 | 1597 |
| 2187 | 2528 |
| 2188 | 1274 |
| 2189 | 2269 |
| 2190 | 953 |
| 2191 | 3143 |
| 2192 | 1818 |
| 2193 | 2470 |
| 2194 | 1713 |
| 2195 | 2701 |
| 2196 | 1437 |
| 2197 | 3233 |
| 2198 | 1008 |
| 2199 | 2499 |
| 2200 | 1627 |
| 2201 | 2661 |
| 2202 | 3587 |
| 2203 | 1390 |
| 2204 | 2363 |
| 2205 | 1872 |
| 2206 | 2840 |
| 2207 | 974 |
| 2208 | 3117 |
| 2209 | 1734 |
| 2210 | 2283 |
| 2211 | 1397 |
| 2212 | 2707 |
| 2213 | 1829 |
| 2214 | 3334 |
| 2215 | 759 |
| 2216 | 2473 |

TABLE Q18-continued with a sequence length of 4096:

| Reliabilily or reliability sequence number | Polarized channel sequence number |
|---|---|
| 2217 | 1492 |
| 2218 | 2736 |
| 2219 | 1708 |
| 2220 | 3172 |
| 2221 | 1451 |
| 2222 | 2418 |
| 2223 | 2702 |
| 2224 | 863 |
| 2225 | 3123 |
| 2226 | 1656 |
| 2227 | 2460 |
| 2228 | 1817 |
| 2229 | 2852 |
| 2230 | 1276 |
| 2231 | 3220 |
| 2232 | 981 |
| 2233 | 2270 |
| 2234 | 1737 |
| 2235 | 2591 |
| 2236 | 1506 |
| 2237 | 2391 |
| 2238 | 1814 |
| 2239 | 3118 |
| 2240 | 2760 |
| 2241 | 1598 |
| 2242 | 2501 |
| 2243 | 954 |
| 2244 | 3345 |
| 2245 | 1496 |
| 2246 | 2823 |
| 2247 | 1928 |
| 2248 | 2285 |
| 2249 | 1438 |
| 2250 | 3840 |
| 2251 | 995 |
| 2252 | 2650 |
| 2253 | 1679 |
| 2254 | 2420 |
| 2255 | 3147 |
| 2256 | 1639 |
| 2257 | 2709 |
| 2258 | 1398 |
| 2259 | 2474 |
| 2260 | 879 |
| 2261 | 3176 |
| 2262 | 1830 |
| 2263 | 2945 |
| 2264 | 1714 |
| 2265 | 2365 |
| 2266 | 1247 |
| 2267 | 3234 |
| 2268 | 2662 |
| 2269 | 982 |
| 2270 | 2291 |
| 2271 | 1888 |
| 2272 | 3338 |
| 2273 | 1453 |
| 2274 | 2665 |
| 2275 | 1629 |
| 2276 | 2723 |
| 2277 | 1738 |
| 2278 | 3125 |
| 2279 | 956 |
| 2280 | 2481 |
| 2281 | 3265 |
| 2282 | 1401 |
| 2283 | 2882 |
| 2284 | 1859 |
| 2285 | 2395 |
| 2286 | 1479 |
| 2287 | 3224 |
| 2288 | 985 |
| 2289 | 2652 |
| 2290 | 1643 |
| 2291 | 2502 |

TABLE Q18-continued with a sequence length of 4096:

| Reliabilily or reliability sequence number | Polarized channel sequence number |
|---|---|
| 2292 | 1833 |
| 2293 | 3589 |
| 2294 | 2607 |
| 2295 | 1459 |
| 2296 | 2286 |
| 2297 | 1716 |
| 2298 | 3149 |
| 2299 | 510 |
| 2300 | 2827 |
| 2301 | 1936 |
| 2302 | 2476 |
| 2303 | 3346 |
| 2304 | 1508 |
| 2305 | 2768 |
| 2306 | 1687 |
| 2307 | 2424 |
| 2308 | 765 |
| 2309 | 3236 |
| 2310 | 1454 |
| 2311 | 2710 |
| 2312 | 1745 |
| 2313 | 2505 |
| 2314 | 3126 |
| 2315 | 1820 |
| 2316 | 2856 |
| 2317 | 1263 |
| 2318 | 2366 |
| 2319 | 997 |
| 2320 | 3155 |
| 2321 | 1630 |
| 2322 | 2713 |
| 2323 | 1861 |
| 2324 | 2293 |
| 2325 | 3456 |
| 2326 | 1402 |
| 2327 | 2725 |
| 2328 | 1740 |
| 2329 | 3648 |
| 2330 | 927 |
| 2331 | 2447 |
| 2332 | 1483 |
| 2333 | 2884 |
| 2334 | 3129 |
| 2335 | 1834 |
| 2336 | 2666 |
| 2337 | 1691 |
| 2338 | 2407 |
| 2339 | 887 |
| 2340 | 3184 |
| 2341 | 1343 |
| 2342 | 2615 |
| 2343 | 2482 |
| 2344 | 1841 |
| 2345 | 3207 |
| 2346 | 1746 |
| 2347 | 2946 |
| 2348 | 1461 |
| 2349 | 2175 |
| 2350 | 986 |
| 2351 | 3340 |
| 2352 | 2673 |
| 2353 | 1645 |
| 2354 | 2397 |
| 2355 | 1866 |
| 2356 | 3150 |
| 2357 | 1512 |
| 2358 | 2714 |
| 2359 | 3266 |
| 2360 | 1720 |
| 2361 | 2506 |
| 2362 | 998 |
| 2363 | 2835 |
| 2364 | 1404 |
| 2365 | 3593 |
| 2366 | 1952 |
| 2367 | 2639 |
| 2368 | 2411 |
| 2369 | 1651 |
| 2370 | 3157 |
| 2371 | 1275 |
| 2372 | 2668 |
| 2373 | 1001 |
| 2374 | 2239 |
| 2375 | 3361 |
| 2376 | 1984 |
| 2377 | 2829 |
| 2378 | 1703 |
| 2379 | 3130 |
| 2380 | 1485 |
| 2381 | 2484 |
| 2382 | 1862 |
| 2383 | 2784 |
| 2384 | 3240 |
| 2385 | 943 |
| 2386 | 2455 |
| 2387 | 1761 |
| 2388 | 2726 |
| 2389 | 1462 |
| 2390 | 3211 |
| 2391 | 2513 |
| 2392 | 1836 |
| 2393 | 3393 |
| 2394 | 891 |
| 2395 | 2864 |
| 2396 | 1693 |
| 2397 | 2755 |
| 2398 | 3590 |
| 2399 | 1491 |
| 2400 | 2398 |
| 2401 | 1923 |
| 2402 | 2619 |
| 2403 | 1646 |
| 2404 | 3171 |
| 2405 | 2294 |
| 2406 | 988 |
| 2407 | 3158 |
| 2408 | 1465 |
| 2409 | 2830 |
| 2410 | 1873 |
| 2411 | 2508 |
| 2412 | 3348 |
| 2413 | 1653 |
| 2414 | 2729 |
| 2415 | 1520 |
| 2416 | 2888 |
| 2417 | 1748 |
| 2418 | 3132 |
| 2419 | 2459 |
| 2420 | 766 |
| 2421 | 3161 |
| 2422 | 1486 |
| 2423 | 2674 |
| 2424 | 1842 |
| 2425 | 2514 |
| 2426 | 3601 |
| 2427 | 1707 |
| 2428 | 2716 |
| 2429 | 1271 |
| 2430 | 2413 |
| 2431 | 3268 |
| 2432 | 951 |
| 2433 | 2837 |
| 2434 | 1865 |
| 2435 | 3362 |
| 2436 | 1762 |
| 2437 | 2297 |
| 2438 | 2647 |
| 2439 | 1375 |
| 2440 | 3213 |
| 2441 | 1807 |

TABLE Q18-continued with a sequence length of 4096:

| Reliabilily or reliability sequence number | Polarized channel sequence number |
|---|---|
| 2442 | 2757 |
| 2443 | 1002 |
| 2444 | 2488 |
| 2445 | 3173 |
| 2446 | 1752 |
| 2447 | 2948 |
| 2448 | 1925 |
| 2449 | 3352 |
| 2450 | 2419 |
| 2451 | 1493 |
| 2452 | 2676 |
| 2453 | 1694 |
| 2454 | 3219 |
| 2455 | 893 |
| 2456 | 2851 |
| 2457 | 3594 |
| 2458 | 1844 |
| 2459 | 2471 |
| 2460 | 1466 |
| 2461 | 2730 |
| 2462 | 3248 |
| 2463 | 1654 |
| 2464 | 2529 |
| 2465 | 1815 |
| 2466 | 2621 |
| 2467 | 1507 |
| 2468 | 3214 |
| 2469 | 2298 |
| 2470 | 1009 |
| 2471 | 3364 |
| 2472 | 1709 |
| 2473 | 2842 |
| 2474 | 2737 |
| 2475 | 1926 |
| 2476 | 3103 |
| 2477 | 1391 |
| 2478 | 2461 |
| 2479 | 3272 |
| 2480 | 1657 |
| 2481 | 2651 |
| 2482 | 975 |
| 2483 | 2414 |
| 2484 | 1868 |
| 2485 | 3602 |
| 2486 | 2896 |
| 2487 | 1494 |
| 2488 | 3335 |
| 2489 | 1735 |
| 2490 | 2758 |
| 2491 | 2421 |
| 2492 | 1715 |
| 2493 | 3162 |
| 2494 | 955 |
| 2495 | 2853 |
| 2496 | 3221 |
| 2497 | 1468 |
| 2498 | 2516 |
| 2499 | 1764 |
| 2500 | 2732 |
| 2501 | 3457 |
| 2502 | 1929 |
| 2503 | 2475 |
| 2504 | 1497 |
| 2505 | 3712 |
| 2506 | 2680 |
| 2507 | 1710 |
| 2508 | 2841 |
| 2509 | 511 |
| 2510 | 3174 |
| 2511 | 2300 |
| 2512 | 1874 |
| 2513 | 3177 |
| 2514 | 1658 |
| 2515 | 2761 |
| 2516 | 2530 |

TABLE Q18-continued with a sequence length of 4096:

| Reliabilily or reliability sequence number | Polarized channel sequence number |
|---|---|
| 2517 | 1277 |
| 2518 | 3235 |
| 2519 | 1848 |
| 2520 | 2838 |
| 2521 | 3394 |
| 2522 | 1739 |
| 2523 | 2622 |
| 2524 | 1004 |
| 2525 | 2520 |
| 2526 | 3164 |
| 2527 | 1509 |
| 2528 | 2952 |
| 2529 | 1819 |
| 2530 | 3596 |
| 2531 | 2462 |
| 2532 | 1599 |
| 2533 | 3119 |
| 2534 | 1439 |
| 2535 | 2703 |
| 2536 | 2663 |
| 2537 | 1889 |
| 2538 | 3339 |
| 2539 | 894 |
| 2540 | 2422 |
| 2541 | 3280 |
| 2542 | 1717 |
| 2543 | 2854 |
| 2544 | 1831 |
| 2545 | 2738 |
| 2546 | 3222 |
| 2547 | 1399 |
| 2548 | 2271 |
| 2549 | 1768 |
| 2550 | 3617 |
| 2551 | 2912 |
| 2552 | 1010 |
| 2553 | 2477 |
| 2554 | 1876 |
| 2555 | 3368 |
| 2556 | 2653 |
| 2557 | 1498 |
| 2558 | 3225 |
| 2559 | 2762 |
| 2560 | 1930 |
| 2561 | 3237 |
| 2562 | 1660 |
| 2563 | 2425 |
| 2564 | 2883 |
| 2565 | 1510 |
| 2566 | 3396 |
| 2567 | 1012 |
| 2568 | 2503 |
| 2569 | 3649 |
| 2570 | 1937 |
| 2571 | 2667 |
| 2572 | 1741 |
| 2573 | 2857 |
| 2574 | 3178 |
| 2575 | 1821 |
| 2576 | 2483 |
| 2577 | 3127 |
| 2578 | 1513 |
| 2579 | 2740 |
| 2580 | 1718 |
| 2581 | 3458 |
| 2582 | 2960 |
| 2583 | 957 |
| 2584 | 2532 |
| 2585 | 1835 |
| 2586 | 3185 |
| 2587 | 2711 |
| 2588 | 1455 |
| 2589 | 3226 |
| 2590 | 2478 |
| 2591 | 1747 |

TABLE Q18-continued

| with a sequence length of 4096: | |
|---|---|
| Reliabilily or reliability sequence number | Polarized channel sequence number |
| 2592 | 3604 |
| 2593 | 1890 |
| 2594 | 2769 |
| 2595 | 2844 |
| 2596 | 1721 |
| 2597 | 3347 |
| 2598 | 1403 |
| 2599 | 2287 |
| 2600 | 3151 |
| 2601 | 983 |
| 2602 | 2654 |
| 2603 | 3180 |
| 2604 | 1880 |
| 2605 | 2885 |
| 2606 | 1776 |
| 2607 | 2426 |
| 2608 | 3618 |
| 2609 | 1500 |
| 2610 | 2764 |
| 2611 | 3341 |
| 2612 | 1932 |
| 2613 | 2507 |
| 2614 | 1742 |
| 2615 | 3296 |
| 2616 | 2858 |
| 2617 | 767 |
| 2618 | 3238 |
| 2619 | 2715 |
| 2620 | 1822 |
| 2621 | 2367 |
| 2622 | 1278 |
| 2623 | 3376 |
| 2624 | 2865 |
| 2625 | 1631 |
| 2626 | 3608 |
| 2627 | 2770 |
| 2628 | 1938 |
| 2629 | 3267 |
| 2630 | 1863 |
| 2631 | 2485 |
| 2632 | 2669 |
| 2633 | 987 |
| 2634 | 3131 |
| 2635 | 2890 |
| 2636 | 1463 |
| 2637 | 3342 |
| 2638 | 1749 |
| 2639 | 2536 |
| 2640 | 3241 |
| 2641 | 1953 |
| 2642 | 2744 |
| 2643 | 3620 |
| 2644 | 1722 |
| 2645 | 2428 |
| 2646 | 1514 |
| 2647 | 2976 |
| 2648 | 3400 |
| 2649 | 1837 |
| 2650 | 2675 |
| 2651 | 3186 |
| 2652 | 999 |
| 2653 | 2299 |
| 2654 | 1763 |
| 2655 | 3228 |
| 2656 | 3008 |
| 2657 | 1405 |
| 2658 | 3349 |
| 2659 | 2727 |
| 2660 | 1892 |
| 2661 | 2509 |
| 2662 | 3841 |
| 2663 | 1647 |
| 2664 | 2886 |
| 2665 | 1843 |
| 2666 | 3159 |

TABLE Q18-continued

| with a sequence length of 4096: | |
|---|---|
| Reliabilily or reliability sequence number | Polarized channel sequence number |
| 2667 | 2785 |
| 2668 | 1521 |
| 2669 | 3269 |
| 2670 | 2486 |
| 2671 | 1016 |
| 2672 | 3460 |
| 2673 | 2860 |
| 2674 | 1940 |
| 2675 | 2717 |
| 2676 | 1750 |
| 2677 | 3591 |
| 2678 | 2515 |
| 2679 | 1838 |
| 2680 | 3188 |
| 2681 | 2947 |
| 2682 | 1487 |
| 2683 | 3363 |
| 2684 | 2670 |
| 2685 | 1724 |
| 2686 | 3242 |
| 2687 | 2489 |
| 2688 | 958 |
| 2689 | 3133 |
| 2690 | 1867 |
| 2691 | 2897 |
| 2692 | 3713 |
| 2693 | 1753 |
| 2694 | 2677 |
| 2695 | 2544 |
| 2696 | 1467 |
| 2697 | 3354 |
| 2698 | 2772 |
| 2699 | 1896 |
| 2700 | 3249 |
| 2701 | 1954 |
| 2702 | 2510 |
| 2703 | 3163 |
| 2704 | 1765 |
| 2705 | 2866 |
| 2706 | 3650 |
| 2707 | 1516 |
| 2708 | 2731 |
| 2709 | 3408 |
| 2710 | 989 |
| 2711 | 2295 |
| 2712 | 3270 |
| 2713 | 1845 |
| 2714 | 2889 |
| 2715 | 2786 |
| 2716 | 1695 |
| 2717 | 3365 |
| 2718 | 1985 |
| 2719 | 2399 |
| 2720 | 3244 |
| 2721 | 1406 |
| 2722 | 2831 |
| 2723 | 3595 |
| 2724 | 1944 |
| 2725 | 2776 |
| 2726 | 3192 |
| 2727 | 1655 |
| 2728 | 2949 |
| 2729 | 3353 |
| 2730 | 1003 |
| 2731 | 2517 |
| 2732 | 3273 |
| 2733 | 1869 |
| 2734 | 2718 |
| 2735 | 3624 |
| 2736 | 1522 |
| 2737 | 2868 |
| 2738 | 1754 |
| 2739 | 2490 |
| 2740 | 3350 |
| 2741 | 1956 |

TABLE Q18-continued with a sequence length of 4096:

| Reliabilily or reliability sequence number | Polarized channel sequence number |
|---|---|
| 2742 | 2678 |
| 2743 | 3134 |
| 2744 | 1766 |
| 2745 | 2839 |
| 2746 | 3464 |
| 2747 | 1846 |
| 2748 | 2531 |
| 2749 | 3652 |
| 2750 | 990 |
| 2751 | 2733 |
| 2752 | 3215 |
| 2753 | 1524 |
| 2754 | 2950 |
| 2755 | 3175 |
| 2756 | 1875 |
| 2757 | 2415 |
| 2758 | 3366 |
| 2759 | 1769 |
| 2760 | 2681 |
| 2761 | 3714 |
| 2762 | 1849 |
| 2763 | 2892 |
| 2764 | 3250 |
| 2765 | 1469 |
| 2766 | 2518 |
| 2767 | 3424 |
| 2768 | 1904 |
| 2769 | 2759 |
| 2770 | 3165 |
| 2771 | 1711 |
| 2772 | 2739 |
| 2773 | 1005 |
| 2774 | 2492 |
| 2775 | 3603 |
| 2776 | 1927 |
| 2777 | 2788 |
| 2778 | 3274 |
| 2779 | 1495 |
| 2780 | 2953 |
| 2781 | 3395 |
| 2782 | 1659 |
| 2783 | 2521 |
| 2784 | 3179 |
| 2785 | 1870 |
| 2786 | 2734 |
| 2787 | 3597 |
| 2788 | 1986 |
| 2789 | 2898 |
| 2790 | 3369 |
| 2791 | 1756 |
| 2792 | 2682 |
| 2793 | 3252 |
| 2794 | 1279 |
| 2795 | 2301 |
| 2796 | 3472 |
| 2797 | 1011 |
| 2798 | 2872 |
| 2799 | 3632 |
| 2800 | 1877 |
| 2801 | 2763 |
| 2802 | 3223 |
| 2803 | 1719 |
| 2804 | 2533 |
| 2805 | 3281 |
| 2806 | 1850 |
| 2807 | 2843 |
| 2808 | 3356 |
| 2809 | 1499 |
| 2810 | 2623 |
| 2811 | 3598 |
| 2812 | 1960 |
| 2813 | 2463 |
| 2814 | 3166 |
| 2815 | 2913 |
| 2816 | 1770 |

TABLE Q18-continued with a sequence length of 4096:

| Reliabilily or reliability sequence number | Polarized channel sequence number |
|---|---|
| 2817 | 3397 |
| 2818 | 2741 |
| 2819 | 1931 |
| 2820 | 3276 |
| 2821 | 2855 |
| 2822 | 1006 |
| 2823 | 3656 |
| 2824 | 2423 |
| 2825 | 1891 |
| 2826 | 3370 |
| 2827 | 2792 |
| 2828 | 1511 |
| 2829 | 3227 |
| 2830 | 2900 |
| 2831 | 1661 |
| 2832 | 3842 |
| 2833 | 2522 |
| 2834 | 1878 |
| 2835 | 3377 |
| 2836 | 2954 |
| 2837 | 1852 |
| 2838 | 3282 |
| 2839 | 2684 |
| 2840 | 1777 |
| 2841 | 3181 |
| 2842 | 2534 |
| 2843 | 1528 |
| 2844 | 3605 |
| 2845 | 2961 |
| 2846 | 1013 |
| 2847 | 3402 |
| 2848 | 2765 |
| 2849 | 1881 |
| 2850 | 3256 |
| 2851 | 2845 |
| 2852 | 3488 |
| 2853 | 1743 |
| 2854 | 2537 |
| 2855 | 3716 |
| 2856 | 1988 |
| 2857 | 2742 |
| 2858 | 3187 |
| 2859 | 1933 |
| 2860 | 2859 |
| 2861 | 3520 |
| 2862 | 1470 |
| 2863 | 2479 |
| 2864 | 3619 |
| 2865 | 1723 |
| 2866 | 2771 |
| 2867 | 3239 |
| 2868 | 1893 |
| 2869 | 2914 |
| 2870 | 2745 |
| 2871 | 2427 |
| 2872 | 1939 |
| 2873 | 3398 |
| 2874 | 2904 |
| 2875 | 895 |
| 2876 | 3297 |
| 2877 | 2800 |
| 2878 | 1501 |
| 2879 | 3610 |
| 2880 | 2524 |
| 2881 | 1772 |
| 2882 | 3372 |
| 2883 | 2956 |
| 2884 | 1968 |
| 2885 | 3229 |
| 2886 | 2766 |
| 2887 | 3664 |
| 2888 | 1934 |
| 2889 | 2846 |
| 2890 | 3459 |
| 2891 | 1662 |

TABLE Q18-continued

| with a sequence length of 4096: | |
|---|---|
| Reliabilily or reliability sequence number | Polarized channel sequence number |
| 2892 | 2302 |
| 2893 | 3182 |
| 2894 | 1823 |
| 2895 | 2655 |
| 2896 | 3409 |
| 2897 | 1515 |
| 2898 | 2962 |
| 2899 | 3621 |
| 2900 | 1992 |
| 2901 | 2887 |
| 2902 | 3189 |
| 2903 | 2487 |
| 2904 | 959 |
| 2905 | 3284 |
| 2906 | 2773 |
| 2907 | 1778 |
| 2908 | 3609 |
| 2909 | 2977 |
| 2910 | 1882 |
| 2911 | 3378 |
| 2912 | 2746 |
| 2913 | 3243 |
| 2914 | 1941 |
| 2915 | 2538 |
| 2916 | 3401 |
| 2917 | 1502 |
| 2918 | 2861 |
| 2919 | 3606 |
| 2920 | 1780 |
| 2921 | 2787 |
| 2922 | 3298 |
| 2923 | 1894 |
| 2924 | 2429 |
| 2925 | 3343 |
| 2926 | 2916 |
| 2927 | 1897 |
| 2928 | 3720 |
| 2929 | 2671 |
| 2930 | 1725 |
| 2931 | 3288 |
| 2932 | 2867 |
| 2933 | 1014 |
| 2934 | 3461 |
| 2935 | 2545 |
| 2936 | 3844 |
| 2937 | 1517 |
| 2938 | 2964 |
| 2939 | 3230 |
| 2940 | 1955 |
| 2941 | 2774 |
| 2942 | 3380 |
| 2943 | 2862 |
| 2944 | 1884 |
| 2945 | 3622 |
| 2946 | 2511 |
| 2947 | 1751 |
| 2948 | 3190 |
| 2949 | 2748 |
| 2950 | 1839 |
| 2951 | 3351 |
| 2952 | 2891 |
| 2953 | 3245 |
| 2954 | 2000 |
| 2955 | 2777 |
| 2956 | 3680 |
| 2957 | 1523 |
| 2958 | 2491 |
| 2959 | 3462 |
| 2960 | 1942 |
| 2961 | 3193 |
| 2962 | 2920 |
| 2963 | 3651 |
| 2964 | 1755 |
| 2965 | 2978 |
| 2966 | 3404 |

TABLE Q18-continued

| with a sequence length of 4096: | |
|---|---|
| Reliabilily or reliability sequence number | Polarized channel sequence number |
| 2967 | 1017 |
| 2968 | 2789 |
| 2969 | 3271 |
| 2970 | 2540 |
| 2971 | 1945 |
| 2972 | 3625 |
| 2973 | 2869 |
| 2974 | 1957 |
| 2975 | 3251 |
| 2976 | 2719 |
| 2977 | 3300 |
| 2978 | 1767 |
| 2979 | 3009 |
| 2980 | 3728 |
| 2981 | 1518 |
| 2982 | 2430 |
| 2983 | 3465 |
| 2984 | 2968 |
| 2985 | 1898 |
| 2986 | 3246 |
| 2987 | 2679 |
| 2988 | 1847 |
| 2989 | 3612 |
| 2990 | 2893 |
| 2991 | 3410 |
| 2992 | 1784 |
| 2993 | 2546 |
| 2994 | 3194 |
| 2995 | 1905 |
| 2996 | 3653 |
| 2997 | 2778 |
| 2998 | 3384 |
| 2999 | 1525 |
| 3000 | 2980 |
| 3001 | 3275 |
| 3002 | 1018 |
| 3003 | 2790 |
| 3004 | 3355 |
| 3005 | 2870 |
| 3006 | 1946 |
| 3007 | 3626 |
| 3008 | 2548 |
| 3009 | 1871 |
| 3010 | 3135 |
| 3011 | 2899 |
| 3012 | 3425 |
| 3013 | 1726 |
| 3014 | 2793 |
| 3015 | 3848 |
| 3016 | 1900 |
| 3017 | 3253 |
| 3018 | 2873 |
| 3019 | 3367 |
| 3020 | 2016 |
| 3021 | 2493 |
| 3022 | 3633 |
| 3023 | 2928 |
| 3024 | 1757 |
| 3025 | 3304 |
| 3026 | 2735 |
| 3027 | 1407 |
| 3028 | 3412 |
| 3029 | 2951 |
| 3030 | 3658 |
| 3031 | 1958 |
| 3032 | 2519 |
| 3033 | 3466 |
| 3034 | 1987 |
| 3035 | 3744 |
| 3036 | 2683 |
| 3037 | 3196 |
| 3038 | 1851 |
| 3039 | 2894 |
| 3040 | 3473 |
| 3041 | 3010 |

TABLE Q18-continued

| with a sequence length of 4096: | |
|---|---|
| Reliabilily or reliability sequence number | Polarized channel sequence number |
| 3042 | 1020 |
| 3043 | 3776 |
| 3044 | 2780 |
| 3045 | 1771 |
| 3046 | 3277 |
| 3047 | 2303 |
| 3048 | 3357 |
| 3049 | 1961 |
| 3050 | 3654 |
| 3051 | 2901 |
| 3052 | 3254 |
| 3053 | 1471 |
| 3054 | 2743 |
| 3055 | 3371 |
| 3056 | 2874 |
| 3057 | 1906 |
| 3058 | 3628 |
| 3059 | 2523 |
| 3060 | 1948 |
| 3061 | 3283 |
| 3062 | 2984 |
| 3063 | 3426 |
| 3064 | 1758 |
| 3065 | 3856 |
| 3066 | 2794 |
| 3067 | 3257 |
| 3068 | 1879 |
| 3069 | 2955 |
| 3070 | 3416 |
| 3071 | 2915 |
| 3072 | 1989 |
| 3073 | 3715 |
| 3074 | 2535 |
| 3075 | 1773 |
| 3076 | 3312 |
| 3077 | 3468 |
| 3078 | 2685 |
| 3079 | 1526 |
| 3080 | 3665 |
| 3081 | 2902 |
| 3082 | 3278 |
| 3083 | 991 |
| 3084 | 2876 |
| 3085 | 3358 |
| 3086 | 2801 |
| 3087 | 1908 |
| 3088 | 3634 |
| 3089 | 3167 |
| 3090 | 1962 |
| 3091 | 2552 |
| 3092 | 3657 |
| 3093 | 2905 |
| 3094 | 1853 |
| 3095 | 3474 |
| 3096 | 2767 |
| 3097 | 3399 |
| 3098 | 1779 |
| 3099 | 3599 |
| 3100 | 3012 |
| 3101 | 3285 |
| 3102 | 1969 |
| 3103 | 2957 |
| 3104 | 3489 |
| 3105 | 2494 |
| 3106 | 1883 |
| 3107 | 3717 |
| 3108 | 2747 |
| 3109 | 3258 |
| 3110 | 1529 |
| 3111 | 3872 |
| 3112 | 2917 |
| 3113 | 3373 |
| 3114 | 1990 |
| 3115 | 2963 |
| 3116 | 3299 |

TABLE Q18-continued

| with a sequence length of 4096: | |
|---|---|
| Reliabilily or reliability sequence number | Polarized channel sequence number |
| 3117 | 2525 |
| 3118 | 1774 |
| 3119 | 3636 |
| 3120 | 3428 |
| 3121 | 2796 |
| 3122 | 1964 |
| 3123 | 3183 |
| 3124 | 2992 |
| 3125 | 3607 |
| 3126 | 1912 |
| 3127 | 2958 |
| 3128 | 3379 |
| 3129 | 3718 |
| 3130 | 1993 |
| 3131 | 2686 |
| 3132 | 3476 |
| 3133 | 2847 |
| 3134 | 1007 |
| 3135 | 3286 |
| 3136 | 3660 |
| 3137 | 2539 |
| 3138 | 1854 |
| 3139 | 3374 |
| 3140 | 3016 |
| 3141 | 3260 |
| 3142 | 1530 |
| 3143 | 2802 |
| 3144 | 3721 |
| 3145 | 3403 |
| 3146 | 1781 |
| 3147 | 2906 |
| 3148 | 3666 |
| 3149 | 2965 |
| 3150 | 1935 |
| 3151 | 3289 |
| 3152 | 2526 |
| 3153 | 3432 |
| 3154 | 1895 |
| 3155 | 3843 |
| 3156 | 2804 |
| 3157 | 3490 |
| 3158 | 1970 |
| 3159 | 2918 |
| 3160 | 3301 |
| 3161 | 3640 |
| 3162 | 1663 |
| 3163 | 2921 |
| 3164 | 3381 |
| 3165 | 2749 |
| 3166 | 1885 |
| 3167 | 3611 |
| 3168 | 3231 |
| 3169 | 2541 |
| 3170 | 1994 |
| 3171 | 3521 |
| 3172 | 2979 |
| 3173 | 3681 |
| 3174 | 1532 |
| 3175 | 2908 |
| 3176 | 3480 |
| 3177 | 3623 |
| 3178 | 1899 |
| 3179 | 2775 |
| 3180 | 3191 |
| 3181 | 2863 |
| 3182 | 3405 |
| 3183 | 1727 |
| 3184 | 3845 |
| 3185 | 3024 |
| 3186 | 3290 |
| 3187 | 1019 |
| 3188 | 2547 |
| 3189 | 3668 |
| 3190 | 3492 |
| 3191 | 1972 |

TABLE Q18-continued

| with a sequence length of 4096: | |
|---|---|
| Reliabilily or reliability sequence number | Polarized channel sequence number |
| 3192 | 2966 |
| 3193 | 3302 |
| 3194 | 2779 |
| 3195 | 1943 |
| 3196 | 3722 |
| 3197 | 3382 |
| 3198 | 2969 |
| 3199 | 3729 |
| 3200 | 2001 |
| 3201 | 2981 |
| 3202 | 3411 |
| 3203 | 3613 |
| 3204 | 1886 |
| 3205 | 2791 |
| 3206 | 3305 |
| 3207 | 2542 |
| 3208 | 1782 |
| 3209 | 3385 |
| 3210 | 3627 |
| 3211 | 2922 |
| 3212 | 1503 |
| 3213 | 3440 |
| 3214 | 2871 |
| 3215 | 3904 |
| 3216 | 3247 |
| 3217 | 1996 |
| 3218 | 2808 |
| 3219 | 3463 |
| 3220 | 3682 |
| 3221 | 1947 |
| 3222 | 2929 |
| 3223 | 3195 |
| 3224 | 2549 |
| 3225 | 2002 |
| 3226 | 3672 |
| 3227 | 3406 |
| 3228 | 2970 |
| 3229 | 3522 |
| 3230 | 1901 |
| 3231 | 2895 |
| 3232 | 3724 |
| 3233 | 3292 |
| 3234 | 1785 |
| 3235 | 2750 |
| 3236 | 3614 |
| 3237 | 2924 |
| 3238 | 3413 |
| 3239 | 1976 |
| 3240 | 3849 |
| 3241 | 3040 |
| 3242 | 3255 |
| 3243 | 1907 |
| 3244 | 3386 |
| 3245 | 2781 |
| 3246 | 3730 |
| 3247 | 2431 |
| 3248 | 1959 |
| 3249 | 3496 |
| 3250 | 3655 |
| 3251 | 2982 |
| 3252 | 1015 |
| 3253 | 3306 |
| 3254 | 3745 |
| 3255 | 3011 |
| 3256 | 3467 |
| 3257 | 1519 |
| 3258 | 2875 |
| 3259 | 3629 |
| 3260 | 3427 |
| 3261 | 2017 |
| 3262 | 2795 |
| 3263 | 3197 |
| 3264 | 3846 |
| 3265 | 2985 |
| 3266 | 1786 |

TABLE Q18-continued

| with a sequence length of 4096: | |
|---|---|
| Reliabilily or reliability sequence number | Polarized channel sequence number |
| 3267 | 3414 |
| 3268 | 2495 |
| 3269 | 3684 |
| 3270 | 1949 |
| 3271 | 3388 |
| 3272 | 2930 |
| 3273 | 3635 |
| 3274 | 3313 |
| 3275 | 1902 |
| 3276 | 2972 |
| 3277 | 3417 |
| 3278 | 2782 |
| 3279 | 3732 |
| 3280 | 1909 |
| 3281 | 3279 |
| 3282 | 2903 |
| 3283 | 3630 |
| 3284 | 2004 |
| 3285 | 3524 |
| 3286 | 3013 |
| 3287 | 3857 |
| 3288 | 2797 |
| 3289 | 1963 |
| 3290 | 3469 |
| 3291 | 3659 |
| 3292 | 2550 |
| 3293 | 3259 |
| 3294 | 1788 |
| 3295 | 3429 |
| 3296 | 2932 |
| 3297 | 3688 |
| 3298 | 1531 |
| 3299 | 3475 |
| 3300 | 2986 |
| 3301 | 3746 |
| 3302 | 3308 |
| 3303 | 2018 |
| 3304 | 2877 |
| 3305 | 3850 |
| 3306 | 2803 |
| 3307 | 3504 |
| 3308 | 2008 |
| 3309 | 3637 |
| 3310 | 2993 |
| 3311 | 3470 |
| 3312 | 3777 |
| 3313 | 1950 |
| 3314 | 2907 |
| 3315 | 3198 |
| 3316 | 3736 |
| 3317 | 2553 |
| 3318 | 1910 |
| 3319 | 3359 |
| 3320 | 3528 |
| 3321 | 3014 |
| 3322 | 3661 |
| 3323 | 1759 |
| 3324 | 2798 |
| 3325 | 3314 |
| 3326 | 3858 |
| 3327 | 2988 |
| 3328 | 1021 |
| 3329 | 3418 |
| 3330 | 3748 |
| 3331 | 2936 |
| 3332 | 1965 |
| 3333 | 3477 |
| 3334 | 3638 |
| 3335 | 3017 |
| 3336 | 3316 |
| 3337 | 1913 |
| 3338 | 3667 |
| 3339 | 2878 |
| 3340 | 3430 |
| 3341 | 3968 |

TABLE Q18-continued with a sequence length of 4096:

| Reliabilily or reliability sequence number | Polarized channel sequence number |
|---|---|
| 3342 | 1991 |
| 3343 | 2554 |
| 3344 | 3433 |
| 3345 | 3641 |
| 3346 | 2805 |
| 3347 | 1971 |
| 3348 | 3261 |
| 3349 | 3696 |
| 3350 | 2959 |
| 3351 | 3491 |
| 3352 | 2020 |
| 3353 | 3719 |
| 3354 | 2919 |
| 3355 | 3420 |
| 3356 | 2994 |
| 3357 | 3287 |
| 3358 | 1527 |
| 3359 | 3852 |
| 3360 | 2687 |
| 3361 | 3375 |
| 3362 | 3662 |
| 3363 | 1966 |
| 3364 | 2909 |
| 3365 | 3536 |
| 3366 | 3778 |
| 3367 | 3018 |
| 3368 | 1775 |
| 3369 | 3478 |
| 3370 | 3669 |
| 3371 | 2556 |
| 3372 | 3291 |
| 3373 | 1914 |
| 3374 | 3873 |
| 3375 | 2923 |
| 3376 | 3481 |
| 3377 | 3642 |
| 3378 | 1995 |
| 3379 | 2751 |
| 3380 | 3493 |
| 3381 | 3752 |
| 3382 | 3303 |
| 3383 | 2996 |
| 3384 | 1855 |
| 3385 | 3723 |
| 3386 | 3434 |
| 3387 | 2967 |
| 3388 | 3905 |
| 3389 | 1973 |
| 3390 | 3383 |
| 3391 | 3025 |
| 3392 | 3683 |
| 3393 | 3320 |
| 3394 | 2024 |
| 3395 | 2910 |
| 3396 | 3670 |
| 3397 | 3441 |
| 3398 | 2806 |
| 3399 | 3860 |
| 3400 | 1916 |
| 3401 | 3482 |
| 3402 | 2527 |
| 3403 | 3644 |
| 3404 | 3407 |
| 3405 | 1787 |
| 3406 | 3020 |
| 3407 | 3673 |
| 3408 | 3262 |
| 3409 | 2971 |
| 3410 | 1997 |
| 3411 | 3780 |
| 3412 | 3436 |
| 3413 | 3026 |
| 3414 | 3874 |
| 3415 | 3552 |
| 3416 | 1974 |
| 3417 | 3293 |
| 3418 | 2925 |
| 3419 | 3494 |
| 3420 | 3725 |
| 3421 | 1533 |
| 3422 | 2809 |
| 3423 | 3523 |
| 3424 | 3685 |
| 3425 | 3000 |
| 3426 | 3387 |
| 3427 | 2003 |
| 3428 | 3864 |
| 3429 | 2931 |
| 3430 | 3307 |
| 3431 | 3731 |
| 3432 | 2983 |
| 3433 | 1022 |
| 3434 | 3497 |
| 3435 | 3760 |
| 3436 | 3442 |
| 3437 | 2543 |
| 3438 | 1977 |
| 3439 | 3726 |
| 3440 | 3484 |
| 3441 | 3041 |
| 3442 | 3876 |
| 3443 | 3294 |
| 3444 | 2032 |
| 3445 | 2810 |
| 3446 | 3615 |
| 3447 | 3415 |
| 3448 | 2973 |
| 3449 | 3784 |
| 3450 | 1998 |
| 3451 | 3525 |
| 3452 | 3847 |
| 3453 | 2926 |
| 3454 | 3309 |
| 3455 | 3674 |
| 3456 | 1783 |
| 3457 | 2933 |
| 3458 | 3444 |
| 3459 | 3733 |
| 3460 | 3498 |
| 3461 | 1887 |
| 3462 | 3028 |
| 3463 | 3969 |
| 3464 | 3389 |
| 3465 | 2987 |
| 3466 | 3686 |
| 3467 | 2005 |
| 3468 | 3315 |
| 3469 | 2812 |
| 3470 | 3689 |
| 3471 | 3747 |
| 3472 | 3505 |
| 3473 | 1978 |
| 3474 | 2555 |
| 3475 | 3906 |
| 3476 | 3419 |
| 3477 | 3042 |
| 3478 | 3676 |
| 3479 | 2019 |
| 3480 | 3526 |
| 3481 | 3631 |
| 3482 | 3032 |
| 3483 | 3310 |
| 3484 | 3851 |
| 3485 | 1903 |
| 3486 | 2974 |
| 3487 | 3500 |
| 3488 | 3792 |
| 3489 | 3448 |
| 3490 | 2934 |
| 3491 | 2006 |

TABLE Q18-continued

| with a sequence length of 4096: | |
|---|---|
| Reliabilily or reliability sequence number | Polarized channel sequence number |
| 3492 | 3734 |
| 3493 | 3529 |
| 3494 | 2783 |
| 3495 | 3880 |
| 3496 | 3390 |
| 3497 | 1980 |
| 3498 | 3737 |
| 3499 | 2989 |
| 3500 | 3317 |
| 3501 | 3749 |
| 3502 | 2937 |
| 3503 | 3471 |
| 3504 | 2009 |
| 3505 | 3908 |
| 3506 | 3690 |
| 3507 | 3015 |
| 3508 | 3431 |
| 3509 | 3639 |
| 3510 | 1534 |
| 3511 | 2995 |
| 3512 | 3506 |
| 3513 | 3970 |
| 3514 | 3199 |
| 3515 | 3044 |
| 3516 | 1789 |
| 3517 | 3697 |
| 3518 | 3421 |
| 3519 | 3738 |
| 3520 | 2551 |
| 3521 | 3530 |
| 3522 | 3859 |
| 3523 | 2021 |
| 3524 | 2990 |
| 3525 | 3663 |
| 3526 | 3435 |
| 3527 | 3692 |
| 3528 | 2799 |
| 3529 | 1951 |
| 3530 | 3263 |
| 3531 | 3853 |
| 3532 | 3508 |
| 3533 | 2938 |
| 3534 | 3808 |
| 3535 | 3479 |
| 3536 | 1911 |
| 3537 | 3750 |
| 3538 | 3019 |
| 3539 | 3537 |
| 3540 | 3888 |
| 3541 | 2879 |
| 3542 | 2010 |
| 3543 | 3779 |
| 3544 | 3422 |
| 3545 | 3643 |
| 3546 | 2997 |
| 3547 | 3318 |
| 3548 | 3854 |
| 3549 | 2022 |
| 3550 | 3532 |
| 3551 | 3048 |
| 3552 | 3753 |
| 3553 | 3912 |
| 3554 | 3483 |
| 3555 | 2940 |
| 3556 | 2025 |
| 3557 | 3698 |
| 3558 | 3538 |
| 3559 | 3740 |
| 3560 | 2811 |
| 3561 | 3437 |
| 3562 | 3861 |
| 3563 | 1967 |
| 3564 | 3321 |
| 3565 | 3021 |
| 3566 | 3671 |

TABLE Q18-continued

| with a sequence length of 4096: | |
|---|---|
| Reliabilily or reliability sequence number | Polarized channel sequence number |
| 3567 | 3781 |
| 3568 | 3512 |
| 3569 | 1915 |
| 3570 | 2998 |
| 3571 | 3972 |
| 3572 | 3443 |
| 3573 | 3700 |
| 3574 | 2557 |
| 3575 | 3875 |
| 3576 | 2012 |
| 3577 | 3495 |
| 3578 | 3754 |
| 3579 | 3027 |
| 3580 | 3553 |
| 3581 | 3645 |
| 3582 | 3322 |
| 3583 | 3001 |
| 3584 | 1023 |
| 3585 | 3866 |
| 3586 | 3761 |
| 3587 | 3485 |
| 3588 | 3056 |
| 3589 | 3675 |
| 3590 | 3438 |
| 3591 | 1790 |
| 3592 | 3920 |
| 3593 | 3022 |
| 3594 | 3782 |
| 3595 | 3445 |
| 3596 | 3877 |
| 3597 | 2807 |
| 3598 | 1975 |
| 3599 | 3540 |
| 3600 | 3756 |
| 3601 | 3499 |
| 3602 | 2911 |
| 3603 | 3704 |
| 3604 | 3865 |
| 3605 | 2026 |
| 3606 | 3324 |
| 3607 | 3029 |
| 3608 | 3785 |
| 3609 | 3554 |
| 3610 | 3862 |
| 3611 | 3646 |
| 3612 | 3002 |
| 3613 | 1917 |
| 3614 | 3544 |
| 3615 | 3976 |
| 3616 | 3486 |
| 3617 | 3043 |
| 3618 | 3727 |
| 3619 | 3687 |
| 3620 | 2033 |
| 3621 | 3446 |
| 3622 | 2927 |
| 3623 | 3878 |
| 3624 | 3762 |
| 3625 | 3295 |
| 3626 | 3030 |
| 3627 | 3936 |
| 3628 | 1999 |
| 3629 | 3501 |
| 3630 | 3677 |
| 3631 | 3786 |
| 3632 | 3004 |
| 3633 | 3449 |
| 3634 | 3907 |
| 3635 | 3527 |
| 3636 | 1979 |
| 3637 | 3033 |
| 3638 | 3691 |
| 3639 | 3881 |
| 3640 | 3507 |
| 3641 | 3764 |

TABLE Q18-continued with a sequence length of 4096:

| Reliabilily or reliability sequence number | Polarized channel sequence number |
|---|---|
| 3642 | 2558 |
| 3643 | 3984 |
| 3644 | 1535 |
| 3645 | 3556 |
| 3646 | 3735 |
| 3647 | 2813 |
| 3648 | 3502 |
| 3649 | 3793 |
| 3650 | 3868 |
| 3651 | 3311 |
| 3652 | 2028 |
| 3653 | 3045 |
| 3654 | 3678 |
| 3655 | 3909 |
| 3656 | 3450 |
| 3657 | 3788 |
| 3658 | 2975 |
| 3659 | 3531 |
| 3660 | 1918 |
| 3661 | 3882 |
| 3662 | 3739 |
| 3663 | 2935 |
| 3664 | 3391 |
| 3665 | 3889 |
| 3666 | 3794 |
| 3667 | 3509 |
| 3668 | 2034 |
| 3669 | 3034 |
| 3670 | 3693 |
| 3671 | 3914 |
| 3672 | 3560 |
| 3673 | 3768 |
| 3674 | 3046 |
| 3675 | 3452 |
| 3676 | 2036 |
| 3677 | 4000 |
| 3678 | 3699 |
| 3679 | 3323 |
| 3680 | 3049 |
| 3681 | 4032 |
| 3682 | 3751 |
| 3683 | 3533 |
| 3684 | 3910 |
| 3685 | 1981 |
| 3686 | 2991 |
| 3687 | 3809 |
| 3688 | 3510 |
| 3689 | 3884 |
| 3690 | 2939 |
| 3691 | 3741 |
| 3692 | 3539 |
| 3693 | 3971 |
| 3694 | 2007 |
| 3695 | 3694 |
| 3696 | 3036 |
| 3697 | 3513 |
| 3698 | 3921 |
| 3699 | 3701 |
| 3700 | 3568 |
| 3701 | 3796 |
| 3702 | 1791 |
| 3703 | 2814 |
| 3704 | 3534 |
| 3705 | 3890 |
| 3706 | 3755 |
| 3707 | 3319 |
| 3708 | 2999 |
| 3709 | 3913 |
| 3710 | 3810 |
| 3711 | 3423 |
| 3712 | 2011 |
| 3713 | 3855 |
| 3714 | 3050 |
| 3715 | 3800 |
| 3716 | 3973 |

TABLE Q18-continued with a sequence length of 4096:

| Reliabilily or reliability sequence number | Polarized channel sequence number |
|---|---|
| 3717 | 3541 |
| 3718 | 3742 |
| 3719 | 2941 |
| 3720 | 3892 |
| 3721 | 2023 |
| 3722 | 3514 |
| 3723 | 3702 |
| 3724 | 3863 |
| 3725 | 3555 |
| 3726 | 3057 |
| 3727 | 3757 |
| 3728 | 3974 |
| 3729 | 3439 |
| 3730 | 2040 |
| 3731 | 3705 |
| 3732 | 3023 |
| 3733 | 3916 |
| 3734 | 3542 |
| 3735 | 3783 |
| 3736 | 3763 |
| 3737 | 3003 |
| 3738 | 3516 |
| 3739 | 3812 |
| 3740 | 1982 |
| 3741 | 3977 |
| 3742 | 3545 |
| 3743 | 3758 |
| 3744 | 2559 |
| 3745 | 3922 |
| 3746 | 3706 |
| 3747 | 3325 |
| 3748 | 3896 |
| 3749 | 3787 |
| 3750 | 2013 |
| 3751 | 3052 |
| 3752 | 3557 |
| 3753 | 3867 |
| 3754 | 3647 |
| 3755 | 3487 |
| 3756 | 3937 |
| 3757 | 2942 |
| 3758 | 3765 |
| 3759 | 3879 |
| 3760 | 2027 |
| 3761 | 3447 |
| 3762 | 3816 |
| 3763 | 3058 |
| 3764 | 3924 |
| 3765 | 3546 |
| 3766 | 3978 |
| 3767 | 3708 |
| 3768 | 3558 |
| 3769 | 3060 |
| 3770 | 2014 |
| 3771 | 3985 |
| 3772 | 3789 |
| 3773 | 3869 |
| 3774 | 3561 |
| 3775 | 3766 |
| 3776 | 3005 |
| 3777 | 3883 |
| 3778 | 3503 |
| 3779 | 3795 |
| 3780 | 3938 |
| 3781 | 2029 |
| 3782 | 3769 |
| 3783 | 3451 |
| 3784 | 3031 |
| 3785 | 3928 |
| 3786 | 3824 |
| 3787 | 3548 |
| 3788 | 3980 |
| 3789 | 3790 |
| 3790 | 2815 |
| 3791 | 3870 |

TABLE Q18-continued

| with a sequence length of 4096: | |
|---|---|
| Reliabilily or reliability sequence number | Polarized channel sequence number |
| 3792 | 2035 |
| 3793 | 3326 |
| 3794 | 3679 |
| 3795 | 3986 |
| 3796 | 3911 |
| 3797 | 3035 |
| 3798 | 3511 |
| 3799 | 3797 |
| 3800 | 4001 |
| 3801 | 3770 |
| 3802 | 3562 |
| 3803 | 2030 |
| 3804 | 3885 |
| 3805 | 3047 |
| 3806 | 3811 |
| 3807 | 3453 |
| 3808 | 3940 |
| 3809 | 3695 |
| 3810 | 3891 |
| 3811 | 3569 |
| 3812 | 3064 |
| 3813 | 3988 |
| 3814 | 3798 |
| 3815 | 2037 |
| 3816 | 3886 |
| 3817 | 3535 |
| 3818 | 3772 |
| 3819 | 3006 |
| 3820 | 3915 |
| 3821 | 3801 |
| 3822 | 3515 |
| 3823 | 3944 |
| 3824 | 4002 |
| 3825 | 3813 |
| 3826 | 3564 |
| 3827 | 1919 |
| 3828 | 3037 |
| 3829 | 3893 |
| 3830 | 3743 |
| 3831 | 4033 |
| 3832 | 3454 |
| 3833 | 3992 |
| 3834 | 3703 |
| 3835 | 3051 |
| 3836 | 3917 |
| 3837 | 3570 |
| 3838 | 3802 |
| 3839 | 4004 |
| 3840 | 1983 |
| 3841 | 3814 |
| 3842 | 3894 |
| 3843 | 3038 |
| 3844 | 3572 |
| 3845 | 3923 |
| 3846 | 3817 |
| 3847 | 3897 |
| 3848 | 3517 |
| 3849 | 3952 |
| 3850 | 3759 |
| 3851 | 3053 |
| 3852 | 3975 |
| 3853 | 2038 |
| 3854 | 3543 |
| 3855 | 3707 |
| 3856 | 3918 |
| 3857 | 4034 |
| 3858 | 3804 |
| 3859 | 3327 |
| 3860 | 3059 |
| 3861 | 3925 |
| 3862 | 3767 |
| 3863 | 3898 |
| 3864 | 3547 |
| 3865 | 4008 |
| 3866 | 2041 |

TABLE Q18-continued

| with a sequence length of 4096: | |
|---|---|
| Reliabilily or reliability sequence number | Polarized channel sequence number |
| 3867 | 3818 |
| 3868 | 3979 |
| 3869 | 3054 |
| 3870 | 3939 |
| 3871 | 3559 |
| 3872 | 3709 |
| 3873 | 3926 |
| 3874 | 3900 |
| 3875 | 3825 |
| 3876 | 3576 |
| 3877 | 3061 |
| 3878 | 3929 |
| 3879 | 3791 |
| 3880 | 4036 |
| 3881 | 2042 |
| 3882 | 3981 |
| 3883 | 3518 |
| 3884 | 3771 |
| 3885 | 3941 |
| 3886 | 3987 |
| 3887 | 2943 |
| 3888 | 3549 |
| 3889 | 3820 |
| 3890 | 4016 |
| 3891 | 3982 |
| 3892 | 3710 |
| 3893 | 3871 |
| 3894 | 3563 |
| 3895 | 4040 |
| 3896 | 2044 |
| 3897 | 3007 |
| 3898 | 3826 |
| 3899 | 3930 |
| 3900 | 3989 |
| 3901 | 3550 |
| 3902 | 3828 |
| 3903 | 3942 |
| 3904 | 3945 |
| 3905 | 3773 |
| 3906 | 3062 |
| 3907 | 3565 |
| 3908 | 4003 |
| 3909 | 3932 |
| 3910 | 3799 |
| 3911 | 3887 |
| 3912 | 2015 |
| 3913 | 4048 |
| 3914 | 3571 |
| 3915 | 3990 |
| 3916 | 3803 |
| 3917 | 3065 |
| 3918 | 3993 |
| 3919 | 4005 |
| 3920 | 3815 |
| 3921 | 3566 |
| 3922 | 3946 |
| 3923 | 3895 |
| 3924 | 3832 |
| 3925 | 3953 |
| 3926 | 3573 |
| 3927 | 3066 |
| 3928 | 3994 |
| 3929 | 2031 |
| 3930 | 3919 |
| 3931 | 3774 |
| 3932 | 3948 |
| 3933 | 4064 |
| 3934 | 3805 |
| 3935 | 3455 |
| 3936 | 4006 |
| 3937 | 4035 |
| 3938 | 3899 |
| 3939 | 3068 |
| 3940 | 3819 |
| 3941 | 4009 |

TABLE Q18-continued with a sequence length of 4096:

| Reliabilily or reliability sequence number | Polarized channel sequence number |
|---|---|
| 3942 | 3519 |
| 3943 | 3954 |
| 3944 | 3996 |
| 3945 | 3806 |
| 3946 | 3927 |
| 3947 | 2043 |
| 3948 | 4037 |
| 3949 | 3821 |
| 3950 | 3574 |
| 3951 | 3039 |
| 3952 | 3956 |
| 3953 | 4010 |
| 3954 | 3901 |
| 3955 | 3827 |
| 3956 | 4017 |
| 3957 | 3931 |
| 3958 | 3577 |
| 3959 | 4038 |
| 3960 | 3822 |
| 3961 | 4012 |
| 3962 | 3960 |
| 3963 | 4041 |
| 3964 | 3055 |
| 3965 | 3902 |
| 3966 | 3578 |
| 3967 | 3829 |
| 3968 | 2039 |
| 3969 | 3983 |
| 3970 | 3943 |
| 3971 | 4018 |
| 3972 | 3711 |
| 3973 | 3933 |
| 3974 | 4042 |
| 3975 | 3580 |
| 3976 | 3947 |
| 3977 | 3775 |
| 3978 | 3067 |
| 3979 | 4020 |
| 3980 | 3991 |
| 3981 | 4049 |
| 3982 | 3934 |
| 3983 | 3830 |
| 3984 | 3551 |
| 3985 | 4044 |
| 3986 | 3995 |
| 3987 | 4050 |
| 3988 | 3949 |
| 3989 | 3833 |
| 3990 | 2045 |
| 3991 | 4024 |
| 3992 | 3955 |
| 3993 | 4007 |
| 3994 | 3063 |
| 3995 | 3567 |
| 3996 | 4065 |
| 3997 | 3834 |
| 3998 | 3997 |
| 3999 | 3950 |
| 4000 | 3957 |
| 4001 | 4052 |
| 4002 | 4011 |
| 4003 | 3836 |
| 4004 | 3579 |
| 4005 | 4066 |
| 4006 | 4056 |
| 4007 | 3998 |
| 4008 | 3958 |
| 4009 | 3807 |
| 4010 | 3069 |
| 4011 | 4013 |
| 4012 | 3961 |
| 4013 | 4039 |
| 4014 | 4019 |
| 4015 | 4068 |
| 4016 | 2046 |

TABLE Q18-continued with a sequence length of 4096:

| Reliabilily or reliability sequence number | Polarized channel sequence number |
|---|---|
| 4017 | 3575 |
| 4018 | 4014 |
| 4019 | 3823 |
| 4020 | 3962 |
| 4021 | 4043 |
| 4022 | 3903 |
| 4023 | 4021 |
| 4024 | 4072 |
| 4025 | 3964 |
| 4026 | 3835 |
| 4027 | 4045 |
| 4028 | 4022 |
| 4029 | 3581 |
| 4030 | 4051 |
| 4031 | 3070 |
| 4032 | 4025 |
| 4033 | 4080 |
| 4034 | 4046 |
| 4035 | 3831 |
| 4036 | 3935 |
| 4037 | 4053 |
| 4038 | 4026 |
| 4039 | 4067 |
| 4040 | 3951 |
| 4041 | 4054 |
| 4042 | 4028 |
| 4043 | 4057 |
| 4044 | 3582 |
| 4045 | 3837 |
| 4046 | 4069 |
| 4047 | 3999 |
| 4048 | 3959 |
| 4049 | 2047 |
| 4050 | 4058 |
| 4051 | 4070 |
| 4052 | 4073 |
| 4053 | 4015 |
| 4054 | 3963 |
| 4055 | 4060 |
| 4056 | 3071 |
| 4057 | 3838 |
| 4058 | 4023 |
| 4059 | 4074 |
| 4060 | 3965 |
| 4061 | 4081 |
| 4062 | 4047 |
| 4063 | 4027 |
| 4064 | 3583 |
| 4065 | 4076 |
| 4066 | 3966 |
| 4067 | 4082 |
| 4068 | 4084 |
| 4069 | 4029 |
| 4070 | 4055 |
| 4071 | 3839 |
| 4072 | 4059 |
| 4073 | 4071 |
| 4074 | 4088 |
| 4075 | 4030 |
| 4076 | 4061 |
| 4077 | 4075 |
| 4078 | 4062 |
| 4079 | 4077 |
| 4080 | 4083 |
| 4081 | 4078 |
| 4082 | 4085 |
| 4083 | 3967 |
| 4084 | 4031 |
| 4085 | 4086 |
| 4086 | 4089 |
| 4087 | 4090 |
| 4088 | 4092 |
| 4089 | 4063 |
| 4090 | 4079 |
| 4091 | 4091 |

TABLE Q18-continued

| with a sequence length of 4096: | |
|---|---|
| Reliabilily or reliability sequence number | Polarized channel sequence number |
| 4092 | 4087 |
| 4093 | 4093 |
| 4094 | 4094 |
| 4095 | 4095 |

Sequence Q19, with a sequence length of 2048:

[0, 1, 2, 4, 8, 16, 32, 3, 256, 512, 1024, 5, 64, 9, 6, 17, 10, 18, 128, 12, 33, 65, 20, 34, 24, 3 6, 257, 7, 129, 66, 11, 40, 68, 513, 130, 19, 13, 48, 14, 1025, 72, 258, 21, 132, 35, 26, 80, 37, 25, 22, 136, 514, 260, 38, 96, 67, 41, 144, 28, 69, 42, 264, 49, 74, 1026, 160, 516, 192, 70, 44, 272, 131, 81, 50, 73, 15, 133, 288, 520, 52, 23, 134, 76, 1028, 137, 82, 259, 56, 27, 97, 528, 39, 261, 84, 138, 14 5, 29, 43, 320, 1032, 544, 98, 88, 140, 30, 265, 146, 71, 161, 515, 45, 262, 100, 51, 1040, 148, 46, 2 73, 768, 75, 104, 162, 266, 53, 193, 152, 517, 77, 1056, 274, 164, 54, 83, 384, 576, 57, 112, 135, 2 68, 78, 1027, 194, 521, 85, 289, 58, 168, 139, 321, 518, 99, 1280, 86, 276, 60, 89, 529, 196, 290, 1 41, 101, 280, 1536, 147, 522, 176, 142, 292, 31, 200, 530, 263, 1029, 90, 149, 385, 640, 102, 105, 163, 322, 92, 1088, 524, 47, 267, 208, 150, 545, 296, 153, 165, 1033, 324, 577, 106, 55, 386, 113, 154, 1030, 532, 275, 79, 108, 546, 269, 224, 166, 1041, 304, 536, 195, 59, 270, 169, 548, 1034, 3 28, 114, 156, 277, 769, 87, 197, 1042, 388, 519, 116, 291, 170, 61, 641, 1152, 282, 177, 91, 578, 3 36, 198, 293, 1036, 172, 523, 120, 281, 201, 552, 1057, 278, 62, 392, 580, 143, 103, 294, 1089, 6 42, 178, 352, 93, 531, 202, 1044, 323, 107, 525, 297, 180, 1058, 400, 560, 151, 209, 284, 526, 10 48, 94, 325, 204, 584, 298, 155, 1060, 770, 305, 210, 109, 533, 1281, 330, 184, 416, 644, 115, 10 31, 448, 547, 167, 326, 225, 538, 1153, 300, 157, 592, 387, 110, 1090, 337, 549, 117, 212, 537, 1 035, 306, 171, 329, 534, 226, 1064, 271, 648, 216, 389, 1092, 772, 158, 308, 550, 118, 1537, 279, 173, 608, 390, 121, 1154, 579, 332, 199, 553, 1043, 179, 228, 656, 393, 1037, 174, 540, 338, 12 2, 581, 1072, 312, 203, 283, 554, 1038, 63, 353, 776, 181, 1096, 295, 561, 232, 340, 1282, 586, 3 94, 672, 124, 401, 1045, 704, 205, 285, 582, 1156, 182, 299, 556, 211, 1059, 354, 784, 185, 1050, 344, 643, 240, 396, 1104, 593, 206, 286, 562, 1061, 95, 585, 402, 327, 1049, 527, 213, 417, 104 6, 645, 186, 800, 301, 1160, 227, 564, 356, 111, 1538, 535, 307, 646, 1284, 404, 214, 588, 302, 1 062, 188, 649, 331, 1120, 594, 217, 360, 771, 1091, 418, 229, 568, 1065, 309, 539, 159, 1168, 44 9, 609, 408, 551, 1052, 119, 333, 773, 1093, 218, 596, 420, 1066, 230, 650, 310, 1288, 657, 339, 541, 1073, 233, 313, 555, 1098, 368, 832, 175, 1184, 391, 610, 123, 1540, 600, 334, 450, 1216, 6 52, 220, 542, 1094, 341, 777, 183, 1068, 314, 658, 424, 1296, 583, 234, 673, 1155, 395, 557, 355, 1105, 125, 774, 342, 1074, 612, 316, 563, 1097, 241, 345, 660, 1039, 207, 558, 1157, 452, 785, 397, 1312, 587, 187, 357, 1544, 616, 403, 1076, 674, 236, 778, 1047, 432, 565, 398, 1158, 705, 1 26, 1100, 664, 287, 456, 1161, 589, 242, 1106, 786, 346, 676, 1283, 405, 566, 1080, 244, 595, 35 8, 1051, 896, 361, 1121, 569, 189, 624, 1552, 419, 647, 1063, 348, 215, 780, 1285, 303, 590, 110 8, 464, 706, 406, 1162, 597, 219, 1169, 801, 409, 1053, 570, 421, 680, 1067, 231, 651, 1344, 362, 833, 1568, 311, 611, 1122, 248, 598, 369, 1112, 788, 410, 1164, 572, 335, 1054, 601, 190, 1289, 708, 364, 1170, 802, 480, 221, 1095, 422, 653, 1185, 451, 613, 1539, 315, 792, 1069, 235, 659, 1 286, 425, 688, 1124, 370, 654, 1075, 412, 804, 1172, 222, 543, 343, 1070, 712, 453, 1297, 775, 2 37, 1792, 602, 372, 1099, 661, 426, 1128, 897, 317, 1186, 614, 243, 1290, 617, 675, 1077, 433, 1 217, 834, 347, 1176, 604, 454, 1541, 559, 238, 1101, 779, 428, 1298, 720, 376, 1188, 662, 457, 1 078, 808, 318, 1107, 665, 245, 1408, 677, 1600, 399, 836, 1081, 618, 359, 1136, 567, 434, 1159, 898, 127, 1292, 625, 349, 1102, 666, 1218, 458, 787, 1545, 591, 363, 1109, 620, 191, 1313, 781, 1082, 436, 736, 1192, 407, 678, 1163, 465, 1345, 816, 707, 1542, 350, 571, 1123, 246, 1110, 782, 460, 1300, 681, 840, 1084, 411, 1113, 626, 466, 1553, 668, 365, 1220, 789, 1314, 249, 599, 116 5, 709, 440, 1125, 900, 1304, 371, 628, 1171, 803, 1546, 423, 682, 1200, 481, 573, 1166, 250, 13 16, 794, 689, 1055, 413, 1224, 603, 366, 1554, 848, 1287, 710, 373, 1114, 805, 1173, 468, 684, 1 409, 427, 1664, 632, 793, 1126, 252, 1129, 713, 482, 1187, 790, 1346, 574, 472, 1116, 904, 1548, 414, 1071, 655, 615, 1291, 374, 1232, 806, 690, 1174, 223, 1569, 864, 429, 1320, 605, 1177, 71 4, 1189, 377, 835, 1348, 455, 1601, 619, 809, 1130, 435, 1079, 692, 1410, 912, 484, 1137, 663, 1 178, 430, 1556, 721, 796, 1299, 239, 1103, 606, 1132, 837, 378, 1570, 716, 1293, 459, 1248, 81 0, 1190, 667, 319, 1328, 817, 1560, 722, 1219, 437, 621, 1083, 842, 1294, 488, 1193, 696, 1572, 380, 928, 1352, 627, 1138, 251, 180, 960, 1301, 679, 461, 1793, 838, 1111, 737, 1221, 438, 141 2, 812, 669, 1543, 467, 140, 899, 1315, 622, 1194, 441, 1085, 849, 1665, 629, 496, 1306, 724, 1 201, 462, 1115, 818, 1602, 683, 1360, 247, 1222, 841, 738, 1317, 351, 196, 783, 1547, 728, 114 4, 901, 1305, 469, 1225, 670, 1576, 820, 442, 1302, 630, 1086, 791, 1416, 483, 1604, 685, 1167, 902, 1127, 367, 1318, 633, 1666, 844, 1202, 470, 1376, 711, 1117, 691, 444, 1555, 740, 1226, 90 5, 1347, 473, 1131, 686, 1549, 850, 1321, 634, 1204, 253, 1424, 824, 1584, 715, 1175, 485, 123 3, 795, 1308, 575, 1550, 415, 1118, 865, 1349, 693, 1228, 807, 1608, 375, 1322, 744, 1179, 852, 1794, 474, 1329, 906, 1234, 636, 1133, 486, 1557, 913, 1354, 717, 1208, 797, 1440, 489, 1668, 694, 1139, 811, 1472, 431, 1571, 723, 1191, 866, 697, 379, 1350, 856, 1249, 752, 1562, 476, 13 24, 908, 1181, 718, 1616, 798, 1411, 254, 1134, 607, 1361, 914, 1573, 839, 1141, 439, 1236, 725, 1561, 929, 1330, 698, 1195, 490, 1353, 813, 1558, 739, 1250, 381, 1295, 868, 1672, 623, 1240, 819, 1413, 497, 1796, 916, 1182, 726, 1332, 814, 1574, 463, 1142, 700, 1303, 843, 1197, 729, 1 632, 443, 1414, 1145, 872, 1603, 930, 1356, 741, 1223, 492, 1577, 821, 1203, 671, 1252, 61, 1 680, 382, 1417, 920, 1198, 631, 1564, 845, 1362, 498, 1146, 1605, 730, 1336, 932, 1227, 742, 1 307, 822, 1578, 500, 1087, 851, 1377, 745, 1800, 1205, 825, 1319, 445, 1585, 880, 1256, 687, 1 364, 903, 1610, 471, 1418, 1696, 635, 1148, 846, 1425, 962, 1728, 732, 1229, 255, 1309, 1606, 853, 1206, 695, 1323, 826, 1580, 475, 1235, 936, 1378, 1808, 746, 1209, 907, 1368, 867, 1667, 487, 1264, 1420, 637, 1617, 854, 1230, 828, 1310, 753, 1586, 1119, 504, 1609, 857, 1426, 719, 1351, 1551, 964, 1237, 909, 1441, 446, 1669, 699, 1210, 1824, 869, 1325, 915, 1251, 477, 1588, 1380, 748, 1135, 944, 1559, 910, 1331, 1670, 638, 1428, 799, 1238, 1612, 491, 1326, 968, 121 2, 754, 1673, 1355, 858, 1618, 917, 1241, 478, 1384, 1795, 756, 1442, 870, 1253, 1592, 873, 13 33, 701, 1563, 1183, 493, 1473, 931, 1633, 860, 1432, 1575, 727, 1143, 815, 1357, 1797, 976, 1 242, 499, 1620, 1444, 918, 1254, 731, 1674, 1334, 921, 1681, 933, 1363, 1565, 743, 1257, 494, 1337, 1579, 874, 1392, 823, 1856, 1199, 760, 1415, 1634, 881, 1147, 501, 1624, 1358, 922, 147 4, 847, 1676, 1244, 702, 1566, 876, 1365, 1801, 992, 1207, 1338, 733, 1682, 383, 1448, 1607, 9 34, 1258, 1697, 963, 1419, 827, 1581, 1379, 747, 1149, 1798, 937, 1366, 447, 1636, 1340, 882, 1587, 1265, 924, 1369, 734, 1684, 1231, 855, 1582, 1476, 965, 1809, 749, 1421, 1611, 502, 121 1, 1381, 884, 1640, 1427, 938, 1698, 1260, 829, 1802, 755, 1456, 1589, 945, 1422, 1729, 859, 1 150, 1688, 505, 1311, 1480, 966, 1613, 750, 1266, 1810, 940, 1370, 1700, 888, 1429, 1590, 969, 1268, 1619, 830, 1382, 1920, 506, 1385, 1593, 757, 1213, 1648, 911, 1443, 1671, 871, 1372, 9 46, 1239, 1804, 639, 1327, 1614, 861, 1488, 1730, 970, 1430, 1621, 508, 1243, 1825, 875, 1433, 1594, 703, 1445, 1704, 1255, 948, 1675, 1386, 919, 1857, 1335, 977, 1635, 1272, 862, 1622, 1 393, 758, 1812, 1434, 479, 1596, 1359, 972, 1625, 1214, 923, 1732, 1388, 978, 1826, 1504, 124 5, 877, 1446, 1677, 761, 1475, 1637, 952, 1339, 1816, 883, 1259, 1683, 935, 1449, 1712, 1394, 495, 1678, 1436, 993, 1828, 1246, 762, 1567, 1367, 925, 1736, 1477, 1799, 878, 1261, 1626, 88 5, 1396, 1685, 1450, 980, 1921, 1341, 939, 1638, 1267, 764, 1641, 1699, 1457, 507, 1858, 1371, 994, 1628, 1478, 1583, 984, 1262, 1803, 926, 1452, 1744, 1400, 886, 1686, 1481, 735, 1832, 1 342, 1689, 941, 1269, 1701, 889, 1423, 1860, 1642, 967, 1383, 1591, 947, 1458, 1922, 1151, 99 6, 1649, 1373, 1690, 503, 1482, 1811, 942, 1615, 1387, 1644, 751, 1215, 1805, 1460, 890, 1760, 1431, 1702, 971, 1489, 1840, 831, 1731, 1374, 1595, 949, 1270, 1806, 1484, 1000, 1705, 1864, 1435, 892, 1650, 1490, 1692, 763, 1389, 1813, 1273, 973, 1623, 1733, 1464, 950, 1924, 1395, 1652, 509, 1827, 1447, 1706, 979, 1505, 1597, 1274, 953, 1818, 1713, 1437, 1008, 1627, 1390, 1872, 974, 1734, 1397, 1829, 759, 1492, 1708, 1451, 863, 1656, 1817, 1276, 981, 1737, 1506, 1 814, 1598, 954, 1496, 1928, 1438, 995, 1679, 1639, 1398, 879, 1830, 1714, 1247, 982, 1888, 14 53, 1629, 1738, 956, 1401, 1859, 1479, 985, 1643, 1833, 1459, 1716, 510, 1936, 1508, 1687, 76 5, 1454, 1745, 1820, 1263, 997, 1630, 1861, 1402, 1740, 927, 1483, 1834, 1691, 887, 1343, 184 1, 1746, 1461, 986, 1645, 1866, 1512, 1720, 998, 1404, 1952, 1651, 1275, 1001, 1984, 1703, 14 85, 1862, 943, 1761, 1462, 1836, 891, 1693, 1491, 1923, 1646, 988, 1465, 1873, 1653, 1520, 17 48, 766, 1486, 1842, 1707, 1271, 951, 1865, 1762, 1375, 1807, 1002, 1752, 1925, 1493, 1694, 8 93, 1844, 1466, 1654, 1815, 1507, 1009, 1709, 1926, 1391, 1657, 975, 1868, 1494, 1735, 1715, 955, 1468, 1764, 1929, 1497, 1710, 511, 1874, 1658, 1277, 1848, 1739, 1004, 1509, 1819, 159 9, 1439, 1889, 894, 1717, 1831, 1399, 1768, 1010, 1876, 1498, 1930, 1660, 1510, 1012, 1937, 1 741, 1821, 1513, 1718, 957, 1835, 1455, 1747, 1890, 1721, 1403, 983, 1880, 1776, 1500, 1932, 1742, 767, 1822, 1278, 1631, 1938, 1863, 987, 1463, 1749, 1953, 1722, 1514, 1837, 999, 1763, 1405, 1892, 1647, 1843, 1521, 1016, 1940, 1750, 1838, 1487, 1724, 958, 1867, 1753, 1467, 18 96, 1954, 1765, 1516, 989, 1845, 1695, 1985, 1406, 1944, 1655, 1003, 1869, 1522, 1754, 1956, 1766, 1846, 990, 1524, 1875, 1769, 1849, 1469, 1904, 1711, 1005, 1927, 1495, 1659, 1870, 19 86, 1756, 1279, 1011, 1877, 1719, 1850, 1499, 1960, 1770, 1931, 1006, 1891, 1511, 1661, 187 8, 1852, 1777, 1528, 1013, 1881, 1743, 1988, 1933, 1470, 1723, 1893, 1939, 895, 1501, 1772, 1 968, 1934, 1662, 1823, 1515, 1992, 959, 1778, 1882, 1941, 1502, 1780, 1894, 1897, 1725, 101 4, 1517, 1955, 1884, 1751, 1839, 2000, 1523, 1942, 1755, 1017, 1945, 1957, 1767, 1518, 1898, 1847, 1784, 1905, 1525, 1018, 1946, 1871, 1726, 1900, 2016, 1757, 1407, 1958, 1987, 1851, 1 020, 1771, 1961, 1471, 1906, 1948, 1758, 1879, 1989, 1773, 1526, 991, 1908, 1962, 1853, 177 9, 1969, 1883, 1529, 1990, 1774, 1964, 1912, 1993, 1007, 1854, 1530, 1781, 1935, 1895, 1970, 1663, 1885, 1994, 1532, 1899, 1727, 1019, 1972, 1943, 2001, 1886, 1782, 1503, 1996, 1947, 2 002, 1901, 1785, 1976, 1907, 1959, 1015, 1519, 2017, 1786, 1949, 1902, 1909, 2004, 1963, 17 88, 1531, 2018, 2008, 1950, 1910, 1759, 1021, 1965, 1913, 1991, 1971, 2020, 1527, 1966, 177 5, 1914, 1995, 1855, 1973, 2024, 1916, 1787, 1997, 1974, 1533, 2003, 1022, 1977, 2032, 1998, 1783, 1887, 2005, 1978, 2019, 1903, 2006, 1980, 2009, 1534, 1789, 2021, 1951, 1911, 2010, 2 022, 2025, 1967, 1915, 2012, 1023, 1790, 1975, 2026, 1917, 2033, 1999, 1979, 1535, 2028, 19 18, 2034, 2036, 1981, 2007, 1791, 2011, 2023, 2040, 1982, 2013, 2027, 2014, 2029, 2035, 203 0, 2037, 1919, 1983, 2038, 2041, 2042, 2044, 2015, 2031, 2043, 2039, 2045, 2046, 2047]

TABLE Q19 with a sequence length of 2048:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 256 |
| 9 | 512 |
| 10 | 1024 |
| 11 | 5 |
| 12 | 64 |
| 13 | 9 |
| 14 | 6 |
| 15 | 17 |
| 16 | 10 |
| 17 | 18 |
| 18 | 128 |
| 19 | 12 |
| 20 | 33 |
| 21 | 65 |
| 22 | 20 |
| 23 | 34 |
| 24 | 24 |
| 25 | 36 |
| 26 | 257 |
| 27 | 7 |
| 28 | 129 |
| 29 | 66 |
| 30 | 11 |
| 31 | 40 |
| 32 | 68 |
| 33 | 513 |
| 34 | 130 |
| 35 | 19 |
| 36 | 13 |
| 37 | 48 |
| 38 | 14 |
| 39 | 1025 |
| 40 | 72 |
| 41 | 258 |
| 42 | 21 |
| 43 | 132 |
| 44 | 35 |

TABLE Q19-continued

| with a sequence length of 2048: | |
|---|---|
| Reliability or reliability sequence number | Polarized channel sequence number |
| 45 | 26 |
| 46 | 80 |
| 47 | 37 |
| 48 | 25 |
| 49 | 22 |
| 50 | 136 |
| 51 | 514 |
| 52 | 260 |
| 53 | 38 |
| 54 | 96 |
| 55 | 67 |
| 56 | 41 |
| 57 | 144 |
| 58 | 28 |
| 59 | 69 |
| 60 | 42 |
| 61 | 264 |
| 62 | 49 |
| 63 | 74 |
| 64 | 1026 |
| 65 | 160 |
| 66 | 516 |
| 67 | 192 |
| 68 | 70 |
| 69 | 44 |
| 70 | 272 |
| 71 | 131 |
| 72 | 81 |
| 73 | 50 |
| 74 | 73 |
| 75 | 15 |
| 76 | 133 |
| 77 | 288 |
| 78 | 520 |
| 79 | 52 |
| 80 | 23 |
| 81 | 134 |
| 82 | 76 |
| 83 | 1028 |
| 84 | 137 |
| 85 | 82 |
| 86 | 259 |
| 87 | 56 |
| 88 | 27 |
| 89 | 97 |
| 90 | 528 |
| 91 | 39 |
| 92 | 261 |
| 93 | 84 |
| 94 | 138 |
| 95 | 145 |
| 96 | 29 |
| 97 | 43 |
| 98 | 320 |
| 99 | 1032 |
| 100 | 544 |
| 101 | 98 |
| 102 | 88 |
| 103 | 140 |
| 104 | 30 |
| 105 | 265 |
| 106 | 146 |
| 107 | 71 |
| 108 | 161 |
| 109 | 515 |
| 110 | 45 |
| 111 | 262 |
| 112 | 100 |
| 113 | 51 |
| 114 | 1040 |
| 115 | 148 |
| 116 | 46 |
| 117 | 273 |
| 118 | 768 |
| 119 | 75 |

TABLE Q19-continued

| with a sequence length of 2048: | |
|---|---|
| Reliability or reliability sequence number | Polarized channel sequence number |
| 120 | 104 |
| 121 | 162 |
| 122 | 266 |
| 123 | 53 |
| 124 | 193 |
| 125 | 152 |
| 126 | 517 |
| 127 | 77 |
| 128 | 1056 |
| 129 | 274 |
| 130 | 164 |
| 131 | 54 |
| 132 | 83 |
| 133 | 384 |
| 134 | 576 |
| 135 | 57 |
| 136 | 112 |
| 137 | 135 |
| 138 | 268 |
| 139 | 78 |
| 140 | 1027 |
| 141 | 194 |
| 142 | 521 |
| 143 | 85 |
| 144 | 289 |
| 145 | 58 |
| 146 | 168 |
| 147 | 139 |
| 148 | 321 |
| 149 | 518 |
| 150 | 99 |
| 151 | 1280 |
| 152 | 86 |
| 153 | 276 |
| 154 | 60 |
| 155 | 89 |
| 156 | 529 |
| 157 | 196 |
| 158 | 290 |
| 159 | 141 |
| 160 | 101 |
| 161 | 280 |
| 162 | 1536 |
| 163 | 147 |
| 164 | 522 |
| 165 | 176 |
| 166 | 142 |
| 167 | 292 |
| 168 | 31 |
| 169 | 200 |
| 170 | 530 |
| 171 | 263 |
| 172 | 1029 |
| 173 | 90 |
| 174 | 149 |
| 175 | 385 |
| 176 | 640 |
| 177 | 102 |
| 178 | 105 |
| 179 | 163 |
| 180 | 322 |
| 181 | 92 |
| 182 | 1088 |
| 183 | 524 |
| 184 | 47 |
| 185 | 267 |
| 186 | 208 |
| 187 | 150 |
| 188 | 545 |
| 189 | 296 |
| 190 | 153 |
| 191 | 165 |
| 192 | 1033 |
| 193 | 324 |
| 194 | 577 |

TABLE Q19-continued

| with a sequence length of 2048: | |
|---|---|
| Reliability or reliability sequence number | Polarized channel sequence number |
| 195 | 106 |
| 196 | 55 |
| 197 | 386 |
| 198 | 113 |
| 199 | 154 |
| 200 | 1030 |
| 201 | 532 |
| 202 | 275 |
| 203 | 79 |
| 204 | 108 |
| 205 | 546 |
| 206 | 269 |
| 207 | 224 |
| 208 | 166 |
| 209 | 1041 |
| 210 | 304 |
| 211 | 536 |
| 212 | 195 |
| 213 | 59 |
| 214 | 270 |
| 215 | 169 |
| 216 | 548 |
| 217 | 1034 |
| 218 | 328 |
| 219 | 114 |
| 220 | 156 |
| 221 | 277 |
| 222 | 769 |
| 223 | 87 |
| 224 | 197 |
| 225 | 1042 |
| 226 | 388 |
| 227 | 519 |
| 228 | 116 |
| 229 | 291 |
| 230 | 170 |
| 231 | 61 |
| 232 | 641 |
| 233 | 1152 |
| 234 | 282 |
| 235 | 177 |
| 236 | 91 |
| 237 | 578 |
| 238 | 336 |
| 239 | 198 |
| 240 | 293 |
| 241 | 1036 |
| 242 | 172 |
| 243 | 523 |
| 244 | 120 |
| 245 | 281 |
| 246 | 201 |
| 247 | 552 |
| 248 | 1057 |
| 249 | 278 |
| 250 | 62 |
| 251 | 392 |
| 252 | 580 |
| 253 | 143 |
| 254 | 103 |
| 255 | 294 |
| 256 | 1089 |
| 257 | 642 |
| 258 | 178 |
| 259 | 352 |
| 260 | 93 |
| 261 | 531 |
| 262 | 202 |
| 263 | 1044 |
| 264 | 323 |
| 265 | 107 |
| 266 | 525 |
| 267 | 297 |
| 268 | 180 |
| 269 | 1058 |

TABLE Q19-continued

| with a sequence length of 2048: | |
|---|---|
| Reliability or reliability sequence number | Polarized channel sequence number |
| 270 | 400 |
| 271 | 560 |
| 272 | 151 |
| 273 | 209 |
| 274 | 284 |
| 275 | 526 |
| 276 | 1048 |
| 277 | 94 |
| 278 | 325 |
| 279 | 204 |
| 280 | 584 |
| 281 | 298 |
| 282 | 155 |
| 283 | 1060 |
| 284 | 770 |
| 285 | 305 |
| 286 | 210 |
| 287 | 109 |
| 288 | 533 |
| 289 | 1281 |
| 290 | 330 |
| 291 | 184 |
| 292 | 416 |
| 293 | 644 |
| 294 | 115 |
| 295 | 1031 |
| 296 | 448 |
| 297 | 547 |
| 298 | 167 |
| 299 | 326 |
| 300 | 225 |
| 301 | 538 |
| 302 | 1153 |
| 303 | 300 |
| 304 | 157 |
| 305 | 592 |
| 306 | 387 |
| 307 | 110 |
| 308 | 1090 |
| 309 | 337 |
| 310 | 549 |
| 311 | 117 |
| 312 | 212 |
| 313 | 537 |
| 314 | 1035 |
| 315 | 306 |
| 316 | 171 |
| 317 | 329 |
| 318 | 534 |
| 319 | 226 |
| 320 | 1064 |
| 321 | 271 |
| 322 | 648 |
| 323 | 216 |
| 324 | 389 |
| 325 | 1092 |
| 326 | 772 |
| 327 | 158 |
| 328 | 308 |
| 329 | 550 |
| 330 | 118 |
| 331 | 1537 |
| 332 | 279 |
| 333 | 173 |
| 334 | 608 |
| 335 | 390 |
| 336 | 121 |
| 337 | 1154 |
| 338 | 579 |
| 339 | 332 |
| 340 | 199 |
| 341 | 553 |
| 342 | 1043 |
| 343 | 179 |
| 344 | 228 |

TABLE Q19-continued with a sequence length of 2048:

| Reliability or reliability sequence number | Polarized channel sequence number |
|---|---|
| 345 | 656 |
| 346 | 393 |
| 347 | 1037 |
| 348 | 174 |
| 349 | 540 |
| 350 | 338 |
| 351 | 122 |
| 352 | 581 |
| 353 | 1072 |
| 354 | 312 |
| 355 | 203 |
| 356 | 283 |
| 357 | 554 |
| 358 | 1038 |
| 359 | 63 |
| 360 | 353 |
| 361 | 776 |
| 362 | 181 |
| 363 | 1096 |
| 364 | 295 |
| 365 | 561 |
| 366 | 232 |
| 367 | 340 |
| 368 | 1282 |
| 369 | 586 |
| 370 | 394 |
| 371 | 672 |
| 372 | 124 |
| 373 | 401 |
| 374 | 1045 |
| 375 | 704 |
| 376 | 205 |
| 377 | 285 |
| 378 | 582 |
| 379 | 1156 |
| 380 | 182 |
| 381 | 299 |
| 382 | 556 |
| 383 | 211 |
| 384 | 1059 |
| 385 | 354 |
| 386 | 784 |
| 387 | 185 |
| 388 | 1050 |
| 389 | 344 |
| 390 | 643 |
| 391 | 240 |
| 392 | 396 |
| 393 | 1104 |
| 394 | 593 |
| 395 | 206 |
| 396 | 286 |
| 397 | 562 |
| 398 | 1061 |
| 399 | 95 |
| 400 | 585 |
| 401 | 402 |
| 402 | 327 |
| 403 | 1049 |
| 404 | 527 |
| 405 | 213 |
| 406 | 417 |
| 407 | 1046 |
| 408 | 645 |
| 409 | 186 |
| 410 | 800 |
| 411 | 301 |
| 412 | 1160 |
| 413 | 227 |
| 414 | 564 |
| 415 | 356 |
| 416 | 111 |
| 417 | 1538 |
| 418 | 535 |
| 419 | 307 |

TABLE Q19-continued with a sequence length of 2048:

| Reliability or reliability sequence number | Polarized channel sequence number |
|---|---|
| 420 | 646 |
| 421 | 1284 |
| 422 | 404 |
| 423 | 214 |
| 424 | 588 |
| 425 | 302 |
| 426 | 1062 |
| 427 | 188 |
| 428 | 649 |
| 429 | 331 |
| 430 | 1120 |
| 431 | 594 |
| 432 | 217 |
| 433 | 360 |
| 434 | 771 |
| 435 | 1091 |
| 436 | 418 |
| 437 | 229 |
| 438 | 568 |
| 439 | 1065 |
| 440 | 309 |
| 441 | 539 |
| 442 | 159 |
| 443 | 1168 |
| 444 | 449 |
| 445 | 609 |
| 446 | 408 |
| 447 | 551 |
| 448 | 1052 |
| 449 | 119 |
| 450 | 333 |
| 451 | 773 |
| 452 | 1093 |
| 453 | 218 |
| 454 | 596 |
| 455 | 420 |
| 456 | 1066 |
| 457 | 230 |
| 458 | 650 |
| 459 | 310 |
| 460 | 1288 |
| 461 | 657 |
| 462 | 339 |
| 463 | 541 |
| 464 | 1073 |
| 465 | 233 |
| 466 | 313 |
| 467 | 555 |
| 468 | 1098 |
| 469 | 368 |
| 470 | 832 |
| 471 | 175 |
| 472 | 1184 |
| 473 | 391 |
| 474 | 610 |
| 475 | 123 |
| 476 | 1540 |
| 477 | 600 |
| 478 | 334 |
| 479 | 450 |
| 480 | 1216 |
| 481 | 652 |
| 482 | 220 |
| 483 | 542 |
| 484 | 1094 |
| 485 | 341 |
| 486 | 777 |
| 487 | 183 |
| 488 | 1068 |
| 489 | 314 |
| 490 | 658 |
| 491 | 424 |
| 492 | 1296 |
| 493 | 583 |
| 494 | 234 |

TABLE Q19-continued

| with a sequence length of 2048: | |
|---|---|
| Reliability or reliability sequence number | Polarized channel sequence number |
| 495 | 673 |
| 496 | 1155 |
| 497 | 395 |
| 498 | 557 |
| 499 | 355 |
| 500 | 1105 |
| 501 | 125 |
| 502 | 774 |
| 503 | 342 |
| 504 | 1074 |
| 505 | 612 |
| 506 | 316 |
| 507 | 563 |
| 508 | 1097 |
| 509 | 241 |
| 510 | 345 |
| 511 | 660 |
| 512 | 1039 |
| 513 | 207 |
| 514 | 558 |
| 515 | 1157 |
| 516 | 452 |
| 517 | 785 |
| 518 | 397 |
| 519 | 1312 |
| 520 | 587 |
| 521 | 187 |
| 522 | 357 |
| 523 | 1544 |
| 524 | 616 |
| 525 | 403 |
| 526 | 1076 |
| 527 | 674 |
| 528 | 236 |
| 529 | 778 |
| 530 | 1047 |
| 531 | 432 |
| 532 | 565 |
| 533 | 398 |
| 534 | 1158 |
| 535 | 705 |
| 536 | 126 |
| 537 | 1100 |
| 538 | 664 |
| 539 | 287 |
| 540 | 456 |
| 541 | 1161 |
| 542 | 589 |
| 543 | 242 |
| 544 | 1106 |
| 545 | 786 |
| 546 | 346 |
| 547 | 676 |
| 548 | 1283 |
| 549 | 405 |
| 550 | 566 |
| 551 | 1080 |
| 552 | 244 |
| 553 | 595 |
| 554 | 358 |
| 555 | 1051 |
| 556 | 896 |
| 557 | 361 |
| 558 | 1121 |
| 559 | 569 |
| 560 | 189 |
| 561 | 624 |
| 562 | 1552 |
| 563 | 419 |
| 564 | 647 |
| 565 | 1063 |
| 566 | 348 |
| 567 | 215 |
| 568 | 780 |
| 569 | 1285 |

TABLE Q19-continued

| with a sequence length of 2048: | |
|---|---|
| Reliability or reliability sequence number | Polarized channel sequence number |
| 570 | 303 |
| 571 | 590 |
| 572 | 1108 |
| 573 | 464 |
| 574 | 706 |
| 575 | 406 |
| 576 | 1162 |
| 577 | 597 |
| 578 | 219 |
| 579 | 1169 |
| 580 | 801 |
| 581 | 409 |
| 582 | 1053 |
| 583 | 570 |
| 584 | 421 |
| 585 | 680 |
| 586 | 1067 |
| 587 | 231 |
| 588 | 651 |
| 589 | 1344 |
| 590 | 362 |
| 591 | 833 |
| 592 | 1568 |
| 593 | 311 |
| 594 | 611 |
| 595 | 1122 |
| 596 | 248 |
| 597 | 598 |
| 598 | 369 |
| 599 | 1112 |
| 600 | 788 |
| 601 | 410 |
| 602 | 1164 |
| 603 | 572 |
| 604 | 335 |
| 605 | 1054 |
| 606 | 601 |
| 607 | 190 |
| 608 | 1289 |
| 609 | 708 |
| 610 | 364 |
| 611 | 1170 |
| 612 | 802 |
| 613 | 480 |
| 614 | 221 |
| 615 | 1095 |
| 616 | 422 |
| 617 | 653 |
| 618 | 1185 |
| 619 | 451 |
| 620 | 613 |
| 621 | 1539 |
| 622 | 315 |
| 623 | 792 |
| 624 | 1069 |
| 625 | 235 |
| 626 | 659 |
| 627 | 1286 |
| 628 | 425 |
| 629 | 688 |
| 630 | 1124 |
| 631 | 370 |
| 632 | 654 |
| 633 | 1075 |
| 634 | 412 |
| 635 | 804 |
| 636 | 1172 |
| 637 | 222 |
| 638 | 543 |
| 639 | 343 |
| 640 | 1070 |
| 641 | 712 |
| 642 | 453 |
| 643 | 1297 |
| 644 | 775 |

TABLE Q19-continued with a sequence length of 2048:

| Reliability or reliability sequence number | Polarized channel sequence number |
|---|---|
| 645 | 237 |
| 646 | 1792 |
| 647 | 602 |
| 648 | 372 |
| 649 | 1099 |
| 650 | 661 |
| 651 | 426 |
| 652 | 1128 |
| 653 | 897 |
| 654 | 317 |
| 655 | 1186 |
| 656 | 614 |
| 657 | 243 |
| 658 | 1290 |
| 659 | 617 |
| 660 | 675 |
| 661 | 1077 |
| 662 | 433 |
| 663 | 1217 |
| 664 | 834 |
| 665 | 347 |
| 666 | 1176 |
| 667 | 604 |
| 668 | 454 |
| 669 | 1541 |
| 670 | 559 |
| 671 | 238 |
| 672 | 1101 |
| 673 | 779 |
| 674 | 428 |
| 675 | 1298 |
| 676 | 720 |
| 677 | 376 |
| 678 | 1188 |
| 679 | 662 |
| 680 | 457 |
| 681 | 1078 |
| 682 | 808 |
| 683 | 318 |
| 684 | 1107 |
| 685 | 665 |
| 686 | 245 |
| 687 | 1408 |
| 688 | 677 |
| 689 | 1600 |
| 690 | 399 |
| 691 | 836 |
| 692 | 1081 |
| 693 | 618 |
| 694 | 359 |
| 695 | 1136 |
| 696 | 567 |
| 697 | 434 |
| 698 | 1159 |
| 699 | 898 |
| 700 | 127 |
| 701 | 1292 |
| 702 | 625 |
| 703 | 349 |
| 704 | 1102 |
| 705 | 666 |
| 706 | 1218 |
| 707 | 458 |
| 708 | 787 |
| 709 | 1545 |
| 710 | 591 |
| 711 | 363 |
| 712 | 1109 |
| 713 | 620 |
| 714 | 191 |
| 715 | 1313 |
| 716 | 781 |
| 717 | 1082 |
| 718 | 436 |
| 719 | 736 |

TABLE Q19-continued with a sequence length of 2048:

| Reliability or reliability sequence number | Polarized channel sequence number |
|---|---|
| 720 | 1192 |
| 721 | 407 |
| 722 | 678 |
| 723 | 1163 |
| 724 | 465 |
| 725 | 1345 |
| 726 | 816 |
| 727 | 707 |
| 728 | 1542 |
| 729 | 350 |
| 730 | 571 |
| 731 | 1123 |
| 732 | 246 |
| 733 | 1110 |
| 734 | 782 |
| 735 | 460 |
| 736 | 1300 |
| 737 | 681 |
| 738 | 840 |
| 739 | 1084 |
| 740 | 411 |
| 741 | 1113 |
| 742 | 626 |
| 743 | 466 |
| 744 | 1553 |
| 745 | 668 |
| 746 | 365 |
| 747 | 1220 |
| 748 | 789 |
| 749 | 1314 |
| 750 | 249 |
| 751 | 599 |
| 752 | 1165 |
| 753 | 709 |
| 754 | 440 |
| 755 | 1125 |
| 756 | 900 |
| 757 | 1304 |
| 758 | 371 |
| 759 | 628 |
| 760 | 1171 |
| 761 | 803 |
| 762 | 1546 |
| 763 | 423 |
| 764 | 682 |
| 765 | 1200 |
| 766 | 481 |
| 767 | 573 |
| 768 | 1166 |
| 769 | 250 |
| 770 | 1316 |
| 771 | 794 |
| 772 | 689 |
| 773 | 1055 |
| 774 | 413 |
| 775 | 1224 |
| 776 | 603 |
| 777 | 366 |
| 778 | 1554 |
| 779 | 848 |
| 780 | 1287 |
| 781 | 710 |
| 782 | 373 |
| 783 | 1114 |
| 784 | 805 |
| 785 | 1173 |
| 786 | 468 |
| 787 | 684 |
| 788 | 1409 |
| 789 | 427 |
| 790 | 1664 |
| 791 | 632 |
| 792 | 793 |
| 793 | 1126 |
| 794 | 252 |

TABLE Q19-continued

| with a sequence length of 2048: | |
|---|---|
| Reliability or reliability sequence number | Polarized channel sequence number |
| 795 | 1129 |
| 796 | 713 |
| 797 | 482 |
| 798 | 1187 |
| 799 | 790 |
| 800 | 1346 |
| 801 | 574 |
| 802 | 472 |
| 803 | 1116 |
| 804 | 904 |
| 805 | 1548 |
| 806 | 414 |
| 807 | 1071 |
| 808 | 655 |
| 809 | 615 |
| 810 | 1291 |
| 811 | 374 |
| 812 | 1232 |
| 813 | 806 |
| 814 | 690 |
| 815 | 1174 |
| 816 | 223 |
| 817 | 1569 |
| 818 | 864 |
| 819 | 429 |
| 820 | 1320 |
| 821 | 605 |
| 822 | 1177 |
| 823 | 714 |
| 824 | 1189 |
| 825 | 377 |
| 826 | 835 |
| 827 | 1348 |
| 828 | 455 |
| 829 | 1601 |
| 830 | 619 |
| 831 | 809 |
| 832 | 1130 |
| 833 | 435 |
| 834 | 1079 |
| 835 | 692 |
| 836 | 1410 |
| 837 | 912 |
| 838 | 484 |
| 839 | 1137 |
| 840 | 663 |
| 841 | 1178 |
| 842 | 430 |
| 843 | 1556 |
| 844 | 721 |
| 845 | 796 |
| 846 | 1299 |
| 847 | 239 |
| 848 | 1103 |
| 849 | 606 |
| 850 | 1132 |
| 851 | 837 |
| 852 | 378 |
| 853 | 1570 |
| 854 | 716 |
| 855 | 1293 |
| 856 | 459 |
| 857 | 1248 |
| 858 | 810 |
| 859 | 1190 |
| 860 | 667 |
| 861 | 319 |
| 862 | 1328 |
| 863 | 817 |
| 864 | 1560 |
| 865 | 722 |
| 866 | 1219 |
| 867 | 437 |
| 868 | 621 |
| 869 | 1083 |

TABLE Q19-continued

| with a sequence length of 2048: | |
|---|---|
| Reliability or reliability sequence number | Polarized channel sequence number |
| 870 | 842 |
| 871 | 1294 |
| 872 | 488 |
| 873 | 1193 |
| 874 | 696 |
| 875 | 1572 |
| 876 | 380 |
| 877 | 928 |
| 878 | 1352 |
| 879 | 627 |
| 880 | 1138 |
| 881 | 251 |
| 882 | 1180 |
| 883 | 960 |
| 884 | 1301 |
| 885 | 679 |
| 886 | 461 |
| 887 | 1793 |
| 888 | 838 |
| 889 | 1111 |
| 890 | 737 |
| 891 | 1221 |
| 892 | 438 |
| 893 | 1412 |
| 894 | 812 |
| 895 | 669 |
| 896 | 1543 |
| 897 | 467 |
| 898 | 1140 |
| 899 | 899 |
| 900 | 1315 |
| 901 | 622 |
| 902 | 1194 |
| 903 | 441 |
| 904 | 1085 |
| 905 | 849 |
| 906 | 1665 |
| 907 | 629 |
| 908 | 496 |
| 909 | 1306 |
| 910 | 724 |
| 911 | 1201 |
| 912 | 462 |
| 913 | 1115 |
| 914 | 818 |
| 915 | 1602 |
| 916 | 683 |
| 917 | 1360 |
| 918 | 247 |
| 919 | 1222 |
| 920 | 841 |
| 921 | 738 |
| 922 | 1317 |
| 923 | 351 |
| 924 | 1196 |
| 925 | 783 |
| 926 | 1547 |
| 927 | 728 |
| 928 | 1144 |
| 929 | 901 |
| 930 | 1305 |
| 931 | 469 |
| 932 | 1225 |
| 933 | 670 |
| 934 | 1576 |
| 935 | 820 |
| 936 | 442 |
| 937 | 1302 |
| 938 | 630 |
| 939 | 1086 |
| 940 | 791 |
| 941 | 1416 |
| 942 | 483 |
| 943 | 1604 |
| 944 | 685 |

TABLE Q19-continued

| with a sequence length of 2048: | |
|---|---|
| Reliability or reliability sequence number | Polarized channel sequence number |
| 945 | 1167 |
| 946 | 902 |
| 947 | 1127 |
| 948 | 367 |
| 949 | 1318 |
| 950 | 633 |
| 951 | 1666 |
| 952 | 844 |
| 953 | 1202 |
| 954 | 470 |
| 955 | 1376 |
| 956 | 711 |
| 957 | 1117 |
| 958 | 691 |
| 959 | 444 |
| 960 | 1555 |
| 961 | 740 |
| 962 | 1226 |
| 963 | 905 |
| 964 | 1347 |
| 965 | 473 |
| 966 | 1131 |
| 967 | 686 |
| 968 | 1549 |
| 969 | 850 |
| 970 | 1321 |
| 971 | 634 |
| 972 | 1204 |
| 973 | 253 |
| 974 | 1424 |
| 975 | 824 |
| 976 | 1584 |
| 977 | 715 |
| 978 | 1175 |
| 979 | 485 |
| 980 | 1233 |
| 981 | 795 |
| 982 | 1308 |
| 983 | 575 |
| 984 | 1550 |
| 985 | 415 |
| 986 | 1118 |
| 987 | 865 |
| 988 | 1349 |
| 989 | 693 |
| 990 | 1228 |
| 991 | 807 |
| 992 | 1608 |
| 993 | 375 |
| 994 | 1322 |
| 995 | 744 |
| 996 | 1179 |
| 997 | 852 |
| 998 | 1794 |
| 999 | 474 |
| 1000 | 1329 |
| 1001 | 906 |
| 1002 | 1234 |
| 1003 | 636 |
| 1004 | 1133 |
| 1005 | 486 |
| 1006 | 1557 |
| 1007 | 913 |
| 1008 | 1354 |
| 1009 | 717 |
| 1010 | 1208 |
| 1011 | 797 |
| 1012 | 1440 |
| 1013 | 489 |
| 1014 | 1668 |
| 1015 | 694 |
| 1016 | 1139 |
| 1017 | 811 |
| 1018 | 1472 |
| 1019 | 431 |

TABLE Q19-continued

| with a sequence length of 2048: | |
|---|---|
| Reliability or reliability sequence number | Polarized channel sequence number |
| 1020 | 1571 |
| 1021 | 723 |
| 1022 | 1191 |
| 1023 | 866 |
| 1024 | 697 |
| 1025 | 379 |
| 1026 | 1350 |
| 1027 | 856 |
| 1028 | 1249 |
| 1029 | 752 |
| 1030 | 1562 |
| 1031 | 476 |
| 1032 | 1324 |
| 1033 | 908 |
| 1034 | 1181 |
| 1035 | 718 |
| 1036 | 1616 |
| 1037 | 798 |
| 1038 | 1411 |
| 1039 | 254 |
| 1040 | 1134 |
| 1041 | 607 |
| 1042 | 1361 |
| 1043 | 914 |
| 1044 | 1573 |
| 1045 | 839 |
| 1046 | 1141 |
| 1047 | 439 |
| 1048 | 1236 |
| 1049 | 725 |
| 1050 | 1561 |
| 1051 | 929 |
| 1052 | 1330 |
| 1053 | 698 |
| 1054 | 1195 |
| 1055 | 490 |
| 1056 | 1353 |
| 1057 | 813 |
| 1058 | 1558 |
| 1059 | 739 |
| 1060 | 1250 |
| 1061 | 381 |
| 1062 | 1295 |
| 1063 | 868 |
| 1064 | 1672 |
| 1065 | 623 |
| 1066 | 1240 |
| 1067 | 819 |
| 1068 | 1413 |
| 1069 | 497 |
| 1070 | 1796 |
| 1071 | 916 |
| 1072 | 1182 |
| 1073 | 726 |
| 1074 | 1332 |
| 1075 | 814 |
| 1076 | 1574 |
| 1077 | 463 |
| 1078 | 1142 |
| 1079 | 700 |
| 1080 | 1303 |
| 1081 | 843 |
| 1082 | 1197 |
| 1083 | 729 |
| 1084 | 1632 |
| 1085 | 443 |
| 1086 | 1414 |
| 1087 | 1145 |
| 1088 | 872 |
| 1089 | 1603 |
| 1090 | 930 |
| 1091 | 1356 |
| 1092 | 741 |
| 1093 | 1223 |
| 1094 | 492 |

TABLE Q19-continued

| with a sequence length of 2048: | |
|---|---|
| Reliability or reliability sequence number | Polarized channel sequence number |
| 1095 | 1577 |
| 1096 | 821 |
| 1097 | 1203 |
| 1098 | 671 |
| 1099 | 1252 |
| 1100 | 961 |
| 1101 | 1680 |
| 1102 | 382 |
| 1103 | 1417 |
| 1104 | 920 |
| 1105 | 1198 |
| 1106 | 631 |
| 1107 | 1564 |
| 1108 | 845 |
| 1109 | 1362 |
| 1110 | 498 |
| 1111 | 1146 |
| 1112 | 1605 |
| 1113 | 730 |
| 1114 | 1336 |
| 1115 | 932 |
| 1116 | 1227 |
| 1117 | 742 |
| 1118 | 1307 |
| 1119 | 822 |
| 1120 | 1578 |
| 1121 | 500 |
| 1122 | 1087 |
| 1123 | 851 |
| 1124 | 1377 |
| 1125 | 745 |
| 1126 | 1800 |
| 1127 | 1205 |
| 1128 | 825 |
| 1129 | 1319 |
| 1130 | 445 |
| 1131 | 1585 |
| 1132 | 880 |
| 1133 | 1256 |
| 1134 | 687 |
| 1135 | 1364 |
| 1136 | 903 |
| 1137 | 1610 |
| 1138 | 471 |
| 1139 | 1418 |
| 1140 | 1696 |
| 1141 | 635 |
| 1142 | 1148 |
| 1143 | 846 |
| 1144 | 1425 |
| 1145 | 962 |
| 1146 | 1728 |
| 1147 | 732 |
| 1148 | 1229 |
| 1149 | 255 |
| 1150 | 1309 |
| 1151 | 1606 |
| 1152 | 853 |
| 1153 | 1206 |
| 1154 | 695 |
| 1155 | 1323 |
| 1156 | 826 |
| 1157 | 1580 |
| 1158 | 475 |
| 1159 | 1235 |
| 1160 | 936 |
| 1161 | 1378 |
| 1162 | 1808 |
| 1163 | 746 |
| 1164 | 1209 |
| 1165 | 907 |
| 1166 | 1368 |
| 1167 | 867 |
| 1168 | 1667 |
| 1169 | 487 |

TABLE Q19-continued

| with a sequence length of 2048: | |
|---|---|
| Reliability or reliability sequence number | Polarized channel sequence number |
| 1170 | 1264 |
| 1171 | 1420 |
| 1172 | 637 |
| 1173 | 1617 |
| 1174 | 854 |
| 1175 | 1230 |
| 1176 | 828 |
| 1177 | 1310 |
| 1178 | 753 |
| 1179 | 1586 |
| 1180 | 1119 |
| 1181 | 504 |
| 1182 | 1609 |
| 1183 | 857 |
| 1184 | 1426 |
| 1185 | 719 |
| 1186 | 1351 |
| 1187 | 1551 |
| 1188 | 964 |
| 1189 | 1237 |
| 1190 | 909 |
| 1191 | 1441 |
| 1192 | 446 |
| 1193 | 1669 |
| 1194 | 699 |
| 1195 | 1210 |
| 1196 | 1824 |
| 1197 | 869 |
| 1198 | 1325 |
| 1199 | 915 |
| 1200 | 1251 |
| 1201 | 477 |
| 1202 | 1588 |
| 1203 | 1380 |
| 1204 | 748 |
| 1205 | 1135 |
| 1206 | 944 |
| 1207 | 1559 |
| 1208 | 910 |
| 1209 | 1331 |
| 1210 | 1670 |
| 1211 | 638 |
| 1212 | 1428 |
| 1213 | 799 |
| 1214 | 1238 |
| 1215 | 1612 |
| 1216 | 491 |
| 1217 | 1326 |
| 1218 | 968 |
| 1219 | 1212 |
| 1220 | 754 |
| 1221 | 1673 |
| 1222 | 1355 |
| 1223 | 858 |
| 1224 | 1618 |
| 1225 | 917 |
| 1226 | 1241 |
| 1227 | 478 |
| 1228 | 1384 |
| 1229 | 1795 |
| 1230 | 756 |
| 1231 | 1442 |
| 1232 | 870 |
| 1233 | 1253 |
| 1234 | 1592 |
| 1235 | 873 |
| 1236 | 1333 |
| 1237 | 701 |
| 1238 | 1563 |
| 1239 | 1183 |
| 1240 | 493 |
| 1241 | 1473 |
| 1242 | 931 |
| 1243 | 1633 |
| 1244 | 860 |

TABLE Q19-continued

| with a sequence length of 2048: | |
|---|---|
| Reliability or reliability sequence number | Polarized channel sequence number |
| 1245 | 1432 |
| 1246 | 1575 |
| 1247 | 727 |
| 1248 | 1143 |
| 1249 | 815 |
| 1250 | 1357 |
| 1251 | 1797 |
| 1252 | 976 |
| 1253 | 1242 |
| 1254 | 499 |
| 1255 | 1620 |
| 1256 | 1444 |
| 1257 | 918 |
| 1258 | 1254 |
| 1259 | 731 |
| 1260 | 1674 |
| 1261 | 1334 |
| 1262 | 921 |
| 1263 | 1681 |
| 1264 | 933 |
| 1265 | 1363 |
| 1266 | 1565 |
| 1267 | 743 |
| 1268 | 1257 |
| 1269 | 494 |
| 1270 | 1337 |
| 1271 | 1579 |
| 1272 | 874 |
| 1273 | 1392 |
| 1274 | 823 |
| 1275 | 1856 |
| 1276 | 1199 |
| 1277 | 760 |
| 1278 | 1415 |
| 1279 | 1634 |
| 1280 | 881 |
| 1281 | 1147 |
| 1282 | 501 |
| 1283 | 1624 |
| 1284 | 1358 |
| 1285 | 922 |
| 1286 | 1474 |
| 1287 | 847 |
| 1288 | 1676 |
| 1289 | 1244 |
| 1290 | 702 |
| 1291 | 1566 |
| 1292 | 876 |
| 1293 | 1365 |
| 1294 | 1801 |
| 1295 | 992 |
| 1296 | 1207 |
| 1297 | 1338 |
| 1298 | 733 |
| 1299 | 1682 |
| 1300 | 383 |
| 1301 | 1448 |
| 1302 | 1607 |
| 1303 | 934 |
| 1304 | 1258 |
| 1305 | 1697 |
| 1306 | 963 |
| 1307 | 1419 |
| 1308 | 827 |
| 1309 | 1581 |
| 1310 | 1379 |
| 1311 | 747 |
| 1312 | 1149 |
| 1313 | 1798 |
| 1314 | 937 |
| 1315 | 1366 |
| 1316 | 447 |
| 1317 | 1636 |
| 1318 | 1340 |
| 1319 | 882 |

TABLE Q19-continued

| with a sequence length of 2048: | |
|---|---|
| Reliability or reliability sequence number | Polarized channel sequence number |
| 1320 | 1587 |
| 1321 | 1265 |
| 1322 | 924 |
| 1323 | 1369 |
| 1324 | 734 |
| 1325 | 1684 |
| 1326 | 1231 |
| 1327 | 855 |
| 1328 | 1582 |
| 1329 | 1476 |
| 1330 | 965 |
| 1331 | 1809 |
| 1332 | 749 |
| 1333 | 1421 |
| 1334 | 1611 |
| 1335 | 502 |
| 1336 | 1211 |
| 1337 | 1381 |
| 1338 | 884 |
| 1339 | 1640 |
| 1340 | 1427 |
| 1341 | 938 |
| 1342 | 1698 |
| 1343 | 1260 |
| 1344 | 829 |
| 1345 | 1802 |
| 1346 | 755 |
| 1347 | 1456 |
| 1348 | 1589 |
| 1349 | 945 |
| 1350 | 1422 |
| 1351 | 1729 |
| 1352 | 859 |
| 1353 | 1150 |
| 1354 | 1688 |
| 1355 | 505 |
| 1356 | 1311 |
| 1357 | 1480 |
| 1358 | 966 |
| 1359 | 1613 |
| 1360 | 750 |
| 1361 | 1266 |
| 1362 | 1810 |
| 1363 | 940 |
| 1364 | 1370 |
| 1365 | 1700 |
| 1366 | 888 |
| 1367 | 1429 |
| 1368 | 1590 |
| 1369 | 969 |
| 1370 | 1268 |
| 1371 | 1619 |
| 1372 | 830 |
| 1373 | 1382 |
| 1374 | 1920 |
| 1375 | 506 |
| 1376 | 1385 |
| 1377 | 1593 |
| 1378 | 757 |
| 1379 | 1213 |
| 1380 | 1648 |
| 1381 | 911 |
| 1382 | 1443 |
| 1383 | 1671 |
| 1384 | 871 |
| 1385 | 1372 |
| 1386 | 946 |
| 1387 | 1239 |
| 1388 | 1804 |
| 1389 | 639 |
| 1390 | 1327 |
| 1391 | 1614 |
| 1392 | 861 |
| 1393 | 1488 |
| 1394 | 1730 |

TABLE Q19-continued with a sequence length of 2048:

| Reliability or reliability sequence number | Polarized channel sequence number |
|---|---|
| 1395 | 970 |
| 1396 | 1430 |
| 1397 | 1621 |
| 1398 | 508 |
| 1399 | 1243 |
| 1400 | 1825 |
| 1401 | 875 |
| 1402 | 1433 |
| 1403 | 1594 |
| 1404 | 703 |
| 1405 | 1445 |
| 1406 | 1704 |
| 1407 | 1255 |
| 1408 | 948 |
| 1409 | 1675 |
| 1410 | 1386 |
| 1411 | 919 |
| 1412 | 1857 |
| 1413 | 1335 |
| 1414 | 977 |
| 1415 | 1635 |
| 1416 | 1272 |
| 1417 | 862 |
| 1418 | 1622 |
| 1419 | 1393 |
| 1420 | 758 |
| 1421 | 1812 |
| 1422 | 1434 |
| 1423 | 479 |
| 1424 | 1596 |
| 1425 | 1359 |
| 1426 | 972 |
| 1427 | 1625 |
| 1428 | 1214 |
| 1429 | 923 |
| 1430 | 1732 |
| 1431 | 1388 |
| 1432 | 978 |
| 1433 | 1826 |
| 1434 | 1504 |
| 1435 | 1245 |
| 1436 | 877 |
| 1437 | 1446 |
| 1438 | 1677 |
| 1439 | 761 |
| 1440 | 1475 |
| 1441 | 1637 |
| 1442 | 952 |
| 1443 | 1339 |
| 1444 | 1816 |
| 1445 | 883 |
| 1446 | 1259 |
| 1447 | 1683 |
| 1448 | 935 |
| 1449 | 1449 |
| 1450 | 1712 |
| 1451 | 1394 |
| 1452 | 495 |
| 1453 | 1678 |
| 1454 | 1436 |
| 1455 | 993 |
| 1456 | 1828 |
| 1457 | 1246 |
| 1458 | 762 |
| 1459 | 1567 |
| 1460 | 1367 |
| 1461 | 925 |
| 1462 | 1736 |
| 1463 | 1477 |
| 1464 | 1799 |
| 1465 | 878 |
| 1466 | 1261 |
| 1467 | 1626 |
| 1468 | 885 |
| 1469 | 1396 |

TABLE Q19-continued with a sequence length of 2048:

| Reliability or reliability sequence number | Polarized channel sequence number |
|---|---|
| 1470 | 1685 |
| 1471 | 1450 |
| 1472 | 980 |
| 1473 | 1921 |
| 1474 | 1341 |
| 1475 | 939 |
| 1476 | 1638 |
| 1477 | 1267 |
| 1478 | 764 |
| 1479 | 1641 |
| 1480 | 1699 |
| 1481 | 1457 |
| 1482 | 507 |
| 1483 | 1858 |
| 1484 | 1371 |
| 1485 | 994 |
| 1486 | 1628 |
| 1487 | 1478 |
| 1488 | 1583 |
| 1489 | 984 |
| 1490 | 1262 |
| 1491 | 1803 |
| 1492 | 926 |
| 1493 | 1452 |
| 1494 | 1744 |
| 1495 | 1400 |
| 1496 | 886 |
| 1497 | 1686 |
| 1498 | 1481 |
| 1499 | 735 |
| 1500 | 1832 |
| 1501 | 1342 |
| 1502 | 1689 |
| 1503 | 941 |
| 1504 | 1269 |
| 1505 | 1701 |
| 1506 | 889 |
| 1507 | 1423 |
| 1508 | 1860 |
| 1509 | 1642 |
| 1510 | 967 |
| 1511 | 1383 |
| 1512 | 1591 |
| 1513 | 947 |
| 1514 | 1458 |
| 1515 | 1922 |
| 1516 | 1151 |
| 1517 | 996 |
| 1518 | 1649 |
| 1519 | 1373 |
| 1520 | 1690 |
| 1521 | 503 |
| 1522 | 1482 |
| 1523 | 1811 |
| 1524 | 942 |
| 1525 | 1615 |
| 1526 | 1387 |
| 1527 | 1644 |
| 1528 | 751 |
| 1529 | 1215 |
| 1530 | 1805 |
| 1531 | 1460 |
| 1532 | 890 |
| 1533 | 1760 |
| 1534 | 1431 |
| 1535 | 1702 |
| 1536 | 971 |
| 1537 | 1489 |
| 1538 | 1840 |
| 1539 | 831 |
| 1540 | 1731 |
| 1541 | 1374 |
| 1542 | 1595 |
| 1543 | 949 |
| 1544 | 1270 |

TABLE Q19-continued

| with a sequence length of 2048: | |
|---|---|
| Reliability or reliability sequence number | Polarized channel sequence number |
| 1545 | 1806 |
| 1546 | 1484 |
| 1547 | 1000 |
| 1548 | 1705 |
| 1549 | 1864 |
| 1550 | 1435 |
| 1551 | 892 |
| 1552 | 1650 |
| 1553 | 1490 |
| 1554 | 1692 |
| 1555 | 763 |
| 1556 | 1389 |
| 1557 | 1813 |
| 1558 | 1273 |
| 1559 | 973 |
| 1560 | 1623 |
| 1561 | 1733 |
| 1562 | 1464 |
| 1563 | 950 |
| 1564 | 1924 |
| 1565 | 1395 |
| 1566 | 1652 |
| 1567 | 509 |
| 1568 | 1827 |
| 1569 | 1447 |
| 1570 | 1706 |
| 1571 | 979 |
| 1572 | 1505 |
| 1573 | 1597 |
| 1574 | 1274 |
| 1575 | 953 |
| 1576 | 1818 |
| 1577 | 1713 |
| 1578 | 1437 |
| 1579 | 1008 |
| 1580 | 1627 |
| 1581 | 1390 |
| 1582 | 1872 |
| 1583 | 974 |
| 1584 | 1734 |
| 1585 | 1397 |
| 1586 | 1829 |
| 1587 | 759 |
| 1588 | 1492 |
| 1589 | 1708 |
| 1590 | 1451 |
| 1591 | 863 |
| 1592 | 1656 |
| 1593 | 1817 |
| 1594 | 1276 |
| 1595 | 981 |
| 1596 | 1737 |
| 1597 | 1506 |
| 1598 | 1814 |
| 1599 | 1598 |
| 1600 | 954 |
| 1601 | 1496 |
| 1602 | 1928 |
| 1603 | 1438 |
| 1604 | 995 |
| 1605 | 1679 |
| 1606 | 1639 |
| 1607 | 1398 |
| 1608 | 879 |
| 1609 | 1830 |
| 1610 | 1714 |
| 1611 | 1247 |
| 1612 | 982 |
| 1613 | 1888 |
| 1614 | 1453 |
| 1615 | 1629 |
| 1616 | 1738 |
| 1617 | 956 |
| 1618 | 1401 |
| 1619 | 1859 |

TABLE Q19-continued

| with a sequence length of 2048: | |
|---|---|
| Reliability or reliability sequence number | Polarized channel sequence number |
| 1620 | 1479 |
| 1621 | 985 |
| 1622 | 1643 |
| 1623 | 1833 |
| 1624 | 1459 |
| 1625 | 1716 |
| 1626 | 510 |
| 1627 | 1936 |
| 1628 | 1508 |
| 1629 | 1687 |
| 1630 | 765 |
| 1631 | 1454 |
| 1632 | 1745 |
| 1633 | 1820 |
| 1634 | 1263 |
| 1635 | 997 |
| 1636 | 1630 |
| 1637 | 1861 |
| 1638 | 1402 |
| 1639 | 1740 |
| 1640 | 927 |
| 1641 | 1483 |
| 1642 | 1834 |
| 1643 | 1691 |
| 1644 | 887 |
| 1645 | 1343 |
| 1646 | 1841 |
| 1647 | 1746 |
| 1648 | 1461 |
| 1649 | 986 |
| 1650 | 1645 |
| 1651 | 1866 |
| 1652 | 1512 |
| 1653 | 1720 |
| 1654 | 998 |
| 1655 | 1404 |
| 1656 | 1952 |
| 1657 | 1651 |
| 1658 | 1275 |
| 1659 | 1001 |
| 1660 | 1984 |
| 1661 | 1703 |
| 1662 | 1485 |
| 1663 | 1862 |
| 1664 | 943 |
| 1665 | 1761 |
| 1666 | 1462 |
| 1667 | 1836 |
| 1668 | 891 |
| 1669 | 1693 |
| 1670 | 1491 |
| 1671 | 1923 |
| 1672 | 1646 |
| 1673 | 988 |
| 1674 | 1465 |
| 1675 | 1873 |
| 1676 | 1653 |
| 1677 | 1520 |
| 1678 | 1748 |
| 1679 | 766 |
| 1680 | 1486 |
| 1681 | 1842 |
| 1682 | 1707 |
| 1683 | 1271 |
| 1684 | 951 |
| 1685 | 1865 |
| 1686 | 1762 |
| 1687 | 1375 |
| 1688 | 1807 |
| 1689 | 1002 |
| 1690 | 1752 |
| 1691 | 1925 |
| 1692 | 1493 |
| 1693 | 1694 |
| 1694 | 893 |

TABLE Q19-continued

| with a sequence length of 2048: | |
|---|---|
| Reliability or reliability sequence number | Polarized channel sequence number |
| 1695 | 1844 |
| 1696 | 1466 |
| 1697 | 1654 |
| 1698 | 1815 |
| 1699 | 1507 |
| 1700 | 1009 |
| 1701 | 1709 |
| 1702 | 1926 |
| 1703 | 1391 |
| 1704 | 1657 |
| 1705 | 975 |
| 1706 | 1868 |
| 1707 | 1494 |
| 1708 | 1735 |
| 1709 | 1715 |
| 1710 | 955 |
| 1711 | 1468 |
| 1712 | 1764 |
| 1713 | 1929 |
| 1714 | 1497 |
| 1715 | 1710 |
| 1716 | 511 |
| 1717 | 1874 |
| 1718 | 1658 |
| 1719 | 1277 |
| 1720 | 1848 |
| 1721 | 1739 |
| 1722 | 1004 |
| 1723 | 1509 |
| 1724 | 1819 |
| 1725 | 1599 |
| 1726 | 1439 |
| 1727 | 1889 |
| 1728 | 894 |
| 1729 | 1717 |
| 1730 | 1831 |
| 1731 | 1399 |
| 1732 | 1768 |
| 1733 | 1010 |
| 1734 | 1876 |
| 1735 | 1498 |
| 1736 | 1930 |
| 1737 | 1660 |
| 1738 | 1510 |
| 1739 | 1012 |
| 1740 | 1937 |
| 1741 | 1741 |
| 1742 | 1821 |
| 1743 | 1513 |
| 1744 | 1718 |
| 1745 | 957 |
| 1746 | 1835 |
| 1747 | 1455 |
| 1748 | 1747 |
| 1749 | 1890 |
| 1750 | 1721 |
| 1751 | 1403 |
| 1752 | 983 |
| 1753 | 1880 |
| 1754 | 1776 |
| 1755 | 1500 |
| 1756 | 1932 |
| 1757 | 1742 |
| 1758 | 767 |
| 1759 | 1822 |
| 1760 | 1278 |
| 1761 | 1631 |
| 1762 | 1938 |
| 1763 | 1863 |
| 1764 | 987 |
| 1765 | 1463 |
| 1766 | 1749 |
| 1767 | 1953 |
| 1768 | 1722 |
| 1769 | 1514 |

TABLE Q19-continued

| with a sequence length of 2048: | |
|---|---|
| Reliability or reliability sequence number | Polarized channel sequence number |
| 1770 | 1837 |
| 1771 | 999 |
| 1772 | 1763 |
| 1773 | 1405 |
| 1774 | 1892 |
| 1775 | 1647 |
| 1776 | 1843 |
| 1777 | 1521 |
| 1778 | 1016 |
| 1779 | 1940 |
| 1780 | 1750 |
| 1781 | 1838 |
| 1782 | 1487 |
| 1783 | 1724 |
| 1784 | 958 |
| 1785 | 1867 |
| 1786 | 1753 |
| 1787 | 1467 |
| 1788 | 1896 |
| 1789 | 1954 |
| 1790 | 1765 |
| 1791 | 1516 |
| 1792 | 989 |
| 1793 | 1845 |
| 1794 | 1695 |
| 1795 | 1985 |
| 1796 | 1406 |
| 1797 | 1944 |
| 1798 | 1655 |
| 1799 | 1003 |
| 1800 | 1869 |
| 1801 | 1522 |
| 1802 | 1754 |
| 1803 | 1956 |
| 1804 | 1766 |
| 1805 | 1846 |
| 1806 | 990 |
| 1807 | 1524 |
| 1808 | 1875 |
| 1809 | 1769 |
| 1810 | 1849 |
| 1811 | 1469 |
| 1812 | 1904 |
| 1813 | 1711 |
| 1814 | 1005 |
| 1815 | 1927 |
| 1816 | 1495 |
| 1817 | 1659 |
| 1818 | 1870 |
| 1819 | 1986 |
| 1820 | 1756 |
| 1821 | 1279 |
| 1822 | 1011 |
| 1823 | 1877 |
| 1824 | 1719 |
| 1825 | 1850 |
| 1826 | 1499 |
| 1827 | 1960 |
| 1828 | 1770 |
| 1829 | 1931 |
| 1830 | 1006 |
| 1831 | 1891 |
| 1832 | 1511 |
| 1833 | 1661 |
| 1834 | 1878 |
| 1835 | 1852 |
| 1836 | 1777 |
| 1837 | 1528 |
| 1838 | 1013 |
| 1839 | 1881 |
| 1840 | 1743 |
| 1841 | 1988 |
| 1842 | 1933 |
| 1843 | 1470 |
| 1844 | 1723 |

TABLE Q19-continued

| with a sequence length of 2048: | |
|---|---|
| Reliability or reliability sequence number | Polarized channel sequence number |
| 1845 | 1893 |
| 1846 | 1939 |
| 1847 | 895 |
| 1848 | 1501 |
| 1849 | 1772 |
| 1850 | 1968 |
| 1851 | 1934 |
| 1852 | 1662 |
| 1853 | 1823 |
| 1854 | 1515 |
| 1855 | 1992 |
| 1856 | 959 |
| 1857 | 1778 |
| 1858 | 1882 |
| 1859 | 1941 |
| 1860 | 1502 |
| 1861 | 1780 |
| 1862 | 1894 |
| 1863 | 1897 |
| 1864 | 1725 |
| 1865 | 1014 |
| 1866 | 1517 |
| 1867 | 1955 |
| 1868 | 1884 |
| 1869 | 1751 |
| 1870 | 1839 |
| 1871 | 2000 |
| 1872 | 1523 |
| 1873 | 1942 |
| 1874 | 1755 |
| 1875 | 1017 |
| 1876 | 1945 |
| 1877 | 1957 |
| 1878 | 1767 |
| 1879 | 1518 |
| 1880 | 1898 |
| 1881 | 1847 |
| 1882 | 1784 |
| 1883 | 1905 |
| 1884 | 1525 |
| 1885 | 1018 |
| 1886 | 1946 |
| 1887 | 1871 |
| 1888 | 1726 |
| 1889 | 1900 |
| 1890 | 2016 |
| 1891 | 1757 |
| 1892 | 1407 |
| 1893 | 1958 |
| 1894 | 1987 |
| 1895 | 1851 |
| 1896 | 1020 |
| 1897 | 1771 |
| 1898 | 1961 |
| 1899 | 1471 |
| 1900 | 1906 |
| 1901 | 1948 |
| 1902 | 1758 |
| 1903 | 1879 |
| 1904 | 1989 |
| 1905 | 1773 |
| 1906 | 1526 |
| 1907 | 991 |
| 1908 | 1908 |
| 1909 | 1962 |
| 1910 | 1853 |
| 1911 | 1779 |
| 1912 | 1969 |
| 1913 | 1883 |
| 1914 | 1529 |
| 1915 | 1990 |
| 1916 | 1774 |
| 1917 | 1964 |
| 1918 | 1912 |
| 1919 | 1993 |

TABLE Q19-continued

| with a sequence length of 2048: | |
|---|---|
| Reliability or reliability sequence number | Polarized channel sequence number |
| 1920 | 1007 |
| 1921 | 1854 |
| 1922 | 1530 |
| 1923 | 1781 |
| 1924 | 1935 |
| 1925 | 1895 |
| 1926 | 1970 |
| 1927 | 1663 |
| 1928 | 1885 |
| 1929 | 1994 |
| 1930 | 1532 |
| 1931 | 1899 |
| 1932 | 1727 |
| 1933 | 1019 |
| 1934 | 1972 |
| 1935 | 1943 |
| 1936 | 2001 |
| 1937 | 1886 |
| 1938 | 1782 |
| 1939 | 1503 |
| 1940 | 1996 |
| 1941 | 1947 |
| 1942 | 2002 |
| 1943 | 1901 |
| 1944 | 1785 |
| 1945 | 1976 |
| 1946 | 1907 |
| 1947 | 1959 |
| 1948 | 1015 |
| 1949 | 1519 |
| 1950 | 2017 |
| 1951 | 1786 |
| 1952 | 1949 |
| 1953 | 1902 |
| 1954 | 1909 |
| 1955 | 2004 |
| 1956 | 1963 |
| 1957 | 1788 |
| 1958 | 1531 |
| 1959 | 2018 |
| 1960 | 2008 |
| 1961 | 1950 |
| 1962 | 1910 |
| 1963 | 1759 |
| 1964 | 1021 |
| 1965 | 1965 |
| 1966 | 1913 |
| 1967 | 1991 |
| 1968 | 1971 |
| 1969 | 2020 |
| 1970 | 1527 |
| 1971 | 1966 |
| 1972 | 1775 |
| 1973 | 1914 |
| 1974 | 1995 |
| 1975 | 1855 |
| 1976 | 1973 |
| 1977 | 2024 |
| 1978 | 1916 |
| 1979 | 1787 |
| 1980 | 1997 |
| 1981 | 1974 |
| 1982 | 1533 |
| 1983 | 2003 |
| 1984 | 1022 |
| 1985 | 1977 |
| 1986 | 2032 |
| 1987 | 1998 |
| 1988 | 1783 |
| 1989 | 1887 |
| 1990 | 2005 |
| 1991 | 1978 |
| 1992 | 2019 |
| 1993 | 1903 |
| 1994 | 2006 |

TABLE Q19-continued

| with a sequence length of 2048: | |
|---|---|
| Reliability or reliability sequence number | Polarized channel sequence number |
| 1995 | 1980 |
| 1996 | 2009 |
| 1997 | 1534 |
| 1998 | 1789 |
| 1999 | 2021 |
| 2000 | 1951 |
| 2001 | 1911 |
| 2002 | 2010 |
| 2003 | 2022 |
| 2004 | 2025 |
| 2005 | 1967 |
| 2006 | 1915 |
| 2007 | 2012 |
| 2008 | 1023 |
| 2009 | 1790 |
| 2010 | 1975 |
| 2011 | 2026 |
| 2012 | 1917 |
| 2013 | 2033 |
| 2014 | 1999 |
| 2015 | 1979 |
| 2016 | 1535 |
| 2017 | 2028 |
| 2018 | 1918 |
| 2019 | 2034 |
| 2020 | 2036 |
| 2021 | 1981 |
| 2022 | 2007 |
| 2023 | 1791 |
| 2024 | 2011 |
| 2025 | 2023 |
| 2026 | 2040 |
| 2027 | 1982 |
| 2028 | 2013 |
| 2029 | 2027 |
| 2030 | 2014 |
| 2031 | 2029 |
| 2032 | 2035 |
| 2033 | 2030 |
| 2034 | 2037 |
| 2035 | 1919 |
| 2036 | 1983 |
| 2037 | 2038 |
| 2038 | 2041 |
| 2039 | 2042 |
| 2040 | 2044 |
| 2041 | 2015 |
| 2042 | 2031 |
| 2043 | 2043 |
| 2044 | 2039 |
| 2045 | 2045 |
| 2046 | 2046 |
| 2047 | 2047 |

Sequence Q20, with a sequence length of 1024

[0, 1, 2, 4, 8, 16, 32, 3, 256, 512, 5, 64, 9, 6, 17, 10, 18, 128, 12, 33, 65, 20, 34, 24, 36, 257, 7, 129, 66, 11, 40, 68, 513, 130, 19, 13, 48, 14, 72, 258, 21, 132, 35, 26, 80, 37, 25, 22, 136, 514, 26 0, 38, 96, 67, 41, 144, 28, 69, 42, 264, 49, 74, 160, 516, 192, 70, 44, 272, 131, 81, 50, 73, 15, 133, 28 8, 520, 52, 23, 134, 76, 137, 82, 259, 56, 27, 97, 528, 39, 261, 84, 138, 145, 29, 43, 320, 544, 98, 88, 140, 30, 265, 146, 71, 161, 515, 45, 262, 100, 51, 148, 46, 273, 768, 75, 104, 162, 266, 53, 193, 15 2, 517, 77, 274, 164, 54, 83, 384, 576, 57, 112, 135, 268, 78, 194, 521, 85, 289, 58, 168, 139, 321, 5 18, 99, 86, 276, 60, 89, 529, 196, 290, 141, 101, 280, 147, 522, 176, 142, 292, 31, 200, 530, 263, 9 0, 149, 385, 640, 102, 105, 163, 322, 92, 524, 47, 267, 208, 150, 545, 296, 153, 165, 324, 577, 106, 55, 386, 113, 154, 532, 275, 79, 108, 546, 269, 224, 166, 304, 536, 195, 59, 270, 169, 548, 328, 1 14, 156, 277, 769, 87, 197, 388, 519, 116, 291, 170, 61, 641, 282, 177, 91, 578, 336, 198, 293, 172, 523, 120, 281, 201, 552, 278, 62, 392, 580, 143, 103, 294, 642, 178, 352, 93, 531, 202, 323, 107, 525, 297, 180, 400, 560, 151, 209, 284, 526, 94, 325, 204, 584, 298, 155, 770, 305, 210, 109, 533, 330, 184, 416, 644, 115, 448, 547, 167, 326, 225, 538, 300, 157, 592, 387, 110, 337, 549, 117, 21 2, 537, 306, 171, 329, 534, 226, 271, 648, 216, 389, 772, 158, 308, 550, 118, 279, 173, 608, 390, 1 21, 579, 332, 199, 553, 179, 228, 656, 393, 174, 540, 338, 122, 581, 312, 203, 283, 554, 63, 353, 7 76, 181, 295, 561, 232, 340, 586, 394, 672, 124, 401, 704, 205, 285, 582, 182, 299, 556, 211, 354, 784, 185, 344, 643, 240, 396, 593, 206, 286, 562, 95, 585, 402, 327, 527, 213, 417, 645, 186, 800, 301, 227, 564, 356, 111, 535, 307, 646, 404, 214, 588, 302, 188, 649, 331, 594, 217, 360, 771, 41 8, 229, 568, 309, 539, 159, 449, 609, 408, 551, 119, 333, 773, 218, 596, 420, 230, 650, 310, 657, 3 39, 541, 233, 313, 555, 368, 832, 175, 391, 610, 123, 600, 334, 450, 652, 220, 542, 341, 777, 183, 314, 658, 424, 583, 234, 673, 395, 557, 355, 125, 774, 342, 612, 316, 563, 241, 345, 660, 207, 55 8, 452, 785, 397, 587, 187, 357, 616, 403, 674, 236, 778, 432, 565, 398, 705, 126, 664, 287, 456, 5 89, 242, 786, 346, 676, 405, 566, 244, 595, 358, 896, 361, 569, 189, 624, 419, 647, 348, 215, 780, 303, 590, 464, 706, 406, 597, 219, 801, 409, 570, 421, 680, 231, 651, 362, 833, 311, 611, 248, 59 8, 369, 788, 410, 572, 335, 601, 190, 708, 364, 802, 480, 221, 422, 653, 451, 613, 315, 792, 235, 6 59, 425, 688, 370, 654, 412, 804, 222, 543, 343, 712, 453, 775, 237, 602, 372, 661, 426, 897, 317, 614, 243, 617, 675, 433, 834, 347, 604, 454, 559, 238, 779, 428, 720, 376, 662, 457, 808, 318, 66 5, 245, 677, 399, 836, 618, 359, 567, 434, 898, 127, 625, 349, 666, 458, 787, 591, 363, 620, 191, 7 81, 436, 736, 407, 678, 465, 816, 707, 350, 571, 246, 782, 460, 681, 840, 411, 626, 466, 668, 365, 789, 249, 599, 709, 440, 900, 371, 628, 803, 423, 682, 481, 573, 250, 794, 689, 413, 603, 366, 84 8, 710, 373, 805, 468, 684, 427, 632, 793, 252, 713, 482, 790, 574, 472, 904, 414, 655, 615, 374, 8 06, 690, 223, 864, 429, 605, 714, 377, 835, 455, 619, 809, 435, 692, 912, 484, 663, 430, 721, 796, 239, 606, 837, 378, 716, 459, 810, 667, 319, 817, 722, 437, 621, 842, 488, 696, 380, 928, 627, 25 1, 960, 679, 461, 838, 737, 438, 812, 669, 467, 899, 622, 441, 849, 629, 496, 724, 462, 818, 683, 2 47, 841, 738, 351, 783, 728, 901, 469, 670, 820, 442, 630, 791, 483, 685, 902, 367, 633, 844, 470, 711, 691, 444, 740, 905, 473, 686, 850, 634, 253, 824, 715, 485, 795, 575, 415, 865, 693, 807, 37 5, 744, 852, 474, 906, 636, 486, 913, 717, 797, 489, 694, 811, 431, 723, 866, 697, 379, 856, 752, 4 76, 908, 718, 798, 254, 607, 914, 839, 439, 725, 929, 698, 490, 813, 739, 381, 868, 623, 819, 497, 916, 726, 814, 463, 700, 843, 729, 443, 872, 930, 741, 492, 821, 671, 961, 382, 920, 631, 845, 49 8, 730, 932, 742, 822, 500, 851, 745, 825, 445, 880, 687, 903, 471, 635, 846, 962, 732, 255, 853, 6 95, 826, 475, 936, 746, 907, 867, 487, 637, 854, 828, 753, 504, 857, 719, 964, 909, 446, 699, 869, 915, 477, 748, 944, 910, 638, 799, 491, 968, 754, 858, 917, 478, 756, 870, 873, 701, 493, 931, 86 0, 727, 815, 976, 499, 918, 731, 921, 933, 743, 494, 874, 823, 760, 881, 501, 922, 847, 702, 876, 9 92, 733, 383, 934, 963, 827, 747, 937, 447, 882, 924, 734, 855, 965, 749, 502, 884, 938, 829, 755, 945, 859, 505, 966, 750, 940, 888, 969, 830, 506, 757, 911, 871, 946, 639, 861, 970, 508, 875, 70 3, 948, 919, 977, 862, 758, 479, 972, 923, 978, 877, 761, 952, 883, 935, 495, 993, 762, 925, 878, 8 85, 980, 939, 764, 507, 994, 984, 926, 886, 735, 941, 889, 967, 947, 996, 503, 942, 751, 890, 971, 831, 949, 1000, 892, 763, 973, 950, 509, 979, 953, 1008, 974, 759, 863, 981, 954, 995, 879, 982, 956, 985, 510, 765, 997, 927, 887, 986, 998, 1001, 943, 891, 988, 766, 951, 1002, 893, 1009, 975, 955, 511, 1004, 894, 1010, 1012, 957, 983, 767, 987, 999, 1016, 958, 989, 1003, 990, 1005, 101 1, 1006, 1013, 895, 959, 1014, 1017, 1018, 1020, 991, 1007, 1019, 1015, 1021, 1022, 1023]

TABLE Q20 with a sequence length of 1024:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 256 |
| 9 | 512 |
| 10 | 5 |
| 11 | 64 |
| 12 | 9 |
| 13 | 6 |
| 14 | 17 |
| 15 | 10 |
| 16 | 18 |
| 17 | 128 |
| 18 | 12 |
| 19 | 33 |
| 20 | 65 |
| 21 | 20 |
| 22 | 34 |
| 23 | 24 |
| 24 | 36 |
| 25 | 257 |
| 26 | 7 |
| 27 | 129 |
| 28 | 66 |
| 29 | 11 |
| 30 | 40 |
| 31 | 68 |
| 32 | 513 |
| 33 | 130 |
| 34 | 19 |
| 35 | 13 |
| 36 | 48 |
| 37 | 14 |
| 38 | 72 |
| 39 | 258 |
| 40 | 21 |
| 41 | 132 |
| 42 | 35 |
| 43 | 26 |
| 44 | 80 |
| 45 | 37 |
| 46 | 25 |
| 47 | 22 |
| 48 | 136 |
| 49 | 514 |
| 50 | 260 |
| 51 | 38 |
| 52 | 96 |
| 53 | 67 |
| 54 | 41 |
| 55 | 144 |
| 56 | 28 |
| 57 | 69 |
| 58 | 42 |
| 59 | 264 |
| 60 | 49 |
| 61 | 74 |
| 62 | 160 |

TABLE Q20-continued with a sequence length of 1024:

| Reliability or reliability sequence number | Polarized channel sequence number |
|---|---|
| 63 | 516 |
| 64 | 192 |
| 65 | 70 |
| 66 | 44 |
| 67 | 272 |
| 68 | 131 |
| 69 | 81 |
| 70 | 50 |
| 71 | 73 |
| 72 | 15 |
| 73 | 133 |
| 74 | 288 |
| 75 | 520 |
| 76 | 52 |
| 77 | 23 |
| 78 | 134 |
| 79 | 76 |
| 80 | 137 |
| 81 | 82 |
| 82 | 259 |
| 83 | 56 |
| 84 | 27 |
| 85 | 97 |
| 86 | 528 |
| 87 | 39 |
| 88 | 261 |
| 89 | 84 |
| 90 | 138 |
| 91 | 145 |
| 92 | 29 |
| 93 | 43 |
| 94 | 320 |
| 95 | 544 |
| 96 | 98 |
| 97 | 88 |
| 98 | 140 |
| 99 | 30 |
| 100 | 265 |
| 101 | 146 |
| 102 | 71 |
| 103 | 161 |
| 104 | 515 |
| 105 | 45 |
| 106 | 262 |
| 107 | 100 |
| 108 | 51 |
| 109 | 148 |
| 110 | 46 |
| 111 | 273 |
| 112 | 768 |
| 113 | 75 |
| 114 | 104 |
| 115 | 162 |
| 116 | 266 |
| 117 | 53 |
| 118 | 193 |
| 119 | 152 |
| 120 | 517 |
| 121 | 77 |
| 122 | 274 |
| 123 | 164 |
| 124 | 54 |
| 125 | 83 |
| 126 | 384 |
| 127 | 576 |
| 128 | 57 |
| 129 | 112 |
| 130 | 135 |
| 131 | 268 |
| 132 | 78 |
| 133 | 194 |
| 134 | 521 |
| 135 | 85 |
| 136 | 289 |
| 137 | 58 |

TABLE Q20-continued with a sequence length of 1024:

| Reliability or reliability sequence number | Polarized channel sequence number |
|---|---|
| 138 | 168 |
| 139 | 139 |
| 140 | 321 |
| 141 | 518 |
| 142 | 99 |
| 143 | 86 |
| 144 | 276 |
| 145 | 60 |
| 146 | 89 |
| 147 | 529 |
| 148 | 196 |
| 149 | 290 |
| 150 | 141 |
| 151 | 101 |
| 152 | 280 |
| 153 | 147 |
| 154 | 522 |
| 155 | 176 |
| 156 | 142 |
| 157 | 292 |
| 158 | 31 |
| 159 | 200 |
| 160 | 530 |
| 161 | 263 |
| 162 | 90 |
| 163 | 149 |
| 164 | 385 |
| 165 | 640 |
| 166 | 102 |
| 167 | 105 |
| 168 | 163 |
| 169 | 322 |
| 170 | 92 |
| 171 | 524 |
| 172 | 47 |
| 173 | 267 |
| 174 | 208 |
| 175 | 150 |
| 176 | 545 |
| 177 | 296 |
| 178 | 153 |
| 179 | 165 |
| 180 | 324 |
| 181 | 577 |
| 182 | 106 |
| 183 | 55 |
| 184 | 386 |
| 185 | 113 |
| 186 | 154 |
| 187 | 532 |
| 188 | 275 |
| 189 | 79 |
| 190 | 108 |
| 191 | 546 |
| 192 | 269 |
| 193 | 224 |
| 194 | 166 |
| 195 | 304 |
| 196 | 536 |
| 197 | 195 |
| 198 | 59 |
| 199 | 270 |
| 200 | 169 |
| 201 | 548 |
| 202 | 328 |
| 203 | 114 |
| 204 | 156 |
| 205 | 277 |
| 206 | 769 |
| 207 | 87 |
| 208 | 197 |
| 209 | 388 |
| 210 | 519 |
| 211 | 116 |
| 212 | 291 |

TABLE Q20-continued with a sequence length of 1024:

| Reliability or reliability sequence number | Polarized channel sequence number |
|---|---|
| 213 | 170 |
| 214 | 61 |
| 215 | 641 |
| 216 | 282 |
| 217 | 177 |
| 218 | 91 |
| 219 | 578 |
| 220 | 336 |
| 221 | 198 |
| 222 | 293 |
| 223 | 172 |
| 224 | 523 |
| 225 | 120 |
| 226 | 281 |
| 227 | 201 |
| 228 | 552 |
| 229 | 278 |
| 230 | 62 |
| 231 | 392 |
| 232 | 580 |
| 233 | 143 |
| 234 | 103 |
| 235 | 294 |
| 236 | 642 |
| 237 | 178 |
| 238 | 352 |
| 239 | 93 |
| 240 | 531 |
| 241 | 202 |
| 242 | 323 |
| 243 | 107 |
| 244 | 525 |
| 245 | 297 |
| 246 | 180 |
| 247 | 400 |
| 248 | 560 |
| 249 | 151 |
| 250 | 209 |
| 251 | 284 |
| 252 | 526 |
| 253 | 94 |
| 254 | 325 |
| 255 | 204 |
| 256 | 584 |
| 257 | 298 |
| 258 | 155 |
| 259 | 770 |
| 260 | 305 |
| 261 | 210 |
| 262 | 109 |
| 263 | 533 |
| 264 | 330 |
| 265 | 184 |
| 266 | 416 |
| 267 | 644 |
| 268 | 115 |
| 269 | 448 |
| 270 | 547 |
| 271 | 167 |
| 272 | 326 |
| 273 | 225 |
| 274 | 538 |
| 275 | 300 |
| 276 | 157 |
| 277 | 592 |
| 278 | 387 |
| 279 | 110 |
| 280 | 337 |
| 281 | 549 |
| 282 | 117 |
| 283 | 212 |
| 284 | 537 |
| 285 | 306 |
| 286 | 171 |
| 287 | 329 |

TABLE Q20-continued with a sequence length of 1024:

| Reliability or reliability sequence number | Polarized channel sequence number |
|---|---|
| 288 | 534 |
| 289 | 226 |
| 290 | 271 |
| 291 | 648 |
| 292 | 216 |
| 293 | 389 |
| 294 | 772 |
| 295 | 158 |
| 296 | 308 |
| 297 | 550 |
| 298 | 118 |
| 299 | 279 |
| 300 | 173 |
| 301 | 608 |
| 302 | 390 |
| 303 | 121 |
| 304 | 579 |
| 305 | 332 |
| 306 | 199 |
| 307 | 553 |
| 308 | 179 |
| 309 | 228 |
| 310 | 656 |
| 311 | 393 |
| 312 | 174 |
| 313 | 540 |
| 314 | 338 |
| 315 | 122 |
| 316 | 581 |
| 317 | 312 |
| 318 | 203 |
| 319 | 283 |
| 320 | 554 |
| 321 | 63 |
| 322 | 353 |
| 323 | 776 |
| 324 | 181 |
| 325 | 295 |
| 326 | 561 |
| 327 | 232 |
| 328 | 340 |
| 329 | 586 |
| 330 | 394 |
| 331 | 672 |
| 332 | 124 |
| 333 | 401 |
| 334 | 704 |
| 335 | 205 |
| 336 | 285 |
| 337 | 582 |
| 338 | 182 |
| 339 | 299 |
| 340 | 556 |
| 341 | 211 |
| 342 | 354 |
| 343 | 784 |
| 344 | 185 |
| 345 | 344 |
| 346 | 643 |
| 347 | 240 |
| 348 | 396 |
| 349 | 593 |
| 350 | 206 |
| 351 | 286 |
| 352 | 562 |
| 353 | 95 |
| 354 | 585 |
| 355 | 402 |
| 356 | 327 |
| 357 | 527 |
| 358 | 213 |
| 359 | 417 |
| 360 | 645 |
| 361 | 186 |
| 362 | 800 |

TABLE Q20-continued with a sequence length of 1024:

| Reliability or reliability sequence number | Polarized channel sequence number |
|---|---|
| 363 | 301 |
| 364 | 227 |
| 365 | 564 |
| 366 | 356 |
| 367 | 111 |
| 368 | 535 |
| 369 | 307 |
| 370 | 646 |
| 371 | 404 |
| 372 | 214 |
| 373 | 588 |
| 374 | 302 |
| 375 | 188 |
| 376 | 649 |
| 377 | 331 |
| 378 | 594 |
| 379 | 217 |
| 380 | 360 |
| 381 | 771 |
| 382 | 418 |
| 383 | 229 |
| 384 | 568 |
| 385 | 309 |
| 386 | 539 |
| 387 | 159 |
| 388 | 449 |
| 389 | 609 |
| 390 | 408 |
| 391 | 551 |
| 392 | 119 |
| 393 | 333 |
| 394 | 773 |
| 395 | 218 |
| 396 | 596 |
| 397 | 420 |
| 398 | 230 |
| 399 | 650 |
| 400 | 310 |
| 401 | 657 |
| 402 | 339 |
| 403 | 541 |
| 404 | 233 |
| 405 | 313 |
| 406 | 555 |
| 407 | 368 |
| 408 | 832 |
| 409 | 175 |
| 410 | 391 |
| 411 | 610 |
| 412 | 123 |
| 413 | 600 |
| 414 | 334 |
| 415 | 450 |
| 416 | 652 |
| 417 | 220 |
| 418 | 542 |
| 419 | 341 |
| 420 | 777 |
| 421 | 183 |
| 422 | 314 |
| 423 | 658 |
| 424 | 424 |
| 425 | 583 |
| 426 | 234 |
| 427 | 673 |
| 428 | 395 |
| 429 | 557 |
| 430 | 355 |
| 431 | 125 |
| 432 | 774 |
| 433 | 342 |
| 434 | 612 |
| 435 | 316 |
| 436 | 563 |
| 437 | 241 |

TABLE Q20-continued

| with a sequence length of 1024: | |
|---|---|
| Reliability or reliability sequence number | Polarized channel sequence number |
| 438 | 345 |
| 439 | 660 |
| 440 | 207 |
| 441 | 558 |
| 442 | 452 |
| 443 | 785 |
| 444 | 397 |
| 445 | 587 |
| 446 | 187 |
| 447 | 357 |
| 448 | 616 |
| 449 | 403 |
| 450 | 674 |
| 451 | 236 |
| 452 | 778 |
| 453 | 432 |
| 454 | 565 |
| 455 | 398 |
| 456 | 705 |
| 457 | 126 |
| 458 | 664 |
| 459 | 287 |
| 460 | 456 |
| 461 | 589 |
| 462 | 242 |
| 463 | 786 |
| 464 | 346 |
| 465 | 676 |
| 466 | 405 |
| 467 | 566 |
| 468 | 244 |
| 469 | 595 |
| 470 | 358 |
| 471 | 896 |
| 472 | 361 |
| 473 | 569 |
| 474 | 189 |
| 475 | 624 |
| 476 | 419 |
| 477 | 647 |
| 478 | 348 |
| 479 | 215 |
| 480 | 780 |
| 481 | 303 |
| 482 | 590 |
| 483 | 464 |
| 484 | 706 |
| 485 | 406 |
| 486 | 597 |
| 487 | 219 |
| 488 | 801 |
| 489 | 409 |
| 490 | 570 |
| 491 | 421 |
| 492 | 680 |
| 493 | 231 |
| 494 | 651 |
| 495 | 362 |
| 496 | 833 |
| 497 | 311 |
| 498 | 611 |
| 499 | 248 |
| 500 | 598 |
| 501 | 369 |
| 502 | 788 |
| 503 | 410 |
| 504 | 572 |
| 505 | 335 |
| 506 | 601 |
| 507 | 190 |
| 508 | 708 |
| 509 | 364 |
| 510 | 802 |
| 511 | 480 |
| 512 | 221 |

TABLE Q20-continued

| with a sequence length of 1024: | |
|---|---|
| Reliability or reliability sequence number | Polarized channel sequence number |
| 513 | 422 |
| 514 | 653 |
| 515 | 451 |
| 516 | 613 |
| 517 | 315 |
| 518 | 792 |
| 519 | 235 |
| 520 | 659 |
| 521 | 425 |
| 522 | 688 |
| 523 | 370 |
| 524 | 654 |
| 525 | 412 |
| 526 | 804 |
| 527 | 222 |
| 528 | 543 |
| 529 | 343 |
| 530 | 712 |
| 531 | 453 |
| 532 | 775 |
| 533 | 237 |
| 534 | 602 |
| 535 | 372 |
| 536 | 661 |
| 537 | 426 |
| 538 | 897 |
| 539 | 317 |
| 540 | 614 |
| 541 | 243 |
| 542 | 617 |
| 543 | 675 |
| 544 | 433 |
| 545 | 834 |
| 546 | 347 |
| 547 | 604 |
| 548 | 454 |
| 549 | 559 |
| 550 | 238 |
| 551 | 779 |
| 552 | 428 |
| 553 | 720 |
| 554 | 376 |
| 555 | 662 |
| 556 | 457 |
| 557 | 808 |
| 558 | 318 |
| 559 | 665 |
| 560 | 245 |
| 561 | 677 |
| 562 | 399 |
| 563 | 836 |
| 564 | 618 |
| 565 | 359 |
| 566 | 567 |
| 567 | 434 |
| 568 | 898 |
| 569 | 127 |
| 570 | 625 |
| 571 | 349 |
| 572 | 666 |
| 573 | 458 |
| 574 | 787 |
| 575 | 591 |
| 576 | 363 |
| 577 | 620 |
| 578 | 191 |
| 579 | 781 |
| 580 | 436 |
| 581 | 736 |
| 582 | 407 |
| 583 | 678 |
| 584 | 465 |
| 585 | 816 |
| 586 | 707 |
| 587 | 350 |

TABLE Q20-continued with a sequence length of 1024:

| Reliability or reliability sequence number | Polarized channel sequence number |
|---|---|
| 588 | 571 |
| 589 | 246 |
| 590 | 782 |
| 591 | 460 |
| 592 | 681 |
| 593 | 840 |
| 594 | 411 |
| 595 | 626 |
| 596 | 466 |
| 597 | 668 |
| 598 | 365 |
| 599 | 789 |
| 600 | 249 |
| 601 | 599 |
| 602 | 709 |
| 603 | 440 |
| 604 | 900 |
| 605 | 371 |
| 606 | 628 |
| 607 | 803 |
| 608 | 423 |
| 609 | 682 |
| 610 | 481 |
| 611 | 573 |
| 612 | 250 |
| 613 | 794 |
| 614 | 689 |
| 615 | 413 |
| 616 | 603 |
| 617 | 366 |
| 618 | 848 |
| 619 | 710 |
| 620 | 373 |
| 621 | 805 |
| 622 | 468 |
| 623 | 684 |
| 624 | 427 |
| 625 | 632 |
| 626 | 793 |
| 627 | 252 |
| 628 | 713 |
| 629 | 482 |
| 630 | 790 |
| 631 | 574 |
| 632 | 472 |
| 633 | 904 |
| 634 | 414 |
| 635 | 655 |
| 636 | 615 |
| 637 | 374 |
| 638 | 806 |
| 639 | 690 |
| 640 | 223 |
| 641 | 864 |
| 642 | 429 |
| 643 | 605 |
| 644 | 714 |
| 645 | 377 |
| 646 | 835 |
| 647 | 455 |
| 648 | 619 |
| 649 | 809 |
| 650 | 435 |
| 651 | 692 |
| 652 | 912 |
| 653 | 484 |
| 654 | 663 |
| 655 | 430 |
| 656 | 721 |
| 657 | 796 |
| 658 | 239 |
| 659 | 606 |
| 660 | 837 |
| 661 | 378 |
| 662 | 716 |

TABLE Q20-continued with a sequence length of 1024:

| Reliability or reliability sequence number | Polarized channel sequence number |
|---|---|
| 663 | 459 |
| 664 | 810 |
| 665 | 667 |
| 666 | 319 |
| 667 | 817 |
| 668 | 722 |
| 669 | 437 |
| 670 | 621 |
| 671 | 842 |
| 672 | 488 |
| 673 | 696 |
| 674 | 380 |
| 675 | 928 |
| 676 | 627 |
| 677 | 251 |
| 678 | 960 |
| 679 | 679 |
| 680 | 461 |
| 681 | 838 |
| 682 | 737 |
| 683 | 438 |
| 684 | 812 |
| 685 | 669 |
| 686 | 467 |
| 687 | 899 |
| 688 | 622 |
| 689 | 441 |
| 690 | 849 |
| 691 | 629 |
| 692 | 496 |
| 693 | 724 |
| 694 | 462 |
| 695 | 818 |
| 696 | 683 |
| 697 | 247 |
| 698 | 841 |
| 699 | 738 |
| 700 | 351 |
| 701 | 783 |
| 702 | 728 |
| 703 | 901 |
| 704 | 469 |
| 705 | 670 |
| 706 | 820 |
| 707 | 442 |
| 708 | 630 |
| 709 | 791 |
| 710 | 483 |
| 711 | 685 |
| 712 | 902 |
| 713 | 367 |
| 714 | 633 |
| 715 | 844 |
| 716 | 470 |
| 717 | 711 |
| 718 | 691 |
| 719 | 444 |
| 720 | 740 |
| 721 | 905 |
| 722 | 473 |
| 723 | 686 |
| 724 | 850 |
| 725 | 634 |
| 726 | 253 |
| 727 | 824 |
| 728 | 715 |
| 729 | 485 |
| 730 | 795 |
| 731 | 575 |
| 732 | 415 |
| 733 | 865 |
| 734 | 693 |
| 735 | 807 |
| 736 | 375 |
| 737 | 744 |

TABLE Q20-continued

| with a sequence length of 1024: | |
|---|---|
| Reliability or reliability sequence number | Polarized channel sequence number |
| 738 | 852 |
| 739 | 474 |
| 740 | 906 |
| 741 | 636 |
| 742 | 486 |
| 743 | 913 |
| 744 | 717 |
| 745 | 797 |
| 746 | 489 |
| 747 | 694 |
| 748 | 811 |
| 749 | 431 |
| 750 | 723 |
| 751 | 866 |
| 752 | 697 |
| 753 | 379 |
| 754 | 856 |
| 755 | 752 |
| 756 | 476 |
| 757 | 908 |
| 758 | 718 |
| 759 | 798 |
| 760 | 254 |
| 761 | 607 |
| 762 | 914 |
| 763 | 839 |
| 764 | 439 |
| 765 | 725 |
| 766 | 929 |
| 767 | 698 |
| 768 | 490 |
| 769 | 813 |
| 770 | 739 |
| 771 | 381 |
| 772 | 868 |
| 773 | 623 |
| 774 | 819 |
| 775 | 497 |
| 776 | 916 |
| 777 | 726 |
| 778 | 814 |
| 779 | 463 |
| 780 | 700 |
| 781 | 843 |
| 782 | 729 |
| 783 | 443 |
| 784 | 872 |
| 785 | 930 |
| 786 | 741 |
| 787 | 492 |
| 788 | 821 |
| 789 | 671 |
| 790 | 961 |
| 791 | 382 |
| 792 | 920 |
| 793 | 631 |
| 794 | 845 |
| 795 | 498 |
| 796 | 730 |
| 797 | 932 |
| 798 | 742 |
| 799 | 822 |
| 800 | 500 |
| 801 | 851 |
| 802 | 745 |
| 803 | 825 |
| 804 | 445 |
| 805 | 880 |
| 806 | 687 |
| 807 | 903 |
| 808 | 471 |
| 809 | 635 |
| 810 | 846 |
| 811 | 962 |
| 812 | 732 |

TABLE Q20-continued

| with a sequence length of 1024: | |
|---|---|
| Reliability or reliability sequence number | Polarized channel sequence number |
| 813 | 255 |
| 814 | 853 |
| 815 | 695 |
| 816 | 826 |
| 817 | 475 |
| 818 | 936 |
| 819 | 746 |
| 820 | 907 |
| 821 | 867 |
| 822 | 487 |
| 823 | 637 |
| 824 | 854 |
| 825 | 828 |
| 826 | 753 |
| 827 | 504 |
| 828 | 857 |
| 829 | 719 |
| 830 | 964 |
| 831 | 909 |
| 832 | 446 |
| 833 | 699 |
| 834 | 869 |
| 835 | 915 |
| 836 | 477 |
| 837 | 748 |
| 838 | 944 |
| 839 | 910 |
| 840 | 638 |
| 841 | 799 |
| 842 | 491 |
| 843 | 968 |
| 844 | 754 |
| 845 | 858 |
| 846 | 917 |
| 847 | 478 |
| 848 | 756 |
| 849 | 870 |
| 850 | 873 |
| 851 | 701 |
| 852 | 493 |
| 853 | 931 |
| 854 | 860 |
| 855 | 727 |
| 856 | 815 |
| 857 | 976 |
| 858 | 499 |
| 859 | 918 |
| 860 | 731 |
| 861 | 921 |
| 862 | 933 |
| 863 | 743 |
| 864 | 494 |
| 865 | 874 |
| 866 | 823 |
| 867 | 760 |
| 868 | 881 |
| 869 | 501 |
| 870 | 922 |
| 871 | 847 |
| 872 | 702 |
| 873 | 876 |
| 874 | 992 |
| 875 | 733 |
| 876 | 383 |
| 877 | 934 |
| 878 | 963 |
| 879 | 827 |
| 880 | 747 |
| 881 | 937 |
| 882 | 447 |
| 883 | 882 |
| 884 | 924 |
| 885 | 734 |
| 886 | 855 |
| 887 | 965 |

TABLE Q20-continued with a sequence length of 1024:

| Reliability or reliability sequence number | Polarized channel sequence number |
|---|---|
| 888 | 749 |
| 889 | 502 |
| 890 | 884 |
| 891 | 938 |
| 892 | 829 |
| 893 | 755 |
| 894 | 945 |
| 895 | 859 |
| 896 | 505 |
| 897 | 966 |
| 898 | 750 |
| 899 | 940 |
| 900 | 888 |
| 901 | 969 |
| 902 | 830 |
| 903 | 506 |
| 904 | 757 |
| 905 | 911 |
| 906 | 871 |
| 907 | 946 |
| 908 | 639 |
| 909 | 861 |
| 910 | 970 |
| 911 | 508 |
| 912 | 875 |
| 913 | 703 |
| 914 | 948 |
| 915 | 919 |
| 916 | 977 |
| 917 | 862 |
| 918 | 758 |
| 919 | 479 |
| 920 | 972 |
| 921 | 923 |
| 922 | 978 |
| 923 | 877 |
| 924 | 761 |
| 925 | 952 |
| 926 | 883 |
| 927 | 935 |
| 928 | 495 |
| 929 | 993 |
| 930 | 762 |
| 931 | 925 |
| 932 | 878 |
| 933 | 885 |
| 934 | 980 |
| 935 | 939 |
| 936 | 764 |
| 937 | 507 |
| 938 | 994 |
| 939 | 984 |
| 940 | 926 |
| 941 | 886 |
| 942 | 735 |
| 943 | 941 |
| 944 | 889 |
| 945 | 967 |
| 946 | 947 |
| 947 | 996 |
| 948 | 503 |
| 949 | 942 |
| 950 | 751 |
| 951 | 890 |
| 952 | 971 |
| 953 | 831 |
| 954 | 949 |
| 955 | 1000 |
| 956 | 892 |
| 957 | 763 |
| 958 | 973 |
| 959 | 950 |
| 960 | 509 |
| 961 | 979 |
| 962 | 953 |

TABLE Q20-continued with a sequence length of 1024:

| Reliability or reliability sequence number | Polarized channel sequence number |
|---|---|
| 963 | 1008 |
| 964 | 974 |
| 965 | 759 |
| 966 | 863 |
| 967 | 981 |
| 968 | 954 |
| 969 | 995 |
| 970 | 879 |
| 971 | 982 |
| 972 | 956 |
| 973 | 985 |
| 974 | 510 |
| 975 | 765 |
| 976 | 997 |
| 977 | 927 |
| 978 | 887 |
| 979 | 986 |
| 980 | 998 |
| 981 | 1001 |
| 982 | 943 |
| 983 | 891 |
| 984 | 988 |
| 985 | 766 |
| 986 | 951 |
| 987 | 1002 |
| 988 | 893 |
| 989 | 1009 |
| 990 | 975 |
| 991 | 955 |
| 992 | 511 |
| 993 | 1004 |
| 994 | 894 |
| 995 | 1010 |
| 996 | 1012 |
| 997 | 957 |
| 998 | 983 |
| 999 | 767 |
| 1000 | 987 |
| 1001 | 999 |
| 1002 | 1016 |
| 1003 | 958 |
| 1004 | 989 |
| 1005 | 1003 |
| 1006 | 990 |
| 1007 | 1005 |
| 1008 | 1011 |
| 1009 | 1006 |
| 1010 | 1013 |
| 1011 | 895 |
| 1012 | 959 |
| 1013 | 1014 |
| 1014 | 1017 |
| 1015 | 1018 |
| 1016 | 1020 |
| 1017 | 991 |
| 1018 | 1007 |
| 1019 | 1019 |
| 1020 | 1015 |
| 1021 | 1021 |
| 1022 | 1022 |
| 1023 | 1023 |

Sequence Q21, with a sequence length of 512:

[0, 1, 2, 4, 8, 16, 32, 3, 256, 5, 64, 9, 6, 17, 10, 18, 128, 12, 33, 65, 20, 34, 24, 36, 257, 7, 1 29, 66, 11, 40, 68, 130, 19, 13, 48, 14, 72, 258, 21, 132, 35, 26, 80, 37, 25, 22, 136, 260, 38, 96, 67, 4 1, 144, 28, 69, 42, 264, 49, 74, 160, 192, 70, 44, 272, 131, 81, 50, 73, 15, 133, 288, 52, 23, 134, 76, 1 37, 82, 259, 56, 27, 97, 39, 261, 84, 138, 145, 29, 43, 320, 98, 88, 140, 30, 265, 146, 71, 161, 45, 26 2, 100, 51, 148, 46, 273, 75, 104, 162, 266, 53, 193, 152, 77, 274, 164, 54, 83, 384, 57, 112, 135, 26 8, 78, 194, 85, 289, 58, 168, 139, 321, 99, 86, 276, 60, 89, 196, 290, 141, 101, 280, 147, 176, 142, 2 92, 31, 200, 263, 90, 149, 385, 102, 105, 163, 322, 92, 47, 267, 208, 150, 296, 153, 165, 324, 106, 55, 386, 113, 154, 275, 79, 108, 269, 224, 166, 304, 195, 59, 270, 169, 328, 114, 156, 277, 87, 197, 388, 116, 291, 170, 61, 282, 177, 91, 336, 198, 293, 172, 120, 281, 201, 278, 62, 392, 143, 103, 2 94, 178, 352, 93, 202, 323, 107, 297, 180, 400, 151, 209, 284, 94, 325, 204, 298, 155, 305, 210, 10 9, 330, 184, 416, 115, 448, 167, 326, 225, 300, 157, 387, 110, 337, 117, 212, 306, 171, 329, 226, 2 71, 216, 389, 158, 308, 118, 279, 173, 390, 121, 332, 199, 179, 228, 393, 174, 338, 122, 312, 203, 283, 63, 353, 181, 295, 232, 340, 394, 124, 401, 205, 285, 182, 299, 211, 354, 185, 344, 240, 396, 206, 286, 95, 402, 327, 213, 417, 186, 301, 227, 356, 111, 307, 404, 214, 302, 188, 331, 217, 360, 418, 229, 309, 159, 449, 408, 119, 333, 218, 420, 230, 310, 339, 233, 313, 368, 175, 391, 123, 33 4, 450, 220, 341, 183, 314, 424, 234, 395, 355, 125, 342, 316, 241, 345, 207, 452, 397, 187, 357, 4 03, 236, 432, 398, 126, 287, 456, 242, 346, 405, 244, 358, 361, 189, 419, 348, 215, 303, 464, 406, 219, 409, 421, 231, 362, 311, 248, 369, 410, 335, 190, 364, 480, 221, 422, 451, 315, 235, 425, 37 0, 412, 222, 343, 453, 237, 372, 426, 317, 243, 433, 347, 454, 238, 428, 376, 457, 318, 245, 399, 3 59, 434, 127, 349, 458, 363, 191, 436, 407, 465, 350, 246, 460, 411, 466, 365, 249, 440, 371, 423, 481, 250, 413, 366, 373, 468, 427, 252, 482, 472, 414, 374, 223, 429, 377, 455, 435, 484, 430, 23 9, 378, 459, 319, 437, 488, 380, 251, 461, 438, 467, 441, 496, 462, 247, 351, 469, 442, 483, 367, 4 70, 444, 473, 253, 485, 415, 375, 474, 486, 489, 431, 379, 476, 254, 439, 490, 381, 497, 463, 443, 492, 382, 498, 500, 445, 471, 255, 475, 487, 504, 446, 477, 491, 478, 493, 499, 494, 501, 383, 44 7, 502, 505, 506, 508, 479, 495, 507, 503, 509, 510, 511]

TABLE Q21 with a sequence length of 512:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 256 |
| 9 | 5 |
| 10 | 64 |
| 11 | 9 |
| 12 | 6 |
| 13 | 17 |
| 14 | 10 |
| 15 | 18 |
| 16 | 128 |
| 17 | 12 |
| 18 | 33 |
| 19 | 65 |
| 20 | 20 |
| 21 | 34 |
| 22 | 24 |
| 23 | 36 |
| 24 | 257 |
| 25 | 7 |
| 26 | 129 |
| 27 | 66 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 258 |
| 38 | 21 |
| 39 | 132 |
| 40 | 35 |
| 41 | 26 |
| 42 | 80 |
| 43 | 37 |
| 44 | 25 |
| 45 | 22 |
| 46 | 136 |
| 47 | 260 |
| 48 | 38 |
| 49 | 96 |
| 50 | 67 |
| 51 | 41 |
| 52 | 144 |
| 53 | 28 |
| 54 | 69 |
| 55 | 42 |
| 56 | 264 |
| 57 | 49 |
| 58 | 74 |
| 59 | 160 |
| 60 | 192 |
| 61 | 70 |
| 62 | 44 |
| 63 | 272 |
| 64 | 131 |
| 65 | 81 |
| 66 | 50 |
| 67 | 73 |
| 68 | 15 |
| 69 | 133 |
| 70 | 288 |
| 71 | 52 |
| 72 | 23 |
| 73 | 134 |
| 74 | 76 |
| 75 | 137 |
| 76 | 82 |
| 77 | 259 |
| 78 | 56 |
| 79 | 27 |
| 80 | 97 |
| 81 | 39 |
| 82 | 261 |
| 83 | 84 |
| 84 | 138 |
| 85 | 145 |
| 86 | 29 |
| 87 | 43 |
| 88 | 320 |
| 89 | 98 |
| 90 | 88 |
| 91 | 140 |
| 92 | 30 |
| 93 | 265 |
| 94 | 146 |
| 95 | 71 |
| 96 | 161 |
| 97 | 45 |
| 98 | 262 |
| 99 | 100 |
| 100 | 51 |
| 101 | 148 |
| 102 | 46 |
| 103 | 273 |
| 104 | 75 |

TABLE Q21-continued with a sequence length of 512:

| Reliability or reliability sequence number | Polarized channel sequence number |
|---|---|
| 105 | 104 |
| 106 | 162 |
| 107 | 266 |
| 108 | 53 |
| 109 | 193 |
| 110 | 152 |
| 111 | 77 |
| 112 | 274 |
| 113 | 164 |
| 114 | 54 |
| 115 | 83 |
| 116 | 384 |
| 117 | 57 |
| 118 | 112 |
| 119 | 135 |
| 120 | 268 |
| 121 | 78 |
| 122 | 194 |
| 123 | 85 |
| 124 | 289 |
| 125 | 58 |
| 126 | 168 |
| 127 | 139 |
| 128 | 321 |
| 129 | 99 |
| 130 | 86 |
| 131 | 276 |
| 132 | 60 |
| 133 | 89 |
| 134 | 196 |
| 135 | 290 |
| 136 | 141 |
| 137 | 101 |
| 138 | 280 |
| 139 | 147 |
| 140 | 176 |
| 141 | 142 |
| 142 | 292 |
| 143 | 31 |
| 144 | 200 |
| 145 | 263 |
| 146 | 90 |
| 147 | 149 |
| 148 | 385 |
| 149 | 102 |
| 150 | 105 |
| 151 | 163 |
| 152 | 322 |
| 153 | 92 |
| 154 | 47 |
| 155 | 267 |
| 156 | 208 |
| 157 | 150 |
| 158 | 296 |
| 159 | 153 |
| 160 | 165 |
| 161 | 324 |
| 162 | 106 |
| 163 | 55 |
| 164 | 386 |
| 165 | 113 |
| 166 | 154 |
| 167 | 275 |
| 168 | 79 |
| 169 | 108 |
| 170 | 269 |
| 171 | 224 |
| 172 | 166 |
| 173 | 304 |
| 174 | 195 |
| 175 | 59 |
| 176 | 270 |
| 177 | 169 |
| 178 | 328 |
| 179 | 114 |
| 180 | 156 |
| 181 | 277 |
| 182 | 87 |
| 183 | 197 |
| 184 | 388 |
| 185 | 116 |
| 186 | 291 |
| 187 | 170 |
| 188 | 61 |
| 189 | 282 |
| 190 | 177 |
| 191 | 91 |
| 192 | 336 |
| 193 | 198 |
| 194 | 293 |
| 195 | 172 |
| 196 | 120 |
| 197 | 281 |
| 198 | 201 |
| 199 | 278 |
| 200 | 62 |
| 201 | 392 |
| 202 | 143 |
| 203 | 103 |
| 204 | 294 |
| 205 | 178 |
| 206 | 352 |
| 207 | 93 |
| 208 | 202 |
| 209 | 323 |
| 210 | 107 |
| 211 | 297 |
| 212 | 180 |
| 213 | 400 |
| 214 | 151 |
| 215 | 209 |
| 216 | 284 |
| 217 | 94 |
| 218 | 325 |
| 219 | 204 |
| 220 | 298 |
| 221 | 155 |
| 222 | 305 |
| 223 | 210 |
| 224 | 109 |
| 225 | 330 |
| 226 | 184 |
| 227 | 416 |
| 228 | 115 |
| 229 | 448 |
| 230 | 167 |
| 231 | 326 |
| 232 | 225 |
| 233 | 300 |
| 234 | 157 |
| 235 | 387 |
| 236 | 110 |
| 237 | 337 |
| 238 | 117 |
| 239 | 212 |
| 240 | 306 |
| 241 | 171 |
| 242 | 329 |
| 243 | 226 |
| 244 | 271 |
| 245 | 216 |
| 246 | 389 |
| 247 | 158 |
| 248 | 308 |
| 249 | 118 |
| 250 | 279 |
| 251 | 173 |
| 252 | 390 |
| 253 | 121 |
| 254 | 332 |

TABLE Q21-continued with a sequence length of 512:

| Reliability or reliability sequence number | Polarized channel sequence number |
|---|---|
| 255 | 199 |
| 256 | 179 |
| 257 | 228 |
| 258 | 393 |
| 259 | 174 |
| 260 | 338 |
| 261 | 122 |
| 262 | 312 |
| 263 | 203 |
| 264 | 283 |
| 265 | 63 |
| 266 | 353 |
| 267 | 181 |
| 268 | 295 |
| 269 | 232 |
| 270 | 340 |
| 271 | 394 |
| 272 | 124 |
| 273 | 401 |
| 274 | 205 |
| 275 | 285 |
| 276 | 182 |
| 277 | 299 |
| 278 | 211 |
| 279 | 354 |
| 280 | 185 |
| 281 | 344 |
| 282 | 240 |
| 283 | 396 |
| 284 | 206 |
| 285 | 286 |
| 286 | 95 |
| 287 | 402 |
| 288 | 327 |
| 289 | 213 |
| 290 | 417 |
| 291 | 186 |
| 292 | 301 |
| 293 | 227 |
| 294 | 356 |
| 295 | 111 |
| 296 | 307 |
| 297 | 404 |
| 298 | 214 |
| 299 | 302 |
| 300 | 188 |
| 301 | 331 |
| 302 | 217 |
| 303 | 360 |
| 304 | 418 |
| 305 | 229 |
| 306 | 309 |
| 307 | 159 |
| 308 | 449 |
| 309 | 408 |
| 310 | 119 |
| 311 | 333 |
| 312 | 218 |
| 313 | 420 |
| 314 | 230 |
| 315 | 310 |
| 316 | 339 |
| 317 | 233 |
| 318 | 313 |
| 319 | 368 |
| 320 | 175 |
| 321 | 391 |
| 322 | 123 |
| 323 | 334 |
| 324 | 450 |
| 325 | 220 |
| 326 | 341 |
| 327 | 183 |
| 328 | 314 |
| 329 | 424 |

TABLE Q21-continued with a sequence length of 512:

| Reliability or reliability sequence number | Polarized channel sequence number |
|---|---|
| 330 | 234 |
| 331 | 395 |
| 332 | 355 |
| 333 | 125 |
| 334 | 342 |
| 335 | 316 |
| 336 | 241 |
| 337 | 345 |
| 338 | 207 |
| 339 | 452 |
| 340 | 397 |
| 341 | 187 |
| 342 | 357 |
| 343 | 403 |
| 344 | 236 |
| 345 | 432 |
| 346 | 398 |
| 347 | 126 |
| 348 | 287 |
| 349 | 456 |
| 350 | 242 |
| 351 | 346 |
| 352 | 405 |
| 353 | 244 |
| 354 | 358 |
| 355 | 361 |
| 356 | 189 |
| 357 | 419 |
| 358 | 348 |
| 359 | 215 |
| 360 | 303 |
| 361 | 464 |
| 362 | 406 |
| 363 | 219 |
| 364 | 409 |
| 365 | 421 |
| 366 | 231 |
| 367 | 362 |
| 368 | 311 |
| 369 | 248 |
| 370 | 369 |
| 371 | 410 |
| 372 | 335 |
| 373 | 190 |
| 374 | 364 |
| 375 | 480 |
| 376 | 221 |
| 377 | 422 |
| 378 | 451 |
| 379 | 315 |
| 380 | 235 |
| 381 | 425 |
| 382 | 370 |
| 383 | 412 |
| 384 | 222 |
| 385 | 343 |
| 386 | 453 |
| 387 | 237 |
| 388 | 372 |
| 389 | 426 |
| 390 | 317 |
| 391 | 243 |
| 392 | 433 |
| 393 | 347 |
| 394 | 454 |
| 395 | 238 |
| 396 | 428 |
| 397 | 376 |
| 398 | 457 |
| 399 | 318 |
| 400 | 245 |
| 401 | 399 |
| 402 | 359 |
| 403 | 434 |
| 404 | 127 |

TABLE Q21-continued with a sequence length of 512:

| Reliability or reliability sequence number | Polarized channel sequence number |
|---|---|
| 405 | 349 |
| 406 | 458 |
| 407 | 363 |
| 408 | 191 |
| 409 | 436 |
| 410 | 407 |
| 411 | 465 |
| 412 | 350 |
| 413 | 246 |
| 414 | 460 |
| 415 | 411 |
| 416 | 466 |
| 417 | 365 |
| 418 | 249 |
| 419 | 440 |
| 420 | 371 |
| 421 | 423 |
| 422 | 481 |
| 423 | 250 |
| 424 | 413 |
| 425 | 366 |
| 426 | 373 |
| 427 | 468 |
| 428 | 427 |
| 429 | 252 |
| 430 | 482 |
| 431 | 472 |
| 432 | 414 |
| 433 | 374 |
| 434 | 223 |
| 435 | 429 |
| 436 | 377 |
| 437 | 455 |
| 438 | 435 |
| 439 | 484 |
| 440 | 430 |
| 441 | 239 |
| 442 | 378 |
| 443 | 459 |
| 444 | 319 |
| 445 | 437 |
| 446 | 488 |
| 447 | 380 |
| 448 | 251 |
| 449 | 461 |
| 450 | 438 |
| 451 | 467 |
| 452 | 441 |
| 453 | 496 |
| 454 | 462 |
| 455 | 247 |
| 456 | 351 |
| 457 | 469 |
| 458 | 442 |
| 459 | 483 |
| 460 | 367 |
| 461 | 470 |
| 462 | 444 |
| 463 | 473 |
| 464 | 253 |
| 465 | 485 |
| 466 | 415 |
| 467 | 375 |
| 468 | 474 |
| 469 | 486 |
| 470 | 489 |
| 471 | 431 |
| 472 | 379 |
| 473 | 476 |
| 474 | 254 |
| 475 | 439 |
| 476 | 490 |
| 477 | 381 |
| 478 | 497 |
| 479 | 463 |
| 480 | 443 |
| 481 | 492 |
| 482 | 382 |
| 483 | 498 |
| 484 | 500 |
| 485 | 445 |
| 486 | 471 |
| 487 | 255 |
| 488 | 475 |
| 489 | 487 |
| 490 | 504 |
| 491 | 446 |
| 492 | 477 |
| 493 | 491 |
| 494 | 478 |
| 495 | 493 |
| 496 | 499 |
| 497 | 494 |
| 498 | 501 |
| 499 | 383 |
| 500 | 447 |
| 501 | 502 |
| 502 | 505 |
| 503 | 506 |
| 504 | 508 |
| 505 | 479 |
| 506 | 495 |
| 507 | 507 |
| 508 | 503 |
| 509 | 509 |
| 510 | 510 |
| 511 | 511 |

Sequence Q22, with a sequence length of 256:
[0, 1, 2, 4, 8, 16, 32, 3, 5, 64, 9, 6, 17, 10, 18, 128, 12, 33, 65, 20, 34, 24, 36, 7, 129, 66, 11, 40, 68, 130, 19, 13, 48, 14, 72, 21, 132, 35, 26, 80, 37, 25, 22, 136, 38, 96, 67, 41, 144, 28, 69, 42, 49, 74, 160, 192, 70, 44, 131, 81, 50, 73, 15, 133, 52, 23, 134, 76, 137, 82, 56, 27, 97, 39, 84, 138, 145, 2 9, 43, 98, 88, 140, 30, 146, 71, 161, 45, 100, 51, 148, 46, 75, 104, 162, 53, 193, 152, 77, 164, 54, 83, 57, 112, 135, 78, 194, 85, 58, 168, 13999, 86, 60, 89, 196, 141, 10112, 147, 176, 142, 31, 200, 90, 14 9, 102, 105, 163, 92, 47, 208, 150, 153, 165, 106, 55, 113, 154, 79, 108, 224, 166, 195, 59, 169, 11 4, 156, 87, 197, 116, 170, 61, 177, 91, 198, 172, 120, 201, 62, 143, 103, 178, 93, 202, 107, 180, 15 1, 209, 94, 204, 155, 210, 109, 184, 115, 167, 225, 157, 110, 117, 212, 171, 226, 216, 158, 118, 17 3, 121, 199, 179, 228, 174, 122, 203, 63, 181, 232, 124, 205, 182, 211, 185, 240, 206, 95, 213, 186, 227, 111, 214, 188, 217, 229, 159, 119, 218, 230, 233, 175, 123, 220, 183, 234, 125, 241, 207, 18 7, 236, 126, 242, 244, 189, 215, 219, 231, 248, 190, 221, 235, 222, 237, 243, 238, 245, 127, 191, 2 46, 249, 250, 252, 223, 239, 251, 247, 253, 254, 255]

TABLE Q22 with a sequence length of 256:

| Reliability or reliability sequence number | Polarized channel sequence number |
|---|---|
| 0 | 0 |
| 1 | 1 |
| 2 | 2 |
| 3 | 4 |
| 4 | 8 |

TABLE Q22-continued

| with a sequence length of 256: | |
|---|---|
| Reliability or reliability sequence number | Polarized channel sequence number |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 34 |
| 21 | 24 |
| 22 | 36 |
| 23 | 7 |
| 24 | 129 |
| 25 | 66 |
| 26 | 11 |
| 27 | 40 |
| 28 | 68 |
| 29 | 130 |
| 30 | 19 |
| 31 | 13 |
| 32 | 48 |
| 33 | 14 |
| 34 | 72 |
| 35 | 21 |
| 36 | 132 |
| 37 | 35 |
| 38 | 26 |
| 39 | 80 |
| 40 | 37 |
| 41 | 25 |
| 42 | 22 |
| 43 | 136 |
| 44 | 38 |
| 45 | 96 |
| 46 | 67 |
| 47 | 41 |
| 48 | 144 |
| 49 | 28 |
| 50 | 69 |
| 51 | 42 |
| 52 | 49 |
| 53 | 74 |
| 54 | 160 |
| 55 | 192 |
| 56 | 70 |
| 57 | 44 |
| 58 | 131 |
| 59 | 81 |
| 60 | 50 |
| 61 | 73 |
| 62 | 15 |
| 63 | 133 |
| 64 | 52 |
| 65 | 23 |
| 66 | 134 |
| 67 | 76 |
| 68 | 137 |
| 69 | 82 |
| 70 | 56 |
| 71 | 27 |
| 72 | 97 |
| 73 | 39 |
| 74 | 84 |
| 75 | 138 |
| 76 | 145 |
| 77 | 29 |
| 78 | 43 |
| 79 | 98 |

TABLE Q22-continued

| with a sequence length of 256: | |
|---|---|
| Reliability or reliability sequence number | Polarized channel sequence number |
| 80 | 88 |
| 81 | 140 |
| 82 | 30 |
| 83 | 146 |
| 84 | 71 |
| 85 | 161 |
| 86 | 45 |
| 87 | 100 |
| 88 | 51 |
| 89 | 148 |
| 90 | 46 |
| 91 | 75 |
| 92 | 104 |
| 93 | 162 |
| 94 | 53 |
| 95 | 193 |
| 96 | 152 |
| 97 | 77 |
| 98 | 164 |
| 99 | 54 |
| 100 | 83 |
| 101 | 57 |
| 102 | 112 |
| 103 | 135 |
| 104 | 78 |
| 105 | 194 |
| 106 | 85 |
| 107 | 58 |
| 108 | 168 |
| 109 | 139 |
| 110 | 99 |
| 111 | 86 |
| 112 | 60 |
| 113 | 89 |
| 114 | 196 |
| 115 | 141 |
| 116 | 101 |
| 117 | 147 |
| 118 | 176 |
| 119 | 142 |
| 120 | 31 |
| 121 | 200 |
| 122 | 90 |
| 123 | 149 |
| 124 | 102 |
| 125 | 105 |
| 126 | 163 |
| 127 | 92 |
| 128 | 47 |
| 129 | 208 |
| 130 | 150 |
| 131 | 153 |
| 132 | 165 |
| 133 | 106 |
| 134 | 55 |
| 135 | 113 |
| 136 | 154 |
| 137 | 79 |
| 138 | 108 |
| 139 | 224 |
| 140 | 166 |
| 141 | 195 |
| 142 | 59 |
| 143 | 169 |
| 144 | 114 |
| 145 | 156 |
| 146 | 87 |
| 147 | 197 |
| 148 | 116 |
| 149 | 170 |
| 150 | 61 |
| 151 | 177 |
| 152 | 91 |
| 153 | 198 |
| 154 | 172 |

TABLE Q22-continued

| with a sequence length of 256: | |
|---|---|
| Reliability or reliability sequence number | Polarized channel sequence number |
| 155 | 120 |
| 156 | 201 |
| 157 | 62 |
| 158 | 143 |
| 159 | 103 |
| 160 | 178 |
| 161 | 93 |
| 162 | 202 |
| 163 | 107 |
| 164 | 180 |
| 165 | 151 |
| 166 | 209 |
| 167 | 94 |
| 168 | 204 |
| 169 | 155 |
| 170 | 210 |
| 171 | 109 |
| 172 | 184 |
| 173 | 115 |
| 174 | 167 |
| 175 | 225 |
| 176 | 157 |
| 177 | 110 |
| 178 | 117 |
| 179 | 212 |
| 180 | 171 |
| 181 | 226 |
| 182 | 216 |
| 183 | 158 |
| 184 | 118 |
| 185 | 173 |
| 186 | 121 |
| 187 | 199 |
| 188 | 179 |
| 189 | 228 |
| 190 | 174 |
| 191 | 122 |
| 192 | 203 |
| 193 | 63 |
| 194 | 181 |
| 195 | 232 |
| 196 | 124 |
| 197 | 205 |
| 198 | 182 |
| 199 | 211 |
| 200 | 185 |
| 201 | 240 |
| 202 | 206 |
| 203 | 95 |
| 204 | 213 |
| 205 | 186 |
| 206 | 227 |
| 207 | 111 |
| 208 | 214 |
| 209 | 188 |
| 210 | 217 |
| 211 | 229 |
| 212 | 159 |
| 213 | 119 |
| 214 | 218 |
| 215 | 230 |
| 216 | 233 |
| 217 | 175 |
| 218 | 123 |
| 219 | 220 |
| 220 | 183 |
| 221 | 234 |
| 222 | 125 |
| 223 | 241 |
| 224 | 207 |
| 225 | 187 |
| 226 | 236 |
| 227 | 126 |
| 228 | 242 |
| 229 | 244 |
| 230 | 189 |
| 231 | 215 |
| 232 | 219 |
| 233 | 231 |
| 234 | 248 |
| 235 | 190 |
| 236 | 221 |
| 237 | 235 |
| 238 | 222 |
| 239 | 237 |
| 240 | 243 |
| 241 | 238 |
| 242 | 245 |
| 243 | 127 |
| 244 | 191 |
| 245 | 246 |
| 246 | 249 |
| 247 | 250 |
| 248 | 252 |
| 249 | 223 |
| 250 | 239 |
| 251 | 251 |
| 252 | 247 |
| 253 | 253 |
| 254 | 254 |
| 255 | 255 |

Sequence Q23, with a sequence length of 128:

0, 1, 2, 4, 8, 16, 32, 3, 5, 64, 9, 6, 17, 10, 18, 12, 33, 65, 20, 34, 24, 36, 7, 66, 11, 40, 68, 19, 13, 48, 14, 72, 21, 35, 26, 80, 37, 25, 22, 38, 96, 67, 41, 28, 69, 42, 49, 74, 70, 44, 81, 50, 73, 15, 52, 2 3, 76, 82, 56, 27, 97, 39, 84, 29, 43, 98, 88, 30, 71, 45, 100, 51, 46, 75, 104, 53, 77, 54, 83, 57, 112, 78, 85, 58, 99, 86, 60, 89, 101, 31, 90, 102, 105, 92, 47, 106, 55, 113, 79, 108, 59, 114, 87, 116, 61, 91, 120, 62, 103, 93, 107, 94, 109, 115, 110, 117, 118, 121, 122, 63, 124, 95, 111, 119, 123, 125, 126, 1 27

TABLE Q23

| with a sequence length of 128: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 12 |
| 16 | 33 |
| 17 | 65 |
| 18 | 20 |
| 19 | 34 |
| 20 | 24 |
| 21 | 36 |
| 22 | 7 |
| 23 | 66 |
| 24 | 11 |

TABLE Q23-continued

| with a sequence length of 128: | |
|---|---|
| Reliability or reliability sequence number | Polarized channel sequence number |
| 25 | 40 |
| 26 | 68 |
| 27 | 19 |
| 28 | 13 |
| 29 | 48 |
| 30 | 14 |
| 31 | 72 |
| 32 | 21 |
| 33 | 35 |
| 34 | 26 |
| 35 | 80 |
| 36 | 37 |
| 37 | 25 |
| 38 | 22 |
| 39 | 38 |
| 40 | 96 |
| 41 | 67 |
| 42 | 41 |
| 43 | 28 |
| 44 | 69 |
| 45 | 42 |
| 46 | 49 |
| 47 | 74 |
| 48 | 70 |
| 49 | 44 |
| 50 | 81 |
| 51 | 50 |
| 52 | 73 |
| 53 | 15 |
| 54 | 52 |
| 55 | 23 |
| 56 | 76 |
| 57 | 82 |
| 58 | 56 |
| 59 | 27 |
| 60 | 97 |
| 61 | 39 |
| 62 | 84 |
| 63 | 29 |
| 64 | 43 |
| 65 | 98 |
| 66 | 88 |
| 67 | 30 |
| 68 | 71 |
| 69 | 45 |
| 70 | 100 |
| 71 | 51 |
| 72 | 46 |
| 73 | 75 |
| 74 | 104 |
| 75 | 53 |
| 76 | 77 |
| 77 | 54 |
| 78 | 83 |
| 79 | 57 |
| 80 | 112 |
| 81 | 78 |
| 82 | 85 |
| 83 | 58 |
| 84 | 99 |
| 85 | 86 |
| 86 | 60 |
| 87 | 89 |
| 88 | 101 |
| 89 | 31 |
| 90 | 90 |
| 91 | 102 |
| 92 | 105 |
| 93 | 92 |
| 94 | 47 |
| 95 | 106 |
| 96 | 55 |
| 97 | 113 |
| 98 | 79 |
| 99 | 108 |
| 100 | 59 |
| 101 | 114 |
| 102 | 87 |
| 103 | 116 |
| 104 | 61 |
| 105 | 91 |
| 106 | 120 |
| 107 | 62 |
| 108 | 103 |
| 109 | 93 |
| 110 | 107 |
| 111 | 94 |
| 112 | 109 |
| 113 | 115 |
| 114 | 110 |
| 115 | 117 |
| 116 | 118 |
| 117 | 121 |
| 118 | 122 |
| 119 | 63 |
| 120 | 124 |
| 121 | 95 |
| 122 | 111 |
| 123 | 119 |
| 124 | 123 |
| 125 | 125 |
| 126 | 126 |
| 127 | 127 |

Sequence Q24, with a sequence length of 64:
0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 5 8, 60, 31, 47, 55, 59, 61, 62, 63

TABLE Q24

| with a sequence length of 64: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 9 |
| 10 | 6 |
| 11 | 17 |
| 12 | 10 |
| 13 | 18 |
| 14 | 12 |
| 15 | 33 |
| 16 | 20 |
| 17 | 34 |
| 18 | 24 |
| 19 | 36 |
| 20 | 7 |
| 21 | 11 |
| 22 | 40 |
| 23 | 19 |
| 24 | 13 |
| 25 | 48 |
| 26 | 14 |
| 27 | 21 |
| 28 | 35 |

TABLE Q24-continued

| with a sequence length of 64: | |
|---|---|
| Reliability or reliability sequence number | Polarized channel sequence number |
| 29 | 26 |
| 30 | 37 |
| 31 | 25 |
| 32 | 22 |
| 33 | 38 |
| 34 | 41 |
| 35 | 28 |
| 36 | 42 |
| 37 | 49 |
| 38 | 44 |
| 39 | 50 |
| 40 | 15 |
| 41 | 52 |
| 42 | 23 |
| 43 | 56 |
| 44 | 27 |
| 45 | 39 |
| 46 | 29 |
| 47 | 43 |
| 48 | 30 |
| 49 | 45 |
| 50 | 51 |
| 51 | 46 |
| 52 | 53 |
| 53 | 54 |
| 54 | 57 |
| 55 | 58 |
| 56 | 60 |
| 57 | 31 |
| 58 | 47 |
| 59 | 55 |
| 60 | 59 |
| 61 | 61 |
| 62 | 62 |
| 63 | 63 |

Sequence Z17, with a sequence length of 8192:

[0, 1, 2, 7, 3, 13, 16, 29, 4, 15, 18, 32, 21, 38, 40, 79, 5, 17, 19, 37, 24, 44, 52, 85, 26, 51, 4 8, 94, 62, 102, 111, 180, 6, 22, 25, 46, 27, 50, 57, 97, 33, 60, 64, 103, 73, 117, 123, 198, 39, 66, 77, 1 20, 84, 131, 140, 212, 92, 144, 155, 230, 165, 251, 272, 400, 14, 23, 31, 59, 34, 63, 72, 114, 42, 78, 67, 126, 87, 136, 148, 219, 49, 76, 90, 141, 99, 153, 163, 242, 109, 166, 186, 257, 195, 284, 304, 4 49, 58, 95, 107, 161, 119, 172, 191, 277, 127, 192, 211, 289, 220, 316, 339, 469, 145, 214, 238, 32 3, 247, 343, 365, 510, 266, 373, 391, 543, 416, 577, 622, 847, 20, 30, 36, 75, 45, 80, 86, 146, 54, 89, 100, 157, 110, 170, 178, 275, 61, 101, 113, 175, 122, 187, 201, 298, 134, 204, 215, 309, 239, 335, 362, 502, 69, 115, 129, 193, 139, 206, 225, 328, 156, 232, 249, 349, 263, 369, 387, 538, 177, 255, 282, 381, 293, 404, 425, 558, 320, 434, 461, 602, 483, 654, 716, 867, 71, 133, 150, 229, 168, 243, 260, 377, 181, 268, 286, 395, 306, 421, 443, 592, 200, 299, 313, 430, 344, 456, 478, 663, 357, 48 9, 516, 677, 552, 726, 757, 1019, 224, 330, 353, 466, 382, 495, 520, 689, 408, 531, 567, 742, 611, 769, 805, 1067, 439, 587, 631, 785, 643, 826, 893, 1181, 702, 920, 947, 1121, 985, 1273, 1390, 1 599, 8, 28, 43, 91, 56, 98, 118, 183, 65, 112, 130, 199, 147, 223, 231, 355, 74, 124, 138, 218, 164, 2 40, 271, 368, 173, 267, 254, 396, 300, 422, 445, 626, 82, 154, 169, 248, 179, 261, 279, 406, 203, 2 92, 308, 426, 334, 463, 480, 667, 227, 312, 347, 474, 363, 500, 523, 697, 394, 532, 562, 737, 582, 781, 822, 1089, 104, 159, 194, 288, 208, 305, 329, 452, 236, 351, 319, 486, 376, 511, 547, 713, 2 59, 341, 389, 527, 409, 556, 579, 761, 436, 588, 635, 797, 662, 851, 889, 1190, 283, 402, 432, 57 4, 468, 603, 645, 837, 491, 649, 694, 862, 720, 914, 960, 1231, 535, 705, 750, 931, 773, 967, 101 1, 1309, 814, 1033, 1075, 1365, 1112, 1507, 1921, 142, 188, 213, 337, 245, 358, 372, 541, 273, 385, 413, 571, 440, 599, 617, 832, 295, 417, 451, 608, 477, 638, 674, 877, 507, 682, 708, 90 5, 754, 955, 1004, 1294, 321, 457, 494, 657, 518, 686, 728, 938, 564, 745, 778, 977, 809, 1023, 1 060, 1355, 615, 792, 842, 1046, 873, 1098, 1138, 1405, 925, 1156, 1211, 1474, 1249, 1561, 168 5, 1958, 325, 504, 548, 733, 595, 764, 801, 1037, 627, 818, 857, 1081, 897, 1129, 1172, 1459, 67 0, 881, 909, 1147, 972, 1203, 1241, 1577, 997, 1260, 1319, 1616, 1376, 1705, 1759, 2227, 725, 943, 990, 1222, 1053, 1284, 1329, 1638, 1107, 1344, 1420, 1736, 1492, 1788, 1851, 2306, 116 5, 1445, 1522, 1818, 1543, 1880, 2004, 2503, 1663, 2052, 2102, 2392, 2160, 2640, 2834, 3174, 9, 35, 55, 116, 70, 135, 160, 246, 83, 151, 176, 264, 197, 291, 301, 454, 96, 167, 182, 285, 217, 31 7, 352, 471, 228, 345, 331, 501, 388, 528, 553, 760, 106, 202, 222, 327, 233, 342, 364, 508, 269, 3 78, 397, 533, 427, 572, 593, 804, 297, 407, 446, 585, 467, 616, 641, 841, 496, 652, 684, 890, 712, 945, 996, 1292, 143, 209, 258, 375, 274, 392, 423, 566, 307, 450, 412, 601, 479, 630, 668, 861, 3 36, 442, 488, 644, 517, 676, 703, 921, 545, 715, 772, 957, 799, 1027, 1070, 1394, 371, 505, 542, 699, 581, 734, 784, 1008, 606, 789, 836, 1041, 865, 1101, 1154, 1437, 655, 849, 907, 1117, 932, 1163, 1215, 1514, 981, 1235, 1270, 1582, 1326, 1644, 1725, 2138, 190, 252, 281, 437, 322, 460, 475, 658, 356, 484, 521, 690, 551, 731, 751, 1006, 383, 526, 563, 743, 589, 775, 816, 1056, 624, 825, 853, 1088, 912, 1143, 1206, 1499, 414, 569, 610, 790, 636, 830, 878, 1128, 687, 900, 940, 1178, 975, 1224, 1264, 1568, 746, 952, 1015, 1248, 1048, 1301, 1347, 1609, 1110, 1363, 1416, 1 689, 1463, 1781, 1898, 2177, 420, 621, 672, 885, 719, 924, 966, 1245, 763, 989, 1029, 1281, 10 78, 1336, 1383, 1671, 813, 1062, 1095, 1358, 1168, 1409, 1452, 1802, 1197, 1471, 1528, 1828, 1595, 1917, 1977, 2442, 874, 1136, 1186, 1426, 1253, 1488, 1535, 1847, 1312, 1552, 1626, 19 46, 1711, 1996, 2064, 2524, 1372, 1657, 1745, 2030, 1765, 2109, 2219, 2704, 1869, 2269, 232 3, 2604, 2381, 2848, 3027, 3359, 125, 241, 311, 492, 361, 513, 578, 767, 403, 557, 613, 808, 664, 869, 895, 1193, 433, 597, 634, 858, 707, 916, 992, 1218, 738, 982, 951, 1288, 1064, 1340, 1387, 1729, 462, 680, 724, 936, 755, 970, 1014, 1305, 820, 1042, 1084, 1351, 1142, 1424, 1456, 180 7, 884, 1092, 1175, 1441, 1210, 1495, 1539, 1862, 1277, 1557, 1613, 1940, 1653, 2026, 2094, 2557, 536, 695, 796, 1034, 834, 1074, 1133, 1401, 901, 1185, 1103, 1467, 1239, 1518, 1586, 189 2, 962, 1160, 1267, 1547, 1316, 1605, 1648, 1984, 1368, 1667, 1750, 2045, 1795, 2145, 2210, 2 718, 1022, 1298, 1361, 1634, 1433, 1696, 1769, 2124, 1481, 1776, 1857, 2169, 1902, 2262, 23 43, 2774, 1564, 1876, 1965, 2286, 2011, 2352, 2433, 2897, 2079, 2459, 2536, 2985, 2592, 308 5, 3225, 3832, 648, 780, 845, 1150, 928, 1199, 1228, 1573, 1000, 1257, 1322, 1630, 1379, 1681, 1719, 2117, 1051, 1333, 1398, 1699, 1448, 1755, 1824, 2195, 1510, 1835, 1886, 2243, 1973, 2 332, 2421, 2883, 1115, 1412, 1484, 1791, 1532, 1840, 1928, 2295, 1620, 1954, 2018, 2372, 20 72, 2453, 2512, 2971, 1715, 2038, 2130, 2480, 2187, 2568, 2628, 3047, 2278, 2666, 2747, 314 9, 2803, 3300, 3484, 3888, 1124, 1503, 1591, 1936, 1678, 1992, 2060, 2471, 1739, 2087, 2153, 2548, 2234, 2616, 2692, 3129, 1814, 2203, 2251, 2654, 2364, 2730, 2787, 3331, 2413, 2817, 2 915, 3387, 3005, 3524, 3596, 4244, 1910, 2315, 2401, 2760, 2491, 2866, 2934, 3420, 2580, 29 52, 3065, 3560, 3199, 3639, 3730, 4347, 2678, 3109, 3247, 3683, 3272, 3776, 3946, 4599, 345 4, 4014, 4085, 4458, 4162, 4770, 5021, 5420, 10, 41, 68, 149, 88, 184, 216, 324, 105, 207, 235, 3 46, 262, 386, 398, 591, 121, 226, 244, 379, 287, 418, 459, 614, 302, 453, 435, 647, 509, 683, 714, 953, 137, 270, 294, 431, 310, 448, 482, 660, 354, 497, 519, 688, 559, 739, 762, 1005, 393, 529, 5 80, 752, 609, 791, 819, 1047, 642, 835, 870, 1102, 904, 1159, 1216, 1546, 196, 280, 340, 493, 36 0, 514, 555, 727, 405, 586, 534, 774, 623, 807, 852, 1069, 441, 575, 632, 824, 669, 864, 894, 113 4, 706, 906, 968, 1173, 999, 1247, 1296, 1661, 487, 651, 700, 891, 748, 926, 984, 1230, 779, 986, 1043, 1261, 1071, 1328, 1392, 1712, 840, 1055, 1120, 1349, 1148, 1403, 1462, 1805, 1198, 14 78, 1524, 1878, 1585, 1949, 2047, 2489, 253, 332, 374, 570, 424, 594, 620, 843, 465, 628, 675, 8 80, 709, 922, 946, 1227, 503, 678, 722, 934, 756, 971, 1018, 1282, 798, 1028, 1057, 1313, 1123, 1382, 1451, 1785, 540, 732, 783, 991, 815, 1032, 1085, 1360, 875, 1108, 1155, 1417, 1191, 146 9, 1513, 1866, 941, 1169, 1240, 1498, 1272, 1556, 1606, 1912, 1339, 1628, 1692, 2005, 1742, 2 112, 2240, 2527, 550, 793, 854, 1097, 915, 1137, 1182, 1490, 956, 1205, 1255, 1534, 1304, 159 6, 1651, 1982, 1013, 1286, 1324, 1619, 1406, 1679, 1732, 2133, 1440, 1756, 1815, 2163, 1896, 2260, 2321, 2783, 1083, 1371, 1428, 1702, 1502, 1772, 1827, 2184, 1567, 1848, 1930, 2289, 2 023, 2346, 2416, 2863, 1641, 1970, 2067, 2378, 2090, 2455, 2571, 3042, 2208, 2613, 2663, 29 48, 2727, 3188, 3367, 3678, 162, 318, 411, 637, 476, 665, 744, 964, 525, 718, 787, 1010, 848, 10 80, 1105, 1432, 565, 766, 810, 1066, 899, 1125, 1213, 1466, 930, 1201, 1167, 1538, 1289, 1600, 1655, 2054, 600, 868, 917, 1151, 949, 1188, 1233, 1559, 1025, 1269, 1310, 1610, 1378, 1698, 1738, 2141, 1090, 1321, 1414, 1721, 1454, 1778, 1833, 2201, 1530, 1853, 1914, 2281, 1964, 2 369, 2448, 2900, 693, 883, 994, 1259, 1036, 1300, 1367, 1674, 1116, 1421, 1335, 1749, 1487, 1 809, 1885, 2233, 1180, 1395, 1520, 1841, 1571, 1905, 1956, 2329, 1633, 1974, 2075, 2398, 21 27, 2497, 2562, 3058, 1243, 1549, 1623, 1945, 1708, 2008, 2097, 2474, 1762, 2105, 2192, 251 8, 2248, 2607, 2686, 3121, 1860, 2216, 2303, 2634, 2355, 2698, 2770, 3238, 2430, 2808, 2877, 3326, 2937, 3429, 3543, 4133, 828, 976, 1050, 1388, 1141, 1443, 1477, 1870, 1219, 1509, 157 8, 1937, 1643, 1999, 2039, 2462, 1276, 1588, 1669, 2016, 1728, 2082, 2156, 2542, 1798, 2171, 2224, 2589, 2312, 2675, 2757, 3216, 1341, 1684, 1768, 2120, 1822, 2180, 2265, 2648, 1924, 2 298, 2361, 2713, 2424, 2794, 2852, 3309, 2033, 2389, 2483, 2828, 2533, 2912, 2977, 3392, 26 25, 3008, 3093, 3498, 3154, 3624, 3807, 4184, 1352, 1789, 1889, 2272, 1989, 2338, 2407, 281 4, 2057, 2439, 2506, 2886, 2577, 2963, 3031, 3473, 2148, 2551, 2598, 2993, 2707, 3078, 3138, 3650, 2750, 3166, 3255, 3706, 3345, 3838, 3914, 4512, 2257, 2657, 2736, 3104, 2842, 3205, 3 269, 3742, 2926, 3291, 3410, 3875, 3518, 3954, 4042, 4610, 3019, 3448, 3571, 3994, 3602, 40 79, 4236, 4840, 3770, 4298, 4364, 4701, 4431, 4992, 5218, 5595, 174, 366, 470, 736, 544, 802, 886, 1146, 605, 859, 937, 1194, 1001, 1265, 1293, 1675, 656, 910, 961, 1252, 1061, 1332, 1425, 1716, 1094, 1410, 1374, 1782, 1517, 1844, 1901, 2326, 696, 1020, 1076, 1356, 1111, 1399, 14 58, 1801, 1207, 1494, 1542, 1856, 1614, 1942, 1987, 2410, 1279, 1563, 1658, 1968, 1706, 203 5, 2084, 2477, 1775, 2106, 2174, 2565, 2230, 2660, 2744, 3213, 831, 1039, 1176, 1483, 1223, 1 527, 1602, 1926, 1307, 1665, 1575, 2001, 1733, 2062, 2142, 2515, 1384, 1647, 1752, 2091, 18 20, 2159, 2213, 2619, 1882, 2237, 2349, 2681, 2404, 2797, 2869, 3373, 1473, 1794, 1873, 220 5, 1961, 2275, 2375, 2767, 2014, 2384, 2468, 2820, 2521, 2920, 3000, 3440, 2115, 2494, 2595, 2945, 2637, 3016, 3098, 3554, 2721, 3126, 3183, 3655, 3264, 3747, 3863, 4406, 979, 1161, 12 36, 1637, 1345, 1688, 1723, 2123, 1436, 1746, 1831, 2189, 1894, 2268, 2309, 2763, 1505, 183 7, 1918, 2292, 1980, 2358, 2436, 2845, 2050, 2450, 2500, 2894, 2601, 2988, 3081, 3534, 1581, 1933, 2020, 2387, 2078, 2456, 2545, 2960, 2181, 2583, 2651, 3039, 2710, 3113, 3171, 3635, 2 301, 2672, 2780, 3146, 2831, 3230, 3295, 3695, 2931, 3322, 3406, 3812, 3479, 3940, 4105, 44 50, 1592, 2042, 2151, 2559, 2245, 2622, 2695, 3141, 2335, 2733, 2800, 3196, 2880, 3281, 335 4, 3789, 2427, 2855, 2908, 3314, 3023, 3395, 3463, 3974, 3070, 3493, 3574, 4008, 3672, 4127, 4206, 4758, 2539, 2974, 3053, 3424, 3158, 3513, 3585, 4036, 3242, 3613, 3719, 4168, 3843, 4 228, 4315, 4864, 3340, 3765, 3894, 4274, 3920, 4372, 4503, 5079, 4065, 4559, 4630, 4952, 46 92, 5234, 5440, 5776, 770, 1130, 1317, 1763, 1447, 1811, 1952, 2341, 1553, 1908, 2027, 2418, 2135, 2530, 2574, 3062, 1624, 1995, 2069, 2509, 2222, 2610, 2740, 3101, 2284, 2724, 2669, 3 208, 2859, 3286, 3364, 3869, 1694, 2166, 2254, 2645, 2318, 2701, 2777, 3233, 2445, 2823, 28 91, 3303, 2982, 3415, 3468, 3980, 2554, 2905, 3034, 3443, 3090, 3529, 3591, 4056, 3191, 361 8, 3700, 4154, 3759, 4266, 4356, 4902, 1864, 2198, 2395, 2811, 2465, 2872, 2966, 3381, 2586, 3050, 2923, 3488, 3133, 3565, 3661, 4097, 2689, 3011, 3179, 3607, 3250, 3689, 3753, 4214, 3 336, 3782, 3900, 4290, 3967, 4414, 4494, 5091, 2791, 3221, 3317, 3736, 3434, 3818, 3926, 43 89, 3504, 3934, 4050, 4439, 4111, 4551, 4650, 5153, 3629, 4071, 4192, 4579, 4252, 4661, 474 7, 5288, 4331, 4791, 4875, 5378, 4940, 5504, 5644, 6216, 2099, 2366, 2486, 2997, 2631, 3073, 3118, 3644, 2753, 3163, 3261, 3725, 3350, 3801, 3857, 4381, 2837, 3278, 3378, 3826, 3459, 3 908, 4000, 4475, 3549, 4022, 4093, 4531, 4198, 4639, 4736, 5269, 2940, 3401, 3507, 3960, 35 80, 4028, 4140, 4590, 3711, 4176, 4258, 4681, 4323, 4779, 4852, 5362, 3849, 4282, 4397, 481 4, 4467, 4914, 4979, 5460, 4570, 5034, 5122, 5571, 5184, 5721, 5901, 6268, 2956, 3538, 3667, 4146, 3795, 4222, 4306, 4802, 3880, 4339, 4422, 4887, 4522, 4965, 5064, 5547, 3988, 4486, 4 540, 5006, 4670, 5107, 5169, 5750, 4724, 5202, 5304, 5808, 5398, 5935, 6005, 6579, 4119, 46 19, 4713, 5137, 4826, 5253, 5323, 5837, 4926, 5342, 5480, 5970, 5619, 6044, 6125, 6660, 504 9, 5524, 5668, 6084, 5693, 6170, 6320, 6866, 5867, 6374, 6438, 6752, 6505, 6995, 7168, 7433, 11, 47, 81, 189, 108, 250, 290, 428, 132, 278, 314, 455, 348, 506, 522, 771, 152, 303, 326, 498, 38 0, 554, 604, 800, 401, 598, 576, 844, 666, 888, 929, 1221, 171, 359, 390, 568, 410, 590, 633, 860, 464, 653, 679, 892, 735, 959, 988, 1287, 515, 692, 759, 974, 794, 1021, 1058, 1334, 839, 1077, 1 122, 1400, 1162, 1468, 1537, 1904, 265, 370, 447, 646, 473, 673, 729, 944, 539, 765, 698, 1003, 811, 1040, 1096, 1362, 583, 753, 827, 1063, 872, 1114, 1153, 1438, 918, 1166, 1242, 1485, 127 5, 1572, 1632, 2028, 639, 850, 913, 1144, 969, 1187, 1258, 1551, 1007, 1263, 1330, 1590, 1366, 1666, 1734, 2080, 1082, 1343, 1422, 1690, 1457, 1747, 1810, 2178, 1515, 1829, 1877, 2255, 1 944, 2331, 2431, 2913, 338, 438, 490, 747, 560, 776, 806, 1087, 612, 823, 876, 1131, 923, 1184, 1212, 1548, 659, 882, 939, 1200, 983, 1246, 1299, 1615, 1030, 1311, 1346, 1649, 1427, 1724, 1 799, 2157, 710, 948, 1012, 1266, 1054, 1315, 1380, 1703, 1127, 1407, 1464, 1764, 1508, 1819, 1868, 2244, 1209, 1482, 1566, 1852, 1601, 1913, 1969, 2291, 1680, 1991, 2058, 2388, 2113, 2 505, 2643, 2953, 723, 1026, 1104, 1396, 1174, 1442, 1497, 1843, 1225, 1523, 1580, 1890, 163 9, 1957, 2015, 2365, 1295, 1618, 1662, 1978, 1751, 2046, 2101, 2525, 1786, 2128, 2191, 2558, 2277, 2665, 2732, 3240, 1377, 1710, 1773, 2071, 1855, 2144, 2202, 2585, 1925, 2226, 2311, 2 697, 2408, 2755, 2830, 3327, 2003, 2353, 2452, 2789, 2481, 2874, 3003, 3525, 2612, 3055, 31 08, 3422, 3178, 3680, 3865, 4172, 205, 419, 546, 833, 625, 866, 963, 1234, 685, 933, 1017, 129 0, 1091, 1373, 1404, 1780, 741, 993, 1049, 1357, 1157, 1431, 1533, 1816, 1192, 1519, 1479, 18 93, 1621, 1960, 2019, 2440, 782, 1118, 1179, 1461, 1217, 1500, 1554, 1919, 1306, 1597, 1646, 1972, 1720, 2065, 2108, 2534, 1389, 1660, 1760, 2088, 1803, 2152, 2209, 2603, 1888, 2229, 2 296, 2687, 2345, 2781, 2864, 3366, 898, 1135, 1271, 1587, 1323, 1635, 1707, 2037, 1419, 176 7, 1676, 2119, 1839, 2182, 2264, 2636, 1493, 1741, 1874, 2217, 1929, 2285, 2336, 2738, 1997, 2356, 2464, 2812, 2522, 2921, 2995, 3540, 1569, 1906, 1985, 2325, 2076, 2391, 2487, 2896, 2 131, 2496, 2594, 2943, 2653, 3044, 3131, 3609, 2238, 2618, 2715, 3076, 2764, 3144, 3227, 37 34, 2847, 3266, 3341, 3824, 3408, 3928, 4044, 4588, 1068, 1251, 1338, 1730, 1449, 1790, 182 6, 2250, 1541, 1861, 1938, 2319, 2007, 2379, 2423, 2885, 1607, 1948, 2034, 2400, 2098, 2472, 2549, 2972, 2170, 2567, 2627, 3026, 2723, 3123, 3211, 3713, 1683, 2049, 2139, 2514, 2196, 2 576, 2671, 3091, 2302, 2706, 2772, 3164, 2839, 3249, 3312, 3809, 2417, 2805, 2904, 3288, 29 64, 3383, 3452, 3886, 3067, 3482, 3576, 3996, 3641, 4121, 4288, 4634, 1697, 2164, 2267, 268 0, 2374, 2746, 2822, 3274, 2443, 2856, 2932, 3352, 3013, 3436, 3509, 3972, 2543, 2980, 3036, 3466, 3156, 3562, 3626, 4142, 3201, 3657, 3751, 4196, 3841, 4312, 4385, 4945, 2662, 3099, 3 186, 3593, 3302, 3696, 3768, 4226, 3397, 3791, 3910, 4354, 4020, 4420, 4501, 5031, 3497, 39 50, 4067, 4460, 4096, 4538, 4688, 5245, 4260, 4745, 4805, 5125, 4871, 5392, 5589, 5915, 221, 481, 619, 954, 717, 1035, 1140, 1453, 788, 1109, 1204, 1512, 1283, 1593, 1625, 2043, 856, 117 0, 1229, 1576, 1354, 1670, 1771, 2086, 1393, 1754, 1714, 2155, 1872, 2220, 2279, 2735, 908, 1 302, 1369, 1701, 1411, 1743, 1806, 2173, 1525, 1845, 1897, 2231, 1976, 2322, 2368, 2826, 16 11, 1922, 2022, 2348, 2073, 2420, 2475, 2902, 2146, 2502, 2573, 2998, 2633, 3103, 3198, 370 8, 1073, 1327, 1489, 1836, 1544, 1881, 1962, 2308, 1642, 2031, 1934, 2385, 2104, 2449, 2537, 2942, 1727, 2012, 2126, 2484, 2194, 2555, 2615, 3057, 2261, 2642, 2761, 3128, 2819, 3254, 3 333, 3871, 1823, 2167, 2253, 2606, 2342, 2683, 2786, 3220, 2397, 2795, 2893, 3279, 2950, 33 85, 3477, 3938, 2508, 2918, 3032, 3417, 3080, 3495, 3582, 4054, 3169, 3615, 3674, 4150, 376 3, 4234, 4341, 4845, 1254, 1472, 1562, 2000, 1687, 2056, 2093, 2517, 1784, 2116, 2206, 2588, 2274, 2674, 2717, 3218, 1858, 2215, 2299, 2700, 2359, 2769, 2853, 3307, 2437, 2870, 2928, 3 362, 3040, 3461, 3567, 4032, 1941, 2313, 2405, 2798, 2467, 2878, 2976, 3432, 2579, 3018, 30 95, 3520, 3159, 3598, 3663, 4131, 2709, 3116, 3235, 3637, 3293, 3723, 3797, 4186, 3402, 382 2, 3904, 4294, 3978, 4412, 4561, 4890, 1953, 2429, 2546, 2990, 2650, 3063, 3143, 3631, 2743, 3184, 3259, 3691, 3347, 3780, 3853, 4270, 2844, 3319, 3376, 3814, 3502, 3892, 3962, 4441, 3 551, 3990, 4075, 4473, 4166, 4583, 4656, 5176, 2968, 3447, 3533, 3922, 3646, 4016, 4087, 44 97, 3740, 4107, 4210, 4621, 4321, 4679, 4761, 5266, 3836, 4250, 4366, 4720, 4393, 4812, 493 5, 5457, 4525, 4994, 5051, 5353, 5112, 5604, 5779, 6077, 998, 1435, 1656, 2134, 1797, 2185, 2 333, 2752, 1909, 2288, 2411, 2836, 2528, 2958, 3010, 3545, 1988, 2376, 2461, 2936, 2624, 30 49, 3193, 3587, 2691, 3173, 3114, 3702, 3321, 3786, 3859, 4345, 2061, 2564, 2659, 3086, 272 6, 3151, 3232, 3728, 2861, 3283, 3357, 3803, 3457, 3916, 3966, 4446, 2987, 3371, 3515, 3944, 3573, 4026, 4091, 4516, 3685, 4115, 4190, 4612, 4246, 4715, 4795, 5301, 2241, 2597, 2809, 3 267, 2888, 3338, 3441, 3882, 3021, 3531, 3390, 3984, 3620, 4061, 4156, 4553, 3136, 3489, 36 68, 4101, 3746, 4180, 4240, 4665, 3830, 4264, 4374, 4738, 4433, 4854, 4928, 5472, 3245, 371 7, 3820, 4220, 3932, 4302, 4399, 4830, 4004, 4408, 4509, 4880, 4566, 4984, 5071, 5530, 4125, 4533, 4643, 5011, 4697, 5081, 5166, 5653, 4777, 5197, 5280, 5737, 5340, 5831, 5959, 6465, 2 493, 2778, 2910, 3472, 3071, 3556, 3604, 4136, 3206, 3652, 3757, 4216, 3847, 4284, 4333, 48 21, 3298, 3774, 3877, 4308, 3956, 4378, 4469, 4909, 4048, 4482, 4546, 4962, 4652, 5059, 515 6, 5638, 3411, 3898, 4010, 4427, 4081, 4488, 4596, 5019, 4202, 4627, 4706, 5102, 4768, 5189, 5256, 5725, 4327, 4729, 4835, 5221, 4899, 5315, 5381, 5795, 5001, 5418, 5501, 5891, 5559, 6 026, 6185, 6509, 3427, 4038, 4160, 4605, 4278, 4674, 4754, 5210, 4360, 4786, 4861, 5293, 49 55, 5367, 5446, 5874, 4454, 4918, 4972, 5406, 5094, 5486, 5542, 6055, 5145, 5574, 5671, 610 2, 5756, 6220, 6280, 6773, 4575, 5041, 5132, 5515, 5232, 5622, 5687, 6132, 5329, 5706, 5814, 6248, 5939, 6312, 6387, 6843, 5432, 5854, 5980, 6349, 6001, 6421, 6551, 7020, 6159, 6602, 6 651, 6923, 6711, 7126, 7280, 7500, 237, 530, 704, 1100, 817, 1237, 1350, 1693, 902, 1318, 141 5, 1758, 1504, 1865, 1900, 2362, 978, 1385, 1446, 1849, 1583, 1950, 2053, 2414, 1629, 2041, 1 993, 2490, 2175, 2570, 2639, 3119, 1044, 1529, 1604, 1981, 1652, 2024, 2110, 2519, 1777, 21 49, 2199, 2582, 2294, 2694, 2741, 3215, 1884, 2223, 2339, 2720, 2402, 2801, 2858, 3290, 247 8, 2889, 2961, 3388, 3024, 3486, 3583, 4099, 1278, 1558, 1737, 2137, 1793, 2188, 2282, 2668, 1916, 2351, 2236, 2766, 2434, 2833, 2924, 3329, 2009, 2328, 2458, 2867, 2540, 2947, 3006, 3 445, 2621, 3029, 3148, 3511, 3203, 3633, 3715, 4256, 2121, 2499, 2609, 3001, 2712, 3068, 31 76, 3605, 2775, 3181, 3284, 3659, 3334, 3766, 3867, 4325, 2899, 3305, 3418, 3799, 3470, 388 4, 3976, 4443, 3553, 4002, 4069, 4535, 4152, 4623, 4740, 5229, 1476, 1717, 1832, 2316, 1966, 2371, 2426, 2907, 2068, 2446, 2552, 2979, 2630, 3060, 3106, 3600, 2162, 2561, 2656, 3083, 2 729, 3153, 3237, 3693, 2815, 3257, 3310, 3744, 3425, 3851, 3958, 4418, 2247, 2677, 2784, 31 89, 2850, 3262, 3360, 3816, 2969, 3399, 3480, 3906, 3542, 3986, 4052, 4520, 3096, 3506, 362 2, 4030, 3676, 4113, 4182, 4577, 3784, 4212, 4296, 4690, 4362, 4816, 4960, 5272, 2271, 2806, 2929, 3380, 3045, 3450, 3527, 4018, 3124, 3563, 3648, 4083, 3727, 4170, 4242, 4663, 3228, 3 698, 3761, 4200, 3890, 4280, 4349, 4838, 3942, 4383, 4456, 4873, 4557, 4982, 5046, 5539, 33 55, 3834, 3924, 4310, 4034, 4401, 4471, 4897, 4129, 4499, 4601, 5014, 4710, 5074, 5148, 561 6, 4230, 4647, 4763, 5109, 4788, 5192, 5318, 5792, 4923, 5364, 5415, 5703, 5483, 5925, 6088, 6345, 1149, 1672, 1932, 2469, 2095, 2531, 2703, 3139, 2212, 2647, 2792, 3223, 2916, 3348, 3 394, 3930, 2305, 2749, 2841, 3324, 3014, 3431, 3578, 3982, 3075, 3558, 3500, 4089, 3704, 41 74, 4248, 4749, 2382, 2955, 3052, 3475, 3111, 3536, 3611, 4117, 3252, 3670, 3738, 4188, 3845, 4304, 4358, 4847, 3369, 3755, 3902, 4335, 3964, 4410, 4480, 4916, 4077, 4505, 4581, 5004, 4 641, 5099, 5182, 5656, 2591, 2984, 3194, 3654, 3271, 3721, 3828, 4272, 3413, 3912, 3778, 43 70, 4012, 4448, 4544, 4950, 3522, 3873, 4063, 4490, 4134, 4568, 4632, 5056, 4218, 4654, 477 2, 5130, 4833, 5240, 5309, 5805, 3628, 4103, 4204, 4616, 4319, 4695, 4798, 5213, 4387, 4807, 4906, 5261, 4969, 5356, 5437, 5864, 4514, 4933, 5029, 5387, 5084, 5452, 5527, 5973, 5163, 5 562, 5632, 6051, 5690, 6140, 6236, 6690, 2875, 3161, 3296, 3861, 3455, 3948, 3998, 4527, 35 89, 4046, 4144, 4608, 4232, 4683, 4731, 5200, 3681, 4158, 4268, 4704, 4343, 4782, 4866, 528 5, 4435, 4883, 4943, 5337, 5039, 5429, 5512, 5952, 3787, 4286, 4395, 4823, 4465, 4892, 4987, 5401, 4592, 5024, 5089, 5469, 5158, 5550, 5607, 6033, 4722, 5120, 5224, 5583, 5277, 5665, 5 731, 6106, 5376, 5760, 5841, 6197, 5894, 6300, 6447, 6726, 3805, 4424, 4548, 4996, 4672, 50 66, 5140, 5568, 4752, 5174, 5248, 5641, 5326, 5715, 5782, 6178, 4856, 5296, 5348, 5744, 546 3, 5824, 5881, 6324, 5506, 5908, 5987, 6366, 6066, 6469, 6528, 6959, 4977, 5409, 5492, 5851, 5598, 5942, 5998, 6395, 5681, 6019, 6121, 6496, 6212, 6555, 6621, 7027, 5769, 6155, 6256, 6 588, 6284, 6646, 6768, 7175, 6417, 6810, 6854, 7085, 6906, 7264, 7388, 7584, 1195, 1812, 20 83, 2684, 2258, 2825, 2992, 3464, 2394, 2939, 3088, 3547, 3210, 3665, 3710, 4276, 2511, 303 7, 3134, 3642, 3315, 3772, 3918, 4329, 3374, 3896, 3839, 4416, 4059, 4492, 4564, 5054, 2600, 3243, 3343, 3811, 3404, 3878, 3970, 4437, 3569, 4024, 4095, 4507, 4194, 4614, 4668, 5143, 3 687, 4123, 4254, 4645, 4317, 4726, 4784, 5216, 4403, 4809, 4885, 5312, 4947, 5412, 5498, 59 49, 2881, 3276, 3516, 4006, 3594, 4073, 4178, 4594, 3732, 4262, 4138, 4686, 4352, 4756, 484 9, 5258, 3855, 4238, 4376, 4793, 4462, 4868, 4931, 5370, 4542, 4957, 5076, 5435, 5135, 5553, 5625, 6091, 3992, 4429, 4529, 4921, 4636, 4999, 5104, 5521, 4699, 5114, 5208, 5577, 5264, 5 675, 5753, 6147, 4819, 5237, 5345, 5699, 5389, 5766, 5844, 6244, 5475, 5871, 5921, 6328, 59 94, 6400, 6487, 6888, 3168, 3491, 3617, 4224, 3793, 4292, 4337, 4828, 3936, 4368, 4477, 490 4, 4555, 4989, 5036, 5518, 4040, 4484, 4585, 5016, 4659, 5086, 5171, 5601, 4742, 5187, 5242, 5650, 5351, 5740, 5828, 6228, 4148, 4603, 4708, 5117, 4775, 5195, 5290, 5712, 4894, 5331, 5 403, 5788, 5466, 5857, 5911, 6308, 5026, 5426, 5536, 5888, 5586, 5963, 6023, 6357, 5684, 60 48, 6117, 6451, 6181, 6546, 6670, 6917, 4164, 4733, 4859, 5307, 4967, 5373, 5449, 5884, 506 1, 5489, 5556, 5932, 5635, 6012, 6073, 6430, 5161, 5610, 5662, 6037, 5772, 6110, 6166, 6569, 5818, 6193, 6260, 6597, 6341, 6685, 6741, 7119, 5282, 5728, 5801, 6136, 5898, 6208, 6272, 6 617, 5977, 6292, 6378, 6716, 6473, 6762, 6821, 7189, 6062, 6412, 6514, 6794, 6532, 6860, 69 53, 7312, 6636, 6989, 7040, 7241, 7078, 7396, 7510, 7667, 2758, 3438, 3749, 4391, 3952, 445 2, 4625, 5069, 4109, 4572, 4717, 5150, 4842, 5274, 5320, 5811, 4208, 4677, 4765, 5250, 4938, 5359, 5495, 5847, 5009, 5477, 5423, 5945, 5613, 6016, 6080, 6491, 4300, 4878, 4974, 5395, 5 044, 5454, 5533, 5966, 5179, 5580, 5647, 6030, 5734, 6128, 6174, 6574, 5299, 5659, 5785, 61 51, 5834, 6224, 6276, 6631, 5928, 6296, 6361, 6705, 6408, 6789, 6849, 7211, 4518, 4911, 512 7, 5565, 5205, 5628, 5718, 6099, 5334, 5798, 5678, 6189, 5877, 6252, 6332, 6665, 5443, 5763, 5918, 6288, 5984, 6353, 6404, 6747, 6059, 6425, 6518, 6805, 6564, 6894, 6947, 7320, 5545, 5 956, 6041, 6391, 6144, 6456, 6537, 6877, 6201, 6541, 6626, 6912, 6675, 6983, 7052, 7353, 63 04, 6641, 6731, 7008, 6778, 7059, 7112, 7424, 6832, 7139, 7196, 7480, 7233, 7541, 7607, 784 1, 4800, 5097, 5226, 5747, 5384, 5821, 5861, 6316, 5509, 5904, 5991, 6383, 6069, 6443, 6482, 6871, 5592, 6008, 6095, 6460, 6162, 6523, 6593, 6935, 6240, 6607, 6656, 6971, 6736, 7046, 7 105, 7414, 5696, 6114, 6205, 6560, 6264, 6612, 6695, 7014, 6370, 6721, 6784, 7072, 6827, 71 32, 7182, 7470, 6478, 6800, 6883, 7153, 6929, 7218, 7256, 7520, 7002, 7288, 7336, 7573, 737 0, 7642, 7719, 7858, 5709, 6232, 6337, 6700, 6434, 6757, 6816, 7146, 6500, 6838, 6900, 7204, 6965, 7249, 7304, 7562, 6583, 6941, 6977, 7272, 7065, 7328, 7362, 7654, 7098, 7379, 7442, 7 680, 7490, 7733, 7762, 7957, 6680, 7033, 7092, 7345, 7160, 7405, 7451, 7692, 7226, 7461, 75 30, 7747, 7595, 7776, 7808, 7981, 7296, 7552, 7618, 7792, 7630, 7824, 7876, 8033, 7706, 789 5, 7915, 8006, 7936, 8064, 8098, 8138, 12, 53, 93, 234, 128, 333, 384, 561, 158, 367, 415, 596, 4 58, 661, 681, 1002, 185, 399, 429, 650, 499, 721, 795, 1045, 524, 786, 758, 1099, 871, 1152, 120 8, 1570, 210, 472, 512, 740, 537, 777, 829, 1119, 607, 855, 887, 1158, 958, 1244, 1280, 1650, 67 1, 903, 987, 1262, 1038, 1320, 1370, 1709, 1093, 1391, 1450, 1787, 1496, 1871, 1951, 2380, 35 0, 485, 584, 846, 618, 879, 950, 1226, 701, 995, 911, 1297, 1059, 1348, 1413, 1740, 768, 980, 10 79, 1375, 1132, 1439, 1486, 1834, 1196, 1501, 1594, 1891, 1636, 1994, 2066, 2526, 838, 1106, 1183, 1475, 1256, 1531, 1617, 1967, 1303, 1622, 1704, 2013, 1744, 2107, 2186, 2584, 1397, 1 718, 1817, 2132, 1854, 2200, 2273, 2696, 1927, 2297, 2354, 2782, 2428, 2868, 2978, 3469, 44 4, 573, 640, 973, 730, 1009, 1052, 1402, 803, 1072, 1139, 1460, 1202, 1521, 1560, 1963, 863, 1 145, 1220, 1545, 1274, 1598, 1664, 2044, 1337, 1677, 1722, 2085, 1821, 2172, 2263, 2673, 92 7, 1232, 1308, 1627, 1364, 1686, 1766, 2150, 1455, 1796, 1863, 2221, 1915, 2283, 2340, 2768, 1555, 1887, 1986, 2324, 2029, 2393, 2457, 2821, 2122, 2482, 2560, 2930, 2623, 3054, 3195, 3 510, 942, 1331, 1423, 1783, 1511, 1838, 1903, 2310, 1574, 1935, 2002, 2367, 2074, 2444, 251 0, 2906, 1659, 2048, 2100, 2470, 2204, 2547, 2608, 3074, 2246, 2638, 2711, 3107, 2804, 3217, 3285, 3796, 1761, 2158, 2232, 2575, 2327, 2655, 2722, 3135, 2406, 2751, 2843, 3251, 2951, 3 308, 3384, 3881, 2498, 2892, 2999, 3344, 3028, 3428, 3561, 4074, 3162, 3612, 3664, 3973, 37 35, 4231, 4419, 4727, 256, 549, 711, 1086, 821, 1126, 1250, 1584, 896, 1214, 1314, 1654, 1408, 1757, 1792, 2239, 965, 1285, 1359, 1735, 1491, 1825, 1947, 2280, 1536, 1931, 1883, 2370, 20 51, 2447, 2513, 2989, 1024, 1444, 1516, 1859, 1565, 1907, 1975, 2399, 1673, 2025, 2081, 246 0, 2168, 2566, 2614, 3084, 1774, 2096, 2214, 2596, 2266, 2667, 2731, 3152, 2363, 2754, 2829, 3241, 2882, 3335, 3419, 3919, 1164, 1465, 1631, 2010, 1695, 2070, 2154, 2535, 1808, 2225, 2 118, 2629, 2307, 2699, 2793, 3187, 1899, 2193, 2347, 2739, 2409, 2816, 2873, 3292, 2488, 28 95, 3009, 3368, 3072, 3478, 3552, 4088, 1990, 2386, 2476, 2860, 2581, 2933, 3033, 3451, 264 4, 3043, 3145, 3501, 3204, 3601, 3688, 4161, 2762, 3170, 3268, 3634, 3318, 3701, 3781, 4289, 3403, 3821, 3895, 4379, 3959, 4479, 4595, 5149, 1381, 1603, 1713, 2179, 1846, 2249, 2293, 2 776, 1955, 2334, 2422, 2854, 2501, 2922, 2967, 3439, 2036, 2432, 2532, 2944, 2605, 3017, 31 00, 3530, 2688, 3117, 3177, 3584, 3277, 3679, 3769, 4265, 2125, 2550, 2652, 3061, 2716, 312 7, 3222, 3647, 2835, 3258, 3328, 3720, 3393, 3804, 3868, 4363, 2962, 3358, 3460, 3844, 3521, 3935, 4003, 4442, 3623, 4033, 4126, 4547, 4191, 4673, 4846, 5194, 2140, 2679, 2796, 3231, 2 914, 3299, 3377, 3829, 2991, 3412, 3490, 3905, 3568, 3987, 4058, 4524, 3092, 3537, 3592, 40 17, 3712, 4112, 4177, 4696, 3756, 4209, 4307, 4751, 4396, 4872, 4944, 5502, 3214, 3656, 374 3, 4145, 3856, 4249, 4322, 4781, 3949, 4346, 4464, 4913, 4573, 4981, 5062, 5587, 4047, 4502, 4617, 5020, 4648, 5098, 5249, 5787, 4817, 5305, 5363, 5676, 5428, 5919, 6094, 6376, 276, 62 9, 812, 1238, 935, 1342, 1470, 1850, 1031, 1429, 1550, 1920, 1645, 2021, 2055, 2541, 1113, 15 06, 1579, 1998, 1731, 2111, 2228, 2590, 1779, 2207, 2161, 2670, 2344, 2742, 2807, 3289, 117 7, 1668, 1753, 2147, 1800, 2197, 2270, 2690, 1939, 2314, 2373, 2756, 2463, 2857, 2909, 3382, 2040, 2403, 2516, 2887, 2578, 2965, 3022, 3458, 2658, 3048, 3122, 3555, 3185, 3660, 3754, 4 261, 1386, 1700, 1895, 2304, 1959, 2357, 2451, 2840, 2077, 2529, 2419, 2927, 2611, 2996, 30 87, 3499, 2176, 2507, 2635, 3030, 2714, 3105, 3165, 3614, 2788, 3192, 3316, 3684, 3372, 381 0, 3887, 4425, 2290, 2682, 2779, 3157, 2879, 3234, 3342, 3777, 2941, 3351, 3449, 3835, 3505, 3939, 4029, 4491, 3056, 3474, 3588, 3968, 3636, 4045, 4132, 4606, 3726, 4167, 4225, 4703, 4 316, 4790, 4900, 5404, 1612, 1875, 1983, 2492, 2129, 2556, 2599, 3064, 2242, 2626, 2725, 31 37, 2802, 3226, 3270, 3773, 2330, 2737, 2832, 3253, 2898, 3323, 3407, 3862, 2983, 3426, 348 3, 3917, 3597, 4011, 4118, 4584, 2425, 2849, 2949, 3353, 3012, 3435, 3532, 3985, 3130, 3575, 3651, 4068, 3716, 4149, 4215, 4684, 3260, 3673, 3790, 4189, 3848, 4277, 4351, 4741, 3955, 4 377, 4459, 4851, 4530, 4973, 5121, 5447, 2441, 2975, 3094, 3546, 3202, 3621, 3699, 4183, 32 97, 3741, 3815, 4243, 3901, 4334, 4407, 4827, 3400, 3872, 3929, 4369, 4053, 4447, 4513, 500 0, 4102, 4541, 4626, 5033, 4721, 5144, 5217, 5726, 3523, 3999, 4082, 4474, 4197, 4567, 4637, 5057, 4295, 4660, 4766, 5180, 4881, 5239, 5319, 5807, 4390, 4808, 4925, 5279, 4953, 5371, 5 493, 5978, 5085, 5548, 5605, 5885, 5664, 6107, 6258, 6516, 1291, 1830, 2092, 2646, 2259, 27 02, 2871, 3306, 2390, 2818, 2957, 3391, 3077, 3514, 3566, 4094, 2479, 2917, 3007, 3492, 317 5, 3606, 3748, 4139, 3244, 3729, 3671, 4255, 3876, 4340, 4413, 4905, 2563, 3115, 3212, 3643, 3280, 3707, 3788, 4283, 3416, 3837, 3911, 4357, 4009, 4470, 4519, 5007, 3544, 3925, 4064, 4 496, 4124, 4578, 4642, 5077, 4237, 4667, 4746, 5172, 4803, 5275, 5354, 5839, 2765, 3147, 33 65, 3823, 3444, 3893, 3993, 4436, 3577, 4080, 3943, 4536, 4173, 4611, 4709, 5113, 3692, 403 9, 4221, 4653, 4301, 4735, 4796, 5225, 4384, 4822, 4932, 5297, 4991, 5411, 5484, 5990, 3802, 4271, 4373, 4776, 4485, 4860, 4958, 5388, 4556, 4966, 5070, 5438, 5126, 5540, 5626, 6040, 4 678, 5093, 5203, 5566, 5257, 5634, 5717, 6149, 5336, 5743, 5819, 6223, 5873, 6305, 6415, 68 39, 3041, 3332, 3467, 4023, 3627, 4106, 4155, 4691, 3762, 4203, 4311, 4771, 4402, 4841, 489 1, 5380, 3854, 4328, 4430, 4865, 4508, 4939, 5028, 5467, 4600, 5042, 5106, 5519, 5212, 5614, 5705, 6137, 3963, 4453, 4562, 4986, 4631, 5048, 5157, 5575, 4757, 5190, 5265, 5655, 5328, 5 738, 5796, 6211, 4886, 5289, 5394, 5764, 5458, 5850, 5907, 6274, 5557, 5943, 6017, 6356, 60 67, 6472, 6606, 6874, 3979, 4589, 4716, 5167, 4836, 5235, 5314, 5755, 4919, 5346, 5421, 583 0, 5510, 5896, 5967, 6340, 5015, 5476, 5528, 5931, 5646, 6002, 6053, 6495, 5697, 6079, 6164, 6536, 6239, 6634, 6684, 7088, 5136, 5596, 5685, 6028, 5775, 6122, 6180, 6561, 5862, 6195, 6 289, 6659, 6396, 6713, 6774, 7148, 5954, 6325, 6432, 6743, 6452, 6803, 6909, 7284, 6585, 69 50, 6992, 7209, 7039, 7371, 7488, 7655, 296, 691, 919, 1418, 1065, 1589, 1726, 2136, 1171, 16 91, 1804, 2211, 1911, 2337, 2377, 2903, 1268, 1770, 1842, 2317, 2006, 2435, 2553, 2959, 205 9, 2538, 2485, 3038, 2693, 3120, 3190, 3675, 1353, 1943, 2032, 2473, 2089, 2523, 2620, 3069, 2235, 2661, 2719, 3132, 2824, 3246, 3294, 3771, 2360, 2745, 2876, 3273, 2946, 3356, 3414, 3 846, 3025, 3446, 3517, 3941, 3581, 4037, 4135, 4651, 1640, 1979, 2190, 2649, 2256, 2705, 28 13, 3219, 2396, 2890, 2759, 3320, 2981, 3389, 3481, 3885, 2504, 2862, 3002, 3423, 3089, 350 3, 3564, 3995, 3172, 3586, 3703, 4060, 3760, 4187, 4269, 4813, 2632, 3046, 3160, 3557, 3265, 3625, 3733, 4159, 3330, 3737, 3840, 4211, 3889, 4320, 4421, 4882, 3456, 3860, 3971, 4353, 4 019, 4438, 4528, 5003, 4104, 4552, 4620, 5096, 4707, 5183, 5300, 5773, 1879, 2165, 2300, 28 51, 2454, 2911, 2973, 3462, 2572, 2994, 3102, 3535, 3180, 3616, 3662, 4153, 2676, 3110, 320 7, 3640, 3282, 3709, 3794, 4245, 3370, 3813, 3864, 4297, 3977, 4405, 4511, 4978, 2773, 3229, 3339, 3745, 3405, 3819, 3913, 4371, 3526, 3951, 4031, 4461, 4090, 4539, 4604, 5082, 3653, 4 055, 4175, 4582, 4229, 4666, 4737, 5138, 4338, 4767, 4855, 5251, 4922, 5374, 5516, 5810, 27 99, 3361, 3485, 3933, 3603, 4001, 4076, 4571, 3682, 4116, 4201, 4635, 4281, 4723, 4799, 522 3, 3785, 4251, 4314, 4755, 4444, 4837, 4908, 5397, 4495, 4941, 5017, 5431, 5118, 5537, 5602, 6049, 3909, 4388, 4478, 4869, 4587, 4961, 5032, 5455, 4682, 5058, 5160, 5569, 5271, 5629, 5 700, 6119, 4785, 5209, 5322, 5661, 5349, 5739, 5853, 6270, 5481, 5893, 5940, 6192, 5999, 63 86, 6522, 6739, 1480, 2114, 2415, 3015, 2602, 3079, 3256, 3697, 2734, 3200, 3346, 3779, 347 1, 3903, 3947, 4483, 2838, 3304, 3396, 3879, 3572, 3981, 4130, 4534, 3632, 4110, 4051, 4640, 4257, 4728, 4804, 5308, 2925, 3512, 3608, 4025, 3669, 4086, 4163, 4671, 3806, 4223, 4291, 4 743, 4400, 4863, 4917, 5407, 3921, 4309, 4455, 4895, 4517, 4970, 5040, 5473, 4629, 5065, 51 41, 5560, 5201, 5652, 5732, 6152, 3142, 3541, 3752, 4207, 3827, 4275, 4382, 4831, 3965, 446 6, 4332, 4930, 4565, 5008, 5105, 5508, 4072, 4426, 4615, 5050, 4687, 5129, 5191, 5611, 4774, 5214, 5332, 5682, 5391, 5781, 5845, 6283, 4181, 4657, 4760, 5178, 4877, 5254, 5357, 5758, 4 948, 5366, 5464, 5802, 5525, 5887, 5961, 6334, 5073, 5490, 5584, 5913, 5637, 5972, 6038, 64 26, 5714, 6071, 6131, 6492, 6183, 6567, 6648, 7022, 3433, 3718, 3852, 4415, 4007, 4500, 455 0, 5087, 4141, 4598, 4698, 5168, 4789, 5243, 5291, 5746, 4235, 4712, 4824, 5263, 4903, 5339, 5424, 5825, 4995, 5441, 5499, 5870, 5593, 5951, 6025, 6409, 4342, 4844, 4956, 5383, 5025, 5 450, 5543, 5926, 5152, 5578, 5643, 5986, 5708, 6058, 6109, 6479, 5283, 5673, 5767, 6089, 58 16, 6161, 6217, 6540, 5905, 6242, 6311, 6616, 6360, 6703, 6823, 7053, 4359, 4983, 5110, 555 1, 5231, 5620, 5691, 6076, 5311, 5723, 5790, 6139, 5859, 6204, 6261, 6599, 5414, 5833, 5879, 6230, 5981, 6299, 6347, 6720, 6020, 6369, 6439, 6758, 6506, 6842, 6890, 7238, 5534, 5934, 6 007, 6321, 6101, 6399, 6449, 6781, 6173, 6466, 6553, 6865, 6630, 6914, 6967, 7290, 6251, 65 81, 6667, 6938, 6688, 6988, 7083, 7404, 6799, 7120, 7157, 7337, 7194, 7475, 7574, 7720, 154 0, 2276, 2587, 3239, 2785, 3379, 3548, 4015, 2938, 3494, 3645, 4098, 3764, 4217, 4263, 4832, 3059, 3595, 3690, 4195, 3870, 4326, 4472, 4888, 3927, 4449, 4394, 4975, 4609, 5053, 5124, 5 608, 3150, 3798, 3897, 4365, 3957, 4432, 4523, 4998, 4120, 4576, 4646, 5068, 4748, 5175, 52 28, 5694, 4241, 4676, 4810, 5206, 4874, 5286, 5343, 5761, 4964, 5368, 5444, 5848, 5505, 593 7, 6014, 6406, 3437, 3831, 4066, 4560, 4147, 4624, 4732, 5155, 4287, 4818, 4693, 5246, 4910, 5317, 5408, 5799, 4409, 4794, 4936, 5350, 5023, 5427, 5487, 5899, 5101, 5513, 5631, 5957, 5 688, 6061, 6124, 6526, 4545, 4990, 5090, 5478, 5198, 5554, 5658, 6035, 5260, 5667, 5752, 60 82, 5804, 6168, 6235, 6575, 5377, 5778, 5876, 6190, 5916, 6249, 6315, 6655, 5993, 6338, 638 2, 6724, 6445, 6785, 6858, 7180, 3724, 4041, 4169, 4780, 4348, 4850, 4896, 5386, 4489, 4927, 5037, 5461, 5116, 5546, 5590, 6031, 4593, 5045, 5146, 5572, 5220, 5640, 5720, 6104, 5303, 5 735, 5784, 6146, 5882, 6226, 6302, 6642, 4702, 5164, 5268, 5670, 5335, 5741, 5827, 6202, 54 51, 5865, 5929, 6267, 5983, 6327, 6373, 6710, 5581, 5948, 6046, 6354, 6092, 6419, 6468, 675 0, 6177, 6489, 6550, 6826, 6603, 6905, 7005, 7205, 4718, 5294, 5417, 5842, 5522, 5902, 5969, 6350, 5617, 6004, 6064, 6393, 6134, 6458, 6512, 6812, 5711, 6112, 6158, 6483, 6254, 6543, 6 591, 6926, 6293, 6613, 6669, 6946, 6735, 7018, 7066, 7365, 5822, 6214, 6279, 6563, 6363, 66 27, 6677, 6963, 6428, 6696, 6766, 7043, 6846, 7079, 7129, 7416, 6502, 6796, 6878, 7106, 689 3, 7162, 7234, 7514, 6980, 7263, 7300, 7457, 7332, 7580, 7662, 7782, 3311, 3989, 4303, 4949, 4506, 5012, 5186, 5623, 4662, 5133, 5276, 5702, 5400, 5813, 5856, 6286, 4762, 5238, 5325, 5 793, 5496, 5890, 6010, 6318, 5563, 5996, 5946, 6402, 6116, 6462, 6520, 6862, 4858, 5434, 55 31, 5923, 5599, 5975, 6043, 6422, 5729, 6085, 6143, 6475, 6221, 6557, 6595, 6930, 5836, 615 6, 6263, 6577, 6309, 6638, 6681, 6975, 6389, 6699, 6754, 7035, 6792, 7101, 7152, 7434, 5078, 5470, 5679, 6074, 5749, 6127, 6207, 6533, 5868, 6277, 6171, 6609, 6343, 6663, 6728, 7000, 5 964, 6245, 6380, 6692, 6435, 6746, 6788, 7070, 6499, 6807, 6881, 7115, 6922, 7185, 7229, 75 19, 6056, 6413, 6485, 6777, 6571, 6830, 6897, 7171, 6620, 6902, 6972, 7199, 7009, 7259, 731 0, 7546, 6707, 6984, 7057, 7274, 7093, 7316, 7359, 7602, 7138, 7381, 7421, 7638, 7452, 7686, 7737, 7914, 5360, 5649, 5770, 6233, 5910, 6295, 6331, 6717, 6022, 6367, 6442, 6770, 6510, 6 819, 6855, 7166, 6097, 6455, 6530, 6835, 6589, 6886, 6942, 7219, 6652, 6955, 6997, 7248, 70 61, 7305, 7354, 7594, 6186, 6547, 6623, 6918, 6673, 6958, 7026, 7279, 6761, 7048, 7096, 732 6, 7134, 7375, 7410, 7632, 6850, 7110, 7176, 7392, 7214, 7439, 7469, 7670, 7269, 7494, 7533, 7711, 7559, 7764, 7822, 7928, 6199, 6644, 6732, 7030, 6815, 7075, 7124, 7386, 6869, 7143, 7 190, 7427, 7244, 7463, 7507, 7702, 6934, 7224, 7253, 7482, 7321, 7526, 7553, 7773, 7348, 75 67, 7609, 7793, 7646, 7833, 7854, 8003, 7013, 7294, 7342, 7539, 7398, 7588, 7616, 7802, 744 5, 7624, 7677, 7844, 7728, 7866, 7889, 8021, 7501, 7694, 7745, 7878, 7754, 7902, 7942, 8061, 7812, 7955, 7971, 8040, 7987, 8084, 8111, 8145, 315, 749, 1016, 1608, 1189, 1867, 2017, 246 6, 1325, 1971, 2103, 2544, 2218, 2685, 2728, 3313, 1434, 2063, 2143, 2664, 2320, 2810, 2935, 3375, 2383, 2919, 2865, 3465, 3082, 3550, 3630, 4143, 1526, 2252, 2350, 2846, 2412, 2901, 3 004, 3496, 2569, 3051, 3112, 3559, 3236, 3686, 3739, 4253, 2708, 3140, 3287, 3714, 3363, 38 00, 3866, 4330, 3453, 3899, 3975, 4434, 4043, 4537, 4638, 5128, 1923, 2287, 2520, 3035, 259 3, 3097, 3224, 3658, 2771, 3301, 3155, 3767, 3398, 3833, 3931, 4375, 2884, 3275, 3430, 3874, 3519, 3961, 4027, 4493, 3610, 4049, 4179, 4563, 4233, 4689, 4773, 5278, 3020, 3476, 3599, 4 013, 3705, 4084, 4205, 4658, 3775, 4213, 4324, 4714, 4380, 4820, 4912, 5338, 3907, 4344, 44 68, 4853, 4521, 4929, 5010, 5448, 4607, 5035, 5095, 5532, 5177, 5612, 5716, 6163, 2183, 249 5, 2641, 3263, 2827, 3325, 3386, 3915, 2954, 3421, 3528, 3991, 3619, 4078, 4128, 4655, 3066, 3539, 3649, 4108, 3731, 4185, 4273, 4750, 3817, 4293, 4350, 4797, 4476, 4898, 4997, 5425, 3 182, 3666, 3783, 4219, 3858, 4299, 4404, 4870, 3983, 4445, 4532, 4951, 4597, 5022, 5083, 55 20, 4122, 4558, 4680, 5063, 4730, 5139, 5207, 5570, 4839, 5233, 5313, 5672, 5375, 5789, 592 2, 6196, 3209, 3808, 3945, 4428, 4062, 4498, 4580, 5052, 4151, 4618, 4700, 5111, 4783, 5193, 5262, 5648, 4267, 4753, 4815, 5219, 4934, 5298, 5361, 5809, 4980, 5393, 5462, 5840, 5555, 5 941, 6003, 6427, 4398, 4879, 4963, 5327, 5067, 5474, 5866, 5154, 5500, 5591, 5971, 56 92, 6024, 6090, 6493, 5247, 5636, 5736, 6054, 5765, 6129, 6238, 6635, 5892, 6281, 6323, 656 2, 6379, 6740, 6859, 7045, 1682, 2438, 2790, 3442, 2986, 3508, 3694, 4165, 3125, 3638, 3792, 4259, 3923, 4392, 4440, 4971, 3248, 3750, 3850, 4367, 4035, 4481, 4633, 5018, 4092, 4613, 4 554, 5115, 4759, 5196, 5267, 5724, 3337, 3969, 4070, 4526, 4137, 4586, 4664, 5147, 4285, 47 25, 4792, 5211, 4893, 5321, 5369, 5817, 4417, 4811, 4946, 5347, 5002, 5419, 5482, 5883, 510 8, 5503, 5576, 5962, 5627, 6047, 6120, 6521, 3570, 3997, 4227, 4711, 4313, 4778, 4876, 5287, 4463, 4954, 4834, 5382, 5047, 5453, 5541, 5914, 4574, 4920, 5092, 5491, 5159, 5564, 5618, 6 009, 5241, 5639, 5748, 6075, 5806, 6169, 6231, 6645, 4685, 5131, 5227, 5606, 5333, 5674, 57 71, 6148, 5396, 5780, 5875, 6188, 5930, 6271, 6342, 6693, 5514, 5897, 5988, 6298, 6032, 635 2, 6416, 6776, 6105, 6446, 6503, 6834, 6552, 6898, 6968, 7278, 3883, 4193, 4336, 4907, 4510, 4985, 5030, 5526, 4644, 5075, 5170, 5600, 5252, 5663, 5707, 6138, 4739, 5181, 5284, 5683, 5 358, 5757, 5832, 6213, 5439, 5849, 5906, 6257, 5995, 6335, 6405, 6763, 4843, 5302, 5405, 57 97, 5468, 5858, 5947, 6310, 5582, 5979, 6039, 6368, 6098, 6433, 6481, 6824, 5701, 6068, 615 4, 6463, 6206, 6534, 6584, 6873, 6290, 6605, 6671, 6939, 6714, 7015, 7114, 7302, 4862, 5433, 5544, 5955, 5657, 6015, 6083, 6453, 5727, 6113, 6179, 6511, 6246, 6572, 6624, 6925, 5826, 6 219, 6265, 6594, 6362, 6661, 6704, 7028, 6397, 6725, 6787, 7060, 6845, 7128, 7169, 7454, 59 38, 6317, 6385, 6682, 6474, 6751, 6798, 7077, 6544, 6813, 6887, 7151, 6954, 7188, 7232, 749 3, 6615, 6911, 6981, 7210, 6999, 7252, 7330, 7585, 7097, 7358, 7387, 7534, 7419, 7644, 7717, 7827, 1748, 2617, 2970, 3677, 3197, 3825, 4005, 4515, 3349, 3953, 4114, 4602, 4247, 4719, 4 764, 5295, 3487, 4057, 4157, 4694, 4361, 4825, 4959, 5344, 4423, 4937, 4884, 5422, 5088, 54 94, 5558, 6006, 3590, 4279, 4386, 4867, 4451, 4924, 5005, 5442, 4622, 5055, 5119, 5507, 521 5, 5603, 5651, 6087, 4744, 5151, 5270, 5630, 5330, 5704, 5759, 6153, 5413, 5786, 5855, 6234, 5912, 6319, 6394, 6759, 3891, 4318, 4569, 5043, 4649, 5100, 5199, 5588, 4787, 5281, 5165, 5 669, 5365, 5733, 5820, 6187, 4901, 5259, 5390, 5768, 5465, 5838, 5895, 6282, 5538, 5920, 60 29, 6339, 6081, 6437, 6497, 6863, 5027, 5436, 5529, 5886, 5624, 5958, 6052, 6411, 5680, 606 0, 6145, 6457, 6194, 6535, 6601, 6904, 5791, 6167, 6262, 6558, 6301, 6614, 6674, 6974, 6372, 6697, 6737, 7032, 6795, 7082, 7144, 7407, 4199, 4543, 4675, 5244, 4848, 5310, 5352, 5800, 4 976, 5379, 5479, 5869, 5552, 5950, 5989, 6410, 5072, 5488, 5579, 5974, 5642, 6036, 6111, 64 77, 5722, 6126, 6175, 6519, 6269, 6590, 6664, 6961, 5173, 5594, 5689, 6063, 5751, 6133, 621 5, 6570, 5860, 6250, 6313, 6632, 6364, 6686, 6729, 7021, 5982, 6330, 6423, 6712, 6467, 6769, 6817, 7054, 6548, 6833, 6884, 7117, 6928, 7184, 7265, 7428, 5188, 5713, 5829, 6227, 5927, 6 287, 6351, 6708, 6013, 6384, 6441, 6748, 6507, 6806, 6852, 7103, 6103, 6486, 6529, 6828, 66 19, 6876, 6919, 7200, 6653, 6936, 6986, 7217, 7042, 7276, 7314, 7556, 6209, 6580, 6640, 689 5, 6718, 6951, 6993, 7230, 6780, 7006, 7068, 7295, 7133, 7325, 7366, 7593, 6841, 7091, 7158, 7346, 7173, 7391, 7449, 7669, 7245, 7476, 7502, 7628, 7528, 7723, 7783, 7875, 3758, 4487, 4 806, 5399, 4993, 5456, 5615, 6021, 5134, 5567, 5695, 6096, 5812, 6200, 6243, 6649, 5230, 56 60, 5745, 6182, 5903, 6275, 6390, 6678, 5965, 6375, 6329, 6755, 6488, 6809, 6856, 7147, 531 6, 5846, 5936, 6306, 5997, 6358, 6420, 6772, 6118, 6459, 6515, 6820, 6587, 6891, 6921, 7202, 6225, 6525, 6628, 6908, 6668, 6957, 6996, 7240, 6744, 7011, 7056, 7291, 7089, 7343, 7383, 7 608, 5517, 5878, 6072, 6448, 6141, 6501, 6576, 6870, 6253, 6639, 6539, 6932, 6701, 6978, 70 36, 7260, 6346, 6610, 6733, 7003, 6783, 7050, 7086, 7318, 6837, 7100, 7163, 7355, 7195, 741 1, 7446, 7674, 6431, 6765, 6831, 7074, 6901, 7122, 7177, 7400, 6944, 7181, 7237, 7423, 7267, 7472, 7511, 7696, 7017, 7250, 7307, 7484, 7334, 7515, 7551, 7740, 7374, 7565, 7599, 7769, 7 623, 7800, 7840, 7977, 5777, 6045, 6160, 6598, 6294, 6657, 6689, 7024, 6401, 6722, 6791, 70 71, 6848, 7111, 7140, 7395, 6471, 6802, 6867, 7125, 6915, 7165, 7215, 7437, 6970, 7222, 725 7, 7462, 7311, 7505, 7547, 7735, 6554, 6880, 6948, 7192, 6990, 7225, 7283, 7487, 7063, 7299, 7339, 7524, 7369, 7561, 7589, 7765, 7136, 7350, 7402, 7575, 7432, 7613, 7639, 7788, 7479, 7 653, 7685, 7819, 7707, 7861, 7906, 7988, 6566, 6964, 7038, 7287, 7108, 7323, 7363, 7570, 71 55, 7378, 7415, 7604, 7458, 7634, 7664, 7814, 7207, 7441, 7466, 7649, 7521, 7679, 7700, 786 9, 7543, 7712, 7746, 7883, 7775, 7916, 7931, 8044, 7271, 7497, 7537, 7690, 7579, 7729, 7752, 7891, 7619, 7758, 7795, 7923, 7834, 7940, 7959, 8057, 7659, 7807, 7847, 7949, 7853, 7967, 7 997, 8088, 7899, 8009, 8019, 8072, 8031, 8105, 8126, 8152, 1813, 2748, 3167, 3937, 3409, 41 71, 4355, 4857, 3579, 4305, 4457, 4942, 4591, 5080, 5123, 5645, 3722, 4411, 4504, 5060, 470 5, 5185, 5306, 5698, 4769, 5292, 5236, 5774, 5445, 5852, 5917, 6333, 3842, 4628, 4734, 5222, 4801, 5273, 5372, 5803, 4968, 5416, 5471, 5863, 5573, 5968, 6011, 6407, 5103, 5497, 5621, 5 992, 5686, 6065, 6115, 6464, 5762, 6142, 6203, 6538, 6255, 6608, 6676, 7001, 4239, 4669, 49 15, 5402, 4988, 5459, 5561, 5944, 5142, 5633, 5511, 6034, 5719, 6093, 6172, 6494, 5255, 560 9, 5742, 6123, 5823, 6191, 6241, 6578, 5900, 6259, 6355, 6625, 6398, 6709, 6764, 7095, 5385, 5783, 5889, 6237, 5985, 6291, 6377, 6691, 6042, 6381, 6461, 6727, 6498, 6797, 6861, 7135, 6 150, 6476, 6559, 6818, 6596, 6872, 6927, 7201, 6654, 6943, 6982, 7251, 7034, 7297, 7356, 75 78, 4549, 4889, 5038, 5597, 5204, 5654, 5710, 6157, 5324, 5730, 5835, 6218, 5909, 6285, 632 2, 6687, 5430, 5843, 5933, 6303, 6000, 6359, 6424, 6749, 6078, 6440, 6480, 6782, 6565, 6851, 6916, 7187, 5523, 5953, 6050, 6388, 6108, 6444, 6517, 6829, 6210, 6545, 6604, 6885, 6647, 6 933, 6973, 7243, 6314, 6622, 6702, 6960, 6738, 7010, 7051, 7273, 6808, 7069, 7118, 7331, 71 56, 7393, 7460, 7596, 5549, 6070, 6176, 6531, 6273, 6582, 6637, 6952, 6336, 6662, 6719, 699 1, 6771, 7044, 7087, 7317, 6418, 6753, 6793, 7062, 6875, 7109, 7149, 7403, 6907, 7167, 7208, 7420, 7262, 7471, 7499, 7699, 6513, 6840, 6896, 7127, 6962, 7178, 7216, 7431, 7019, 7231, 7 285, 7485, 7341, 7512, 7544, 7727, 7080, 7309, 7367, 7527, 7380, 7563, 7614, 7787, 7444, 76 33, 7652, 7757, 7678, 7830, 7879, 7948, 4021, 4829, 5162, 5754, 5355, 5815, 5976, 6348, 548 5, 5924, 6057, 6414, 6165, 6508, 6542, 6899, 5585, 6018, 6100, 6490, 6247, 6568, 6672, 6931, 6297, 6658, 6618, 6994, 6756, 7047, 7090, 7360, 5666, 6198, 6278, 6600, 6326, 6643, 6694, 7 012, 6436, 6734, 6779, 7055, 6847, 7123, 7154, 7408, 6524, 6790, 6882, 7141, 6920, 7183, 72 21, 7440, 6987, 7235, 7275, 7481, 7306, 7523, 7558, 7741, 5872, 6222, 6392, 6723, 6450, 676 7, 6836, 7104, 6556, 6889, 6804, 7161, 6949, 7203, 7255, 7456, 6633, 6864, 6979, 7227, 7023, 7268, 7301, 7504, 7073, 7313, 7372, 7536, 7401, 7582, 7611, 7791, 6706, 7004, 7064, 7293, 7 131, 7333, 7384, 7571, 7170, 7389, 7436, 7591, 7465, 7629, 7661, 7811, 7239, 7448, 7492, 76 41, 7516, 7666, 7695, 7845, 7550, 7708, 7732, 7868, 7753, 7893, 7920, 8027, 6130, 6365, 647 0, 6857, 6586, 6910, 6940, 7246, 6679, 6969, 7029, 7289, 7081, 7327, 7351, 7566, 6742, 7037, 7102, 7338, 7145, 7376, 7417, 7601, 7197, 7425, 7453, 7622, 7496, 7658, 7689, 7838, 6811, 7 113, 7174, 7397, 7213, 7429, 7473, 7647, 7281, 7489, 7518, 7673, 7548, 7703, 7724, 7863, 73 47, 7532, 7576, 7715, 7598, 7744, 7767, 7884, 7637, 7777, 7803, 7909, 7820, 7937, 7973, 803 5, 6822, 7191, 7258, 7477, 7322, 7508, 7540, 7710, 7361, 7555, 7586, 7736, 7617, 7761, 7784, 7904, 7412, 7605, 7626, 7771, 7671, 7798, 7816, 7943, 7687, 7825, 7849, 7953, 7872, 7978, 7 992, 8078, 7468, 7650, 7682, 7806, 7721, 7835, 7852, 7961, 7750, 7859, 7888, 7985, 7913, 79 98, 8013, 8089, 7780, 7898, 7925, 8005, 7932, 8018, 8043, 8112, 7966, 8051, 8059, 8099, 806 9, 8124, 8140, 8160, 4100, 5013, 5341, 5960, 5535, 6086, 6229, 6592, 5677, 6184, 6307, 6650, 6403, 6730, 6760, 7107, 5794, 6266, 6344, 6715, 6484, 6801, 6892, 7137, 6527, 6879, 6844, 7 186, 6976, 7228, 7266, 7503, 5880, 6429, 6504, 6825, 6549, 6868, 6924, 7198, 6666, 6956, 69 98, 7236, 7058, 7292, 7319, 7542, 6745, 7016, 7094, 7308, 7130, 7349, 7377, 7572, 7179, 739 0, 7426, 7612, 7455, 7651, 7684, 7837, 6135, 6454, 6629, 6945, 6683, 6985, 7049, 7282, 6775, 7099, 7025, 7329, 7150, 7364, 7409, 7590, 6853, 7084, 7164, 7382, 7212, 7418, 7447, 7635, 7 254, 7459, 7513, 7660, 7538, 7704, 7730, 7880, 6937, 7193, 7247, 7443, 7303, 7478, 7525, 76 93, 7335, 7529, 7569, 7713, 7592, 7748, 7774, 7896, 7394, 7581, 7625, 7756, 7643, 7779, 780 4, 7922, 7675, 7813, 7829, 7944, 7851, 7962, 7983, 8066, 6371, 6611, 6698, 7076, 6814, 7116, 7142, 7399, 6903, 7159, 7220, 7435, 7261, 7474, 7495, 7691, 6966, 7223, 7277, 7486, 7315, 7 517, 7554, 7722, 7357, 7560, 7583, 7739, 7627, 7770, 7799, 7918, 7031, 7286, 7340, 7531, 73 73, 7564, 7603, 7760, 7430, 7620, 7648, 7786, 7672, 7809, 7826, 7939, 7491, 7657, 7698, 781 8, 7716, 7842, 7860, 7951, 7751, 7867, 7887, 7974, 7905, 7996, 8023, 8071, 7041, 7352, 7413, 7610, 7464, 7636, 7665, 7817, 7506, 7681, 7705, 7832, 7734, 7856, 7874, 7969, 7549, 7725, 7 743, 7864, 7781, 7885, 7901, 8001, 7796, 7908, 7926, 8008, 7947, 8026, 8038, 8104, 7600, 77 66, 7790, 7892, 7821, 7912, 7929, 8012, 7846, 7934, 7956, 8032, 7979, 8042, 8053, 8114, 787 1, 7965, 7989, 8048, 7993, 8060, 8077, 8130, 8016, 8083, 8091, 8121, 8097, 8141, 8153, 8167, 6027, 6573, 6786, 7172, 6913, 7206, 7298, 7509, 7007, 7270, 7344, 7545, 7406, 7597, 7615, 7 794, 7067, 7324, 7368, 7587, 7450, 7631, 7683, 7805, 7483, 7676, 7656, 7836, 7726, 7857, 78 77, 7984, 7121, 7422, 7467, 7645, 7498, 7668, 7697, 7843, 7557, 7714, 7738, 7862, 7768, 789 0, 7903, 8002, 7606, 7742, 7785, 7897, 7801, 7917, 7930, 8015, 7831, 7935, 7952, 8030, 7964, 8047, 8058, 8117, 7242, 7438, 7535, 7709, 7568, 7731, 7763, 7882, 7621, 7789, 7749, 7907, 7 815, 7924, 7945, 8022, 7663, 7778, 7828, 7933, 7848, 7950, 7963, 8039, 7870, 7968, 7990, 80 50, 8000, 8067, 8076, 8131, 7701, 7839, 7865, 7960, 7894, 7975, 7994, 8063, 7910, 7995, 801 4, 8070, 8024, 8082, 8093, 8135, 7938, 8017, 8036, 8086, 8045, 8094, 8103, 8144, 8055, 8107, 8115, 8150, 8120, 8156, 8162, 8179, 7385, 7522, 7577, 7772, 7640, 7797, 7810, 7941, 7688, 7 823, 7850, 7958, 7873, 7972, 7982, 8062, 7718, 7855, 7881, 7976, 7900, 7991, 8007, 8074, 79 21, 8010, 8020, 8080, 8037, 8092, 8102, 8143, 7755, 7886, 7911, 7999, 7927, 8011, 8028, 808 7, 7954, 8034, 8046, 8096, 8054, 8106, 8113, 8149, 7980, 8049, 8065, 8109, 8073, 8118, 8123, 8154, 8085, 8127, 8133, 8159, 8137, 8165, 8171, 8180, 7759, 7919, 7946, 8029, 7970, 8041, 8 052, 8108, 7986, 8056, 8068, 8116, 8079, 8122, 8129, 8158, 8004, 8075, 8081, 8125, 8095, 81 32, 8136, 8166, 8101, 8139, 8146, 8168, 8151, 8172, 8174, 8185, 8025, 8090, 8100, 8134, 811 0, 8142, 8147, 8169, 8119, 8148, 8155, 8173, 8161, 8175, 8177, 8186, 8128, 8157, 8163, 8176, 8164, 8178, 8181, 8188, 8170, 8182, 8183, 8187, 8184, 8189, 8190, 8191]

TABLE Z17 with a sequence length of 8192:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 13 |
| 6 | 16 |
| 7 | 29 |
| 8 | 4 |
| 9 | 15 |
| 10 | 18 |
| 11 | 32 |
| 12 | 21 |
| 13 | 38 |
| 14 | 40 |
| 15 | 79 |
| 16 | 5 |
| 17 | 17 |
| 18 | 19 |
| 19 | 37 |
| 20 | 24 |
| 21 | 44 |
| 22 | 52 |
| 23 | 85 |
| 24 | 26 |
| 25 | 51 |
| 26 | 48 |
| 27 | 94 |
| 28 | 62 |
| 29 | 102 |
| 30 | 111 |
| 31 | 180 |
| 32 | 6 |
| 33 | 22 |
| 34 | 25 |
| 35 | 46 |
| 36 | 27 |
| 37 | 50 |
| 38 | 57 |
| 39 | 97 |
| 40 | 33 |
| 41 | 60 |
| 42 | 64 |
| 43 | 103 |

TABLE Z17-continued with a sequence length of 8192:

| Polarized channel sequence number | Reliability or reliability sequence number |
|---|---|
| 44 | 73 |
| 45 | 117 |
| 46 | 123 |
| 47 | 198 |
| 48 | 39 |
| 49 | 66 |
| 50 | 77 |
| 51 | 120 |
| 52 | 84 |
| 53 | 131 |
| 54 | 140 |
| 55 | 212 |
| 56 | 92 |
| 57 | 144 |
| 58 | 155 |
| 59 | 230 |
| 60 | 165 |
| 61 | 251 |
| 62 | 272 |
| 63 | 400 |
| 64 | 14 |
| 65 | 23 |
| 66 | 31 |
| 67 | 59 |
| 68 | 34 |
| 69 | 63 |
| 70 | 72 |
| 71 | 114 |
| 72 | 42 |
| 73 | 78 |
| 74 | 67 |
| 75 | 126 |
| 76 | 87 |
| 77 | 136 |
| 78 | 148 |
| 79 | 219 |
| 80 | 49 |
| 81 | 76 |
| 82 | 90 |
| 83 | 141 |
| 84 | 99 |
| 85 | 153 |
| 86 | 163 |
| 87 | 242 |
| 88 | 109 |
| 89 | 166 |
| 90 | 186 |
| 91 | 257 |
| 92 | 195 |
| 93 | 284 |
| 94 | 304 |
| 95 | 449 |
| 96 | 58 |
| 97 | 95 |
| 98 | 107 |
| 99 | 161 |
| 100 | 119 |
| 101 | 172 |
| 102 | 191 |
| 103 | 277 |
| 104 | 127 |
| 105 | 192 |
| 106 | 211 |
| 107 | 289 |
| 108 | 220 |
| 109 | 316 |
| 110 | 339 |
| 111 | 469 |
| 112 | 145 |
| 113 | 214 |
| 114 | 238 |
| 115 | 323 |
| 116 | 247 |
| 117 | 343 |
| 118 | 365 |

TABLE Z17-continued with a sequence length of 8192:

| Polarized channel sequence number | Reliability or reliability sequence number |
|---|---|
| 119 | 510 |
| 120 | 266 |
| 121 | 373 |
| 122 | 391 |
| 123 | 543 |
| 124 | 416 |
| 125 | 577 |
| 126 | 622 |
| 127 | 847 |
| 128 | 20 |
| 129 | 30 |
| 130 | 36 |
| 131 | 75 |
| 132 | 45 |
| 133 | 80 |
| 134 | 86 |
| 135 | 146 |
| 136 | 54 |
| 137 | 89 |
| 138 | 100 |
| 139 | 157 |
| 140 | 110 |
| 141 | 170 |
| 142 | 178 |
| 143 | 275 |
| 144 | 61 |
| 145 | 101 |
| 146 | 113 |
| 147 | 175 |
| 148 | 122 |
| 149 | 187 |
| 150 | 201 |
| 151 | 298 |
| 152 | 134 |
| 153 | 204 |
| 154 | 215 |
| 155 | 309 |
| 156 | 239 |
| 157 | 335 |
| 158 | 362 |
| 159 | 502 |
| 160 | 69 |
| 161 | 115 |
| 162 | 129 |
| 163 | 193 |
| 164 | 139 |
| 165 | 206 |
| 166 | 225 |
| 167 | 328 |
| 168 | 156 |
| 169 | 232 |
| 170 | 249 |
| 171 | 349 |
| 172 | 263 |
| 173 | 369 |
| 174 | 387 |
| 175 | 538 |
| 176 | 177 |
| 177 | 255 |
| 178 | 282 |
| 179 | 381 |
| 180 | 293 |
| 181 | 404 |
| 182 | 425 |
| 183 | 558 |
| 184 | 320 |
| 185 | 434 |
| 186 | 461 |
| 187 | 602 |
| 188 | 483 |
| 189 | 654 |
| 190 | 716 |
| 191 | 867 |
| 192 | 71 |
| 193 | 133 |

TABLE Z17-continued with a sequence length of 8192:

| Polarized channel sequence number | Reliability or reliability sequence number |
|---|---|
| 194 | 150 |
| 195 | 229 |
| 196 | 168 |
| 197 | 243 |
| 198 | 260 |
| 199 | 377 |
| 200 | 181 |
| 201 | 268 |
| 202 | 286 |
| 203 | 395 |
| 204 | 306 |
| 205 | 421 |
| 206 | 443 |
| 207 | 592 |
| 208 | 200 |
| 209 | 299 |
| 210 | 313 |
| 211 | 430 |
| 212 | 344 |
| 213 | 456 |
| 214 | 478 |
| 215 | 663 |
| 216 | 357 |
| 217 | 489 |
| 218 | 516 |
| 219 | 677 |
| 220 | 552 |
| 221 | 726 |
| 222 | 757 |
| 223 | 1019 |
| 224 | 224 |
| 225 | 330 |
| 226 | 353 |
| 227 | 466 |
| 228 | 382 |
| 229 | 495 |
| 230 | 520 |
| 231 | 689 |
| 232 | 408 |
| 233 | 531 |
| 234 | 567 |
| 235 | 742 |
| 236 | 611 |
| 237 | 769 |
| 238 | 805 |
| 239 | 1067 |
| 240 | 439 |
| 241 | 587 |
| 242 | 631 |
| 243 | 785 |
| 244 | 643 |
| 245 | 826 |
| 246 | 893 |
| 247 | 1181 |
| 248 | 702 |
| 249 | 920 |
| 250 | 947 |
| 251 | 1121 |
| 252 | 985 |
| 253 | 1273 |
| 254 | 1390 |
| 255 | 1599 |
| 256 | 8 |
| 257 | 28 |
| 258 | 43 |
| 259 | 91 |
| 260 | 56 |
| 261 | 98 |
| 262 | 118 |
| 263 | 183 |
| 264 | 65 |
| 265 | 112 |
| 266 | 130 |
| 267 | 199 |
| 268 | 147 |

TABLE Z17-continued with a sequence length of 8192:

| Polarized channel sequence number | Reliability or reliability sequence number |
|---|---|
| 269 | 223 |
| 270 | 231 |
| 271 | 355 |
| 272 | 74 |
| 273 | 124 |
| 274 | 138 |
| 275 | 218 |
| 276 | 164 |
| 277 | 240 |
| 278 | 271 |
| 279 | 368 |
| 280 | 173 |
| 281 | 267 |
| 282 | 254 |
| 283 | 396 |
| 284 | 300 |
| 285 | 422 |
| 286 | 445 |
| 287 | 626 |
| 288 | 82 |
| 289 | 154 |
| 290 | 169 |
| 291 | 248 |
| 292 | 179 |
| 293 | 261 |
| 294 | 279 |
| 295 | 406 |
| 296 | 203 |
| 297 | 292 |
| 298 | 308 |
| 299 | 426 |
| 300 | 334 |
| 301 | 463 |
| 302 | 480 |
| 303 | 667 |
| 304 | 227 |
| 305 | 312 |
| 306 | 347 |
| 307 | 474 |
| 308 | 363 |
| 309 | 500 |
| 310 | 523 |
| 311 | 697 |
| 312 | 394 |
| 313 | 532 |
| 314 | 562 |
| 315 | 737 |
| 316 | 582 |
| 317 | 781 |
| 318 | 822 |
| 319 | 1089 |
| 320 | 104 |
| 321 | 159 |
| 322 | 194 |
| 323 | 288 |
| 324 | 208 |
| 325 | 305 |
| 326 | 329 |
| 327 | 452 |
| 328 | 236 |
| 329 | 351 |
| 330 | 319 |
| 331 | 486 |
| 332 | 376 |
| 333 | 511 |
| 334 | 547 |
| 335 | 713 |
| 336 | 259 |
| 337 | 341 |
| 338 | 389 |
| 339 | 527 |
| 340 | 409 |
| 341 | 556 |
| 342 | 579 |
| 343 | 761 |

TABLE Z17-continued with a sequence length of 8192:

| Polarized channel sequence number | Reliability or reliability sequence number |
|---|---|
| 344 | 436 |
| 345 | 588 |
| 346 | 635 |
| 347 | 797 |
| 348 | 662 |
| 349 | 851 |
| 350 | 889 |
| 351 | 1190 |
| 352 | 283 |
| 353 | 402 |
| 354 | 432 |
| 355 | 574 |
| 356 | 468 |
| 357 | 603 |
| 358 | 645 |
| 359 | 837 |
| 360 | 491 |
| 361 | 649 |
| 362 | 694 |
| 363 | 862 |
| 364 | 720 |
| 365 | 914 |
| 366 | 960 |
| 367 | 1231 |
| 368 | 535 |
| 369 | 705 |
| 370 | 750 |
| 371 | 931 |
| 372 | 773 |
| 373 | 967 |
| 374 | 1011 |
| 375 | 1309 |
| 376 | 814 |
| 377 | 1033 |
| 378 | 1075 |
| 379 | 1365 |
| 380 | 1112 |
| 381 | 1430 |
| 382 | 1507 |
| 383 | 1921 |
| 384 | 142 |
| 385 | 188 |
| 386 | 213 |
| 387 | 337 |
| 388 | 245 |
| 389 | 358 |
| 390 | 372 |
| 391 | 541 |
| 392 | 273 |
| 393 | 385 |
| 394 | 413 |
| 395 | 571 |
| 396 | 440 |
| 397 | 599 |
| 398 | 617 |
| 399 | 832 |
| 400 | 295 |
| 401 | 417 |
| 402 | 451 |
| 403 | 608 |
| 404 | 477 |
| 405 | 638 |
| 406 | 674 |
| 407 | 877 |
| 408 | 507 |
| 409 | 682 |
| 410 | 708 |
| 411 | 905 |
| 412 | 754 |
| 413 | 955 |
| 414 | 1004 |
| 415 | 1294 |
| 416 | 321 |
| 417 | 457 |
| 418 | 494 |

TABLE Z17-continued with a sequence length of 8192:

| Polarized channel sequence number | Reliability or reliability sequence number |
|---|---|
| 419 | 657 |
| 420 | 518 |
| 421 | 686 |
| 422 | 728 |
| 423 | 938 |
| 424 | 564 |
| 425 | 745 |
| 426 | 778 |
| 427 | 977 |
| 428 | 809 |
| 429 | 1023 |
| 430 | 1060 |
| 431 | 1355 |
| 432 | 615 |
| 433 | 792 |
| 434 | 842 |
| 435 | 1046 |
| 436 | 873 |
| 437 | 1098 |
| 438 | 1138 |
| 439 | 1405 |
| 440 | 925 |
| 441 | 1156 |
| 442 | 1211 |
| 443 | 1474 |
| 444 | 1249 |
| 445 | 1561 |
| 446 | 1685 |
| 447 | 1958 |
| 448 | 325 |
| 449 | 504 |
| 450 | 548 |
| 451 | 733 |
| 452 | 595 |
| 453 | 764 |
| 454 | 801 |
| 455 | 1037 |
| 456 | 627 |
| 457 | 818 |
| 458 | 857 |
| 459 | 1081 |
| 460 | 897 |
| 461 | 1129 |
| 462 | 1172 |
| 463 | 1459 |
| 464 | 670 |
| 465 | 881 |
| 466 | 909 |
| 467 | 1147 |
| 468 | 972 |
| 469 | 1203 |
| 470 | 1241 |
| 471 | 1577 |
| 472 | 997 |
| 473 | 1260 |
| 474 | 1319 |
| 475 | 1616 |
| 476 | 1376 |
| 477 | 1705 |
| 478 | 1759 |
| 479 | 2227 |
| 480 | 725 |
| 481 | 943 |
| 482 | 990 |
| 483 | 1222 |
| 484 | 1053 |
| 485 | 1284 |
| 486 | 1329 |
| 487 | 1638 |
| 488 | 1107 |
| 489 | 1344 |
| 490 | 1420 |
| 491 | 1736 |
| 492 | 1492 |
| 493 | 1788 |

TABLE Z17-continued with a sequence length of 8192:

| Polarized channel sequence number | Reliability or reliability sequence number |
|---|---|
| 494 | 1851 |
| 495 | 2306 |
| 496 | 1165 |
| 497 | 1445 |
| 498 | 1522 |
| 499 | 1818 |
| 500 | 1543 |
| 501 | 1880 |
| 502 | 2004 |
| 503 | 2503 |
| 504 | 1663 |
| 505 | 2052 |
| 506 | 2102 |
| 507 | 2392 |
| 508 | 2160 |
| 509 | 2640 |
| 510 | 2834 |
| 511 | 3174 |
| 512 | 9 |
| 513 | 35 |
| 514 | 55 |
| 515 | 116 |
| 516 | 70 |
| 517 | 135 |
| 518 | 160 |
| 519 | 246 |
| 520 | 83 |
| 521 | 151 |
| 522 | 176 |
| 523 | 264 |
| 524 | 197 |
| 525 | 291 |
| 526 | 301 |
| 527 | 454 |
| 528 | 96 |
| 529 | 167 |
| 530 | 182 |
| 531 | 285 |
| 532 | 217 |
| 533 | 317 |
| 534 | 352 |
| 535 | 471 |
| 536 | 228 |
| 537 | 345 |
| 538 | 331 |
| 539 | 501 |
| 540 | 388 |
| 541 | 528 |
| 542 | 553 |
| 543 | 760 |
| 544 | 106 |
| 545 | 202 |
| 546 | 222 |
| 547 | 327 |
| 548 | 233 |
| 549 | 342 |
| 550 | 364 |
| 551 | 508 |
| 552 | 269 |
| 553 | 378 |
| 554 | 397 |
| 555 | 533 |
| 556 | 427 |
| 557 | 572 |
| 558 | 593 |
| 559 | 804 |
| 560 | 297 |
| 561 | 407 |
| 562 | 446 |
| 563 | 585 |
| 564 | 467 |
| 565 | 616 |
| 566 | 641 |
| 567 | 841 |
| 568 | 496 |

TABLE Z17-continued with a sequence length of 8192:

| Polarized channel sequence number | Reliability or reliability sequence number |
|---|---|
| 569 | 652 |
| 570 | 684 |
| 571 | 890 |
| 572 | 712 |
| 573 | 945 |
| 574 | 996 |
| 575 | 1292 |
| 576 | 143 |
| 577 | 209 |
| 578 | 258 |
| 579 | 375 |
| 580 | 274 |
| 581 | 392 |
| 582 | 423 |
| 583 | 566 |
| 584 | 307 |
| 585 | 450 |
| 586 | 412 |
| 587 | 601 |
| 588 | 479 |
| 589 | 630 |
| 590 | 668 |
| 591 | 861 |
| 592 | 336 |
| 593 | 442 |
| 594 | 488 |
| 595 | 644 |
| 596 | 517 |
| 597 | 676 |
| 598 | 703 |
| 599 | 921 |
| 600 | 545 |
| 601 | 715 |
| 602 | 772 |
| 603 | 957 |
| 604 | 799 |
| 605 | 1027 |
| 606 | 1070 |
| 607 | 1394 |
| 608 | 371 |
| 609 | 505 |
| 610 | 542 |
| 611 | 699 |
| 612 | 581 |
| 613 | 734 |
| 614 | 784 |
| 615 | 1008 |
| 616 | 606 |
| 617 | 789 |
| 618 | 836 |
| 619 | 1041 |
| 620 | 865 |
| 621 | 1101 |
| 622 | 1154 |
| 623 | 1437 |
| 624 | 655 |
| 625 | 849 |
| 626 | 907 |
| 627 | 1117 |
| 628 | 932 |
| 629 | 1163 |
| 630 | 1215 |
| 631 | 1514 |
| 632 | 981 |
| 633 | 1235 |
| 634 | 1270 |
| 635 | 1582 |
| 636 | 1326 |
| 637 | 1644 |
| 638 | 1725 |
| 639 | 2138 |
| 640 | 190 |
| 641 | 252 |
| 642 | 281 |
| 643 | 437 |

TABLE Z17-continued with a sequence length of 8192:

| Polarized channel sequence number | Reliability or reliability sequence number |
|---|---|
| 644 | 322 |
| 645 | 460 |
| 646 | 475 |
| 647 | 658 |
| 648 | 356 |
| 649 | 484 |
| 650 | 521 |
| 651 | 690 |
| 652 | 551 |
| 653 | 731 |
| 654 | 751 |
| 655 | 1006 |
| 656 | 383 |
| 657 | 526 |
| 658 | 563 |
| 659 | 743 |
| 660 | 589 |
| 661 | 775 |
| 662 | 816 |
| 663 | 1056 |
| 664 | 624 |
| 665 | 825 |
| 666 | 853 |
| 667 | 1088 |
| 668 | 912 |
| 669 | 1143 |
| 670 | 1206 |
| 671 | 1499 |
| 672 | 414 |
| 673 | 569 |
| 674 | 610 |
| 675 | 790 |
| 676 | 636 |
| 677 | 830 |
| 678 | 878 |
| 679 | 1128 |
| 680 | 687 |
| 681 | 900 |
| 682 | 940 |
| 683 | 1178 |
| 684 | 975 |
| 685 | 1224 |
| 686 | 1264 |
| 687 | 1568 |
| 688 | 746 |
| 689 | 952 |
| 690 | 1015 |
| 691 | 1248 |
| 692 | 1048 |
| 693 | 1301 |
| 694 | 1347 |
| 695 | 1609 |
| 696 | 1110 |
| 697 | 1363 |
| 698 | 1416 |
| 699 | 1689 |
| 700 | 1463 |
| 701 | 1781 |
| 702 | 1898 |
| 703 | 2177 |
| 704 | 420 |
| 705 | 621 |
| 706 | 672 |
| 707 | 885 |
| 708 | 719 |
| 709 | 924 |
| 710 | 966 |
| 711 | 1245 |
| 712 | 763 |
| 713 | 989 |
| 714 | 1029 |
| 715 | 1281 |
| 716 | 1078 |
| 717 | 1336 |
| 718 | 1383 |

TABLE Z17-continued with a sequence length of 8192:

| Polarized channel sequence number | Reliability or reliability sequence number |
|---|---|
| 719 | 1671 |
| 720 | 813 |
| 721 | 1062 |
| 722 | 1095 |
| 723 | 1358 |
| 724 | 1168 |
| 725 | 1409 |
| 726 | 1452 |
| 727 | 1802 |
| 728 | 1197 |
| 729 | 1471 |
| 730 | 1528 |
| 731 | 1828 |
| 732 | 1595 |
| 733 | 1917 |
| 734 | 1977 |
| 735 | 2442 |
| 736 | 874 |
| 737 | 1136 |
| 738 | 1186 |
| 739 | 1426 |
| 740 | 1253 |
| 741 | 1488 |
| 742 | 1535 |
| 743 | 1847 |
| 744 | 1312 |
| 745 | 1552 |
| 746 | 1626 |
| 747 | 1946 |
| 748 | 1711 |
| 749 | 1996 |
| 750 | 2064 |
| 751 | 2524 |
| 752 | 1372 |
| 753 | 1657 |
| 754 | 1745 |
| 755 | 2030 |
| 756 | 1765 |
| 757 | 2109 |
| 758 | 2219 |
| 759 | 2704 |
| 760 | 1869 |
| 761 | 2269 |
| 762 | 2323 |
| 763 | 2604 |
| 764 | 2381 |
| 765 | 2848 |
| 766 | 3027 |
| 767 | 3359 |
| 768 | 125 |
| 769 | 241 |
| 770 | 311 |
| 771 | 492 |
| 772 | 361 |
| 773 | 513 |
| 774 | 578 |
| 775 | 767 |
| 776 | 403 |
| 777 | 557 |
| 778 | 613 |
| 779 | 808 |
| 780 | 664 |
| 781 | 869 |
| 782 | 895 |
| 783 | 1193 |
| 784 | 433 |
| 785 | 597 |
| 786 | 634 |
| 787 | 858 |
| 788 | 707 |
| 789 | 916 |
| 790 | 992 |
| 791 | 1218 |
| 792 | 738 |
| 793 | 982 |

TABLE Z17-continued with a sequence length of 8192:

| Polarized channel sequence number | Reliability or reliability sequence number |
|---|---|
| 794 | 951 |
| 795 | 1288 |
| 796 | 1064 |
| 797 | 1340 |
| 798 | 1387 |
| 799 | 1729 |
| 800 | 462 |
| 801 | 680 |
| 802 | 724 |
| 803 | 936 |
| 804 | 755 |
| 805 | 970 |
| 806 | 1014 |
| 807 | 1305 |
| 808 | 820 |
| 809 | 1042 |
| 810 | 1084 |
| 811 | 1351 |
| 812 | 1142 |
| 813 | 1424 |
| 814 | 1456 |
| 815 | 1807 |
| 816 | 884 |
| 817 | 1092 |
| 818 | 1175 |
| 819 | 1441 |
| 820 | 1210 |
| 821 | 1495 |
| 822 | 1539 |
| 823 | 1862 |
| 824 | 1277 |
| 825 | 1557 |
| 826 | 1613 |
| 827 | 1940 |
| 828 | 1653 |
| 829 | 2026 |
| 830 | 2094 |
| 831 | 2557 |
| 832 | 536 |
| 833 | 695 |
| 834 | 796 |
| 835 | 1034 |
| 836 | 834 |
| 837 | 1074 |
| 838 | 1133 |
| 839 | 1401 |
| 840 | 901 |
| 841 | 1185 |
| 842 | 1103 |
| 843 | 1467 |
| 844 | 1239 |
| 845 | 1518 |
| 846 | 1586 |
| 847 | 1892 |
| 848 | 962 |
| 849 | 1160 |
| 850 | 1267 |
| 851 | 1547 |
| 852 | 1316 |
| 853 | 1605 |
| 854 | 1648 |
| 855 | 1984 |
| 856 | 1368 |
| 857 | 1667 |
| 858 | 1750 |
| 859 | 2045 |
| 860 | 1795 |
| 861 | 2145 |
| 862 | 2210 |
| 863 | 2718 |
| 864 | 1022 |
| 865 | 1298 |
| 866 | 1361 |
| 867 | 1634 |
| 868 | 1433 |

TABLE Z17-continued with a sequence length of 8192:

| Polarized channel sequence number | Reliability or reliability sequence number |
|---|---|
| 869 | 1696 |
| 870 | 1769 |
| 871 | 2124 |
| 872 | 1481 |
| 873 | 1776 |
| 874 | 1857 |
| 875 | 2169 |
| 876 | 1902 |
| 877 | 2262 |
| 878 | 2343 |
| 879 | 2774 |
| 880 | 1564 |
| 881 | 1876 |
| 882 | 1965 |
| 883 | 2286 |
| 884 | 2011 |
| 885 | 2352 |
| 886 | 2433 |
| 887 | 2897 |
| 888 | 2079 |
| 889 | 2459 |
| 890 | 2536 |
| 891 | 2985 |
| 892 | 2592 |
| 893 | 3085 |
| 894 | 3225 |
| 895 | 3832 |
| 896 | 648 |
| 897 | 780 |
| 898 | 845 |
| 899 | 1150 |
| 900 | 928 |
| 901 | 1199 |
| 902 | 1228 |
| 903 | 1573 |
| 904 | 1000 |
| 905 | 1257 |
| 906 | 1322 |
| 907 | 1630 |
| 908 | 1379 |
| 909 | 1681 |
| 910 | 1719 |
| 911 | 2117 |
| 912 | 1051 |
| 913 | 1333 |
| 914 | 1398 |
| 915 | 1699 |
| 916 | 1448 |
| 917 | 1755 |
| 918 | 1824 |
| 919 | 2195 |
| 920 | 1510 |
| 921 | 1835 |
| 922 | 1886 |
| 923 | 2243 |
| 924 | 1973 |
| 925 | 2332 |
| 926 | 2421 |
| 927 | 2883 |
| 928 | 1115 |
| 929 | 1412 |
| 930 | 1484 |
| 931 | 1791 |
| 932 | 1532 |
| 933 | 1840 |
| 934 | 1928 |
| 935 | 2295 |
| 936 | 1620 |
| 937 | 1954 |
| 938 | 2018 |
| 939 | 2372 |
| 940 | 2072 |
| 941 | 2453 |
| 942 | 2512 |
| 943 | 2971 |
| 944 | 1715 |
| 945 | 2038 |
| 946 | 2130 |
| 947 | 2480 |
| 948 | 2187 |
| 949 | 2568 |
| 950 | 2628 |
| 951 | 3047 |
| 952 | 2278 |
| 953 | 2666 |
| 954 | 2747 |
| 955 | 3149 |
| 956 | 2803 |
| 957 | 3300 |
| 958 | 3484 |
| 959 | 3888 |
| 960 | 1124 |
| 961 | 1503 |
| 962 | 1591 |
| 963 | 1936 |
| 964 | 1678 |
| 965 | 1992 |
| 966 | 2060 |
| 967 | 2471 |
| 968 | 1739 |
| 969 | 2087 |
| 970 | 2153 |
| 971 | 2548 |
| 972 | 2234 |
| 973 | 2616 |
| 974 | 2692 |
| 975 | 3129 |
| 976 | 1814 |
| 977 | 2203 |
| 978 | 2251 |
| 979 | 2654 |
| 980 | 2364 |
| 981 | 2730 |
| 982 | 2787 |
| 983 | 3331 |
| 984 | 2413 |
| 985 | 2817 |
| 986 | 2915 |
| 987 | 3387 |
| 988 | 3005 |
| 989 | 3524 |
| 990 | 3596 |
| 991 | 4244 |
| 992 | 1910 |
| 993 | 2315 |
| 994 | 2401 |
| 995 | 2760 |
| 996 | 2491 |
| 997 | 2866 |
| 998 | 2934 |
| 999 | 3420 |
| 1000 | 2580 |
| 1001 | 2952 |
| 1002 | 3065 |
| 1003 | 3560 |
| 1004 | 3199 |
| 1005 | 3639 |
| 1006 | 3730 |
| 1007 | 4347 |
| 1008 | 2678 |
| 1009 | 3109 |
| 1010 | 3247 |
| 1011 | 3683 |
| 1012 | 3272 |
| 1013 | 3776 |
| 1014 | 3946 |
| 1015 | 4599 |
| 1016 | 3454 |
| 1017 | 4014 |
| 1018 | 4085 |

TABLE Z17-continued with a sequence length of 8192:

| Polarized channel sequence number | Reliability or reliability sequence number |
|---|---|
| 1019 | 4458 |
| 1020 | 4162 |
| 1021 | 4770 |
| 1022 | 5021 |
| 1023 | 5420 |
| 1024 | 10 |
| 1025 | 41 |
| 1026 | 68 |
| 1027 | 149 |
| 1028 | 88 |
| 1029 | 184 |
| 1030 | 216 |
| 1031 | 324 |
| 1032 | 105 |
| 1033 | 207 |
| 1034 | 235 |
| 1035 | 346 |
| 1036 | 262 |
| 1037 | 386 |
| 1038 | 398 |
| 1039 | 591 |
| 1040 | 121 |
| 1041 | 226 |
| 1042 | 244 |
| 1043 | 379 |
| 1044 | 287 |
| 1045 | 418 |
| 1046 | 459 |
| 1047 | 614 |
| 1048 | 302 |
| 1049 | 453 |
| 1050 | 435 |
| 1051 | 647 |
| 1052 | 509 |
| 1053 | 683 |
| 1054 | 714 |
| 1055 | 953 |
| 1056 | 137 |
| 1057 | 270 |
| 1058 | 294 |
| 1059 | 431 |
| 1060 | 310 |
| 1061 | 448 |
| 1062 | 482 |
| 1063 | 660 |
| 1064 | 354 |
| 1065 | 497 |
| 1066 | 519 |
| 1067 | 688 |
| 1068 | 559 |
| 1069 | 739 |
| 1070 | 762 |
| 1071 | 1005 |
| 1072 | 393 |
| 1073 | 529 |
| 1074 | 580 |
| 1075 | 752 |
| 1076 | 609 |
| 1077 | 791 |
| 1078 | 819 |
| 1079 | 1047 |
| 1080 | 642 |
| 1081 | 835 |
| 1082 | 870 |
| 1083 | 1102 |
| 1084 | 904 |
| 1085 | 1159 |
| 1086 | 1216 |
| 1087 | 1546 |
| 1088 | 196 |
| 1089 | 280 |
| 1090 | 340 |
| 1091 | 493 |
| 1092 | 360 |
| 1093 | 514 |

TABLE Z17-continued with a sequence length of 8192:

| Polarized channel sequence number | Reliability or reliability sequence number |
|---|---|
| 1094 | 555 |
| 1095 | 727 |
| 1096 | 405 |
| 1097 | 586 |
| 1098 | 534 |
| 1099 | 774 |
| 1100 | 623 |
| 1101 | 807 |
| 1102 | 852 |
| 1103 | 1069 |
| 1104 | 441 |
| 1105 | 575 |
| 1106 | 632 |
| 1107 | 824 |
| 1108 | 669 |
| 1109 | 864 |
| 1110 | 894 |
| 1111 | 1134 |
| 1112 | 706 |
| 1113 | 906 |
| 1114 | 968 |
| 1115 | 1173 |
| 1116 | 999 |
| 1117 | 1247 |
| 1118 | 1296 |
| 1119 | 1661 |
| 1120 | 487 |
| 1121 | 651 |
| 1122 | 700 |
| 1123 | 891 |
| 1124 | 748 |
| 1125 | 926 |
| 1126 | 984 |
| 1127 | 1230 |
| 1128 | 779 |
| 1129 | 986 |
| 1130 | 1043 |
| 1131 | 1261 |
| 1132 | 1071 |
| 1133 | 1328 |
| 1134 | 1392 |
| 1135 | 1712 |
| 1136 | 840 |
| 1137 | 1055 |
| 1138 | 1120 |
| 1139 | 1349 |
| 1140 | 1148 |
| 1141 | 1403 |
| 1142 | 1462 |
| 1143 | 1805 |
| 1144 | 1198 |
| 1145 | 1478 |
| 1146 | 1524 |
| 1147 | 1878 |
| 1148 | 1585 |
| 1149 | 1949 |
| 1150 | 2047 |
| 1151 | 2489 |
| 1152 | 253 |
| 1153 | 332 |
| 1154 | 374 |
| 1155 | 570 |
| 1156 | 424 |
| 1157 | 594 |
| 1158 | 620 |
| 1159 | 843 |
| 1160 | 465 |
| 1161 | 628 |
| 1162 | 675 |
| 1163 | 880 |
| 1164 | 709 |
| 1165 | 922 |
| 1166 | 946 |
| 1167 | 1227 |
| 1168 | 503 |

TABLE Z17-continued with a sequence length of 8192:

| Polarized channel sequence number | Reliability or reliability sequence number |
|---|---|
| 1169 | 678 |
| 1170 | 722 |
| 1171 | 934 |
| 1172 | 756 |
| 1173 | 971 |
| 1174 | 1018 |
| 1175 | 1282 |
| 1176 | 798 |
| 1177 | 1028 |
| 1178 | 1057 |
| 1179 | 1313 |
| 1180 | 1123 |
| 1181 | 1382 |
| 1182 | 1451 |
| 1183 | 1785 |
| 1184 | 540 |
| 1185 | 732 |
| 1186 | 783 |
| 1187 | 991 |
| 1188 | 815 |
| 1189 | 1032 |
| 1190 | 1085 |
| 1191 | 1360 |
| 1192 | 875 |
| 1193 | 1108 |
| 1194 | 1155 |
| 1195 | 1417 |
| 1196 | 1191 |
| 1197 | 1469 |
| 1198 | 1513 |
| 1199 | 1866 |
| 1200 | 941 |
| 1201 | 1169 |
| 1202 | 1240 |
| 1203 | 1498 |
| 1204 | 1272 |
| 1205 | 1556 |
| 1206 | 1606 |
| 1207 | 1912 |
| 1208 | 1339 |
| 1209 | 1628 |
| 1210 | 1692 |
| 1211 | 2005 |
| 1212 | 1742 |
| 1213 | 2112 |
| 1214 | 2240 |
| 1215 | 2527 |
| 1216 | 550 |
| 1217 | 793 |
| 1218 | 854 |
| 1219 | 1097 |
| 1220 | 915 |
| 1221 | 1137 |
| 1222 | 1182 |
| 1223 | 1490 |
| 1224 | 956 |
| 1225 | 1205 |
| 1226 | 1255 |
| 1227 | 1534 |
| 1228 | 1304 |
| 1229 | 1596 |
| 1230 | 1651 |
| 1231 | 1982 |
| 1232 | 1013 |
| 1233 | 1286 |
| 1234 | 1324 |
| 1235 | 1619 |
| 1236 | 1406 |
| 1237 | 1679 |
| 1238 | 1732 |
| 1239 | 2133 |
| 1240 | 1440 |
| 1241 | 1756 |
| 1242 | 1815 |
| 1243 | 2163 |

TABLE Z17-continued with a sequence length of 8192:

| Polarized channel sequence number | Reliability or reliability sequence number |
|---|---|
| 1244 | 1896 |
| 1245 | 2260 |
| 1246 | 2321 |
| 1247 | 2783 |
| 1248 | 1083 |
| 1249 | 1371 |
| 1250 | 1428 |
| 1251 | 1702 |
| 1252 | 1502 |
| 1253 | 1772 |
| 1254 | 1827 |
| 1255 | 2184 |
| 1256 | 1567 |
| 1257 | 1848 |
| 1258 | 1930 |
| 1259 | 2289 |
| 1260 | 2023 |
| 1261 | 2346 |
| 1262 | 2416 |
| 1263 | 2863 |
| 1264 | 1641 |
| 1265 | 1970 |
| 1266 | 2067 |
| 1267 | 2378 |
| 1268 | 2090 |
| 1269 | 2455 |
| 1270 | 2571 |
| 1271 | 3042 |
| 1272 | 2208 |
| 1273 | 2613 |
| 1274 | 2663 |
| 1275 | 2948 |
| 1276 | 2727 |
| 1277 | 3188 |
| 1278 | 3367 |
| 1279 | 3678 |
| 1280 | 162 |
| 1281 | 318 |
| 1282 | 411 |
| 1283 | 637 |
| 1284 | 476 |
| 1285 | 665 |
| 1286 | 744 |
| 1287 | 964 |
| 1288 | 525 |
| 1289 | 718 |
| 1290 | 787 |
| 1291 | 1010 |
| 1292 | 848 |
| 1293 | 1080 |
| 1294 | 1105 |
| 1295 | 1432 |
| 1296 | 565 |
| 1297 | 766 |
| 1298 | 810 |
| 1299 | 1066 |
| 1300 | 899 |
| 1301 | 1125 |
| 1302 | 1213 |
| 1303 | 1466 |
| 1304 | 930 |
| 1305 | 1201 |
| 1306 | 1167 |
| 1307 | 1538 |
| 1308 | 1289 |
| 1309 | 1600 |
| 1310 | 1655 |
| 1311 | 2054 |
| 1312 | 600 |
| 1313 | 868 |
| 1314 | 917 |
| 1315 | 1151 |
| 1316 | 949 |
| 1317 | 1188 |
| 1318 | 1233 |

TABLE Z17-continued with a sequence length of 8192:

| Polarized channel sequence number | Reliability or reliability sequence number |
|---|---|
| 1319 | 1559 |
| 1320 | 1025 |
| 1321 | 1269 |
| 1322 | 1310 |
| 1323 | 1610 |
| 1324 | 1378 |
| 1325 | 1698 |
| 1326 | 1738 |
| 1327 | 2141 |
| 1328 | 1090 |
| 1329 | 1321 |
| 1330 | 1414 |
| 1331 | 1721 |
| 1332 | 1454 |
| 1333 | 1778 |
| 1334 | 1833 |
| 1335 | 2201 |
| 1336 | 1530 |
| 1337 | 1853 |
| 1338 | 1914 |
| 1339 | 2281 |
| 1340 | 1964 |
| 1341 | 2369 |
| 1342 | 2448 |
| 1343 | 2900 |
| 1344 | 693 |
| 1345 | 883 |
| 1346 | 994 |
| 1347 | 1259 |
| 1348 | 1036 |
| 1349 | 1300 |
| 1350 | 1367 |
| 1351 | 1674 |
| 1352 | 1116 |
| 1353 | 1421 |
| 1354 | 1335 |
| 1355 | 1749 |
| 1356 | 1487 |
| 1357 | 1809 |
| 1358 | 1885 |
| 1359 | 2233 |
| 1360 | 1180 |
| 1361 | 1395 |
| 1362 | 1520 |
| 1363 | 1841 |
| 1364 | 1571 |
| 1365 | 1905 |
| 1366 | 1956 |
| 1367 | 2329 |
| 1368 | 1633 |
| 1369 | 1974 |
| 1370 | 2075 |
| 1371 | 2398 |
| 1372 | 2127 |
| 1373 | 2497 |
| 1374 | 2562 |
| 1375 | 3058 |
| 1376 | 1243 |
| 1377 | 1549 |
| 1378 | 1623 |
| 1379 | 1945 |
| 1380 | 1708 |
| 1381 | 2008 |
| 1382 | 2097 |
| 1383 | 2474 |
| 1384 | 1762 |
| 1385 | 2105 |
| 1386 | 2192 |
| 1387 | 2518 |
| 1388 | 2248 |
| 1389 | 2607 |
| 1390 | 2686 |
| 1391 | 3121 |
| 1392 | 1860 |
| 1393 | 2216 |

TABLE Z17-continued with a sequence length of 8192:

| Polarized channel sequence number | Reliability or reliability sequence number |
|---|---|
| 1394 | 2303 |
| 1395 | 2634 |
| 1396 | 2355 |
| 1397 | 2698 |
| 1398 | 2770 |
| 1399 | 3238 |
| 1400 | 2430 |
| 1401 | 2808 |
| 1402 | 2877 |
| 1403 | 3326 |
| 1404 | 2937 |
| 1405 | 3429 |
| 1406 | 3543 |
| 1407 | 4133 |
| 1408 | 828 |
| 1409 | 976 |
| 1410 | 1050 |
| 1411 | 1388 |
| 1412 | 1141 |
| 1413 | 1443 |
| 1414 | 1477 |
| 1415 | 1870 |
| 1416 | 1219 |
| 1417 | 1509 |
| 1418 | 1578 |
| 1419 | 1937 |
| 1420 | 1643 |
| 1421 | 1999 |
| 1422 | 2039 |
| 1423 | 2462 |
| 1424 | 1276 |
| 1425 | 1588 |
| 1426 | 1669 |
| 1427 | 2016 |
| 1428 | 1728 |
| 1429 | 2082 |
| 1430 | 2156 |
| 1431 | 2542 |
| 1432 | 1798 |
| 1433 | 2171 |
| 1434 | 2224 |
| 1435 | 2589 |
| 1436 | 2312 |
| 1437 | 2675 |
| 1438 | 2757 |
| 1439 | 3216 |
| 1440 | 1341 |
| 1441 | 1684 |
| 1442 | 1768 |
| 1443 | 2120 |
| 1444 | 1822 |
| 1445 | 2180 |
| 1446 | 2265 |
| 1447 | 2648 |
| 1448 | 1924 |
| 1449 | 2298 |
| 1450 | 2361 |
| 1451 | 2713 |
| 1452 | 2424 |
| 1453 | 2794 |
| 1454 | 2852 |
| 1455 | 3309 |
| 1456 | 2033 |
| 1457 | 2389 |
| 1458 | 2483 |
| 1459 | 2828 |
| 1460 | 2533 |
| 1461 | 2912 |
| 1462 | 2977 |
| 1463 | 3392 |
| 1464 | 2625 |
| 1465 | 3008 |
| 1466 | 3093 |
| 1467 | 3498 |
| 1468 | 3154 |

TABLE Z17-continued with a sequence length of 8192:

| Polarized channel sequence number | Reliability or reliability sequence number |
|---|---|
| 1469 | 3624 |
| 1470 | 3807 |
| 1471 | 4184 |
| 1472 | 1352 |
| 1473 | 1789 |
| 1474 | 1889 |
| 1475 | 2272 |
| 1476 | 1989 |
| 1477 | 2338 |
| 1478 | 2407 |
| 1479 | 2814 |
| 1480 | 2057 |
| 1481 | 2439 |
| 1482 | 2506 |
| 1483 | 2886 |
| 1484 | 2577 |
| 1485 | 2963 |
| 1486 | 3031 |
| 1487 | 3473 |
| 1488 | 2148 |
| 1489 | 2551 |
| 1490 | 2598 |
| 1491 | 2993 |
| 1492 | 2707 |
| 1493 | 3078 |
| 1494 | 3138 |
| 1495 | 3650 |
| 1496 | 2750 |
| 1497 | 3166 |
| 1498 | 3255 |
| 1499 | 3706 |
| 1500 | 3345 |
| 1501 | 3838 |
| 1502 | 3914 |
| 1503 | 4512 |
| 1504 | 2257 |
| 1505 | 2657 |
| 1506 | 2736 |
| 1507 | 3104 |
| 1508 | 2842 |
| 1509 | 3205 |
| 1510 | 3269 |
| 1511 | 3742 |
| 1512 | 2926 |
| 1513 | 3291 |
| 1514 | 3410 |
| 1515 | 3875 |
| 1516 | 3518 |
| 1517 | 3954 |
| 1518 | 4042 |
| 1519 | 4610 |
| 1520 | 3019 |
| 1521 | 3448 |
| 1522 | 3571 |
| 1523 | 3994 |
| 1524 | 3602 |
| 1525 | 4079 |
| 1526 | 4236 |
| 1527 | 4840 |
| 1528 | 3770 |
| 1529 | 4298 |
| 1530 | 4364 |
| 1531 | 4701 |
| 1532 | 4431 |
| 1533 | 4992 |
| 1534 | 5218 |
| 1535 | 5595 |
| 1536 | 174 |
| 1537 | 366 |
| 1538 | 470 |
| 1539 | 736 |
| 1540 | 544 |
| 1541 | 802 |
| 1542 | 886 |
| 1543 | 1146 |

TABLE Z17-continued with a sequence length of 8192:

| Polarized channel sequence number | Reliability or reliability sequence number |
|---|---|
| 1544 | 605 |
| 1545 | 859 |
| 1546 | 937 |
| 1547 | 1194 |
| 1548 | 1001 |
| 1549 | 1265 |
| 1550 | 1293 |
| 1551 | 1675 |
| 1552 | 656 |
| 1553 | 910 |
| 1554 | 961 |
| 1555 | 1252 |
| 1556 | 1061 |
| 1557 | 1332 |
| 1558 | 1425 |
| 1559 | 1716 |
| 1560 | 1094 |
| 1561 | 1410 |
| 1562 | 1374 |
| 1563 | 1782 |
| 1564 | 1517 |
| 1565 | 1844 |
| 1566 | 1901 |
| 1567 | 2326 |
| 1568 | 696 |
| 1569 | 1020 |
| 1570 | 1076 |
| 1571 | 1356 |
| 1572 | 1111 |
| 1573 | 1399 |
| 1574 | 1458 |
| 1575 | 1801 |
| 1576 | 1207 |
| 1577 | 1494 |
| 1578 | 1542 |
| 1579 | 1856 |
| 1580 | 1614 |
| 1581 | 1942 |
| 1582 | 1987 |
| 1583 | 2410 |
| 1584 | 1279 |
| 1585 | 1563 |
| 1586 | 1658 |
| 1587 | 1968 |
| 1588 | 1706 |
| 1589 | 2035 |
| 1590 | 2084 |
| 1591 | 2477 |
| 1592 | 1775 |
| 1593 | 2106 |
| 1594 | 2174 |
| 1595 | 2565 |
| 1596 | 2230 |
| 1597 | 2660 |
| 1598 | 2744 |
| 1599 | 3213 |
| 1600 | 831 |
| 1601 | 1039 |
| 1602 | 1176 |
| 1603 | 1483 |
| 1604 | 1223 |
| 1605 | 1527 |
| 1606 | 1602 |
| 1607 | 1926 |
| 1608 | 1307 |
| 1609 | 1665 |
| 1610 | 1575 |
| 1611 | 2001 |
| 1612 | 1733 |
| 1613 | 2062 |
| 1614 | 2142 |
| 1615 | 2515 |
| 1616 | 1384 |
| 1617 | 1647 |
| 1618 | 1752 |

TABLE Z17-continued with a sequence length of 8192:

| Polarized channel sequence number | Reliability or reliability sequence number |
|---|---|
| 1619 | 2091 |
| 1620 | 1820 |
| 1621 | 2159 |
| 1622 | 2213 |
| 1623 | 2619 |
| 1624 | 1882 |
| 1625 | 2237 |
| 1626 | 2349 |
| 1627 | 2681 |
| 1628 | 2404 |
| 1629 | 2797 |
| 1630 | 2869 |
| 1631 | 3373 |
| 1632 | 1473 |
| 1633 | 1794 |
| 1634 | 1873 |
| 1635 | 2205 |
| 1636 | 1961 |
| 1637 | 2275 |
| 1638 | 2375 |
| 1639 | 2767 |
| 1640 | 2014 |
| 1641 | 2384 |
| 1642 | 2468 |
| 1643 | 2820 |
| 1644 | 2521 |
| 1645 | 2920 |
| 1646 | 3000 |
| 1647 | 3440 |
| 1648 | 2115 |
| 1649 | 2494 |
| 1650 | 2595 |
| 1651 | 2945 |
| 1652 | 2637 |
| 1653 | 3016 |
| 1654 | 3098 |
| 1655 | 3554 |
| 1656 | 2721 |
| 1657 | 3126 |
| 1658 | 3183 |
| 1659 | 3655 |
| 1660 | 3264 |
| 1661 | 3747 |
| 1662 | 3863 |
| 1663 | 4406 |
| 1664 | 979 |
| 1665 | 1161 |
| 1666 | 1236 |
| 1667 | 1637 |
| 1668 | 1345 |
| 1669 | 1688 |
| 1670 | 1723 |
| 1671 | 2123 |
| 1672 | 1436 |
| 1673 | 1746 |
| 1674 | 1831 |
| 1675 | 2189 |
| 1676 | 1894 |
| 1677 | 2268 |
| 1678 | 2309 |
| 1679 | 2763 |
| 1680 | 1505 |
| 1681 | 1837 |
| 1682 | 1918 |
| 1683 | 2292 |
| 1684 | 1980 |
| 1685 | 2358 |
| 1686 | 2436 |
| 1687 | 2845 |
| 1688 | 2050 |
| 1689 | 2450 |
| 1690 | 2500 |
| 1691 | 2894 |
| 1692 | 2601 |
| 1693 | 2988 |

TABLE Z17-continued with a sequence length of 8192:

| Polarized channel sequence number | Reliability or reliability sequence number |
|---|---|
| 1694 | 3081 |
| 1695 | 3534 |
| 1696 | 1581 |
| 1697 | 1933 |
| 1698 | 2020 |
| 1699 | 2387 |
| 1700 | 2078 |
| 1701 | 2456 |
| 1702 | 2545 |
| 1703 | 2960 |
| 1704 | 2181 |
| 1705 | 2583 |
| 1706 | 2651 |
| 1707 | 3039 |
| 1708 | 2710 |
| 1709 | 3113 |
| 1710 | 3171 |
| 1711 | 3635 |
| 1712 | 2301 |
| 1713 | 2672 |
| 1714 | 2780 |
| 1715 | 3146 |
| 1716 | 2831 |
| 1717 | 3230 |
| 1718 | 3295 |
| 1719 | 3695 |
| 1720 | 2931 |
| 1721 | 3322 |
| 1722 | 3406 |
| 1723 | 3812 |
| 1724 | 3479 |
| 1725 | 3940 |
| 1726 | 4105 |
| 1727 | 4450 |
| 1728 | 1592 |
| 1729 | 2042 |
| 1730 | 2151 |
| 1731 | 2559 |
| 1732 | 2245 |
| 1733 | 2622 |
| 1734 | 2695 |
| 1735 | 3141 |
| 1736 | 2335 |
| 1737 | 2733 |
| 1738 | 2800 |
| 1739 | 3196 |
| 1740 | 2880 |
| 1741 | 3281 |
| 1742 | 3354 |
| 1743 | 3789 |
| 1744 | 2427 |
| 1745 | 2855 |
| 1746 | 2908 |
| 1747 | 3314 |
| 1748 | 3023 |
| 1749 | 3395 |
| 1750 | 3463 |
| 1751 | 3974 |
| 1752 | 3070 |
| 1753 | 3493 |
| 1754 | 3574 |
| 1755 | 4008 |
| 1756 | 3672 |
| 1757 | 4127 |
| 1758 | 4206 |
| 1759 | 4758 |
| 1760 | 2539 |
| 1761 | 2974 |
| 1762 | 3053 |
| 1763 | 3424 |
| 1764 | 3158 |
| 1765 | 3513 |
| 1766 | 3585 |
| 1767 | 4036 |
| 1768 | 3242 |

TABLE Z17-continued with a sequence length of 8192:

| Polarized channel sequence number | Reliability or reliability sequence number |
|---|---|
| 1769 | 3613 |
| 1770 | 3719 |
| 1771 | 4168 |
| 1772 | 3843 |
| 1773 | 4228 |
| 1774 | 4315 |
| 1775 | 4864 |
| 1776 | 3340 |
| 1777 | 3765 |
| 1778 | 3894 |
| 1779 | 4274 |
| 1780 | 3920 |
| 1781 | 4372 |
| 1782 | 4503 |
| 1783 | 5079 |
| 1784 | 4065 |
| 1785 | 4559 |
| 1786 | 4630 |
| 1787 | 4952 |
| 1788 | 4692 |
| 1789 | 5234 |
| 1790 | 5440 |
| 1791 | 5776 |
| 1792 | 770 |
| 1793 | 1130 |
| 1794 | 1317 |
| 1795 | 1763 |
| 1796 | 1447 |
| 1797 | 1811 |
| 1798 | 1952 |
| 1799 | 2341 |
| 1800 | 1553 |
| 1801 | 1908 |
| 1802 | 2027 |
| 1803 | 2418 |
| 1804 | 2135 |
| 1805 | 2530 |
| 1806 | 2574 |
| 1807 | 3062 |
| 1808 | 1624 |
| 1809 | 1995 |
| 1810 | 2069 |
| 1811 | 2509 |
| 1812 | 2222 |
| 1813 | 2610 |
| 1814 | 2740 |
| 1815 | 3101 |
| 1816 | 2284 |
| 1817 | 2724 |
| 1818 | 2669 |
| 1819 | 3208 |
| 1820 | 2859 |
| 1821 | 3286 |
| 1822 | 3364 |
| 1823 | 3869 |
| 1824 | 1694 |
| 1825 | 2166 |
| 1826 | 2254 |
| 1827 | 2645 |
| 1828 | 2318 |
| 1829 | 2701 |
| 1830 | 2777 |
| 1831 | 3233 |
| 1832 | 2445 |
| 1833 | 2823 |
| 1834 | 2891 |
| 1835 | 3303 |
| 1836 | 2982 |
| 1837 | 3415 |
| 1838 | 3468 |
| 1839 | 3980 |
| 1840 | 2554 |
| 1841 | 2905 |
| 1842 | 3034 |
| 1843 | 3443 |

TABLE Z17-continued with a sequence length of 8192:

| Polarized channel sequence number | Reliability or reliability sequence number |
|---|---|
| 1844 | 3090 |
| 1845 | 3529 |
| 1846 | 3591 |
| 1847 | 4056 |
| 1848 | 3191 |
| 1849 | 3618 |
| 1850 | 3700 |
| 1851 | 4154 |
| 1852 | 3759 |
| 1853 | 4266 |
| 1854 | 4356 |
| 1855 | 4902 |
| 1856 | 1864 |
| 1857 | 2198 |
| 1858 | 2395 |
| 1859 | 2811 |
| 1860 | 2465 |
| 1861 | 2872 |
| 1862 | 2966 |
| 1863 | 3381 |
| 1864 | 2586 |
| 1865 | 3050 |
| 1866 | 2923 |
| 1867 | 3488 |
| 1868 | 3133 |
| 1869 | 3565 |
| 1870 | 3661 |
| 1871 | 4097 |
| 1872 | 2689 |
| 1873 | 3011 |
| 1874 | 3179 |
| 1875 | 3607 |
| 1876 | 3250 |
| 1877 | 3689 |
| 1878 | 3753 |
| 1879 | 4214 |
| 1880 | 3336 |
| 1881 | 3782 |
| 1882 | 3900 |
| 1883 | 4290 |
| 1884 | 3967 |
| 1885 | 4414 |
| 1886 | 4494 |
| 1887 | 5091 |
| 1888 | 2791 |
| 1889 | 3221 |
| 1890 | 3317 |
| 1891 | 3736 |
| 1892 | 3434 |
| 1893 | 3818 |
| 1894 | 3926 |
| 1895 | 4389 |
| 1896 | 3504 |
| 1897 | 3934 |
| 1898 | 4050 |
| 1899 | 4439 |
| 1900 | 4111 |
| 1901 | 4551 |
| 1902 | 4650 |
| 1903 | 5153 |
| 1904 | 3629 |
| 1905 | 4071 |
| 1906 | 4192 |
| 1907 | 4579 |
| 1908 | 4252 |
| 1909 | 4661 |
| 1910 | 4747 |
| 1911 | 5288 |
| 1912 | 4331 |
| 1913 | 4791 |
| 1914 | 4875 |
| 1915 | 5378 |
| 1916 | 4940 |
| 1917 | 5504 |
| 1918 | 5644 |

TABLE Z17-continued with a sequence length of 8192:

| Polarized channel sequence number | Reliability or reliability sequence number |
|---|---|
| 1919 | 6216 |
| 1920 | 2099 |
| 1921 | 2366 |
| 1922 | 2486 |
| 1923 | 2997 |
| 1924 | 2631 |
| 1925 | 3073 |
| 1926 | 3118 |
| 1927 | 3644 |
| 1928 | 2753 |
| 1929 | 3163 |
| 1930 | 3261 |
| 1931 | 3725 |
| 1932 | 3350 |
| 1933 | 3801 |
| 1934 | 3857 |
| 1935 | 4381 |
| 1936 | 2837 |
| 1937 | 3278 |
| 1938 | 3378 |
| 1939 | 3826 |
| 1940 | 3459 |
| 1941 | 3908 |
| 1942 | 4000 |
| 1943 | 4475 |
| 1944 | 3549 |
| 1945 | 4022 |
| 1946 | 4093 |
| 1947 | 4531 |
| 1948 | 4198 |
| 1949 | 4639 |
| 1950 | 4736 |
| 1951 | 5269 |
| 1952 | 2940 |
| 1953 | 3401 |
| 1954 | 3507 |
| 1955 | 3960 |
| 1956 | 3580 |
| 1957 | 4028 |
| 1958 | 4140 |
| 1959 | 4590 |
| 1960 | 3711 |
| 1961 | 4176 |
| 1962 | 4258 |
| 1963 | 4681 |
| 1964 | 4323 |
| 1965 | 4779 |
| 1966 | 4852 |
| 1967 | 5362 |
| 1968 | 3849 |
| 1969 | 4282 |
| 1970 | 4397 |
| 1971 | 4814 |
| 1972 | 4467 |
| 1973 | 4914 |
| 1974 | 4979 |
| 1975 | 5460 |
| 1976 | 4570 |
| 1977 | 5034 |
| 1978 | 5122 |
| 1979 | 5571 |
| 1980 | 5184 |
| 1981 | 5721 |
| 1982 | 5901 |
| 1983 | 6268 |
| 1984 | 2956 |
| 1985 | 3538 |
| 1986 | 3667 |
| 1987 | 4146 |
| 1988 | 3795 |
| 1989 | 4222 |
| 1990 | 4306 |
| 1991 | 4802 |
| 1992 | 3880 |
| 1993 | 4339 |

TABLE Z17-continued with a sequence length of 8192:

| Polarized channel sequence number | Reliability or reliability sequence number |
|---|---|
| 1994 | 4422 |
| 1995 | 4887 |
| 1996 | 4522 |
| 1997 | 4965 |
| 1998 | 5064 |
| 1999 | 5547 |
| 2000 | 3988 |
| 2001 | 4486 |
| 2002 | 4540 |
| 2003 | 5006 |
| 2004 | 4670 |
| 2005 | 5107 |
| 2006 | 5169 |
| 2007 | 5750 |
| 2008 | 4724 |
| 2009 | 5202 |
| 2010 | 5304 |
| 2011 | 5808 |
| 2012 | 5398 |
| 2013 | 5935 |
| 2014 | 6005 |
| 2015 | 6579 |
| 2016 | 4119 |
| 2017 | 4619 |
| 2018 | 4713 |
| 2019 | 5137 |
| 2020 | 4826 |
| 2021 | 5253 |
| 2022 | 5323 |
| 2023 | 5837 |
| 2024 | 4926 |
| 2025 | 5342 |
| 2026 | 5480 |
| 2027 | 5970 |
| 2028 | 5619 |
| 2029 | 6044 |
| 2030 | 6125 |
| 2031 | 6660 |
| 2032 | 5049 |
| 2033 | 5524 |
| 2034 | 5668 |
| 2035 | 6084 |
| 2036 | 5693 |
| 2037 | 6170 |
| 2038 | 6320 |
| 2039 | 6866 |
| 2040 | 5867 |
| 2041 | 6374 |
| 2042 | 6438 |
| 2043 | 6752 |
| 2044 | 6505 |
| 2045 | 6995 |
| 2046 | 7168 |
| 2047 | 7433 |
| 2048 | 11 |
| 2049 | 47 |
| 2050 | 81 |
| 2051 | 189 |
| 2052 | 108 |
| 2053 | 250 |
| 2054 | 290 |
| 2055 | 428 |
| 2056 | 132 |
| 2057 | 278 |
| 2058 | 314 |
| 2059 | 455 |
| 2060 | 348 |
| 2061 | 506 |
| 2062 | 522 |
| 2063 | 771 |
| 2064 | 152 |
| 2065 | 303 |
| 2066 | 326 |
| 2067 | 498 |
| 2068 | 380 |

TABLE Z17-continued with a sequence length of 8192:

| Polarized channel sequence number | Reliability or reliability sequence number |
|---|---|
| 2069 | 554 |
| 2070 | 604 |
| 2071 | 800 |
| 2072 | 401 |
| 2073 | 598 |
| 2074 | 576 |
| 2075 | 844 |
| 2076 | 666 |
| 2077 | 888 |
| 2078 | 929 |
| 2079 | 1221 |
| 2080 | 171 |
| 2081 | 359 |
| 2082 | 390 |
| 2083 | 568 |
| 2084 | 410 |
| 2085 | 590 |
| 2086 | 633 |
| 2087 | 860 |
| 2088 | 464 |
| 2089 | 653 |
| 2090 | 679 |
| 2091 | 892 |
| 2092 | 735 |
| 2093 | 959 |
| 2094 | 988 |
| 2095 | 1287 |
| 2096 | 515 |
| 2097 | 692 |
| 2098 | 759 |
| 2099 | 974 |
| 2100 | 794 |
| 2101 | 1021 |
| 2102 | 1058 |
| 2103 | 1334 |
| 2104 | 839 |
| 2105 | 1077 |
| 2106 | 1122 |
| 2107 | 1400 |
| 2108 | 1162 |
| 2109 | 1468 |
| 2110 | 1537 |
| 2111 | 1904 |
| 2112 | 265 |
| 2113 | 370 |
| 2114 | 447 |
| 2115 | 646 |
| 2116 | 473 |
| 2117 | 673 |
| 2118 | 729 |
| 2119 | 944 |
| 2120 | 539 |
| 2121 | 765 |
| 2122 | 698 |
| 2123 | 1003 |
| 2124 | 811 |
| 2125 | 1040 |
| 2126 | 1096 |
| 2127 | 1362 |
| 2128 | 583 |
| 2129 | 753 |
| 2130 | 827 |
| 2131 | 1063 |
| 2132 | 872 |
| 2133 | 1114 |
| 2134 | 1153 |
| 2135 | 1438 |
| 2136 | 918 |
| 2137 | 1166 |
| 2138 | 1242 |
| 2139 | 1485 |
| 2140 | 1275 |
| 2141 | 1572 |
| 2142 | 1632 |
| 2143 | 2028 |

TABLE Z17-continued with a sequence length of 8192:

| Polarized channel sequence number | Reliability or reliability sequence number |
|---|---|
| 2144 | 639 |
| 2145 | 850 |
| 2146 | 913 |
| 2147 | 1144 |
| 2148 | 969 |
| 2149 | 1187 |
| 2150 | 1258 |
| 2151 | 1551 |
| 2152 | 1007 |
| 2153 | 1263 |
| 2154 | 1330 |
| 2155 | 1590 |
| 2156 | 1366 |
| 2157 | 1666 |
| 2158 | 1734 |
| 2159 | 2080 |
| 2160 | 1082 |
| 2161 | 1343 |
| 2162 | 1422 |
| 2163 | 1690 |
| 2164 | 1457 |
| 2165 | 1747 |
| 2166 | 1810 |
| 2167 | 2178 |
| 2168 | 1515 |
| 2169 | 1829 |
| 2170 | 1877 |
| 2171 | 2255 |
| 2172 | 1944 |
| 2173 | 2331 |
| 2174 | 2431 |
| 2175 | 2913 |
| 2176 | 338 |
| 2177 | 438 |
| 2178 | 490 |
| 2179 | 747 |
| 2180 | 560 |
| 2181 | 776 |
| 2182 | 806 |
| 2183 | 1087 |
| 2184 | 612 |
| 2185 | 823 |
| 2186 | 876 |
| 2187 | 1131 |
| 2188 | 923 |
| 2189 | 1184 |
| 2190 | 1212 |
| 2191 | 1548 |
| 2192 | 659 |
| 2193 | 882 |
| 2194 | 939 |
| 2195 | 1200 |
| 2196 | 983 |
| 2197 | 1246 |
| 2198 | 1299 |
| 2199 | 1615 |
| 2200 | 1030 |
| 2201 | 1311 |
| 2202 | 1346 |
| 2203 | 1649 |
| 2204 | 1427 |
| 2205 | 1724 |
| 2206 | 1799 |
| 2207 | 2157 |
| 2208 | 710 |
| 2209 | 948 |
| 2210 | 1012 |
| 2211 | 1266 |
| 2212 | 1054 |
| 2213 | 1315 |
| 2214 | 1380 |
| 2215 | 1703 |
| 2216 | 1127 |
| 2217 | 1407 |
| 2218 | 1464 |

TABLE Z17-continued with a sequence length of 8192:

| Polarized channel sequence number | Reliability or reliability sequence number |
|---|---|
| 2219 | 1764 |
| 2220 | 1508 |
| 2221 | 1819 |
| 2222 | 1868 |
| 2223 | 2244 |
| 2224 | 1209 |
| 2225 | 1482 |
| 2226 | 1566 |
| 2227 | 1852 |
| 2228 | 1601 |
| 2229 | 1913 |
| 2230 | 1969 |
| 2231 | 2291 |
| 2232 | 1680 |
| 2233 | 1991 |
| 2234 | 2058 |
| 2235 | 2388 |
| 2236 | 2113 |
| 2237 | 2505 |
| 2238 | 2643 |
| 2239 | 2953 |
| 2240 | 723 |
| 2241 | 1026 |
| 2242 | 1104 |
| 2243 | 1396 |
| 2244 | 1174 |
| 2245 | 1442 |
| 2246 | 1497 |
| 2247 | 1843 |
| 2248 | 1225 |
| 2249 | 1523 |
| 2250 | 1580 |
| 2251 | 1890 |
| 2252 | 1639 |
| 2253 | 1957 |
| 2254 | 2015 |
| 2255 | 2365 |
| 2256 | 1295 |
| 2257 | 1618 |
| 2258 | 1662 |
| 2259 | 1978 |
| 2260 | 1751 |
| 2261 | 2046 |
| 2262 | 2101 |
| 2263 | 2525 |
| 2264 | 1786 |
| 2265 | 2128 |
| 2266 | 2191 |
| 2267 | 2558 |
| 2268 | 2277 |
| 2269 | 2665 |
| 2270 | 2732 |
| 2271 | 3240 |
| 2272 | 1377 |
| 2273 | 1710 |
| 2274 | 1773 |
| 2275 | 2071 |
| 2276 | 1855 |
| 2277 | 2144 |
| 2278 | 2202 |
| 2279 | 2585 |
| 2280 | 1925 |
| 2281 | 2226 |
| 2282 | 2311 |
| 2283 | 2697 |
| 2284 | 2408 |
| 2285 | 2755 |
| 2286 | 2830 |
| 2287 | 3327 |
| 2288 | 2003 |
| 2289 | 2353 |
| 2290 | 2452 |
| 2291 | 2789 |
| 2292 | 2481 |
| 2293 | 2874 |

TABLE Z17-continued with a sequence length of 8192:

| Polarized channel sequence number | Reliability or reliability sequence number |
|---|---|
| 2294 | 3003 |
| 2295 | 3525 |
| 2296 | 2612 |
| 2297 | 3055 |
| 2298 | 3108 |
| 2299 | 3422 |
| 2300 | 3178 |
| 2301 | 3680 |
| 2302 | 3865 |
| 2303 | 4172 |
| 2304 | 205 |
| 2305 | 419 |
| 2306 | 546 |
| 2307 | 833 |
| 2308 | 625 |
| 2309 | 866 |
| 2310 | 963 |
| 2311 | 1234 |
| 2312 | 685 |
| 2313 | 933 |
| 2314 | 1017 |
| 2315 | 1290 |
| 2316 | 1091 |
| 2317 | 1373 |
| 2318 | 1404 |
| 2319 | 1780 |
| 2320 | 741 |
| 2321 | 993 |
| 2322 | 1049 |
| 2323 | 1357 |
| 2324 | 1157 |
| 2325 | 1431 |
| 2326 | 1533 |
| 2327 | 1816 |
| 2328 | 1192 |
| 2329 | 1519 |
| 2330 | 1479 |
| 2331 | 1893 |
| 2332 | 1621 |
| 2333 | 1960 |
| 2334 | 2019 |
| 2335 | 2440 |
| 2336 | 782 |
| 2337 | 1118 |
| 2338 | 1179 |
| 2339 | 1461 |
| 2340 | 1217 |
| 2341 | 1500 |
| 2342 | 1554 |
| 2343 | 1919 |
| 2344 | 1306 |
| 2345 | 1597 |
| 2346 | 1646 |
| 2347 | 1972 |
| 2348 | 1720 |
| 2349 | 2065 |
| 2350 | 2108 |
| 2351 | 2534 |
| 2352 | 1389 |
| 2353 | 1660 |
| 2354 | 1760 |
| 2355 | 2088 |
| 2356 | 1803 |
| 2357 | 2152 |
| 2358 | 2209 |
| 2359 | 2603 |
| 2360 | 1888 |
| 2361 | 2229 |
| 2362 | 2296 |
| 2363 | 2687 |
| 2364 | 2345 |
| 2365 | 2781 |
| 2366 | 2864 |
| 2367 | 3366 |
| 2368 | 898 |

TABLE Z17-continued with a sequence length of 8192:

| Polarized channel sequence number | Reliability or reliability sequence number |
|---|---|
| 2369 | 1135 |
| 2370 | 1271 |
| 2371 | 1587 |
| 2372 | 1323 |
| 2373 | 1635 |
| 2374 | 1707 |
| 2375 | 2037 |
| 2376 | 1419 |
| 2377 | 1767 |
| 2378 | 1676 |
| 2379 | 2119 |
| 2380 | 1839 |
| 2381 | 2182 |
| 2382 | 2264 |
| 2383 | 2636 |
| 2384 | 1493 |
| 2385 | 1741 |
| 2386 | 1874 |
| 2387 | 2217 |
| 2388 | 1929 |
| 2389 | 2285 |
| 2390 | 2336 |
| 2391 | 2738 |
| 2392 | 1997 |
| 2393 | 2356 |
| 2394 | 2464 |
| 2395 | 2812 |
| 2396 | 2522 |
| 2397 | 2921 |
| 2398 | 2995 |
| 2399 | 3540 |
| 2400 | 1569 |
| 2401 | 1906 |
| 2402 | 1985 |
| 2403 | 2325 |
| 2404 | 2076 |
| 2405 | 2391 |
| 2406 | 2487 |
| 2407 | 2896 |
| 2408 | 2131 |
| 2409 | 2496 |
| 2410 | 2594 |
| 2411 | 2943 |
| 2412 | 2653 |
| 2413 | 3044 |
| 2414 | 3131 |
| 2415 | 3609 |
| 2416 | 2238 |
| 2417 | 2618 |
| 2418 | 2715 |
| 2419 | 3076 |
| 2420 | 2764 |
| 2421 | 3144 |
| 2422 | 3227 |
| 2423 | 3734 |
| 2424 | 2847 |
| 2425 | 3266 |
| 2426 | 3341 |
| 2427 | 3824 |
| 2428 | 3408 |
| 2429 | 3928 |
| 2430 | 4044 |
| 2431 | 4588 |
| 2432 | 1068 |
| 2433 | 1251 |
| 2434 | 1338 |
| 2435 | 1730 |
| 2436 | 1449 |
| 2437 | 1790 |
| 2438 | 1826 |
| 2439 | 2250 |
| 2440 | 1541 |
| 2441 | 1861 |
| 2442 | 1938 |
| 2443 | 2319 |

TABLE Z17-continued with a sequence length of 8192:

| Polarized channel sequence number | Reliability or reliability sequence number |
|---|---|
| 2444 | 2007 |
| 2445 | 2379 |
| 2446 | 2423 |
| 2447 | 2885 |
| 2448 | 1607 |
| 2449 | 1948 |
| 2450 | 2034 |
| 2451 | 2400 |
| 2452 | 2098 |
| 2453 | 2472 |
| 2454 | 2549 |
| 2455 | 2972 |
| 2456 | 2170 |
| 2457 | 2567 |
| 2458 | 2627 |
| 2459 | 3026 |
| 2460 | 2723 |
| 2461 | 3123 |
| 2462 | 3211 |
| 2463 | 3713 |
| 2464 | 1683 |
| 2465 | 2049 |
| 2466 | 2139 |
| 2467 | 2514 |
| 2468 | 2196 |
| 2469 | 2576 |
| 2470 | 2671 |
| 2471 | 3091 |
| 2472 | 2302 |
| 2473 | 2706 |
| 2474 | 2772 |
| 2475 | 3164 |
| 2476 | 2839 |
| 2477 | 3249 |
| 2478 | 3312 |
| 2479 | 3809 |
| 2480 | 2417 |
| 2481 | 2805 |
| 2482 | 2904 |
| 2483 | 3288 |
| 2484 | 2964 |
| 2485 | 3383 |
| 2486 | 3452 |
| 2487 | 3886 |
| 2488 | 3067 |
| 2489 | 3482 |
| 2490 | 3576 |
| 2491 | 3996 |
| 2492 | 3641 |
| 2493 | 4121 |
| 2494 | 4288 |
| 2495 | 4634 |
| 2496 | 1697 |
| 2497 | 2164 |
| 2498 | 2267 |
| 2499 | 2680 |
| 2500 | 2374 |
| 2501 | 2746 |
| 2502 | 2822 |
| 2503 | 3274 |
| 2504 | 2443 |
| 2505 | 2856 |
| 2506 | 2932 |
| 2507 | 3352 |
| 2508 | 3013 |
| 2509 | 3436 |
| 2510 | 3509 |
| 2511 | 3972 |
| 2512 | 2543 |
| 2513 | 2980 |
| 2514 | 3036 |
| 2515 | 3466 |
| 2516 | 3156 |
| 2517 | 3562 |
| 2518 | 3626 |

TABLE Z17-continued with a sequence length of 8192:

| Polarized channel sequence number | Reliability or reliability sequence number |
|---|---|
| 2519 | 4142 |
| 2520 | 3201 |
| 2521 | 3657 |
| 2522 | 3751 |
| 2523 | 4196 |
| 2524 | 3841 |
| 2525 | 4312 |
| 2526 | 4385 |
| 2527 | 4945 |
| 2528 | 2662 |
| 2529 | 3099 |
| 2530 | 3186 |
| 2531 | 3593 |
| 2532 | 3302 |
| 2533 | 3696 |
| 2534 | 3768 |
| 2535 | 4226 |
| 2536 | 3397 |
| 2537 | 3791 |
| 2538 | 3910 |
| 2539 | 4354 |
| 2540 | 4020 |
| 2541 | 4420 |
| 2542 | 4501 |
| 2543 | 5031 |
| 2544 | 3497 |
| 2545 | 3950 |
| 2546 | 4067 |
| 2547 | 4460 |
| 2548 | 4096 |
| 2549 | 4538 |
| 2550 | 4688 |
| 2551 | 5245 |
| 2552 | 4260 |
| 2553 | 4745 |
| 2554 | 4805 |
| 2555 | 5125 |
| 2556 | 4871 |
| 2557 | 5392 |
| 2558 | 5589 |
| 2559 | 5915 |
| 2560 | 221 |
| 2561 | 481 |
| 2562 | 619 |
| 2563 | 954 |
| 2564 | 717 |
| 2565 | 1035 |
| 2566 | 1140 |
| 2567 | 1453 |
| 2568 | 788 |
| 2569 | 1109 |
| 2570 | 1204 |
| 2571 | 1512 |
| 2572 | 1283 |
| 2573 | 1593 |
| 2574 | 1625 |
| 2575 | 2043 |
| 2576 | 856 |
| 2577 | 1170 |
| 2578 | 1229 |
| 2579 | 1576 |
| 2580 | 1354 |
| 2581 | 1670 |
| 2582 | 1771 |
| 2583 | 2086 |
| 2584 | 1393 |
| 2585 | 1754 |
| 2586 | 1714 |
| 2587 | 2155 |
| 2588 | 1872 |
| 2589 | 2220 |
| 2590 | 2279 |
| 2591 | 2735 |
| 2592 | 908 |
| 2593 | 1302 |

TABLE Z17-continued with a sequence length of 8192:

| Polarized channel sequence number | Reliability or reliability sequence number |
|---|---|
| 2594 | 1369 |
| 2595 | 1701 |
| 2596 | 1411 |
| 2597 | 1743 |
| 2598 | 1806 |
| 2599 | 2173 |
| 2600 | 1525 |
| 2601 | 1845 |
| 2602 | 1897 |
| 2603 | 2231 |
| 2604 | 1976 |
| 2605 | 2322 |
| 2606 | 2368 |
| 2607 | 2826 |
| 2608 | 1611 |
| 2609 | 1922 |
| 2610 | 2022 |
| 2611 | 2348 |
| 2612 | 2073 |
| 2613 | 2420 |
| 2614 | 2475 |
| 2615 | 2902 |
| 2616 | 2146 |
| 2617 | 2502 |
| 2618 | 2573 |
| 2619 | 2998 |
| 2620 | 2633 |
| 2621 | 3103 |
| 2622 | 3198 |
| 2623 | 3708 |
| 2624 | 1073 |
| 2625 | 1327 |
| 2626 | 1489 |
| 2627 | 1836 |
| 2628 | 1544 |
| 2629 | 1881 |
| 2630 | 1962 |
| 2631 | 2308 |
| 2632 | 1642 |
| 2633 | 2031 |
| 2634 | 1934 |
| 2635 | 2385 |
| 2636 | 2104 |
| 2637 | 2449 |
| 2638 | 2537 |
| 2639 | 2942 |
| 2640 | 1727 |
| 2641 | 2012 |
| 2642 | 2126 |
| 2643 | 2484 |
| 2644 | 2194 |
| 2645 | 2555 |
| 2646 | 2615 |
| 2647 | 3057 |
| 2648 | 2261 |
| 2649 | 2642 |
| 2650 | 2761 |
| 2651 | 3128 |
| 2652 | 2819 |
| 2653 | 3254 |
| 2654 | 3333 |
| 2655 | 3871 |
| 2656 | 1823 |
| 2657 | 2167 |
| 2658 | 2253 |
| 2659 | 2606 |
| 2660 | 2342 |
| 2661 | 2683 |
| 2662 | 2786 |
| 2663 | 3220 |
| 2664 | 2397 |
| 2665 | 2795 |
| 2666 | 2893 |
| 2667 | 3279 |
| 2668 | 2950 |

TABLE Z17-continued with a sequence length of 8192:

| Polarized channel sequence number | Reliability or reliability sequence number |
|---|---|
| 2669 | 3385 |
| 2670 | 3477 |
| 2671 | 3938 |
| 2672 | 2508 |
| 2673 | 2918 |
| 2674 | 3032 |
| 2675 | 3417 |
| 2676 | 3080 |
| 2677 | 3495 |
| 2678 | 3582 |
| 2679 | 4054 |
| 2680 | 3169 |
| 2681 | 3615 |
| 2682 | 3674 |
| 2683 | 4150 |
| 2684 | 3763 |
| 2685 | 4234 |
| 2686 | 4341 |
| 2687 | 4845 |
| 2688 | 1254 |
| 2689 | 1472 |
| 2690 | 1562 |
| 2691 | 2000 |
| 2692 | 1687 |
| 2693 | 2056 |
| 2694 | 2093 |
| 2695 | 2517 |
| 2696 | 1784 |
| 2697 | 2116 |
| 2698 | 2206 |
| 2699 | 2588 |
| 2700 | 2274 |
| 2701 | 2674 |
| 2702 | 2717 |
| 2703 | 3218 |
| 2704 | 1858 |
| 2705 | 2215 |
| 2706 | 2299 |
| 2707 | 2700 |
| 2708 | 2359 |
| 2709 | 2769 |
| 2710 | 2853 |
| 2711 | 3307 |
| 2712 | 2437 |
| 2713 | 2870 |
| 2714 | 2928 |
| 2715 | 3362 |
| 2716 | 3040 |
| 2717 | 3461 |
| 2718 | 3567 |
| 2719 | 4032 |
| 2720 | 1941 |
| 2721 | 2313 |
| 2722 | 2405 |
| 2723 | 2798 |
| 2724 | 2467 |
| 2725 | 2878 |
| 2726 | 2976 |
| 2727 | 3432 |
| 2728 | 2579 |
| 2729 | 3018 |
| 2730 | 3095 |
| 2731 | 3520 |
| 2732 | 3159 |
| 2733 | 3598 |
| 2734 | 3663 |
| 2735 | 4131 |
| 2736 | 2709 |
| 2737 | 3116 |
| 2738 | 3235 |
| 2739 | 3637 |
| 2740 | 3293 |
| 2741 | 3723 |
| 2742 | 3797 |
| 2743 | 4186 |

TABLE Z17-continued with a sequence length of 8192:

| Polarized channel sequence number | Reliability or reliability sequence number |
|---|---|
| 2744 | 3402 |
| 2745 | 3822 |
| 2746 | 3904 |
| 2747 | 4294 |
| 2748 | 3978 |
| 2749 | 4412 |
| 2750 | 4561 |
| 2751 | 4890 |
| 2752 | 1953 |
| 2753 | 2429 |
| 2754 | 2546 |
| 2755 | 2990 |
| 2756 | 2650 |
| 2757 | 3063 |
| 2758 | 3143 |
| 2759 | 3631 |
| 2760 | 2743 |
| 2761 | 3184 |
| 2762 | 3259 |
| 2763 | 3691 |
| 2764 | 3347 |
| 2765 | 3780 |
| 2766 | 3853 |
| 2767 | 4270 |
| 2768 | 2844 |
| 2769 | 3319 |
| 2770 | 3376 |
| 2771 | 3814 |
| 2772 | 3502 |
| 2773 | 3892 |
| 2774 | 3962 |
| 2775 | 4441 |
| 2776 | 3551 |
| 2777 | 3990 |
| 2778 | 4075 |
| 2779 | 4473 |
| 2780 | 4166 |
| 2781 | 4583 |
| 2782 | 4656 |
| 2783 | 5176 |
| 2784 | 2968 |
| 2785 | 3447 |
| 2786 | 3533 |
| 2787 | 3922 |
| 2788 | 3646 |
| 2789 | 4016 |
| 2790 | 4087 |
| 2791 | 4497 |
| 2792 | 3740 |
| 2793 | 4107 |
| 2794 | 4210 |
| 2795 | 4621 |
| 2796 | 4321 |
| 2797 | 4679 |
| 2798 | 4761 |
| 2799 | 5266 |
| 2800 | 3836 |
| 2801 | 4250 |
| 2802 | 4366 |
| 2803 | 4720 |
| 2804 | 4393 |
| 2805 | 4812 |
| 2806 | 4935 |
| 2807 | 5457 |
| 2808 | 4525 |
| 2809 | 4994 |
| 2810 | 5051 |
| 2811 | 5353 |
| 2812 | 5112 |
| 2813 | 5604 |
| 2814 | 5779 |
| 2815 | 6077 |
| 2816 | 998 |
| 2817 | 1435 |
| 2818 | 1656 |

TABLE Z17-continued

| with a sequence length of 8192: | |
|---|---|
| Polarized channel sequence number | Reliability or reliability sequence number |
| 2819 | 2134 |
| 2820 | 1797 |
| 2821 | 2185 |
| 2822 | 2333 |
| 2823 | 2752 |
| 2824 | 1909 |
| 2825 | 2288 |
| 2826 | 2411 |
| 2827 | 2836 |
| 2828 | 2528 |
| 2829 | 2958 |
| 2830 | 3010 |
| 2831 | 3545 |
| 2832 | 1988 |
| 2833 | 2376 |
| 2834 | 2461 |
| 2835 | 2936 |
| 2836 | 2624 |
| 2837 | 3049 |
| 2838 | 3193 |
| 2839 | 3587 |
| 2840 | 2691 |
| 2841 | 3173 |
| 2842 | 3114 |
| 2843 | 3702 |
| 2844 | 3321 |
| 2845 | 3786 |
| 2846 | 3859 |
| 2847 | 4345 |
| 2848 | 2061 |
| 2849 | 2564 |
| 2850 | 2659 |
| 2851 | 3086 |
| 2852 | 2726 |
| 2853 | 3151 |
| 2854 | 3232 |
| 2855 | 3728 |
| 2856 | 2861 |
| 2857 | 3283 |
| 2858 | 3357 |
| 2859 | 3803 |
| 2860 | 3457 |
| 2861 | 3916 |
| 2862 | 3966 |
| 2863 | 4446 |
| 2864 | 2987 |
| 2865 | 3371 |
| 2866 | 3515 |
| 2867 | 3944 |
| 2868 | 3573 |
| 2869 | 4026 |
| 2870 | 4091 |
| 2871 | 4516 |
| 2872 | 3685 |
| 2873 | 4115 |
| 2874 | 4190 |
| 2875 | 4612 |
| 2876 | 4246 |
| 2877 | 4715 |
| 2878 | 4795 |
| 2879 | 5301 |
| 2880 | 2241 |
| 2881 | 2597 |
| 2882 | 2809 |
| 2883 | 3267 |
| 2884 | 2888 |
| 2885 | 3338 |
| 2886 | 3441 |
| 2887 | 3882 |
| 2888 | 3021 |
| 2889 | 3531 |
| 2890 | 3390 |
| 2891 | 3984 |
| 2892 | 3620 |
| 2893 | 4061 |

TABLE Z17-continued

| with a sequence length of 8192: | |
|---|---|
| Polarized channel sequence number | Reliability or reliability sequence number |
| 2894 | 4156 |
| 2895 | 4553 |
| 2896 | 3136 |
| 2897 | 3489 |
| 2898 | 3668 |
| 2899 | 4101 |
| 2900 | 3746 |
| 2901 | 4180 |
| 2902 | 4240 |
| 2903 | 4665 |
| 2904 | 3830 |
| 2905 | 4264 |
| 2906 | 4374 |
| 2907 | 4738 |
| 2908 | 4433 |
| 2909 | 4854 |
| 2910 | 4928 |
| 2911 | 5472 |
| 2912 | 3245 |
| 2913 | 3717 |
| 2914 | 3820 |
| 2915 | 4220 |
| 2916 | 3932 |
| 2917 | 4302 |
| 2918 | 4399 |
| 2919 | 4830 |
| 2920 | 4004 |
| 2921 | 4408 |
| 2922 | 4509 |
| 2923 | 4880 |
| 2924 | 4566 |
| 2925 | 4984 |
| 2926 | 5071 |
| 2927 | 5530 |
| 2928 | 4125 |
| 2929 | 4533 |
| 2930 | 4643 |
| 2931 | 5011 |
| 2932 | 4697 |
| 2933 | 5081 |
| 2934 | 5166 |
| 2935 | 5653 |
| 2936 | 4777 |
| 2937 | 5197 |
| 2938 | 5280 |
| 2939 | 5737 |
| 2940 | 5340 |
| 2941 | 5831 |
| 2942 | 5959 |
| 2943 | 6465 |
| 2944 | 2493 |
| 2945 | 2778 |
| 2946 | 2910 |
| 2947 | 3472 |
| 2948 | 3071 |
| 2949 | 3556 |
| 2950 | 3604 |
| 2951 | 4136 |
| 2952 | 3206 |
| 2953 | 3652 |
| 2954 | 3757 |
| 2955 | 4216 |
| 2956 | 3847 |
| 2957 | 4284 |
| 2958 | 4333 |
| 2959 | 4821 |
| 2960 | 3298 |
| 2961 | 3774 |
| 2962 | 3877 |
| 2963 | 4308 |
| 2964 | 3956 |
| 2965 | 4378 |
| 2966 | 4469 |
| 2967 | 4909 |
| 2968 | 4048 |

TABLE Z17-continued with a sequence length of 8192:

| Polarized channel sequence number | Reliability or reliability sequence number |
|---|---|
| 2969 | 4482 |
| 2970 | 4546 |
| 2971 | 4962 |
| 2972 | 4652 |
| 2973 | 5059 |
| 2974 | 5156 |
| 2975 | 5638 |
| 2976 | 3411 |
| 2977 | 3898 |
| 2978 | 4010 |
| 2979 | 4427 |
| 2980 | 4081 |
| 2981 | 4488 |
| 2982 | 4596 |
| 2983 | 5019 |
| 2984 | 4202 |
| 2985 | 4627 |
| 2986 | 4706 |
| 2987 | 5102 |
| 2988 | 4768 |
| 2989 | 5189 |
| 2990 | 5256 |
| 2991 | 5725 |
| 2992 | 4327 |
| 2993 | 4729 |
| 2994 | 4835 |
| 2995 | 5221 |
| 2996 | 4899 |
| 2997 | 5315 |
| 2998 | 5381 |
| 2999 | 5795 |
| 3000 | 5001 |
| 3001 | 5418 |
| 3002 | 5501 |
| 3003 | 5891 |
| 3004 | 5559 |
| 3005 | 6026 |
| 3006 | 6185 |
| 3007 | 6509 |
| 3008 | 3427 |
| 3009 | 4038 |
| 3010 | 4160 |
| 3011 | 4605 |
| 3012 | 4278 |
| 3013 | 4674 |
| 3014 | 4754 |
| 3015 | 5210 |
| 3016 | 4360 |
| 3017 | 4786 |
| 3018 | 4861 |
| 3019 | 5293 |
| 3020 | 4955 |
| 3021 | 5367 |
| 3022 | 5446 |
| 3023 | 5874 |
| 3024 | 4454 |
| 3025 | 4918 |
| 3026 | 4972 |
| 3027 | 5406 |
| 3028 | 5094 |
| 3029 | 5486 |
| 3030 | 5542 |
| 3031 | 6055 |
| 3032 | 5145 |
| 3033 | 5574 |
| 3034 | 5671 |
| 3035 | 6102 |
| 3036 | 5756 |
| 3037 | 6220 |
| 3038 | 6280 |
| 3039 | 6773 |
| 3040 | 4575 |
| 3041 | 5041 |
| 3042 | 5132 |
| 3043 | 5515 |

TABLE Z17-continued with a sequence length of 8192:

| Polarized channel sequence number | Reliability or reliability sequence number |
|---|---|
| 3044 | 5232 |
| 3045 | 5622 |
| 3046 | 5687 |
| 3047 | 6132 |
| 3048 | 5329 |
| 3049 | 5706 |
| 3050 | 5814 |
| 3051 | 6248 |
| 3052 | 5939 |
| 3053 | 6312 |
| 3054 | 6387 |
| 3055 | 6843 |
| 3056 | 5432 |
| 3057 | 5854 |
| 3058 | 5980 |
| 3059 | 6349 |
| 3060 | 6001 |
| 3061 | 6421 |
| 3062 | 6551 |
| 3063 | 7020 |
| 3064 | 6159 |
| 3065 | 6602 |
| 3066 | 6651 |
| 3067 | 6923 |
| 3068 | 6711 |
| 3069 | 7126 |
| 3070 | 7280 |
| 3071 | 7500 |
| 3072 | 237 |
| 3073 | 530 |
| 3074 | 704 |
| 3075 | 1100 |
| 3076 | 817 |
| 3077 | 1237 |
| 3078 | 1350 |
| 3079 | 1693 |
| 3080 | 902 |
| 3081 | 1318 |
| 3082 | 1415 |
| 3083 | 1758 |
| 3084 | 1504 |
| 3085 | 1865 |
| 3086 | 1900 |
| 3087 | 2362 |
| 3088 | 978 |
| 3089 | 1385 |
| 3090 | 1446 |
| 3091 | 1849 |
| 3092 | 1583 |
| 3093 | 1950 |
| 3094 | 2053 |
| 3095 | 2414 |
| 3096 | 1629 |
| 3097 | 2041 |
| 3098 | 1993 |
| 3099 | 2490 |
| 3100 | 2175 |
| 3101 | 2570 |
| 3102 | 2639 |
| 3103 | 3119 |
| 3104 | 1044 |
| 3105 | 1529 |
| 3106 | 1604 |
| 3107 | 1981 |
| 3108 | 1652 |
| 3109 | 2024 |
| 3110 | 2110 |
| 3111 | 2519 |
| 3112 | 1777 |
| 3113 | 2149 |
| 3114 | 2199 |
| 3115 | 2582 |
| 3116 | 2294 |
| 3117 | 2694 |
| 3118 | 2741 |

TABLE Z17-continued with a sequence length of 8192:

| Polarized channel sequence number | Reliability or reliability sequence number |
|---|---|
| 3119 | 3215 |
| 3120 | 1884 |
| 3121 | 2223 |
| 3122 | 2339 |
| 3123 | 2720 |
| 3124 | 2402 |
| 3125 | 2801 |
| 3126 | 2858 |
| 3127 | 3290 |
| 3128 | 2478 |
| 3129 | 2889 |
| 3130 | 2961 |
| 3131 | 3388 |
| 3132 | 3024 |
| 3133 | 3486 |
| 3134 | 3583 |
| 3135 | 4099 |
| 3136 | 1278 |
| 3137 | 1558 |
| 3138 | 1737 |
| 3139 | 2137 |
| 3140 | 1793 |
| 3141 | 2188 |
| 3142 | 2282 |
| 3143 | 2668 |
| 3144 | 1916 |
| 3145 | 2351 |
| 3146 | 2236 |
| 3147 | 2766 |
| 3148 | 2434 |
| 3149 | 2833 |
| 3150 | 2924 |
| 3151 | 3329 |
| 3152 | 2009 |
| 3153 | 2328 |
| 3154 | 2458 |
| 3155 | 2867 |
| 3156 | 2540 |
| 3157 | 2947 |
| 3158 | 3006 |
| 3159 | 3445 |
| 3160 | 2621 |
| 3161 | 3029 |
| 3162 | 3148 |
| 3163 | 3511 |
| 3164 | 3203 |
| 3165 | 3633 |
| 3166 | 3715 |
| 3167 | 4256 |
| 3168 | 2121 |
| 3169 | 2499 |
| 3170 | 2609 |
| 3171 | 3001 |
| 3172 | 2712 |
| 3173 | 3068 |
| 3174 | 3176 |
| 3175 | 3605 |
| 3176 | 2775 |
| 3177 | 3181 |
| 3178 | 3284 |
| 3179 | 3659 |
| 3180 | 3334 |
| 3181 | 3766 |
| 3182 | 3867 |
| 3183 | 4325 |
| 3184 | 2899 |
| 3185 | 3305 |
| 3186 | 3418 |
| 3187 | 3799 |
| 3188 | 3470 |
| 3189 | 3884 |
| 3190 | 3976 |
| 3191 | 4443 |
| 3192 | 3553 |
| 3193 | 4002 |

TABLE Z17-continued with a sequence length of 8192:

| Polarized channel sequence number | Reliability or reliability sequence number |
|---|---|
| 3194 | 4069 |
| 3195 | 4535 |
| 3196 | 4152 |
| 3197 | 4623 |
| 3198 | 4740 |
| 3199 | 5229 |
| 3200 | 1476 |
| 3201 | 1717 |
| 3202 | 1832 |
| 3203 | 2316 |
| 3204 | 1966 |
| 3205 | 2371 |
| 3206 | 2426 |
| 3207 | 2907 |
| 3208 | 2068 |
| 3209 | 2446 |
| 3210 | 2552 |
| 3211 | 2979 |
| 3212 | 2630 |
| 3213 | 3060 |
| 3214 | 3106 |
| 3215 | 3600 |
| 3216 | 2162 |
| 3217 | 2561 |
| 3218 | 2656 |
| 3219 | 3083 |
| 3220 | 2729 |
| 3221 | 3153 |
| 3222 | 3237 |
| 3223 | 3693 |
| 3224 | 2815 |
| 3225 | 3257 |
| 3226 | 3310 |
| 3227 | 3744 |
| 3228 | 3425 |
| 3229 | 3851 |
| 3230 | 3958 |
| 3231 | 4418 |
| 3232 | 2247 |
| 3233 | 2677 |
| 3234 | 2784 |
| 3235 | 3189 |
| 3236 | 2850 |
| 3237 | 3262 |
| 3238 | 3360 |
| 3239 | 3816 |
| 3240 | 2969 |
| 3241 | 3399 |
| 3242 | 3480 |
| 3243 | 3906 |
| 3244 | 3542 |
| 3245 | 3986 |
| 3246 | 4052 |
| 3247 | 4520 |
| 3248 | 3096 |
| 3249 | 3506 |
| 3250 | 3622 |
| 3251 | 4030 |
| 3252 | 3676 |
| 3253 | 4113 |
| 3254 | 4182 |
| 3255 | 4577 |
| 3256 | 3784 |
| 3257 | 4212 |
| 3258 | 4296 |
| 3259 | 4690 |
| 3260 | 4362 |
| 3261 | 4816 |
| 3262 | 4960 |
| 3263 | 5272 |
| 3264 | 2271 |
| 3265 | 2806 |
| 3266 | 2929 |
| 3267 | 3380 |
| 3268 | 3045 |

TABLE Z17-continued with a sequence length of 8192:

| Polarized channel sequence number | Reliability or reliability sequence number |
|---|---|
| 3269 | 3450 |
| 3270 | 3527 |
| 3271 | 4018 |
| 3272 | 3124 |
| 3273 | 3563 |
| 3274 | 3648 |
| 3275 | 4083 |
| 3276 | 3727 |
| 3277 | 4170 |
| 3278 | 4242 |
| 3279 | 4663 |
| 3280 | 3228 |
| 3281 | 3698 |
| 3282 | 3761 |
| 3283 | 4200 |
| 3284 | 3890 |
| 3285 | 4280 |
| 3286 | 4349 |
| 3287 | 4838 |
| 3288 | 3942 |
| 3289 | 4383 |
| 3290 | 4456 |
| 3291 | 4873 |
| 3292 | 4557 |
| 3293 | 4982 |
| 3294 | 5046 |
| 3295 | 5539 |
| 3296 | 3355 |
| 3297 | 3834 |
| 3298 | 3924 |
| 3299 | 4310 |
| 3300 | 4034 |
| 3301 | 4401 |
| 3302 | 4471 |
| 3303 | 4897 |
| 3304 | 4129 |
| 3305 | 4499 |
| 3306 | 4601 |
| 3307 | 5014 |
| 3308 | 4710 |
| 3309 | 5074 |
| 3310 | 5148 |
| 3311 | 5616 |
| 3312 | 4230 |
| 3313 | 4647 |
| 3314 | 4763 |
| 3315 | 5109 |
| 3316 | 4788 |
| 3317 | 5192 |
| 3318 | 5318 |
| 3319 | 5792 |
| 3320 | 4923 |
| 3321 | 5364 |
| 3322 | 5415 |
| 3323 | 5703 |
| 3324 | 5483 |
| 3325 | 5925 |
| 3326 | 6088 |
| 3327 | 6345 |
| 3328 | 1149 |
| 3329 | 1672 |
| 3330 | 1932 |
| 3331 | 2469 |
| 3332 | 2095 |
| 3333 | 2531 |
| 3334 | 2703 |
| 3335 | 3139 |
| 3336 | 2212 |
| 3337 | 2647 |
| 3338 | 2792 |
| 3339 | 3223 |
| 3340 | 2916 |
| 3341 | 3348 |
| 3342 | 3394 |
| 3343 | 3930 |

TABLE Z17-continued with a sequence length of 8192:

| Polarized channel sequence number | Reliability or reliability sequence number |
|---|---|
| 3344 | 2305 |
| 3345 | 2749 |
| 3346 | 2841 |
| 3347 | 3324 |
| 3348 | 3014 |
| 3349 | 3431 |
| 3350 | 3578 |
| 3351 | 3982 |
| 3352 | 3075 |
| 3353 | 3558 |
| 3354 | 3500 |
| 3355 | 4089 |
| 3356 | 3704 |
| 3357 | 4174 |
| 3358 | 4248 |
| 3359 | 4749 |
| 3360 | 2382 |
| 3361 | 2955 |
| 3362 | 3052 |
| 3363 | 3475 |
| 3364 | 3111 |
| 3365 | 3536 |
| 3366 | 3611 |
| 3367 | 4117 |
| 3368 | 3252 |
| 3369 | 3670 |
| 3370 | 3738 |
| 3371 | 4188 |
| 3372 | 3845 |
| 3373 | 4304 |
| 3374 | 4358 |
| 3375 | 4847 |
| 3376 | 3369 |
| 3377 | 3755 |
| 3378 | 3902 |
| 3379 | 4335 |
| 3380 | 3964 |
| 3381 | 4410 |
| 3382 | 4480 |
| 3383 | 4916 |
| 3384 | 4077 |
| 3385 | 4505 |
| 3386 | 4581 |
| 3387 | 5004 |
| 3388 | 4641 |
| 3389 | 5099 |
| 3390 | 5182 |
| 3391 | 5656 |
| 3392 | 2591 |
| 3393 | 2984 |
| 3394 | 3194 |
| 3395 | 3654 |
| 3396 | 3271 |
| 3397 | 3721 |
| 3398 | 3828 |
| 3399 | 4272 |
| 3400 | 3413 |
| 3401 | 3912 |
| 3402 | 3778 |
| 3403 | 4370 |
| 3404 | 4012 |
| 3405 | 4448 |
| 3406 | 4544 |
| 3407 | 4950 |
| 3408 | 3522 |
| 3409 | 3873 |
| 3410 | 4063 |
| 3411 | 4490 |
| 3412 | 4134 |
| 3413 | 4568 |
| 3414 | 4632 |
| 3415 | 5056 |
| 3416 | 4218 |
| 3417 | 4654 |
| 3418 | 4772 |

TABLE Z17-continued with a sequence length of 8192:

| Polarized channel sequence number | Reliability or reliability sequence number |
|---|---|
| 3419 | 5130 |
| 3420 | 4833 |
| 3421 | 5240 |
| 3422 | 5309 |
| 3423 | 5805 |
| 3424 | 3628 |
| 3425 | 4103 |
| 3426 | 4204 |
| 3427 | 4616 |
| 3428 | 4319 |
| 3429 | 4695 |
| 3430 | 4798 |
| 3431 | 5213 |
| 3432 | 4387 |
| 3433 | 4807 |
| 3434 | 4906 |
| 3435 | 5261 |
| 3436 | 4969 |
| 3437 | 5356 |
| 3438 | 5437 |
| 3439 | 5864 |
| 3440 | 4514 |
| 3441 | 4933 |
| 3442 | 5029 |
| 3443 | 5387 |
| 3444 | 5084 |
| 3445 | 5452 |
| 3446 | 5527 |
| 3447 | 5973 |
| 3448 | 5163 |
| 3449 | 5562 |
| 3450 | 5632 |
| 3451 | 6051 |
| 3452 | 5690 |
| 3453 | 6140 |
| 3454 | 6236 |
| 3455 | 6690 |
| 3456 | 2875 |
| 3457 | 3161 |
| 3458 | 3296 |
| 3459 | 3861 |
| 3460 | 3455 |
| 3461 | 3948 |
| 3462 | 3998 |
| 3463 | 4527 |
| 3464 | 3589 |
| 3465 | 4046 |
| 3466 | 4144 |
| 3467 | 4608 |
| 3468 | 4232 |
| 3469 | 4683 |
| 3470 | 4731 |
| 3471 | 5200 |
| 3472 | 3681 |
| 3473 | 4158 |
| 3474 | 4268 |
| 3475 | 4704 |
| 3476 | 4343 |
| 3477 | 4782 |
| 3478 | 4866 |
| 3479 | 5285 |
| 3480 | 4435 |
| 3481 | 4883 |
| 3482 | 4943 |
| 3483 | 5337 |
| 3484 | 5039 |
| 3485 | 5429 |
| 3486 | 5512 |
| 3487 | 5952 |
| 3488 | 3787 |
| 3489 | 4286 |
| 3490 | 4395 |
| 3491 | 4823 |
| 3492 | 4465 |
| 3493 | 4892 |
| 3494 | 4987 |
| 3495 | 5401 |
| 3496 | 4592 |
| 3497 | 5024 |
| 3498 | 5089 |
| 3499 | 5469 |
| 3500 | 5158 |
| 3501 | 5550 |
| 3502 | 5607 |
| 3503 | 6033 |
| 3504 | 4722 |
| 3505 | 5120 |
| 3506 | 5224 |
| 3507 | 5583 |
| 3508 | 5277 |
| 3509 | 5665 |
| 3510 | 5731 |
| 3511 | 6106 |
| 3512 | 5376 |
| 3513 | 5760 |
| 3514 | 5841 |
| 3515 | 6197 |
| 3516 | 5894 |
| 3517 | 6300 |
| 3518 | 6447 |
| 3519 | 6726 |
| 3520 | 3805 |
| 3521 | 4424 |
| 3522 | 4548 |
| 3523 | 4996 |
| 3524 | 4672 |
| 3525 | 5066 |
| 3526 | 5140 |
| 3527 | 5568 |
| 3528 | 4752 |
| 3529 | 5174 |
| 3530 | 5248 |
| 3531 | 5641 |
| 3532 | 5326 |
| 3533 | 5715 |
| 3534 | 5782 |
| 3535 | 6178 |
| 3536 | 4856 |
| 3537 | 5296 |
| 3538 | 5348 |
| 3539 | 5744 |
| 3540 | 5463 |
| 3541 | 5824 |
| 3542 | 5881 |
| 3543 | 6324 |
| 3544 | 5506 |
| 3545 | 5908 |
| 3546 | 5987 |
| 3547 | 6366 |
| 3548 | 6066 |
| 3549 | 6469 |
| 3550 | 6528 |
| 3551 | 6959 |
| 3552 | 4977 |
| 3553 | 5409 |
| 3554 | 5492 |
| 3555 | 5851 |
| 3556 | 5598 |
| 3557 | 5942 |
| 3558 | 5998 |
| 3559 | 6395 |
| 3560 | 5681 |
| 3561 | 6019 |
| 3562 | 6121 |
| 3563 | 6496 |
| 3564 | 6212 |
| 3565 | 6555 |
| 3566 | 6621 |
| 3567 | 7027 |
| 3568 | 5769 |

TABLE Z17-continued

| with a sequence length of 8192: | |
|---|---|
| Polarized channel sequence number | Reliability or reliability sequence number |
| 3569 | 6155 |
| 3570 | 6256 |
| 3571 | 6588 |
| 3572 | 6284 |
| 3573 | 6646 |
| 3574 | 6768 |
| 3575 | 7175 |
| 3576 | 6417 |
| 3577 | 6810 |
| 3578 | 6854 |
| 3579 | 7085 |
| 3580 | 6906 |
| 3581 | 7264 |
| 3582 | 7388 |
| 3583 | 7584 |
| 3584 | 1195 |
| 3585 | 1812 |
| 3586 | 2083 |
| 3587 | 2684 |
| 3588 | 2258 |
| 3589 | 2825 |
| 3590 | 2992 |
| 3591 | 3464 |
| 3592 | 2394 |
| 3593 | 2939 |
| 3594 | 3088 |
| 3595 | 3547 |
| 3596 | 3210 |
| 3597 | 3665 |
| 3598 | 3710 |
| 3599 | 4276 |
| 3600 | 2511 |
| 3601 | 3037 |
| 3602 | 3134 |
| 3603 | 3642 |
| 3604 | 3315 |
| 3605 | 3772 |
| 3606 | 3918 |
| 3607 | 4329 |
| 3608 | 3374 |
| 3609 | 3896 |
| 3610 | 3839 |
| 3611 | 4416 |
| 3612 | 4059 |
| 3613 | 4492 |
| 3614 | 4564 |
| 3615 | 5054 |
| 3616 | 2600 |
| 3617 | 3243 |
| 3618 | 3343 |
| 3619 | 3811 |
| 3620 | 3404 |
| 3621 | 3878 |
| 3622 | 3970 |
| 3623 | 4437 |
| 3624 | 3569 |
| 3625 | 4024 |
| 3626 | 4095 |
| 3627 | 4507 |
| 3628 | 4194 |
| 3629 | 4614 |
| 3630 | 4668 |
| 3631 | 5143 |
| 3632 | 3687 |
| 3633 | 4123 |
| 3634 | 4254 |
| 3635 | 4645 |
| 3636 | 4317 |
| 3637 | 4726 |
| 3638 | 4784 |
| 3639 | 5216 |
| 3640 | 4403 |
| 3641 | 4809 |
| 3642 | 4885 |
| 3643 | 5312 |

TABLE Z17-continued

| with a sequence length of 8192: | |
|---|---|
| Polarized channel sequence number | Reliability or reliability sequence number |
| 3644 | 4947 |
| 3645 | 5412 |
| 3646 | 5498 |
| 3647 | 5949 |
| 3648 | 2881 |
| 3649 | 3276 |
| 3650 | 3516 |
| 3651 | 4006 |
| 3652 | 3594 |
| 3653 | 4073 |
| 3654 | 4178 |
| 3655 | 4594 |
| 3656 | 3732 |
| 3657 | 4262 |
| 3658 | 4138 |
| 3659 | 4686 |
| 3660 | 4352 |
| 3661 | 4756 |
| 3662 | 4849 |
| 3663 | 5258 |
| 3664 | 3855 |
| 3665 | 4238 |
| 3666 | 4376 |
| 3667 | 4793 |
| 3668 | 4462 |
| 3669 | 4868 |
| 3670 | 4931 |
| 3671 | 5370 |
| 3672 | 4542 |
| 3673 | 4957 |
| 3674 | 5076 |
| 3675 | 5435 |
| 3676 | 5135 |
| 3677 | 5553 |
| 3678 | 5625 |
| 3679 | 6091 |
| 3680 | 3992 |
| 3681 | 4429 |
| 3682 | 4529 |
| 3683 | 4921 |
| 3684 | 4636 |
| 3685 | 4999 |
| 3686 | 5104 |
| 3687 | 5521 |
| 3688 | 4699 |
| 3689 | 5114 |
| 3690 | 5208 |
| 3691 | 5577 |
| 3692 | 5264 |
| 3693 | 5675 |
| 3694 | 5753 |
| 3695 | 6147 |
| 3696 | 4819 |
| 3697 | 5237 |
| 3698 | 5345 |
| 3699 | 5699 |
| 3700 | 5389 |
| 3701 | 5766 |
| 3702 | 5844 |
| 3703 | 6244 |
| 3704 | 5475 |
| 3705 | 5871 |
| 3706 | 5921 |
| 3707 | 6328 |
| 3708 | 5994 |
| 3709 | 6400 |
| 3710 | 6487 |
| 3711 | 6888 |
| 3712 | 3168 |
| 3713 | 3491 |
| 3714 | 3617 |
| 3715 | 4224 |
| 3716 | 3793 |
| 3717 | 4292 |
| 3718 | 4337 |

TABLE Z17-continued

| with a sequence length of 8192: | |
|---|---|
| Polarized channel sequence number | Reliability or reliability sequence number |
| 3719 | 4828 |
| 3720 | 3936 |
| 3721 | 4368 |
| 3722 | 4477 |
| 3723 | 4904 |
| 3724 | 4555 |
| 3725 | 4989 |
| 3726 | 5036 |
| 3727 | 5518 |
| 3728 | 4040 |
| 3729 | 4484 |
| 3730 | 4585 |
| 3731 | 5016 |
| 3732 | 4659 |
| 3733 | 5086 |
| 3734 | 5171 |
| 3735 | 5601 |
| 3736 | 4742 |
| 3737 | 5187 |
| 3738 | 5242 |
| 3739 | 5650 |
| 3740 | 5351 |
| 3741 | 5740 |
| 3742 | 5828 |
| 3743 | 6228 |
| 3744 | 4148 |
| 3745 | 4603 |
| 3746 | 4708 |
| 3747 | 5117 |
| 3748 | 4775 |
| 3749 | 5195 |
| 3750 | 5290 |
| 3751 | 5712 |
| 3752 | 4894 |
| 3753 | 5331 |
| 3754 | 5403 |
| 3755 | 5788 |
| 3756 | 5466 |
| 3757 | 5857 |
| 3758 | 5911 |
| 3759 | 6308 |
| 3760 | 5026 |
| 3761 | 5426 |
| 3762 | 5536 |
| 3763 | 5888 |
| 3764 | 5586 |
| 3765 | 5963 |
| 3766 | 6023 |
| 3767 | 6357 |
| 3768 | 5684 |
| 3769 | 6048 |
| 3770 | 6117 |
| 3771 | 6451 |
| 3772 | 6181 |
| 3773 | 6546 |
| 3774 | 6670 |
| 3775 | 6917 |
| 3776 | 4164 |
| 3777 | 4733 |
| 3778 | 4859 |
| 3779 | 5307 |
| 3780 | 4967 |
| 3781 | 5373 |
| 3782 | 5449 |
| 3783 | 5884 |
| 3784 | 5061 |
| 3785 | 5489 |
| 3786 | 5556 |
| 3787 | 5932 |
| 3788 | 5635 |
| 3789 | 6012 |
| 3790 | 6073 |
| 3791 | 6430 |
| 3792 | 5161 |
| 3793 | 5610 |

TABLE Z17-continued

| with a sequence length of 8192: | |
|---|---|
| Polarized channel sequence number | Reliability or reliability sequence number |
| 3794 | 5662 |
| 3795 | 6037 |
| 3796 | 5772 |
| 3797 | 6110 |
| 3798 | 6166 |
| 3799 | 6569 |
| 3800 | 5818 |
| 3801 | 6193 |
| 3802 | 6260 |
| 3803 | 6597 |
| 3804 | 6341 |
| 3805 | 6685 |
| 3806 | 6741 |
| 3807 | 7119 |
| 3808 | 5282 |
| 3809 | 5728 |
| 3810 | 5801 |
| 3811 | 6136 |
| 3812 | 5898 |
| 3813 | 6208 |
| 3814 | 6272 |
| 3815 | 6617 |
| 3816 | 5977 |
| 3817 | 6292 |
| 3818 | 6378 |
| 3819 | 6716 |
| 3820 | 6473 |
| 3821 | 6762 |
| 3822 | 6821 |
| 3823 | 7189 |
| 3824 | 6062 |
| 3825 | 6412 |
| 3826 | 6514 |
| 3827 | 6794 |
| 3828 | 6532 |
| 3829 | 6860 |
| 3830 | 6953 |
| 3831 | 7312 |
| 3832 | 6636 |
| 3833 | 6989 |
| 3834 | 7040 |
| 3835 | 7241 |
| 3836 | 7078 |
| 3837 | 7396 |
| 3838 | 7510 |
| 3839 | 7667 |
| 3840 | 2758 |
| 3841 | 3438 |
| 3842 | 3749 |
| 3843 | 4391 |
| 3844 | 3952 |
| 3845 | 4452 |
| 3846 | 4625 |
| 3847 | 5069 |
| 3848 | 4109 |
| 3849 | 4572 |
| 3850 | 4717 |
| 3851 | 5150 |
| 3852 | 4842 |
| 3853 | 5274 |
| 3854 | 5320 |
| 3855 | 5811 |
| 3856 | 4208 |
| 3857 | 4677 |
| 3858 | 4765 |
| 3859 | 5250 |
| 3860 | 4938 |
| 3861 | 5359 |
| 3862 | 5495 |
| 3863 | 5847 |
| 3864 | 5009 |
| 3865 | 5477 |
| 3866 | 5423 |
| 3867 | 5945 |
| 3868 | 5613 |

TABLE Z17-continued

| with a sequence length of 8192: | |
|---|---|
| Polarized channel sequence number | Reliability or reliability sequence number |
| 3869 | 6016 |
| 3870 | 6080 |
| 3871 | 6491 |
| 3872 | 4300 |
| 3873 | 4878 |
| 3874 | 4974 |
| 3875 | 5395 |
| 3876 | 5044 |
| 3877 | 5454 |
| 3878 | 5533 |
| 3879 | 5966 |
| 3880 | 5179 |
| 3881 | 5580 |
| 3882 | 5647 |
| 3883 | 6030 |
| 3884 | 5734 |
| 3885 | 6128 |
| 3886 | 6174 |
| 3887 | 6574 |
| 3888 | 5299 |
| 3889 | 5659 |
| 3890 | 5785 |
| 3891 | 6151 |
| 3892 | 5834 |
| 3893 | 6224 |
| 3894 | 6276 |
| 3895 | 6631 |
| 3896 | 5928 |
| 3897 | 6296 |
| 3898 | 6361 |
| 3899 | 6705 |
| 3900 | 6408 |
| 3901 | 6789 |
| 3902 | 6849 |
| 3903 | 7211 |
| 3904 | 4518 |
| 3905 | 4911 |
| 3906 | 5127 |
| 3907 | 5565 |
| 3908 | 5205 |
| 3909 | 5628 |
| 3910 | 5718 |
| 3911 | 6099 |
| 3912 | 5334 |
| 3913 | 5798 |
| 3914 | 5678 |
| 3915 | 6189 |
| 3916 | 5877 |
| 3917 | 6252 |
| 3918 | 6332 |
| 3919 | 6665 |
| 3920 | 5443 |
| 3921 | 5763 |
| 3922 | 5918 |
| 3923 | 6288 |
| 3924 | 5984 |
| 3925 | 6353 |
| 3926 | 6404 |
| 3927 | 6747 |
| 3928 | 6059 |
| 3929 | 6425 |
| 3930 | 6518 |
| 3931 | 6805 |
| 3932 | 6564 |
| 3933 | 6894 |
| 3934 | 6947 |
| 3935 | 7320 |
| 3936 | 5545 |
| 3937 | 5956 |
| 3938 | 6041 |
| 3939 | 6391 |
| 3940 | 6144 |
| 3941 | 6456 |
| 3942 | 6537 |
| 3943 | 6877 |

TABLE Z17-continued

| with a sequence length of 8192: | |
|---|---|
| Polarized channel sequence number | Reliability or reliability sequence number |
| 3944 | 6201 |
| 3945 | 6541 |
| 3946 | 6626 |
| 3947 | 6912 |
| 3948 | 6675 |
| 3949 | 6983 |
| 3950 | 7052 |
| 3951 | 7353 |
| 3952 | 6304 |
| 3953 | 6641 |
| 3954 | 6731 |
| 3955 | 7008 |
| 3956 | 6778 |
| 3957 | 7059 |
| 3958 | 7112 |
| 3959 | 7424 |
| 3960 | 6832 |
| 3961 | 7139 |
| 3962 | 7196 |
| 3963 | 7480 |
| 3964 | 7233 |
| 3965 | 7541 |
| 3966 | 7607 |
| 3967 | 7841 |
| 3968 | 4800 |
| 3969 | 5097 |
| 3970 | 5226 |
| 3971 | 5747 |
| 3972 | 5384 |
| 3973 | 5821 |
| 3974 | 5861 |
| 3975 | 6316 |
| 3976 | 5509 |
| 3977 | 5904 |
| 3978 | 5991 |
| 3979 | 6383 |
| 3980 | 6069 |
| 3981 | 6443 |
| 3982 | 6482 |
| 3983 | 6871 |
| 3984 | 5592 |
| 3985 | 6008 |
| 3986 | 6095 |
| 3987 | 6460 |
| 3988 | 6162 |
| 3989 | 6523 |
| 3990 | 6593 |
| 3991 | 6935 |
| 3992 | 6240 |
| 3993 | 6607 |
| 3994 | 6656 |
| 3995 | 6971 |
| 3996 | 6736 |
| 3997 | 7046 |
| 3998 | 7105 |
| 3999 | 7414 |
| 4000 | 5696 |
| 4001 | 6114 |
| 4002 | 6205 |
| 4003 | 6560 |
| 4004 | 6264 |
| 4005 | 6612 |
| 4006 | 6695 |
| 4007 | 7014 |
| 4008 | 6370 |
| 4009 | 6721 |
| 4010 | 6784 |
| 4011 | 7072 |
| 4012 | 6827 |
| 4013 | 7132 |
| 4014 | 7182 |
| 4015 | 7470 |
| 4016 | 6478 |
| 4017 | 6800 |
| 4018 | 6883 |

TABLE Z17-continued

| with a sequence length of 8192: | |
|---|---|
| Polarized channel sequence number | Reliability or reliability sequence number |
| 4019 | 7153 |
| 4020 | 6929 |
| 4021 | 7218 |
| 4022 | 7256 |
| 4023 | 7520 |
| 4024 | 7002 |
| 4025 | 7288 |
| 4026 | 7336 |
| 4027 | 7573 |
| 4028 | 7370 |
| 4029 | 7642 |
| 4030 | 7719 |
| 4031 | 7858 |
| 4032 | 5709 |
| 4033 | 6232 |
| 4034 | 6337 |
| 4035 | 6700 |
| 4036 | 6434 |
| 4037 | 6757 |
| 4038 | 6816 |
| 4039 | 7146 |
| 4040 | 6500 |
| 4041 | 6838 |
| 4042 | 6900 |
| 4043 | 7204 |
| 4044 | 6965 |
| 4045 | 7249 |
| 4046 | 7304 |
| 4047 | 7562 |
| 4048 | 6583 |
| 4049 | 6941 |
| 4050 | 6977 |
| 4051 | 7272 |
| 4052 | 7065 |
| 4053 | 7328 |
| 4054 | 7362 |
| 4055 | 7654 |
| 4056 | 7098 |
| 4057 | 7379 |
| 4058 | 7442 |
| 4059 | 7680 |
| 4060 | 7490 |
| 4061 | 7733 |
| 4062 | 7762 |
| 4063 | 7957 |
| 4064 | 6680 |
| 4065 | 7033 |
| 4066 | 7092 |
| 4067 | 7345 |
| 4068 | 7160 |
| 4069 | 7405 |
| 4070 | 7451 |
| 4071 | 7692 |
| 4072 | 7226 |
| 4073 | 7461 |
| 4074 | 7530 |
| 4075 | 7747 |
| 4076 | 7595 |
| 4077 | 7776 |
| 4078 | 7808 |
| 4079 | 7981 |
| 4080 | 7296 |
| 4081 | 7552 |
| 4082 | 7618 |
| 4083 | 7792 |
| 4084 | 7630 |
| 4085 | 7824 |
| 4086 | 7876 |
| 4087 | 8033 |
| 4088 | 7706 |
| 4089 | 7895 |
| 4090 | 7915 |
| 4091 | 8006 |
| 4092 | 7936 |
| 4093 | 8064 |

TABLE Z17-continued

| with a sequence length of 8192: | |
|---|---|
| Polarized channel sequence number | Reliability or reliability sequence number |
| 4094 | 8098 |
| 4095 | 8138 |
| 4096 | 12 |
| 4097 | 53 |
| 4098 | 93 |
| 4099 | 234 |
| 4100 | 128 |
| 4101 | 333 |
| 4102 | 384 |
| 4103 | 561 |
| 4104 | 158 |
| 4105 | 367 |
| 4106 | 415 |
| 4107 | 596 |
| 4108 | 458 |
| 4109 | 661 |
| 4110 | 681 |
| 4111 | 1002 |
| 4112 | 185 |
| 4113 | 399 |
| 4114 | 429 |
| 4115 | 650 |
| 4116 | 499 |
| 4117 | 721 |
| 4118 | 795 |
| 4119 | 1045 |
| 4120 | 524 |
| 4121 | 786 |
| 4122 | 758 |
| 4123 | 1099 |
| 4124 | 871 |
| 4125 | 1152 |
| 4126 | 1208 |
| 4127 | 1570 |
| 4128 | 210 |
| 4129 | 472 |
| 4130 | 512 |
| 4131 | 740 |
| 4132 | 537 |
| 4133 | 777 |
| 4134 | 829 |
| 4135 | 1119 |
| 4136 | 607 |
| 4137 | 855 |
| 4138 | 887 |
| 4139 | 1158 |
| 4140 | 958 |
| 4141 | 1244 |
| 4142 | 1280 |
| 4143 | 1650 |
| 4144 | 671 |
| 4145 | 903 |
| 4146 | 987 |
| 4147 | 1262 |
| 4148 | 1038 |
| 4149 | 1320 |
| 4150 | 1370 |
| 4151 | 1709 |
| 4152 | 1093 |
| 4153 | 1391 |
| 4154 | 1450 |
| 4155 | 1787 |
| 4156 | 1496 |
| 4157 | 1871 |
| 4158 | 1951 |
| 4159 | 2380 |
| 4160 | 350 |
| 4161 | 485 |
| 4162 | 584 |
| 4163 | 846 |
| 4164 | 618 |
| 4165 | 879 |
| 4166 | 950 |
| 4167 | 1226 |
| 4168 | 701 |

TABLE Z17-continued

| with a sequence length of 8192: | |
|---|---|
| Polarized channel sequence number | Reliability or reliability sequence number |
| 4169 | 995 |
| 4170 | 911 |
| 4171 | 1297 |
| 4172 | 1059 |
| 4173 | 1348 |
| 4174 | 1413 |
| 4175 | 1740 |
| 4176 | 768 |
| 4177 | 980 |
| 4178 | 1079 |
| 4179 | 1375 |
| 4180 | 1132 |
| 4181 | 1439 |
| 4182 | 1486 |
| 4183 | 1834 |
| 4184 | 1196 |
| 4185 | 1501 |
| 4186 | 1594 |
| 4187 | 1891 |
| 4188 | 1636 |
| 4189 | 1994 |
| 4190 | 2066 |
| 4191 | 2526 |
| 4192 | 838 |
| 4193 | 1106 |
| 4194 | 1183 |
| 4195 | 1475 |
| 4196 | 1256 |
| 4197 | 1531 |
| 4198 | 1617 |
| 4199 | 1967 |
| 4200 | 1303 |
| 4201 | 1622 |
| 4202 | 1704 |
| 4203 | 2013 |
| 4204 | 1744 |
| 4205 | 2107 |
| 4206 | 2186 |
| 4207 | 2584 |
| 4208 | 1397 |
| 4209 | 1718 |
| 4210 | 1817 |
| 4211 | 2132 |
| 4212 | 1854 |
| 4213 | 2200 |
| 4214 | 2273 |
| 4215 | 2696 |
| 4216 | 1927 |
| 4217 | 2297 |
| 4218 | 2354 |
| 4219 | 2782 |
| 4220 | 2428 |
| 4221 | 2868 |
| 4222 | 2978 |
| 4223 | 3469 |
| 4224 | 444 |
| 4225 | 573 |
| 4226 | 640 |
| 4227 | 973 |
| 4228 | 730 |
| 4229 | 1009 |
| 4230 | 1052 |
| 4231 | 1402 |
| 4232 | 803 |
| 4233 | 1072 |
| 4234 | 1139 |
| 4235 | 1460 |
| 4236 | 1202 |
| 4237 | 1521 |
| 4238 | 1560 |
| 4239 | 1963 |
| 4240 | 863 |
| 4241 | 1145 |
| 4242 | 1220 |
| 4243 | 1545 |

TABLE Z17-continued

| with a sequence length of 8192: | |
|---|---|
| Polarized channel sequence number | Reliability or reliability sequence number |
| 4244 | 1274 |
| 4245 | 1598 |
| 4246 | 1664 |
| 4247 | 2044 |
| 4248 | 1337 |
| 4249 | 1677 |
| 4250 | 1722 |
| 4251 | 2085 |
| 4252 | 1821 |
| 4253 | 2172 |
| 4254 | 2263 |
| 4255 | 2673 |
| 4256 | 927 |
| 4257 | 1232 |
| 4258 | 1308 |
| 4259 | 1627 |
| 4260 | 1364 |
| 4261 | 1686 |
| 4262 | 1766 |
| 4263 | 2150 |
| 4264 | 1455 |
| 4265 | 1796 |
| 4266 | 1863 |
| 4267 | 2221 |
| 4268 | 1915 |
| 4269 | 2283 |
| 4270 | 2340 |
| 4271 | 2768 |
| 4272 | 1555 |
| 4273 | 1887 |
| 4274 | 1986 |
| 4275 | 2324 |
| 4276 | 2029 |
| 4277 | 2393 |
| 4278 | 2457 |
| 4279 | 2821 |
| 4280 | 2122 |
| 4281 | 2482 |
| 4282 | 2560 |
| 4283 | 2930 |
| 4284 | 2623 |
| 4285 | 3054 |
| 4286 | 3195 |
| 4287 | 3510 |
| 4288 | 942 |
| 4289 | 1331 |
| 4290 | 1423 |
| 4291 | 1783 |
| 4292 | 1511 |
| 4293 | 1838 |
| 4294 | 1903 |
| 4295 | 2310 |
| 4296 | 1574 |
| 4297 | 1935 |
| 4298 | 2002 |
| 4299 | 2367 |
| 4300 | 2074 |
| 4301 | 2444 |
| 4302 | 2510 |
| 4303 | 2906 |
| 4304 | 1659 |
| 4305 | 2048 |
| 4306 | 2100 |
| 4307 | 2470 |
| 4308 | 2204 |
| 4309 | 2547 |
| 4310 | 2608 |
| 4311 | 3074 |
| 4312 | 2246 |
| 4313 | 2638 |
| 4314 | 2711 |
| 4315 | 3107 |
| 4316 | 2804 |
| 4317 | 3217 |
| 4318 | 3285 |

TABLE Z17-continued with a sequence length of 8192:

| Polarized channel sequence number | Reliability or reliability sequence number |
|---|---|
| 4319 | 3796 |
| 4320 | 1761 |
| 4321 | 2158 |
| 4322 | 2232 |
| 4323 | 2575 |
| 4324 | 2327 |
| 4325 | 2655 |
| 4326 | 2722 |
| 4327 | 3135 |
| 4328 | 2406 |
| 4329 | 2751 |
| 4330 | 2843 |
| 4331 | 3251 |
| 4332 | 2951 |
| 4333 | 3308 |
| 4334 | 3384 |
| 4335 | 3881 |
| 4336 | 2498 |
| 4337 | 2892 |
| 4338 | 2999 |
| 4339 | 3344 |
| 4340 | 3028 |
| 4341 | 3428 |
| 4342 | 3561 |
| 4343 | 4074 |
| 4344 | 3162 |
| 4345 | 3612 |
| 4346 | 3664 |
| 4347 | 3973 |
| 4348 | 3735 |
| 4349 | 4231 |
| 4350 | 4419 |
| 4351 | 4727 |
| 4352 | 256 |
| 4353 | 549 |
| 4354 | 711 |
| 4355 | 1086 |
| 4356 | 821 |
| 4357 | 1126 |
| 4358 | 1250 |
| 4359 | 1584 |
| 4360 | 896 |
| 4361 | 1214 |
| 4362 | 1314 |
| 4363 | 1654 |
| 4364 | 1408 |
| 4365 | 1757 |
| 4366 | 1792 |
| 4367 | 2239 |
| 4368 | 965 |
| 4369 | 1285 |
| 4370 | 1359 |
| 4371 | 1735 |
| 4372 | 1491 |
| 4373 | 1825 |
| 4374 | 1947 |
| 4375 | 2280 |
| 4376 | 1536 |
| 4377 | 1931 |
| 4378 | 1883 |
| 4379 | 2370 |
| 4380 | 2051 |
| 4381 | 2447 |
| 4382 | 2513 |
| 4383 | 2989 |
| 4384 | 1024 |
| 4385 | 1444 |
| 4386 | 1516 |
| 4387 | 1859 |
| 4388 | 1565 |
| 4389 | 1907 |
| 4390 | 1975 |
| 4391 | 2399 |
| 4392 | 1673 |
| 4393 | 2025 |

TABLE Z17-continued with a sequence length of 8192:

| Polarized channel sequence number | Reliability or reliability sequence number |
|---|---|
| 4394 | 2081 |
| 4395 | 2460 |
| 4396 | 2168 |
| 4397 | 2566 |
| 4398 | 2614 |
| 4399 | 3084 |
| 4400 | 1774 |
| 4401 | 2096 |
| 4402 | 2214 |
| 4403 | 2596 |
| 4404 | 2266 |
| 4405 | 2667 |
| 4406 | 2731 |
| 4407 | 3152 |
| 4408 | 2363 |
| 4409 | 2754 |
| 4410 | 2829 |
| 4411 | 3241 |
| 4412 | 2882 |
| 4413 | 3335 |
| 4414 | 3419 |
| 4415 | 3919 |
| 4416 | 1164 |
| 4417 | 1465 |
| 4418 | 1631 |
| 4419 | 2010 |
| 4420 | 1695 |
| 4421 | 2070 |
| 4422 | 2154 |
| 4423 | 2535 |
| 4424 | 1808 |
| 4425 | 2225 |
| 4426 | 2118 |
| 4427 | 2629 |
| 4428 | 2307 |
| 4429 | 2699 |
| 4430 | 2793 |
| 4431 | 3187 |
| 4432 | 1899 |
| 4433 | 2193 |
| 4434 | 2347 |
| 4435 | 2739 |
| 4436 | 2409 |
| 4437 | 2816 |
| 4438 | 2873 |
| 4439 | 3292 |
| 4440 | 2488 |
| 4441 | 2895 |
| 4442 | 3009 |
| 4443 | 3368 |
| 4444 | 3072 |
| 4445 | 3478 |
| 4446 | 3552 |
| 4447 | 4088 |
| 4448 | 1990 |
| 4449 | 2386 |
| 4450 | 2476 |
| 4451 | 2860 |
| 4452 | 2581 |
| 4453 | 2933 |
| 4454 | 3033 |
| 4455 | 3451 |
| 4456 | 2644 |
| 4457 | 3043 |
| 4458 | 3145 |
| 4459 | 3501 |
| 4460 | 3204 |
| 4461 | 3601 |
| 4462 | 3688 |
| 4463 | 4161 |
| 4464 | 2762 |
| 4465 | 3170 |
| 4466 | 3268 |
| 4467 | 3634 |
| 4468 | 3318 |

TABLE Z17-continued with a sequence length of 8192:

| Polarized channel sequence number | Reliability or reliability sequence number |
|---|---|
| 4469 | 3701 |
| 4470 | 3781 |
| 4471 | 4289 |
| 4472 | 3403 |
| 4473 | 3821 |
| 4474 | 3895 |
| 4475 | 4379 |
| 4476 | 3959 |
| 4477 | 4479 |
| 4478 | 4595 |
| 4479 | 5149 |
| 4480 | 1381 |
| 4481 | 1603 |
| 4482 | 1713 |
| 4483 | 2179 |
| 4484 | 1846 |
| 4485 | 2249 |
| 4486 | 2293 |
| 4487 | 2776 |
| 4488 | 1955 |
| 4489 | 2334 |
| 4490 | 2422 |
| 4491 | 2854 |
| 4492 | 2501 |
| 4493 | 2922 |
| 4494 | 2967 |
| 4495 | 3439 |
| 4496 | 2036 |
| 4497 | 2432 |
| 4498 | 2532 |
| 4499 | 2944 |
| 4500 | 2605 |
| 4501 | 3017 |
| 4502 | 3100 |
| 4503 | 3530 |
| 4504 | 2688 |
| 4505 | 3117 |
| 4506 | 3177 |
| 4507 | 3584 |
| 4508 | 3277 |
| 4509 | 3679 |
| 4510 | 3769 |
| 4511 | 4265 |
| 4512 | 2125 |
| 4513 | 2550 |
| 4514 | 2652 |
| 4515 | 3061 |
| 4516 | 2716 |
| 4517 | 3127 |
| 4518 | 3222 |
| 4519 | 3647 |
| 4520 | 2835 |
| 4521 | 3258 |
| 4522 | 3328 |
| 4523 | 3720 |
| 4524 | 3393 |
| 4525 | 3804 |
| 4526 | 3868 |
| 4527 | 4363 |
| 4528 | 2962 |
| 4529 | 3358 |
| 4530 | 3460 |
| 4531 | 3844 |
| 4532 | 3521 |
| 4533 | 3935 |
| 4534 | 4003 |
| 4535 | 4442 |
| 4536 | 3623 |
| 4537 | 4033 |
| 4538 | 4126 |
| 4539 | 4547 |
| 4540 | 4191 |
| 4541 | 4673 |
| 4542 | 4846 |
| 4543 | 5194 |

TABLE Z17-continued with a sequence length of 8192:

| Polarized channel sequence number | Reliability or reliability sequence number |
|---|---|
| 4544 | 2140 |
| 4545 | 2679 |
| 4546 | 2796 |
| 4547 | 3231 |
| 4548 | 2914 |
| 4549 | 3299 |
| 4550 | 3377 |
| 4551 | 3829 |
| 4552 | 2991 |
| 4553 | 3412 |
| 4554 | 3490 |
| 4555 | 3905 |
| 4556 | 3568 |
| 4557 | 3987 |
| 4558 | 4058 |
| 4559 | 4524 |
| 4560 | 3092 |
| 4561 | 3537 |
| 4562 | 3592 |
| 4563 | 4017 |
| 4564 | 3712 |
| 4565 | 4112 |
| 4566 | 4177 |
| 4567 | 4696 |
| 4568 | 3756 |
| 4569 | 4209 |
| 4570 | 4307 |
| 4571 | 4751 |
| 4572 | 4396 |
| 4573 | 4872 |
| 4574 | 4944 |
| 4575 | 5502 |
| 4576 | 3214 |
| 4577 | 3656 |
| 4578 | 3743 |
| 4579 | 4145 |
| 4580 | 3856 |
| 4581 | 4249 |
| 4582 | 4322 |
| 4583 | 4781 |
| 4584 | 3949 |
| 4585 | 4346 |
| 4586 | 4464 |
| 4587 | 4913 |
| 4588 | 4573 |
| 4589 | 4981 |
| 4590 | 5062 |
| 4591 | 5587 |
| 4592 | 4047 |
| 4593 | 4502 |
| 4594 | 4617 |
| 4595 | 5020 |
| 4596 | 4648 |
| 4597 | 5098 |
| 4598 | 5249 |
| 4599 | 5787 |
| 4600 | 4817 |
| 4601 | 5305 |
| 4602 | 5363 |
| 4603 | 5676 |
| 4604 | 5428 |
| 4605 | 5919 |
| 4606 | 6094 |
| 4607 | 6376 |
| 4608 | 276 |
| 4609 | 629 |
| 4610 | 812 |
| 4611 | 1238 |
| 4612 | 935 |
| 4613 | 1342 |
| 4614 | 1470 |
| 4615 | 1850 |
| 4616 | 1031 |
| 4617 | 1429 |
| 4618 | 1550 |

TABLE Z17-continued

| with a sequence length of 8192: | |
|---|---|
| Polarized channel sequence number | Reliability or reliability sequence number |
| 4619 | 1920 |
| 4620 | 1645 |
| 4621 | 2021 |
| 4622 | 2055 |
| 4623 | 2541 |
| 4624 | 1113 |
| 4625 | 1506 |
| 4626 | 1579 |
| 4627 | 1998 |
| 4628 | 1731 |
| 4629 | 2111 |
| 4630 | 2228 |
| 4631 | 2590 |
| 4632 | 1779 |
| 4633 | 2207 |
| 4634 | 2161 |
| 4635 | 2670 |
| 4636 | 2344 |
| 4637 | 2742 |
| 4638 | 2807 |
| 4639 | 3289 |
| 4640 | 1177 |
| 4641 | 1668 |
| 4642 | 1753 |
| 4643 | 2147 |
| 4644 | 1800 |
| 4645 | 2197 |
| 4646 | 2270 |
| 4647 | 2690 |
| 4648 | 1939 |
| 4649 | 2314 |
| 4650 | 2373 |
| 4651 | 2756 |
| 4652 | 2463 |
| 4653 | 2857 |
| 4654 | 2909 |
| 4655 | 3382 |
| 4656 | 2040 |
| 4657 | 2403 |
| 4658 | 2516 |
| 4659 | 2887 |
| 4660 | 2578 |
| 4661 | 2965 |
| 4662 | 3022 |
| 4663 | 3458 |
| 4664 | 2658 |
| 4665 | 3048 |
| 4666 | 3122 |
| 4667 | 3555 |
| 4668 | 3185 |
| 4669 | 3660 |
| 4670 | 3754 |
| 4671 | 4261 |
| 4672 | 1386 |
| 4673 | 1700 |
| 4674 | 1895 |
| 4675 | 2304 |
| 4676 | 1959 |
| 4677 | 2357 |
| 4678 | 2451 |
| 4679 | 2840 |
| 4680 | 2077 |
| 4681 | 2529 |
| 4682 | 2419 |
| 4683 | 2927 |
| 4684 | 2611 |
| 4685 | 2996 |
| 4686 | 3087 |
| 4687 | 3499 |
| 4688 | 2176 |
| 4689 | 2507 |
| 4690 | 2635 |
| 4691 | 3030 |
| 4692 | 2714 |
| 4693 | 3105 |

TABLE Z17-continued

| with a sequence length of 8192: | |
|---|---|
| Polarized channel sequence number | Reliability or reliability sequence number |
| 4694 | 3165 |
| 4695 | 3614 |
| 4696 | 2788 |
| 4697 | 3192 |
| 4698 | 3316 |
| 4699 | 3684 |
| 4700 | 3372 |
| 4701 | 3810 |
| 4702 | 3887 |
| 4703 | 4425 |
| 4704 | 2290 |
| 4705 | 2682 |
| 4706 | 2779 |
| 4707 | 3157 |
| 4708 | 2879 |
| 4709 | 3234 |
| 4710 | 3342 |
| 4711 | 3777 |
| 4712 | 2941 |
| 4713 | 3351 |
| 4714 | 3449 |
| 4715 | 3835 |
| 4716 | 3505 |
| 4717 | 3939 |
| 4718 | 4029 |
| 4719 | 4491 |
| 4720 | 3056 |
| 4721 | 3474 |
| 4722 | 3588 |
| 4723 | 3968 |
| 4724 | 3636 |
| 4725 | 4045 |
| 4726 | 4132 |
| 4727 | 4606 |
| 4728 | 3726 |
| 4729 | 4167 |
| 4730 | 4225 |
| 4731 | 4703 |
| 4732 | 4316 |
| 4733 | 4790 |
| 4734 | 4900 |
| 4735 | 5404 |
| 4736 | 1612 |
| 4737 | 1875 |
| 4738 | 1983 |
| 4739 | 2492 |
| 4740 | 2129 |
| 4741 | 2556 |
| 4742 | 2599 |
| 4743 | 3064 |
| 4744 | 2242 |
| 4745 | 2626 |
| 4746 | 2725 |
| 4747 | 3137 |
| 4748 | 2802 |
| 4749 | 3226 |
| 4750 | 3270 |
| 4751 | 3773 |
| 4752 | 2330 |
| 4753 | 2737 |
| 4754 | 2832 |
| 4755 | 3253 |
| 4756 | 2898 |
| 4757 | 3323 |
| 4758 | 3407 |
| 4759 | 3862 |
| 4760 | 2983 |
| 4761 | 3426 |
| 4762 | 3483 |
| 4763 | 3917 |
| 4764 | 3597 |
| 4765 | 4011 |
| 4766 | 4118 |
| 4767 | 4584 |
| 4768 | 2425 |

TABLE Z17-continued with a sequence length of 8192:

| Polarized channel sequence number | Reliability or reliability sequence number |
|---|---|
| 4769 | 2849 |
| 4770 | 2949 |
| 4771 | 3353 |
| 4772 | 3012 |
| 4773 | 3435 |
| 4774 | 3532 |
| 4775 | 3985 |
| 4776 | 3130 |
| 4777 | 3575 |
| 4778 | 3651 |
| 4779 | 4068 |
| 4780 | 3716 |
| 4781 | 4149 |
| 4782 | 4215 |
| 4783 | 4684 |
| 4784 | 3260 |
| 4785 | 3673 |
| 4786 | 3790 |
| 4787 | 4189 |
| 4788 | 3848 |
| 4789 | 4277 |
| 4790 | 4351 |
| 4791 | 4741 |
| 4792 | 3955 |
| 4793 | 4377 |
| 4794 | 4459 |
| 4795 | 4851 |
| 4796 | 4530 |
| 4797 | 4973 |
| 4798 | 5121 |
| 4799 | 5447 |
| 4800 | 2441 |
| 4801 | 2975 |
| 4802 | 3094 |
| 4803 | 3546 |
| 4804 | 3202 |
| 4805 | 3621 |
| 4806 | 3699 |
| 4807 | 4183 |
| 4808 | 3297 |
| 4809 | 3741 |
| 4810 | 3815 |
| 4811 | 4243 |
| 4812 | 3901 |
| 4813 | 4334 |
| 4814 | 4407 |
| 4815 | 4827 |
| 4816 | 3400 |
| 4817 | 3872 |
| 4818 | 3929 |
| 4819 | 4369 |
| 4820 | 4053 |
| 4821 | 4447 |
| 4822 | 4513 |
| 4823 | 5000 |
| 4824 | 4102 |
| 4825 | 4541 |
| 4826 | 4626 |
| 4827 | 5033 |
| 4828 | 4721 |
| 4829 | 5144 |
| 4830 | 5217 |
| 4831 | 5726 |
| 4832 | 3523 |
| 4833 | 3999 |
| 4834 | 4082 |
| 4835 | 4474 |
| 4836 | 4197 |
| 4837 | 4567 |
| 4838 | 4637 |
| 4839 | 5057 |
| 4840 | 4295 |
| 4841 | 4660 |
| 4842 | 4766 |
| 4843 | 5180 |
| 4844 | 4881 |
| 4845 | 5239 |
| 4846 | 5319 |
| 4847 | 5807 |
| 4848 | 4390 |
| 4849 | 4808 |
| 4850 | 4925 |
| 4851 | 5279 |
| 4852 | 4953 |
| 4853 | 5371 |
| 4854 | 5493 |
| 4855 | 5978 |
| 4856 | 5085 |
| 4857 | 5548 |
| 4858 | 5605 |
| 4859 | 5885 |
| 4860 | 5664 |
| 4861 | 6107 |
| 4862 | 6258 |
| 4863 | 6516 |
| 4864 | 1291 |
| 4865 | 1830 |
| 4866 | 2092 |
| 4867 | 2646 |
| 4868 | 2259 |
| 4869 | 2702 |
| 4870 | 2871 |
| 4871 | 3306 |
| 4872 | 2390 |
| 4873 | 2818 |
| 4874 | 2957 |
| 4875 | 3391 |
| 4876 | 3077 |
| 4877 | 3514 |
| 4878 | 3566 |
| 4879 | 4094 |
| 4880 | 2479 |
| 4881 | 2917 |
| 4882 | 3007 |
| 4883 | 3492 |
| 4884 | 3175 |
| 4885 | 3606 |
| 4886 | 3748 |
| 4887 | 4139 |
| 4888 | 3244 |
| 4889 | 3729 |
| 4890 | 3671 |
| 4891 | 4255 |
| 4892 | 3876 |
| 4893 | 4340 |
| 4894 | 4413 |
| 4895 | 4905 |
| 4896 | 2563 |
| 4897 | 3115 |
| 4898 | 3212 |
| 4899 | 3643 |
| 4900 | 3280 |
| 4901 | 3707 |
| 4902 | 3788 |
| 4903 | 4283 |
| 4904 | 3416 |
| 4905 | 3837 |
| 4906 | 3911 |
| 4907 | 4357 |
| 4908 | 4009 |
| 4909 | 4470 |
| 4910 | 4519 |
| 4911 | 5007 |
| 4912 | 3544 |
| 4913 | 3925 |
| 4914 | 4064 |
| 4915 | 4496 |
| 4916 | 4124 |
| 4917 | 4578 |
| 4918 | 4642 |

TABLE Z17-continued with a sequence length of 8192:

| Polarized channel sequence number | Reliability or reliability sequence number |
|---|---|
| 4919 | 5077 |
| 4920 | 4237 |
| 4921 | 4667 |
| 4922 | 4746 |
| 4923 | 5172 |
| 4924 | 4803 |
| 4925 | 5275 |
| 4926 | 5354 |
| 4927 | 5839 |
| 4928 | 2765 |
| 4929 | 3147 |
| 4930 | 3365 |
| 4931 | 3823 |
| 4932 | 3444 |
| 4933 | 3893 |
| 4934 | 3993 |
| 4935 | 4436 |
| 4936 | 3577 |
| 4937 | 4080 |
| 4938 | 3943 |
| 4939 | 4536 |
| 4940 | 4173 |
| 4941 | 4611 |
| 4942 | 4709 |
| 4943 | 5113 |
| 4944 | 3692 |
| 4945 | 4039 |
| 4946 | 4221 |
| 4947 | 4653 |
| 4948 | 4301 |
| 4949 | 4735 |
| 4950 | 4796 |
| 4951 | 5225 |
| 4952 | 4384 |
| 4953 | 4822 |
| 4954 | 4932 |
| 4955 | 5297 |
| 4956 | 4991 |
| 4957 | 5411 |
| 4958 | 5484 |
| 4959 | 5990 |
| 4960 | 3802 |
| 4961 | 4271 |
| 4962 | 4373 |
| 4963 | 4776 |
| 4964 | 4485 |
| 4965 | 4860 |
| 4966 | 4958 |
| 4967 | 5388 |
| 4968 | 4556 |
| 4969 | 4966 |
| 4970 | 5070 |
| 4971 | 5438 |
| 4972 | 5126 |
| 4973 | 5540 |
| 4974 | 5626 |
| 4975 | 6040 |
| 4976 | 4678 |
| 4977 | 5093 |
| 4978 | 5203 |
| 4979 | 5566 |
| 4980 | 5257 |
| 4981 | 5634 |
| 4982 | 5717 |
| 4983 | 6149 |
| 4984 | 5336 |
| 4985 | 5743 |
| 4986 | 5819 |
| 4987 | 6223 |
| 4988 | 5873 |
| 4989 | 6305 |
| 4990 | 6415 |
| 4991 | 6839 |
| 4992 | 3041 |
| 4993 | 3332 |

TABLE Z17-continued with a sequence length of 8192:

| Polarized channel sequence number | Reliability or reliability sequence number |
|---|---|
| 4994 | 3467 |
| 4995 | 4023 |
| 4996 | 3627 |
| 4997 | 4106 |
| 4998 | 4155 |
| 4999 | 4691 |
| 5000 | 3762 |
| 5001 | 4203 |
| 5002 | 4311 |
| 5003 | 4771 |
| 5004 | 4402 |
| 5005 | 4841 |
| 5006 | 4891 |
| 5007 | 5380 |
| 5008 | 3854 |
| 5009 | 4328 |
| 5010 | 4430 |
| 5011 | 4865 |
| 5012 | 4508 |
| 5013 | 4939 |
| 5014 | 5028 |
| 5015 | 5467 |
| 5016 | 4600 |
| 5017 | 5042 |
| 5018 | 5106 |
| 5019 | 5519 |
| 5020 | 5212 |
| 5021 | 5614 |
| 5022 | 5705 |
| 5023 | 6137 |
| 5024 | 3963 |
| 5025 | 4453 |
| 5026 | 4562 |
| 5027 | 4986 |
| 5028 | 4631 |
| 5029 | 5048 |
| 5030 | 5157 |
| 5031 | 5575 |
| 5032 | 4757 |
| 5033 | 5190 |
| 5034 | 5265 |
| 5035 | 5655 |
| 5036 | 5328 |
| 5037 | 5738 |
| 5038 | 5796 |
| 5039 | 6211 |
| 5040 | 4886 |
| 5041 | 5289 |
| 5042 | 5394 |
| 5043 | 5764 |
| 5044 | 5458 |
| 5045 | 5850 |
| 5046 | 5907 |
| 5047 | 6274 |
| 5048 | 5557 |
| 5049 | 5943 |
| 5050 | 6017 |
| 5051 | 6356 |
| 5052 | 6067 |
| 5053 | 6472 |
| 5054 | 6606 |
| 5055 | 6874 |
| 5056 | 3979 |
| 5057 | 4589 |
| 5058 | 4716 |
| 5059 | 5167 |
| 5060 | 4836 |
| 5061 | 5235 |
| 5062 | 5314 |
| 5063 | 5755 |
| 5064 | 4919 |
| 5065 | 5346 |
| 5066 | 5421 |
| 5067 | 5830 |
| 5068 | 5510 |

TABLE Z17-continued

| with a sequence length of 8192: | |
|---|---|
| Polarized channel sequence number | Reliability or reliability sequence number |
| 5069 | 5896 |
| 5070 | 5967 |
| 5071 | 6340 |
| 5072 | 5015 |
| 5073 | 5476 |
| 5074 | 5528 |
| 5075 | 5931 |
| 5076 | 5646 |
| 5077 | 6002 |
| 5078 | 6053 |
| 5079 | 6495 |
| 5080 | 5697 |
| 5081 | 6079 |
| 5082 | 6164 |
| 5083 | 6536 |
| 5084 | 6239 |
| 5085 | 6634 |
| 5086 | 6684 |
| 5087 | 7088 |
| 5088 | 5136 |
| 5089 | 5596 |
| 5090 | 5685 |
| 5091 | 6028 |
| 5092 | 5775 |
| 5093 | 6122 |
| 5094 | 6180 |
| 5095 | 6561 |
| 5096 | 5862 |
| 5097 | 6195 |
| 5098 | 6289 |
| 5099 | 6659 |
| 5100 | 6396 |
| 5101 | 6713 |
| 5102 | 6774 |
| 5103 | 7148 |
| 5104 | 5954 |
| 5105 | 6325 |
| 5106 | 6432 |
| 5107 | 6743 |
| 5108 | 6452 |
| 5109 | 6803 |
| 5110 | 6909 |
| 5111 | 7284 |
| 5112 | 6585 |
| 5113 | 6950 |
| 5114 | 6992 |
| 5115 | 7209 |
| 5116 | 7039 |
| 5117 | 7371 |
| 5118 | 7488 |
| 5119 | 7655 |
| 5120 | 296 |
| 5121 | 691 |
| 5122 | 919 |
| 5123 | 1418 |
| 5124 | 1065 |
| 5125 | 1589 |
| 5126 | 1726 |
| 5127 | 2136 |
| 5128 | 1171 |
| 5129 | 1691 |
| 5130 | 1804 |
| 5131 | 2211 |
| 5132 | 1911 |
| 5133 | 2337 |
| 5134 | 2377 |
| 5135 | 2903 |
| 5136 | 1268 |
| 5137 | 1770 |
| 5138 | 1842 |
| 5139 | 2317 |
| 5140 | 2006 |
| 5141 | 2435 |
| 5142 | 2553 |
| 5143 | 2959 |

TABLE Z17-continued

| with a sequence length of 8192: | |
|---|---|
| Polarized channel sequence number | Reliability or reliability sequence number |
| 5144 | 2059 |
| 5145 | 2538 |
| 5146 | 2485 |
| 5147 | 3038 |
| 5148 | 2693 |
| 5149 | 3120 |
| 5150 | 3190 |
| 5151 | 3675 |
| 5152 | 1353 |
| 5153 | 1943 |
| 5154 | 2032 |
| 5155 | 2473 |
| 5156 | 2089 |
| 5157 | 2523 |
| 5158 | 2620 |
| 5159 | 3069 |
| 5160 | 2235 |
| 5161 | 2661 |
| 5162 | 2719 |
| 5163 | 3132 |
| 5164 | 2824 |
| 5165 | 3246 |
| 5166 | 3294 |
| 5167 | 3771 |
| 5168 | 2360 |
| 5169 | 2745 |
| 5170 | 2876 |
| 5171 | 3273 |
| 5172 | 2946 |
| 5173 | 3356 |
| 5174 | 3414 |
| 5175 | 3846 |
| 5176 | 3025 |
| 5177 | 3446 |
| 5178 | 3517 |
| 5179 | 3941 |
| 5180 | 3581 |
| 5181 | 4037 |
| 5182 | 4135 |
| 5183 | 4651 |
| 5184 | 1640 |
| 5185 | 1979 |
| 5186 | 2190 |
| 5187 | 2649 |
| 5188 | 2256 |
| 5189 | 2705 |
| 5190 | 2813 |
| 5191 | 3219 |
| 5192 | 2396 |
| 5193 | 2890 |
| 5194 | 2759 |
| 5195 | 3320 |
| 5196 | 2981 |
| 5197 | 3389 |
| 5198 | 3481 |
| 5199 | 3885 |
| 5200 | 2504 |
| 5201 | 2862 |
| 5202 | 3002 |
| 5203 | 3423 |
| 5204 | 3089 |
| 5205 | 3503 |
| 5206 | 3564 |
| 5207 | 3995 |
| 5208 | 3172 |
| 5209 | 3586 |
| 5210 | 3703 |
| 5211 | 4060 |
| 5212 | 3760 |
| 5213 | 4187 |
| 5214 | 4269 |
| 5215 | 4813 |
| 5216 | 2632 |
| 5217 | 3046 |
| 5218 | 3160 |

TABLE Z17-continued

| with a sequence length of 8192: | |
|---|---|
| Polarized channel sequence number | Reliability or reliability sequence number |
| 5219 | 3557 |
| 5220 | 3265 |
| 5221 | 3625 |
| 5222 | 3733 |
| 5223 | 4159 |
| 5224 | 3330 |
| 5225 | 3737 |
| 5226 | 3840 |
| 5227 | 4211 |
| 5228 | 3889 |
| 5229 | 4320 |
| 5230 | 4421 |
| 5231 | 4882 |
| 5232 | 3456 |
| 5233 | 3860 |
| 5234 | 3971 |
| 5235 | 4353 |
| 5236 | 4019 |
| 5237 | 4438 |
| 5238 | 4528 |
| 5239 | 5003 |
| 5240 | 4104 |
| 5241 | 4552 |
| 5242 | 4620 |
| 5243 | 5096 |
| 5244 | 4707 |
| 5245 | 5183 |
| 5246 | 5300 |
| 5247 | 5773 |
| 5248 | 1879 |
| 5249 | 2165 |
| 5250 | 2300 |
| 5251 | 2851 |
| 5252 | 2454 |
| 5253 | 2911 |
| 5254 | 2973 |
| 5255 | 3462 |
| 5256 | 2572 |
| 5257 | 2994 |
| 5258 | 3102 |
| 5259 | 3535 |
| 5260 | 3180 |
| 5261 | 3616 |
| 5262 | 3662 |
| 5263 | 4153 |
| 5264 | 2676 |
| 5265 | 3110 |
| 5266 | 3207 |
| 5267 | 3640 |
| 5268 | 3282 |
| 5269 | 3709 |
| 5270 | 3794 |
| 5271 | 4245 |
| 5272 | 3370 |
| 5273 | 3813 |
| 5274 | 3864 |
| 5275 | 4297 |
| 5276 | 3977 |
| 5277 | 4405 |
| 5278 | 4511 |
| 5279 | 4978 |
| 5280 | 2773 |
| 5281 | 3229 |
| 5282 | 3339 |
| 5283 | 3745 |
| 5284 | 3405 |
| 5285 | 3819 |
| 5286 | 3913 |
| 5287 | 4371 |
| 5288 | 3526 |
| 5289 | 3951 |
| 5290 | 4031 |
| 5291 | 4461 |
| 5292 | 4090 |
| 5293 | 4539 |

TABLE Z17-continued

| with a sequence length of 8192: | |
|---|---|
| Polarized channel sequence number | Reliability or reliability sequence number |
| 5294 | 4604 |
| 5295 | 5082 |
| 5296 | 3653 |
| 5297 | 4055 |
| 5298 | 4175 |
| 5299 | 4582 |
| 5300 | 4229 |
| 5301 | 4666 |
| 5302 | 4737 |
| 5303 | 5138 |
| 5304 | 4338 |
| 5305 | 4767 |
| 5306 | 4855 |
| 5307 | 5251 |
| 5308 | 4922 |
| 5309 | 5374 |
| 5310 | 5516 |
| 5311 | 5810 |
| 5312 | 2799 |
| 5313 | 3361 |
| 5314 | 3485 |
| 5315 | 3933 |
| 5316 | 3603 |
| 5317 | 4001 |
| 5318 | 4076 |
| 5319 | 4571 |
| 5320 | 3682 |
| 5321 | 4116 |
| 5322 | 4201 |
| 5323 | 4635 |
| 5324 | 4281 |
| 5325 | 4723 |
| 5326 | 4799 |
| 5327 | 5223 |
| 5328 | 3785 |
| 5329 | 4251 |
| 5330 | 4314 |
| 5331 | 4755 |
| 5332 | 4444 |
| 5333 | 4837 |
| 5334 | 4908 |
| 5335 | 5397 |
| 5336 | 4495 |
| 5337 | 4941 |
| 5338 | 5017 |
| 5339 | 5431 |
| 5340 | 5118 |
| 5341 | 5537 |
| 5342 | 5602 |
| 5343 | 6049 |
| 5344 | 3909 |
| 5345 | 4388 |
| 5346 | 4478 |
| 5347 | 4869 |
| 5348 | 4587 |
| 5349 | 4961 |
| 5350 | 5032 |
| 5351 | 5455 |
| 5352 | 4682 |
| 5353 | 5058 |
| 5354 | 5160 |
| 5355 | 5569 |
| 5356 | 5271 |
| 5357 | 5629 |
| 5358 | 5700 |
| 5359 | 6119 |
| 5360 | 4785 |
| 5361 | 5209 |
| 5362 | 5322 |
| 5363 | 5661 |
| 5364 | 5349 |
| 5365 | 5739 |
| 5366 | 5853 |
| 5367 | 6270 |
| 5368 | 5481 |

TABLE Z17-continued with a sequence length of 8192:

| Polarized channel sequence number | Reliability or reliability sequence number |
|---|---|
| 5369 | 5893 |
| 5370 | 5940 |
| 5371 | 6192 |
| 5372 | 5999 |
| 5373 | 6386 |
| 5374 | 6522 |
| 5375 | 6739 |
| 5376 | 1480 |
| 5377 | 2114 |
| 5378 | 2415 |
| 5379 | 3015 |
| 5380 | 2602 |
| 5381 | 3079 |
| 5382 | 3256 |
| 5383 | 3697 |
| 5384 | 2734 |
| 5385 | 3200 |
| 5386 | 3346 |
| 5387 | 3779 |
| 5388 | 3471 |
| 5389 | 3903 |
| 5390 | 3947 |
| 5391 | 4483 |
| 5392 | 2838 |
| 5393 | 3304 |
| 5394 | 3396 |
| 5395 | 3879 |
| 5396 | 3572 |
| 5397 | 3981 |
| 5398 | 4130 |
| 5399 | 4534 |
| 5400 | 3632 |
| 5401 | 4110 |
| 5402 | 4051 |
| 5403 | 4640 |
| 5404 | 4257 |
| 5405 | 4728 |
| 5406 | 4804 |
| 5407 | 5308 |
| 5408 | 2925 |
| 5409 | 3512 |
| 5410 | 3608 |
| 5411 | 4025 |
| 5412 | 3669 |
| 5413 | 4086 |
| 5414 | 4163 |
| 5415 | 4671 |
| 5416 | 3806 |
| 5417 | 4223 |
| 5418 | 4291 |
| 5419 | 4743 |
| 5420 | 4400 |
| 5421 | 4863 |
| 5422 | 4917 |
| 5423 | 5407 |
| 5424 | 3921 |
| 5425 | 4309 |
| 5426 | 4455 |
| 5427 | 4895 |
| 5428 | 4517 |
| 5429 | 4970 |
| 5430 | 5040 |
| 5431 | 5473 |
| 5432 | 4629 |
| 5433 | 5065 |
| 5434 | 5141 |
| 5435 | 5560 |
| 5436 | 5201 |
| 5437 | 5652 |
| 5438 | 5732 |
| 5439 | 6152 |
| 5440 | 3142 |
| 5441 | 3541 |
| 5442 | 3752 |
| 5443 | 4207 |

TABLE Z17-continued with a sequence length of 8192:

| Polarized channel sequence number | Reliability or reliability sequence number |
|---|---|
| 5444 | 3827 |
| 5445 | 4275 |
| 5446 | 4382 |
| 5447 | 4831 |
| 5448 | 3965 |
| 5449 | 4466 |
| 5450 | 4332 |
| 5451 | 4930 |
| 5452 | 4565 |
| 5453 | 5008 |
| 5454 | 5105 |
| 5455 | 5508 |
| 5456 | 4072 |
| 5457 | 4426 |
| 5458 | 4615 |
| 5459 | 5050 |
| 5460 | 4687 |
| 5461 | 5129 |
| 5462 | 5191 |
| 5463 | 5611 |
| 5464 | 4774 |
| 5465 | 5214 |
| 5466 | 5332 |
| 5467 | 5682 |
| 5468 | 5391 |
| 5469 | 5781 |
| 5470 | 5845 |
| 5471 | 6283 |
| 5472 | 4181 |
| 5473 | 4657 |
| 5474 | 4760 |
| 5475 | 5178 |
| 5476 | 4877 |
| 5477 | 5254 |
| 5478 | 5357 |
| 5479 | 5758 |
| 5480 | 4948 |
| 5481 | 5366 |
| 5482 | 5464 |
| 5483 | 5802 |
| 5484 | 5525 |
| 5485 | 5887 |
| 5486 | 5961 |
| 5487 | 6334 |
| 5488 | 5073 |
| 5489 | 5490 |
| 5490 | 5584 |
| 5491 | 5913 |
| 5492 | 5637 |
| 5493 | 5972 |
| 5494 | 6038 |
| 5495 | 6426 |
| 5496 | 5714 |
| 5497 | 6071 |
| 5498 | 6131 |
| 5499 | 6492 |
| 5500 | 6183 |
| 5501 | 6567 |
| 5502 | 6648 |
| 5503 | 7022 |
| 5504 | 3433 |
| 5505 | 3718 |
| 5506 | 3852 |
| 5507 | 4415 |
| 5508 | 4007 |
| 5509 | 4500 |
| 5510 | 4550 |
| 5511 | 5087 |
| 5512 | 4141 |
| 5513 | 4598 |
| 5514 | 4698 |
| 5515 | 5168 |
| 5516 | 4789 |
| 5517 | 5243 |
| 5518 | 5291 |

TABLE Z17-continued

| with a sequence length of 8192: | |
|---|---|
| Polarized channel sequence number | Reliability or reliability sequence number |
| 5519 | 5746 |
| 5520 | 4235 |
| 5521 | 4712 |
| 5522 | 4824 |
| 5523 | 5263 |
| 5524 | 4903 |
| 5525 | 5339 |
| 5526 | 5424 |
| 5527 | 5825 |
| 5528 | 4995 |
| 5529 | 5441 |
| 5530 | 5499 |
| 5531 | 5870 |
| 5532 | 5593 |
| 5533 | 5951 |
| 5534 | 6025 |
| 5535 | 6409 |
| 5536 | 4342 |
| 5537 | 4844 |
| 5538 | 4956 |
| 5539 | 5383 |
| 5540 | 5025 |
| 5541 | 5450 |
| 5542 | 5543 |
| 5543 | 5926 |
| 5544 | 5152 |
| 5545 | 5578 |
| 5546 | 5643 |
| 5547 | 5986 |
| 5548 | 5708 |
| 5549 | 6058 |
| 5550 | 6109 |
| 5551 | 6479 |
| 5552 | 5283 |
| 5553 | 5673 |
| 5554 | 5767 |
| 5555 | 6089 |
| 5556 | 5816 |
| 5557 | 6161 |
| 5558 | 6217 |
| 5559 | 6540 |
| 5560 | 5905 |
| 5561 | 6242 |
| 5562 | 6311 |
| 5563 | 6616 |
| 5564 | 6360 |
| 5565 | 6703 |
| 5566 | 6823 |
| 5567 | 7053 |
| 5568 | 4359 |
| 5569 | 4983 |
| 5570 | 5110 |
| 5571 | 5551 |
| 5572 | 5231 |
| 5573 | 5620 |
| 5574 | 5691 |
| 5575 | 6076 |
| 5576 | 5311 |
| 5577 | 5723 |
| 5578 | 5790 |
| 5579 | 6139 |
| 5580 | 5859 |
| 5581 | 6204 |
| 5582 | 6261 |
| 5583 | 6599 |
| 5584 | 5414 |
| 5585 | 5833 |
| 5586 | 5879 |
| 5587 | 6230 |
| 5588 | 5981 |
| 5589 | 6299 |
| 5590 | 6347 |
| 5591 | 6720 |
| 5592 | 6020 |
| 5593 | 6369 |

TABLE Z17-continued

| with a sequence length of 8192: | |
|---|---|
| Polarized channel sequence number | Reliability or reliability sequence number |
| 5594 | 6439 |
| 5595 | 6758 |
| 5596 | 6506 |
| 5597 | 6842 |
| 5598 | 6890 |
| 5599 | 7238 |
| 5600 | 5534 |
| 5601 | 5934 |
| 5602 | 6007 |
| 5603 | 6321 |
| 5604 | 6101 |
| 5605 | 6399 |
| 5606 | 6449 |
| 5607 | 6781 |
| 5608 | 6173 |
| 5609 | 6466 |
| 5610 | 6553 |
| 5611 | 6865 |
| 5612 | 6630 |
| 5613 | 6914 |
| 5614 | 6967 |
| 5615 | 7290 |
| 5616 | 6251 |
| 5617 | 6581 |
| 5618 | 6667 |
| 5619 | 6938 |
| 5620 | 6688 |
| 5621 | 6988 |
| 5622 | 7083 |
| 5623 | 7404 |
| 5624 | 6799 |
| 5625 | 7120 |
| 5626 | 7157 |
| 5627 | 7337 |
| 5628 | 7194 |
| 5629 | 7475 |
| 5630 | 7574 |
| 5631 | 7720 |
| 5632 | 1540 |
| 5633 | 2276 |
| 5634 | 2587 |
| 5635 | 3239 |
| 5636 | 2785 |
| 5637 | 3379 |
| 5638 | 3548 |
| 5639 | 4015 |
| 5640 | 2938 |
| 5641 | 3494 |
| 5642 | 3645 |
| 5643 | 4098 |
| 5644 | 3764 |
| 5645 | 4217 |
| 5646 | 4263 |
| 5647 | 4832 |
| 5648 | 3059 |
| 5649 | 3595 |
| 5650 | 3690 |
| 5651 | 4195 |
| 5652 | 3870 |
| 5653 | 4326 |
| 5654 | 4472 |
| 5655 | 4888 |
| 5656 | 3927 |
| 5657 | 4449 |
| 5658 | 4394 |
| 5659 | 4975 |
| 5660 | 4609 |
| 5661 | 5053 |
| 5662 | 5124 |
| 5663 | 5608 |
| 5664 | 3150 |
| 5665 | 3798 |
| 5666 | 3897 |
| 5667 | 4365 |
| 5668 | 3957 |

TABLE Z17-continued with a sequence length of 8192:

| Polarized channel sequence number | Reliability or reliability sequence number |
|---|---|
| 5669 | 4432 |
| 5670 | 4523 |
| 5671 | 4998 |
| 5672 | 4120 |
| 5673 | 4576 |
| 5674 | 4646 |
| 5675 | 5068 |
| 5676 | 4748 |
| 5677 | 5175 |
| 5678 | 5228 |
| 5679 | 5694 |
| 5680 | 4241 |
| 5681 | 4676 |
| 5682 | 4810 |
| 5683 | 5206 |
| 5684 | 4874 |
| 5685 | 5286 |
| 5686 | 5343 |
| 5687 | 5761 |
| 5688 | 4964 |
| 5689 | 5368 |
| 5690 | 5444 |
| 5691 | 5848 |
| 5692 | 5505 |
| 5693 | 5937 |
| 5694 | 6014 |
| 5695 | 6406 |
| 5696 | 3437 |
| 5697 | 3831 |
| 5698 | 4066 |
| 5699 | 4560 |
| 5700 | 4147 |
| 5701 | 4624 |
| 5702 | 4732 |
| 5703 | 5155 |
| 5704 | 4287 |
| 5705 | 4818 |
| 5706 | 4693 |
| 5707 | 5246 |
| 5708 | 4910 |
| 5709 | 5317 |
| 5710 | 5408 |
| 5711 | 5799 |
| 5712 | 4409 |
| 5713 | 4794 |
| 5714 | 4936 |
| 5715 | 5350 |
| 5716 | 5023 |
| 5717 | 5427 |
| 5718 | 5487 |
| 5719 | 5899 |
| 5720 | 5101 |
| 5721 | 5513 |
| 5722 | 5631 |
| 5723 | 5957 |
| 5724 | 5688 |
| 5725 | 6061 |
| 5726 | 6124 |
| 5727 | 6526 |
| 5728 | 4545 |
| 5729 | 4990 |
| 5730 | 5090 |
| 5731 | 5478 |
| 5732 | 5198 |
| 5733 | 5554 |
| 5734 | 5658 |
| 5735 | 6035 |
| 5736 | 5260 |
| 5737 | 5667 |
| 5738 | 5752 |
| 5739 | 6082 |
| 5740 | 5804 |
| 5741 | 6168 |
| 5742 | 6235 |
| 5743 | 6575 |
| 5744 | 5377 |
| 5745 | 5778 |
| 5746 | 5876 |
| 5747 | 6190 |
| 5748 | 5916 |
| 5749 | 6249 |
| 5750 | 6315 |
| 5751 | 6655 |
| 5752 | 5993 |
| 5753 | 6338 |
| 5754 | 6382 |
| 5755 | 6724 |
| 5756 | 6445 |
| 5757 | 6785 |
| 5758 | 6858 |
| 5759 | 7180 |
| 5760 | 3724 |
| 5761 | 4041 |
| 5762 | 4169 |
| 5763 | 4780 |
| 5764 | 4348 |
| 5765 | 4850 |
| 5766 | 4896 |
| 5767 | 5386 |
| 5768 | 4489 |
| 5769 | 4927 |
| 5770 | 5037 |
| 5771 | 5461 |
| 5772 | 5116 |
| 5773 | 5546 |
| 5774 | 5590 |
| 5775 | 6031 |
| 5776 | 4593 |
| 5777 | 5045 |
| 5778 | 5146 |
| 5779 | 5572 |
| 5780 | 5220 |
| 5781 | 5640 |
| 5782 | 5720 |
| 5783 | 6104 |
| 5784 | 5303 |
| 5785 | 5735 |
| 5786 | 5784 |
| 5787 | 6146 |
| 5788 | 5882 |
| 5789 | 6226 |
| 5790 | 6302 |
| 5791 | 6642 |
| 5792 | 4702 |
| 5793 | 5164 |
| 5794 | 5268 |
| 5795 | 5670 |
| 5796 | 5335 |
| 5797 | 5741 |
| 5798 | 5827 |
| 5799 | 6202 |
| 5800 | 5451 |
| 5801 | 5865 |
| 5802 | 5929 |
| 5803 | 6267 |
| 5804 | 5983 |
| 5805 | 6327 |
| 5806 | 6373 |
| 5807 | 6710 |
| 5808 | 5581 |
| 5809 | 5948 |
| 5810 | 6046 |
| 5811 | 6354 |
| 5812 | 6092 |
| 5813 | 6419 |
| 5814 | 6468 |
| 5815 | 6750 |
| 5816 | 6177 |
| 5817 | 6489 |
| 5818 | 6550 |

TABLE Z17-continued with a sequence length of 8192:

| Polarized channel sequence number | Reliability or reliability sequence number |
|---|---|
| 5819 | 6826 |
| 5820 | 6603 |
| 5821 | 6905 |
| 5822 | 7005 |
| 5823 | 7205 |
| 5824 | 4718 |
| 5825 | 5294 |
| 5826 | 5417 |
| 5827 | 5842 |
| 5828 | 5522 |
| 5829 | 5902 |
| 5830 | 5969 |
| 5831 | 6350 |
| 5832 | 5617 |
| 5833 | 6004 |
| 5834 | 6064 |
| 5835 | 6393 |
| 5836 | 6134 |
| 5837 | 6458 |
| 5838 | 6512 |
| 5839 | 6812 |
| 5840 | 5711 |
| 5841 | 6112 |
| 5842 | 6158 |
| 5843 | 6483 |
| 5844 | 6254 |
| 5845 | 6543 |
| 5846 | 6591 |
| 5847 | 6926 |
| 5848 | 6293 |
| 5849 | 6613 |
| 5850 | 6669 |
| 5851 | 6946 |
| 5852 | 6735 |
| 5853 | 7018 |
| 5854 | 7066 |
| 5855 | 7365 |
| 5856 | 5822 |
| 5857 | 6214 |
| 5858 | 6279 |
| 5859 | 6563 |
| 5860 | 6363 |
| 5861 | 6627 |
| 5862 | 6677 |
| 5863 | 6963 |
| 5864 | 6428 |
| 5865 | 6696 |
| 5866 | 6766 |
| 5867 | 7043 |
| 5868 | 6846 |
| 5869 | 7079 |
| 5870 | 7129 |
| 5871 | 7416 |
| 5872 | 6502 |
| 5873 | 6796 |
| 5874 | 6878 |
| 5875 | 7106 |
| 5876 | 6893 |
| 5877 | 7162 |
| 5878 | 7234 |
| 5879 | 7514 |
| 5880 | 6980 |
| 5881 | 7263 |
| 5882 | 7300 |
| 5883 | 7457 |
| 5884 | 7332 |
| 5885 | 7580 |
| 5886 | 7662 |
| 5887 | 7782 |
| 5888 | 3311 |
| 5889 | 3989 |
| 5890 | 4303 |
| 5891 | 4949 |
| 5892 | 4506 |
| 5893 | 5012 |

TABLE Z17-continued with a sequence length of 8192:

| Polarized channel sequence number | Reliability or reliability sequence number |
|---|---|
| 5894 | 5186 |
| 5895 | 5623 |
| 5896 | 4662 |
| 5897 | 5133 |
| 5898 | 5276 |
| 5899 | 5702 |
| 5900 | 5400 |
| 5901 | 5813 |
| 5902 | 5856 |
| 5903 | 6286 |
| 5904 | 4762 |
| 5905 | 5238 |
| 5906 | 5325 |
| 5907 | 5793 |
| 5908 | 5496 |
| 5909 | 5890 |
| 5910 | 6010 |
| 5911 | 6318 |
| 5912 | 5563 |
| 5913 | 5996 |
| 5914 | 5946 |
| 5915 | 6402 |
| 5916 | 6116 |
| 5917 | 6462 |
| 5918 | 6520 |
| 5919 | 6862 |
| 5920 | 4858 |
| 5921 | 5434 |
| 5922 | 5531 |
| 5923 | 5923 |
| 5924 | 5599 |
| 5925 | 5975 |
| 5926 | 6043 |
| 5927 | 6422 |
| 5928 | 5729 |
| 5929 | 6085 |
| 5930 | 6143 |
| 5931 | 6475 |
| 5932 | 6221 |
| 5933 | 6557 |
| 5934 | 6595 |
| 5935 | 6930 |
| 5936 | 5836 |
| 5937 | 6156 |
| 5938 | 6263 |
| 5939 | 6577 |
| 5940 | 6309 |
| 5941 | 6638 |
| 5942 | 6681 |
| 5943 | 6975 |
| 5944 | 6389 |
| 5945 | 6699 |
| 5946 | 6754 |
| 5947 | 7035 |
| 5948 | 6792 |
| 5949 | 7101 |
| 5950 | 7152 |
| 5951 | 7434 |
| 5952 | 5078 |
| 5953 | 5470 |
| 5954 | 5679 |
| 5955 | 6074 |
| 5956 | 5749 |
| 5957 | 6127 |
| 5958 | 6207 |
| 5959 | 6533 |
| 5960 | 5868 |
| 5961 | 6277 |
| 5962 | 6171 |
| 5963 | 6609 |
| 5964 | 6343 |
| 5965 | 6663 |
| 5966 | 6728 |
| 5967 | 7000 |
| 5968 | 5964 |

TABLE Z17-continued with a sequence length of 8192:

| Polarized channel sequence number | Reliability or reliability sequence number |
|---|---|
| 5969 | 6245 |
| 5970 | 6380 |
| 5971 | 6692 |
| 5972 | 6435 |
| 5973 | 6746 |
| 5974 | 6788 |
| 5975 | 7070 |
| 5976 | 6499 |
| 5977 | 6807 |
| 5978 | 6881 |
| 5979 | 7115 |
| 5980 | 6922 |
| 5981 | 7185 |
| 5982 | 7229 |
| 5983 | 7519 |
| 5984 | 6056 |
| 5985 | 6413 |
| 5986 | 6485 |
| 5987 | 6777 |
| 5988 | 6571 |
| 5989 | 6830 |
| 5990 | 6897 |
| 5991 | 7171 |
| 5992 | 6620 |
| 5993 | 6902 |
| 5994 | 6972 |
| 5995 | 7199 |
| 5996 | 7009 |
| 5997 | 7259 |
| 5998 | 7310 |
| 5999 | 7546 |
| 6000 | 6707 |
| 6001 | 6984 |
| 6002 | 7057 |
| 6003 | 7274 |
| 6004 | 7093 |
| 6005 | 7316 |
| 6006 | 7359 |
| 6007 | 7602 |
| 6008 | 7138 |
| 6009 | 7381 |
| 6010 | 7421 |
| 6011 | 7638 |
| 6012 | 7452 |
| 6013 | 7686 |
| 6014 | 7737 |
| 6015 | 7914 |
| 6016 | 5360 |
| 6017 | 5649 |
| 6018 | 5770 |
| 6019 | 6233 |
| 6020 | 5910 |
| 6021 | 6295 |
| 6022 | 6331 |
| 6023 | 6717 |
| 6024 | 6022 |
| 6025 | 6367 |
| 6026 | 6442 |
| 6027 | 6770 |
| 6028 | 6510 |
| 6029 | 6819 |
| 6030 | 6855 |
| 6031 | 7166 |
| 6032 | 6097 |
| 6033 | 6455 |
| 6034 | 6530 |
| 6035 | 6835 |
| 6036 | 6589 |
| 6037 | 6886 |
| 6038 | 6942 |
| 6039 | 7219 |
| 6040 | 6652 |
| 6041 | 6955 |
| 6042 | 6997 |
| 6043 | 7248 |

TABLE Z17-continued with a sequence length of 8192:

| Polarized channel sequence number | Reliability or reliability sequence number |
|---|---|
| 6044 | 7061 |
| 6045 | 7305 |
| 6046 | 7354 |
| 6047 | 7594 |
| 6048 | 6186 |
| 6049 | 6547 |
| 6050 | 6623 |
| 6051 | 6918 |
| 6052 | 6673 |
| 6053 | 6958 |
| 6054 | 7026 |
| 6055 | 7279 |
| 6056 | 6761 |
| 6057 | 7048 |
| 6058 | 7096 |
| 6059 | 7326 |
| 6060 | 7134 |
| 6061 | 7375 |
| 6062 | 7410 |
| 6063 | 7632 |
| 6064 | 6850 |
| 6065 | 7110 |
| 6066 | 7176 |
| 6067 | 7392 |
| 6068 | 7214 |
| 6069 | 7439 |
| 6070 | 7469 |
| 6071 | 7670 |
| 6072 | 7269 |
| 6073 | 7494 |
| 6074 | 7533 |
| 6075 | 7711 |
| 6076 | 7559 |
| 6077 | 7764 |
| 6078 | 7822 |
| 6079 | 7928 |
| 6080 | 6199 |
| 6081 | 6644 |
| 6082 | 6732 |
| 6083 | 7030 |
| 6084 | 6815 |
| 6085 | 7075 |
| 6086 | 7124 |
| 6087 | 7386 |
| 6088 | 6869 |
| 6089 | 7143 |
| 6090 | 7190 |
| 6091 | 7427 |
| 6092 | 7244 |
| 6093 | 7463 |
| 6094 | 7507 |
| 6095 | 7702 |
| 6096 | 6934 |
| 6097 | 7224 |
| 6098 | 7253 |
| 6099 | 7482 |
| 6100 | 7321 |
| 6101 | 7526 |
| 6102 | 7553 |
| 6103 | 7773 |
| 6104 | 7348 |
| 6105 | 7567 |
| 6106 | 7609 |
| 6107 | 7793 |
| 6108 | 7646 |
| 6109 | 7833 |
| 6110 | 7854 |
| 6111 | 8003 |
| 6112 | 7013 |
| 6113 | 7294 |
| 6114 | 7342 |
| 6115 | 7539 |
| 6116 | 7398 |
| 6117 | 7588 |
| 6118 | 7616 |

TABLE Z17-continued

| with a sequence length of 8192: | |
|---|---|
| Polarized channel sequence number | Reliability or reliability sequence number |
| 6119 | 7802 |
| 6120 | 7445 |
| 6121 | 7624 |
| 6122 | 7677 |
| 6123 | 7844 |
| 6124 | 7728 |
| 6125 | 7866 |
| 6126 | 7889 |
| 6127 | 8021 |
| 6128 | 7501 |
| 6129 | 7694 |
| 6130 | 7745 |
| 6131 | 7878 |
| 6132 | 7754 |
| 6133 | 7902 |
| 6134 | 7942 |
| 6135 | 8061 |
| 6136 | 7812 |
| 6137 | 7955 |
| 6138 | 7971 |
| 6139 | 8040 |
| 6140 | 7987 |
| 6141 | 8084 |
| 6142 | 8111 |
| 6143 | 8145 |
| 6144 | 315 |
| 6145 | 749 |
| 6146 | 1016 |
| 6147 | 1608 |
| 6148 | 1189 |
| 6149 | 1867 |
| 6150 | 2017 |
| 6151 | 2466 |
| 6152 | 1325 |
| 6153 | 1971 |
| 6154 | 2103 |
| 6155 | 2544 |
| 6156 | 2218 |
| 6157 | 2685 |
| 6158 | 2728 |
| 6159 | 3313 |
| 6160 | 1434 |
| 6161 | 2063 |
| 6162 | 2143 |
| 6163 | 2664 |
| 6164 | 2320 |
| 6165 | 2810 |
| 6166 | 2935 |
| 6167 | 3375 |
| 6168 | 2383 |
| 6169 | 2919 |
| 6170 | 2865 |
| 6171 | 3465 |
| 6172 | 3082 |
| 6173 | 3550 |
| 6174 | 3630 |
| 6175 | 4143 |
| 6176 | 1526 |
| 6177 | 2252 |
| 6178 | 2350 |
| 6179 | 2846 |
| 6180 | 2412 |
| 6181 | 2901 |
| 6182 | 3004 |
| 6183 | 3496 |
| 6184 | 2569 |
| 6185 | 3051 |
| 6186 | 3112 |
| 6187 | 3559 |
| 6188 | 3236 |
| 6189 | 3686 |
| 6190 | 3739 |
| 6191 | 4253 |
| 6192 | 2708 |
| 6193 | 3140 |

TABLE Z17-continued

| with a sequence length of 8192: | |
|---|---|
| Polarized channel sequence number | Reliability or reliability sequence number |
| 6194 | 3287 |
| 6195 | 3714 |
| 6196 | 3363 |
| 6197 | 3800 |
| 6198 | 3866 |
| 6199 | 4330 |
| 6200 | 3453 |
| 6201 | 3899 |
| 6202 | 3975 |
| 6203 | 4434 |
| 6204 | 4043 |
| 6205 | 4537 |
| 6206 | 4638 |
| 6207 | 5128 |
| 6208 | 1923 |
| 6209 | 2287 |
| 6210 | 2520 |
| 6211 | 3035 |
| 6212 | 2593 |
| 6213 | 3097 |
| 6214 | 3224 |
| 6215 | 3658 |
| 6216 | 2771 |
| 6217 | 3301 |
| 6218 | 3155 |
| 6219 | 3767 |
| 6220 | 3398 |
| 6221 | 3833 |
| 6222 | 3931 |
| 6223 | 4375 |
| 6224 | 2884 |
| 6225 | 3275 |
| 6226 | 3430 |
| 6227 | 3874 |
| 6228 | 3519 |
| 6229 | 3961 |
| 6230 | 4027 |
| 6231 | 4493 |
| 6232 | 3610 |
| 6233 | 4049 |
| 6234 | 4179 |
| 6235 | 4563 |
| 6236 | 4233 |
| 6237 | 4689 |
| 6238 | 4773 |
| 6239 | 5278 |
| 6240 | 3020 |
| 6241 | 3476 |
| 6242 | 3599 |
| 6243 | 4013 |
| 6244 | 3705 |
| 6245 | 4084 |
| 6246 | 4205 |
| 6247 | 4658 |
| 6248 | 3775 |
| 6249 | 4213 |
| 6250 | 4324 |
| 6251 | 4714 |
| 6252 | 4380 |
| 6253 | 4820 |
| 6254 | 4912 |
| 6255 | 5338 |
| 6256 | 3907 |
| 6257 | 4344 |
| 6258 | 4468 |
| 6259 | 4853 |
| 6260 | 4521 |
| 6261 | 4929 |
| 6262 | 5010 |
| 6263 | 5448 |
| 6264 | 4607 |
| 6265 | 5035 |
| 6266 | 5095 |
| 6267 | 5532 |
| 6268 | 5177 |

TABLE Z17-continued

| with a sequence length of 8192: | |
|---|---|
| Polarized channel sequence number | Reliability or reliability sequence number |
| 6269 | 5612 |
| 6270 | 5716 |
| 6271 | 6163 |
| 6272 | 2183 |
| 6273 | 2495 |
| 6274 | 2641 |
| 6275 | 3263 |
| 6276 | 2827 |
| 6277 | 3325 |
| 6278 | 3386 |
| 6279 | 3915 |
| 6280 | 2954 |
| 6281 | 3421 |
| 6282 | 3528 |
| 6283 | 3991 |
| 6284 | 3619 |
| 6285 | 4078 |
| 6286 | 4128 |
| 6287 | 4655 |
| 6288 | 3066 |
| 6289 | 3539 |
| 6290 | 3649 |
| 6291 | 4108 |
| 6292 | 3731 |
| 6293 | 4185 |
| 6294 | 4273 |
| 6295 | 4750 |
| 6296 | 3817 |
| 6297 | 4293 |
| 6298 | 4350 |
| 6299 | 4797 |
| 6300 | 4476 |
| 6301 | 4898 |
| 6302 | 4997 |
| 6303 | 5425 |
| 6304 | 3182 |
| 6305 | 3666 |
| 6306 | 3783 |
| 6307 | 4219 |
| 6308 | 3858 |
| 6309 | 4299 |
| 6310 | 4404 |
| 6311 | 4870 |
| 6312 | 3983 |
| 6313 | 4445 |
| 6314 | 4532 |
| 6315 | 4951 |
| 6316 | 4597 |
| 6317 | 5022 |
| 6318 | 5083 |
| 6319 | 5520 |
| 6320 | 4122 |
| 6321 | 4558 |
| 6322 | 4680 |
| 6323 | 5063 |
| 6324 | 4730 |
| 6325 | 5139 |
| 6326 | 5207 |
| 6327 | 5570 |
| 6328 | 4839 |
| 6329 | 5233 |
| 6330 | 5313 |
| 6331 | 5672 |
| 6332 | 5375 |
| 6333 | 5789 |
| 6334 | 5922 |
| 6335 | 6196 |
| 6336 | 3209 |
| 6337 | 3808 |
| 6338 | 3945 |
| 6339 | 4428 |
| 6340 | 4062 |
| 6341 | 4498 |
| 6342 | 4580 |
| 6343 | 5052 |
| 6344 | 4151 |
| 6345 | 4618 |
| 6346 | 4700 |
| 6347 | 5111 |
| 6348 | 4783 |
| 6349 | 5193 |
| 6350 | 5262 |
| 6351 | 5648 |
| 6352 | 4267 |
| 6353 | 4753 |
| 6354 | 4815 |
| 6355 | 5219 |
| 6356 | 4934 |
| 6357 | 5298 |
| 6358 | 5361 |
| 6359 | 5809 |
| 6360 | 4980 |
| 6361 | 5393 |
| 6362 | 5462 |
| 6363 | 5840 |
| 6364 | 5555 |
| 6365 | 5941 |
| 6366 | 6003 |
| 6367 | 6427 |
| 6368 | 4398 |
| 6369 | 4879 |
| 6370 | 4963 |
| 6371 | 5327 |
| 6372 | 5067 |
| 6373 | 5410 |
| 6374 | 5474 |
| 6375 | 5866 |
| 6376 | 5154 |
| 6377 | 5500 |
| 6378 | 5591 |
| 6379 | 5971 |
| 6380 | 5692 |
| 6381 | 6024 |
| 6382 | 6090 |
| 6383 | 6493 |
| 6384 | 5247 |
| 6385 | 5636 |
| 6386 | 5736 |
| 6387 | 6054 |
| 6388 | 5765 |
| 6389 | 6129 |
| 6390 | 6238 |
| 6391 | 6635 |
| 6392 | 5892 |
| 6393 | 6281 |
| 6394 | 6323 |
| 6395 | 6562 |
| 6396 | 6379 |
| 6397 | 6740 |
| 6398 | 6859 |
| 6399 | 7045 |
| 6400 | 1682 |
| 6401 | 2438 |
| 6402 | 2790 |
| 6403 | 3442 |
| 6404 | 2986 |
| 6405 | 3508 |
| 6406 | 3694 |
| 6407 | 4165 |
| 6408 | 3125 |
| 6409 | 3638 |
| 6410 | 3792 |
| 6411 | 4259 |
| 6412 | 3923 |
| 6413 | 4392 |
| 6414 | 4440 |
| 6415 | 4971 |
| 6416 | 3248 |
| 6417 | 3750 |
| 6418 | 3850 |

TABLE Z17-continued with a sequence length of 8192:

| Polarized channel sequence number | Reliability or reliability sequence number |
|---|---|
| 6419 | 4367 |
| 6420 | 4035 |
| 6421 | 4481 |
| 6422 | 4633 |
| 6423 | 5018 |
| 6424 | 4092 |
| 6425 | 4613 |
| 6426 | 4554 |
| 6427 | 5115 |
| 6428 | 4759 |
| 6429 | 5196 |
| 6430 | 5267 |
| 6431 | 5724 |
| 6432 | 3337 |
| 6433 | 3969 |
| 6434 | 4070 |
| 6435 | 4526 |
| 6436 | 4137 |
| 6437 | 4586 |
| 6438 | 4664 |
| 6439 | 5147 |
| 6440 | 4285 |
| 6441 | 4725 |
| 6442 | 4792 |
| 6443 | 5211 |
| 6444 | 4893 |
| 6445 | 5321 |
| 6446 | 5369 |
| 6447 | 5817 |
| 6448 | 4417 |
| 6449 | 4811 |
| 6450 | 4946 |
| 6451 | 5347 |
| 6452 | 5002 |
| 6453 | 5419 |
| 6454 | 5482 |
| 6455 | 5883 |
| 6456 | 5108 |
| 6457 | 5503 |
| 6458 | 5576 |
| 6459 | 5962 |
| 6460 | 5627 |
| 6461 | 6047 |
| 6462 | 6120 |
| 6463 | 6521 |
| 6464 | 3570 |
| 6465 | 3997 |
| 6466 | 4227 |
| 6467 | 4711 |
| 6468 | 4313 |
| 6469 | 4778 |
| 6470 | 4876 |
| 6471 | 5287 |
| 6472 | 4463 |
| 6473 | 4954 |
| 6474 | 4834 |
| 6475 | 5382 |
| 6476 | 5047 |
| 6477 | 5453 |
| 6478 | 5541 |
| 6479 | 5914 |
| 6480 | 4574 |
| 6481 | 4920 |
| 6482 | 5092 |
| 6483 | 5491 |
| 6484 | 5159 |
| 6485 | 5564 |
| 6486 | 5618 |
| 6487 | 6009 |
| 6488 | 5241 |
| 6489 | 5639 |
| 6490 | 5748 |
| 6491 | 6075 |
| 6492 | 5806 |
| 6493 | 6169 |

TABLE Z17-continued with a sequence length of 8192:

| Polarized channel sequence number | Reliability or reliability sequence number |
|---|---|
| 6494 | 6231 |
| 6495 | 6645 |
| 6496 | 4685 |
| 6497 | 5131 |
| 6498 | 5227 |
| 6499 | 5606 |
| 6500 | 5333 |
| 6501 | 5674 |
| 6502 | 5771 |
| 6503 | 6148 |
| 6504 | 5396 |
| 6505 | 5780 |
| 6506 | 5875 |
| 6507 | 6188 |
| 6508 | 5930 |
| 6509 | 6271 |
| 6510 | 6342 |
| 6511 | 6693 |
| 6512 | 5514 |
| 6513 | 5897 |
| 6514 | 5988 |
| 6515 | 6298 |
| 6516 | 6032 |
| 6517 | 6352 |
| 6518 | 6416 |
| 6519 | 6776 |
| 6520 | 6105 |
| 6521 | 6446 |
| 6522 | 6503 |
| 6523 | 6834 |
| 6524 | 6552 |
| 6525 | 6898 |
| 6526 | 6968 |
| 6527 | 7278 |
| 6528 | 3883 |
| 6529 | 4193 |
| 6530 | 4336 |
| 6531 | 4907 |
| 6532 | 4510 |
| 6533 | 4985 |
| 6534 | 5030 |
| 6535 | 5526 |
| 6536 | 4644 |
| 6537 | 5075 |
| 6538 | 5170 |
| 6539 | 5600 |
| 6540 | 5252 |
| 6541 | 5663 |
| 6542 | 5707 |
| 6543 | 6138 |
| 6544 | 4739 |
| 6545 | 5181 |
| 6546 | 5284 |
| 6547 | 5683 |
| 6548 | 5358 |
| 6549 | 5757 |
| 6550 | 5832 |
| 6551 | 6213 |
| 6552 | 5439 |
| 6553 | 5849 |
| 6554 | 5906 |
| 6555 | 6257 |
| 6556 | 5995 |
| 6557 | 6335 |
| 6558 | 6405 |
| 6559 | 6763 |
| 6560 | 4843 |
| 6561 | 5302 |
| 6562 | 5405 |
| 6563 | 5797 |
| 6564 | 5468 |
| 6565 | 5858 |
| 6566 | 5947 |
| 6567 | 6310 |
| 6568 | 5582 |

TABLE Z17-continued with a sequence length of 8192:

| Polarized channel sequence number | Reliability or reliability sequence number |
|---|---|
| 6569 | 5979 |
| 6570 | 6039 |
| 6571 | 6368 |
| 6572 | 6098 |
| 6573 | 6433 |
| 6574 | 6481 |
| 6575 | 6824 |
| 6576 | 5701 |
| 6577 | 6068 |
| 6578 | 6154 |
| 6579 | 6463 |
| 6580 | 6206 |
| 6581 | 6534 |
| 6582 | 6584 |
| 6583 | 6873 |
| 6584 | 6290 |
| 6585 | 6605 |
| 6586 | 6671 |
| 6587 | 6939 |
| 6588 | 6714 |
| 6589 | 7015 |
| 6590 | 7114 |
| 6591 | 7302 |
| 6592 | 4862 |
| 6593 | 5433 |
| 6594 | 5544 |
| 6595 | 5955 |
| 6596 | 5657 |
| 6597 | 6015 |
| 6598 | 6083 |
| 6599 | 6453 |
| 6600 | 5727 |
| 6601 | 6113 |
| 6602 | 6179 |
| 6603 | 6511 |
| 6604 | 6246 |
| 6605 | 6572 |
| 6606 | 6624 |
| 6607 | 6925 |
| 6608 | 5826 |
| 6609 | 6219 |
| 6610 | 6265 |
| 6611 | 6594 |
| 6612 | 6362 |
| 6613 | 6661 |
| 6614 | 6704 |
| 6615 | 7028 |
| 6616 | 6397 |
| 6617 | 6725 |
| 6618 | 6787 |
| 6619 | 7060 |
| 6620 | 6845 |
| 6621 | 7128 |
| 6622 | 7169 |
| 6623 | 7454 |
| 6624 | 5938 |
| 6625 | 6317 |
| 6626 | 6385 |
| 6627 | 6682 |
| 6628 | 6474 |
| 6629 | 6751 |
| 6630 | 6798 |
| 6631 | 7077 |
| 6632 | 6544 |
| 6633 | 6813 |
| 6634 | 6887 |
| 6635 | 7151 |
| 6636 | 6954 |
| 6637 | 7188 |
| 6638 | 7232 |
| 6639 | 7493 |
| 6640 | 6615 |
| 6641 | 6911 |
| 6642 | 6981 |
| 6643 | 7210 |

TABLE Z17-continued with a sequence length of 8192:

| Polarized channel sequence number | Reliability or reliability sequence number |
|---|---|
| 6644 | 6999 |
| 6645 | 7252 |
| 6646 | 7330 |
| 6647 | 7585 |
| 6648 | 7097 |
| 6649 | 7358 |
| 6650 | 7387 |
| 6651 | 7534 |
| 6652 | 7419 |
| 6653 | 7644 |
| 6654 | 7717 |
| 6655 | 7827 |
| 6656 | 1748 |
| 6657 | 2617 |
| 6658 | 2970 |
| 6659 | 3677 |
| 6660 | 3197 |
| 6661 | 3825 |
| 6662 | 4005 |
| 6663 | 4515 |
| 6664 | 3349 |
| 6665 | 3953 |
| 6666 | 4114 |
| 6667 | 4602 |
| 6668 | 4247 |
| 6669 | 4719 |
| 6670 | 4764 |
| 6671 | 5295 |
| 6672 | 3487 |
| 6673 | 4057 |
| 6674 | 4157 |
| 6675 | 4694 |
| 6676 | 4361 |
| 6677 | 4825 |
| 6678 | 4959 |
| 6679 | 5344 |
| 6680 | 4423 |
| 6681 | 4937 |
| 6682 | 4884 |
| 6683 | 5422 |
| 6684 | 5088 |
| 6685 | 5494 |
| 6686 | 5558 |
| 6687 | 6006 |
| 6688 | 3590 |
| 6689 | 4279 |
| 6690 | 4386 |
| 6691 | 4867 |
| 6692 | 4451 |
| 6693 | 4924 |
| 6694 | 5005 |
| 6695 | 5442 |
| 6696 | 4622 |
| 6697 | 5055 |
| 6698 | 5119 |
| 6699 | 5507 |
| 6700 | 5215 |
| 6701 | 5603 |
| 6702 | 5651 |
| 6703 | 6087 |
| 6704 | 4744 |
| 6705 | 5151 |
| 6706 | 5270 |
| 6707 | 5630 |
| 6708 | 5330 |
| 6709 | 5704 |
| 6710 | 5759 |
| 6711 | 6153 |
| 6712 | 5413 |
| 6713 | 5786 |
| 6714 | 5855 |
| 6715 | 6234 |
| 6716 | 5912 |
| 6717 | 6319 |
| 6718 | 6394 |

TABLE Z17-continued

| with a sequence length of 8192: | |
|---|---|
| Polarized channel sequence number | Reliability or reliability sequence number |
| 6719 | 6759 |
| 6720 | 3891 |
| 6721 | 4318 |
| 6722 | 4569 |
| 6723 | 5043 |
| 6724 | 4649 |
| 6725 | 5100 |
| 6726 | 5199 |
| 6727 | 5588 |
| 6728 | 4787 |
| 6729 | 5281 |
| 6730 | 5165 |
| 6731 | 5669 |
| 6732 | 5365 |
| 6733 | 5733 |
| 6734 | 5820 |
| 6735 | 6187 |
| 6736 | 4901 |
| 6737 | 5259 |
| 6738 | 5390 |
| 6739 | 5768 |
| 6740 | 5465 |
| 6741 | 5838 |
| 6742 | 5895 |
| 6743 | 6282 |
| 6744 | 5538 |
| 6745 | 5920 |
| 6746 | 6029 |
| 6747 | 6339 |
| 6748 | 6081 |
| 6749 | 6437 |
| 6750 | 6497 |
| 6751 | 6863 |
| 6752 | 5027 |
| 6753 | 5436 |
| 6754 | 5529 |
| 6755 | 5886 |
| 6756 | 5624 |
| 6757 | 5958 |
| 6758 | 6052 |
| 6759 | 6411 |
| 6760 | 5680 |
| 6761 | 6060 |
| 6762 | 6145 |
| 6763 | 6457 |
| 6764 | 6194 |
| 6765 | 6535 |
| 6766 | 6601 |
| 6767 | 6904 |
| 6768 | 5791 |
| 6769 | 6167 |
| 6770 | 6262 |
| 6771 | 6558 |
| 6772 | 6301 |
| 6773 | 6614 |
| 6774 | 6674 |
| 6775 | 6974 |
| 6776 | 6372 |
| 6777 | 6697 |
| 6778 | 6737 |
| 6779 | 7032 |
| 6780 | 6795 |
| 6781 | 7082 |
| 6782 | 7144 |
| 6783 | 7407 |
| 6784 | 4199 |
| 6785 | 4543 |
| 6786 | 4675 |
| 6787 | 5244 |
| 6788 | 4848 |
| 6789 | 5310 |
| 6790 | 5352 |
| 6791 | 5800 |
| 6792 | 4976 |
| 6793 | 5379 |

TABLE Z17-continued

| with a sequence length of 8192: | |
|---|---|
| Polarized channel sequence number | Reliability or reliability sequence number |
| 6794 | 5479 |
| 6795 | 5869 |
| 6796 | 5552 |
| 6797 | 5950 |
| 6798 | 5989 |
| 6799 | 6410 |
| 6800 | 5072 |
| 6801 | 5488 |
| 6802 | 5579 |
| 6803 | 5974 |
| 6804 | 5642 |
| 6805 | 6036 |
| 6806 | 6111 |
| 6807 | 6477 |
| 6808 | 5722 |
| 6809 | 6126 |
| 6810 | 6175 |
| 6811 | 6519 |
| 6812 | 6269 |
| 6813 | 6590 |
| 6814 | 6664 |
| 6815 | 6961 |
| 6816 | 5173 |
| 6817 | 5594 |
| 6818 | 5689 |
| 6819 | 6063 |
| 6820 | 5751 |
| 6821 | 6133 |
| 6822 | 6215 |
| 6823 | 6570 |
| 6824 | 5860 |
| 6825 | 6250 |
| 6826 | 6313 |
| 6827 | 6632 |
| 6828 | 6364 |
| 6829 | 6686 |
| 6830 | 6729 |
| 6831 | 7021 |
| 6832 | 5982 |
| 6833 | 6330 |
| 6834 | 6423 |
| 6835 | 6712 |
| 6836 | 6467 |
| 6837 | 6769 |
| 6838 | 6817 |
| 6839 | 7054 |
| 6840 | 6548 |
| 6841 | 6833 |
| 6842 | 6884 |
| 6843 | 7117 |
| 6844 | 6928 |
| 6845 | 7184 |
| 6846 | 7265 |
| 6847 | 7428 |
| 6848 | 5188 |
| 6849 | 5713 |
| 6850 | 5829 |
| 6851 | 6227 |
| 6852 | 5927 |
| 6853 | 6287 |
| 6854 | 6351 |
| 6855 | 6708 |
| 6856 | 6013 |
| 6857 | 6384 |
| 6858 | 6441 |
| 6859 | 6748 |
| 6860 | 6507 |
| 6861 | 6806 |
| 6862 | 6852 |
| 6863 | 7103 |
| 6864 | 6103 |
| 6865 | 6486 |
| 6866 | 6529 |
| 6867 | 6828 |
| 6868 | 6619 |

TABLE Z17-continued

| with a sequence length of 8192: | |
|---|---|
| Polarized channel sequence number | Reliability or reliability sequence number |
| 6869 | 6876 |
| 6870 | 6919 |
| 6871 | 7200 |
| 6872 | 6653 |
| 6873 | 6936 |
| 6874 | 6986 |
| 6875 | 7217 |
| 6876 | 7042 |
| 6877 | 7276 |
| 6878 | 7314 |
| 6879 | 7556 |
| 6880 | 6209 |
| 6881 | 6580 |
| 6882 | 6640 |
| 6883 | 6895 |
| 6884 | 6718 |
| 6885 | 6951 |
| 6886 | 6993 |
| 6887 | 7230 |
| 6888 | 6780 |
| 6889 | 7006 |
| 6890 | 7068 |
| 6891 | 7295 |
| 6892 | 7133 |
| 6893 | 7325 |
| 6894 | 7366 |
| 6895 | 7593 |
| 6896 | 6841 |
| 6897 | 7091 |
| 6898 | 7158 |
| 6899 | 7346 |
| 6900 | 7173 |
| 6901 | 7391 |
| 6902 | 7449 |
| 6903 | 7669 |
| 6904 | 7245 |
| 6905 | 7476 |
| 6906 | 7502 |
| 6907 | 7628 |
| 6908 | 7528 |
| 6909 | 7723 |
| 6910 | 7783 |
| 6911 | 7875 |
| 6912 | 3758 |
| 6913 | 4487 |
| 6914 | 4806 |
| 6915 | 5399 |
| 6916 | 4993 |
| 6917 | 5456 |
| 6918 | 5615 |
| 6919 | 6021 |
| 6920 | 5134 |
| 6921 | 5567 |
| 6922 | 5695 |
| 6923 | 6096 |
| 6924 | 5812 |
| 6925 | 6200 |
| 6926 | 6243 |
| 6927 | 6649 |
| 6928 | 5230 |
| 6929 | 5660 |
| 6930 | 5745 |
| 6931 | 6182 |
| 6932 | 5903 |
| 6933 | 6275 |
| 6934 | 6390 |
| 6935 | 6678 |
| 6936 | 5965 |
| 6937 | 6375 |
| 6938 | 6329 |
| 6939 | 6755 |
| 6940 | 6488 |
| 6941 | 6809 |
| 6942 | 6856 |
| 6943 | 7147 |

TABLE Z17-continued

| with a sequence length of 8192: | |
|---|---|
| Polarized channel sequence number | Reliability or reliability sequence number |
| 6944 | 5316 |
| 6945 | 5846 |
| 6946 | 5936 |
| 6947 | 6306 |
| 6948 | 5997 |
| 6949 | 6358 |
| 6950 | 6420 |
| 6951 | 6772 |
| 6952 | 6118 |
| 6953 | 6459 |
| 6954 | 6515 |
| 6955 | 6820 |
| 6956 | 6587 |
| 6957 | 6891 |
| 6958 | 6921 |
| 6959 | 7202 |
| 6960 | 6225 |
| 6961 | 6525 |
| 6962 | 6628 |
| 6963 | 6908 |
| 6964 | 6668 |
| 6965 | 6957 |
| 6966 | 6996 |
| 6967 | 7240 |
| 6968 | 6744 |
| 6969 | 7011 |
| 6970 | 7056 |
| 6971 | 7291 |
| 6972 | 7089 |
| 6973 | 7343 |
| 6974 | 7383 |
| 6975 | 7608 |
| 6976 | 5517 |
| 6977 | 5878 |
| 6978 | 6072 |
| 6979 | 6448 |
| 6980 | 6141 |
| 6981 | 6501 |
| 6982 | 6576 |
| 6983 | 6870 |
| 6984 | 6253 |
| 6985 | 6639 |
| 6986 | 6539 |
| 6987 | 6932 |
| 6988 | 6701 |
| 6989 | 6978 |
| 6990 | 7036 |
| 6991 | 7260 |
| 6992 | 6346 |
| 6993 | 6610 |
| 6994 | 6733 |
| 6995 | 7003 |
| 6996 | 6783 |
| 6997 | 7050 |
| 6998 | 7086 |
| 6999 | 7318 |
| 7000 | 6837 |
| 7001 | 7100 |
| 7002 | 7163 |
| 7003 | 7355 |
| 7004 | 7195 |
| 7005 | 7411 |
| 7006 | 7446 |
| 7007 | 7674 |
| 7008 | 6431 |
| 7009 | 6765 |
| 7010 | 6831 |
| 7011 | 7074 |
| 7012 | 6901 |
| 7013 | 7122 |
| 7014 | 7177 |
| 7015 | 7400 |
| 7016 | 6944 |
| 7017 | 7181 |
| 7018 | 7237 |

TABLE Z17-continued with a sequence length of 8192:

| Polarized channel sequence number | Reliability or reliability sequence number |
|---|---|
| 7019 | 7423 |
| 7020 | 7267 |
| 7021 | 7472 |
| 7022 | 7511 |
| 7023 | 7696 |
| 7024 | 7017 |
| 7025 | 7250 |
| 7026 | 7307 |
| 7027 | 7484 |
| 7028 | 7334 |
| 7029 | 7515 |
| 7030 | 7551 |
| 7031 | 7740 |
| 7032 | 7374 |
| 7033 | 7565 |
| 7034 | 7599 |
| 7035 | 7769 |
| 7036 | 7623 |
| 7037 | 7800 |
| 7038 | 7840 |
| 7039 | 7977 |
| 7040 | 5777 |
| 7041 | 6045 |
| 7042 | 6160 |
| 7043 | 6598 |
| 7044 | 6294 |
| 7045 | 6657 |
| 7046 | 6689 |
| 7047 | 7024 |
| 7048 | 6401 |
| 7049 | 6722 |
| 7050 | 6791 |
| 7051 | 7071 |
| 7052 | 6848 |
| 7053 | 7111 |
| 7054 | 7140 |
| 7055 | 7395 |
| 7056 | 6471 |
| 7057 | 6802 |
| 7058 | 6867 |
| 7059 | 7125 |
| 7060 | 6915 |
| 7061 | 7165 |
| 7062 | 7215 |
| 7063 | 7437 |
| 7064 | 6970 |
| 7065 | 7222 |
| 7066 | 7257 |
| 7067 | 7462 |
| 7068 | 7311 |
| 7069 | 7505 |
| 7070 | 7547 |
| 7071 | 7735 |
| 7072 | 6554 |
| 7073 | 6880 |
| 7074 | 6948 |
| 7075 | 7192 |
| 7076 | 6990 |
| 7077 | 7225 |
| 7078 | 7283 |
| 7079 | 7487 |
| 7080 | 7063 |
| 7081 | 7299 |
| 7082 | 7339 |
| 7083 | 7524 |
| 7084 | 7369 |
| 7085 | 7561 |
| 7086 | 7589 |
| 7087 | 7765 |
| 7088 | 7136 |
| 7089 | 7350 |
| 7090 | 7402 |
| 7091 | 7575 |
| 7092 | 7432 |
| 7093 | 7613 |

TABLE Z17-continued with a sequence length of 8192:

| Polarized channel sequence number | Reliability or reliability sequence number |
|---|---|
| 7094 | 7639 |
| 7095 | 7788 |
| 7096 | 7479 |
| 7097 | 7653 |
| 7098 | 7685 |
| 7099 | 7819 |
| 7100 | 7707 |
| 7101 | 7861 |
| 7102 | 7906 |
| 7103 | 7988 |
| 7104 | 6566 |
| 7105 | 6964 |
| 7106 | 7038 |
| 7107 | 7287 |
| 7108 | 7108 |
| 7109 | 7323 |
| 7110 | 7363 |
| 7111 | 7570 |
| 7112 | 7155 |
| 7113 | 7378 |
| 7114 | 7415 |
| 7115 | 7604 |
| 7116 | 7458 |
| 7117 | 7634 |
| 7118 | 7664 |
| 7119 | 7814 |
| 7120 | 7207 |
| 7121 | 7441 |
| 7122 | 7466 |
| 7123 | 7649 |
| 7124 | 7521 |
| 7125 | 7679 |
| 7126 | 7700 |
| 7127 | 7869 |
| 7128 | 7543 |
| 7129 | 7712 |
| 7130 | 7746 |
| 7131 | 7883 |
| 7132 | 7775 |
| 7133 | 7916 |
| 7134 | 7931 |
| 7135 | 8044 |
| 7136 | 7271 |
| 7137 | 7497 |
| 7138 | 7537 |
| 7139 | 7690 |
| 7140 | 7579 |
| 7141 | 7729 |
| 7142 | 7752 |
| 7143 | 7891 |
| 7144 | 7619 |
| 7145 | 7758 |
| 7146 | 7795 |
| 7147 | 7923 |
| 7148 | 7834 |
| 7149 | 7940 |
| 7150 | 7959 |
| 7151 | 8057 |
| 7152 | 7659 |
| 7153 | 7807 |
| 7154 | 7847 |
| 7155 | 7949 |
| 7156 | 7853 |
| 7157 | 7967 |
| 7158 | 7997 |
| 7159 | 8088 |
| 7160 | 7899 |
| 7161 | 8009 |
| 7162 | 8019 |
| 7163 | 8072 |
| 7164 | 8031 |
| 7165 | 8105 |
| 7166 | 8126 |
| 7167 | 8152 |
| 7168 | 1813 |

TABLE Z17-continued with a sequence length of 8192:

| Polarized channel sequence number | Reliability or reliability sequence number |
|---|---|
| 7169 | 2748 |
| 7170 | 3167 |
| 7171 | 3937 |
| 7172 | 3409 |
| 7173 | 4171 |
| 7174 | 4355 |
| 7175 | 4857 |
| 7176 | 3579 |
| 7177 | 4305 |
| 7178 | 4457 |
| 7179 | 4942 |
| 7180 | 4591 |
| 7181 | 5080 |
| 7182 | 5123 |
| 7183 | 5645 |
| 7184 | 3722 |
| 7185 | 4411 |
| 7186 | 4504 |
| 7187 | 5060 |
| 7188 | 4705 |
| 7189 | 5185 |
| 7190 | 5306 |
| 7191 | 5698 |
| 7192 | 4769 |
| 7193 | 5292 |
| 7194 | 5236 |
| 7195 | 5774 |
| 7196 | 5445 |
| 7197 | 5852 |
| 7198 | 5917 |
| 7199 | 6333 |
| 7200 | 3842 |
| 7201 | 4628 |
| 7202 | 4734 |
| 7203 | 5222 |
| 7204 | 4801 |
| 7205 | 5273 |
| 7206 | 5372 |
| 7207 | 5803 |
| 7208 | 4968 |
| 7209 | 5416 |
| 7210 | 5471 |
| 7211 | 5863 |
| 7212 | 5573 |
| 7213 | 5968 |
| 7214 | 6011 |
| 7215 | 6407 |
| 7216 | 5103 |
| 7217 | 5497 |
| 7218 | 5621 |
| 7219 | 5992 |
| 7220 | 5686 |
| 7221 | 6065 |
| 7222 | 6115 |
| 7223 | 6464 |
| 7224 | 5762 |
| 7225 | 6142 |
| 7226 | 6203 |
| 7227 | 6538 |
| 7228 | 6255 |
| 7229 | 6608 |
| 7230 | 6676 |
| 7231 | 7001 |
| 7232 | 4239 |
| 7233 | 4669 |
| 7234 | 4915 |
| 7235 | 5402 |
| 7236 | 4988 |
| 7237 | 5459 |
| 7238 | 5561 |
| 7239 | 5944 |
| 7240 | 5142 |
| 7241 | 5633 |
| 7242 | 5511 |
| 7243 | 6034 |

TABLE Z17-continued with a sequence length of 8192:

| Polarized channel sequence number | Reliability or reliability sequence number |
|---|---|
| 7244 | 5719 |
| 7245 | 6093 |
| 7246 | 6172 |
| 7247 | 6494 |
| 7248 | 5255 |
| 7249 | 5609 |
| 7250 | 5742 |
| 7251 | 6123 |
| 7252 | 5823 |
| 7253 | 6191 |
| 7254 | 6241 |
| 7255 | 6578 |
| 7256 | 5900 |
| 7257 | 6259 |
| 7258 | 6355 |
| 7259 | 6625 |
| 7260 | 6398 |
| 7261 | 6709 |
| 7262 | 6764 |
| 7263 | 7095 |
| 7264 | 5385 |
| 7265 | 5783 |
| 7266 | 5889 |
| 7267 | 6237 |
| 7268 | 5985 |
| 7269 | 6291 |
| 7270 | 6377 |
| 7271 | 6691 |
| 7272 | 6042 |
| 7273 | 6381 |
| 7274 | 6461 |
| 7275 | 6727 |
| 7276 | 6498 |
| 7277 | 6797 |
| 7278 | 6861 |
| 7279 | 7135 |
| 7280 | 6150 |
| 7281 | 6476 |
| 7282 | 6559 |
| 7283 | 6818 |
| 7284 | 6596 |
| 7285 | 6872 |
| 7286 | 6927 |
| 7287 | 7201 |
| 7288 | 6654 |
| 7289 | 6943 |
| 7290 | 6982 |
| 7291 | 7251 |
| 7292 | 7034 |
| 7293 | 7297 |
| 7294 | 7356 |
| 7295 | 7578 |
| 7296 | 4549 |
| 7297 | 4889 |
| 7298 | 5038 |
| 7299 | 5597 |
| 7300 | 5204 |
| 7301 | 5654 |
| 7302 | 5710 |
| 7303 | 6157 |
| 7304 | 5324 |
| 7305 | 5730 |
| 7306 | 5835 |
| 7307 | 6218 |
| 7308 | 5909 |
| 7309 | 6285 |
| 7310 | 6322 |
| 7311 | 6687 |
| 7312 | 5430 |
| 7313 | 5843 |
| 7314 | 5933 |
| 7315 | 6303 |
| 7316 | 6000 |
| 7317 | 6359 |
| 7318 | 6424 |

TABLE Z17-continued with a sequence length of 8192:

| Polarized channel sequence number | Reliability or reliability sequence number |
|---|---|
| 7319 | 6749 |
| 7320 | 6078 |
| 7321 | 6440 |
| 7322 | 6480 |
| 7323 | 6782 |
| 7324 | 6565 |
| 7325 | 6851 |
| 7326 | 6916 |
| 7327 | 7187 |
| 7328 | 5523 |
| 7329 | 5953 |
| 7330 | 6050 |
| 7331 | 6388 |
| 7332 | 6108 |
| 7333 | 6444 |
| 7334 | 6517 |
| 7335 | 6829 |
| 7336 | 6210 |
| 7337 | 6545 |
| 7338 | 6604 |
| 7339 | 6885 |
| 7340 | 6647 |
| 7341 | 6933 |
| 7342 | 6973 |
| 7343 | 7243 |
| 7344 | 6314 |
| 7345 | 6622 |
| 7346 | 6702 |
| 7347 | 6960 |
| 7348 | 6738 |
| 7349 | 7010 |
| 7350 | 7051 |
| 7351 | 7273 |
| 7352 | 6808 |
| 7353 | 7069 |
| 7354 | 7118 |
| 7355 | 7331 |
| 7356 | 7156 |
| 7357 | 7393 |
| 7358 | 7460 |
| 7359 | 7596 |
| 7360 | 5549 |
| 7361 | 6070 |
| 7362 | 6176 |
| 7363 | 6531 |
| 7364 | 6273 |
| 7365 | 6582 |
| 7366 | 6637 |
| 7367 | 6952 |
| 7368 | 6336 |
| 7369 | 6662 |
| 7370 | 6719 |
| 7371 | 6991 |
| 7372 | 6771 |
| 7373 | 7044 |
| 7374 | 7087 |
| 7375 | 7317 |
| 7376 | 6418 |
| 7377 | 6753 |
| 7378 | 6793 |
| 7379 | 7062 |
| 7380 | 6875 |
| 7381 | 7109 |
| 7382 | 7149 |
| 7383 | 7403 |
| 7384 | 6907 |
| 7385 | 7167 |
| 7386 | 7208 |
| 7387 | 7420 |
| 7388 | 7262 |
| 7389 | 7471 |
| 7390 | 7499 |
| 7391 | 7699 |
| 7392 | 6513 |
| 7393 | 6840 |

TABLE Z17-continued with a sequence length of 8192:

| Polarized channel sequence number | Reliability or reliability sequence number |
|---|---|
| 7394 | 6896 |
| 7395 | 7127 |
| 7396 | 6962 |
| 7397 | 7178 |
| 7398 | 7216 |
| 7399 | 7431 |
| 7400 | 7019 |
| 7401 | 7231 |
| 7402 | 7285 |
| 7403 | 7485 |
| 7404 | 7341 |
| 7405 | 7512 |
| 7406 | 7544 |
| 7407 | 7727 |
| 7408 | 7080 |
| 7409 | 7309 |
| 7410 | 7367 |
| 7411 | 7527 |
| 7412 | 7380 |
| 7413 | 7563 |
| 7414 | 7614 |
| 7415 | 7787 |
| 7416 | 7444 |
| 7417 | 7633 |
| 7418 | 7652 |
| 7419 | 7757 |
| 7420 | 7678 |
| 7421 | 7830 |
| 7422 | 7879 |
| 7423 | 7948 |
| 7424 | 4021 |
| 7425 | 4829 |
| 7426 | 5162 |
| 7427 | 5754 |
| 7428 | 5355 |
| 7429 | 5815 |
| 7430 | 5976 |
| 7431 | 6348 |
| 7432 | 5485 |
| 7433 | 5924 |
| 7434 | 6057 |
| 7435 | 6414 |
| 7436 | 6165 |
| 7437 | 6508 |
| 7438 | 6542 |
| 7439 | 6899 |
| 7440 | 5585 |
| 7441 | 6018 |
| 7442 | 6100 |
| 7443 | 6490 |
| 7444 | 6247 |
| 7445 | 6568 |
| 7446 | 6672 |
| 7447 | 6931 |
| 7448 | 6297 |
| 7449 | 6658 |
| 7450 | 6618 |
| 7451 | 6994 |
| 7452 | 6756 |
| 7453 | 7047 |
| 7454 | 7090 |
| 7455 | 7360 |
| 7456 | 5666 |
| 7457 | 6198 |
| 7458 | 6278 |
| 7459 | 6600 |
| 7460 | 6326 |
| 7461 | 6643 |
| 7462 | 6694 |
| 7463 | 7012 |
| 7464 | 6436 |
| 7465 | 6734 |
| 7466 | 6779 |
| 7467 | 7055 |
| 7468 | 6847 |

TABLE Z17-continued with a sequence length of 8192:

| Polarized channel sequence number | Reliability or reliability sequence number |
|---|---|
| 7469 | 7123 |
| 7470 | 7154 |
| 7471 | 7408 |
| 7472 | 6524 |
| 7473 | 6790 |
| 7474 | 6882 |
| 7475 | 7141 |
| 7476 | 6920 |
| 7477 | 7183 |
| 7478 | 7221 |
| 7479 | 7440 |
| 7480 | 6987 |
| 7481 | 7235 |
| 7482 | 7275 |
| 7483 | 7481 |
| 7484 | 7306 |
| 7485 | 7523 |
| 7486 | 7558 |
| 7487 | 7741 |
| 7488 | 5872 |
| 7489 | 6222 |
| 7490 | 6392 |
| 7491 | 6723 |
| 7492 | 6450 |
| 7493 | 6767 |
| 7494 | 6836 |
| 7495 | 7104 |
| 7496 | 6556 |
| 7497 | 6889 |
| 7498 | 6804 |
| 7499 | 7161 |
| 7500 | 6949 |
| 7501 | 7203 |
| 7502 | 7255 |
| 7503 | 7456 |
| 7504 | 6633 |
| 7505 | 6864 |
| 7506 | 6979 |
| 7507 | 7227 |
| 7508 | 7023 |
| 7509 | 7268 |
| 7510 | 7301 |
| 7511 | 7504 |
| 7512 | 7073 |
| 7513 | 7313 |
| 7514 | 7372 |
| 7515 | 7536 |
| 7516 | 7401 |
| 7517 | 7582 |
| 7518 | 7611 |
| 7519 | 7791 |
| 7520 | 6706 |
| 7521 | 7004 |
| 7522 | 7064 |
| 7523 | 7293 |
| 7524 | 7131 |
| 7525 | 7333 |
| 7526 | 7384 |
| 7527 | 7571 |
| 7528 | 7170 |
| 7529 | 7389 |
| 7530 | 7436 |
| 7531 | 7591 |
| 7532 | 7465 |
| 7533 | 7629 |
| 7534 | 7661 |
| 7535 | 7811 |
| 7536 | 7239 |
| 7537 | 7448 |
| 7538 | 7492 |
| 7539 | 7641 |
| 7540 | 7516 |
| 7541 | 7666 |
| 7542 | 7695 |
| 7543 | 7845 |

TABLE Z17-continued with a sequence length of 8192:

| Polarized channel sequence number | Reliability or reliability sequence number |
|---|---|
| 7544 | 7550 |
| 7545 | 7708 |
| 7546 | 7732 |
| 7547 | 7868 |
| 7548 | 7753 |
| 7549 | 7893 |
| 7550 | 7920 |
| 7551 | 8027 |
| 7552 | 6130 |
| 7553 | 6365 |
| 7554 | 6470 |
| 7555 | 6857 |
| 7556 | 6586 |
| 7557 | 6910 |
| 7558 | 6940 |
| 7559 | 7246 |
| 7560 | 6679 |
| 7561 | 6969 |
| 7562 | 7029 |
| 7563 | 7289 |
| 7564 | 7081 |
| 7565 | 7327 |
| 7566 | 7351 |
| 7567 | 7566 |
| 7568 | 6742 |
| 7569 | 7037 |
| 7570 | 7102 |
| 7571 | 7338 |
| 7572 | 7145 |
| 7573 | 7376 |
| 7574 | 7417 |
| 7575 | 7601 |
| 7576 | 7197 |
| 7577 | 7425 |
| 7578 | 7453 |
| 7579 | 7622 |
| 7580 | 7496 |
| 7581 | 7658 |
| 7582 | 7689 |
| 7583 | 7838 |
| 7584 | 6811 |
| 7585 | 7113 |
| 7586 | 7174 |
| 7587 | 7397 |
| 7588 | 7213 |
| 7589 | 7429 |
| 7590 | 7473 |
| 7591 | 7647 |
| 7592 | 7281 |
| 7593 | 7489 |
| 7594 | 7518 |
| 7595 | 7673 |
| 7596 | 7548 |
| 7597 | 7703 |
| 7598 | 7724 |
| 7599 | 7863 |
| 7600 | 7347 |
| 7601 | 7532 |
| 7602 | 7576 |
| 7603 | 7715 |
| 7604 | 7598 |
| 7605 | 7744 |
| 7606 | 7767 |
| 7607 | 7884 |
| 7608 | 7637 |
| 7609 | 7777 |
| 7610 | 7803 |
| 7611 | 7909 |
| 7612 | 7820 |
| 7613 | 7937 |
| 7614 | 7973 |
| 7615 | 8035 |
| 7616 | 6822 |
| 7617 | 7191 |
| 7618 | 7258 |

TABLE Z17-continued

| with a sequence length of 8192: | |
|---|---|
| Polarized channel sequence number | Reliability or reliability sequence number |
| 7619 | 7477 |
| 7620 | 7322 |
| 7621 | 7508 |
| 7622 | 7540 |
| 7623 | 7710 |
| 7624 | 7361 |
| 7625 | 7555 |
| 7626 | 7586 |
| 7627 | 7736 |
| 7628 | 7617 |
| 7629 | 7761 |
| 7630 | 7784 |
| 7631 | 7904 |
| 7632 | 7412 |
| 7633 | 7605 |
| 7634 | 7626 |
| 7635 | 7771 |
| 7636 | 7671 |
| 7637 | 7798 |
| 7638 | 7816 |
| 7639 | 7943 |
| 7640 | 7687 |
| 7641 | 7825 |
| 7642 | 7849 |
| 7643 | 7953 |
| 7644 | 7872 |
| 7645 | 7978 |
| 7646 | 7992 |
| 7647 | 8078 |
| 7648 | 7468 |
| 7649 | 7650 |
| 7650 | 7682 |
| 7651 | 7806 |
| 7652 | 7721 |
| 7653 | 7835 |
| 7654 | 7852 |
| 7655 | 7961 |
| 7656 | 7750 |
| 7657 | 7859 |
| 7658 | 7888 |
| 7659 | 7985 |
| 7660 | 7913 |
| 7661 | 7998 |
| 7662 | 8013 |
| 7663 | 8089 |
| 7664 | 7780 |
| 7665 | 7898 |
| 7666 | 7925 |
| 7667 | 8005 |
| 7668 | 7932 |
| 7669 | 8018 |
| 7670 | 8043 |
| 7671 | 8112 |
| 7672 | 7966 |
| 7673 | 8051 |
| 7674 | 8059 |
| 7675 | 8099 |
| 7676 | 8069 |
| 7677 | 8124 |
| 7678 | 8140 |
| 7679 | 8160 |
| 7680 | 4100 |
| 7681 | 5013 |
| 7682 | 5341 |
| 7683 | 5960 |
| 7684 | 5535 |
| 7685 | 6086 |
| 7686 | 6229 |
| 7687 | 6592 |
| 7688 | 5677 |
| 7689 | 6184 |
| 7690 | 6307 |
| 7691 | 6650 |
| 7692 | 6403 |
| 7693 | 6730 |

TABLE Z17-continued

| with a sequence length of 8192: | |
|---|---|
| Polarized channel sequence number | Reliability or reliability sequence number |
| 7694 | 6760 |
| 7695 | 7107 |
| 7696 | 5794 |
| 7697 | 6266 |
| 7698 | 6344 |
| 7699 | 6715 |
| 7700 | 6484 |
| 7701 | 6801 |
| 7702 | 6892 |
| 7703 | 7137 |
| 7704 | 6527 |
| 7705 | 6879 |
| 7706 | 6844 |
| 7707 | 7186 |
| 7708 | 6976 |
| 7709 | 7228 |
| 7710 | 7266 |
| 7711 | 7503 |
| 7712 | 5880 |
| 7713 | 6429 |
| 7714 | 6504 |
| 7715 | 6825 |
| 7716 | 6549 |
| 7717 | 6868 |
| 7718 | 6924 |
| 7719 | 7198 |
| 7720 | 6666 |
| 7721 | 6956 |
| 7722 | 6998 |
| 7723 | 7236 |
| 7724 | 7058 |
| 7725 | 7292 |
| 7726 | 7319 |
| 7727 | 7542 |
| 7728 | 6745 |
| 7729 | 7016 |
| 7730 | 7094 |
| 7731 | 7308 |
| 7732 | 7130 |
| 7733 | 7349 |
| 7734 | 7377 |
| 7735 | 7572 |
| 7736 | 7179 |
| 7737 | 7390 |
| 7738 | 7426 |
| 7739 | 7612 |
| 7740 | 7455 |
| 7741 | 7651 |
| 7742 | 7684 |
| 7743 | 7837 |
| 7744 | 6135 |
| 7745 | 6454 |
| 7746 | 6629 |
| 7747 | 6945 |
| 7748 | 6683 |
| 7749 | 6985 |
| 7750 | 7049 |
| 7751 | 7282 |
| 7752 | 6775 |
| 7753 | 7099 |
| 7754 | 7025 |
| 7755 | 7329 |
| 7756 | 7150 |
| 7757 | 7364 |
| 7758 | 7409 |
| 7759 | 7590 |
| 7760 | 6853 |
| 7761 | 7084 |
| 7762 | 7164 |
| 7763 | 7382 |
| 7764 | 7212 |
| 7765 | 7418 |
| 7766 | 7447 |
| 7767 | 7635 |
| 7768 | 7254 |

TABLE Z17-continued

| with a sequence length of 8192: | |
|---|---|
| Polarized channel sequence number | Reliability or reliability sequence number |
| 7769 | 7459 |
| 7770 | 7513 |
| 7771 | 7660 |
| 7772 | 7538 |
| 7773 | 7704 |
| 7774 | 7730 |
| 7775 | 7880 |
| 7776 | 6937 |
| 7777 | 7193 |
| 7778 | 7247 |
| 7779 | 7443 |
| 7780 | 7303 |
| 7781 | 7478 |
| 7782 | 7525 |
| 7783 | 7693 |
| 7784 | 7335 |
| 7785 | 7529 |
| 7786 | 7569 |
| 7787 | 7713 |
| 7788 | 7592 |
| 7789 | 7748 |
| 7790 | 7774 |
| 7791 | 7896 |
| 7792 | 7394 |
| 7793 | 7581 |
| 7794 | 7625 |
| 7795 | 7756 |
| 7796 | 7643 |
| 7797 | 7779 |
| 7798 | 7804 |
| 7799 | 7922 |
| 7800 | 7675 |
| 7801 | 7813 |
| 7802 | 7829 |
| 7803 | 7944 |
| 7804 | 7851 |
| 7805 | 7962 |
| 7806 | 7983 |
| 7807 | 8066 |
| 7808 | 6371 |
| 7809 | 6611 |
| 7810 | 6698 |
| 7811 | 7076 |
| 7812 | 6814 |
| 7813 | 7116 |
| 7814 | 7142 |
| 7815 | 7399 |
| 7816 | 6903 |
| 7817 | 7159 |
| 7818 | 7220 |
| 7819 | 7435 |
| 7820 | 7261 |
| 7821 | 7474 |
| 7822 | 7495 |
| 7823 | 7691 |
| 7824 | 6966 |
| 7825 | 7223 |
| 7826 | 7277 |
| 7827 | 7486 |
| 7828 | 7315 |
| 7829 | 7517 |
| 7830 | 7554 |
| 7831 | 7722 |
| 7832 | 7357 |
| 7833 | 7560 |
| 7834 | 7583 |
| 7835 | 7739 |
| 7836 | 7627 |
| 7837 | 7770 |
| 7838 | 7799 |
| 7839 | 7918 |
| 7840 | 7031 |
| 7841 | 7286 |
| 7842 | 7340 |
| 7843 | 7531 |

TABLE Z17-continued

| with a sequence length of 8192: | |
|---|---|
| Polarized channel sequence number | Reliability or reliability sequence number |
| 7844 | 7373 |
| 7845 | 7564 |
| 7846 | 7603 |
| 7847 | 7760 |
| 7848 | 7430 |
| 7849 | 7620 |
| 7850 | 7648 |
| 7851 | 7786 |
| 7852 | 7672 |
| 7853 | 7809 |
| 7854 | 7826 |
| 7855 | 7939 |
| 7856 | 7491 |
| 7857 | 7657 |
| 7858 | 7698 |
| 7859 | 7818 |
| 7860 | 7716 |
| 7861 | 7842 |
| 7862 | 7860 |
| 7863 | 7951 |
| 7864 | 7751 |
| 7865 | 7867 |
| 7866 | 7887 |
| 7867 | 7974 |
| 7868 | 7905 |
| 7869 | 7996 |
| 7870 | 8023 |
| 7871 | 8071 |
| 7872 | 7041 |
| 7873 | 7352 |
| 7874 | 7413 |
| 7875 | 7610 |
| 7876 | 7464 |
| 7877 | 7636 |
| 7878 | 7665 |
| 7879 | 7817 |
| 7880 | 7506 |
| 7881 | 7681 |
| 7882 | 7705 |
| 7883 | 7832 |
| 7884 | 7734 |
| 7885 | 7856 |
| 7886 | 7874 |
| 7887 | 7969 |
| 7888 | 7549 |
| 7889 | 7725 |
| 7890 | 7743 |
| 7891 | 7864 |
| 7892 | 7781 |
| 7893 | 7885 |
| 7894 | 7901 |
| 7895 | 8001 |
| 7896 | 7796 |
| 7897 | 7908 |
| 7898 | 7926 |
| 7899 | 8008 |
| 7900 | 7947 |
| 7901 | 8026 |
| 7902 | 8038 |
| 7903 | 8104 |
| 7904 | 7600 |
| 7905 | 7766 |
| 7906 | 7790 |
| 7907 | 7892 |
| 7908 | 7821 |
| 7909 | 7912 |
| 7910 | 7929 |
| 7911 | 8012 |
| 7912 | 7846 |
| 7913 | 7934 |
| 7914 | 7956 |
| 7915 | 8032 |
| 7916 | 7979 |
| 7917 | 8042 |
| 7918 | 8053 |

TABLE Z17-continued with a sequence length of 8192:

| Polarized channel sequence number | Reliability or reliability sequence number |
|---|---|
| 7919 | 8114 |
| 7920 | 7871 |
| 7921 | 7965 |
| 7922 | 7989 |
| 7923 | 8048 |
| 7924 | 7993 |
| 7925 | 8060 |
| 7926 | 8077 |
| 7927 | 8130 |
| 7928 | 8016 |
| 7929 | 8083 |
| 7930 | 8091 |
| 7931 | 8121 |
| 7932 | 8097 |
| 7933 | 8141 |
| 7934 | 8153 |
| 7935 | 8167 |
| 7936 | 6027 |
| 7937 | 6573 |
| 7938 | 6786 |
| 7939 | 7172 |
| 7940 | 6913 |
| 7941 | 7206 |
| 7942 | 7298 |
| 7943 | 7509 |
| 7944 | 7007 |
| 7945 | 7270 |
| 7946 | 7344 |
| 7947 | 7545 |
| 7948 | 7406 |
| 7949 | 7597 |
| 7950 | 7615 |
| 7951 | 7794 |
| 7952 | 7067 |
| 7953 | 7324 |
| 7954 | 7368 |
| 7955 | 7587 |
| 7956 | 7450 |
| 7957 | 7631 |
| 7958 | 7683 |
| 7959 | 7805 |
| 7960 | 7483 |
| 7961 | 7676 |
| 7962 | 7656 |
| 7963 | 7836 |
| 7964 | 7726 |
| 7965 | 7857 |
| 7966 | 7877 |
| 7967 | 7984 |
| 7968 | 7121 |
| 7969 | 7422 |
| 7970 | 7467 |
| 7971 | 7645 |
| 7972 | 7498 |
| 7973 | 7668 |
| 7974 | 7697 |
| 7975 | 7843 |
| 7976 | 7557 |
| 7977 | 7714 |
| 7978 | 7738 |
| 7979 | 7862 |
| 7980 | 7768 |
| 7981 | 7890 |
| 7982 | 7903 |
| 7983 | 8002 |
| 7984 | 7606 |
| 7985 | 7742 |
| 7986 | 7785 |
| 7987 | 7897 |
| 7988 | 7801 |
| 7989 | 7917 |
| 7990 | 7930 |
| 7991 | 8015 |
| 7992 | 7831 |
| 7993 | 7935 |

TABLE Z17-continued with a sequence length of 8192:

| Polarized channel sequence number | Reliability or reliability sequence number |
|---|---|
| 7994 | 7952 |
| 7995 | 8030 |
| 7996 | 7964 |
| 7997 | 8047 |
| 7998 | 8058 |
| 7999 | 8117 |
| 8000 | 7242 |
| 8001 | 7438 |
| 8002 | 7535 |
| 8003 | 7709 |
| 8004 | 7568 |
| 8005 | 7731 |
| 8006 | 7763 |
| 8007 | 7882 |
| 8008 | 7621 |
| 8009 | 7789 |
| 8010 | 7749 |
| 8011 | 7907 |
| 8012 | 7815 |
| 8013 | 7924 |
| 8014 | 7945 |
| 8015 | 8022 |
| 8016 | 7663 |
| 8017 | 7778 |
| 8018 | 7828 |
| 8019 | 7933 |
| 8020 | 7848 |
| 8021 | 7950 |
| 8022 | 7963 |
| 8023 | 8039 |
| 8024 | 7870 |
| 8025 | 7968 |
| 8026 | 7990 |
| 8027 | 8050 |
| 8028 | 8000 |
| 8029 | 8067 |
| 8030 | 8076 |
| 8031 | 8131 |
| 8032 | 7701 |
| 8033 | 7839 |
| 8034 | 7865 |
| 8035 | 7960 |
| 8036 | 7894 |
| 8037 | 7975 |
| 8038 | 7994 |
| 8039 | 8063 |
| 8040 | 7910 |
| 8041 | 7995 |
| 8042 | 8014 |
| 8043 | 8070 |
| 8044 | 8024 |
| 8045 | 8082 |
| 8046 | 8093 |
| 8047 | 8135 |
| 8048 | 7938 |
| 8049 | 8017 |
| 8050 | 8036 |
| 8051 | 8086 |
| 8052 | 8045 |
| 8053 | 8094 |
| 8054 | 8103 |
| 8055 | 8144 |
| 8056 | 8055 |
| 8057 | 8107 |
| 8058 | 8115 |
| 8059 | 8150 |
| 8060 | 8120 |
| 8061 | 8156 |
| 8062 | 8162 |
| 8063 | 8179 |
| 8064 | 7385 |
| 8065 | 7522 |
| 8066 | 7577 |
| 8067 | 7772 |
| 8068 | 7640 |

TABLE Z17-continued with a sequence length of 8192:

| Polarized channel sequence number | Reliability or reliability sequence number |
|---|---|
| 8069 | 7797 |
| 8070 | 7810 |
| 8071 | 7941 |
| 8072 | 7688 |
| 8073 | 7823 |
| 8074 | 7850 |
| 8075 | 7958 |
| 8076 | 7873 |
| 8077 | 7972 |
| 8078 | 7982 |
| 8079 | 8062 |
| 8080 | 7718 |
| 8081 | 7855 |
| 8082 | 7881 |
| 8083 | 7976 |
| 8084 | 7900 |
| 8085 | 7991 |
| 8086 | 8007 |
| 8087 | 8074 |
| 8088 | 7921 |
| 8089 | 8010 |
| 8090 | 8020 |
| 8091 | 8080 |
| 8092 | 8037 |
| 8093 | 8092 |
| 8094 | 8102 |
| 8095 | 8143 |
| 8096 | 7755 |
| 8097 | 7886 |
| 8098 | 7911 |
| 8099 | 7999 |
| 8100 | 7927 |
| 8101 | 8011 |
| 8102 | 8028 |
| 8103 | 8087 |
| 8104 | 7954 |
| 8105 | 8034 |
| 8106 | 8046 |
| 8107 | 8096 |
| 8108 | 8054 |
| 8109 | 8106 |
| 8110 | 8113 |
| 8111 | 8149 |
| 8112 | 7980 |
| 8113 | 8049 |
| 8114 | 8065 |
| 8115 | 8109 |
| 8116 | 8073 |
| 8117 | 8118 |
| 8118 | 8123 |
| 8119 | 8154 |
| 8120 | 8085 |
| 8121 | 8127 |
| 8122 | 8133 |
| 8123 | 8159 |
| 8124 | 8137 |
| 8125 | 8165 |
| 8126 | 8171 |
| 8127 | 8180 |
| 8128 | 7759 |
| 8129 | 7919 |
| 8130 | 7946 |
| 8131 | 8029 |
| 8132 | 7970 |
| 8133 | 8041 |
| 8134 | 8052 |
| 8135 | 8108 |
| 8136 | 7986 |
| 8137 | 8056 |
| 8138 | 8068 |
| 8139 | 8116 |
| 8140 | 8079 |
| 8141 | 8122 |
| 8142 | 8129 |
| 8143 | 8158 |
| 8144 | 8004 |
| 8145 | 8075 |
| 8146 | 8081 |
| 8147 | 8125 |
| 8148 | 8095 |
| 8149 | 8132 |
| 8150 | 8136 |
| 8151 | 8166 |
| 8152 | 8101 |
| 8153 | 8139 |
| 8154 | 8146 |
| 8155 | 8168 |
| 8156 | 8151 |
| 8157 | 8172 |
| 8158 | 8174 |
| 8159 | 8185 |
| 8160 | 8025 |
| 8161 | 8090 |
| 8162 | 8100 |
| 8163 | 8134 |
| 8164 | 8110 |
| 8165 | 8142 |
| 8166 | 8147 |
| 8167 | 8169 |
| 8168 | 8119 |
| 8169 | 8148 |
| 8170 | 8155 |
| 8171 | 8173 |
| 8172 | 8161 |
| 8173 | 8175 |
| 8174 | 8177 |
| 8175 | 8186 |
| 8176 | 8128 |
| 8177 | 8157 |
| 8178 | 8163 |
| 8179 | 8176 |
| 8180 | 8164 |
| 8181 | 8178 |
| 8182 | 8181 |
| 8183 | 8188 |
| 8184 | 8170 |
| 8185 | 8182 |
| 8186 | 8183 |
| 8187 | 8187 |
| 8188 | 8184 |
| 8189 | 8189 |
| 8190 | 8190 |
| 8191 | 8191 |

Sequence Z18, with a sequence length of 4096:

[0, 1, 2, 7, 3, 12, 15, 28, 4, 14, 17, 31, 20, 37, 39, 77, 5, 16, 18, 36, 23, 43, 51, 83, 25, 50, 4 7, 91, 60, 99, 108, 175, 6, 21, 24, 45, 26, 49, 55, 94, 32, 58, 62, 100, 71, 114, 120, 192, 38, 64, 75, 11 7, 82, 127, 136, 205, 90, 140, 151, 223, 160, 243, 263, 383, 13, 22, 30, 57, 33, 61, 70, 111, 41, 76, 6 5, 123, 85, 132, 144, 212, 48, 74, 88, 137, 96, 149, 158, 234, 106, 161, 180, 248, 189, 274, 293, 42 9, 56, 92, 104, 156, 116, 167, 185, 267, 124, 186, 204, 279, 213, 304, 326, 448, 141, 207, 230, 311, 239, 330, 351, 486, 257, 358, 375, 516, 398, 547, 588, 789, 19, 29, 35, 73, 44, 78, 84, 142, 52, 87, 97, 153, 107, 165, 173, 266, 59, 98, 110, 170, 119, 181, 195, 287, 130, 198, 208, 298, 231, 322, 34 8, 478, 67, 112, 125, 187, 135, 200, 218, 316, 152, 225, 241, 336, 254, 354, 371, 511, 172, 247, 27 2, 366, 283, 387, 407, 530, 308, 415, 440, 570, 461, 617, 673, 807, 69, 129, 146, 222, 163, 235, 25 1, 362, 176, 259, 276, 379, 295, 403, 424, 561, 194, 288, 302, 411, 331, 436, 456, 625, 343, 466, 4 91, 638, 524, 682, 710, 939, 217, 318, 339, 445, 367, 472, 495, 649, 391, 505, 538, 696, 578, 720, 752, 980, 420, 556, 596, 735, 607, 771, 830, 1077, 660, 853, 877, 1026, 910, 1154, 1250, 1417, 8, 27, 42, 89, 54, 95, 115, 178, 63, 109, 126, 193, 143, 216, 224, 341, 72, 121, 134, 211, 159, 232, 26 2, 353, 168, 258, 246, 380, 289, 404, 425, 592, 80, 150, 164, 240, 174, 252, 269, 389, 197, 282, 29 7, 408, 321, 442, 458, 629, 220, 301, 334, 452, 349, 476, 498, 656, 378, 506, 533, 692, 552, 731, 7 67, 999, 101, 154, 188, 278, 202, 294, 317, 432, 228, 337, 307, 463, 361, 487, 520, 670, 250, 328, 373, 501, 392, 528, 549, 713, 417, 557, 600, 745, 624, 793, 826, 1084, 273, 385, 413, 544, 447, 5 71, 609, 781, 468, 613, 653, 803, 677, 848, 888, 1119, 509, 663, 703, 863, 724, 894, 932, 1183, 7 60, 951, 987, 1229, 1019, 1282, 1344, 1665, 138, 182, 206, 324, 237, 344, 357, 514, 264, 369, 39 6, 542, 421, 567, 584, 776, 285, 399, 431, 575, 455, 603, 635, 816, 483, 642, 666, 840, 707, 884, 9 26, 1171, 309, 437, 471, 620, 493, 646, 684, 869, 535, 699, 728, 903, 756, 943, 974, 1221, 582, 7 41, 785, 962, 812, 1007, 1041, 1262, 858, 1056, 1102, 1318, 1134, 1387, 1485, 1693, 313, 480, 521, 688, 564, 716, 749, 955, 593, 764, 798, 992, 833, 1033, 1069, 1306, 632, 819, 844, 1048, 89 9, 1095, 1127, 1400, 920, 1143, 1192, 1431, 1238, 1500, 1542, 1889, 681, 873, 914, 1111, 968, 1 163, 1200, 1448, 1014, 1212, 1274, 1524, 1332, 1564, 1612, 1945, 1063, 1294, 1356, 1587, 13 73, 1634, 1727, 2081, 1468, 1762, 1799, 2005, 1841, 2173, 2299, 2509, 9, 34, 53, 113, 68, 131, 1 55, 238, 81, 147, 171, 255, 191, 281, 290, 434, 93, 162, 177, 275, 210, 305, 338, 450, 221, 332, 31 9, 477, 372, 502, 525, 712, 103, 196, 215, 315, 226, 329, 350, 484, 260, 363, 381, 507, 409, 543, 5 62, 751, 286, 390, 426, 554, 446, 583, 605, 784, 473, 615, 644, 827, 669, 875, 919, 1169, 139, 20 3, 249, 360, 265, 376, 405, 537, 296, 430, 395, 569, 457, 595, 630, 802, 323, 423, 465, 608, 492, 6 37, 661, 854, 518, 672, 723, 886, 747, 946, 983, 1253, 356, 481, 515, 658, 551, 689, 734, 930, 57 4, 738, 780, 958, 805, 1009, 1054, 1288, 618, 791, 842, 1023, 864, 1062, 1105, 1350, 906, 1122, 1151, 1404, 1197, 1453, 1516, 1825, 184, 244, 271, 418, 310, 439, 453, 621, 342, 462, 496, 650, 523, 686, 704, 928, 368, 500, 534, 697, 558, 726, 762, 971, 590, 770, 795, 998, 846, 1045, 1098, 1338, 397, 540, 577, 739, 601, 774, 817, 1032, 647, 836, 871, 1074, 901, 1113, 1146, 1393, 700, 881, 936, 1133, 964, 1177, 1215, 1425, 1017, 1228, 1271, 1488, 1309, 1559, 1648, 1853, 402, 5 87, 633, 823, 676, 857, 893, 1130, 715, 913, 948, 1160, 990, 1206, 1244, 1474, 759, 976, 1004, 1 224, 1066, 1265, 1300, 1575, 1090, 1315, 1361, 1595, 1414, 1662, 1707, 2039, 813, 1039, 108 1, 1279, 1137, 1329, 1367, 1609, 1186, 1380, 1439, 1684, 1505, 1721, 1771, 2095, 1235, 1463, 1531, 1746, 1547, 1804, 1883, 2215, 1626, 1919, 1957, 2149, 1997, 2308, 2420, 2617, 122, 23 3, 300, 469, 347, 488, 548, 719, 386, 529, 580, 755, 626, 809, 832, 1087, 414, 565, 599, 799, 665, 850, 916, 1108, 693, 907, 880, 1166, 978, 1209, 1247, 1519, 441, 641, 680, 867, 708, 897, 935, 1 180, 766, 959, 995, 1218, 1044, 1277, 1303, 1579, 822, 1002, 1072, 1291, 1101, 1335, 1370, 16 21, 1157, 1384, 1428, 1679, 1460, 1743, 1793, 2117, 510, 654, 744, 952, 778, 986, 1036, 1259, 837, 1080, 1011, 1312, 1125, 1353, 1407, 1643, 890, 1059, 1149, 1376, 1189, 1422, 1456, 1712, 1232, 1471, 1535, 1757, 1570, 1830, 1877, 2224, 942, 1174, 1226, 1445, 1285, 1493, 1550, 18 15, 1323, 1555, 1617, 1847, 1651, 1914, 1971, 2260, 1390, 1631, 1698, 1931, 1732, 1977, 203 3, 2339, 1782, 2051, 2103, 2394, 2141, 2455, 2539, 2875, 612, 730, 788, 1051, 860, 1092, 1116, 1397, 923, 1140, 1194, 1442, 1241, 1482, 1511, 1810, 967, 1203, 1256, 1496, 1297, 1539, 159 2, 1866, 1347, 1600, 1639, 1900, 1704, 1963, 2025, 2330, 1021, 1268, 1326, 1567, 1364, 1604, 1670, 1937, 1434, 1690, 1737, 1991, 1777, 2047, 2087, 2385, 1508, 1752, 1819, 2065, 1860, 2 125, 2165, 2432, 1925, 2190, 2243, 2494, 2279, 2583, 2688, 2904, 1029, 1341, 1411, 1676, 14 79, 1718, 1768, 2059, 1527, 1788, 1836, 2111, 1894, 2157, 2207, 2482, 1584, 1872, 1906, 218 2, 1985, 2232, 2269, 2601, 2019, 2288, 2350, 2633, 2406, 2710, 2750, 3083, 1657, 1951, 2011, 2251, 2073, 2319, 2362, 2652, 2133, 2373, 2443, 2730, 2524, 2773, 2822, 3134, 2198, 2470, 2 552, 2797, 2567, 2846, 2933, 3252, 2671, 2967, 3002, 3187, 3042, 3328, 3433, 3584, 10, 40, 66, 145, 86, 179, 209, 312, 102, 201, 227, 333, 253, 370, 382, 560, 118, 219, 236, 364, 277, 400, 438, 581, 291, 433, 416, 611, 485, 643, 671, 882, 133, 261, 284, 412, 299, 428, 460, 623, 340, 474, 49 4, 648, 531, 694, 714, 927, 377, 503, 550, 705, 576, 740, 765, 963, 606, 779, 810, 1010, 839, 105 8, 1106, 1375, 190, 270, 327, 470, 346, 489, 527, 683, 388, 555, 508, 725, 589, 754, 794, 982, 42 2, 545, 597, 769, 631, 804, 831, 1037, 664, 841, 895, 1070, 922, 1132, 1173, 1466, 464, 614, 659, 828, 702, 859, 909, 1118, 729, 911, 960, 1144, 984, 1199, 1251, 1506, 783, 970, 1025, 1216, 10 49, 1260, 1308, 1577, 1091, 1321, 1358, 1633, 1406, 1686, 1759, 2071, 245, 320, 359, 541, 406, 563, 586, 786, 444, 594, 636, 818, 667, 855, 876, 1115, 479, 639, 678, 866, 709, 898, 938, 1161, 746, 947, 972, 1187, 1028, 1243, 1299, 1562, 513, 687, 733, 915, 761, 950, 996, 1225, 814, 101 5, 1055, 1272, 1085, 1314, 1349, 1624, 872, 1067, 1126, 1337, 1153, 1383, 1423, 1658, 1208, 1 440, 1490, 1728, 1529, 1806, 1898, 2097, 522, 742, 796, 1006, 849, 1040, 1078, 1331, 885, 109 7, 1139, 1366, 1179, 1415, 1458, 1711, 934, 1164, 1196, 1433, 1263, 1480, 1521, 1821, 1290, 1 540, 1585, 1843, 1646, 1912, 1955, 2266, 994, 1234, 1281, 1498, 1340, 1552, 1594, 1858, 139 2, 1610, 1672, 1933, 1741, 1973, 2021, 2317, 1450, 1702, 1773, 1995, 1790, 2048, 2127, 2429, 1875, 2155, 2188, 2371, 2230, 2517, 2622, 2794, 157, 306, 394, 602, 454, 627, 698, 892, 499, 6 75, 736, 931, 790, 991, 1013, 1284, 536, 718, 757, 979, 835, 1030, 1104, 1311, 862, 1094, 1065, 1369, 1167, 1418, 1461, 1764, 568, 808, 851, 1052, 879, 1083, 1120, 1386, 944, 1150, 1184, 14 26, 1240, 1495, 1526, 1827, 1000, 1193, 1269, 1513, 1302, 1557, 1599, 1870, 1363, 1614, 166 0, 1927, 1697, 1989, 2043, 2341, 652, 821, 918, 1142, 954, 1176, 1231, 1476, 1022, 1275, 1205, 1534, 1328, 1580, 1638, 1893, 1076, 1254, 1355, 1605, 1395, 1653, 1691, 1961, 1444, 1705, 1 779, 2009, 1817, 2077, 2121, 2439, 1129, 1378, 1436, 1683, 1503, 1730, 1795, 2061, 1544, 18 01, 1864, 2091, 1904, 2151, 2203, 2477, 1619, 1881, 1943, 2169, 1979, 2211, 2258, 2547, 203 1, 2282, 2326, 2598, 2364, 2657, 2721, 3027, 773, 902, 966, 1248, 1043, 1293, 1320, 1627, 110 9, 1346, 1401, 1677, 1452, 1723, 1753, 2053, 1156, 1409, 1472, 1736, 1518, 1784, 1838, 2107, 1572, 1849, 1887, 2139, 1949, 2196, 2249, 2534, 1210, 1484, 1549, 1812, 1590, 1855, 1916, 2 178, 1667, 1939, 1983, 2221, 2027, 2273, 2310, 2588, 1748, 2003, 2067, 2295, 2101, 2348, 23 89, 2636, 2163, 2408, 2460, 2696, 2497, 2765, 2862, 3053, 1219, 1565, 1641, 1921, 1716, 196 7, 2015, 2286, 1766, 2037, 2083, 2332, 2131, 2380, 2422, 2682, 1832, 2113, 2145, 2399, 2217, 2451, 2487, 2779, 2245, 2504, 2557, 2809, 2609, 2878, 2917, 3212, 1910, 2184, 2236, 2467, 2 304, 2527, 2565, 2828, 2357, 2578, 2646, 2897, 2707, 2937, 2981, 3257, 2415, 2668, 2736, 29 57, 2753, 2999, 3079, 3358, 2843, 3110, 3142, 3298, 3174, 3421, 3510, 3644, 169, 352, 449, 69 1, 517, 750, 824, 1047, 573, 800, 868, 1088, 924, 1147, 1170, 1477, 619, 845, 889, 1136, 975, 12 02, 1278, 1509, 1003, 1266, 1237, 1560, 1352, 1607, 1650, 1959, 655, 940, 988, 1222, 1018, 12 57, 1305, 1574, 1099, 1334, 1372, 1616, 1429, 1681, 1714, 2017, 1159, 1389, 1464, 1700, 150 1, 1750, 1786, 2063, 1554, 1802, 1851, 2123, 1891, 2186, 2241, 2532, 775, 956, 1073, 1325, 11 12, 1360, 1420, 1669, 1182, 1469, 1398, 1725, 1522, 1770, 1828, 2089, 1245, 1455, 1537, 179 1, 1589, 1840, 1879, 2159, 1636, 1896, 1975, 2200, 2013, 2275, 2321, 2625, 1317, 1569, 1629, 1873, 1695, 1923, 1993, 2256, 1734, 1999, 2057, 2290, 2093, 2353, 2403, 2663, 1808, 2075, 2 143, 2369, 2171, 2413, 2463, 2727, 2226, 2480, 2514, 2782, 2562, 2831, 2891, 3162, 905, 106 0, 1123, 1447, 1213, 1487, 1514, 1814, 1287, 1532, 1597, 1862, 1645, 1918, 1947, 2253, 1343, 1602, 1663, 1935, 1709, 1981, 2035, 2306, 1761, 2045, 2079, 2337, 2147, 2396, 2453, 2716, 1 403, 1674, 1739, 2001, 1781, 2049, 2109, 2378, 1856, 2135, 2180, 2427, 2219, 2472, 2507, 27 71, 1941, 2194, 2264, 2492, 2297, 2542, 2580, 2803, 2360, 2596, 2644, 2865, 2685, 2930, 301 3, 3183, 1412, 1755, 1834, 2119, 1902, 2161, 2209, 2489, 1965, 2234, 2277, 2522, 2328, 2572, 2614, 2853, 2029, 2312, 2346, 2591, 2417, 2638, 2676, 2947, 2446, 2693, 2738, 2964, 2791, 3 024, 3064, 3323, 2105, 2387, 2436, 2654, 2499, 2704, 2744, 2978, 2549, 2759, 2816, 3045, 28 81, 3075, 3118, 3368, 2606, 2840, 2907, 3098, 2920, 3146, 3208, 3456, 2992, 3234, 3266, 340 5, 3294, 3516, 3591, 3702, 721, 1034, 1190, 1545, 1296, 1582, 1688, 1969, 1381, 1655, 1744, 2 023, 1823, 2099, 2129, 2441, 1437, 1720, 1775, 2085, 1885, 2153, 2238, 2465, 1929, 2228, 21 92, 2529, 2315, 2575, 2620, 2894, 1492, 1845, 1908, 2176, 1953, 2213, 2262, 2544, 2041, 229 2, 2335, 2585, 2392, 2649, 2679, 2950, 2115, 2344, 2424, 2665, 2458, 2713, 2747, 2988, 2519, 2762, 2806, 3038, 2837, 3094, 3138, 3384, 1622, 1868, 2007, 2284, 2055, 2323, 2382, 2630, 2 137, 2434, 2355, 2690, 2484, 2733, 2785, 3009, 2205, 2410, 2512, 2756, 2554, 2800, 2834, 30 68, 2604, 2849, 2910, 3106, 2944, 3166, 3204, 3461, 2271, 2537, 2593, 2825, 2660, 2868, 292 3, 3154, 2699, 2927, 2985, 3178, 3016, 3230, 3275, 3485, 2768, 2995, 3057, 3243, 3087, 3280, 3318, 3536, 3126, 3337, 3373, 3569, 3400, 3613, 3660, 3827, 1797, 1987, 2069, 2401, 2167, 2 448, 2475, 2776, 2247, 2502, 2560, 2819, 2612, 2859, 2888, 3150, 2301, 2570, 2628, 2872, 26 74, 2914, 2960, 3195, 2724, 2971, 3006, 3221, 3060, 3270, 3313, 3529, 2366, 2641, 2701, 294 0, 2741, 2974, 3031, 3248, 2812, 3049, 3090, 3289, 3122, 3332, 3363, 3563, 2884, 3102, 3158, 3347, 3191, 3389, 3416, 3598, 3239, 3438, 3473, 3636, 3497, 3685, 3740, 3840, 2376, 2718, 2 788, 3034, 2856, 3072, 3114, 3342, 2900, 3130, 3170, 3378, 3217, 3410, 3450, 3628, 2954, 32 00, 3225, 3427, 3284, 3467, 3491, 3694, 3308, 3504, 3542, 3712, 3576, 3750, 3770, 3912, 302 0, 3261, 3303, 3479, 3352, 3523, 3549, 3721, 3394, 3556, 3605, 3760, 3652, 3781, 3803, 3929, 3444, 3620, 3668, 3792, 3676, 3815, 3853, 3968, 3730, 3866, 3881, 3947, 3896, 3990, 4016, 4 049, 11, 46, 79, 183, 105, 242, 280, 410, 128, 268, 303, 435, 335, 482, 497, 722, 148, 292, 314, 47 5, 365, 526, 572, 748, 384, 566, 546, 787, 628, 825, 861, 1110, 166, 345, 374, 539, 393, 559, 598, 801, 443, 616, 640, 829, 690, 887, 912, 1165, 490, 651, 711, 900, 743, 941, 973, 1204, 782, 989, 1027, 1258, 1061, 1313, 1368, 1652, 256, 355, 427, 610, 451, 634, 685, 874, 512, 717, 657, 925, 758, 957, 1005, 1227, 553, 706, 772, 977, 811, 1020, 1053, 1289, 852, 1064, 1128, 1327, 1155, 1396, 1443, 1745, 604, 792, 847, 1046, 896, 1082, 1141, 1379, 929, 1145, 1201, 1410, 1230, 14 70, 1523, 1783, 993, 1211, 1276, 1489, 1304, 1533, 1581, 1854, 1351, 1596, 1632, 1909, 1682, 1962, 2032, 2349, 325, 419, 467, 701, 532, 727, 753, 997, 579, 768, 815, 1035, 856, 1079, 1103, 1377, 622, 820, 870, 1093, 908, 1131, 1175, 1430, 949, 1185, 1214, 1457, 1280, 1515, 1573, 18 39, 668, 878, 933, 1148, 969, 1188, 1242, 1499, 1031, 1264, 1310, 1546, 1345, 1588, 1625, 190 1, 1100, 1324, 1391, 1613, 1419, 1659, 1701, 1934, 1481, 1717, 1767, 2002, 1807, 2082, 2175, 2374, 679, 945, 1012, 1255, 1071, 1292, 1336, 1606, 1114, 1357, 1402, 1642, 1449, 1692, 173 5, 1986, 1172, 1432, 1467, 1708, 1536, 1758, 1798, 2096, 1563, 1818, 1863, 2118, 1924, 2189, 2233, 2548, 1239, 1504, 1553, 1776, 1615, 1829, 1871, 2136, 1668, 1888, 1948, 2210, 2016, 2 248, 2296, 2599, 1726, 1978, 2046, 2270, 2066, 2324, 2405, 2711, 2154, 2437, 2469, 2653, 25 11, 2795, 2892, 3047, 199, 401, 519, 777, 591, 806, 891, 1121, 645, 865, 937, 1168, 1001, 1236, 1261, 1558, 695, 917, 965, 1223, 1057, 1283, 1365, 1586, 1086, 1354, 1322, 1644, 1435, 1694, 1738, 2038, 732, 1024, 1075, 1307, 1107, 1339, 1382, 1664, 1181, 1416, 1454, 1703, 1512, 17 72, 1803, 2102, 1249, 1465, 1543, 1789, 1576, 1835, 1876, 2148, 1640, 1890, 1938, 2204, 197 2, 2265, 2318, 2621, 834, 1038, 1152, 1408, 1195, 1446, 1502, 1751, 1273, 1548, 1478, 1811, 1 603, 1857, 1915, 2170, 1333, 1528, 1630, 1882, 1671, 1930, 1966, 2237, 1722, 1980, 2054, 22 85, 2094, 2354, 2400, 2719, 1394, 1654, 1713, 1958, 1780, 2004, 2070, 2338, 1820, 2076, 214 2, 2368, 2181, 2430, 2483, 2757, 1897, 2158, 2222, 2450, 2254, 2491, 2540, 2824, 2307, 2563, 2607, 2871, 2645, 2924, 2982, 3247, 981, 1135, 1207, 1520, 1298, 1566, 1593, 1905, 1371, 16 20, 1678, 1954, 1729, 1996, 2026, 2331, 1424, 1685, 1749, 2010, 1796, 2060, 2112, 2386, 184 8, 2124, 2164, 2419, 2227, 2478, 2531, 2813, 1483, 1760, 1826, 2088, 1867, 2130, 2193, 2459, 1942, 2216, 2259, 2503, 2302, 2553, 2590, 2863, 2022, 2280, 2343, 2576, 2381, 2631, 2670, 2 903, 2444, 2687, 2739, 2958, 2774, 3021, 3105, 3268, 1494, 1844, 1917, 2199, 1992, 2242, 22 91, 2568, 2040, 2313, 2361, 2613, 2411, 2661, 2702, 2946, 2108, 2391, 2425, 2678, 2498, 273 1, 2766, 3032, 2525, 2783, 2833, 3059, 2880, 3117, 3152, 3402, 2187, 2464, 2516, 2748, 2584, 2804, 2842, 3074, 2639, 2854, 2915, 3137, 2970, 3169, 3207, 3437, 2695, 2935, 2993, 3188, 3 008, 3224, 3292, 3520, 3091, 3317, 3343, 3474, 3371, 3574, 3642, 3744, 214, 459, 585, 883, 67 4, 953, 1042, 1301, 737, 1016, 1096, 1348, 1162, 1413, 1438, 1756, 797, 1068, 1117, 1399, 122 0, 1473, 1551, 1787, 1252, 1538, 1507, 1837, 1628, 1884, 1926, 2235, 843, 1178, 1233, 1497, 1 267, 1530, 1578, 1850, 1359, 1608, 1647, 1892, 1706, 1956, 1988, 2294, 1427, 1666, 1740, 19 74, 1778, 2024, 2062, 2342, 1831, 2080, 2128, 2402, 2168, 2466, 2523, 2810, 985, 1198, 1330, 1601, 1374, 1635, 1696, 1946, 1451, 1747, 1675, 2000, 1800, 2044, 2104, 2367, 1517, 1733, 1 816, 2068, 1865, 2116, 2156, 2438, 1913, 2174, 2252, 2481, 2289, 2556, 2602, 2895, 1591, 18 46, 1907, 2150, 1970, 2201, 2268, 2536, 2008, 2274, 2336, 2571, 2372, 2632, 2684, 2929, 208 4, 2352, 2423, 2650, 2452, 2694, 2742, 2987, 2506, 2760, 2792, 3036, 2839, 3078, 3131, 3360, 1138, 1316, 1388, 1724, 1486, 1765, 1792, 2090, 1561, 1809, 1874, 2138, 1922, 2195, 2223, 2 535, 1618, 1880, 1940, 2212, 1982, 2257, 2311, 2587, 2036, 2322, 2358, 2619, 2428, 2675, 27 34, 2976, 1680, 1950, 2014, 2276, 2056, 2327, 2388, 2659, 2132, 2414, 2461, 2708, 2500, 275 1, 2786, 3026, 2218, 2474, 2545, 2772, 2579, 2818, 2857, 3054, 2642, 2870, 2912, 3108, 2949, 3165, 3235, 3379, 1689, 2030, 2110, 2397, 2179, 2442, 2490, 2769, 2240, 2515, 2559, 2801, 2 610, 2848, 2886, 3096, 2305, 2594, 2627, 2866, 2698, 2906, 2941, 3179, 2725, 2955, 2997, 31 94, 3044, 3245, 3278, 3494, 2383, 2667, 2715, 2921, 2777, 2968, 3003, 3205, 2827, 3014, 306 6, 3262, 3121, 3288, 3324, 3528, 2877, 3086, 3143, 3306, 3156, 3346, 3398, 3597, 3218, 3422, 3445, 3560, 3469, 3647, 3703, 3790, 921, 1286, 1462, 1822, 1571, 1859, 1964, 2246, 1656, 19 32, 2018, 2300, 2098, 2377, 2409, 2722, 1715, 1994, 2052, 2363, 2162, 2433, 2520, 2745, 220 6, 2508, 2473, 2807, 2595, 2851, 2889, 3133, 1769, 2122, 2185, 2456, 2229, 2495, 2543, 2821, 2316, 2573, 2616, 2860, 2673, 2918, 2943, 3181, 2395, 2624, 2705, 2932, 2737, 2973, 3005, 3 214, 2798, 3018, 3056, 3258, 3084, 3304, 3339, 3541, 1899, 2144, 2283, 2564, 2333, 2605, 26 64, 2901, 2416, 2714, 2635, 2952, 2763, 2990, 3039, 3231, 2486, 2691, 2789, 3011, 2830, 305 1, 3081, 3282, 2874, 3093, 3147, 3314, 3175, 3364, 3395, 3602, 2551, 2815, 2869, 3071, 2926, 3112, 3159, 3354, 2962, 3163, 3211, 3375, 3237, 3418, 3453, 3622, 3023, 3222, 3272, 3429, 3 296, 3457, 3490, 3663, 3331, 3502, 3533, 3690, 3555, 3719, 3757, 3887, 2074, 2263, 2347, 26 81, 2447, 2728, 2754, 3029, 2528, 2780, 2836, 3069, 2883, 3103, 3127, 3350, 2582, 2845, 289 8, 3115, 2938, 3149, 3192, 3387, 2984, 3198, 3228, 3409, 3276, 3448, 3486, 3658, 2647, 2909, 2965, 3172, 3000, 3201, 3251, 3432, 3062, 3265, 3300, 3465, 3327, 3499, 3524, 3686, 3124, 3 310, 3356, 3511, 3383, 3546, 3570, 3708, 3425, 3583, 3612, 3737, 3632, 3776, 3819, 3897, 26 56, 2979, 3041, 3255, 3100, 3286, 3321, 3507, 3140, 3335, 3367, 3538, 3406, 3565, 3593, 373 2, 3185, 3391, 3413, 3579, 3462, 3607, 3626, 3784, 3482, 3637, 3669, 3797, 3696, 3828, 3843, 3951, 3241, 3441, 3477, 3617, 3515, 3653, 3674, 3805, 3551, 3680, 3714, 3835, 3751, 3851, 3 869, 3964, 3588, 3726, 3763, 3860, 3769, 3877, 3906, 3994, 3812, 3917, 3927, 3978, 3939, 40 10, 4031, 4056, 229, 504, 662, 1008, 763, 1124, 1217, 1491, 838, 1191, 1270, 1541, 1342, 1623, 1649, 1984, 904, 1246, 1295, 1611, 1405, 1687, 1763, 2020, 1441, 1754, 1719, 2072, 1852, 21 26, 2172, 2476, 961, 1362, 1421, 1710, 1459, 1742, 1805, 2092, 1556, 1833, 1869, 2134, 1936, 2208, 2239, 2533, 1637, 1886, 1968, 2225, 2012, 2278, 2314, 2577, 2064, 2334, 2379, 2634, 2 418, 2689, 2743, 3010, 1158, 1385, 1525, 1824, 1568, 1861, 1928, 2191, 1661, 1976, 1895, 22 55, 2034, 2298, 2356, 2600, 1731, 1960, 2050, 2320, 2106, 2370, 2407, 2666, 2160, 2421, 249 3, 2703, 2526, 2770, 2814, 3089, 1813, 2078, 2152, 2404, 2220, 2445, 2510, 2755, 2261, 2513, 2574, 2784, 2603, 2841, 2893, 3123, 2340, 2586, 2651, 2858, 2680, 2902, 2948, 3180, 2726, 2 961, 2994, 3223, 3037, 3263, 3315, 3514, 1319, 1510, 1598, 1952, 1699, 1990, 2028, 2345, 17 74, 2042, 2114, 2390, 2166, 2440, 2468, 2752, 1842, 2120, 2183, 2454, 2231, 2496, 2546, 280 2, 2287, 2558, 2589, 2829, 2655, 2885, 2939, 3168, 1903, 2197, 2267, 2518, 2309, 2561, 2618, 2867, 2384, 2640, 2686, 2913, 2720, 2953, 2986, 3216, 2462, 2700, 2764, 2975, 2793, 3017, 3 052, 3242, 2850, 3067, 3109, 3293, 3141, 3348, 3408, 3530, 1920, 2281, 2359, 2629, 2431, 26 69, 2712, 2969, 2479, 2732, 2778, 3001, 2820, 3046, 3082, 3281, 2541, 2805, 2838, 3061, 290 5, 3101, 3135, 3357, 2931, 3151, 3186, 3372, 3233, 3417, 3443, 3625, 2615, 2876, 2922, 3116, 2977, 3160, 3193, 3382, 3025, 3206, 3253, 3430, 3302, 3454, 3483, 3651, 3076, 3274, 3325, 3 468, 3336, 3500, 3547, 3707, 3393, 3564, 3582, 3679, 3606, 3747, 3793, 3859, 1050, 1475, 16 73, 2058, 1794, 2100, 2214, 2488, 1878, 2177, 2272, 2538, 2351, 2611, 2637, 2925, 1944, 224 4, 2303, 2597, 2412, 2658, 2740, 2951, 2449, 2729, 2697, 3004, 2808, 3048, 3085, 3319, 1998, 2375, 2435, 2683, 2471, 2717, 2758, 3019, 2555, 2790, 2826, 3055, 2882, 3113, 3139, 3361, 2 623, 2835, 2911, 3128, 2942, 3164, 3197, 3390, 2998, 3209, 3244, 3426, 3271, 3464, 3496, 36 64, 2140, 2393, 2521, 2781, 2566, 2817, 2873, 3097, 2648, 2916, 2847, 3145, 2966, 3182, 322 7, 3404, 2709, 2896, 2991, 3202, 3028, 3238, 3267, 3447, 3070, 3277, 3329, 3476, 3355, 3518, 3544, 3711, 2767, 3012, 3063, 3260, 3120, 3295, 3340, 3508, 3153, 3344, 3386, 3526, 3412, 3 561, 3590, 3729, 3213, 3397, 3436, 3572, 3458, 3595, 3621, 3761, 3489, 3633, 3656, 3783, 36 75, 3807, 3832, 3935, 2325, 2501, 2581, 2890, 2672, 2934, 2959, 3219, 2746, 2983, 3033, 325 6, 3077, 3290, 3311, 3503, 2796, 3040, 3095, 3299, 3132, 3333, 3369, 3535, 3176, 3376, 3401, 3554, 3440, 3587, 3616, 3755, 2852, 3104, 3157, 3351, 3190, 3380, 3419, 3577, 3249, 3434, 3 460, 3601, 3487, 3629, 3648, 3778, 3307, 3472, 3512, 3640, 3532, 3667, 3688, 3798, 3568, 36 97, 3722, 3822, 3738, 3848, 3883, 3942, 2861, 3171, 3229, 3423, 3285, 3451, 3480, 3635, 332 0, 3493, 3521, 3659, 3550, 3683, 3704, 3817, 3365, 3539, 3558, 3692, 3599, 3717, 3734, 3854, 3614, 3742, 3765, 3864, 3787, 3888, 3901, 3984, 3415, 3580, 3609, 3725, 3645, 3752, 3768, 3 871, 3672, 3774, 3802, 3894, 3826, 3907, 3921, 3995, 3700, 3811, 3837, 3914, 3844, 3926, 39 50, 4017, 3876, 3958, 3966, 4004, 3975, 4029, 4044, 4064, 1089, 1583, 1785, 2202, 1911, 229 3, 2398, 2677, 2006, 2365, 2457, 2723, 2530, 2787, 2811, 3099, 2086, 2426, 2485, 2775, 2592, 2844, 2919, 3125, 2626, 2908, 2879, 3167, 2989, 3203, 3236, 3446, 2146, 2550, 2608, 2864, 2 643, 2899, 2945, 3177, 2735, 2972, 3007, 3210, 3058, 3259, 3283, 3481, 2799, 3022, 3088, 32 73, 3119, 3309, 3334, 3509, 3161, 3345, 3377, 3545, 3403, 3581, 3611, 3754, 2329, 2569, 270 6, 2963, 2749, 2996, 3050, 3250, 2823, 3092, 3030, 3291, 3136, 3322, 3362, 3525, 2887, 3080, 3148, 3338, 3189, 3370, 3396, 3566, 3226, 3407, 3455, 3589, 3478, 3630, 3654, 3794, 2956, 3 173, 3220, 3392, 3269, 3424, 3466, 3619, 3297, 3470, 3506, 3638, 3527, 3670, 3695, 3809, 33 49, 3517, 3557, 3678, 3573, 3699, 3723, 3834, 3603, 3731, 3746, 3855, 3767, 3872, 3892, 397 2, 2505, 2692, 2761, 3073, 2855, 3107, 3129, 3353, 2928, 3144, 3196, 3385, 3232, 3420, 3439, 3618, 2980, 3199, 3246, 3431, 3279, 3459, 3492, 3646, 3316, 3498, 3519, 3662, 3559, 3691, 3 718, 3830, 3035, 3254, 3301, 3471, 3330, 3501, 3537, 3682, 3381, 3552, 3578, 3706, 3600, 37 27, 3743, 3850, 3435, 3586, 3624, 3736, 3641, 3758, 3775, 3862, 3673, 3782, 3801, 3884, 381 8, 3905, 3931, 3977, 3043, 3312, 3366, 3543, 3411, 3567, 3594, 3735, 3449, 3608, 3631, 3749, 3657, 3772, 3789, 3879, 3488, 3649, 3666, 3779, 3701, 3799, 3814, 3910, 3715, 3821, 3838, 3 916, 3858, 3934, 3945, 4009, 3534, 3687, 3710, 3806, 3739, 3825, 3841, 3920, 3762, 3846, 38 67, 3940, 3889, 3949, 3960, 4019, 3786, 3875, 3898, 3955, 3902, 3967, 3983, 4035, 3924, 398 9, 3997, 4026, 4003, 4045, 4057, 4071, 2250, 2662, 2832, 3155, 2936, 3184, 3264, 3452, 3015, 3240, 3305, 3484, 3359, 3531, 3548, 3713, 3065, 3287, 3326, 3522, 3399, 3562, 3610, 3724, 3 428, 3604, 3585, 3753, 3650, 3773, 3791, 3893, 3111, 3374, 3414, 3575, 3442, 3596, 3623, 37 59, 3495, 3639, 3661, 3777, 3689, 3804, 3816, 3911, 3540, 3665, 3705, 3810, 3720, 3829, 384 2, 3923, 3748, 3847, 3863, 3938, 3874, 3954, 3965, 4022, 3215, 3388, 3475, 3634, 3505, 3655, 3684, 3796, 3553, 3709, 3671, 3820, 3733, 3836, 3856, 3930, 3592, 3698, 3745, 3845, 3764, 3 861, 3873, 3946, 3785, 3878, 3899, 3957, 3909, 3973, 3982, 4036, 3627, 3756, 3780, 3870, 38 08, 3885, 3903, 3970, 3823, 3904, 3922, 3976, 3932, 3988, 3999, 4040, 3849, 3925, 3943, 399 2, 3952, 4000, 4008, 4048, 3962, 4012, 4020, 4054, 4025, 4060, 4066, 4083, 3341, 3463, 3513, 3693, 3571, 3716, 3728, 3852, 3615, 3741, 3766, 3868, 3788, 3882, 3891, 3969, 3643, 3771, 3 795, 3886, 3813, 3900, 3915, 3980, 3833, 3918, 3928, 3986, 3944, 3998, 4007, 4047, 3677, 38 00, 3824, 3908, 3839, 3919, 3936, 3993, 3865, 3941, 3953, 4002, 3961, 4011, 4018, 4053, 389 0, 3956, 3971, 4014, 3979, 4023, 4028, 4058, 3991, 4032, 4038, 4063, 4042, 4069, 4075, 4084, 3681, 3831, 3857, 3937, 3880, 3948, 3959, 4013, 3895, 3963, 3974, 4021, 3985, 4027, 4034, 4 062, 3913, 3981, 3987, 4030, 4001, 4037, 4041, 4070, 4006, 4043, 4050, 4072, 4055, 4076, 40 78, 4089, 3933, 3996, 4005, 4039, 4015, 4046, 4051, 4073, 4024, 4052, 4059, 4077, 4065, 407 9, 4081, 4090, 4033, 4061, 4067, 4080, 4068, 4082, 4085, 4092, 4074, 4086, 4087, 4091, 4088, 4093, 4094, 4095]

TABLE Z18 with a sequence length of 4096:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 12 |
| 6 | 15 |
| 7 | 28 |
| 8 | 4 |
| 9 | 14 |
| 10 | 17 |
| 11 | 31 |
| 12 | 20 |
| 13 | 37 |
| 14 | 39 |
| 15 | 77 |
| 16 | 5 |
| 17 | 16 |
| 18 | 18 |
| 19 | 36 |
| 20 | 23 |
| 21 | 43 |
| 22 | 51 |
| 23 | 83 |
| 24 | 25 |
| 25 | 50 |
| 26 | 47 |
| 27 | 91 |
| 28 | 60 |
| 29 | 99 |
| 30 | 108 |
| 31 | 175 |
| 32 | 6 |
| 33 | 21 |
| 34 | 24 |
| 35 | 45 |
| 36 | 26 |
| 37 | 49 |
| 38 | 55 |
| 39 | 94 |

TABLE Z18-continued with a sequence length of 4096:

| Polarized channel sequence number | Reliability or reliability sequence number |
|---|---|
| 40 | 32 |
| 41 | 58 |
| 42 | 62 |
| 43 | 100 |
| 44 | 71 |
| 45 | 114 |
| 46 | 120 |
| 47 | 192 |
| 48 | 38 |
| 49 | 64 |
| 50 | 75 |
| 51 | 117 |
| 52 | 82 |
| 53 | 127 |
| 54 | 136 |
| 55 | 205 |
| 56 | 90 |
| 57 | 140 |
| 58 | 151 |
| 59 | 223 |
| 60 | 160 |
| 61 | 243 |
| 62 | 263 |
| 63 | 383 |
| 64 | 13 |
| 65 | 22 |
| 66 | 30 |
| 67 | 57 |
| 68 | 33 |
| 69 | 61 |
| 70 | 70 |
| 71 | 111 |
| 72 | 41 |
| 73 | 76 |
| 74 | 65 |
| 75 | 123 |
| 76 | 85 |
| 77 | 132 |
| 78 | 144 |
| 79 | 212 |
| 80 | 48 |
| 81 | 74 |
| 82 | 88 |
| 83 | 137 |
| 84 | 96 |
| 85 | 149 |
| 86 | 158 |
| 87 | 234 |
| 88 | 106 |
| 89 | 161 |
| 90 | 180 |
| 91 | 248 |
| 92 | 189 |
| 93 | 274 |
| 94 | 293 |
| 95 | 429 |
| 96 | 56 |
| 97 | 92 |
| 98 | 104 |
| 99 | 156 |
| 100 | 116 |
| 101 | 167 |
| 102 | 185 |
| 103 | 267 |
| 104 | 124 |
| 105 | 186 |
| 106 | 204 |
| 107 | 279 |
| 108 | 213 |
| 109 | 304 |
| 110 | 326 |
| 111 | 448 |
| 112 | 141 |
| 113 | 207 |
| 114 | 230 |

TABLE Z18-continued

| with a sequence length of 4096: | |
|---|---|
| Polarized channel sequence number | Reliability or reliability sequence number |
| 115 | 311 |
| 116 | 239 |
| 117 | 330 |
| 118 | 351 |
| 119 | 486 |
| 120 | 257 |
| 121 | 358 |
| 122 | 375 |
| 123 | 516 |
| 124 | 398 |
| 125 | 547 |
| 126 | 588 |
| 127 | 789 |
| 128 | 19 |
| 129 | 29 |
| 130 | 35 |
| 131 | 73 |
| 132 | 44 |
| 133 | 78 |
| 134 | 84 |
| 135 | 142 |
| 136 | 52 |
| 137 | 87 |
| 138 | 97 |
| 139 | 153 |
| 140 | 107 |
| 141 | 165 |
| 142 | 173 |
| 143 | 266 |
| 144 | 59 |
| 145 | 98 |
| 146 | 110 |
| 147 | 170 |
| 148 | 119 |
| 149 | 181 |
| 150 | 195 |
| 151 | 287 |
| 152 | 130 |
| 153 | 198 |
| 154 | 208 |
| 155 | 298 |
| 156 | 231 |
| 157 | 322 |
| 158 | 348 |
| 159 | 478 |
| 160 | 67 |
| 161 | 112 |
| 162 | 125 |
| 163 | 187 |
| 164 | 135 |
| 165 | 200 |
| 166 | 218 |
| 167 | 316 |
| 168 | 152 |
| 169 | 225 |
| 170 | 241 |
| 171 | 336 |
| 172 | 254 |
| 173 | 354 |
| 174 | 371 |
| 175 | 511 |
| 176 | 172 |
| 177 | 247 |
| 178 | 272 |
| 179 | 366 |
| 180 | 283 |
| 181 | 387 |
| 182 | 407 |
| 183 | 530 |
| 184 | 308 |
| 185 | 415 |
| 186 | 440 |
| 187 | 570 |
| 188 | 461 |
| 189 | 617 |

TABLE Z18-continued

| with a sequence length of 4096: | |
|---|---|
| Polarized channel sequence number | Reliability or reliability sequence number |
| 190 | 673 |
| 191 | 807 |
| 192 | 69 |
| 193 | 129 |
| 194 | 146 |
| 195 | 222 |
| 196 | 163 |
| 197 | 235 |
| 198 | 251 |
| 199 | 362 |
| 200 | 176 |
| 201 | 259 |
| 202 | 276 |
| 203 | 379 |
| 204 | 295 |
| 205 | 403 |
| 206 | 424 |
| 207 | 561 |
| 208 | 194 |
| 209 | 288 |
| 210 | 302 |
| 211 | 411 |
| 212 | 331 |
| 213 | 436 |
| 214 | 456 |
| 215 | 625 |
| 216 | 343 |
| 217 | 466 |
| 218 | 491 |
| 219 | 638 |
| 220 | 524 |
| 221 | 682 |
| 222 | 710 |
| 223 | 939 |
| 224 | 217 |
| 225 | 318 |
| 226 | 339 |
| 227 | 445 |
| 228 | 367 |
| 229 | 472 |
| 230 | 495 |
| 231 | 649 |
| 232 | 391 |
| 233 | 505 |
| 234 | 538 |
| 235 | 696 |
| 236 | 578 |
| 237 | 720 |
| 238 | 752 |
| 239 | 980 |
| 240 | 420 |
| 241 | 556 |
| 242 | 596 |
| 243 | 735 |
| 244 | 607 |
| 245 | 771 |
| 246 | 830 |
| 247 | 1077 |
| 248 | 660 |
| 249 | 853 |
| 250 | 877 |
| 251 | 1026 |
| 252 | 910 |
| 253 | 1154 |
| 254 | 1250 |
| 255 | 1417 |
| 256 | 8 |
| 257 | 27 |
| 258 | 42 |
| 259 | 89 |
| 260 | 54 |
| 261 | 95 |
| 262 | 115 |
| 263 | 178 |
| 264 | 63 |

TABLE Z18-continued with a sequence length of 4096:

| Polarized channel sequence number | Reliability or reliability sequence number |
|---|---|
| 265 | 109 |
| 266 | 126 |
| 267 | 193 |
| 268 | 143 |
| 269 | 216 |
| 270 | 224 |
| 271 | 341 |
| 272 | 72 |
| 273 | 121 |
| 274 | 134 |
| 275 | 211 |
| 276 | 159 |
| 277 | 232 |
| 278 | 262 |
| 279 | 353 |
| 280 | 168 |
| 281 | 258 |
| 282 | 246 |
| 283 | 380 |
| 284 | 289 |
| 285 | 404 |
| 286 | 425 |
| 287 | 592 |
| 288 | 80 |
| 289 | 150 |
| 290 | 164 |
| 291 | 240 |
| 292 | 174 |
| 293 | 252 |
| 294 | 269 |
| 295 | 389 |
| 296 | 197 |
| 297 | 282 |
| 298 | 297 |
| 299 | 408 |
| 300 | 321 |
| 301 | 442 |
| 302 | 458 |
| 303 | 629 |
| 304 | 220 |
| 305 | 301 |
| 306 | 334 |
| 307 | 452 |
| 308 | 349 |
| 309 | 476 |
| 310 | 498 |
| 311 | 656 |
| 312 | 378 |
| 313 | 506 |
| 314 | 533 |
| 315 | 692 |
| 316 | 552 |
| 317 | 731 |
| 318 | 767 |
| 319 | 999 |
| 320 | 101 |
| 321 | 154 |
| 322 | 188 |
| 323 | 278 |
| 324 | 202 |
| 325 | 294 |
| 326 | 317 |
| 327 | 432 |
| 328 | 228 |
| 329 | 337 |
| 330 | 307 |
| 331 | 463 |
| 332 | 361 |
| 333 | 487 |
| 334 | 520 |
| 335 | 670 |
| 336 | 250 |
| 337 | 328 |
| 338 | 373 |
| 339 | 501 |

TABLE Z18-continued with a sequence length of 4096:

| Polarized channel sequence number | Reliability or reliability sequence number |
|---|---|
| 340 | 392 |
| 341 | 528 |
| 342 | 549 |
| 343 | 713 |
| 344 | 417 |
| 345 | 557 |
| 346 | 600 |
| 347 | 745 |
| 348 | 624 |
| 349 | 793 |
| 350 | 826 |
| 351 | 1084 |
| 352 | 273 |
| 353 | 385 |
| 354 | 413 |
| 355 | 544 |
| 356 | 447 |
| 357 | 571 |
| 358 | 609 |
| 359 | 781 |
| 360 | 468 |
| 361 | 613 |
| 362 | 653 |
| 363 | 803 |
| 364 | 677 |
| 365 | 848 |
| 366 | 888 |
| 367 | 1119 |
| 368 | 509 |
| 369 | 663 |
| 370 | 703 |
| 371 | 863 |
| 372 | 724 |
| 373 | 894 |
| 374 | 932 |
| 375 | 1183 |
| 376 | 760 |
| 377 | 951 |
| 378 | 987 |
| 379 | 1229 |
| 380 | 1019 |
| 381 | 1282 |
| 382 | 1344 |
| 383 | 1665 |
| 384 | 138 |
| 385 | 182 |
| 386 | 206 |
| 387 | 324 |
| 388 | 237 |
| 389 | 344 |
| 390 | 357 |
| 391 | 514 |
| 392 | 264 |
| 393 | 369 |
| 394 | 396 |
| 395 | 542 |
| 396 | 421 |
| 397 | 567 |
| 398 | 584 |
| 399 | 776 |
| 400 | 285 |
| 401 | 399 |
| 402 | 431 |
| 403 | 575 |
| 404 | 455 |
| 405 | 603 |
| 406 | 635 |
| 407 | 816 |
| 408 | 483 |
| 409 | 642 |
| 410 | 666 |
| 411 | 840 |
| 412 | 707 |
| 413 | 884 |
| 414 | 926 |

TABLE Z18-continued

| with a sequence length of 4096: | |
|---|---|
| Polarized channel sequence number | Reliability or reliability sequence number |
| 415 | 1171 |
| 416 | 309 |
| 417 | 437 |
| 418 | 471 |
| 419 | 620 |
| 420 | 493 |
| 421 | 646 |
| 422 | 684 |
| 423 | 869 |
| 424 | 535 |
| 425 | 699 |
| 426 | 728 |
| 427 | 903 |
| 428 | 756 |
| 429 | 943 |
| 430 | 974 |
| 431 | 1221 |
| 432 | 582 |
| 433 | 741 |
| 434 | 785 |
| 435 | 962 |
| 436 | 812 |
| 437 | 1007 |
| 438 | 1041 |
| 439 | 1262 |
| 440 | 858 |
| 441 | 1056 |
| 442 | 1102 |
| 443 | 1318 |
| 444 | 1134 |
| 445 | 1387 |
| 446 | 1485 |
| 447 | 1693 |
| 448 | 313 |
| 449 | 480 |
| 450 | 521 |
| 451 | 688 |
| 452 | 564 |
| 453 | 716 |
| 454 | 749 |
| 455 | 955 |
| 456 | 593 |
| 457 | 764 |
| 458 | 798 |
| 459 | 992 |
| 460 | 833 |
| 461 | 1033 |
| 462 | 1069 |
| 463 | 1306 |
| 464 | 632 |
| 465 | 819 |
| 466 | 844 |
| 467 | 1048 |
| 468 | 899 |
| 469 | 1095 |
| 470 | 1127 |
| 471 | 1400 |
| 472 | 920 |
| 473 | 1143 |
| 474 | 1192 |
| 475 | 1431 |
| 476 | 1238 |
| 477 | 1500 |
| 478 | 1542 |
| 479 | 1889 |
| 480 | 681 |
| 481 | 873 |
| 482 | 914 |
| 483 | 1111 |
| 484 | 968 |
| 485 | 1163 |
| 486 | 1200 |
| 487 | 1448 |
| 488 | 1014 |
| 489 | 1212 |

TABLE Z18-continued

| with a sequence length of 4096: | |
|---|---|
| Polarized channel sequence number | Reliability or reliability sequence number |
| 490 | 1274 |
| 491 | 1524 |
| 492 | 1332 |
| 493 | 1564 |
| 494 | 1612 |
| 495 | 1945 |
| 496 | 1063 |
| 497 | 1294 |
| 498 | 1356 |
| 499 | 1587 |
| 500 | 1373 |
| 501 | 1634 |
| 502 | 1727 |
| 503 | 2081 |
| 504 | 1468 |
| 505 | 1762 |
| 506 | 1799 |
| 507 | 2005 |
| 508 | 1841 |
| 509 | 2173 |
| 510 | 2299 |
| 511 | 2509 |
| 512 | 9 |
| 513 | 34 |
| 514 | 53 |
| 515 | 113 |
| 516 | 68 |
| 517 | 131 |
| 518 | 155 |
| 519 | 238 |
| 520 | 81 |
| 521 | 147 |
| 522 | 171 |
| 523 | 255 |
| 524 | 191 |
| 525 | 281 |
| 526 | 290 |
| 527 | 434 |
| 528 | 93 |
| 529 | 162 |
| 530 | 177 |
| 531 | 275 |
| 532 | 210 |
| 533 | 305 |
| 534 | 338 |
| 535 | 450 |
| 536 | 221 |
| 537 | 332 |
| 538 | 319 |
| 539 | 477 |
| 540 | 372 |
| 541 | 502 |
| 542 | 525 |
| 543 | 712 |
| 544 | 103 |
| 545 | 196 |
| 546 | 215 |
| 547 | 315 |
| 548 | 226 |
| 549 | 329 |
| 550 | 350 |
| 551 | 484 |
| 552 | 260 |
| 553 | 363 |
| 554 | 381 |
| 555 | 507 |
| 556 | 409 |
| 557 | 543 |
| 558 | 562 |
| 559 | 751 |
| 560 | 286 |
| 561 | 390 |
| 562 | 426 |
| 563 | 554 |
| 564 | 446 |

TABLE Z18-continued with a sequence length of 4096:

| Polarized channel sequence number | Reliability or reliability sequence number |
|---|---|
| 565 | 583 |
| 566 | 605 |
| 567 | 784 |
| 568 | 473 |
| 569 | 615 |
| 570 | 644 |
| 571 | 827 |
| 572 | 669 |
| 573 | 875 |
| 574 | 919 |
| 575 | 1169 |
| 576 | 139 |
| 577 | 203 |
| 578 | 249 |
| 579 | 360 |
| 580 | 265 |
| 581 | 376 |
| 582 | 405 |
| 583 | 537 |
| 584 | 296 |
| 585 | 430 |
| 586 | 395 |
| 587 | 569 |
| 588 | 457 |
| 589 | 595 |
| 590 | 630 |
| 591 | 802 |
| 592 | 323 |
| 593 | 423 |
| 594 | 465 |
| 595 | 608 |
| 596 | 492 |
| 597 | 637 |
| 598 | 661 |
| 599 | 854 |
| 600 | 518 |
| 601 | 672 |
| 602 | 723 |
| 603 | 886 |
| 604 | 747 |
| 605 | 946 |
| 606 | 983 |
| 607 | 1253 |
| 608 | 356 |
| 609 | 481 |
| 610 | 515 |
| 611 | 658 |
| 612 | 551 |
| 613 | 689 |
| 614 | 734 |
| 615 | 930 |
| 616 | 574 |
| 617 | 738 |
| 618 | 780 |
| 619 | 958 |
| 620 | 805 |
| 621 | 1009 |
| 622 | 1054 |
| 623 | 1288 |
| 624 | 618 |
| 625 | 791 |
| 626 | 842 |
| 627 | 1023 |
| 628 | 864 |
| 629 | 1062 |
| 630 | 1105 |
| 631 | 1350 |
| 632 | 906 |
| 633 | 1122 |
| 634 | 1151 |
| 635 | 1404 |
| 636 | 1197 |
| 637 | 1453 |
| 638 | 1516 |
| 639 | 1825 |

TABLE Z18-continued with a sequence length of 4096:

| Polarized channel sequence number | Reliability or reliability sequence number |
|---|---|
| 640 | 184 |
| 641 | 244 |
| 642 | 271 |
| 643 | 418 |
| 644 | 310 |
| 645 | 439 |
| 646 | 453 |
| 647 | 621 |
| 648 | 342 |
| 649 | 462 |
| 650 | 496 |
| 651 | 650 |
| 652 | 523 |
| 653 | 686 |
| 654 | 704 |
| 655 | 928 |
| 656 | 368 |
| 657 | 500 |
| 658 | 534 |
| 659 | 697 |
| 660 | 558 |
| 661 | 726 |
| 662 | 762 |
| 663 | 971 |
| 664 | 590 |
| 665 | 770 |
| 666 | 795 |
| 667 | 998 |
| 668 | 846 |
| 669 | 1045 |
| 670 | 1098 |
| 671 | 1338 |
| 672 | 397 |
| 673 | 540 |
| 674 | 577 |
| 675 | 739 |
| 676 | 601 |
| 677 | 774 |
| 678 | 817 |
| 679 | 1032 |
| 680 | 647 |
| 681 | 836 |
| 682 | 871 |
| 683 | 1074 |
| 684 | 901 |
| 685 | 1113 |
| 686 | 1146 |
| 687 | 1393 |
| 688 | 700 |
| 689 | 881 |
| 690 | 936 |
| 691 | 1133 |
| 692 | 964 |
| 693 | 1177 |
| 694 | 1215 |
| 695 | 1425 |
| 696 | 1017 |
| 697 | 1228 |
| 698 | 1271 |
| 699 | 1488 |
| 700 | 1309 |
| 701 | 1559 |
| 702 | 1648 |
| 703 | 1853 |
| 704 | 402 |
| 705 | 587 |
| 706 | 633 |
| 707 | 823 |
| 708 | 676 |
| 709 | 857 |
| 710 | 893 |
| 711 | 1130 |
| 712 | 715 |
| 713 | 913 |
| 714 | 948 |

TABLE Z18-continued with a sequence length of 4096:

| Polarized channel sequence number | Reliability or reliability sequence number |
|---|---|
| 715 | 1160 |
| 716 | 990 |
| 717 | 1206 |
| 718 | 1244 |
| 719 | 1474 |
| 720 | 759 |
| 721 | 976 |
| 722 | 1004 |
| 723 | 1224 |
| 724 | 1066 |
| 725 | 1265 |
| 726 | 1300 |
| 727 | 1575 |
| 728 | 1090 |
| 729 | 1315 |
| 730 | 1361 |
| 731 | 1595 |
| 732 | 1414 |
| 733 | 1662 |
| 734 | 1707 |
| 735 | 2039 |
| 736 | 813 |
| 737 | 1039 |
| 738 | 1081 |
| 739 | 1279 |
| 740 | 1137 |
| 741 | 1329 |
| 742 | 1367 |
| 743 | 1609 |
| 744 | 1186 |
| 745 | 1380 |
| 746 | 1439 |
| 747 | 1684 |
| 748 | 1505 |
| 749 | 1721 |
| 750 | 1771 |
| 751 | 2095 |
| 752 | 1235 |
| 753 | 1463 |
| 754 | 1531 |
| 755 | 1746 |
| 756 | 1547 |
| 757 | 1804 |
| 758 | 1883 |
| 759 | 2215 |
| 760 | 1626 |
| 761 | 1919 |
| 762 | 1957 |
| 763 | 2149 |
| 764 | 1997 |
| 765 | 2308 |
| 766 | 2420 |
| 767 | 2617 |
| 768 | 122 |
| 769 | 233 |
| 770 | 300 |
| 771 | 469 |
| 772 | 347 |
| 773 | 488 |
| 774 | 548 |
| 775 | 719 |
| 776 | 386 |
| 777 | 529 |
| 778 | 580 |
| 779 | 755 |
| 780 | 626 |
| 781 | 809 |
| 782 | 832 |
| 783 | 1087 |
| 784 | 414 |
| 785 | 565 |
| 786 | 599 |
| 787 | 799 |
| 788 | 665 |
| 789 | 850 |
| 790 | 916 |
| 791 | 1108 |
| 792 | 693 |
| 793 | 907 |
| 794 | 880 |
| 795 | 1166 |
| 796 | 978 |
| 797 | 1209 |
| 798 | 1247 |
| 799 | 1519 |
| 800 | 441 |
| 801 | 641 |
| 802 | 680 |
| 803 | 867 |
| 804 | 708 |
| 805 | 897 |
| 806 | 935 |
| 807 | 1180 |
| 808 | 766 |
| 809 | 959 |
| 810 | 995 |
| 811 | 1218 |
| 812 | 1044 |
| 813 | 1277 |
| 814 | 1303 |
| 815 | 1579 |
| 816 | 822 |
| 817 | 1002 |
| 818 | 1072 |
| 819 | 1291 |
| 820 | 1101 |
| 821 | 1335 |
| 822 | 1370 |
| 823 | 1621 |
| 824 | 1157 |
| 825 | 1384 |
| 826 | 1428 |
| 827 | 1679 |
| 828 | 1460 |
| 829 | 1743 |
| 830 | 1793 |
| 831 | 2117 |
| 832 | 510 |
| 833 | 654 |
| 834 | 744 |
| 835 | 952 |
| 836 | 778 |
| 837 | 986 |
| 838 | 1036 |
| 839 | 1259 |
| 840 | 837 |
| 841 | 1080 |
| 842 | 1011 |
| 843 | 1312 |
| 844 | 1125 |
| 845 | 1353 |
| 846 | 1407 |
| 847 | 1643 |
| 848 | 890 |
| 849 | 1059 |
| 850 | 1149 |
| 851 | 1376 |
| 852 | 1189 |
| 853 | 1422 |
| 854 | 1456 |
| 855 | 1712 |
| 856 | 1232 |
| 857 | 1471 |
| 858 | 1535 |
| 859 | 1757 |
| 860 | 1570 |
| 861 | 1830 |
| 862 | 1877 |
| 863 | 2224 |
| 864 | 942 |

TABLE Z18-continued

| with a sequence length of 4096: | |
|---|---|
| Polarized channel sequence number | Reliability or reliability sequence number |
| 865 | 1174 |
| 866 | 1226 |
| 867 | 1445 |
| 868 | 1285 |
| 869 | 1493 |
| 870 | 1550 |
| 871 | 1815 |
| 872 | 1323 |
| 873 | 1555 |
| 874 | 1617 |
| 875 | 1847 |
| 876 | 1651 |
| 877 | 1914 |
| 878 | 1971 |
| 879 | 2260 |
| 880 | 1390 |
| 881 | 1631 |
| 882 | 1698 |
| 883 | 1931 |
| 884 | 1732 |
| 885 | 1977 |
| 886 | 2033 |
| 887 | 2339 |
| 888 | 1782 |
| 889 | 2051 |
| 890 | 2103 |
| 891 | 2394 |
| 892 | 2141 |
| 893 | 2455 |
| 894 | 2539 |
| 895 | 2875 |
| 896 | 612 |
| 897 | 730 |
| 898 | 788 |
| 899 | 1051 |
| 900 | 860 |
| 901 | 1092 |
| 902 | 1116 |
| 903 | 1397 |
| 904 | 923 |
| 905 | 1140 |
| 906 | 1194 |
| 907 | 1442 |
| 908 | 1241 |
| 909 | 1482 |
| 910 | 1511 |
| 911 | 1810 |
| 912 | 967 |
| 913 | 1203 |
| 914 | 1256 |
| 915 | 1496 |
| 916 | 1297 |
| 917 | 1539 |
| 918 | 1592 |
| 919 | 1866 |
| 920 | 1347 |
| 921 | 1600 |
| 922 | 1639 |
| 923 | 1900 |
| 924 | 1704 |
| 925 | 1963 |
| 926 | 2025 |
| 927 | 2330 |
| 928 | 1021 |
| 929 | 1268 |
| 930 | 1326 |
| 931 | 1567 |
| 932 | 1364 |
| 933 | 1604 |
| 934 | 1670 |
| 935 | 1937 |
| 936 | 1434 |
| 937 | 1690 |
| 938 | 1737 |
| 939 | 1991 |

TABLE Z18-continued

| with a sequence length of 4096: | |
|---|---|
| Polarized channel sequence number | Reliability or reliability sequence number |
| 940 | 1777 |
| 941 | 2047 |
| 942 | 2087 |
| 943 | 2385 |
| 944 | 1508 |
| 945 | 1752 |
| 946 | 1819 |
| 947 | 2065 |
| 948 | 1860 |
| 949 | 2125 |
| 950 | 2165 |
| 951 | 2432 |
| 952 | 1925 |
| 953 | 2190 |
| 954 | 2243 |
| 955 | 2494 |
| 956 | 2279 |
| 957 | 2583 |
| 958 | 2688 |
| 959 | 2904 |
| 960 | 1029 |
| 961 | 1341 |
| 962 | 1411 |
| 963 | 1676 |
| 964 | 1479 |
| 965 | 1718 |
| 966 | 1768 |
| 967 | 2059 |
| 968 | 1527 |
| 969 | 1788 |
| 970 | 1836 |
| 971 | 2111 |
| 972 | 1894 |
| 973 | 2157 |
| 974 | 2207 |
| 975 | 2482 |
| 976 | 1584 |
| 977 | 1872 |
| 978 | 1906 |
| 979 | 2182 |
| 980 | 1985 |
| 981 | 2232 |
| 982 | 2269 |
| 983 | 2601 |
| 984 | 2019 |
| 985 | 2288 |
| 986 | 2350 |
| 987 | 2633 |
| 988 | 2406 |
| 989 | 2710 |
| 990 | 2750 |
| 991 | 3083 |
| 992 | 1657 |
| 993 | 1951 |
| 994 | 2011 |
| 995 | 2251 |
| 996 | 2073 |
| 997 | 2319 |
| 998 | 2362 |
| 999 | 2652 |
| 1000 | 2133 |
| 1001 | 2373 |
| 1002 | 2443 |
| 1003 | 2730 |
| 1004 | 2524 |
| 1005 | 2773 |
| 1006 | 2822 |
| 1007 | 3134 |
| 1008 | 2198 |
| 1009 | 2470 |
| 1010 | 2552 |
| 1011 | 2797 |
| 1012 | 2567 |
| 1013 | 2846 |
| 1014 | 2933 |

TABLE Z18-continued

| with a sequence length of 4096: | |
|---|---|
| Polarized channel sequence number | Reliability or reliability sequence number |
| 1015 | 3252 |
| 1016 | 2671 |
| 1017 | 2967 |
| 1018 | 3002 |
| 1019 | 3187 |
| 1020 | 3042 |
| 1021 | 3328 |
| 1022 | 3433 |
| 1023 | 3584 |
| 1024 | 10 |
| 1025 | 40 |
| 1026 | 66 |
| 1027 | 145 |
| 1028 | 86 |
| 1029 | 179 |
| 1030 | 209 |
| 1031 | 312 |
| 1032 | 102 |
| 1033 | 201 |
| 1034 | 227 |
| 1035 | 333 |
| 1036 | 253 |
| 1037 | 370 |
| 1038 | 382 |
| 1039 | 560 |
| 1040 | 118 |
| 1041 | 219 |
| 1042 | 236 |
| 1043 | 364 |
| 1044 | 277 |
| 1045 | 400 |
| 1046 | 438 |
| 1047 | 581 |
| 1048 | 291 |
| 1049 | 433 |
| 1050 | 416 |
| 1051 | 611 |
| 1052 | 485 |
| 1053 | 643 |
| 1054 | 671 |
| 1055 | 882 |
| 1056 | 133 |
| 1057 | 261 |
| 1058 | 284 |
| 1059 | 412 |
| 1060 | 299 |
| 1061 | 428 |
| 1062 | 460 |
| 1063 | 623 |
| 1064 | 340 |
| 1065 | 474 |
| 1066 | 494 |
| 1067 | 648 |
| 1068 | 531 |
| 1069 | 694 |
| 1070 | 714 |
| 1071 | 927 |
| 1072 | 377 |
| 1073 | 503 |
| 1074 | 550 |
| 1075 | 705 |
| 1076 | 576 |
| 1077 | 740 |
| 1078 | 765 |
| 1079 | 963 |
| 1080 | 606 |
| 1081 | 779 |
| 1082 | 810 |
| 1083 | 1010 |
| 1084 | 839 |
| 1085 | 1058 |
| 1086 | 1106 |
| 1087 | 1375 |
| 1088 | 190 |
| 1089 | 270 |

TABLE Z18-continued

| with a sequence length of 4096: | |
|---|---|
| Polarized channel sequence number | Reliability or reliability sequence number |
| 1090 | 327 |
| 1091 | 470 |
| 1092 | 346 |
| 1093 | 489 |
| 1094 | 527 |
| 1095 | 683 |
| 1096 | 388 |
| 1097 | 555 |
| 1098 | 508 |
| 1099 | 725 |
| 1100 | 589 |
| 1101 | 754 |
| 1102 | 794 |
| 1103 | 982 |
| 1104 | 422 |
| 1105 | 545 |
| 1106 | 597 |
| 1107 | 769 |
| 1108 | 631 |
| 1109 | 804 |
| 1110 | 831 |
| 1111 | 1037 |
| 1112 | 664 |
| 1113 | 841 |
| 1114 | 895 |
| 1115 | 1070 |
| 1116 | 922 |
| 1117 | 1132 |
| 1118 | 1173 |
| 1119 | 1466 |
| 1120 | 464 |
| 1121 | 614 |
| 1122 | 659 |
| 1123 | 828 |
| 1124 | 702 |
| 1125 | 859 |
| 1126 | 909 |
| 1127 | 1118 |
| 1128 | 729 |
| 1129 | 911 |
| 1130 | 960 |
| 1131 | 1144 |
| 1132 | 984 |
| 1133 | 1199 |
| 1134 | 1251 |
| 1135 | 1506 |
| 1136 | 783 |
| 1137 | 970 |
| 1138 | 1025 |
| 1139 | 1216 |
| 1140 | 1049 |
| 1141 | 1260 |
| 1142 | 1308 |
| 1143 | 1577 |
| 1144 | 1091 |
| 1145 | 1321 |
| 1146 | 1358 |
| 1147 | 1633 |
| 1148 | 1406 |
| 1149 | 1686 |
| 1150 | 1759 |
| 1151 | 2071 |
| 1152 | 245 |
| 1153 | 320 |
| 1154 | 359 |
| 1155 | 541 |
| 1156 | 406 |
| 1157 | 563 |
| 1158 | 586 |
| 1159 | 786 |
| 1160 | 444 |
| 1161 | 594 |
| 1162 | 636 |
| 1163 | 818 |
| 1164 | 667 |

TABLE Z18-continued with a sequence length of 4096:

| Polarized channel sequence number | Reliability or reliability sequence number |
|---|---|
| 1165 | 855 |
| 1166 | 876 |
| 1167 | 1115 |
| 1168 | 479 |
| 1169 | 639 |
| 1170 | 678 |
| 1171 | 866 |
| 1172 | 709 |
| 1173 | 898 |
| 1174 | 938 |
| 1175 | 1161 |
| 1176 | 746 |
| 1177 | 947 |
| 1178 | 972 |
| 1179 | 1187 |
| 1180 | 1028 |
| 1181 | 1243 |
| 1182 | 1299 |
| 1183 | 1562 |
| 1184 | 513 |
| 1185 | 687 |
| 1186 | 733 |
| 1187 | 915 |
| 1188 | 761 |
| 1189 | 950 |
| 1190 | 996 |
| 1191 | 1225 |
| 1192 | 814 |
| 1193 | 1015 |
| 1194 | 1055 |
| 1195 | 1272 |
| 1196 | 1085 |
| 1197 | 1314 |
| 1198 | 1349 |
| 1199 | 1624 |
| 1200 | 872 |
| 1201 | 1067 |
| 1202 | 1126 |
| 1203 | 1337 |
| 1204 | 1153 |
| 1205 | 1383 |
| 1206 | 1423 |
| 1207 | 1658 |
| 1208 | 1208 |
| 1209 | 1440 |
| 1210 | 1490 |
| 1211 | 1728 |
| 1212 | 1529 |
| 1213 | 1806 |
| 1214 | 1898 |
| 1215 | 2097 |
| 1216 | 522 |
| 1217 | 742 |
| 1218 | 796 |
| 1219 | 1006 |
| 1220 | 849 |
| 1221 | 1040 |
| 1222 | 1078 |
| 1223 | 1331 |
| 1224 | 885 |
| 1225 | 1097 |
| 1226 | 1139 |
| 1227 | 1366 |
| 1228 | 1179 |
| 1229 | 1415 |
| 1230 | 1458 |
| 1231 | 1711 |
| 1232 | 934 |
| 1233 | 1164 |
| 1234 | 1196 |
| 1235 | 1433 |
| 1236 | 1263 |
| 1237 | 1480 |
| 1238 | 1521 |
| 1239 | 1821 |

TABLE Z18-continued with a sequence length of 4096:

| Polarized channel sequence number | Reliability or reliability sequence number |
|---|---|
| 1240 | 1290 |
| 1241 | 1540 |
| 1242 | 1585 |
| 1243 | 1843 |
| 1244 | 1646 |
| 1245 | 1912 |
| 1246 | 1955 |
| 1247 | 2266 |
| 1248 | 994 |
| 1249 | 1234 |
| 1250 | 1281 |
| 1251 | 1498 |
| 1252 | 1340 |
| 1253 | 1552 |
| 1254 | 1594 |
| 1255 | 1858 |
| 1256 | 1392 |
| 1257 | 1610 |
| 1258 | 1672 |
| 1259 | 1933 |
| 1260 | 1741 |
| 1261 | 1973 |
| 1262 | 2021 |
| 1263 | 2317 |
| 1264 | 1450 |
| 1265 | 1702 |
| 1266 | 1773 |
| 1267 | 1995 |
| 1268 | 1790 |
| 1269 | 2048 |
| 1270 | 2127 |
| 1271 | 2429 |
| 1272 | 1875 |
| 1273 | 2155 |
| 1274 | 2188 |
| 1275 | 2371 |
| 1276 | 2230 |
| 1277 | 2517 |
| 1278 | 2622 |
| 1279 | 2794 |
| 1280 | 157 |
| 1281 | 306 |
| 1282 | 394 |
| 1283 | 602 |
| 1284 | 454 |
| 1285 | 627 |
| 1286 | 698 |
| 1287 | 892 |
| 1288 | 499 |
| 1289 | 675 |
| 1290 | 736 |
| 1291 | 931 |
| 1292 | 790 |
| 1293 | 991 |
| 1294 | 1013 |
| 1295 | 1284 |
| 1296 | 536 |
| 1297 | 718 |
| 1298 | 757 |
| 1299 | 979 |
| 1300 | 835 |
| 1301 | 1030 |
| 1302 | 1104 |
| 1303 | 1311 |
| 1304 | 862 |
| 1305 | 1094 |
| 1306 | 1065 |
| 1307 | 1369 |
| 1308 | 1167 |
| 1309 | 1418 |
| 1310 | 1461 |
| 1311 | 1764 |
| 1312 | 568 |
| 1313 | 808 |
| 1314 | 851 |

TABLE Z18-continued

| with a sequence length of 4096: | |
|---|---|
| Polarized channel sequence number | Reliability or reliability sequence number |
| 1315 | 1052 |
| 1316 | 879 |
| 1317 | 1083 |
| 1318 | 1120 |
| 1319 | 1386 |
| 1320 | 944 |
| 1321 | 1150 |
| 1322 | 1184 |
| 1323 | 1426 |
| 1324 | 1240 |
| 1325 | 1495 |
| 1326 | 1526 |
| 1327 | 1827 |
| 1328 | 1000 |
| 1329 | 1193 |
| 1330 | 1269 |
| 1331 | 1513 |
| 1332 | 1302 |
| 1333 | 1557 |
| 1334 | 1599 |
| 1335 | 1870 |
| 1336 | 1363 |
| 1337 | 1614 |
| 1338 | 1660 |
| 1339 | 1927 |
| 1340 | 1697 |
| 1341 | 1989 |
| 1342 | 2043 |
| 1343 | 2341 |
| 1344 | 652 |
| 1345 | 821 |
| 1346 | 918 |
| 1347 | 1142 |
| 1348 | 954 |
| 1349 | 1176 |
| 1350 | 1231 |
| 1351 | 1476 |
| 1352 | 1022 |
| 1353 | 1275 |
| 1354 | 1205 |
| 1355 | 1534 |
| 1356 | 1328 |
| 1357 | 1580 |
| 1358 | 1638 |
| 1359 | 1893 |
| 1360 | 1076 |
| 1361 | 1254 |
| 1362 | 1355 |
| 1363 | 1605 |
| 1364 | 1395 |
| 1365 | 1653 |
| 1366 | 1691 |
| 1367 | 1961 |
| 1368 | 1444 |
| 1369 | 1705 |
| 1370 | 1779 |
| 1371 | 2009 |
| 1372 | 1817 |
| 1373 | 2077 |
| 1374 | 2121 |
| 1375 | 2439 |
| 1376 | 1129 |
| 1377 | 1378 |
| 1378 | 1436 |
| 1379 | 1683 |
| 1380 | 1503 |
| 1381 | 1730 |
| 1382 | 1795 |
| 1383 | 2061 |
| 1384 | 1544 |
| 1385 | 1801 |
| 1386 | 1864 |
| 1387 | 2091 |
| 1388 | 1904 |
| 1389 | 2151 |

TABLE Z18-continued

| with a sequence length of 4096: | |
|---|---|
| Polarized channel sequence number | Reliability or reliability sequence number |
| 1390 | 2203 |
| 1391 | 2477 |
| 1392 | 1619 |
| 1393 | 1881 |
| 1394 | 1943 |
| 1395 | 2169 |
| 1396 | 1979 |
| 1397 | 2211 |
| 1398 | 2258 |
| 1399 | 2547 |
| 1400 | 2031 |
| 1401 | 2282 |
| 1402 | 2326 |
| 1403 | 2598 |
| 1404 | 2364 |
| 1405 | 2657 |
| 1406 | 2721 |
| 1407 | 3027 |
| 1408 | 773 |
| 1409 | 902 |
| 1410 | 966 |
| 1411 | 1248 |
| 1412 | 1043 |
| 1413 | 1293 |
| 1414 | 1320 |
| 1415 | 1627 |
| 1416 | 1109 |
| 1417 | 1346 |
| 1418 | 1401 |
| 1419 | 1677 |
| 1420 | 1452 |
| 1421 | 1723 |
| 1422 | 1753 |
| 1423 | 2053 |
| 1424 | 1156 |
| 1425 | 1409 |
| 1426 | 1472 |
| 1427 | 1736 |
| 1428 | 1518 |
| 1429 | 1784 |
| 1430 | 1838 |
| 1431 | 2107 |
| 1432 | 1572 |
| 1433 | 1849 |
| 1434 | 1887 |
| 1435 | 2139 |
| 1436 | 1949 |
| 1437 | 2196 |
| 1438 | 2249 |
| 1439 | 2534 |
| 1440 | 1210 |
| 1441 | 1484 |
| 1442 | 1549 |
| 1443 | 1812 |
| 1444 | 1590 |
| 1445 | 1855 |
| 1446 | 1916 |
| 1447 | 2178 |
| 1448 | 1667 |
| 1449 | 1939 |
| 1450 | 1983 |
| 1451 | 2221 |
| 1452 | 2027 |
| 1453 | 2273 |
| 1454 | 2310 |
| 1455 | 2588 |
| 1456 | 1748 |
| 1457 | 2003 |
| 1458 | 2067 |
| 1459 | 2295 |
| 1460 | 2101 |
| 1461 | 2348 |
| 1462 | 2389 |
| 1463 | 2636 |
| 1464 | 2163 |

TABLE Z18-continued

| with a sequence length of 4096: | |
|---|---|
| Polarized channel sequence number | Reliability or reliability sequence number |
| 1465 | 2408 |
| 1466 | 2460 |
| 1467 | 2696 |
| 1468 | 2497 |
| 1469 | 2765 |
| 1470 | 2862 |
| 1471 | 3053 |
| 1472 | 1219 |
| 1473 | 1565 |
| 1474 | 1641 |
| 1475 | 1921 |
| 1476 | 1716 |
| 1477 | 1967 |
| 1478 | 2015 |
| 1479 | 2286 |
| 1480 | 1766 |
| 1481 | 2037 |
| 1482 | 2083 |
| 1483 | 2332 |
| 1484 | 2131 |
| 1485 | 2380 |
| 1486 | 2422 |
| 1487 | 2682 |
| 1488 | 1832 |
| 1489 | 2113 |
| 1490 | 2145 |
| 1491 | 2399 |
| 1492 | 2217 |
| 1493 | 2451 |
| 1494 | 2487 |
| 1495 | 2779 |
| 1496 | 2245 |
| 1497 | 2504 |
| 1498 | 2557 |
| 1499 | 2809 |
| 1500 | 2609 |
| 1501 | 2878 |
| 1502 | 2917 |
| 1503 | 3212 |
| 1504 | 1910 |
| 1505 | 2184 |
| 1506 | 2236 |
| 1507 | 2467 |
| 1508 | 2304 |
| 1509 | 2527 |
| 1510 | 2565 |
| 1511 | 2828 |
| 1512 | 2357 |
| 1513 | 2578 |
| 1514 | 2646 |
| 1515 | 2897 |
| 1516 | 2707 |
| 1517 | 2937 |
| 1518 | 2981 |
| 1519 | 3257 |
| 1520 | 2415 |
| 1521 | 2668 |
| 1522 | 2736 |
| 1523 | 2957 |
| 1524 | 2753 |
| 1525 | 2999 |
| 1526 | 3079 |
| 1527 | 3358 |
| 1528 | 2843 |
| 1529 | 3110 |
| 1530 | 3142 |
| 1531 | 3298 |
| 1532 | 3174 |
| 1533 | 3421 |
| 1534 | 3510 |
| 1535 | 3644 |
| 1536 | 169 |
| 1537 | 352 |
| 1538 | 449 |
| 1539 | 691 |

TABLE Z18-continued

| with a sequence length of 4096: | |
|---|---|
| Polarized channel sequence number | Reliability or reliability sequence number |
| 1540 | 517 |
| 1541 | 750 |
| 1542 | 824 |
| 1543 | 1047 |
| 1544 | 573 |
| 1545 | 800 |
| 1546 | 868 |
| 1547 | 1088 |
| 1548 | 924 |
| 1549 | 1147 |
| 1550 | 1170 |
| 1551 | 1477 |
| 1552 | 619 |
| 1553 | 845 |
| 1554 | 889 |
| 1555 | 1136 |
| 1556 | 975 |
| 1557 | 1202 |
| 1558 | 1278 |
| 1559 | 1509 |
| 1560 | 1003 |
| 1561 | 1266 |
| 1562 | 1237 |
| 1563 | 1560 |
| 1564 | 1352 |
| 1565 | 1607 |
| 1566 | 1650 |
| 1567 | 1959 |
| 1568 | 655 |
| 1569 | 940 |
| 1570 | 988 |
| 1571 | 1222 |
| 1572 | 1018 |
| 1573 | 1257 |
| 1574 | 1305 |
| 1575 | 1574 |
| 1576 | 1099 |
| 1577 | 1334 |
| 1578 | 1372 |
| 1579 | 1616 |
| 1580 | 1429 |
| 1581 | 1681 |
| 1582 | 1714 |
| 1583 | 2017 |
| 1584 | 1159 |
| 1585 | 1389 |
| 1586 | 1464 |
| 1587 | 1700 |
| 1588 | 1501 |
| 1589 | 1750 |
| 1590 | 1786 |
| 1591 | 2063 |
| 1592 | 1554 |
| 1593 | 1802 |
| 1594 | 1851 |
| 1595 | 2123 |
| 1596 | 1891 |
| 1597 | 2186 |
| 1598 | 2241 |
| 1599 | 2532 |
| 1600 | 775 |
| 1601 | 956 |
| 1602 | 1073 |
| 1603 | 1325 |
| 1604 | 1112 |
| 1605 | 1360 |
| 1606 | 1420 |
| 1607 | 1669 |
| 1608 | 1182 |
| 1609 | 1469 |
| 1610 | 1398 |
| 1611 | 1725 |
| 1612 | 1522 |
| 1613 | 1770 |
| 1614 | 1828 |

TABLE Z18-continued

| with a sequence length of 4096: | |
|---|---|
| Polarized channel sequence number | Reliability or reliability sequence number |
| 1615 | 2089 |
| 1616 | 1245 |
| 1617 | 1455 |
| 1618 | 1537 |
| 1619 | 1791 |
| 1620 | 1589 |
| 1621 | 1840 |
| 1622 | 1879 |
| 1623 | 2159 |
| 1624 | 1636 |
| 1625 | 1896 |
| 1626 | 1975 |
| 1627 | 2200 |
| 1628 | 2013 |
| 1629 | 2275 |
| 1630 | 2321 |
| 1631 | 2625 |
| 1632 | 1317 |
| 1633 | 1569 |
| 1634 | 1629 |
| 1635 | 1873 |
| 1636 | 1695 |
| 1637 | 1923 |
| 1638 | 1993 |
| 1639 | 2256 |
| 1640 | 1734 |
| 1641 | 1999 |
| 1642 | 2057 |
| 1643 | 2290 |
| 1644 | 2093 |
| 1645 | 2353 |
| 1646 | 2403 |
| 1647 | 2663 |
| 1648 | 1808 |
| 1649 | 2075 |
| 1650 | 2143 |
| 1651 | 2369 |
| 1652 | 2171 |
| 1653 | 2413 |
| 1654 | 2463 |
| 1655 | 2727 |
| 1656 | 2226 |
| 1657 | 2480 |
| 1658 | 2514 |
| 1659 | 2782 |
| 1660 | 2562 |
| 1661 | 2831 |
| 1662 | 2891 |
| 1663 | 3162 |
| 1664 | 905 |
| 1665 | 1060 |
| 1666 | 1123 |
| 1667 | 1447 |
| 1668 | 1213 |
| 1669 | 1487 |
| 1670 | 1514 |
| 1671 | 1814 |
| 1672 | 1287 |
| 1673 | 1532 |
| 1674 | 1597 |
| 1675 | 1862 |
| 1676 | 1645 |
| 1677 | 1918 |
| 1678 | 1947 |
| 1679 | 2253 |
| 1680 | 1343 |
| 1681 | 1602 |
| 1682 | 1663 |
| 1683 | 1935 |
| 1684 | 1709 |
| 1685 | 1981 |
| 1686 | 2035 |
| 1687 | 2306 |
| 1688 | 1761 |
| 1689 | 2045 |

TABLE Z18-continued

| with a sequence length of 4096: | |
|---|---|
| Polarized channel sequence number | Reliability or reliability sequence number |
| 1690 | 2079 |
| 1691 | 2337 |
| 1692 | 2147 |
| 1693 | 2396 |
| 1694 | 2453 |
| 1695 | 2716 |
| 1696 | 1403 |
| 1697 | 1674 |
| 1698 | 1739 |
| 1699 | 2001 |
| 1700 | 1781 |
| 1701 | 2049 |
| 1702 | 2109 |
| 1703 | 2378 |
| 1704 | 1856 |
| 1705 | 2135 |
| 1706 | 2180 |
| 1707 | 2427 |
| 1708 | 2219 |
| 1709 | 2472 |
| 1710 | 2507 |
| 1711 | 2771 |
| 1712 | 1941 |
| 1713 | 2194 |
| 1714 | 2264 |
| 1715 | 2492 |
| 1716 | 2297 |
| 1717 | 2542 |
| 1718 | 2580 |
| 1719 | 2803 |
| 1720 | 2360 |
| 1721 | 2596 |
| 1722 | 2644 |
| 1723 | 2865 |
| 1724 | 2685 |
| 1725 | 2930 |
| 1726 | 3013 |
| 1727 | 3183 |
| 1728 | 1412 |
| 1729 | 1755 |
| 1730 | 1834 |
| 1731 | 2119 |
| 1732 | 1902 |
| 1733 | 2161 |
| 1734 | 2209 |
| 1735 | 2489 |
| 1736 | 1965 |
| 1737 | 2234 |
| 1738 | 2277 |
| 1739 | 2522 |
| 1740 | 2328 |
| 1741 | 2572 |
| 1742 | 2614 |
| 1743 | 2853 |
| 1744 | 2029 |
| 1745 | 2312 |
| 1746 | 2346 |
| 1747 | 2591 |
| 1748 | 2417 |
| 1749 | 2638 |
| 1750 | 2676 |
| 1751 | 2947 |
| 1752 | 2446 |
| 1753 | 2693 |
| 1754 | 2738 |
| 1755 | 2964 |
| 1756 | 2791 |
| 1757 | 3024 |
| 1758 | 3064 |
| 1759 | 3323 |
| 1760 | 2105 |
| 1761 | 2387 |
| 1762 | 2436 |
| 1763 | 2654 |
| 1764 | 2499 |

TABLE Z18-continued

| with a sequence length of 4096: | |
|---|---|
| Polarized channel sequence number | Reliability or reliability sequence number |
| 1765 | 2704 |
| 1766 | 2744 |
| 1767 | 2978 |
| 1768 | 2549 |
| 1769 | 2759 |
| 1770 | 2816 |
| 1771 | 3045 |
| 1772 | 2881 |
| 1773 | 3075 |
| 1774 | 3118 |
| 1775 | 3368 |
| 1776 | 2606 |
| 1777 | 2840 |
| 1778 | 2907 |
| 1779 | 3098 |
| 1780 | 2920 |
| 1781 | 3146 |
| 1782 | 3208 |
| 1783 | 3456 |
| 1784 | 2992 |
| 1785 | 3234 |
| 1786 | 3266 |
| 1787 | 3405 |
| 1788 | 3294 |
| 1789 | 3516 |
| 1790 | 3591 |
| 1791 | 3702 |
| 1792 | 721 |
| 1793 | 1034 |
| 1794 | 1190 |
| 1795 | 1545 |
| 1796 | 1296 |
| 1797 | 1582 |
| 1798 | 1688 |
| 1799 | 1969 |
| 1800 | 1381 |
| 1801 | 1655 |
| 1802 | 1744 |
| 1803 | 2023 |
| 1804 | 1823 |
| 1805 | 2099 |
| 1806 | 2129 |
| 1807 | 2441 |
| 1808 | 1437 |
| 1809 | 1720 |
| 1810 | 1775 |
| 1811 | 2085 |
| 1812 | 1885 |
| 1813 | 2153 |
| 1814 | 2238 |
| 1815 | 2465 |
| 1816 | 1929 |
| 1817 | 2228 |
| 1818 | 2192 |
| 1819 | 2529 |
| 1820 | 2315 |
| 1821 | 2575 |
| 1822 | 2620 |
| 1823 | 2894 |
| 1824 | 1492 |
| 1825 | 1845 |
| 1826 | 1908 |
| 1827 | 2176 |
| 1828 | 1953 |
| 1829 | 2213 |
| 1830 | 2262 |
| 1831 | 2544 |
| 1832 | 2041 |
| 1833 | 2292 |
| 1834 | 2335 |
| 1835 | 2585 |
| 1836 | 2392 |
| 1837 | 2649 |
| 1838 | 2679 |
| 1839 | 2950 |

TABLE Z18-continued

| with a sequence length of 4096: | |
|---|---|
| Polarized channel sequence number | Reliability or reliability sequence number |
| 1840 | 2115 |
| 1841 | 2344 |
| 1842 | 2424 |
| 1843 | 2665 |
| 1844 | 2458 |
| 1845 | 2713 |
| 1846 | 2747 |
| 1847 | 2988 |
| 1848 | 2519 |
| 1849 | 2762 |
| 1850 | 2806 |
| 1851 | 3038 |
| 1852 | 2837 |
| 1853 | 3094 |
| 1854 | 3138 |
| 1855 | 3384 |
| 1856 | 1622 |
| 1857 | 1868 |
| 1858 | 2007 |
| 1859 | 2284 |
| 1860 | 2055 |
| 1861 | 2323 |
| 1862 | 2382 |
| 1863 | 2630 |
| 1864 | 2137 |
| 1865 | 2434 |
| 1866 | 2355 |
| 1867 | 2690 |
| 1868 | 2484 |
| 1869 | 2733 |
| 1870 | 2785 |
| 1871 | 3009 |
| 1872 | 2205 |
| 1873 | 2410 |
| 1874 | 2512 |
| 1875 | 2756 |
| 1876 | 2554 |
| 1877 | 2800 |
| 1878 | 2834 |
| 1879 | 3068 |
| 1880 | 2604 |
| 1881 | 2849 |
| 1882 | 2910 |
| 1883 | 3106 |
| 1884 | 2944 |
| 1885 | 3166 |
| 1886 | 3204 |
| 1887 | 3461 |
| 1888 | 2271 |
| 1889 | 2537 |
| 1890 | 2593 |
| 1891 | 2825 |
| 1892 | 2660 |
| 1893 | 2868 |
| 1894 | 2923 |
| 1895 | 3154 |
| 1896 | 2699 |
| 1897 | 2927 |
| 1898 | 2985 |
| 1899 | 3178 |
| 1900 | 3016 |
| 1901 | 3230 |
| 1902 | 3275 |
| 1903 | 3485 |
| 1904 | 2768 |
| 1905 | 2995 |
| 1906 | 3057 |
| 1907 | 3243 |
| 1908 | 3087 |
| 1909 | 3280 |
| 1910 | 3318 |
| 1911 | 3536 |
| 1912 | 3126 |
| 1913 | 3337 |
| 1914 | 3373 |

TABLE Z18-continued with a sequence length of 4096:

| Polarized channel sequence number | Reliability or reliability sequence number |
|---|---|
| 1915 | 3569 |
| 1916 | 3400 |
| 1917 | 3613 |
| 1918 | 3660 |
| 1919 | 3827 |
| 1920 | 1797 |
| 1921 | 1987 |
| 1922 | 2069 |
| 1923 | 2401 |
| 1924 | 2167 |
| 1925 | 2448 |
| 1926 | 2475 |
| 1927 | 2776 |
| 1928 | 2247 |
| 1929 | 2502 |
| 1930 | 2560 |
| 1931 | 2819 |
| 1932 | 2612 |
| 1933 | 2859 |
| 1934 | 2888 |
| 1935 | 3150 |
| 1936 | 2301 |
| 1937 | 2570 |
| 1938 | 2628 |
| 1939 | 2872 |
| 1940 | 2674 |
| 1941 | 2914 |
| 1942 | 2960 |
| 1943 | 3195 |
| 1944 | 2724 |
| 1945 | 2971 |
| 1946 | 3006 |
| 1947 | 3221 |
| 1948 | 3060 |
| 1949 | 3270 |
| 1950 | 3313 |
| 1951 | 3529 |
| 1952 | 2366 |
| 1953 | 2641 |
| 1954 | 2701 |
| 1955 | 2940 |
| 1956 | 2741 |
| 1957 | 2974 |
| 1958 | 3031 |
| 1959 | 3248 |
| 1960 | 2812 |
| 1961 | 3049 |
| 1962 | 3090 |
| 1963 | 3289 |
| 1964 | 3122 |
| 1965 | 3332 |
| 1966 | 3363 |
| 1967 | 3563 |
| 1968 | 2884 |
| 1969 | 3102 |
| 1970 | 3158 |
| 1971 | 3347 |
| 1972 | 3191 |
| 1973 | 3389 |
| 1974 | 3416 |
| 1975 | 3598 |
| 1976 | 3239 |
| 1977 | 3438 |
| 1978 | 3473 |
| 1979 | 3636 |
| 1980 | 3497 |
| 1981 | 3685 |
| 1982 | 3740 |
| 1983 | 3840 |
| 1984 | 2376 |
| 1985 | 2718 |
| 1986 | 2788 |
| 1987 | 3034 |
| 1988 | 2856 |
| 1989 | 3072 |

TABLE Z18-continued with a sequence length of 4096:

| Polarized channel sequence number | Reliability or reliability sequence number |
|---|---|
| 1990 | 3114 |
| 1991 | 3342 |
| 1992 | 2900 |
| 1993 | 3130 |
| 1994 | 3170 |
| 1995 | 3378 |
| 1996 | 3217 |
| 1997 | 3410 |
| 1998 | 3450 |
| 1999 | 3628 |
| 2000 | 2954 |
| 2001 | 3200 |
| 2002 | 3225 |
| 2003 | 3427 |
| 2004 | 3284 |
| 2005 | 3467 |
| 2006 | 3491 |
| 2007 | 3694 |
| 2008 | 3308 |
| 2009 | 3504 |
| 2010 | 3542 |
| 2011 | 3712 |
| 2012 | 3576 |
| 2013 | 3750 |
| 2014 | 3770 |
| 2015 | 3912 |
| 2016 | 3020 |
| 2017 | 3261 |
| 2018 | 3303 |
| 2019 | 3479 |
| 2020 | 3352 |
| 2021 | 3523 |
| 2022 | 3549 |
| 2023 | 3721 |
| 2024 | 3394 |
| 2025 | 3556 |
| 2026 | 3605 |
| 2027 | 3760 |
| 2028 | 3652 |
| 2029 | 3781 |
| 2030 | 3803 |
| 2031 | 3929 |
| 2032 | 3444 |
| 2033 | 3620 |
| 2034 | 3668 |
| 2035 | 3792 |
| 2036 | 3676 |
| 2037 | 3815 |
| 2038 | 3853 |
| 2039 | 3968 |
| 2040 | 3730 |
| 2041 | 3866 |
| 2042 | 3881 |
| 2043 | 3947 |
| 2044 | 3896 |
| 2045 | 3990 |
| 2046 | 4016 |
| 2047 | 4049 |
| 2048 | 11 |
| 2049 | 46 |
| 2050 | 79 |
| 2051 | 183 |
| 2052 | 105 |
| 2053 | 242 |
| 2054 | 280 |
| 2055 | 410 |
| 2056 | 128 |
| 2057 | 268 |
| 2058 | 303 |
| 2059 | 435 |
| 2060 | 335 |
| 2061 | 482 |
| 2062 | 497 |
| 2063 | 722 |
| 2064 | 148 |

TABLE Z18-continued with a sequence length of 4096:

| Polarized channel sequence number | Reliability or reliability sequence number |
|---|---|
| 2065 | 292 |
| 2066 | 314 |
| 2067 | 475 |
| 2068 | 365 |
| 2069 | 526 |
| 2070 | 572 |
| 2071 | 748 |
| 2072 | 384 |
| 2073 | 566 |
| 2074 | 546 |
| 2075 | 787 |
| 2076 | 628 |
| 2077 | 825 |
| 2078 | 861 |
| 2079 | 1110 |
| 2080 | 166 |
| 2081 | 345 |
| 2082 | 374 |
| 2083 | 539 |
| 2084 | 393 |
| 2085 | 559 |
| 2086 | 598 |
| 2087 | 801 |
| 2088 | 443 |
| 2089 | 616 |
| 2090 | 640 |
| 2091 | 829 |
| 2092 | 690 |
| 2093 | 887 |
| 2094 | 912 |
| 2095 | 1165 |
| 2096 | 490 |
| 2097 | 651 |
| 2098 | 711 |
| 2099 | 900 |
| 2100 | 743 |
| 2101 | 941 |
| 2102 | 973 |
| 2103 | 1204 |
| 2104 | 782 |
| 2105 | 989 |
| 2106 | 1027 |
| 2107 | 1258 |
| 2108 | 1061 |
| 2109 | 1313 |
| 2110 | 1368 |
| 2111 | 1652 |
| 2112 | 256 |
| 2113 | 355 |
| 2114 | 427 |
| 2115 | 610 |
| 2116 | 451 |
| 2117 | 634 |
| 2118 | 685 |
| 2119 | 874 |
| 2120 | 512 |
| 2121 | 717 |
| 2122 | 657 |
| 2123 | 925 |
| 2124 | 758 |
| 2125 | 957 |
| 2126 | 1005 |
| 2127 | 1227 |
| 2128 | 553 |
| 2129 | 706 |
| 2130 | 772 |
| 2131 | 977 |
| 2132 | 811 |
| 2133 | 1020 |
| 2134 | 1053 |
| 2135 | 1289 |
| 2136 | 852 |
| 2137 | 1064 |
| 2138 | 1128 |
| 2139 | 1327 |

TABLE Z18-continued with a sequence length of 4096:

| Polarized channel sequence number | Reliability or reliability sequence number |
|---|---|
| 2140 | 1155 |
| 2141 | 1396 |
| 2142 | 1443 |
| 2143 | 1745 |
| 2144 | 604 |
| 2145 | 792 |
| 2146 | 847 |
| 2147 | 1046 |
| 2148 | 896 |
| 2149 | 1082 |
| 2150 | 1141 |
| 2151 | 1379 |
| 2152 | 929 |
| 2153 | 1145 |
| 2154 | 1201 |
| 2155 | 1410 |
| 2156 | 1230 |
| 2157 | 1470 |
| 2158 | 1523 |
| 2159 | 1783 |
| 2160 | 993 |
| 2161 | 1211 |
| 2162 | 1276 |
| 2163 | 1489 |
| 2164 | 1304 |
| 2165 | 1533 |
| 2166 | 1581 |
| 2167 | 1854 |
| 2168 | 1351 |
| 2169 | 1596 |
| 2170 | 1632 |
| 2171 | 1909 |
| 2172 | 1682 |
| 2173 | 1962 |
| 2174 | 2032 |
| 2175 | 2349 |
| 2176 | 325 |
| 2177 | 419 |
| 2178 | 467 |
| 2179 | 701 |
| 2180 | 532 |
| 2181 | 727 |
| 2182 | 753 |
| 2183 | 997 |
| 2184 | 579 |
| 2185 | 768 |
| 2186 | 815 |
| 2187 | 1035 |
| 2188 | 856 |
| 2189 | 1079 |
| 2190 | 1103 |
| 2191 | 1377 |
| 2192 | 622 |
| 2193 | 820 |
| 2194 | 870 |
| 2195 | 1093 |
| 2196 | 908 |
| 2197 | 1131 |
| 2198 | 1175 |
| 2199 | 1430 |
| 2200 | 949 |
| 2201 | 1185 |
| 2202 | 1214 |
| 2203 | 1457 |
| 2204 | 1280 |
| 2205 | 1515 |
| 2206 | 1573 |
| 2207 | 1839 |
| 2208 | 668 |
| 2209 | 878 |
| 2210 | 933 |
| 2211 | 1148 |
| 2212 | 969 |
| 2213 | 1188 |
| 2214 | 1242 |

TABLE Z18-continued with a sequence length of 4096:

| Polarized channel sequence number | Reliability or reliability sequence number |
|---|---|
| 2215 | 1499 |
| 2216 | 1031 |
| 2217 | 1264 |
| 2218 | 1310 |
| 2219 | 1546 |
| 2220 | 1345 |
| 2221 | 1588 |
| 2222 | 1625 |
| 2223 | 1901 |
| 2224 | 1100 |
| 2225 | 1324 |
| 2226 | 1391 |
| 2227 | 1613 |
| 2228 | 1419 |
| 2229 | 1659 |
| 2230 | 1701 |
| 2231 | 1934 |
| 2232 | 1481 |
| 2233 | 1717 |
| 2234 | 1767 |
| 2235 | 2002 |
| 2236 | 1807 |
| 2237 | 2082 |
| 2238 | 2175 |
| 2239 | 2374 |
| 2240 | 679 |
| 2241 | 945 |
| 2242 | 1012 |
| 2243 | 1255 |
| 2244 | 1071 |
| 2245 | 1292 |
| 2246 | 1336 |
| 2247 | 1606 |
| 2248 | 1114 |
| 2249 | 1357 |
| 2250 | 1402 |
| 2251 | 1642 |
| 2252 | 1449 |
| 2253 | 1692 |
| 2254 | 1735 |
| 2255 | 1986 |
| 2256 | 1172 |
| 2257 | 1432 |
| 2258 | 1467 |
| 2259 | 1708 |
| 2260 | 1536 |
| 2261 | 1758 |
| 2262 | 1798 |
| 2263 | 2096 |
| 2264 | 1563 |
| 2265 | 1818 |
| 2266 | 1863 |
| 2267 | 2118 |
| 2268 | 1924 |
| 2269 | 2189 |
| 2270 | 2233 |
| 2271 | 2548 |
| 2272 | 1239 |
| 2273 | 1504 |
| 2274 | 1553 |
| 2275 | 1776 |
| 2276 | 1615 |
| 2277 | 1829 |
| 2278 | 1871 |
| 2279 | 2136 |
| 2280 | 1668 |
| 2281 | 1888 |
| 2282 | 1948 |
| 2283 | 2210 |
| 2284 | 2016 |
| 2285 | 2248 |
| 2286 | 2296 |
| 2287 | 2599 |
| 2288 | 1726 |
| 2289 | 1978 |

TABLE Z18-continued with a sequence length of 4096:

| Polarized channel sequence number | Reliability or reliability sequence number |
|---|---|
| 2290 | 2046 |
| 2291 | 2270 |
| 2292 | 2066 |
| 2293 | 2324 |
| 2294 | 2405 |
| 2295 | 2711 |
| 2296 | 2154 |
| 2297 | 2437 |
| 2298 | 2469 |
| 2299 | 2653 |
| 2300 | 2511 |
| 2301 | 2795 |
| 2302 | 2892 |
| 2303 | 3047 |
| 2304 | 199 |
| 2305 | 401 |
| 2306 | 519 |
| 2307 | 777 |
| 2308 | 591 |
| 2309 | 806 |
| 2310 | 891 |
| 2311 | 1121 |
| 2312 | 645 |
| 2313 | 865 |
| 2314 | 937 |
| 2315 | 1168 |
| 2316 | 1001 |
| 2317 | 1236 |
| 2318 | 1261 |
| 2319 | 1558 |
| 2320 | 695 |
| 2321 | 917 |
| 2322 | 965 |
| 2323 | 1223 |
| 2324 | 1057 |
| 2325 | 1283 |
| 2326 | 1365 |
| 2327 | 1586 |
| 2328 | 1086 |
| 2329 | 1354 |
| 2330 | 1322 |
| 2331 | 1644 |
| 2332 | 1435 |
| 2333 | 1694 |
| 2334 | 1738 |
| 2335 | 2038 |
| 2336 | 732 |
| 2337 | 1024 |
| 2338 | 1075 |
| 2339 | 1307 |
| 2340 | 1107 |
| 2341 | 1339 |
| 2342 | 1382 |
| 2343 | 1664 |
| 2344 | 1181 |
| 2345 | 1416 |
| 2346 | 1454 |
| 2347 | 1703 |
| 2348 | 1512 |
| 2349 | 1772 |
| 2350 | 1803 |
| 2351 | 2102 |
| 2352 | 1249 |
| 2353 | 1465 |
| 2354 | 1543 |
| 2355 | 1789 |
| 2356 | 1576 |
| 2357 | 1835 |
| 2358 | 1876 |
| 2359 | 2148 |
| 2360 | 1640 |
| 2361 | 1890 |
| 2362 | 1938 |
| 2363 | 2204 |
| 2364 | 1972 |

TABLE Z18-continued

| with a sequence length of 4096: | |
|---|---|
| Polarized channel sequence number | Reliability or reliability sequence number |
| 2365 | 2265 |
| 2366 | 2318 |
| 2367 | 2621 |
| 2368 | 834 |
| 2369 | 1038 |
| 2370 | 1152 |
| 2371 | 1408 |
| 2372 | 1195 |
| 2373 | 1446 |
| 2374 | 1502 |
| 2375 | 1751 |
| 2376 | 1273 |
| 2377 | 1548 |
| 2378 | 1478 |
| 2379 | 1811 |
| 2380 | 1603 |
| 2381 | 1857 |
| 2382 | 1915 |
| 2383 | 2170 |
| 2384 | 1333 |
| 2385 | 1528 |
| 2386 | 1630 |
| 2387 | 1882 |
| 2388 | 1671 |
| 2389 | 1930 |
| 2390 | 1966 |
| 2391 | 2237 |
| 2392 | 1722 |
| 2393 | 1980 |
| 2394 | 2054 |
| 2395 | 2285 |
| 2396 | 2094 |
| 2397 | 2354 |
| 2398 | 2400 |
| 2399 | 2719 |
| 2400 | 1394 |
| 2401 | 1654 |
| 2402 | 1713 |
| 2403 | 1958 |
| 2404 | 1780 |
| 2405 | 2004 |
| 2406 | 2070 |
| 2407 | 2338 |
| 2408 | 1820 |
| 2409 | 2076 |
| 2410 | 2142 |
| 2411 | 2368 |
| 2412 | 2181 |
| 2413 | 2430 |
| 2414 | 2483 |
| 2415 | 2757 |
| 2416 | 1897 |
| 2417 | 2158 |
| 2418 | 2222 |
| 2419 | 2450 |
| 2420 | 2254 |
| 2421 | 2491 |
| 2422 | 2540 |
| 2423 | 2824 |
| 2424 | 2307 |
| 2425 | 2563 |
| 2426 | 2607 |
| 2427 | 2871 |
| 2428 | 2645 |
| 2429 | 2924 |
| 2430 | 2982 |
| 2431 | 3247 |
| 2432 | 981 |
| 2433 | 1135 |
| 2434 | 1207 |
| 2435 | 1520 |
| 2436 | 1298 |
| 2437 | 1566 |
| 2438 | 1593 |
| 2439 | 1905 |

TABLE Z18-continued

| with a sequence length of 4096: | |
|---|---|
| Polarized channel sequence number | Reliability or reliability sequence number |
| 2440 | 1371 |
| 2441 | 1620 |
| 2442 | 1678 |
| 2443 | 1954 |
| 2444 | 1729 |
| 2445 | 1996 |
| 2446 | 2026 |
| 2447 | 2331 |
| 2448 | 1424 |
| 2449 | 1685 |
| 2450 | 1749 |
| 2451 | 2010 |
| 2452 | 1796 |
| 2453 | 2060 |
| 2454 | 2112 |
| 2455 | 2386 |
| 2456 | 1848 |
| 2457 | 2124 |
| 2458 | 2164 |
| 2459 | 2419 |
| 2460 | 2227 |
| 2461 | 2478 |
| 2462 | 2531 |
| 2463 | 2813 |
| 2464 | 1483 |
| 2465 | 1760 |
| 2466 | 1826 |
| 2467 | 2088 |
| 2468 | 1867 |
| 2469 | 2130 |
| 2470 | 2193 |
| 2471 | 2459 |
| 2472 | 1942 |
| 2473 | 2216 |
| 2474 | 2259 |
| 2475 | 2503 |
| 2476 | 2302 |
| 2477 | 2553 |
| 2478 | 2590 |
| 2479 | 2863 |
| 2480 | 2022 |
| 2481 | 2280 |
| 2482 | 2343 |
| 2483 | 2576 |
| 2484 | 2381 |
| 2485 | 2631 |
| 2486 | 2670 |
| 2487 | 2903 |
| 2488 | 2444 |
| 2489 | 2687 |
| 2490 | 2739 |
| 2491 | 2958 |
| 2492 | 2774 |
| 2493 | 3021 |
| 2494 | 3105 |
| 2495 | 3268 |
| 2496 | 1494 |
| 2497 | 1844 |
| 2498 | 1917 |
| 2499 | 2199 |
| 2500 | 1992 |
| 2501 | 2242 |
| 2502 | 2291 |
| 2503 | 2568 |
| 2504 | 2040 |
| 2505 | 2313 |
| 2506 | 2361 |
| 2507 | 2613 |
| 2508 | 2411 |
| 2509 | 2661 |
| 2510 | 2702 |
| 2511 | 2946 |
| 2512 | 2108 |
| 2513 | 2391 |
| 2514 | 2425 |

TABLE Z18-continued with a sequence length of 4096:

| Polarized channel sequence number | Reliability or reliability sequence number |
|---|---|
| 2515 | 2678 |
| 2516 | 2498 |
| 2517 | 2731 |
| 2518 | 2766 |
| 2519 | 3032 |
| 2520 | 2525 |
| 2521 | 2783 |
| 2522 | 2833 |
| 2523 | 3059 |
| 2524 | 2880 |
| 2525 | 3117 |
| 2526 | 3152 |
| 2527 | 3402 |
| 2528 | 2187 |
| 2529 | 2464 |
| 2530 | 2516 |
| 2531 | 2748 |
| 2532 | 2584 |
| 2533 | 2804 |
| 2534 | 2842 |
| 2535 | 3074 |
| 2536 | 2639 |
| 2537 | 2854 |
| 2538 | 2915 |
| 2539 | 3137 |
| 2540 | 2970 |
| 2541 | 3169 |
| 2542 | 3207 |
| 2543 | 3437 |
| 2544 | 2695 |
| 2545 | 2935 |
| 2546 | 2993 |
| 2547 | 3188 |
| 2548 | 3008 |
| 2549 | 3224 |
| 2550 | 3292 |
| 2551 | 3520 |
| 2552 | 3091 |
| 2553 | 3317 |
| 2554 | 3343 |
| 2555 | 3474 |
| 2556 | 3371 |
| 2557 | 3574 |
| 2558 | 3642 |
| 2559 | 3744 |
| 2560 | 214 |
| 2561 | 459 |
| 2562 | 585 |
| 2563 | 883 |
| 2564 | 674 |
| 2565 | 953 |
| 2566 | 1042 |
| 2567 | 1301 |
| 2568 | 737 |
| 2569 | 1016 |
| 2570 | 1096 |
| 2571 | 1348 |
| 2572 | 1162 |
| 2573 | 1413 |
| 2574 | 1438 |
| 2575 | 1756 |
| 2576 | 797 |
| 2577 | 1068 |
| 2578 | 1117 |
| 2579 | 1399 |
| 2580 | 1220 |
| 2581 | 1473 |
| 2582 | 1551 |
| 2583 | 1787 |
| 2584 | 1252 |
| 2585 | 1538 |
| 2586 | 1507 |
| 2587 | 1837 |
| 2588 | 1628 |
| 2589 | 1884 |
| 2590 | 1926 |
| 2591 | 2235 |
| 2592 | 843 |
| 2593 | 1178 |
| 2594 | 1233 |
| 2595 | 1497 |
| 2596 | 1267 |
| 2597 | 1530 |
| 2598 | 1578 |
| 2599 | 1850 |
| 2600 | 1359 |
| 2601 | 1608 |
| 2602 | 1647 |
| 2603 | 1892 |
| 2604 | 1706 |
| 2605 | 1956 |
| 2606 | 1988 |
| 2607 | 2294 |
| 2608 | 1427 |
| 2609 | 1666 |
| 2610 | 1740 |
| 2611 | 1974 |
| 2612 | 1778 |
| 2613 | 2024 |
| 2614 | 2062 |
| 2615 | 2342 |
| 2616 | 1831 |
| 2617 | 2080 |
| 2618 | 2128 |
| 2619 | 2402 |
| 2620 | 2168 |
| 2621 | 2466 |
| 2622 | 2523 |
| 2623 | 2810 |
| 2624 | 985 |
| 2625 | 1198 |
| 2626 | 1330 |
| 2627 | 1601 |
| 2628 | 1374 |
| 2629 | 1635 |
| 2630 | 1696 |
| 2631 | 1946 |
| 2632 | 1451 |
| 2633 | 1747 |
| 2634 | 1675 |
| 2635 | 2000 |
| 2636 | 1800 |
| 2637 | 2044 |
| 2638 | 2104 |
| 2639 | 2367 |
| 2640 | 1517 |
| 2641 | 1733 |
| 2642 | 1816 |
| 2643 | 2068 |
| 2644 | 1865 |
| 2645 | 2116 |
| 2646 | 2156 |
| 2647 | 2438 |
| 2648 | 1913 |
| 2649 | 2174 |
| 2650 | 2252 |
| 2651 | 2481 |
| 2652 | 2289 |
| 2653 | 2556 |
| 2654 | 2602 |
| 2655 | 2895 |
| 2656 | 1591 |
| 2657 | 1846 |
| 2658 | 1907 |
| 2659 | 2150 |
| 2660 | 1970 |
| 2661 | 2201 |
| 2662 | 2268 |
| 2663 | 2536 |
| 2664 | 2008 |

TABLE Z18-continued with a sequence length of 4096:

| Polarized channel sequence number | Reliability or reliability sequence number |
|---|---|
| 2665 | 2274 |
| 2666 | 2336 |
| 2667 | 2571 |
| 2668 | 2372 |
| 2669 | 2632 |
| 2670 | 2684 |
| 2671 | 2929 |
| 2672 | 2084 |
| 2673 | 2352 |
| 2674 | 2423 |
| 2675 | 2650 |
| 2676 | 2452 |
| 2677 | 2694 |
| 2678 | 2742 |
| 2679 | 2987 |
| 2680 | 2506 |
| 2681 | 2760 |
| 2682 | 2792 |
| 2683 | 3036 |
| 2684 | 2839 |
| 2685 | 3078 |
| 2686 | 3131 |
| 2687 | 3360 |
| 2688 | 1138 |
| 2689 | 1316 |
| 2690 | 1388 |
| 2691 | 1724 |
| 2692 | 1486 |
| 2693 | 1765 |
| 2694 | 1792 |
| 2695 | 2090 |
| 2696 | 1561 |
| 2697 | 1809 |
| 2698 | 1874 |
| 2699 | 2138 |
| 2700 | 1922 |
| 2701 | 2195 |
| 2702 | 2223 |
| 2703 | 2535 |
| 2704 | 1618 |
| 2705 | 1880 |
| 2706 | 1940 |
| 2707 | 2212 |
| 2708 | 1982 |
| 2709 | 2257 |
| 2710 | 2311 |
| 2711 | 2587 |
| 2712 | 2036 |
| 2713 | 2322 |
| 2714 | 2358 |
| 2715 | 2619 |
| 2716 | 2428 |
| 2717 | 2675 |
| 2718 | 2734 |
| 2719 | 2976 |
| 2720 | 1680 |
| 2721 | 1950 |
| 2722 | 2014 |
| 2723 | 2276 |
| 2724 | 2056 |
| 2725 | 2327 |
| 2726 | 2388 |
| 2727 | 2659 |
| 2728 | 2132 |
| 2729 | 2414 |
| 2730 | 2461 |
| 2731 | 2708 |
| 2732 | 2500 |
| 2733 | 2751 |
| 2734 | 2786 |
| 2735 | 3026 |
| 2736 | 2218 |
| 2737 | 2474 |
| 2738 | 2545 |
| 2739 | 2772 |

TABLE Z18-continued with a sequence length of 4096:

| Polarized channel sequence number | Reliability or reliability sequence number |
|---|---|
| 2740 | 2579 |
| 2741 | 2818 |
| 2742 | 2857 |
| 2743 | 3054 |
| 2744 | 2642 |
| 2745 | 2870 |
| 2746 | 2912 |
| 2747 | 3108 |
| 2748 | 2949 |
| 2749 | 3165 |
| 2750 | 3235 |
| 2751 | 3379 |
| 2752 | 1689 |
| 2753 | 2030 |
| 2754 | 2110 |
| 2755 | 2397 |
| 2756 | 2179 |
| 2757 | 2442 |
| 2758 | 2490 |
| 2759 | 2769 |
| 2760 | 2240 |
| 2761 | 2515 |
| 2762 | 2559 |
| 2763 | 2801 |
| 2764 | 2610 |
| 2765 | 2848 |
| 2766 | 2886 |
| 2767 | 3096 |
| 2768 | 2305 |
| 2769 | 2594 |
| 2770 | 2627 |
| 2771 | 2866 |
| 2772 | 2698 |
| 2773 | 2906 |
| 2774 | 2941 |
| 2775 | 3179 |
| 2776 | 2725 |
| 2777 | 2955 |
| 2778 | 2997 |
| 2779 | 3194 |
| 2780 | 3044 |
| 2781 | 3245 |
| 2782 | 3278 |
| 2783 | 3494 |
| 2784 | 2383 |
| 2785 | 2667 |
| 2786 | 2715 |
| 2787 | 2921 |
| 2788 | 2777 |
| 2789 | 2968 |
| 2790 | 3003 |
| 2791 | 3205 |
| 2792 | 2827 |
| 2793 | 3014 |
| 2794 | 3066 |
| 2795 | 3262 |
| 2796 | 3121 |
| 2797 | 3288 |
| 2798 | 3324 |
| 2799 | 3528 |
| 2800 | 2877 |
| 2801 | 3086 |
| 2802 | 3143 |
| 2803 | 3306 |
| 2804 | 3156 |
| 2805 | 3346 |
| 2806 | 3398 |
| 2807 | 3597 |
| 2808 | 3218 |
| 2809 | 3422 |
| 2810 | 3445 |
| 2811 | 3560 |
| 2812 | 3469 |
| 2813 | 3647 |
| 2814 | 3703 |

TABLE Z18-continued

| with a sequence length of 4096: | |
|---|---|
| Polarized channel sequence number | Reliability or reliability sequence number |
| 2815 | 3790 |
| 2816 | 921 |
| 2817 | 1286 |
| 2818 | 1462 |
| 2819 | 1822 |
| 2820 | 1571 |
| 2821 | 1859 |
| 2822 | 1964 |
| 2823 | 2246 |
| 2824 | 1656 |
| 2825 | 1932 |
| 2826 | 2018 |
| 2827 | 2300 |
| 2828 | 2098 |
| 2829 | 2377 |
| 2830 | 2409 |
| 2831 | 2722 |
| 2832 | 1715 |
| 2833 | 1994 |
| 2834 | 2052 |
| 2835 | 2363 |
| 2836 | 2162 |
| 2837 | 2433 |
| 2838 | 2520 |
| 2839 | 2745 |
| 2840 | 2206 |
| 2841 | 2508 |
| 2842 | 2473 |
| 2843 | 2807 |
| 2844 | 2595 |
| 2845 | 2851 |
| 2846 | 2889 |
| 2847 | 3133 |
| 2848 | 1769 |
| 2849 | 2122 |
| 2850 | 2185 |
| 2851 | 2456 |
| 2852 | 2229 |
| 2853 | 2495 |
| 2854 | 2543 |
| 2855 | 2821 |
| 2856 | 2316 |
| 2857 | 2573 |
| 2858 | 2616 |
| 2859 | 2860 |
| 2860 | 2673 |
| 2861 | 2918 |
| 2862 | 2943 |
| 2863 | 3181 |
| 2864 | 2395 |
| 2865 | 2624 |
| 2866 | 2705 |
| 2867 | 2932 |
| 2868 | 2737 |
| 2869 | 2973 |
| 2870 | 3005 |
| 2871 | 3214 |
| 2872 | 2798 |
| 2873 | 3018 |
| 2874 | 3056 |
| 2875 | 3258 |
| 2876 | 3084 |
| 2877 | 3304 |
| 2878 | 3339 |
| 2879 | 3541 |
| 2880 | 1899 |
| 2881 | 2144 |
| 2882 | 2283 |
| 2883 | 2564 |
| 2884 | 2333 |
| 2885 | 2605 |
| 2886 | 2664 |
| 2887 | 2901 |
| 2888 | 2416 |
| 2889 | 2714 |

TABLE Z18-continued

| with a sequence length of 4096: | |
|---|---|
| Polarized channel sequence number | Reliability or reliability sequence number |
| 2890 | 2635 |
| 2891 | 2952 |
| 2892 | 2763 |
| 2893 | 2990 |
| 2894 | 3039 |
| 2895 | 3231 |
| 2896 | 2486 |
| 2897 | 2691 |
| 2898 | 2789 |
| 2899 | 3011 |
| 2900 | 2830 |
| 2901 | 3051 |
| 2902 | 3081 |
| 2903 | 3282 |
| 2904 | 2874 |
| 2905 | 3093 |
| 2906 | 3147 |
| 2907 | 3314 |
| 2908 | 3175 |
| 2909 | 3364 |
| 2910 | 3395 |
| 2911 | 3602 |
| 2912 | 2551 |
| 2913 | 2815 |
| 2914 | 2869 |
| 2915 | 3071 |
| 2916 | 2926 |
| 2917 | 3112 |
| 2918 | 3159 |
| 2919 | 3354 |
| 2920 | 2962 |
| 2921 | 3163 |
| 2922 | 3211 |
| 2923 | 3375 |
| 2924 | 3237 |
| 2925 | 3418 |
| 2926 | 3453 |
| 2927 | 3622 |
| 2928 | 3023 |
| 2929 | 3222 |
| 2930 | 3272 |
| 2931 | 3429 |
| 2932 | 3296 |
| 2933 | 3457 |
| 2934 | 3490 |
| 2935 | 3663 |
| 2936 | 3331 |
| 2937 | 3502 |
| 2938 | 3533 |
| 2939 | 3690 |
| 2940 | 3555 |
| 2941 | 3719 |
| 2942 | 3757 |
| 2943 | 3887 |
| 2944 | 2074 |
| 2945 | 2263 |
| 2946 | 2347 |
| 2947 | 2681 |
| 2948 | 2447 |
| 2949 | 2728 |
| 2950 | 2754 |
| 2951 | 3029 |
| 2952 | 2528 |
| 2953 | 2780 |
| 2954 | 2836 |
| 2955 | 3069 |
| 2956 | 2883 |
| 2957 | 3103 |
| 2958 | 3127 |
| 2959 | 3350 |
| 2960 | 2582 |
| 2961 | 2845 |
| 2962 | 2898 |
| 2963 | 3115 |
| 2964 | 2938 |

TABLE Z18-continued

| with a sequence length of 4096: | |
|---|---|
| Polarized channel sequence number | Reliability or reliability sequence number |
| 2965 | 3149 |
| 2966 | 3192 |
| 2967 | 3387 |
| 2968 | 2984 |
| 2969 | 3198 |
| 2970 | 3228 |
| 2971 | 3409 |
| 2972 | 3276 |
| 2973 | 3448 |
| 2974 | 3486 |
| 2975 | 3658 |
| 2976 | 2647 |
| 2977 | 2909 |
| 2978 | 2965 |
| 2979 | 3172 |
| 2980 | 3000 |
| 2981 | 3201 |
| 2982 | 3251 |
| 2983 | 3432 |
| 2984 | 3062 |
| 2985 | 3265 |
| 2986 | 3300 |
| 2987 | 3465 |
| 2988 | 3327 |
| 2989 | 3499 |
| 2990 | 3524 |
| 2991 | 3686 |
| 2992 | 3124 |
| 2993 | 3310 |
| 2994 | 3356 |
| 2995 | 3511 |
| 2996 | 3383 |
| 2997 | 3546 |
| 2998 | 3570 |
| 2999 | 3708 |
| 3000 | 3425 |
| 3001 | 3583 |
| 3002 | 3612 |
| 3003 | 3737 |
| 3004 | 3632 |
| 3005 | 3776 |
| 3006 | 3819 |
| 3007 | 3897 |
| 3008 | 2656 |
| 3009 | 2979 |
| 3010 | 3041 |
| 3011 | 3255 |
| 3012 | 3100 |
| 3013 | 3286 |
| 3014 | 3321 |
| 3015 | 3507 |
| 3016 | 3140 |
| 3017 | 3335 |
| 3018 | 3367 |
| 3019 | 3538 |
| 3020 | 3406 |
| 3021 | 3565 |
| 3022 | 3593 |
| 3023 | 3732 |
| 3024 | 3185 |
| 3025 | 3391 |
| 3026 | 3413 |
| 3027 | 3579 |
| 3028 | 3462 |
| 3029 | 3607 |
| 3030 | 3626 |
| 3031 | 3784 |
| 3032 | 3482 |
| 3033 | 3637 |
| 3034 | 3669 |
| 3035 | 3797 |
| 3036 | 3696 |
| 3037 | 3828 |
| 3038 | 3843 |
| 3039 | 3951 |

TABLE Z18-continued

| with a sequence length of 4096: | |
|---|---|
| Polarized channel sequence number | Reliability or reliability sequence number |
| 3040 | 3241 |
| 3041 | 3441 |
| 3042 | 3477 |
| 3043 | 3617 |
| 3044 | 3515 |
| 3045 | 3653 |
| 3046 | 3674 |
| 3047 | 3805 |
| 3048 | 3551 |
| 3049 | 3680 |
| 3050 | 3714 |
| 3051 | 3835 |
| 3052 | 3751 |
| 3053 | 3851 |
| 3054 | 3869 |
| 3055 | 3964 |
| 3056 | 3588 |
| 3057 | 3726 |
| 3058 | 3763 |
| 3059 | 3860 |
| 3060 | 3769 |
| 3061 | 3877 |
| 3062 | 3906 |
| 3063 | 3994 |
| 3064 | 3812 |
| 3065 | 3917 |
| 3066 | 3927 |
| 3067 | 3978 |
| 3068 | 3939 |
| 3069 | 4010 |
| 3070 | 4031 |
| 3071 | 4056 |
| 3072 | 229 |
| 3073 | 504 |
| 3074 | 662 |
| 3075 | 1008 |
| 3076 | 763 |
| 3077 | 1124 |
| 3078 | 1217 |
| 3079 | 1491 |
| 3080 | 838 |
| 3081 | 1191 |
| 3082 | 1270 |
| 3083 | 1541 |
| 3084 | 1342 |
| 3085 | 1623 |
| 3086 | 1649 |
| 3087 | 1984 |
| 3088 | 904 |
| 3089 | 1246 |
| 3090 | 1295 |
| 3091 | 1611 |
| 3092 | 1405 |
| 3093 | 1687 |
| 3094 | 1763 |
| 3095 | 2020 |
| 3096 | 1441 |
| 3097 | 1754 |
| 3098 | 1719 |
| 3099 | 2072 |
| 3100 | 1852 |
| 3101 | 2126 |
| 3102 | 2172 |
| 3103 | 2476 |
| 3104 | 961 |
| 3105 | 1362 |
| 3106 | 1421 |
| 3107 | 1710 |
| 3108 | 1459 |
| 3109 | 1742 |
| 3110 | 1805 |
| 3111 | 2092 |
| 3112 | 1556 |
| 3113 | 1833 |
| 3114 | 1869 |

TABLE Z18-continued with a sequence length of 4096:

| Polarized channel sequence number | Reliability or reliability sequence number |
|---|---|
| 3115 | 2134 |
| 3116 | 1936 |
| 3117 | 2208 |
| 3118 | 2239 |
| 3119 | 2533 |
| 3120 | 1637 |
| 3121 | 1886 |
| 3122 | 1968 |
| 3123 | 2225 |
| 3124 | 2012 |
| 3125 | 2278 |
| 3126 | 2314 |
| 3127 | 2577 |
| 3128 | 2064 |
| 3129 | 2334 |
| 3130 | 2379 |
| 3131 | 2634 |
| 3132 | 2418 |
| 3133 | 2689 |
| 3134 | 2743 |
| 3135 | 3010 |
| 3136 | 1158 |
| 3137 | 1385 |
| 3138 | 1525 |
| 3139 | 1824 |
| 3140 | 1568 |
| 3141 | 1861 |
| 3142 | 1928 |
| 3143 | 2191 |
| 3144 | 1661 |
| 3145 | 1976 |
| 3146 | 1895 |
| 3147 | 2255 |
| 3148 | 2034 |
| 3149 | 2298 |
| 3150 | 2356 |
| 3151 | 2600 |
| 3152 | 1731 |
| 3153 | 1960 |
| 3154 | 2050 |
| 3155 | 2320 |
| 3156 | 2106 |
| 3157 | 2370 |
| 3158 | 2407 |
| 3159 | 2666 |
| 3160 | 2160 |
| 3161 | 2421 |
| 3162 | 2493 |
| 3163 | 2703 |
| 3164 | 2526 |
| 3165 | 2770 |
| 3166 | 2814 |
| 3167 | 3089 |
| 3168 | 1813 |
| 3169 | 2078 |
| 3170 | 2152 |
| 3171 | 2404 |
| 3172 | 2220 |
| 3173 | 2445 |
| 3174 | 2510 |
| 3175 | 2755 |
| 3176 | 2261 |
| 3177 | 2513 |
| 3178 | 2574 |
| 3179 | 2784 |
| 3180 | 2603 |
| 3181 | 2841 |
| 3182 | 2893 |
| 3183 | 3123 |
| 3184 | 2340 |
| 3185 | 2586 |
| 3186 | 2651 |
| 3187 | 2858 |
| 3188 | 2680 |
| 3189 | 2902 |

TABLE Z18-continued with a sequence length of 4096:

| Polarized channel sequence number | Reliability or reliability sequence number |
|---|---|
| 3190 | 2948 |
| 3191 | 3180 |
| 3192 | 2726 |
| 3193 | 2961 |
| 3194 | 2994 |
| 3195 | 3223 |
| 3196 | 3037 |
| 3197 | 3263 |
| 3198 | 3315 |
| 3199 | 3514 |
| 3200 | 1319 |
| 3201 | 1510 |
| 3202 | 1598 |
| 3203 | 1952 |
| 3204 | 1699 |
| 3205 | 1990 |
| 3206 | 2028 |
| 3207 | 2345 |
| 3208 | 1774 |
| 3209 | 2042 |
| 3210 | 2114 |
| 3211 | 2390 |
| 3212 | 2166 |
| 3213 | 2440 |
| 3214 | 2468 |
| 3215 | 2752 |
| 3216 | 1842 |
| 3217 | 2120 |
| 3218 | 2183 |
| 3219 | 2454 |
| 3220 | 2231 |
| 3221 | 2496 |
| 3222 | 2546 |
| 3223 | 2802 |
| 3224 | 2287 |
| 3225 | 2558 |
| 3226 | 2589 |
| 3227 | 2829 |
| 3228 | 2655 |
| 3229 | 2885 |
| 3230 | 2939 |
| 3231 | 3168 |
| 3232 | 1903 |
| 3233 | 2197 |
| 3234 | 2267 |
| 3235 | 2518 |
| 3236 | 2309 |
| 3237 | 2561 |
| 3238 | 2618 |
| 3239 | 2867 |
| 3240 | 2384 |
| 3241 | 2640 |
| 3242 | 2686 |
| 3243 | 2913 |
| 3244 | 2720 |
| 3245 | 2953 |
| 3246 | 2986 |
| 3247 | 3216 |
| 3248 | 2462 |
| 3249 | 2700 |
| 3250 | 2764 |
| 3251 | 2975 |
| 3252 | 2793 |
| 3253 | 3017 |
| 3254 | 3052 |
| 3255 | 3242 |
| 3256 | 2850 |
| 3257 | 3067 |
| 3258 | 3109 |
| 3259 | 3293 |
| 3260 | 3141 |
| 3261 | 3348 |
| 3262 | 3408 |
| 3263 | 3530 |
| 3264 | 1920 |

TABLE Z18-continued with a sequence length of 4096:

| Polarized channel sequence number | Reliability or reliability sequence number |
|---|---|
| 3265 | 2281 |
| 3266 | 2359 |
| 3267 | 2629 |
| 3268 | 2431 |
| 3269 | 2669 |
| 3270 | 2712 |
| 3271 | 2969 |
| 3272 | 2479 |
| 3273 | 2732 |
| 3274 | 2778 |
| 3275 | 3001 |
| 3276 | 2820 |
| 3277 | 3046 |
| 3278 | 3082 |
| 3279 | 3281 |
| 3280 | 2541 |
| 3281 | 2805 |
| 3282 | 2838 |
| 3283 | 3061 |
| 3284 | 2905 |
| 3285 | 3101 |
| 3286 | 3135 |
| 3287 | 3357 |
| 3288 | 2931 |
| 3289 | 3151 |
| 3290 | 3186 |
| 3291 | 3372 |
| 3292 | 3233 |
| 3293 | 3417 |
| 3294 | 3443 |
| 3295 | 3625 |
| 3296 | 2615 |
| 3297 | 2876 |
| 3298 | 2922 |
| 3299 | 3116 |
| 3300 | 2977 |
| 3301 | 3160 |
| 3302 | 3193 |
| 3303 | 3382 |
| 3304 | 3025 |
| 3305 | 3206 |
| 3306 | 3253 |
| 3307 | 3430 |
| 3308 | 3302 |
| 3309 | 3454 |
| 3310 | 3483 |
| 3311 | 3651 |
| 3312 | 3076 |
| 3313 | 3274 |
| 3314 | 3325 |
| 3315 | 3468 |
| 3316 | 3336 |
| 3317 | 3500 |
| 3318 | 3547 |
| 3319 | 3707 |
| 3320 | 3393 |
| 3321 | 3564 |
| 3322 | 3582 |
| 3323 | 3679 |
| 3324 | 3606 |
| 3325 | 3747 |
| 3326 | 3793 |
| 3327 | 3859 |
| 3328 | 1050 |
| 3329 | 1475 |
| 3330 | 1673 |
| 3331 | 2058 |
| 3332 | 1794 |
| 3333 | 2100 |
| 3334 | 2214 |
| 3335 | 2488 |
| 3336 | 1878 |
| 3337 | 2177 |
| 3338 | 2272 |
| 3339 | 2538 |

TABLE Z18-continued with a sequence length of 4096:

| Polarized channel sequence number | Reliability or reliability sequence number |
|---|---|
| 3340 | 2351 |
| 3341 | 2611 |
| 3342 | 2637 |
| 3343 | 2925 |
| 3344 | 1944 |
| 3345 | 2244 |
| 3346 | 2303 |
| 3347 | 2597 |
| 3348 | 2412 |
| 3349 | 2658 |
| 3350 | 2740 |
| 3351 | 2951 |
| 3352 | 2449 |
| 3353 | 2729 |
| 3354 | 2697 |
| 3355 | 3004 |
| 3356 | 2808 |
| 3357 | 3048 |
| 3358 | 3085 |
| 3359 | 3319 |
| 3360 | 1998 |
| 3361 | 2375 |
| 3362 | 2435 |
| 3363 | 2683 |
| 3364 | 2471 |
| 3365 | 2717 |
| 3366 | 2758 |
| 3367 | 3019 |
| 3368 | 2555 |
| 3369 | 2790 |
| 3370 | 2826 |
| 3371 | 3055 |
| 3372 | 2882 |
| 3373 | 3113 |
| 3374 | 3139 |
| 3375 | 3361 |
| 3376 | 2623 |
| 3377 | 2835 |
| 3378 | 2911 |
| 3379 | 3128 |
| 3380 | 2942 |
| 3381 | 3164 |
| 3382 | 3197 |
| 3383 | 3390 |
| 3384 | 2998 |
| 3385 | 3209 |
| 3386 | 3244 |
| 3387 | 3426 |
| 3388 | 3271 |
| 3389 | 3464 |
| 3390 | 3496 |
| 3391 | 3664 |
| 3392 | 2140 |
| 3393 | 2393 |
| 3394 | 2521 |
| 3395 | 2781 |
| 3396 | 2566 |
| 3397 | 2817 |
| 3398 | 2873 |
| 3399 | 3097 |
| 3400 | 2648 |
| 3401 | 2916 |
| 3402 | 2847 |
| 3403 | 3145 |
| 3404 | 2966 |
| 3405 | 3182 |
| 3406 | 3227 |
| 3407 | 3404 |
| 3408 | 2709 |
| 3409 | 2896 |
| 3410 | 2991 |
| 3411 | 3202 |
| 3412 | 3028 |
| 3413 | 3238 |
| 3414 | 3267 |

TABLE Z18-continued with a sequence length of 4096:

| Polarized channel sequence number | Reliability or reliability sequence number |
|---|---|
| 3415 | 3447 |
| 3416 | 3070 |
| 3417 | 3277 |
| 3418 | 3329 |
| 3419 | 3476 |
| 3420 | 3355 |
| 3421 | 3518 |
| 3422 | 3544 |
| 3423 | 3711 |
| 3424 | 2767 |
| 3425 | 3012 |
| 3426 | 3063 |
| 3427 | 3260 |
| 3428 | 3120 |
| 3429 | 3295 |
| 3430 | 3340 |
| 3431 | 3508 |
| 3432 | 3153 |
| 3433 | 3344 |
| 3434 | 3386 |
| 3435 | 3526 |
| 3436 | 3412 |
| 3437 | 3561 |
| 3438 | 3590 |
| 3439 | 3729 |
| 3440 | 3213 |
| 3441 | 3397 |
| 3442 | 3436 |
| 3443 | 3572 |
| 3444 | 3458 |
| 3445 | 3595 |
| 3446 | 3621 |
| 3447 | 3761 |
| 3448 | 3489 |
| 3449 | 3633 |
| 3450 | 3656 |
| 3451 | 3783 |
| 3452 | 3675 |
| 3453 | 3807 |
| 3454 | 3832 |
| 3455 | 3935 |
| 3456 | 2325 |
| 3457 | 2501 |
| 3458 | 2581 |
| 3459 | 2890 |
| 3460 | 2672 |
| 3461 | 2934 |
| 3462 | 2959 |
| 3463 | 3219 |
| 3464 | 2746 |
| 3465 | 2983 |
| 3466 | 3033 |
| 3467 | 3256 |
| 3468 | 3077 |
| 3469 | 3290 |
| 3470 | 3311 |
| 3471 | 3503 |
| 3472 | 2796 |
| 3473 | 3040 |
| 3474 | 3095 |
| 3475 | 3299 |
| 3476 | 3132 |
| 3477 | 3333 |
| 3478 | 3369 |
| 3479 | 3535 |
| 3480 | 3176 |
| 3481 | 3376 |
| 3482 | 3401 |
| 3483 | 3554 |
| 3484 | 3440 |
| 3485 | 3587 |
| 3486 | 3616 |
| 3487 | 3755 |
| 3488 | 2852 |
| 3489 | 3104 |

TABLE Z18-continued with a sequence length of 4096:

| Polarized channel sequence number | Reliability or reliability sequence number |
|---|---|
| 3490 | 3157 |
| 3491 | 3351 |
| 3492 | 3190 |
| 3493 | 3380 |
| 3494 | 3419 |
| 3495 | 3577 |
| 3496 | 3249 |
| 3497 | 3434 |
| 3498 | 3460 |
| 3499 | 3601 |
| 3500 | 3487 |
| 3501 | 3629 |
| 3502 | 3648 |
| 3503 | 3778 |
| 3504 | 3307 |
| 3505 | 3472 |
| 3506 | 3512 |
| 3507 | 3640 |
| 3508 | 3532 |
| 3509 | 3667 |
| 3510 | 3688 |
| 3511 | 3798 |
| 3512 | 3568 |
| 3513 | 3697 |
| 3514 | 3722 |
| 3515 | 3822 |
| 3516 | 3738 |
| 3517 | 3848 |
| 3518 | 3883 |
| 3519 | 3942 |
| 3520 | 2861 |
| 3521 | 3171 |
| 3522 | 3229 |
| 3523 | 3423 |
| 3524 | 3285 |
| 3525 | 3451 |
| 3526 | 3480 |
| 3527 | 3635 |
| 3528 | 3320 |
| 3529 | 3493 |
| 3530 | 3521 |
| 3531 | 3659 |
| 3532 | 3550 |
| 3533 | 3683 |
| 3534 | 3704 |
| 3535 | 3817 |
| 3536 | 3365 |
| 3537 | 3539 |
| 3538 | 3558 |
| 3539 | 3692 |
| 3540 | 3599 |
| 3541 | 3717 |
| 3542 | 3734 |
| 3543 | 3854 |
| 3544 | 3614 |
| 3545 | 3742 |
| 3546 | 3765 |
| 3547 | 3864 |
| 3548 | 3787 |
| 3549 | 3888 |
| 3550 | 3901 |
| 3551 | 3984 |
| 3552 | 3415 |
| 3553 | 3580 |
| 3554 | 3609 |
| 3555 | 3725 |
| 3556 | 3645 |
| 3557 | 3752 |
| 3558 | 3768 |
| 3559 | 3871 |
| 3560 | 3672 |
| 3561 | 3774 |
| 3562 | 3802 |
| 3563 | 3894 |
| 3564 | 3826 |

TABLE Z18-continued with a sequence length of 4096:

| Polarized channel sequence number | Reliability or reliability sequence number |
|---|---|
| 3565 | 3907 |
| 3566 | 3921 |
| 3567 | 3995 |
| 3568 | 3700 |
| 3569 | 3811 |
| 3570 | 3837 |
| 3571 | 3914 |
| 3572 | 3844 |
| 3573 | 3926 |
| 3574 | 3950 |
| 3575 | 4017 |
| 3576 | 3876 |
| 3577 | 3958 |
| 3578 | 3966 |
| 3579 | 4004 |
| 3580 | 3975 |
| 3581 | 4029 |
| 3582 | 4044 |
| 3583 | 4064 |
| 3584 | 1089 |
| 3585 | 1583 |
| 3586 | 1785 |
| 3587 | 2202 |
| 3588 | 1911 |
| 3589 | 2293 |
| 3590 | 2398 |
| 3591 | 2677 |
| 3592 | 2006 |
| 3593 | 2365 |
| 3594 | 2457 |
| 3595 | 2723 |
| 3596 | 2530 |
| 3597 | 2787 |
| 3598 | 2811 |
| 3599 | 3099 |
| 3600 | 2086 |
| 3601 | 2426 |
| 3602 | 2485 |
| 3603 | 2775 |
| 3604 | 2592 |
| 3605 | 2844 |
| 3606 | 2919 |
| 3607 | 3125 |
| 3608 | 2626 |
| 3609 | 2908 |
| 3610 | 2879 |
| 3611 | 3167 |
| 3612 | 2989 |
| 3613 | 3203 |
| 3614 | 3236 |
| 3615 | 3446 |
| 3616 | 2146 |
| 3617 | 2550 |
| 3618 | 2608 |
| 3619 | 2864 |
| 3620 | 2643 |
| 3621 | 2899 |
| 3622 | 2945 |
| 3623 | 3177 |
| 3624 | 2735 |
| 3625 | 2972 |
| 3626 | 3007 |
| 3627 | 3210 |
| 3628 | 3058 |
| 3629 | 3259 |
| 3630 | 3283 |
| 3631 | 3481 |
| 3632 | 2799 |
| 3633 | 3022 |
| 3634 | 3088 |
| 3635 | 3273 |
| 3636 | 3119 |
| 3637 | 3309 |
| 3638 | 3334 |
| 3639 | 3509 |

TABLE Z18-continued with a sequence length of 4096:

| Polarized channel sequence number | Reliability or reliability sequence number |
|---|---|
| 3640 | 3161 |
| 3641 | 3345 |
| 3642 | 3377 |
| 3643 | 3545 |
| 3644 | 3403 |
| 3645 | 3581 |
| 3646 | 3611 |
| 3647 | 3754 |
| 3648 | 2329 |
| 3649 | 2569 |
| 3650 | 2706 |
| 3651 | 2963 |
| 3652 | 2749 |
| 3653 | 2996 |
| 3654 | 3050 |
| 3655 | 3250 |
| 3656 | 2823 |
| 3657 | 3092 |
| 3658 | 3030 |
| 3659 | 3291 |
| 3660 | 3136 |
| 3661 | 3322 |
| 3662 | 3362 |
| 3663 | 3525 |
| 3664 | 2887 |
| 3665 | 3080 |
| 3666 | 3148 |
| 3667 | 3338 |
| 3668 | 3189 |
| 3669 | 3370 |
| 3670 | 3396 |
| 3671 | 3566 |
| 3672 | 3226 |
| 3673 | 3407 |
| 3674 | 3455 |
| 3675 | 3589 |
| 3676 | 3478 |
| 3677 | 3630 |
| 3678 | 3654 |
| 3679 | 3794 |
| 3680 | 2956 |
| 3681 | 3173 |
| 3682 | 3220 |
| 3683 | 3392 |
| 3684 | 3269 |
| 3685 | 3424 |
| 3686 | 3466 |
| 3687 | 3619 |
| 3688 | 3297 |
| 3689 | 3470 |
| 3690 | 3506 |
| 3691 | 3638 |
| 3692 | 3527 |
| 3693 | 3670 |
| 3694 | 3695 |
| 3695 | 3809 |
| 3696 | 3349 |
| 3697 | 3517 |
| 3698 | 3557 |
| 3699 | 3678 |
| 3700 | 3573 |
| 3701 | 3699 |
| 3702 | 3723 |
| 3703 | 3834 |
| 3704 | 3603 |
| 3705 | 3731 |
| 3706 | 3746 |
| 3707 | 3855 |
| 3708 | 3767 |
| 3709 | 3872 |
| 3710 | 3892 |
| 3711 | 3972 |
| 3712 | 2505 |
| 3713 | 2692 |
| 3714 | 2761 |

TABLE Z18-continued with a sequence length of 4096:

| Polarized channel sequence number | Reliability or reliability sequence number |
|---|---|
| 3715 | 3073 |
| 3716 | 2855 |
| 3717 | 3107 |
| 3718 | 3129 |
| 3719 | 3353 |
| 3720 | 2928 |
| 3721 | 3144 |
| 3722 | 3196 |
| 3723 | 3385 |
| 3724 | 3232 |
| 3725 | 3420 |
| 3726 | 3439 |
| 3727 | 3618 |
| 3728 | 2980 |
| 3729 | 3199 |
| 3730 | 3246 |
| 3731 | 3431 |
| 3732 | 3279 |
| 3733 | 3459 |
| 3734 | 3492 |
| 3735 | 3646 |
| 3736 | 3316 |
| 3737 | 3498 |
| 3738 | 3519 |
| 3739 | 3662 |
| 3740 | 3559 |
| 3741 | 3691 |
| 3742 | 3718 |
| 3743 | 3830 |
| 3744 | 3035 |
| 3745 | 3254 |
| 3746 | 3301 |
| 3747 | 3471 |
| 3748 | 3330 |
| 3749 | 3501 |
| 3750 | 3537 |
| 3751 | 3682 |
| 3752 | 3381 |
| 3753 | 3552 |
| 3754 | 3578 |
| 3755 | 3706 |
| 3756 | 3600 |
| 3757 | 3727 |
| 3758 | 3743 |
| 3759 | 3850 |
| 3760 | 3435 |
| 3761 | 3586 |
| 3762 | 3624 |
| 3763 | 3736 |
| 3764 | 3641 |
| 3765 | 3758 |
| 3766 | 3775 |
| 3767 | 3862 |
| 3768 | 3673 |
| 3769 | 3782 |
| 3770 | 3801 |
| 3771 | 3884 |
| 3772 | 3818 |
| 3773 | 3905 |
| 3774 | 3931 |
| 3775 | 3977 |
| 3776 | 3043 |
| 3777 | 3312 |
| 3778 | 3366 |
| 3779 | 3543 |
| 3780 | 3411 |
| 3781 | 3567 |
| 3782 | 3594 |
| 3783 | 3735 |
| 3784 | 3449 |
| 3785 | 3608 |
| 3786 | 3631 |
| 3787 | 3749 |
| 3788 | 3657 |
| 3789 | 3772 |

TABLE Z18-continued with a sequence length of 4096:

| Polarized channel sequence number | Reliability or reliability sequence number |
|---|---|
| 3790 | 3789 |
| 3791 | 3879 |
| 3792 | 3488 |
| 3793 | 3649 |
| 3794 | 3666 |
| 3795 | 3779 |
| 3796 | 3701 |
| 3797 | 3799 |
| 3798 | 3814 |
| 3799 | 3910 |
| 3800 | 3715 |
| 3801 | 3821 |
| 3802 | 3838 |
| 3803 | 3916 |
| 3804 | 3858 |
| 3805 | 3934 |
| 3806 | 3945 |
| 3807 | 4009 |
| 3808 | 3534 |
| 3809 | 3687 |
| 3810 | 3710 |
| 3811 | 3806 |
| 3812 | 3739 |
| 3813 | 3825 |
| 3814 | 3841 |
| 3815 | 3920 |
| 3816 | 3762 |
| 3817 | 3846 |
| 3818 | 3867 |
| 3819 | 3940 |
| 3820 | 3889 |
| 3821 | 3949 |
| 3822 | 3960 |
| 3823 | 4019 |
| 3824 | 3786 |
| 3825 | 3875 |
| 3826 | 3898 |
| 3827 | 3955 |
| 3828 | 3902 |
| 3829 | 3967 |
| 3830 | 3983 |
| 3831 | 4035 |
| 3832 | 3924 |
| 3833 | 3989 |
| 3834 | 3997 |
| 3835 | 4026 |
| 3836 | 4003 |
| 3837 | 4045 |
| 3838 | 4057 |
| 3839 | 4071 |
| 3840 | 2250 |
| 3841 | 2662 |
| 3842 | 2832 |
| 3843 | 3155 |
| 3844 | 2936 |
| 3845 | 3184 |
| 3846 | 3264 |
| 3847 | 3452 |
| 3848 | 3015 |
| 3849 | 3240 |
| 3850 | 3305 |
| 3851 | 3484 |
| 3852 | 3359 |
| 3853 | 3531 |
| 3854 | 3548 |
| 3855 | 3713 |
| 3856 | 3065 |
| 3857 | 3287 |
| 3858 | 3326 |
| 3859 | 3522 |
| 3860 | 3399 |
| 3861 | 3562 |
| 3862 | 3610 |
| 3863 | 3724 |
| 3864 | 3428 |

TABLE Z18-continued with a sequence length of 4096:

| Polarized channel sequence number | Reliability or reliability sequence number |
|---|---|
| 3865 | 3604 |
| 3866 | 3585 |
| 3867 | 3753 |
| 3868 | 3650 |
| 3869 | 3773 |
| 3870 | 3791 |
| 3871 | 3893 |
| 3872 | 3111 |
| 3873 | 3374 |
| 3874 | 3414 |
| 3875 | 3575 |
| 3876 | 3442 |
| 3877 | 3596 |
| 3878 | 3623 |
| 3879 | 3759 |
| 3880 | 3495 |
| 3881 | 3639 |
| 3882 | 3661 |
| 3883 | 3777 |
| 3884 | 3689 |
| 3885 | 3804 |
| 3886 | 3816 |
| 3887 | 3911 |
| 3888 | 3540 |
| 3889 | 3665 |
| 3890 | 3705 |
| 3891 | 3810 |
| 3892 | 3720 |
| 3893 | 3829 |
| 3894 | 3842 |
| 3895 | 3923 |
| 3896 | 3748 |
| 3897 | 3847 |
| 3898 | 3863 |
| 3899 | 3938 |
| 3900 | 3874 |
| 3901 | 3954 |
| 3902 | 3965 |
| 3903 | 4022 |
| 3904 | 3215 |
| 3905 | 3388 |
| 3906 | 3475 |
| 3907 | 3634 |
| 3908 | 3505 |
| 3909 | 3655 |
| 3910 | 3684 |
| 3911 | 3796 |
| 3912 | 3553 |
| 3913 | 3709 |
| 3914 | 3671 |
| 3915 | 3820 |
| 3916 | 3733 |
| 3917 | 3836 |
| 3918 | 3856 |
| 3919 | 3930 |
| 3920 | 3592 |
| 3921 | 3698 |
| 3922 | 3745 |
| 3923 | 3845 |
| 3924 | 3764 |
| 3925 | 3861 |
| 3926 | 3873 |
| 3927 | 3946 |
| 3928 | 3785 |
| 3929 | 3878 |
| 3930 | 3899 |
| 3931 | 3957 |
| 3932 | 3909 |
| 3933 | 3973 |
| 3934 | 3982 |
| 3935 | 4036 |
| 3936 | 3627 |
| 3937 | 3756 |
| 3938 | 3780 |
| 3939 | 3870 |

TABLE Z18-continued with a sequence length of 4096:

| Polarized channel sequence number | Reliability or reliability sequence number |
|---|---|
| 3940 | 3808 |
| 3941 | 3885 |
| 3942 | 3903 |
| 3943 | 3970 |
| 3944 | 3823 |
| 3945 | 3904 |
| 3946 | 3922 |
| 3947 | 3976 |
| 3948 | 3932 |
| 3949 | 3988 |
| 3950 | 3999 |
| 3951 | 4040 |
| 3952 | 3849 |
| 3953 | 3925 |
| 3954 | 3943 |
| 3955 | 3992 |
| 3956 | 3952 |
| 3957 | 4000 |
| 3958 | 4008 |
| 3959 | 4048 |
| 3960 | 3962 |
| 3961 | 4012 |
| 3962 | 4020 |
| 3963 | 4054 |
| 3964 | 4025 |
| 3965 | 4060 |
| 3966 | 4066 |
| 3967 | 4083 |
| 3968 | 3341 |
| 3969 | 3463 |
| 3970 | 3513 |
| 3971 | 3693 |
| 3972 | 3571 |
| 3973 | 3716 |
| 3974 | 3728 |
| 3975 | 3852 |
| 3976 | 3615 |
| 3977 | 3741 |
| 3978 | 3766 |
| 3979 | 3868 |
| 3980 | 3788 |
| 3981 | 3882 |
| 3982 | 3891 |
| 3983 | 3969 |
| 3984 | 3643 |
| 3985 | 3771 |
| 3986 | 3795 |
| 3987 | 3886 |
| 3988 | 3813 |
| 3989 | 3900 |
| 3990 | 3915 |
| 3991 | 3980 |
| 3992 | 3833 |
| 3993 | 3918 |
| 3994 | 3928 |
| 3995 | 3986 |
| 3996 | 3944 |
| 3997 | 3998 |
| 3998 | 4007 |
| 3999 | 4047 |
| 4000 | 3677 |
| 4001 | 3800 |
| 4002 | 3824 |
| 4003 | 3908 |
| 4004 | 3839 |
| 4005 | 3919 |
| 4006 | 3936 |
| 4007 | 3993 |
| 4008 | 3865 |
| 4009 | 3941 |
| 4010 | 3953 |
| 4011 | 4002 |
| 4012 | 3961 |
| 4013 | 4011 |
| 4014 | 4018 |

TABLE Z18-continued with a sequence length of 4096:

| Polarized channel sequence number | Reliability or reliability sequence number |
|---|---|
| 4015 | 4053 |
| 4016 | 3890 |
| 4017 | 3956 |
| 4018 | 3971 |
| 4019 | 4014 |
| 4020 | 3979 |
| 4021 | 4023 |
| 4022 | 4028 |
| 4023 | 4058 |
| 4024 | 3991 |
| 4025 | 4032 |
| 4026 | 4038 |
| 4027 | 4063 |
| 4028 | 4042 |
| 4029 | 4069 |
| 4030 | 4075 |
| 4031 | 4084 |
| 4032 | 3681 |
| 4033 | 3831 |
| 4034 | 3857 |
| 4035 | 3937 |
| 4036 | 3880 |
| 4037 | 3948 |
| 4038 | 3959 |
| 4039 | 4013 |
| 4040 | 3895 |
| 4041 | 3963 |
| 4042 | 3974 |
| 4043 | 4021 |
| 4044 | 3985 |
| 4045 | 4027 |
| 4046 | 4034 |
| 4047 | 4062 |
| 4048 | 3913 |
| 4049 | 3981 |
| 4050 | 3987 |
| 4051 | 4030 |
| 4052 | 4001 |
| 4053 | 4037 |
| 4054 | 4041 |
| 4055 | 4070 |
| 4056 | 4006 |
| 4057 | 4043 |
| 4058 | 4050 |
| 4059 | 4072 |
| 4060 | 4055 |
| 4061 | 4076 |
| 4062 | 4078 |
| 4063 | 4089 |
| 4064 | 3933 |
| 4065 | 3996 |
| 4066 | 4005 |
| 4067 | 4039 |
| 4068 | 4015 |
| 4069 | 4046 |
| 4070 | 4051 |
| 4071 | 4073 |
| 4072 | 4024 |
| 4073 | 4052 |
| 4074 | 4059 |
| 4075 | 4077 |
| 4076 | 4065 |
| 4077 | 4079 |
| 4078 | 4081 |
| 4079 | 4090 |
| 4080 | 4033 |
| 4081 | 4061 |
| 4082 | 4067 |
| 4083 | 4080 |
| 4084 | 4068 |
| 4085 | 4082 |
| 4086 | 4085 |
| 4087 | 4092 |
| 4088 | 4074 |
| 4089 | 4086 |
| 4090 | 4087 |
| 4091 | 4091 |
| 4092 | 4088 |
| 4093 | 4093 |
| 4094 | 4094 |
| 4095 | 4095 |

Sequence Z19, with a sequence length of 2048:

[0, 1, 2, 7, 3, 11, 14, 27, 4, 13, 16, 30, 19, 36, 38, 75, 5, 15, 17, 35, 22, 42, 49, 80, 24, 48, 4 5, 88, 58, 96, 104, 168, 6, 20, 23, 44, 25, 47, 53, 91, 31, 56, 60, 97, 69, 110, 116, 184, 37, 62, 73, 113, 79, 123, 131, 196, 87, 135, 145, 213, 154, 231, 250, 359, 12, 21, 29, 55, 32, 59, 68, 107, 40, 74, 63, 119, 82, 127, 139, 203, 46, 72, 85, 132, 93, 143, 152, 223, 102, 155, 173, 236, 181, 260, 277, 399, 54, 89, 101, 150, 112, 160, 177, 254, 120, 178, 195, 265, 204, 287, 307, 416, 136, 198, 219, 294, 2 28, 311, 330, 449, 244, 336, 351, 475, 372, 501, 536, 700, 18, 28, 34, 71, 43, 76, 81, 137, 50, 84, 94, 147, 103, 159, 166, 253, 57, 95, 106, 163, 115, 174, 187, 272, 125, 190, 199, 282, 220, 304, 327, 442, 65, 108, 121, 179, 130, 191, 208, 298, 146, 215, 230, 316, 242, 333, 348, 471, 165, 235, 258, 343, 268, 362, 380, 487, 291, 387, 409, 521, 427, 560, 607, 714, 67, 124, 141, 212, 157, 224, 239, 340, 169, 246, 262, 355, 279, 376, 395, 513, 186, 273, 286, 383, 312, 405, 423, 567, 323, 432, 45 3, 578, 482, 614, 637, 816, 207, 300, 319, 413, 344, 437, 457, 587, 366, 465, 494, 625, 528, 645, 6 71, 847, 391, 509, 543, 657, 552, 686, 732, 918, 596, 750, 769, 881, 794, 973, 1039, 1149, 8, 26, 4 1, 86, 52, 92, 111, 171, 61, 105, 122, 185, 138, 206, 214, 321, 70, 17, 129, 202, 153, 221, 249, 33 2, 161, 245, 234, 356, 274, 377, 396, 539, 77, 144, 158, 229, 167, 240, 255, 364, 189, 267, 281, 38 1, 303, 411, 425, 570, 210, 285, 315, 419, 328, 440, 459, 593, 354, 466, 489, 622, 506, 654, 683, 8 61, 98, 148, 180, 264, 193, 278, 299, 402, 218, 317, 290, 429, 339, 450, 478, 604, 238, 309, 350, 4 62, 367, 485, 503, 639, 389, 510, 546, 665, 566, 703, 729, 923, 259, 360, 385, 499, 415, 522, 554, 694, 433, 557, 590, 711, 610, 746, 777, 948, 469, 598, 631, 758, 648, 782, 811, 993, 677, 825, 85 2, 1025, 876, 1061, 1102, 1300, 133, 175, 197, 306, 226, 324, 335, 473, 251, 346, 370, 497, 392, 518, 533, 690, 270, 373, 401, 525, 422, 549, 575, 721, 446, 581, 601, 740, 634, 774, 806, 985, 29 2, 406, 436, 563, 455, 584, 616, 763, 491, 628, 651, 789, 674, 819, 842, 1019, 531, 662, 697, 833, 718, 867, 892, 1047, 754, 903, 936, 1085, 959, 1130, 1192, 1316, 296, 444, 479, 619, 516, 642, 6 68, 828, 540, 680, 707, 856, 735, 886, 912, 1077, 573, 724, 743, 897, 786, 931, 954, 1138, 802, 9 65, 999, 1158, 1031, 1201, 1227, 1423, 613, 766, 797, 942, 838, 979, 1005, 1169, 872, 1013, 10 55, 1216, 1094, 1240, 1269, 1452, 908, 1069, 1110, 1254, 1121, 1282, 1335, 1521, 1181, 1355, 1375, 1482, 1398, 1567, 1626, 1716, 9, 33, 51, 109, 66, 126, 149, 227, 78, 142, 164, 243, 183, 26 6, 275, 404, 90, 156, 170, 261, 201, 288, 318, 418, 211, 313, 301, 441, 349, 463, 483, 638, 100, 18 8, 205, 297, 216, 310, 329, 447, 247, 341, 357, 467, 382, 498, 514, 670, 271, 365, 397, 507, 414, 5 32, 550, 696, 438, 559, 583, 730, 603, 767, 801, 983, 134, 194, 237, 338, 252, 352, 378, 493, 280, 400, 369, 520, 424, 542, 571, 710, 305, 394, 431, 553, 454, 577, 597, 751, 477, 606, 647, 776, 66 7, 821, 849, 1041, 334, 445, 474, 594, 505, 620, 656, 809, 524, 659, 693, 830, 713, 868, 901, 106 5, 561, 702, 742, 879, 759, 907, 938, 1106, 791, 950, 971, 1141, 1003, 1172, 1211, 1389, 176, 23 2, 257, 390, 293, 408, 420, 564, 322, 428, 458, 588, 481, 617, 632, 808, 345, 461, 490, 626, 511, 6 50, 679, 840, 538, 685, 705, 860, 745, 895, 933, 1098, 371, 495, 527, 660, 547, 688, 722, 885, 58 5, 737, 764, 916, 787, 944, 967, 1134, 629, 772, 814, 958, 835, 989, 1015, 1154, 874, 1024, 1053, 1194, 1079, 1237, 1290, 1404, 375, 535, 574, 727, 609, 753, 781, 956, 641, 796, 823, 977, 854, 1009, 1035, 1185, 676, 844, 865, 1021, 910, 1049, 1073, 1247, 927, 1083, 1113, 1259, 1147, 12 98, 1324, 1499, 719, 890, 921, 1059, 961, 1092, 1117, 1267, 995, 1125, 1163, 1311, 1204, 1332, 1360, 1528, 1029, 1178, 1220, 1346, 1230, 1378, 1420, 1587, 1277, 1439, 1458, 1555, 1478, 1 630, 1679, 1758, 118, 222, 284, 434, 326, 451, 502, 644, 361, 486, 529, 673, 568, 716, 734, 925, 386, 517, 545, 708, 600, 748, 799, 940, 623, 792, 771, 981, 845, 1011, 1037, 1213, 410, 580, 612, 761, 635, 784, 813, 991, 682, 831, 858, 1017, 894, 1057, 1075, 1249, 726, 863, 914, 1067, 935, 1096, 1119, 1274, 975, 1128, 1156, 1308, 1176, 1344, 1372, 1539, 470, 591, 664, 826, 691, 851, 888, 1045, 738, 920, 870, 1081, 952, 1108, 1143, 1287, 779, 905, 969, 1123, 997, 1152, 1174, 13 27, 1027, 1183, 1223, 1352, 1244, 1392, 1417, 1591, 818, 987, 1023, 1167, 1063, 1197, 1232, 1 384, 1088, 1235, 1272, 1401, 1292, 1436, 1465, 1608, 1132, 1280, 1319, 1445, 1338, 1468, 14 96, 1644, 1366, 1506, 1532, 1668, 1551, 1694, 1728, 1847, 556, 653, 699, 899, 756, 929, 946, 1 136, 804, 963, 1001, 1165, 1033, 1190, 1208, 1381, 837, 1007, 1043, 1199, 1071, 1225, 1257, 1 411, 1104, 1262, 1285, 1429, 1322, 1461, 1492, 1640, 877, 1051, 1090, 1242, 1115, 1264, 1303, 1448, 1160, 1314, 1341, 1475, 1363, 1503, 1524, 1664, 1206, 1349, 1386, 1513, 1408, 1543, 1 563, 1684, 1442, 1575, 1600, 1710, 1617, 1745, 1784, 1856, 883, 1100, 1145, 1306, 1188, 133 0, 1358, 1510, 1218, 1369, 1395, 1536, 1426, 1559, 1583, 1705, 1252, 1414, 1432, 1571, 1472, 1595, 1612, 1752, 1489, 1621, 1649, 1764, 1673, 1792, 1806, 1907, 1295, 1455, 1485, 1604, 1 517, 1635, 1654, 1771, 1547, 1659, 1689, 1799, 1722, 1814, 1830, 1920, 1579, 1700, 1733, 18 22, 1739, 1838, 1865, 1948, 1778, 1875, 1885, 1933, 1896, 1964, 1984, 2008, 10, 39, 64, 140, 8 3, 172, 200, 295, 99, 192, 217, 314, 241, 347, 358, 512, 114, 209, 225, 342, 263, 374, 407, 530, 27 6, 403, 388, 555, 448, 582, 605, 773, 128, 248, 269, 384, 283, 398, 426, 565, 320, 439, 456, 586, 4 88, 624, 640, 807, 353, 464, 504, 633, 526, 661, 681, 834, 551, 692, 717, 869, 739, 904, 939, 112 2, 182, 256, 308, 435, 325, 452, 484, 615, 363, 508, 468, 649, 537, 672, 704, 848, 393, 500, 544, 6 84, 572, 712, 733, 889, 599, 741, 783, 913, 803, 957, 986, 1180, 430, 558, 595, 731, 630, 755, 79 3, 947, 652, 795, 832, 966, 850, 1004, 1040, 1205, 695, 839, 880, 1016, 898, 1046, 1078, 1248, 9 28, 1087, 1111, 1281, 1142, 1312, 1353, 1516, 233, 302, 337, 496, 379, 515, 534, 698, 412, 541, 576, 723, 602, 752, 768, 945, 443, 579, 611, 760, 636, 785, 815, 978, 666, 822, 841, 996, 882, 10 34, 1072, 1239, 472, 618, 655, 798, 678, 824, 859, 1022, 720, 873, 902, 1054, 924, 1082, 1105, 1 276, 765, 911, 953, 1097, 972, 1127, 1153, 1296, 1010, 1164, 1195, 1336, 1219, 1379, 1428, 15 29, 480, 663, 706, 866, 747, 891, 919, 1093, 775, 932, 962, 1116, 990, 1148, 1175, 1326, 812, 98 0, 1002, 1159, 1048, 1189, 1214, 1387, 1066, 1226, 1253, 1399, 1289, 1435, 1457, 1611, 857, 1 028, 1060, 1200, 1099, 1233, 1258, 1407, 1133, 1268, 1304, 1446, 1343, 1466, 1490, 1634, 11 70, 1321, 1361, 1477, 1370, 1504, 1544, 1683, 1416, 1558, 1574, 1658, 1594, 1719, 1760, 182 1, 151, 289, 368, 548, 421, 569, 627, 780, 460, 608, 658, 810, 701, 855, 871, 1062, 492, 643, 675, 846, 736, 884, 937, 1080, 757, 930, 909, 1118, 982, 1150, 1177, 1356, 519, 715, 749, 900, 770, 9 22, 949, 1129, 820, 970, 994, 1155, 1032, 1198, 1217, 1390, 862, 1000, 1052, 1209, 1074, 1236, 1261, 1413, 1114, 1270, 1297, 1443, 1318, 1474, 1501, 1645, 589, 725, 800, 964, 827, 988, 10 26, 1186, 878, 1056, 1008, 1222, 1091, 1250, 1284, 1425, 917, 1042, 1109, 1265, 1135, 1293, 1 315, 1460, 1166, 1323, 1364, 1484, 1385, 1519, 1541, 1687, 955, 1124, 1161, 1310, 1203, 133 7, 1373, 1511, 1228, 1376, 1410, 1526, 1431, 1556, 1581, 1703, 1273, 1419, 1451, 1565, 1469, 1585, 1607, 1731, 1495, 1618, 1638, 1751, 1655, 1773, 1796, 1892, 687, 788, 836, 1038, 893, 1 068, 1086, 1278, 941, 1103, 1139, 1307, 1171, 1333, 1350, 1507, 974, 1144, 1184, 1340, 1212, 1367, 1396, 1534, 1245, 1402, 1422, 1550, 1454, 1578, 1603, 1726, 1012, 1191, 1231, 1382, 1 256, 1405, 1437, 1569, 1301, 1449, 1471, 1590, 1493, 1614, 1631, 1747, 1347, 1481, 1514, 16 24, 1531, 1648, 1666, 1765, 1562, 1674, 1696, 1787, 1711, 1811, 1843, 1899, 1018, 1241, 128 6, 1440, 1329, 1463, 1487, 1620, 1357, 1498, 1522, 1641, 1546, 1662, 1680, 1782, 1393, 1537, 1553, 1670, 1588, 1692, 1707, 1816, 1601, 1714, 1735, 1826, 1755, 1848, 1860, 1939, 1434, 1 572, 1597, 1699, 1628, 1723, 1738, 1832, 1652, 1743, 1769, 1854, 1791, 1866, 1879, 1949, 16 77, 1777, 1801, 1872, 1807, 1884, 1906, 1970, 1837, 1914, 1922, 1958, 1930, 1982, 1997, 201 6, 162, 331, 417, 621, 476, 669, 728, 896, 523, 709, 762, 926, 805, 968, 984, 1187, 562, 744, 778, 960, 843, 1006, 1058, 1207, 864, 1050, 1030, 1238, 1107, 1266, 1291, 1459, 592, 817, 853, 102 0, 875, 1044, 1076, 1246, 934, 1095, 1120, 1271, 1157, 1309, 1328, 1488, 976, 1131, 1179, 132 0, 1202, 1348, 1368, 1512, 1234, 1377, 1403, 1542, 1424, 1573, 1599, 1725, 689, 829, 915, 108 9, 943, 1112, 1151, 1302, 992, 1182, 1137, 1334, 1215, 1359, 1391, 1525, 1036, 1173, 1224, 13 71, 1255, 1397, 1418, 1560, 1283, 1427, 1467, 1580, 1486, 1615, 1636, 1761, 1084, 1243, 127 9, 1415, 1317, 1441, 1476, 1606, 1339, 1479, 1509, 1622, 1527, 1650, 1672, 1775, 1380, 1518, 1552, 1657, 1566, 1676, 1697, 1798, 1592, 1704, 1718, 1817, 1737, 1833, 1852, 1927, 790, 90 6, 951, 1168, 1014, 1193, 1210, 1383, 1064, 1221, 1260, 1409, 1288, 1438, 1453, 1605, 1101, 1 263, 1299, 1447, 1325, 1470, 1497, 1629, 1354, 1502, 1520, 1643, 1554, 1669, 1693, 1794, 11 40, 1305, 1342, 1480, 1365, 1505, 1535, 1661, 1406, 1548, 1570, 1682, 1589, 1701, 1715, 181 3, 1450, 1577, 1610, 1709, 1625, 1729, 1744, 1824, 1653, 1750, 1768, 1844, 1783, 1864, 1888, 1932, 1146, 1351, 1394, 1540, 1430, 1561, 1584, 1708, 1462, 1596, 1616, 1721, 1639, 1741, 1 757, 1840, 1494, 1632, 1647, 1748, 1678, 1766, 1780, 1869, 1690, 1786, 1802, 1874, 1820, 18 91, 1902, 1963, 1533, 1665, 1686, 1772, 1712, 1790, 1804, 1878, 1732, 1809, 1828, 1897, 184 9, 1905, 1916, 1972, 1754, 1836, 1857, 1911, 1861, 1923, 1938, 1988, 1882, 1944, 1951, 1979, 1957, 1998, 2009, 2023, 646, 887, 998, 1229, 1070, 1251, 1313, 1464, 1126, 1294, 1345, 1491, 1388, 1530, 1545, 1688, 1162, 1331, 1362, 1523, 1421, 1557, 1598, 1698, 1444, 1593, 1576, 1 724, 1633, 1742, 1759, 1853, 1196, 1400, 1433, 1568, 1456, 1586, 1609, 1730, 1500, 1623, 16 42, 1746, 1667, 1770, 1781, 1870, 1538, 1646, 1681, 1776, 1695, 1793, 1805, 1881, 1720, 181 0, 1825, 1895, 1835, 1910, 1921, 1975, 1275, 1412, 1483, 1619, 1508, 1637, 1663, 1763, 1549, 1685, 1651, 1785, 1706, 1800, 1818, 1887, 1582, 1675, 1717, 1808, 1734, 1823, 1834, 1903, 1 753, 1839, 1858, 1913, 1868, 1928, 1937, 1989, 1613, 1727, 1749, 1831, 1774, 1845, 1862, 19 25, 1788, 1863, 1880, 1931, 1889, 1943, 1953, 1993, 1812, 1883, 1900, 1946, 1908, 1954, 196 2, 2001, 1918, 1966, 1973, 2006, 1978, 2012, 2018, 2035, 1374, 1473, 1515, 1671, 1564, 1691, 1702, 1815, 1602, 1713, 1736, 1829, 1756, 1842, 1851, 1924, 1627, 1740, 1762, 1846, 1779, 1 859, 1873, 1935, 1797, 1876, 1886, 1941, 1901, 1952, 1961, 2000, 1656, 1767, 1789, 1867, 18 03, 1877, 1893, 1947, 1827, 1898, 1909, 1956, 1917, 1965, 1971, 2005, 1850, 1912, 1926, 196 8, 1934, 1976, 1981, 2010, 1945, 1985, 1991, 2015, 1995, 2021, 2027, 2036, 1660, 1795, 1819, 1894, 1841, 1904, 1915, 1967, 1855, 1919, 1929, 1974, 1940, 1980, 1987, 2014, 1871, 1936, 1 942, 1983, 1955, 1990, 1994, 2022, 1960, 1996, 2002, 2024, 2007, 2028, 2030, 2041, 1890, 19 50, 1959, 1992, 1969, 1999, 2003, 2025, 1977, 2004, 2011, 2029, 2017, 2031, 2033, 2042, 198 6, 2013, 2019, 2032, 2020, 2034, 2037, 2044, 2026, 2038, 2039, 2043, 2040, 2045, 2046, 2047]

TABLE Z19 with a sequence length of 2048:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 11 |
| 6 | 14 |
| 7 | 27 |
| 8 | 4 |
| 9 | 13 |
| 10 | 16 |
| 11 | 30 |
| 12 | 19 |
| 13 | 36 |
| 14 | 38 |
| 15 | 75 |
| 16 | 5 |
| 17 | 15 |
| 18 | 17 |
| 19 | 35 |
| 20 | 22 |
| 21 | 42 |
| 22 | 49 |
| 23 | 80 |
| 24 | 24 |
| 25 | 48 |
| 26 | 45 |
| 27 | 88 |
| 28 | 58 |
| 29 | 96 |
| 30 | 104 |
| 31 | 168 |
| 32 | 6 |
| 33 | 20 |
| 34 | 23 |
| 35 | 44 |
| 36 | 25 |
| 37 | 47 |
| 38 | 53 |
| 39 | 91 |
| 40 | 31 |
| 41 | 56 |
| 42 | 60 |
| 43 | 97 |

TABLE Z19-continued with a sequence length of 2048:

| Polarized channel sequence number | Reliability or reliability sequence number |
|---|---|
| 44 | 69 |
| 45 | 110 |
| 46 | 116 |
| 47 | 184 |
| 48 | 37 |
| 49 | 62 |
| 50 | 73 |
| 51 | 113 |
| 52 | 79 |
| 53 | 123 |
| 54 | 131 |
| 55 | 196 |
| 56 | 87 |
| 57 | 135 |
| 58 | 145 |
| 59 | 213 |
| 60 | 154 |
| 61 | 231 |
| 62 | 250 |
| 63 | 359 |
| 64 | 12 |
| 65 | 21 |
| 66 | 29 |
| 67 | 55 |
| 68 | 32 |
| 69 | 59 |
| 70 | 68 |
| 71 | 107 |
| 72 | 40 |
| 73 | 74 |
| 74 | 63 |
| 75 | 119 |
| 76 | 82 |
| 77 | 127 |
| 78 | 139 |
| 79 | 203 |
| 80 | 46 |
| 81 | 72 |
| 82 | 85 |
| 83 | 132 |
| 84 | 93 |
| 85 | 143 |
| 86 | 152 |
| 87 | 223 |
| 88 | 102 |
| 89 | 155 |
| 90 | 173 |
| 91 | 236 |
| 92 | 181 |
| 93 | 260 |
| 94 | 277 |
| 95 | 399 |
| 96 | 54 |
| 97 | 89 |
| 98 | 101 |
| 99 | 150 |
| 100 | 112 |
| 101 | 160 |
| 102 | 177 |
| 103 | 254 |
| 104 | 120 |
| 105 | 178 |
| 106 | 195 |
| 107 | 265 |
| 108 | 204 |
| 109 | 287 |
| 110 | 307 |
| 111 | 416 |
| 112 | 136 |
| 113 | 198 |
| 114 | 219 |
| 115 | 294 |
| 116 | 228 |
| 117 | 311 |
| 118 | 330 |

TABLE Z19-continued

| with a sequence length of 2048: | |
|---|---|
| Polarized channel sequence number | Reliability or reliability sequence number |
| 119 | 449 |
| 120 | 244 |
| 121 | 336 |
| 122 | 351 |
| 123 | 475 |
| 124 | 372 |
| 125 | 501 |
| 126 | 536 |
| 127 | 700 |
| 128 | 18 |
| 129 | 28 |
| 130 | 34 |
| 131 | 71 |
| 132 | 43 |
| 133 | 76 |
| 134 | 81 |
| 135 | 137 |
| 136 | 50 |
| 137 | 84 |
| 138 | 94 |
| 139 | 147 |
| 140 | 103 |
| 141 | 159 |
| 142 | 166 |
| 143 | 253 |
| 144 | 57 |
| 145 | 95 |
| 146 | 106 |
| 147 | 163 |
| 148 | 115 |
| 149 | 174 |
| 150 | 187 |
| 151 | 272 |
| 152 | 125 |
| 153 | 190 |
| 154 | 199 |
| 155 | 282 |
| 156 | 220 |
| 157 | 304 |
| 158 | 327 |
| 159 | 442 |
| 160 | 65 |
| 161 | 108 |
| 162 | 121 |
| 163 | 179 |
| 164 | 130 |
| 165 | 191 |
| 166 | 208 |
| 167 | 298 |
| 168 | 146 |
| 169 | 215 |
| 170 | 230 |
| 171 | 316 |
| 172 | 242 |
| 173 | 333 |
| 174 | 348 |
| 175 | 471 |
| 176 | 165 |
| 177 | 235 |
| 178 | 258 |
| 179 | 343 |
| 180 | 268 |
| 181 | 362 |
| 182 | 380 |
| 183 | 487 |
| 184 | 291 |
| 185 | 387 |
| 186 | 409 |
| 187 | 521 |
| 188 | 427 |
| 189 | 560 |
| 190 | 607 |
| 191 | 714 |
| 192 | 67 |
| 193 | 124 |

TABLE Z19-continued

| with a sequence length of 2048: | |
|---|---|
| Polarized channel sequence number | Reliability or reliability sequence number |
| 194 | 141 |
| 195 | 212 |
| 196 | 157 |
| 197 | 224 |
| 198 | 239 |
| 199 | 340 |
| 200 | 169 |
| 201 | 246 |
| 202 | 262 |
| 203 | 355 |
| 204 | 279 |
| 205 | 376 |
| 206 | 395 |
| 207 | 513 |
| 208 | 186 |
| 209 | 273 |
| 210 | 286 |
| 211 | 383 |
| 212 | 312 |
| 213 | 405 |
| 214 | 423 |
| 215 | 567 |
| 216 | 323 |
| 217 | 432 |
| 218 | 453 |
| 219 | 578 |
| 220 | 482 |
| 221 | 614 |
| 222 | 637 |
| 223 | 816 |
| 224 | 207 |
| 225 | 300 |
| 226 | 319 |
| 227 | 413 |
| 228 | 344 |
| 229 | 437 |
| 230 | 457 |
| 231 | 587 |
| 232 | 366 |
| 233 | 465 |
| 234 | 494 |
| 235 | 625 |
| 236 | 528 |
| 237 | 645 |
| 238 | 671 |
| 239 | 847 |
| 240 | 391 |
| 241 | 509 |
| 242 | 543 |
| 243 | 657 |
| 244 | 552 |
| 245 | 686 |
| 246 | 732 |
| 247 | 918 |
| 248 | 596 |
| 249 | 750 |
| 250 | 769 |
| 251 | 881 |
| 252 | 794 |
| 253 | 973 |
| 254 | 1039 |
| 255 | 1149 |
| 256 | 8 |
| 257 | 26 |
| 258 | 41 |
| 259 | 86 |
| 260 | 52 |
| 261 | 92 |
| 262 | 111 |
| 263 | 171 |
| 264 | 61 |
| 265 | 105 |
| 266 | 122 |
| 267 | 185 |
| 268 | 138 |

TABLE Z19-continued with a sequence length of 2048:

| Polarized channel sequence number | Reliability or reliability sequence number |
|---|---|
| 269 | 206 |
| 270 | 214 |
| 271 | 321 |
| 272 | 70 |
| 273 | 117 |
| 274 | 129 |
| 275 | 202 |
| 276 | 153 |
| 277 | 221 |
| 278 | 249 |
| 279 | 332 |
| 280 | 161 |
| 281 | 245 |
| 282 | 234 |
| 283 | 356 |
| 284 | 274 |
| 285 | 377 |
| 286 | 396 |
| 287 | 539 |
| 288 | 77 |
| 289 | 144 |
| 290 | 158 |
| 291 | 229 |
| 292 | 167 |
| 293 | 240 |
| 294 | 255 |
| 295 | 364 |
| 296 | 189 |
| 297 | 267 |
| 298 | 281 |
| 299 | 381 |
| 300 | 303 |
| 301 | 411 |
| 302 | 425 |
| 303 | 570 |
| 304 | 210 |
| 305 | 285 |
| 306 | 315 |
| 307 | 419 |
| 308 | 328 |
| 309 | 440 |
| 310 | 459 |
| 311 | 593 |
| 312 | 354 |
| 313 | 466 |
| 314 | 489 |
| 315 | 622 |
| 316 | 506 |
| 317 | 654 |
| 318 | 683 |
| 319 | 861 |
| 320 | 98 |
| 321 | 148 |
| 322 | 180 |
| 323 | 264 |
| 324 | 193 |
| 325 | 278 |
| 326 | 299 |
| 327 | 402 |
| 328 | 218 |
| 329 | 317 |
| 330 | 290 |
| 331 | 429 |
| 332 | 339 |
| 333 | 450 |
| 334 | 478 |
| 335 | 604 |
| 336 | 238 |
| 337 | 309 |
| 338 | 350 |
| 339 | 462 |
| 340 | 367 |
| 341 | 485 |
| 342 | 503 |
| 343 | 639 |

TABLE Z19-continued with a sequence length of 2048:

| Polarized channel sequence number | Reliability or reliability sequence number |
|---|---|
| 344 | 389 |
| 345 | 510 |
| 346 | 546 |
| 347 | 665 |
| 348 | 566 |
| 349 | 703 |
| 350 | 729 |
| 351 | 923 |
| 352 | 259 |
| 353 | 360 |
| 354 | 385 |
| 355 | 499 |
| 356 | 415 |
| 357 | 522 |
| 358 | 554 |
| 359 | 694 |
| 360 | 433 |
| 361 | 557 |
| 362 | 590 |
| 363 | 711 |
| 364 | 610 |
| 365 | 746 |
| 366 | 777 |
| 367 | 948 |
| 368 | 469 |
| 369 | 598 |
| 370 | 631 |
| 371 | 758 |
| 372 | 648 |
| 373 | 782 |
| 374 | 811 |
| 375 | 993 |
| 376 | 677 |
| 377 | 825 |
| 378 | 852 |
| 379 | 1025 |
| 380 | 876 |
| 381 | 1061 |
| 382 | 1102 |
| 383 | 1300 |
| 384 | 133 |
| 385 | 175 |
| 386 | 197 |
| 387 | 306 |
| 388 | 226 |
| 389 | 324 |
| 390 | 335 |
| 391 | 473 |
| 392 | 251 |
| 393 | 346 |
| 394 | 370 |
| 395 | 497 |
| 396 | 392 |
| 397 | 518 |
| 398 | 533 |
| 399 | 690 |
| 400 | 270 |
| 401 | 373 |
| 402 | 401 |
| 403 | 525 |
| 404 | 422 |
| 405 | 549 |
| 406 | 575 |
| 407 | 721 |
| 408 | 446 |
| 409 | 581 |
| 410 | 601 |
| 411 | 740 |
| 412 | 634 |
| 413 | 774 |
| 414 | 806 |
| 415 | 985 |
| 416 | 292 |
| 417 | 406 |
| 418 | 436 |

TABLE Z19-continued

| with a sequence length of 2048: | |
|---|---|
| Polarized channel sequence number | Reliability or reliability sequence number |
| 419 | 563 |
| 420 | 455 |
| 421 | 584 |
| 422 | 616 |
| 423 | 763 |
| 424 | 491 |
| 425 | 628 |
| 426 | 651 |
| 427 | 789 |
| 428 | 674 |
| 429 | 819 |
| 430 | 842 |
| 431 | 1019 |
| 432 | 531 |
| 433 | 662 |
| 434 | 697 |
| 435 | 833 |
| 436 | 718 |
| 437 | 867 |
| 438 | 892 |
| 439 | 1047 |
| 440 | 754 |
| 441 | 903 |
| 442 | 936 |
| 443 | 1085 |
| 444 | 959 |
| 445 | 1130 |
| 446 | 1192 |
| 447 | 1316 |
| 448 | 296 |
| 449 | 444 |
| 450 | 479 |
| 451 | 619 |
| 452 | 516 |
| 453 | 642 |
| 454 | 668 |
| 455 | 828 |
| 456 | 540 |
| 457 | 680 |
| 458 | 707 |
| 459 | 856 |
| 460 | 735 |
| 461 | 886 |
| 462 | 912 |
| 463 | 1077 |
| 464 | 573 |
| 465 | 724 |
| 466 | 743 |
| 467 | 897 |
| 468 | 786 |
| 469 | 931 |
| 470 | 954 |
| 471 | 1138 |
| 472 | 802 |
| 473 | 965 |
| 474 | 999 |
| 475 | 1158 |
| 476 | 1031 |
| 477 | 1201 |
| 478 | 1227 |
| 479 | 1423 |
| 480 | 613 |
| 481 | 766 |
| 482 | 797 |
| 483 | 942 |
| 484 | 838 |
| 485 | 979 |
| 486 | 1005 |
| 487 | 1169 |
| 488 | 872 |
| 489 | 1013 |
| 490 | 1055 |
| 491 | 1216 |
| 492 | 1094 |
| 493 | 1240 |

TABLE Z19-continued

| with a sequence length of 2048: | |
|---|---|
| Polarized channel sequence number | Reliability or reliability sequence number |
| 494 | 1269 |
| 495 | 1452 |
| 496 | 908 |
| 497 | 1069 |
| 498 | 1110 |
| 499 | 1254 |
| 500 | 1121 |
| 501 | 1282 |
| 502 | 1335 |
| 503 | 1521 |
| 504 | 1181 |
| 505 | 1355 |
| 506 | 1375 |
| 507 | 1482 |
| 508 | 1398 |
| 509 | 1567 |
| 510 | 1626 |
| 511 | 1716 |
| 512 | 9 |
| 513 | 33 |
| 514 | 51 |
| 515 | 109 |
| 516 | 66 |
| 517 | 126 |
| 518 | 149 |
| 519 | 227 |
| 520 | 78 |
| 521 | 142 |
| 522 | 164 |
| 523 | 243 |
| 524 | 183 |
| 525 | 266 |
| 526 | 275 |
| 527 | 404 |
| 528 | 90 |
| 529 | 156 |
| 530 | 170 |
| 531 | 261 |
| 532 | 201 |
| 533 | 288 |
| 534 | 318 |
| 535 | 418 |
| 536 | 211 |
| 537 | 313 |
| 538 | 301 |
| 539 | 441 |
| 540 | 349 |
| 541 | 463 |
| 542 | 483 |
| 543 | 638 |
| 544 | 100 |
| 545 | 188 |
| 546 | 205 |
| 547 | 297 |
| 548 | 216 |
| 549 | 310 |
| 550 | 329 |
| 551 | 447 |
| 552 | 247 |
| 553 | 341 |
| 554 | 357 |
| 555 | 467 |
| 556 | 382 |
| 557 | 498 |
| 558 | 514 |
| 559 | 670 |
| 560 | 271 |
| 561 | 365 |
| 562 | 397 |
| 563 | 507 |
| 564 | 414 |
| 565 | 532 |
| 566 | 550 |
| 567 | 696 |
| 568 | 438 |

TABLE Z19-continued with a sequence length of 2048:

| Polarized channel sequence number | Reliability or reliability sequence number |
|---|---|
| 569 | 559 |
| 570 | 583 |
| 571 | 730 |
| 572 | 603 |
| 573 | 767 |
| 574 | 801 |
| 575 | 983 |
| 576 | 134 |
| 577 | 194 |
| 578 | 237 |
| 579 | 338 |
| 580 | 252 |
| 581 | 352 |
| 582 | 378 |
| 583 | 493 |
| 584 | 280 |
| 585 | 400 |
| 586 | 369 |
| 587 | 520 |
| 588 | 424 |
| 589 | 542 |
| 590 | 571 |
| 591 | 710 |
| 592 | 305 |
| 593 | 394 |
| 594 | 431 |
| 595 | 553 |
| 596 | 454 |
| 597 | 577 |
| 598 | 597 |
| 599 | 751 |
| 600 | 477 |
| 601 | 606 |
| 602 | 647 |
| 603 | 776 |
| 604 | 667 |
| 605 | 821 |
| 606 | 849 |
| 607 | 1041 |
| 608 | 334 |
| 609 | 445 |
| 610 | 474 |
| 611 | 594 |
| 612 | 505 |
| 613 | 620 |
| 614 | 656 |
| 615 | 809 |
| 616 | 524 |
| 617 | 659 |
| 618 | 693 |
| 619 | 830 |
| 620 | 713 |
| 621 | 868 |
| 622 | 901 |
| 623 | 1065 |
| 624 | 561 |
| 625 | 702 |
| 626 | 742 |
| 627 | 879 |
| 628 | 759 |
| 629 | 907 |
| 630 | 938 |
| 631 | 1106 |
| 632 | 791 |
| 633 | 950 |
| 634 | 971 |
| 635 | 1141 |
| 636 | 1003 |
| 637 | 1172 |
| 638 | 1211 |
| 639 | 1389 |
| 640 | 176 |
| 641 | 232 |
| 642 | 257 |
| 643 | 390 |

TABLE Z19-continued with a sequence length of 2048:

| Polarized channel sequence number | Reliability or reliability sequence number |
|---|---|
| 644 | 293 |
| 645 | 408 |
| 646 | 420 |
| 647 | 564 |
| 648 | 322 |
| 649 | 428 |
| 650 | 458 |
| 651 | 588 |
| 652 | 481 |
| 653 | 617 |
| 654 | 632 |
| 655 | 808 |
| 656 | 345 |
| 657 | 461 |
| 658 | 490 |
| 659 | 626 |
| 660 | 511 |
| 661 | 650 |
| 662 | 679 |
| 663 | 840 |
| 664 | 538 |
| 665 | 685 |
| 666 | 705 |
| 667 | 860 |
| 668 | 745 |
| 669 | 895 |
| 670 | 933 |
| 671 | 1098 |
| 672 | 371 |
| 673 | 495 |
| 674 | 527 |
| 675 | 660 |
| 676 | 547 |
| 677 | 688 |
| 678 | 722 |
| 679 | 885 |
| 680 | 585 |
| 681 | 737 |
| 682 | 764 |
| 683 | 916 |
| 684 | 787 |
| 685 | 944 |
| 686 | 967 |
| 687 | 1134 |
| 688 | 629 |
| 689 | 772 |
| 690 | 814 |
| 691 | 958 |
| 692 | 835 |
| 693 | 989 |
| 694 | 1015 |
| 695 | 1154 |
| 696 | 874 |
| 697 | 1024 |
| 698 | 1053 |
| 699 | 1194 |
| 700 | 1079 |
| 701 | 1237 |
| 702 | 1290 |
| 703 | 1404 |
| 704 | 375 |
| 705 | 535 |
| 706 | 574 |
| 707 | 727 |
| 708 | 609 |
| 709 | 753 |
| 710 | 781 |
| 711 | 956 |
| 712 | 641 |
| 713 | 796 |
| 714 | 823 |
| 715 | 977 |
| 716 | 854 |
| 717 | 1009 |
| 718 | 1035 |

TABLE Z19-continued with a sequence length of 2048:

| Polarized channel sequence number | Reliability or reliability sequence number |
|---|---|
| 719 | 1185 |
| 720 | 676 |
| 721 | 844 |
| 722 | 865 |
| 723 | 1021 |
| 724 | 910 |
| 725 | 1049 |
| 726 | 1073 |
| 727 | 1247 |
| 728 | 927 |
| 729 | 1083 |
| 730 | 1113 |
| 731 | 1259 |
| 732 | 1147 |
| 733 | 1298 |
| 734 | 1324 |
| 735 | 1499 |
| 736 | 719 |
| 737 | 890 |
| 738 | 921 |
| 739 | 1059 |
| 740 | 961 |
| 741 | 1092 |
| 742 | 1117 |
| 743 | 1267 |
| 744 | 995 |
| 745 | 1125 |
| 746 | 1163 |
| 747 | 1311 |
| 748 | 1204 |
| 749 | 1332 |
| 750 | 1360 |
| 751 | 1528 |
| 752 | 1029 |
| 753 | 1178 |
| 754 | 1220 |
| 755 | 1346 |
| 756 | 1230 |
| 757 | 1378 |
| 758 | 1420 |
| 759 | 1587 |
| 760 | 1277 |
| 761 | 1439 |
| 762 | 1458 |
| 763 | 1555 |
| 764 | 1478 |
| 765 | 1630 |
| 766 | 1679 |
| 767 | 1758 |
| 768 | 118 |
| 769 | 222 |
| 770 | 284 |
| 771 | 434 |
| 772 | 326 |
| 773 | 451 |
| 774 | 502 |
| 775 | 644 |
| 776 | 361 |
| 777 | 486 |
| 778 | 529 |
| 779 | 673 |
| 780 | 568 |
| 781 | 716 |
| 782 | 734 |
| 783 | 925 |
| 784 | 386 |
| 785 | 517 |
| 786 | 545 |
| 787 | 708 |
| 788 | 600 |
| 789 | 748 |
| 790 | 799 |
| 791 | 940 |
| 792 | 623 |
| 793 | 792 |
| 794 | 771 |
| 795 | 981 |
| 796 | 845 |
| 797 | 1011 |
| 798 | 1037 |
| 799 | 1213 |
| 800 | 410 |
| 801 | 580 |
| 802 | 612 |
| 803 | 761 |
| 804 | 635 |
| 805 | 784 |
| 806 | 813 |
| 807 | 991 |
| 808 | 682 |
| 809 | 831 |
| 810 | 858 |
| 811 | 1017 |
| 812 | 894 |
| 813 | 1057 |
| 814 | 1075 |
| 815 | 1249 |
| 816 | 726 |
| 817 | 863 |
| 818 | 914 |
| 819 | 1067 |
| 820 | 935 |
| 821 | 1096 |
| 822 | 1119 |
| 823 | 1274 |
| 824 | 975 |
| 825 | 1128 |
| 826 | 1156 |
| 827 | 1308 |
| 828 | 1176 |
| 829 | 1344 |
| 830 | 1372 |
| 831 | 1539 |
| 832 | 470 |
| 833 | 591 |
| 834 | 664 |
| 835 | 826 |
| 836 | 691 |
| 837 | 851 |
| 838 | 888 |
| 839 | 1045 |
| 840 | 738 |
| 841 | 920 |
| 842 | 870 |
| 843 | 1081 |
| 844 | 952 |
| 845 | 1108 |
| 846 | 1143 |
| 847 | 1287 |
| 848 | 779 |
| 849 | 905 |
| 850 | 969 |
| 851 | 1123 |
| 852 | 997 |
| 853 | 1152 |
| 854 | 1174 |
| 855 | 1327 |
| 856 | 1027 |
| 857 | 1183 |
| 858 | 1223 |
| 859 | 1352 |
| 860 | 1244 |
| 861 | 1392 |
| 862 | 1417 |
| 863 | 1591 |
| 864 | 818 |
| 865 | 987 |
| 866 | 1023 |
| 867 | 1167 |
| 868 | 1063 |

TABLE Z19-continued with a sequence length of 2048:

| Polarized channel sequence number | Reliability or reliability sequence number |
|---|---|
| 869 | 1197 |
| 870 | 1232 |
| 871 | 1384 |
| 872 | 1088 |
| 873 | 1235 |
| 874 | 1272 |
| 875 | 1401 |
| 876 | 1292 |
| 877 | 1436 |
| 878 | 1465 |
| 879 | 1608 |
| 880 | 1132 |
| 881 | 1280 |
| 882 | 1319 |
| 883 | 1445 |
| 884 | 1338 |
| 885 | 1468 |
| 886 | 1496 |
| 887 | 1644 |
| 888 | 1366 |
| 889 | 1506 |
| 890 | 1532 |
| 891 | 1668 |
| 892 | 1551 |
| 893 | 1694 |
| 894 | 1728 |
| 895 | 1847 |
| 896 | 556 |
| 897 | 653 |
| 898 | 699 |
| 899 | 899 |
| 900 | 756 |
| 901 | 929 |
| 902 | 946 |
| 903 | 1136 |
| 904 | 804 |
| 905 | 963 |
| 906 | 1001 |
| 907 | 1165 |
| 908 | 1033 |
| 909 | 1190 |
| 910 | 1208 |
| 911 | 1381 |
| 912 | 837 |
| 913 | 1007 |
| 914 | 1043 |
| 915 | 1199 |
| 916 | 1071 |
| 917 | 1225 |
| 918 | 1257 |
| 919 | 1411 |
| 920 | 1104 |
| 921 | 1262 |
| 922 | 1285 |
| 923 | 1429 |
| 924 | 1322 |
| 925 | 1461 |
| 926 | 1492 |
| 927 | 1640 |
| 928 | 877 |
| 929 | 1051 |
| 930 | 1090 |
| 931 | 1242 |
| 932 | 1115 |
| 933 | 1264 |
| 934 | 1303 |
| 935 | 1448 |
| 936 | 1160 |
| 937 | 1314 |
| 938 | 1341 |
| 939 | 1475 |
| 940 | 1363 |
| 941 | 1503 |
| 942 | 1524 |
| 943 | 1664 |

TABLE Z19-continued with a sequence length of 2048:

| Polarized channel sequence number | Reliability or reliability sequence number |
|---|---|
| 944 | 1206 |
| 945 | 1349 |
| 946 | 1386 |
| 947 | 1513 |
| 948 | 1408 |
| 949 | 1543 |
| 950 | 1563 |
| 951 | 1684 |
| 952 | 1442 |
| 953 | 1575 |
| 954 | 1600 |
| 955 | 1710 |
| 956 | 1617 |
| 957 | 1745 |
| 958 | 1784 |
| 959 | 1856 |
| 960 | 883 |
| 961 | 1100 |
| 962 | 1145 |
| 963 | 1306 |
| 964 | 1188 |
| 965 | 1330 |
| 966 | 1358 |
| 967 | 1510 |
| 968 | 1218 |
| 969 | 1369 |
| 970 | 1395 |
| 971 | 1536 |
| 972 | 1426 |
| 973 | 1559 |
| 974 | 1583 |
| 975 | 1705 |
| 976 | 1252 |
| 977 | 1414 |
| 978 | 1432 |
| 979 | 1571 |
| 980 | 1472 |
| 981 | 1595 |
| 982 | 1612 |
| 983 | 1752 |
| 984 | 1489 |
| 985 | 1621 |
| 986 | 1649 |
| 987 | 1764 |
| 988 | 1673 |
| 989 | 1792 |
| 990 | 1806 |
| 991 | 1907 |
| 992 | 1295 |
| 993 | 1455 |
| 994 | 1485 |
| 995 | 1604 |
| 996 | 1517 |
| 997 | 1635 |
| 998 | 1654 |
| 999 | 1771 |
| 1000 | 1547 |
| 1001 | 1659 |
| 1002 | 1689 |
| 1003 | 1799 |
| 1004 | 1722 |
| 1005 | 1814 |
| 1006 | 1830 |
| 1007 | 1920 |
| 1008 | 1579 |
| 1009 | 1700 |
| 1010 | 1733 |
| 1011 | 1822 |
| 1012 | 1739 |
| 1013 | 1838 |
| 1014 | 1865 |
| 1015 | 1948 |
| 1016 | 1778 |
| 1017 | 1875 |
| 1018 | 1885 |

TABLE Z19-continued with a sequence length of 2048:

| Polarized channel sequence number | Reliability or reliability sequence number |
|---|---|
| 1019 | 1933 |
| 1020 | 1896 |
| 1021 | 1964 |
| 1022 | 1984 |
| 1023 | 2008 |
| 1024 | 10 |
| 1025 | 39 |
| 1026 | 64 |
| 1027 | 140 |
| 1028 | 83 |
| 1029 | 172 |
| 1030 | 200 |
| 1031 | 295 |
| 1032 | 99 |
| 1033 | 192 |
| 1034 | 217 |
| 1035 | 314 |
| 1036 | 241 |
| 1037 | 347 |
| 1038 | 358 |
| 1039 | 512 |
| 1040 | 114 |
| 1041 | 209 |
| 1042 | 225 |
| 1043 | 342 |
| 1044 | 263 |
| 1045 | 374 |
| 1046 | 407 |
| 1047 | 530 |
| 1048 | 276 |
| 1049 | 403 |
| 1050 | 388 |
| 1051 | 555 |
| 1052 | 448 |
| 1053 | 582 |
| 1054 | 605 |
| 1055 | 773 |
| 1056 | 128 |
| 1057 | 248 |
| 1058 | 269 |
| 1059 | 384 |
| 1060 | 283 |
| 1061 | 398 |
| 1062 | 426 |
| 1063 | 565 |
| 1064 | 320 |
| 1065 | 439 |
| 1066 | 456 |
| 1067 | 586 |
| 1068 | 488 |
| 1069 | 624 |
| 1070 | 640 |
| 1071 | 807 |
| 1072 | 353 |
| 1073 | 464 |
| 1074 | 504 |
| 1075 | 633 |
| 1076 | 526 |
| 1077 | 661 |
| 1078 | 681 |
| 1079 | 834 |
| 1080 | 551 |
| 1081 | 692 |
| 1082 | 717 |
| 1083 | 869 |
| 1084 | 739 |
| 1085 | 904 |
| 1086 | 939 |
| 1087 | 1122 |
| 1088 | 182 |
| 1089 | 256 |
| 1090 | 308 |
| 1091 | 435 |
| 1092 | 325 |
| 1093 | 452 |

TABLE Z19-continued with a sequence length of 2048:

| Polarized channel sequence number | Reliability or reliability sequence number |
|---|---|
| 1094 | 484 |
| 1095 | 615 |
| 1096 | 363 |
| 1097 | 508 |
| 1098 | 468 |
| 1099 | 649 |
| 1100 | 537 |
| 1101 | 672 |
| 1102 | 704 |
| 1103 | 848 |
| 1104 | 393 |
| 1105 | 500 |
| 1106 | 544 |
| 1107 | 684 |
| 1108 | 572 |
| 1109 | 712 |
| 1110 | 733 |
| 1111 | 889 |
| 1112 | 599 |
| 1113 | 741 |
| 1114 | 783 |
| 1115 | 913 |
| 1116 | 803 |
| 1117 | 957 |
| 1118 | 986 |
| 1119 | 1180 |
| 1120 | 430 |
| 1121 | 558 |
| 1122 | 595 |
| 1123 | 731 |
| 1124 | 630 |
| 1125 | 755 |
| 1126 | 793 |
| 1127 | 947 |
| 1128 | 652 |
| 1129 | 795 |
| 1130 | 832 |
| 1131 | 966 |
| 1132 | 850 |
| 1133 | 1004 |
| 1134 | 1040 |
| 1135 | 1205 |
| 1136 | 695 |
| 1137 | 839 |
| 1138 | 880 |
| 1139 | 1016 |
| 1140 | 898 |
| 1141 | 1046 |
| 1142 | 1078 |
| 1143 | 1248 |
| 1144 | 928 |
| 1145 | 1087 |
| 1146 | 1111 |
| 1147 | 1281 |
| 1148 | 1142 |
| 1149 | 1312 |
| 1150 | 1353 |
| 1151 | 1516 |
| 1152 | 233 |
| 1153 | 302 |
| 1154 | 337 |
| 1155 | 496 |
| 1156 | 379 |
| 1157 | 515 |
| 1158 | 534 |
| 1159 | 698 |
| 1160 | 412 |
| 1161 | 541 |
| 1162 | 576 |
| 1163 | 723 |
| 1164 | 602 |
| 1165 | 752 |
| 1166 | 768 |
| 1167 | 945 |
| 1168 | 443 |

TABLE Z19-continued

| with a sequence length of 2048: | |
|---|---|
| Polarized channel sequence number | Reliability or reliability sequence number |
| 1169 | 579 |
| 1170 | 611 |
| 1171 | 760 |
| 1172 | 636 |
| 1173 | 785 |
| 1174 | 815 |
| 1175 | 978 |
| 1176 | 666 |
| 1177 | 822 |
| 1178 | 841 |
| 1179 | 996 |
| 1180 | 882 |
| 1181 | 1034 |
| 1182 | 1072 |
| 1183 | 1239 |
| 1184 | 472 |
| 1185 | 618 |
| 1186 | 655 |
| 1187 | 798 |
| 1188 | 678 |
| 1189 | 824 |
| 1190 | 859 |
| 1191 | 1022 |
| 1192 | 720 |
| 1193 | 873 |
| 1194 | 902 |
| 1195 | 1054 |
| 1196 | 924 |
| 1197 | 1082 |
| 1198 | 1105 |
| 1199 | 1276 |
| 1200 | 765 |
| 1201 | 911 |
| 1202 | 953 |
| 1203 | 1097 |
| 1204 | 972 |
| 1205 | 1127 |
| 1206 | 1153 |
| 1207 | 1296 |
| 1208 | 1010 |
| 1209 | 1164 |
| 1210 | 1195 |
| 1211 | 1336 |
| 1212 | 1219 |
| 1213 | 1379 |
| 1214 | 1428 |
| 1215 | 1529 |
| 1216 | 480 |
| 1217 | 663 |
| 1218 | 706 |
| 1219 | 866 |
| 1220 | 747 |
| 1221 | 891 |
| 1222 | 919 |
| 1223 | 1093 |
| 1224 | 775 |
| 1225 | 932 |
| 1226 | 962 |
| 1227 | 1116 |
| 1228 | 990 |
| 1229 | 1148 |
| 1230 | 1175 |
| 1231 | 1326 |
| 1232 | 812 |
| 1233 | 980 |
| 1234 | 1002 |
| 1235 | 1159 |
| 1236 | 1048 |
| 1237 | 1189 |
| 1238 | 1214 |
| 1239 | 1387 |
| 1240 | 1066 |
| 1241 | 1226 |
| 1242 | 1253 |
| 1243 | 1399 |

TABLE Z19-continued

| with a sequence length of 2048: | |
|---|---|
| Polarized channel sequence number | Reliability or reliability sequence number |
| 1244 | 1289 |
| 1245 | 1435 |
| 1246 | 1457 |
| 1247 | 1611 |
| 1248 | 857 |
| 1249 | 1028 |
| 1250 | 1060 |
| 1251 | 1200 |
| 1252 | 1099 |
| 1253 | 1233 |
| 1254 | 1258 |
| 1255 | 1407 |
| 1256 | 1133 |
| 1257 | 1268 |
| 1258 | 1304 |
| 1259 | 1446 |
| 1260 | 1343 |
| 1261 | 1466 |
| 1262 | 1490 |
| 1263 | 1634 |
| 1264 | 1170 |
| 1265 | 1321 |
| 1266 | 1361 |
| 1267 | 1477 |
| 1268 | 1370 |
| 1269 | 1504 |
| 1270 | 1544 |
| 1271 | 1683 |
| 1272 | 1416 |
| 1273 | 1558 |
| 1274 | 1574 |
| 1275 | 1658 |
| 1276 | 1594 |
| 1277 | 1719 |
| 1278 | 1760 |
| 1279 | 1821 |
| 1280 | 151 |
| 1281 | 289 |
| 1282 | 368 |
| 1283 | 548 |
| 1284 | 421 |
| 1285 | 569 |
| 1286 | 627 |
| 1287 | 780 |
| 1288 | 460 |
| 1289 | 608 |
| 1290 | 658 |
| 1291 | 810 |
| 1292 | 701 |
| 1293 | 855 |
| 1294 | 871 |
| 1295 | 1062 |
| 1296 | 492 |
| 1297 | 643 |
| 1298 | 675 |
| 1299 | 846 |
| 1300 | 736 |
| 1301 | 884 |
| 1302 | 937 |
| 1303 | 1080 |
| 1304 | 757 |
| 1305 | 930 |
| 1306 | 909 |
| 1307 | 1118 |
| 1308 | 982 |
| 1309 | 1150 |
| 1310 | 1177 |
| 1311 | 1356 |
| 1312 | 519 |
| 1313 | 715 |
| 1314 | 749 |
| 1315 | 900 |
| 1316 | 770 |
| 1317 | 922 |
| 1318 | 949 |

TABLE Z19-continued with a sequence length of 2048:

| Polarized channel sequence number | Reliability or reliability sequence number |
|---|---|
| 1319 | 1129 |
| 1320 | 820 |
| 1321 | 970 |
| 1322 | 994 |
| 1323 | 1155 |
| 1324 | 1032 |
| 1325 | 1198 |
| 1326 | 1217 |
| 1327 | 1390 |
| 1328 | 862 |
| 1329 | 1000 |
| 1330 | 1052 |
| 1331 | 1209 |
| 1332 | 1074 |
| 1333 | 1236 |
| 1334 | 1261 |
| 1335 | 1413 |
| 1336 | 1114 |
| 1337 | 1270 |
| 1338 | 1297 |
| 1339 | 1443 |
| 1340 | 1318 |
| 1341 | 1474 |
| 1342 | 1501 |
| 1343 | 1645 |
| 1344 | 589 |
| 1345 | 725 |
| 1346 | 800 |
| 1347 | 964 |
| 1348 | 827 |
| 1349 | 988 |
| 1350 | 1026 |
| 1351 | 1186 |
| 1352 | 878 |
| 1353 | 1056 |
| 1354 | 1008 |
| 1355 | 1222 |
| 1356 | 1091 |
| 1357 | 1250 |
| 1358 | 1284 |
| 1359 | 1425 |
| 1360 | 917 |
| 1361 | 1042 |
| 1362 | 1109 |
| 1363 | 1265 |
| 1364 | 1135 |
| 1365 | 1293 |
| 1366 | 1315 |
| 1367 | 1460 |
| 1368 | 1166 |
| 1369 | 1323 |
| 1370 | 1364 |
| 1371 | 1484 |
| 1372 | 1385 |
| 1373 | 1519 |
| 1374 | 1541 |
| 1375 | 1687 |
| 1376 | 955 |
| 1377 | 1124 |
| 1378 | 1161 |
| 1379 | 1310 |
| 1380 | 1203 |
| 1381 | 1337 |
| 1382 | 1373 |
| 1383 | 1511 |
| 1384 | 1228 |
| 1385 | 1376 |
| 1386 | 1410 |
| 1387 | 1526 |
| 1388 | 1431 |
| 1389 | 1556 |
| 1390 | 1581 |
| 1391 | 1703 |
| 1392 | 1273 |
| 1393 | 1419 |

TABLE Z19-continued with a sequence length of 2048:

| Polarized channel sequence number | Reliability or reliability sequence number |
|---|---|
| 1394 | 1451 |
| 1395 | 1565 |
| 1396 | 1469 |
| 1397 | 1585 |
| 1398 | 1607 |
| 1399 | 1731 |
| 1400 | 1495 |
| 1401 | 1618 |
| 1402 | 1638 |
| 1403 | 1751 |
| 1404 | 1655 |
| 1405 | 1773 |
| 1406 | 1796 |
| 1407 | 1892 |
| 1408 | 687 |
| 1409 | 788 |
| 1410 | 836 |
| 1411 | 1038 |
| 1412 | 893 |
| 1413 | 1068 |
| 1414 | 1086 |
| 1415 | 1278 |
| 1416 | 941 |
| 1417 | 1103 |
| 1418 | 1139 |
| 1419 | 1307 |
| 1420 | 1171 |
| 1421 | 1333 |
| 1422 | 1350 |
| 1423 | 1507 |
| 1424 | 974 |
| 1425 | 1144 |
| 1426 | 1184 |
| 1427 | 1340 |
| 1428 | 1212 |
| 1429 | 1367 |
| 1430 | 1396 |
| 1431 | 1534 |
| 1432 | 1245 |
| 1433 | 1402 |
| 1434 | 1422 |
| 1435 | 1550 |
| 1436 | 1454 |
| 1437 | 1578 |
| 1438 | 1603 |
| 1439 | 1726 |
| 1440 | 1012 |
| 1441 | 1191 |
| 1442 | 1231 |
| 1443 | 1382 |
| 1444 | 1256 |
| 1445 | 1405 |
| 1446 | 1437 |
| 1447 | 1569 |
| 1448 | 1301 |
| 1449 | 1449 |
| 1450 | 1471 |
| 1451 | 1590 |
| 1452 | 1493 |
| 1453 | 1614 |
| 1454 | 1631 |
| 1455 | 1747 |
| 1456 | 1347 |
| 1457 | 1481 |
| 1458 | 1514 |
| 1459 | 1624 |
| 1460 | 1531 |
| 1461 | 1648 |
| 1462 | 1666 |
| 1463 | 1765 |
| 1464 | 1562 |
| 1465 | 1674 |
| 1466 | 1696 |
| 1467 | 1787 |
| 1468 | 1711 |

TABLE Z19-continued

| with a sequence length of 2048: | |
|---|---|
| Polarized channel sequence number | Reliability or reliability sequence number |
| 1469 | 1811 |
| 1470 | 1843 |
| 1471 | 1899 |
| 1472 | 1018 |
| 1473 | 1241 |
| 1474 | 1286 |
| 1475 | 1440 |
| 1476 | 1329 |
| 1477 | 1463 |
| 1478 | 1487 |
| 1479 | 1620 |
| 1480 | 1357 |
| 1481 | 1498 |
| 1482 | 1522 |
| 1483 | 1641 |
| 1484 | 1546 |
| 1485 | 1662 |
| 1486 | 1680 |
| 1487 | 1782 |
| 1488 | 1393 |
| 1489 | 1537 |
| 1490 | 1553 |
| 1491 | 1670 |
| 1492 | 1588 |
| 1493 | 1692 |
| 1494 | 1707 |
| 1495 | 1816 |
| 1496 | 1601 |
| 1497 | 1714 |
| 1498 | 1735 |
| 1499 | 1826 |
| 1500 | 1755 |
| 1501 | 1848 |
| 1502 | 1860 |
| 1503 | 1939 |
| 1504 | 1434 |
| 1505 | 1572 |
| 1506 | 1597 |
| 1507 | 1699 |
| 1508 | 1628 |
| 1509 | 1723 |
| 1510 | 1738 |
| 1511 | 1832 |
| 1512 | 1652 |
| 1513 | 1743 |
| 1514 | 1769 |
| 1515 | 1854 |
| 1516 | 1791 |
| 1517 | 1866 |
| 1518 | 1879 |
| 1519 | 1949 |
| 1520 | 1677 |
| 1521 | 1777 |
| 1522 | 1801 |
| 1523 | 1872 |
| 1524 | 1807 |
| 1525 | 1884 |
| 1526 | 1906 |
| 1527 | 1970 |
| 1528 | 1837 |
| 1529 | 1914 |
| 1530 | 1922 |
| 1531 | 1958 |
| 1532 | 1930 |
| 1533 | 1982 |
| 1534 | 1997 |
| 1535 | 2016 |
| 1536 | 162 |
| 1537 | 331 |
| 1538 | 417 |
| 1539 | 621 |
| 1540 | 476 |
| 1541 | 669 |
| 1542 | 728 |
| 1543 | 896 |

TABLE Z19-continued

| with a sequence length of 2048: | |
|---|---|
| Polarized channel sequence number | Reliability or reliability sequence number |
| 1544 | 523 |
| 1545 | 709 |
| 1546 | 762 |
| 1547 | 926 |
| 1548 | 805 |
| 1549 | 968 |
| 1550 | 984 |
| 1551 | 1187 |
| 1552 | 562 |
| 1553 | 744 |
| 1554 | 778 |
| 1555 | 960 |
| 1556 | 843 |
| 1557 | 1006 |
| 1558 | 1058 |
| 1559 | 1207 |
| 1560 | 864 |
| 1561 | 1050 |
| 1562 | 1030 |
| 1563 | 1238 |
| 1564 | 1107 |
| 1565 | 1266 |
| 1566 | 1291 |
| 1567 | 1459 |
| 1568 | 592 |
| 1569 | 817 |
| 1570 | 853 |
| 1571 | 1020 |
| 1572 | 875 |
| 1573 | 1044 |
| 1574 | 1076 |
| 1575 | 1246 |
| 1576 | 934 |
| 1577 | 1095 |
| 1578 | 1120 |
| 1579 | 1271 |
| 1580 | 1157 |
| 1581 | 1309 |
| 1582 | 1328 |
| 1583 | 1488 |
| 1584 | 976 |
| 1585 | 1131 |
| 1586 | 1179 |
| 1587 | 1320 |
| 1588 | 1202 |
| 1589 | 1348 |
| 1590 | 1368 |
| 1591 | 1512 |
| 1592 | 1234 |
| 1593 | 1377 |
| 1594 | 1403 |
| 1595 | 1542 |
| 1596 | 1424 |
| 1597 | 1573 |
| 1598 | 1599 |
| 1599 | 1725 |
| 1600 | 689 |
| 1601 | 829 |
| 1602 | 915 |
| 1603 | 1089 |
| 1604 | 943 |
| 1605 | 1112 |
| 1606 | 1151 |
| 1607 | 1302 |
| 1608 | 992 |
| 1609 | 1182 |
| 1610 | 1137 |
| 1611 | 1334 |
| 1612 | 1215 |
| 1613 | 1359 |
| 1614 | 1391 |
| 1615 | 1525 |
| 1616 | 1036 |
| 1617 | 1173 |
| 1618 | 1224 |

TABLE Z19-continued with a sequence length of 2048:

| Polarized channel sequence number | Reliability or reliability sequence number |
|---|---|
| 1619 | 1371 |
| 1620 | 1255 |
| 1621 | 1397 |
| 1622 | 1418 |
| 1623 | 1560 |
| 1624 | 1283 |
| 1625 | 1427 |
| 1626 | 1467 |
| 1627 | 1580 |
| 1628 | 1486 |
| 1629 | 1615 |
| 1630 | 1636 |
| 1631 | 1761 |
| 1632 | 1084 |
| 1633 | 1243 |
| 1634 | 1279 |
| 1635 | 1415 |
| 1636 | 1317 |
| 1637 | 1441 |
| 1638 | 1476 |
| 1639 | 1606 |
| 1640 | 1339 |
| 1641 | 1479 |
| 1642 | 1509 |
| 1643 | 1622 |
| 1644 | 1527 |
| 1645 | 1650 |
| 1646 | 1672 |
| 1647 | 1775 |
| 1648 | 1380 |
| 1649 | 1518 |
| 1650 | 1552 |
| 1651 | 1657 |
| 1652 | 1566 |
| 1653 | 1676 |
| 1654 | 1697 |
| 1655 | 1798 |
| 1656 | 1592 |
| 1657 | 1704 |
| 1658 | 1718 |
| 1659 | 1817 |
| 1660 | 1737 |
| 1661 | 1833 |
| 1662 | 1852 |
| 1663 | 1927 |
| 1664 | 790 |
| 1665 | 906 |
| 1666 | 951 |
| 1667 | 1168 |
| 1668 | 1014 |
| 1669 | 1193 |
| 1670 | 1210 |
| 1671 | 1383 |
| 1672 | 1064 |
| 1673 | 1221 |
| 1674 | 1260 |
| 1675 | 1409 |
| 1676 | 1288 |
| 1677 | 1438 |
| 1678 | 1453 |
| 1679 | 1605 |
| 1680 | 1101 |
| 1681 | 1263 |
| 1682 | 1299 |
| 1683 | 1447 |
| 1684 | 1325 |
| 1685 | 1470 |
| 1686 | 1497 |
| 1687 | 1629 |
| 1688 | 1354 |
| 1689 | 1502 |
| 1690 | 1520 |
| 1691 | 1643 |
| 1692 | 1554 |
| 1693 | 1669 |
| 1694 | 1693 |
| 1695 | 1794 |
| 1696 | 1140 |
| 1697 | 1305 |
| 1698 | 1342 |
| 1699 | 1480 |
| 1700 | 1365 |
| 1701 | 1505 |
| 1702 | 1535 |
| 1703 | 1661 |
| 1704 | 1406 |
| 1705 | 1548 |
| 1706 | 1570 |
| 1707 | 1682 |
| 1708 | 1589 |
| 1709 | 1701 |
| 1710 | 1715 |
| 1711 | 1813 |
| 1712 | 1450 |
| 1713 | 1577 |
| 1714 | 1610 |
| 1715 | 1709 |
| 1716 | 1625 |
| 1717 | 1729 |
| 1718 | 1744 |
| 1719 | 1824 |
| 1720 | 1653 |
| 1721 | 1750 |
| 1722 | 1768 |
| 1723 | 1844 |
| 1724 | 1783 |
| 1725 | 1864 |
| 1726 | 1888 |
| 1727 | 1932 |
| 1728 | 1146 |
| 1729 | 1351 |
| 1730 | 1394 |
| 1731 | 1540 |
| 1732 | 1430 |
| 1733 | 1561 |
| 1734 | 1584 |
| 1735 | 1708 |
| 1736 | 1462 |
| 1737 | 1596 |
| 1738 | 1616 |
| 1739 | 1721 |
| 1740 | 1639 |
| 1741 | 1741 |
| 1742 | 1757 |
| 1743 | 1840 |
| 1744 | 1494 |
| 1745 | 1632 |
| 1746 | 1647 |
| 1747 | 1748 |
| 1748 | 1678 |
| 1749 | 1766 |
| 1750 | 1780 |
| 1751 | 1869 |
| 1752 | 1690 |
| 1753 | 1786 |
| 1754 | 1802 |
| 1755 | 1874 |
| 1756 | 1820 |
| 1757 | 1891 |
| 1758 | 1902 |
| 1759 | 1963 |
| 1760 | 1533 |
| 1761 | 1665 |
| 1762 | 1686 |
| 1763 | 1772 |
| 1764 | 1712 |
| 1765 | 1790 |
| 1766 | 1804 |
| 1767 | 1878 |
| 1768 | 1732 |

TABLE Z19-continued with a sequence length of 2048:

| Polarized channel sequence number | Reliability or reliability sequence number |
|---|---|
| 1769 | 1809 |
| 1770 | 1828 |
| 1771 | 1897 |
| 1772 | 1849 |
| 1773 | 1905 |
| 1774 | 1916 |
| 1775 | 1972 |
| 1776 | 1754 |
| 1777 | 1836 |
| 1778 | 1857 |
| 1779 | 1911 |
| 1780 | 1861 |
| 1781 | 1923 |
| 1782 | 1938 |
| 1783 | 1988 |
| 1784 | 1882 |
| 1785 | 1944 |
| 1786 | 1951 |
| 1787 | 1979 |
| 1788 | 1957 |
| 1789 | 1998 |
| 1790 | 2009 |
| 1791 | 2023 |
| 1792 | 646 |
| 1793 | 887 |
| 1794 | 998 |
| 1795 | 1229 |
| 1796 | 1070 |
| 1797 | 1251 |
| 1798 | 1313 |
| 1799 | 1464 |
| 1800 | 1126 |
| 1801 | 1294 |
| 1802 | 1345 |
| 1803 | 1491 |
| 1804 | 1388 |
| 1805 | 1530 |
| 1806 | 1545 |
| 1807 | 1688 |
| 1808 | 1162 |
| 1809 | 1331 |
| 1810 | 1362 |
| 1811 | 1523 |
| 1812 | 1421 |
| 1813 | 1557 |
| 1814 | 1598 |
| 1815 | 1698 |
| 1816 | 1444 |
| 1817 | 1593 |
| 1818 | 1576 |
| 1819 | 1724 |
| 1820 | 1633 |
| 1821 | 1742 |
| 1822 | 1759 |
| 1823 | 1853 |
| 1824 | 1196 |
| 1825 | 1400 |
| 1826 | 1433 |
| 1827 | 1568 |
| 1828 | 1456 |
| 1829 | 1586 |
| 1830 | 1609 |
| 1831 | 1730 |
| 1832 | 1500 |
| 1833 | 1623 |
| 1834 | 1642 |
| 1835 | 1746 |
| 1836 | 1667 |
| 1837 | 1770 |
| 1838 | 1781 |
| 1839 | 1870 |
| 1840 | 1538 |
| 1841 | 1646 |
| 1842 | 1681 |
| 1843 | 1776 |

TABLE Z19-continued with a sequence length of 2048:

| Polarized channel sequence number | Reliability or reliability sequence number |
|---|---|
| 1844 | 1695 |
| 1845 | 1793 |
| 1846 | 1805 |
| 1847 | 1881 |
| 1848 | 1720 |
| 1849 | 1810 |
| 1850 | 1825 |
| 1851 | 1895 |
| 1852 | 1835 |
| 1853 | 1910 |
| 1854 | 1921 |
| 1855 | 1975 |
| 1856 | 1275 |
| 1857 | 1412 |
| 1858 | 1483 |
| 1859 | 1619 |
| 1860 | 1508 |
| 1861 | 1637 |
| 1862 | 1663 |
| 1863 | 1763 |
| 1864 | 1549 |
| 1865 | 1685 |
| 1866 | 1651 |
| 1867 | 1785 |
| 1868 | 1706 |
| 1869 | 1800 |
| 1870 | 1818 |
| 1871 | 1887 |
| 1872 | 1582 |
| 1873 | 1675 |
| 1874 | 1717 |
| 1875 | 1808 |
| 1876 | 1734 |
| 1877 | 1823 |
| 1878 | 1834 |
| 1879 | 1903 |
| 1880 | 1753 |
| 1881 | 1839 |
| 1882 | 1858 |
| 1883 | 1913 |
| 1884 | 1868 |
| 1885 | 1928 |
| 1886 | 1937 |
| 1887 | 1989 |
| 1888 | 1613 |
| 1889 | 1727 |
| 1890 | 1749 |
| 1891 | 1831 |
| 1892 | 1774 |
| 1893 | 1845 |
| 1894 | 1862 |
| 1895 | 1925 |
| 1896 | 1788 |
| 1897 | 1863 |
| 1898 | 1880 |
| 1899 | 1931 |
| 1900 | 1889 |
| 1901 | 1943 |
| 1902 | 1953 |
| 1903 | 1993 |
| 1904 | 1812 |
| 1905 | 1883 |
| 1906 | 1900 |
| 1907 | 1946 |
| 1908 | 1908 |
| 1909 | 1954 |
| 1910 | 1962 |
| 1911 | 2001 |
| 1912 | 1918 |
| 1913 | 1966 |
| 1914 | 1973 |
| 1915 | 2006 |
| 1916 | 1978 |
| 1917 | 2012 |
| 1918 | 2018 |

TABLE Z19-continued

| with a sequence length of 2048: | |
|---|---|
| Polarized channel sequence number | Reliability or reliability sequence number |
| 1919 | 2035 |
| 1920 | 1374 |
| 1921 | 1473 |
| 1922 | 1515 |
| 1923 | 1671 |
| 1924 | 1564 |
| 1925 | 1691 |
| 1926 | 1702 |
| 1927 | 1815 |
| 1928 | 1602 |
| 1929 | 1713 |
| 1930 | 1736 |
| 1931 | 1829 |
| 1932 | 1756 |
| 1933 | 1842 |
| 1934 | 1851 |
| 1935 | 1924 |
| 1936 | 1627 |
| 1937 | 1740 |
| 1938 | 1762 |
| 1939 | 1846 |
| 1940 | 1779 |
| 1941 | 1859 |
| 1942 | 1873 |
| 1943 | 1935 |
| 1944 | 1797 |
| 1945 | 1876 |
| 1946 | 1886 |
| 1947 | 1941 |
| 1948 | 1901 |
| 1949 | 1952 |
| 1950 | 1961 |
| 1951 | 2000 |
| 1952 | 1656 |
| 1953 | 1767 |
| 1954 | 1789 |
| 1955 | 1867 |
| 1956 | 1803 |
| 1957 | 1877 |
| 1958 | 1893 |
| 1959 | 1947 |
| 1960 | 1827 |
| 1961 | 1898 |
| 1962 | 1909 |
| 1963 | 1956 |
| 1964 | 1917 |
| 1965 | 1965 |
| 1966 | 1971 |
| 1967 | 2005 |
| 1968 | 1850 |
| 1969 | 1912 |
| 1970 | 1926 |
| 1971 | 1968 |
| 1972 | 1934 |
| 1973 | 1976 |
| 1974 | 1981 |
| 1975 | 2010 |
| 1976 | 1945 |
| 1977 | 1985 |
| 1978 | 1991 |
| 1979 | 2015 |
| 1980 | 1995 |
| 1981 | 2021 |
| 1982 | 2027 |
| 1983 | 2036 |
| 1984 | 1660 |
| 1985 | 1795 |
| 1986 | 1819 |
| 1987 | 1894 |
| 1988 | 1841 |
| 1989 | 1904 |
| 1990 | 1915 |
| 1991 | 1967 |
| 1992 | 1855 |
| 1993 | 1919 |

TABLE Z19-continued

| with a sequence length of 2048: | |
|---|---|
| Polarized channel sequence number | Reliability or reliability sequence number |
| 1994 | 1929 |
| 1995 | 1974 |
| 1996 | 1940 |
| 1997 | 1980 |
| 1998 | 1987 |
| 1999 | 2014 |
| 2000 | 1871 |
| 2001 | 1936 |
| 2002 | 1942 |
| 2003 | 1983 |
| 2004 | 1955 |
| 2005 | 1990 |
| 2006 | 1994 |
| 2007 | 2022 |
| 2008 | 1960 |
| 2009 | 1996 |
| 2010 | 2002 |
| 2011 | 2024 |
| 2012 | 2007 |
| 2013 | 2028 |
| 2014 | 2030 |
| 2015 | 2041 |
| 2016 | 1890 |
| 2017 | 1950 |
| 2018 | 1959 |
| 2019 | 1992 |
| 2020 | 1969 |
| 2021 | 1999 |
| 2022 | 2003 |
| 2023 | 2025 |
| 2024 | 1977 |
| 2025 | 2004 |
| 2026 | 2011 |
| 2027 | 2029 |
| 2028 | 2017 |
| 2029 | 2031 |
| 2030 | 2033 |
| 2031 | 2042 |
| 2032 | 1986 |
| 2033 | 2013 |
| 2034 | 2019 |
| 2035 | 2032 |
| 2036 | 2020 |
| 2037 | 2034 |
| 2038 | 2037 |
| 2039 | 2044 |
| 2040 | 2026 |
| 2041 | 2038 |
| 2042 | 2039 |
| 2043 | 2043 |
| 2044 | 2040 |
| 2045 | 2045 |
| 2046 | 2046 |
| 2047 | 2047 |

Sequence Z20, with a sequence length of 1024:

[0, 1, 2, 7, 3, 10, 13, 26, 4, 12, 15, 29, 18, 35, 37, 72, 5, 14, 16, 34, 21, 40, 47, 77, 23, 46, 4 3, 84, 56, 92, 99, 158, 6, 19, 22, 42, 24, 45, 51, 87, 30, 54, 58, 93, 66, 105, 110, 172, 36, 60, 70, 108, 7 6, 117, 124, 183, 83, 128, 137, 198, 145, 214, 230, 321, 11, 20, 28, 53, 31, 57, 65, 102, 38, 71, 61, 1 13, 79, 121, 132, 189, 44, 69, 81, 125, 89, 135, 143, 207, 97, 146, 162, 218, 170, 239, 253, 353, 52, 85, 96, 142, 107, 151, 166, 234, 114, 167, 182, 243, 190, 262, 279, 367, 129, 185, 203, 268, 211, 2 82, 298, 392, 225, 303, 315, 412, 332, 431, 457, 569, 17, 27, 33, 68, 41, 73, 78, 130, 48, 80, 90, 139, 98, 150, 156, 233, 55, 91, 101, 153, 109, 163, 175, 249, 119, 178, 186, 258, 204, 276, 295, 387, 6 2, 103, 115, 168, 123, 179, 194, 271, 138, 200, 213, 286, 223, 300, 312, 409, 155, 217, 237, 308, 2 46, 324, 338, 421, 265, 344, 361, 446, 375, 474, 507, 578, 64, 118, 133, 197, 148, 208, 221, 306, 1 59, 227, 241, 318, 255, 335, 350, 440, 174, 250, 261, 341, 283, 358, 372, 479, 292, 379, 395, 487, 417, 512, 527, 640, 193, 273, 289, 364, 309, 383, 398, 493, 327, 404, 426, 519, 451, 533, 550, 65 8, 347, 437, 462, 541, 468, 560, 589, 697, 499, 600, 612, 677, 627, 726, 760, 813, 8, 25, 39, 82, 50, 88, 106, 161, 59, 100, 116, 173, 131, 192, 199, 290, 67, 111, 122, 188, 144, 205, 229, 299, 152, 22 6, 216, 319, 251, 336, 351, 459, 74, 136, 149, 212, 157, 222, 235, 325, 177, 245, 257, 339, 275, 36 3, 374, 481, 195, 260, 285, 369, 296, 385, 400, 497, 317, 405, 422, 517, 435, 539, 558, 666, 94, 14 0, 169, 242, 180, 254, 272, 356, 202, 287, 264, 377, 305, 393, 414, 505, 220, 280, 314, 402, 328, 4 19, 433, 529, 345, 438, 464, 546, 478, 571, 587, 700, 238, 322, 342, 430, 366, 447, 470, 565, 380, 472, 495, 576, 509, 598, 617, 713, 407, 501, 523, 605, 535, 620, 637, 736, 554, 645, 661, 753, 67 4, 771, 791, 876, 126, 164, 184, 278, 209, 293, 302, 410, 231, 311, 330, 428, 348, 444, 455, 562, 2 47, 333, 355, 449, 371, 466, 485, 582, 390, 489, 503, 594, 525, 615, 634, 732, 266, 359, 382, 476, 397, 491, 513, 608, 424, 521, 537, 624, 552, 642, 655, 749, 453, 544, 567, 650, 580, 669, 683, 76 4, 603, 689, 707, 783, 719, 804, 832, 882, 269, 388, 415, 515, 442, 531, 548, 647, 460, 556, 573, 6 63, 591, 680, 694, 779, 483, 584, 596, 686, 622, 704, 716, 808, 632, 722, 739, 817, 756, 836, 847, 919, 511, 610, 629, 710, 653, 729, 742, 822, 672, 746, 768, 842, 787, 852, 864, 928, 692, 775, 79 5, 858, 800, 869, 889, 948, 827, 896, 903, 937, 911, 960, 974, 992, 9, 32, 49, 104, 63, 120, 141, 21 0, 75, 134, 154, 224, 171, 244, 252, 357, 86, 147, 160, 240, 187, 263, 288, 368, 196, 284, 274, 386, 313, 403, 418, 528, 95, 176, 191, 270, 201, 281, 297, 391, 228, 307, 320, 406, 340, 429, 441, 549, 248, 326, 352, 436, 365, 454, 467, 566, 384, 473, 490, 588, 504, 611, 631, 731, 127, 181, 219, 30 4, 232, 316, 337, 425, 256, 354, 329, 445, 373, 461, 482, 575, 277, 349, 378, 469, 396, 486, 500, 6 01, 413, 506, 534, 616, 547, 643, 659, 761, 301, 389, 411, 498, 434, 516, 540, 636, 448, 542, 564, 648, 577, 670, 688, 773, 475, 570, 595, 676, 606, 691, 708, 793, 625, 714, 725, 809, 741, 823, 84 0, 908, 165, 215, 236, 346, 267, 360, 370, 477, 291, 376, 399, 494, 416, 514, 524, 635, 310, 401, 4 23, 520, 439, 536, 555, 654, 458, 559, 572, 665, 597, 685, 705, 789, 331, 427, 450, 543, 465, 561, 583, 679, 492, 592, 609, 696, 623, 711, 723, 806, 522, 614, 639, 718, 651, 734, 747, 815, 673, 75 2, 767, 833, 780, 851, 872, 913, 334, 456, 484, 586, 508, 602, 619, 717, 530, 628, 644, 728, 662, 7 44, 758, 829, 553, 656, 668, 750, 693, 765, 777, 855, 702, 782, 796, 860, 812, 875, 885, 942, 581, 682, 699, 770, 720, 786, 798, 863, 737, 802, 819, 880, 837, 888, 898, 950, 755, 826, 844, 893, 84 8, 904, 918, 965, 867, 924, 930, 957, 936, 975, 985, 999, 112, 206, 259, 381, 294, 394, 432, 532, 3 23, 420, 452, 551, 480, 579, 590, 701, 343, 443, 463, 574, 502, 599, 630, 709, 518, 626, 613, 730, 657, 745, 759, 841, 362, 488, 510, 607, 526, 621, 638, 735, 557, 649, 664, 748, 684, 769, 778, 85 6, 585, 667, 695, 774, 706, 788, 799, 866, 727, 803, 816, 879, 825, 892, 902, 953, 408, 496, 545, 6 46, 563, 660, 681, 763, 593, 698, 671, 781, 715, 794, 810, 871, 618, 690, 724, 801, 738, 814, 824, 886, 754, 828, 845, 895, 854, 909, 917, 966, 641, 733, 751, 821, 772, 834, 849, 906, 784, 850, 86 5, 912, 873, 923, 932, 970, 805, 868, 883, 926, 890, 933, 941, 978, 900, 944, 951, 983, 956, 988, 9 94, 1011, 471, 538, 568, 687, 604, 703, 712, 807, 633, 721, 740, 820, 757, 831, 839, 905, 652, 74 3, 762, 835, 776, 846, 859, 915, 792, 861, 870, 921, 884, 931, 940, 977, 675, 766, 785, 853, 797, 8 62, 877, 927, 818, 881, 891, 935, 899, 943, 949, 982, 838, 894, 907, 946, 914, 954, 959, 986, 925, 962, 968, 991, 972, 997, 1003, 1012, 678, 790, 811, 878, 830, 887, 897, 945, 843, 901, 910, 952, 920, 958, 964, 990, 857, 916, 922, 961, 934, 967, 971, 998, 939, 973, 979, 1000, 984, 1004, 1006, 1017, 874, 929, 938, 969, 947, 976, 980, 1001, 955, 981, 987, 1005, 993, 1007, 1009, 1018, 963, 989, 995, 1008, 996, 1010, 1013, 1020, 1002, 1014, 1015, 1019, 1016, 1021, 1022, 1023]

TABLE Z20 with a sequence length of 1024:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 10 |
| 6 | 13 |
| 7 | 26 |
| 8 | 4 |
| 9 | 12 |
| 10 | 15 |
| 11 | 29 |
| 12 | 18 |
| 13 | 35 |
| 14 | 37 |
| 15 | 72 |
| 16 | 5 |
| 17 | 14 |
| 18 | 16 |
| 19 | 34 |
| 20 | 21 |
| 21 | 40 |
| 22 | 47 |
| 23 | 77 |
| 24 | 23 |
| 25 | 46 |
| 26 | 43 |
| 27 | 84 |
| 28 | 56 |
| 29 | 92 |
| 30 | 99 |
| 31 | 158 |
| 32 | 6 |
| 33 | 19 |
| 34 | 22 |
| 35 | 42 |
| 36 | 24 |
| 37 | 45 |
| 38 | 51 |
| 39 | 87 |
| 40 | 30 |
| 41 | 54 |
| 42 | 58 |
| 43 | 93 |
| 44 | 66 |
| 45 | 105 |
| 46 | 110 |
| 47 | 172 |
| 48 | 36 |
| 49 | 60 |
| 50 | 70 |
| 51 | 108 |
| 52 | 76 |
| 53 | 117 |
| 54 | 124 |
| 55 | 183 |
| 56 | 83 |
| 57 | 128 |
| 58 | 137 |
| 59 | 198 |
| 60 | 145 |

TABLE Z20-continued with a sequence length of 1024:

| Polarized channel sequence number | Reliability or reliability sequence number |
|---|---|
| 61 | 214 |
| 62 | 230 |
| 63 | 321 |
| 64 | 11 |
| 65 | 20 |
| 66 | 28 |
| 67 | 53 |
| 68 | 31 |
| 69 | 57 |
| 70 | 65 |
| 71 | 102 |
| 72 | 38 |
| 73 | 71 |
| 74 | 61 |
| 75 | 113 |
| 76 | 79 |
| 77 | 121 |
| 78 | 132 |
| 79 | 189 |
| 80 | 44 |
| 81 | 69 |
| 82 | 81 |
| 83 | 125 |
| 84 | 89 |
| 85 | 135 |
| 86 | 143 |
| 87 | 207 |
| 88 | 97 |
| 89 | 146 |
| 90 | 162 |
| 91 | 218 |
| 92 | 170 |
| 93 | 239 |
| 94 | 253 |
| 95 | 353 |
| 96 | 52 |
| 97 | 85 |
| 98 | 96 |
| 99 | 142 |
| 100 | 107 |
| 101 | 151 |
| 102 | 166 |
| 103 | 234 |
| 104 | 114 |
| 105 | 167 |
| 106 | 182 |
| 107 | 243 |
| 108 | 190 |
| 109 | 262 |
| 110 | 279 |
| 111 | 367 |
| 112 | 129 |
| 113 | 185 |
| 114 | 203 |
| 115 | 268 |
| 116 | 211 |
| 117 | 282 |
| 118 | 298 |
| 119 | 392 |
| 120 | 225 |
| 121 | 303 |
| 122 | 315 |
| 123 | 412 |
| 124 | 332 |
| 125 | 431 |
| 126 | 457 |
| 127 | 569 |
| 128 | 17 |
| 129 | 27 |
| 130 | 33 |
| 131 | 68 |
| 132 | 41 |
| 133 | 73 |
| 134 | 78 |
| 135 | 130 |

TABLE Z20-continued with a sequence length of 1024:

| Polarized channel sequence number | Reliability or reliability sequence number |
|---|---|
| 136 | 48 |
| 137 | 80 |
| 138 | 90 |
| 139 | 139 |
| 140 | 98 |
| 141 | 150 |
| 142 | 156 |
| 143 | 233 |
| 144 | 55 |
| 145 | 91 |
| 146 | 101 |
| 147 | 153 |
| 148 | 109 |
| 149 | 163 |
| 150 | 175 |
| 151 | 249 |
| 152 | 119 |
| 153 | 178 |
| 154 | 186 |
| 155 | 258 |
| 156 | 204 |
| 157 | 276 |
| 158 | 295 |
| 159 | 387 |
| 160 | 62 |
| 161 | 103 |
| 162 | 115 |
| 163 | 168 |
| 164 | 123 |
| 165 | 179 |
| 166 | 194 |
| 167 | 271 |
| 168 | 138 |
| 169 | 200 |
| 170 | 213 |
| 171 | 286 |
| 172 | 223 |
| 173 | 300 |
| 174 | 312 |
| 175 | 409 |
| 176 | 155 |
| 177 | 217 |
| 178 | 237 |
| 179 | 308 |
| 180 | 246 |
| 181 | 324 |
| 182 | 338 |
| 183 | 421 |
| 184 | 265 |
| 185 | 344 |
| 186 | 361 |
| 187 | 446 |
| 188 | 375 |
| 189 | 474 |
| 190 | 507 |
| 191 | 578 |
| 192 | 64 |
| 193 | 118 |
| 194 | 133 |
| 195 | 197 |
| 196 | 148 |
| 197 | 208 |
| 198 | 221 |
| 199 | 306 |
| 200 | 159 |
| 201 | 227 |
| 202 | 241 |
| 203 | 318 |
| 204 | 255 |
| 205 | 335 |
| 206 | 350 |
| 207 | 440 |
| 208 | 174 |
| 209 | 250 |
| 210 | 261 |

TABLE Z20-continued with a sequence length of 1024:

| Polarized channel sequence number | Reliability or reliability sequence number |
|---|---|
| 211 | 341 |
| 212 | 283 |
| 213 | 358 |
| 214 | 372 |
| 215 | 479 |
| 216 | 292 |
| 217 | 379 |
| 218 | 395 |
| 219 | 487 |
| 220 | 417 |
| 221 | 512 |
| 222 | 527 |
| 223 | 640 |
| 224 | 193 |
| 225 | 273 |
| 226 | 289 |
| 227 | 364 |
| 228 | 309 |
| 229 | 383 |
| 230 | 398 |
| 231 | 493 |
| 232 | 327 |
| 233 | 404 |
| 234 | 426 |
| 235 | 519 |
| 236 | 451 |
| 237 | 533 |
| 238 | 550 |
| 239 | 658 |
| 240 | 347 |
| 241 | 437 |
| 242 | 462 |
| 243 | 541 |
| 244 | 468 |
| 245 | 560 |
| 246 | 589 |
| 247 | 697 |
| 248 | 499 |
| 249 | 600 |
| 250 | 612 |
| 251 | 677 |
| 252 | 627 |
| 253 | 726 |
| 254 | 760 |
| 255 | 813 |
| 256 | 8 |
| 257 | 25 |
| 258 | 39 |
| 259 | 82 |
| 260 | 50 |
| 261 | 88 |
| 262 | 106 |
| 263 | 161 |
| 264 | 59 |
| 265 | 100 |
| 266 | 116 |
| 267 | 173 |
| 268 | 131 |
| 269 | 192 |
| 270 | 199 |
| 271 | 290 |
| 272 | 67 |
| 273 | 111 |
| 274 | 122 |
| 275 | 188 |
| 276 | 144 |
| 277 | 205 |
| 278 | 229 |
| 279 | 299 |
| 280 | 152 |
| 281 | 226 |
| 282 | 216 |
| 283 | 319 |
| 284 | 251 |
| 285 | 336 |

TABLE Z20-continued with a sequence length of 1024:

| Polarized channel sequence number | Reliability or reliability sequence number |
|---|---|
| 286 | 351 |
| 287 | 459 |
| 288 | 74 |
| 289 | 136 |
| 290 | 149 |
| 291 | 212 |
| 292 | 157 |
| 293 | 222 |
| 294 | 235 |
| 295 | 325 |
| 296 | 177 |
| 297 | 245 |
| 298 | 257 |
| 299 | 339 |
| 300 | 275 |
| 301 | 363 |
| 302 | 374 |
| 303 | 481 |
| 304 | 195 |
| 305 | 260 |
| 306 | 285 |
| 307 | 369 |
| 308 | 296 |
| 309 | 385 |
| 310 | 400 |
| 311 | 497 |
| 312 | 317 |
| 313 | 405 |
| 314 | 422 |
| 315 | 517 |
| 316 | 435 |
| 317 | 539 |
| 318 | 558 |
| 319 | 666 |
| 320 | 94 |
| 321 | 140 |
| 322 | 169 |
| 323 | 242 |
| 324 | 180 |
| 325 | 254 |
| 326 | 272 |
| 327 | 356 |
| 328 | 202 |
| 329 | 287 |
| 330 | 264 |
| 331 | 377 |
| 332 | 305 |
| 333 | 393 |
| 334 | 414 |
| 335 | 505 |
| 336 | 220 |
| 337 | 280 |
| 338 | 314 |
| 339 | 402 |
| 340 | 328 |
| 341 | 419 |
| 342 | 433 |
| 343 | 529 |
| 344 | 345 |
| 345 | 438 |
| 346 | 464 |
| 347 | 546 |
| 348 | 478 |
| 349 | 571 |
| 350 | 587 |
| 351 | 700 |
| 352 | 238 |
| 353 | 322 |
| 354 | 342 |
| 355 | 430 |
| 356 | 366 |
| 357 | 447 |
| 358 | 470 |
| 359 | 565 |
| 360 | 380 |

TABLE Z20-continued with a sequence length of 1024:

| Polarized channel sequence number | Reliability or reliability sequence number |
|---|---|
| 361 | 472 |
| 362 | 495 |
| 363 | 576 |
| 364 | 509 |
| 365 | 598 |
| 366 | 617 |
| 367 | 713 |
| 368 | 407 |
| 369 | 501 |
| 370 | 523 |
| 371 | 605 |
| 372 | 535 |
| 373 | 620 |
| 374 | 637 |
| 375 | 736 |
| 376 | 554 |
| 377 | 645 |
| 378 | 661 |
| 379 | 753 |
| 380 | 674 |
| 381 | 771 |
| 382 | 791 |
| 383 | 876 |
| 384 | 126 |
| 385 | 164 |
| 386 | 184 |
| 387 | 278 |
| 388 | 209 |
| 389 | 293 |
| 390 | 302 |
| 391 | 410 |
| 392 | 231 |
| 393 | 311 |
| 394 | 330 |
| 395 | 428 |
| 396 | 348 |
| 397 | 444 |
| 398 | 455 |
| 399 | 562 |
| 400 | 247 |
| 401 | 333 |
| 402 | 355 |
| 403 | 449 |
| 404 | 371 |
| 405 | 466 |
| 406 | 485 |
| 407 | 582 |
| 408 | 390 |
| 409 | 489 |
| 410 | 503 |
| 411 | 594 |
| 412 | 525 |
| 413 | 615 |
| 414 | 634 |
| 415 | 732 |
| 416 | 266 |
| 417 | 359 |
| 418 | 382 |
| 419 | 476 |
| 420 | 397 |
| 421 | 491 |
| 422 | 513 |
| 423 | 608 |
| 424 | 424 |
| 425 | 521 |
| 426 | 537 |
| 427 | 624 |
| 428 | 552 |
| 429 | 642 |
| 430 | 655 |
| 431 | 749 |
| 432 | 453 |
| 433 | 544 |
| 434 | 567 |
| 435 | 650 |

TABLE Z20-continued with a sequence length of 1024:

| Polarized channel sequence number | Reliability or reliability sequence number |
|---|---|
| 436 | 580 |
| 437 | 669 |
| 438 | 683 |
| 439 | 764 |
| 440 | 603 |
| 441 | 689 |
| 442 | 707 |
| 443 | 783 |
| 444 | 719 |
| 445 | 804 |
| 446 | 832 |
| 447 | 882 |
| 448 | 269 |
| 449 | 388 |
| 450 | 415 |
| 451 | 515 |
| 452 | 442 |
| 453 | 531 |
| 454 | 548 |
| 455 | 647 |
| 456 | 460 |
| 457 | 556 |
| 458 | 573 |
| 459 | 663 |
| 460 | 591 |
| 461 | 680 |
| 462 | 694 |
| 463 | 779 |
| 464 | 483 |
| 465 | 584 |
| 466 | 596 |
| 467 | 686 |
| 468 | 622 |
| 469 | 704 |
| 470 | 716 |
| 471 | 808 |
| 472 | 632 |
| 473 | 722 |
| 474 | 739 |
| 475 | 817 |
| 476 | 756 |
| 477 | 836 |
| 478 | 847 |
| 479 | 919 |
| 480 | 511 |
| 481 | 610 |
| 482 | 629 |
| 483 | 710 |
| 484 | 653 |
| 485 | 729 |
| 486 | 742 |
| 487 | 822 |
| 488 | 672 |
| 489 | 746 |
| 490 | 768 |
| 491 | 842 |
| 492 | 787 |
| 493 | 852 |
| 494 | 864 |
| 495 | 928 |
| 496 | 692 |
| 497 | 775 |
| 498 | 795 |
| 499 | 858 |
| 500 | 800 |
| 501 | 869 |
| 502 | 889 |
| 503 | 948 |
| 504 | 827 |
| 505 | 896 |
| 506 | 903 |
| 507 | 937 |
| 508 | 911 |
| 509 | 960 |
| 510 | 974 |

TABLE Z20-continued with a sequence length of 1024:

| Polarized channel sequence number | Reliability or reliability sequence number |
|---|---|
| 511 | 992 |
| 512 | 9 |
| 513 | 32 |
| 514 | 49 |
| 515 | 104 |
| 516 | 63 |
| 517 | 120 |
| 518 | 141 |
| 519 | 210 |
| 520 | 75 |
| 521 | 134 |
| 522 | 154 |
| 523 | 224 |
| 524 | 171 |
| 525 | 244 |
| 526 | 252 |
| 527 | 357 |
| 528 | 86 |
| 529 | 147 |
| 530 | 160 |
| 531 | 240 |
| 532 | 187 |
| 533 | 263 |
| 534 | 288 |
| 535 | 368 |
| 536 | 196 |
| 537 | 284 |
| 538 | 274 |
| 539 | 386 |
| 540 | 313 |
| 541 | 403 |
| 542 | 418 |
| 543 | 528 |
| 544 | 95 |
| 545 | 176 |
| 546 | 191 |
| 547 | 270 |
| 548 | 201 |
| 549 | 281 |
| 550 | 297 |
| 551 | 391 |
| 552 | 228 |
| 553 | 307 |
| 554 | 320 |
| 555 | 406 |
| 556 | 340 |
| 557 | 429 |
| 558 | 441 |
| 559 | 549 |
| 560 | 248 |
| 561 | 326 |
| 562 | 352 |
| 563 | 436 |
| 564 | 365 |
| 565 | 454 |
| 566 | 467 |
| 567 | 566 |
| 568 | 384 |
| 569 | 473 |
| 570 | 490 |
| 571 | 588 |
| 572 | 504 |
| 573 | 611 |
| 574 | 631 |
| 575 | 731 |
| 576 | 127 |
| 577 | 181 |
| 578 | 219 |
| 579 | 304 |
| 580 | 232 |
| 581 | 316 |
| 582 | 337 |
| 583 | 425 |
| 584 | 256 |
| 585 | 354 |

TABLE Z20-continued with a sequence length of 1024:

| Polarized channel sequence number | Reliability or reliability sequence number |
|---|---|
| 586 | 329 |
| 587 | 445 |
| 588 | 373 |
| 589 | 461 |
| 590 | 482 |
| 591 | 575 |
| 592 | 277 |
| 593 | 349 |
| 594 | 378 |
| 595 | 469 |
| 596 | 396 |
| 597 | 486 |
| 598 | 500 |
| 599 | 601 |
| 600 | 413 |
| 601 | 506 |
| 602 | 534 |
| 603 | 616 |
| 604 | 547 |
| 605 | 643 |
| 606 | 659 |
| 607 | 761 |
| 608 | 301 |
| 609 | 389 |
| 610 | 411 |
| 611 | 498 |
| 612 | 434 |
| 613 | 516 |
| 614 | 540 |
| 615 | 636 |
| 616 | 448 |
| 617 | 542 |
| 618 | 564 |
| 619 | 648 |
| 620 | 577 |
| 621 | 670 |
| 622 | 688 |
| 623 | 773 |
| 624 | 475 |
| 625 | 570 |
| 626 | 595 |
| 627 | 676 |
| 628 | 606 |
| 629 | 691 |
| 630 | 708 |
| 631 | 793 |
| 632 | 625 |
| 633 | 714 |
| 634 | 725 |
| 635 | 809 |
| 636 | 741 |
| 637 | 823 |
| 638 | 840 |
| 639 | 908 |
| 640 | 165 |
| 641 | 215 |
| 642 | 236 |
| 643 | 346 |
| 644 | 267 |
| 645 | 360 |
| 646 | 370 |
| 647 | 477 |
| 648 | 291 |
| 649 | 376 |
| 650 | 399 |
| 651 | 494 |
| 652 | 416 |
| 653 | 514 |
| 654 | 524 |
| 655 | 635 |
| 656 | 310 |
| 657 | 401 |
| 658 | 423 |
| 659 | 520 |
| 660 | 439 |

TABLE Z20-continued with a sequence length of 1024:

| Polarized channel sequence number | Reliability or reliability sequence number |
|---|---|
| 661 | 536 |
| 662 | 555 |
| 663 | 654 |
| 664 | 458 |
| 665 | 559 |
| 666 | 572 |
| 667 | 665 |
| 668 | 597 |
| 669 | 685 |
| 670 | 705 |
| 671 | 789 |
| 672 | 331 |
| 673 | 427 |
| 674 | 450 |
| 675 | 543 |
| 676 | 465 |
| 677 | 561 |
| 678 | 583 |
| 679 | 679 |
| 680 | 492 |
| 681 | 592 |
| 682 | 609 |
| 683 | 696 |
| 684 | 623 |
| 685 | 711 |
| 686 | 723 |
| 687 | 806 |
| 688 | 522 |
| 689 | 614 |
| 690 | 639 |
| 691 | 718 |
| 692 | 651 |
| 693 | 734 |
| 694 | 747 |
| 695 | 815 |
| 696 | 673 |
| 697 | 752 |
| 698 | 767 |
| 699 | 833 |
| 700 | 780 |
| 701 | 851 |
| 702 | 872 |
| 703 | 913 |
| 704 | 334 |
| 705 | 456 |
| 706 | 484 |
| 707 | 586 |
| 708 | 508 |
| 709 | 602 |
| 710 | 619 |
| 711 | 717 |
| 712 | 530 |
| 713 | 628 |
| 714 | 644 |
| 715 | 728 |
| 716 | 662 |
| 717 | 744 |
| 718 | 758 |
| 719 | 829 |
| 720 | 553 |
| 721 | 656 |
| 722 | 668 |
| 723 | 750 |
| 724 | 693 |
| 725 | 765 |
| 726 | 777 |
| 727 | 855 |
| 728 | 702 |
| 729 | 782 |
| 730 | 796 |
| 731 | 860 |
| 732 | 812 |
| 733 | 875 |
| 734 | 885 |
| 735 | 942 |

TABLE Z20-continued with a sequence length of 1024:

| Polarized channel sequence number | Reliability or reliability sequence number |
|---|---|
| 736 | 581 |
| 737 | 682 |
| 738 | 699 |
| 739 | 770 |
| 740 | 720 |
| 741 | 786 |
| 742 | 798 |
| 743 | 863 |
| 744 | 737 |
| 745 | 802 |
| 746 | 819 |
| 747 | 880 |
| 748 | 837 |
| 749 | 888 |
| 750 | 898 |
| 751 | 950 |
| 752 | 755 |
| 753 | 826 |
| 754 | 844 |
| 755 | 893 |
| 756 | 848 |
| 757 | 904 |
| 758 | 918 |
| 759 | 965 |
| 760 | 867 |
| 761 | 924 |
| 762 | 930 |
| 763 | 957 |
| 764 | 936 |
| 765 | 975 |
| 766 | 985 |
| 767 | 999 |
| 768 | 112 |
| 769 | 206 |
| 770 | 259 |
| 771 | 381 |
| 772 | 294 |
| 773 | 394 |
| 774 | 432 |
| 775 | 532 |
| 776 | 323 |
| 777 | 420 |
| 778 | 452 |
| 779 | 551 |
| 780 | 480 |
| 781 | 579 |
| 782 | 590 |
| 783 | 701 |
| 784 | 343 |
| 785 | 443 |
| 786 | 463 |
| 787 | 574 |
| 788 | 502 |
| 789 | 599 |
| 790 | 630 |
| 791 | 709 |
| 792 | 518 |
| 793 | 626 |
| 794 | 613 |
| 795 | 730 |
| 796 | 657 |
| 797 | 745 |
| 798 | 759 |
| 799 | 841 |
| 800 | 362 |
| 801 | 488 |
| 802 | 510 |
| 803 | 607 |
| 804 | 526 |
| 805 | 621 |
| 806 | 638 |
| 807 | 735 |
| 808 | 557 |
| 809 | 649 |
| 810 | 664 |

TABLE Z20-continued with a sequence length of 1024:

| Polarized channel sequence number | Reliability or reliability sequence number |
|---|---|
| 811 | 748 |
| 812 | 684 |
| 813 | 769 |
| 814 | 778 |
| 815 | 856 |
| 816 | 585 |
| 817 | 667 |
| 818 | 695 |
| 819 | 774 |
| 820 | 706 |
| 821 | 788 |
| 822 | 799 |
| 823 | 866 |
| 824 | 727 |
| 825 | 803 |
| 826 | 816 |
| 827 | 879 |
| 828 | 825 |
| 829 | 892 |
| 830 | 902 |
| 831 | 953 |
| 832 | 408 |
| 833 | 496 |
| 834 | 545 |
| 835 | 646 |
| 836 | 563 |
| 837 | 660 |
| 838 | 681 |
| 839 | 763 |
| 840 | 593 |
| 841 | 698 |
| 842 | 671 |
| 843 | 781 |
| 844 | 715 |
| 845 | 794 |
| 846 | 810 |
| 847 | 871 |
| 848 | 618 |
| 849 | 690 |
| 850 | 724 |
| 851 | 801 |
| 852 | 738 |
| 853 | 814 |
| 854 | 824 |
| 855 | 886 |
| 856 | 754 |
| 857 | 828 |
| 858 | 845 |
| 859 | 895 |
| 860 | 854 |
| 861 | 909 |
| 862 | 917 |
| 863 | 966 |
| 864 | 641 |
| 865 | 733 |
| 866 | 751 |
| 867 | 821 |
| 868 | 772 |
| 869 | 834 |
| 870 | 849 |
| 871 | 906 |
| 872 | 784 |
| 873 | 850 |
| 874 | 865 |
| 875 | 912 |
| 876 | 873 |
| 877 | 923 |
| 878 | 932 |
| 879 | 970 |
| 880 | 805 |
| 881 | 868 |
| 882 | 883 |
| 883 | 926 |
| 884 | 890 |
| 885 | 933 |
| 886 | 941 |
| 887 | 978 |
| 888 | 900 |
| 889 | 944 |
| 890 | 951 |
| 891 | 983 |
| 892 | 956 |
| 893 | 988 |
| 894 | 994 |
| 895 | 1011 |
| 896 | 471 |
| 897 | 538 |
| 898 | 568 |
| 899 | 687 |
| 900 | 604 |
| 901 | 703 |
| 902 | 712 |
| 903 | 807 |
| 904 | 633 |
| 905 | 721 |
| 906 | 740 |
| 907 | 820 |
| 908 | 757 |
| 909 | 831 |
| 910 | 839 |
| 911 | 905 |
| 912 | 652 |
| 913 | 743 |
| 914 | 762 |
| 915 | 835 |
| 916 | 776 |
| 917 | 846 |
| 918 | 859 |
| 919 | 915 |
| 920 | 792 |
| 921 | 861 |
| 922 | 870 |
| 923 | 921 |
| 924 | 884 |
| 925 | 931 |
| 926 | 940 |
| 927 | 977 |
| 928 | 675 |
| 929 | 766 |
| 930 | 785 |
| 931 | 853 |
| 932 | 797 |
| 933 | 862 |
| 934 | 877 |
| 935 | 927 |
| 936 | 818 |
| 937 | 881 |
| 938 | 891 |
| 939 | 935 |
| 940 | 899 |
| 941 | 943 |
| 942 | 949 |
| 943 | 982 |
| 944 | 838 |
| 945 | 894 |
| 946 | 907 |
| 947 | 946 |
| 948 | 914 |
| 949 | 954 |
| 950 | 959 |
| 951 | 986 |
| 952 | 925 |
| 953 | 962 |
| 954 | 968 |
| 955 | 991 |
| 956 | 972 |
| 957 | 997 |
| 958 | 1003 |
| 959 | 1012 |
| 960 | 678 |

TABLE Z20-continued

| with a sequence length of 1024: | |
|---|---|
| Polarized channel sequence number | Reliability or reliability sequence number |
| 961 | 790 |
| 962 | 811 |
| 963 | 878 |
| 964 | 830 |
| 965 | 887 |
| 966 | 897 |
| 967 | 945 |
| 968 | 843 |
| 969 | 901 |
| 970 | 910 |
| 971 | 952 |
| 972 | 920 |
| 973 | 958 |
| 974 | 964 |
| 975 | 990 |
| 976 | 857 |
| 977 | 916 |
| 978 | 922 |
| 979 | 961 |
| 980 | 934 |
| 981 | 967 |
| 982 | 971 |
| 983 | 998 |
| 984 | 939 |
| 985 | 973 |
| 986 | 979 |
| 987 | 1000 |
| 988 | 984 |
| 989 | 1004 |
| 990 | 1006 |
| 991 | 1017 |
| 992 | 874 |
| 993 | 929 |
| 994 | 938 |
| 995 | 969 |
| 996 | 947 |
| 997 | 976 |
| 998 | 980 |
| 999 | 1001 |
| 1000 | 955 |
| 1001 | 981 |
| 1002 | 987 |
| 1003 | 1005 |
| 1004 | 993 |
| 1005 | 1007 |
| 1006 | 1009 |
| 1007 | 1018 |
| 1008 | 963 |
| 1009 | 989 |
| 1010 | 995 |
| 1011 | 1008 |
| 1012 | 996 |
| 1013 | 1010 |
| 1014 | 1013 |
| 1015 | 1020 |
| 1016 | 1002 |
| 1017 | 1014 |
| 1018 | 1015 |
| 1019 | 1019 |
| 1020 | 1016 |
| 1021 | 1021 |
| 1022 | 1022 |
| 1023 | 1023 |

Sequence Z21, with a sequence length of 512:

[0, 1, 2, 7, 3, 9, 12, 25, 4, 11, 14, 28, 17, 33, 35, 68, 5, 13, 15, 32, 20, 38, 45, 72, 22, 44, 41, 79, 53, 86, 92, 143, 6, 18, 21, 40, 23, 43, 48, 81, 29, 51, 55, 87, 62, 97, 102, 154, 34, 57, 66, 100, 71, 1 08, 114, 163, 78, 117, 125, 175, 132, 188, 200, 265, 10, 19, 27, 50, 30, 54, 61, 95, 36, 67, 58, 104, 7 4, 111, 121, 168, 42, 65, 76, 115, 83, 123, 130, 182, 90, 133, 146, 191, 153, 207, 217, 286, 49, 80, 8 9, 129, 99, 137, 149, 203, 105, 150, 162, 210, 169, 224, 236, 295, 118, 165, 179, 228, 185, 238, 24 9, 310, 196, 253, 261, 322, 272, 333, 347, 404, 16, 26, 31, 64, 39, 69, 73, 119, 46, 75, 84, 127, 91, 1 36, 141, 202, 52, 85, 94, 139, 101, 147, 157, 214, 110, 159, 166, 221, 180, 234, 247, 307, 59, 96, 1 06, 151, 113, 160, 172, 230, 126, 177, 187, 241, 195, 251, 259, 320, 140, 190, 205, 256, 212, 267, 276, 327, 226, 280, 291, 341, 300, 356, 373, 408, 60, 109, 122, 174, 134, 183, 193, 255, 144, 198, 208, 263, 219, 274, 284, 338, 156, 215, 223, 278, 239, 289, 298, 359, 245, 302, 312, 363, 325, 37 6, 384, 434, 171, 232, 243, 293, 257, 305, 314, 366, 269, 317, 330, 380, 344, 387, 395, 441, 282, 3 36, 350, 391, 353, 400, 413, 455, 369, 418, 423, 448, 429, 464, 474, 487, 8, 24, 37, 77, 47, 82, 98, 1 45, 56, 93, 107, 155, 120, 170, 176, 244, 63, 103, 112, 167, 131, 181, 199, 250, 138, 197, 189, 264, 216, 275, 285, 348, 70, 124, 135, 186, 142, 194, 204, 268, 158, 211, 220, 277, 233, 292, 299, 360, 173, 222, 240, 296, 248, 306, 315, 368, 262, 318, 328, 379, 335, 390, 399, 444, 88, 128, 152, 209, 161, 218, 231, 288, 178, 242, 225, 301, 254, 311, 323, 372, 192, 237, 260, 316, 270, 326, 334, 38 5, 281, 337, 351, 393, 358, 405, 412, 456, 206, 266, 279, 332, 294, 342, 354, 402, 303, 355, 367, 4 07, 374, 417, 425, 460, 319, 370, 382, 420, 388, 426, 433, 467, 397, 436, 442, 472, 447, 477, 482, 499, 116, 148, 164, 235, 184, 246, 252, 321, 201, 258, 271, 331, 283, 340, 346, 401, 213, 273, 28 7, 343, 297, 352, 362, 410, 309, 364, 371, 415, 383, 424, 432, 466, 227, 290, 304, 357, 313, 365, 3 77, 421, 329, 381, 389, 428, 396, 435, 440, 471, 345, 392, 403, 438, 409, 445, 450, 475, 419, 452, 458, 480, 462, 485, 491, 500, 229, 308, 324, 378, 339, 386, 394, 437, 349, 398, 406, 443, 414, 44 9, 454, 479, 361, 411, 416, 451, 427, 457, 461, 486, 431, 463, 468, 488, 473, 492, 494, 505, 375, 4 22, 430, 459, 439, 465, 469, 489, 446, 470, 476, 493, 481, 495, 497, 506, 453, 478, 483, 496, 484, 498, 501, 508, 490, 502, 503, 507, 504, 509, 510, 511]

TABLE Z21

| with a sequence length of 512: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 9 |
| 6 | 12 |
| 7 | 25 |
| 8 | 4 |
| 9 | 11 |
| 10 | 14 |
| 11 | 28 |
| 12 | 17 |
| 13 | 33 |
| 14 | 35 |
| 15 | 68 |
| 16 | 5 |
| 17 | 13 |
| 18 | 15 |
| 19 | 32 |
| 20 | 20 |
| 21 | 38 |
| 22 | 45 |
| 23 | 72 |
| 24 | 22 |
| 25 | 44 |
| 26 | 41 |

TABLE Z21-continued with a sequence length of 512:

| Polarized channel sequence number | Reliability or reliability sequence number |
|---|---|
| 27 | 79 |
| 28 | 53 |
| 29 | 86 |
| 30 | 92 |
| 31 | 143 |
| 32 | 6 |
| 33 | 18 |
| 34 | 21 |
| 35 | 40 |
| 36 | 23 |
| 37 | 43 |
| 38 | 48 |
| 39 | 81 |
| 40 | 29 |
| 41 | 51 |
| 42 | 55 |
| 43 | 87 |
| 44 | 62 |
| 45 | 97 |
| 46 | 102 |
| 47 | 154 |
| 48 | 34 |
| 49 | 57 |
| 50 | 66 |
| 51 | 100 |
| 52 | 71 |
| 53 | 108 |
| 54 | 114 |
| 55 | 163 |
| 56 | 78 |
| 57 | 117 |
| 58 | 125 |
| 59 | 175 |
| 60 | 132 |
| 61 | 188 |
| 62 | 200 |
| 63 | 265 |
| 64 | 10 |
| 65 | 19 |
| 66 | 27 |
| 67 | 50 |
| 68 | 30 |
| 69 | 54 |
| 70 | 61 |
| 71 | 95 |
| 72 | 36 |
| 73 | 67 |
| 74 | 58 |
| 75 | 104 |
| 76 | 74 |
| 77 | 111 |
| 78 | 121 |
| 79 | 168 |
| 80 | 42 |
| 81 | 65 |
| 82 | 76 |
| 83 | 115 |
| 84 | 83 |
| 85 | 123 |
| 86 | 130 |
| 87 | 182 |
| 88 | 90 |
| 89 | 133 |
| 90 | 146 |
| 91 | 191 |
| 92 | 153 |
| 93 | 207 |
| 94 | 217 |
| 95 | 286 |
| 96 | 49 |
| 97 | 80 |
| 98 | 89 |
| 99 | 129 |
| 100 | 99 |
| 101 | 137 |

TABLE Z21-continued with a sequence length of 512:

| Polarized channel sequence number | Reliability or reliability sequence number |
|---|---|
| 102 | 149 |
| 103 | 203 |
| 104 | 105 |
| 105 | 150 |
| 106 | 162 |
| 107 | 210 |
| 108 | 169 |
| 109 | 224 |
| 110 | 236 |
| 111 | 295 |
| 112 | 118 |
| 113 | 165 |
| 114 | 179 |
| 115 | 228 |
| 116 | 185 |
| 117 | 238 |
| 118 | 249 |
| 119 | 310 |
| 120 | 196 |
| 121 | 253 |
| 122 | 261 |
| 123 | 322 |
| 124 | 272 |
| 125 | 333 |
| 126 | 347 |
| 127 | 404 |
| 128 | 16 |
| 129 | 26 |
| 130 | 31 |
| 131 | 64 |
| 132 | 39 |
| 133 | 69 |
| 134 | 73 |
| 135 | 119 |
| 136 | 46 |
| 137 | 75 |
| 138 | 84 |
| 139 | 127 |
| 140 | 91 |
| 141 | 136 |
| 142 | 141 |
| 143 | 202 |
| 144 | 52 |
| 145 | 85 |
| 146 | 94 |
| 147 | 139 |
| 148 | 101 |
| 149 | 147 |
| 150 | 157 |
| 151 | 214 |
| 152 | 110 |
| 153 | 159 |
| 154 | 166 |
| 155 | 221 |
| 156 | 180 |
| 157 | 234 |
| 158 | 247 |
| 159 | 307 |
| 160 | 59 |
| 161 | 96 |
| 162 | 106 |
| 163 | 151 |
| 164 | 113 |
| 165 | 160 |
| 166 | 172 |
| 167 | 230 |
| 168 | 126 |
| 169 | 177 |
| 170 | 187 |
| 171 | 241 |
| 172 | 195 |
| 173 | 251 |
| 174 | 259 |
| 175 | 320 |
| 176 | 140 |

TABLE Z21-continued

| with a sequence length of 512: | |
|---|---|
| Polarized channel sequence number | Reliability or reliability sequence number |
| 177 | 190 |
| 178 | 205 |
| 179 | 256 |
| 180 | 212 |
| 181 | 267 |
| 182 | 276 |
| 183 | 327 |
| 184 | 226 |
| 185 | 280 |
| 186 | 291 |
| 187 | 341 |
| 188 | 300 |
| 189 | 356 |
| 190 | 373 |
| 191 | 408 |
| 192 | 60 |
| 193 | 109 |
| 194 | 122 |
| 195 | 174 |
| 196 | 134 |
| 197 | 183 |
| 198 | 193 |
| 199 | 255 |
| 200 | 144 |
| 201 | 198 |
| 202 | 208 |
| 203 | 263 |
| 204 | 219 |
| 205 | 274 |
| 206 | 284 |
| 207 | 338 |
| 208 | 156 |
| 209 | 215 |
| 210 | 223 |
| 211 | 278 |
| 212 | 239 |
| 213 | 289 |
| 214 | 298 |
| 215 | 359 |
| 216 | 245 |
| 217 | 302 |
| 218 | 312 |
| 219 | 363 |
| 220 | 325 |
| 221 | 376 |
| 222 | 384 |
| 223 | 434 |
| 224 | 171 |
| 225 | 232 |
| 226 | 243 |
| 227 | 293 |
| 228 | 257 |
| 229 | 305 |
| 230 | 314 |
| 231 | 366 |
| 232 | 269 |
| 233 | 317 |
| 234 | 330 |
| 235 | 380 |
| 236 | 344 |
| 237 | 387 |
| 238 | 395 |
| 239 | 441 |
| 240 | 282 |
| 241 | 336 |
| 242 | 350 |
| 243 | 391 |
| 244 | 353 |
| 245 | 400 |
| 246 | 413 |
| 247 | 455 |
| 248 | 369 |
| 249 | 418 |
| 250 | 423 |
| 251 | 448 |

TABLE Z21-continued

| with a sequence length of 512: | |
|---|---|
| Polarized channel sequence number | Reliability or reliability sequence number |
| 252 | 429 |
| 253 | 464 |
| 254 | 474 |
| 255 | 487 |
| 256 | 8 |
| 257 | 24 |
| 258 | 37 |
| 259 | 77 |
| 260 | 47 |
| 261 | 82 |
| 262 | 98 |
| 263 | 145 |
| 264 | 56 |
| 265 | 93 |
| 266 | 107 |
| 267 | 155 |
| 268 | 120 |
| 269 | 170 |
| 270 | 176 |
| 271 | 244 |
| 272 | 63 |
| 273 | 103 |
| 274 | 112 |
| 275 | 167 |
| 276 | 131 |
| 277 | 181 |
| 278 | 199 |
| 279 | 250 |
| 280 | 138 |
| 281 | 197 |
| 282 | 189 |
| 283 | 264 |
| 284 | 216 |
| 285 | 275 |
| 286 | 285 |
| 287 | 348 |
| 288 | 70 |
| 289 | 124 |
| 290 | 135 |
| 291 | 186 |
| 292 | 142 |
| 293 | 194 |
| 294 | 204 |
| 295 | 268 |
| 296 | 158 |
| 297 | 211 |
| 298 | 220 |
| 299 | 277 |
| 300 | 233 |
| 301 | 292 |
| 302 | 299 |
| 303 | 360 |
| 304 | 173 |
| 305 | 222 |
| 306 | 240 |
| 307 | 296 |
| 308 | 248 |
| 309 | 306 |
| 310 | 315 |
| 311 | 368 |
| 312 | 262 |
| 313 | 318 |
| 314 | 328 |
| 315 | 379 |
| 316 | 335 |
| 317 | 390 |
| 318 | 399 |
| 319 | 444 |
| 320 | 88 |
| 321 | 128 |
| 322 | 152 |
| 323 | 209 |
| 324 | 161 |
| 325 | 218 |
| 326 | 231 |

TABLE Z21-continued with a sequence length of 512:

| Polarized channel sequence number | Reliability or reliability sequence number |
|---|---|
| 327 | 288 |
| 328 | 178 |
| 329 | 242 |
| 330 | 225 |
| 331 | 301 |
| 332 | 254 |
| 333 | 311 |
| 334 | 323 |
| 335 | 372 |
| 336 | 192 |
| 337 | 237 |
| 338 | 260 |
| 339 | 316 |
| 340 | 270 |
| 341 | 326 |
| 342 | 334 |
| 343 | 385 |
| 344 | 281 |
| 345 | 337 |
| 346 | 351 |
| 347 | 393 |
| 348 | 358 |
| 349 | 405 |
| 350 | 412 |
| 351 | 456 |
| 352 | 206 |
| 353 | 266 |
| 354 | 279 |
| 355 | 332 |
| 356 | 294 |
| 357 | 342 |
| 358 | 354 |
| 359 | 402 |
| 360 | 303 |
| 361 | 355 |
| 362 | 367 |
| 363 | 407 |
| 364 | 374 |
| 365 | 417 |
| 366 | 425 |
| 367 | 460 |
| 368 | 319 |
| 369 | 370 |
| 370 | 382 |
| 371 | 420 |
| 372 | 388 |
| 373 | 426 |
| 374 | 433 |
| 375 | 467 |
| 376 | 397 |
| 377 | 436 |
| 378 | 442 |
| 379 | 472 |
| 380 | 447 |
| 381 | 477 |
| 382 | 482 |
| 383 | 499 |
| 384 | 116 |
| 385 | 148 |
| 386 | 164 |
| 387 | 235 |
| 388 | 184 |
| 389 | 246 |
| 390 | 252 |
| 391 | 321 |
| 392 | 201 |
| 393 | 258 |
| 394 | 271 |
| 395 | 331 |
| 396 | 283 |
| 397 | 340 |
| 398 | 346 |
| 399 | 401 |
| 400 | 213 |
| 401 | 273 |

TABLE Z21-continued with a sequence length of 512:

| Polarized channel sequence number | Reliability or reliability sequence number |
|---|---|
| 402 | 287 |
| 403 | 343 |
| 404 | 297 |
| 405 | 352 |
| 406 | 362 |
| 407 | 410 |
| 408 | 309 |
| 409 | 364 |
| 410 | 371 |
| 411 | 415 |
| 412 | 383 |
| 413 | 424 |
| 414 | 432 |
| 415 | 466 |
| 416 | 227 |
| 417 | 290 |
| 418 | 304 |
| 419 | 357 |
| 420 | 313 |
| 421 | 365 |
| 422 | 377 |
| 423 | 421 |
| 424 | 329 |
| 425 | 381 |
| 426 | 389 |
| 427 | 428 |
| 428 | 396 |
| 429 | 435 |
| 430 | 440 |
| 431 | 471 |
| 432 | 345 |
| 433 | 392 |
| 434 | 403 |
| 435 | 438 |
| 436 | 409 |
| 437 | 445 |
| 438 | 450 |
| 439 | 475 |
| 440 | 419 |
| 441 | 452 |
| 442 | 458 |
| 443 | 480 |
| 444 | 462 |
| 445 | 485 |
| 446 | 491 |
| 447 | 500 |
| 448 | 229 |
| 449 | 308 |
| 450 | 324 |
| 451 | 378 |
| 452 | 339 |
| 453 | 386 |
| 454 | 394 |
| 455 | 437 |
| 456 | 349 |
| 457 | 398 |
| 458 | 406 |
| 459 | 443 |
| 460 | 414 |
| 461 | 449 |
| 462 | 454 |
| 463 | 479 |
| 464 | 361 |
| 465 | 411 |
| 466 | 416 |
| 467 | 451 |
| 468 | 427 |
| 469 | 457 |
| 470 | 461 |
| 471 | 486 |
| 472 | 431 |
| 473 | 463 |
| 474 | 468 |
| 475 | 488 |
| 476 | 473 |

TABLE Z21-continued with a sequence length of 512:

| Polarized channel sequence number | Reliability or reliability sequence number |
|---|---|
| 477 | 492 |
| 478 | 494 |
| 479 | 505 |
| 480 | 375 |
| 481 | 422 |
| 482 | 430 |
| 483 | 459 |
| 484 | 439 |
| 485 | 465 |
| 486 | 469 |
| 487 | 489 |
| 488 | 446 |
| 489 | 470 |
| 490 | 476 |
| 491 | 493 |
| 492 | 481 |
| 493 | 495 |
| 494 | 497 |
| 495 | 506 |
| 496 | 453 |
| 497 | 478 |
| 498 | 483 |
| 499 | 496 |
| 500 | 484 |
| 501 | 498 |
| 502 | 501 |
| 503 | 508 |
| 504 | 490 |
| 505 | 502 |
| 506 | 503 |
| 507 | 507 |
| 508 | 504 |
| 509 | 509 |
| 510 | 510 |
| 511 | 511 |

Sequence Z22, with a sequence length of 256:

0, 1, 2, 7, 3, 8, 11, 23, 4, 10, 13, 26, 16, 31, 33, 62, 5, 12, 14, 30, 19, 35, 42, 65, 21, 41, 38, 71, 49, 77, 82, 120, 6, 17, 20, 37, 22, 40, 44, 73, 27, 47, 51, 78, 57, 86, 90, 128, 32, 52, 60, 88, 64, 94, 99, 134, 70, 101, 107, 142, 112, 150, 157, 193, 9, 18, 25, 46, 28, 50, 56, 84, 34, 61, 53, 91, 67, 97, 10 4, 137, 39, 59, 69, 100, 74, 106, 111, 146, 80, 113, 122, 152, 127, 161, 167, 203, 45, 72, 79, 110, 87, 116, 124, 159, 92, 125, 133, 163, 138, 171, 177, 207, 102, 135, 144, 173, 148, 178, 184, 213, 155, 186, 191, 218, 196, 222, 227, 243, 15, 24, 29, 58, 36, 63, 66, 103, 43, 68, 75, 109, 81, 115, 119, 158, 48, 76, 83, 117, 89, 123, 130, 165, 96, 131, 136, 169, 145, 176, 183, 212, 54, 85, 93, 126, 98, 132, 140, 174, 108, 143, 149, 180, 154, 185, 190, 217, 118, 151, 160, 188, 164, 194, 198, 220, 172, 20 0, 205, 225, 209, 230, 235, 244, 55, 95, 105, 141, 114, 147, 153, 187, 121, 156, 162, 192, 168, 197, 202, 224, 129, 166, 170, 199, 179, 204, 208, 231, 182, 210, 214, 232, 219, 236, 238, 249, 139, 17 5, 181, 206, 189, 211, 215, 233, 195, 216, 221, 237, 226, 239, 241, 250, 201, 223, 228, 240, 229, 2 42, 245, 252, 234, 246, 247, 251, 248, 253, 254, 255

TABLE Z22 with a sequence length of 256:

| Polarized channel sequence number | Reliability or reliability sequence number |
|---|---|
| 0 | 0 |
| 1 | 1 |

TABLE Z22-continued with a sequence length of 256:

| Polarized channel sequence number | Reliability or reliability sequence number |
|---|---|
| 2 | 2 |
| 3 | 7 |
| 4 | 3 |
| 5 | 8 |
| 6 | 11 |
| 7 | 23 |
| 8 | 4 |
| 9 | 10 |
| 10 | 13 |
| 11 | 26 |
| 12 | 16 |
| 13 | 31 |
| 14 | 33 |
| 15 | 62 |
| 16 | 5 |
| 17 | 12 |
| 18 | 14 |
| 19 | 30 |
| 20 | 19 |
| 21 | 35 |
| 22 | 42 |
| 23 | 65 |
| 24 | 21 |
| 25 | 41 |
| 26 | 38 |
| 27 | 71 |
| 28 | 49 |
| 29 | 77 |
| 30 | 82 |
| 31 | 120 |
| 32 | 6 |
| 33 | 17 |
| 34 | 20 |
| 35 | 37 |
| 36 | 22 |
| 37 | 40 |
| 38 | 44 |
| 39 | 73 |
| 40 | 27 |
| 41 | 47 |
| 42 | 51 |
| 43 | 78 |
| 44 | 57 |
| 45 | 86 |
| 46 | 90 |
| 47 | 128 |
| 48 | 32 |
| 49 | 52 |
| 50 | 60 |
| 51 | 88 |
| 52 | 64 |
| 53 | 94 |
| 54 | 99 |
| 55 | 134 |
| 56 | 70 |
| 57 | 101 |
| 58 | 107 |
| 59 | 142 |
| 60 | 112 |
| 61 | 150 |
| 62 | 157 |
| 63 | 193 |
| 64 | 9 |
| 65 | 18 |
| 66 | 25 |
| 67 | 46 |
| 68 | 28 |
| 69 | 50 |
| 70 | 56 |
| 71 | 84 |
| 72 | 34 |
| 73 | 61 |
| 74 | 53 |
| 75 | 91 |
| 76 | 67 |

TABLE Z22-continued with a sequence length of 256:

| Polarized channel sequence number | Reliability or reliability sequence number |
|---|---|
| 77 | 97 |
| 78 | 104 |
| 79 | 137 |
| 80 | 39 |
| 81 | 59 |
| 82 | 69 |
| 83 | 100 |
| 84 | 74 |
| 85 | 106 |
| 86 | 111 |
| 87 | 146 |
| 88 | 80 |
| 89 | 113 |
| 90 | 122 |
| 91 | 152 |
| 92 | 127 |
| 93 | 161 |
| 94 | 167 |
| 95 | 203 |
| 96 | 45 |
| 97 | 72 |
| 98 | 79 |
| 99 | 110 |
| 100 | 87 |
| 101 | 116 |
| 102 | 124 |
| 103 | 159 |
| 104 | 92 |
| 105 | 125 |
| 106 | 133 |
| 107 | 163 |
| 108 | 138 |
| 109 | 171 |
| 110 | 177 |
| 111 | 207 |
| 112 | 102 |
| 113 | 135 |
| 114 | 144 |
| 115 | 173 |
| 116 | 148 |
| 117 | 178 |
| 118 | 184 |
| 119 | 213 |
| 120 | 155 |
| 121 | 186 |
| 122 | 191 |
| 123 | 218 |
| 124 | 196 |
| 125 | 222 |
| 126 | 227 |
| 127 | 243 |
| 128 | 15 |
| 129 | 24 |
| 130 | 29 |
| 131 | 58 |
| 132 | 36 |
| 133 | 63 |
| 134 | 66 |
| 135 | 103 |
| 136 | 43 |
| 137 | 68 |
| 138 | 75 |
| 139 | 109 |
| 140 | 81 |
| 141 | 115 |
| 142 | 119 |
| 143 | 158 |
| 144 | 48 |
| 145 | 76 |
| 146 | 83 |
| 147 | 117 |
| 148 | 89 |
| 149 | 123 |
| 150 | 130 |
| 151 | 165 |

TABLE Z22-continued with a sequence length of 256:

| Polarized channel sequence number | Reliability or reliability sequence number |
|---|---|
| 152 | 96 |
| 153 | 131 |
| 154 | 136 |
| 155 | 169 |
| 156 | 145 |
| 157 | 176 |
| 158 | 183 |
| 159 | 212 |
| 160 | 54 |
| 161 | 85 |
| 162 | 93 |
| 163 | 126 |
| 164 | 98 |
| 165 | 132 |
| 166 | 140 |
| 167 | 174 |
| 168 | 108 |
| 169 | 143 |
| 170 | 149 |
| 171 | 180 |
| 172 | 154 |
| 173 | 185 |
| 174 | 190 |
| 175 | 217 |
| 176 | 118 |
| 177 | 151 |
| 178 | 160 |
| 179 | 188 |
| 180 | 164 |
| 181 | 194 |
| 182 | 198 |
| 183 | 220 |
| 184 | 172 |
| 185 | 200 |
| 186 | 205 |
| 187 | 225 |
| 188 | 209 |
| 189 | 230 |
| 190 | 235 |
| 191 | 244 |
| 192 | 55 |
| 193 | 95 |
| 194 | 105 |
| 195 | 141 |
| 196 | 114 |
| 197 | 147 |
| 198 | 153 |
| 199 | 187 |
| 200 | 121 |
| 201 | 156 |
| 202 | 162 |
| 203 | 192 |
| 204 | 168 |
| 205 | 197 |
| 206 | 202 |
| 207 | 224 |
| 208 | 129 |
| 209 | 166 |
| 210 | 170 |
| 211 | 199 |
| 212 | 179 |
| 213 | 204 |
| 214 | 208 |
| 215 | 231 |
| 216 | 182 |
| 217 | 210 |
| 218 | 214 |
| 219 | 232 |
| 220 | 219 |
| 221 | 236 |
| 222 | 238 |
| 223 | 249 |
| 224 | 139 |
| 225 | 175 |
| 226 | 181 |

TABLE Z22-continued

| with a sequence length of 256: | |
|---|---|
| Polarized channel sequence number | Reliability or reliability sequence number |
| 227 | 206 |
| 228 | 189 |
| 229 | 211 |
| 230 | 215 |
| 231 | 233 |
| 232 | 195 |
| 233 | 216 |
| 234 | 221 |
| 235 | 237 |
| 236 | 226 |
| 237 | 239 |
| 238 | 241 |
| 239 | 250 |
| 240 | 201 |
| 241 | 223 |
| 242 | 228 |
| 243 | 240 |
| 244 | 229 |
| 245 | 242 |
| 246 | 245 |
| 247 | 252 |
| 248 | 234 |
| 249 | 246 |
| 250 | 247 |
| 251 | 251 |
| 252 | 248 |
| 253 | 253 |
| 254 | 254 |
| 255 | 255 |

Sequence Z23, with a sequence length of 128:
[0, 1, 2, 7, 3, 8, 11, 22, 4, 10, 13, 24, 15, 28, 30, 53, 5, 12, 14, 27, 18, 32, 38, 55, 20, 37, 34, 59, 43, 63, 67, 89, 6, 16, 19, 33, 21, 36, 39, 61, 25, 42, 45, 64, 49, 69, 72, 94, 29, 46, 51, 71, 54, 75, 77, 96, 58, 79, 83, 100, 86, 104, 107, 119, 9, 17, 23, 41, 26, 44, 48, 68, 31, 52, 47, 73, 56, 76, 81, 98, 35, 5 0, 57, 78, 62, 82, 85, 102, 66, 87, 90, 105, 93, 109, 111, 121, 40, 60, 65, 84, 70, 88, 91, 108, 74, 92, 9 5, 110, 99, 112, 114, 122, 80, 97, 101, 113, 103, 115, 116, 123, 106, 117, 118, 124, 120, 125, 126, 1 27]

TABLE Z23

| with a sequence length of 128: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 8 |
| 6 | 11 |
| 7 | 22 |
| 8 | 4 |
| 9 | 10 |
| 10 | 13 |
| 11 | 24 |
| 12 | 15 |
| 13 | 28 |
| 14 | 30 |
| 15 | 53 |
| 16 | 5 |
| 17 | 12 |
| 18 | 14 |
| 19 | 27 |
| 20 | 18 |
| 21 | 32 |

TABLE Z23-continued

| with a sequence length of 128: | |
|---|---|
| Polarized channel sequence number | Reliability or reliability sequence number |
| 22 | 38 |
| 23 | 55 |
| 24 | 20 |
| 25 | 37 |
| 26 | 34 |
| 27 | 59 |
| 28 | 43 |
| 29 | 63 |
| 30 | 67 |
| 31 | 89 |
| 32 | 6 |
| 33 | 16 |
| 34 | 19 |
| 35 | 33 |
| 36 | 21 |
| 37 | 36 |
| 38 | 39 |
| 39 | 61 |
| 40 | 25 |
| 41 | 42 |
| 42 | 45 |
| 43 | 64 |
| 44 | 49 |
| 45 | 69 |
| 46 | 72 |
| 47 | 94 |
| 48 | 29 |
| 49 | 46 |
| 50 | 51 |
| 51 | 71 |
| 52 | 54 |
| 53 | 75 |
| 54 | 77 |
| 55 | 96 |
| 56 | 58 |
| 57 | 79 |
| 58 | 83 |
| 59 | 100 |
| 60 | 86 |
| 61 | 104 |
| 62 | 107 |
| 63 | 119 |
| 64 | 9 |
| 65 | 17 |
| 66 | 23 |
| 67 | 41 |
| 68 | 26 |
| 69 | 44 |
| 70 | 48 |
| 71 | 68 |
| 72 | 31 |
| 73 | 52 |
| 74 | 47 |
| 75 | 73 |
| 76 | 56 |
| 77 | 76 |
| 78 | 81 |
| 79 | 98 |
| 80 | 35 |
| 81 | 50 |
| 82 | 57 |
| 83 | 78 |
| 84 | 62 |
| 85 | 82 |
| 86 | 85 |
| 87 | 102 |
| 88 | 66 |
| 89 | 87 |
| 90 | 90 |
| 91 | 105 |
| 92 | 93 |
| 93 | 109 |
| 94 | 111 |
| 95 | 121 |
| 96 | 40 |

TABLE Z23-continued

| with a sequence length of 128: | |
|---|---|
| Polarized channel sequence number | Reliability or reliability sequence number |
| 97 | 60 |
| 98 | 65 |
| 99 | 84 |
| 100 | 70 |
| 101 | 88 |
| 102 | 91 |
| 103 | 108 |
| 104 | 74 |
| 105 | 92 |
| 106 | 95 |
| 107 | 110 |
| 108 | 99 |
| 109 | 112 |
| 110 | 114 |
| 111 | 122 |
| 112 | 80 |
| 113 | 97 |
| 114 | 101 |
| 115 | 113 |
| 116 | 103 |
| 117 | 115 |
| 118 | 116 |
| 119 | 123 |
| 120 | 106 |
| 121 | 117 |
| 122 | 118 |
| 123 | 124 |
| 124 | 120 |
| 125 | 125 |
| 126 | 126 |
| 127 | 127 |

Sequence Z24, with a sequence length of 64:

[0, 1, 2, 7, 3, 8, 10, 20, 4, 9, 12, 21, 14, 24, 26, 40, 5, 11, 13, 23, 16, 27, 32, 42, 18, 31, 29, 4 4, 35, 46, 48, 57, 6, 15, 17, 28, 19, 30, 33, 45, 22, 34, 36, 47, 38, 49, 51, 58, 25, 37, 39, 50, 41, 52, 53, 5 9, 43, 54, 55, 60, 56, 61, 62, 63]

TABLE Z24

| with a sequence length of 64: | |
|---|---|
| Polaized channel sequence number | Reliability or reliability sequence number |
| 0 | 0 |
| 1 | 1 |
| 2 | 2 |
| 3 | 7 |
| 4 | 3 |
| 5 | 8 |
| 6 | 10 |
| 7 | 20 |
| 8 | 4 |
| 9 | 9 |
| 10 | 12 |
| 11 | 21 |
| 12 | 14 |
| 13 | 24 |
| 14 | 26 |
| 15 | 40 |
| 16 | 5 |
| 17 | 11 |
| 18 | 13 |
| 19 | 23 |
| 20 | 16 |
| 21 | 27 |
| 22 | 32 |
| 23 | 42 |
| 24 | 18 |
| 25 | 31 |

TABLE Z24-continued

| with a sequence length of 64: | |
|---|---|
| Polarized channel sequence number | Reliability or reliability sequence number |
| 26 | 29 |
| 27 | 44 |
| 28 | 35 |
| 29 | 46 |
| 30 | 48 |
| 31 | 57 |
| 32 | 6 |
| 33 | 15 |
| 34 | 17 |
| 35 | 28 |
| 36 | 19 |
| 37 | 30 |
| 38 | 33 |
| 39 | 45 |
| 40 | 22 |
| 41 | 34 |
| 42 | 36 |
| 43 | 47 |
| 44 | 38 |
| 45 | 49 |
| 46 | 51 |
| 47 | 58 |
| 48 | 25 |
| 49 | 37 |
| 50 | 39 |
| 51 | 50 |
| 52 | 41 |
| 53 | 52 |
| 54 | 53 |
| 55 | 59 |
| 56 | 43 |
| 57 | 54 |
| 58 | 55 |
| 59 | 60 |
| 60 | 56 |
| 61 | 61 |
| 62 | 62 |
| 63 | 63 |

Fourth group of sequences (in comprehensive consideration of a criterion that a list 2 has optimal performance when a mother code length is 256 and a list 4 is optimal when a mother code length is 1024)

Sequence Q25, with a sequence length of 1024

[0, 1, 2, 4, 8, 16, 32, 3, 64, 5, 6, 9, 128, 10, 17, 12, 18, 33, 20, 34, 256, 65, 24, 36, 66, 7, 11, 512, 129, 40, 68, 13, 19, 48, 130, 72, 14, 257, 21, 80, 35, 258, 132, 513, 22, 25, 37, 136, 96, 260, 26 4, 38, 514, 26, 67, 41, 144, 28, 69, 42, 516, 49, 160, 272, 70, 520, 288, 528, 73, 544, 131, 44, 50, 74, 81, 15, 52, 320, 133, 192, 134, 23, 384, 76, 56, 82, 137, 27, 97, 39, 259, 84, 138, 145, 261, 29, 98, 4 3, 515, 88, 140, 146, 30, 161, 262, 265, 45, 576, 71, 100, 640, 51, 148, 75, 104, 266, 273, 517, 162, 46, 53, 193, 152, 77, 54, 768, 268, 274, 518, 83, 57, 164, 521, 112, 135, 78, 289, 194, 58, 276, 522, 85, 168, 139, 99, 60, 86, 280, 196, 290, 529, 524, 141, 89, 147, 176, 101, 31, 530, 321, 142, 90, 10 5, 545, 292, 322, 532, 263, 200, 149, 102, 304, 296, 47, 208, 92, 267, 385, 546, 324, 150, 386, 163, 106, 153, 55, 165, 328, 536, 577, 548, 113, 154, 79, 269, 224, 578, 166, 108, 519, 552, 59, 270, 6 41, 523, 275, 580, 291, 169, 114, 560, 195, 277, 156, 116, 87, 197, 170, 91, 531, 525, 642, 281, 27 8, 526, 177, 293, 388, 120, 584, 769, 198, 61, 201, 103, 336, 172, 282, 62, 178, 143, 294, 93, 644, 202, 592, 323, 392, 297, 770, 209, 151, 107, 180, 284, 648, 94, 210, 298, 400, 608, 352, 325, 533, 155, 109, 305, 547, 300, 204, 184, 534, 537, 167, 115, 225, 326, 306, 772, 157, 656, 329, 110, 21 2, 171, 117, 776, 330, 226, 549, 538, 387, 308, 118, 416, 271, 279, 158, 337, 550, 672, 216, 332, 5 79, 540, 389, 173, 121, 553, 199, 784, 179, 228, 338, 312, 704, 390, 122, 554, 581, 393, 283, 174, 448, 353, 561, 63, 181, 340, 394, 527, 582, 556, 232, 295, 285, 203, 205, 124, 182, 643, 562, 286, 585, 299, 354, 211, 401, 185, 396, 344, 586, 645, 593, 535, 240, 206, 95, 327, 564, 800, 402, 356, 307, 301, 417, 213, 568, 832, 588, 186, 646, 404, 227, 896, 594, 418, 302, 649, 771, 360, 539, 18 8, 331, 111, 309, 217, 449, 214, 408, 609, 596, 551, 650, 159, 229, 420, 310, 541, 773, 610, 657, 3 33, 119, 600, 339, 218, 368, 652, 230, 391, 313, 450, 542, 334, 175, 555, 774, 233, 123, 658, 612, 341, 777, 220, 314, 424, 395, 673, 583, 355, 287, 183, 234, 125, 557, 660, 616, 342, 316, 241, 77 8, 563, 345, 452, 397, 403, 207, 674, 558, 785, 432, 357, 236, 187, 664, 624, 587, 780, 705, 126, 2 42, 565, 398, 346, 456, 358, 405, 303, 569, 215, 595, 189, 566, 676, 361, 706, 589, 244, 786, 647, 348, 419, 406, 464, 680, 801, 362, 590, 409, 570, 788, 597, 572, 248, 311, 708, 598, 601, 651, 42 1, 792, 802, 611, 602, 410, 219, 688, 653, 190, 369, 231, 364, 654, 659, 335, 480, 315, 221, 370, 6 13, 422, 425, 451, 614, 543, 235, 412, 343, 372, 775, 317, 222, 426, 453, 237, 559, 833, 804, 712, 834, 661, 808, 779, 617, 604, 433, 720, 816, 836, 347, 897, 243, 662, 454, 318, 675, 618, 898, 78 1, 376, 428, 665, 736, 567, 840, 625, 245, 359, 457, 399, 787, 591, 678, 434, 677, 349, 127, 458, 6 66, 620, 363, 238, 246, 782, 407, 436, 626, 571, 465, 681, 249, 707, 350, 599, 668, 790, 460, 250, 682, 573, 411, 803, 789, 709, 365, 440, 628, 689, 374, 423, 466, 793, 191, 371, 481, 574, 413, 60 3, 366, 468, 655, 900, 805, 615, 684, 710, 429, 794, 252, 373, 605, 848, 690, 713, 632, 482, 806, 4 27, 904, 414, 223, 663, 692, 835, 619, 472, 455, 796, 809, 714, 721, 837, 716, 864, 810, 606, 912, 722, 696, 377, 435, 817, 319, 621, 812, 484, 430, 838, 667, 488, 239, 378, 459, 622, 627, 437, 38 0, 818, 461, 496, 669, 679, 724, 841, 629, 351, 467, 438, 737, 247, 462, 442, 441, 469, 251, 683, 8 42, 738, 899, 670, 783, 849, 820, 728, 928, 791, 367, 901, 630, 685, 844, 633, 711, 253, 691, 824, 902, 686, 740, 850, 375, 444, 470, 483, 415, 485, 905, 795, 473, 634, 744, 852, 960, 865, 693, 79 7, 906, 715, 807, 474, 636, 694, 254, 717, 575, 913, 798, 811, 379, 697, 431, 607, 489, 866, 723, 4 86, 908, 718, 813, 476, 856, 839, 725, 698, 914, 752, 868, 819, 814, 439, 929, 490, 623, 671, 739, 916, 463, 843, 381, 497, 930, 821, 726, 96, 872, 492, 631, 872, 492, 631, 729, 700, 443, 741, 845, 920, 382, 82 2, 851, 730, 498, 880, 742, 445, 471, 635, 932, 687, 903, 825, 500, 846, 745, 826, 732, 446, 962, 9 36, 475, 853, 867, 637, 907, 487, 695, 746, 828, 753, 854, 857, 504, 799, 255, 964, 909, 719, 477, 915, 638, 748, 944, 869, 491, 699, 754, 858, 478, 968, 383, 910, 815, 976, 870, 917, 727, 493, 87 3, 701, 931, 756, 860, 499, 731, 823, 922, 874, 918, 502, 933, 743, 760, 881, 494, 702, 921, 501, 8 76, 847, 992, 447, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 91 9, 875, 862, 758, 948, 977, 923, 972, 761, 877, 952, 495, 703, 935, 978, 883, 762, 503, 925, 878, 7 35, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 95 9, 1011, 1013, 895, 1006, 1014, 1017, 1018, 991, 1020, 1007, 1015, 1019, 1021, 1022, 1023]

TABLE Q25

| with a sequence length of 1024: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 64 |
| 9 | 5 |
| 10 | 6 |
| 11 | 9 |
| 12 | 128 |
| 13 | 10 |
| 14 | 17 |
| 15 | 12 |
| 16 | 18 |
| 17 | 33 |
| 18 | 20 |
| 19 | 34 |
| 20 | 256 |
| 21 | 65 |
| 22 | 24 |
| 23 | 36 |
| 24 | 66 |
| 25 | 7 |
| 26 | 11 |
| 27 | 512 |
| 28 | 129 |
| 29 | 40 |
| 30 | 68 |
| 31 | 13 |
| 32 | 19 |
| 33 | 48 |
| 34 | 130 |
| 35 | 72 |
| 36 | 14 |
| 37 | 257 |
| 38 | 21 |
| 39 | 80 |
| 40 | 35 |
| 41 | 258 |
| 42 | 132 |
| 43 | 513 |
| 44 | 22 |
| 45 | 25 |
| 46 | 37 |
| 47 | 136 |
| 48 | 96 |
| 49 | 260 |
| 50 | 264 |
| 51 | 38 |
| 52 | 514 |
| 53 | 26 |
| 54 | 67 |
| 55 | 41 |
| 56 | 144 |
| 57 | 28 |
| 58 | 69 |
| 59 | 42 |
| 60 | 516 |
| 61 | 49 |
| 62 | 160 |
| 63 | 272 |
| 64 | 70 |
| 65 | 520 |
| 66 | 288 |
| 67 | 528 |
| 68 | 73 |
| 69 | 544 |
| 70 | 131 |

TABLE Q25-continued with a sequence length of 1024:

| Reliability or reliability sequence number | Polarized channel sequence number |
|---|---|
| 71 | 44 |
| 72 | 50 |
| 73 | 74 |
| 74 | 81 |
| 75 | 15 |
| 76 | 52 |
| 77 | 320 |
| 78 | 133 |
| 79 | 192 |
| 80 | 134 |
| 81 | 23 |
| 82 | 384 |
| 83 | 76 |
| 84 | 56 |
| 85 | 82 |
| 86 | 137 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 98 |
| 97 | 43 |
| 98 | 515 |
| 99 | 88 |
| 100 | 140 |
| 101 | 146 |
| 102 | 30 |
| 103 | 161 |
| 104 | 262 |
| 105 | 265 |
| 106 | 45 |
| 107 | 576 |
| 108 | 71 |
| 109 | 100 |
| 110 | 640 |
| 111 | 51 |
| 112 | 148 |
| 113 | 75 |
| 114 | 104 |
| 115 | 266 |
| 116 | 273 |
| 117 | 517 |
| 118 | 162 |
| 119 | 46 |
| 120 | 53 |
| 121 | 193 |
| 122 | 152 |
| 123 | 77 |
| 124 | 54 |
| 125 | 768 |
| 126 | 268 |
| 127 | 274 |
| 128 | 518 |
| 129 | 83 |
| 130 | 57 |
| 131 | 164 |
| 132 | 521 |
| 133 | 112 |
| 134 | 135 |
| 135 | 78 |
| 136 | 289 |
| 137 | 194 |
| 138 | 58 |
| 139 | 276 |
| 140 | 522 |
| 141 | 85 |
| 142 | 168 |
| 143 | 139 |
| 144 | 99 |
| 145 | 60 |

TABLE Q25-continued with a sequence length of 1024:

| Reliability or reliability sequence number | Polarized channel sequence number |
|---|---|
| 146 | 86 |
| 147 | 280 |
| 148 | 196 |
| 149 | 290 |
| 150 | 529 |
| 151 | 524 |
| 152 | 141 |
| 153 | 89 |
| 154 | 147 |
| 155 | 176 |
| 156 | 101 |
| 157 | 31 |
| 158 | 530 |
| 159 | 321 |
| 160 | 142 |
| 161 | 90 |
| 162 | 105 |
| 163 | 545 |
| 164 | 292 |
| 165 | 322 |
| 166 | 532 |
| 167 | 263 |
| 168 | 200 |
| 169 | 149 |
| 170 | 102 |
| 171 | 304 |
| 172 | 296 |
| 173 | 47 |
| 174 | 208 |
| 175 | 92 |
| 176 | 267 |
| 177 | 385 |
| 178 | 546 |
| 179 | 324 |
| 180 | 150 |
| 181 | 386 |
| 182 | 163 |
| 183 | 106 |
| 184 | 153 |
| 185 | 55 |
| 186 | 165 |
| 187 | 328 |
| 188 | 536 |
| 189 | 577 |
| 190 | 548 |
| 191 | 113 |
| 192 | 154 |
| 193 | 79 |
| 194 | 269 |
| 195 | 224 |
| 196 | 578 |
| 197 | 166 |
| 198 | 108 |
| 199 | 519 |
| 200 | 552 |
| 201 | 59 |
| 202 | 270 |
| 203 | 641 |
| 204 | 523 |
| 205 | 275 |
| 206 | 580 |
| 207 | 291 |
| 208 | 169 |
| 209 | 114 |
| 210 | 560 |
| 211 | 195 |
| 212 | 277 |
| 213 | 156 |
| 214 | 116 |
| 215 | 87 |
| 216 | 197 |
| 217 | 170 |
| 218 | 91 |
| 219 | 531 |
| 220 | 525 |

TABLE Q25-continued

| with a sequence length of 1024: | |
|---|---|
| Reliability or reliability sequence number | Polarized channel sequence number |
| 221 | 642 |
| 222 | 281 |
| 223 | 278 |
| 224 | 526 |
| 225 | 177 |
| 226 | 293 |
| 227 | 388 |
| 228 | 120 |
| 229 | 584 |
| 230 | 769 |
| 231 | 198 |
| 232 | 61 |
| 233 | 201 |
| 234 | 103 |
| 235 | 336 |
| 236 | 172 |
| 237 | 282 |
| 238 | 62 |
| 239 | 178 |
| 240 | 143 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 209 |
| 251 | 151 |
| 252 | 107 |
| 253 | 180 |
| 254 | 284 |
| 255 | 648 |
| 256 | 94 |
| 257 | 210 |
| 258 | 298 |
| 259 | 400 |
| 260 | 608 |
| 261 | 352 |
| 262 | 325 |
| 263 | 533 |
| 264 | 155 |
| 265 | 109 |
| 266 | 305 |
| 267 | 547 |
| 268 | 300 |
| 269 | 204 |
| 270 | 184 |
| 271 | 534 |
| 272 | 537 |
| 273 | 167 |
| 274 | 115 |
| 275 | 225 |
| 276 | 326 |
| 277 | 306 |
| 278 | 772 |
| 279 | 157 |
| 280 | 656 |
| 281 | 329 |
| 282 | 110 |
| 283 | 212 |
| 284 | 171 |
| 285 | 117 |
| 286 | 776 |
| 287 | 330 |
| 288 | 226 |
| 289 | 549 |
| 290 | 538 |
| 291 | 387 |
| 292 | 308 |
| 293 | 118 |
| 294 | 416 |
| 295 | 271 |

TABLE Q25-continued

| with a sequence length of 1024: | |
|---|---|
| Reliability or reliability sequence number | Polarized channel sequence number |
| 296 | 279 |
| 297 | 158 |
| 298 | 337 |
| 299 | 550 |
| 300 | 672 |
| 301 | 216 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 122 |
| 318 | 554 |
| 319 | 581 |
| 320 | 393 |
| 321 | 283 |
| 322 | 174 |
| 323 | 448 |
| 324 | 353 |
| 325 | 561 |
| 326 | 63 |
| 327 | 181 |
| 328 | 340 |
| 329 | 394 |
| 330 | 527 |
| 331 | 582 |
| 332 | 556 |
| 333 | 232 |
| 334 | 295 |
| 335 | 285 |
| 336 | 203 |
| 337 | 205 |
| 338 | 124 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |

TABLE Q25-continued with a sequence length of 1024:

| Reliability or reliability sequence number | Polarized channel sequence number |
|---|---|
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 188 |
| 383 | 331 |
| 384 | 111 |
| 385 | 309 |
| 386 | 217 |
| 387 | 449 |
| 388 | 214 |
| 389 | 408 |
| 390 | 609 |
| 391 | 596 |
| 392 | 551 |
| 393 | 650 |
| 394 | 159 |
| 395 | 229 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 175 |
| 416 | 555 |
| 417 | 774 |
| 418 | 233 |
| 419 | 123 |
| 420 | 658 |
| 421 | 612 |
| 422 | 341 |
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |

TABLE Q25-continued with a sequence length of 1024:

| Reliability or reliability sequence number | Polarized channel sequence number |
|---|---|
| 446 | 403 |
| 447 | 207 |
| 448 | 674 |
| 449 | 558 |
| 450 | 785 |
| 451 | 432 |
| 452 | 357 |
| 453 | 236 |
| 454 | 187 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 215 |
| 471 | 595 |
| 472 | 189 |
| 473 | 566 |
| 474 | 676 |
| 475 | 361 |
| 476 | 706 |
| 477 | 589 |
| 478 | 244 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 248 |
| 495 | 311 |
| 496 | 708 |
| 497 | 598 |
| 498 | 601 |
| 499 | 651 |
| 500 | 421 |
| 501 | 792 |
| 502 | 802 |
| 503 | 611 |
| 504 | 602 |
| 505 | 410 |
| 506 | 219 |
| 507 | 688 |
| 508 | 653 |
| 509 | 190 |
| 510 | 369 |
| 511 | 231 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |

TABLE Q25-continued with a sequence length of 1024:

| Reliability or reliability sequence number | Polarized channel sequence number |
|---|---|
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 245 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |
| 577 | 127 |
| 578 | 458 |
| 579 | 666 |
| 580 | 620 |
| 581 | 363 |
| 582 | 238 |
| 583 | 246 |
| 584 | 782 |
| 585 | 407 |
| 586 | 436 |
| 587 | 626 |
| 588 | 571 |
| 589 | 465 |
| 590 | 681 |
| 591 | 249 |
| 592 | 707 |
| 593 | 350 |
| 594 | 599 |
| 595 | 668 |
| 596 | 790 |
| 597 | 460 |
| 598 | 250 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 191 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |

TABLE Q25-continued with a sequence length of 1024:

| Reliability or reliability sequence number | Polarized channel sequence number |
|---|---|
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 247 |
| 691 | 462 |
| 692 | 442 |
| 693 | 441 |
| 694 | 469 |
| 695 | 251 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |

TABLE Q25-continued with a sequence length of 1024:

| Reliability or reliability sequence number | Polarized channel sequence number |
|---|---|
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |

TABLE Q25-continued with a sequence length of 1024:

| Reliability or reliability sequence number | Polarized channel sequence number |
|---|---|
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |

TABLE Q25-continued with a sequence length of 1024:

| Reliability or reliability sequence number | Polarized channel sequence number |
|---|---|
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |

TABLE Q25-continued

| with a sequence length of 1024: | |
|---|---|
| Reliability or reliability sequence number | Polarized channel sequence number |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Z25, with a sequence length of 1024:

[0, 1, 2, 7, 3, 9, 10, 25, 4, 11, 13, 26, 15, 31, 36, 75, 5, 14, 16, 32, 18, 38, 44, 81, 22, 45, 53, 87, 57, 95, 102, 157, 6, 17, 19, 40, 23, 46, 51, 89, 29, 55, 59, 97, 71, 106, 119, 173, 33, 61, 72, 111, 7 6, 120, 124, 185, 84, 130, 138, 201, 145, 232, 238, 326, 8, 21, 24, 54, 30, 58, 64, 108, 35, 68, 73, 11 3, 83, 123, 135, 193, 39, 74, 85, 129, 91, 141, 146, 215, 99, 153, 161, 218, 175, 242, 256, 357, 48, 8 8, 96, 144, 109, 156, 170, 234, 114, 162, 183, 252, 198, 265, 282, 384, 133, 191, 209, 274, 214, 28 5, 293, 403, 228, 307, 317, 419, 338, 434, 460, 577, 12, 28, 34, 70, 42, 78, 80, 134, 47, 86, 92, 143, 100, 152, 160, 240, 56, 93, 101, 154, 112, 169, 180, 251, 122, 184, 192, 264, 213, 279, 297, 394, 6 2, 103, 118, 182, 131, 186, 197, 273, 142, 208, 217, 284, 236, 306, 322, 415, 155, 225, 239, 311, 2 53, 327, 339, 432, 270, 348, 370, 454, 382, 472, 509, 613, 79, 121, 137, 211, 148, 216, 231, 309, 1 68, 233, 244, 336, 269, 337, 356, 447, 174, 250, 257, 346, 283, 366, 388, 470, 301, 386, 406, 506, 424, 518, 532, 641, 195, 275, 288, 373, 312, 395, 409, 511, 333, 418, 433, 526, 453, 535, 582, 67 1, 355, 440, 461, 552, 478, 567, 583, 690, 494, 591, 598, 695, 629, 714, 743, 830, 20, 37, 41, 90, 4 9, 94, 104, 167, 50, 105, 115, 176, 126, 194, 202, 295, 63, 116, 127, 205, 139, 212, 223, 296, 147, 222, 237, 321, 254, 335, 342, 431, 66, 136, 149, 207, 164, 226, 241, 334, 172, 248, 258, 344, 268, 364, 377, 468, 171, 266, 277, 363, 292, 385, 397, 495, 314, 411, 425, 517, 439, 531, 555, 663, 77, 159, 165, 246, 179, 262, 276, 358, 187, 281, 287, 383, 302, 402, 414, 515, 235, 298, 313, 405, 32 8, 422, 438, 528, 350, 443, 464, 550, 481, 576, 593, 686, 261, 324, 345, 430, 362, 452, 466, 568, 3 80, 475, 487, 581, 512, 605, 619, 707, 407, 510, 519, 614, 529, 630, 609, 721, 560, 660, 672, 749, 677, 779, 794, 846, 82, 177, 181, 291, 227, 305, 316, 410, 247, 320, 329, 427, 349, 445, 463, 570, 259, 347, 361, 446, 372, 467, 483, 585, 389, 489, 505, 601, 527, 617, 640, 725, 294, 365, 376, 48 2, 396, 500, 521, 610, 426, 522, 533, 638, 561, 627, 667, 751, 451, 546, 574, 661, 586, 676, 688, 7 70, 606, 693, 692, 790, 722, 801, 813, 877, 323, 387, 412, 523, 444, 534, 554, 647, 465, 569, 578, 673, 597, 679, 691, 777, 484, 589, 611, 687, 620, 694, 723, 802, 646, 729, 740, 816, 760, 834, 84 4, 905, 516, 615, 636, 724, 666, 726, 756, 821, 670, 753, 772, 840, 786, 853, 870, 924, 680, 780, 7 98, 859, 808, 873, 865, 930, 828, 885, 893, 946, 909, 954, 963, 984, 27, 43, 52, 98, 60, 117, 128, 1 99, 65, 132, 140, 204, 151, 220, 224, 330, 67, 150, 158, 219, 166, 263, 271, 354, 188, 272, 290, 38 1, 304, 398, 413, 525, 69, 163, 178, 267, 190, 289, 299, 392, 200, 308, 318, 416, 332, 435, 449, 53 6, 210, 325, 341, 442, 359, 462, 473, 564, 367, 469, 490, 588, 493, 600, 616, 745, 107, 189, 196, 3 03, 206, 319, 331, 429, 229, 343, 351, 457, 369, 477, 488, 572, 245, 353, 375, 471, 391, 492, 497, 594, 404, 498, 504, 618, 545, 631, 656, 752, 260, 390, 400, 503, 421, 520, 524, 624, 437, 544, 55 7, 645, 580, 664, 674, 773, 456, 566, 587, 675, 607, 685, 709, 787, 635, 712, 730, 803, 741, 819, 8 36, 903, 10, 203, 221, 340, 243, 352, 371, 480, 255, 378, 393, 499, 408, 508, 513, 621, 280, 401, 420, 514, 436, 541, 553, 642, 455, 562, 579, 669, 595, 681, 700, 774, 300, 428, 448, 556, 474, 57 5, 573, 682, 485, 590, 599, 696, 625, 710, 718, 805, 507, 608, 633, 715, 643, 735, 742, 822, 659, 7 50, 764, 841, 789, 855, 871, 925, 315, 459, 476, 592, 496, 604, 626, 713, 539, 634, 650, 738, 653, 744, 758, 833, 547, 651, 658, 755, 683, 763, 783, 852, 704, 788, 797, 860, 812, 878, 888, 933, 56 3, 689, 698, 775, 719, 791, 800, 867, 731, 810, 823, 884, 837, 894, 907, 949, 766, 825, 842, 897, 8 57, 911, 916, 961, 868, 921, 929, 966, 940, 974, 983, 1003, 125, 230, 249, 379, 278, 399, 417, 53 0, 286, 423, 441, 543, 458, 559, 584, 701, 310, 450, 479, 571, 491, 603, 596, 706, 501, 612, 628, 7 28, 648, 736, 747, 829, 360, 486, 502, 602, 538, 623, 637, 739, 542, 649, 655, 748, 665, 759, 769, 848, 548, 662, 678, 768, 703, 782, 795, 861, 716, 807, 811, 879, 824, 889, 900, 944, 368, 537, 54 0, 644, 549, 652, 668, 762, 565, 684, 697, 778, 711, 792, 809, 875, 632, 702, 720, 796, 732, 817, 8 26, 886, 761, 827, 843, 898, 858, 910, 915, 960, 654, 734, 754, 818, 767, 839, 850, 902, 785, 854, 863, 914, 874, 922, 932, 969, 799, 869, 881, 928, 892, 935, 943, 976, 904, 947, 953, 981, 958, 98 9, 991, 1011, 374, 551, 558, 699, 622, 708, 717, 806, 639, 727, 737, 820, 757, 832, 847, 901, 657, 746, 765, 835, 776, 851, 864, 913, 793, 872, 862, 919, 887, 931, 939, 972, 705, 771, 781, 856, 80 4, 866, 880, 926, 815, 882, 891, 936, 899, 941, 950, 980, 838, 895, 906, 945, 917, 955, 959, 987, 9 23, 965, 968, 993, 975, 996, 998, 1008, 733, 784, 814, 883, 831, 890, 896, 942, 845, 908, 912, 95 2, 920, 956, 967, 990, 849, 918, 927, 964, 938, 970, 971, 997, 948, 977, 979, 999, 985, 1004, 100 6, 1016, 876, 934, 937, 973, 951, 978, 982, 1001, 957, 986, 988, 1005, 994, 1007, 1012, 1018, 96 2, 992, 995, 1009, 1000, 1010, 1013, 1019, 1002, 1014, 1015, 1020, 1017, 1021, 1022, 1023]

TABLE Z25 with a sequence length of 1024:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 9 |
| 6 | 10 |
| 7 | 25 |
| 8 | 4 |
| 9 | 11 |
| 10 | 13 |
| 11 | 26 |
| 12 | 15 |
| 13 | 31 |
| 14 | 36 |
| 15 | 75 |
| 16 | 5 |
| 17 | 14 |
| 18 | 16 |
| 19 | 32 |
| 20 | 18 |
| 21 | 38 |
| 22 | 44 |
| 23 | 81 |
| 24 | 22 |
| 25 | 45 |
| 26 | 53 |
| 27 | 87 |
| 28 | 57 |
| 29 | 95 |
| 30 | 102 |
| 31 | 157 |
| 32 | 6 |
| 33 | 17 |
| 34 | 19 |
| 35 | 40 |
| 36 | 23 |
| 37 | 46 |
| 38 | 51 |
| 39 | 89 |
| 40 | 29 |
| 41 | 55 |
| 42 | 59 |
| 43 | 97 |
| 44 | 71 |
| 45 | 106 |
| 46 | 119 |
| 47 | 173 |
| 48 | 33 |
| 49 | 61 |
| 50 | 72 |
| 51 | 111 |
| 52 | 76 |
| 53 | 120 |
| 54 | 124 |
| 55 | 185 |
| 56 | 84 |
| 57 | 130 |
| 58 | 138 |
| 59 | 201 |
| 60 | 145 |
| 61 | 232 |
| 62 | 238 |

TABLE Z25-continued with a sequence length of 1024:

| Polarized channel sequence number | Reliability or reliability sequence number |
|---|---|
| 63 | 326 |
| 64 | 8 |
| 65 | 21 |
| 66 | 24 |
| 67 | 54 |
| 68 | 30 |
| 69 | 58 |
| 70 | 64 |
| 71 | 108 |
| 72 | 35 |
| 73 | 68 |
| 74 | 73 |
| 75 | 113 |
| 76 | 83 |
| 77 | 123 |
| 78 | 135 |
| 79 | 193 |
| 80 | 39 |
| 81 | 74 |
| 82 | 85 |
| 83 | 129 |
| 84 | 91 |
| 85 | 141 |
| 86 | 146 |
| 87 | 215 |
| 88 | 99 |
| 89 | 153 |
| 90 | 161 |
| 91 | 218 |
| 92 | 175 |
| 93 | 242 |
| 94 | 256 |
| 95 | 357 |
| 96 | 48 |
| 97 | 88 |
| 98 | 96 |
| 99 | 144 |
| 100 | 109 |
| 101 | 156 |
| 102 | 170 |
| 103 | 234 |
| 104 | 114 |
| 105 | 162 |
| 106 | 183 |
| 107 | 252 |
| 108 | 198 |
| 109 | 265 |
| 110 | 282 |
| 111 | 384 |
| 112 | 133 |
| 113 | 191 |
| 114 | 209 |
| 115 | 274 |
| 116 | 214 |
| 117 | 285 |
| 118 | 293 |
| 119 | 403 |
| 120 | 228 |
| 121 | 307 |
| 122 | 317 |
| 123 | 419 |
| 124 | 338 |
| 125 | 434 |
| 126 | 460 |
| 127 | 577 |
| 128 | 12 |
| 129 | 28 |
| 130 | 34 |
| 131 | 70 |
| 132 | 42 |
| 133 | 78 |
| 134 | 80 |
| 135 | 134 |
| 136 | 47 |
| 137 | 86 |

TABLE Z25-continued

| with a sequence length of 1024: | |
|---|---|
| Polarized channel sequence number | Reliability or reliability sequence number |
| 138 | 92 |
| 139 | 143 |
| 140 | 100 |
| 141 | 152 |
| 142 | 160 |
| 143 | 240 |
| 144 | 56 |
| 145 | 93 |
| 146 | 101 |
| 147 | 154 |
| 148 | 112 |
| 149 | 169 |
| 150 | 180 |
| 151 | 251 |
| 152 | 122 |
| 153 | 184 |
| 154 | 192 |
| 155 | 264 |
| 156 | 213 |
| 157 | 279 |
| 158 | 297 |
| 159 | 394 |
| 160 | 62 |
| 161 | 103 |
| 162 | 118 |
| 163 | 182 |
| 164 | 131 |
| 165 | 186 |
| 166 | 197 |
| 167 | 273 |
| 168 | 142 |
| 169 | 208 |
| 170 | 217 |
| 171 | 284 |
| 172 | 236 |
| 173 | 306 |
| 174 | 322 |
| 175 | 415 |
| 176 | 155 |
| 177 | 225 |
| 178 | 239 |
| 179 | 311 |
| 180 | 253 |
| 181 | 327 |
| 182 | 339 |
| 183 | 432 |
| 184 | 270 |
| 185 | 348 |
| 186 | 370 |
| 187 | 454 |
| 188 | 382 |
| 189 | 472 |
| 190 | 509 |
| 191 | 613 |
| 192 | 79 |
| 193 | 121 |
| 194 | 137 |
| 195 | 211 |
| 196 | 148 |
| 197 | 216 |
| 198 | 231 |
| 199 | 309 |
| 200 | 168 |
| 201 | 233 |
| 202 | 244 |
| 203 | 336 |
| 204 | 269 |
| 205 | 337 |
| 206 | 356 |
| 207 | 447 |
| 208 | 174 |
| 209 | 250 |
| 210 | 257 |
| 211 | 346 |
| 212 | 283 |

TABLE Z25-continued

| with a sequence length of 1024: | |
|---|---|
| Polarized channel sequence number | Reliability or reliability sequence number |
| 213 | 366 |
| 214 | 388 |
| 215 | 470 |
| 216 | 301 |
| 217 | 386 |
| 218 | 406 |
| 219 | 506 |
| 220 | 424 |
| 221 | 518 |
| 222 | 532 |
| 223 | 641 |
| 224 | 195 |
| 225 | 275 |
| 226 | 288 |
| 227 | 373 |
| 228 | 312 |
| 229 | 395 |
| 230 | 409 |
| 231 | 511 |
| 232 | 333 |
| 233 | 418 |
| 234 | 433 |
| 235 | 526 |
| 236 | 453 |
| 237 | 535 |
| 238 | 582 |
| 239 | 671 |
| 240 | 355 |
| 241 | 440 |
| 242 | 461 |
| 243 | 552 |
| 244 | 478 |
| 245 | 567 |
| 246 | 583 |
| 247 | 690 |
| 248 | 494 |
| 249 | 591 |
| 250 | 598 |
| 251 | 695 |
| 252 | 629 |
| 253 | 714 |
| 254 | 743 |
| 255 | 830 |
| 256 | 20 |
| 257 | 37 |
| 258 | 41 |
| 259 | 90 |
| 260 | 49 |
| 261 | 94 |
| 262 | 104 |
| 263 | 167 |
| 264 | 50 |
| 265 | 105 |
| 266 | 115 |
| 267 | 176 |
| 268 | 126 |
| 269 | 194 |
| 270 | 202 |
| 271 | 295 |
| 272 | 63 |
| 273 | 116 |
| 274 | 127 |
| 275 | 205 |
| 276 | 139 |
| 277 | 212 |
| 278 | 223 |
| 279 | 296 |
| 280 | 147 |
| 281 | 222 |
| 282 | 237 |
| 283 | 321 |
| 284 | 254 |
| 285 | 335 |
| 286 | 342 |
| 287 | 431 |

TABLE Z25-continued with a sequence length of 1024:

| Polarized channel sequence number | Reliability or reliability sequence number |
|---|---|
| 288 | 66 |
| 289 | 136 |
| 290 | 149 |
| 291 | 207 |
| 292 | 164 |
| 293 | 226 |
| 294 | 241 |
| 295 | 334 |
| 296 | 172 |
| 297 | 248 |
| 298 | 258 |
| 299 | 344 |
| 300 | 268 |
| 301 | 364 |
| 302 | 377 |
| 303 | 468 |
| 304 | 171 |
| 305 | 266 |
| 306 | 277 |
| 307 | 363 |
| 308 | 292 |
| 309 | 385 |
| 310 | 397 |
| 311 | 495 |
| 312 | 314 |
| 313 | 411 |
| 314 | 425 |
| 315 | 517 |
| 316 | 439 |
| 317 | 531 |
| 318 | 555 |
| 319 | 663 |
| 320 | 77 |
| 321 | 159 |
| 322 | 165 |
| 323 | 246 |
| 324 | 179 |
| 325 | 262 |
| 326 | 276 |
| 327 | 358 |
| 328 | 187 |
| 329 | 281 |
| 330 | 287 |
| 331 | 383 |
| 332 | 302 |
| 333 | 402 |
| 334 | 414 |
| 335 | 515 |
| 336 | 235 |
| 337 | 298 |
| 338 | 313 |
| 339 | 405 |
| 340 | 328 |
| 341 | 422 |
| 342 | 438 |
| 343 | 528 |
| 344 | 350 |
| 345 | 443 |
| 346 | 464 |
| 347 | 550 |
| 348 | 481 |
| 349 | 576 |
| 350 | 593 |
| 351 | 686 |
| 352 | 261 |
| 353 | 324 |
| 354 | 345 |
| 355 | 430 |
| 356 | 362 |
| 357 | 452 |
| 358 | 466 |
| 359 | 568 |
| 360 | 380 |
| 361 | 475 |
| 362 | 487 |
| 363 | 581 |
| 364 | 512 |
| 365 | 605 |
| 366 | 619 |
| 367 | 707 |
| 368 | 407 |
| 369 | 510 |
| 370 | 519 |
| 371 | 614 |
| 372 | 529 |
| 373 | 630 |
| 374 | 609 |
| 375 | 721 |
| 376 | 560 |
| 377 | 660 |
| 378 | 672 |
| 379 | 749 |
| 380 | 677 |
| 381 | 779 |
| 382 | 794 |
| 383 | 846 |
| 384 | 82 |
| 385 | 177 |
| 386 | 181 |
| 387 | 291 |
| 388 | 227 |
| 389 | 305 |
| 390 | 316 |
| 391 | 410 |
| 392 | 247 |
| 393 | 320 |
| 394 | 329 |
| 395 | 427 |
| 396 | 349 |
| 397 | 445 |
| 398 | 463 |
| 399 | 570 |
| 400 | 259 |
| 401 | 347 |
| 402 | 361 |
| 403 | 446 |
| 404 | 372 |
| 405 | 467 |
| 406 | 483 |
| 407 | 585 |
| 408 | 389 |
| 409 | 489 |
| 410 | 505 |
| 411 | 601 |
| 412 | 527 |
| 413 | 617 |
| 414 | 640 |
| 415 | 725 |
| 416 | 294 |
| 417 | 365 |
| 418 | 376 |
| 419 | 482 |
| 420 | 396 |
| 421 | 500 |
| 422 | 521 |
| 423 | 610 |
| 424 | 426 |
| 425 | 522 |
| 426 | 533 |
| 427 | 638 |
| 428 | 561 |
| 429 | 627 |
| 430 | 667 |
| 431 | 751 |
| 432 | 451 |
| 433 | 546 |
| 434 | 574 |
| 435 | 661 |
| 436 | 586 |
| 437 | 676 |

TABLE Z25-continued with a sequence length of 1024:

| Polarized channel sequence number | Reliability or reliability sequence number |
|---|---|
| 438 | 688 |
| 439 | 770 |
| 440 | 606 |
| 441 | 693 |
| 442 | 692 |
| 443 | 790 |
| 444 | 722 |
| 445 | 801 |
| 446 | 813 |
| 447 | 877 |
| 448 | 323 |
| 449 | 387 |
| 450 | 412 |
| 451 | 523 |
| 452 | 444 |
| 453 | 534 |
| 454 | 554 |
| 455 | 647 |
| 456 | 465 |
| 457 | 569 |
| 458 | 578 |
| 459 | 673 |
| 460 | 597 |
| 461 | 679 |
| 462 | 691 |
| 463 | 777 |
| 464 | 484 |
| 465 | 589 |
| 466 | 611 |
| 467 | 687 |
| 468 | 620 |
| 469 | 694 |
| 470 | 723 |
| 471 | 802 |
| 472 | 646 |
| 473 | 729 |
| 474 | 740 |
| 475 | 816 |
| 476 | 760 |
| 477 | 834 |
| 478 | 844 |
| 479 | 905 |
| 480 | 516 |
| 481 | 615 |
| 482 | 636 |
| 483 | 724 |
| 484 | 666 |
| 485 | 726 |
| 486 | 756 |
| 487 | 821 |
| 488 | 670 |
| 489 | 753 |
| 490 | 772 |
| 491 | 840 |
| 492 | 786 |
| 493 | 853 |
| 494 | 870 |
| 495 | 924 |
| 496 | 680 |
| 497 | 780 |
| 498 | 798 |
| 499 | 859 |
| 500 | 808 |
| 501 | 873 |
| 502 | 865 |
| 503 | 930 |
| 504 | 828 |
| 505 | 885 |
| 506 | 893 |
| 507 | 946 |
| 508 | 909 |
| 509 | 954 |
| 510 | 963 |
| 511 | 984 |
| 512 | 27 |

TABLE Z25-continued with a sequence length of 1024:

| Polarized channel sequence number | Reliability or reliability sequence number |
|---|---|
| 513 | 43 |
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |
| 526 | 224 |
| 527 | 330 |
| 528 | 67 |
| 529 | 150 |
| 530 | 158 |
| 531 | 219 |
| 532 | 166 |
| 533 | 263 |
| 534 | 271 |
| 535 | 354 |
| 536 | 188 |
| 537 | 272 |
| 538 | 290 |
| 539 | 381 |
| 540 | 304 |
| 541 | 398 |
| 542 | 413 |
| 543 | 525 |
| 544 | 69 |
| 545 | 163 |
| 546 | 178 |
| 547 | 267 |
| 548 | 190 |
| 549 | 289 |
| 550 | 299 |
| 551 | 392 |
| 552 | 200 |
| 553 | 308 |
| 554 | 318 |
| 555 | 416 |
| 556 | 332 |
| 557 | 435 |
| 558 | 449 |
| 559 | 536 |
| 560 | 210 |
| 561 | 325 |
| 562 | 341 |
| 563 | 442 |
| 564 | 359 |
| 565 | 462 |
| 566 | 473 |
| 567 | 564 |
| 568 | 367 |
| 569 | 469 |
| 570 | 490 |
| 571 | 588 |
| 572 | 493 |
| 573 | 600 |
| 574 | 616 |
| 575 | 745 |
| 576 | 107 |
| 577 | 189 |
| 578 | 196 |
| 579 | 303 |
| 580 | 206 |
| 581 | 319 |
| 582 | 331 |
| 583 | 429 |
| 584 | 229 |
| 585 | 343 |
| 586 | 351 |
| 587 | 457 |

TABLE Z25-continued

| with a sequence length of 1024: | |
|---|---|
| Polarized channel sequence number | Reliability or reliability sequence number |
| 588 | 369 |
| 589 | 477 |
| 590 | 488 |
| 591 | 572 |
| 592 | 245 |
| 593 | 353 |
| 594 | 375 |
| 595 | 471 |
| 596 | 391 |
| 597 | 492 |
| 598 | 497 |
| 599 | 594 |
| 600 | 404 |
| 601 | 498 |
| 602 | 504 |
| 603 | 618 |
| 604 | 545 |
| 605 | 631 |
| 606 | 656 |
| 607 | 752 |
| 608 | 260 |
| 609 | 390 |
| 610 | 400 |
| 611 | 503 |
| 612 | 421 |
| 613 | 520 |
| 614 | 524 |
| 615 | 624 |
| 616 | 437 |
| 617 | 544 |
| 618 | 557 |
| 619 | 645 |
| 620 | 580 |
| 621 | 664 |
| 622 | 674 |
| 623 | 773 |
| 624 | 456 |
| 625 | 566 |
| 626 | 587 |
| 627 | 675 |
| 628 | 607 |
| 629 | 685 |
| 630 | 709 |
| 631 | 787 |
| 632 | 635 |
| 633 | 712 |
| 634 | 730 |
| 635 | 803 |
| 636 | 741 |
| 637 | 819 |
| 638 | 836 |
| 639 | 903 |
| 640 | 110 |
| 641 | 203 |
| 642 | 221 |
| 643 | 340 |
| 644 | 243 |
| 645 | 352 |
| 646 | 371 |
| 647 | 480 |
| 648 | 255 |
| 649 | 378 |
| 650 | 393 |
| 651 | 499 |
| 652 | 408 |
| 653 | 508 |
| 654 | 513 |
| 655 | 621 |
| 656 | 280 |
| 657 | 401 |
| 658 | 420 |
| 659 | 514 |
| 660 | 436 |
| 661 | 541 |
| 662 | 553 |

TABLE Z25-continued

| with a sequence length of 1024: | |
|---|---|
| Polarized channel sequence number | Reliability or reliability sequence number |
| 663 | 642 |
| 664 | 455 |
| 665 | 562 |
| 666 | 579 |
| 667 | 669 |
| 668 | 595 |
| 669 | 681 |
| 670 | 700 |
| 671 | 774 |
| 672 | 300 |
| 673 | 428 |
| 674 | 448 |
| 675 | 556 |
| 676 | 474 |
| 677 | 575 |
| 678 | 573 |
| 679 | 682 |
| 680 | 485 |
| 681 | 590 |
| 682 | 599 |
| 683 | 696 |
| 684 | 625 |
| 685 | 710 |
| 686 | 718 |
| 687 | 805 |
| 688 | 507 |
| 689 | 608 |
| 690 | 633 |
| 691 | 715 |
| 692 | 643 |
| 693 | 735 |
| 694 | 742 |
| 695 | 822 |
| 696 | 659 |
| 697 | 750 |
| 698 | 764 |
| 699 | 841 |
| 700 | 789 |
| 701 | 855 |
| 702 | 871 |
| 703 | 925 |
| 704 | 315 |
| 705 | 459 |
| 706 | 476 |
| 707 | 592 |
| 708 | 496 |
| 709 | 604 |
| 710 | 626 |
| 711 | 713 |
| 712 | 539 |
| 713 | 634 |
| 714 | 650 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 812 |
| 733 | 878 |
| 734 | 888 |
| 735 | 933 |
| 736 | 563 |
| 737 | 689 |

TABLE Z25-continued with a sequence length of 1024:

| Polarized channel sequence number | Reliability or reliability sequence number |
|---|---|
| 738 | 698 |
| 739 | 775 |
| 740 | 719 |
| 741 | 791 |
| 742 | 800 |
| 743 | 867 |
| 744 | 731 |
| 745 | 810 |
| 746 | 823 |
| 747 | 884 |
| 748 | 837 |
| 749 | 894 |
| 750 | 907 |
| 751 | 949 |
| 752 | 766 |
| 753 | 825 |
| 754 | 842 |
| 755 | 897 |
| 756 | 857 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 379 |
| 772 | 278 |
| 773 | 399 |
| 774 | 417 |
| 775 | 530 |
| 776 | 286 |
| 777 | 423 |
| 778 | 441 |
| 779 | 543 |
| 780 | 458 |
| 781 | 559 |
| 782 | 584 |
| 783 | 701 |
| 784 | 310 |
| 785 | 450 |
| 786 | 479 |
| 787 | 571 |
| 788 | 491 |
| 789 | 603 |
| 790 | 596 |
| 791 | 706 |
| 792 | 501 |
| 793 | 612 |
| 794 | 628 |
| 795 | 728 |
| 796 | 648 |
| 797 | 736 |
| 798 | 747 |
| 799 | 829 |
| 800 | 360 |
| 801 | 486 |
| 802 | 502 |
| 803 | 602 |
| 804 | 538 |
| 805 | 623 |
| 806 | 637 |
| 807 | 739 |
| 808 | 542 |
| 809 | 649 |
| 810 | 655 |
| 811 | 748 |
| 812 | 665 |

TABLE Z25-continued with a sequence length of 1024:

| Polarized channel sequence number | Reliability or reliability sequence number |
|---|---|
| 813 | 759 |
| 814 | 769 |
| 815 | 848 |
| 816 | 548 |
| 817 | 662 |
| 818 | 678 |
| 819 | 768 |
| 820 | 703 |
| 821 | 782 |
| 822 | 795 |
| 823 | 861 |
| 824 | 716 |
| 825 | 807 |
| 826 | 811 |
| 827 | 879 |
| 828 | 824 |
| 829 | 889 |
| 830 | 900 |
| 831 | 944 |
| 832 | 368 |
| 833 | 537 |
| 834 | 540 |
| 835 | 644 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 875 |
| 848 | 632 |
| 849 | 702 |
| 850 | 720 |
| 851 | 796 |
| 852 | 732 |
| 853 | 817 |
| 854 | 826 |
| 855 | 886 |
| 856 | 761 |
| 857 | 827 |
| 858 | 843 |
| 859 | 898 |
| 860 | 858 |
| 861 | 910 |
| 862 | 915 |
| 863 | 960 |
| 864 | 654 |
| 865 | 734 |
| 866 | 754 |
| 867 | 818 |
| 868 | 767 |
| 869 | 839 |
| 870 | 850 |
| 871 | 902 |
| 872 | 785 |
| 873 | 854 |
| 874 | 863 |
| 875 | 914 |
| 876 | 874 |
| 877 | 922 |
| 878 | 932 |
| 879 | 969 |
| 880 | 799 |
| 881 | 869 |
| 882 | 881 |
| 883 | 928 |
| 884 | 892 |
| 885 | 935 |
| 886 | 943 |
| 887 | 976 |

TABLE Z25-continued with a sequence length of 1024:

| Polarized channel sequence number | Reliability or reliability sequence number |
|---|---|
| 888 | 904 |
| 889 | 947 |
| 890 | 953 |
| 891 | 981 |
| 892 | 958 |
| 893 | 989 |
| 894 | 991 |
| 895 | 1011 |
| 896 | 374 |
| 897 | 551 |
| 898 | 558 |
| 899 | 699 |
| 900 | 622 |
| 901 | 708 |
| 902 | 717 |
| 903 | 806 |
| 904 | 639 |
| 905 | 727 |
| 906 | 737 |
| 907 | 820 |
| 908 | 757 |
| 909 | 832 |
| 910 | 847 |
| 911 | 901 |
| 912 | 657 |
| 913 | 746 |
| 914 | 765 |
| 915 | 835 |
| 916 | 776 |
| 917 | 851 |
| 918 | 864 |
| 919 | 913 |
| 920 | 793 |
| 921 | 872 |
| 922 | 862 |
| 923 | 919 |
| 924 | 887 |
| 925 | 931 |
| 926 | 939 |
| 927 | 972 |
| 928 | 705 |
| 929 | 771 |
| 930 | 781 |
| 931 | 856 |
| 932 | 804 |
| 933 | 866 |
| 934 | 880 |
| 935 | 926 |
| 936 | 815 |
| 937 | 882 |
| 938 | 891 |
| 939 | 936 |
| 940 | 899 |
| 941 | 941 |
| 942 | 950 |
| 943 | 980 |
| 944 | 838 |
| 945 | 895 |
| 946 | 906 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |
| 958 | 998 |
| 959 | 1008 |
| 960 | 733 |
| 961 | 784 |
| 962 | 814 |
| 963 | 883 |
| 964 | 831 |
| 965 | 890 |
| 966 | 896 |
| 967 | 942 |
| 968 | 845 |
| 969 | 908 |
| 970 | 912 |
| 971 | 952 |
| 972 | 920 |
| 973 | 956 |
| 974 | 967 |
| 975 | 990 |
| 976 | 849 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 876 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Fifth group of sequences (in comprehensive consideration of a criterion that a list 2 has optimal performance when a mother code length is 256 and a list 4 is optimal when a mother code length is 1024 in a case of existence of a parity check (PC) bit)

Sequence Q26, with a sequence length of 1024

[0, 1, 2, 4, 8, 16, 32, 3, 64, 5, 6, 9, 128, 10, 17, 12, 18, 33, 20, 34, 256, 65, 24, 36, 66, 7, 11, 512, 129, 40, 68, 13, 19, 48, 130, 72, 14, 257, 21, 80, 35, 258, 132, 513, 22, 25, 37, 136, 96, 260, 26 4, 38, 514, 26, 67, 41, 144, 28, 69, 42, 516, 49, 160, 272, 70, 520, 288, 528, 73, 544, 131, 44, 50, 74, 81, 15, 52, 320, 133, 192, 134, 23, 384, 76, 56, 82, 137, 27, 97, 39, 259, 84, 138, 145, 261, 29, 98, 4 3, 515, 88, 140, 146, 30, 161, 262, 265, 45, 576, 71, 100, 640, 51, 148, 75, 104, 266, 273, 517, 162, 46, 53, 193, 152, 77, 54, 768, 268, 274, 518, 83, 57, 164, 521, 112, 135, 78, 289, 194, 58, 276, 522, 85, 168, 139, 99, 60, 86, 280, 196, 290, 529, 524, 141, 89, 147, 176, 101, 31, 530, 321, 142, 90, 10 5, 545, 292, 322, 532, 263, 200, 149, 102, 304, 296, 47, 208, 92, 267, 385, 546, 324, 150, 386, 163, 106, 153, 55, 165, 328, 536, 577, 548, 113, 154, 79, 269, 224, 578, 166, 108, 519, 552, 59, 270, 6 41, 523, 275, 580, 291, 169, 114, 560, 195, 277, 156, 116, 87, 197, 170, 91, 531, 525, 642, 281, 27 8, 526, 177, 293, 388, 120, 584, 769, 198, 61, 201, 103, 336, 172, 282, 62, 178, 143, 294, 93, 644, 202, 592, 323, 392, 297, 770, 209, 151, 107, 180, 284, 648, 94, 210, 298, 400, 608, 352, 325, 533, 155, 109, 305, 547, 300, 204, 184, 534, 537, 167, 115, 225, 326, 306, 772, 157, 656, 329, 110, 21 2, 171, 117, 776, 330, 226, 549, 538, 387, 308, 118, 416, 271, 279, 158, 337, 550, 672, 216, 332, 5 79, 540, 389, 173, 121, 553, 199, 784, 179, 228, 338, 312, 704, 390, 122, 554, 581, 393, 283, 174, 448, 353, 561, 63, 181, 340, 394, 527, 582, 556, 232, 295, 285, 203, 205, 124, 182, 643, 562, 286, 585, 299, 354, 211, 401, 185, 396, 344, 586, 645, 593, 535, 240, 206, 95, 327, 564, 800, 402, 356, 307, 301, 417, 213, 568, 832, 588, 186, 646, 404, 227, 896, 594, 418, 302, 649, 771, 360, 539, 18 8, 331, 111, 309, 217, 449, 214, 408, 609, 596, 551, 650, 159, 229, 420, 310, 541, 773, 610, 657, 3 33, 119, 600, 339, 218, 368, 652, 230, 391, 313, 450, 542, 334, 175, 555, 774, 233, 123, 658, 612, 341, 777, 220, 314, 424, 395, 673, 583, 355, 287, 183, 234, 125, 557, 660, 616, 342, 316, 241, 77 8, 563, 345, 452, 397, 403, 207, 674, 558, 785, 432, 357, 236, 187, 664, 624, 587, 780, 705, 126, 2 42, 565, 398, 346, 456, 358, 405, 303, 569, 244, 595, 215, 566, 676, 361, 706, 589, 189, 786, 647, 348, 419, 406, 464, 680, 801, 362, 590, 409, 570, 788, 597, 572, 248, 311, 708, 598, 601, 651, 42 1, 792, 802, 611, 602, 410, 219, 688, 653, 190, 369, 231, 364, 654, 659, 335, 480, 315, 221, 370, 6 13, 422, 425, 451, 614, 543, 235, 412, 343, 372, 775, 317, 222, 426, 453, 237, 559, 833, 804, 712, 834, 661, 808, 779, 617, 604, 433, 720, 816, 836, 347, 897, 243, 662, 454, 318, 675, 618, 898, 78 1, 376, 428, 665, 736, 567, 840, 625, 245, 359, 457, 399, 787, 591, 678, 434, 677, 349, 127, 458, 6 66, 620, 363, 238, 246, 782, 407, 436, 626, 571, 465, 681, 249, 707, 350, 599, 668, 790, 460, 250, 682, 573, 411, 803, 789, 709, 365, 440, 628, 689, 374, 423, 466, 793, 191, 371, 481, 574, 413, 60 3, 366, 468, 655, 900, 805, 615, 684, 710, 429, 794, 252, 373, 605, 848, 690, 713, 632, 482, 806, 4 27, 904, 414, 223, 663, 692, 835, 619, 472, 455, 796, 809, 714, 721, 837, 716, 864, 810, 606, 912, 722, 696, 377, 435, 817, 319, 621, 812, 484, 430, 838, 667, 488, 239, 378, 459, 622, 627, 437, 38 0, 818, 461, 496, 669, 679, 724, 841, 629, 351, 467, 438, 737, 247, 462, 442, 441, 469, 251, 683, 8 42, 738, 899, 670, 783, 849, 820, 728, 928, 791, 367, 901, 630, 685, 844, 633, 711, 253, 691, 824, 902, 686, 740, 850, 375, 444, 470, 483, 415, 485, 905, 795, 473, 634, 744, 852, 960, 865, 693, 79 7, 906, 715, 807, 474, 636, 694, 254, 717, 575, 913, 798, 811, 379, 697, 431, 607, 489, 866, 723, 4 86, 908, 718, 813, 476, 856, 839, 725, 698, 914, 752, 868, 819, 814, 439, 929, 490, 623, 671, 739, 916, 463, 843, 381, 497, 930, 821, 726, 96, 872, 492, 631, 872, 492, 631, 729, 700, 443, 741, 845, 920, 382, 82 2, 851, 730, 498, 880, 742, 445, 471, 635, 932, 687, 903, 825, 500, 846, 745, 826, 732, 446, 962, 9 36, 475, 853, 867, 637, 907, 487, 695, 746, 828, 753, 854, 857, 504, 799, 255, 964, 909, 719, 477, 915, 638, 748, 944, 869, 491, 699, 754, 858, 478, 968, 383, 910, 815, 976, 870, 917, 727, 493, 87 3, 701, 931, 756, 860, 499, 731, 823, 922, 874, 918, 502, 933, 743, 760, 881, 494, 702, 921, 501, 8 76, 847, 992, 447, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 91 9, 875, 862, 758, 948, 977, 923, 972, 761, 877, 952, 495, 703, 935, 978, 883, 762, 503, 925, 878, 7 35, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 95 9, 1011, 1013, 895, 1006, 1014, 1017, 1018, 991, 1020, 1007, 1015, 1019, 1021, 1022, 1023]

TABLE Q26 with a sequence length of 1024:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 64 |
| 9 | 5 |
| 10 | 6 |
| 11 | 9 |
| 12 | 128 |
| 13 | 10 |
| 14 | 17 |
| 15 | 12 |
| 16 | 18 |
| 17 | 33 |
| 18 | 20 |
| 19 | 34 |
| 20 | 256 |
| 21 | 65 |
| 22 | 24 |
| 23 | 36 |
| 24 | 66 |
| 25 | 7 |
| 26 | 11 |
| 27 | 512 |
| 28 | 129 |
| 29 | 40 |
| 30 | 68 |
| 31 | 13 |
| 32 | 19 |
| 33 | 48 |
| 34 | 130 |
| 35 | 72 |
| 36 | 14 |
| 37 | 257 |
| 38 | 21 |
| 39 | 80 |
| 40 | 35 |
| 41 | 258 |
| 42 | 132 |
| 43 | 513 |
| 44 | 22 |
| 45 | 25 |
| 46 | 37 |
| 47 | 136 |
| 48 | 96 |

TABLE Q26-continued with a sequence length of 1024:

| Reliability or reliability sequence number | Polarized channel sequence number |
|---|---|
| 49 | 260 |
| 50 | 264 |
| 51 | 38 |
| 52 | 514 |
| 53 | 26 |
| 54 | 67 |
| 55 | 41 |
| 56 | 144 |
| 57 | 28 |
| 58 | 69 |
| 59 | 42 |
| 60 | 516 |
| 61 | 49 |
| 62 | 160 |
| 63 | 272 |
| 64 | 70 |
| 65 | 520 |
| 66 | 288 |
| 67 | 528 |
| 68 | 73 |
| 69 | 544 |
| 70 | 131 |
| 71 | 44 |
| 72 | 50 |
| 73 | 74 |
| 74 | 81 |
| 75 | 15 |
| 76 | 52 |
| 77 | 320 |
| 78 | 133 |
| 79 | 192 |
| 80 | 134 |
| 81 | 23 |
| 82 | 384 |
| 83 | 76 |
| 84 | 56 |
| 85 | 82 |
| 86 | 137 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 98 |
| 97 | 43 |
| 98 | 515 |
| 99 | 88 |
| 100 | 140 |
| 101 | 146 |
| 102 | 30 |
| 103 | 161 |
| 104 | 262 |
| 105 | 265 |
| 106 | 45 |
| 107 | 576 |
| 108 | 71 |
| 109 | 100 |
| 110 | 640 |
| 111 | 51 |
| 112 | 148 |
| 113 | 75 |
| 114 | 104 |
| 115 | 266 |
| 116 | 273 |
| 117 | 517 |
| 118 | 162 |
| 119 | 46 |
| 120 | 53 |
| 121 | 193 |
| 122 | 152 |
| 123 | 77 |

TABLE Q26-continued with a sequence length of 1024:

| Reliability or reliability sequence number | Polarized channel sequence number |
|---|---|
| 124 | 54 |
| 125 | 768 |
| 126 | 268 |
| 127 | 274 |
| 128 | 518 |
| 129 | 83 |
| 130 | 57 |
| 131 | 164 |
| 132 | 521 |
| 133 | 112 |
| 134 | 135 |
| 135 | 78 |
| 136 | 289 |
| 137 | 194 |
| 138 | 58 |
| 139 | 276 |
| 140 | 522 |
| 141 | 85 |
| 142 | 168 |
| 143 | 139 |
| 144 | 99 |
| 145 | 60 |
| 146 | 86 |
| 147 | 280 |
| 148 | 196 |
| 149 | 290 |
| 150 | 529 |
| 151 | 524 |
| 152 | 141 |
| 153 | 89 |
| 154 | 147 |
| 155 | 176 |
| 156 | 101 |
| 157 | 31 |
| 158 | 530 |
| 159 | 321 |
| 160 | 142 |
| 161 | 90 |
| 162 | 105 |
| 163 | 545 |
| 164 | 292 |
| 165 | 322 |
| 166 | 532 |
| 167 | 263 |
| 168 | 200 |
| 169 | 149 |
| 170 | 102 |
| 171 | 304 |
| 172 | 296 |
| 173 | 47 |
| 174 | 208 |
| 175 | 92 |
| 176 | 267 |
| 177 | 385 |
| 178 | 546 |
| 179 | 324 |
| 180 | 150 |
| 181 | 386 |
| 182 | 163 |
| 183 | 106 |
| 184 | 153 |
| 185 | 55 |
| 186 | 165 |
| 187 | 328 |
| 188 | 536 |
| 189 | 577 |
| 190 | 548 |
| 191 | 113 |
| 192 | 154 |
| 193 | 79 |
| 194 | 269 |
| 195 | 224 |
| 196 | 578 |
| 197 | 166 |
| 198 | 108 |

TABLE Q26-continued

| with a sequence length of 1024: | |
|---|---|
| Reliability or reliability sequence number | Polarized channel sequence number |
| 199 | 519 |
| 200 | 552 |
| 201 | 59 |
| 202 | 270 |
| 203 | 641 |
| 204 | 523 |
| 205 | 275 |
| 206 | 580 |
| 207 | 291 |
| 208 | 169 |
| 209 | 114 |
| 210 | 560 |
| 211 | 195 |
| 212 | 277 |
| 213 | 156 |
| 214 | 116 |
| 215 | 87 |
| 216 | 197 |
| 217 | 170 |
| 218 | 91 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 120 |
| 229 | 584 |
| 230 | 769 |
| 231 | 198 |
| 232 | 61 |
| 233 | 201 |
| 234 | 103 |
| 235 | 336 |
| 236 | 172 |
| 237 | 282 |
| 238 | 62 |
| 239 | 178 |
| 240 | 143 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 209 |
| 251 | 151 |
| 252 | 107 |
| 253 | 180 |
| 254 | 284 |
| 255 | 648 |
| 256 | 94 |
| 257 | 210 |
| 258 | 298 |
| 259 | 400 |
| 260 | 608 |
| 261 | 352 |
| 262 | 325 |
| 263 | 533 |
| 264 | 155 |
| 265 | 109 |
| 266 | 305 |
| 267 | 547 |
| 268 | 300 |
| 269 | 204 |
| 270 | 184 |
| 271 | 534 |
| 272 | 537 |
| 273 | 167 |

TABLE Q26-continued

| with a sequence length of 1024: | |
|---|---|
| Reliability or reliability sequence number | Polarized channel sequence number |
| 274 | 115 |
| 275 | 225 |
| 276 | 326 |
| 277 | 306 |
| 278 | 772 |
| 279 | 157 |
| 280 | 656 |
| 281 | 329 |
| 282 | 110 |
| 283 | 212 |
| 284 | 171 |
| 285 | 117 |
| 286 | 776 |
| 287 | 330 |
| 288 | 226 |
| 289 | 549 |
| 290 | 538 |
| 291 | 387 |
| 292 | 308 |
| 293 | 118 |
| 294 | 416 |
| 295 | 271 |
| 296 | 279 |
| 297 | 158 |
| 298 | 337 |
| 299 | 550 |
| 300 | 672 |
| 301 | 216 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 122 |
| 318 | 554 |
| 319 | 581 |
| 320 | 393 |
| 321 | 283 |
| 322 | 174 |
| 323 | 448 |
| 324 | 353 |
| 325 | 561 |
| 326 | 63 |
| 327 | 181 |
| 328 | 340 |
| 329 | 394 |
| 330 | 527 |
| 331 | 582 |
| 332 | 556 |
| 333 | 232 |
| 334 | 295 |
| 335 | 285 |
| 336 | 203 |
| 337 | 205 |
| 338 | 124 |
| 339 | 182 |
| 340 | 643 |
| 341 | 562 |
| 342 | 286 |
| 343 | 585 |
| 344 | 299 |
| 345 | 354 |
| 346 | 211 |
| 347 | 401 |
| 348 | 185 |

TABLE Q26-continued

| with a sequence length of 1024: | |
|---|---|
| Reliability or reliability sequence number | Polarized channel sequence number |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 188 |
| 383 | 331 |
| 384 | 111 |
| 385 | 309 |
| 386 | 217 |
| 387 | 449 |
| 388 | 214 |
| 389 | 408 |
| 390 | 609 |
| 391 | 596 |
| 392 | 551 |
| 393 | 650 |
| 394 | 159 |
| 395 | 229 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 175 |
| 416 | 555 |
| 417 | 774 |
| 418 | 233 |
| 419 | 123 |
| 420 | 658 |
| 421 | 612 |
| 422 | 341 |
| 423 | 777 |

TABLE Q26-continued

| with a sequence length of 1024: | |
|---|---|
| Reliability or reliability sequence number | Polarized channel sequence number |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 236 |
| 454 | 187 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 215 |
| 473 | 566 |
| 474 | 676 |
| 475 | 361 |
| 476 | 706 |
| 477 | 589 |
| 478 | 189 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 248 |
| 495 | 311 |
| 496 | 708 |
| 497 | 598 |
| 498 | 601 |

TABLE Q26-continued

| with a sequence length of 1024: | |
|---|---|
| Reliability or reliability sequence number | Polarized channel sequence number |
| 499 | 651 |
| 500 | 421 |
| 501 | 792 |
| 502 | 802 |
| 503 | 611 |
| 504 | 602 |
| 505 | 410 |
| 506 | 219 |
| 507 | 688 |
| 508 | 653 |
| 509 | 190 |
| 510 | 369 |
| 511 | 231 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 245 |
| 568 | 359 |
| 569 | 457 |
| 570 | 399 |
| 571 | 787 |
| 572 | 591 |
| 573 | 678 |

TABLE Q26-continued

| with a sequence length of 1024: | |
|---|---|
| Reliability or reliability sequence number | Polarized channel sequence number |
| 574 | 434 |
| 575 | 677 |
| 576 | 349 |
| 577 | 127 |
| 578 | 458 |
| 579 | 666 |
| 580 | 620 |
| 581 | 363 |
| 582 | 238 |
| 583 | 246 |
| 584 | 782 |
| 585 | 407 |
| 586 | 436 |
| 587 | 626 |
| 588 | 571 |
| 589 | 465 |
| 590 | 681 |
| 591 | 249 |
| 592 | 707 |
| 593 | 350 |
| 594 | 599 |
| 595 | 668 |
| 596 | 790 |
| 597 | 460 |
| 598 | 250 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 191 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |

TABLE Q26-continued

| with a sequence length of 1024: | |
|---|---|
| Reliability or reliability sequence number | Polarized channel sequence number |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 377 |
| 661 | 435 |
| 662 | 817 |
| 663 | 319 |
| 664 | 621 |
| 665 | 812 |
| 666 | 484 |
| 667 | 430 |
| 668 | 838 |
| 669 | 667 |
| 670 | 488 |
| 671 | 239 |
| 672 | 378 |
| 673 | 459 |
| 674 | 622 |
| 675 | 627 |
| 676 | 437 |
| 677 | 380 |
| 678 | 818 |
| 679 | 461 |
| 680 | 496 |
| 681 | 669 |
| 682 | 679 |
| 683 | 724 |
| 684 | 841 |
| 685 | 629 |
| 686 | 351 |
| 687 | 467 |
| 688 | 438 |
| 689 | 737 |
| 690 | 247 |
| 691 | 462 |
| 692 | 442 |
| 693 | 441 |
| 694 | 469 |
| 695 | 251 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 367 |
| 708 | 901 |
| 709 | 630 |
| 710 | 685 |
| 711 | 844 |
| 712 | 633 |
| 713 | 711 |
| 714 | 253 |
| 715 | 691 |
| 716 | 824 |
| 717 | 902 |
| 718 | 686 |
| 719 | 740 |
| 720 | 850 |
| 721 | 375 |
| 722 | 444 |
| 723 | 470 |

TABLE Q26-continued

| with a sequence length of 1024: | |
|---|---|
| Reliability or reliability sequence number | Polarized channel sequence number |
| 724 | 483 |
| 725 | 415 |
| 726 | 485 |
| 727 | 905 |
| 728 | 795 |
| 729 | 473 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 474 |
| 741 | 636 |
| 742 | 694 |
| 743 | 254 |
| 744 | 717 |
| 745 | 575 |
| 746 | 913 |
| 747 | 798 |
| 748 | 811 |
| 749 | 379 |
| 750 | 697 |
| 751 | 431 |
| 752 | 607 |
| 753 | 489 |
| 754 | 866 |
| 755 | 723 |
| 756 | 486 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 439 |
| 771 | 929 |
| 772 | 490 |
| 773 | 623 |
| 774 | 671 |
| 775 | 739 |
| 776 | 916 |
| 777 | 463 |
| 778 | 843 |
| 779 | 381 |
| 780 | 497 |
| 781 | 930 |
| 782 | 821 |
| 783 | 726 |
| 784 | 961 |
| 785 | 872 |
| 786 | 492 |
| 787 | 631 |
| 788 | 729 |
| 789 | 700 |
| 790 | 443 |
| 791 | 741 |
| 792 | 845 |
| 793 | 920 |
| 794 | 382 |
| 795 | 822 |
| 796 | 851 |
| 797 | 730 |
| 798 | 498 |

TABLE Q26-continued

| with a sequence length of 1024: | |
|---|---|
| Reliability or reliability sequence number | Polarized channel sequence number |
| 799 | 880 |
| 800 | 742 |
| 801 | 445 |
| 802 | 471 |
| 803 | 635 |
| 804 | 932 |
| 805 | 687 |
| 806 | 903 |
| 807 | 825 |
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |

TABLE Q26-continued

| with a sequence length of 1024: | |
|---|---|
| Reliability or reliability sequence number | Polarized channel sequence number |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |

TABLE Q26-continued

| with a sequence length of 1024: | |
|---|---|
| Reliability or reliability sequence number | Polarized channel sequence number |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Z26, with a sequence length of 1024:
[0, 1, 2, 7, 3, 9, 10, 25, 4, 11, 13, 26, 15, 31, 36, 75, 5, 14, 16, 32, 18, 38, 44, 81, 22, 45, 53, 87, 57, 95, 102, 157, 6, 17, 19, 40, 23, 46, 51, 89, 29, 55, 59, 97, 71, 106, 119, 173, 33, 61, 72, 111, 7 6, 120, 124, 185, 84, 130, 138, 201, 145, 232, 238, 326, 8, 21, 24, 54, 30, 58, 64, 108, 35, 68, 73, 11 3, 83, 123, 135, 193, 39, 74, 85, 129, 91, 141, 146, 215, 99, 153, 161, 218, 175, 242, 256, 357, 48, 8 8, 96, 144, 109, 156, 170, 234, 114, 162, 183, 252, 198, 265, 282, 384, 133, 191, 209, 274, 214, 28 5, 293, 403, 228, 307, 317, 419, 338, 434, 460, 577, 12, 28, 34, 70, 42, 78, 80, 134, 47, 86, 92, 143, 100, 152, 160, 240, 56, 93, 101, 154, 112, 169, 180, 251, 122, 184, 192, 264, 213, 279, 297, 394, 6 2, 103, 118, 182, 131, 186, 197, 273, 142, 208, 217, 284, 236, 306, 322, 415, 155, 225, 239, 311, 2 53, 327, 339, 432, 270, 348, 370, 454, 382, 478, 509, 613, 79, 121, 137, 211, 148, 216, 231, 309, 1 68, 233, 244, 336, 269, 337, 356, 447, 174, 250, 257, 346, 283, 366, 388, 472, 301, 386, 406, 506, 424, 518, 532, 641, 195, 275, 288, 373, 312, 395, 409, 511, 333, 418, 433, 526, 453, 535, 582, 67 1, 355, 440, 461, 552, 470, 567, 583, 690, 494, 591, 598, 695, 629, 714, 743, 830, 20, 37, 41, 90, 4 9, 94, 104, 167, 50, 105, 115, 176, 126, 194, 202, 295, 63, 116, 127, 205, 139, 212, 223, 296, 147, 222, 237, 321, 254, 335, 342, 431, 66, 136, 149, 207, 164, 226, 241, 334, 172, 248, 258, 344, 268, 364, 377, 468, 171, 266, 277, 363, 292, 385, 397, 495, 314, 411, 425, 517, 439, 531, 555, 663, 77, 159, 165, 246, 179, 262, 276, 358, 187, 281, 287, 383, 302, 402, 414, 515, 235, 298, 313, 405, 32 8, 422, 438, 528, 350, 443, 464, 550, 481, 576, 593, 686, 261, 324, 345, 430, 362, 452, 466, 568, 3 80, 475, 487, 581, 512, 605, 619, 707, 407, 510, 519, 614, 529, 630, 609, 721, 560, 660, 672, 749, 677, 779, 794, 846, 82, 177, 181, 291, 227, 305, 316, 410, 247, 320, 329, 427, 349, 445, 463, 570, 259, 347, 361, 446, 372, 467, 483, 585, 389, 489, 505, 601, 527, 617, 640, 725, 294, 365, 376, 48 2, 396, 500, 521, 610, 426, 522, 533, 638, 561, 627, 667, 751, 451, 546, 574, 661, 586, 676, 688, 7 70, 606, 693, 692, 790, 722, 801, 813, 877, 323, 387, 412, 523, 444, 534, 554, 647, 465, 569, 578, 673, 597, 679, 691, 777, 484, 589, 611, 687, 620, 694, 723, 802, 646, 729, 740, 816, 760, 834, 84 4, 905, 516, 615, 636, 724, 666, 726, 756, 821, 670, 753, 772, 840, 786, 853, 870, 924, 680, 780, 7 98, 859, 808, 873, 865, 930, 828, 885, 893, 946, 909, 954, 963, 984, 27, 43, 52, 98, 60, 117, 128, 1 99, 65, 132, 140, 204, 151, 220, 224, 330, 67, 150, 158, 219, 166, 263, 271, 354, 188, 272, 290, 38 1, 304, 398, 413, 525, 69, 163, 178, 267, 190, 289, 299, 392, 200, 308, 318, 416, 332, 435, 449, 53 6, 210, 325, 341, 442, 359, 462, 473, 564, 367, 469, 490, 588, 493, 600, 616, 745, 107, 189, 196, 3 03, 206, 319, 331, 429, 229, 343, 351, 457, 369, 477, 488, 572, 245, 353, 375, 471, 391, 492, 497, 594, 404, 498, 504, 618, 545, 631, 656, 752, 260, 390, 400, 503, 421, 520, 524, 624, 437, 544, 55 7, 645, 580, 664, 674, 773, 456, 566, 587, 675, 607, 685, 709, 787, 635, 712, 730, 803, 741, 819, 8 36, 903, 10, 203, 221, 340, 243, 352, 371, 480, 255, 378, 393, 499, 408, 508, 513, 621, 280, 401, 420, 514, 436, 541, 553, 642, 455, 562, 579, 669, 595, 681, 700, 774, 300, 428, 448, 556, 474, 57 5, 573, 682, 485, 590, 599, 696, 625, 710, 718, 805, 507, 608, 633, 715, 643, 735, 742, 822, 659, 7 50, 764, 841, 789, 855, 871, 925, 315, 459, 476, 592, 496, 604, 626, 713, 539, 634, 650, 738, 653, 744, 758, 833, 547, 651, 658, 755, 683, 763, 783, 852, 704, 788, 797, 860, 812, 878, 888, 933, 56 3, 689, 698, 775, 719, 791, 800, 867, 731, 810, 823, 884, 837, 894, 907, 949, 766, 825, 842, 897, 8 57, 911, 916, 961, 868, 921, 929, 966, 940, 974, 983, 1003, 125, 230, 249, 379, 278, 399, 417, 53 0, 286, 423, 441, 543, 458, 559, 584, 701, 310, 450, 479, 571, 491, 603, 596, 706, 501, 612, 628, 7 28, 648, 736, 747, 829, 360, 486, 502, 602, 538, 623, 637, 739, 542, 649, 655, 748, 665, 759, 769, 848, 548, 662, 678, 768, 703, 782, 795, 861, 716, 807, 811, 879, 824, 889, 900, 944, 368, 537, 54 0, 644, 549, 652, 668, 762, 565, 684, 697, 778, 711, 792, 809, 875, 632, 702, 720, 796, 732, 817, 8 26, 886, 761, 827, 843, 898, 858, 910, 915, 960, 654, 734, 754, 818, 767, 839, 850, 902, 785, 854, 863, 914, 874, 922, 932, 969, 799, 869, 881, 928, 892, 935, 943, 976, 904, 947, 953, 981, 958, 98 9, 991, 1011, 374, 551, 558, 699, 622, 708, 717, 806, 639, 727, 737, 820, 757, 832, 847, 901, 657, 746, 765, 835, 776, 851, 864, 913, 793, 872, 862, 919, 887, 931, 939, 972, 705, 771, 781, 856, 80 4, 866, 880, 926, 815, 882, 891, 936, 899, 941, 950, 980, 838, 895, 906, 945, 917, 955, 959, 987, 9 23, 965, 968, 993, 975, 996, 998, 1008, 733, 784, 814, 883, 831, 890, 896, 942, 845, 908, 912, 95 2, 920, 956, 967, 990, 849, 918, 927, 964, 938, 970, 971, 997, 948, 977, 979, 999, 985, 1004, 100 6, 1016, 876, 934, 937, 973, 951, 978, 982, 1001, 957, 986, 988, 1005, 994, 1007, 1012, 1018, 96 2, 992, 995, 1009, 1000, 1010, 1013, 1019, 1002, 1014, 1015, 1020, 1017, 1021, 1022, 1023]

TABLE Z26 with a sequence length of 1024:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 9 |
| 6 | 10 |
| 7 | 25 |
| 8 | 4 |
| 9 | 11 |
| 10 | 13 |
| 11 | 26 |
| 12 | 15 |
| 13 | 31 |
| 14 | 36 |
| 15 | 75 |
| 16 | 5 |
| 17 | 14 |
| 18 | 16 |
| 19 | 32 |
| 20 | 18 |
| 21 | 38 |
| 22 | 44 |
| 23 | 81 |
| 24 | 22 |
| 25 | 45 |
| 26 | 53 |
| 27 | 87 |
| 28 | 57 |
| 29 | 95 |
| 30 | 102 |

TABLE Z26-continued with a sequence length of 1024:

| Polarized channel sequence number | Reliability or reliability sequence number |
|---|---|
| 31 | 157 |
| 32 | 6 |
| 33 | 17 |
| 34 | 19 |
| 35 | 40 |
| 36 | 23 |
| 37 | 46 |
| 38 | 51 |
| 39 | 89 |
| 40 | 29 |
| 41 | 55 |
| 42 | 59 |
| 43 | 97 |
| 44 | 71 |
| 45 | 106 |
| 46 | 119 |
| 47 | 173 |
| 48 | 33 |
| 49 | 61 |
| 50 | 72 |
| 51 | 111 |
| 52 | 76 |
| 53 | 120 |
| 54 | 124 |
| 55 | 185 |
| 56 | 84 |
| 57 | 130 |
| 58 | 138 |
| 59 | 201 |
| 60 | 145 |
| 61 | 232 |
| 62 | 238 |
| 63 | 326 |
| 64 | 8 |
| 65 | 21 |
| 66 | 24 |
| 67 | 54 |
| 68 | 30 |
| 69 | 58 |
| 70 | 64 |
| 71 | 108 |
| 72 | 35 |
| 73 | 68 |
| 74 | 73 |
| 75 | 113 |
| 76 | 83 |
| 77 | 123 |
| 78 | 135 |
| 79 | 193 |
| 80 | 39 |
| 81 | 74 |
| 82 | 85 |
| 83 | 129 |
| 84 | 91 |
| 85 | 141 |
| 86 | 146 |
| 87 | 215 |
| 88 | 99 |
| 89 | 153 |
| 90 | 161 |
| 91 | 218 |
| 92 | 175 |
| 93 | 242 |
| 94 | 256 |
| 95 | 357 |
| 96 | 48 |
| 97 | 88 |
| 98 | 96 |
| 99 | 144 |
| 100 | 109 |
| 101 | 156 |
| 102 | 170 |
| 103 | 234 |
| 104 | 114 |
| 105 | 162 |

TABLE Z26-continued with a sequence length of 1024:

| Polarized channel sequence number | Reliability or reliability sequence number |
|---|---|
| 106 | 183 |
| 107 | 252 |
| 108 | 198 |
| 109 | 265 |
| 110 | 282 |
| 111 | 384 |
| 112 | 133 |
| 113 | 191 |
| 114 | 209 |
| 115 | 274 |
| 116 | 214 |
| 117 | 285 |
| 118 | 293 |
| 119 | 403 |
| 120 | 228 |
| 121 | 307 |
| 122 | 317 |
| 123 | 419 |
| 124 | 338 |
| 125 | 434 |
| 126 | 460 |
| 127 | 577 |
| 128 | 12 |
| 129 | 28 |
| 130 | 34 |
| 131 | 70 |
| 132 | 42 |
| 133 | 78 |
| 134 | 80 |
| 135 | 134 |
| 136 | 47 |
| 137 | 86 |
| 138 | 92 |
| 139 | 143 |
| 140 | 100 |
| 141 | 152 |
| 142 | 160 |
| 143 | 240 |
| 144 | 56 |
| 145 | 93 |
| 146 | 101 |
| 147 | 154 |
| 148 | 112 |
| 149 | 169 |
| 150 | 180 |
| 151 | 251 |
| 152 | 122 |
| 153 | 184 |
| 154 | 192 |
| 155 | 264 |
| 156 | 213 |
| 157 | 279 |
| 158 | 297 |
| 159 | 394 |
| 160 | 62 |
| 161 | 103 |
| 162 | 118 |
| 163 | 182 |
| 164 | 131 |
| 165 | 186 |
| 166 | 197 |
| 167 | 273 |
| 168 | 142 |
| 169 | 208 |
| 170 | 217 |
| 171 | 284 |
| 172 | 236 |
| 173 | 306 |
| 174 | 322 |
| 175 | 415 |
| 176 | 155 |
| 177 | 225 |
| 178 | 239 |
| 179 | 311 |
| 180 | 253 |

TABLE Z26-continued with a sequence length of 1024:

| Polarized channel sequence number | Reliability or reliability sequence number |
|---|---|
| 181 | 327 |
| 182 | 339 |
| 183 | 432 |
| 184 | 270 |
| 185 | 348 |
| 186 | 370 |
| 187 | 454 |
| 188 | 382 |
| 189 | 478 |
| 190 | 509 |
| 191 | 613 |
| 192 | 79 |
| 193 | 121 |
| 194 | 137 |
| 195 | 211 |
| 196 | 148 |
| 197 | 216 |
| 198 | 231 |
| 199 | 309 |
| 200 | 168 |
| 201 | 233 |
| 202 | 244 |
| 203 | 336 |
| 204 | 269 |
| 205 | 337 |
| 206 | 356 |
| 207 | 447 |
| 208 | 174 |
| 209 | 250 |
| 210 | 257 |
| 211 | 346 |
| 212 | 283 |
| 213 | 366 |
| 214 | 388 |
| 215 | 472 |
| 216 | 301 |
| 217 | 386 |
| 218 | 406 |
| 219 | 506 |
| 220 | 424 |
| 221 | 518 |
| 222 | 532 |
| 223 | 641 |
| 224 | 195 |
| 225 | 275 |
| 226 | 288 |
| 227 | 373 |
| 228 | 312 |
| 229 | 395 |
| 230 | 409 |
| 231 | 511 |
| 232 | 333 |
| 233 | 418 |
| 234 | 433 |
| 235 | 526 |
| 236 | 453 |
| 237 | 535 |
| 238 | 582 |
| 239 | 671 |
| 240 | 355 |
| 241 | 440 |
| 242 | 461 |
| 243 | 552 |
| 244 | 470 |
| 245 | 567 |
| 246 | 583 |
| 247 | 690 |
| 248 | 494 |
| 249 | 591 |
| 250 | 598 |
| 251 | 695 |
| 252 | 629 |
| 253 | 714 |
| 254 | 743 |
| 255 | 830 |

TABLE Z26-continued with a sequence length of 1024:

| Polarized channel sequence number | Reliability or reliability sequence number |
|---|---|
| 256 | 20 |
| 257 | 37 |
| 258 | 41 |
| 259 | 90 |
| 260 | 49 |
| 261 | 94 |
| 262 | 104 |
| 263 | 167 |
| 264 | 50 |
| 265 | 105 |
| 266 | 115 |
| 267 | 176 |
| 268 | 126 |
| 269 | 194 |
| 270 | 202 |
| 271 | 295 |
| 272 | 63 |
| 273 | 116 |
| 274 | 127 |
| 275 | 205 |
| 276 | 139 |
| 277 | 212 |
| 278 | 223 |
| 279 | 296 |
| 280 | 147 |
| 281 | 222 |
| 282 | 237 |
| 283 | 321 |
| 284 | 254 |
| 285 | 335 |
| 286 | 342 |
| 287 | 431 |
| 288 | 66 |
| 289 | 136 |
| 290 | 149 |
| 291 | 207 |
| 292 | 164 |
| 293 | 226 |
| 294 | 241 |
| 295 | 334 |
| 296 | 172 |
| 297 | 248 |
| 298 | 258 |
| 299 | 344 |
| 300 | 268 |
| 301 | 364 |
| 302 | 377 |
| 303 | 468 |
| 304 | 171 |
| 305 | 266 |
| 306 | 277 |
| 307 | 363 |
| 308 | 292 |
| 309 | 385 |
| 310 | 397 |
| 311 | 495 |
| 312 | 314 |
| 313 | 411 |
| 314 | 425 |
| 315 | 517 |
| 316 | 439 |
| 317 | 531 |
| 318 | 555 |
| 319 | 663 |
| 320 | 77 |
| 321 | 159 |
| 322 | 165 |
| 323 | 246 |
| 324 | 179 |
| 325 | 262 |
| 326 | 276 |
| 327 | 358 |
| 328 | 187 |
| 329 | 281 |
| 330 | 287 |

TABLE Z26-continued with a sequence length of 1024:

| Polarized channel sequence number | Reliability or reliability sequence number |
|---|---|
| 331 | 383 |
| 332 | 302 |
| 333 | 402 |
| 334 | 414 |
| 335 | 515 |
| 336 | 235 |
| 337 | 298 |
| 338 | 313 |
| 339 | 405 |
| 340 | 328 |
| 341 | 422 |
| 342 | 438 |
| 343 | 528 |
| 344 | 350 |
| 345 | 443 |
| 346 | 464 |
| 347 | 550 |
| 348 | 481 |
| 349 | 576 |
| 350 | 593 |
| 351 | 686 |
| 352 | 261 |
| 353 | 324 |
| 354 | 345 |
| 355 | 430 |
| 356 | 362 |
| 357 | 452 |
| 358 | 466 |
| 359 | 568 |
| 360 | 380 |
| 361 | 475 |
| 362 | 487 |
| 363 | 581 |
| 364 | 512 |
| 365 | 605 |
| 366 | 619 |
| 367 | 707 |
| 368 | 407 |
| 369 | 510 |
| 370 | 519 |
| 371 | 614 |
| 372 | 529 |
| 373 | 630 |
| 374 | 609 |
| 375 | 721 |
| 376 | 560 |
| 377 | 660 |
| 378 | 672 |
| 379 | 749 |
| 380 | 677 |
| 381 | 779 |
| 382 | 794 |
| 383 | 846 |
| 384 | 82 |
| 385 | 177 |
| 386 | 181 |
| 387 | 291 |
| 388 | 227 |
| 389 | 305 |
| 390 | 316 |
| 391 | 410 |
| 392 | 247 |
| 393 | 320 |
| 394 | 329 |
| 395 | 427 |
| 396 | 349 |
| 397 | 445 |
| 398 | 463 |
| 399 | 570 |
| 400 | 259 |
| 401 | 347 |
| 402 | 361 |
| 403 | 446 |
| 404 | 372 |
| 405 | 467 |

TABLE Z26-continued

| with a sequence length of 1024: | |
|---|---|
| Polarized channel sequence number | Reliability or reliability sequence number |
| 406 | 483 |
| 407 | 585 |
| 408 | 389 |
| 409 | 489 |
| 410 | 505 |
| 411 | 601 |
| 412 | 527 |
| 413 | 617 |
| 414 | 640 |
| 415 | 725 |
| 416 | 294 |
| 417 | 365 |
| 418 | 376 |
| 419 | 482 |
| 420 | 396 |
| 421 | 500 |
| 422 | 521 |
| 423 | 610 |
| 424 | 426 |
| 425 | 522 |
| 426 | 533 |
| 427 | 638 |
| 428 | 561 |
| 429 | 627 |
| 430 | 667 |
| 431 | 751 |
| 432 | 451 |
| 433 | 546 |
| 434 | 574 |
| 435 | 661 |
| 436 | 586 |
| 437 | 676 |
| 438 | 688 |
| 439 | 770 |
| 440 | 606 |
| 441 | 693 |
| 442 | 692 |
| 443 | 790 |
| 444 | 722 |
| 445 | 801 |
| 446 | 813 |
| 447 | 877 |
| 448 | 323 |
| 449 | 387 |
| 450 | 412 |
| 451 | 523 |
| 452 | 444 |
| 453 | 534 |
| 454 | 554 |
| 455 | 647 |
| 456 | 465 |
| 457 | 569 |
| 458 | 578 |
| 459 | 673 |
| 460 | 597 |
| 461 | 679 |
| 462 | 691 |
| 463 | 777 |
| 464 | 484 |
| 465 | 589 |
| 466 | 611 |
| 467 | 687 |
| 468 | 620 |
| 469 | 694 |
| 470 | 723 |
| 471 | 802 |
| 472 | 646 |
| 473 | 729 |
| 474 | 740 |
| 475 | 816 |
| 476 | 760 |
| 477 | 834 |
| 478 | 844 |
| 479 | 905 |
| 480 | 516 |

TABLE Z26-continued

| with a sequence length of 1024: | |
|---|---|
| Polarized channel sequence number | Reliability or reliability sequence number |
| 481 | 615 |
| 482 | 636 |
| 483 | 724 |
| 484 | 666 |
| 485 | 726 |
| 486 | 756 |
| 487 | 821 |
| 488 | 670 |
| 489 | 753 |
| 490 | 772 |
| 491 | 840 |
| 492 | 786 |
| 493 | 853 |
| 494 | 870 |
| 495 | 924 |
| 496 | 680 |
| 497 | 780 |
| 498 | 798 |
| 499 | 859 |
| 500 | 808 |
| 501 | 873 |
| 502 | 865 |
| 503 | 930 |
| 504 | 828 |
| 505 | 885 |
| 506 | 893 |
| 507 | 946 |
| 508 | 909 |
| 509 | 954 |
| 510 | 963 |
| 511 | 984 |
| 512 | 27 |
| 513 | 43 |
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |
| 526 | 224 |
| 527 | 330 |
| 528 | 67 |
| 529 | 150 |
| 530 | 158 |
| 531 | 219 |
| 532 | 166 |
| 533 | 263 |
| 534 | 271 |
| 535 | 354 |
| 536 | 188 |
| 537 | 272 |
| 538 | 290 |
| 539 | 381 |
| 540 | 304 |
| 541 | 398 |
| 542 | 413 |
| 543 | 525 |
| 544 | 69 |
| 545 | 163 |
| 546 | 178 |
| 547 | 267 |
| 548 | 190 |
| 549 | 289 |
| 550 | 299 |
| 551 | 392 |
| 552 | 200 |
| 553 | 308 |
| 554 | 318 |
| 555 | 416 |

TABLE Z26-continued with a sequence length of 1024:

| Polarized channel sequence number | Reliability or reliability sequence number |
|---|---|
| 556 | 332 |
| 557 | 435 |
| 558 | 449 |
| 559 | 536 |
| 560 | 210 |
| 561 | 325 |
| 562 | 341 |
| 563 | 442 |
| 564 | 359 |
| 565 | 462 |
| 566 | 473 |
| 567 | 564 |
| 568 | 367 |
| 569 | 469 |
| 570 | 490 |
| 571 | 588 |
| 572 | 493 |
| 573 | 600 |
| 574 | 616 |
| 575 | 745 |
| 576 | 107 |
| 577 | 189 |
| 578 | 196 |
| 579 | 303 |
| 580 | 206 |
| 581 | 319 |
| 582 | 331 |
| 583 | 429 |
| 584 | 229 |
| 585 | 343 |
| 586 | 351 |
| 587 | 457 |
| 588 | 369 |
| 589 | 477 |
| 590 | 488 |
| 591 | 572 |
| 592 | 245 |
| 593 | 353 |
| 594 | 375 |
| 595 | 471 |
| 596 | 391 |
| 597 | 492 |
| 598 | 497 |
| 599 | 594 |
| 600 | 404 |
| 601 | 498 |
| 602 | 504 |
| 603 | 618 |
| 604 | 545 |
| 605 | 631 |
| 606 | 656 |
| 607 | 752 |
| 608 | 260 |
| 609 | 390 |
| 610 | 400 |
| 611 | 503 |
| 612 | 421 |
| 613 | 520 |
| 614 | 524 |
| 615 | 624 |
| 616 | 437 |
| 617 | 544 |
| 618 | 557 |
| 619 | 645 |
| 620 | 580 |
| 621 | 664 |
| 622 | 674 |
| 623 | 773 |
| 624 | 456 |
| 625 | 566 |
| 626 | 587 |
| 627 | 675 |
| 628 | 607 |
| 629 | 685 |
| 630 | 709 |

TABLE Z26-continued with a sequence length of 1024:

| Polarized channel sequence number | Reliability or reliability sequence number |
|---|---|
| 631 | 787 |
| 632 | 635 |
| 633 | 712 |
| 634 | 730 |
| 635 | 803 |
| 636 | 741 |
| 637 | 819 |
| 638 | 836 |
| 639 | 903 |
| 640 | 110 |
| 641 | 203 |
| 642 | 221 |
| 643 | 340 |
| 644 | 243 |
| 645 | 352 |
| 646 | 371 |
| 647 | 480 |
| 648 | 255 |
| 649 | 378 |
| 650 | 393 |
| 651 | 499 |
| 652 | 408 |
| 653 | 508 |
| 654 | 513 |
| 655 | 621 |
| 656 | 280 |
| 657 | 401 |
| 658 | 420 |
| 659 | 514 |
| 660 | 436 |
| 661 | 541 |
| 662 | 553 |
| 663 | 642 |
| 664 | 455 |
| 665 | 562 |
| 666 | 579 |
| 667 | 669 |
| 668 | 595 |
| 669 | 681 |
| 670 | 700 |
| 671 | 774 |
| 672 | 300 |
| 673 | 428 |
| 674 | 448 |
| 675 | 556 |
| 676 | 474 |
| 677 | 575 |
| 678 | 573 |
| 679 | 682 |
| 680 | 485 |
| 681 | 590 |
| 682 | 599 |
| 683 | 696 |
| 684 | 625 |
| 685 | 710 |
| 686 | 718 |
| 687 | 805 |
| 688 | 507 |
| 689 | 608 |
| 690 | 633 |
| 691 | 715 |
| 692 | 643 |
| 693 | 735 |
| 694 | 742 |
| 695 | 822 |
| 696 | 659 |
| 697 | 750 |
| 698 | 764 |
| 699 | 841 |
| 700 | 789 |
| 701 | 855 |
| 702 | 871 |
| 703 | 925 |
| 704 | 315 |
| 705 | 459 |

TABLE Z26-continued with a sequence length of 1024:

| Polarized channel sequence number | Reliability or reliability sequence number |
|---|---|
| 706 | 476 |
| 707 | 592 |
| 708 | 496 |
| 709 | 604 |
| 710 | 626 |
| 711 | 713 |
| 712 | 539 |
| 713 | 634 |
| 714 | 650 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 812 |
| 733 | 878 |
| 734 | 888 |
| 735 | 933 |
| 736 | 563 |
| 737 | 689 |
| 738 | 698 |
| 739 | 775 |
| 740 | 719 |
| 741 | 791 |
| 742 | 800 |
| 743 | 867 |
| 744 | 731 |
| 745 | 810 |
| 746 | 823 |
| 747 | 884 |
| 748 | 837 |
| 749 | 894 |
| 750 | 907 |
| 751 | 949 |
| 752 | 766 |
| 753 | 825 |
| 754 | 842 |
| 755 | 897 |
| 756 | 857 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 379 |
| 772 | 278 |
| 773 | 399 |
| 774 | 417 |
| 775 | 530 |
| 776 | 286 |
| 777 | 423 |
| 778 | 441 |
| 779 | 543 |
| 780 | 458 |

TABLE Z26-continued with a sequence length of 1024:

| Polarized channel sequence number | Reliability or reliability sequence number |
|---|---|
| 781 | 559 |
| 782 | 584 |
| 783 | 701 |
| 784 | 310 |
| 785 | 450 |
| 786 | 479 |
| 787 | 571 |
| 788 | 491 |
| 789 | 603 |
| 790 | 596 |
| 791 | 706 |
| 792 | 501 |
| 793 | 612 |
| 794 | 628 |
| 795 | 728 |
| 796 | 648 |
| 797 | 736 |
| 798 | 747 |
| 799 | 829 |
| 800 | 360 |
| 801 | 486 |
| 802 | 502 |
| 803 | 602 |
| 804 | 538 |
| 805 | 623 |
| 806 | 637 |
| 807 | 739 |
| 808 | 542 |
| 809 | 649 |
| 810 | 655 |
| 811 | 748 |
| 812 | 665 |
| 813 | 759 |
| 814 | 769 |
| 815 | 848 |
| 816 | 548 |
| 817 | 662 |
| 818 | 678 |
| 819 | 768 |
| 820 | 703 |
| 821 | 782 |
| 822 | 795 |
| 823 | 861 |
| 824 | 716 |
| 825 | 807 |
| 826 | 811 |
| 827 | 879 |
| 828 | 824 |
| 829 | 889 |
| 830 | 900 |
| 831 | 944 |
| 832 | 368 |
| 833 | 537 |
| 834 | 540 |
| 835 | 644 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 875 |
| 848 | 632 |
| 849 | 702 |
| 850 | 720 |
| 851 | 796 |
| 852 | 732 |
| 853 | 817 |
| 854 | 826 |
| 855 | 886 |

TABLE Z26-continued with a sequence length of 1024:

| Polarized channel sequence number | Reliability or reliability sequence number |
|---|---|
| 856 | 761 |
| 857 | 827 |
| 858 | 843 |
| 859 | 898 |
| 860 | 858 |
| 861 | 910 |
| 862 | 915 |
| 863 | 960 |
| 864 | 654 |
| 865 | 734 |
| 866 | 754 |
| 867 | 818 |
| 868 | 767 |
| 869 | 839 |
| 870 | 850 |
| 871 | 902 |
| 872 | 785 |
| 873 | 854 |
| 874 | 863 |
| 875 | 914 |
| 876 | 874 |
| 877 | 922 |
| 878 | 932 |
| 879 | 969 |
| 880 | 799 |
| 881 | 869 |
| 882 | 881 |
| 883 | 928 |
| 884 | 892 |
| 885 | 935 |
| 886 | 943 |
| 887 | 976 |
| 888 | 904 |
| 889 | 947 |
| 890 | 953 |
| 891 | 981 |
| 892 | 958 |
| 893 | 989 |
| 894 | 991 |
| 895 | 1011 |
| 896 | 374 |
| 897 | 551 |
| 898 | 558 |
| 899 | 699 |
| 900 | 622 |
| 901 | 708 |
| 902 | 717 |
| 903 | 806 |
| 904 | 639 |
| 905 | 727 |
| 906 | 737 |
| 907 | 820 |
| 908 | 757 |
| 909 | 832 |
| 910 | 847 |
| 911 | 901 |
| 912 | 657 |
| 913 | 746 |
| 914 | 765 |
| 915 | 835 |
| 916 | 776 |
| 917 | 851 |
| 918 | 864 |
| 919 | 913 |
| 920 | 793 |
| 921 | 872 |
| 922 | 862 |
| 923 | 919 |
| 924 | 887 |
| 925 | 931 |
| 926 | 939 |
| 927 | 972 |
| 928 | 705 |
| 929 | 771 |
| 930 | 781 |

TABLE Z26-continued with a sequence length of 1024:

| Polarized channel sequence number | Reliability or reliability sequence number |
|---|---|
| 931 | 856 |
| 932 | 804 |
| 933 | 866 |
| 934 | 880 |
| 935 | 926 |
| 936 | 815 |
| 937 | 882 |
| 938 | 891 |
| 939 | 936 |
| 940 | 899 |
| 941 | 941 |
| 942 | 950 |
| 943 | 980 |
| 944 | 838 |
| 945 | 895 |
| 946 | 906 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |
| 958 | 998 |
| 959 | 1008 |
| 960 | 733 |
| 961 | 784 |
| 962 | 814 |
| 963 | 883 |
| 964 | 831 |
| 965 | 890 |
| 966 | 896 |
| 967 | 942 |
| 968 | 845 |
| 969 | 908 |
| 970 | 912 |
| 971 | 952 |
| 972 | 920 |
| 973 | 956 |
| 974 | 967 |
| 975 | 990 |
| 976 | 849 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 876 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |

TABLE Z26-continued

| with a sequence length of 1024: | |
|---|---|
| Polarized channel sequence number | Reliability or reliability sequence number |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Sixth group of sequences (in comprehensive consideration of a criterion that a list 4 has optimal performance when a mother code length is 256 and a list 2 is optimal when a mother code length is 1024)

Sequence Q27, with a sequence length of 1024

0, 1, 2, 4, 8, 16, 32, 3, 5, 64, 9, 6, 17, 256, 10, 18, 128, 512, 12, 33, 65, 20, 34, 24, 36, 7, 12 9, 66, 11, 40, 68, 257, 130, 19, 13, 48, 14, 72, 258, 21, 132, 260, 35, 26, 80, 37, 264, 513, 25, 22, 136, 272, 38, 96, 67, 514, 41, 144, 28, 288, 69, 516, 42, 49, 74, 160, 192, 70, 44, 131, 320, 520, 81, 50, 7 3, 15, 384, 133, 52, 528, 23, 134, 76, 137, 82, 56, 27, 259, 544, 97, 261, 39, 84, 138, 145, 29, 43, 26 2, 265, 98, 88, 576, 140, 30, 146, 71, 161, 45, 515, 100, 266, 273, 51, 640, 148, 268, 46, 75, 104, 16 2, 517, 274, 53, 193, 152, 289, 768, 276, 77, 164, 54, 518, 83, 521, 57, 112, 135, 78, 194, 290, 280, 522, 85, 321, 58, 168, 292, 139, 322, 99, 529, 86, 60, 524, 89, 296, 196, 141, 263, 385, 530, 324, 1 01, 147, 176, 142, 31, 304, 200, 545, 532, 328, 90, 386, 149, 102, 105, 163, 92, 546, 47, 267, 208, 536, 150, 388, 153, 165, 336, 106, 548, 269, 577, 55, 113, 154, 79, 519, 108, 275, 392, 270, 352, 2 24, 578, 400, 552, 166, 195, 59, 169, 114, 156, 87, 277, 278, 641, 523, 580, 197, 560, 116, 170, 29 1, 416, 281, 293, 61, 177, 91, 198, 584, 642, 172, 282, 525, 120, 448, 294, 201, 62, 531, 143, 526, 769, 644, 592, 103, 178, 284, 323, 93, 202, 297, 107, 180, 298, 151, 533, 209, 770, 648, 608, 94, 3 25, 204, 305, 547, 534, 300, 326, 155, 210, 109, 537, 772, 184, 387, 306, 271, 329, 656, 115, 167, 225, 330, 549, 157, 110, 538, 117, 308, 389, 337, 672, 776, 332, 550, 312, 212, 171, 579, 226, 54 0, 279, 216, 553, 158, 118, 390, 338, 393, 173, 121, 353, 784, 704, 581, 554, 340, 199, 394, 283, 1 79, 228, 174, 122, 527, 561, 582, 203, 556, 63, 181, 295, 232, 124, 285, 205, 643, 182, 800, 585, 5 62, 354, 211, 401, 299, 185, 240, 206, 586, 95, 564, 535, 344, 645, 356, 402, 286, 832, 417, 327, 5 93, 588, 301, 396, 307, 568, 646, 213, 186, 418, 360, 594, 227, 309, 539, 331, 111, 771, 896, 649, 214, 449, 302, 188, 217, 229, 404, 551, 609, 596, 333, 408, 650, 541, 310, 368, 159, 773, 119, 33 9, 218, 313, 230, 420, 657, 610, 542, 652, 600, 233, 334, 391, 450, 341, 555, 175, 123, 774, 658, 2 20, 612, 183, 314, 777, 395, 424, 355, 234, 125, 583, 241, 557, 345, 342, 452, 673, 660, 616, 563, 778, 397, 287, 207, 558, 432, 316, 357, 674, 403, 187, 236, 664, 785, 587, 624, 346, 780, 398, 56 5, 361, 126, 242, 456, 405, 676, 705, 244, 786, 189, 215, 566, 358, 589, 647, 303, 362, 464, 569, 4 19, 706, 680, 595, 406, 348, 590, 801, 788, 219, 231, 409, 570, 311, 421, 543, 708, 369, 802, 651, 688, 597, 248, 792, 190, 480, 572, 335, 410, 425, 370, 315, 611, 598, 804, 833, 712, 221, 422, 65 3, 364, 601, 235, 317, 775, 451, 343, 659, 412, 222, 433, 453, 613, 559, 654, 834, 808, 602, 720, 3 72, 237, 426, 614, 243, 454, 604, 897, 661, 836, 816, 347, 779, 617, 376, 428, 457, 736, 318, 359, 238, 675, 567, 662, 245, 127, 840, 465, 618, 898, 434, 399, 665, 781, 458, 591, 625, 363, 620, 34 9, 677, 407, 436, 787, 666, 191, 782, 571, 900, 848, 350, 246, 626, 460, 411, 678, 365, 707, 668, 7 89, 440, 681, 573, 371, 628, 599, 481, 249, 904, 864, 423, 803, 574, 466, 790, 413, 366, 468, 250, 709, 682, 482, 632, 427, 793, 655, 912, 603, 689, 373, 710, 684, 252, 414, 374, 805, 472, 794, 37 7, 615, 713, 690, 455, 605, 429, 223, 928, 806, 484, 714, 835, 796, 435, 663, 606, 430, 692, 809, 6 19, 319, 721, 378, 459, 716, 239, 437, 696, 960, 837, 810, 488, 722, 667, 461, 380, 621, 251, 783, 467, 817, 838, 627, 812, 679, 622, 737, 724, 899, 438, 669, 441, 841, 818, 462, 351, 469, 575, 36 7, 738, 629, 670, 442, 728, 842, 683, 791, 820, 247, 901, 630, 470, 740, 849, 415, 496, 844, 633, 4 83, 711, 824, 902, 685, 444, 473, 850, 375, 795, 744, 634, 253, 691, 905, 686, 607, 254, 807, 865, 852, 636, 715, 485, 906, 431, 797, 752, 693, 474, 379, 913, 866, 798, 486, 694, 908, 856, 717, 48 9, 811, 476, 381, 697, 623, 723, 914, 868, 718, 439, 490, 698, 839, 463, 813, 671, 929, 916, 382, 7 25, 872, 819, 497, 700, 814, 443, 631, 492, 739, 930, 726, 920, 843, 498, 880, 821, 729, 961, 741, 471, 822, 730, 845, 825, 851, 846, 745, 445, 742, 932, 635, 255, 962, 826, 903, 687, 500, 732, 85 3, 637, 446, 746, 867, 907, 695, 475, 719, 753, 936, 854, 487, 909, 944, 748, 828, 504, 869, 799, 6 99, 477, 857, 910, 915, 964, 873, 491, 638, 754, 968, 727, 478, 917, 858, 701, 756, 383, 921, 870, 815, 874, 976, 493, 931, 918, 702, 860, 731, 499, 823, 881, 933, 743, 494, 847, 501, 922, 827, 76 0, 447, 733, 876, 934, 963, 882, 937, 924, 992, 855, 747, 502, 829, 734, 965, 938, 505, 884, 639, 9 11, 830, 749, 506, 859, 479, 945, 755, 966, 871, 940, 750, 969, 888, 508, 861, 946, 919, 757, 703, 970, 875, 495, 862, 948, 758, 977, 923, 761, 972, 877, 935, 978, 883, 503, 952, 762, 925, 735, 87 8, 993, 980, 939, 885, 926, 831, 764, 507, 994, 967, 886, 941, 751, 984, 889, 509, 947, 996, 942, 9 71, 890, 510, 863, 949, 759, 1000, 973, 892, 950, 979, 953, 763, 974, 879, 1008, 981, 954, 927, 7 65, 995, 982, 887, 956, 766, 985, 997, 943, 986, 891, 511, 998, 1001, 988, 893, 951, 1002, 975, 8 94, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023

TABLE Q27

| with a sequence length of 1024: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |

TABLE Q27-continued with a sequence length of 1024:

| Reliability or reliability sequence number | Polarized channel sequence number |
|---|---|
| 9 | 64 |
| 10 | 9 |
| 11 | 6 |
| 12 | 17 |
| 13 | 256 |
| 14 | 10 |
| 15 | 18 |
| 16 | 128 |
| 17 | 512 |
| 18 | 12 |
| 19 | 33 |
| 20 | 65 |
| 21 | 20 |
| 22 | 34 |
| 23 | 24 |
| 24 | 36 |
| 25 | 7 |
| 26 | 129 |
| 27 | 66 |
| 28 | 11 |
| 29 | 40 |
| 30 | 68 |
| 31 | 257 |
| 32 | 130 |
| 33 | 19 |
| 34 | 13 |
| 35 | 48 |
| 36 | 14 |
| 37 | 72 |
| 38 | 258 |
| 39 | 21 |
| 40 | 132 |
| 41 | 260 |
| 42 | 35 |
| 43 | 26 |
| 44 | 80 |
| 45 | 37 |
| 46 | 264 |
| 47 | 513 |
| 48 | 25 |
| 49 | 22 |
| 50 | 136 |
| 51 | 272 |
| 52 | 38 |
| 53 | 96 |
| 54 | 67 |
| 55 | 514 |
| 56 | 41 |
| 57 | 144 |
| 58 | 28 |
| 59 | 288 |
| 60 | 69 |
| 61 | 516 |
| 62 | 42 |
| 63 | 49 |
| 64 | 74 |
| 65 | 160 |
| 66 | 192 |
| 67 | 70 |
| 68 | 44 |
| 69 | 131 |
| 70 | 320 |
| 71 | 520 |
| 72 | 81 |
| 73 | 50 |
| 74 | 73 |
| 75 | 15 |
| 76 | 384 |
| 77 | 133 |
| 78 | 52 |
| 79 | 528 |
| 80 | 23 |
| 81 | 134 |
| 82 | 76 |
| 83 | 137 |

TABLE Q27-continued with a sequence length of 1024:

| Reliability or reliability sequence number | Polarized channel sequence number |
|---|---|
| 84 | 82 |
| 85 | 56 |
| 86 | 27 |
| 87 | 259 |
| 88 | 544 |
| 89 | 97 |
| 90 | 261 |
| 91 | 39 |
| 92 | 84 |
| 93 | 138 |
| 94 | 145 |
| 95 | 29 |
| 96 | 43 |
| 97 | 262 |
| 98 | 265 |
| 99 | 98 |
| 100 | 88 |
| 101 | 576 |
| 102 | 140 |
| 103 | 30 |
| 104 | 146 |
| 105 | 71 |
| 106 | 161 |
| 107 | 45 |
| 108 | 515 |
| 109 | 100 |
| 110 | 266 |
| 111 | 273 |
| 112 | 51 |
| 113 | 640 |
| 114 | 148 |
| 115 | 268 |
| 116 | 46 |
| 117 | 75 |
| 118 | 104 |
| 119 | 162 |
| 120 | 517 |
| 121 | 274 |
| 122 | 53 |
| 123 | 193 |
| 124 | 152 |
| 125 | 289 |
| 126 | 768 |
| 127 | 276 |
| 128 | 77 |
| 129 | 164 |
| 130 | 54 |
| 131 | 518 |
| 132 | 83 |
| 133 | 521 |
| 134 | 57 |
| 135 | 112 |
| 136 | 135 |
| 137 | 78 |
| 138 | 194 |
| 139 | 290 |
| 140 | 280 |
| 141 | 522 |
| 142 | 85 |
| 143 | 321 |
| 144 | 58 |
| 145 | 168 |
| 146 | 292 |
| 147 | 139 |
| 148 | 322 |
| 149 | 99 |
| 150 | 529 |
| 151 | 86 |
| 152 | 60 |
| 153 | 524 |
| 154 | 89 |
| 155 | 296 |
| 156 | 196 |
| 157 | 141 |
| 158 | 263 |

TABLE Q27-continued

| with a sequence length of 1024: | |
|---|---|
| Reliability or reliability sequence number | Polarized channel sequence number |
| 159 | 385 |
| 160 | 530 |
| 161 | 324 |
| 162 | 101 |
| 163 | 147 |
| 164 | 176 |
| 165 | 142 |
| 166 | 31 |
| 167 | 304 |
| 168 | 200 |
| 169 | 545 |
| 170 | 532 |
| 171 | 328 |
| 172 | 90 |
| 173 | 386 |
| 174 | 149 |
| 175 | 102 |
| 176 | 105 |
| 177 | 163 |
| 178 | 92 |
| 179 | 546 |
| 180 | 47 |
| 181 | 267 |
| 182 | 208 |
| 183 | 536 |
| 184 | 150 |
| 185 | 388 |
| 186 | 153 |
| 187 | 165 |
| 188 | 336 |
| 189 | 106 |
| 190 | 548 |
| 191 | 269 |
| 192 | 577 |
| 193 | 55 |
| 194 | 113 |
| 195 | 154 |
| 196 | 79 |
| 197 | 519 |
| 198 | 108 |
| 199 | 275 |
| 200 | 392 |
| 201 | 270 |
| 202 | 352 |
| 203 | 224 |
| 204 | 578 |
| 205 | 400 |
| 206 | 552 |
| 207 | 166 |
| 208 | 195 |
| 209 | 59 |
| 210 | 169 |
| 211 | 114 |
| 212 | 156 |
| 213 | 87 |
| 214 | 277 |
| 215 | 278 |
| 216 | 641 |
| 217 | 523 |
| 218 | 580 |
| 219 | 197 |
| 220 | 560 |
| 221 | 116 |
| 222 | 170 |
| 223 | 291 |
| 224 | 416 |
| 225 | 281 |
| 226 | 293 |
| 227 | 61 |
| 228 | 177 |
| 229 | 91 |
| 230 | 198 |
| 231 | 584 |
| 232 | 642 |
| 233 | 172 |

TABLE Q27-continued

| with a sequence length of 1024: | |
|---|---|
| Reliability or reliability sequence number | Polarized channel sequence number |
| 234 | 282 |
| 235 | 525 |
| 236 | 120 |
| 237 | 448 |
| 238 | 294 |
| 239 | 201 |
| 240 | 62 |
| 241 | 531 |
| 242 | 143 |
| 243 | 526 |
| 244 | 769 |
| 245 | 644 |
| 246 | 592 |
| 247 | 103 |
| 248 | 178 |
| 249 | 284 |
| 250 | 323 |
| 251 | 93 |
| 252 | 202 |
| 253 | 297 |
| 254 | 107 |
| 255 | 180 |
| 256 | 298 |
| 257 | 151 |
| 258 | 533 |
| 259 | 209 |
| 260 | 770 |
| 261 | 648 |
| 262 | 608 |
| 263 | 94 |
| 264 | 325 |
| 265 | 204 |
| 266 | 305 |
| 267 | 547 |
| 268 | 534 |
| 269 | 300 |
| 270 | 326 |
| 271 | 155 |
| 272 | 210 |
| 273 | 109 |
| 274 | 537 |
| 275 | 772 |
| 276 | 184 |
| 277 | 387 |
| 278 | 306 |
| 279 | 271 |
| 280 | 329 |
| 281 | 656 |
| 282 | 115 |
| 283 | 167 |
| 284 | 225 |
| 285 | 330 |
| 286 | 549 |
| 287 | 157 |
| 288 | 110 |
| 289 | 538 |
| 290 | 117 |
| 291 | 308 |
| 292 | 389 |
| 293 | 337 |
| 294 | 672 |
| 295 | 776 |
| 296 | 332 |
| 297 | 550 |
| 298 | 312 |
| 299 | 212 |
| 300 | 171 |
| 301 | 579 |
| 302 | 226 |
| 303 | 540 |
| 304 | 279 |
| 305 | 216 |
| 306 | 553 |
| 307 | 158 |
| 308 | 118 |

TABLE Q27-continued with a sequence length of 1024:

| Reliability or reliability sequence number | Polarized channel sequence number |
|---|---|
| 309 | 390 |
| 310 | 338 |
| 311 | 393 |
| 312 | 173 |
| 313 | 121 |
| 314 | 353 |
| 315 | 784 |
| 316 | 704 |
| 317 | 581 |
| 318 | 554 |
| 319 | 340 |
| 320 | 199 |
| 321 | 394 |
| 322 | 283 |
| 323 | 179 |
| 324 | 228 |
| 325 | 174 |
| 326 | 122 |
| 327 | 527 |
| 328 | 561 |
| 329 | 582 |
| 330 | 203 |
| 331 | 556 |
| 332 | 63 |
| 333 | 181 |
| 334 | 295 |
| 335 | 232 |
| 336 | 124 |
| 337 | 285 |
| 338 | 205 |
| 339 | 643 |
| 340 | 182 |
| 341 | 800 |
| 342 | 585 |
| 343 | 562 |
| 344 | 354 |
| 345 | 211 |
| 346 | 401 |
| 347 | 299 |
| 348 | 185 |
| 349 | 240 |
| 350 | 206 |
| 351 | 586 |
| 352 | 95 |
| 353 | 564 |
| 354 | 535 |
| 355 | 344 |
| 356 | 645 |
| 357 | 356 |
| 358 | 402 |
| 359 | 286 |
| 360 | 832 |
| 361 | 417 |
| 362 | 327 |
| 363 | 593 |
| 364 | 588 |
| 365 | 301 |
| 366 | 396 |
| 367 | 307 |
| 368 | 568 |
| 369 | 646 |
| 370 | 213 |
| 371 | 186 |
| 372 | 418 |
| 373 | 360 |
| 374 | 594 |
| 375 | 227 |
| 376 | 309 |
| 377 | 539 |
| 378 | 331 |
| 379 | 111 |
| 380 | 771 |
| 381 | 896 |
| 382 | 649 |
| 383 | 214 |

TABLE Q27-continued with a sequence length of 1024:

| Reliability or reliability sequence number | Polarized channel sequence number |
|---|---|
| 384 | 449 |
| 385 | 302 |
| 386 | 188 |
| 387 | 217 |
| 388 | 229 |
| 389 | 404 |
| 390 | 551 |
| 391 | 609 |
| 392 | 596 |
| 393 | 333 |
| 394 | 408 |
| 395 | 650 |
| 396 | 541 |
| 397 | 310 |
| 398 | 368 |
| 399 | 159 |
| 400 | 773 |
| 401 | 119 |
| 402 | 339 |
| 403 | 218 |
| 404 | 313 |
| 405 | 230 |
| 406 | 420 |
| 407 | 657 |
| 408 | 610 |
| 409 | 542 |
| 410 | 652 |
| 411 | 600 |
| 412 | 233 |
| 413 | 334 |
| 414 | 391 |
| 415 | 450 |
| 416 | 341 |
| 417 | 555 |
| 418 | 175 |
| 419 | 123 |
| 420 | 774 |
| 421 | 658 |
| 422 | 220 |
| 423 | 612 |
| 424 | 183 |
| 425 | 314 |
| 426 | 777 |
| 427 | 395 |
| 428 | 424 |
| 429 | 355 |
| 430 | 234 |
| 431 | 125 |
| 432 | 583 |
| 433 | 241 |
| 434 | 557 |
| 435 | 345 |
| 436 | 342 |
| 437 | 452 |
| 438 | 673 |
| 439 | 660 |
| 440 | 616 |
| 441 | 563 |
| 442 | 778 |
| 443 | 397 |
| 444 | 287 |
| 445 | 207 |
| 446 | 558 |
| 447 | 432 |
| 448 | 316 |
| 449 | 357 |
| 450 | 674 |
| 451 | 403 |
| 452 | 187 |
| 453 | 236 |
| 454 | 664 |
| 455 | 785 |
| 456 | 587 |
| 457 | 624 |
| 458 | 346 |

TABLE Q27-continued with a sequence length of 1024:

| Reliability or reliability sequence number | Polarized channel sequence number |
|---|---|
| 459 | 780 |
| 460 | 398 |
| 461 | 565 |
| 462 | 361 |
| 463 | 126 |
| 464 | 242 |
| 465 | 456 |
| 466 | 405 |
| 467 | 676 |
| 468 | 705 |
| 469 | 244 |
| 470 | 786 |
| 471 | 189 |
| 472 | 215 |
| 473 | 566 |
| 474 | 358 |
| 475 | 589 |
| 476 | 647 |
| 477 | 303 |
| 478 | 362 |
| 479 | 464 |
| 480 | 569 |
| 481 | 419 |
| 482 | 706 |
| 483 | 680 |
| 484 | 595 |
| 485 | 406 |
| 486 | 348 |
| 487 | 590 |
| 488 | 801 |
| 489 | 788 |
| 490 | 219 |
| 491 | 231 |
| 492 | 409 |
| 493 | 570 |
| 494 | 311 |
| 495 | 421 |
| 496 | 543 |
| 497 | 708 |
| 498 | 369 |
| 499 | 802 |
| 500 | 651 |
| 501 | 688 |
| 502 | 597 |
| 503 | 248 |
| 504 | 792 |
| 505 | 190 |
| 506 | 480 |
| 507 | 572 |
| 508 | 335 |
| 509 | 410 |
| 510 | 425 |
| 511 | 370 |
| 512 | 315 |
| 513 | 611 |
| 514 | 598 |
| 515 | 804 |
| 516 | 833 |
| 517 | 712 |
| 518 | 221 |
| 519 | 422 |
| 520 | 653 |
| 521 | 364 |
| 522 | 601 |
| 523 | 235 |
| 524 | 317 |
| 525 | 775 |
| 526 | 451 |
| 527 | 343 |
| 528 | 659 |
| 529 | 412 |
| 530 | 222 |
| 531 | 433 |
| 532 | 453 |
| 533 | 613 |

TABLE Q27-continued with a sequence length of 1024:

| Reliability or reliability sequence number | Polarized channel sequence number |
|---|---|
| 534 | 559 |
| 535 | 654 |
| 536 | 834 |
| 537 | 808 |
| 538 | 602 |
| 539 | 720 |
| 540 | 372 |
| 541 | 237 |
| 542 | 426 |
| 543 | 614 |
| 544 | 243 |
| 545 | 454 |
| 546 | 604 |
| 547 | 897 |
| 548 | 661 |
| 549 | 836 |
| 550 | 816 |
| 551 | 347 |
| 552 | 779 |
| 553 | 617 |
| 554 | 376 |
| 555 | 428 |
| 556 | 457 |
| 557 | 736 |
| 558 | 318 |
| 559 | 359 |
| 560 | 238 |
| 561 | 675 |
| 562 | 567 |
| 563 | 662 |
| 564 | 245 |
| 565 | 127 |
| 566 | 840 |
| 567 | 465 |
| 568 | 618 |
| 569 | 898 |
| 570 | 434 |
| 571 | 399 |
| 572 | 665 |
| 573 | 781 |
| 574 | 458 |
| 575 | 591 |
| 576 | 625 |
| 577 | 363 |
| 578 | 620 |
| 579 | 349 |
| 580 | 677 |
| 581 | 407 |
| 582 | 436 |
| 583 | 787 |
| 584 | 666 |
| 585 | 191 |
| 586 | 782 |
| 587 | 571 |
| 588 | 900 |
| 589 | 848 |
| 590 | 350 |
| 591 | 246 |
| 592 | 626 |
| 593 | 460 |
| 594 | 411 |
| 595 | 678 |
| 596 | 365 |
| 597 | 707 |
| 598 | 668 |
| 599 | 789 |
| 600 | 440 |
| 601 | 681 |
| 602 | 573 |
| 603 | 371 |
| 604 | 628 |
| 605 | 599 |
| 606 | 481 |
| 607 | 249 |
| 608 | 904 |

TABLE Q27-continued

| with a sequence length of 1024: | |
|---|---|
| Reliability or reliability sequence number | Polarized channel sequence number |
| 609 | 864 |
| 610 | 423 |
| 611 | 803 |
| 612 | 574 |
| 613 | 466 |
| 614 | 790 |
| 615 | 413 |
| 616 | 366 |
| 617 | 468 |
| 618 | 250 |
| 619 | 709 |
| 620 | 682 |
| 621 | 482 |
| 622 | 632 |
| 623 | 427 |
| 624 | 793 |
| 625 | 655 |
| 626 | 912 |
| 627 | 603 |
| 628 | 689 |
| 629 | 373 |
| 630 | 710 |
| 631 | 684 |
| 632 | 252 |
| 633 | 414 |
| 634 | 374 |
| 635 | 805 |
| 636 | 472 |
| 637 | 794 |
| 638 | 377 |
| 639 | 615 |
| 640 | 713 |
| 641 | 690 |
| 642 | 455 |
| 643 | 605 |
| 644 | 429 |
| 645 | 223 |
| 646 | 928 |
| 647 | 806 |
| 648 | 484 |
| 649 | 714 |
| 650 | 835 |
| 651 | 796 |
| 652 | 435 |
| 653 | 663 |
| 654 | 606 |
| 655 | 430 |
| 656 | 692 |
| 657 | 809 |
| 658 | 619 |
| 659 | 319 |
| 660 | 721 |
| 661 | 378 |
| 662 | 459 |
| 663 | 716 |
| 664 | 239 |
| 665 | 437 |
| 666 | 696 |
| 667 | 960 |
| 668 | 837 |
| 669 | 810 |
| 670 | 488 |
| 671 | 722 |
| 672 | 667 |
| 673 | 461 |
| 674 | 380 |
| 675 | 621 |
| 676 | 251 |
| 677 | 783 |
| 678 | 467 |
| 679 | 817 |
| 680 | 838 |
| 681 | 627 |
| 682 | 812 |
| 683 | 679 |

TABLE Q27-continued

| with a sequence length of 1024: | |
|---|---|
| Reliability or reliability sequence number | Polarized channel sequence number |
| 684 | 622 |
| 685 | 737 |
| 686 | 724 |
| 687 | 899 |
| 688 | 438 |
| 689 | 669 |
| 690 | 441 |
| 691 | 841 |
| 692 | 818 |
| 693 | 462 |
| 694 | 351 |
| 695 | 469 |
| 696 | 575 |
| 697 | 367 |
| 698 | 738 |
| 699 | 629 |
| 700 | 670 |
| 701 | 442 |
| 702 | 728 |
| 703 | 842 |
| 704 | 683 |
| 705 | 791 |
| 706 | 820 |
| 707 | 247 |
| 708 | 901 |
| 709 | 630 |
| 710 | 470 |
| 711 | 740 |
| 712 | 849 |
| 713 | 415 |
| 714 | 496 |
| 715 | 844 |
| 716 | 633 |
| 717 | 483 |
| 718 | 711 |
| 719 | 824 |
| 720 | 902 |
| 721 | 685 |
| 722 | 444 |
| 723 | 473 |
| 724 | 850 |
| 725 | 375 |
| 726 | 795 |
| 727 | 744 |
| 728 | 634 |
| 729 | 253 |
| 730 | 691 |
| 731 | 905 |
| 732 | 686 |
| 733 | 607 |
| 734 | 254 |
| 735 | 807 |
| 736 | 865 |
| 737 | 852 |
| 738 | 636 |
| 739 | 715 |
| 740 | 485 |
| 741 | 906 |
| 742 | 431 |
| 743 | 797 |
| 744 | 752 |
| 745 | 693 |
| 746 | 474 |
| 747 | 379 |
| 748 | 913 |
| 749 | 866 |
| 750 | 798 |
| 751 | 486 |
| 752 | 694 |
| 753 | 908 |
| 754 | 856 |
| 755 | 717 |
| 756 | 489 |
| 757 | 811 |
| 758 | 476 |

TABLE Q27-continued

| with a sequence length of 1024: | |
|---|---|
| Reliability or reliability sequence number | Polarized channel sequence number |
| 759 | 381 |
| 760 | 697 |
| 761 | 623 |
| 762 | 723 |
| 763 | 914 |
| 764 | 868 |
| 765 | 718 |
| 766 | 439 |
| 767 | 490 |
| 768 | 698 |
| 769 | 839 |
| 770 | 463 |
| 771 | 813 |
| 772 | 671 |
| 773 | 929 |
| 774 | 916 |
| 775 | 382 |
| 776 | 725 |
| 777 | 872 |
| 778 | 819 |
| 779 | 497 |
| 780 | 700 |
| 781 | 814 |
| 782 | 443 |
| 783 | 631 |
| 784 | 492 |
| 785 | 739 |
| 786 | 930 |
| 787 | 726 |
| 788 | 920 |
| 789 | 843 |
| 790 | 498 |
| 791 | 880 |
| 792 | 821 |
| 793 | 729 |
| 794 | 961 |
| 795 | 741 |
| 796 | 471 |
| 797 | 822 |
| 798 | 730 |
| 799 | 845 |
| 800 | 825 |
| 801 | 851 |
| 802 | 846 |
| 803 | 745 |
| 804 | 445 |
| 805 | 742 |
| 806 | 932 |
| 807 | 635 |
| 808 | 255 |
| 809 | 962 |
| 810 | 826 |
| 811 | 903 |
| 812 | 687 |
| 813 | 500 |
| 814 | 732 |
| 815 | 853 |
| 816 | 637 |
| 817 | 446 |
| 818 | 746 |
| 819 | 867 |
| 820 | 907 |
| 821 | 695 |
| 822 | 475 |
| 823 | 719 |
| 824 | 753 |
| 825 | 936 |
| 826 | 854 |
| 827 | 487 |
| 828 | 909 |
| 829 | 944 |
| 830 | 748 |
| 831 | 828 |
| 832 | 504 |
| 833 | 869 |

TABLE Q27-continued

| with a sequence length of 1024: | |
|---|---|
| Reliability or reliability sequence number | Polarized channel sequence number |
| 834 | 799 |
| 835 | 699 |
| 836 | 477 |
| 837 | 857 |
| 838 | 910 |
| 839 | 915 |
| 840 | 964 |
| 841 | 873 |
| 842 | 491 |
| 843 | 638 |
| 844 | 754 |
| 845 | 968 |
| 846 | 727 |
| 847 | 478 |
| 848 | 917 |
| 849 | 858 |
| 850 | 701 |
| 851 | 756 |
| 852 | 383 |
| 853 | 921 |
| 854 | 870 |
| 855 | 815 |
| 856 | 874 |
| 857 | 976 |
| 858 | 493 |
| 859 | 931 |
| 860 | 918 |
| 861 | 702 |
| 862 | 860 |
| 863 | 731 |
| 864 | 499 |
| 865 | 823 |
| 866 | 881 |
| 867 | 933 |
| 868 | 743 |
| 869 | 494 |
| 870 | 847 |
| 871 | 501 |
| 872 | 922 |
| 873 | 827 |
| 874 | 760 |
| 875 | 447 |
| 876 | 733 |
| 877 | 876 |
| 878 | 934 |
| 879 | 963 |
| 880 | 882 |
| 881 | 937 |
| 882 | 924 |
| 883 | 992 |
| 884 | 855 |
| 885 | 747 |
| 886 | 502 |
| 887 | 829 |
| 888 | 734 |
| 889 | 965 |
| 890 | 938 |
| 891 | 505 |
| 892 | 884 |
| 893 | 639 |
| 894 | 911 |
| 895 | 830 |
| 896 | 749 |
| 897 | 506 |
| 898 | 859 |
| 899 | 479 |
| 900 | 945 |
| 901 | 755 |
| 902 | 966 |
| 903 | 871 |
| 904 | 940 |
| 905 | 750 |
| 906 | 969 |
| 907 | 888 |
| 908 | 508 |

TABLE Q27-continued with a sequence length of 1024:

| Reliability or reliability sequence number | Polarized channel sequence number |
|---|---|
| 909 | 861 |
| 910 | 946 |
| 911 | 919 |
| 912 | 757 |
| 913 | 703 |
| 914 | 970 |
| 915 | 875 |
| 916 | 495 |
| 917 | 862 |
| 918 | 948 |
| 919 | 758 |
| 920 | 977 |
| 921 | 923 |
| 922 | 761 |
| 923 | 972 |
| 924 | 877 |
| 925 | 935 |
| 926 | 978 |
| 927 | 883 |
| 928 | 503 |
| 929 | 952 |
| 930 | 762 |
| 931 | 925 |
| 932 | 735 |
| 933 | 878 |
| 934 | 993 |
| 935 | 980 |
| 936 | 939 |
| 937 | 885 |
| 938 | 926 |
| 939 | 831 |
| 940 | 764 |
| 941 | 507 |
| 942 | 994 |
| 943 | 967 |
| 944 | 886 |
| 945 | 941 |
| 946 | 751 |
| 947 | 984 |
| 948 | 889 |
| 949 | 509 |
| 950 | 947 |
| 951 | 996 |
| 952 | 942 |
| 953 | 971 |
| 954 | 890 |
| 955 | 510 |
| 956 | 863 |
| 957 | 949 |
| 958 | 759 |
| 959 | 1000 |
| 960 | 973 |
| 961 | 892 |
| 962 | 950 |
| 963 | 979 |
| 964 | 953 |
| 965 | 763 |
| 966 | 974 |
| 967 | 879 |
| 968 | 1008 |
| 969 | 981 |
| 970 | 954 |
| 971 | 927 |
| 972 | 765 |
| 973 | 995 |
| 974 | 982 |
| 975 | 887 |
| 976 | 956 |
| 977 | 766 |
| 978 | 985 |
| 979 | 997 |
| 980 | 943 |
| 981 | 986 |
| 982 | 891 |
| 983 | 511 |

TABLE Q27-continued with a sequence length of 1024:

| Reliability or reliability sequence number | Polarized channel sequence number |
|---|---|
| 984 | 998 |
| 985 | 1001 |
| 986 | 988 |
| 987 | 893 |
| 988 | 951 |
| 989 | 1002 |
| 990 | 975 |
| 991 | 894 |
| 992 | 1009 |
| 993 | 955 |
| 994 | 1004 |
| 995 | 1010 |
| 996 | 983 |
| 997 | 957 |
| 998 | 767 |
| 999 | 1012 |
| 1000 | 958 |
| 1001 | 987 |
| 1002 | 999 |
| 1003 | 1016 |
| 1004 | 989 |
| 1005 | 1003 |
| 1006 | 990 |
| 1007 | 895 |
| 1008 | 1005 |
| 1009 | 1011 |
| 1010 | 1006 |
| 1011 | 1013 |
| 1012 | 959 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence 27, with a sequence length of 1024:

0, 1, 2, 7, 3, 8, 11, 25, 4, 10, 14, 28, 18, 34, 36, 75, 5, 12, 15, 33, 21, 39, 49, 80, 23, 48, 43, 86, 58, 95, 103, 166, 6, 19, 22, 42, 24, 45, 52, 91, 29, 56, 62, 96, 68, 107, 116, 180, 35, 63, 73, 112, 7 8, 122, 130, 193, 85, 134, 144, 209, 152, 227, 240, 332, 9, 20, 27, 54, 30, 60, 67, 105, 37, 74, 64, 11 7, 82, 128, 137, 196, 44, 72, 84, 132, 92, 142, 151, 213, 100, 154, 172, 229, 178, 251, 263, 352, 53, 89, 99, 149, 109, 162, 175, 247, 118, 176, 189, 254, 198, 273, 288, 379, 135, 194, 211, 282, 221, 2 90, 308, 401, 236, 313, 326, 419, 336, 431, 463, 565, 16, 26, 32, 69, 40, 77, 81, 136, 50, 83, 93, 147, 102, 157, 165, 242, 57, 94, 104, 163, 114, 174, 184, 257, 124, 186, 195, 271, 212, 287, 307, 399, 65, 106, 119, 177, 129, 187, 207, 283, 145, 210, 222, 300, 233, 312, 325, 418, 164, 228, 248, 323, 255, 333, 340, 424, 276, 348, 371, 452, 386, 471, 505, 585, 66, 123, 138, 208, 156, 219, 230, 320, 168, 239, 252, 330, 265, 338, 350, 445, 182, 259, 272, 345, 299, 370, 383, 472, 305, 387, 403, 49 0, 422, 518, 530, 645, 203, 284, 302, 375, 324, 388, 405, 491, 335, 412, 430, 523, 453, 541, 560, 6 64, 349, 433, 464, 544, 469, 564, 591, 707, 503, 607, 618, 676, 632, 729, 734, 808, 13, 31, 38, 87, 41, 90, 97, 158, 46, 98, 110, 181, 115, 191, 201, 279, 51, 111, 121, 199, 127, 214, 215, 304, 140, 22 5, 234, 322, 249, 337, 359, 444, 59, 125, 139, 223, 146, 226, 238, 334, 155, 253, 256, 347, 269, 36 5, 385, 477, 167, 266, 278, 367, 291, 376, 397, 494, 298, 404, 425, 512, 448, 524, 558, 659, 70, 14 3, 148, 250, 161, 264, 270, 362, 171, 280, 285, 378, 296, 393, 413, 508, 188, 293, 310, 402, 319, 4 16, 436, 527, 355, 435, 458, 551, 486, 579, 590, 694, 202, 314, 344, 429, 357, 449, 474, 559, 373, 462, 478, 577, 521, 596, 616, 697, 398, 498, 511, 603, 540, 629, 634, 725, 554, 638, 661, 747, 67 4, 759, 775, 852, 76, 159, 173, 277, 185, 292, 309, 414, 200, 311, 321, 427, 366, 443, 460, 571, 20 5, 346, 358, 451, 389, 466, 485, 581, 394, 492, 509, 594, 529, 615, 633, 713, 224, 361, 372, 481, 4 06, 495, 519, 610, 428, 510, 542, 623, 555, 644, 655, 742, 447, 531, 570, 652, 582, 665, 688, 766, 600, 690, 701, 782, 722, 804, 817, 875, 237, 384, 415, 526, 437, 532, 545, 642, 465, 556, 574, 66 2, 593, 673, 693, 770, 479, 567, 613, 678, 617, 695, 710, 796, 636, 723, 746, 822, 758, 836, 847, 8 99, 506, 606, 621, 717, 648, 740, 751, 827, 670, 756, 767, 842, 784, 858, 869, 916, 714, 779, 790, 864, 813, 871, 886, 928, 832, 891, 897, 941, 908, 949, 955, 983, 17, 47, 55, 108, 61, 120, 131, 197, 71, 133, 141, 217, 153, 235, 243, 327, 79, 150, 160, 241, 170, 258, 268, 354, 183, 274, 289, 377, 303, 396, 409, 496, 88, 169, 179, 267, 190, 286, 297, 390, 206, 306, 318, 417, 331, 434, 446, 534, 220, 328, 343, 441, 353, 461, 473, 562, 368, 480, 493, 587, 507, 602, 612, 696, 101, 192, 204, 30 1, 218, 317, 329, 432, 231, 342, 351, 456, 364, 475, 487, 575, 246, 363, 374, 484, 392, 502, 514, 6 05, 411, 522, 538, 627, 546, 643, 654, 733, 262, 391, 408, 513, 423, 533, 543, 639, 440, 553, 568, 658, 578, 675, 684, 761, 457, 576, 592, 681, 604, 699, 709, 783, 622, 716, 728, 807, 738, 816, 84 3, 893, 113, 216, 232, 339, 245, 356, 369, 476, 261, 382, 395, 500, 410, 520, 535, 625, 281, 407, 4 21, 528, 439, 548, 563, 653, 454, 572, 584, 672, 598, 689, 700, 772, 294, 438, 450, 561, 467, 580, 595, 683, 483, 601, 620, 704, 631, 721, 732, 812, 501, 628, 641, 730, 656, 745, 752, 821, 666, 76 0, 768, 835, 780, 850, 861, 913, 316, 468, 482, 597, 497, 619, 630, 718, 517, 640, 649, 739, 663, 7 55, 765, 823, 539, 660, 671, 762, 686, 776, 787, 846, 702, 793, 798, 863, 814, 876, 888, 932, 557, 685, 698, 785, 711, 795, 805, 868, 727, 803, 818, 885, 830, 896, 905, 946, 744, 824, 844, 901, 85 1, 912, 919, 958, 874, 922, 930, 965, 940, 972, 977, 998, 126, 244, 260, 380, 275, 400, 420, 525, 2 95, 426, 442, 552, 459, 573, 586, 677, 315, 455, 470, 583, 489, 599, 614, 705, 504, 624, 637, 726, 651, 743, 750, 834, 341, 488, 499, 611, 515, 635, 647, 735, 537, 657, 669, 757, 682, 771, 781, 85 5, 550, 679, 692, 778, 706, 792, 797, 865, 719, 800, 810, 873, 831, 887, 895, 939, 360, 516, 536, 6 50, 549, 668, 680, 769, 566, 691, 703, 789, 715, 799, 802, 870, 589, 712, 724, 801, 737, 815, 826, 884, 754, 837, 849, 898, 862, 909, 917, 956, 609, 736, 749, 819, 764, 833, 854, 903, 777, 841, 85 6, 915, 877, 924, 933, 967, 791, 866, 880, 927, 892, 937, 944, 975, 907, 948, 954, 982, 961, 987, 9 91, 1007, 381, 547, 569, 687, 588, 708, 720, 811, 608, 731, 741, 820, 753, 828, 838, 894, 626, 74 8, 763, 839, 774, 848, 860, 911, 788, 853, 872, 921, 882, 931, 938, 971, 646, 773, 786, 859, 806, 8 67, 878, 925, 825, 881, 890, 936, 904, 945, 952, 980, 829, 900, 910, 950, 918, 957, 962, 988, 929, 964, 970, 993, 976, 997, 1000, 1012, 667, 794, 809, 879, 840, 889, 902, 943, 845, 906, 914, 953, 923, 960, 966, 990, 857, 920, 926, 963, 935, 969, 974, 996, 947, 978, 981, 1001, 986, 1004, 1006, 1016, 883, 934, 942, 973, 951, 979, 984, 1002, 959, 985, 989, 1005, 994, 1008, 1010, 1018, 968, 992, 995, 1009, 999, 1011, 1013, 1019, 1003, 1014, 1015, 1020, 1017, 1021, 1022, 1023

TABLE Z27 with a sequence length of 1024:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 8 |
| 6 | 11 |
| 7 | 25 |
| 8 | 4 |
| 9 | 10 |
| 10 | 14 |
| 11 | 28 |
| 12 | 18 |
| 13 | 34 |
| 14 | 36 |
| 15 | 75 |
| 16 | 5 |
| 17 | 12 |
| 18 | 15 |
| 19 | 33 |
| 20 | 21 |
| 21 | 39 |
| 22 | 49 |
| 23 | 80 |
| 24 | 23 |
| 25 | 48 |
| 26 | 43 |
| 27 | 86 |
| 28 | 58 |
| 29 | 95 |
| 30 | 103 |
| 31 | 166 |
| 32 | 6 |
| 33 | 19 |
| 34 | 22 |
| 35 | 42 |
| 36 | 24 |
| 37 | 45 |
| 38 | 52 |
| 39 | 91 |
| 40 | 29 |
| 41 | 56 |
| 42 | 62 |
| 43 | 96 |
| 44 | 68 |
| 45 | 107 |
| 46 | 116 |
| 47 | 180 |
| 48 | 35 |
| 49 | 63 |
| 50 | 73 |
| 51 | 112 |
| 52 | 78 |
| 53 | 122 |
| 54 | 130 |
| 55 | 193 |
| 56 | 85 |
| 57 | 134 |
| 58 | 144 |
| 59 | 209 |
| 60 | 152 |
| 61 | 227 |
| 62 | 240 |
| 63 | 332 |
| 64 | 9 |
| 65 | 20 |
| 66 | 27 |
| 67 | 54 |
| 68 | 30 |
| 69 | 60 |
| 70 | 67 |
| 71 | 105 |
| 72 | 37 |
| 73 | 74 |
| 74 | 64 |

TABLE Z27-continued with a sequence length of 1024:

| Polarized channel sequence number | Reliability or reliability sequence number |
| --- | --- |
| 75 | 117 |
| 76 | 82 |
| 77 | 128 |
| 78 | 137 |
| 79 | 196 |
| 80 | 44 |
| 81 | 72 |
| 82 | 84 |
| 83 | 132 |
| 84 | 92 |
| 85 | 142 |
| 86 | 151 |
| 87 | 213 |
| 88 | 100 |
| 89 | 154 |
| 90 | 172 |
| 91 | 229 |
| 92 | 178 |
| 93 | 251 |
| 94 | 263 |
| 95 | 352 |
| 96 | 53 |
| 97 | 89 |
| 98 | 99 |
| 99 | 149 |
| 100 | 109 |
| 101 | 162 |
| 102 | 175 |
| 103 | 247 |
| 104 | 118 |
| 105 | 176 |
| 106 | 189 |
| 107 | 254 |
| 108 | 198 |
| 109 | 273 |
| 110 | 288 |
| 111 | 379 |
| 112 | 135 |
| 113 | 194 |
| 114 | 211 |
| 115 | 282 |
| 116 | 221 |
| 117 | 290 |
| 118 | 308 |
| 119 | 401 |
| 120 | 236 |
| 121 | 313 |
| 122 | 326 |
| 123 | 419 |
| 124 | 336 |
| 125 | 431 |
| 126 | 463 |
| 127 | 565 |
| 128 | 16 |
| 129 | 26 |
| 130 | 32 |
| 131 | 69 |
| 132 | 40 |
| 133 | 77 |
| 134 | 81 |
| 135 | 136 |
| 136 | 50 |
| 137 | 83 |
| 138 | 93 |
| 139 | 147 |
| 140 | 102 |
| 141 | 157 |
| 142 | 165 |
| 143 | 242 |
| 144 | 57 |
| 145 | 94 |
| 146 | 104 |
| 147 | 163 |
| 148 | 114 |
| 149 | 174 |

TABLE Z27-continued with a sequence length of 1024:

| Polarized channel sequence number | Reliability or reliability sequence number |
| --- | --- |
| 150 | 184 |
| 151 | 257 |
| 152 | 124 |
| 153 | 186 |
| 154 | 195 |
| 155 | 271 |
| 156 | 212 |
| 157 | 287 |
| 158 | 307 |
| 159 | 399 |
| 160 | 65 |
| 161 | 106 |
| 162 | 119 |
| 163 | 177 |
| 164 | 129 |
| 165 | 187 |
| 166 | 207 |
| 167 | 283 |
| 168 | 145 |
| 169 | 210 |
| 170 | 222 |
| 171 | 300 |
| 172 | 233 |
| 173 | 312 |
| 174 | 325 |
| 175 | 418 |
| 176 | 164 |
| 177 | 228 |
| 178 | 248 |
| 179 | 323 |
| 180 | 255 |
| 181 | 333 |
| 182 | 340 |
| 183 | 424 |
| 184 | 276 |
| 185 | 348 |
| 186 | 371 |
| 187 | 452 |
| 188 | 386 |
| 189 | 471 |
| 190 | 505 |
| 191 | 585 |
| 192 | 66 |
| 193 | 123 |
| 194 | 138 |
| 195 | 208 |
| 196 | 156 |
| 197 | 219 |
| 198 | 230 |
| 199 | 320 |
| 200 | 168 |
| 201 | 239 |
| 202 | 252 |
| 203 | 330 |
| 204 | 265 |
| 205 | 338 |
| 206 | 350 |
| 207 | 445 |
| 208 | 182 |
| 209 | 259 |
| 210 | 272 |
| 211 | 345 |
| 212 | 299 |
| 213 | 370 |
| 214 | 383 |
| 215 | 472 |
| 216 | 305 |
| 217 | 387 |
| 218 | 403 |
| 219 | 490 |
| 220 | 422 |
| 221 | 518 |
| 222 | 530 |
| 223 | 645 |
| 224 | 203 |

TABLE Z27-continued with a sequence length of 1024:

| Polarized channel sequence number | Reliability or reliability sequence number |
|---|---|
| 225 | 284 |
| 226 | 302 |
| 227 | 375 |
| 228 | 324 |
| 229 | 388 |
| 230 | 405 |
| 231 | 491 |
| 232 | 335 |
| 233 | 412 |
| 234 | 430 |
| 235 | 523 |
| 236 | 453 |
| 237 | 541 |
| 238 | 560 |
| 239 | 664 |
| 240 | 349 |
| 241 | 433 |
| 242 | 464 |
| 243 | 544 |
| 244 | 469 |
| 245 | 564 |
| 246 | 591 |
| 247 | 707 |
| 248 | 503 |
| 249 | 607 |
| 250 | 618 |
| 251 | 676 |
| 252 | 632 |
| 253 | 729 |
| 254 | 734 |
| 255 | 808 |
| 256 | 13 |
| 257 | 31 |
| 258 | 38 |
| 259 | 87 |
| 260 | 41 |
| 261 | 90 |
| 262 | 97 |
| 263 | 158 |
| 264 | 46 |
| 265 | 98 |
| 266 | 110 |
| 267 | 181 |
| 268 | 115 |
| 269 | 191 |
| 270 | 201 |
| 271 | 279 |
| 272 | 51 |
| 273 | 111 |
| 274 | 121 |
| 275 | 199 |
| 276 | 127 |
| 277 | 214 |
| 278 | 215 |
| 279 | 304 |
| 280 | 140 |
| 281 | 225 |
| 282 | 234 |
| 283 | 322 |
| 284 | 249 |
| 285 | 337 |
| 286 | 359 |
| 287 | 444 |
| 288 | 59 |
| 289 | 125 |
| 290 | 139 |
| 291 | 223 |
| 292 | 146 |
| 293 | 226 |
| 294 | 238 |
| 295 | 334 |
| 296 | 155 |
| 297 | 253 |
| 298 | 256 |
| 299 | 347 |

TABLE Z27-continued with a sequence length of 1024:

| Polarized channel sequence number | Reliability or reliability sequence number |
|---|---|
| 300 | 269 |
| 301 | 365 |
| 302 | 385 |
| 303 | 477 |
| 304 | 167 |
| 305 | 266 |
| 306 | 278 |
| 307 | 367 |
| 308 | 291 |
| 309 | 376 |
| 310 | 397 |
| 311 | 494 |
| 312 | 298 |
| 313 | 404 |
| 314 | 425 |
| 315 | 512 |
| 316 | 448 |
| 317 | 524 |
| 318 | 558 |
| 319 | 659 |
| 320 | 70 |
| 321 | 143 |
| 322 | 148 |
| 323 | 250 |
| 324 | 161 |
| 325 | 264 |
| 326 | 270 |
| 327 | 362 |
| 328 | 171 |
| 329 | 280 |
| 330 | 285 |
| 331 | 378 |
| 332 | 296 |
| 333 | 393 |
| 334 | 413 |
| 335 | 508 |
| 336 | 188 |
| 337 | 293 |
| 338 | 310 |
| 339 | 402 |
| 340 | 319 |
| 341 | 416 |
| 342 | 436 |
| 343 | 527 |
| 344 | 355 |
| 345 | 435 |
| 346 | 458 |
| 347 | 551 |
| 348 | 486 |
| 349 | 579 |
| 350 | 590 |
| 351 | 694 |
| 352 | 202 |
| 353 | 314 |
| 354 | 344 |
| 355 | 429 |
| 356 | 357 |
| 357 | 449 |
| 358 | 474 |
| 359 | 559 |
| 360 | 373 |
| 361 | 462 |
| 362 | 478 |
| 363 | 577 |
| 364 | 521 |
| 365 | 596 |
| 366 | 616 |
| 367 | 697 |
| 368 | 398 |
| 369 | 498 |
| 370 | 511 |
| 371 | 603 |
| 372 | 540 |
| 373 | 629 |
| 374 | 634 |

TABLE Z27-continued

| with a sequence length of 1024: | |
|---|---|
| Polarized channel sequence number | Reliability or reliability sequence number |
| 375 | 725 |
| 376 | 554 |
| 377 | 638 |
| 378 | 661 |
| 379 | 747 |
| 380 | 674 |
| 381 | 759 |
| 382 | 775 |
| 383 | 852 |
| 384 | 76 |
| 385 | 159 |
| 386 | 173 |
| 387 | 277 |
| 388 | 185 |
| 389 | 292 |
| 390 | 309 |
| 391 | 414 |
| 392 | 200 |
| 393 | 311 |
| 394 | 321 |
| 395 | 427 |
| 396 | 366 |
| 397 | 443 |
| 398 | 460 |
| 399 | 571 |
| 400 | 205 |
| 401 | 346 |
| 402 | 358 |
| 403 | 451 |
| 404 | 389 |
| 405 | 466 |
| 406 | 485 |
| 407 | 581 |
| 408 | 394 |
| 409 | 492 |
| 410 | 509 |
| 411 | 594 |
| 412 | 529 |
| 413 | 615 |
| 414 | 633 |
| 415 | 713 |
| 416 | 224 |
| 417 | 361 |
| 418 | 372 |
| 419 | 481 |
| 420 | 406 |
| 421 | 495 |
| 422 | 519 |
| 423 | 610 |
| 424 | 428 |
| 425 | 510 |
| 426 | 542 |
| 427 | 623 |
| 428 | 555 |
| 429 | 644 |
| 430 | 655 |
| 431 | 742 |
| 432 | 447 |
| 433 | 531 |
| 434 | 570 |
| 435 | 652 |
| 436 | 582 |
| 437 | 665 |
| 438 | 688 |
| 439 | 766 |
| 440 | 600 |
| 441 | 690 |
| 442 | 701 |
| 443 | 782 |
| 444 | 722 |
| 445 | 804 |
| 446 | 817 |
| 447 | 875 |
| 448 | 237 |
| 449 | 384 |

TABLE Z27-continued

| with a sequence length of 1024: | |
|---|---|
| Polarized channel sequence number | Reliability or reliability sequence number |
| 450 | 415 |
| 451 | 526 |
| 452 | 437 |
| 453 | 532 |
| 454 | 545 |
| 455 | 642 |
| 456 | 465 |
| 457 | 556 |
| 458 | 574 |
| 459 | 662 |
| 460 | 593 |
| 461 | 673 |
| 462 | 693 |
| 463 | 770 |
| 464 | 479 |
| 465 | 567 |
| 466 | 613 |
| 467 | 678 |
| 468 | 617 |
| 469 | 695 |
| 470 | 710 |
| 471 | 796 |
| 472 | 636 |
| 473 | 723 |
| 474 | 746 |
| 475 | 822 |
| 476 | 758 |
| 477 | 836 |
| 478 | 847 |
| 479 | 899 |
| 480 | 506 |
| 481 | 606 |
| 482 | 621 |
| 483 | 717 |
| 484 | 648 |
| 485 | 740 |
| 486 | 751 |
| 487 | 827 |
| 488 | 670 |
| 489 | 756 |
| 490 | 767 |
| 491 | 842 |
| 492 | 784 |
| 493 | 858 |
| 494 | 869 |
| 495 | 916 |
| 496 | 714 |
| 497 | 779 |
| 498 | 790 |
| 499 | 864 |
| 500 | 813 |
| 501 | 871 |
| 502 | 886 |
| 503 | 928 |
| 504 | 832 |
| 505 | 891 |
| 506 | 897 |
| 507 | 941 |
| 508 | 908 |
| 509 | 949 |
| 510 | 955 |
| 511 | 983 |
| 512 | 17 |
| 513 | 47 |
| 514 | 55 |
| 515 | 108 |
| 516 | 61 |
| 517 | 120 |
| 518 | 131 |
| 519 | 197 |
| 520 | 71 |
| 521 | 133 |
| 522 | 141 |
| 523 | 217 |
| 524 | 153 |

TABLE Z27-continued with a sequence length of 1024:

| Polarized channel sequence number | Reliability or reliability sequence number |
|---|---|
| 525 | 235 |
| 526 | 243 |
| 527 | 327 |
| 528 | 79 |
| 529 | 150 |
| 530 | 160 |
| 531 | 241 |
| 532 | 170 |
| 533 | 258 |
| 534 | 268 |
| 535 | 354 |
| 536 | 183 |
| 537 | 274 |
| 538 | 289 |
| 539 | 377 |
| 540 | 303 |
| 541 | 396 |
| 542 | 409 |
| 543 | 496 |
| 544 | 88 |
| 545 | 169 |
| 546 | 179 |
| 547 | 267 |
| 548 | 190 |
| 549 | 286 |
| 550 | 297 |
| 551 | 390 |
| 552 | 206 |
| 553 | 306 |
| 554 | 318 |
| 555 | 417 |
| 556 | 331 |
| 557 | 434 |
| 558 | 446 |
| 559 | 534 |
| 560 | 220 |
| 561 | 328 |
| 562 | 343 |
| 563 | 441 |
| 564 | 353 |
| 565 | 461 |
| 566 | 473 |
| 567 | 562 |
| 568 | 368 |
| 569 | 480 |
| 570 | 493 |
| 571 | 587 |
| 572 | 507 |
| 573 | 602 |
| 574 | 612 |
| 575 | 696 |
| 576 | 101 |
| 577 | 192 |
| 578 | 204 |
| 579 | 301 |
| 580 | 218 |
| 581 | 317 |
| 582 | 329 |
| 583 | 432 |
| 584 | 231 |
| 585 | 342 |
| 586 | 351 |
| 587 | 456 |
| 588 | 364 |
| 589 | 475 |
| 590 | 487 |
| 591 | 575 |
| 592 | 246 |
| 593 | 363 |
| 594 | 374 |
| 595 | 484 |
| 596 | 392 |
| 597 | 502 |
| 598 | 514 |
| 599 | 605 |

TABLE Z27-continued with a sequence length of 1024:

| Polarized channel sequence number | Reliability or reliability sequence number |
|---|---|
| 600 | 411 |
| 601 | 522 |
| 602 | 538 |
| 603 | 627 |
| 604 | 546 |
| 605 | 643 |
| 606 | 654 |
| 607 | 733 |
| 608 | 262 |
| 609 | 391 |
| 610 | 408 |
| 611 | 513 |
| 612 | 423 |
| 613 | 533 |
| 614 | 543 |
| 615 | 639 |
| 616 | 440 |
| 617 | 553 |
| 618 | 568 |
| 619 | 658 |
| 620 | 578 |
| 621 | 675 |
| 622 | 684 |
| 623 | 761 |
| 624 | 457 |
| 625 | 576 |
| 626 | 592 |
| 627 | 681 |
| 628 | 604 |
| 629 | 699 |
| 630 | 709 |
| 631 | 783 |
| 632 | 622 |
| 633 | 716 |
| 634 | 728 |
| 635 | 807 |
| 636 | 738 |
| 637 | 816 |
| 638 | 843 |
| 639 | 893 |
| 640 | 113 |
| 641 | 216 |
| 642 | 232 |
| 643 | 339 |
| 644 | 245 |
| 645 | 356 |
| 646 | 369 |
| 647 | 476 |
| 648 | 261 |
| 649 | 382 |
| 650 | 395 |
| 651 | 500 |
| 652 | 410 |
| 653 | 520 |
| 654 | 535 |
| 655 | 625 |
| 656 | 281 |
| 657 | 407 |
| 658 | 421 |
| 659 | 528 |
| 660 | 439 |
| 661 | 548 |
| 662 | 563 |
| 663 | 653 |
| 664 | 454 |
| 665 | 572 |
| 666 | 584 |
| 667 | 672 |
| 668 | 598 |
| 669 | 689 |
| 670 | 700 |
| 671 | 772 |
| 672 | 294 |
| 673 | 438 |
| 674 | 450 |

TABLE Z27-continued with a sequence length of 1024:

| Polarized channel sequence number | Reliability or reliability sequence number |
|---|---|
| 675 | 561 |
| 676 | 467 |
| 677 | 580 |
| 678 | 595 |
| 679 | 683 |
| 680 | 483 |
| 681 | 601 |
| 682 | 620 |
| 683 | 704 |
| 684 | 631 |
| 685 | 721 |
| 686 | 732 |
| 687 | 812 |
| 688 | 501 |
| 689 | 628 |
| 690 | 641 |
| 691 | 730 |
| 692 | 656 |
| 693 | 745 |
| 694 | 752 |
| 695 | 821 |
| 696 | 666 |
| 697 | 760 |
| 698 | 768 |
| 699 | 835 |
| 700 | 780 |
| 701 | 850 |
| 702 | 861 |
| 703 | 913 |
| 704 | 316 |
| 705 | 468 |
| 706 | 482 |
| 707 | 597 |
| 708 | 497 |
| 709 | 619 |
| 710 | 630 |
| 711 | 718 |
| 712 | 517 |
| 713 | 640 |
| 714 | 649 |
| 715 | 739 |
| 716 | 663 |
| 717 | 755 |
| 718 | 765 |
| 719 | 823 |
| 720 | 539 |
| 721 | 660 |
| 722 | 671 |
| 723 | 762 |
| 724 | 686 |
| 725 | 776 |
| 726 | 787 |
| 727 | 846 |
| 728 | 702 |
| 729 | 793 |
| 730 | 798 |
| 731 | 863 |
| 732 | 814 |
| 733 | 876 |
| 734 | 888 |
| 735 | 932 |
| 736 | 557 |
| 737 | 685 |
| 738 | 698 |
| 739 | 785 |
| 740 | 711 |
| 741 | 795 |
| 742 | 805 |
| 743 | 868 |
| 744 | 727 |
| 745 | 803 |
| 746 | 818 |
| 747 | 885 |
| 748 | 830 |
| 749 | 896 |

TABLE Z27-continued with a sequence length of 1024:

| Polarized channel sequence number | Reliability or reliability sequence number |
|---|---|
| 750 | 905 |
| 751 | 946 |
| 752 | 744 |
| 753 | 824 |
| 754 | 844 |
| 755 | 901 |
| 756 | 851 |
| 757 | 912 |
| 758 | 919 |
| 759 | 958 |
| 760 | 874 |
| 761 | 922 |
| 762 | 930 |
| 763 | 965 |
| 764 | 940 |
| 765 | 972 |
| 766 | 977 |
| 767 | 998 |
| 768 | 126 |
| 769 | 244 |
| 770 | 260 |
| 771 | 380 |
| 772 | 275 |
| 773 | 400 |
| 774 | 420 |
| 775 | 525 |
| 776 | 295 |
| 777 | 426 |
| 778 | 442 |
| 779 | 552 |
| 780 | 459 |
| 781 | 573 |
| 782 | 586 |
| 783 | 677 |
| 784 | 315 |
| 785 | 455 |
| 786 | 470 |
| 787 | 583 |
| 788 | 489 |
| 789 | 599 |
| 790 | 614 |
| 791 | 705 |
| 792 | 504 |
| 793 | 624 |
| 794 | 637 |
| 795 | 726 |
| 796 | 651 |
| 797 | 743 |
| 798 | 750 |
| 799 | 834 |
| 800 | 341 |
| 801 | 488 |
| 802 | 499 |
| 803 | 611 |
| 804 | 515 |
| 805 | 635 |
| 806 | 647 |
| 807 | 735 |
| 808 | 537 |
| 809 | 657 |
| 810 | 669 |
| 811 | 757 |
| 812 | 682 |
| 813 | 771 |
| 814 | 781 |
| 815 | 855 |
| 816 | 550 |
| 817 | 679 |
| 818 | 692 |
| 819 | 778 |
| 820 | 706 |
| 821 | 792 |
| 822 | 797 |
| 823 | 865 |
| 824 | 719 |

TABLE Z27-continued with a sequence length of 1024:

| Polarized channel sequence number | Reliability or reliability sequence number |
|---|---|
| 825 | 800 |
| 826 | 810 |
| 827 | 873 |
| 828 | 831 |
| 829 | 887 |
| 830 | 895 |
| 831 | 939 |
| 832 | 360 |
| 833 | 516 |
| 834 | 536 |
| 835 | 650 |
| 836 | 549 |
| 837 | 668 |
| 838 | 680 |
| 839 | 769 |
| 840 | 566 |
| 841 | 691 |
| 842 | 703 |
| 843 | 789 |
| 844 | 715 |
| 845 | 799 |
| 846 | 802 |
| 847 | 870 |
| 848 | 589 |
| 849 | 712 |
| 850 | 724 |
| 851 | 801 |
| 852 | 737 |
| 853 | 815 |
| 854 | 826 |
| 855 | 884 |
| 856 | 754 |
| 857 | 837 |
| 858 | 849 |
| 859 | 898 |
| 860 | 862 |
| 861 | 909 |
| 862 | 917 |
| 863 | 956 |
| 864 | 609 |
| 865 | 736 |
| 866 | 749 |
| 867 | 819 |
| 868 | 764 |
| 869 | 833 |
| 870 | 854 |
| 871 | 903 |
| 872 | 777 |
| 873 | 841 |
| 874 | 856 |
| 875 | 915 |
| 876 | 877 |
| 877 | 924 |
| 878 | 933 |
| 879 | 967 |
| 880 | 791 |
| 881 | 866 |
| 882 | 880 |
| 883 | 927 |
| 884 | 892 |
| 885 | 937 |
| 886 | 944 |
| 887 | 975 |
| 888 | 907 |
| 889 | 948 |
| 890 | 954 |
| 891 | 982 |
| 892 | 961 |
| 893 | 987 |
| 894 | 991 |
| 895 | 1007 |
| 896 | 381 |
| 897 | 547 |
| 898 | 569 |
| 899 | 687 |
| 900 | 588 |
| 901 | 708 |
| 902 | 720 |
| 903 | 811 |
| 904 | 608 |
| 905 | 731 |
| 906 | 741 |
| 907 | 820 |
| 908 | 753 |
| 909 | 828 |
| 910 | 838 |
| 911 | 894 |
| 912 | 626 |
| 913 | 748 |
| 914 | 763 |
| 915 | 839 |
| 916 | 774 |
| 917 | 848 |
| 918 | 860 |
| 919 | 911 |
| 920 | 788 |
| 921 | 853 |
| 922 | 872 |
| 923 | 921 |
| 924 | 882 |
| 925 | 931 |
| 926 | 938 |
| 927 | 971 |
| 928 | 646 |
| 929 | 773 |
| 930 | 786 |
| 931 | 859 |
| 932 | 806 |
| 933 | 867 |
| 934 | 878 |
| 935 | 925 |
| 936 | 825 |
| 937 | 881 |
| 938 | 890 |
| 939 | 936 |
| 940 | 904 |
| 941 | 945 |
| 942 | 952 |
| 943 | 980 |
| 944 | 829 |
| 945 | 900 |
| 946 | 910 |
| 947 | 950 |
| 948 | 918 |
| 949 | 957 |
| 950 | 962 |
| 951 | 988 |
| 952 | 929 |
| 953 | 964 |
| 954 | 970 |
| 955 | 993 |
| 956 | 976 |
| 957 | 997 |
| 958 | 1000 |
| 959 | 1012 |
| 960 | 667 |
| 961 | 794 |
| 962 | 809 |
| 963 | 879 |
| 964 | 840 |
| 965 | 889 |
| 966 | 902 |
| 967 | 943 |
| 968 | 845 |
| 969 | 906 |
| 970 | 914 |
| 971 | 953 |
| 972 | 923 |
| 973 | 960 |
| 974 | 966 |

TABLE Z27-continued

| with a sequence length of 1024: | |
|---|---|
| Polarized channel sequence number | Reliability or reliability sequence number |
| 975 | 990 |
| 976 | 857 |
| 977 | 920 |
| 978 | 926 |
| 979 | 963 |
| 980 | 935 |
| 981 | 969 |
| 982 | 974 |
| 983 | 996 |
| 984 | 947 |
| 985 | 978 |
| 986 | 981 |
| 987 | 1001 |
| 988 | 986 |
| 989 | 1004 |
| 990 | 1006 |
| 991 | 1016 |
| 992 | 883 |
| 993 | 934 |
| 994 | 942 |
| 995 | 973 |
| 996 | 951 |
| 997 | 979 |
| 998 | 984 |
| 999 | 1002 |
| 1000 | 959 |
| 1001 | 985 |
| 1002 | 989 |
| 1003 | 1005 |
| 1004 | 994 |
| 1005 | 1008 |
| 1006 | 1010 |
| 1007 | 1018 |
| 1008 | 968 |
| 1009 | 992 |
| 1010 | 995 |
| 1011 | 1009 |
| 1012 | 999 |
| 1013 | 1011 |
| 1014 | 1013 |
| 1015 | 1019 |
| 1016 | 1003 |
| 1017 | 1014 |
| 1018 | 1015 |
| 1019 | 1020 |
| 1020 | 1017 |
| 1021 | 1021 |
| 1022 | 1022 |
| 1023 | 1023 |

Seventh group of sequences (in comprehensive consideration of a criterion that a list 2 has optimal performance when a mother code length is 512 and a list 4 is optimal when a mother code length is 1024)

Sequence Q28, with a sequence length of 1024

[0, 1, 2, 4, 8, 16, 32, 3, 64, 5, 6, 9, 128, 256, 10, 17, 12, 18, 33, 20, 34, 65, 24, 36, 66, 7, 11, 512, 129, 40, 68, 257, 13, 19, 48, 130, 72, 14, 258, 21, 80, 260, 35, 513, 132, 22, 25, 264, 37, 136, 9 6, 272, 514, 38, 26, 67, 41, 144, 28, 288, 516, 69, 42, 49, 160, 520, 70, 528, 73, 544, 131, 44, 50, 32 0, 74, 81, 15, 52, 384, 133, 192, 134, 23, 76, 56, 82, 137, 27, 259, 97, 261, 39, 84, 138, 145, 29, 98, 2 62, 515, 265, 43, 88, 140, 146, 30, 161, 45, 576, 71, 100, 640, 266, 273, 51, 148, 268, 75, 517, 104, 162, 46, 274, 53, 193, 152, 768, 289, 276, 518, 77, 54, 83, 521, 57, 164, 112, 135, 78, 194, 290, 52 2, 280, 58, 321, 85, 168, 292, 139, 322, 99, 529, 524, 60, 86, 196, 296, 141, 89, 530, 263, 385, 324, 147, 545, 176, 101, 532, 31, 142, 304, 90, 328, 105, 386, 200, 149, 102, 47, 546, 208, 92, 267, 150, 163, 388, 106, 153, 336, 536, 577, 548, 55, 269, 165, 113, 154, 578, 79, 224, 519, 552, 275, 392, 641, 523, 270, 580, 352, 166, 400, 560, 108, 59, 169, 114, 195, 156, 116, 277, 531, 525, 642, 278, 87, 526, 197, 170, 291, 416, 584, 769, 281, 293, 91, 177, 120, 198, 61, 282, 201, 448, 294, 103, 64 4, 172, 592, 62, 178, 143, 770, 284, 323, 93, 202, 297, 648, 209, 151, 298, 107, 608, 180, 94, 533, 325, 210, 305, 547, 300, 326, 155, 534, 537, 109, 204, 184, 387, 306, 772, 271, 656, 329, 167, 11 5, 225, 330, 776, 157, 110, 549, 538, 212, 308, 389, 337, 332, 312, 171, 117, 550, 672, 226, 279, 5 79, 540, 118, 158, 216, 553, 390, 784, 338, 393, 173, 121, 704, 353, 340, 554, 581, 199, 394, 283, 179, 228, 561, 122, 174, 63, 181, 527, 582, 556, 232, 295, 203, 205, 285, 124, 182, 643, 562, 354, 585, 211, 401, 299, 185, 240, 206, 95, 586, 645, 593, 535, 344, 356, 402, 286, 564, 800, 417, 327, 301, 396, 307, 213, 568, 832, 588, 186, 646, 418, 360, 896, 594, 227, 309, 649, 771, 331, 539, 18 8, 111, 449, 302, 217, 214, 159, 404, 609, 596, 551, 650, 333, 408, 310, 368, 541, 773, 610, 657, 2 29, 119, 600, 339, 218, 313, 652, 230, 420, 175, 334, 542, 391, 450, 555, 774, 341, 233, 658, 612, 123, 777, 220, 183, 314, 395, 673, 583, 424, 355, 234, 125, 241, 557, 660, 616, 345, 342, 452, 77 8, 563, 397, 287, 207, 432, 316, 674, 558, 785, 357, 403, 236, 187, 664, 624, 587, 780, 705, 346, 3 98, 565, 361, 126, 242, 456, 405, 215, 569, 189, 595, 244, 566, 676, 358, 706, 589, 303, 786, 647, 362, 464, 419, 406, 680, 801, 348, 590, 248, 570, 788, 597, 572, 219, 409, 708, 598, 601, 651, 31 1, 792, 802, 611, 602, 421, 369, 688, 653, 190, 231, 480, 335, 654, 659, 410, 425, 370, 315, 221, 6 13, 422, 364, 235, 614, 543, 317, 451, 343, 412, 775, 222, 433, 453, 372, 237, 559, 833, 804, 712, 834, 661, 808, 779, 617, 604, 426, 720, 816, 836, 243, 897, 454, 662, 347, 376, 675, 618, 898, 78 1, 428, 457, 665, 736, 567, 840, 625, 318, 359, 245, 127, 787, 591, 678, 238, 677, 465, 434, 399, 6 66, 620, 458, 363, 349, 782, 407, 436, 626, 571, 246, 681, 350, 707, 249, 599, 668, 790, 460, 411, 682, 573, 365, 803, 789, 709, 440, 371, 628, 689, 481, 250, 423, 793, 466, 413, 366, 574, 468, 60 3, 191, 482, 655, 900, 805, 615, 684, 710, 427, 794, 373, 252, 605, 848, 690, 713, 632, 414, 806, 3 74, 904, 472, 377, 663, 692, 835, 619, 455, 429, 796, 809, 714, 721, 837, 716, 864, 810, 606, 912, 722, 696, 223, 484, 817, 435, 621, 812, 430, 319, 838, 667, 378, 459, 239, 437, 622, 627, 488, 46 1, 818, 380, 247, 669, 679, 724, 841, 629, 467, 438, 441, 737, 462, 351, 469, 367, 442, 251, 683, 8 42, 738, 899, 670, 783, 849, 820, 728, 928, 791, 470, 901, 630, 685, 844, 633, 711, 415, 691, 824, 902, 686, 740, 850, 496, 483, 444, 473, 375, 253, 905, 795, 254, 634, 744, 852, 960, 865, 693, 79 7, 906, 715, 807, 485, 636, 694, 431, 717, 575, 913, 798, 811, 474, 697, 379, 607, 486, 866, 723, 4 89, 908, 718, 813, 476, 856, 839, 725, 698, 914, 752, 868, 819, 814, 381, 929, 439, 623, 671, 739, 916, 490, 843, 463, 382, 930, 821, 726, 961, 872, 497, 631, 729, 700, 443, 741, 845, 920, 492, 82 2, 851, 730, 498, 880, 742, 471, 445, 635, 932, 687, 903, 825, 255, 846, 745, 826, 732, 500, 962, 9 36, 446, 853, 867, 637, 907, 475, 695, 746, 828, 753, 854, 857, 487, 799, 504, 964, 909, 719, 477, 915, 638, 748, 944, 869, 491, 699, 754, 858, 478, 968, 383, 910, 815, 976, 870, 917, 727, 493, 87 3, 701, 931, 756, 860, 499, 731, 823, 922, 874, 918, 494, 933, 743, 760, 881, 501, 702, 921, 447, 8 76, 847, 992, 502, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 91 9, 875, 862, 758, 948, 977, 923, 972, 761, 877, 952, 495, 703, 935, 978, 883, 762, 503, 925, 878, 7 35, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 95 9, 1011, 1013, 895, 1006, 1014, 1017, 1018, 991, 1020, 1007, 1015, 1019, 1021, 1022, 1023]

TABLE Q28

| with a sequence length of 1024: | |
|---|---|
| Reliability or reliability sequence number | Polarized channel sequence number |
| 0 | 0 |
| 1 | 1 |
| 2 | 2 |
| 3 | 4 |
| 4 | 8 |
| 5 | 16 |
| 6 | 32 |
| 7 | 3 |
| 8 | 64 |
| 9 | 5 |
| 10 | 6 |
| 11 | 9 |
| 12 | 128 |
| 13 | 256 |
| 14 | 10 |
| 15 | 17 |
| 16 | 12 |
| 17 | 18 |
| 18 | 33 |
| 19 | 20 |
| 20 | 34 |
| 21 | 65 |
| 22 | 24 |
| 23 | 36 |
| 24 | 66 |
| 25 | 7 |
| 26 | 11 |
| 27 | 512 |
| 28 | 129 |
| 29 | 40 |
| 30 | 68 |
| 31 | 257 |
| 32 | 13 |
| 33 | 19 |
| 34 | 48 |
| 35 | 130 |
| 36 | 72 |
| 37 | 14 |
| 38 | 258 |
| 39 | 21 |
| 40 | 80 |
| 41 | 260 |
| 42 | 35 |
| 43 | 513 |
| 44 | 132 |
| 45 | 22 |
| 46 | 25 |
| 47 | 264 |
| 48 | 37 |
| 49 | 136 |
| 50 | 96 |
| 51 | 272 |
| 52 | 514 |
| 53 | 38 |
| 54 | 26 |
| 55 | 67 |
| 56 | 41 |
| 57 | 144 |
| 58 | 28 |
| 59 | 288 |
| 60 | 516 |

TABLE Q28-continued

| with a sequence length of 1024: | |
|---|---|
| Reliability or reliability sequence number | Polarized channel sequence number |
| 61 | 69 |
| 62 | 42 |
| 63 | 49 |
| 64 | 160 |
| 65 | 520 |
| 66 | 70 |
| 67 | 528 |
| 68 | 73 |
| 69 | 544 |
| 70 | 131 |
| 71 | 44 |
| 72 | 50 |
| 73 | 320 |
| 74 | 74 |
| 75 | 81 |
| 76 | 15 |
| 77 | 52 |
| 78 | 384 |
| 79 | 133 |
| 80 | 192 |
| 81 | 134 |
| 82 | 23 |
| 83 | 76 |
| 84 | 56 |
| 85 | 82 |
| 86 | 137 |
| 87 | 27 |
| 88 | 259 |
| 89 | 97 |
| 90 | 261 |
| 91 | 39 |
| 92 | 84 |
| 93 | 138 |
| 94 | 145 |
| 95 | 29 |
| 96 | 98 |
| 97 | 262 |
| 98 | 515 |
| 99 | 265 |
| 100 | 43 |
| 101 | 88 |
| 102 | 140 |
| 103 | 146 |
| 104 | 30 |
| 105 | 161 |
| 106 | 45 |
| 107 | 576 |
| 108 | 71 |
| 109 | 100 |
| 110 | 640 |
| 111 | 266 |
| 112 | 273 |
| 113 | 51 |
| 114 | 148 |
| 115 | 268 |
| 116 | 75 |
| 117 | 517 |
| 118 | 104 |
| 119 | 162 |
| 120 | 46 |
| 121 | 274 |
| 122 | 53 |
| 123 | 193 |
| 124 | 152 |
| 125 | 768 |
| 126 | 289 |
| 127 | 276 |
| 128 | 518 |
| 129 | 77 |
| 130 | 54 |
| 131 | 83 |
| 132 | 521 |
| 133 | 57 |
| 134 | 164 |
| 135 | 112 |

TABLE Q28-continued with a sequence length of 1024:

| Reliability or reliability sequence number | Polarized channel sequence number |
|---|---|
| 136 | 135 |
| 137 | 78 |
| 138 | 194 |
| 139 | 290 |
| 140 | 522 |
| 141 | 280 |
| 142 | 58 |
| 143 | 321 |
| 144 | 85 |
| 145 | 168 |
| 146 | 292 |
| 147 | 139 |
| 148 | 322 |
| 149 | 99 |
| 150 | 529 |
| 151 | 524 |
| 152 | 60 |
| 153 | 86 |
| 154 | 196 |
| 155 | 296 |
| 156 | 141 |
| 157 | 89 |
| 158 | 530 |
| 159 | 263 |
| 160 | 385 |
| 161 | 324 |
| 162 | 147 |
| 163 | 545 |
| 164 | 176 |
| 165 | 101 |
| 166 | 532 |
| 167 | 31 |
| 168 | 142 |
| 169 | 304 |
| 170 | 90 |
| 171 | 328 |
| 172 | 105 |
| 173 | 386 |
| 174 | 200 |
| 175 | 149 |
| 176 | 102 |
| 177 | 47 |
| 178 | 546 |
| 179 | 208 |
| 180 | 92 |
| 181 | 267 |
| 182 | 150 |
| 183 | 163 |
| 184 | 388 |
| 185 | 106 |
| 186 | 153 |
| 187 | 336 |
| 188 | 536 |
| 189 | 577 |
| 190 | 548 |
| 191 | 55 |
| 192 | 269 |
| 193 | 165 |
| 194 | 113 |
| 195 | 154 |
| 196 | 578 |
| 197 | 79 |
| 198 | 224 |
| 199 | 519 |
| 200 | 552 |
| 201 | 275 |
| 202 | 392 |
| 203 | 641 |
| 204 | 523 |
| 205 | 270 |
| 206 | 580 |
| 207 | 352 |
| 208 | 166 |
| 209 | 400 |
| 210 | 560 |

TABLE Q28-continued with a sequence length of 1024:

| Reliability or reliability sequence number | Polarized channel sequence number |
|---|---|
| 211 | 108 |
| 212 | 59 |
| 213 | 169 |
| 214 | 114 |
| 215 | 195 |
| 216 | 156 |
| 217 | 116 |
| 218 | 277 |
| 219 | 531 |
| 220 | 525 |
| 221 | 642 |
| 222 | 278 |
| 223 | 87 |
| 224 | 526 |
| 225 | 197 |
| 226 | 170 |
| 227 | 291 |
| 228 | 416 |
| 229 | 584 |
| 230 | 769 |
| 231 | 281 |
| 232 | 293 |
| 233 | 91 |
| 234 | 177 |
| 235 | 120 |
| 236 | 198 |
| 237 | 61 |
| 238 | 282 |
| 239 | 201 |
| 240 | 448 |
| 241 | 294 |
| 242 | 103 |
| 243 | 644 |
| 244 | 172 |
| 245 | 592 |
| 246 | 62 |
| 247 | 178 |
| 248 | 143 |
| 249 | 770 |
| 250 | 284 |
| 251 | 323 |
| 252 | 93 |
| 253 | 202 |
| 254 | 297 |
| 255 | 648 |
| 256 | 209 |
| 257 | 151 |
| 258 | 298 |
| 259 | 107 |
| 260 | 608 |
| 261 | 180 |
| 262 | 94 |
| 263 | 533 |
| 264 | 325 |
| 265 | 210 |
| 266 | 305 |
| 267 | 547 |
| 268 | 300 |
| 269 | 326 |
| 270 | 155 |
| 271 | 534 |
| 272 | 537 |
| 273 | 109 |
| 274 | 204 |
| 275 | 184 |
| 276 | 387 |
| 277 | 306 |
| 278 | 772 |
| 279 | 271 |
| 280 | 656 |
| 281 | 329 |
| 282 | 167 |
| 283 | 115 |
| 284 | 225 |
| 285 | 330 |

TABLE Q28-continued

| with a sequence length of 1024: | |
|---|---|
| Reliability or reliability sequence number | Polarized channel sequence number |
| 286 | 776 |
| 287 | 157 |
| 288 | 110 |
| 289 | 549 |
| 290 | 538 |
| 291 | 212 |
| 292 | 308 |
| 293 | 389 |
| 294 | 337 |
| 295 | 332 |
| 296 | 312 |
| 297 | 171 |
| 298 | 117 |
| 299 | 550 |
| 300 | 672 |
| 301 | 226 |
| 302 | 279 |
| 303 | 579 |
| 304 | 540 |
| 305 | 118 |
| 306 | 158 |
| 307 | 216 |
| 308 | 553 |
| 309 | 390 |
| 310 | 784 |
| 311 | 338 |
| 312 | 393 |
| 313 | 173 |
| 314 | 121 |
| 315 | 704 |
| 316 | 353 |
| 317 | 340 |
| 318 | 554 |
| 319 | 581 |
| 320 | 199 |
| 321 | 394 |
| 322 | 283 |
| 323 | 179 |
| 324 | 228 |
| 325 | 561 |
| 326 | 122 |
| 327 | 174 |
| 328 | 63 |
| 329 | 181 |
| 330 | 527 |
| 331 | 582 |
| 332 | 556 |
| 333 | 232 |
| 334 | 295 |
| 335 | 203 |
| 336 | 205 |
| 337 | 285 |
| 338 | 124 |
| 339 | 182 |
| 340 | 643 |
| 341 | 562 |
| 342 | 354 |
| 343 | 585 |
| 344 | 211 |
| 345 | 401 |
| 346 | 299 |
| 347 | 185 |
| 348 | 240 |
| 349 | 206 |
| 350 | 95 |
| 351 | 586 |
| 352 | 645 |
| 353 | 593 |
| 354 | 535 |
| 355 | 344 |
| 356 | 356 |
| 357 | 402 |
| 358 | 286 |
| 359 | 564 |
| 360 | 800 |

TABLE Q28-continued

| with a sequence length of 1024: | |
|---|---|
| Reliability or reliability sequence number | Polarized channel sequence number |
| 361 | 417 |
| 362 | 327 |
| 363 | 301 |
| 364 | 396 |
| 365 | 307 |
| 366 | 213 |
| 367 | 568 |
| 368 | 832 |
| 369 | 588 |
| 370 | 186 |
| 371 | 646 |
| 372 | 418 |
| 373 | 360 |
| 374 | 896 |
| 375 | 594 |
| 376 | 227 |
| 377 | 309 |
| 378 | 649 |
| 379 | 771 |
| 380 | 331 |
| 381 | 539 |
| 382 | 188 |
| 383 | 111 |
| 384 | 449 |
| 385 | 302 |
| 386 | 217 |
| 387 | 214 |
| 388 | 159 |
| 389 | 404 |
| 390 | 609 |
| 391 | 596 |
| 392 | 551 |
| 393 | 650 |
| 394 | 333 |
| 395 | 408 |
| 396 | 310 |
| 397 | 368 |
| 398 | 541 |
| 399 | 773 |
| 400 | 610 |
| 401 | 657 |
| 402 | 229 |
| 403 | 119 |
| 404 | 600 |
| 405 | 339 |
| 406 | 218 |
| 407 | 313 |
| 408 | 652 |
| 409 | 230 |
| 410 | 420 |
| 411 | 175 |
| 412 | 334 |
| 413 | 542 |
| 414 | 391 |
| 415 | 450 |
| 416 | 555 |
| 417 | 774 |
| 418 | 341 |
| 419 | 233 |
| 420 | 658 |
| 421 | 612 |
| 422 | 123 |
| 423 | 777 |
| 424 | 220 |
| 425 | 183 |
| 426 | 314 |
| 427 | 395 |
| 428 | 673 |
| 429 | 583 |
| 430 | 424 |
| 431 | 355 |
| 432 | 234 |
| 433 | 125 |
| 434 | 241 |
| 435 | 557 |

TABLE Q28-continued with a sequence length of 1024:

| Reliability or reliability sequence number | Polarized channel sequence number |
|---|---|
| 436 | 660 |
| 437 | 616 |
| 438 | 345 |
| 439 | 342 |
| 440 | 452 |
| 441 | 778 |
| 442 | 563 |
| 443 | 397 |
| 444 | 287 |
| 445 | 207 |
| 446 | 432 |
| 447 | 316 |
| 448 | 674 |
| 449 | 558 |
| 450 | 785 |
| 451 | 357 |
| 452 | 403 |
| 453 | 236 |
| 454 | 187 |
| 455 | 664 |
| 456 | 624 |
| 457 | 587 |
| 458 | 780 |
| 459 | 705 |
| 460 | 346 |
| 461 | 398 |
| 462 | 565 |
| 463 | 361 |
| 464 | 126 |
| 465 | 242 |
| 466 | 456 |
| 467 | 405 |
| 468 | 215 |
| 469 | 569 |
| 470 | 189 |
| 471 | 595 |
| 472 | 244 |
| 473 | 566 |
| 474 | 676 |
| 475 | 358 |
| 476 | 706 |
| 477 | 589 |
| 478 | 303 |
| 479 | 786 |
| 480 | 647 |
| 481 | 362 |
| 482 | 464 |
| 483 | 419 |
| 484 | 406 |
| 485 | 680 |
| 486 | 801 |
| 487 | 348 |
| 488 | 590 |
| 489 | 248 |
| 490 | 570 |
| 491 | 788 |
| 492 | 597 |
| 493 | 572 |
| 494 | 219 |
| 495 | 409 |
| 496 | 708 |
| 497 | 598 |
| 498 | 601 |
| 499 | 651 |
| 500 | 311 |
| 501 | 792 |
| 502 | 802 |
| 503 | 611 |
| 504 | 602 |
| 505 | 421 |
| 506 | 369 |
| 507 | 688 |
| 508 | 653 |
| 509 | 190 |
| 510 | 231 |

TABLE Q28-continued with a sequence length of 1024:

| Reliability or reliability sequence number | Polarized channel sequence number |
|---|---|
| 511 | 480 |
| 512 | 335 |
| 513 | 654 |
| 514 | 659 |
| 515 | 410 |
| 516 | 425 |
| 517 | 370 |
| 518 | 315 |
| 519 | 221 |
| 520 | 613 |
| 521 | 422 |
| 522 | 364 |
| 523 | 235 |
| 524 | 614 |
| 525 | 543 |
| 526 | 317 |
| 527 | 451 |
| 528 | 343 |
| 529 | 412 |
| 530 | 775 |
| 531 | 222 |
| 532 | 433 |
| 533 | 453 |
| 534 | 372 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 426 |
| 547 | 720 |
| 548 | 816 |
| 549 | 836 |
| 550 | 243 |
| 551 | 897 |
| 552 | 454 |
| 553 | 662 |
| 554 | 347 |
| 555 | 376 |
| 556 | 675 |
| 557 | 618 |
| 558 | 898 |
| 559 | 781 |
| 560 | 428 |
| 561 | 457 |
| 562 | 665 |
| 563 | 736 |
| 564 | 567 |
| 565 | 840 |
| 566 | 625 |
| 567 | 318 |
| 568 | 359 |
| 569 | 245 |
| 570 | 127 |
| 571 | 787 |
| 572 | 591 |
| 573 | 678 |
| 574 | 238 |
| 575 | 677 |
| 576 | 465 |
| 577 | 434 |
| 578 | 399 |
| 579 | 666 |
| 580 | 620 |
| 581 | 458 |
| 582 | 363 |
| 583 | 349 |
| 584 | 782 |
| 585 | 407 |

TABLE Q28-continued

| with a sequence length of 1024: | |
|---|---|
| Reliability or reliability sequence number | Polarized channel sequence number |
| 586 | 436 |
| 587 | 626 |
| 588 | 571 |
| 589 | 246 |
| 590 | 681 |
| 591 | 350 |
| 592 | 707 |
| 593 | 249 |
| 594 | 599 |
| 595 | 668 |
| 596 | 790 |
| 597 | 460 |
| 598 | 411 |
| 599 | 682 |
| 600 | 573 |
| 601 | 365 |
| 602 | 803 |
| 603 | 789 |
| 604 | 709 |
| 605 | 440 |
| 606 | 371 |
| 607 | 628 |
| 608 | 689 |
| 609 | 481 |
| 610 | 250 |
| 611 | 423 |
| 612 | 793 |
| 613 | 466 |
| 614 | 413 |
| 615 | 366 |
| 616 | 574 |
| 617 | 468 |
| 618 | 603 |
| 619 | 191 |
| 620 | 482 |
| 621 | 655 |
| 622 | 900 |
| 623 | 805 |
| 624 | 615 |
| 625 | 684 |
| 626 | 710 |
| 627 | 427 |
| 628 | 794 |
| 629 | 373 |
| 630 | 252 |
| 631 | 605 |
| 632 | 848 |
| 633 | 690 |
| 634 | 713 |
| 635 | 632 |
| 636 | 414 |
| 637 | 806 |
| 638 | 374 |
| 639 | 904 |
| 640 | 472 |
| 641 | 377 |
| 642 | 663 |
| 643 | 692 |
| 644 | 835 |
| 645 | 619 |
| 646 | 455 |
| 647 | 429 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 223 |

TABLE Q28-continued

| with a sequence length of 1024: | |
|---|---|
| Reliability or reliability sequence number | Polarized channel sequence number |
| 661 | 484 |
| 662 | 817 |
| 663 | 435 |
| 664 | 621 |
| 665 | 812 |
| 666 | 430 |
| 667 | 319 |
| 668 | 838 |
| 669 | 667 |
| 670 | 378 |
| 671 | 459 |
| 672 | 239 |
| 673 | 437 |
| 674 | 622 |
| 675 | 627 |
| 676 | 488 |
| 677 | 461 |
| 678 | 818 |
| 679 | 380 |
| 680 | 247 |
| 681 | 669 |
| 682 | 679 |
| 683 | 724 |
| 684 | 841 |
| 685 | 629 |
| 686 | 467 |
| 687 | 438 |
| 688 | 441 |
| 689 | 737 |
| 690 | 462 |
| 691 | 351 |
| 692 | 469 |
| 693 | 367 |
| 694 | 442 |
| 695 | 251 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 470 |
| 708 | 901 |
| 709 | 630 |
| 710 | 685 |
| 711 | 844 |
| 712 | 633 |
| 713 | 711 |
| 714 | 415 |
| 715 | 691 |
| 716 | 824 |
| 717 | 902 |
| 718 | 686 |
| 719 | 740 |
| 720 | 850 |
| 721 | 496 |
| 722 | 483 |
| 723 | 444 |
| 724 | 473 |
| 725 | 375 |
| 726 | 253 |
| 727 | 905 |
| 728 | 795 |
| 729 | 254 |
| 730 | 634 |
| 731 | 744 |
| 732 | 852 |
| 733 | 960 |
| 734 | 865 |
| 735 | 693 |

TABLE Q28-continued

| with a sequence length of 1024: | |
|---|---|
| Reliability or reliability sequence number | Polarized channel sequence number |
| 736 | 797 |
| 737 | 906 |
| 738 | 715 |
| 739 | 807 |
| 740 | 485 |
| 741 | 636 |
| 742 | 694 |
| 743 | 431 |
| 744 | 717 |
| 745 | 575 |
| 746 | 913 |
| 747 | 798 |
| 748 | 811 |
| 749 | 474 |
| 750 | 697 |
| 751 | 379 |
| 752 | 607 |
| 753 | 486 |
| 754 | 866 |
| 755 | 723 |
| 756 | 489 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 381 |
| 771 | 929 |
| 772 | 439 |
| 773 | 623 |
| 774 | 671 |
| 775 | 739 |
| 776 | 916 |
| 777 | 490 |
| 778 | 843 |
| 779 | 463 |
| 780 | 382 |
| 781 | 930 |
| 782 | 821 |
| 783 | 726 |
| 784 | 961 |
| 785 | 872 |
| 786 | 497 |
| 787 | 631 |
| 788 | 729 |
| 789 | 700 |
| 790 | 443 |
| 791 | 741 |
| 792 | 845 |
| 793 | 920 |
| 794 | 492 |
| 795 | 822 |
| 796 | 851 |
| 797 | 730 |
| 798 | 498 |
| 799 | 880 |
| 800 | 742 |
| 801 | 471 |
| 802 | 445 |
| 803 | 635 |
| 804 | 932 |
| 805 | 687 |
| 806 | 903 |
| 807 | 825 |
| 808 | 255 |
| 809 | 846 |
| 810 | 745 |

TABLE Q28-continued

| with a sequence length of 1024: | |
|---|---|
| Reliability or reliability sequence number | Polarized channel sequence number |
| 811 | 826 |
| 812 | 732 |
| 813 | 500 |
| 814 | 962 |
| 815 | 936 |
| 816 | 446 |
| 817 | 853 |
| 818 | 867 |
| 819 | 637 |
| 820 | 907 |
| 821 | 475 |
| 822 | 695 |
| 823 | 746 |
| 824 | 828 |
| 825 | 753 |
| 826 | 854 |
| 827 | 857 |
| 828 | 487 |
| 829 | 799 |
| 830 | 504 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 494 |
| 866 | 933 |
| 867 | 743 |
| 868 | 760 |
| 869 | 881 |
| 870 | 501 |
| 871 | 702 |
| 872 | 921 |
| 873 | 447 |
| 874 | 876 |
| 875 | 847 |
| 876 | 992 |
| 877 | 502 |
| 878 | 733 |
| 879 | 827 |
| 880 | 934 |
| 881 | 882 |
| 882 | 937 |
| 883 | 963 |
| 884 | 747 |
| 885 | 505 |

TABLE Q28-continued with a sequence length of 1024:

| Reliability or reliability sequence number | Polarized channel sequence number |
|---|---|
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Z28, with a sequence length of 1024:

[0, 1, 2, 7, 3, 9, 10, 25, 4, 11, 14, 26, 16, 32, 37, 76, 5, 15, 17, 33, 19, 39, 45, 82, 22, 46, 54, 87, 58, 95, 104, 167, 6, 18, 20, 42, 23, 48, 53, 91, 29, 56, 62, 100, 71, 106, 120, 177, 34, 63, 72, 113, 77, 122, 130, 191, 84, 133, 142, 212, 152, 237, 246, 328, 8, 21, 24, 55, 30, 61, 66, 108, 36, 68, 74, 1 16, 83, 129, 137, 197, 40, 75, 85, 131, 92, 144, 153, 223, 101, 157, 170, 233, 180, 252, 262, 350, 5 0, 89, 96, 149, 109, 165, 176, 242, 118, 172, 185, 259, 211, 273, 288, 383, 135, 194, 214, 283, 217, 298, 305, 403, 235, 314, 326, 422, 338, 433, 464, 570, 12, 28, 35, 70, 44, 79, 81, 136, 49, 86, 93, 1 47, 102, 156, 168, 248, 57, 94, 103, 162, 114, 175, 182, 257, 124, 186, 195, 270, 216, 287, 306, 38 8, 64, 105, 119, 183, 134, 193, 208, 282, 145, 213, 226, 297, 244, 313, 327, 411, 164, 234, 247, 32 3, 261, 329, 339, 425, 275, 347, 370, 454, 382, 470, 509, 619, 80, 123, 138, 215, 154, 225, 236, 32 0, 174, 239, 253, 335, 274, 336, 349, 445, 179, 256, 265, 344, 291, 366, 387, 468, 307, 386, 406, 4 94, 424, 519, 531, 660, 198, 284, 301, 376, 324, 402, 409, 510, 333, 419, 432, 523, 453, 535, 574, 672, 348, 434, 465, 550, 472, 569, 589, 680, 489, 593, 610, 695, 630, 726, 729, 808, 13, 31, 38, 88, 41, 90, 97, 159, 47, 99, 111, 181, 115, 192, 205, 279, 51, 112, 121, 201, 127, 218, 222, 302, 141, 2 31, 238, 322, 250, 337, 358, 444, 59, 126, 139, 227, 146, 232, 241, 334, 155, 254, 258, 346, 268, 3 63, 385, 478, 169, 266, 277, 365, 292, 377, 396, 500, 296, 407, 426, 518, 447, 526, 567, 667, 73, 1 43, 148, 251, 161, 264, 269, 362, 171, 281, 285, 380, 295, 394, 412, 512, 187, 294, 311, 405, 317, 418, 439, 528, 355, 438, 460, 554, 487, 583, 591, 691, 207, 316, 342, 431, 356, 451, 475, 568, 37 3, 463, 481, 582, 522, 601, 615, 693, 397, 506, 517, 606, 534, 629, 638, 725, 555, 641, 670, 751, 6 79, 770, 780, 846, 78, 160, 173, 276, 184, 293, 309, 414, 202, 312, 321, 427, 364, 443, 461, 578, 2 09, 345, 357, 452, 389, 467, 484, 585, 395, 495, 515, 598, 529, 614, 636, 714, 228, 361, 372, 483, 410, 505, 521, 611, 430, 516, 546, 627, 560, 647, 666, 743, 446, 532, 577, 663, 586, 673, 687, 77 2, 605, 688, 694, 790, 723, 802, 816, 873, 240, 384, 415, 527, 440, 533, 552, 646, 466, 561, 581, 6 71, 597, 677, 690, 779, 482, 576, 613, 686, 617, 692, 707, 801, 640, 724, 749, 821, 760, 834, 844, 905, 511, 609, 620, 722, 661, 740, 753, 828, 676, 756, 777, 840, 794, 853, 865, 924, 721, 786, 79 8, 859, 813, 870, 877, 930, 830, 885, 893, 946, 909, 954, 963, 984, 27, 43, 52, 98, 60, 117, 128, 19 9, 65, 132, 140, 204, 151, 220, 224, 330, 67, 150, 158, 219, 166, 263, 271, 354, 188, 272, 290, 381, 304, 398, 413, 525, 69, 163, 178, 267, 190, 289, 299, 392, 200, 308, 318, 416, 332, 435, 449, 536, 210, 325, 341, 442, 359, 462, 473, 564, 367, 469, 490, 588, 493, 600, 616, 745, 107, 189, 196, 30 3, 206, 319, 331, 429, 229, 343, 351, 457, 369, 477, 488, 572, 245, 353, 375, 471, 391, 492, 497, 5 94, 404, 498, 504, 618, 545, 631, 656, 752, 260, 390, 400, 503, 421, 520, 524, 624, 437, 544, 557, 645, 580, 664, 674, 773, 456, 566, 587, 675, 607, 685, 709, 787, 635, 712, 730, 803, 741, 819, 83 6, 903, 110, 203, 221, 340, 243, 352, 371, 480, 255, 378, 393, 499, 408, 508, 513, 621, 280, 401, 4 20, 514, 436, 541, 553, 642, 455, 562, 579, 669, 595, 681, 700, 774, 300, 428, 448, 556, 474, 575, 573, 682, 485, 590, 599, 696, 625, 710, 718, 805, 507, 608, 633, 715, 643, 735, 742, 822, 659, 75 0, 764, 841, 789, 855, 871, 925, 315, 459, 476, 592, 496, 604, 626, 713, 539, 634, 650, 738, 653, 7 44, 758, 833, 547, 651, 658, 755, 683, 763, 783, 852, 704, 788, 797, 860, 812, 878, 888, 933, 563, 689, 698, 775, 719, 791, 800, 867, 731, 810, 823, 884, 837, 894, 907, 949, 766, 825, 842, 897, 85 7, 911, 916, 961, 868, 921, 929, 966, 940, 974, 983, 1003, 125, 230, 249, 379, 278, 399, 417, 530, 286, 423, 441, 543, 458, 559, 584, 701, 310, 450, 479, 571, 491, 603, 596, 706, 501, 612, 628, 72 8, 648, 736, 747, 829, 360, 486, 502, 602, 538, 623, 637, 739, 542, 649, 655, 748, 665, 759, 769, 8 48, 548, 662, 678, 768, 703, 782, 795, 861, 716, 807, 811, 879, 824, 889, 900, 944, 368, 537, 540, 644, 549, 652, 668, 762, 565, 684, 697, 778, 711, 792, 809, 875, 632, 702, 720, 796, 732, 817, 82 6, 886, 761, 827, 843, 898, 858, 910, 915, 960, 654, 734, 754, 818, 767, 839, 850, 902, 785, 854, 8 63, 914, 874, 922, 932, 969, 799, 869, 881, 928, 892, 935, 943, 976, 904, 947, 953, 981, 958, 989, 991, 1011, 374, 551, 558, 699, 622, 708, 717, 806, 639, 727, 737, 820, 757, 832, 847, 901, 657, 7 46, 765, 835, 776, 851, 864, 913, 793, 872, 862, 919, 887, 931, 939, 972, 705, 771, 781, 856, 804, 866, 880, 926, 815, 882, 891, 936, 899, 941, 950, 980, 838, 895, 906, 945, 917, 955, 959, 987, 92 3, 965, 968, 993, 975, 996, 998, 1008, 733, 784, 814, 883, 831, 890, 896, 942, 845, 908, 912, 952, 920, 956, 967, 990, 849, 918, 927, 964, 938, 970, 971, 997, 948, 977, 979, 999, 985, 1004, 1006, 1016, 876, 934, 937, 973, 951, 978, 982, 1001, 957, 986, 988, 1005, 994, 1007, 1012, 1018, 962, 992, 995, 1009, 1000, 1010, 1013, 1019, 1002, 1014, 1015, 1020, 1017, 1021, 1022, 1023]

TABLE Z28 with a sequence length of 1024:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 9 |
| 6 | 10 |
| 7 | 25 |
| 8 | 4 |
| 9 | 11 |
| 10 | 14 |
| 11 | 26 |
| 12 | 16 |
| 13 | 32 |
| 14 | 37 |
| 15 | 76 |
| 16 | 5 |
| 17 | 15 |
| 18 | 17 |
| 19 | 33 |
| 20 | 19 |
| 21 | 39 |
| 22 | 45 |
| 23 | 82 |
| 24 | 22 |
| 25 | 46 |
| 26 | 54 |
| 27 | 87 |
| 28 | 58 |
| 29 | 95 |
| 30 | 104 |
| 31 | 167 |
| 32 | 6 |
| 33 | 18 |
| 34 | 20 |
| 35 | 42 |
| 36 | 23 |
| 37 | 48 |
| 38 | 53 |
| 39 | 91 |
| 40 | 29 |
| 41 | 56 |
| 42 | 62 |
| 43 | 100 |
| 44 | 71 |
| 45 | 106 |
| 46 | 120 |
| 47 | 177 |
| 48 | 34 |
| 49 | 63 |
| 50 | 72 |
| 51 | 113 |

TABLE Z28-continued with a sequence length of 1024:

| Polarized channel sequence number | Reliability or reliability sequence number |
|---|---|
| 52 | 77 |
| 53 | 122 |
| 54 | 130 |
| 55 | 191 |
| 56 | 84 |
| 57 | 133 |
| 58 | 142 |
| 59 | 212 |
| 60 | 152 |
| 61 | 237 |
| 62 | 246 |
| 63 | 328 |
| 64 | 8 |
| 65 | 21 |
| 66 | 24 |
| 67 | 55 |
| 68 | 30 |
| 69 | 61 |
| 70 | 66 |
| 71 | 108 |
| 72 | 36 |
| 73 | 68 |
| 74 | 74 |
| 75 | 116 |
| 76 | 83 |
| 77 | 129 |
| 78 | 137 |
| 79 | 197 |
| 80 | 40 |
| 81 | 75 |
| 82 | 85 |
| 83 | 131 |
| 84 | 92 |
| 85 | 144 |
| 86 | 153 |
| 87 | 223 |
| 88 | 101 |
| 89 | 157 |
| 90 | 170 |
| 91 | 233 |
| 92 | 180 |
| 93 | 252 |
| 94 | 262 |
| 95 | 350 |
| 96 | 50 |
| 97 | 89 |
| 98 | 96 |
| 99 | 149 |
| 100 | 109 |
| 101 | 165 |
| 102 | 176 |
| 103 | 242 |
| 104 | 118 |
| 105 | 172 |
| 106 | 185 |
| 107 | 259 |
| 108 | 211 |
| 109 | 273 |
| 110 | 288 |
| 111 | 383 |
| 112 | 135 |
| 113 | 194 |
| 114 | 214 |
| 115 | 283 |
| 116 | 217 |
| 117 | 298 |
| 118 | 305 |
| 119 | 403 |
| 120 | 235 |
| 121 | 314 |
| 122 | 326 |
| 123 | 422 |
| 124 | 338 |
| 125 | 433 |
| 126 | 464 |

TABLE Z28-continued with a sequence length of 1024:

| Polarized channel sequence number | Reliability or reliability sequence number |
|---|---|
| 127 | 570 |
| 128 | 12 |
| 129 | 28 |
| 130 | 35 |
| 131 | 70 |
| 132 | 44 |
| 133 | 79 |
| 134 | 81 |
| 135 | 136 |
| 136 | 49 |
| 137 | 86 |
| 138 | 93 |
| 139 | 147 |
| 140 | 102 |
| 141 | 156 |
| 142 | 168 |
| 143 | 248 |
| 144 | 57 |
| 145 | 94 |
| 146 | 103 |
| 147 | 162 |
| 148 | 114 |
| 149 | 175 |
| 150 | 182 |
| 151 | 257 |
| 152 | 124 |
| 153 | 186 |
| 154 | 195 |
| 155 | 270 |
| 156 | 216 |
| 157 | 287 |
| 158 | 306 |
| 159 | 388 |
| 160 | 64 |
| 161 | 105 |
| 162 | 119 |
| 163 | 183 |
| 164 | 134 |
| 165 | 193 |
| 166 | 208 |
| 167 | 282 |
| 168 | 145 |
| 169 | 213 |
| 170 | 226 |
| 171 | 297 |
| 172 | 244 |
| 173 | 313 |
| 174 | 327 |
| 175 | 411 |
| 176 | 164 |
| 177 | 234 |
| 178 | 247 |
| 179 | 323 |
| 180 | 261 |
| 181 | 329 |
| 182 | 339 |
| 183 | 425 |
| 184 | 275 |
| 185 | 347 |
| 186 | 370 |
| 187 | 454 |
| 188 | 382 |
| 189 | 470 |
| 190 | 509 |
| 191 | 619 |
| 192 | 80 |
| 193 | 123 |
| 194 | 138 |
| 195 | 215 |
| 196 | 154 |
| 197 | 225 |
| 198 | 236 |
| 199 | 320 |
| 200 | 174 |
| 201 | 239 |

TABLE Z28-continued with a sequence length of 1024:

| Polarized channel sequence number | Reliability or reliability sequence number |
|---|---|
| 202 | 253 |
| 203 | 335 |
| 204 | 274 |
| 205 | 336 |
| 206 | 349 |
| 207 | 445 |
| 208 | 179 |
| 209 | 256 |
| 210 | 265 |
| 211 | 344 |
| 212 | 291 |
| 213 | 366 |
| 214 | 387 |
| 215 | 468 |
| 216 | 307 |
| 217 | 386 |
| 218 | 406 |
| 219 | 494 |
| 220 | 424 |
| 221 | 519 |
| 222 | 531 |
| 223 | 660 |
| 224 | 198 |
| 225 | 284 |
| 226 | 301 |
| 227 | 376 |
| 228 | 324 |
| 229 | 402 |
| 230 | 409 |
| 231 | 510 |
| 232 | 333 |
| 233 | 419 |
| 234 | 432 |
| 235 | 523 |
| 236 | 453 |
| 237 | 535 |
| 238 | 574 |
| 239 | 672 |
| 240 | 348 |
| 241 | 434 |
| 242 | 465 |
| 243 | 550 |
| 244 | 472 |
| 245 | 569 |
| 246 | 589 |
| 247 | 680 |
| 248 | 489 |
| 249 | 593 |
| 250 | 610 |
| 251 | 695 |
| 252 | 630 |
| 253 | 726 |
| 254 | 729 |
| 255 | 808 |
| 256 | 13 |
| 257 | 31 |
| 258 | 38 |
| 259 | 88 |
| 260 | 41 |
| 261 | 90 |
| 262 | 97 |
| 263 | 159 |
| 264 | 47 |
| 265 | 99 |
| 266 | 111 |
| 267 | 181 |
| 268 | 115 |
| 269 | 192 |
| 270 | 205 |
| 271 | 279 |
| 272 | 51 |
| 273 | 112 |
| 274 | 121 |
| 275 | 201 |
| 276 | 127 |

TABLE Z28-continued with a sequence length of 1024:

| Polarized channel sequence number | Reliability or reliability sequence number |
|---|---|
| 277 | 218 |
| 278 | 222 |
| 279 | 302 |
| 280 | 141 |
| 281 | 231 |
| 282 | 238 |
| 283 | 322 |
| 284 | 250 |
| 285 | 337 |
| 286 | 358 |
| 287 | 444 |
| 288 | 59 |
| 289 | 126 |
| 290 | 139 |
| 291 | 227 |
| 292 | 146 |
| 293 | 232 |
| 294 | 241 |
| 295 | 334 |
| 296 | 155 |
| 297 | 254 |
| 298 | 258 |
| 299 | 346 |
| 300 | 268 |
| 301 | 363 |
| 302 | 385 |
| 303 | 478 |
| 304 | 169 |
| 305 | 266 |
| 306 | 277 |
| 307 | 365 |
| 308 | 292 |
| 309 | 377 |
| 310 | 396 |
| 311 | 500 |
| 312 | 296 |
| 313 | 407 |
| 314 | 426 |
| 315 | 518 |
| 316 | 447 |
| 317 | 526 |
| 318 | 567 |
| 319 | 667 |
| 320 | 73 |
| 321 | 143 |
| 322 | 148 |
| 323 | 251 |
| 324 | 161 |
| 325 | 264 |
| 326 | 269 |
| 327 | 362 |
| 328 | 171 |
| 329 | 281 |
| 330 | 285 |
| 331 | 380 |
| 332 | 295 |
| 333 | 394 |
| 334 | 412 |
| 335 | 512 |
| 336 | 187 |
| 337 | 294 |
| 338 | 311 |
| 339 | 405 |
| 340 | 317 |
| 341 | 418 |
| 342 | 439 |
| 343 | 528 |
| 344 | 355 |
| 345 | 438 |
| 346 | 460 |
| 347 | 554 |
| 348 | 487 |
| 349 | 583 |
| 350 | 591 |
| 351 | 691 |

TABLE Z28-continued with a sequence length of 1024:

| Polarized channel sequence number | Reliability or reliability sequence number |
|---|---|
| 352 | 207 |
| 353 | 316 |
| 354 | 342 |
| 355 | 431 |
| 356 | 356 |
| 357 | 451 |
| 358 | 475 |
| 359 | 568 |
| 360 | 373 |
| 361 | 463 |
| 362 | 481 |
| 363 | 582 |
| 364 | 522 |
| 365 | 601 |
| 366 | 615 |
| 367 | 693 |
| 368 | 397 |
| 369 | 506 |
| 370 | 517 |
| 371 | 606 |
| 372 | 534 |
| 373 | 629 |
| 374 | 638 |
| 375 | 725 |
| 376 | 555 |
| 377 | 641 |
| 378 | 670 |
| 379 | 751 |
| 380 | 679 |
| 381 | 770 |
| 382 | 780 |
| 383 | 846 |
| 384 | 78 |
| 385 | 160 |
| 386 | 173 |
| 387 | 276 |
| 388 | 184 |
| 389 | 293 |
| 390 | 309 |
| 391 | 414 |
| 392 | 202 |
| 393 | 312 |
| 394 | 321 |
| 395 | 427 |
| 396 | 364 |
| 397 | 443 |
| 398 | 461 |
| 399 | 578 |
| 400 | 209 |
| 401 | 345 |
| 402 | 357 |
| 403 | 452 |
| 404 | 389 |
| 405 | 467 |
| 406 | 484 |
| 407 | 585 |
| 408 | 395 |
| 409 | 495 |
| 410 | 515 |
| 411 | 598 |
| 412 | 529 |
| 413 | 614 |
| 414 | 636 |
| 415 | 714 |
| 416 | 228 |
| 417 | 361 |
| 418 | 372 |
| 419 | 483 |
| 420 | 410 |
| 421 | 505 |
| 422 | 521 |
| 423 | 611 |
| 424 | 430 |
| 425 | 516 |
| 426 | 546 |

TABLE Z28-continued with a sequence length of 1024:

| Polarized channel sequence number | Reliability or reliability sequence number |
|---|---|
| 427 | 627 |
| 428 | 560 |
| 429 | 647 |
| 430 | 666 |
| 431 | 743 |
| 432 | 446 |
| 433 | 532 |
| 434 | 577 |
| 435 | 663 |
| 436 | 586 |
| 437 | 673 |
| 438 | 687 |
| 439 | 772 |
| 440 | 605 |
| 441 | 688 |
| 442 | 694 |
| 443 | 790 |
| 444 | 723 |
| 445 | 802 |
| 446 | 816 |
| 447 | 873 |
| 448 | 240 |
| 449 | 384 |
| 450 | 415 |
| 451 | 527 |
| 452 | 440 |
| 453 | 533 |
| 454 | 552 |
| 455 | 646 |
| 456 | 466 |
| 457 | 561 |
| 458 | 581 |
| 459 | 671 |
| 460 | 597 |
| 461 | 677 |
| 462 | 690 |
| 463 | 779 |
| 464 | 482 |
| 465 | 576 |
| 466 | 613 |
| 467 | 686 |
| 468 | 617 |
| 469 | 692 |
| 470 | 707 |
| 471 | 801 |
| 472 | 640 |
| 473 | 724 |
| 474 | 749 |
| 475 | 821 |
| 476 | 760 |
| 477 | 834 |
| 478 | 844 |
| 479 | 905 |
| 480 | 511 |
| 481 | 609 |
| 482 | 620 |
| 483 | 722 |
| 484 | 661 |
| 485 | 740 |
| 486 | 753 |
| 487 | 828 |
| 488 | 676 |
| 489 | 756 |
| 490 | 777 |
| 491 | 840 |
| 492 | 794 |
| 493 | 853 |
| 494 | 865 |
| 495 | 924 |
| 496 | 721 |
| 497 | 786 |
| 498 | 798 |
| 499 | 859 |
| 500 | 813 |
| 501 | 870 |

TABLE Z28-continued with a sequence length of 1024:

| Polarized channel sequence number | Reliability or reliability sequence number |
|---|---|
| 502 | 877 |
| 503 | 930 |
| 504 | 830 |
| 505 | 885 |
| 506 | 893 |
| 507 | 946 |
| 508 | 909 |
| 509 | 954 |
| 510 | 963 |
| 511 | 984 |
| 512 | 27 |
| 513 | 43 |
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |
| 526 | 224 |
| 527 | 330 |
| 528 | 67 |
| 529 | 150 |
| 530 | 158 |
| 531 | 219 |
| 532 | 166 |
| 533 | 263 |
| 534 | 271 |
| 535 | 354 |
| 536 | 188 |
| 537 | 272 |
| 538 | 290 |
| 539 | 381 |
| 540 | 304 |
| 541 | 398 |
| 542 | 413 |
| 543 | 525 |
| 544 | 69 |
| 545 | 163 |
| 546 | 178 |
| 547 | 267 |
| 548 | 190 |
| 549 | 289 |
| 550 | 299 |
| 551 | 392 |
| 552 | 200 |
| 553 | 308 |
| 554 | 318 |
| 555 | 416 |
| 556 | 332 |
| 557 | 435 |
| 558 | 449 |
| 559 | 536 |
| 560 | 210 |
| 561 | 325 |
| 562 | 341 |
| 563 | 442 |
| 564 | 359 |
| 565 | 462 |
| 566 | 473 |
| 567 | 564 |
| 568 | 367 |
| 569 | 469 |
| 570 | 490 |
| 571 | 588 |
| 572 | 493 |
| 573 | 600 |
| 574 | 616 |
| 575 | 745 |
| 576 | 107 |
| 577 | 189 |
| 578 | 196 |
| 579 | 303 |
| 580 | 206 |
| 581 | 319 |
| 582 | 331 |
| 583 | 429 |
| 584 | 229 |
| 585 | 343 |
| 586 | 351 |
| 587 | 457 |
| 588 | 369 |
| 589 | 477 |
| 590 | 488 |
| 591 | 572 |
| 592 | 245 |
| 593 | 353 |
| 594 | 375 |
| 595 | 471 |
| 596 | 391 |
| 597 | 492 |
| 598 | 497 |
| 599 | 594 |
| 600 | 404 |
| 601 | 498 |
| 602 | 504 |
| 603 | 618 |
| 604 | 545 |
| 605 | 631 |
| 606 | 656 |
| 607 | 752 |
| 608 | 260 |
| 609 | 390 |
| 610 | 400 |
| 611 | 503 |
| 612 | 421 |
| 613 | 520 |
| 614 | 524 |
| 615 | 624 |
| 616 | 437 |
| 617 | 544 |
| 618 | 557 |
| 619 | 645 |
| 620 | 580 |
| 621 | 664 |
| 622 | 674 |
| 623 | 773 |
| 624 | 456 |
| 625 | 566 |
| 626 | 587 |
| 627 | 675 |
| 628 | 607 |
| 629 | 685 |
| 630 | 709 |
| 631 | 787 |
| 632 | 635 |
| 633 | 712 |
| 634 | 730 |
| 635 | 803 |
| 636 | 741 |
| 637 | 819 |
| 638 | 836 |
| 639 | 903 |
| 640 | 110 |
| 641 | 203 |
| 642 | 221 |
| 643 | 340 |
| 644 | 243 |
| 645 | 352 |
| 646 | 371 |
| 647 | 480 |
| 648 | 255 |
| 649 | 378 |
| 650 | 393 |
| 651 | 499 |

TABLE Z28-continued with a sequence length of 1024:

| Polarized channel sequence number | Reliability or reliability sequence number |
|---|---|
| 652 | 408 |
| 653 | 508 |
| 654 | 513 |
| 655 | 621 |
| 656 | 280 |
| 657 | 401 |
| 658 | 420 |
| 659 | 514 |
| 660 | 436 |
| 661 | 541 |
| 662 | 553 |
| 663 | 642 |
| 664 | 455 |
| 665 | 562 |
| 666 | 579 |
| 667 | 669 |
| 668 | 595 |
| 669 | 681 |
| 670 | 700 |
| 671 | 774 |
| 672 | 300 |
| 673 | 428 |
| 674 | 448 |
| 675 | 556 |
| 676 | 474 |
| 677 | 575 |
| 678 | 573 |
| 679 | 682 |
| 680 | 485 |
| 681 | 590 |
| 682 | 599 |
| 683 | 696 |
| 684 | 625 |
| 685 | 710 |
| 686 | 718 |
| 687 | 805 |
| 688 | 507 |
| 689 | 608 |
| 690 | 633 |
| 691 | 715 |
| 692 | 643 |
| 693 | 735 |
| 694 | 742 |
| 695 | 822 |
| 696 | 659 |
| 697 | 750 |
| 698 | 764 |
| 699 | 841 |
| 700 | 789 |
| 701 | 855 |
| 702 | 871 |
| 703 | 925 |
| 704 | 315 |
| 705 | 459 |
| 706 | 476 |
| 707 | 592 |
| 708 | 496 |
| 709 | 604 |
| 710 | 626 |
| 711 | 713 |
| 712 | 539 |
| 713 | 634 |
| 714 | 650 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 812 |
| 733 | 878 |
| 734 | 888 |
| 735 | 933 |
| 736 | 563 |
| 737 | 689 |
| 738 | 698 |
| 739 | 775 |
| 740 | 719 |
| 741 | 791 |
| 742 | 800 |
| 743 | 867 |
| 744 | 731 |
| 745 | 810 |
| 746 | 823 |
| 747 | 884 |
| 748 | 837 |
| 749 | 894 |
| 750 | 907 |
| 751 | 949 |
| 752 | 766 |
| 753 | 825 |
| 754 | 842 |
| 755 | 897 |
| 756 | 857 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 379 |
| 772 | 278 |
| 773 | 399 |
| 774 | 417 |
| 775 | 530 |
| 776 | 286 |
| 777 | 423 |
| 778 | 441 |
| 779 | 543 |
| 780 | 458 |
| 781 | 559 |
| 782 | 584 |
| 783 | 701 |
| 784 | 310 |
| 785 | 450 |
| 786 | 479 |
| 787 | 571 |
| 788 | 491 |
| 789 | 603 |
| 790 | 596 |
| 791 | 706 |
| 792 | 501 |
| 793 | 612 |
| 794 | 628 |
| 795 | 728 |
| 796 | 648 |
| 797 | 736 |
| 798 | 747 |
| 799 | 829 |
| 800 | 360 |
| 801 | 486 |

TABLE Z28-continued with a sequence length of 1024:

| Polarized channel sequence number | Reliability or reliability sequence number |
|---|---|
| 802 | 502 |
| 803 | 602 |
| 804 | 538 |
| 805 | 623 |
| 806 | 637 |
| 807 | 739 |
| 808 | 542 |
| 809 | 649 |
| 810 | 655 |
| 811 | 748 |
| 812 | 665 |
| 813 | 759 |
| 814 | 769 |
| 815 | 848 |
| 816 | 548 |
| 817 | 662 |
| 818 | 678 |
| 819 | 768 |
| 820 | 703 |
| 821 | 782 |
| 822 | 795 |
| 823 | 861 |
| 824 | 716 |
| 825 | 807 |
| 826 | 811 |
| 827 | 879 |
| 828 | 824 |
| 829 | 889 |
| 830 | 900 |
| 831 | 944 |
| 832 | 368 |
| 833 | 537 |
| 834 | 540 |
| 835 | 644 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 875 |
| 848 | 632 |
| 849 | 702 |
| 850 | 720 |
| 851 | 796 |
| 852 | 732 |
| 853 | 817 |
| 854 | 826 |
| 855 | 886 |
| 856 | 761 |
| 857 | 827 |
| 858 | 843 |
| 859 | 898 |
| 860 | 858 |
| 861 | 910 |
| 862 | 915 |
| 863 | 960 |
| 864 | 654 |
| 865 | 734 |
| 866 | 754 |
| 867 | 818 |
| 868 | 767 |
| 869 | 839 |
| 870 | 850 |
| 871 | 902 |
| 872 | 785 |
| 873 | 854 |
| 874 | 863 |
| 875 | 914 |
| 876 | 874 |

TABLE Z28-continued with a sequence length of 1024:

| Polarized channel sequence number | Reliability or reliability sequence number |
|---|---|
| 877 | 922 |
| 878 | 932 |
| 879 | 969 |
| 880 | 799 |
| 881 | 869 |
| 882 | 881 |
| 883 | 928 |
| 884 | 892 |
| 885 | 935 |
| 886 | 943 |
| 887 | 976 |
| 888 | 904 |
| 889 | 947 |
| 890 | 953 |
| 891 | 981 |
| 892 | 958 |
| 893 | 989 |
| 894 | 991 |
| 895 | 1011 |
| 896 | 374 |
| 897 | 551 |
| 898 | 558 |
| 899 | 699 |
| 900 | 622 |
| 901 | 708 |
| 902 | 717 |
| 903 | 806 |
| 904 | 639 |
| 905 | 727 |
| 906 | 737 |
| 907 | 820 |
| 908 | 757 |
| 909 | 832 |
| 910 | 847 |
| 911 | 901 |
| 912 | 657 |
| 913 | 746 |
| 914 | 765 |
| 915 | 835 |
| 916 | 776 |
| 917 | 851 |
| 918 | 864 |
| 919 | 913 |
| 920 | 793 |
| 921 | 872 |
| 922 | 862 |
| 923 | 919 |
| 924 | 887 |
| 925 | 931 |
| 926 | 939 |
| 927 | 972 |
| 928 | 705 |
| 929 | 771 |
| 930 | 781 |
| 931 | 856 |
| 932 | 804 |
| 933 | 866 |
| 934 | 880 |
| 935 | 926 |
| 936 | 815 |
| 937 | 882 |
| 938 | 891 |
| 939 | 936 |
| 940 | 899 |
| 941 | 941 |
| 942 | 950 |
| 943 | 980 |
| 944 | 838 |
| 945 | 895 |
| 946 | 906 |
| 947 | 945 |
| 948 | 917 |
| 949 | 955 |
| 950 | 959 |
| 951 | 987 |

TABLE Z28-continued

| with a sequence length of 1024: | |
|---|---|
| Polarized channel sequence number | Reliability or reliability sequence number |
| 952 | 923 |
| 953 | 965 |
| 954 | 968 |
| 955 | 993 |
| 956 | 975 |
| 957 | 996 |
| 958 | 998 |
| 959 | 1008 |
| 960 | 733 |
| 961 | 784 |
| 962 | 814 |
| 963 | 883 |
| 964 | 831 |
| 965 | 890 |
| 966 | 896 |
| 967 | 942 |
| 968 | 845 |
| 969 | 908 |
| 970 | 912 |
| 971 | 952 |
| 972 | 920 |
| 973 | 956 |
| 974 | 967 |
| 975 | 990 |
| 976 | 849 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 876 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Eighth group of sequences (in comprehensive consideration of a criterion that a list 2 has optimal performance when a mother code length is 512 and a list 4 is optimal when a mother code length is 1024 in a case of existence of a PC bit)

Sequence Q29, with a sequence length of 1024

0, 1, 2, 4, 8, 16, 32, 3, 64, 5, 6, 9, 128, 256, 10, 17, 12, 18, 33, 20, 34, 65, 24, 36, 66, 7, 11, 512, 129, 40, 68, 257, 13, 19, 48, 130, 72, 14, 258, 21, 80, 260, 35, 513, 132, 22, 25, 264, 37, 136, 9 6, 272, 514, 38, 26, 67, 41, 144, 28, 288, 516, 69, 42, 49, 160, 520, 70, 528, 73, 544, 131, 44, 50, 32 0, 74, 81, 15, 52, 384, 133, 192, 134, 23, 76, 56, 82, 137, 27, 259, 97, 261, 39, 84, 138, 145, 29, 98, 2 62, 515, 265, 43, 88, 140, 146, 30, 161, 45, 576, 71, 100, 640, 266, 273, 51, 148, 268, 75, 517, 104, 162, 46, 274, 53, 193, 152, 768, 289, 276, 518, 77, 54, 83, 521, 57, 164, 112, 135, 78, 194, 290, 52 2, 280, 58, 321, 85, 168, 292, 139, 322, 99, 529, 524, 60, 86, 196, 296, 141, 89, 530, 263, 385, 324, 147, 545, 176, 101, 532, 31, 142, 304, 90, 328, 105, 386, 200, 149, 102, 47, 546, 208, 92, 267, 150, 163, 388, 106, 153, 336, 536, 577, 548, 55, 269, 165, 113, 154, 578, 79, 224, 519, 552, 275, 392, 641, 523, 270, 580, 352, 166, 400, 560, 108, 59, 169, 114, 195, 156, 116, 277, 531, 525, 642, 278, 87, 526, 197, 170, 291, 416, 584, 769, 281, 293, 91, 177, 120, 198, 61, 282, 201, 448, 294, 103, 64 4, 172, 592, 62, 178, 143, 770, 284, 323, 93, 202, 297, 648, 209, 151, 298, 107, 608, 180, 94, 533, 325, 210, 305, 547, 300, 326, 155, 534, 537, 109, 204, 184, 387, 306, 772, 271, 656, 329, 167, 11 5, 225, 330, 776, 157, 110, 549, 538, 212, 308, 389, 337, 332, 312, 171, 117, 550, 672, 226, 279, 5 79, 540, 118, 158, 216, 553, 390, 784, 338, 393, 173, 121, 704, 353, 340, 554, 581, 199, 394, 283, 179, 228, 561, 122, 174, 63, 181, 527, 582, 556, 232, 295, 203, 205, 285, 124, 182, 643, 562, 354, 585, 211, 401, 299, 185, 240, 206, 95, 586, 645, 593, 535, 344, 356, 402, 286, 564, 800, 417, 327, 301, 396, 307, 213, 568, 832, 588, 186, 646, 418, 360, 896, 594, 227, 309, 649, 771, 331, 539, 18 8, 111, 449, 302, 217, 214, 159, 404, 609, 596, 551, 650, 333, 408, 310, 368, 541, 773, 610, 657, 2 29, 119, 600, 339, 218, 313, 652, 230, 420, 175, 334, 542, 391, 450, 555, 774, 341, 233, 658, 612, 123, 777, 220, 183, 314, 395, 673, 583, 424, 355, 234, 125, 241, 557, 660, 616, 345, 342, 452, 77 8, 563, 397, 287, 207, 432, 316, 674, 558, 785, 357, 403, 236, 187, 664, 624, 587, 780, 705, 346, 3 98, 565, 361, 126, 242, 456, 405, 244, 569, 215, 595, 189, 566, 676, 358, 706, 589, 303, 786, 647, 362, 464, 419, 406, 680, 801, 348, 590, 248, 570, 788, 597, 572, 219, 409, 708, 598, 601, 651, 31 1, 792, 802, 611, 602, 421, 369, 688, 653, 190, 231, 480, 335, 654, 659, 410, 425, 370, 315, 221, 6 13, 422, 364, 235, 614, 543, 317, 451, 343, 412, 775, 222, 433, 453, 372, 237, 559, 833, 804, 712, 834, 661, 808, 779, 617, 604, 426, 720, 816, 836, 243, 897, 454, 662, 347, 376, 675, 618, 898, 78 1, 428, 457, 665, 736, 567, 840, 625, 318, 359, 245, 127, 787, 591, 678, 238, 677, 465, 434, 399, 6 66, 620, 458, 363, 349, 782, 407, 436, 626, 571, 246, 681, 350, 707, 249, 599, 668, 790, 460, 411, 682, 573, 365, 803, 789, 709, 440, 371, 628, 689, 481, 250, 423, 793, 466, 413, 366, 574, 468, 60 3, 191, 482, 655, 900, 805, 615, 684, 710, 427, 794, 373, 252, 605, 848, 690, 713, 632, 414, 806, 3 74, 904, 472, 377, 663, 692, 835, 619, 455, 429, 796, 809, 714, 721, 837, 716, 864, 810, 606, 912, 722, 696, 223, 484, 817, 435, 621, 812, 430, 319, 838, 667, 378, 459, 239, 437, 622, 627, 488, 46 1, 818, 380, 247, 669, 679, 724, 841, 629, 467, 438, 441, 737, 462, 351, 469, 367, 442, 251, 683, 8 42, 738, 899, 670, 783, 849, 820, 728, 928, 791, 470, 901, 630, 685, 844, 633, 711, 415, 691, 824, 902, 686, 740, 850, 496, 483, 444, 473, 375, 253, 905, 795, 254, 634, 744, 852, 960, 865, 693, 79 7, 906, 715, 807, 485, 636, 694, 431, 717, 575, 913, 798, 811, 474, 697, 379, 607, 486, 866, 723, 4 89, 908, 718, 813, 476, 856, 839, 725, 698, 914, 752, 868, 819, 814, 381, 929, 439, 623, 671, 739, 916, 490, 843, 463, 382, 930, 821, 726, 961, 872, 497, 631, 729, 700, 443, 741, 845, 920, 492, 82 2, 851, 730, 498, 880, 742, 471, 445, 635, 932, 687, 903, 825, 255, 846, 745, 826, 732, 500, 962, 9 36, 446, 853, 867, 637, 907, 475, 695, 746, 828, 753, 854, 857, 487, 799, 504, 964, 909, 719, 477, 915, 638, 748, 944, 869, 491, 699, 754, 858, 478, 968, 383, 910, 815, 976, 870, 917, 727, 493, 87 3, 701, 931, 756, 860, 499, 731, 823, 922, 874, 918, 494, 933, 743, 760, 881, 501, 702, 921, 447, 8 76, 847, 992, 502, 733, 827, 934, 882, 937, 963, 747, 505, 855, 924, 734, 829, 965, 938, 884, 506, 749, 945, 966, 755, 859, 940, 830, 911, 871, 639, 888, 479, 946, 750, 969, 508, 861, 757, 970, 91 9, 875, 862, 758, 948, 977, 923, 972, 761, 877, 952, 495, 703, 935, 978, 883, 762, 503, 925, 878, 7 35, 993, 885, 939, 994, 980, 926, 764, 941, 967, 886, 831, 947, 507, 889, 984, 751, 942, 996, 971, 890, 509, 949, 973, 1000, 892, 950, 863, 759, 1008, 510, 979, 953, 763, 974, 954, 879, 981, 982, 927, 995, 765, 956, 887, 985, 997, 986, 943, 891, 998, 766, 511, 988, 1001, 951, 1002, 893, 975, 894, 1009, 955, 1004, 1010, 957, 983, 958, 987, 1012, 999, 1016, 767, 989, 1003, 990, 1005, 95 9, 1011, 1013, 895, 1006, 1014, 1017, 1018, 991, 1020, 1007, 1015, 1019, 1021, 1022, 1023]

TABLE Q29 with a sequence length of 1024:

| Reliability or reliability sequence number | Polarized channel sequence number |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 64 |
| 9 | 5 |
| 10 | 6 |
| 11 | 9 |
| 12 | 128 |
| 13 | 256 |
| 14 | 10 |
| 15 | 17 |
| 16 | 12 |
| 17 | 18 |
| 18 | 33 |
| 19 | 20 |
| 20 | 34 |
| 21 | 65 |
| 22 | 24 |
| 23 | 36 |
| 24 | 66 |
| 25 | 7 |
| 26 | 11 |
| 27 | 512 |
| 28 | 129 |
| 29 | 40 |
| 30 | 68 |
| 31 | 257 |
| 33 | 19 |
| 34 | 48 |
| 35 | 130 |
| 36 | 72 |
| 37 | 14 |

TABLE Q29-continued with a sequence length of 1024:

| Reliability or reliability sequence number | Polarized channel sequence number |
|---|---|
| 38 | 258 |
| 39 | 21 |
| 40 | 80 |
| 41 | 260 |
| 42 | 35 |
| 43 | 513 |
| 44 | 132 |
| 45 | 22 |
| 46 | 25 |
| 47 | 264 |
| 48 | 37 |
| 49 | 136 |
| 50 | 96 |
| 51 | 272 |
| 52 | 514 |
| 53 | 38 |
| 54 | 26 |
| 55 | 67 |
| 56 | 41 |
| 57 | 144 |
| 58 | 28 |
| 59 | 288 |
| 60 | 516 |
| 61 | 69 |
| 62 | 42 |
| 63 | 49 |
| 64 | 160 |
| 65 | 520 |
| 66 | 70 |
| 67 | 528 |
| 68 | 73 |
| 69 | 544 |
| 70 | 131 |
| 71 | 44 |
| 72 | 50 |
| 73 | 320 |
| 74 | 74 |
| 75 | 81 |
| 76 | 15 |
| 77 | 52 |
| 78 | 384 |
| 79 | 133 |
| 80 | 192 |
| 81 | 134 |
| 82 | 23 |
| 83 | 76 |
| 84 | 56 |
| 85 | 82 |
| 86 | 137 |
| 87 | 27 |
| 88 | 259 |
| 89 | 97 |
| 90 | 261 |
| 91 | 39 |
| 92 | 84 |
| 93 | 138 |
| 94 | 145 |
| 95 | 29 |
| 96 | 98 |
| 97 | 262 |
| 98 | 515 |
| 99 | 265 |
| 100 | 43 |
| 101 | 88 |
| 102 | 140 |
| 103 | 146 |
| 104 | 30 |
| 105 | 161 |
| 106 | 45 |
| 107 | 576 |
| 108 | 71 |
| 109 | 100 |
| 110 | 640 |
| 111 | 266 |
| 112 | 273 |

TABLE Q29-continued

| with a sequence length of 1024: | |
|---|---|
| Reliability or reliability sequence number | Polarized channel sequence number |
| 113 | 51 |
| 114 | 148 |
| 115 | 268 |
| 116 | 75 |
| 117 | 517 |
| 118 | 104 |
| 119 | 162 |
| 120 | 46 |
| 121 | 274 |
| 122 | 53 |
| 123 | 193 |
| 124 | 152 |
| 125 | 768 |
| 126 | 289 |
| 127 | 276 |
| 128 | 518 |
| 129 | 77 |
| 130 | 54 |
| 131 | 83 |
| 132 | 521 |
| 133 | 57 |
| 134 | 164 |
| 135 | 112 |
| 136 | 135 |
| 137 | 78 |
| 138 | 194 |
| 139 | 290 |
| 140 | 522 |
| 141 | 280 |
| 142 | 58 |
| 143 | 321 |
| 144 | 85 |
| 145 | 168 |
| 146 | 292 |
| 147 | 139 |
| 148 | 322 |
| 149 | 99 |
| 150 | 529 |
| 151 | 524 |
| 152 | 60 |
| 153 | 86 |
| 154 | 196 |
| 155 | 296 |
| 156 | 141 |
| 157 | 89 |
| 158 | 530 |
| 159 | 263 |
| 161 | 324 |
| 162 | 147 |
| 163 | 545 |
| 164 | 176 |
| 165 | 101 |
| 166 | 532 |
| 167 | 31 |
| 168 | 142 |
| 169 | 304 |
| 170 | 90 |
| 171 | 328 |
| 172 | 105 |
| 173 | 386 |
| 174 | 200 |
| 175 | 149 |
| 176 | 102 |
| 177 | 47 |
| 178 | 546 |
| 179 | 208 |
| 180 | 92 |
| 181 | 267 |
| 182 | 150 |
| 183 | 163 |
| 184 | 388 |
| 185 | 106 |
| 186 | 153 |
| 187 | 336 |
| 188 | 536 |

TABLE Q29-continued

| with a sequence length of 1024: | |
|---|---|
| Reliability or reliability sequence number | Polarized channel sequence number |
| 189 | 577 |
| 190 | 548 |
| 191 | 55 |
| 192 | 269 |
| 193 | 165 |
| 194 | 113 |
| 195 | 154 |
| 196 | 578 |
| 197 | 79 |
| 198 | 224 |
| 199 | 519 |
| 200 | 552 |
| 201 | 275 |
| 202 | 392 |
| 203 | 641 |
| 204 | 523 |
| 205 | 270 |
| 206 | 580 |
| 207 | 352 |
| 208 | 166 |
| 209 | 400 |
| 210 | 560 |
| 211 | 108 |
| 212 | 59 |
| 213 | 169 |
| 214 | 114 |
| 215 | 195 |
| 216 | 156 |
| 217 | 116 |
| 218 | 277 |
| 219 | 531 |
| 220 | 525 |
| 221 | 642 |
| 222 | 278 |
| 223 | 87 |
| 224 | 526 |
| 225 | 197 |
| 226 | 170 |
| 227 | 291 |
| 228 | 416 |
| 229 | 584 |
| 230 | 769 |
| 231 | 281 |
| 232 | 293 |
| 233 | 91 |
| 234 | 177 |
| 235 | 120 |
| 236 | 198 |
| 237 | 61 |
| 238 | 282 |
| 239 | 201 |
| 240 | 448 |
| 241 | 294 |
| 242 | 103 |
| 243 | 644 |
| 244 | 172 |
| 245 | 592 |
| 246 | 62 |
| 247 | 178 |
| 248 | 143 |
| 249 | 770 |
| 250 | 284 |
| 251 | 323 |
| 252 | 93 |
| 253 | 202 |
| 254 | 297 |
| 255 | 648 |
| 256 | 209 |
| 257 | 151 |
| 258 | 298 |
| 259 | 107 |
| 260 | 608 |
| 261 | 180 |
| 262 | 94 |
| 263 | 533 |

TABLE Q29-continued

| with a sequence length of 1024: | |
|---|---|
| Reliability or reliability sequence number | Polarized channel sequence number |
| 264 | 325 |
| 265 | 210 |
| 266 | 305 |
| 267 | 547 |
| 268 | 300 |
| 269 | 326 |
| 270 | 155 |
| 271 | 534 |
| 272 | 537 |
| 273 | 109 |
| 274 | 204 |
| 275 | 184 |
| 276 | 387 |
| 277 | 306 |
| 278 | 772 |
| 279 | 271 |
| 280 | 656 |
| 281 | 329 |
| 282 | 167 |
| 283 | 115 |
| 284 | 225 |
| 285 | 330 |
| 286 | 776 |
| 287 | 157 |
| 289 | 549 |
| 290 | 538 |
| 291 | 212 |
| 292 | 308 |
| 293 | 389 |
| 294 | 337 |
| 295 | 332 |
| 296 | 312 |
| 297 | 171 |
| 298 | 117 |
| 299 | 550 |
| 300 | 672 |
| 301 | 226 |
| 302 | 279 |
| 303 | 579 |
| 304 | 540 |
| 305 | 118 |
| 306 | 158 |
| 307 | 216 |
| 308 | 553 |
| 309 | 390 |
| 310 | 784 |
| 311 | 338 |
| 312 | 393 |
| 313 | 173 |
| 314 | 121 |
| 315 | 704 |
| 316 | 353 |
| 317 | 340 |
| 318 | 554 |
| 319 | 581 |
| 320 | 199 |
| 321 | 394 |
| 322 | 283 |
| 323 | 179 |
| 324 | 228 |
| 325 | 561 |
| 326 | 122 |
| 327 | 174 |
| 328 | 63 |
| 329 | 181 |
| 330 | 527 |
| 331 | 582 |
| 332 | 556 |
| 333 | 232 |
| 334 | 295 |
| 335 | 203 |
| 336 | 205 |
| 337 | 285 |
| 338 | 124 |
| 339 | 182 |

TABLE Q29-continued

| with a sequence length of 1024: | |
|---|---|
| Reliability or reliability sequence number | Polarized channel sequence number |
| 340 | 643 |
| 341 | 562 |
| 342 | 354 |
| 343 | 585 |
| 344 | 211 |
| 345 | 401 |
| 346 | 299 |
| 347 | 185 |
| 348 | 240 |
| 349 | 206 |
| 350 | 95 |
| 351 | 586 |
| 352 | 645 |
| 353 | 593 |
| 354 | 535 |
| 355 | 344 |
| 356 | 356 |
| 357 | 402 |
| 358 | 286 |
| 359 | 564 |
| 360 | 800 |
| 361 | 417 |
| 362 | 327 |
| 363 | 301 |
| 364 | 396 |
| 365 | 307 |
| 366 | 213 |
| 367 | 568 |
| 368 | 832 |
| 369 | 588 |
| 370 | 186 |
| 371 | 646 |
| 372 | 418 |
| 373 | 360 |
| 374 | 896 |
| 375 | 594 |
| 376 | 227 |
| 377 | 309 |
| 378 | 649 |
| 379 | 771 |
| 380 | 331 |
| 381 | 539 |
| 382 | 188 |
| 383 | 111 |
| 384 | 449 |
| 385 | 302 |
| 386 | 217 |
| 387 | 214 |
| 388 | 159 |
| 389 | 404 |
| 390 | 609 |
| 391 | 596 |
| 392 | 551 |
| 393 | 650 |
| 394 | 333 |
| 395 | 408 |
| 396 | 310 |
| 397 | 368 |
| 398 | 541 |
| 399 | 773 |
| 400 | 610 |
| 401 | 657 |
| 402 | 229 |
| 403 | 119 |
| 404 | 600 |
| 405 | 339 |
| 406 | 218 |
| 407 | 313 |
| 408 | 652 |
| 409 | 230 |
| 410 | 420 |
| 411 | 175 |
| 412 | 334 |
| 413 | 542 |
| 414 | 391 |

TABLE Q29-continued

| with a sequence length of 1024: | |
|---|---|
| Reliability or reliability sequence number | Polarized channel sequence number |
| 415 | 450 |
| 417 | 774 |
| 418 | 341 |
| 419 | 233 |
| 420 | 658 |
| 421 | 612 |
| 422 | 123 |
| 423 | 777 |
| 424 | 220 |
| 425 | 183 |
| 426 | 314 |
| 427 | 395 |
| 428 | 673 |
| 429 | 583 |
| 430 | 424 |
| 431 | 355 |
| 432 | 234 |
| 433 | 125 |
| 434 | 241 |
| 435 | 557 |
| 436 | 660 |
| 437 | 616 |
| 438 | 345 |
| 439 | 342 |
| 440 | 452 |
| 441 | 778 |
| 442 | 563 |
| 443 | 397 |
| 444 | 287 |
| 445 | 207 |
| 446 | 432 |
| 447 | 316 |
| 448 | 674 |
| 449 | 558 |
| 450 | 785 |
| 451 | 357 |
| 452 | 403 |
| 453 | 236 |
| 454 | 187 |
| 455 | 664 |
| 456 | 624 |
| 457 | 587 |
| 458 | 780 |
| 459 | 705 |
| 460 | 346 |
| 461 | 398 |
| 462 | 565 |
| 463 | 361 |
| 464 | 126 |
| 465 | 242 |
| 466 | 456 |
| 467 | 405 |
| 468 | 244 |
| 469 | 569 |
| 470 | 215 |
| 471 | 595 |
| 472 | 189 |
| 473 | 566 |
| 474 | 676 |
| 475 | 358 |
| 476 | 706 |
| 477 | 589 |
| 478 | 303 |
| 479 | 786 |
| 480 | 647 |
| 481 | 362 |
| 482 | 464 |
| 483 | 419 |
| 484 | 406 |
| 485 | 680 |
| 486 | 801 |
| 487 | 348 |
| 488 | 590 |
| 489 | 248 |
| 490 | 570 |

TABLE Q29-continued

| with a sequence length of 1024: | |
|---|---|
| Reliability or reliability sequence number | Polarized channel sequence number |
| 491 | 788 |
| 492 | 597 |
| 493 | 572 |
| 494 | 219 |
| 495 | 409 |
| 496 | 708 |
| 497 | 598 |
| 498 | 601 |
| 499 | 651 |
| 500 | 311 |
| 501 | 792 |
| 502 | 802 |
| 503 | 611 |
| 504 | 602 |
| 505 | 421 |
| 506 | 369 |
| 507 | 688 |
| 508 | 653 |
| 509 | 190 |
| 510 | 231 |
| 511 | 480 |
| 512 | 335 |
| 513 | 654 |
| 514 | 659 |
| 515 | 410 |
| 516 | 425 |
| 517 | 370 |
| 518 | 315 |
| 519 | 221 |
| 520 | 613 |
| 521 | 422 |
| 522 | 364 |
| 523 | 235 |
| 524 | 614 |
| 525 | 543 |
| 526 | 317 |
| 527 | 451 |
| 528 | 343 |
| 529 | 412 |
| 530 | 775 |
| 531 | 222 |
| 532 | 433 |
| 533 | 453 |
| 534 | 372 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 545 | 604 |
| 546 | 426 |
| 547 | 720 |
| 548 | 816 |
| 549 | 836 |
| 550 | 243 |
| 551 | 897 |
| 552 | 454 |
| 553 | 662 |
| 554 | 347 |
| 555 | 376 |
| 556 | 675 |
| 557 | 618 |
| 558 | 898 |
| 559 | 781 |
| 560 | 428 |
| 561 | 457 |
| 562 | 665 |
| 563 | 736 |
| 564 | 567 |
| 565 | 840 |
| 566 | 625 |

TABLE Q29-continued with a sequence length of 1024:

| Reliability or reliability sequence number | Polarized channel sequence number |
|---|---|
| 567 | 318 |
| 568 | 359 |
| 569 | 245 |
| 570 | 127 |
| 571 | 787 |
| 572 | 591 |
| 573 | 678 |
| 574 | 238 |
| 575 | 677 |
| 576 | 465 |
| 577 | 434 |
| 578 | 399 |
| 579 | 666 |
| 580 | 620 |
| 581 | 458 |
| 582 | 363 |
| 583 | 349 |
| 584 | 782 |
| 585 | 407 |
| 586 | 436 |
| 587 | 626 |
| 588 | 571 |
| 589 | 246 |
| 590 | 681 |
| 591 | 350 |
| 592 | 707 |
| 593 | 249 |
| 594 | 599 |
| 595 | 668 |
| 596 | 790 |
| 597 | 460 |
| 598 | 411 |
| 599 | 682 |
| 600 | 573 |
| 601 | 365 |
| 602 | 803 |
| 603 | 789 |
| 604 | 709 |
| 605 | 440 |
| 606 | 371 |
| 607 | 628 |
| 608 | 689 |
| 609 | 481 |
| 610 | 250 |
| 611 | 423 |
| 612 | 793 |
| 613 | 466 |
| 614 | 413 |
| 615 | 366 |
| 616 | 574 |
| 617 | 468 |
| 618 | 603 |
| 619 | 191 |
| 620 | 482 |
| 621 | 655 |
| 622 | 900 |
| 623 | 805 |
| 624 | 615 |
| 625 | 684 |
| 626 | 710 |
| 627 | 427 |
| 628 | 794 |
| 629 | 373 |
| 630 | 252 |
| 631 | 605 |
| 632 | 848 |
| 633 | 690 |
| 634 | 713 |
| 635 | 632 |
| 636 | 414 |
| 637 | 806 |
| 638 | 374 |
| 639 | 904 |
| 640 | 472 |
| 641 | 377 |

TABLE Q29-continued with a sequence length of 1024:

| Reliability or reliability sequence number | Polarized channel sequence number |
|---|---|
| 642 | 663 |
| 643 | 692 |
| 644 | 835 |
| 645 | 619 |
| 646 | 455 |
| 647 | 429 |
| 648 | 796 |
| 649 | 809 |
| 650 | 714 |
| 651 | 721 |
| 652 | 837 |
| 653 | 716 |
| 654 | 864 |
| 655 | 810 |
| 656 | 606 |
| 657 | 912 |
| 658 | 722 |
| 659 | 696 |
| 660 | 223 |
| 661 | 484 |
| 662 | 817 |
| 663 | 435 |
| 664 | 621 |
| 665 | 812 |
| 666 | 430 |
| 667 | 319 |
| 668 | 838 |
| 669 | 667 |
| 670 | 378 |
| 671 | 459 |
| 672 | 239 |
| 673 | 437 |
| 674 | 622 |
| 675 | 627 |
| 676 | 488 |
| 677 | 461 |
| 678 | 818 |
| 679 | 380 |
| 680 | 247 |
| 681 | 669 |
| 682 | 679 |
| 683 | 724 |
| 684 | 841 |
| 685 | 629 |
| 686 | 467 |
| 687 | 438 |
| 688 | 441 |
| 689 | 737 |
| 690 | 462 |
| 691 | 351 |
| 692 | 469 |
| 693 | 367 |
| 694 | 442 |
| 695 | 251 |
| 696 | 683 |
| 697 | 842 |
| 698 | 738 |
| 699 | 899 |
| 700 | 670 |
| 701 | 783 |
| 702 | 849 |
| 703 | 820 |
| 704 | 728 |
| 705 | 928 |
| 706 | 791 |
| 707 | 470 |
| 708 | 901 |
| 709 | 630 |
| 710 | 685 |
| 711 | 844 |
| 712 | 633 |
| 713 | 711 |
| 714 | 415 |
| 715 | 691 |
| 716 | 824 |

TABLE Q29-continued

| with a sequence length of 1024: | |
|---|---|
| Reliability or reliability sequence number | Polarized channel sequence number |
| 717 | 902 |
| 718 | 686 |
| 719 | 740 |
| 720 | 850 |
| 721 | 496 |
| 722 | 483 |
| 723 | 444 |
| 724 | 473 |
| 725 | 375 |
| 726 | 253 |
| 727 | 905 |
| 728 | 795 |
| 729 | 254 |
| 730 | 634 |
| 731 | 744 |
| 732 | 852 |
| 733 | 960 |
| 734 | 865 |
| 735 | 693 |
| 736 | 797 |
| 737 | 906 |
| 738 | 715 |
| 739 | 807 |
| 740 | 485 |
| 741 | 636 |
| 742 | 694 |
| 743 | 431 |
| 744 | 717 |
| 745 | 575 |
| 746 | 913 |
| 747 | 798 |
| 748 | 811 |
| 749 | 474 |
| 750 | 697 |
| 751 | 379 |
| 752 | 607 |
| 753 | 486 |
| 754 | 866 |
| 755 | 723 |
| 756 | 489 |
| 757 | 908 |
| 758 | 718 |
| 759 | 813 |
| 760 | 476 |
| 761 | 856 |
| 762 | 839 |
| 763 | 725 |
| 764 | 698 |
| 765 | 914 |
| 766 | 752 |
| 767 | 868 |
| 768 | 819 |
| 769 | 814 |
| 770 | 381 |
| 771 | 929 |
| 772 | 439 |
| 773 | 623 |
| 774 | 671 |
| 775 | 739 |
| 776 | 916 |
| 777 | 490 |
| 778 | 843 |
| 779 | 463 |
| 780 | 382 |
| 781 | 930 |
| 782 | 821 |
| 783 | 726 |
| 784 | 961 |
| 785 | 872 |
| 786 | 497 |
| 787 | 631 |
| 788 | 729 |
| 789 | 700 |
| 790 | 443 |
| 791 | 741 |

TABLE Q29-continued

| with a sequence length of 1024: | |
|---|---|
| Reliability or reliability sequence number | Polarized channel sequence number |
| 792 | 845 |
| 793 | 920 |
| 794 | 492 |
| 795 | 822 |
| 796 | 851 |
| 797 | 730 |
| 798 | 498 |
| 799 | 880 |
| 801 | 471 |
| 802 | 445 |
| 803 | 635 |
| 804 | 932 |
| 805 | 687 |
| 806 | 903 |
| 807 | 825 |
| 808 | 255 |
| 809 | 846 |
| 810 | 745 |
| 811 | 826 |
| 812 | 732 |
| 813 | 500 |
| 814 | 962 |
| 815 | 936 |
| 816 | 446 |
| 817 | 853 |
| 818 | 867 |
| 819 | 637 |
| 820 | 907 |
| 821 | 475 |
| 822 | 695 |
| 823 | 746 |
| 824 | 828 |
| 825 | 753 |
| 826 | 854 |
| 827 | 857 |
| 828 | 487 |
| 829 | 799 |
| 830 | 504 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 494 |
| 866 | 933 |
| 867 | 743 |

TABLE Q29-continued

| with a sequence length of 1024: | |
|---|---|
| Reliability or reliability sequence number | Polarized channel sequence number |
| 868 | 760 |
| 869 | 881 |
| 870 | 501 |
| 871 | 702 |
| 872 | 921 |
| 873 | 447 |
| 874 | 876 |
| 875 | 847 |
| 876 | 992 |
| 877 | 502 |
| 878 | 733 |
| 879 | 827 |
| 880 | 934 |
| 881 | 882 |
| 882 | 937 |
| 883 | 963 |
| 884 | 747 |
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |

TABLE Q29-continued

| with a sequence length of 1024: | |
|---|---|
| Reliability or reliability sequence number | Polarized channel sequence number |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |

TABLE Q29-continued

| with a sequence length of 1024: | |
|---|---|
| Reliability or reliability sequence number | Polarized channel sequence number |
| 1019 | 1015 |
| 1020 | 1019 |
| 1021 | 1021 |
| 1022 | 1022 |
| 1023 | 1023 |

Sequence Z29, with a sequence length of 1024:

0, 1, 2, 7, 3, 9, 10, 25, 4, 11, 14, 26, 16, 32, 37, 76, 5, 15, 17, 33, 19, 39, 45, 82, 22, 46, 54, 87, 58, 95, 104, 167, 6, 18, 20, 42, 23, 48, 53, 91, 29, 56, 62, 100, 71, 106, 120, 177, 34, 63, 72, 113, 77, 122, 130, 191, 84, 133, 142, 212, 152, 237, 246, 328, 8, 21, 24, 55, 30, 61, 66, 108, 36, 68, 74, 1 16, 83, 129, 137, 197, 40, 75, 85, 131, 92, 144, 153, 223, 101, 157, 170, 233, 180, 252, 262, 350, 5 0, 89, 96, 149, 109, 165, 176, 242, 118, 172, 185, 259, 211, 273, 288, 383, 135, 194, 214, 283, 217, 298, 305, 403, 235, 314, 326, 422, 338, 433, 464, 570, 12, 28, 35, 70, 44, 79, 81, 136, 49, 86, 93, 1 47, 102, 156, 168, 248, 57, 94, 103, 162, 114, 175, 182, 257, 124, 186, 195, 270, 216, 287, 306, 38 8, 64, 105, 119, 183, 134, 193, 208, 282, 145, 213, 226, 297, 244, 313, 327, 411, 164, 234, 247, 32 3, 261, 329, 339, 425, 275, 347, 370, 454, 382, 472, 509, 619, 80, 123, 138, 215, 154, 225, 236, 32 0, 174, 239, 253, 335, 274, 336, 349, 445, 179, 256, 265, 344, 291, 366, 387, 470, 307, 386, 406, 4 94, 424, 519, 531, 660, 198, 284, 301, 376, 324, 402, 409, 510, 333, 419, 432, 523, 453, 535, 574, 672, 348, 434, 465, 550, 468, 569, 589, 680, 489, 593, 610, 695, 630, 726, 729, 808, 13, 31, 38, 88, 41, 90, 97, 159, 47, 99, 111, 181, 115, 192, 205, 279, 51, 112, 121, 201, 127, 218, 222, 302, 141, 2 31, 238, 322, 250, 337, 358, 444, 59, 126, 139, 227, 146, 232, 241, 334, 155, 254, 258, 346, 268, 3 63, 385, 478, 169, 266, 277, 365, 292, 377, 396, 500, 296, 407, 426, 518, 447, 526, 567, 667, 73, 1 43, 148, 251, 161, 264, 269, 362, 171, 281, 285, 380, 295, 394, 412, 512, 187, 294, 311, 405, 317, 418, 439, 528, 355, 438, 460, 554, 487, 583, 591, 691, 207, 316, 342, 431, 356, 451, 475, 568, 37 3, 463, 481, 582, 522, 601, 615, 693, 397, 506, 517, 606, 534, 629, 638, 725, 555, 641, 670, 751, 6 79, 770, 780, 846, 78, 160, 173, 276, 184, 293, 309, 414, 202, 312, 321, 427, 364, 443, 461, 578, 2 09, 345, 357, 452, 389, 467, 484, 585, 395, 495, 515, 598, 529, 614, 636, 714, 228, 361, 372, 483, 410, 505, 521, 611, 430, 516, 546, 627, 560, 647, 666, 743, 446, 532, 577, 663, 586, 673, 687, 77 2, 605, 688, 694, 790, 723, 802, 816, 873, 240, 384, 415, 527, 440, 533, 552, 646, 466, 561, 581, 6 71, 597, 677, 690, 779, 482, 576, 613, 686, 617, 692, 707, 801, 640, 724, 749, 821, 760, 834, 844, 905, 511, 609, 620, 722, 661, 740, 753, 828, 676, 756, 777, 840, 794, 853, 865, 924, 721, 786, 79 8, 859, 813, 870, 877, 930, 830, 885, 893, 946, 909, 954, 963, 984, 27, 43, 52, 98, 60, 117, 128, 19 9, 65, 132, 140, 204, 151, 220, 224, 330, 67, 150, 158, 219, 166, 263, 271, 354, 188, 272, 290, 381, 304, 398, 413, 525, 69, 163, 178, 267, 190, 289, 299, 392, 200, 308, 318, 416, 332, 435, 449, 536, 210, 325, 341, 442, 359, 462, 473, 564, 367, 469, 490, 588, 493, 600, 616, 745, 107, 189, 196, 30 3, 206, 319, 331, 429, 229, 343, 351, 457, 369, 477, 488, 572, 245, 353, 375, 471, 391, 492, 497, 5 94, 404, 498, 504, 618, 545, 631, 656, 752, 260, 390, 400, 503, 421, 520, 524, 624, 437, 544, 557, 645, 580, 664, 674, 773, 456, 566, 587, 675, 607, 685, 709, 787, 635, 712, 730, 803, 741, 819, 83 6, 903, 110, 203, 221, 340, 243, 352, 371, 480, 255, 378, 393, 499, 408, 508, 513, 621, 280, 401, 4 20, 514, 436, 541, 553, 642, 455, 562, 579, 669, 595, 681, 700, 774, 300, 428, 448, 556, 474, 575, 573, 682, 485, 590, 599, 696, 625, 710, 718, 805, 507, 608, 633, 715, 643, 735, 742, 822, 659, 75 0, 764, 841, 789, 855, 871, 925, 315, 459, 476, 592, 496, 604, 626, 713, 539, 634, 650, 738, 653, 7 44, 758, 833, 547, 651, 658, 755, 683, 763, 783, 852, 704, 788, 797, 860, 812, 878, 888, 933, 563, 689, 698, 775, 719, 791, 800, 867, 731, 810, 823, 884, 837, 894, 907, 949, 766, 825, 842, 897, 85 7, 911, 916, 961, 868, 921, 929, 966, 940, 974, 983, 1003, 125, 230, 249, 379, 278, 399, 417, 530, 286, 423, 441, 543, 458, 559, 584, 701, 310, 450, 479, 571, 491, 603, 596, 706, 501, 612, 628, 72 8, 648, 736, 747, 829, 360, 486, 502, 602, 538, 623, 637, 739, 542, 649, 655, 748, 665, 759, 769, 8 48, 548, 662, 678, 768, 703, 782, 795, 861, 716, 807, 811, 879, 824, 889, 900, 944, 368, 537, 540, 644, 549, 652, 668, 762, 565, 684, 697, 778, 711, 792, 809, 875, 632, 702, 720, 796, 732, 817, 82 6, 886, 761, 827, 843, 898, 858, 910, 915, 960, 654, 734, 754, 818, 767, 839, 850, 902, 785, 854, 8 63, 914, 874, 922, 932, 969, 799, 869, 881, 928, 892, 935, 943, 976, 904, 947, 953, 981, 958, 989, 991, 1011, 374, 551, 558, 699, 622, 708, 717, 806, 639, 727, 737, 820, 757, 832, 847, 901, 657, 7 46, 765, 835, 776, 851, 864, 913, 793, 872, 862, 919, 887, 931, 939, 972, 705, 771, 781, 856, 804, 866, 880, 926, 815, 882, 891, 936, 899, 941, 950, 980, 838, 895, 906, 945, 917, 955, 959, 987, 92 3, 965, 968, 993, 975, 996, 998, 1008, 733, 784, 814, 883, 831, 890, 896, 942, 845, 908, 912, 952, 920, 956, 967, 990, 849, 918, 927, 964, 938, 970, 971, 997, 948, 977, 979, 999, 985, 1004, 1006, 1016, 876, 934, 937, 973, 951, 978, 982, 1001, 957, 986, 988, 1005, 994, 1007, 1012, 1018, 962, 992, 995, 1009, 1000, 1010, 1013, 1019, 1002, 1014, 1015, 1020, 1017, 1021, 1022, 1023

TABLE Z29

| with a sequence length of 1024: | |
|---|---|
| Polarized channel sequence number | Reliability or reliability sequence number |
| 0 | 0 |
| 1 | 1 |
| 2 | 2 |
| 3 | 7 |
| 4 | 3 |
| 5 | 9 |
| 6 | 10 |
| 7 | 25 |
| 8 | 4 |
| 9 | 11 |
| 10 | 14 |
| 11 | 26 |
| 12 | 16 |
| 13 | 32 |
| 14 | 37 |
| 15 | 76 |
| 16 | 5 |
| 17 | 15 |
| 18 | 17 |
| 19 | 33 |
| 20 | 19 |
| 21 | 39 |
| 22 | 45 |
| 23 | 82 |
| 24 | 22 |
| 25 | 46 |

TABLE Z29-continued with a sequence length of 1024:

| Polarized channel sequence number | Reliability or reliability sequence number |
|---|---|
| 26 | 54 |
| 27 | 87 |
| 28 | 58 |
| 29 | 95 |
| 30 | 104 |
| 31 | 167 |
| 32 | 6 |
| 33 | 18 |
| 34 | 20 |
| 35 | 42 |
| 36 | 23 |
| 37 | 48 |
| 38 | 53 |
| 39 | 91 |
| 40 | 29 |
| 41 | 56 |
| 42 | 62 |
| 43 | 100 |
| 44 | 71 |
| 45 | 106 |
| 46 | 120 |
| 47 | 177 |
| 48 | 34 |
| 49 | 63 |
| 50 | 72 |
| 51 | 113 |
| 52 | 77 |
| 53 | 122 |
| 54 | 130 |
| 55 | 191 |
| 56 | 84 |
| 57 | 133 |
| 58 | 142 |
| 59 | 212 |
| 60 | 152 |
| 61 | 237 |
| 62 | 246 |
| 63 | 328 |
| 64 | 8 |
| 65 | 21 |
| 66 | 24 |
| 67 | 55 |
| 68 | 30 |
| 69 | 61 |
| 70 | 66 |
| 71 | 108 |
| 72 | 36 |
| 73 | 68 |
| 74 | 74 |
| 75 | 116 |
| 76 | 83 |
| 77 | 129 |
| 78 | 137 |
| 79 | 197 |
| 80 | 40 |
| 81 | 75 |
| 82 | 85 |
| 83 | 131 |
| 84 | 92 |
| 85 | 144 |
| 86 | 153 |
| 87 | 223 |
| 88 | 101 |
| 89 | 157 |
| 90 | 170 |
| 91 | 233 |
| 92 | 180 |
| 93 | 252 |
| 94 | 262 |
| 95 | 350 |
| 96 | 50 |
| 97 | 89 |
| 98 | 96 |
| 99 | 149 |
| 100 | 109 |

TABLE Z29-continued with a sequence length of 1024:

| Polarized channel sequence number | Reliability or reliability sequence number |
|---|---|
| 101 | 165 |
| 102 | 176 |
| 103 | 242 |
| 104 | 118 |
| 105 | 172 |
| 106 | 185 |
| 107 | 259 |
| 108 | 211 |
| 109 | 273 |
| 110 | 288 |
| 111 | 383 |
| 112 | 135 |
| 113 | 194 |
| 114 | 214 |
| 115 | 283 |
| 116 | 217 |
| 117 | 298 |
| 118 | 305 |
| 119 | 403 |
| 120 | 235 |
| 121 | 314 |
| 122 | 326 |
| 123 | 422 |
| 124 | 338 |
| 125 | 433 |
| 126 | 464 |
| 127 | 570 |
| 128 | 12 |
| 129 | 28 |
| 130 | 35 |
| 131 | 70 |
| 132 | 44 |
| 133 | 79 |
| 134 | 81 |
| 135 | 136 |
| 136 | 49 |
| 137 | 86 |
| 138 | 93 |
| 139 | 147 |
| 140 | 102 |
| 141 | 156 |
| 142 | 168 |
| 143 | 248 |
| 144 | 57 |
| 145 | 94 |
| 146 | 103 |
| 147 | 162 |
| 148 | 114 |
| 149 | 175 |
| 150 | 182 |
| 151 | 257 |
| 152 | 124 |
| 153 | 186 |
| 154 | 195 |
| 155 | 270 |
| 156 | 216 |
| 157 | 287 |
| 158 | 306 |
| 159 | 388 |
| 160 | 64 |
| 161 | 105 |
| 162 | 119 |
| 163 | 183 |
| 164 | 134 |
| 165 | 193 |
| 166 | 208 |
| 167 | 282 |
| 168 | 145 |
| 169 | 213 |
| 170 | 226 |
| 171 | 297 |
| 172 | 244 |
| 173 | 313 |
| 174 | 327 |
| 175 | 411 |

TABLE Z29-continued with a sequence length of 1024:

| Polarized channel sequence number | Reliability or reliability sequence number |
|---|---|
| 176 | 164 |
| 177 | 234 |
| 178 | 247 |
| 179 | 323 |
| 180 | 261 |
| 181 | 329 |
| 182 | 339 |
| 183 | 425 |
| 184 | 275 |
| 185 | 347 |
| 186 | 370 |
| 187 | 454 |
| 188 | 382 |
| 189 | 472 |
| 190 | 509 |
| 191 | 619 |
| 192 | 80 |
| 193 | 123 |
| 194 | 138 |
| 195 | 215 |
| 196 | 154 |
| 197 | 225 |
| 198 | 236 |
| 199 | 320 |
| 200 | 174 |
| 201 | 239 |
| 202 | 253 |
| 203 | 335 |
| 204 | 274 |
| 205 | 336 |
| 206 | 349 |
| 207 | 445 |
| 208 | 179 |
| 209 | 256 |
| 210 | 265 |
| 211 | 344 |
| 212 | 291 |
| 213 | 366 |
| 214 | 387 |
| 215 | 470 |
| 216 | 307 |
| 217 | 386 |
| 218 | 406 |
| 219 | 494 |
| 220 | 424 |
| 221 | 519 |
| 222 | 531 |
| 223 | 660 |
| 224 | 198 |
| 225 | 284 |
| 226 | 301 |
| 227 | 376 |
| 228 | 324 |
| 229 | 402 |
| 230 | 409 |
| 231 | 510 |
| 232 | 333 |
| 233 | 419 |
| 234 | 432 |
| 235 | 523 |
| 236 | 453 |
| 237 | 535 |
| 238 | 574 |
| 239 | 672 |
| 240 | 348 |
| 241 | 434 |
| 242 | 465 |
| 243 | 550 |
| 244 | 468 |
| 245 | 569 |
| 246 | 589 |
| 247 | 680 |
| 248 | 489 |
| 249 | 593 |
| 250 | 610 |

TABLE Z29-continued with a sequence length of 1024:

| Polarized channel sequence number | Reliability or reliability sequence number |
|---|---|
| 251 | 695 |
| 252 | 630 |
| 253 | 726 |
| 254 | 729 |
| 255 | 808 |
| 256 | 13 |
| 257 | 31 |
| 258 | 38 |
| 259 | 88 |
| 260 | 41 |
| 261 | 90 |
| 262 | 97 |
| 263 | 159 |
| 264 | 47 |
| 265 | 99 |
| 266 | 111 |
| 267 | 181 |
| 268 | 115 |
| 269 | 192 |
| 270 | 205 |
| 271 | 279 |
| 272 | 51 |
| 273 | 112 |
| 274 | 121 |
| 275 | 201 |
| 276 | 127 |
| 277 | 218 |
| 278 | 222 |
| 279 | 302 |
| 280 | 141 |
| 281 | 231 |
| 282 | 238 |
| 283 | 322 |
| 284 | 250 |
| 285 | 337 |
| 286 | 358 |
| 287 | 444 |
| 288 | 59 |
| 289 | 126 |
| 290 | 139 |
| 291 | 227 |
| 292 | 146 |
| 293 | 232 |
| 294 | 241 |
| 295 | 334 |
| 296 | 155 |
| 297 | 254 |
| 298 | 258 |
| 299 | 346 |
| 300 | 268 |
| 301 | 363 |
| 302 | 385 |
| 303 | 478 |
| 304 | 169 |
| 305 | 266 |
| 306 | 277 |
| 307 | 365 |
| 308 | 292 |
| 309 | 377 |
| 310 | 396 |
| 311 | 500 |
| 312 | 296 |
| 313 | 407 |
| 314 | 426 |
| 315 | 518 |
| 316 | 447 |
| 317 | 526 |
| 318 | 567 |
| 319 | 667 |
| 320 | 73 |
| 321 | 143 |
| 322 | 148 |
| 323 | 251 |
| 324 | 161 |
| 325 | 264 |

TABLE Z29-continued with a sequence length of 1024:

| Polarized channel sequence number | Reliability or reliability sequence number |
|---|---|
| 326 | 269 |
| 327 | 362 |
| 328 | 171 |
| 329 | 281 |
| 330 | 285 |
| 331 | 380 |
| 332 | 295 |
| 333 | 394 |
| 334 | 412 |
| 335 | 512 |
| 336 | 187 |
| 337 | 294 |
| 338 | 311 |
| 339 | 405 |
| 340 | 317 |
| 341 | 418 |
| 342 | 439 |
| 343 | 528 |
| 344 | 355 |
| 345 | 438 |
| 346 | 460 |
| 347 | 554 |
| 348 | 487 |
| 349 | 583 |
| 350 | 591 |
| 351 | 691 |
| 352 | 207 |
| 353 | 316 |
| 354 | 342 |
| 355 | 431 |
| 356 | 356 |
| 357 | 451 |
| 358 | 475 |
| 359 | 568 |
| 360 | 373 |
| 361 | 463 |
| 362 | 481 |
| 363 | 582 |
| 364 | 522 |
| 365 | 601 |
| 366 | 615 |
| 367 | 693 |
| 368 | 397 |
| 369 | 506 |
| 370 | 517 |
| 371 | 606 |
| 372 | 534 |
| 373 | 629 |
| 374 | 638 |
| 375 | 725 |
| 376 | 555 |
| 377 | 641 |
| 378 | 670 |
| 379 | 751 |
| 380 | 679 |
| 381 | 770 |
| 382 | 780 |
| 383 | 846 |
| 384 | 78 |
| 385 | 160 |
| 386 | 173 |
| 387 | 276 |
| 388 | 184 |
| 389 | 293 |
| 390 | 309 |
| 391 | 414 |
| 392 | 202 |
| 393 | 312 |
| 394 | 321 |
| 395 | 427 |
| 396 | 364 |
| 397 | 443 |
| 398 | 461 |
| 399 | 578 |
| 400 | 209 |

TABLE Z29-continued with a sequence length of 1024:

| Polarized channel sequence number | Reliability or reliability sequence number |
|---|---|
| 401 | 345 |
| 402 | 357 |
| 403 | 452 |
| 404 | 389 |
| 405 | 467 |
| 406 | 484 |
| 407 | 585 |
| 408 | 395 |
| 409 | 495 |
| 410 | 515 |
| 411 | 598 |
| 412 | 529 |
| 413 | 614 |
| 414 | 636 |
| 415 | 714 |
| 416 | 228 |
| 417 | 361 |
| 418 | 372 |
| 419 | 483 |
| 420 | 410 |
| 421 | 505 |
| 422 | 521 |
| 423 | 611 |
| 424 | 430 |
| 425 | 516 |
| 426 | 546 |
| 427 | 627 |
| 428 | 560 |
| 429 | 647 |
| 430 | 666 |
| 431 | 743 |
| 432 | 446 |
| 433 | 532 |
| 434 | 577 |
| 435 | 663 |
| 436 | 586 |
| 437 | 673 |
| 438 | 687 |
| 439 | 772 |
| 440 | 605 |
| 441 | 688 |
| 442 | 694 |
| 443 | 790 |
| 444 | 723 |
| 445 | 802 |
| 446 | 816 |
| 447 | 873 |
| 448 | 240 |
| 449 | 384 |
| 450 | 415 |
| 451 | 527 |
| 452 | 440 |
| 453 | 533 |
| 454 | 552 |
| 455 | 646 |
| 456 | 466 |
| 457 | 561 |
| 458 | 581 |
| 459 | 671 |
| 460 | 597 |
| 461 | 677 |
| 462 | 690 |
| 463 | 779 |
| 464 | 482 |
| 465 | 576 |
| 466 | 613 |
| 467 | 686 |
| 468 | 617 |
| 469 | 692 |
| 470 | 707 |
| 471 | 801 |
| 472 | 640 |
| 473 | 724 |
| 474 | 749 |
| 475 | 821 |

TABLE Z29-continued with a sequence length of 1024:

| Polarized channel sequence number | Reliability or reliability sequence number |
|---|---|
| 476 | 760 |
| 477 | 834 |
| 478 | 844 |
| 479 | 905 |
| 480 | 511 |
| 481 | 609 |
| 482 | 620 |
| 483 | 722 |
| 484 | 661 |
| 485 | 740 |
| 486 | 753 |
| 487 | 828 |
| 488 | 676 |
| 489 | 756 |
| 490 | 777 |
| 491 | 840 |
| 492 | 794 |
| 493 | 853 |
| 494 | 865 |
| 495 | 924 |
| 496 | 721 |
| 497 | 786 |
| 498 | 798 |
| 499 | 859 |
| 500 | 813 |
| 501 | 870 |
| 502 | 877 |
| 503 | 930 |
| 504 | 830 |
| 505 | 885 |
| 506 | 893 |
| 507 | 946 |
| 508 | 909 |
| 509 | 954 |
| 510 | 963 |
| 511 | 984 |
| 512 | 27 |
| 513 | 43 |
| 514 | 52 |
| 515 | 98 |
| 516 | 60 |
| 517 | 117 |
| 518 | 128 |
| 519 | 199 |
| 520 | 65 |
| 521 | 132 |
| 522 | 140 |
| 523 | 204 |
| 524 | 151 |
| 525 | 220 |
| 526 | 224 |
| 527 | 330 |
| 528 | 67 |
| 529 | 150 |
| 530 | 158 |
| 531 | 219 |
| 532 | 166 |
| 533 | 263 |
| 534 | 271 |
| 535 | 354 |
| 536 | 188 |
| 537 | 272 |
| 538 | 290 |
| 539 | 381 |
| 540 | 304 |
| 541 | 398 |
| 542 | 413 |
| 543 | 525 |
| 544 | 69 |
| 545 | 163 |
| 546 | 178 |
| 547 | 267 |
| 548 | 190 |
| 549 | 289 |
| 550 | 299 |

TABLE Z29-continued with a sequence length of 1024:

| Polarized channel sequence number | Reliability or reliability sequence number |
|---|---|
| 551 | 392 |
| 552 | 200 |
| 553 | 308 |
| 554 | 318 |
| 555 | 416 |
| 556 | 332 |
| 557 | 435 |
| 558 | 449 |
| 559 | 536 |
| 560 | 210 |
| 561 | 325 |
| 562 | 341 |
| 563 | 442 |
| 564 | 359 |
| 565 | 462 |
| 566 | 473 |
| 567 | 564 |
| 568 | 367 |
| 569 | 469 |
| 570 | 490 |
| 571 | 588 |
| 572 | 493 |
| 573 | 600 |
| 574 | 616 |
| 575 | 745 |
| 576 | 107 |
| 577 | 189 |
| 578 | 196 |
| 579 | 303 |
| 580 | 206 |
| 581 | 319 |
| 582 | 331 |
| 583 | 429 |
| 584 | 229 |
| 585 | 343 |
| 586 | 351 |
| 587 | 457 |
| 588 | 369 |
| 589 | 477 |
| 590 | 488 |
| 591 | 572 |
| 592 | 245 |
| 593 | 353 |
| 594 | 375 |
| 595 | 471 |
| 596 | 391 |
| 597 | 492 |
| 598 | 497 |
| 599 | 594 |
| 600 | 404 |
| 601 | 498 |
| 602 | 504 |
| 603 | 618 |
| 604 | 545 |
| 605 | 631 |
| 606 | 656 |
| 607 | 752 |
| 608 | 260 |
| 609 | 390 |
| 610 | 400 |
| 611 | 503 |
| 612 | 421 |
| 613 | 520 |
| 614 | 524 |
| 615 | 624 |
| 616 | 437 |
| 617 | 544 |
| 618 | 557 |
| 619 | 645 |
| 620 | 580 |
| 621 | 664 |
| 622 | 674 |
| 623 | 773 |
| 624 | 456 |
| 625 | 566 |

TABLE Z29-continued

| with a sequence length of 1024: | |
|---|---|
| Polarized channel sequence number | Reliability or reliability sequence number |
| 626 | 587 |
| 627 | 675 |
| 628 | 607 |
| 629 | 685 |
| 630 | 709 |
| 631 | 787 |
| 632 | 635 |
| 633 | 712 |
| 634 | 730 |
| 635 | 803 |
| 636 | 741 |
| 637 | 819 |
| 638 | 836 |
| 639 | 903 |
| 640 | 110 |
| 641 | 203 |
| 642 | 221 |
| 643 | 340 |
| 644 | 243 |
| 645 | 352 |
| 646 | 371 |
| 647 | 480 |
| 648 | 255 |
| 649 | 378 |
| 650 | 393 |
| 651 | 499 |
| 652 | 408 |
| 653 | 508 |
| 654 | 513 |
| 655 | 621 |
| 656 | 280 |
| 657 | 401 |
| 658 | 420 |
| 659 | 514 |
| 660 | 436 |
| 661 | 541 |
| 662 | 553 |
| 663 | 642 |
| 664 | 455 |
| 665 | 562 |
| 666 | 579 |
| 667 | 669 |
| 668 | 595 |
| 669 | 681 |
| 670 | 700 |
| 671 | 774 |
| 672 | 300 |
| 673 | 428 |
| 674 | 448 |
| 675 | 556 |
| 676 | 474 |
| 677 | 575 |
| 678 | 573 |
| 679 | 682 |
| 680 | 485 |
| 681 | 590 |
| 682 | 599 |
| 683 | 696 |
| 684 | 625 |
| 685 | 710 |
| 686 | 718 |
| 687 | 805 |
| 688 | 507 |
| 689 | 608 |
| 690 | 633 |
| 691 | 715 |
| 692 | 643 |
| 693 | 735 |
| 694 | 742 |
| 695 | 822 |
| 696 | 659 |
| 697 | 750 |
| 698 | 764 |
| 699 | 841 |
| 700 | 789 |

TABLE Z29-continued

| with a sequence length of 1024: | |
|---|---|
| Polarized channel sequence number | Reliability or reliability sequence number |
| 701 | 855 |
| 702 | 871 |
| 703 | 925 |
| 704 | 315 |
| 705 | 459 |
| 706 | 476 |
| 707 | 592 |
| 708 | 496 |
| 709 | 604 |
| 710 | 626 |
| 711 | 713 |
| 712 | 539 |
| 713 | 634 |
| 714 | 650 |
| 715 | 738 |
| 716 | 653 |
| 717 | 744 |
| 718 | 758 |
| 719 | 833 |
| 720 | 547 |
| 721 | 651 |
| 722 | 658 |
| 723 | 755 |
| 724 | 683 |
| 725 | 763 |
| 726 | 783 |
| 727 | 852 |
| 728 | 704 |
| 729 | 788 |
| 730 | 797 |
| 731 | 860 |
| 732 | 812 |
| 733 | 878 |
| 734 | 888 |
| 735 | 933 |
| 736 | 563 |
| 737 | 689 |
| 738 | 698 |
| 739 | 775 |
| 740 | 719 |
| 741 | 791 |
| 742 | 800 |
| 743 | 867 |
| 744 | 731 |
| 745 | 810 |
| 746 | 823 |
| 747 | 884 |
| 748 | 837 |
| 749 | 894 |
| 750 | 907 |
| 751 | 949 |
| 752 | 766 |
| 753 | 825 |
| 754 | 842 |
| 755 | 897 |
| 756 | 857 |
| 757 | 911 |
| 758 | 916 |
| 759 | 961 |
| 760 | 868 |
| 761 | 921 |
| 762 | 929 |
| 763 | 966 |
| 764 | 940 |
| 765 | 974 |
| 766 | 983 |
| 767 | 1003 |
| 768 | 125 |
| 769 | 230 |
| 770 | 249 |
| 771 | 379 |
| 772 | 278 |
| 773 | 399 |
| 774 | 417 |
| 775 | 530 |

TABLE Z29-continued

| with a sequence length of 1024: | |
|---|---|
| Polarized channel sequence number | Reliability or reliability sequence number |
| 776 | 286 |
| 777 | 423 |
| 778 | 441 |
| 779 | 543 |
| 780 | 458 |
| 781 | 559 |
| 782 | 584 |
| 783 | 701 |
| 784 | 310 |
| 785 | 450 |
| 786 | 479 |
| 787 | 571 |
| 788 | 491 |
| 789 | 603 |
| 790 | 596 |
| 791 | 706 |
| 792 | 501 |
| 793 | 612 |
| 794 | 628 |
| 795 | 728 |
| 796 | 648 |
| 797 | 736 |
| 798 | 747 |
| 799 | 829 |
| 800 | 360 |
| 801 | 486 |
| 802 | 502 |
| 803 | 602 |
| 804 | 538 |
| 805 | 623 |
| 806 | 637 |
| 807 | 739 |
| 808 | 542 |
| 809 | 649 |
| 810 | 655 |
| 811 | 748 |
| 812 | 665 |
| 813 | 759 |
| 814 | 769 |
| 815 | 848 |
| 816 | 548 |
| 817 | 662 |
| 818 | 678 |
| 819 | 768 |
| 820 | 703 |
| 821 | 782 |
| 822 | 795 |
| 823 | 861 |
| 824 | 716 |
| 825 | 807 |
| 826 | 811 |
| 827 | 879 |
| 828 | 824 |
| 829 | 889 |
| 830 | 900 |
| 831 | 944 |
| 832 | 368 |
| 833 | 537 |
| 834 | 540 |
| 835 | 644 |
| 836 | 549 |
| 837 | 652 |
| 838 | 668 |
| 839 | 762 |
| 840 | 565 |
| 841 | 684 |
| 842 | 697 |
| 843 | 778 |
| 844 | 711 |
| 845 | 792 |
| 846 | 809 |
| 847 | 875 |
| 848 | 632 |
| 849 | 702 |
| 850 | 720 |

TABLE Z29-continued

| with a sequence length of 1024: | |
|---|---|
| Polarized channel sequence number | Reliability or reliability sequence number |
| 851 | 796 |
| 852 | 732 |
| 853 | 817 |
| 854 | 826 |
| 855 | 886 |
| 856 | 761 |
| 857 | 827 |
| 858 | 843 |
| 859 | 898 |
| 860 | 858 |
| 861 | 910 |
| 862 | 915 |
| 863 | 960 |
| 864 | 654 |
| 865 | 734 |
| 866 | 754 |
| 867 | 818 |
| 868 | 767 |
| 869 | 839 |
| 870 | 850 |
| 871 | 902 |
| 872 | 785 |
| 873 | 854 |
| 874 | 863 |
| 875 | 914 |
| 876 | 874 |
| 877 | 922 |
| 878 | 932 |
| 879 | 969 |
| 880 | 799 |
| 881 | 869 |
| 882 | 881 |
| 883 | 928 |
| 884 | 892 |
| 885 | 935 |
| 886 | 943 |
| 887 | 976 |
| 888 | 904 |
| 889 | 947 |
| 890 | 953 |
| 891 | 981 |
| 892 | 958 |
| 893 | 989 |
| 894 | 991 |
| 895 | 1011 |
| 896 | 374 |
| 897 | 551 |
| 898 | 558 |
| 899 | 699 |
| 900 | 622 |
| 901 | 708 |
| 902 | 717 |
| 903 | 806 |
| 904 | 639 |
| 905 | 727 |
| 906 | 737 |
| 907 | 820 |
| 908 | 757 |
| 909 | 832 |
| 910 | 847 |
| 911 | 901 |
| 912 | 657 |
| 913 | 746 |
| 914 | 765 |
| 915 | 835 |
| 916 | 776 |
| 917 | 851 |
| 918 | 864 |
| 919 | 913 |
| 920 | 793 |
| 921 | 872 |
| 922 | 862 |
| 923 | 919 |
| 924 | 887 |
| 925 | 931 |

TABLE Z29-continued

| with a sequence length of 1024: | |
|---|---|
| Polarized channel sequence number | Reliability or reliability sequence number |
| 926 | 939 |
| 927 | 972 |
| 928 | 705 |
| 929 | 771 |
| 930 | 781 |
| 931 | 856 |
| 932 | 804 |
| 933 | 866 |
| 934 | 880 |
| 935 | 926 |
| 936 | 815 |
| 937 | 882 |
| 938 | 891 |
| 939 | 936 |
| 940 | 899 |
| 941 | 941 |
| 942 | 950 |
| 943 | 980 |
| 944 | 838 |
| 945 | 895 |
| 946 | 906 |
| 947 | 945 |
| 948 | 917 |
| 949 | 955 |
| 950 | 959 |
| 951 | 987 |
| 952 | 923 |
| 953 | 965 |
| 954 | 968 |
| 955 | 993 |
| 956 | 975 |
| 957 | 996 |
| 958 | 998 |
| 959 | 1008 |
| 960 | 733 |
| 961 | 784 |
| 962 | 814 |
| 963 | 883 |
| 964 | 831 |
| 965 | 890 |
| 966 | 896 |
| 967 | 942 |
| 968 | 845 |
| 969 | 908 |
| 970 | 912 |
| 971 | 952 |
| 972 | 920 |
| 973 | 956 |
| 974 | 967 |
| 975 | 990 |
| 976 | 849 |
| 977 | 918 |
| 978 | 927 |
| 979 | 964 |
| 980 | 938 |
| 981 | 970 |
| 982 | 971 |
| 983 | 997 |
| 984 | 948 |
| 985 | 977 |
| 986 | 979 |
| 987 | 999 |
| 988 | 985 |
| 989 | 1004 |
| 990 | 1006 |
| 991 | 1016 |
| 992 | 876 |
| 993 | 934 |
| 994 | 937 |
| 995 | 973 |
| 996 | 951 |
| 997 | 978 |
| 998 | 982 |
| 999 | 1001 |
| 1000 | 957 |
| 1001 | 986 |
| 1002 | 988 |
| 1003 | 1005 |
| 1004 | 994 |
| 1005 | 1007 |
| 1006 | 1012 |
| 1007 | 1018 |
| 1008 | 962 |
| 1009 | 992 |
| 1010 | 995 |
| 1011 | 1009 |
| 1012 | 1000 |
| 1013 | 1010 |
| 1014 | 1013 |
| 1015 | 1019 |
| 1016 | 1002 |
| 1017 | 1014 |
| 1018 | 1015 |
| 1019 | 1020 |
| 1020 | 1017 |
| 1021 | 1021 |
| 1022 | 1022 |
| 1023 | 1023 |

Ninth group of sequences (in comprehensive consideration of a criterion that a list 4 has optimal performance when a mother code length is 512 and a list 2 is optimal when a mother code length is 1024 in a case of existence of a PC bit)

Sequence Q30, with a sequence length of 1024

0, 1, 2, 4, 8, 16, 32, 3, 5, 64, 9, 6, 17, 10, 18, 128, 12, 512, 33, 65, 20, 256, 34, 24, 36, 7, 12 9, 66, 11, 40, 68, 130, 19, 13, 48, 14, 72, 257, 21, 132, 35, 258, 26, 80, 37, 25, 22, 513, 136, 260, 264, 38, 96, 67, 41, 514, 144, 28, 69, 42, 49, 516, 74, 272, 160, 288, 192, 70, 44, 131, 81, 520, 50, 73, 15, 320, 133, 52, 23, 528, 134, 384, 76, 137, 82, 56, 27, 97, 544, 39, 259, 84, 138, 145, 261, 29, 43, 98, 88, 140, 30, 576, 146, 71, 262, 265, 161, 45, 515, 100, 51, 148, 46, 640, 75, 266, 273, 104, 162, 53, 517, 193, 152, 77, 164, 268, 768, 274, 54, 83, 57, 518, 112, 521, 135, 78, 289, 194, 85, 276, 58, 52 2, 168, 139, 99, 86, 60, 280, 89, 290, 529, 196, 141, 524, 101, 147, 176, 142, 321, 31, 530, 200, 90, 292, 322, 263, 149, 102, 105, 545, 532, 304, 296, 163, 92, 47, 267, 385, 324, 546, 208, 386, 150, 5 36, 153, 165, 106, 55, 328, 113, 548, 154, 577, 79, 269, 108, 224, 519, 166, 195, 270, 275, 291, 59, 578, 169, 552, 114, 277, 156, 87, 197, 116, 170, 61, 281, 641, 523, 580, 278, 560, 177, 293, 388, 91, 198, 172, 120, 201, 336, 62, 584, 642, 282, 143, 525, 103, 178, 294, 93, 202, 531, 323, 526, 76 9, 644, 592, 392, 297, 107, 180, 151, 209, 284, 94, 204, 298, 400, 533, 352, 770, 648, 608, 325, 15 5, 210, 305, 547, 534, 300, 109, 184, 115, 167, 537, 772, 225, 326, 306, 157, 329, 656, 110, 117, 2 12, 171, 549, 330, 226, 538, 387, 308, 216, 416, 672, 776, 271, 550, 279, 158, 337, 579, 118, 540, 332, 389, 553, 173, 121, 199, 179, 228, 338, 312, 390, 784, 704, 581, 554, 174, 393, 283, 122, 44 8, 353, 203, 63, 527, 561, 582, 340, 556, 394, 181, 295, 285, 232, 124, 205, 643, 182, 800, 585, 56 2, 286, 299, 354, 211, 401, 185, 396, 586, 344, 564, 535, 240, 645, 206, 95, 327, 832, 402, 356, 59 3, 588, 307, 301, 417, 568, 646, 213, 186, 404, 227, 594, 418, 302, 539, 360, 111, 771, 896, 649, 3 31, 214, 309, 188, 449, 217, 408, 551, 609, 596, 229, 159, 650, 541, 420, 310, 333, 773, 119, 339, 218, 368, 230, 391, 657, 610, 542, 652, 600, 313, 450, 334, 233, 175, 555, 123, 341, 774, 658, 22 0, 612, 314, 424, 777, 395, 355, 287, 183, 234, 583, 125, 557, 342, 316, 241, 673, 660, 616, 563, 7 78, 345, 452, 397, 558, 403, 207, 432, 674, 357, 187, 236, 664, 785, 587, 624, 126, 780, 242, 565, 398, 346, 456, 358, 405, 676, 705, 303, 786, 244, 189, 566, 361, 589, 647, 215, 348, 419, 569, 40 6, 706, 680, 595, 464, 362, 590, 801, 788, 409, 219, 311, 570, 421, 410, 543, 708, 231, 802, 651, 6 88, 597, 248, 792, 369, 190, 572, 364, 335, 480, 315, 221, 611, 598, 804, 833, 712, 370, 422, 653, 425, 601, 451, 235, 775, 412, 343, 659, 372, 317, 222, 426, 613, 559, 654, 834, 808, 602, 720, 45 3, 237, 433, 614, 347, 243, 604, 897, 661, 836, 816, 454, 779, 617, 318, 376, 428, 736, 238, 359, 4 57, 675, 567, 662, 399, 434, 840, 349, 618, 898, 245, 458, 665, 781, 363, 591, 625, 127, 620, 191, 677, 407, 436, 787, 666, 465, 782, 571, 900, 848, 246, 350, 626, 460, 249, 678, 411, 707, 668, 78 9, 365, 681, 573, 440, 628, 599, 374, 423, 904, 864, 466, 803, 574, 250, 790, 371, 481, 413, 366, 7 09, 682, 468, 632, 429, 793, 655, 912, 603, 689, 252, 710, 684, 373, 482, 427, 805, 414, 794, 223, 615, 713, 690, 472, 605, 455, 377, 928, 806, 435, 714, 835, 796, 319, 663, 606, 484, 692, 809, 61 9, 430, 721, 488, 239, 716, 378, 459, 696, 960, 837, 810, 437, 722, 667, 380, 461, 621, 496, 783, 3 51, 817, 838, 627, 812, 679, 622, 737, 724, 899, 467, 669, 438, 841, 818, 251, 462, 442, 575, 441, 738, 629, 670, 469, 728, 842, 683, 791, 820, 247, 901, 630, 367, 740, 849, 253, 375, 844, 633, 44 4, 711, 824, 902, 685, 470, 483, 850, 415, 795, 744, 634, 485, 691, 905, 686, 607, 473, 807, 865, 8 52, 636, 715, 474, 906, 254, 797, 752, 693, 379, 431, 913, 866, 798, 489, 694, 908, 856, 717, 486, 811, 476, 439, 697, 623, 723, 914, 868, 718, 490, 463, 698, 839, 381, 813, 671, 929, 916, 497, 72 5, 872, 819, 492, 700, 814, 443, 631, 382, 739, 930, 726, 920, 843, 498, 880, 821, 729, 961, 741, 4 45, 822, 730, 845, 825, 851, 846, 745, 471, 742, 932, 635, 500, 962, 826, 903, 687, 446, 732, 853, 637, 475, 746, 867, 907, 695, 487, 719, 753, 936, 854, 504, 909, 944, 748, 828, 255, 869, 799, 69 9, 477, 857, 910, 915, 964, 873, 491, 638, 754, 968, 727, 478, 917, 858, 701, 756, 383, 921, 870, 8 15, 874, 976, 493, 931, 918, 702, 860, 731, 499, 823, 881, 933, 743, 502, 847, 494, 922, 827, 760, 501, 733, 876, 934, 963, 882, 937, 924, 992, 855, 747, 447, 829, 734, 965, 938, 505, 884, 639, 91 1, 830, 749, 506, 859, 479, 945, 755, 966, 871, 940, 750, 969, 888, 508, 861, 946, 919, 757, 703, 9 70, 875, 495, 862, 948, 758, 977, 923, 761, 972, 877, 935, 978, 883, 503, 952, 762, 925, 735, 878, 993, 980, 939, 885, 926, 831, 764, 507, 994, 967, 886, 941, 751, 984, 889, 509, 947, 996, 942, 97 1, 890, 510, 863, 949, 759, 1000, 973, 892, 950, 979, 953, 763, 974, 879, 1008, 981, 954, 927, 76 5, 995, 982, 887, 956, 766, 985, 997, 943, 986, 891, 511, 998, 1001, 988, 893, 951, 1002, 975, 89 4, 1009, 955, 1004, 1010, 983, 957, 767, 1012, 958, 987, 999, 1016, 989, 1003, 990, 895, 1005, 1 011, 1006, 1013, 959, 1014, 1017, 1018, 991, 1020, 1007, 1015, 1019, 1021, 1022, 1023

TABLE Q30 with a sequence length of 1024:

| Polarized channel sequence number | Reliability or reliability sequence number |
|---|---|
| 0 | 0 |
| 1 | 1 |

TABLE Q30-continued with a sequence length of 1024:

| Polarized channel sequence number | Reliability or reliability sequence number |
|---|---|
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 512 |
| 18 | 33 |
| 19 | 65 |
| 20 | 20 |
| 21 | 256 |
| 22 | 34 |
| 23 | 24 |
| 24 | 36 |
| 25 | 7 |
| 26 | 129 |
| 27 | 66 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |
| 38 | 21 |
| 39 | 132 |
| 40 | 35 |
| 41 | 258 |
| 42 | 26 |
| 43 | 80 |
| 44 | 37 |
| 45 | 25 |
| 46 | 22 |
| 47 | 513 |
| 48 | 136 |
| 49 | 260 |
| 50 | 264 |
| 51 | 38 |
| 52 | 96 |
| 53 | 67 |
| 54 | 41 |
| 55 | 514 |
| 56 | 144 |
| 57 | 28 |
| 58 | 69 |
| 59 | 42 |
| 60 | 49 |
| 61 | 516 |
| 62 | 74 |
| 63 | 272 |
| 64 | 160 |
| 65 | 288 |
| 66 | 192 |
| 67 | 70 |
| 68 | 44 |
| 69 | 131 |
| 70 | 81 |
| 71 | 520 |
| 72 | 50 |
| 73 | 73 |
| 74 | 15 |
| 75 | 320 |
| 76 | 133 |

TABLE Q30-continued

| with a sequence length of 1024: | |
|---|---|
| Polarized channel sequence number | Reliability or reliability sequence number |
| 77 | 52 |
| 78 | 23 |
| 79 | 528 |
| 80 | 134 |
| 81 | 384 |
| 82 | 76 |
| 83 | 137 |
| 84 | 82 |
| 85 | 56 |
| 86 | 27 |
| 87 | 97 |
| 88 | 544 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 88 |
| 99 | 140 |
| 100 | 30 |
| 101 | 576 |
| 102 | 146 |
| 103 | 71 |
| 104 | 262 |
| 105 | 265 |
| 106 | 161 |
| 107 | 45 |
| 108 | 515 |
| 109 | 100 |
| 110 | 51 |
| 111 | 148 |
| 112 | 46 |
| 113 | 640 |
| 114 | 75 |
| 115 | 266 |
| 116 | 273 |
| 117 | 104 |
| 118 | 162 |
| 119 | 53 |
| 120 | 517 |
| 121 | 193 |
| 122 | 152 |
| 123 | 77 |
| 124 | 164 |
| 125 | 268 |
| 126 | 768 |
| 127 | 274 |
| 128 | 54 |
| 129 | 83 |
| 130 | 57 |
| 131 | 518 |
| 132 | 112 |
| 133 | 521 |
| 134 | 135 |
| 135 | 78 |
| 136 | 289 |
| 137 | 194 |
| 138 | 85 |
| 139 | 276 |
| 140 | 58 |
| 141 | 522 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 196 |

TABLE Q30-continued

| with a sequence length of 1024: | |
|---|---|
| Polarized channel sequence number | Reliability or reliability sequence number |
| 152 | 141 |
| 153 | 524 |
| 154 | 101 |
| 155 | 147 |
| 156 | 176 |
| 157 | 142 |
| 158 | 321 |
| 159 | 31 |
| 160 | 530 |
| 161 | 200 |
| 162 | 90 |
| 163 | 292 |
| 164 | 322 |
| 165 | 263 |
| 166 | 149 |
| 167 | 102 |
| 168 | 105 |
| 169 | 545 |
| 170 | 532 |
| 171 | 304 |
| 172 | 296 |
| 173 | 163 |
| 174 | 92 |
| 175 | 47 |
| 176 | 267 |
| 177 | 385 |
| 178 | 324 |
| 179 | 546 |
| 180 | 208 |
| 181 | 386 |
| 182 | 150 |
| 183 | 536 |
| 184 | 153 |
| 185 | 165 |
| 186 | 106 |
| 187 | 55 |
| 188 | 328 |
| 189 | 113 |
| 190 | 548 |
| 191 | 154 |
| 192 | 577 |
| 193 | 79 |
| 194 | 269 |
| 195 | 108 |
| 196 | 224 |
| 197 | 519 |
| 198 | 166 |
| 199 | 195 |
| 200 | 270 |
| 201 | 275 |
| 202 | 291 |
| 203 | 59 |
| 204 | 578 |
| 205 | 169 |
| 206 | 552 |
| 207 | 114 |
| 208 | 277 |
| 209 | 156 |
| 210 | 87 |
| 211 | 197 |
| 212 | 116 |
| 213 | 170 |
| 214 | 61 |
| 215 | 281 |
| 216 | 641 |
| 217 | 523 |
| 218 | 580 |
| 219 | 278 |
| 220 | 560 |
| 221 | 177 |
| 222 | 293 |
| 223 | 388 |
| 224 | 91 |
| 225 | 198 |
| 226 | 172 |

TABLE Q30-continued with a sequence length of 1024:

| Polarized channel sequence number | Reliability or reliability sequence number |
|---|---|
| 227 | 120 |
| 228 | 201 |
| 229 | 336 |
| 230 | 62 |
| 231 | 584 |
| 232 | 642 |
| 233 | 282 |
| 234 | 143 |
| 235 | 525 |
| 236 | 103 |
| 237 | 178 |
| 238 | 294 |
| 239 | 93 |
| 240 | 202 |
| 241 | 531 |
| 242 | 323 |
| 243 | 526 |
| 244 | 769 |
| 245 | 644 |
| 246 | 592 |
| 247 | 392 |
| 248 | 297 |
| 249 | 107 |
| 250 | 180 |
| 251 | 151 |
| 252 | 209 |
| 253 | 284 |
| 254 | 94 |
| 255 | 204 |
| 256 | 298 |
| 257 | 400 |
| 258 | 533 |
| 259 | 352 |
| 260 | 770 |
| 261 | 648 |
| 262 | 608 |
| 263 | 325 |
| 264 | 155 |
| 265 | 210 |
| 266 | 305 |
| 267 | 547 |
| 268 | 534 |
| 269 | 300 |
| 270 | 109 |
| 271 | 184 |
| 272 | 115 |
| 273 | 167 |
| 274 | 537 |
| 275 | 772 |
| 276 | 225 |
| 277 | 326 |
| 278 | 306 |
| 279 | 157 |
| 280 | 329 |
| 281 | 656 |
| 282 | 110 |
| 283 | 117 |
| 284 | 212 |
| 285 | 171 |
| 286 | 549 |
| 287 | 330 |
| 288 | 226 |
| 289 | 538 |
| 290 | 387 |
| 291 | 308 |
| 292 | 216 |
| 293 | 416 |
| 294 | 672 |
| 295 | 776 |
| 296 | 271 |
| 297 | 550 |
| 298 | 279 |
| 299 | 158 |
| 300 | 337 |
| 301 | 579 |

TABLE Q30-continued with a sequence length of 1024:

| Polarized channel sequence number | Reliability or reliability sequence number |
|---|---|
| 302 | 118 |
| 303 | 540 |
| 304 | 332 |
| 305 | 389 |
| 306 | 553 |
| 307 | 173 |
| 308 | 121 |
| 309 | 199 |
| 310 | 179 |
| 311 | 228 |
| 312 | 338 |
| 313 | 312 |
| 314 | 390 |
| 315 | 784 |
| 316 | 704 |
| 317 | 581 |
| 318 | 554 |
| 319 | 174 |
| 320 | 393 |
| 321 | 283 |
| 322 | 122 |
| 323 | 448 |
| 324 | 353 |
| 325 | 203 |
| 326 | 63 |
| 327 | 527 |
| 328 | 561 |
| 329 | 582 |
| 330 | 340 |
| 331 | 556 |
| 332 | 394 |
| 333 | 181 |
| 334 | 295 |
| 335 | 285 |
| 336 | 232 |
| 337 | 124 |
| 338 | 205 |
| 339 | 643 |
| 340 | 182 |
| 341 | 800 |
| 342 | 585 |
| 343 | 562 |
| 344 | 286 |
| 345 | 299 |
| 346 | 354 |
| 347 | 211 |
| 348 | 401 |
| 349 | 185 |
| 350 | 396 |
| 351 | 586 |
| 352 | 344 |
| 353 | 564 |
| 354 | 535 |
| 355 | 240 |
| 356 | 645 |
| 357 | 206 |
| 358 | 95 |
| 359 | 327 |
| 360 | 832 |
| 361 | 402 |
| 362 | 356 |
| 363 | 593 |
| 364 | 588 |
| 365 | 307 |
| 366 | 301 |
| 367 | 417 |
| 368 | 568 |
| 369 | 646 |
| 370 | 213 |
| 371 | 186 |
| 372 | 404 |
| 373 | 227 |
| 374 | 594 |
| 375 | 418 |
| 376 | 302 |

TABLE Q30-continued with a sequence length of 1024:

| Polarized channel sequence number | Reliability or reliability sequence number |
|---|---|
| 377 | 539 |
| 378 | 360 |
| 379 | 111 |
| 380 | 771 |
| 381 | 896 |
| 382 | 649 |
| 383 | 331 |
| 384 | 214 |
| 385 | 309 |
| 386 | 188 |
| 387 | 449 |
| 388 | 217 |
| 389 | 408 |
| 390 | 551 |
| 391 | 609 |
| 392 | 596 |
| 393 | 229 |
| 394 | 159 |
| 395 | 650 |
| 396 | 541 |
| 397 | 420 |
| 398 | 310 |
| 399 | 333 |
| 400 | 773 |
| 401 | 119 |
| 402 | 339 |
| 403 | 218 |
| 404 | 368 |
| 405 | 230 |
| 406 | 391 |
| 407 | 657 |
| 408 | 610 |
| 409 | 542 |
| 410 | 652 |
| 411 | 600 |
| 412 | 313 |
| 413 | 450 |
| 414 | 334 |
| 415 | 233 |
| 416 | 175 |
| 417 | 555 |
| 418 | 123 |
| 419 | 341 |
| 420 | 774 |
| 421 | 658 |
| 422 | 220 |
| 423 | 612 |
| 424 | 314 |
| 425 | 424 |
| 426 | 777 |
| 427 | 395 |
| 428 | 355 |
| 429 | 287 |
| 430 | 183 |
| 431 | 234 |
| 432 | 583 |
| 433 | 125 |
| 434 | 557 |
| 435 | 342 |
| 436 | 316 |
| 437 | 241 |
| 438 | 673 |
| 439 | 660 |
| 440 | 616 |
| 441 | 563 |
| 442 | 778 |
| 443 | 345 |
| 444 | 452 |
| 445 | 397 |
| 446 | 558 |
| 447 | 403 |
| 448 | 207 |
| 449 | 432 |
| 450 | 674 |
| 451 | 357 |

TABLE Q30-continued with a sequence length of 1024:

| Polarized channel sequence number | Reliability or reliability sequence number |
|---|---|
| 452 | 187 |
| 453 | 236 |
| 454 | 664 |
| 455 | 785 |
| 456 | 587 |
| 457 | 624 |
| 458 | 126 |
| 459 | 780 |
| 460 | 242 |
| 461 | 565 |
| 462 | 398 |
| 463 | 346 |
| 464 | 456 |
| 465 | 358 |
| 466 | 405 |
| 467 | 676 |
| 468 | 705 |
| 469 | 303 |
| 470 | 786 |
| 471 | 244 |
| 472 | 189 |
| 473 | 566 |
| 474 | 361 |
| 475 | 589 |
| 476 | 647 |
| 477 | 215 |
| 478 | 348 |
| 479 | 419 |
| 480 | 569 |
| 481 | 406 |
| 482 | 706 |
| 483 | 680 |
| 484 | 595 |
| 485 | 464 |
| 486 | 362 |
| 487 | 590 |
| 488 | 801 |
| 489 | 788 |
| 490 | 409 |
| 491 | 219 |
| 492 | 311 |
| 493 | 570 |
| 494 | 421 |
| 495 | 410 |
| 496 | 543 |
| 497 | 708 |
| 498 | 231 |
| 499 | 802 |
| 500 | 651 |
| 501 | 688 |
| 502 | 597 |
| 503 | 248 |
| 504 | 792 |
| 505 | 369 |
| 506 | 190 |
| 507 | 572 |
| 508 | 364 |
| 509 | 335 |
| 510 | 480 |
| 511 | 315 |
| 512 | 221 |
| 513 | 611 |
| 514 | 598 |
| 515 | 804 |
| 516 | 833 |
| 517 | 712 |
| 518 | 370 |
| 519 | 422 |
| 520 | 653 |
| 521 | 425 |
| 522 | 601 |
| 523 | 451 |
| 524 | 235 |
| 525 | 775 |
| 526 | 412 |

TABLE Q30-continued with a sequence length of 1024:

| Polarized channel sequence number | Reliability or reliability sequence number |
|---|---|
| 527 | 343 |
| 528 | 659 |
| 529 | 372 |
| 530 | 317 |
| 531 | 222 |
| 532 | 426 |
| 533 | 613 |
| 534 | 559 |
| 535 | 654 |
| 536 | 834 |
| 537 | 808 |
| 538 | 602 |
| 539 | 720 |
| 540 | 453 |
| 541 | 237 |
| 542 | 433 |
| 543 | 614 |
| 544 | 347 |
| 545 | 243 |
| 546 | 604 |
| 547 | 897 |
| 548 | 661 |
| 549 | 836 |
| 550 | 816 |
| 551 | 454 |
| 552 | 779 |
| 553 | 617 |
| 554 | 318 |
| 555 | 376 |
| 556 | 428 |
| 557 | 736 |
| 558 | 238 |
| 559 | 359 |
| 560 | 457 |
| 561 | 675 |
| 562 | 567 |
| 563 | 662 |
| 564 | 399 |
| 565 | 434 |
| 566 | 840 |
| 567 | 349 |
| 568 | 618 |
| 569 | 898 |
| 570 | 245 |
| 571 | 458 |
| 572 | 665 |
| 573 | 781 |
| 574 | 363 |
| 575 | 591 |
| 576 | 625 |
| 577 | 127 |
| 578 | 620 |
| 579 | 191 |
| 580 | 677 |
| 581 | 407 |
| 582 | 436 |
| 583 | 787 |
| 584 | 666 |
| 585 | 465 |
| 586 | 782 |
| 587 | 571 |
| 588 | 900 |
| 589 | 848 |
| 590 | 246 |
| 591 | 350 |
| 592 | 626 |
| 593 | 460 |
| 594 | 249 |
| 595 | 678 |
| 596 | 411 |
| 597 | 707 |
| 598 | 668 |
| 599 | 789 |
| 600 | 365 |
| 601 | 681 |

TABLE Q30-continued with a sequence length of 1024:

| Polarized channel sequence number | Reliability or reliability sequence number |
|---|---|
| 602 | 573 |
| 603 | 440 |
| 604 | 628 |
| 605 | 599 |
| 606 | 374 |
| 607 | 423 |
| 608 | 904 |
| 609 | 864 |
| 610 | 466 |
| 611 | 803 |
| 612 | 574 |
| 613 | 250 |
| 614 | 790 |
| 615 | 371 |
| 616 | 481 |
| 617 | 413 |
| 618 | 366 |
| 619 | 709 |
| 620 | 682 |
| 621 | 468 |
| 622 | 632 |
| 623 | 429 |
| 624 | 793 |
| 625 | 655 |
| 626 | 912 |
| 627 | 603 |
| 628 | 689 |
| 629 | 252 |
| 630 | 710 |
| 631 | 684 |
| 632 | 373 |
| 633 | 482 |
| 634 | 427 |
| 635 | 805 |
| 636 | 414 |
| 637 | 794 |
| 638 | 223 |
| 639 | 615 |
| 640 | 713 |
| 641 | 690 |
| 642 | 472 |
| 643 | 605 |
| 644 | 455 |
| 645 | 377 |
| 646 | 928 |
| 647 | 806 |
| 648 | 435 |
| 649 | 714 |
| 650 | 835 |
| 651 | 796 |
| 652 | 319 |
| 653 | 663 |
| 654 | 606 |
| 655 | 484 |
| 656 | 692 |
| 657 | 809 |
| 658 | 619 |
| 659 | 430 |
| 660 | 721 |
| 661 | 488 |
| 662 | 239 |
| 663 | 716 |
| 664 | 378 |
| 665 | 459 |
| 666 | 696 |
| 667 | 960 |
| 668 | 837 |
| 669 | 810 |
| 670 | 437 |
| 671 | 722 |
| 672 | 667 |
| 673 | 380 |
| 674 | 461 |
| 675 | 621 |
| 676 | 496 |

TABLE Q30-continued with a sequence length of 1024:

| Polarized channel sequence number | Reliability or reliability sequence number |
|---|---|
| 677 | 783 |
| 678 | 351 |
| 679 | 817 |
| 680 | 838 |
| 681 | 627 |
| 682 | 812 |
| 683 | 679 |
| 684 | 622 |
| 685 | 737 |
| 686 | 724 |
| 687 | 899 |
| 688 | 467 |
| 689 | 669 |
| 690 | 438 |
| 691 | 841 |
| 692 | 818 |
| 693 | 251 |
| 694 | 462 |
| 695 | 442 |
| 696 | 575 |
| 697 | 441 |
| 698 | 738 |
| 699 | 629 |
| 700 | 670 |
| 701 | 469 |
| 702 | 728 |
| 703 | 842 |
| 704 | 683 |
| 705 | 791 |
| 706 | 820 |
| 707 | 247 |
| 708 | 901 |
| 709 | 630 |
| 710 | 367 |
| 711 | 740 |
| 712 | 849 |
| 713 | 253 |
| 714 | 375 |
| 715 | 844 |
| 716 | 633 |
| 717 | 444 |
| 718 | 711 |
| 719 | 824 |
| 720 | 902 |
| 721 | 685 |
| 722 | 470 |
| 723 | 483 |
| 724 | 850 |
| 725 | 415 |
| 726 | 795 |
| 727 | 744 |
| 728 | 634 |
| 729 | 485 |
| 730 | 691 |
| 731 | 905 |
| 732 | 686 |
| 733 | 607 |
| 734 | 473 |
| 735 | 807 |
| 736 | 865 |
| 737 | 852 |
| 738 | 636 |
| 739 | 715 |
| 740 | 474 |
| 741 | 906 |
| 742 | 254 |
| 743 | 797 |
| 744 | 752 |
| 745 | 693 |
| 746 | 379 |
| 747 | 431 |
| 748 | 913 |
| 749 | 866 |
| 750 | 798 |
| 751 | 489 |

TABLE Q30-continued with a sequence length of 1024:

| Polarized channel sequence number | Reliability or reliability sequence number |
|---|---|
| 752 | 694 |
| 753 | 908 |
| 754 | 856 |
| 755 | 717 |
| 756 | 486 |
| 757 | 811 |
| 758 | 476 |
| 759 | 439 |
| 760 | 697 |
| 761 | 623 |
| 762 | 723 |
| 763 | 914 |
| 764 | 868 |
| 765 | 718 |
| 766 | 490 |
| 767 | 463 |
| 768 | 698 |
| 769 | 839 |
| 770 | 381 |
| 771 | 813 |
| 772 | 671 |
| 773 | 929 |
| 774 | 916 |
| 775 | 497 |
| 776 | 725 |
| 777 | 872 |
| 778 | 819 |
| 779 | 492 |
| 780 | 700 |
| 781 | 814 |
| 782 | 443 |
| 783 | 631 |
| 784 | 382 |
| 785 | 739 |
| 786 | 930 |
| 787 | 726 |
| 788 | 920 |
| 789 | 843 |
| 790 | 498 |
| 791 | 880 |
| 792 | 821 |
| 793 | 729 |
| 794 | 961 |
| 795 | 741 |
| 796 | 445 |
| 797 | 822 |
| 798 | 730 |
| 799 | 845 |
| 800 | 825 |
| 801 | 851 |
| 802 | 846 |
| 803 | 745 |
| 804 | 471 |
| 805 | 742 |
| 806 | 932 |
| 807 | 635 |
| 808 | 500 |
| 809 | 962 |
| 810 | 826 |
| 811 | 903 |
| 812 | 687 |
| 813 | 446 |
| 814 | 732 |
| 815 | 853 |
| 816 | 637 |
| 817 | 475 |
| 818 | 746 |
| 819 | 867 |
| 820 | 907 |
| 821 | 695 |
| 822 | 487 |
| 823 | 719 |
| 824 | 753 |
| 825 | 936 |
| 826 | 854 |

TABLE Q30-continued with a sequence length of 1024:

| Polarized channel sequence number | Reliability or reliability sequence number |
|---|---|
| 827 | 504 |
| 828 | 909 |
| 829 | 944 |
| 830 | 748 |
| 831 | 828 |
| 832 | 255 |
| 833 | 869 |
| 834 | 799 |
| 835 | 699 |
| 836 | 477 |
| 837 | 857 |
| 838 | 910 |
| 839 | 915 |
| 840 | 964 |
| 841 | 873 |
| 842 | 491 |
| 843 | 638 |
| 844 | 754 |
| 845 | 968 |
| 846 | 727 |
| 847 | 478 |
| 848 | 917 |
| 849 | 858 |
| 850 | 701 |
| 851 | 756 |
| 852 | 383 |
| 853 | 921 |
| 854 | 870 |
| 855 | 815 |
| 856 | 874 |
| 857 | 976 |
| 858 | 493 |
| 859 | 931 |
| 860 | 918 |
| 861 | 702 |
| 862 | 860 |
| 863 | 731 |
| 864 | 499 |
| 865 | 823 |
| 866 | 881 |
| 867 | 933 |
| 868 | 743 |
| 869 | 502 |
| 870 | 847 |
| 871 | 494 |
| 872 | 922 |
| 873 | 827 |
| 874 | 760 |
| 875 | 501 |
| 876 | 733 |
| 877 | 876 |
| 878 | 934 |
| 879 | 963 |
| 880 | 882 |
| 881 | 937 |
| 882 | 924 |
| 883 | 992 |
| 884 | 855 |
| 885 | 747 |
| 886 | 447 |
| 887 | 829 |
| 888 | 734 |
| 889 | 965 |
| 890 | 938 |
| 891 | 505 |
| 892 | 884 |
| 893 | 639 |
| 894 | 911 |
| 895 | 830 |
| 896 | 749 |
| 897 | 506 |
| 898 | 859 |
| 899 | 479 |
| 900 | 945 |
| 901 | 755 |
| 902 | 966 |
| 903 | 871 |
| 904 | 940 |
| 905 | 750 |
| 906 | 969 |
| 907 | 888 |
| 908 | 508 |
| 909 | 861 |
| 910 | 946 |
| 911 | 919 |
| 912 | 757 |
| 913 | 703 |
| 914 | 970 |
| 915 | 875 |
| 916 | 495 |
| 917 | 862 |
| 918 | 948 |
| 919 | 758 |
| 920 | 977 |
| 921 | 923 |
| 922 | 761 |
| 923 | 972 |
| 924 | 877 |
| 925 | 935 |
| 926 | 978 |
| 927 | 883 |
| 928 | 503 |
| 929 | 952 |
| 930 | 762 |
| 931 | 925 |
| 932 | 735 |
| 933 | 878 |
| 934 | 993 |
| 935 | 980 |
| 936 | 939 |
| 937 | 885 |
| 938 | 926 |
| 939 | 831 |
| 940 | 764 |
| 941 | 507 |
| 942 | 994 |
| 943 | 967 |
| 944 | 886 |
| 945 | 941 |
| 946 | 751 |
| 947 | 984 |
| 948 | 889 |
| 949 | 509 |
| 950 | 947 |
| 951 | 996 |
| 952 | 942 |
| 953 | 971 |
| 954 | 890 |
| 955 | 510 |
| 956 | 863 |
| 957 | 949 |
| 958 | 759 |
| 959 | 1000 |
| 960 | 973 |
| 961 | 892 |
| 962 | 950 |
| 963 | 979 |
| 964 | 953 |
| 965 | 763 |
| 966 | 974 |
| 967 | 879 |
| 968 | 1008 |
| 969 | 981 |
| 970 | 954 |
| 971 | 927 |
| 972 | 765 |
| 973 | 995 |
| 974 | 982 |
| 975 | 887 |
| 976 | 956 |

TABLE Q30-continued

| with a sequence length of 1024: | |
|---|---|
| Polarized channel sequence number | Reliability or reliability sequence number |
| 977 | 766 |
| 978 | 985 |
| 979 | 997 |
| 980 | 943 |
| 981 | 986 |
| 982 | 891 |
| 983 | 511 |
| 984 | 998 |
| 985 | 1001 |
| 986 | 988 |
| 987 | 893 |
| 988 | 951 |
| 989 | 1002 |
| 990 | 975 |
| 991 | 894 |
| 992 | 1009 |
| 993 | 955 |
| 994 | 1004 |
| 995 | 1010 |
| 996 | 983 |
| 997 | 957 |
| 998 | 767 |
| 999 | 1012 |
| 1000 | 958 |
| 1001 | 987 |
| 1002 | 999 |
| 1003 | 1016 |
| 1004 | 989 |
| 1005 | 1003 |
| 1006 | 990 |
| 1007 | 895 |
| 1008 | 1005 |
| 1009 | 1011 |
| 1010 | 1006 |
| 1011 | 1013 |
| 1012 | 959 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

Sequence Z30, with a sequence length of 1024:

0, 1, 2, 7, 3, 8, 11, 25, 4, 10, 13, 28, 16, 33, 35, 74, 5, 12, 14, 32, 20, 38, 46, 78, 23, 45, 42, 86, 57, 95, 100, 159, 6, 18, 22, 40, 24, 44, 51, 89, 29, 54, 59, 96, 68, 107, 112, 175, 34, 60, 72, 110, 7 7, 119, 128, 187, 85, 130, 140, 203, 146, 214, 230, 326, 9, 19, 27, 53, 30, 58, 67, 103, 36, 73, 62, 11 4, 82, 123, 135, 193, 43, 70, 84, 129, 91, 138, 145, 210, 98, 148, 162, 224, 174, 239, 254, 358, 52, 8 7, 97, 144, 109, 154, 167, 236, 117, 168, 186, 249, 195, 270, 282, 379, 132, 189, 207, 272, 212, 28 3, 302, 401, 227, 308, 322, 418, 337, 433, 458, 577, 15, 26, 31, 69, 39, 76, 80, 134, 48, 83, 92, 143, 99, 152, 157, 234, 56, 93, 102, 155, 111, 166, 182, 251, 122, 184, 191, 264, 209, 279, 299, 394, 64, 106, 118, 173, 124, 185, 198, 273, 142, 205, 213, 285, 226, 307, 319, 416, 156, 221, 237, 310, 25 0, 333, 340, 430, 271, 349, 371, 452, 386, 472, 506, 579, 66, 121, 137, 199, 151, 211, 225, 309, 16 1, 228, 240, 325, 255, 338, 357, 448, 180, 252, 265, 347, 284, 370, 384, 477, 292, 388, 403, 491, 4 22, 512, 531, 638, 196, 276, 288, 373, 311, 393, 405, 498, 336, 415, 431, 524, 453, 541, 558, 662, 355, 437, 460, 545, 471, 570, 590, 707, 503, 594, 613, 693, 629, 713, 742, 832, 21, 37, 41, 90, 49, 94, 104, 165, 50, 105, 115, 176, 125, 194, 200, 296, 63, 116, 127, 201, 139, 208, 219, 298, 147, 21 5, 233, 321, 253, 335, 344, 429, 65, 136, 149, 202, 163, 222, 238, 334, 172, 248, 256, 345, 269, 36 6, 376, 469, 171, 266, 278, 365, 291, 385, 398, 492, 313, 412, 424, 511, 436, 530, 554, 652, 75, 15 8, 164, 242, 178, 263, 277, 359, 188, 280, 287, 383, 304, 399, 414, 509, 229, 300, 312, 402, 330, 4 19, 435, 527, 352, 443, 463, 544, 478, 567, 591, 678, 259, 324, 346, 428, 362, 451, 465, 559, 378, 474, 486, 574, 508, 600, 618, 710, 404, 505, 518, 615, 529, 632, 606, 714, 555, 645, 664, 746, 67 3, 770, 784, 852, 81, 177, 181, 290, 223, 305, 314, 406, 247, 320, 332, 427, 350, 445, 462, 564, 25 7, 348, 361, 447, 372, 466, 481, 581, 389, 490, 495, 596, 526, 617, 636, 725, 293, 367, 375, 479, 3 97, 494, 519, 607, 425, 521, 532, 634, 556, 623, 659, 747, 449, 542, 565, 648, 582, 670, 690, 759, 603, 697, 695, 782, 717, 796, 813, 886, 323, 387, 413, 523, 444, 540, 551, 644, 464, 560, 571, 66 5, 593, 674, 694, 767, 485, 585, 610, 688, 621, 701, 722, 804, 642, 734, 740, 817, 758, 836, 847, 8 99, 510, 616, 633, 723, 655, 729, 756, 822, 661, 751, 766, 842, 779, 858, 871, 916, 676, 775, 790, 864, 808, 875, 869, 928, 827, 891, 897, 941, 908, 949, 955, 983, 17, 47, 55, 108, 61, 120, 131, 197, 71, 133, 141, 217, 153, 235, 243, 327, 79, 150, 160, 241, 170, 258, 268, 354, 183, 274, 289, 377, 303, 396, 409, 496, 88, 169, 179, 267, 190, 286, 297, 390, 206, 306, 318, 417, 331, 434, 446, 534, 220, 328, 343, 441, 353, 461, 473, 562, 368, 480, 493, 587, 507, 602, 612, 696, 101, 192, 204, 30 1, 218, 317, 329, 432, 231, 342, 351, 456, 364, 475, 487, 575, 246, 363, 374, 484, 392, 502, 514, 6 05, 411, 522, 538, 627, 546, 643, 654, 733, 262, 391, 408, 513, 423, 533, 543, 639, 440, 553, 568, 658, 578, 675, 684, 761, 457, 576, 592, 681, 604, 699, 709, 783, 622, 716, 728, 807, 738, 816, 84 3, 893, 113, 216, 232, 339, 245, 356, 369, 476, 261, 382, 395, 500, 410, 520, 535, 625, 281, 407, 4 21, 528, 439, 548, 563, 653, 454, 572, 584, 672, 598, 689, 700, 772, 294, 438, 450, 561, 467, 580, 595, 683, 483, 601, 620, 704, 631, 721, 732, 812, 501, 628, 641, 730, 656, 745, 752, 821, 666, 76 0, 768, 835, 780, 850, 861, 913, 316, 468, 482, 597, 497, 619, 630, 718, 517, 640, 649, 739, 663, 7 55, 765, 823, 539, 660, 671, 762, 686, 776, 787, 846, 702, 793, 798, 863, 814, 876, 888, 932, 557, 685, 698, 785, 711, 795, 805, 868, 727, 803, 818, 885, 830, 896, 905, 946, 744, 824, 844, 901, 85 1, 912, 919, 958, 874, 922, 930, 965, 940, 972, 977, 998, 126, 244, 260, 380, 275, 400, 420, 525, 2 95, 426, 442, 552, 459, 573, 586, 677, 315, 455, 470, 583, 489, 599, 614, 705, 504, 624, 637, 726, 651, 743, 750, 834, 341, 488, 499, 611, 515, 635, 647, 735, 537, 657, 669, 757, 682, 771, 781, 85 5, 550, 679, 692, 778, 706, 792, 797, 865, 719, 800, 810, 873, 831, 887, 895, 939, 360, 516, 536, 6 50, 549, 668, 680, 769, 566, 691, 703, 789, 715, 799, 802, 870, 589, 712, 724, 801, 737, 815, 826, 884, 754, 837, 849, 898, 862, 909, 917, 956, 609, 736, 749, 819, 764, 833, 854, 903, 777, 841, 85 6, 915, 877, 924, 933, 967, 791, 866, 880, 927, 892, 937, 944, 975, 907, 948, 954, 982, 961, 987, 9 91, 1007, 381, 547, 569, 687, 588, 708, 720, 811, 608, 731, 741, 820, 753, 828, 838, 894, 626, 74 8, 763, 839, 774, 848, 860, 911, 788, 853, 872, 921, 882, 931, 938, 971, 646, 773, 786, 859, 806, 8 67, 878, 925, 825, 881, 890, 936, 904, 945, 952, 980, 829, 900, 910, 950, 918, 957, 962, 988, 929, 964, 970, 993, 976, 997, 1000, 1012, 667, 794, 809, 879, 840, 889, 902, 943, 845, 906, 914, 953, 923, 960, 966, 990, 857, 920, 926, 963, 935, 969, 974, 996, 947, 978, 981, 1001, 986, 1004, 1006, 1016, 883, 934, 942, 973, 951, 979, 984, 1002, 959, 985, 989, 1005, 994, 1008, 1010, 1018, 968, 992, 995, 1009, 999, 1011, 1013, 1019, 1003, 1014, 1015, 1020, 1017, 1021, 1022, 1023

TABLE Z30 with a sequence length of 1024:

| Polarized channel sequence number | Reliability or reliability sequence number |
|---|---|
| 0 | 0 |
| 1 | 1 |
| 2 | 2 |
| 3 | 7 |
| 4 | 3 |
| 5 | 8 |
| 6 | 11 |
| 7 | 25 |
| 8 | 4 |
| 9 | 10 |
| 10 | 13 |
| 11 | 28 |
| 12 | 16 |
| 13 | 33 |
| 14 | 35 |
| 15 | 74 |
| 16 | 5 |
| 17 | 12 |
| 18 | 14 |
| 19 | 32 |
| 20 | 20 |
| 21 | 38 |
| 22 | 46 |
| 23 | 78 |
| 24 | 23 |
| 25 | 45 |
| 26 | 42 |
| 27 | 86 |
| 28 | 57 |
| 29 | 95 |
| 30 | 100 |
| 31 | 159 |
| 32 | 6 |
| 33 | 18 |
| 34 | 22 |
| 35 | 40 |
| 36 | 24 |
| 37 | 44 |
| 38 | 51 |
| 39 | 89 |
| 40 | 29 |
| 41 | 54 |
| 42 | 59 |
| 43 | 96 |
| 44 | 68 |
| 45 | 107 |
| 46 | 112 |
| 47 | 175 |
| 48 | 34 |
| 49 | 60 |
| 50 | 72 |
| 51 | 110 |
| 52 | 77 |
| 53 | 119 |
| 54 | 128 |
| 55 | 187 |
| 56 | 85 |
| 57 | 130 |
| 58 | 140 |
| 59 | 203 |
| 60 | 146 |
| 61 | 214 |
| 62 | 230 |
| 63 | 326 |
| 64 | 9 |
| 65 | 19 |
| 66 | 27 |
| 67 | 53 |
| 68 | 30 |

TABLE Z30-continued with a sequence length of 1024:

| Polarized channel sequence number | Reliability or reliability sequence number |
|---|---|
| 69 | 58 |
| 70 | 67 |
| 71 | 103 |
| 72 | 36 |
| 73 | 73 |
| 74 | 62 |
| 75 | 114 |
| 76 | 82 |
| 77 | 123 |
| 78 | 135 |
| 79 | 193 |
| 80 | 43 |
| 81 | 70 |
| 82 | 84 |
| 83 | 129 |
| 84 | 91 |
| 85 | 138 |
| 86 | 145 |
| 87 | 210 |
| 88 | 98 |
| 89 | 148 |
| 90 | 162 |
| 91 | 224 |
| 92 | 174 |
| 93 | 239 |
| 94 | 254 |
| 95 | 358 |
| 96 | 52 |
| 97 | 87 |
| 98 | 97 |
| 99 | 144 |
| 100 | 109 |
| 101 | 154 |
| 102 | 167 |
| 103 | 236 |
| 104 | 117 |
| 105 | 168 |
| 106 | 186 |
| 107 | 249 |
| 108 | 195 |
| 109 | 270 |
| 110 | 282 |
| 111 | 379 |
| 112 | 132 |
| 113 | 189 |
| 114 | 207 |
| 115 | 272 |
| 116 | 212 |
| 117 | 283 |
| 118 | 302 |
| 119 | 401 |
| 120 | 227 |
| 121 | 308 |
| 122 | 322 |
| 123 | 418 |
| 124 | 337 |
| 125 | 433 |
| 126 | 458 |
| 127 | 577 |
| 128 | 15 |
| 129 | 26 |
| 130 | 31 |
| 131 | 69 |
| 132 | 39 |
| 133 | 76 |
| 134 | 80 |
| 135 | 134 |
| 136 | 48 |
| 137 | 83 |
| 138 | 92 |
| 139 | 143 |
| 140 | 99 |
| 141 | 152 |
| 142 | 157 |
| 143 | 234 |

TABLE Z30-continued

| with a sequence length of 1024: | |
|---|---|
| Polarized channel sequence number | Reliability or reliability sequence number |
| 144 | 56 |
| 145 | 93 |
| 146 | 102 |
| 147 | 155 |
| 148 | 111 |
| 149 | 166 |
| 150 | 182 |
| 151 | 251 |
| 152 | 122 |
| 153 | 184 |
| 154 | 191 |
| 155 | 264 |
| 156 | 209 |
| 157 | 279 |
| 158 | 299 |
| 159 | 394 |
| 160 | 64 |
| 161 | 106 |
| 162 | 118 |
| 163 | 173 |
| 164 | 124 |
| 165 | 185 |
| 166 | 198 |
| 167 | 273 |
| 168 | 142 |
| 169 | 205 |
| 170 | 213 |
| 171 | 285 |
| 172 | 226 |
| 173 | 307 |
| 174 | 319 |
| 175 | 416 |
| 176 | 156 |
| 177 | 221 |
| 178 | 237 |
| 179 | 310 |
| 180 | 250 |
| 181 | 333 |
| 182 | 340 |
| 183 | 430 |
| 184 | 271 |
| 185 | 349 |
| 186 | 371 |
| 187 | 452 |
| 188 | 386 |
| 189 | 472 |
| 190 | 506 |
| 191 | 579 |
| 192 | 66 |
| 193 | 121 |
| 194 | 137 |
| 195 | 199 |
| 196 | 151 |
| 197 | 211 |
| 198 | 225 |
| 199 | 309 |
| 200 | 161 |
| 201 | 228 |
| 202 | 240 |
| 203 | 325 |
| 204 | 255 |
| 205 | 338 |
| 206 | 357 |
| 207 | 448 |
| 208 | 180 |
| 209 | 252 |
| 210 | 265 |
| 211 | 347 |
| 212 | 284 |
| 213 | 370 |
| 214 | 384 |
| 215 | 477 |
| 216 | 292 |
| 217 | 388 |
| 218 | 403 |

TABLE Z30-continued

| with a sequence length of 1024: | |
|---|---|
| Polarized channel sequence number | Reliability or reliability sequence number |
| 219 | 491 |
| 220 | 422 |
| 221 | 512 |
| 222 | 531 |
| 223 | 638 |
| 224 | 196 |
| 225 | 276 |
| 226 | 288 |
| 227 | 373 |
| 228 | 311 |
| 229 | 393 |
| 230 | 405 |
| 231 | 498 |
| 232 | 336 |
| 233 | 415 |
| 234 | 431 |
| 235 | 524 |
| 236 | 453 |
| 237 | 541 |
| 238 | 558 |
| 239 | 662 |
| 240 | 355 |
| 241 | 437 |
| 242 | 460 |
| 243 | 545 |
| 244 | 471 |
| 245 | 570 |
| 246 | 590 |
| 247 | 707 |
| 248 | 503 |
| 249 | 594 |
| 250 | 613 |
| 251 | 693 |
| 252 | 629 |
| 253 | 713 |
| 254 | 742 |
| 255 | 832 |
| 256 | 21 |
| 257 | 37 |
| 258 | 41 |
| 259 | 90 |
| 260 | 49 |
| 261 | 94 |
| 262 | 104 |
| 263 | 165 |
| 264 | 50 |
| 265 | 105 |
| 266 | 115 |
| 267 | 176 |
| 268 | 125 |
| 269 | 194 |
| 270 | 200 |
| 271 | 296 |
| 272 | 63 |
| 273 | 116 |
| 274 | 127 |
| 275 | 201 |
| 276 | 139 |
| 277 | 208 |
| 278 | 219 |
| 279 | 298 |
| 280 | 147 |
| 281 | 215 |
| 282 | 233 |
| 283 | 321 |
| 284 | 253 |
| 285 | 335 |
| 286 | 344 |
| 287 | 429 |
| 288 | 65 |
| 289 | 136 |
| 290 | 149 |
| 291 | 202 |
| 292 | 163 |
| 293 | 222 |

TABLE Z30-continued with a sequence length of 1024:

| Polarized channel sequence number | Reliability or reliability sequence number |
|---|---|
| 294 | 238 |
| 295 | 334 |
| 296 | 172 |
| 297 | 248 |
| 298 | 256 |
| 299 | 345 |
| 300 | 269 |
| 301 | 366 |
| 302 | 376 |
| 303 | 469 |
| 304 | 171 |
| 305 | 266 |
| 306 | 278 |
| 307 | 365 |
| 308 | 291 |
| 309 | 385 |
| 310 | 398 |
| 311 | 492 |
| 312 | 313 |
| 313 | 412 |
| 314 | 424 |
| 315 | 511 |
| 316 | 436 |
| 317 | 530 |
| 318 | 554 |
| 319 | 652 |
| 320 | 75 |
| 321 | 158 |
| 322 | 164 |
| 323 | 242 |
| 324 | 178 |
| 325 | 263 |
| 326 | 277 |
| 327 | 359 |
| 328 | 188 |
| 329 | 280 |
| 330 | 287 |
| 331 | 383 |
| 332 | 304 |
| 333 | 399 |
| 334 | 414 |
| 335 | 509 |
| 336 | 229 |
| 337 | 300 |
| 338 | 312 |
| 339 | 402 |
| 340 | 330 |
| 341 | 419 |
| 342 | 435 |
| 343 | 527 |
| 344 | 352 |
| 345 | 443 |
| 346 | 463 |
| 347 | 544 |
| 348 | 478 |
| 349 | 567 |
| 350 | 591 |
| 351 | 678 |
| 352 | 259 |
| 353 | 324 |
| 354 | 346 |
| 355 | 428 |
| 356 | 362 |
| 357 | 451 |
| 358 | 465 |
| 359 | 559 |
| 360 | 378 |
| 361 | 474 |
| 362 | 486 |
| 363 | 574 |
| 364 | 508 |
| 365 | 600 |
| 366 | 618 |
| 367 | 710 |
| 368 | 404 |

TABLE Z30-continued with a sequence length of 1024:

| Polarized channel sequence number | Reliability or reliability sequence number |
|---|---|
| 369 | 505 |
| 370 | 518 |
| 371 | 615 |
| 372 | 529 |
| 373 | 632 |
| 374 | 606 |
| 375 | 714 |
| 376 | 555 |
| 377 | 645 |
| 378 | 664 |
| 379 | 746 |
| 380 | 673 |
| 381 | 770 |
| 382 | 784 |
| 383 | 852 |
| 384 | 81 |
| 385 | 177 |
| 386 | 181 |
| 387 | 290 |
| 388 | 223 |
| 389 | 305 |
| 390 | 314 |
| 391 | 406 |
| 392 | 247 |
| 393 | 320 |
| 394 | 332 |
| 395 | 427 |
| 396 | 350 |
| 397 | 445 |
| 398 | 462 |
| 399 | 564 |
| 400 | 257 |
| 401 | 348 |
| 402 | 361 |
| 403 | 447 |
| 404 | 372 |
| 405 | 466 |
| 406 | 481 |
| 407 | 581 |
| 408 | 389 |
| 409 | 490 |
| 410 | 495 |
| 411 | 596 |
| 412 | 526 |
| 413 | 617 |
| 414 | 636 |
| 415 | 725 |
| 416 | 293 |
| 417 | 367 |
| 418 | 375 |
| 419 | 479 |
| 420 | 397 |
| 421 | 494 |
| 422 | 519 |
| 423 | 607 |
| 424 | 425 |
| 425 | 521 |
| 426 | 532 |
| 427 | 634 |
| 428 | 556 |
| 429 | 623 |
| 430 | 659 |
| 431 | 747 |
| 432 | 449 |
| 433 | 542 |
| 434 | 565 |
| 435 | 648 |
| 436 | 582 |
| 437 | 670 |
| 438 | 690 |
| 439 | 759 |
| 440 | 603 |
| 441 | 697 |
| 442 | 695 |
| 443 | 782 |

TABLE Z30-continued with a sequence length of 1024:

| Polarized channel sequence number | Reliability or reliability sequence number |
|---|---|
| 444 | 717 |
| 445 | 796 |
| 446 | 813 |
| 447 | 886 |
| 448 | 323 |
| 449 | 387 |
| 450 | 413 |
| 451 | 523 |
| 452 | 444 |
| 453 | 540 |
| 454 | 551 |
| 455 | 644 |
| 456 | 464 |
| 457 | 560 |
| 458 | 571 |
| 459 | 665 |
| 460 | 593 |
| 461 | 674 |
| 462 | 694 |
| 463 | 767 |
| 464 | 485 |
| 465 | 585 |
| 466 | 610 |
| 467 | 688 |
| 468 | 621 |
| 469 | 701 |
| 470 | 722 |
| 471 | 804 |
| 472 | 642 |
| 473 | 734 |
| 474 | 740 |
| 475 | 817 |
| 476 | 758 |
| 477 | 836 |
| 478 | 847 |
| 479 | 899 |
| 480 | 510 |
| 481 | 616 |
| 482 | 633 |
| 483 | 723 |
| 484 | 655 |
| 485 | 729 |
| 486 | 756 |
| 487 | 822 |
| 488 | 661 |
| 489 | 751 |
| 490 | 766 |
| 491 | 842 |
| 492 | 779 |
| 493 | 858 |
| 494 | 871 |
| 495 | 916 |
| 496 | 676 |
| 497 | 775 |
| 498 | 790 |
| 499 | 864 |
| 500 | 808 |
| 501 | 875 |
| 502 | 869 |
| 503 | 928 |
| 504 | 827 |
| 505 | 891 |
| 506 | 897 |
| 507 | 941 |
| 508 | 908 |
| 509 | 949 |
| 510 | 955 |
| 511 | 983 |
| 512 | 17 |
| 513 | 47 |
| 514 | 55 |
| 515 | 108 |
| 516 | 61 |
| 517 | 120 |
| 518 | 131 |

TABLE Z30-continued with a sequence length of 1024:

| Polarized channel sequence number | Reliability or reliability sequence number |
|---|---|
| 519 | 197 |
| 520 | 71 |
| 521 | 133 |
| 522 | 141 |
| 523 | 217 |
| 524 | 153 |
| 525 | 235 |
| 526 | 243 |
| 527 | 327 |
| 528 | 79 |
| 529 | 150 |
| 530 | 160 |
| 531 | 241 |
| 532 | 170 |
| 533 | 258 |
| 534 | 268 |
| 535 | 354 |
| 536 | 183 |
| 537 | 274 |
| 538 | 289 |
| 539 | 377 |
| 540 | 303 |
| 541 | 396 |
| 542 | 409 |
| 543 | 496 |
| 544 | 88 |
| 545 | 169 |
| 546 | 179 |
| 547 | 267 |
| 548 | 190 |
| 549 | 286 |
| 550 | 297 |
| 551 | 390 |
| 552 | 206 |
| 553 | 306 |
| 554 | 318 |
| 555 | 417 |
| 556 | 331 |
| 557 | 434 |
| 558 | 446 |
| 559 | 534 |
| 560 | 220 |
| 561 | 328 |
| 562 | 343 |
| 563 | 441 |
| 564 | 353 |
| 565 | 461 |
| 566 | 473 |
| 567 | 562 |
| 568 | 368 |
| 569 | 480 |
| 570 | 493 |
| 571 | 587 |
| 572 | 507 |
| 573 | 602 |
| 574 | 612 |
| 575 | 696 |
| 576 | 101 |
| 577 | 192 |
| 578 | 204 |
| 579 | 301 |
| 580 | 218 |
| 581 | 317 |
| 582 | 329 |
| 583 | 432 |
| 584 | 231 |
| 585 | 342 |
| 586 | 351 |
| 587 | 456 |
| 588 | 364 |
| 589 | 475 |
| 590 | 487 |
| 591 | 575 |
| 592 | 246 |
| 593 | 363 |

TABLE Z30-continued

| with a sequence length of 1024: | |
|---|---|
| Polarized channel sequence number | Reliability or reliability sequence number |
| 594 | 374 |
| 595 | 484 |
| 596 | 392 |
| 597 | 502 |
| 598 | 514 |
| 599 | 605 |
| 600 | 411 |
| 601 | 522 |
| 602 | 538 |
| 603 | 627 |
| 604 | 546 |
| 605 | 643 |
| 606 | 654 |
| 607 | 733 |
| 608 | 262 |
| 609 | 391 |
| 610 | 408 |
| 611 | 513 |
| 612 | 423 |
| 613 | 533 |
| 614 | 543 |
| 615 | 639 |
| 616 | 440 |
| 617 | 553 |
| 618 | 568 |
| 619 | 658 |
| 620 | 578 |
| 621 | 675 |
| 622 | 684 |
| 623 | 761 |
| 624 | 457 |
| 625 | 576 |
| 626 | 592 |
| 627 | 681 |
| 628 | 604 |
| 629 | 699 |
| 630 | 709 |
| 631 | 783 |
| 632 | 622 |
| 633 | 716 |
| 634 | 728 |
| 635 | 807 |
| 636 | 738 |
| 637 | 816 |
| 638 | 843 |
| 639 | 893 |
| 640 | 113 |
| 641 | 216 |
| 642 | 232 |
| 643 | 339 |
| 644 | 245 |
| 645 | 356 |
| 646 | 369 |
| 647 | 476 |
| 648 | 261 |
| 649 | 382 |
| 650 | 395 |
| 651 | 500 |
| 652 | 410 |
| 653 | 520 |
| 654 | 535 |
| 655 | 625 |
| 656 | 281 |
| 657 | 407 |
| 658 | 421 |
| 659 | 528 |
| 660 | 439 |
| 661 | 548 |
| 662 | 563 |
| 663 | 653 |
| 664 | 454 |
| 665 | 572 |
| 666 | 584 |
| 667 | 672 |
| 668 | 598 |

TABLE Z30-continued

| with a sequence length of 1024: | |
|---|---|
| Polarized channel sequence number | Reliability or reliability sequence number |
| 669 | 689 |
| 670 | 700 |
| 671 | 772 |
| 672 | 294 |
| 673 | 438 |
| 674 | 450 |
| 675 | 561 |
| 676 | 467 |
| 677 | 580 |
| 678 | 595 |
| 679 | 683 |
| 680 | 483 |
| 681 | 601 |
| 682 | 620 |
| 683 | 704 |
| 684 | 631 |
| 685 | 721 |
| 686 | 732 |
| 687 | 812 |
| 688 | 501 |
| 689 | 628 |
| 690 | 641 |
| 691 | 730 |
| 692 | 656 |
| 693 | 745 |
| 694 | 752 |
| 695 | 821 |
| 696 | 666 |
| 697 | 760 |
| 698 | 768 |
| 699 | 835 |
| 700 | 780 |
| 701 | 850 |
| 702 | 861 |
| 703 | 913 |
| 704 | 316 |
| 705 | 468 |
| 706 | 482 |
| 707 | 597 |
| 708 | 497 |
| 709 | 619 |
| 710 | 630 |
| 711 | 718 |
| 712 | 517 |
| 713 | 640 |
| 714 | 649 |
| 715 | 739 |
| 716 | 663 |
| 717 | 755 |
| 718 | 765 |
| 719 | 823 |
| 720 | 539 |
| 721 | 660 |
| 722 | 671 |
| 723 | 762 |
| 724 | 686 |
| 725 | 776 |
| 726 | 787 |
| 727 | 846 |
| 728 | 702 |
| 729 | 793 |
| 730 | 798 |
| 731 | 863 |
| 732 | 814 |
| 733 | 876 |
| 734 | 888 |
| 735 | 932 |
| 736 | 557 |
| 737 | 685 |
| 738 | 698 |
| 739 | 785 |
| 740 | 711 |
| 741 | 795 |
| 742 | 805 |
| 743 | 868 |

TABLE Z30-continued with a sequence length of 1024:

| Polarized channel sequence number | Reliability or reliability sequence number |
|---|---|
| 744 | 727 |
| 745 | 803 |
| 746 | 818 |
| 747 | 885 |
| 748 | 830 |
| 749 | 896 |
| 750 | 905 |
| 751 | 946 |
| 752 | 744 |
| 753 | 824 |
| 754 | 844 |
| 755 | 901 |
| 756 | 851 |
| 757 | 912 |
| 758 | 919 |
| 759 | 958 |
| 760 | 874 |
| 761 | 922 |
| 762 | 930 |
| 763 | 965 |
| 764 | 940 |
| 765 | 972 |
| 766 | 977 |
| 767 | 998 |
| 768 | 126 |
| 769 | 244 |
| 770 | 260 |
| 771 | 380 |
| 772 | 275 |
| 773 | 400 |
| 774 | 420 |
| 775 | 525 |
| 776 | 295 |
| 777 | 426 |
| 778 | 442 |
| 779 | 552 |
| 780 | 459 |
| 781 | 573 |
| 782 | 586 |
| 783 | 677 |
| 784 | 315 |
| 785 | 455 |
| 786 | 470 |
| 787 | 583 |
| 788 | 489 |
| 789 | 599 |
| 790 | 614 |
| 791 | 705 |
| 792 | 504 |
| 793 | 624 |
| 794 | 637 |
| 795 | 726 |
| 796 | 651 |
| 797 | 743 |
| 798 | 750 |
| 799 | 834 |
| 800 | 341 |
| 801 | 488 |
| 802 | 499 |
| 803 | 611 |
| 804 | 515 |
| 805 | 635 |
| 806 | 647 |
| 807 | 735 |
| 808 | 537 |
| 809 | 657 |
| 810 | 669 |
| 811 | 757 |
| 812 | 682 |
| 813 | 771 |
| 814 | 781 |
| 815 | 855 |
| 816 | 550 |
| 817 | 679 |
| 818 | 692 |

TABLE Z30-continued with a sequence length of 1024:

| Polarized channel sequence number | Reliability or reliability sequence number |
|---|---|
| 819 | 778 |
| 820 | 706 |
| 821 | 792 |
| 822 | 797 |
| 823 | 865 |
| 824 | 719 |
| 825 | 800 |
| 826 | 810 |
| 827 | 873 |
| 828 | 831 |
| 829 | 887 |
| 830 | 895 |
| 831 | 939 |
| 832 | 360 |
| 833 | 516 |
| 834 | 536 |
| 835 | 650 |
| 836 | 549 |
| 837 | 668 |
| 838 | 680 |
| 839 | 769 |
| 840 | 566 |
| 841 | 691 |
| 842 | 703 |
| 843 | 789 |
| 844 | 715 |
| 845 | 799 |
| 846 | 802 |
| 847 | 870 |
| 848 | 589 |
| 849 | 712 |
| 850 | 724 |
| 851 | 801 |
| 852 | 737 |
| 853 | 815 |
| 854 | 826 |
| 855 | 884 |
| 856 | 754 |
| 857 | 837 |
| 858 | 849 |
| 859 | 898 |
| 860 | 862 |
| 861 | 909 |
| 862 | 917 |
| 863 | 956 |
| 864 | 609 |
| 865 | 736 |
| 866 | 749 |
| 867 | 819 |
| 868 | 764 |
| 869 | 833 |
| 870 | 854 |
| 871 | 903 |
| 872 | 777 |
| 873 | 841 |
| 874 | 856 |
| 875 | 915 |
| 876 | 877 |
| 877 | 924 |
| 878 | 933 |
| 879 | 967 |
| 880 | 791 |
| 881 | 866 |
| 882 | 880 |
| 883 | 927 |
| 884 | 892 |
| 885 | 937 |
| 886 | 944 |
| 887 | 975 |
| 888 | 907 |
| 889 | 948 |
| 890 | 954 |
| 891 | 982 |
| 892 | 961 |
| 893 | 987 |

TABLE Z30-continued with a sequence length of 1024:

| Polarized channel sequence number | Reliability or reliability sequence number |
|---|---|
| 894 | 991 |
| 895 | 1007 |
| 896 | 381 |
| 897 | 547 |
| 898 | 569 |
| 899 | 687 |
| 900 | 588 |
| 901 | 708 |
| 902 | 720 |
| 903 | 811 |
| 904 | 608 |
| 905 | 731 |
| 906 | 741 |
| 907 | 820 |
| 908 | 753 |
| 909 | 828 |
| 910 | 838 |
| 911 | 894 |
| 912 | 626 |
| 913 | 748 |
| 914 | 763 |
| 915 | 839 |
| 916 | 774 |
| 917 | 848 |
| 918 | 860 |
| 919 | 911 |
| 920 | 788 |
| 921 | 853 |
| 922 | 872 |
| 923 | 921 |
| 924 | 882 |
| 925 | 931 |
| 926 | 938 |
| 927 | 971 |
| 928 | 646 |
| 929 | 773 |
| 930 | 786 |
| 931 | 859 |
| 932 | 806 |
| 933 | 867 |
| 934 | 878 |
| 935 | 925 |
| 936 | 825 |
| 937 | 881 |
| 938 | 890 |
| 939 | 936 |
| 940 | 904 |
| 941 | 945 |
| 942 | 952 |
| 943 | 980 |
| 944 | 829 |
| 945 | 900 |
| 946 | 910 |
| 947 | 950 |
| 948 | 918 |
| 949 | 957 |
| 950 | 962 |
| 951 | 988 |
| 952 | 929 |
| 953 | 964 |
| 954 | 970 |
| 955 | 993 |
| 956 | 976 |
| 957 | 997 |
| 958 | 1000 |
| 959 | 1012 |
| 960 | 667 |
| 961 | 794 |
| 962 | 809 |
| 963 | 879 |
| 964 | 840 |
| 965 | 889 |
| 966 | 902 |
| 967 | 943 |
| 968 | 845 |
| 969 | 906 |
| 970 | 914 |
| 971 | 953 |
| 972 | 923 |
| 973 | 960 |
| 974 | 966 |
| 975 | 990 |
| 976 | 857 |
| 977 | 920 |
| 978 | 926 |
| 979 | 963 |
| 980 | 935 |
| 981 | 969 |
| 982 | 974 |
| 983 | 996 |
| 984 | 947 |
| 985 | 978 |
| 986 | 981 |
| 987 | 1001 |
| 988 | 986 |
| 989 | 1004 |
| 990 | 1006 |
| 991 | 1016 |
| 992 | 883 |
| 993 | 934 |
| 994 | 942 |
| 995 | 973 |
| 996 | 951 |
| 997 | 979 |
| 998 | 984 |
| 999 | 1002 |
| 1000 | 959 |
| 1001 | 985 |
| 1002 | 989 |
| 1003 | 1005 |
| 1004 | 994 |
| 1005 | 1008 |
| 1006 | 1010 |
| 1007 | 1018 |
| 1008 | 968 |
| 1009 | 992 |
| 1010 | 995 |
| 1011 | 1009 |
| 1012 | 999 |
| 1013 | 1011 |
| 1014 | 1013 |
| 1015 | 1019 |
| 1016 | 1003 |
| 1017 | 1014 |
| 1018 | 1015 |
| 1019 | 1020 |
| 1020 | 1017 |
| 1021 | 1021 |
| 1022 | 1022 |
| 1023 | 1023 |

It should be noted that the foregoing sequences are merely some examples, and application of the sequences to a polar coding process can improve polar code encoding/decoding performance. In any one of the example sequences, without affecting an overall effect, adjustments or equivalent replacements including but not limited to the following aspects may be made:

1. Locations of a few elements in the sequence are interchanged. For example, a location of a sequence number may be adjusted within a specified range. For example, if the specified range is 5, a location of an element whose sequence number is 10 may be adjusted within a range between a fifth location to the left of the element and a fifth location to the right of the element.

2. Some elements in the sequence are adjusted, but channel sets that are selected based on the sequence and that are used to transmit T-bit information are consistent or similar.

3. The sequence includes N elements from 0 to N−1, and the N elements from 0 to N−1 represent sequence numbers of N polarized channels. Actually, the sequence numbers of the N polarized channels may be alternatively from 1 to N, and are obtained by adding 1 to each sequence number in the sequence. This is also a form of a sequence number in the foregoing calculation methods. Certainly, another manner may be alternatively used to indicate the sequence numbers or identifiers of the polarized channels. The specific expression manner does not affect specific locations of the polarized channels indicated in the sequence.

4. The sequence numbers of the N polarized channels in the sequence are arranged in ascending order of reliability of the N polarized channels. In this case, selecting K polarized channels in descending order of reliability means selecting polarized channels corresponding to the last K sequence numbers in any one of the foregoing sequences. Actually, the sequence numbers of the N polarized channels may be alternatively arranged in descending order of reliability of the N polarized channels, in other words, elements in the sequence are arranged in reverse order. In this case, selecting K polarized channels in descending order of reliability means selecting polarized channels corresponding to the first K sequence numbers.

5. The sequence may be alternatively represented by using a sequence of normalized reliability or equivalent reliability of all channels. For example, if a sorting location of a channel x in the sequence is n (the leftmost is denoted as 1), reliability of the channel may be indicated as n or normalized n/N, where N is a length of the sequence.

Figure 3:
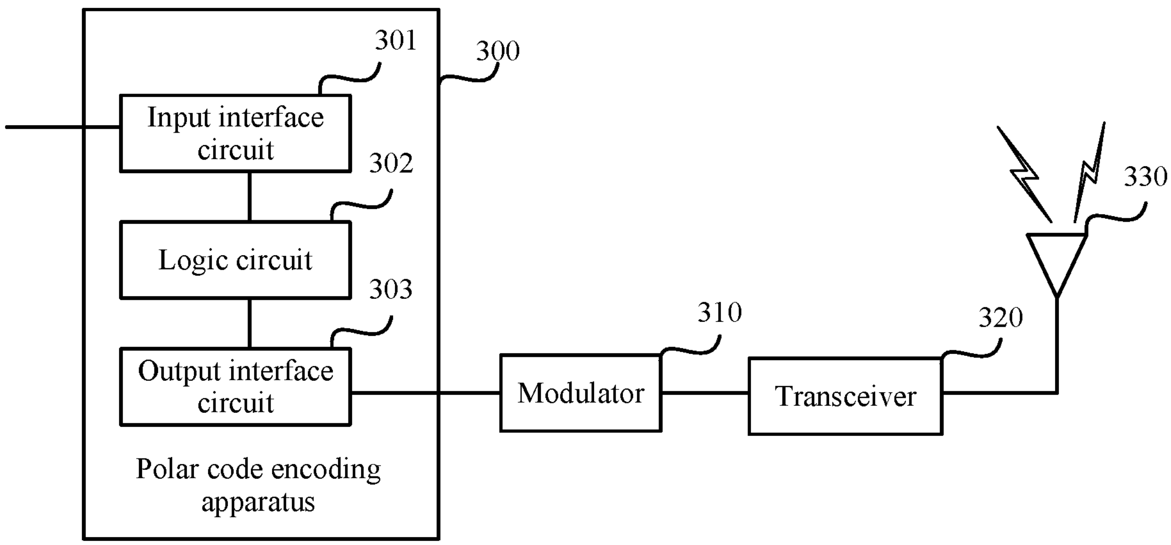
FIG. 3 is a first schematic structural diagram of a polar code encoding apparatus according to an embodiment of this application.

Based on a same inventive concept of the polar code encoding method shown in FIG. 2, as shown in FIG. 3, an embodiment of this application further provides a polar code encoding apparatus 300. The polar code encoding apparatus 300 is configured to perform the polar code encoding method shown in FIG. 2. A part or all of the polar code encoding method shown in FIG. 3 may be implemented by using hardware or software. When the method is implemented by using hardware, the polar code encoding apparatus 300 includes: an input interface circuit 301, configured to obtain a to-be-encoded bit; a logic circuit 302, configured to perform the polar code encoding method shown in FIG. 2, where for details, reference may be made to descriptions in the foregoing method embodiment, and details are not described herein again; and an output interface circuit 303, configured to output an encoded bit sequence.

Further, a modulator 310 modulates the encoded bit sequence output by the encoding apparatus 300, and then outputs a modulated bit sequence to a transceiver 320. The transceiver 320 performs corresponding processing (including but not limited to digital-to-analog conversion and/or frequency conversion) on the modulated sequence, and then sends, by using an antenna 330, a sequence obtained after processing.

Optionally, in specific implementation, the polar code encoding apparatus 300 may be a chip or an integrated circuit.

Figure 4:
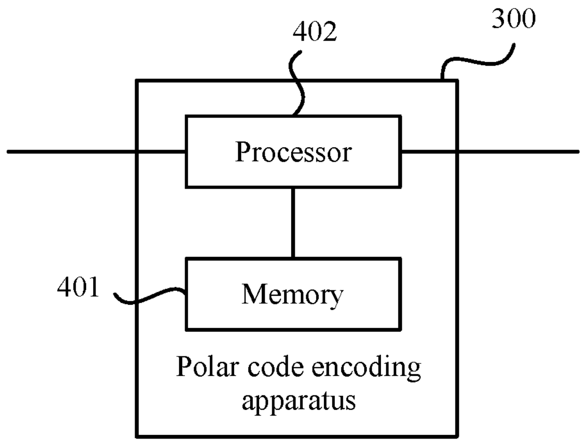
FIG. 4 is a second schematic structural diagram of a polar code encoding apparatus according to an embodiment of this application.

Optionally, when a part or all of the polar code encoding method in the foregoing embodiment is implemented by using software, as shown in FIG. 4, a polar code encoding apparatus 300 includes: a memory 401, configured to store a program; and a processor 402, configured to execute the program stored in the memory 401. When the program is executed, the polar code encoding apparatus 300 may implement the polar code encoding method provided in the embodiment in FIG. 2.

Figure 5:
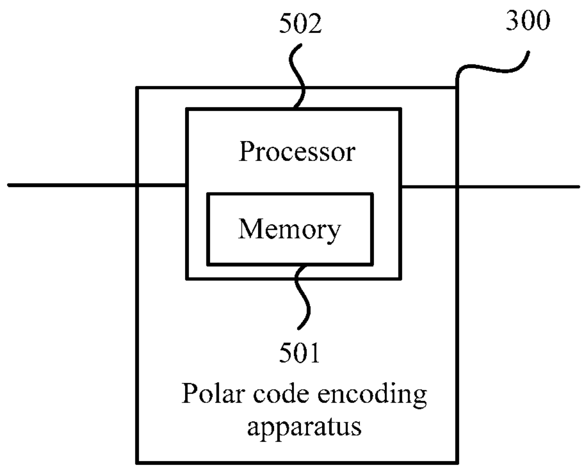
FIG. 5 is a third schematic structural diagram of a polar code encoding apparatus according to an embodiment of this application.

Optionally, the memory 401 may be a physically independent unit. Alternatively, as shown in FIG. 5, a memory 501 may be integrated with a processor 502.

Optionally, when a part or all of the encoding method in the embodiment in FIG. 2 is implemented by using software, the polar code transmission apparatus 300 may include only a processor 402. A memory 401 configured to store a program is located outside the polar code transmission apparatus 300. The processor 402 is connected to the memory 401 by using a circuit/wire, and is configured to read and execute the program stored in the memory 401.

The processor 402 may be a central processing unit (CPU), a network processor (NP), or a combination of a CPU and an NP.

The processor 402 may further include a hardware chip. The hardware chip may be an application-specific integrated circuit (ASIC), a programmable logic device (PLD), or a combination thereof. The PLD may be a complex programmable logic device (CPLD), a field programmable gate array (FPGA), generic array logic (GAL), or any combination thereof.

The memory in the foregoing embodiments may include a volatile memory, for example, a random access memory (RAM). The memory may also include a non-volatile memory, for example, a flash memory, a hard disk drive (HDD), or a solid-state drive (SSD). The memory may further include a combination of the foregoing types of memories.

Figure 6:
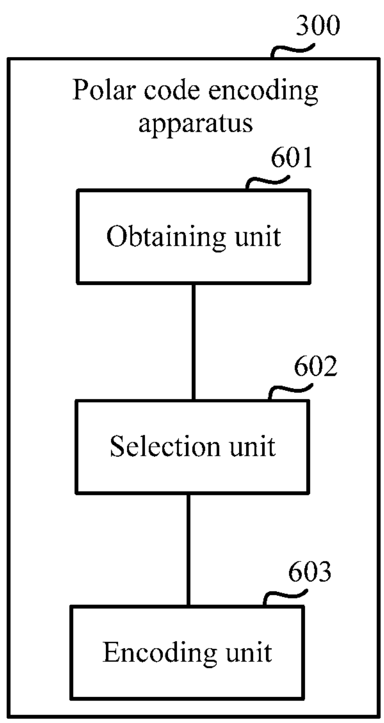
FIG. 6 is a fourth schematic structural diagram of a polar code encoding apparatus according to an embodiment of this application.

Based on the polar code encoding method shown in FIG. 2, as shown in FIG. 6, an embodiment of this application further provides a polar code encoding apparatus 300. The polar code encoding apparatus 300 is configured to perform the polar code encoding method shown in FIG. 2. The polar code encoding apparatus 300 includes:

- an obtaining unit 601, configured to obtain a first sequence used to encode K to-be-encoded bits, where the first sequence includes sequence numbers of N polarized channels, the sequence numbers of the N polarized channels are arranged in the first sequence based on reliability of the N polarized channels, K is a positive integer, N is a mother code length of a polar code, N is a positive integer power of 2, and $K \le N$;
- a selection unit 602, configured to select sequence numbers of K polarized channels from the first sequence in ascending order of reliability; and
- an encoding unit 603, configured to: place the to-be-encoded bits based on the selected sequence numbers of the K polarized channels, and perform polar code encoding on the to-be-encoded bits.

The first sequence may be any one of the foregoing example sequences, or may be a sequence of sequence numbers that are less than N (the sequence numbers start from 0) and that are selected from a second sequence of a length $N_{max}$. The second sequence may be any one of the foregoing example sequences. Reliability of an $i^{th}$ polarized channel in the N polarized channels may also be determined by using a formula in any one of the foregoing examples.

An embodiment of this application further provides a computer storage medium. The computer storage medium stores a computer program, and the computer program includes an instruction used to perform the polar code encoding method shown in FIG. 2.

An embodiment of this application further provides a computer program product including an instruction. When the computer program product runs on a computer, the computer performs the polar code encoding method shown in FIG. 2.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of another programmable data processing device generate an apparatus for implementing a specific function in one or more processes in the flowcharts and/or in one or more blocks in the block diagrams.

These computer program instructions may be stored in a computer readable memory that can instruct the computer or the another programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of this application have been described, persons skilled in the art can make changes and modifications to these embodiments once they learn the basic inventive concept. Therefore, the following claims are construed as to cover the preferred embodiments and all changes and modifications falling within the scope of this application.

Obviously, persons skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

What is claimed is:

1. A polar code encoding method, comprising:

obtaining, by an encoding apparatus, a first sequence used to encode K to-be-encoded bits, wherein the first sequence comprises sequence numbers of N polarized channels, wherein the sequence numbers of the N polarized channels are arranged in the first sequence based on reliability of the N polarized channels, wherein K is a positive integer, wherein N is a mother code length of a polar code, wherein $N=2^n$, wherein n is a positive integer, and wherein K≤N;

selecting sequence numbers of K polarized channels from the first sequence in descending order of reliability; and placing the K to-be-encoded bits based on the selected sequence numbers of the K polarized channels, and performing polar code encoding on the K to-be-encoded bits.

2. The method according to claim 1, wherein the first sequence is all or a subset of a second sequence, wherein sequence numbers of N polarized channels in the second sequence are arranged in ascending order of reliability of the N polarized channels, and wherein a minimum value of the sequence numbers of the polarized channels is 0.

3. The method according to claim 1, wherein the first sequence is all or a subset of a second sequence, wherein the second sequence comprises sequence numbers of $N_{max}$ polarized channels, wherein the sequence numbers of the $N_{max}$ polarized channels are arranged in the second sequence based on reliability of the $N_{max}$ polarized channels, wherein $N_{max}$ is a positive integer, wherein $N_{max} \geq N$, and wherein sorting of the sequence numbers of the polarized channels in the first sequence is consistent with sorting of sequence numbers of polarized channels that are less than N in the second sequence.

4. The method according to claim 3, wherein sequence numbers of N polarized channels in the second sequence are arranged in ascending order of reliability of the N polarized channels, and wherein a minimum value of the sequence numbers of the polarized channels is 0.

5. The method according to claim 3, wherein each of sequence numbers of N polarized channels in the second sequence corresponds to a reliability ranking of the sequence number in the entire sequence, and wherein a minimum value of the sequence numbers of the polarized channels is 0.

6. The method according to claim 1, wherein the first sequence is all or a subset of a second sequence, wherein each of sequence numbers of N polarized channels in the second sequence corresponds to a reliability ranking of the sequence number in the entire sequence, and wherein a minimum value of the sequence numbers of the polarized channels is 0.

7. A polar code encoding apparatus, comprising:

at least one processor; and a non-transitory computer-readable storage medium coupled to the at least one processor and storing programming instructions for execution by the at least one processor, the programming instructions instruct the at least one processor to:

obtain a first sequence used to encode K to-be-encoded bits, wherein the first sequence comprises sequence numbers of N polarized channels, wherein the sequence numbers of the N polarized channels are arranged in the first sequence based on reliability of the N polarized channels, wherein K is a positive integer, wherein N is a mother code length of a polar code, wherein $N=2^n$, wherein n is a positive integer, and wherein K≤N;

select sequence numbers of K polarized channels from the first sequence in descending order of reliability; and place the K to-be-encoded bits based on the selected sequence numbers of the K polarized channels, and perform polar code encoding on the K to-be-encoded bits.

8. The apparatus according to claim 7, wherein the first sequence is all or a subset of a second sequence, wherein sequence numbers of N polarized channels in the second sequence are arranged in ascending order of reliability of the N polarized channels, and wherein a minimum value of the sequence numbers of the polarized channels is 0.

9. The apparatus according to claim 7, wherein the first sequence is all or a subset of a second sequence, wherein the second sequence comprises sequence numbers of $N_{max}$ polarized channels, wherein the sequence numbers of the $N_{max}$ polarized channels are arranged in the second sequence based on reliability of the $N_{max}$ polarized channels, wherein $N_{max}$ is a positive integer, $N_{max} \geq N$, and wherein sorting of the sequence numbers of the polarized channels in the first sequence is consistent with sorting of sequence numbers of polarized channels that are less than N in the second sequence.

10. The apparatus according to claim 9, wherein sequence numbers of N polarized channels in the second sequence are arranged in ascending order of reliability of the N polarized channels, and wherein a minimum value of the sequence numbers of the polarized channels is 0.

11. The apparatus according to claim 9, wherein each of sequence numbers of N polarized channels in the second sequence corresponds to a reliability ranking of the sequence number in the entire sequence, and wherein a minimum value of the sequence numbers of the polarized channels is 0.

12. The apparatus according to claim 7, wherein the first sequence is all or a subset of a second sequence, wherein each of sequence numbers of N polarized channels in the second sequence corresponds to a reliability ranking of the sequence number in the entire sequence, and wherein a minimum value of the sequence numbers of the polarized channels is 0.

13. The apparatus according to claim 7, wherein the apparatus is a chip or an integrated circuit.

14. A communications system, wherein the communications system comprises a network device and a terminal, and wherein the network device or the terminal performs operations comprising:

obtaining a first sequence used to encode K to-be-encoded bits, wherein the first sequence comprises sequence numbers of N polarized channels, wherein the sequence numbers of the N polarized channels are arranged in the first sequence based on reliability of the N polarized channels, wherein K is a positive integer, wherein N is a mother code length of a polar code, wherein $N=2^n$, wherein n is a positive integer, and wherein $K \leq N$;

selecting sequence numbers of K polarized channels from the first sequence in descending order of reliability; and placing the K to-be-encoded bits based on the selected sequence numbers of the K polarized channels, and performing polar code encoding on the K to-be-encoded bits.

15. The communications system according to claim 14, wherein the first sequence is all or a subset of a second sequence, wherein sequence numbers of N polarized channels in the second sequence are arranged in ascending order of reliability of the N polarized channels, and wherein a minimum value of the sequence numbers of the polarized channels is 0.

16. The communications system according to claim 14, wherein the first sequence is all or a subset of a second sequence, wherein the second sequence comprises sequence numbers of $N_{max}$ polarized channels, wherein the sequence numbers of the $N_{max}$ polarized channels are arranged in the second sequence based on reliability of the $N_{max}$ polarized channels, wherein $N_{max}$ is a positive integer, wherein $N_{max} \geq N$, and wherein sorting of the sequence numbers of the polarized channels in the first sequence is consistent with sorting of sequence numbers of polarized channels that are less than N in the second sequence.

17. The communications system according to claim 16, wherein sequence numbers of N polarized channels in the second sequence are arranged in ascending order of reliability of the N polarized channels, and wherein a minimum value of the sequence numbers of the polarized channels is 0.

18. The communications system according to claim 16, wherein each of sequence numbers of N polarized channels in the second sequence corresponds to a reliability ranking of the sequence number in the entire sequence, and wherein a minimum value of the sequence numbers of the polarized channels is 0.

19. The communications system according to claim 14, wherein the first sequence is all or a subset of a second sequence, wherein each of sequence numbers of N polarized channels in the second sequence corresponds to a reliability ranking of the sequence number in the entire sequence, and wherein a minimum value of the sequence numbers of the polarized channels is 0.

* * * * *